US011937497B2

(12) United States Patent
Ha et al.

(10) Patent No.: US 11,937,497 B2
(45) Date of Patent: Mar. 19, 2024

(54) ORGANIC LIGHT-EMITTING DEVICE

(71) Applicant: LG CHEM, LTD., Daejeon (KR)

(72) Inventors: Jae Seung Ha, Daejeon (KR); Minseung Chun, Daejeon (KR); Woochul Lee, Daejeon (KR); Sujeong Geum, Daejeon (KR); Hongsik Yoon, Daejeon (KR)

(73) Assignee: LG Chem, Ltd., Seoul (KR)

( * ) Notice: Subject to any disclaimer, the term of this patent is extended or adjusted under 35 U.S.C. 154(b) by 493 days.

(21) Appl. No.: 17/274,238

(22) PCT Filed: Nov. 6, 2019

(86) PCT No.: PCT/KR2019/015008
§ 371 (c)(1),
(2) Date: Mar. 8, 2021

(87) PCT Pub. No.: WO2020/096357
PCT Pub. Date: May 14, 2020

(65) Prior Publication Data

US 2022/0376178 A1 Nov. 24, 2022

(30) Foreign Application Priority Data

Nov. 6, 2018 (KR) ........................ 10-2018-0135200

(51) Int. Cl.
*H10K 85/60* (2023.01)
*H10K 85/30* (2023.01)
(Continued)

(52) U.S. Cl.
CPC ............. *H10K 85/60* (2023.02); *H10K 85/30* (2023.02); *H10K 85/615* (2023.02);
(Continued)

(58) Field of Classification Search
CPC ...... H10K 85/60; H10K 85/30; H10K 85/615; H10K 85/622; H10K 85/624;
(Continued)

(56) References Cited

U.S. PATENT DOCUMENTS 6,821,643 B1 11/2004 Hu et al.
7,824,779 B2 11/2010 Cho et al.
(Continued)

FOREIGN PATENT DOCUMENTS

CN 106588674 4/2017
JP 4338367 10/2009
(Continued)

OTHER PUBLICATIONS

Becke, A. D., "Density-functional exchange-energy approximation with correct asymptotic behavior," Physical Review A (1988) 38(6):3098-3100.
(Continued)

*Primary Examiner* — Karen Kusumakar
(74) *Attorney, Agent, or Firm* — Bryan Cave Leighton Paisner LLP

(57) ABSTRACT

Provided is an organic light-emitting device including: an anode; a cathode provided to face the anode; and organic material layers including a light emitting layer disposed between the anode and the cathode, wherein the light emitting layer, one or more layers of the organic material layers disposed between the anode and the light emitting layer, and one or more layers from among the organic material layers disposed between the cathode and the light emitting layer, each include one or more compounds each composed of sp3 carbon as a center, the light emitting layer includes a host including one or more anthracene-based compounds, and among organic materials included in the organic material layers, the bandgap energy ($E_{bg}$) of each of
(Continued)

the organic materials except for a dopant compound is 3 eV or more.

13 Claims, 1 Drawing Sheet

(51) Int. Cl.

| | |
|---|---|
| *H10K 50/11* | (2023.01) |
| *H10K 101/10* | (2023.01) |
| *H10K 101/00* | (2023.01) |

(52) U.S. Cl.

CPC ......... *H10K 85/622* (2023.02); *H10K 85/624* (2023.02); *H10K 85/626* (2023.02); *H10K 85/633* (2023.02); *H10K 85/636* (2023.02); *H10K 85/654* (2023.02); *H10K 85/6572* (2023.02); *H10K 85/6574* (2023.02); *H10K 50/11* (2023.02); *H10K 2101/10* (2023.02); *H10K 2101/90* (2023.02)

(58) Field of Classification Search

CPC .. H10K 85/626; H10K 85/633; H10K 85/636; H10K 85/654; H10K 85/6572; H10K 85/6574; H10K 50/11; H10K 2101/10; H10K 2101/90; H10K 2101/30; H10K 50/12; H10K 85/649; H10K 85/6576

See application file for complete search history.

(56) References Cited

U.S. PATENT DOCUMENTS

| | | | |
|---|---|---|---|
| 8,394,510 | B2 | 3/2013 | Mizuki et al. |
| 8,895,159 | B2 | 11/2014 | Mizuki et al. |
| 9,917,258 | B2 | 3/2018 | Hwang et al. |
| 2007/0069202 | A1 | 3/2007 | Choi et al. |
| 2007/0247059 | A1 | 10/2007 | Cho et al. |
| 2008/0303414 | A1 | 12/2008 | Cho et al. |
| 2009/0021159 | A1 | 1/2009 | Lee |
| 2009/0066227 | A1 | 3/2009 | Okinaka et al. |
| 2011/0278551 | A1 | 11/2011 | Yabunouchi et al. |
| 2012/0112169 | A1 | 5/2012 | Mizuki et al. |
| 2015/0179940 | A1 | 6/2015 | Mujica-Fernaud et al. |
| 2016/0351817 | A1 | 12/2016 | Kim et al. |
| 2017/0005273 | A1* | 1/2017 | Hwang ................ H10K 85/636 |
| 2017/0033294 | A1 | 2/2017 | Jang et al. |
| 2017/0040541 | A1 | 2/2017 | Kugler |
| 2017/0062729 | A1 | 3/2017 | Cha et al. |
| 2017/0098777 | A1 | 4/2017 | Huh et al. |
| 2017/0301879 | A1 | 10/2017 | King et al. |
| 2018/0009776 | A1 | 1/2018 | Cha et al. |
| 2018/0145260 | A1 | 5/2018 | Joosten et al. |
| 2018/0175305 | A1 | 6/2018 | Jang et al. |
| 2018/0337341 | A1 | 11/2018 | Heo et al. |
| 2019/0198769 | A1 | 6/2019 | Koo et al. |
| 2020/0136053 | A1 | 4/2020 | Heo et al. |

FOREIGN PATENT DOCUMENTS

| | | |
|---|---|---|
| JP | 5133259 | 1/2013 |
| JP | 5194596 | 5/2013 |
| JP | 5202730 | 6/2013 |
| JP | 5608095 | 10/2014 |
| JP | 5617398 | 11/2014 |
| KR | 10-0645028 | 11/2006 |
| KR | 10-0645052 | 11/2006 |
| KR | 10-0671862 | 1/2007 |
| KR | 10-2007-0035341 | 3/2007 |
| KR | 10-2007-0080221 | 8/2007 |
| KR | 10-2007-0083268 | 8/2007 |
| KR | 10-2010-0082026 | 7/2010 |
| KR | 10-1188391 | 10/2012 |
| KR | 10-2013-0134983 | 12/2013 |
| KR | 10-2015-0036654 | 4/2015 |
| KR | 10-1542714 | 8/2015 |
| KR | 10-2015-0130206 | 11/2015 |
| KR | 10-1605987 | 3/2016 |
| KR | 10-2016-0079514 | 7/2016 |
| KR | 10-2016-0089693 | 7/2016 |
| KR | 10-2016-0141361 | 12/2016 |
| KR | 10-1737199 | 5/2017 |
| KR | 10-1755986 | 7/2017 |
| KR | 10-2017-0113808 | 10/2017 |
| KR | 10-2017-0123062 | 11/2017 |
| KR | 10-2018-0004032 | 1/2018 |
| KR | 10-2018-0009342 | 1/2018 |
| KR | 10-1832084 | 2/2018 |
| KR | 10-2018-0027230 | 3/2018 |
| KR | 10-2018-0082124 | 7/2018 |
| KR | 10-2018-0098121 | 9/2018 |
| KR | 10-2018-0098122 | 9/2018 |
| WO | 2013-120577 | 8/2013 |

OTHER PUBLICATIONS

Perdew, J. P. and Wang, Y., "Accurate and simple analytic representation of the electron-gas correlation energy," Physical Review B (1992) 45(23):13244-13249.

Delley, B., "An all-electron numerical method for solving the local density functional for polyatomic molecules," J. Chem. Phys. (1990) 92(1):508-517.

* cited by examiner

[Figure 1]
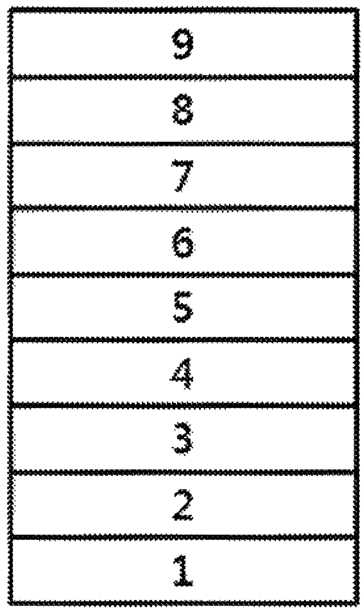
[Figure 2]
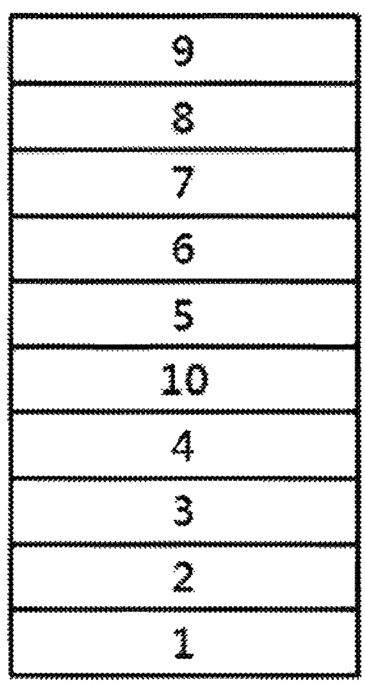

ORGANIC LIGHT-EMITTING DEVICE

CROSS-REFERENCE TO RELATED APPLICATION(S)

This application is a National Stage Application of International Application No. PCT/KR2019/015008 filed on Nov. 6, 2019, which claims priority to and the benefit of Korean Patent Application No. 10-2018-0135200 filed in the Korean Intellectual Property Office on Nov. 6, 2018, the entire contents of which are incorporated herein by reference.

TECHNICAL FIELD

The present specification relates to an organic light emitting device.

BACKGROUND

An organic light emitting device has a structure in which an organic thin film is disposed between two electrodes. When a voltage is applied to an organic light emitting device having such a structure, electrons and holes injected from the two electrodes are combined with each other in the organic thin film to make a pair, and then, the paired electrons and holes emit light while being annihilated. The organic thin film can be composed of a single layer or multi layers, if necessary.

Efforts to enhance the external quantum efficiency (EQE) of each of red, green, and blue light emitting layers of the organic light emitting device have been continuously made. As an example of such efforts, a red light emitting layer and a green light emitting layer each include a phosphorescent material, and particularly, a phosphorescent material using an Ir complex has been actively studied, and efforts for introducing a phosphorescent material into a blue light emitting layer have also been continued, but the development of a blue host requiring high singlet and triplet energy is currently at a low level.

Further, since the blue light emitting layer emits higher energy than those of the red light emitting layer and the green light emitting layer which show a tendency to be greatly affected by the durability of organic materials and damage to other organic materials according to the light emitting region in the light emitting layer, there is a need for developing an organic light emitting device which is stable and excellent in efficiency, performance, and service life.

BRIEF DESCRIPTION

Technical Problem

The present specification provides an organic light emitting device having low driving voltage, high efficiency, and long service life characteristics.

Technical Solution

An exemplary embodiment of the present specification has been made in an effort to provide an organic light emitting device including: an anode; a cathode provided to face the anode; an organic material layer including a light emitting layer provided between the anode and the cathode, in which the light emitting layer; one or more layers of the organic material layer provided between the anode and the light emitting layer; and one or more layers of the organic material layer provided between the cathode and the light emitting layer each include one or more compounds each composed of sp3 carbon as a center, the light emitting layer includes a host including one or more anthracene-based compounds, and among organic materials included in the organic material layer, the band gap energy ($E_{bg}$) of each of the organic materials except for a dopant compound is 3 eV or more.

Advantageous Effects

Since the organic light emitting device of the present invention smoothly injects and transports carriers among the respective layers by including one or more compounds each composed of sp3 carbon as a center in each of a light emitting layer; one or more layers of an organic material layer provided between an anode and the light emitting layer; and one or more layers of an organic material layer provided between a cathode and the light emitting layer, it is possible to achieve the balance of carriers of the device, and to improve the service life of the device by improving the electrochemical durability of the compound composed of sp3 carbon as a center.

Further, as the band gap energy ($E_{bg}$) of each of the organic materials, except for the dopant compound, in the organic material layer of the organic light emitting device is 3 eV or more, the organic light emitting device has effects of increasing the service life by improving the durability of the organic light emitting device and improving the overall efficiency of the device by avoiding the expansion of excitons and the energy transfer.

As the conformity of the organic light emitting device has been developed, it could be observed that the combination of the respective compounds applied to the respective organic material layers could make a big difference in overall performance of the device. The present invention smoothly injects and transports carriers injected from each electrode and achieves a balance in a light emitting layer by dividing the device into three regions and including a compound composed of sp3 carbon as a center in each of the regions of 1) a light emitting layer, 2) an organic material layer provided between an anode and the light emitting layer, and 3) an organic material layer provided between a cathode and the light emitting layer, thereby maximizing the efficiency of the device. Further, the service life of the device can be improved by improving the electrochemical durability of the compound composed of sp3 carbon as a center.

BRIEF DESCRIPTION OF THE DRAWINGS

FIG. 1 illustrates an example of an organic light emitting device composed of a substrate 1, an anode 2, a hole injection layer 3, a hole transport layer 4, a light emitting layer 5, a hole blocking layer 6, an electron transport layer 7, an electron injection layer 8, and a cathode 9.

FIG. 2 illustrates an example of an organic light emitting device composed of a substrate 1, an anode 2, a hole injection layer 3, a hole transport layer 4, an electron blocking layer 10, a light emitting layer 5, a hole blocking layer 6, an electron transport layer 7, an electron injection layer 8, and a cathode 9.

EXPLANATION OF REFERENCE NUMERALS AND SYMBOLS

1: Substrate
2: Anode

3: Hole injection layer
4: Hole transport layer
5: Light emitting layer
6: Hole blocking layer
7: Electron transport layer
8: Electron injection layer
9: Cathode
10: Electron blocking layer

DETAILED DESCRIPTION

Hereinafter, the present specification will be described in more detail.

An organic light emitting device according to an exemplary embodiment of the present invention includes: an anode; a cathode provided to face the anode; an organic material layer including a light emitting layer provided between the anode and the cathode, in which the light emitting layer; one or more layers of the organic material layer provided between the anode and the light emitting layer; and one or more layers of the organic material layer provided between the cathode and the light emitting layer each include one or more compounds each composed of sp3 carbon as a center, the light emitting layer includes a host including one or more anthracene-based compounds, and among organic materials included in the organic material layer, the band gap energy ($E_{bg}$) of each of the organic materials except for a dopant compound is 3 eV or more.

In an exemplary embodiment of the present specification, among the organic materials included in the organic material layer of the organic light emitting device, the band gap energy ($E_{bg}$) of each of the organic materials except for the dopant can be each 3 eV or more, and preferably each 3 eV or more and 4 eV or less.

In an exemplary embodiment of the present specification, the dopant compound means a compound added in a small amount in each organic material layer, and specific examples thereof include a light emitting dopant of a light emitting layer and a p-dopant of a hole injection layer, but are not limited thereto. The dopant compound can be included in an amount of 0.1 wt % to 20 wt %, preferably 0.1 wt % to 10 wt % in each organic material layer.

The band gap energy ($E_{bg}$) can be obtained by measuring the LUMO energy and HOMO energy of a molecule.

In order to understand the distribution of electrons in the molecule and optical properties, a determined structure is required. Further, an electronic structure has different structures in neutral, anionic, and cationic states depending on the charge state of the molecule. In order to drive a device, all the energy levels in the neutral state, the cationic state, and the anionic state are important, and a highest occupied molecular orbital (HOMO) and a lowest unoccupied molecular orbital (LUMO) in the neutral state are representatively recognized as important properties.

In order to determine the molecular structure of a chemical material, a structure inputted using a density functional theory is optimized. In order to calculate a DFT, a BPW91 calculation method (Becke exchange and Perdew correlation-correlation functional) and a double numerical basis set including polarization functional (DNP) basis set are used. The BPW91 calculation method is published in the paper 'A. D. Becke, Phys. Rev. A, 38, 3098 (1988)' and 'J. P. Perdew and Y. Wang, Phys. Rev. B, 45, 13244 (1992)', and the DNP basis set is disclosed in the paper 'B. Delley, J. Chem. Phys., 92, 508 (1990)'.

In order to perform the calculation by the density functional theory, the 'DMo13' package manufactured by BIOVIA Dassault Systèmes can be used. When an optimal molecular structure is determined using the given method, it is possible to obtain, as a result, an energy level which can be occupied by electrons. The HOMO energy refers to the orbital energy at the highest energy level among the molecular orbitals which are filled with electrons when energy in a neutral state is obtained, and the LUMO energy refers to the orbital energy at the lowest energy level among the molecular orbitals which are not filled with electrons.

In the present invention, 'compound composed of sp3 carbon as a center' means a compound whose core structure is composed of sp3 carbon as a center.

Specifically, the compound composed of sp3 carbon as a center means a compound whose core structure is formed of sp3 carbon as a center as in a compound of the following Formula 1, and a compound in which a substituent including sp3 carbon is bonded to a core structure which does not include sp3 carbon does not mean a compound composed of sp3 carbon as a center.

Formula 1

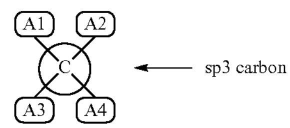

In an exemplary embodiment of the present invention, the light emitting layer; one or more layers of the organic material layer provided between the anode and the light emitting layer; and one or more layers of the organic material layer provided between the cathode and the light emitting layer each include one to three compounds each composed of sp3 carbon as a center. In this case, by making the balance of carriers injected from both the electrodes and introducing the compound composed of sp3 carbon as a center, even into the light emitting layer, the connection of conjugation and delocalized electrons can be hindered to elicit high color purity and efficiency.

The organic material layer provided between the anode and the light emitting layer can be one or more selected from the group consisting of a hole transport layer, a hole injection layer, a layer which simultaneously injects and transports holes, and an electron blocking layer, and one or more layers of the organic material layer can each include a compound composed of sp3 carbon as a center.

According to an exemplary embodiment of the present invention, the organic material layer including the compound composed of sp3 carbon as a center and provided between the anode and the light emitting layer can be a hole transport layer, but is not limited thereto.

According to an exemplary embodiment of the present invention, the organic material layer including the compound composed of sp3 carbon as a center and provided between the cathode and the light emitting layer can be an electron transport layer, but is not limited thereto.

The organic material layer provided between the cathode and the light emitting layer can be one or more selected from the group consisting of an electron transport layer, an electron injection layer, a layer which simultaneously injects and transports electrons, and a hole blocking layer, and one or more layers of the organic material layer can each include a compound composed of sp3 carbon as a center.

According to an exemplary embodiment of the present invention, in the organic light emitting device, one or more layers of the organic material layer provided between the anode and the light emitting layer each include one or more compounds each composed of sp3 carbon as a center including a substituted or unsubstituted amine group, and one or more layers of the organic material layer provided between the cathode and the light emitting layer each include one or more compounds each composed of sp3 carbon as a center including a substituted or unsubstituted nitrogen-containing aromatic 5-membered ring, a substituted or unsubstituted nitrogen-containing aromatic 6-membered ring, or a substituted or unsubstituted nitrogen-containing aromatic polycyclic ring.

One or more layers of the organic material layer provided between the cathode and the light emitting layer each include one or more compounds in which a substituted or unsubstituted nitrogen-containing aromatic 5-membered ring, a substituted or unsubstituted nitrogen-containing aromatic 6-membered ring, or a substituted or unsubstituted nitrogen-containing aromatic polycyclic ring is substituted with a core structure composed of sp3 carbon as a center.

According to an exemplary embodiment of the present invention, 'the substituted or unsubstituted nitrogen-containing aromatic 5-membered ring, the substituted or unsubstituted nitrogen-containing aromatic 6-membered ring, or the substituted or unsubstituted nitrogen-containing aromatic polycyclic ring' can be of the following Formula B. Specifically, the following Formula B can be substituted with the core structure of Formula 1:

*-(L11)n-Ar11 Formula B wherein in Formula B:

* means a position to be bonded;

L11 is a direct bond or a substituted or unsubstituted arylene group having 6 to 60 carbon atoms;

Ar11 is any one of the following Formulae B-1 to B-10;

n is an integer from 0 to 4, and when n is 2 or higher, a plurality of L11s are the same as or different from each other;

Formula B-1

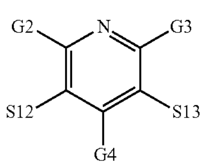

wherein in Formula B-1:

any one of G2 to G4, S12, and S13 is a moiety bonded to L11 of Formula B, and the others are the same as or different from each other, and are each independently hydrogen, deuterium, a cyano group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group;

Formula B-2

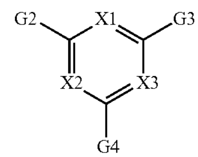

wherein in Formula B-2:

X1 is N or CRa, X2 is N or CRb, and X3 is N or CRc;

at least two of X1 to X3 are N;

any one of G2 to G4 and Ra to Rc is a moiety bonded to L11 of Formula B, and the others are the same as or different from each other, and are each independently hydrogen, deuterium, a cyano group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group;

Formula B-3

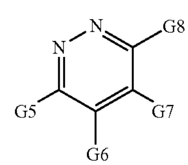

wherein in Formula B-3:

any one of G5 to G8 is a moiety bonded to L11 of Formula B, and the others are the same as or different from each other, and are each independently hydrogen, deuterium, a cyano group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group;

Formula B-4

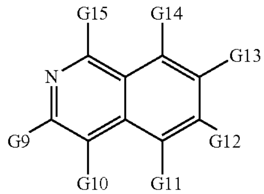

wherein in Formula B-4:

any one of G9 to G15 is a moiety bonded to L11 of Formula B, and the others are the same as or different from each other, and are each independently hydrogen, deuterium, a cyano group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group;

Formula B-5

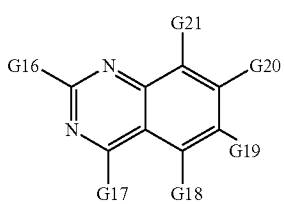

wherein in Formula B-5:

any one of G16 to G21 is a moiety bonded to L11 of Formula B, and the others are the same as or different from each other, and are each independently hydrogen, deuterium, a cyano group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group;

Formula B-6

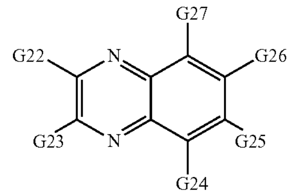

wherein in Formula B-6:

any one of G22 to G27 is a moiety bonded to L11 of Formula B, and the others are the same as or different from each other, and are each independently hydrogen, deuterium, a cyano group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group;

Formula B-7

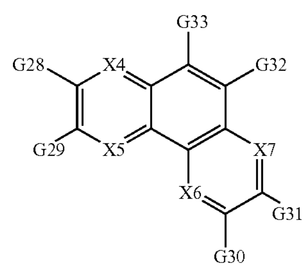

wherein in Formula B-7:

X4 is N or CRd, X5 is N or CRe, X6 is N or CRf, and X7 is N or CRg;

at least one of X4 to X7 is N;

any one of G28 to G33 and Rd to Rg is a moiety bonded to L11 of Formula B, and the others are the same as or different from each other, and are each independently hydrogen, deuterium, a cyano group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group;

Formula B-8

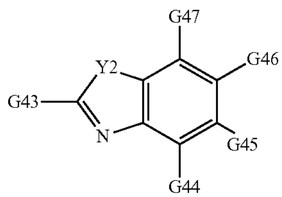

wherein in Formula B-8:

Y2 is O, S, NQ4, or CQ5Q6;

any one of G43 to G47 is a moiety bonded to L11 of Formula B, and the others and Q4 to Q6 are the same as or different from each other, and are each independently hydrogen, deuterium, a cyano group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group, or adjacent groups are bonded to each other to form a substituted or unsubstituted ring;

Formula B-9

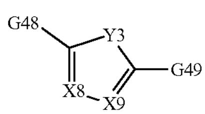

wherein in Formula B-9:

Y3 is O, S, or NQ7;

X8 is N or CRh, and X9 is N or CRi;

any one of G48, G49, Rh, and Ri is a moiety bonded to L11 of Formula B, and the others and Q7 are the same as or different from each other, and are each independently hydrogen, deuterium, a cyano group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group;

Formula B-10

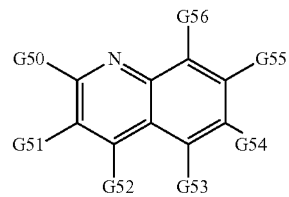

wherein in Formula B-10:

any one of G50 to G56 is a moiety bonded to L11 of Formula B, and the others are the same as or different from each other, and are each independently hydrogen, deuterium, a cyano group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group.

In an exemplary embodiment of the present specification, in Formula B, L11 is a direct bond or an arylene group having 6 to 60 carbon atoms, which is unsubstituted or substituted with an alkyl group having 1 to 20 carbon atoms.

According to another exemplary embodiment, in Formula B, L11 is a direct bond, a substituted or unsubstituted phenylene group, a substituted or unsubstituted biphenylene group, a substituted or unsubstituted dimethylfluorenylene group, or a substituted or unsubstituted naphthylene group.

According to still another exemplary embodiment, in Formula B, L11 is a direct bond, a phenylene group, a biphenylene group, a dimethylfluorenylene group, or a naphthylene group.

According to an exemplary embodiment of the present specification, in Formula B-1, any one of G2 to G4, S12, and S13 is a moiety bonded to L11 of Formula B, and the others are the same as or different from each other, and are each independently hydrogen, a substituted or unsubstituted aryl group having 6 to 30 carbon atoms, or a substituted or unsubstituted heteroaryl group having 2 to 30 carbon atoms.

According to another exemplary embodiment of the present specification, in Formula B-1, any one of G2 to G4, S12, and S13 is a moiety bonded to L11 of Formula B, and the others are the same as or different from each other, and are each independently hydrogen, a phenyl group, or a pyridine group.

According to an exemplary embodiment of the present specification, in Formula B-2, any one of G2 to G4 and Ra to Rc is a moiety bonded to L11 of Formula B, and the others are the same as or different from each other, and are each independently hydrogen, a substituted or unsubstituted aryl group, or a substituted or unsubstituted heteroaryl group.

According to another exemplary embodiment of the present specification, in Formula B-2, any one of G2 to G4 and Ra to Rc is a moiety bonded to L11 of Formula B, and the others are the same as or different from each other, and are each independently hydrogen; an aryl group which is unsubstituted or substituted with a cyano group, an aryl group, a heterocyclic group substituted with an alkyl group, or a heterocyclic group which is unsubstituted or substituted with an aryl group; or a heteroaryl group.

According to still another exemplary embodiment of the present specification, in Formula B-2, any one of G2 to G4 and Ra to Rc is a moiety bonded to L11 of Formula B, and the others are the same as or different from each other, and are each independently hydrogen; a phenyl group which is unsubstituted or substituted with an aryl group, a heterocyclic group substituted with an alkyl group, or a heterocyclic group which is unsubstituted or substituted with an aryl group; a biphenyl group which is unsubstituted or substituted with a cyano group or a heterocyclic group; a terphenyl group; a naphthyl group which is unsubstituted or substituted with an aryl group or a heteroaryl group; a fluorenyl group which is unsubstituted or substituted with an alkyl group; a triphenylenyl group; a phenanthrenyl group; a phenalenyl group; a pyridyl group; a dibenzofuranyl group; or a dibenzothiophene group.

According to yet another exemplary embodiment of the present specification, in Formula B-2, any one of G2 to G4 and Ra to Rc is a moiety bonded to L11 of Formula B, and the others are the same as or different from each other, and are each independently hydrogen; a phenyl group which is unsubstituted or substituted with a phenyl group, a terphenyl group, a carbazolyl group, a quinolyl group, a phenoxazinyl group, a phenothiazinyl group, a triphenylenyl group, a fluoranthenyl group, a pyridyl group, a dibenzothiophene group, a dibenzofuranyl group, a benzocarbazolyl group, a dihydrophenazinyl group substituted with a phenyl group, or a dihydroacridine group substituted with a methyl group; a biphenyl group which is unsubstituted or substituted with a cyano group or a carbazolyl group; a terphenyl group; a naphthyl group which is unsubstituted or substituted with a phenyl group, a pyridyl group, or a dibenzofuranyl group; a fluorenyl group which is unsubstituted or substituted with a methyl group; a triphenylenyl group; a phenanthrenyl group; a phenalenyl group; a pyridyl group; a dibenzofuranyl group; or a dibenzothiophene group.

According to an exemplary embodiment of the present specification, in Formula B-3, any one of G5 to G8 is a moiety bonded to L11 of Formula B, and the others are the same as or different from each other, and are each independently hydrogen or a substituted or unsubstituted aryl group.

According to another exemplary embodiment of the present specification, in Formula B-3, any one of G5 to G8 is a moiety bonded to L11 of Formula B, and the others are the same as or different from each other, and are each independently hydrogen or an aryl group.

According to still another exemplary embodiment of the present specification, in Formula B-3, any one of G5 to G8 is a moiety bonded to L11 of Formula B, and the others are the same as or different from each other, and are each independently hydrogen, a phenyl group, or a naphthyl group.

According to an exemplary embodiment of the present specification, in Formula B-4, any one of G9 to G15 is a moiety bonded to L11 of Formula B, and the others are the same as or different from each other, and are each independently hydrogen or a substituted or unsubstituted aryl group.

According to another exemplary embodiment of the present specification, in Formula B-4, any one of G9 to G15 is a moiety bonded to L11 of Formula B, and the others are the same as or different from each other, and are each independently hydrogen or an aryl group.

According to still another exemplary embodiment of the present specification, in Formula B-4, any one of G9 to G15 is a moiety bonded to L11 of Formula B, and the others are the same as or different from each other, and are each independently hydrogen or a phenyl group.

According to an exemplary embodiment of the present specification, in Formula B-5, any one of G16 to G21 is a moiety bonded to L11 of Formula B, and the others are the same as or different from each other, and are each independently hydrogen or a substituted or unsubstituted aryl group.

According to another exemplary embodiment of the present specification, in Formula B-5, any one of G16 to G21 is a moiety bonded to L11 of Formula B, and the others are the same as or different from each other, and are each independently hydrogen or an aryl group.

According to still another exemplary embodiment of the present specification, in Formula B-5, any one of G16 to G21 is a moiety bonded to L11 of Formula B, and the other are the same as or different from each other, and are each independently hydrogen, a phenyl group, a biphenyl group, or a naphthyl group.

According to an exemplary embodiment of the present specification, in Formula B-6, any one of G22 to G27 is a moiety bonded to L11 of Formula B, and the others are the same as or different from each other, and are each independently hydrogen or an aryl group.

According to another exemplary embodiment of the present specification, in Formula B-6, any one of G22 to G27 is a moiety bonded to L11 of Formula B, and the others are the same as or different from each other, and are each independently hydrogen or a phenyl group.

According to an exemplary embodiment of the present specification, in Formula B-7, any one of G28 to G33 and Rd to Rg is a moiety bonded to L11 of Formula B, and the others are the same as or different from each other, and are each independently hydrogen.

According to another exemplary embodiment of the present specification, Formula B-7 is any one of the following structures:

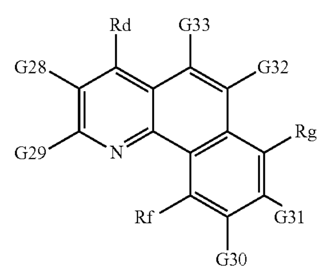

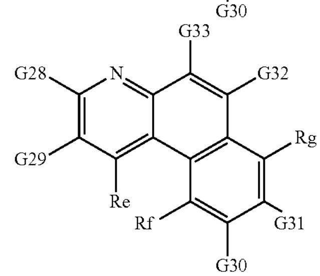

-continued

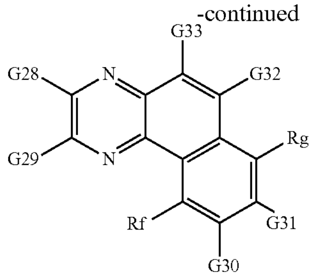

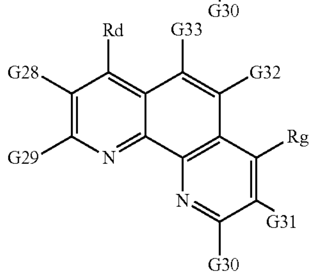

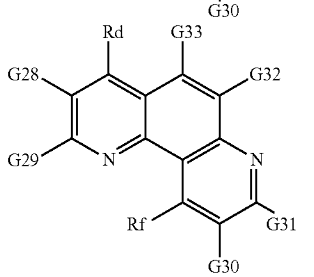

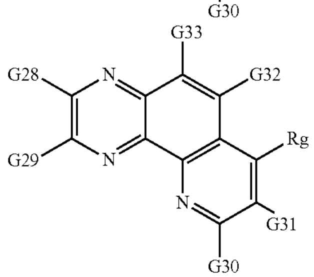

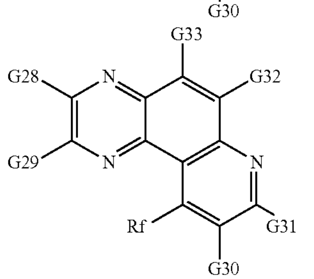

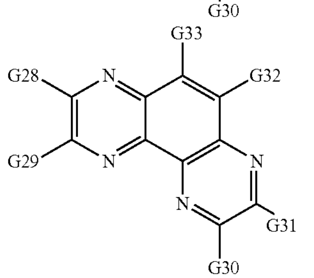

In the structures, definitions of G28 to G33 and Rd to Rg are the same as those in Formula B-7.

According to an exemplary embodiment of the present specification, in Formula B-8, any one of G43 to G47 is a moiety bonded to L11 of Formula B, and the others and Q4 to Q6 are the same as or different from each other, and are each independently hydrogen, a substituted or unsubstituted alkyl group, or a substituted or unsubstituted aryl group.

According to another exemplary embodiment of the present specification, in Formula B-8, any one of G43 to G47 is a moiety bonded to L11 of Formula B, and the others and Q4 to Q6 are the same as or different from each other, and are each independently hydrogen, an alkyl group, or an aryl group.

According to still another exemplary embodiment of the present specification, in Formula B-8, any one of G43 to G47 is a moiety bonded to L11 of Formula B, and the others and Q4 to Q6 are the same as or different from each other, and are each independently hydrogen, a methyl group, or a phenyl group.

According to yet another exemplary embodiment of the present specification, in Formula B-8, when Y2 is NQ4, G43 and Q4 are bonded to each other to form a substituted or unsubstituted ring.

According to still yet another exemplary embodiment of the present specification, in Formula B-8, when Y2 is NQ4, G43 and Q4 are bonded to each other to form a substituted or unsubstituted hetero ring.

According to a further another exemplary embodiment of the present specification, in Formula B-8, when Y2 is NQ4, G43 and Q4 are bonded to each other to form a benzoisoquinol ring.

According to another further exemplary embodiment of the present specification, Formula B-8 is any one of the following structures.

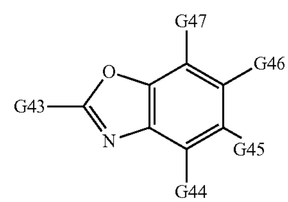

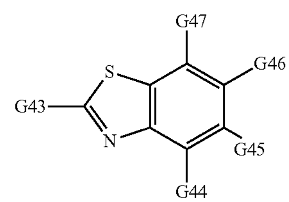

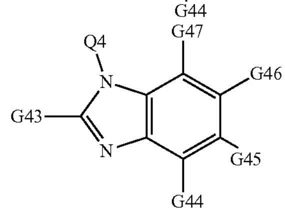

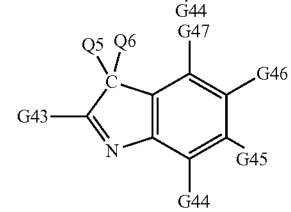

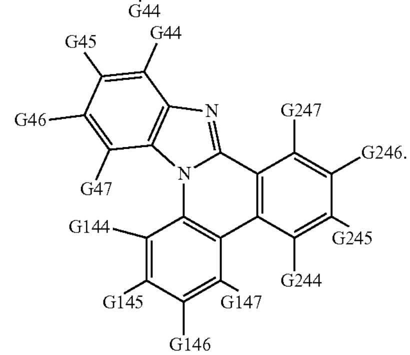

In the structures, any one of G43 to G47, G144 to G147, and G244 to G247 is a moiety bonded to L11 of Formula B, and the others and Q4 to Q6 are the same as or different from each other, and are each independently hydrogen, deuterium, a nitrile group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group, or adjacent groups are bonded to each other to form a substituted or unsubstituted ring.

According to an exemplary embodiment of the present specification, in Formula B-9, any one of G48, G49, Rh, and Ri is a moiety bonded to L11 of Formula B, and the others and Q7 are the same as or different from each other, and are each independently hydrogen or a substituted or unsubstituted aryl group.

According to another exemplary embodiment of the present specification, in Formula B-9, any one of G48, G49, Rh, and Ri is a moiety bonded to L11 of Formula B, and the others and Q7 are the same as or different from each other, and are each independently hydrogen or an aryl group which is unsubstituted or substituted with a cyano group.

According to still another exemplary embodiment of the present specification, in Formula B-9, any one of G48, G49, Rh, and Ri is a moiety bonded to L11 of Formula B, and the others and Q7 are the same as or different from each other, and are each independently hydrogen or a phenyl group which is unsubstituted or substituted with a cyano group.

According to yet another exemplary embodiment of the present specification, Formula B-9 is any one of the following structures:

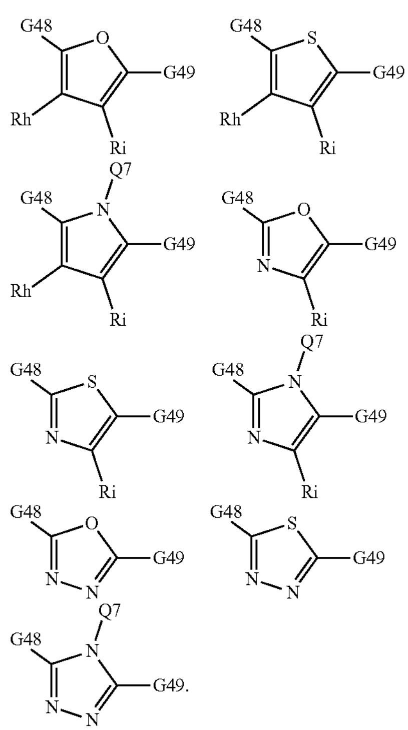

In the structures, definitions of G48, G49, Rh, Ri, and Q7 are the same as those in Formula B-9.

According to still yet another exemplary embodiment of the present specification, Formula B-9 is any one of the following structures:

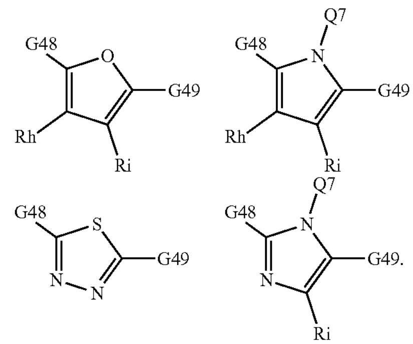

In the structures, definitions of G48, G49, Rh, Ri, and Q7 are the same as those in Formula B-9.

According to an exemplary embodiment of the present specification, in Formula B-10, any one of G50 to G56 is a moiety bonded to L11 of Formula B, and the others are the same as or different from each other, and are each independently hydrogen or an aryl group.

According to another exemplary embodiment of the present specification, in Formula B-10, any one of G50 to G56 is a moiety bonded to L11 of Formula B, and the others are the same as or different from each other, and are each independently hydrogen or a phenyl group.

In the substituted or unsubstituted amine group, the amine group can be an arylamine group, a heteroarylamine group, or an arylheteroarylamine group, and the compound composed of sp3 carbon as a center, which includes a substituted or unsubstituted amine group included between the anode and the light emitting layer has a characteristic that the injection and transport of holes in carriers are excellent because the aryl and/or heteroaryl bonded to the amine group make(s) the p-type propensity strong by having the electron donor propensity in aromatics and heteroaromatics due to structural effects with the hyperconjugation of sp3 carbon atoms to enrich the distribution of electrons in the compound.

According to an exemplary embodiment of the present invention, the 'substituted or unsubstituted amine group' is the following Formula A:

Formula A

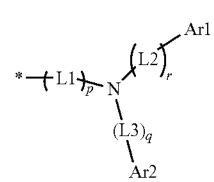

wherein in Formula A:

L1 to L3 are the same as or different from each other, and are each independently a direct bond, a substituted or unsubstituted arylene group having 6 to 60 carbon atoms, or a substituted or unsubstituted heteroarylene group having 2 to 60 carbon atoms;

Ar1 and Ar2 are the same as or different from each other, and are each independently hydrogen, a substituted or unsubstituted alkyl group having 1 to 20 carbon atoms, a substituted or unsubstituted silyl group, a substituted or unsubstituted aryl group having 6 to 60 carbon atoms, or a substituted or unsubstituted heteroaryl group having 2 to 60 carbon atoms, or are bonded to each other to form a substituted or unsubstituted hetero ring;

p, r, and q are each an integer from 0 to 4, and when p, r, and q are each 2 or higher, substituents in the parenthesis are the same as or different from each other; and

* means a position to be bonded.

In an exemplary embodiment of the present invention, L1 to L3 are the same as or different from each other, and are each independently a direct bond, a substituted or unsubstituted arylene group having 6 to 30 carbon atoms, or a substituted or unsubstituted divalent heteroaryl group having 2 to 30 carbon atoms.

According to an exemplary embodiment of the present invention, L1 to L3 are the same as or different from each other, and are each independently a direct bond, a substituted or unsubstituted phenylene group, a substituted or unsubstituted biphenylene group, a substituted or unsubstituted naphthylene group, a substituted or unsubstituted terphenylene group, a substituted or unsubstituted dibenzofuranylene group, a substituted or unsubstituted dibenzothiophenylene group, a substituted or unsubstituted carbazolylene group, or a substituted or unsubstituted pyridylene group.

According to an exemplary embodiment of the present invention, L1 is a direct bond or an arylene group having 6 to 30 carbon atoms.

In an exemplary embodiment of the present invention, L1 is a direct bond or a phenylene group.

According to an exemplary embodiment of the present invention, L2 and L3 are the same as or different from each other, and are each independently a direct bond or an arylene group having 6 to 60 carbon atoms, which is unsubstituted or substituted with an alkyl group having 1 to 20 carbon atoms or an aryl group having 6 to 30 carbon atoms.

According to another exemplary embodiment, L2 and L3 are the same as or different from each other, and are each independently a direct bond, a phenylene group, a divalent 9,9-dimethylfluorene group, a divalent 9,9-diphenylfluorene group, a divalent spirofluorene group, a divalent phenanthrene group, or a divalent triphenylene group.

In an exemplary embodiment of the present invention, Ar1 and Ar2 are the same as or different from each other, and are each independently hydrogen, a substituted or unsubstituted alkyl group having 1 to 20 carbon atoms, a substituted or unsubstituted triarylsilyl group having 18 to 60 carbon atoms, a substituted or unsubstituted aryl group having 6 to 60 carbon atoms, or a substituted or unsubstituted heteroaryl group having 2 to 60 carbon atoms, or are bonded to each other to form a substituted or unsubstituted hetero ring.

In an exemplary embodiment of the present invention, Ar1 and Ar2 are the same as or different from each other, and are each independently hydrogen; an alkyl group having 1 to 20 carbon atoms, which is unsubstituted or substituted with an alkyl group having 1 to 20 carbon atoms or an aryl group having 6 to 30 carbon atoms; a substituted or unsubstituted triarylsilyl group having 18 to 30 carbon atoms; an aryl group having 6 to 60 carbon atoms, which is unsubstituted or substituted with an alkyl group having 1 to 20 carbon atoms, a trimethylsilyl group, or an aryl group having 6 to 30 carbon atoms; or a heteroaryl group having 2 to 60 carbon atoms, which is unsubstituted or substituted with an alkyl group having 1 to 20 carbon atoms or an aryl group having 6 to 30 carbon atoms, or are bonded to each other to form a substituted or unsubstituted hetero ring having 2 to 30 carbon atoms.

According to another exemplary embodiment, Ar1 and Ar2 are the same as or different from each other, and are each independently hydrogen; a triphenylmethyl group; a phenyl group which is unsubstituted or substituted with a methyl group, a propyl group, a butyl group, or a trimethylsilyl group; a biphenyl group; a terphenyl group; a quaterphenyl group; a 9,9-dimethylfluorene group; a 9,9-diphenylfluorene group; a methylphenylfluorene group; a spirofluorene group; a naphthyl group; a dibenzofuran group; a naphthobenzofuran group; a dibenzothiophene group; an N-phenylcarbazole group; a carbazole group; a triphenylsilyl group; a phenanthrene group; a triphenylene group; or phenylspiroacridinefluorene

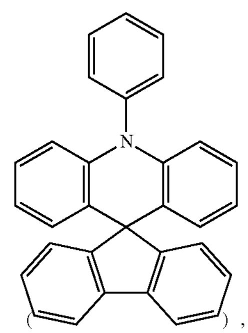 [SMILES: c1ccc(N2c3ccccc3C3(c4ccccc4-c4ccccc43)c3ccccc32)cc1]

or are bonded to each other to form a carbazole group; phenoxazine

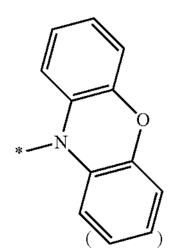

dimethylacridine

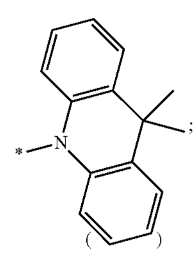 [SMILES: *N1c2ccccc2C(C)(C)c2ccccc21]

phenylphenazine

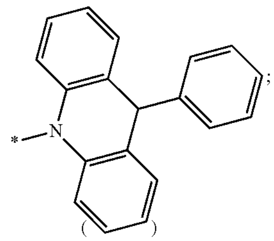 [SMILES: *N1c2ccccc2C(c2ccccc2)c2ccccc21]

or phenothiazine

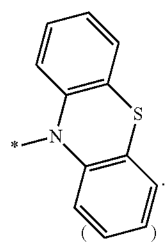 [SMILES: *N1c2ccccc2Sc2ccccc21]

According to an exemplary embodiment of the present invention, one or more layers of the organic material layer provided between the cathode and the light emitting layer each include one or more compounds each composed of sp3 carbon as a center, which each include a substituted or unsubstituted nitrogen-containing aromatic 5-membered ring, a substituted or unsubstituted nitrogen-containing aromatic 6-membered ring, or a substituted or unsubstituted nitrogen-containing aromatic polycyclic ring.

Further, the substituted or unsubstituted nitrogen-containing aromatic 5-membered ring, the substituted or unsubstituted nitrogen-containing aromatic 6-membered ring, and the substituted or unsubstituted nitrogen-containing aromatic polycyclic ring, which are included between the cathode and the light emitting layer, can improve the performance of the device because an amine compound composed of sp3 carbon as a center can be positioned between the anode and the light emitting layer to control the speed and injection of carriers such that the balance of carriers can be made to be suitable for an organic material exhibiting excellent hole characteristics, and has excellent durability for holes which can be applied into the light emitting layer due to the structural features.

In an exemplary embodiment of the present invention, the organic material layer including one or more compounds each composed of sp3 carbon as a center and provided between the anode and the light emitting layer and the organic material layer including one or more compounds each composed of sp3 carbon as a center and provided between the cathode and the light emitting layer are provided so as to be brought into contact with the light emitting layer. In this case, there is an advantage in that by improving carrier characteristics of an organic light emitting device, the performance of the device is improved and the service life thereof is increased.

According to an exemplary embodiment of the present invention, the compound composed of sp3 carbon as a center can be the following Formula 1, but is not limited thereto:

Formula 1

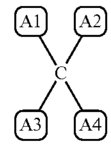

wherein in Formula 1:

C is sp3 carbon; and

A1 to A4 are the same as or different from each other, and are each independently a substituted or unsubstituted alkyl group, a substituted or unsubstituted cycloalkyl group, a substituted or unsubstituted aryl group, or a substituted or unsubstituted heterocyclic group, or adjacent groups are bonded to each other to form a substituted or unsubstituted ring.

Examples of the substituents in the present invention will be described below, but are not limited thereto.

The term "substituted" means that a hydrogen atom bonded to a carbon atom of a compound is changed into another substituent, and a position to be substituted is not limited as long as the position is a position at which the hydrogen atom is substituted, that is, a position at which the substituent can be substituted, and when two or more are substituted, the two or more substituents can be the same as or different from each other.

In the present invention, the term "substituted or unsubstituted" means being substituted with one or two or more substituents selected from the group consisting of hydrogen, deuterium, a halogen group, a cyano group, a nitro group, a hydroxyl group, a silyl group, a boron group, an alkyl group, an alkoxy group, an aryloxy group, an alkylthioxy group, an arylthioxy group, an alkylsulfoxy group, an arylsulfoxy group, an alkenyl group, an alkynyl group, a cycloalkyl group, an amine group, an aryl group, or a heterocyclic group, being substituted with a substituent to which two or more substituents among the exemplified substituents are linked, or having no substituent.

In the present invention, the hetero ring and the heteroaryl group include O, S, or N as a heteroatom.

According to an exemplary embodiment of the present invention, A1 to A4 are the same as or different from each other, and are each independently a substituted or unsubstituted alkyl group having 1 to 40 carbon atoms, a substituted or unsubstituted cycloalkyl group having 3 to 60 carbon atoms, a substituted or unsubstituted aryl group having 6 to 60 carbon atoms, or a substituted or unsubstituted heterocyclic group having 2 to 60 carbon atoms, or adjacent groups are bonded to each other to form a substituted or unsubstituted ring having 3 to 60 carbon atoms.

In an exemplary embodiment of the present invention, A1 to A4 are the same as or different from each other, and are each independently a substituted or unsubstituted alkyl group having 1 to 30 carbon atoms, a substituted or unsubstituted cycloalkyl group having 3 to 30 carbon atoms, a substituted or unsubstituted aryl group having 6 to 30 carbon atoms, or a substituted or unsubstituted heterocyclic group having 2 to 40 carbon atoms, or adjacent groups are bonded to each other to form a substituted or unsubstituted ring having 3 to 40 carbon atoms.

According to another exemplary embodiment, A1 to A4 are the same as or different from each other, and are each independently a substituted or unsubstituted methyl group, a substituted or unsubstituted ethyl group, a substituted or unsubstituted phenyl group, a substituted or unsubstituted biphenyl group, a substituted or unsubstituted naphthyl group, a substituted or unsubstituted phenanthrenyl group, a substituted or unsubstituted triphenylenyl group, a substituted or unsubstituted anthracenyl group, a substituted or unsubstituted chrysenyl group, a substituted or unsubstituted dibenzofuranyl group, a substituted or unsubstituted dibenzothiophenyl group, a substituted or unsubstituted carbazolyl group, a substituted or unsubstituted pyridyl group, a substituted or unsubstituted pyrimidyl group, a substituted or unsubstituted quinolinyl group, or a substituted or unsubstituted quinazolinyl group, or adjacent groups are bonded to each other to form a substituted or unsubstituted ring having 3 to 40 carbon atoms.

In an exemplary embodiment of the present invention, adjacent groups of A1 to A4 are bonded to each other to form a substituted or unsubstituted hydrocarbon ring having 3 to 40 carbon atoms, or a substituted or unsubstituted hetero ring having 3 to 40 carbon atoms, which includes O, S, or N as a heteroatom.

According to an exemplary embodiment of the present invention, Formula 1 is any one of the following Formulae 2 to 7:

Formula 2

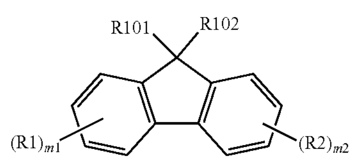

Formula 3

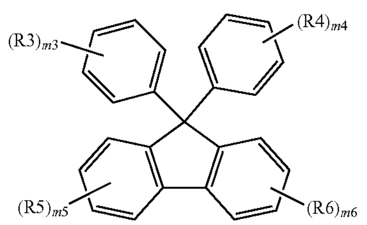

Formula 4

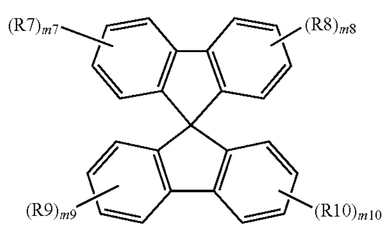

Formula 5

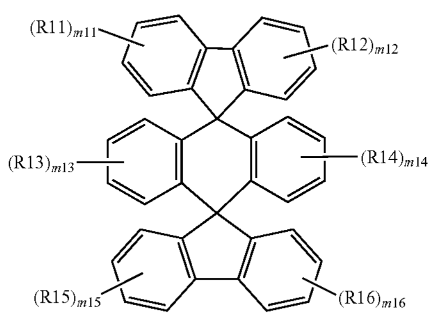

-continued

Formula 6

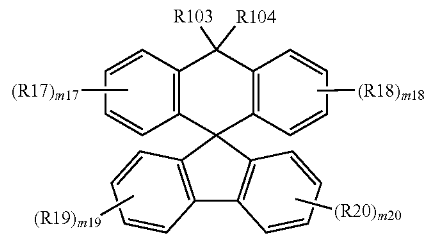

Formula 7

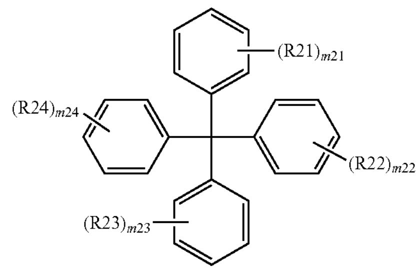

wherein in Formulae 2 to 7:

R101 to R104 are the same as or different from each other, and are each independently hydrogen, a substituted or unsubstituted alkyl group, or a substituted or unsubstituted aryl group, or are bonded to each other to form an aliphatic hydrocarbon ring;

R1 to R24 are the same as or different from each other, and are each independently hydrogen, deuterium, a halogen group, a cyano group, a nitro group, a hydroxyl group, a substituted or unsubstituted silyl group, a substituted or unsubstituted boron group, a substituted or unsubstituted alkyl group, a substituted or unsubstituted alkoxy group, a substituted or unsubstituted aryloxy group, a substituted or unsubstituted phosphine oxide group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted alkynyl group, a substituted or unsubstituted cycloalkyl group, a substituted or unsubstituted amine group, a substituted or unsubstituted aryl group, or a substituted or unsubstituted heterocyclic group, or adjacent groups are bonded to each other to form a substituted or unsubstituted ring;

m1, m2, and m5 to m20 are each an integer from 0 to 4;

m3, m4, and m21 to m24 are each an integer from 0 to 5; and when m1 to m24 are each 2 or higher, two or more substituents in the parenthesis are the same as or different from each other.

According to an exemplary embodiment of the present invention, R1 to R24 are hydrogen, deuterium, a halogen group, a cyano group, a nitro group, a hydroxyl group, a substituted or unsubstituted silyl group, a substituted or unsubstituted boron group, a substituted or unsubstituted alkyl group having 1 to 40 carbon atoms, a substituted or unsubstituted alkoxy group having 1 to 20 carbon atoms, a substituted or unsubstituted aryloxy group having 6 to 60 carbon atoms, a substituted or unsubstituted alkylthioxy group having 1 to 40 carbon atoms, a substituted or unsubstituted arylthioxy group having 6 to 60 carbon atoms, a substituted or unsubstituted alkylsulfoxy group having 1 to 40 carbon atoms, a substituted or unsubstituted arylsulfoxy group having 6 to 60 carbon atoms, a substituted or unsubstituted alkenyl group having 2 to 40 carbon atoms, a substituted or unsubstituted alkynyl group having 2 to 40 carbon atoms, a substituted or unsubstituted cycloalkyl group having 3 to 60 carbon atoms, a substituted or unsubstituted arylamine group having 6 to 60 carbon atoms, a substituted or unsubstituted heteroarylamine group having 2 to 60 carbon atoms, a substituted or unsubstituted arylheteroarylamine group having 8 to 60 carbon atoms, a substituted or unsubstituted aryl group having 6 to 60 carbon atoms, or a substituted or unsubstituted heterocyclic group having 2 to 60 carbon atoms, or adjacent groups are bonded to each other to form a substituted or unsubstituted ring.

In an exemplary embodiment of the present invention, R101 to R104 are the same as or different from each other, and are each independently hydrogen, a substituted or unsubstituted alkyl group having 1 to 20 carbon atoms, or a substituted or unsubstituted aryl group having 6 to 30 carbon atoms, or are bonded to each other to form an aliphatic hydrocarbon ring having 3 to 20 carbon atoms.

According to another exemplary embodiment, R101 to R104 are the same as or different from each other, and are each independently hydrogen, a substituted or unsubstituted methyl group, a substituted or unsubstituted ethyl group, or a substituted or unsubstituted phenyl group, or are bonded to each other to form a substituted or unsubstituted pentene ring.

In still another exemplary embodiment, R101 to R104 are the same as or different from each other, and are each independently hydrogen, a methyl group, an ethyl group, or phenyl group, or are bonded to each other to form a pentene ring.

According to an exemplary embodiment of the present invention, m1 to m24 are each an integer from 0 to 2, and when m1 to m24 are each 2, two substituents in the parenthesis are the same as or different from each other.

According to an exemplary embodiment of the present invention, Formula 1 is any one of the following Formulae 8 to 13:

Formula 8

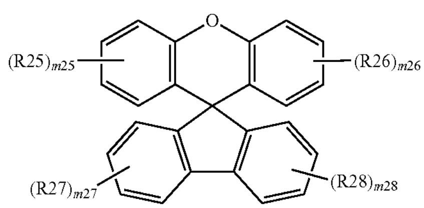

Formula 9

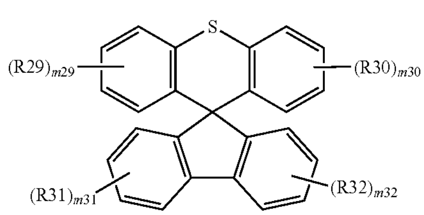

-continued

Formula 10

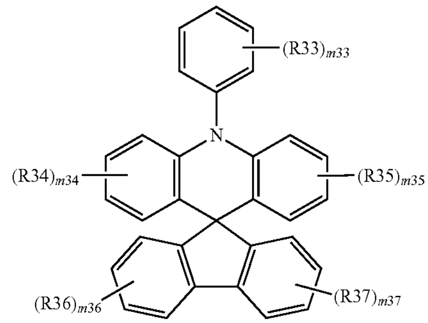

Formula 11

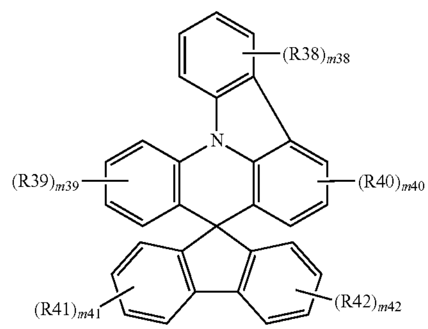

Formula 12

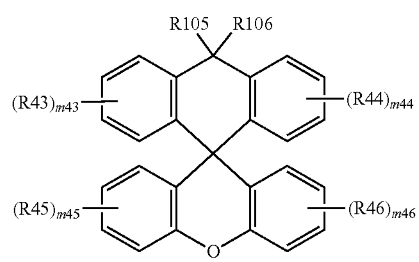

Formula 13

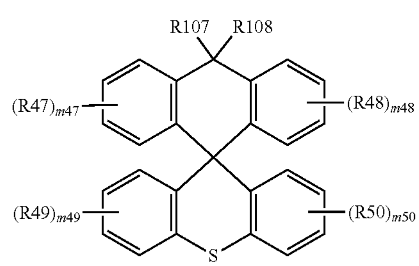

wherein in Formulae 8 to 13:

R105 to R108 are the same as or different from each other, and are each independently hydrogen, a substituted or unsubstituted alkyl group, or a substituted or unsubstituted aryl group;

R25 to R50 are the same as or different from each other, and are each independently hydrogen, deuterium, a halogen group, a cyano group, a nitro group, a hydroxyl group, a substituted or unsubstituted silyl group, a substituted or unsubstituted boron group, a substituted or unsubstituted alkyl group, a substituted or unsubstituted alkoxy group, a substituted or unsubstituted aryloxy group, a substituted or unsubstituted phosphine oxide group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted alkynyl group, a substituted or unsubstituted cycloalkyl group, a substituted or unsubstituted amine group, a substituted or unsubstituted aryl group, or a substituted or unsubstituted heterocyclic group, or adjacent groups are bonded to each other to form a substituted or unsubstituted ring, m25 to m32, m34 to m39, and m41 to m50 are each an integer from 0 to 4, m33 is an integer from 0 to 5, m40 is an integer from 0 to 3, and when m25 to m50 are each an integer of 2 or higher, two or more substituents in the parenthesis are the same as or different from each other.

In an exemplary embodiment of the present invention, R105 to R108 are the same as or different from each other, and are each independently hydrogen, a substituted or unsubstituted alkyl group having 1 to 20 carbon atoms, or a substituted or unsubstituted aryl group having 6 to 30 carbon atoms.

According to another exemplary embodiment, R105 to R108 are the same as or different from each other, and are each independently hydrogen, a substituted or unsubstituted methyl group, or a substituted or unsubstituted phenyl group.

In still another exemplary embodiment, R105 to R108 are the same as or different from each other, and are each independently hydrogen, a methyl group, or a phenyl group.

According to an exemplary embodiment of the present invention, R1 to R50 are hydrogen, deuterium, a cyano group, a substituted or unsubstituted silyl group, a substituted or unsubstituted alkyl group having 1 to 20 carbon atoms, a substituted or unsubstituted alkoxy group having 1 to 20 carbon atoms, a substituted or unsubstituted phosphine oxide group, a substituted or unsubstituted aryl group having 6 to 60 carbon atoms, a substituted or unsubstituted heterocyclic group having 2 to 60 carbon atoms, Formula A, or Formula B, or are bonded to each other to form a substituted or unsubstituted aromatic ring having 2 to 30 carbon atoms.

In another exemplary embodiment, R1 to R50 are hydrogen, deuterium, a cyano group, a triphenylsilyl group, a methyl group, a butyl group, a methoxy group, a phenyl group which is unsubstituted or substituted with a cyano group or a diphenylphosphine oxide group, a naphthyl group which is unsubstituted or substituted with a cyano group, a biphenyl group which is unsubstituted or substituted with a cyano group, a terphenyl group which is unsubstituted or substituted with a cyano group or a methoxy group substituted with a halogen group, a diphenylphosphine oxide group, Formula A, or Formula B, or are bonded to each other to form a substituted or unsubstituted benzene, a substituted or unsubstituted naphthalene, a substituted or unsubstituted benzothiophene, a substituted or unsubstituted benzofuran, or a substituted or unsubstituted naphthofuran.

According to an exemplary embodiment of the present invention, m25 to m50 are each an integer from 0 to 2, and when m25 to m50 are each 2, two substituents in the parenthesis are the same as or different from each other.

In an exemplary embodiment of the present invention, the compound composed of sp3 carbon as a center can be any one of the structures of the following <Group A>, <Group B>, and <Group C>, and according to an exemplary embodiment of the present invention, any one of the structures of the following <Group A> can be included in one or more layers of the organic material layer provided between the anode and the light emitting layer, any one of the structures of the following <Group B> can be included in one or more layers of the organic material layer provided between the cathode and the light emitting layer, and any one of the structures of the following <Group C> can be included in the light emitting layer:

<Group A>

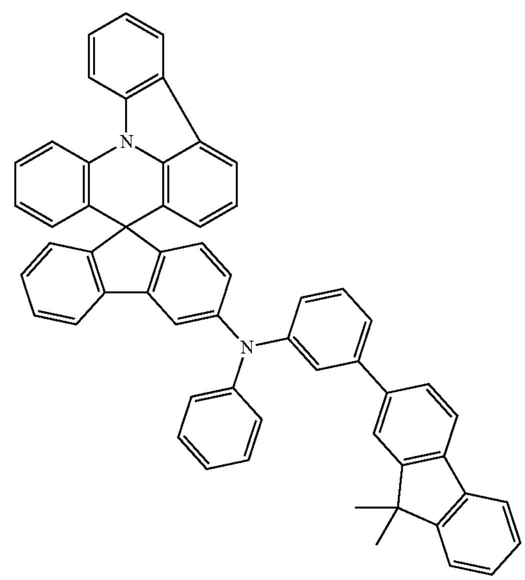

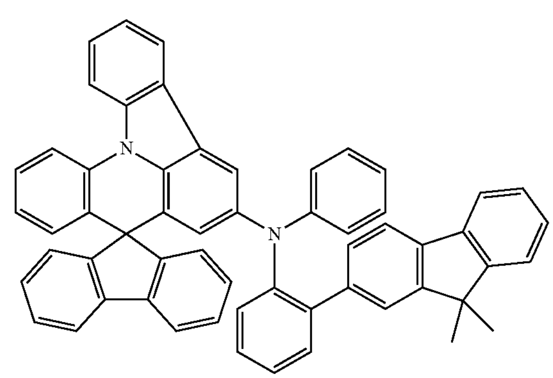

-continued
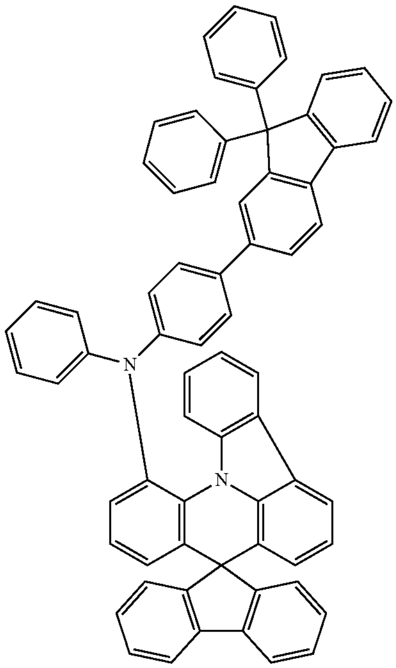
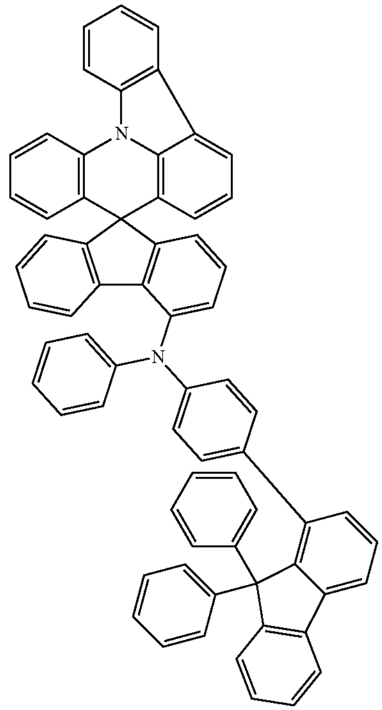
-continued
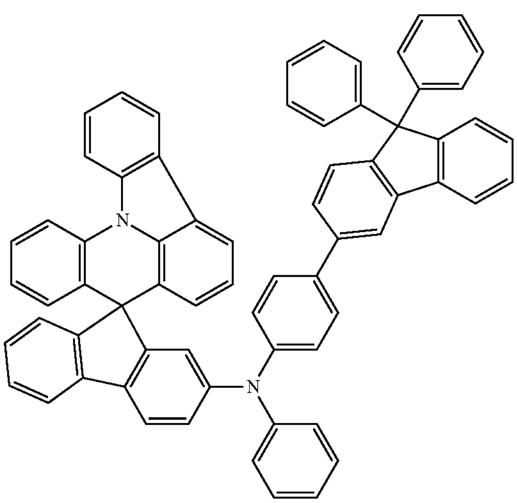
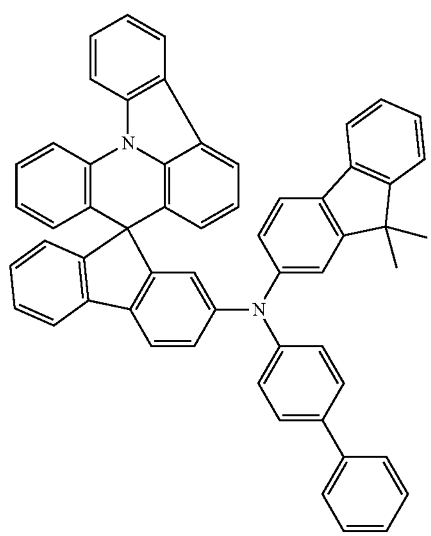

-continued
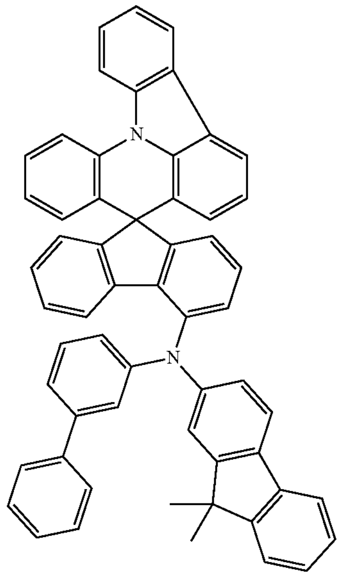
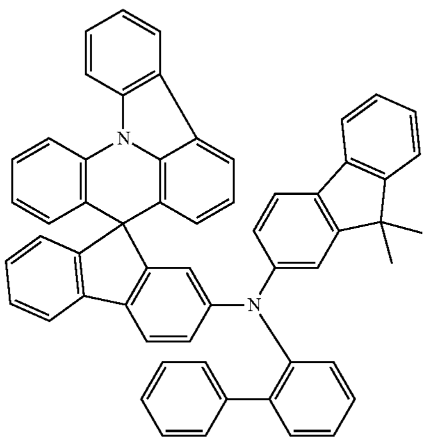
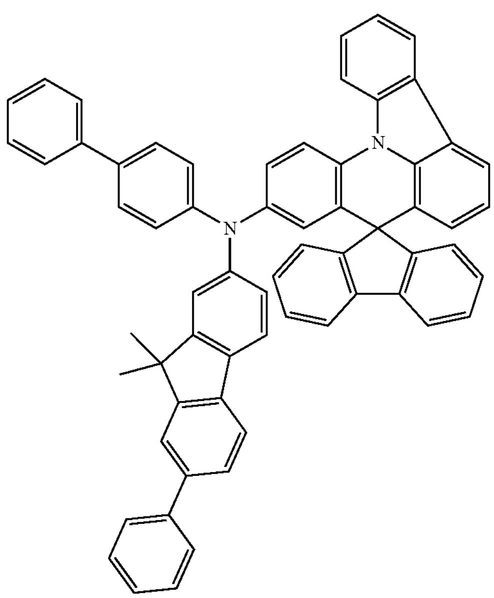
-continued
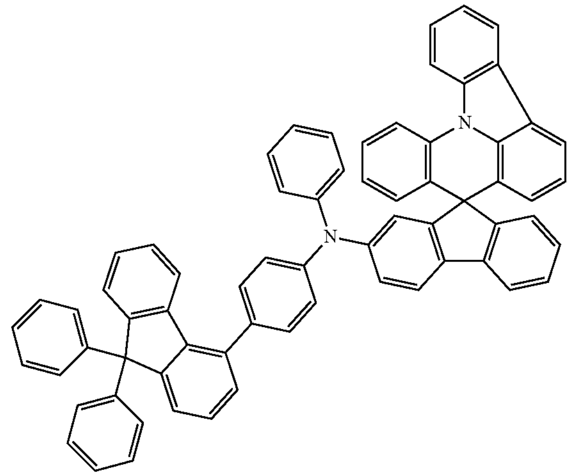
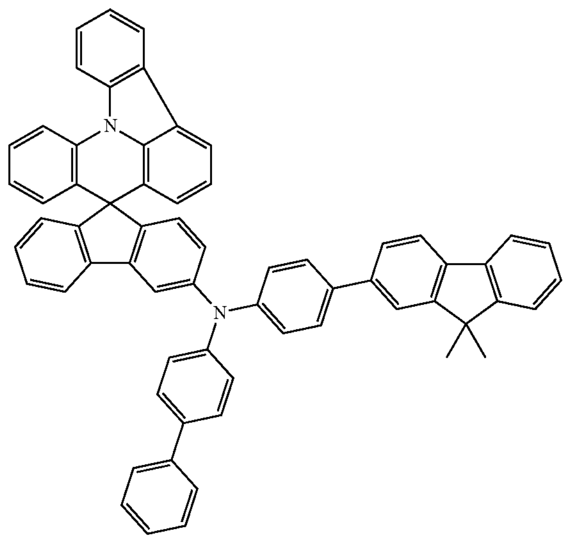
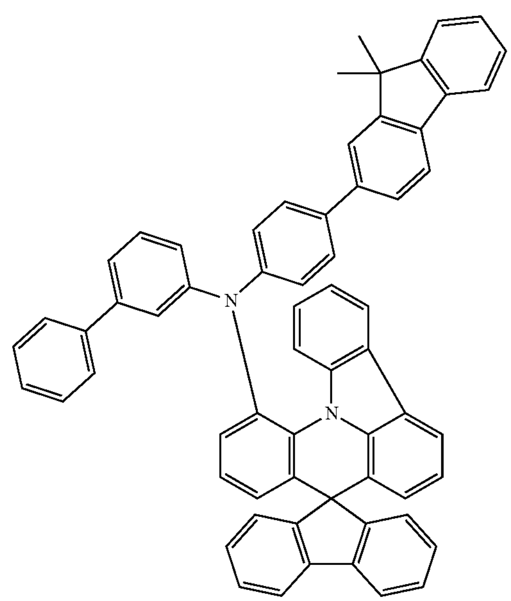

-continued
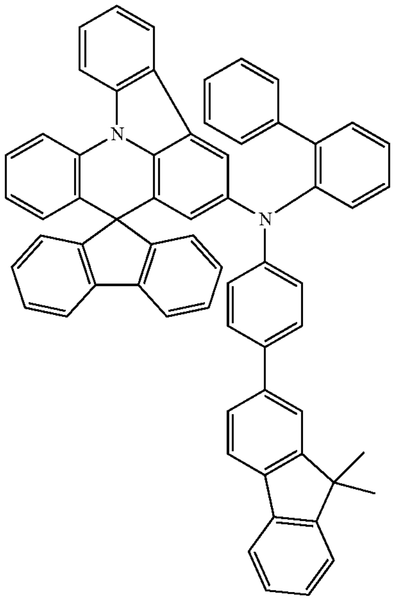
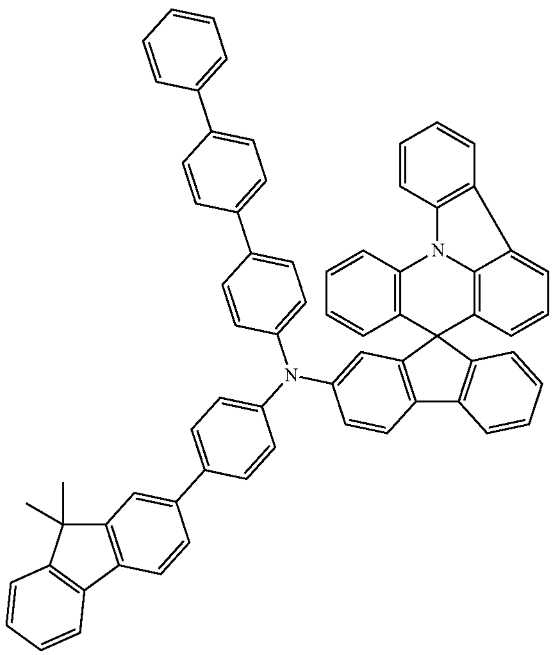
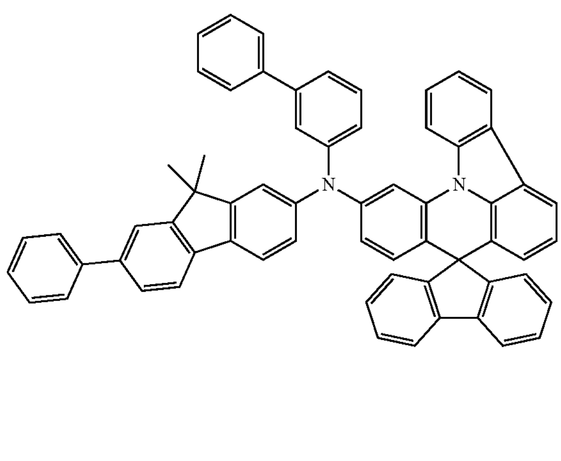
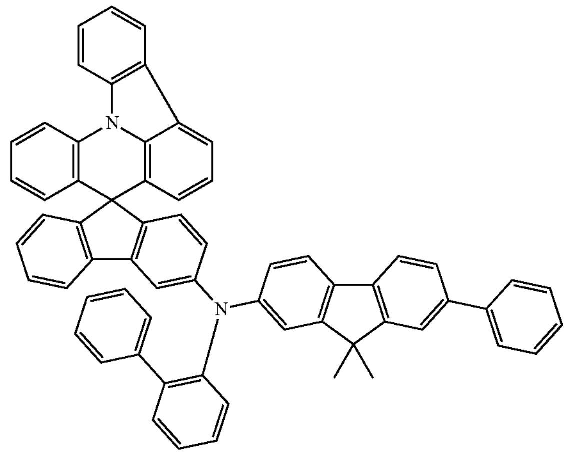
-continued
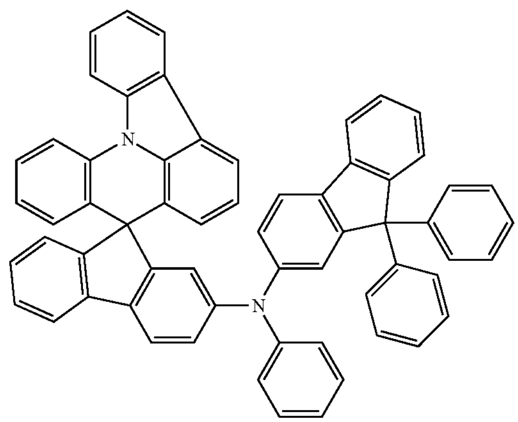
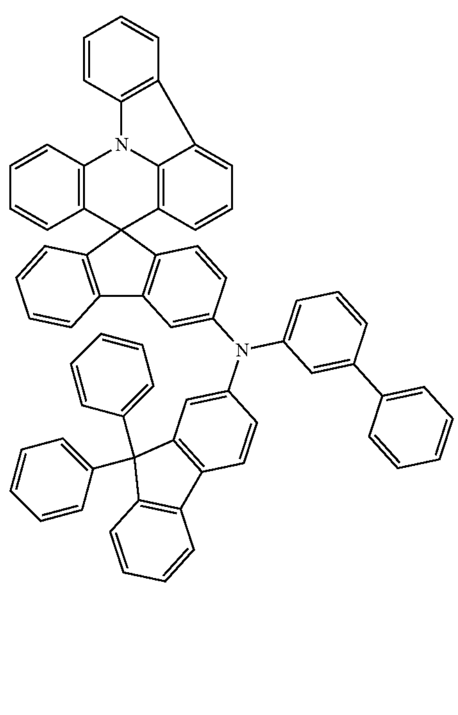

-continued
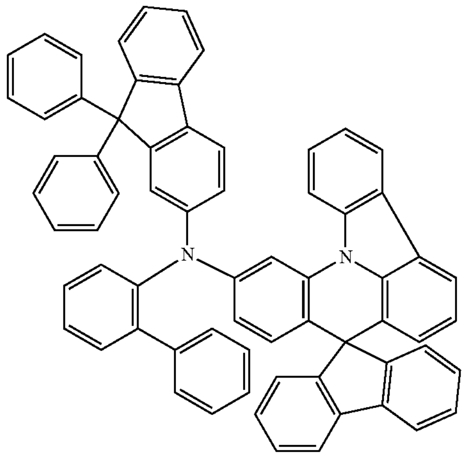
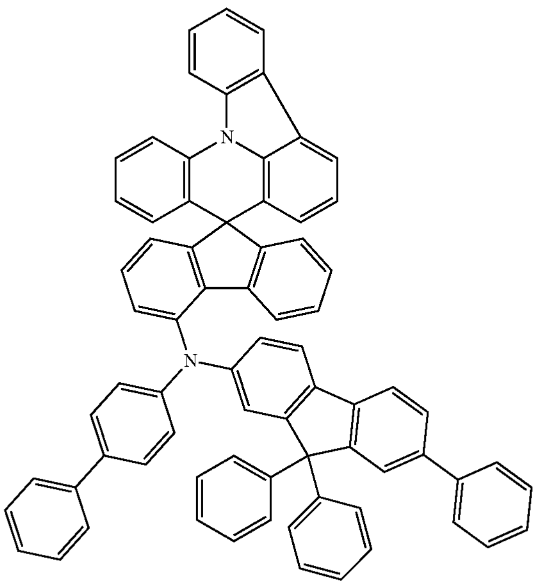
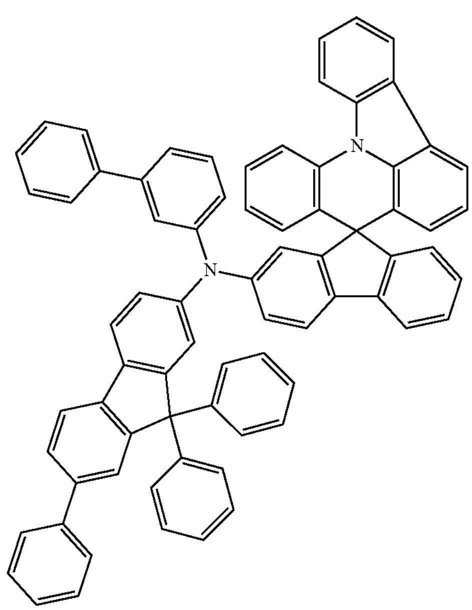
-continued
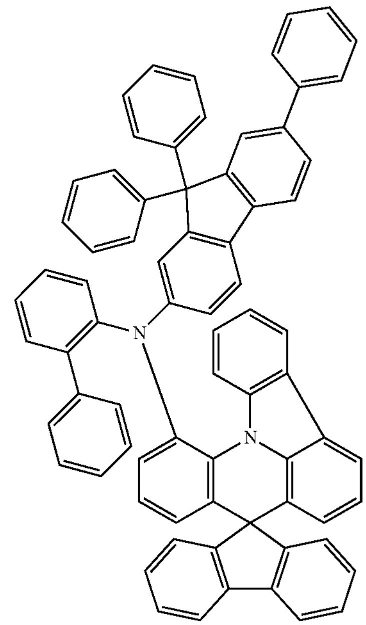
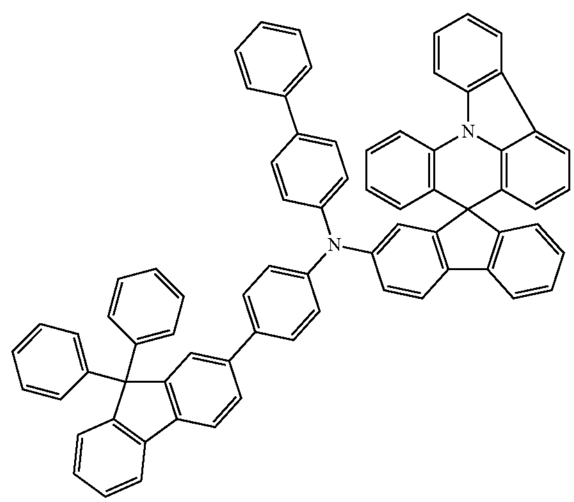
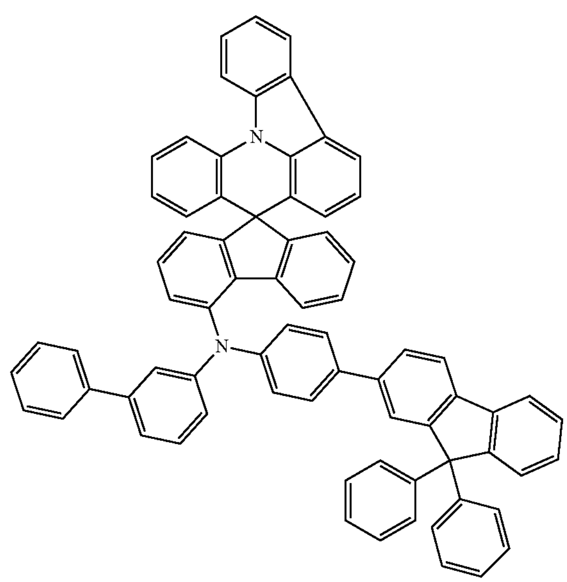

-continued
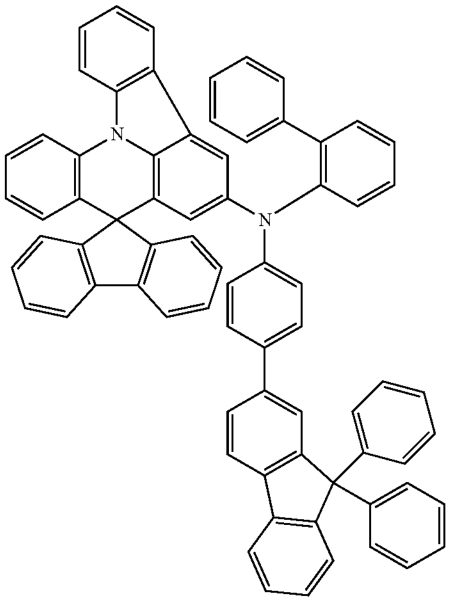
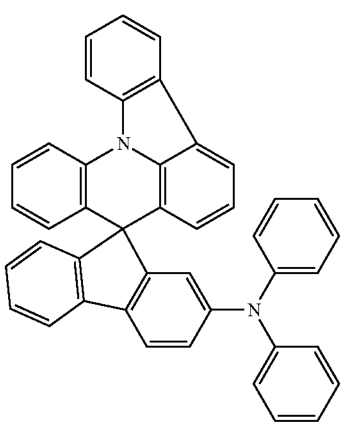
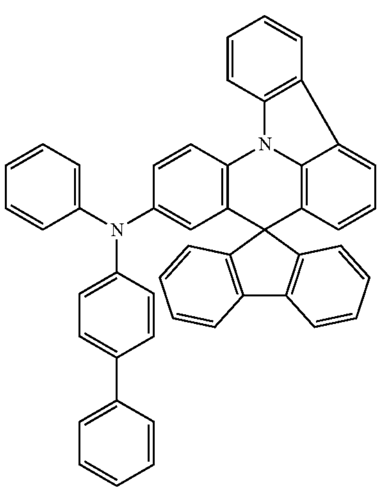
-continued
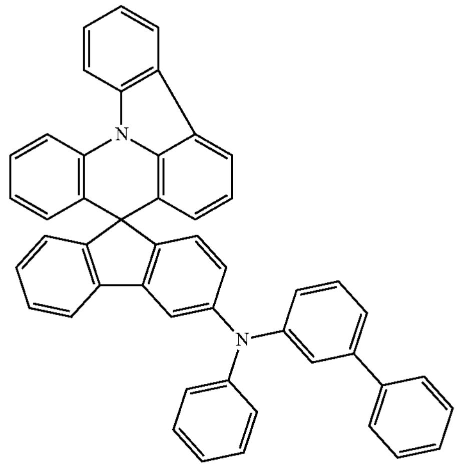
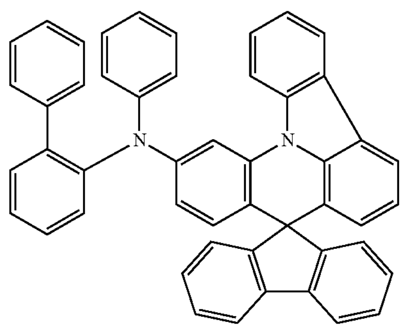
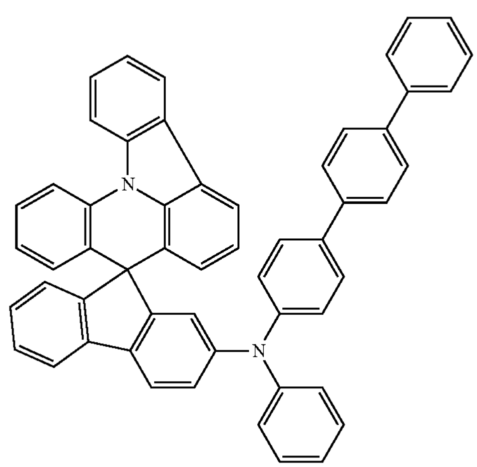

-continued
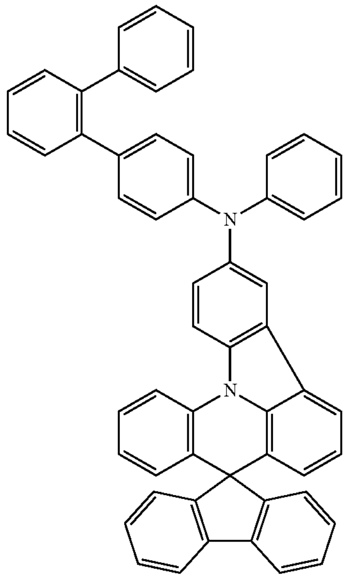
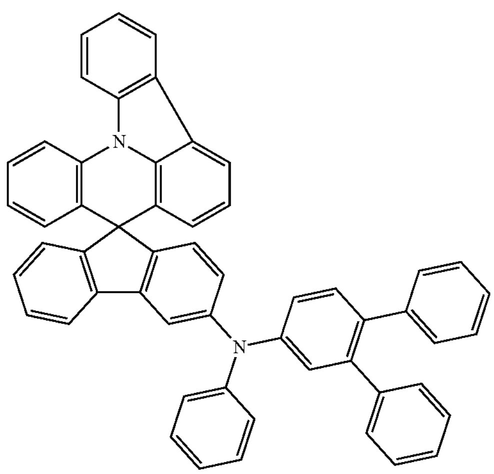
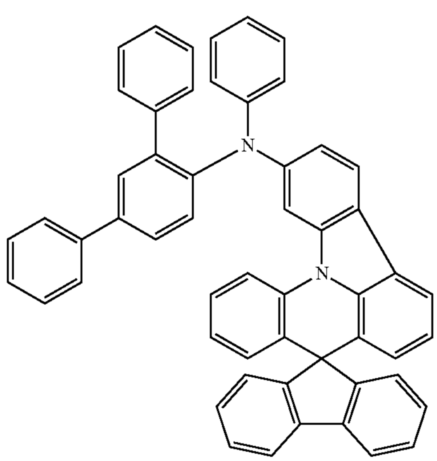
-continued
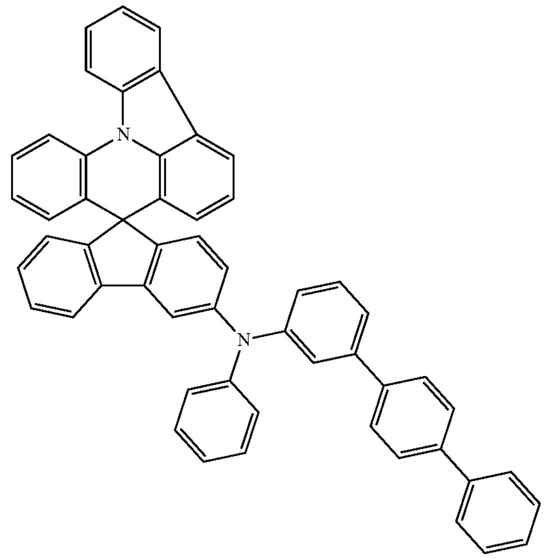
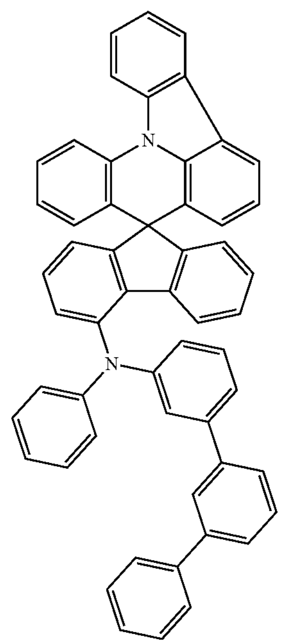
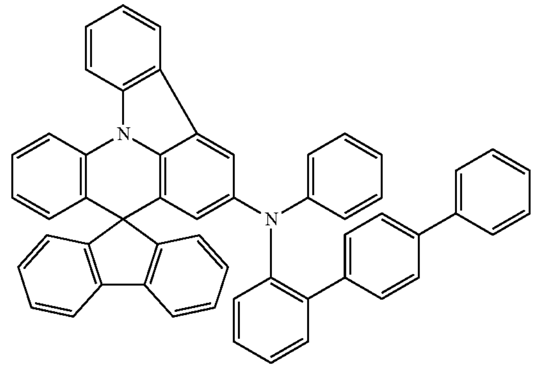

-continued
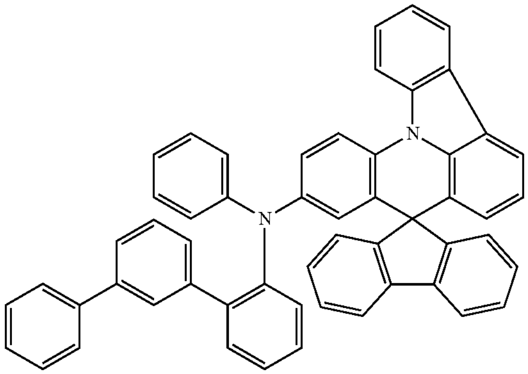
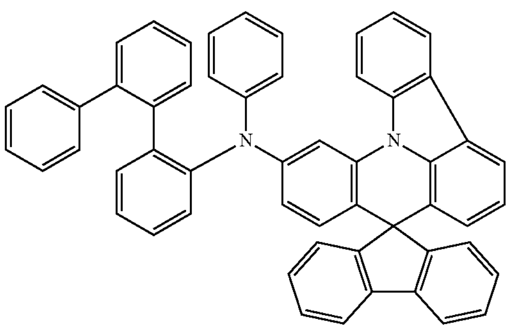
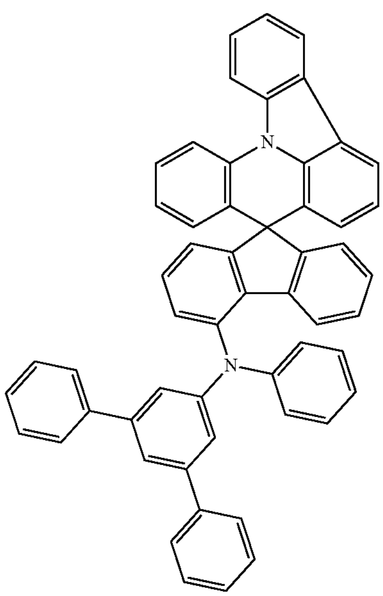
-continued
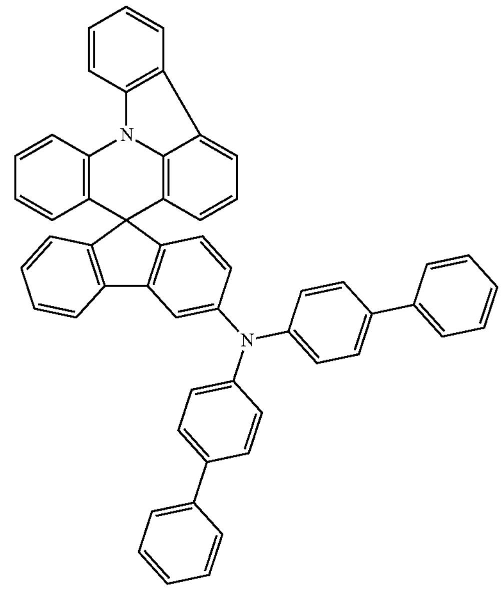
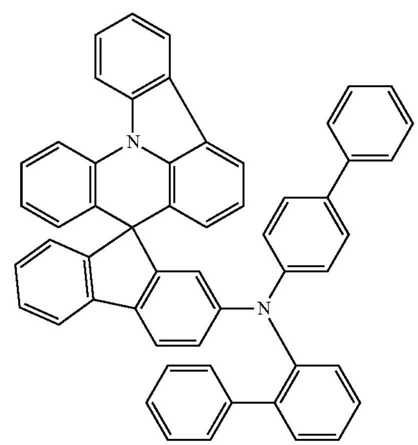
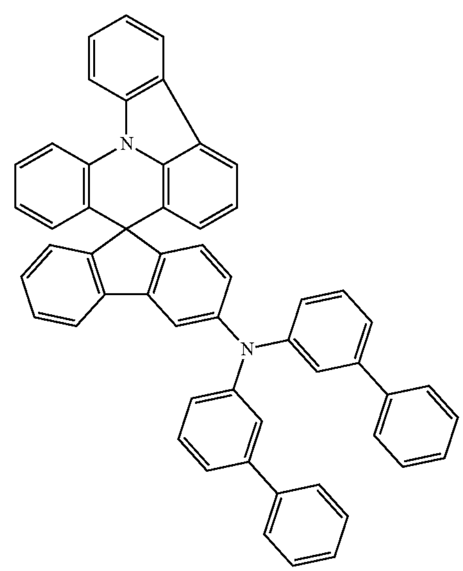

-continued
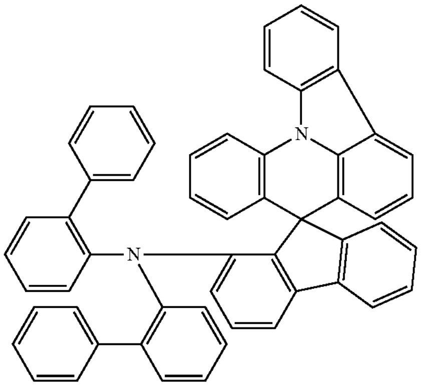
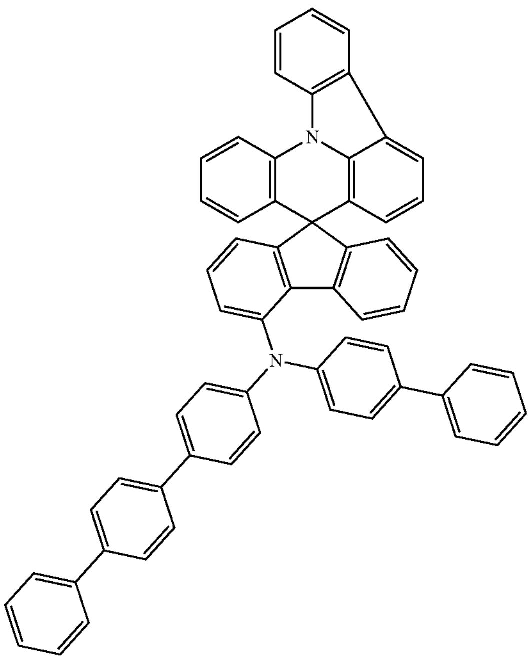
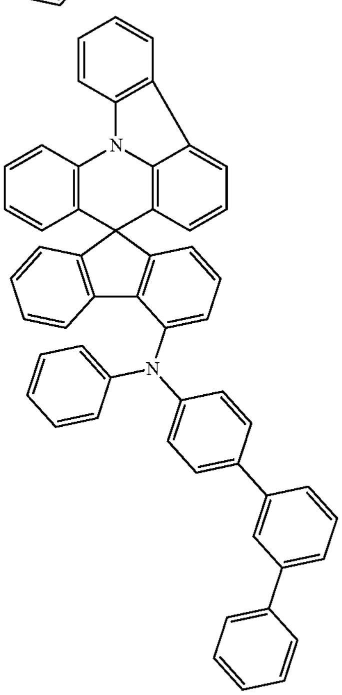
-continued
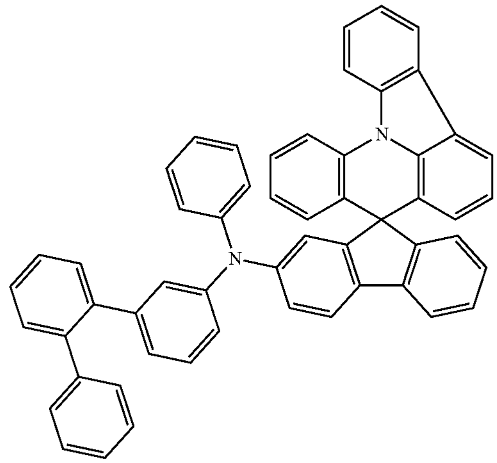
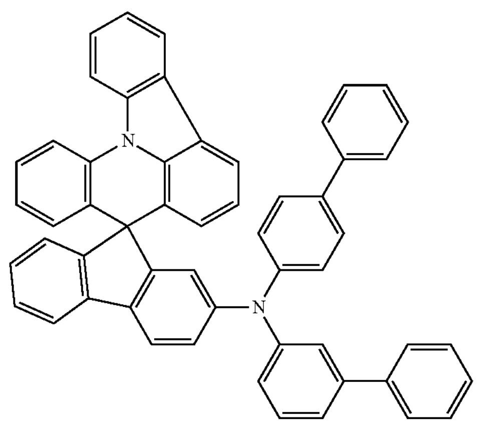
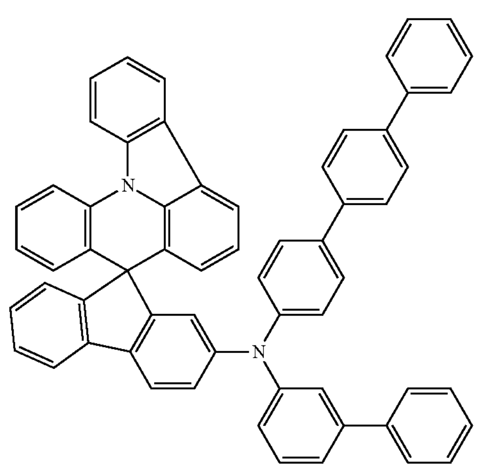

-continued
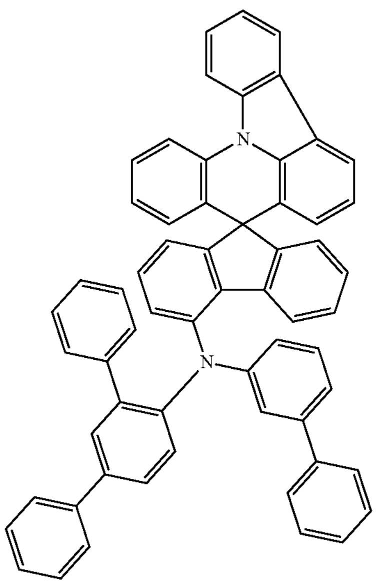
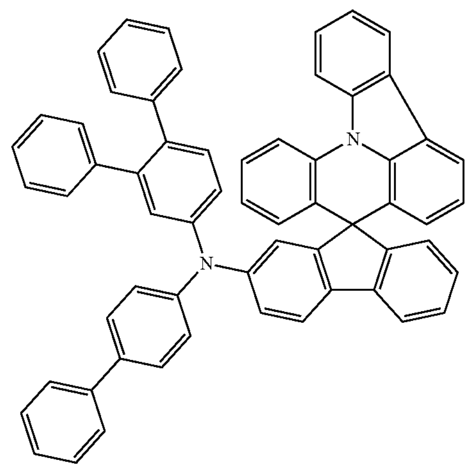
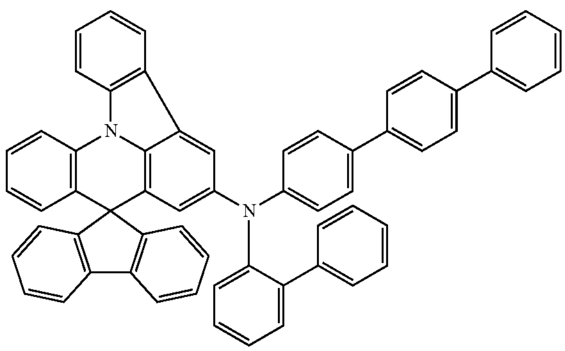
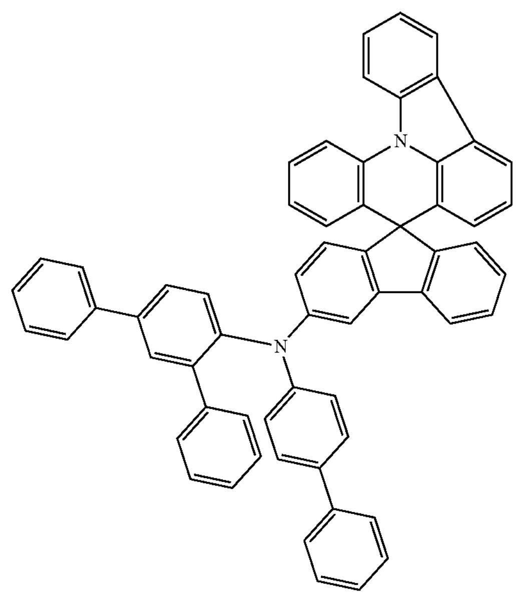
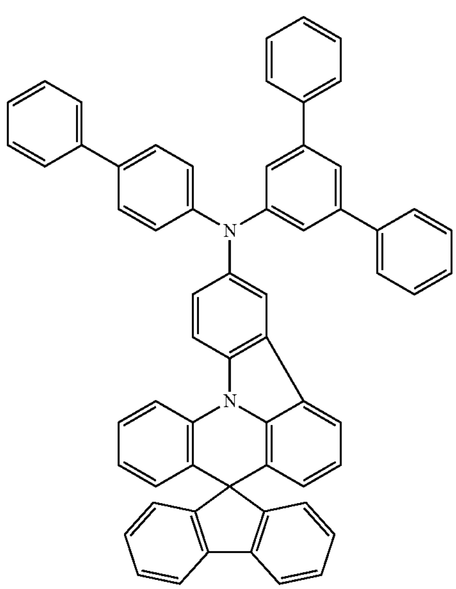
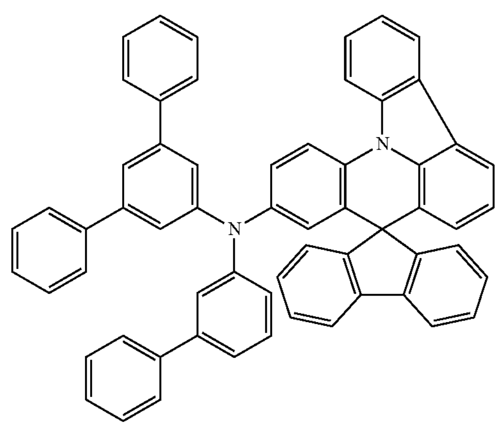

-continued
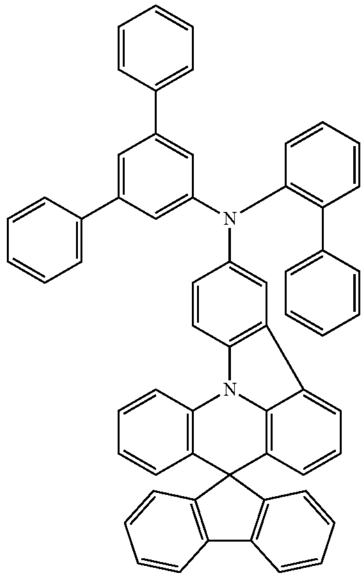
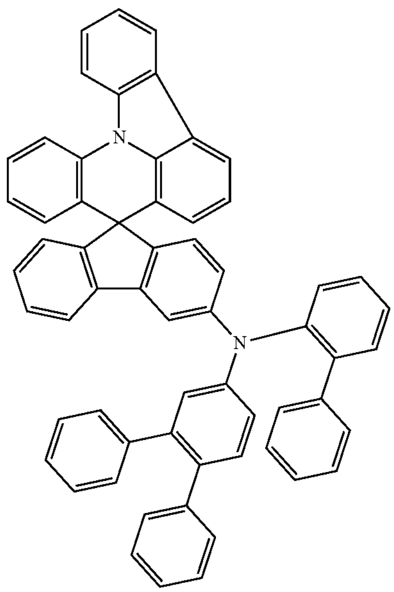
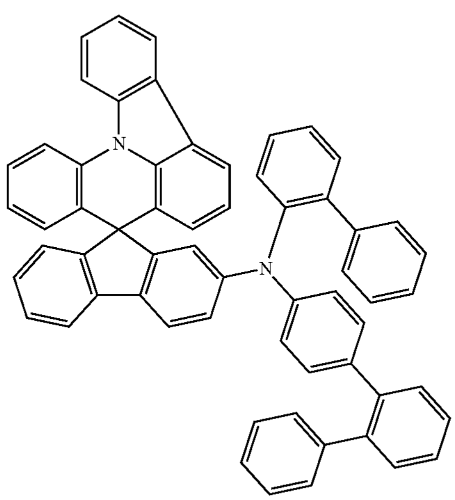
-continued
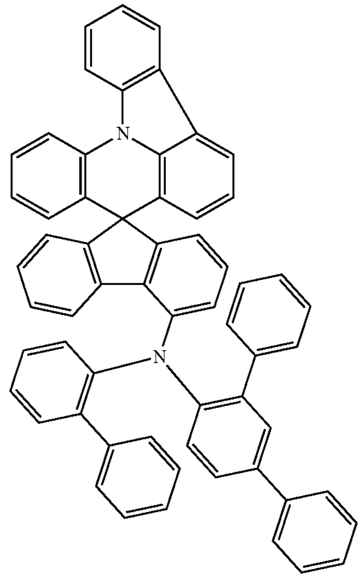
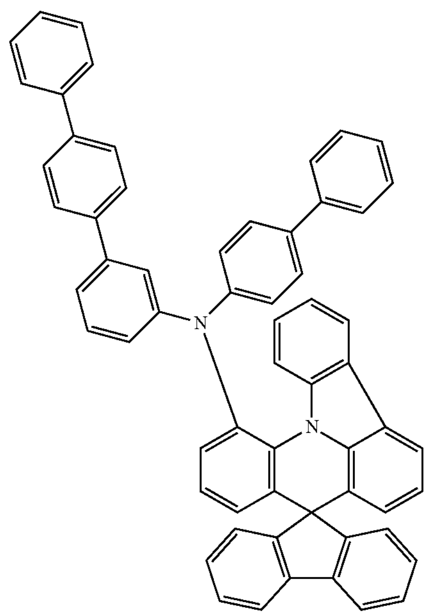
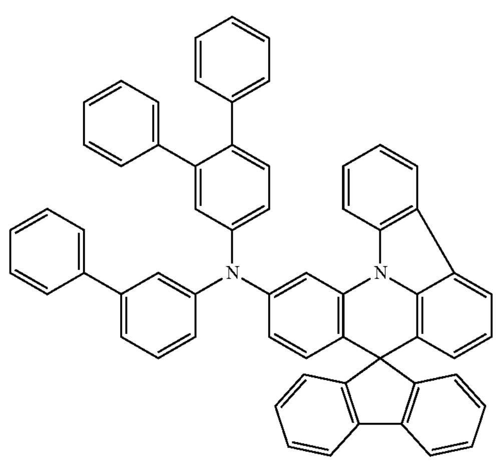

-continued
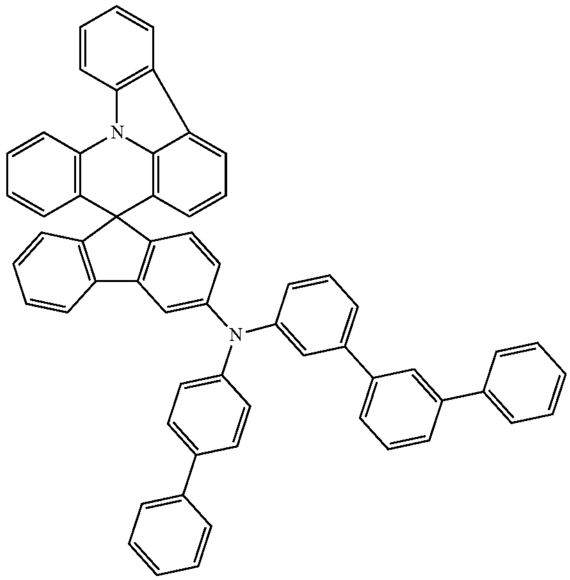
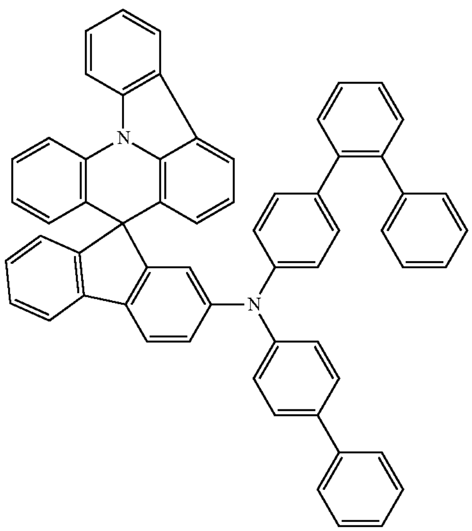
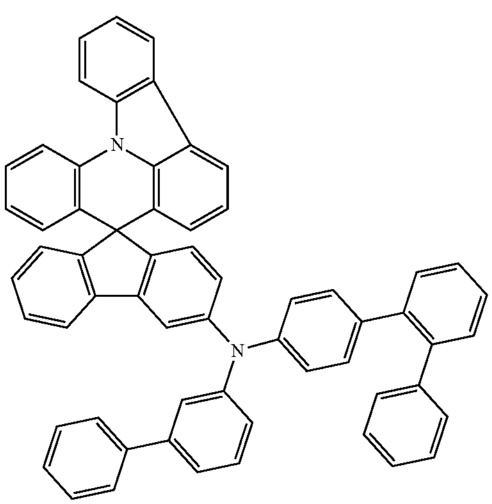
-continued
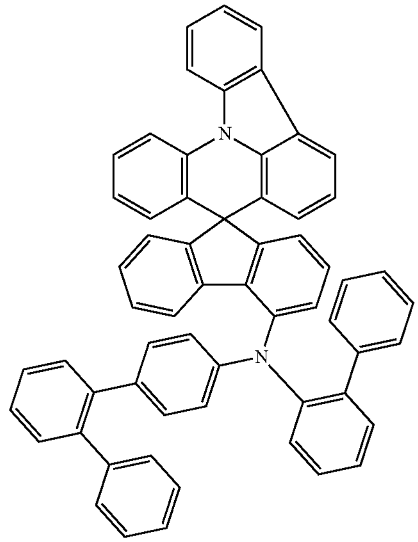
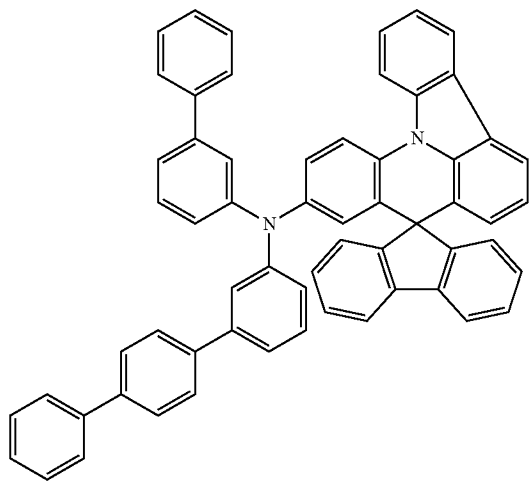
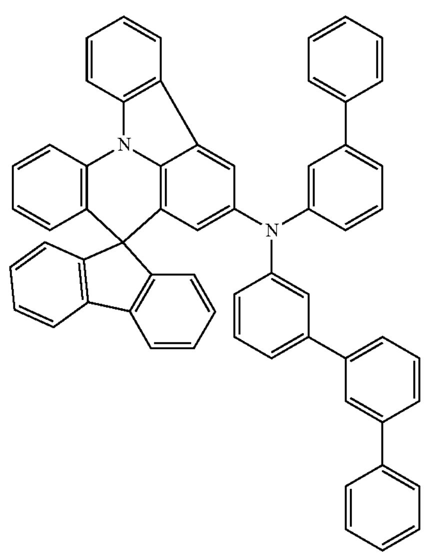

-continued
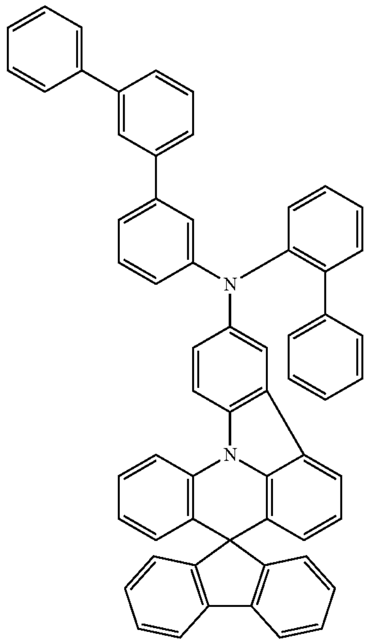
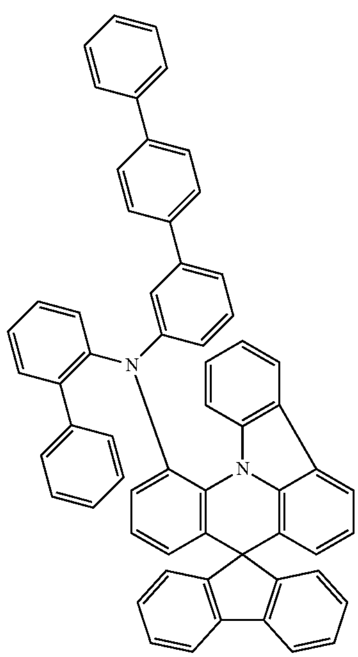
-continued
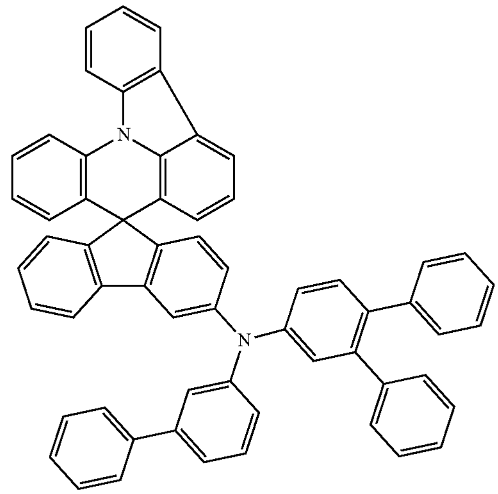
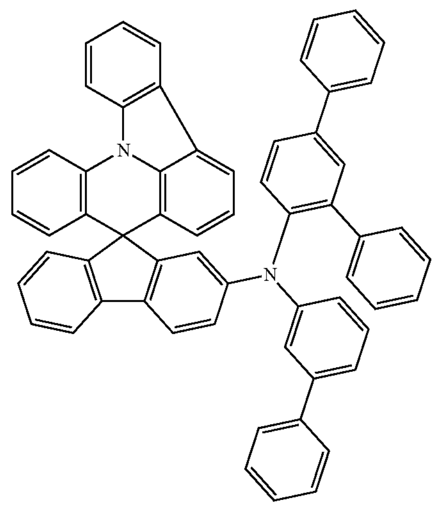
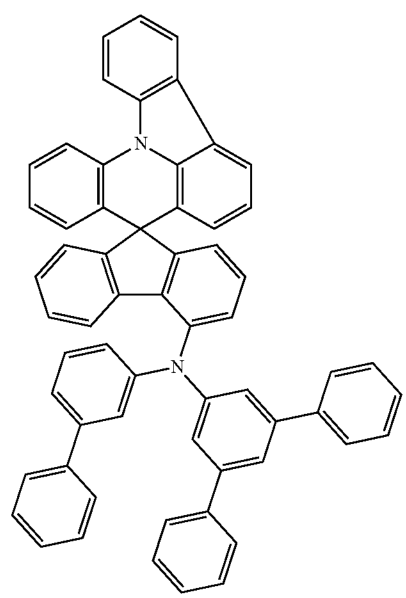

-continued
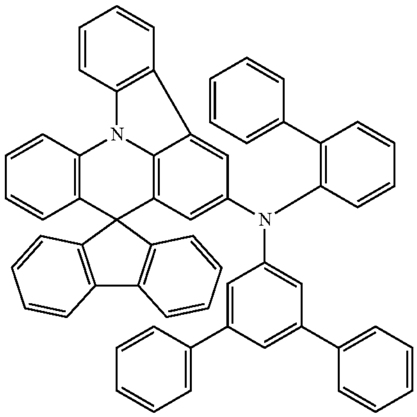
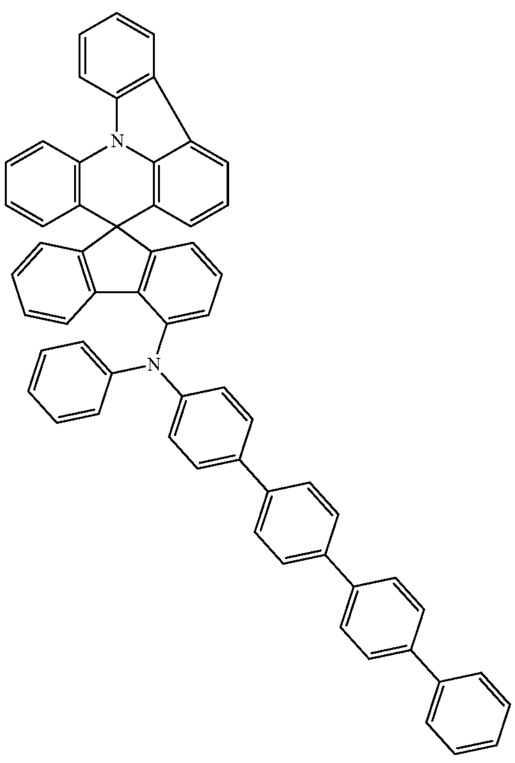
-continued
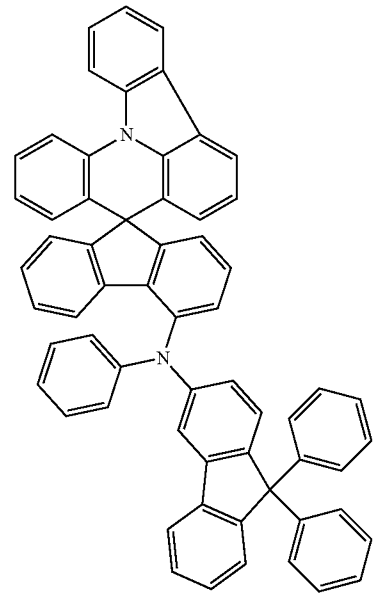
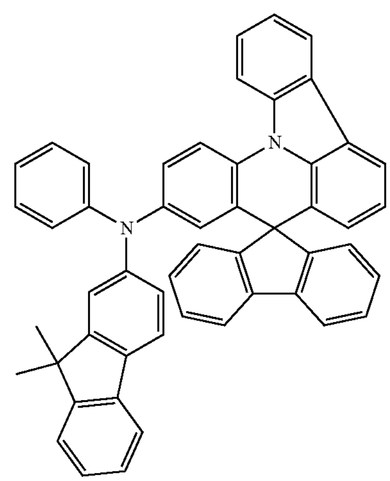
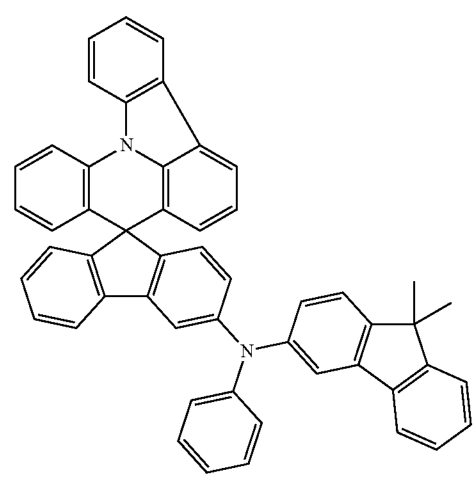

-continued
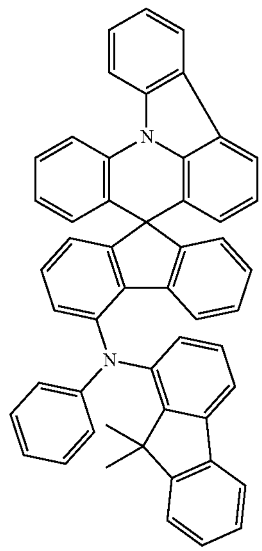
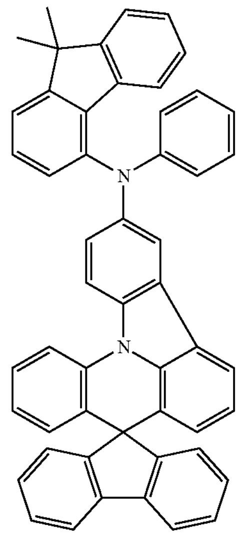
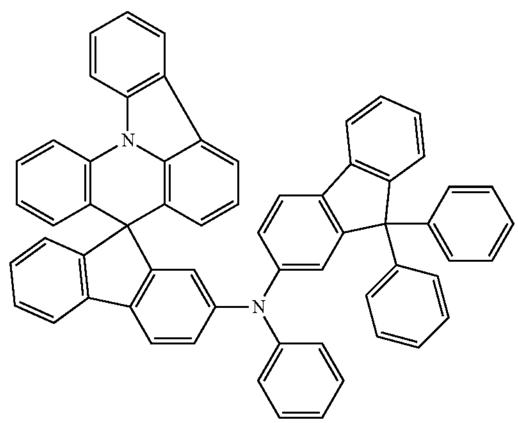
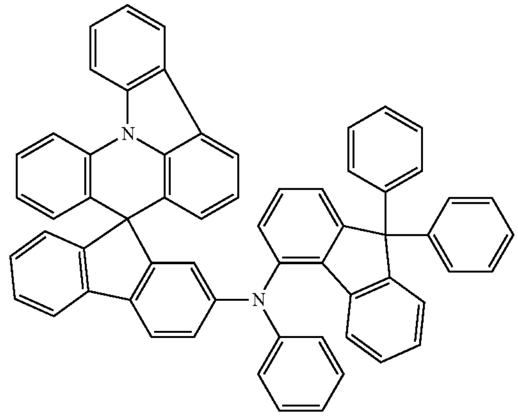
-continued
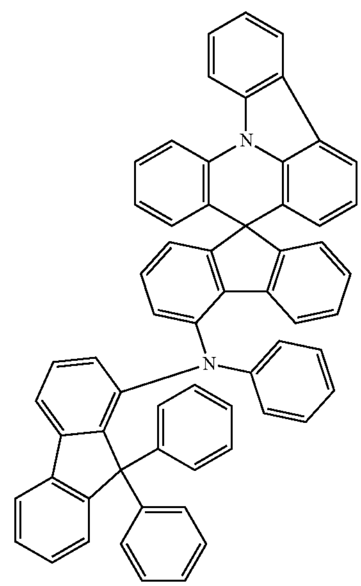
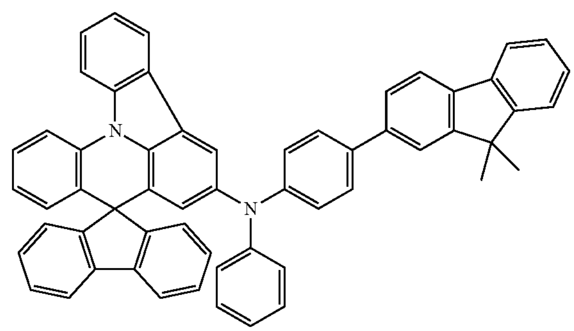
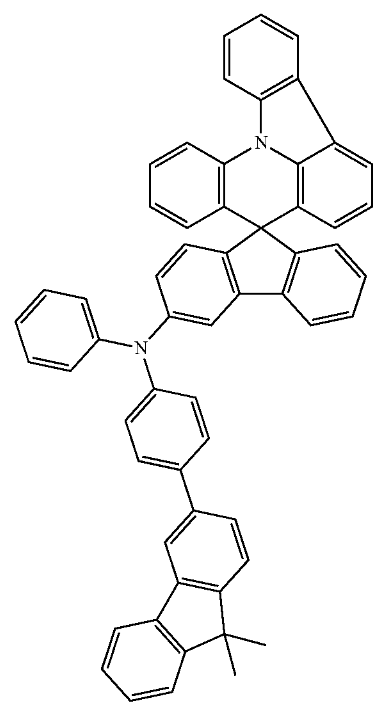

-continued
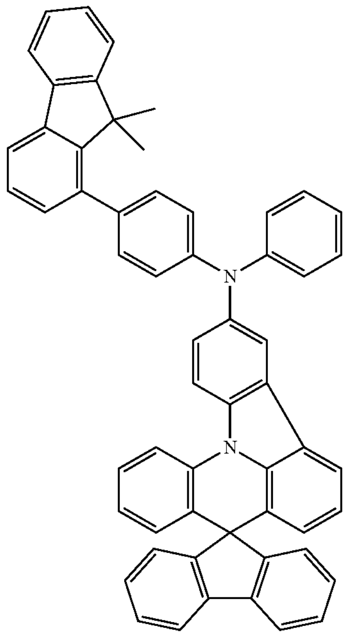
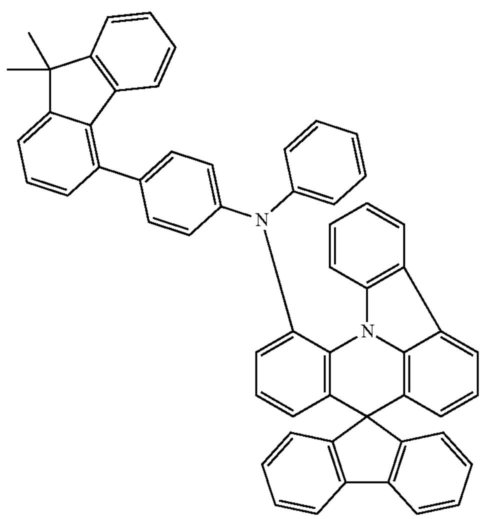
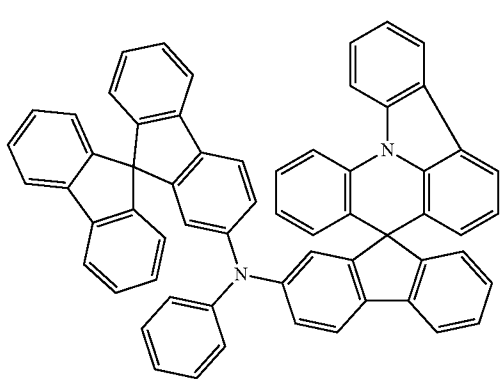
-continued
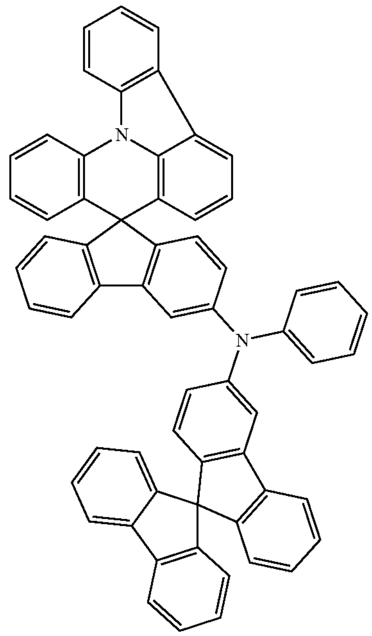
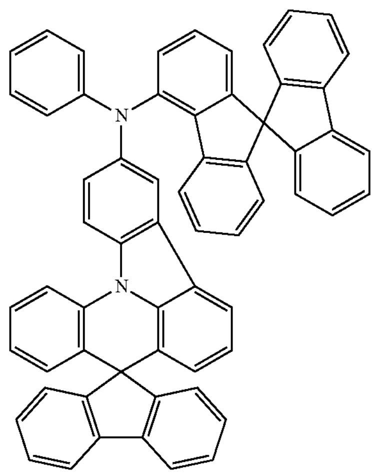
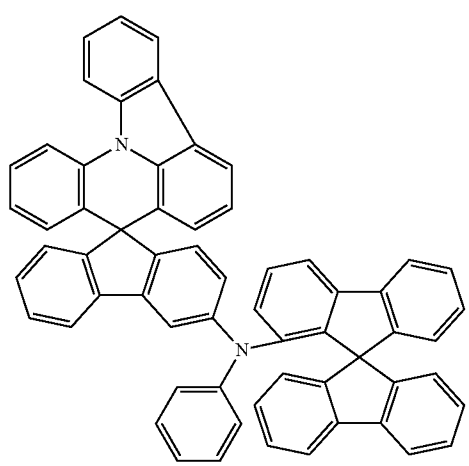

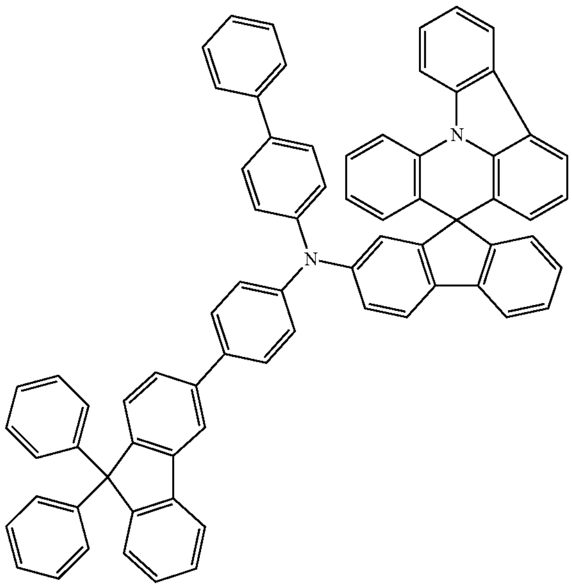
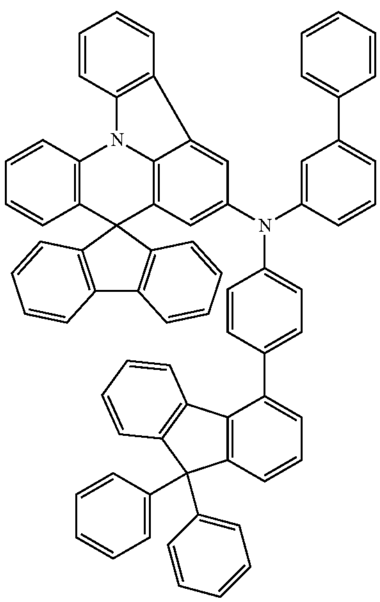
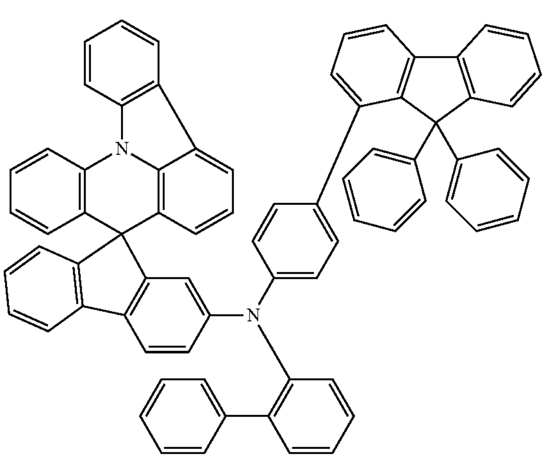
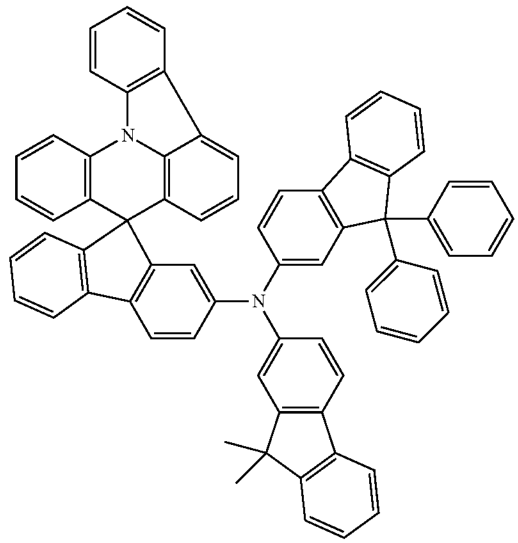
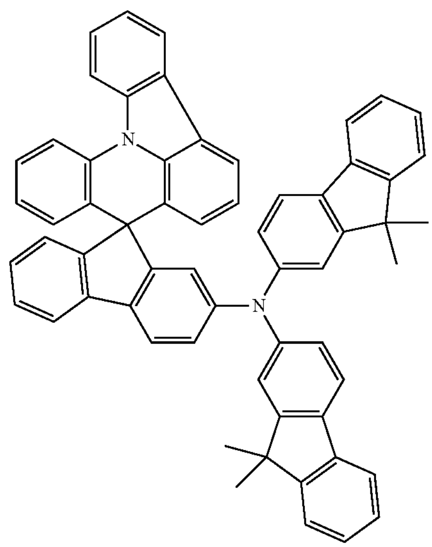
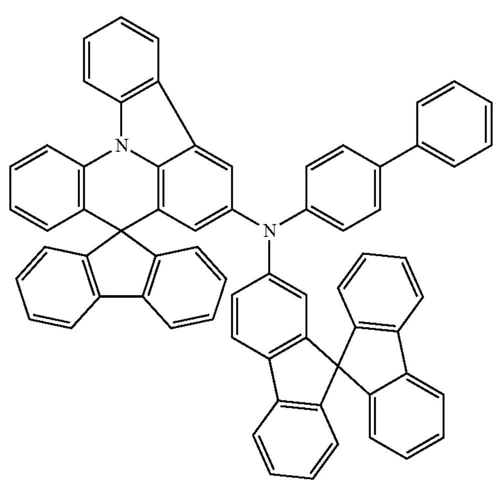
N

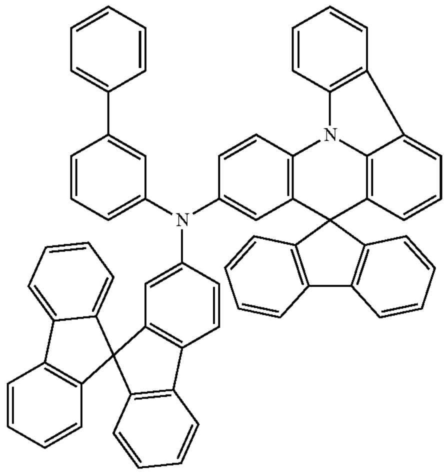
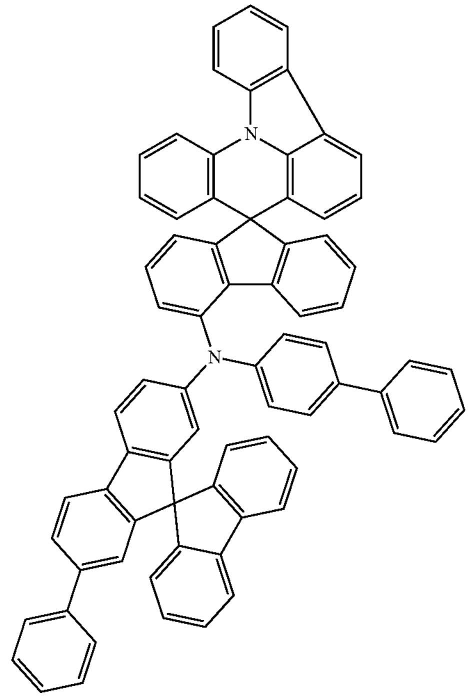
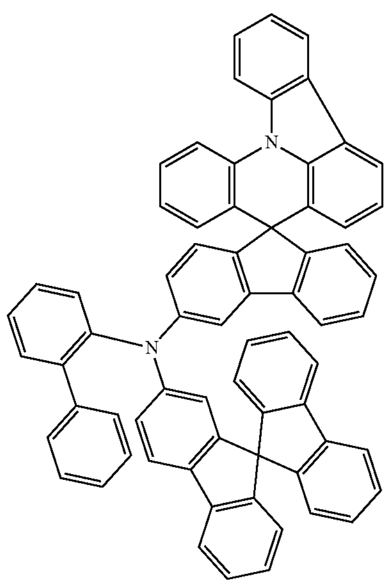
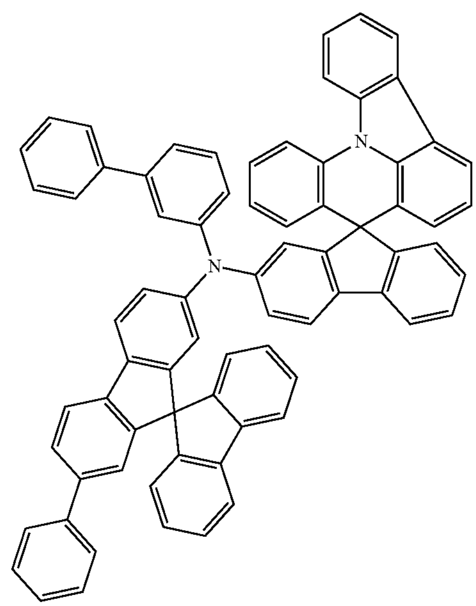

-continued
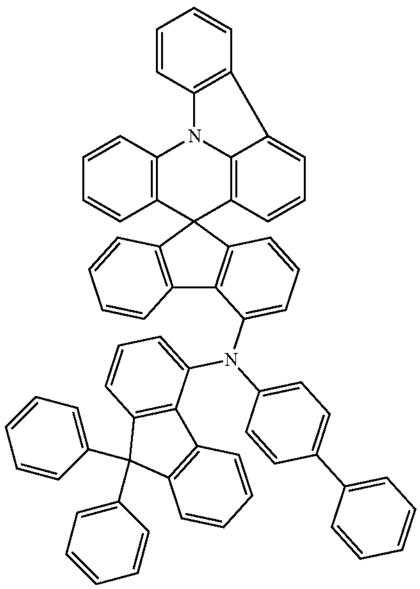
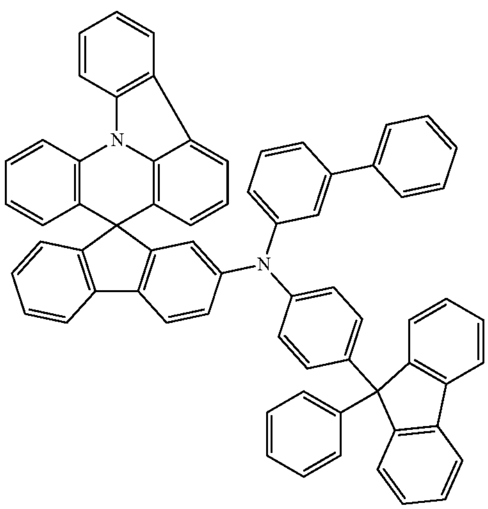
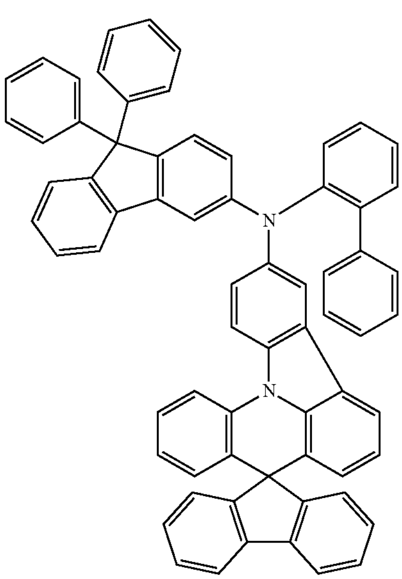
-continued
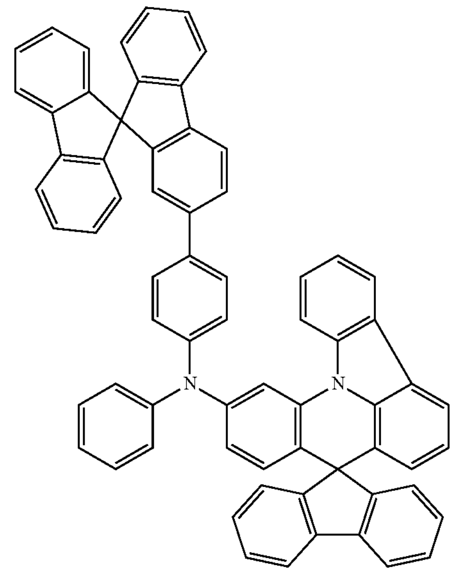
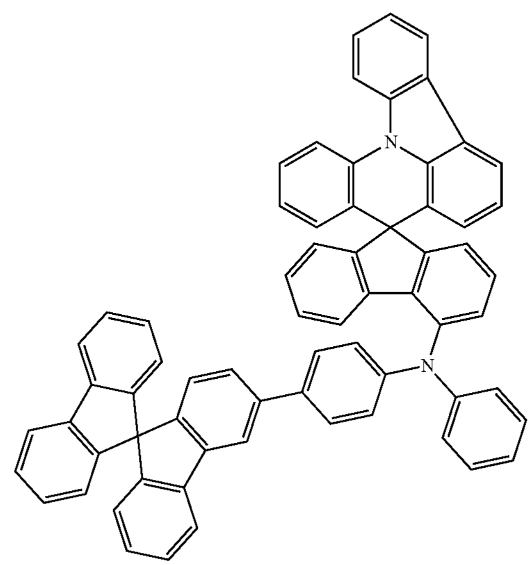
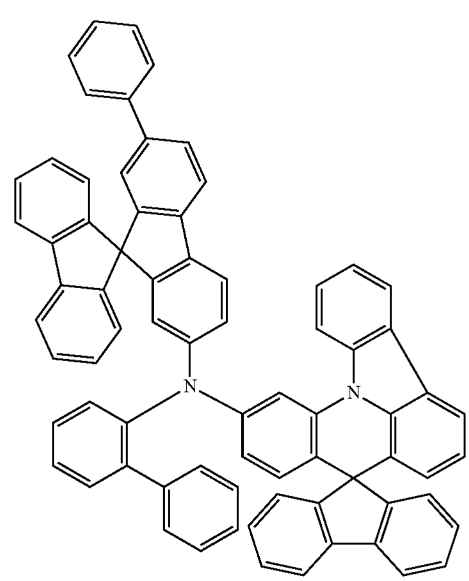

-continued
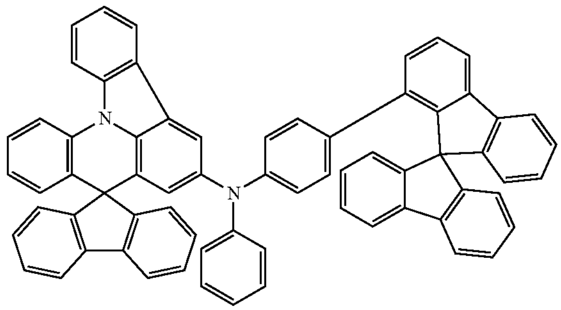
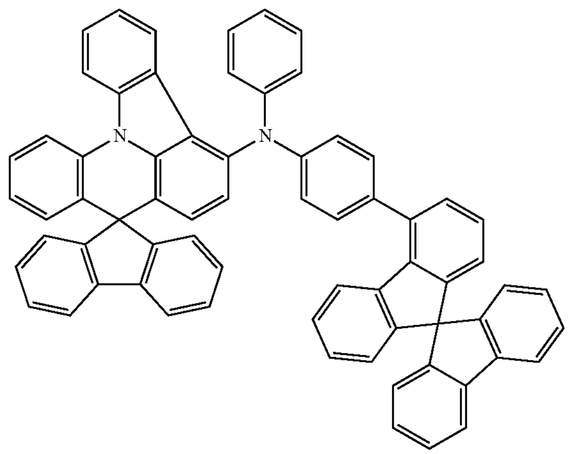
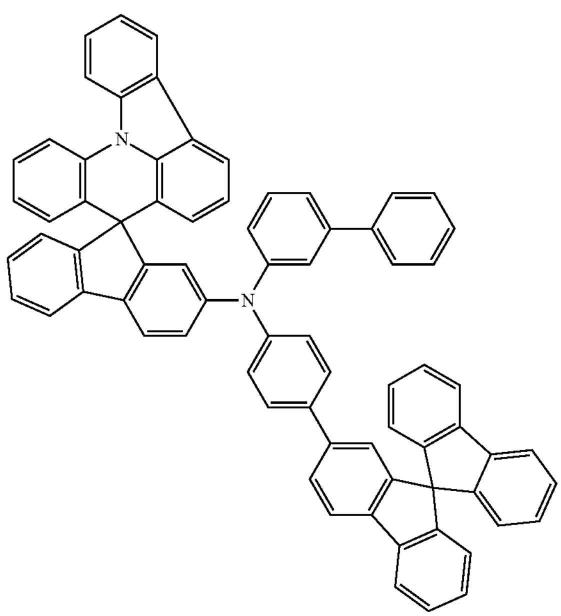
-continued
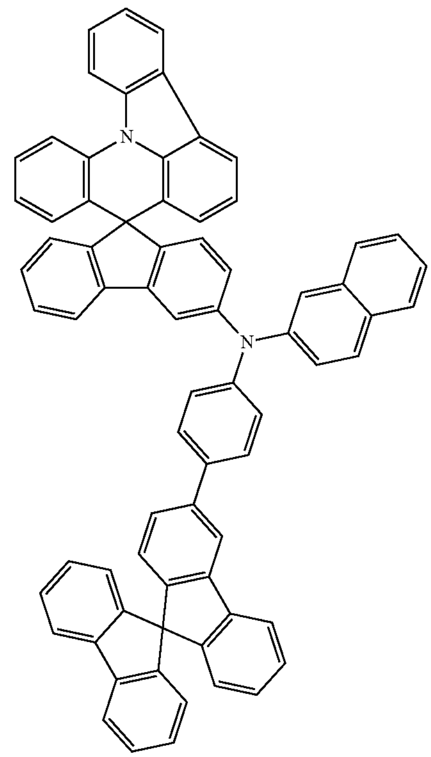
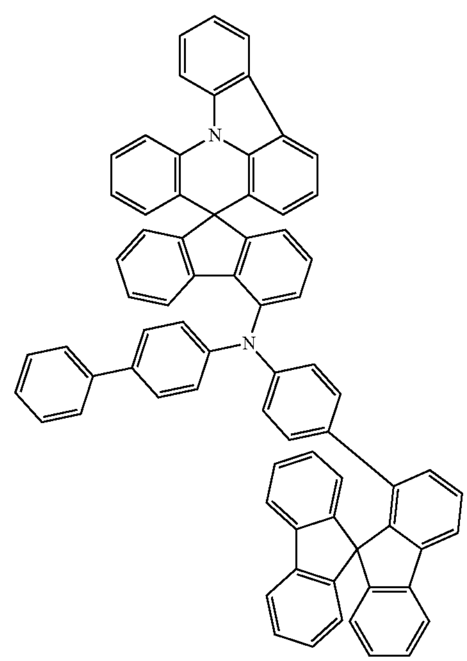

-continued
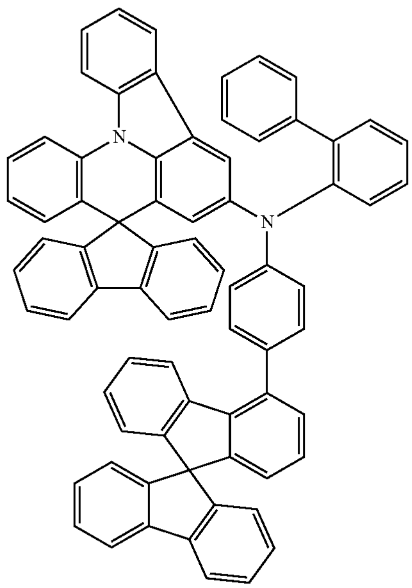
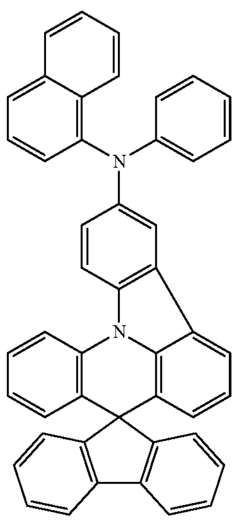
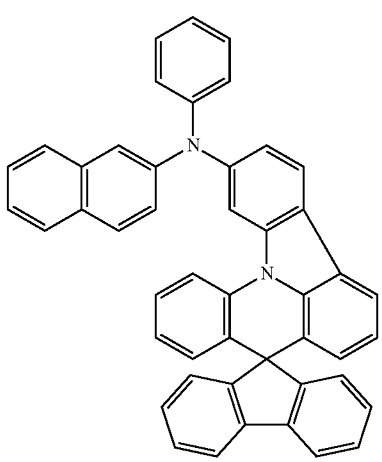
-continued
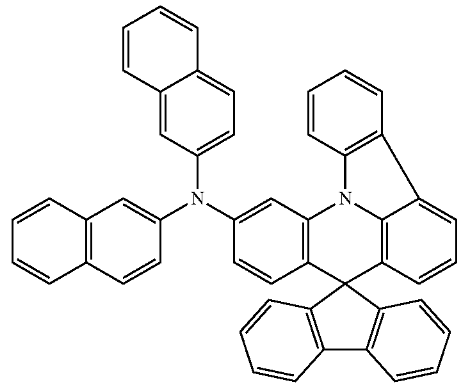
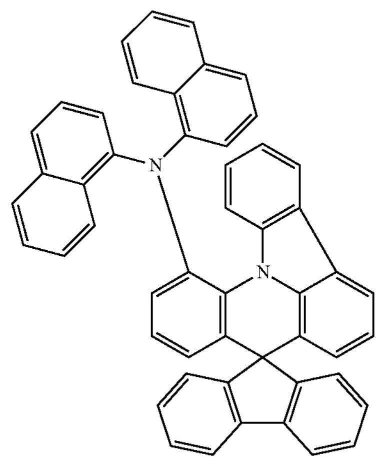
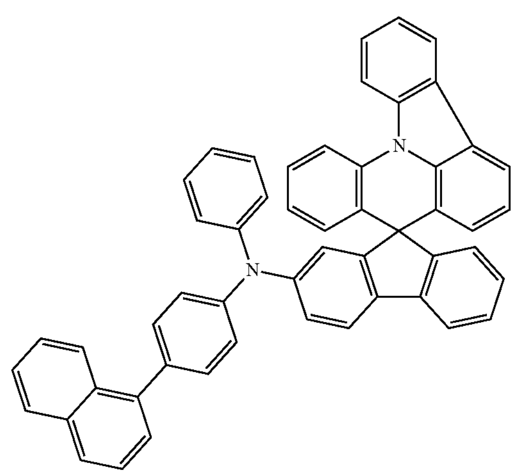

-continued
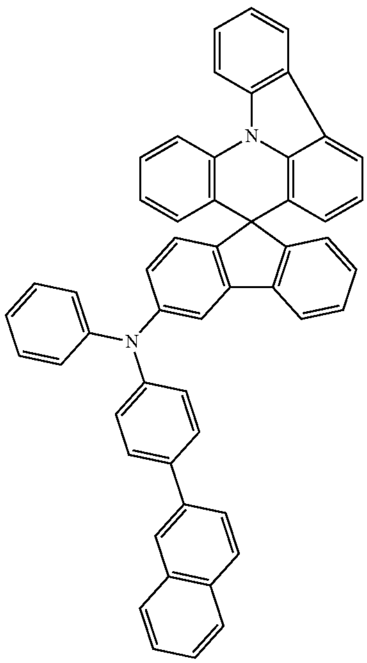
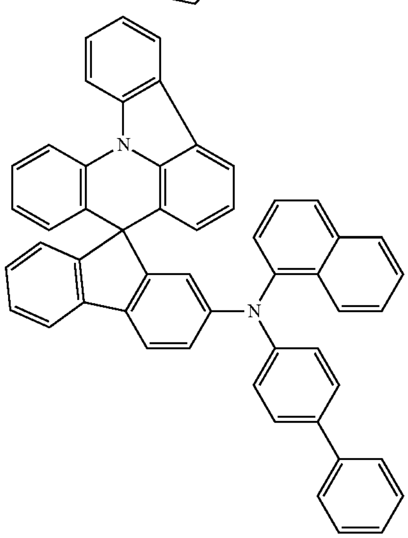
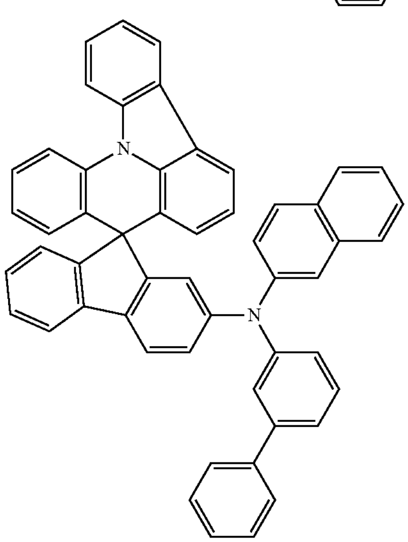
-continued
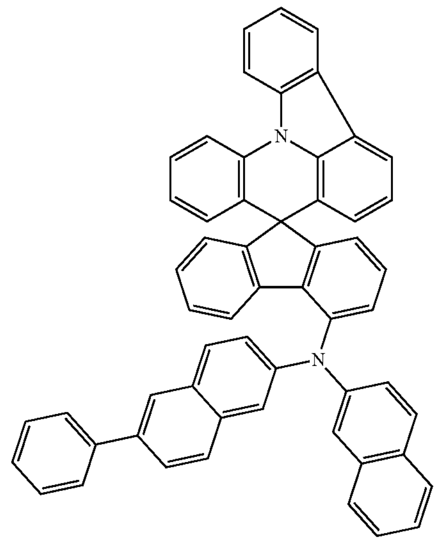
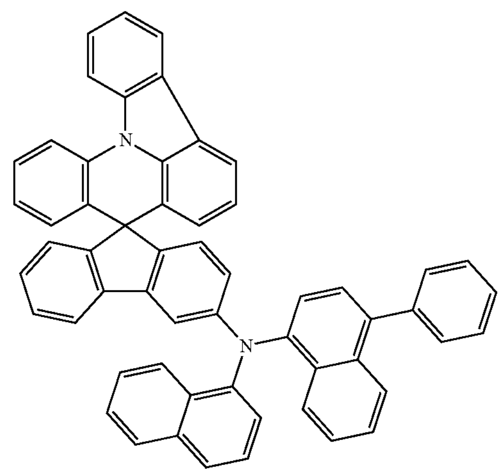
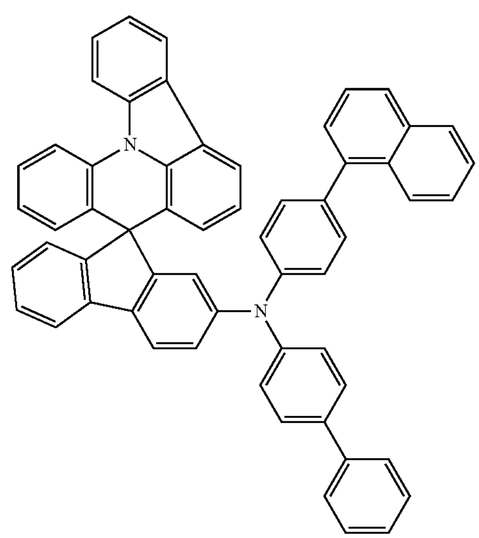

-continued
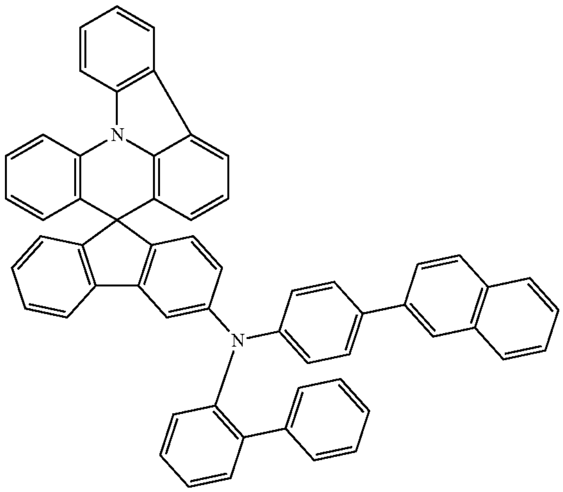
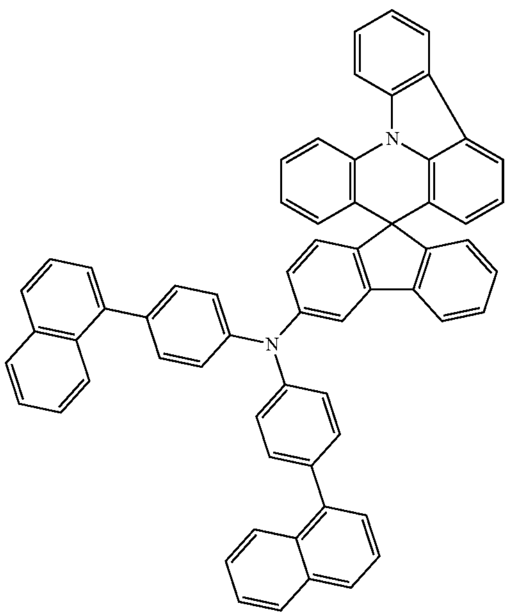
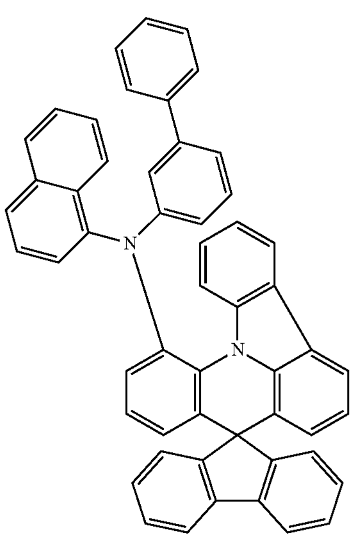
-continued
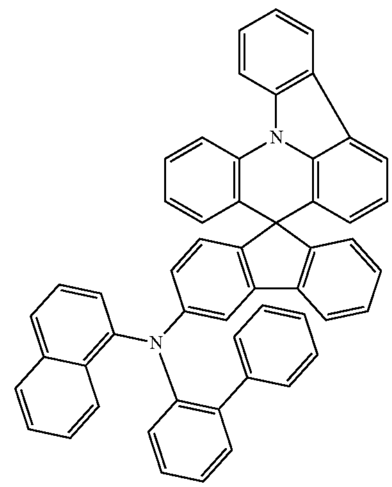
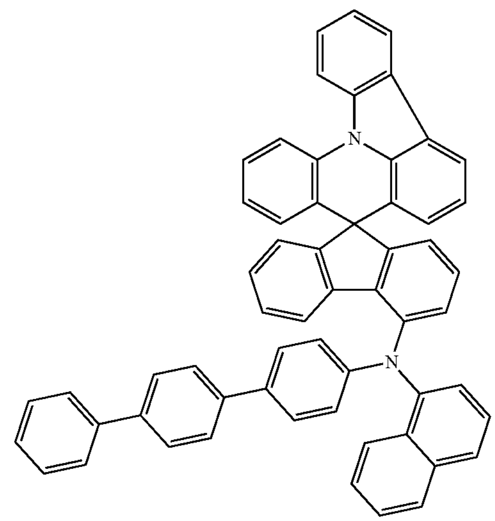
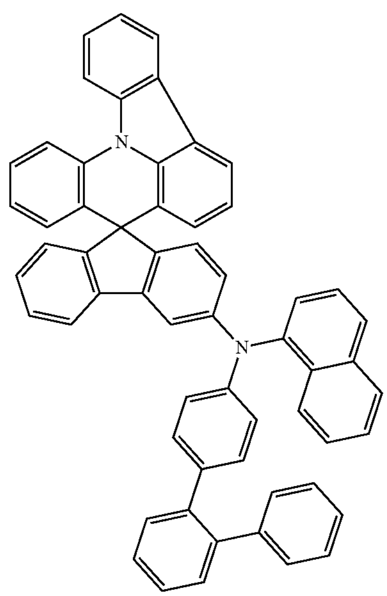

-continued
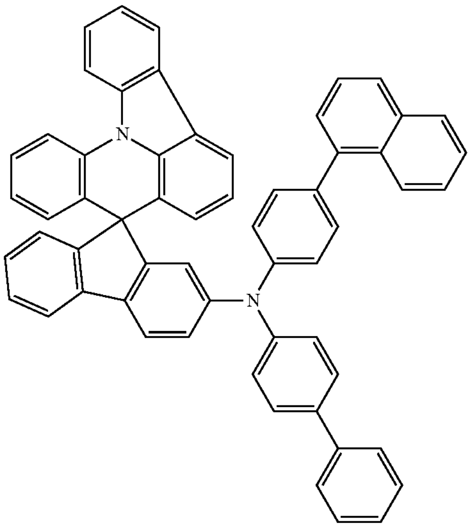
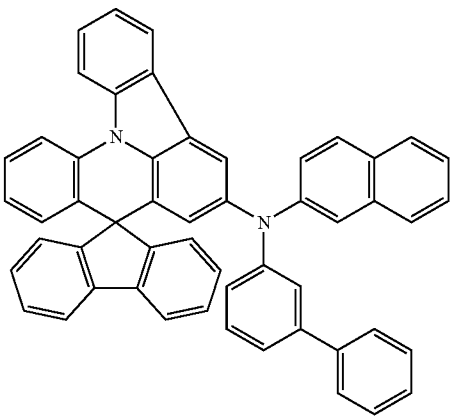
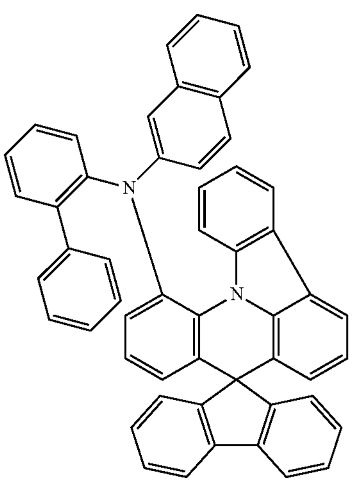
-continued
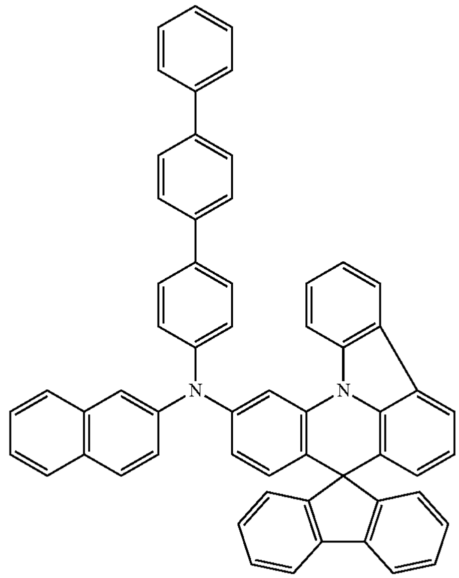
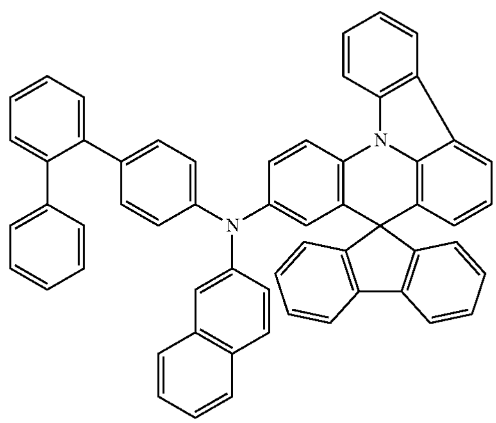
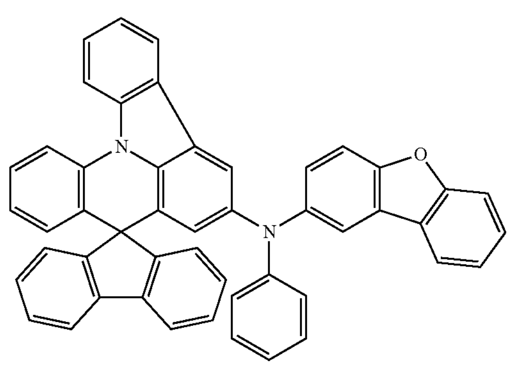

-continued
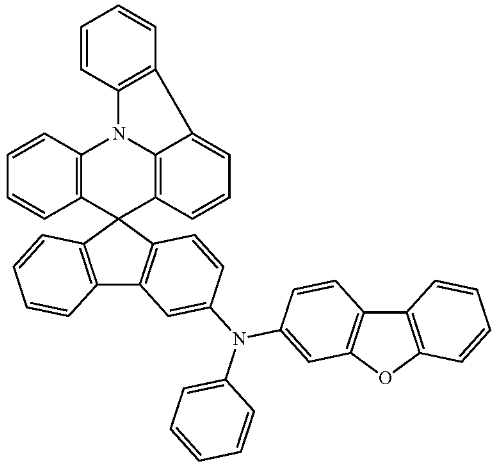
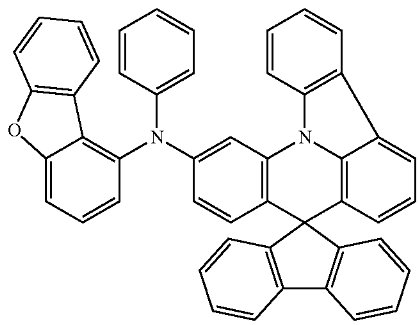
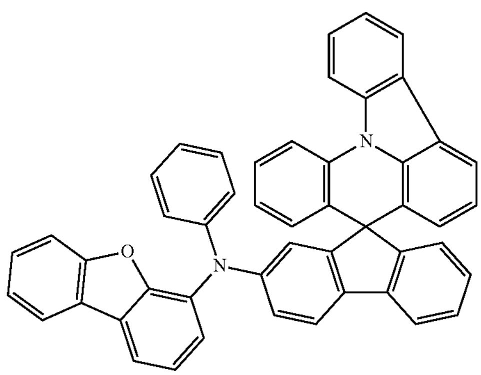
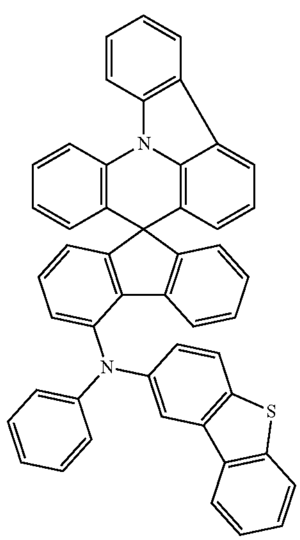
-continued
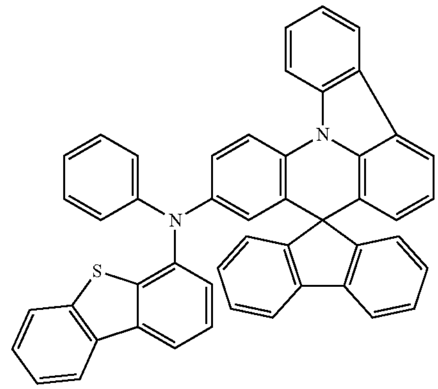
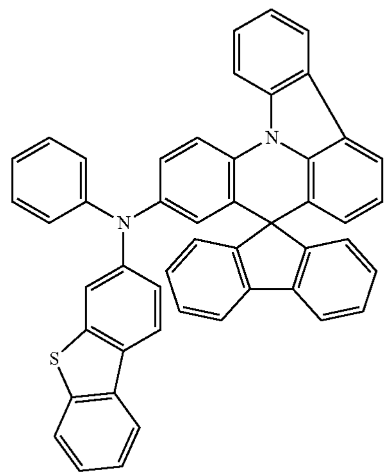
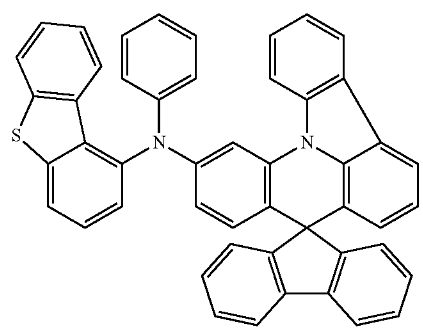
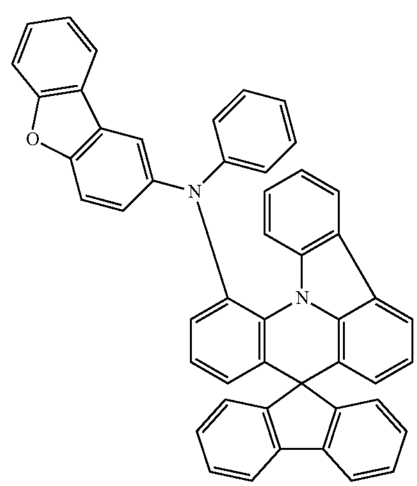

-continued
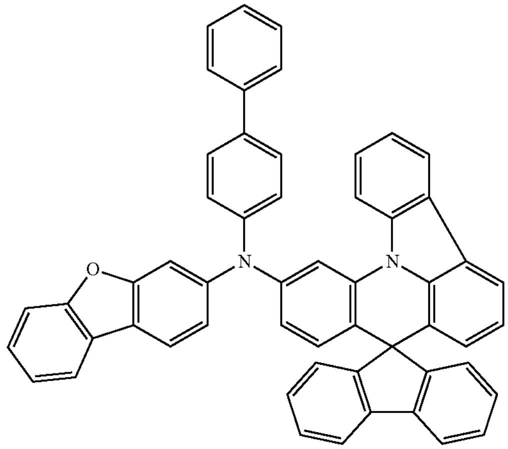
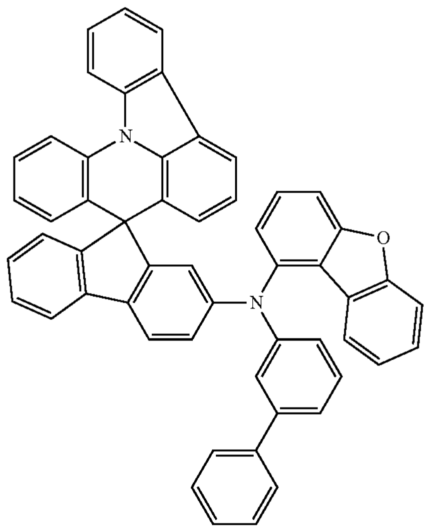
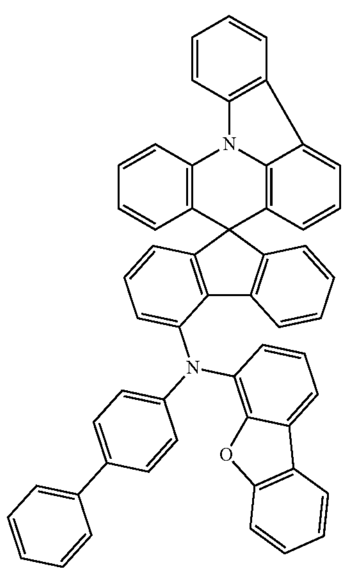
-continued
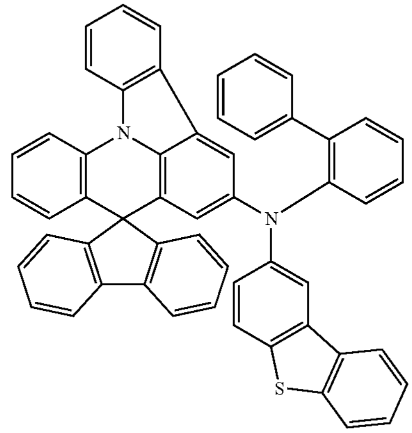
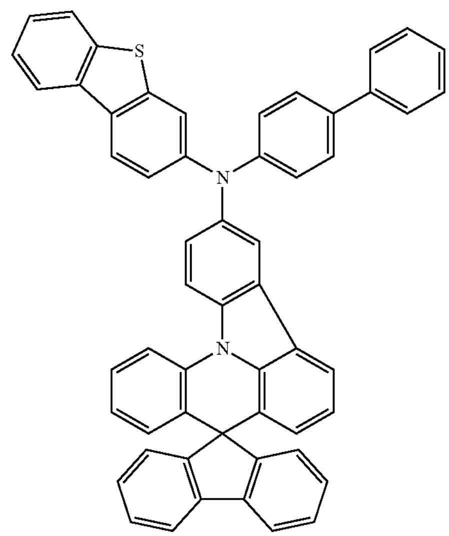
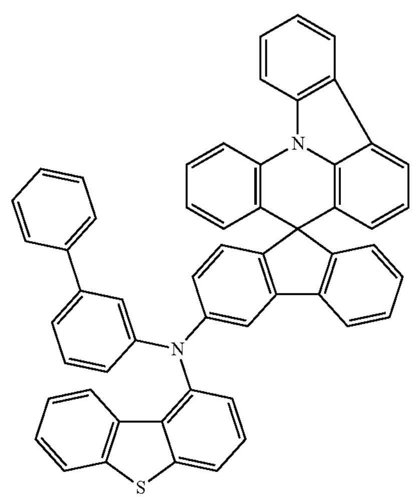

-continued
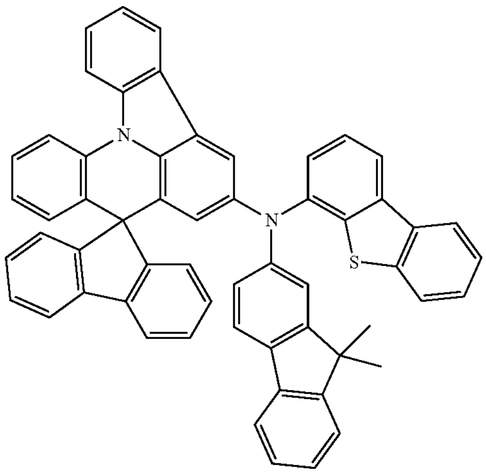
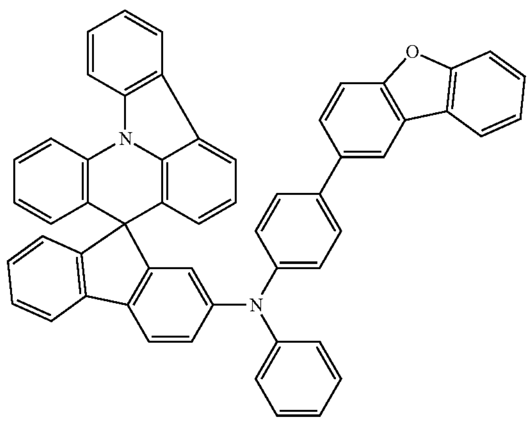
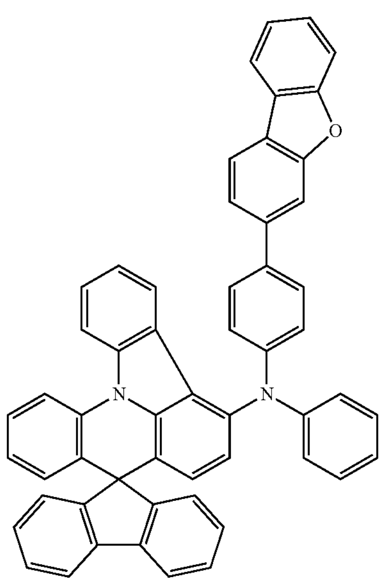
-continued
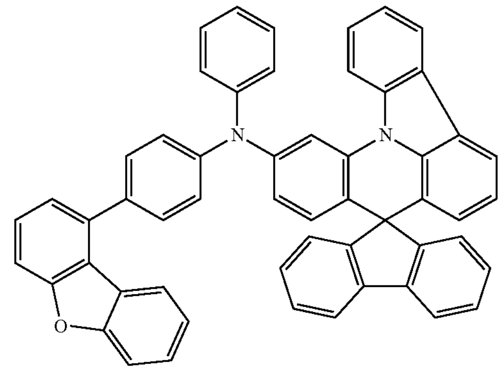
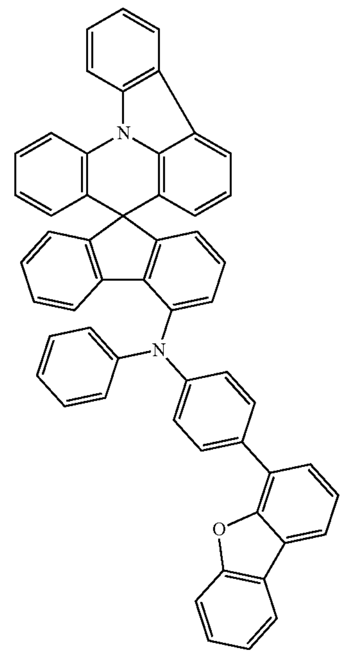
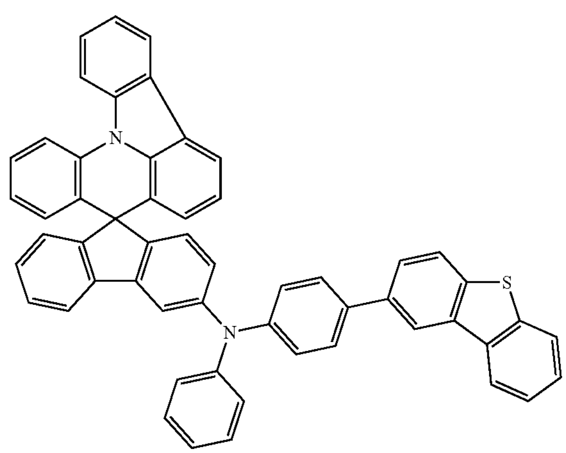

-continued
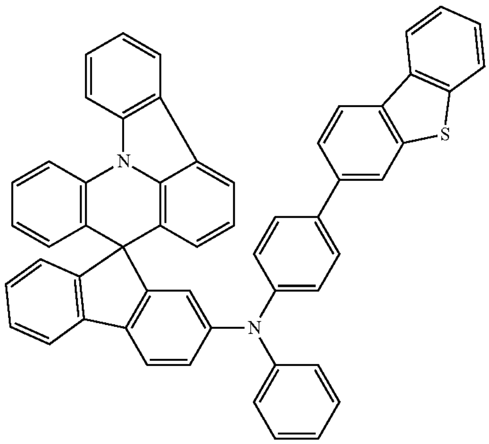
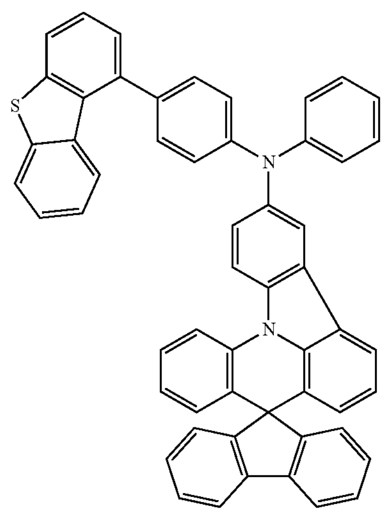
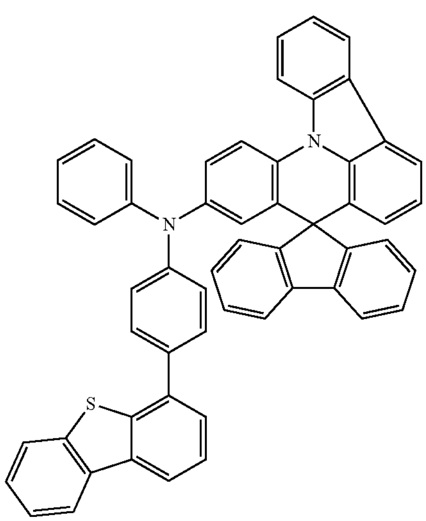
-continued
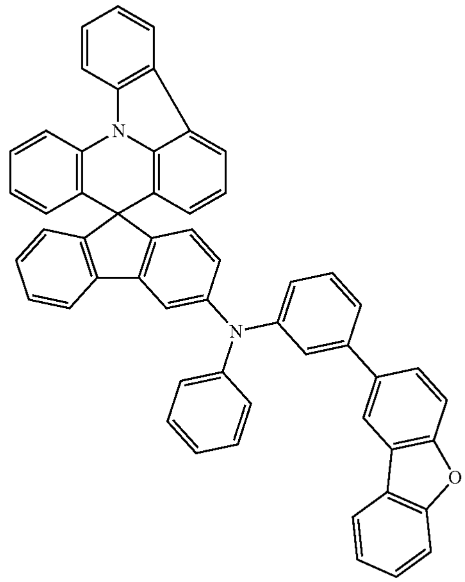
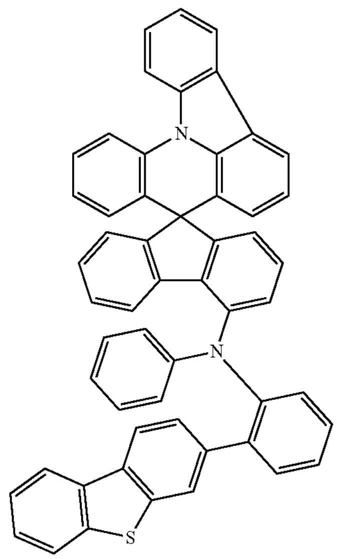
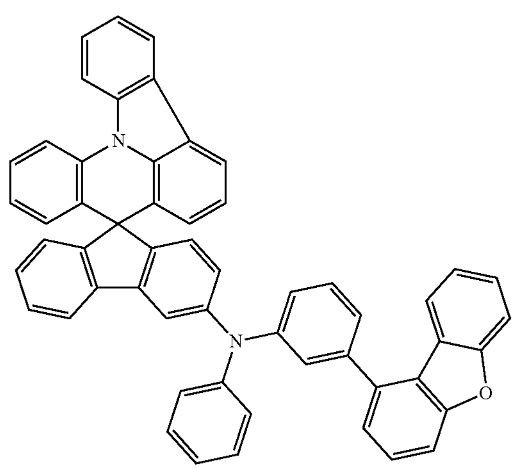

-continued
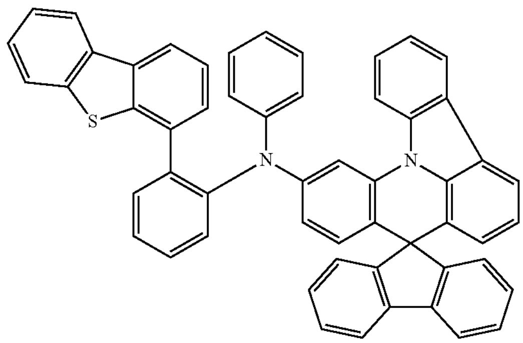
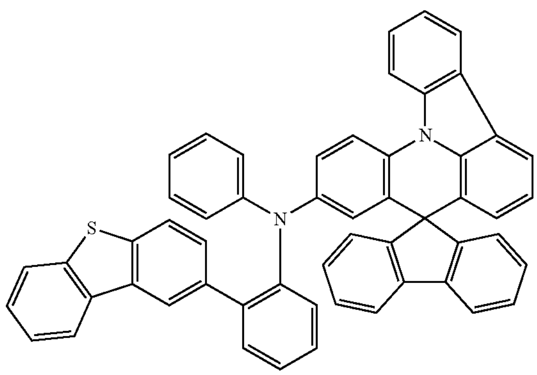
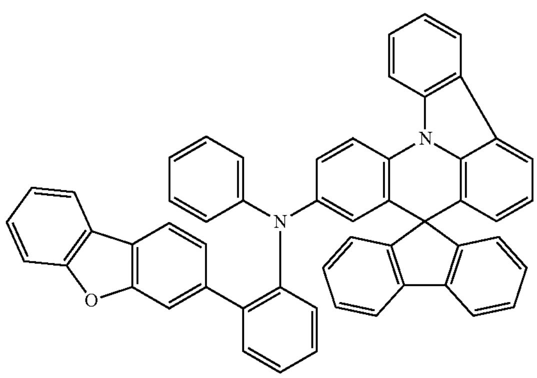
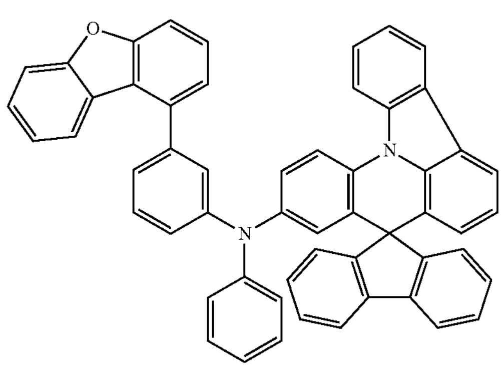
-continued
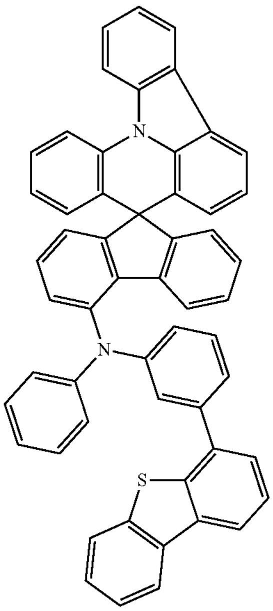
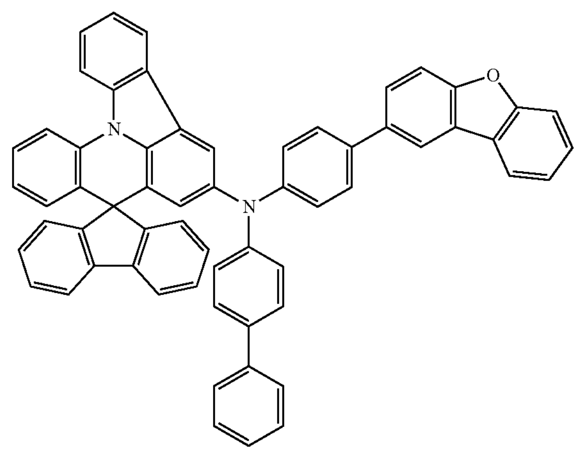
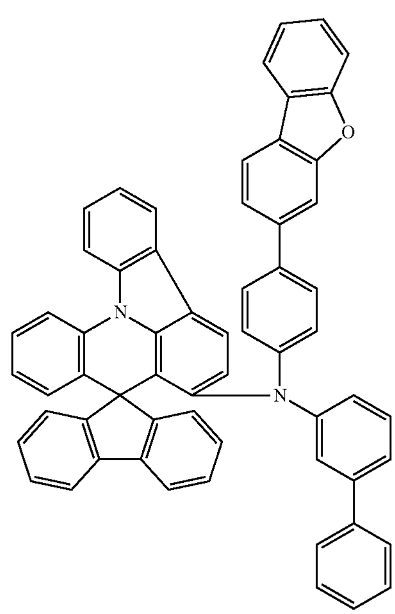

-continued
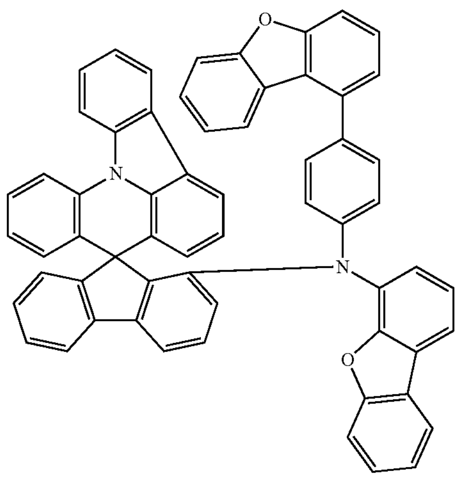
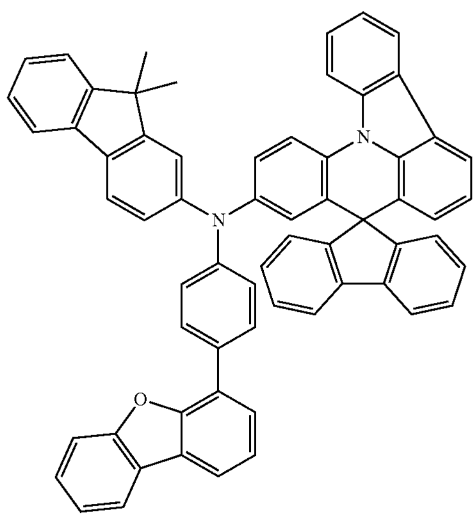
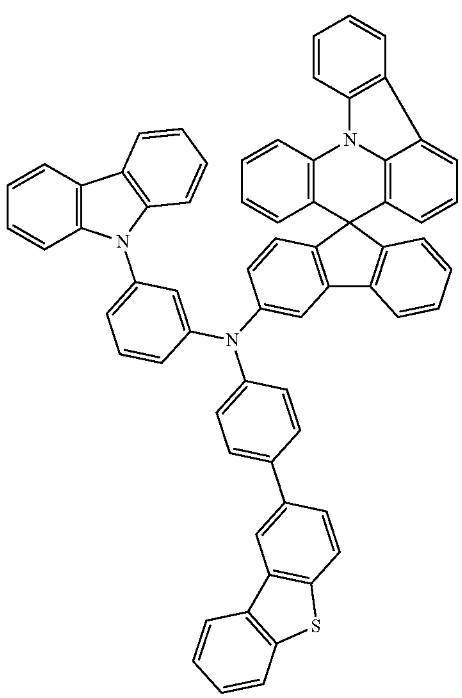
-continued
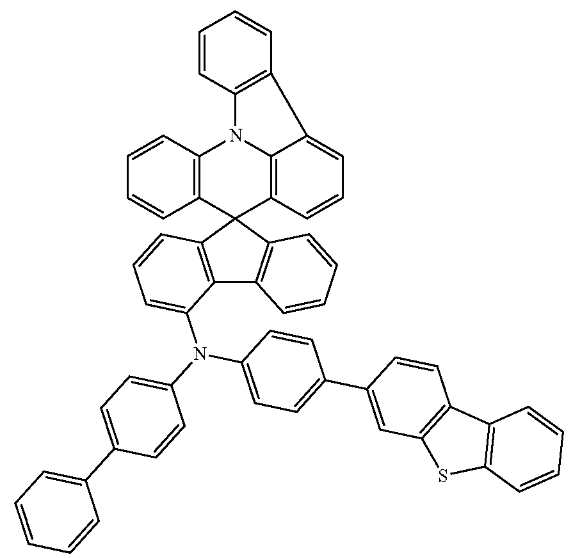
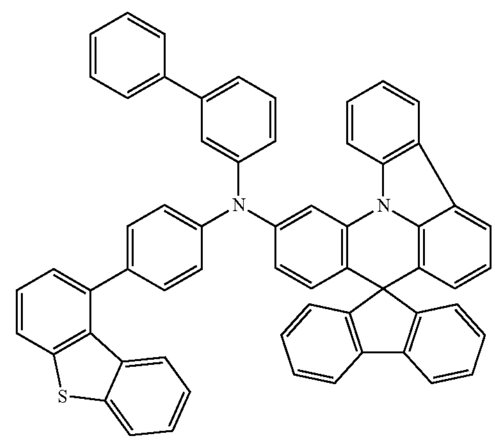
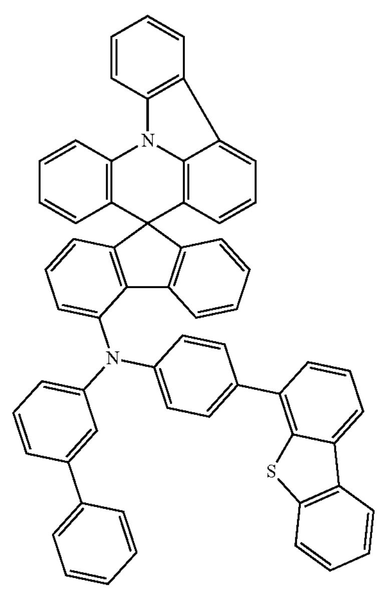

-continued
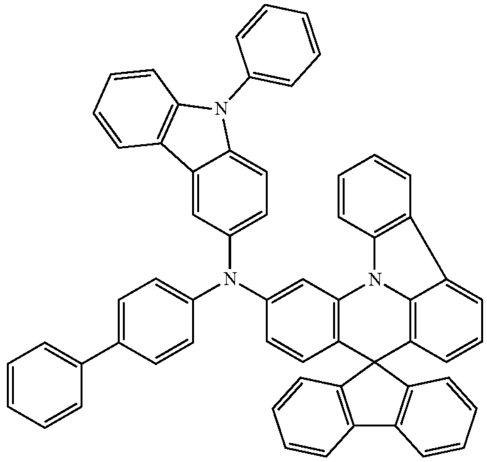
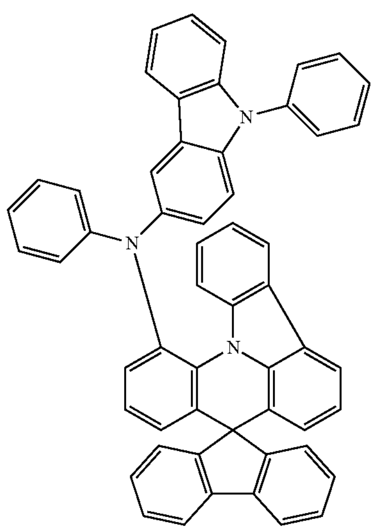
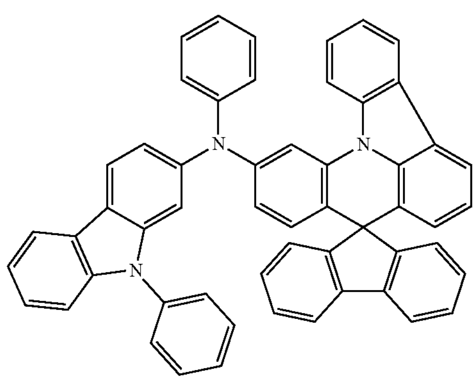
-continued
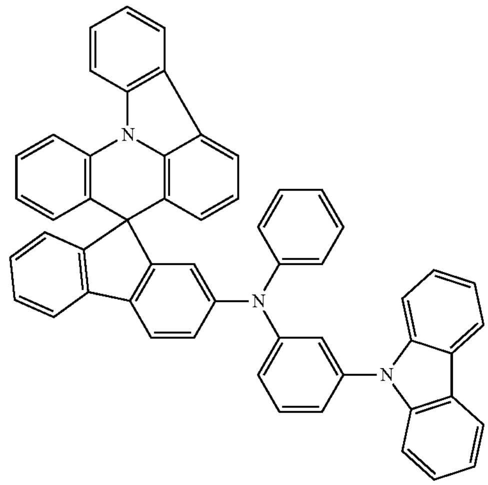
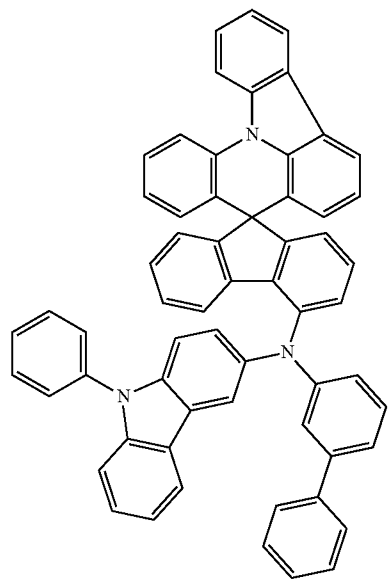
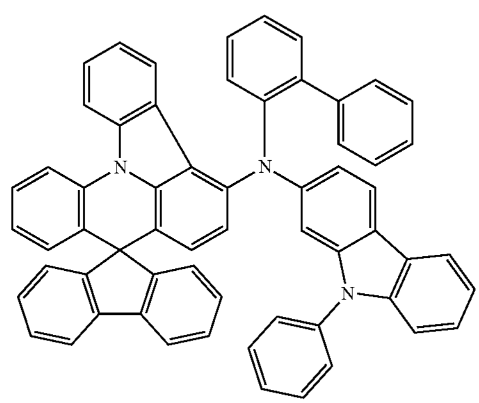

-continued
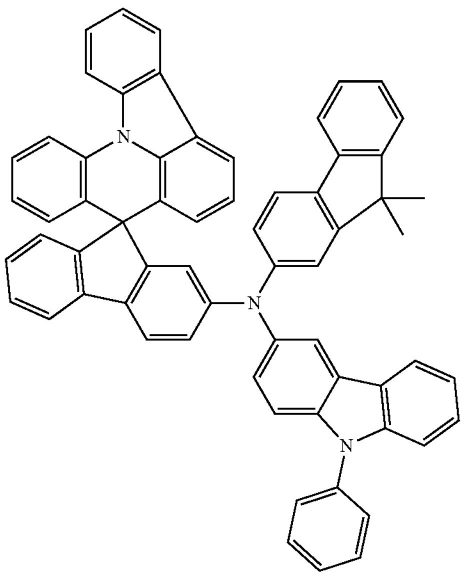
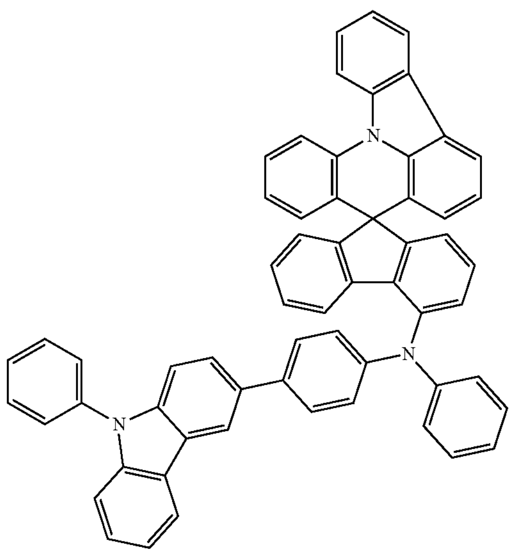
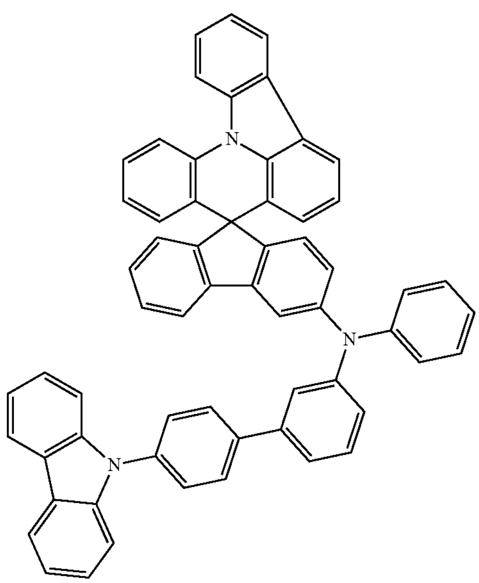
-continued
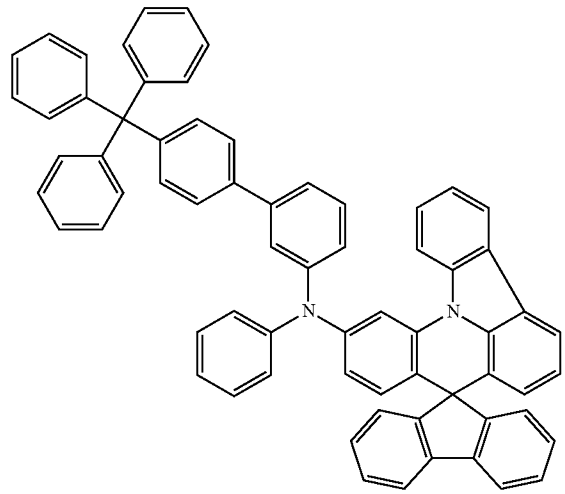
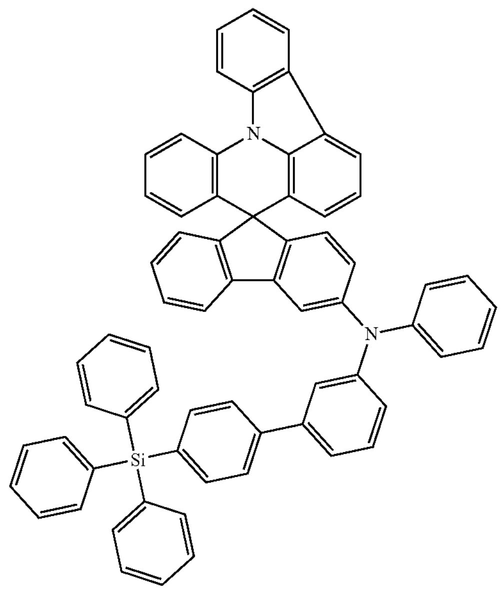
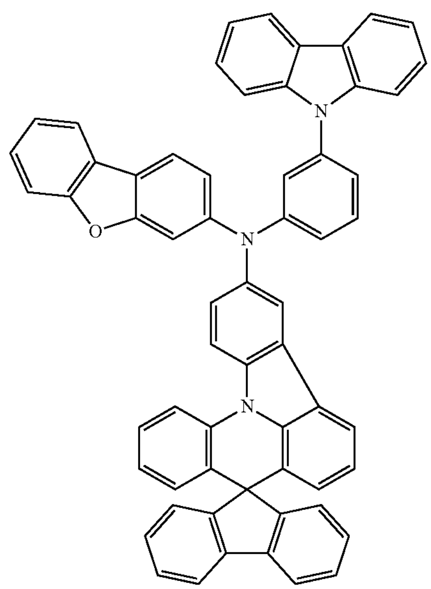

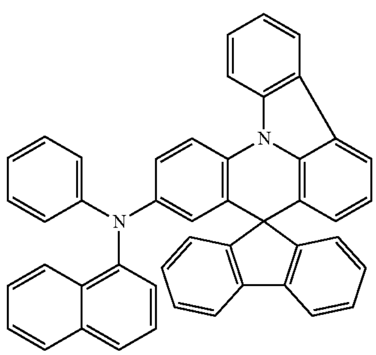
N
N
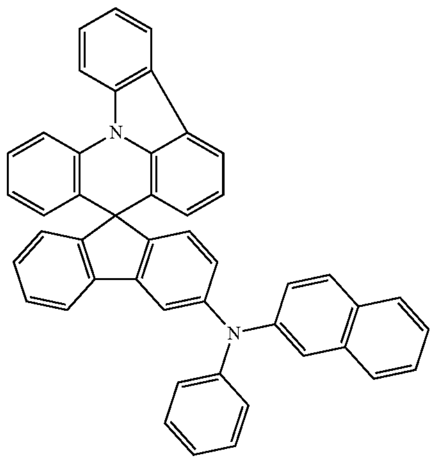
N
N
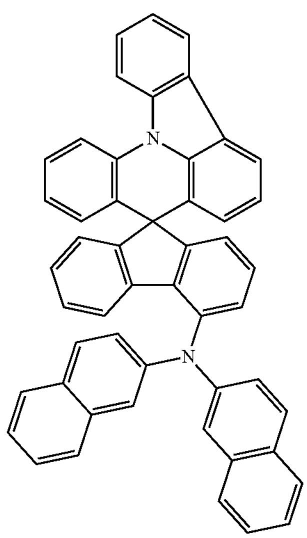
N
N
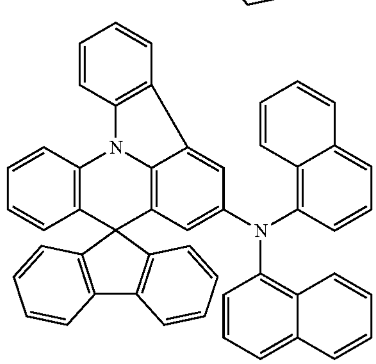
N
N
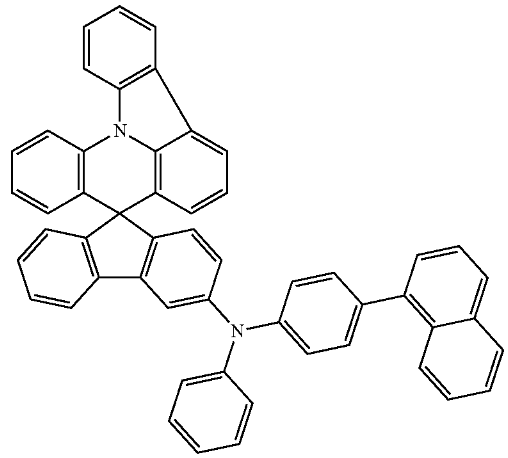
N
N
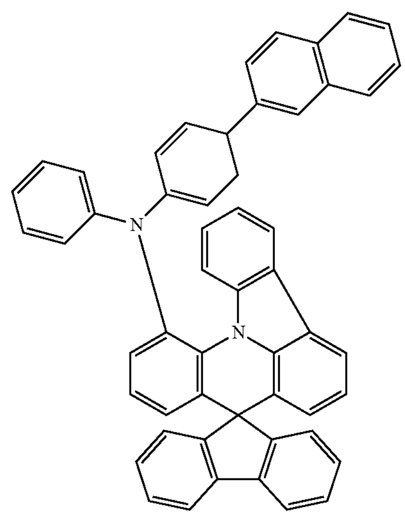
N
N
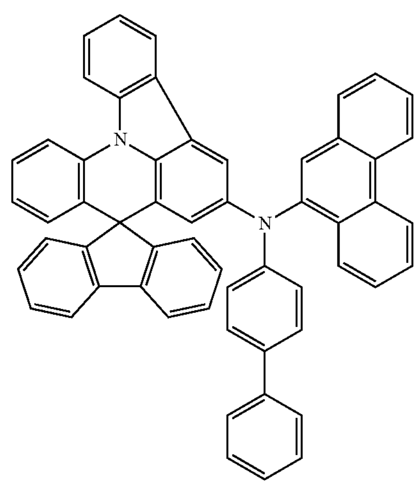
N
N

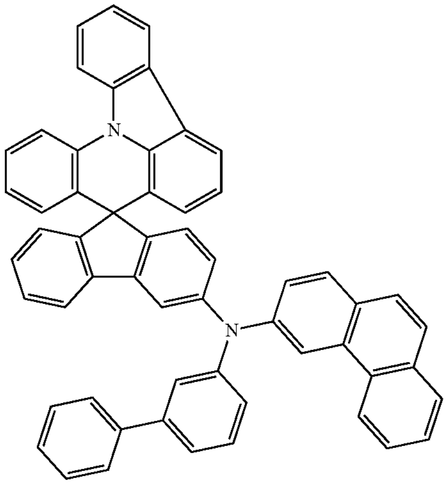
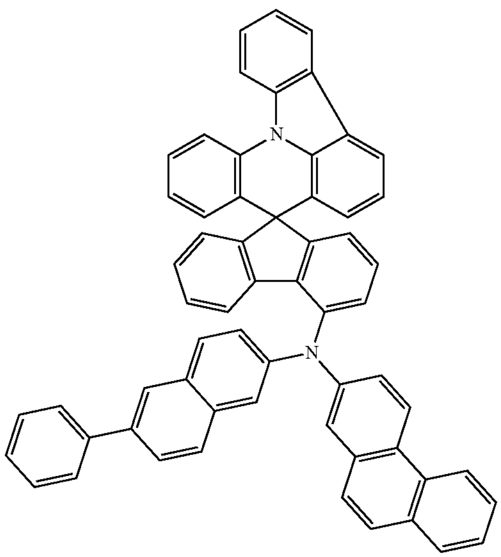
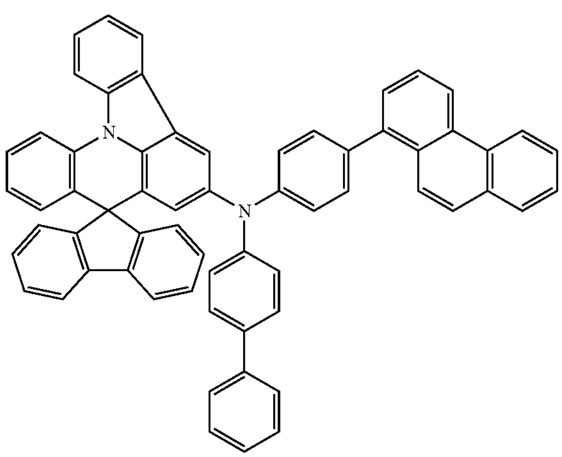
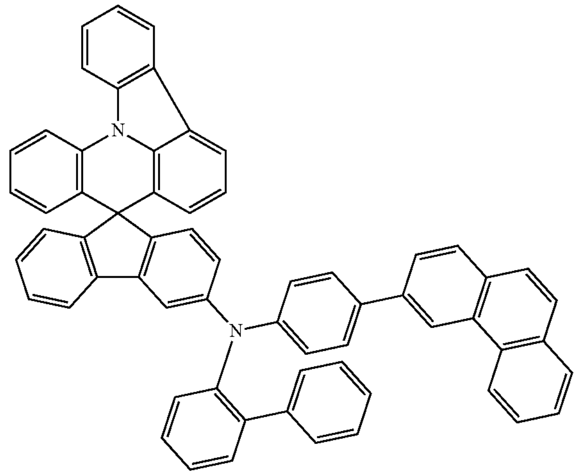
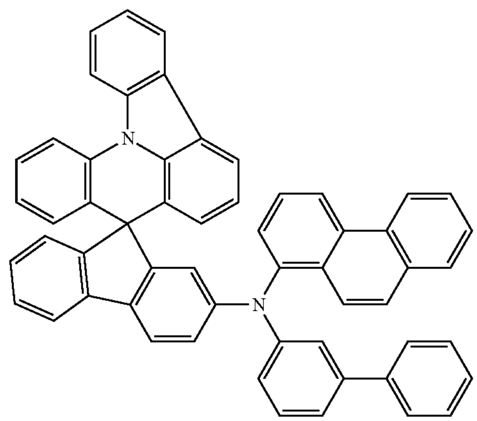
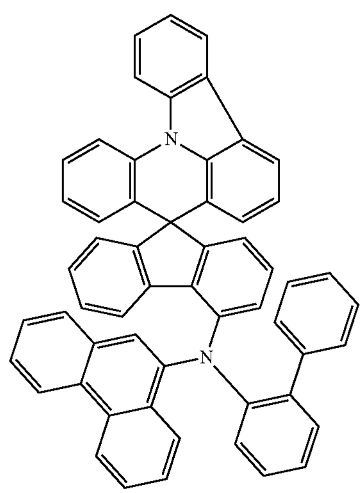

-continued
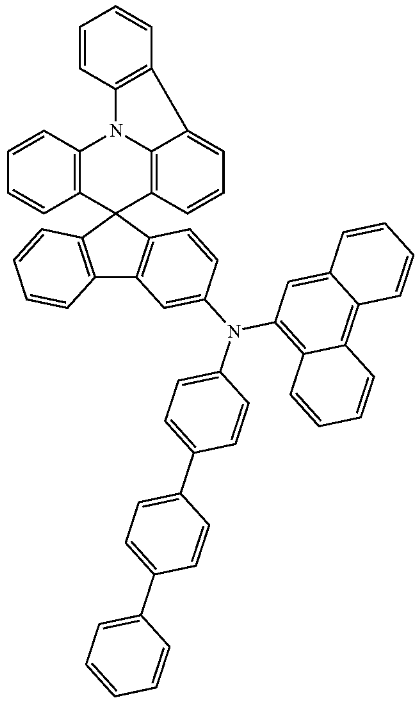
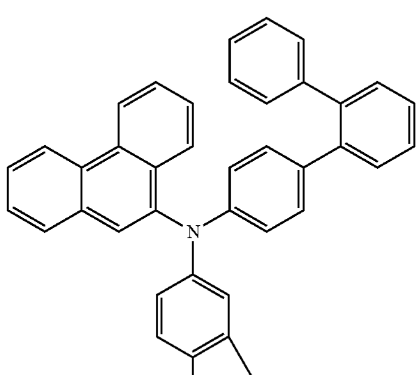
-continued
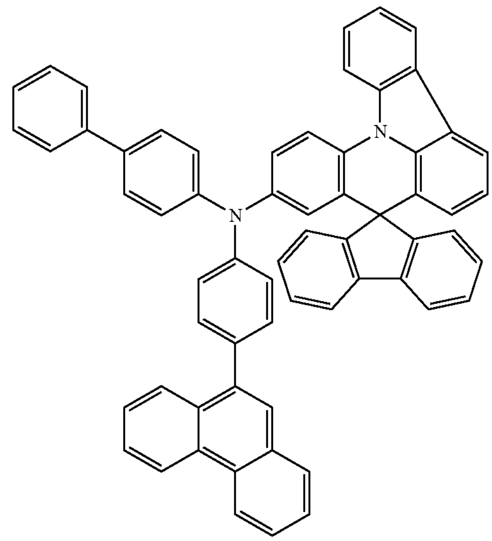
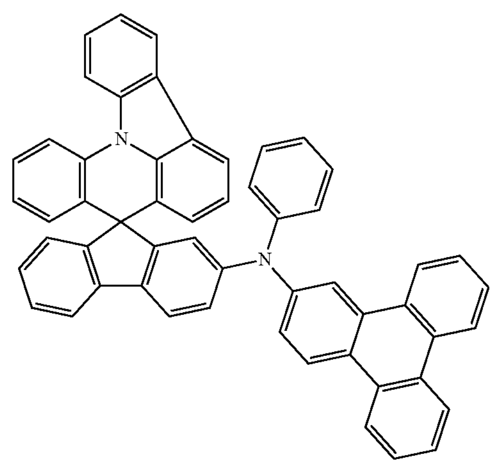
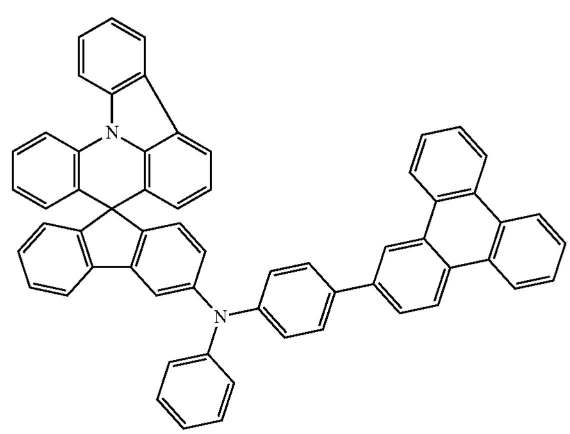

-continued
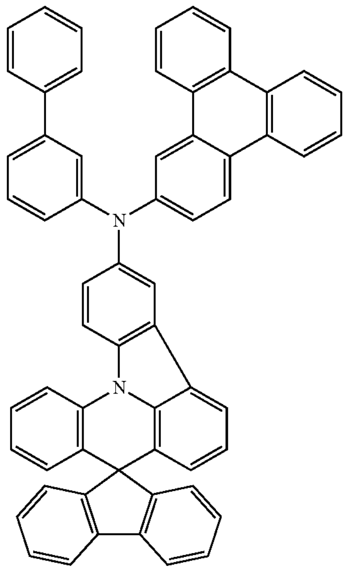
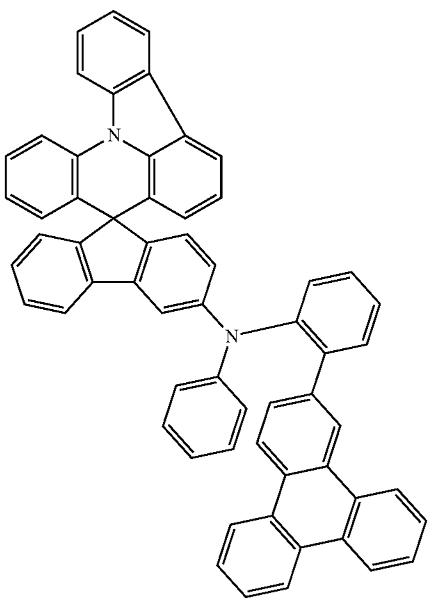
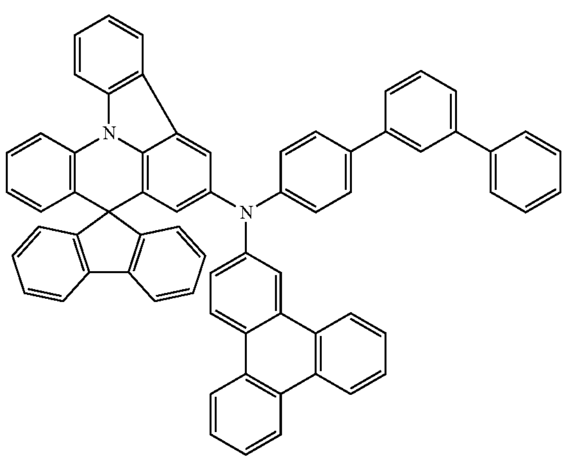
-continued
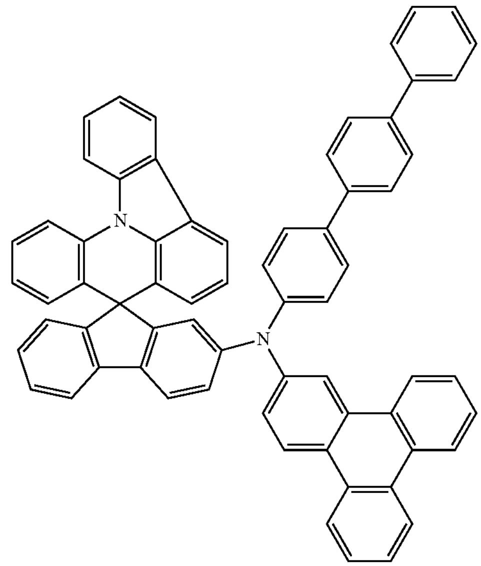
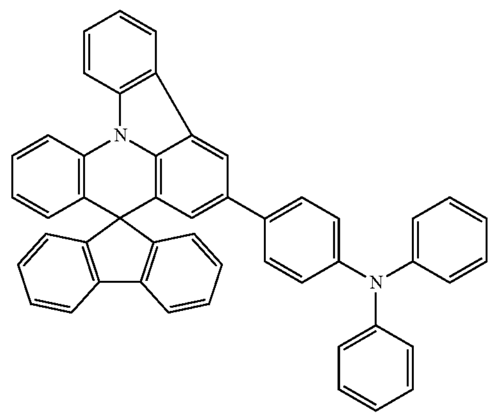
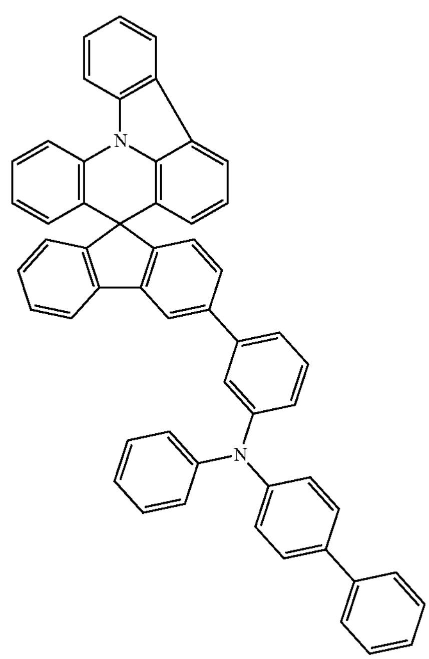

-continued
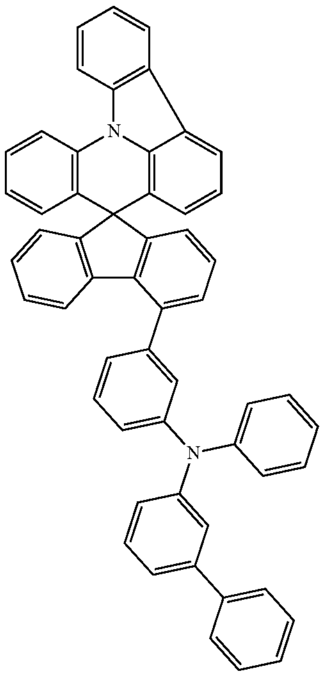
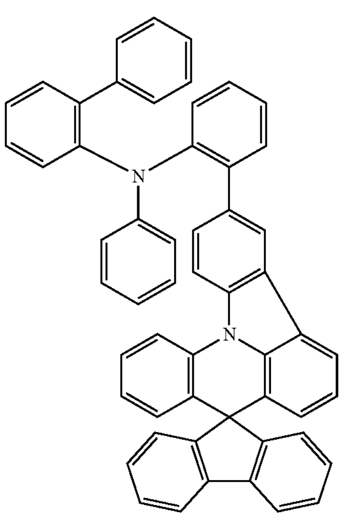
-continued
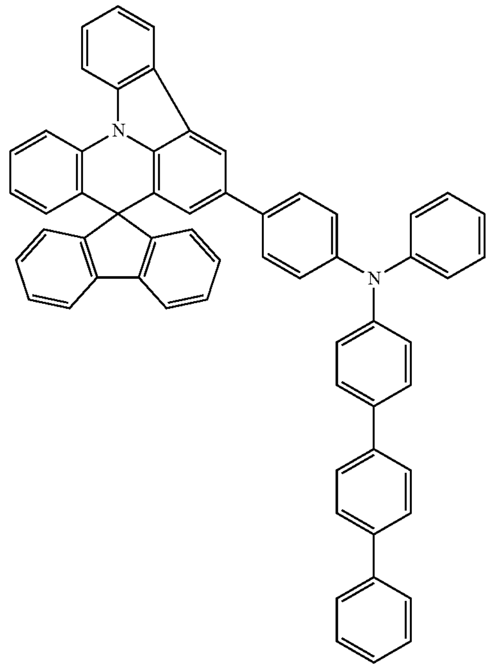
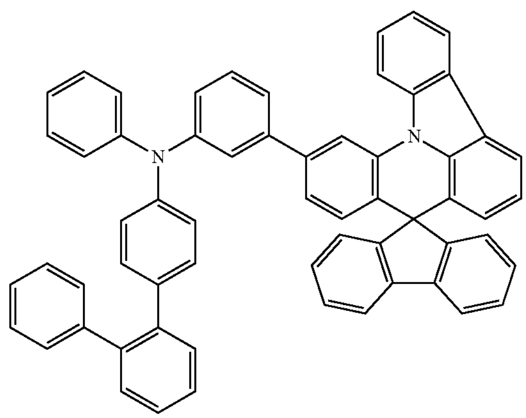
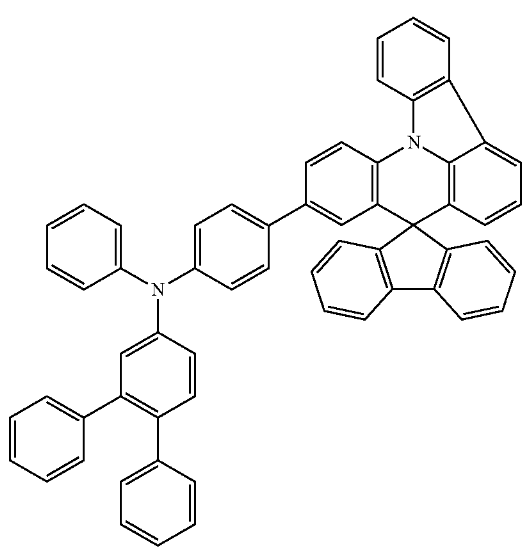

-continued
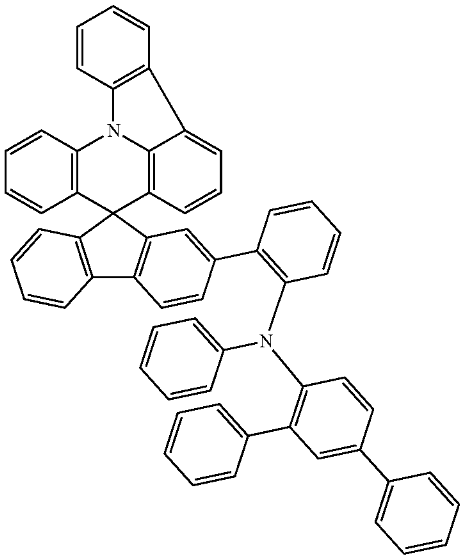
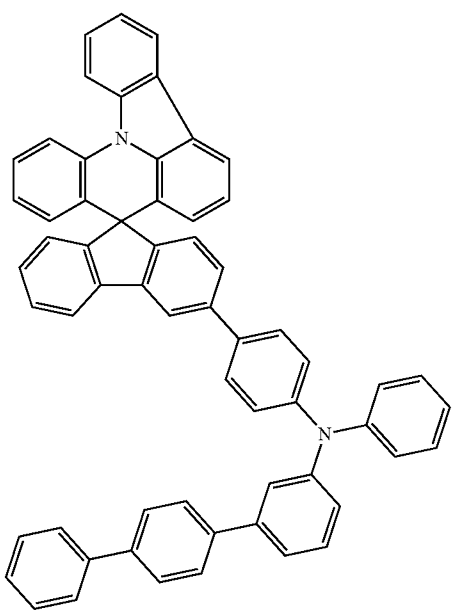
-continued
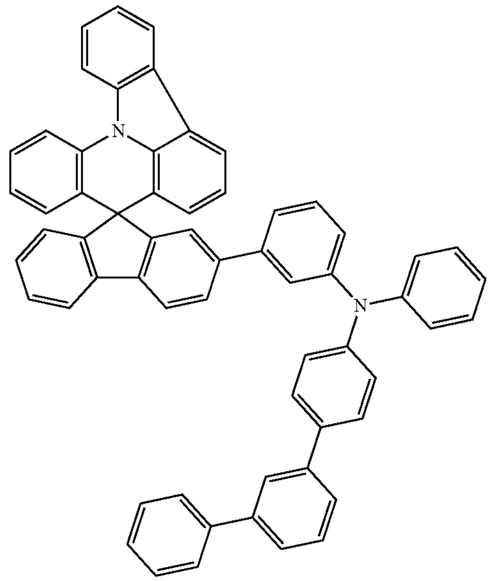
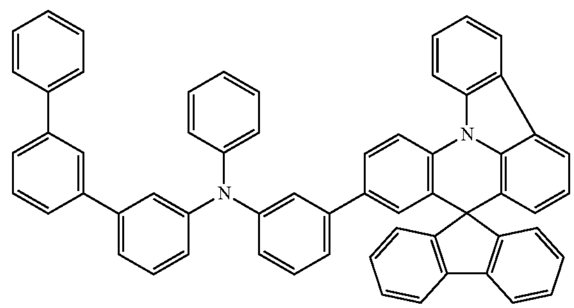
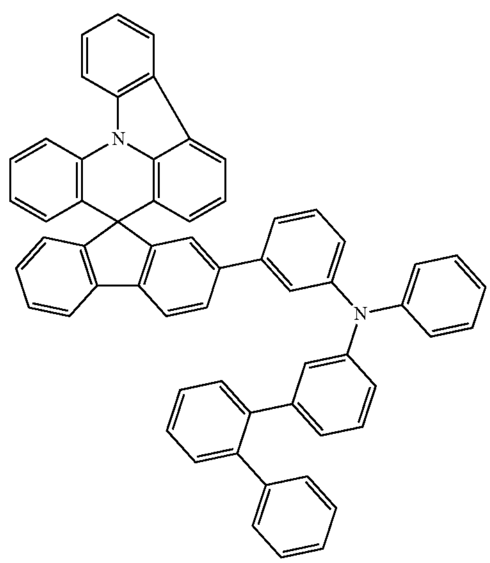

-continued
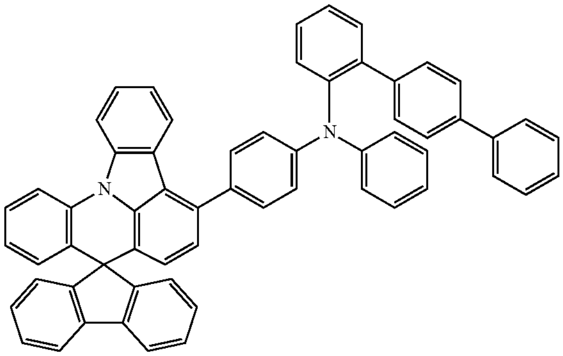
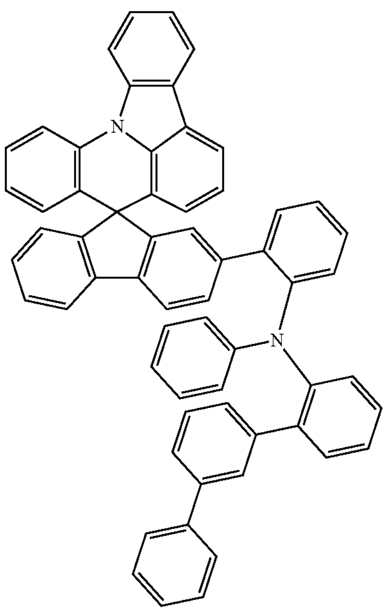
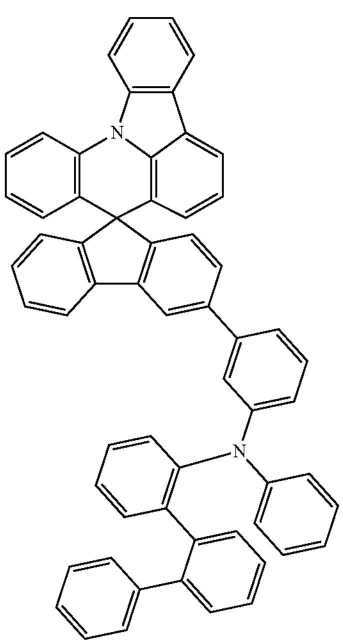
-continued
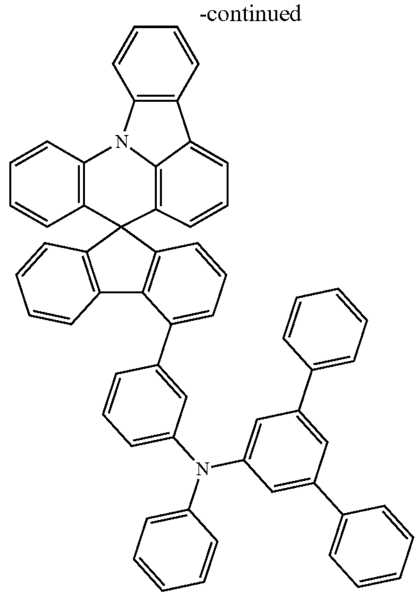
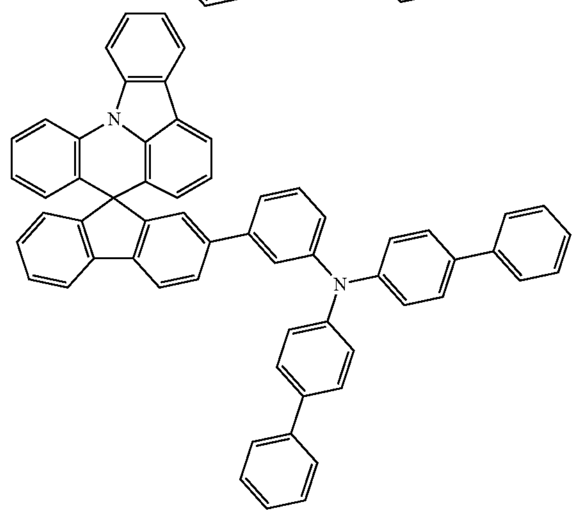
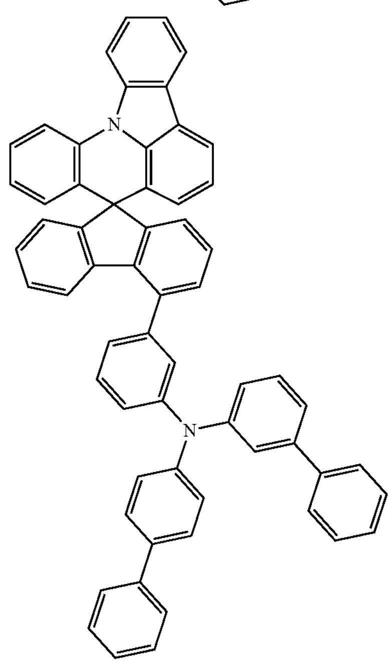

-continued
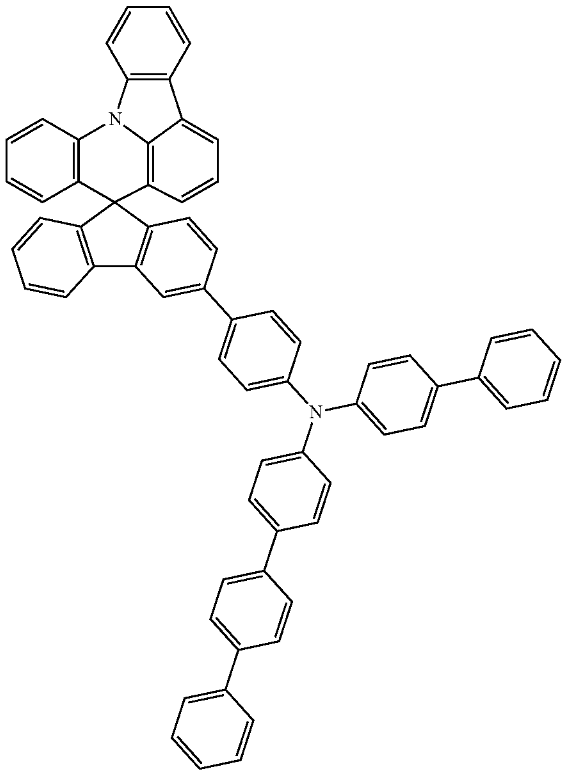
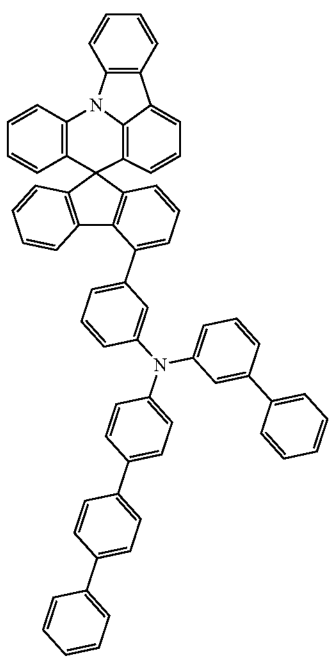
-continued
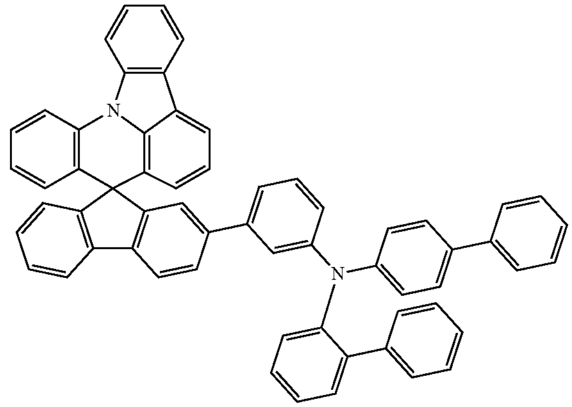
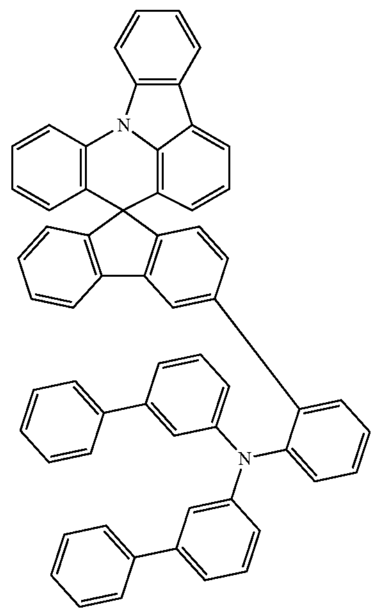
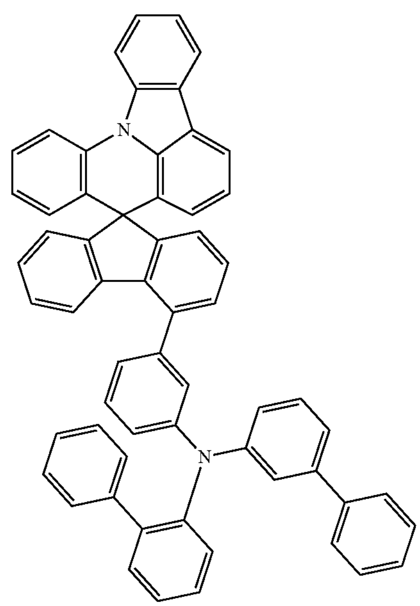 [SMILES: c1ccc(-c2cccc(N(c3cccc(-c4cccc5c4-c4ccccc4C54c5ccccc5-n5c6ccccc6c6cccc4c65)c3)c3ccccc3-c3ccccc3)c2)cc1]

-continued
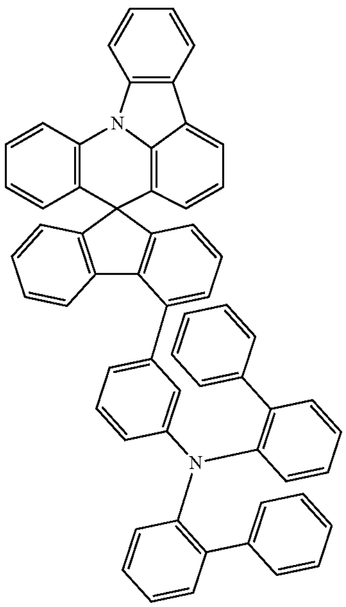
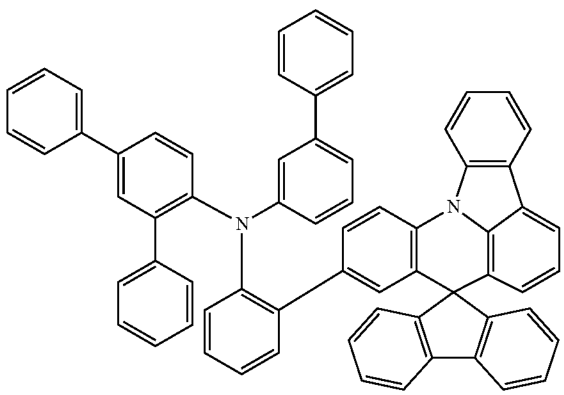
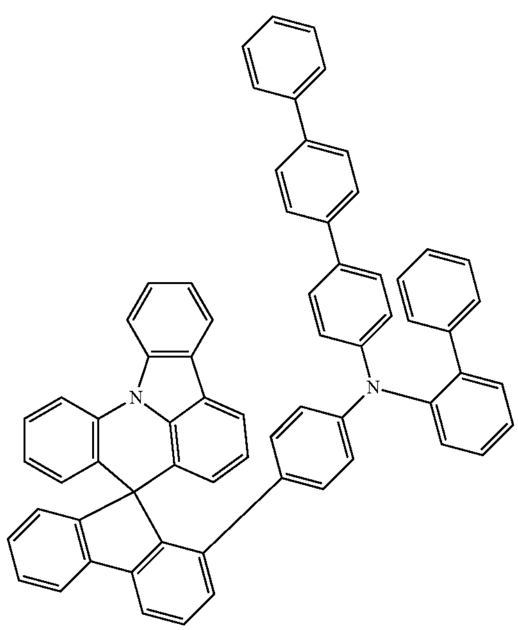
-continued
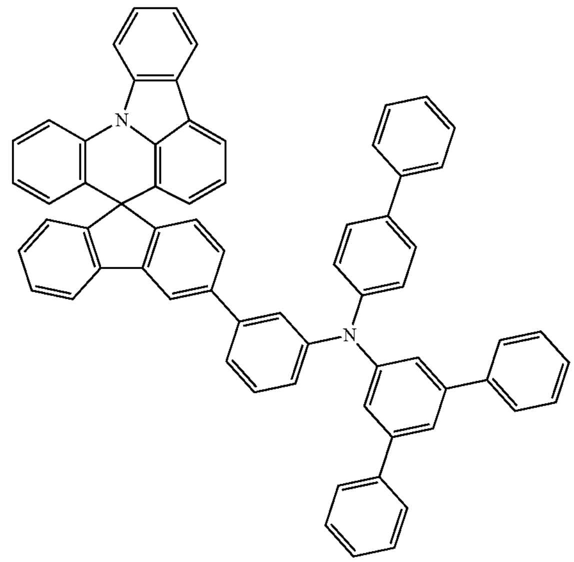
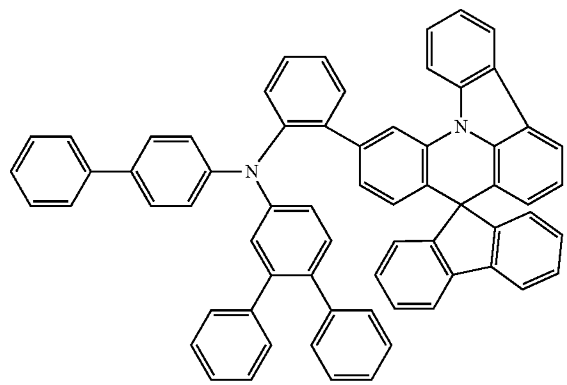
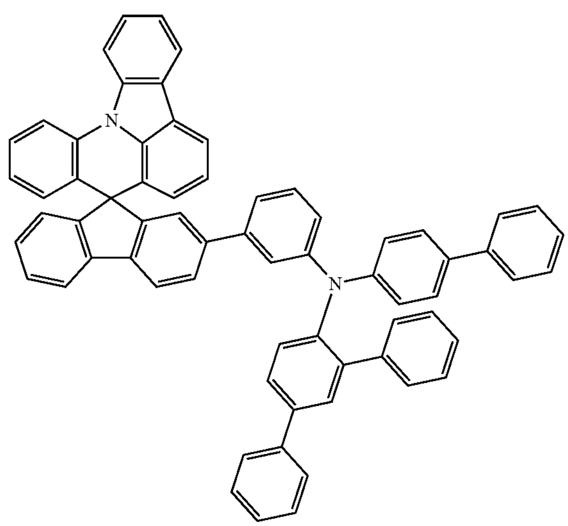

-continued
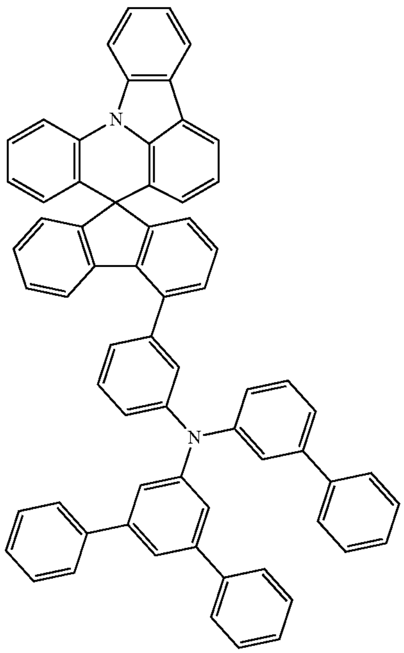
-continued
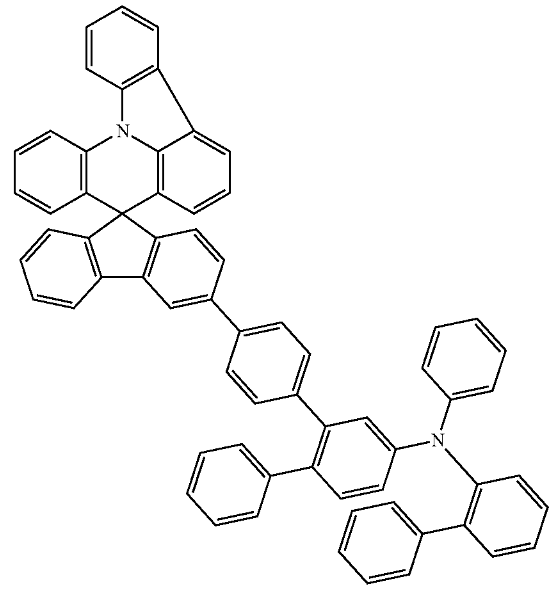
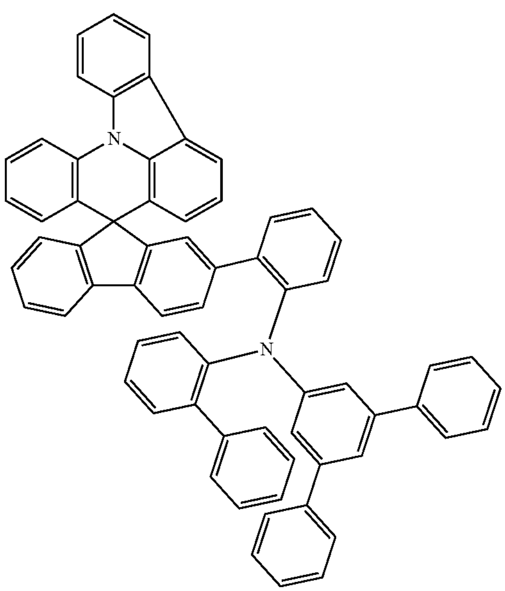
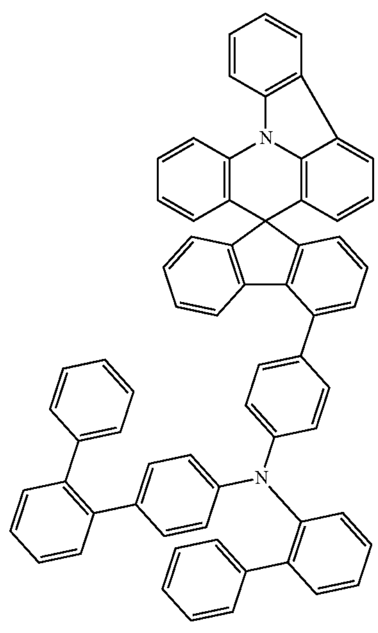

-continued
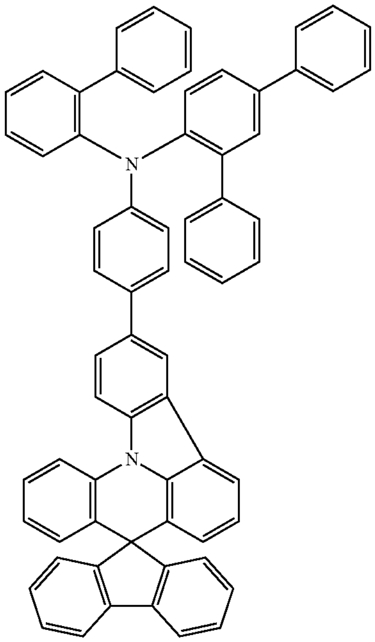
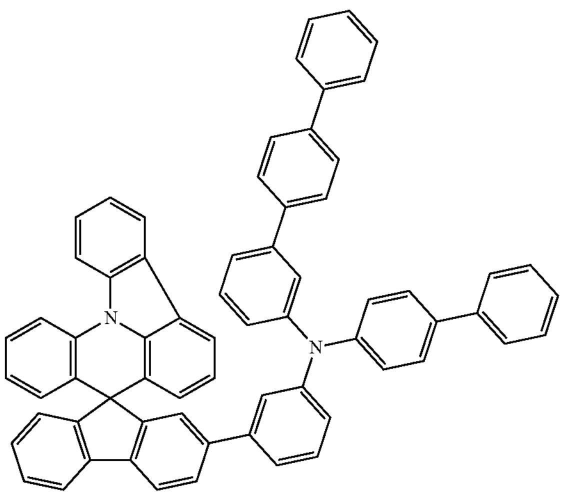
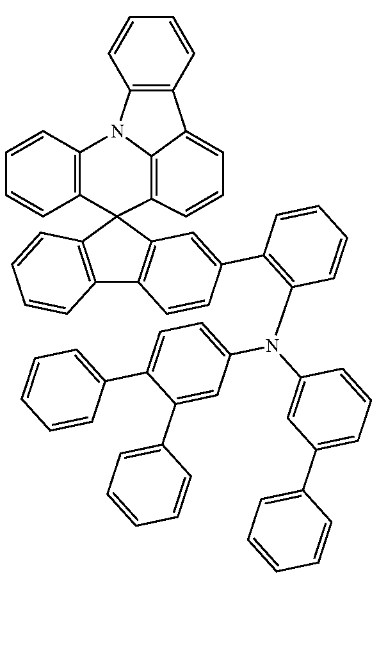
-continued
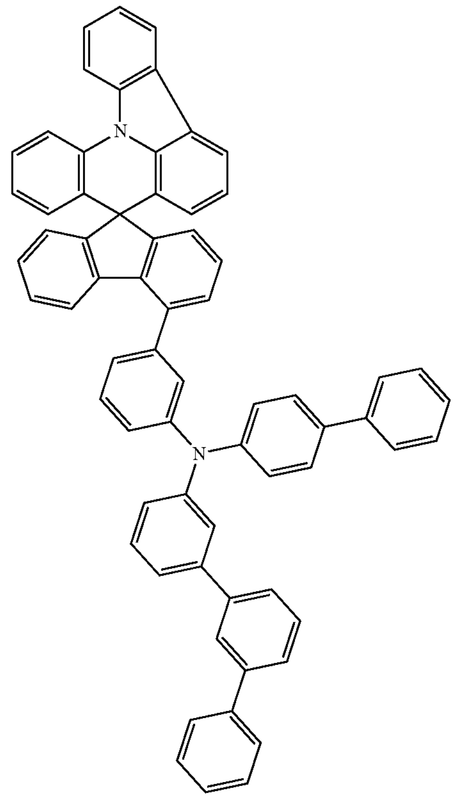
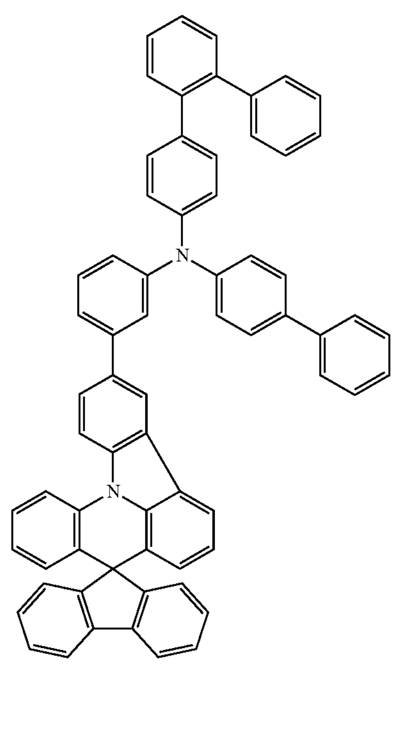

-continued
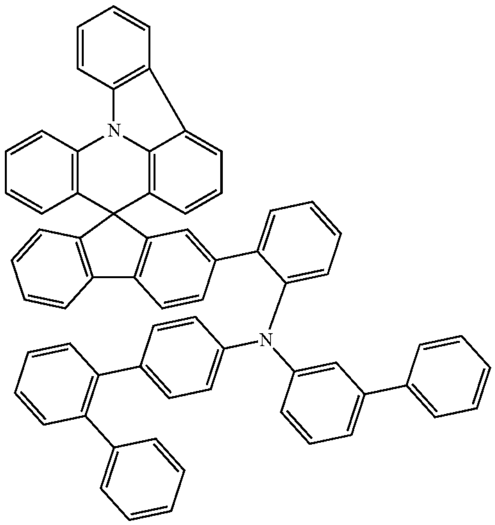
-continued
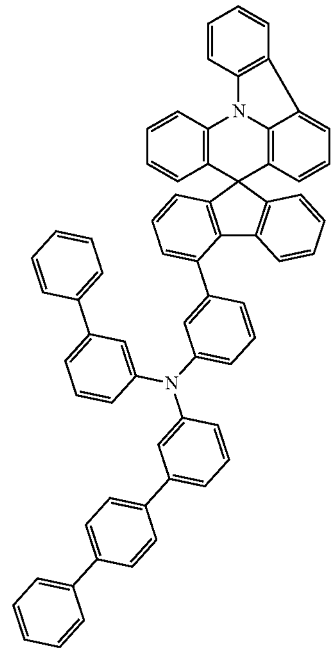
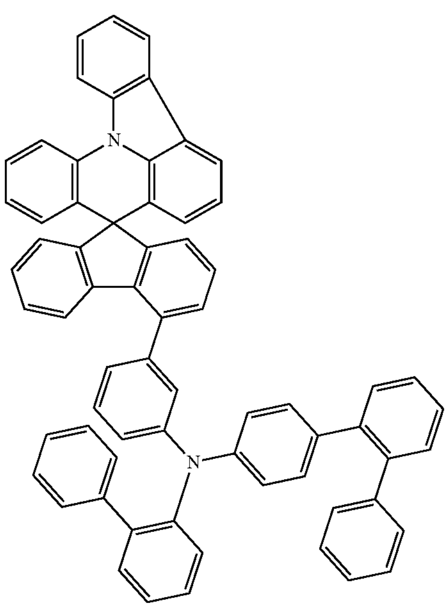
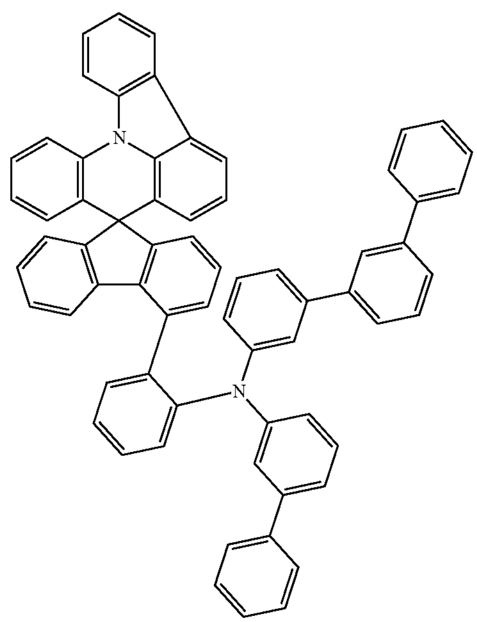

-continued
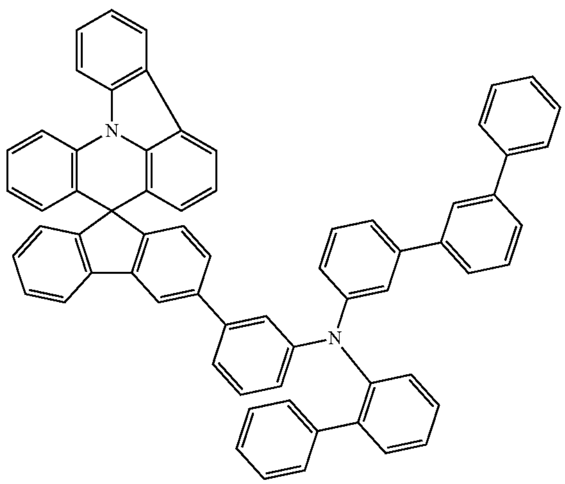
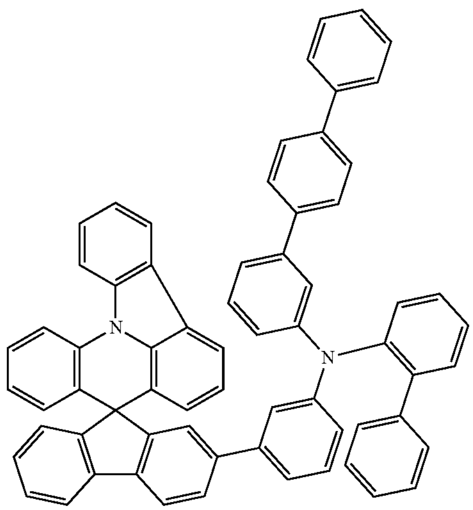
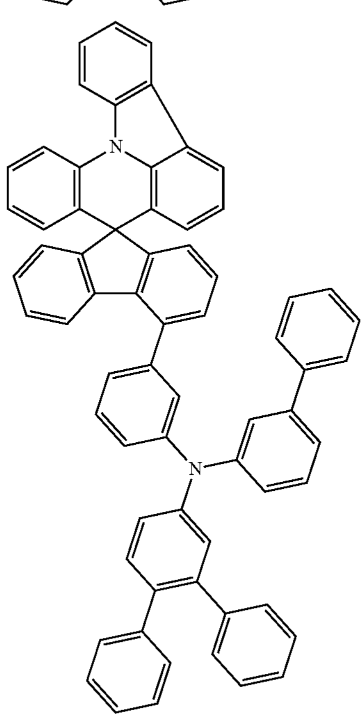
-continued
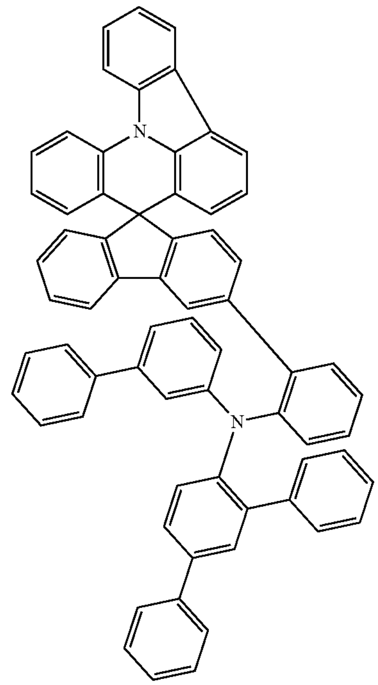
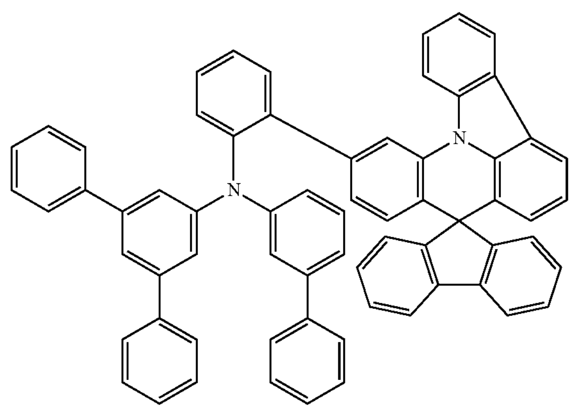
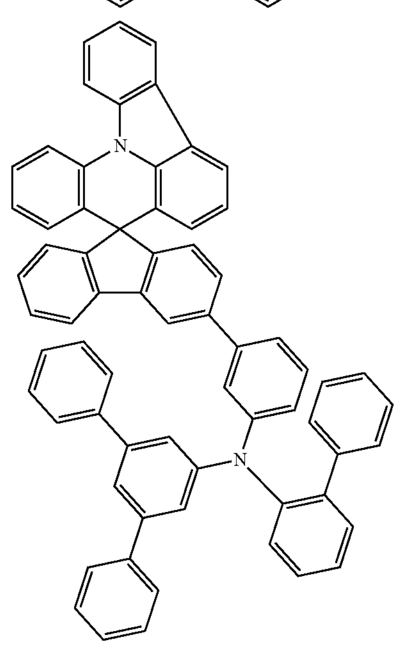

-continued
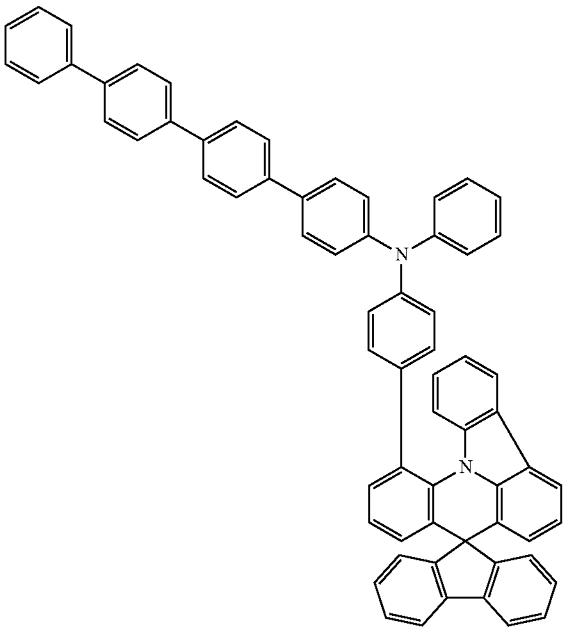
-continued
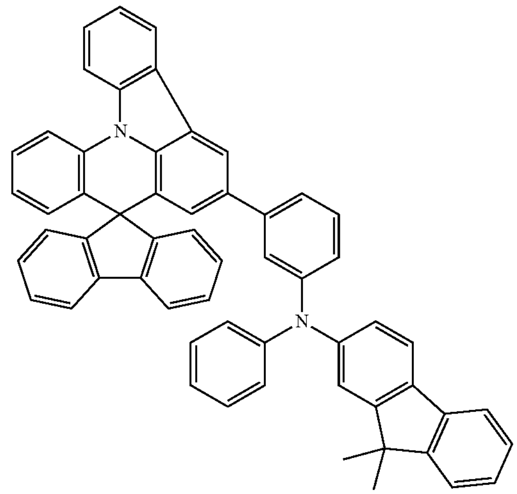
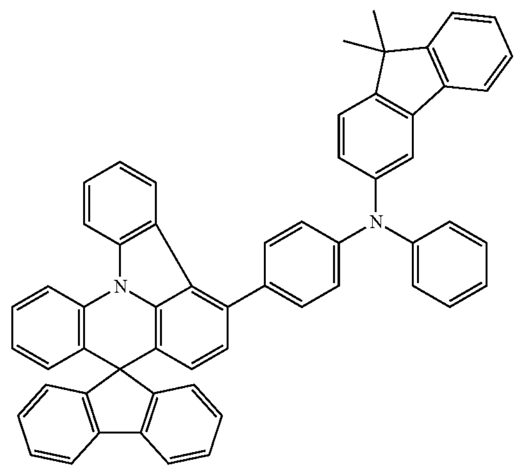
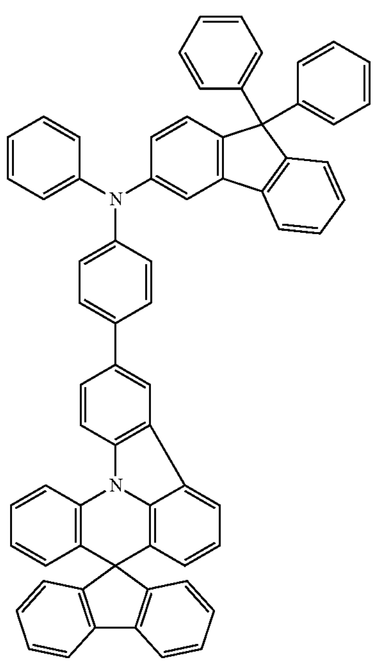
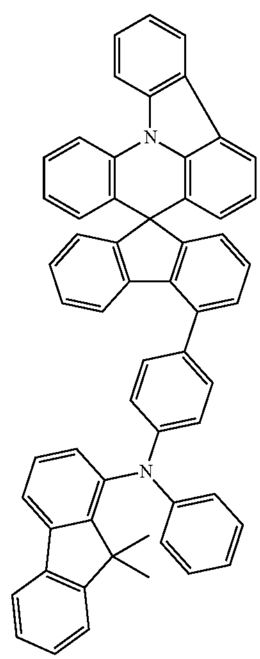

-continued
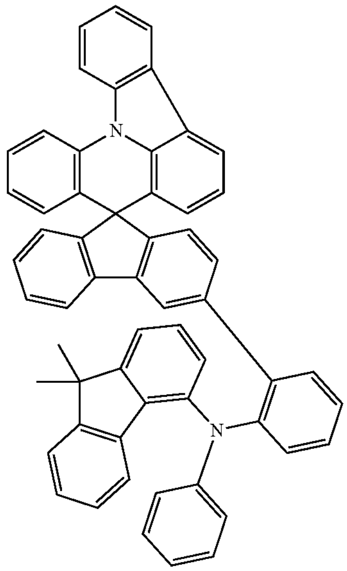
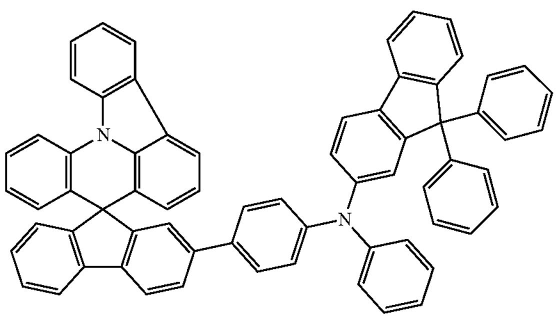
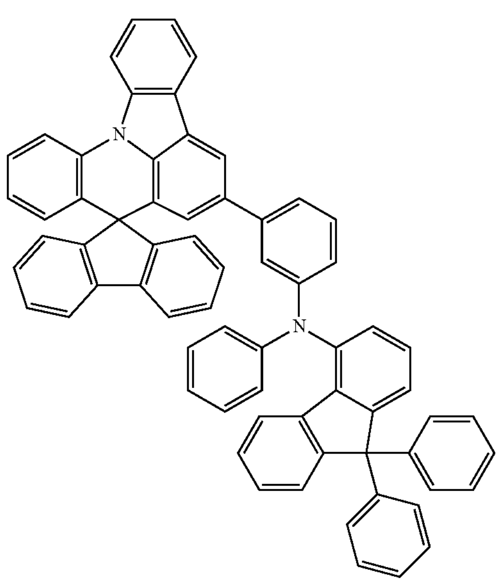
-continued
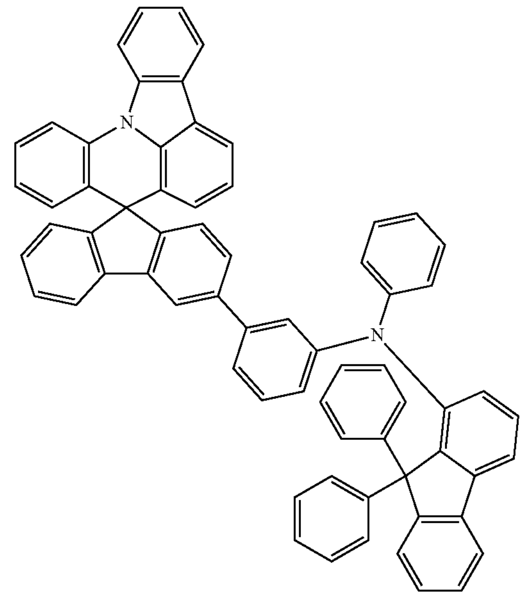
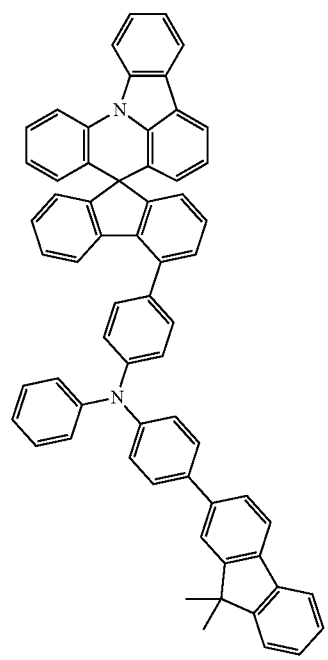

-continued
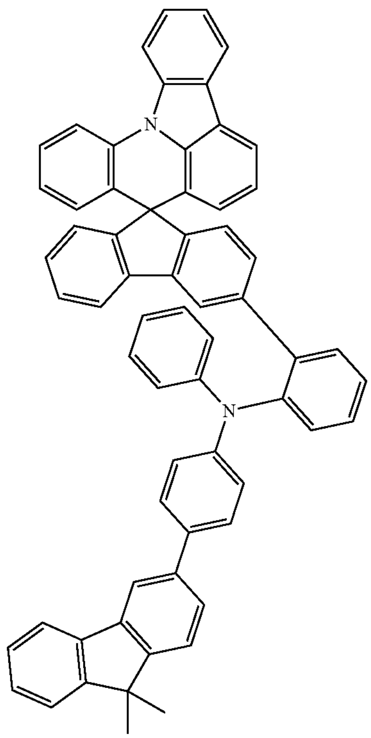
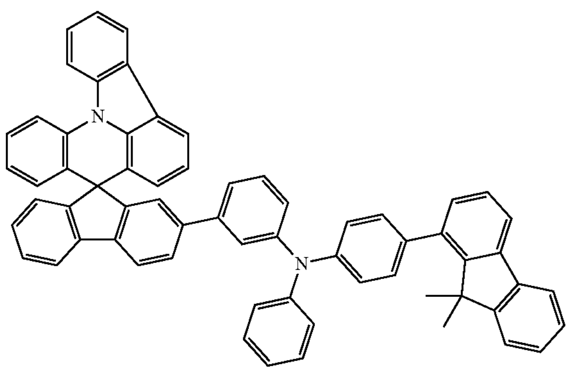
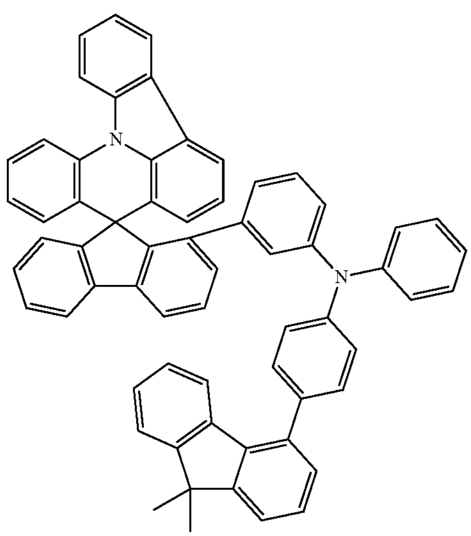
-continued
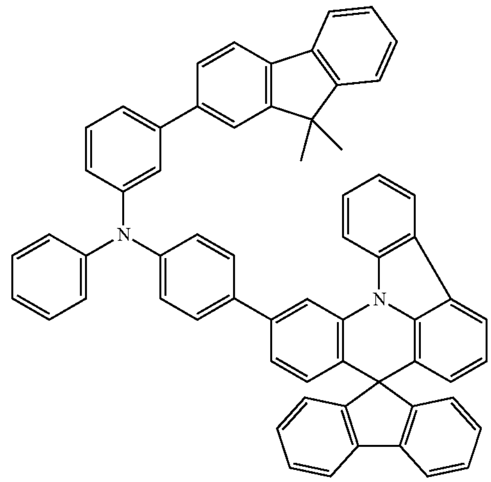
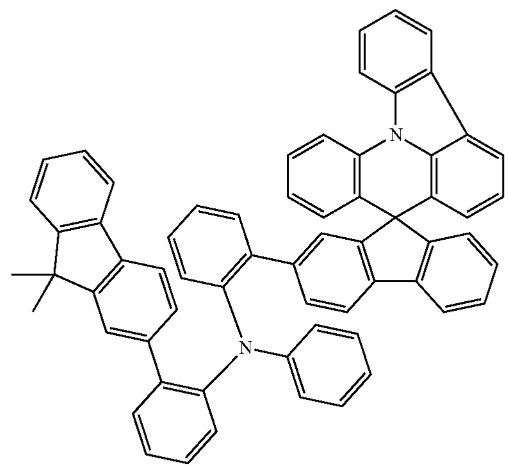
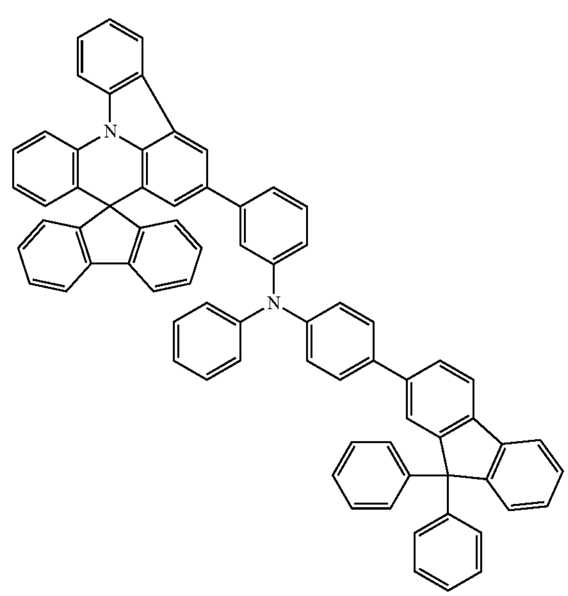

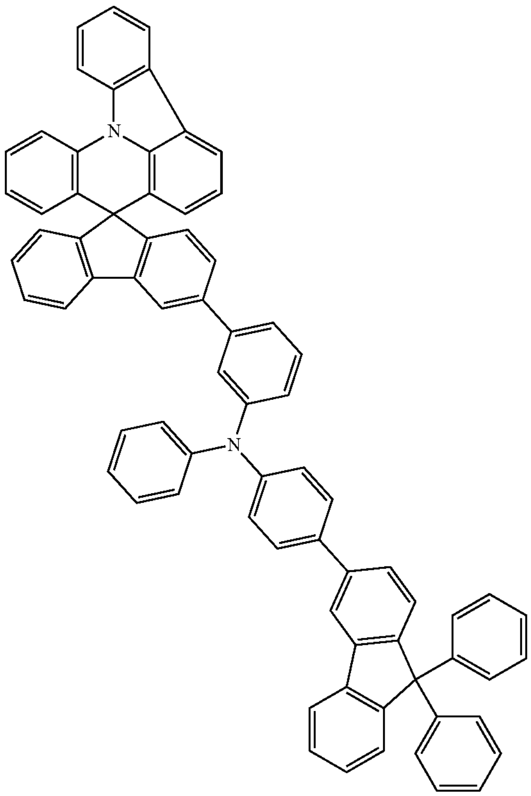
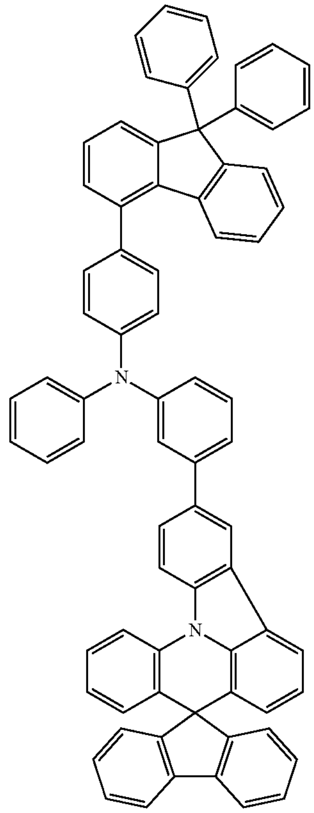
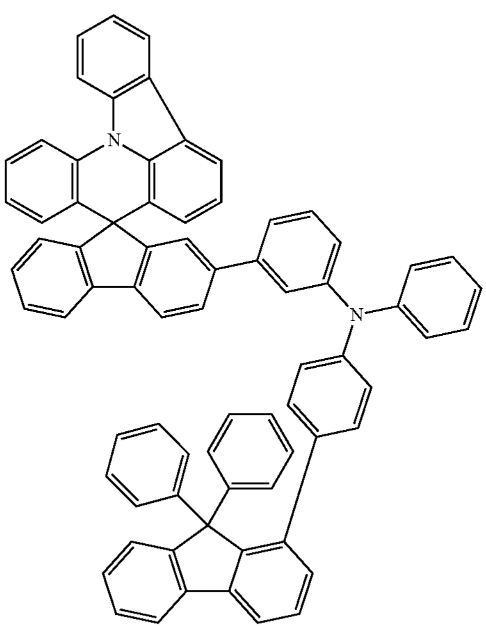
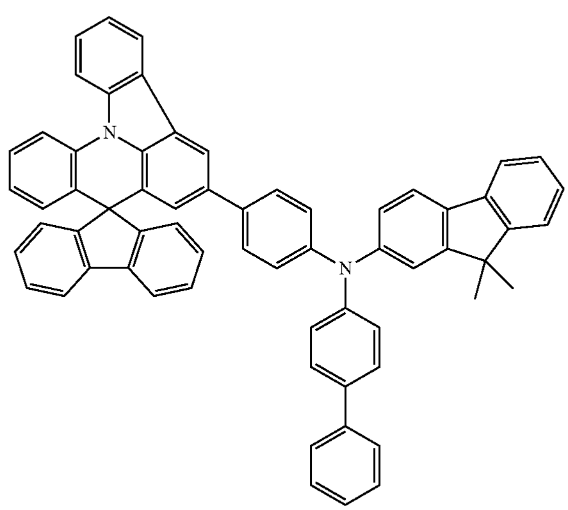

-continued
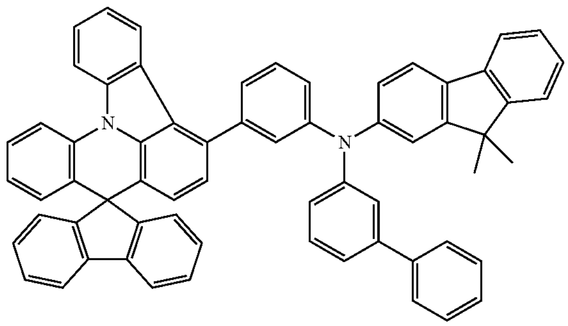
-continued
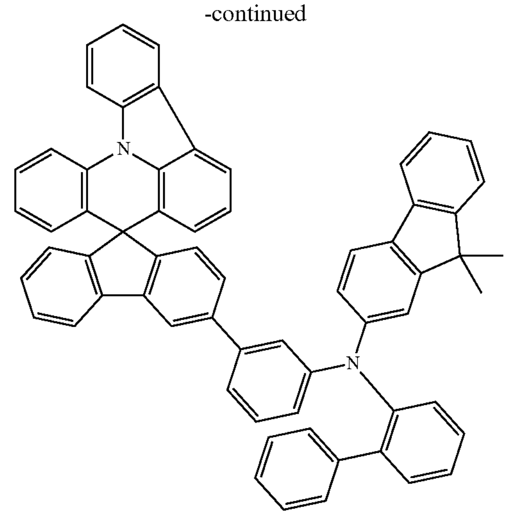
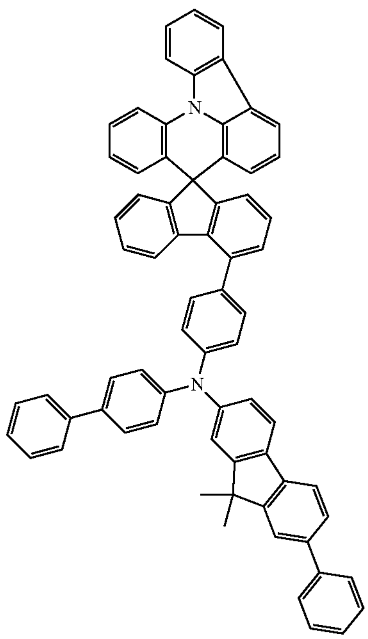
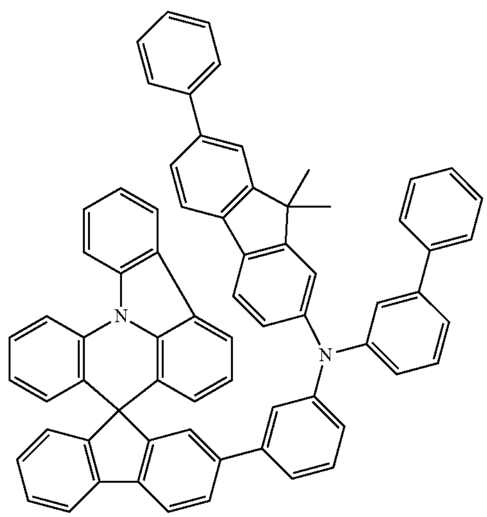
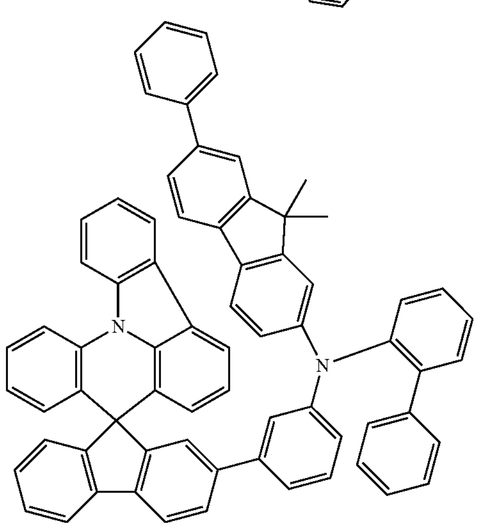

-continued
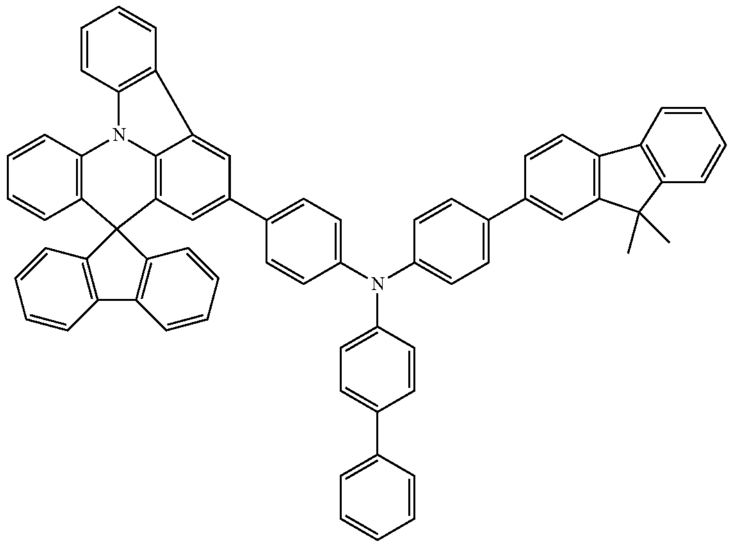
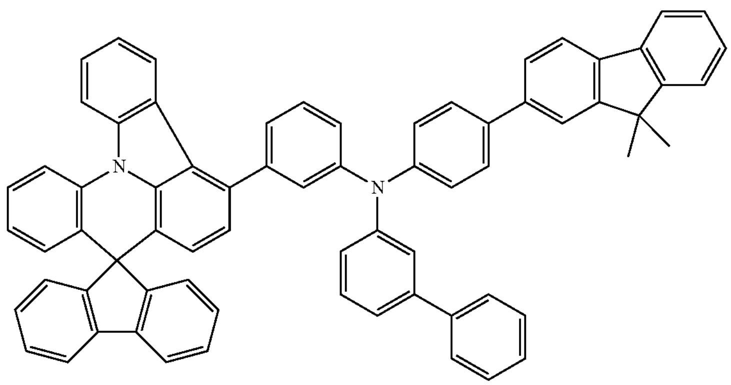
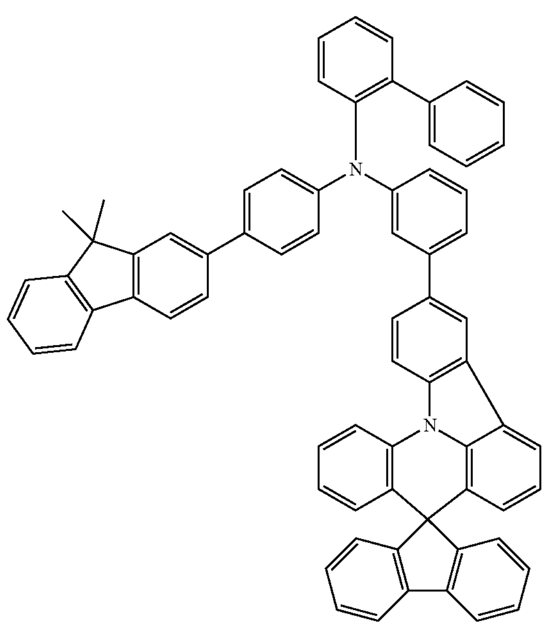

-continued
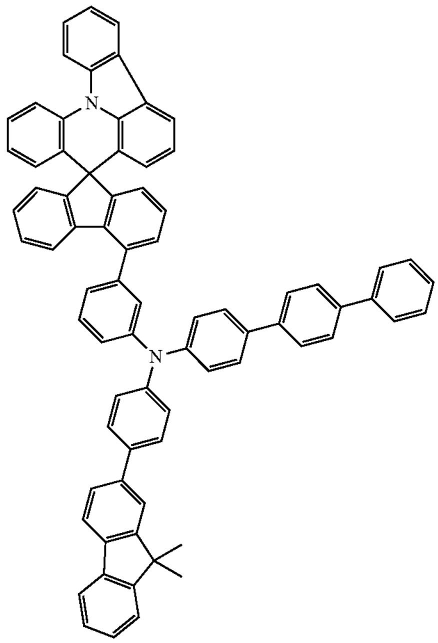
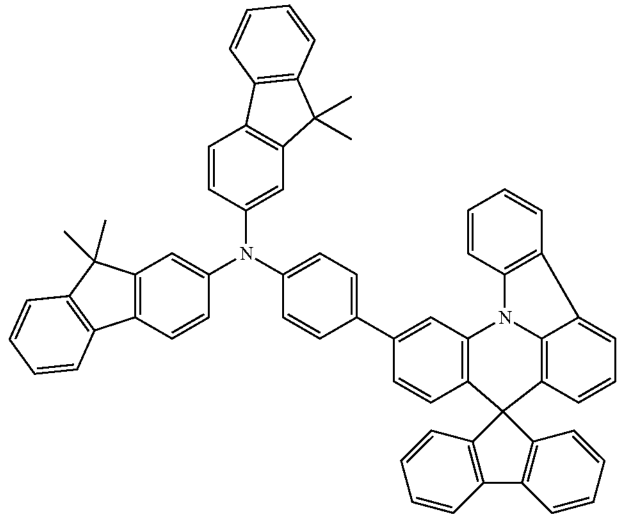
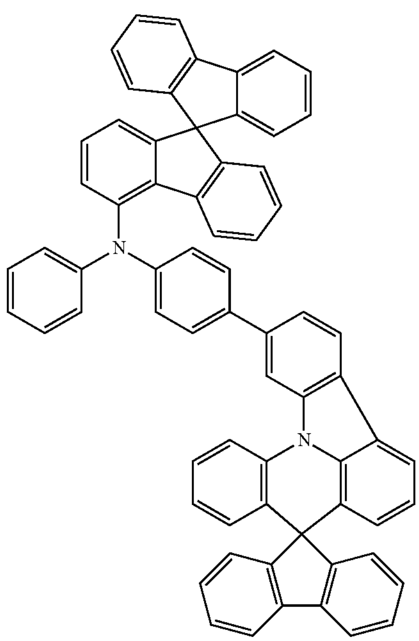
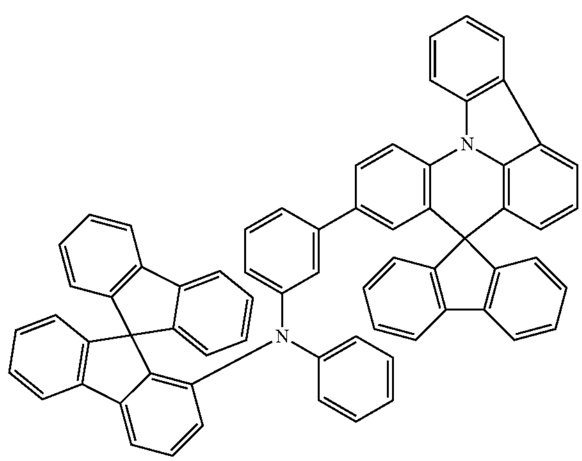

-continued
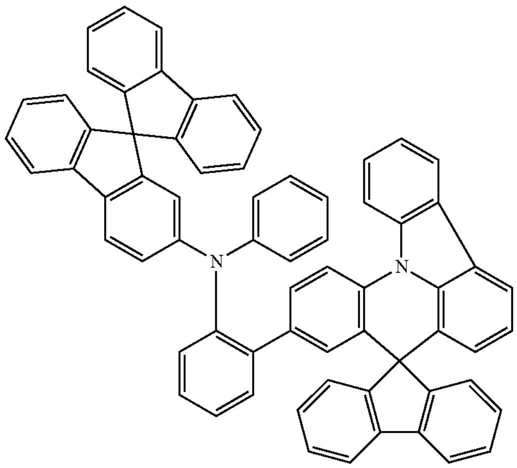
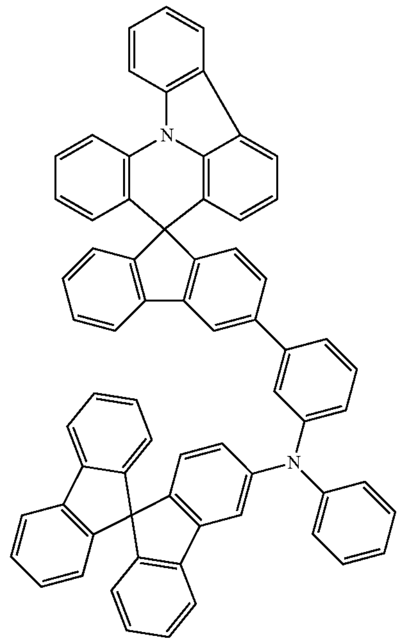
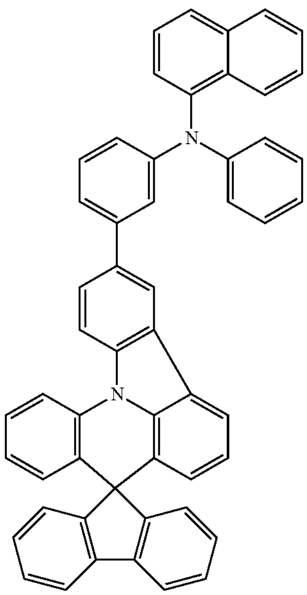
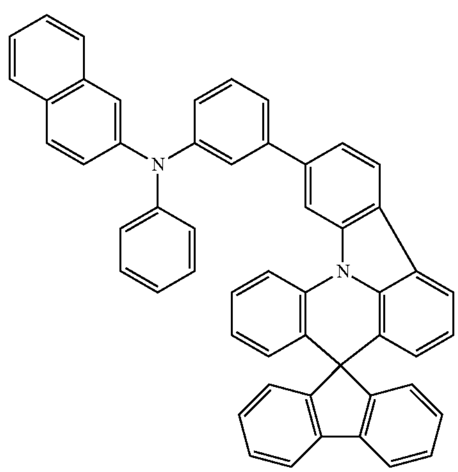
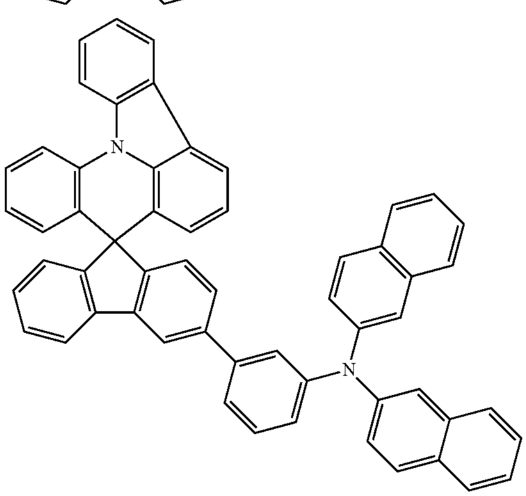
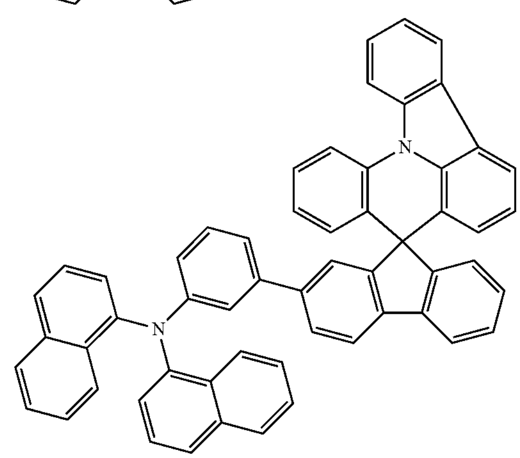

-continued
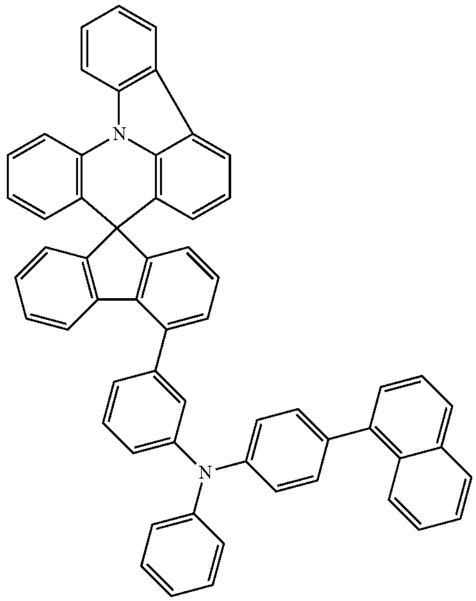
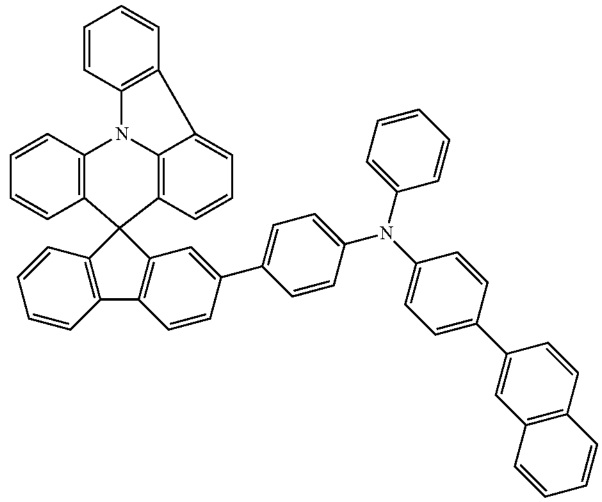
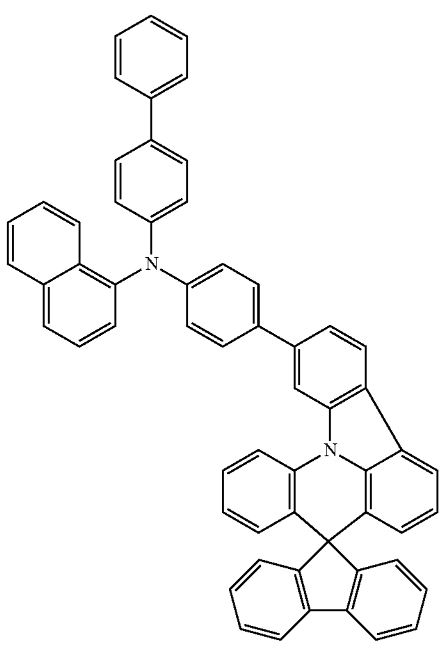
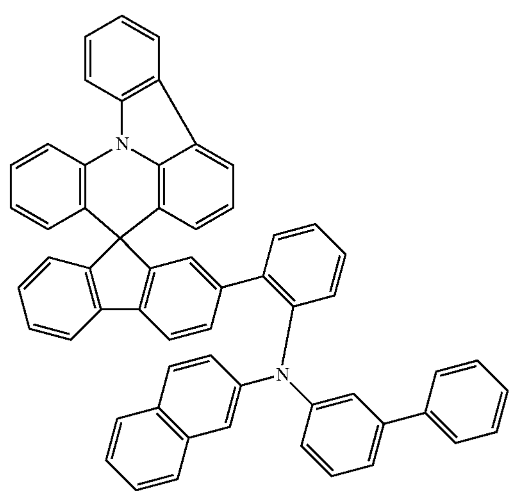

-continued
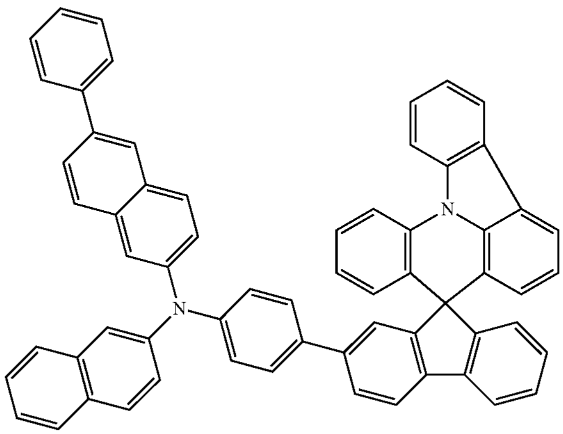
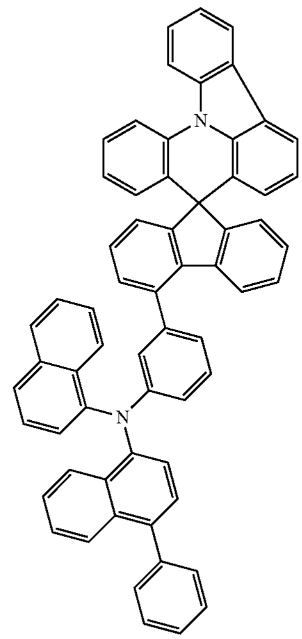
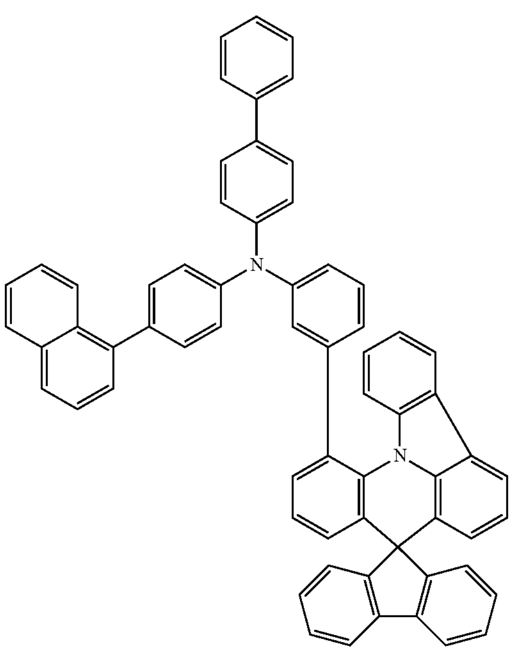
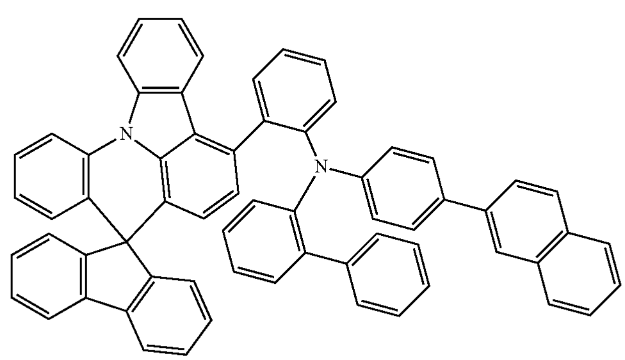

-continued
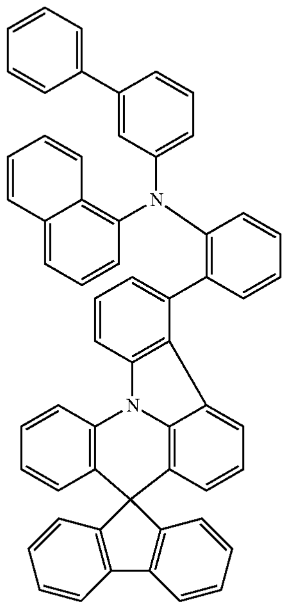
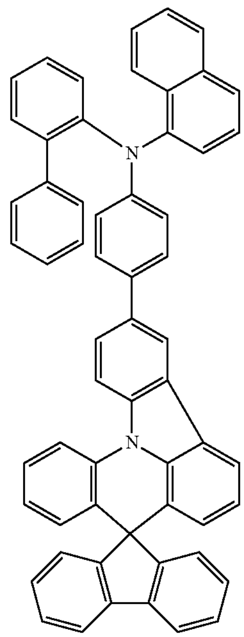
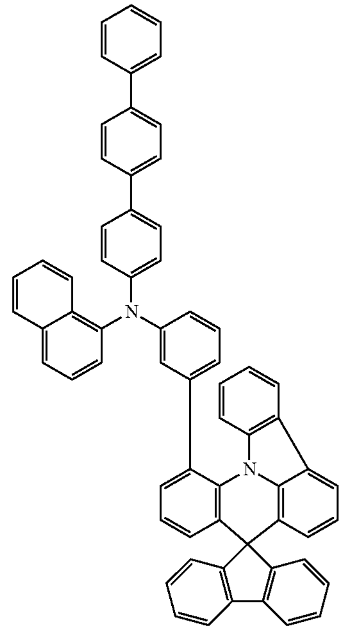
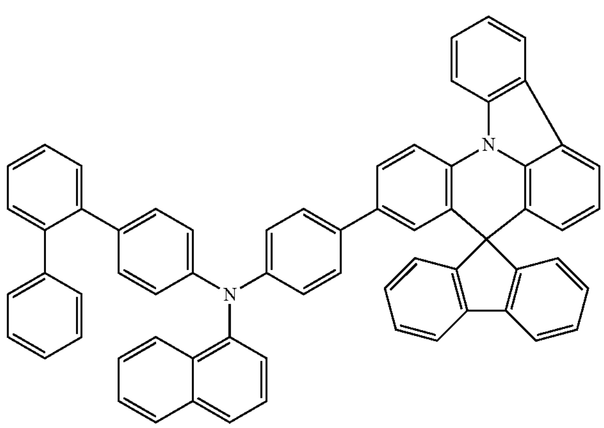
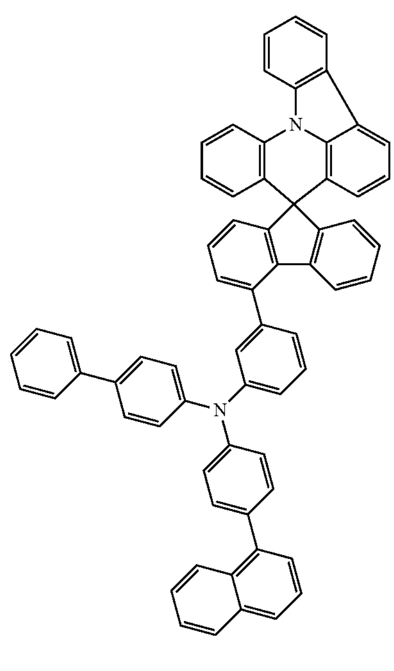

-continued
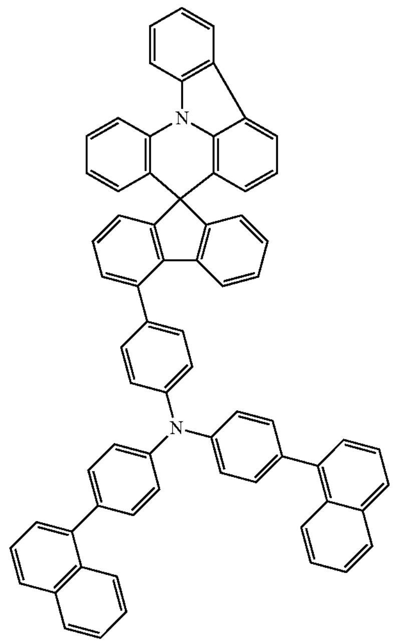
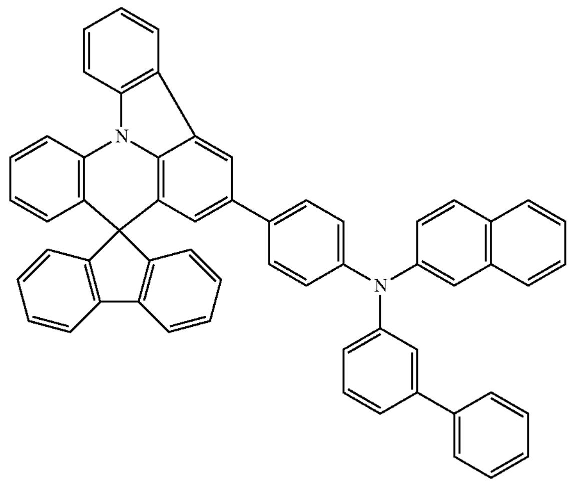
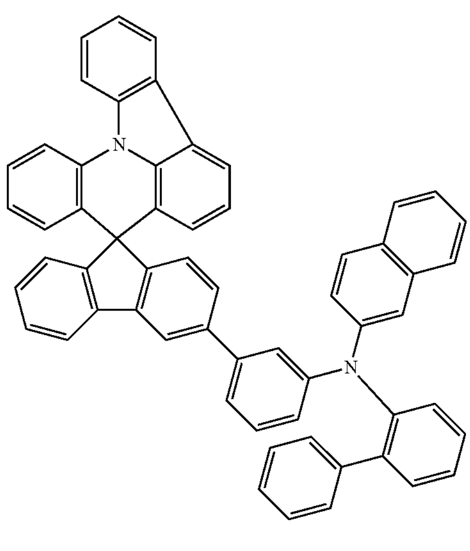
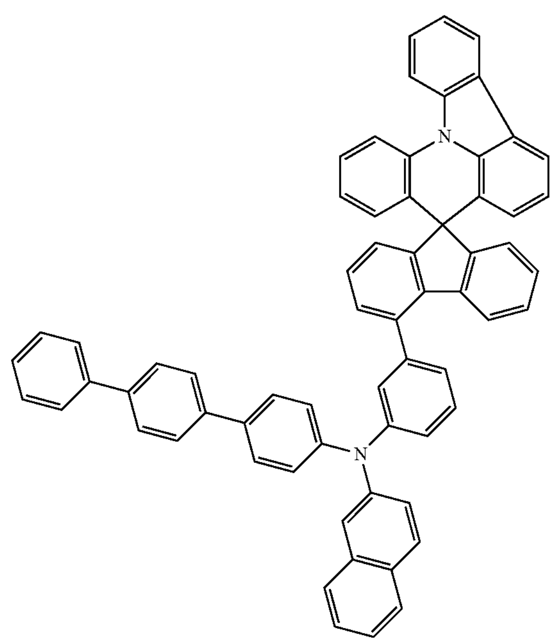

-continued
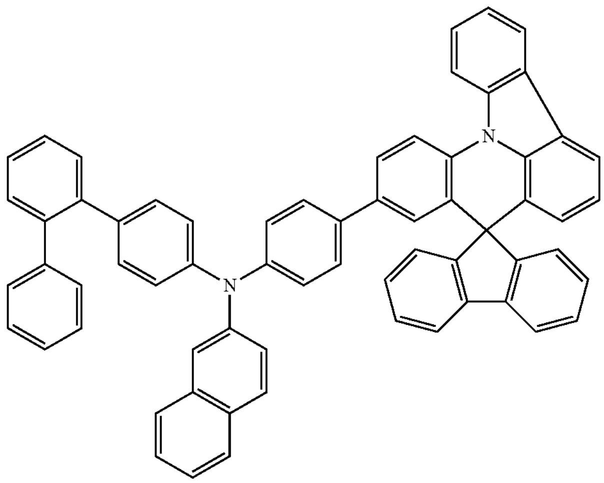
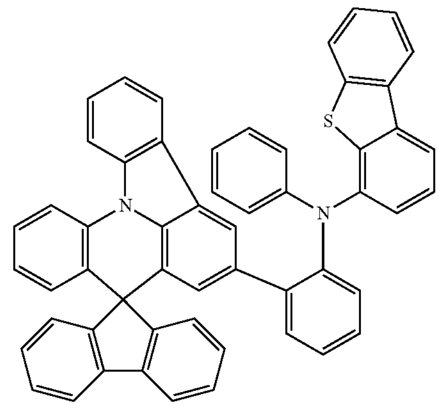
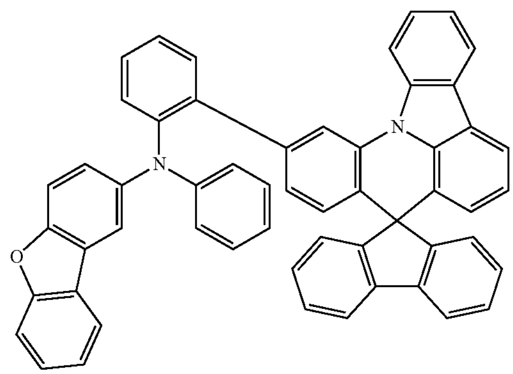
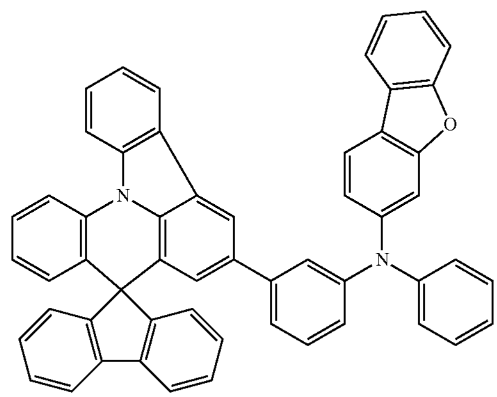
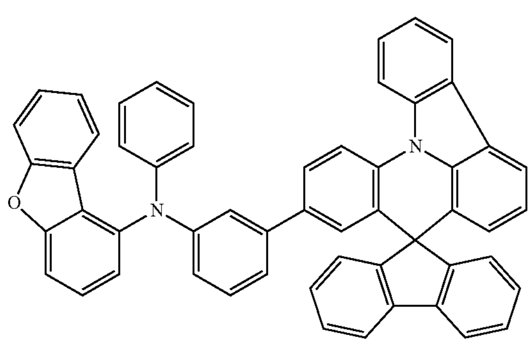
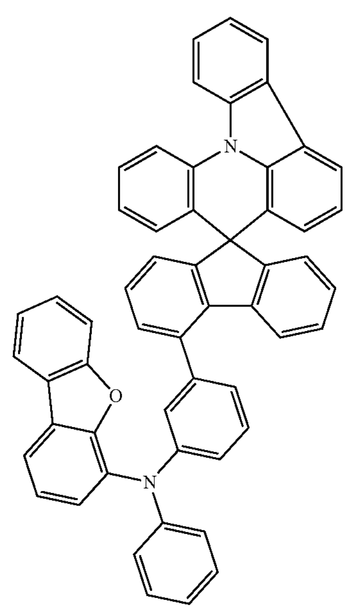

-continued
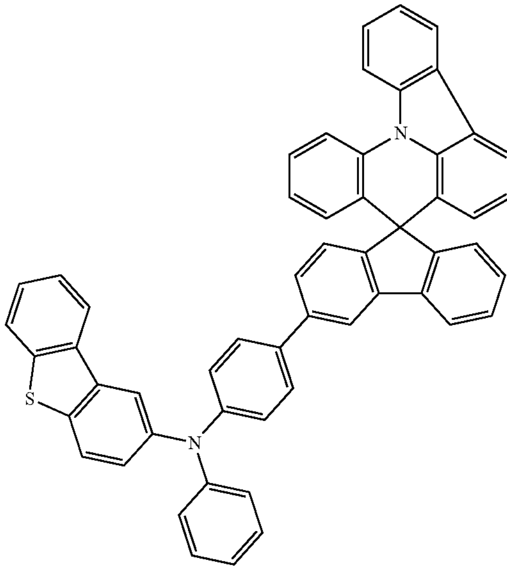
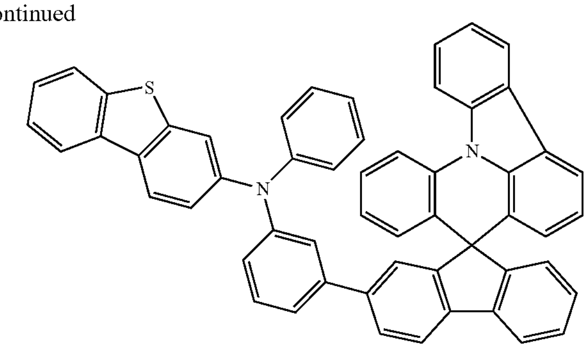
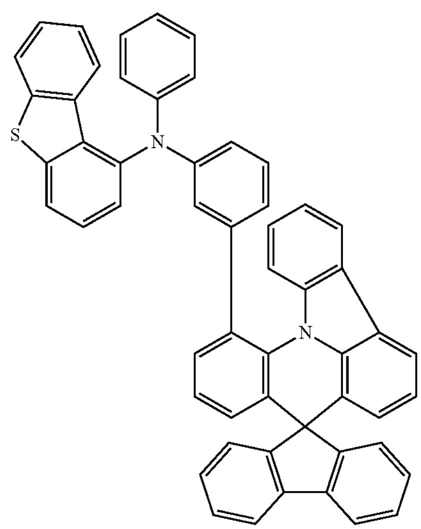
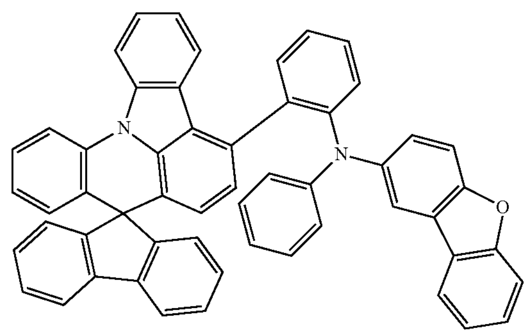
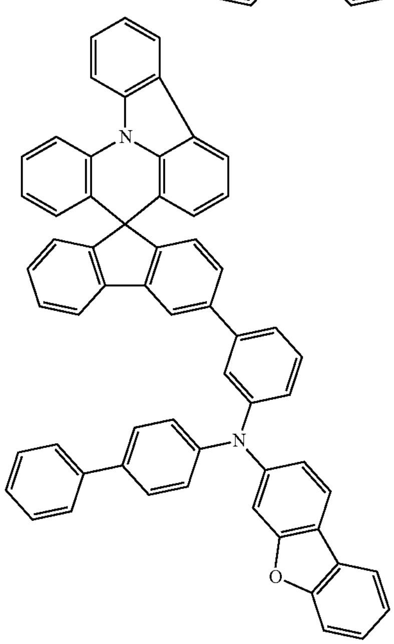
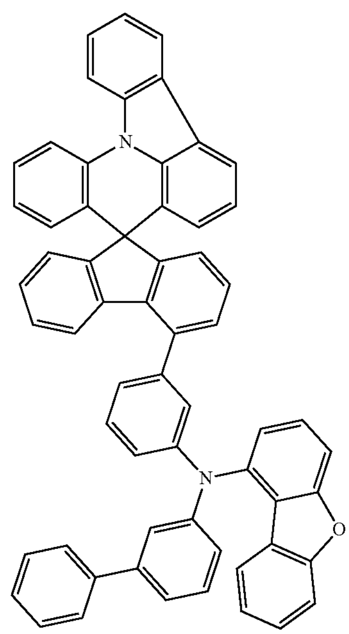

-continued
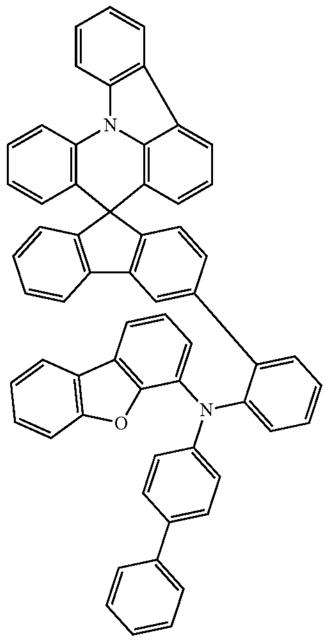
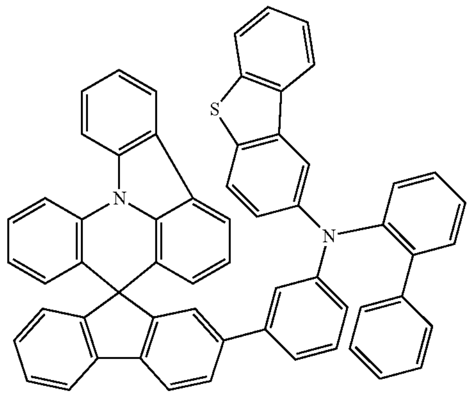
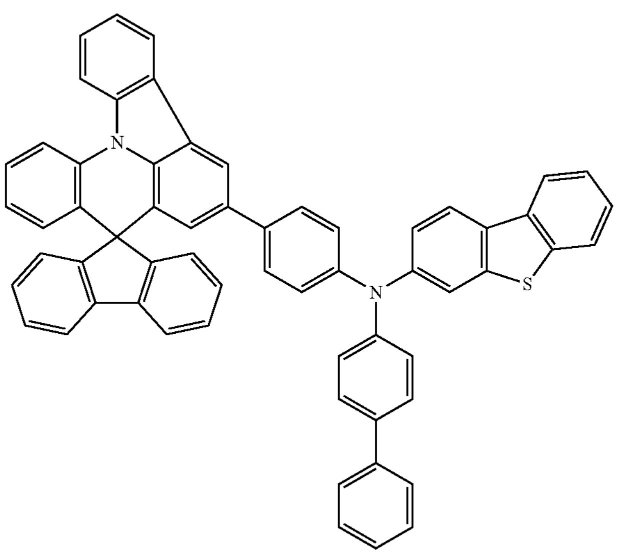
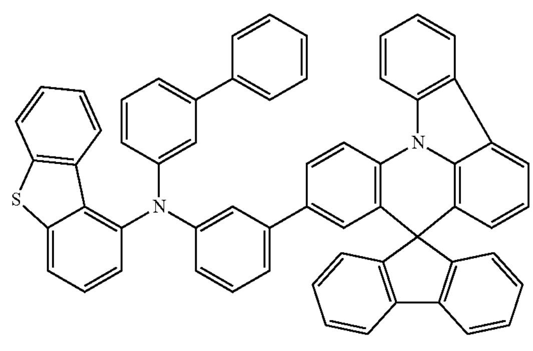

-continued
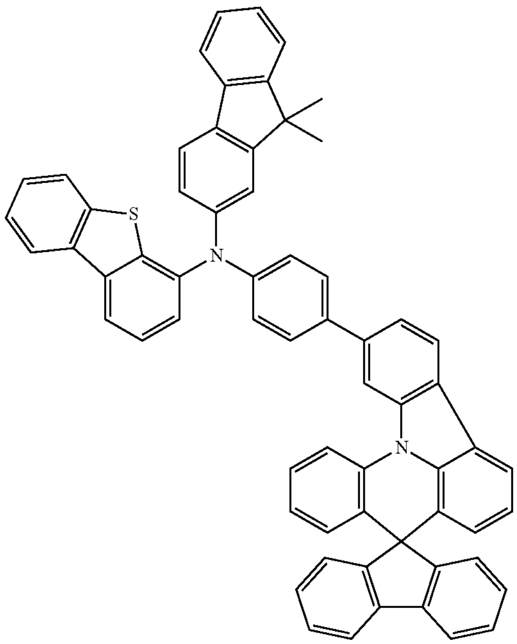
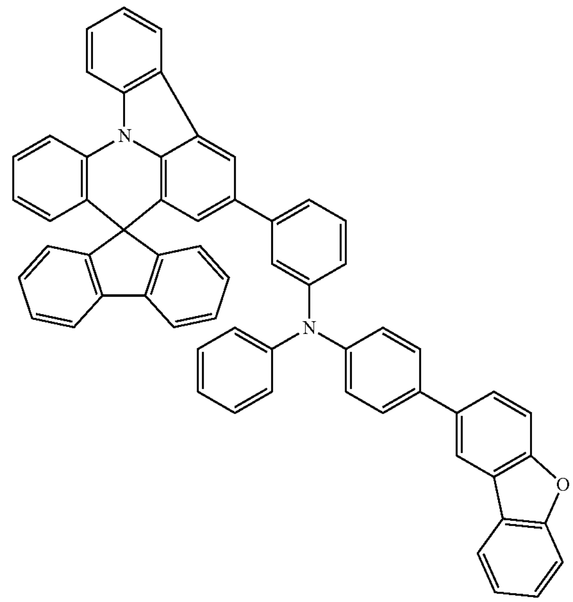
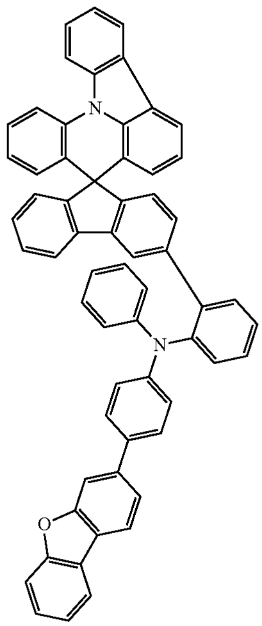
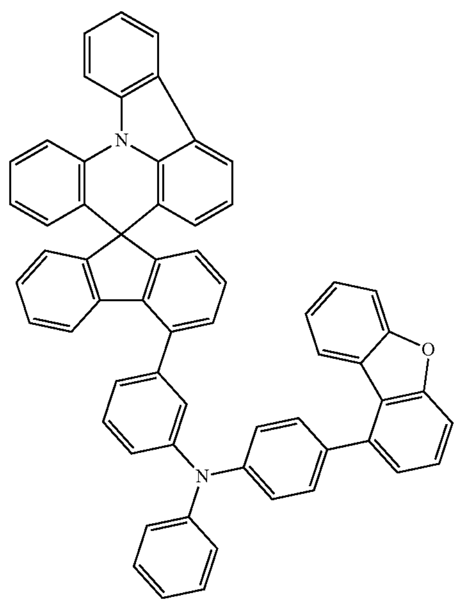

-continued
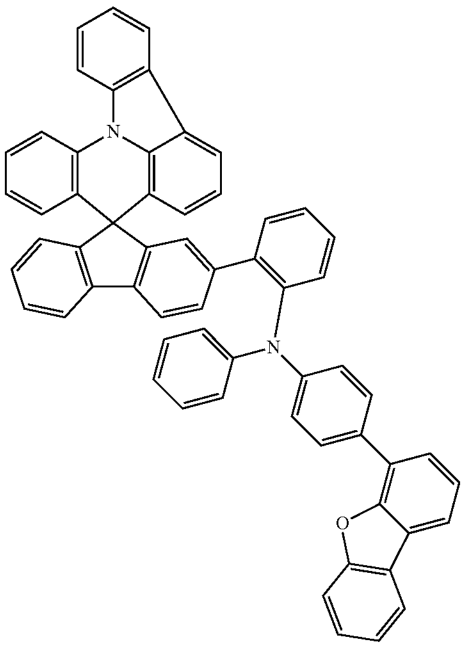
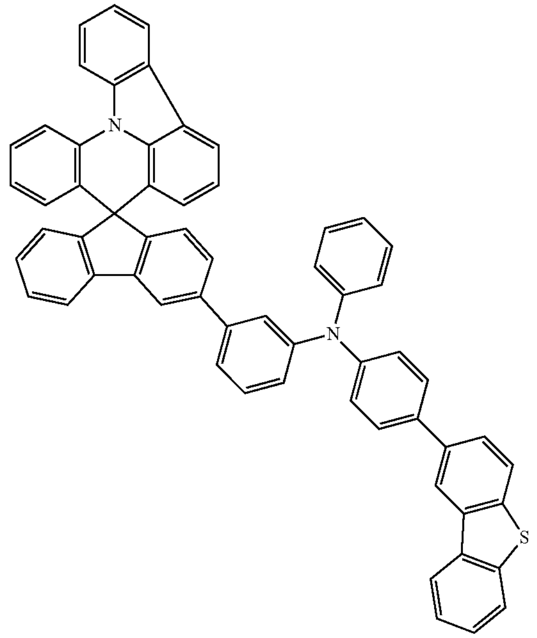
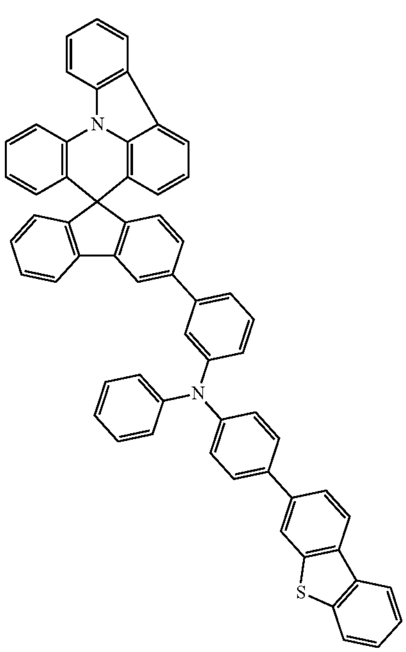
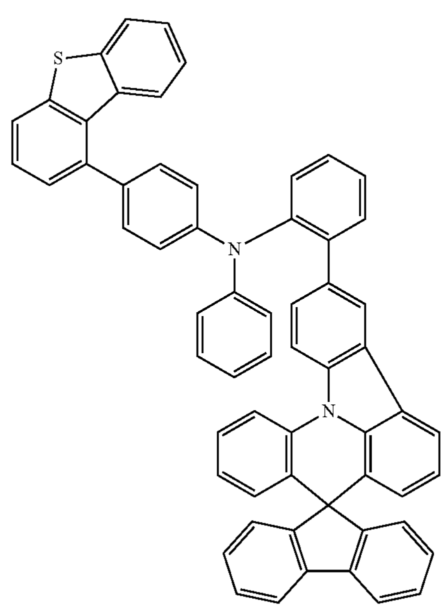

-continued
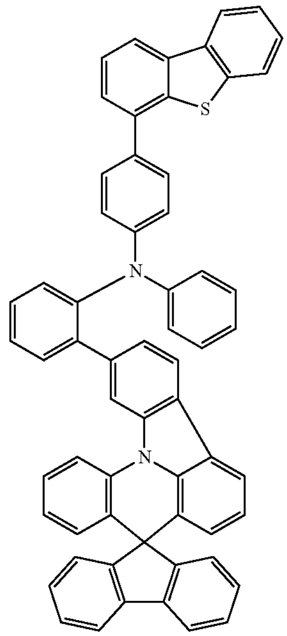
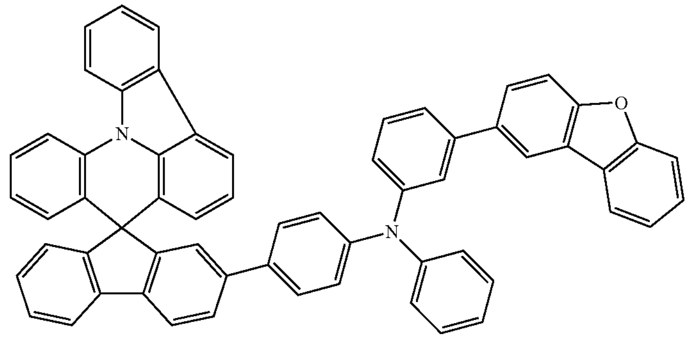
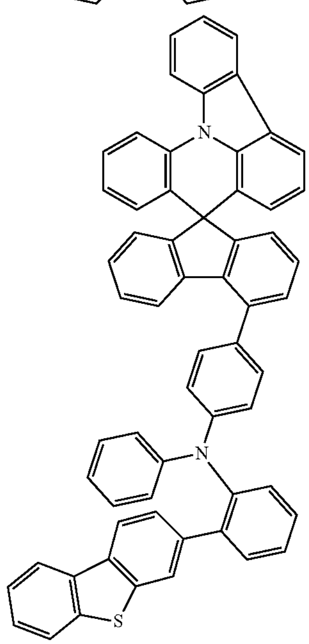
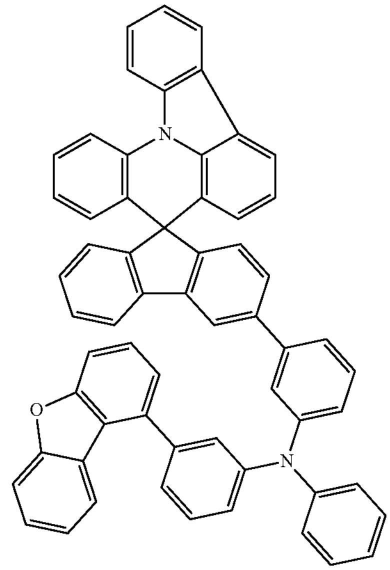
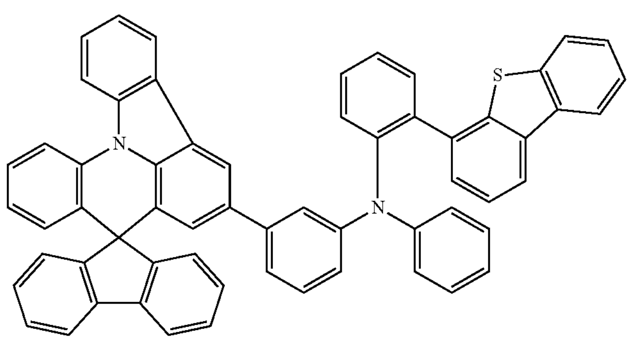
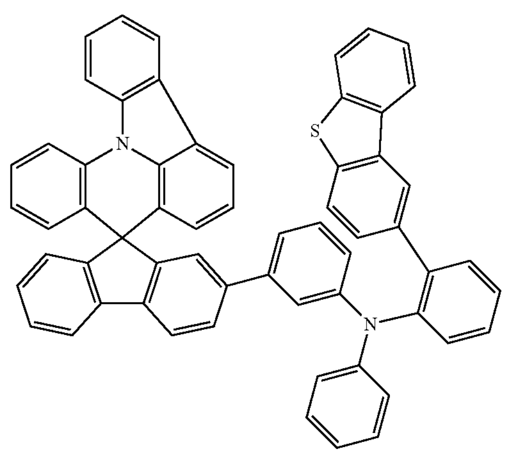

-continued
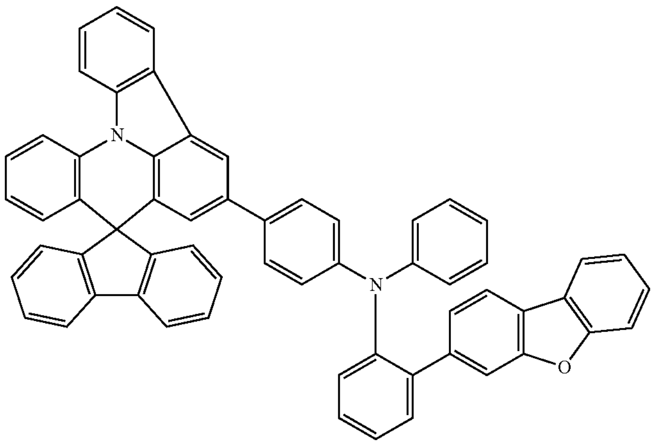
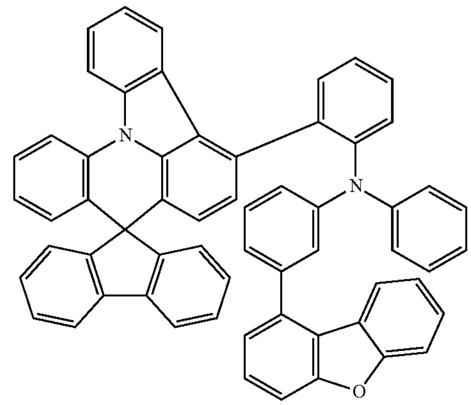
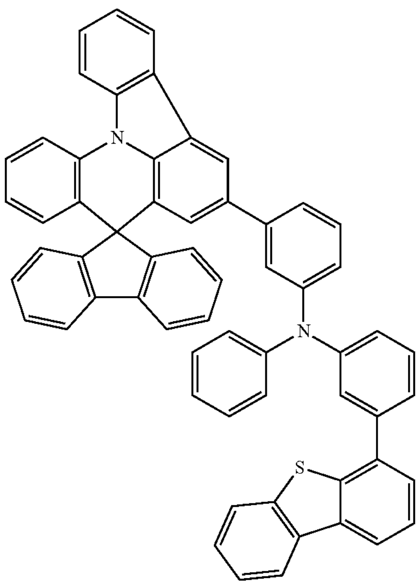
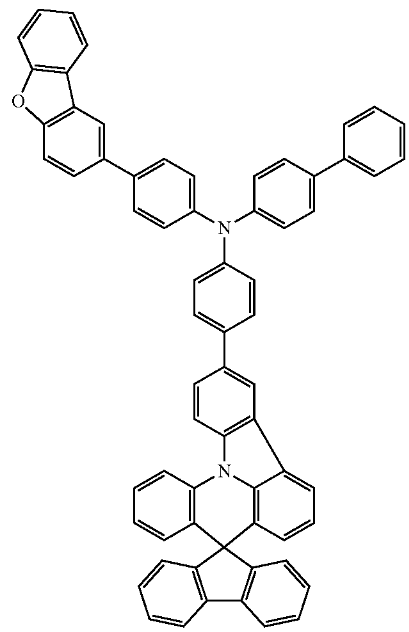
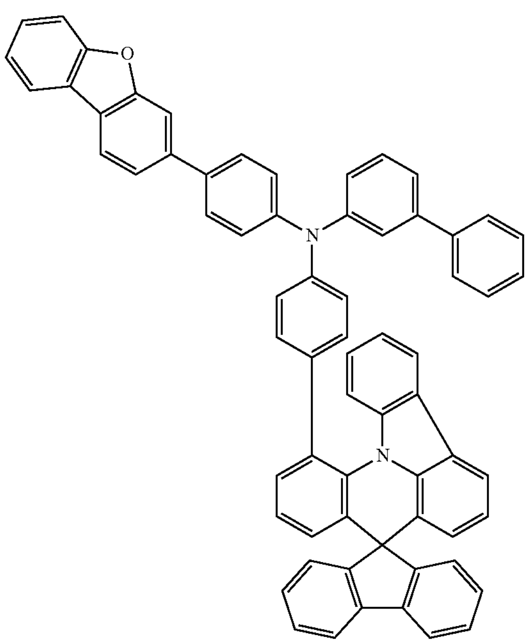
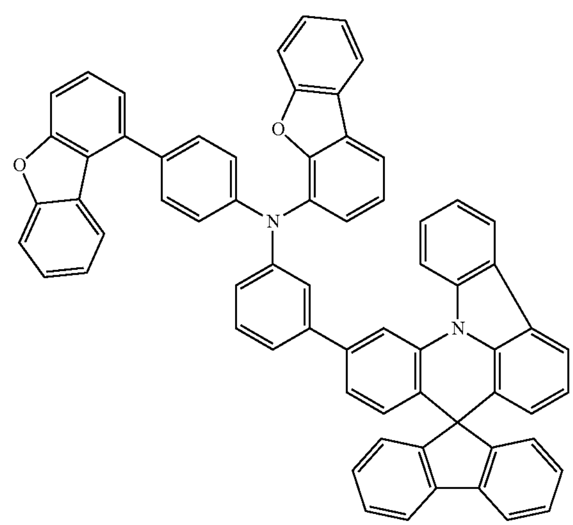

-continued
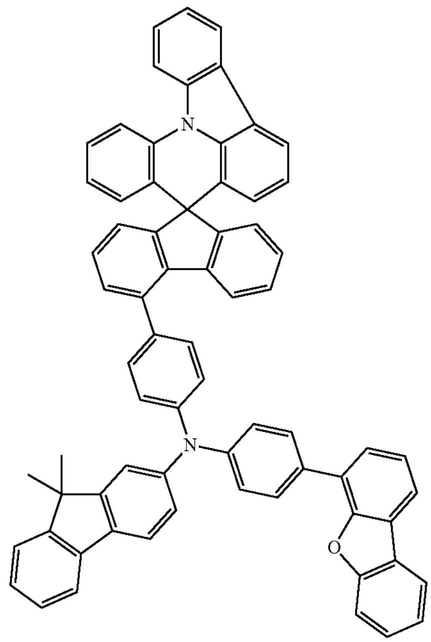
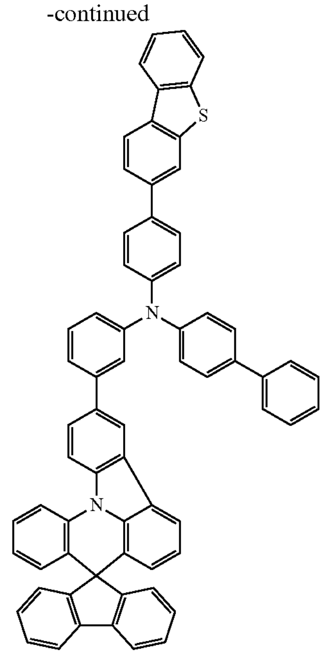
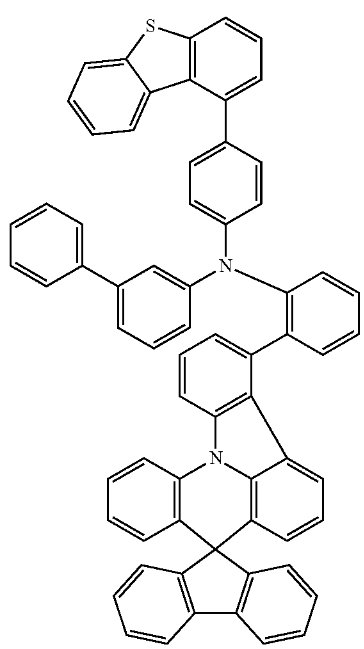
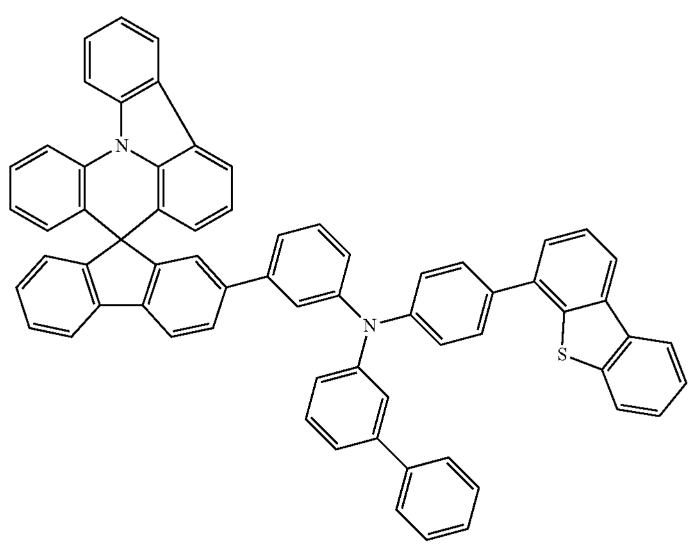

-continued
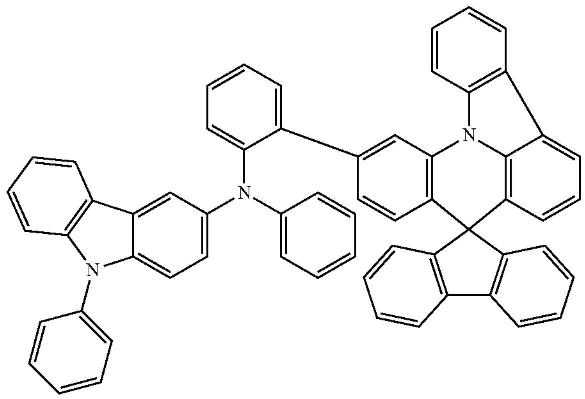
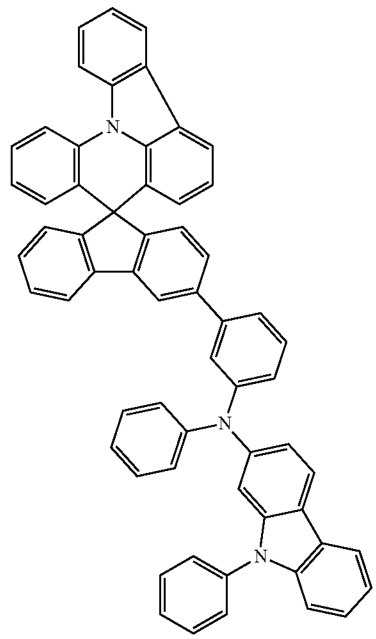
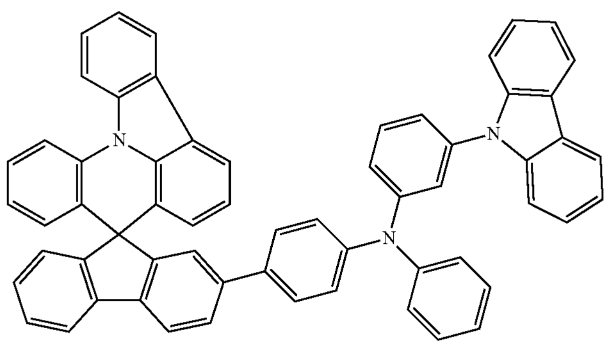
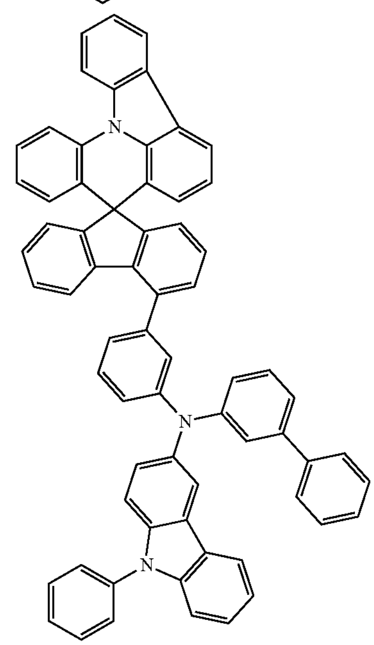
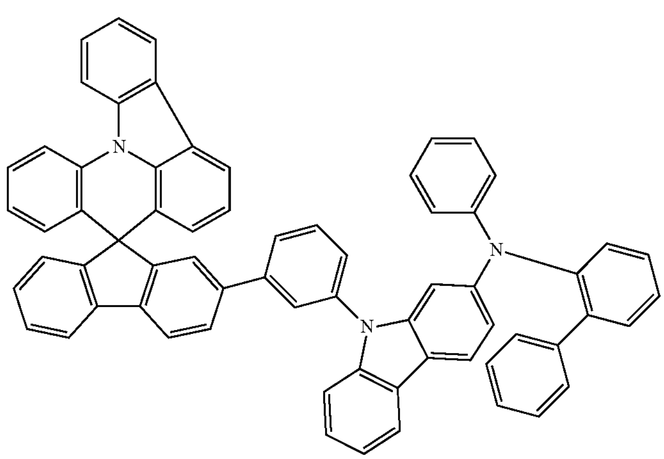

-continued
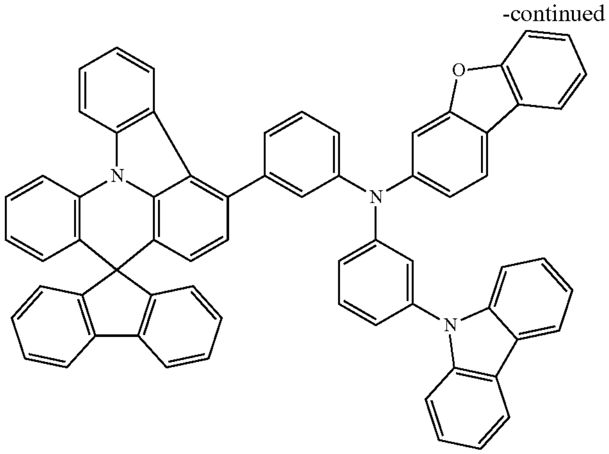
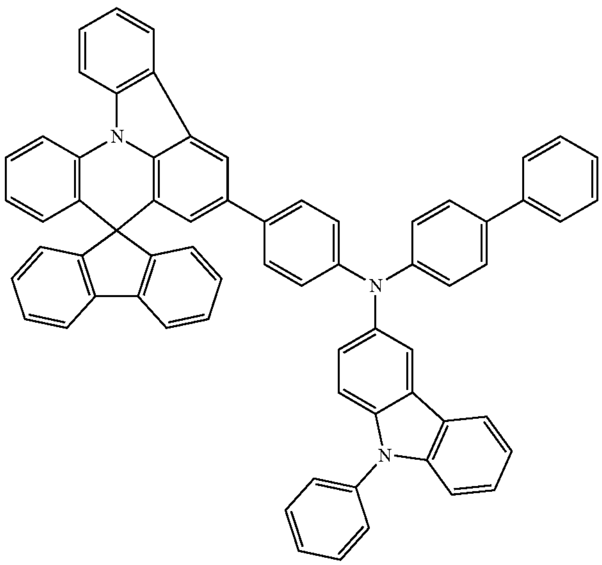
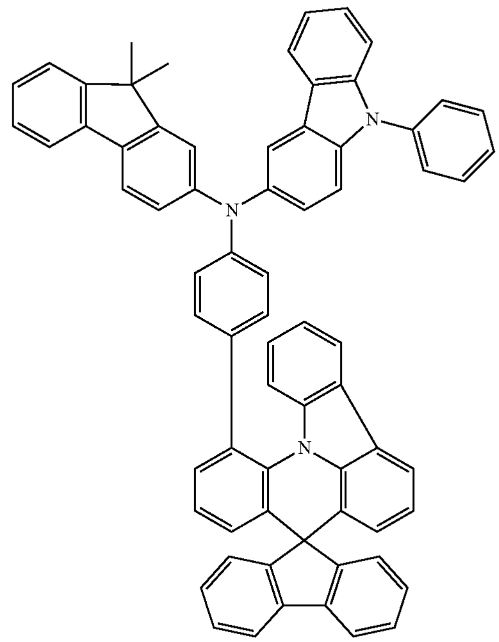
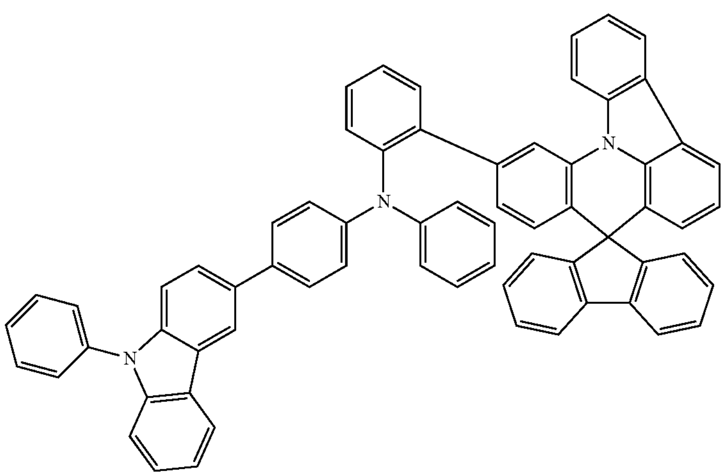
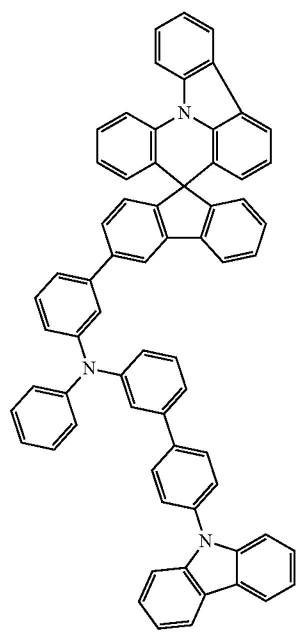

-continued
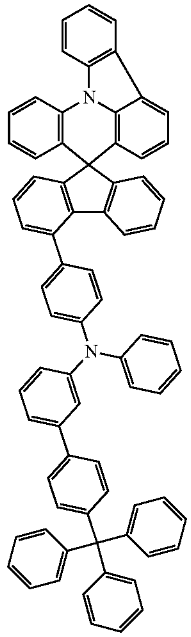
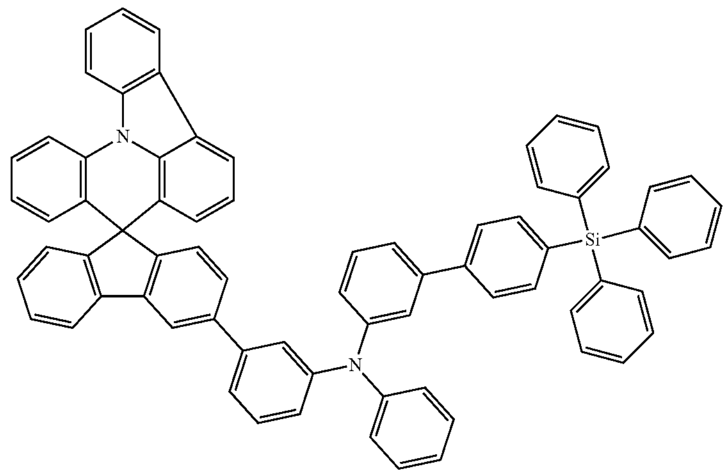
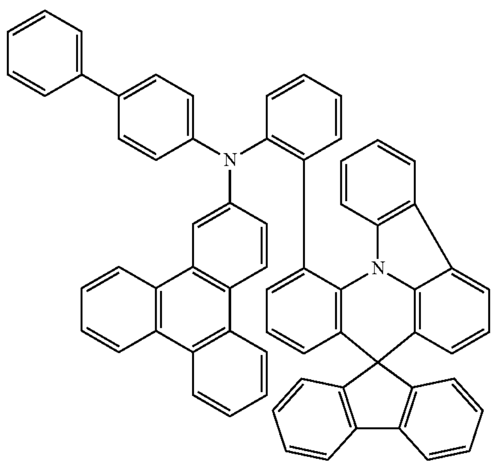
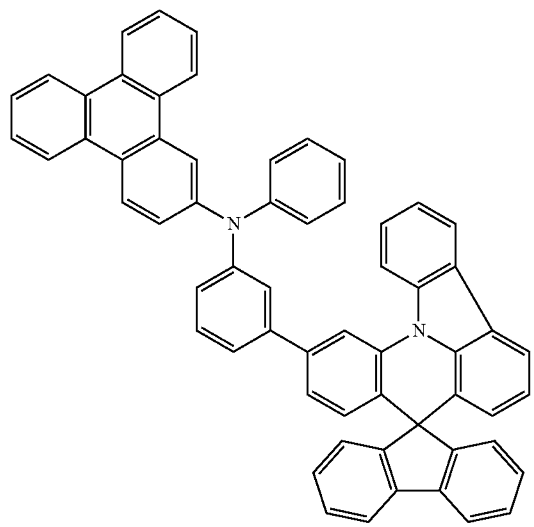
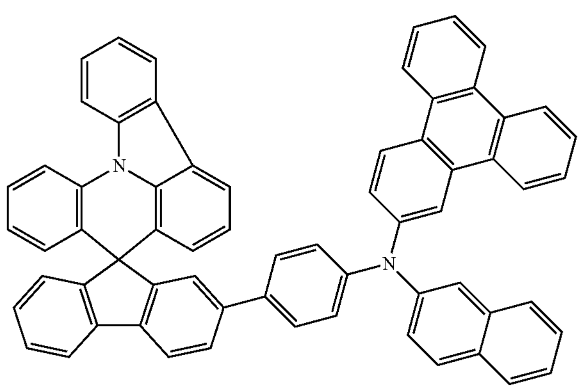
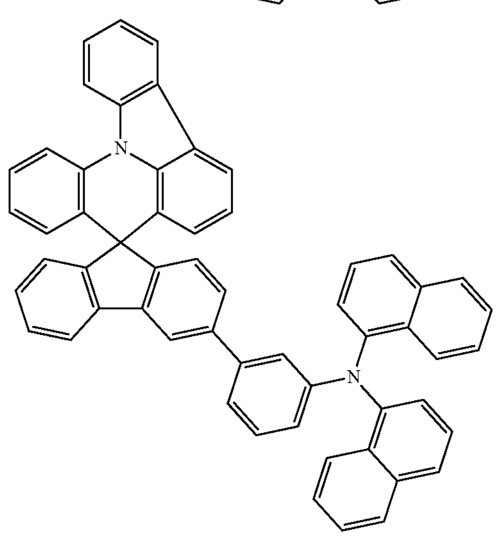

-continued
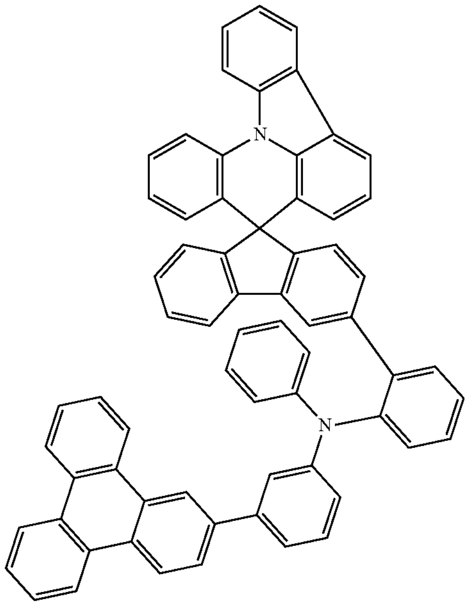
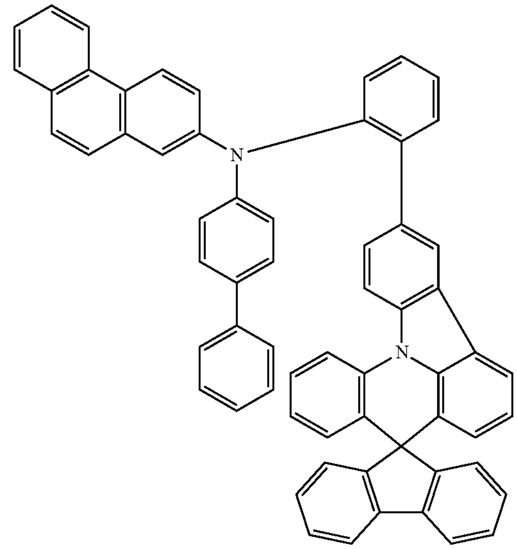
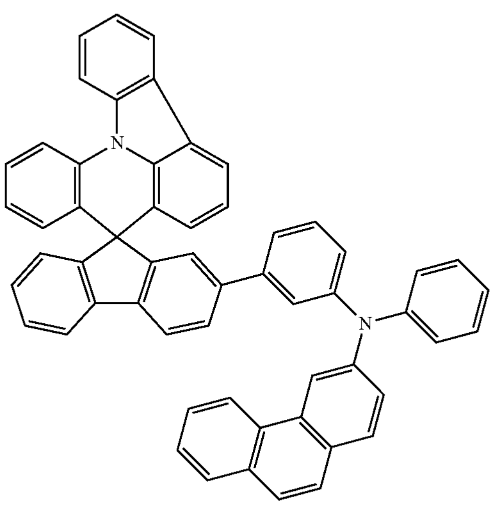
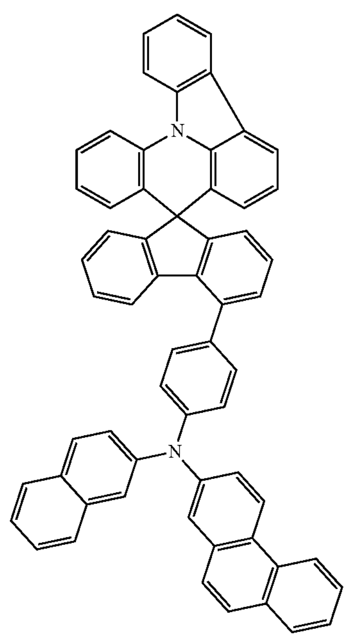

-continued
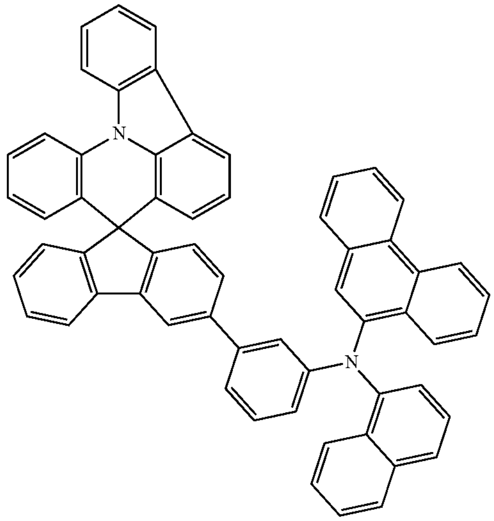
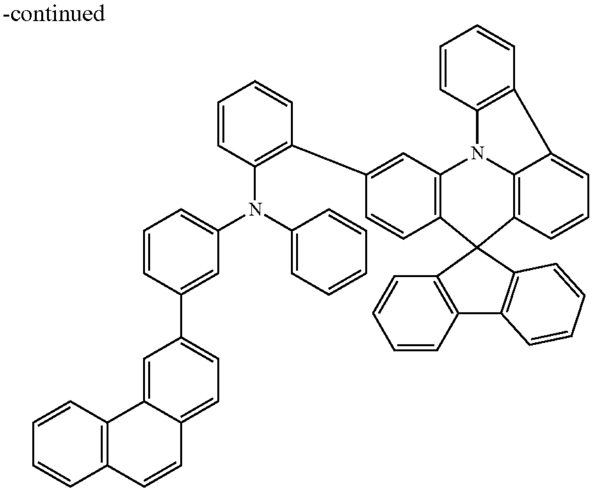
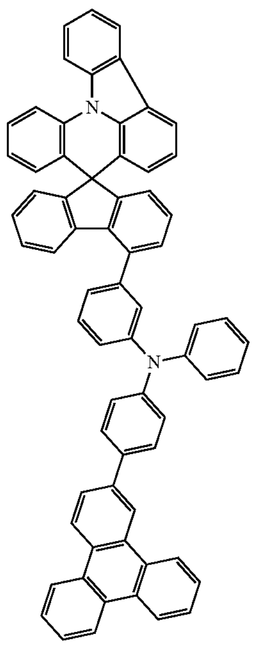
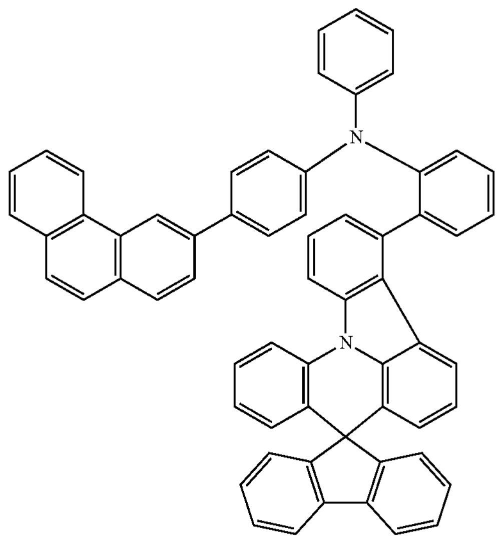
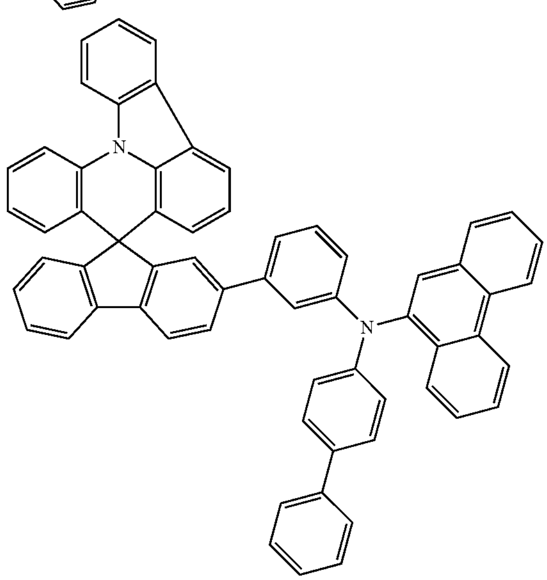

-continued
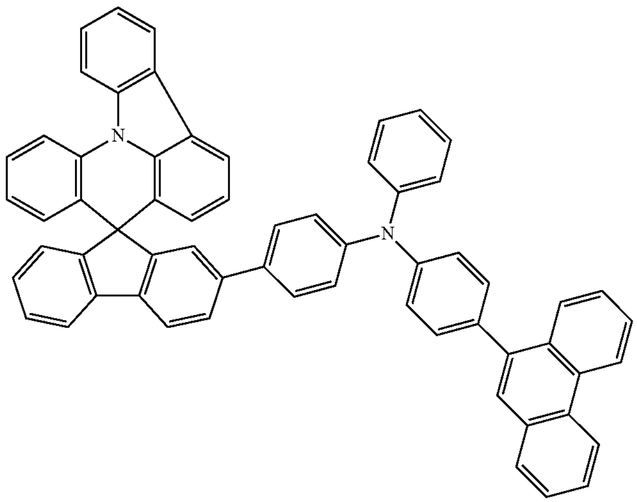
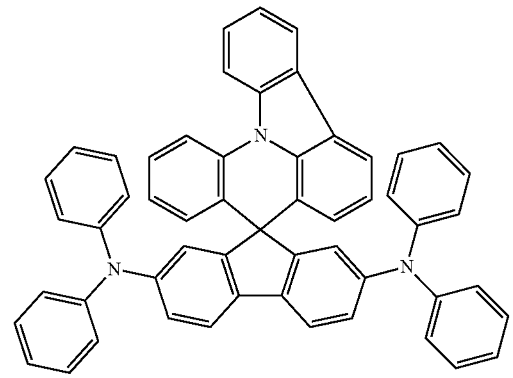
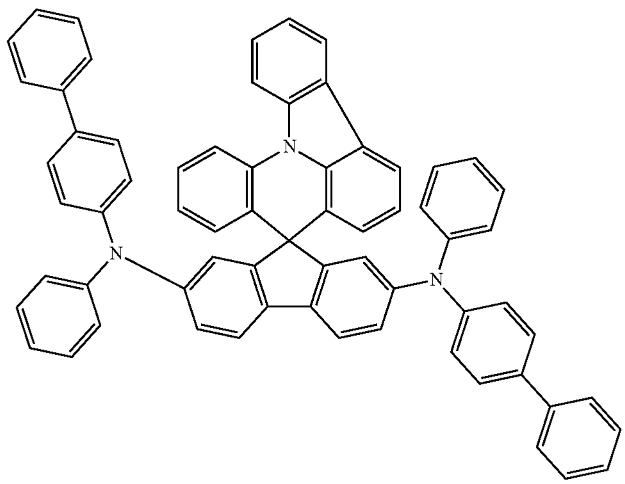
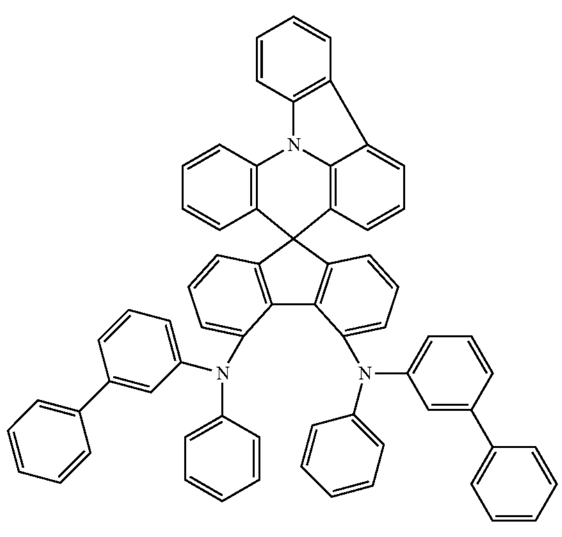

-continued
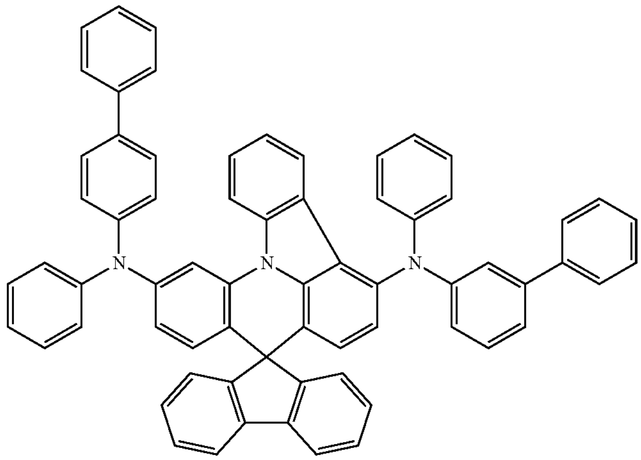
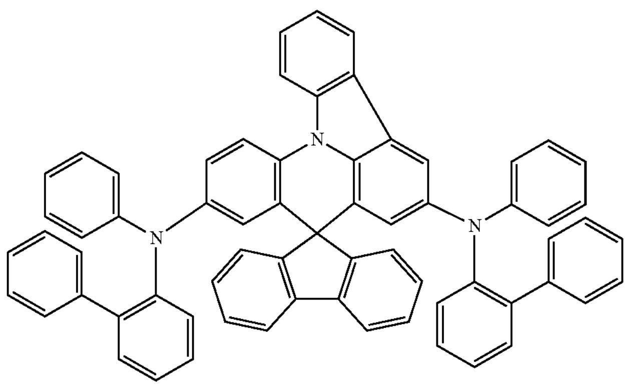
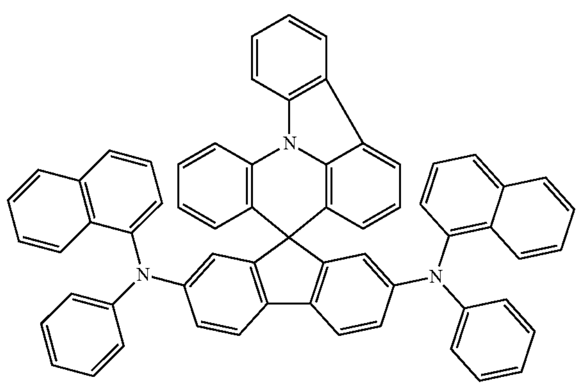
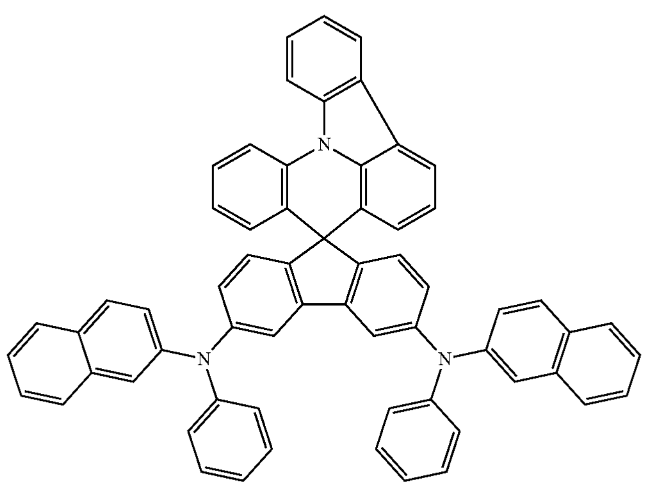

-continued
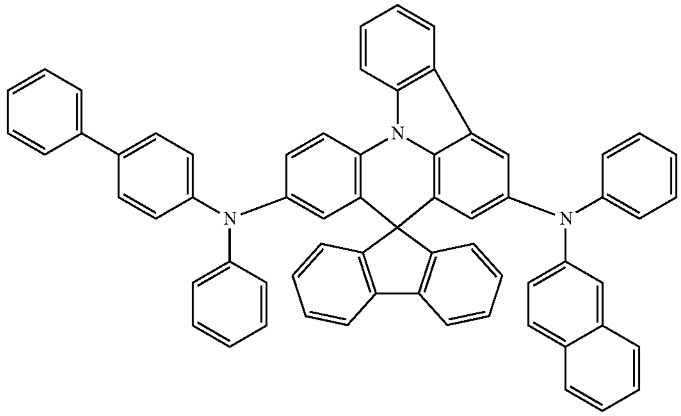
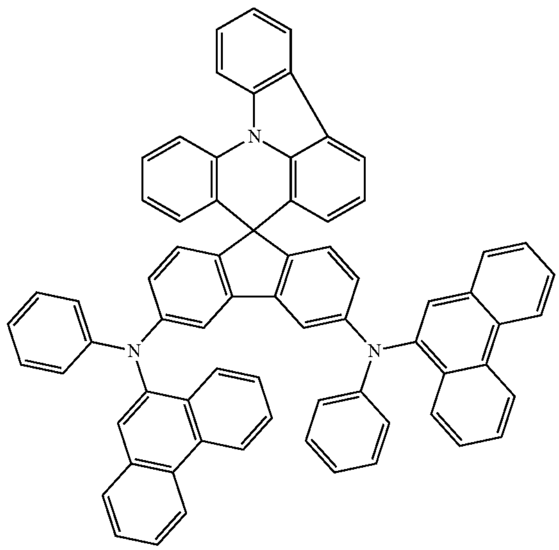
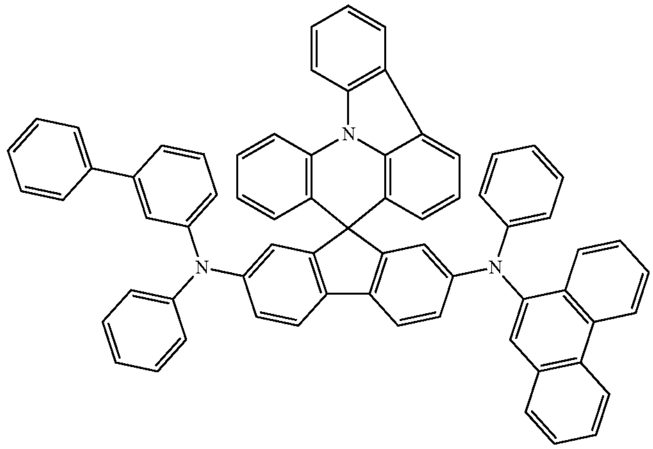

-continued
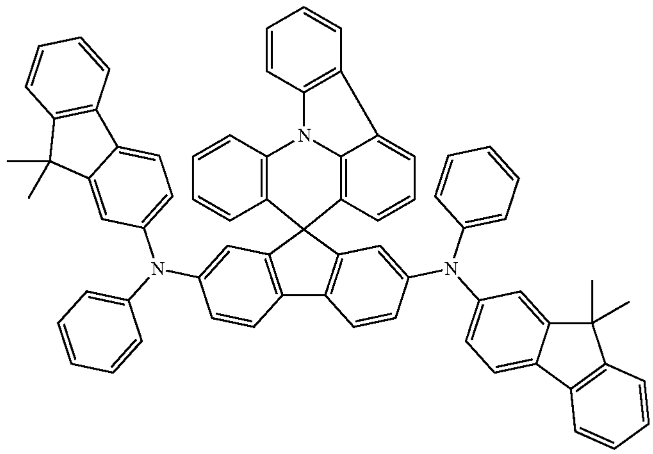
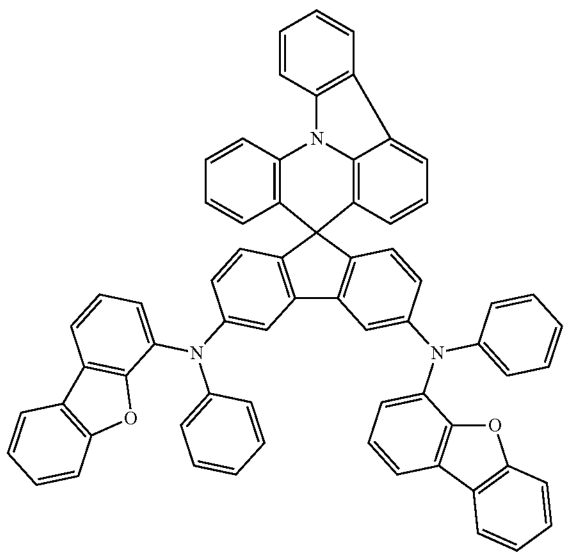
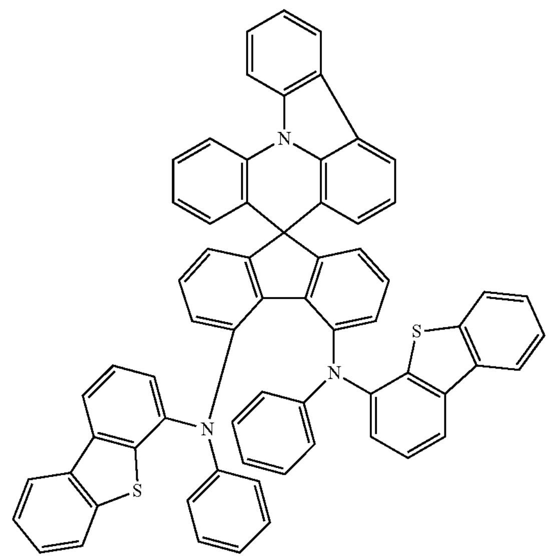
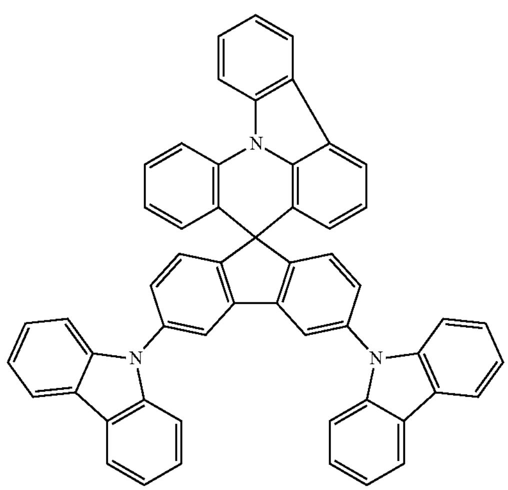

-continued
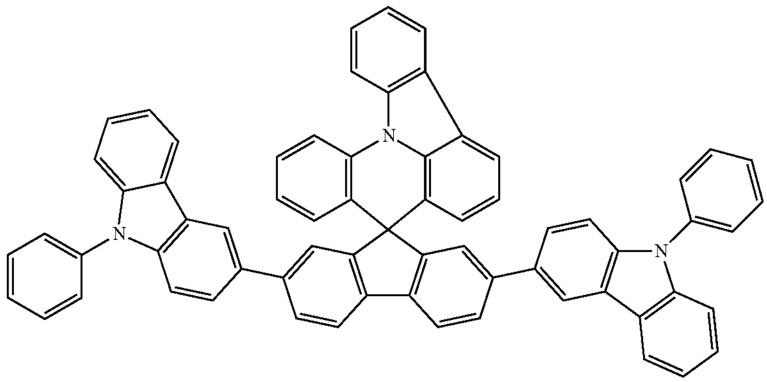
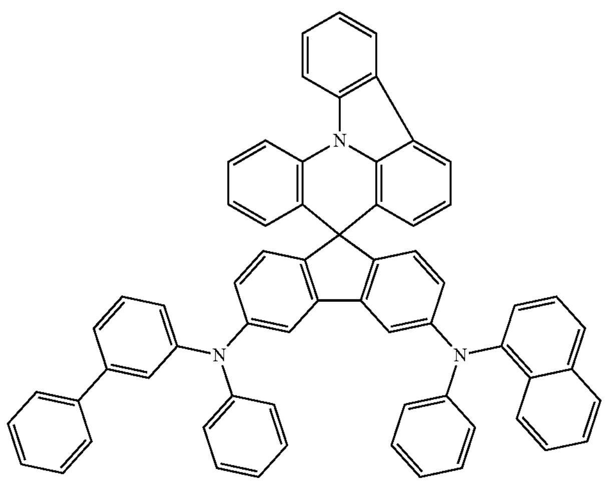
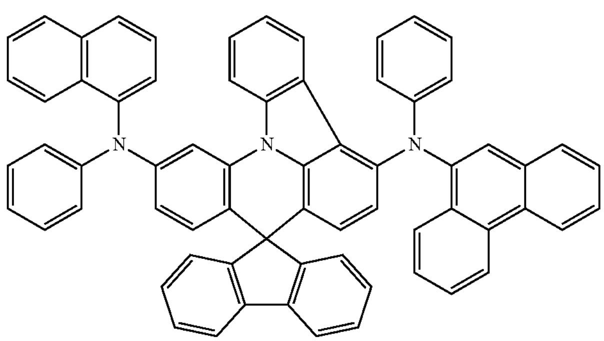
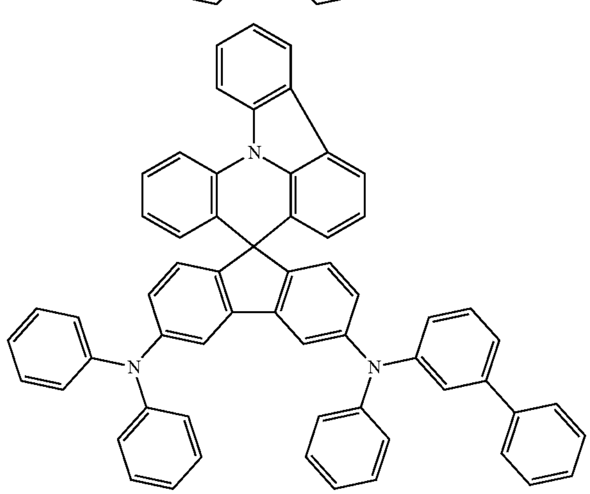

-continued
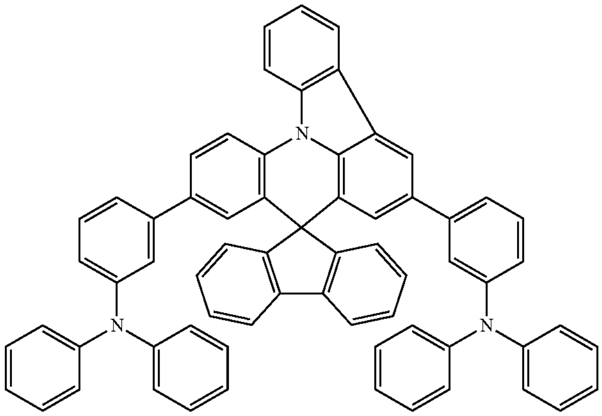
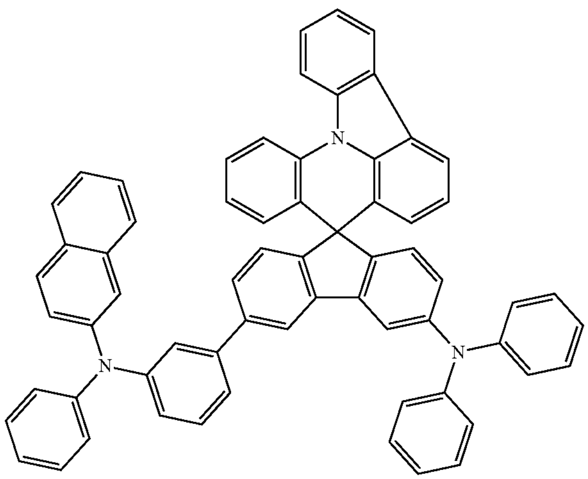
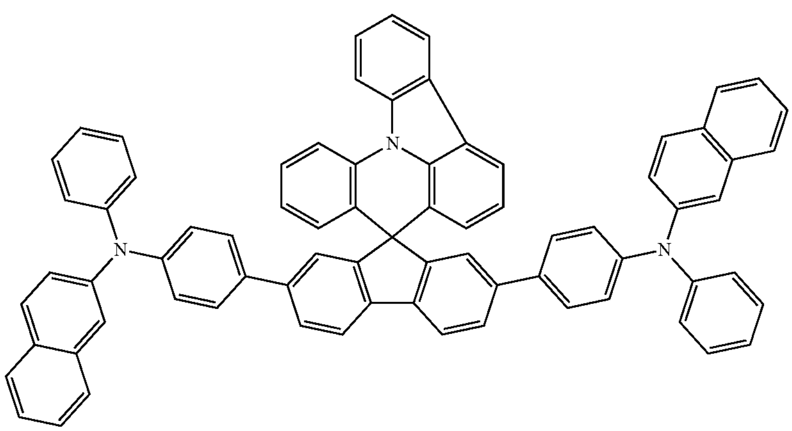

-continued
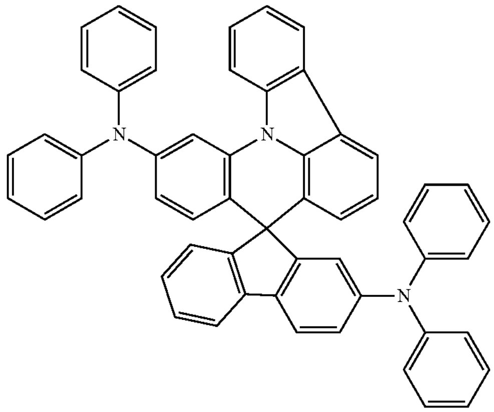
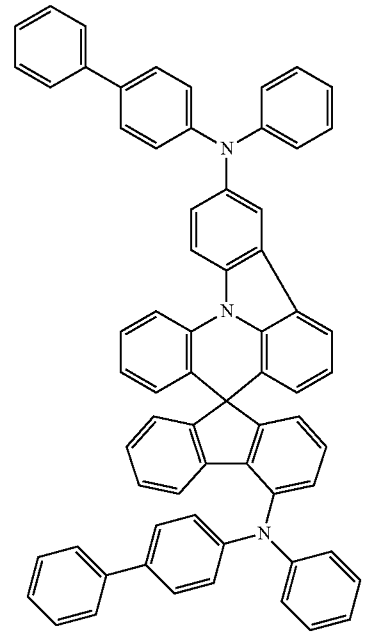
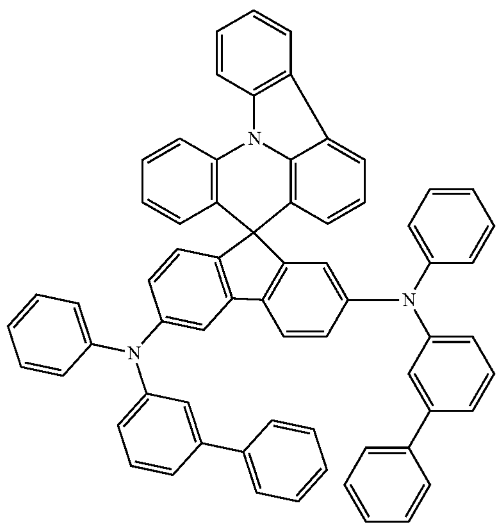
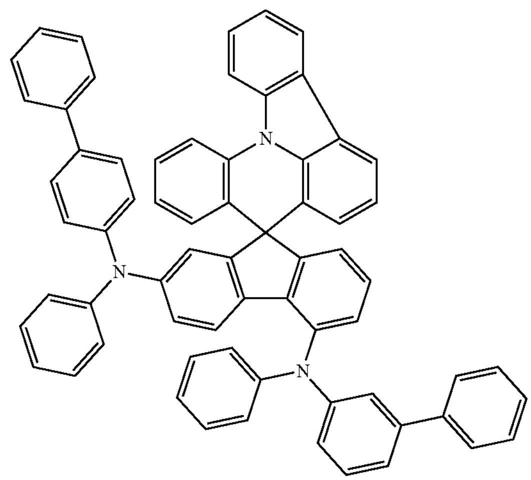
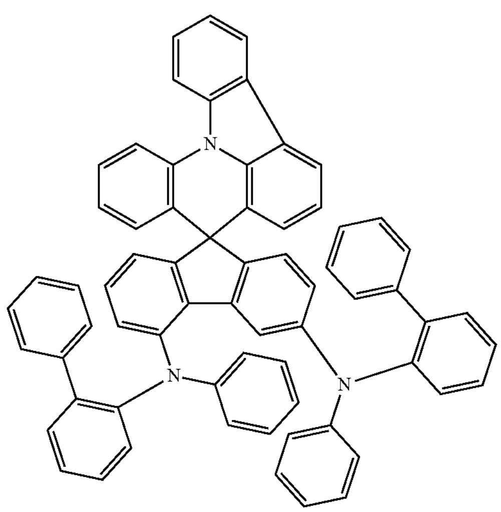
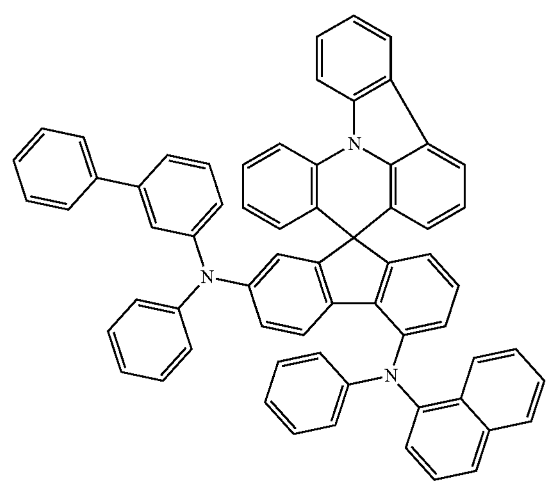

-continued
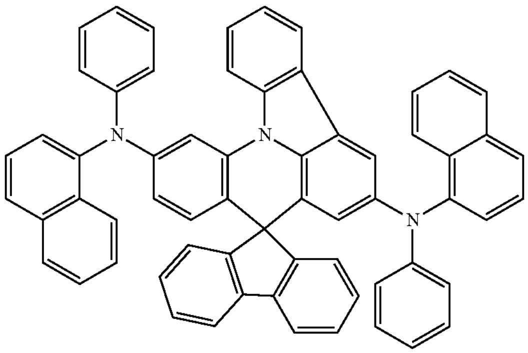
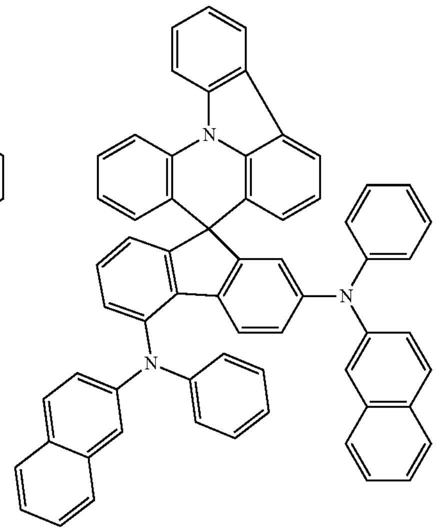
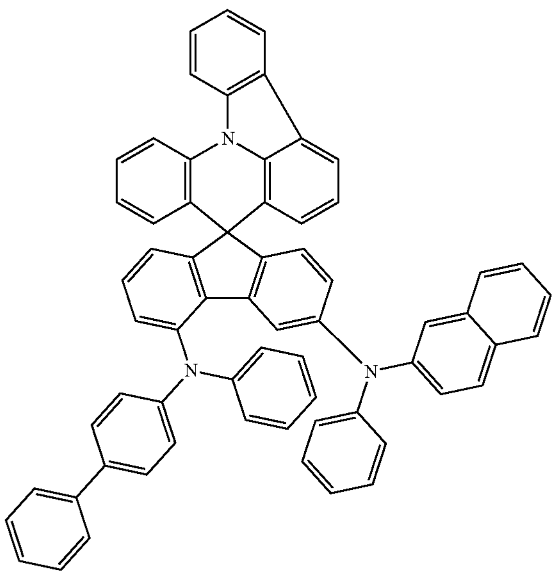
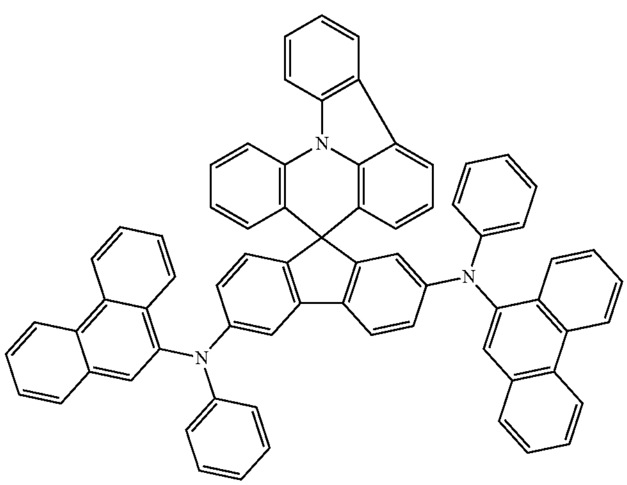

-continued
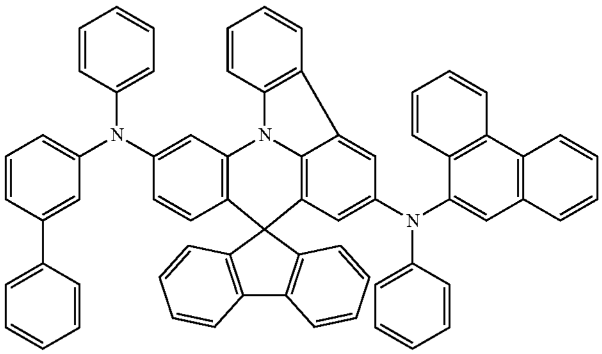
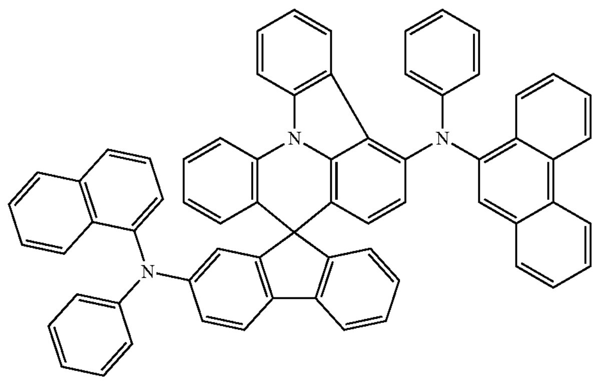
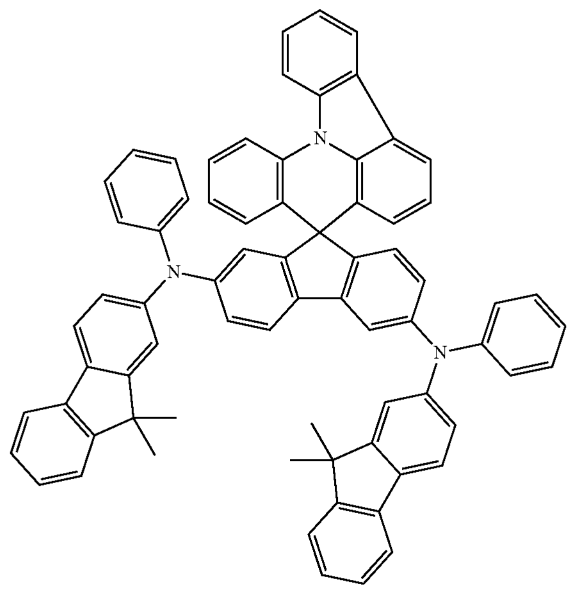
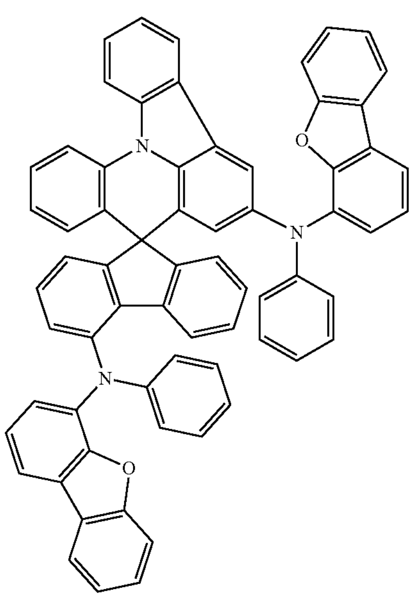
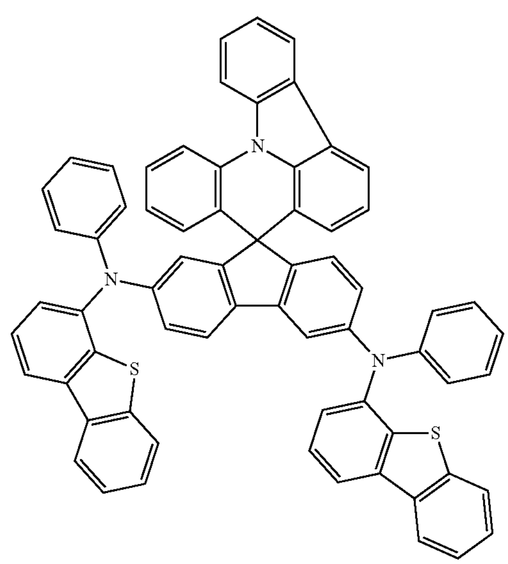

-continued
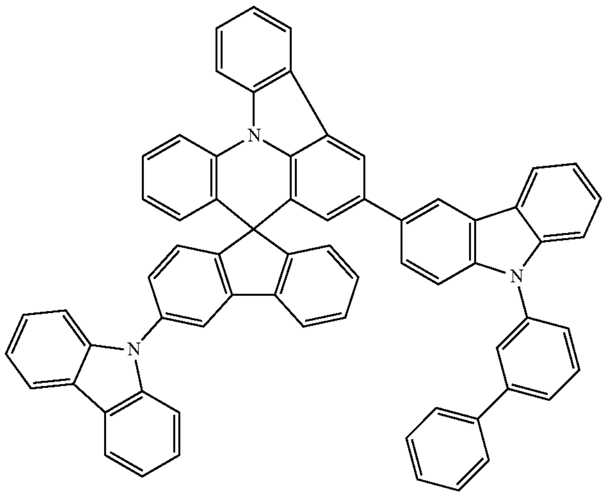
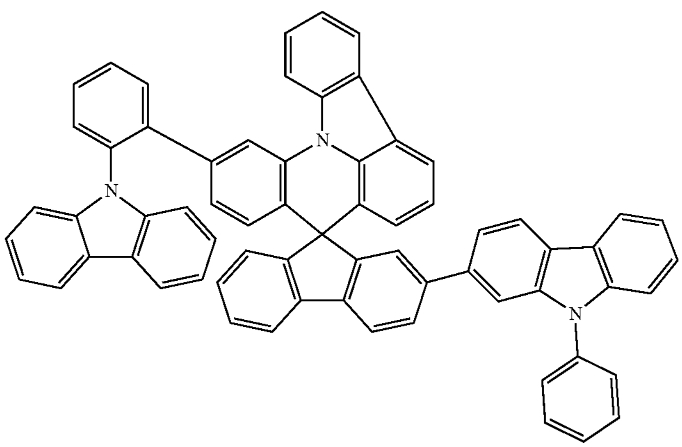
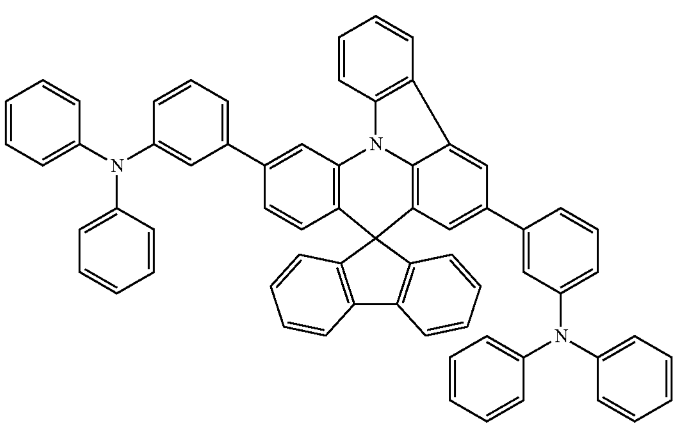

-continued
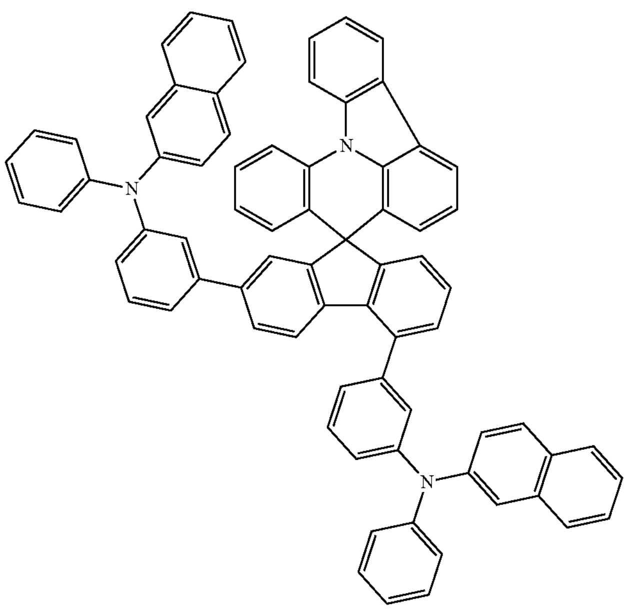
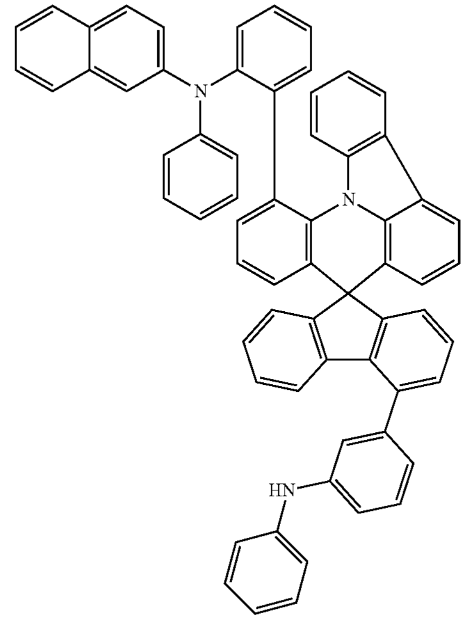
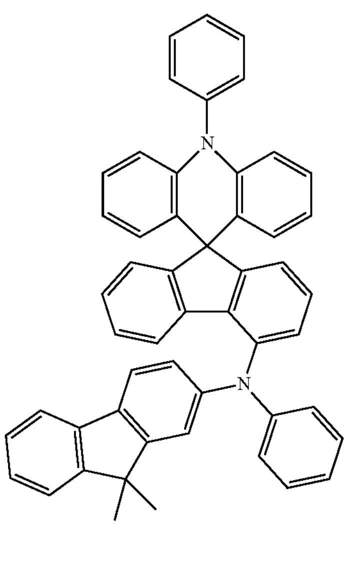
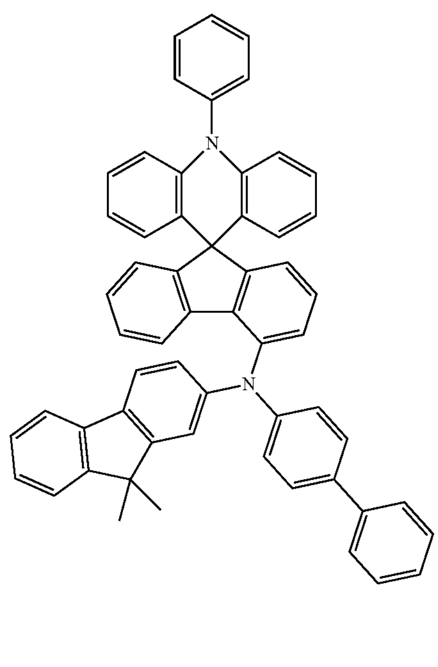
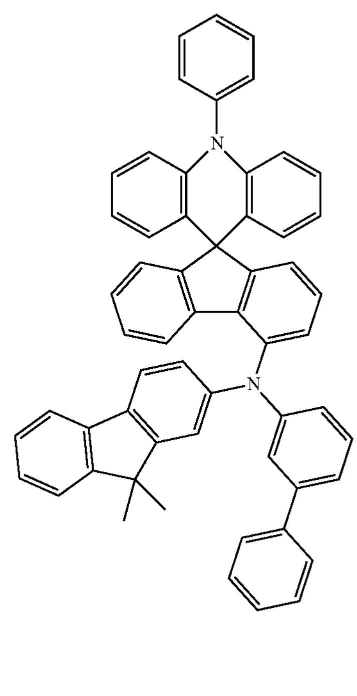

-continued
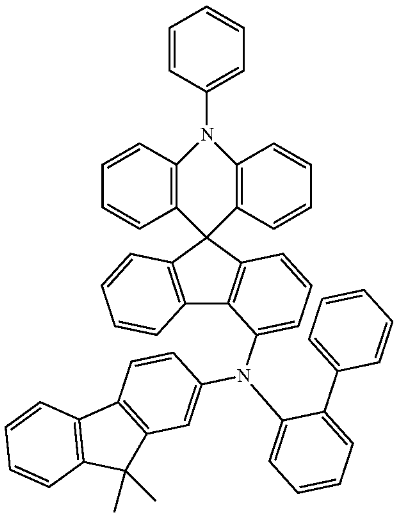
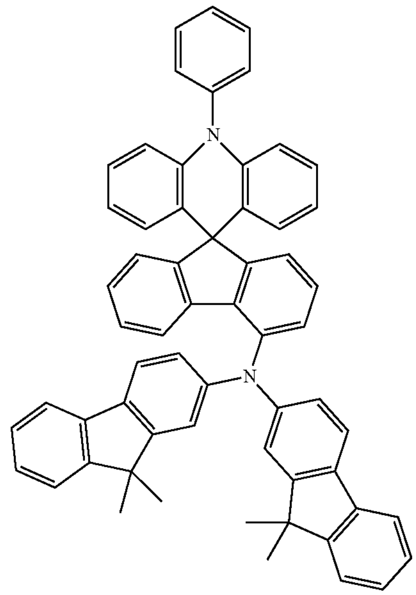
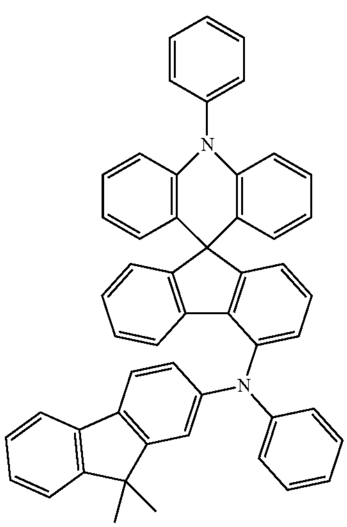
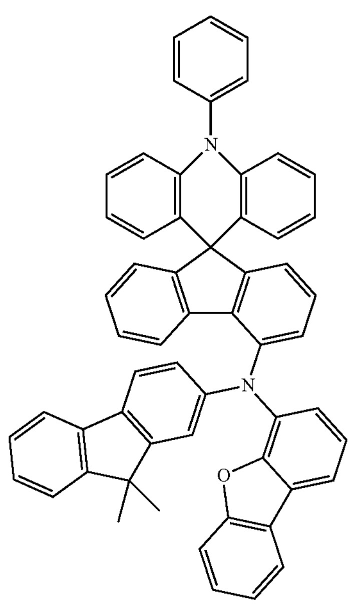
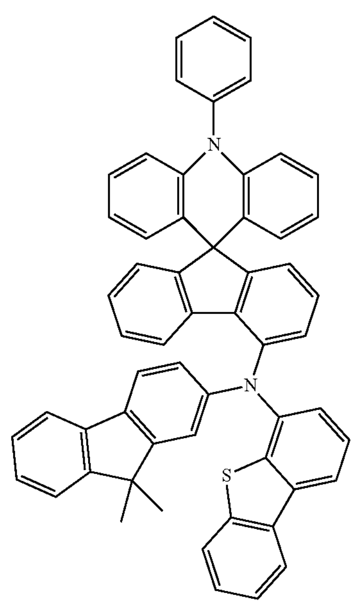

-continued
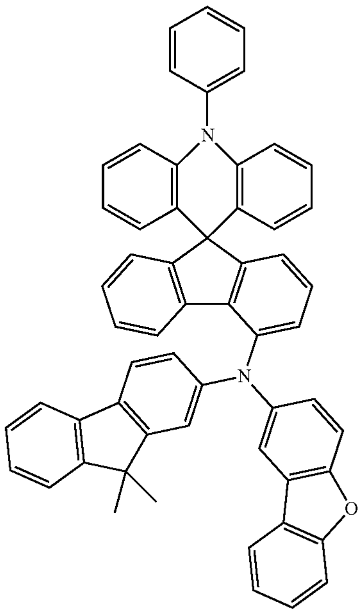
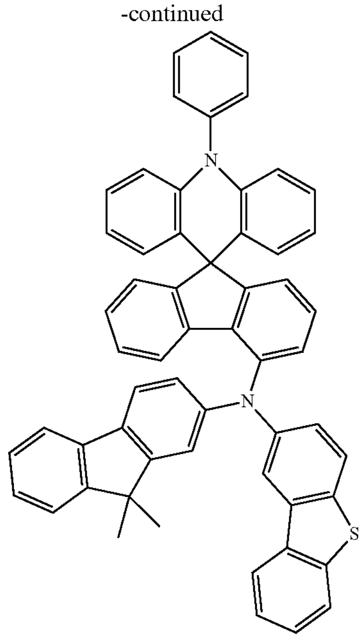
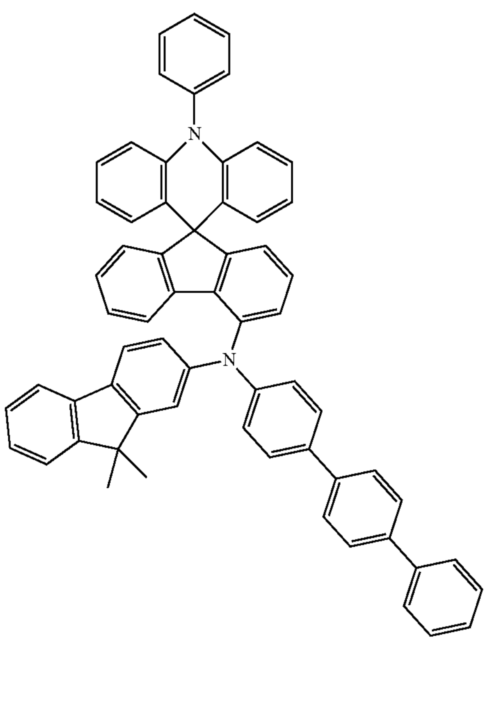
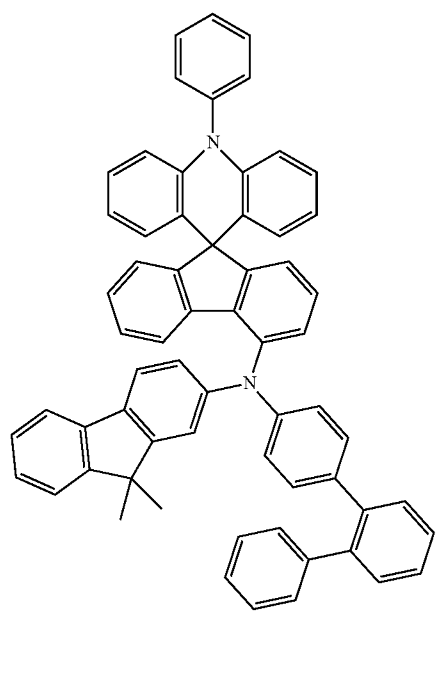

-continued
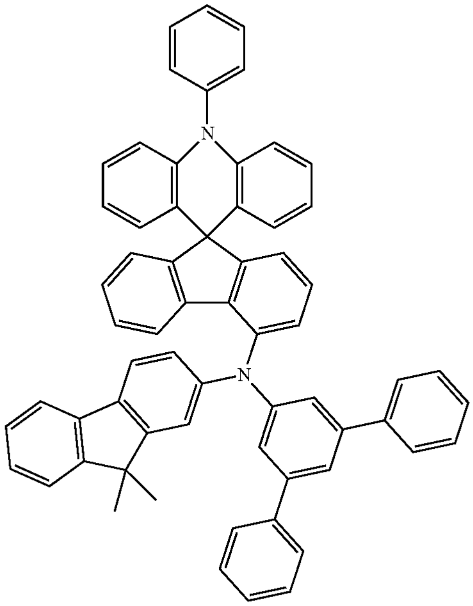
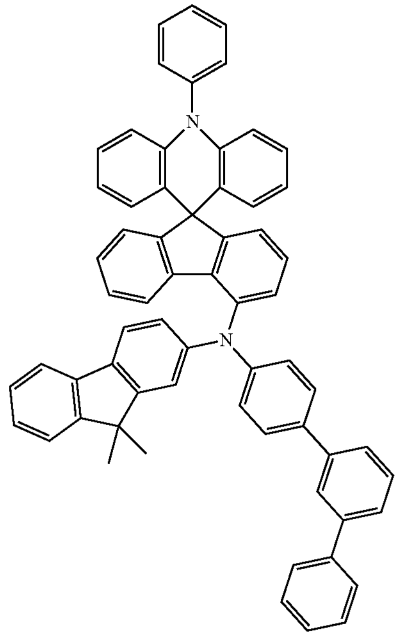
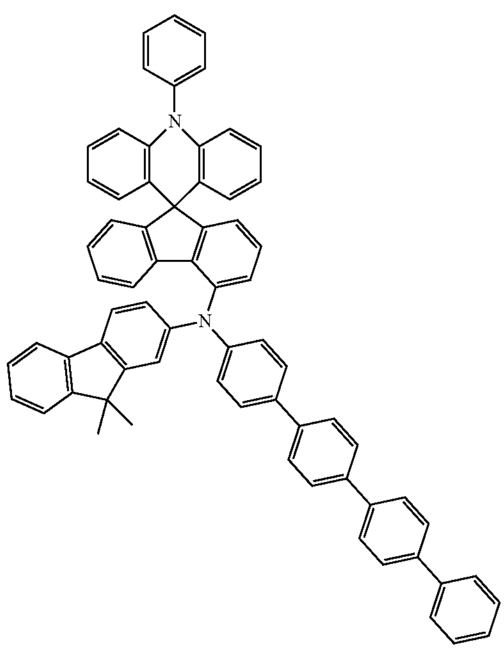
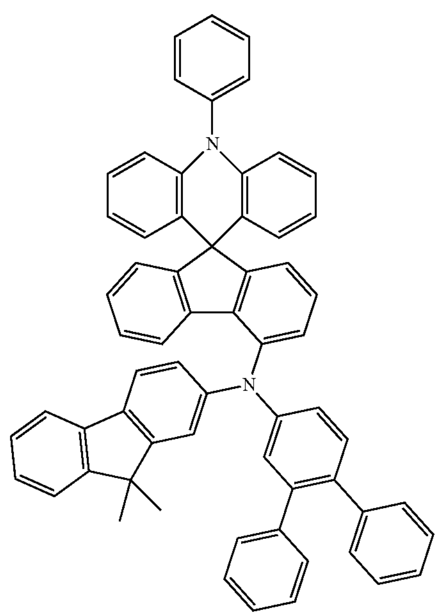

-continued
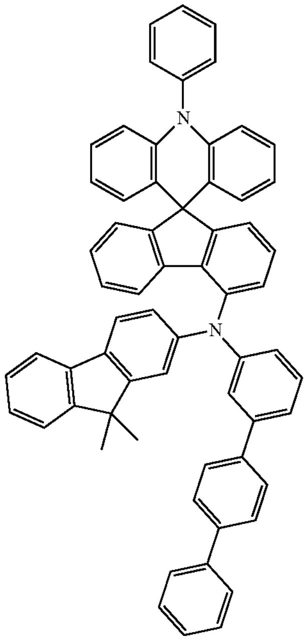
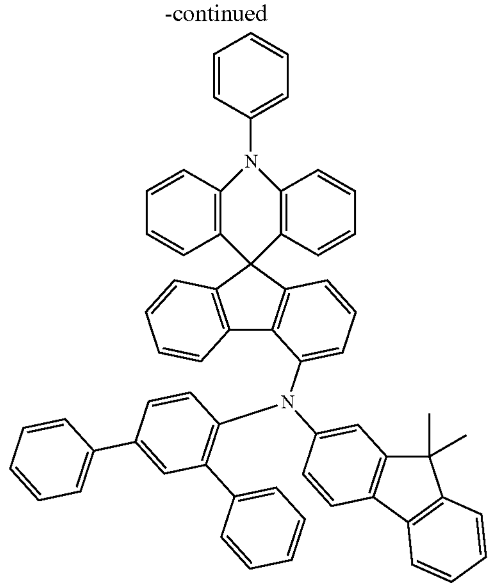
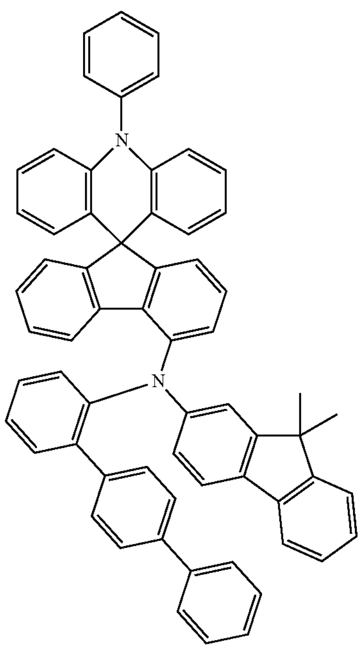
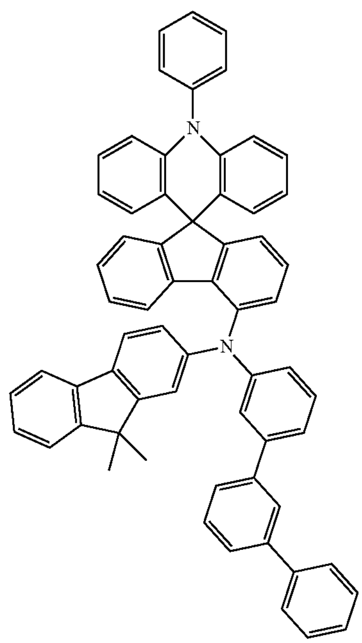

-continued
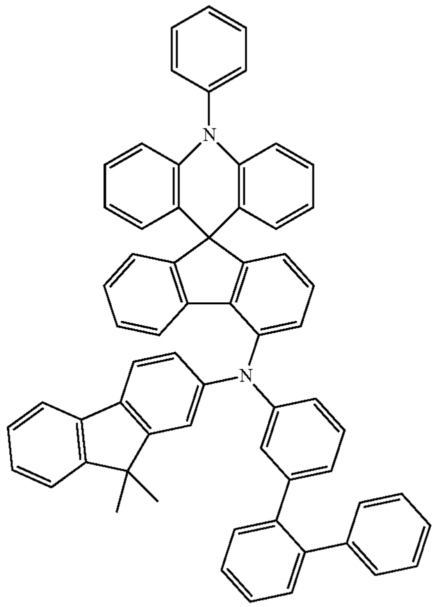
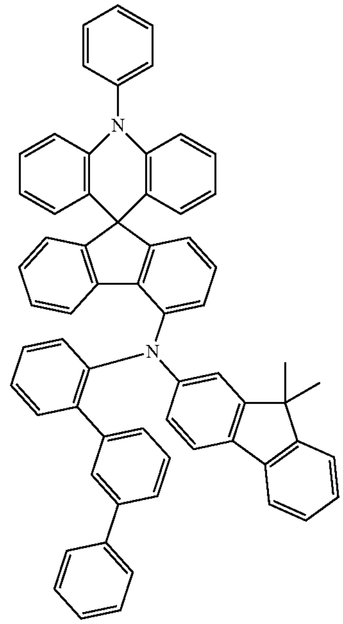
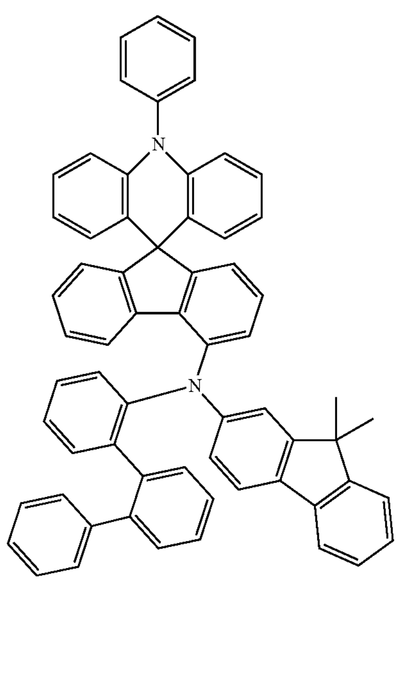
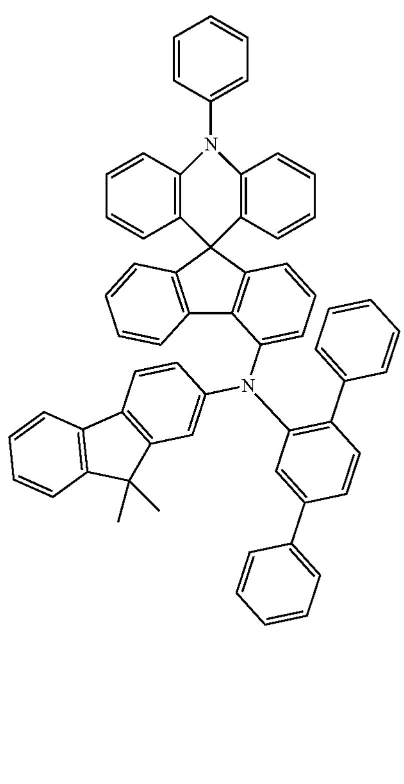

-continued
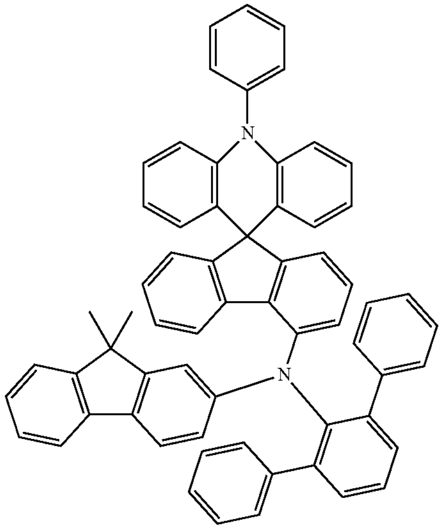
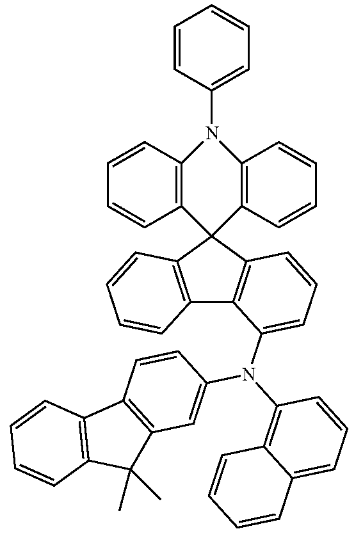
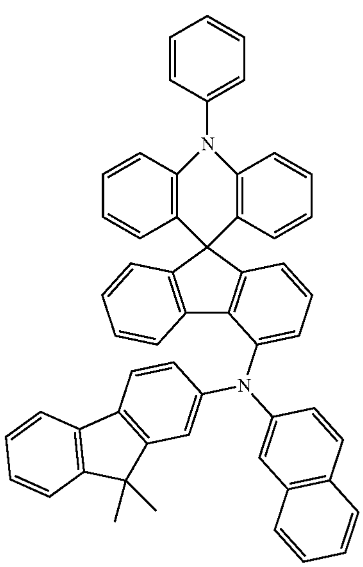
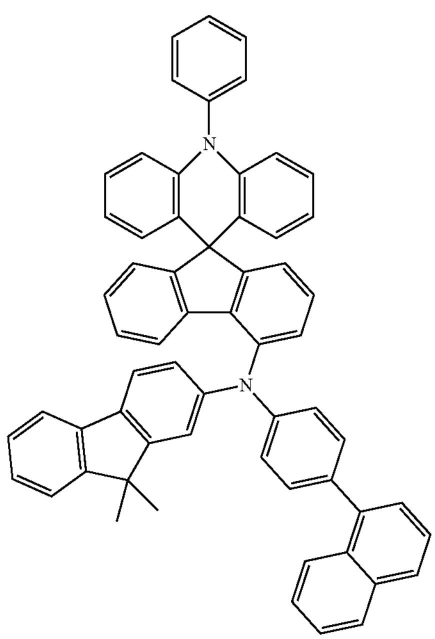

-continued
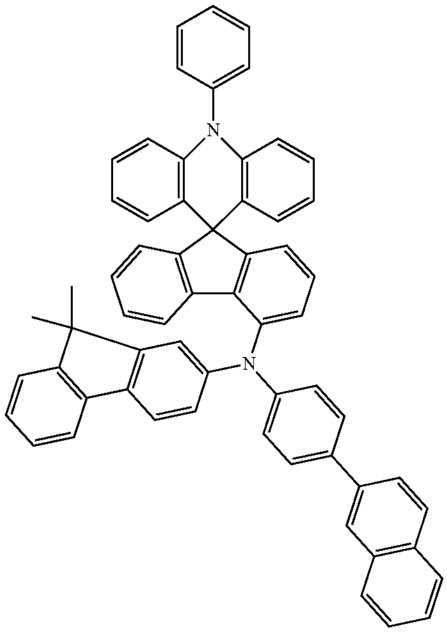
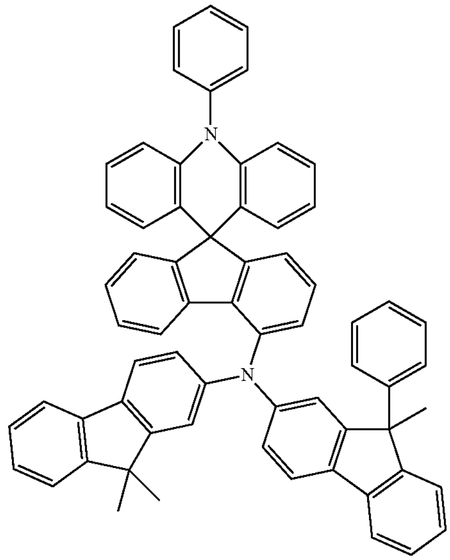
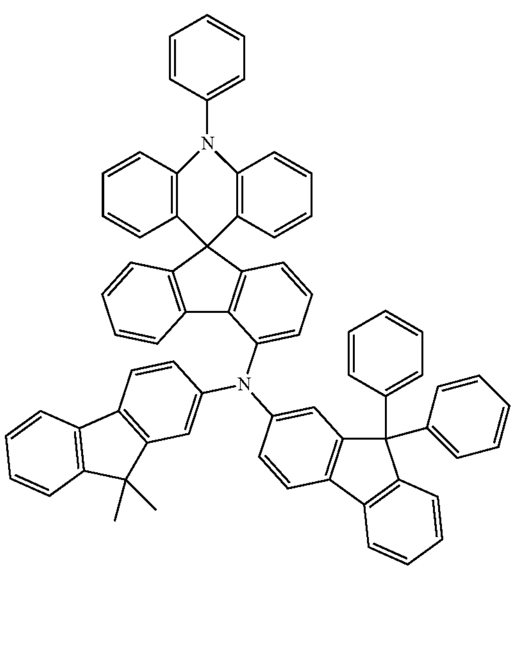
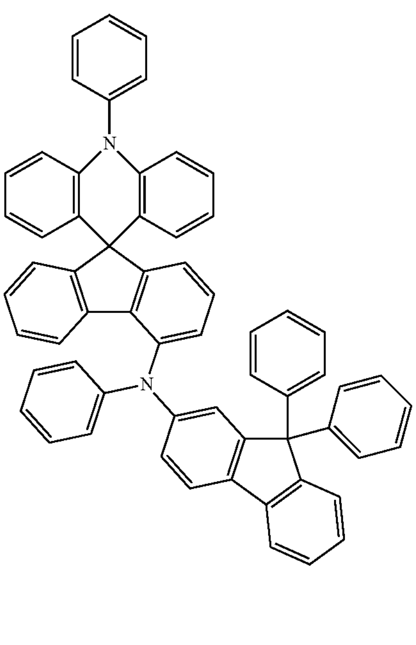

-continued
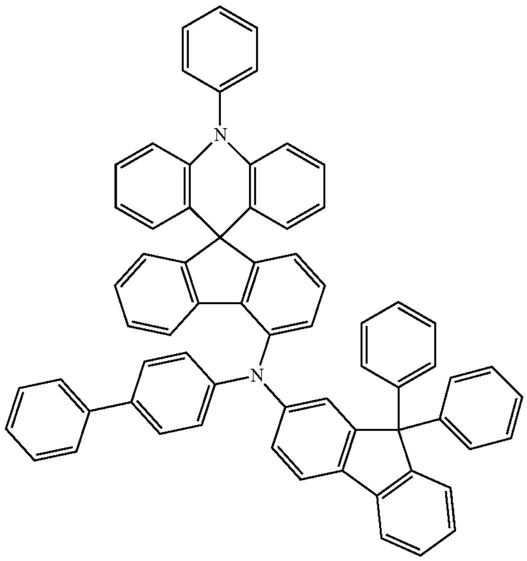
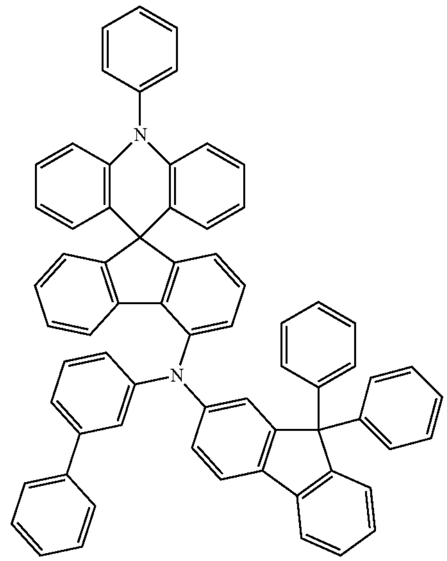
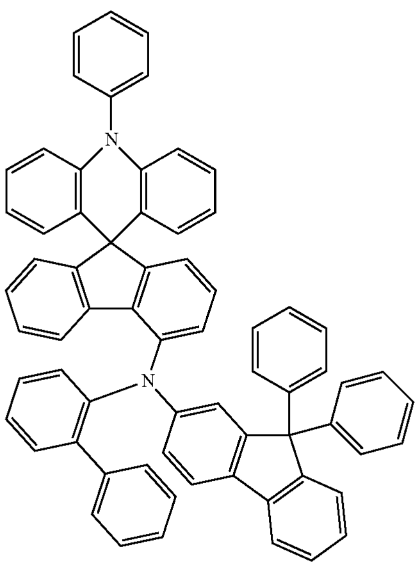
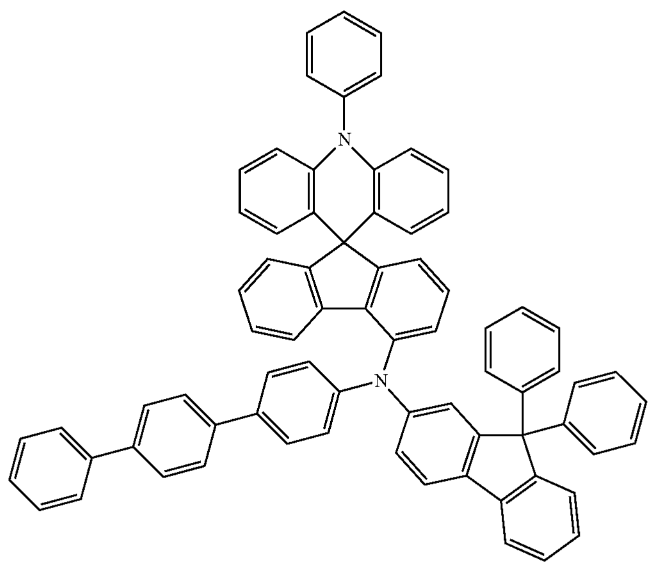
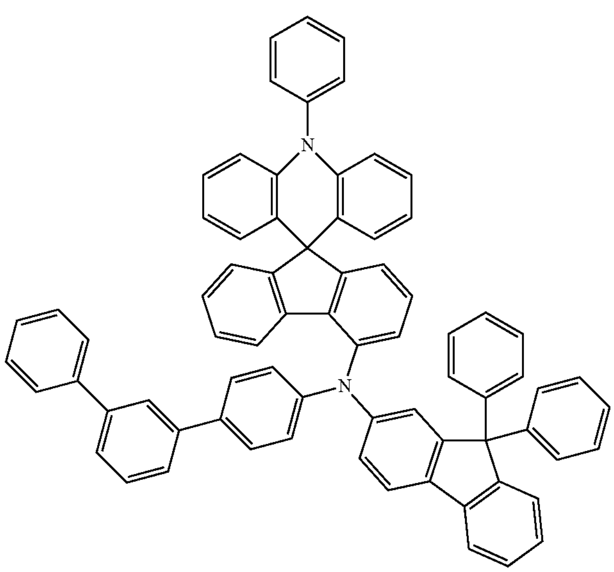
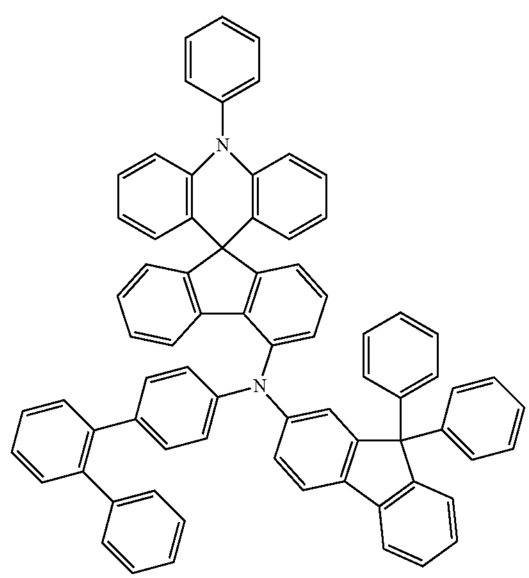

-continued
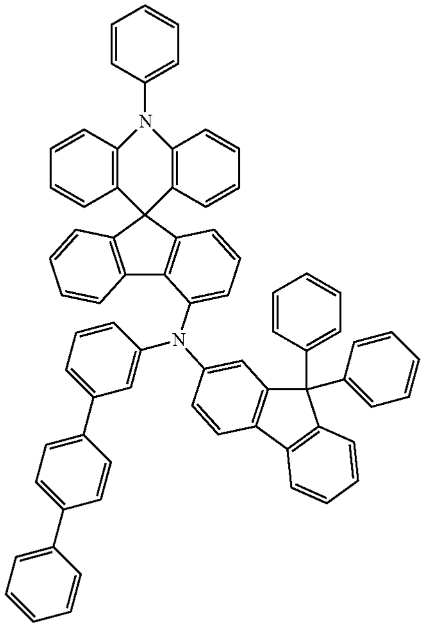
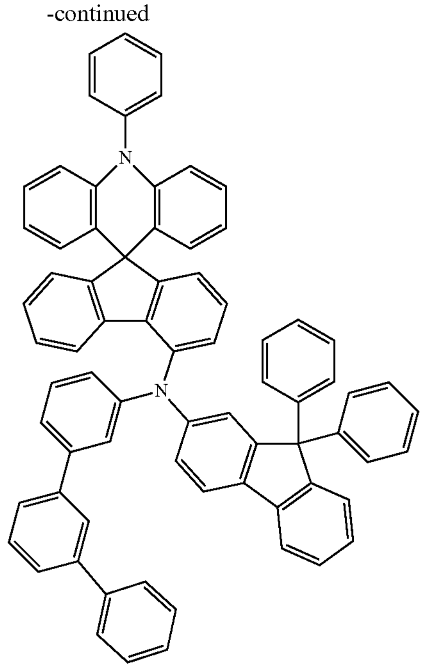
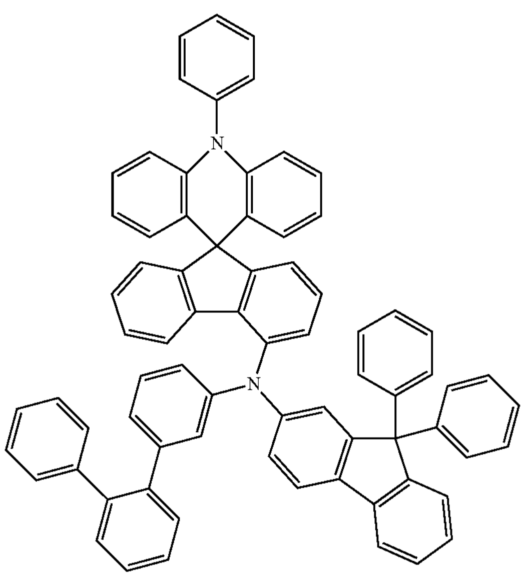
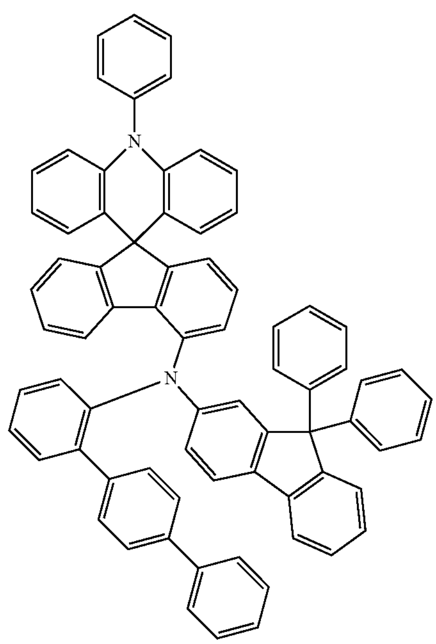

-continued
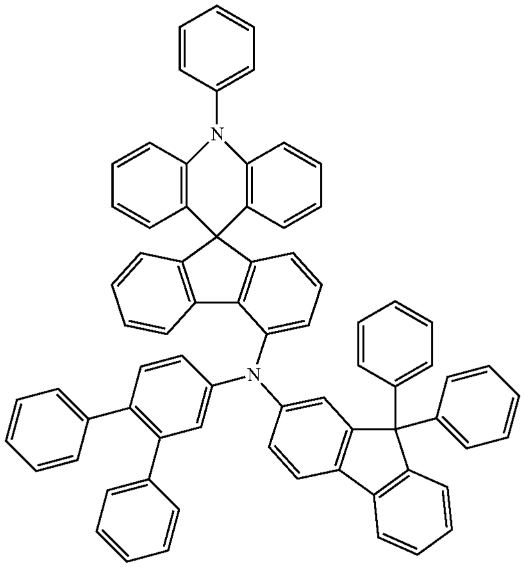
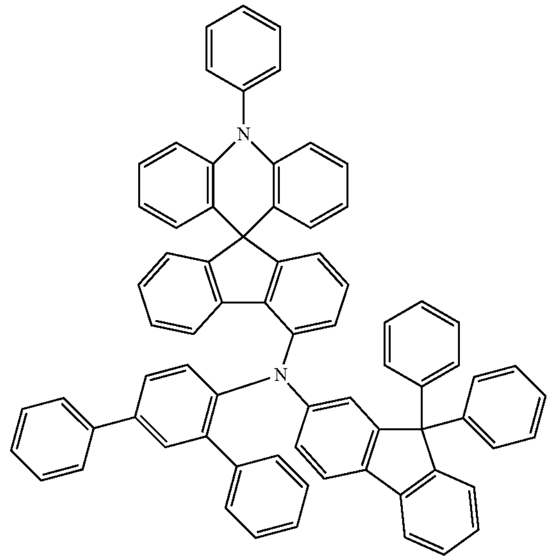
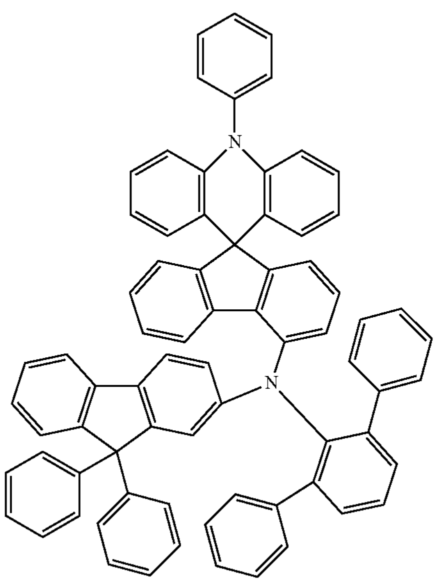
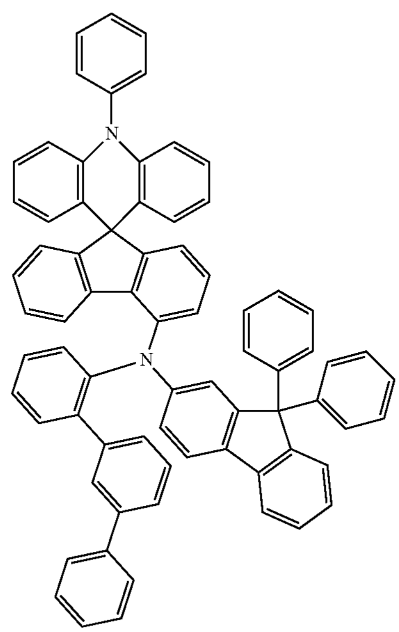

-continued
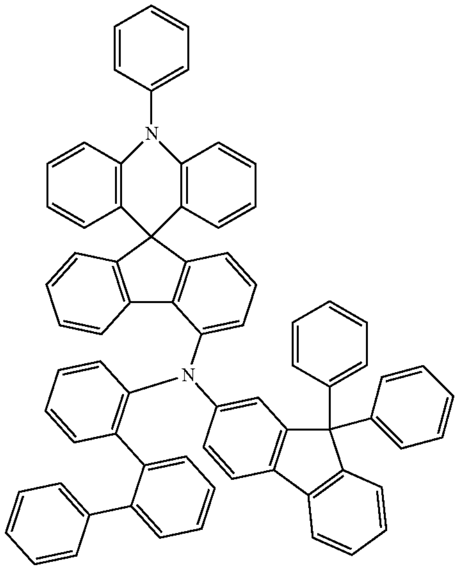
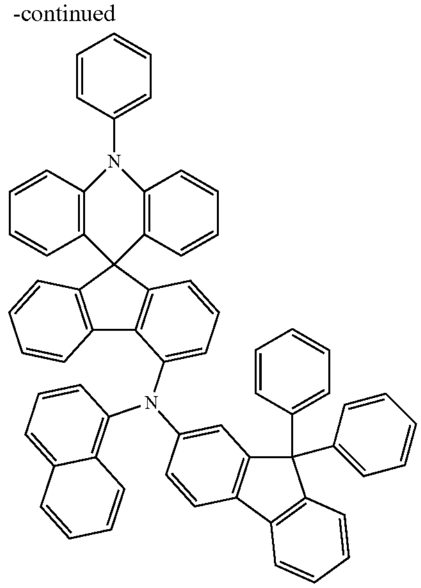
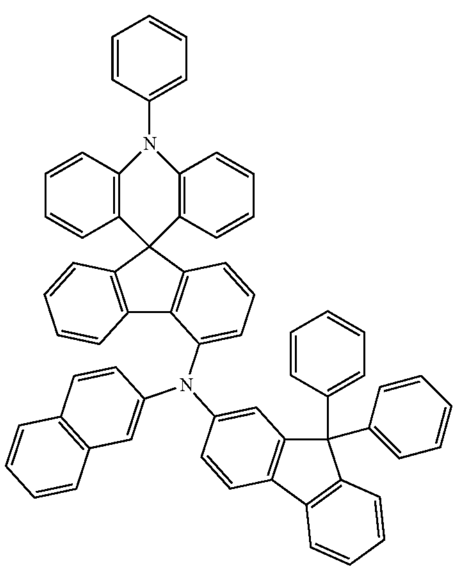
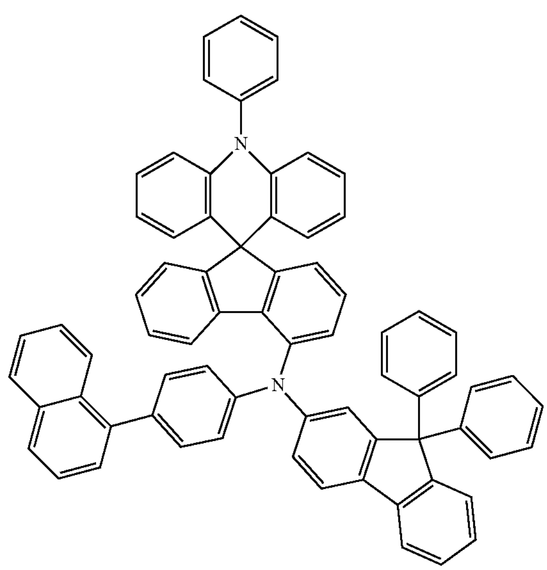

-continued
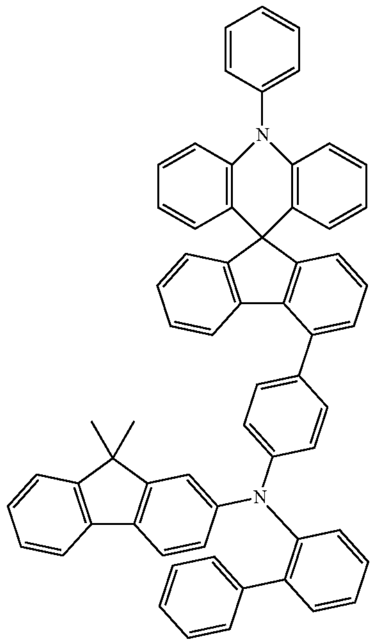
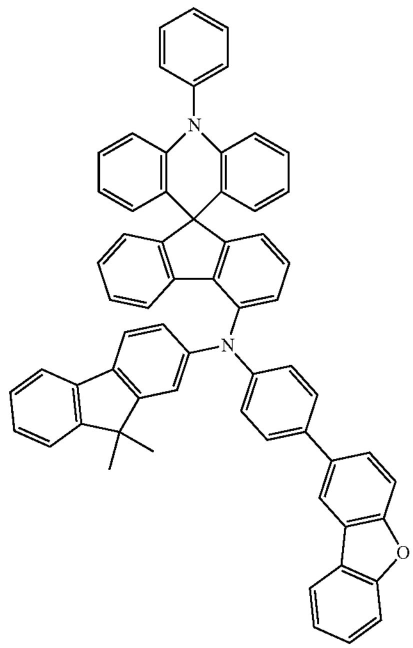
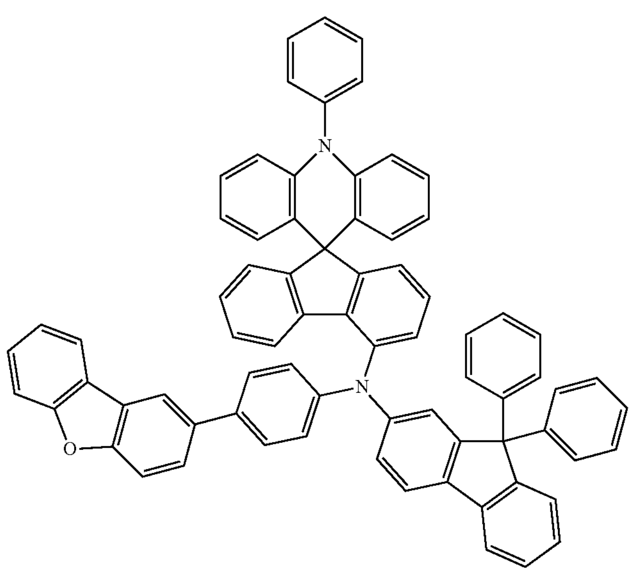
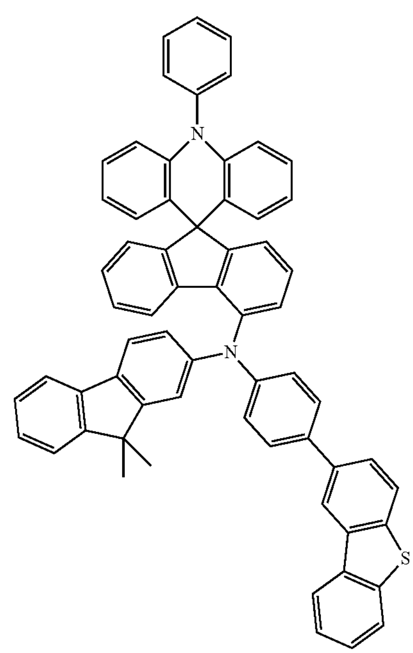

-continued
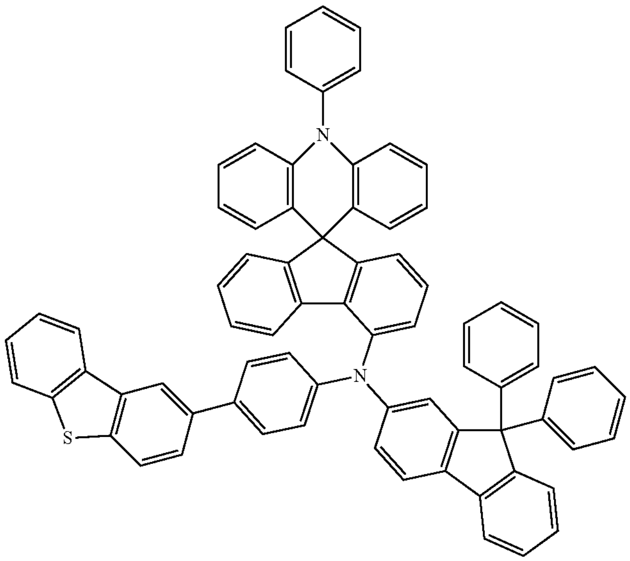
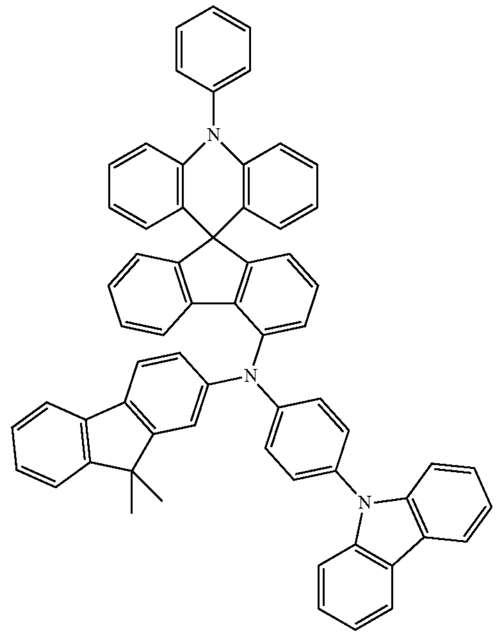
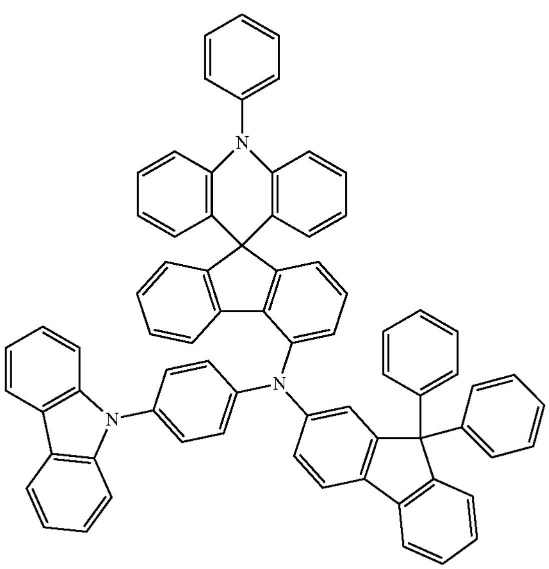
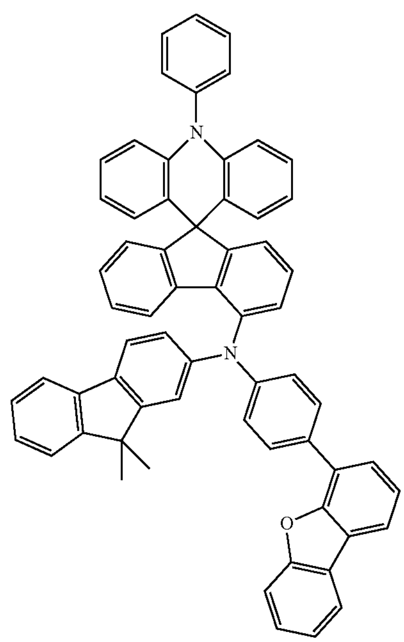

-continued
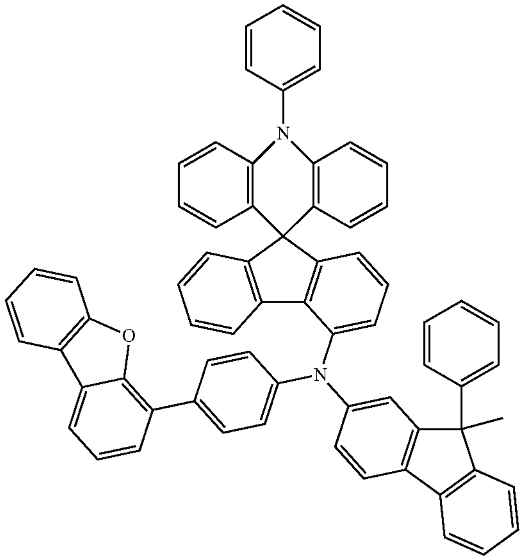
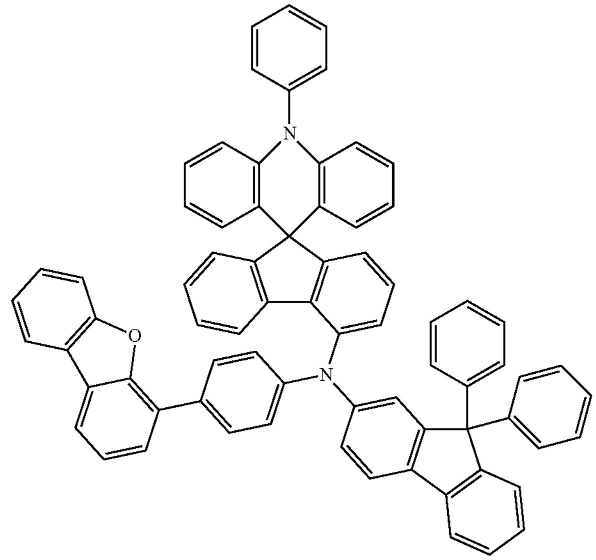
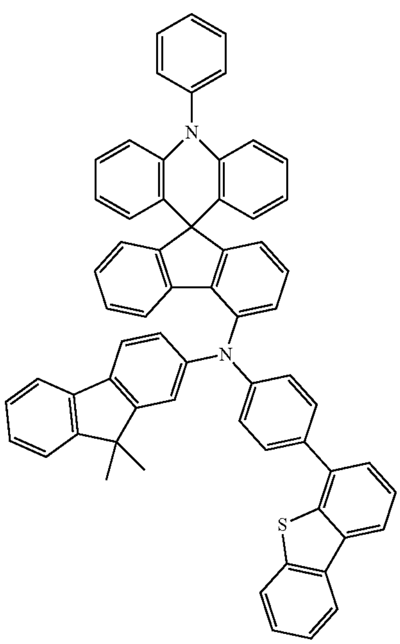
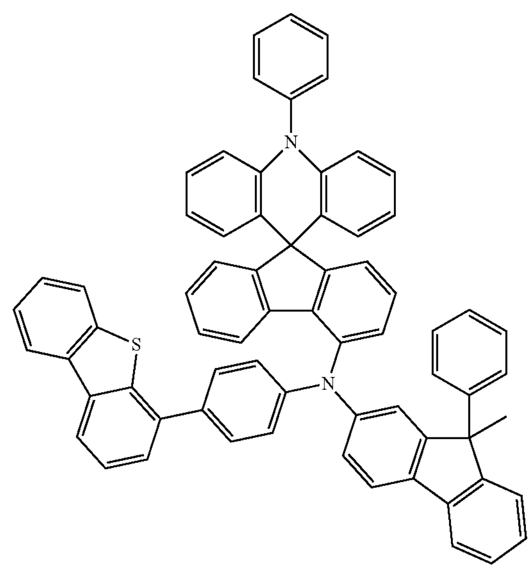

-continued
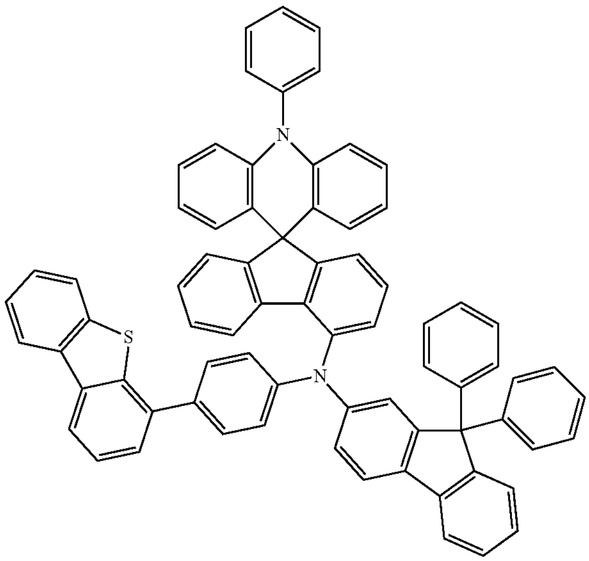
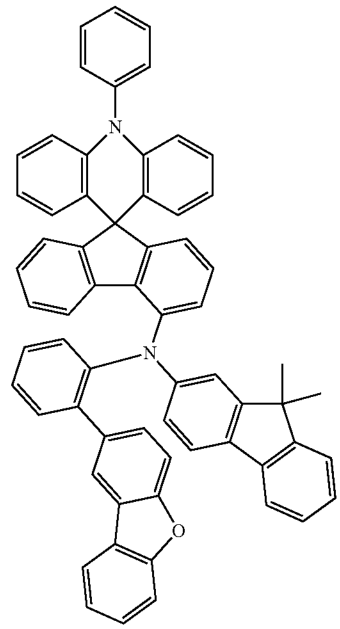
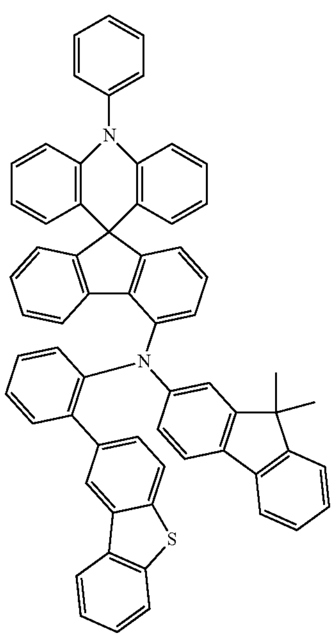
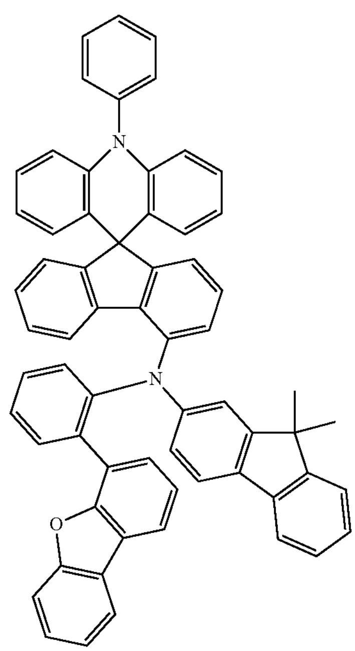
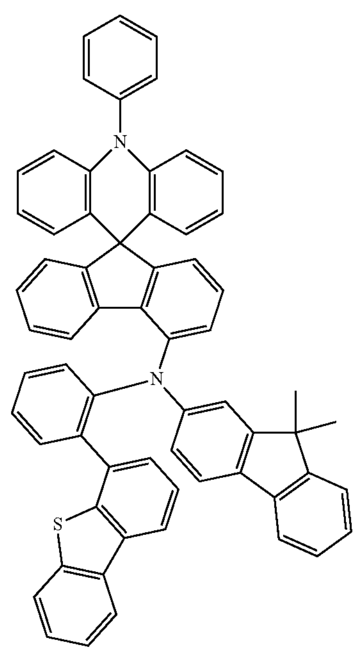

-continued
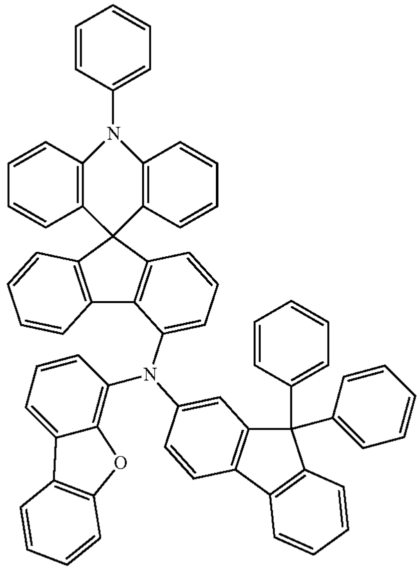
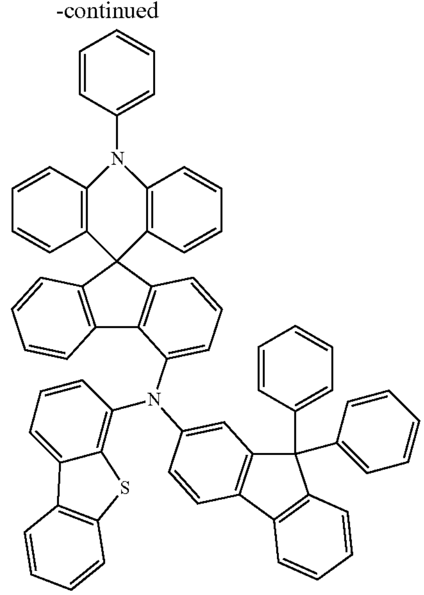
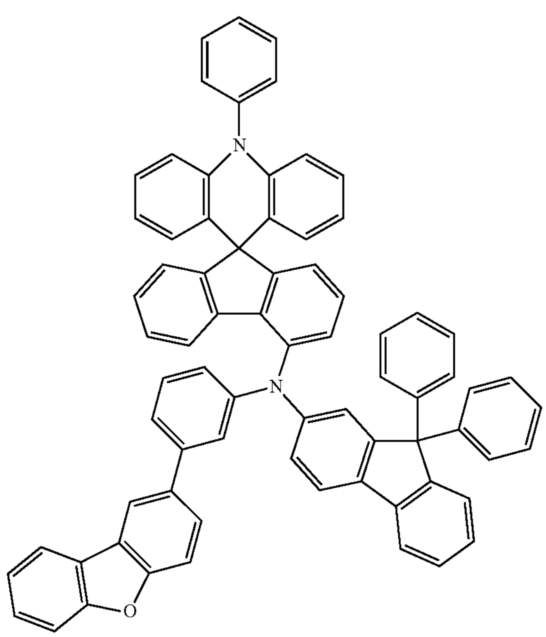
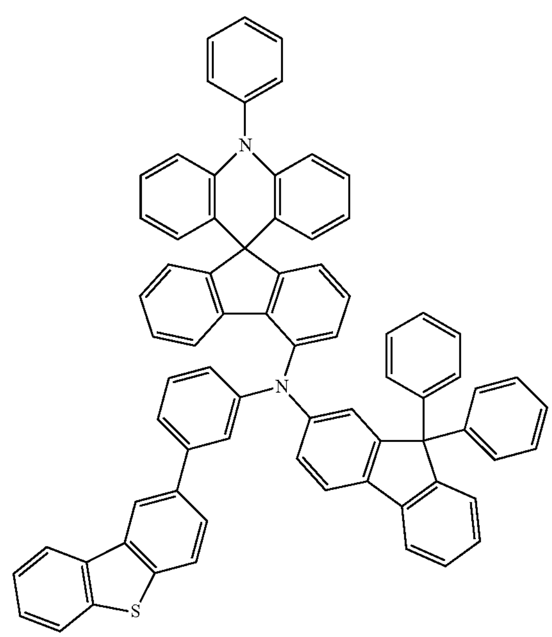

-continued
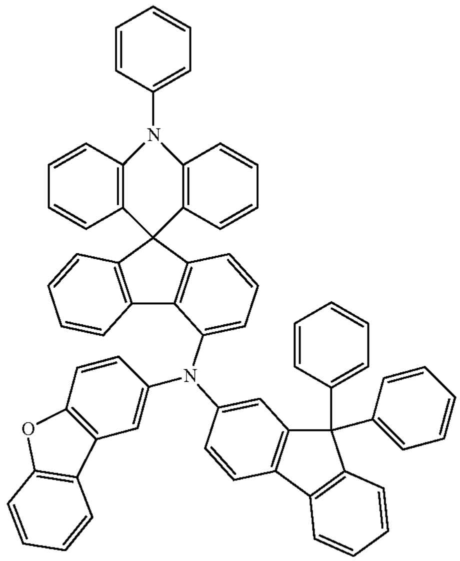
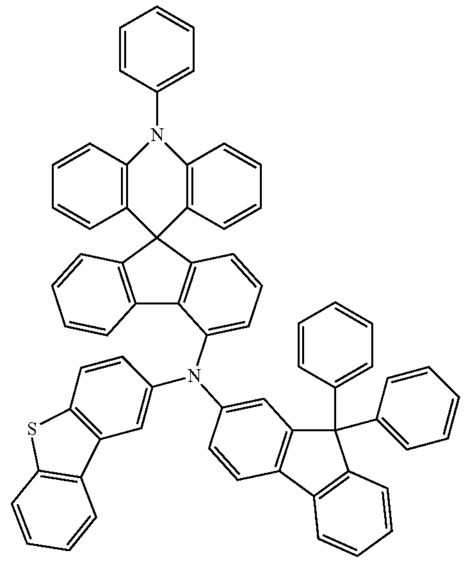
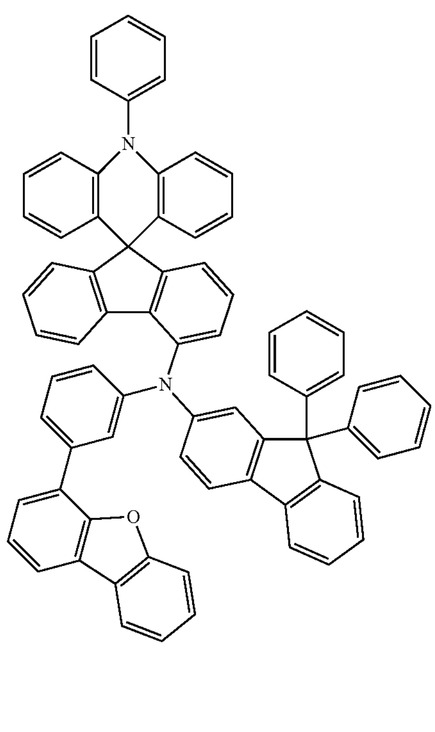
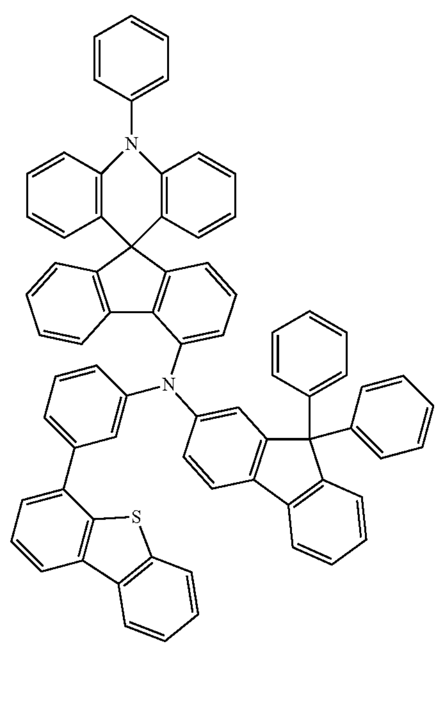

-continued
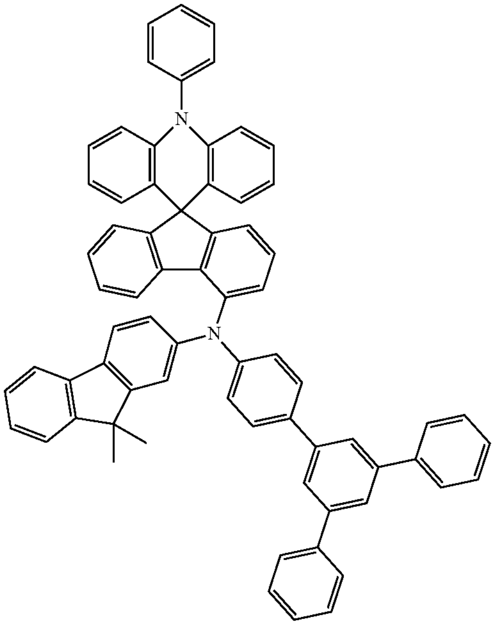
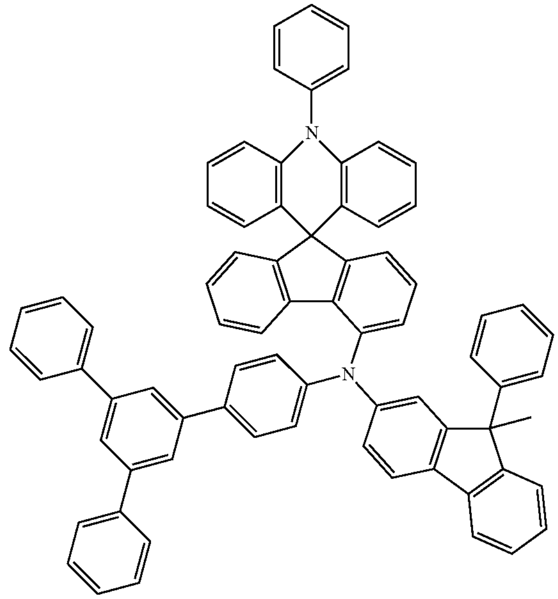
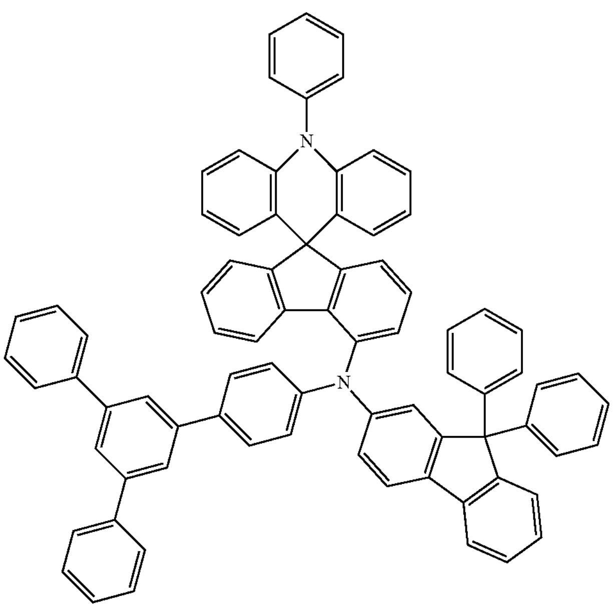
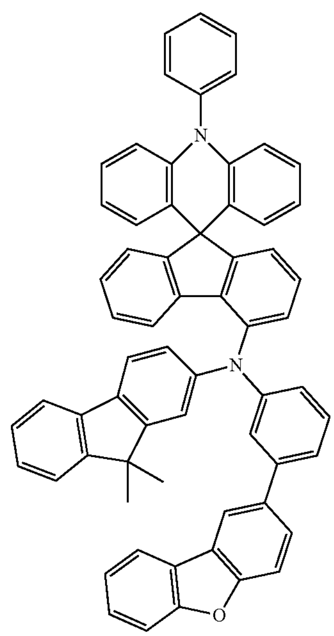

-continued
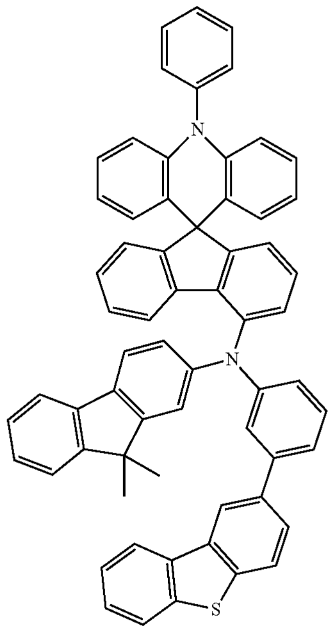
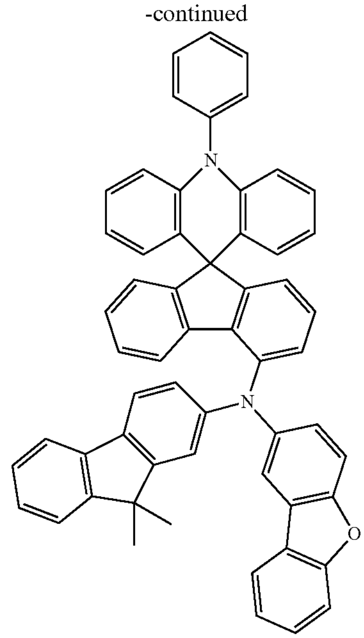
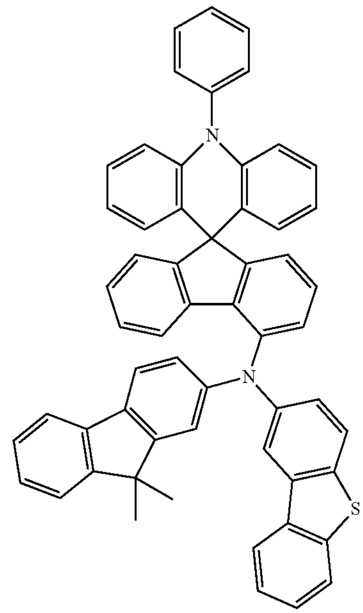
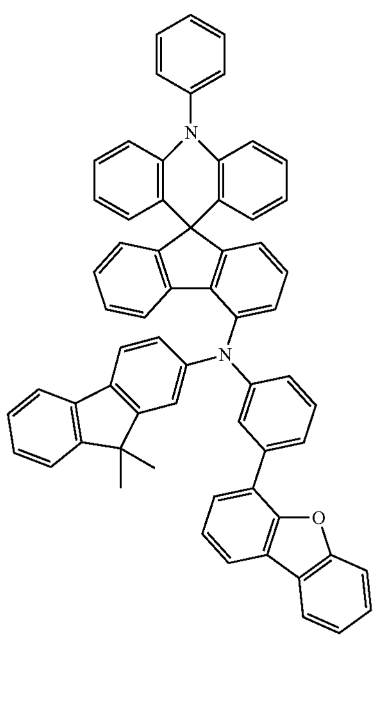
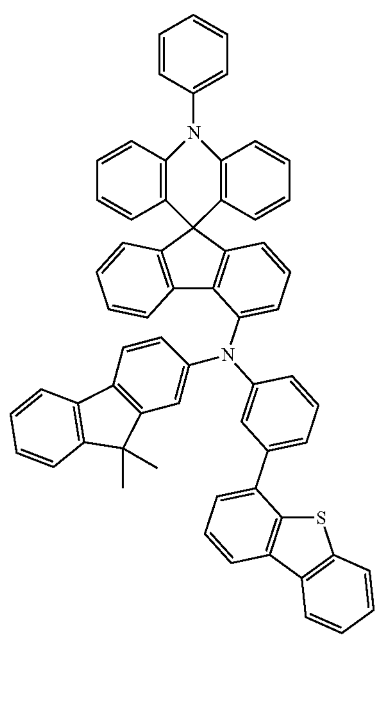

-continued
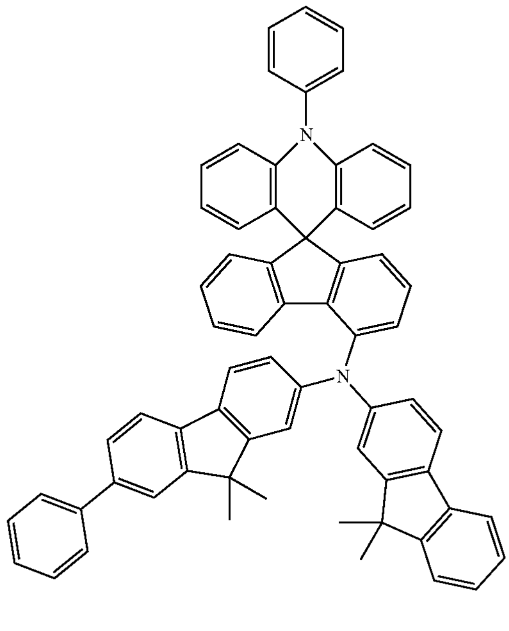
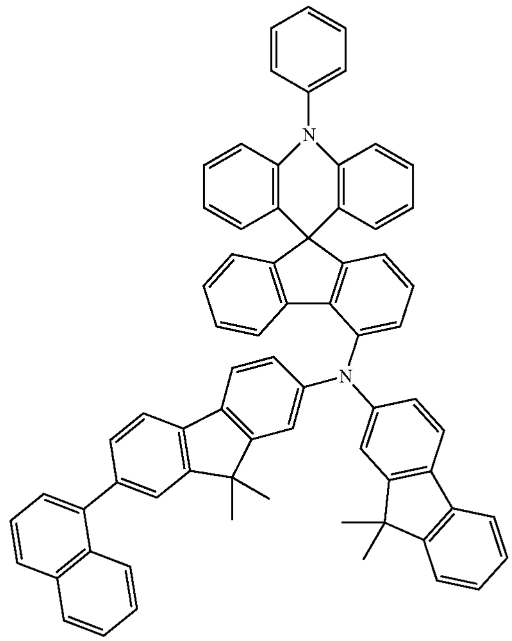
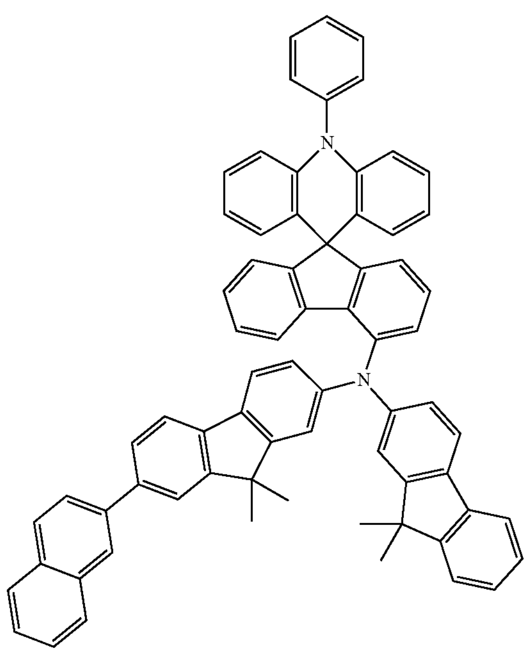
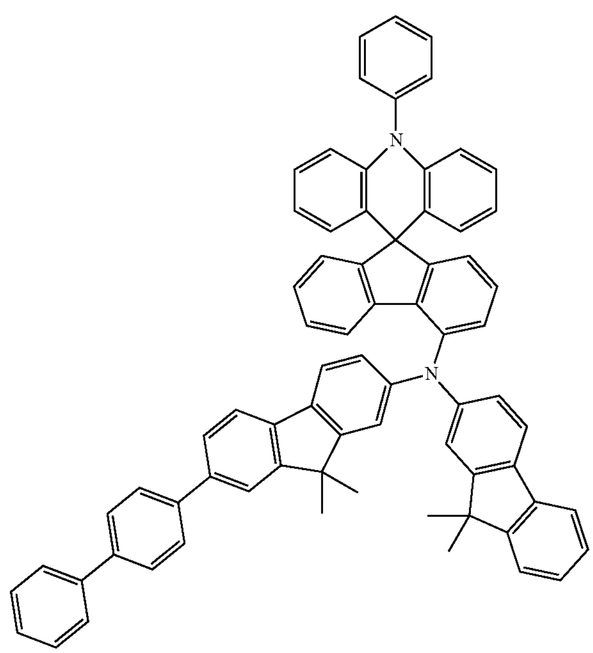

-continued
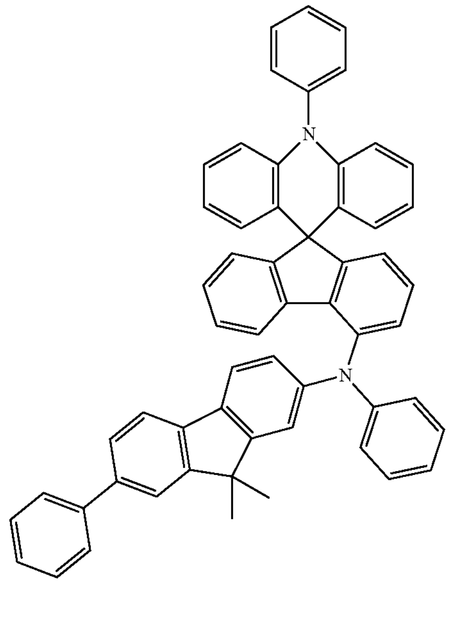
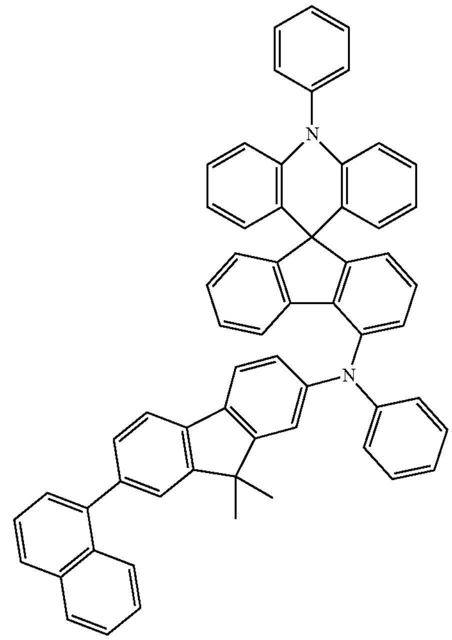
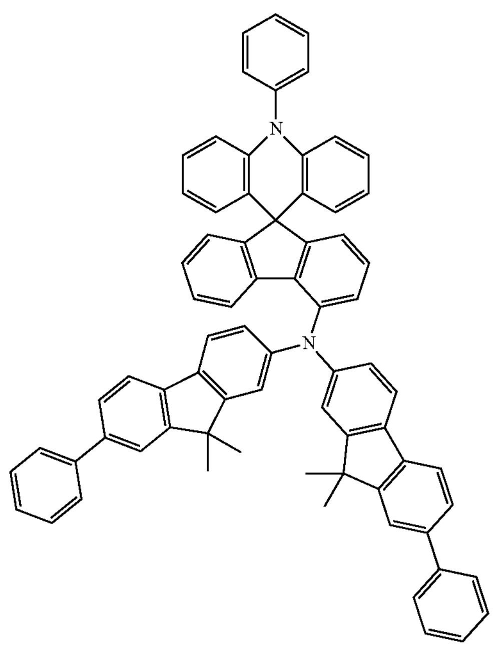
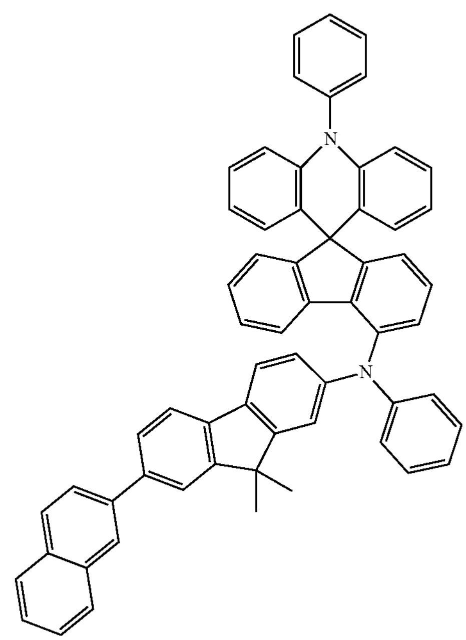

-continued
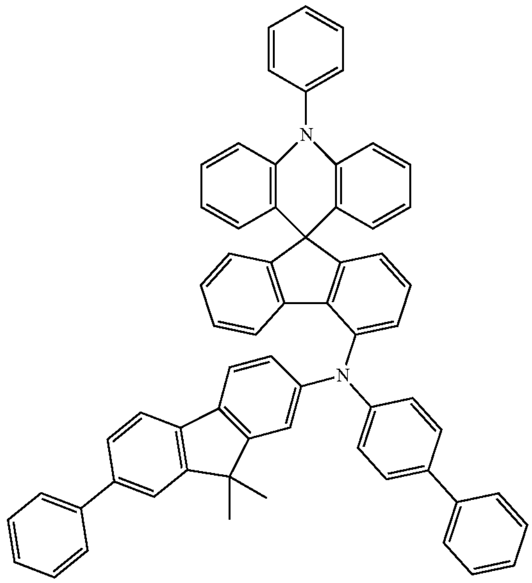
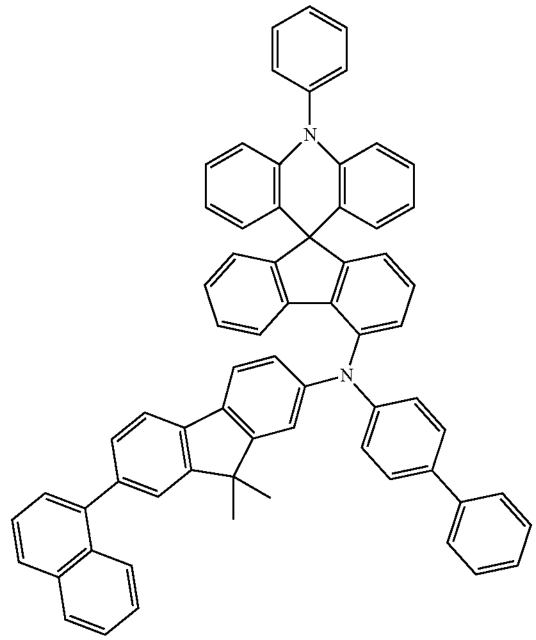
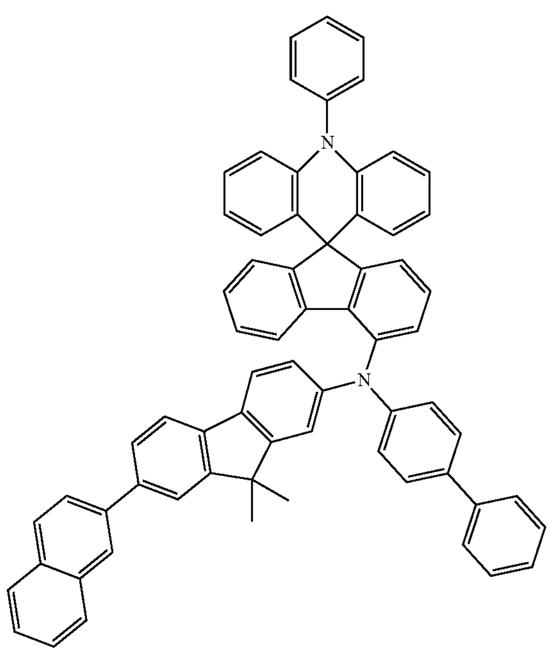
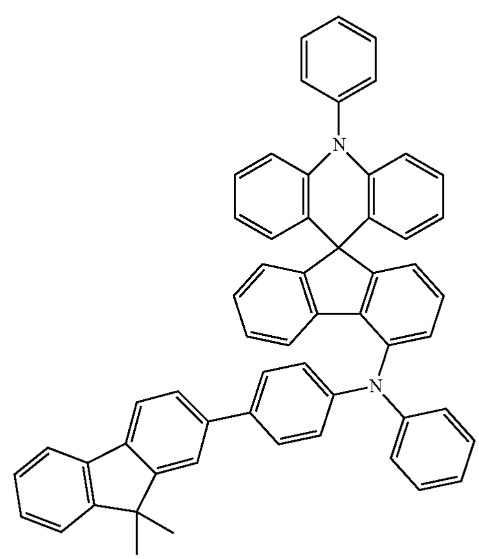

-continued
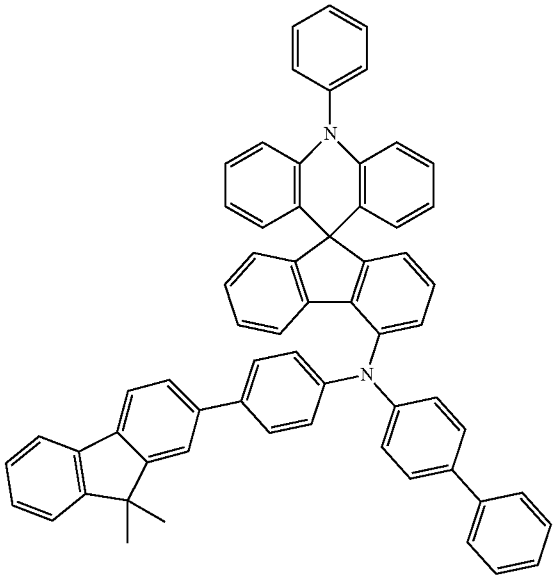
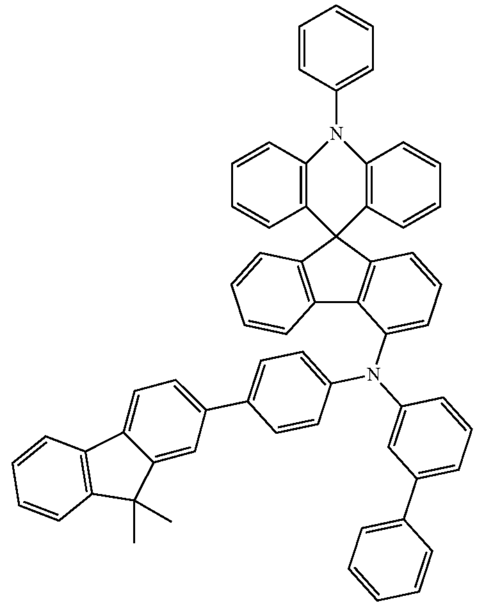
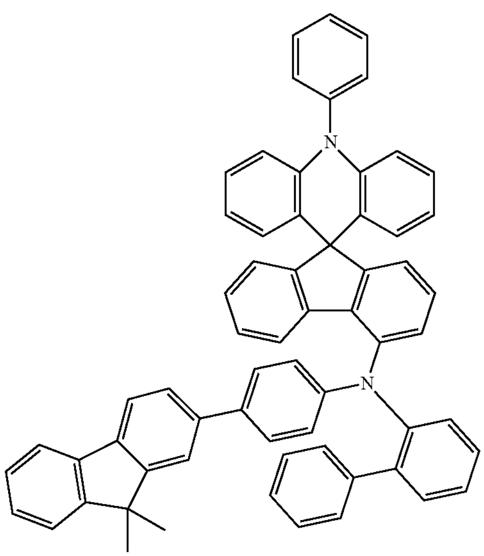
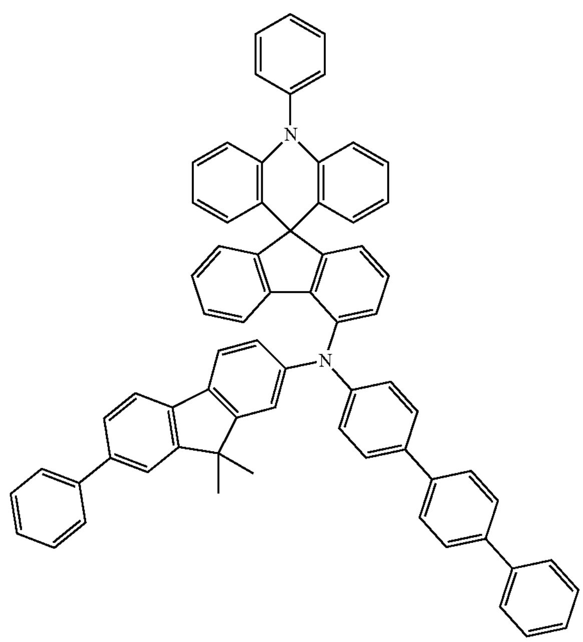

-continued
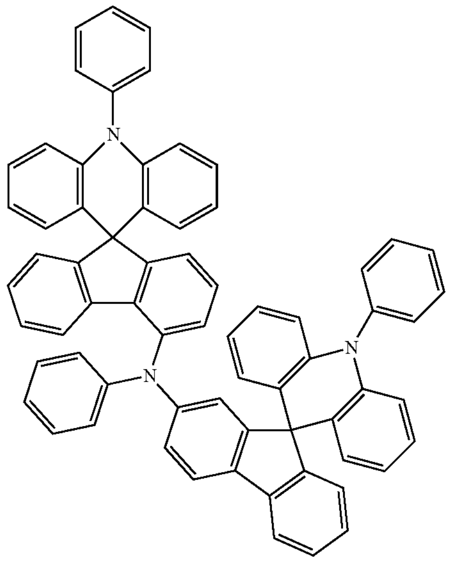
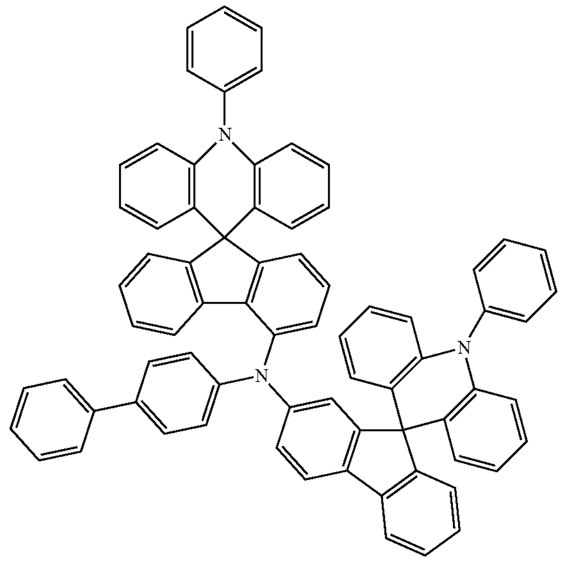
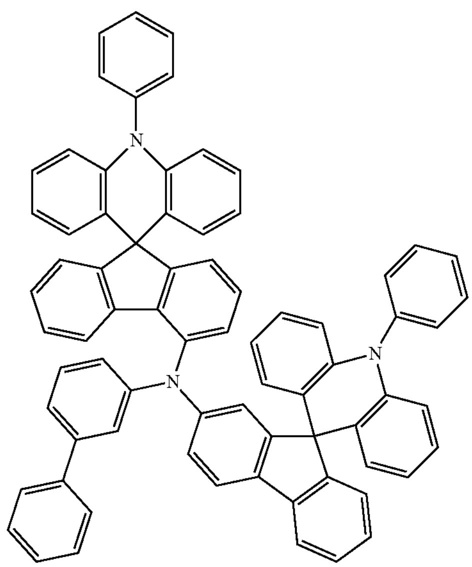
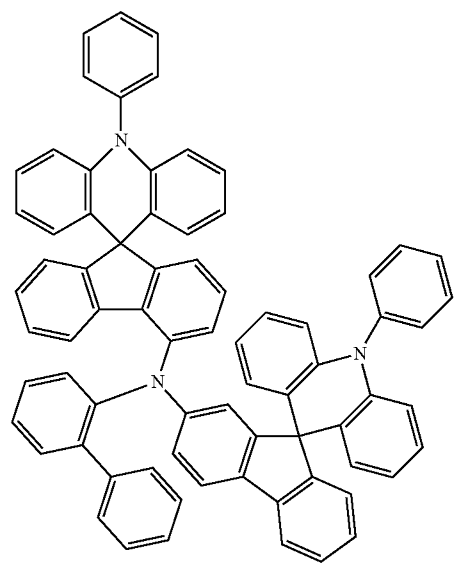
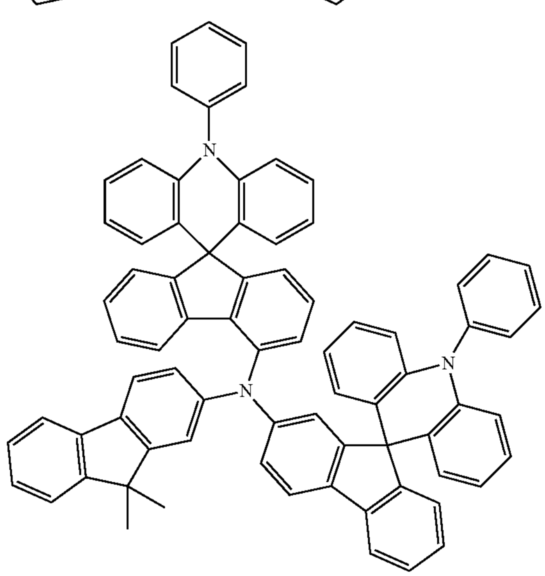
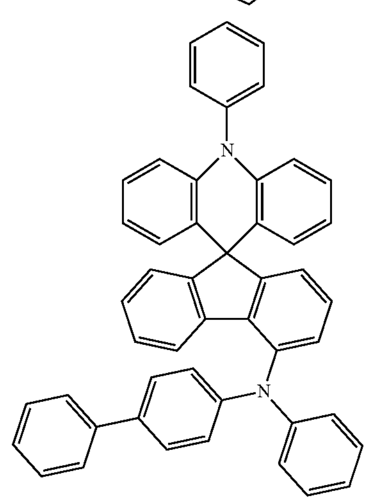

-continued
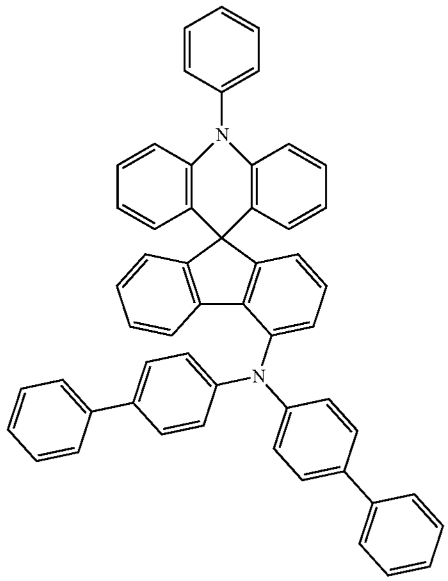
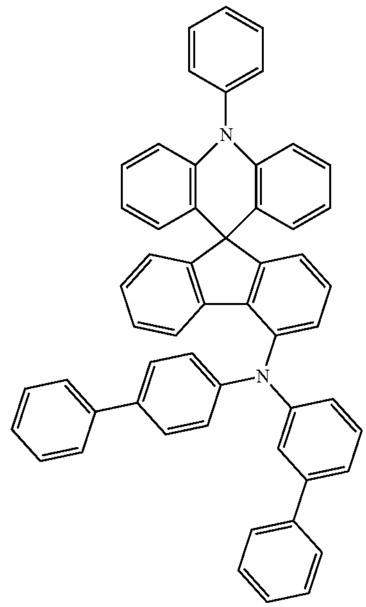
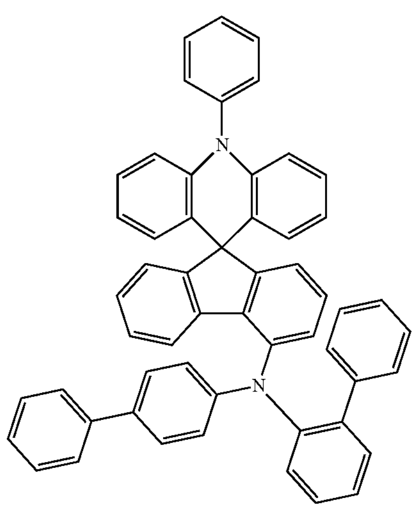
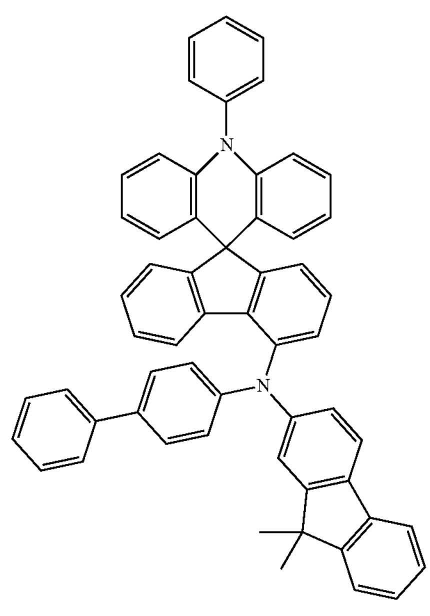

-continued
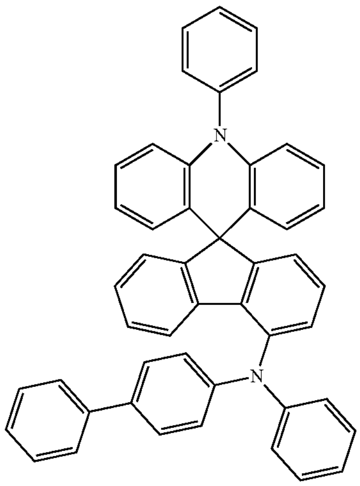
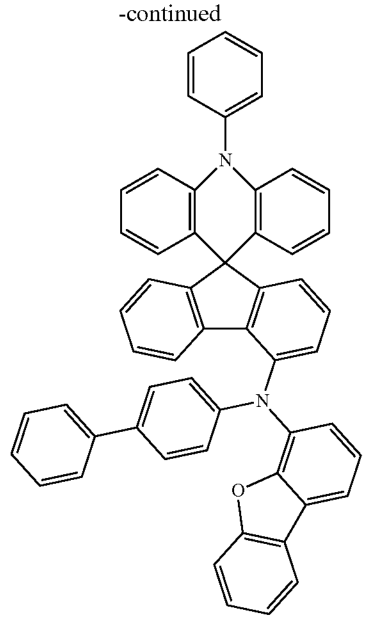
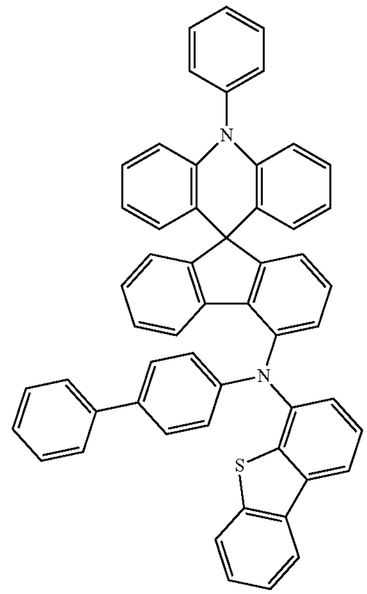
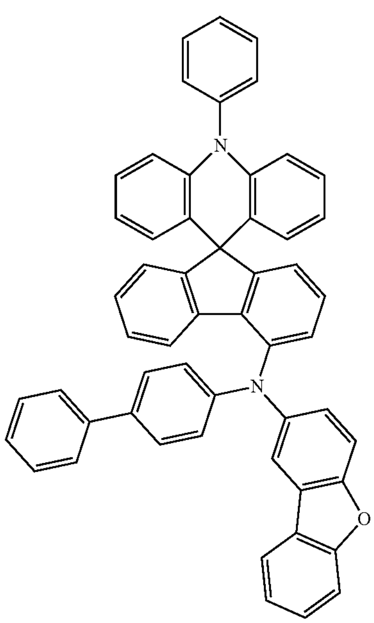
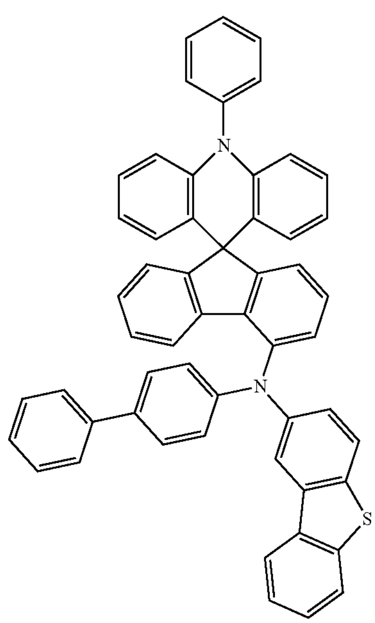

-continued
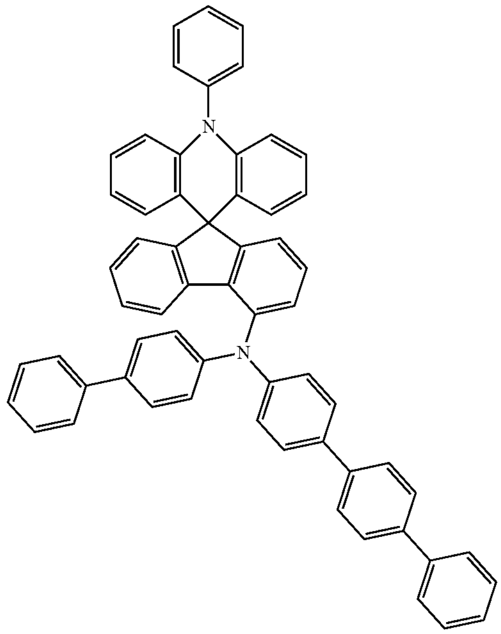
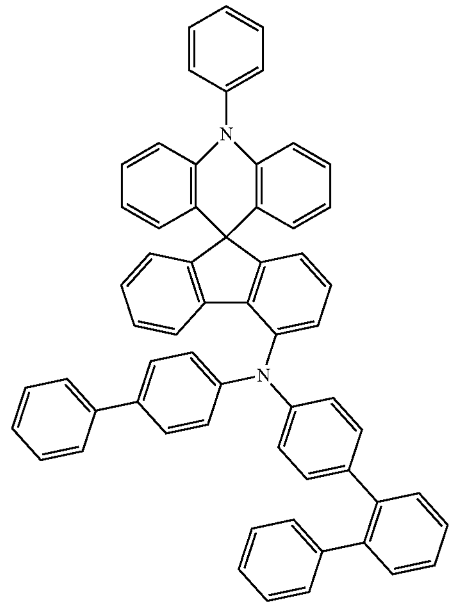
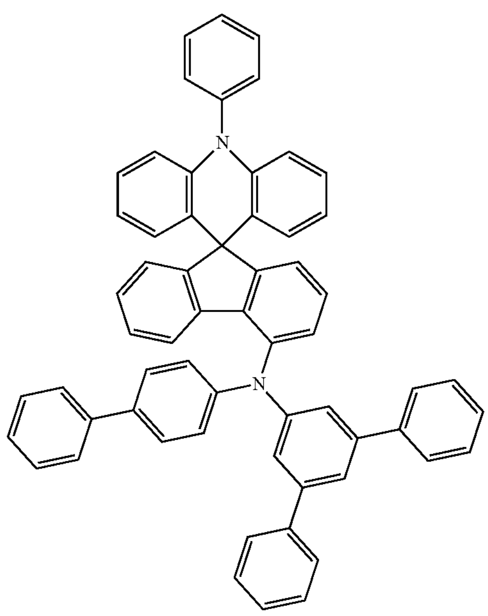
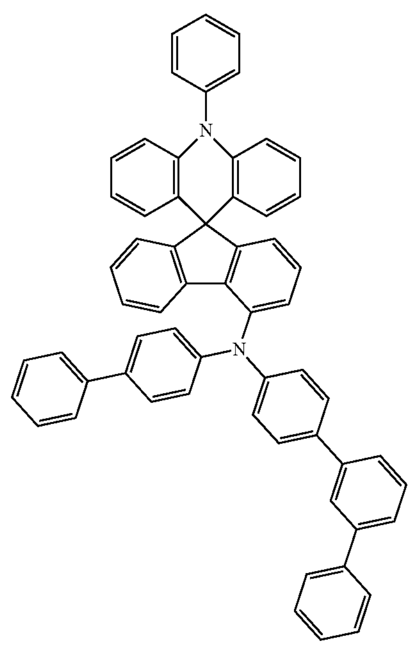

-continued
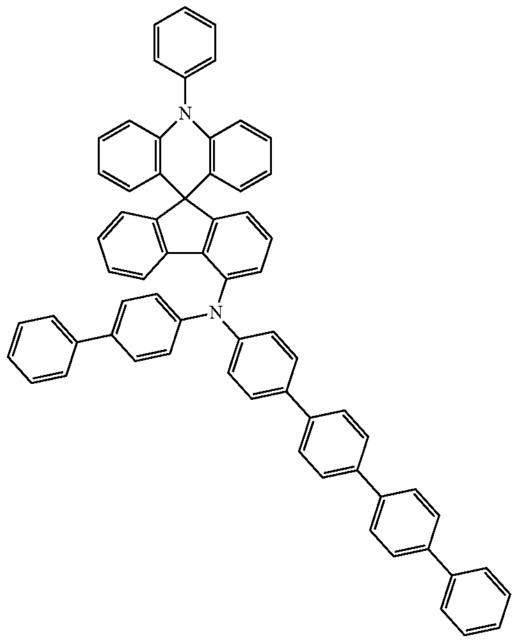
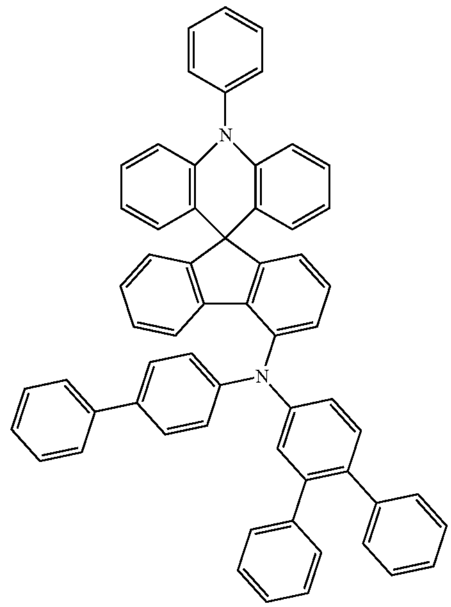
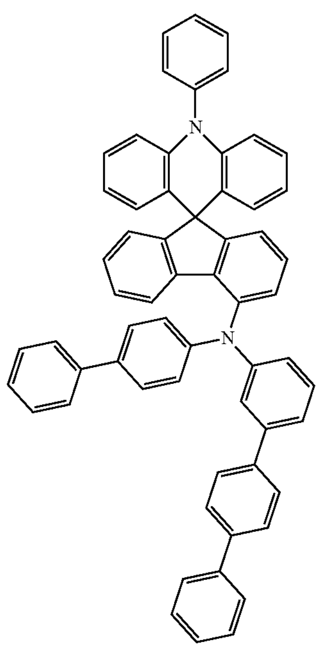
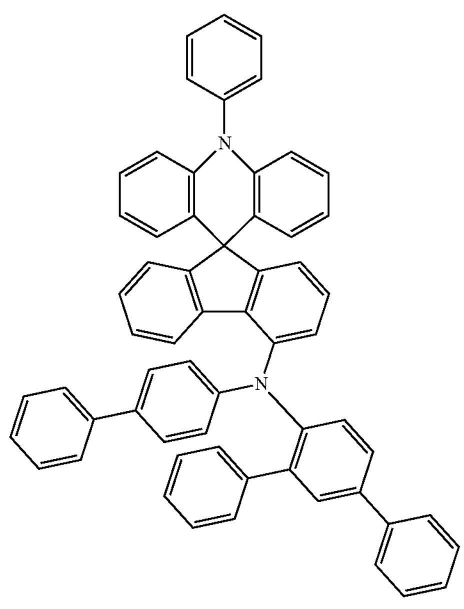

-continued
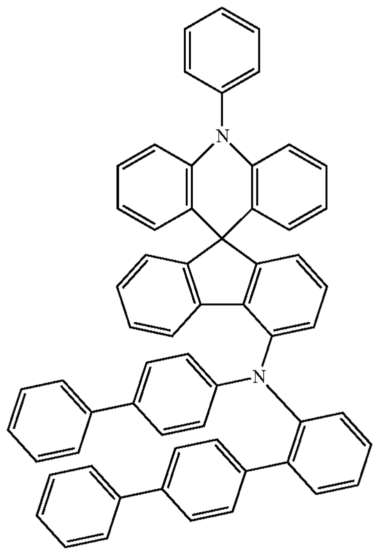
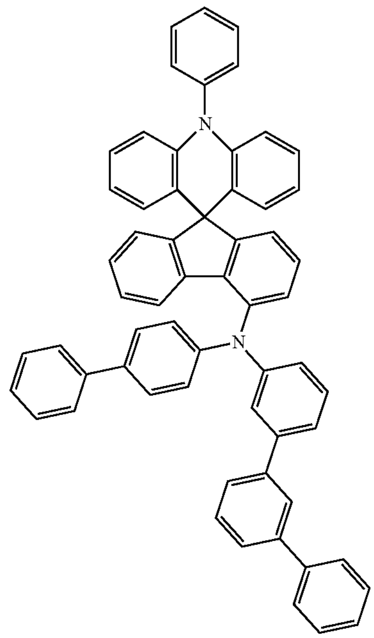
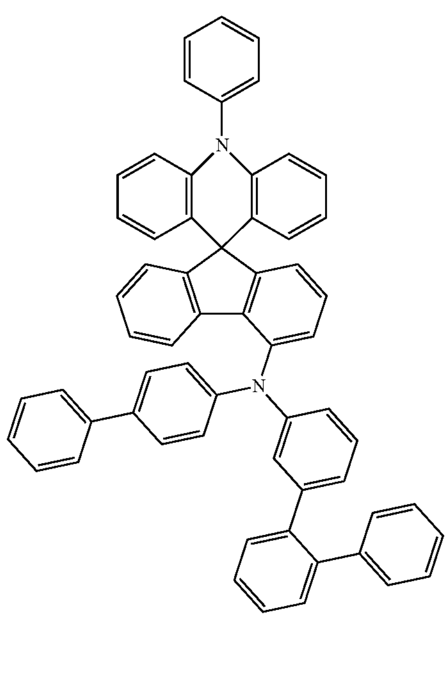
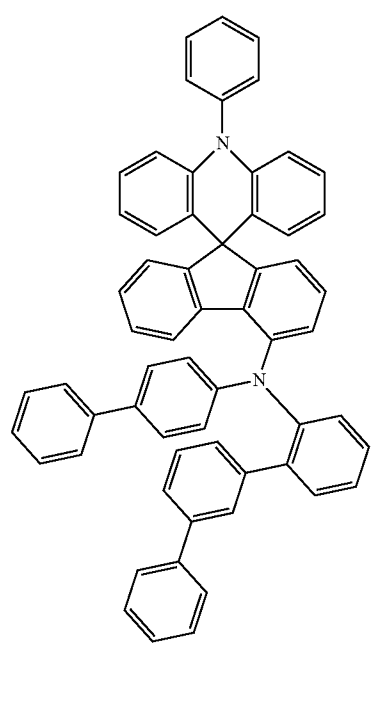

-continued
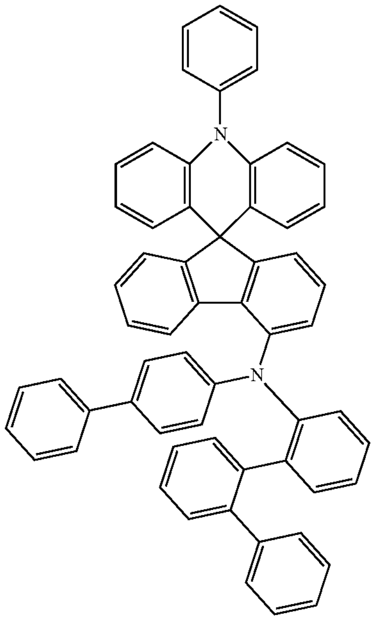
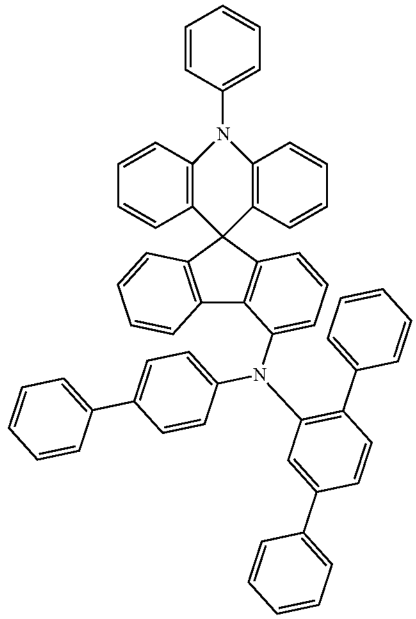
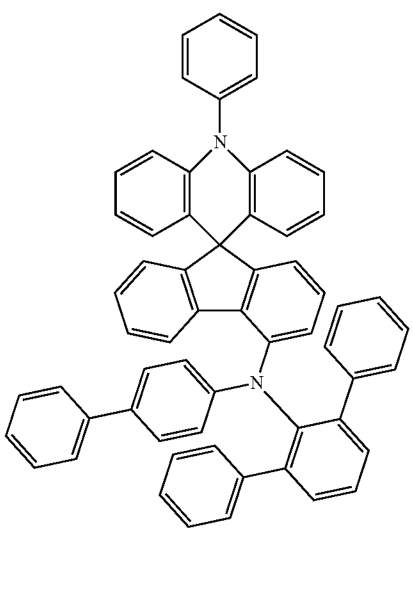
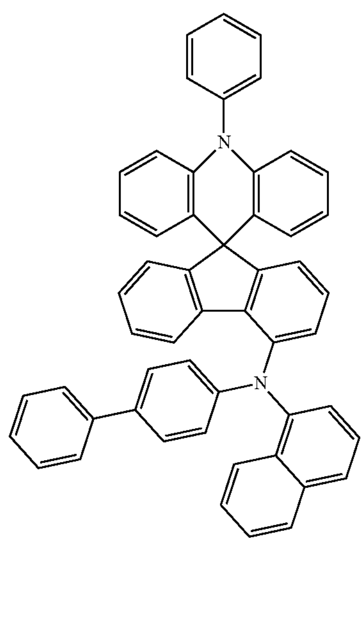

-continued
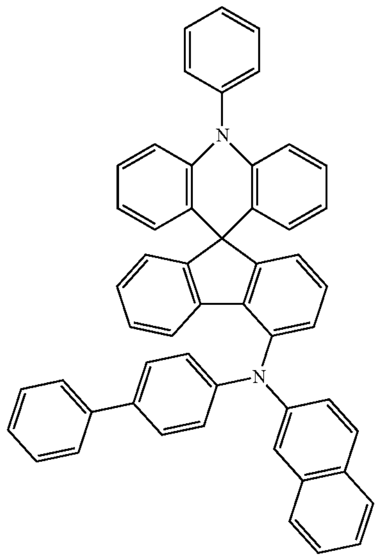
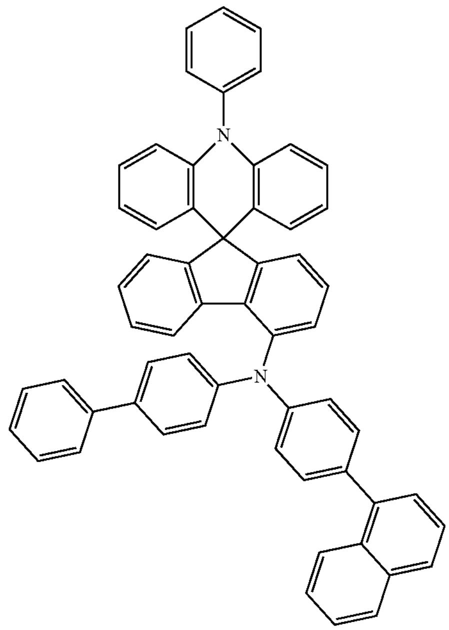
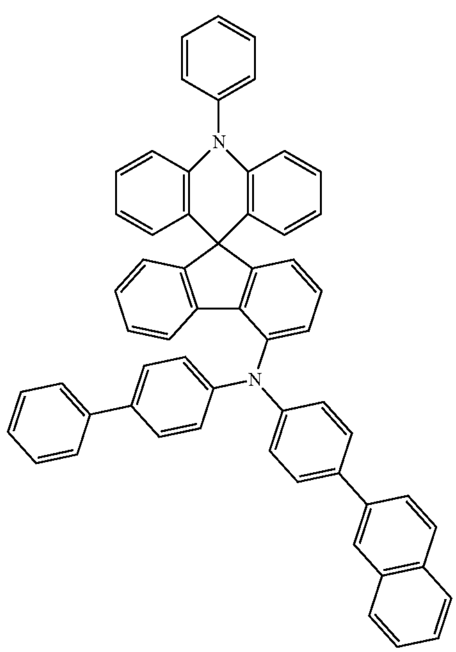
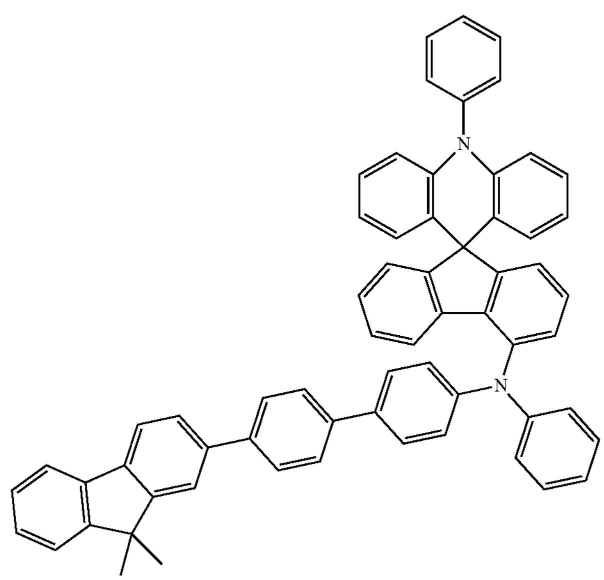

-continued
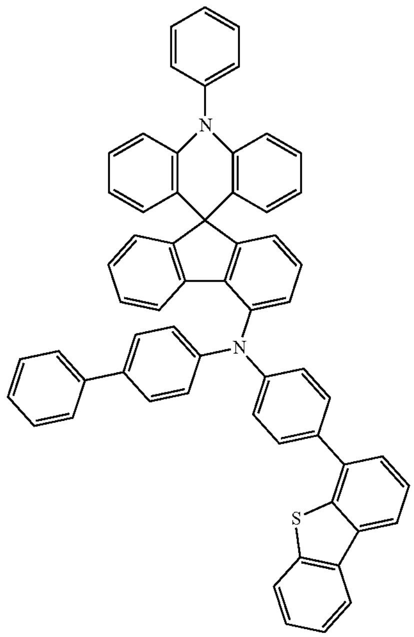
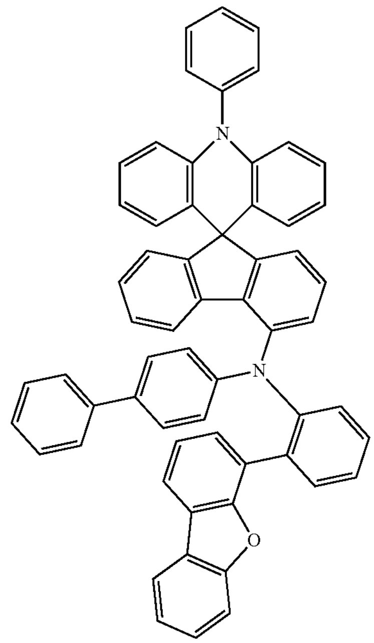
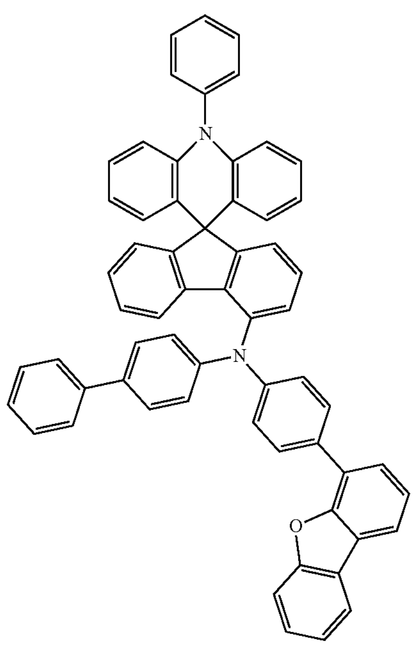
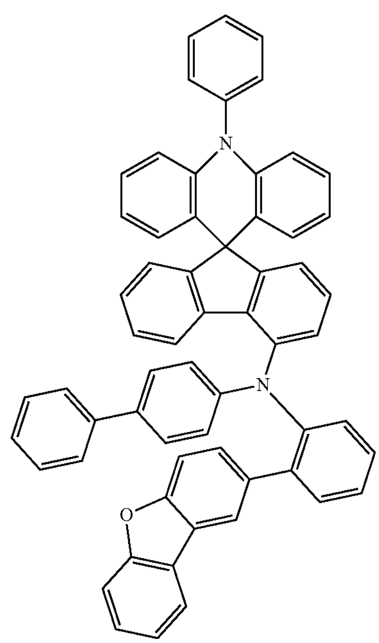

-continued
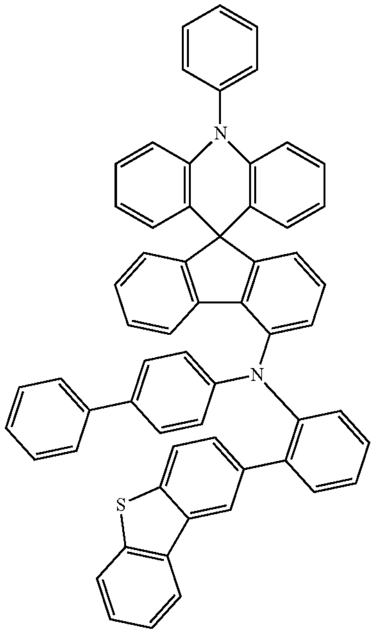
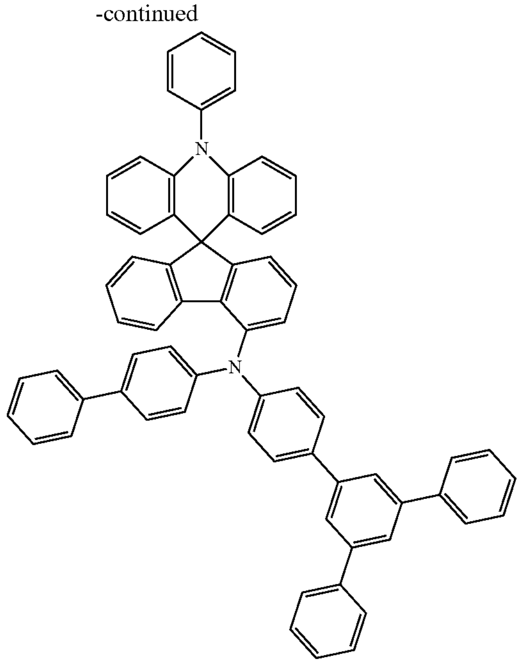
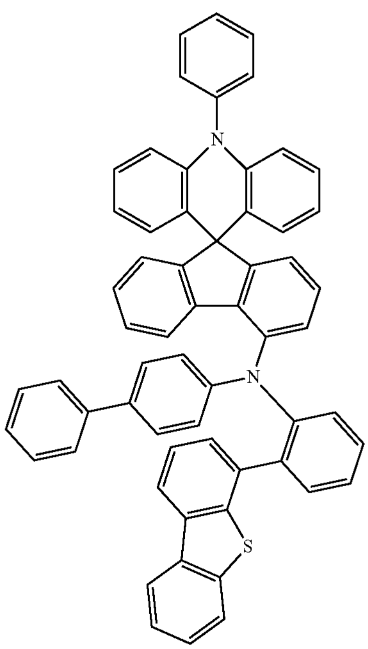
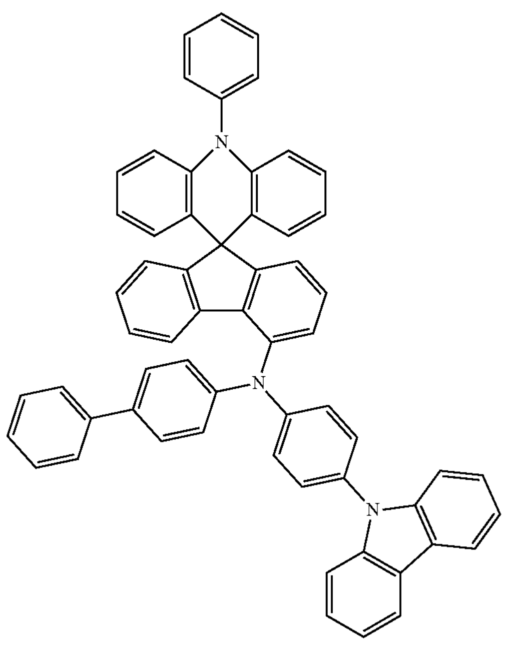

-continued
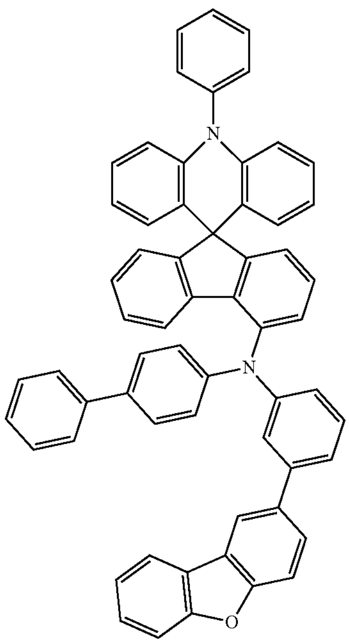
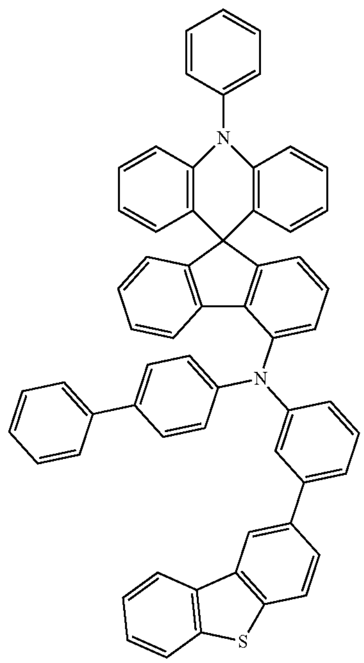
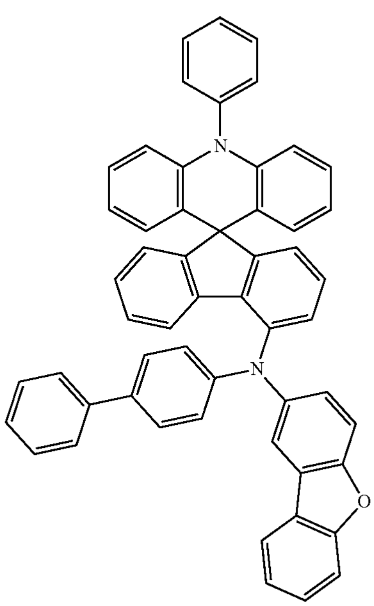
-continued
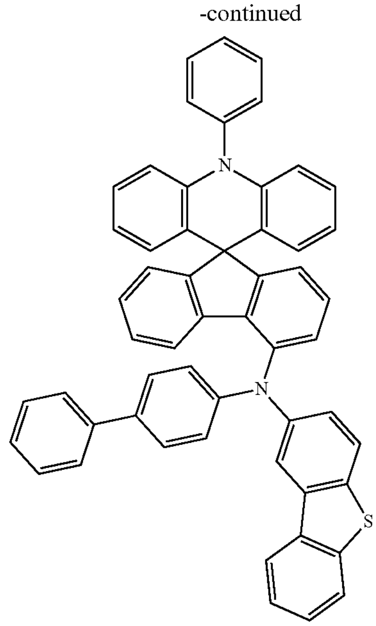

-continued
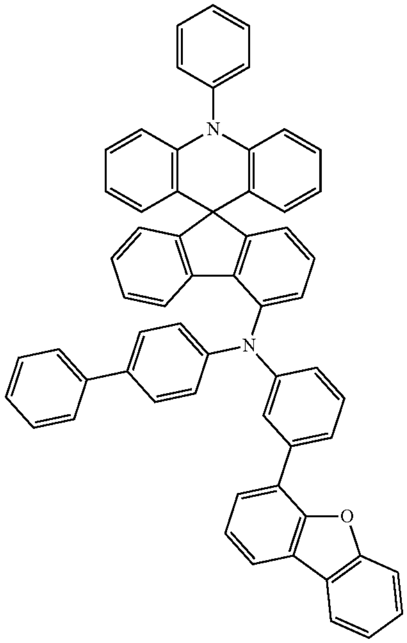
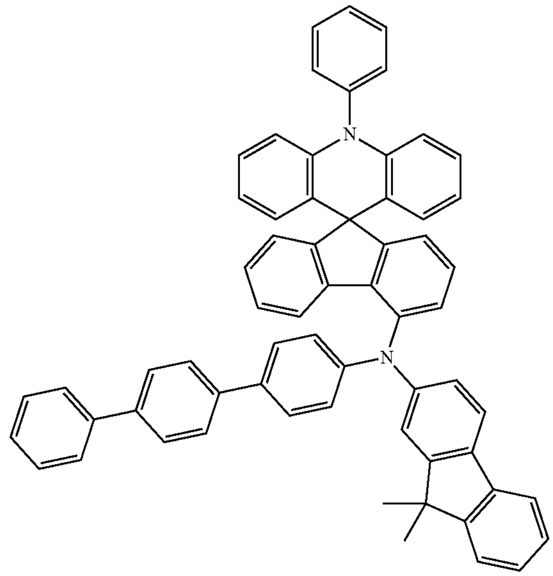
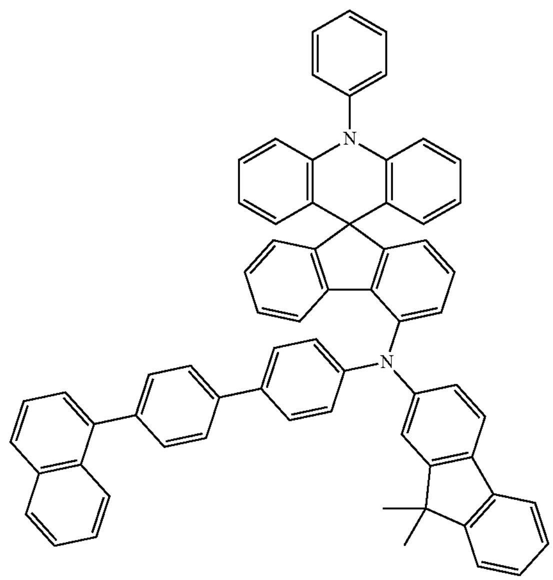
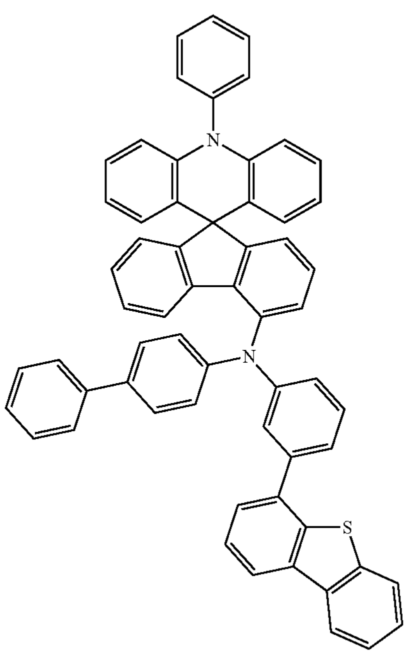
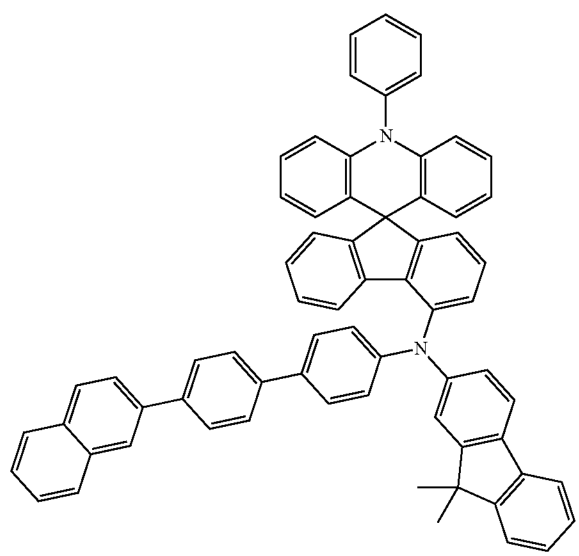

-continued
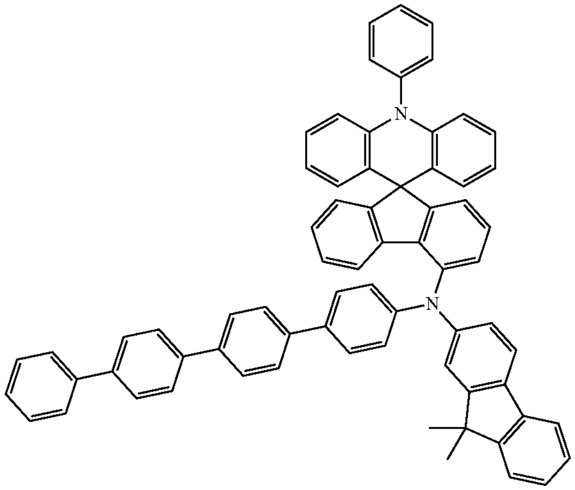
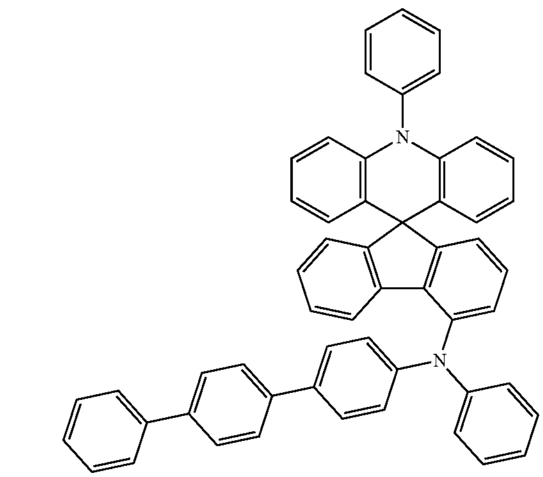
-continued
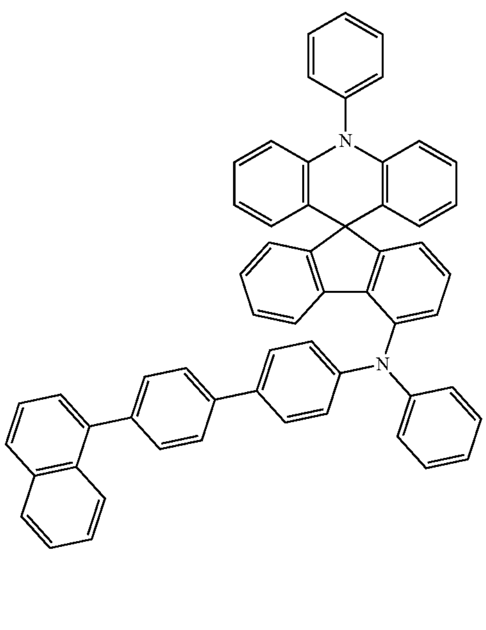
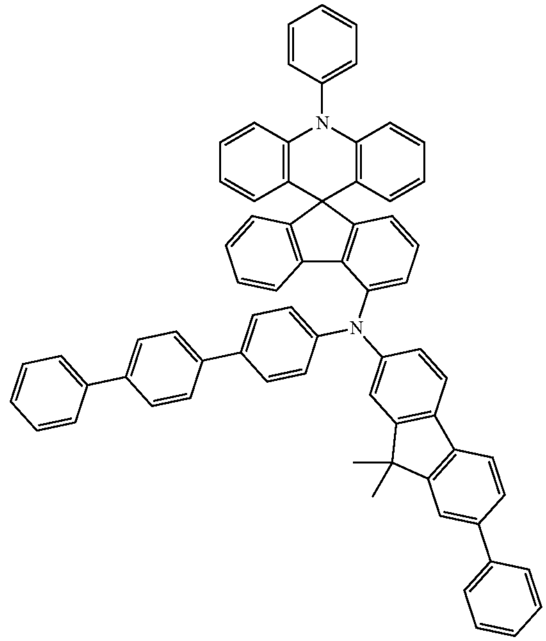
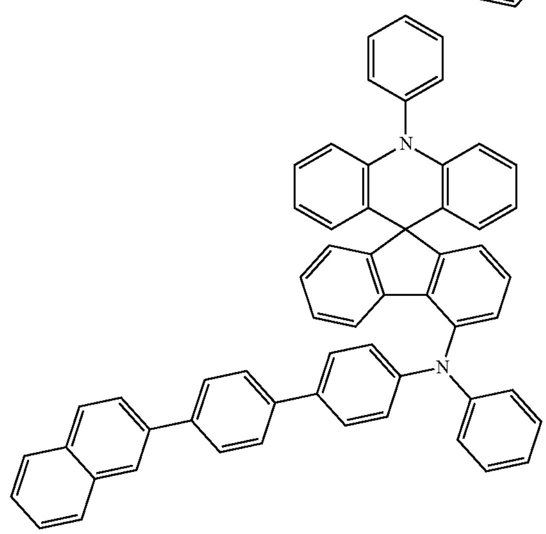
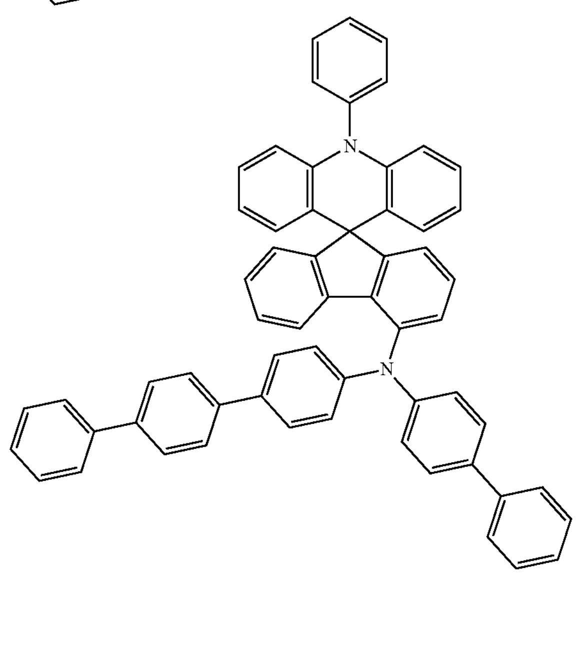

-continued
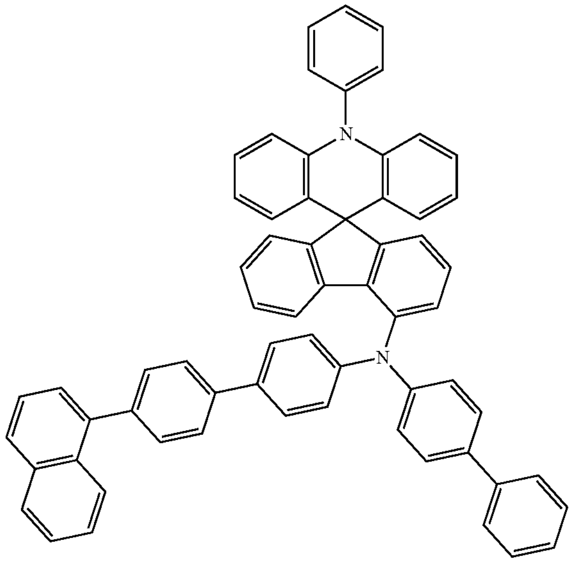
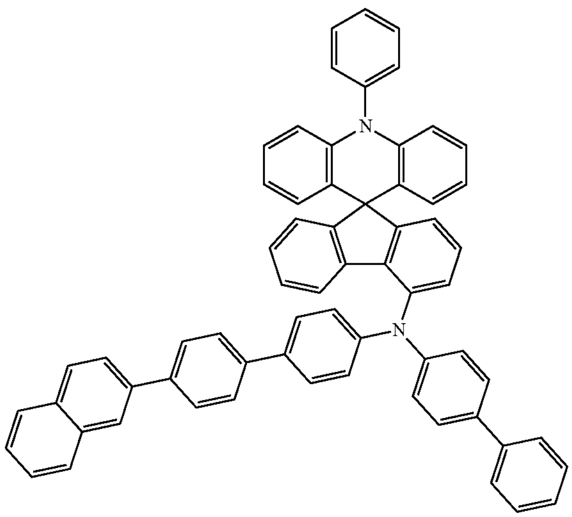
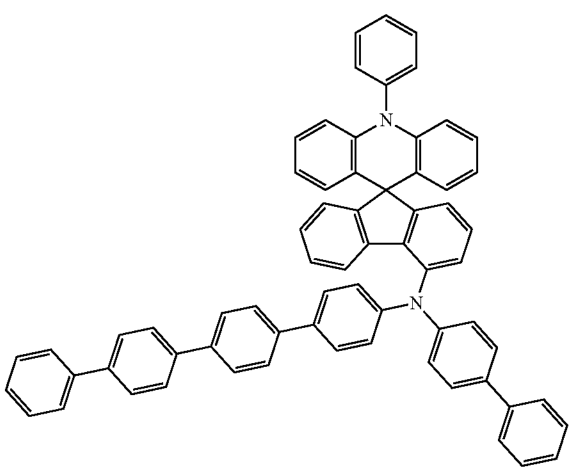
-continued
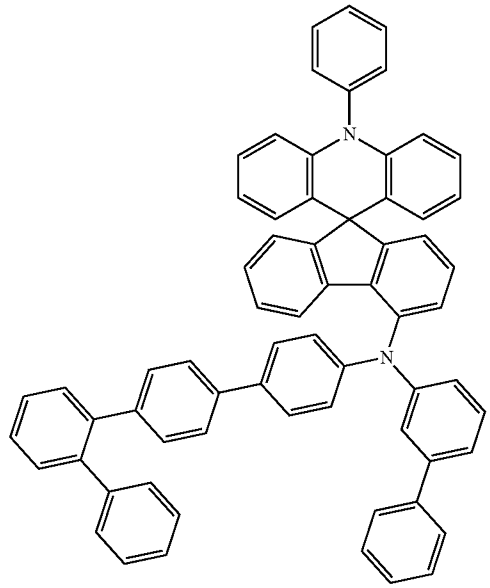
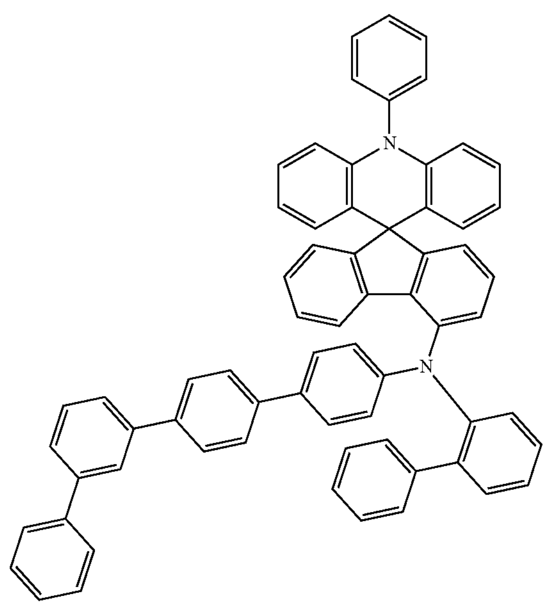

-continued
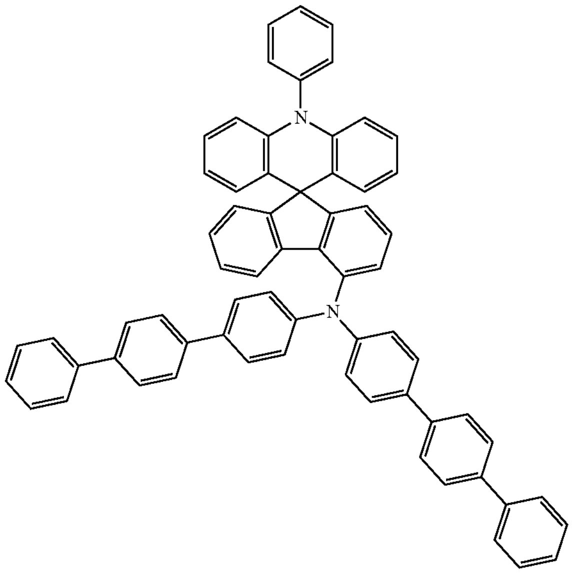
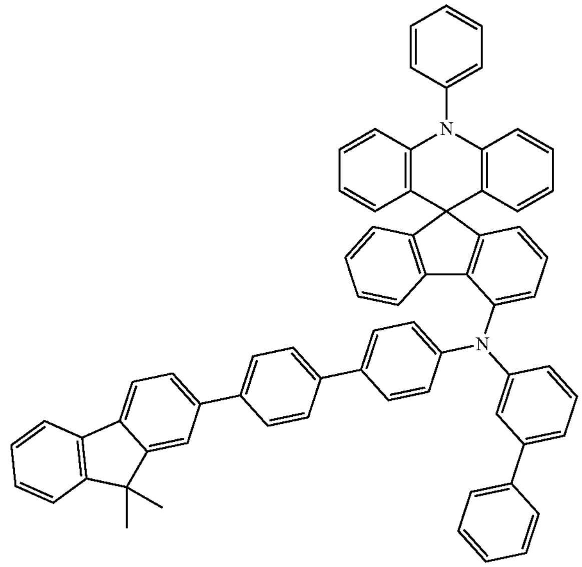
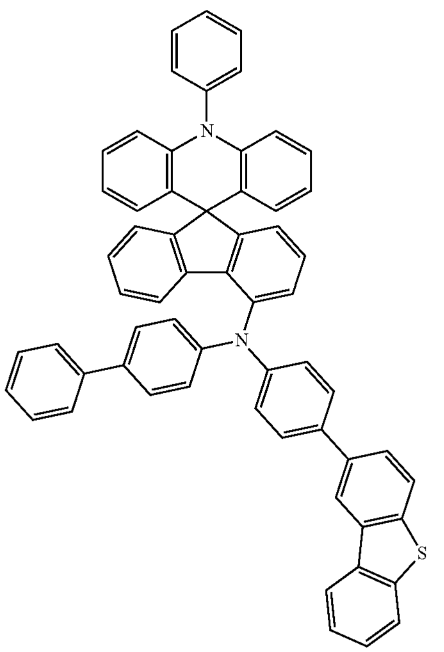
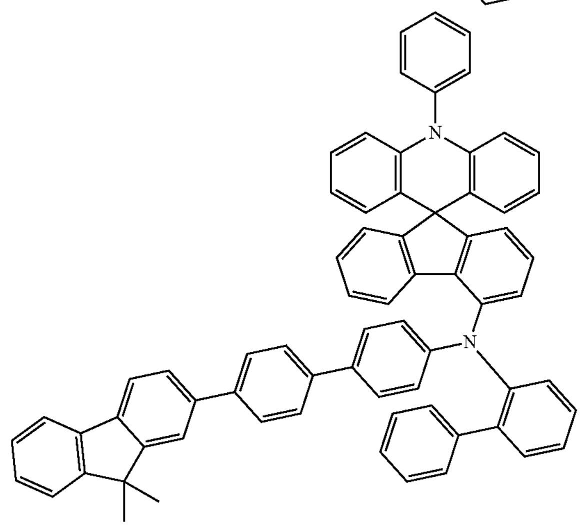
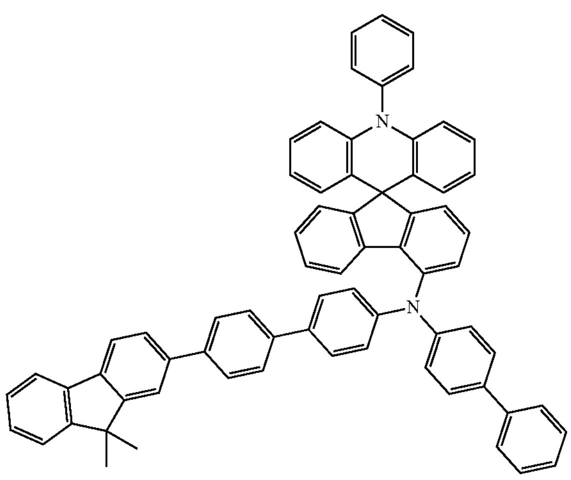
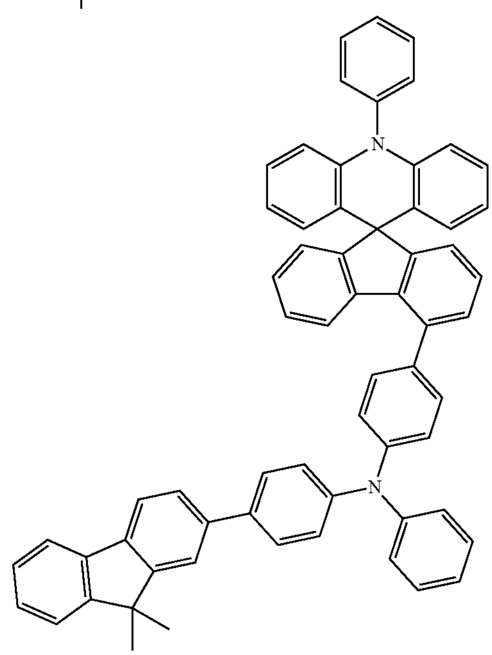
-continued -continued
-continued
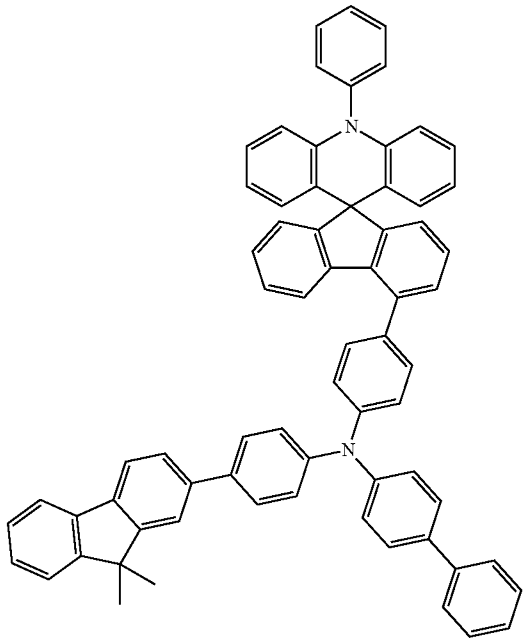
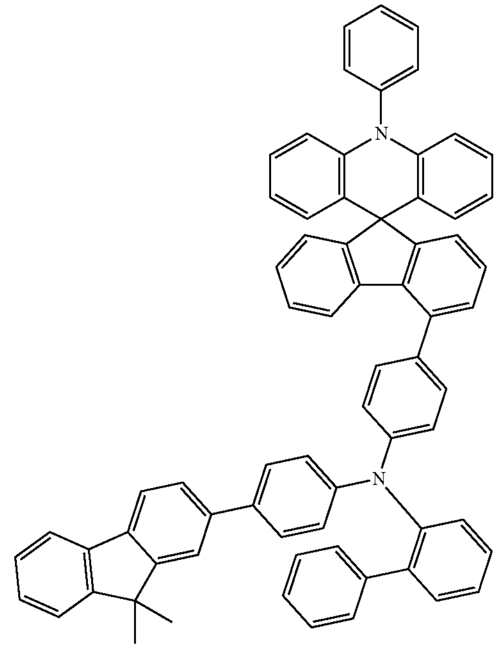
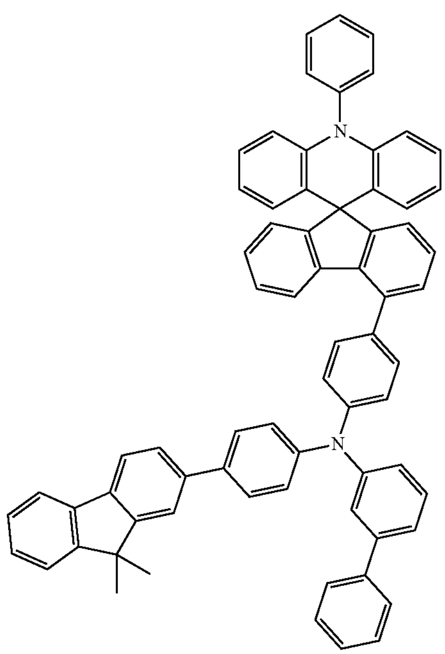
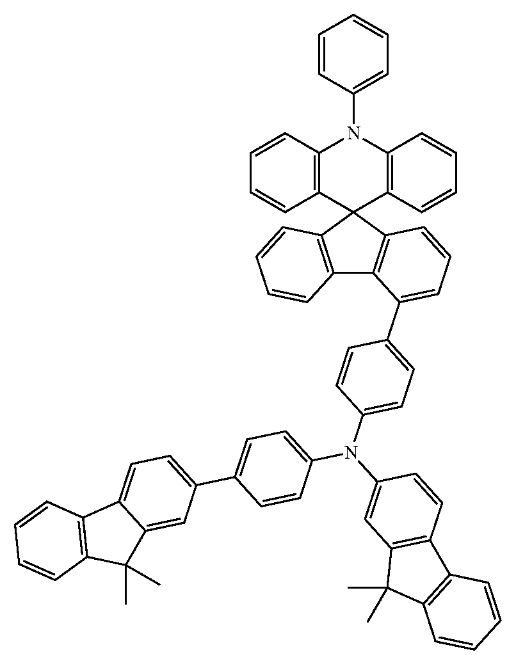

-continued
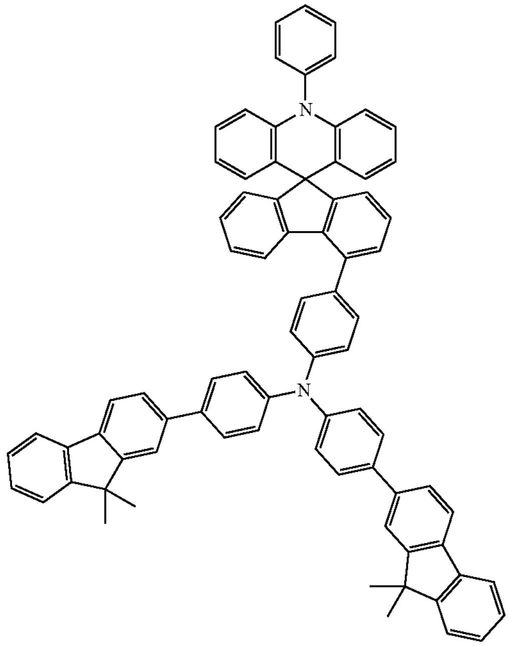
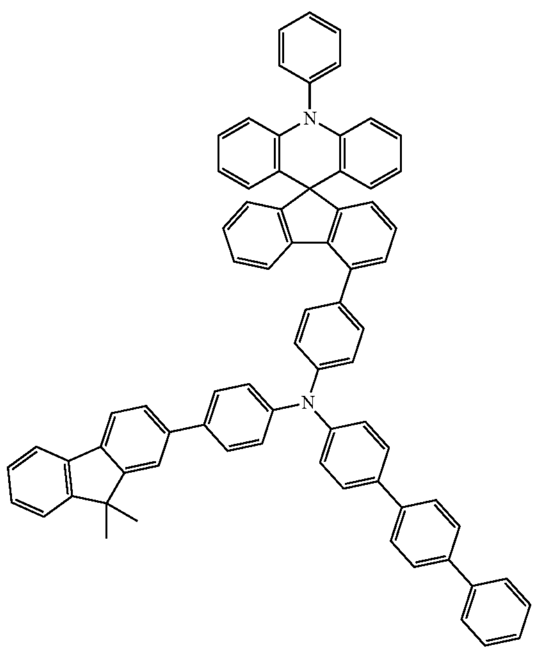
-continued
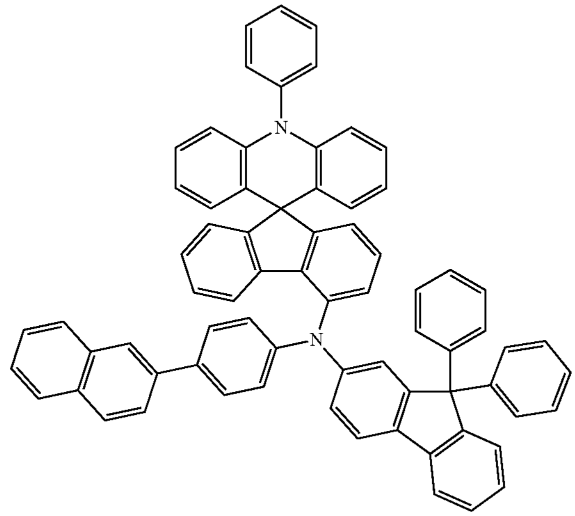
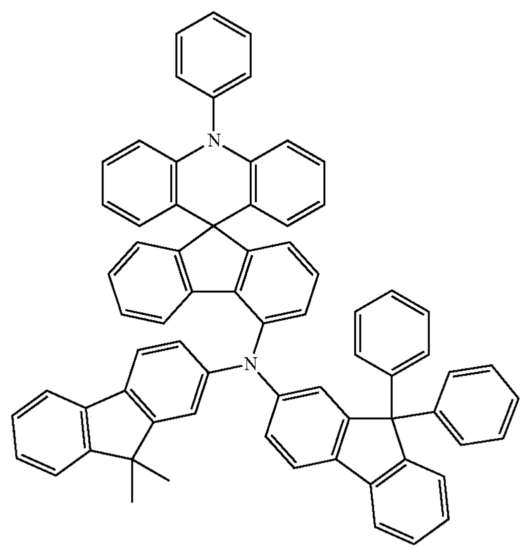
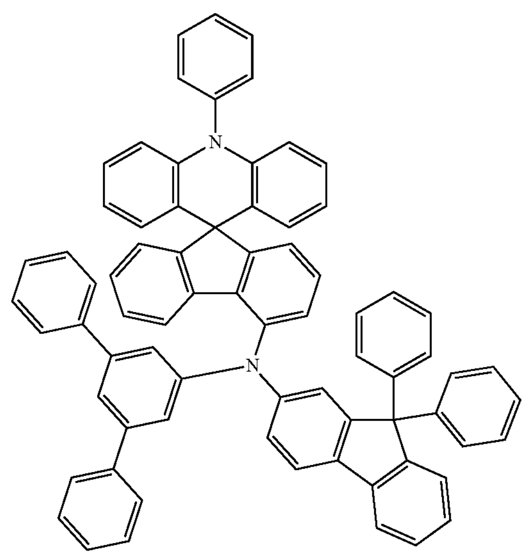

-continued
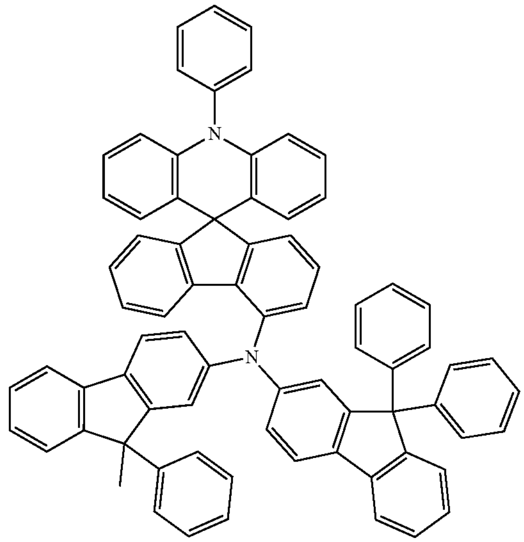
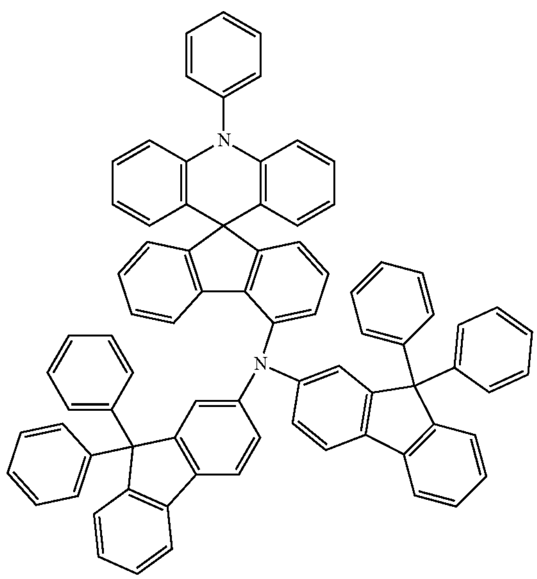
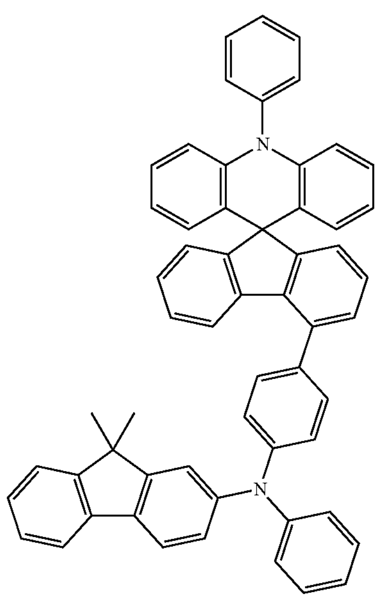
-continued
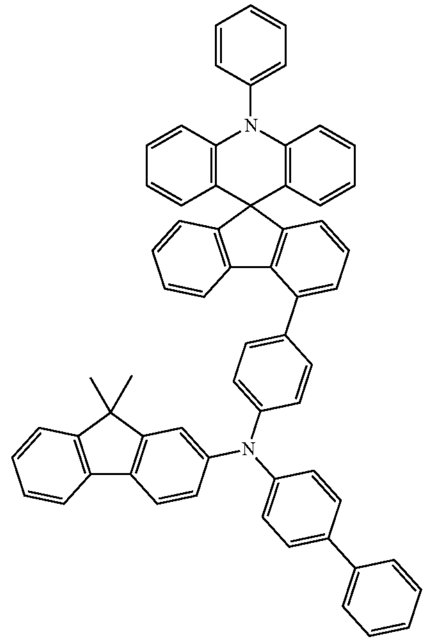
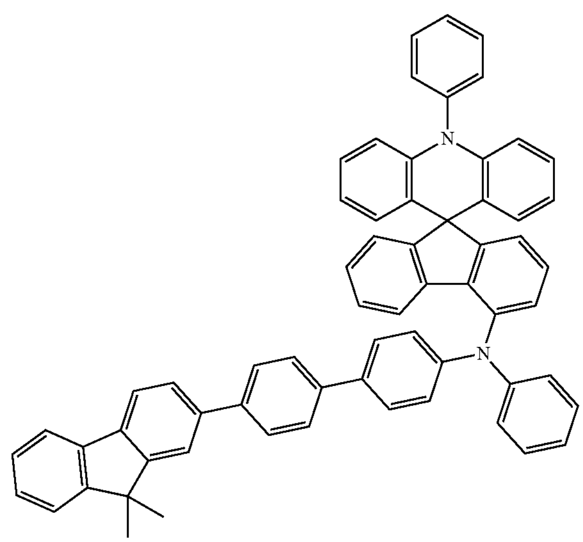

-continued
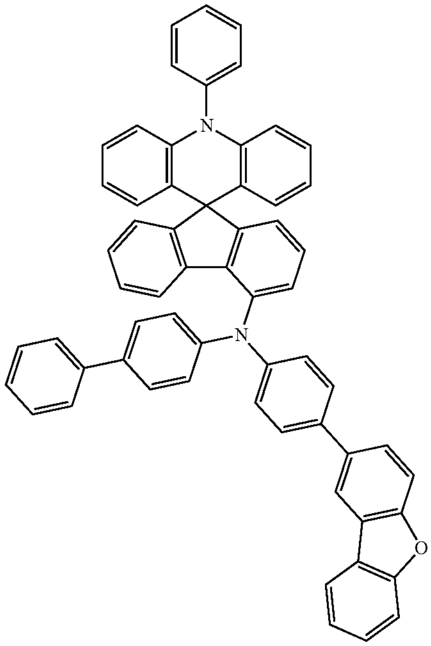
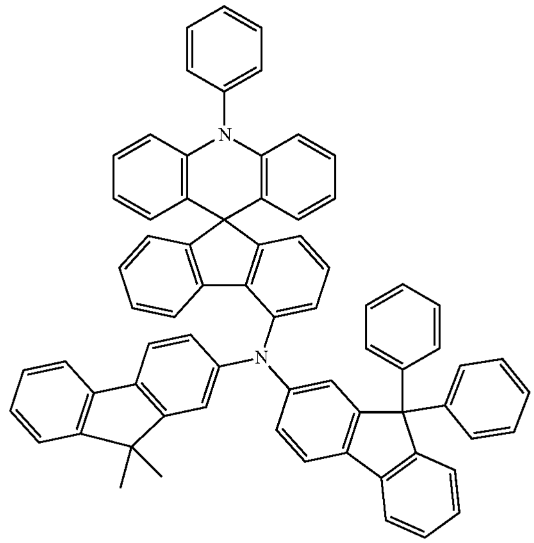
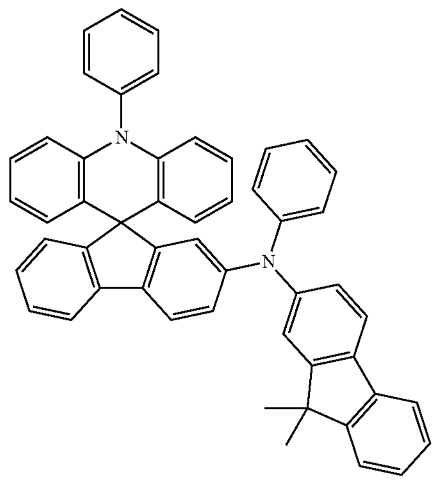
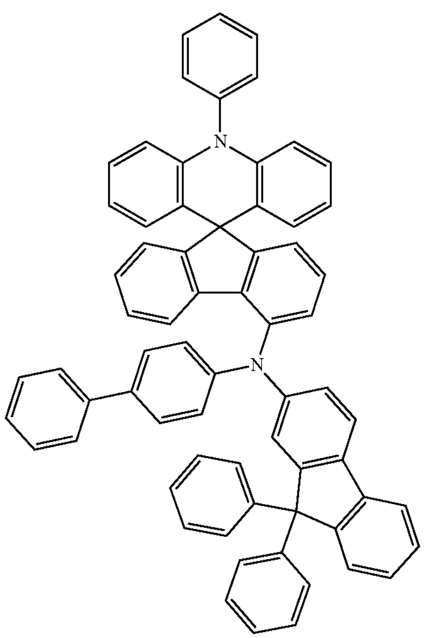
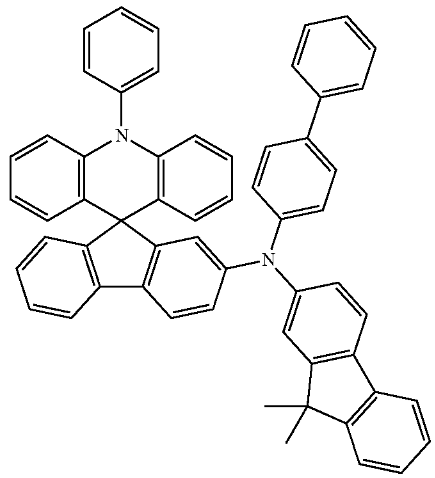

-continued
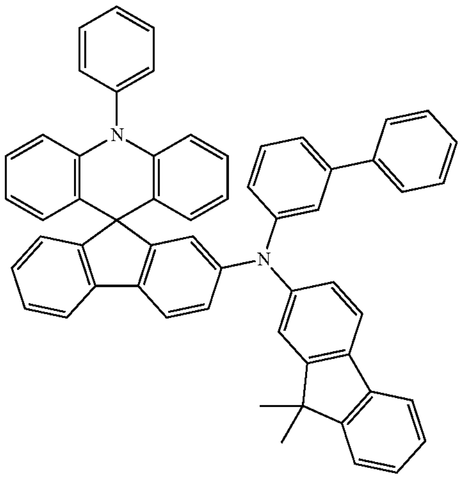
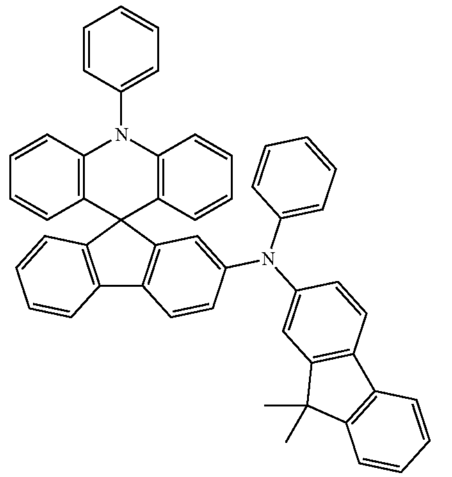
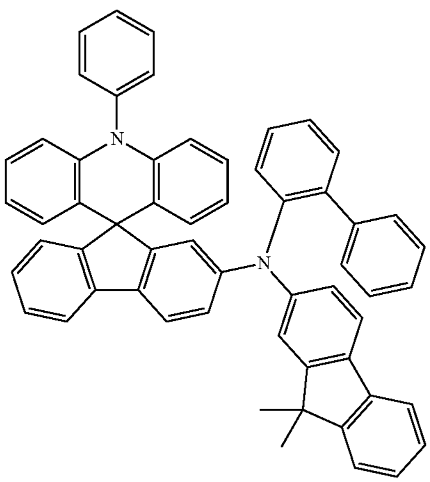
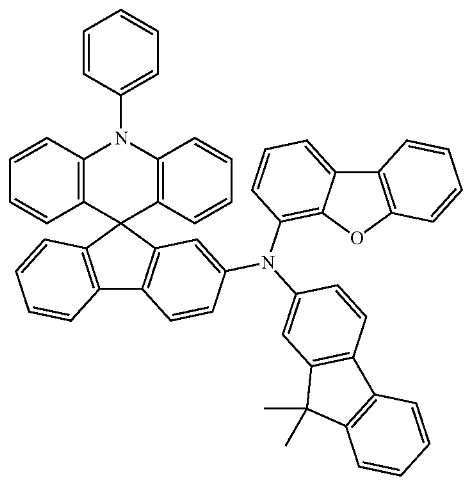
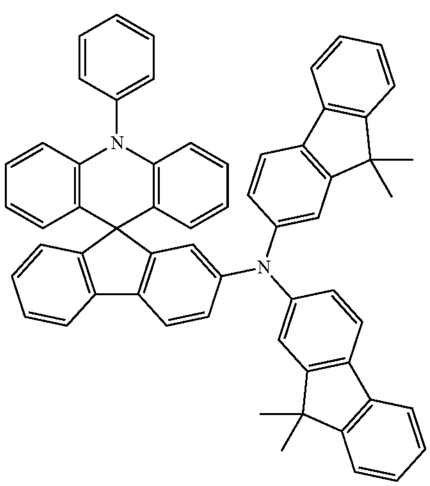
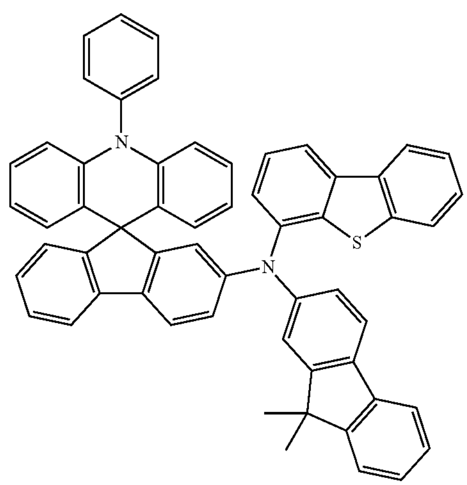

-continued
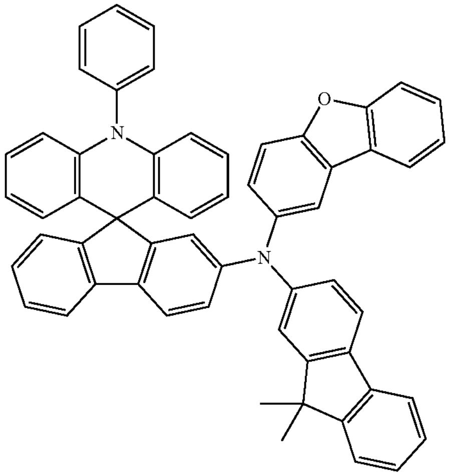
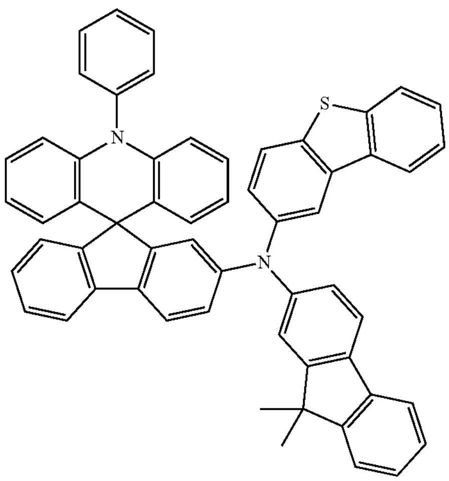
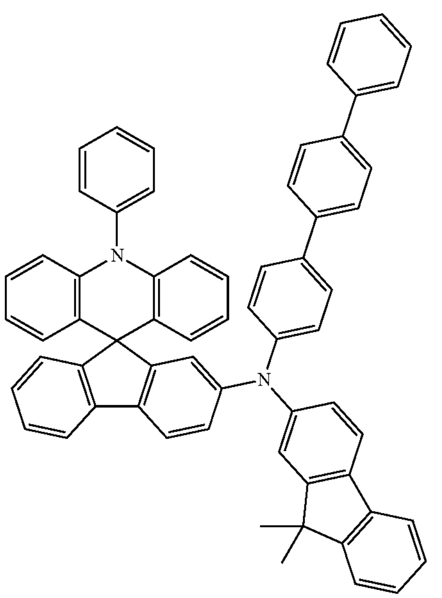
-continued
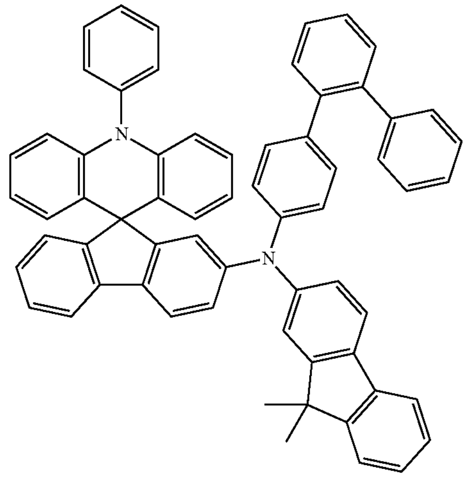
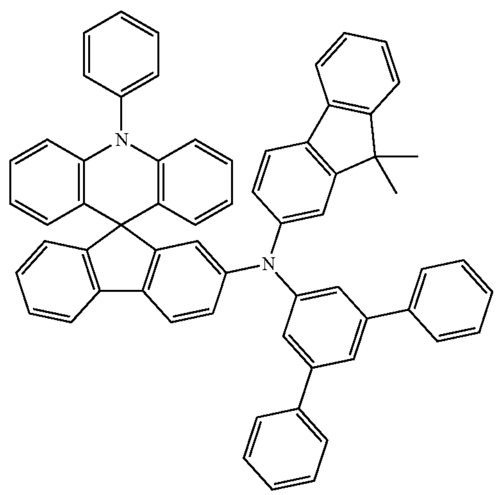
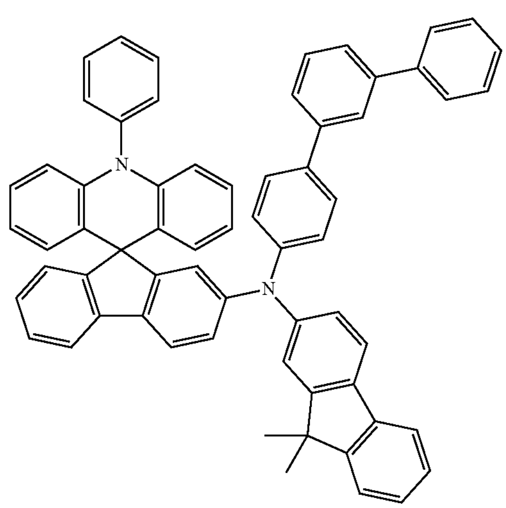

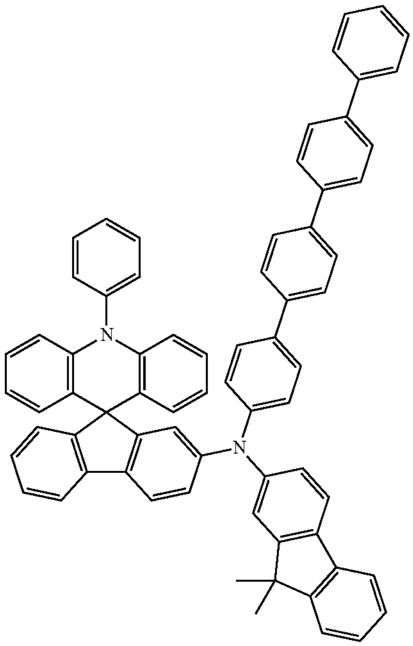
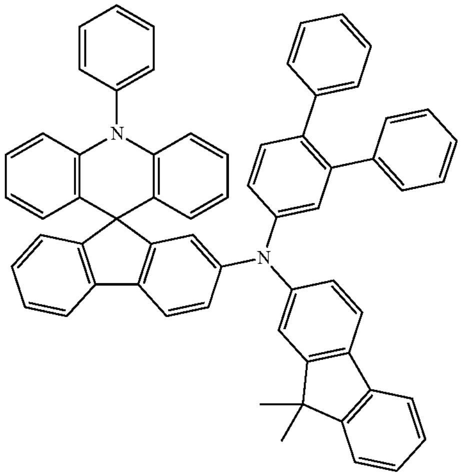
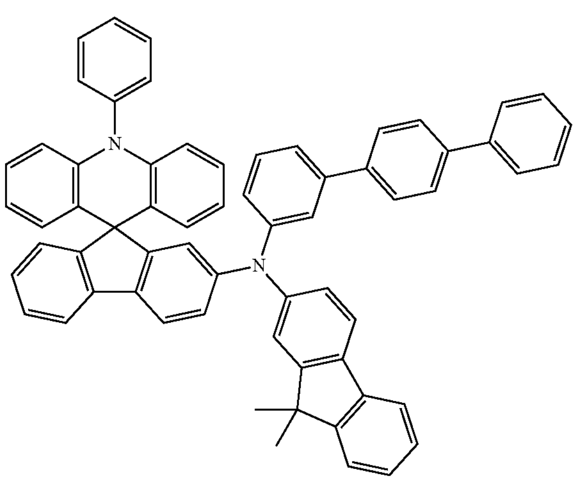
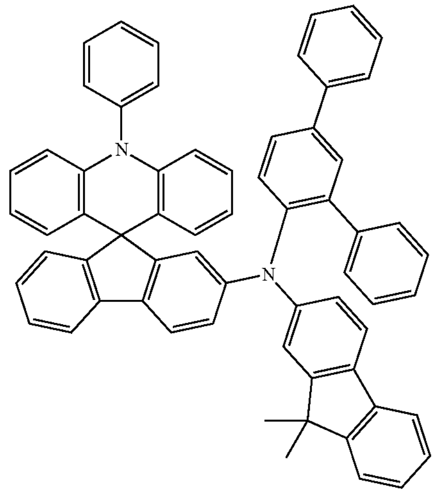
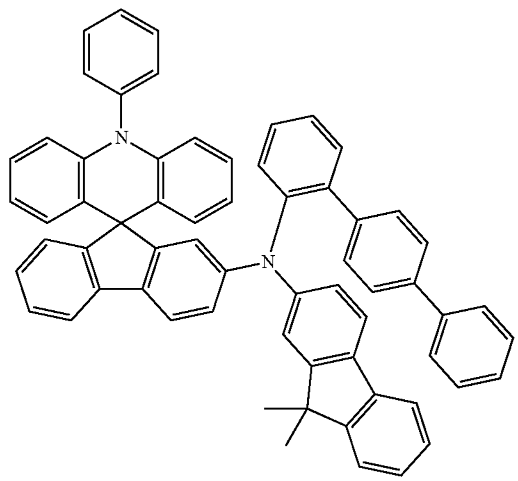
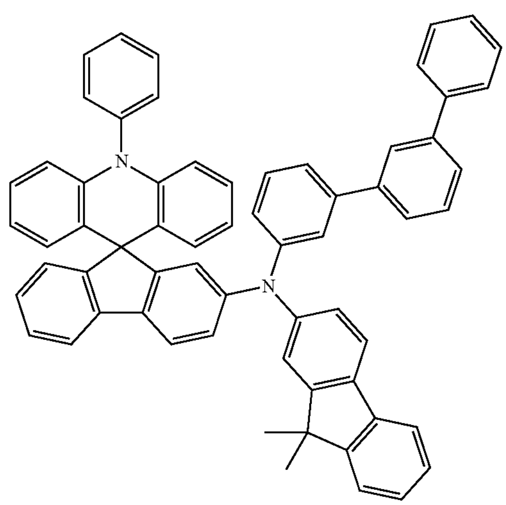
N
N

-continued
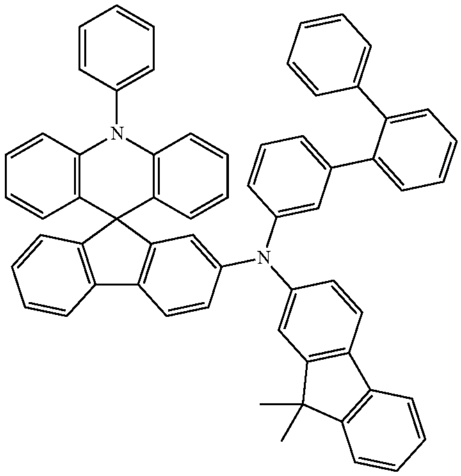
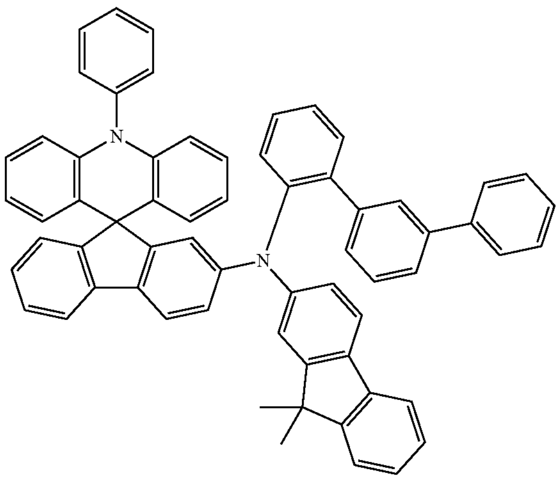
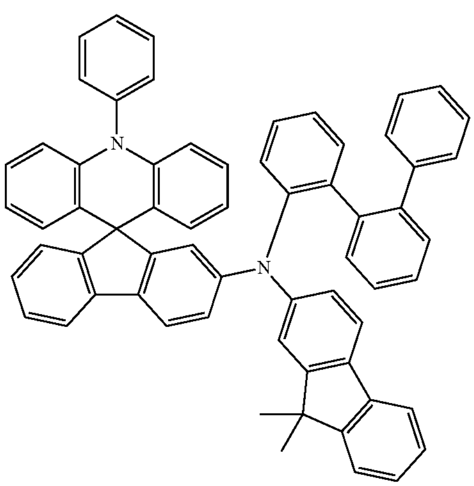
-continued
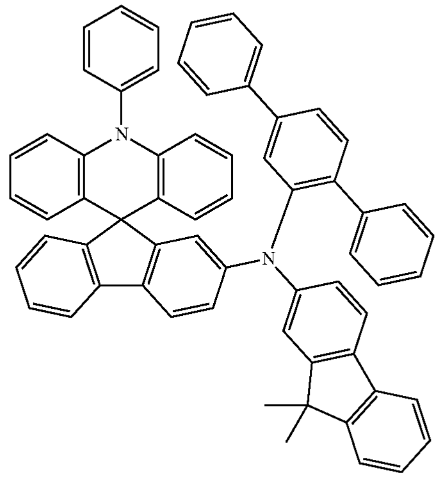
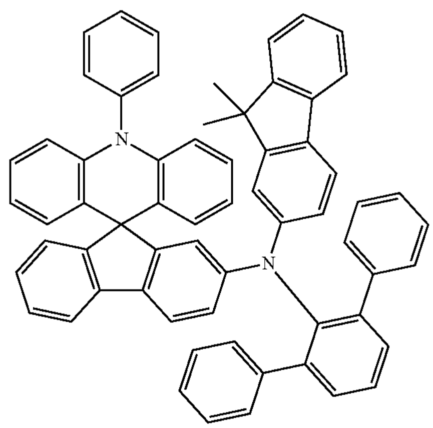
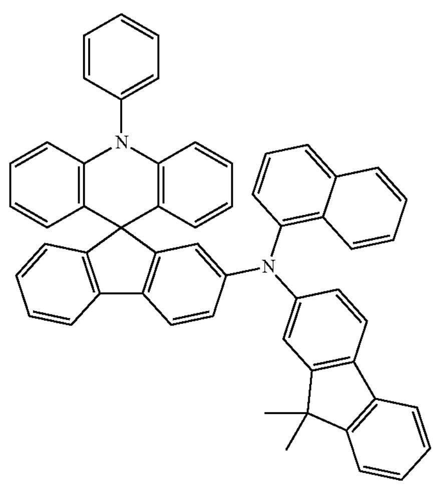

-continued
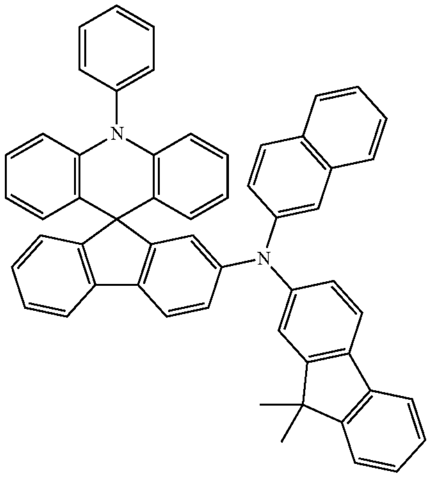
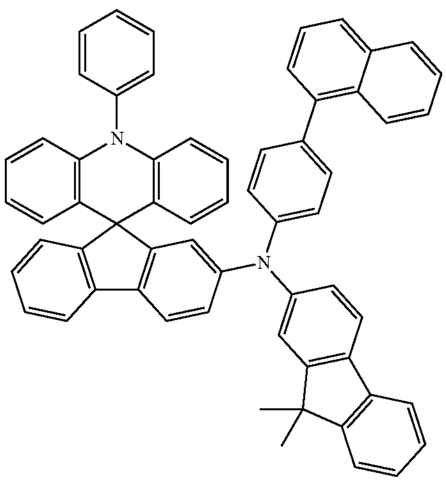
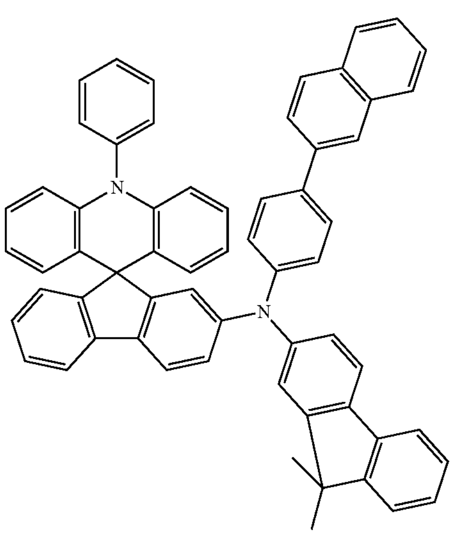
-continued
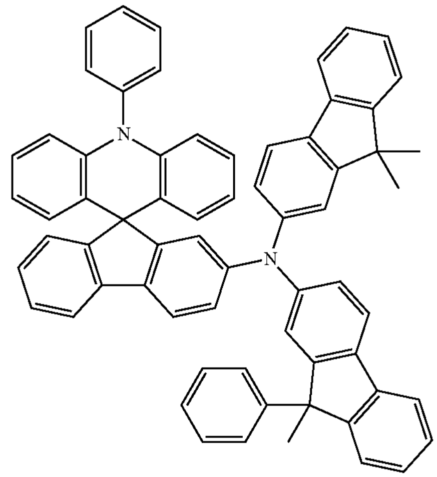
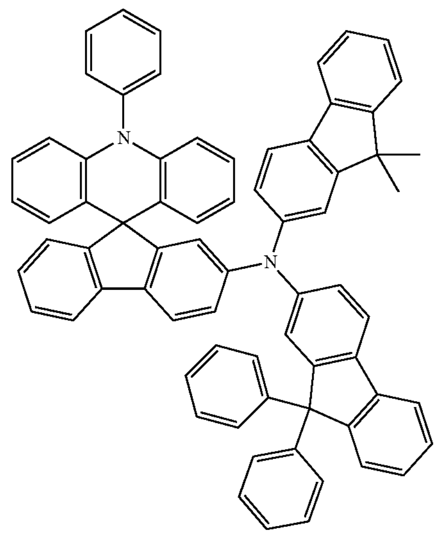
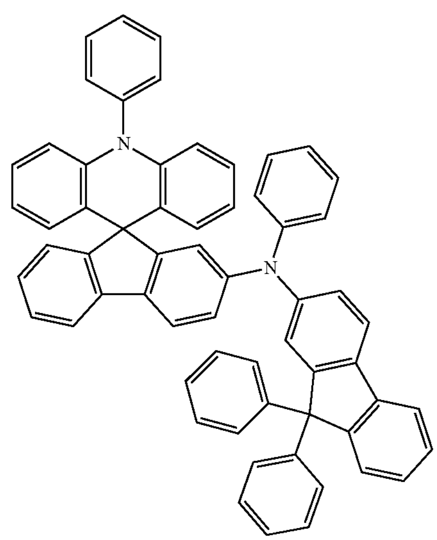

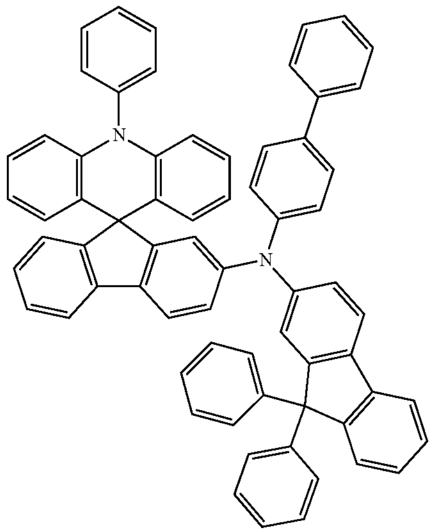
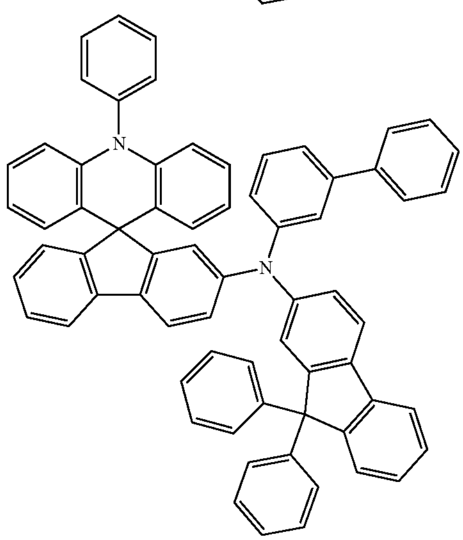
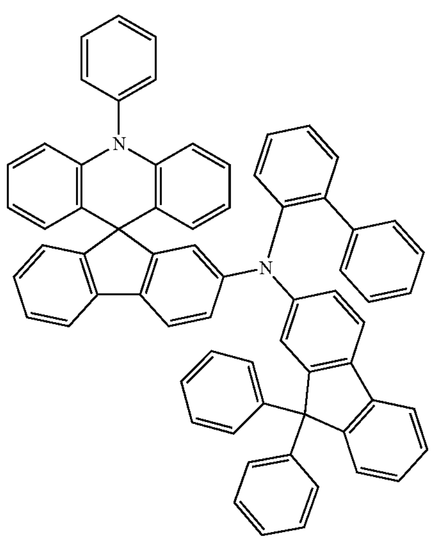
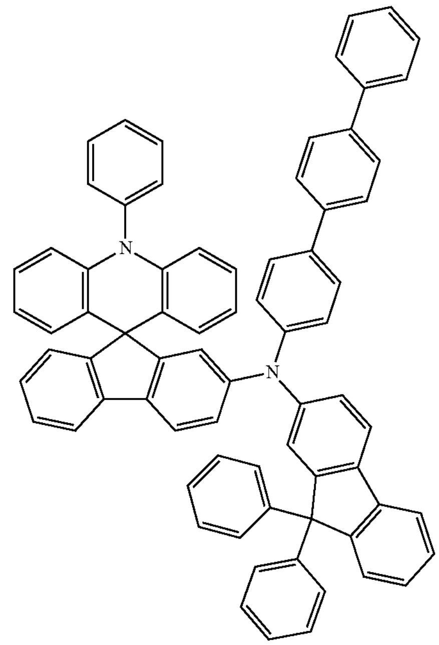
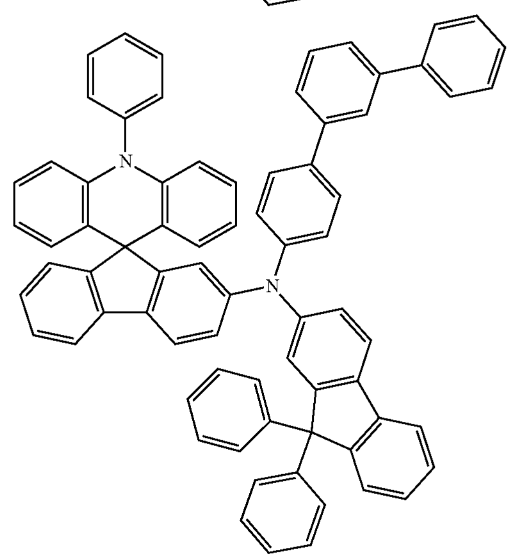
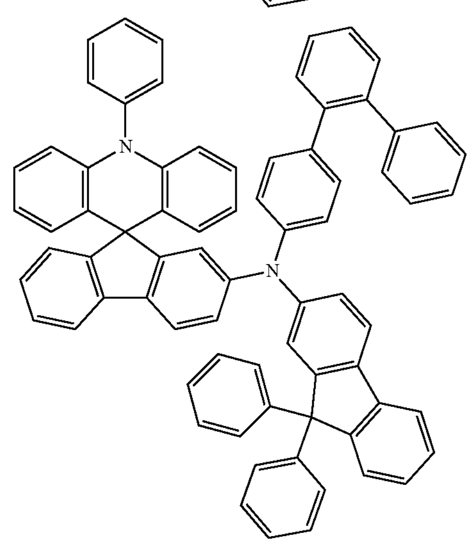

-continued
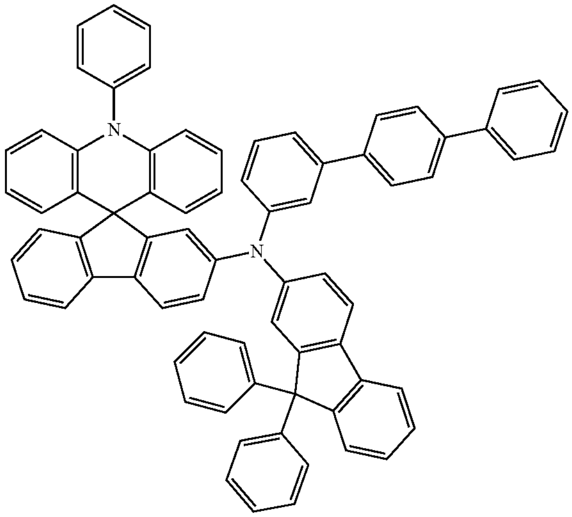
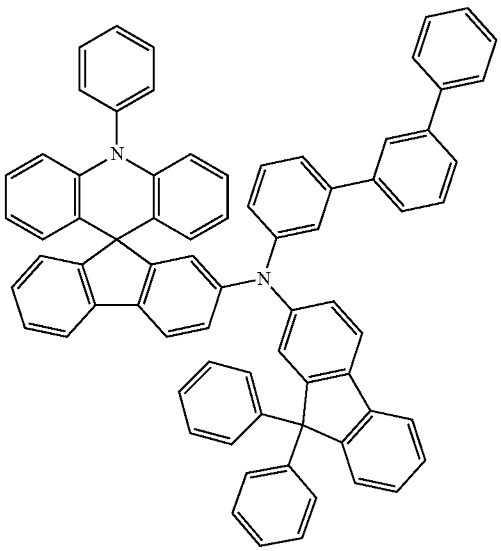
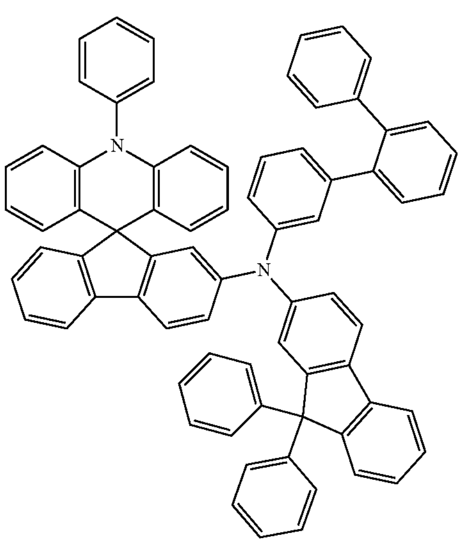
-continued
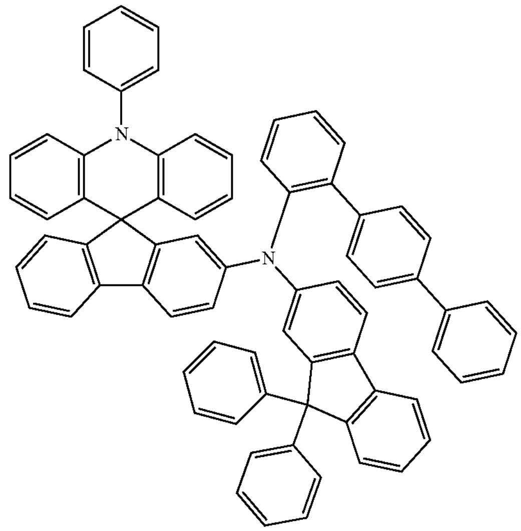
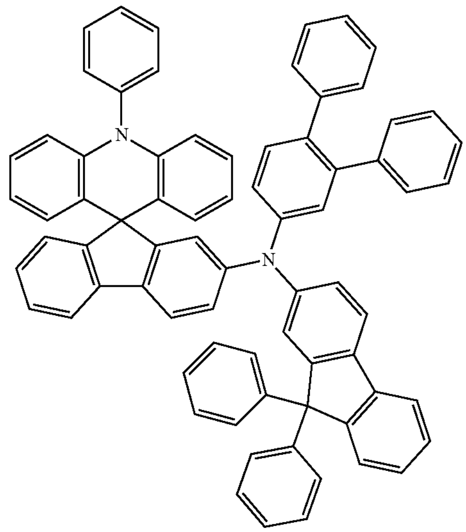
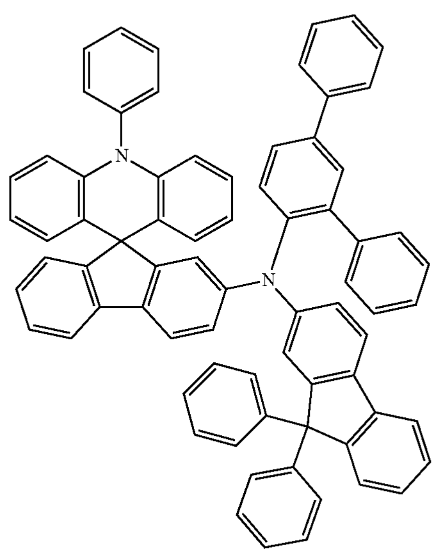

-continued
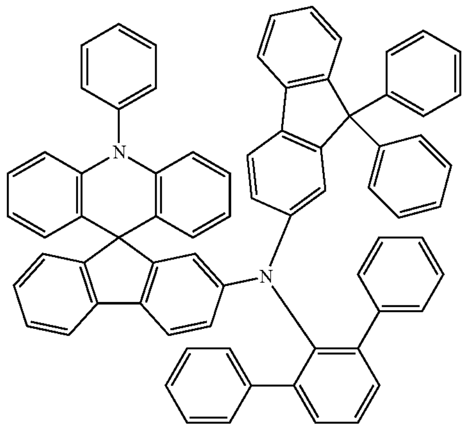
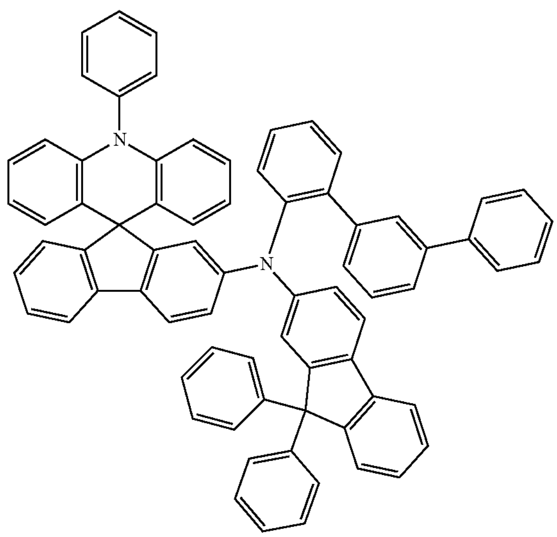
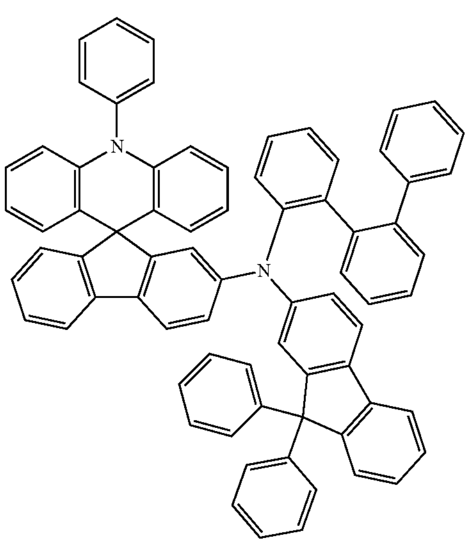
-continued
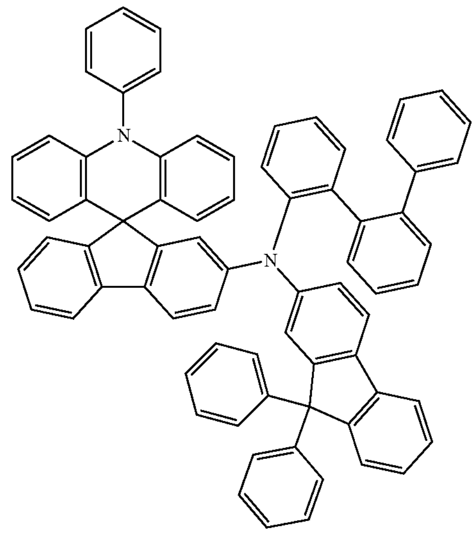
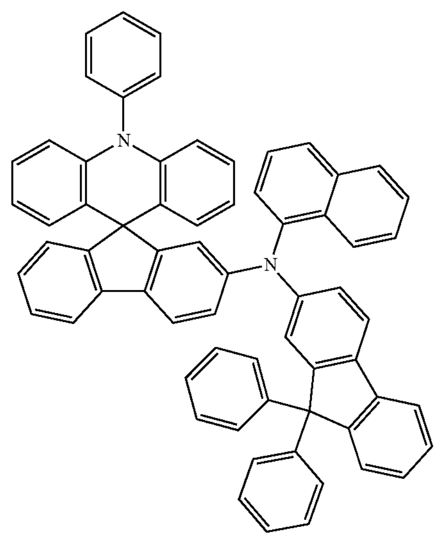
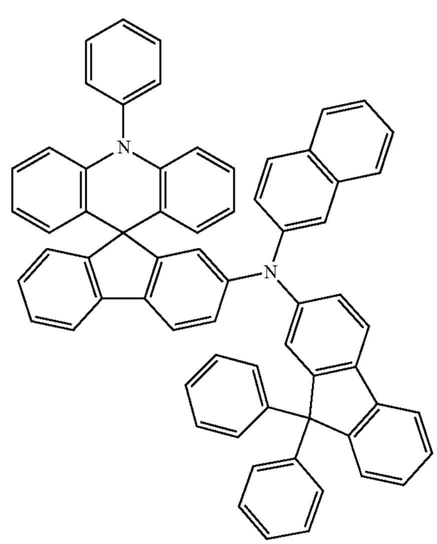

-continued
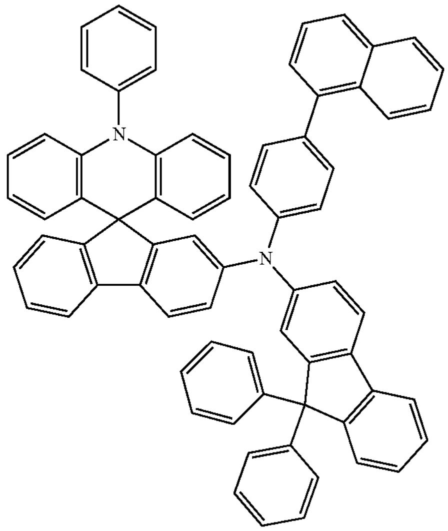
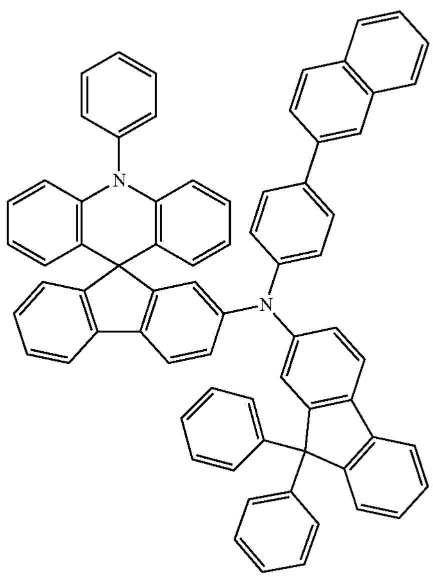
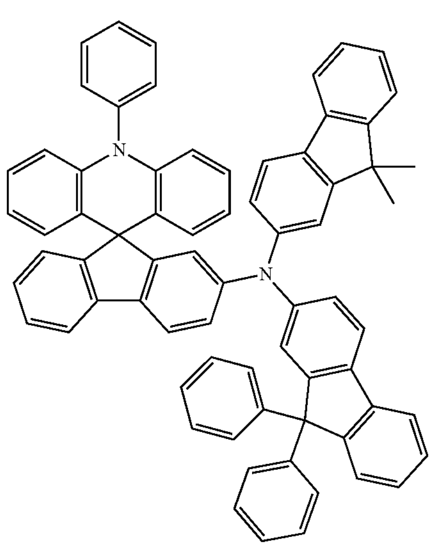
-continued
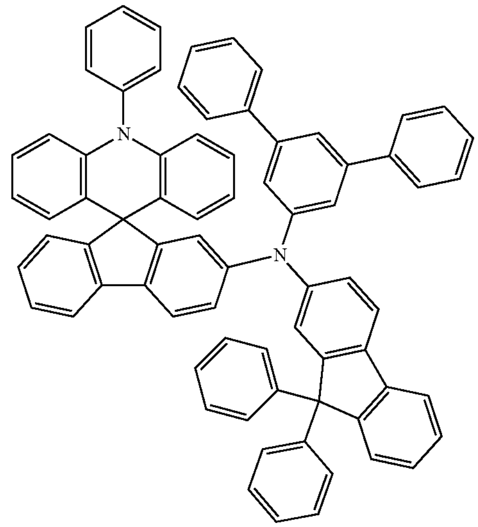
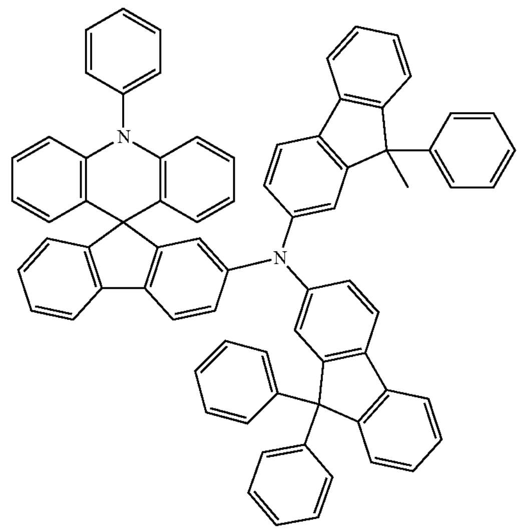
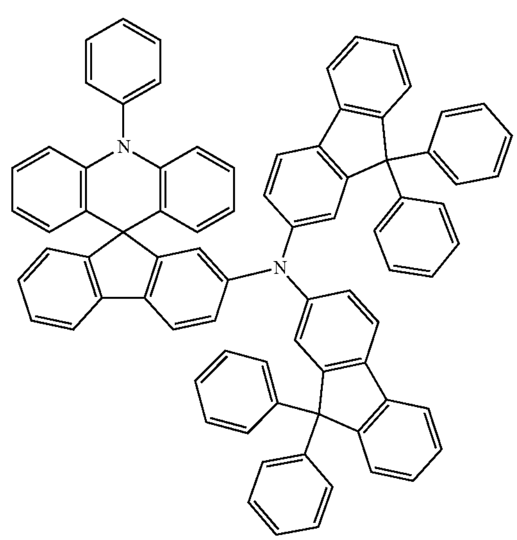

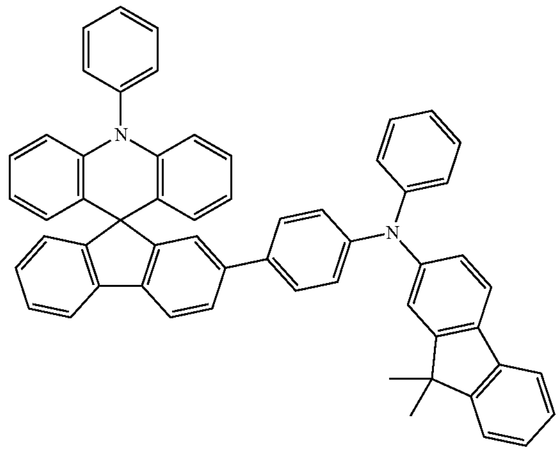
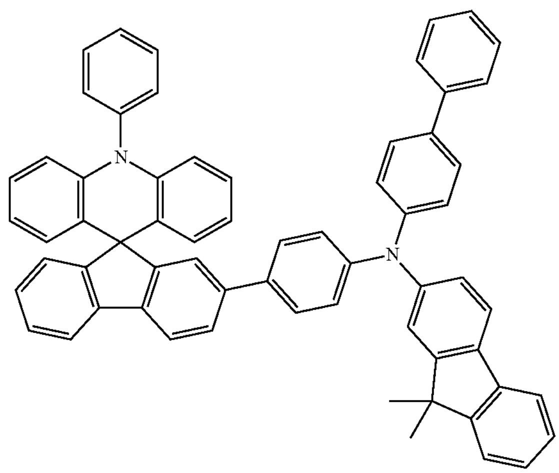
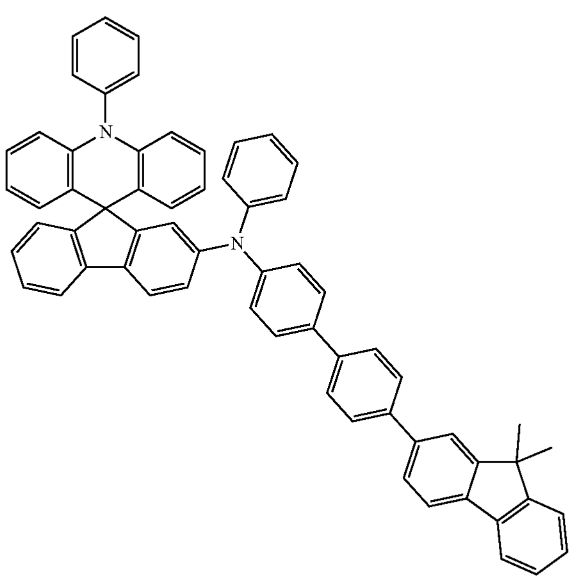
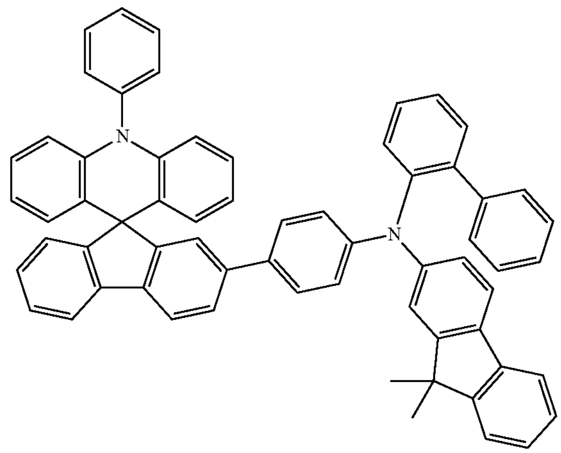
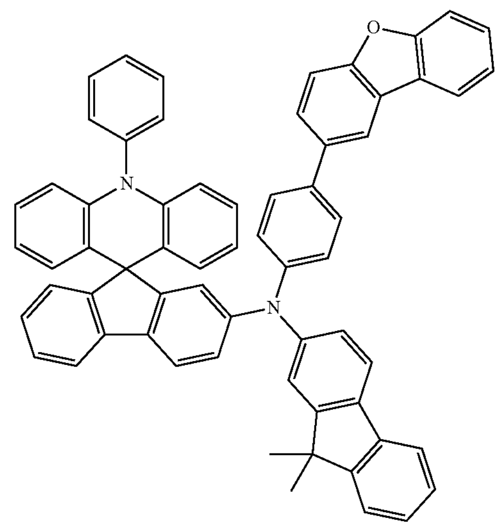
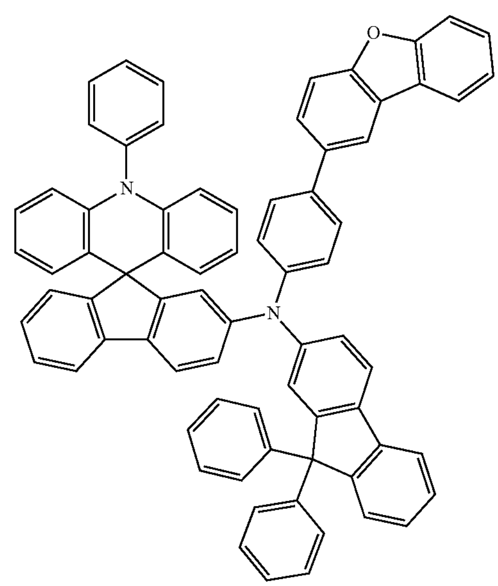

-continued
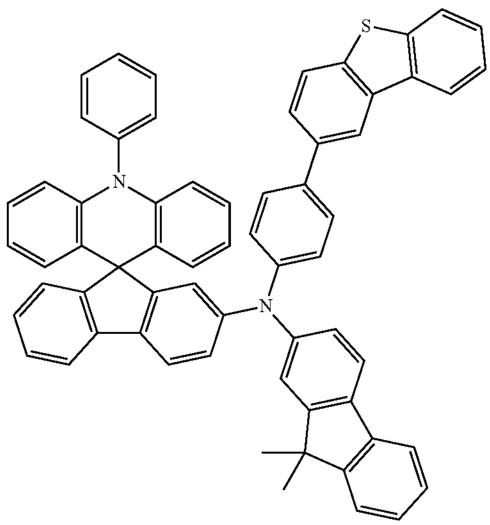
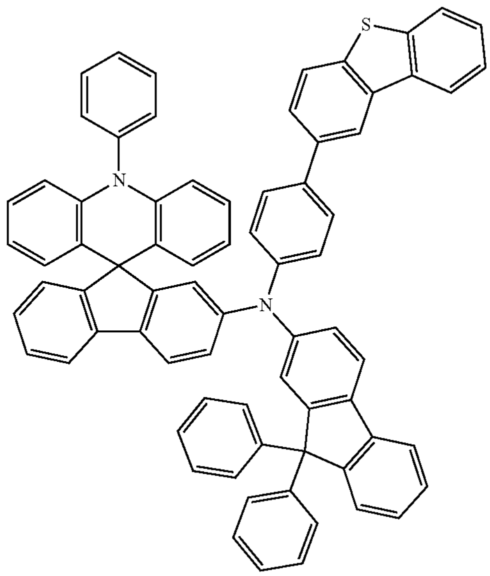
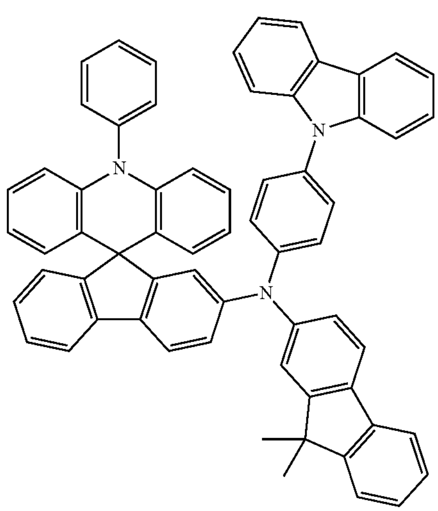
-continued
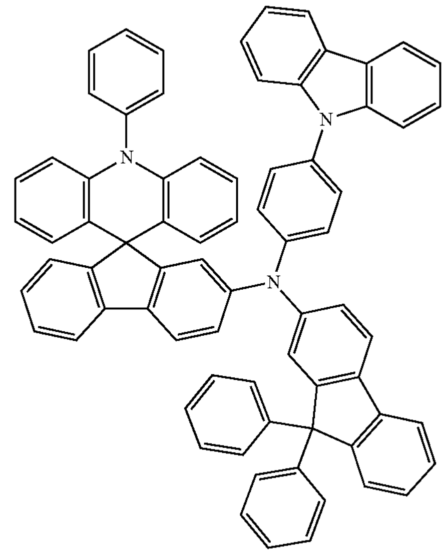
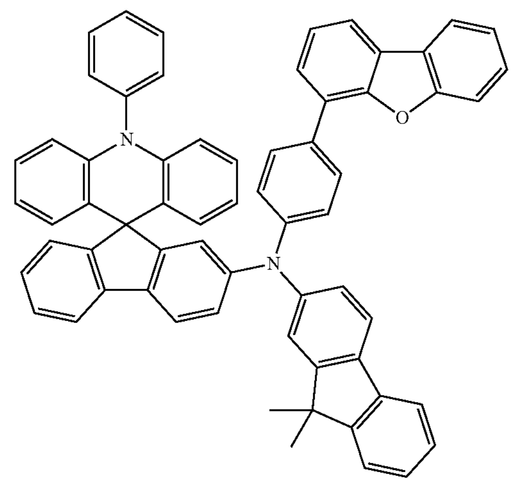
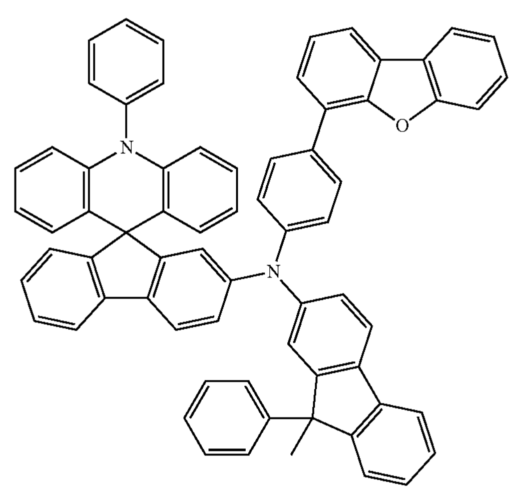

-continued
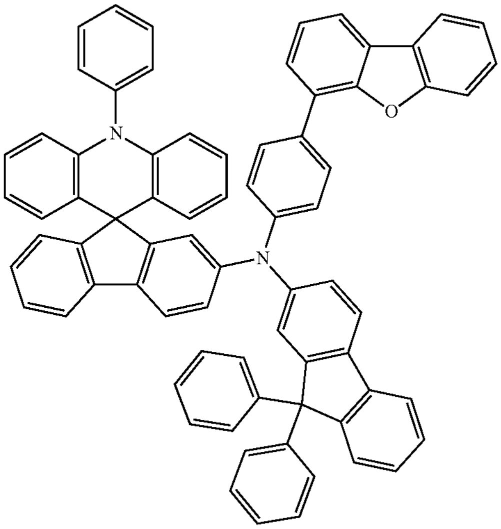
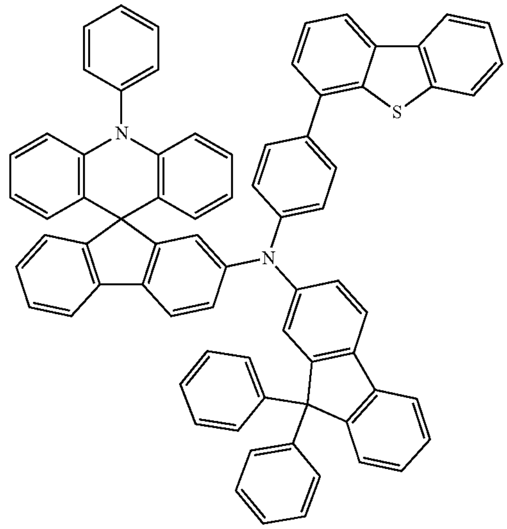
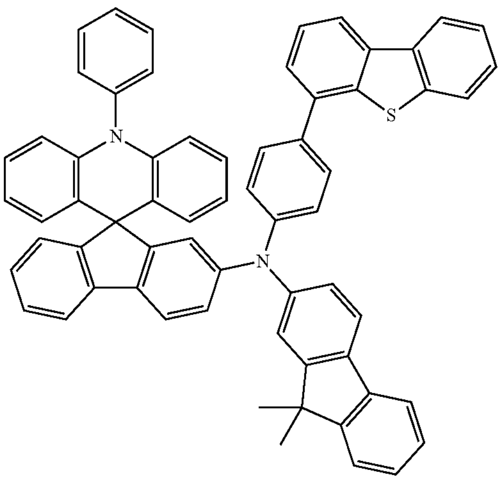
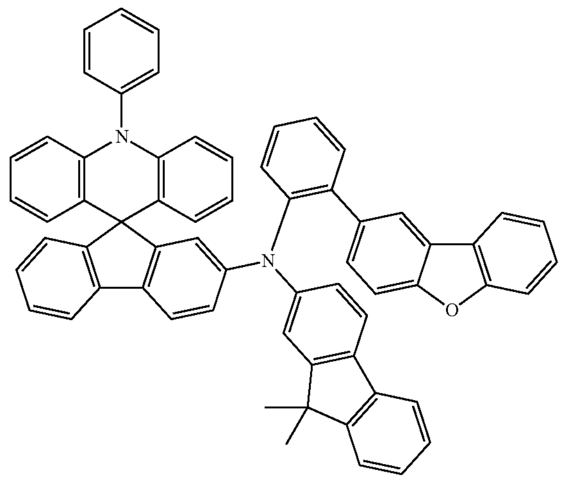
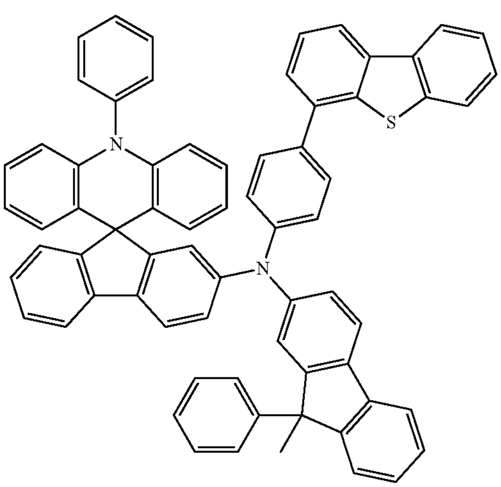
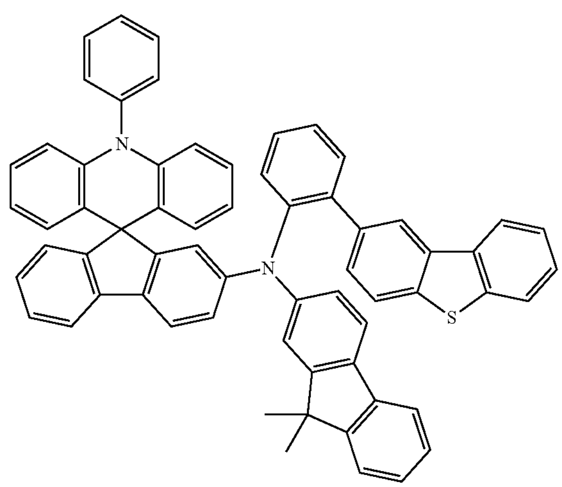

-continued
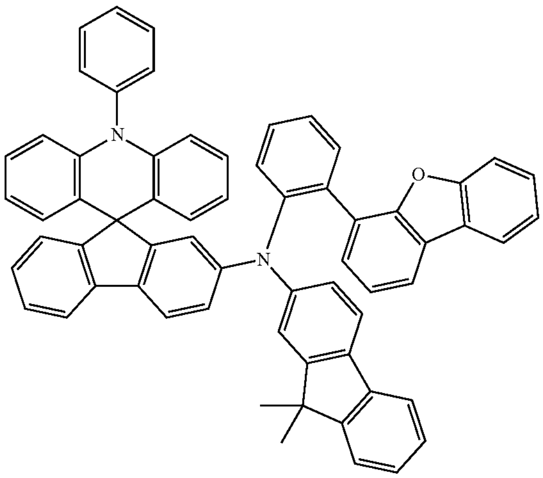
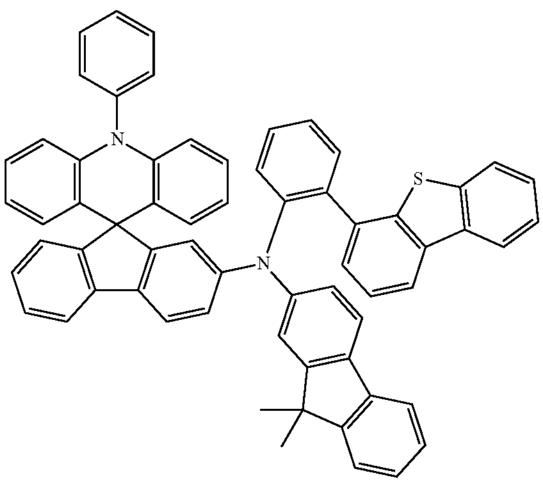
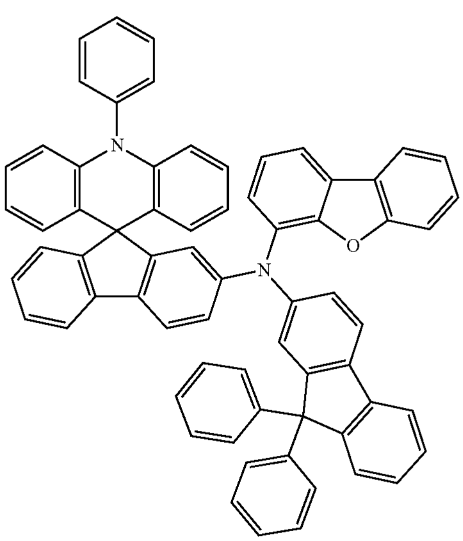
-continued
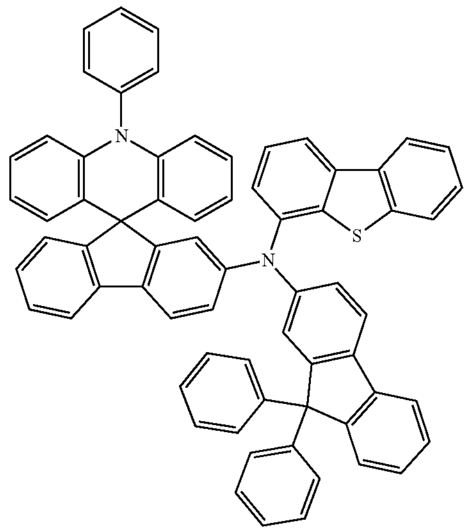
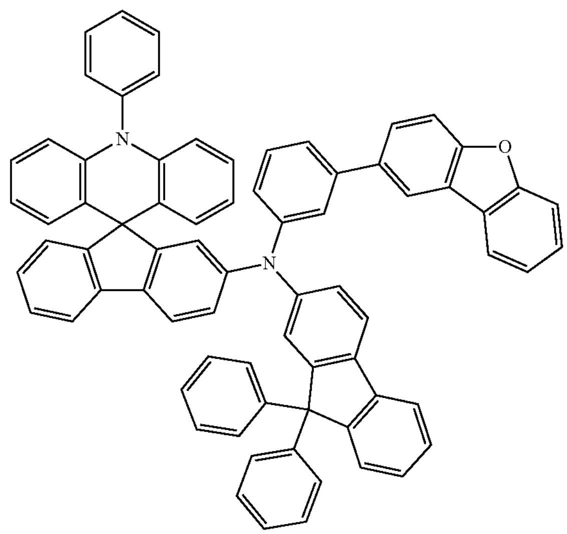
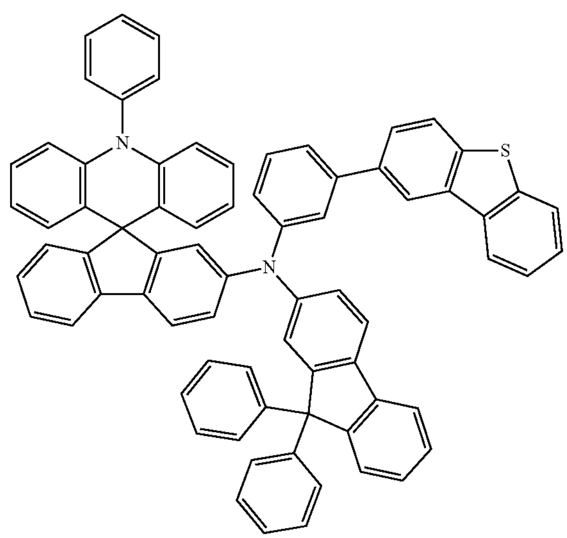

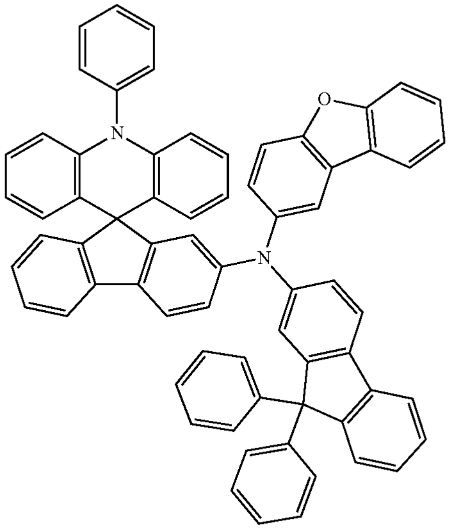
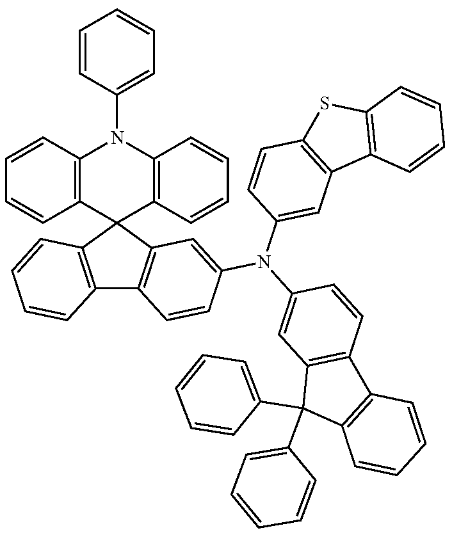
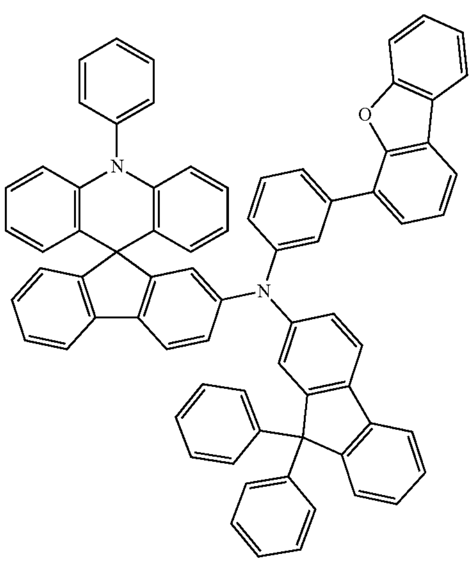
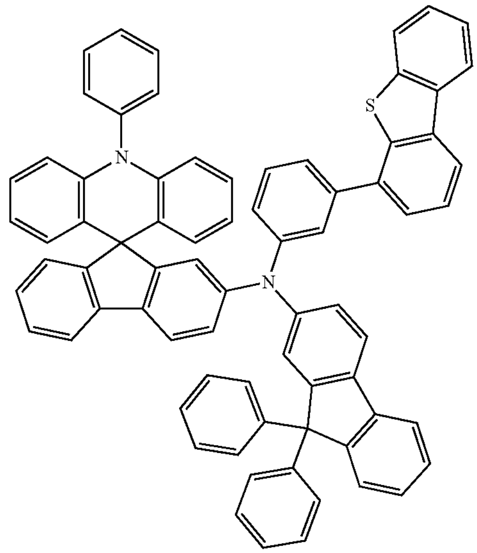
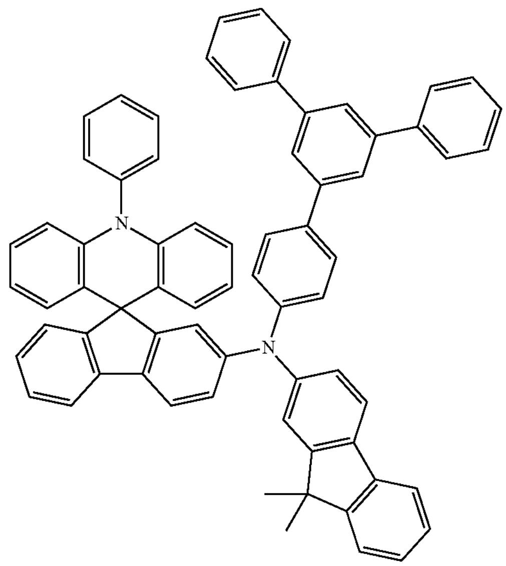
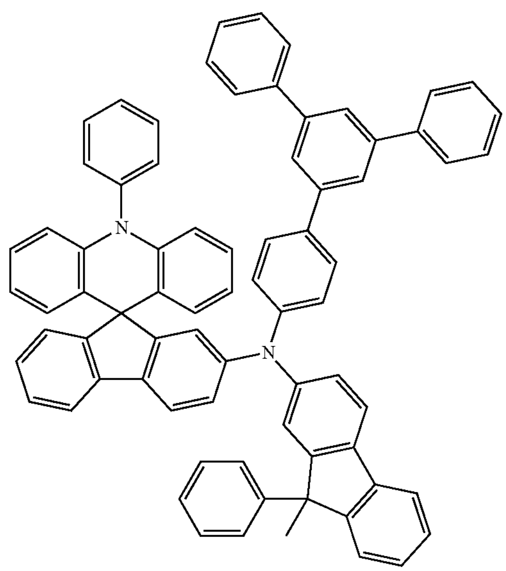

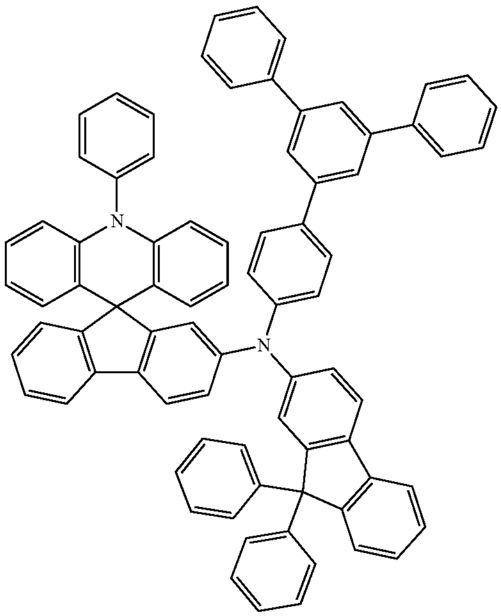
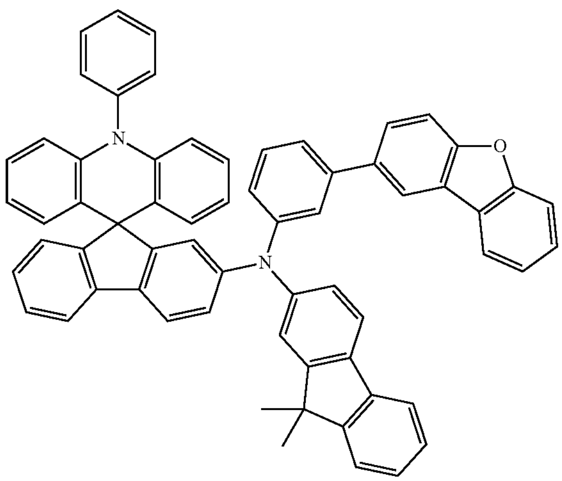
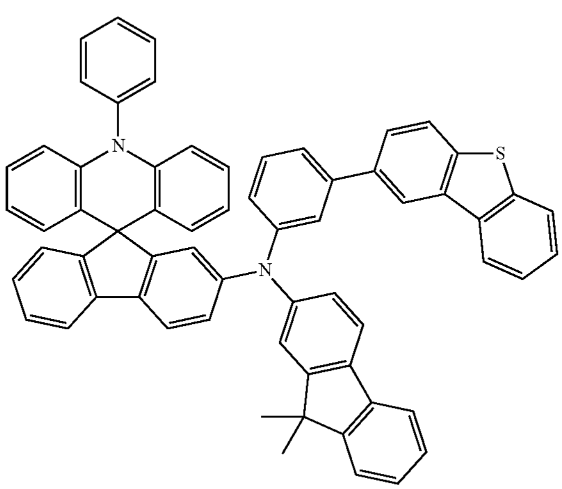
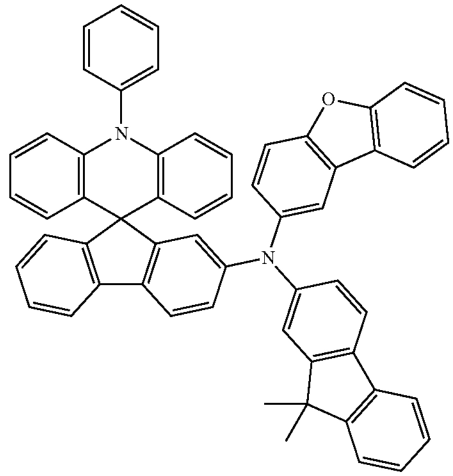
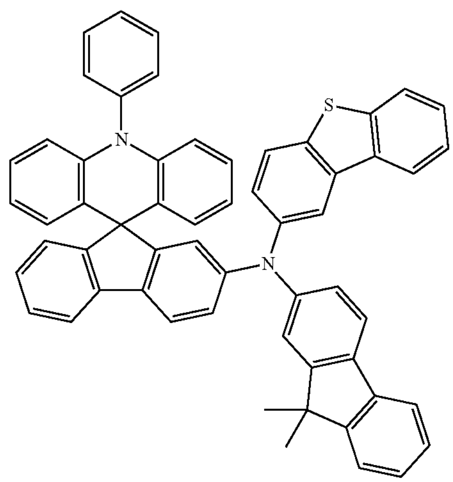
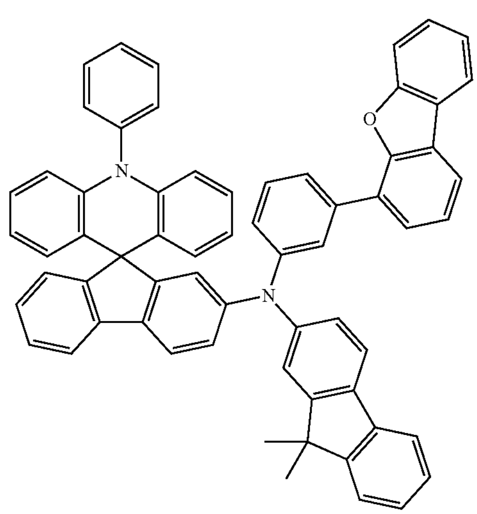

-continued
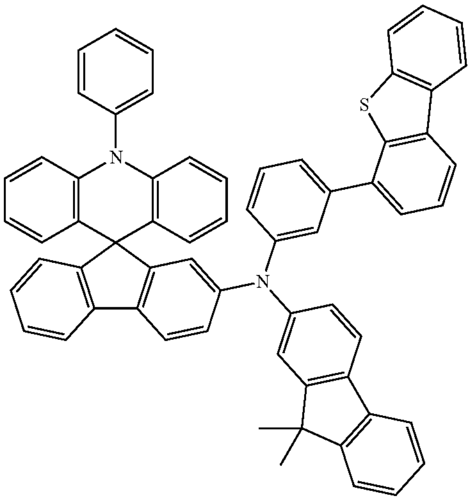
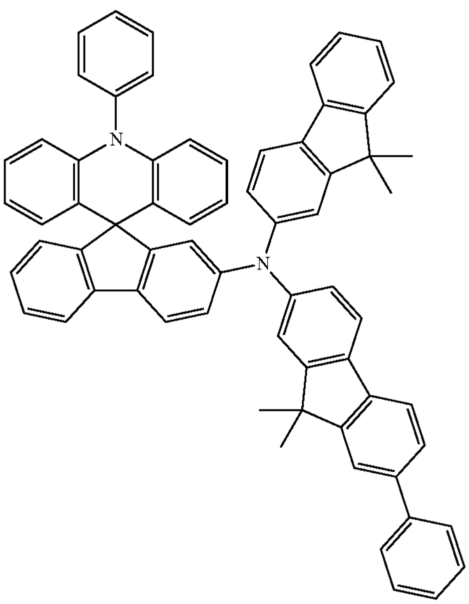
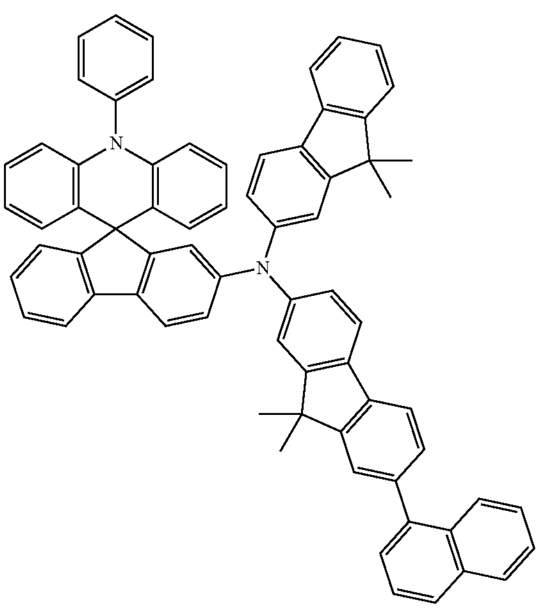
-continued
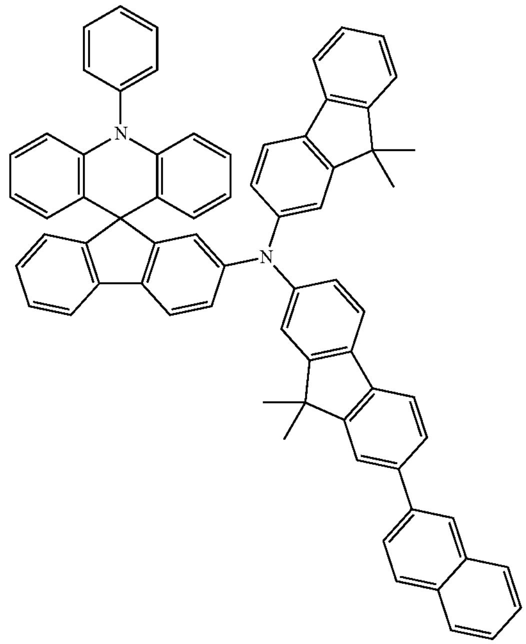
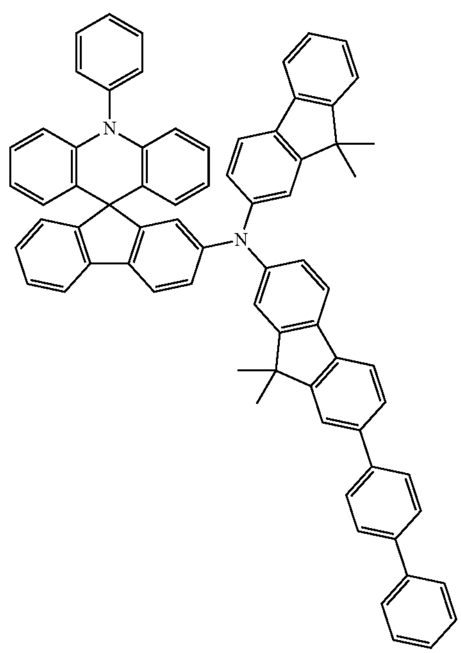

-continued
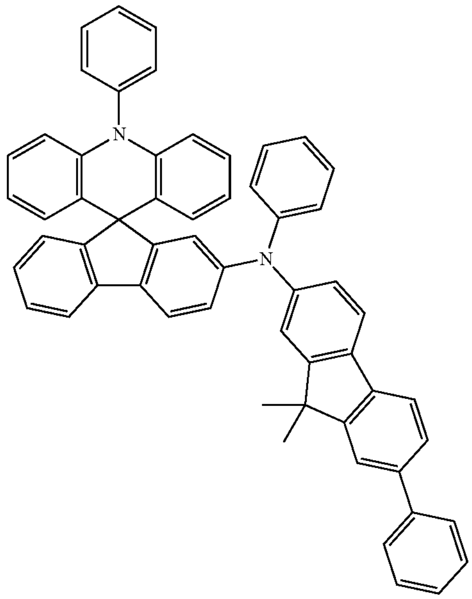
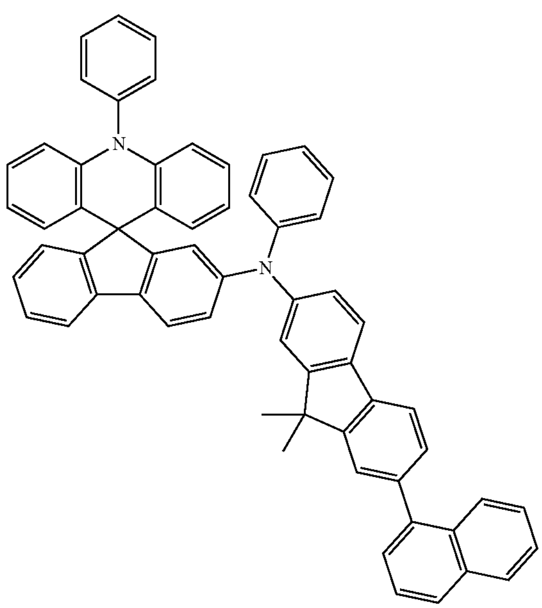
-continued
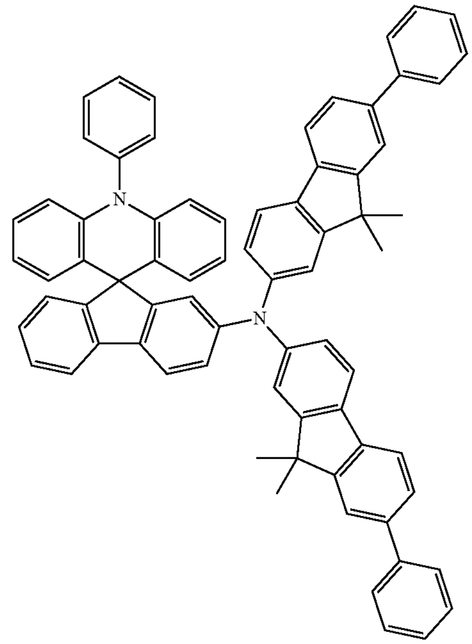
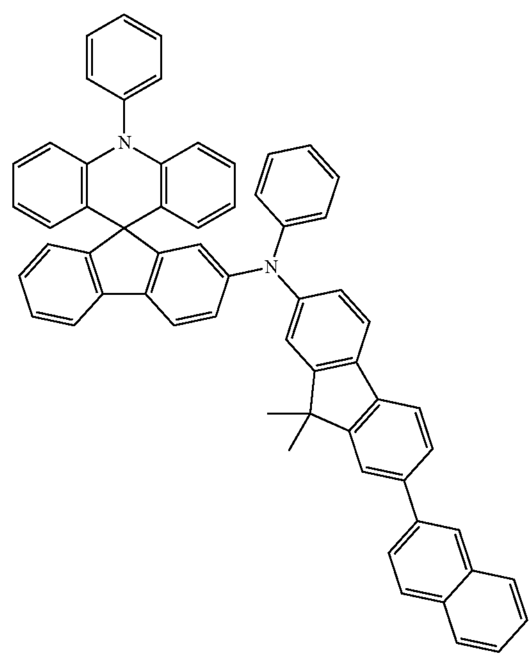

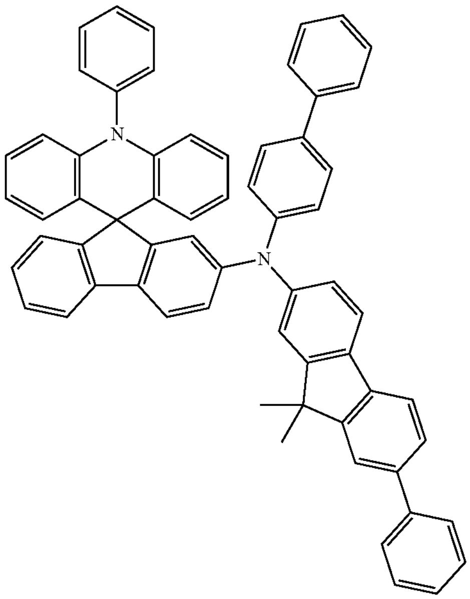
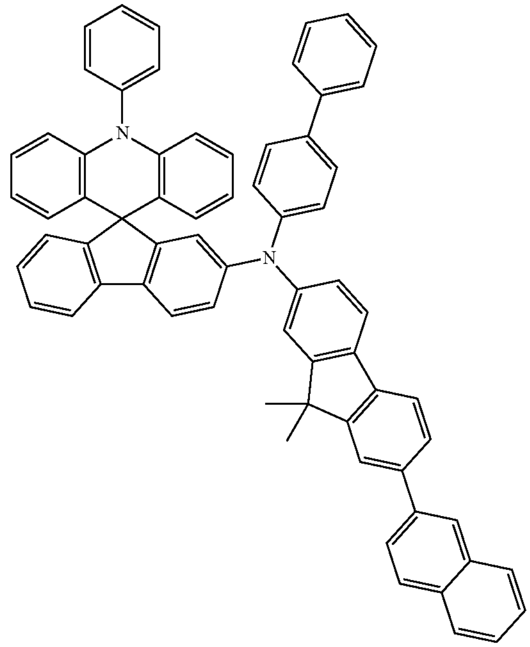
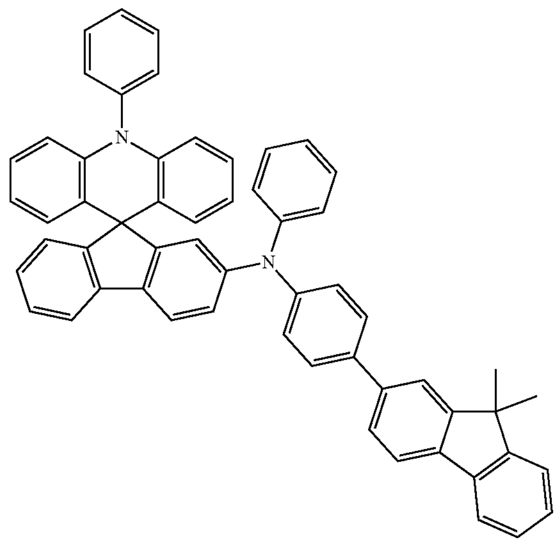
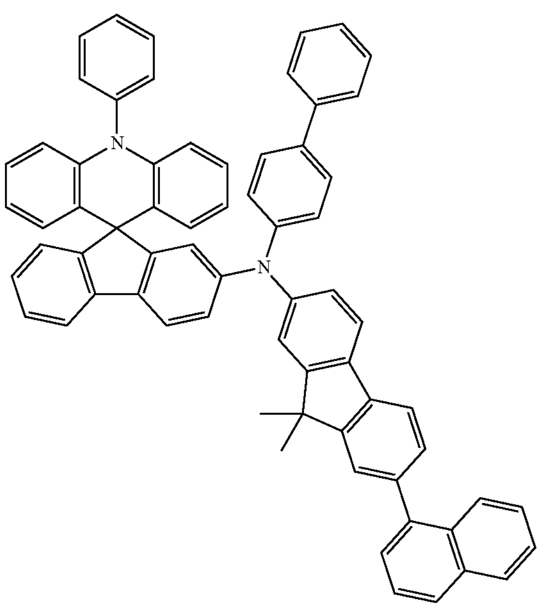
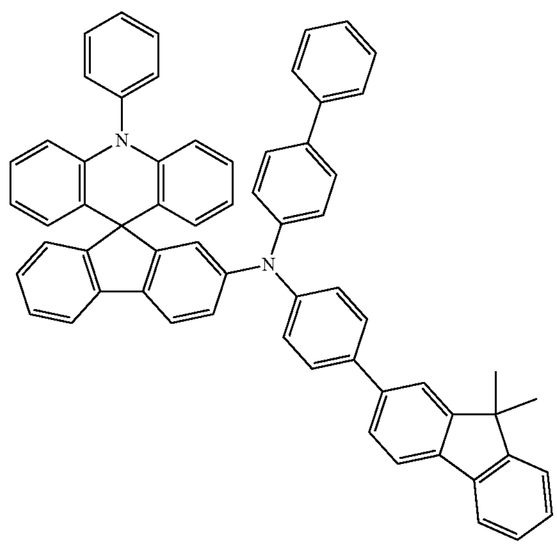
N

-continued
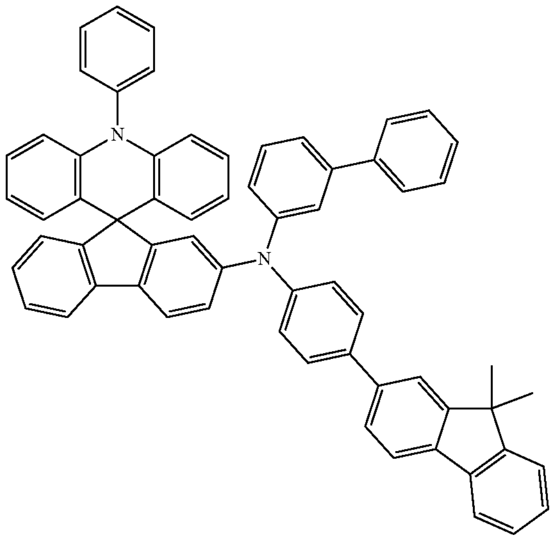
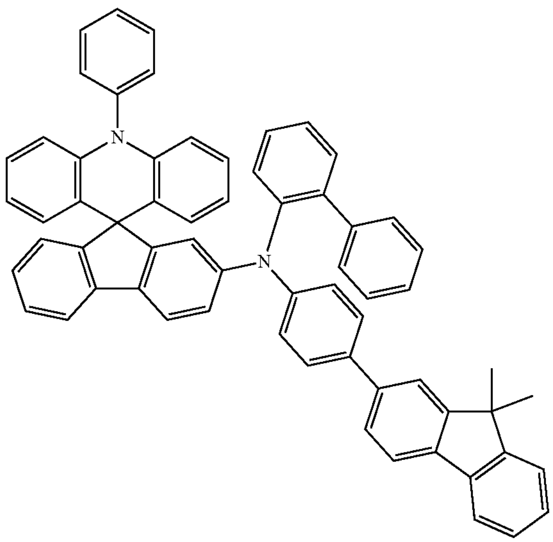
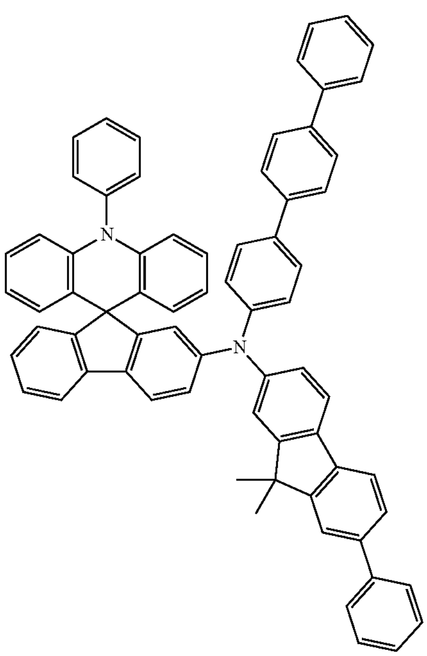
-continued
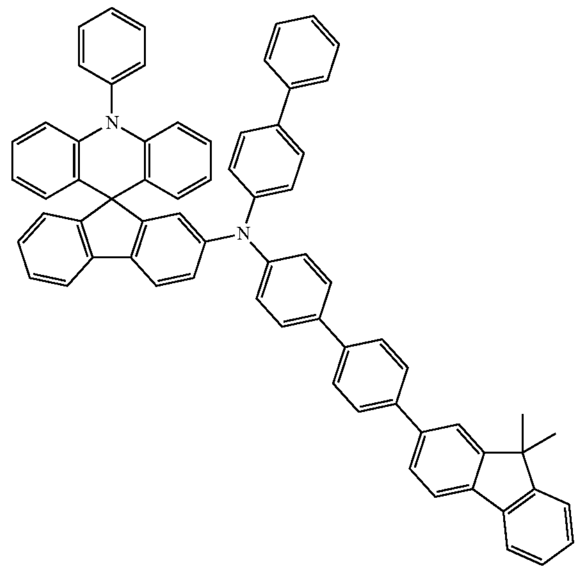
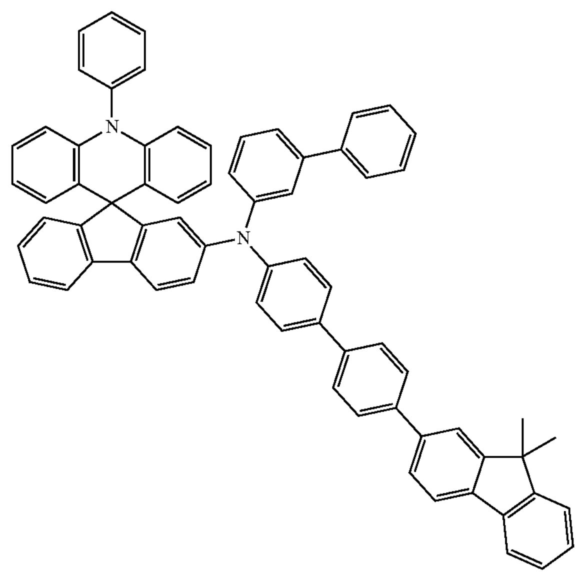
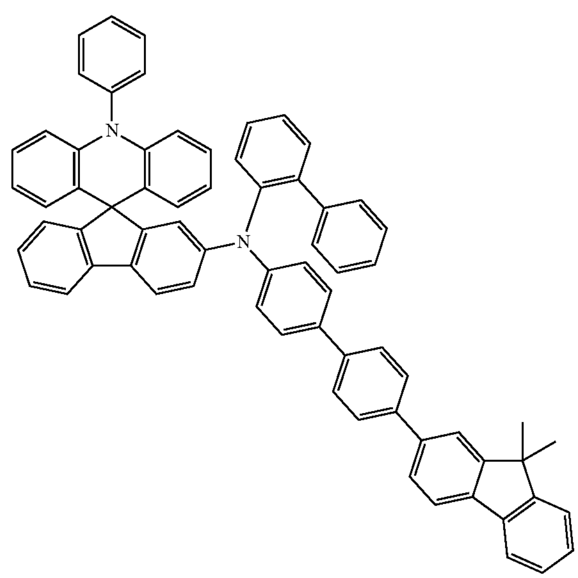

-continued
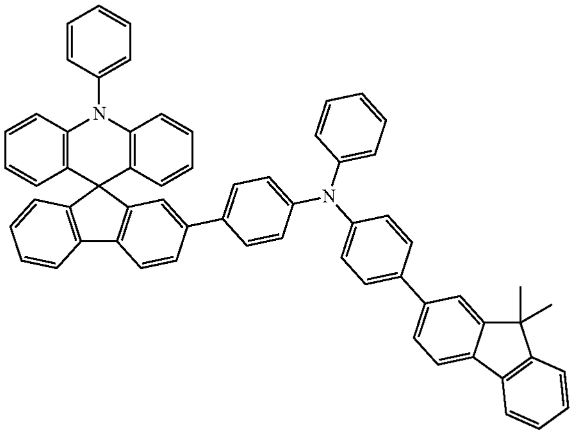
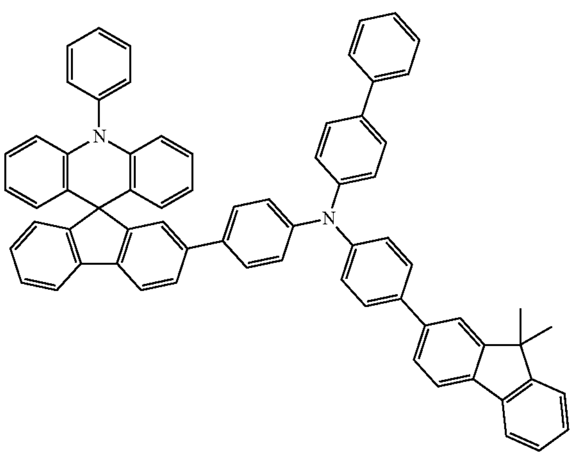
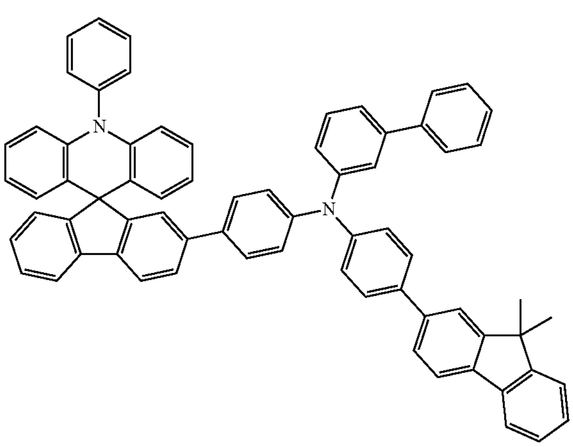
-continued
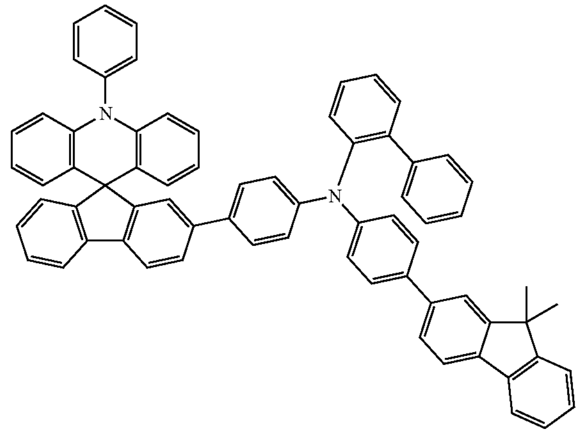
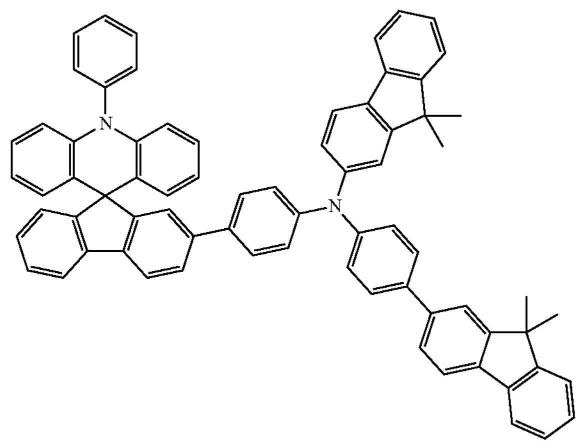
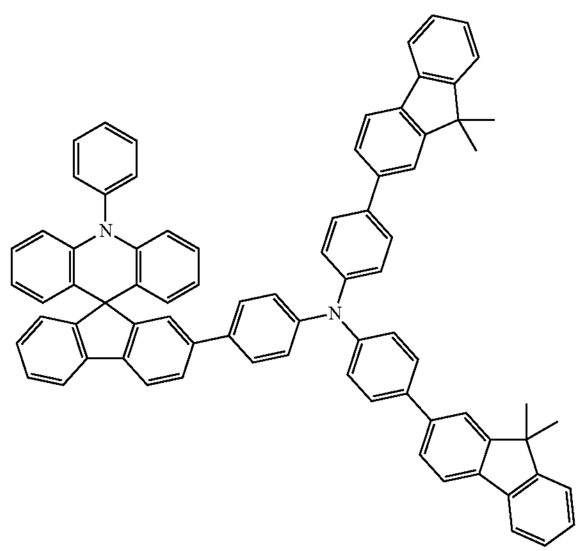

-continued
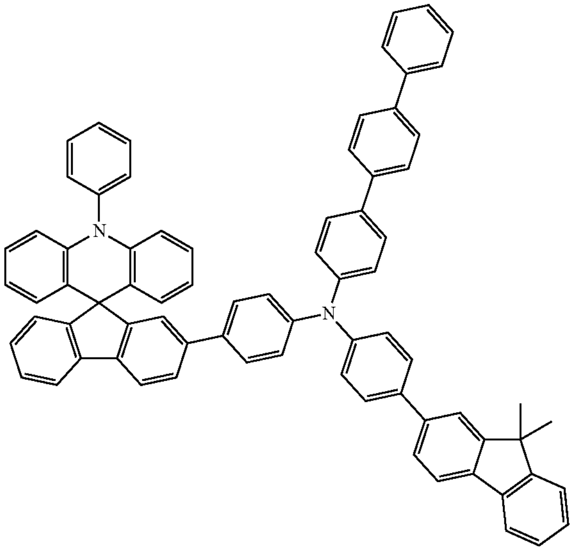
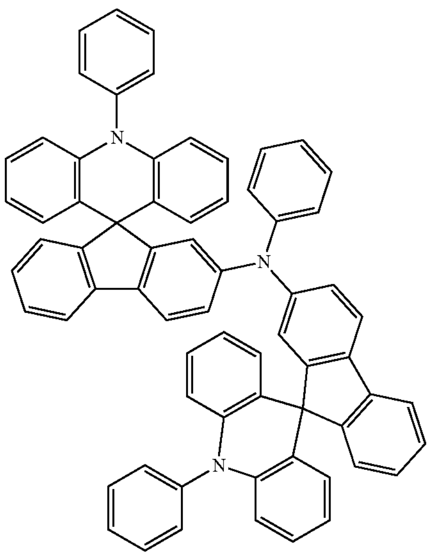
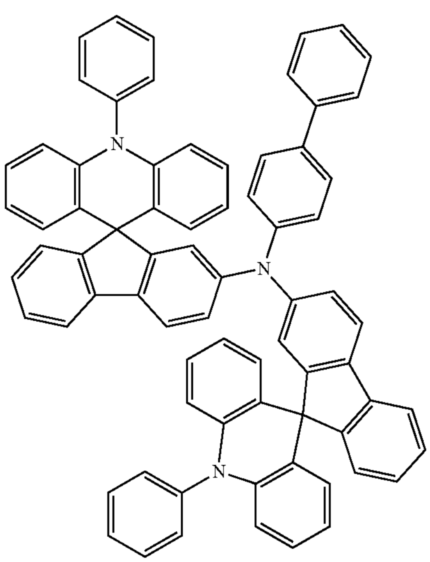
-continued
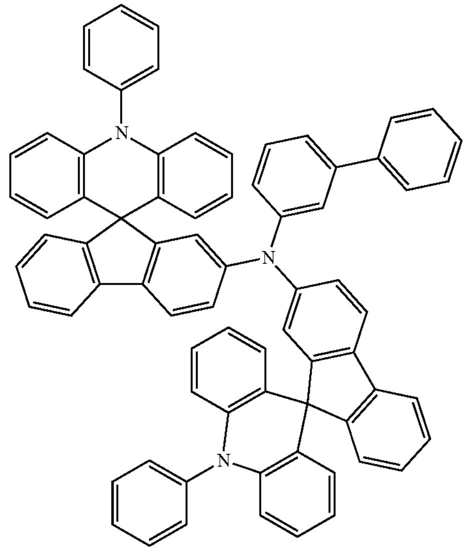
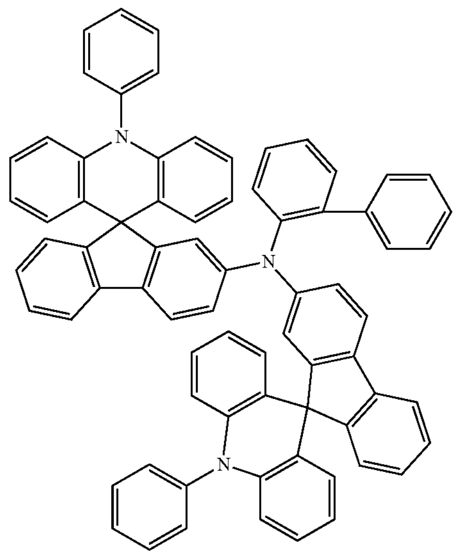
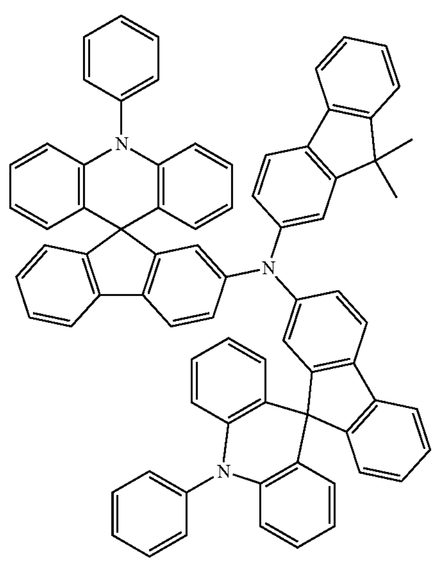

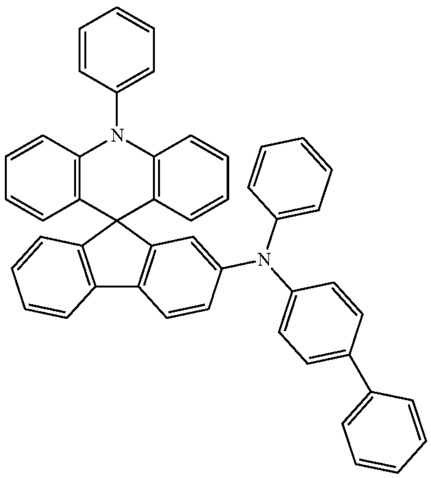
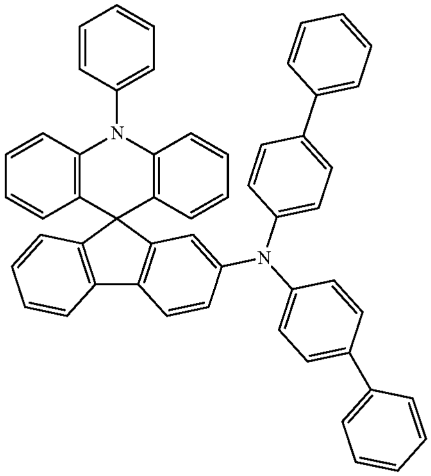
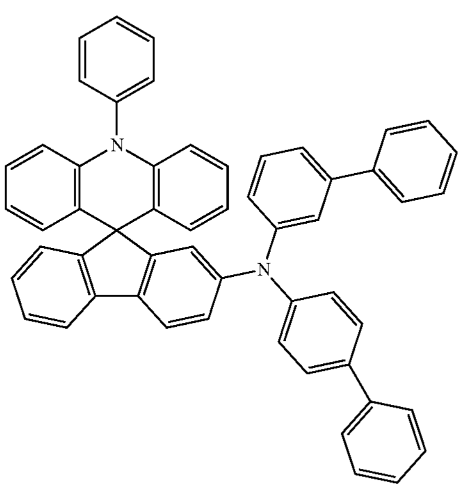
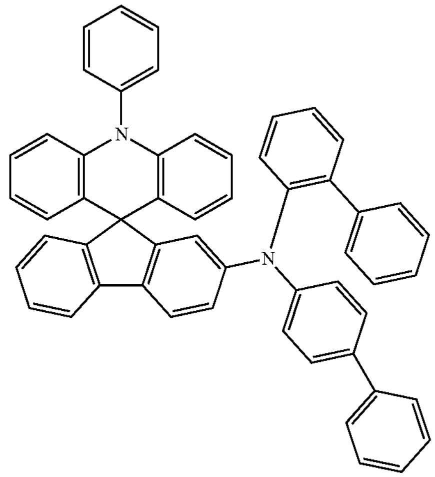
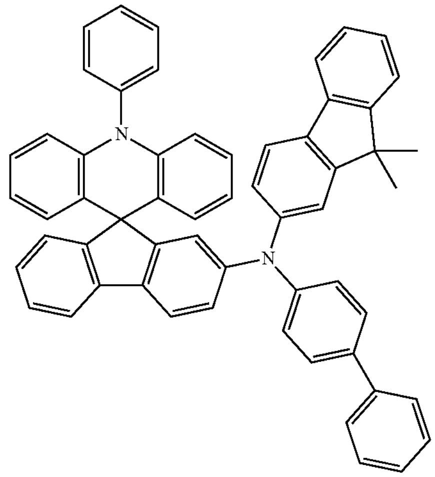
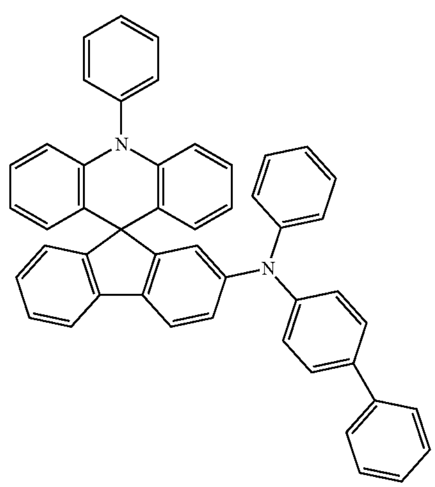

-continued
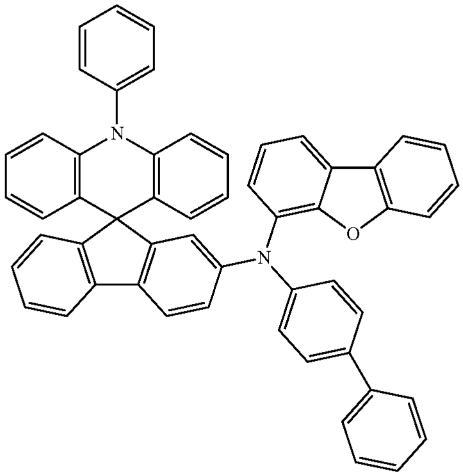
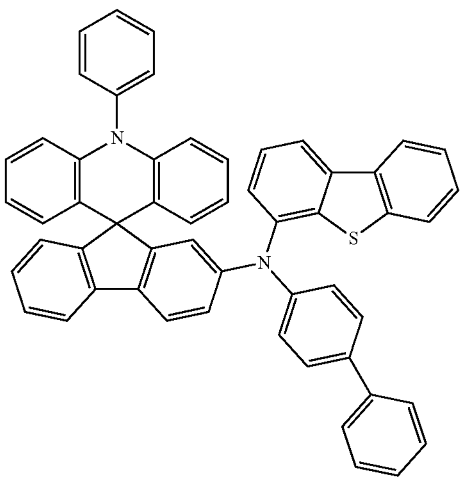
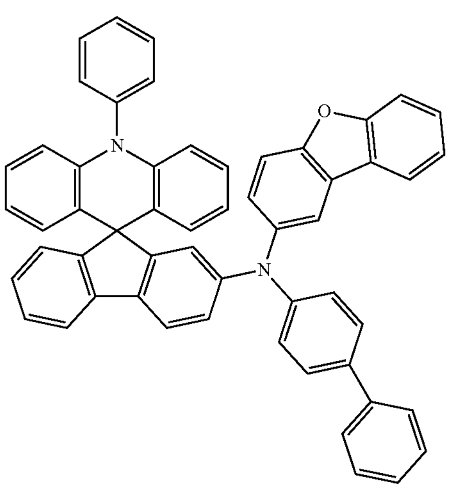
-continued
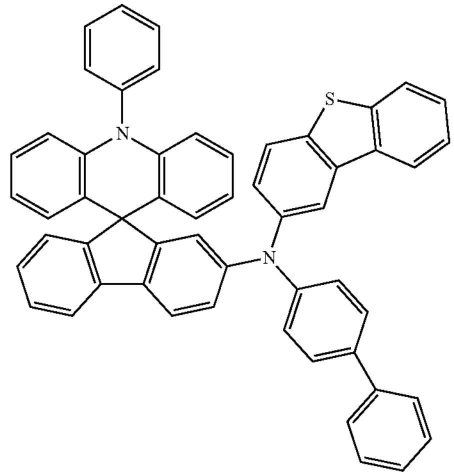
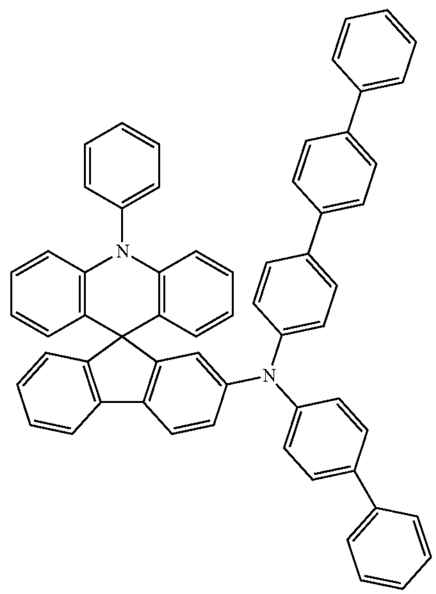
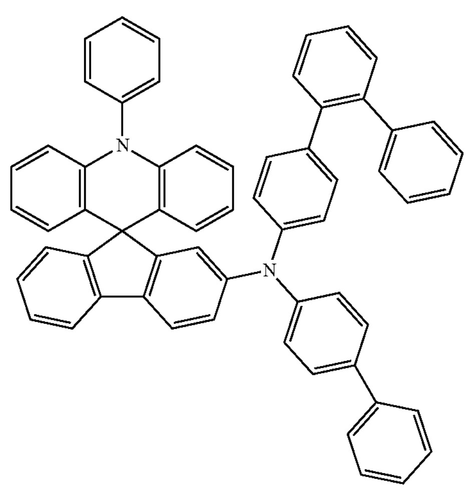

-continued
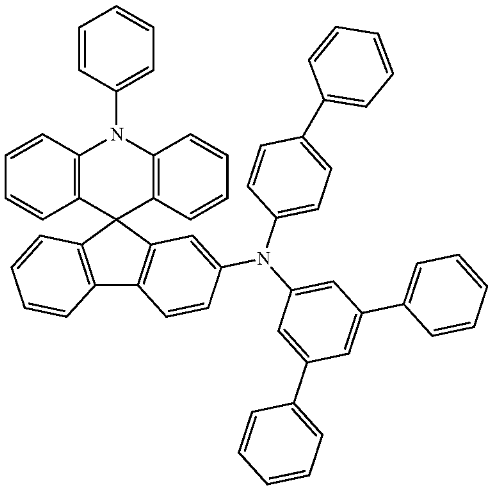
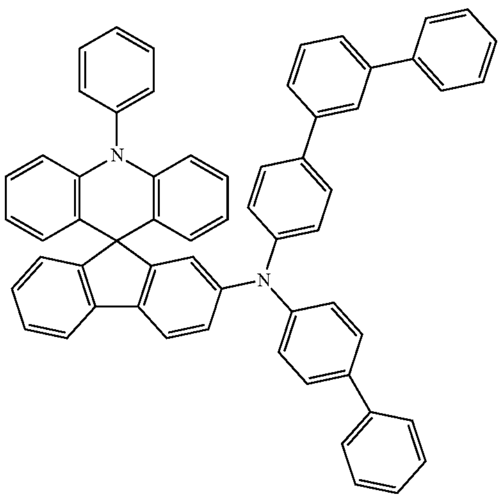
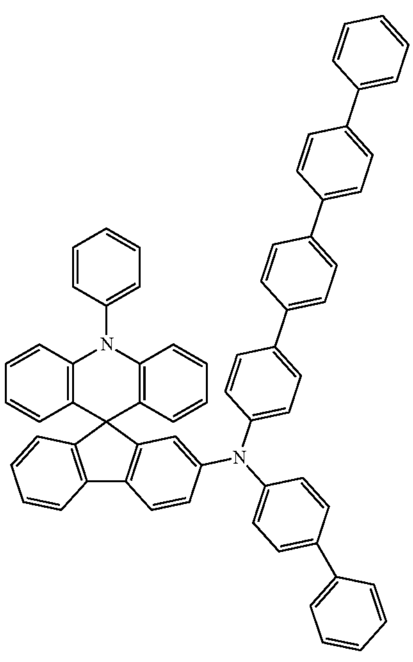
-continued
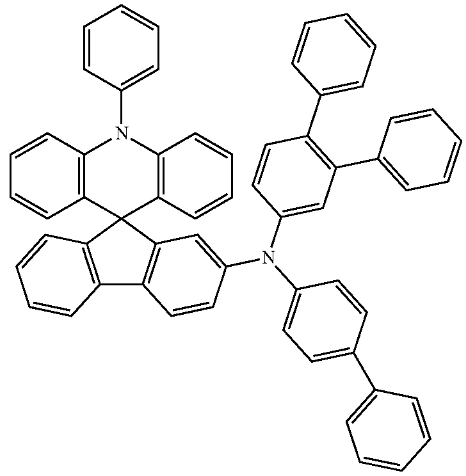
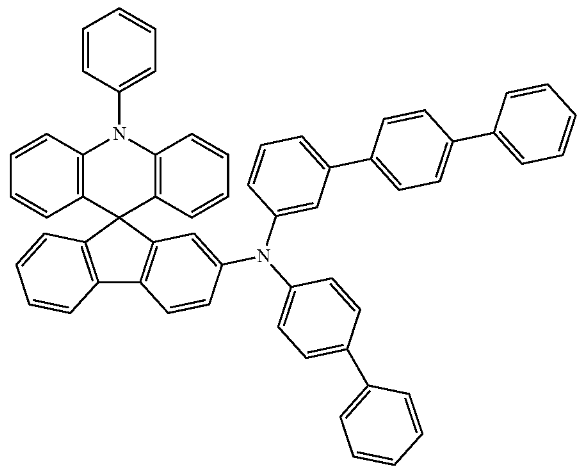
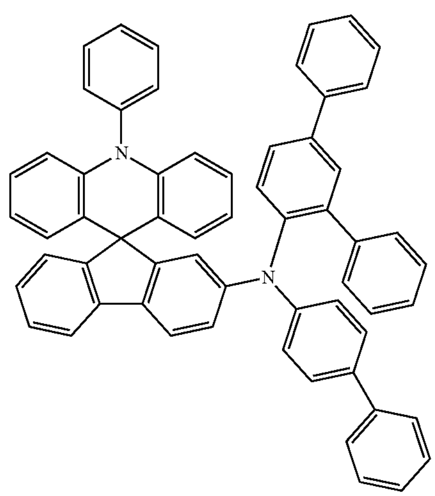

-continued
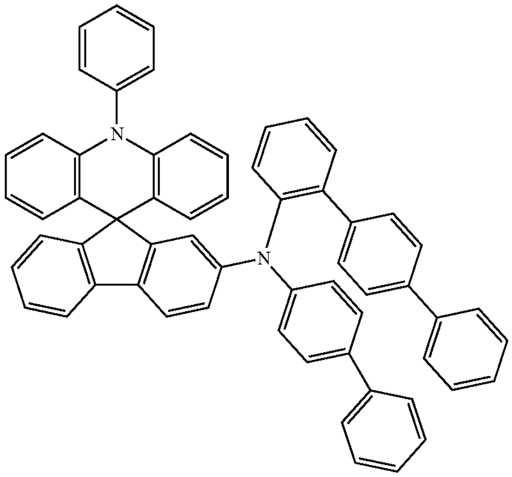
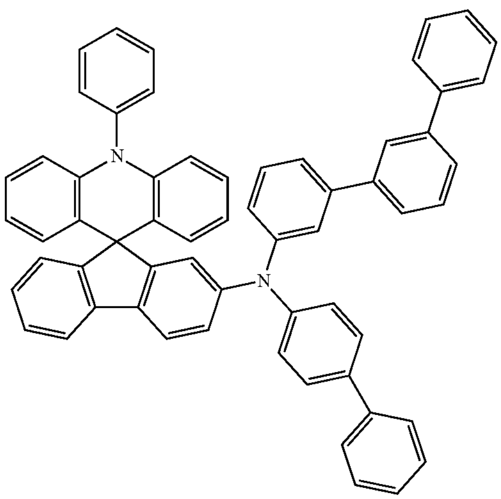
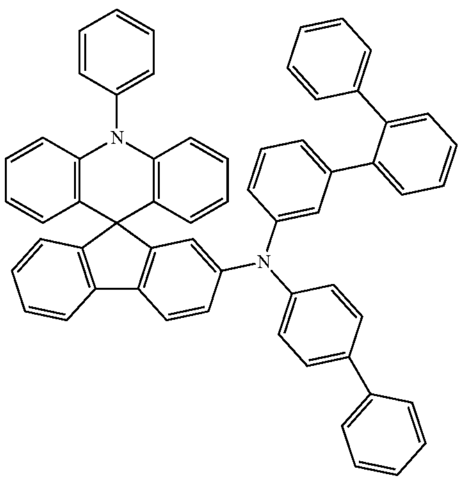
-continued
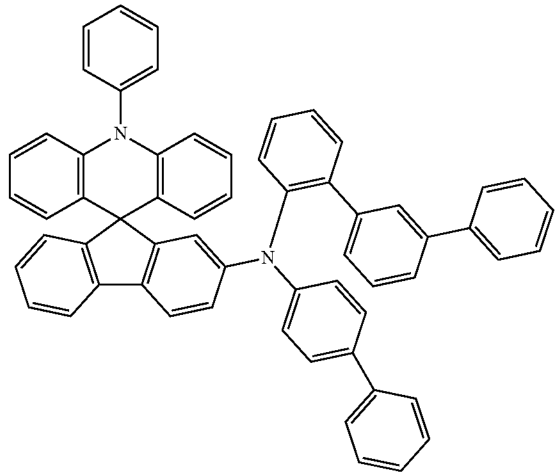
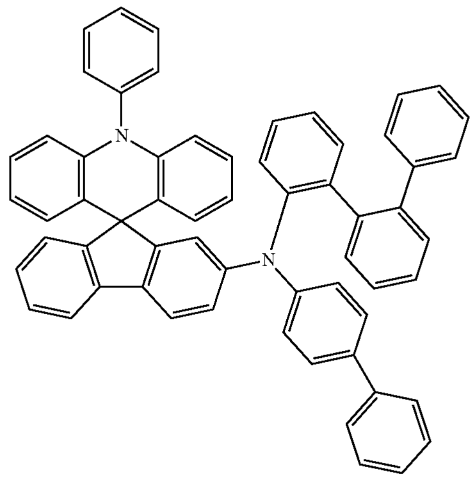
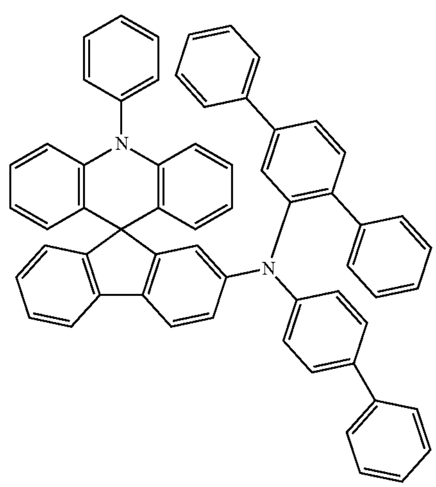

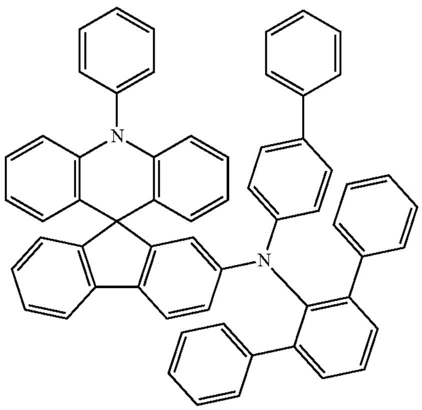
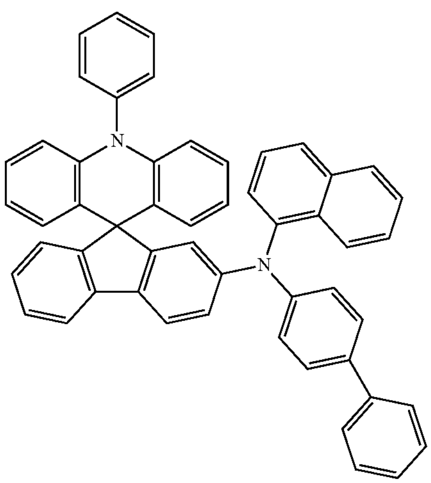
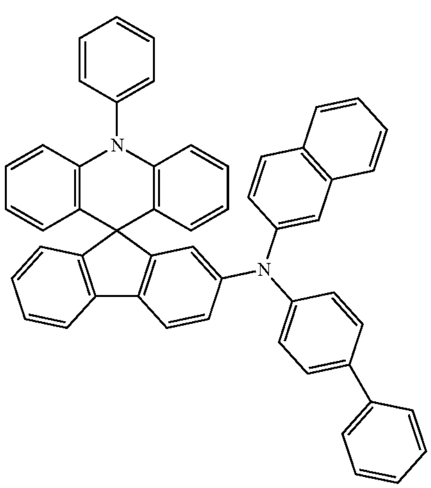
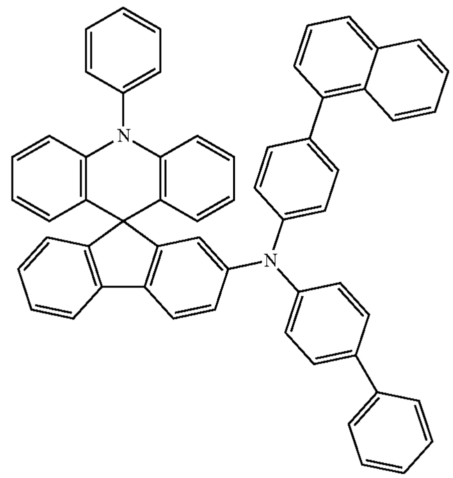
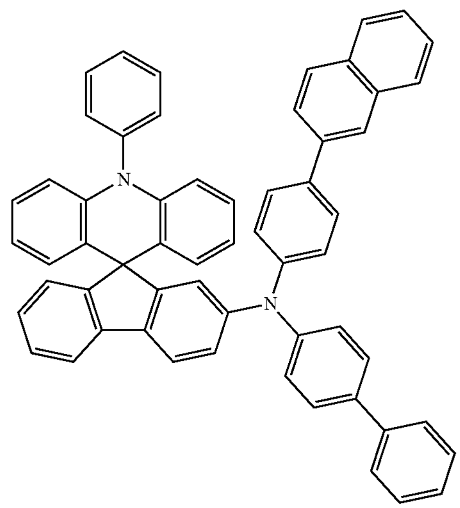
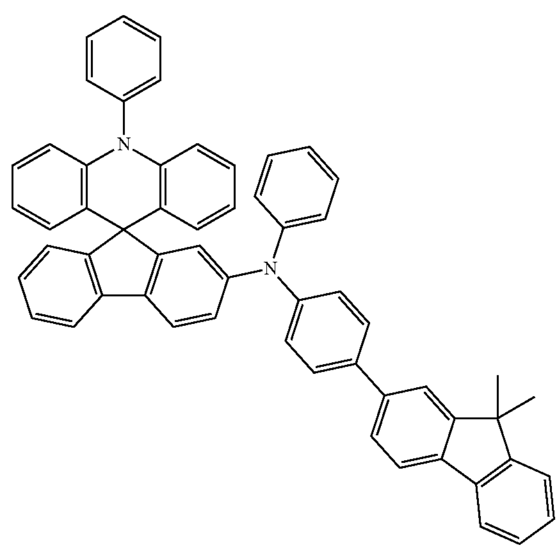

-continued
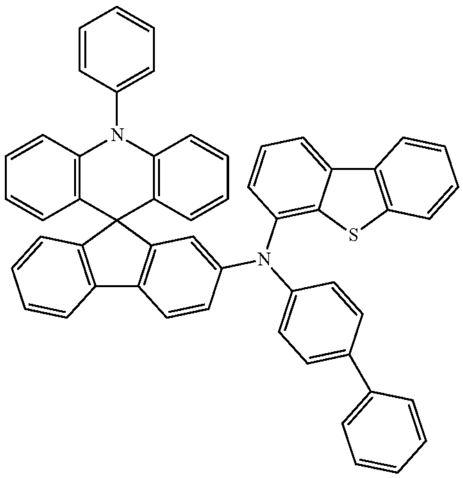
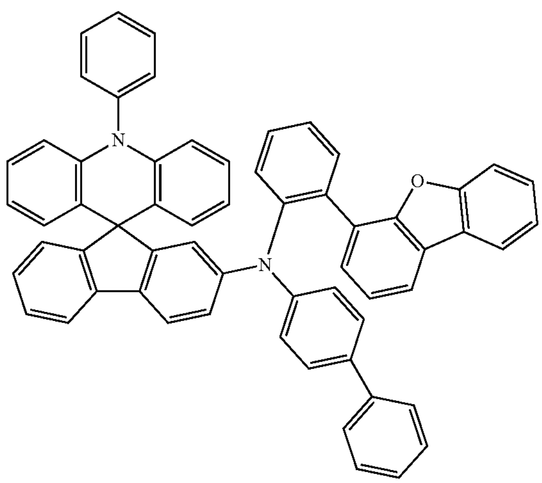
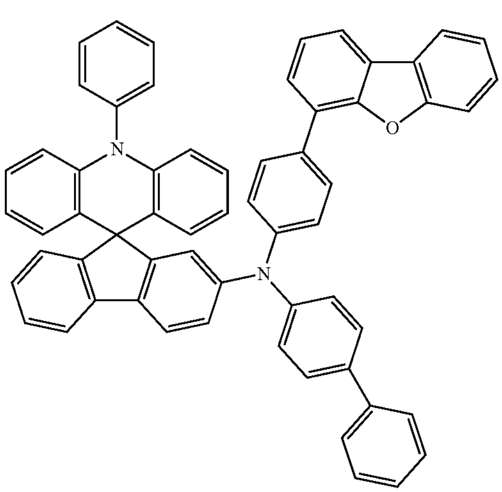
-continued
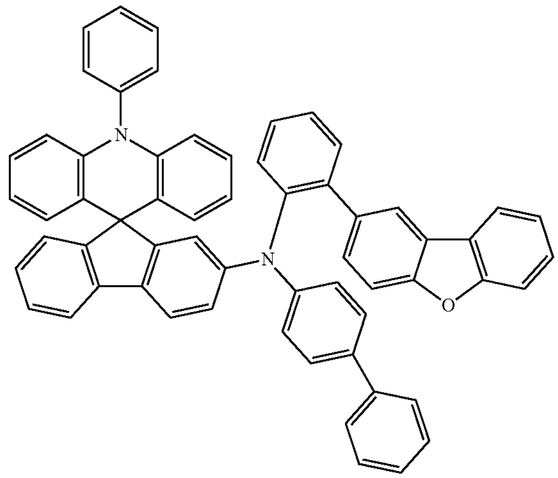
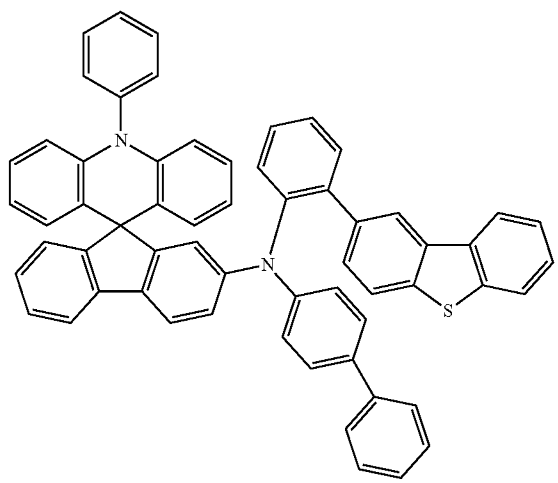
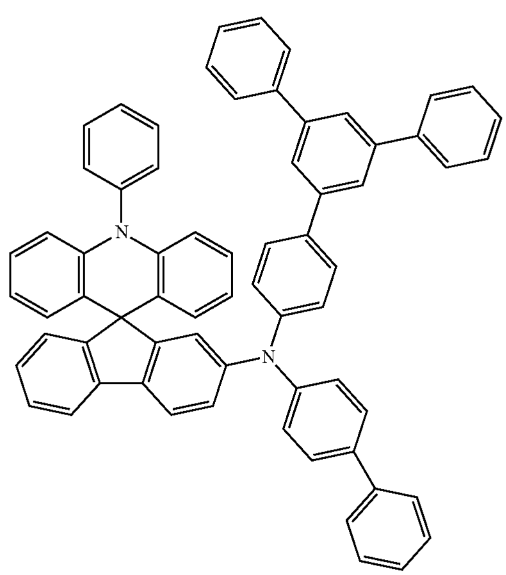

-continued
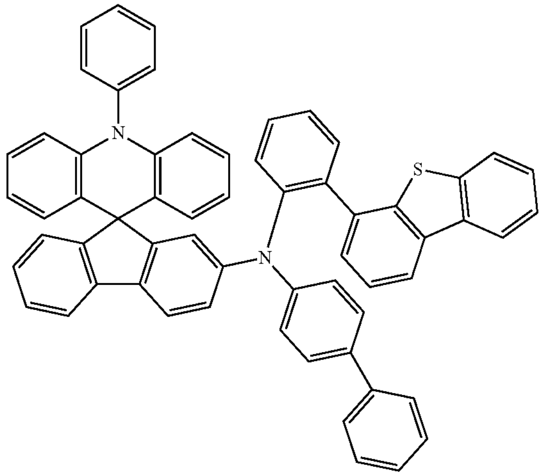
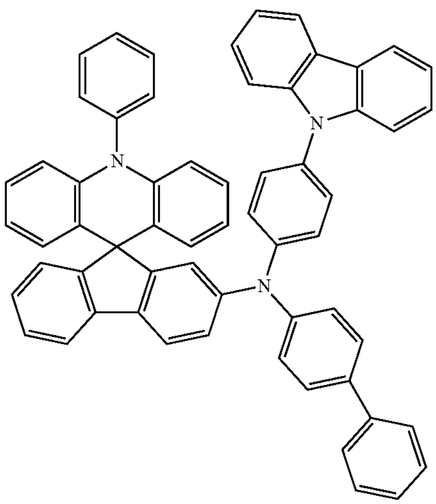
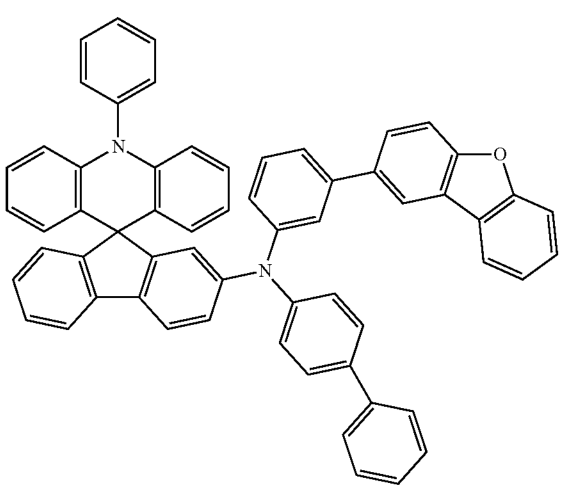
-continued
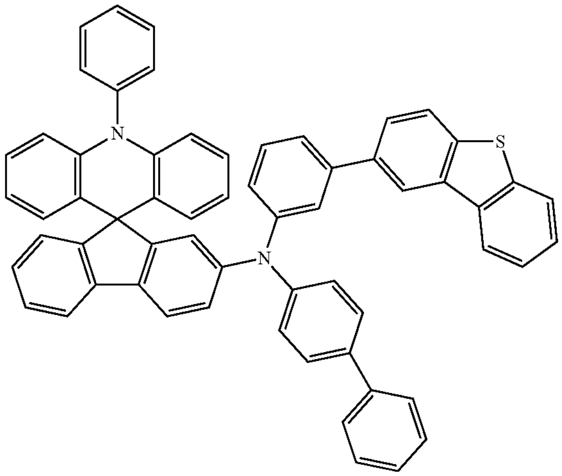
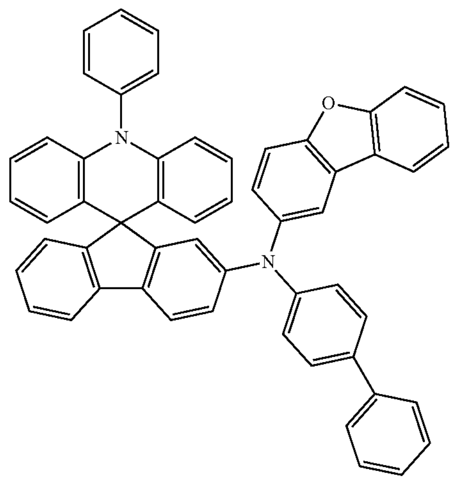
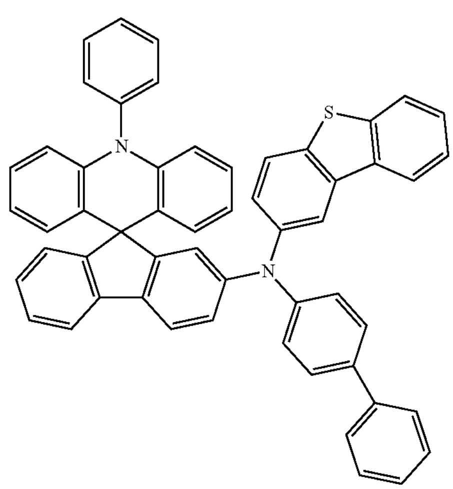

-continued
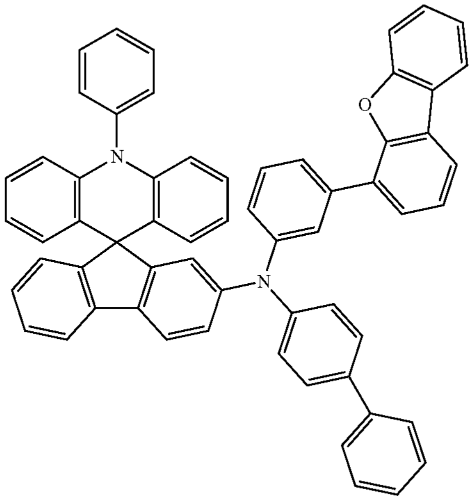
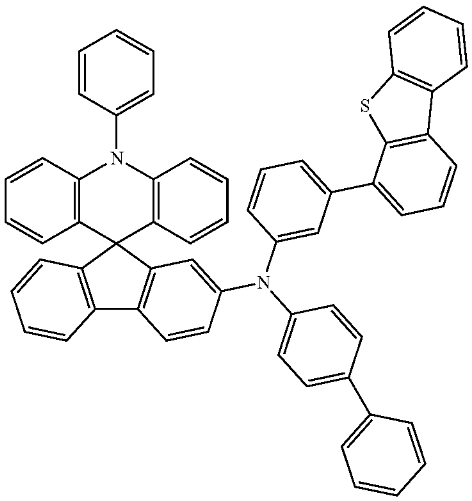
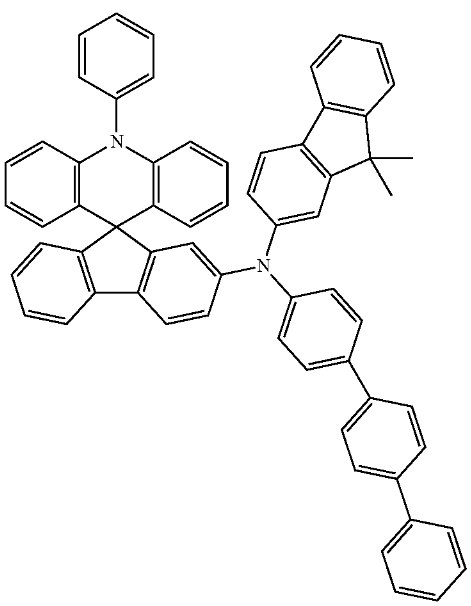
-continued
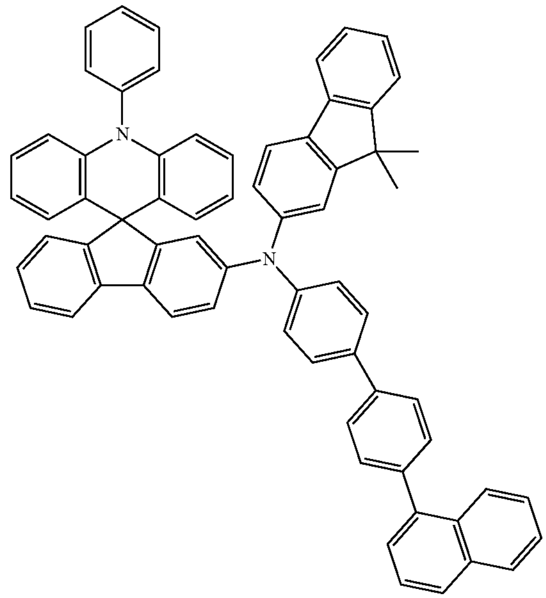
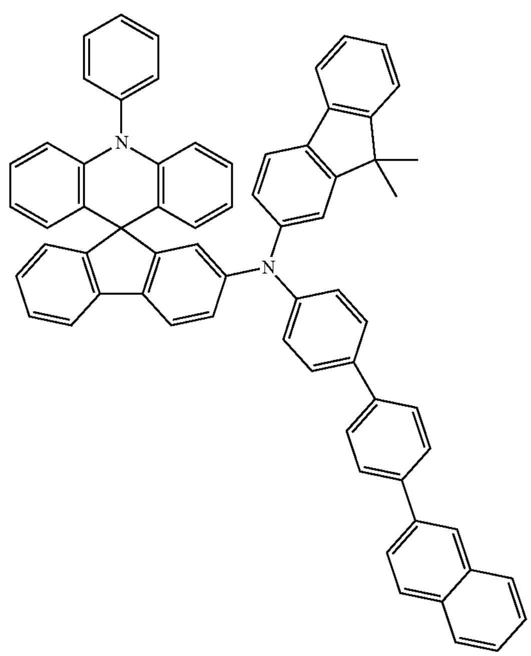

-continued
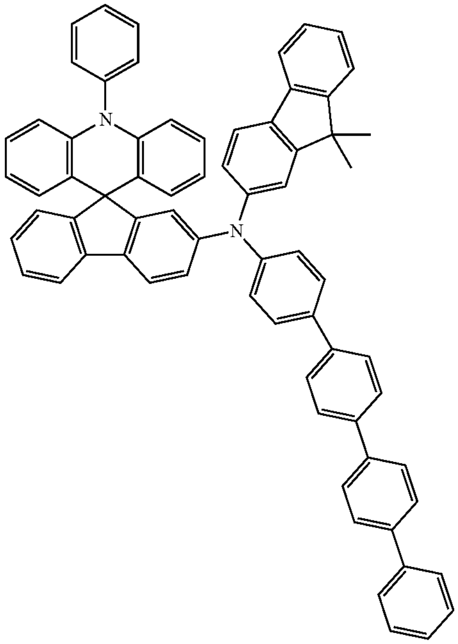
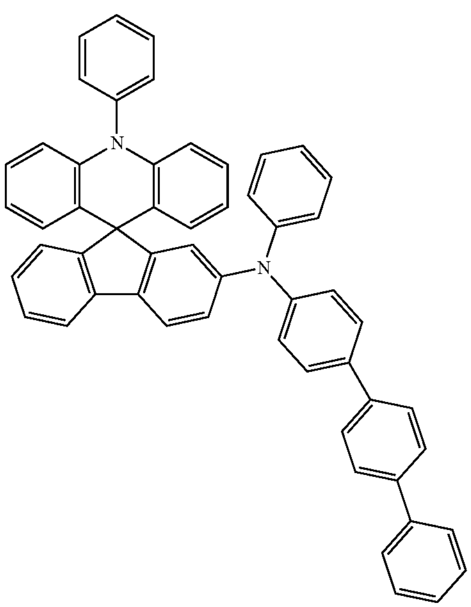
-continued
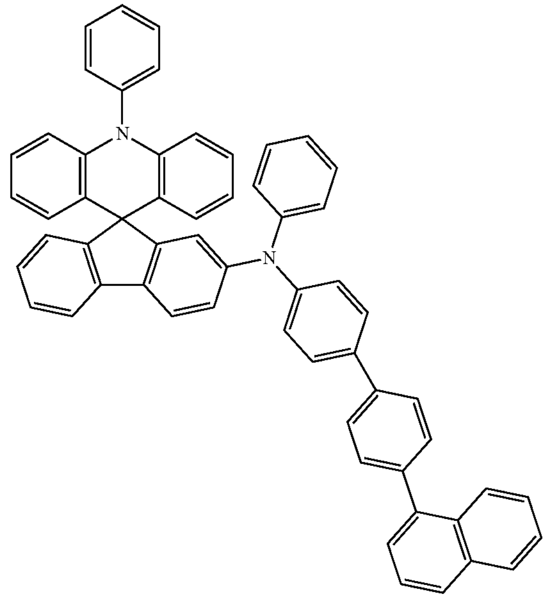
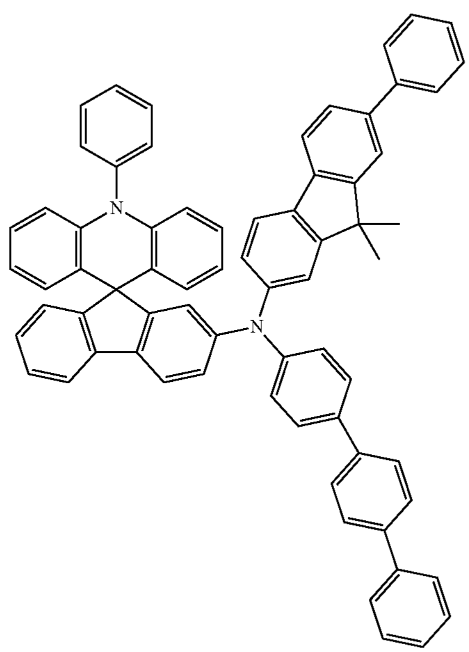

-continued
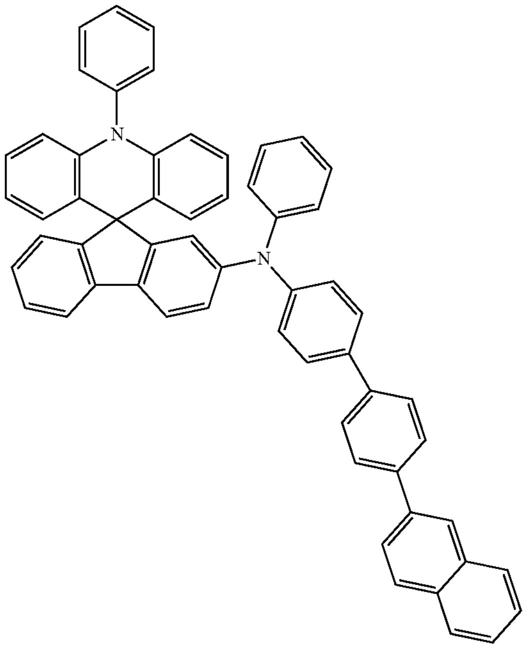
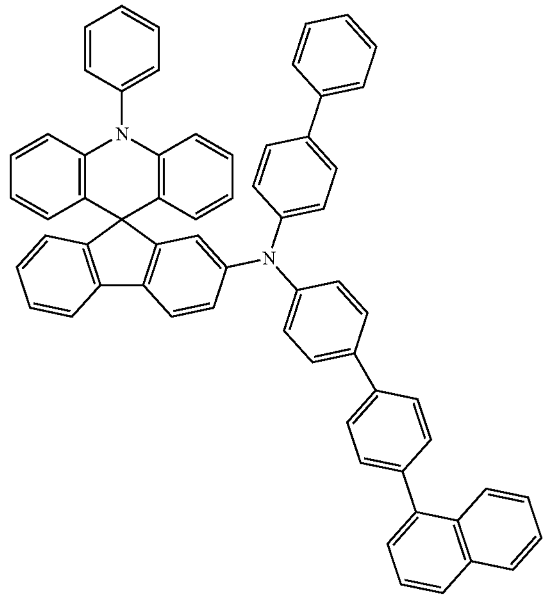
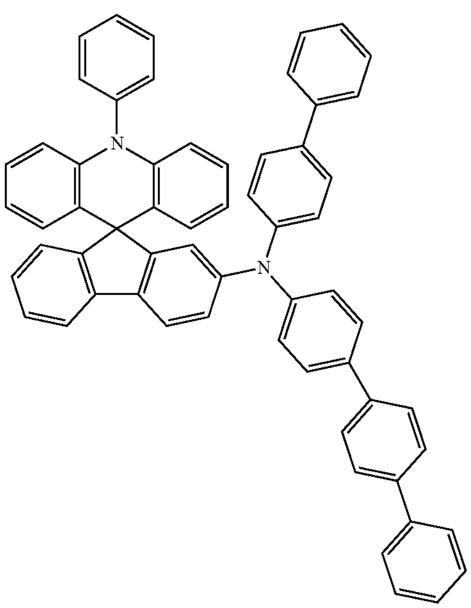
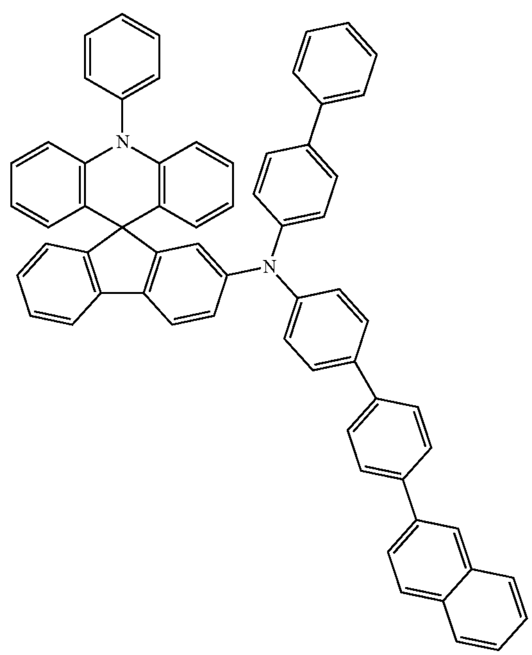
-continued

-continued
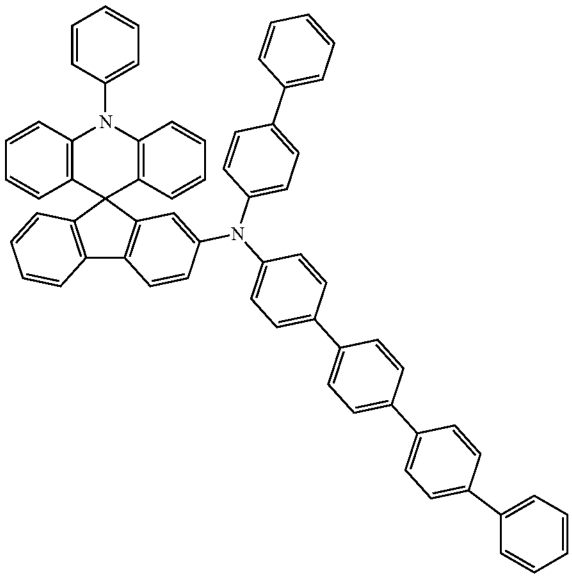
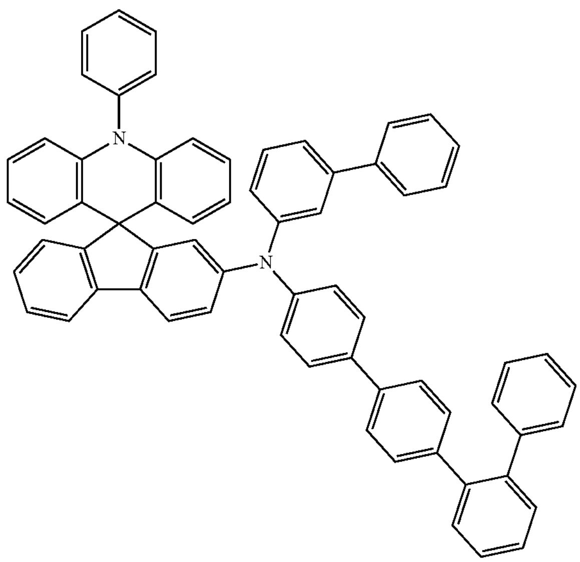
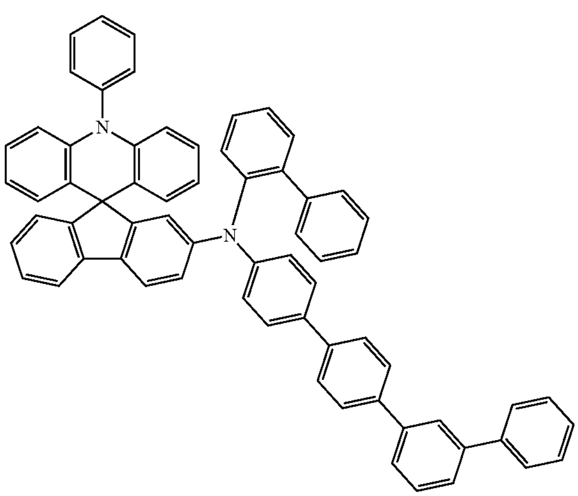
-continued
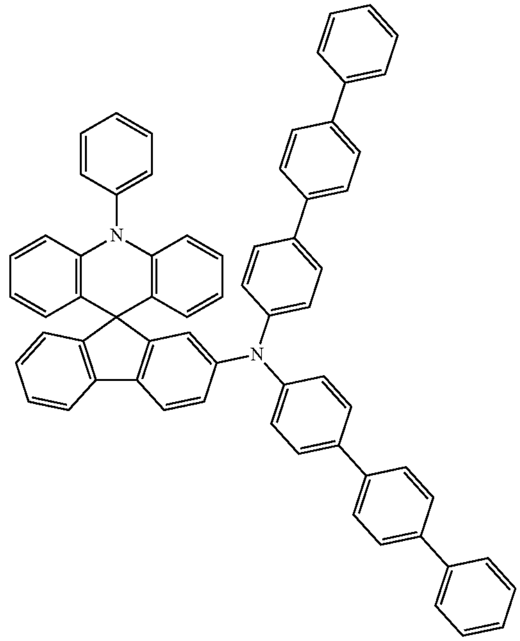
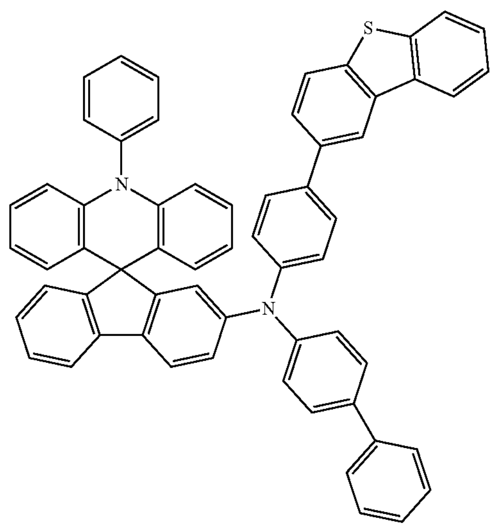
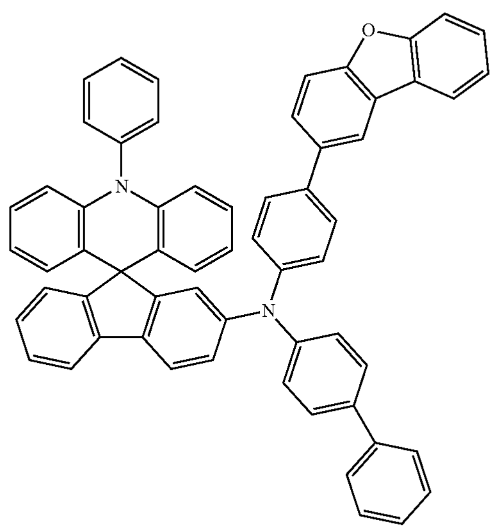

-continued
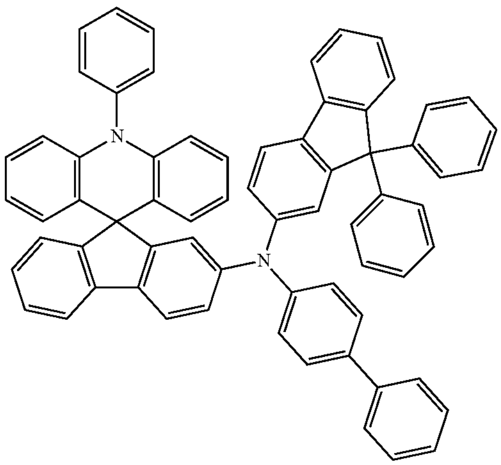
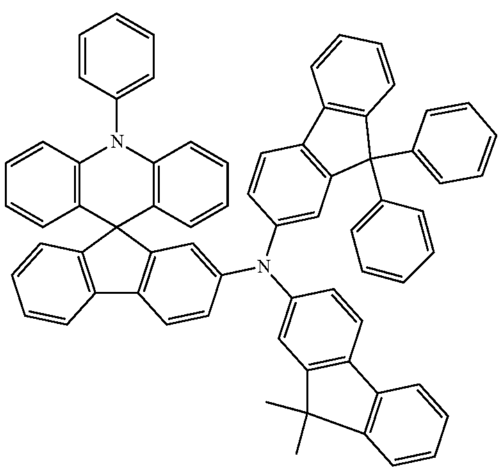
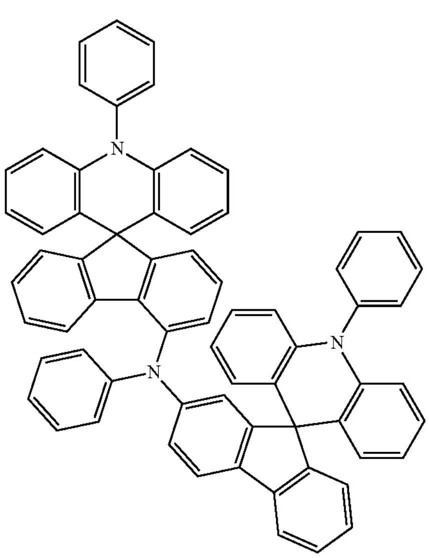
-continued
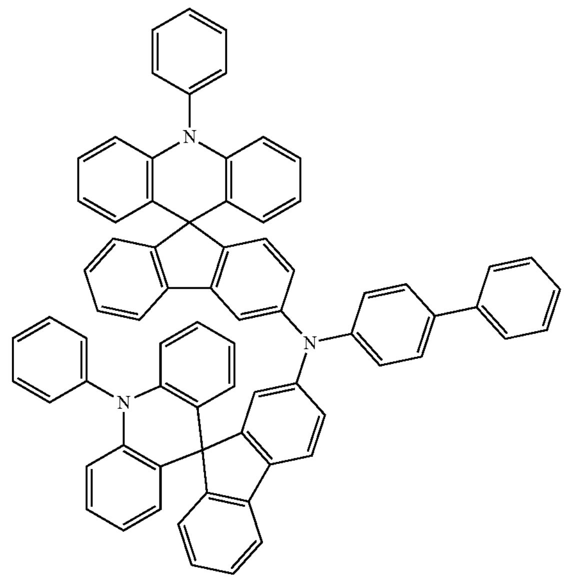
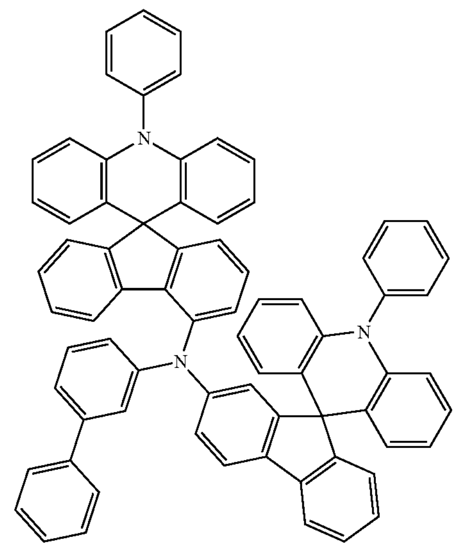
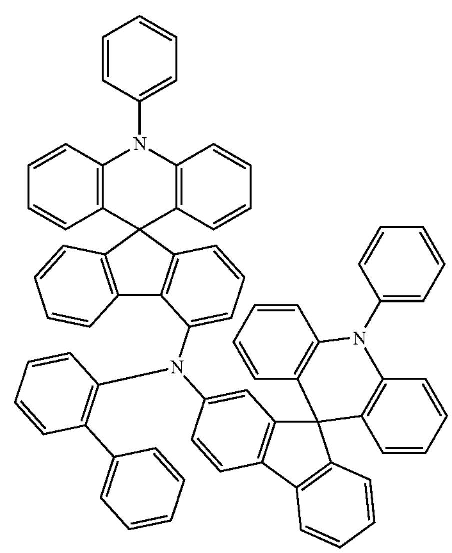

-continued
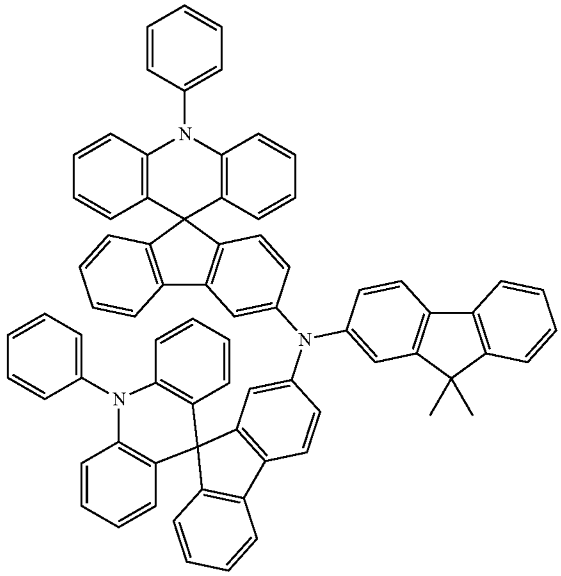
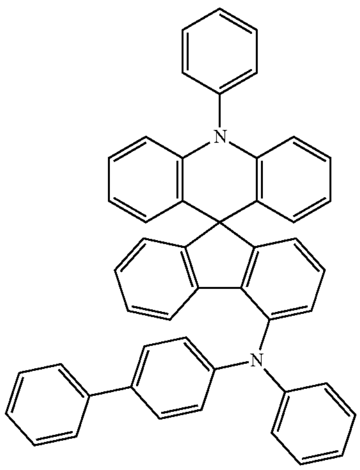
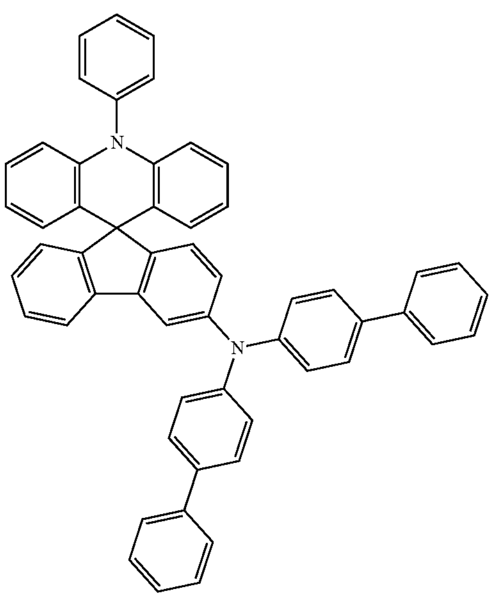
-continued
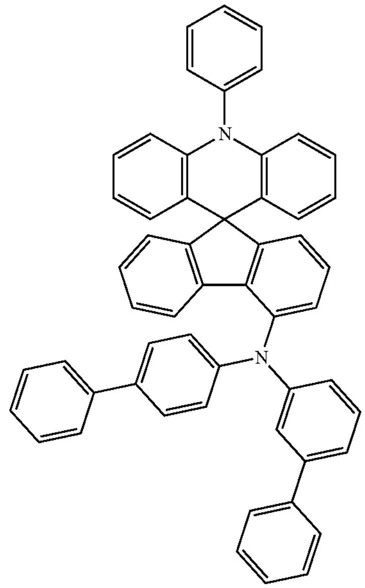
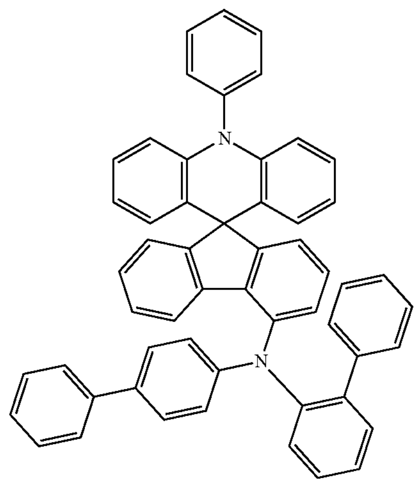
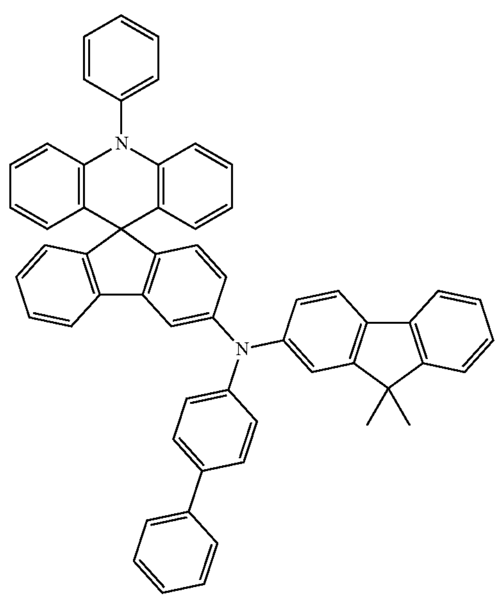

-continued
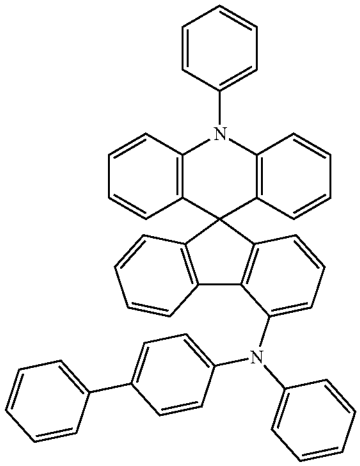
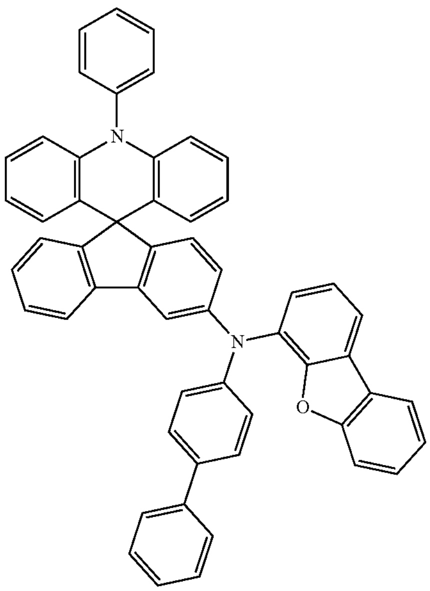
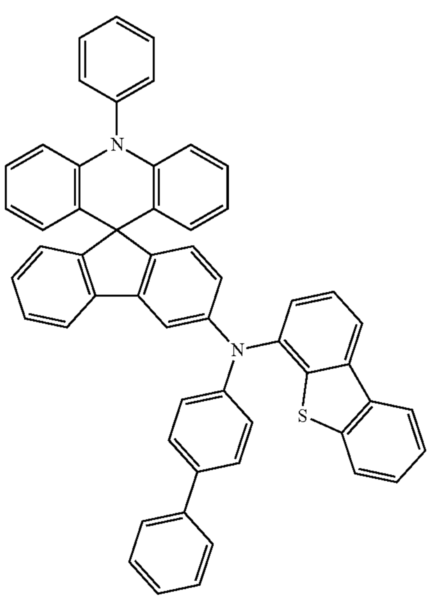
-continued
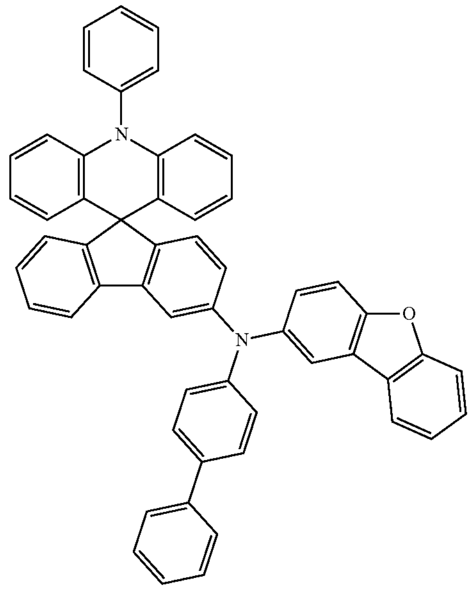
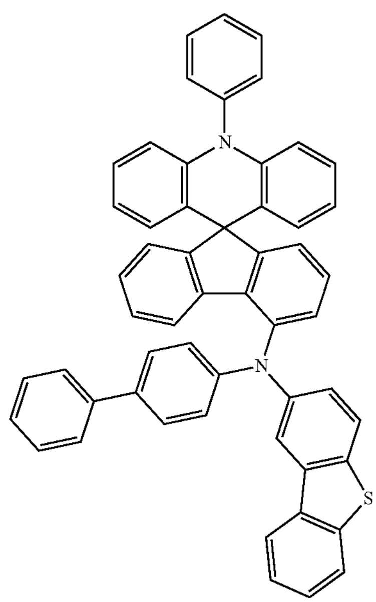

-continued
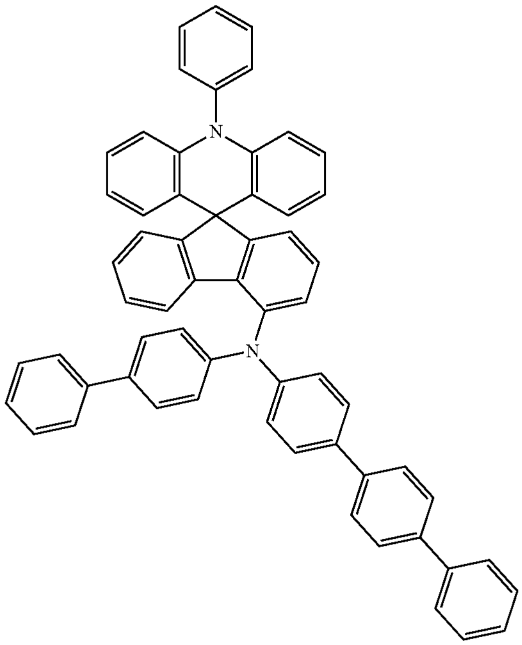
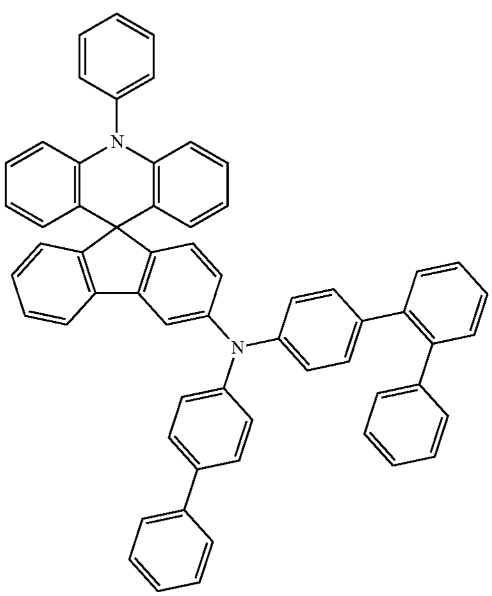
-continued
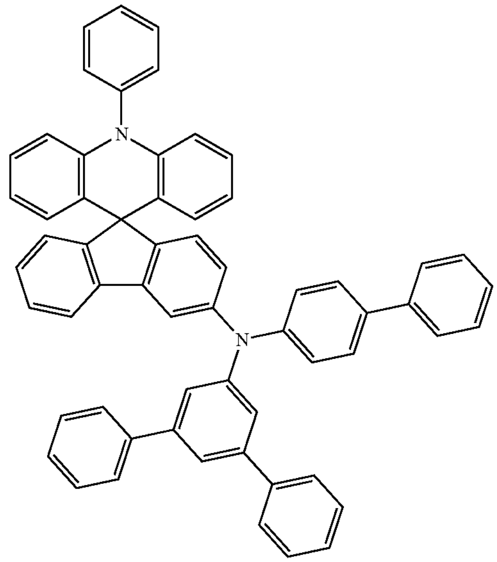
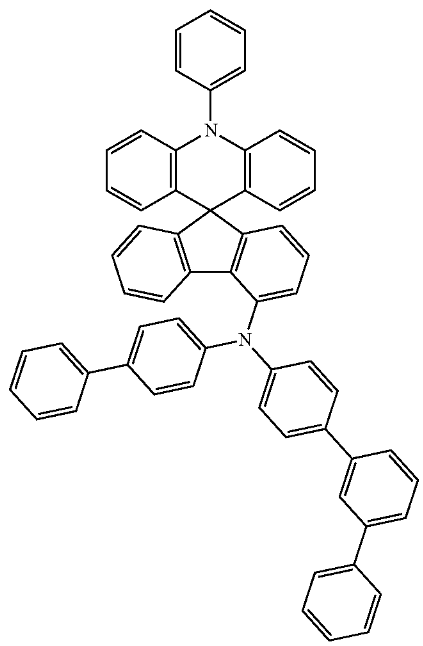
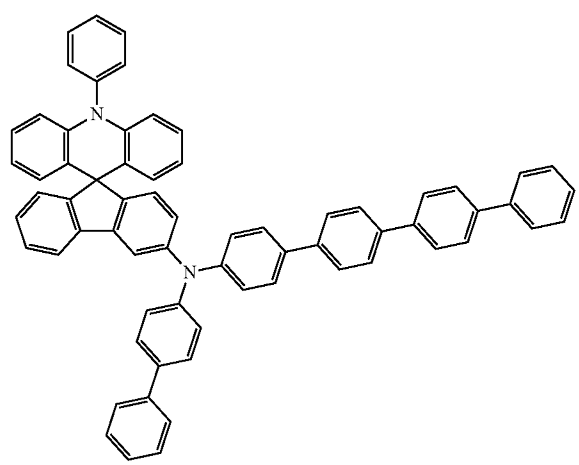

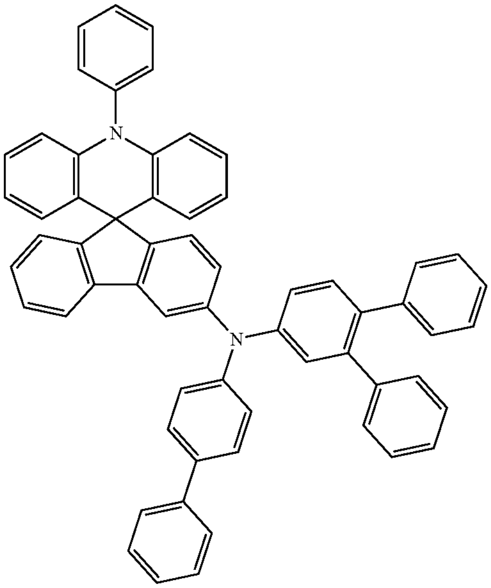
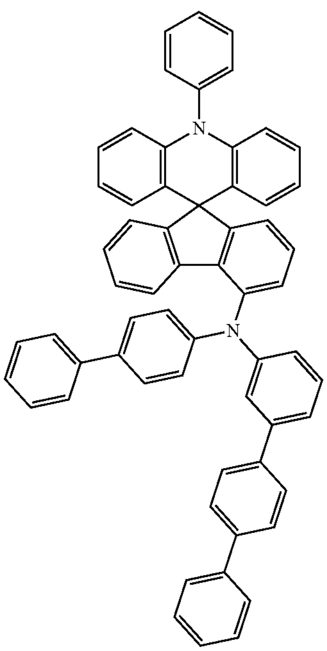
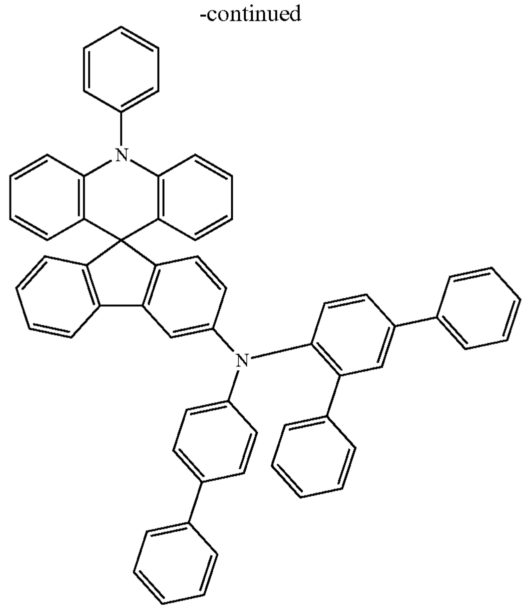
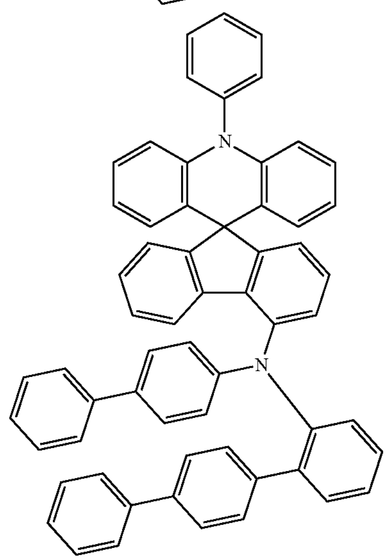
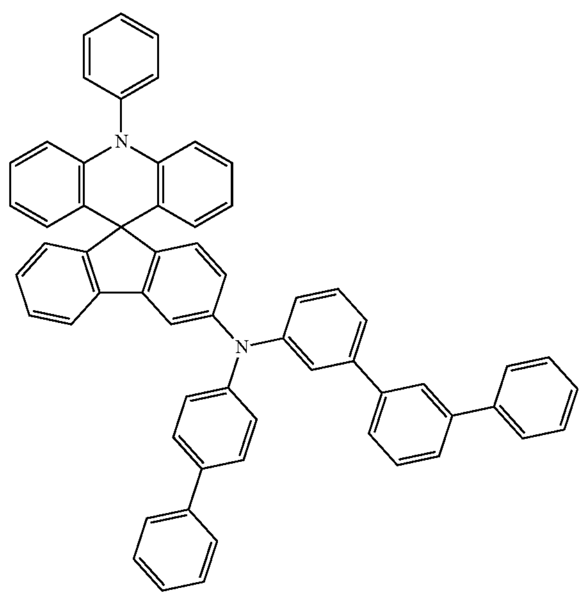

-continued
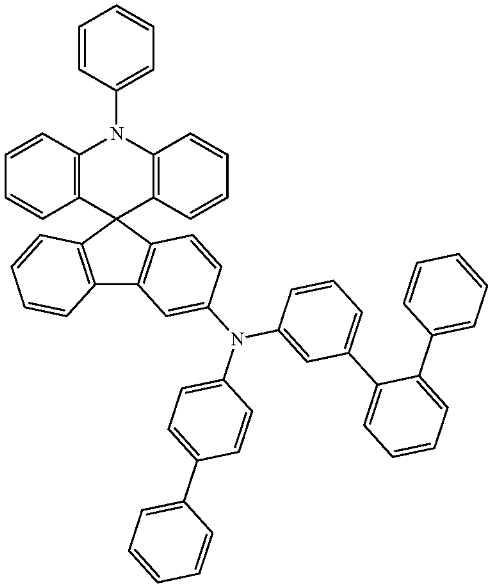
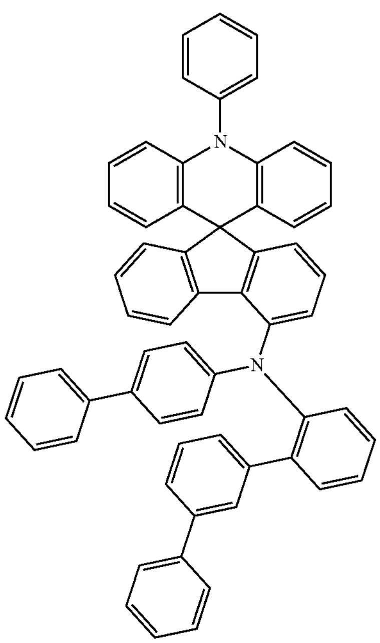
-continued
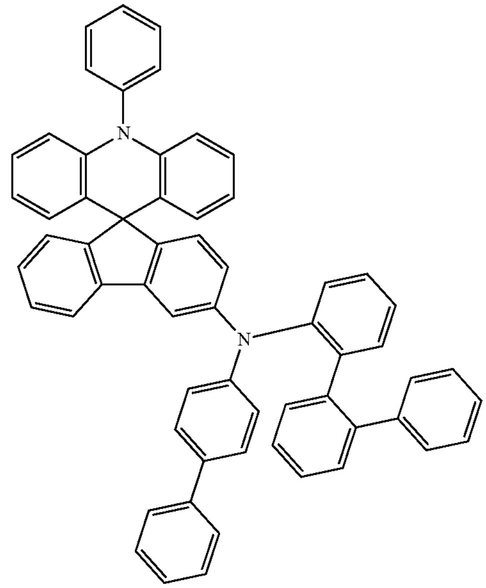
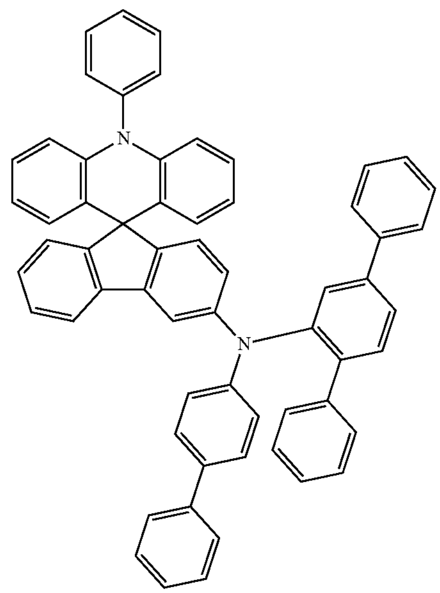
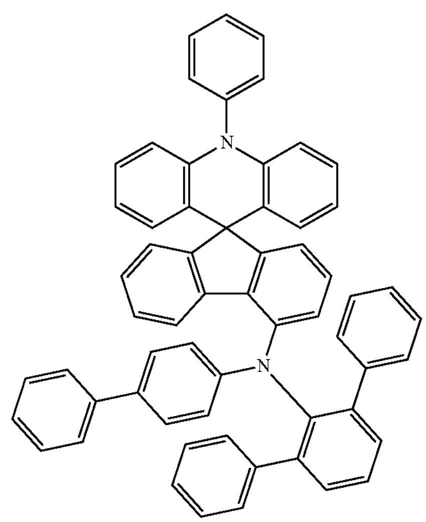

-continued
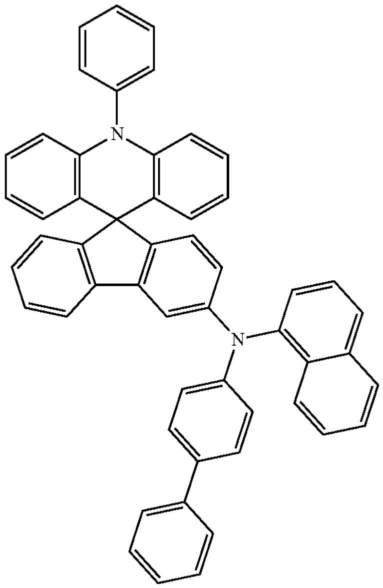
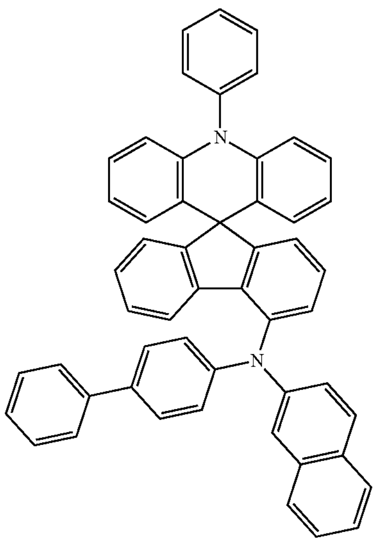
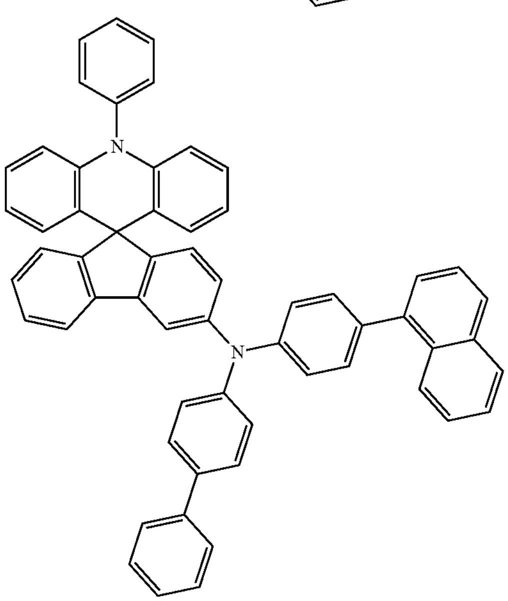
-continued
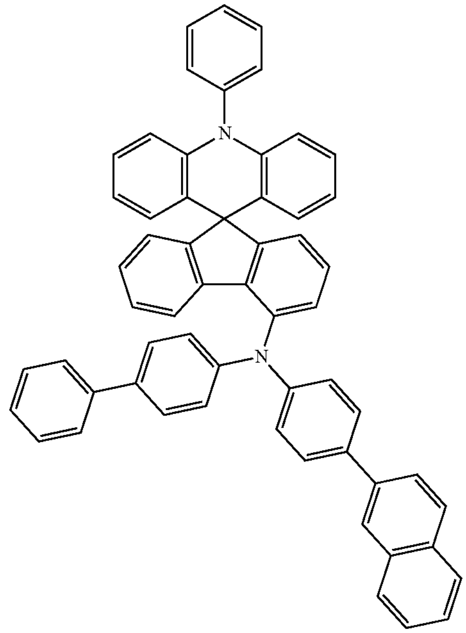
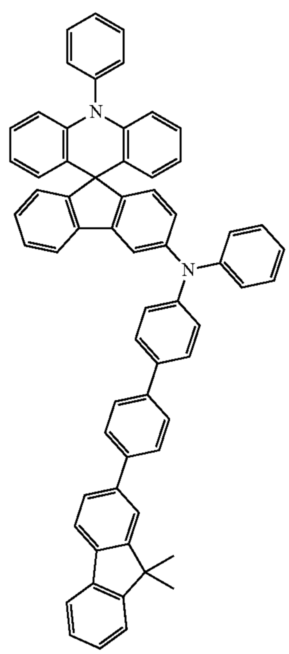

-continued
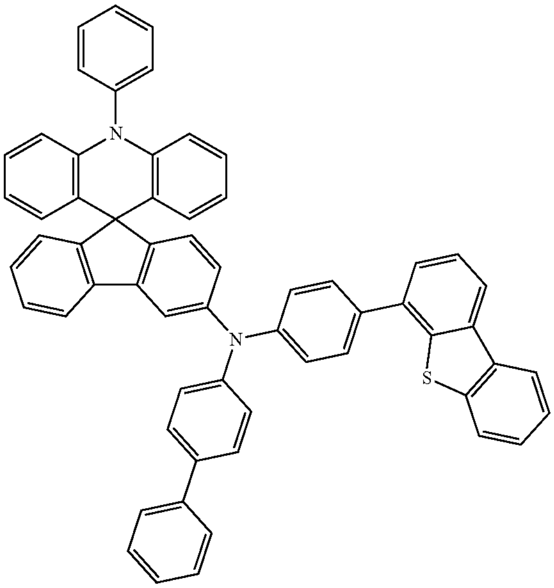
-continued
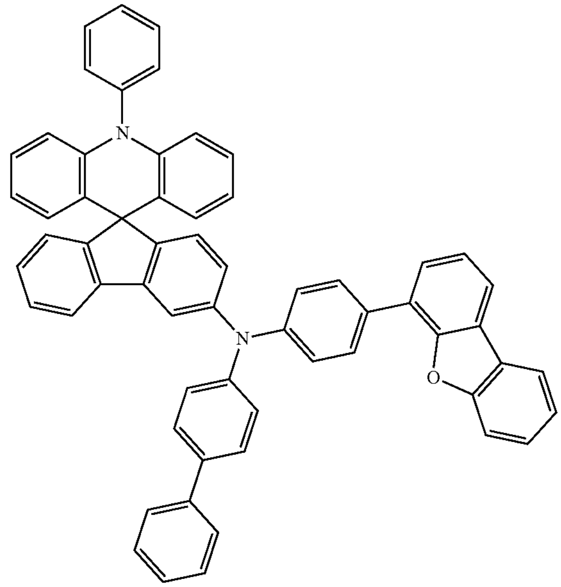
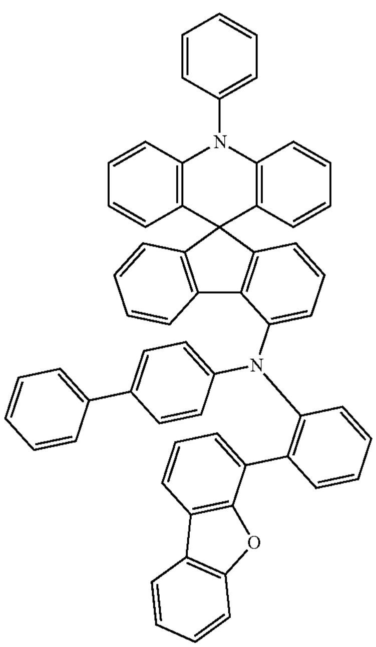
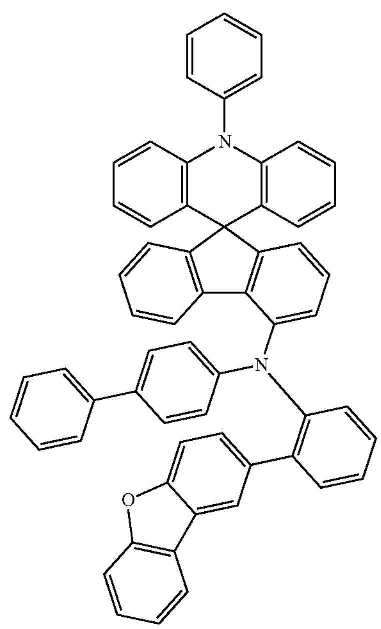

-continued
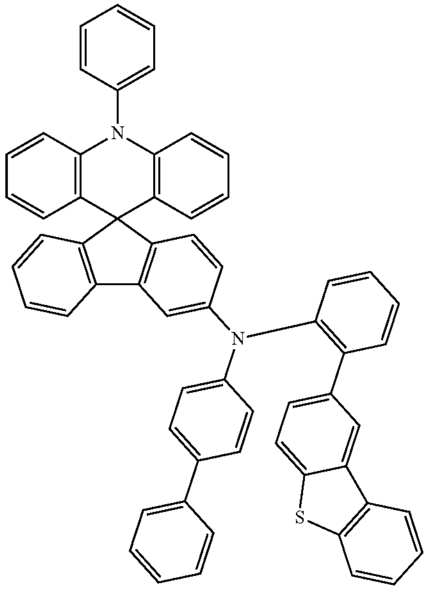
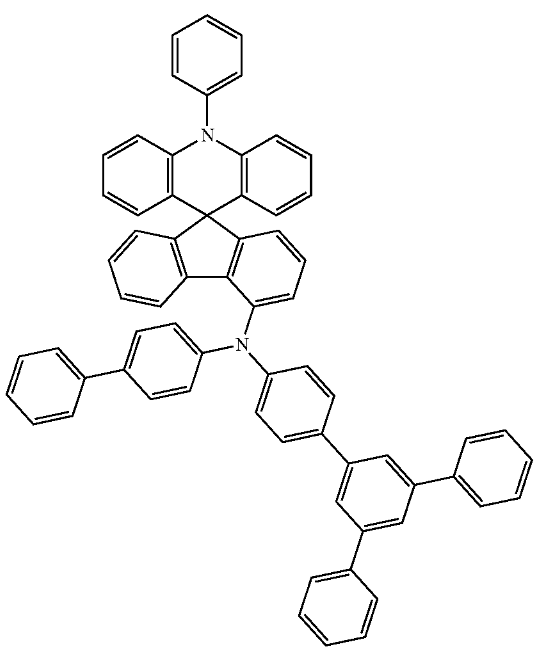
-continued
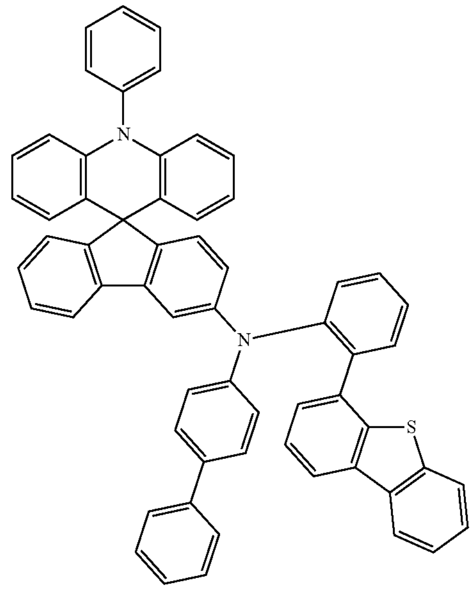
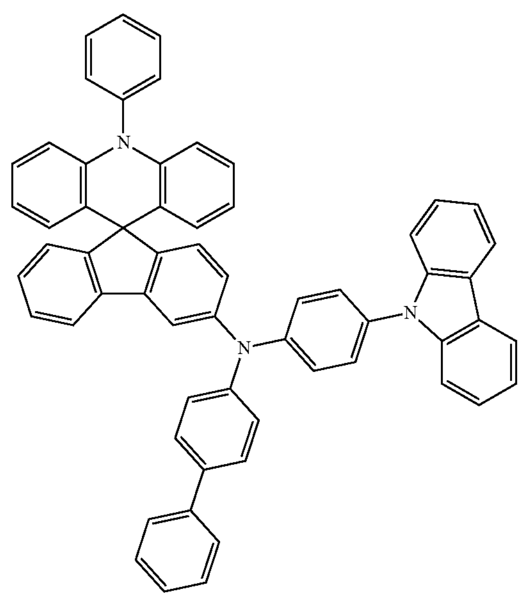

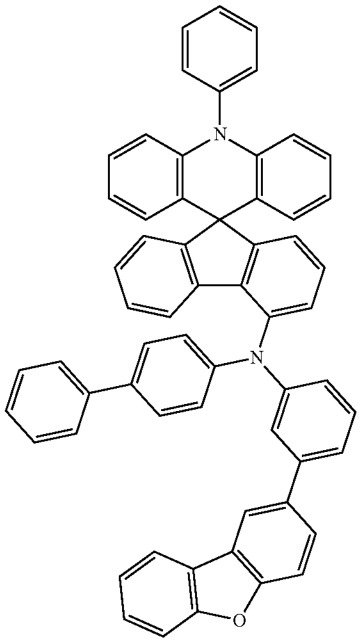
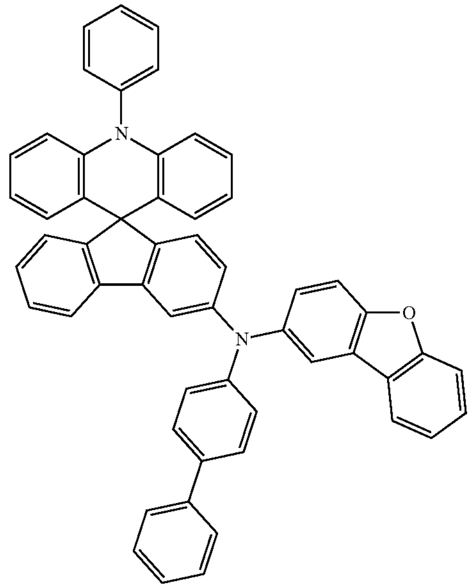
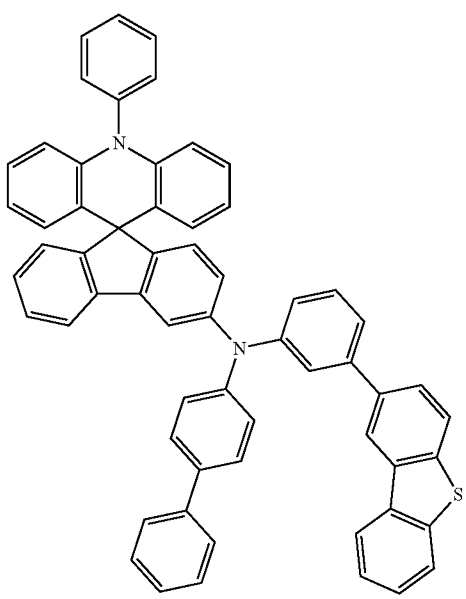
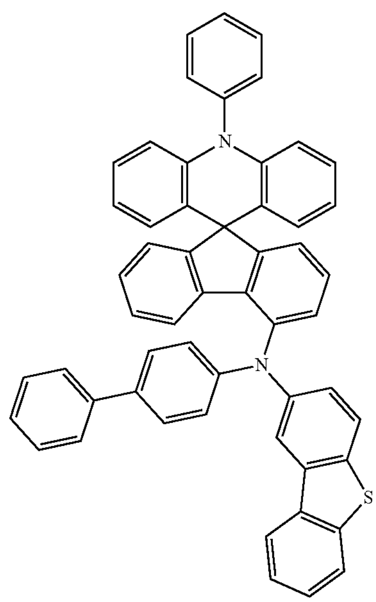

-continued
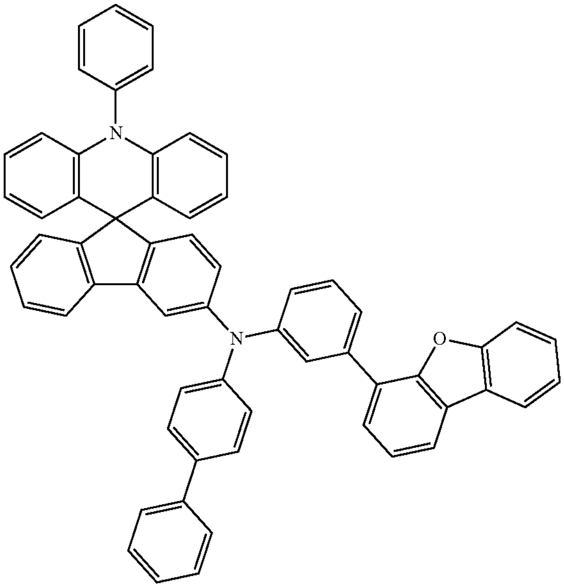
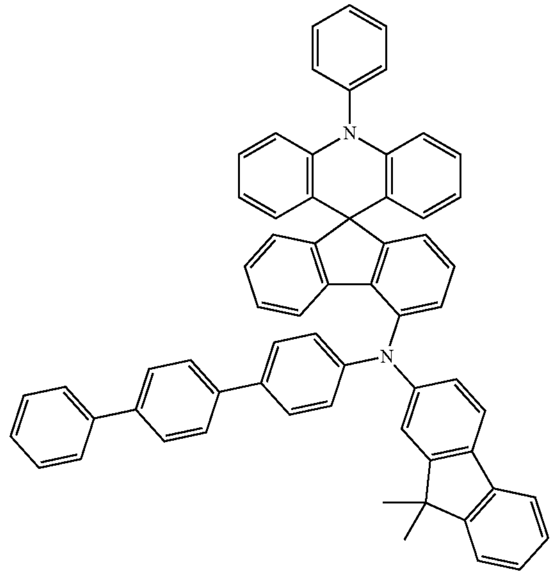
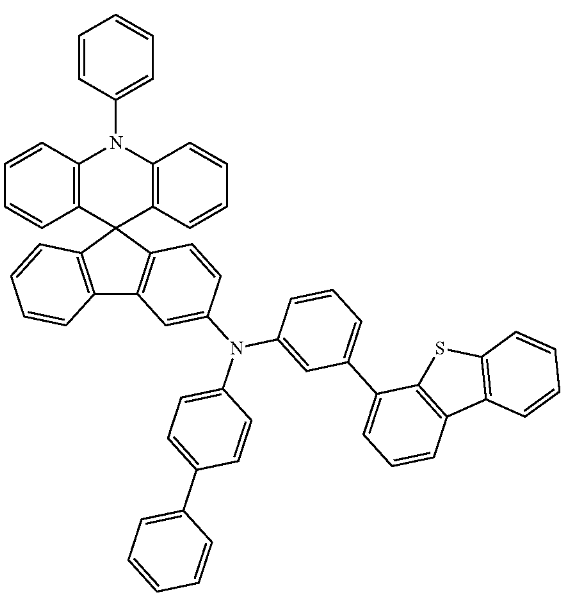
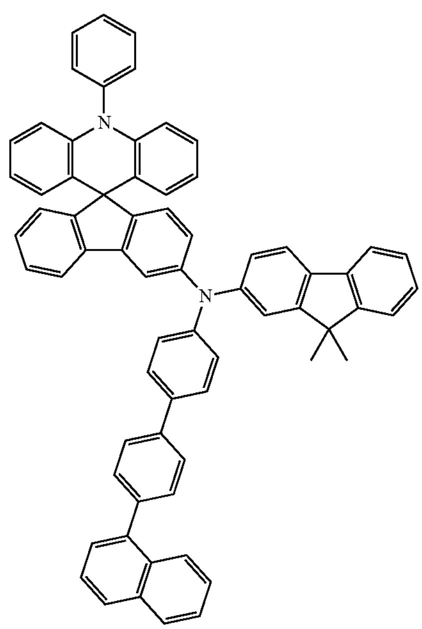
-continued

-continued
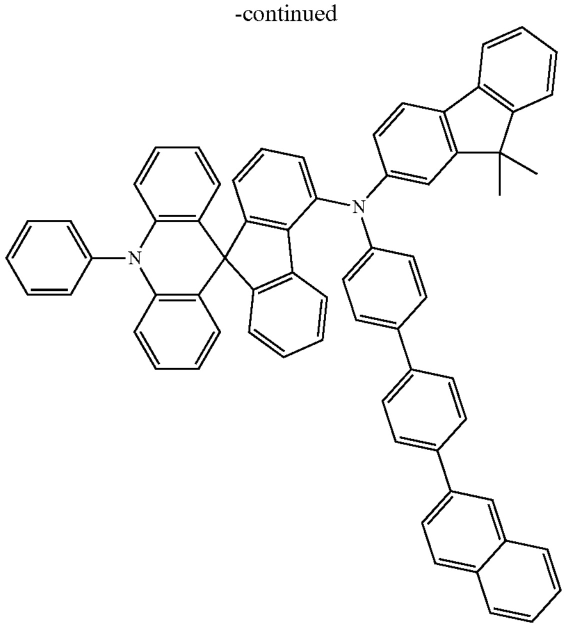
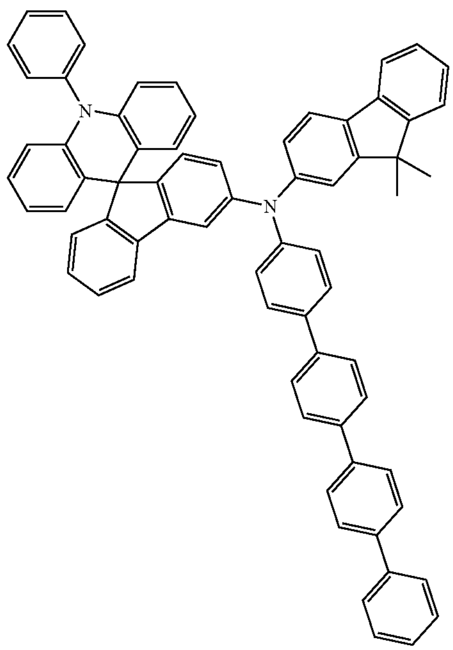
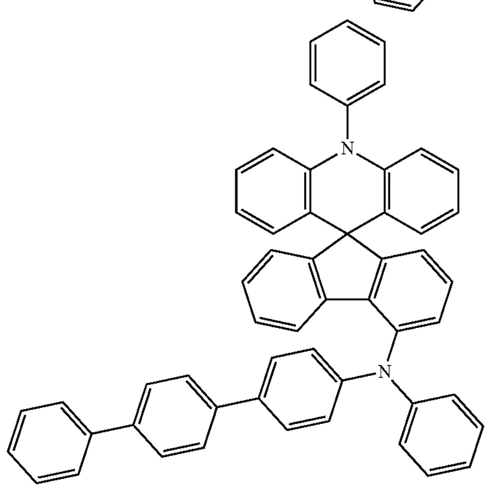
-continued
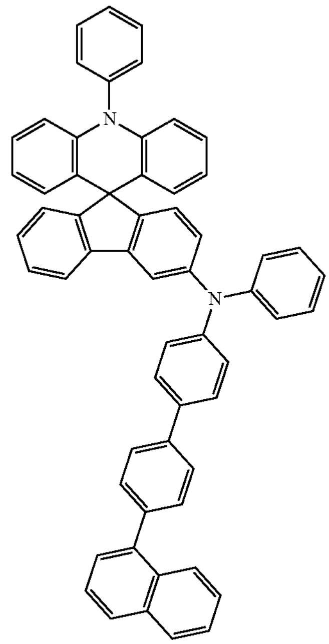
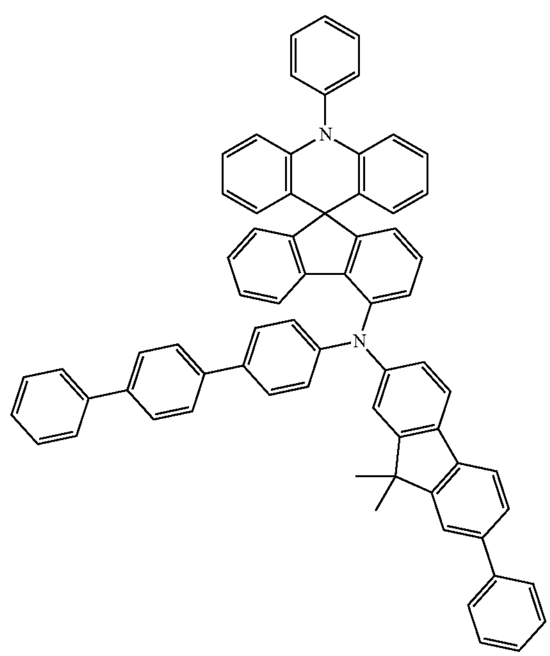

-continued
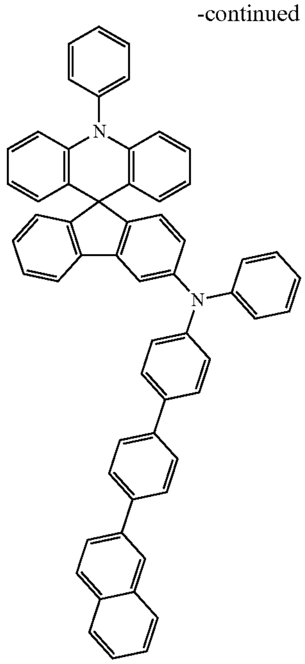
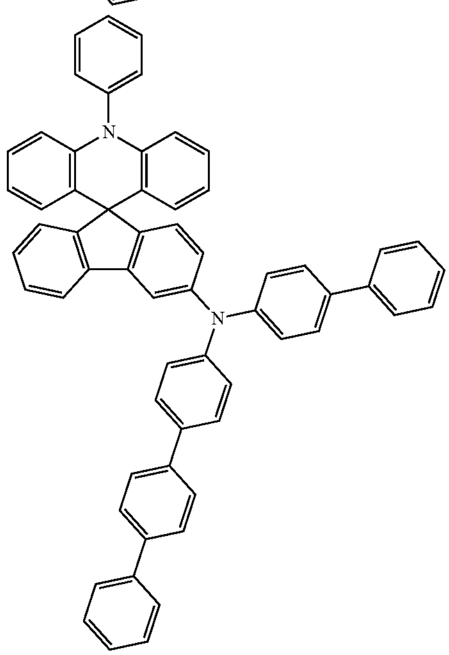
-continued
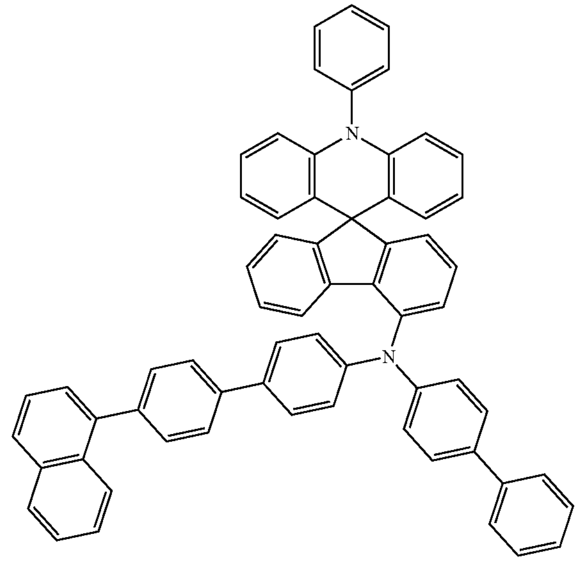
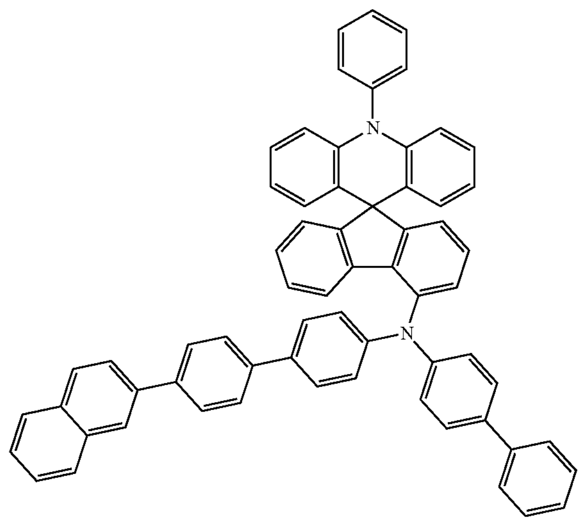

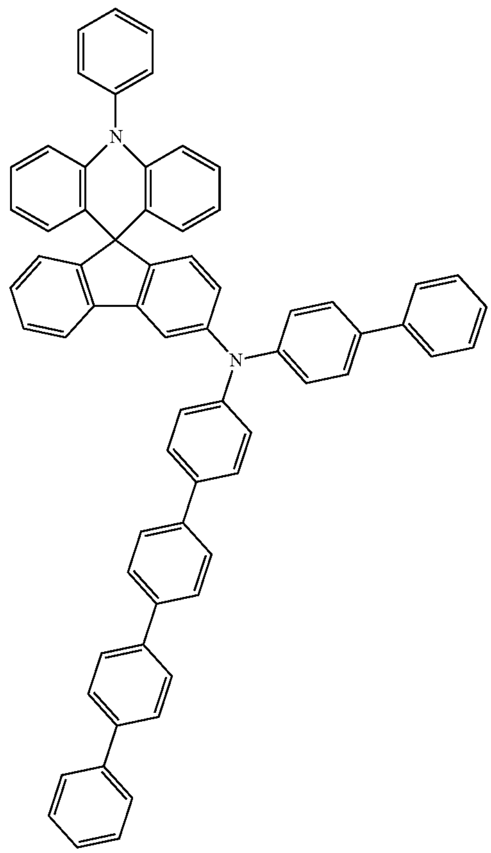
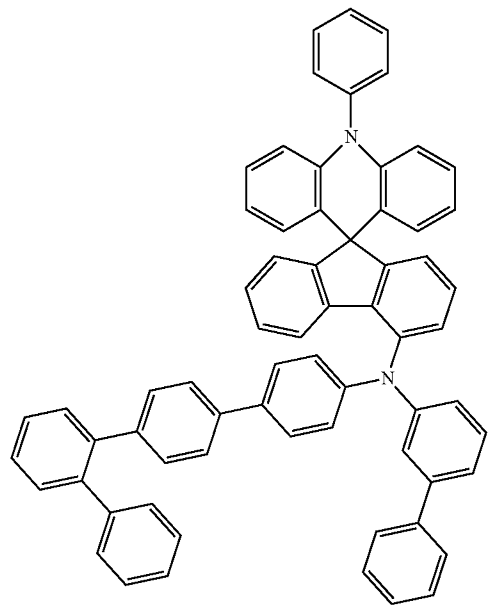
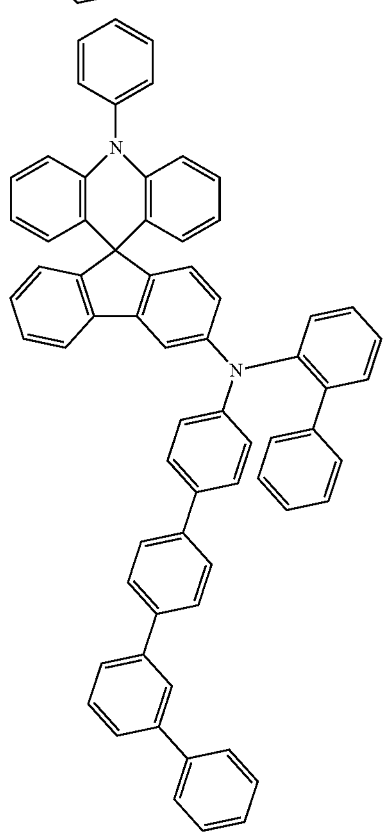
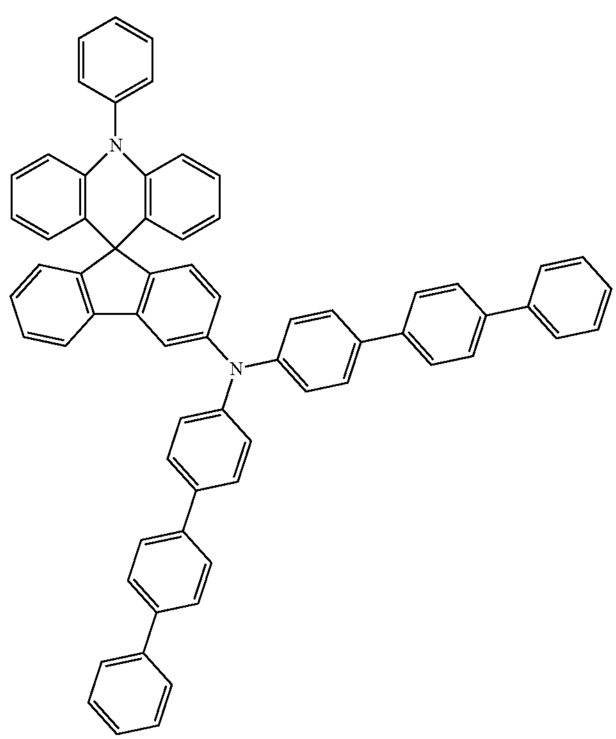

-continued
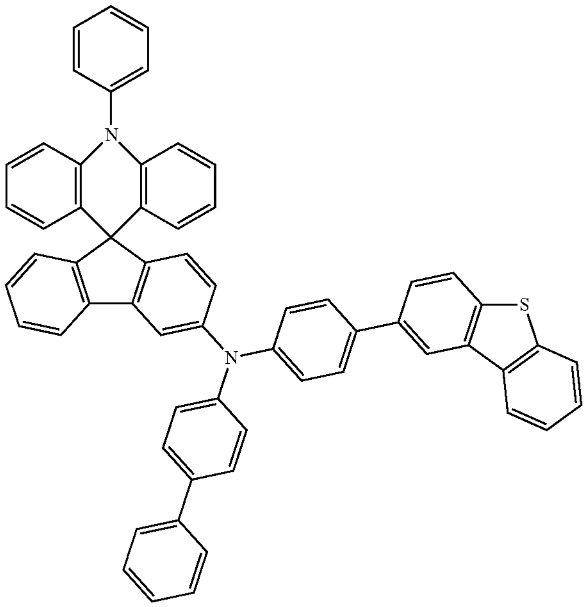
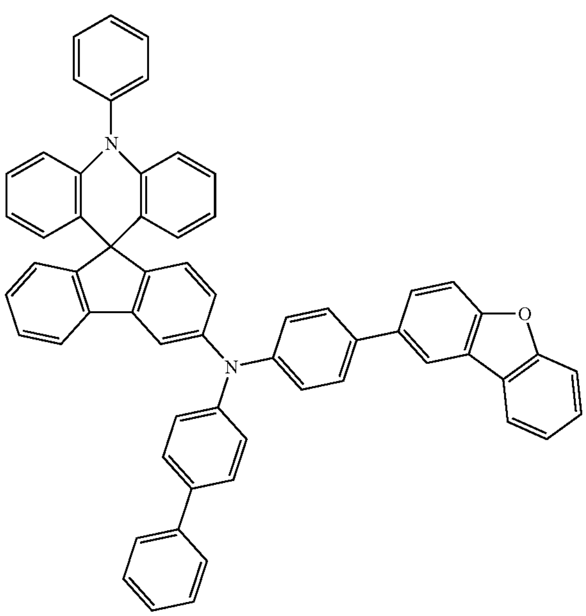

-continued
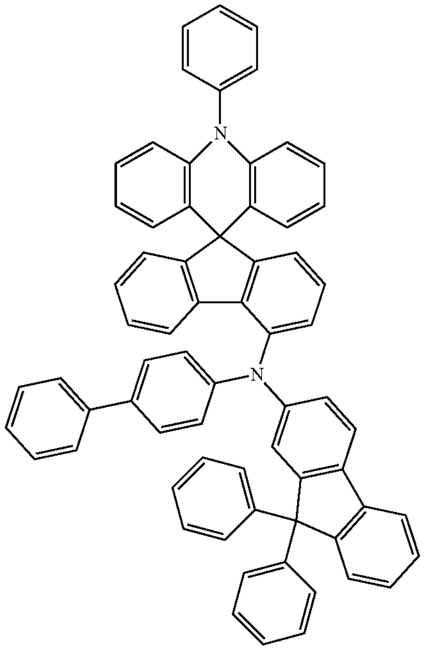
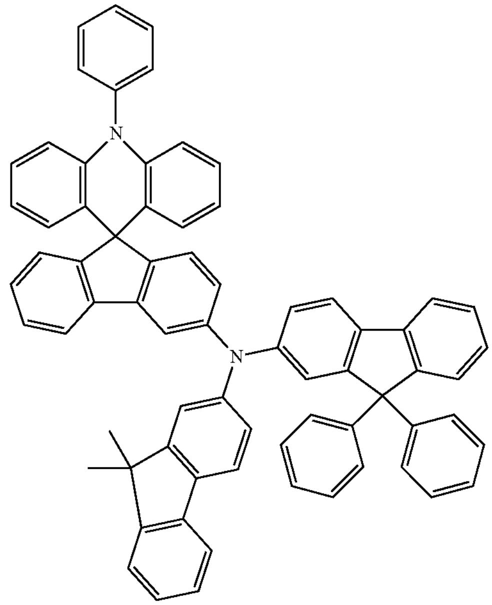
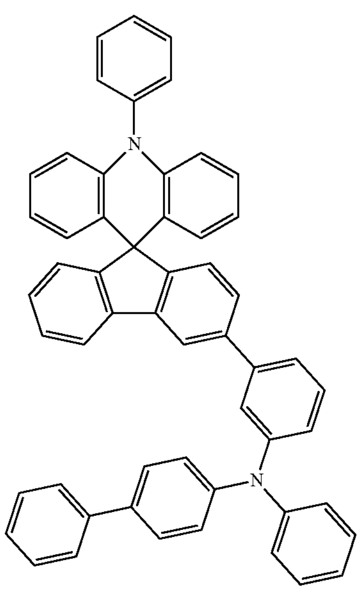
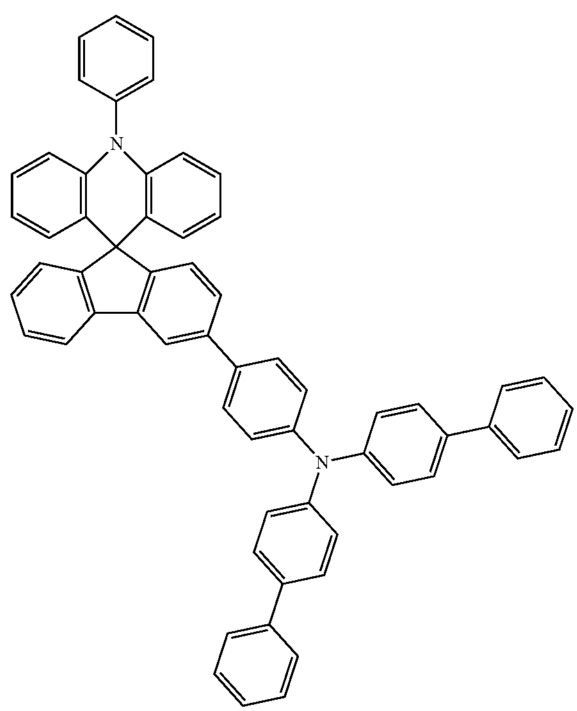

-continued
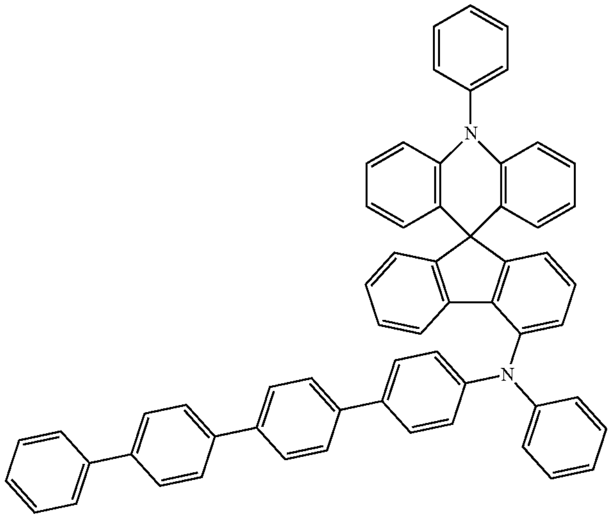
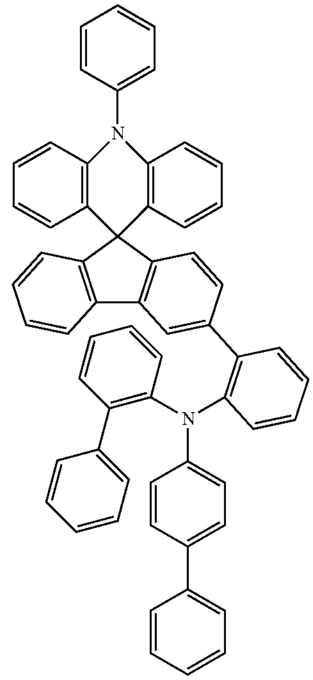
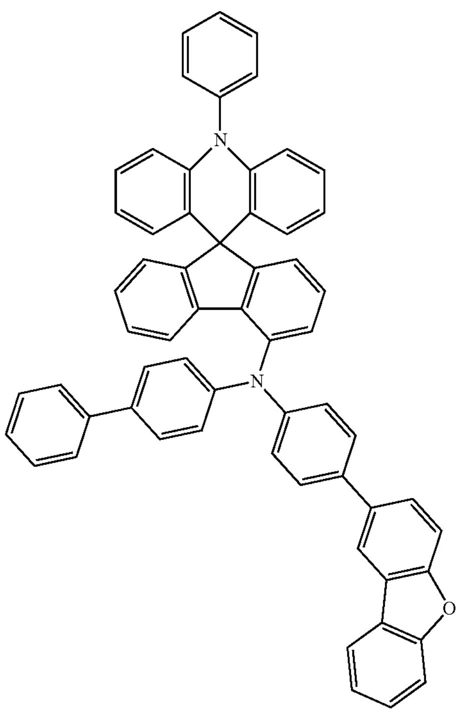
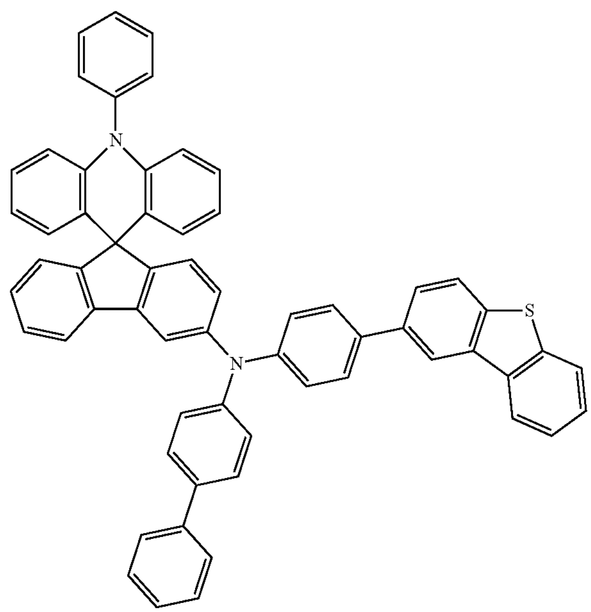

-continued
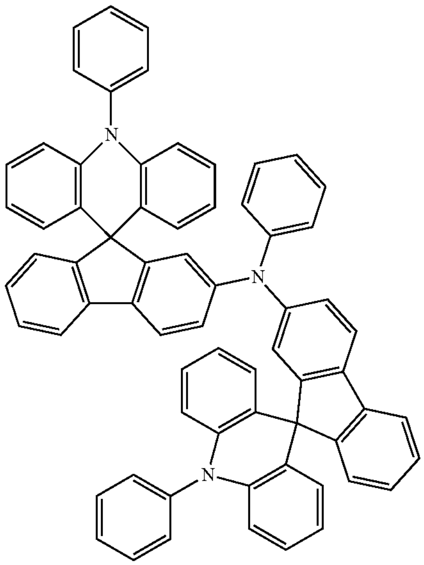
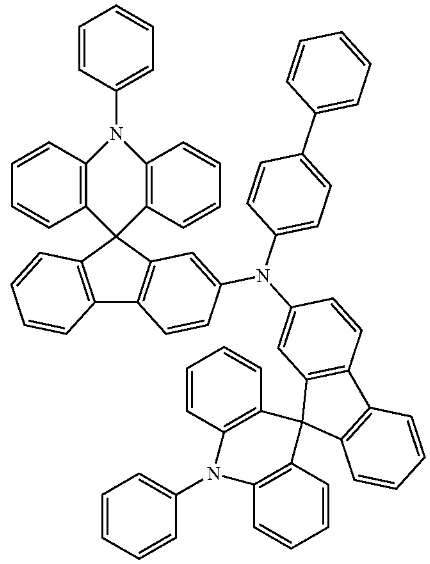
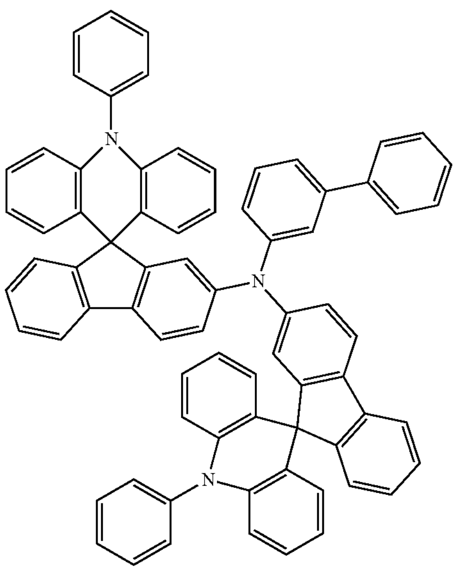
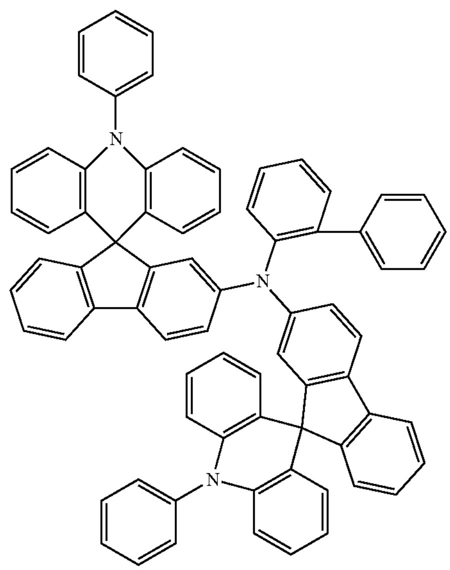
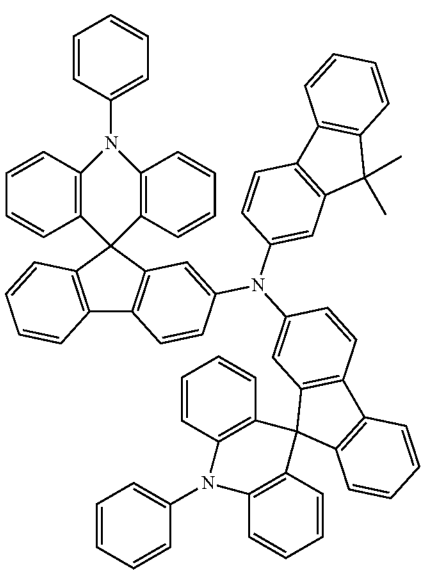
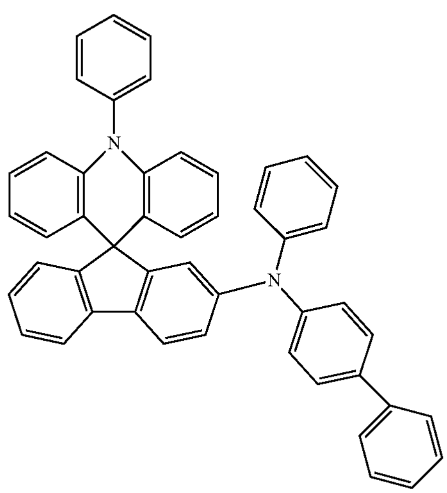

-continued
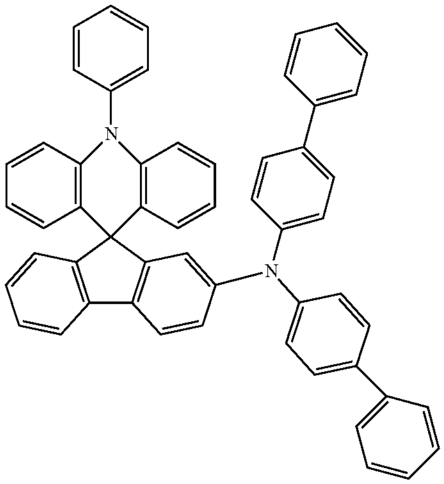
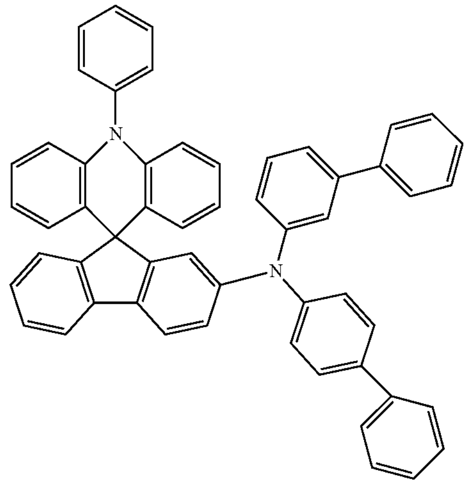
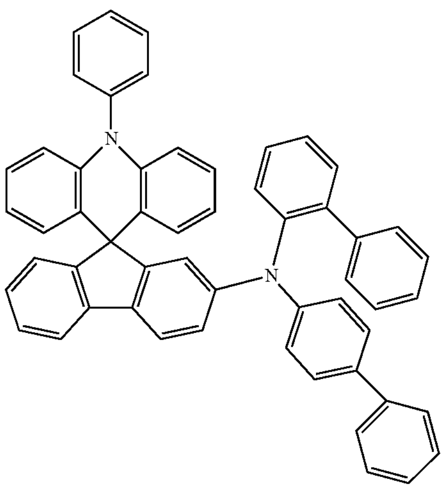
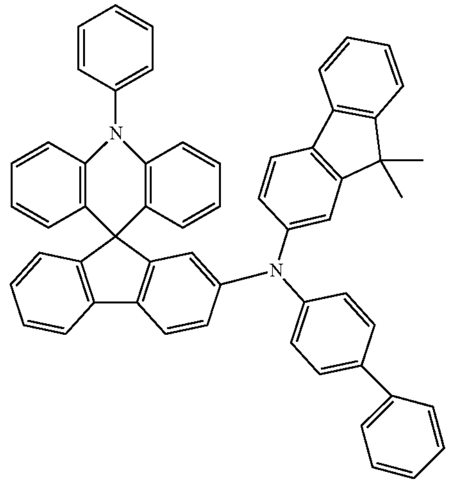
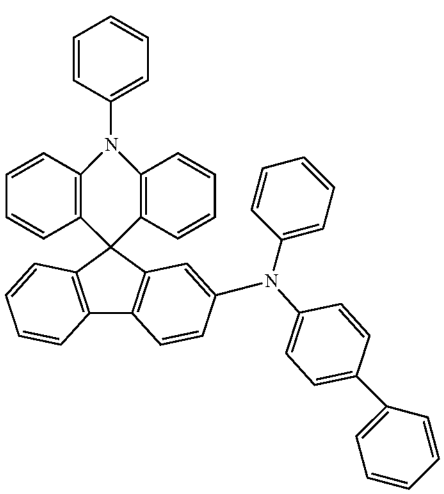
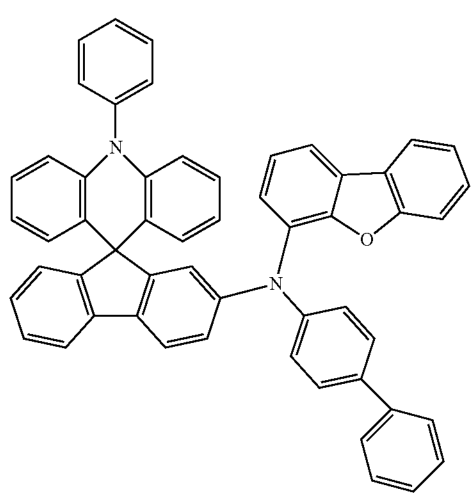

-continued
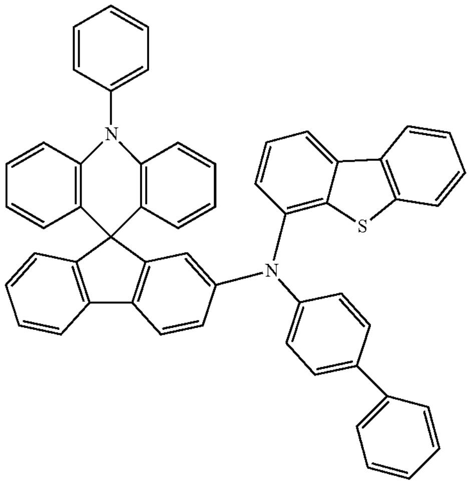
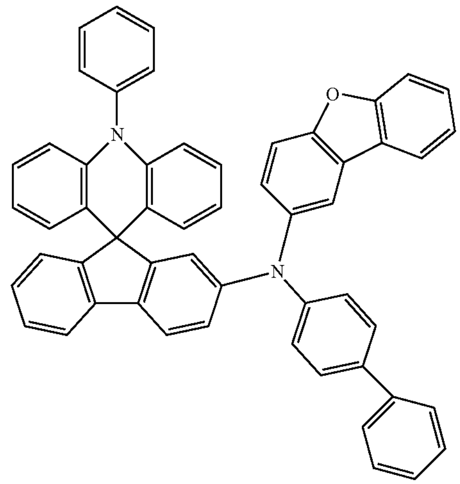
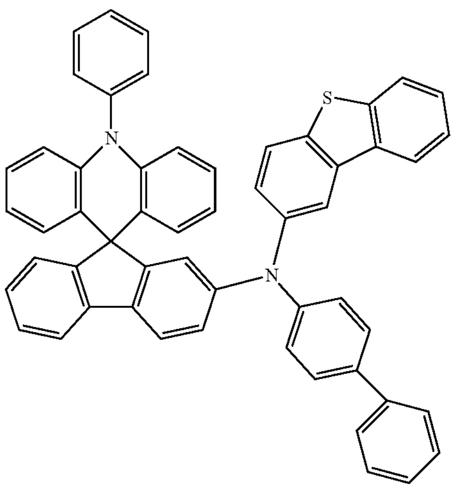
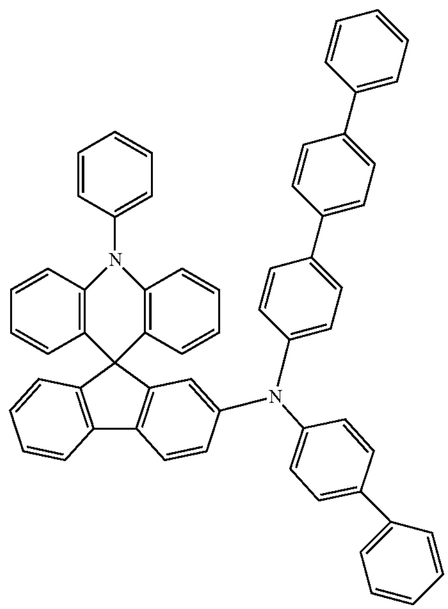
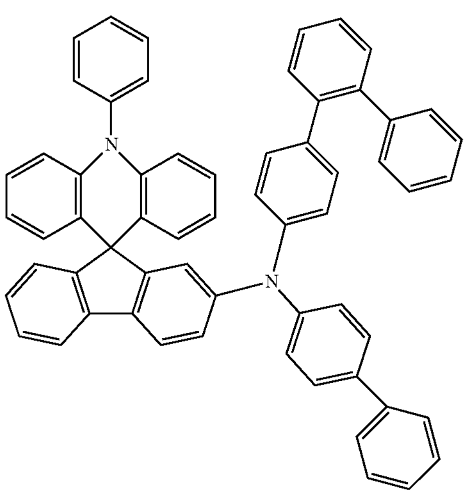
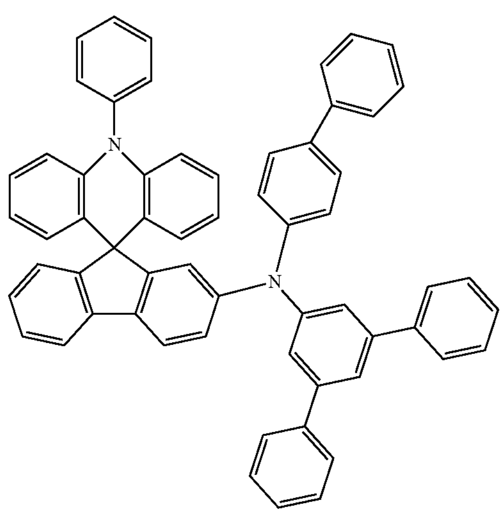

-continued
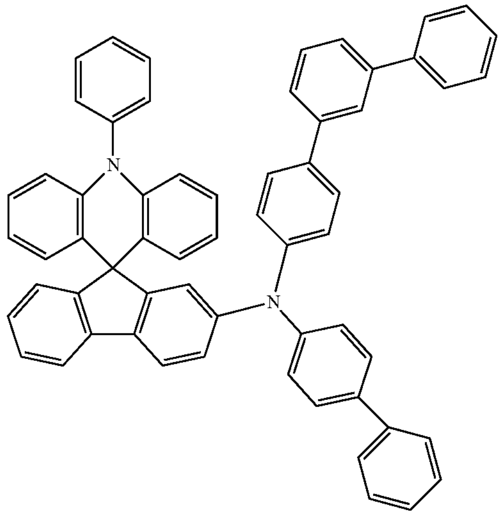
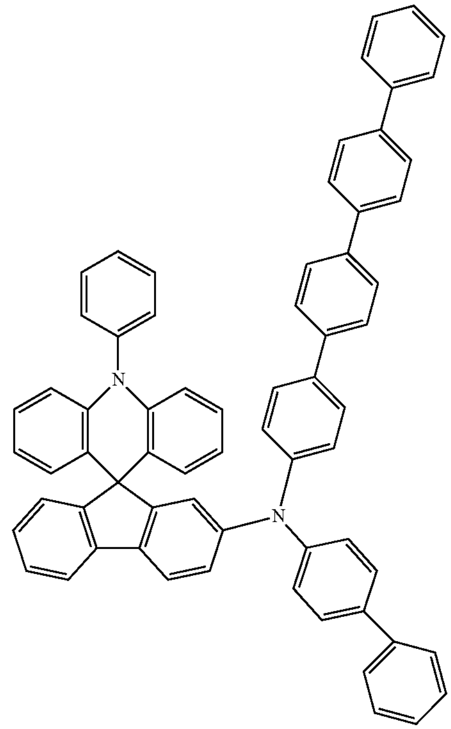
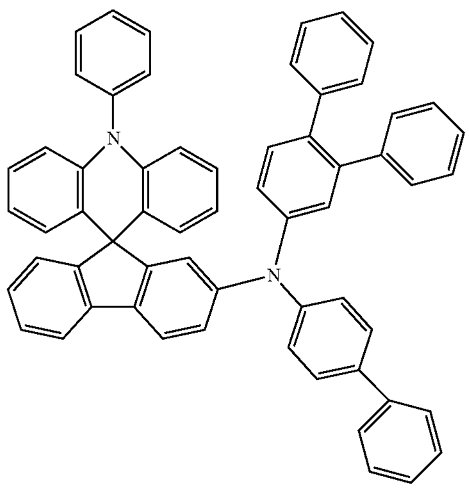
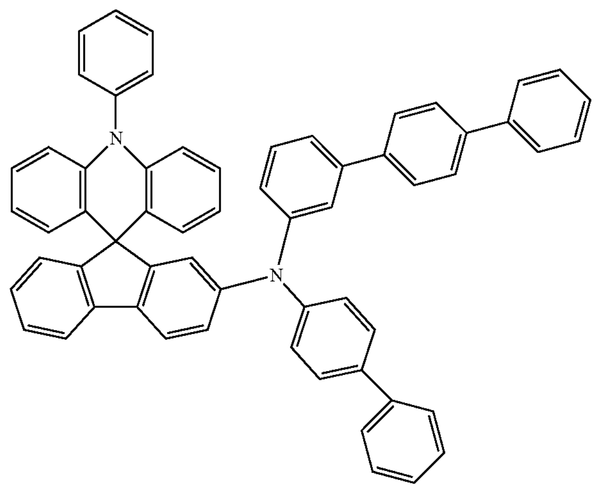
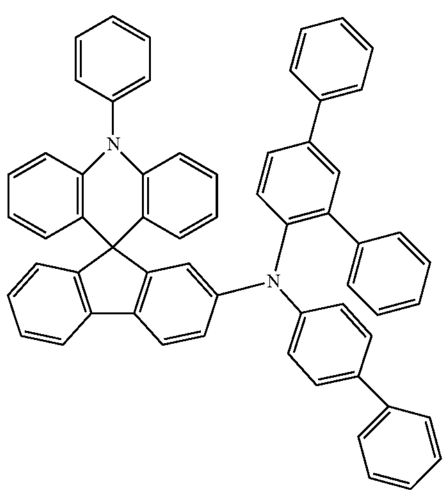
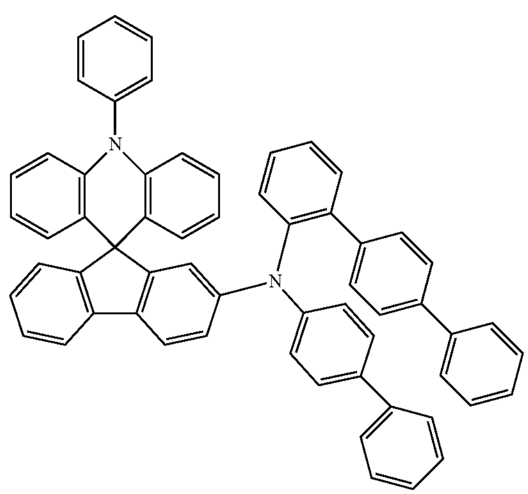

-continued
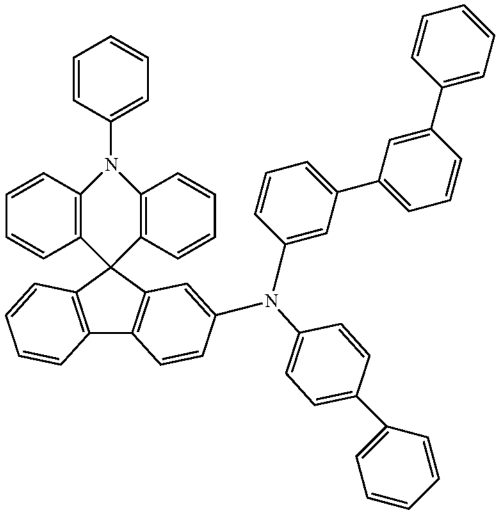
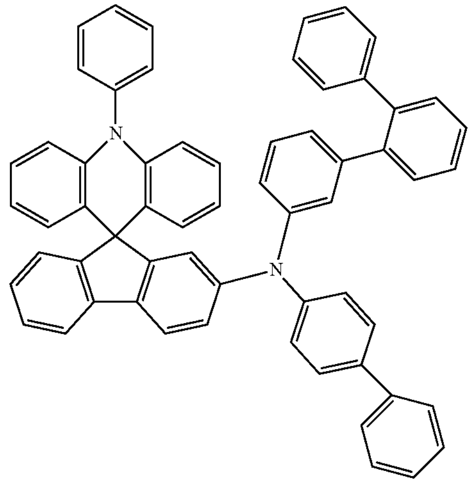
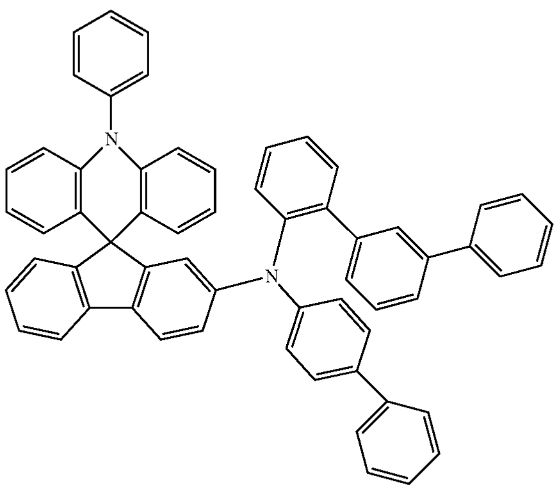
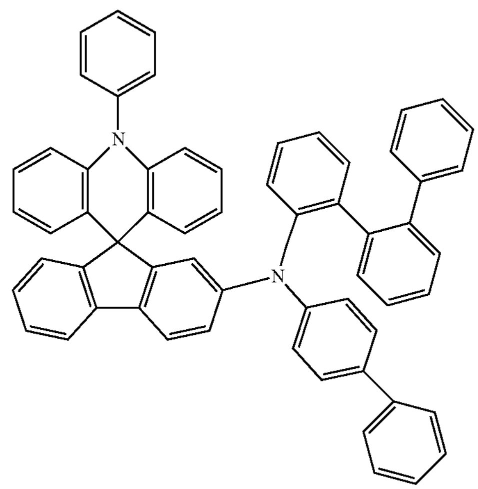
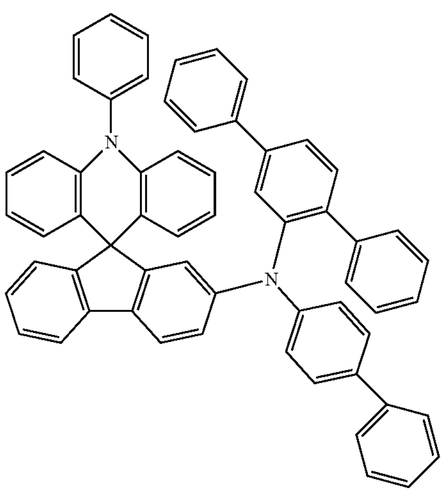
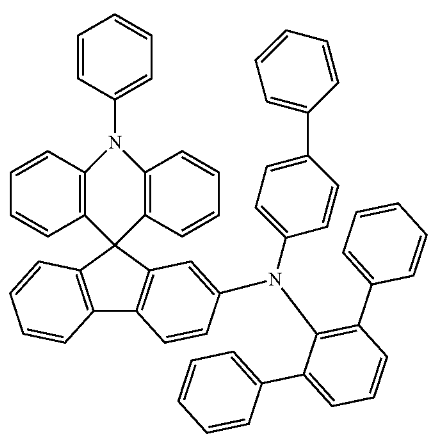

-continued
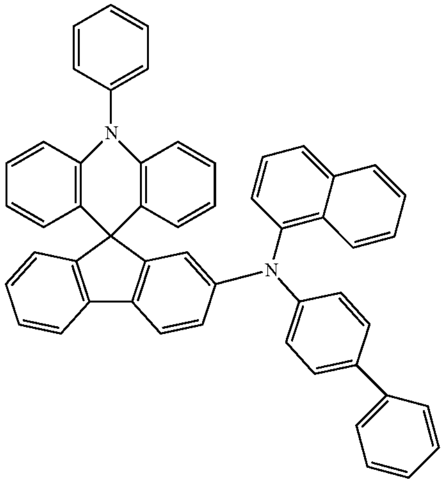
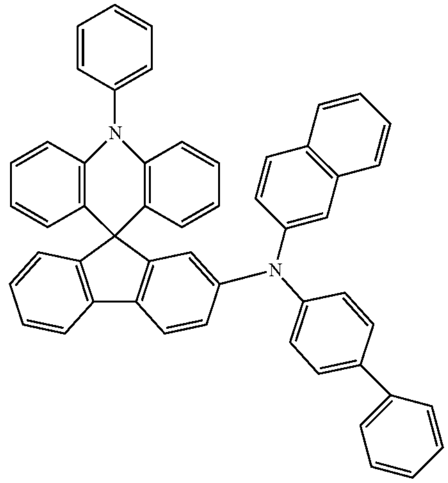
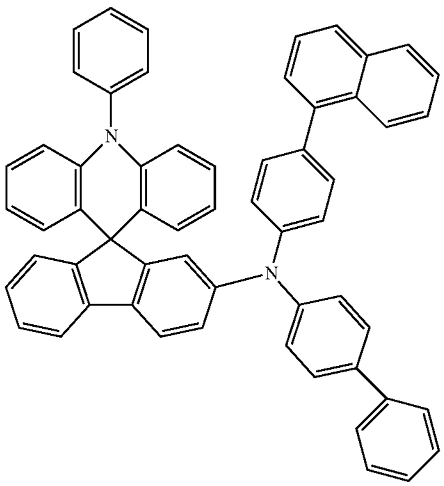
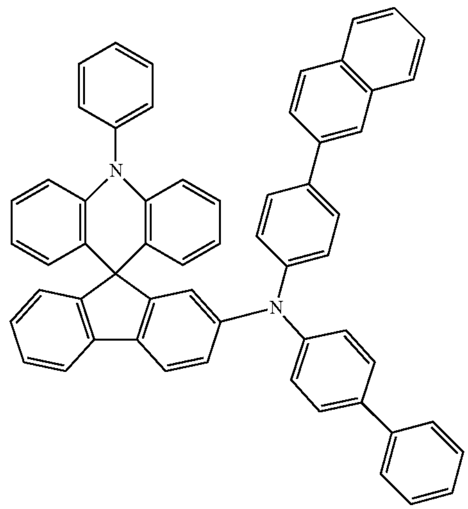
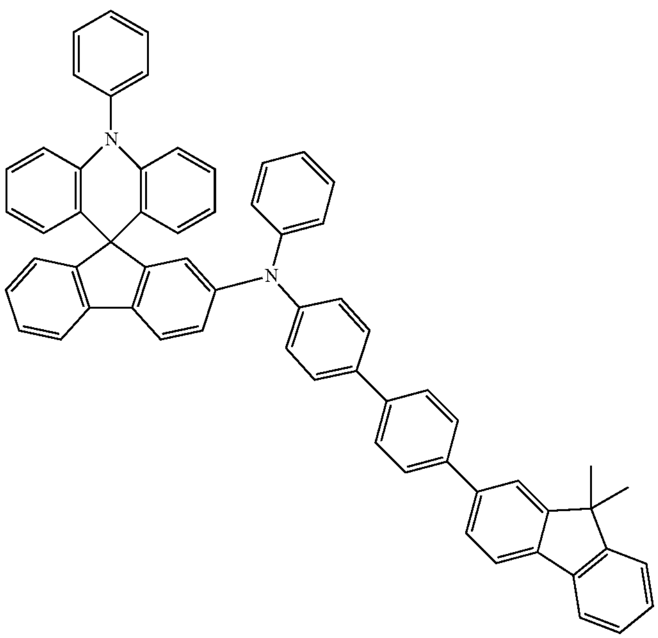

-continued
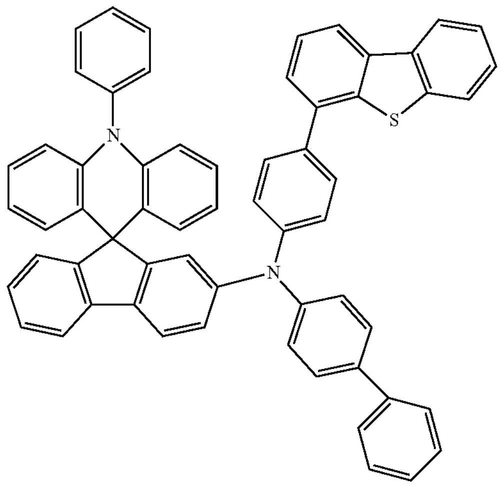
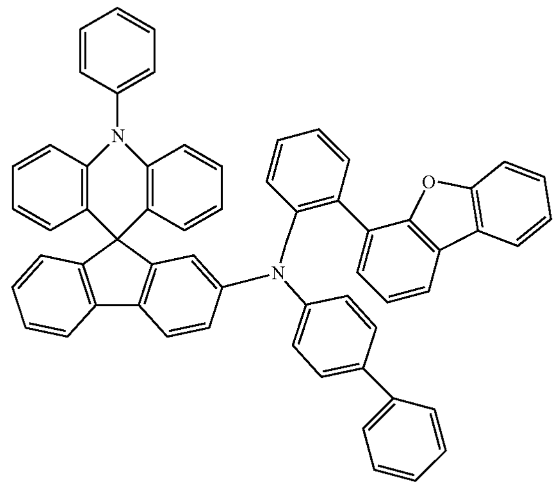
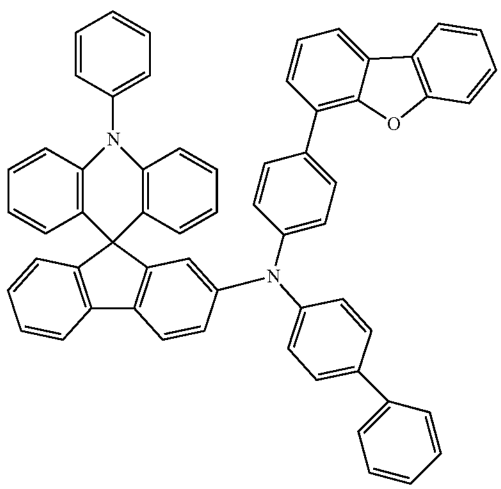
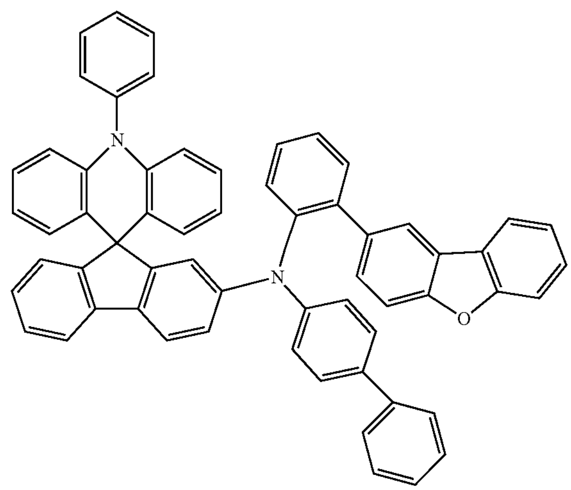
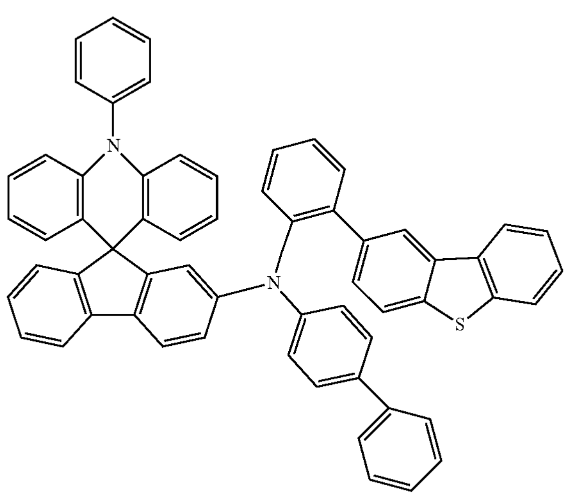
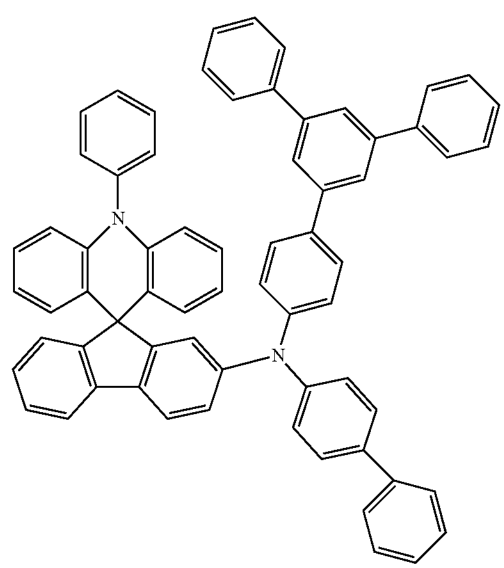

-continued
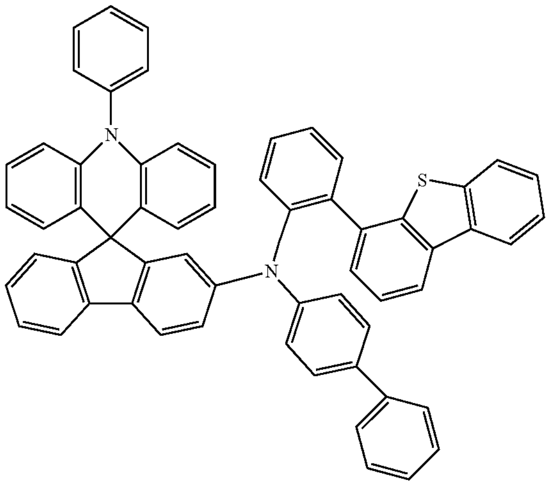
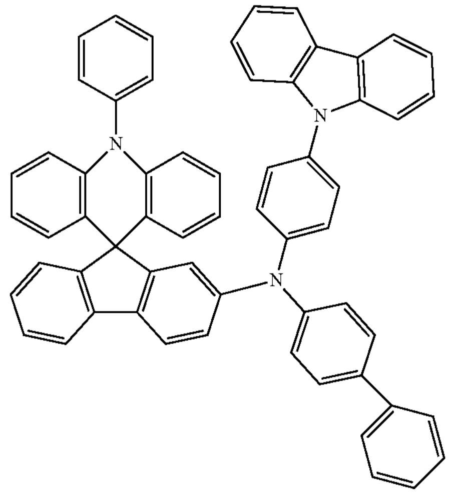
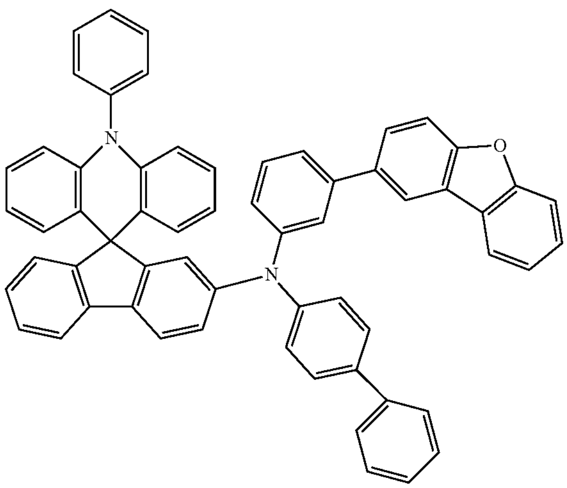
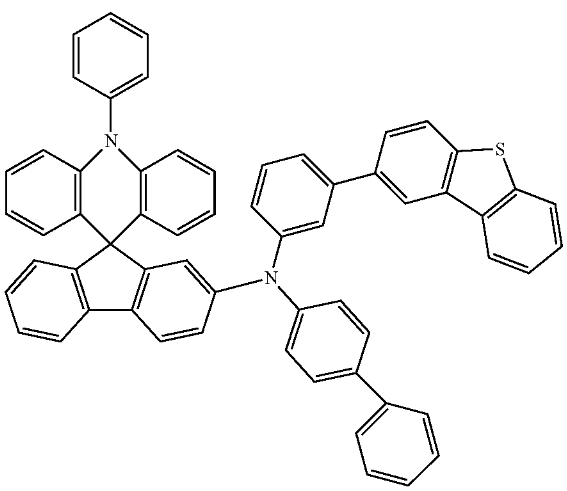
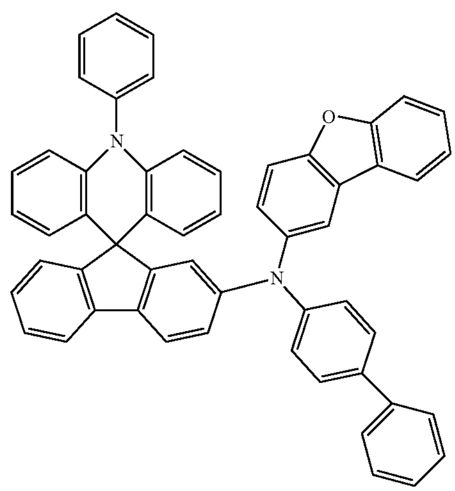

-continued
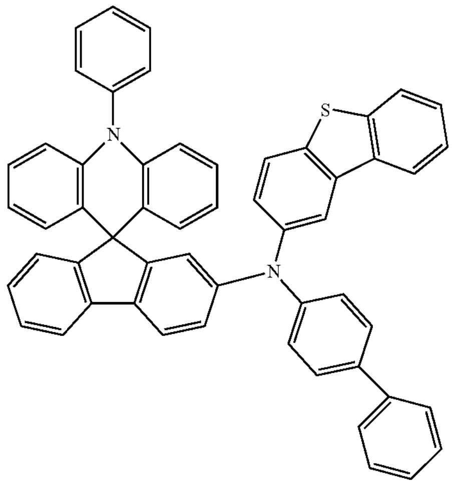
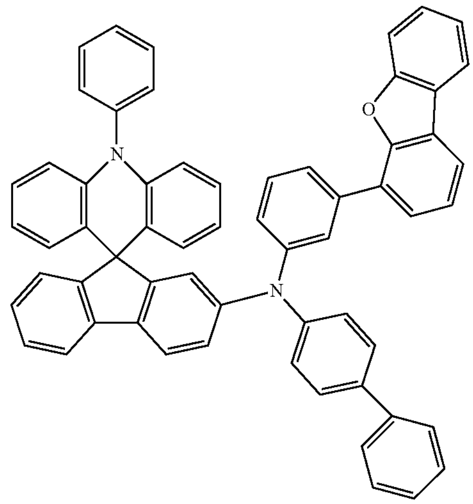
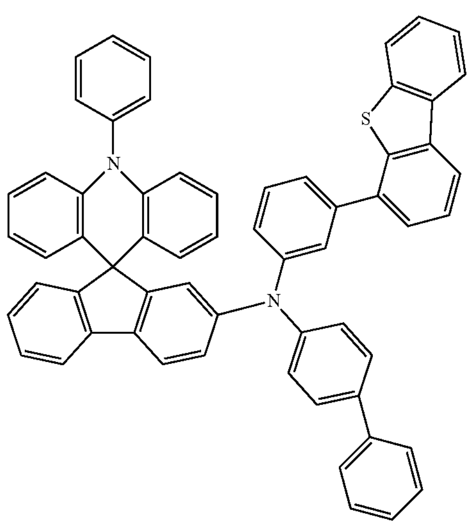
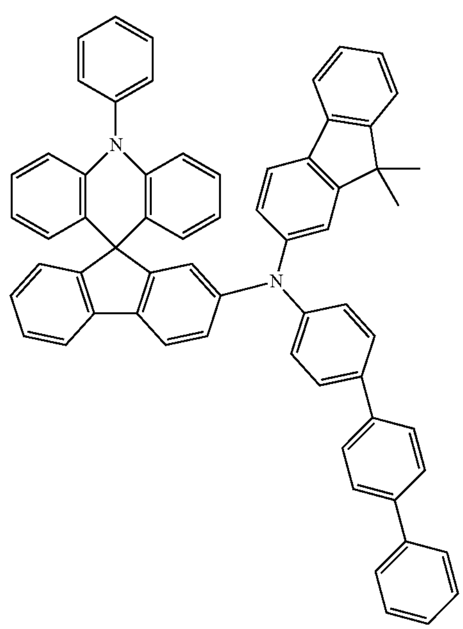

-continued
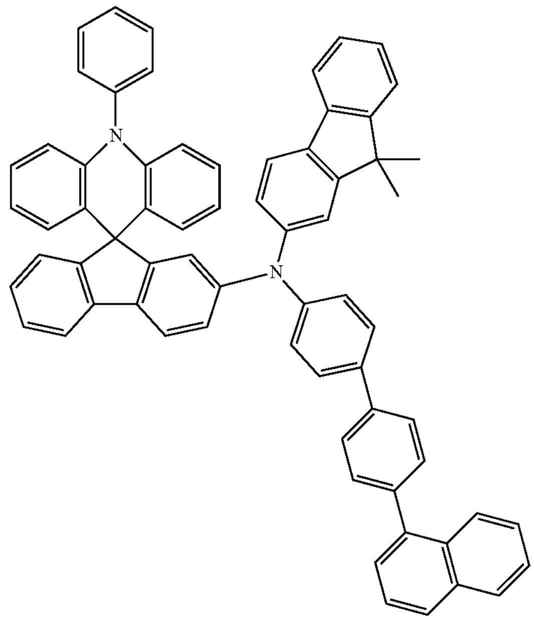
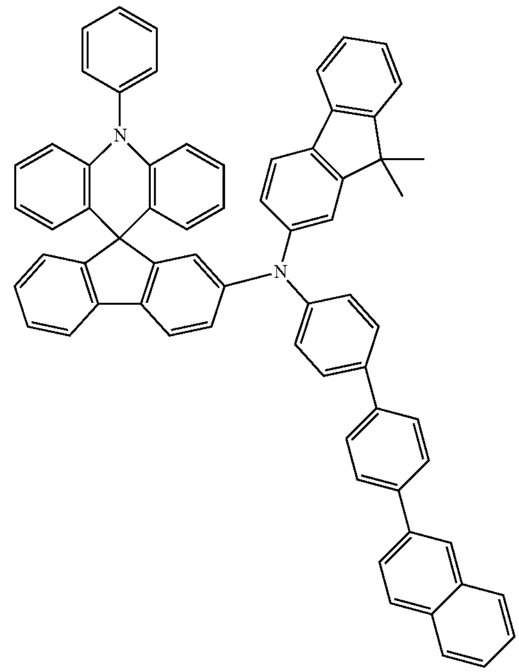
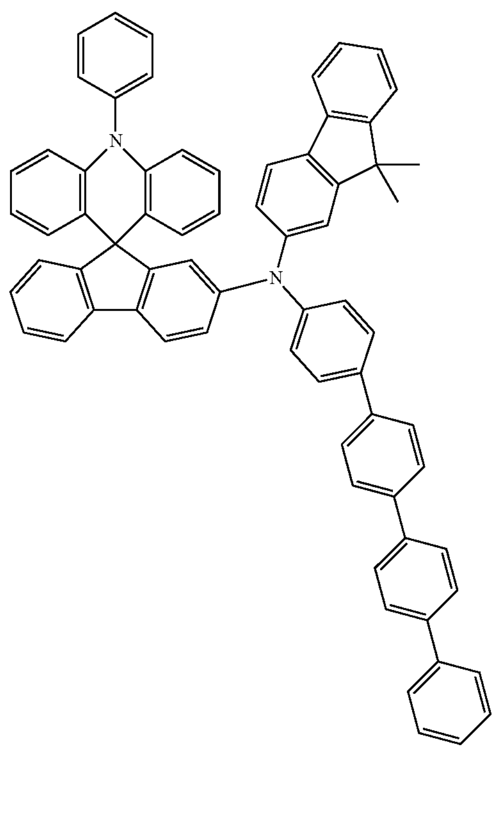
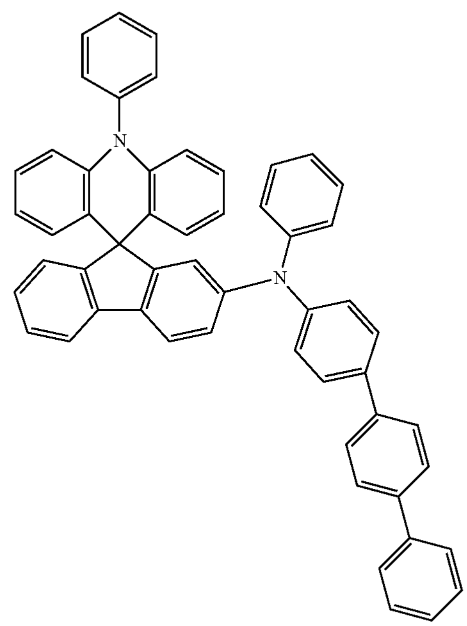

-continued
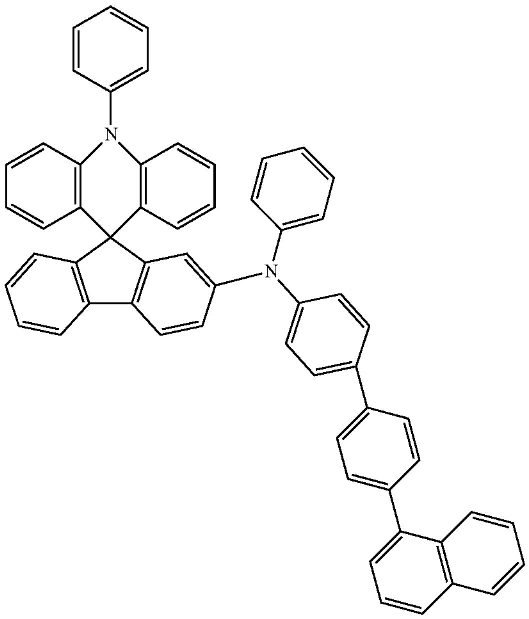
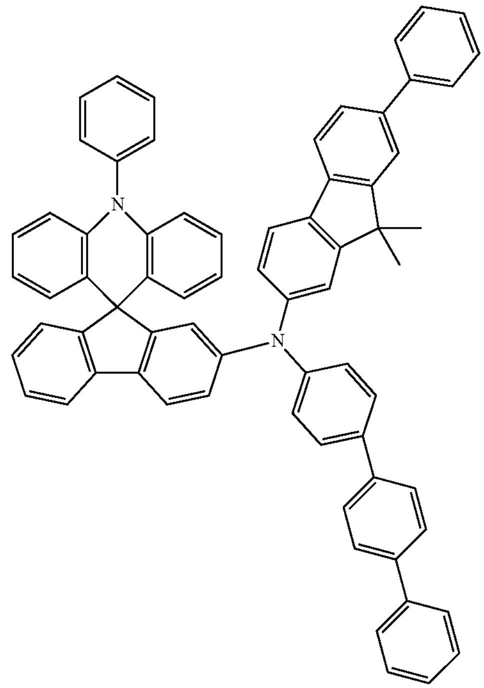
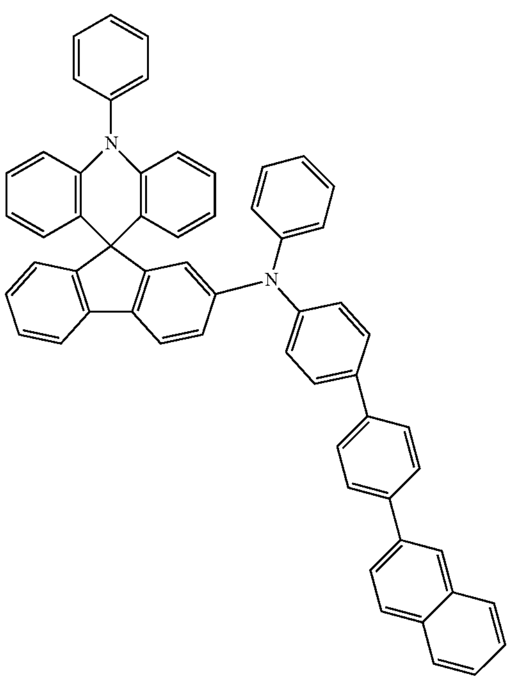
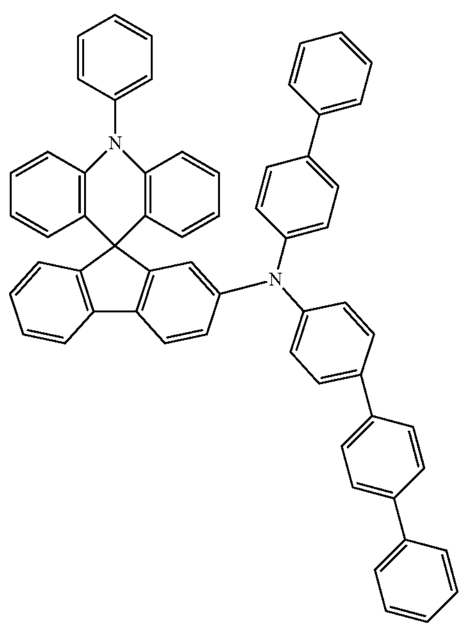

-continued
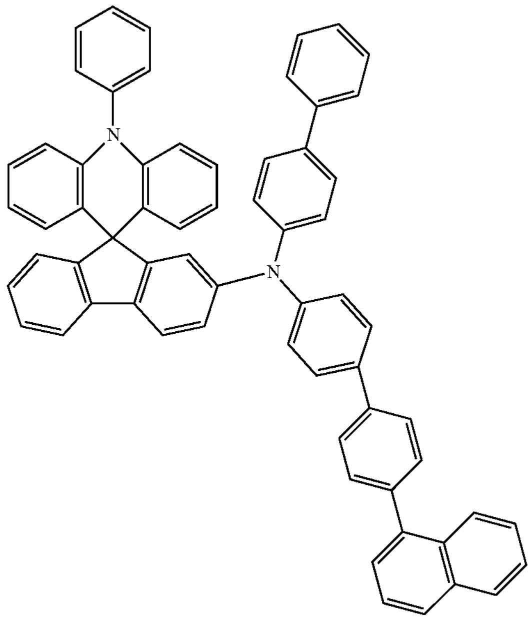
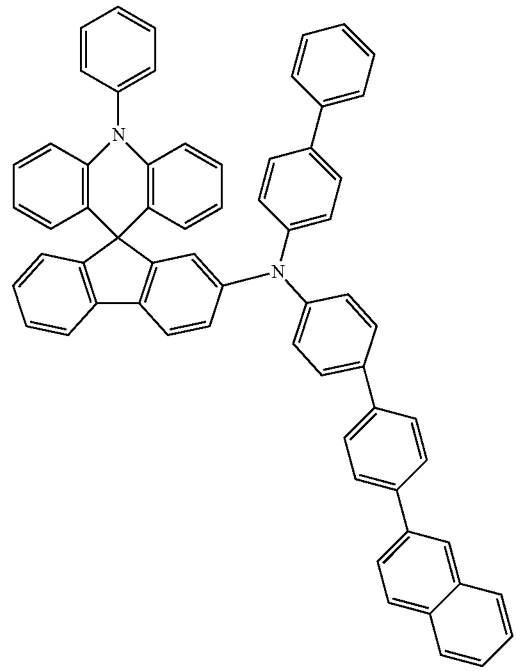
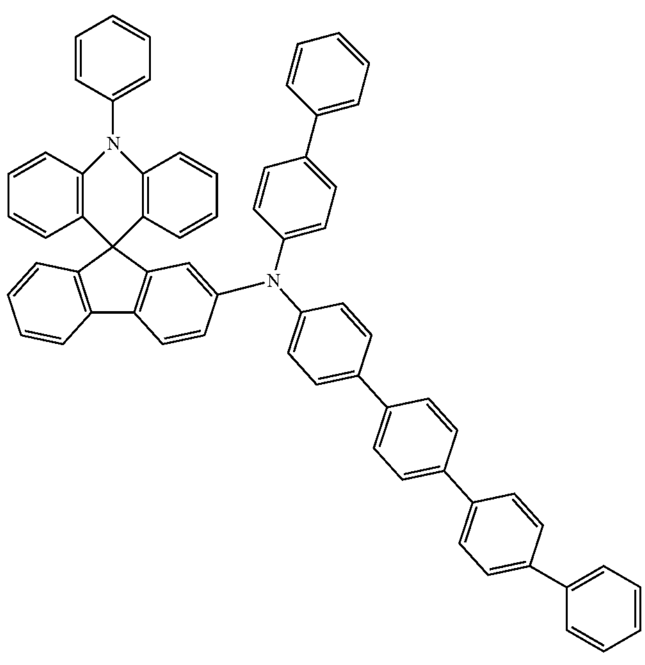

-continued
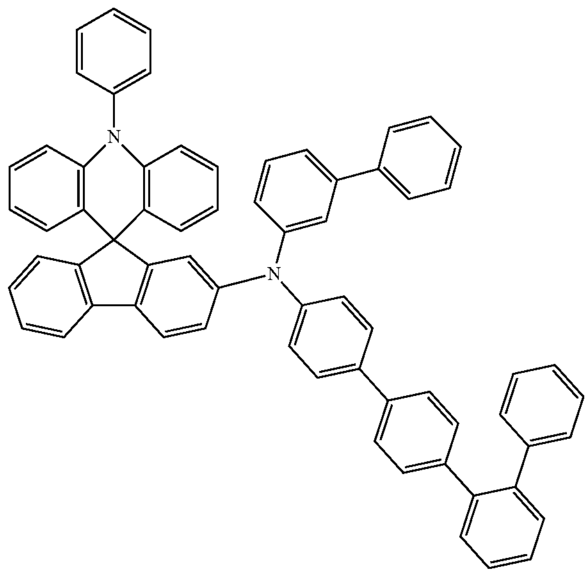
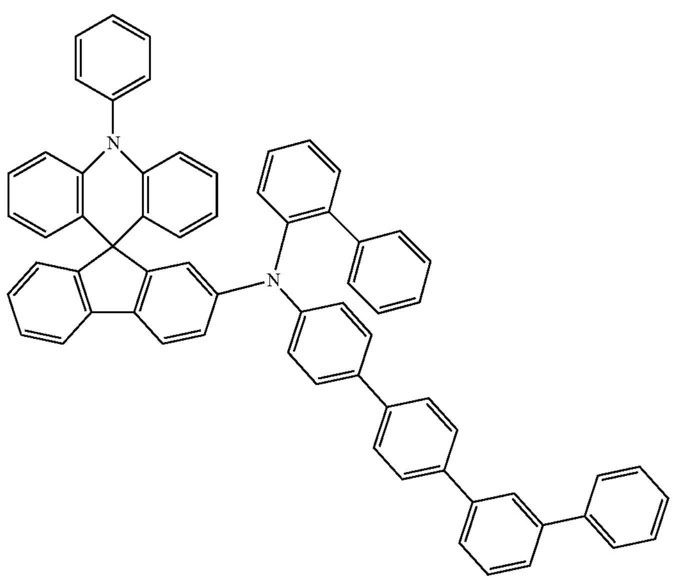

-continued
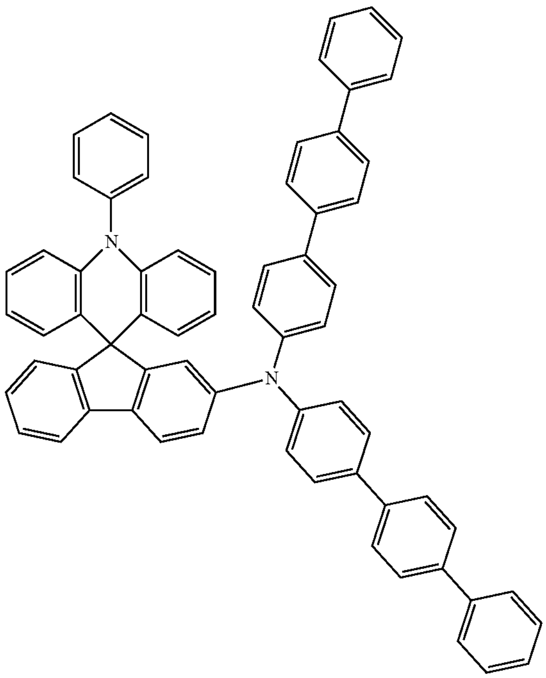
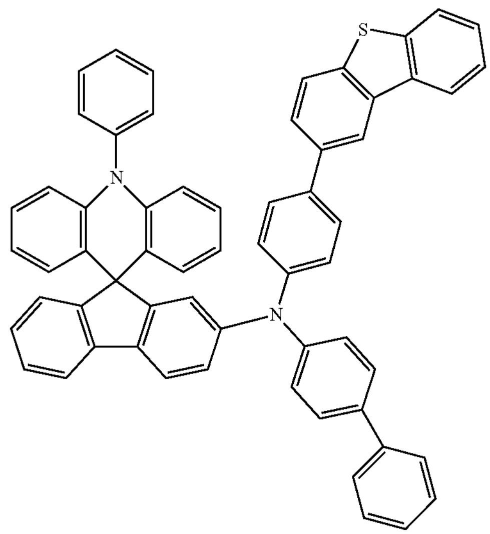
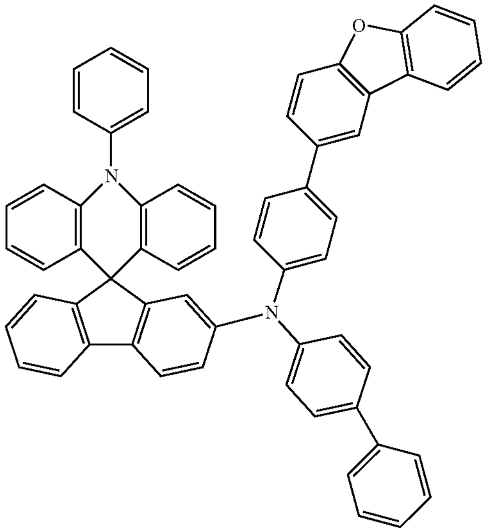
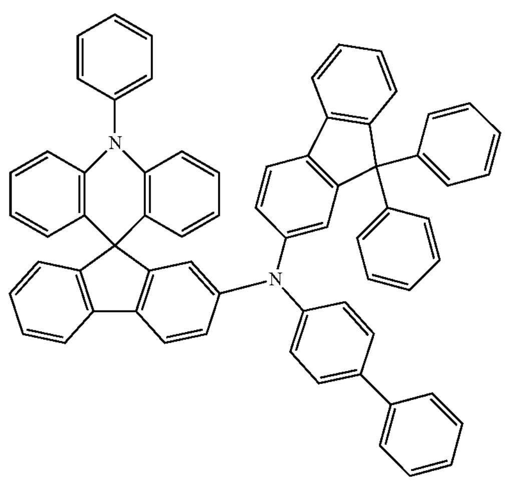
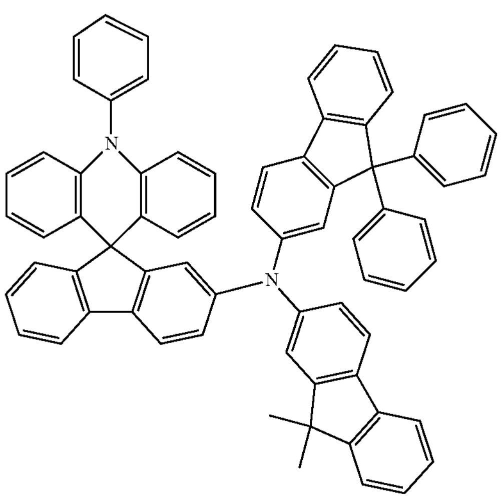
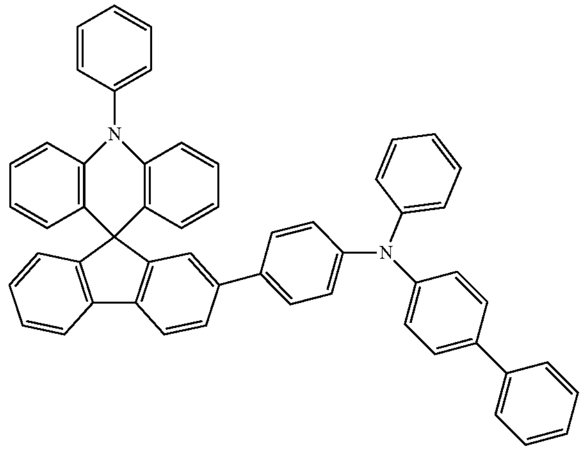

-continued
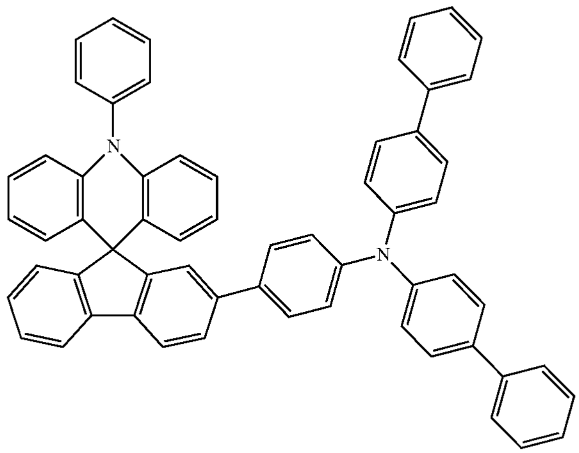
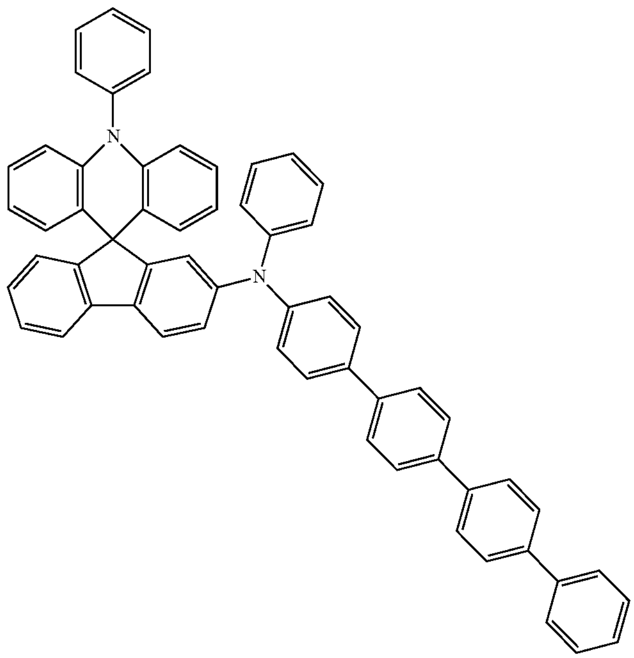
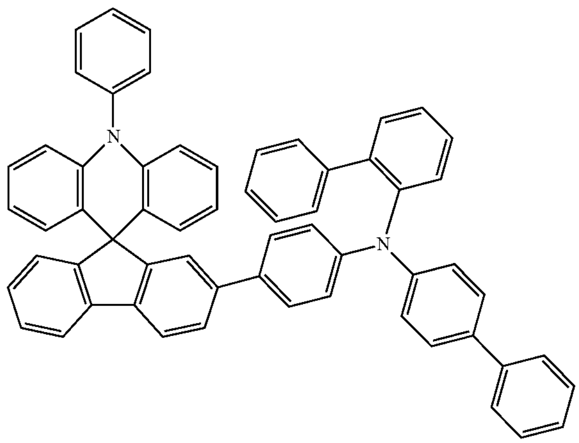

-continued
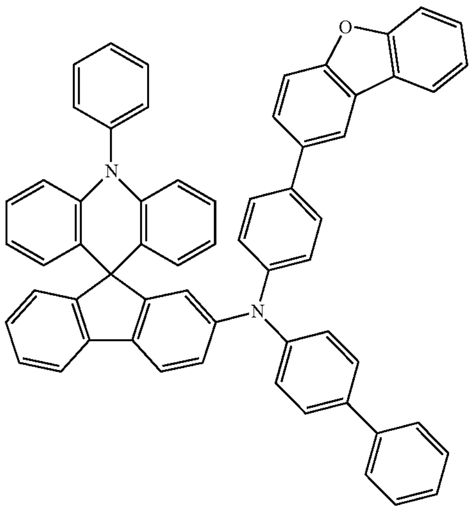
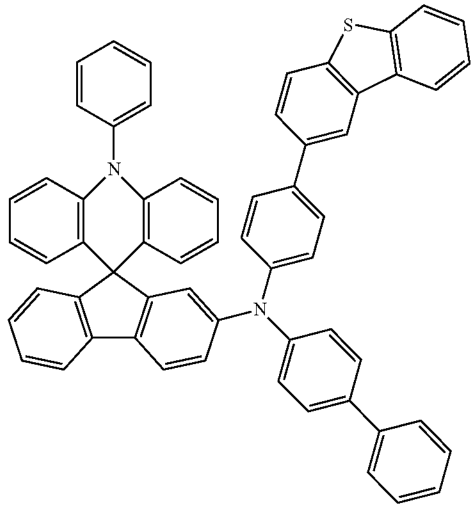
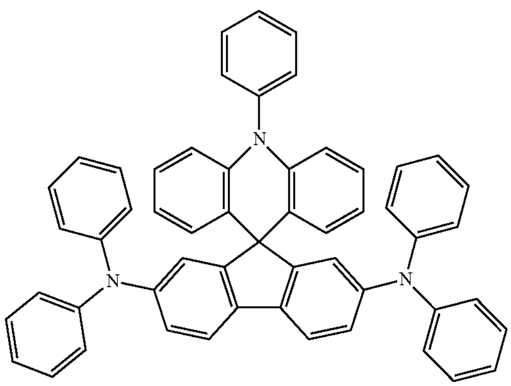
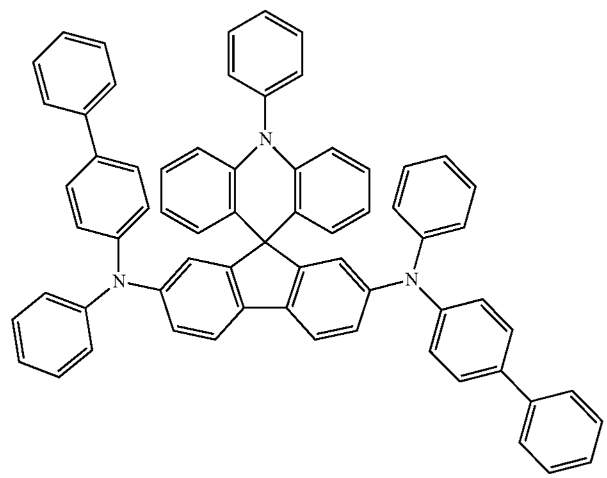
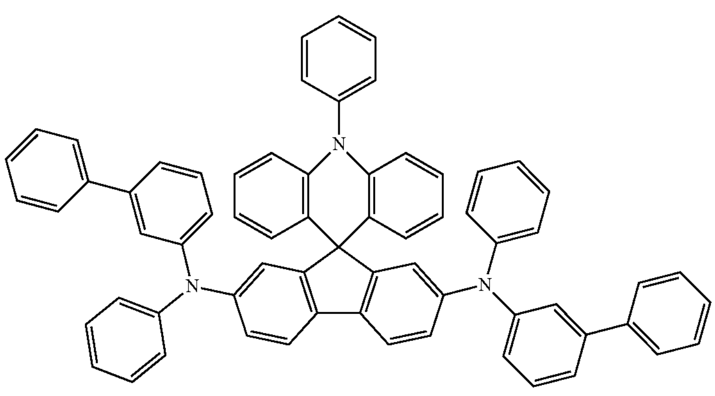

-continued
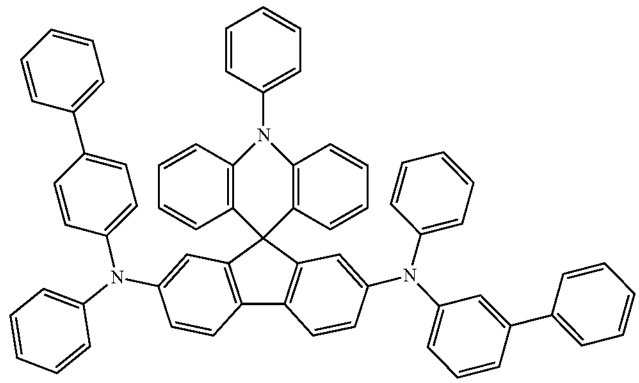
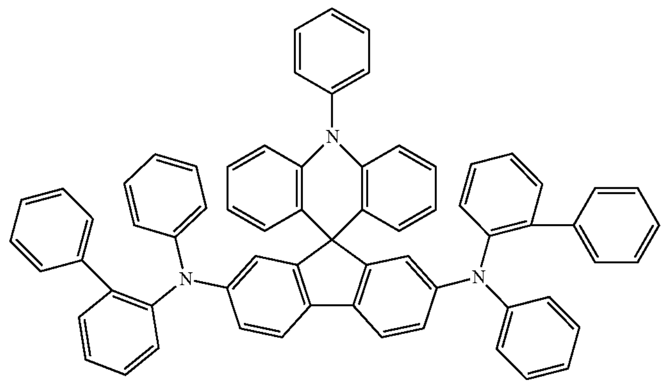
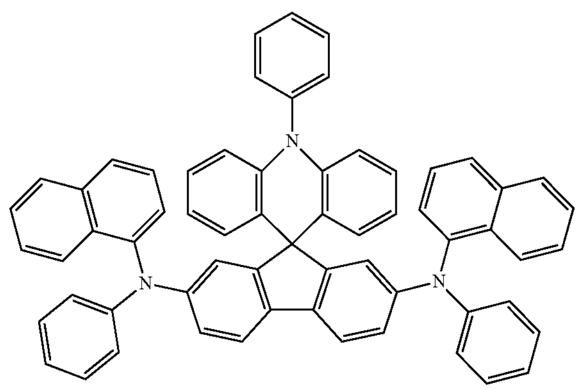
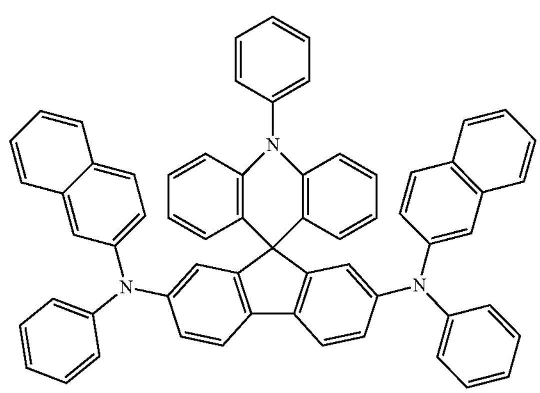

-continued
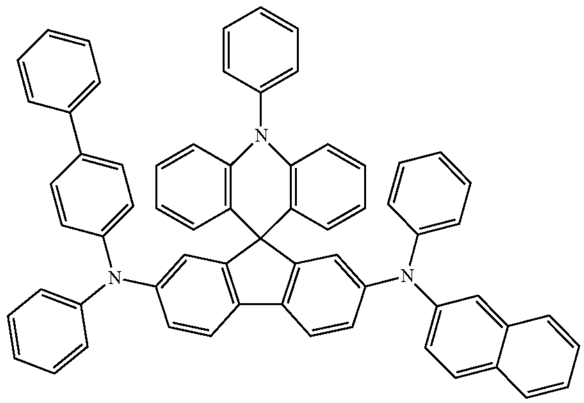
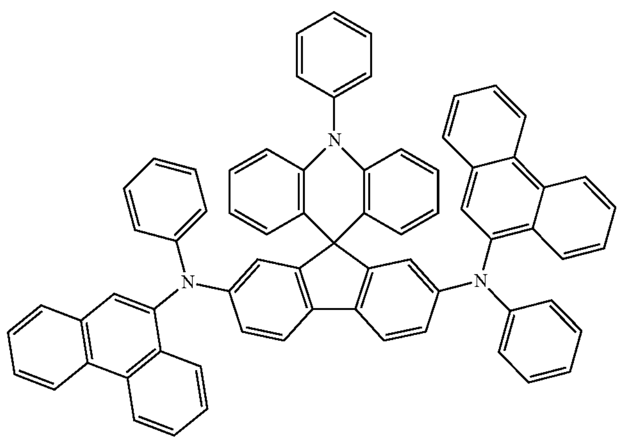
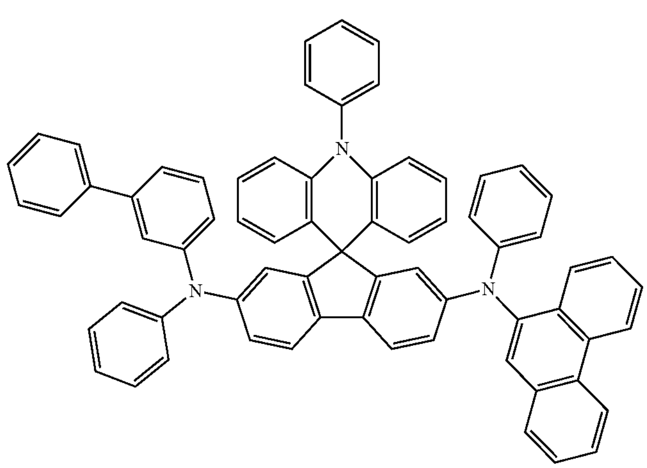

-continued
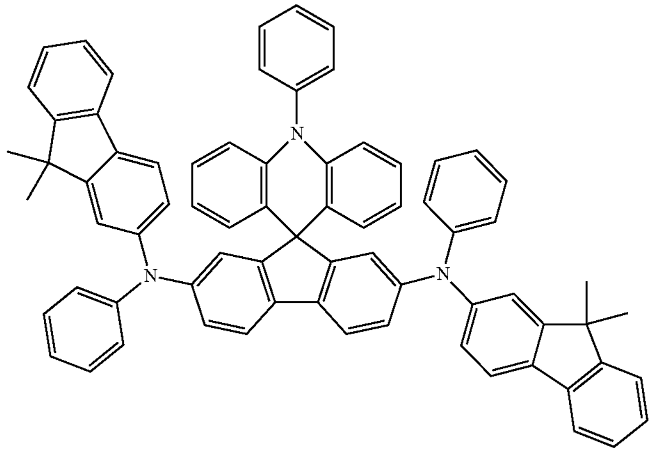
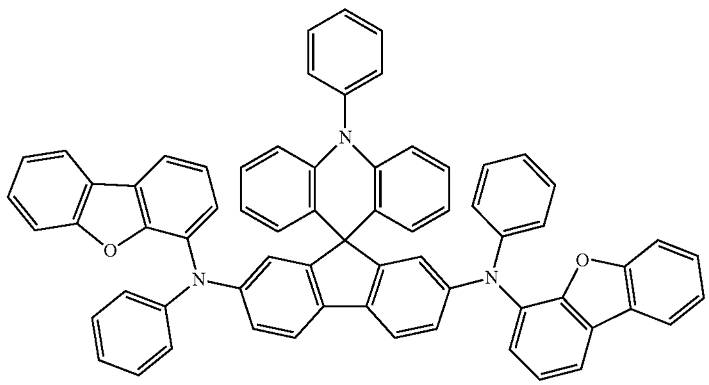
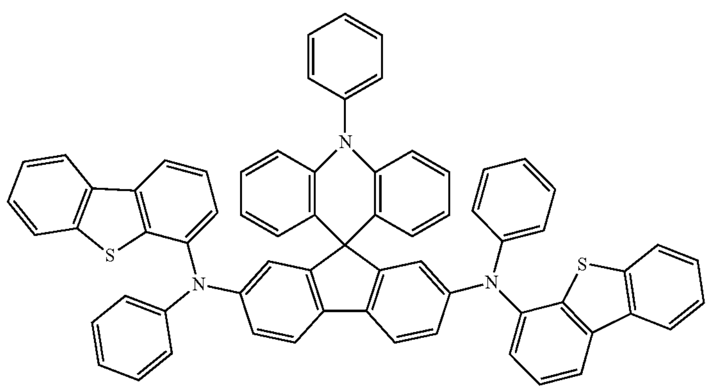
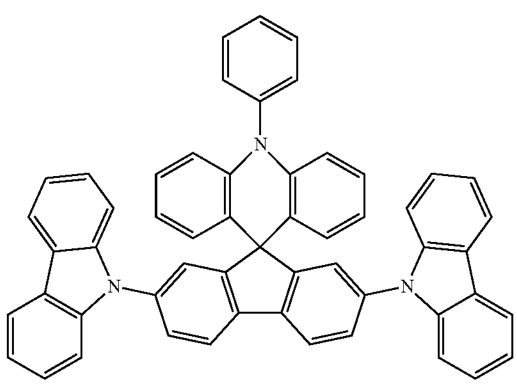

-continued
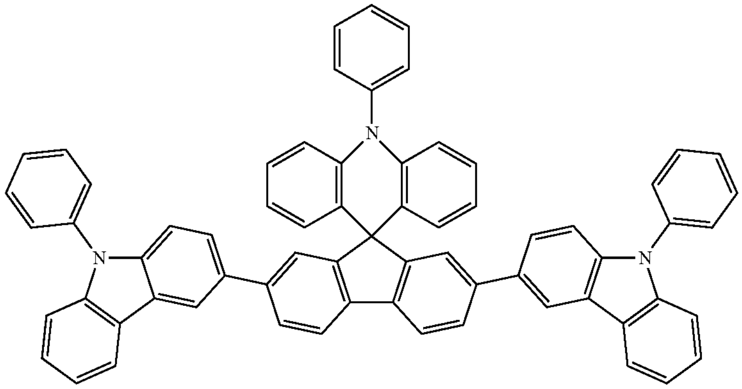
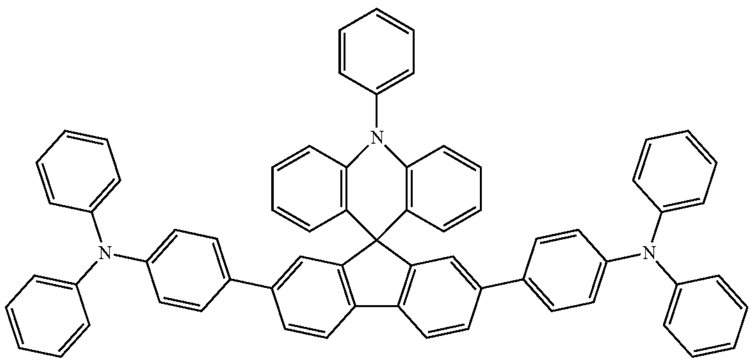
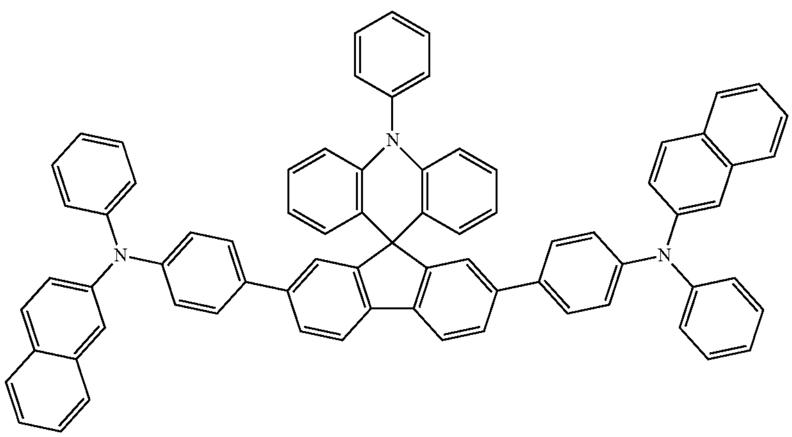
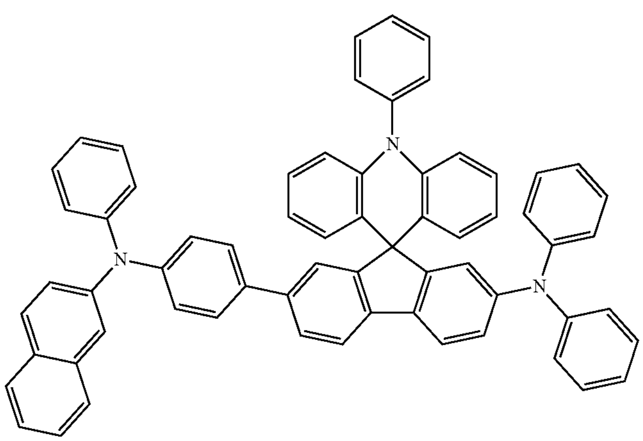

-continued
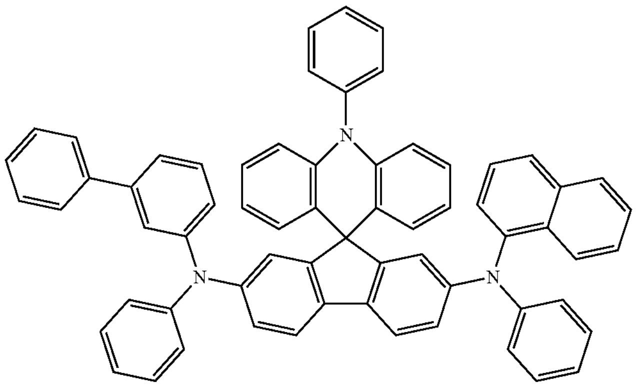
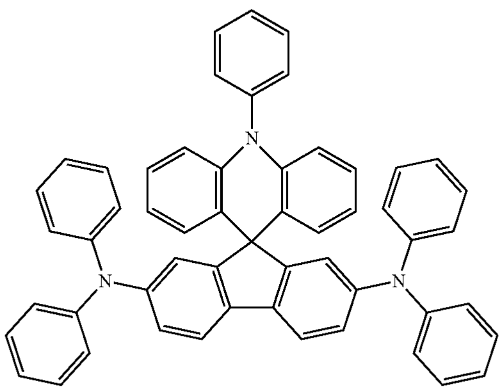
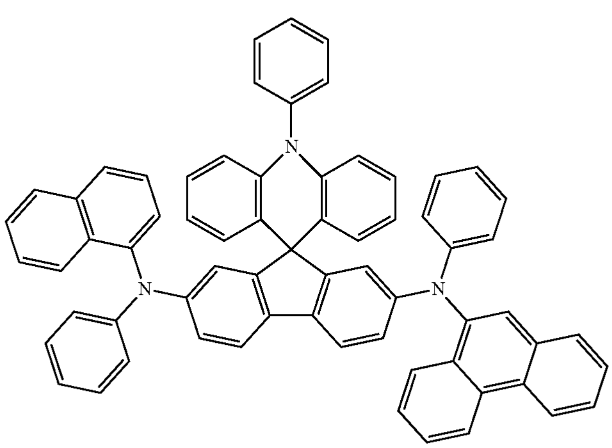

-continued
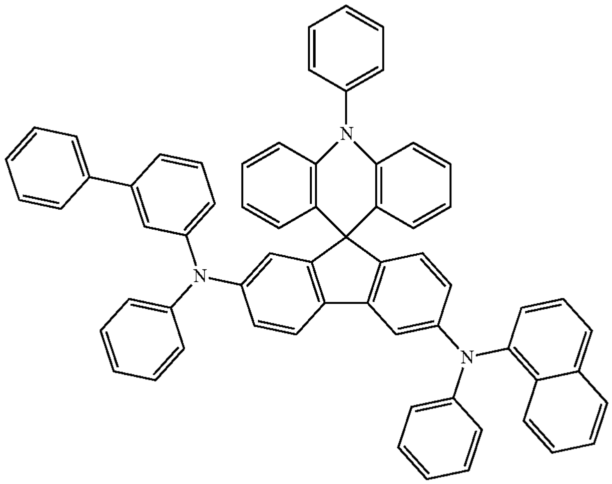
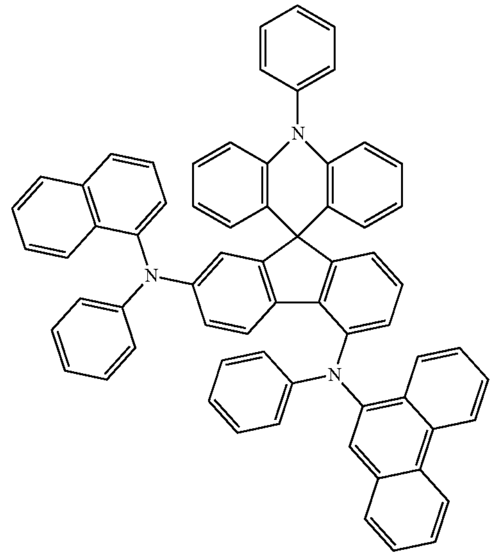
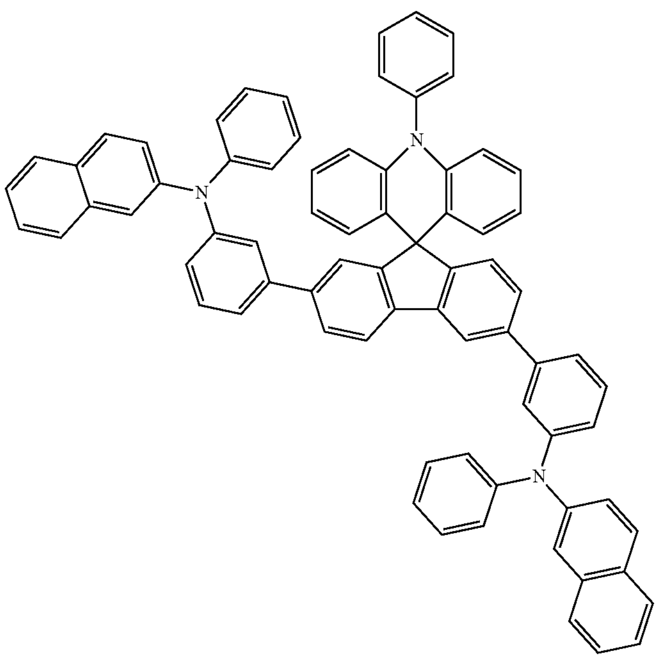
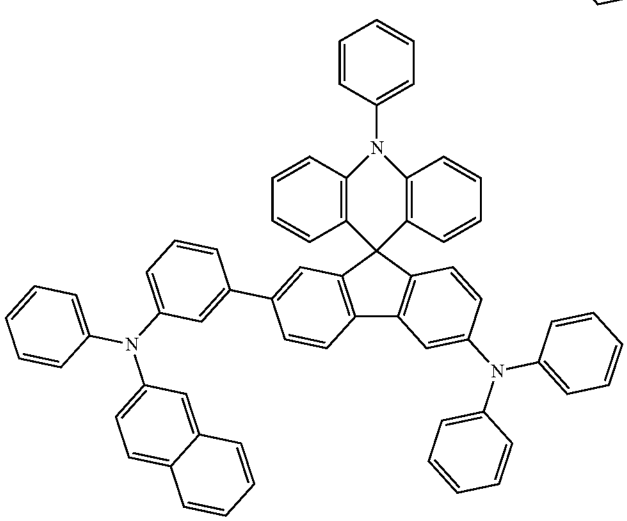

-continued
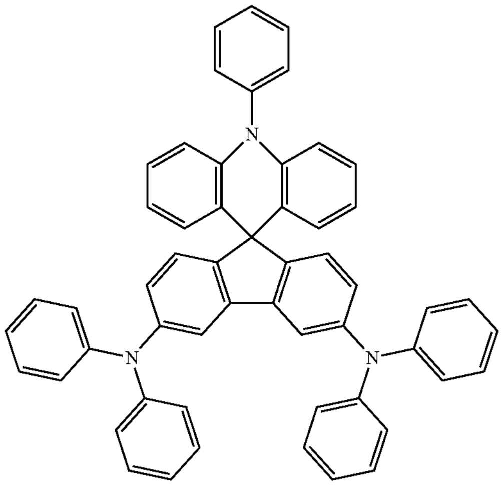
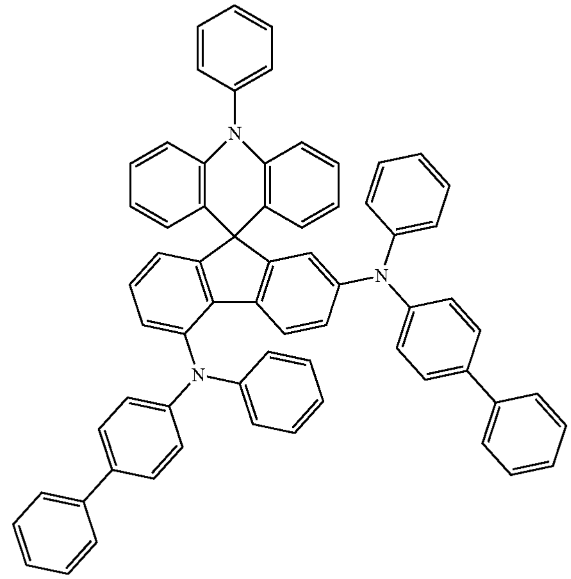
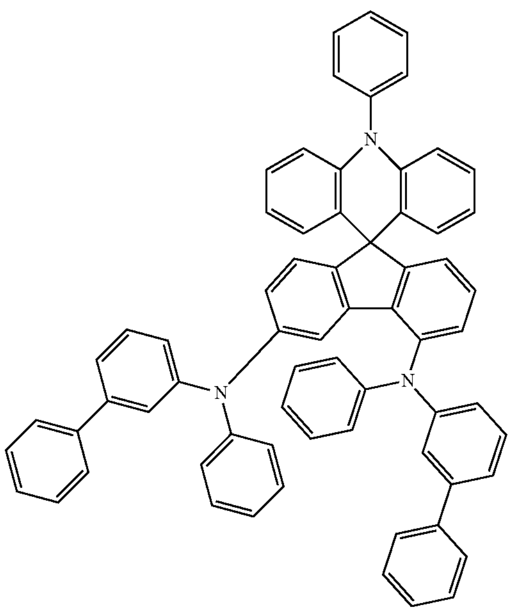
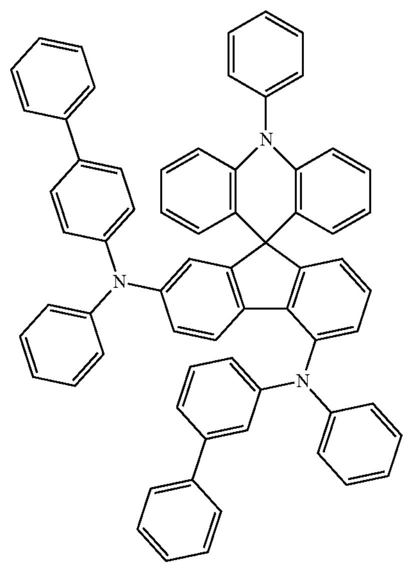
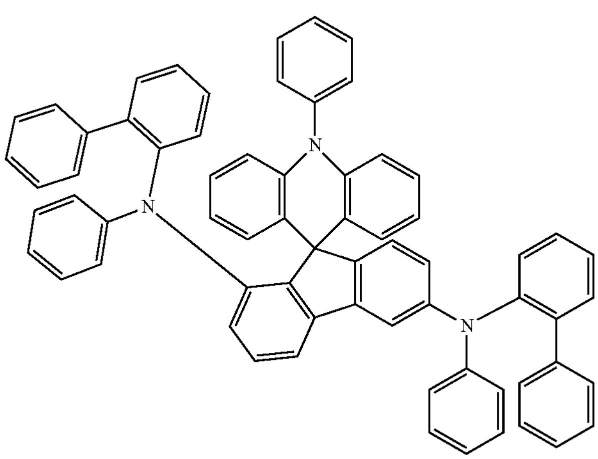

-continued
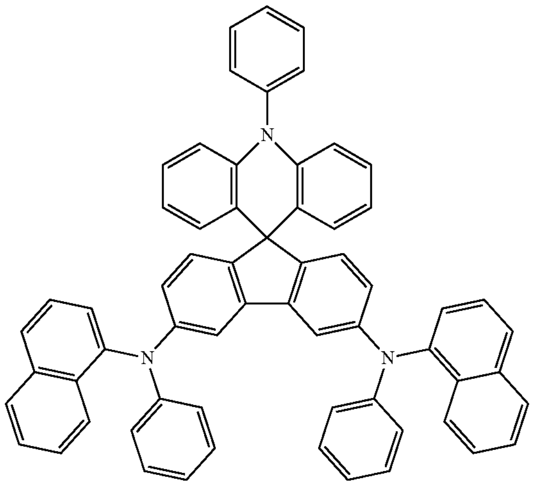
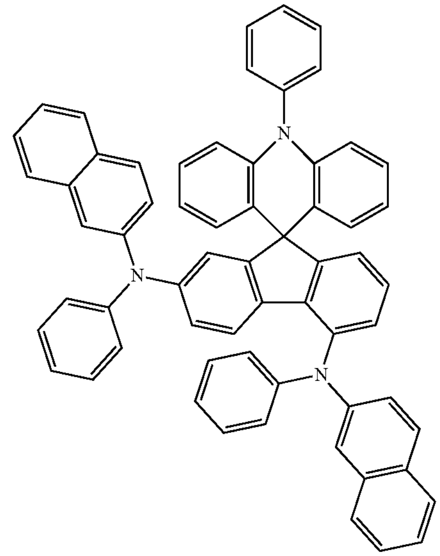
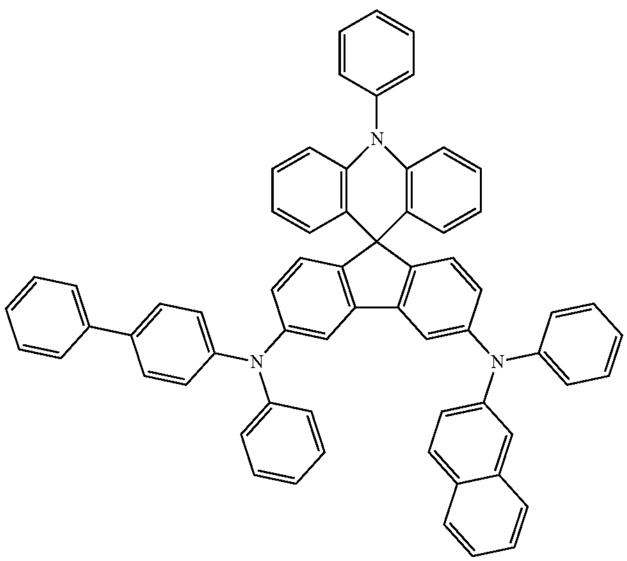
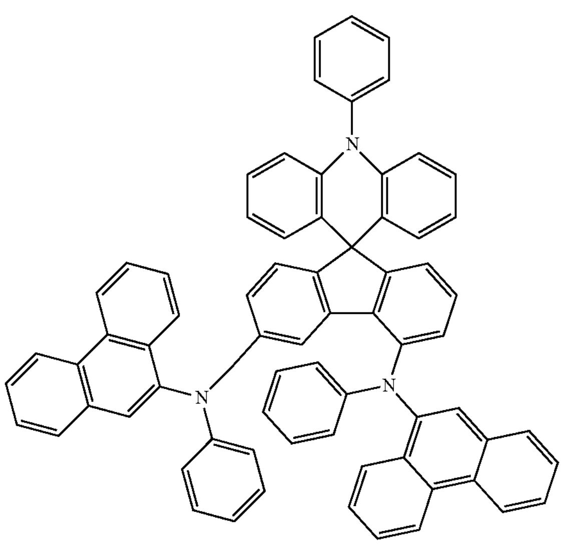

-continued
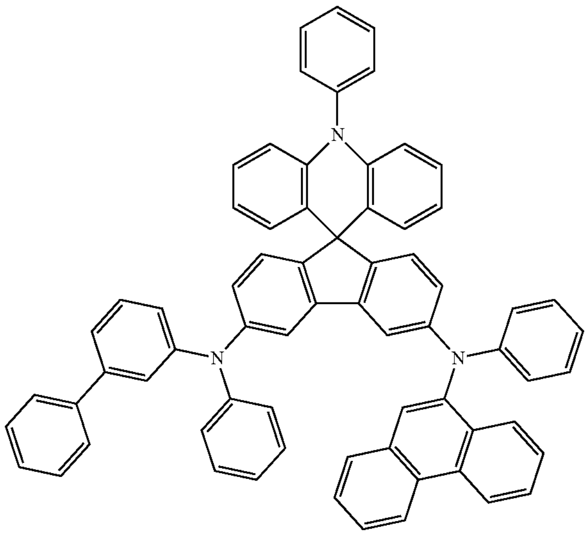
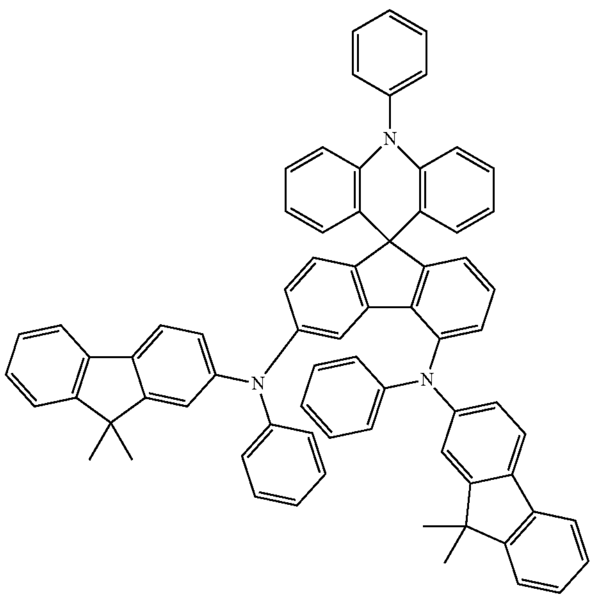
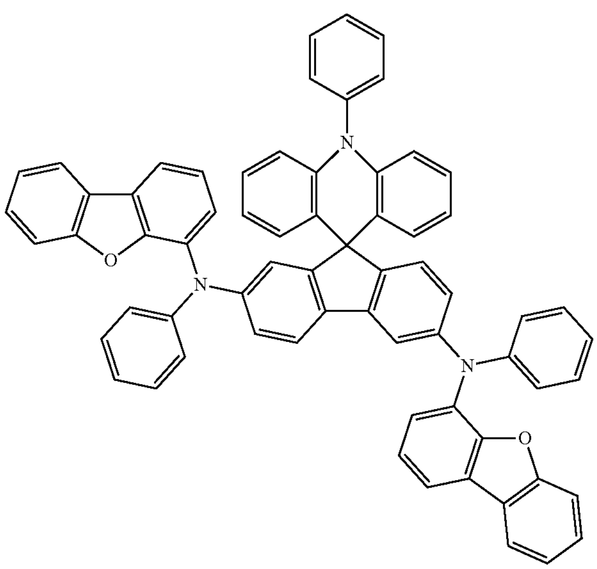

-continued
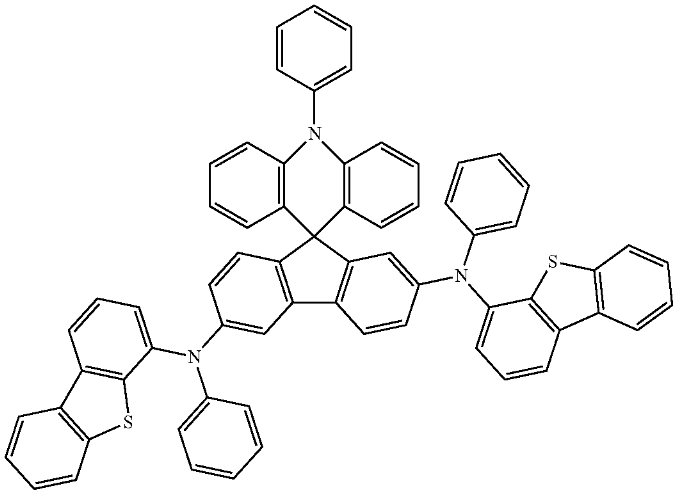
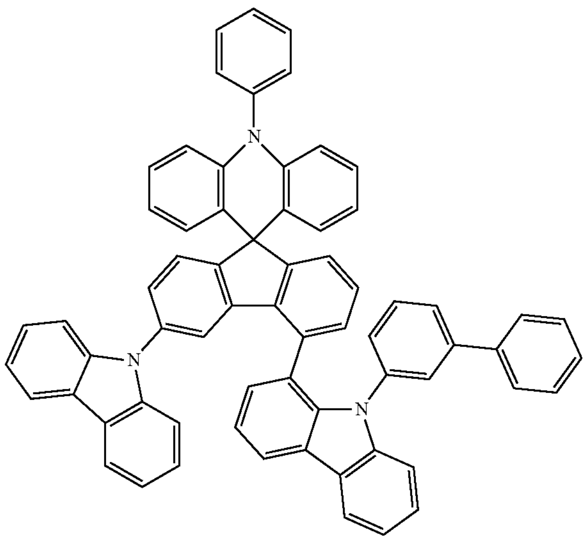
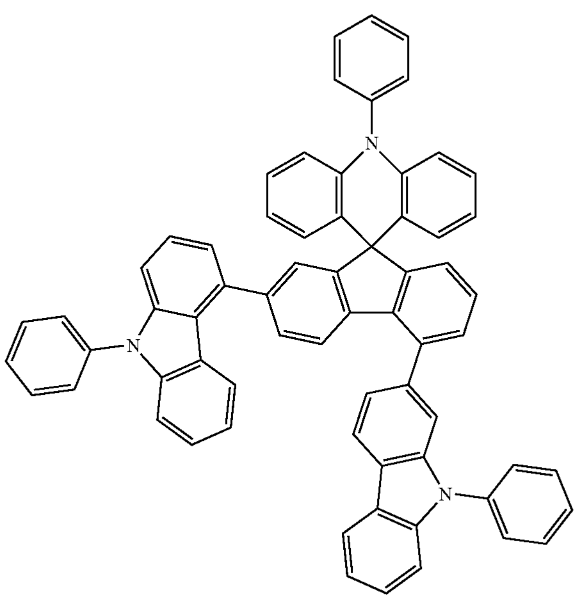

-continued
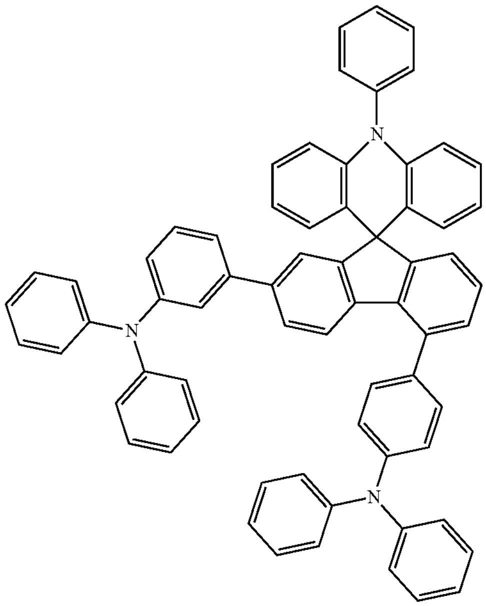
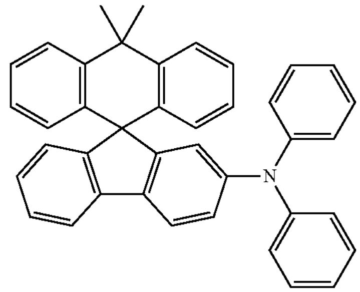
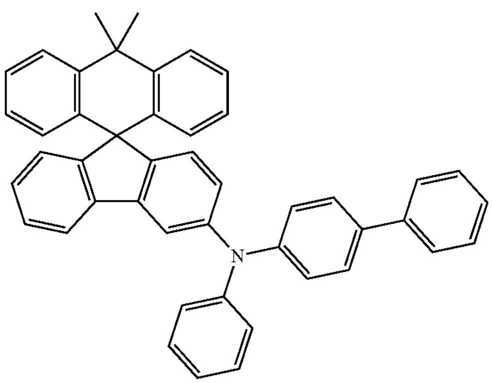
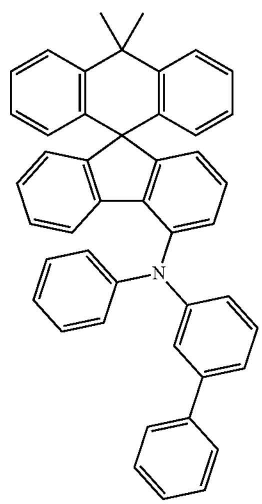
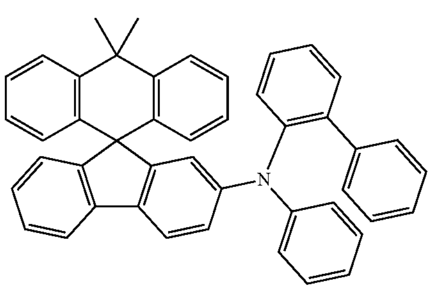
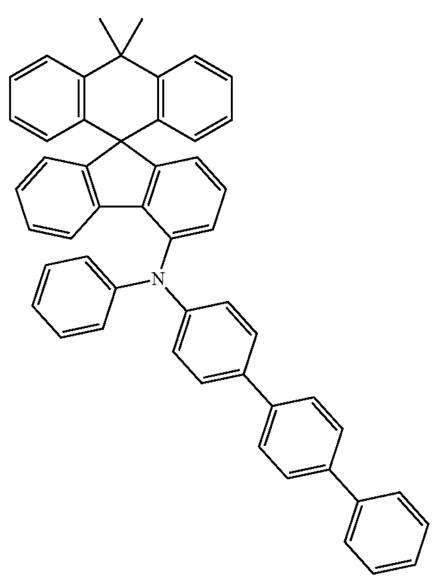

-continued
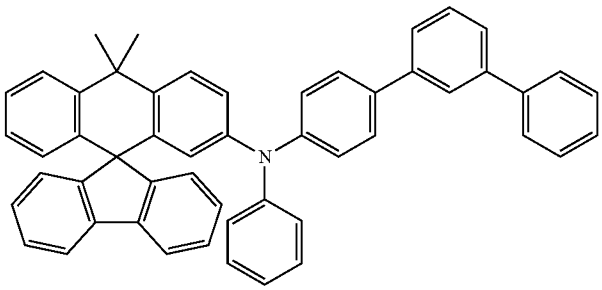
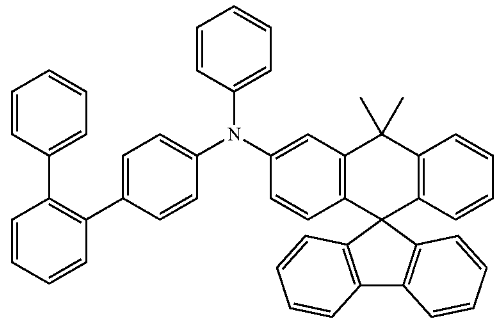
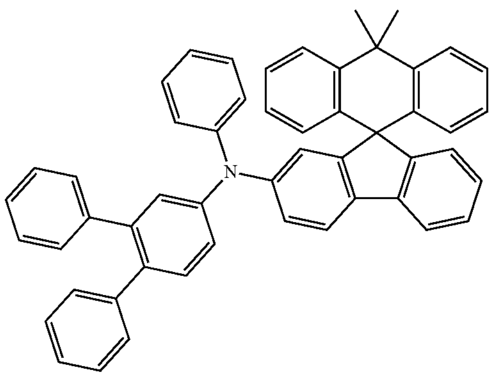
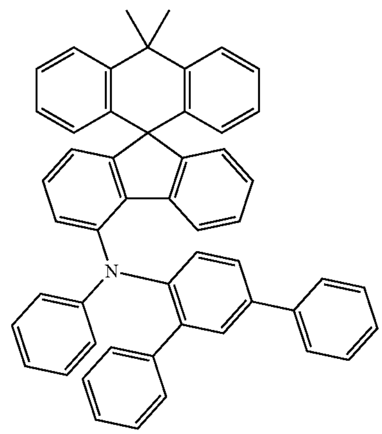
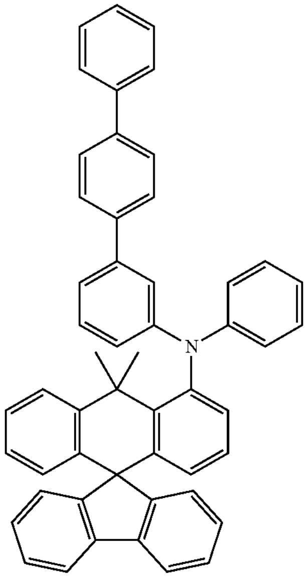
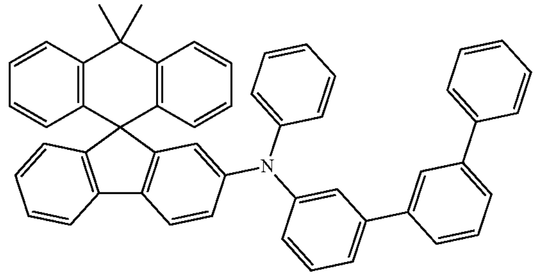

-continued
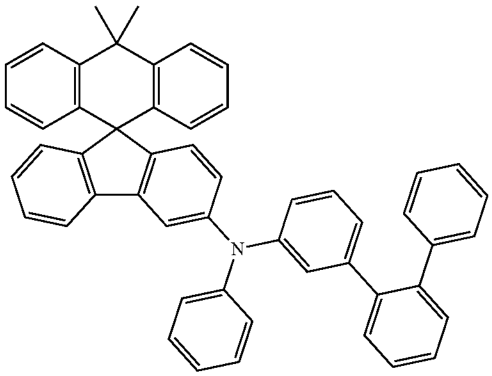
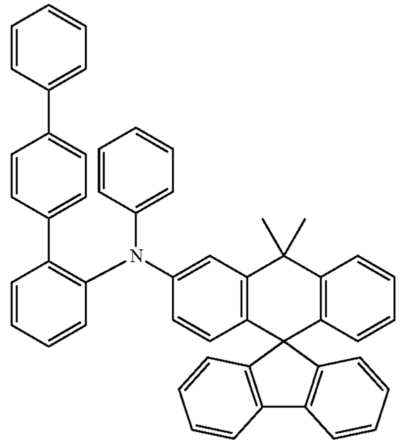
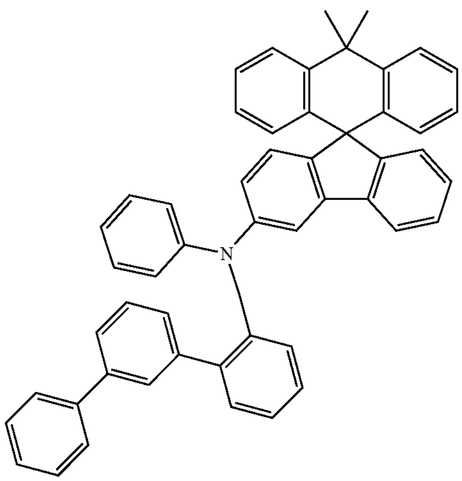
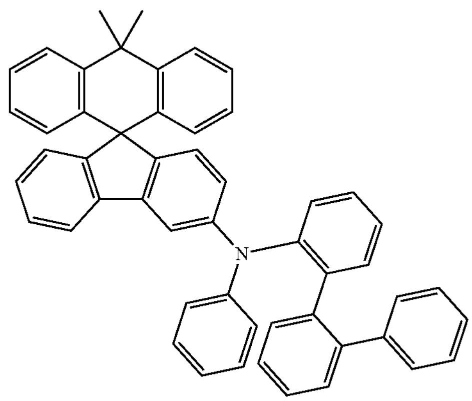
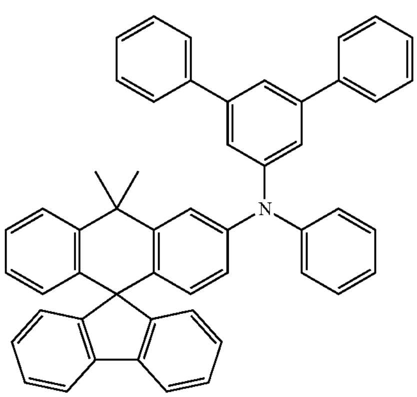
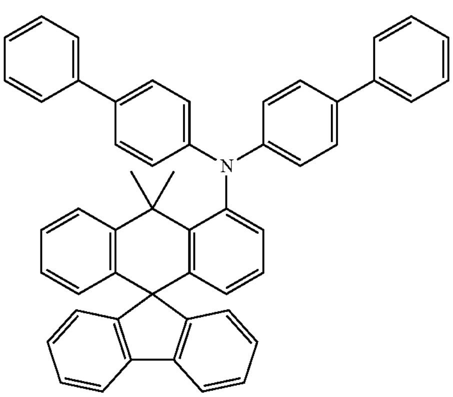

-continued
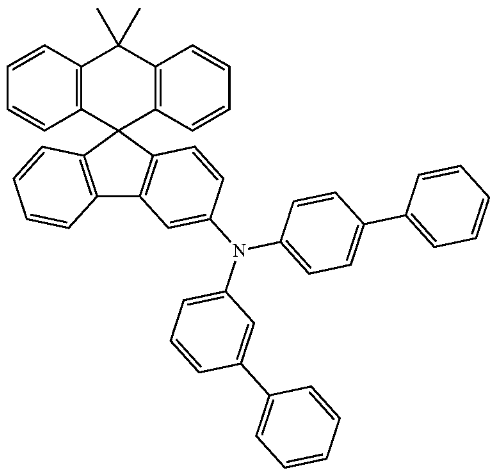
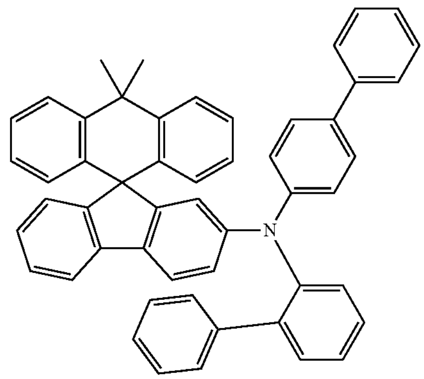
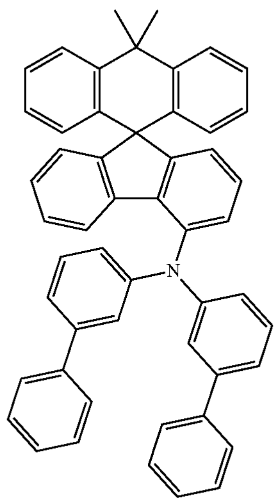
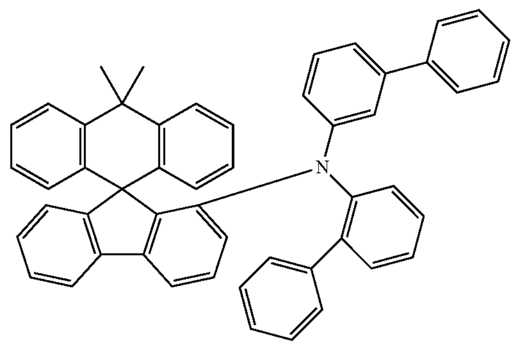
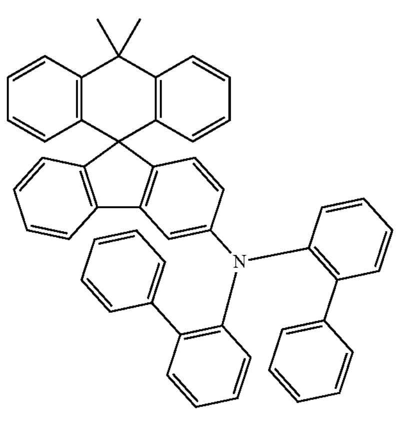
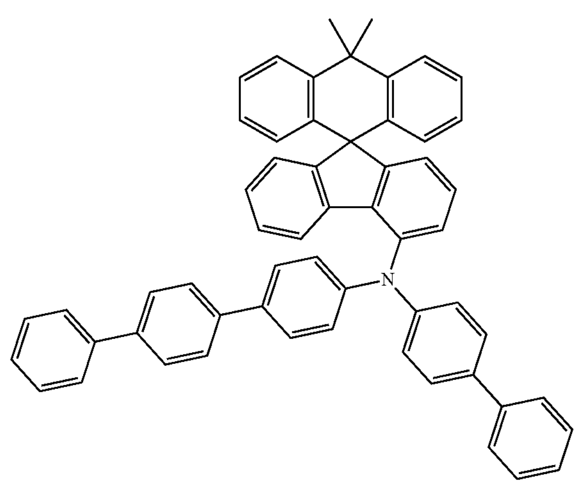

-continued
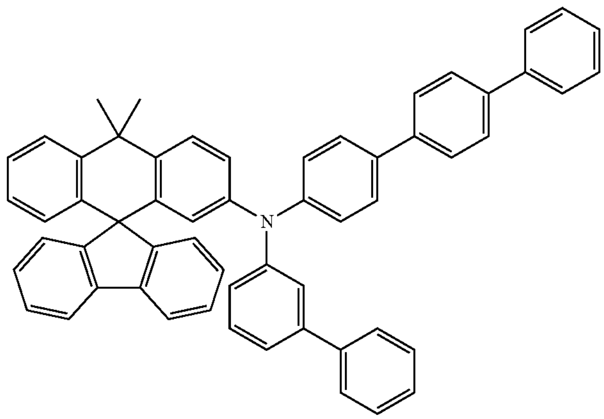
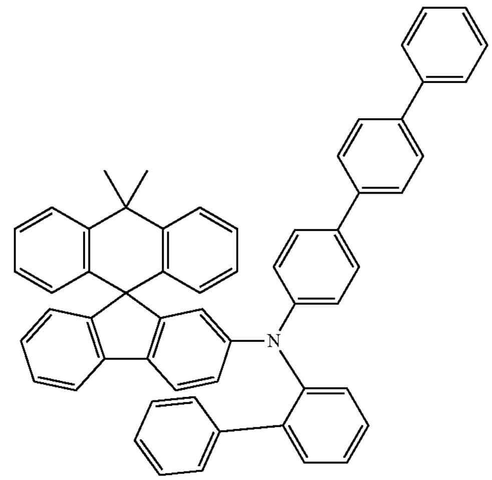
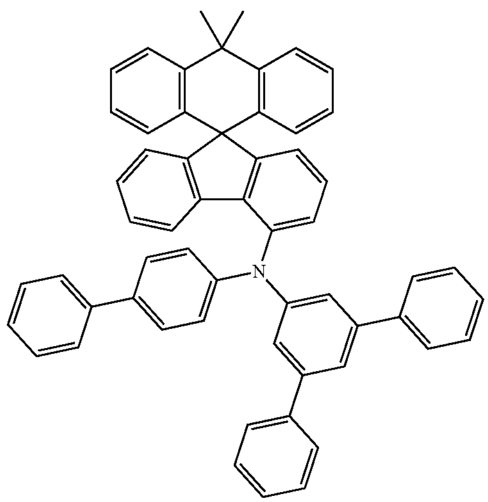
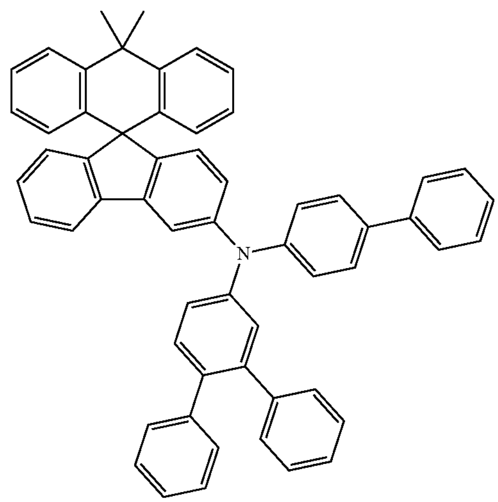
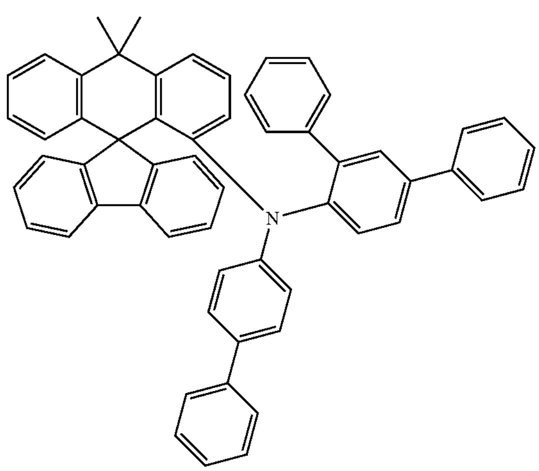
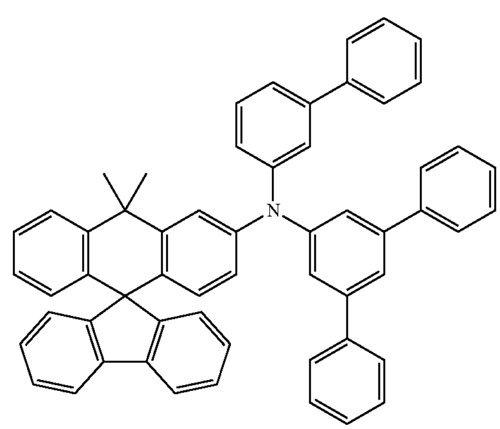

-continued
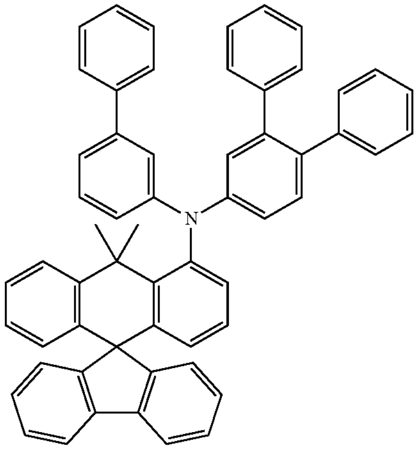
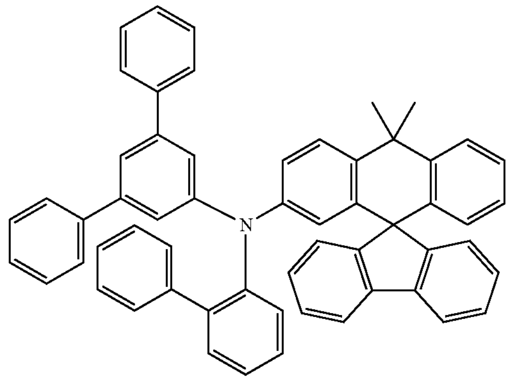
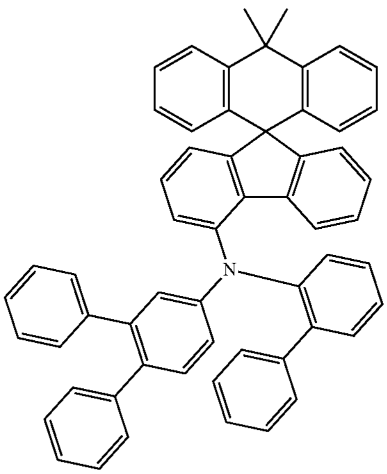
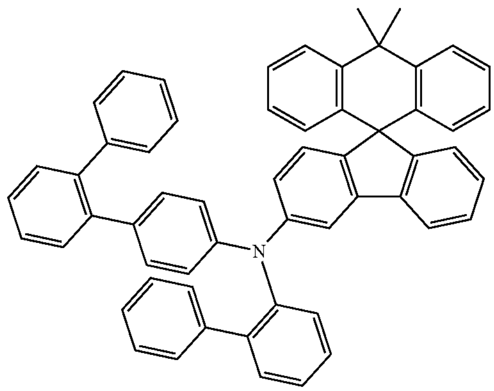
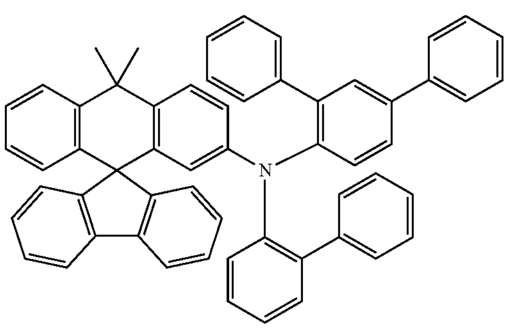
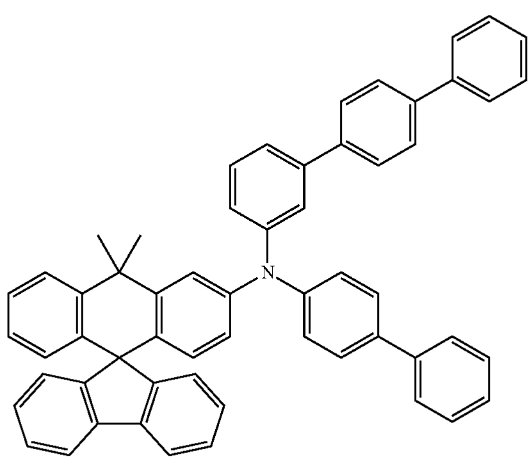

-continued
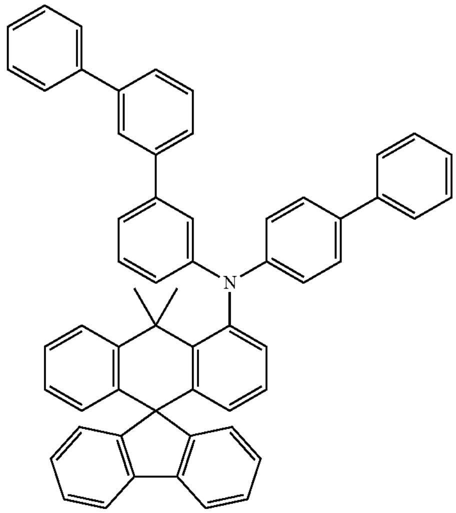
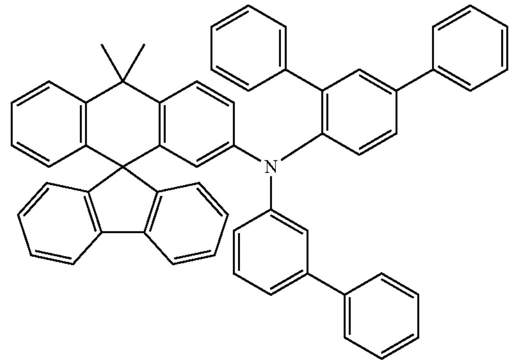
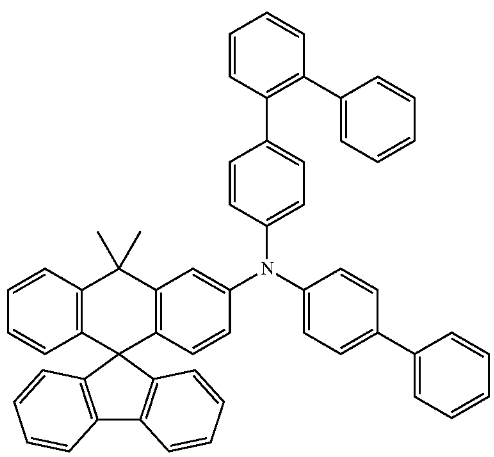
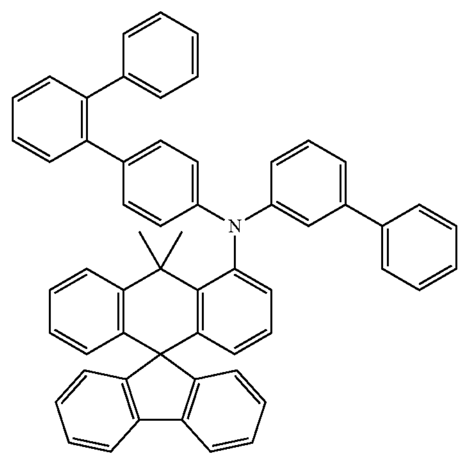
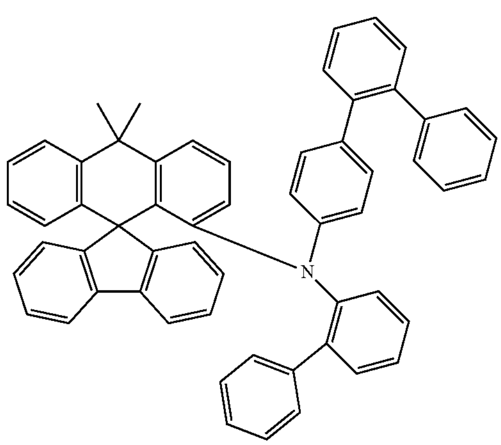
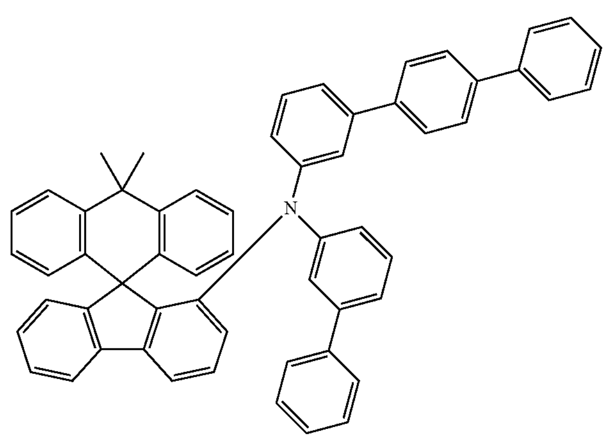

-continued
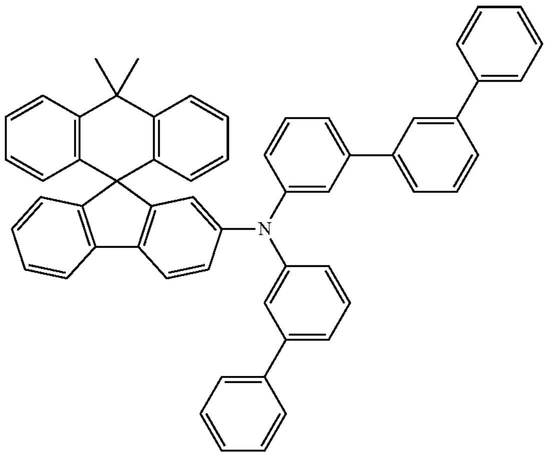
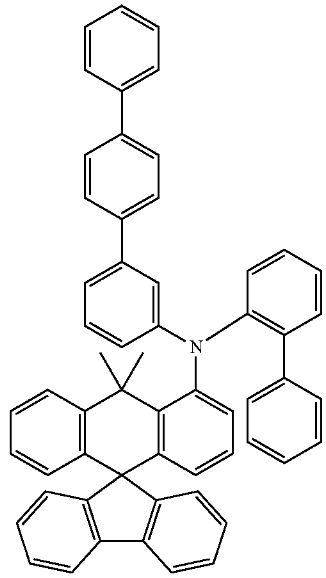
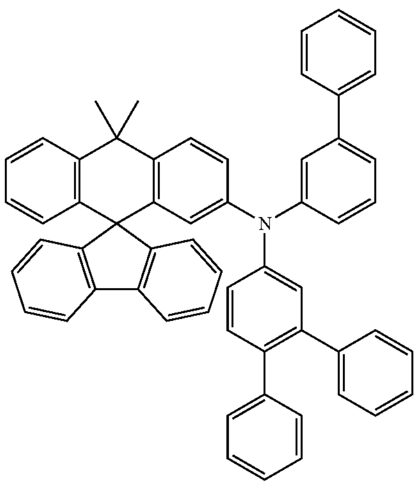
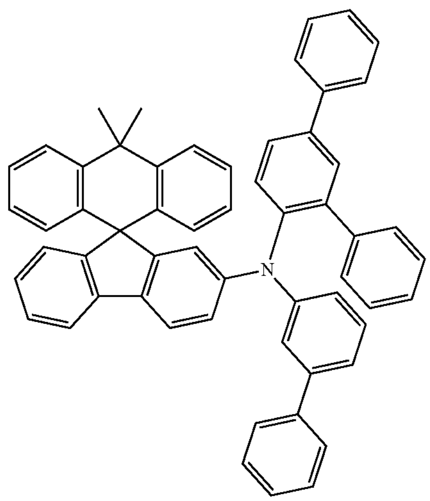
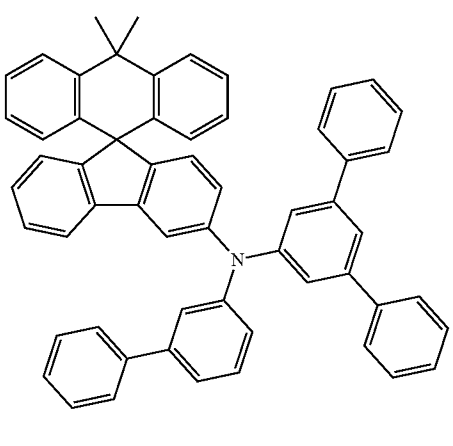
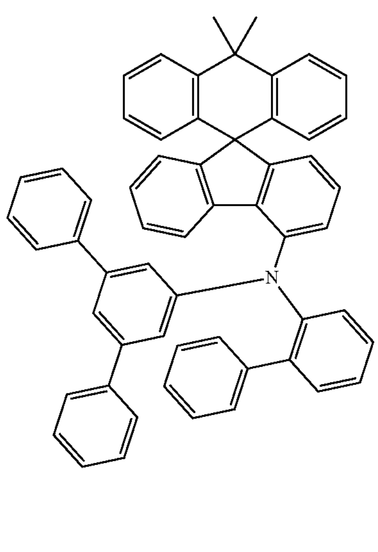

-continued
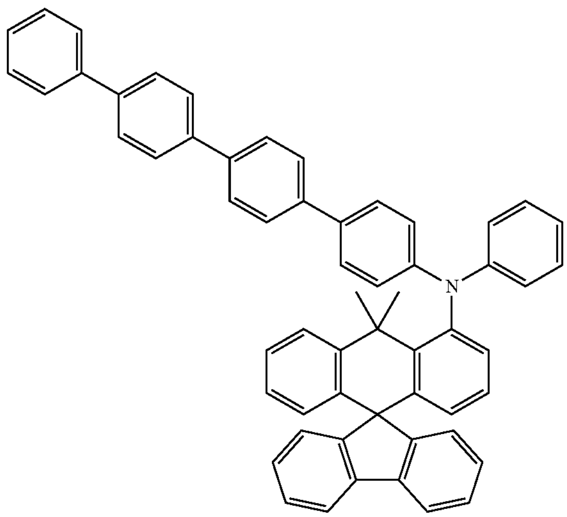
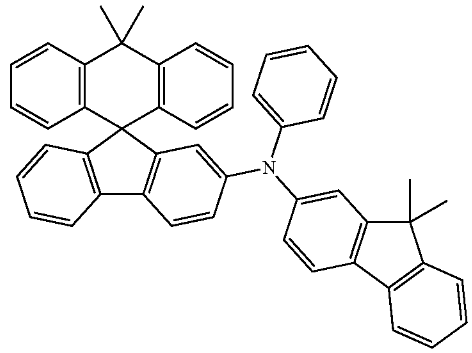
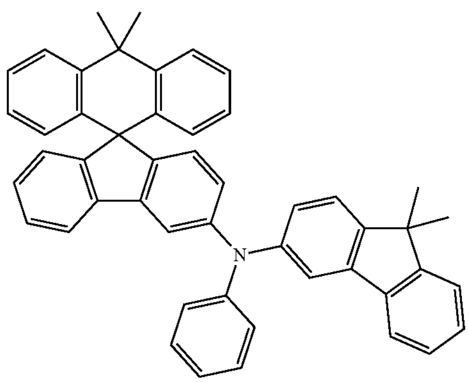
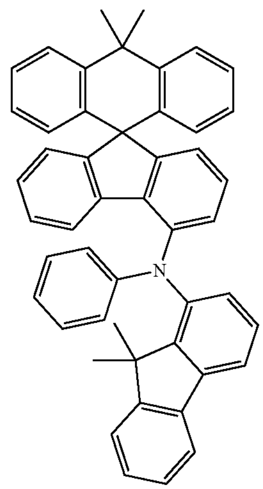
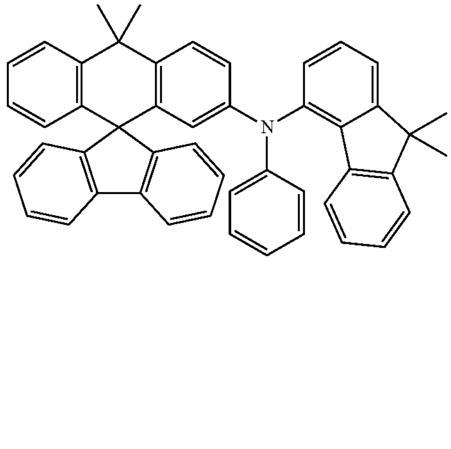
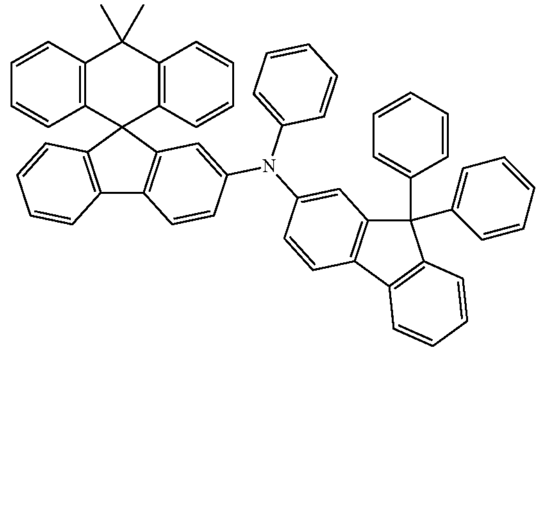

-continued
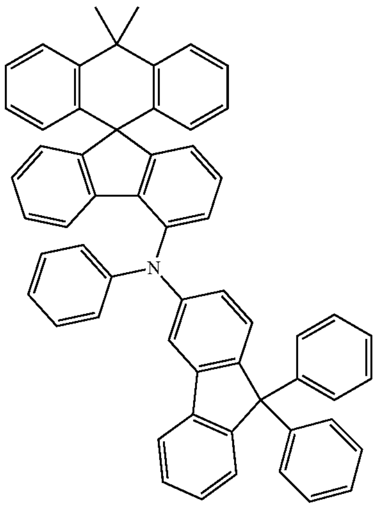
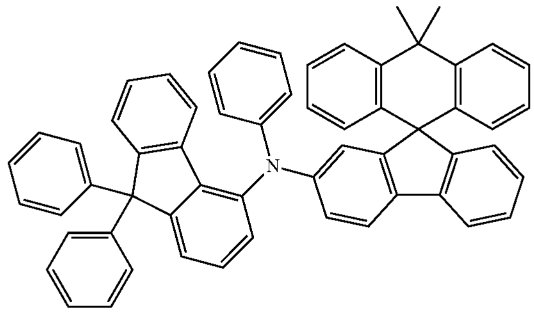
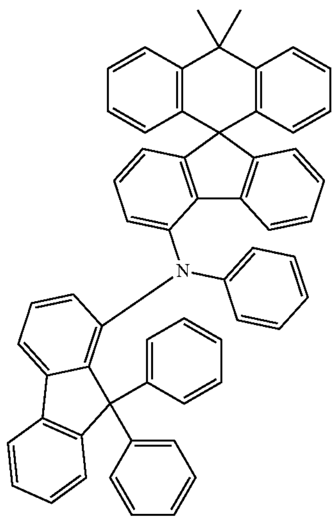
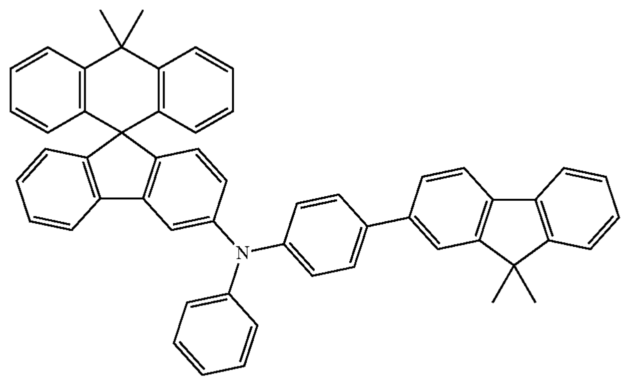
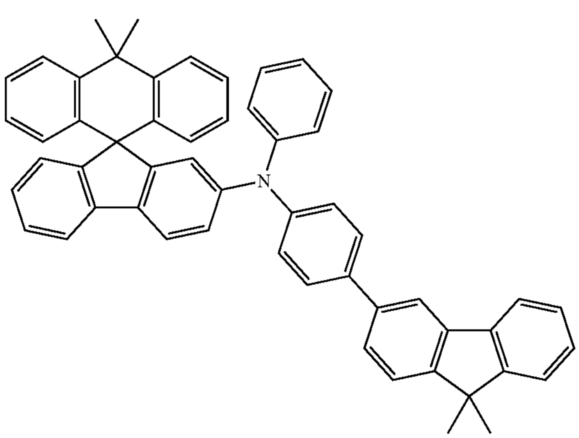

-continued
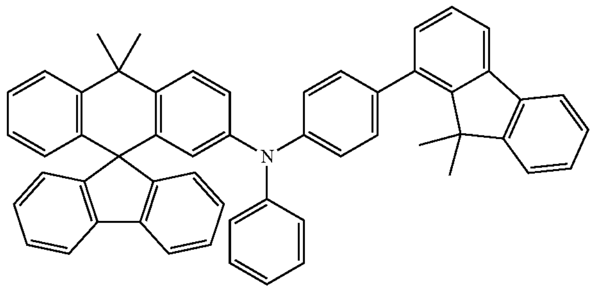
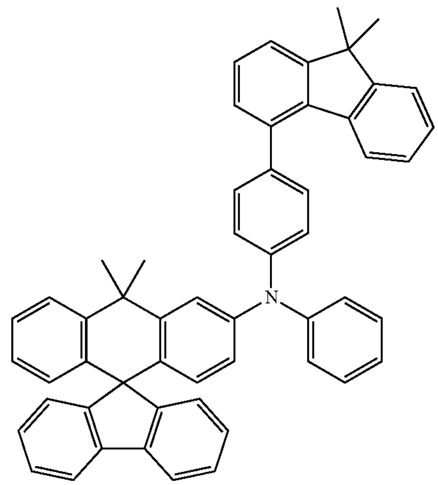
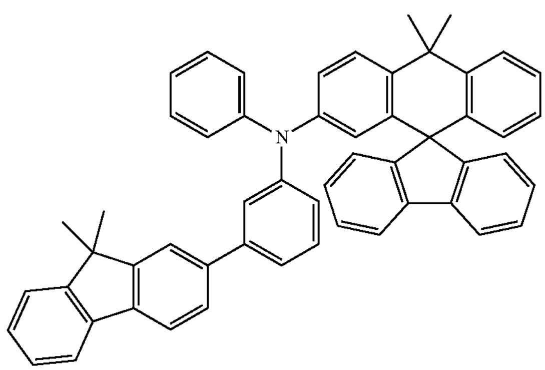
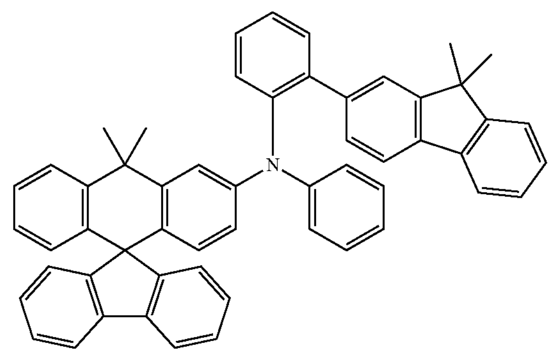
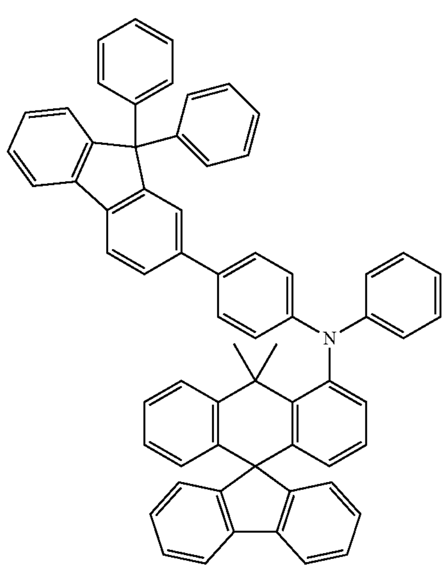
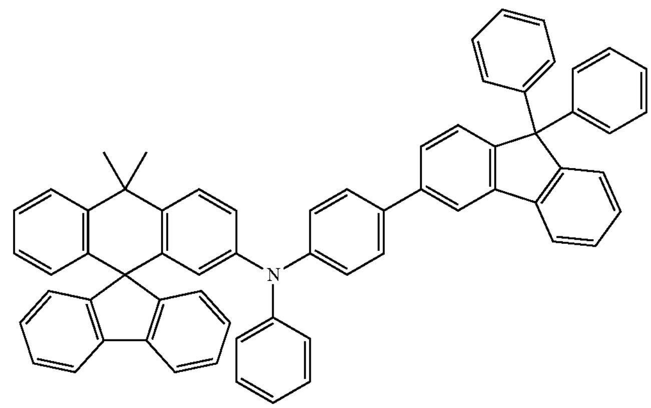

-continued
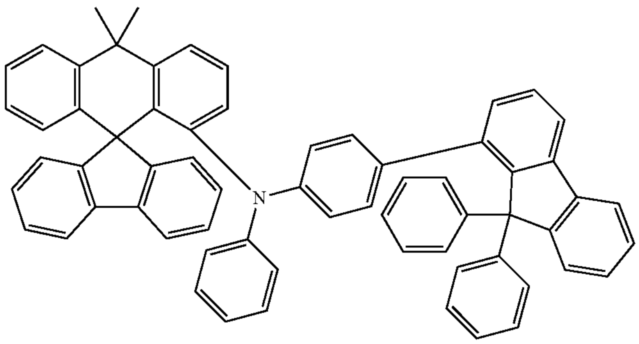
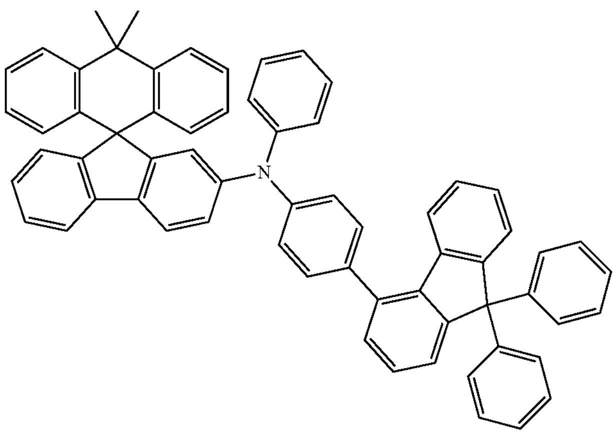
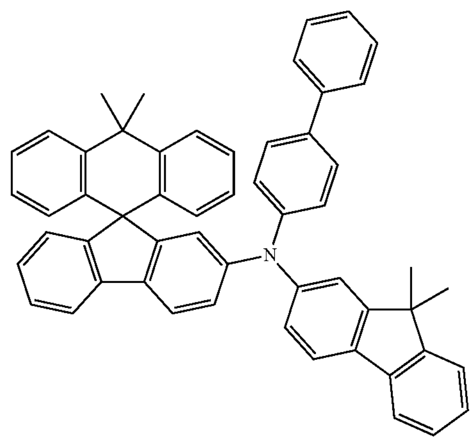
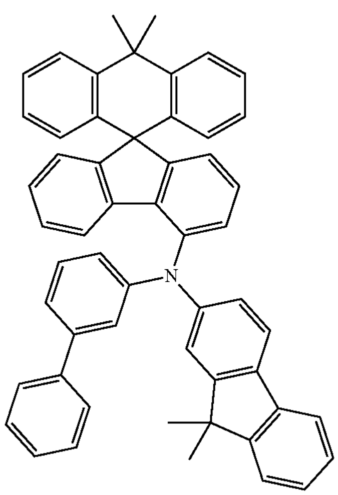
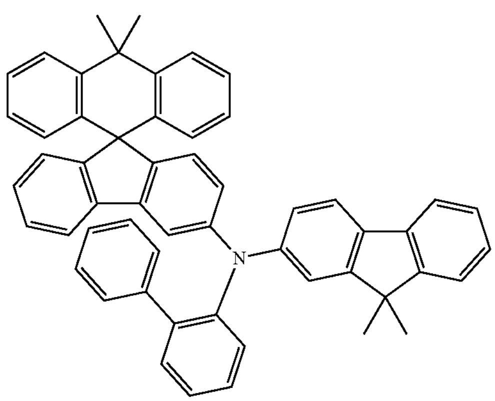

-continued
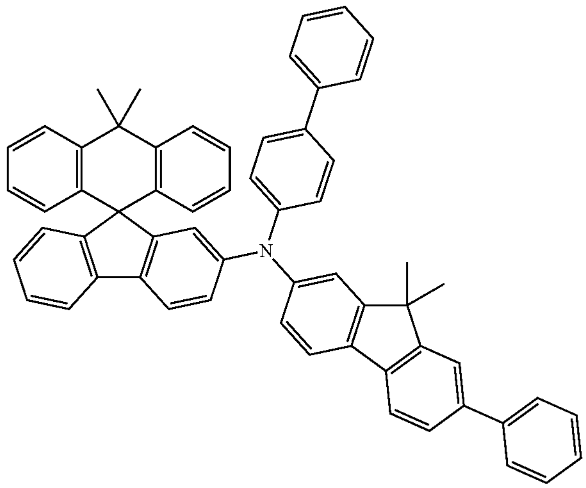
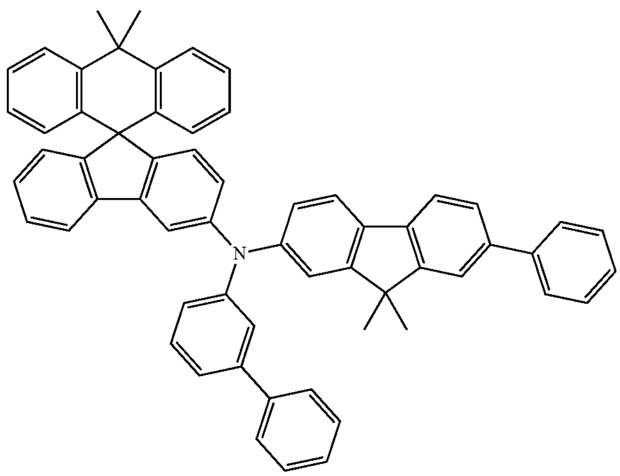
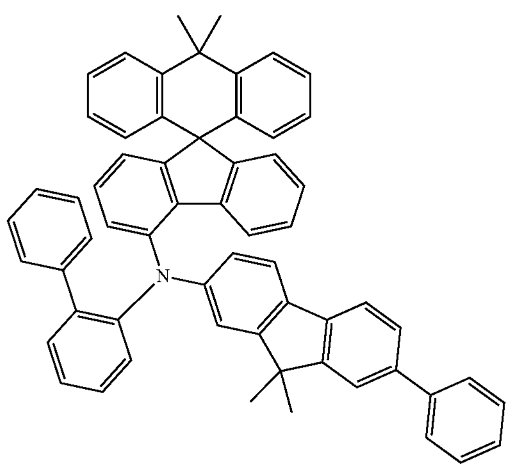
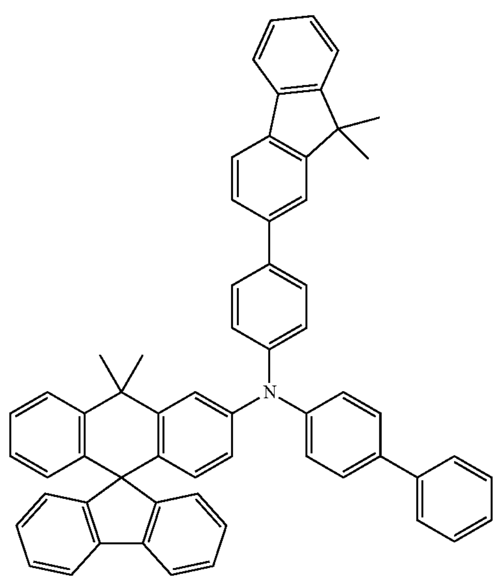

-continued
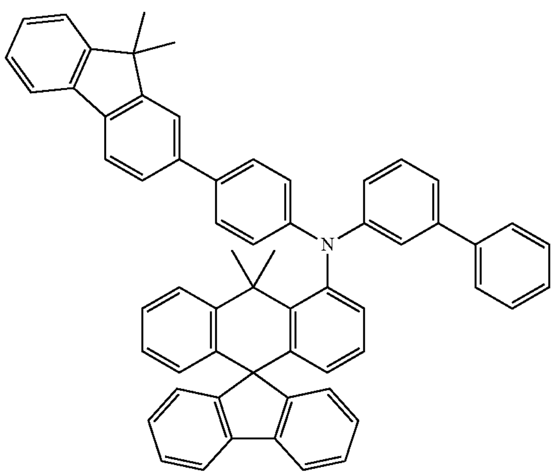
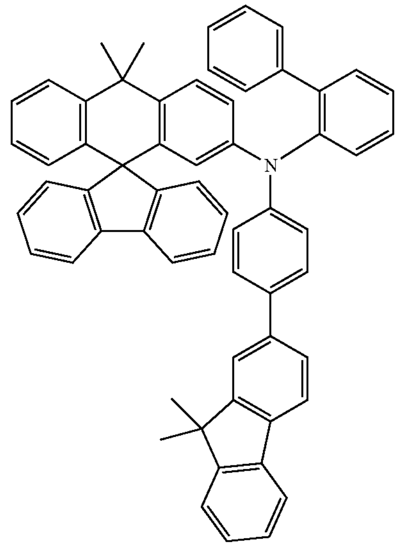
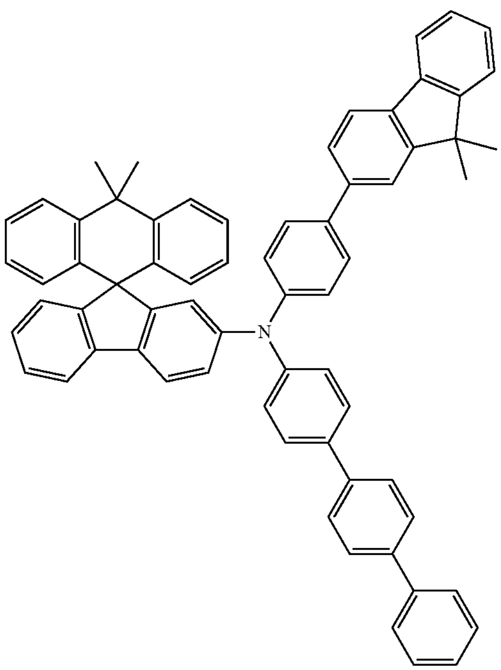
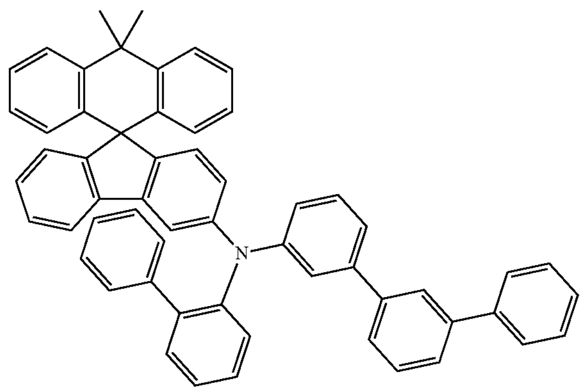
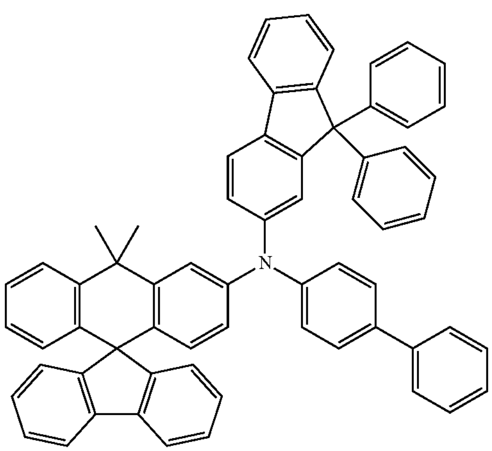
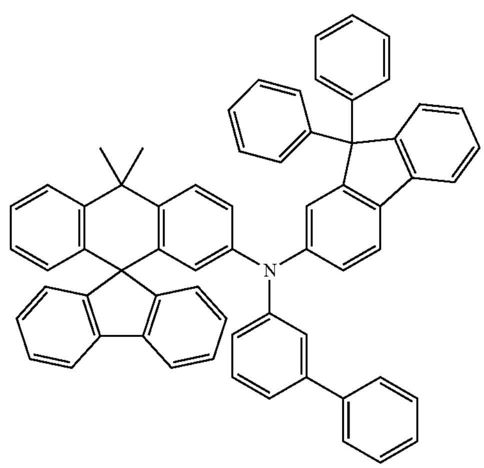

-continued
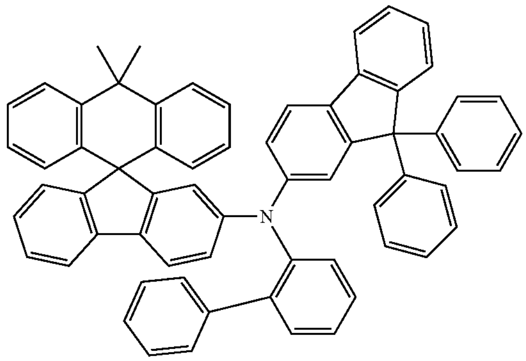
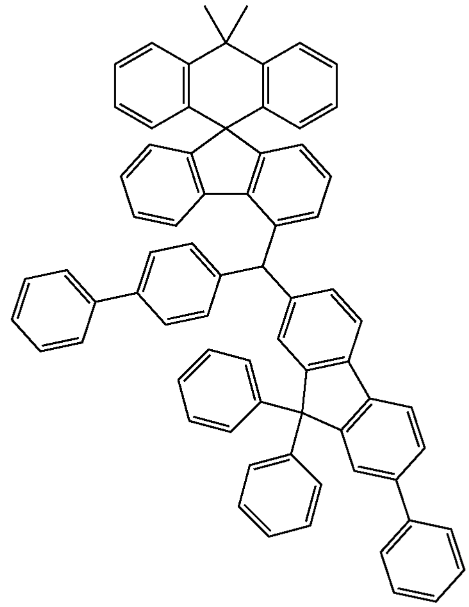
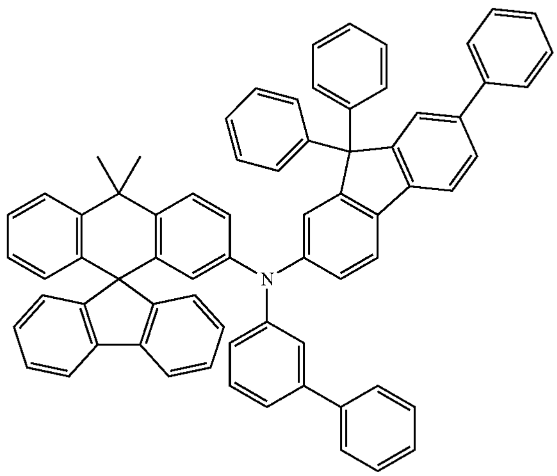
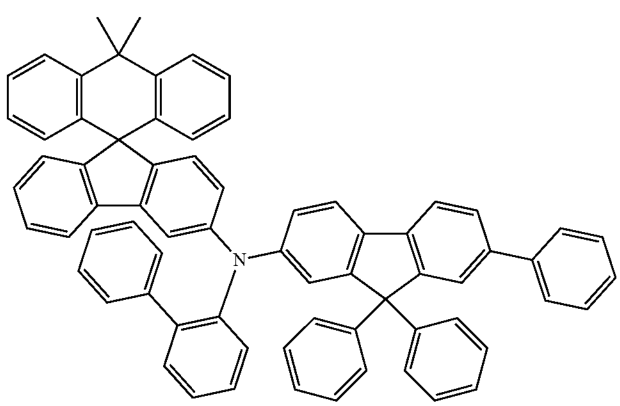

-continued
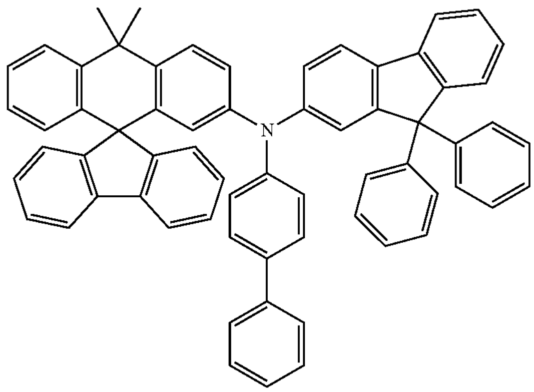
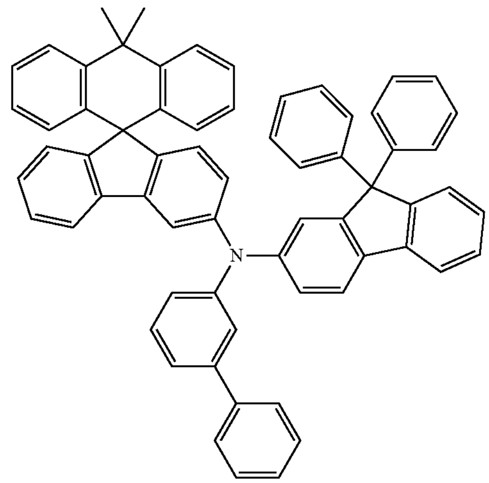
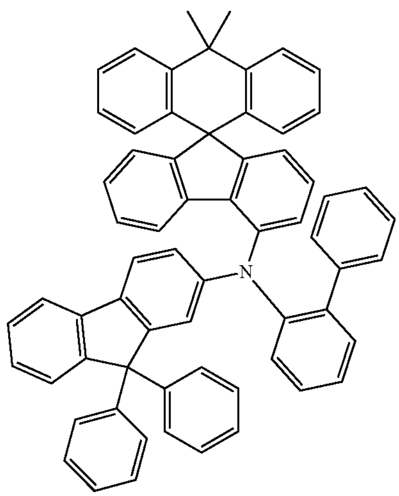
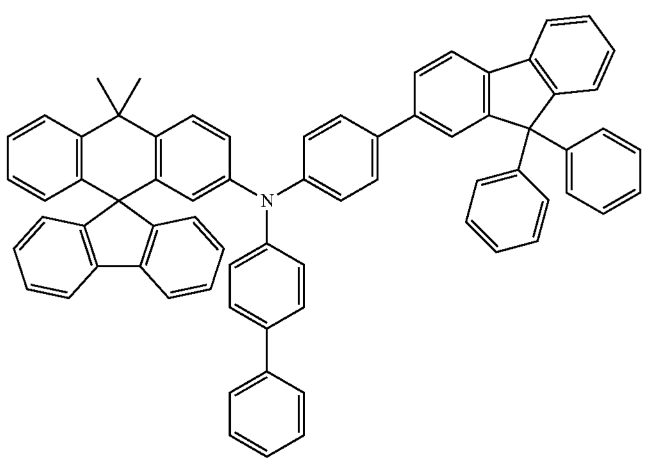
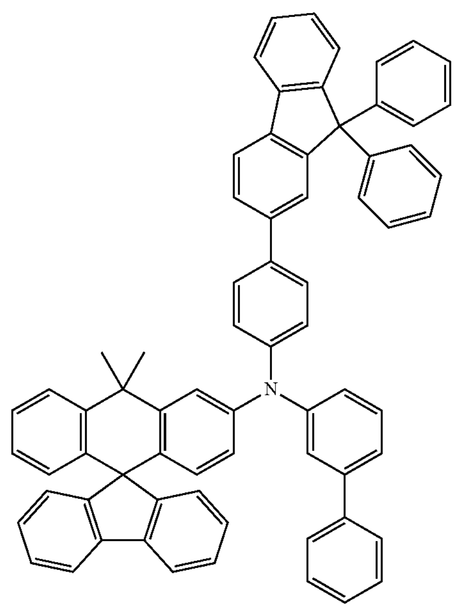

-continued
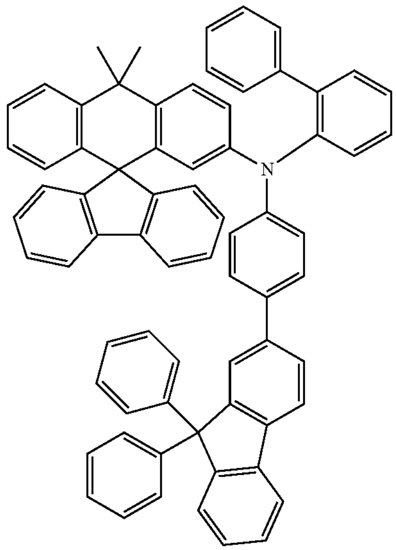
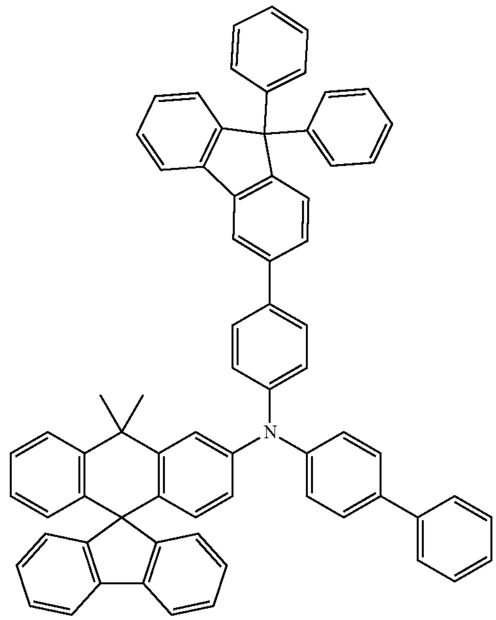
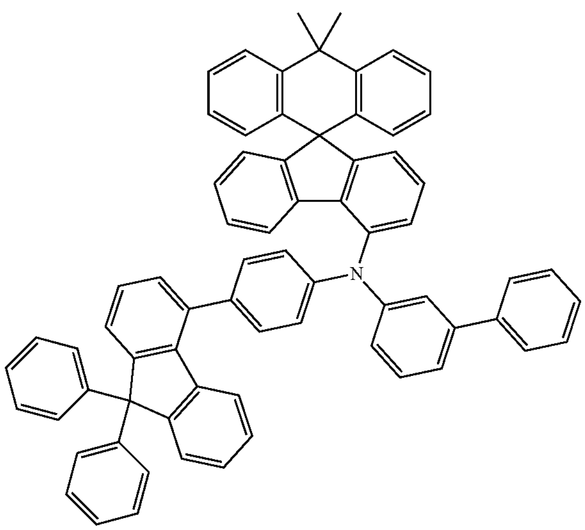
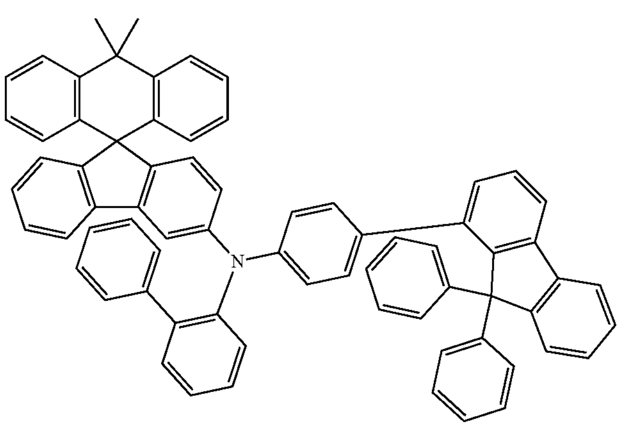

-continued
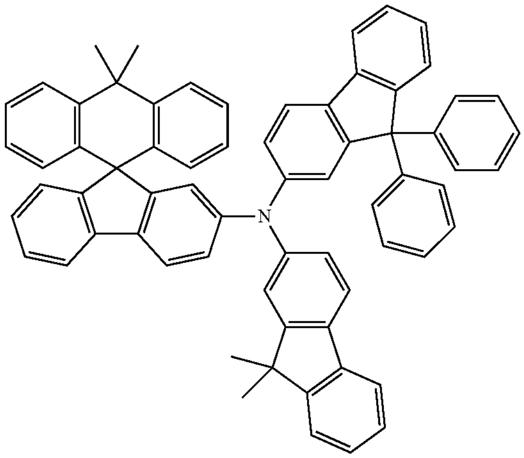
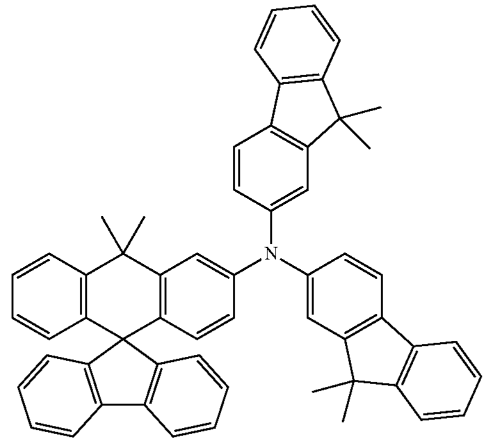
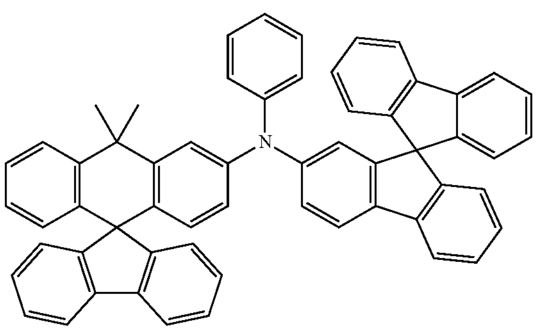
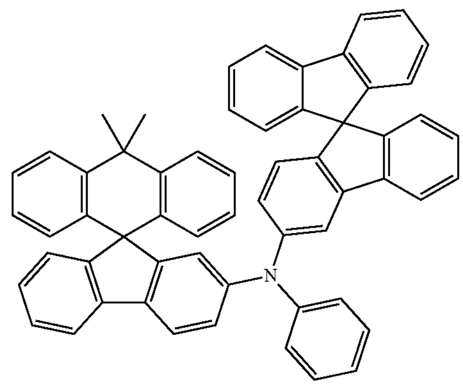
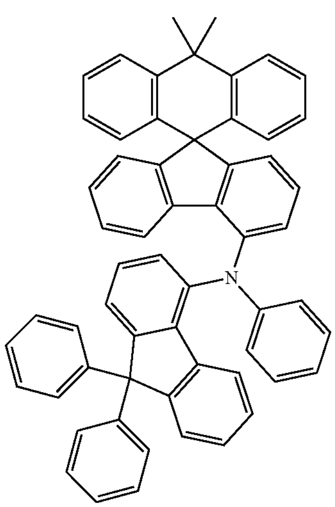
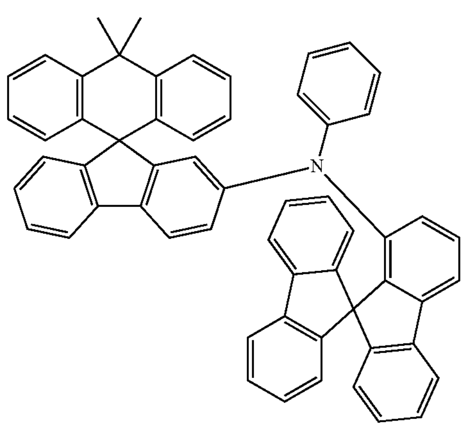

-continued
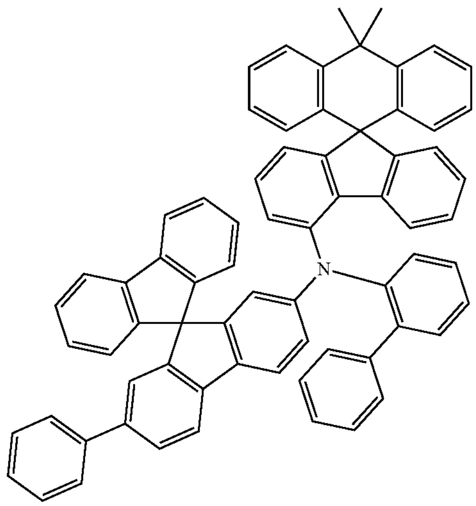
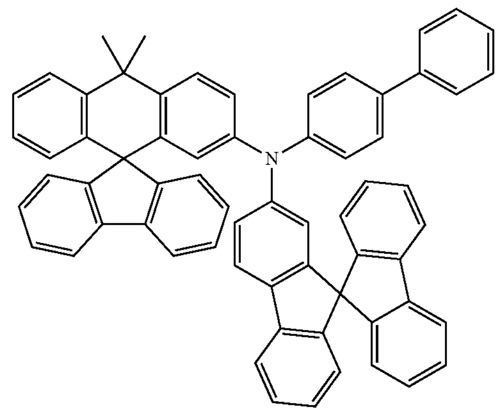
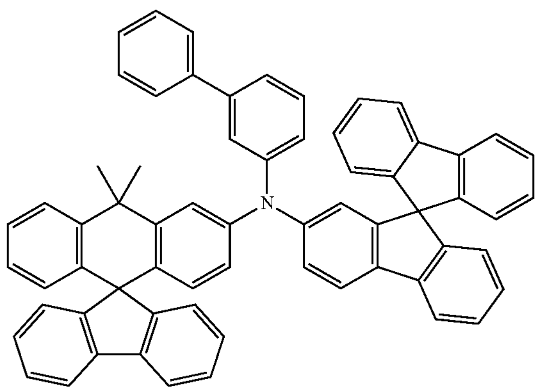
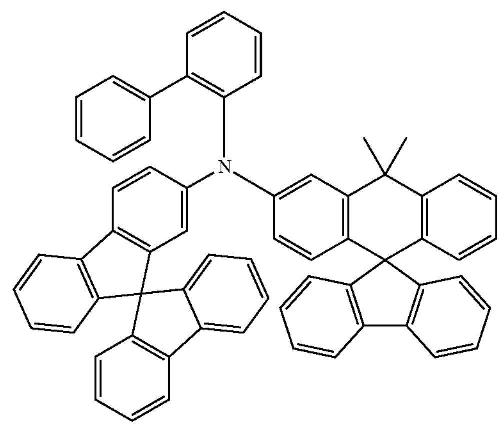
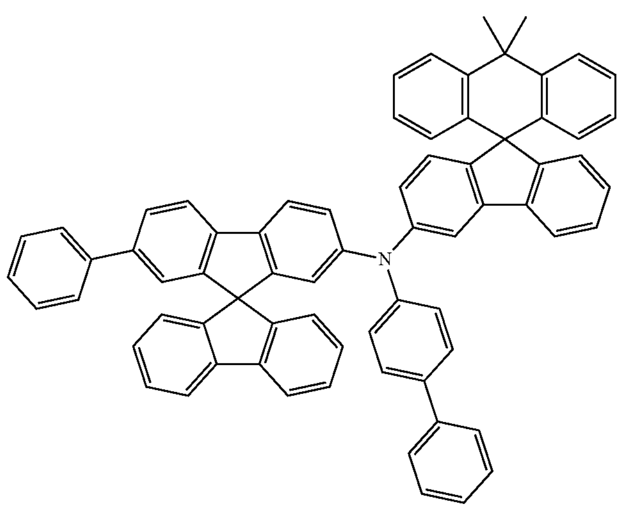

-continued
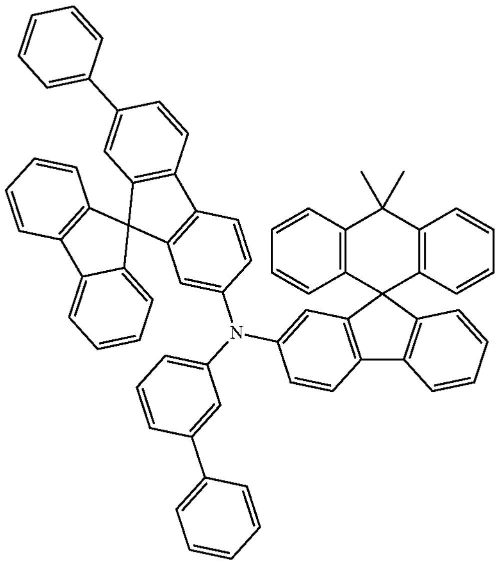
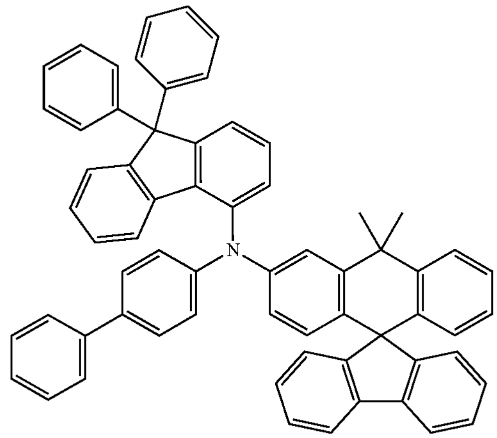
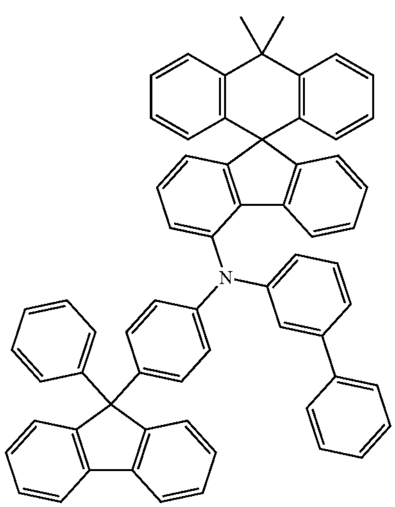
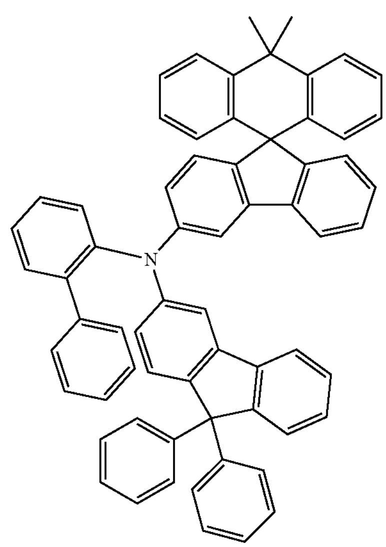

-continued
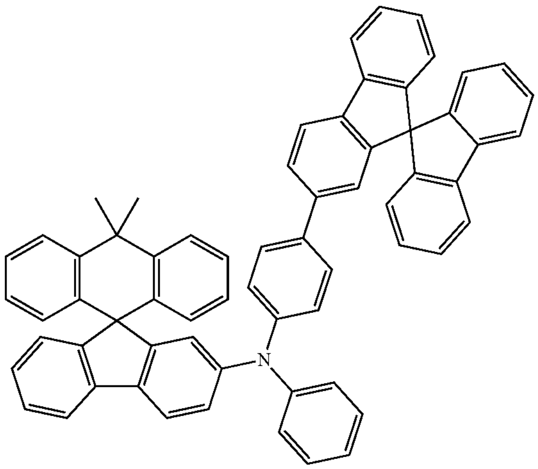
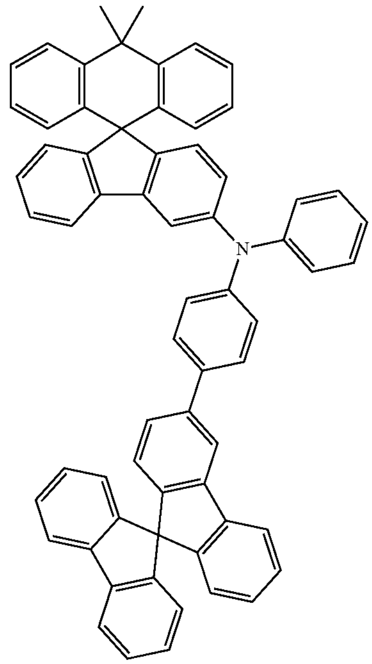
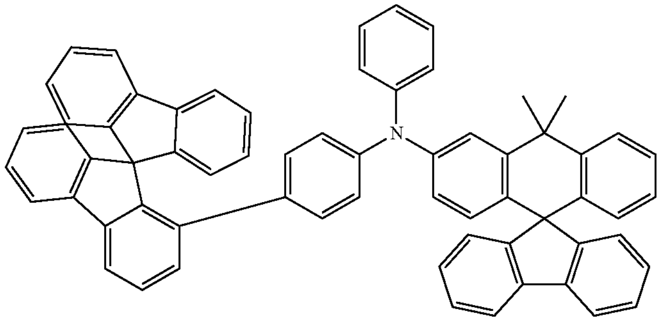
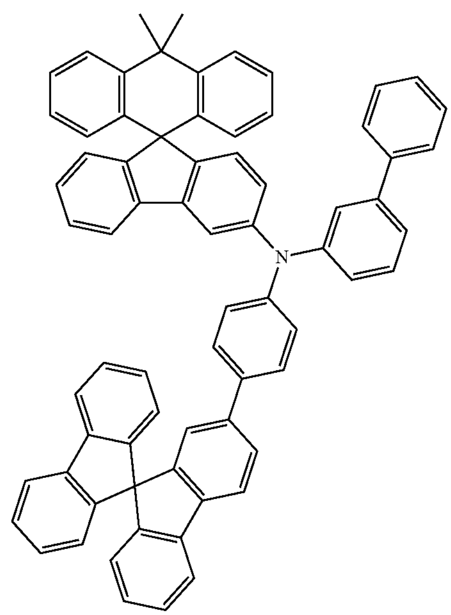

-continued
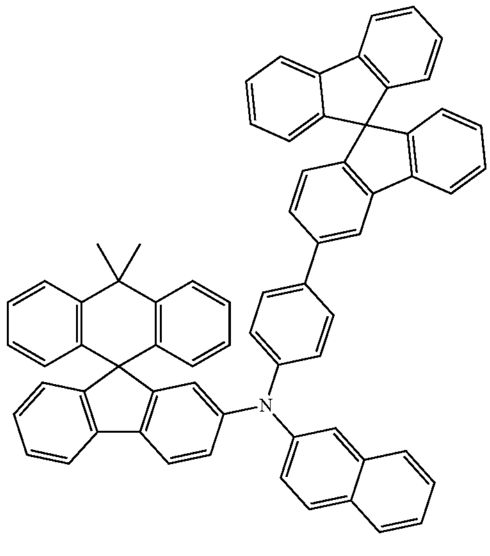
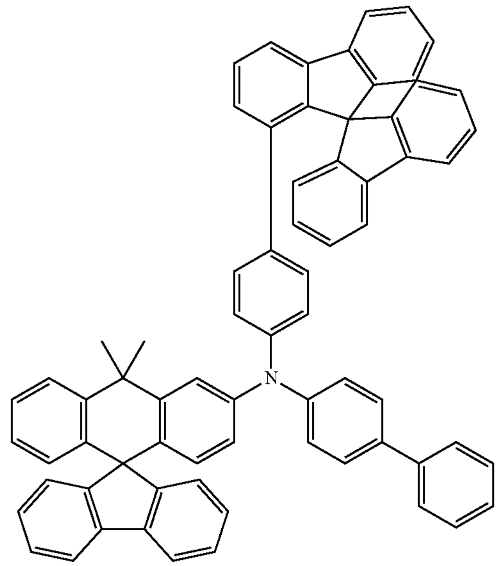
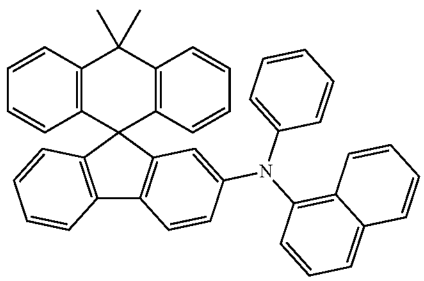
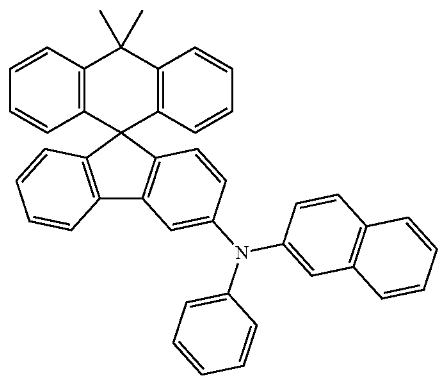
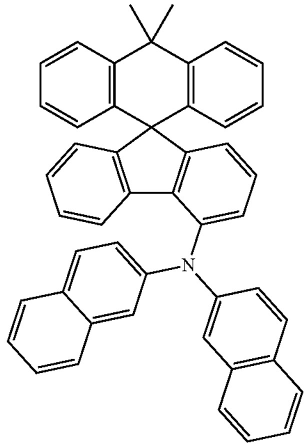
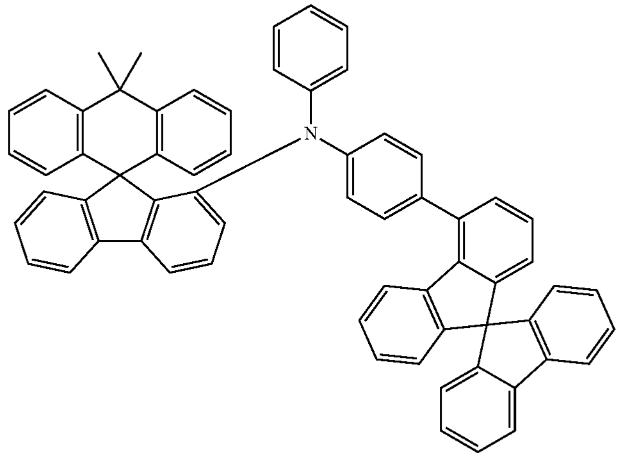

-continued
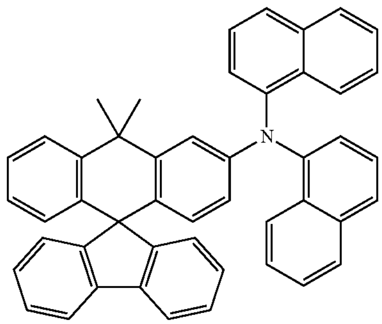
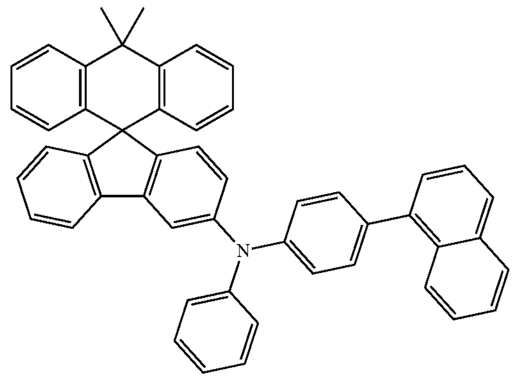
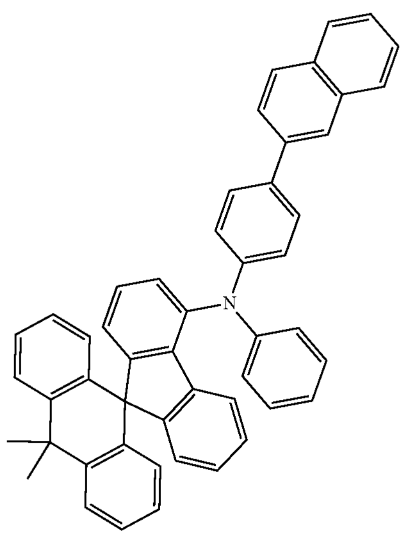
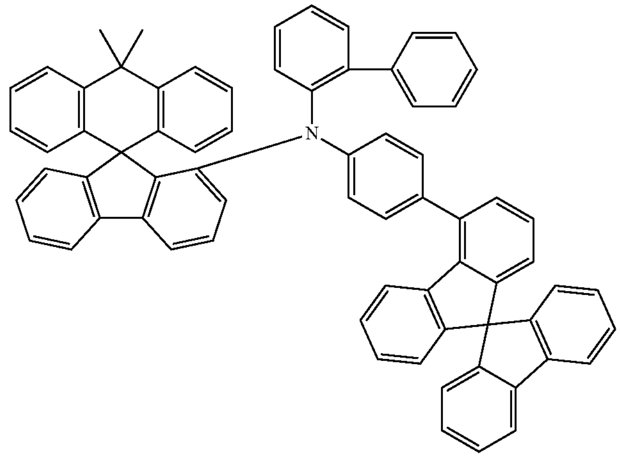
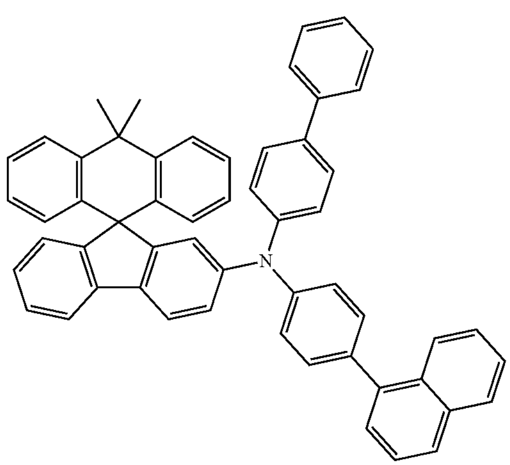
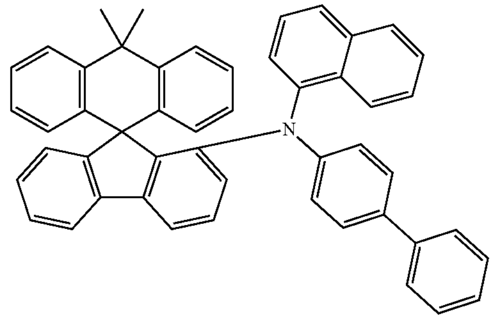

-continued
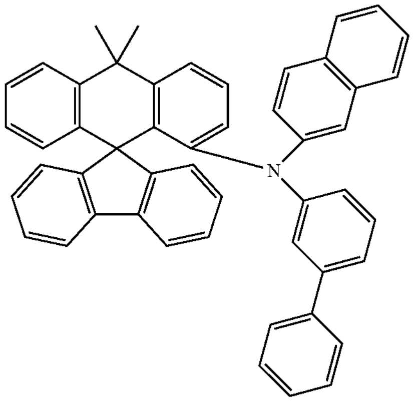
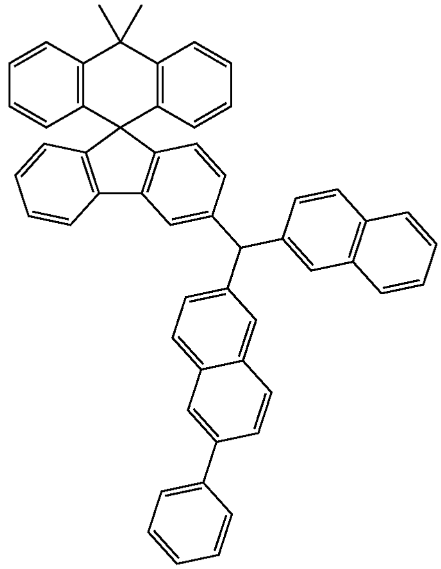
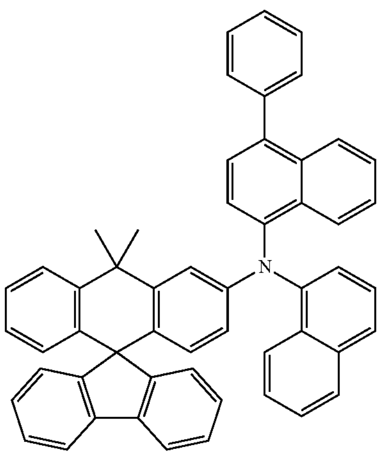
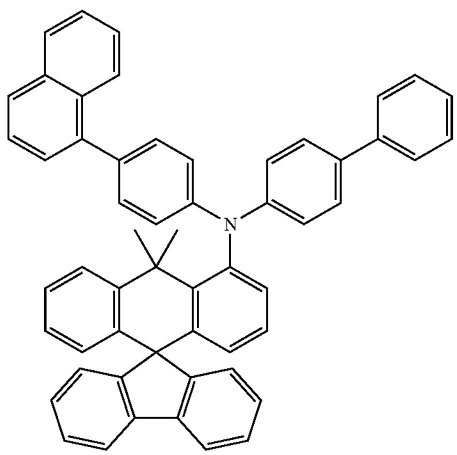
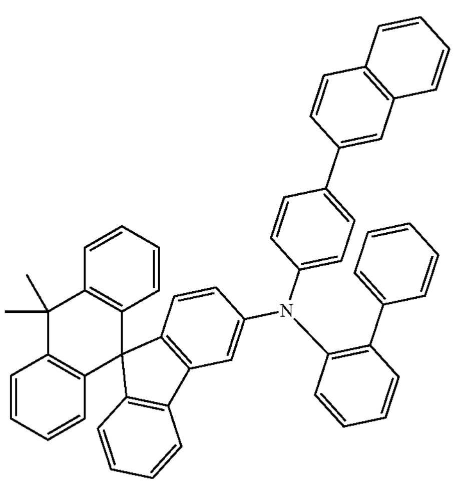
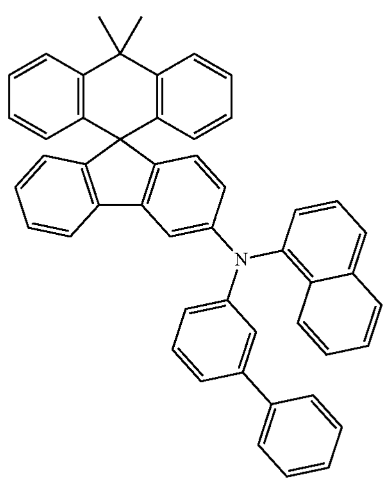

-continued
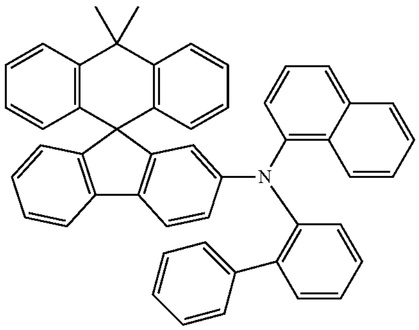
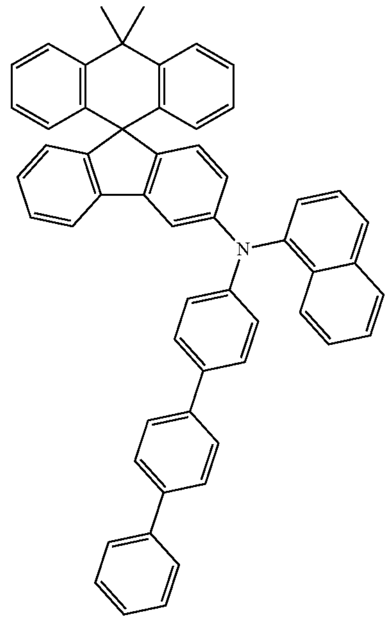
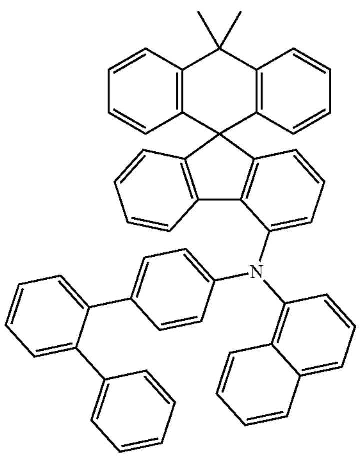
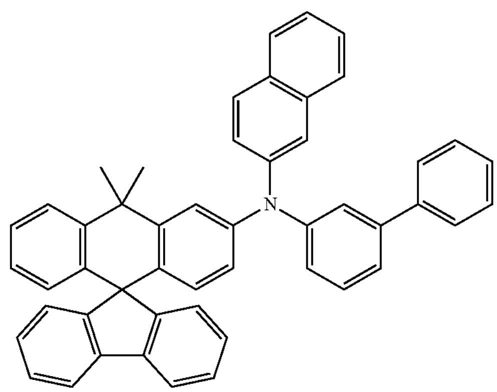
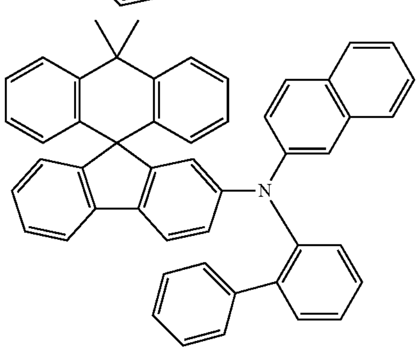
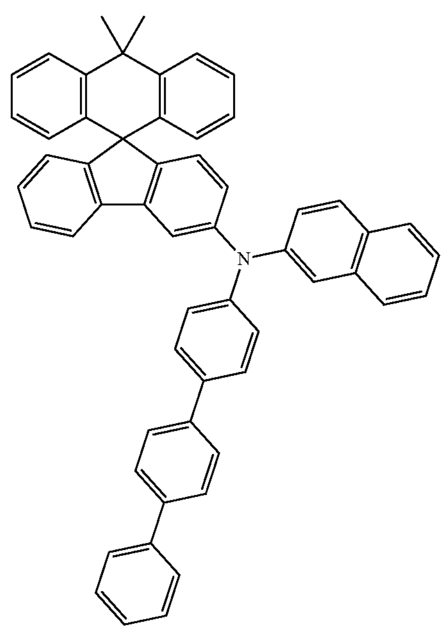

-continued
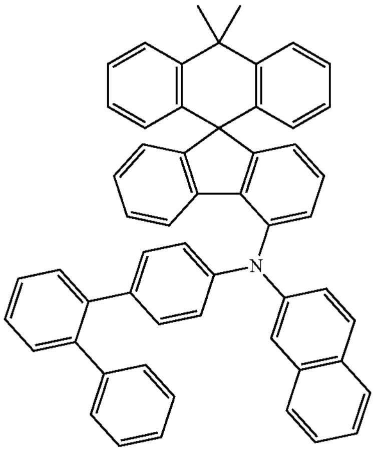
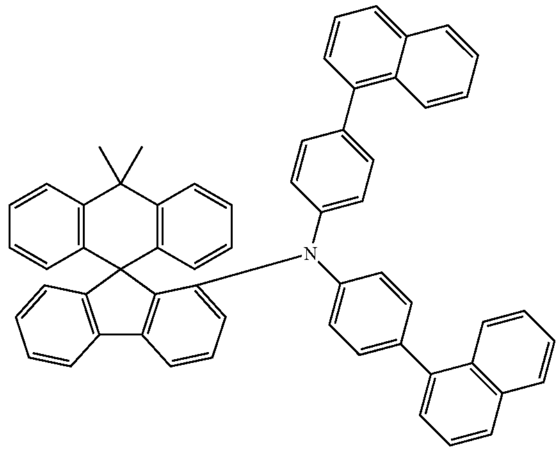
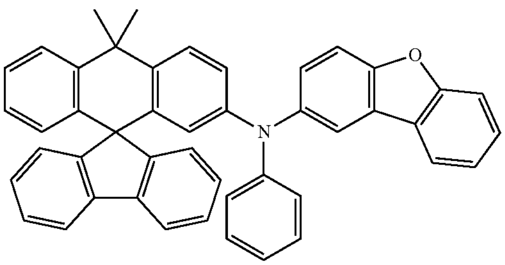
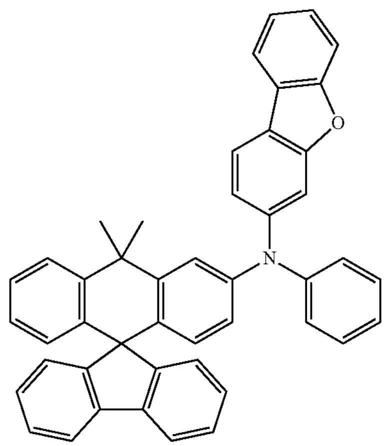
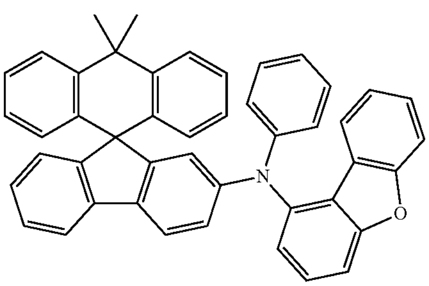
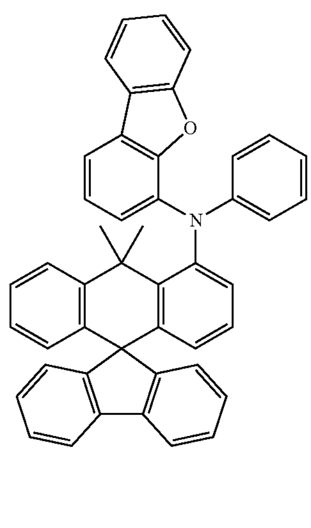

-continued
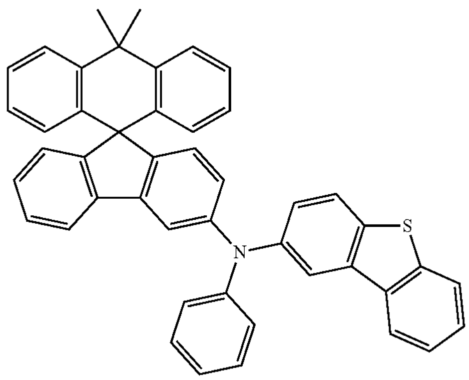
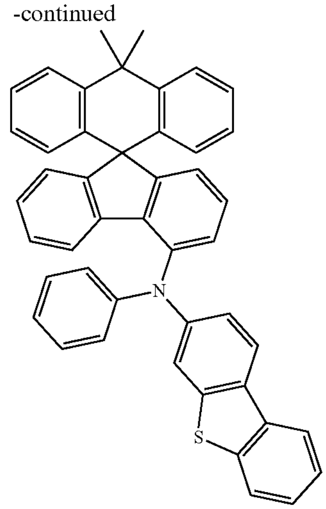
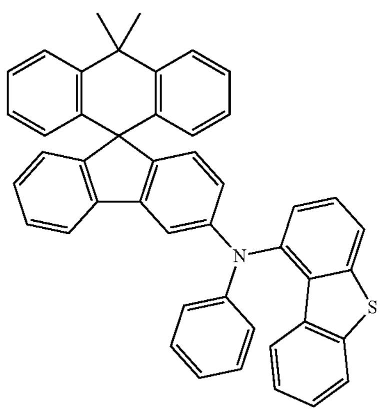
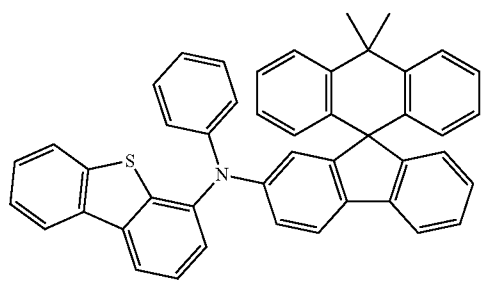
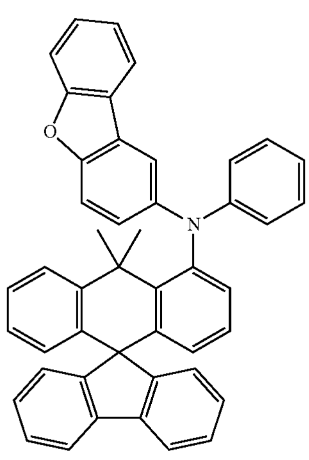

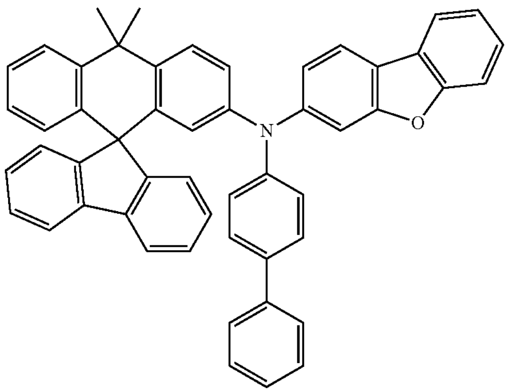
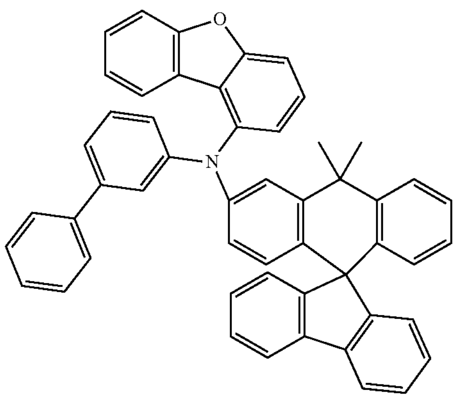
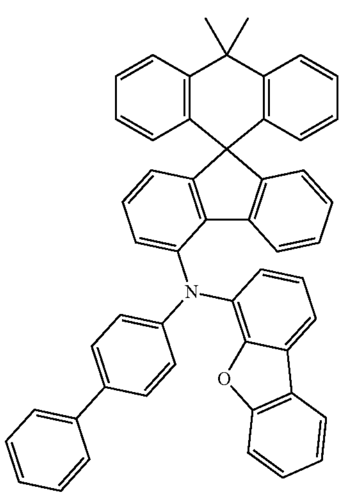
-continued
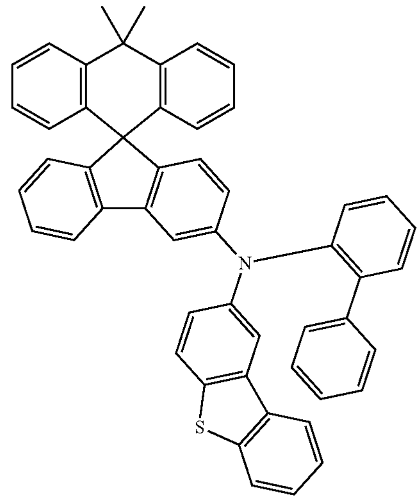
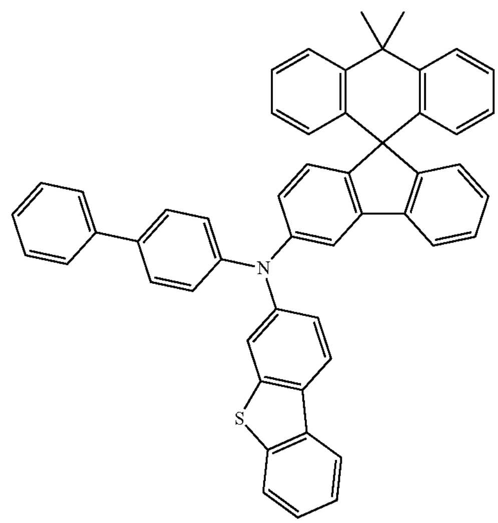
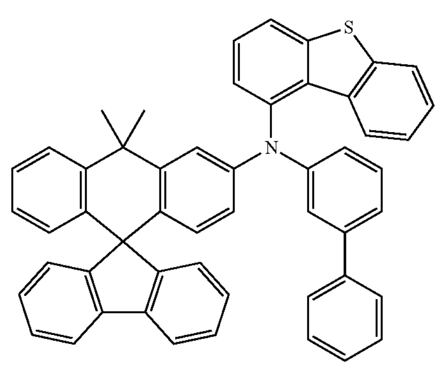

-continued
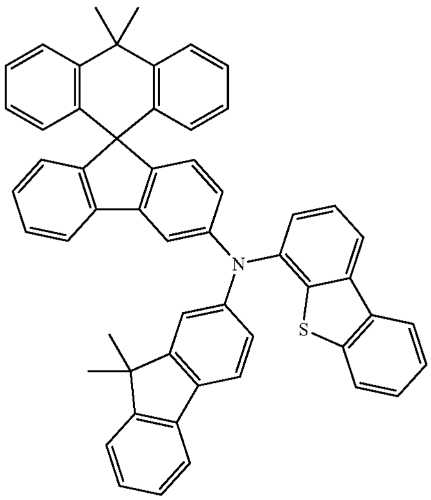
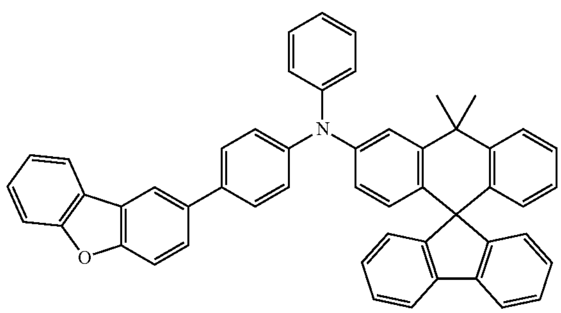
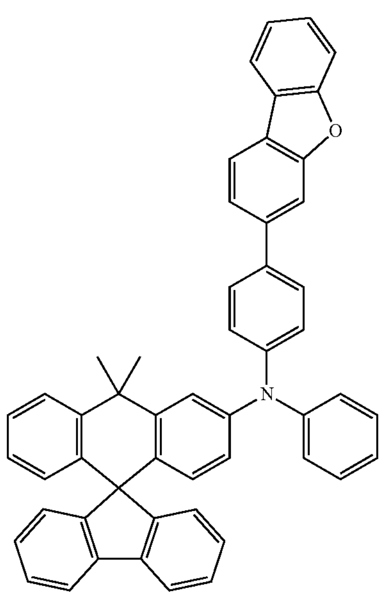
-continued
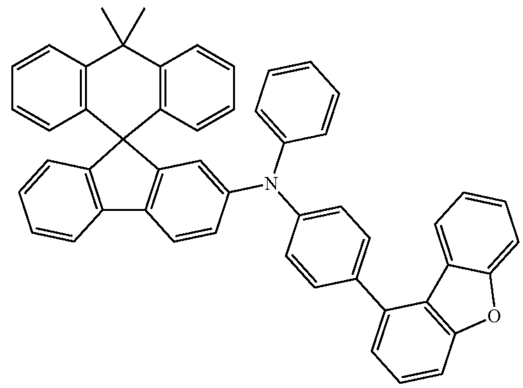
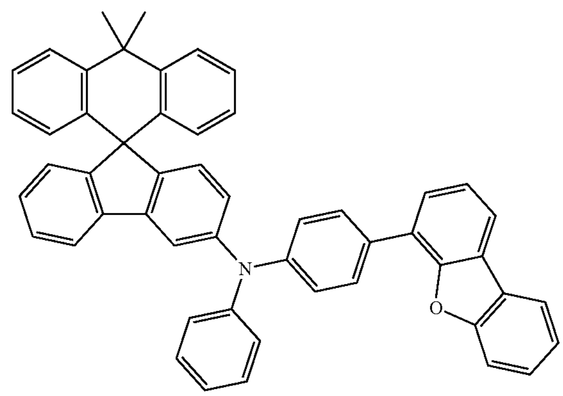
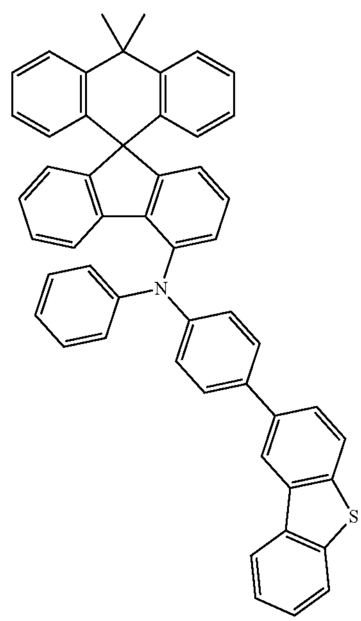
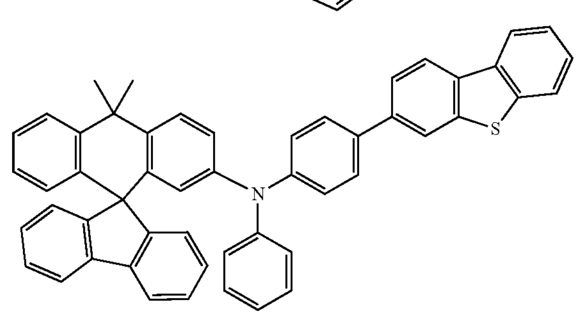

-continued
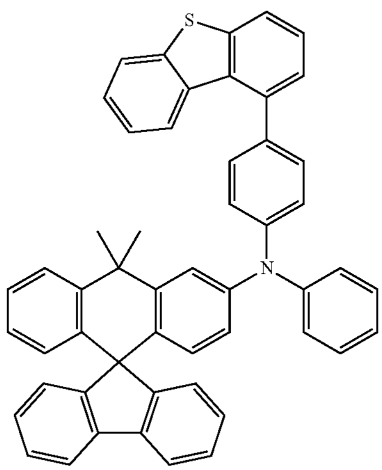
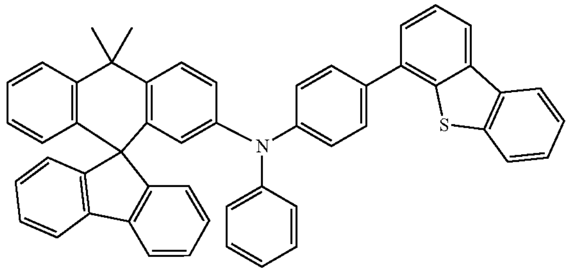
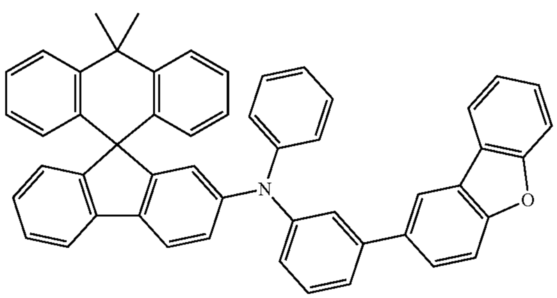
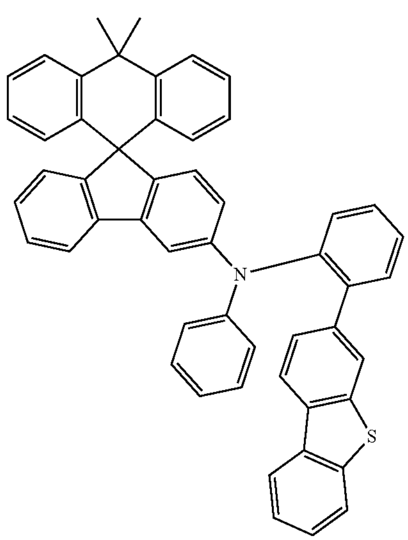
-continued
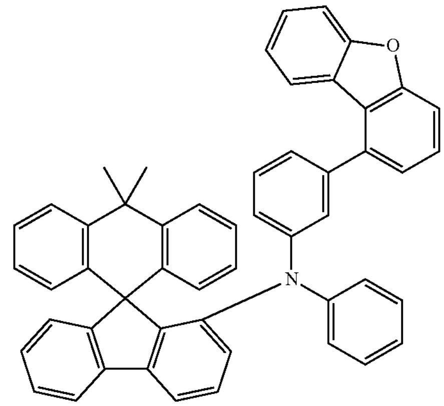
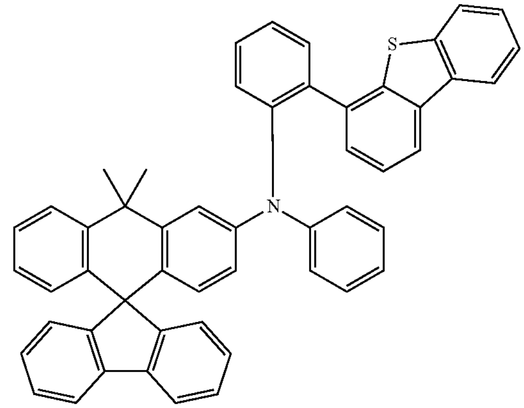
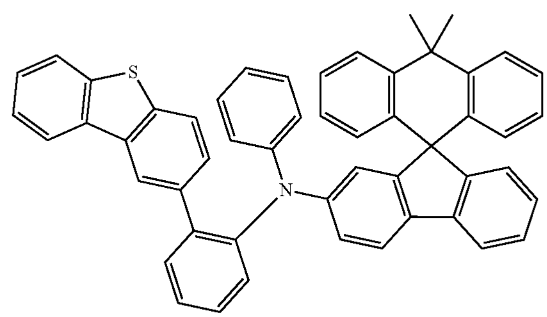
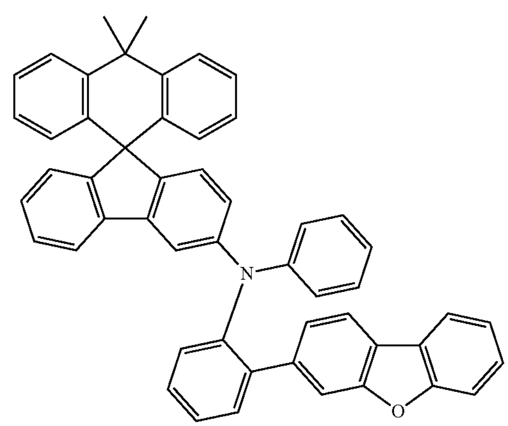

-continued
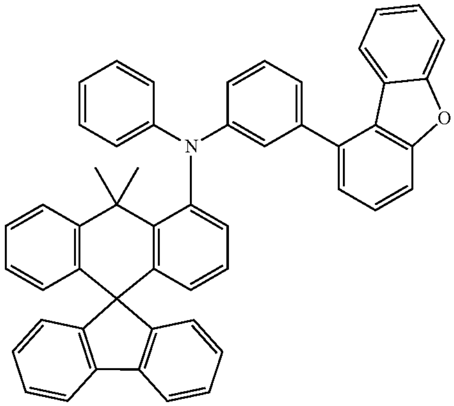
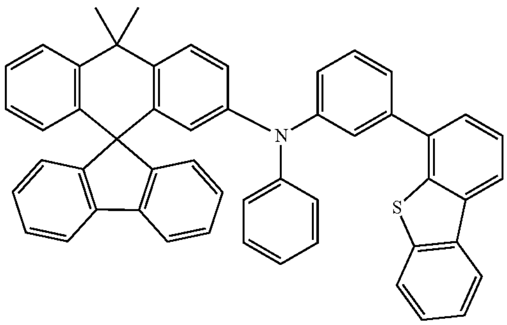
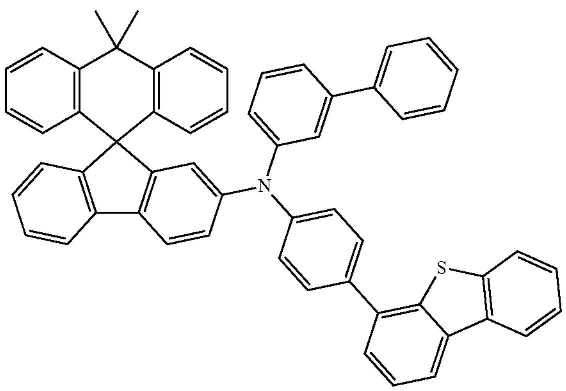
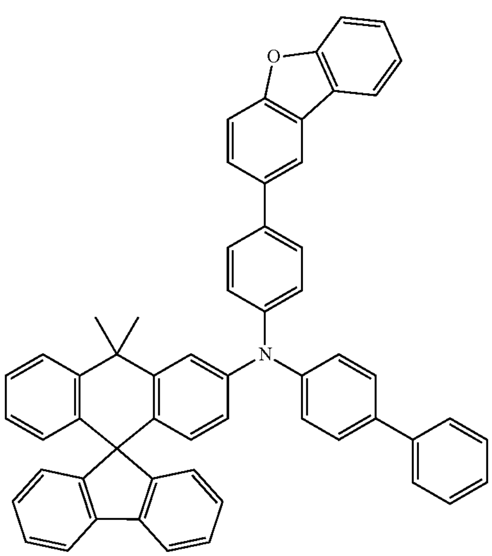
-continued
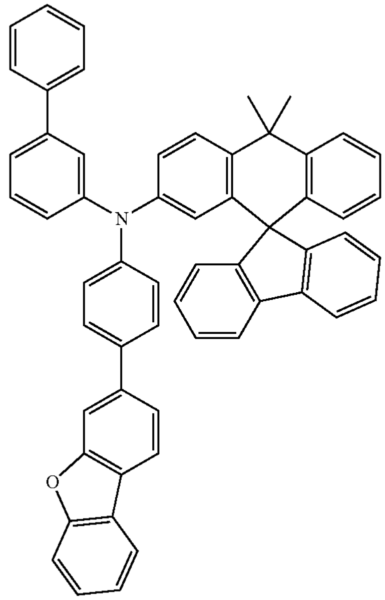
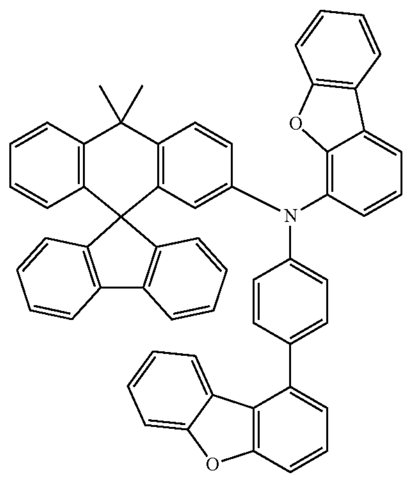
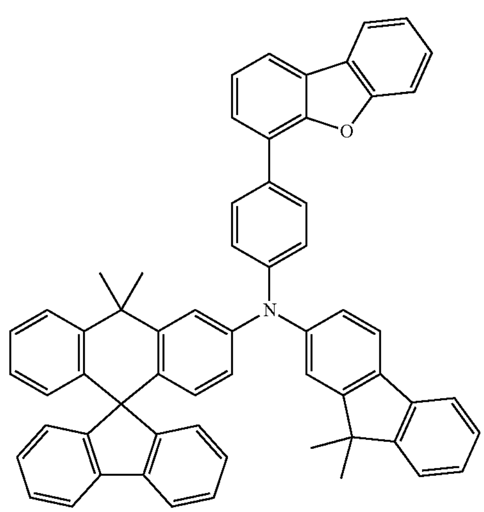

-continued
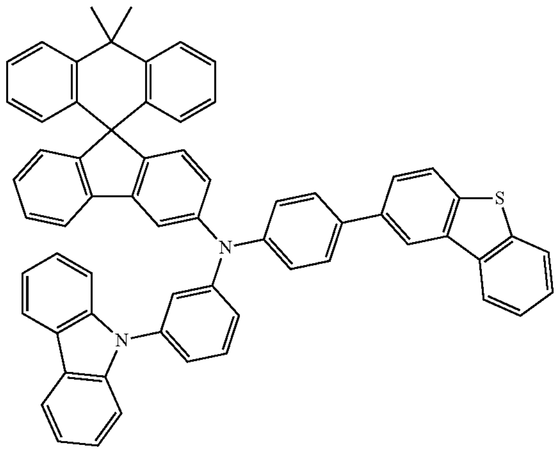
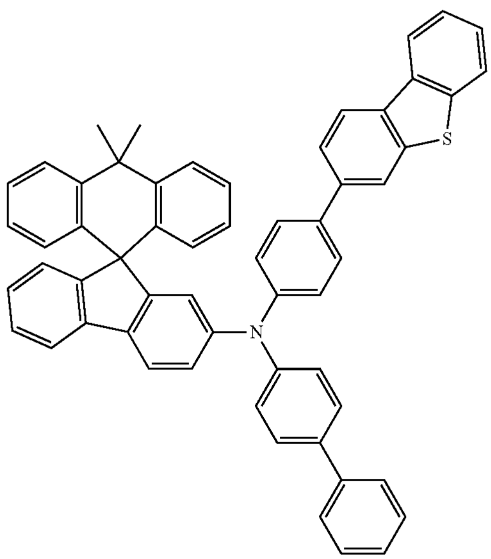
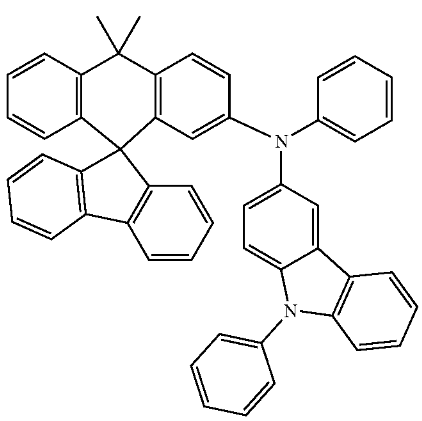
-continued
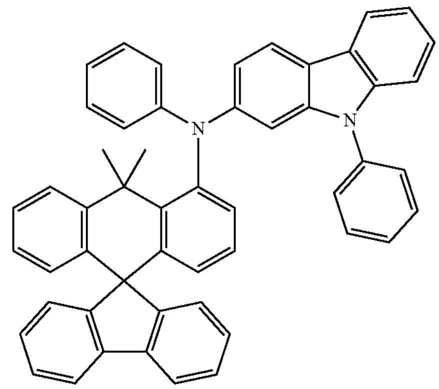
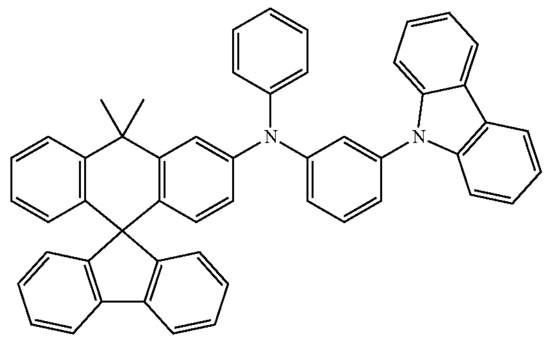
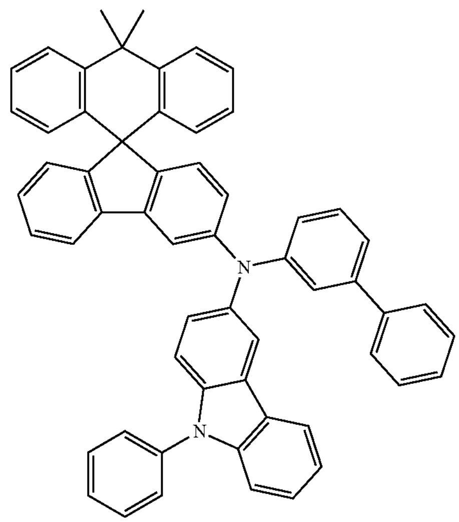
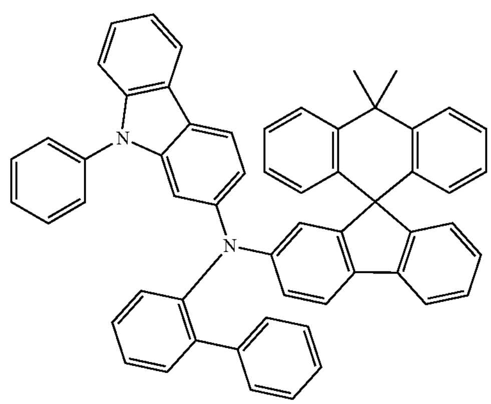

-continued
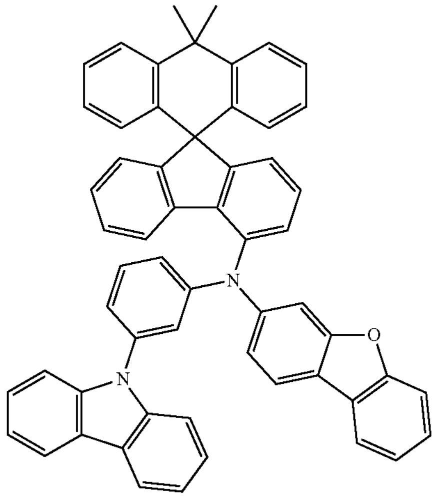
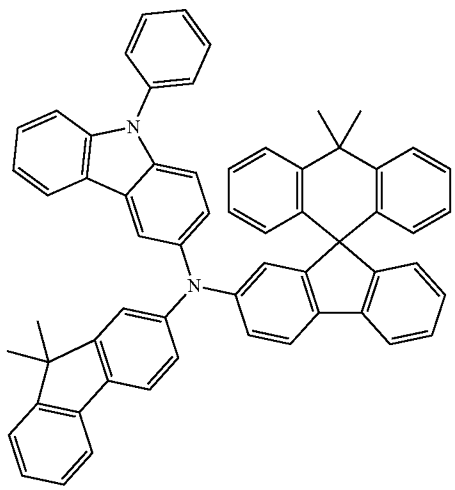
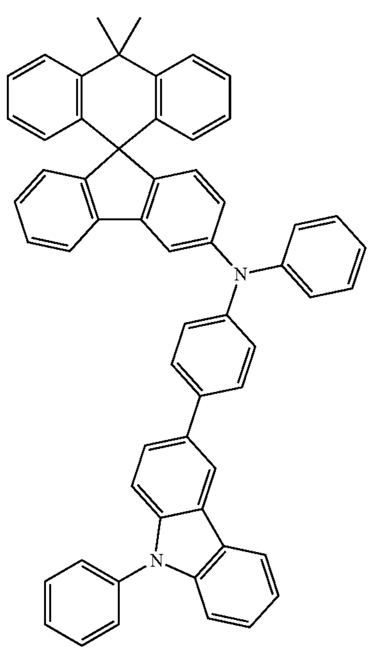
-continued
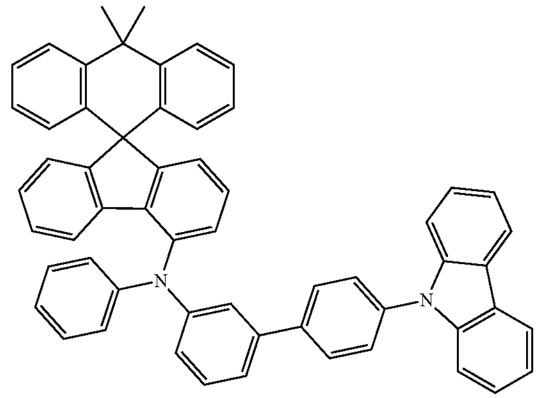
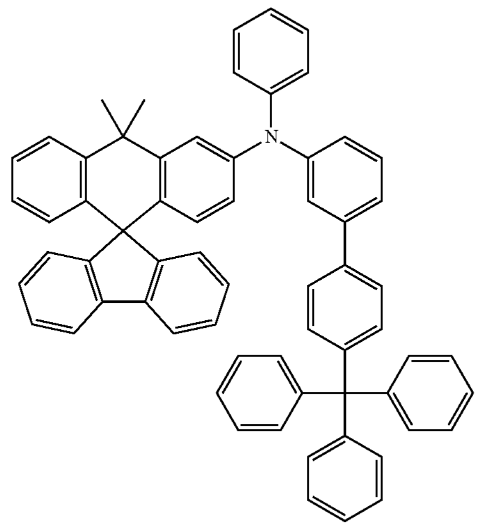
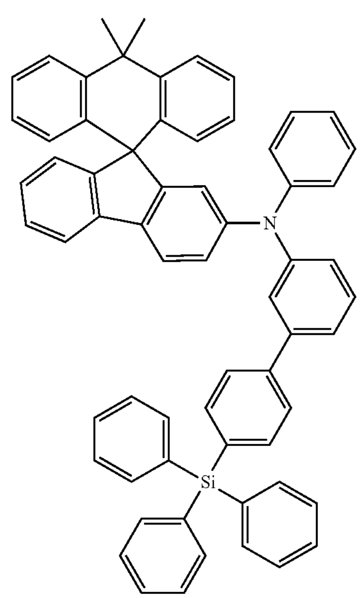

-continued
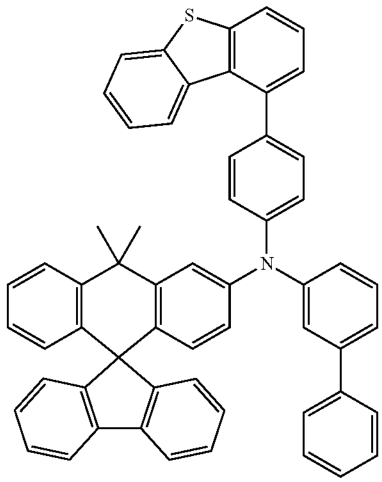
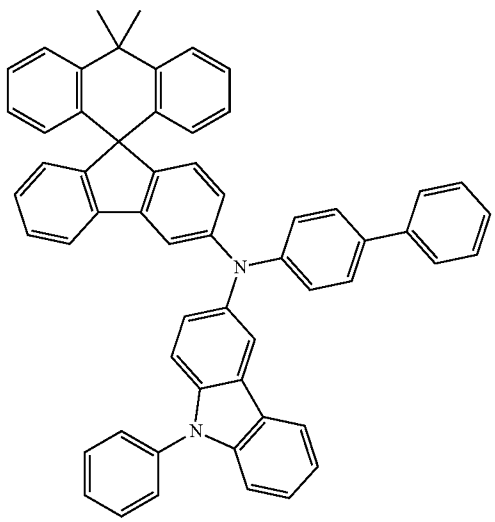
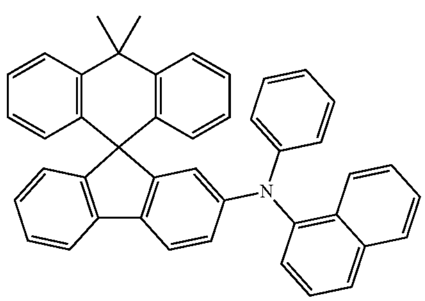
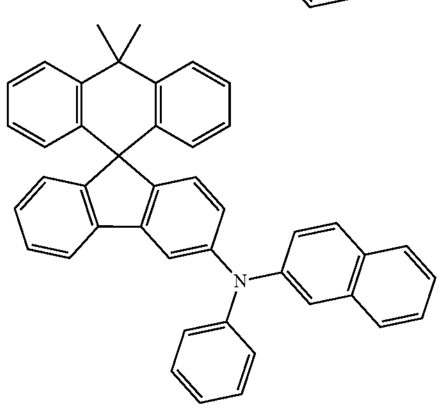
-continued
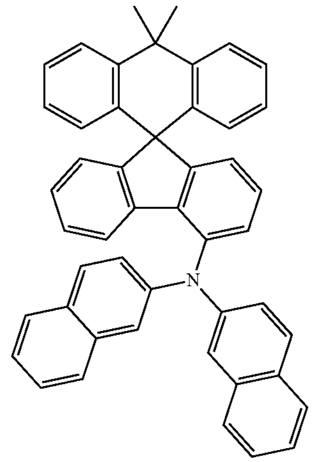
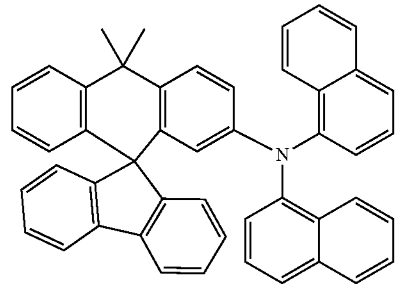
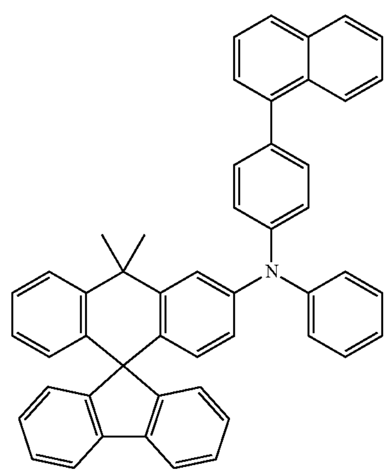
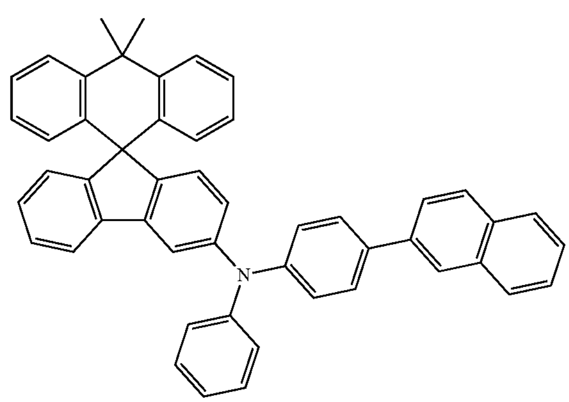

-continued
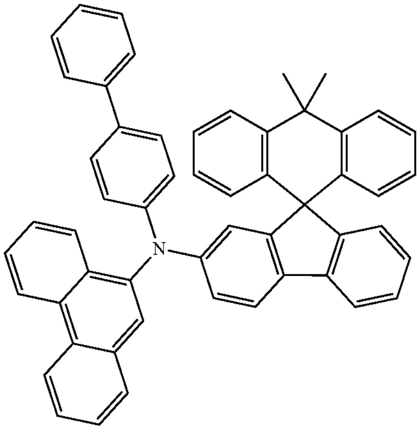
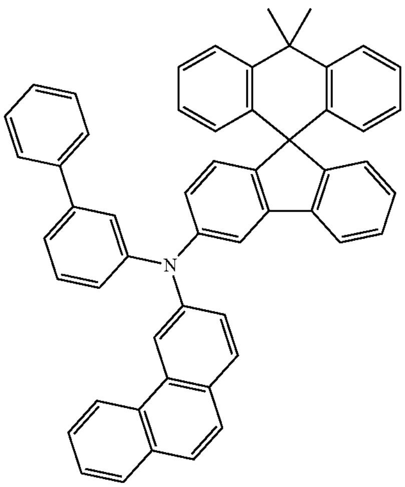
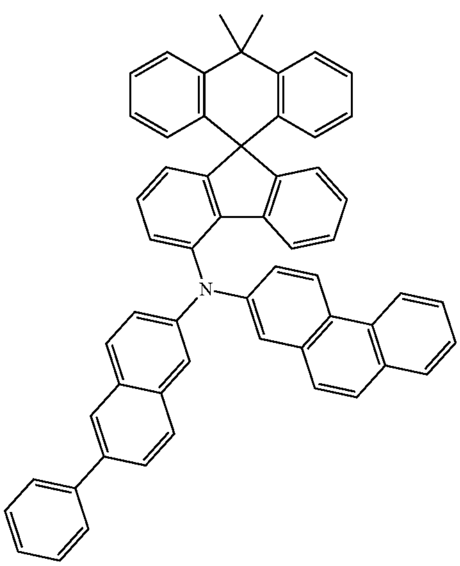
-continued
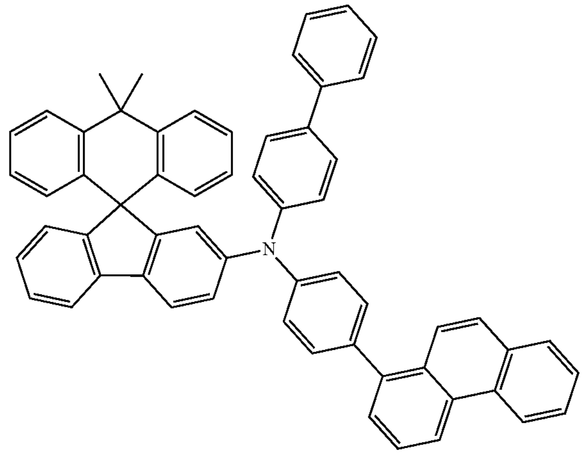
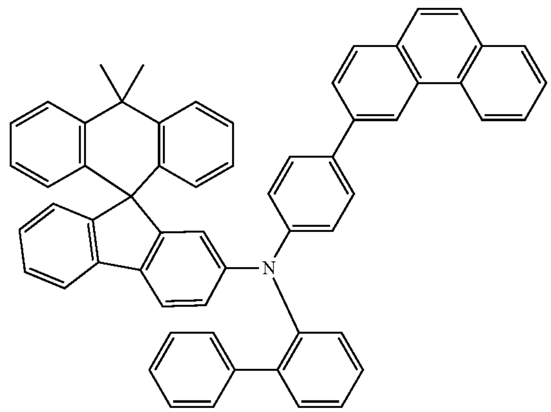
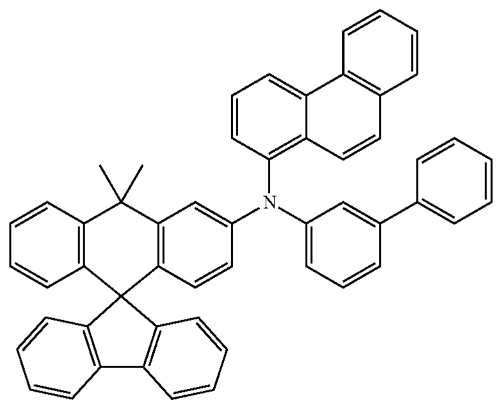
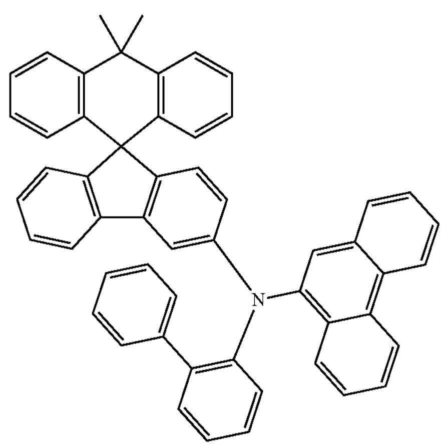

-continued
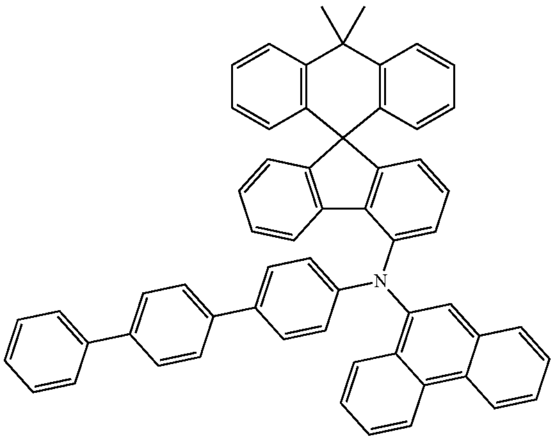
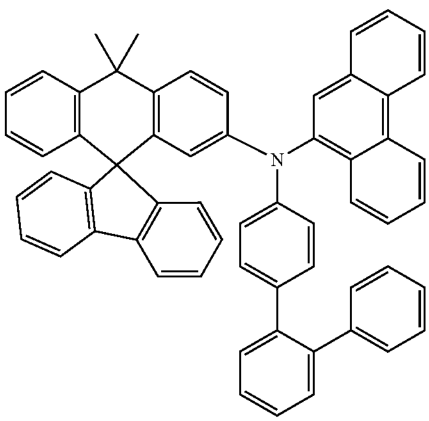
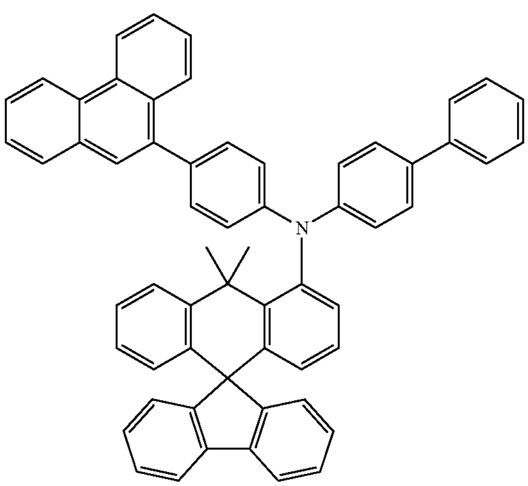
-continued
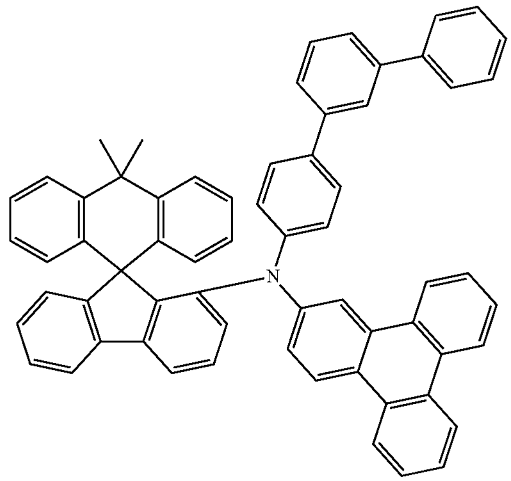
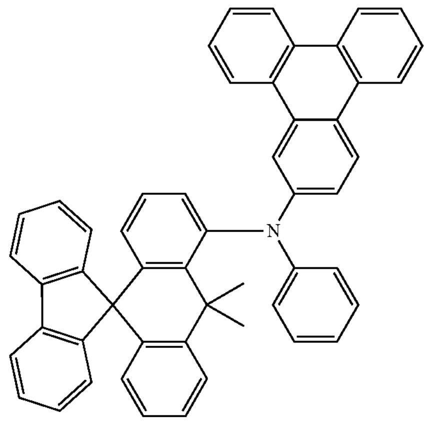
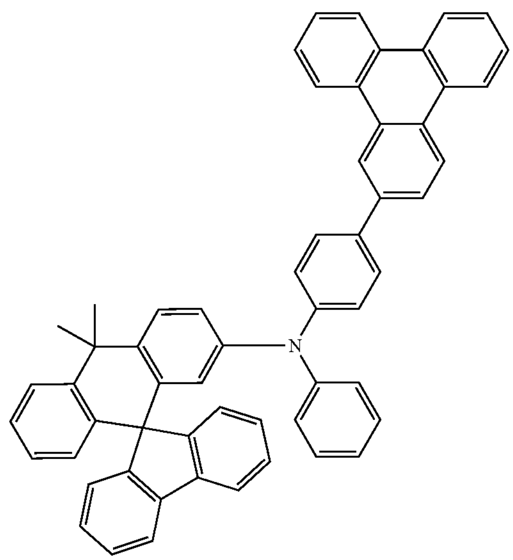

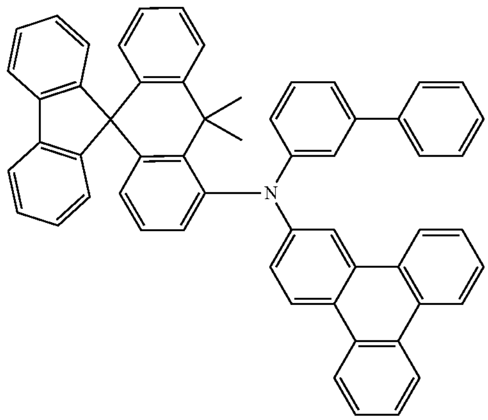
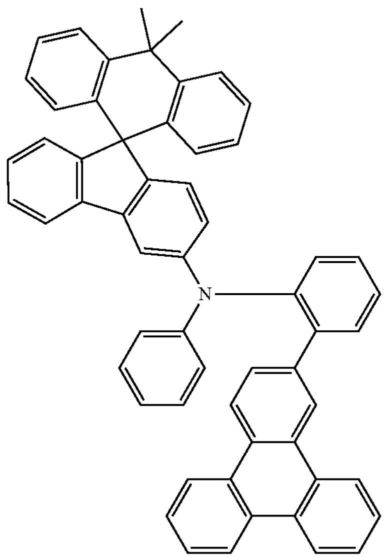
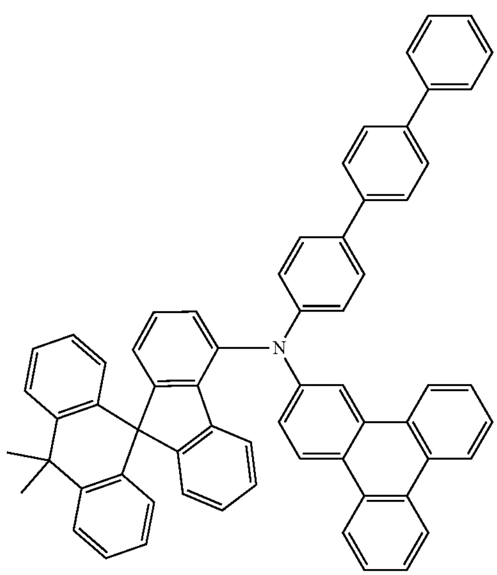
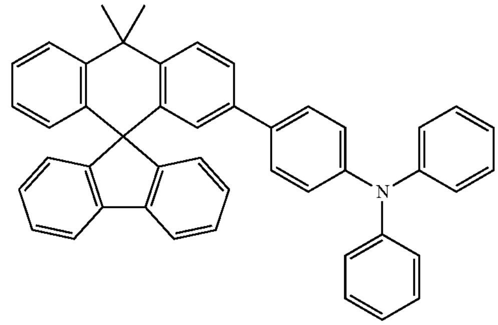
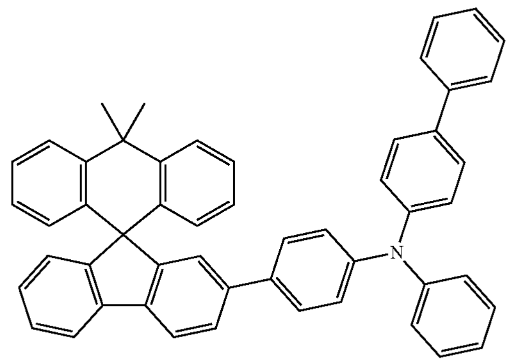
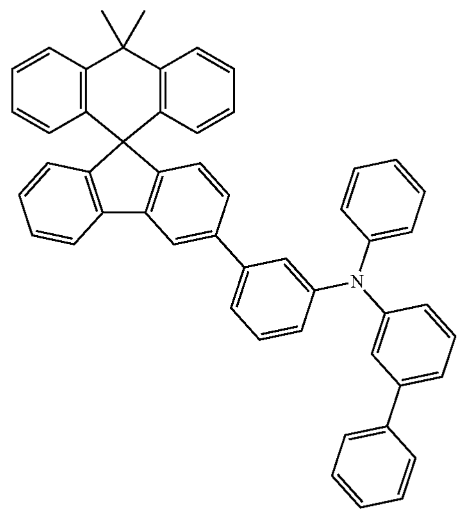
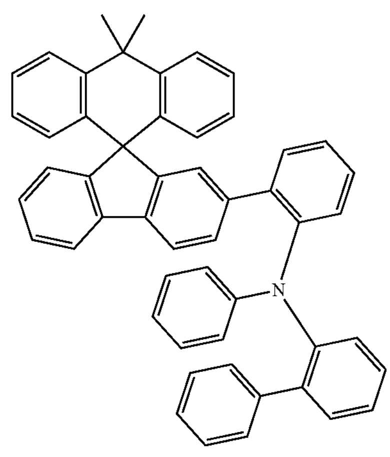

-continued
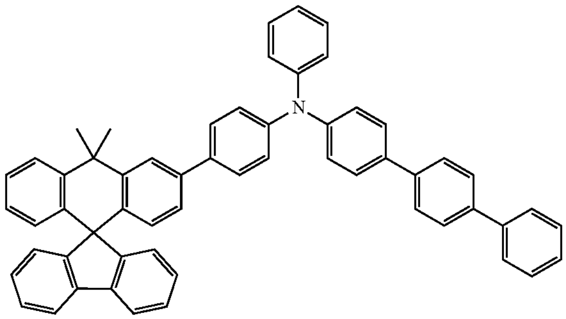
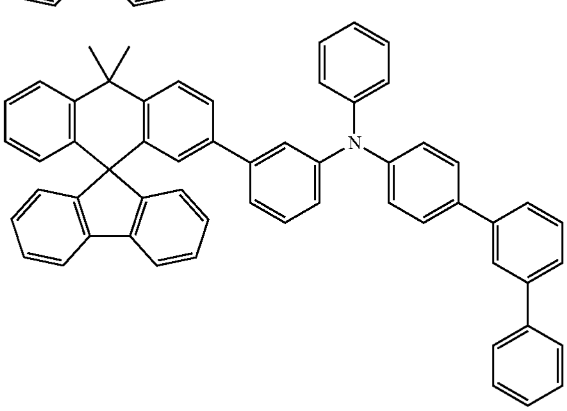
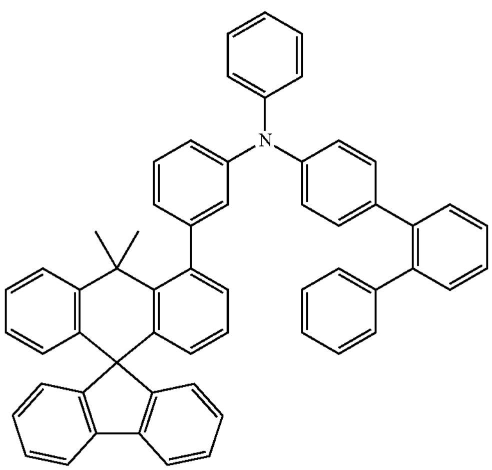
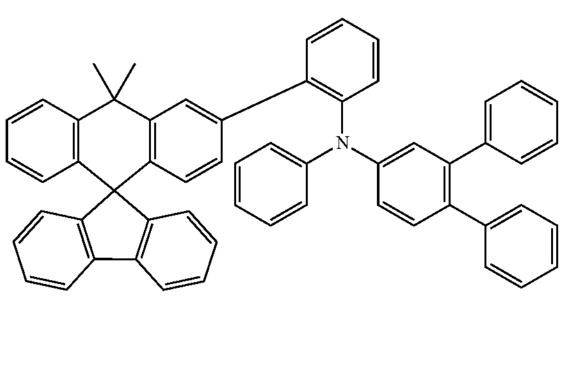
-continued
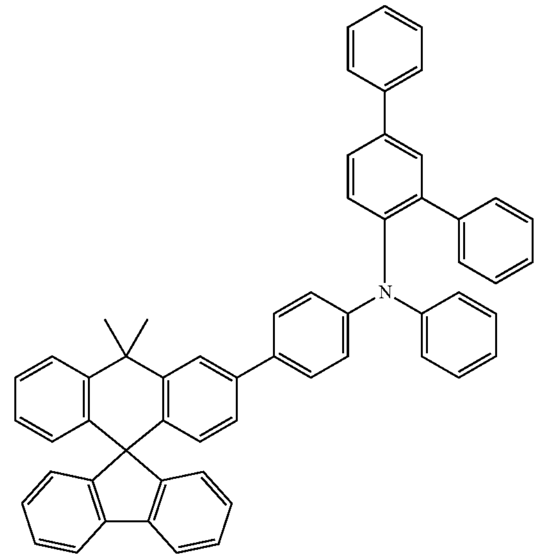
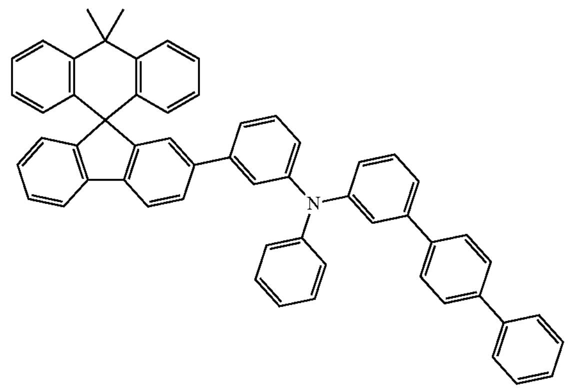
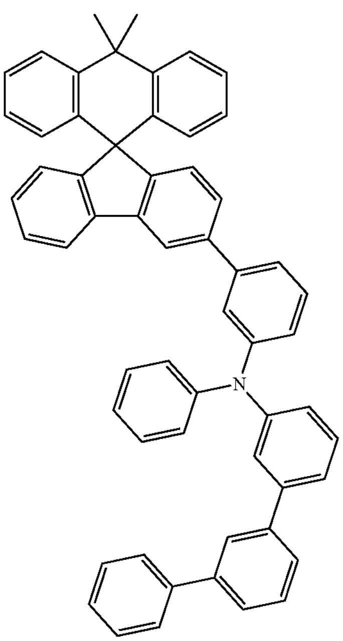

-continued
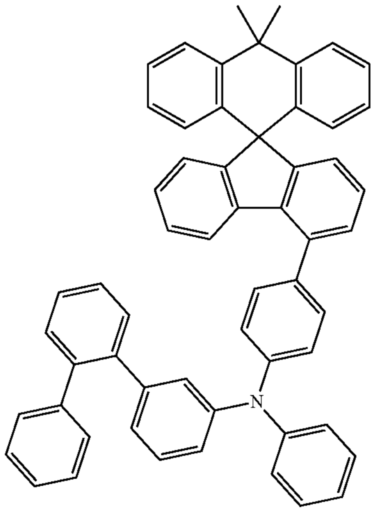
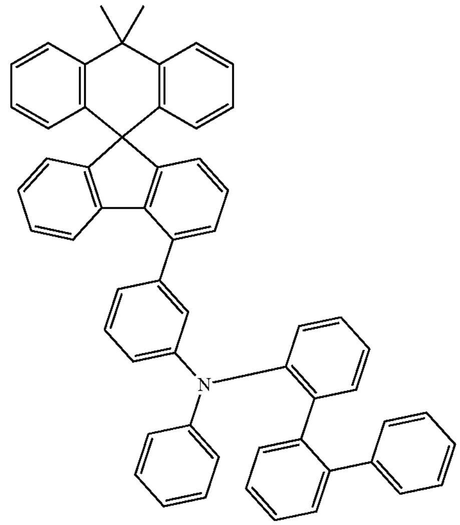
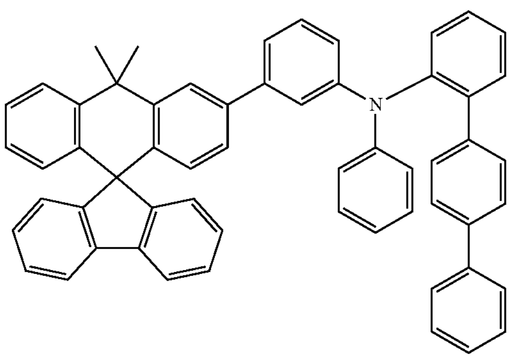
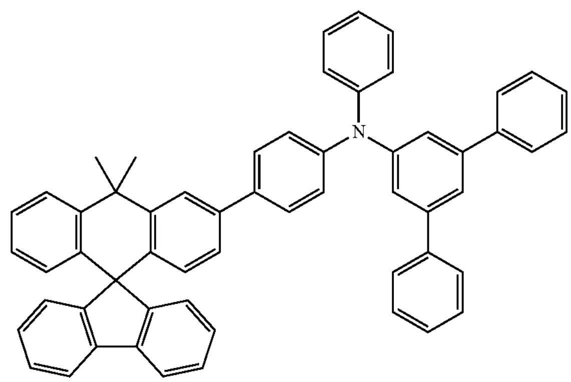
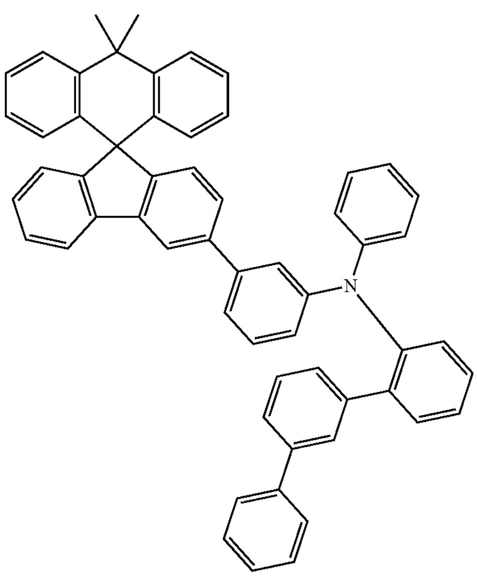
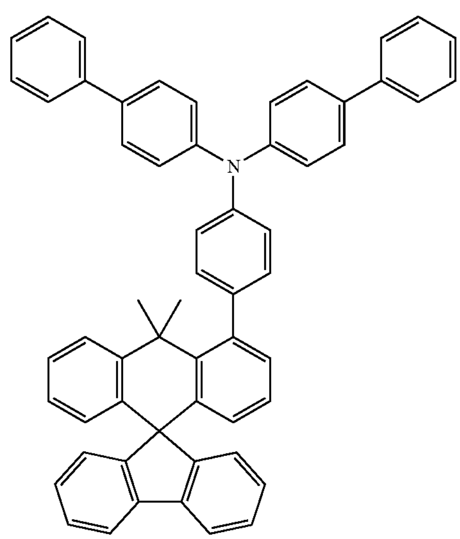
-continued -continued
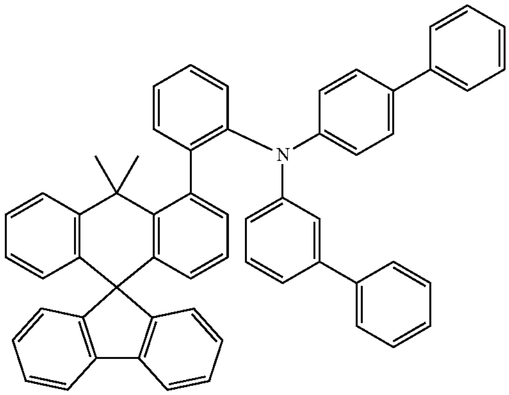
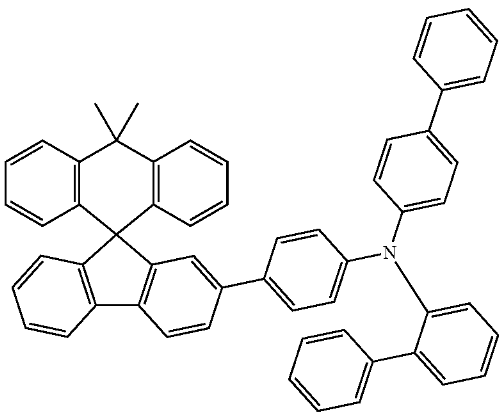
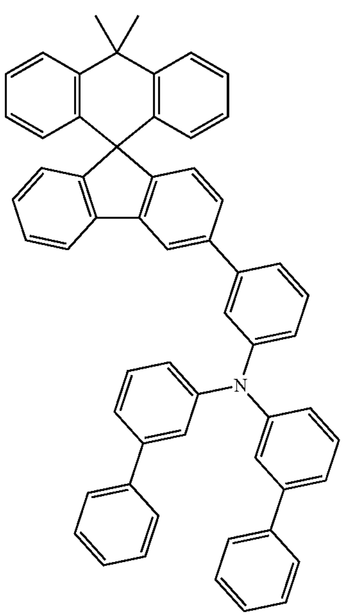
-continued
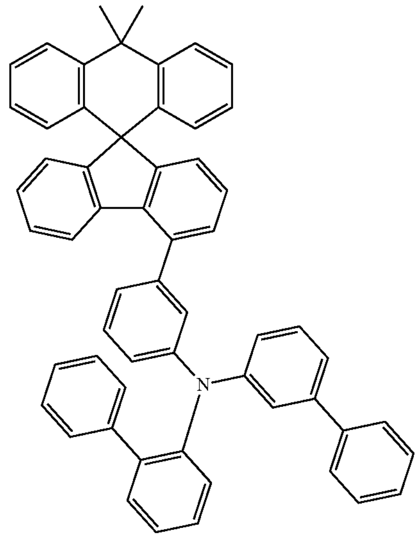
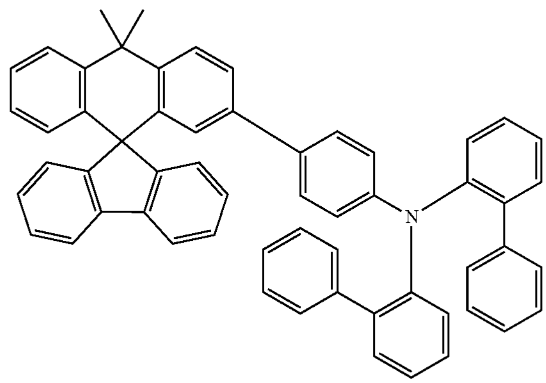
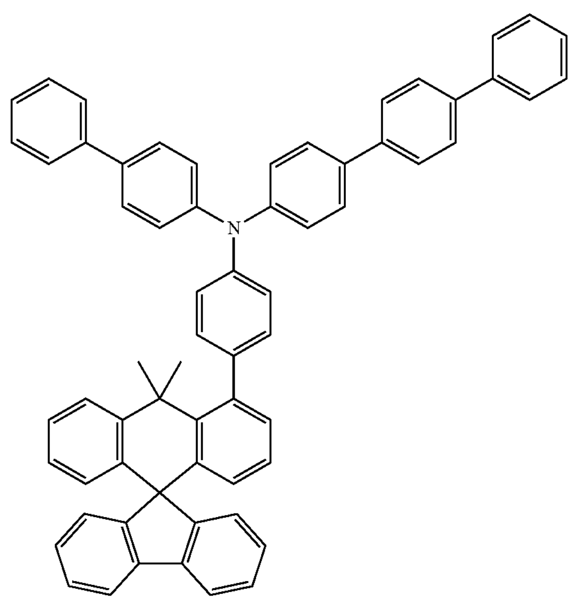

-continued
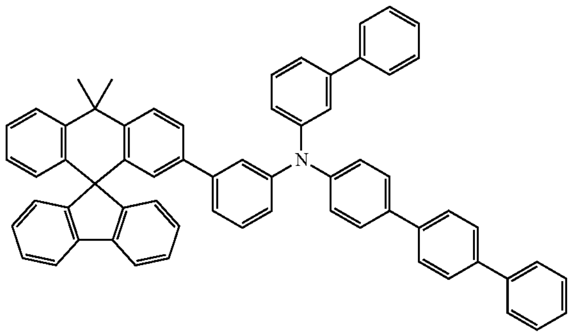
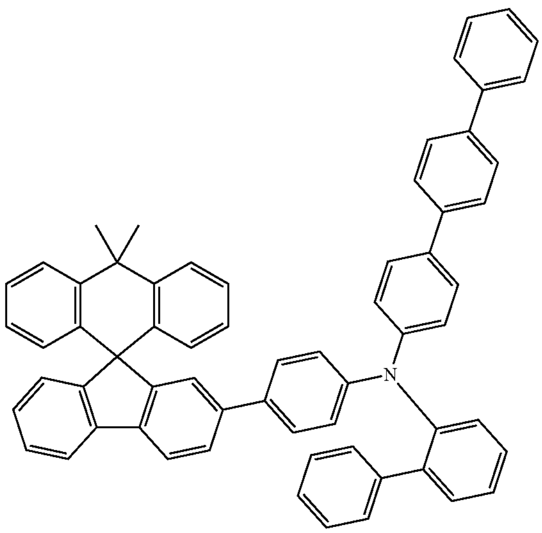
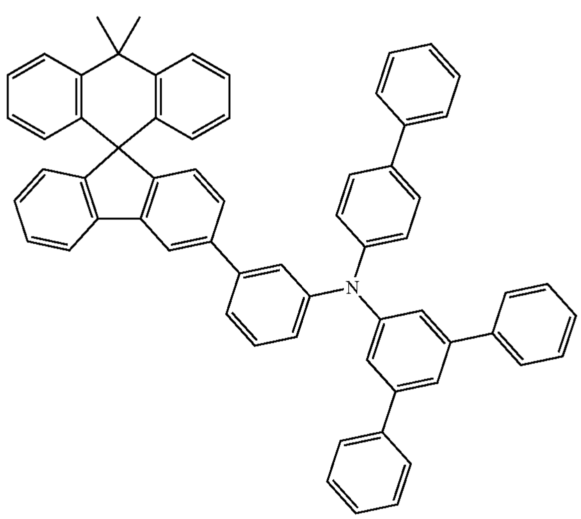
-continued
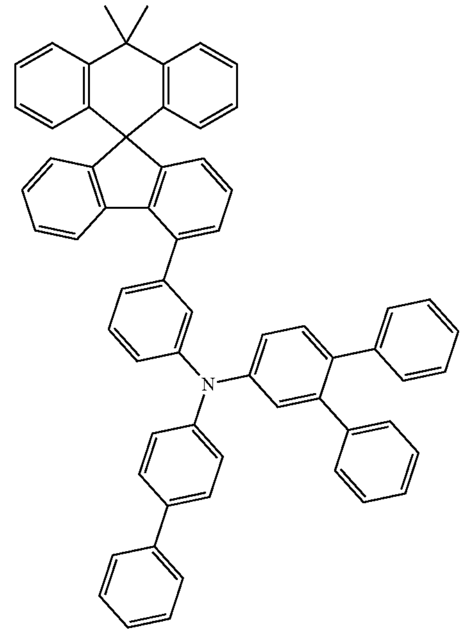
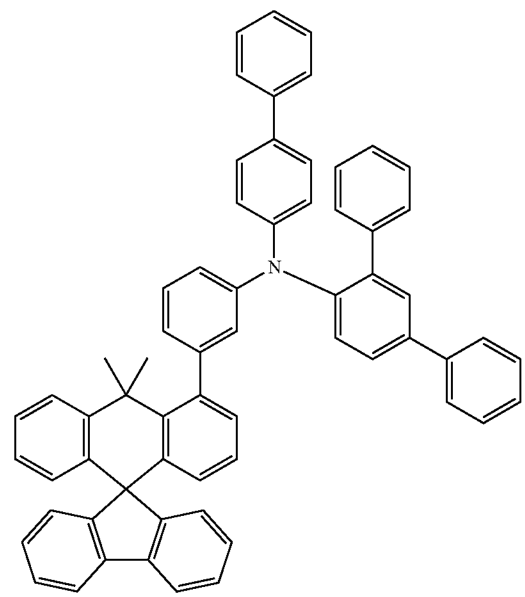
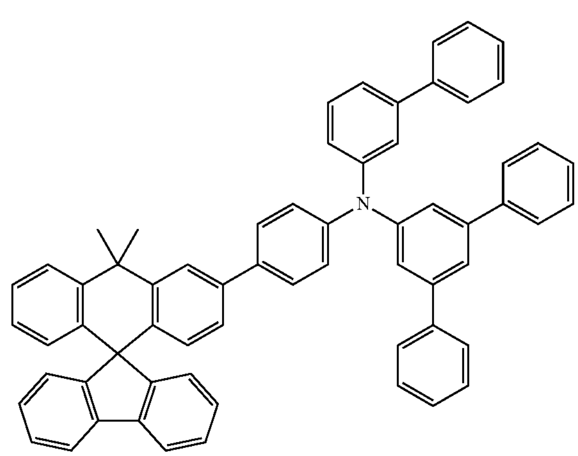

-continued
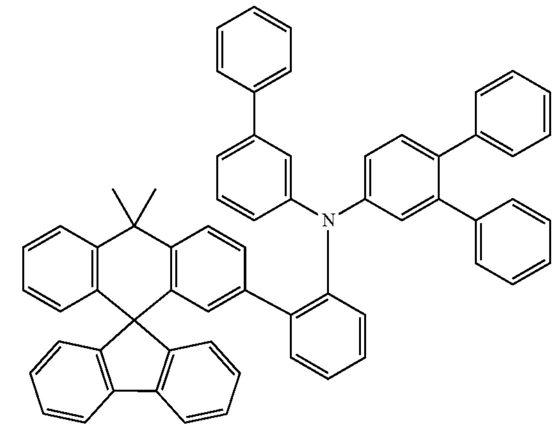
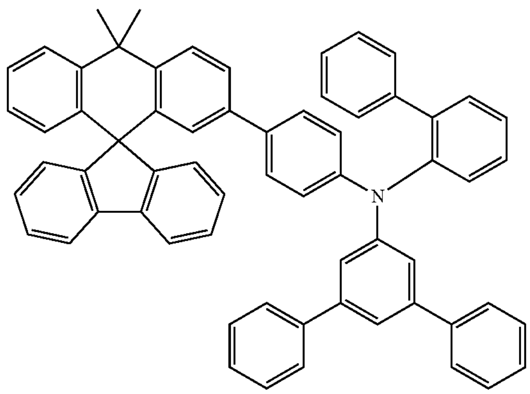
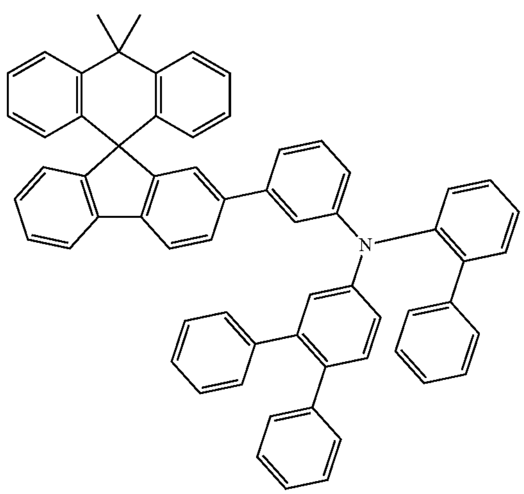
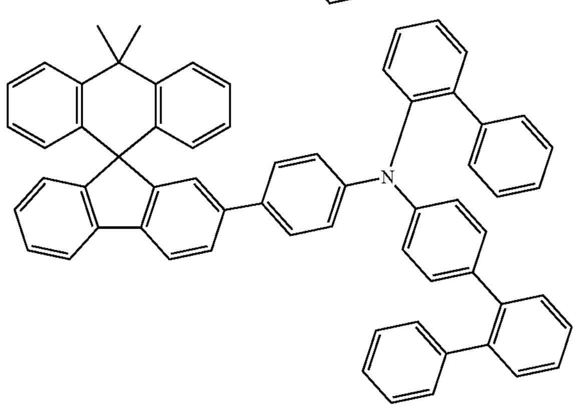
-continued
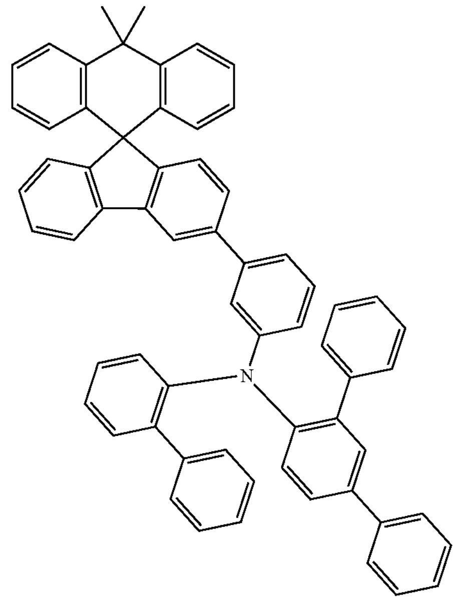
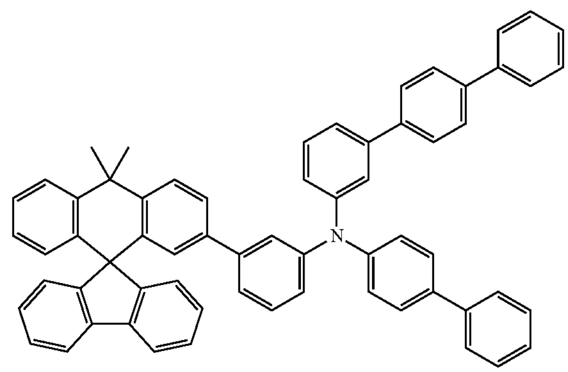
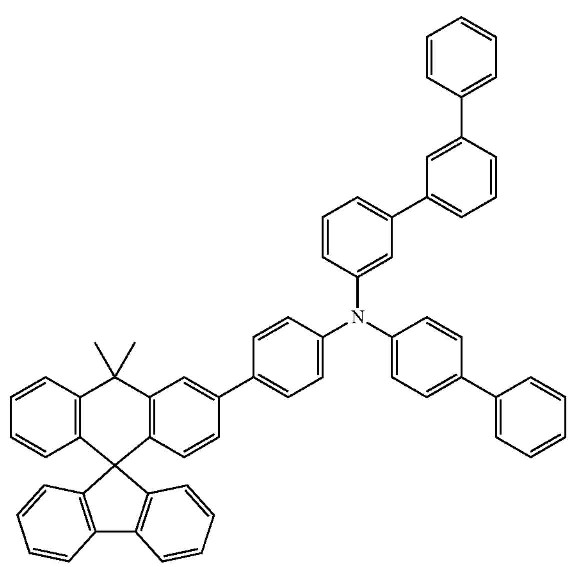

-continued
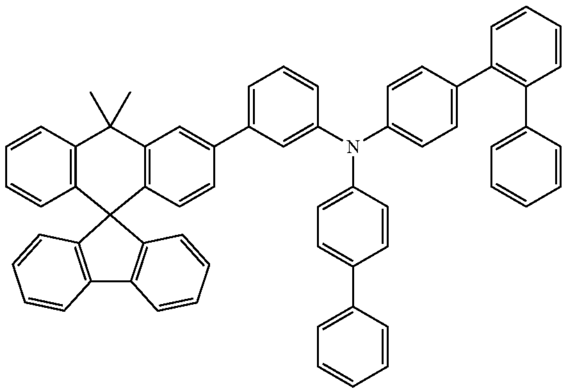
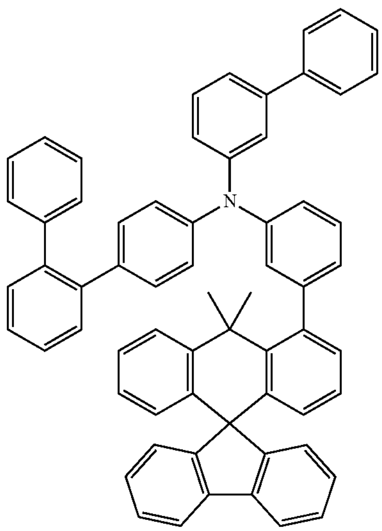
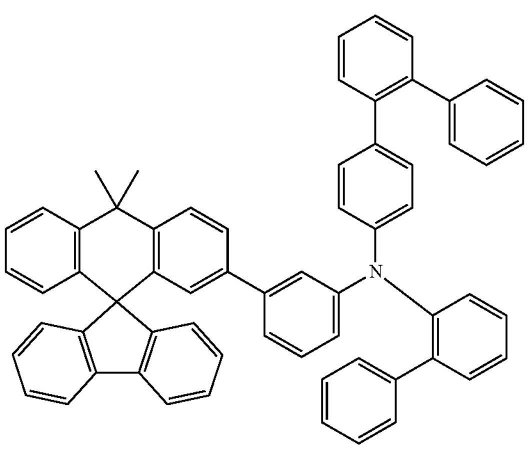
-continued
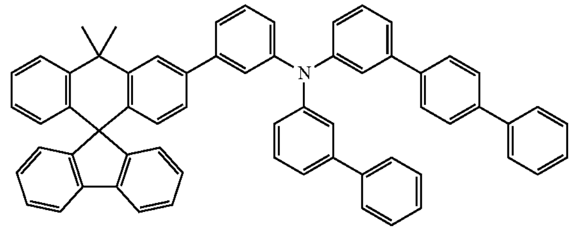
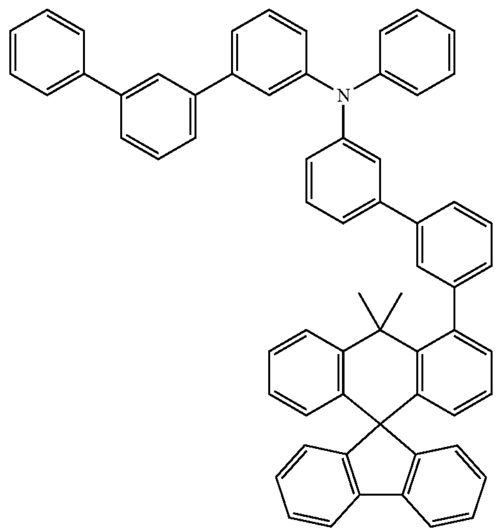
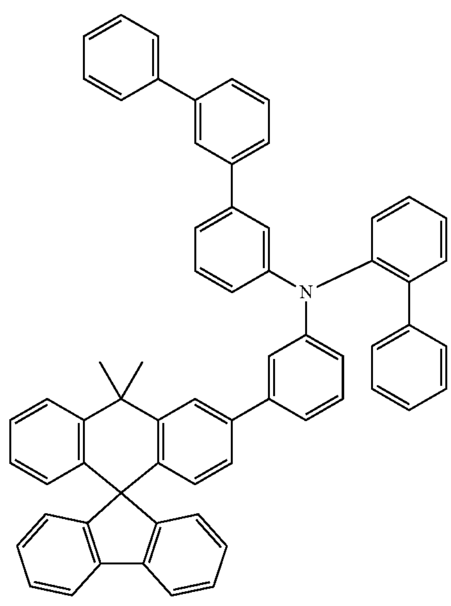

-continued
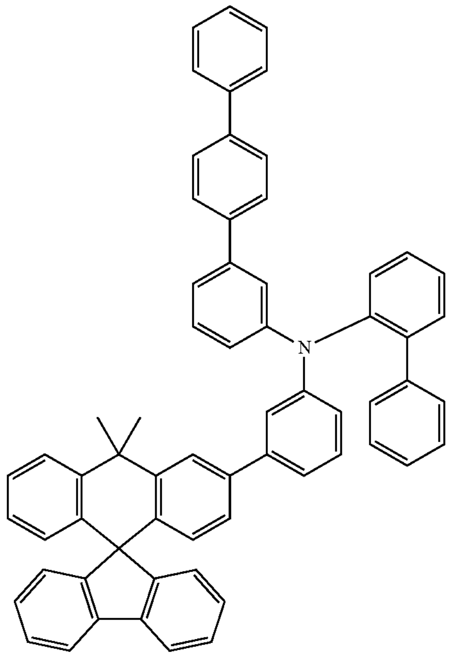
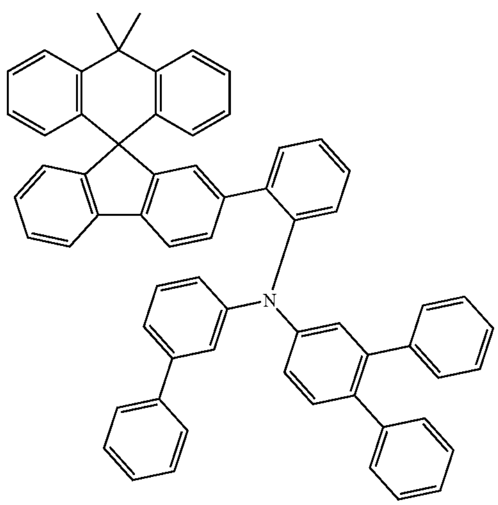
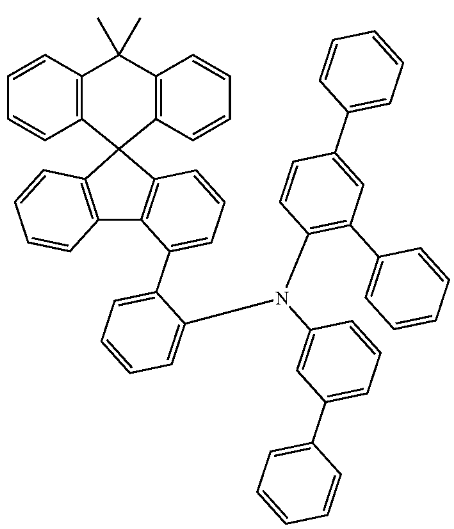
-continued
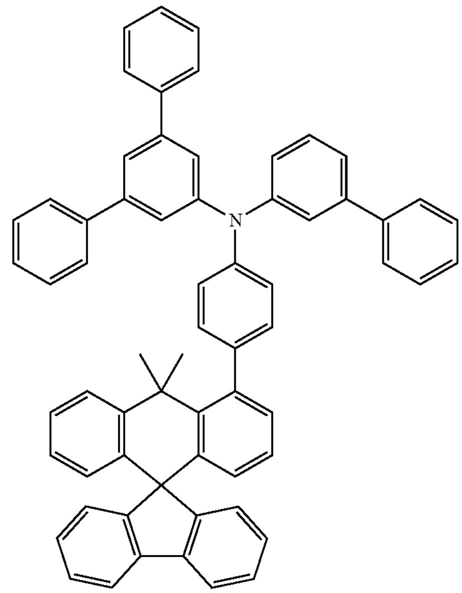
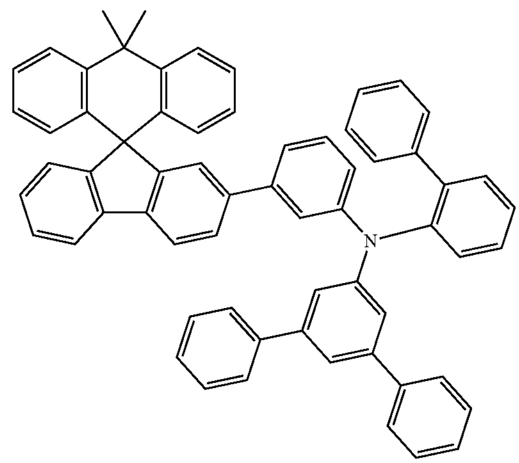
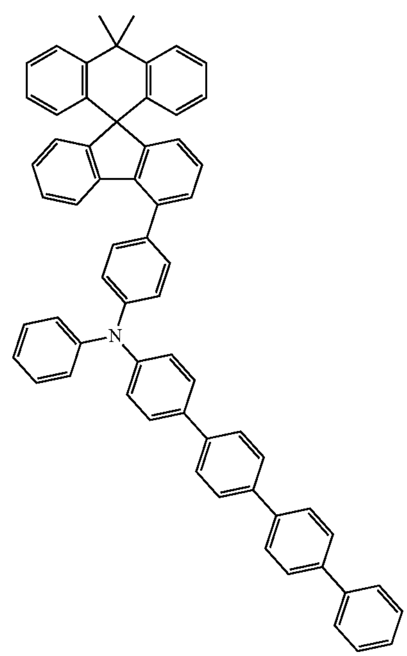

-continued
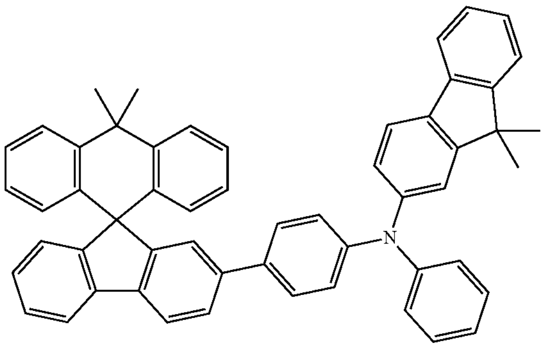
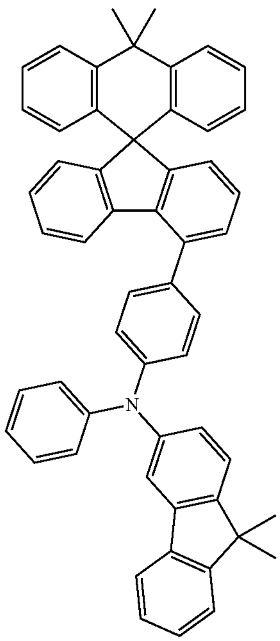
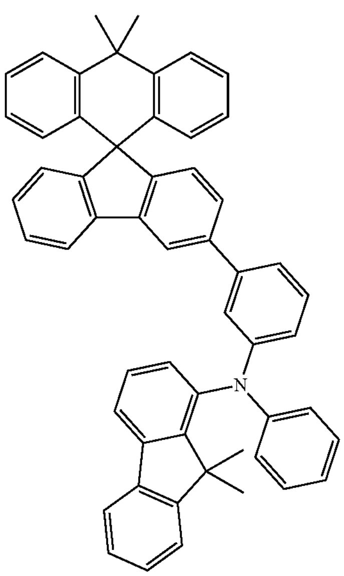
-continued
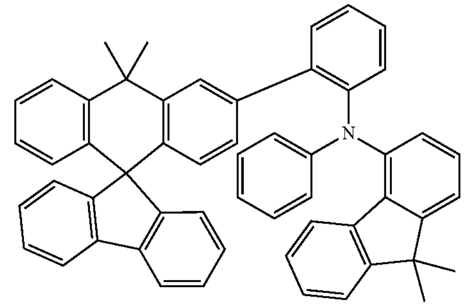
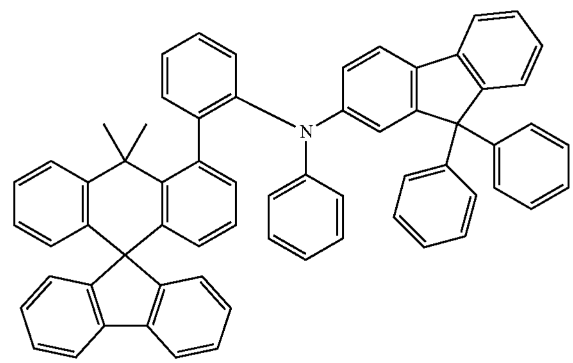
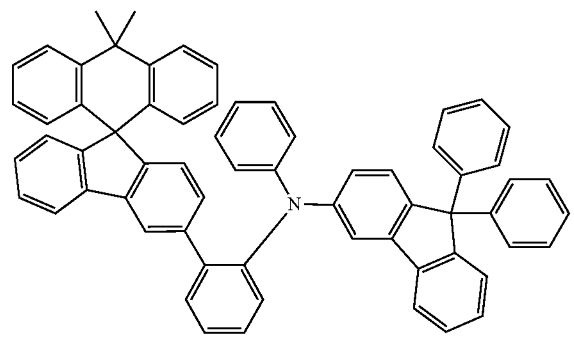
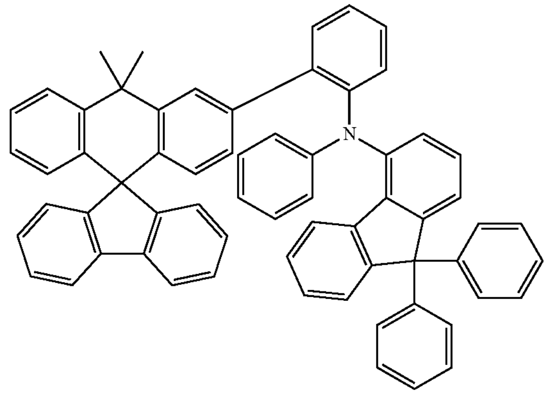

-continued
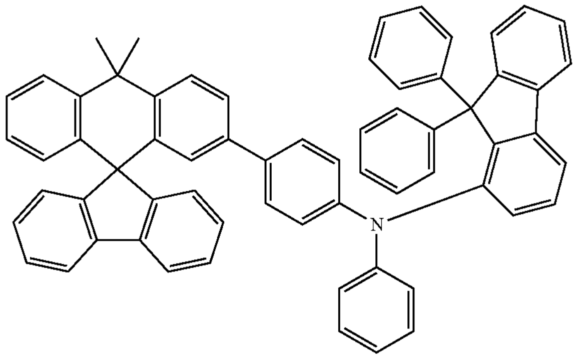
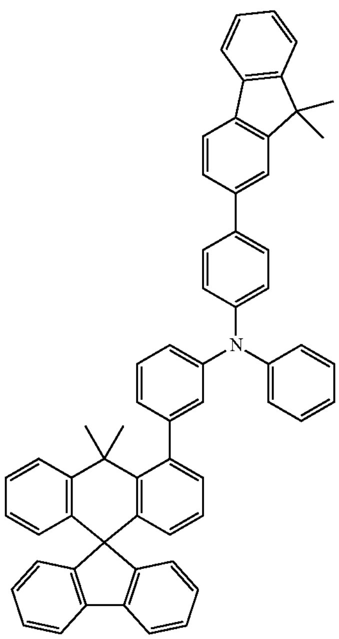
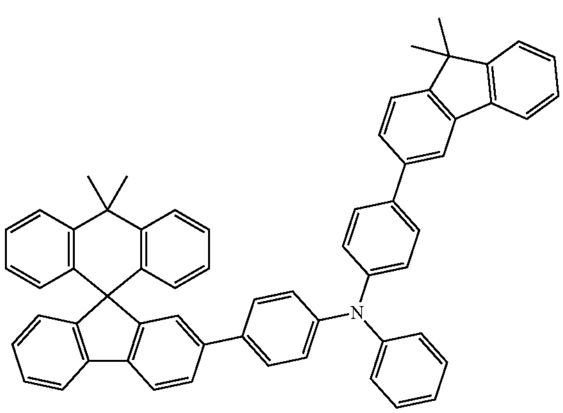
-continued
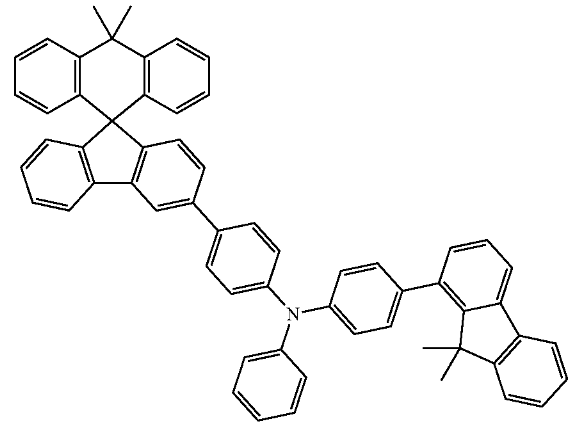
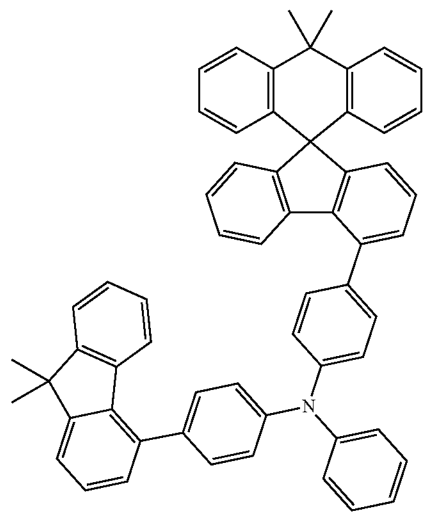
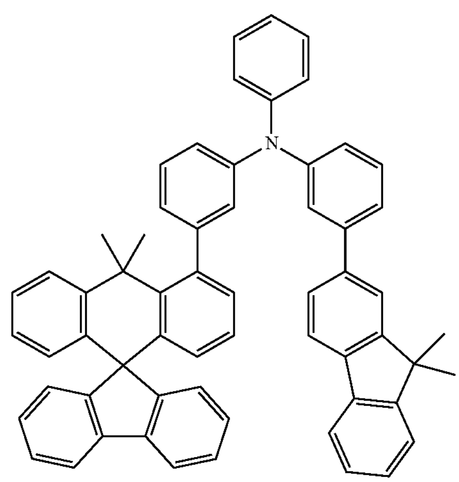

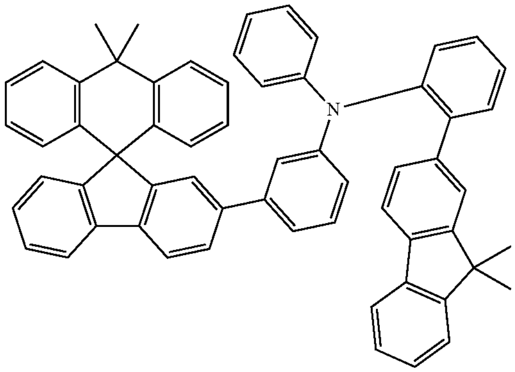
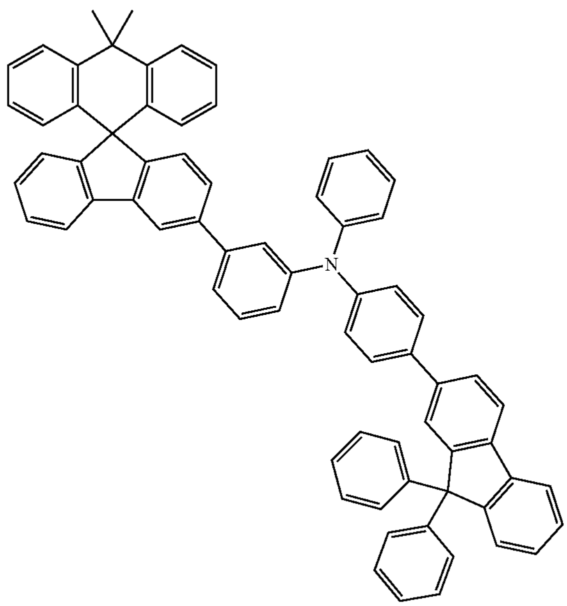
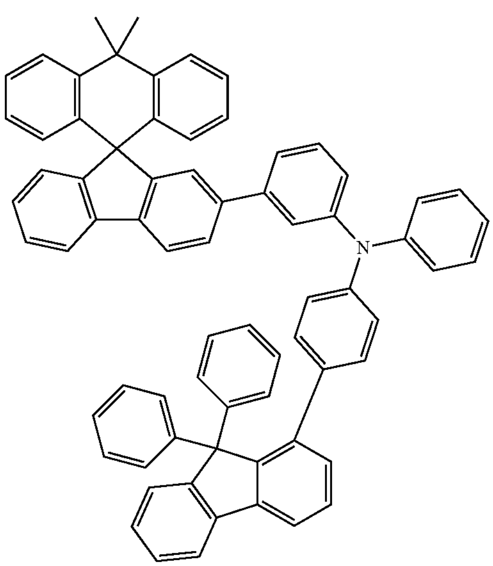
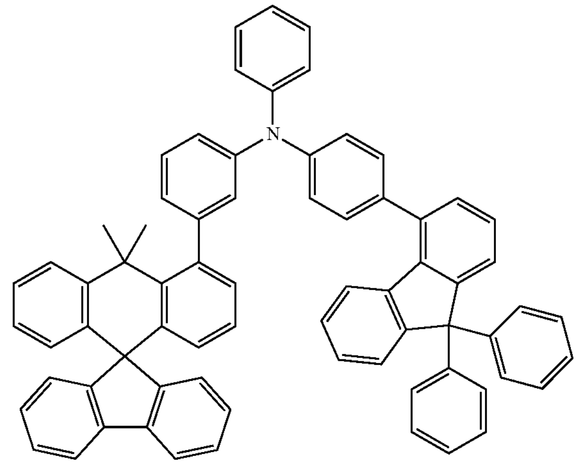
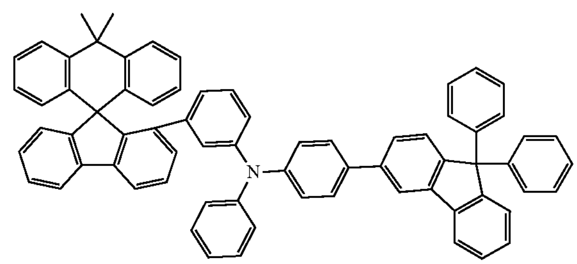
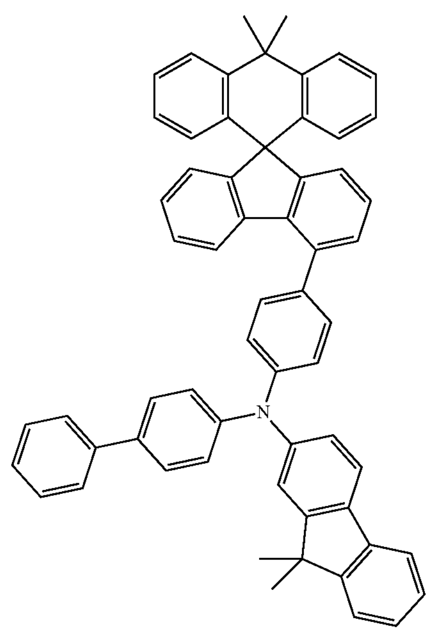

-continued
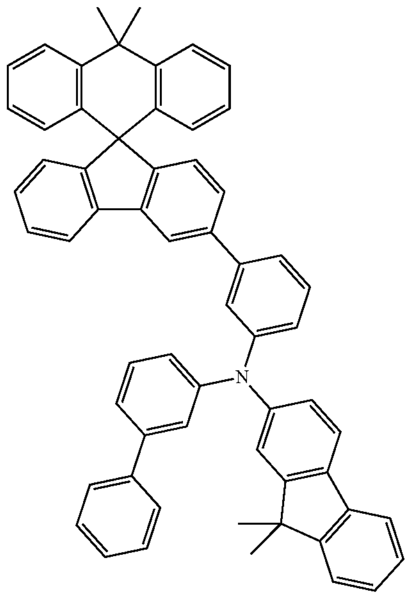
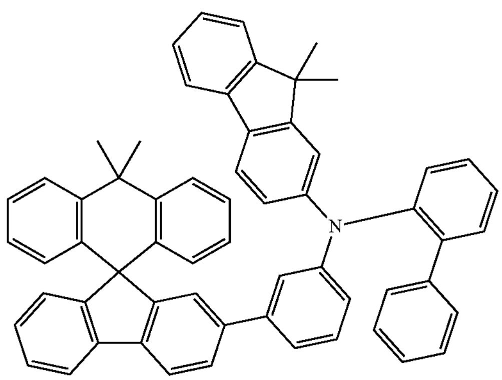
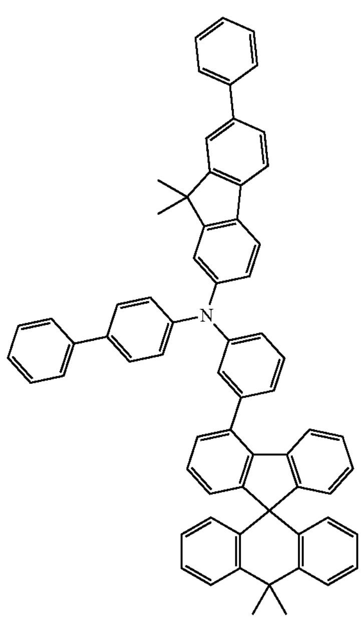
-continued
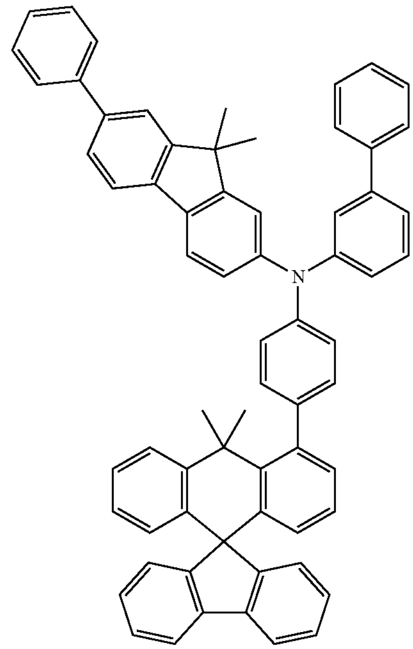
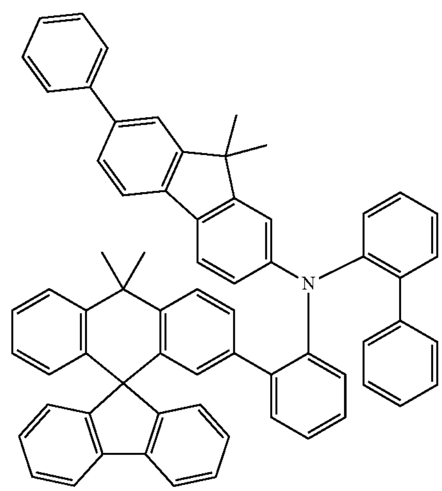
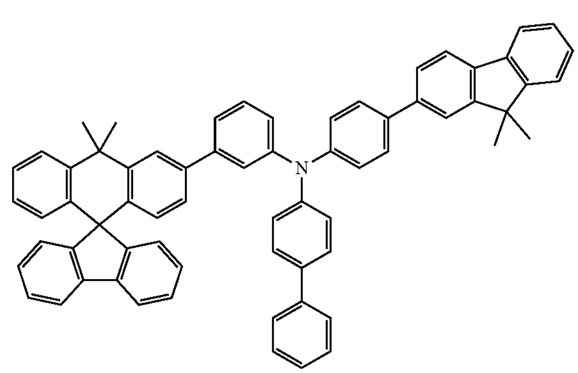

-continued
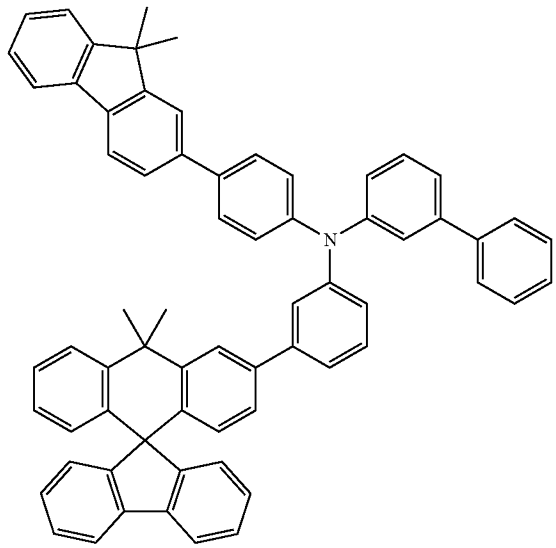
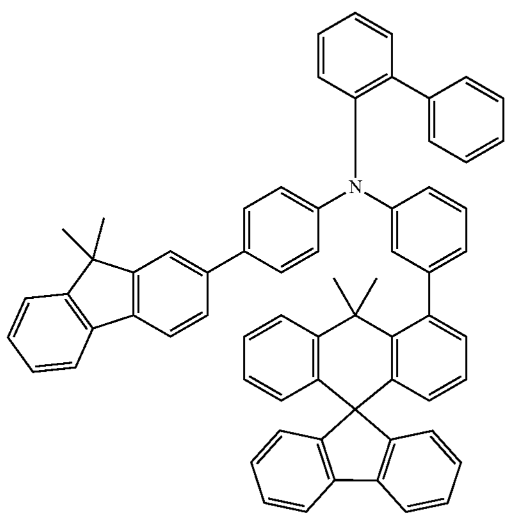
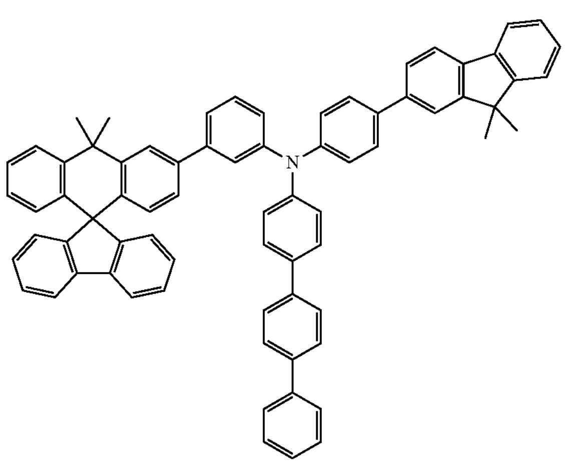
-continued
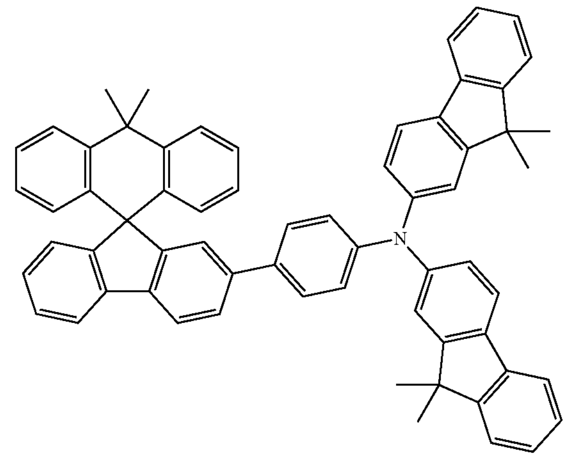
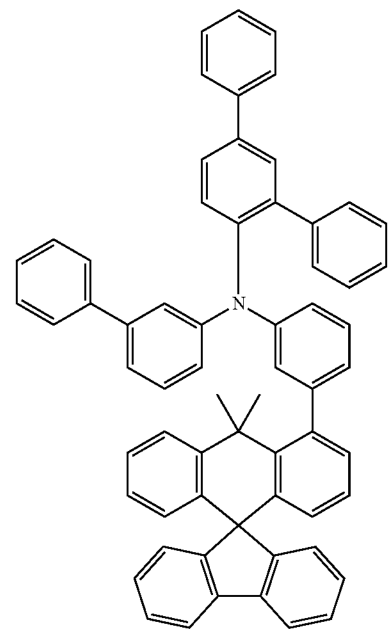
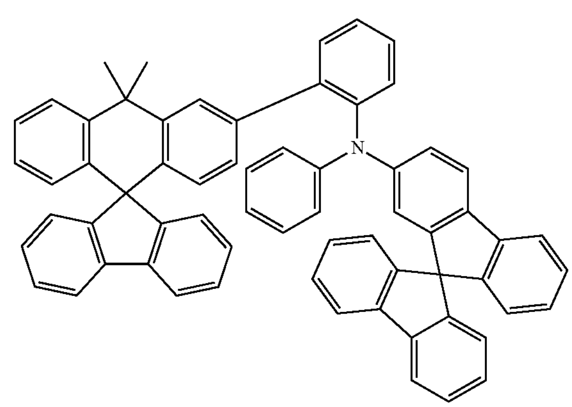

-continued
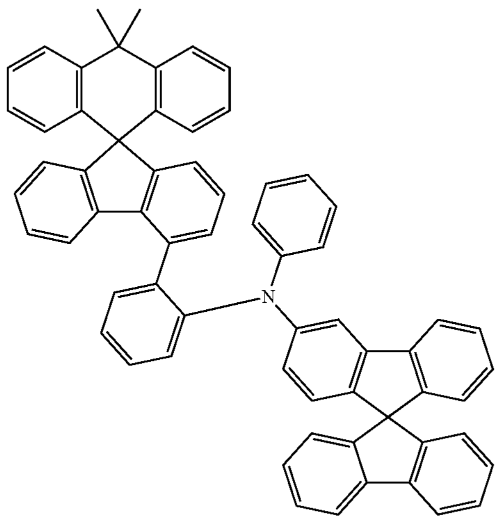
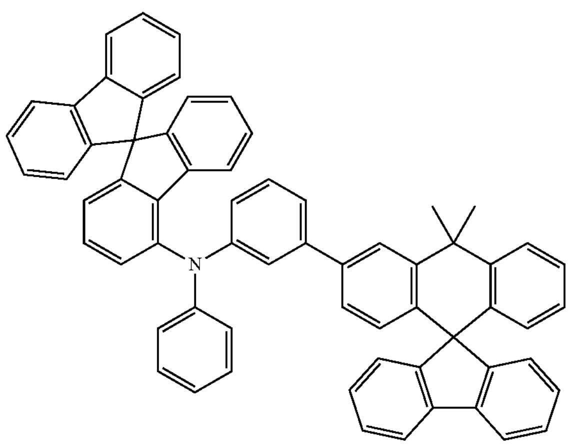
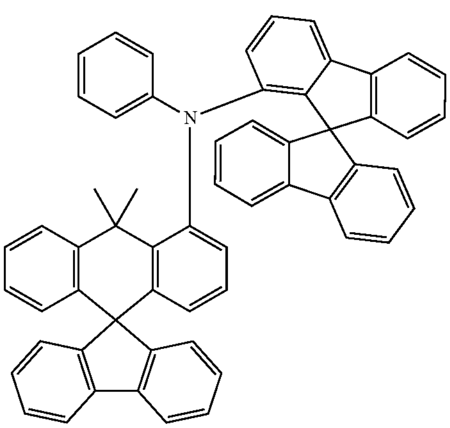
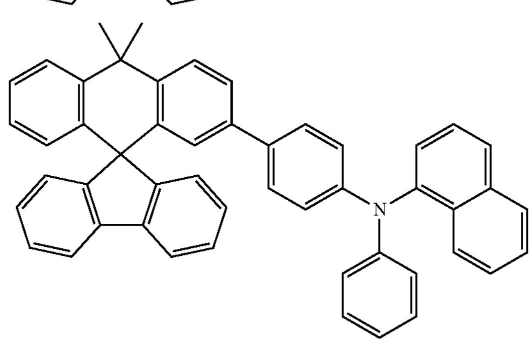
-continued
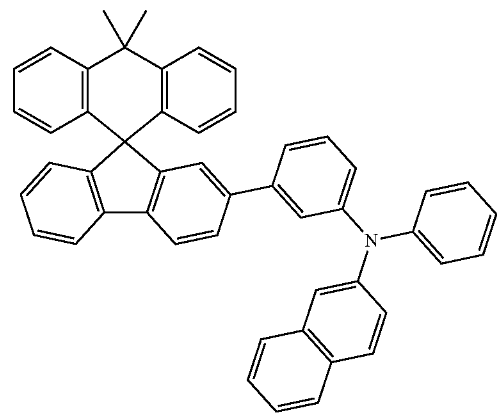
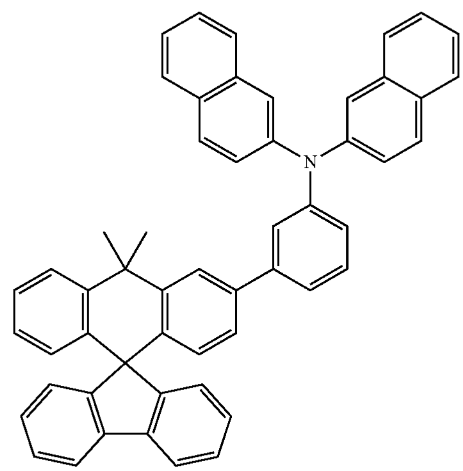
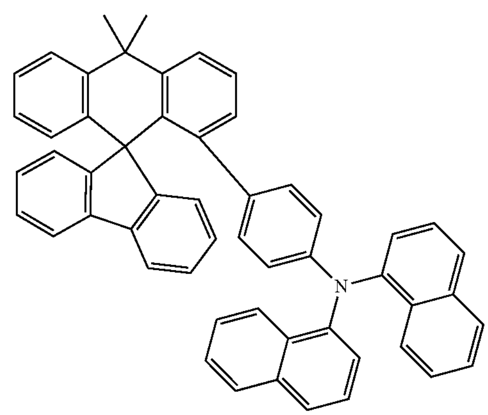
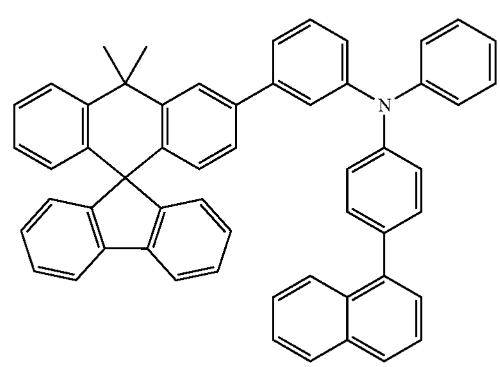

-continued
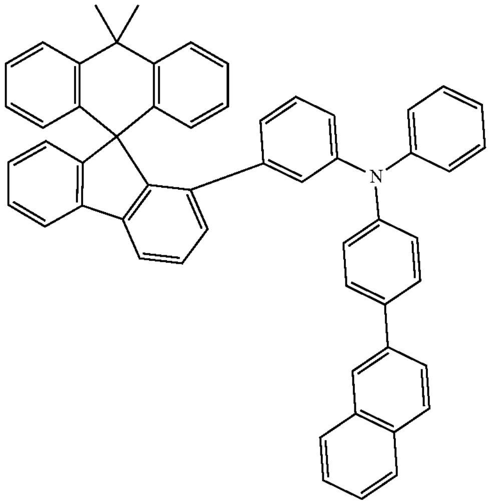
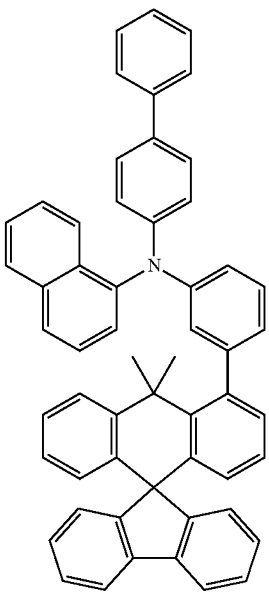
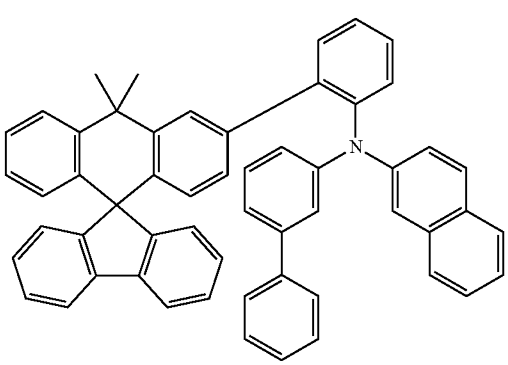
-continued
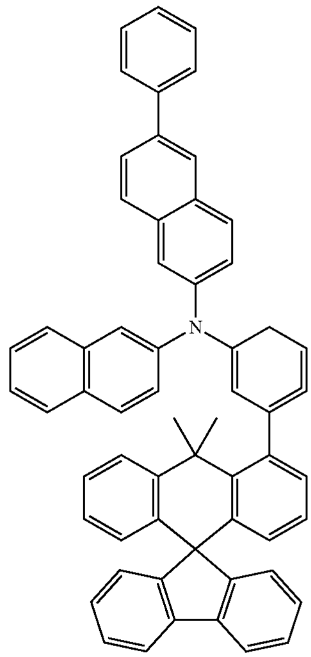
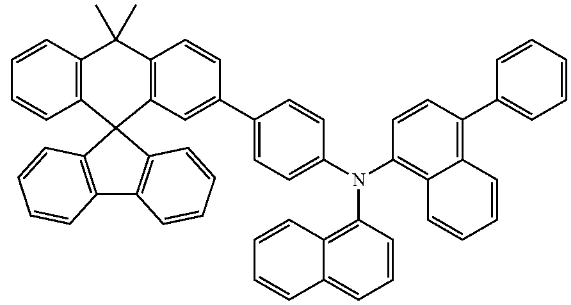
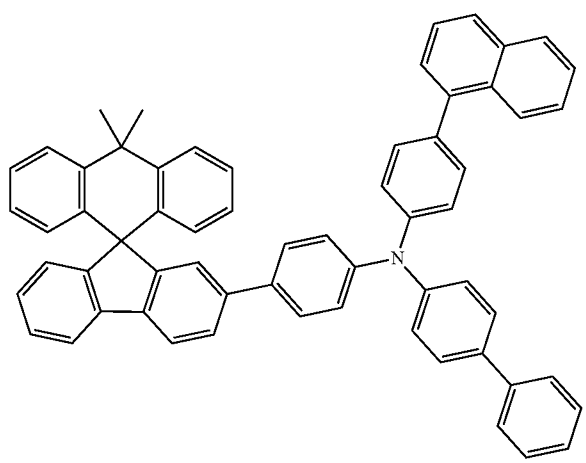

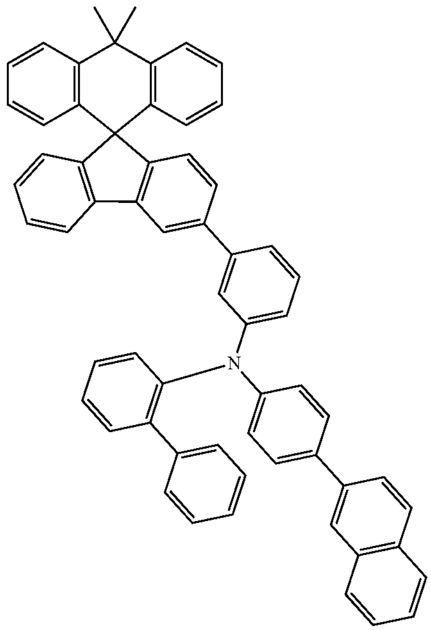
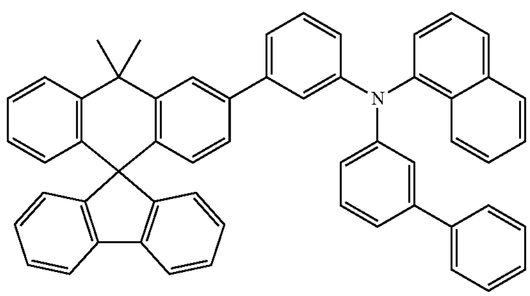
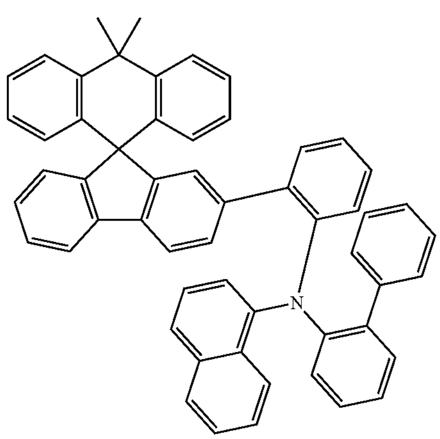
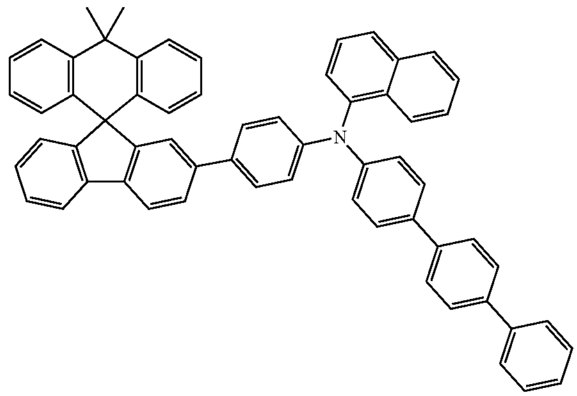
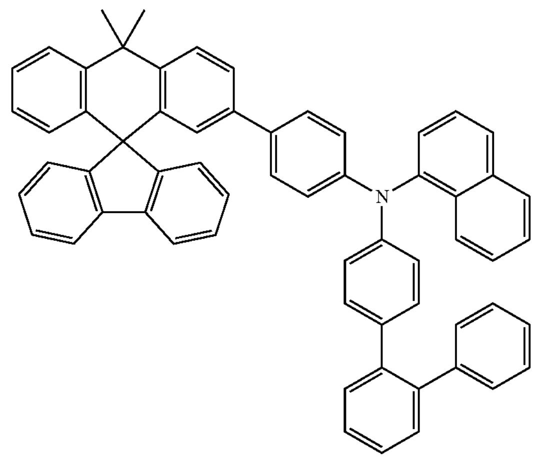
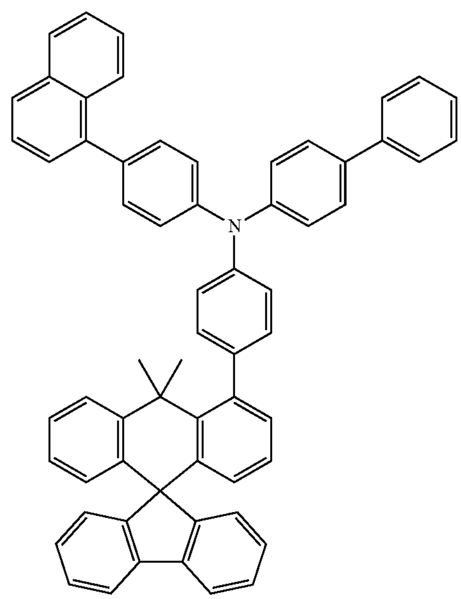

-continued
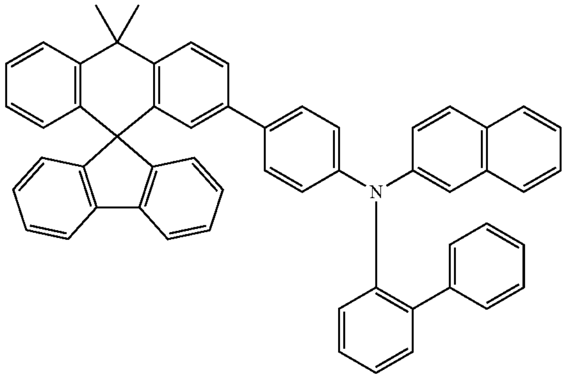
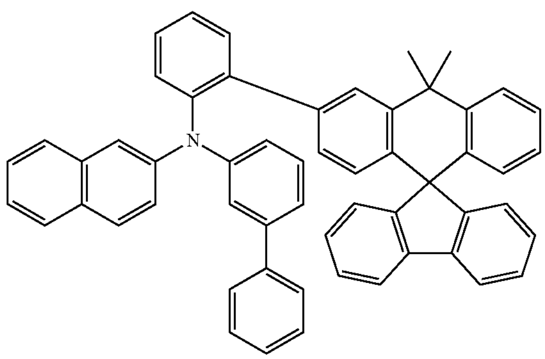
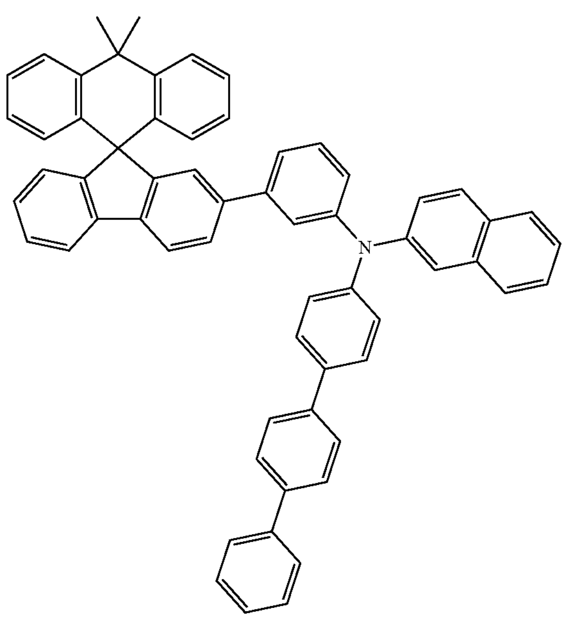
-continued
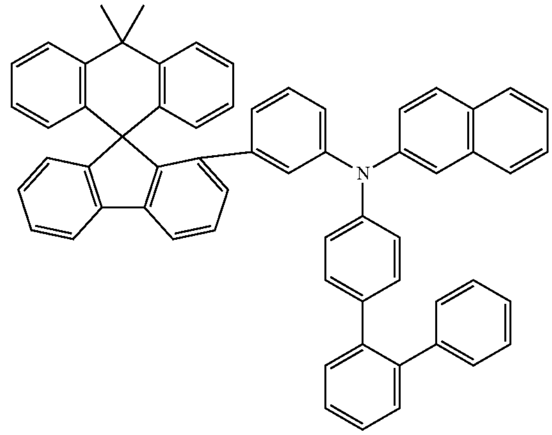
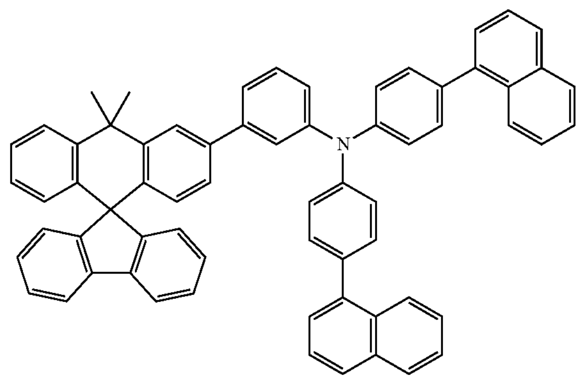
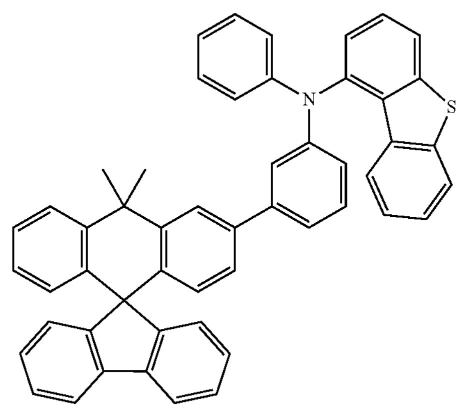
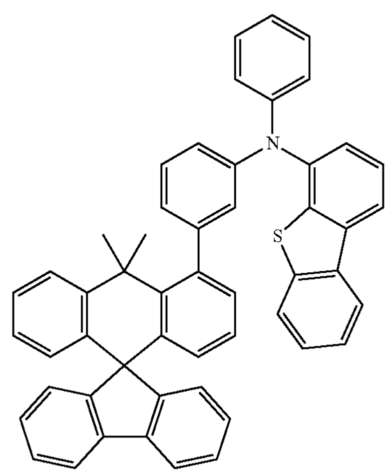

-continued
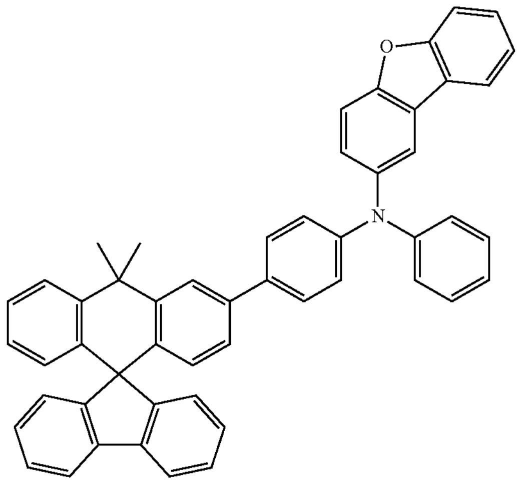
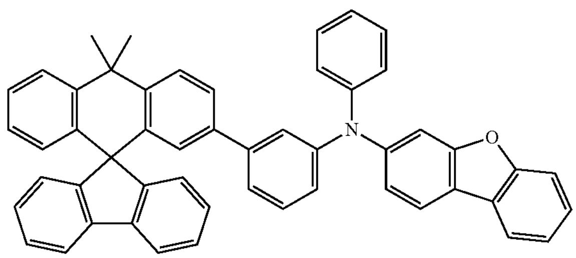
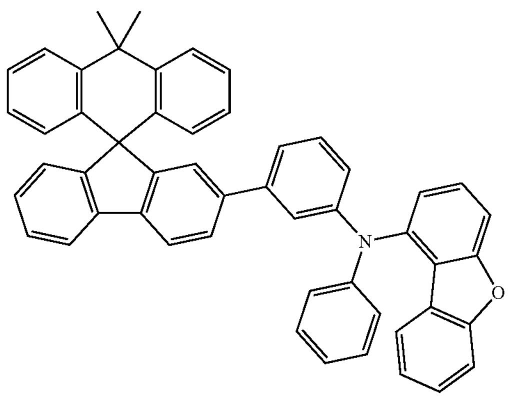
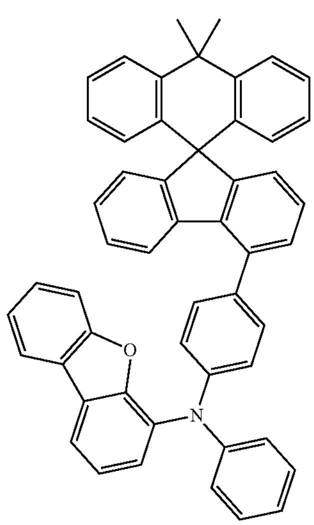
-continued
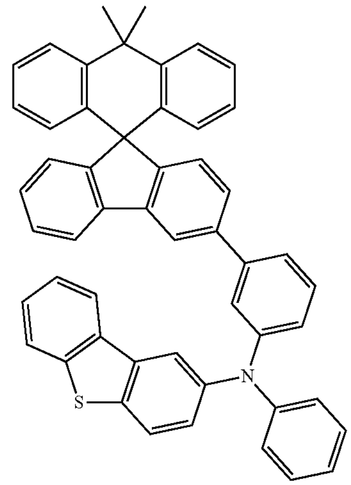
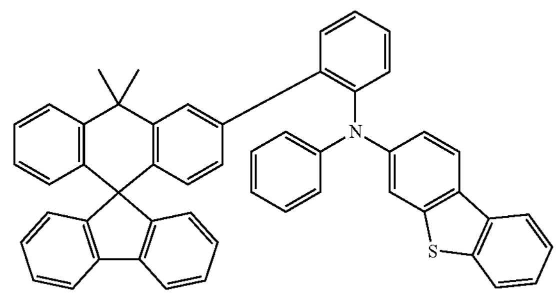
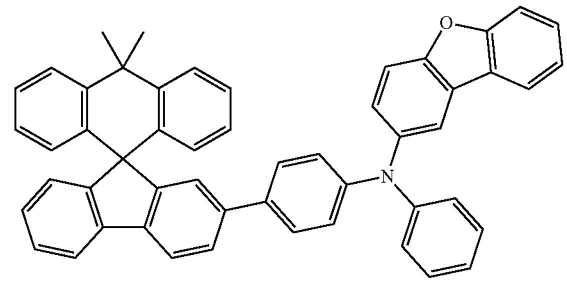
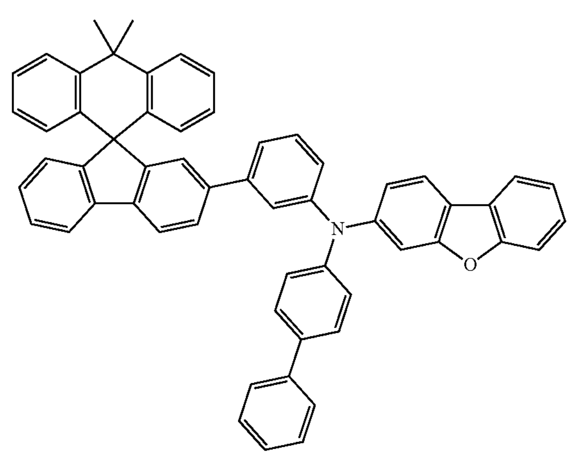

-continued
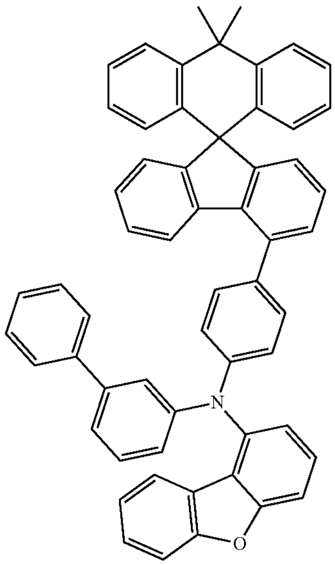
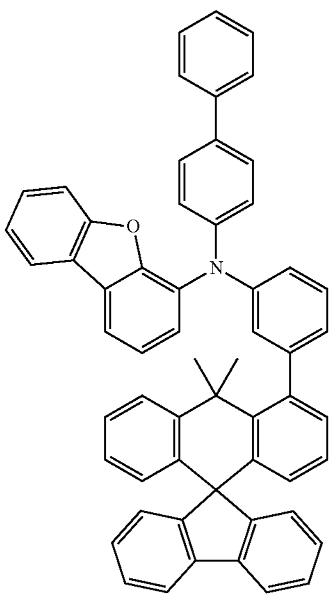
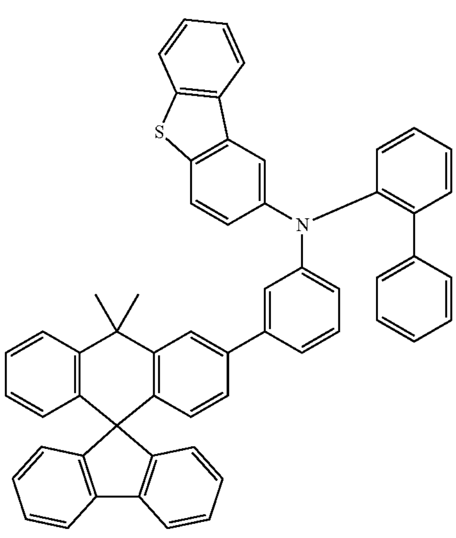
-continued
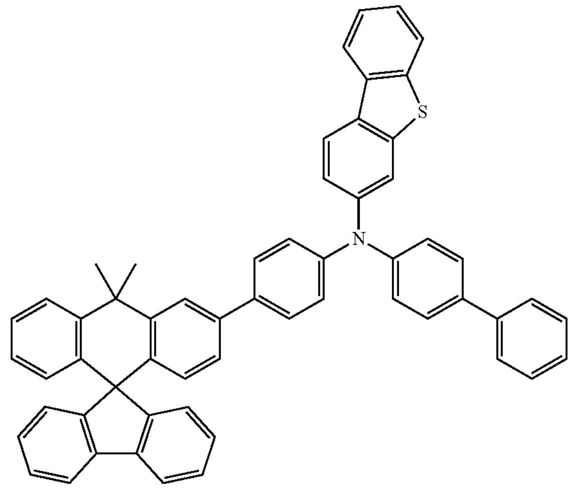
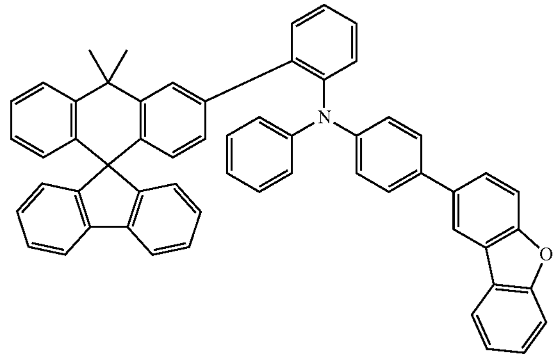
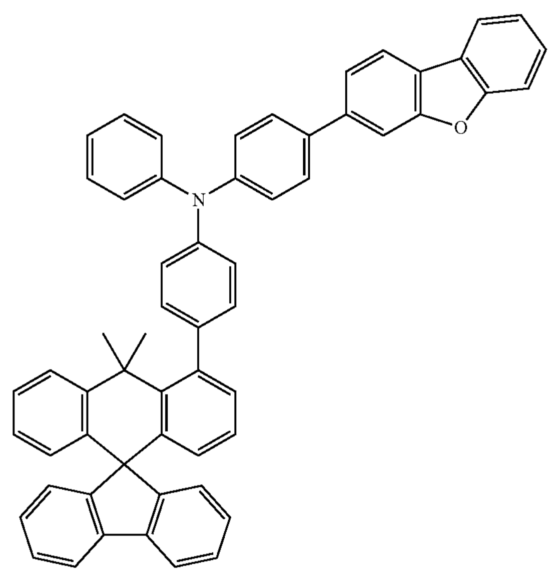

-continued
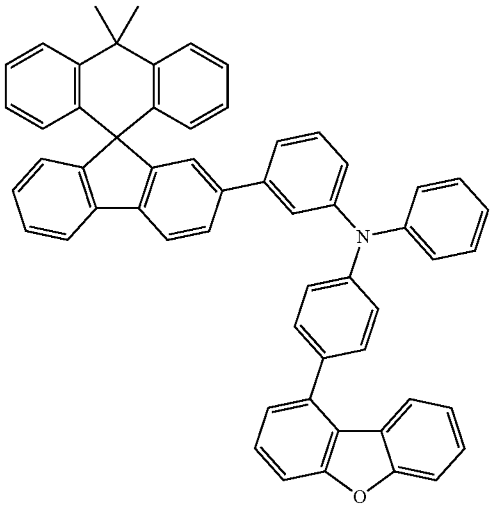
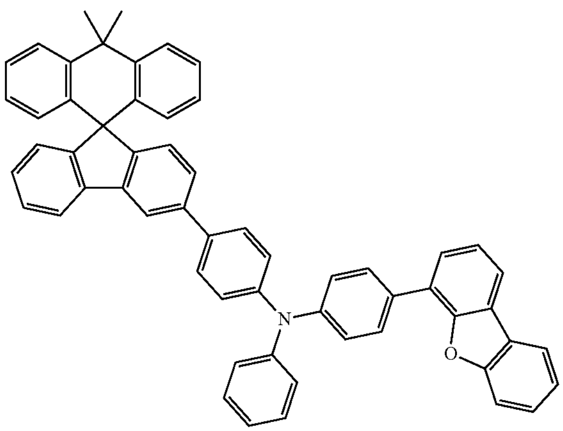
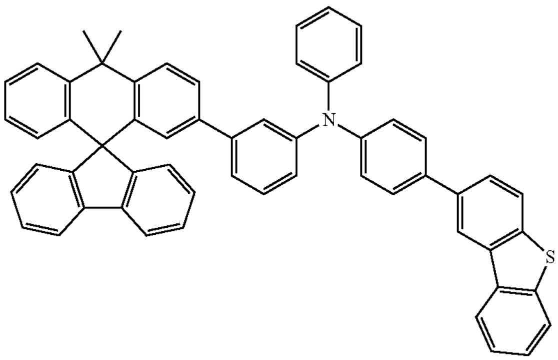
-continued
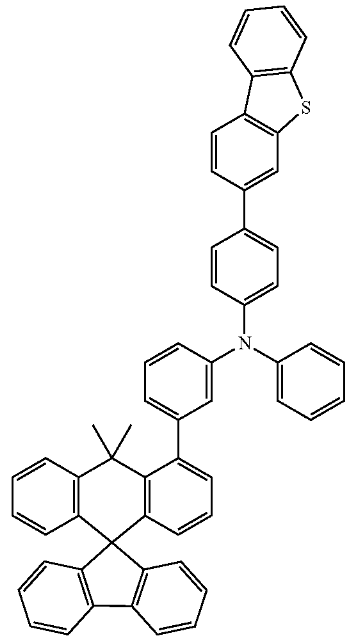
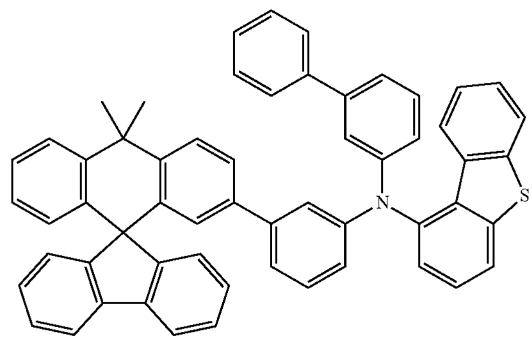
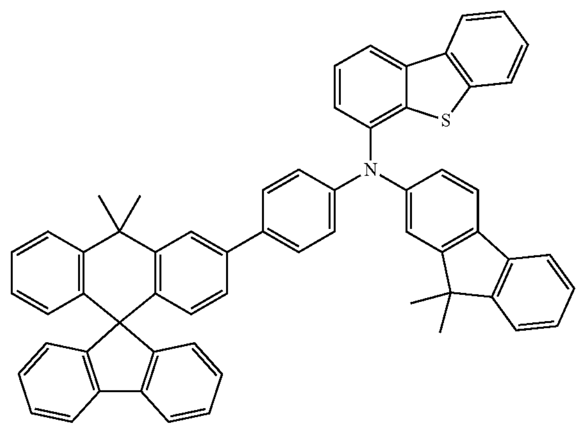
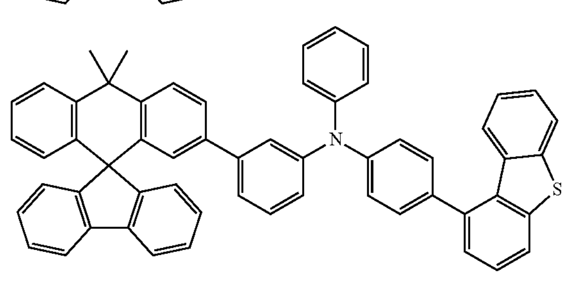

-continued
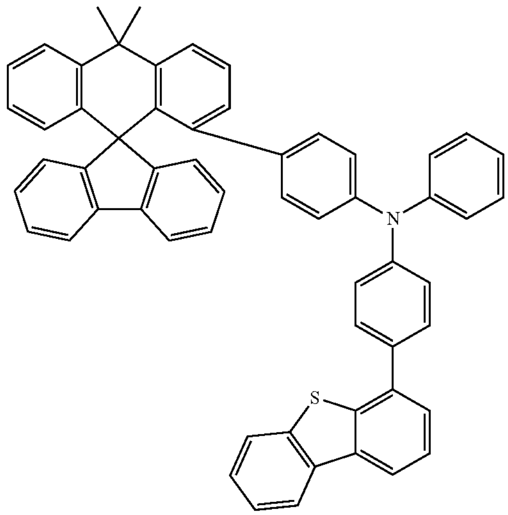
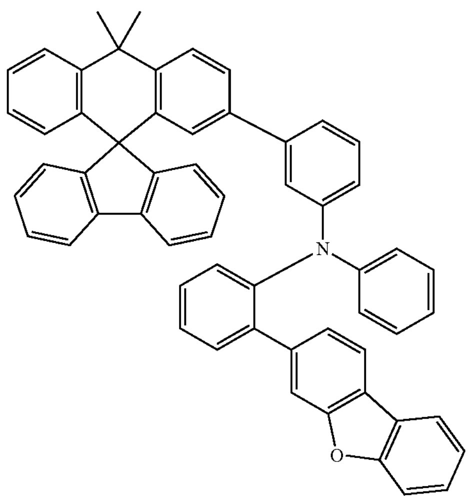
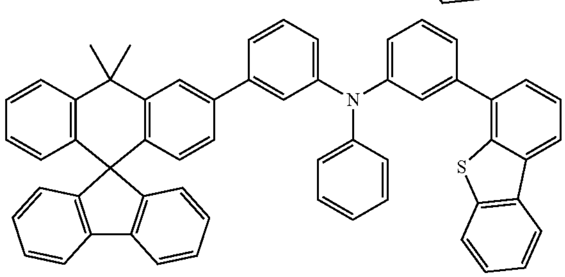
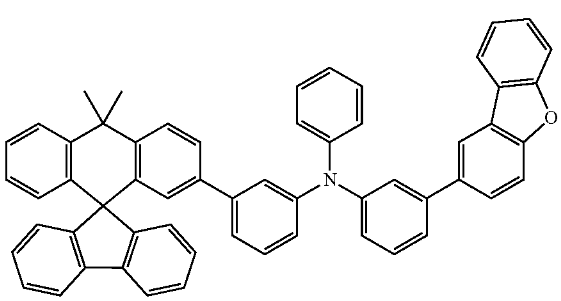
-continued
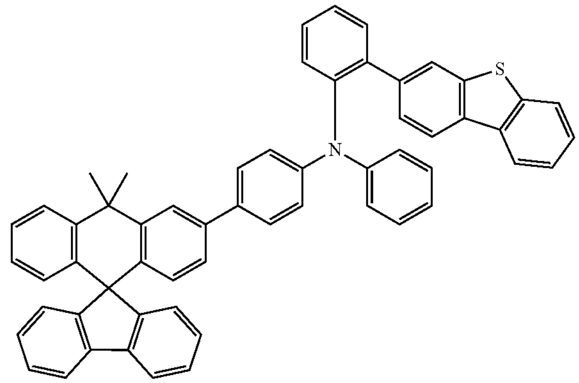
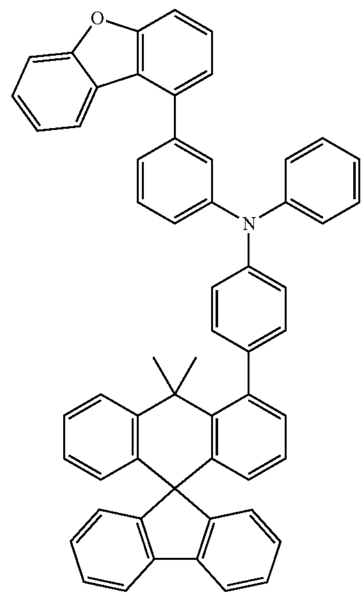
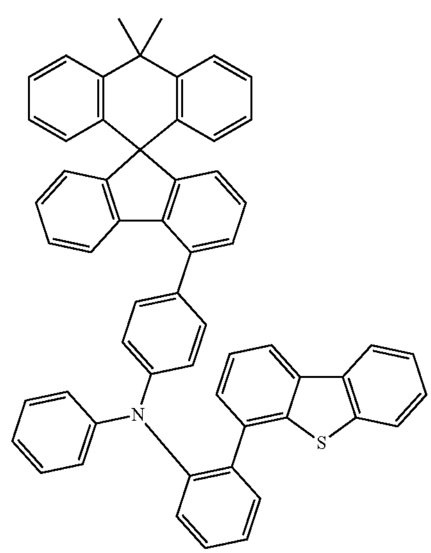

-continued
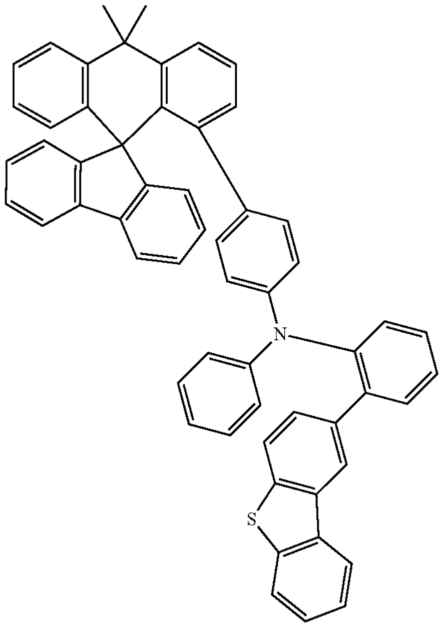
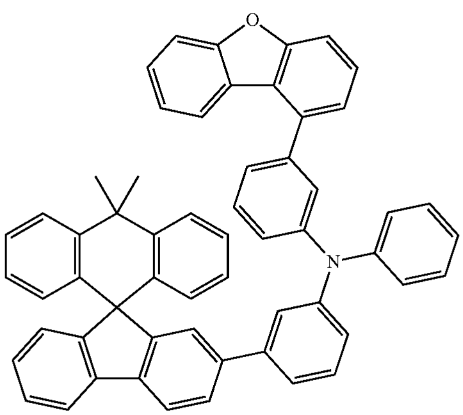
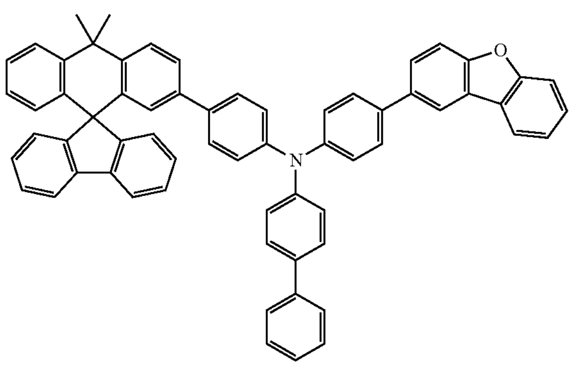
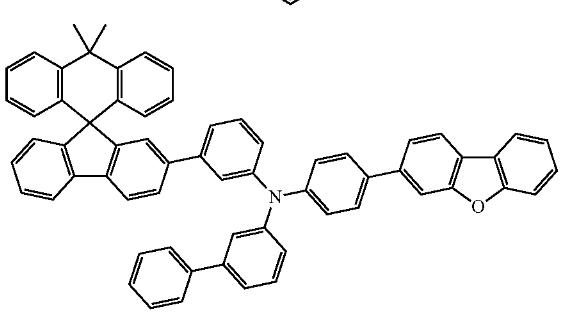
-continued
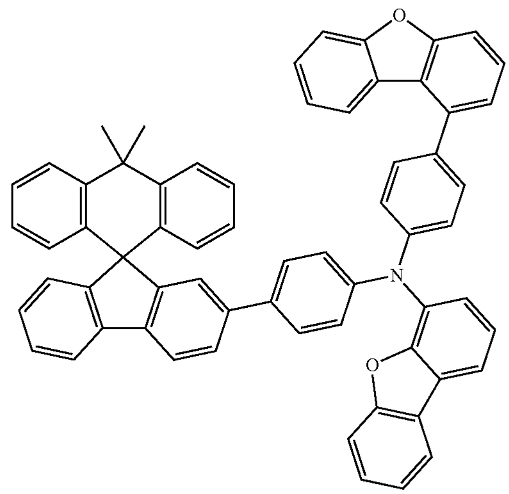
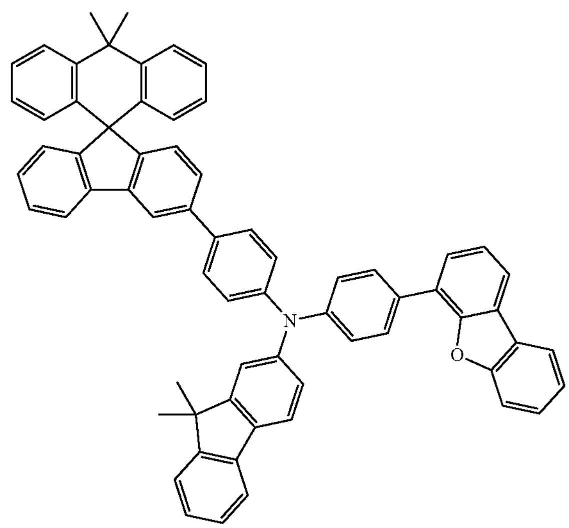
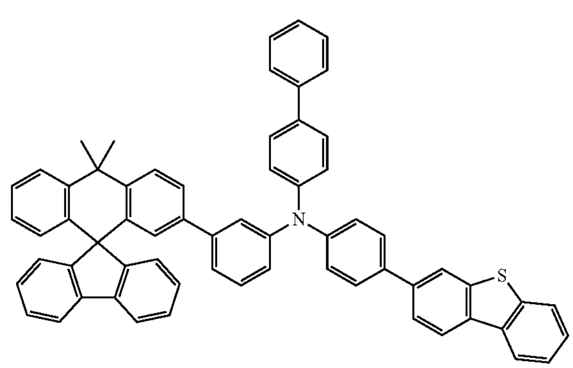

-continued
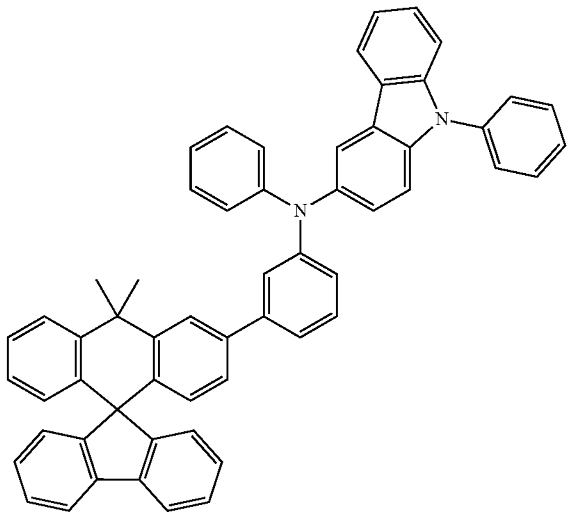
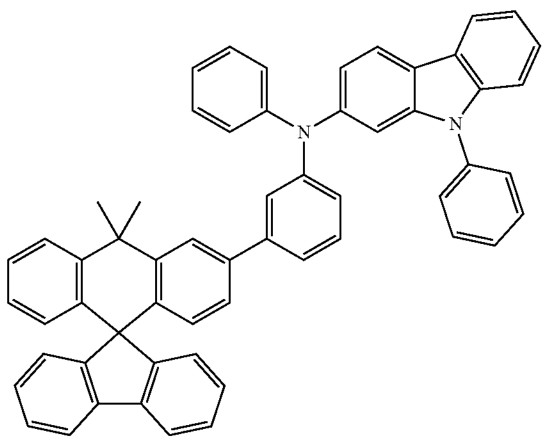
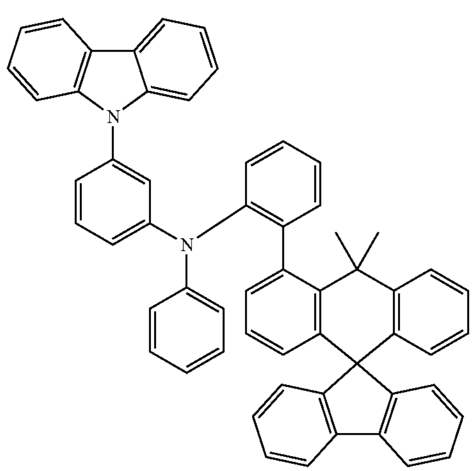
-continued
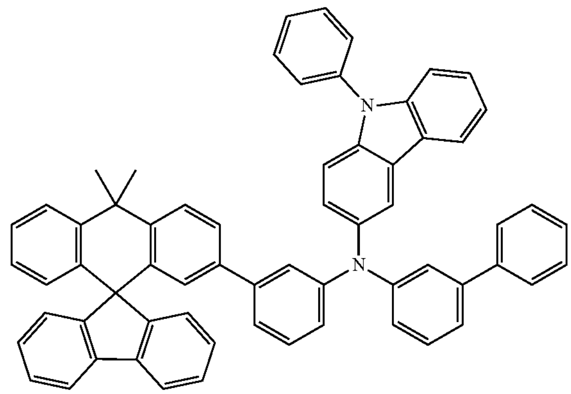
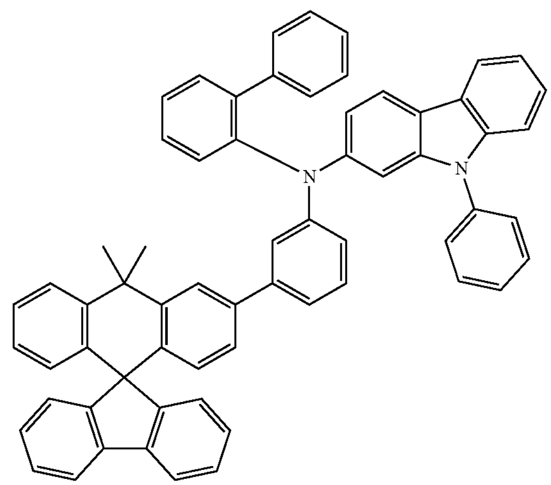
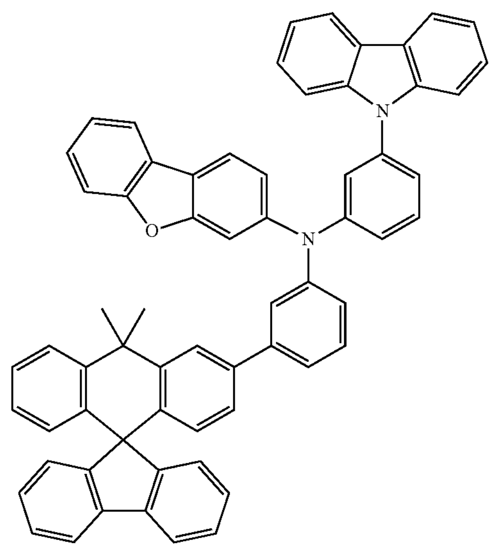

-continued
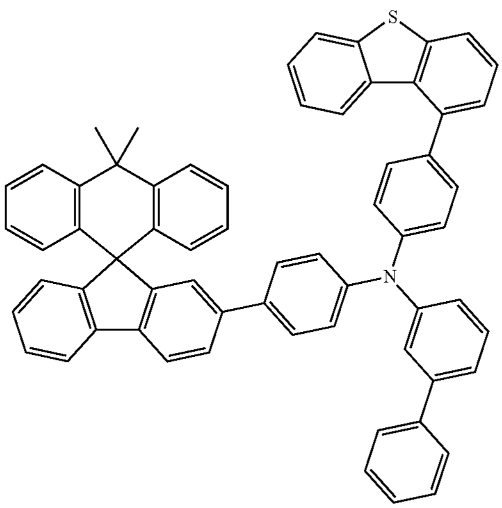
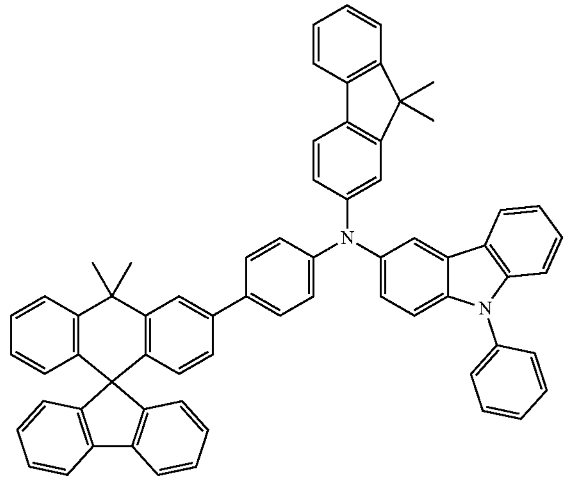
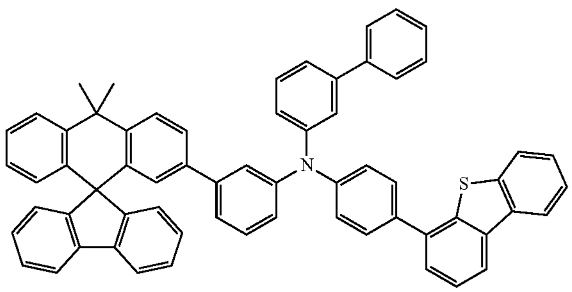
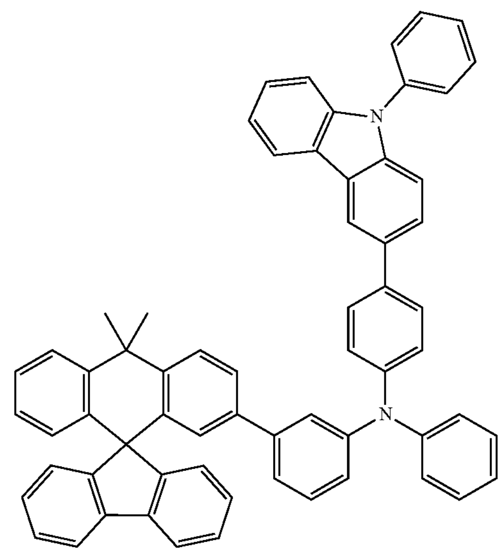
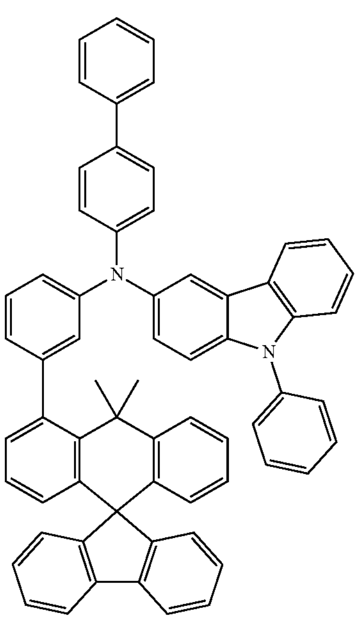
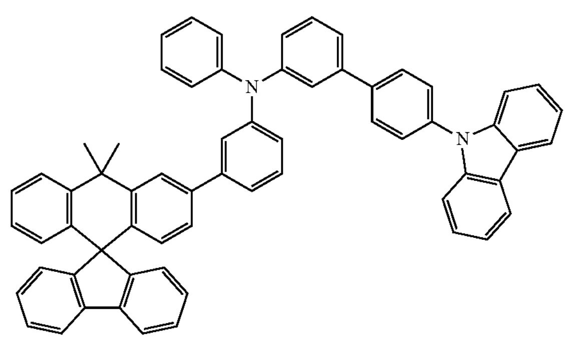
-continued -continued
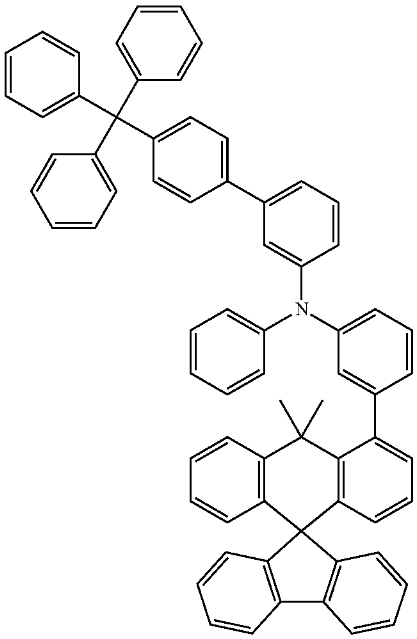
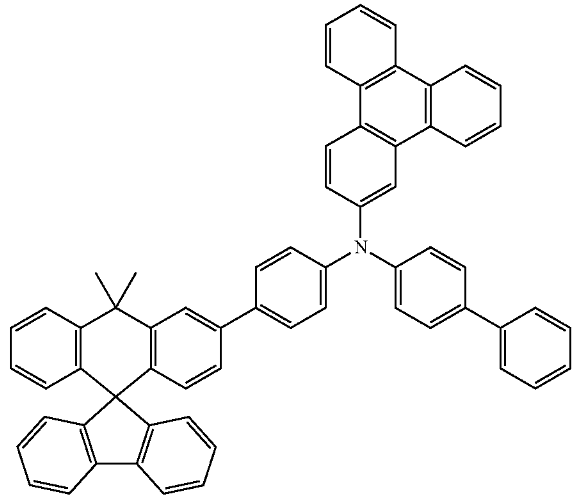
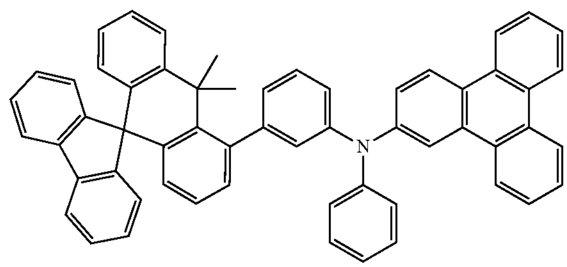
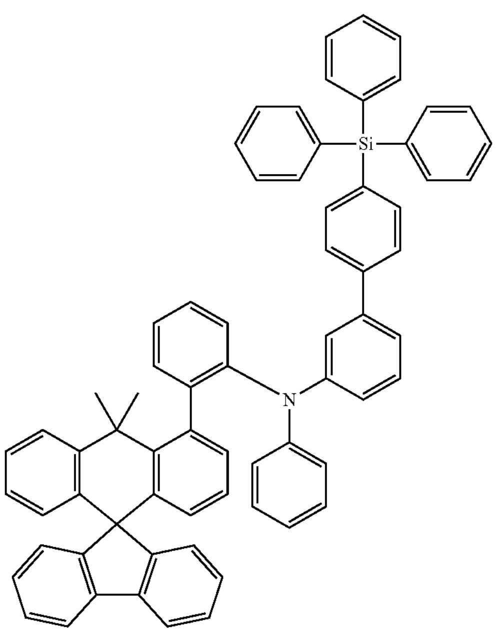
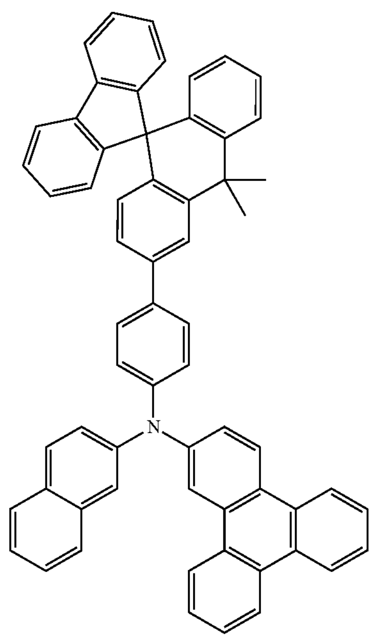

-continued
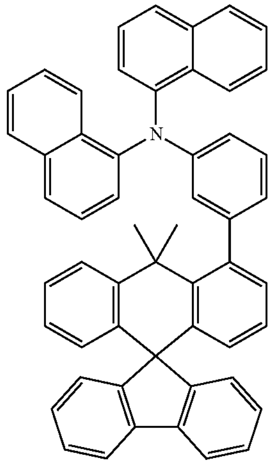
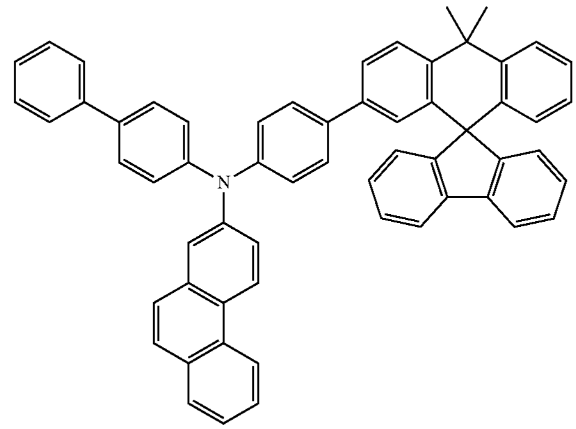
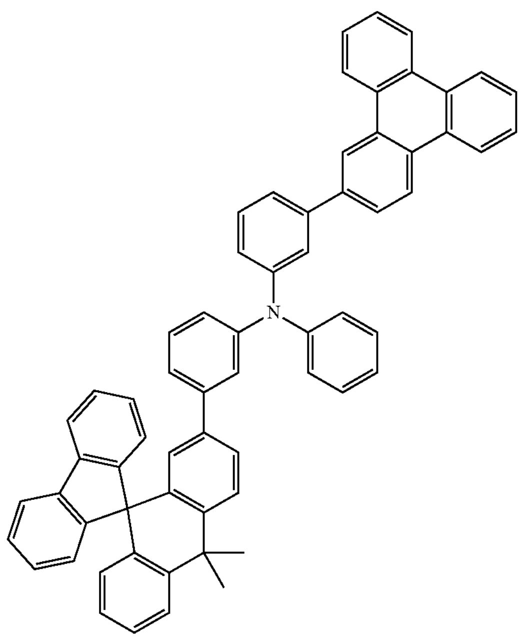
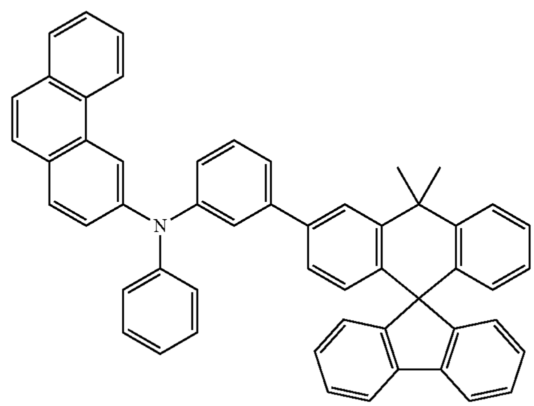
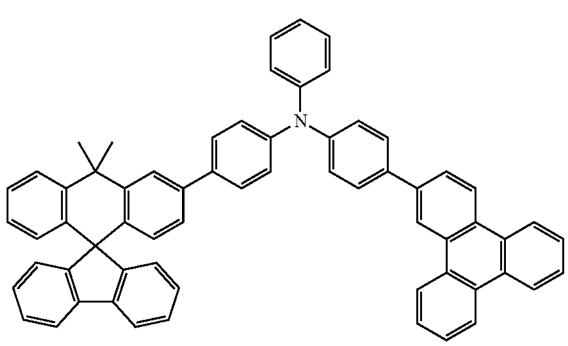
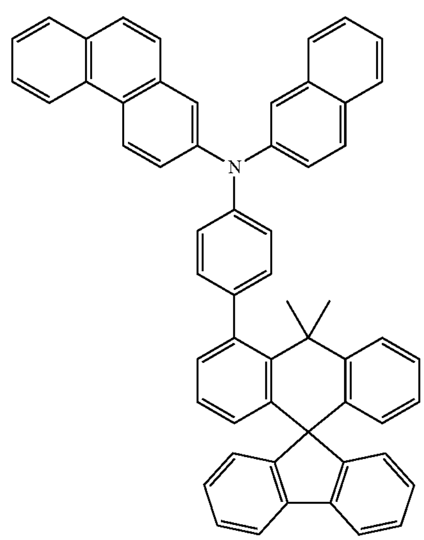
-continued -continued
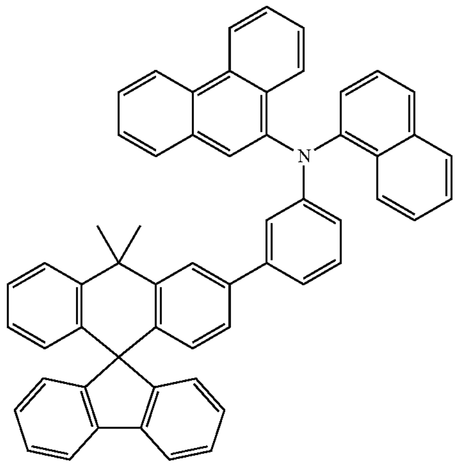
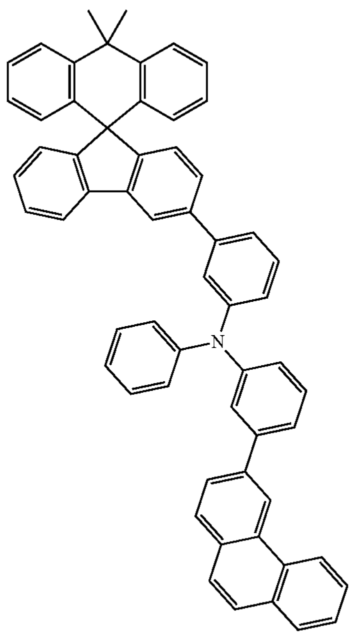
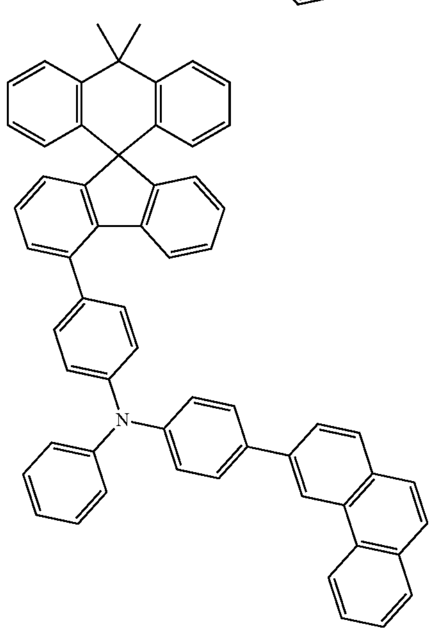
-continued
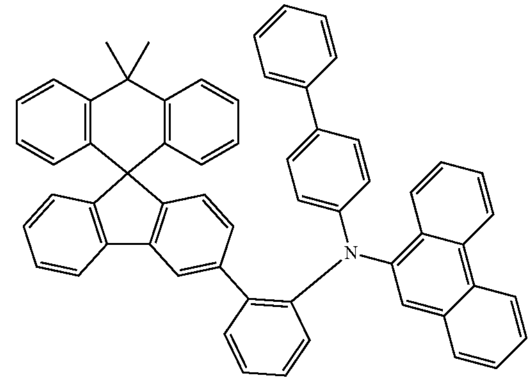
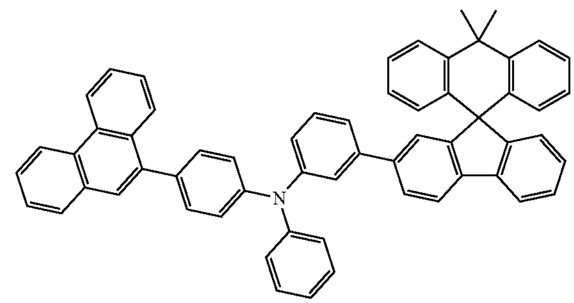
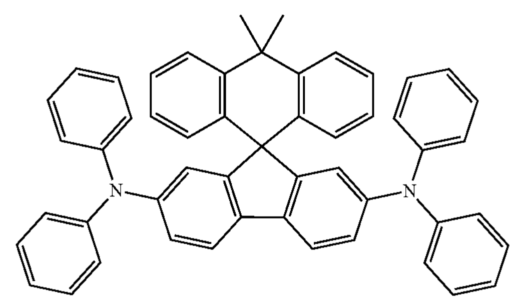
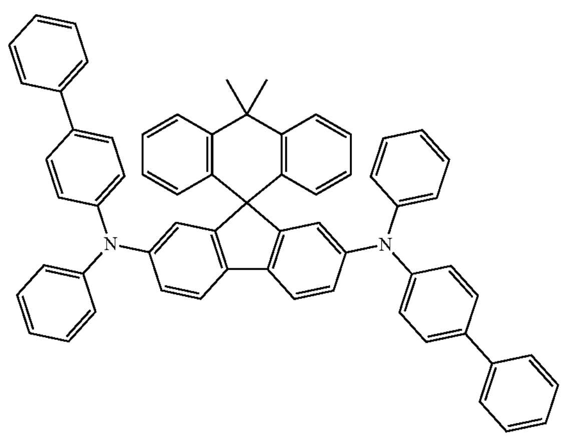
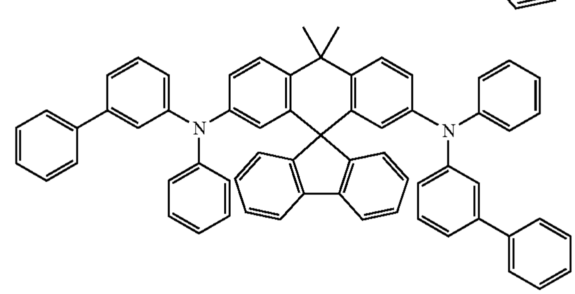

-continued
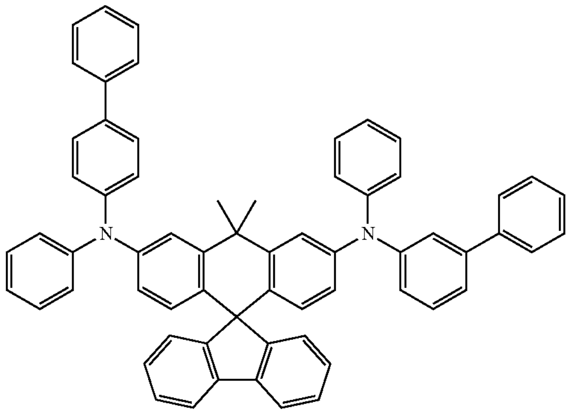
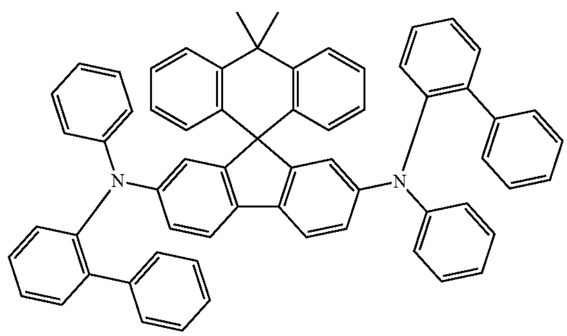
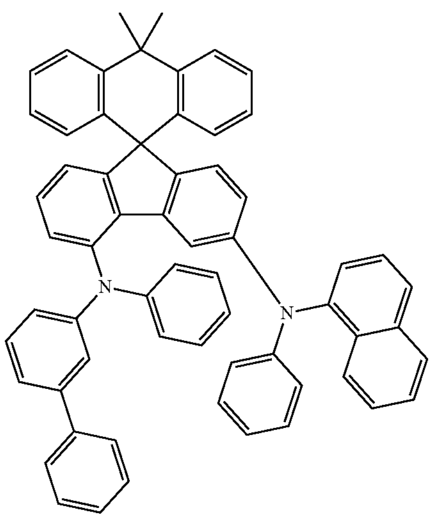
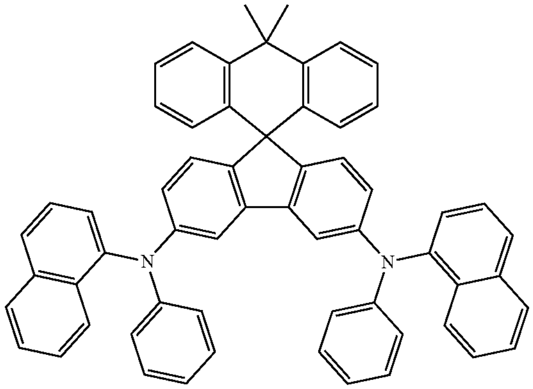
-continued
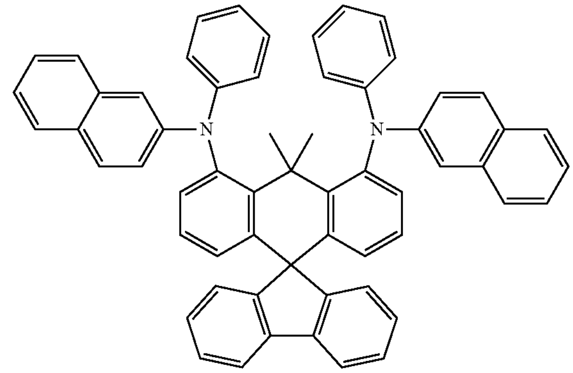
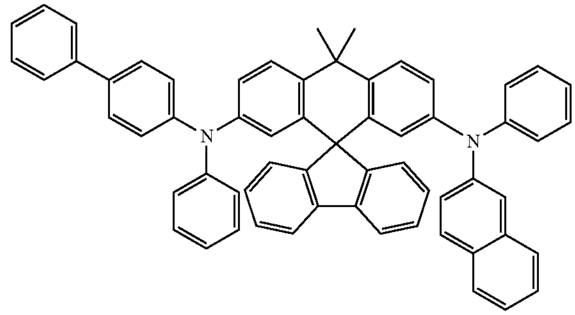
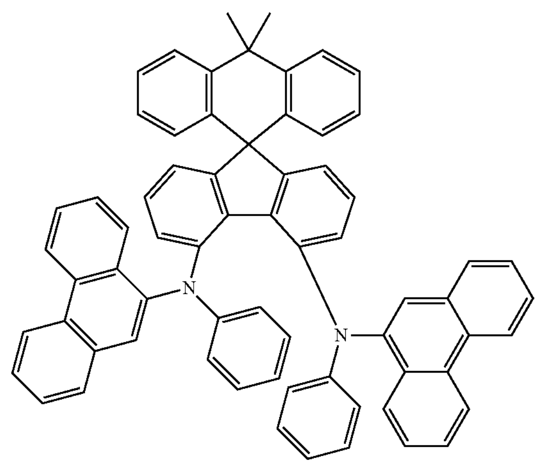
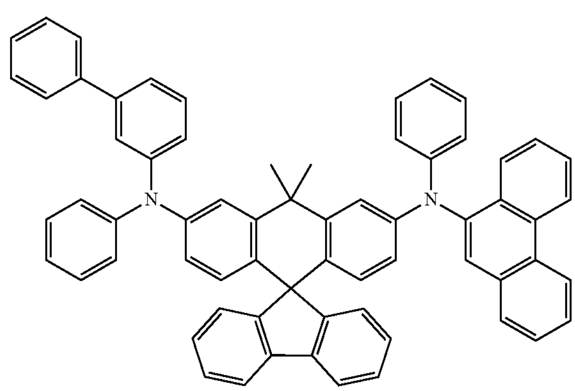

-continued
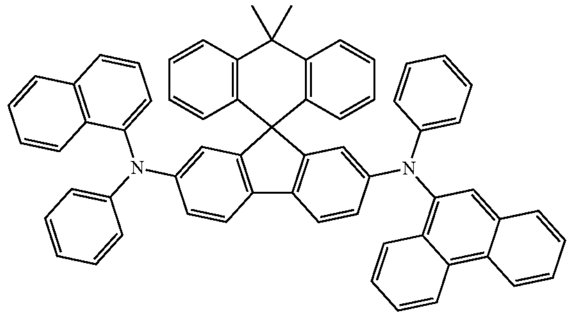
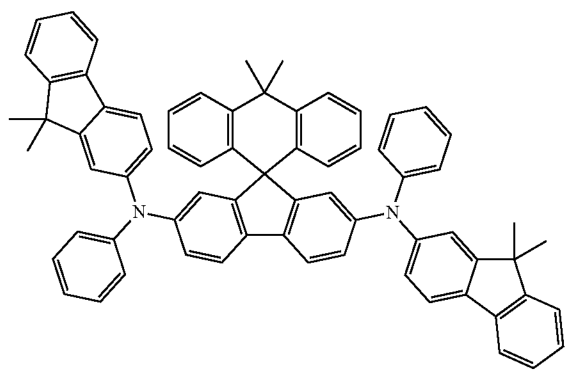
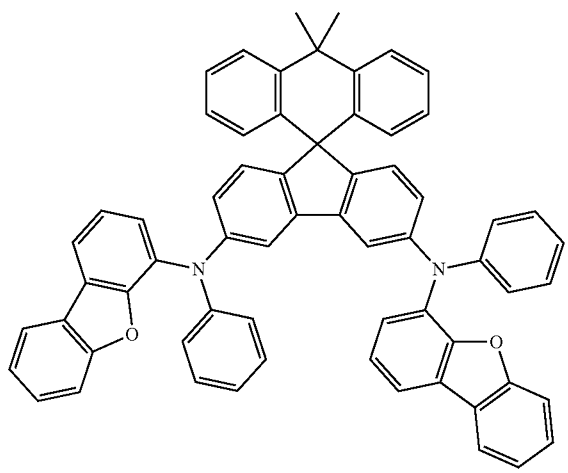
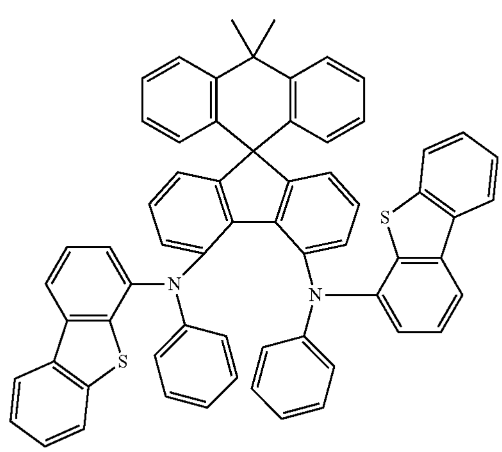
-continued
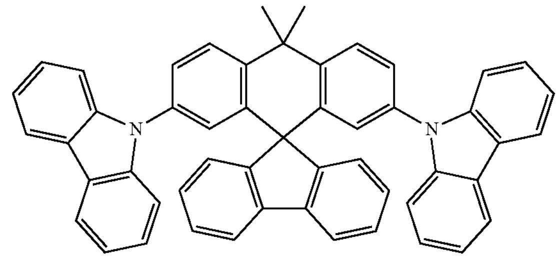
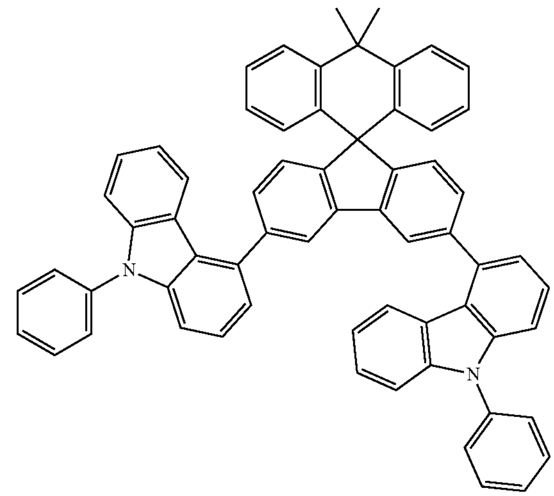
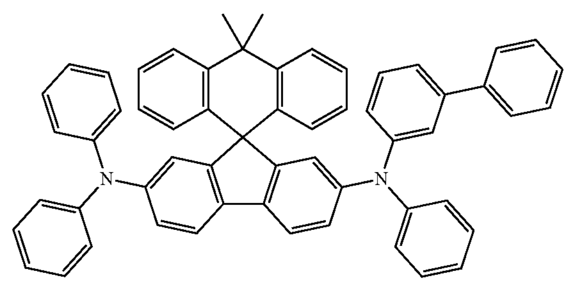
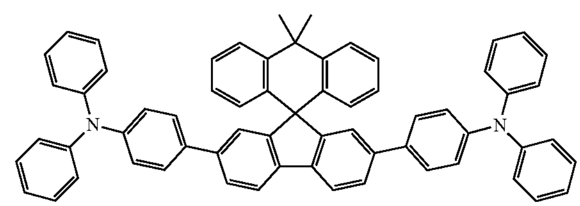
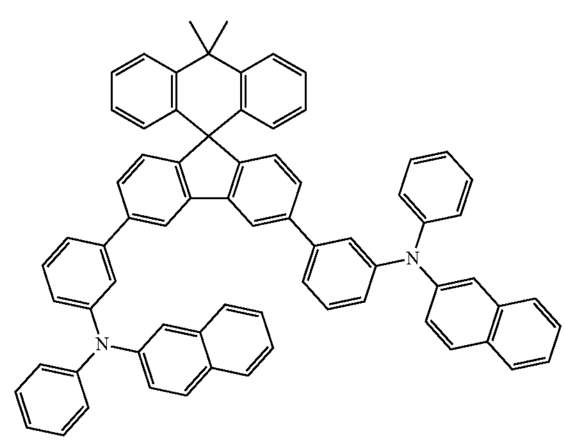

-continued
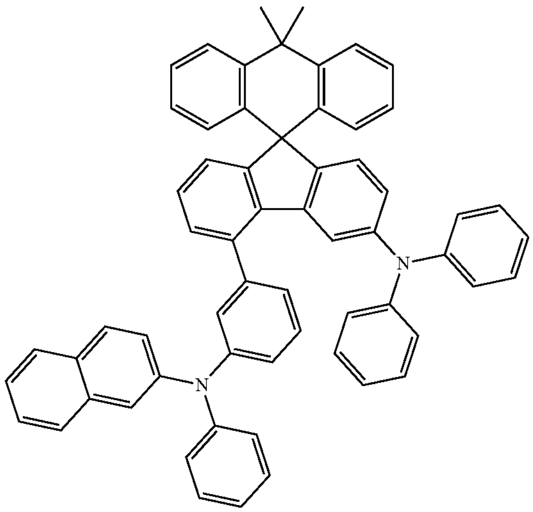
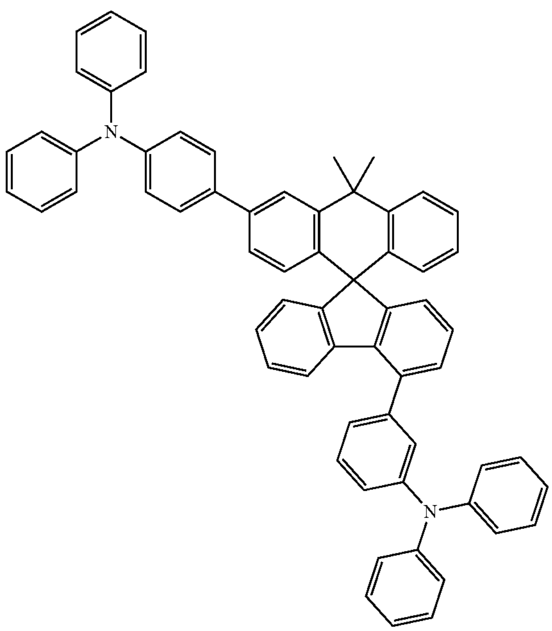
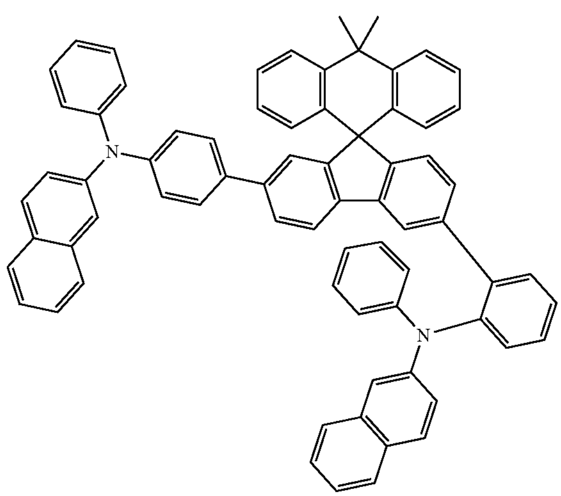
-continued
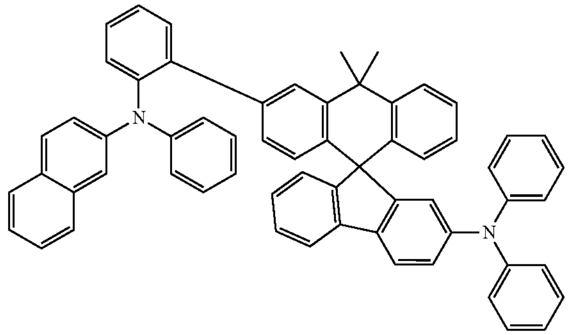
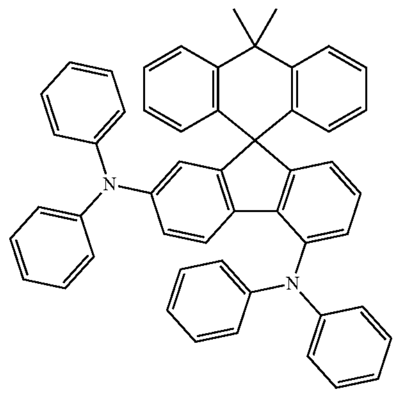
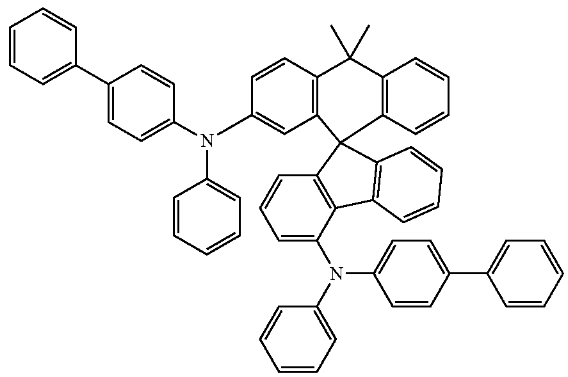
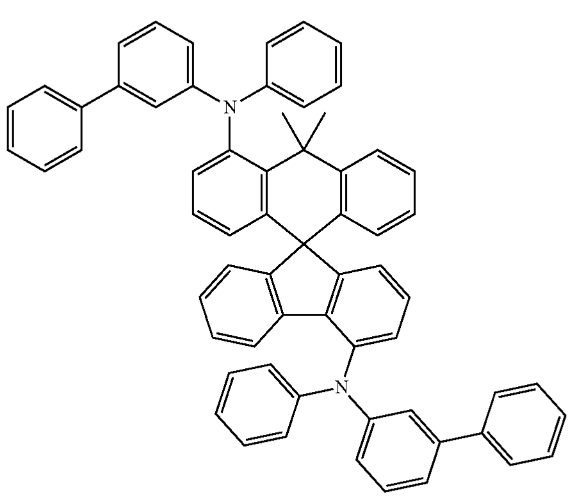

-continued
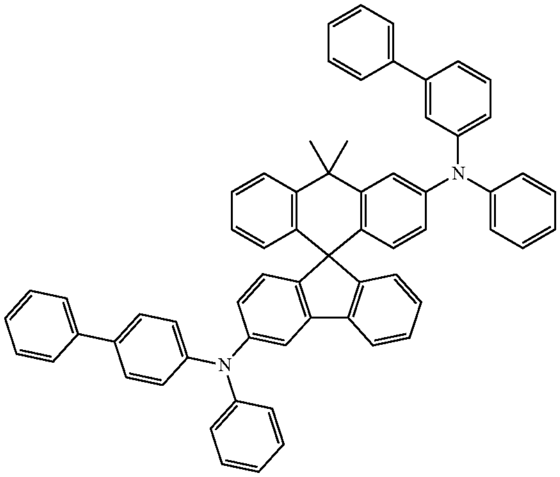
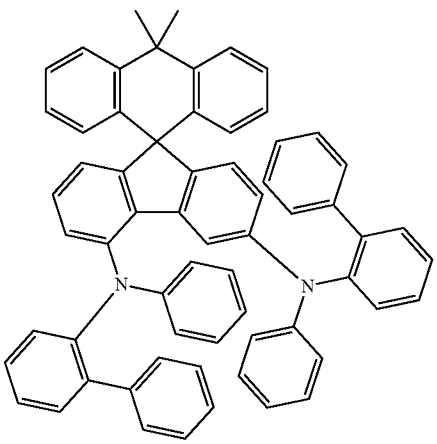
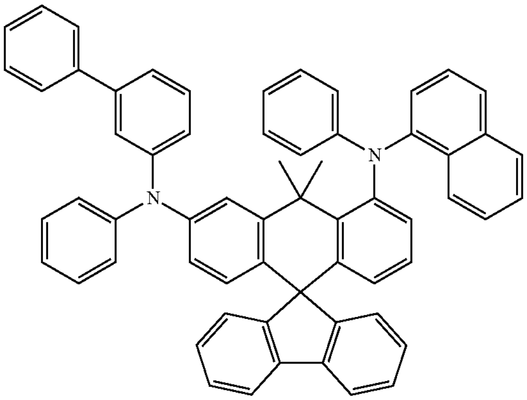
-continued
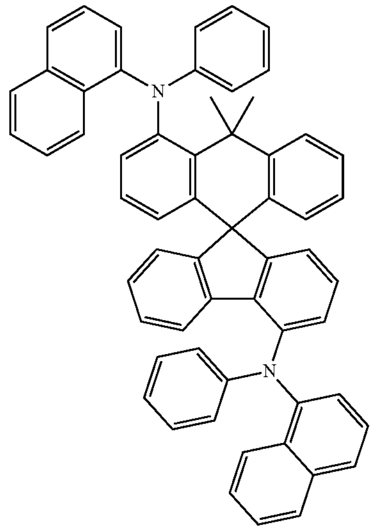
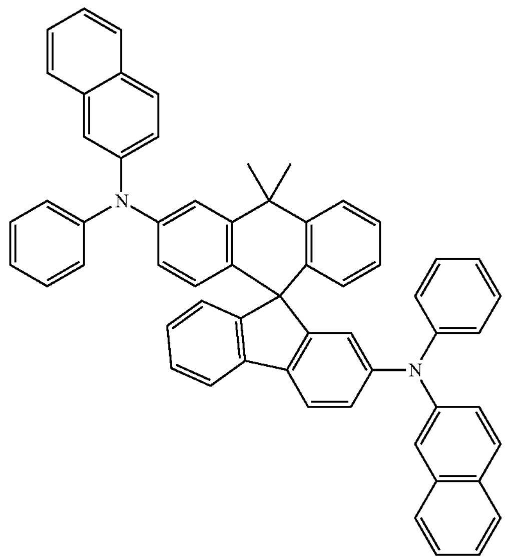
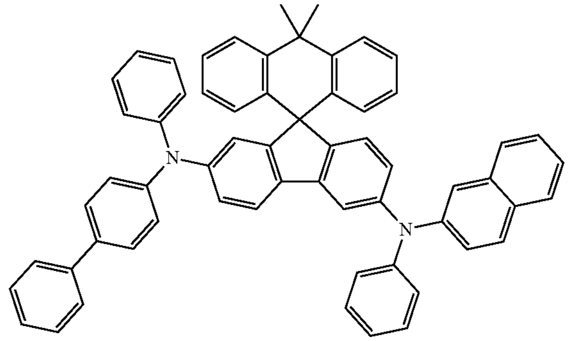

-continued
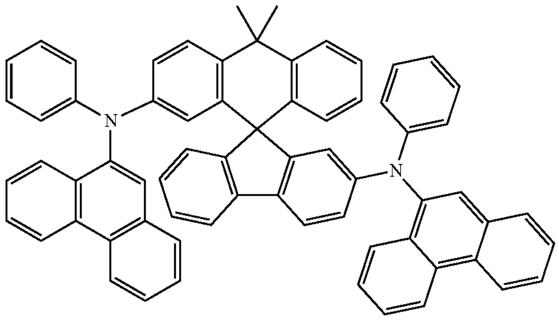
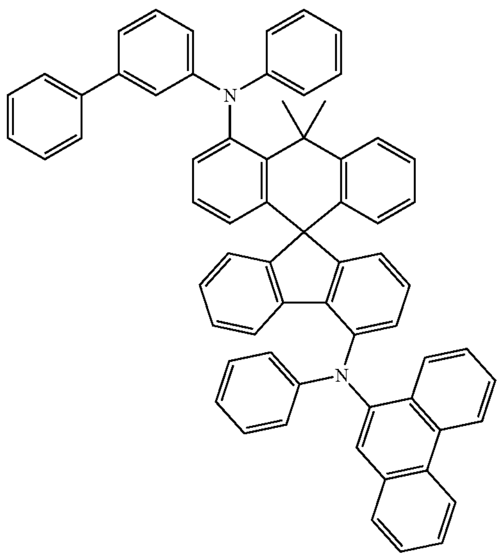
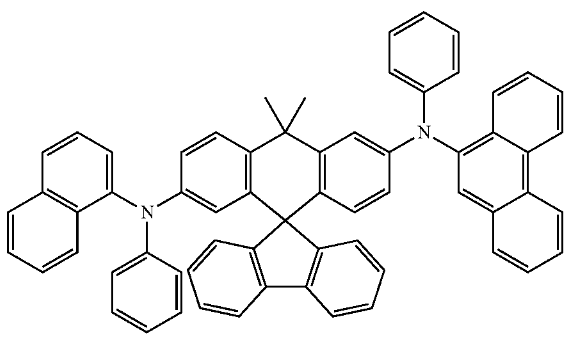
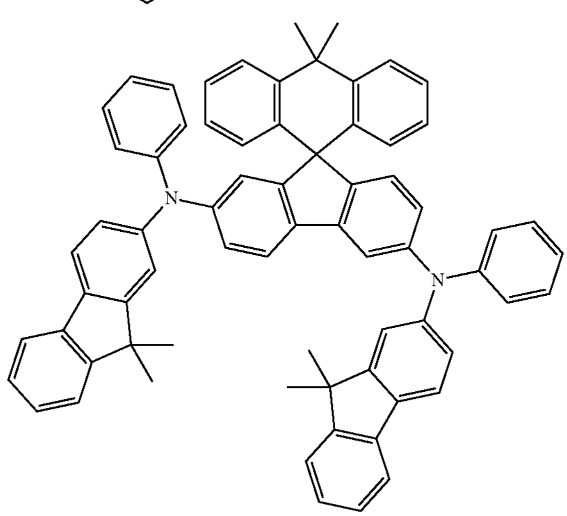
-continued
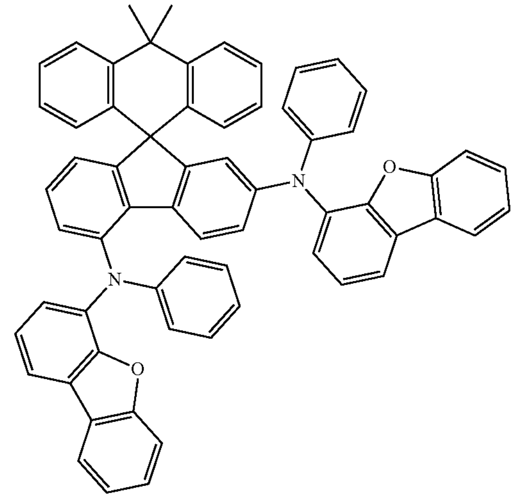
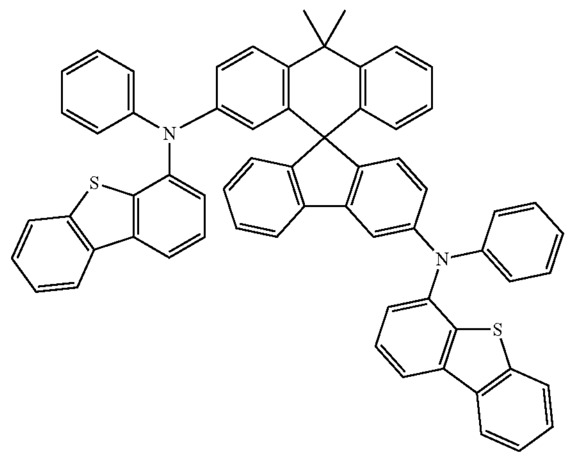
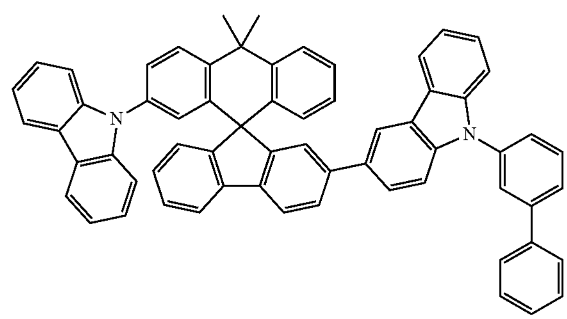
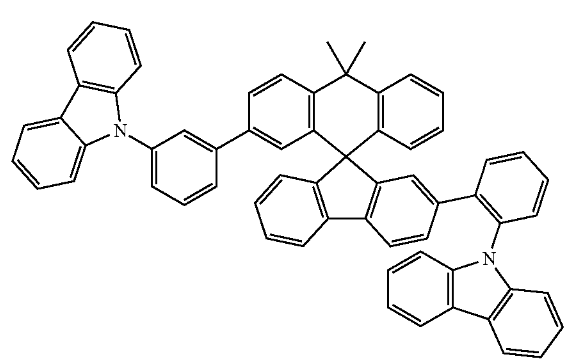

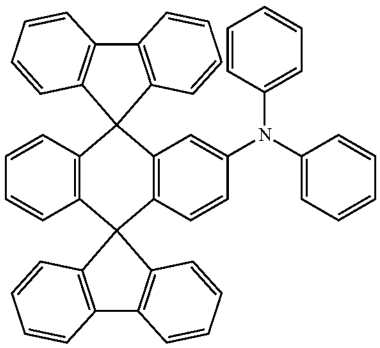
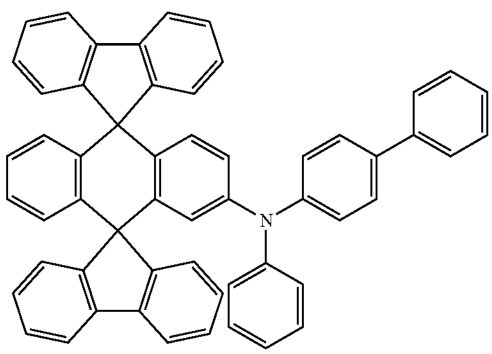
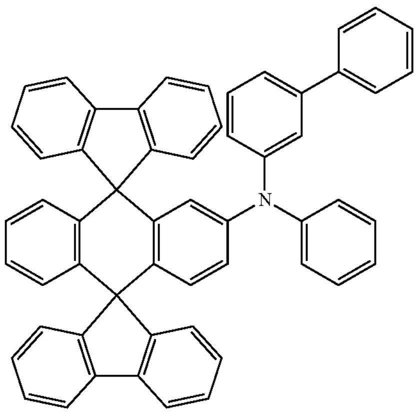
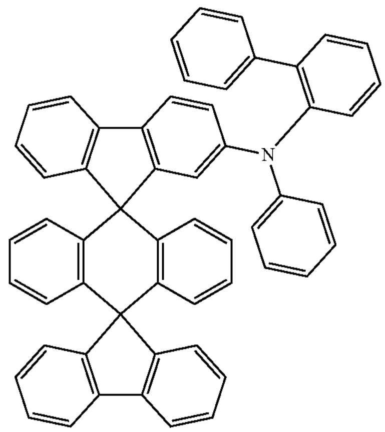
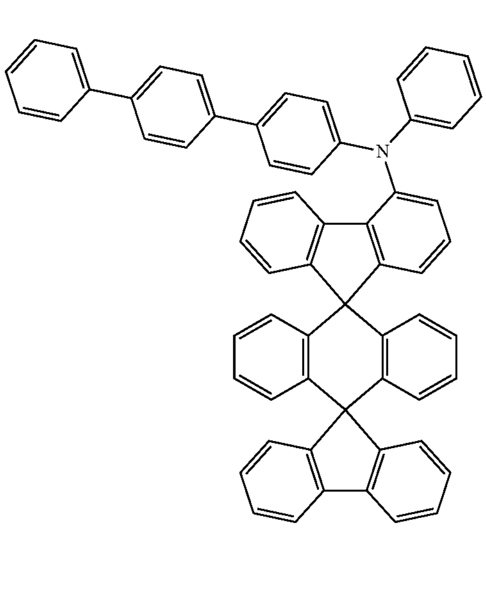
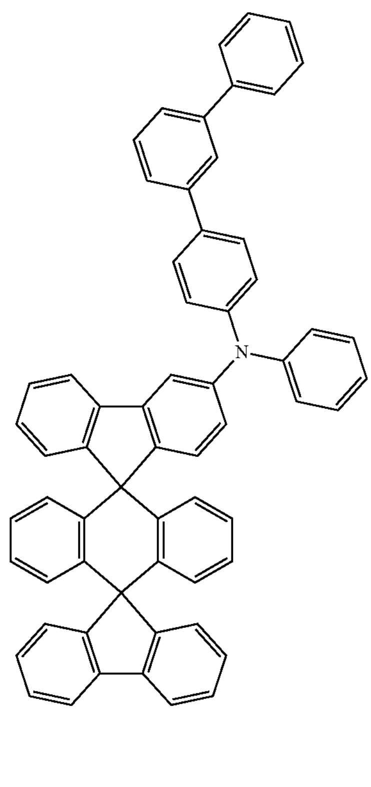

-continued
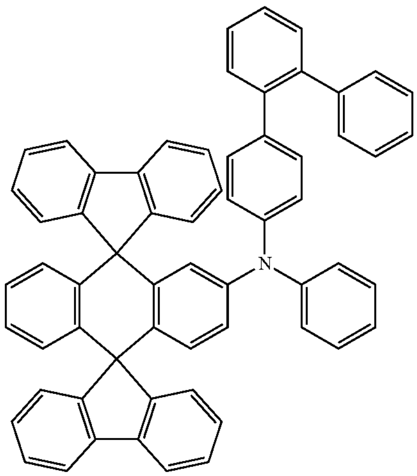
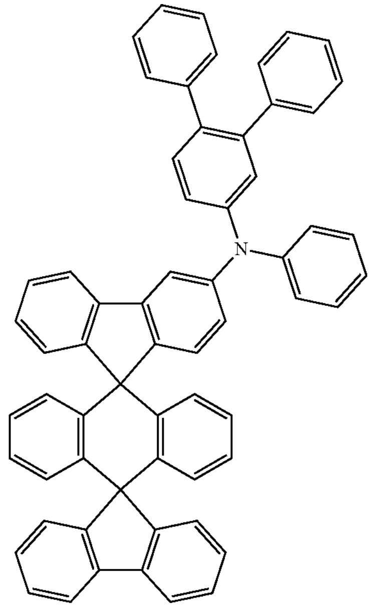
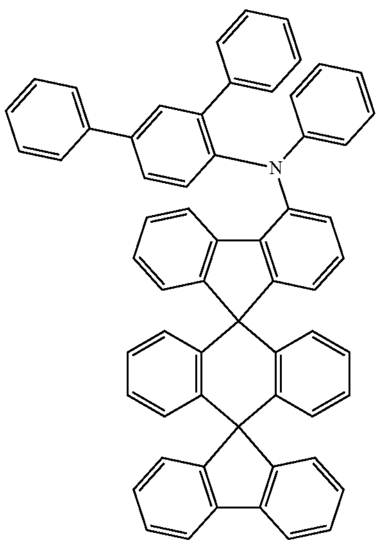
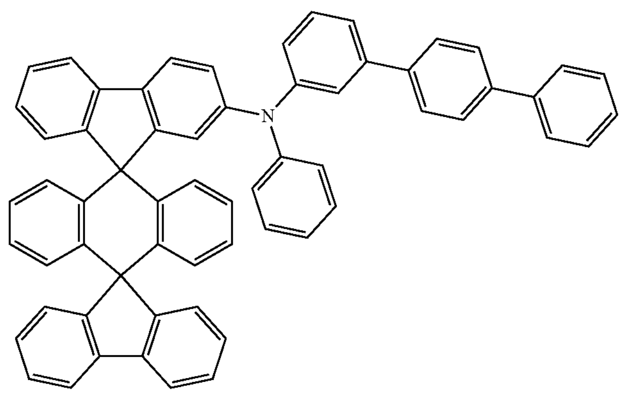
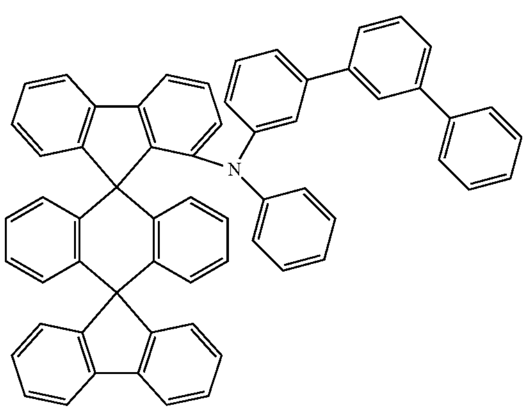
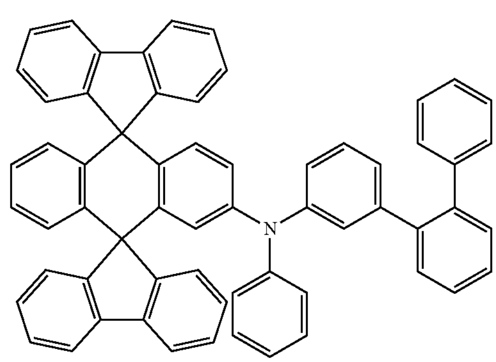

-continued
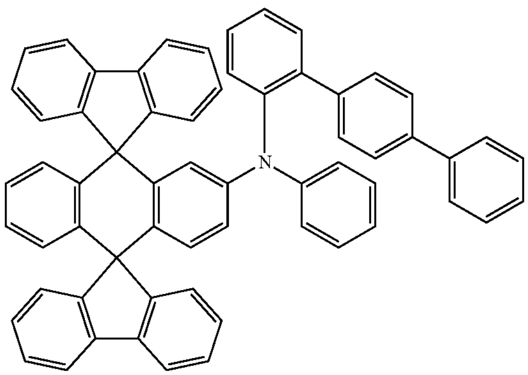
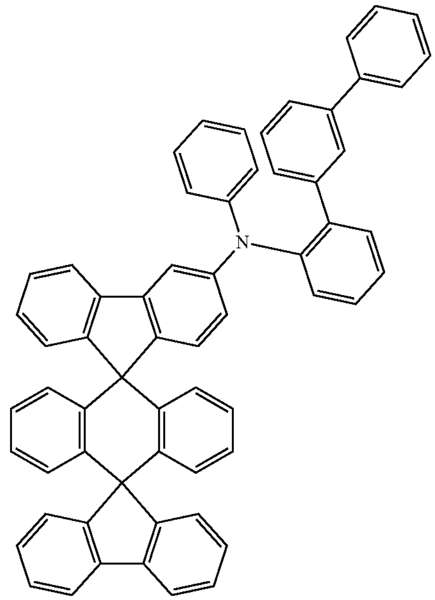
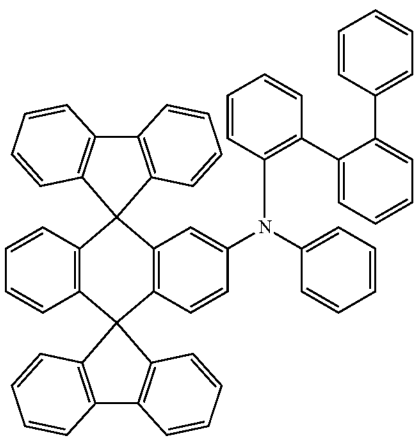
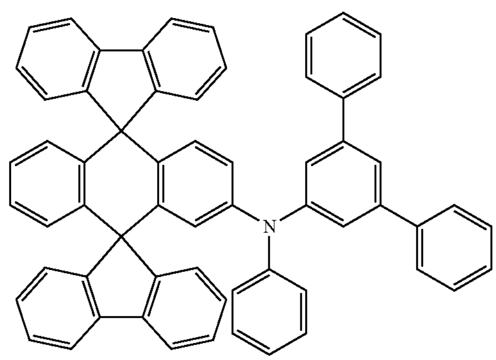
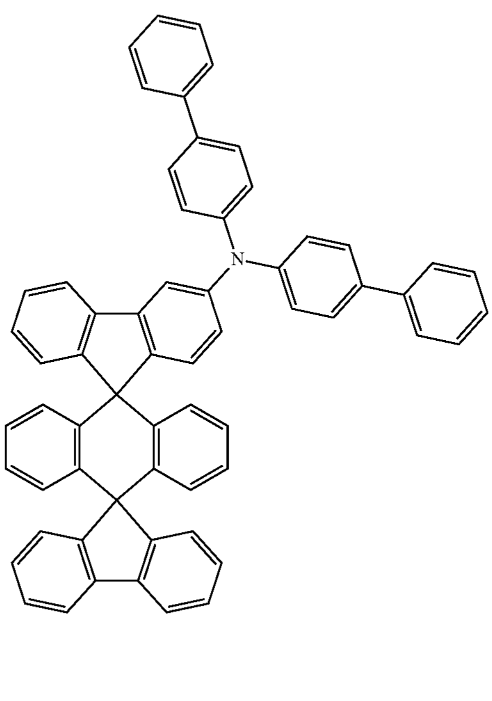
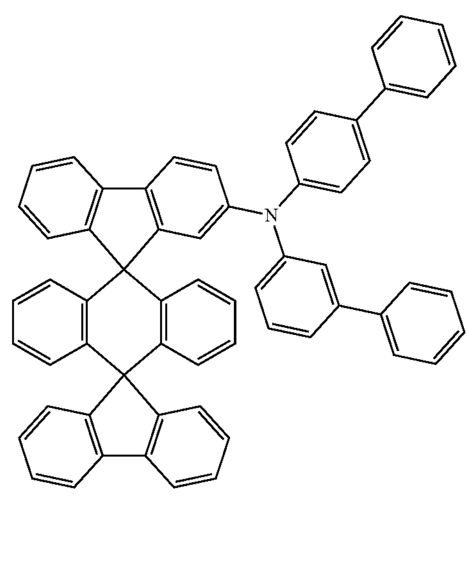

-continued
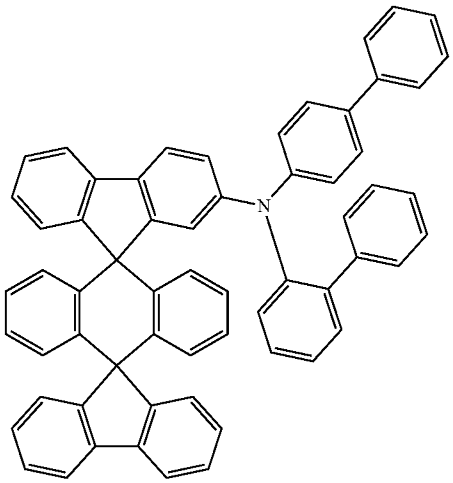
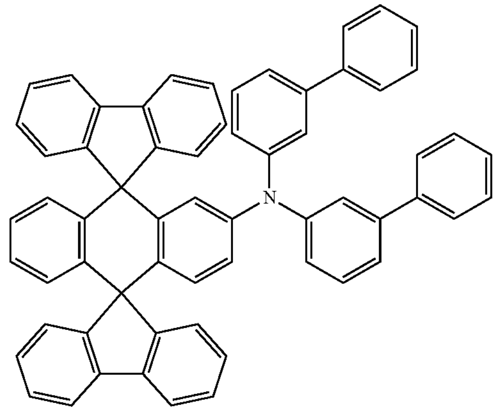
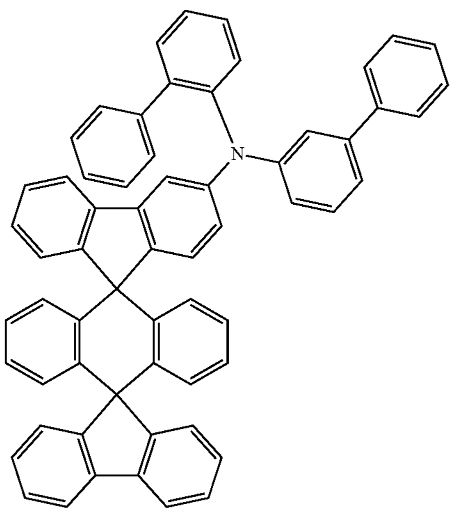
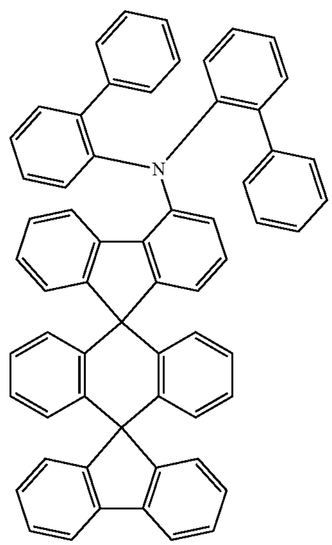
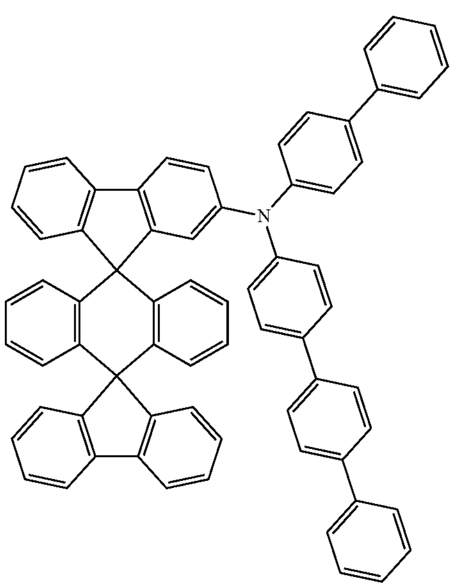
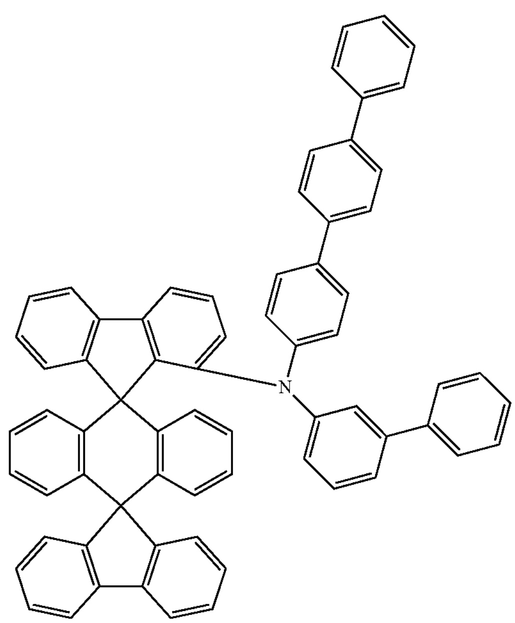

-continued
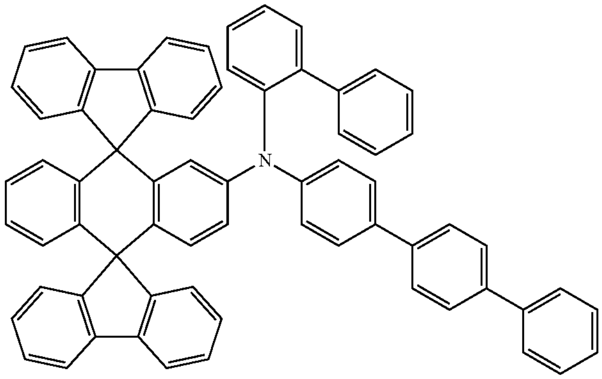
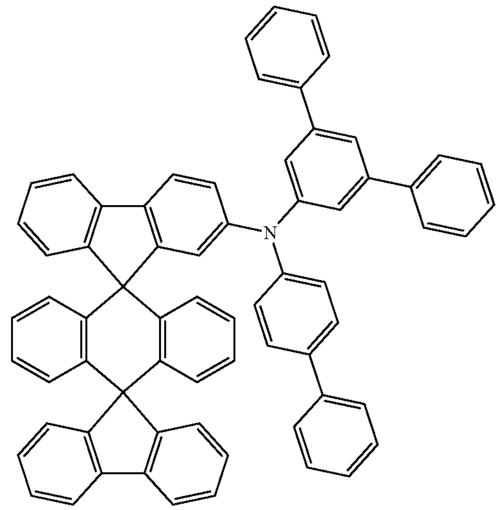
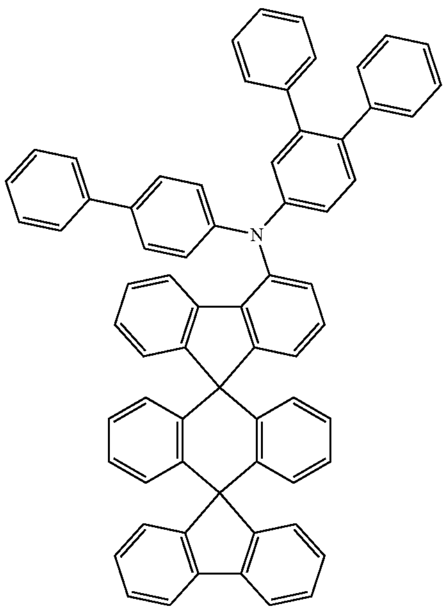
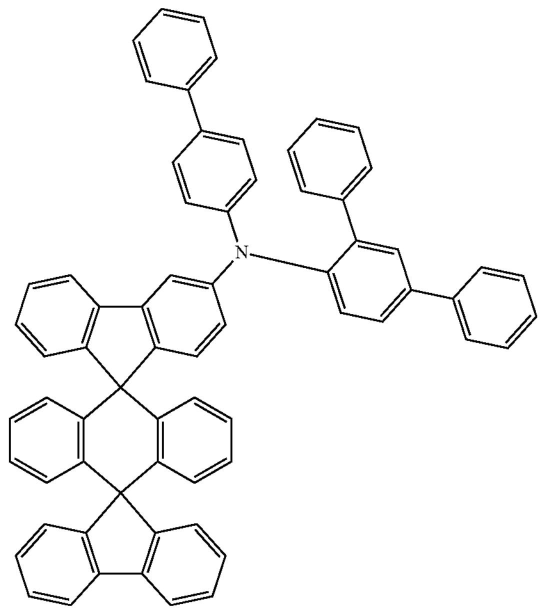
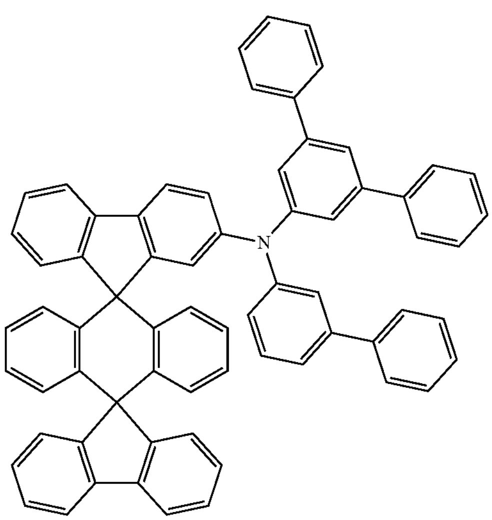
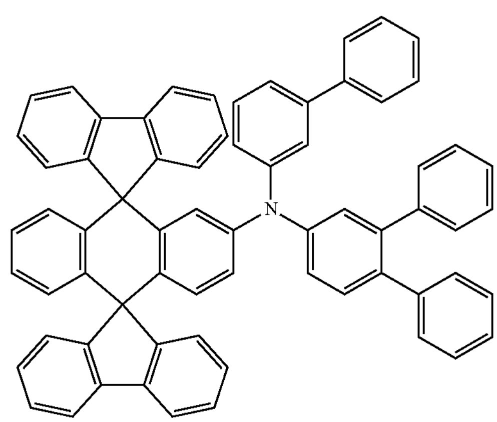

-continued
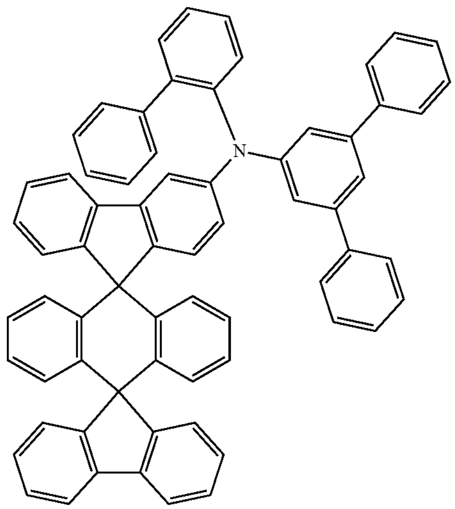
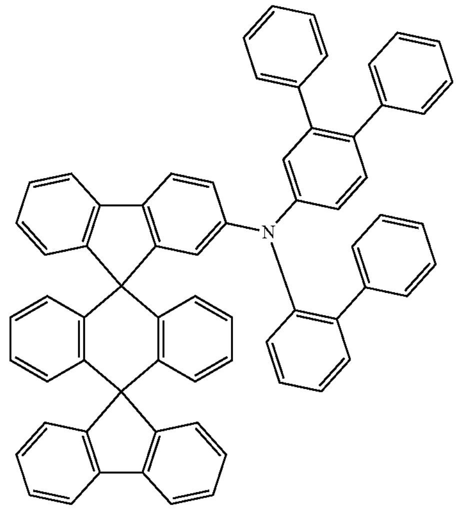
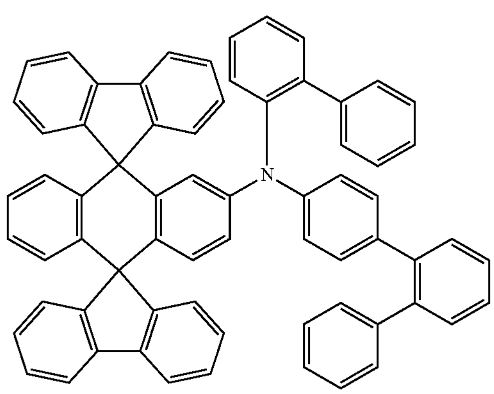
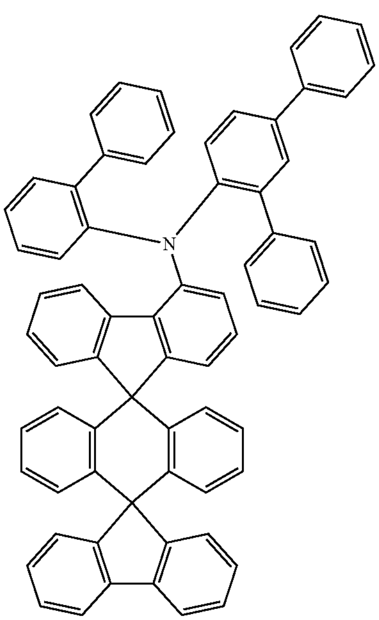

-continued
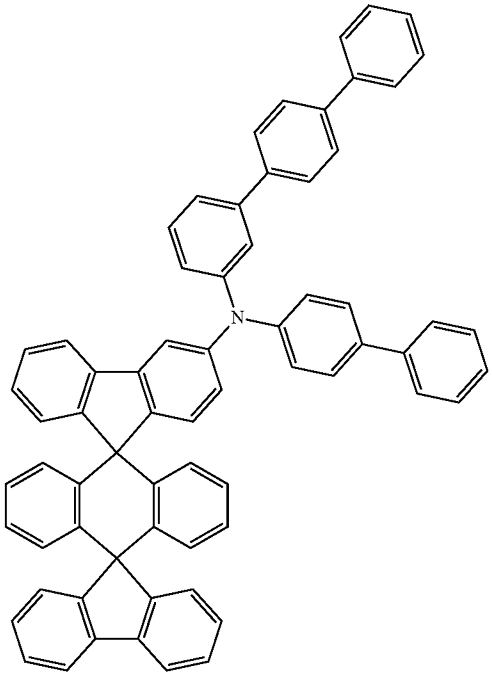
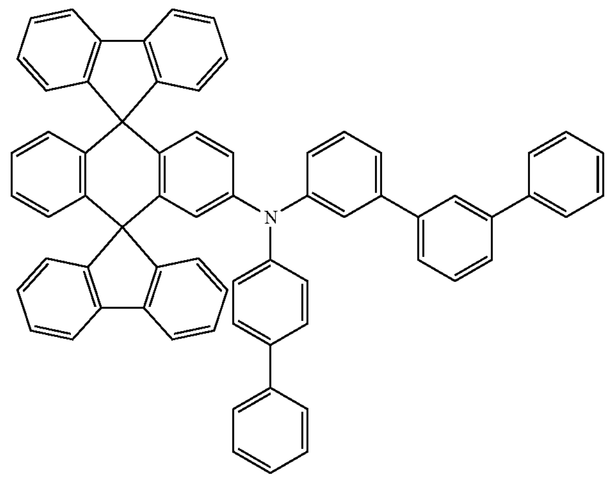
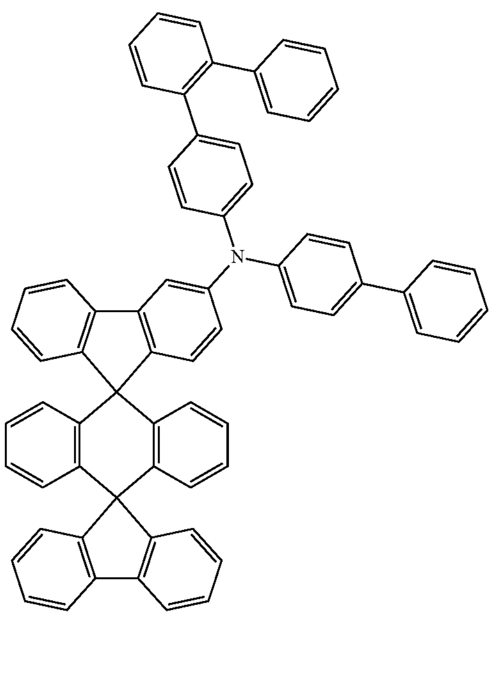
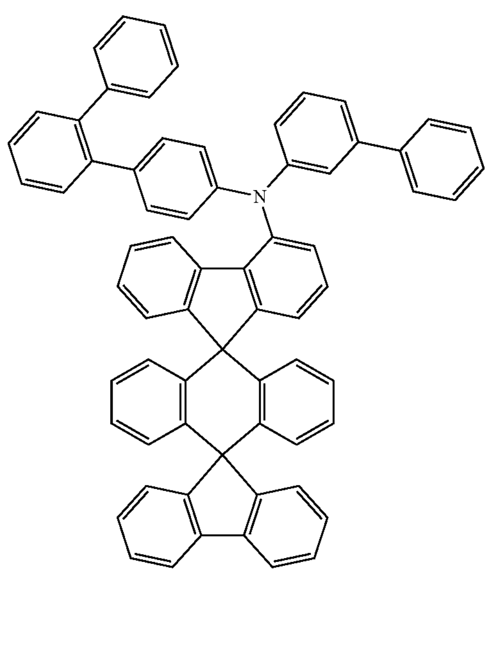

-continued
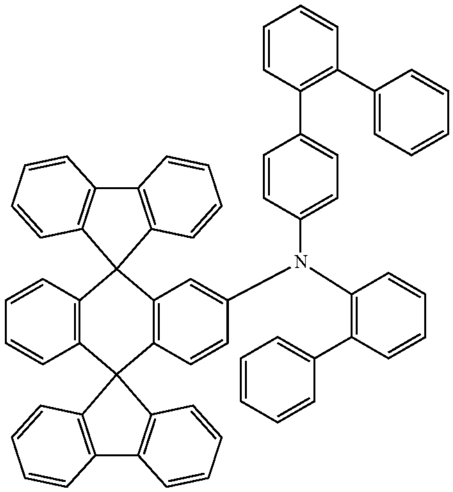
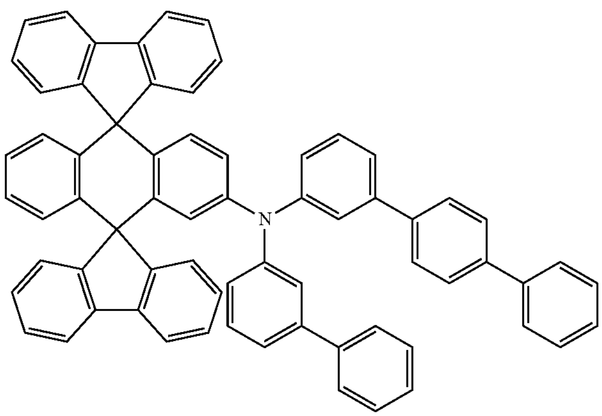
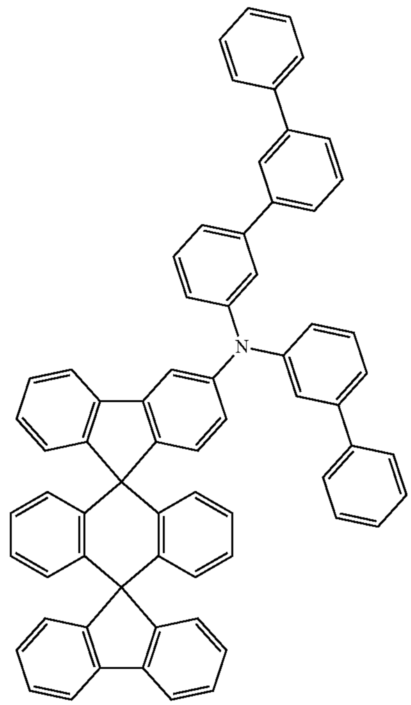
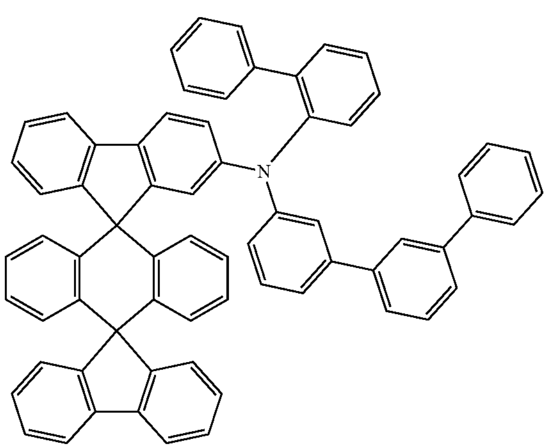
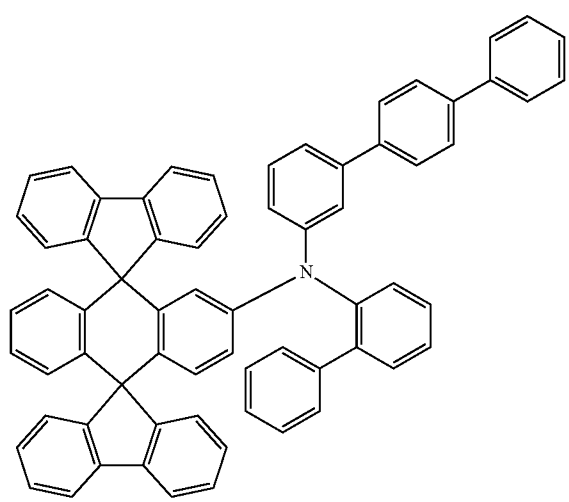

-continued
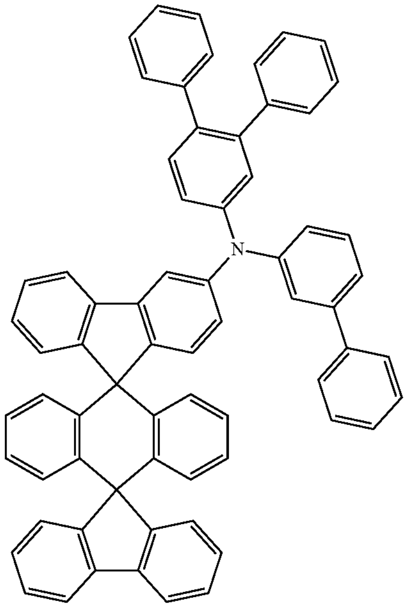
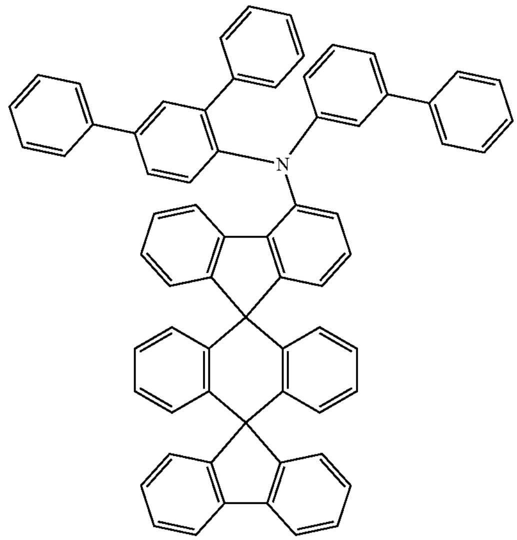
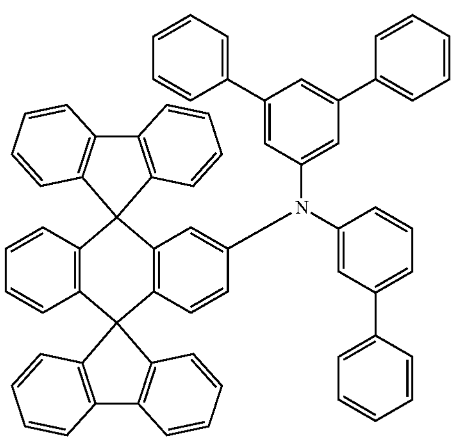
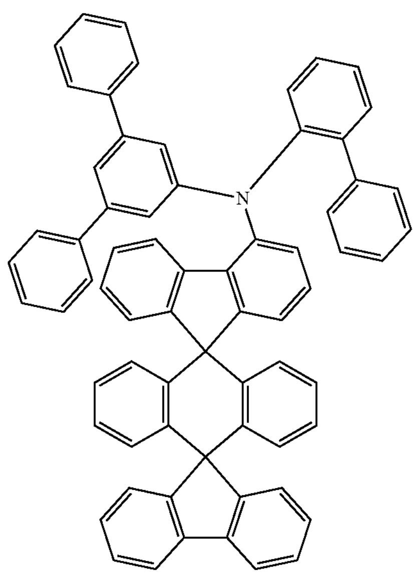

-continued
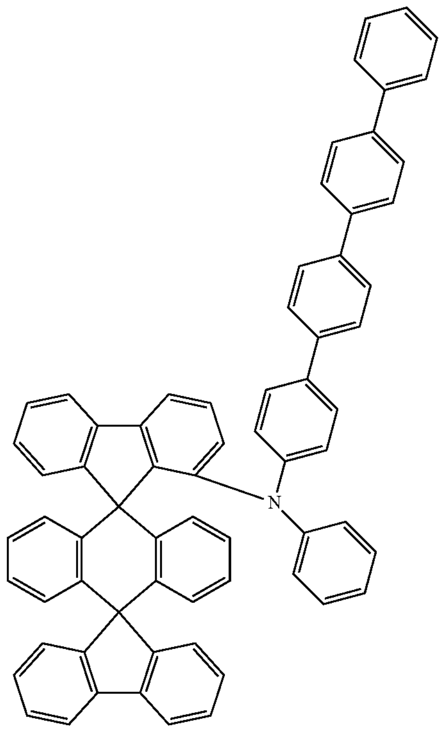
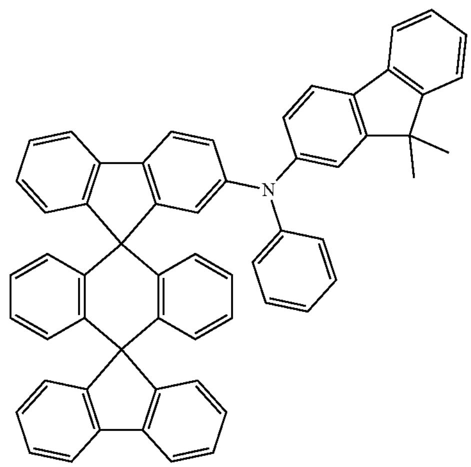
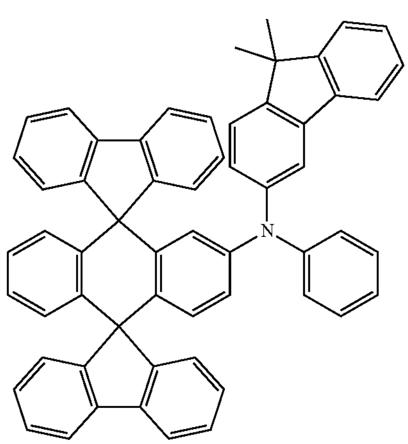
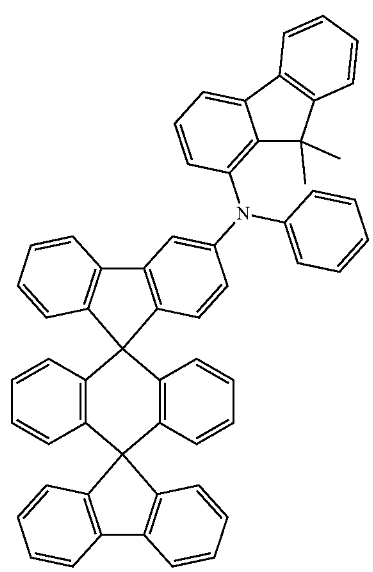

-continued
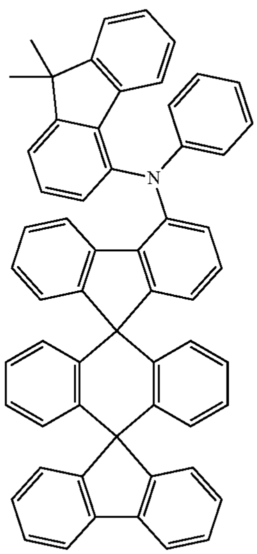
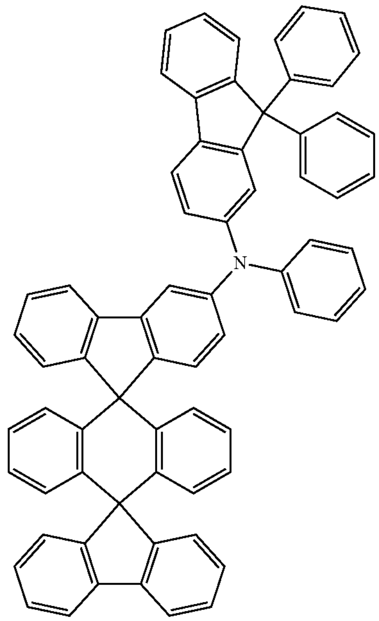
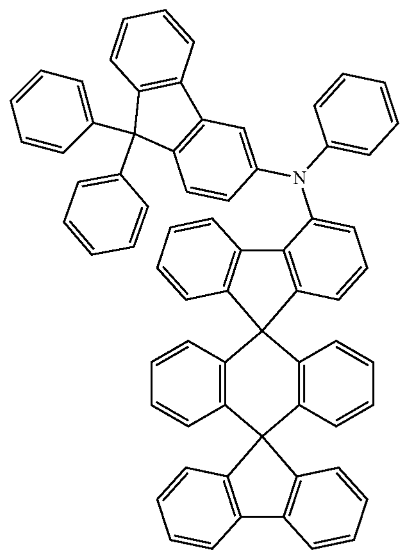
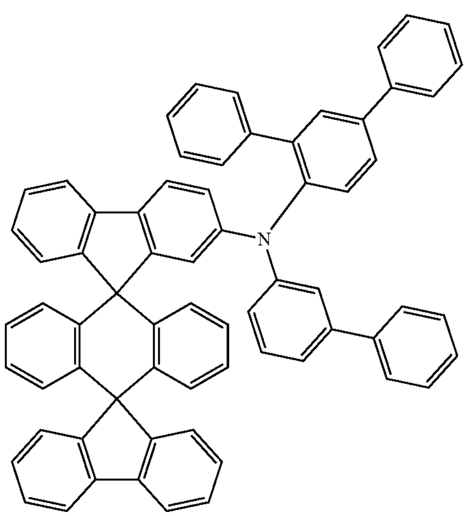
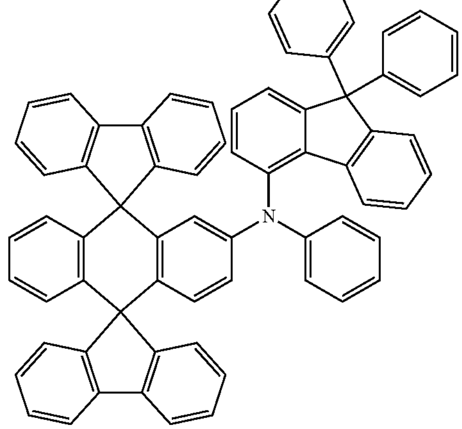

-continued
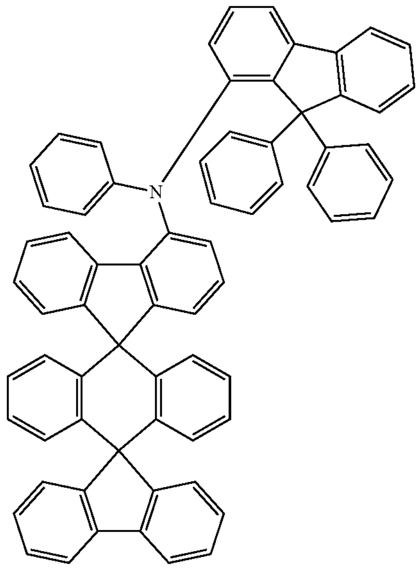
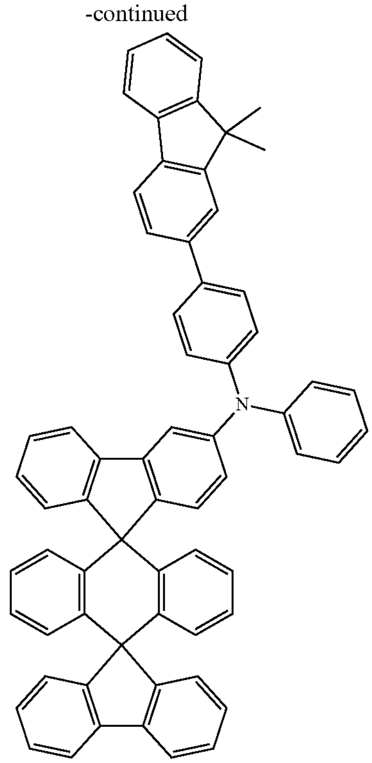
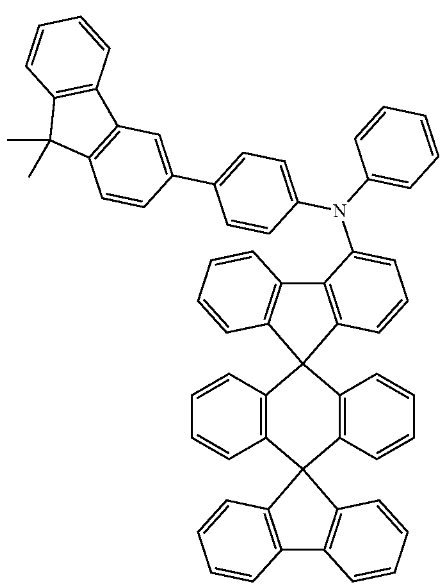
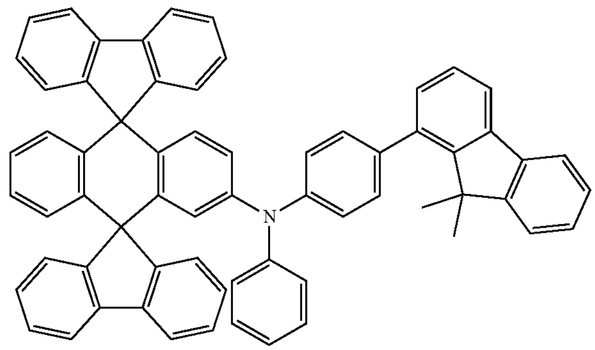

-continued
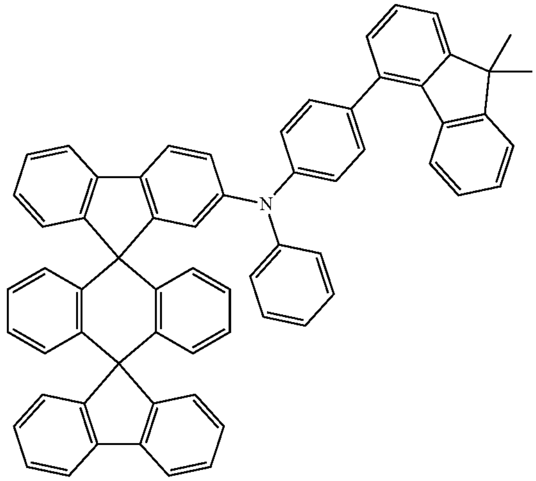
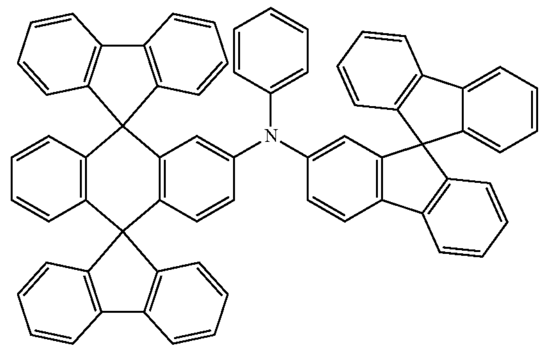
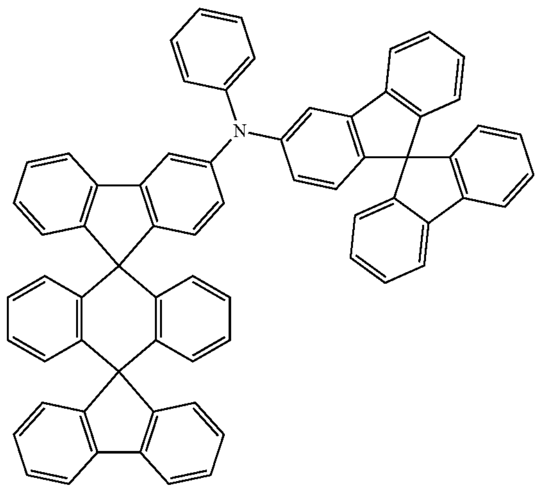
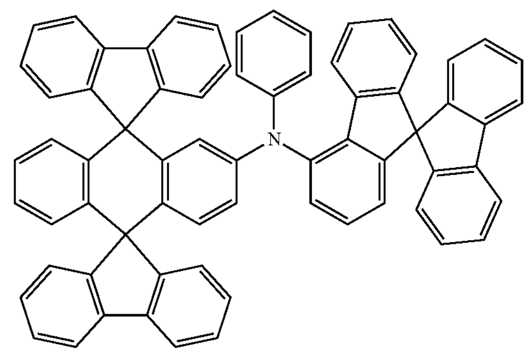
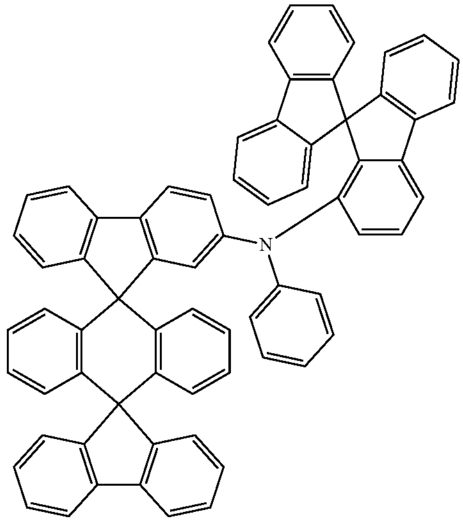
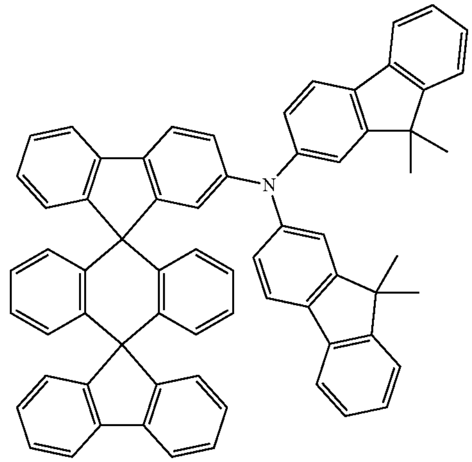

-continued
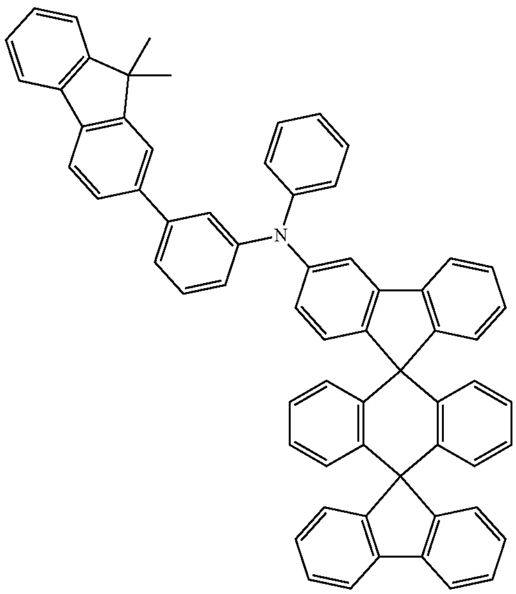
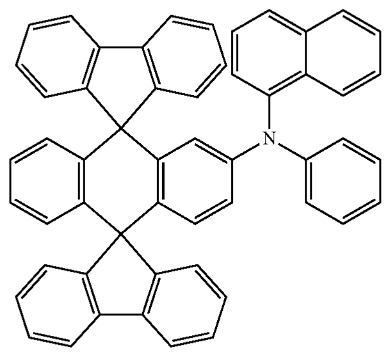
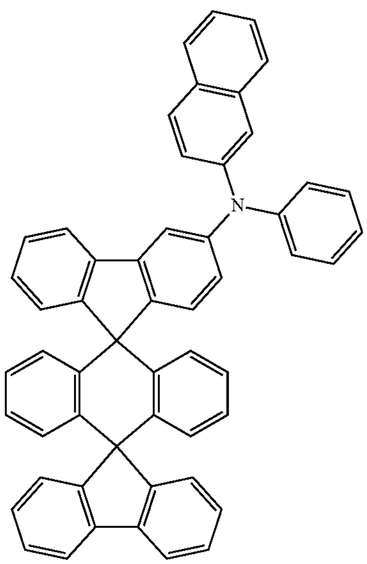
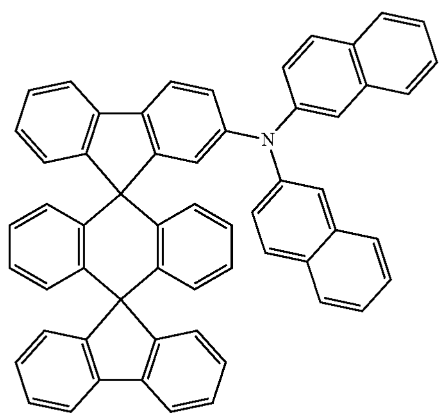
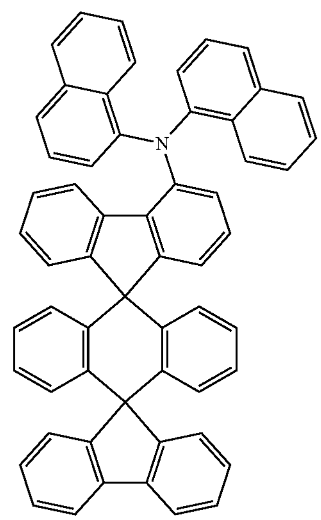
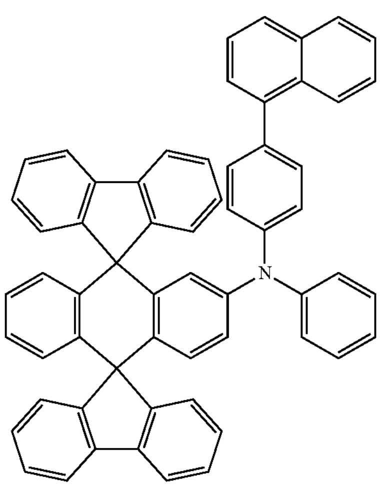
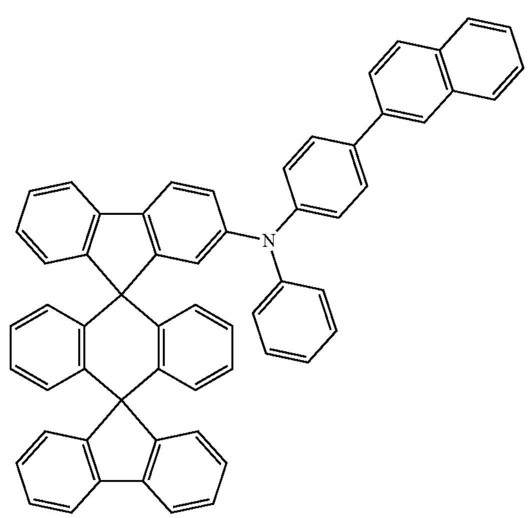

-continued
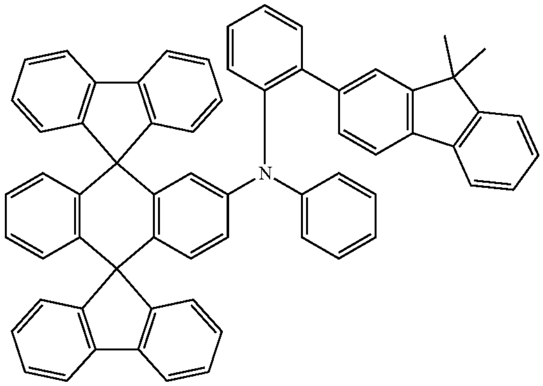
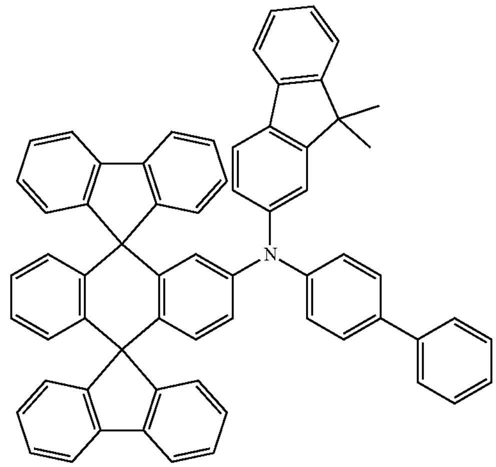
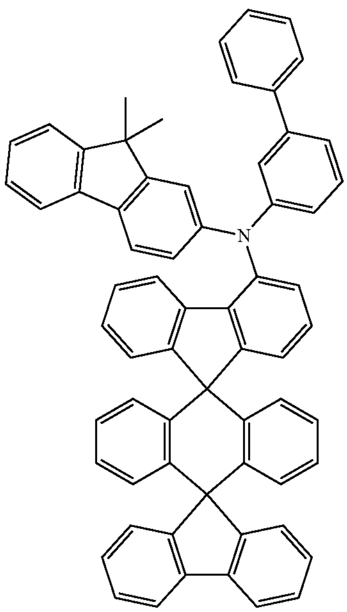
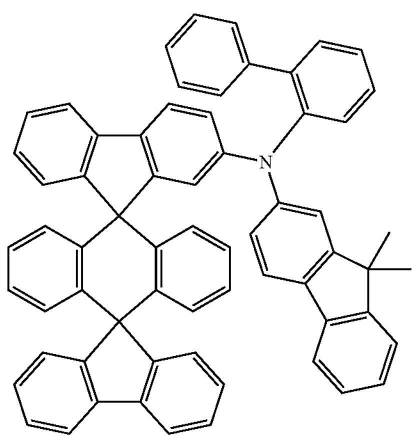
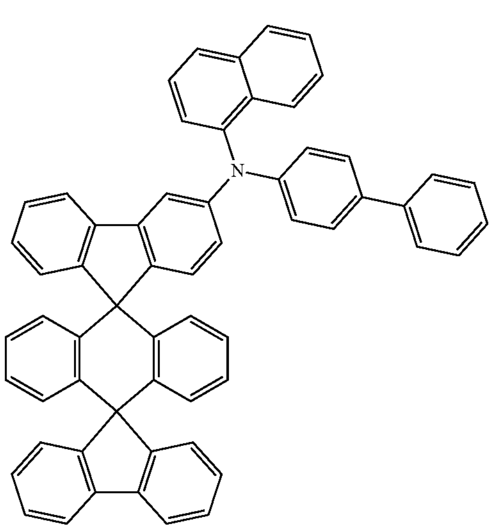
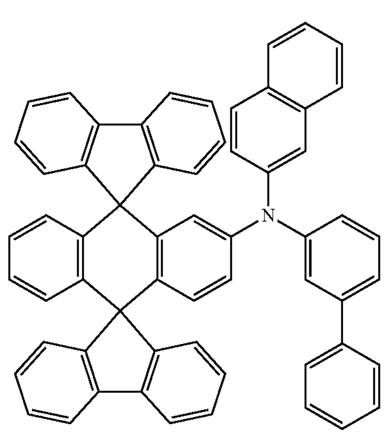

-continued
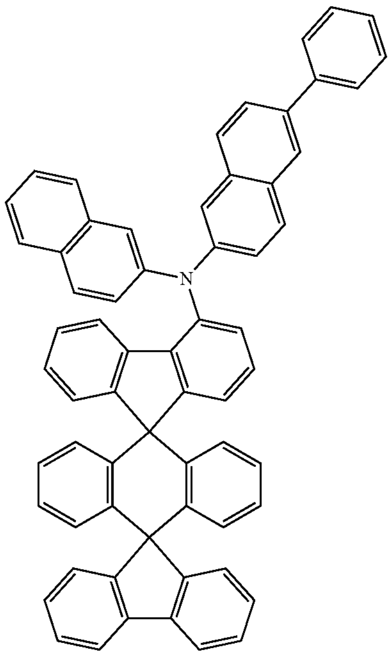
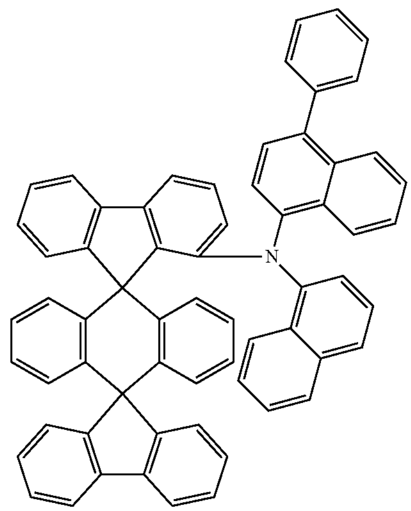
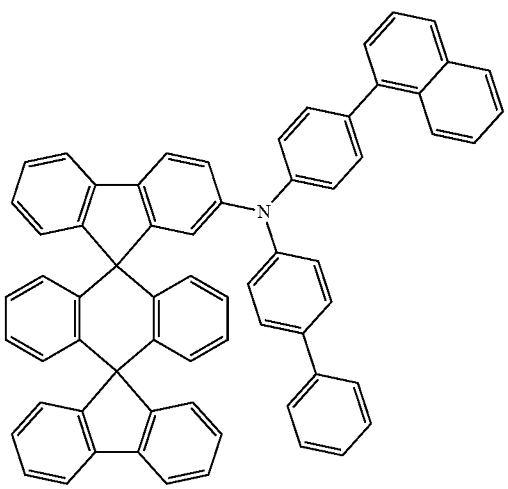
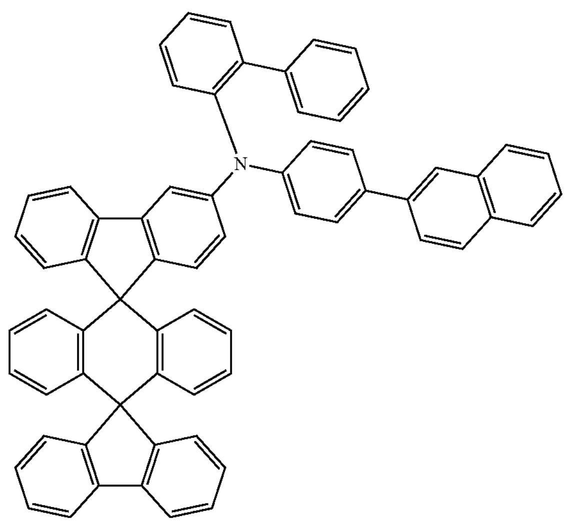
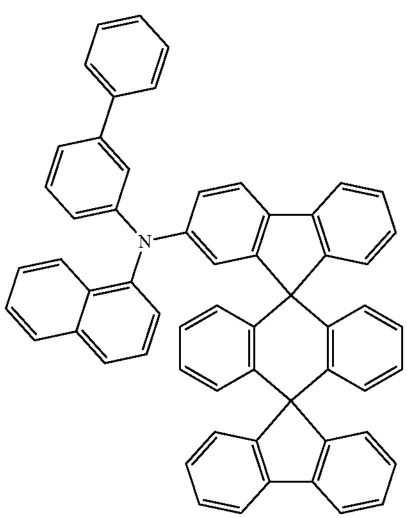
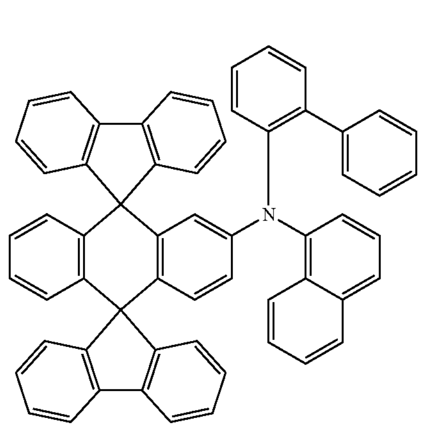

-continued
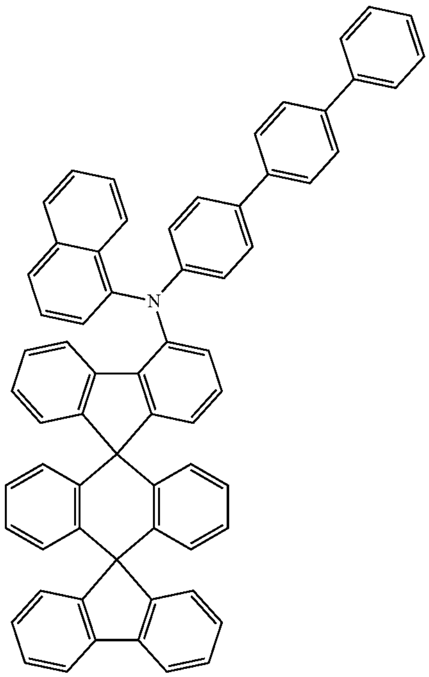
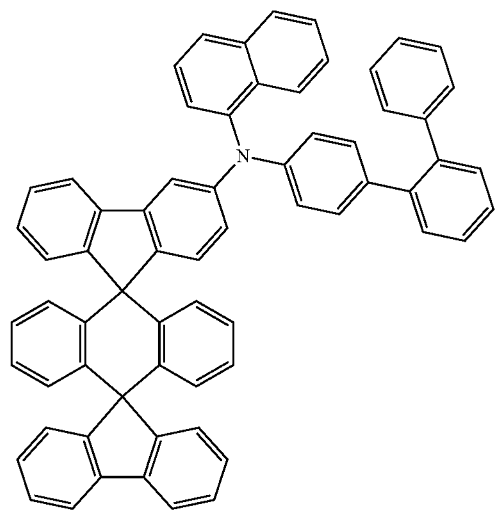
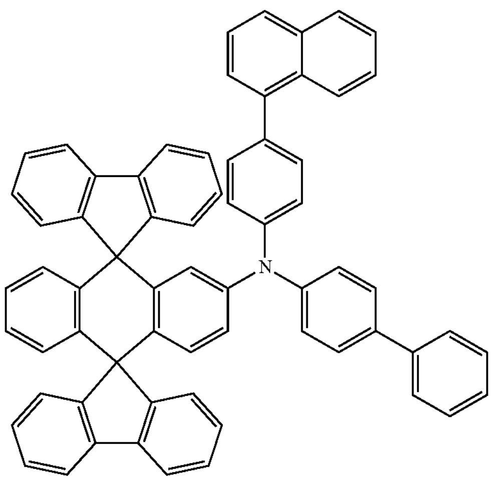
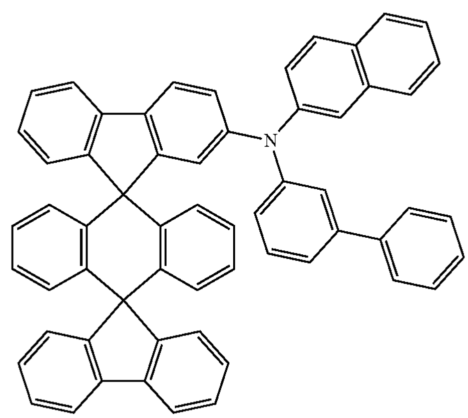
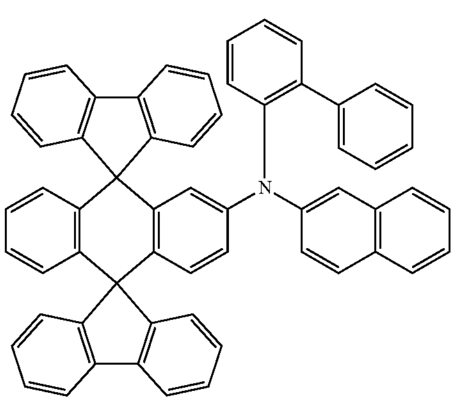
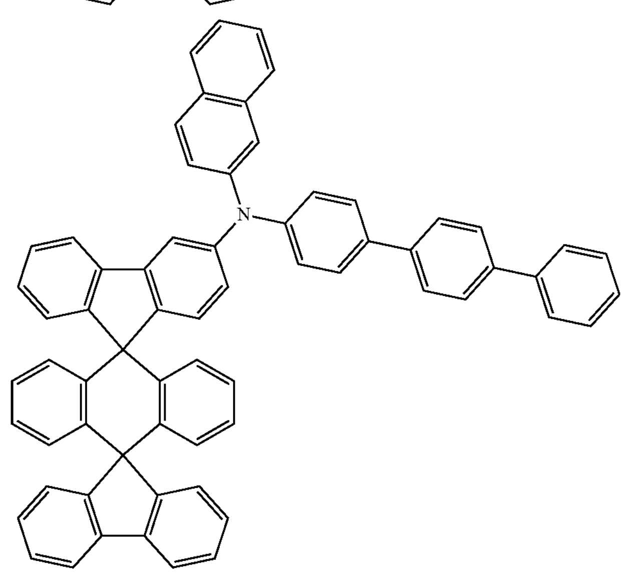

-continued
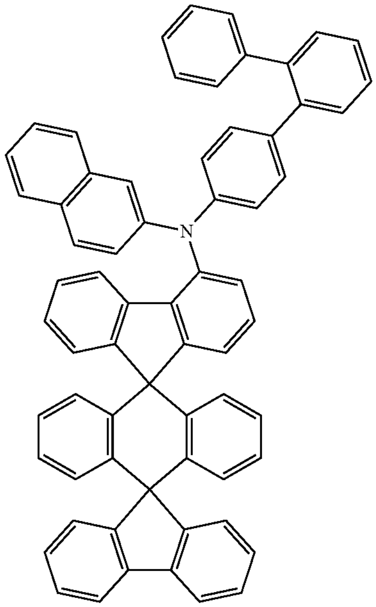
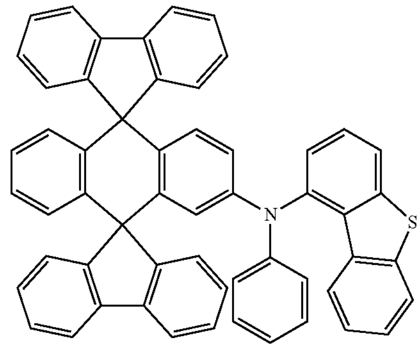
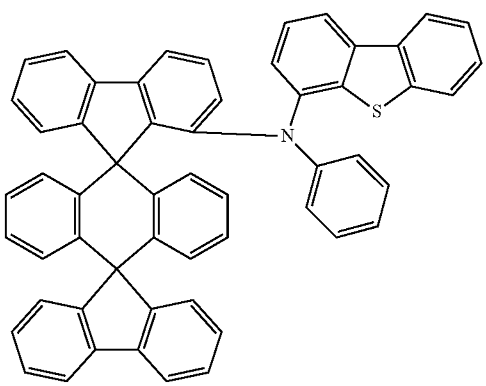
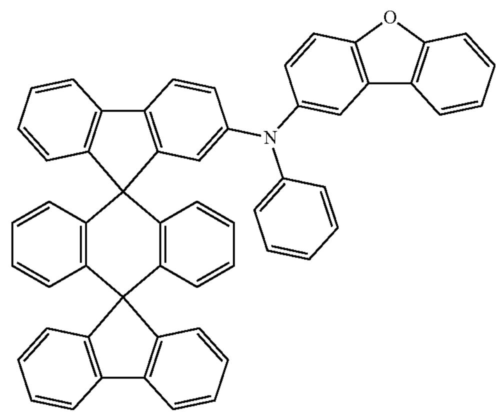
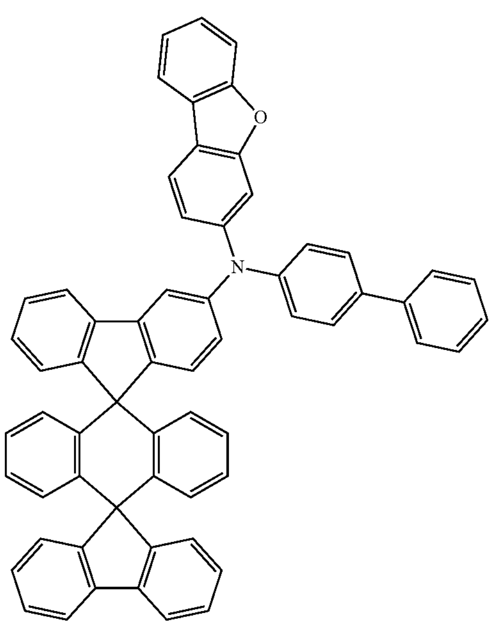
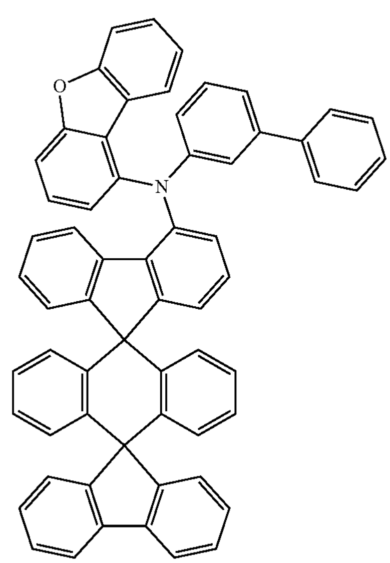

-continued
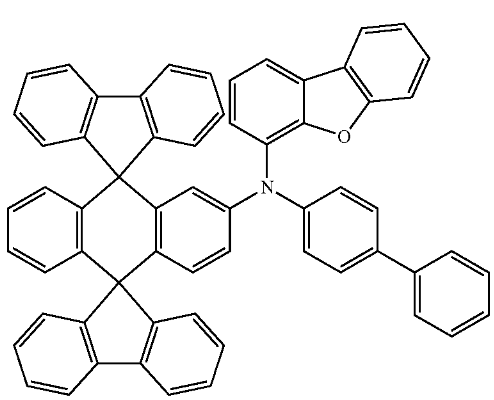
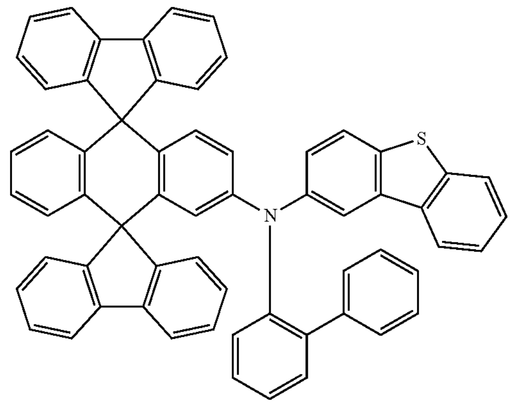
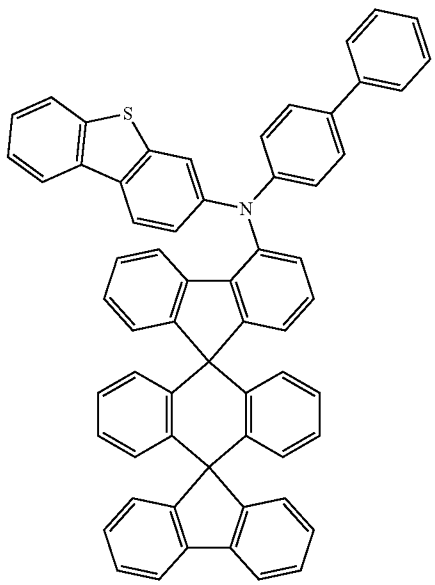
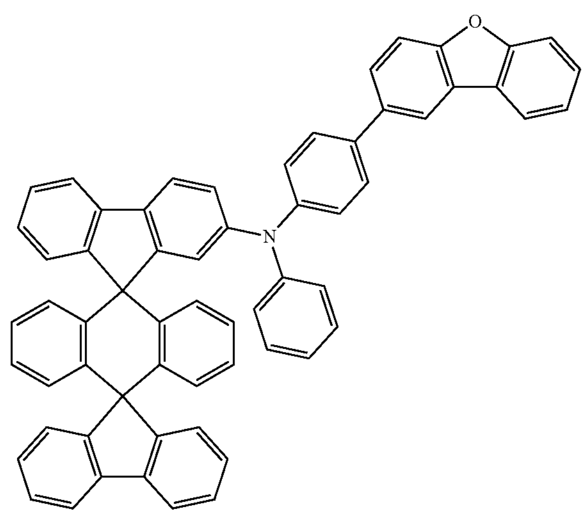
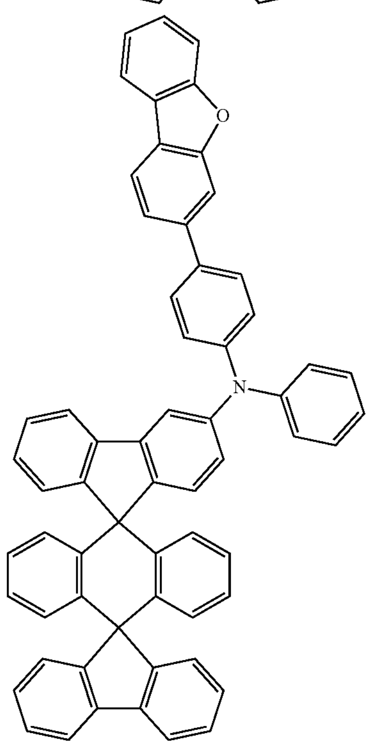
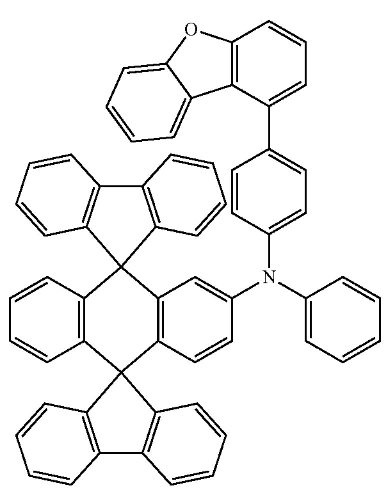
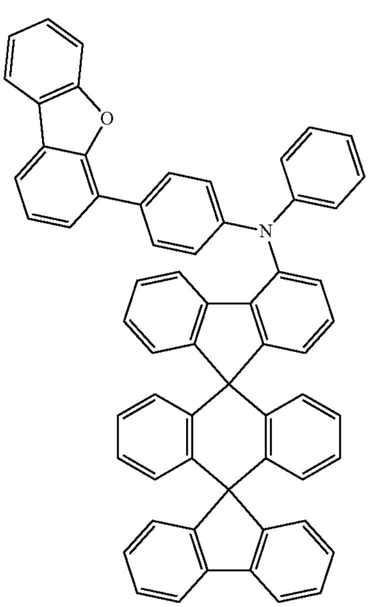

-continued
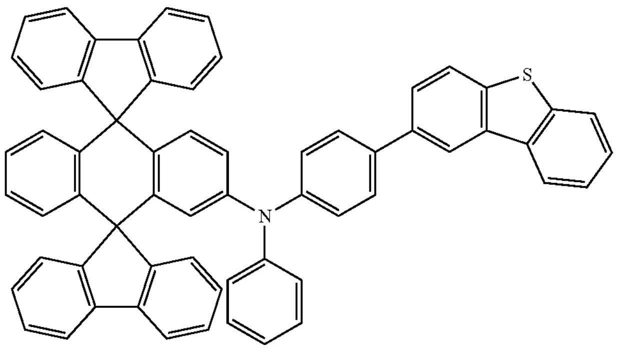
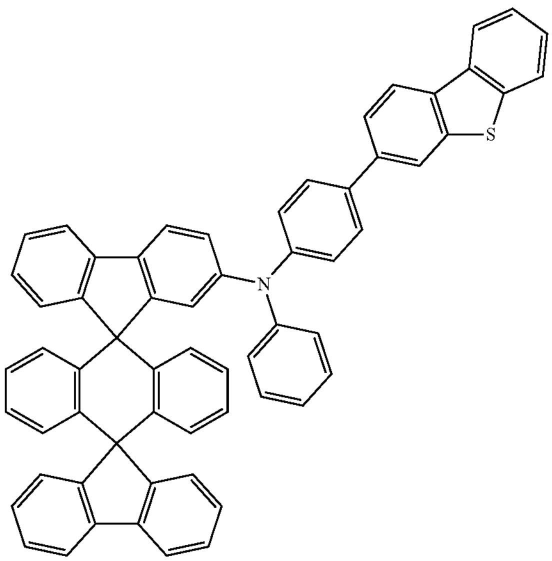
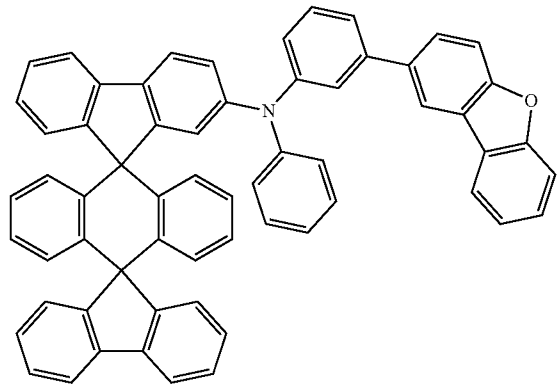
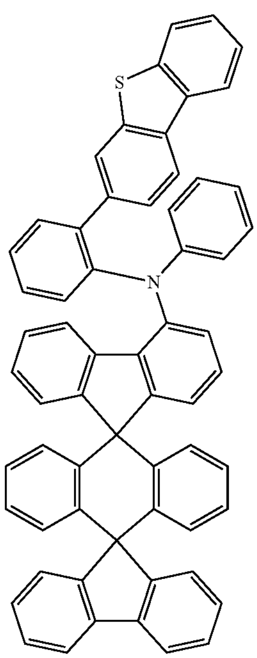
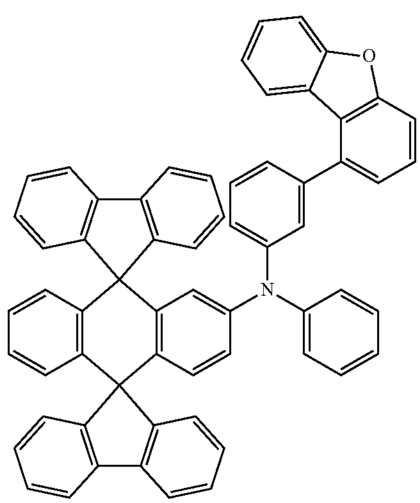
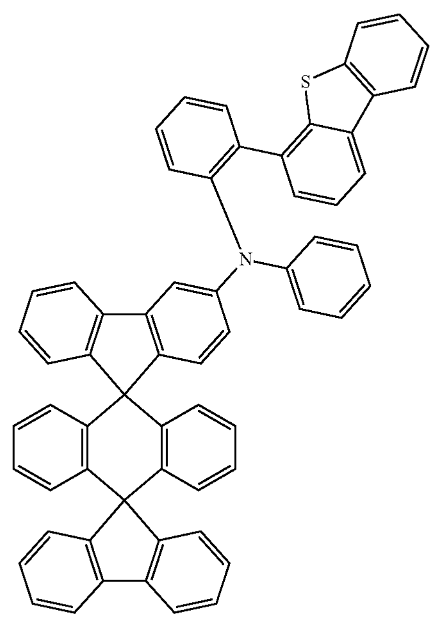

-continued
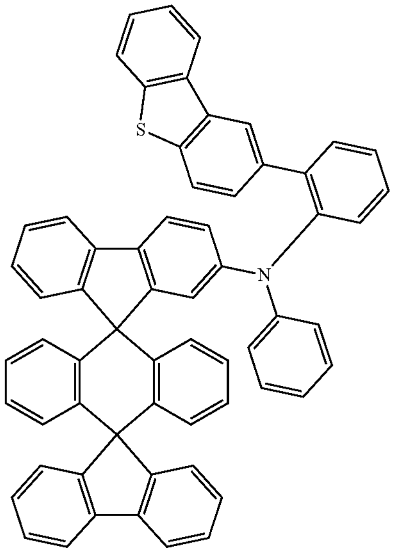
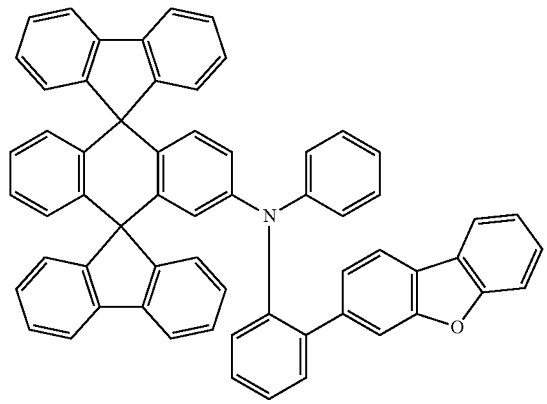
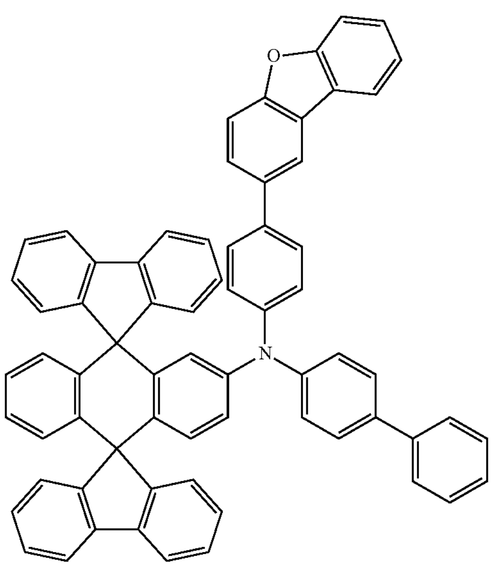
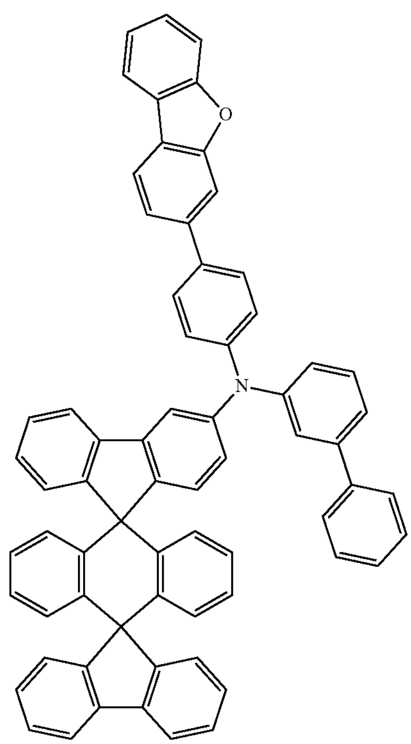

-continued
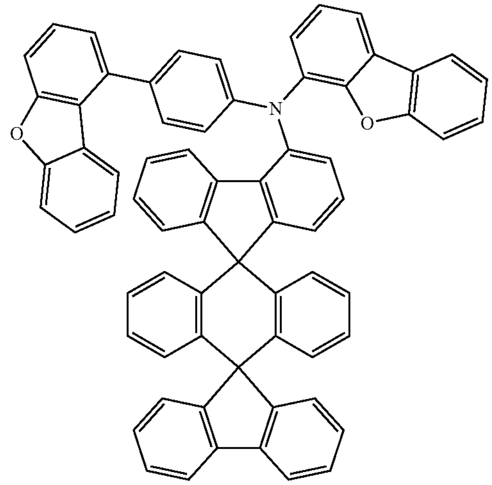
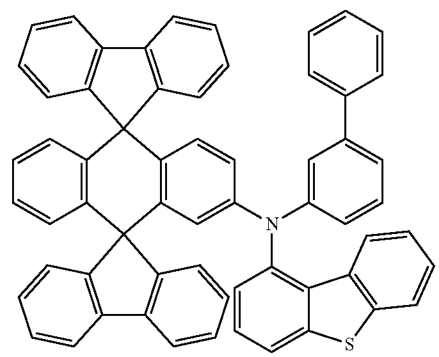
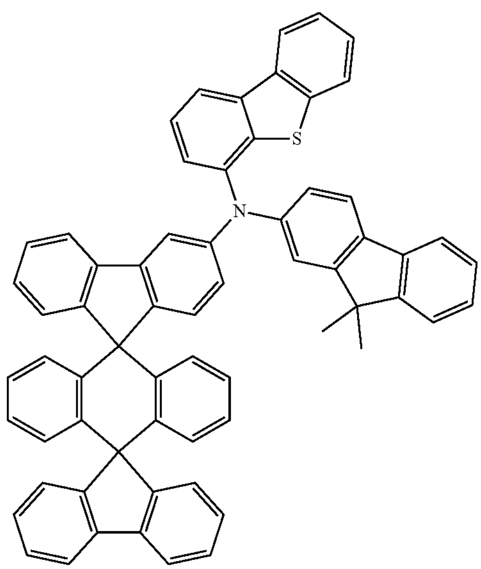
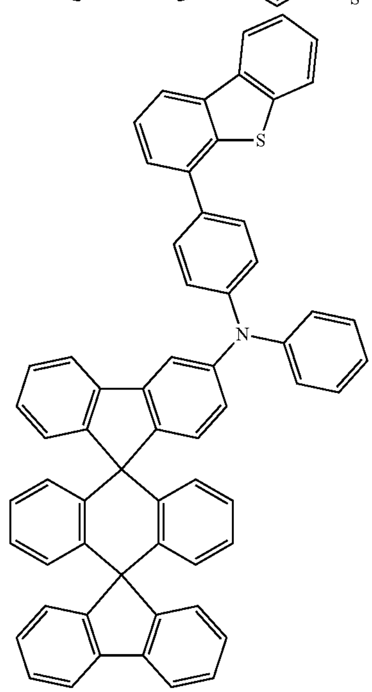
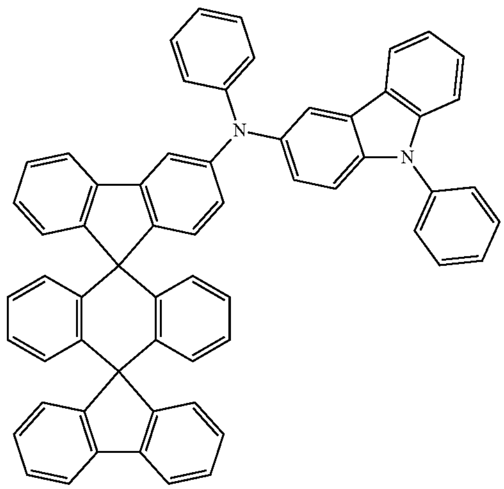
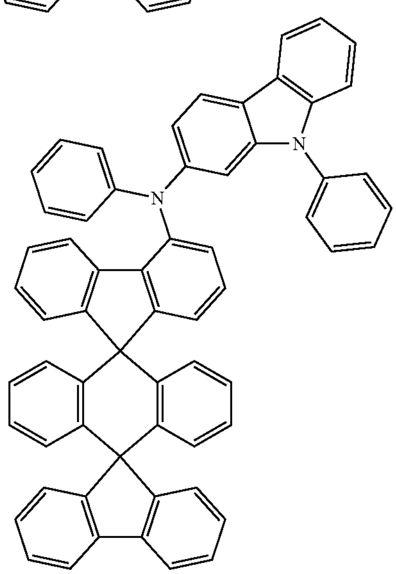

-continued
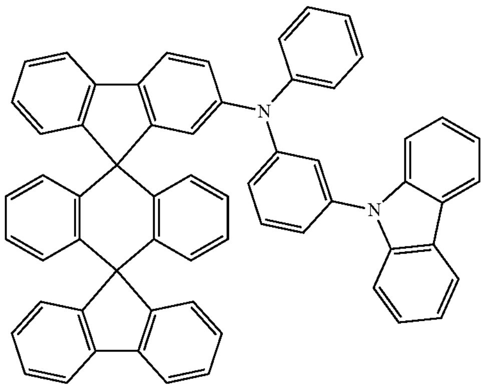
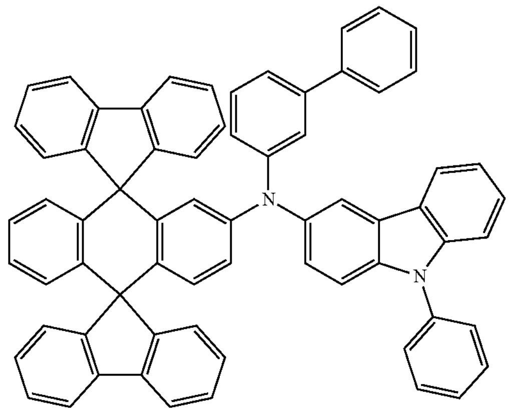
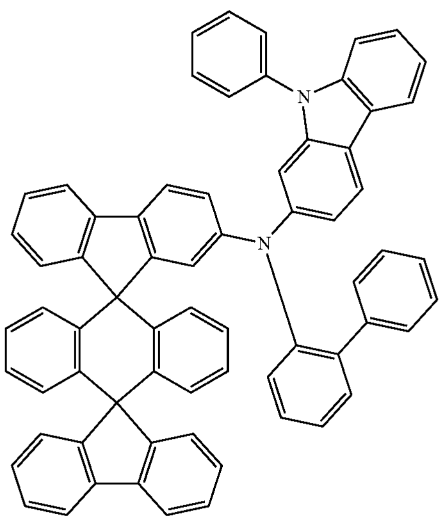
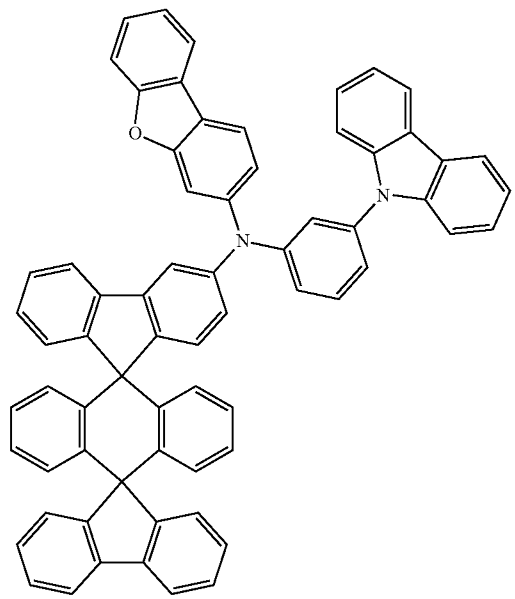
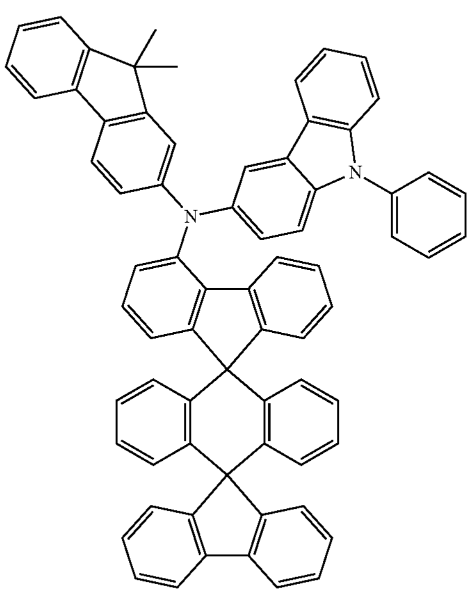
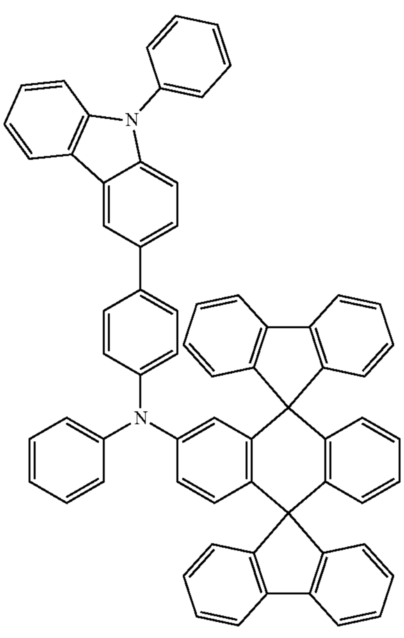

-continued
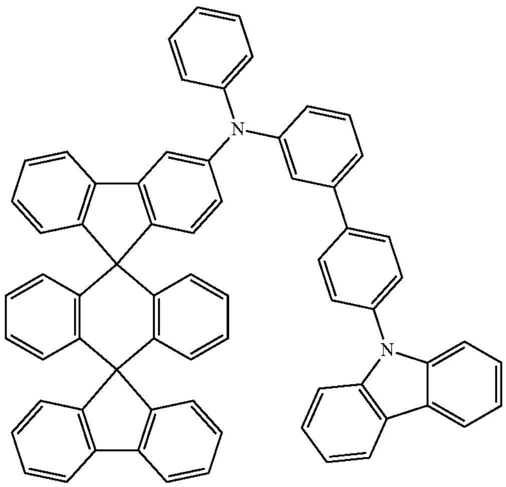
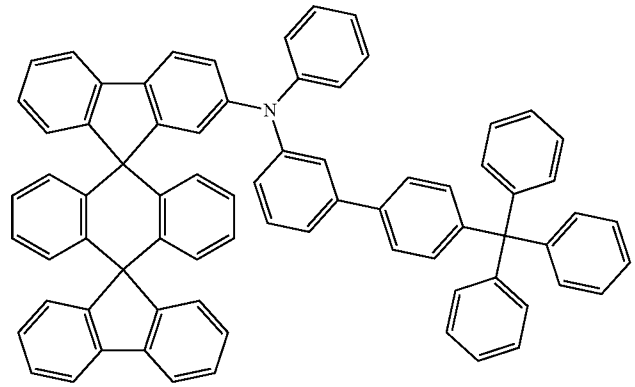
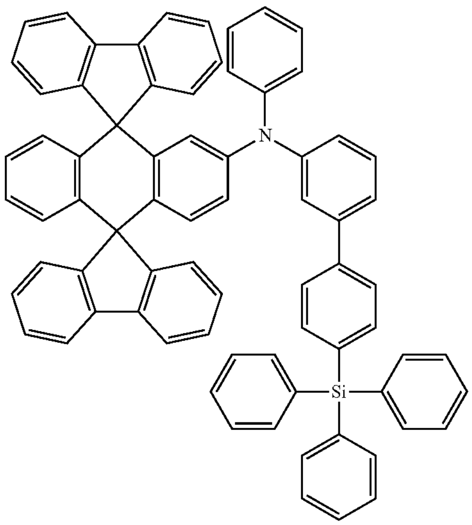
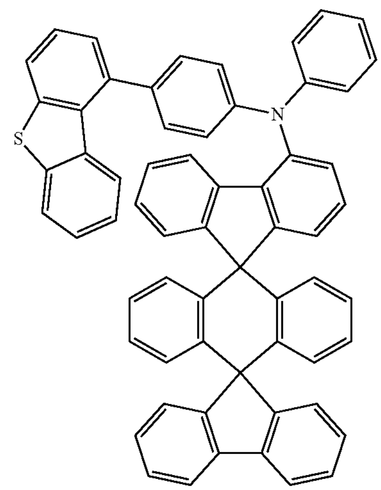
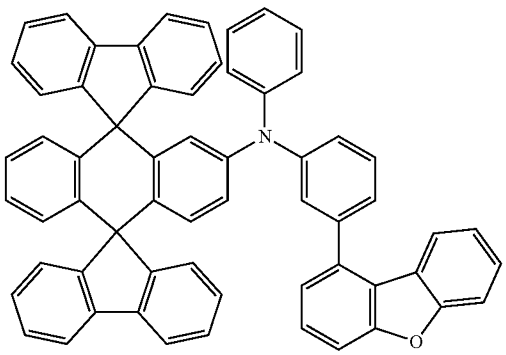
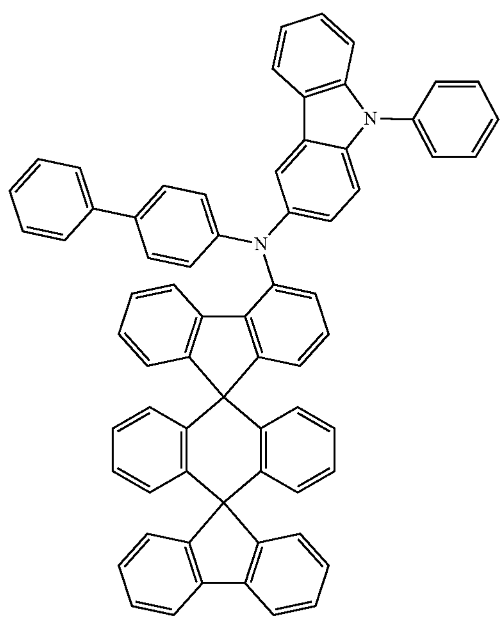

-continued
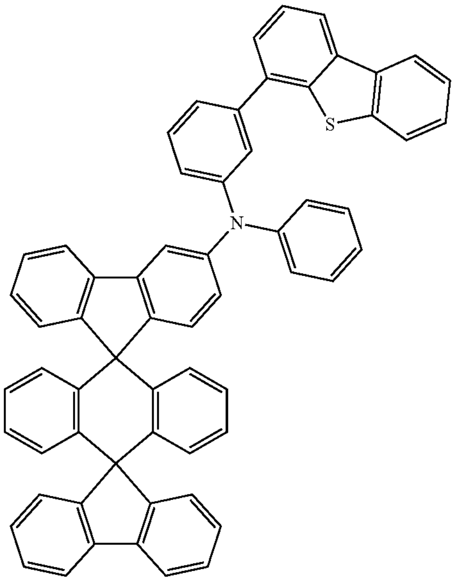
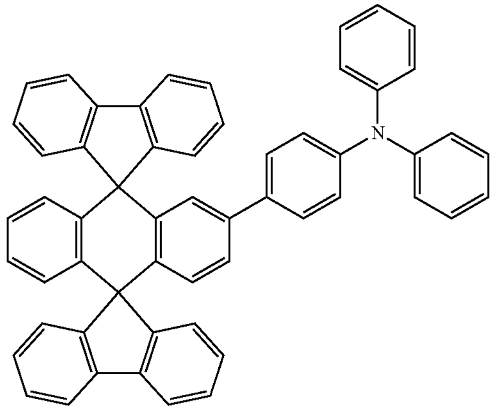
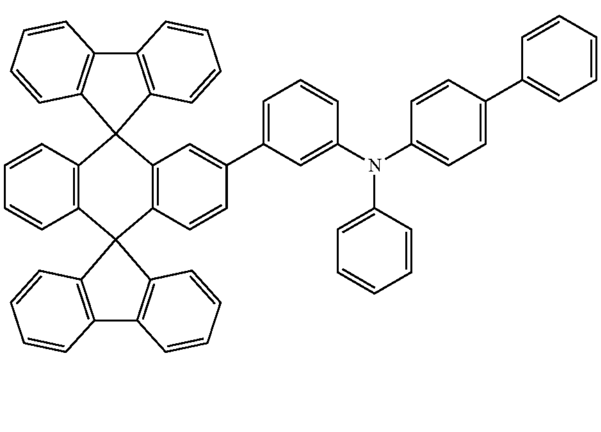
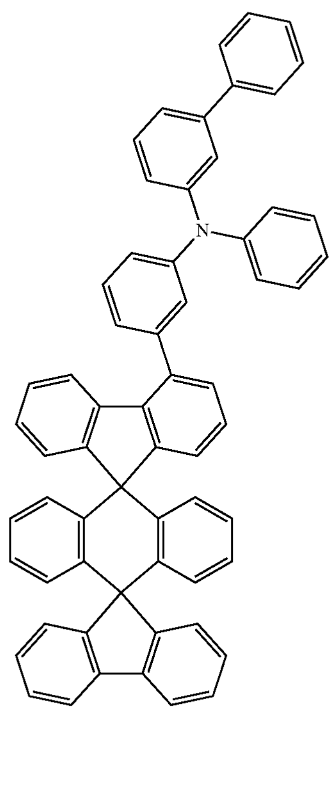

-continued
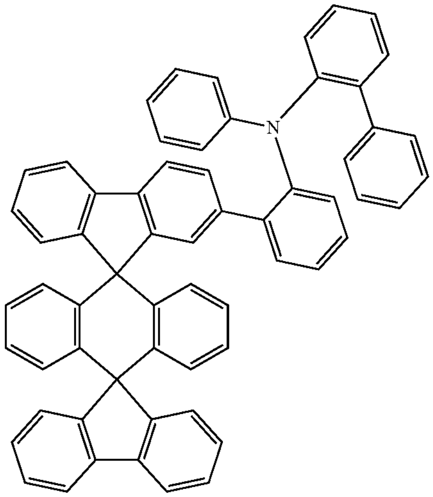
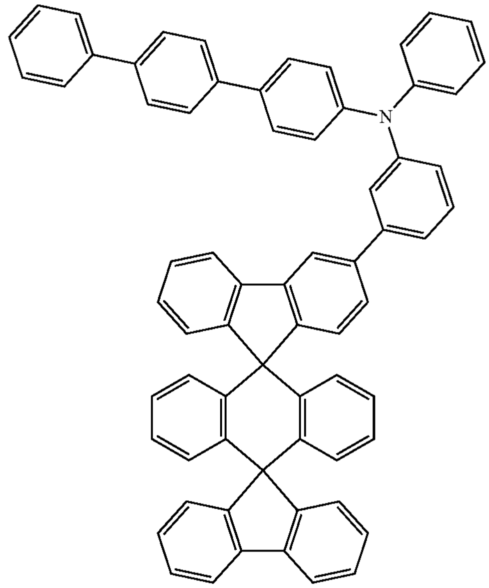
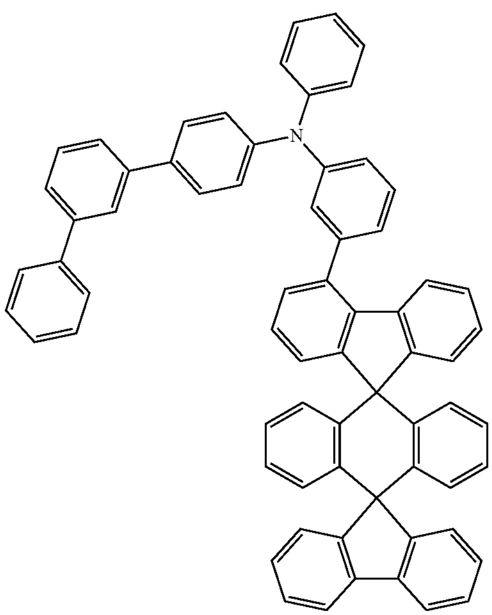
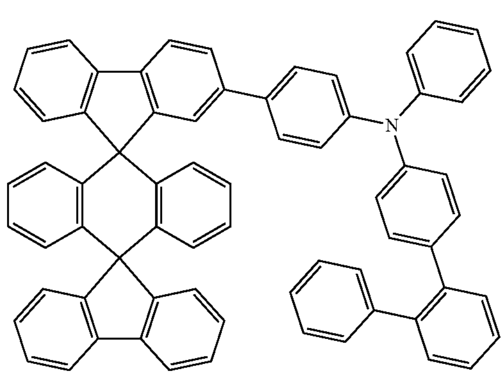

-continued
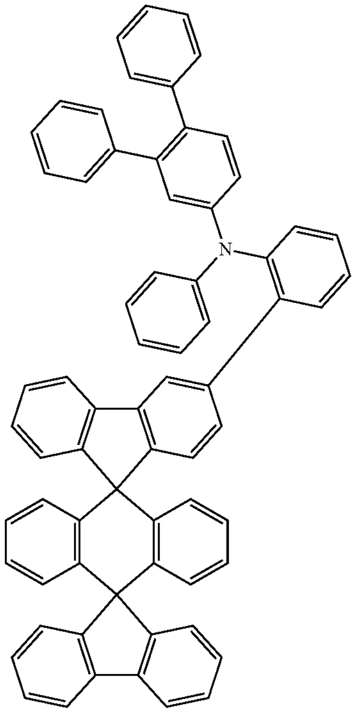
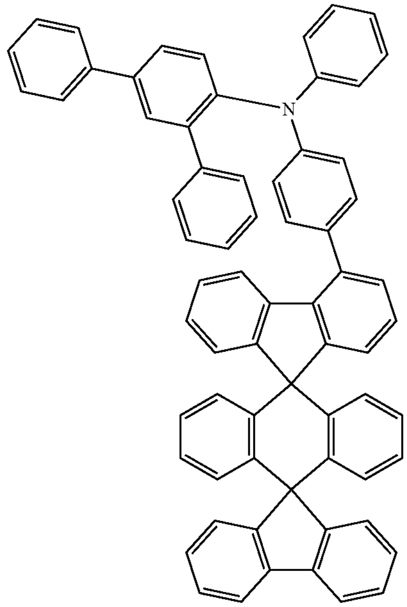
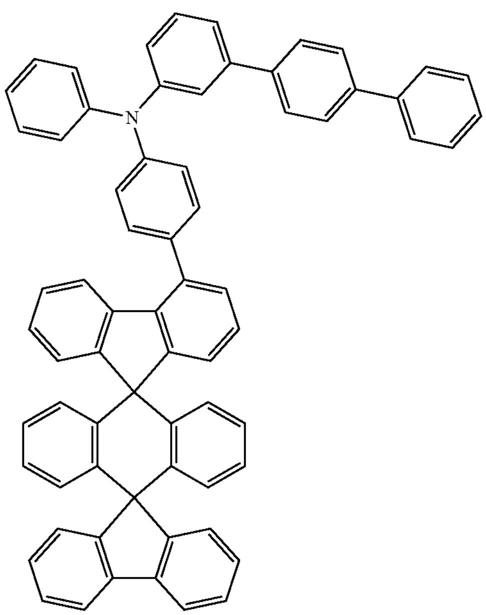
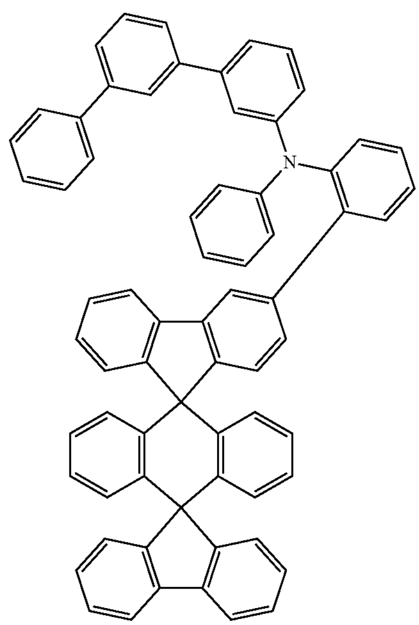

-continued
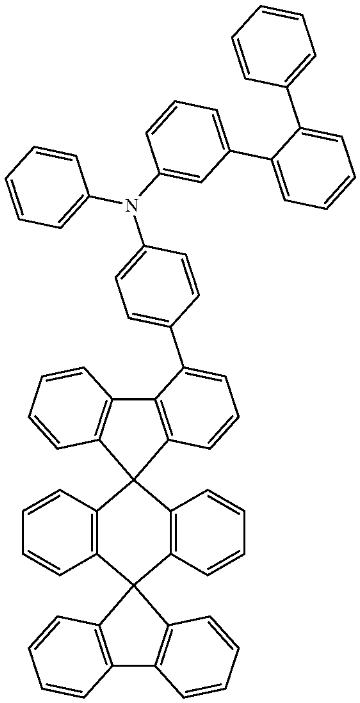
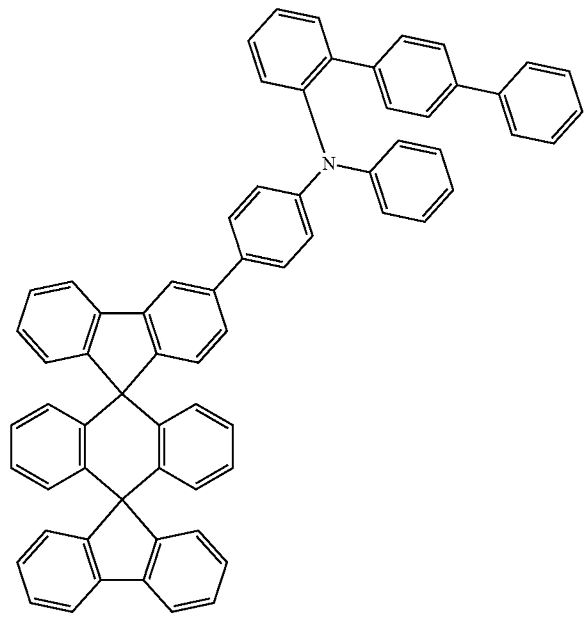
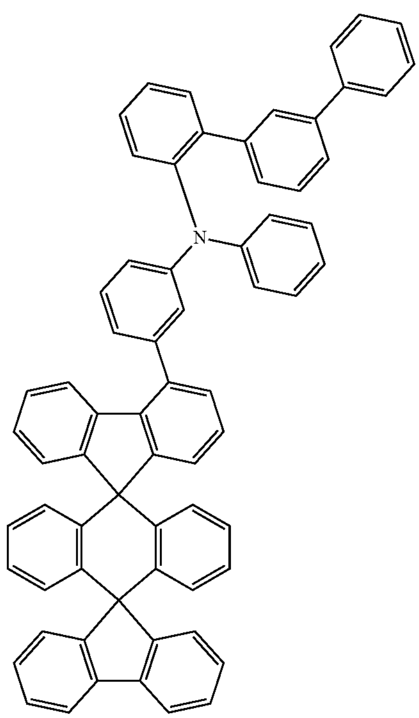
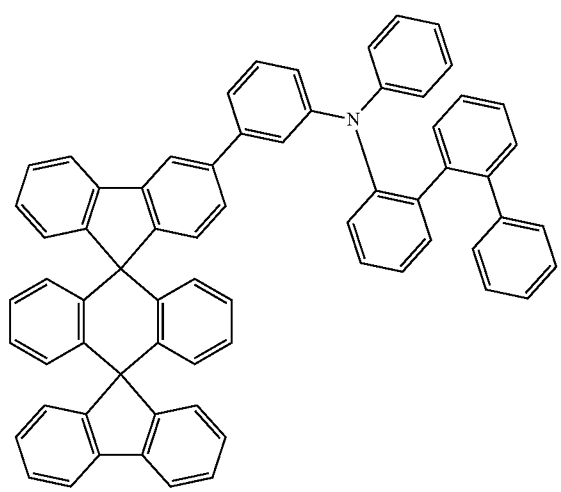

-continued
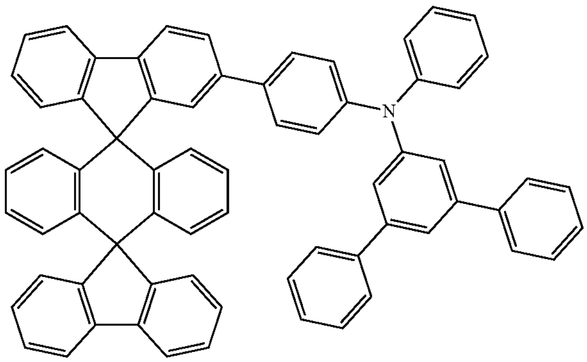
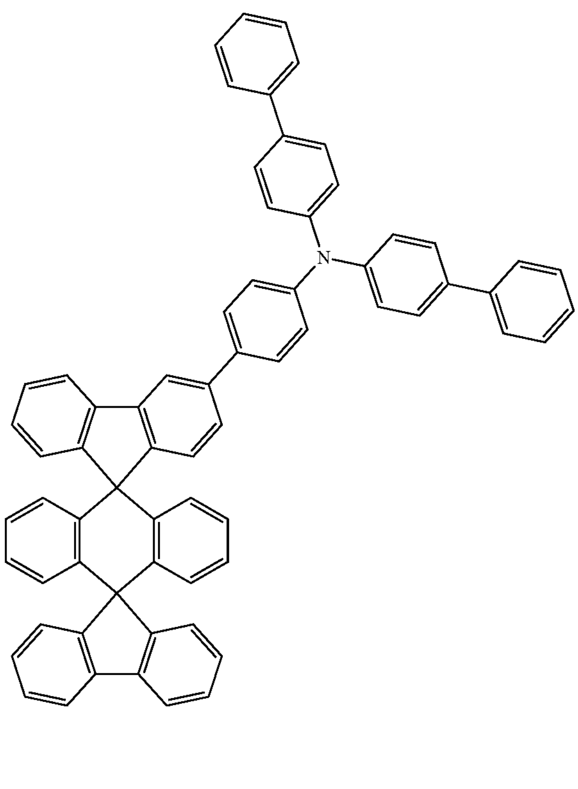
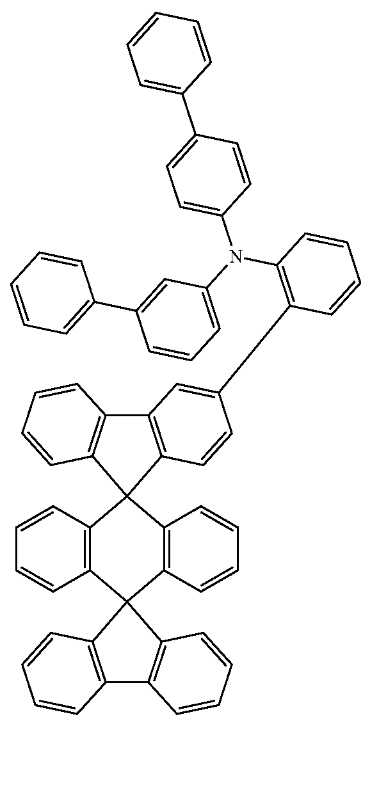

-continued
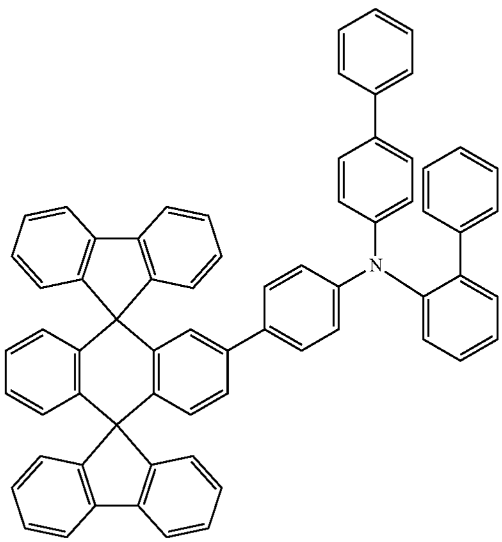
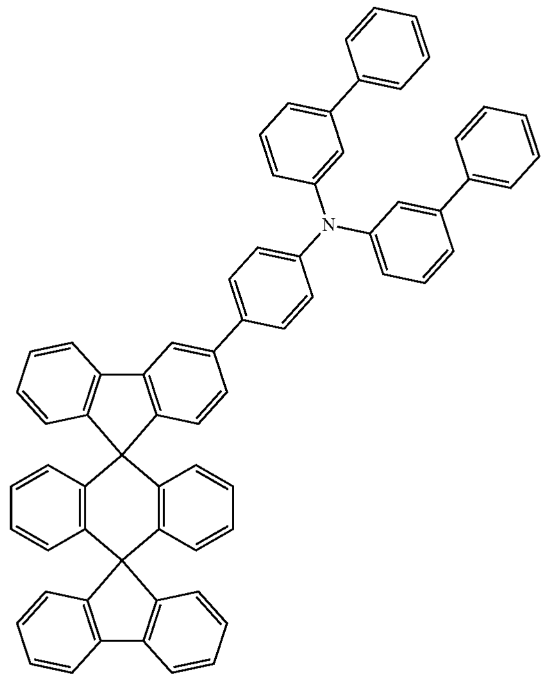
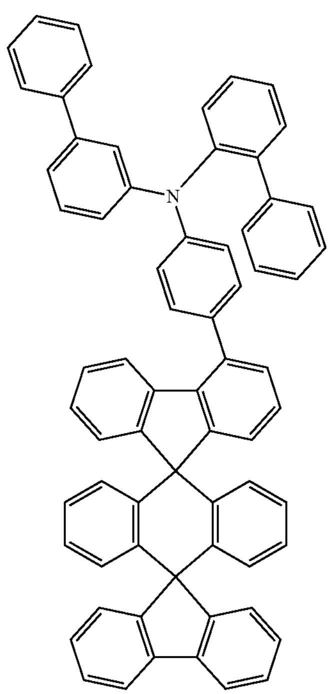
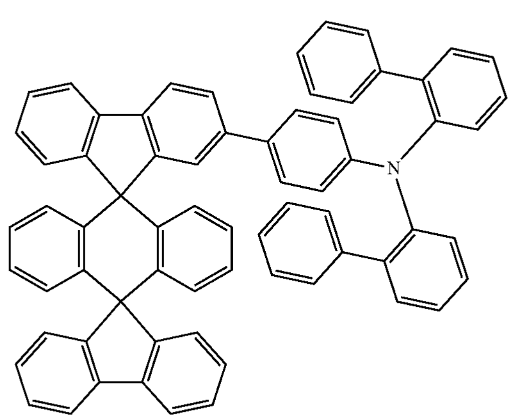

-continued
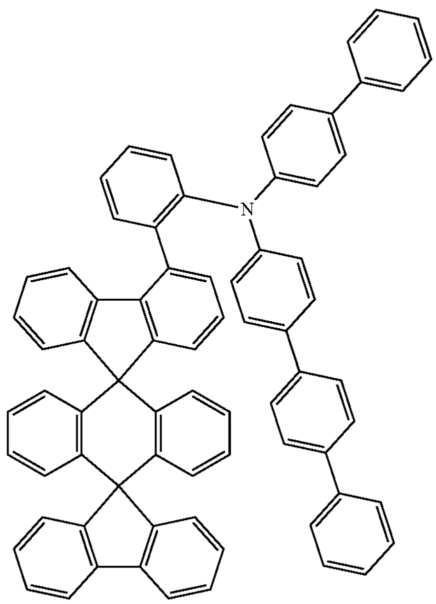
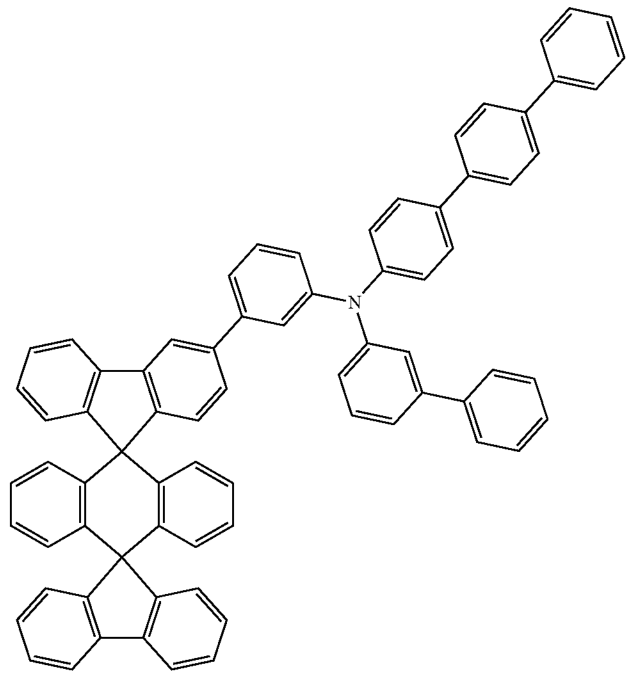
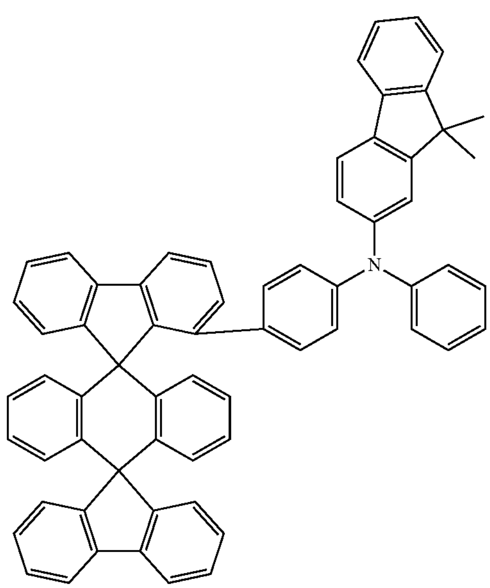
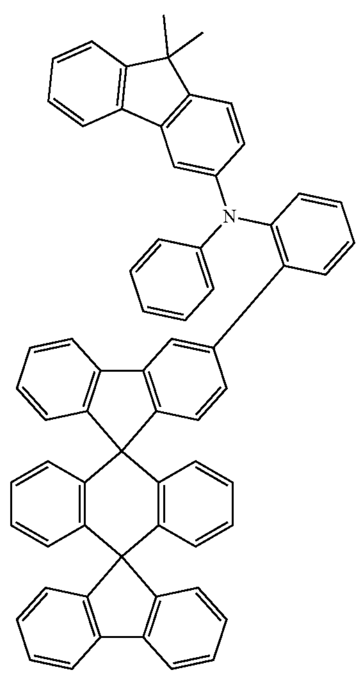

-continued
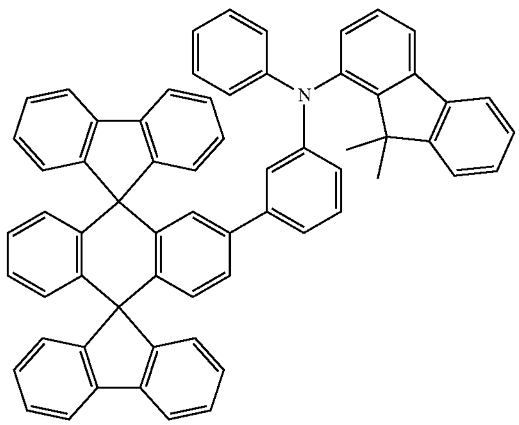
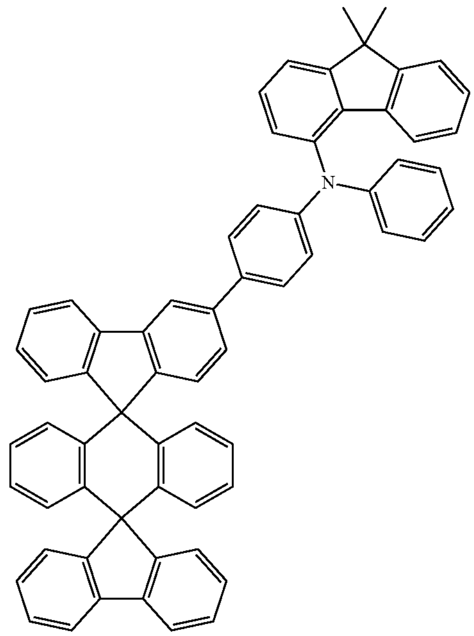
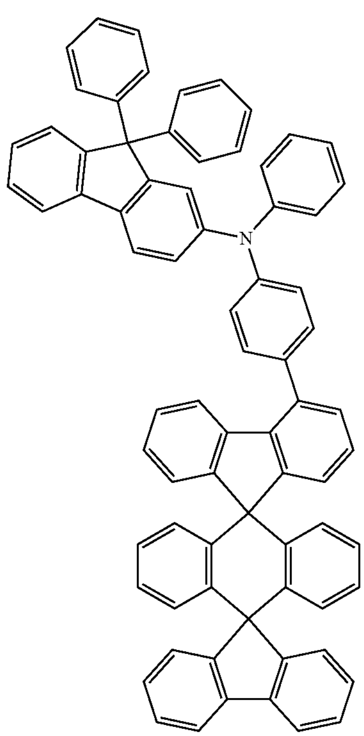
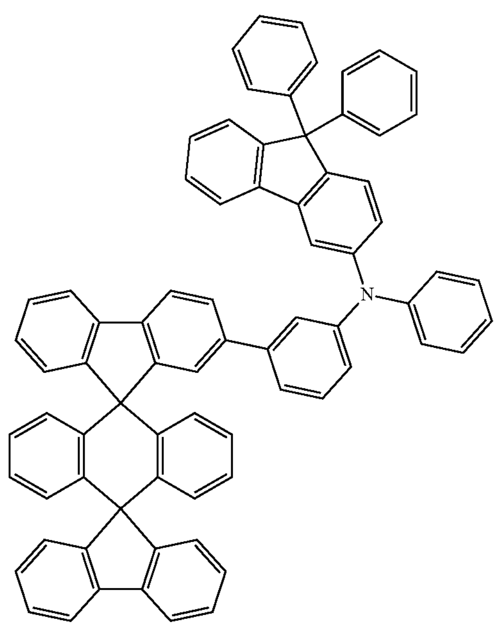

-continued
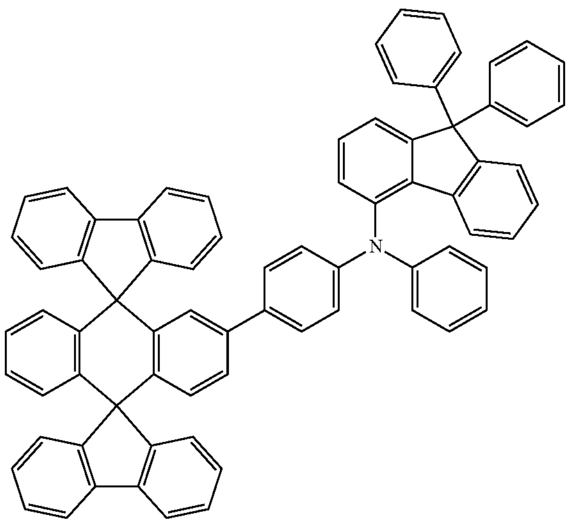
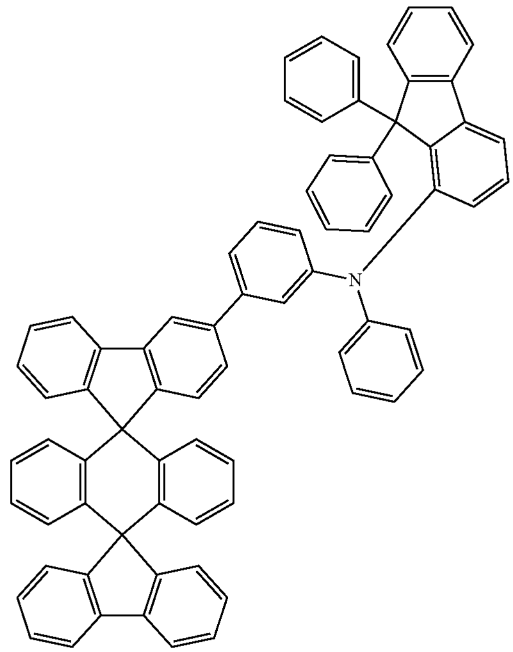
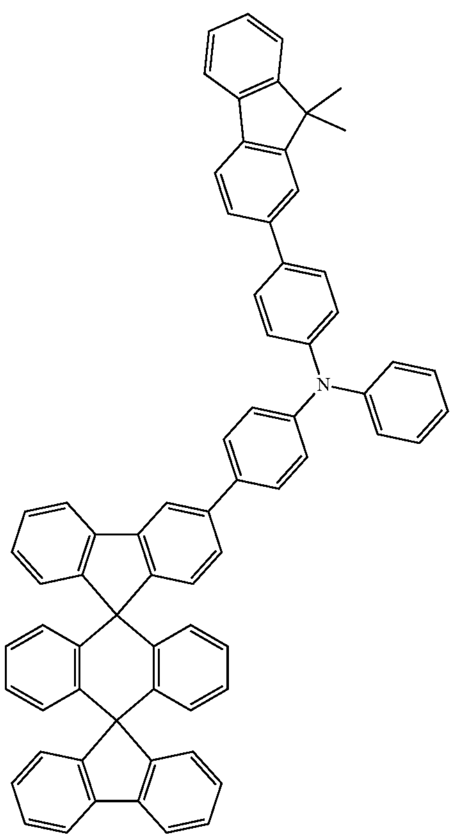
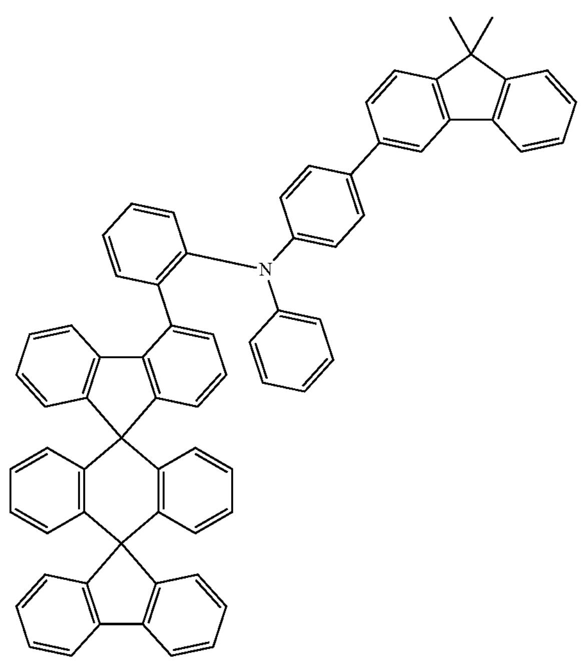

-continued
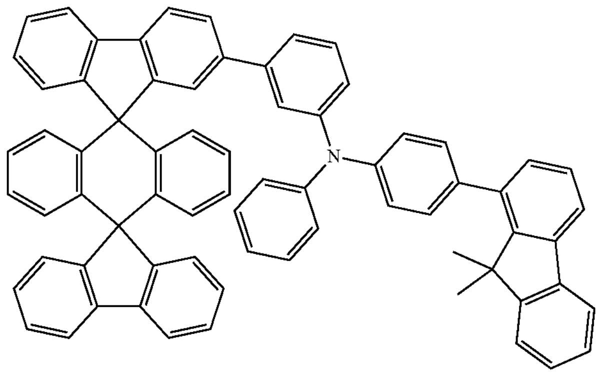
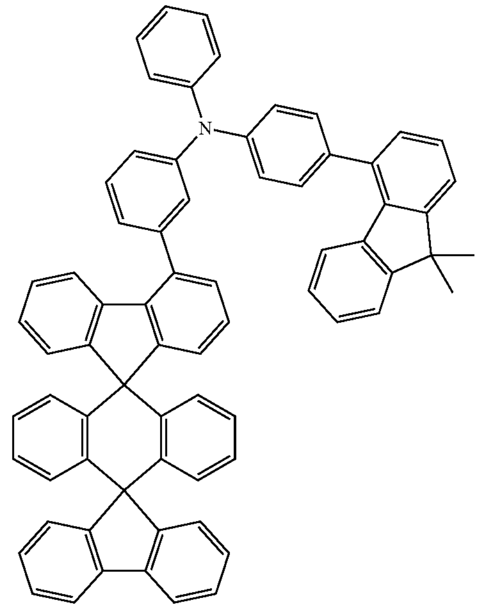
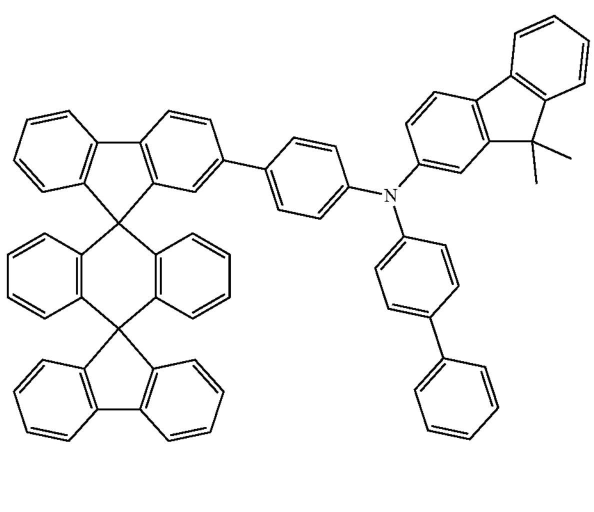
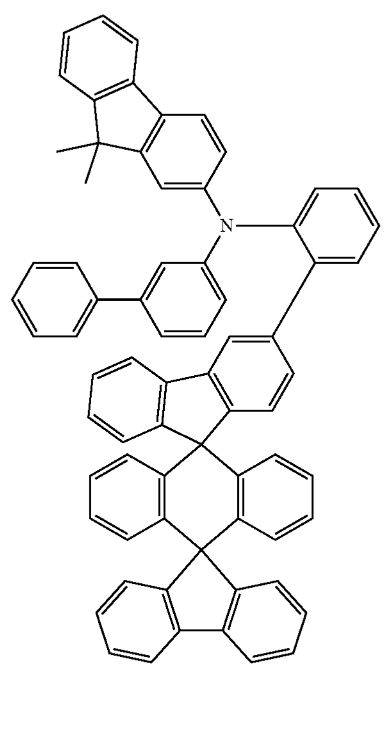

-continued
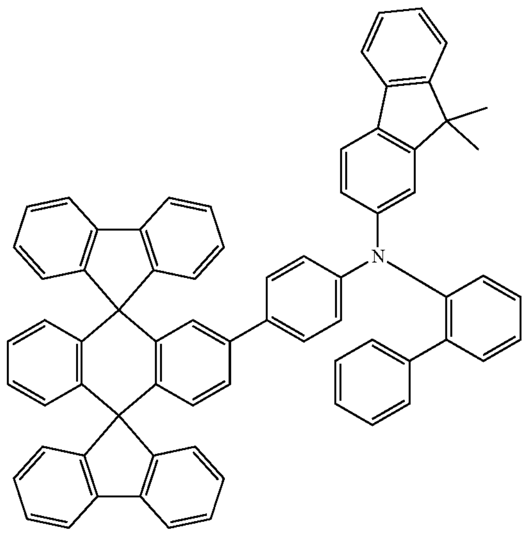
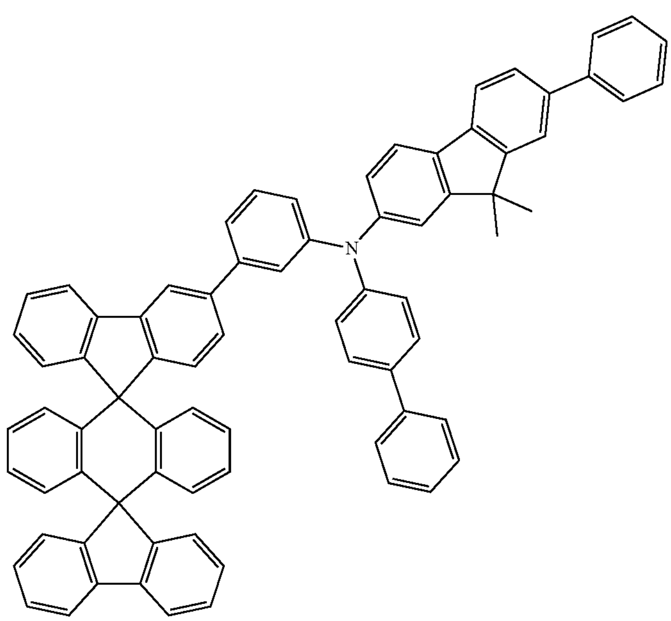
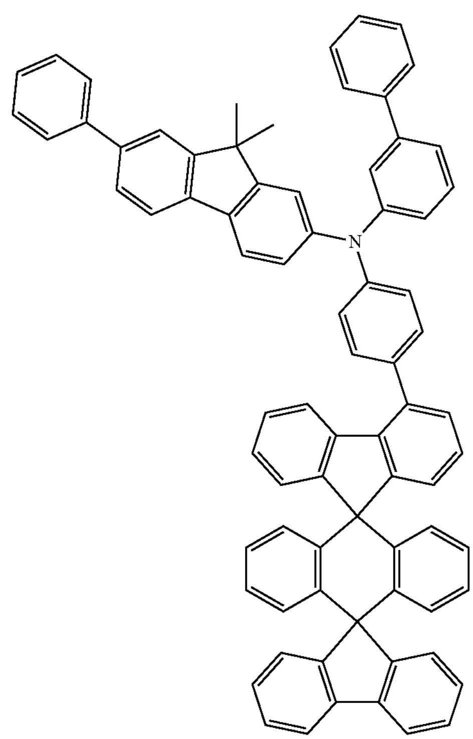

-continued
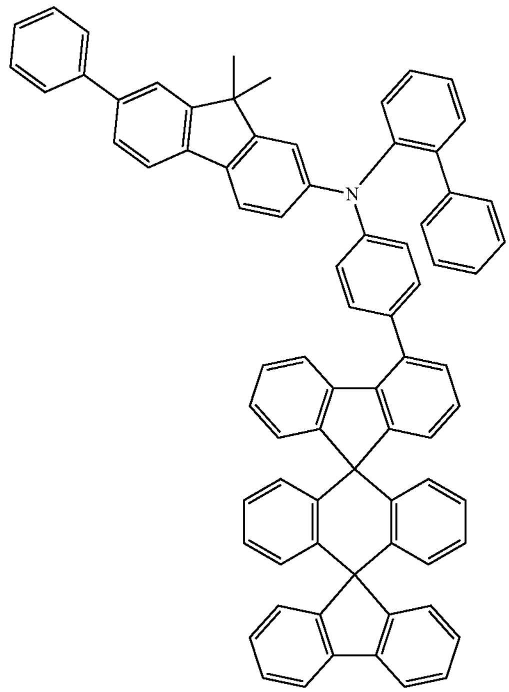
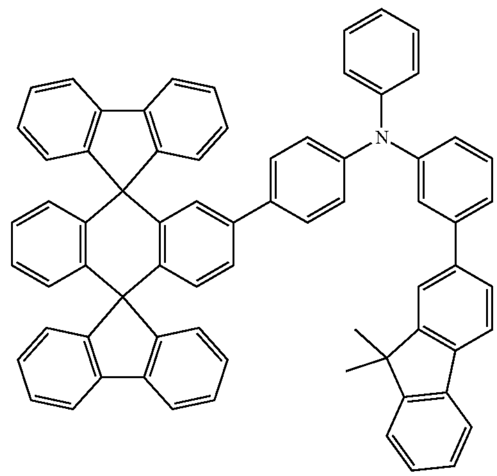
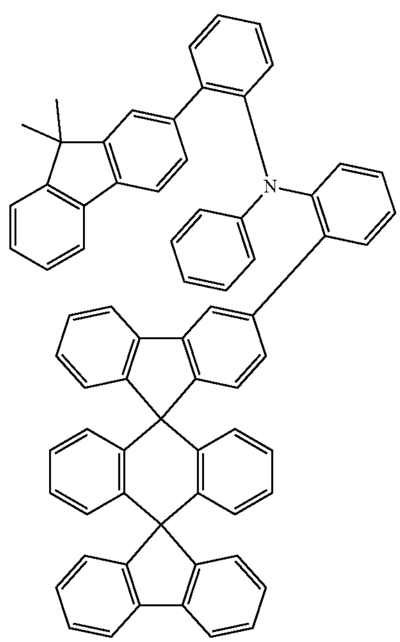
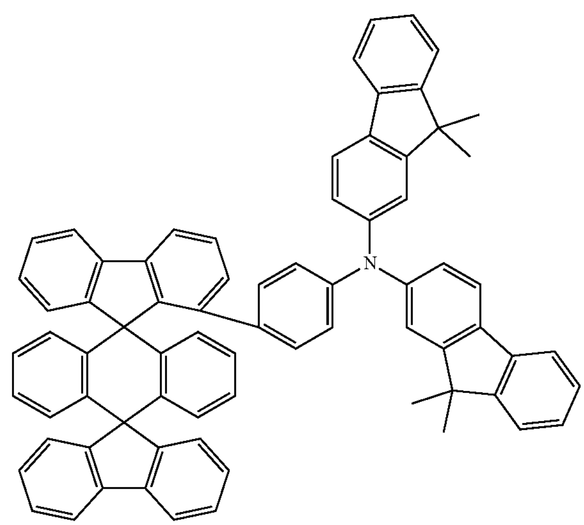

-continued
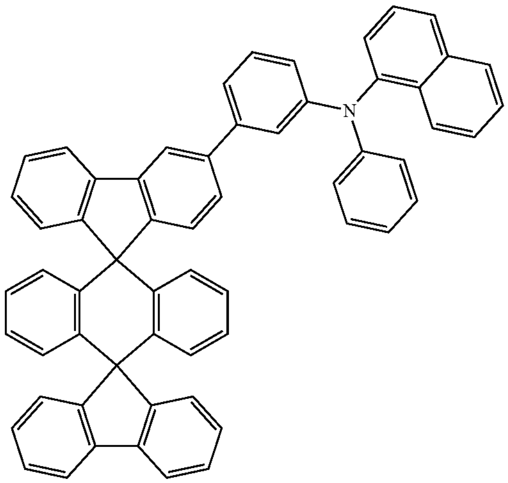
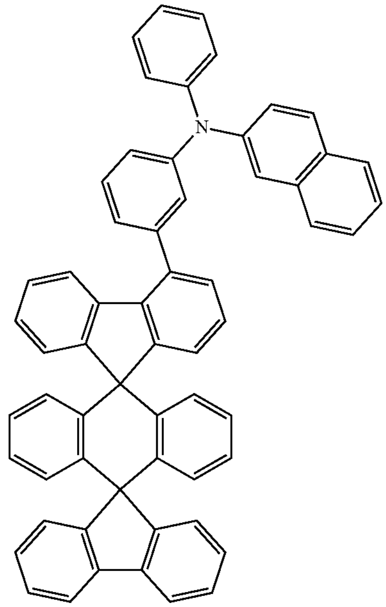
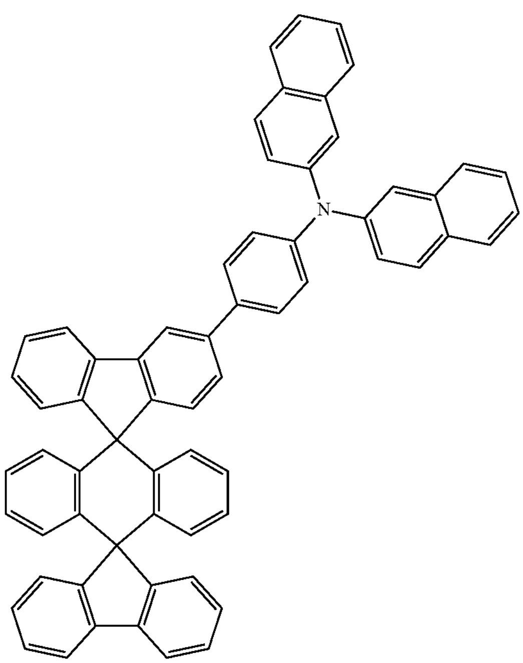
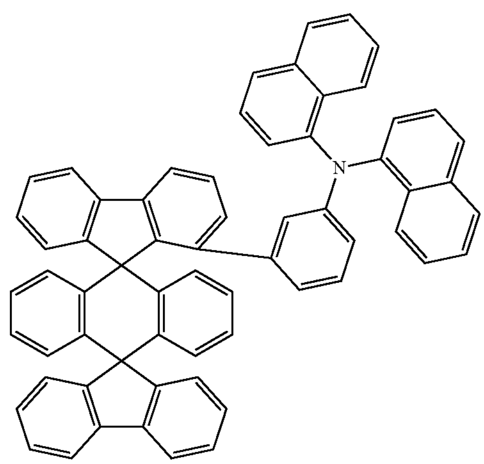

-continued
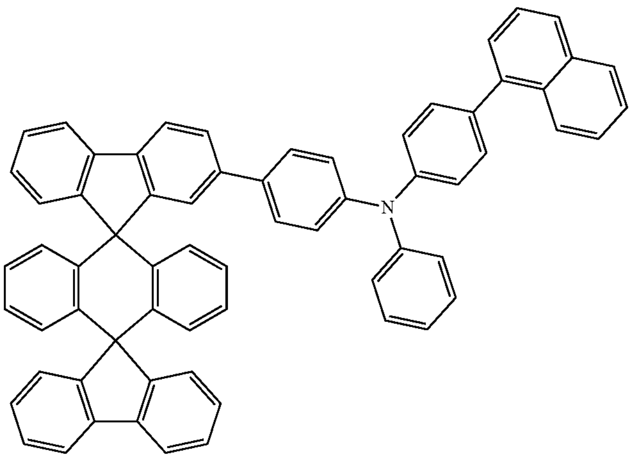
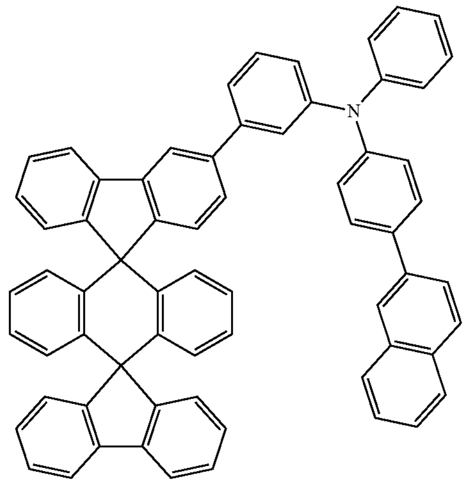
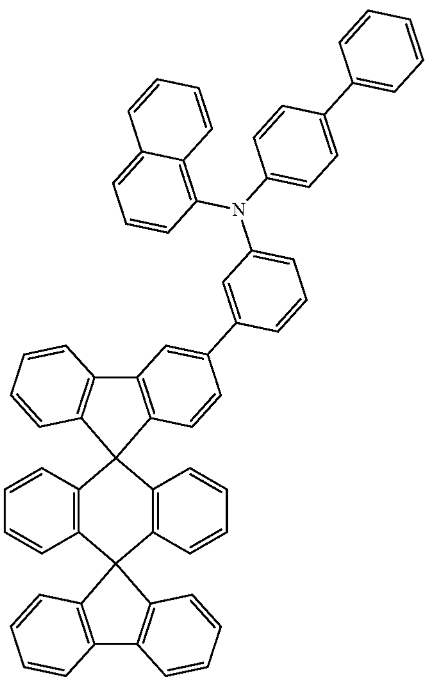
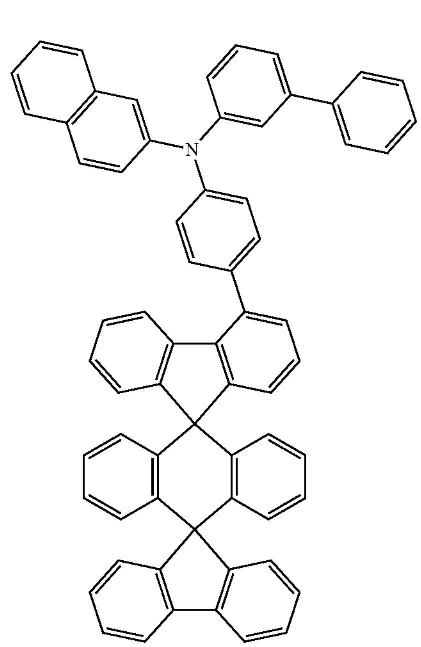
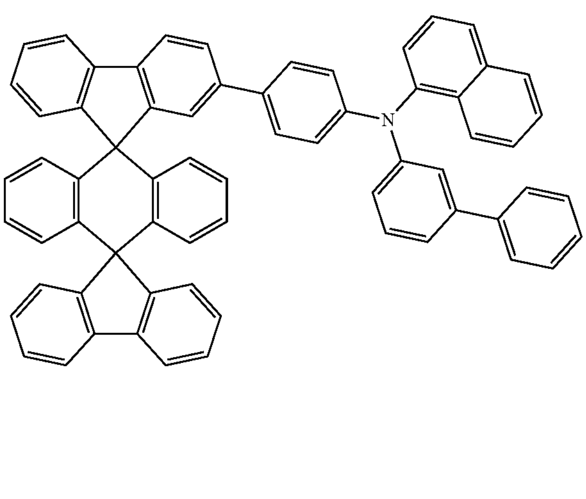
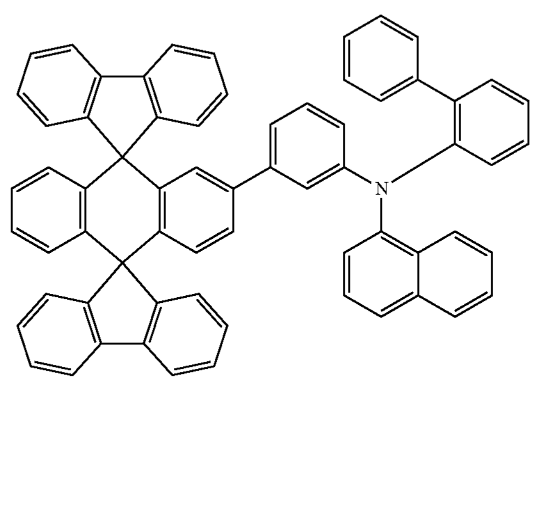

-continued
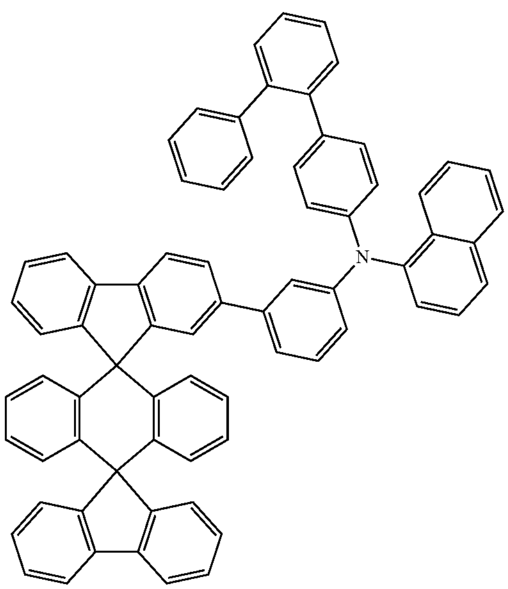
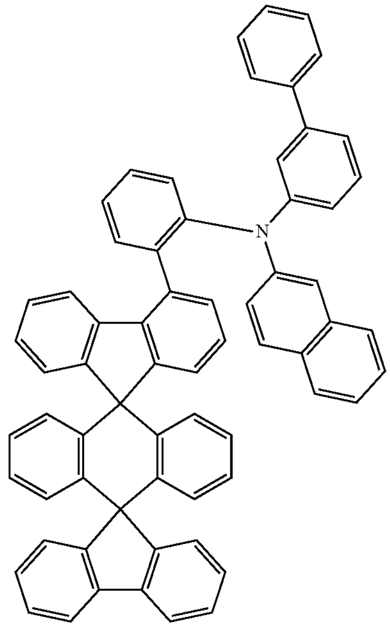
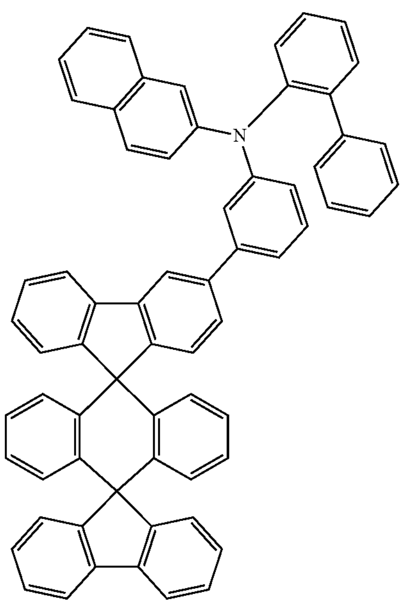
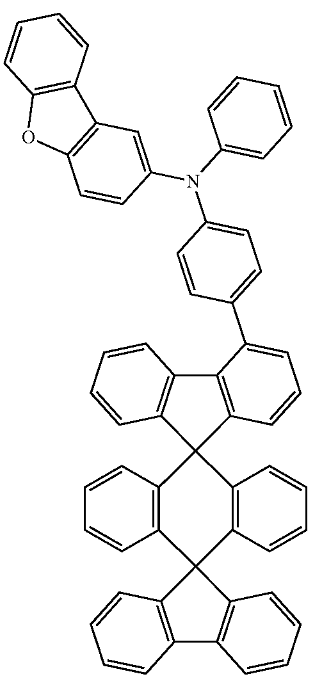
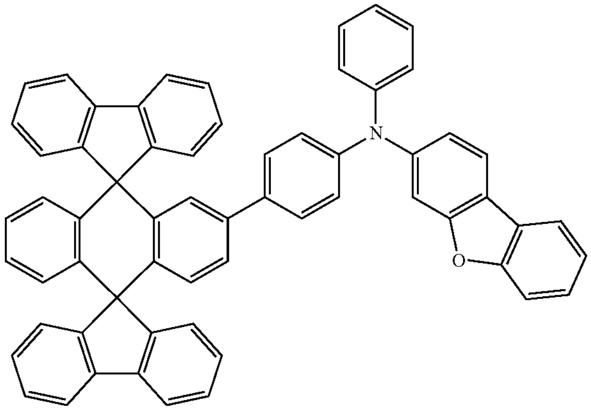
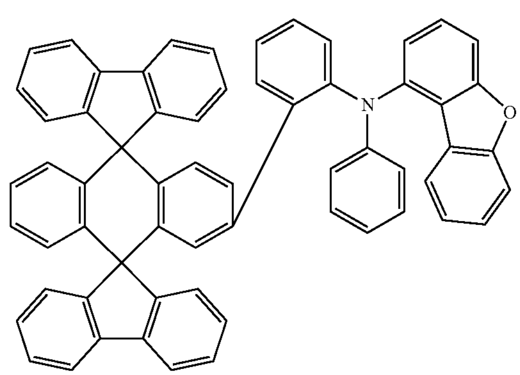

-continued
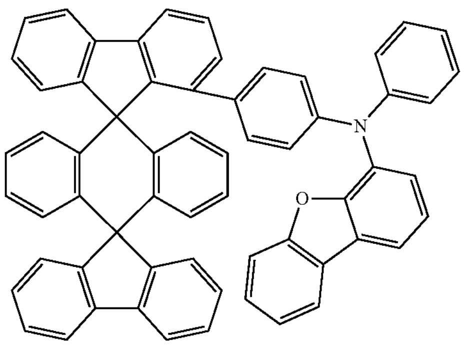
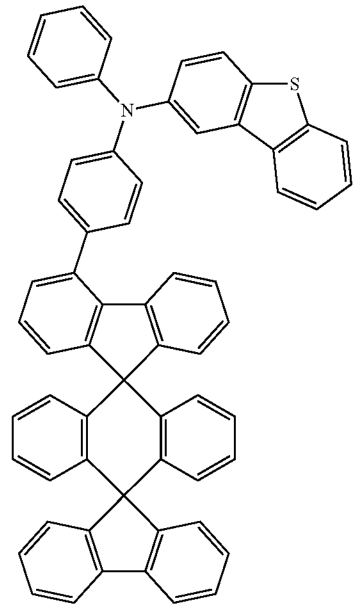
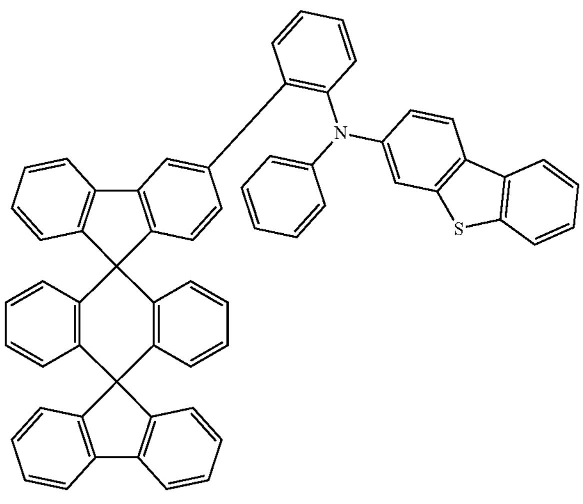
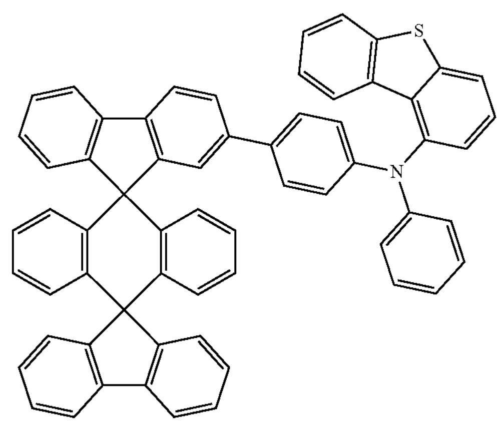
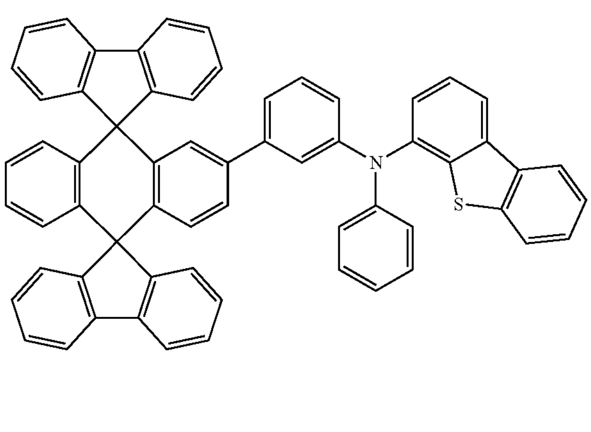
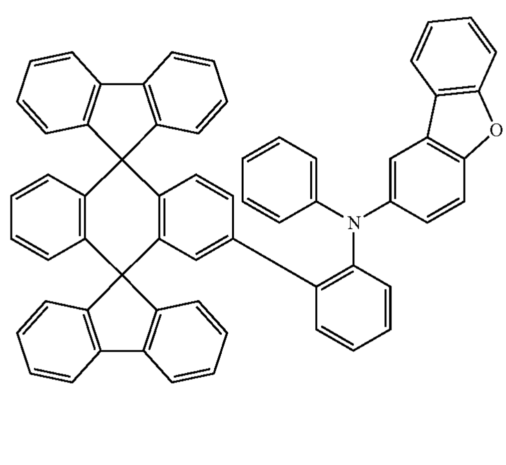

-continued
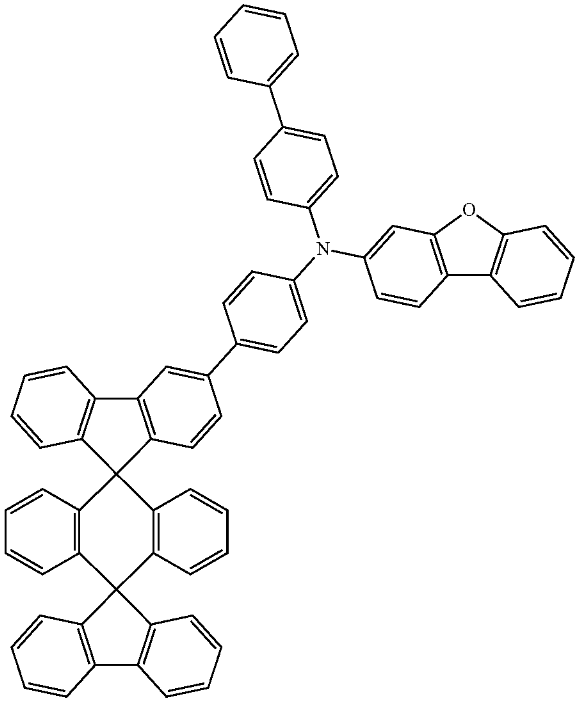
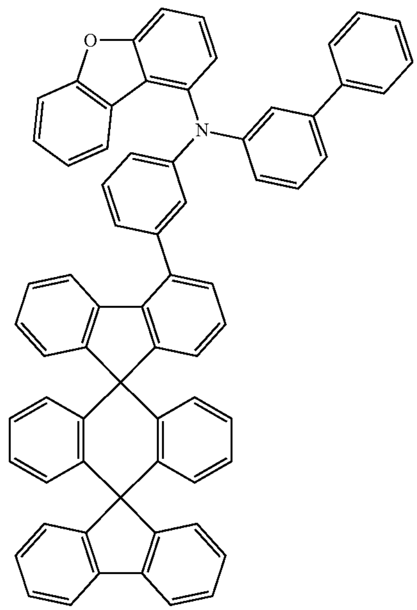
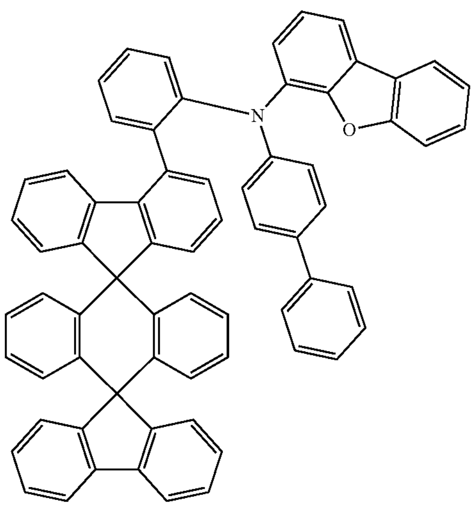
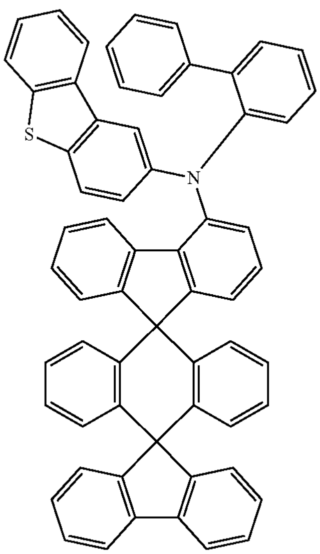
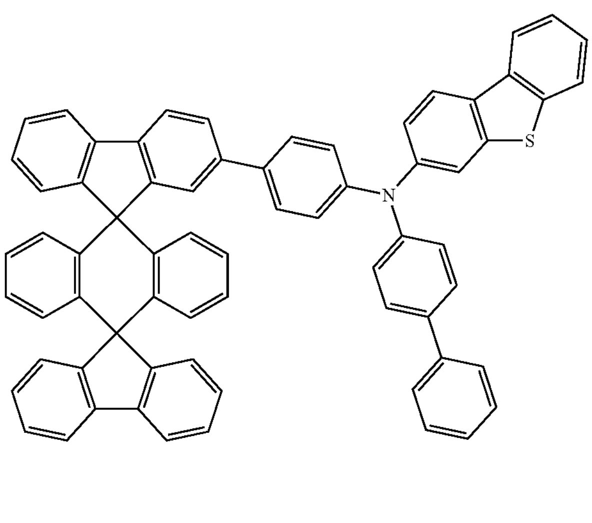
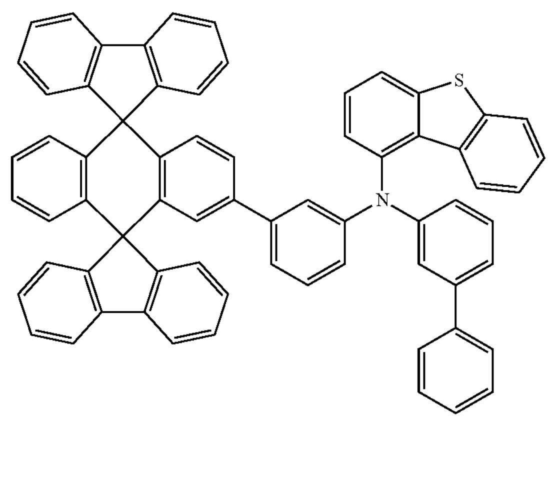

-continued
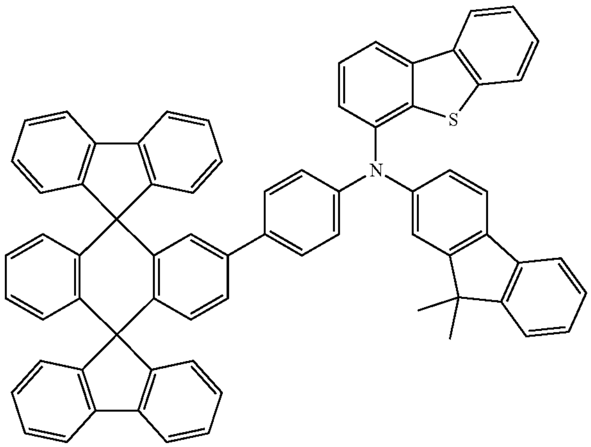
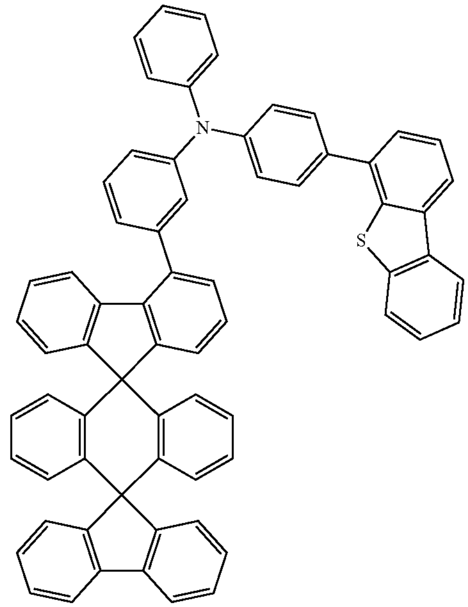
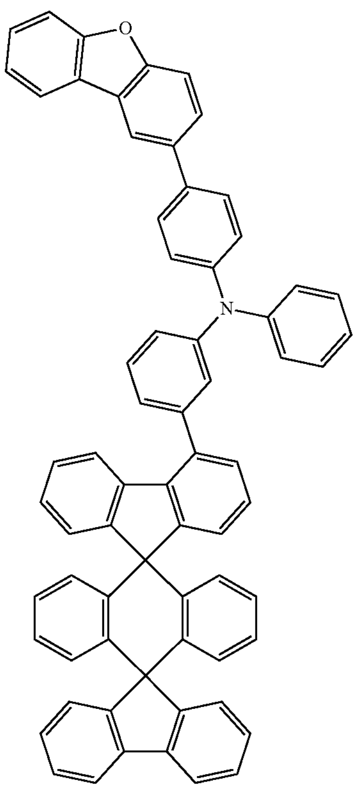
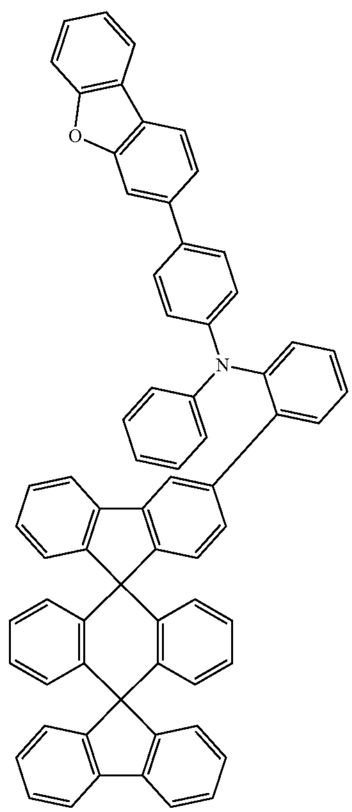

-continued
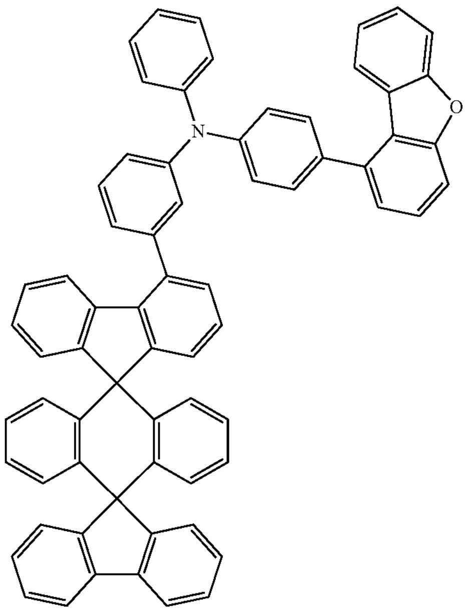
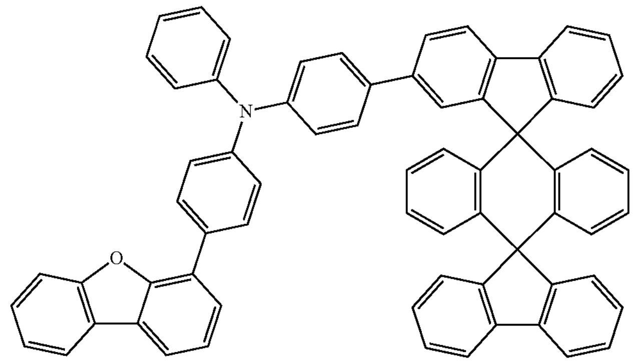
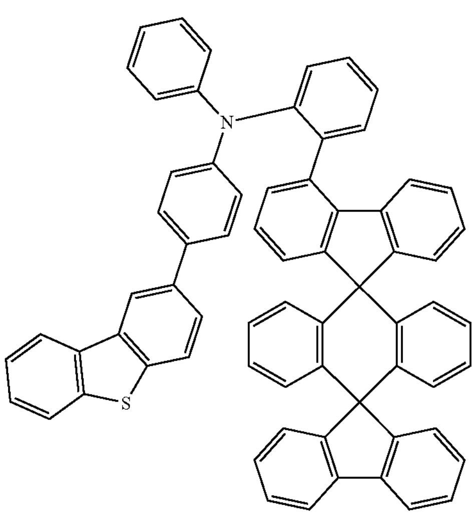
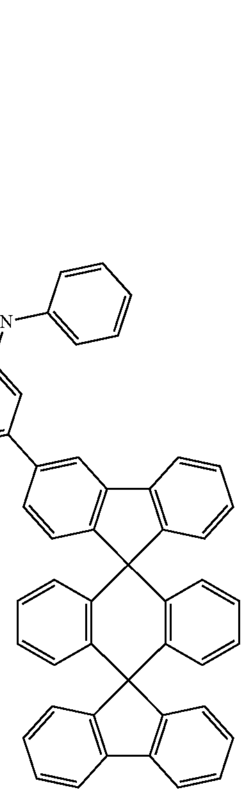

-continued
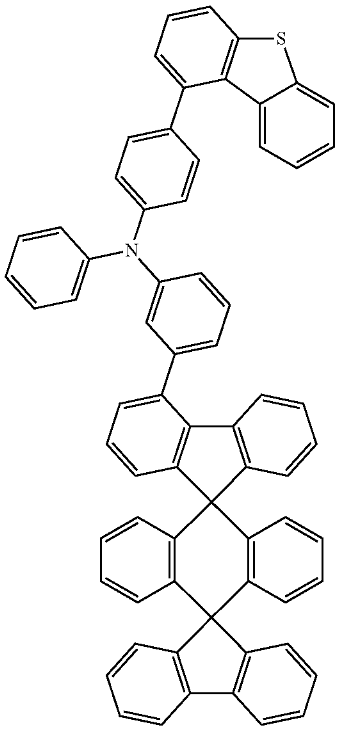
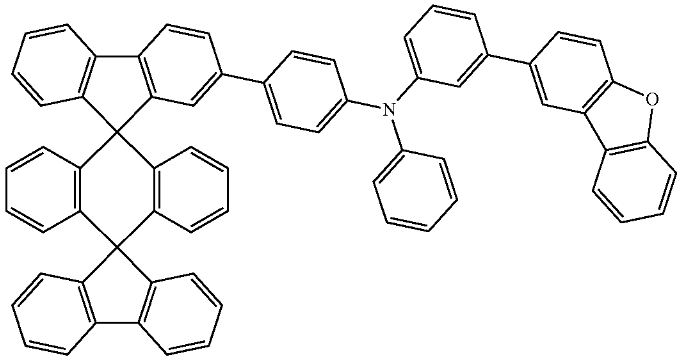
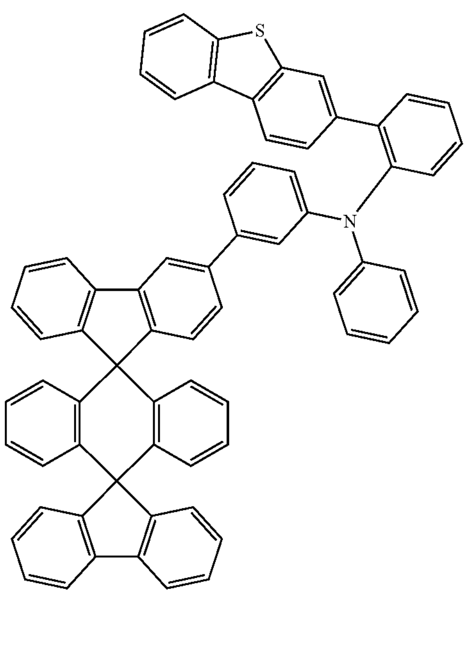
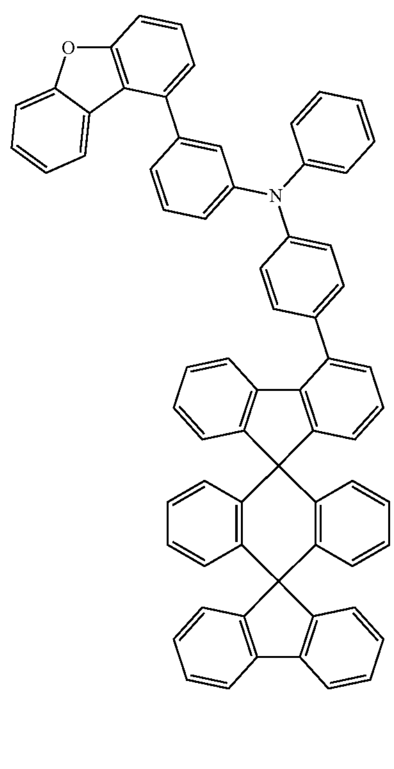

-continued
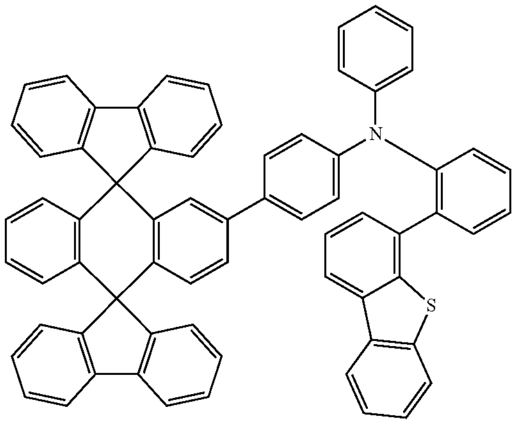
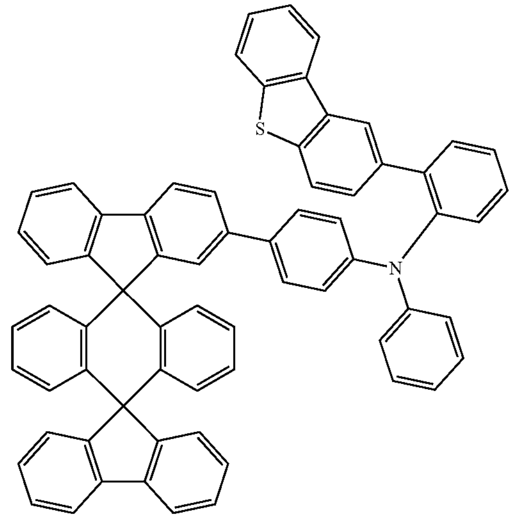
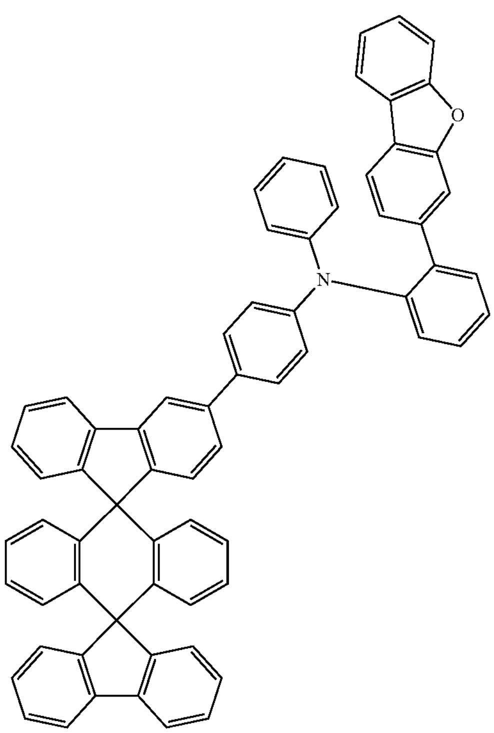
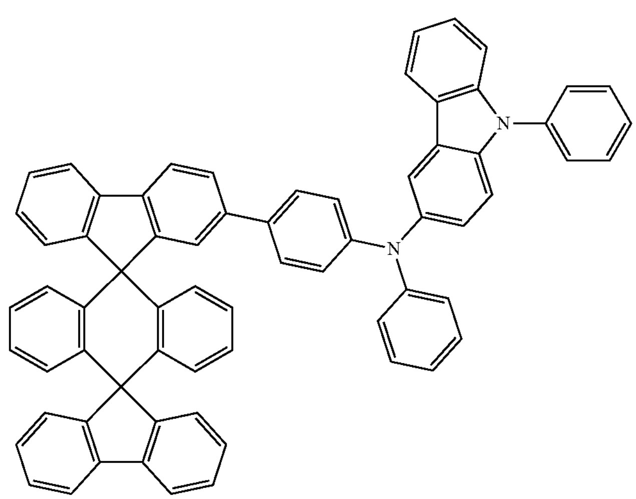

-continued
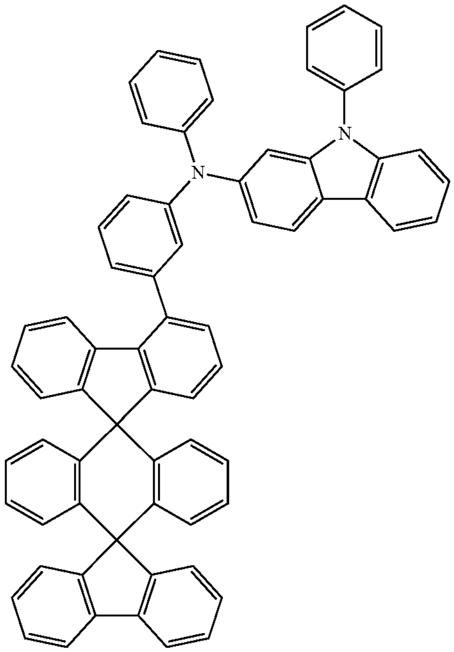
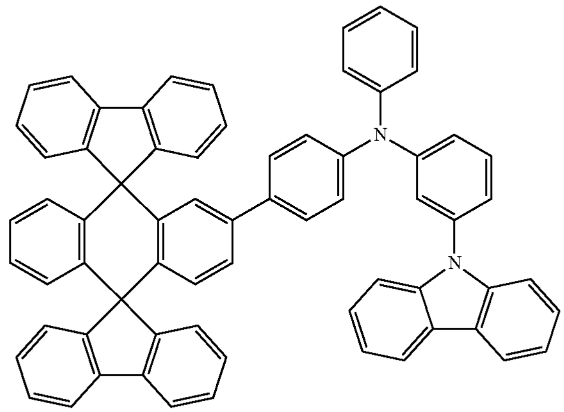
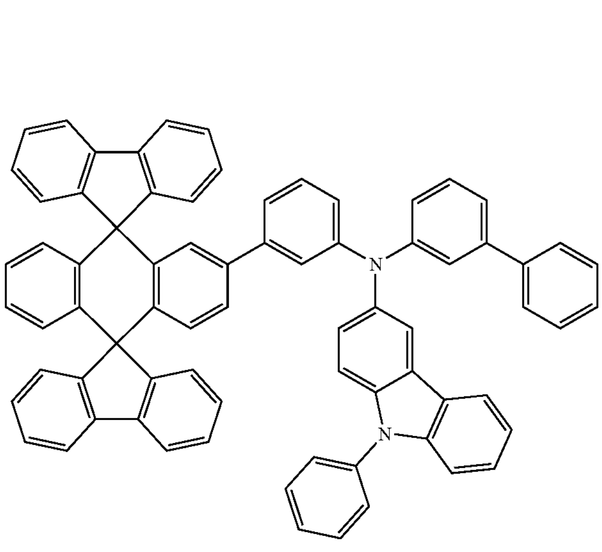
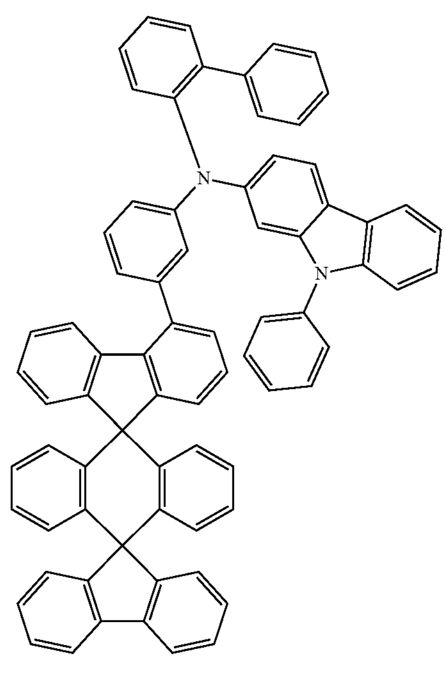

-continued
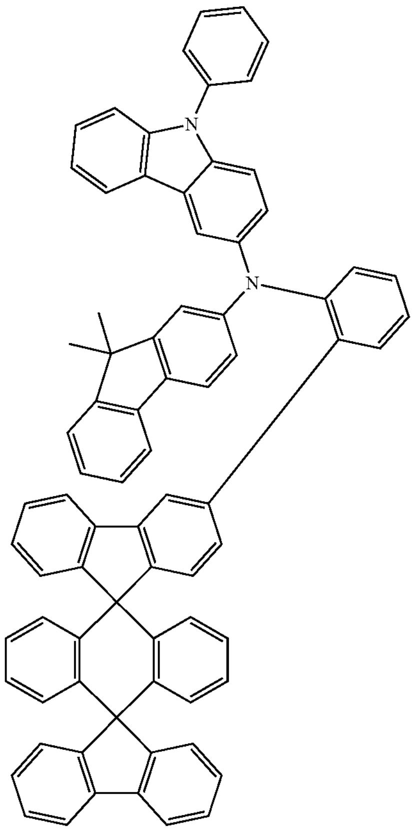
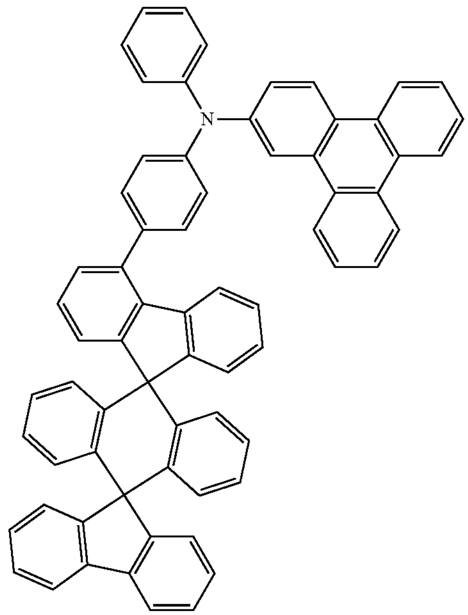
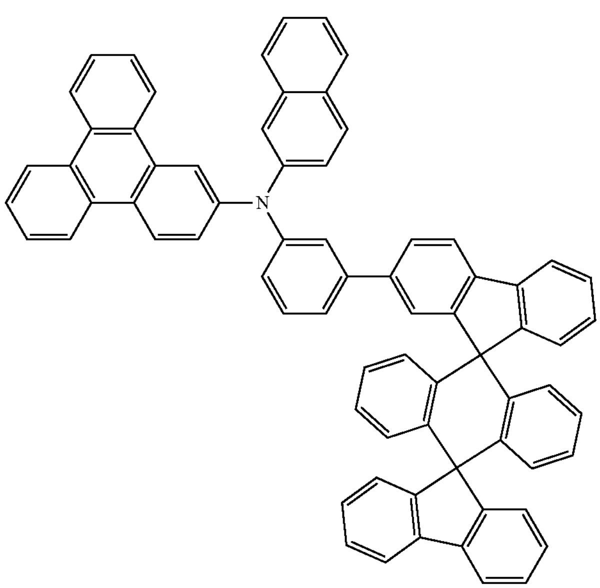

-continued
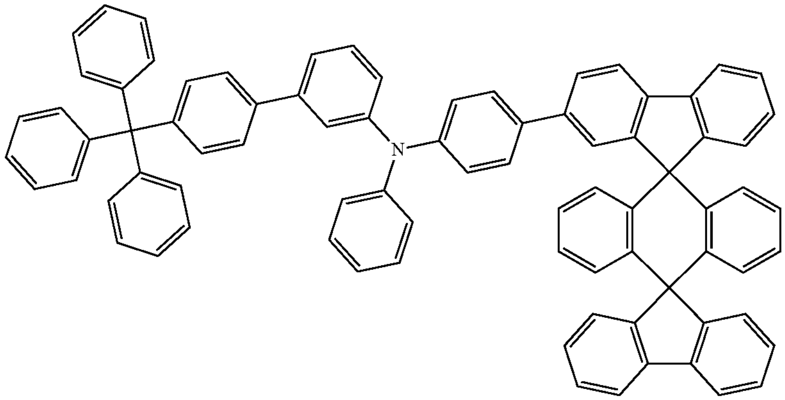
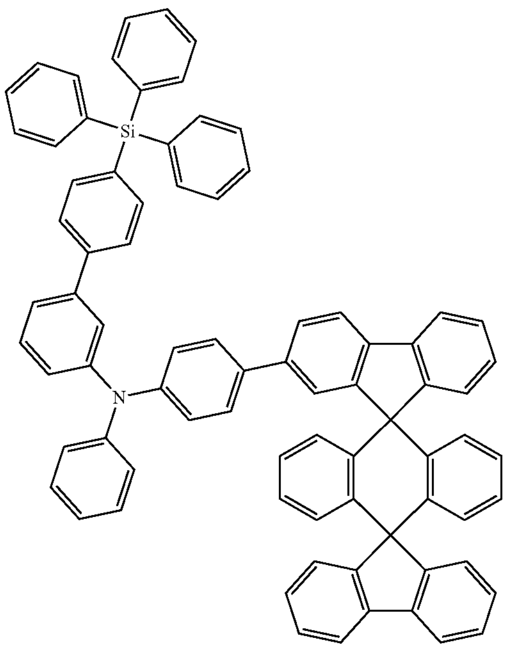
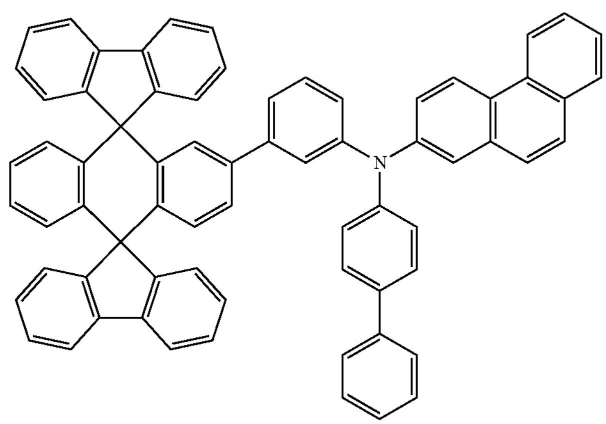
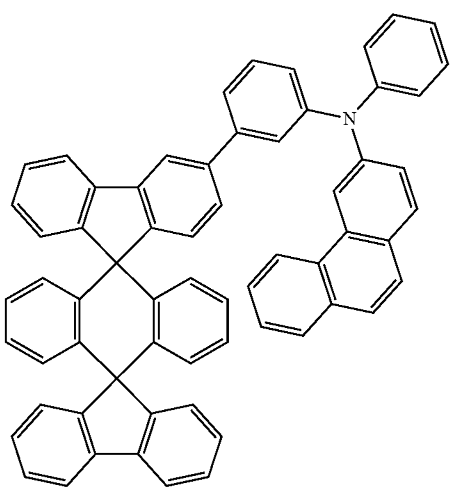
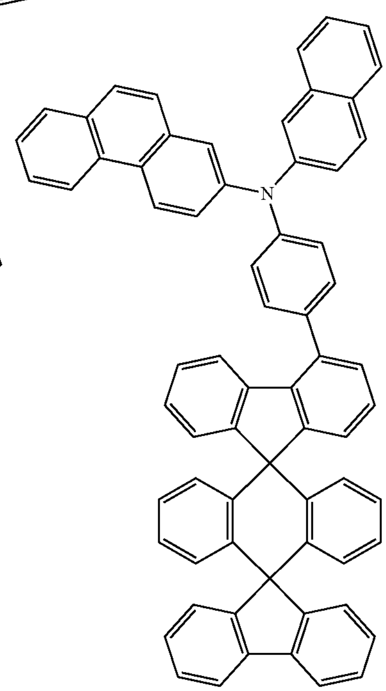

-continued
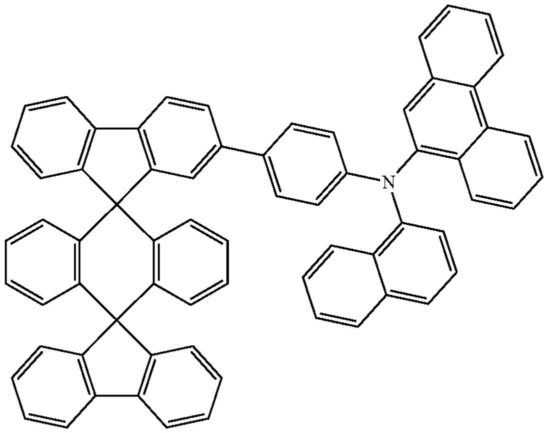
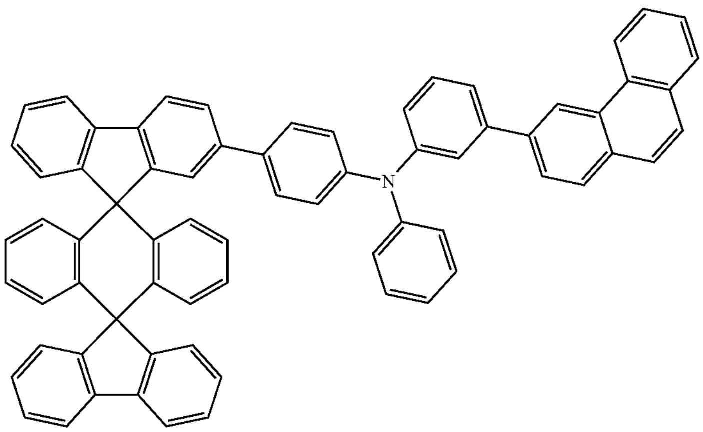
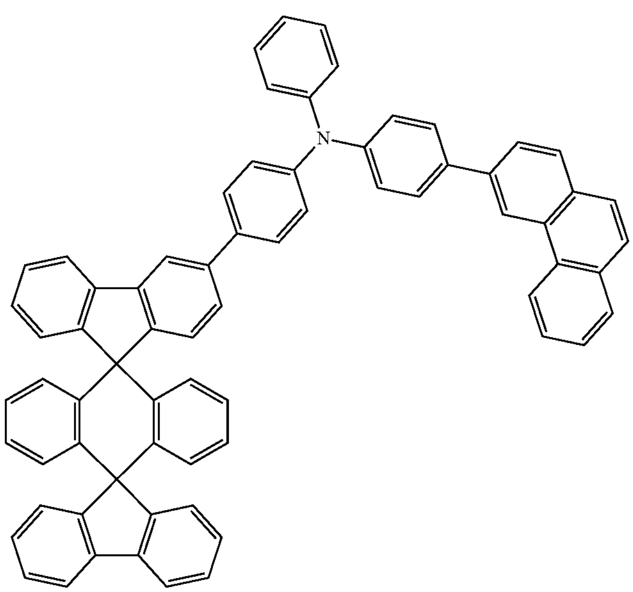
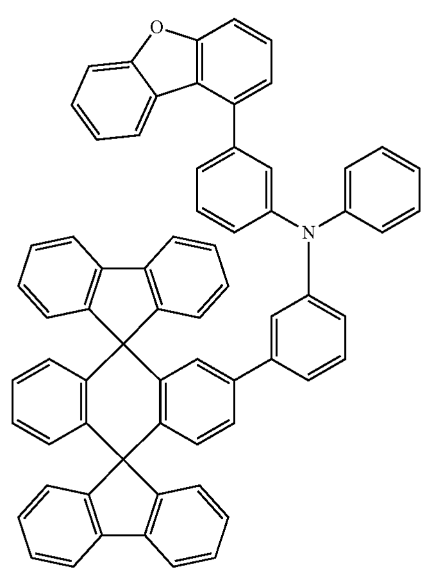

-continued
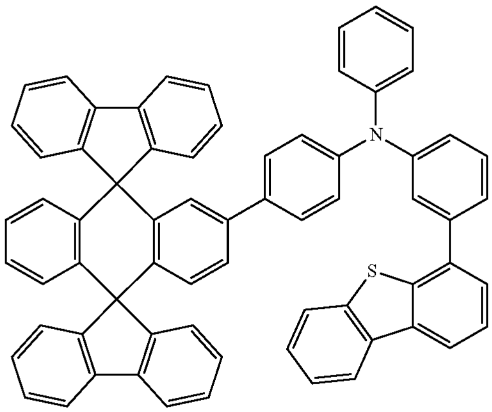
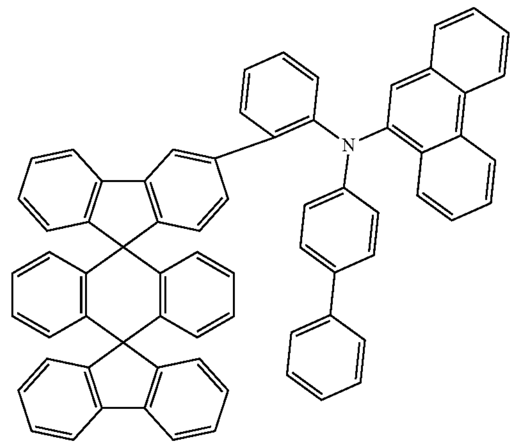
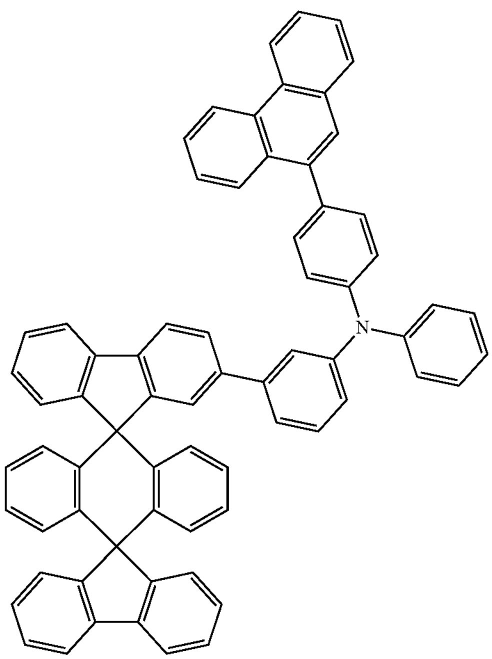
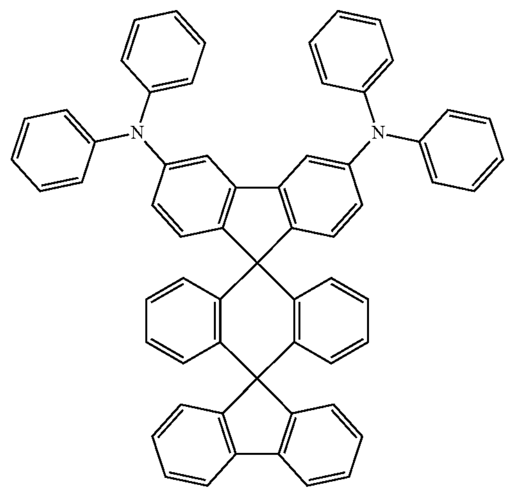
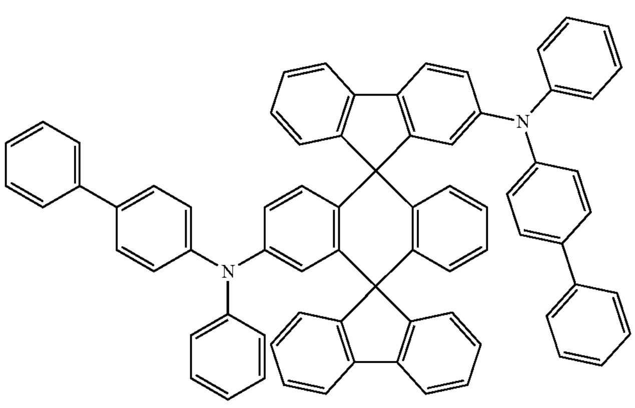

-continued
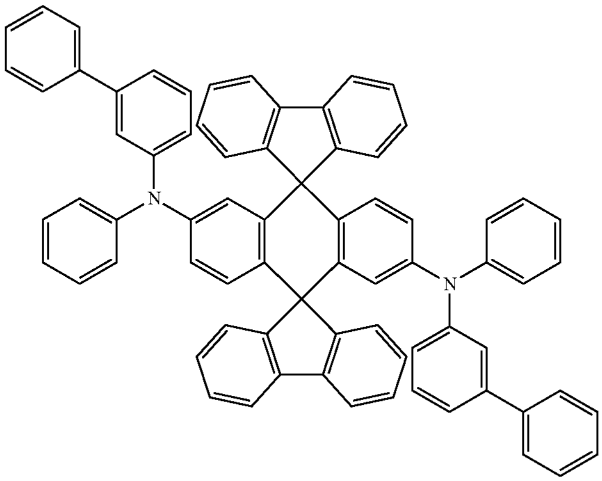
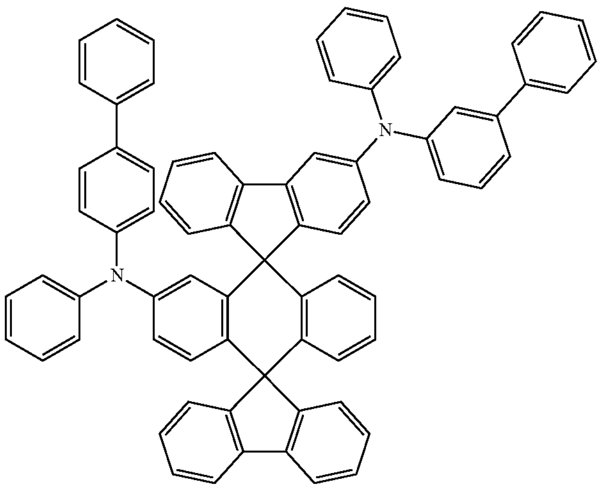
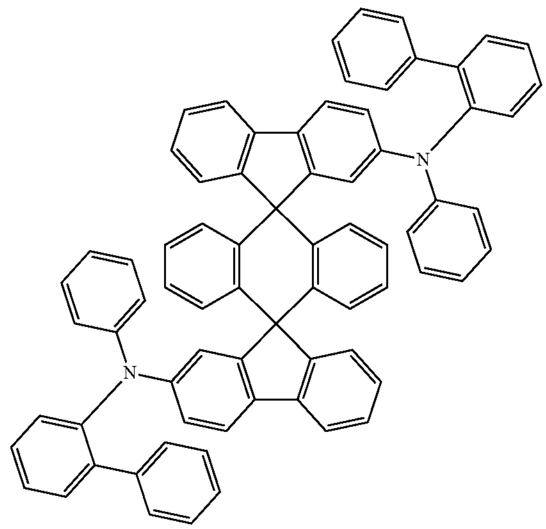
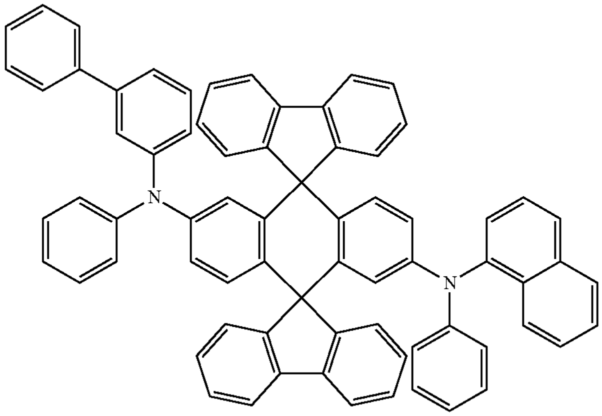
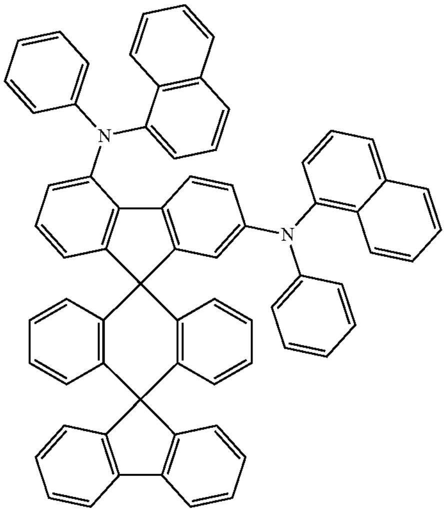

-continued
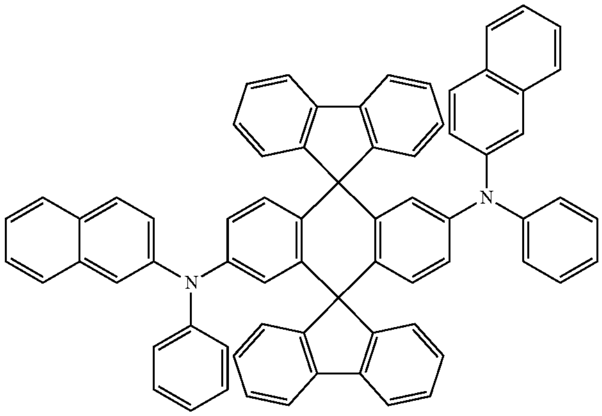
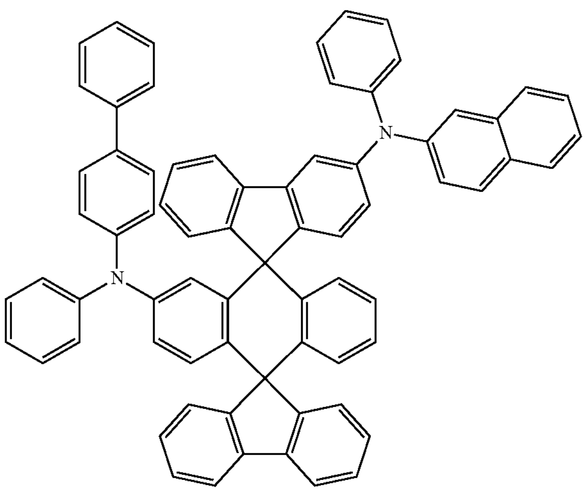
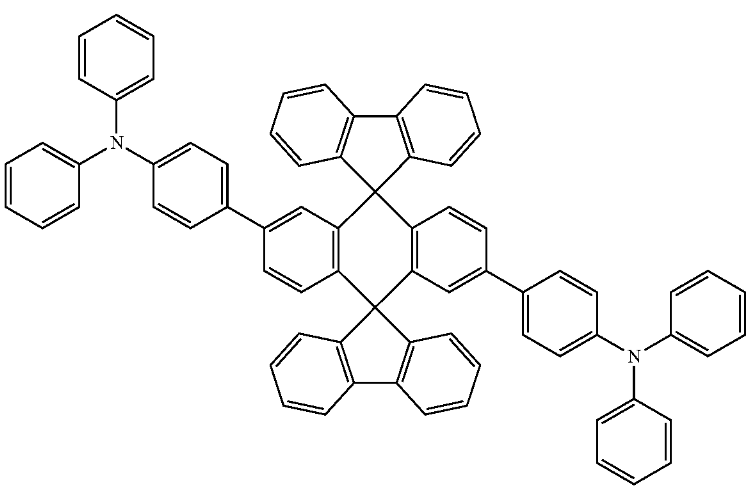

-continued
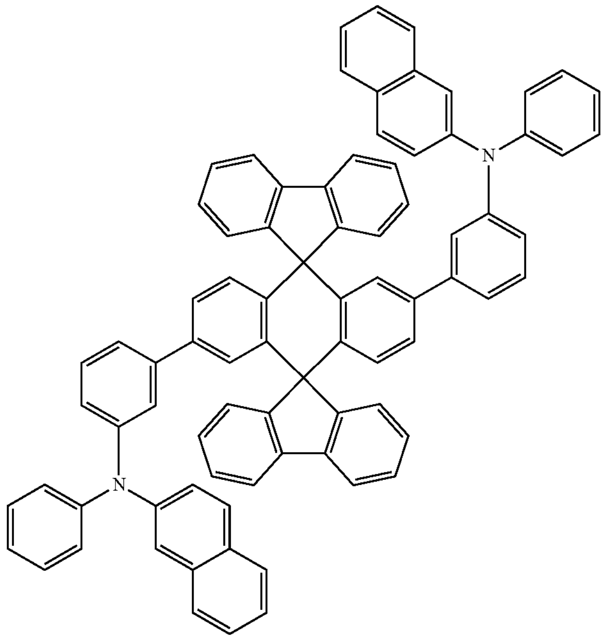
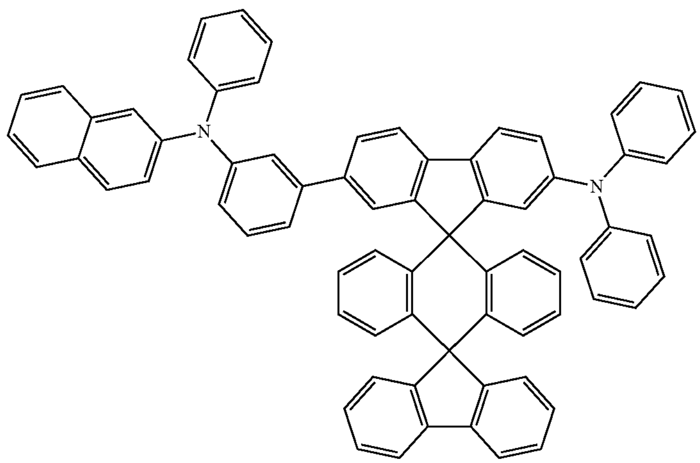
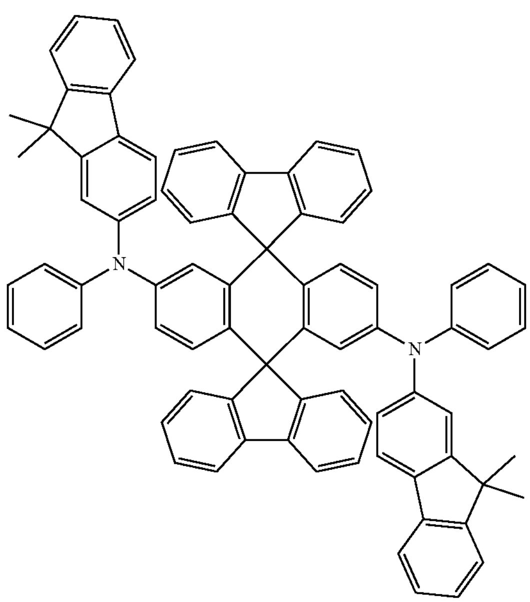

-continued
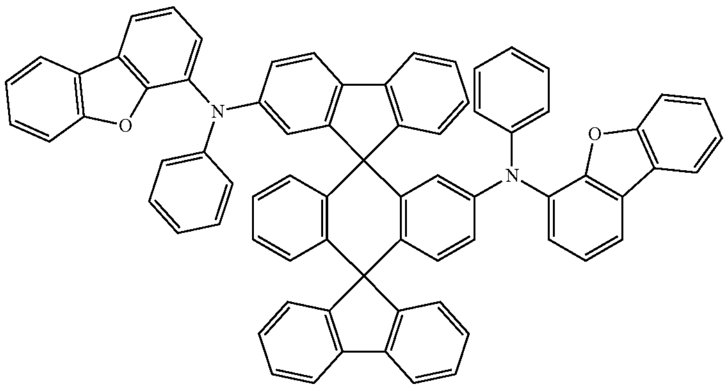
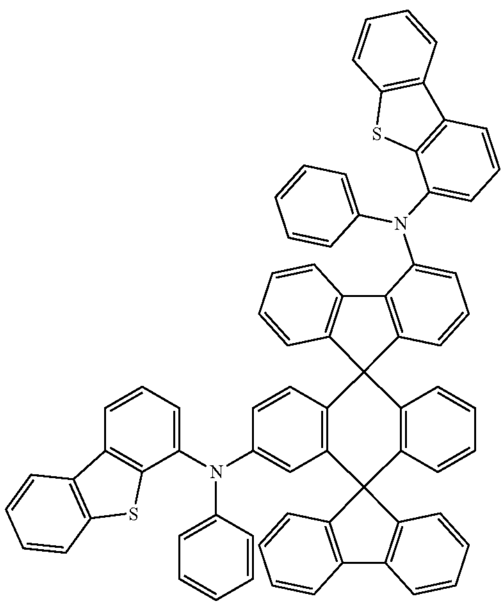
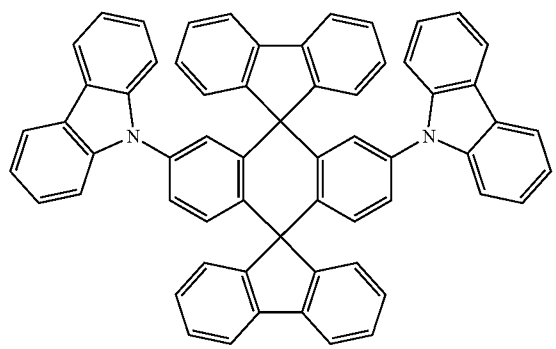
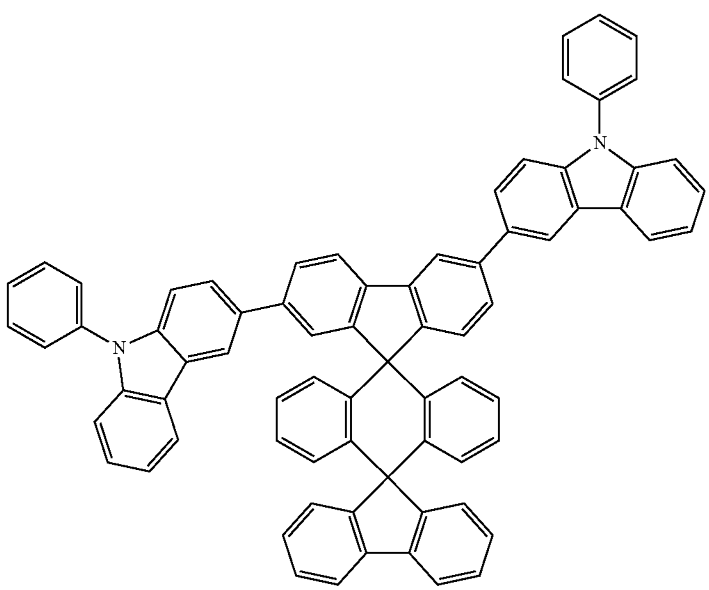
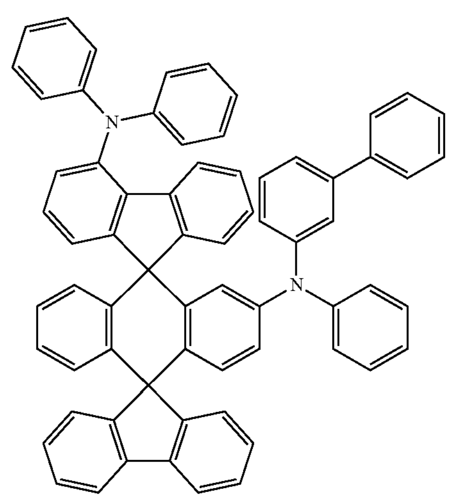

-continued
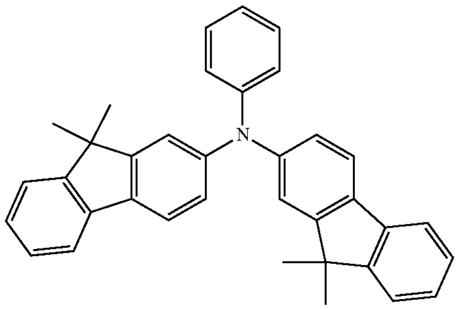
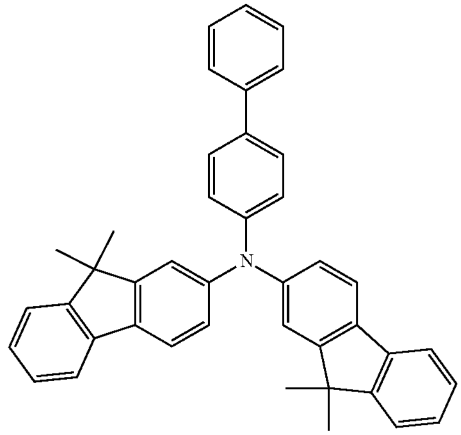
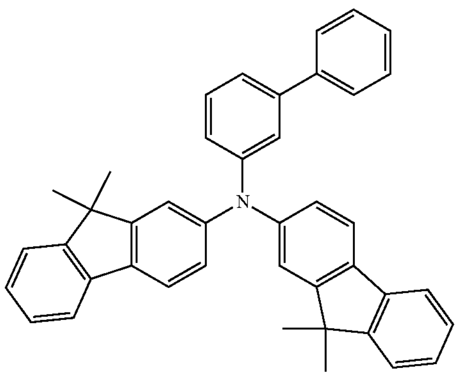
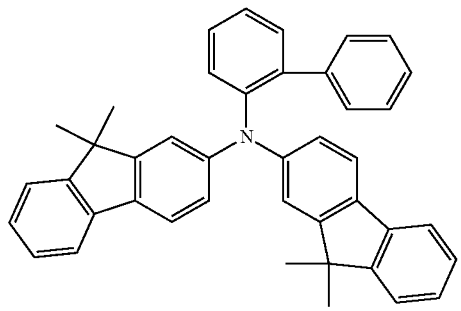
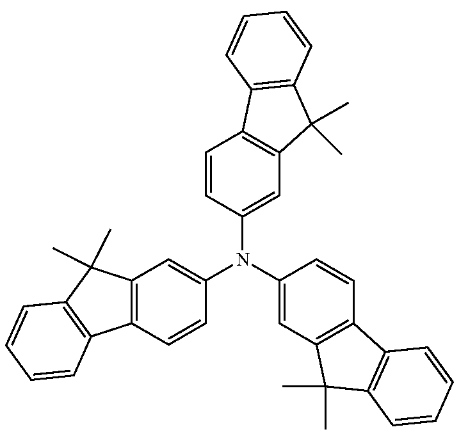
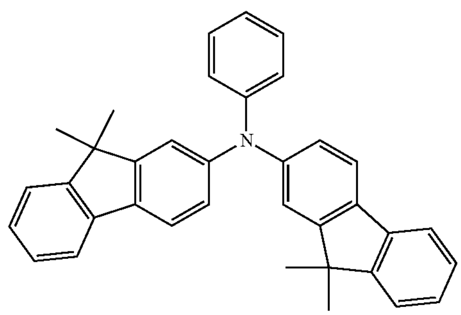
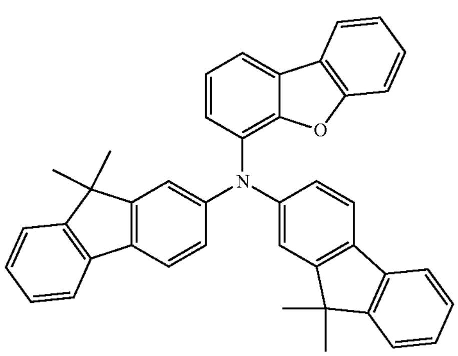
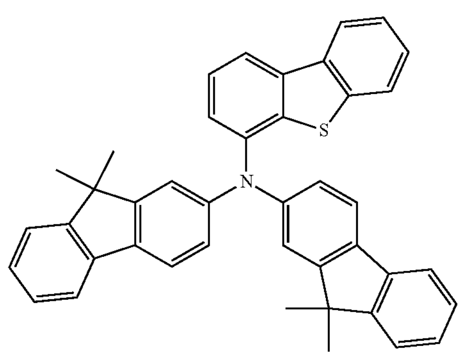

-continued
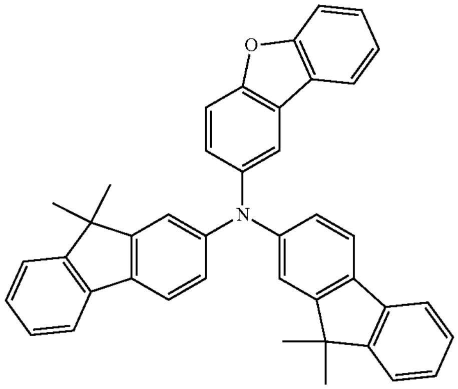
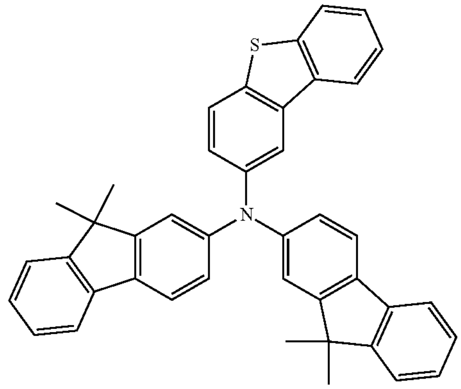
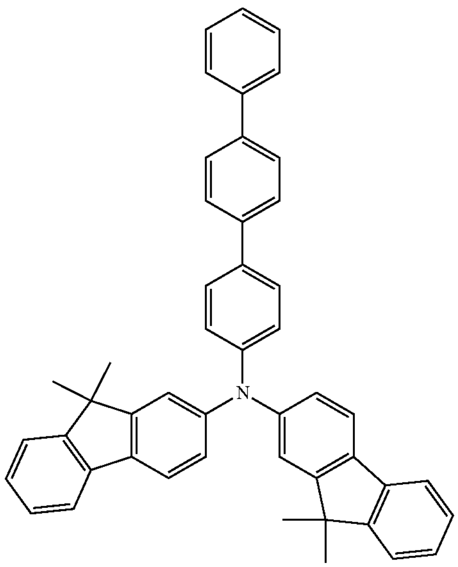
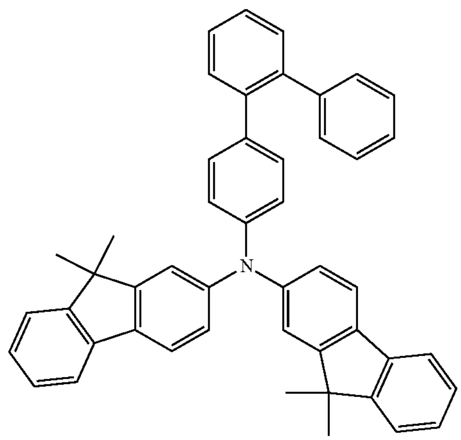
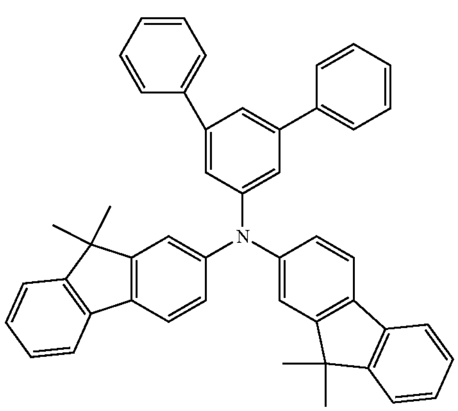
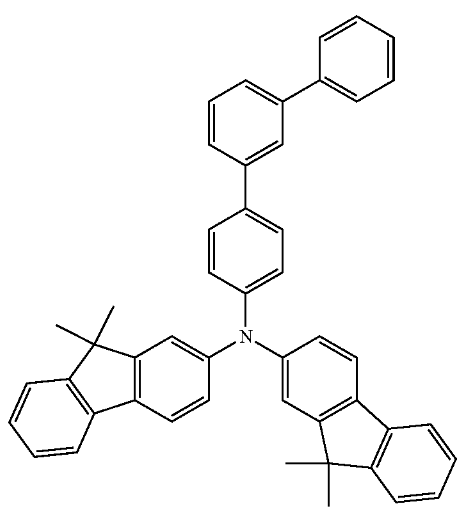

-continued
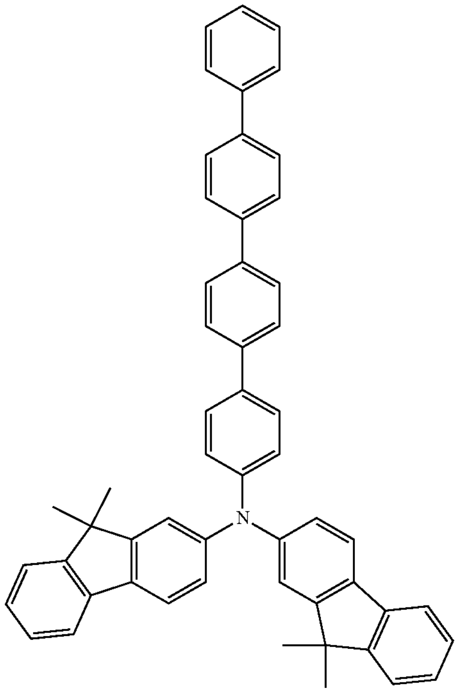
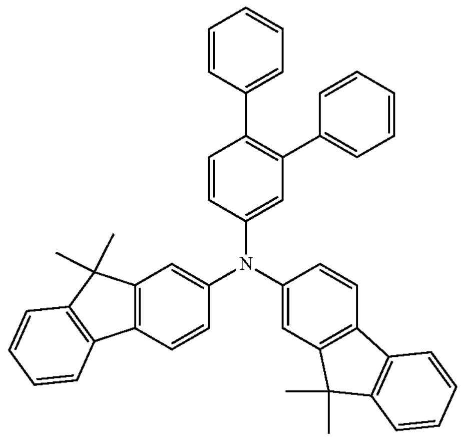
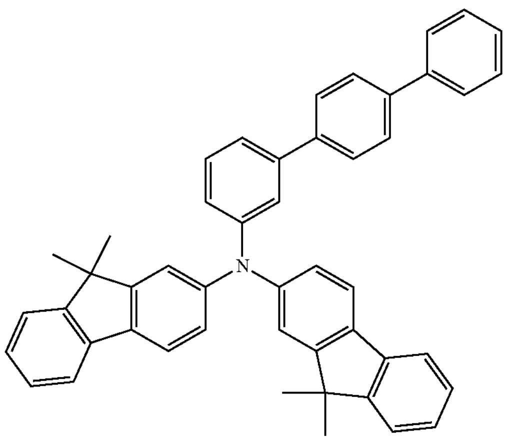
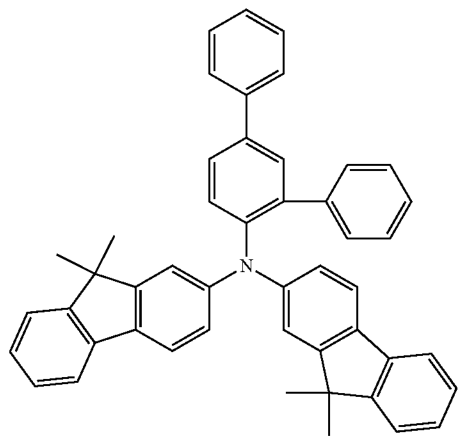
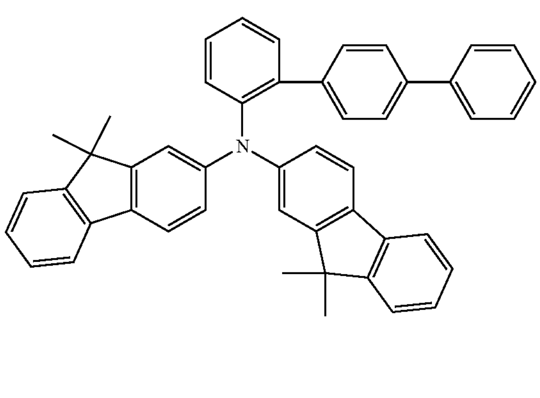
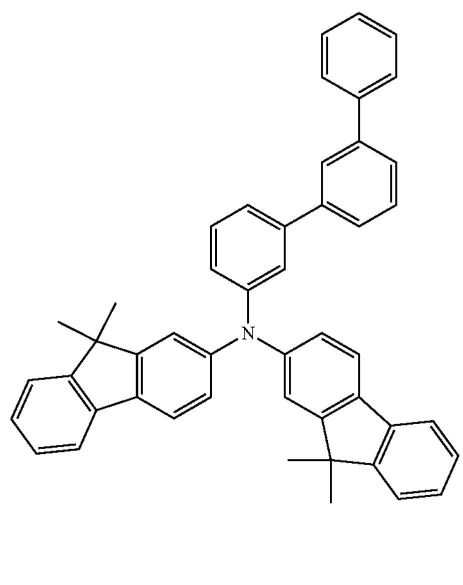

-continued
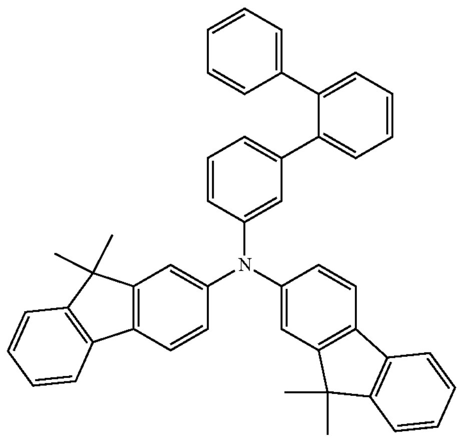
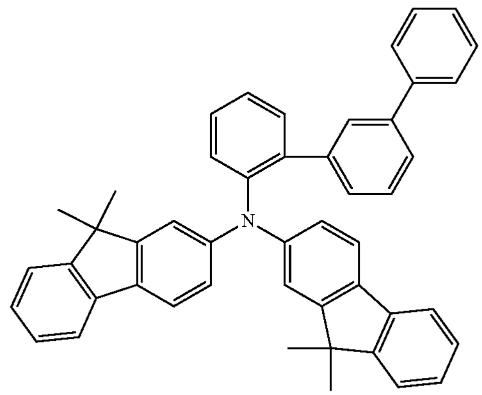
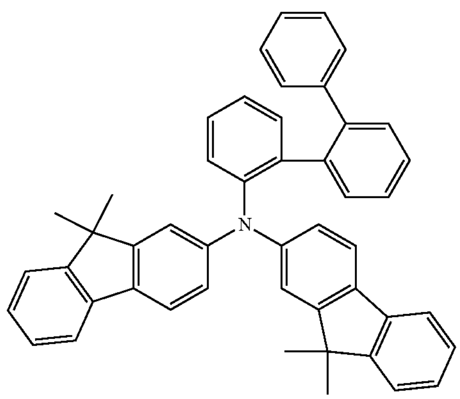
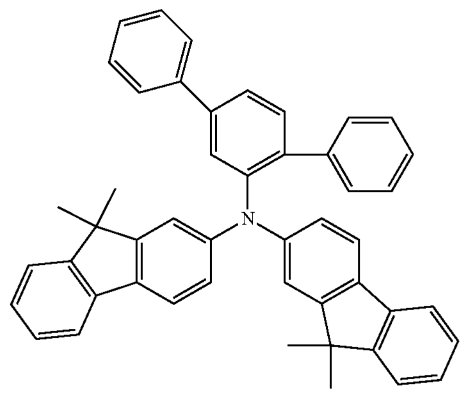
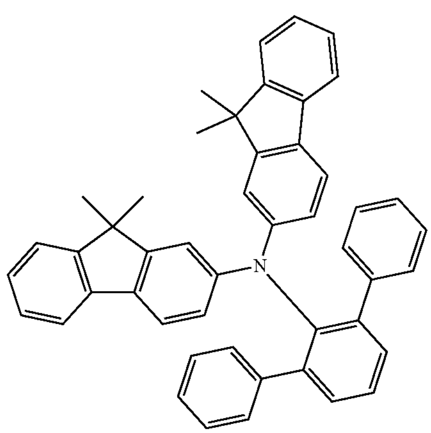

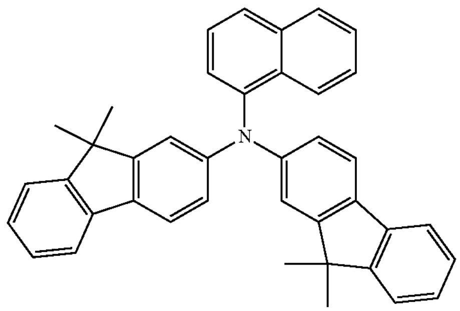
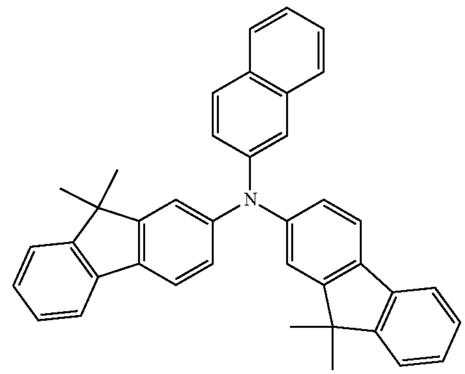
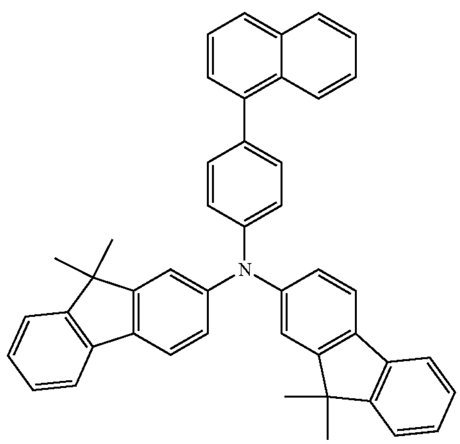
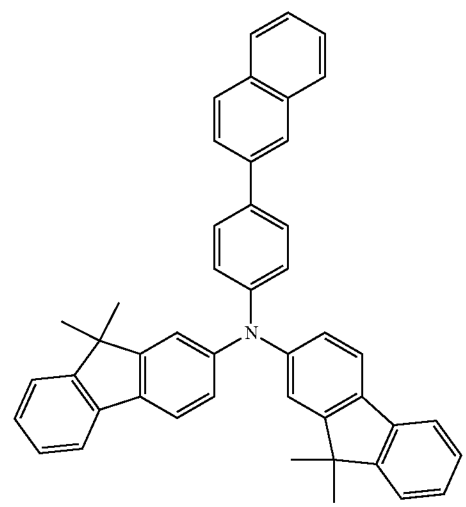
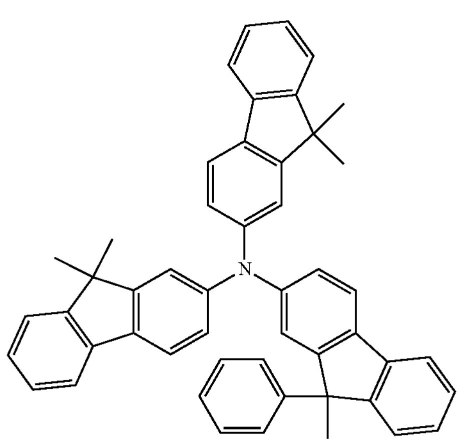
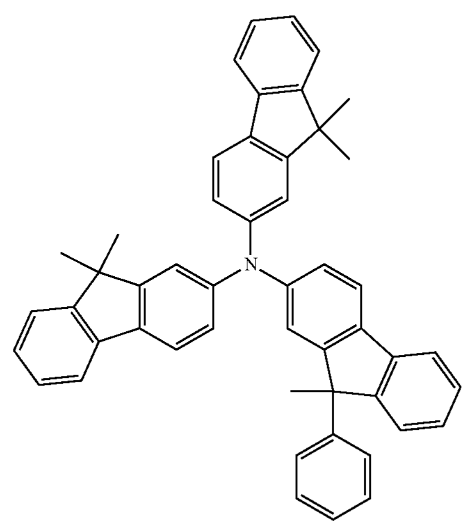
N

-continued
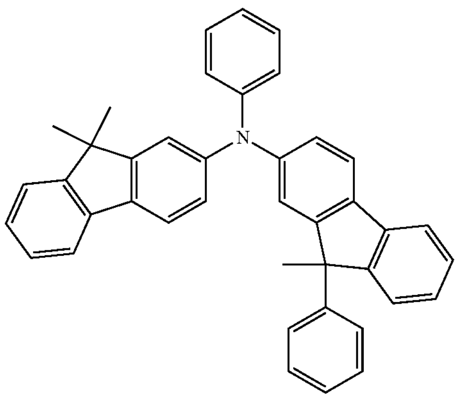
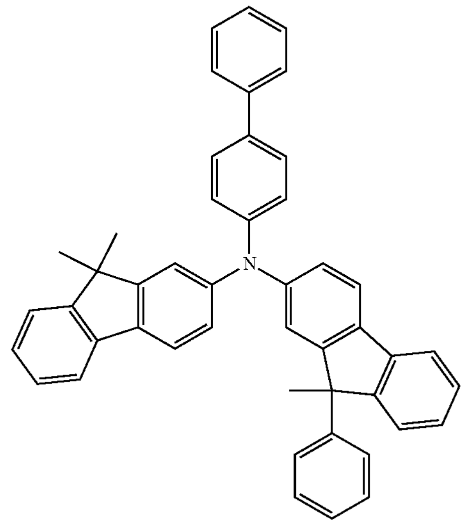
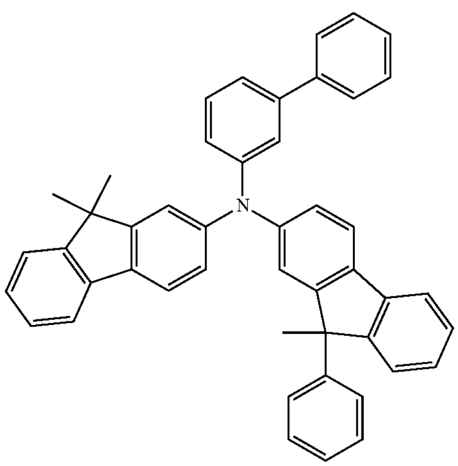
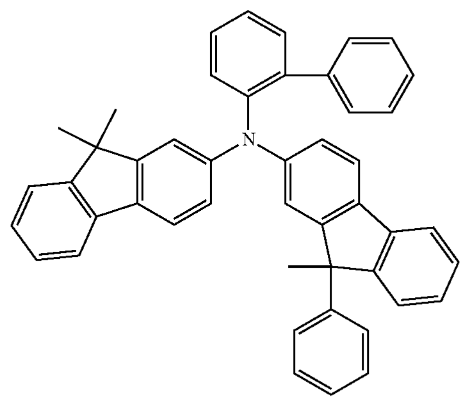
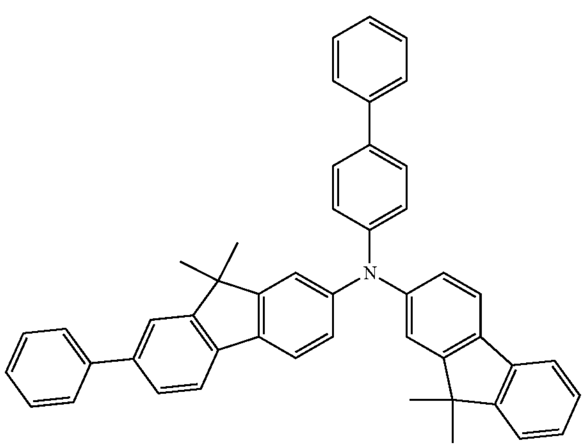

-continued
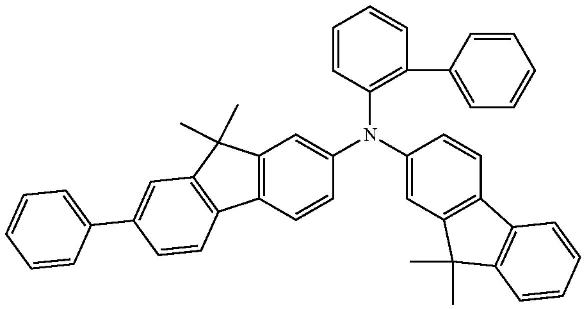
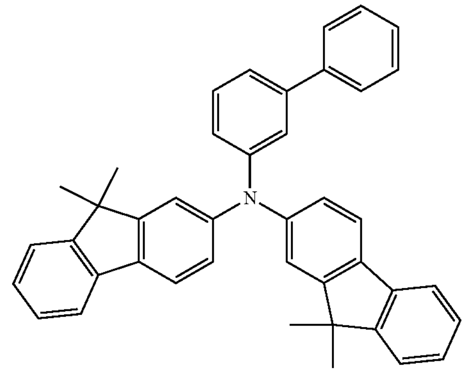
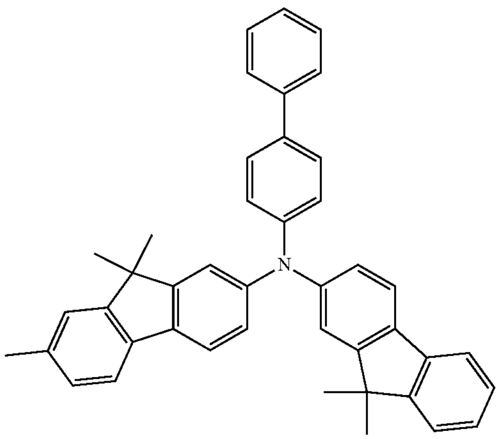
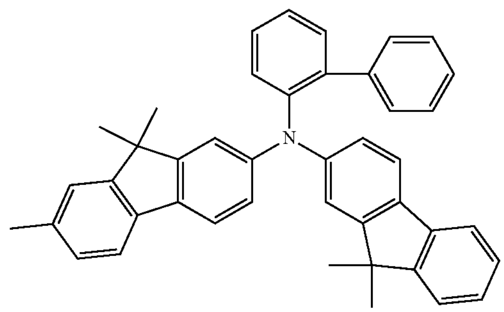
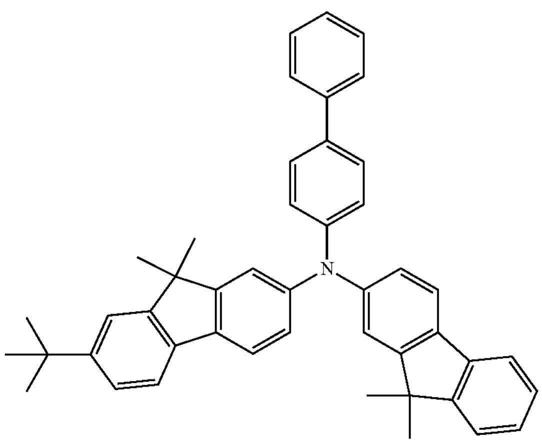
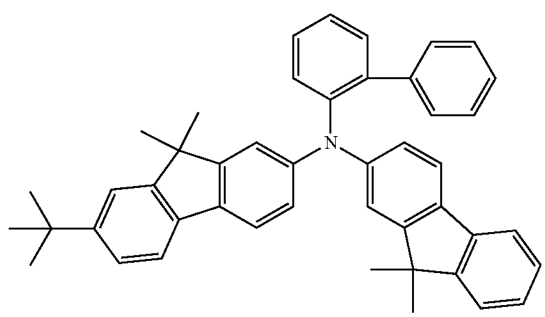
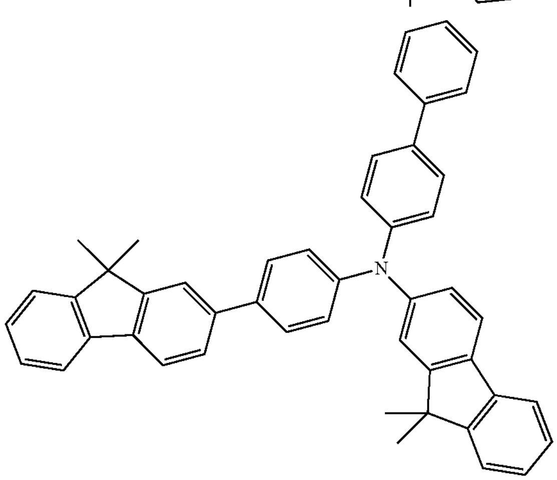
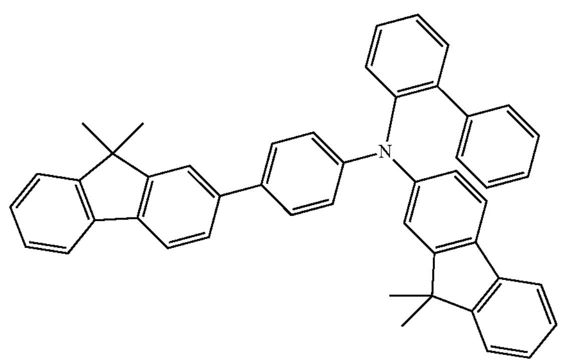

-continued
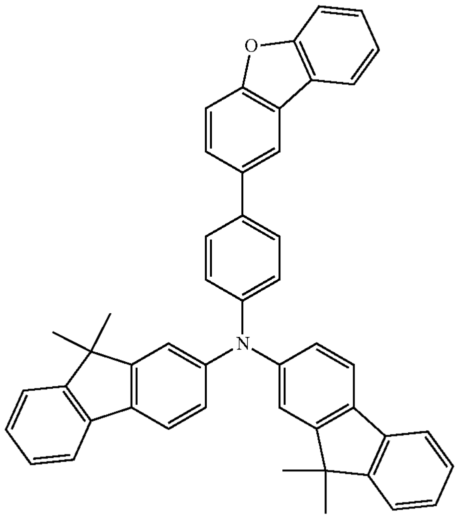
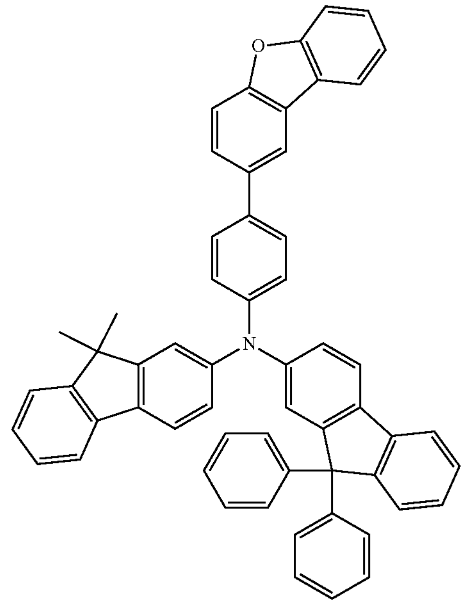
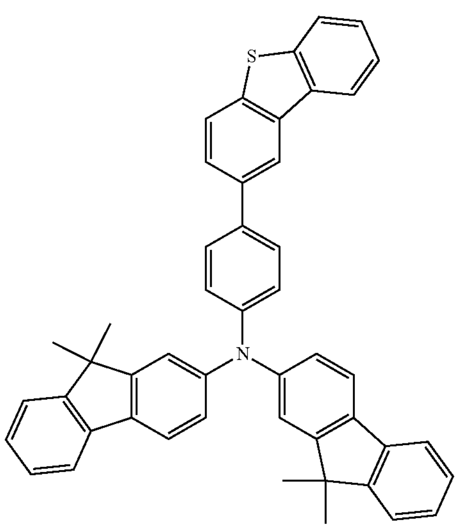
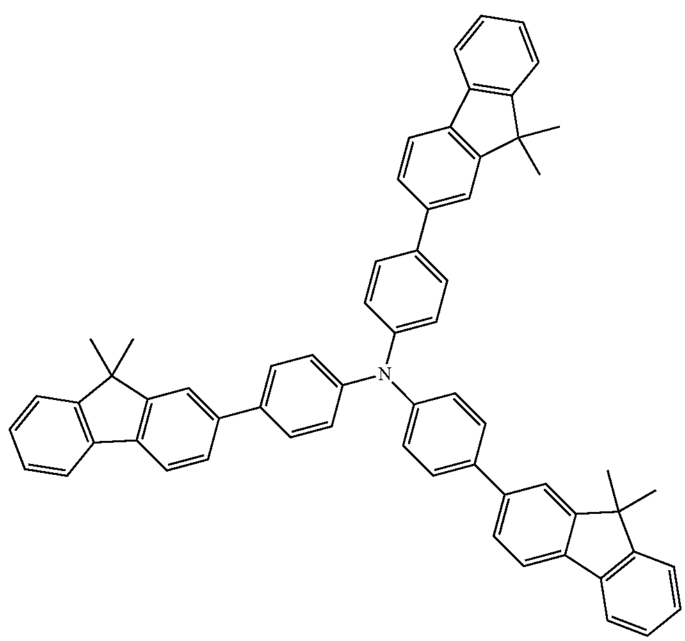

-continued
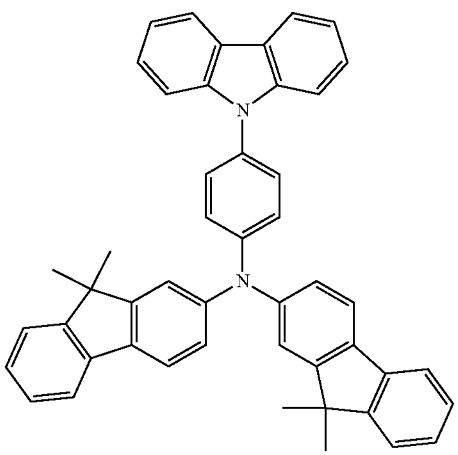
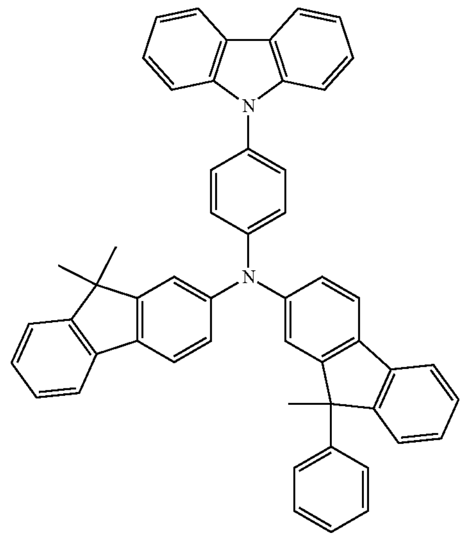
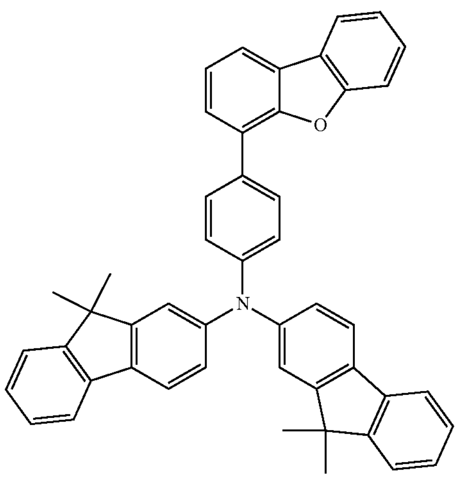
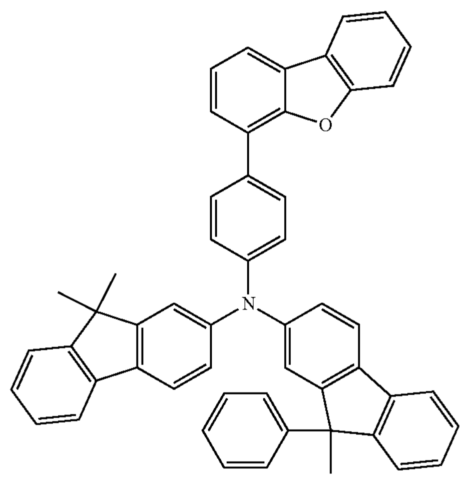
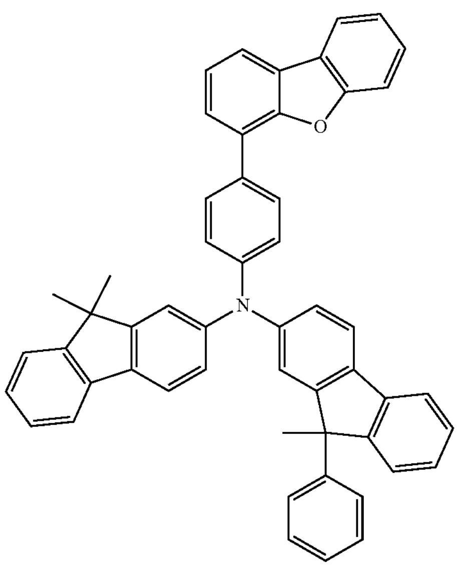
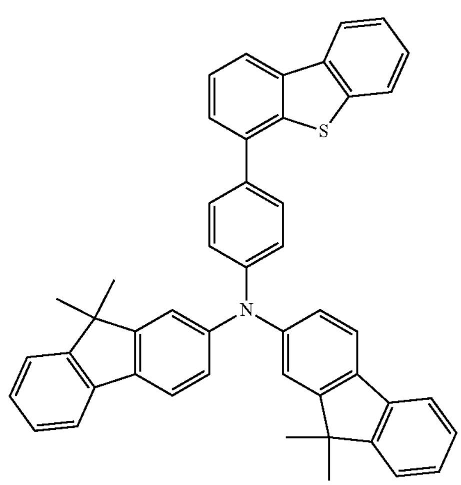

-continued
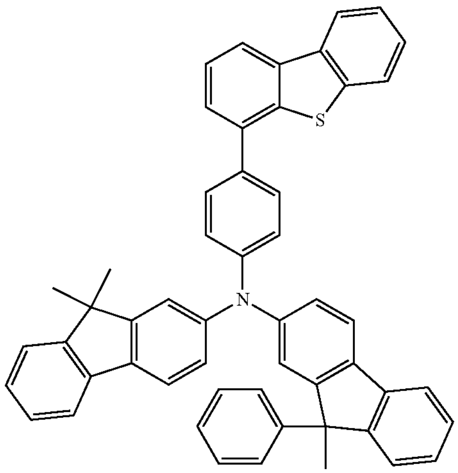
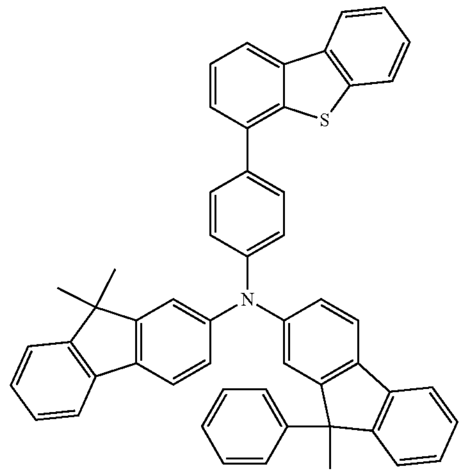
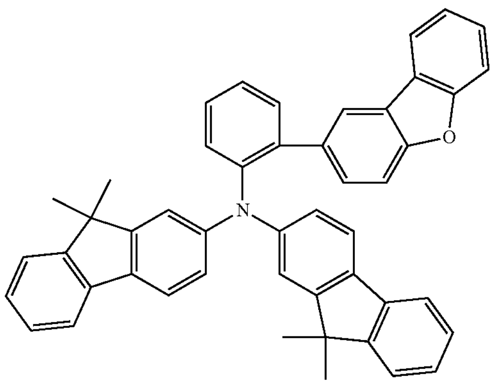
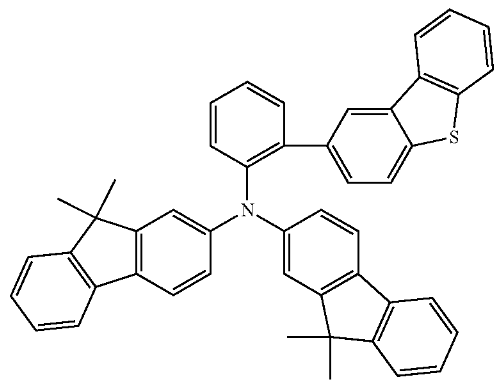
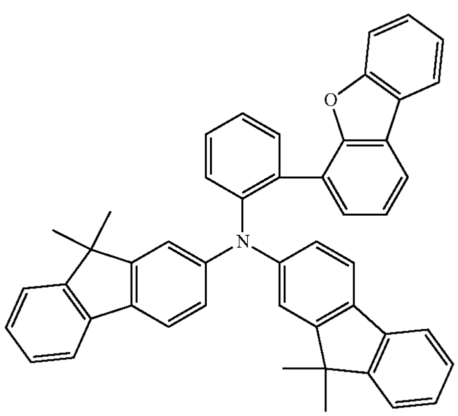
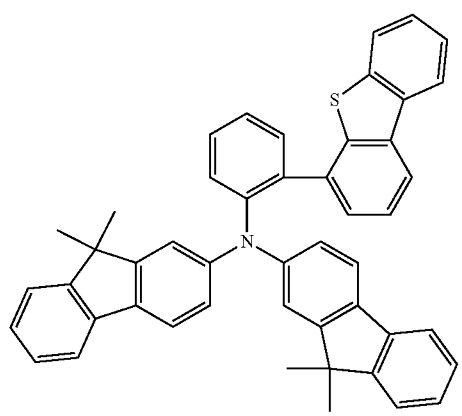
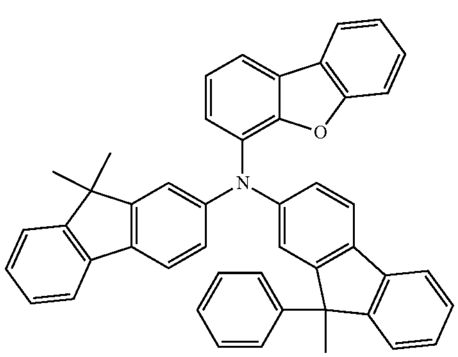
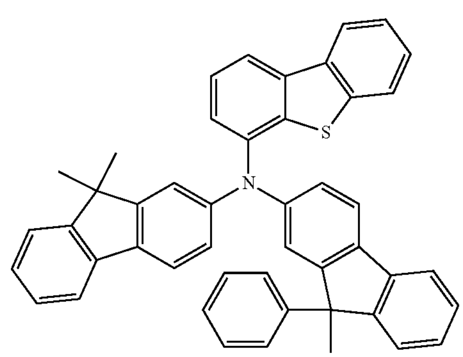

-continued
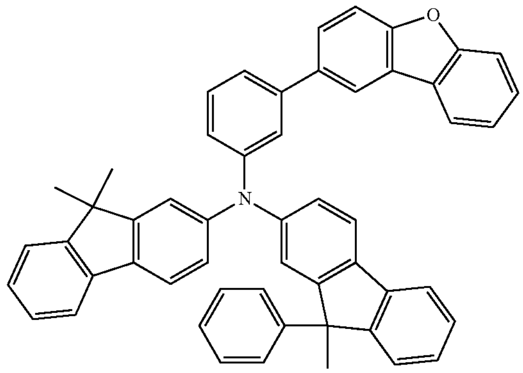
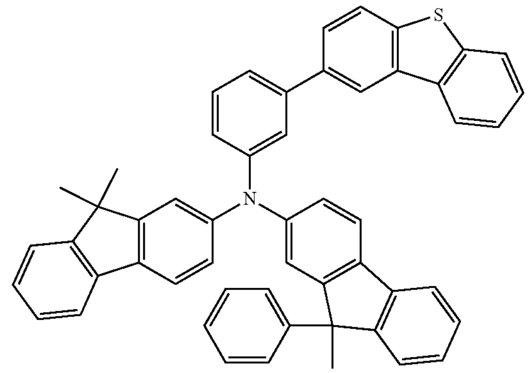
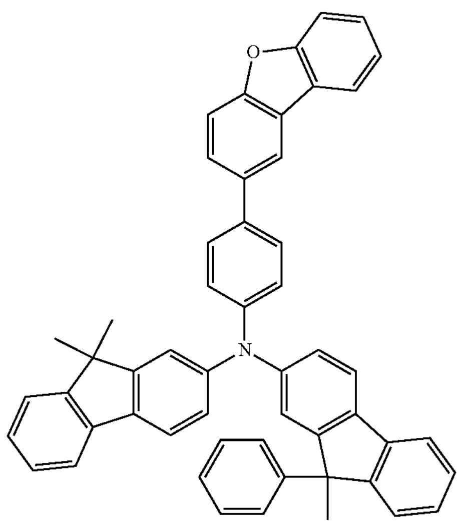
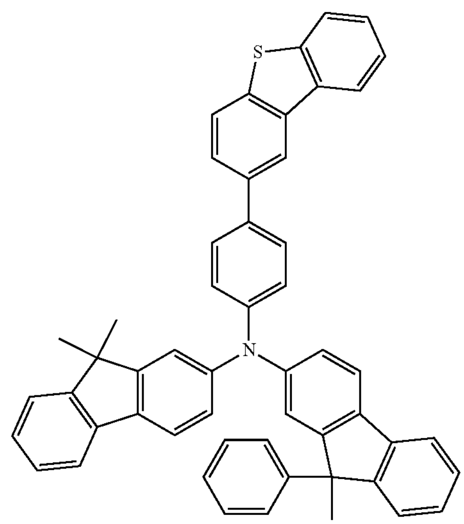
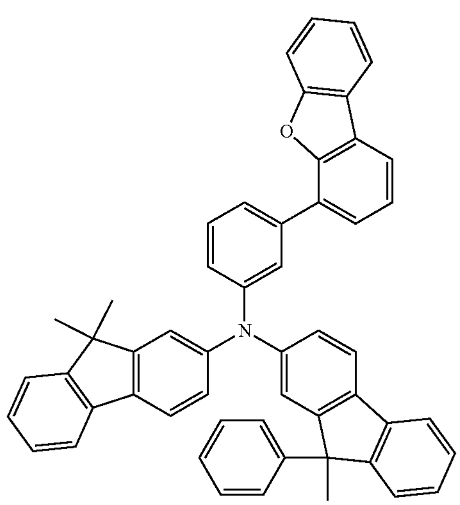
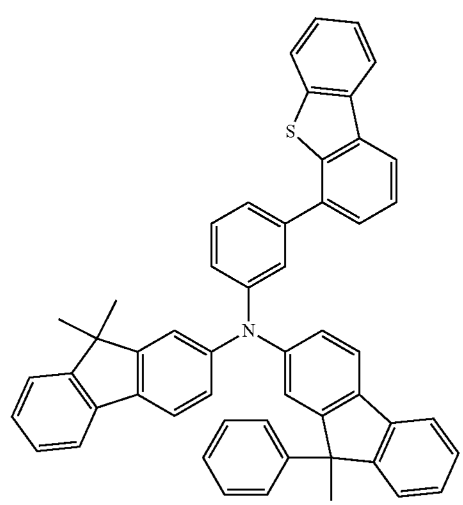

-continued
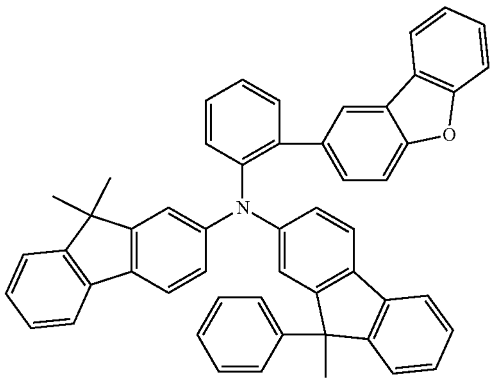
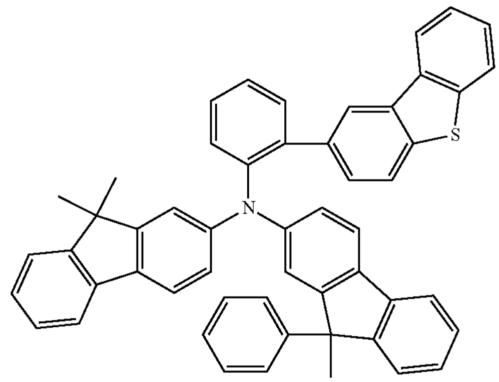
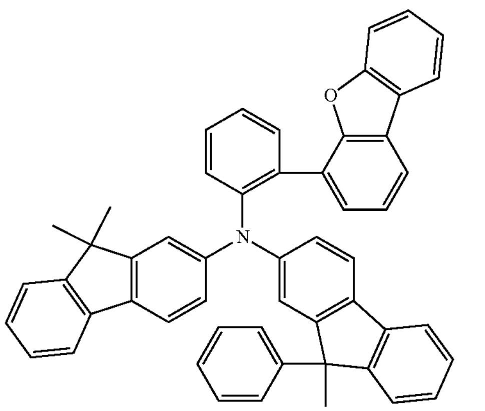
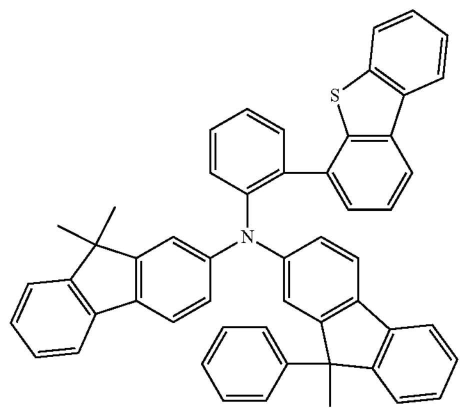
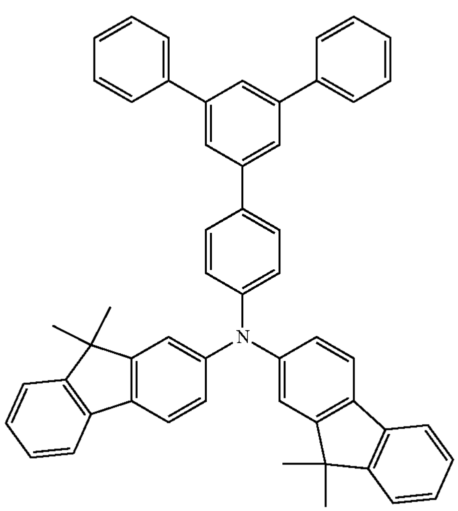
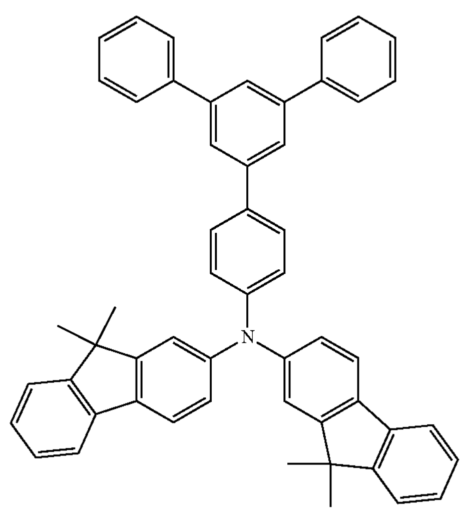

-continued
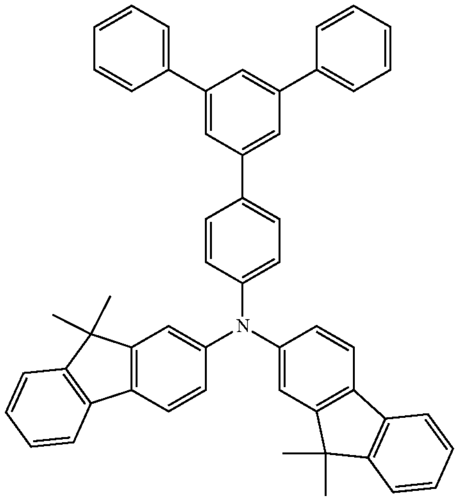
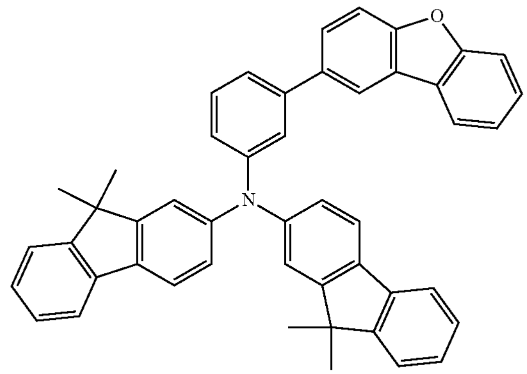
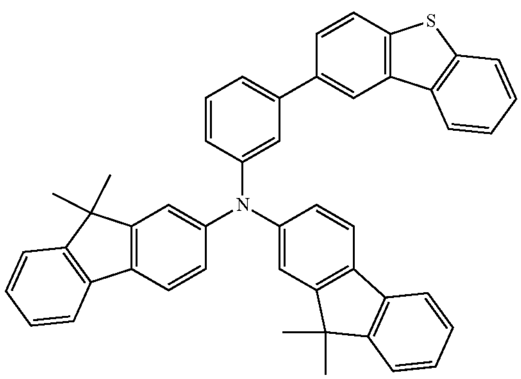
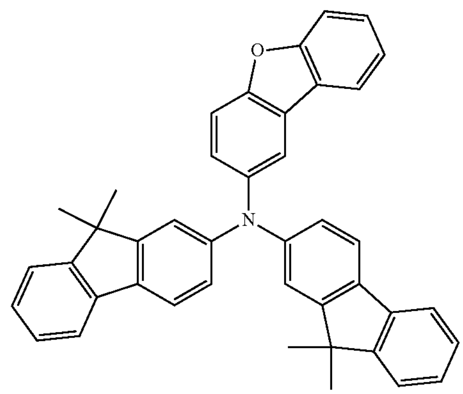
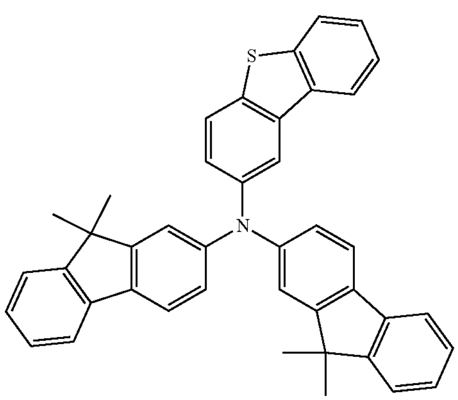
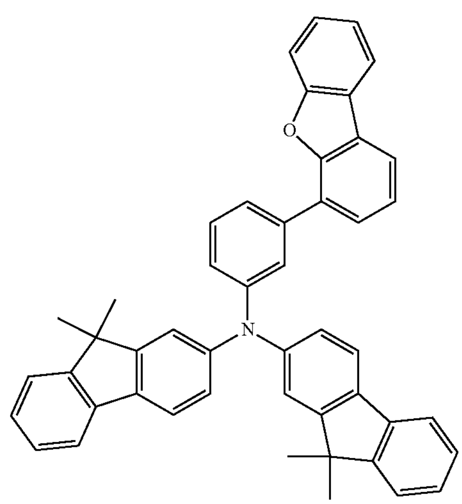

-continued
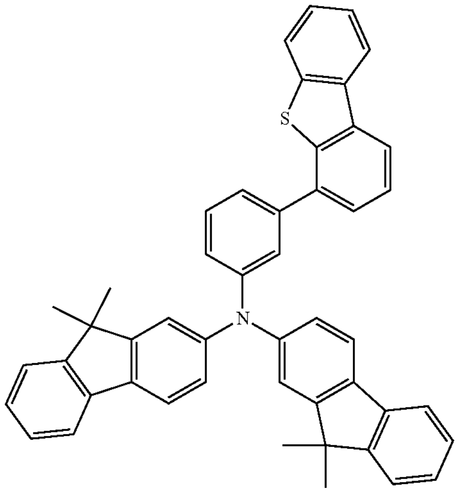
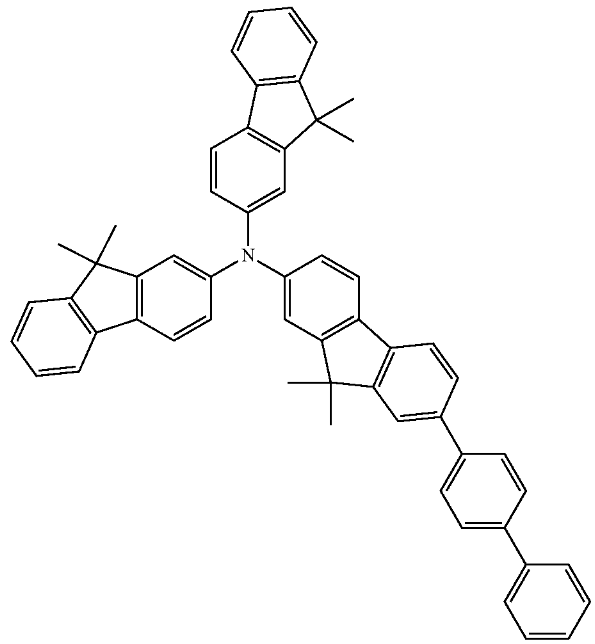
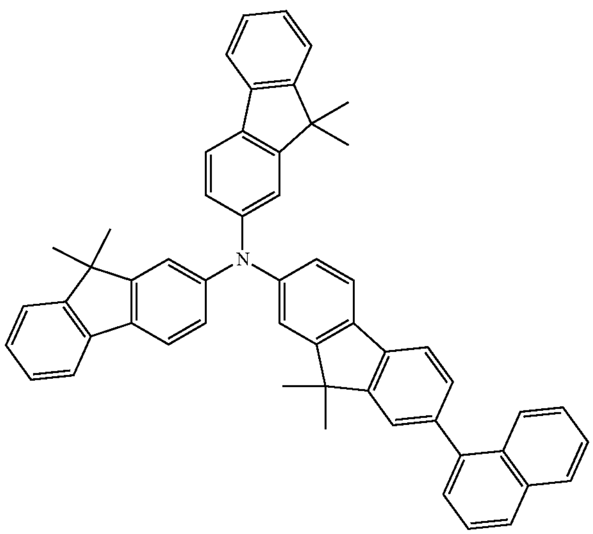
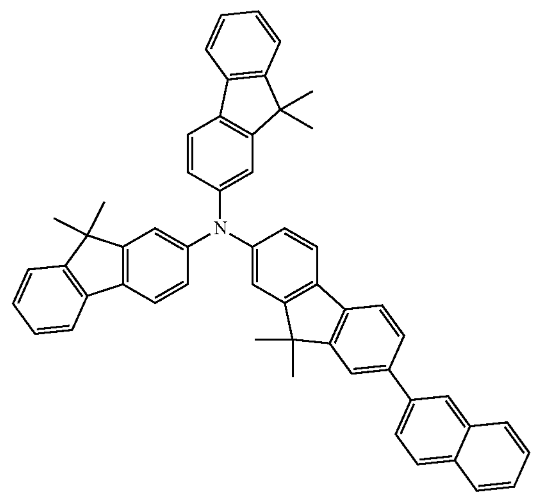
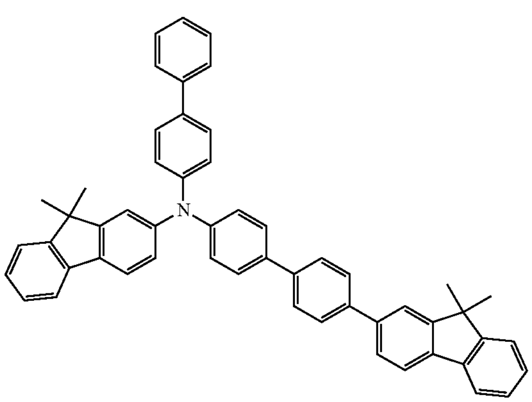
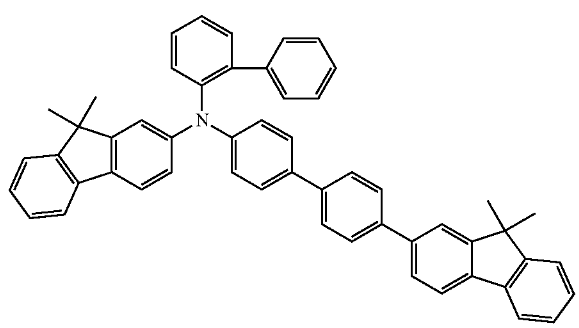

-continued
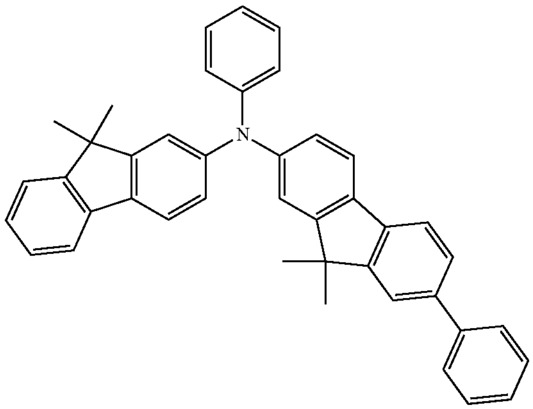
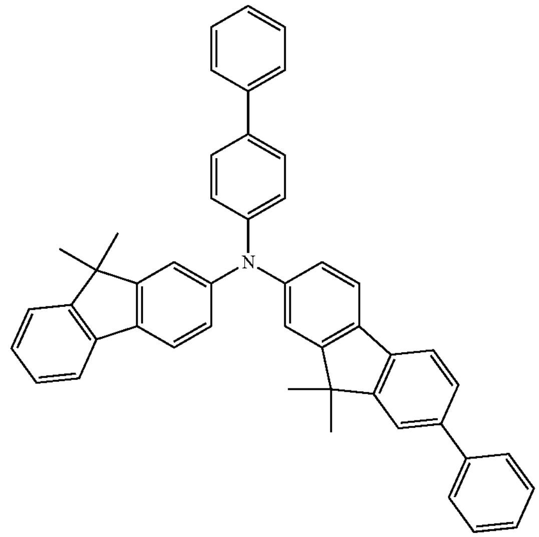
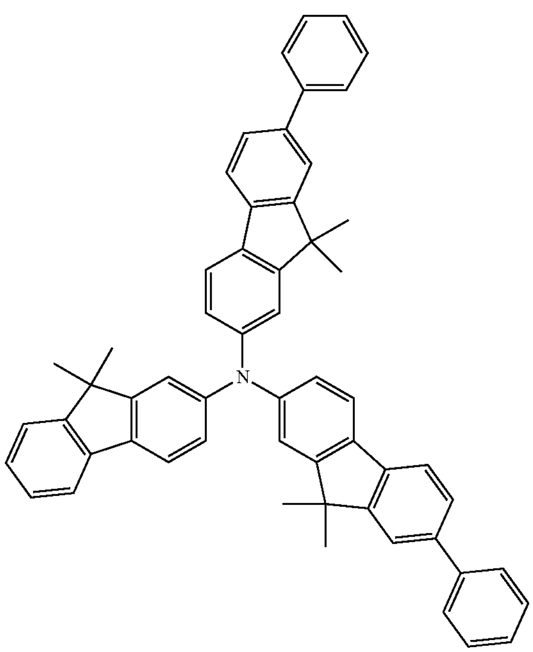
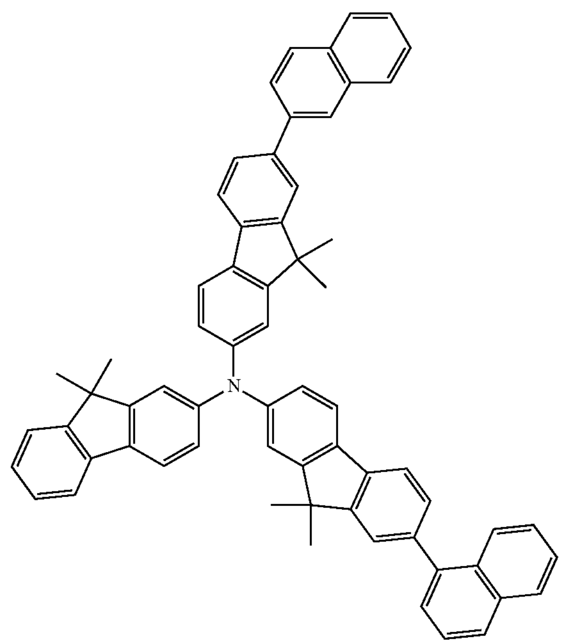

-continued
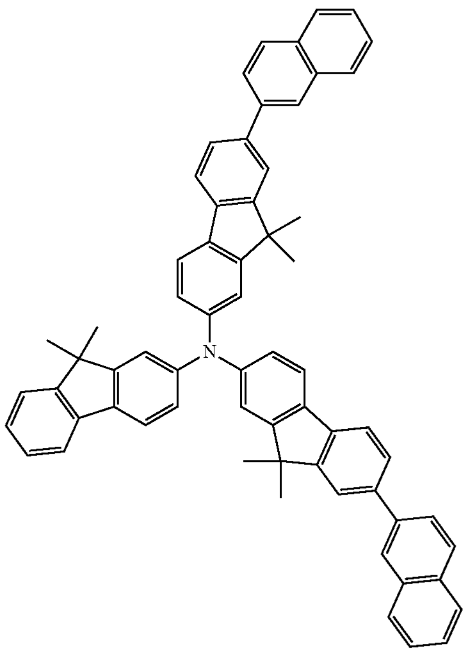
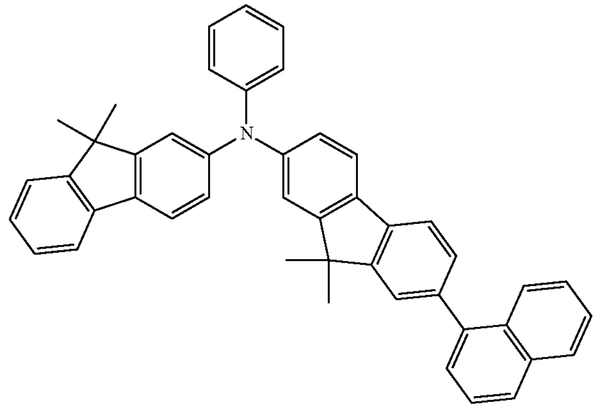
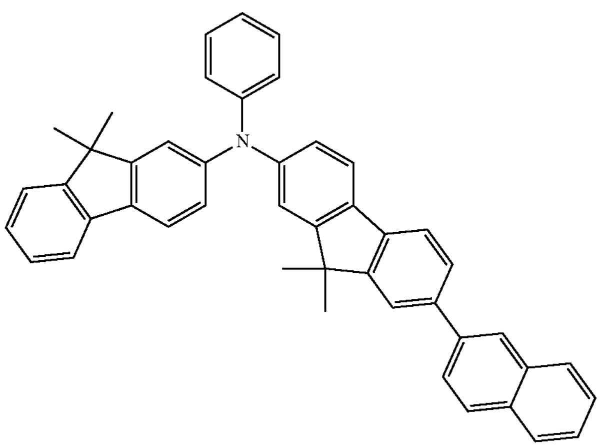
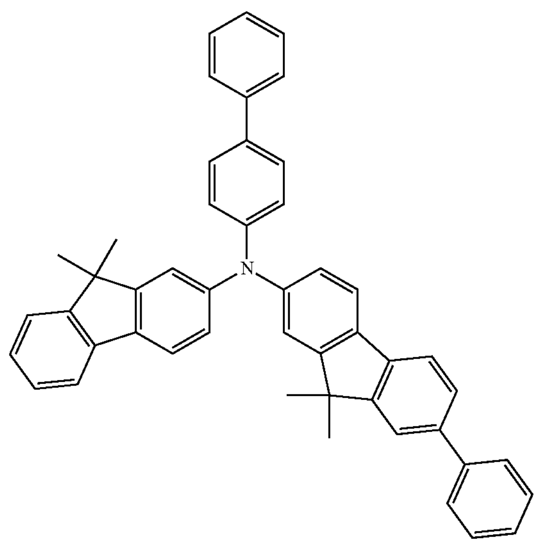
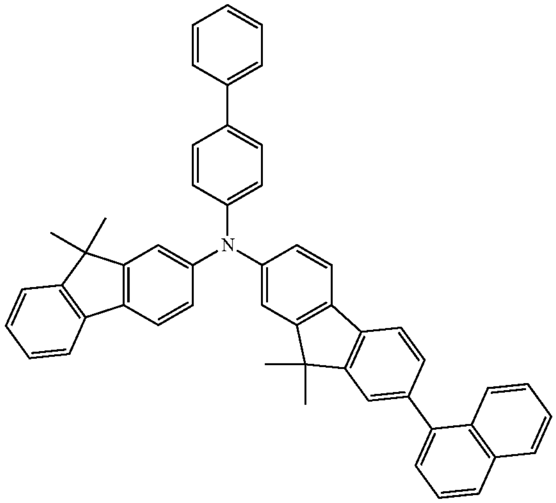
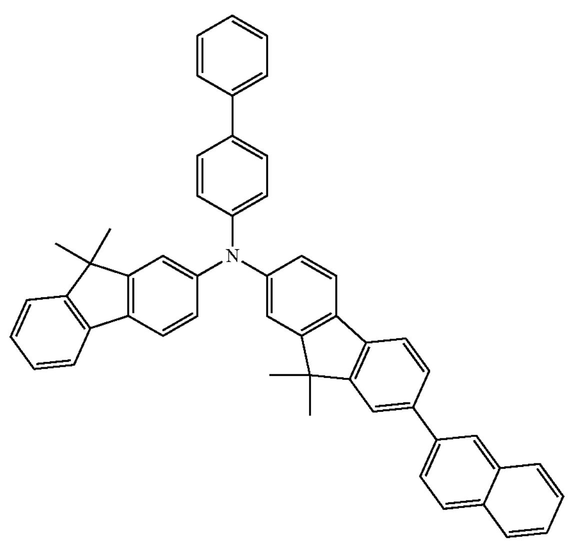

-continued
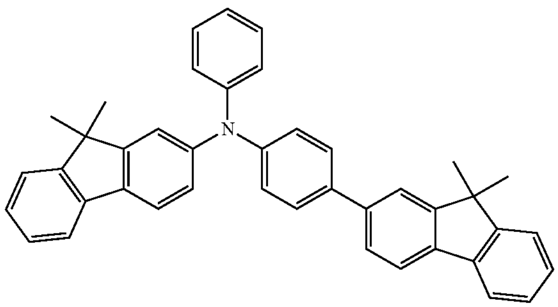
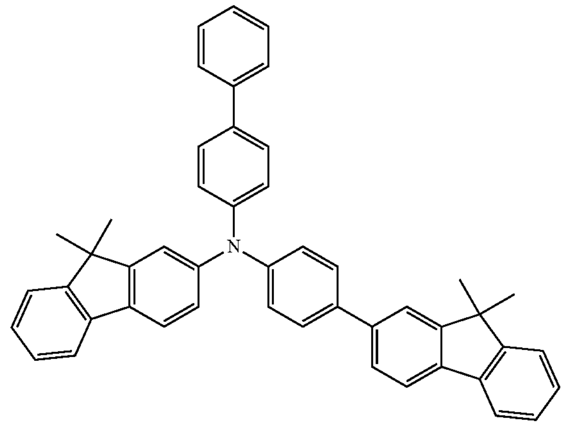
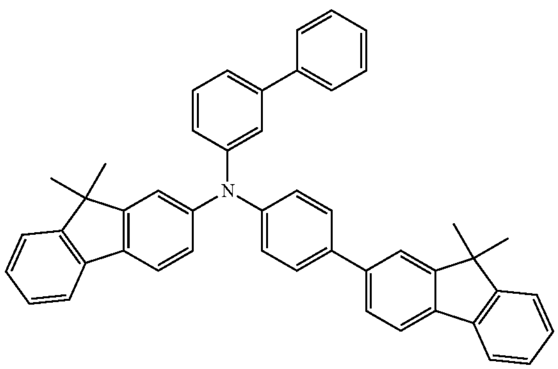
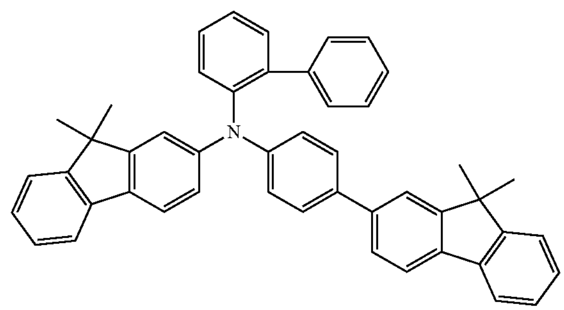
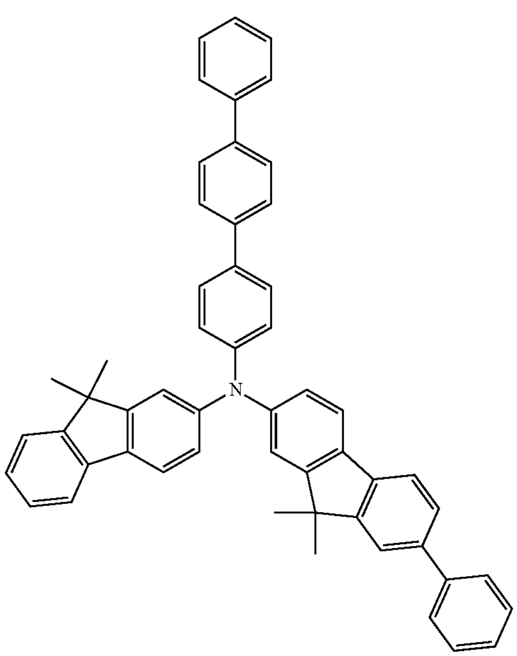
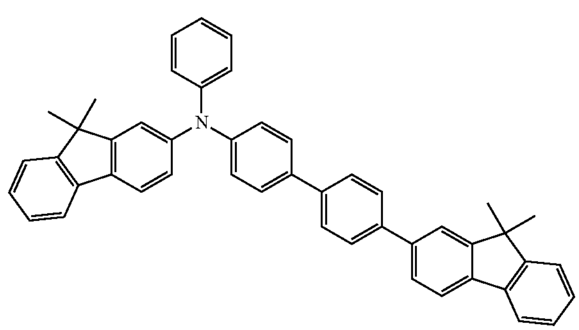

-continued
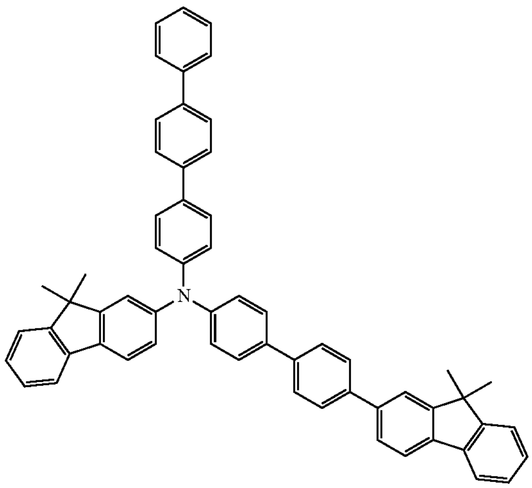
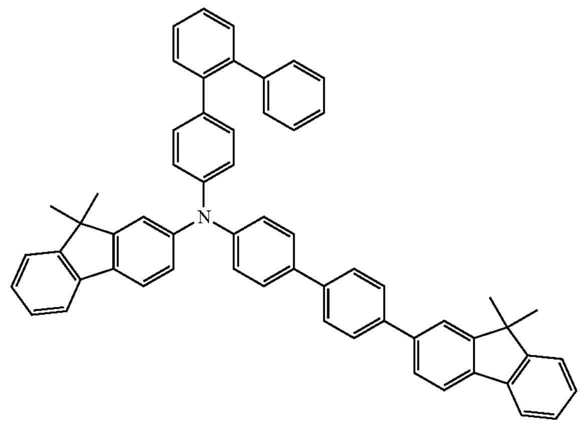
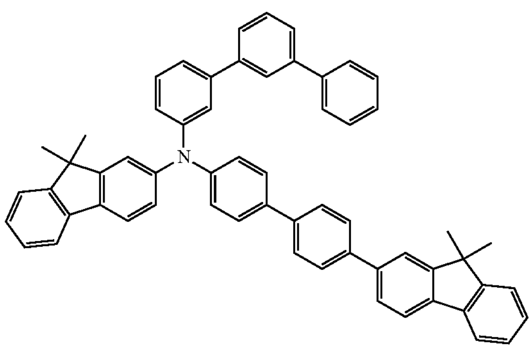
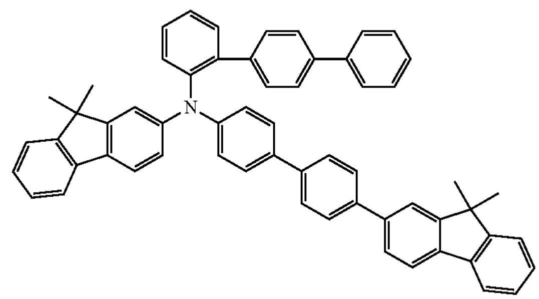
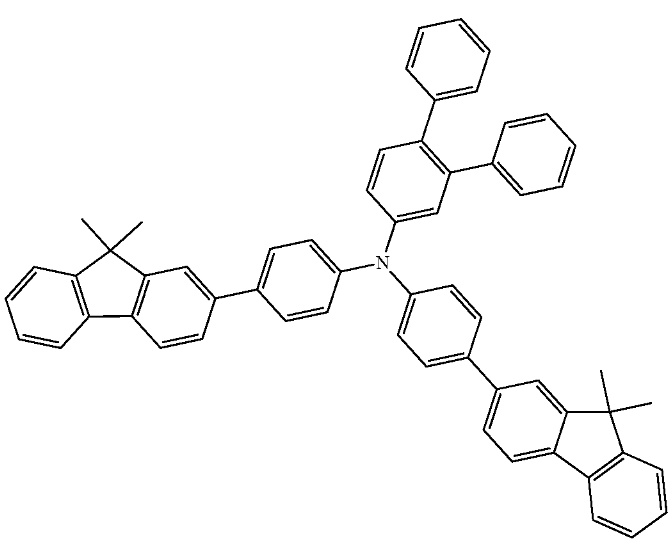

-continued
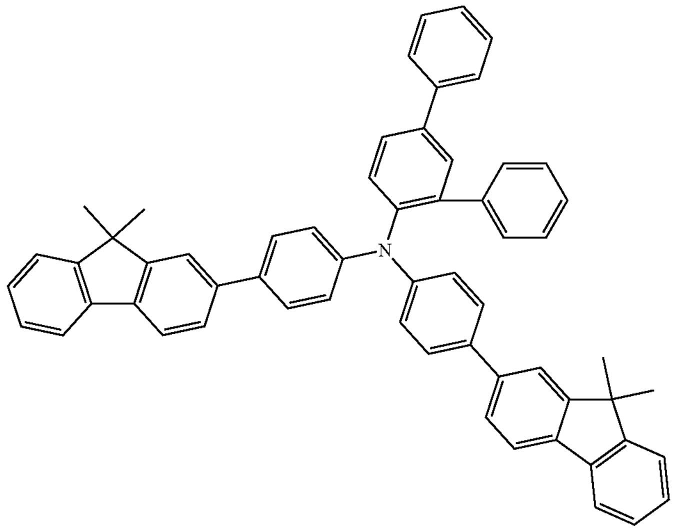
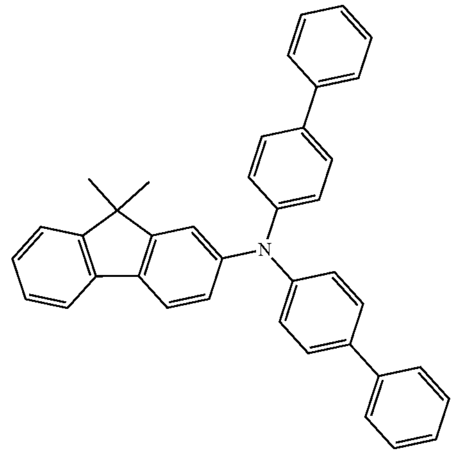
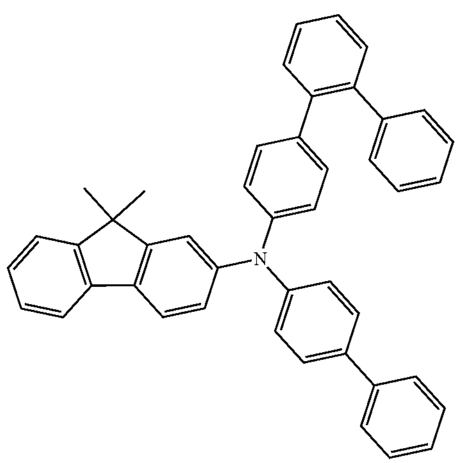
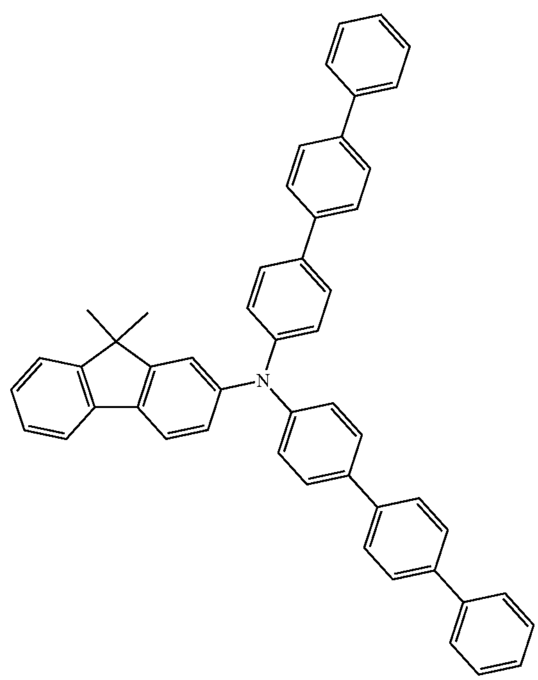

-continued
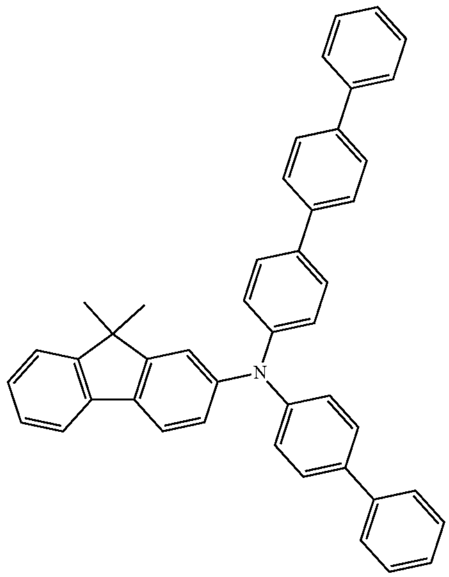
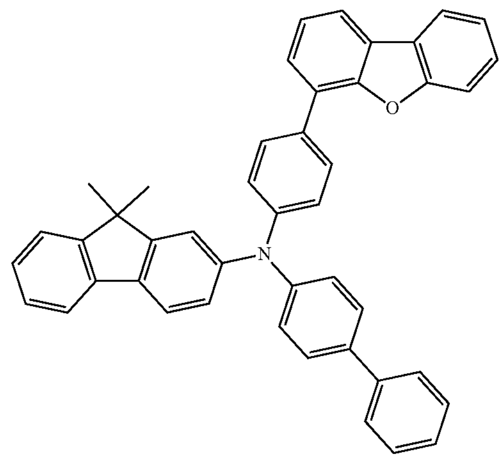
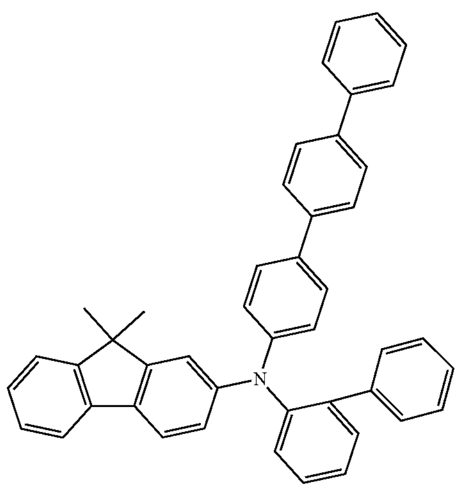
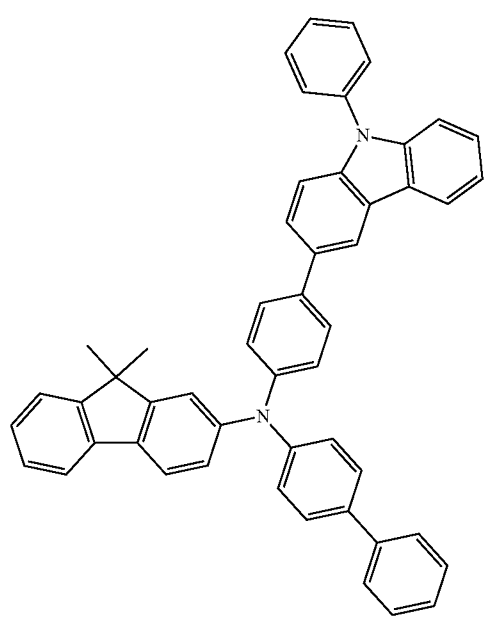

-continued
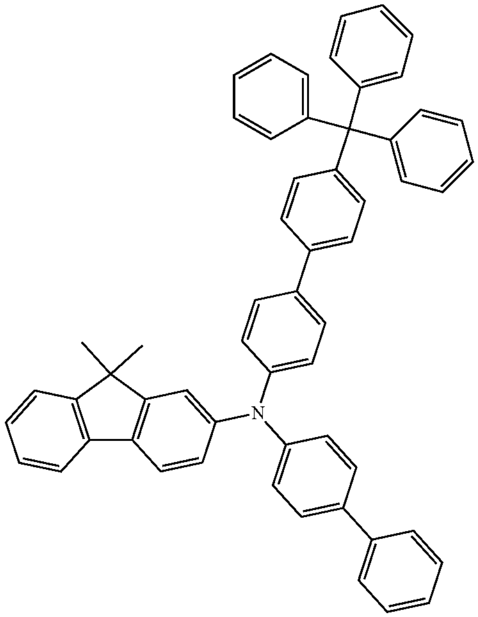
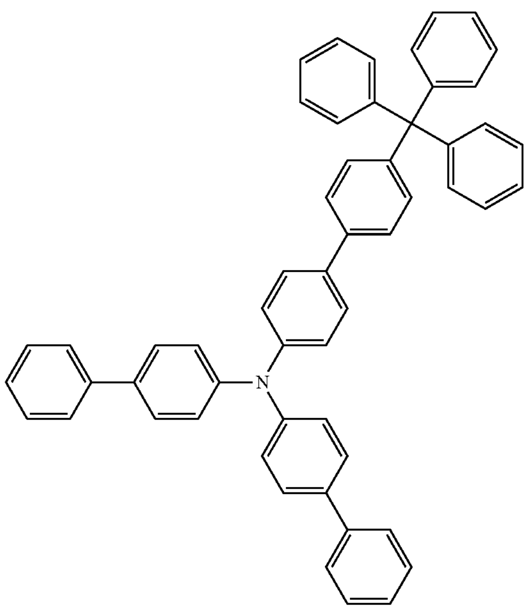
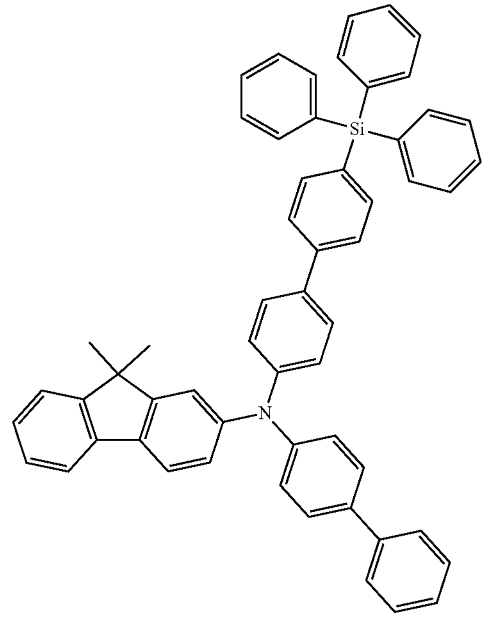
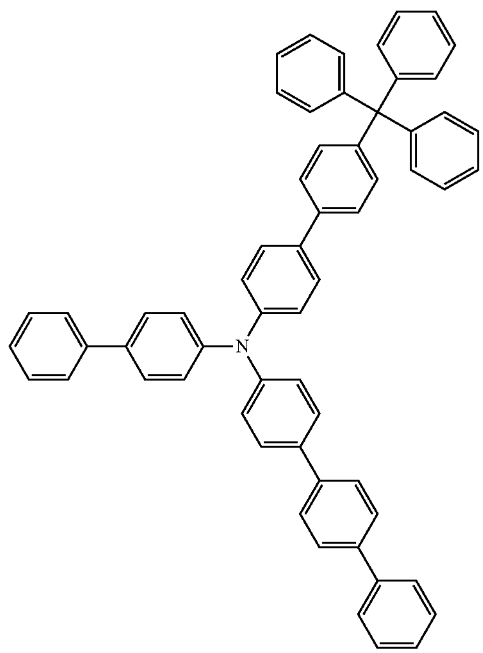
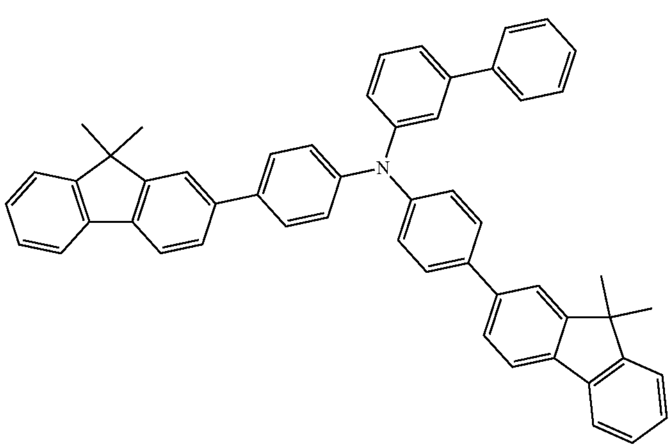

-continued
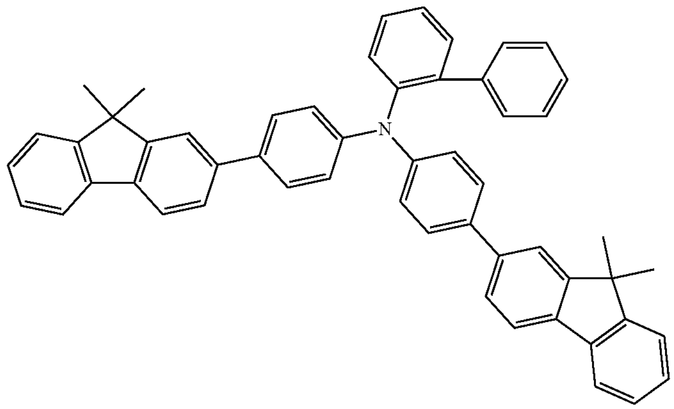
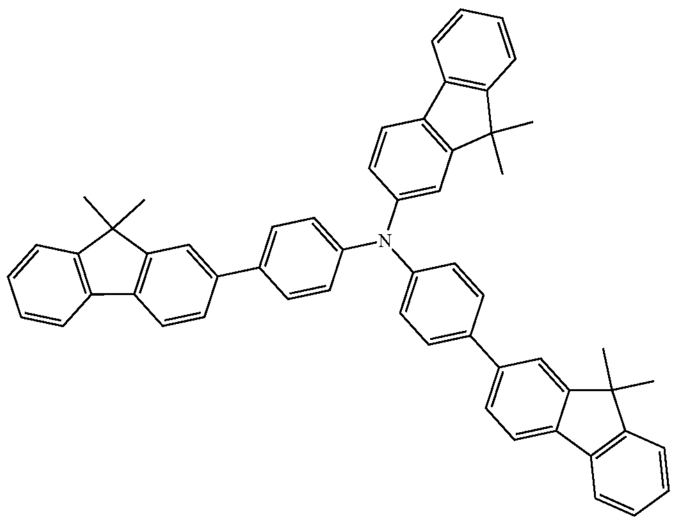
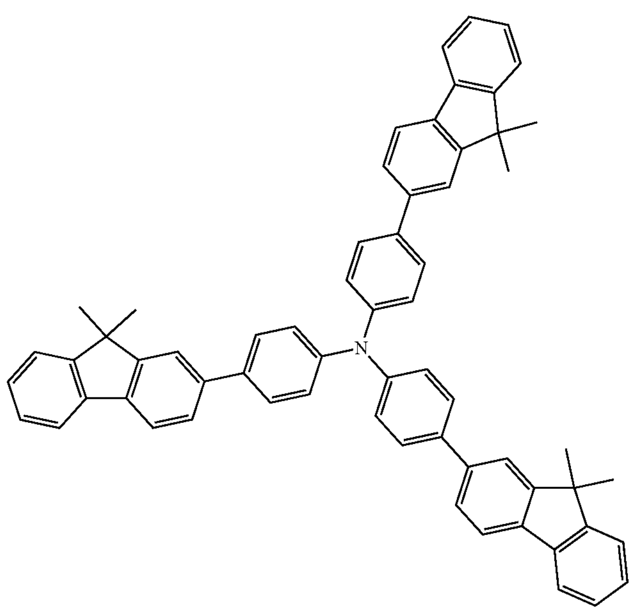
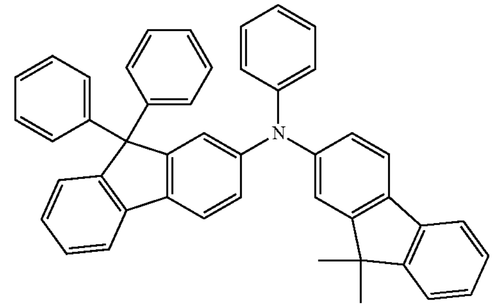

-continued
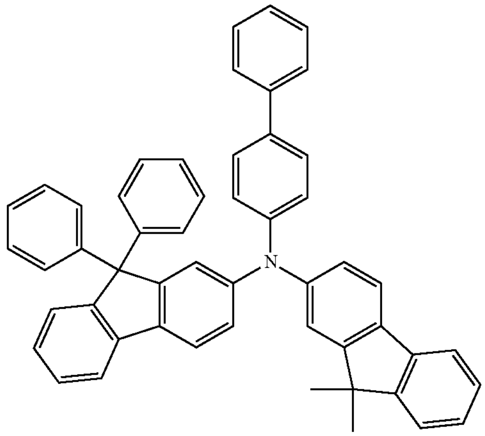
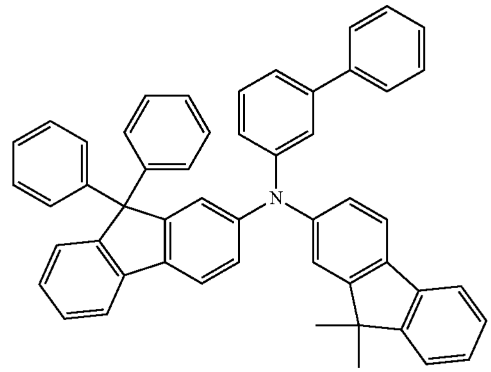
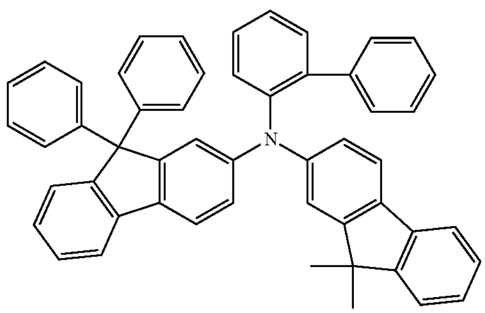
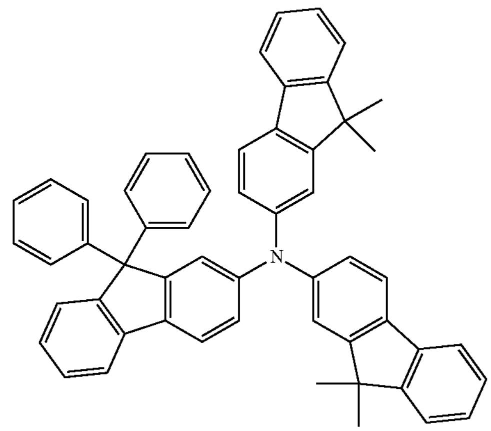
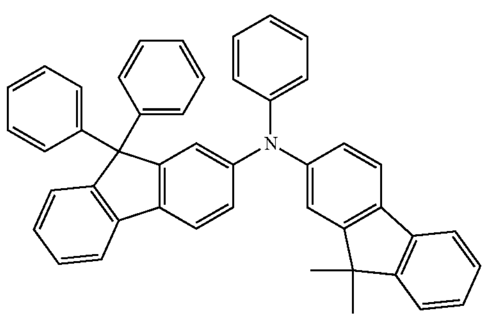
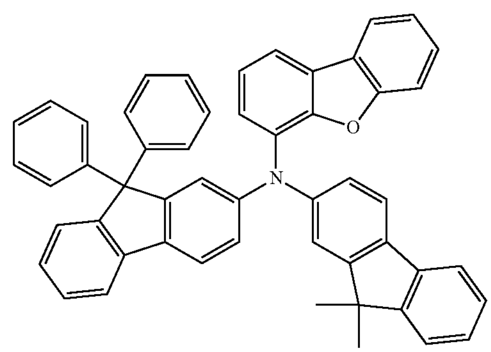
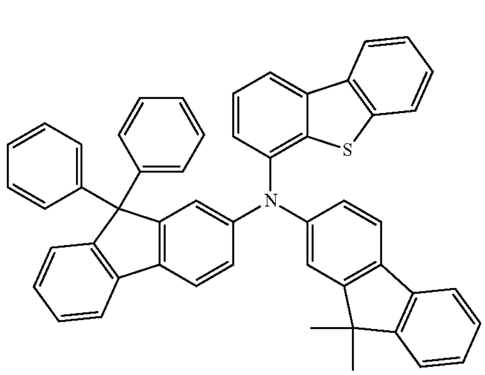
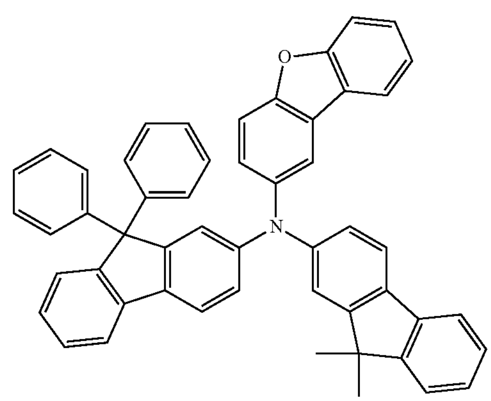

-continued
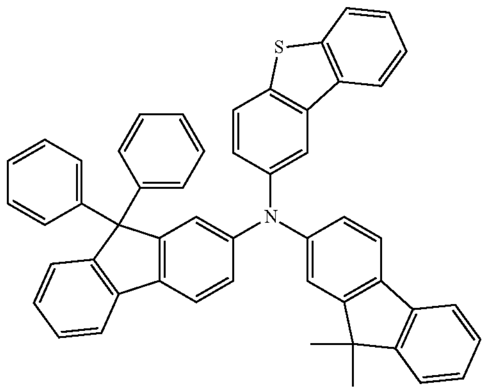
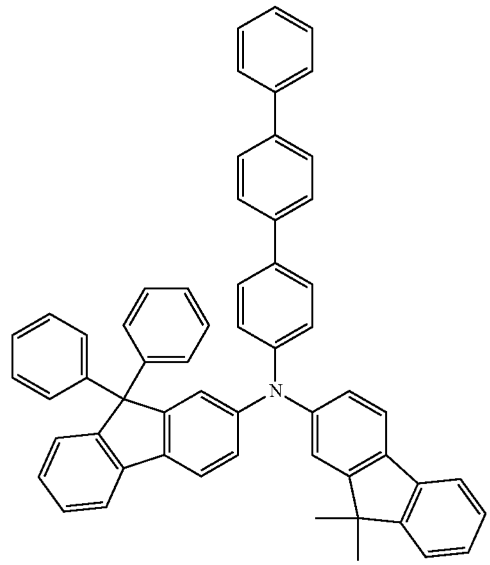
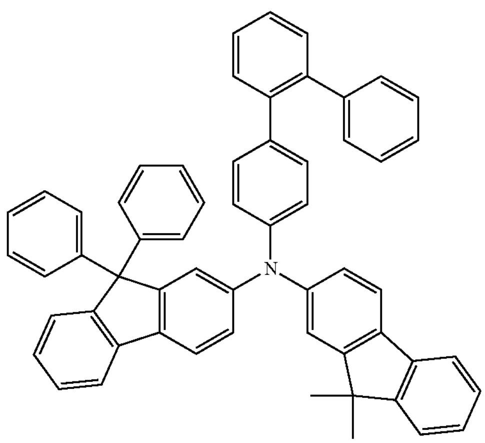
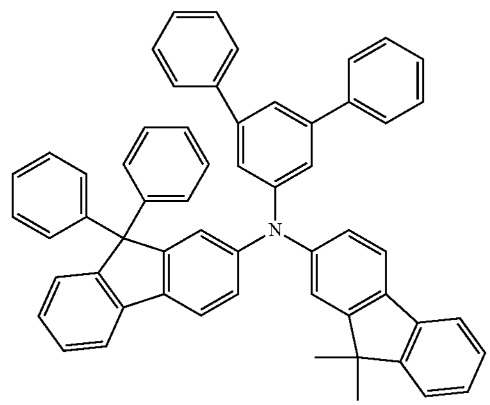
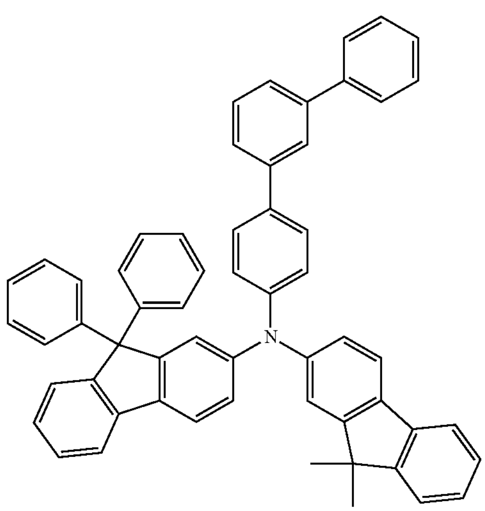
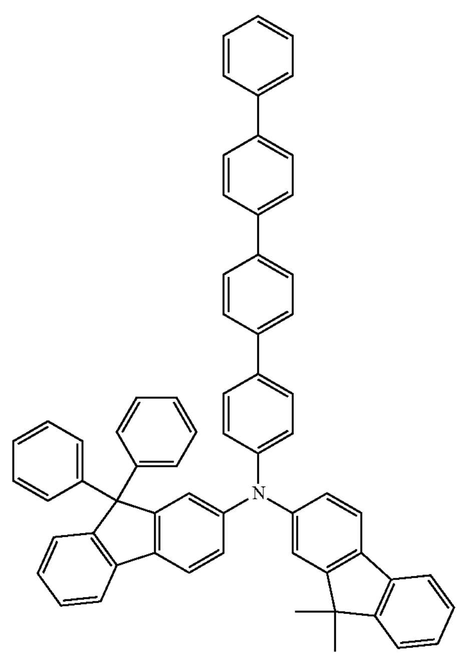

-continued
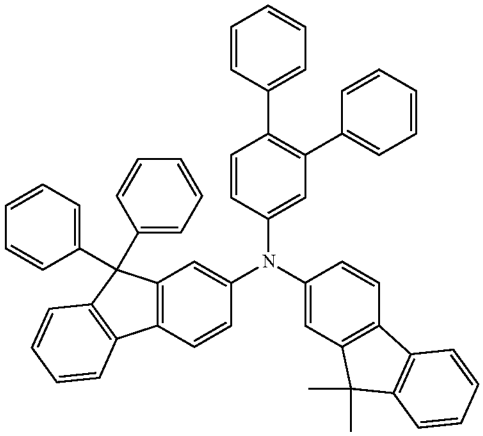
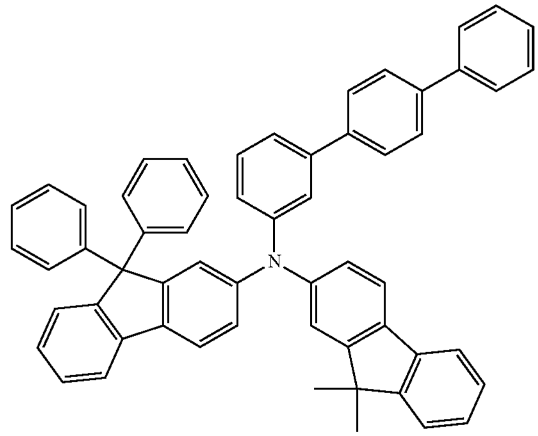
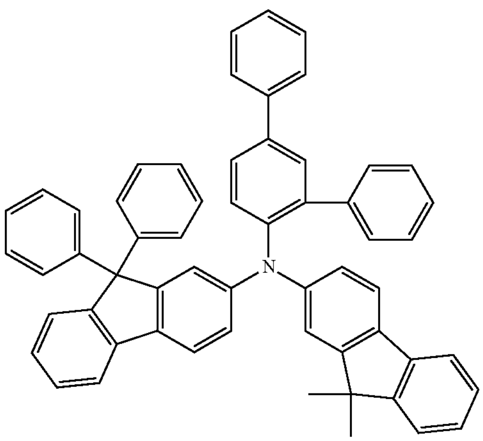
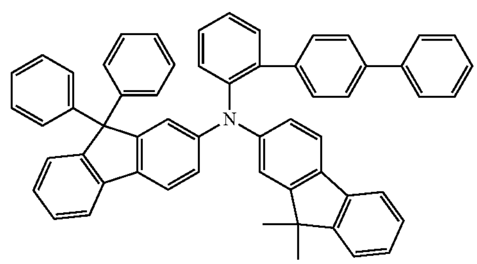
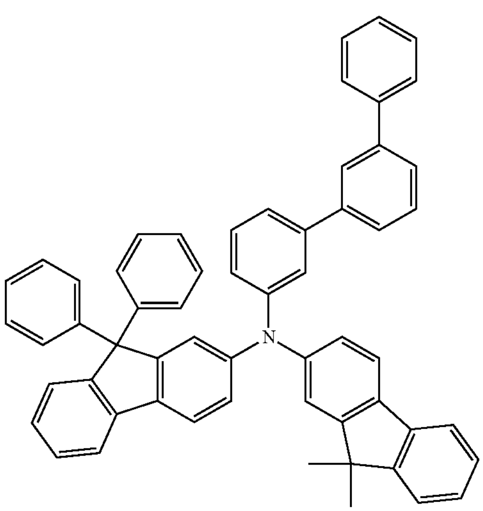
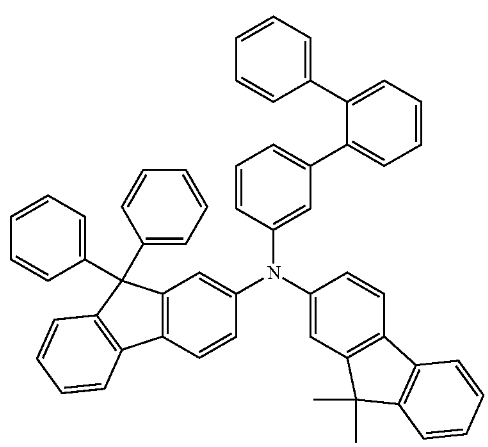

-continued
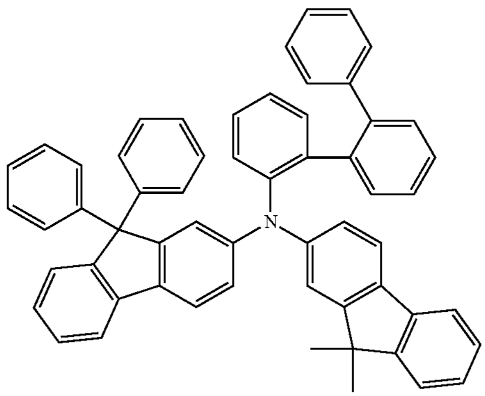
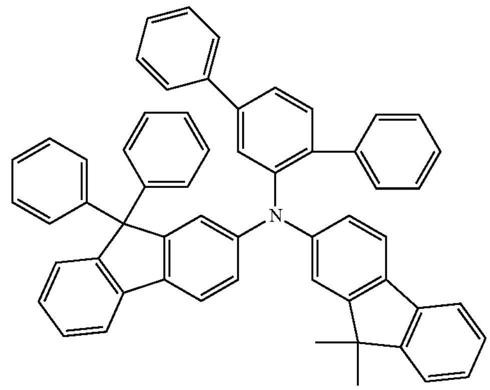
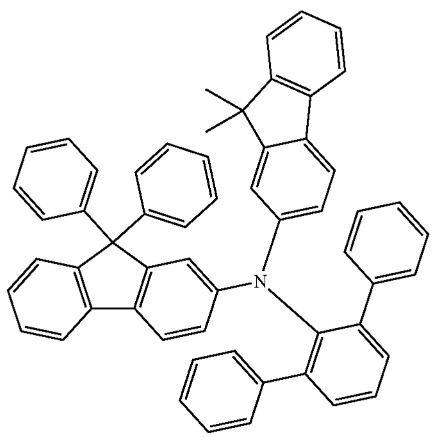
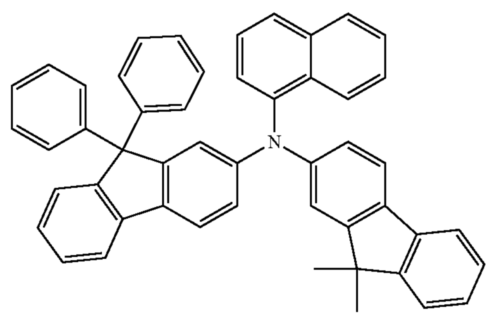
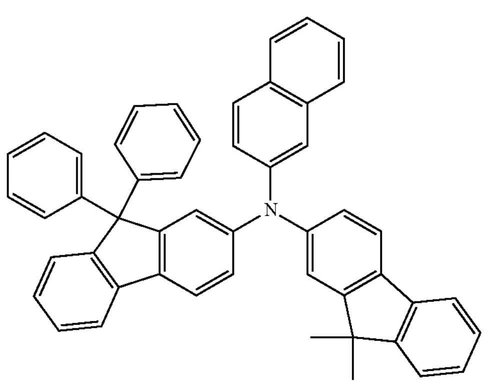
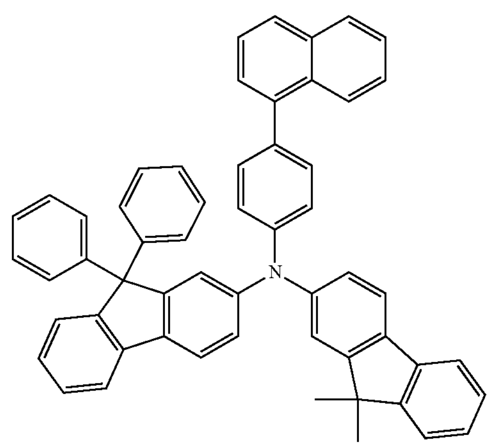

-continued
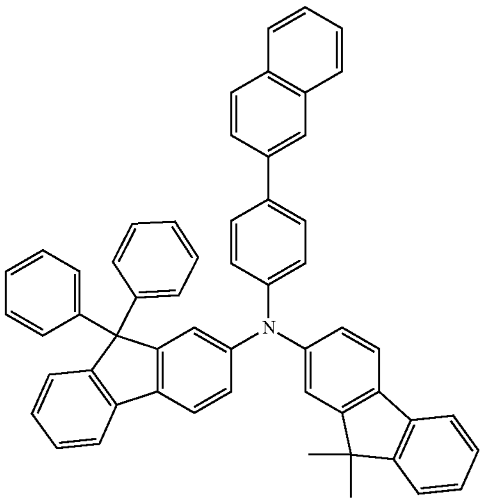
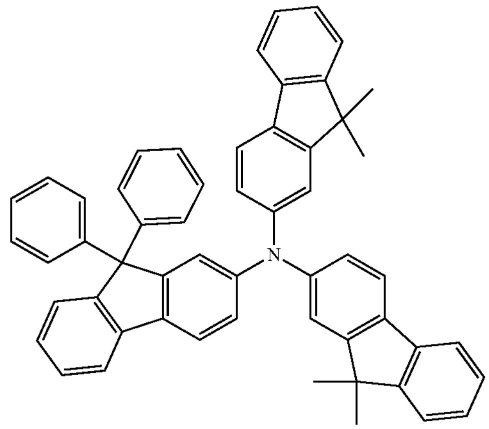
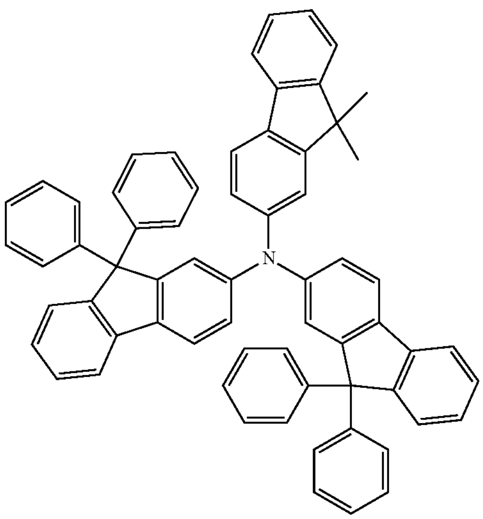
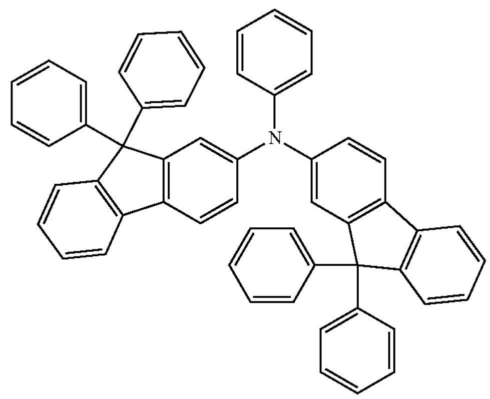
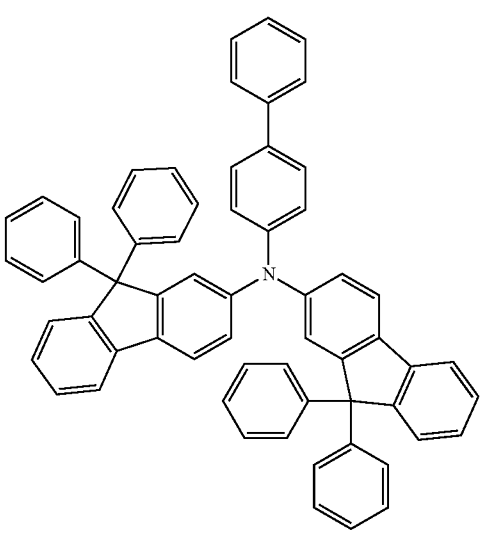
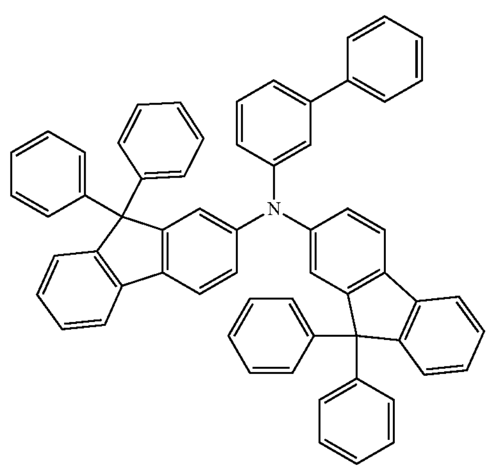

-continued
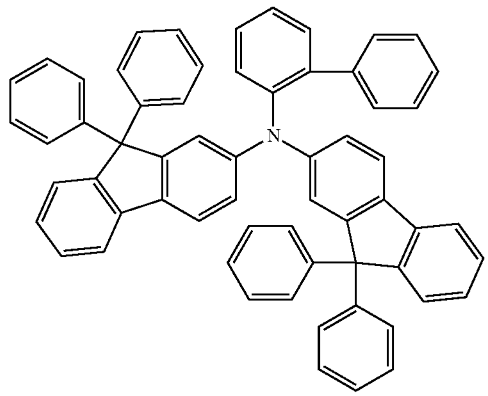
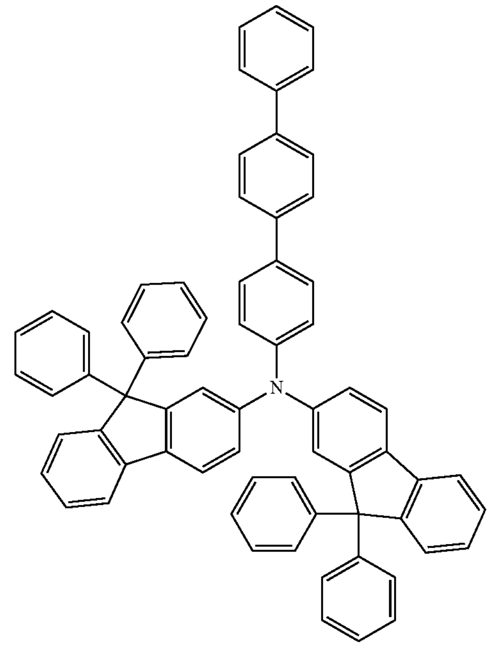
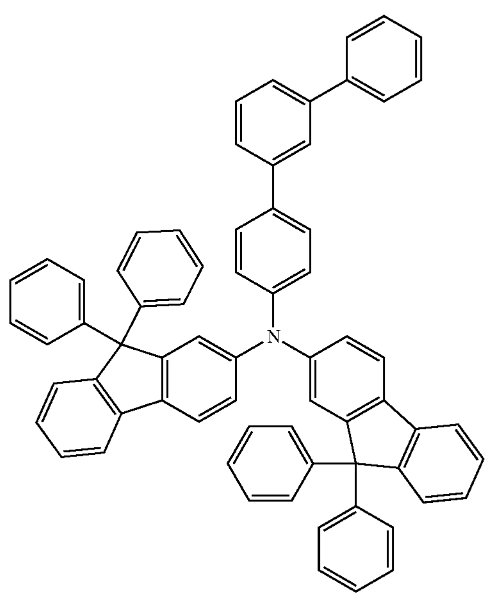
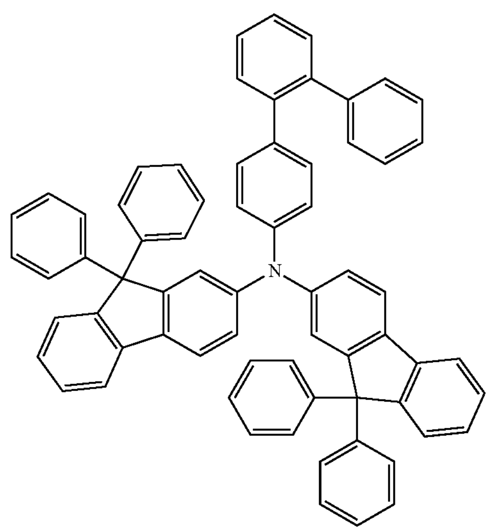

-continued
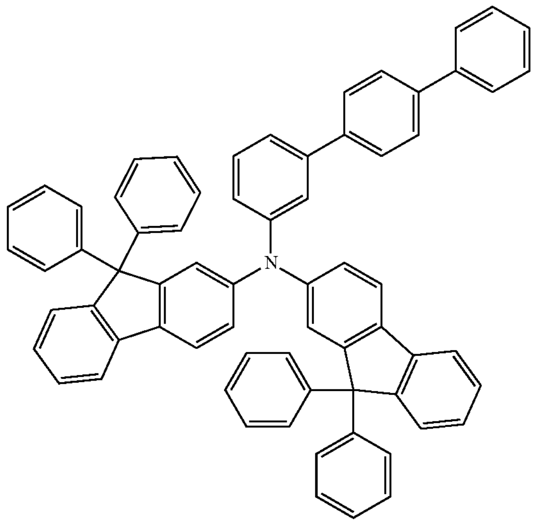
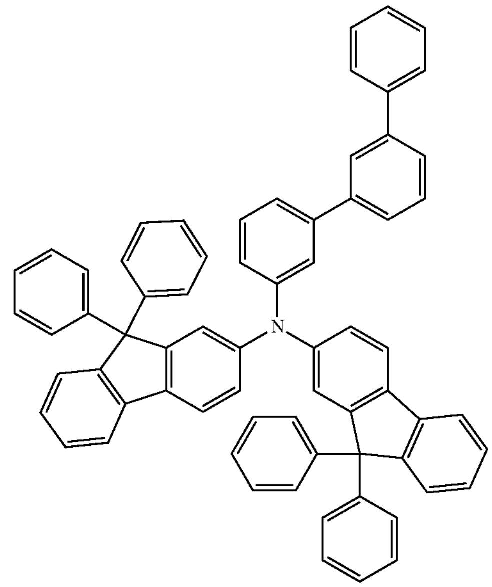
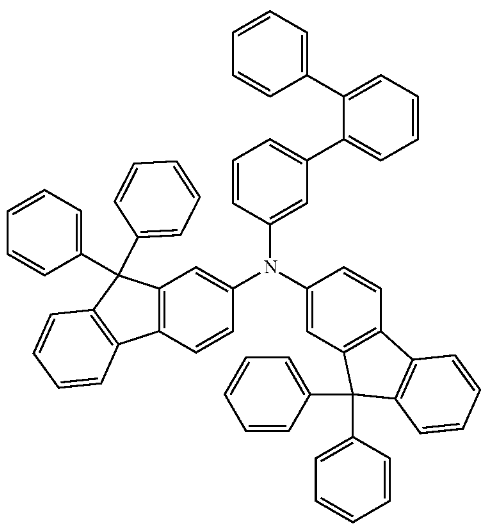
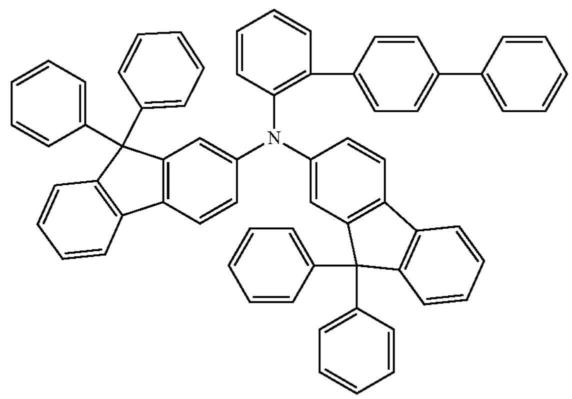
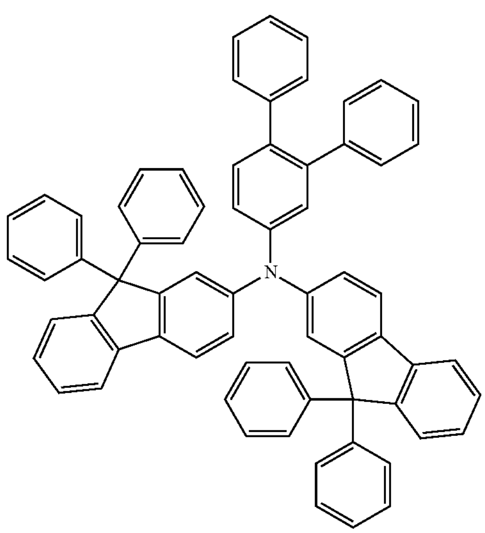
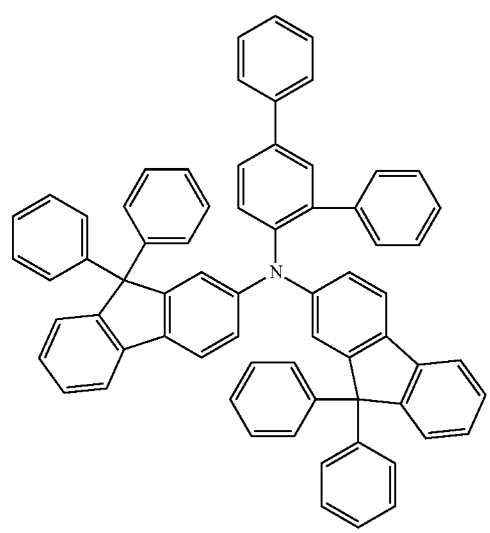

-continued
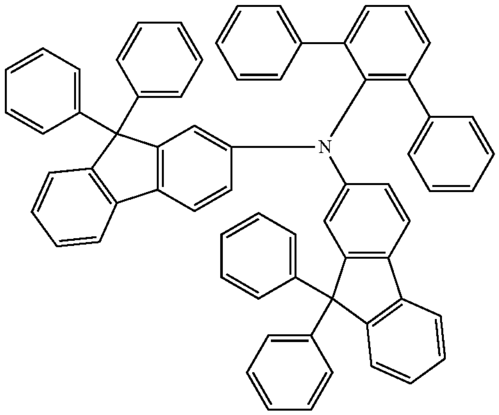
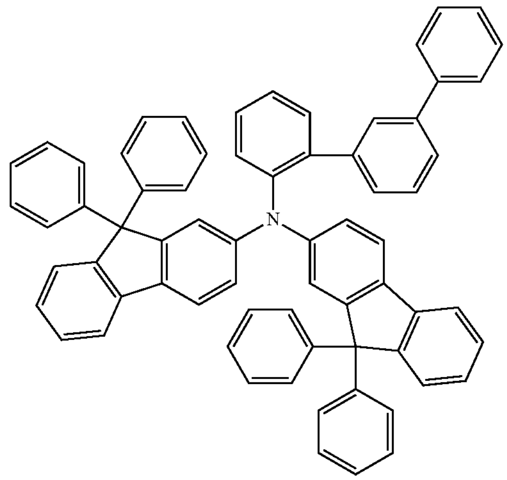
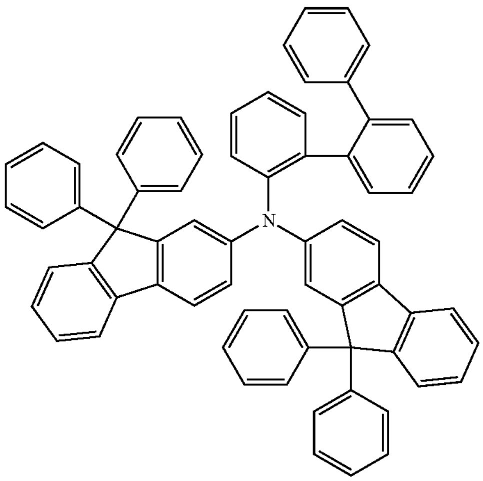
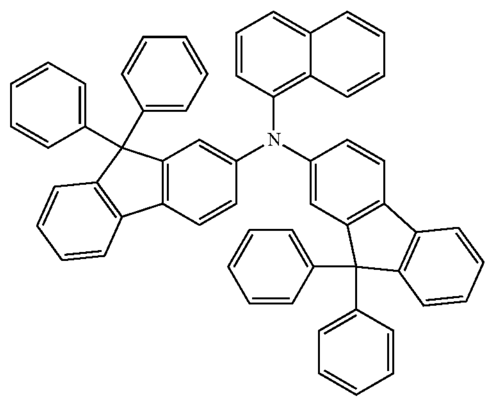
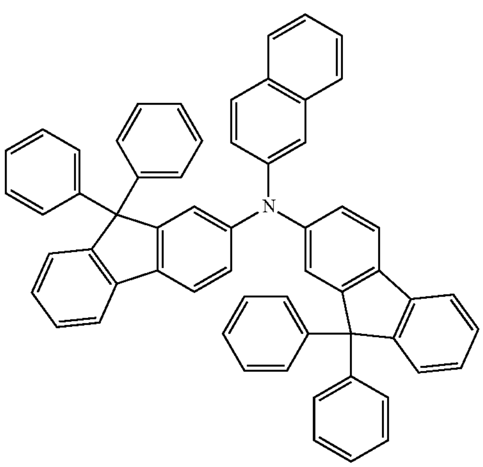
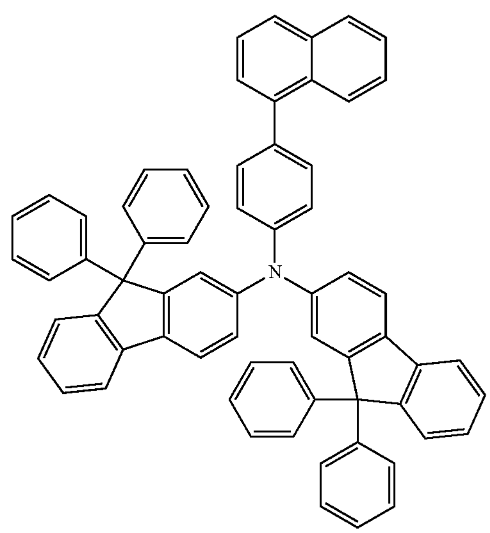

-continued
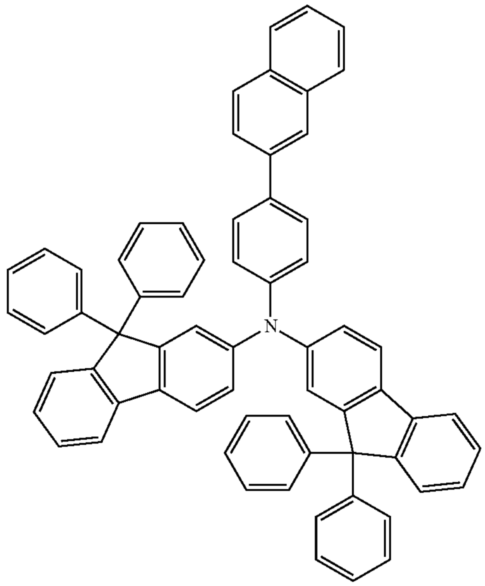
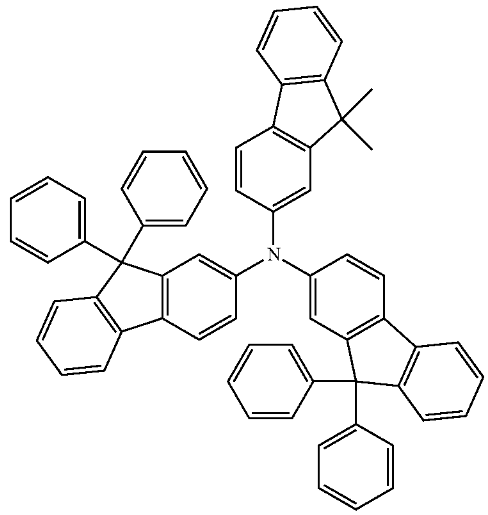
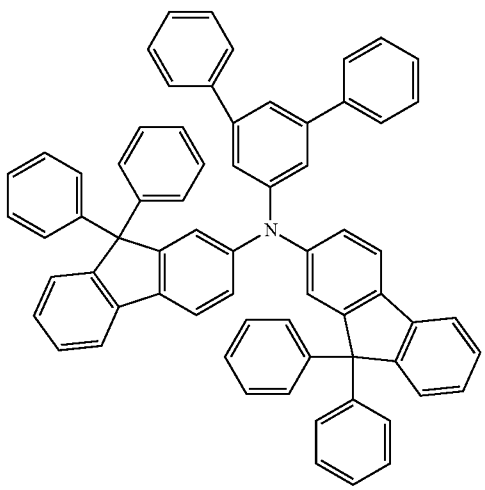
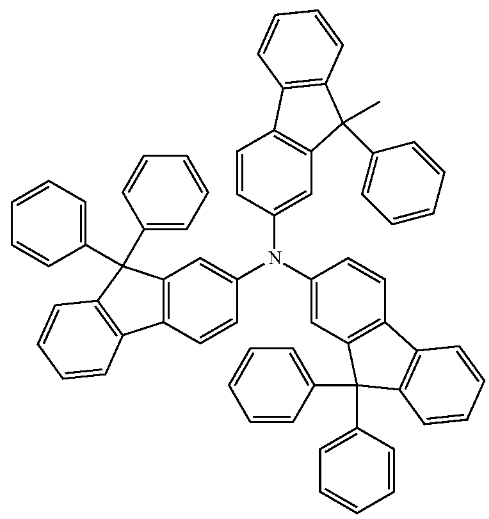
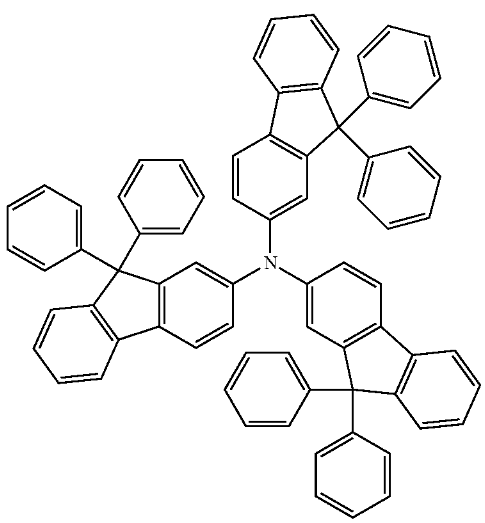
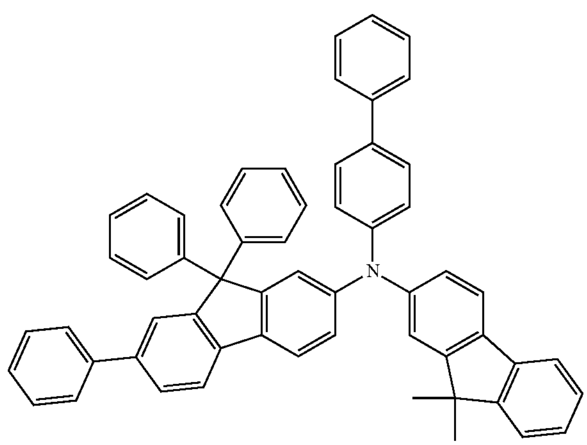

-continued
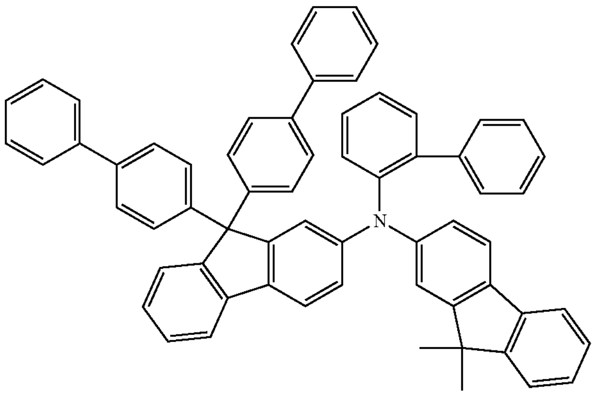
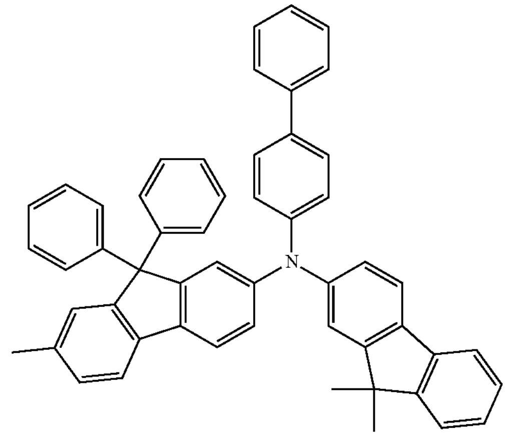
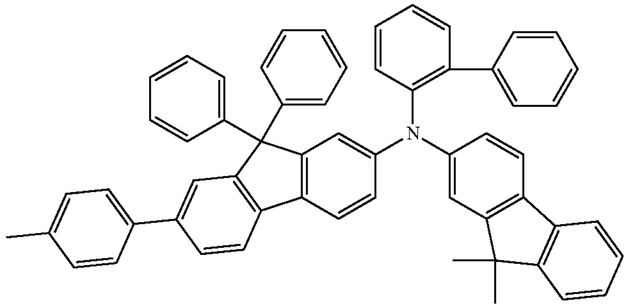
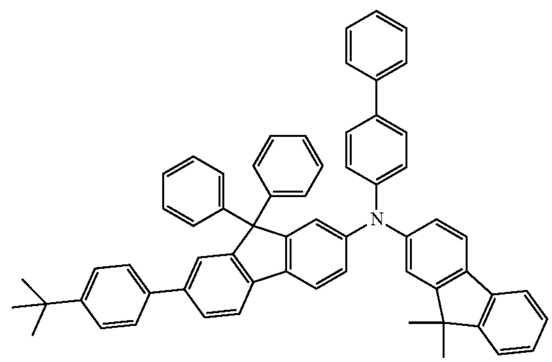
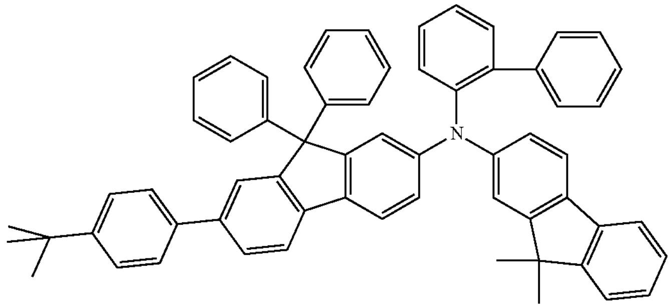
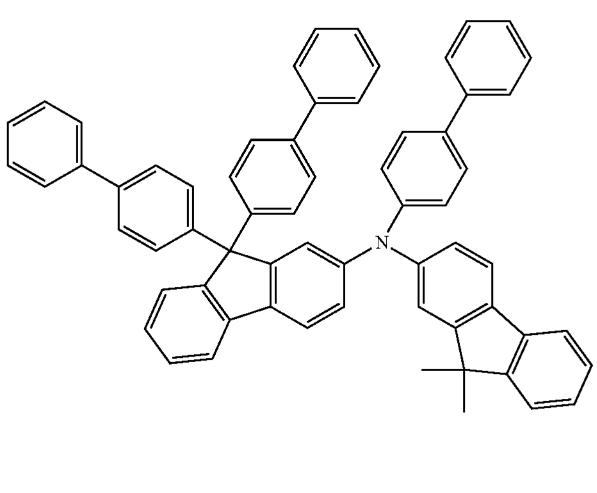
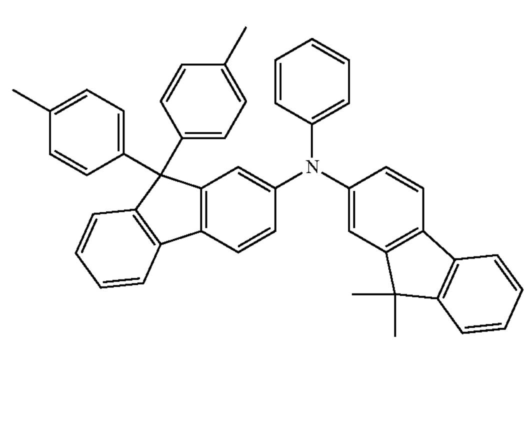

-continued
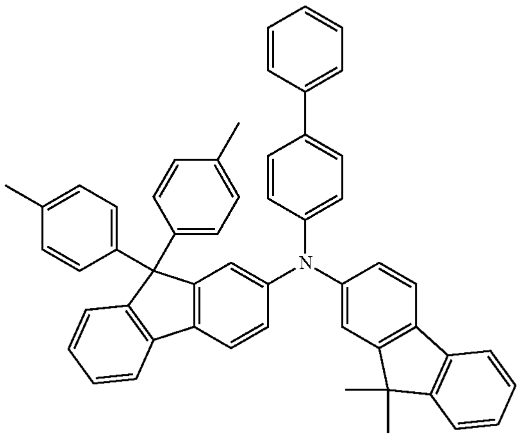
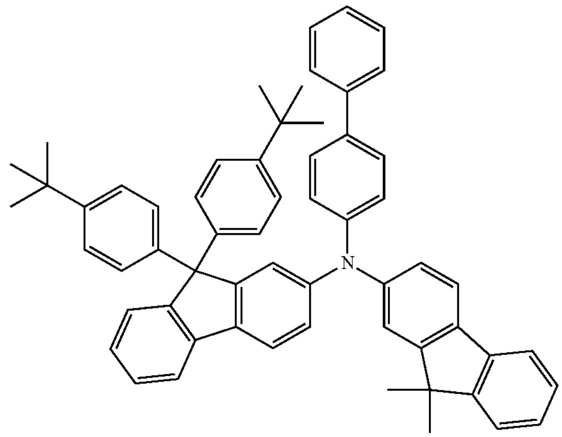
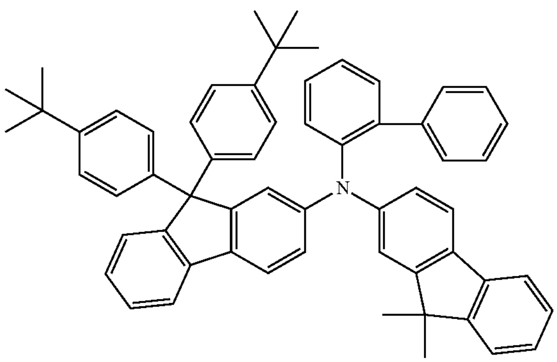
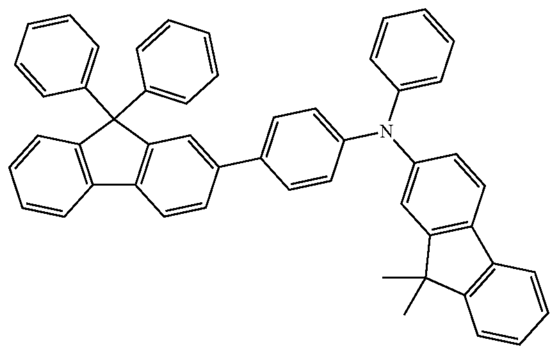
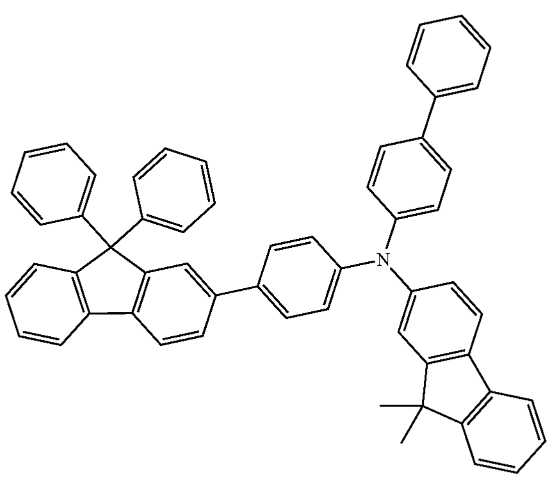
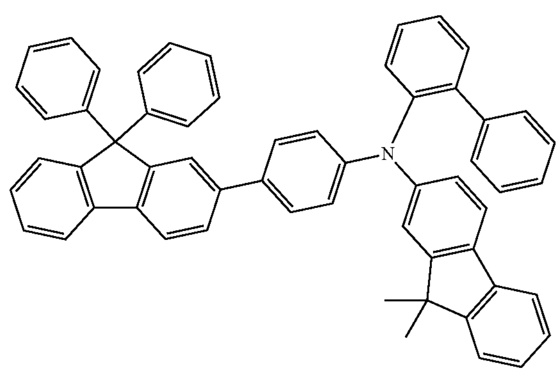

-continued
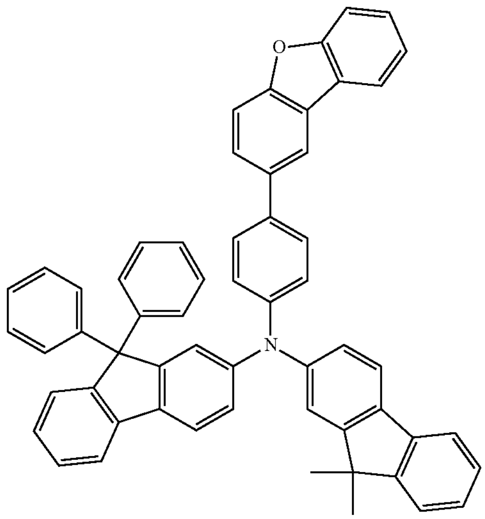
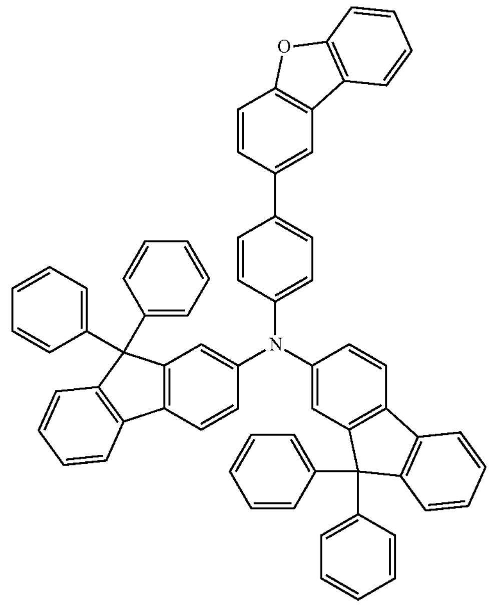
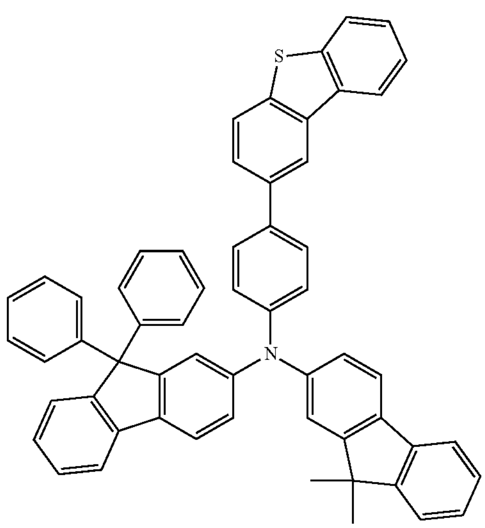
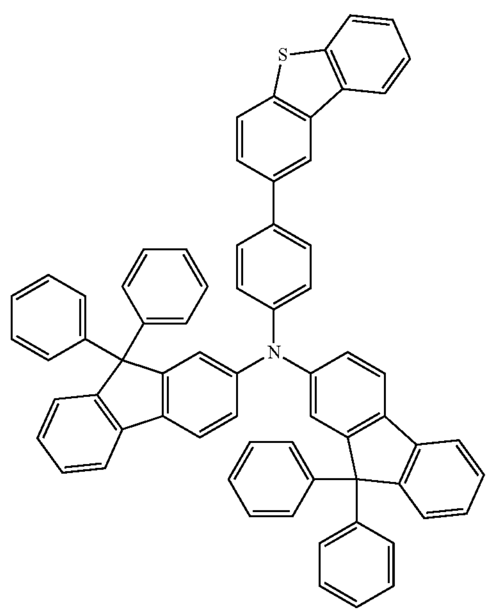

-continued
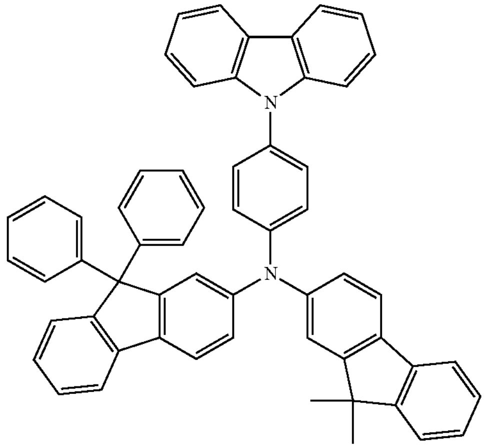
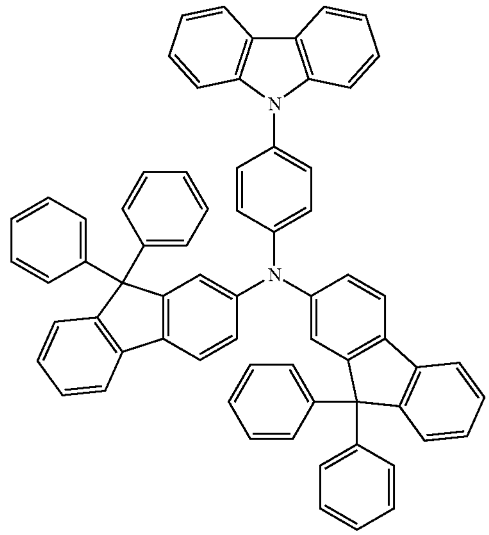
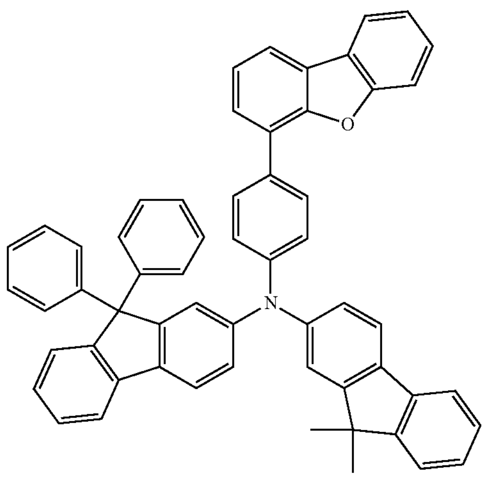
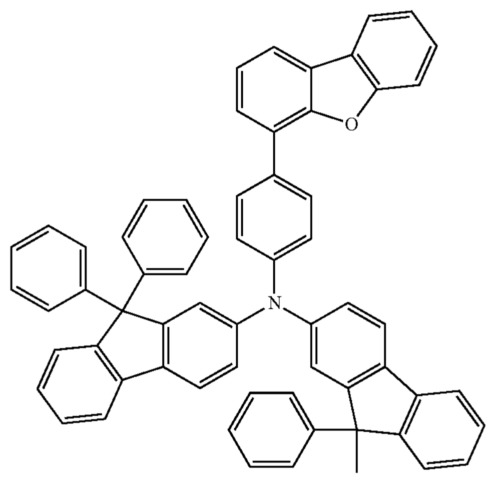
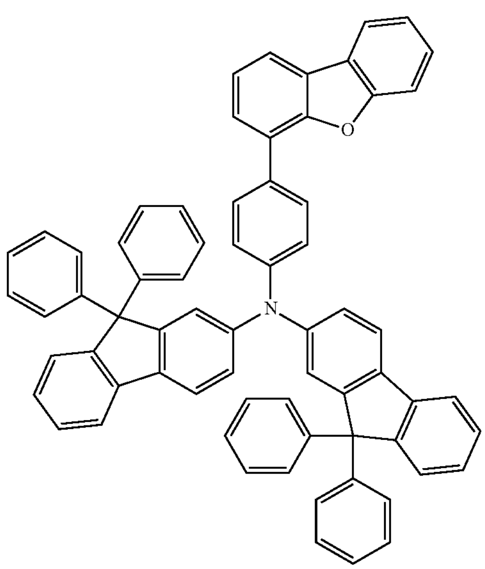
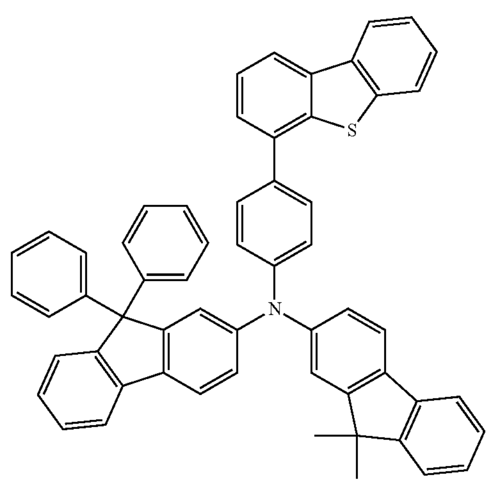

-continued
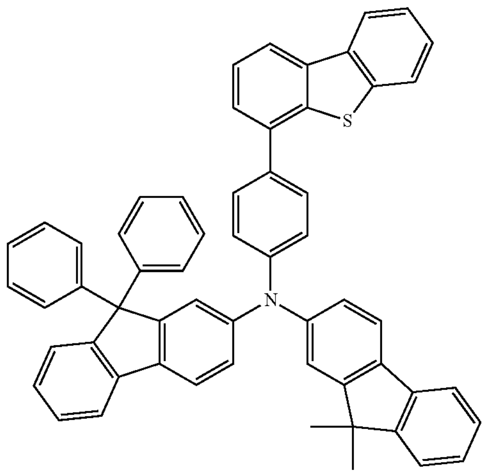
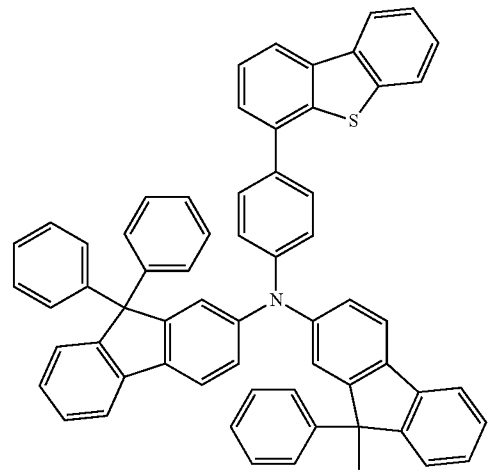
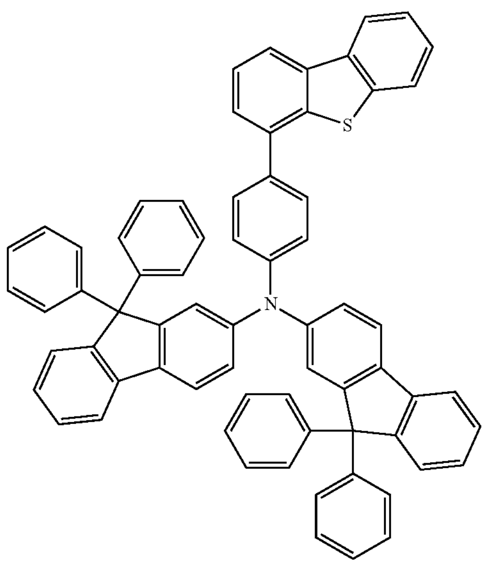
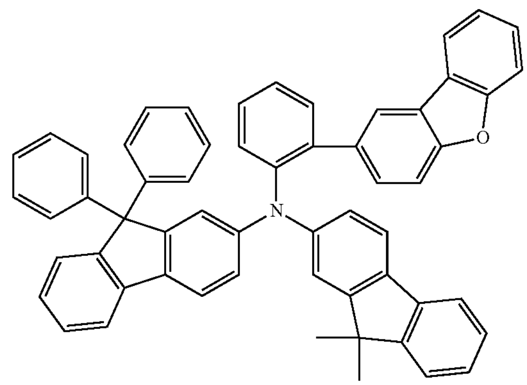
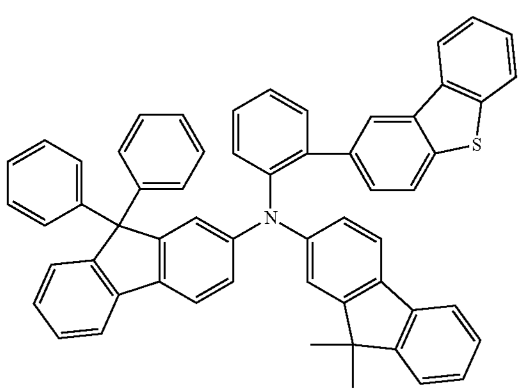
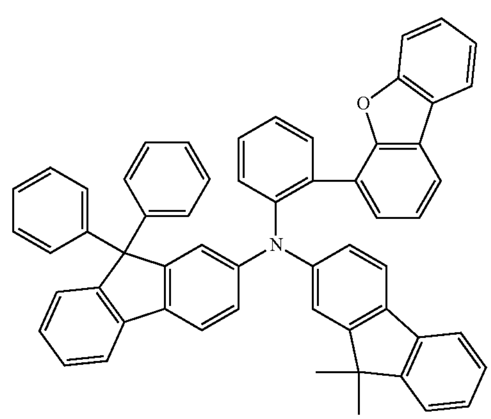

-continued
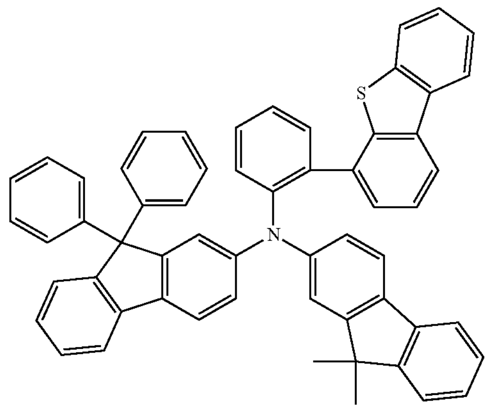
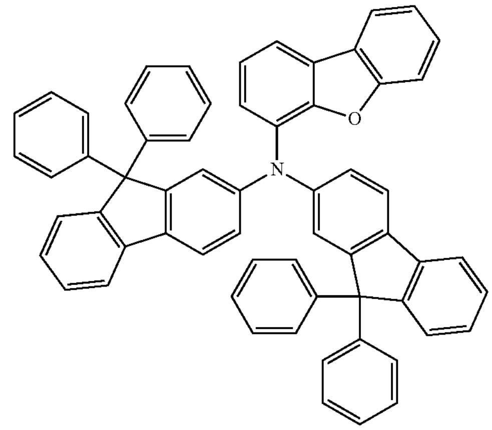
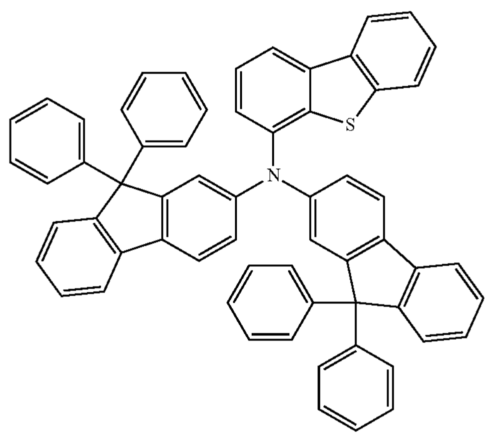
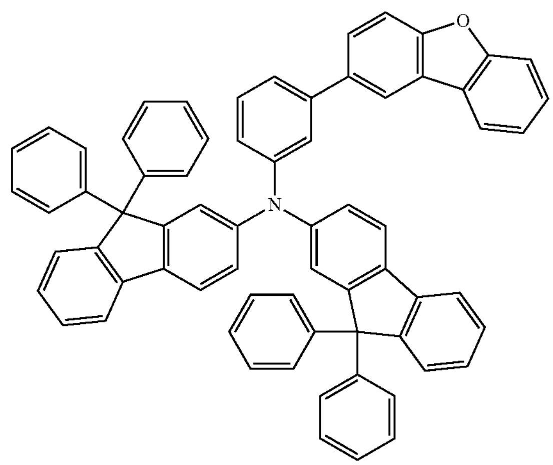
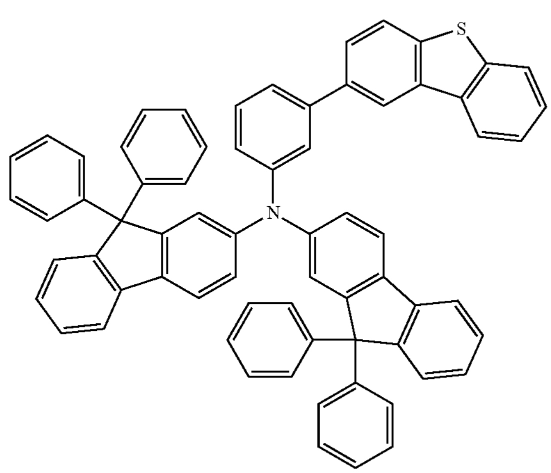
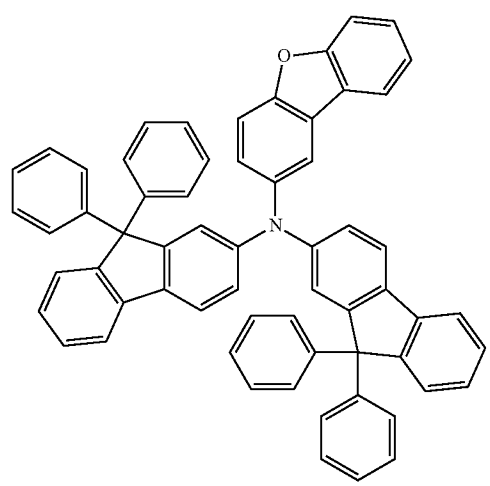

-continued
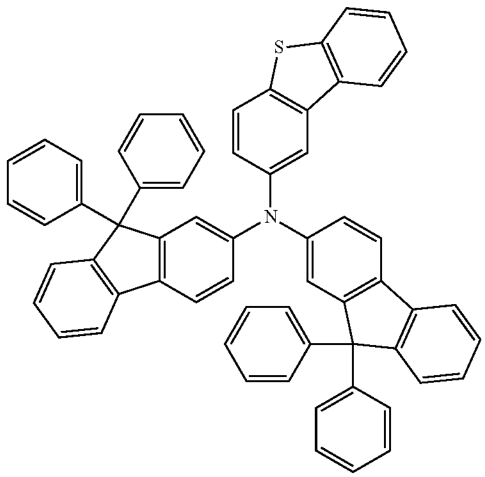
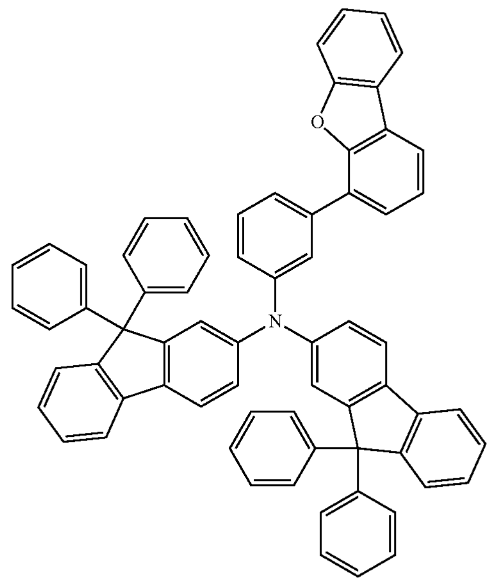
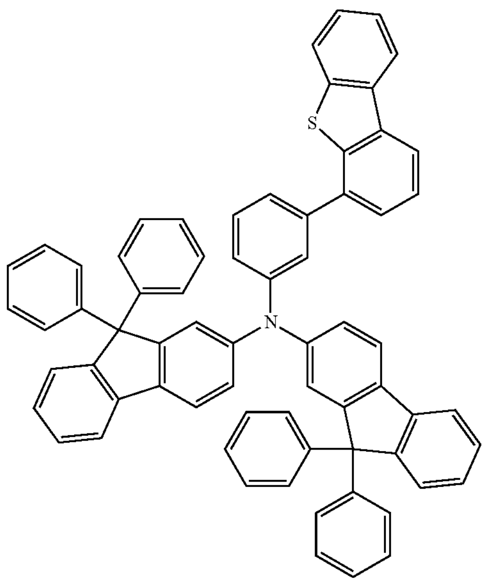
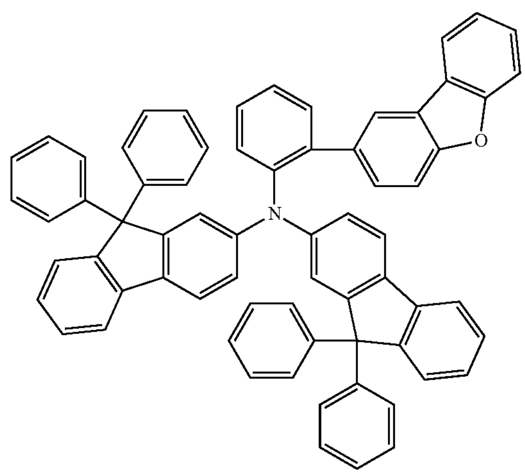
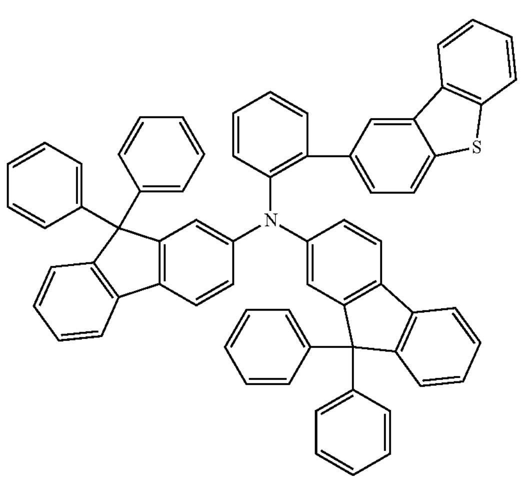
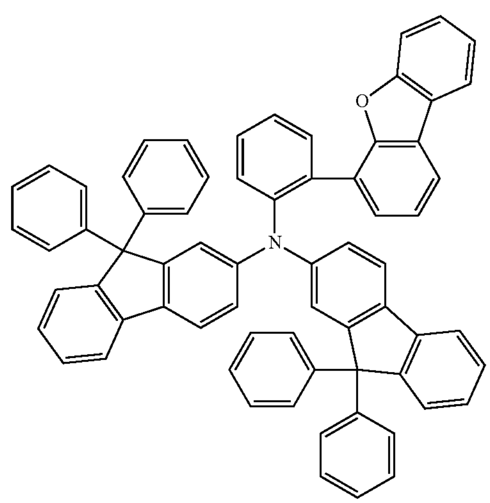

-continued
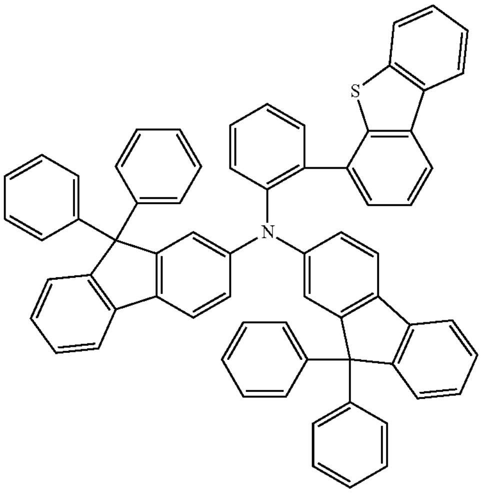
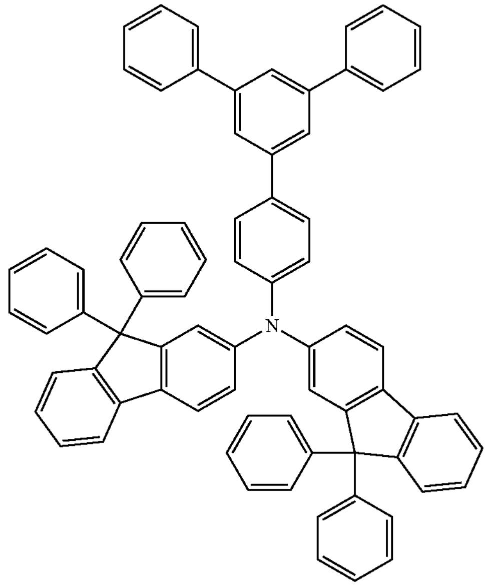
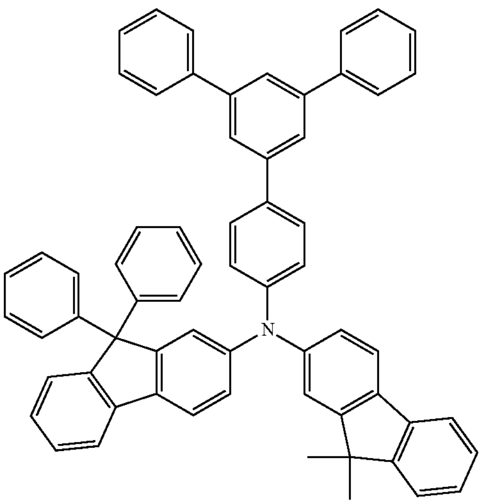
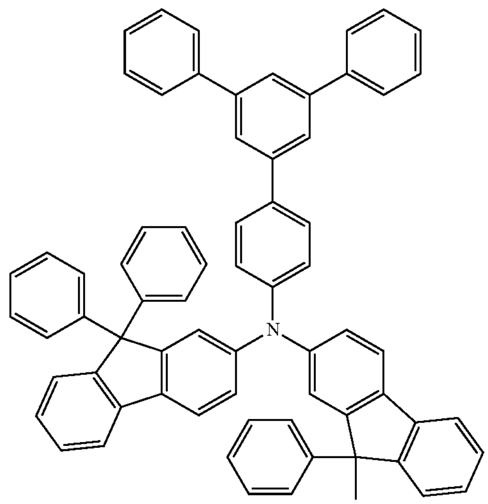
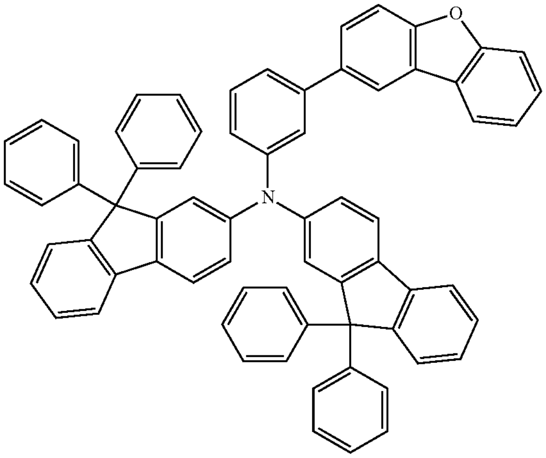

-continued
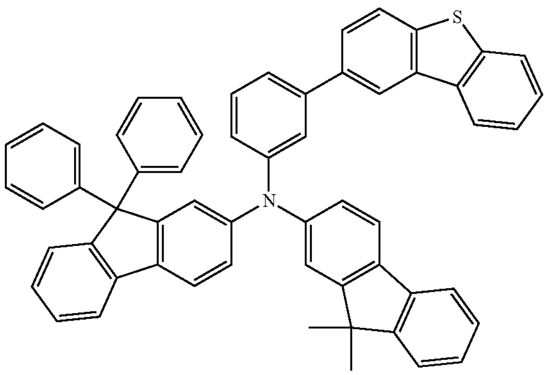
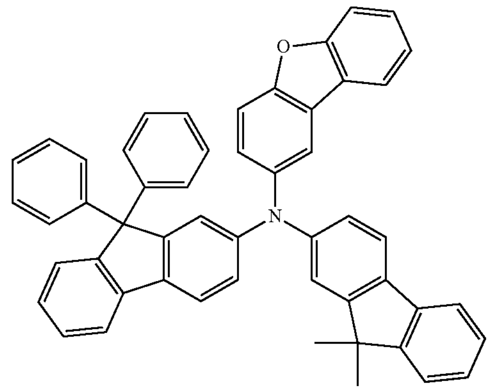
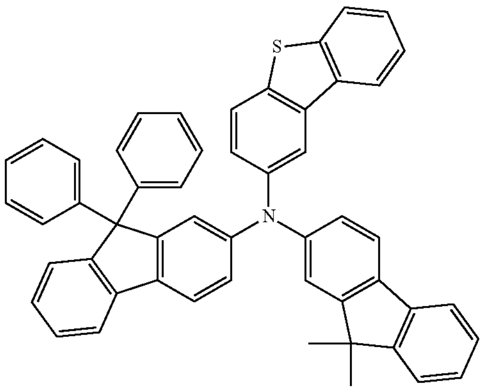
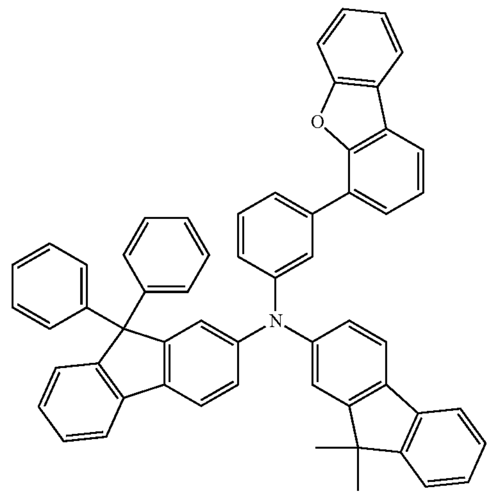
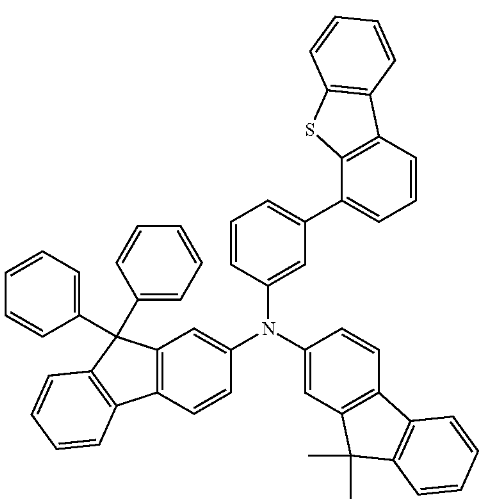
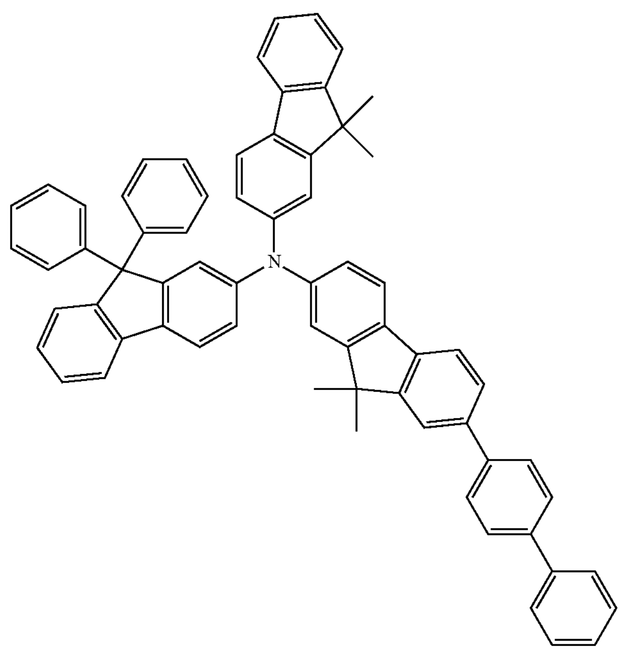

-continued
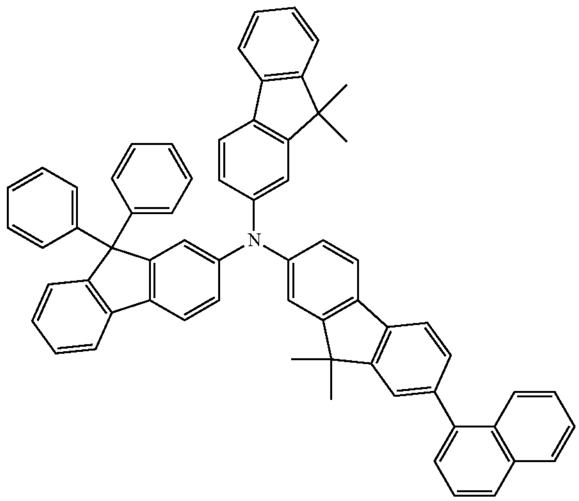
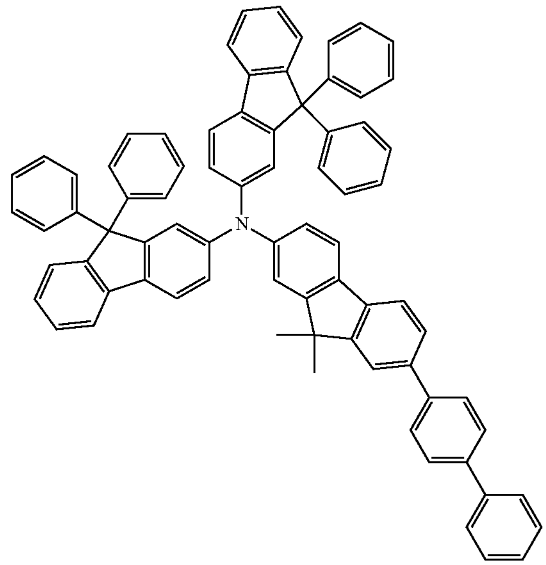
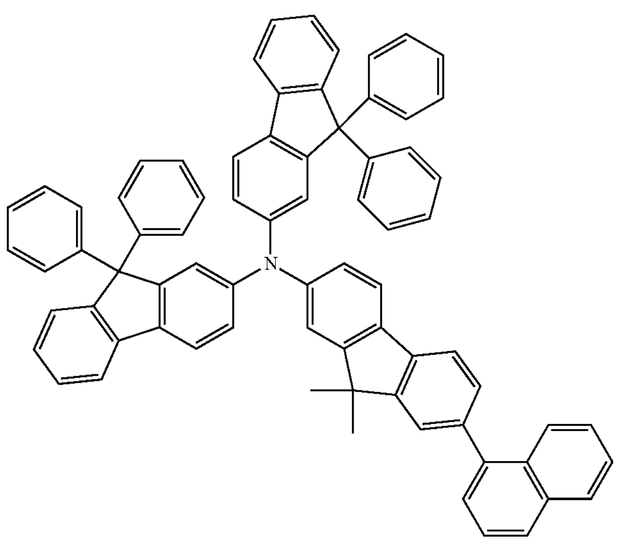
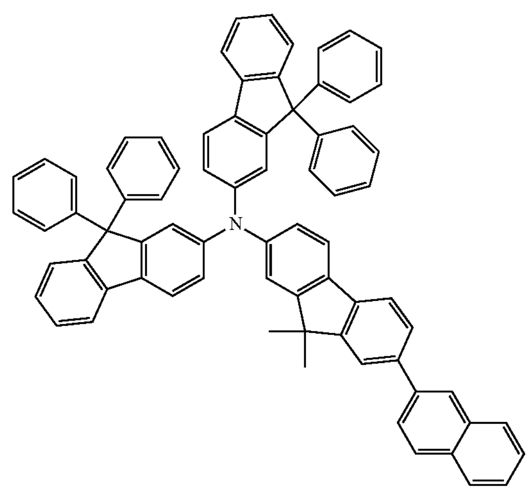

-continued
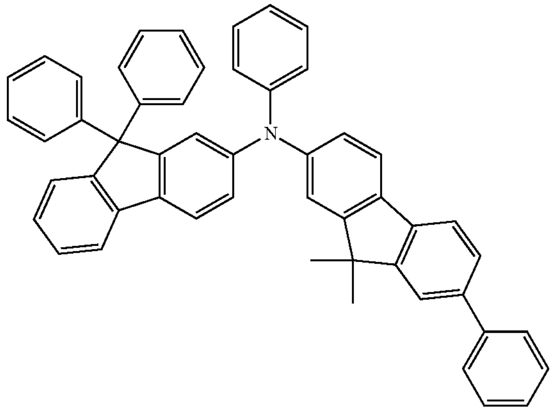
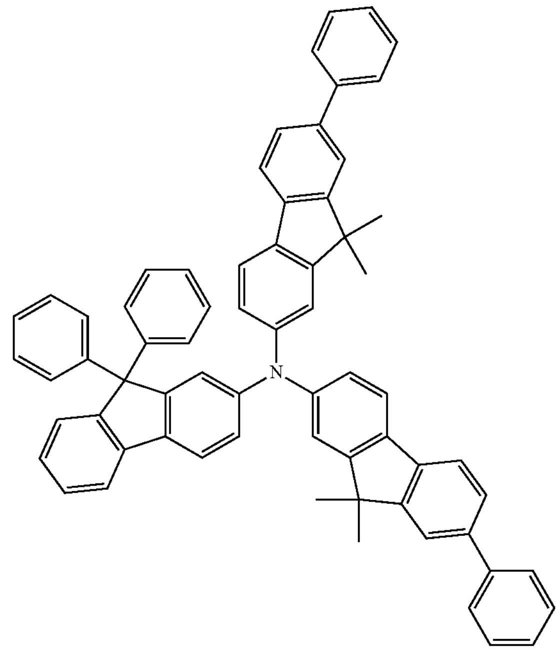
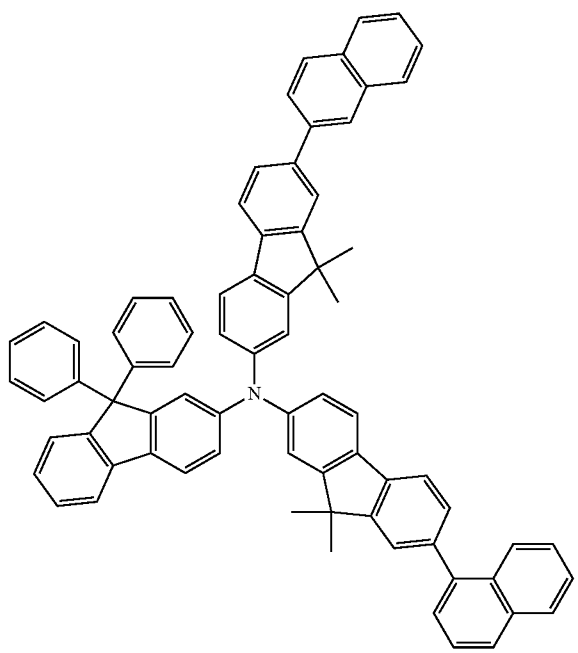
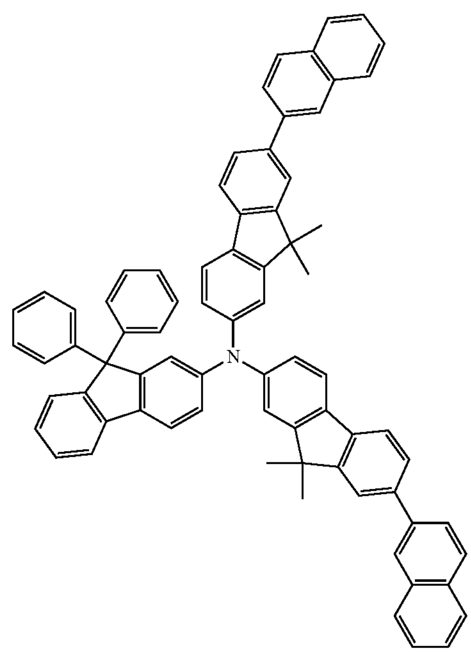
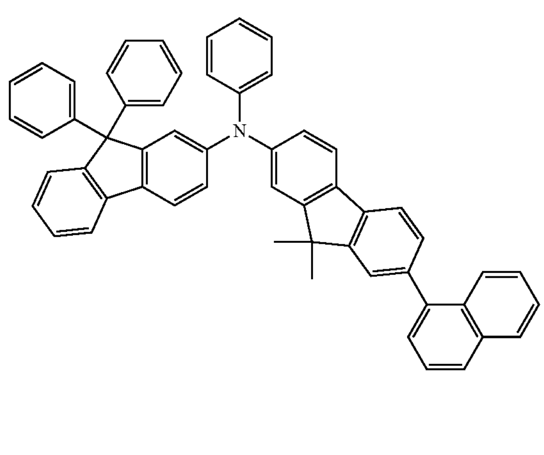
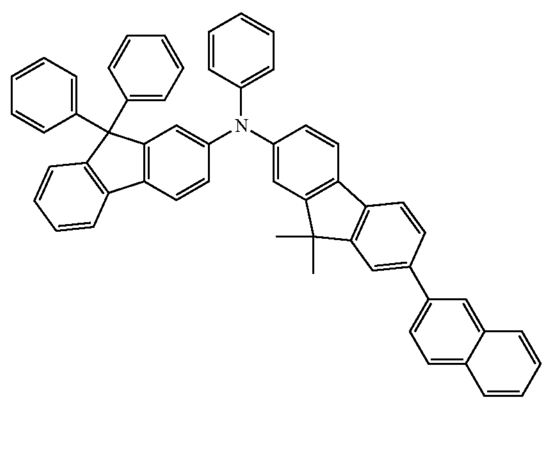

-continued
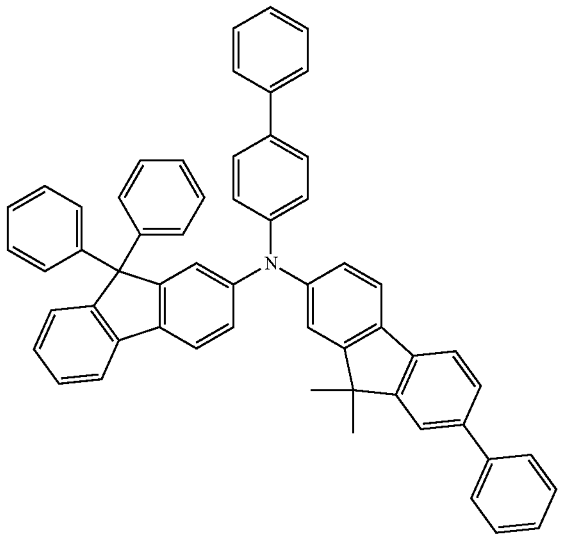
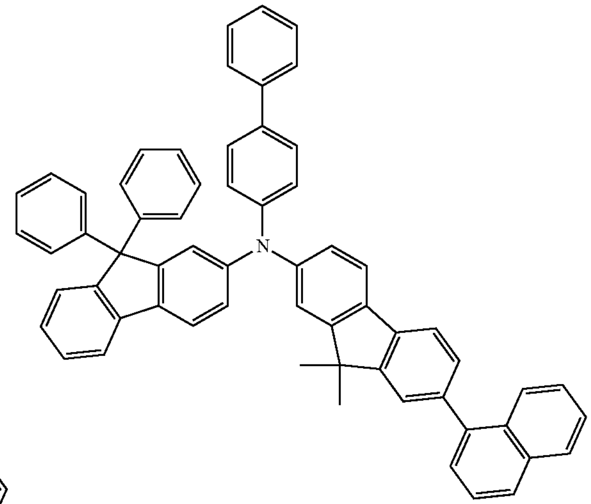
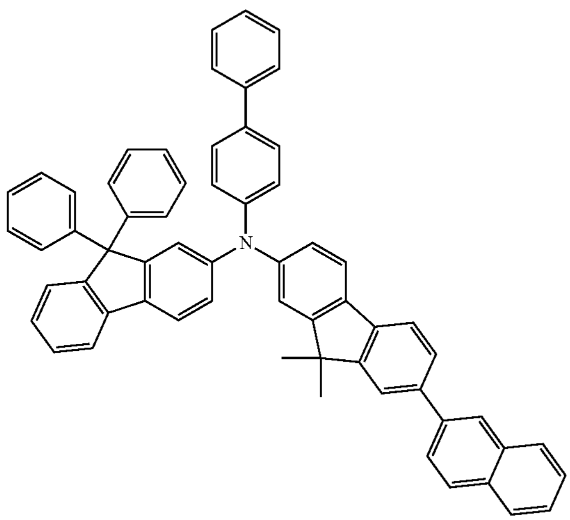
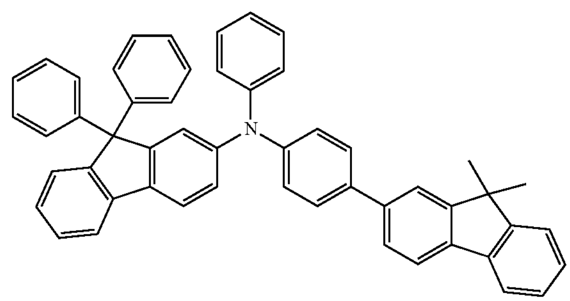
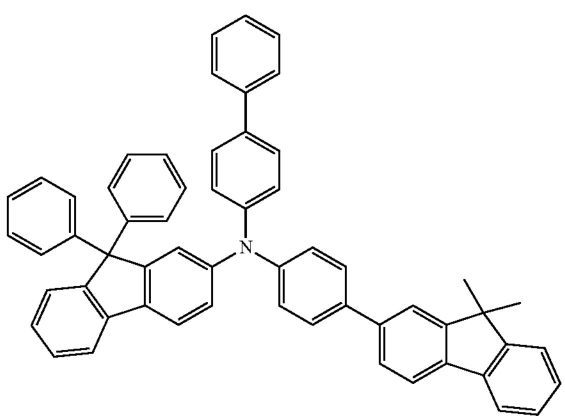
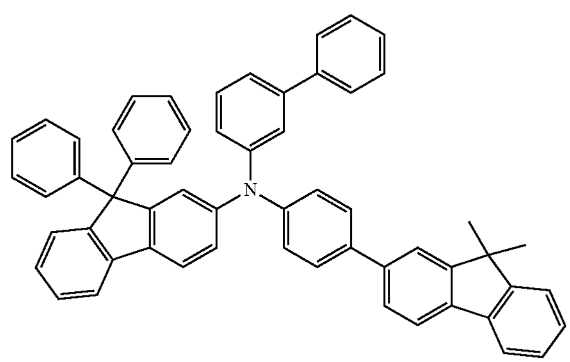

-continued
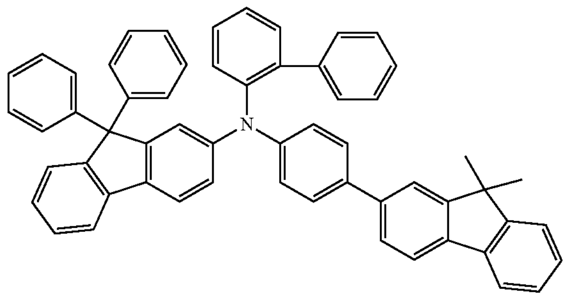
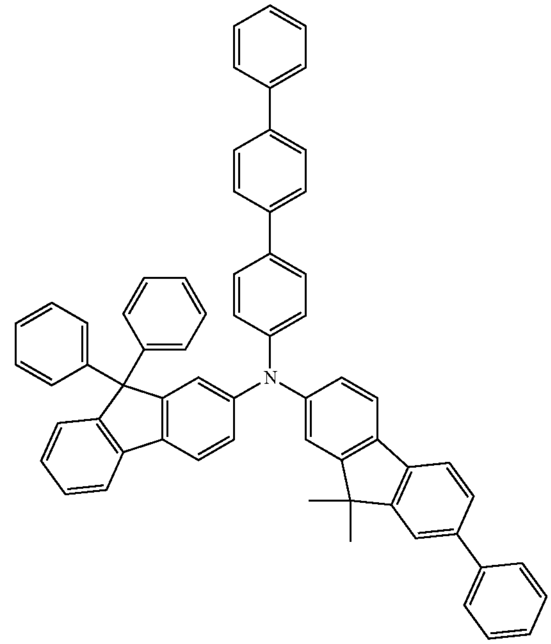
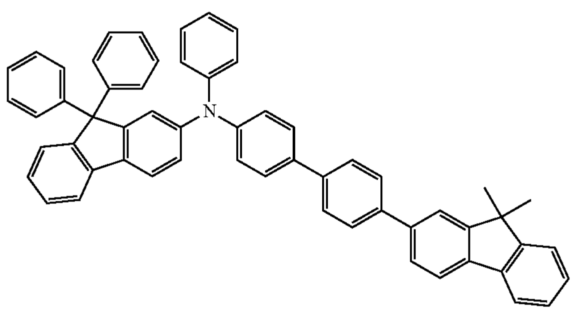
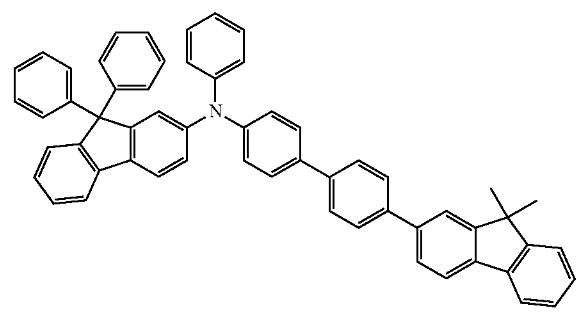
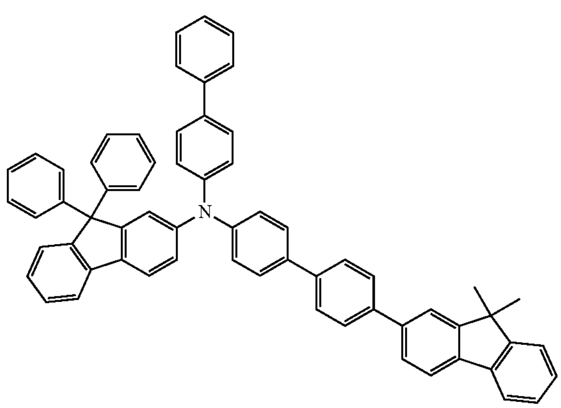
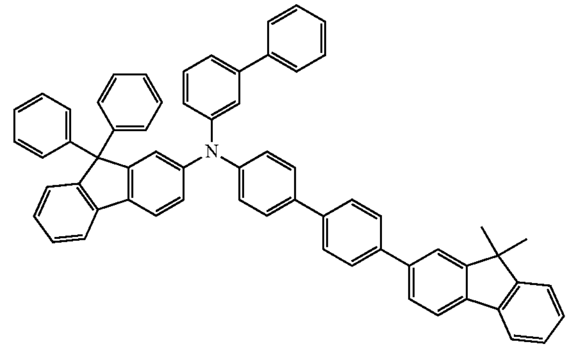
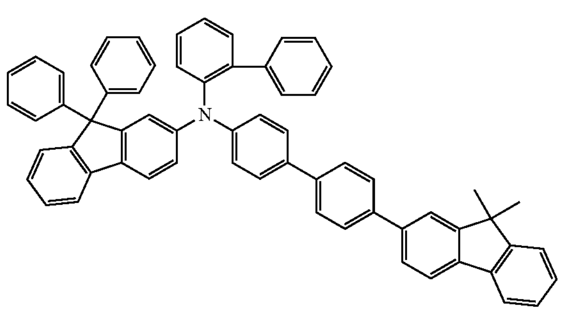
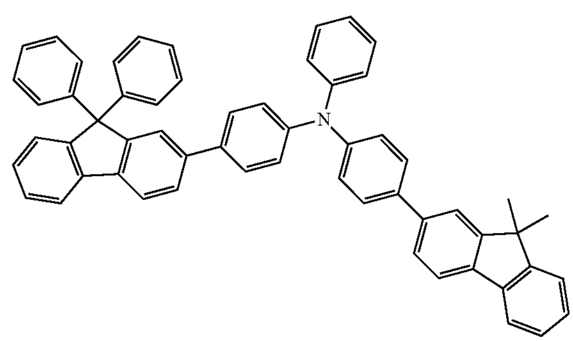

-continued
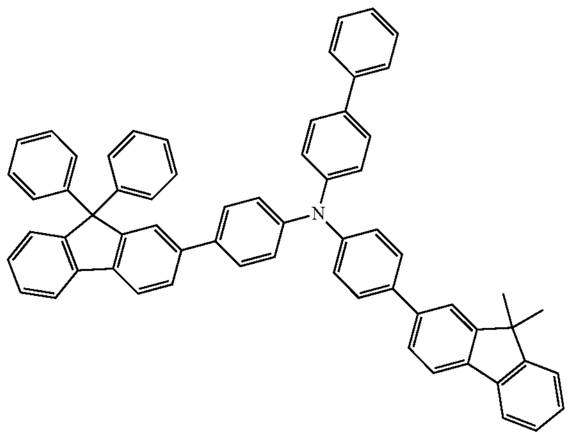
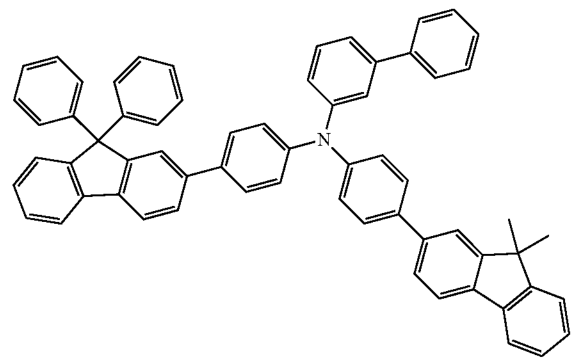
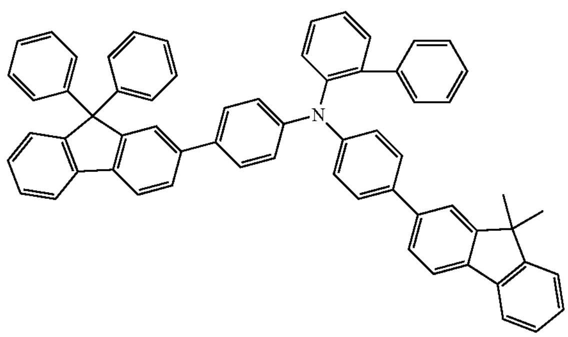
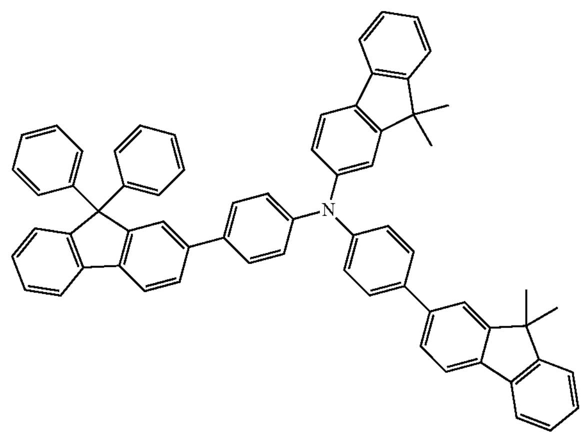
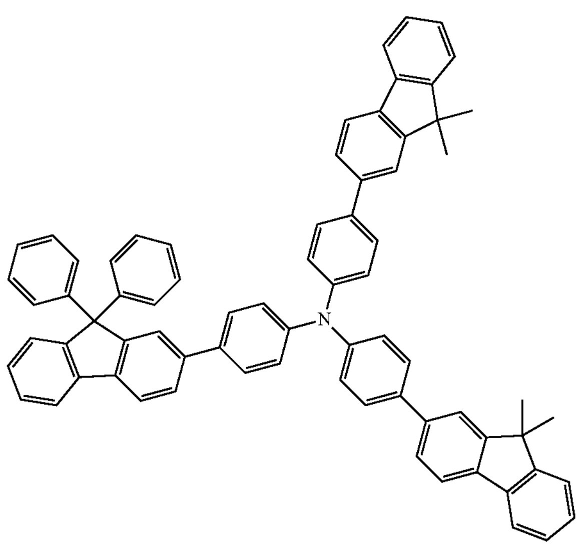
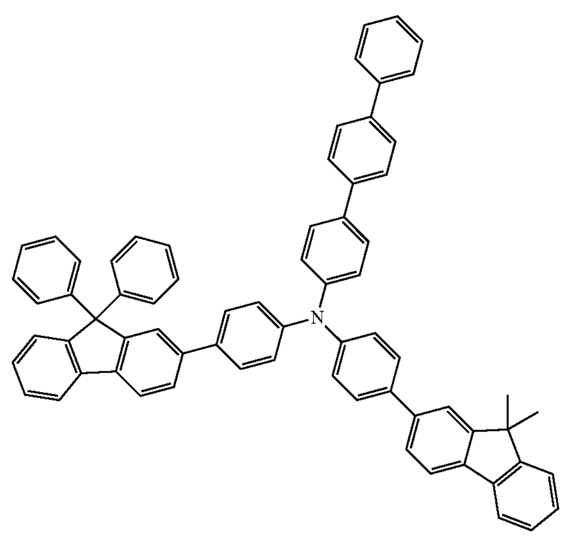

-continued
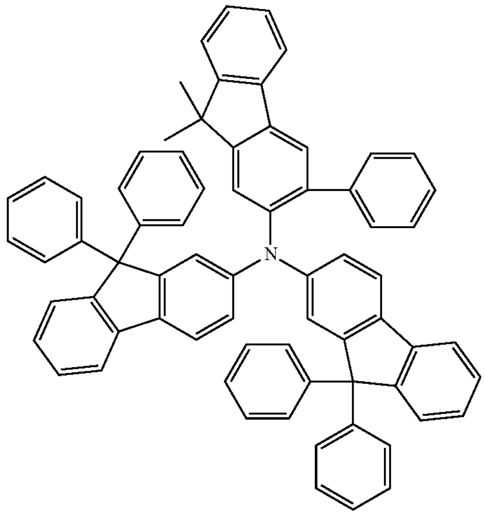
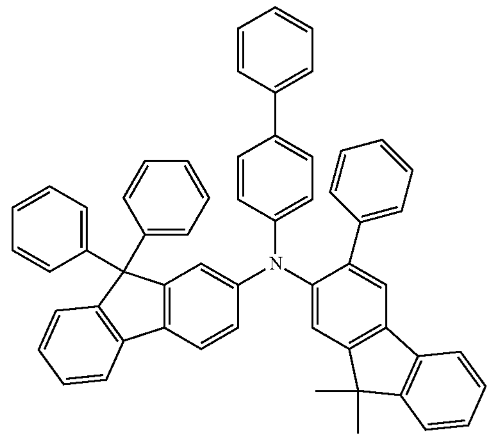
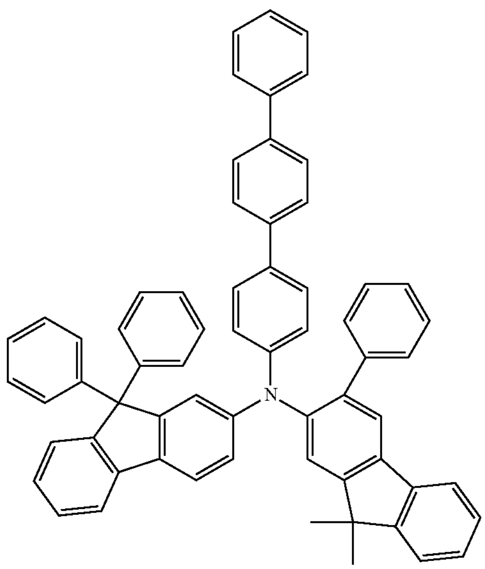
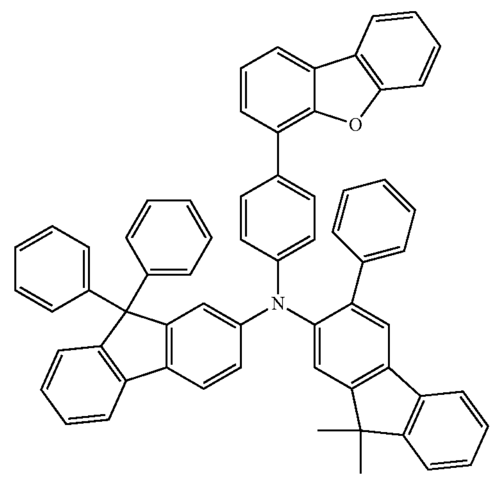
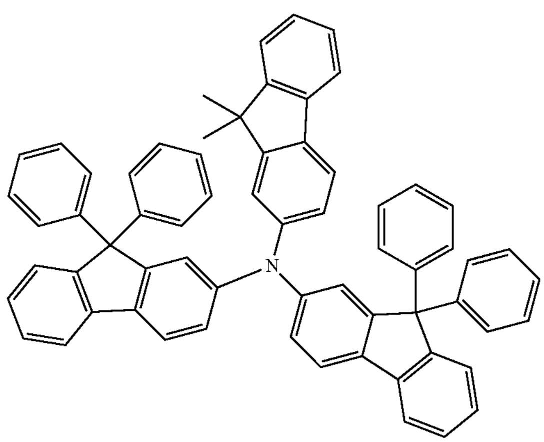
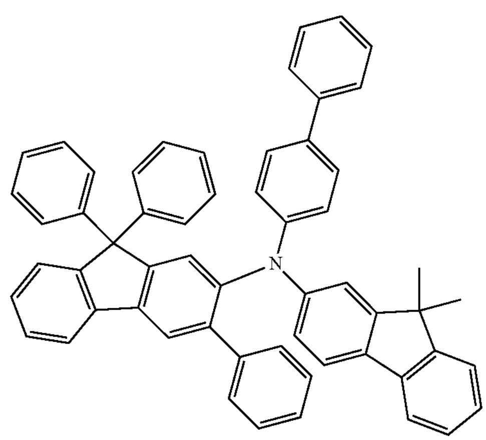

-continued
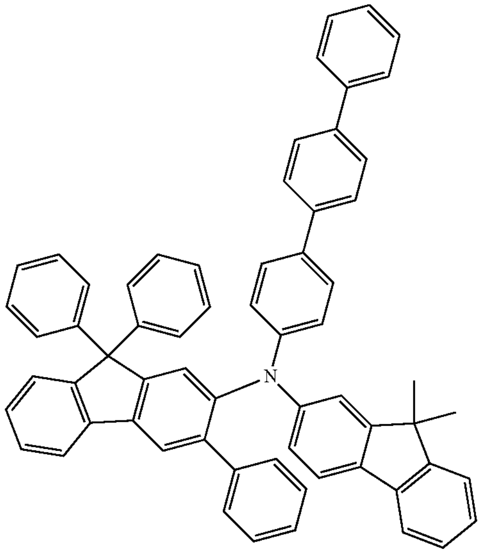
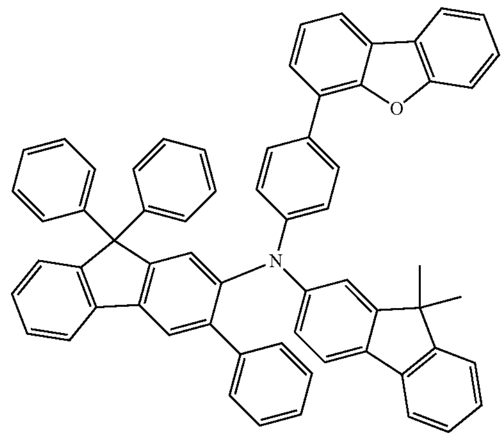
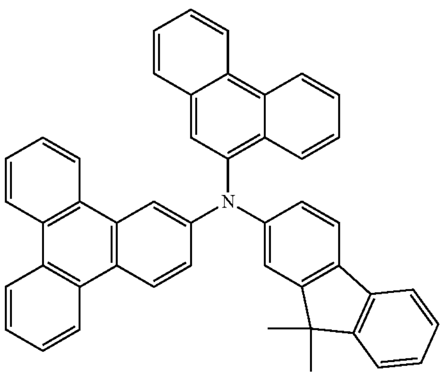
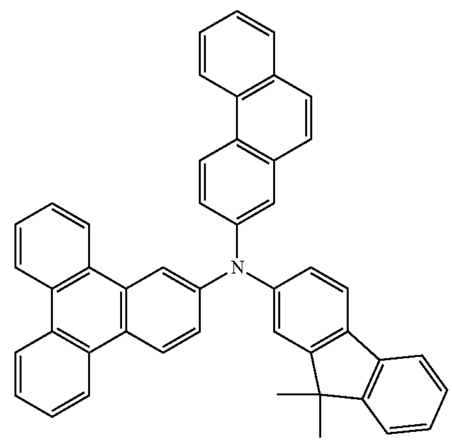
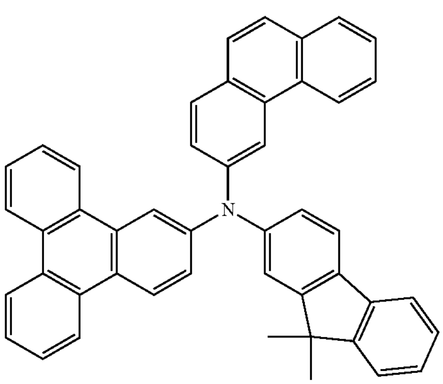
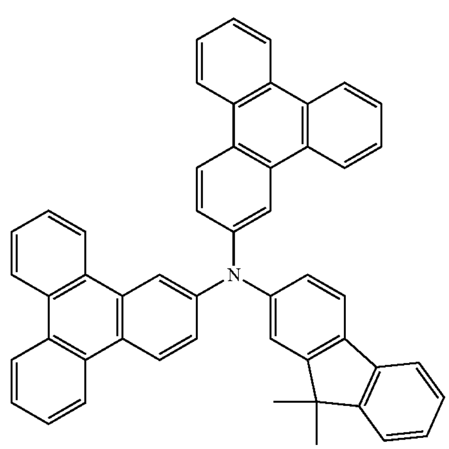

-continued
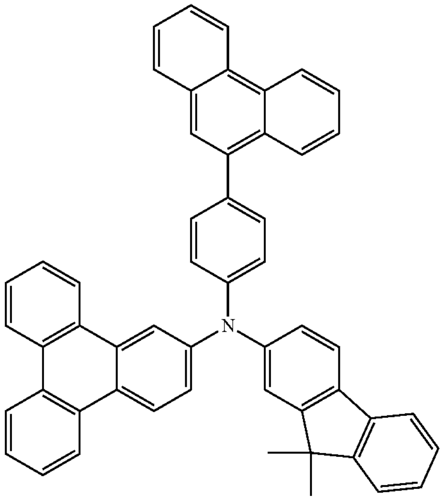
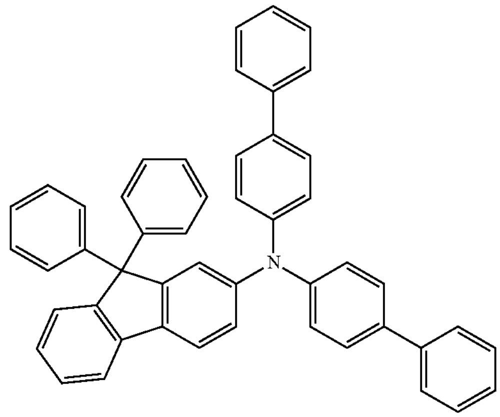
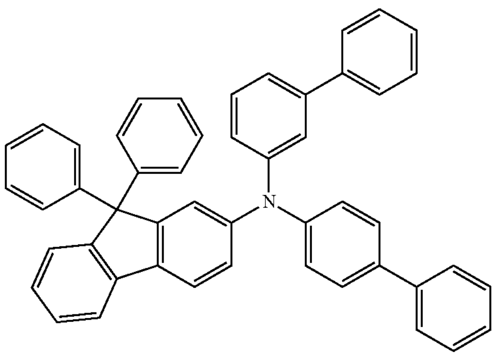
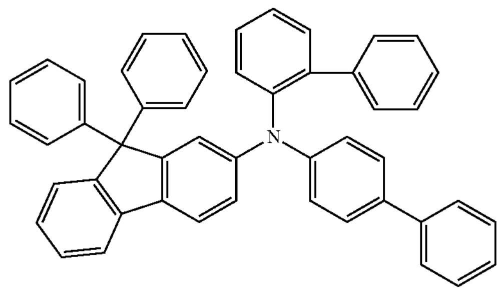
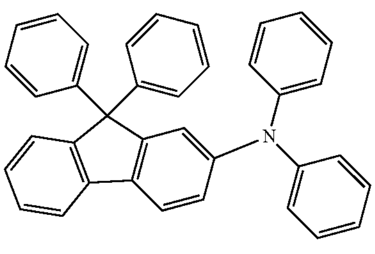
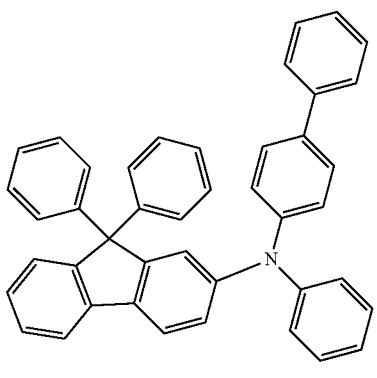
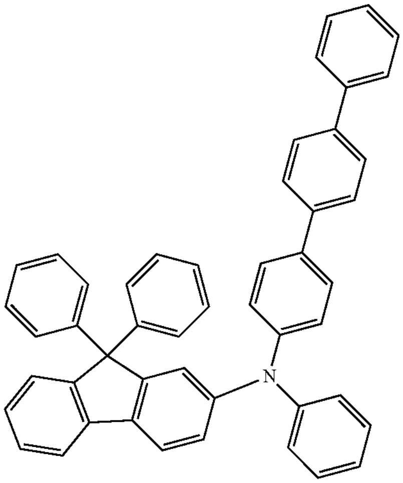
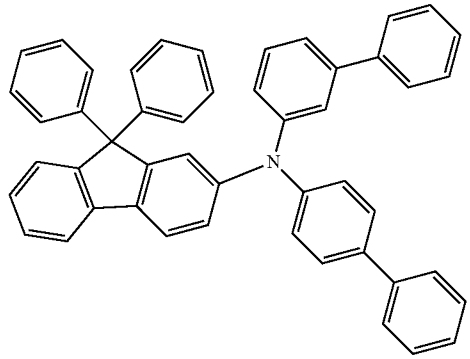

-continued
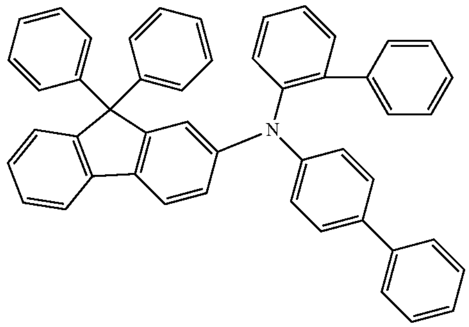
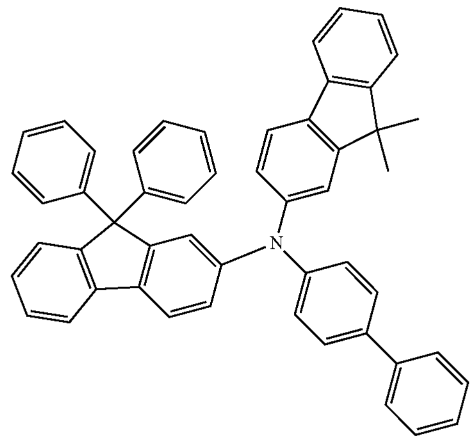
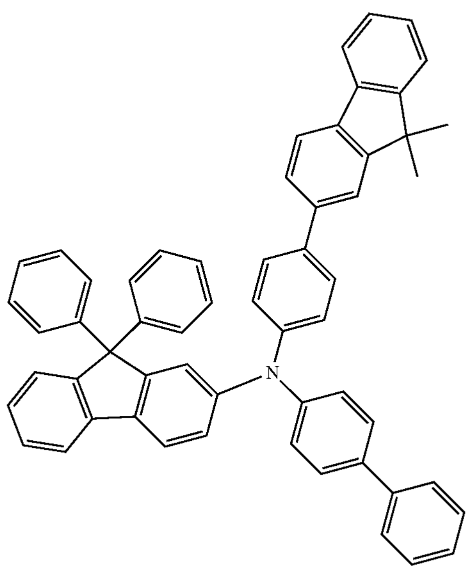
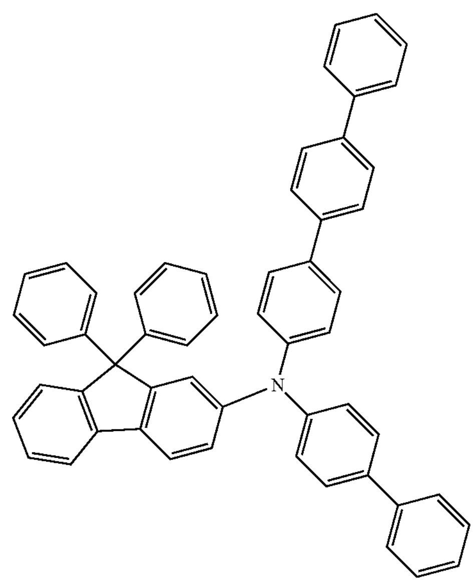
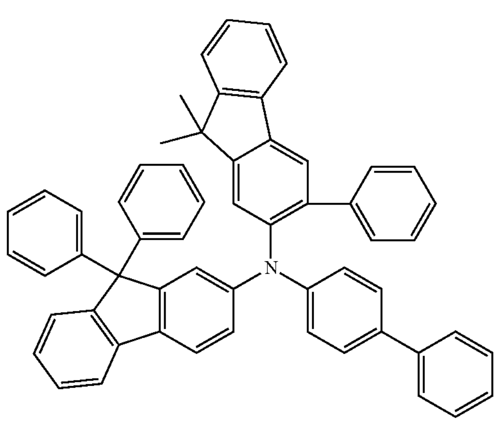
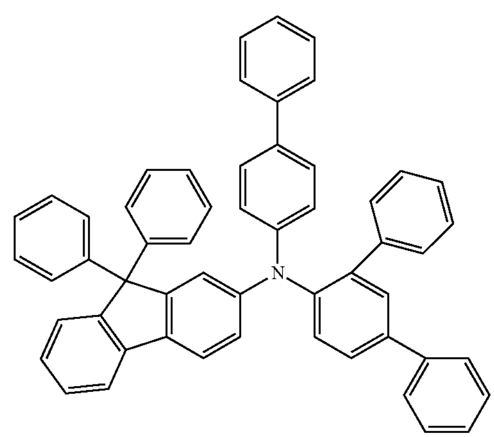

-continued
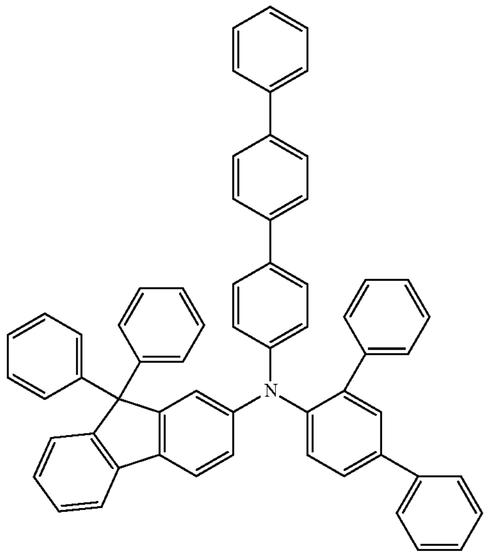
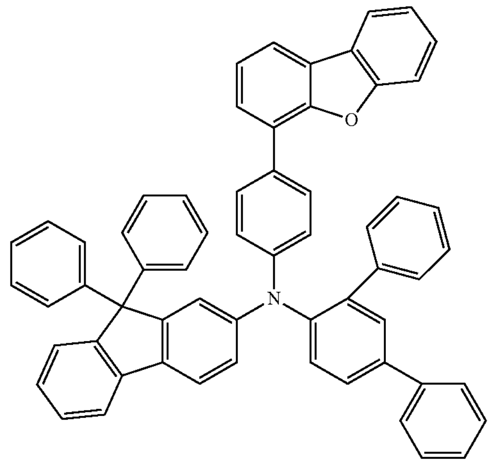
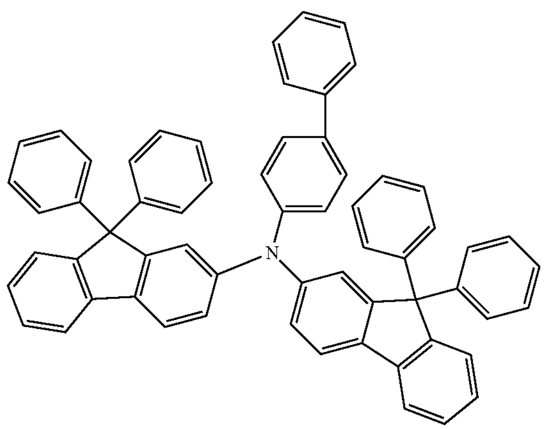
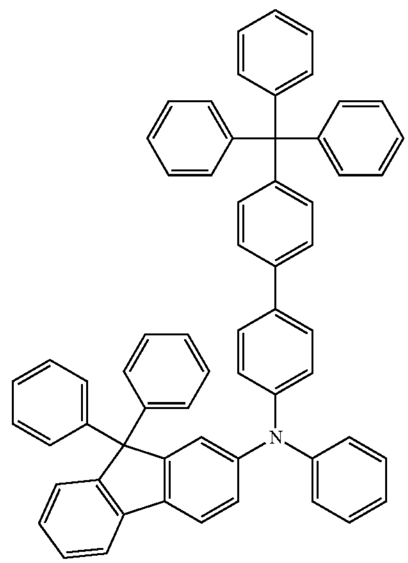
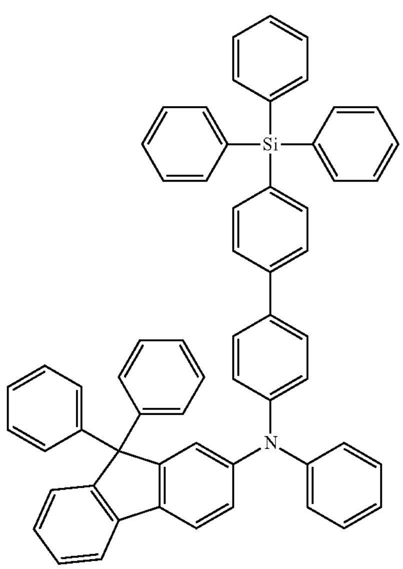
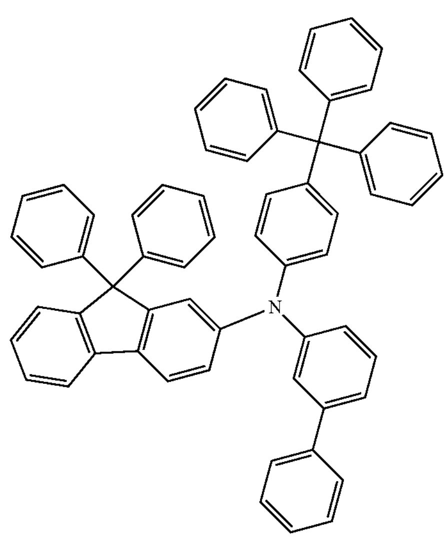

-continued
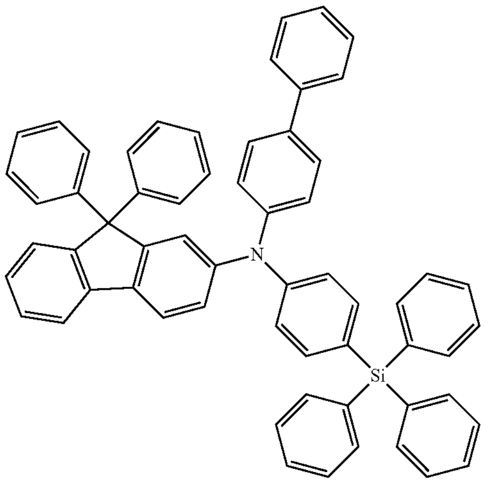
-continued
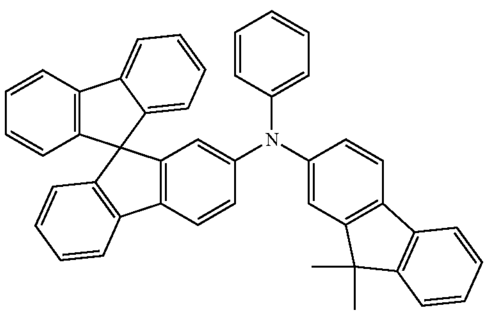
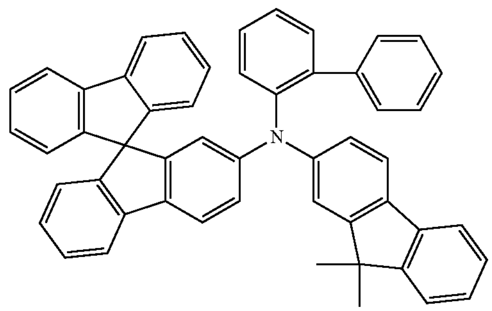
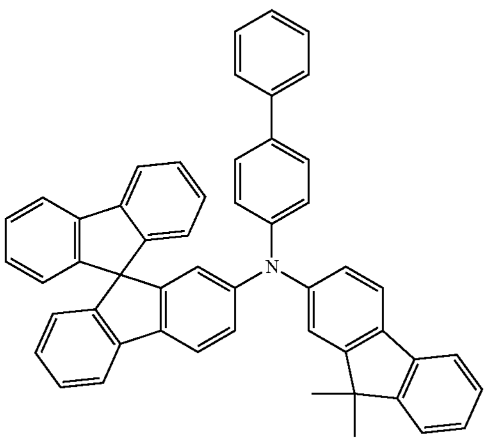
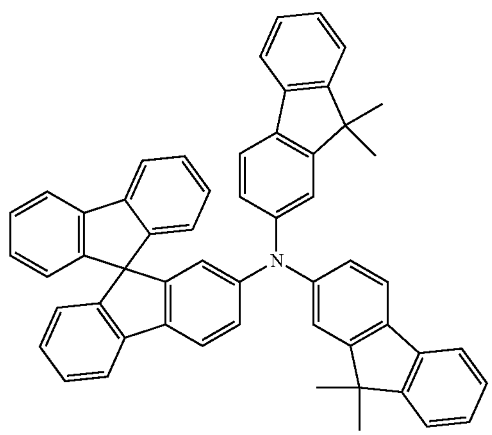
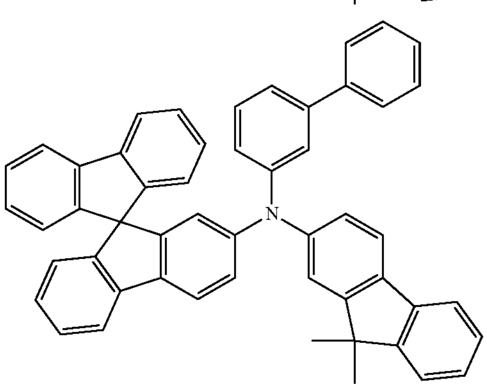
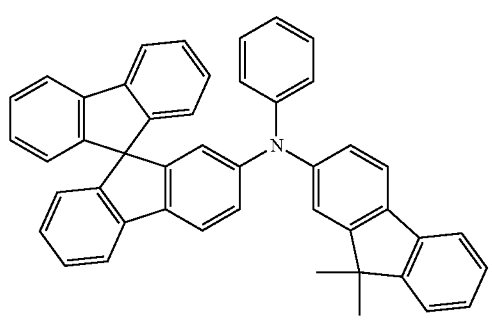

-continued
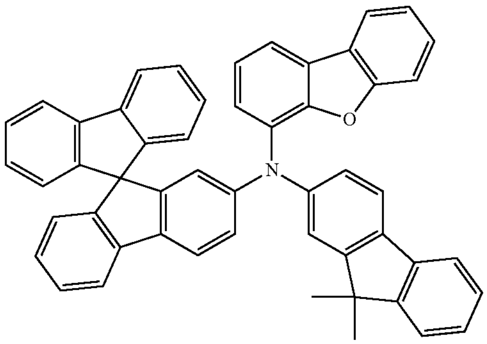
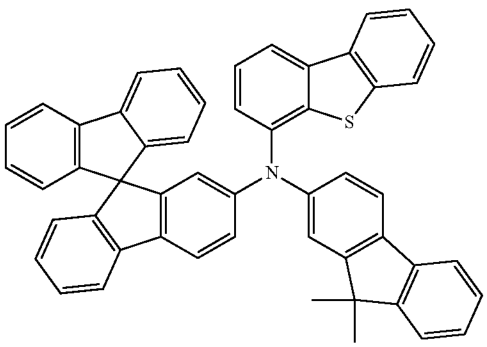
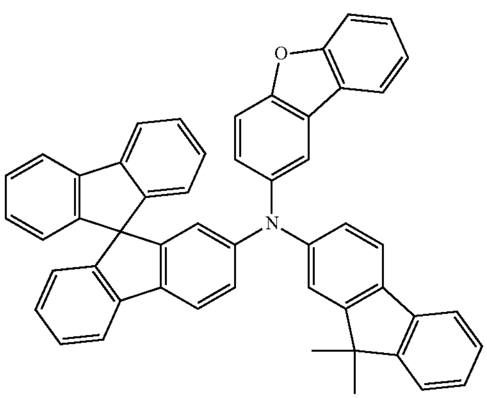
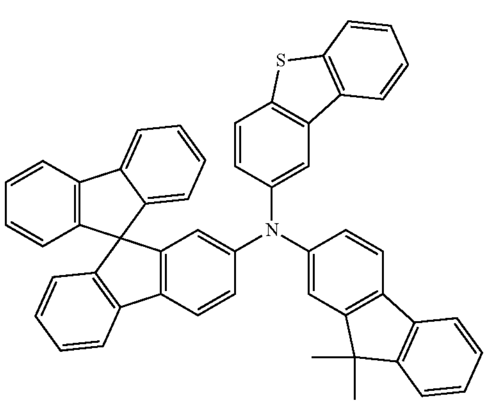
-continued
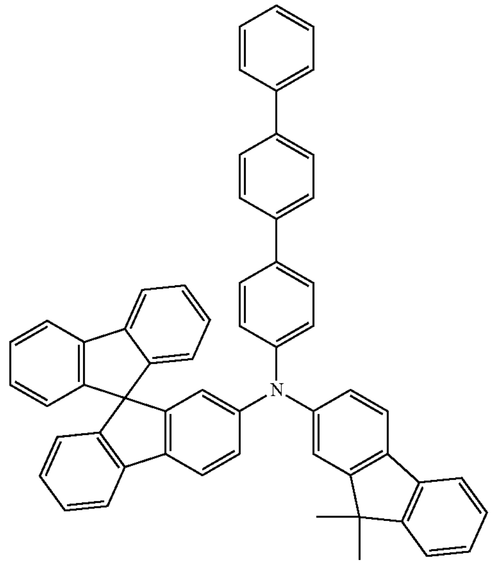
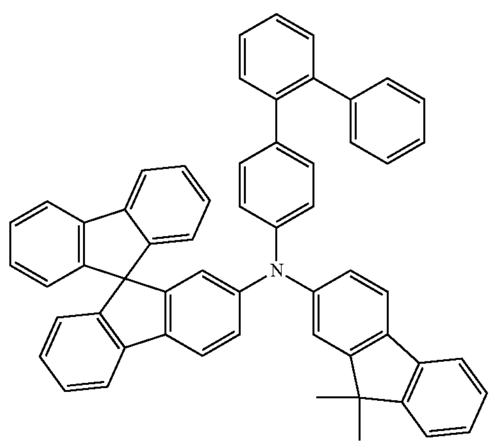
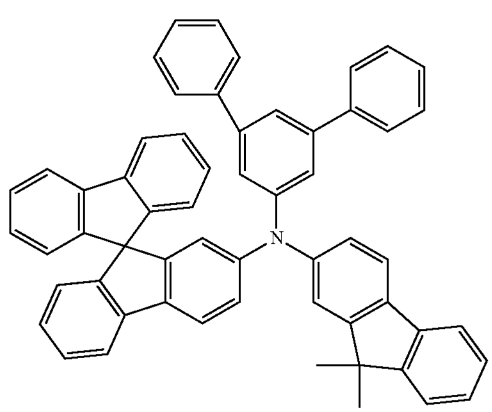

-continued
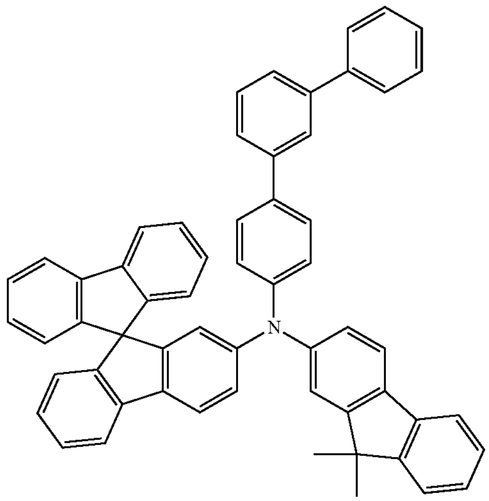
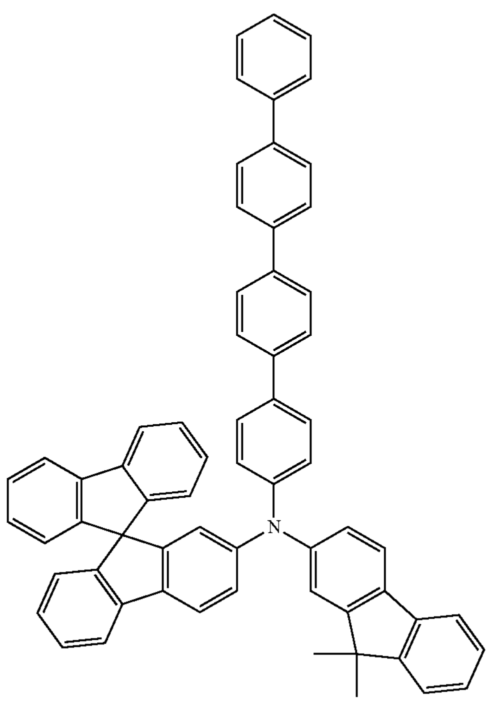
-continued
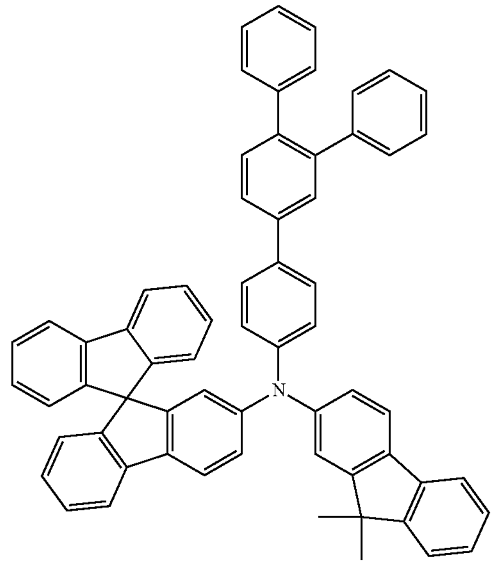
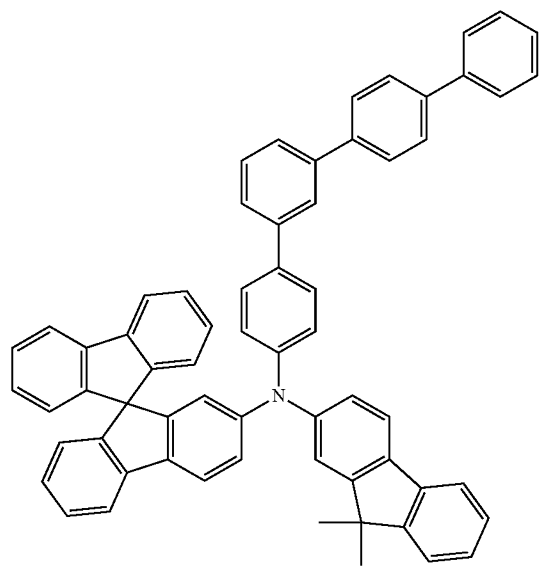
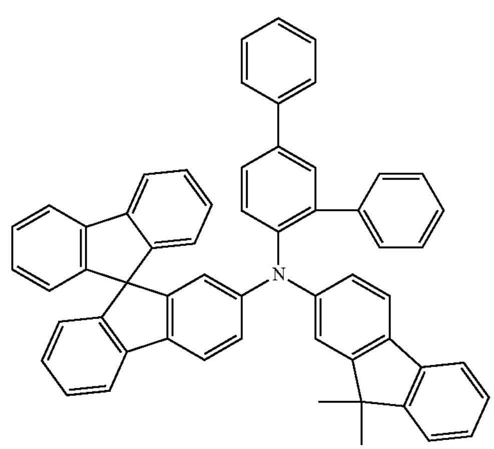

-continued
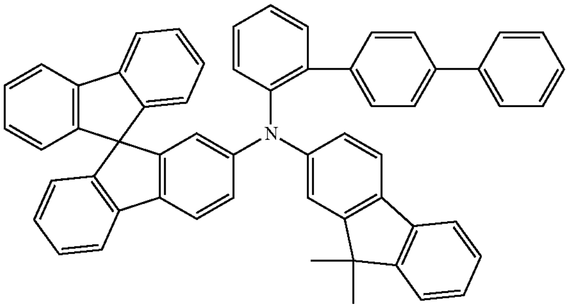
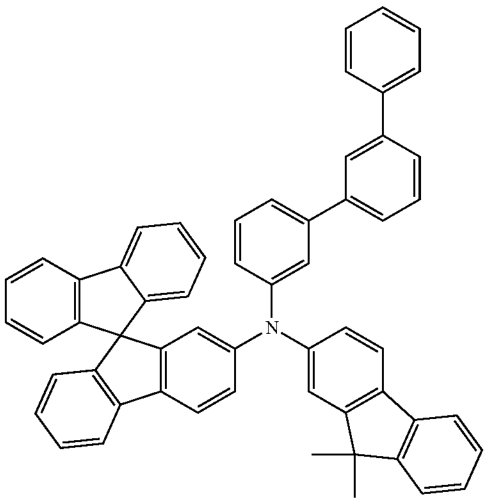
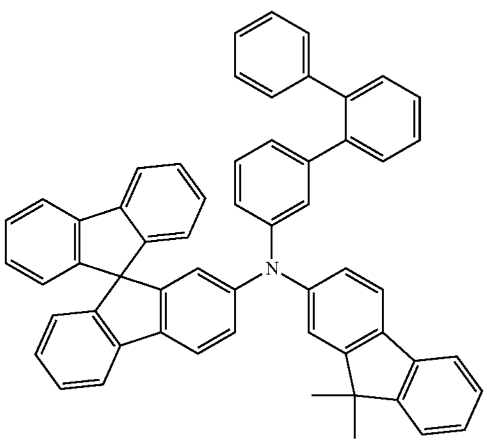
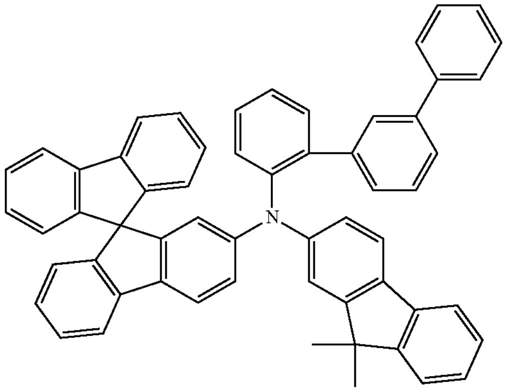
-continued
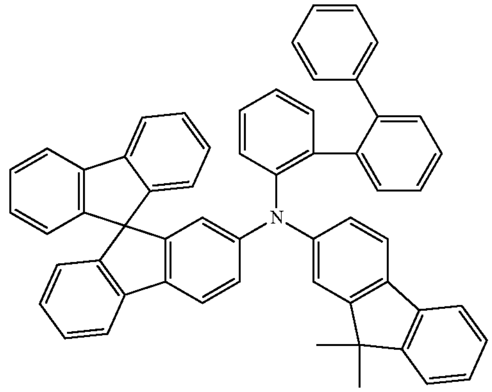
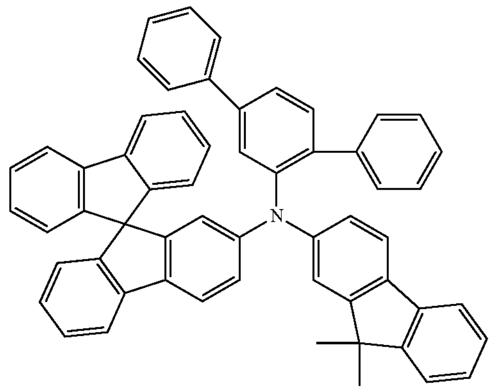
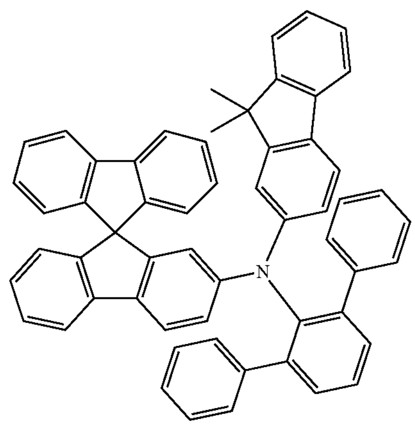
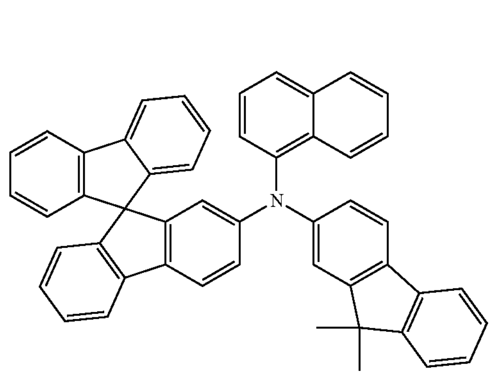

-continued
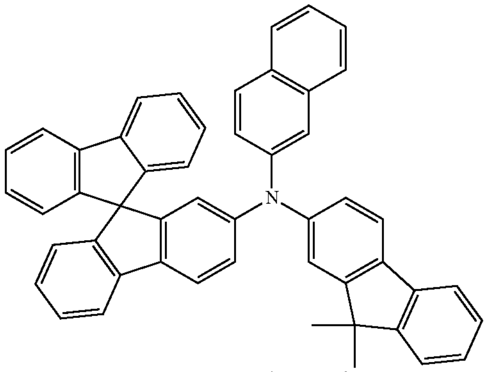
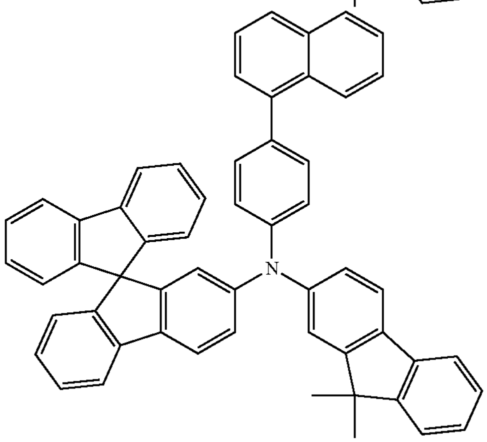
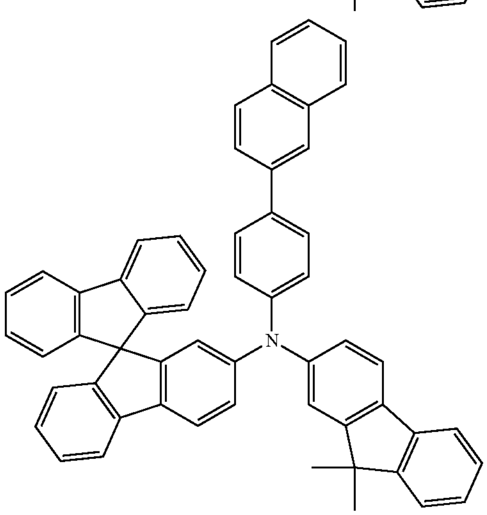
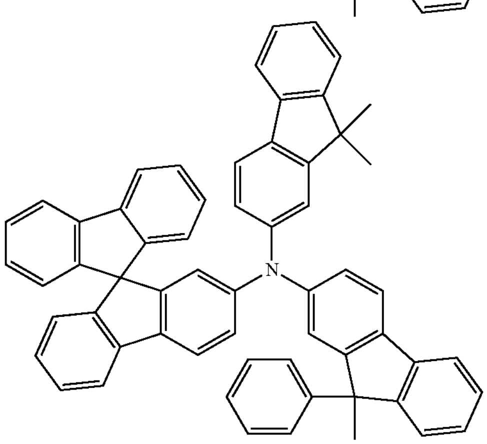
-continued
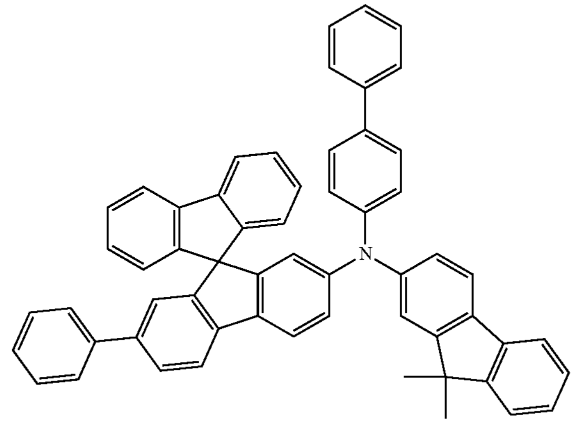
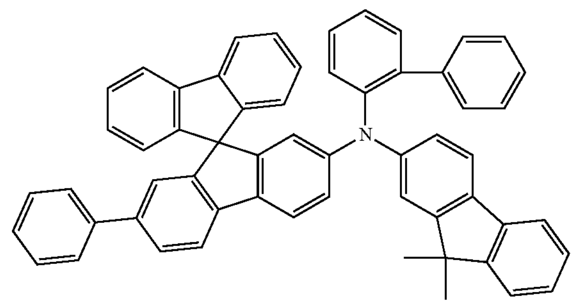
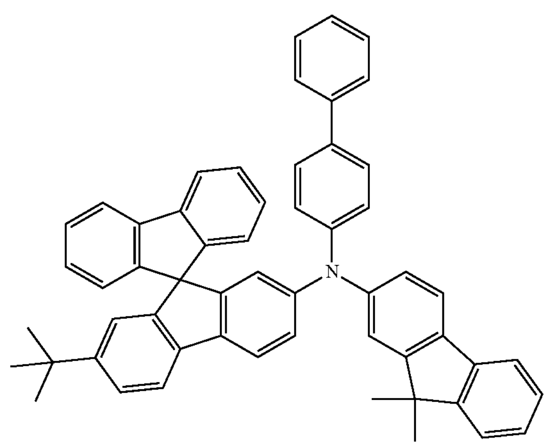
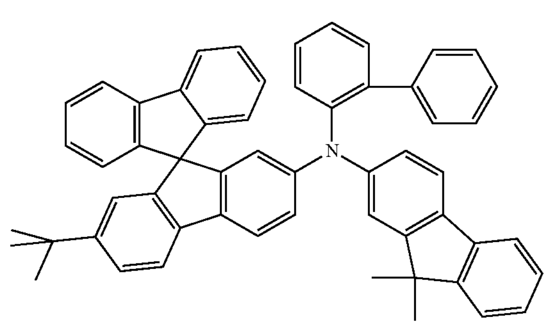

-continued
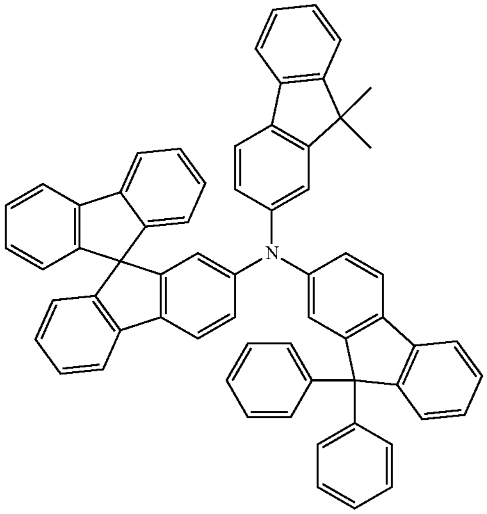
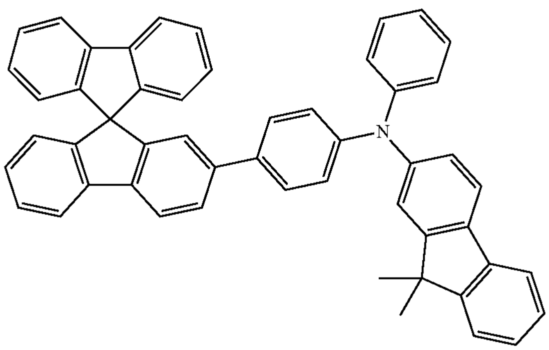
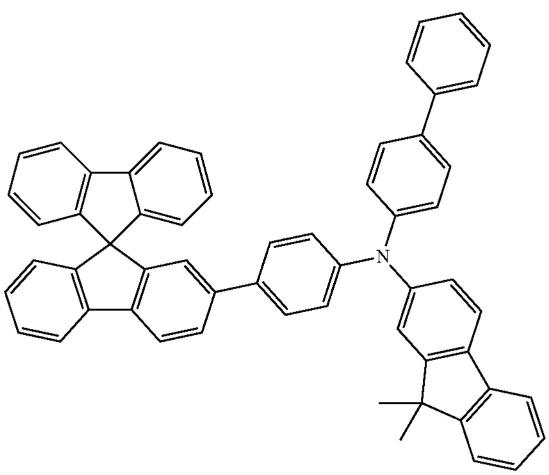
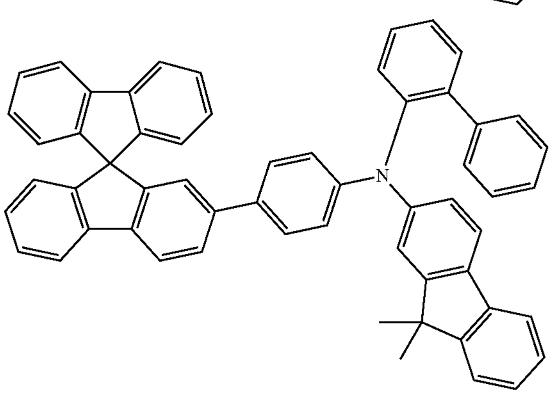
-continued
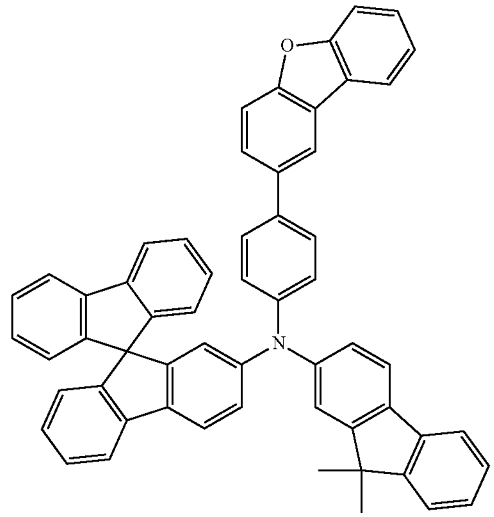
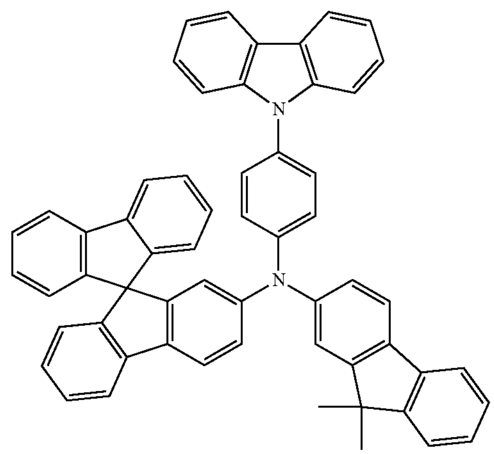
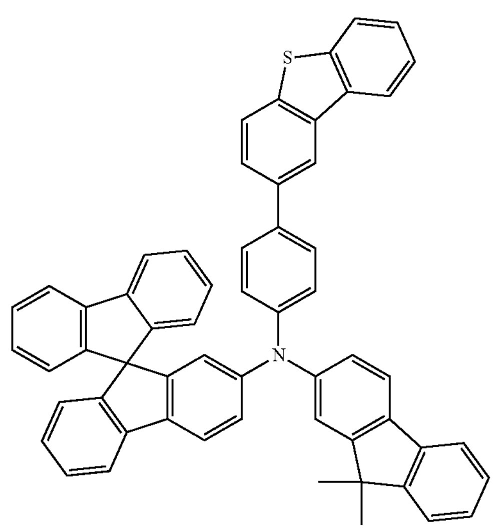

-continued
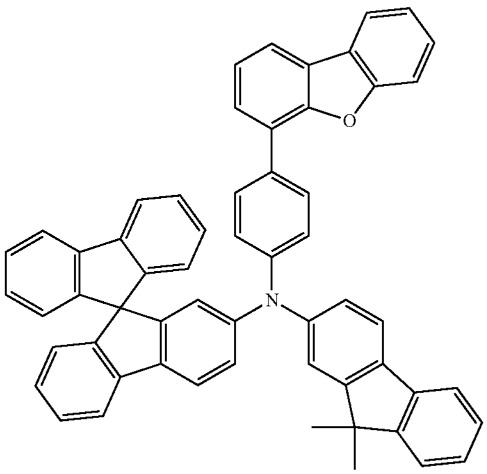
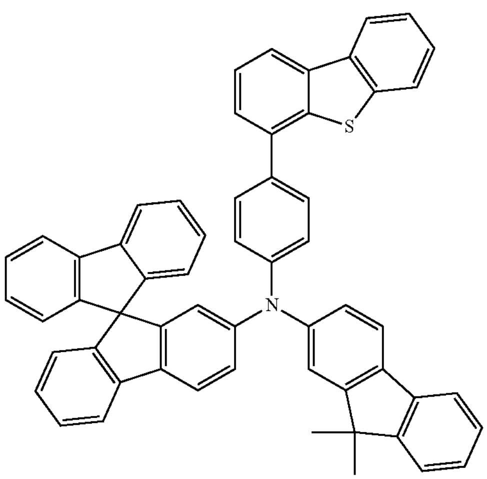
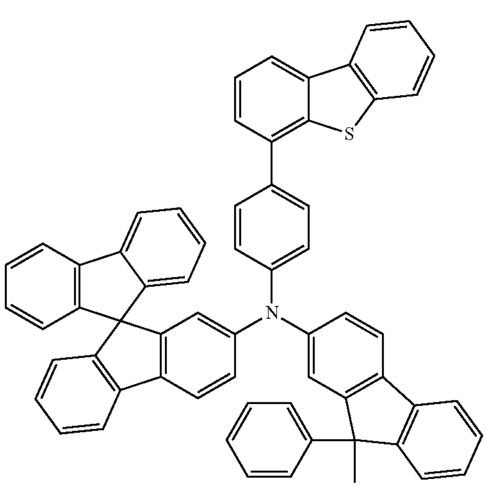
-continued
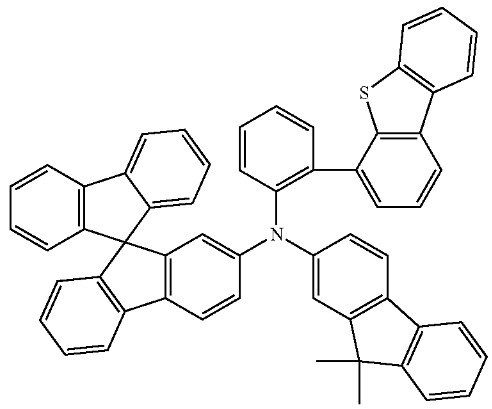
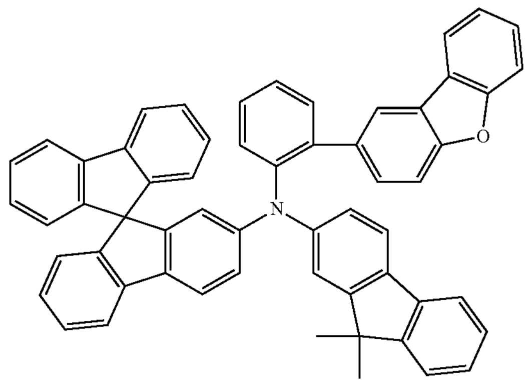
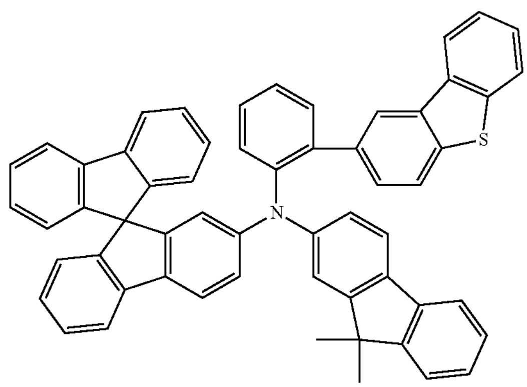
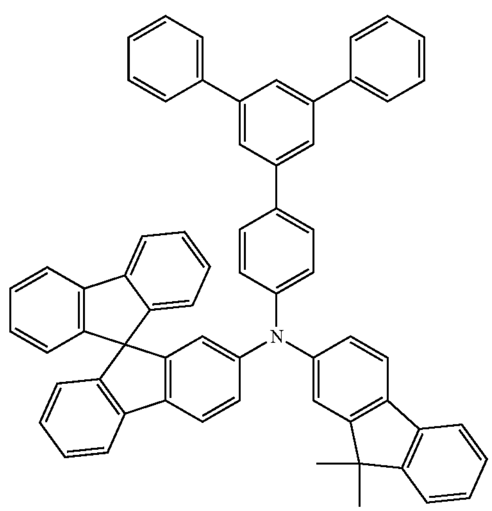

-continued
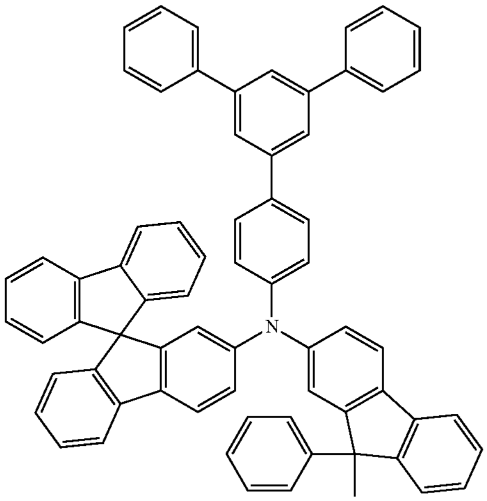
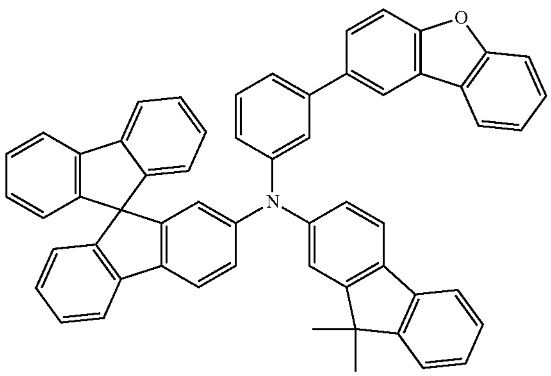
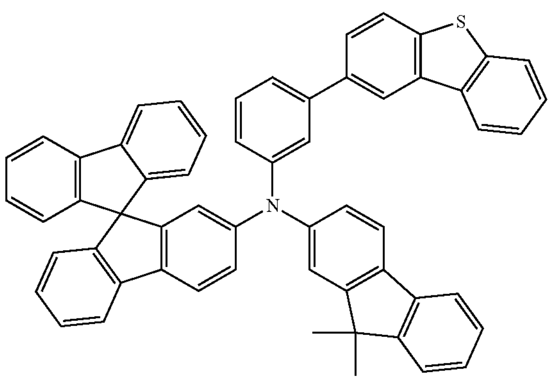
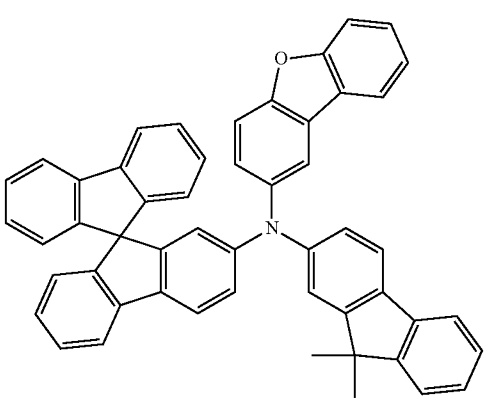
-continued
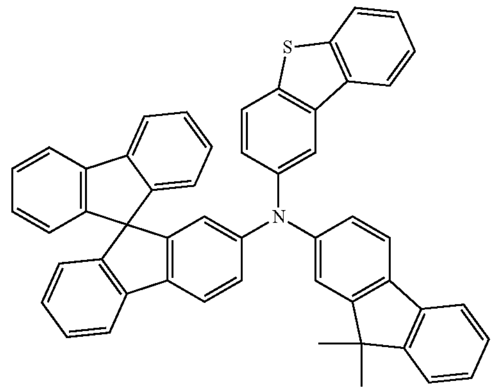
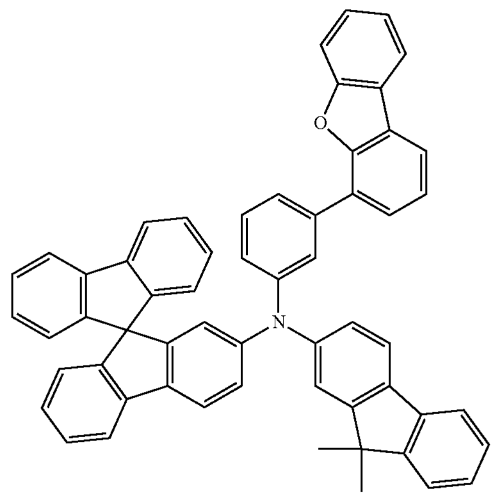
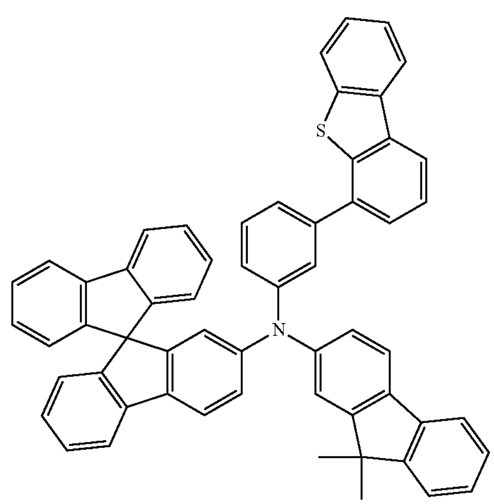

-continued
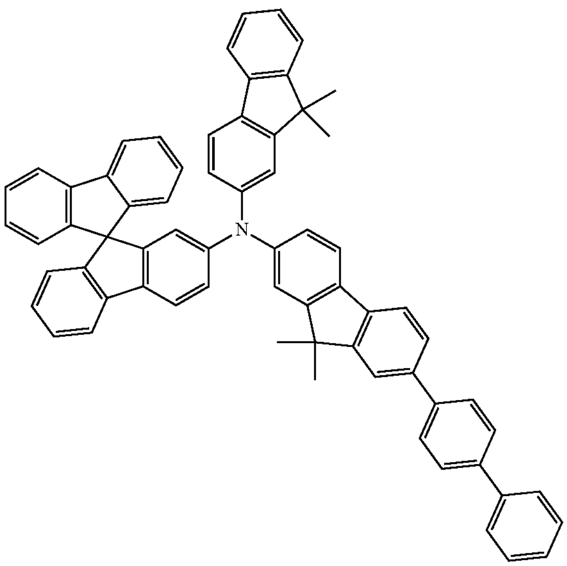
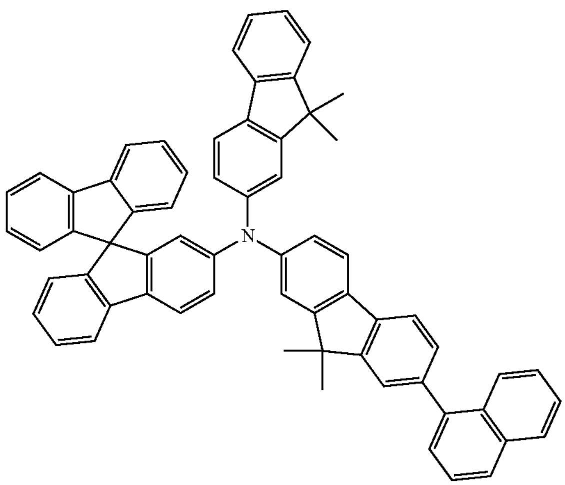
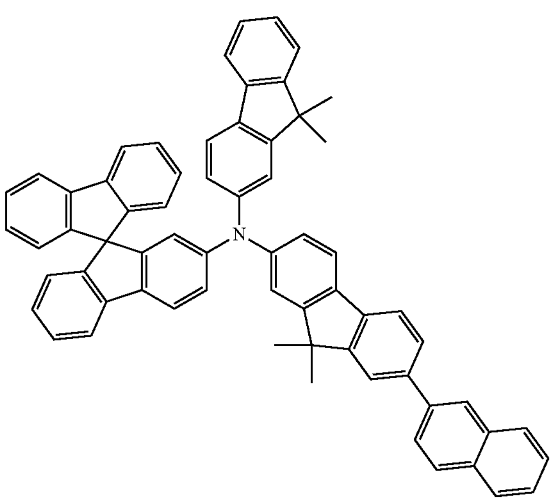
-continued
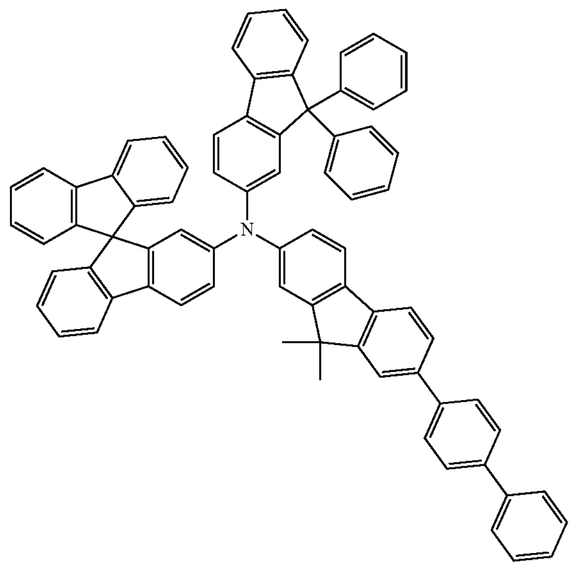
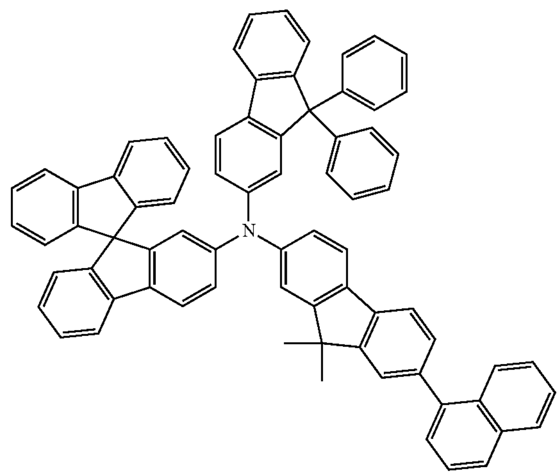
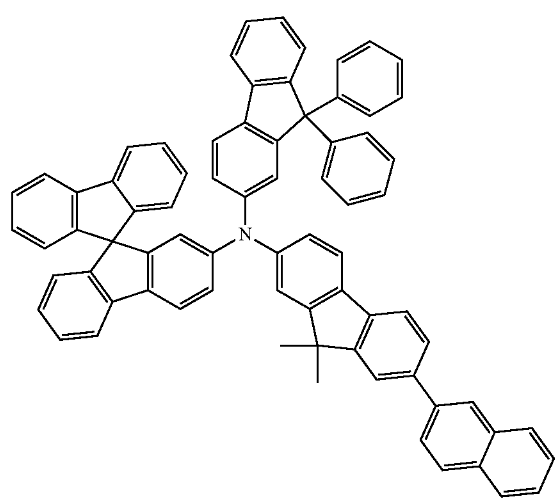

-continued
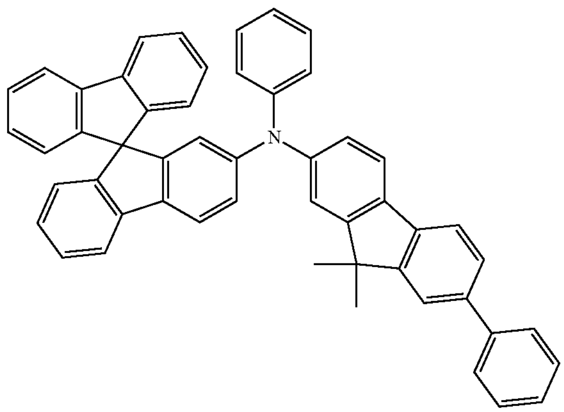
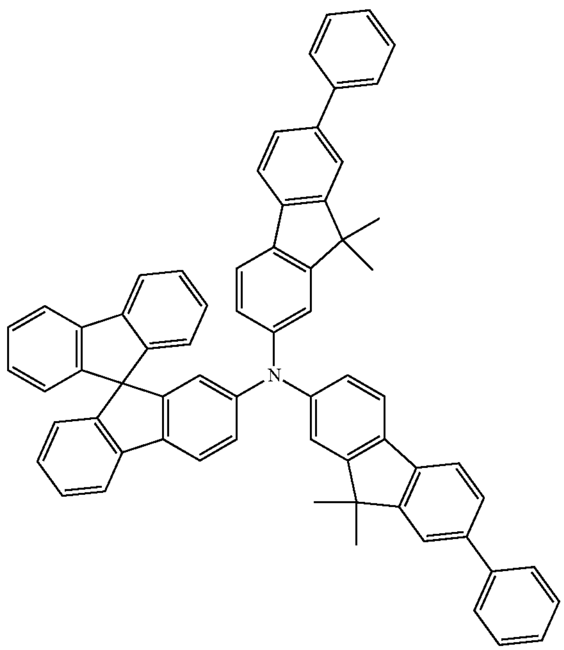
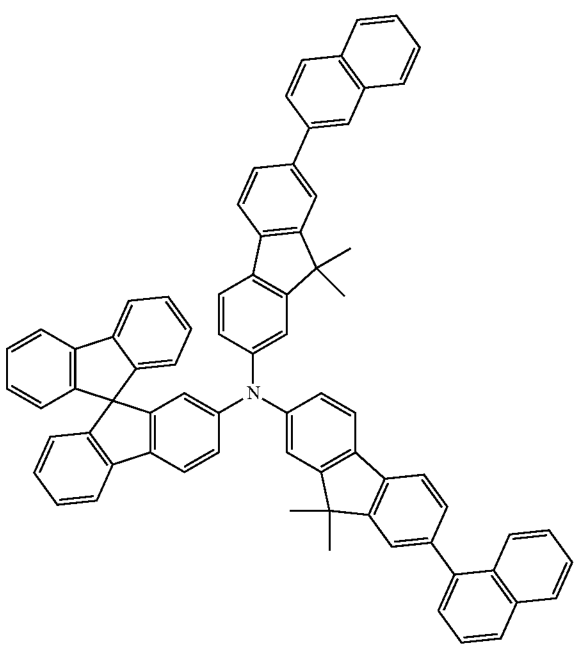
-continued
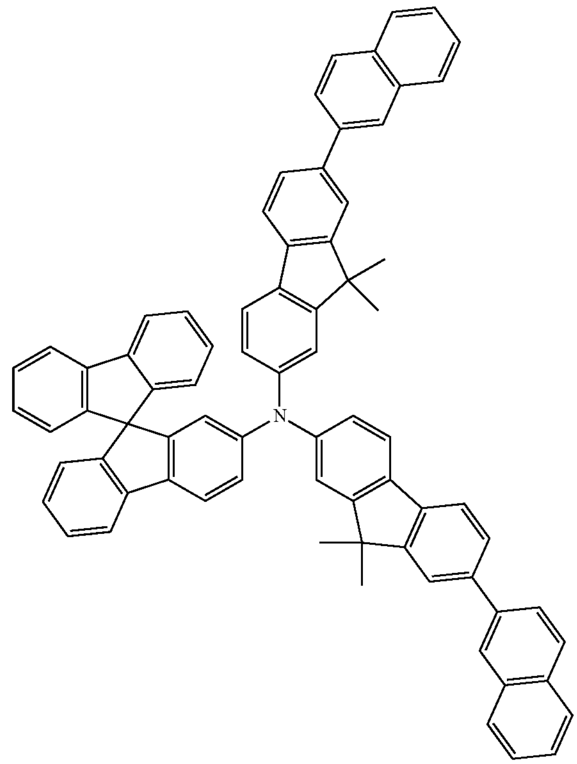
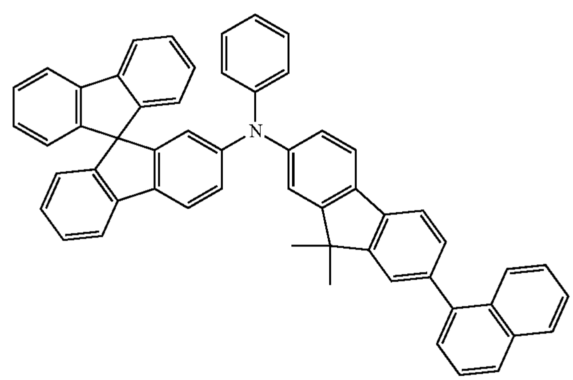
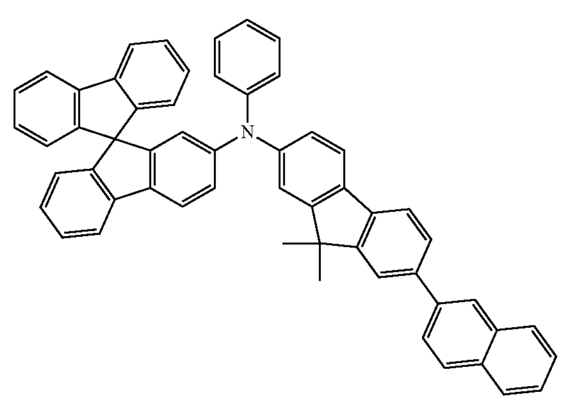

-continued
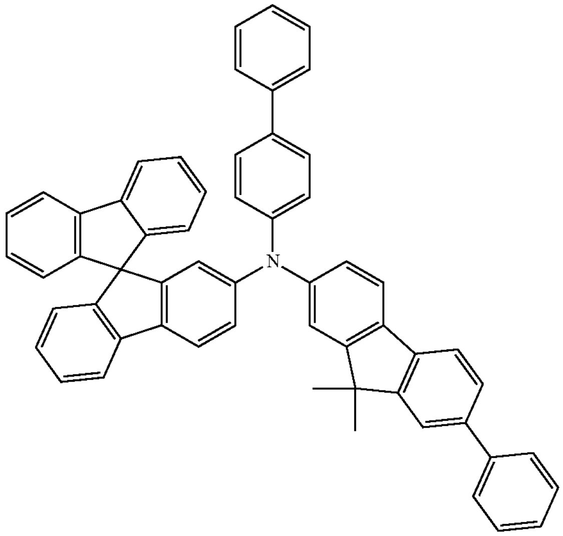
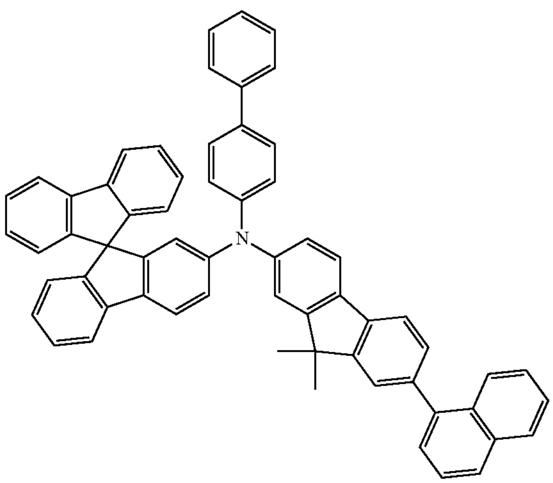
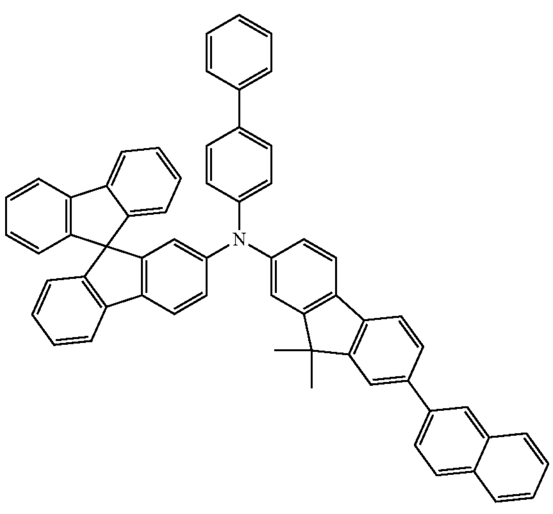
-continued
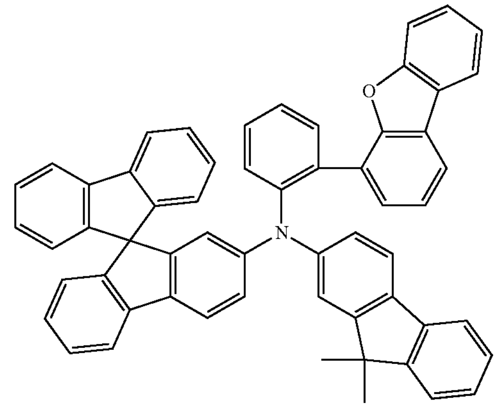
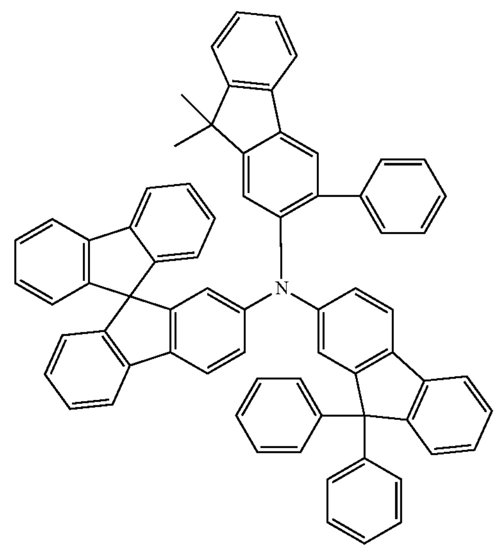
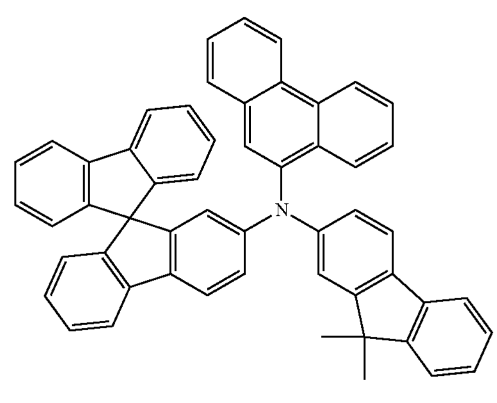

-continued
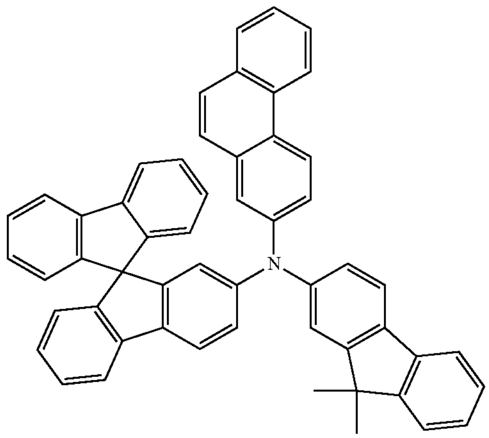
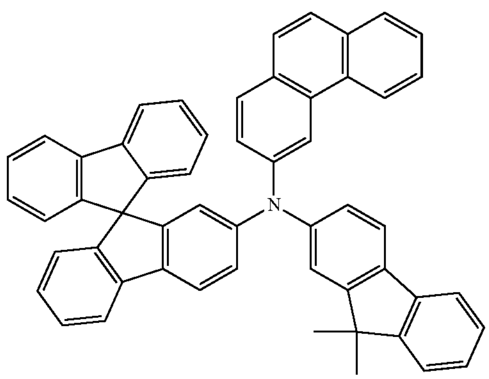
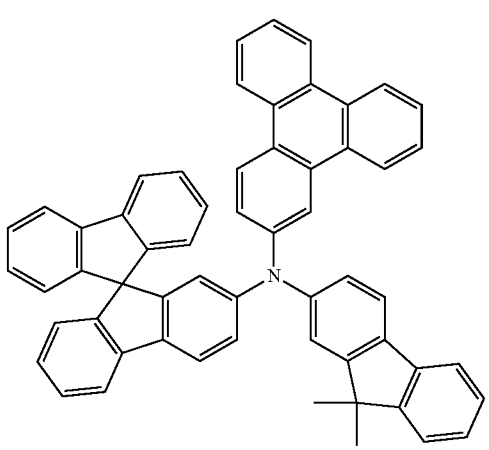
-continued
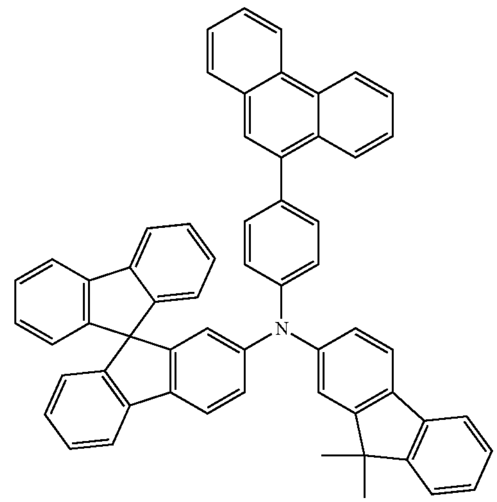
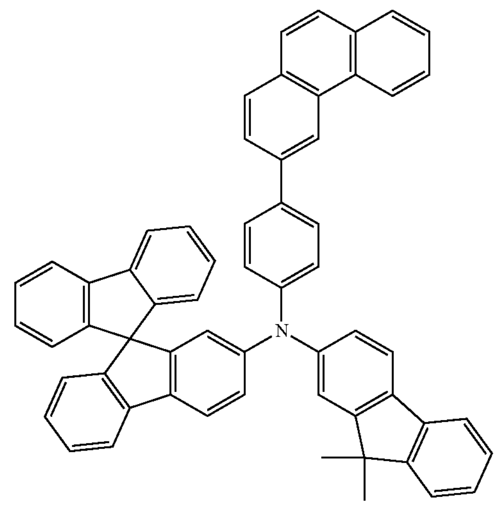
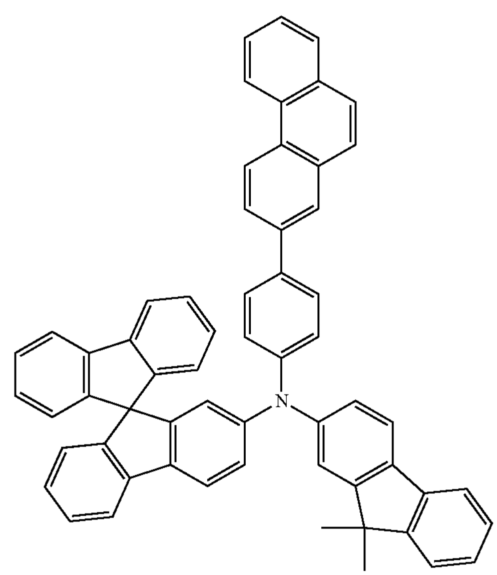

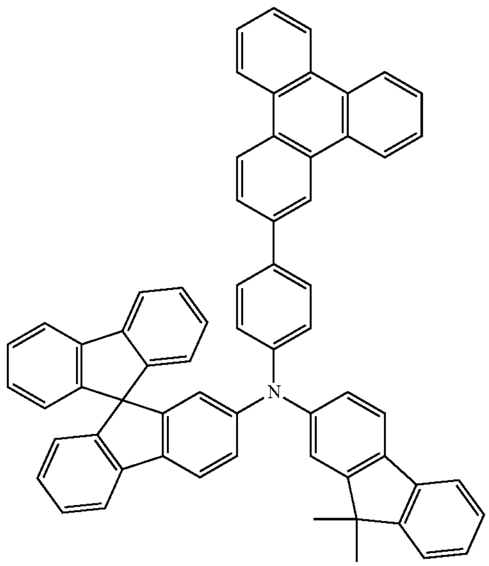
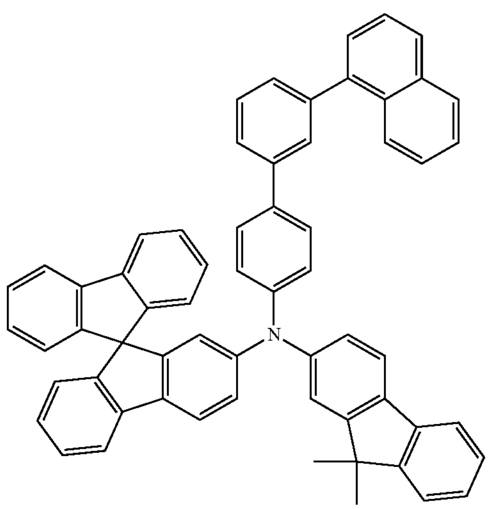
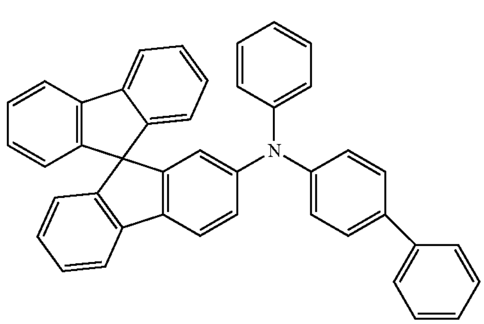
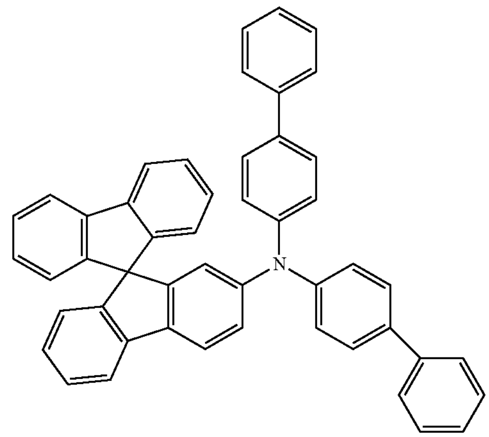
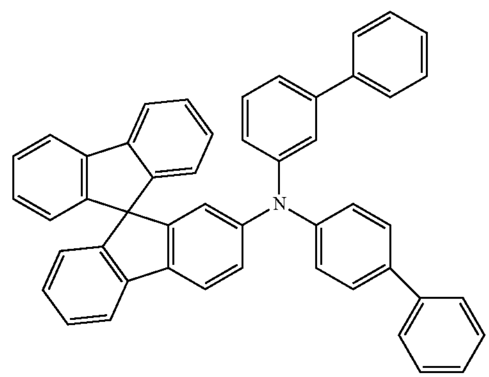
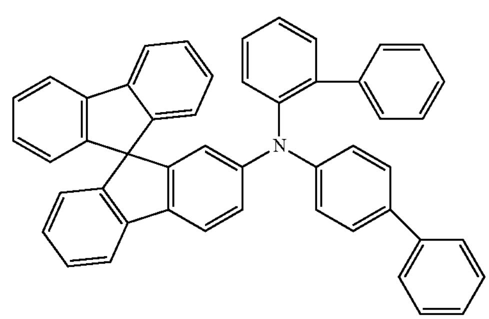
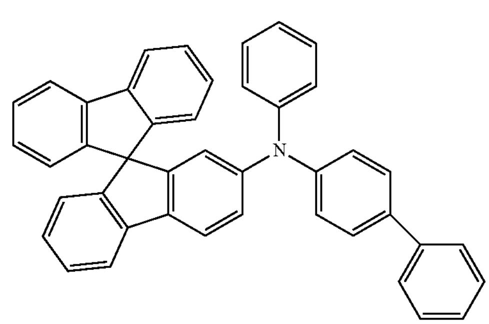

-continued
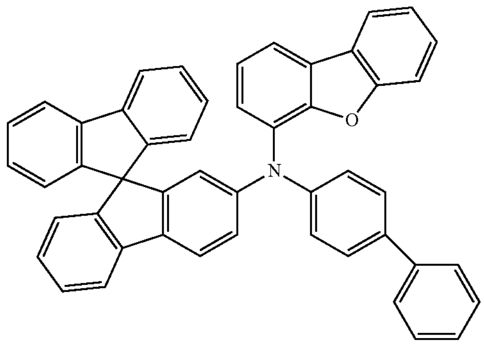
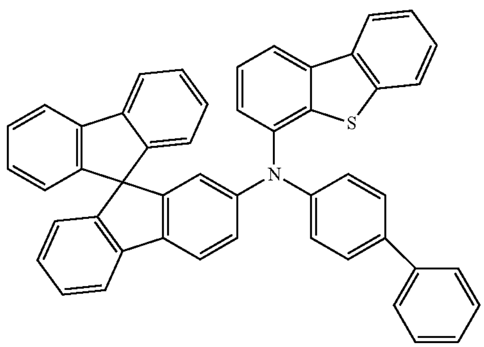
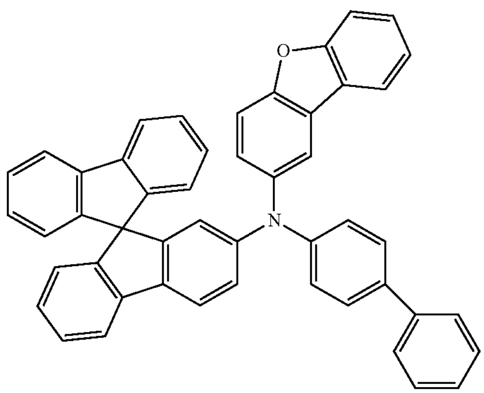
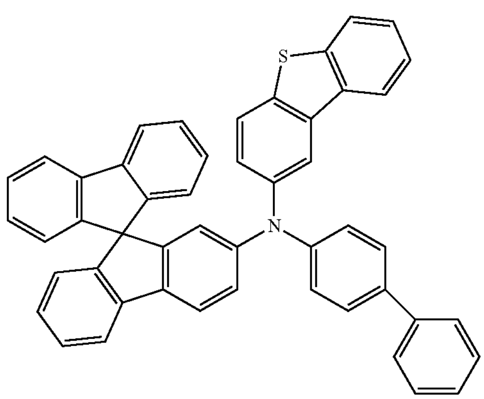
-continued
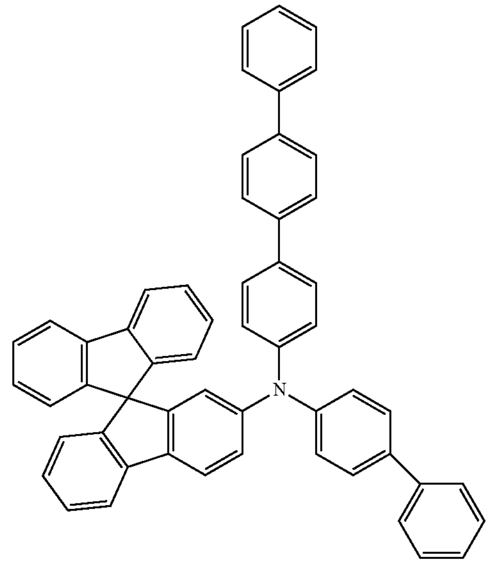
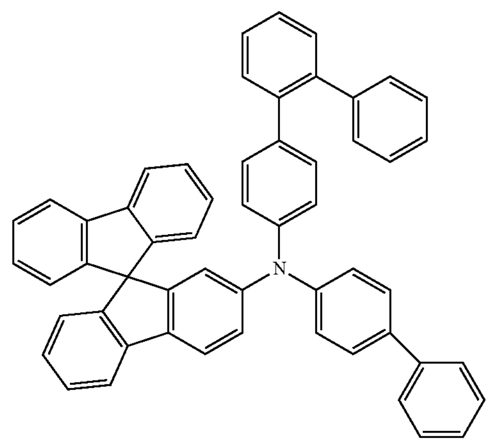
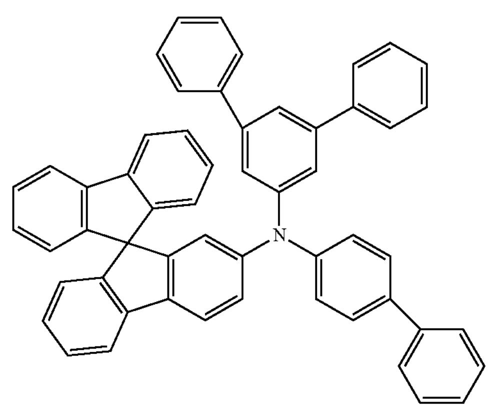

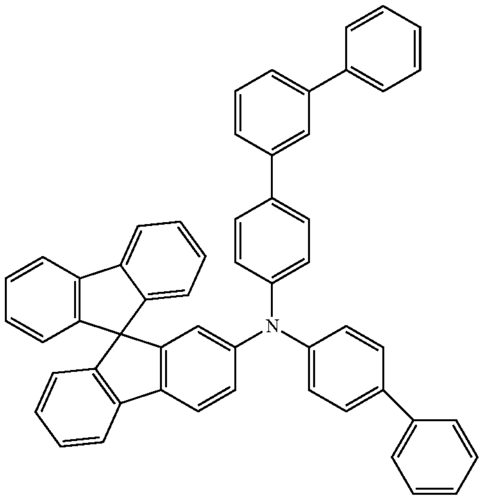
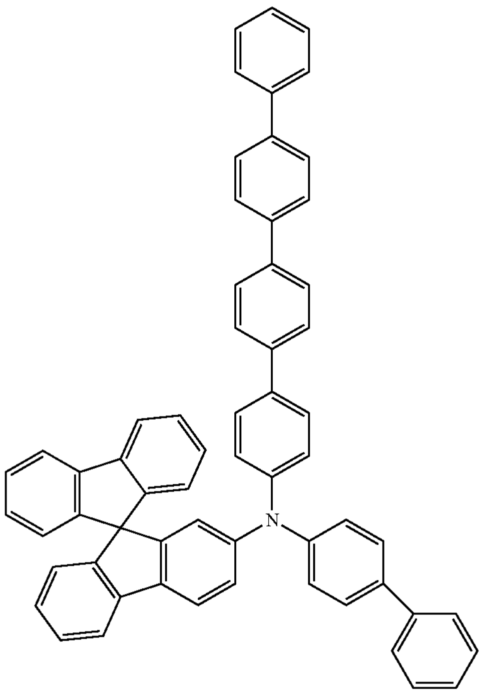
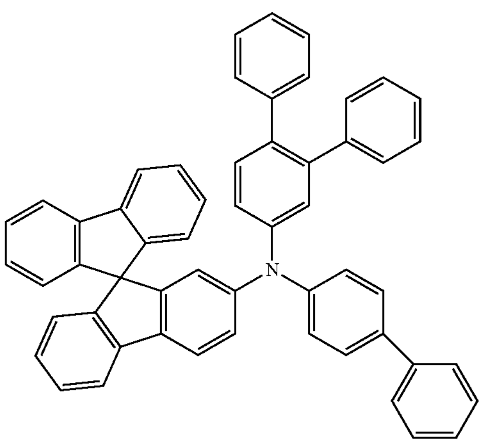
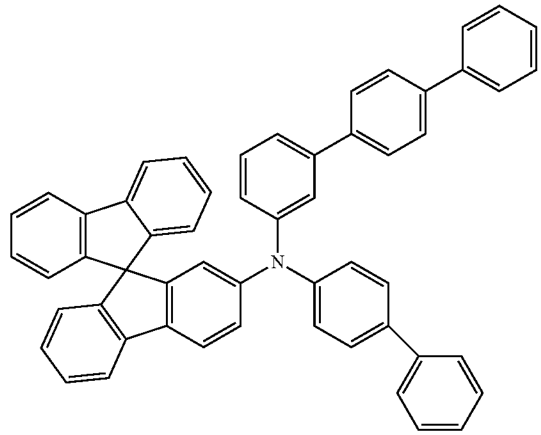
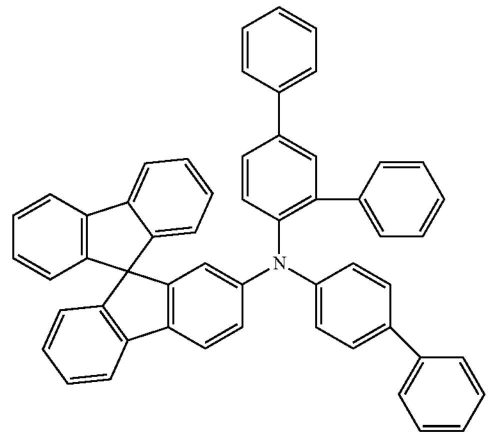
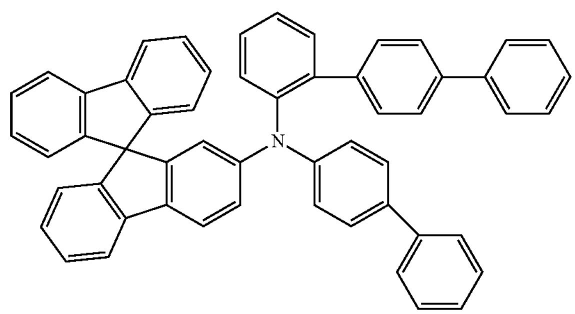
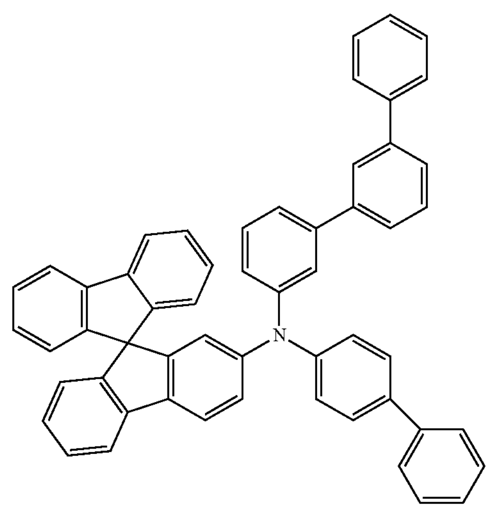

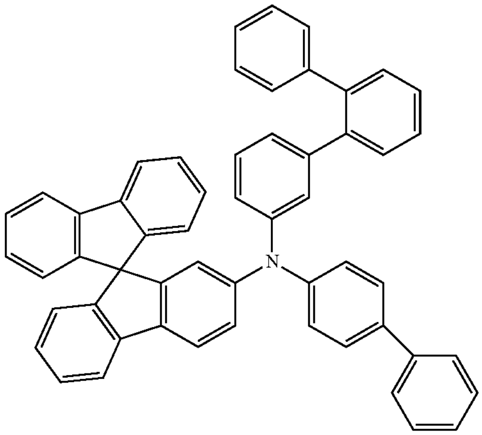
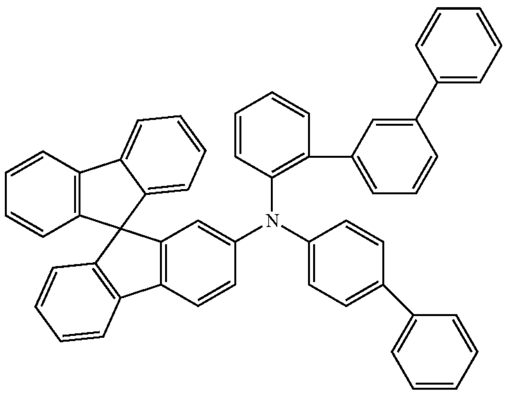
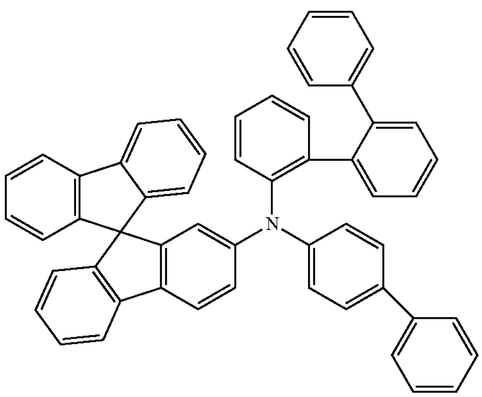
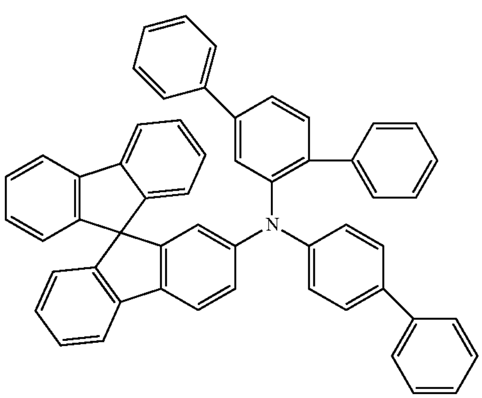
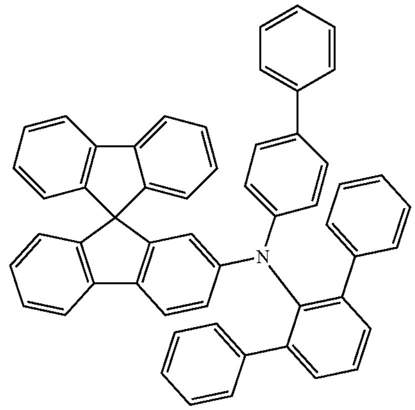
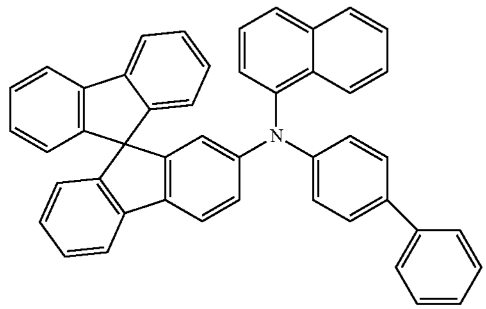
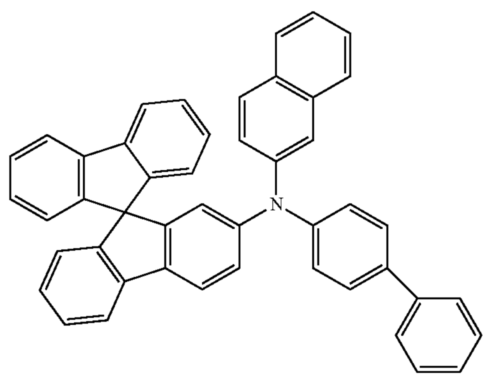
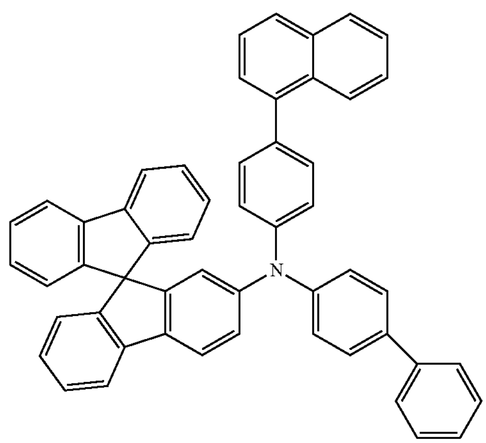
N -continued
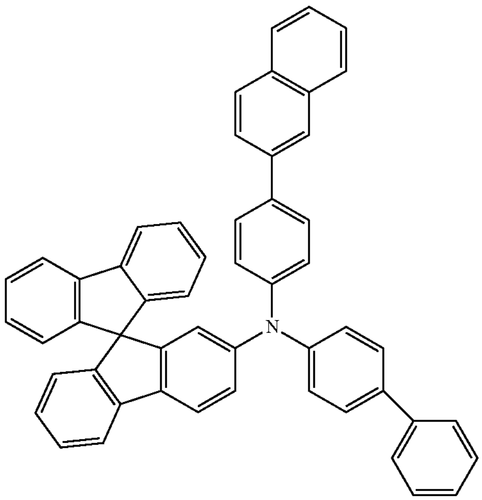
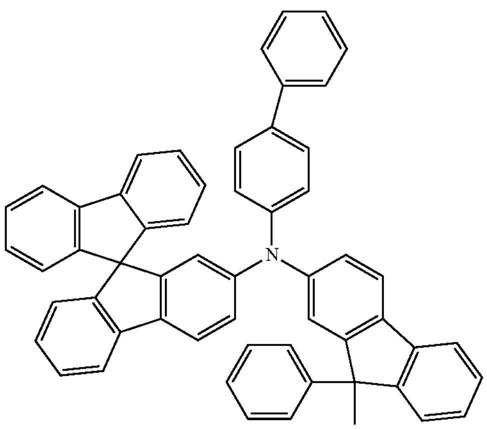
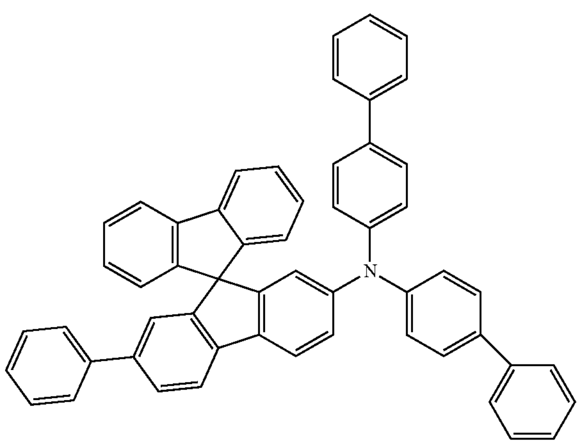
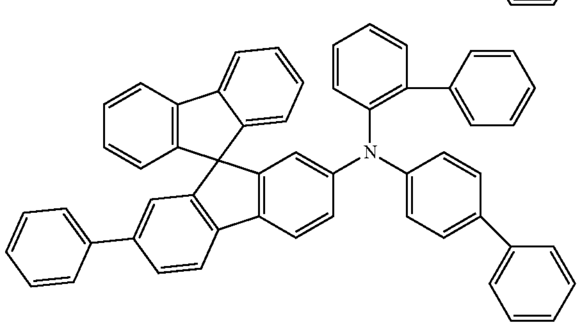
-continued
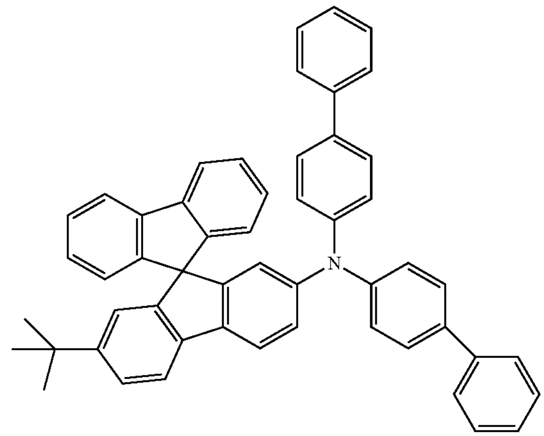
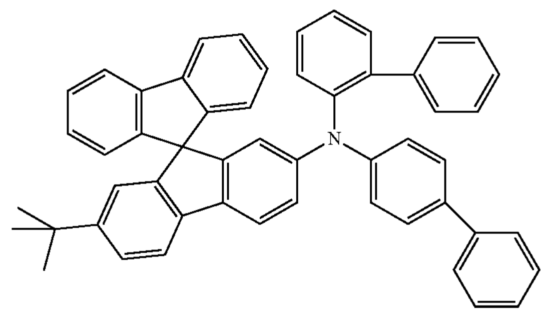
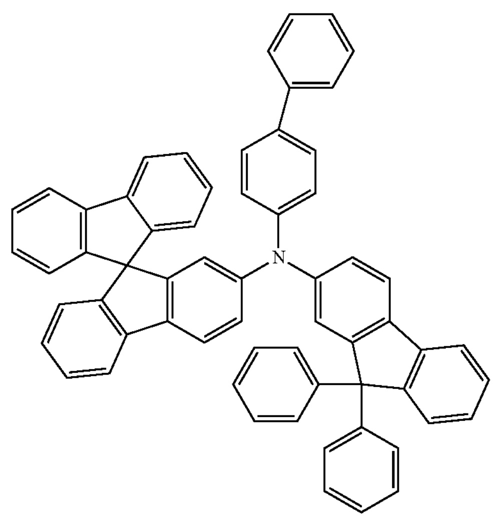
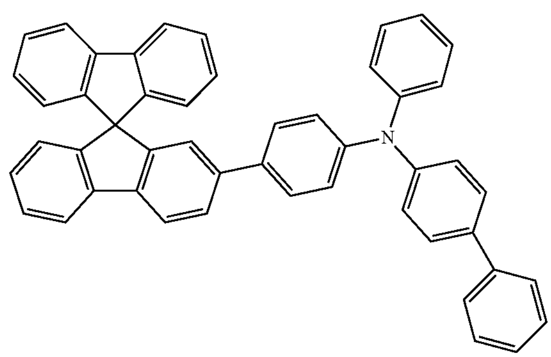

-continued
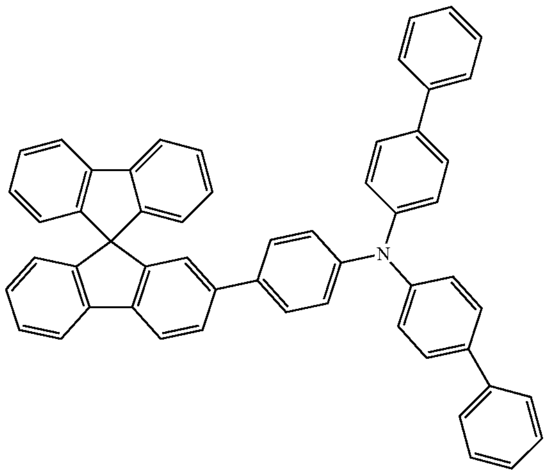
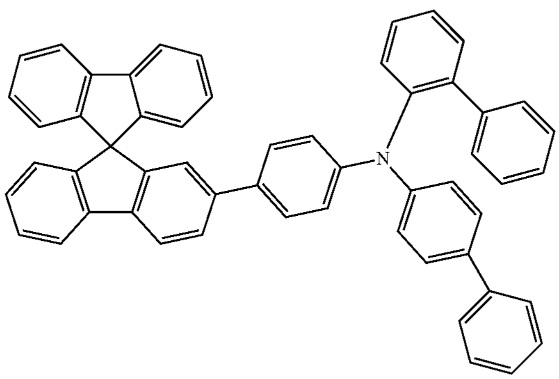
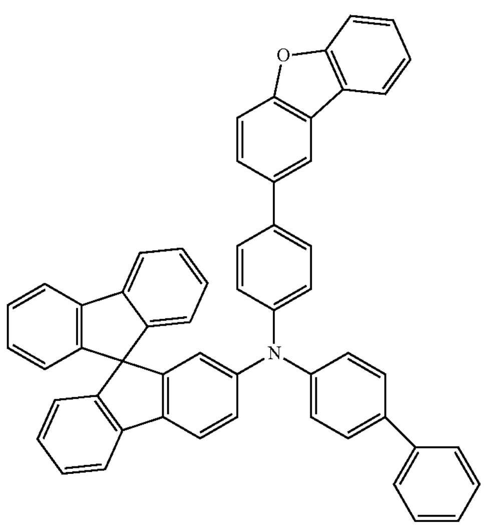
-continued
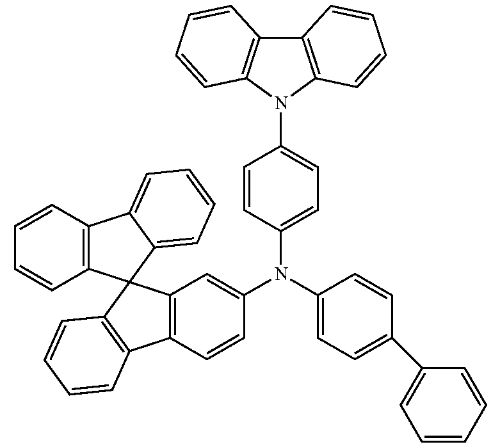
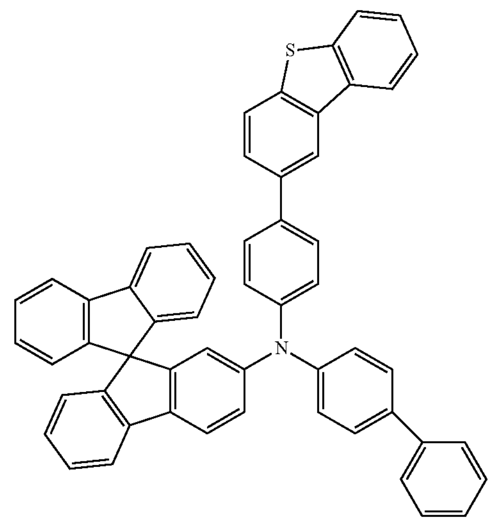
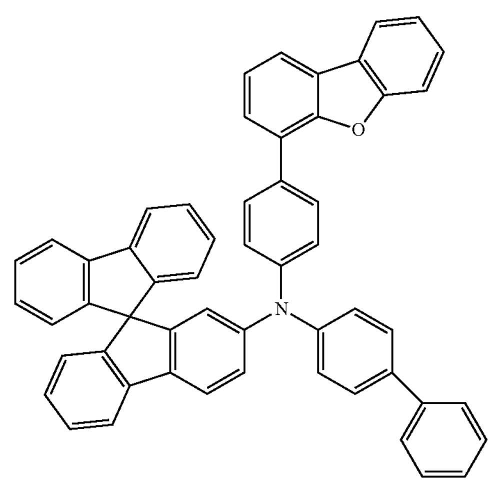

-continued
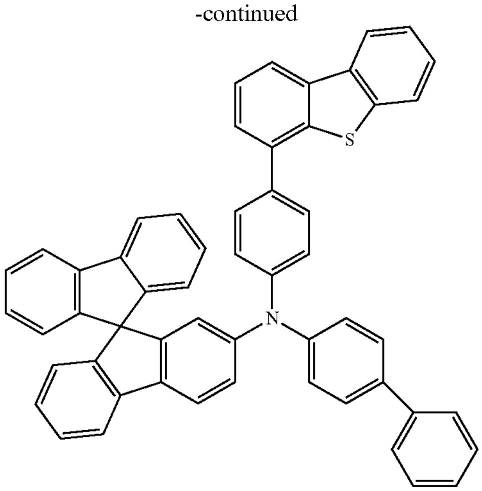
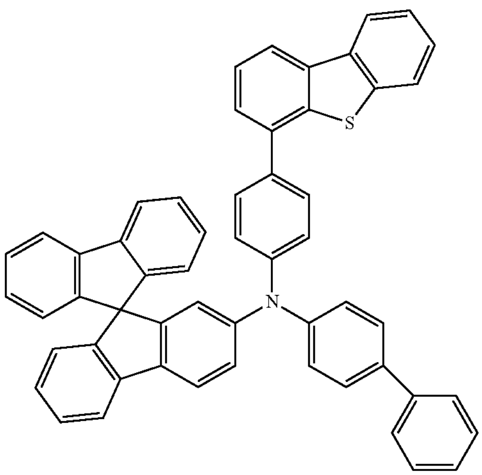
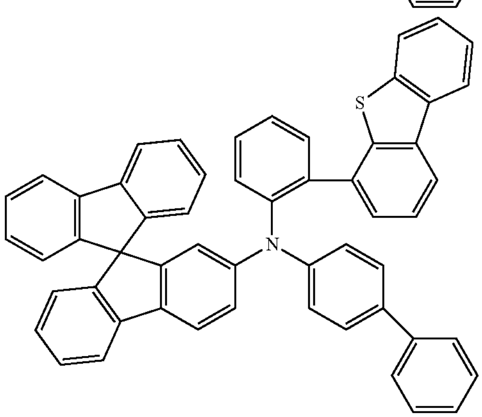
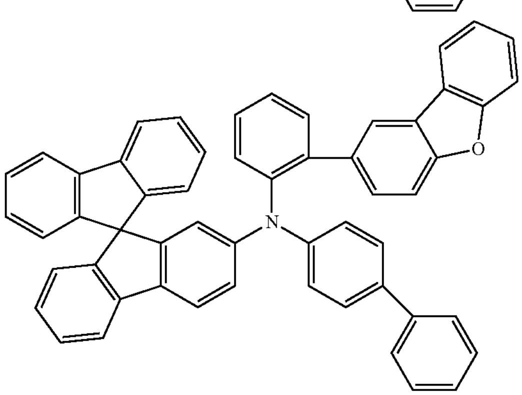
-continued
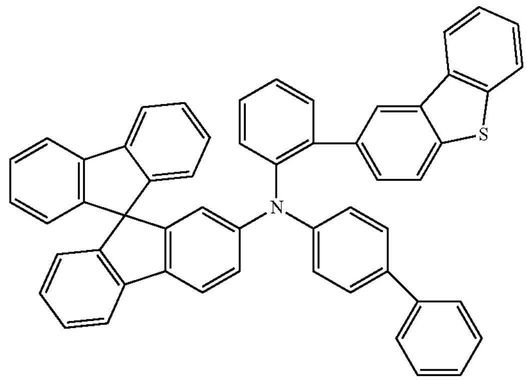
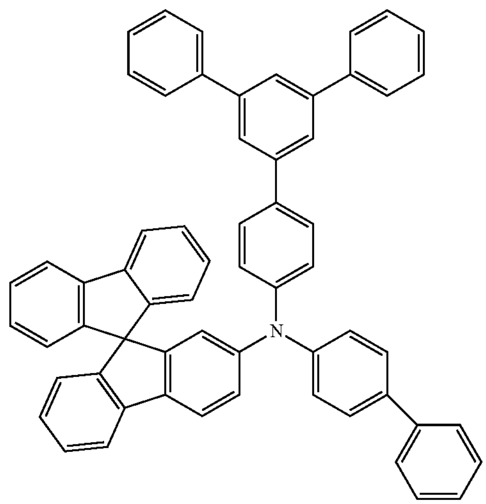
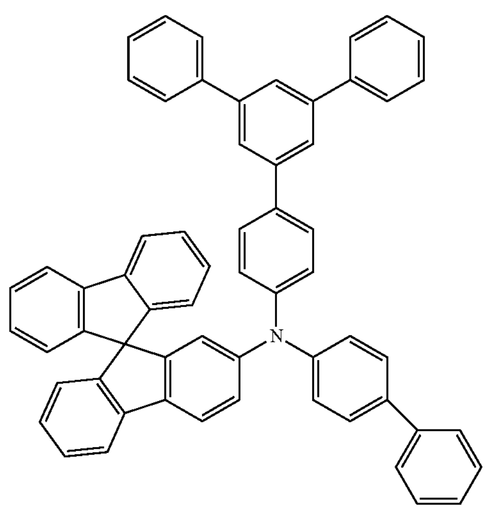

-continued
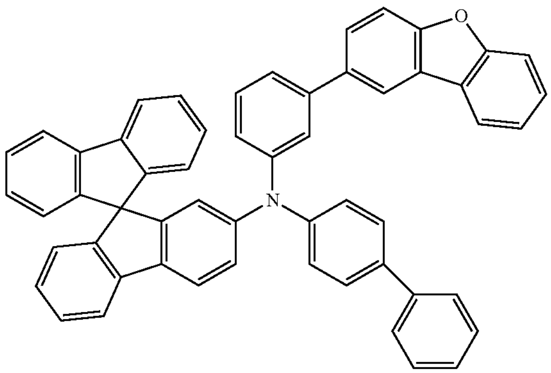
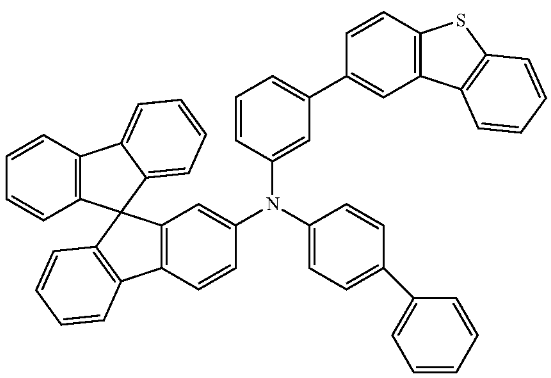
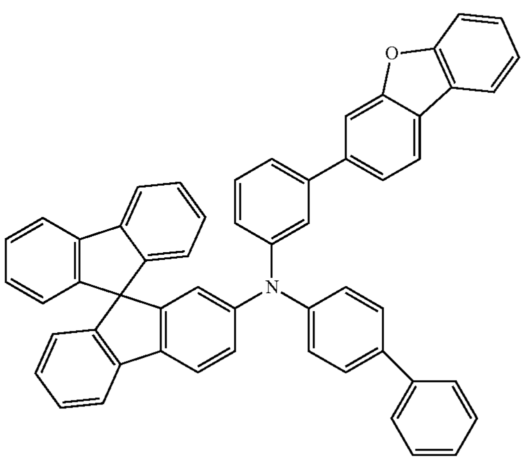
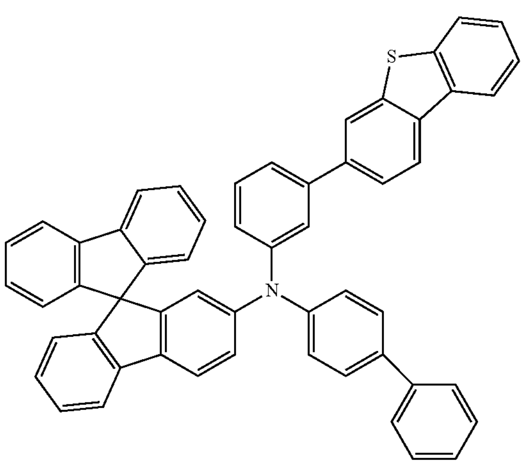
-continued
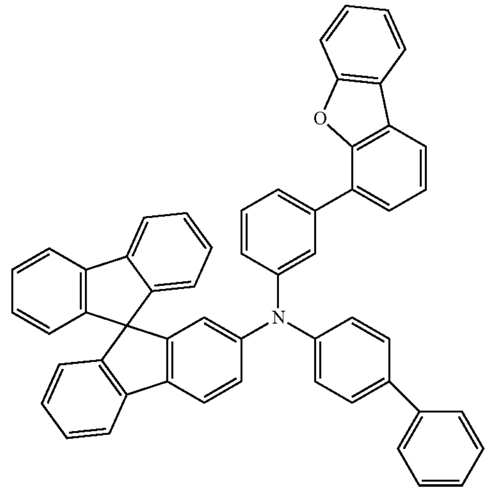
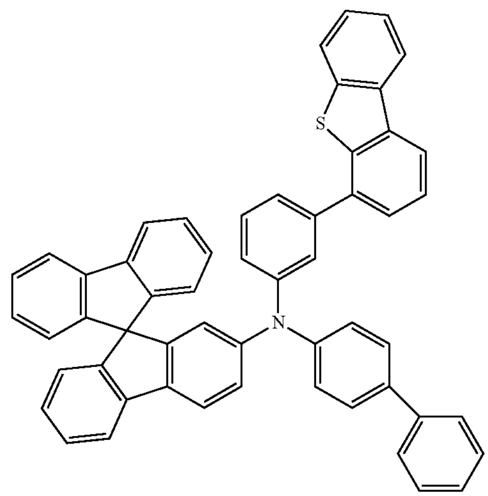
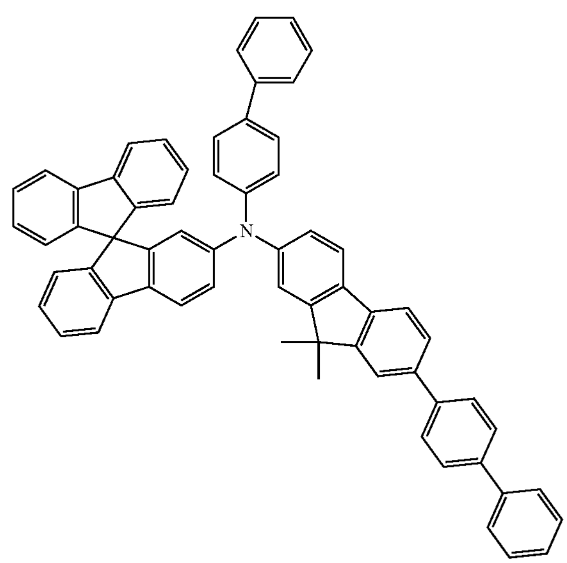

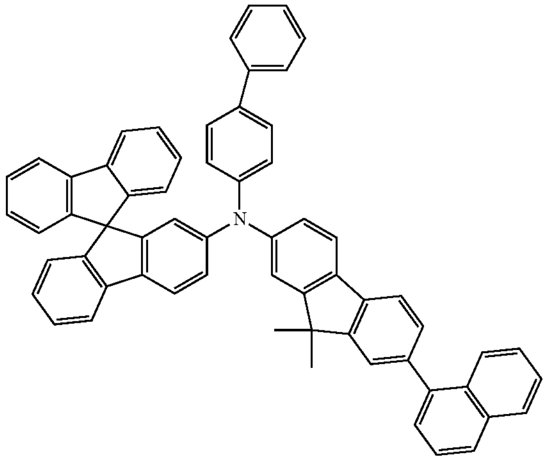
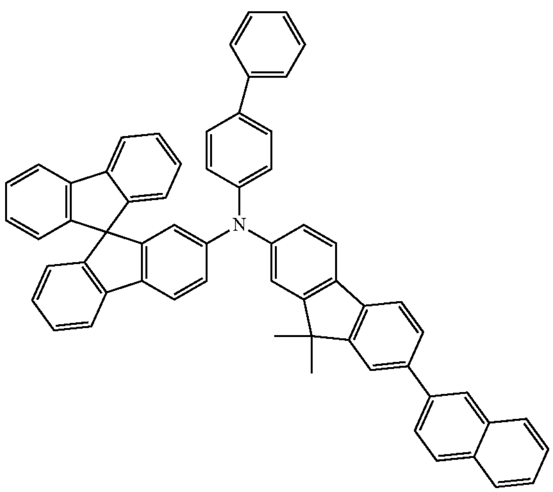
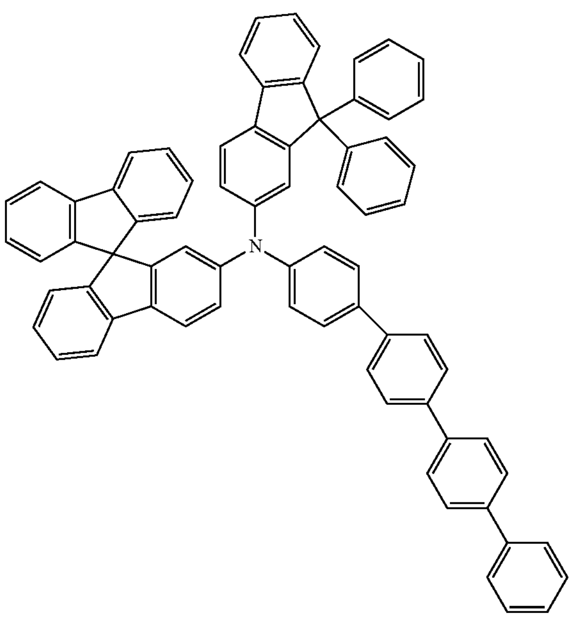
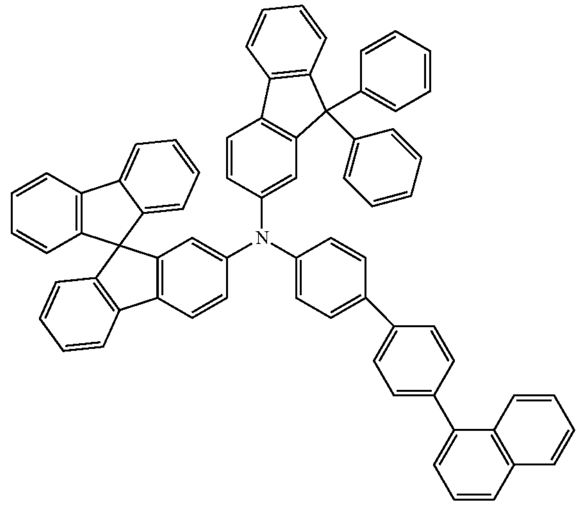
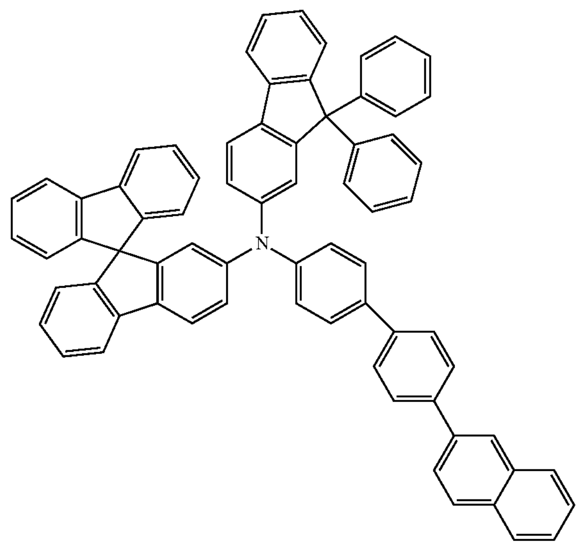
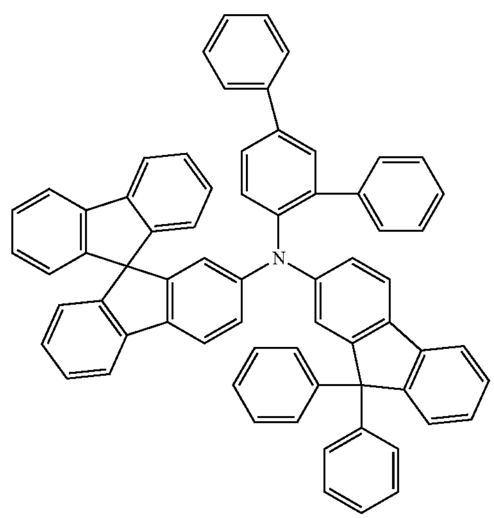

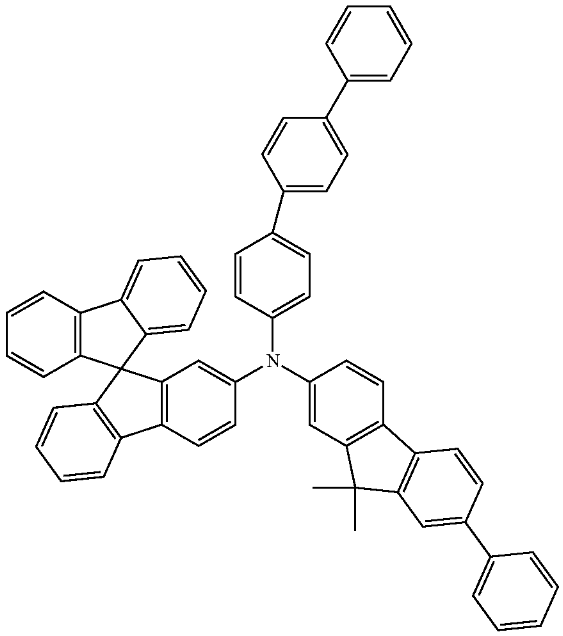
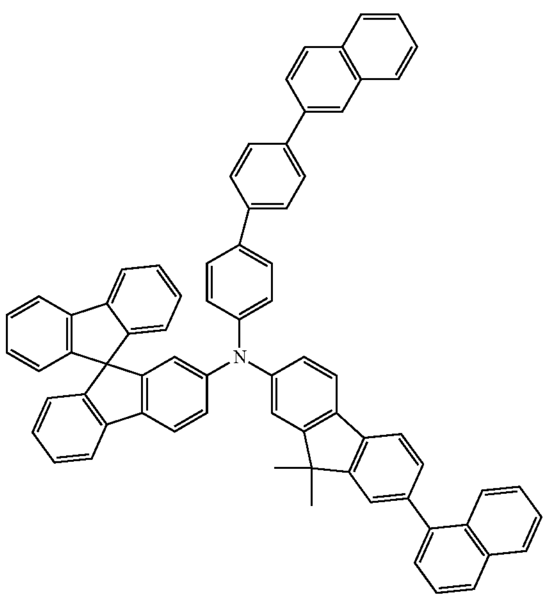
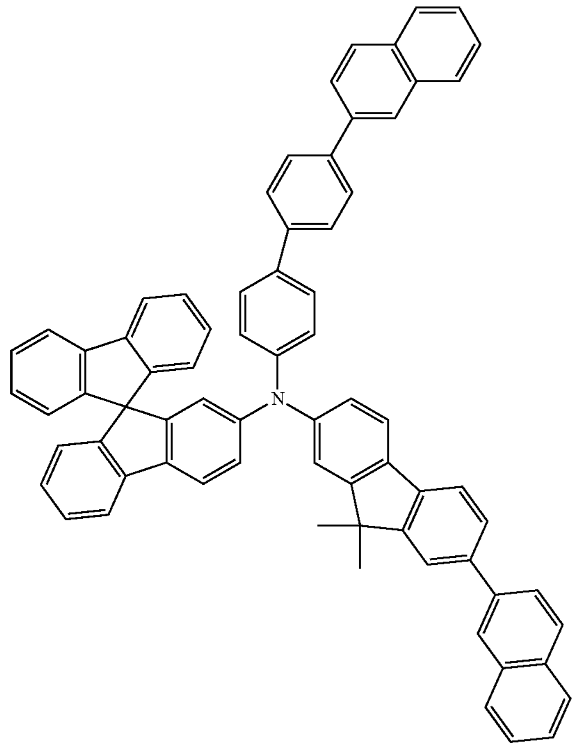
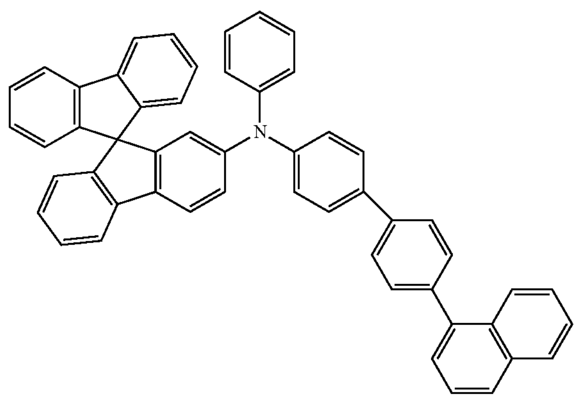
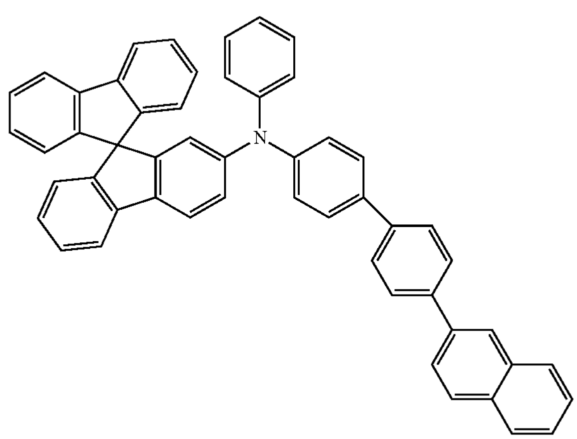

-continued
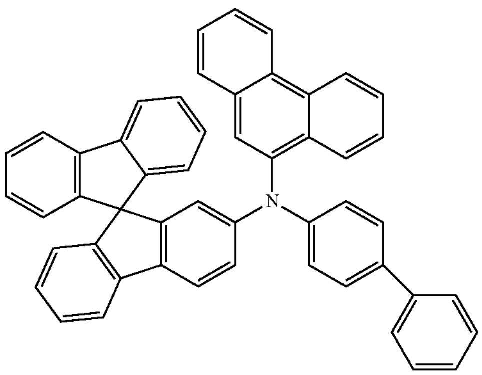
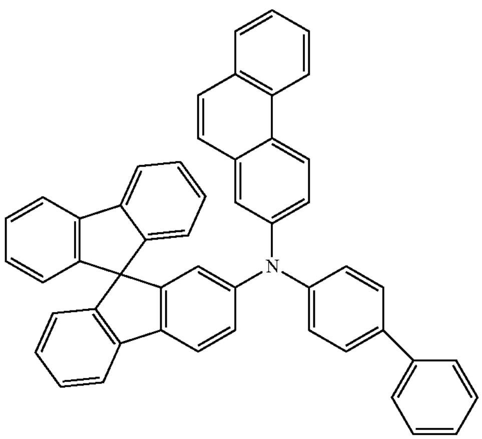
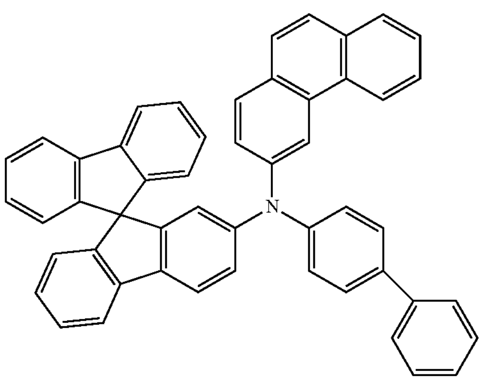
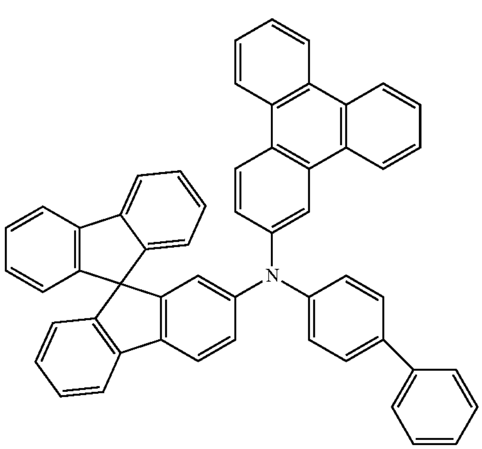
-continued
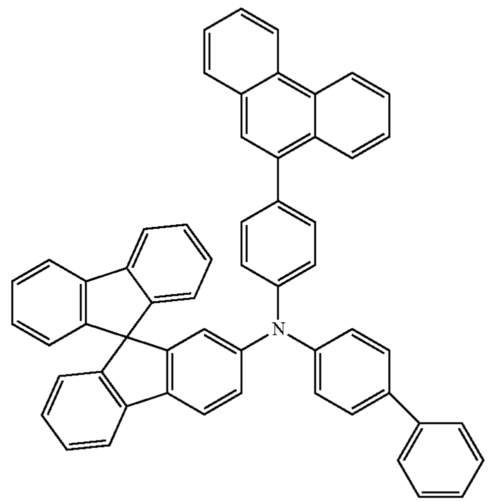
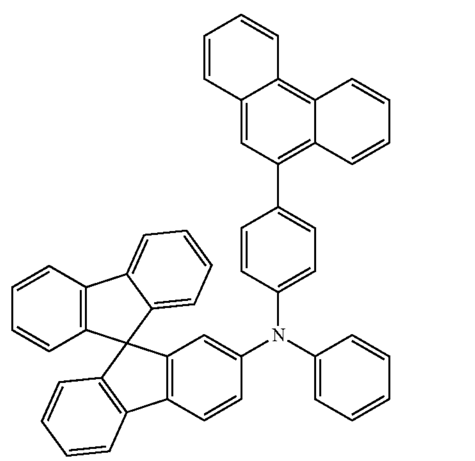
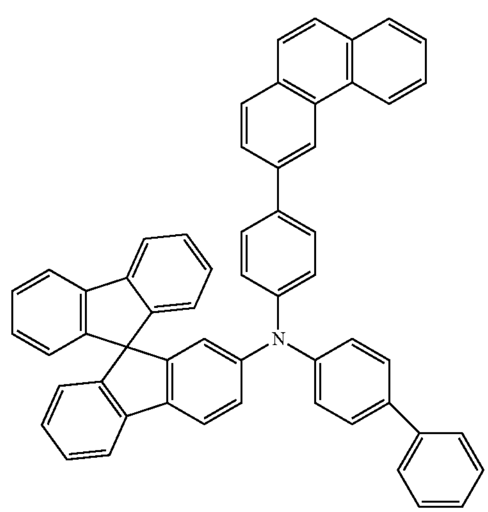

-continued
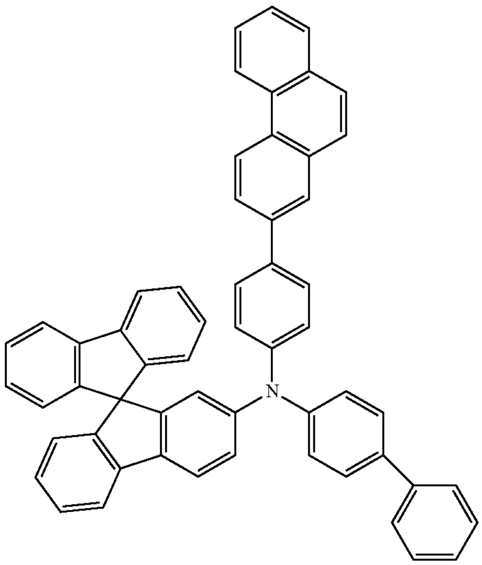
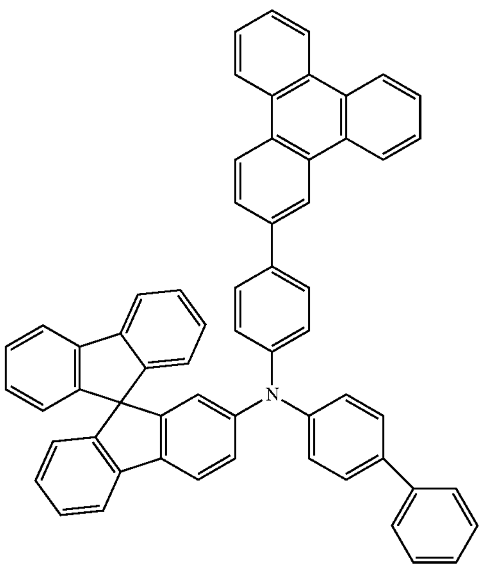
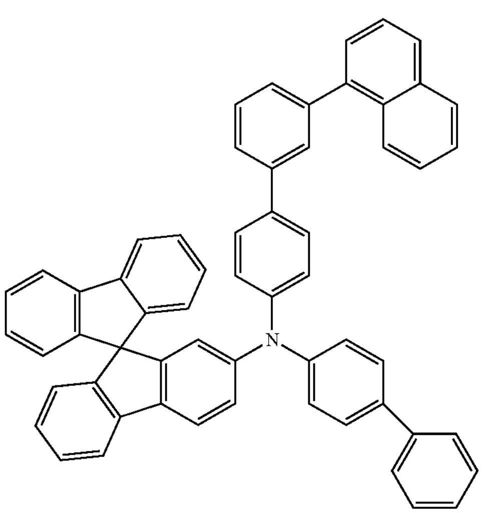
-continued
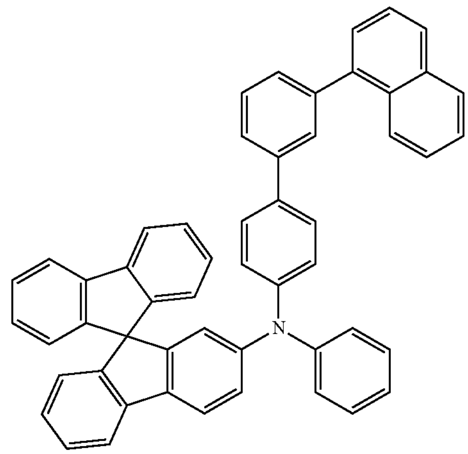
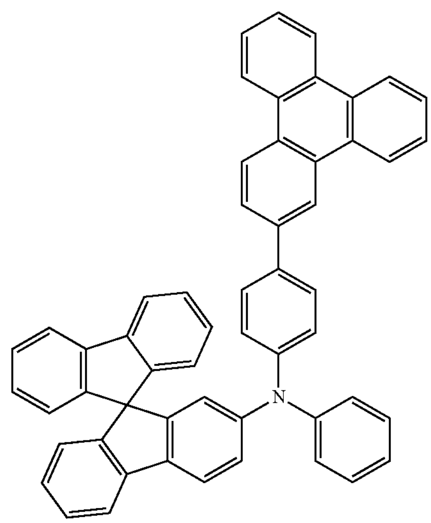
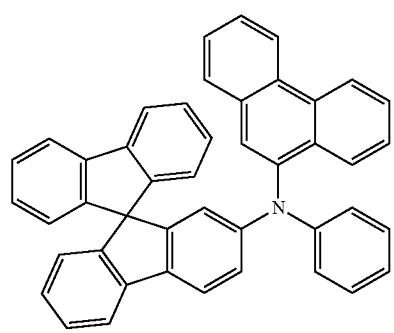
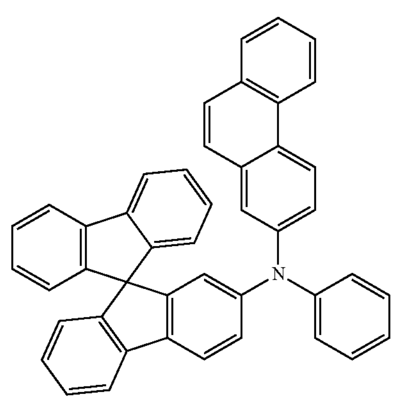

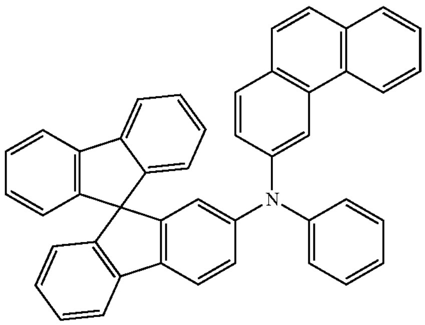
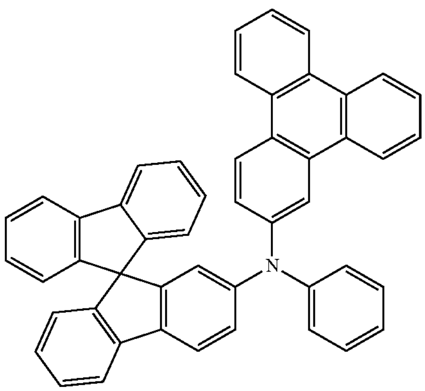
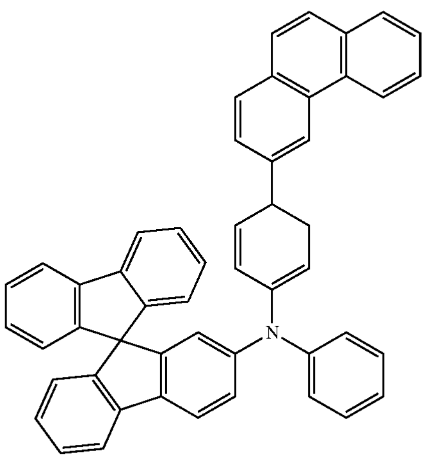
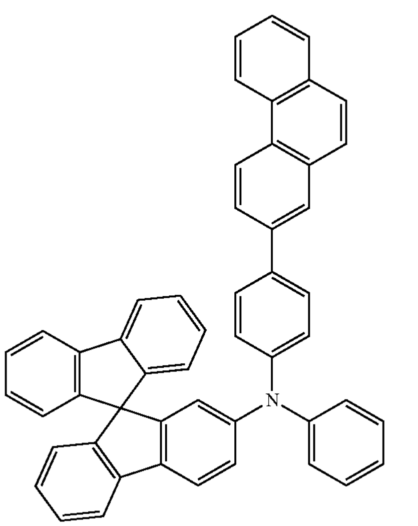
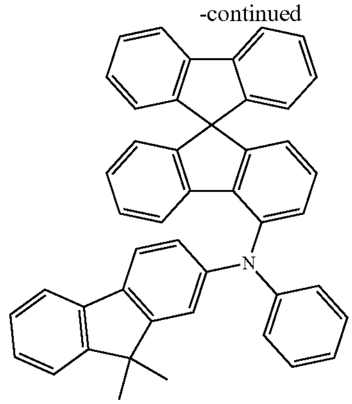
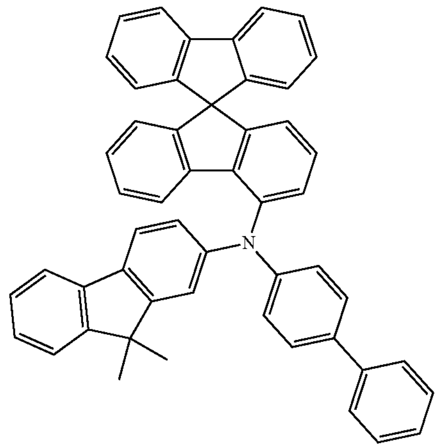
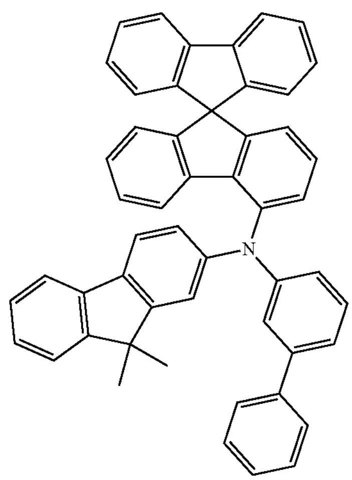
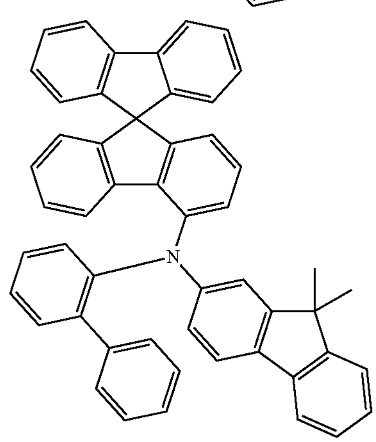
N
N
N
N
N
N
N
N -continued
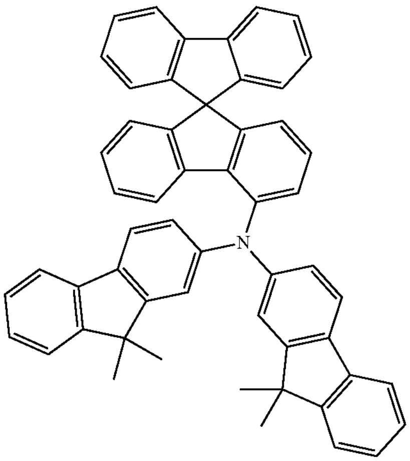
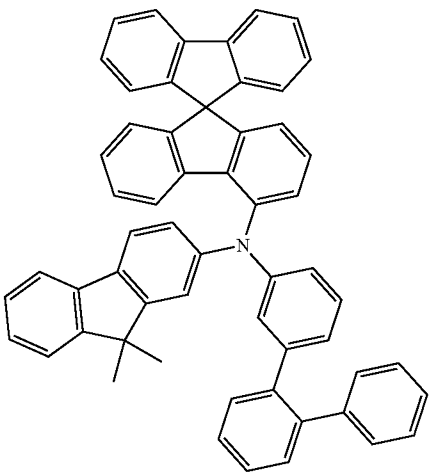
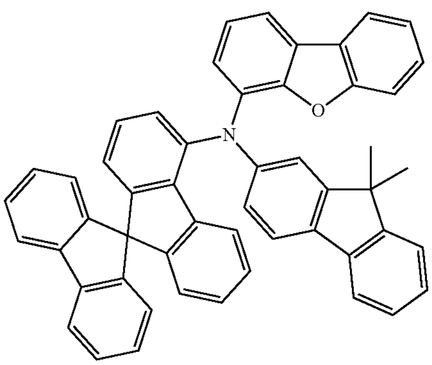
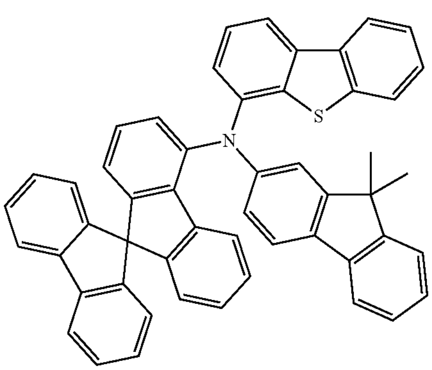
-continued
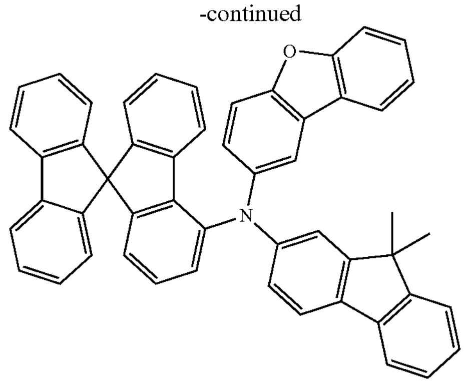
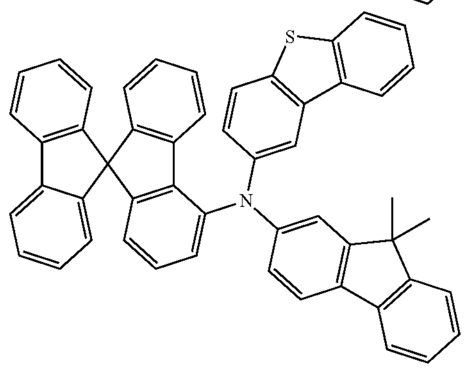
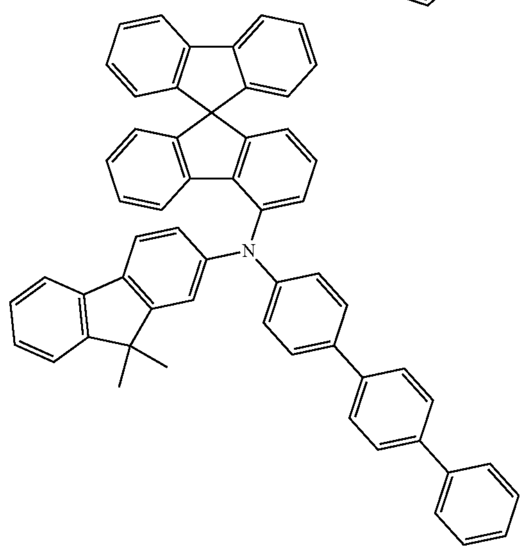
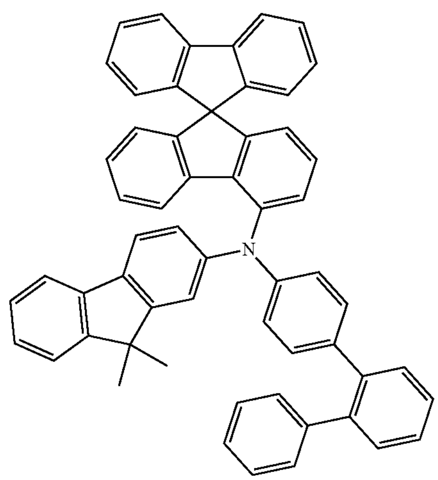

-continued
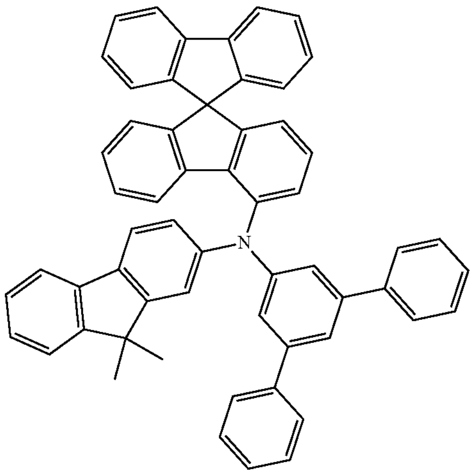
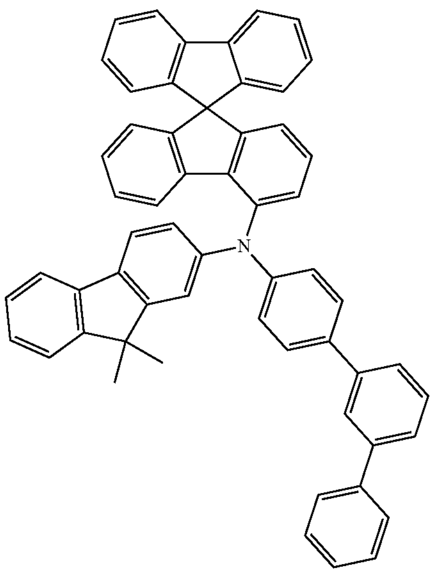
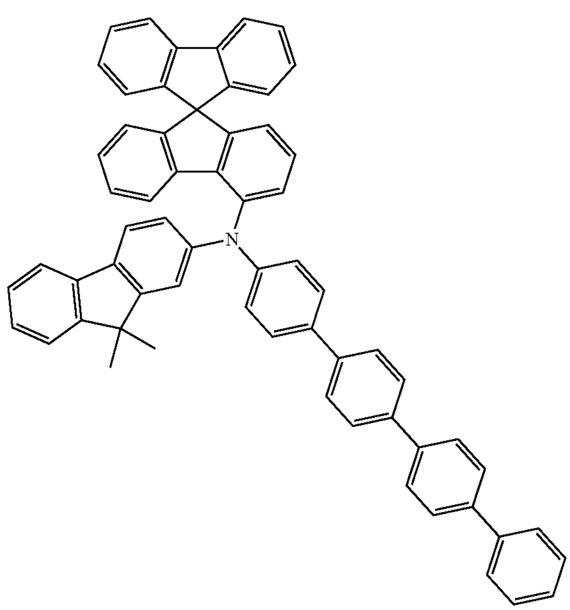
-continued
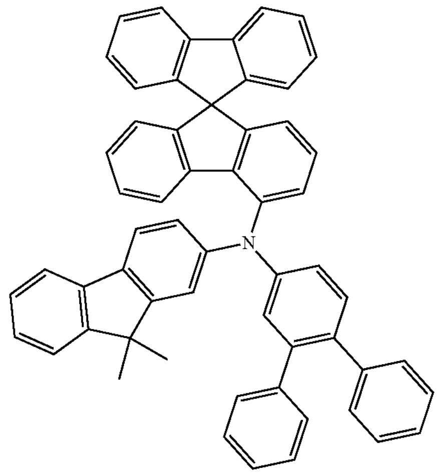
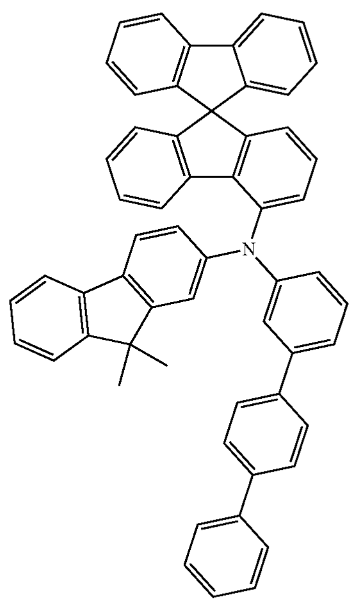
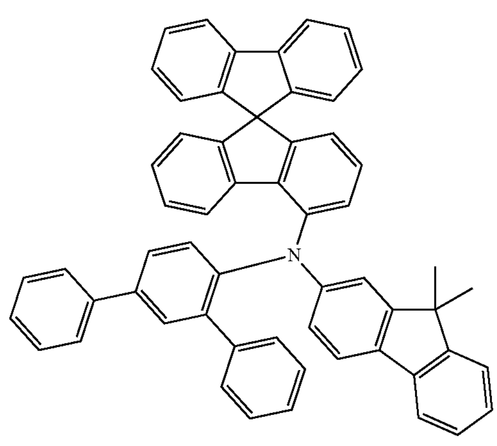

-continued
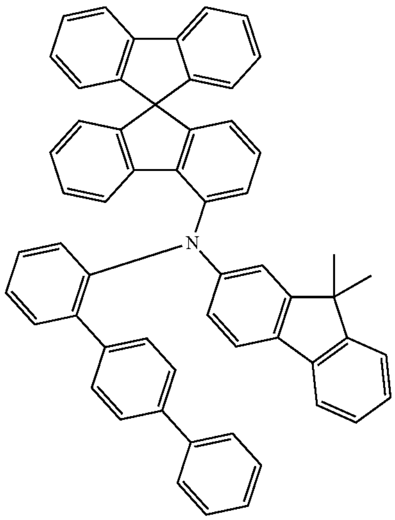
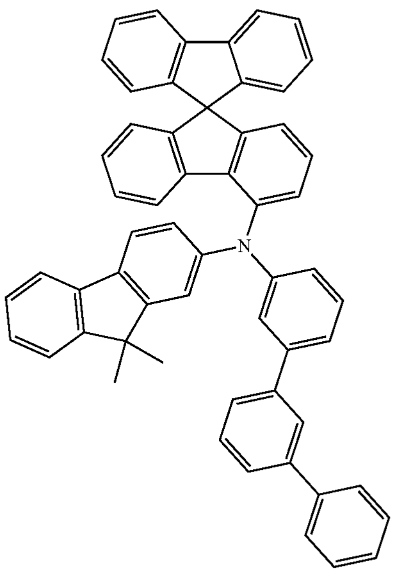
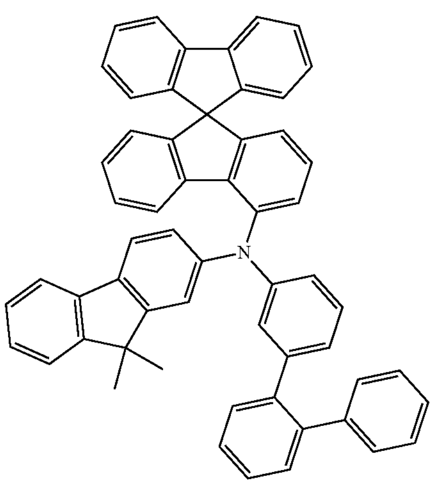
-continued
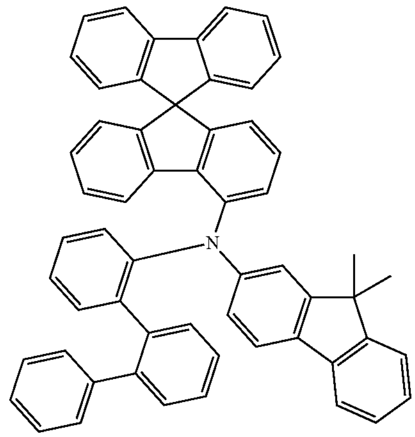
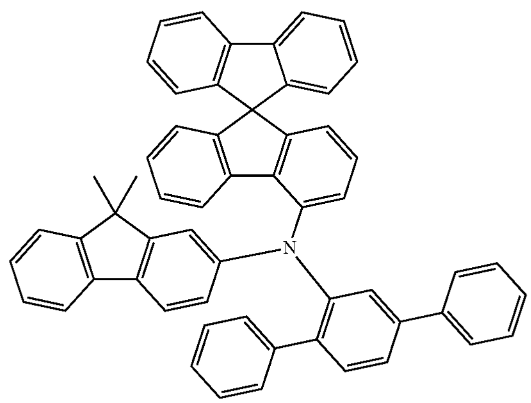
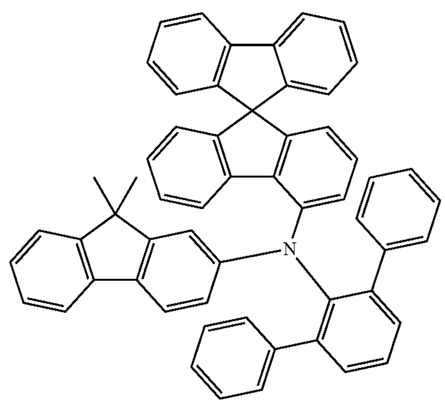
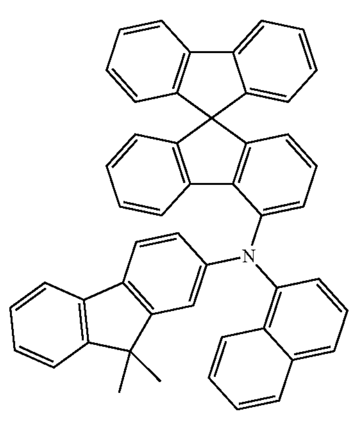

-continued
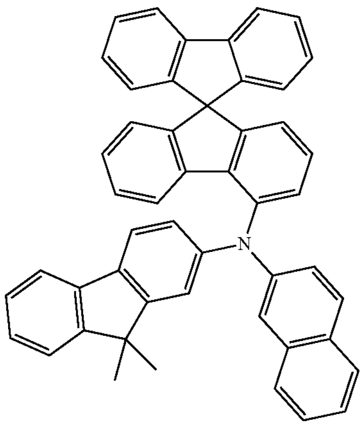
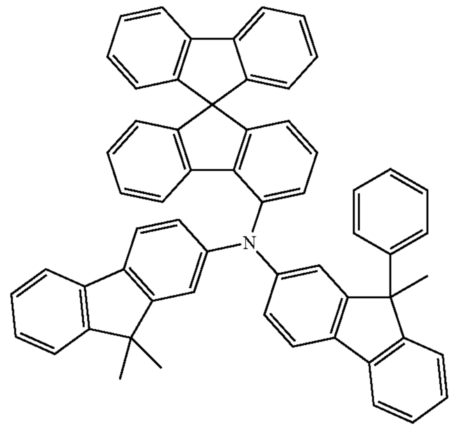
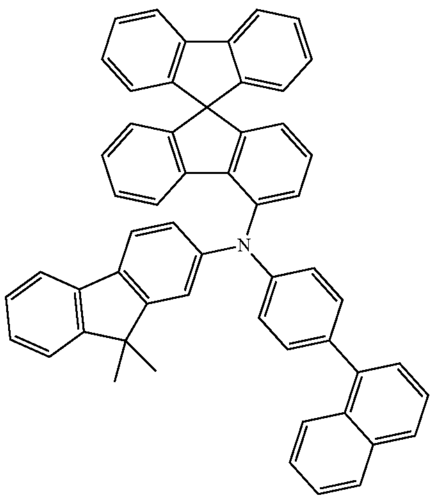
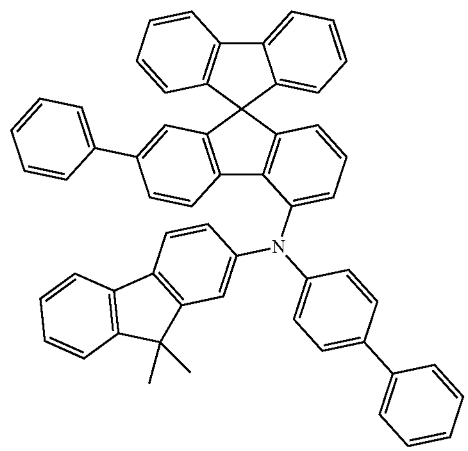
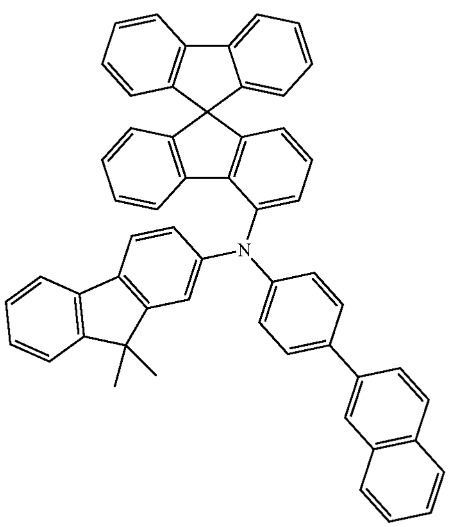
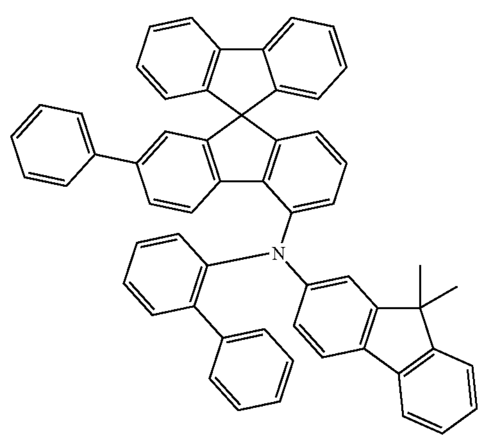
-continued -continued
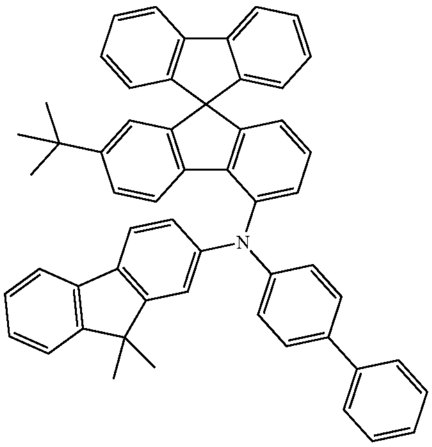
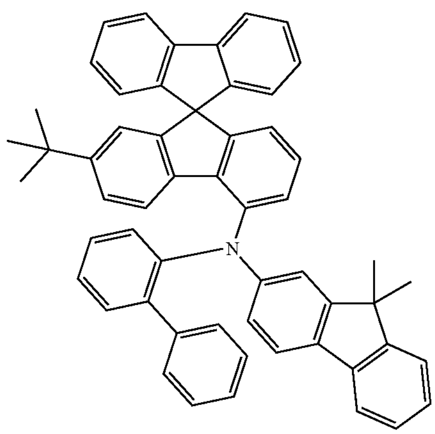
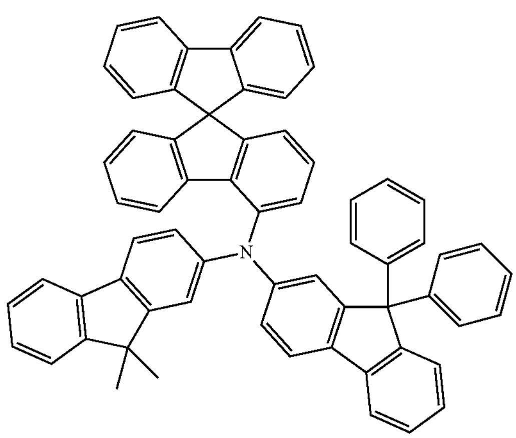
-continued
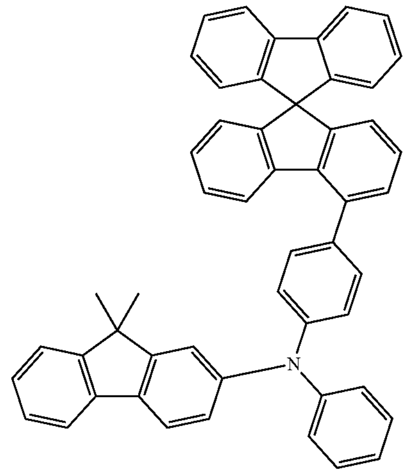
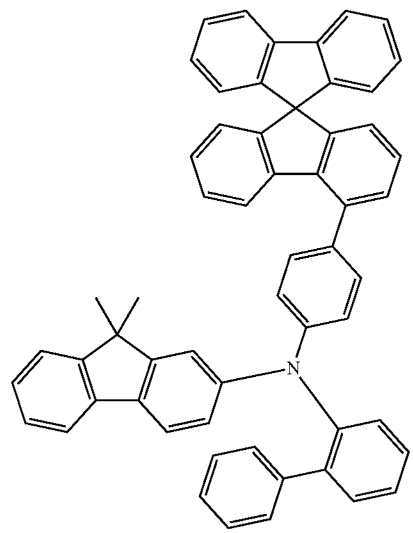
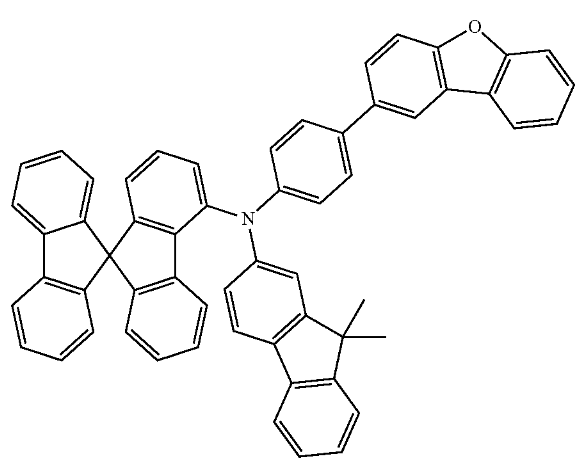

-continued
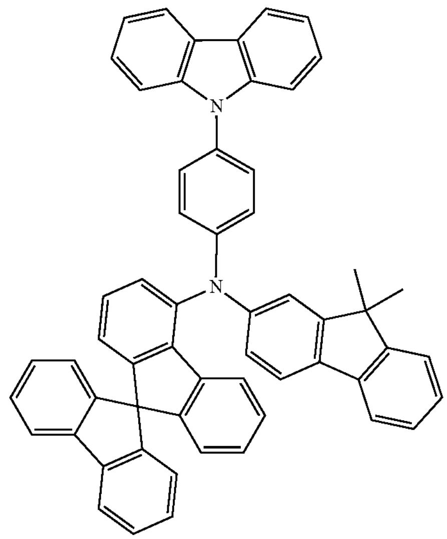
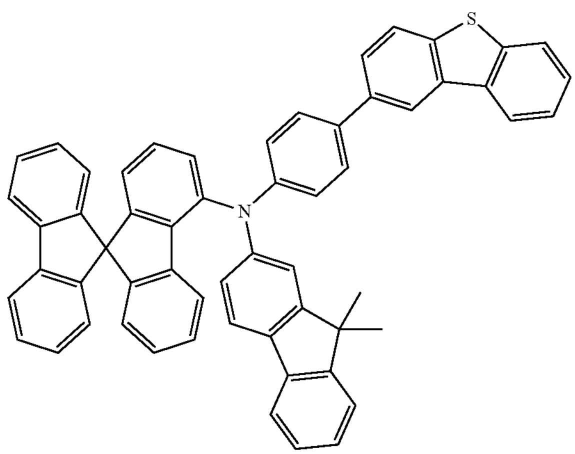
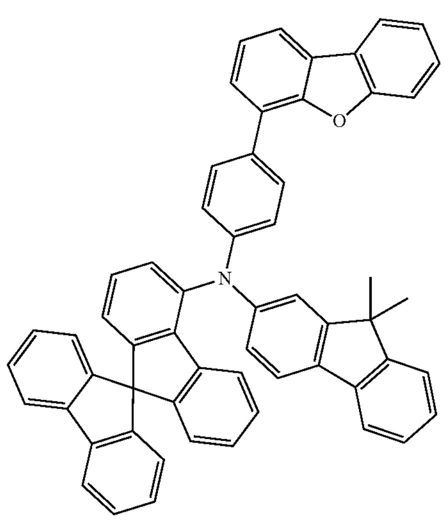
-continued
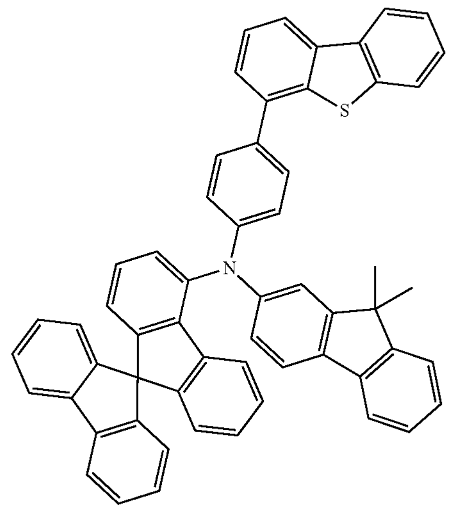
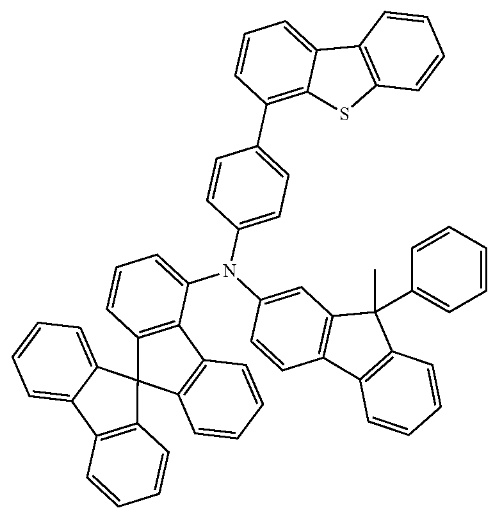
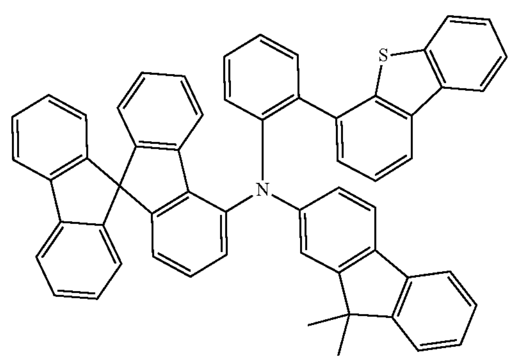
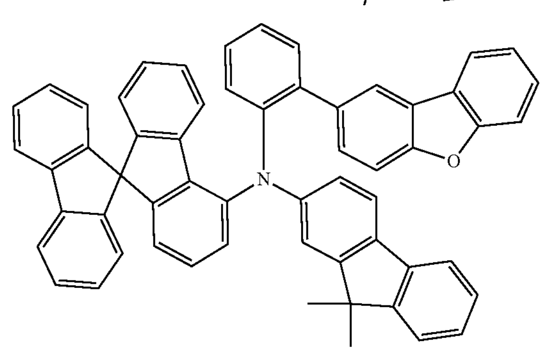

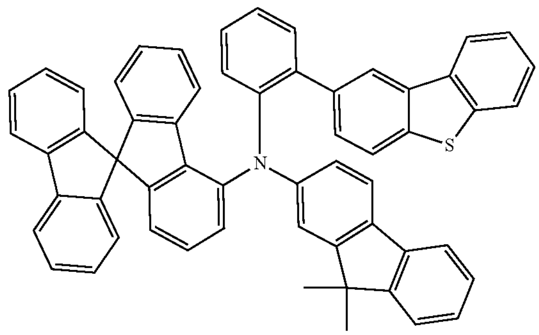
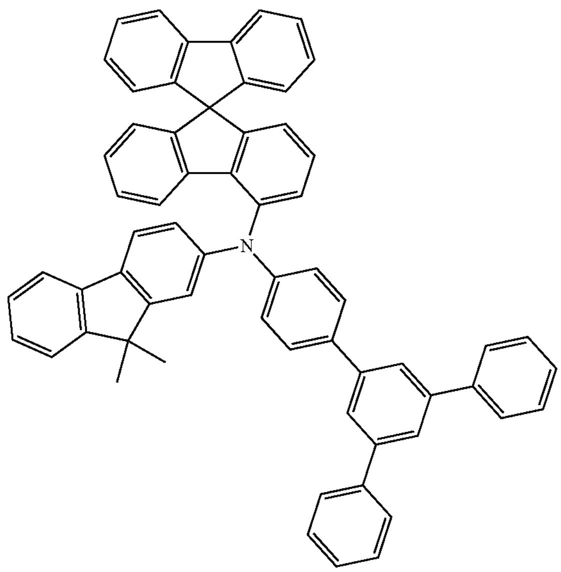
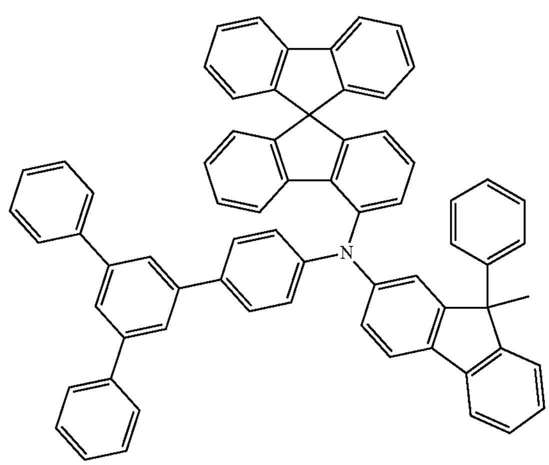
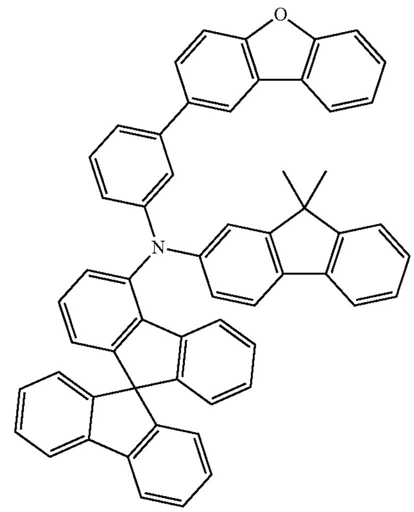
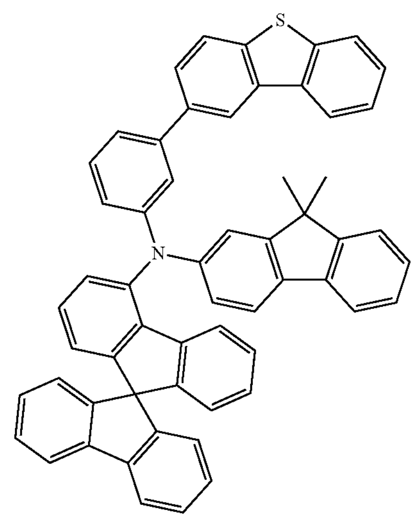
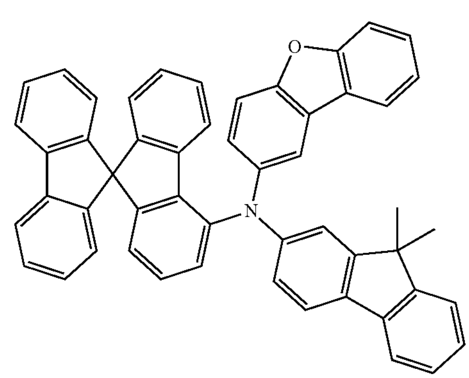

-continued
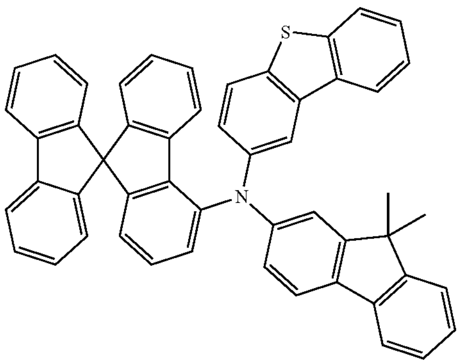
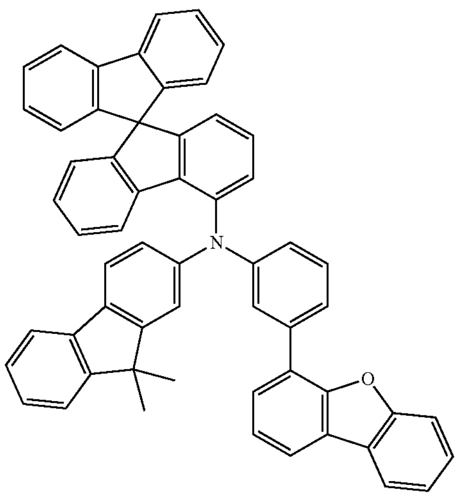
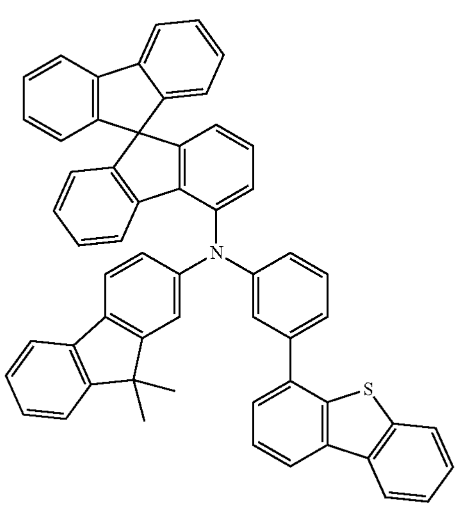
-continued
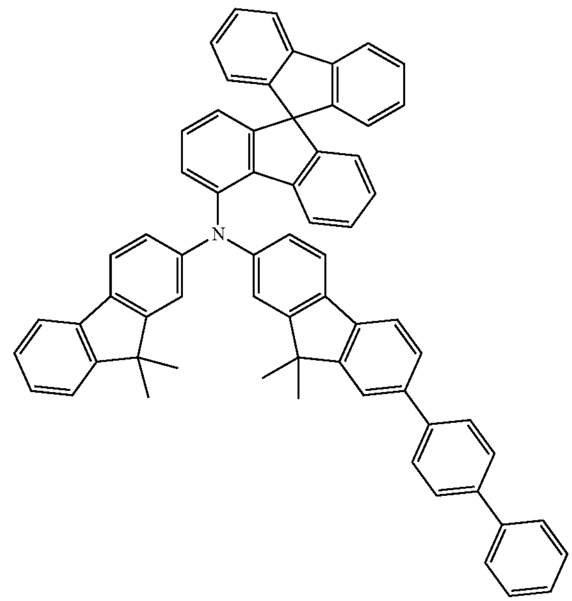
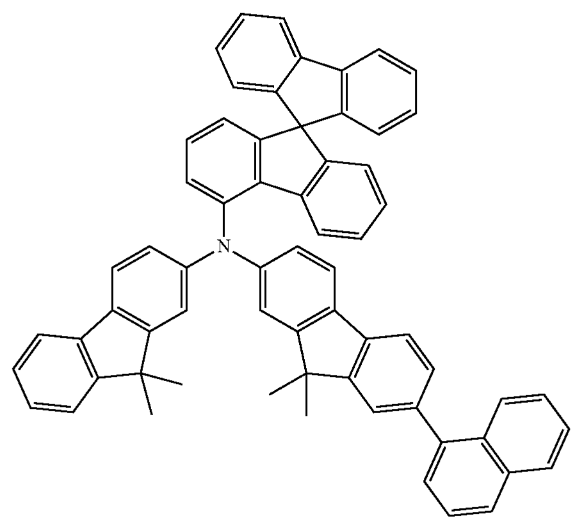
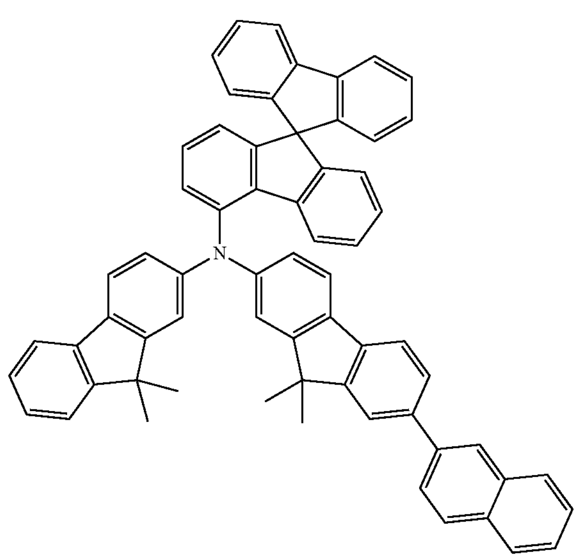

-continued
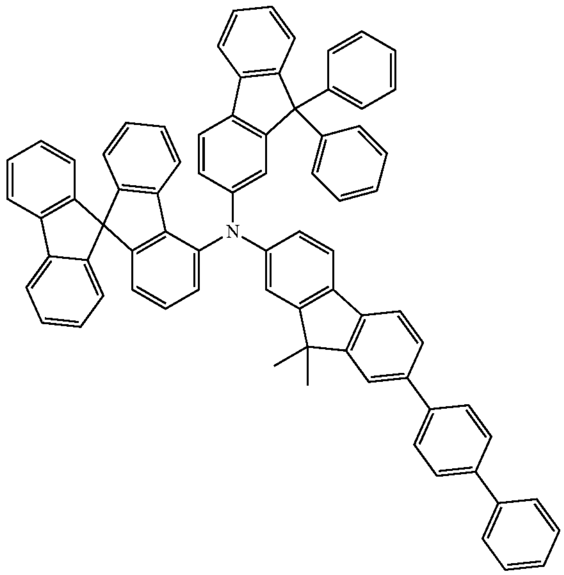
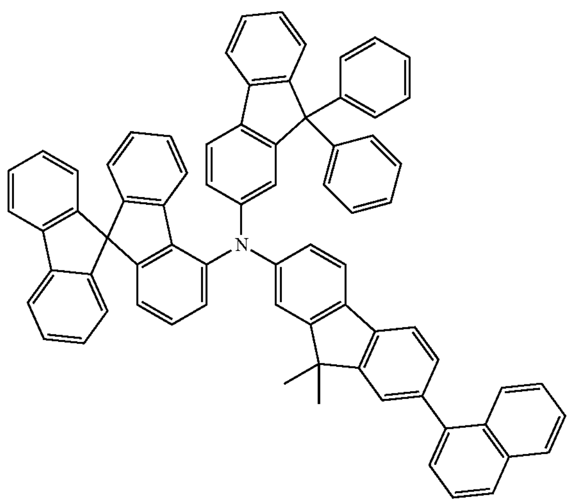
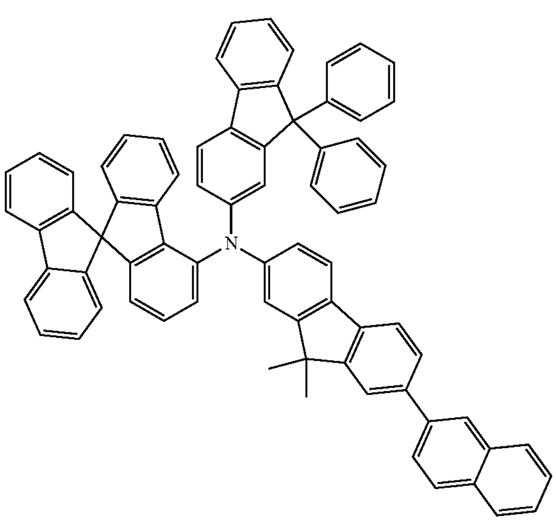
-continued
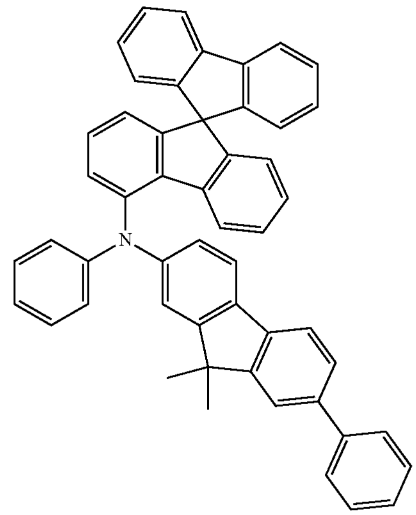
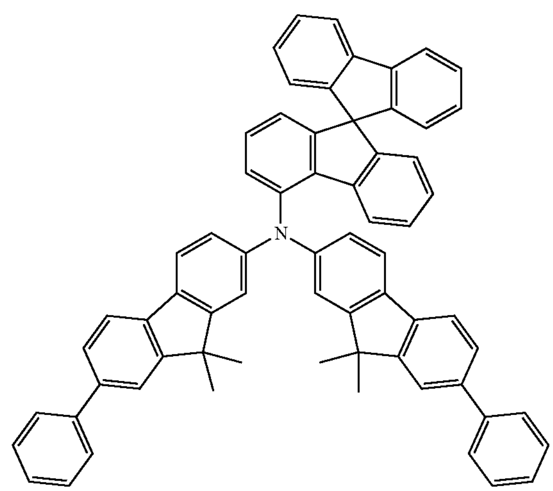
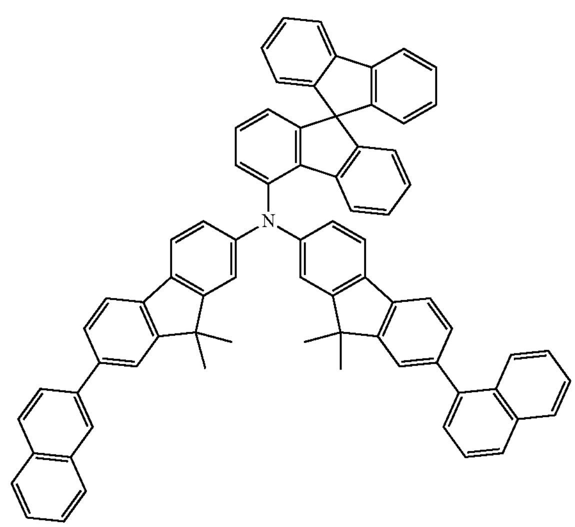

-continued
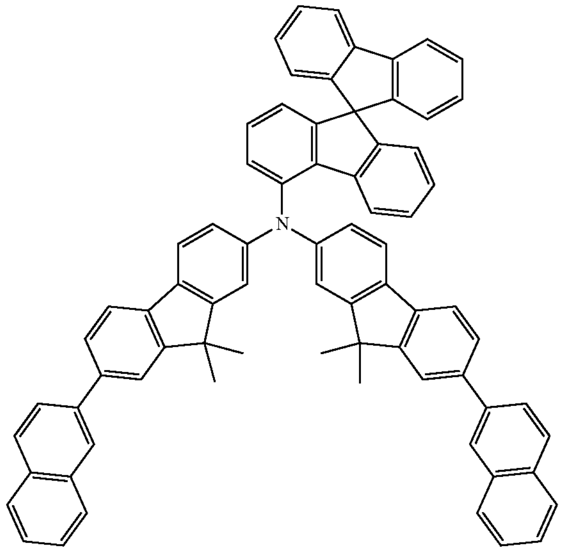
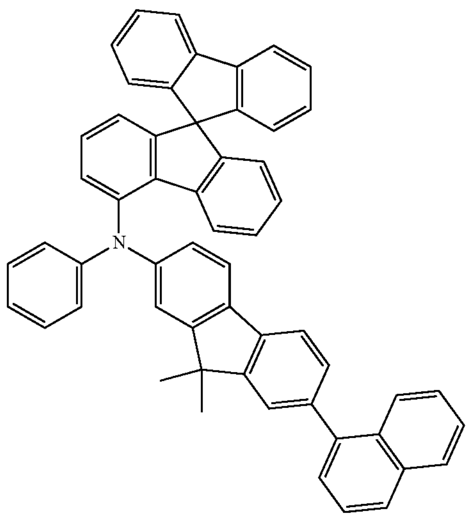
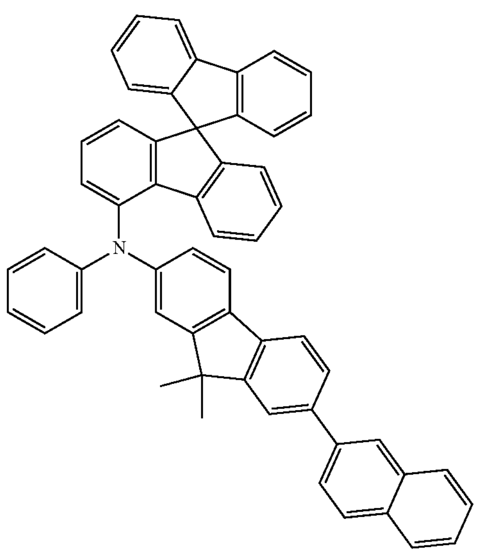
-continued
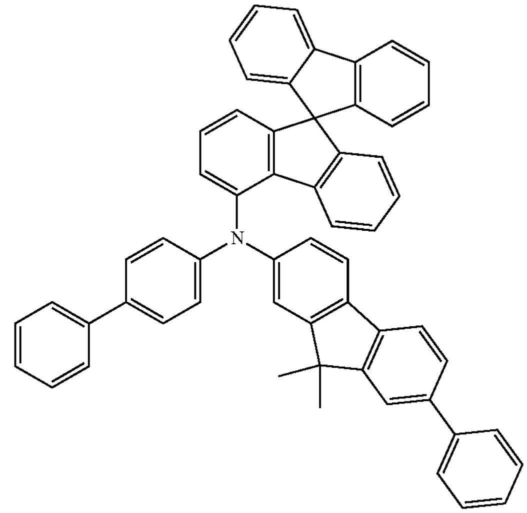
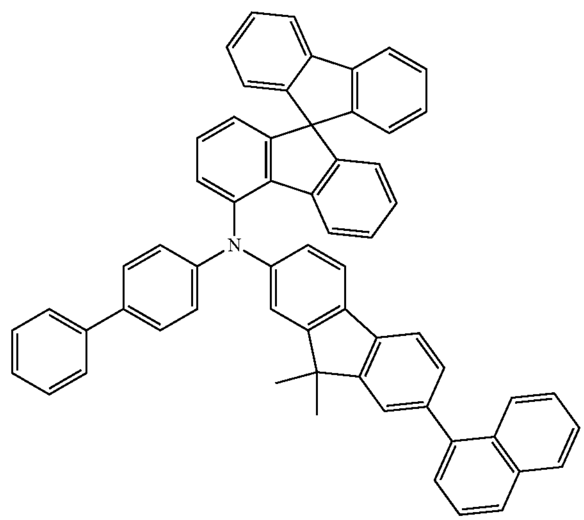
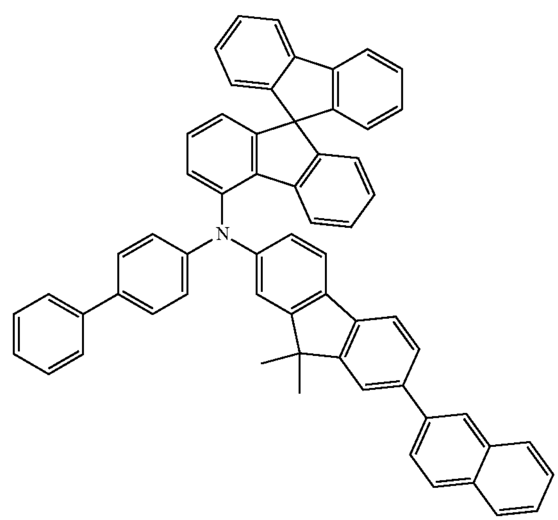

-continued
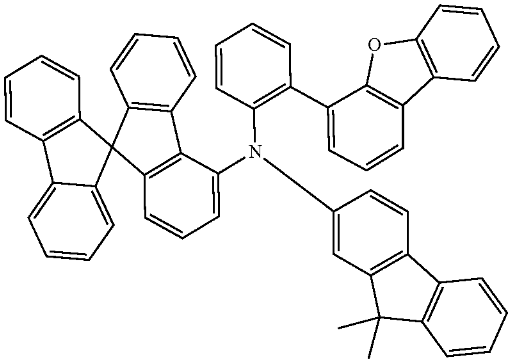
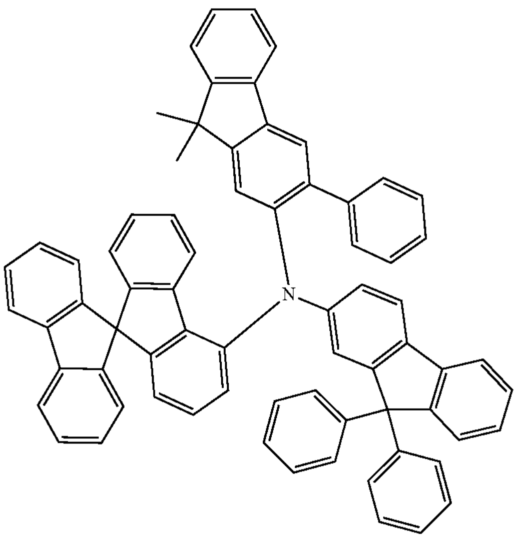
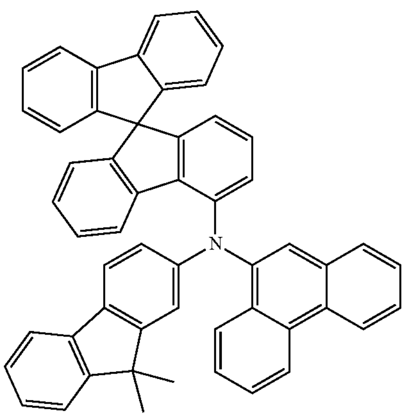
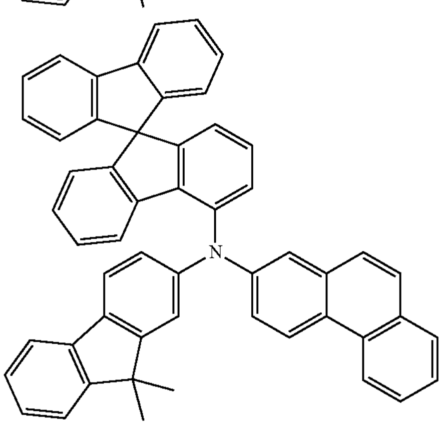
-continued
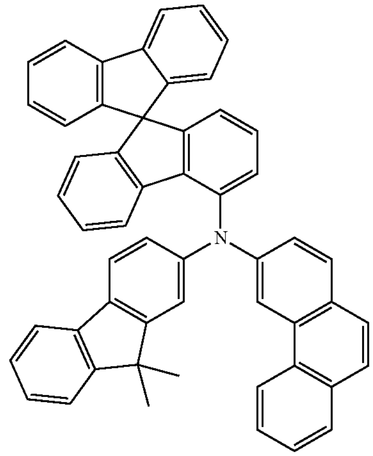
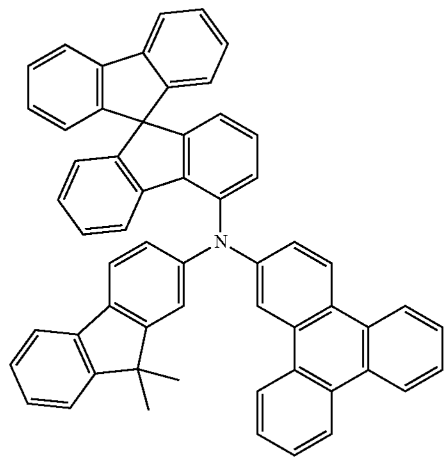
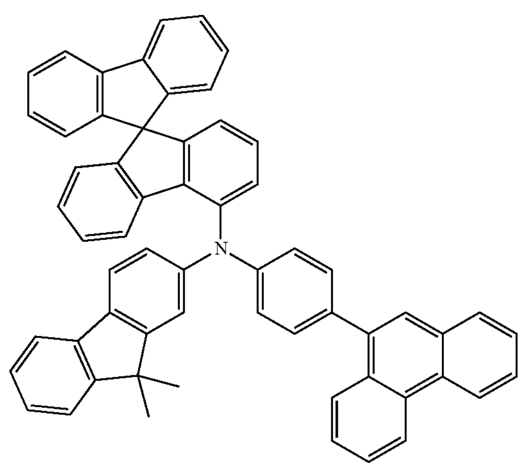

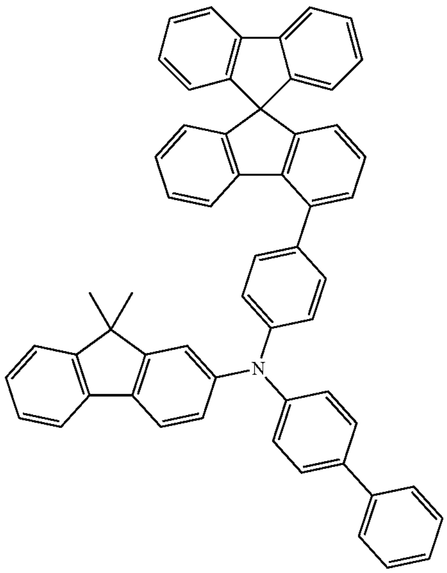
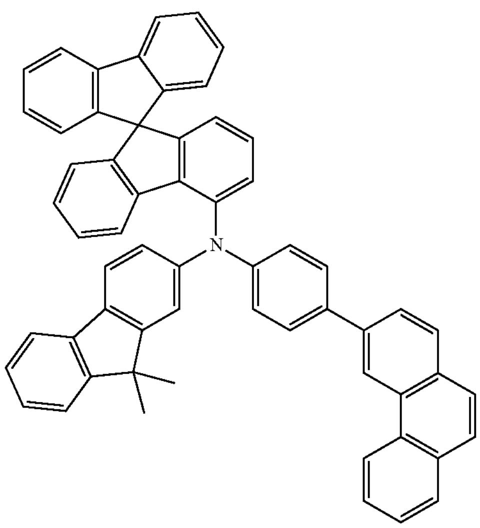
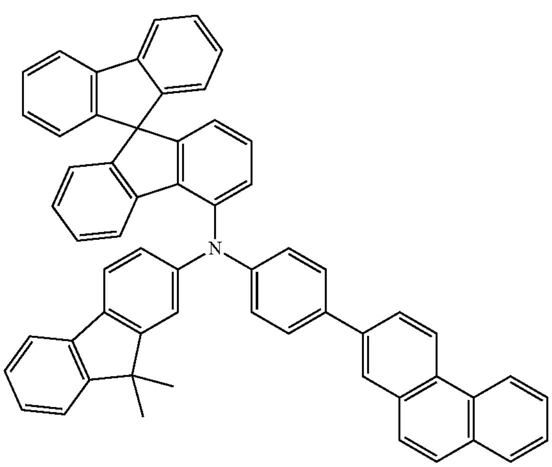
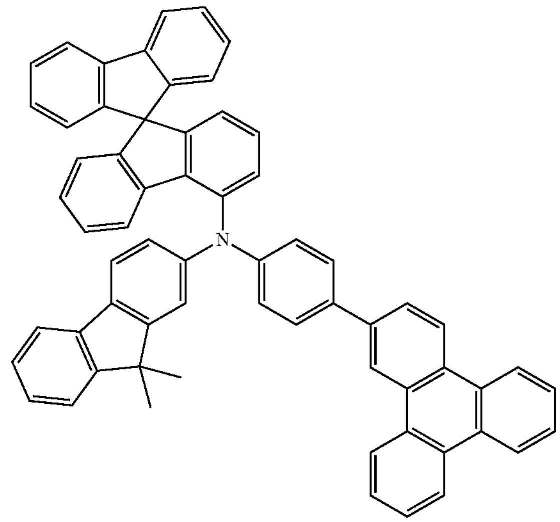
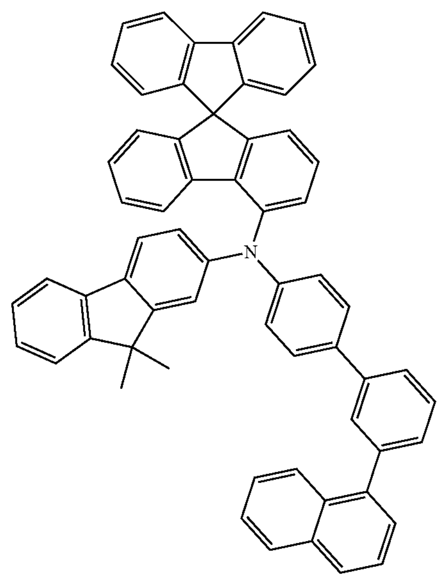
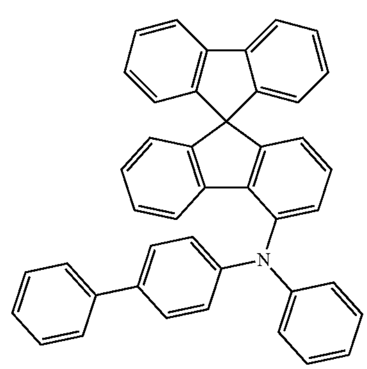

-continued
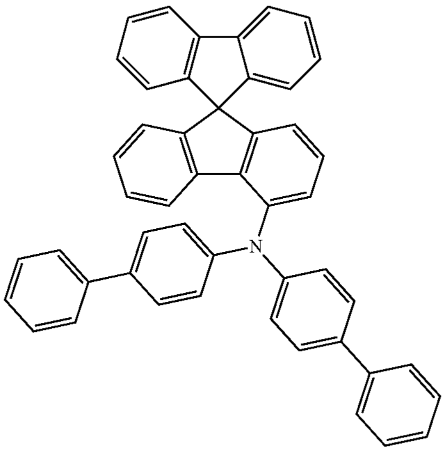
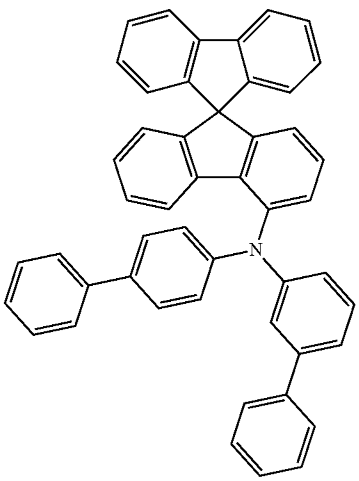
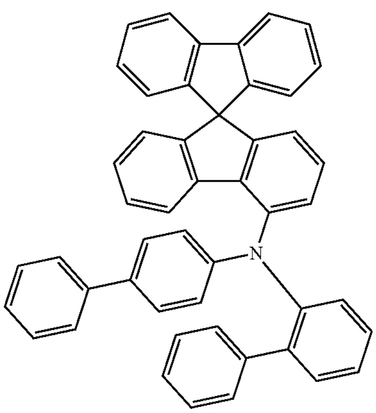
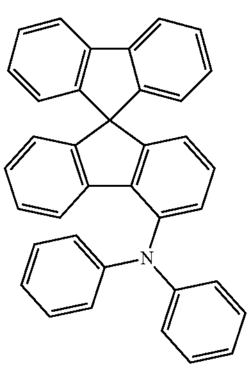
-continued
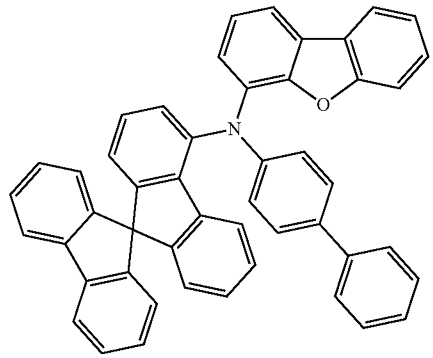
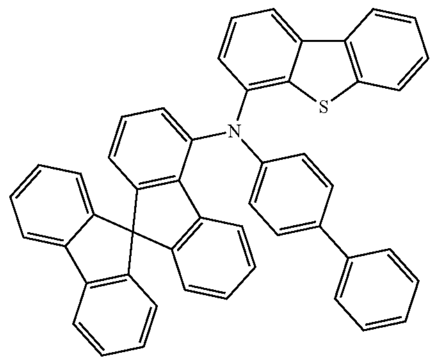
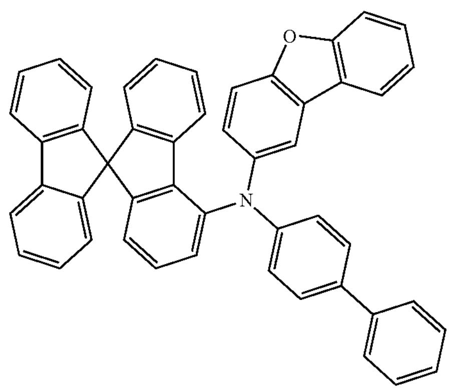
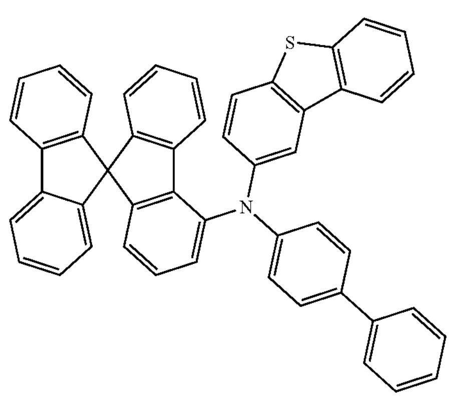

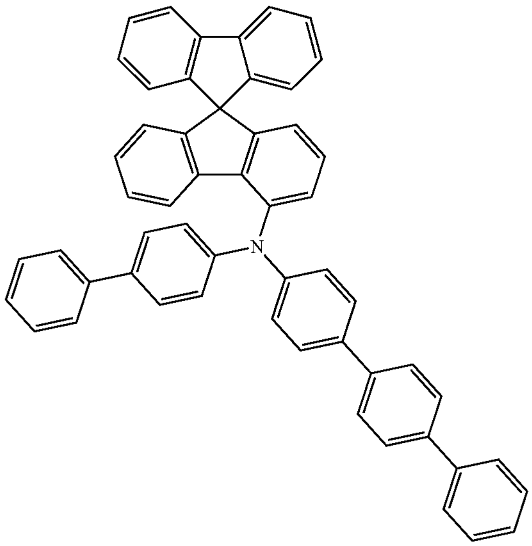
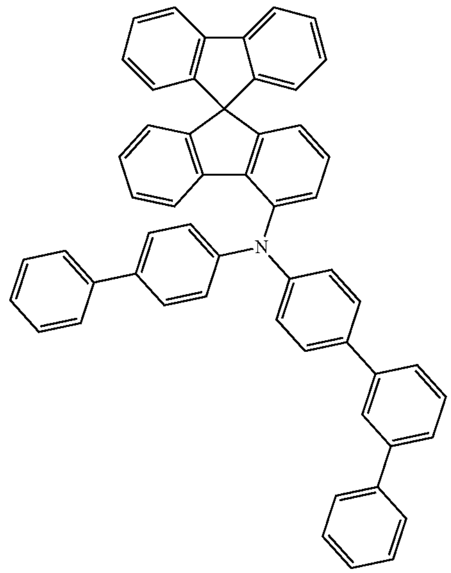
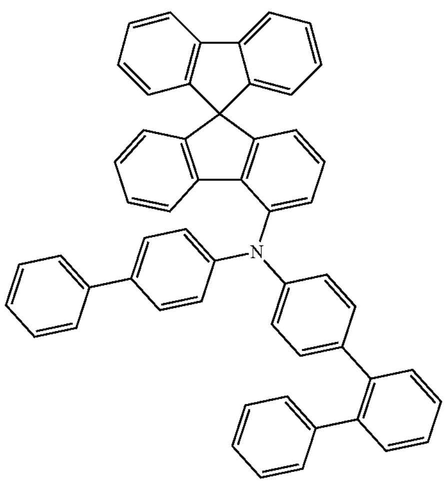
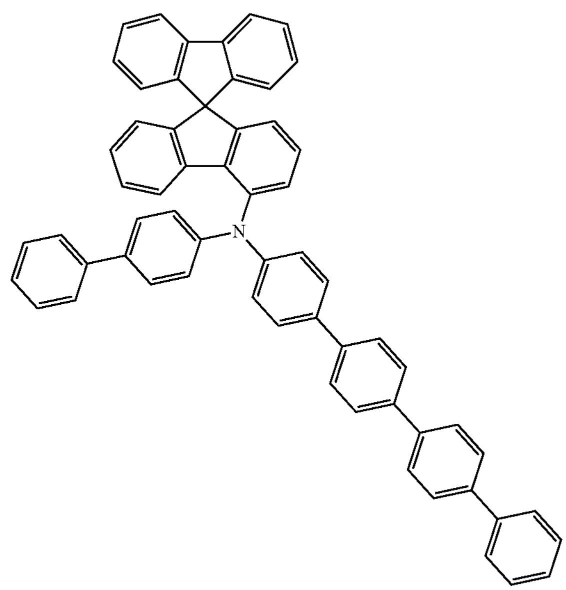
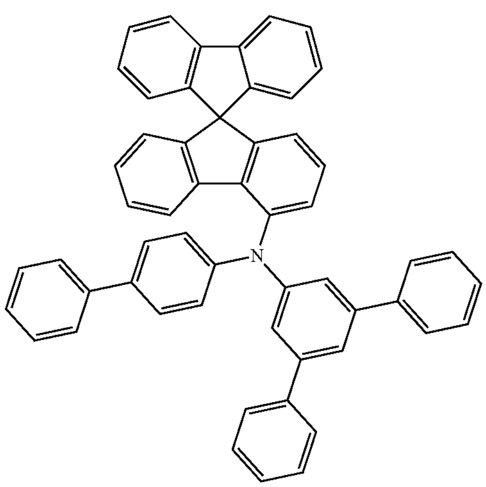
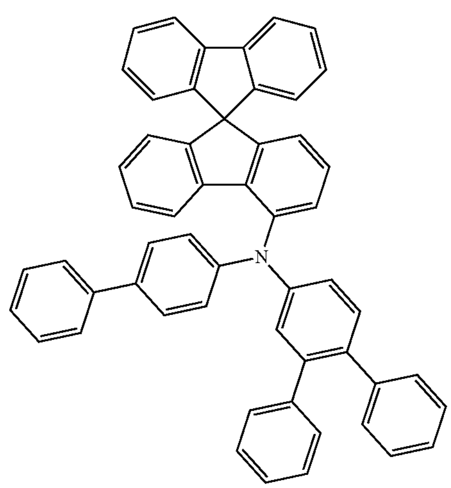

-continued
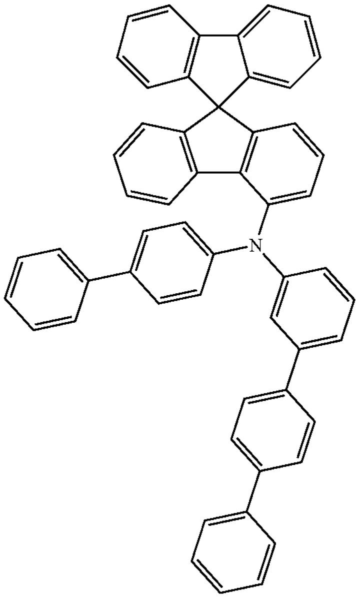
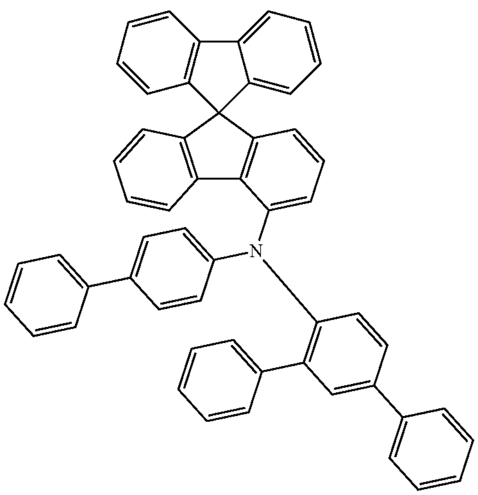
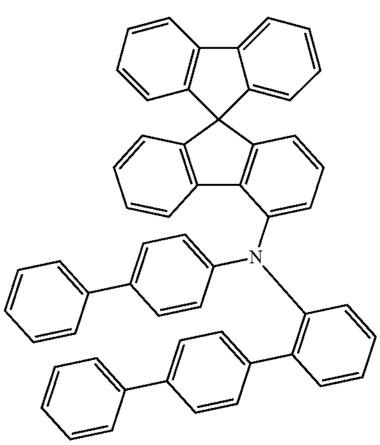
-continued
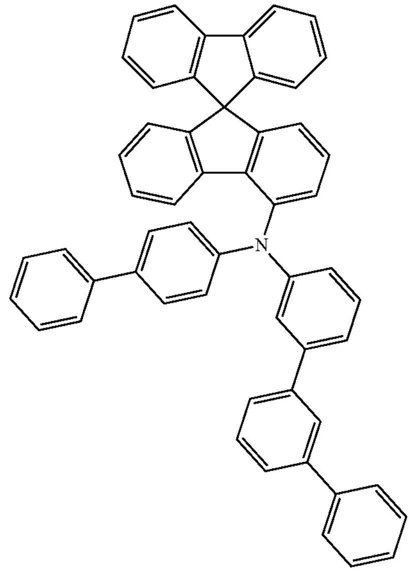
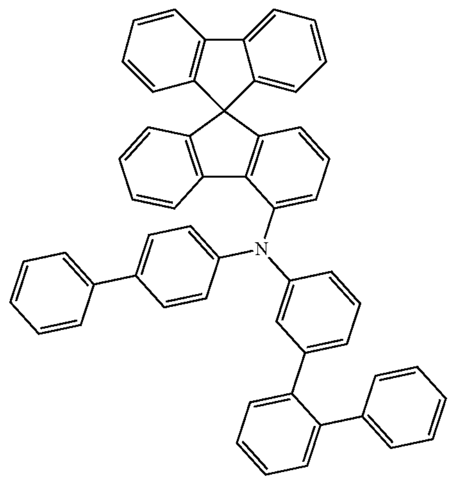
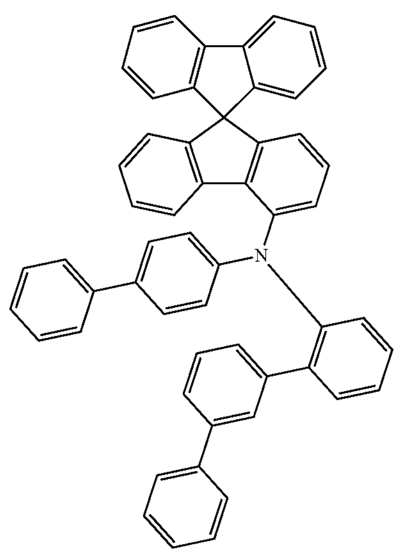

-continued
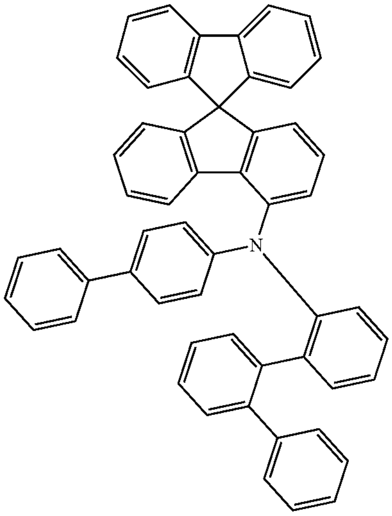
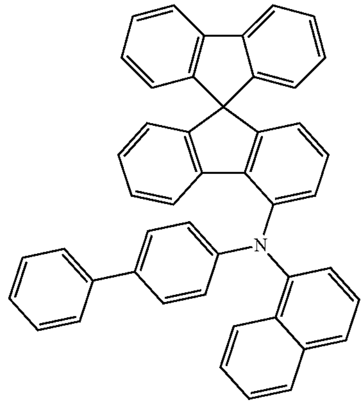
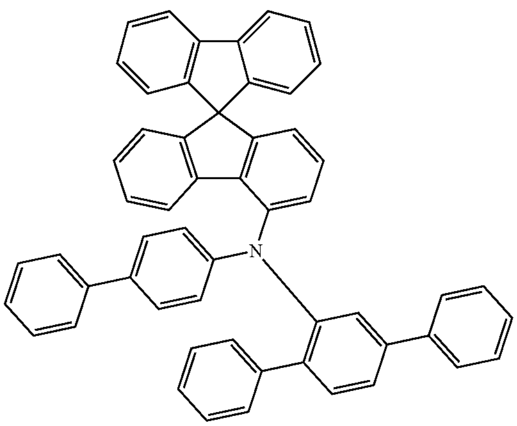
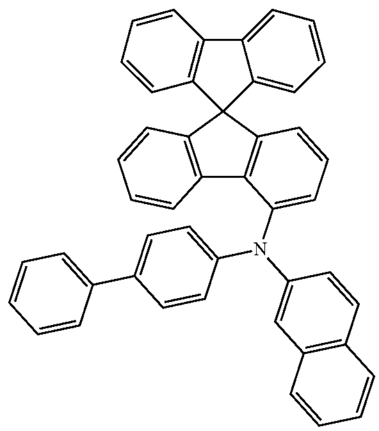
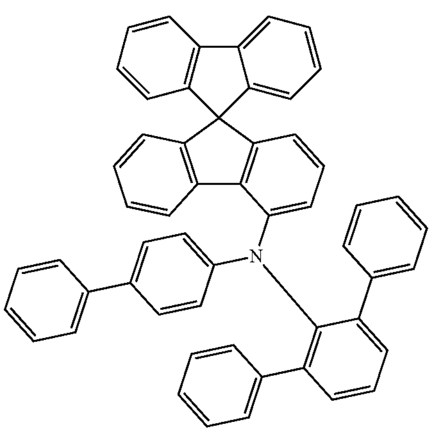
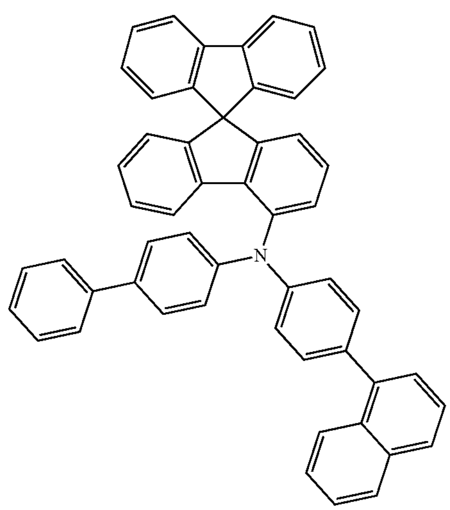

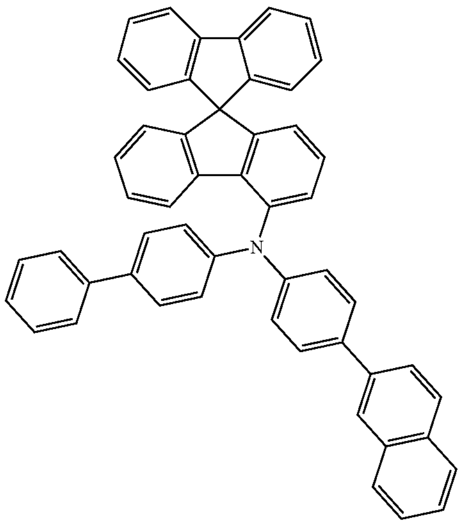
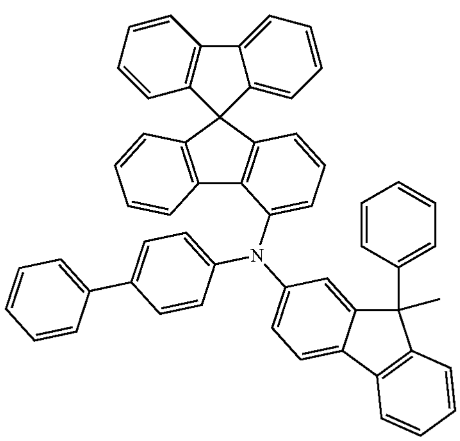
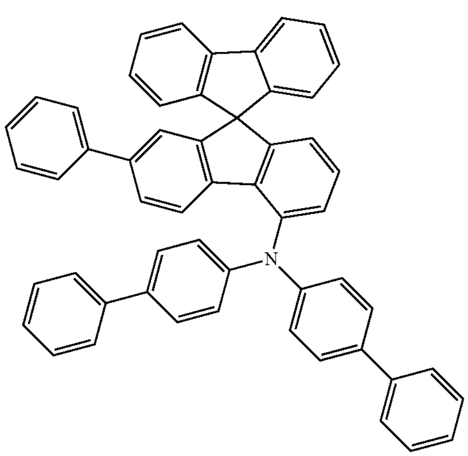
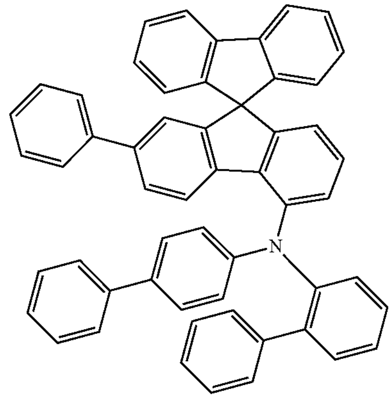
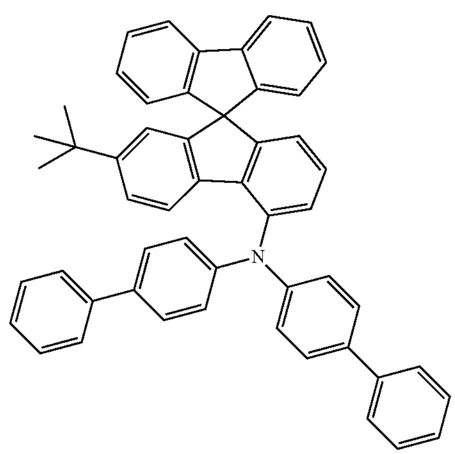
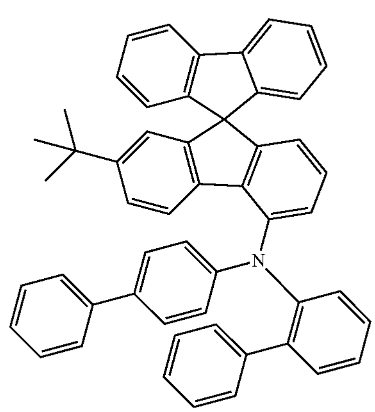

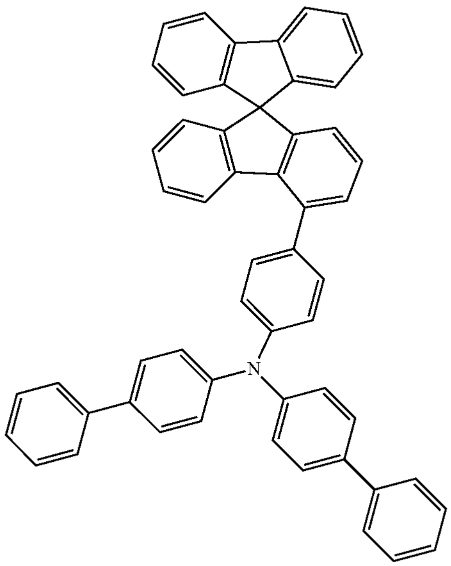
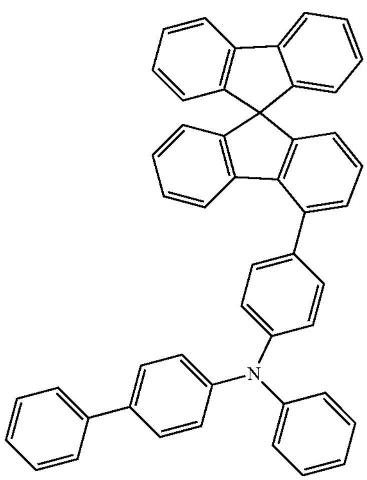
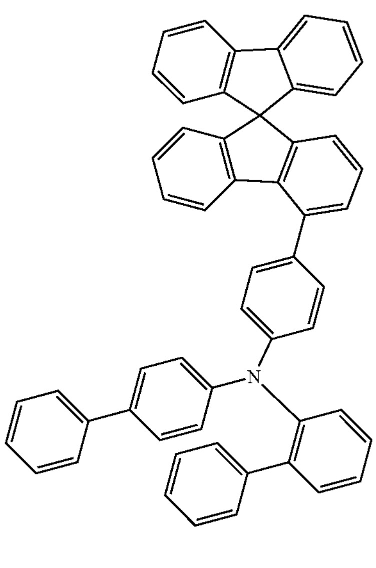
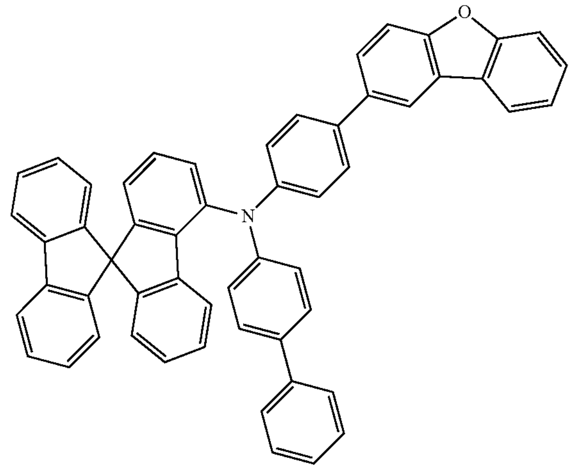
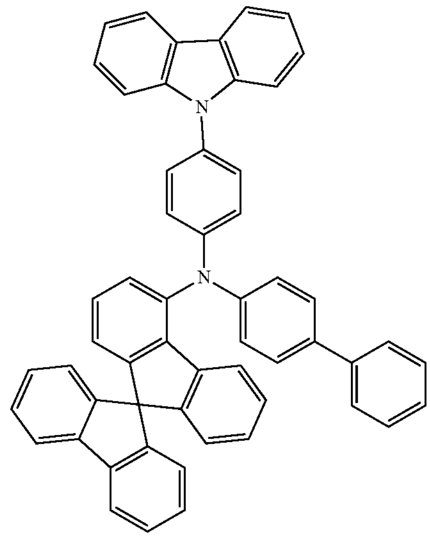
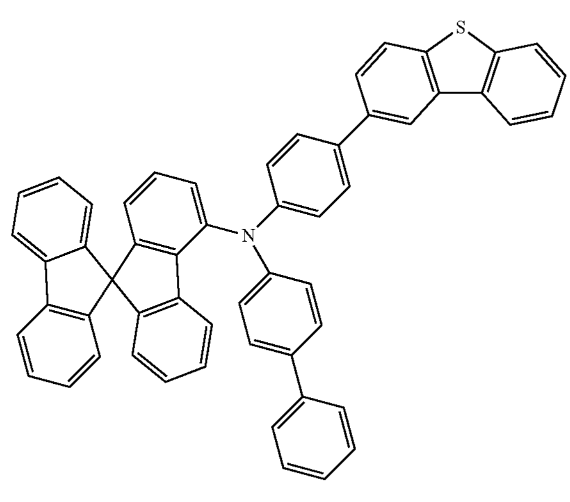

-continued
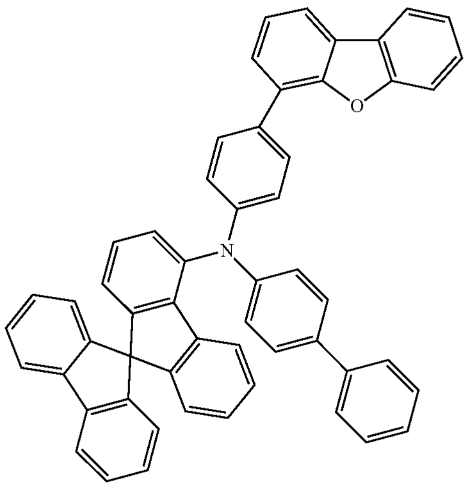
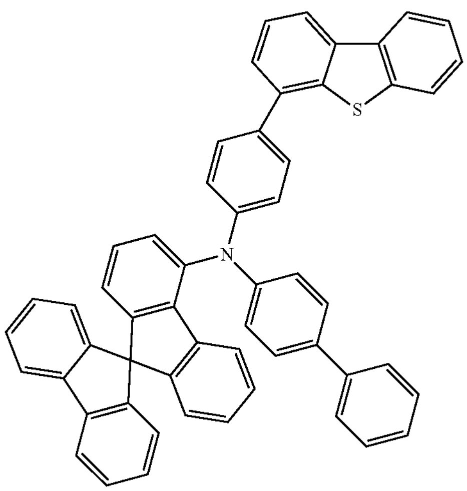
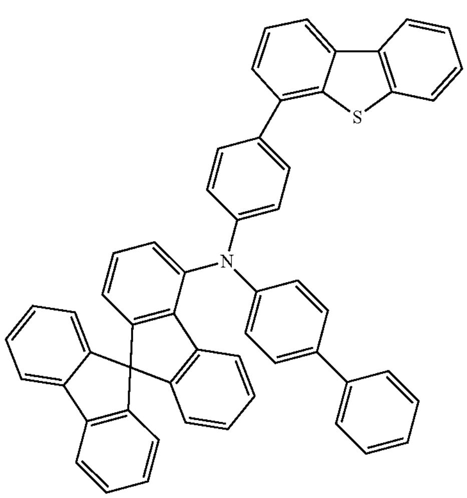
-continued
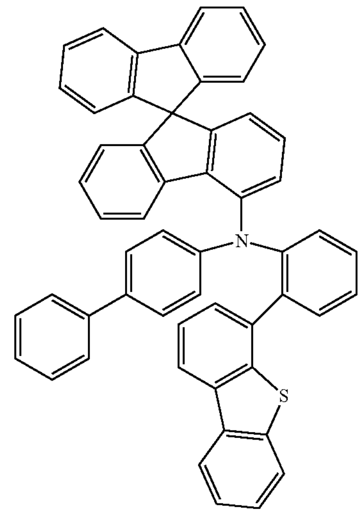
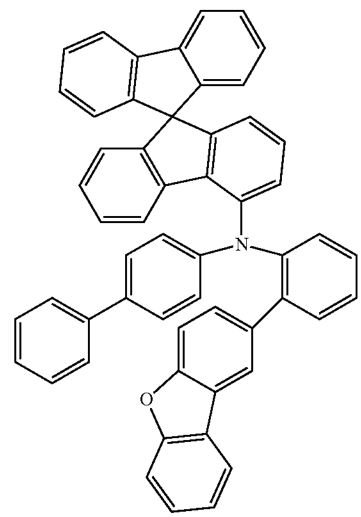
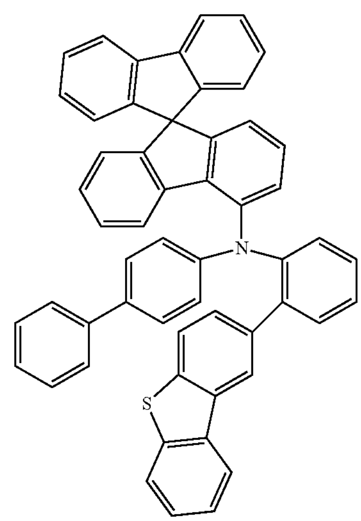

-continued
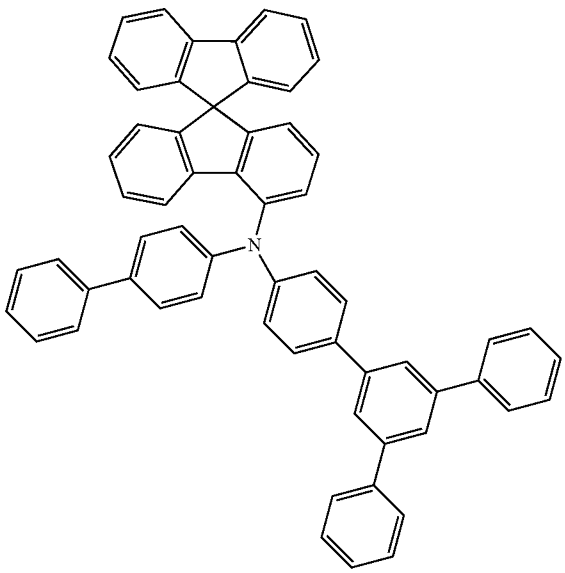
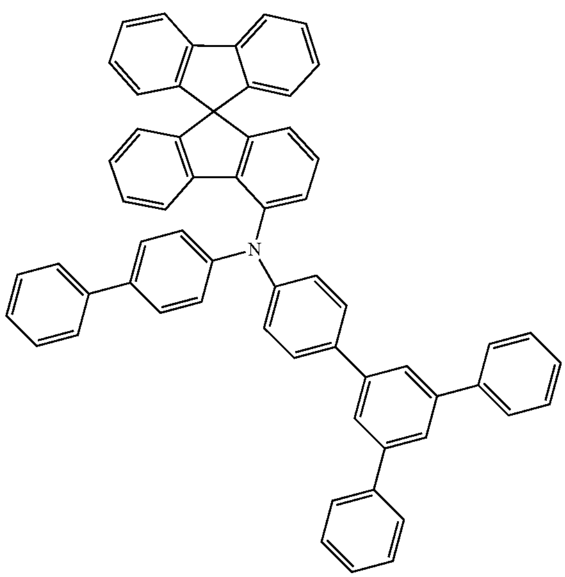
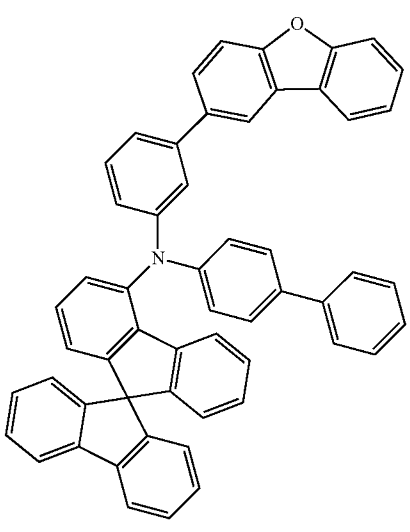
-continued
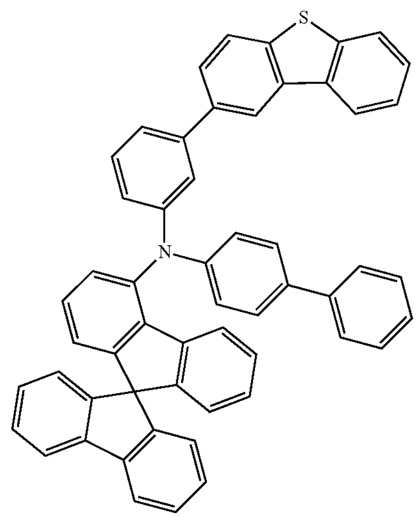
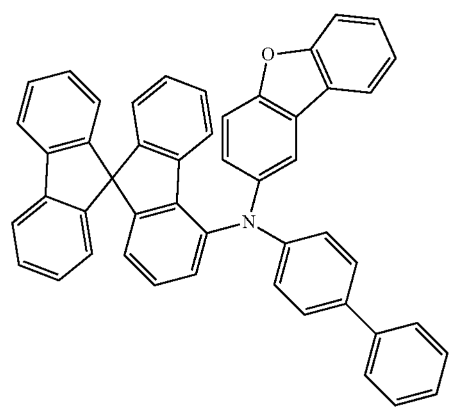
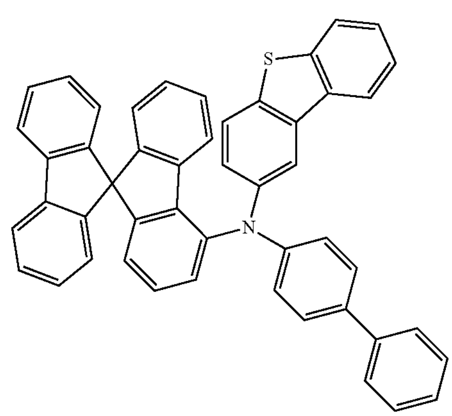

-continued
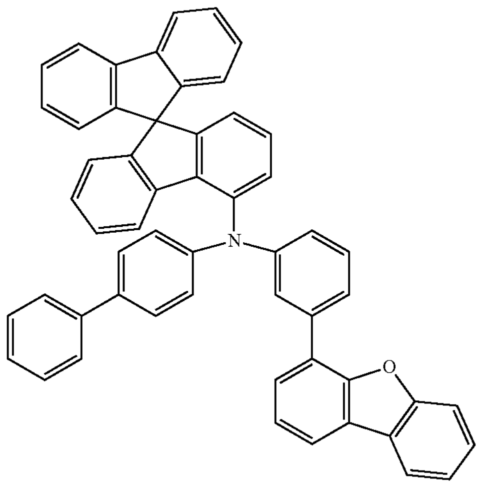
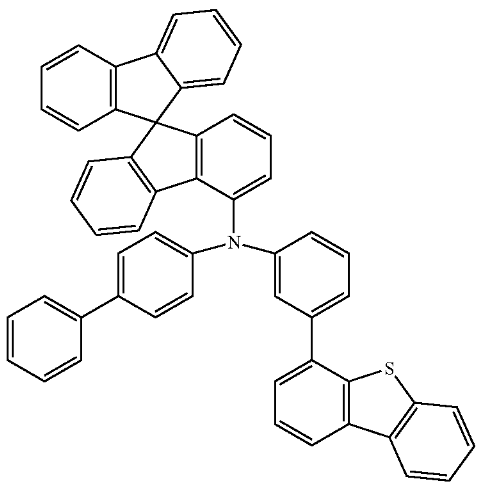
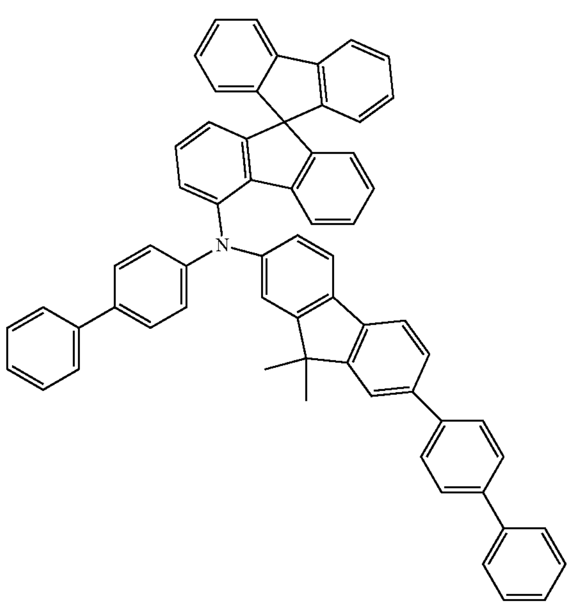
-continued
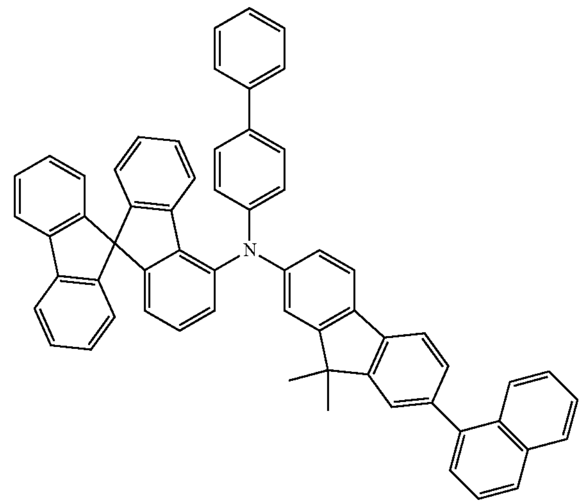
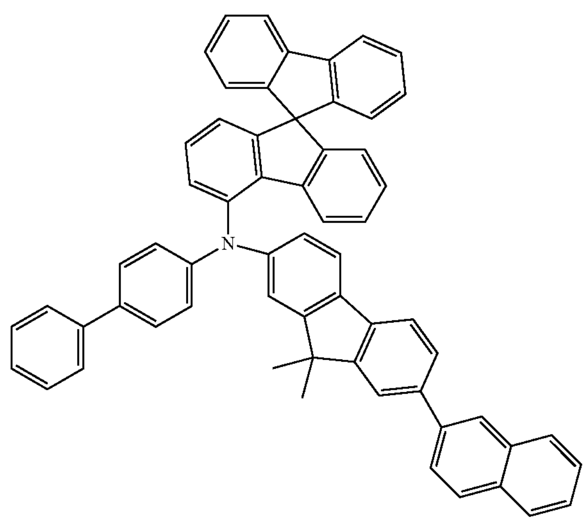
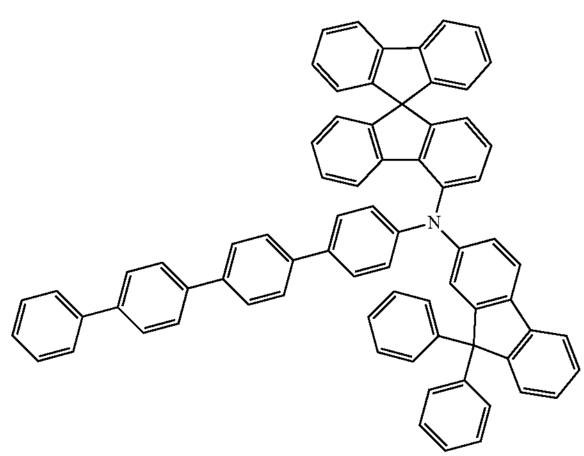

-continued
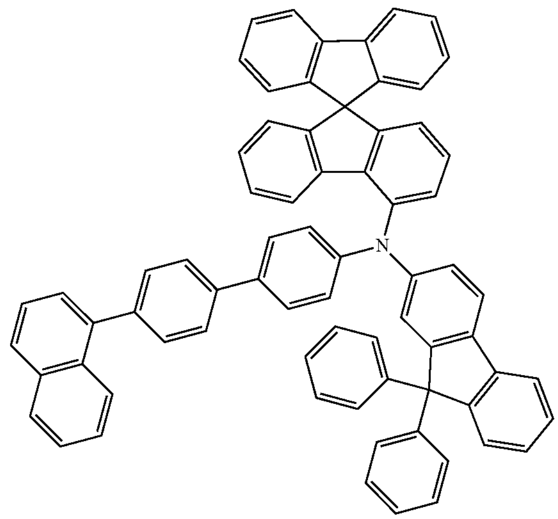
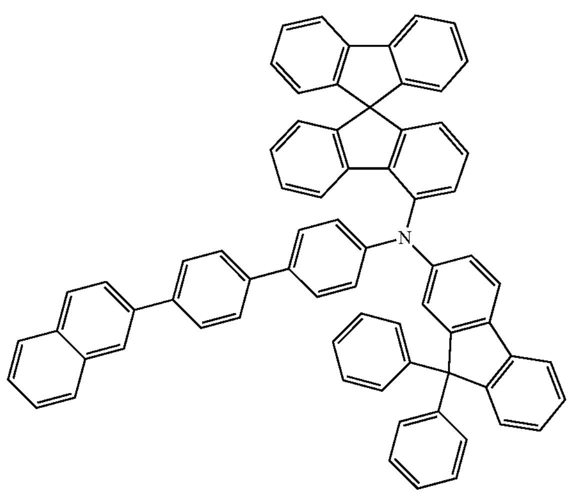
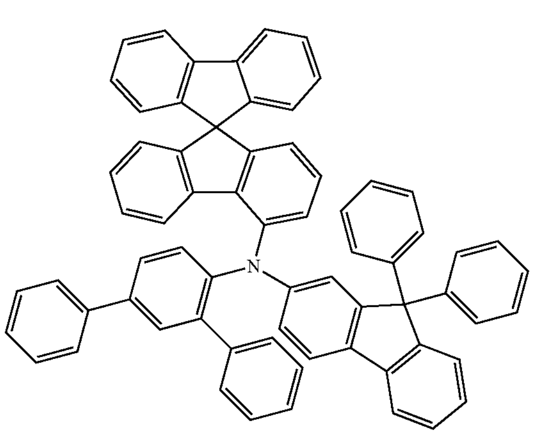
-continued
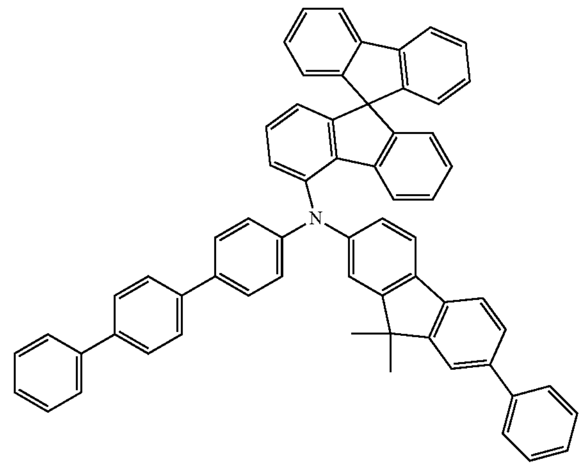
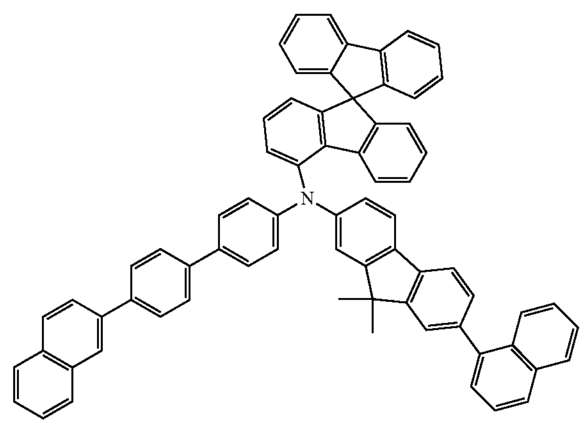
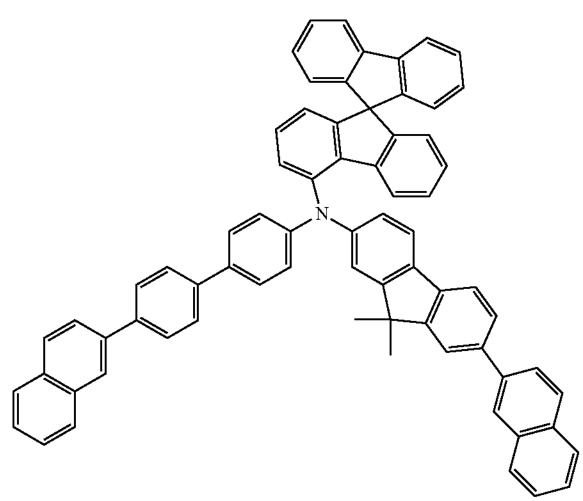

-continued
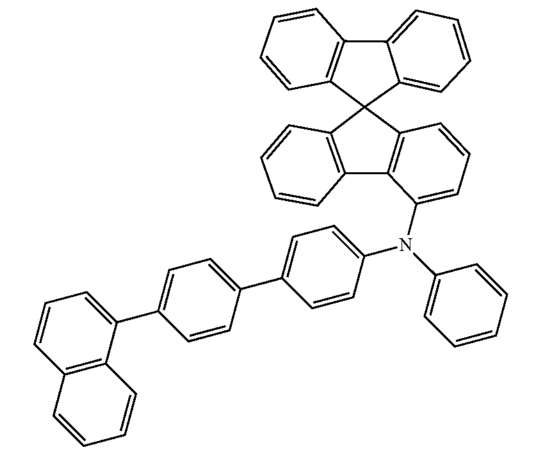
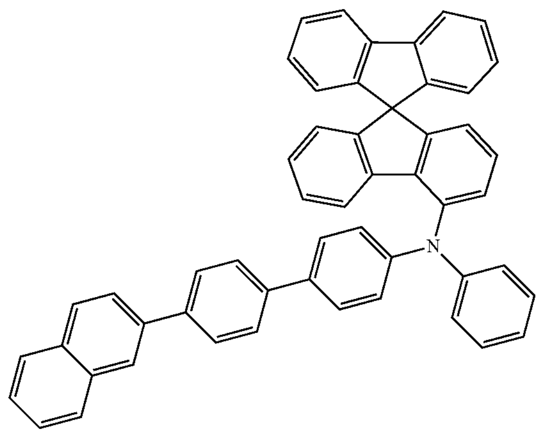
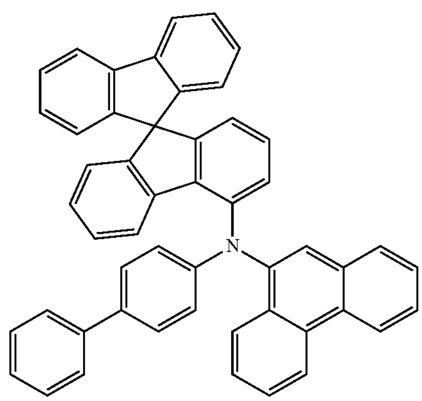
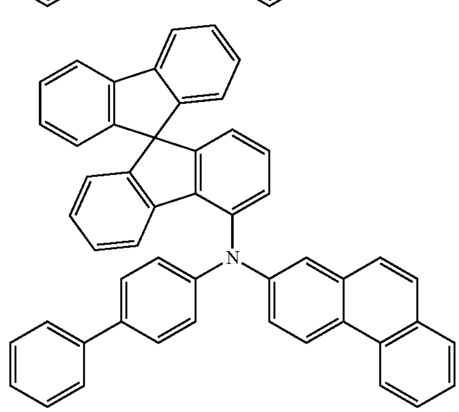
-continued
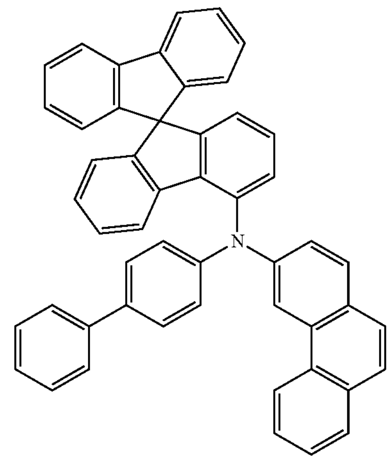
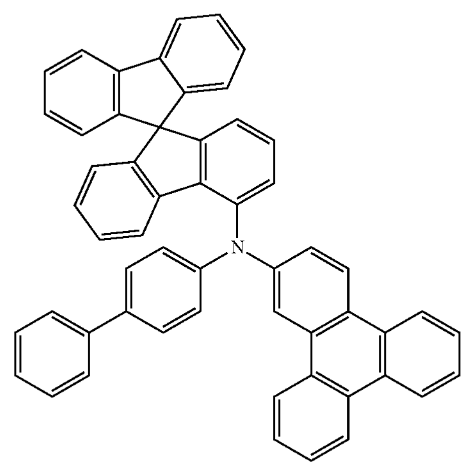
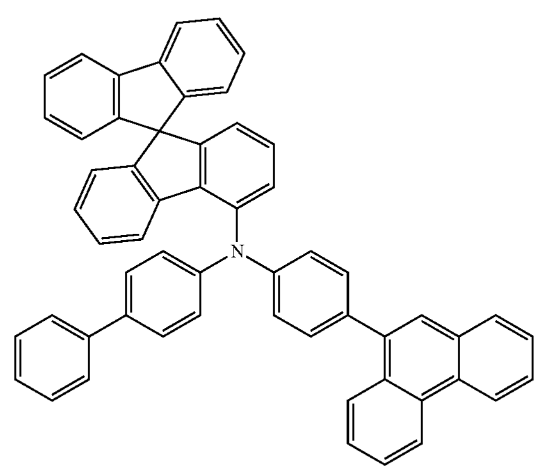

-continued
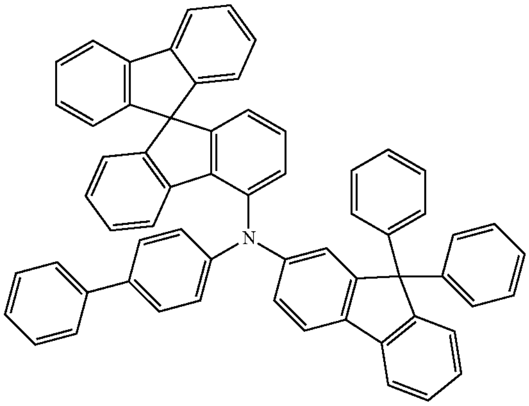
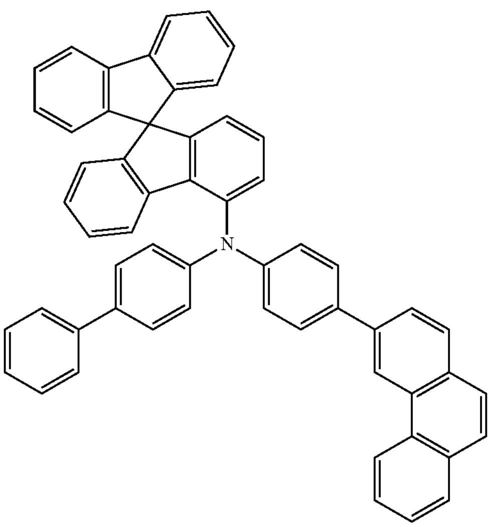
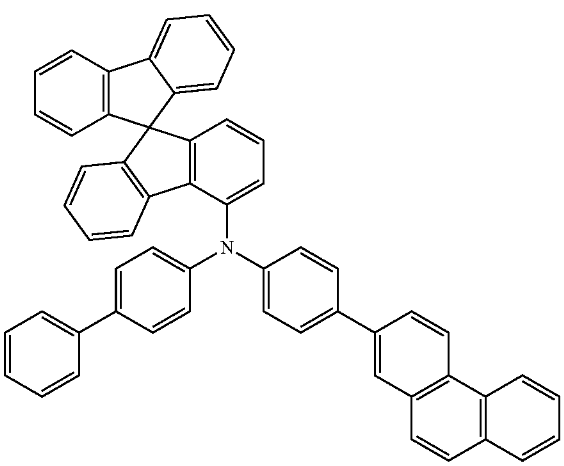
-continued
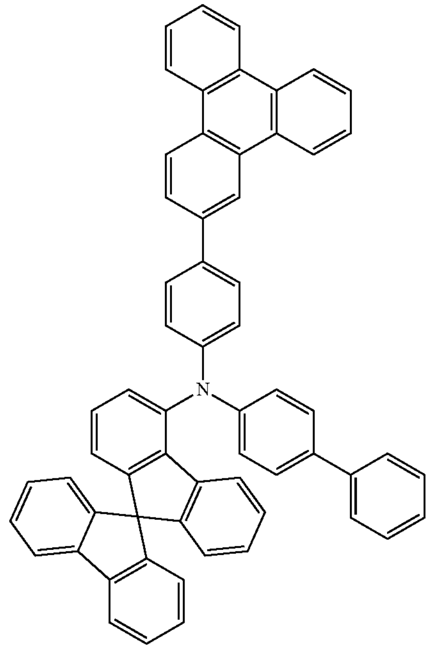
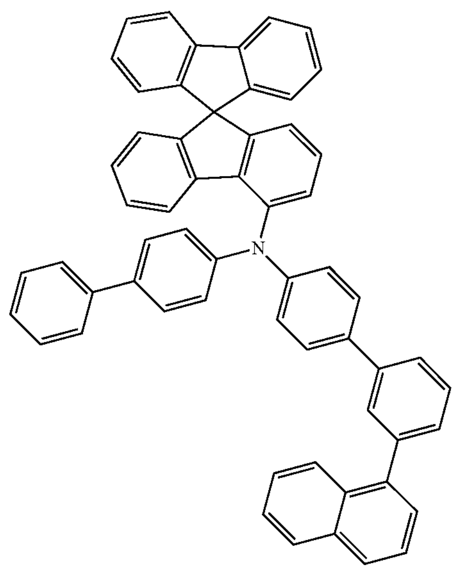
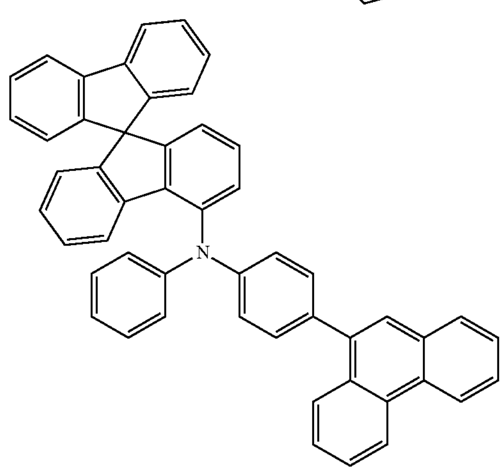

-continued
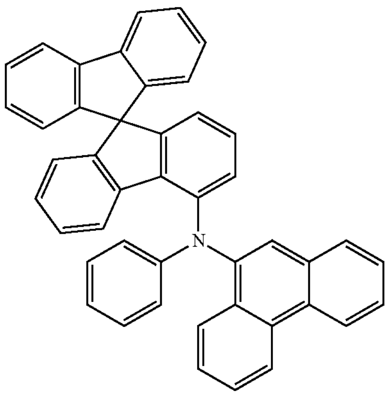
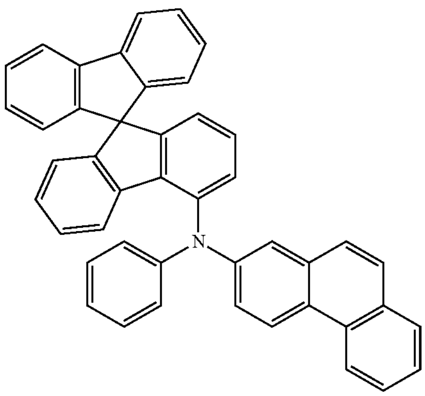
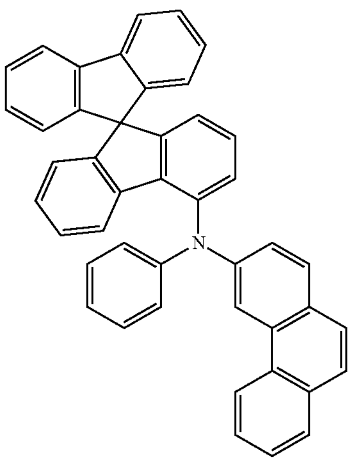
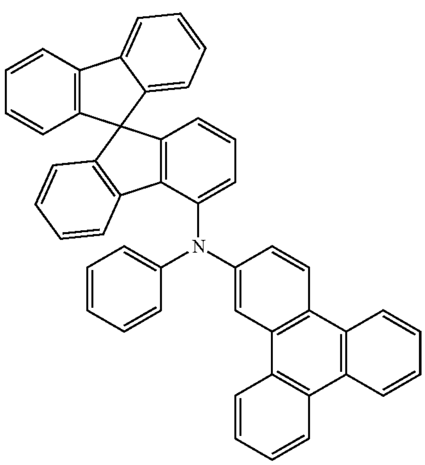
-continued
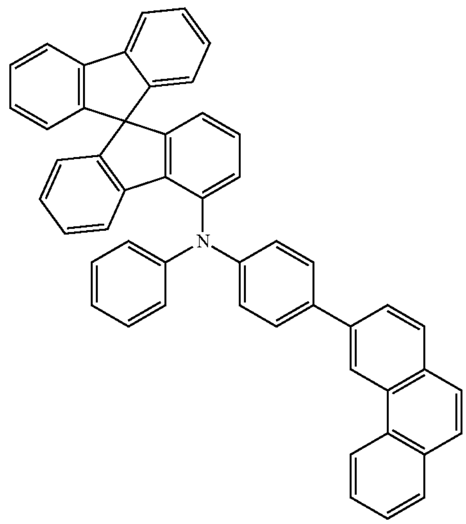
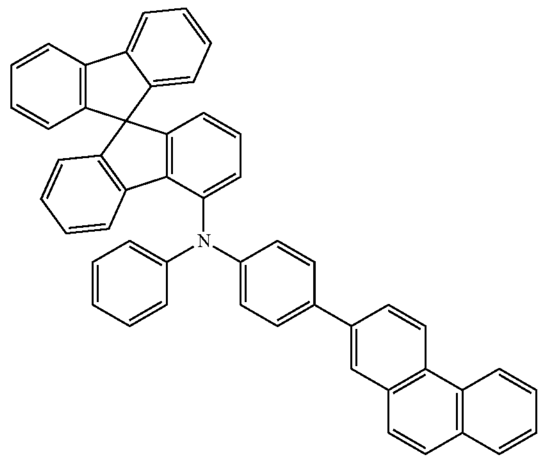
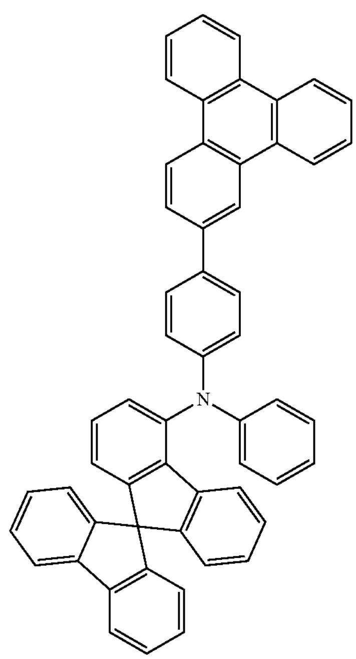

-continued
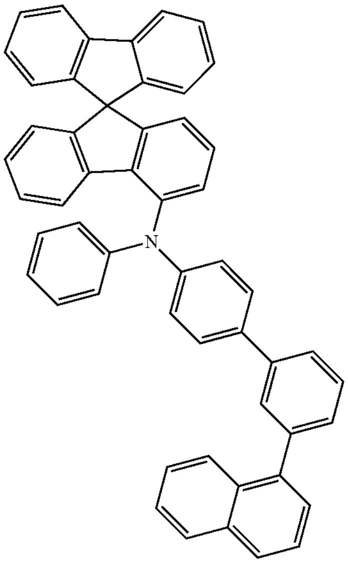
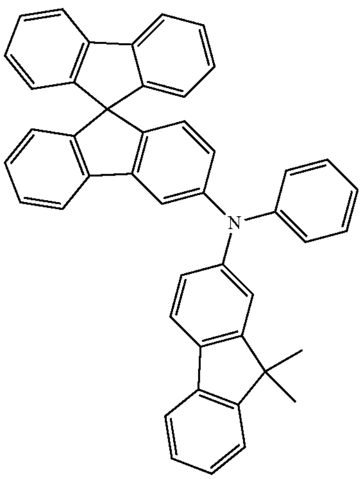
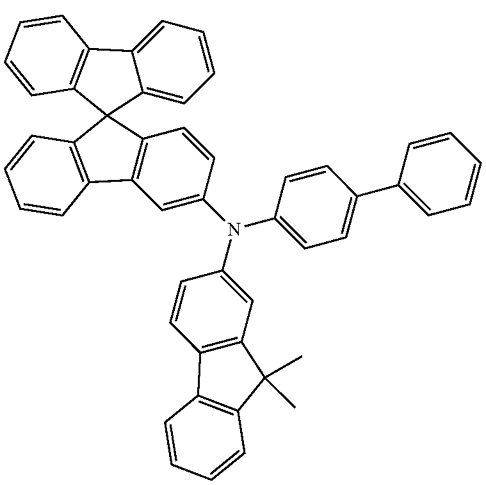
-continued
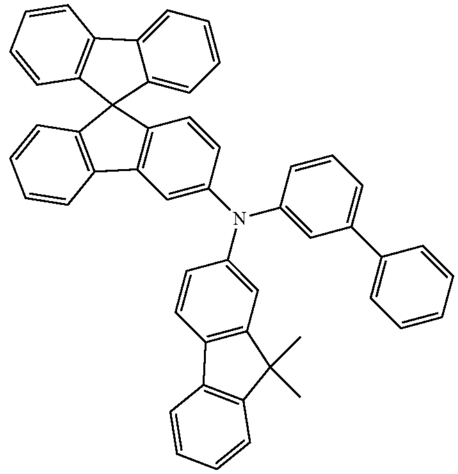
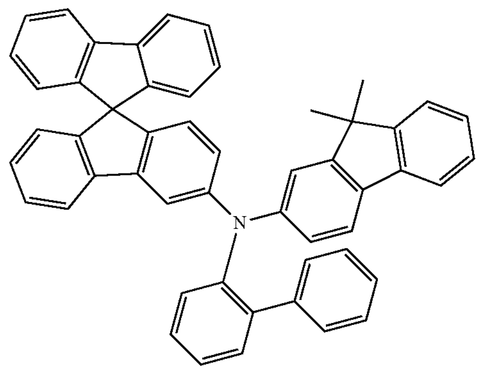
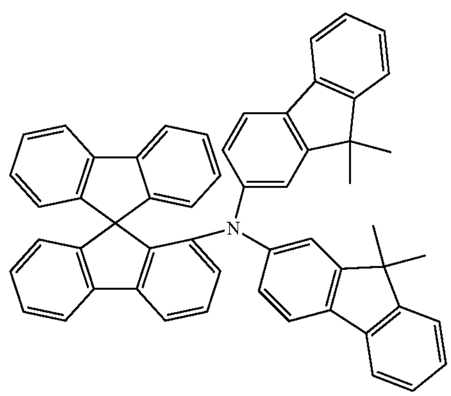
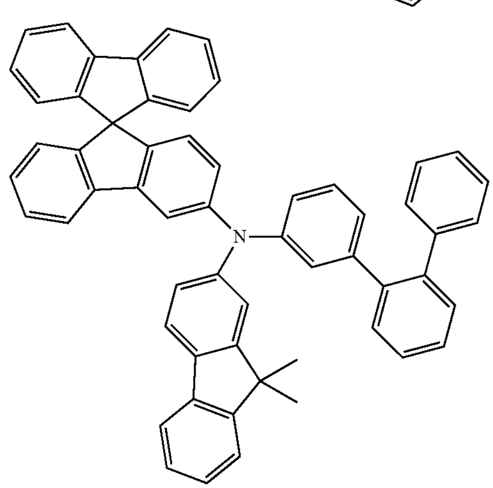

-continued
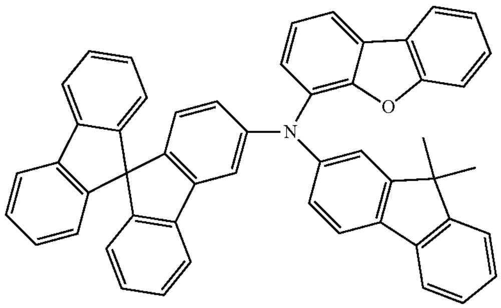
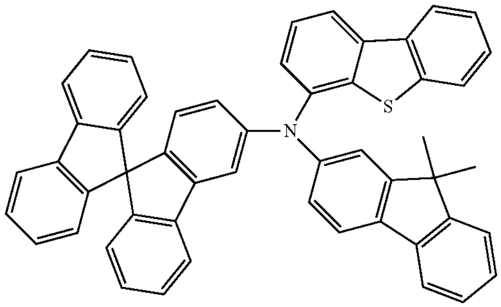
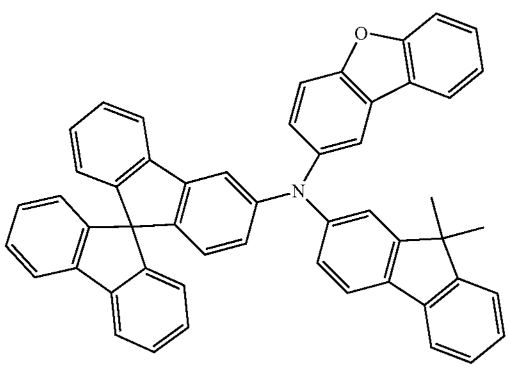
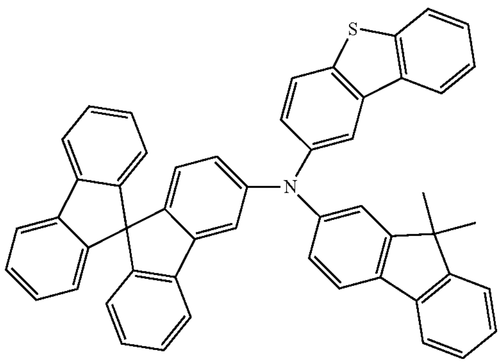
-continued
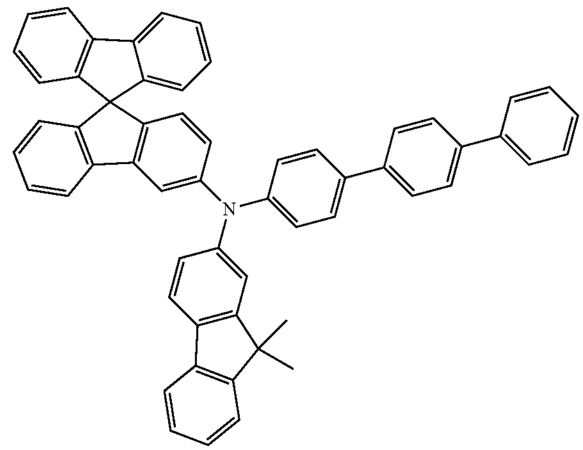
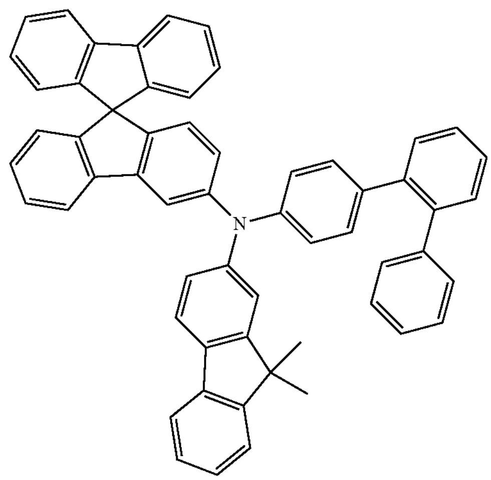
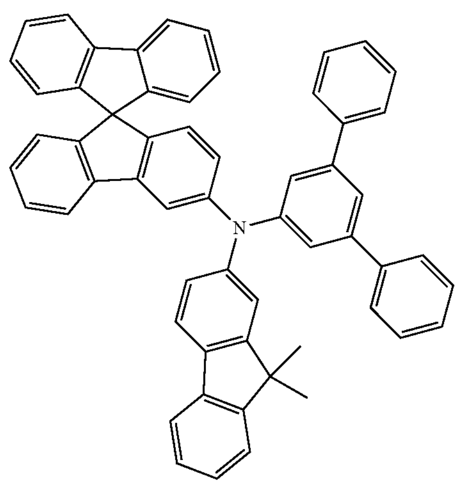

-continued
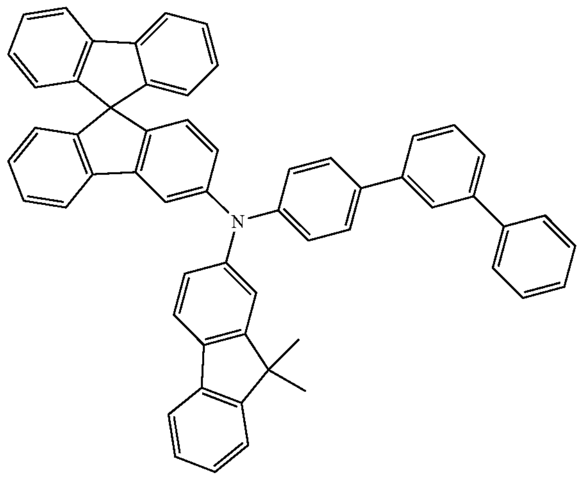
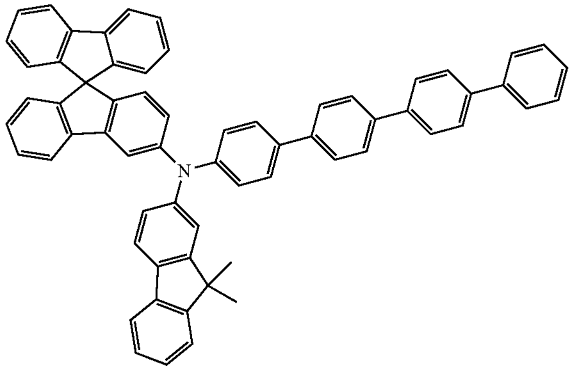
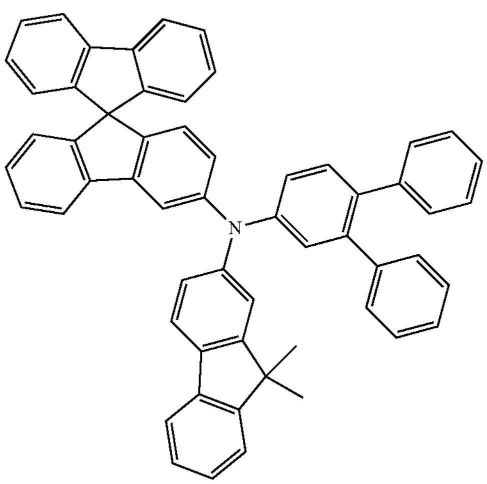
-continued
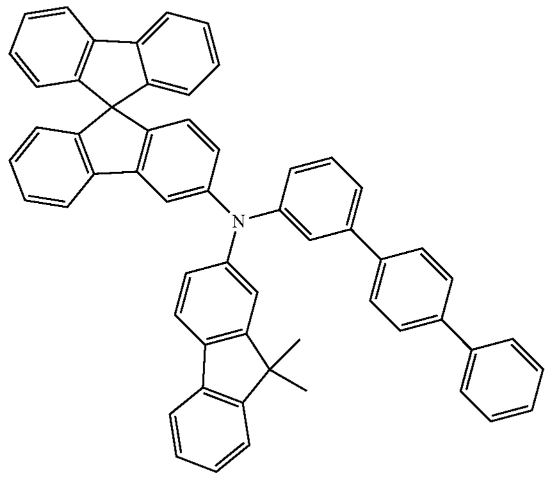
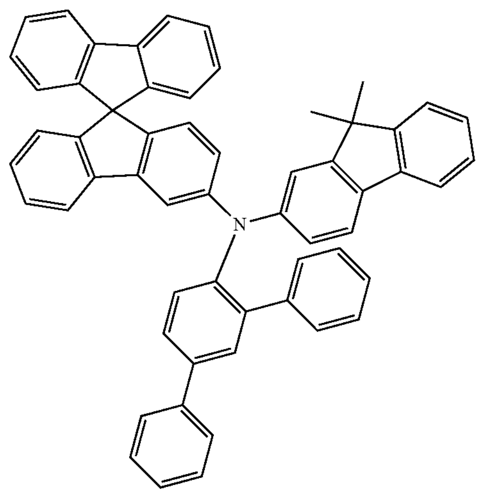
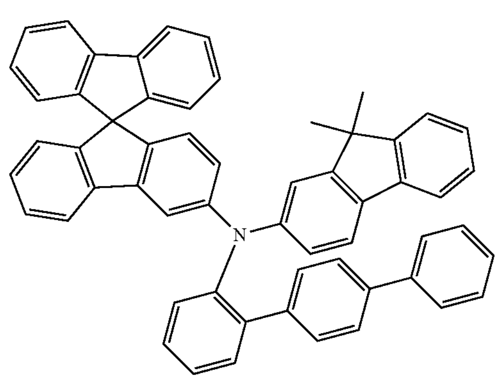

-continued
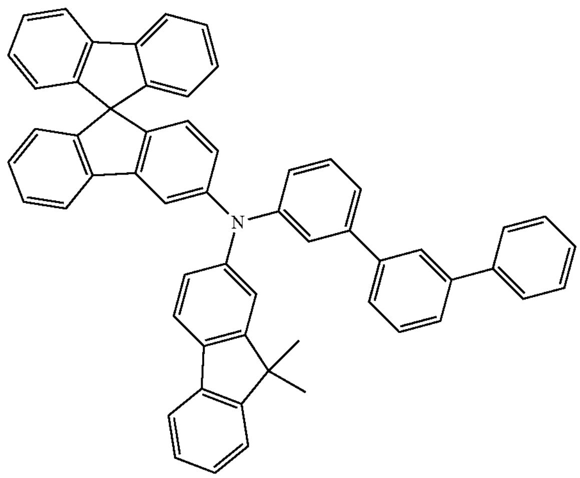
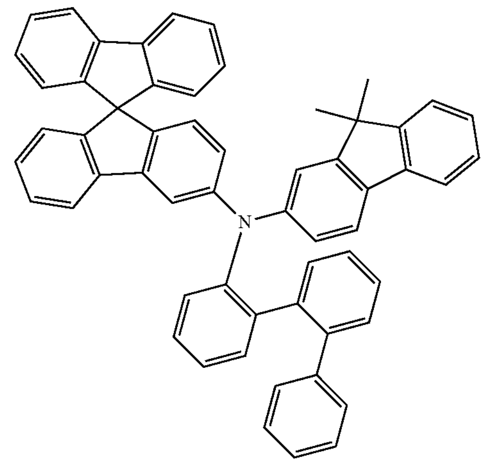
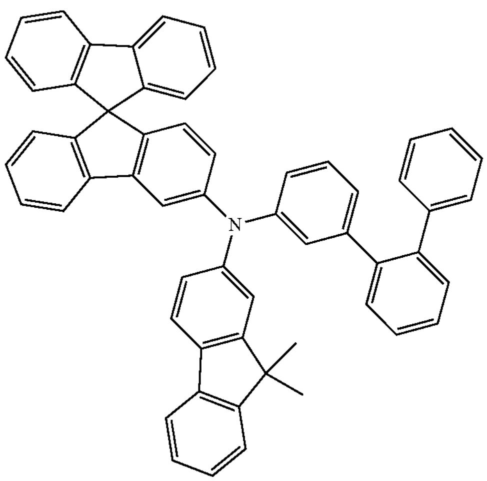
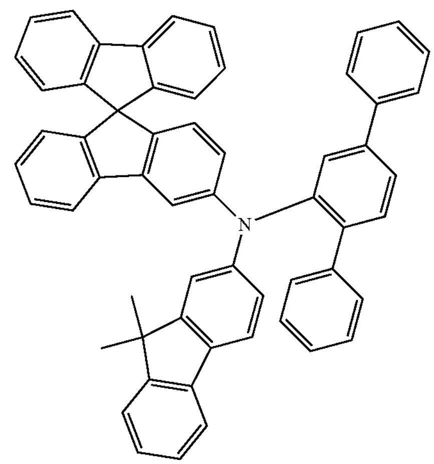
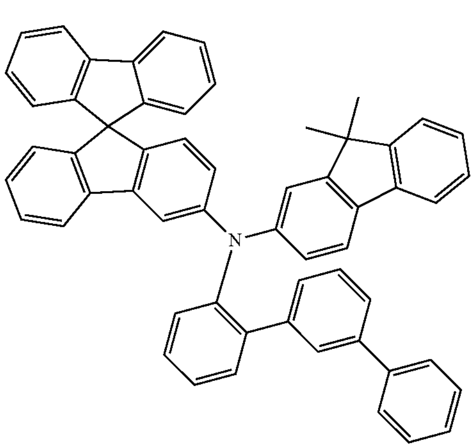
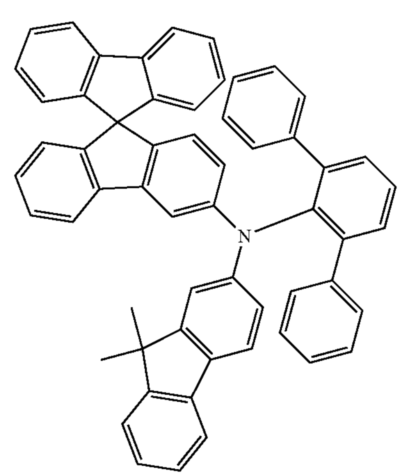

-continued
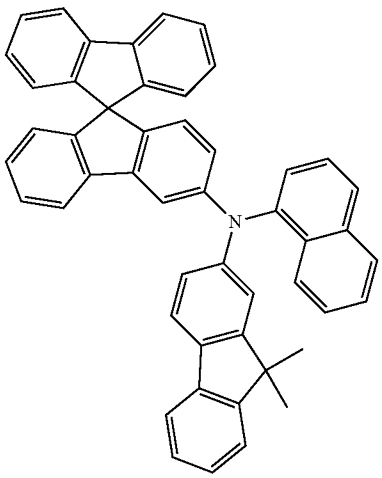
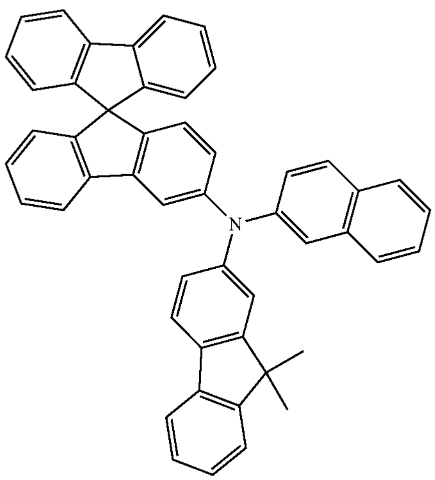
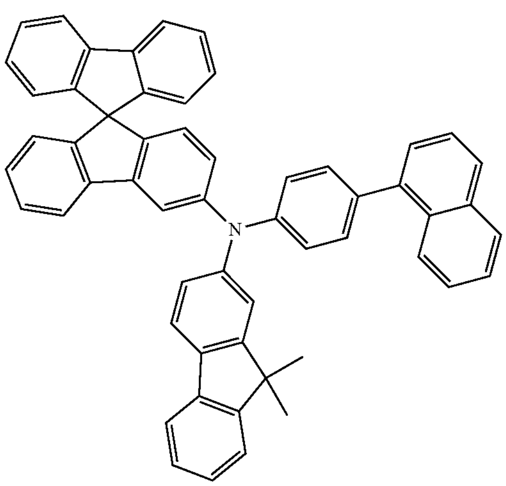
-continued
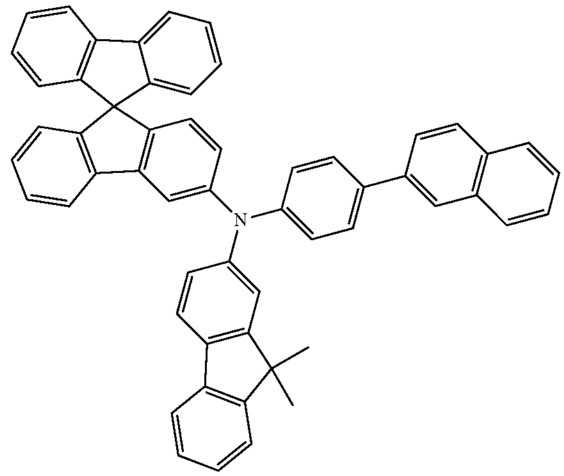
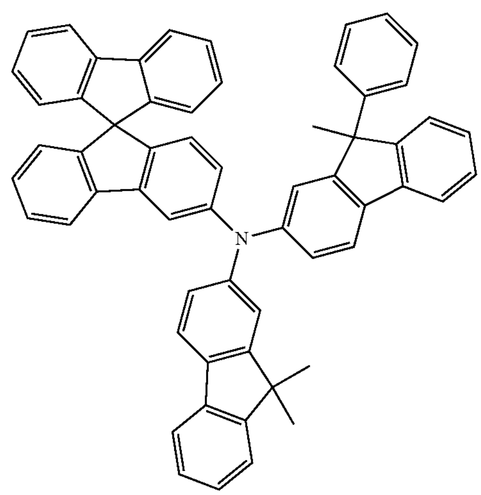
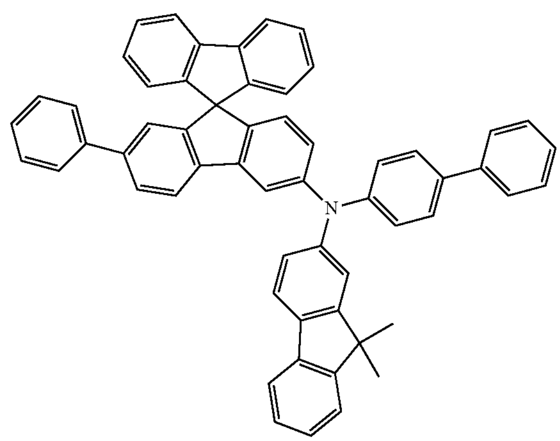

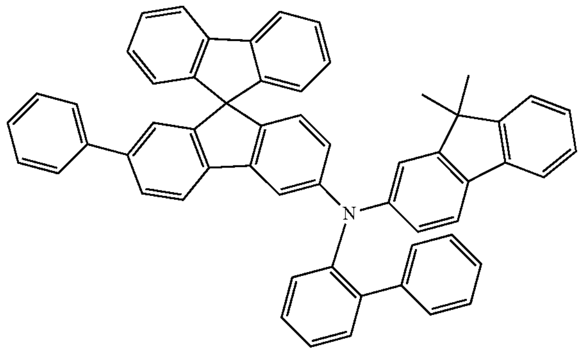
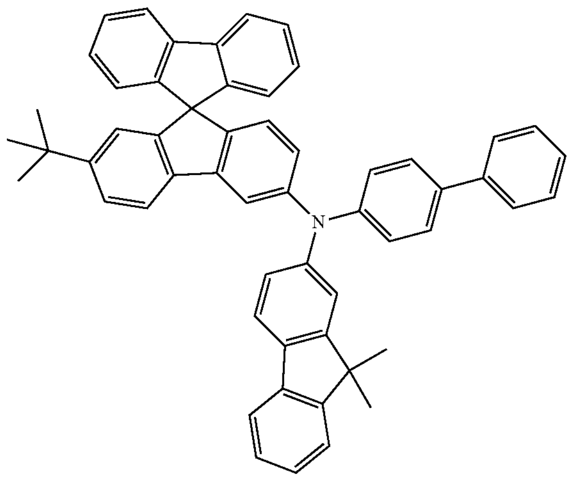
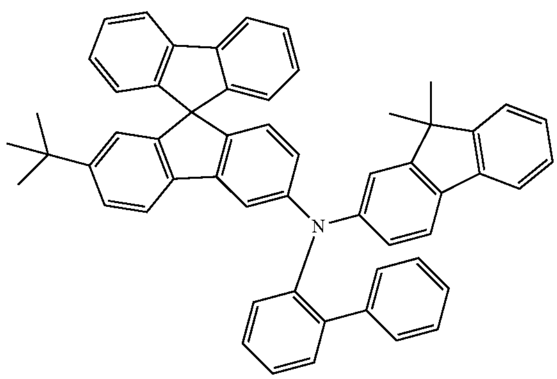
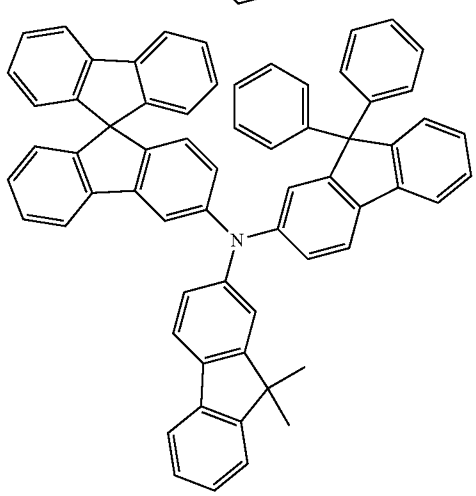
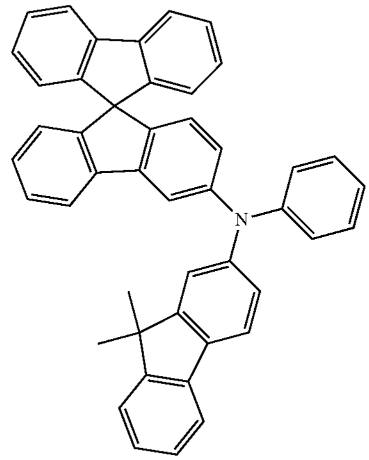
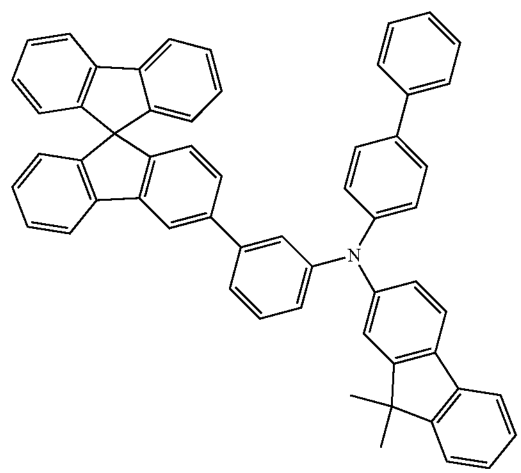
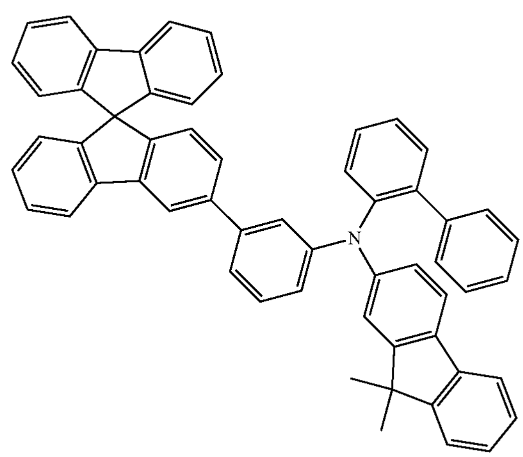

-continued
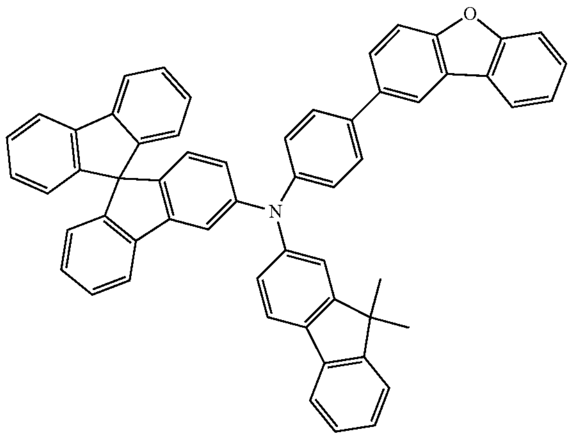
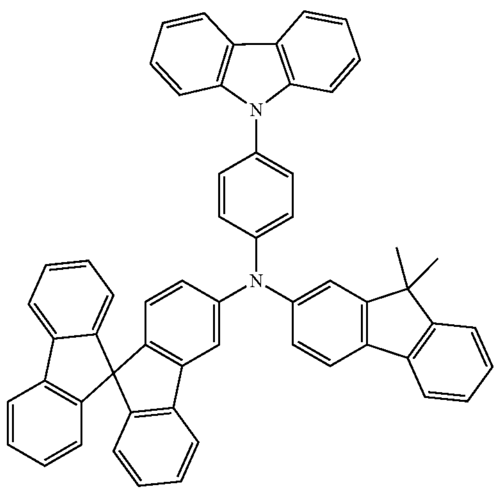
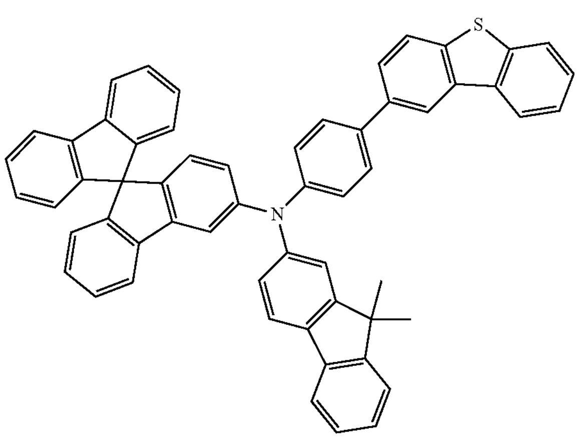
-continued
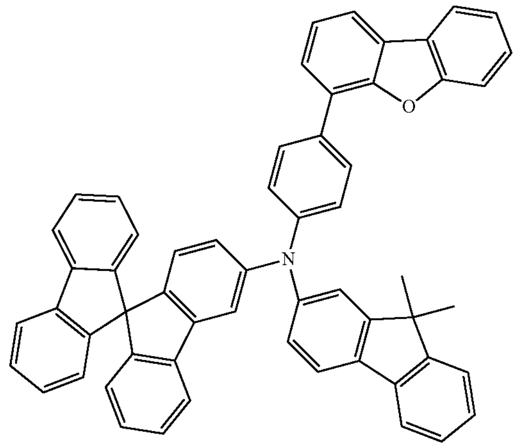
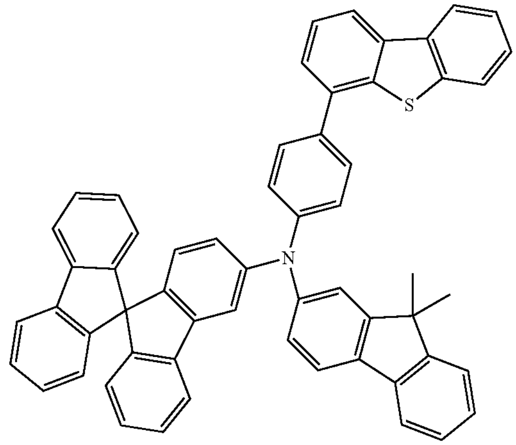
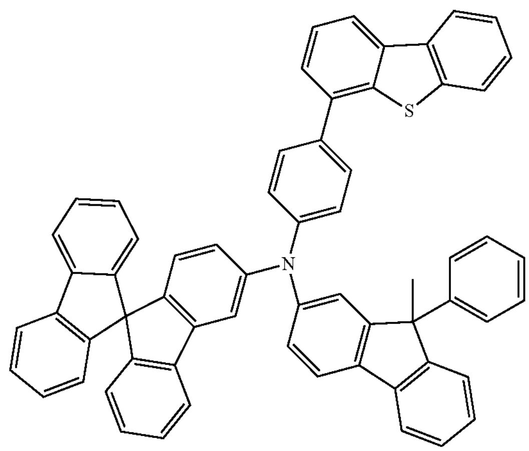
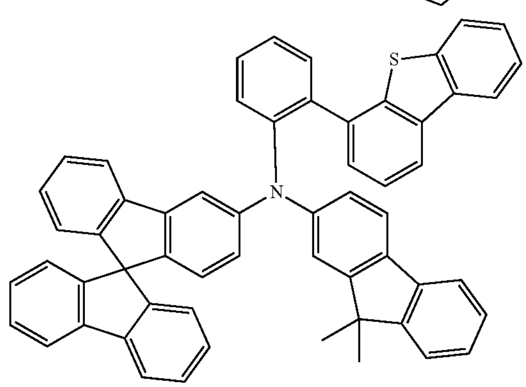

-continued
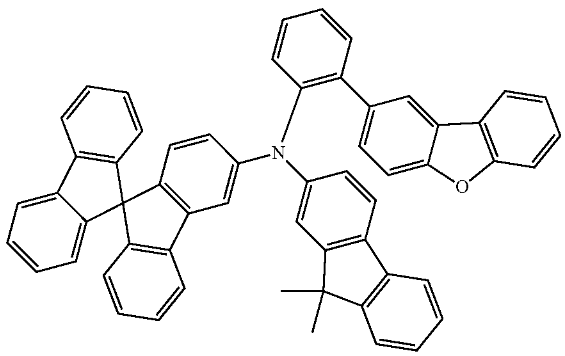
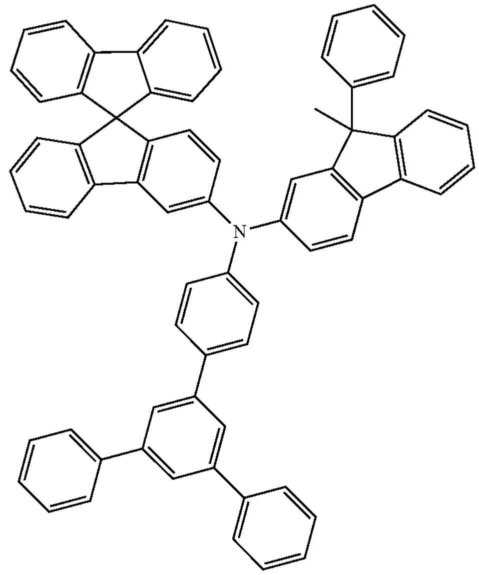
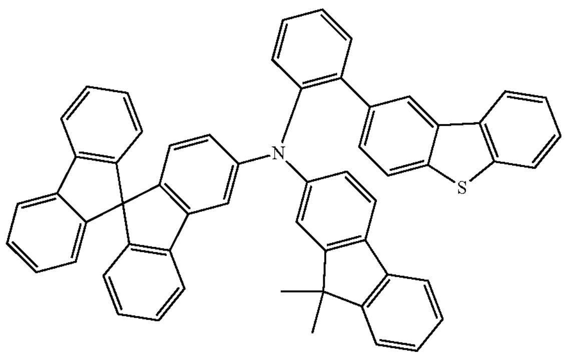
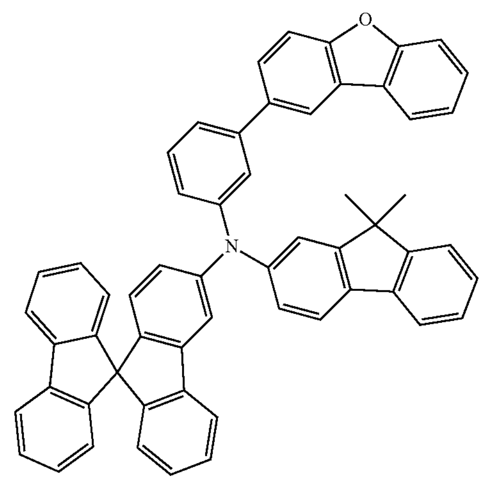
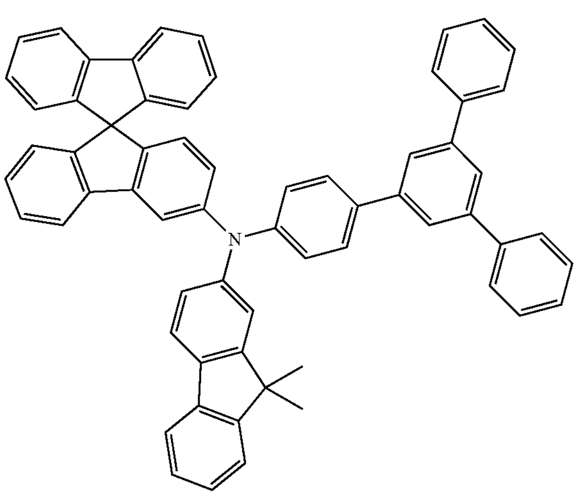
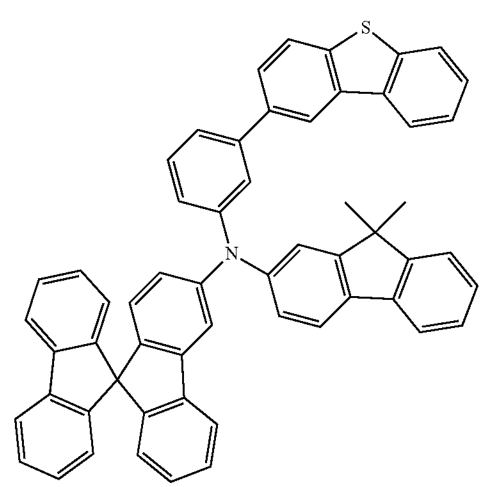
-continued -continued
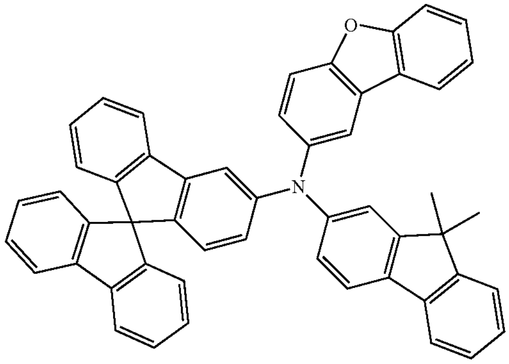
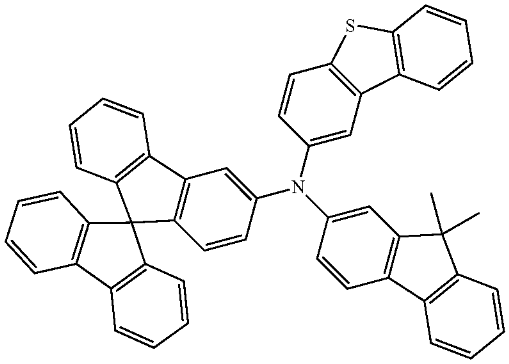
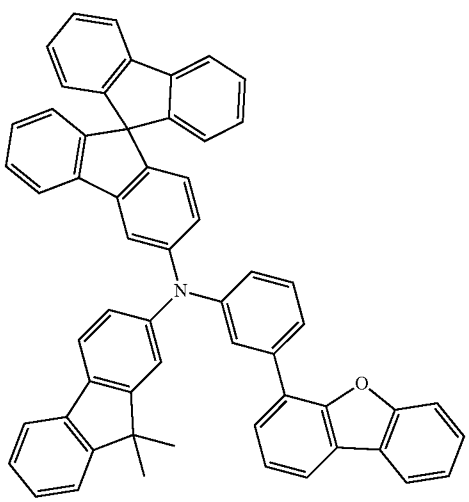
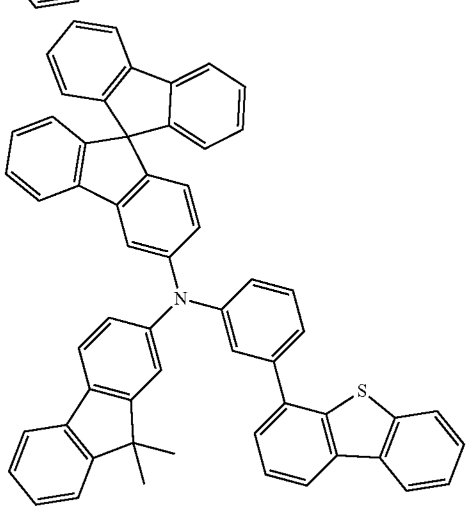
-continued
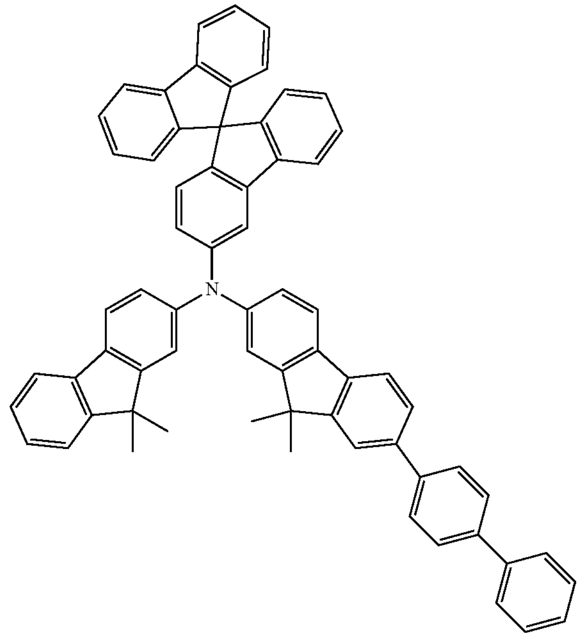
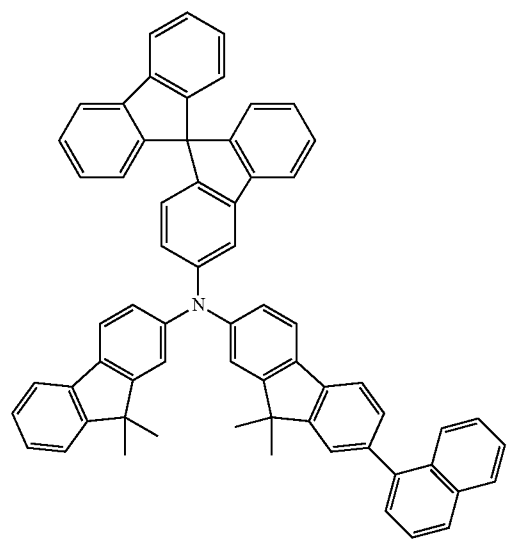
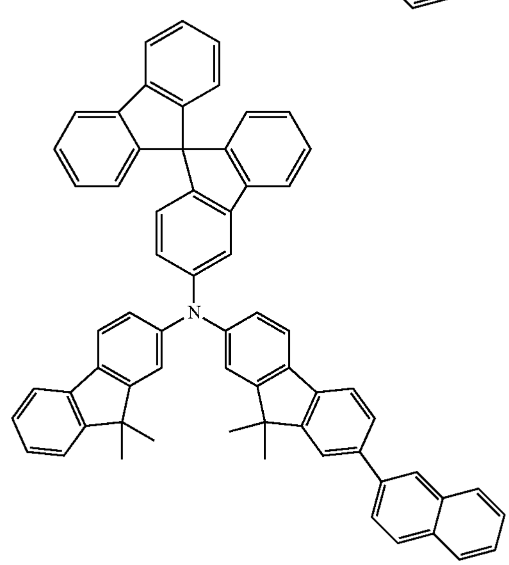

-continued
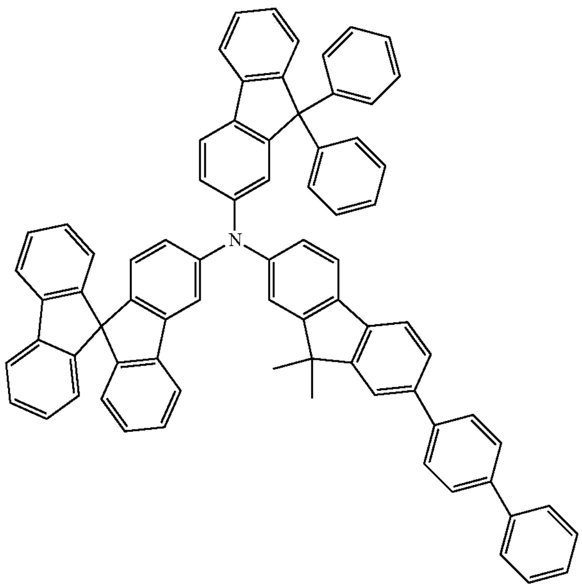
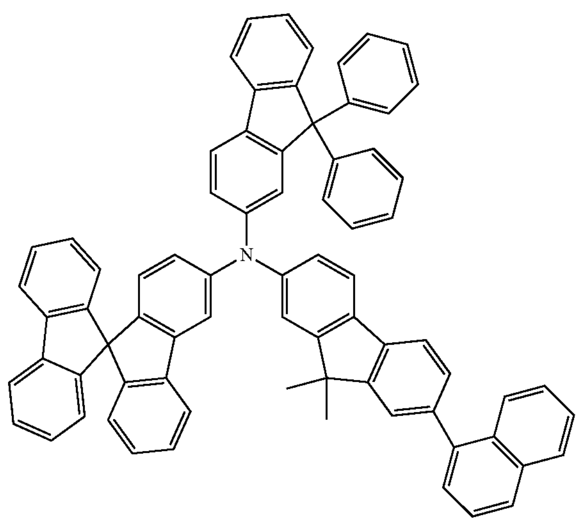
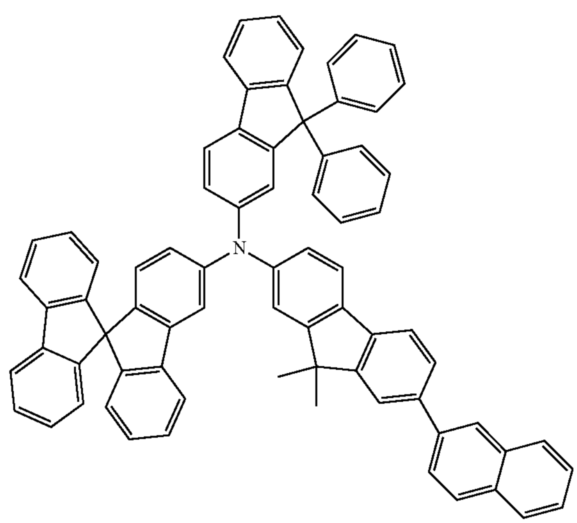
-continued
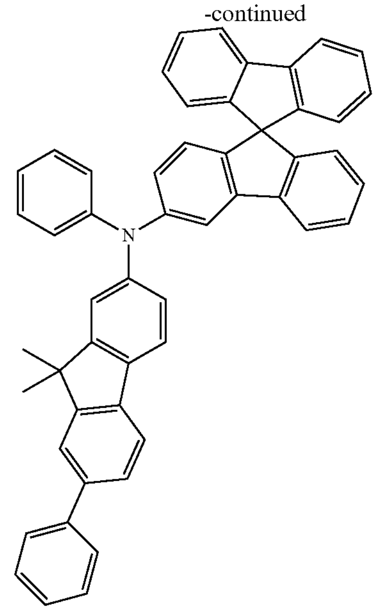
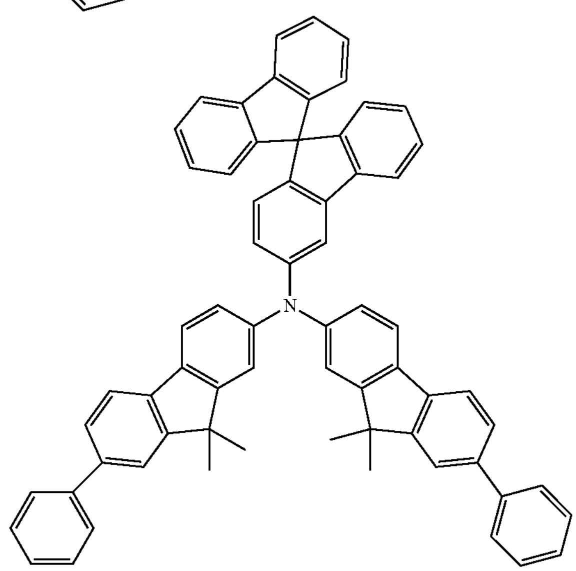
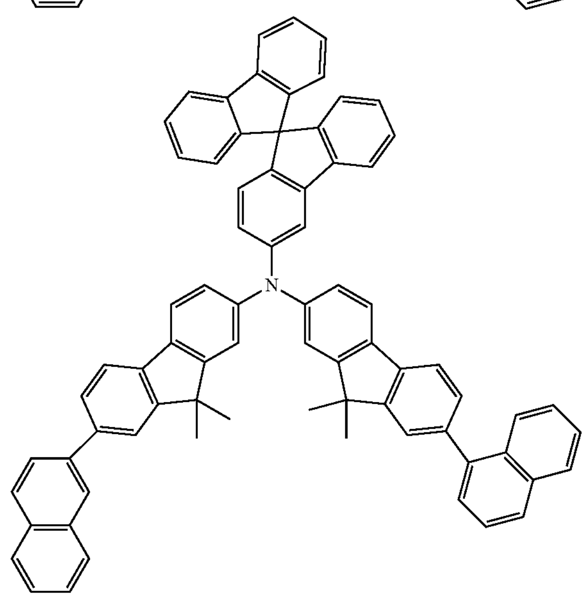

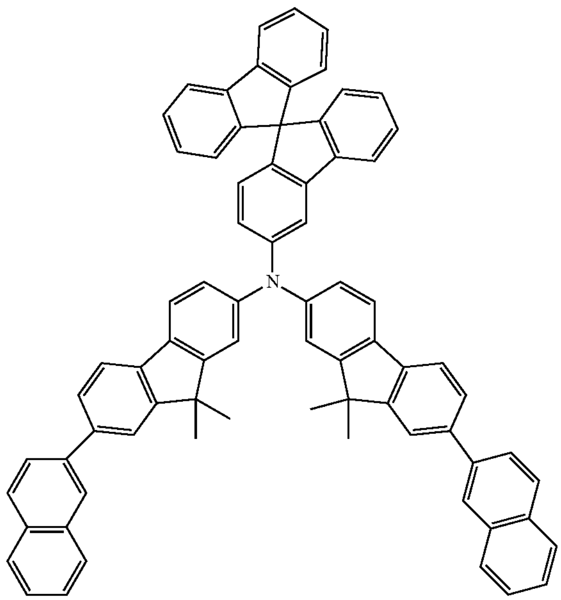
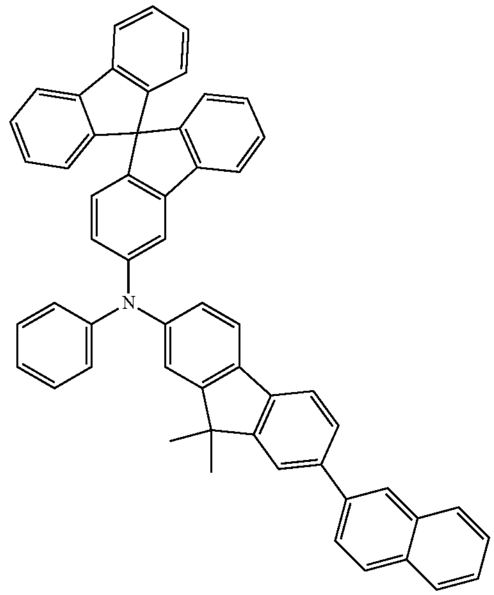
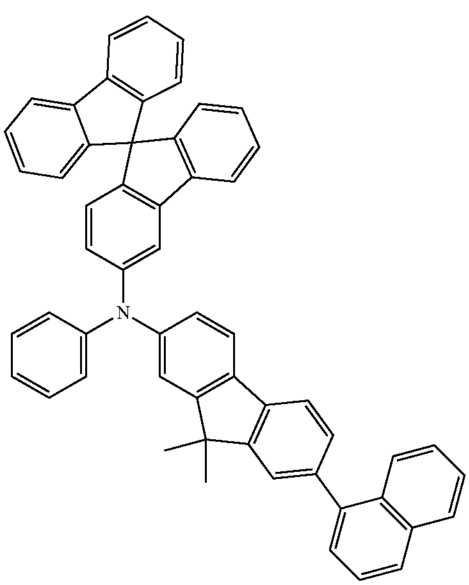
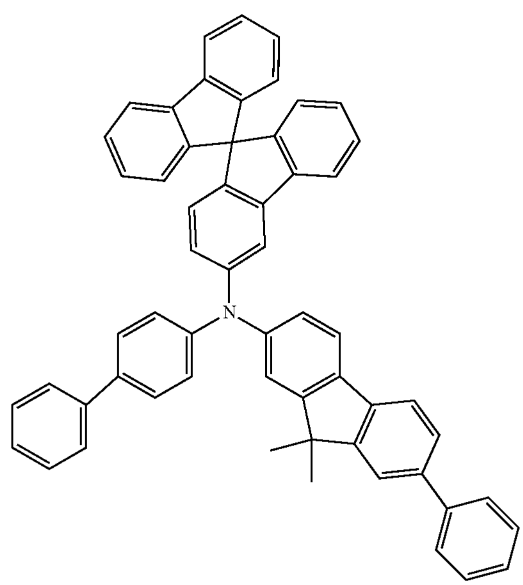 [SMILES: CC1(C)c2cc(-c3ccccc3)ccc2-c2ccc(N(c3ccc(-c4ccccc4)cc3)c3ccc4c(c3)-c3ccccc3C43c4ccccc4-c4ccccc43)cc21]

-continued
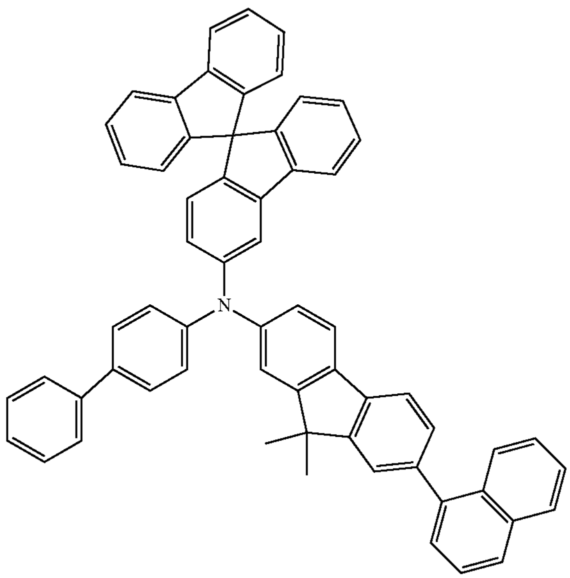
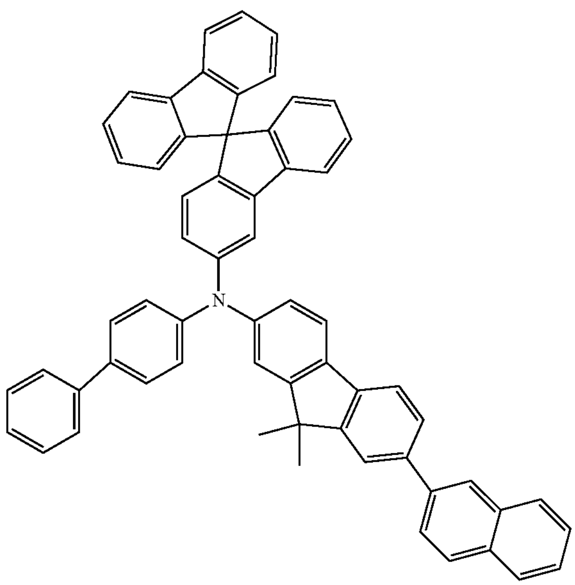
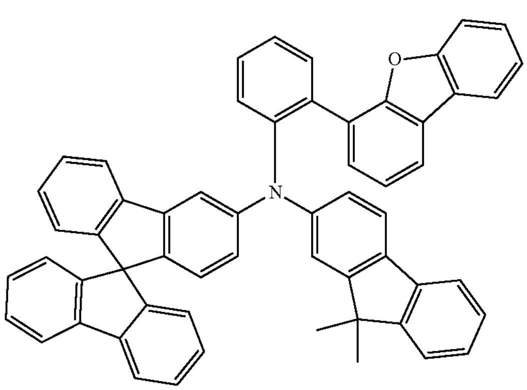
-continued
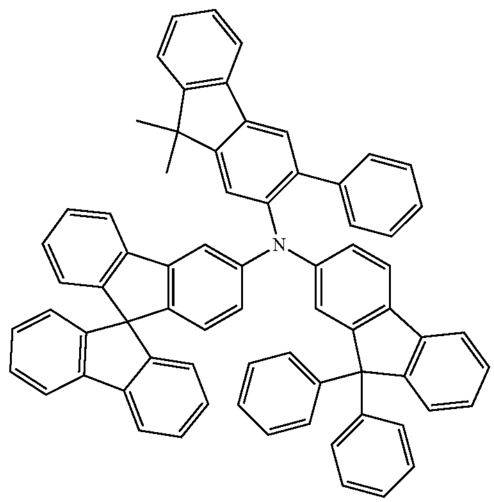
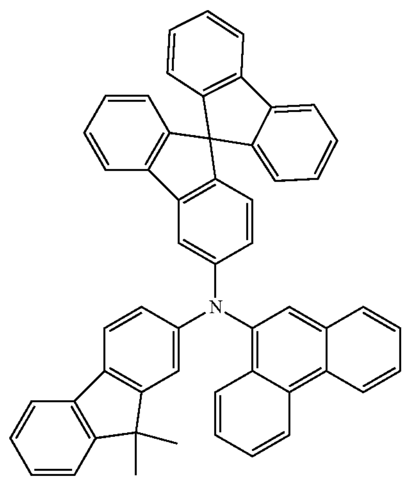
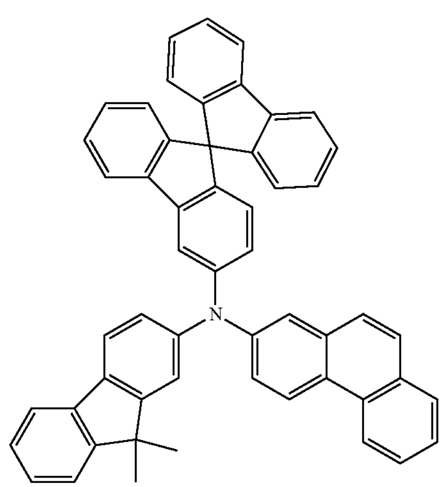

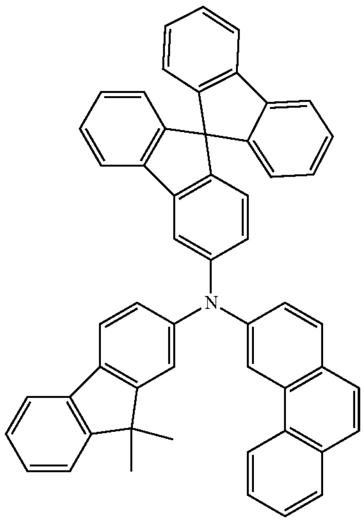
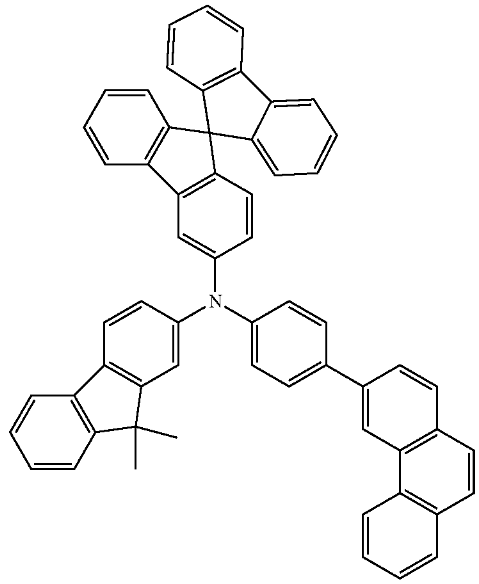
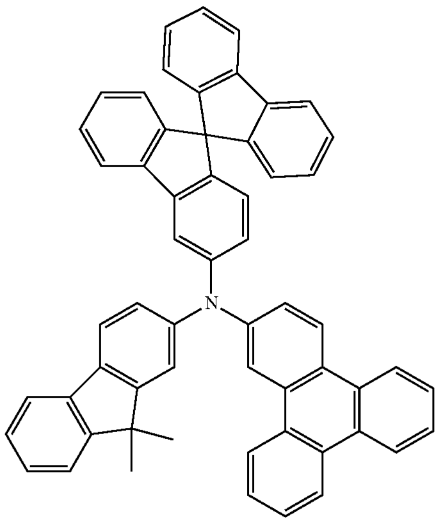
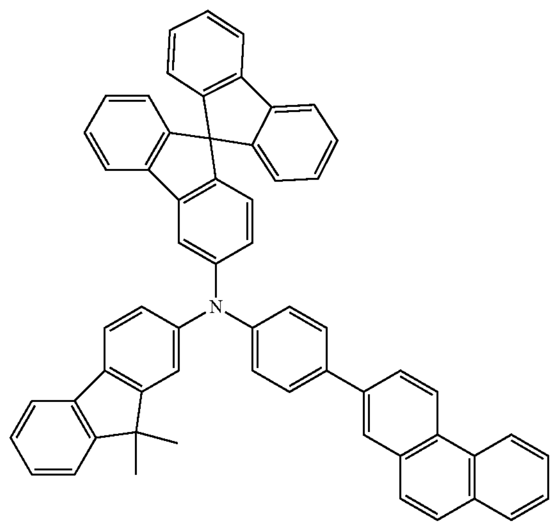
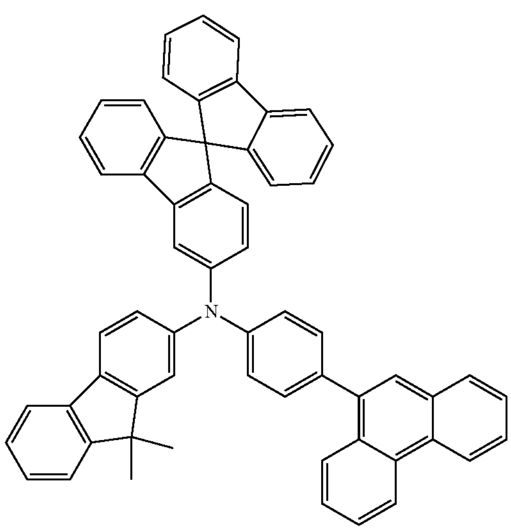
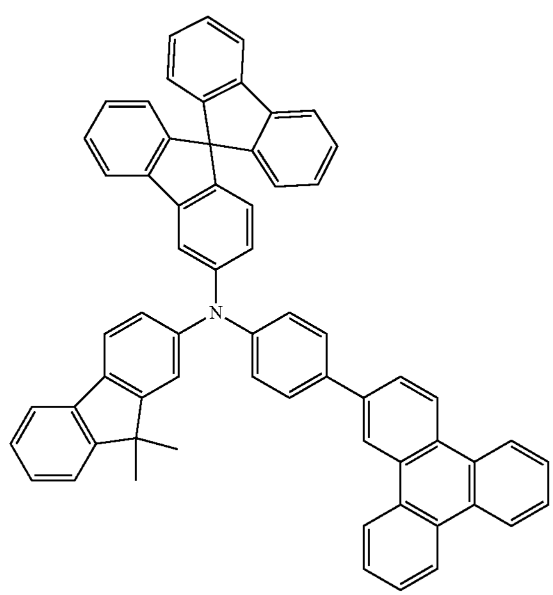
N

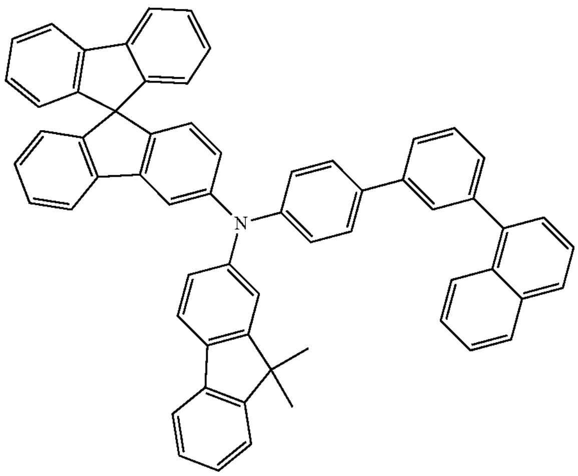
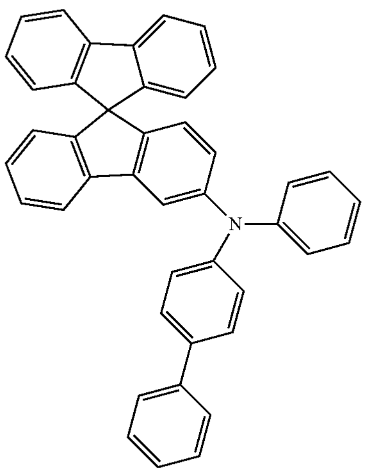
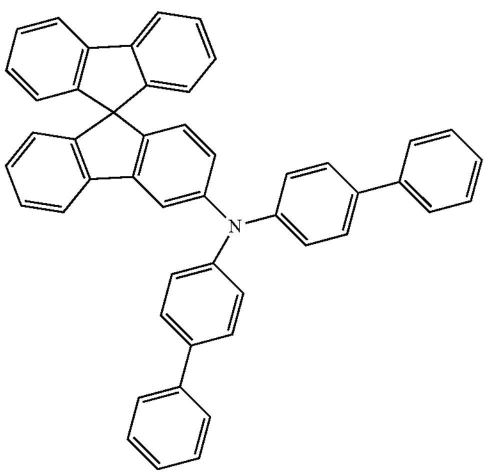
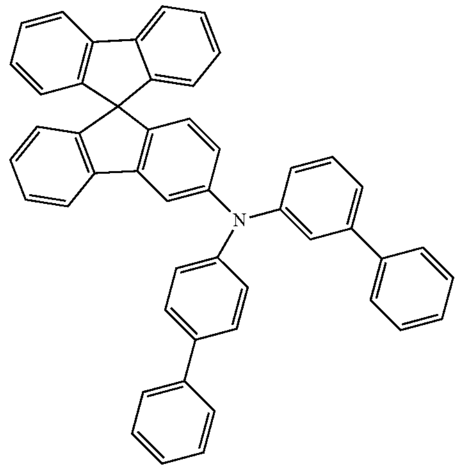
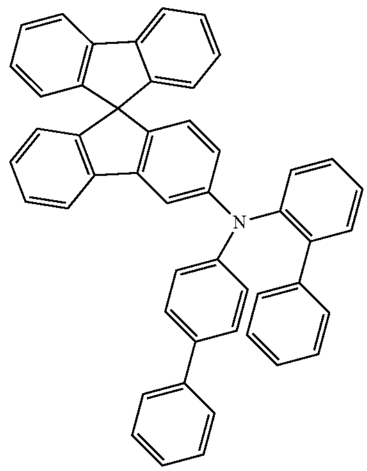
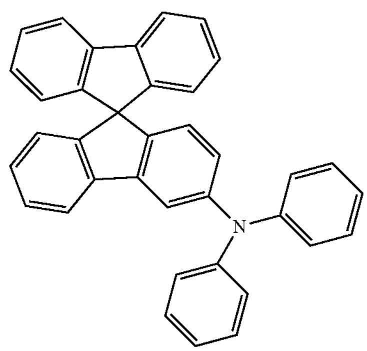
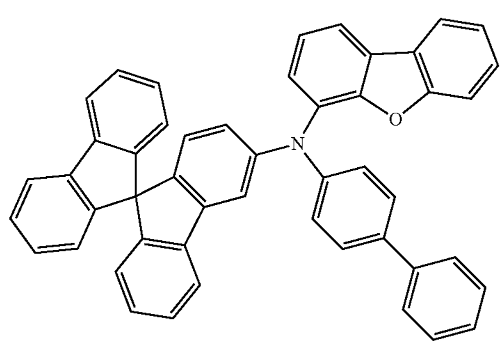
N
O

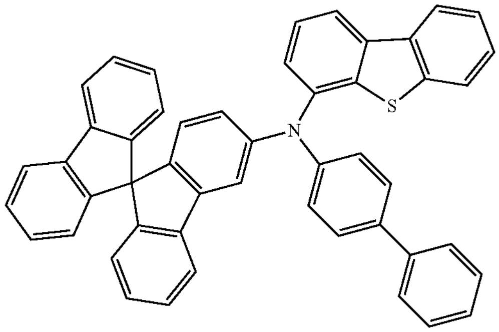
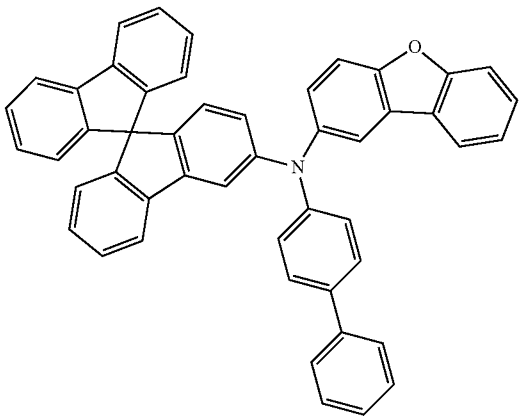
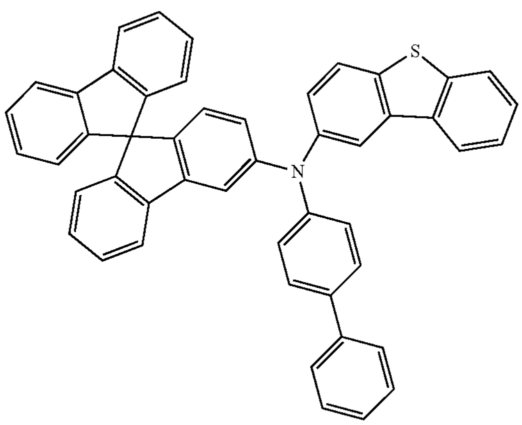
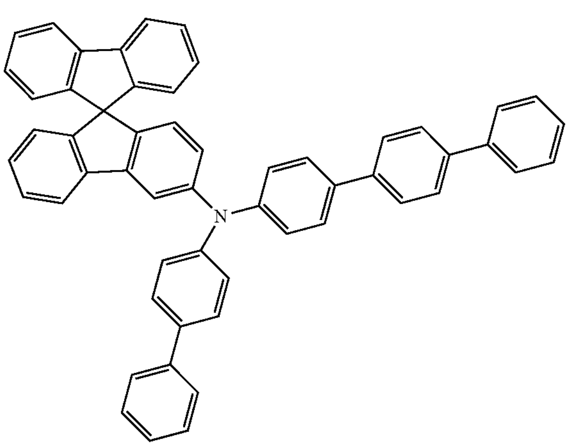
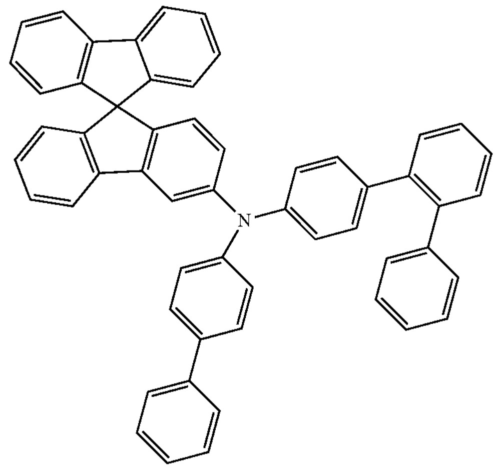
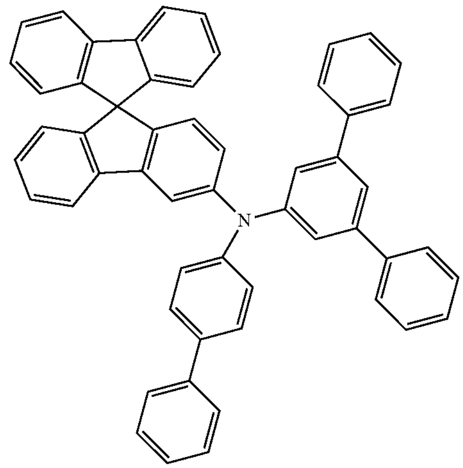
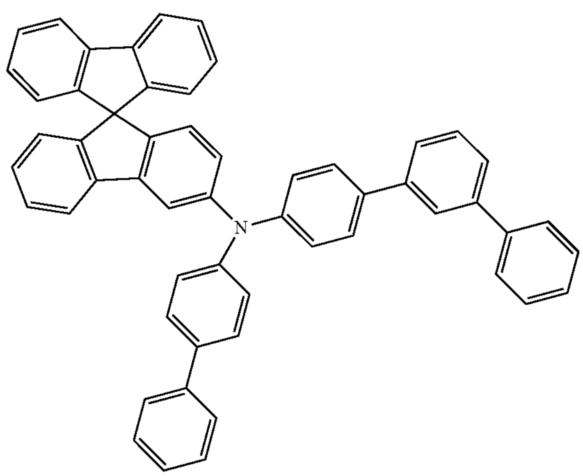

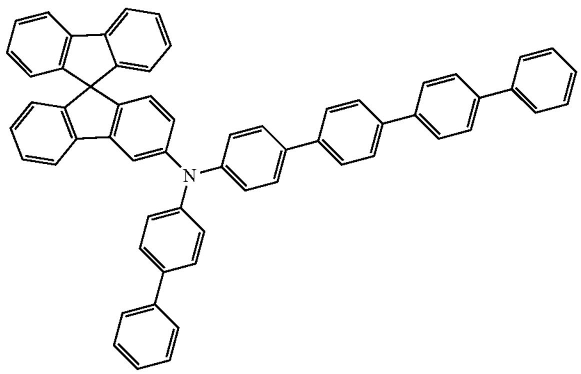
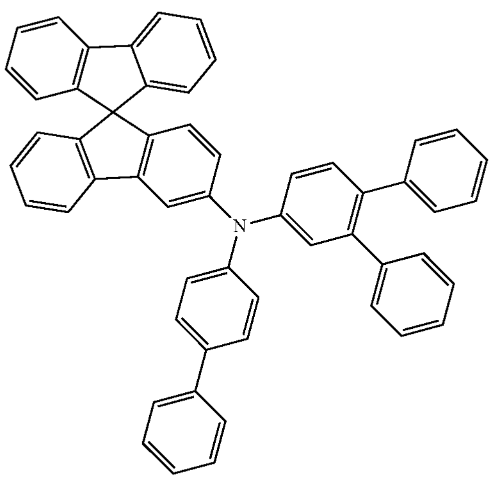
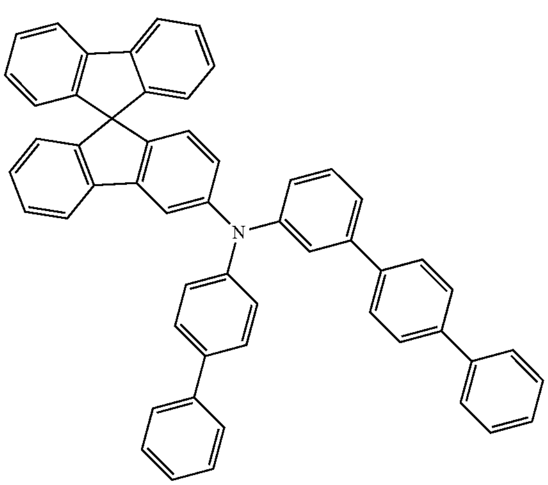
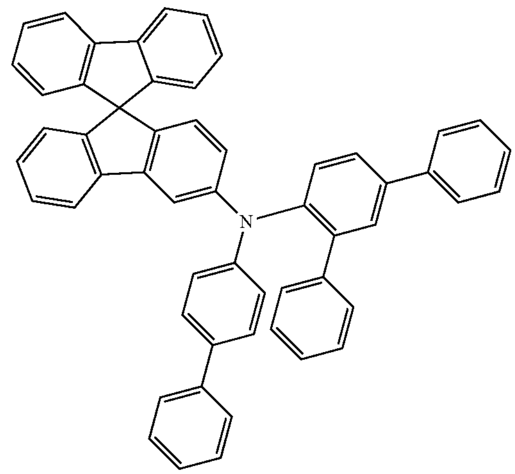
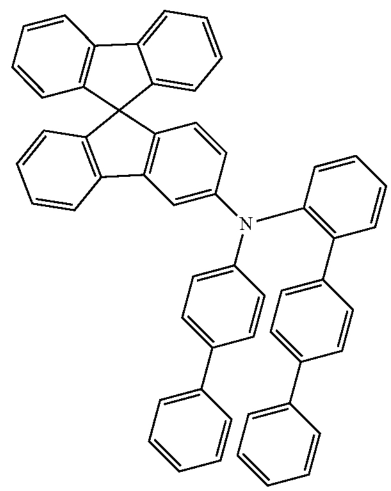
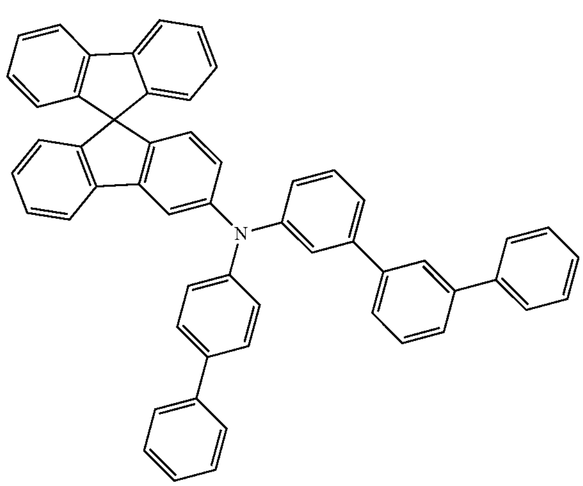

-continued
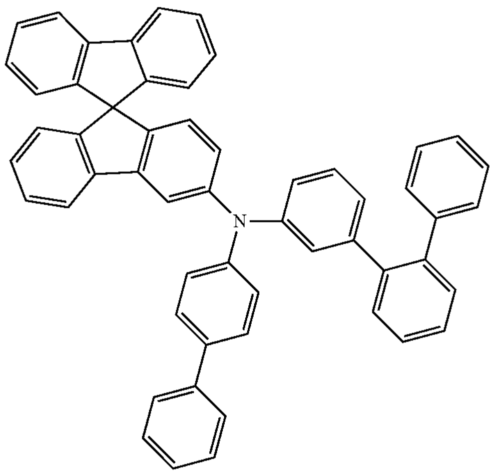
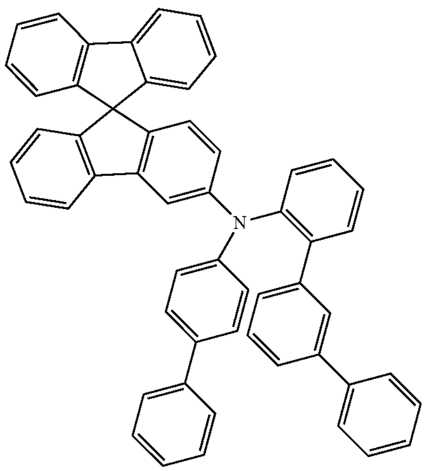
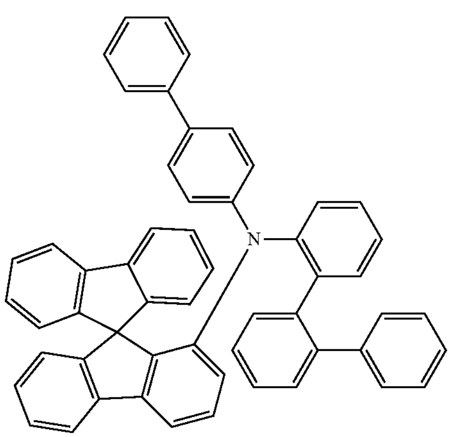
-continued
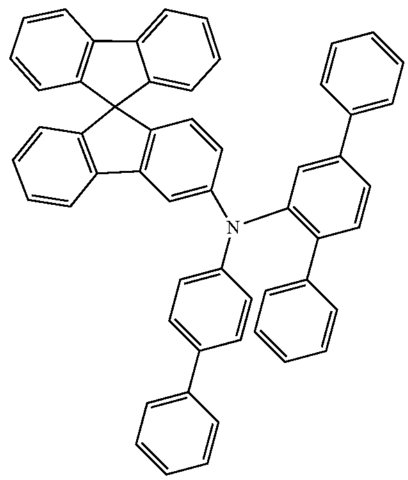
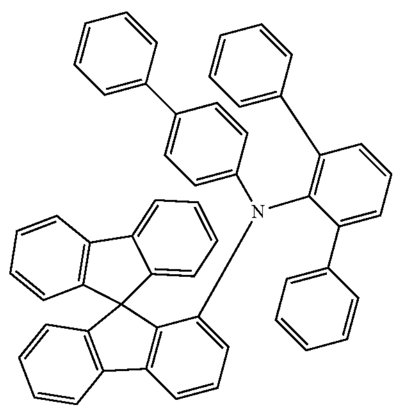
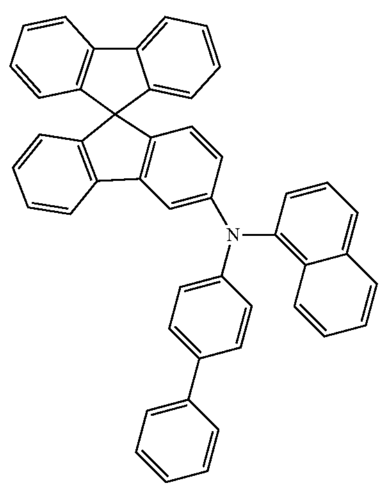

-continued
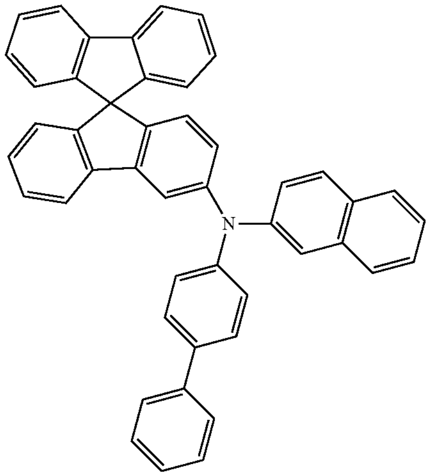
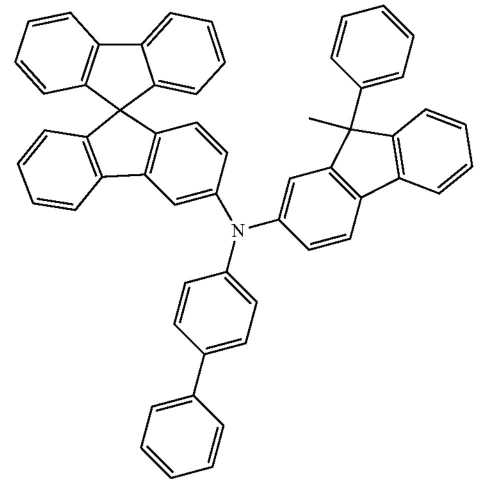
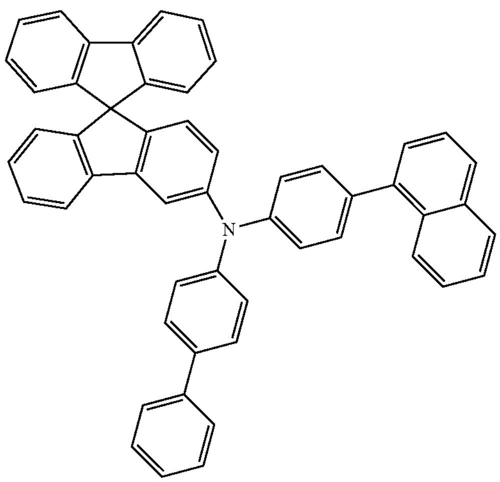
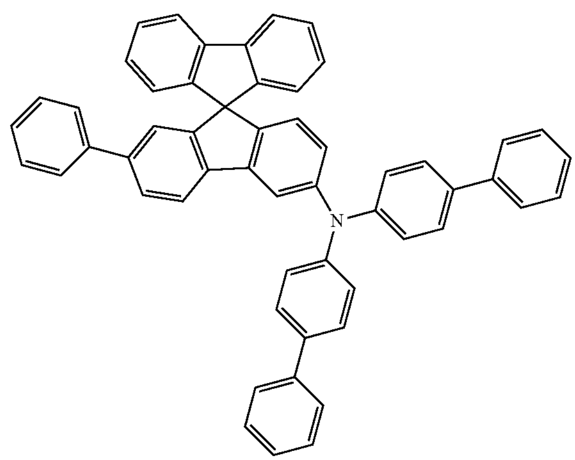
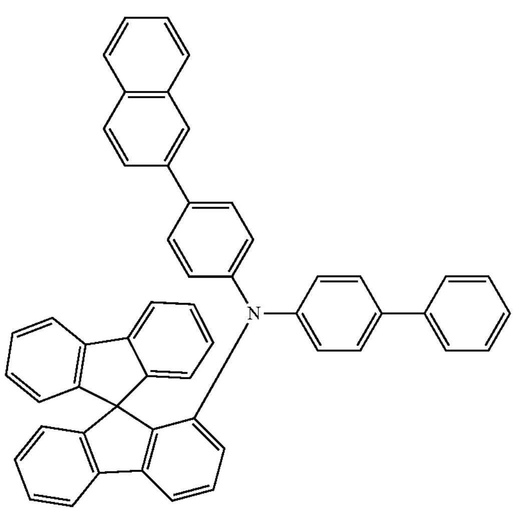
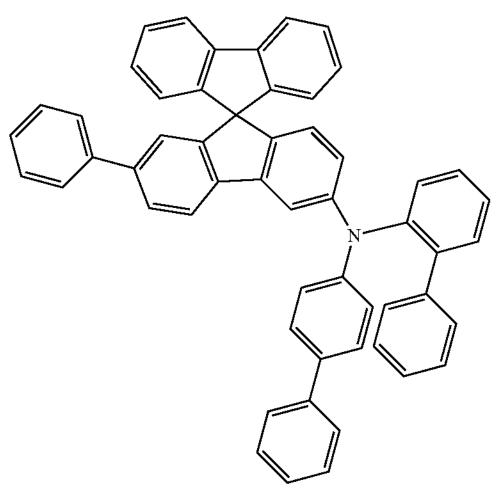

-continued
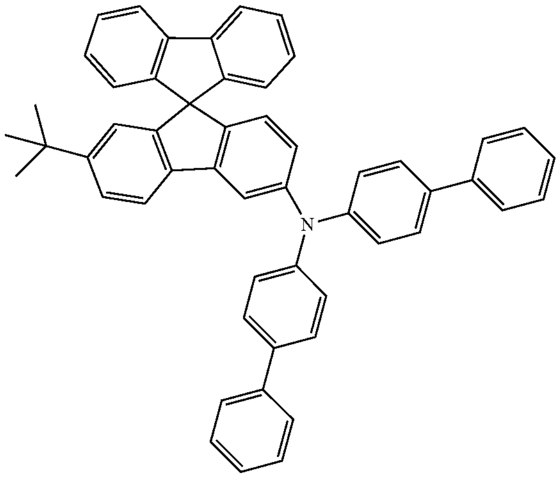
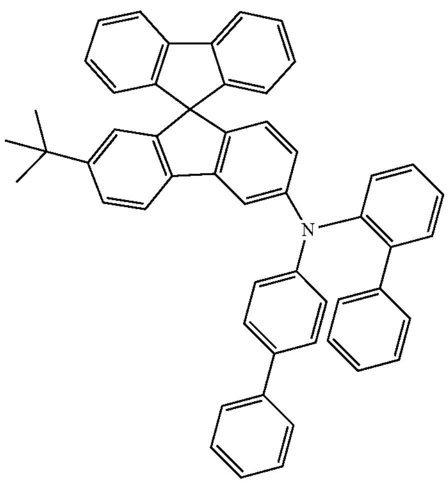
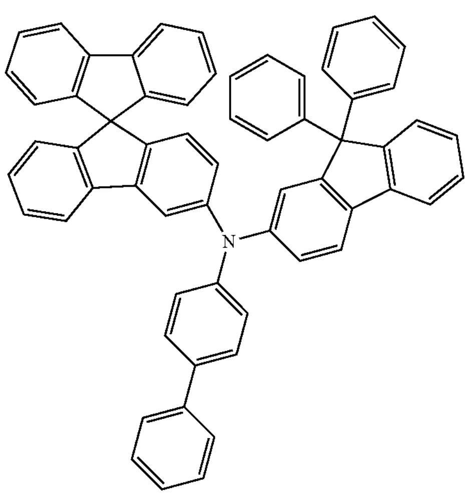
-continued
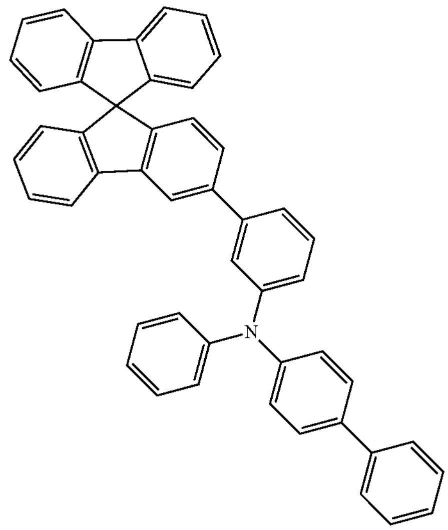
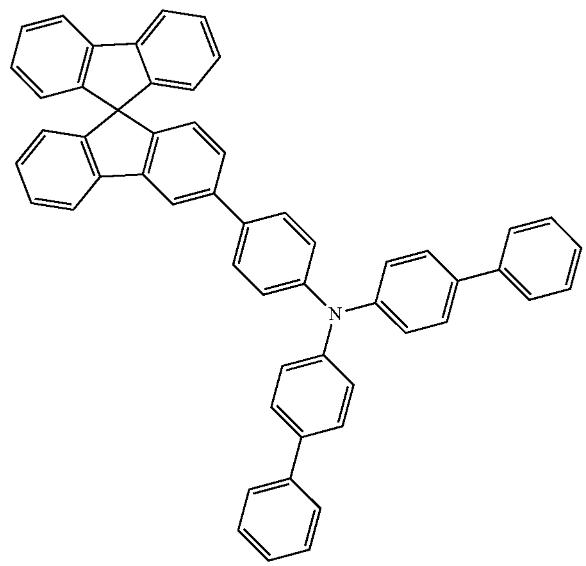
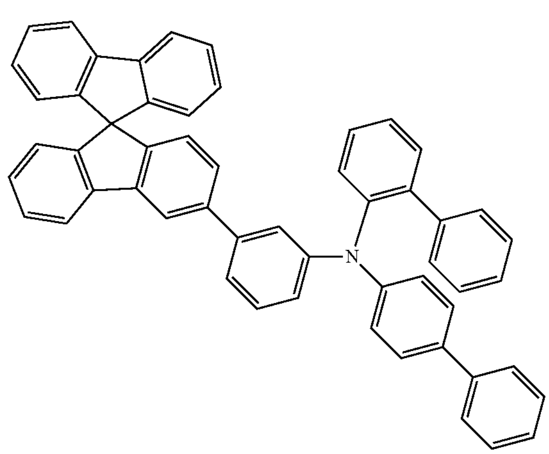

-continued
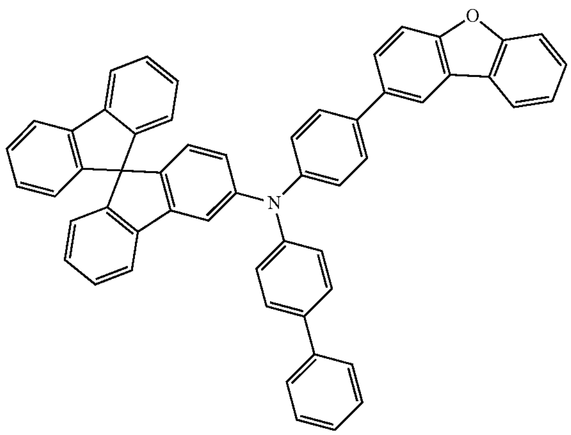
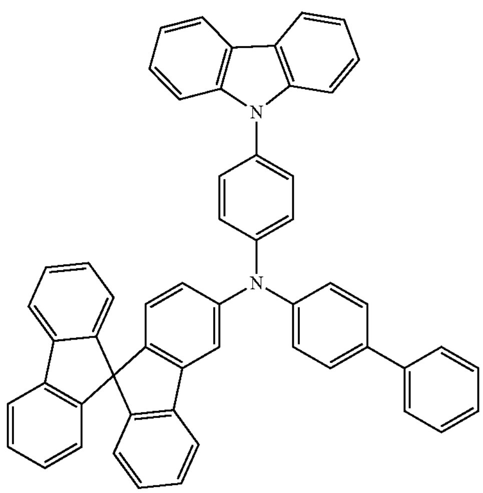
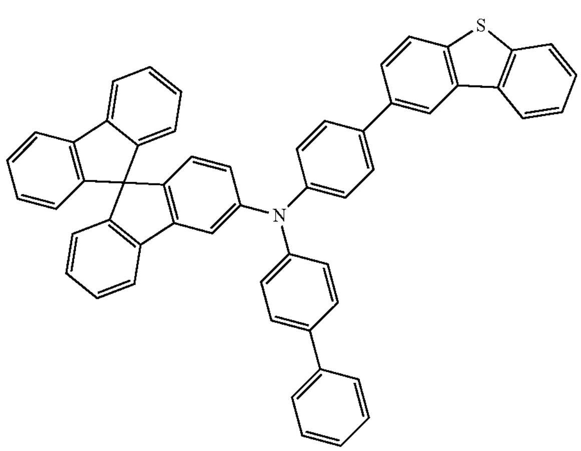
-continued
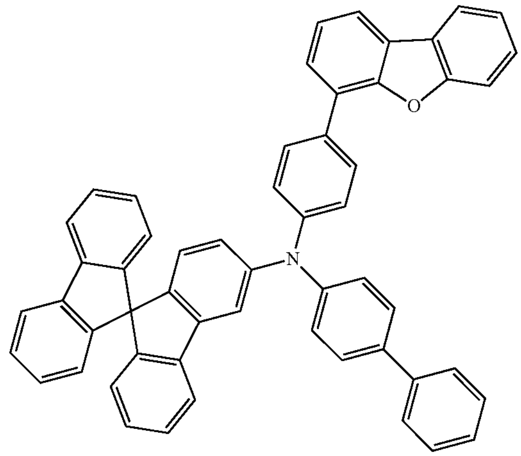
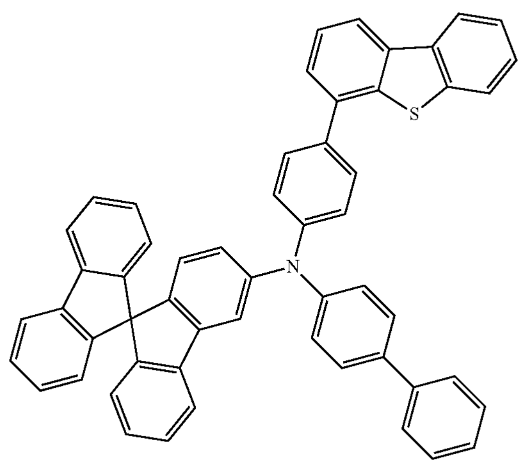
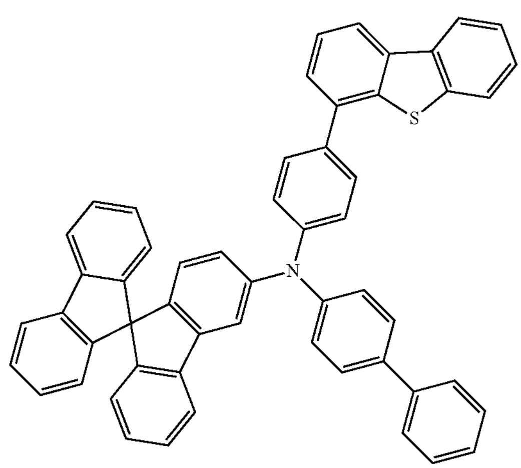

-continued
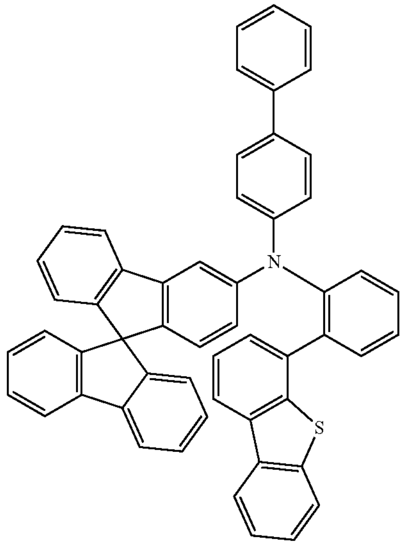
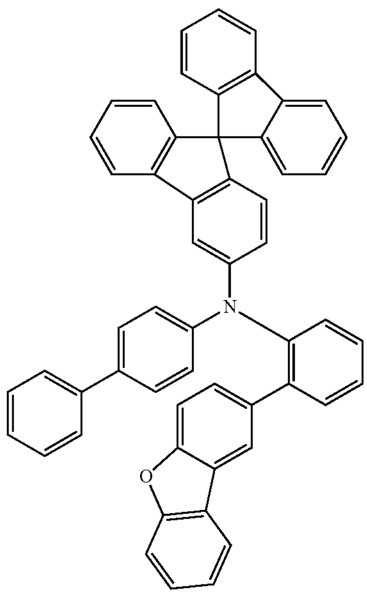
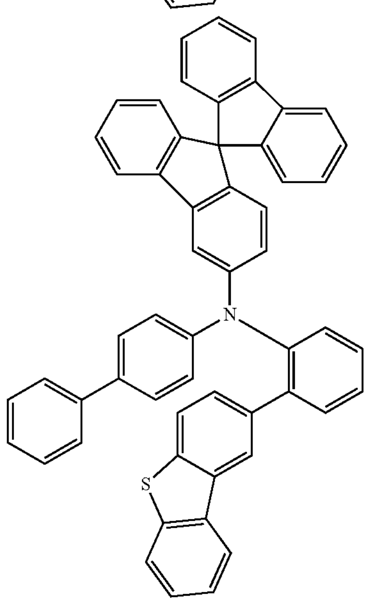
-continued
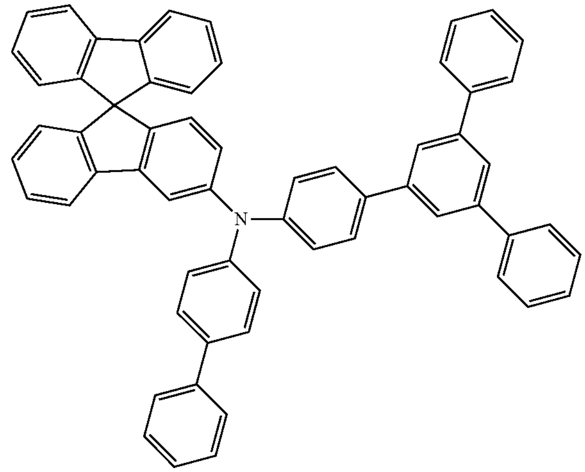
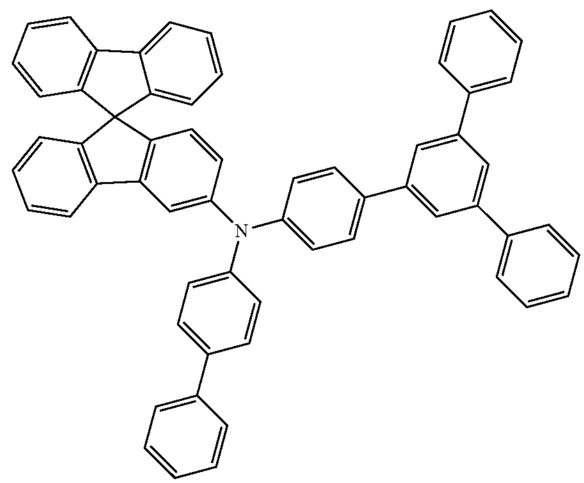
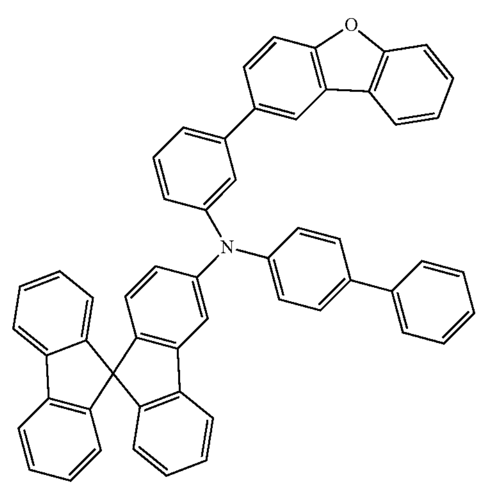

-continued
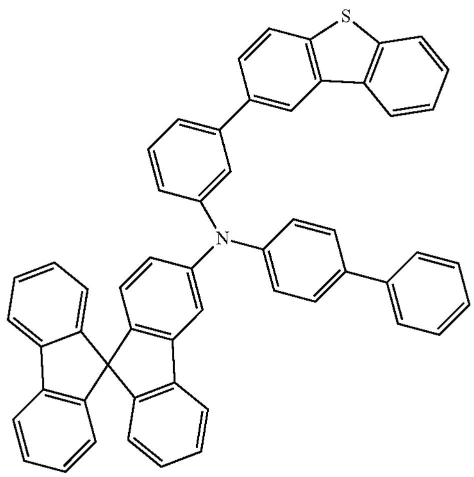
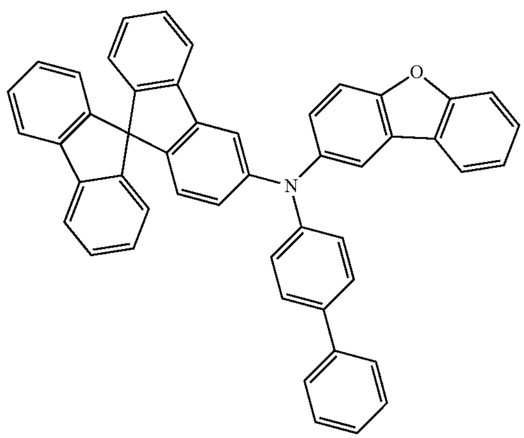
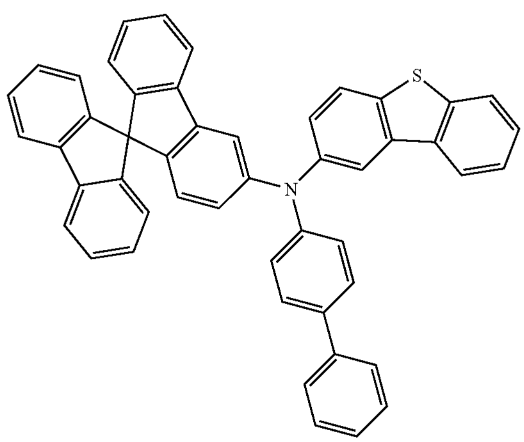
-continued
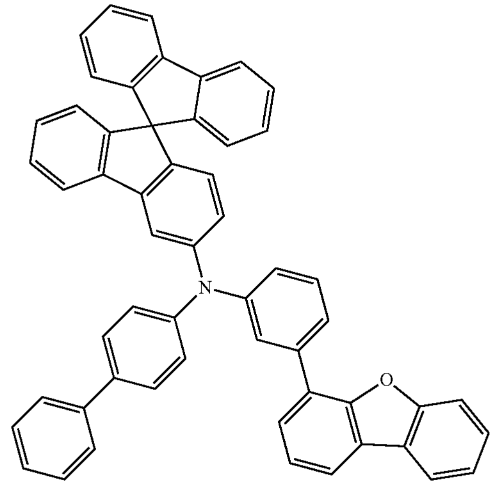
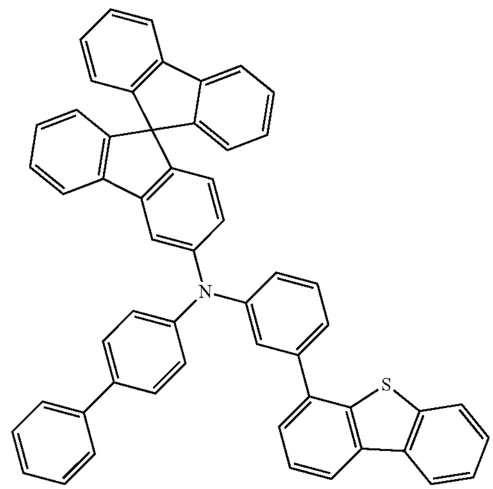
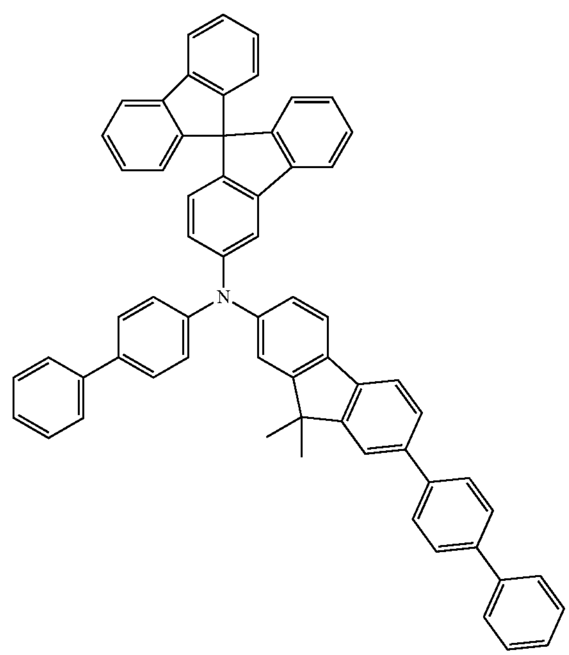

-continued
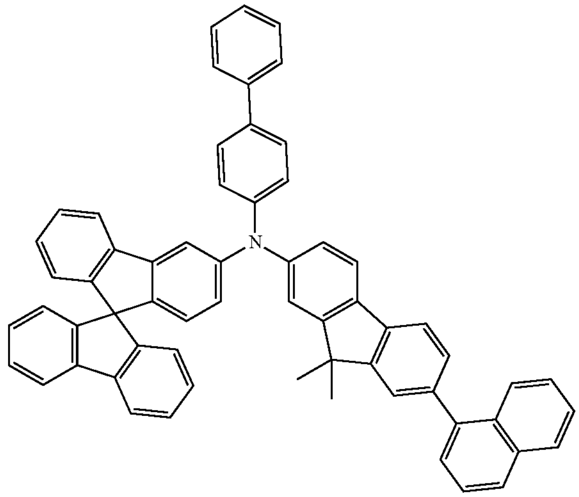
-continued
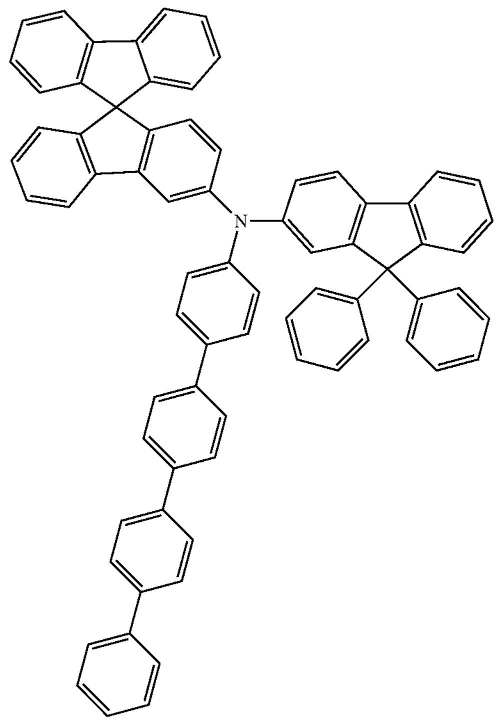
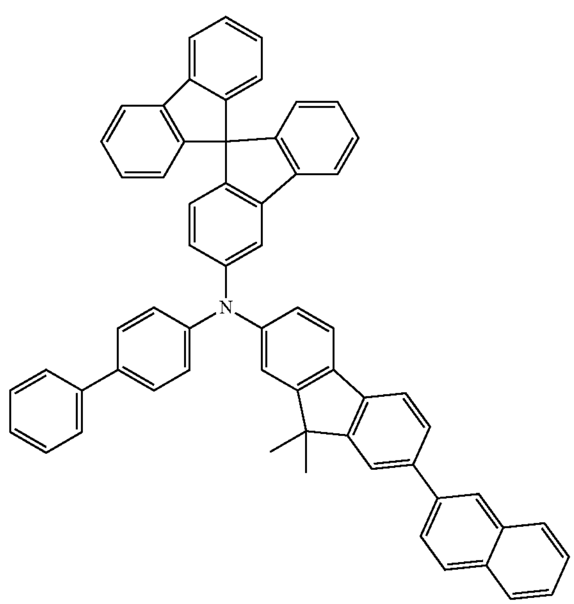
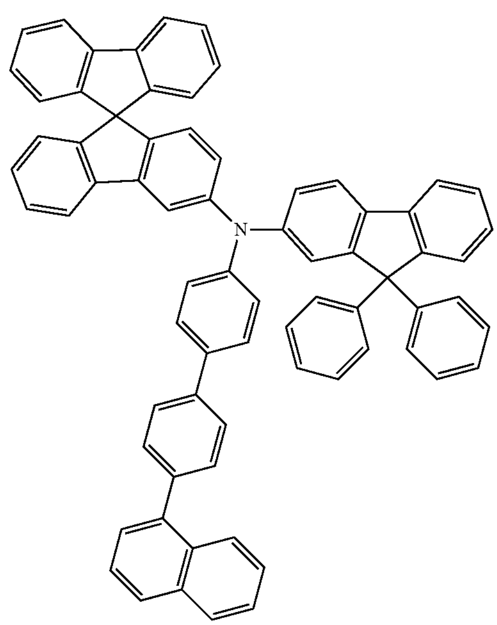

-continued
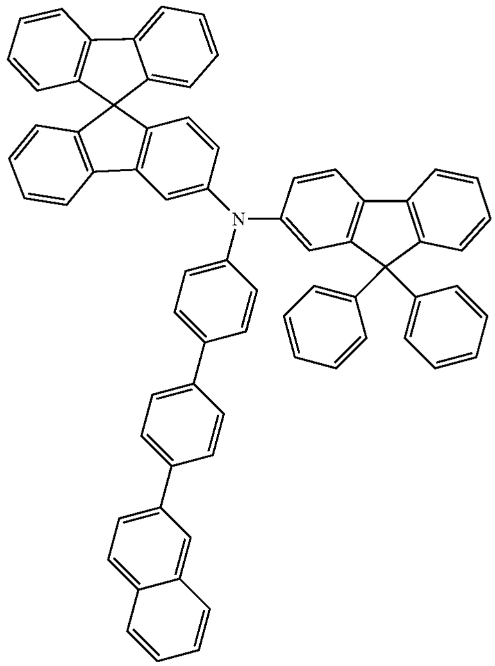
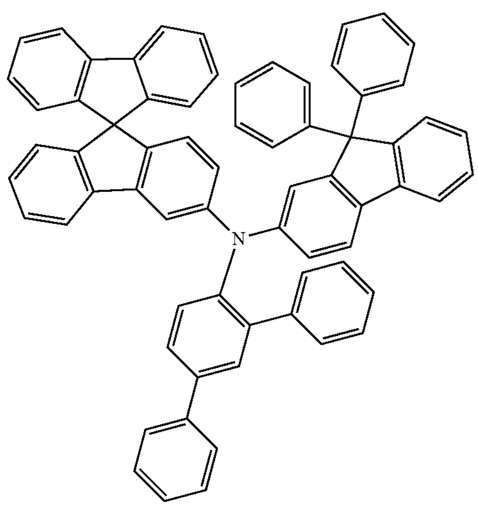
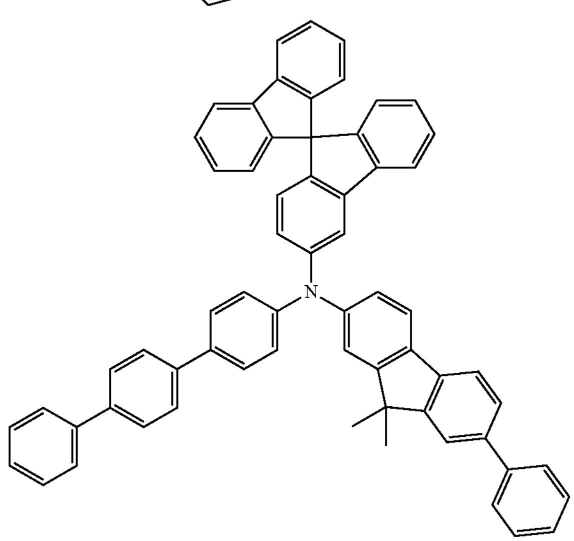
-continued
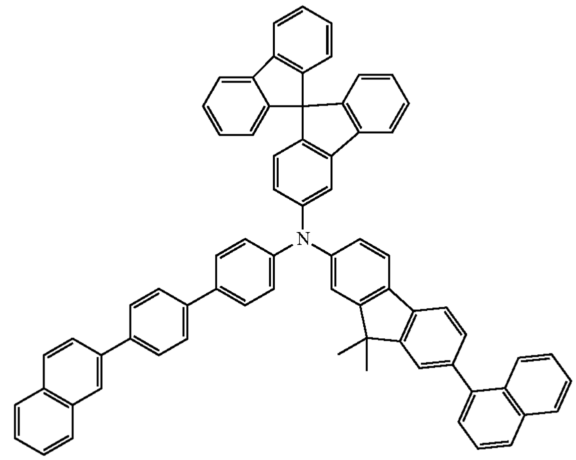
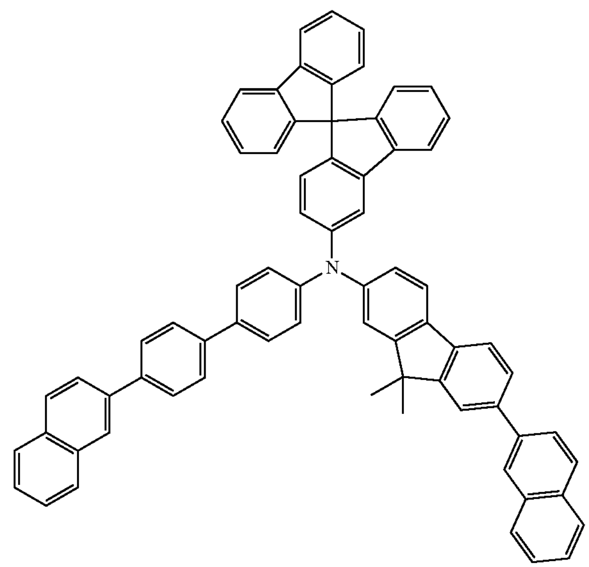
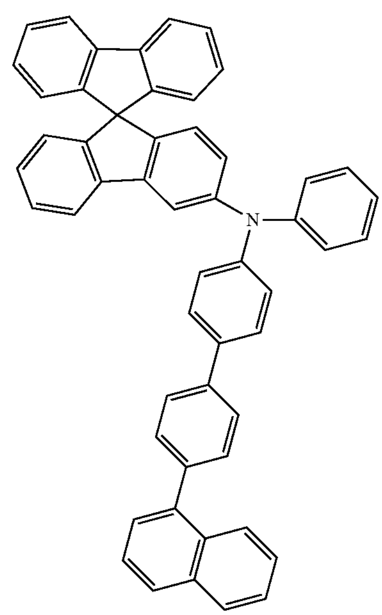

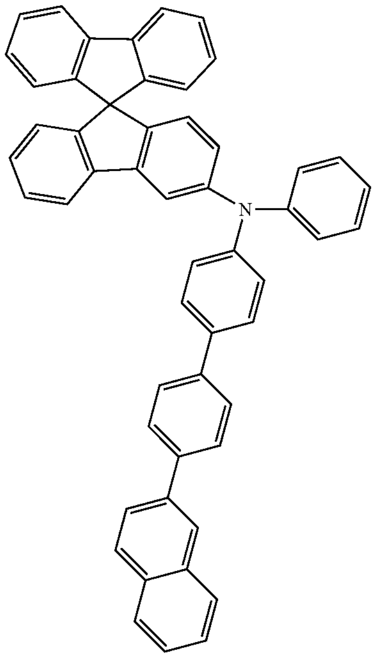
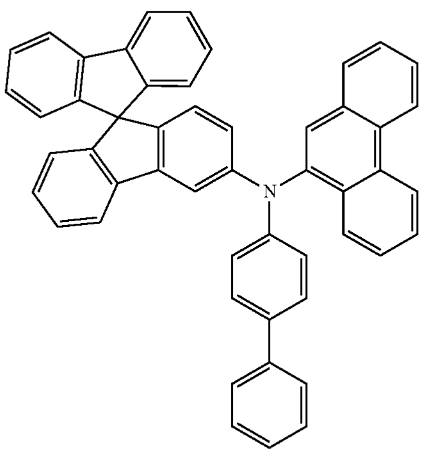
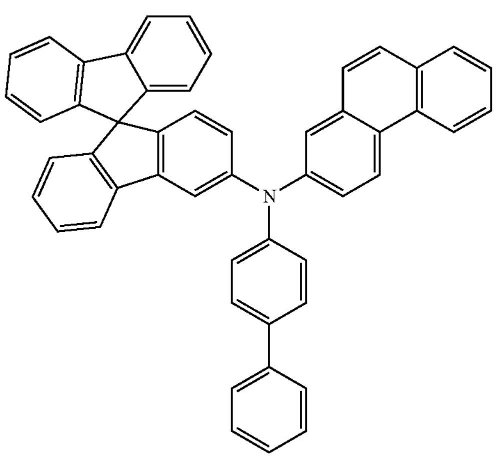
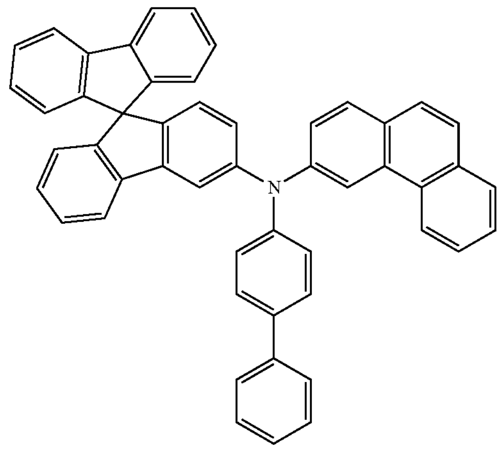
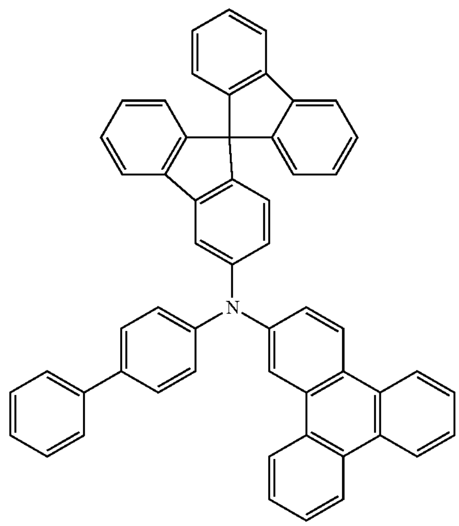
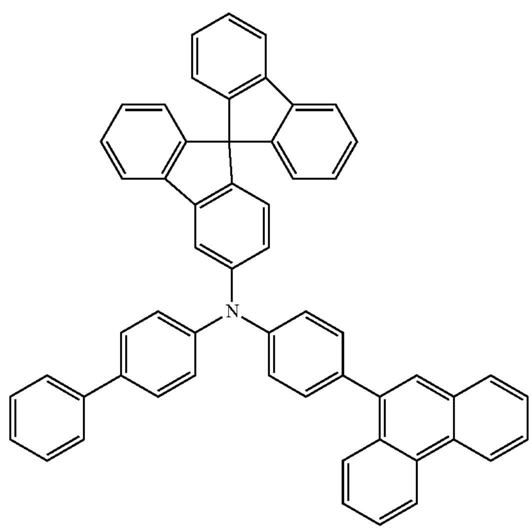

-continued
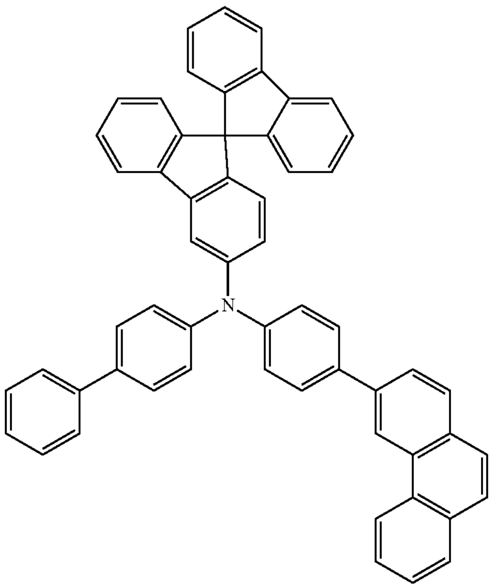
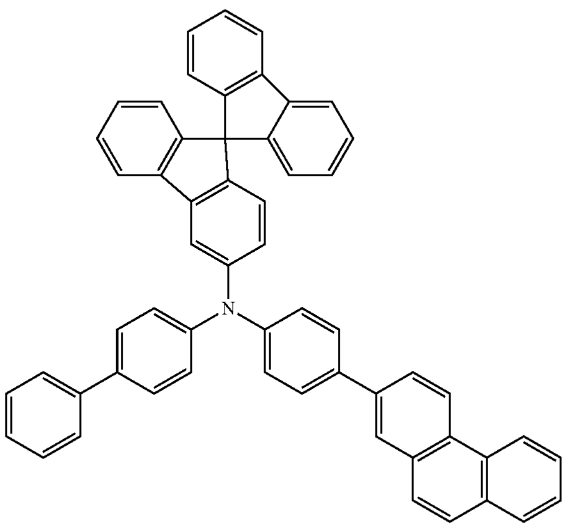
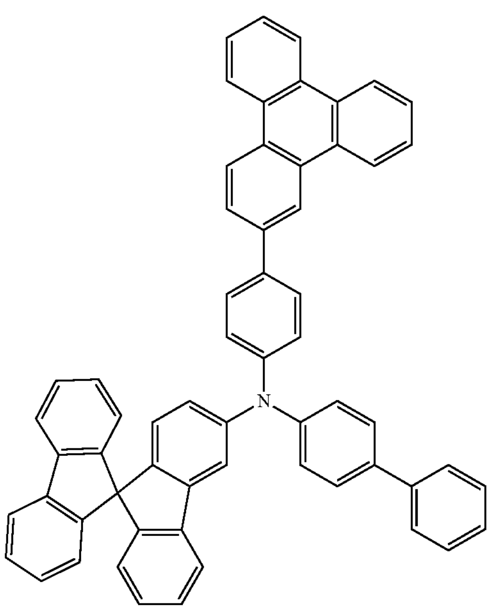
-continued
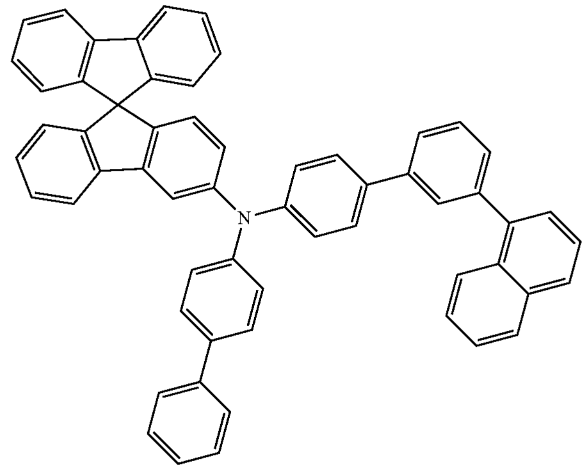
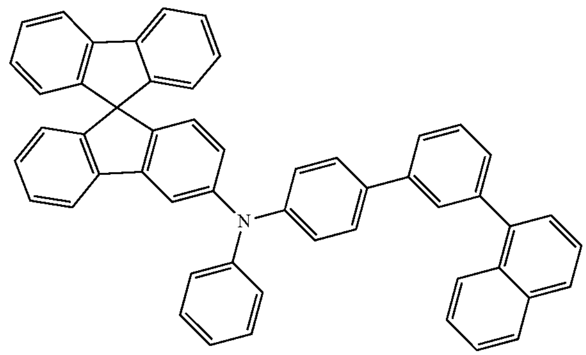
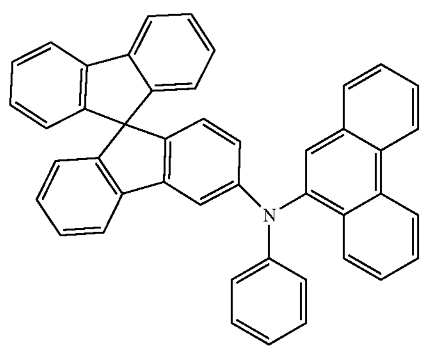
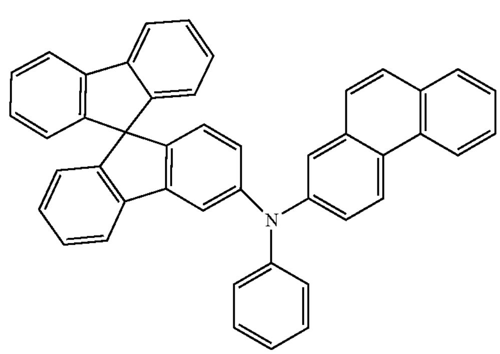

-continued
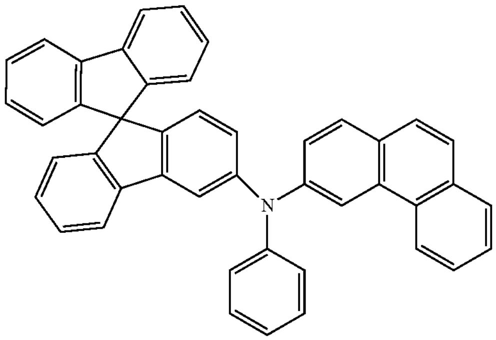
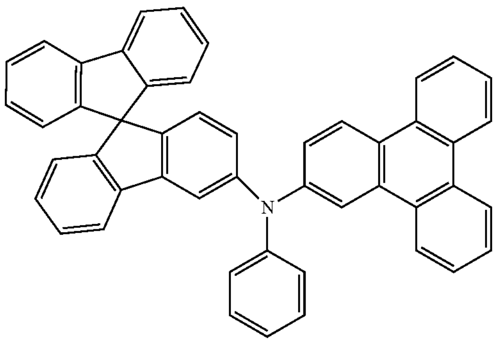
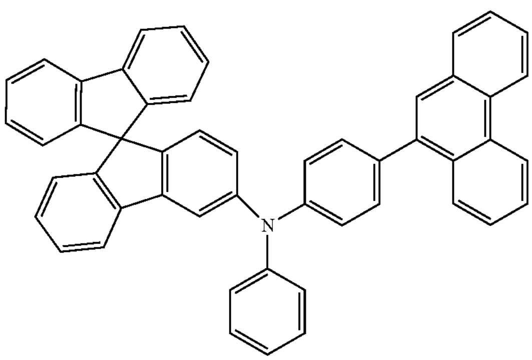
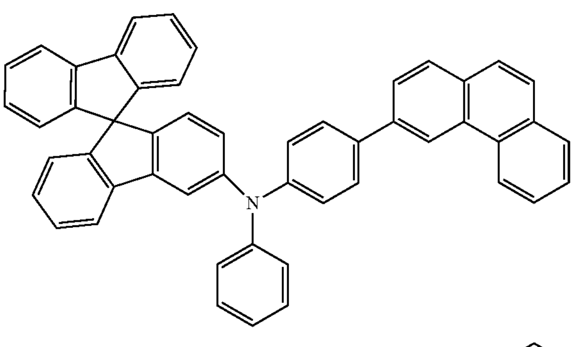
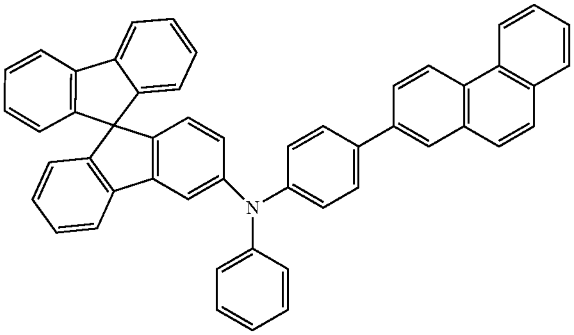
-continued
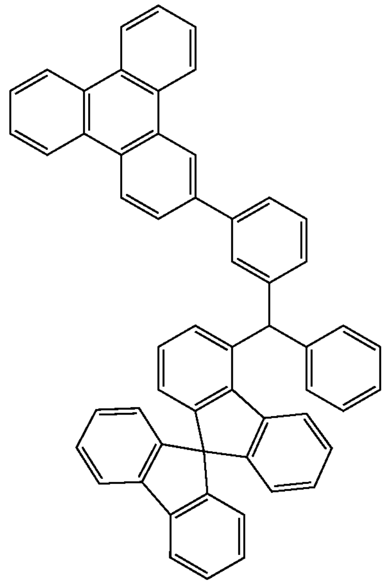
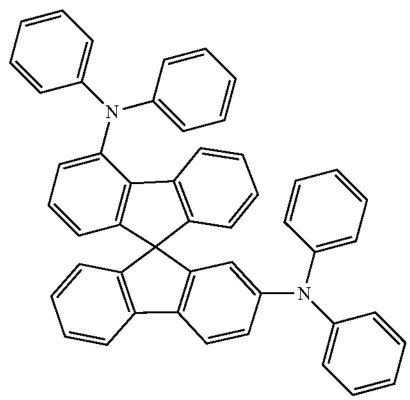
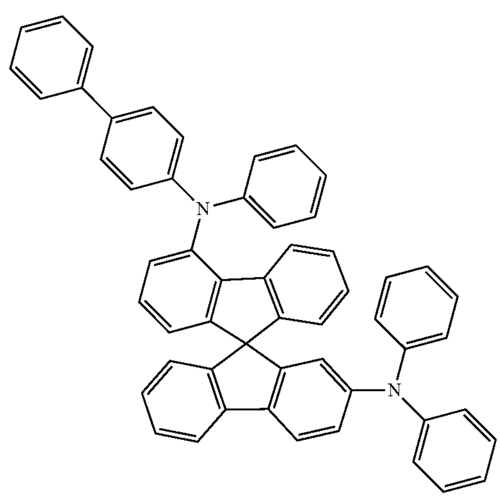

-continued
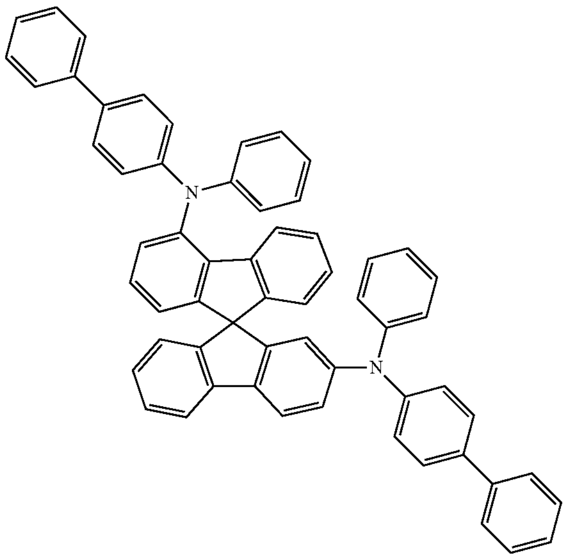
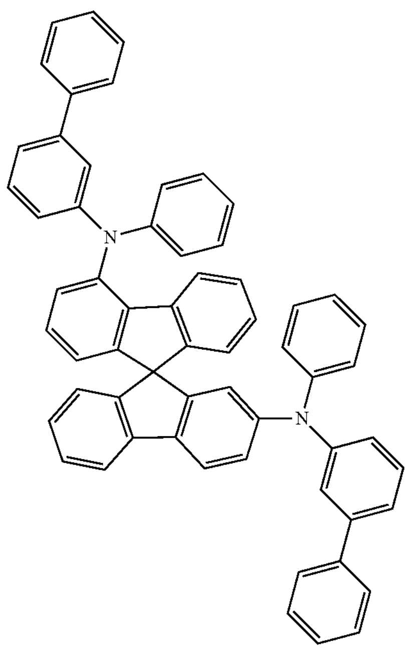
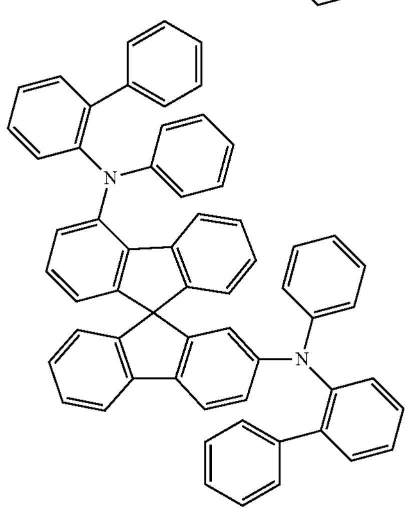
-continued
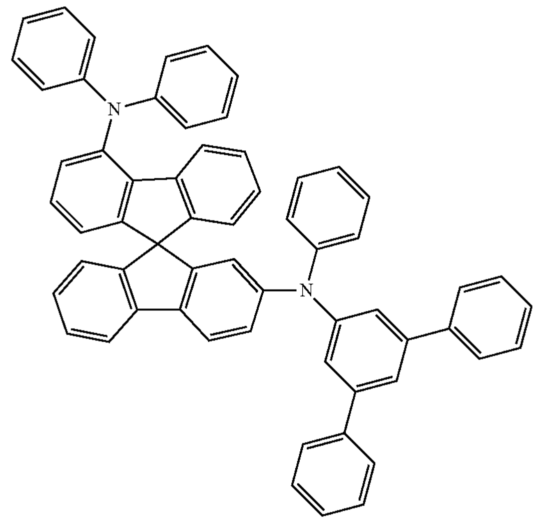
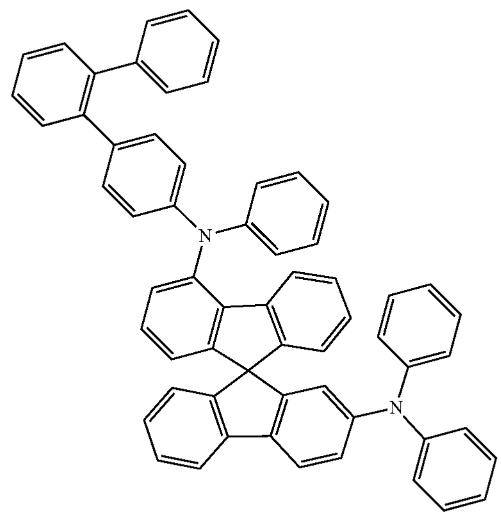
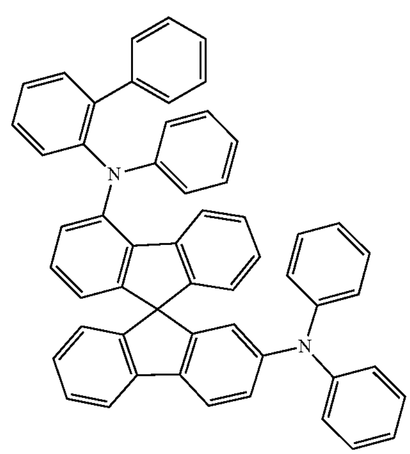

-continued
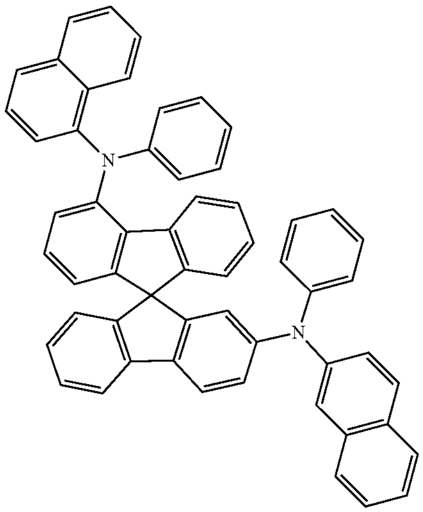
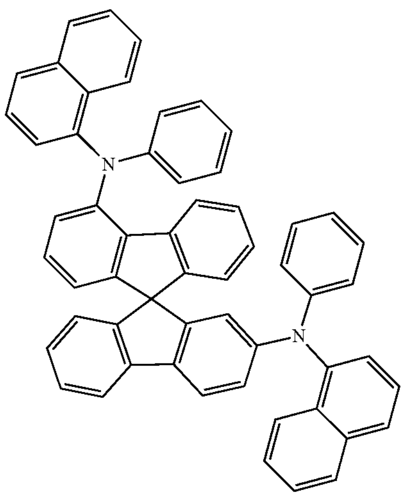
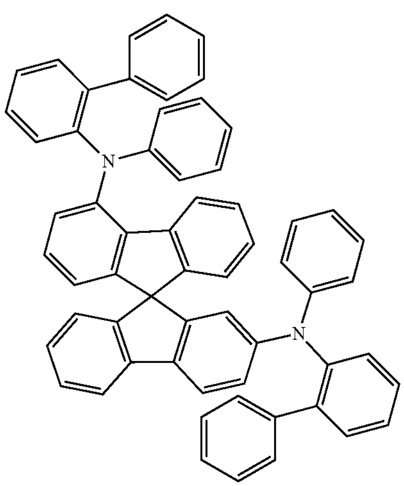
-continued
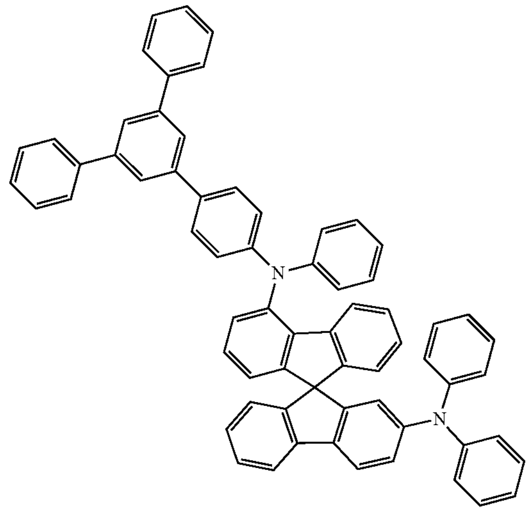
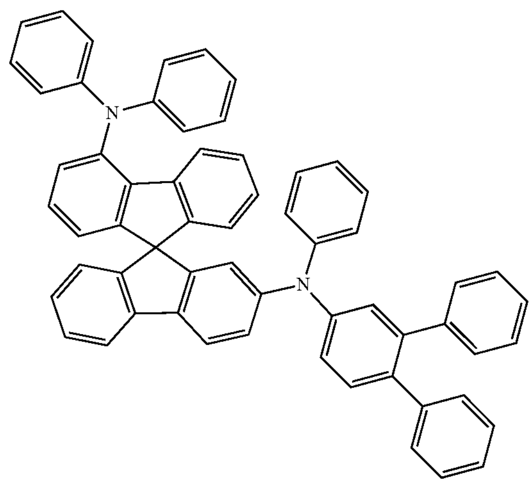
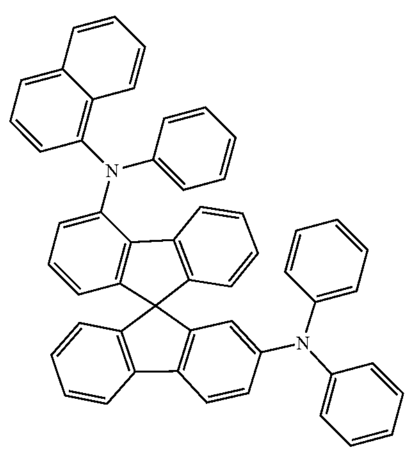

-continued
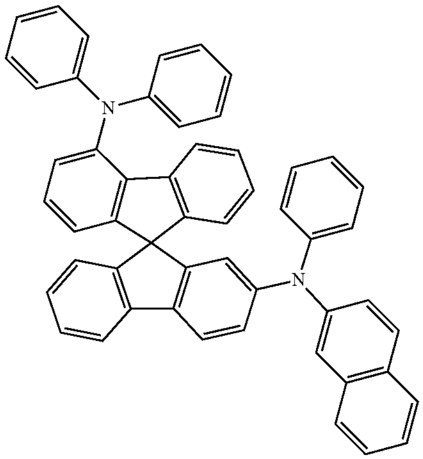
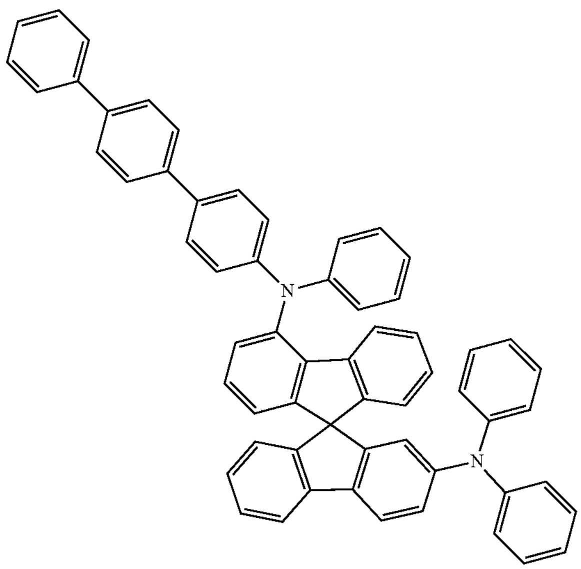
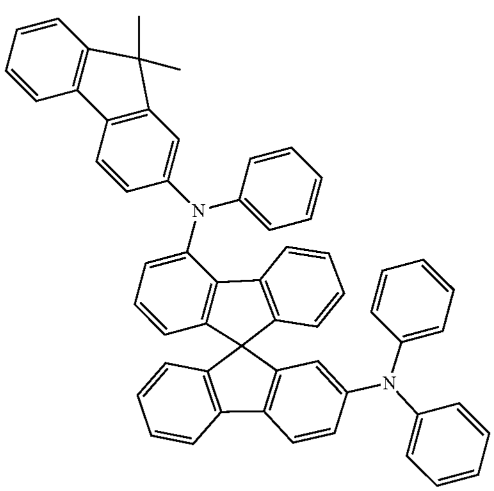
-continued
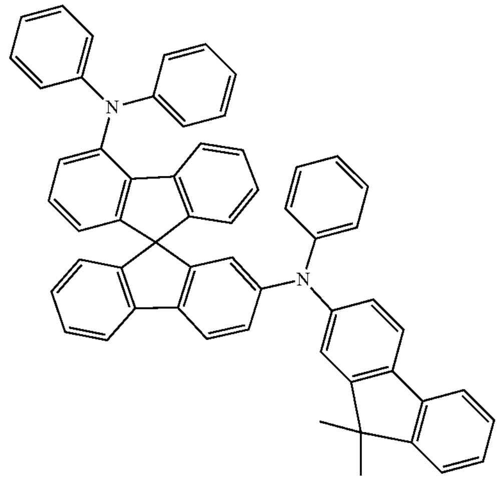
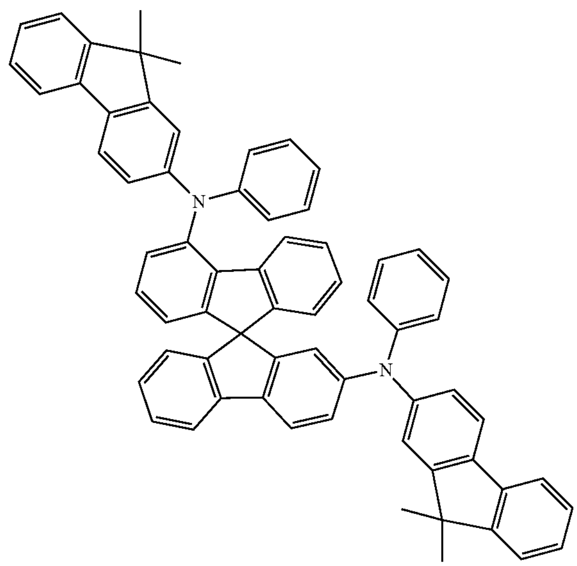
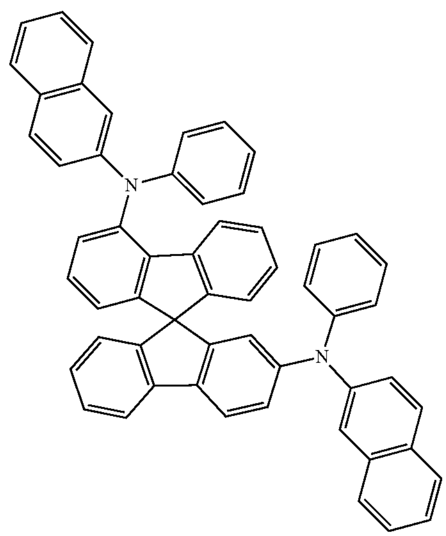

-continued
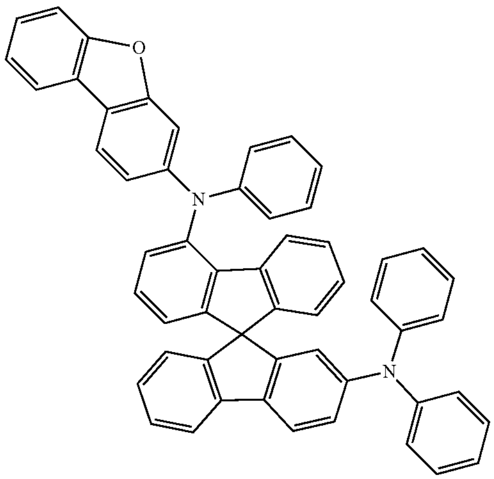
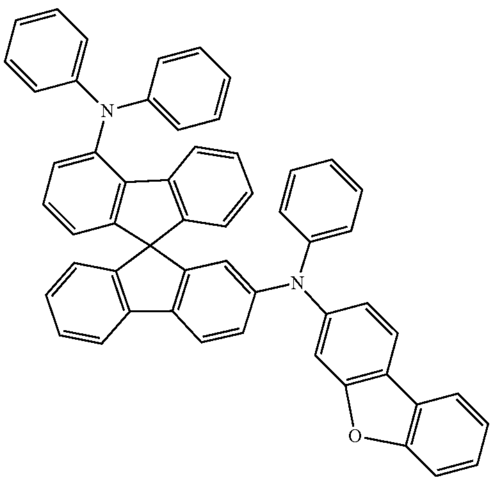
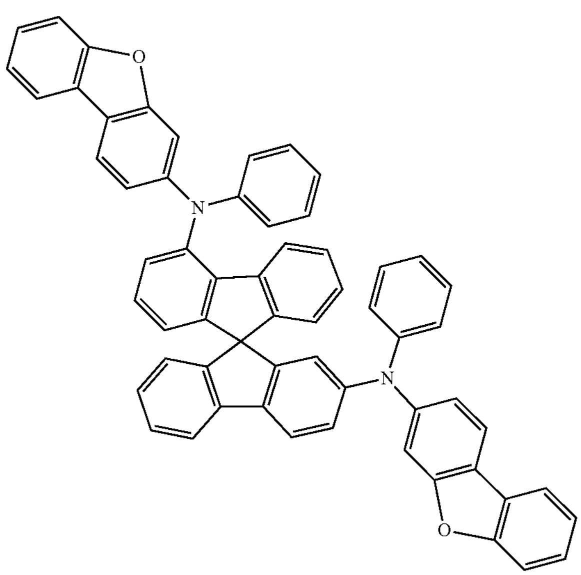
-continued
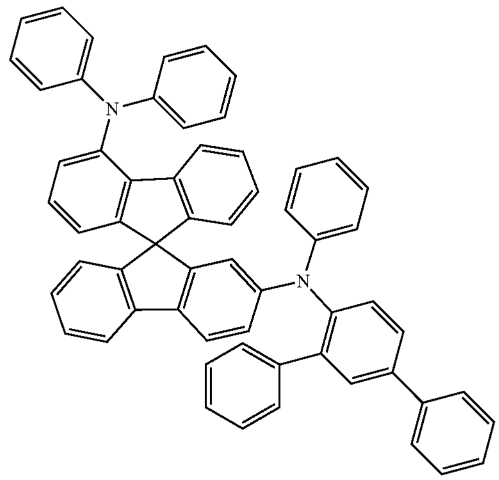
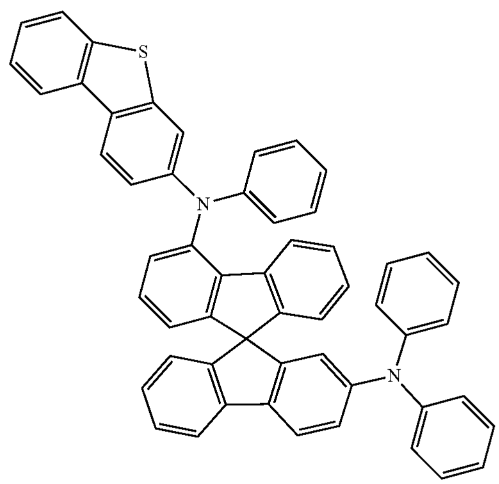
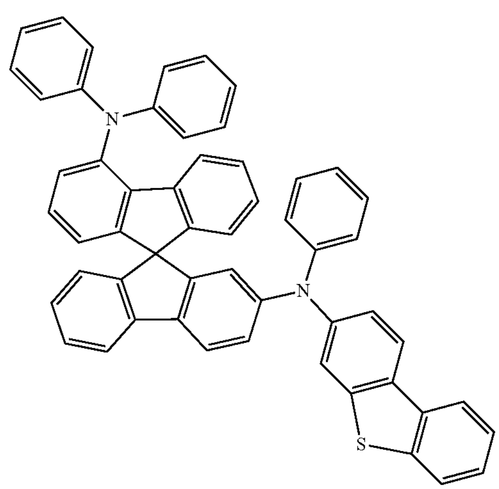

-continued
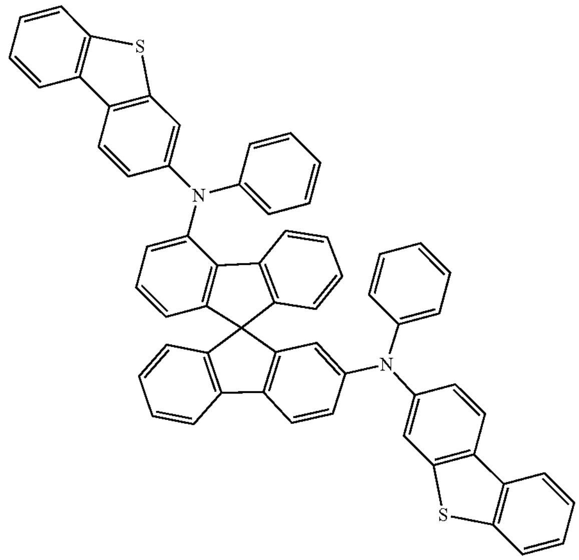
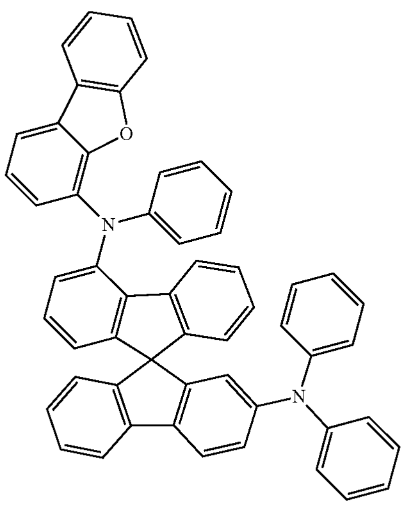
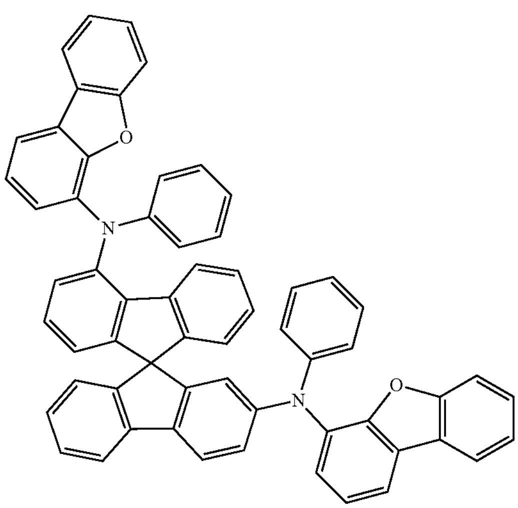
-continued
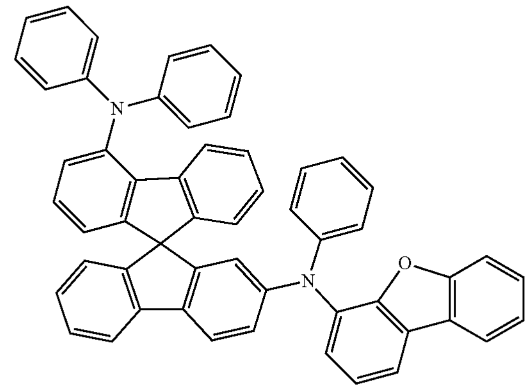
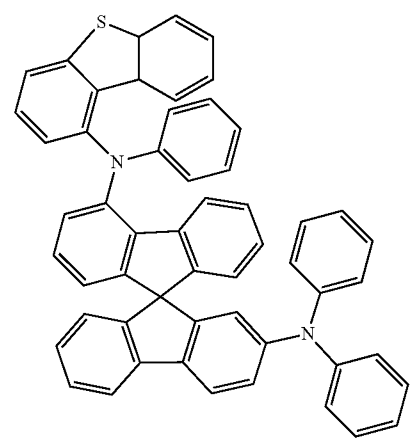
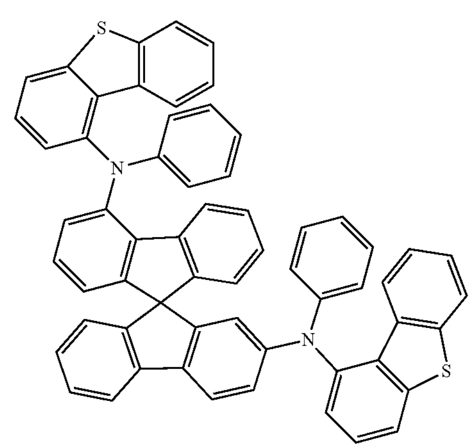

-continued
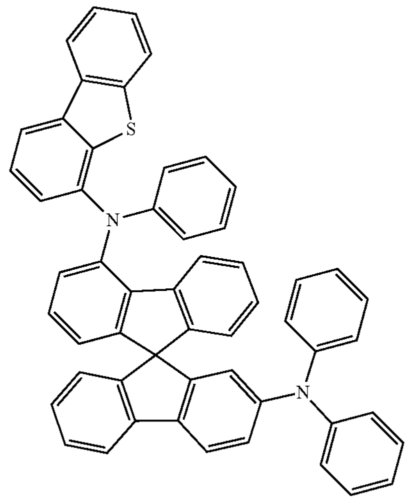
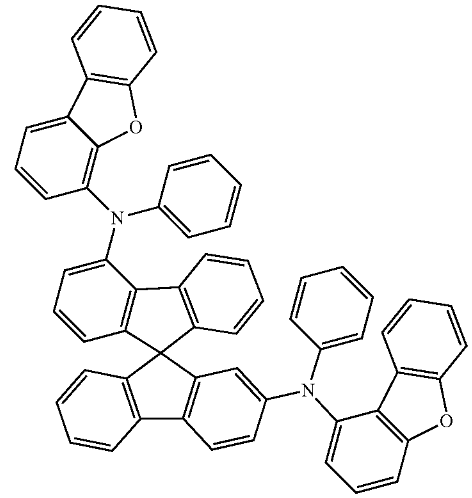
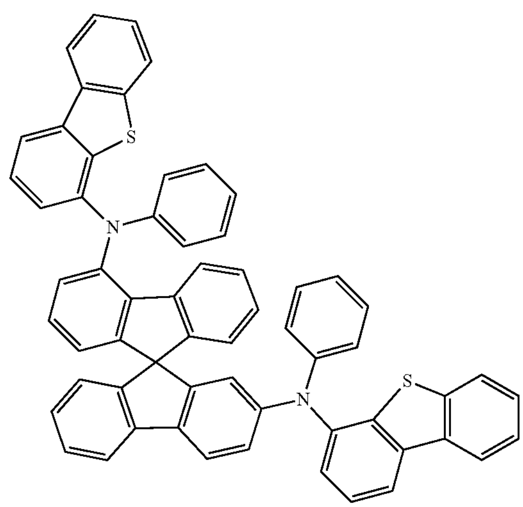
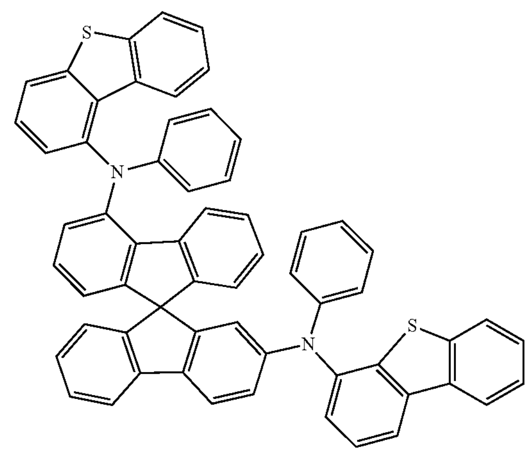
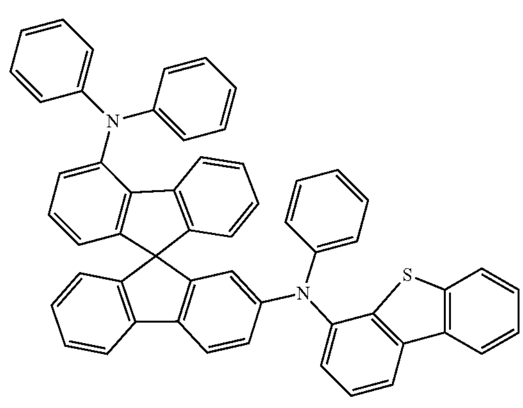
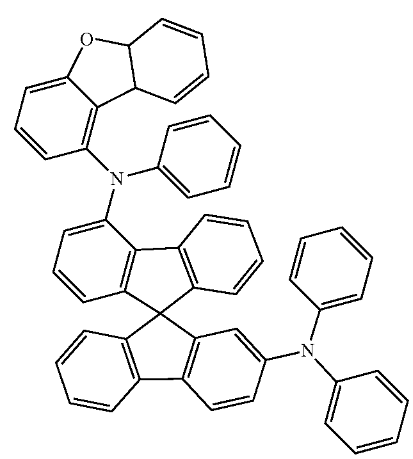
-continued -continued
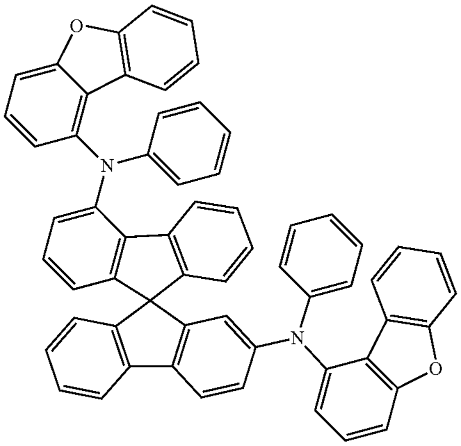
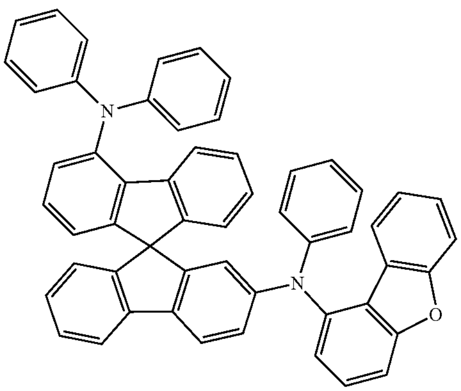
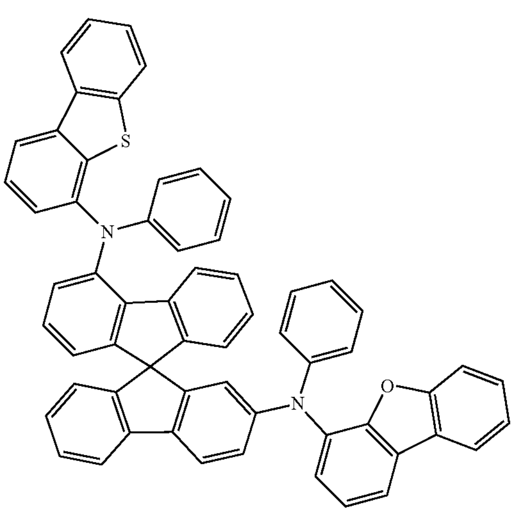
-continued
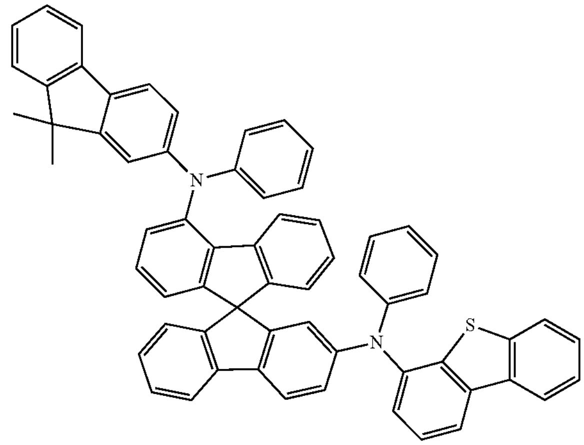
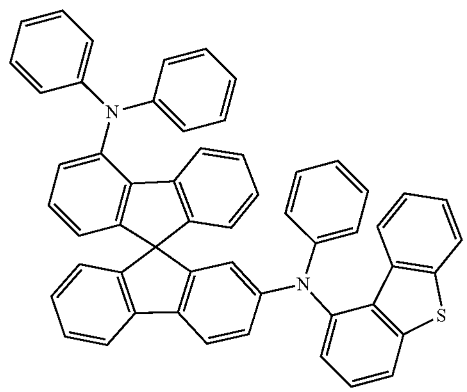
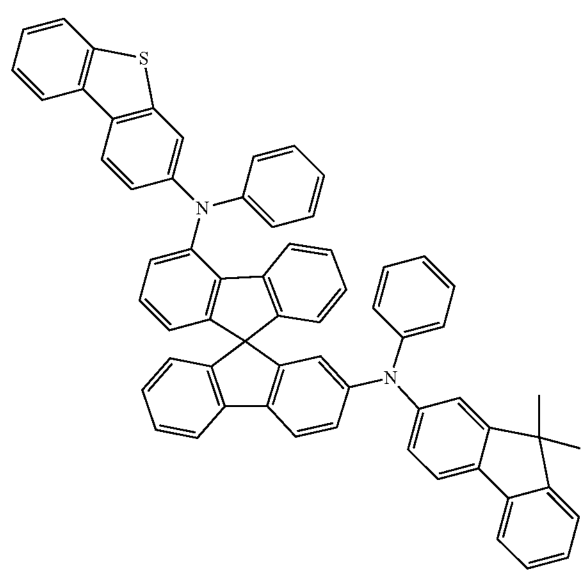

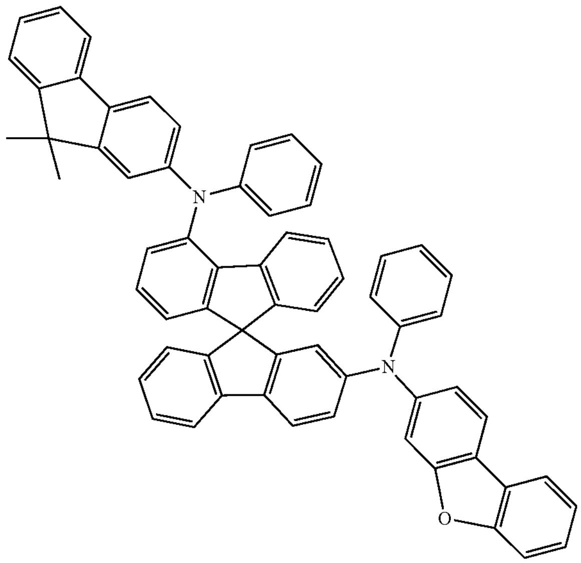
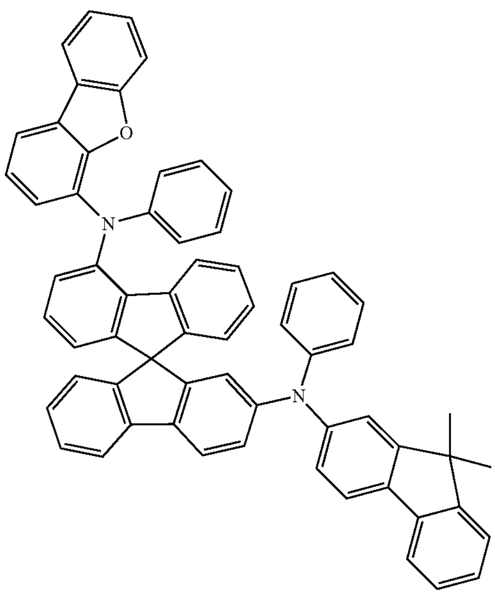
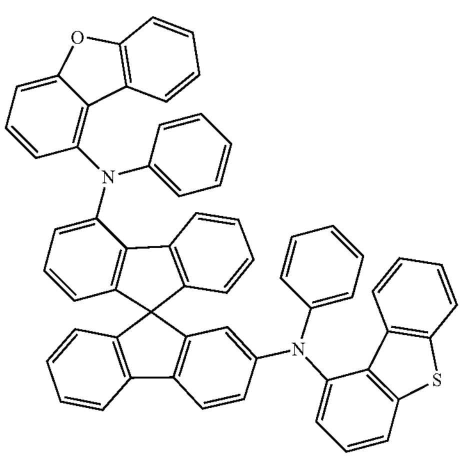
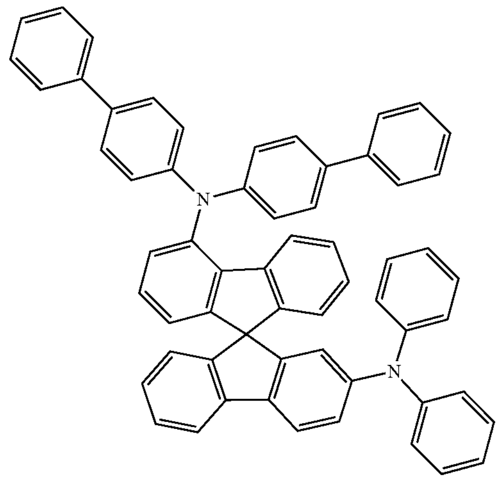
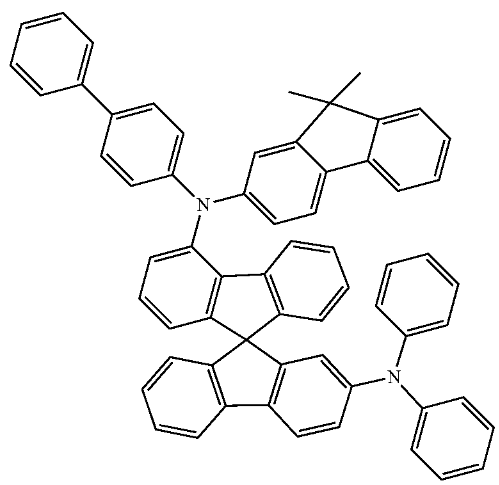
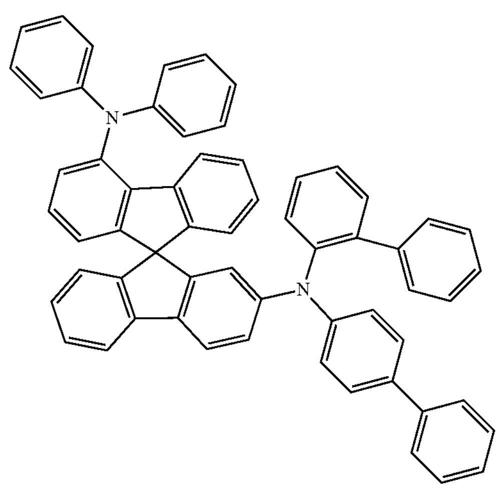

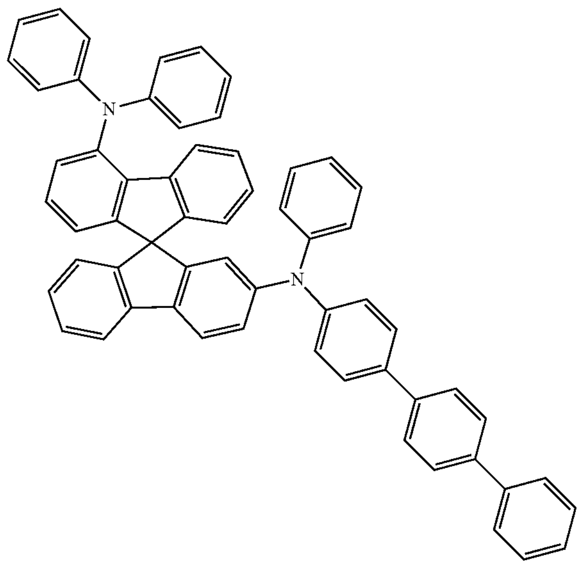
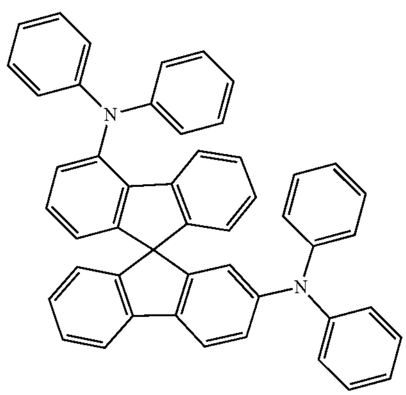
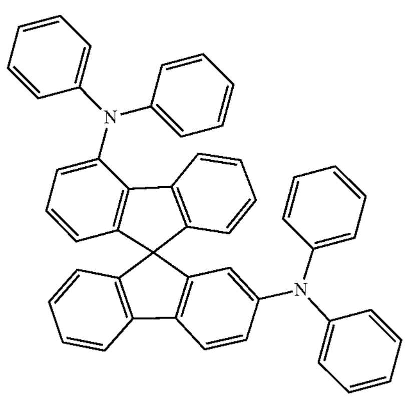
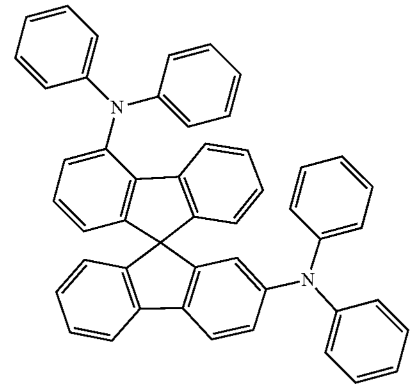
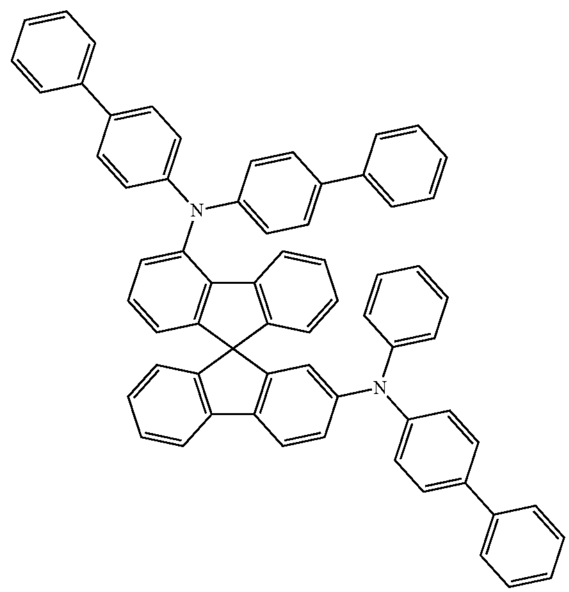
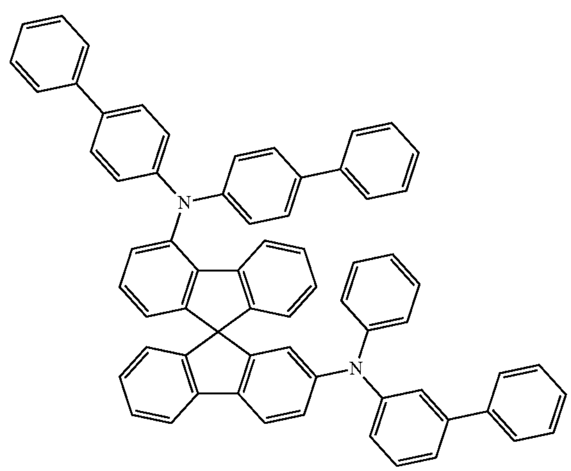
N
N -continued
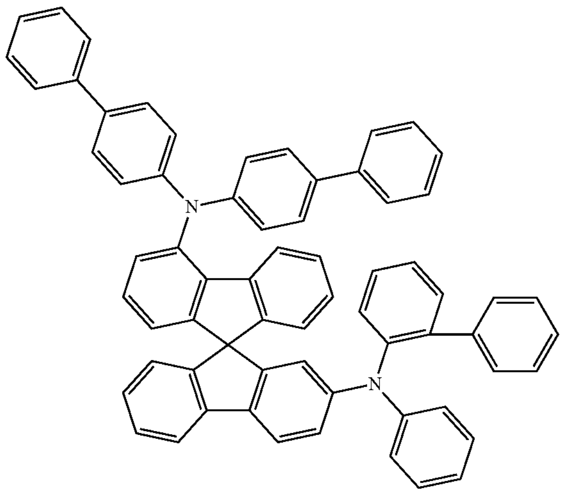
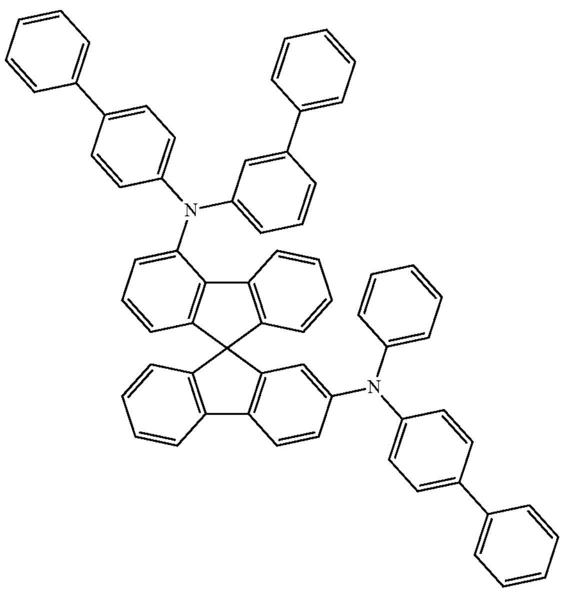 [SMILES: c1ccc(-c2ccc(N(c3ccccc3)c3ccc4c(c3)C3(c5ccccc5-4)c4ccccc4-c4c(N(c5ccc(-c6ccccc6)cc5)c5cccc(-c6ccccc6)c5)cccc43)cc2)cc1]
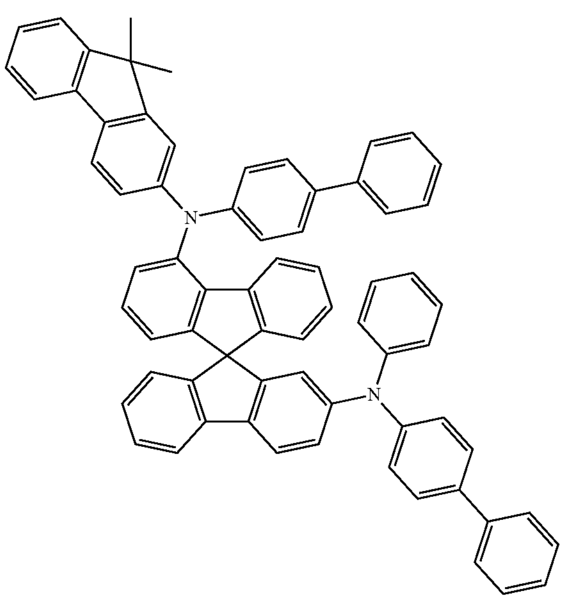
-continued
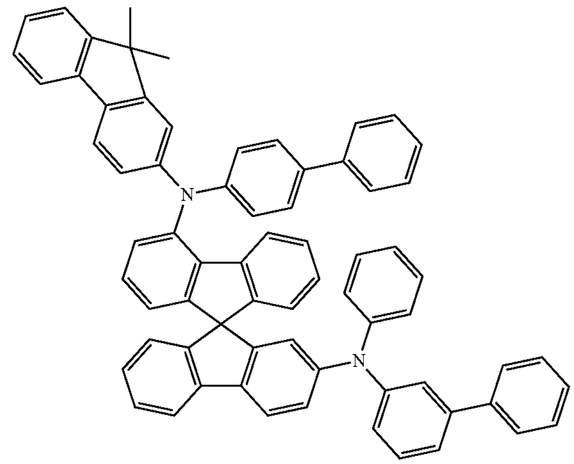
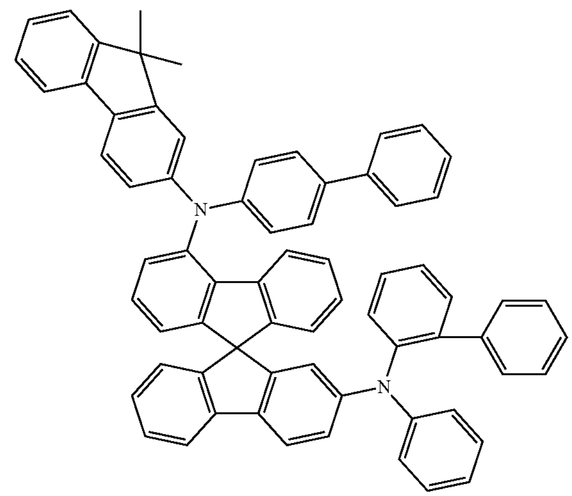
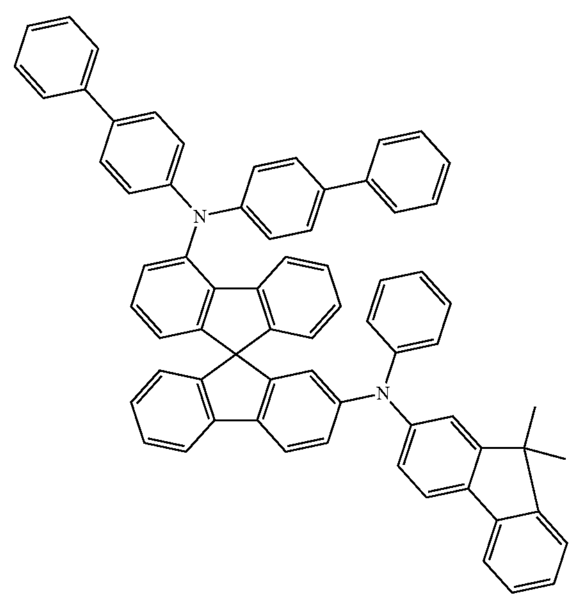 [SMILES: CC1(C)c2ccccc2-c2ccc(N(c3ccccc3)c3ccc4c(c3)C3(c5ccccc5-4)c4ccccc4-c4c(N(c5ccc(-c6ccccc6)cc5)c5ccc(-c6ccccc6)cc5)cccc43)cc21]

-continued
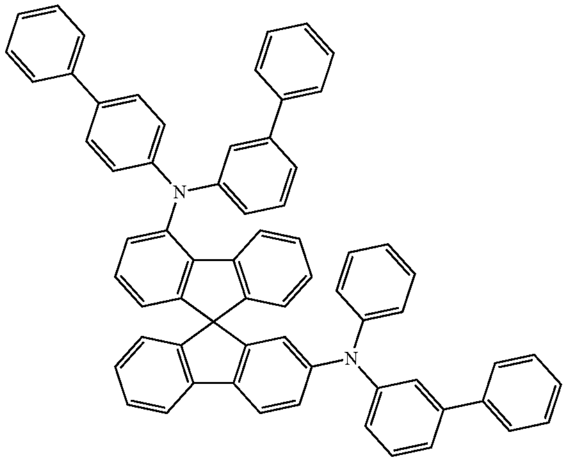
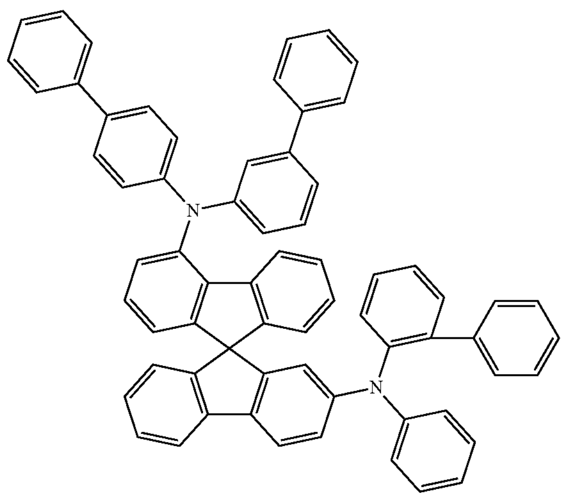
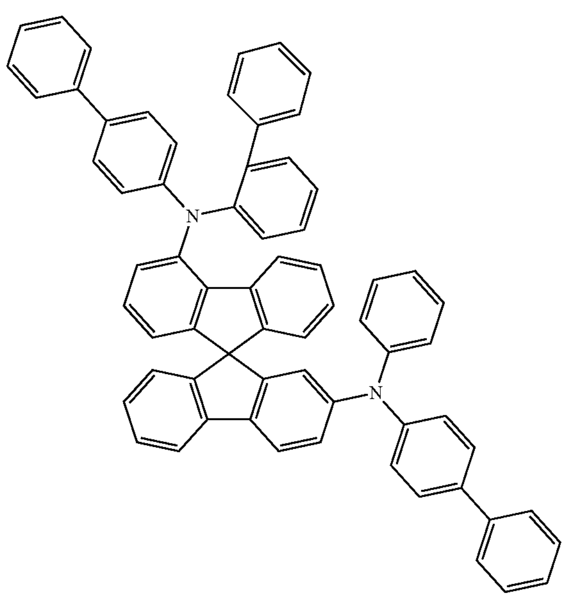
-continued
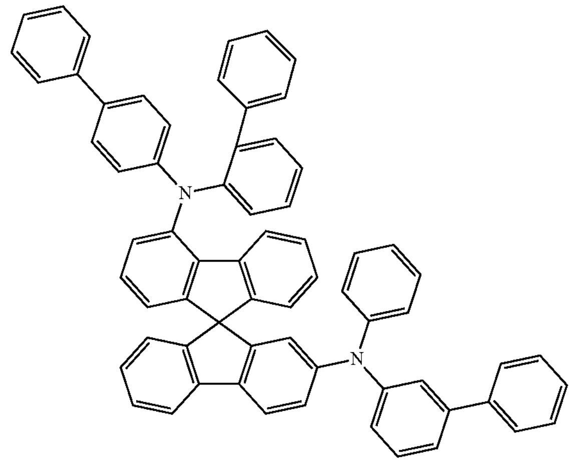 [SMILES: c1ccc(-c2ccc(N(c3ccccc3-c3ccccc3)c3cccc4c3-c3ccccc3C43c4ccccc4-c4ccc(N(c5ccccc5)c5cccc(-c6ccccc6)c5)cc43)cc2)cc1]
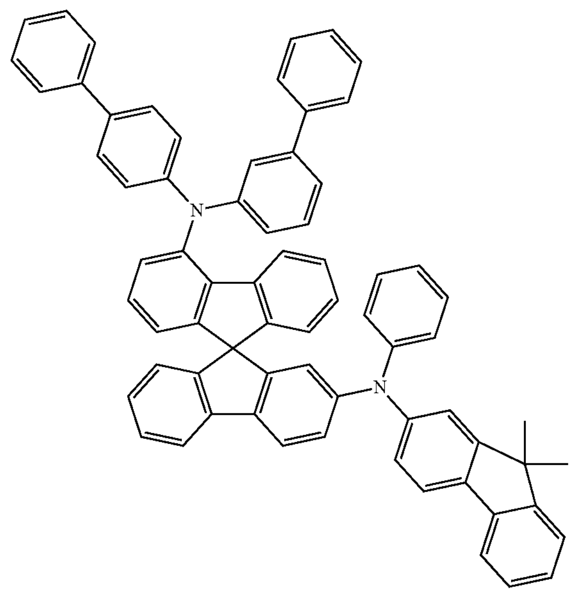
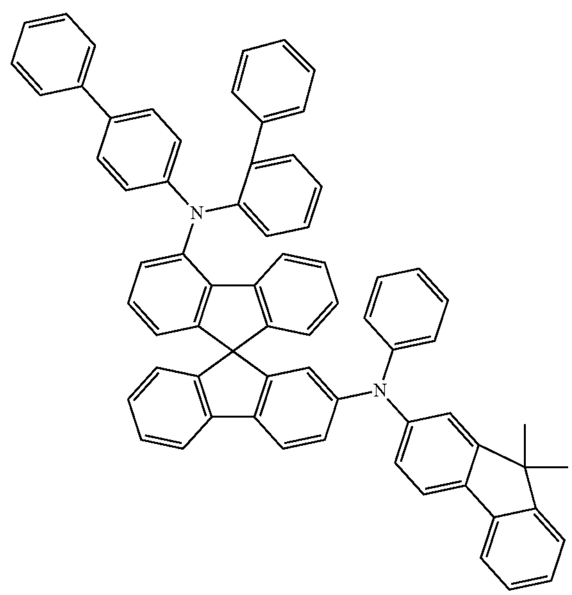

-continued
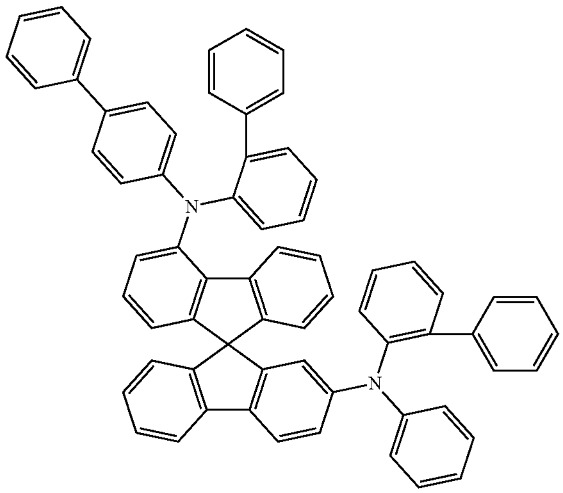
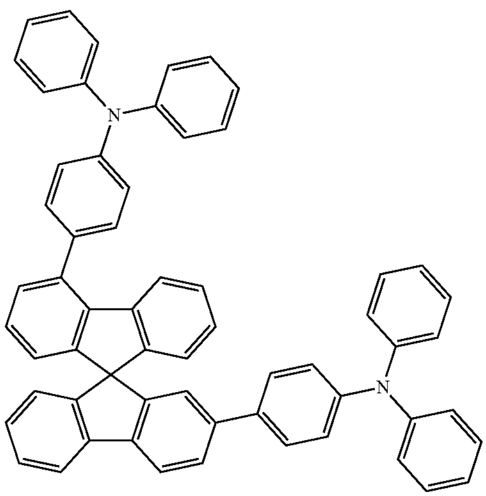
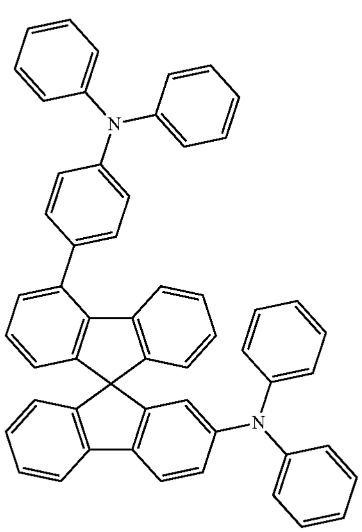
-continued
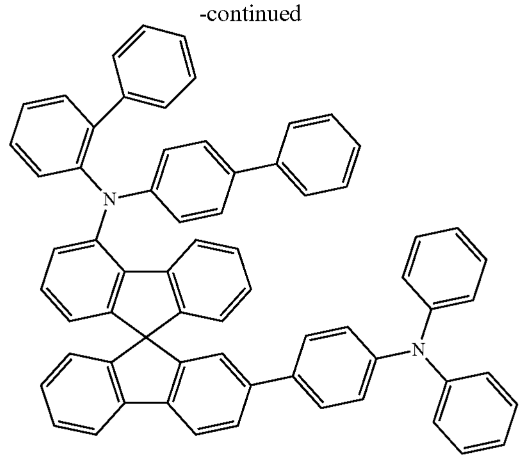
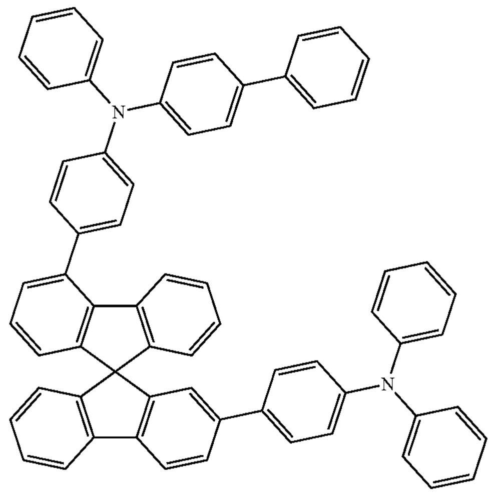 [SMILES: c1ccc(-c2ccc(N(c3ccccc3)c3ccc(-c4cccc5c4-c4ccccc4C54c5ccccc5-c5ccc(-c6ccc(N(c7ccccc7)c7ccccc7)cc6)cc54)cc3)cc2)cc1]
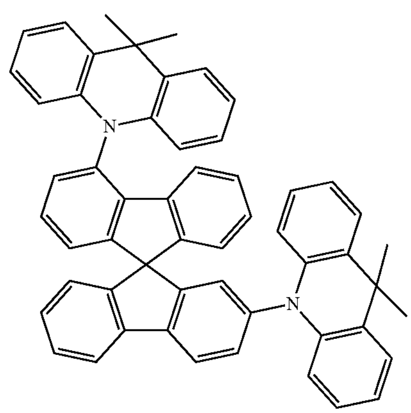
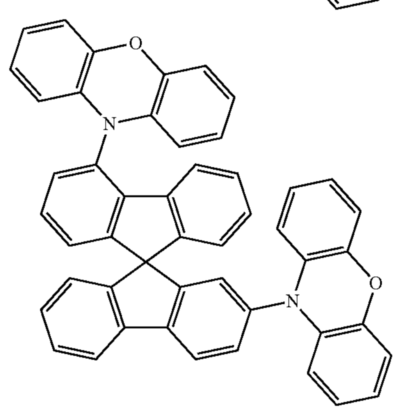

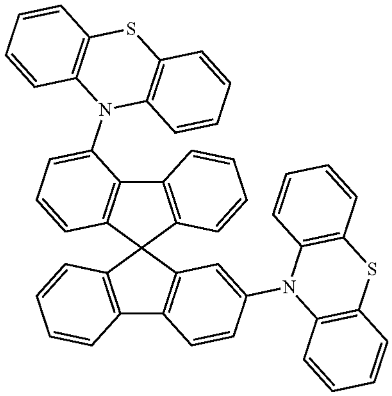
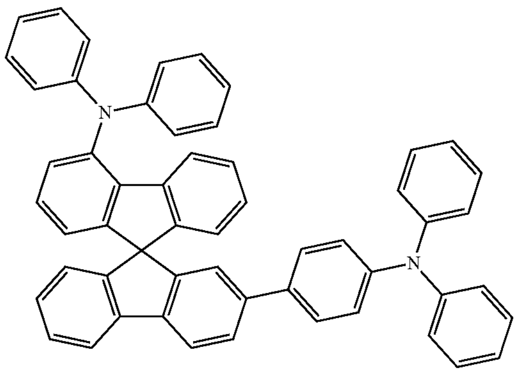
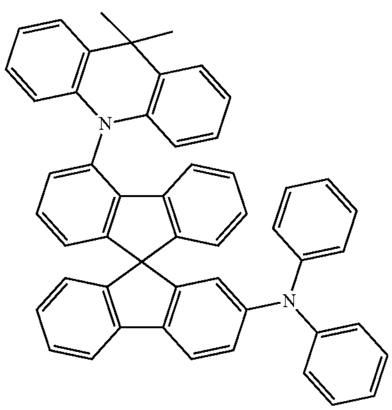
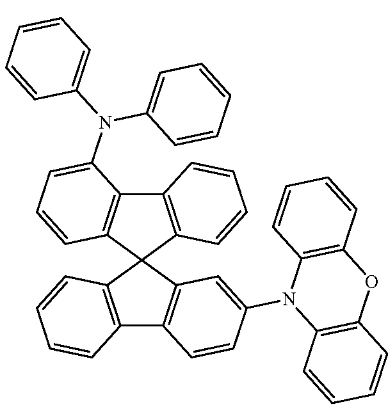
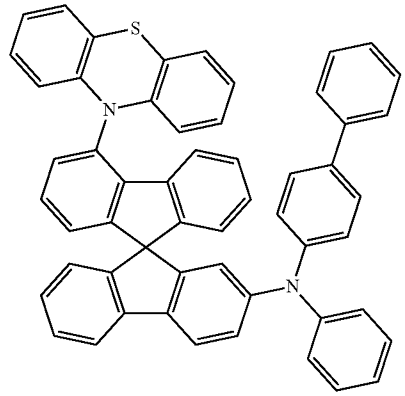
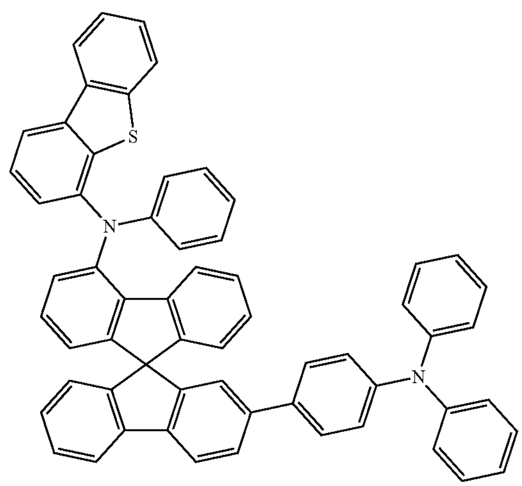
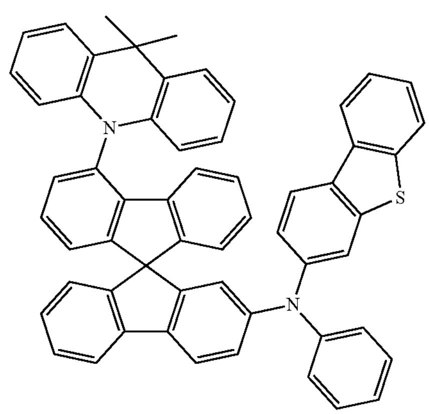

-continued
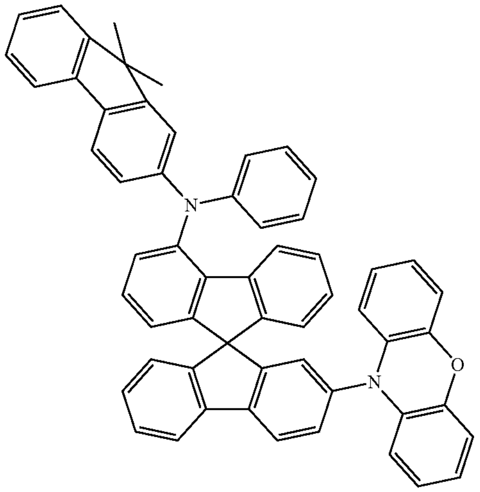
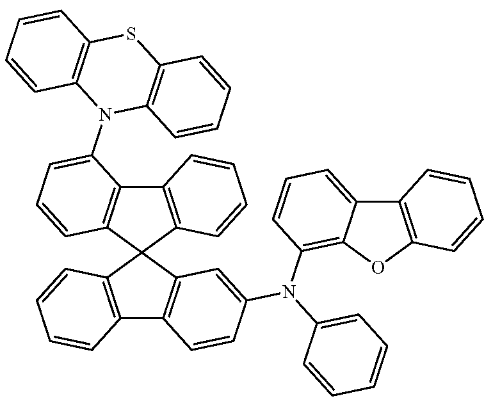
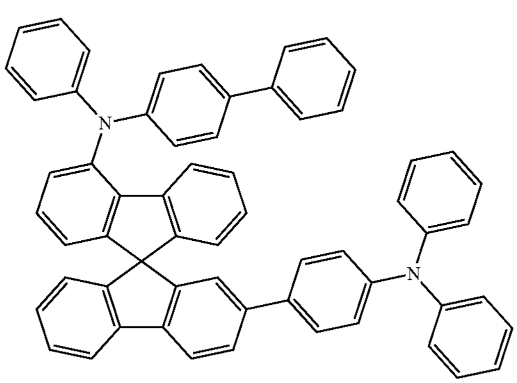
-continued
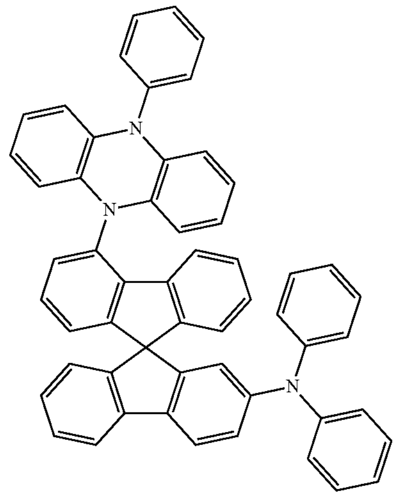
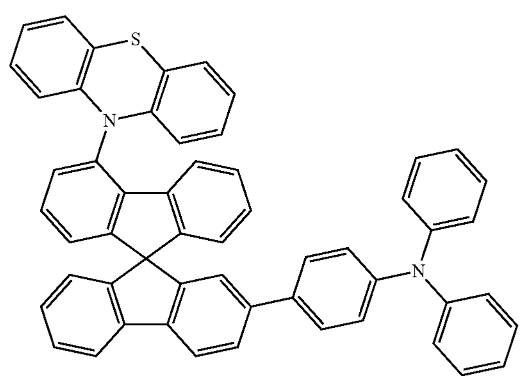
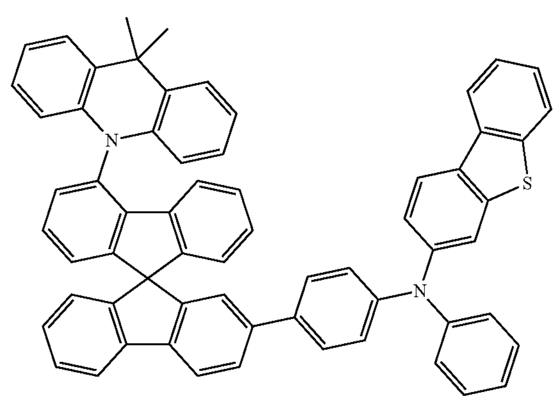

-continued
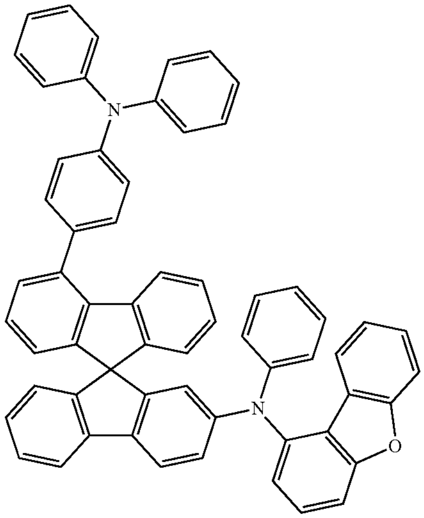
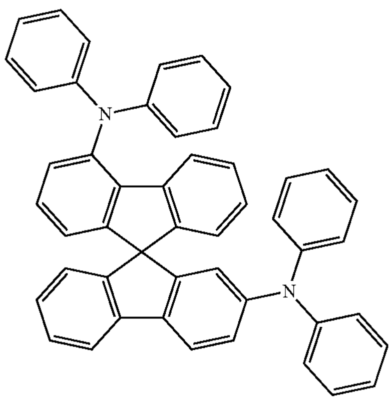
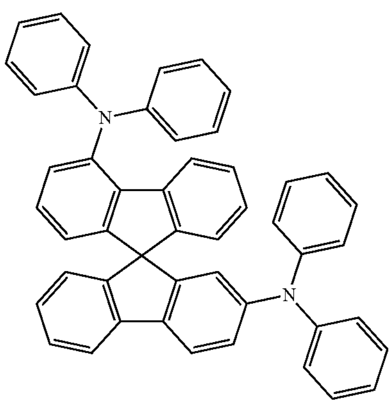
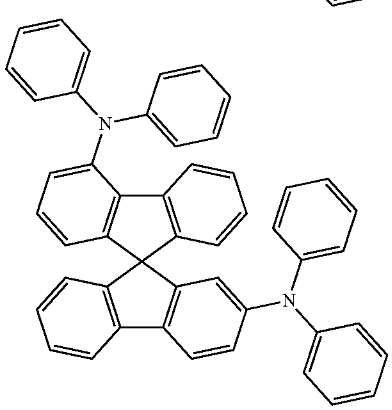
-continued
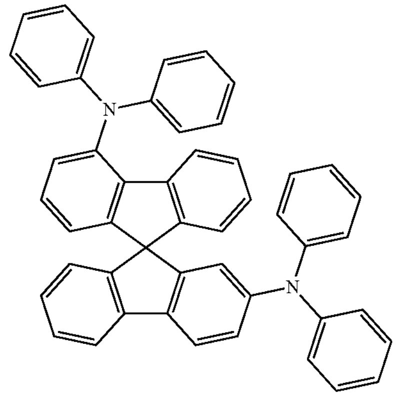
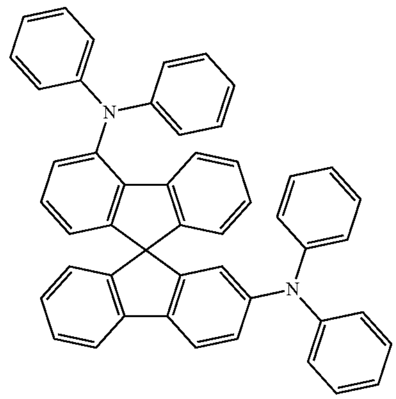 [SMILES: c1ccc(N(c2ccccc2)c2ccc3c(c2)C2(c4ccccc4-3)c3ccccc3-c3c(N(c4ccccc4)c4ccccc4)cccc32)cc1]
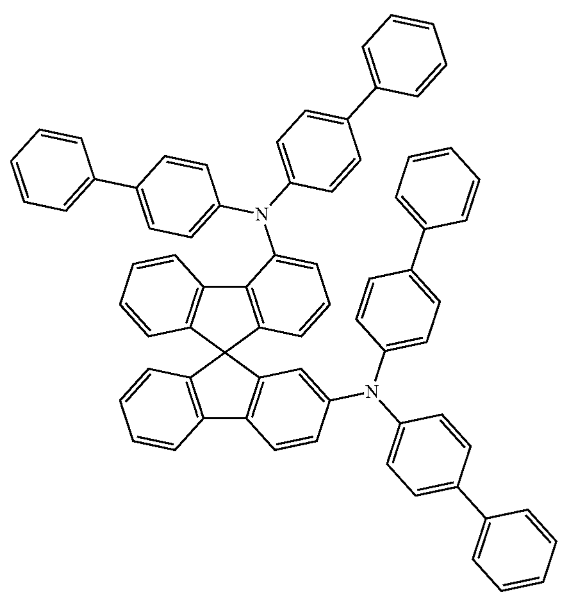

-continued
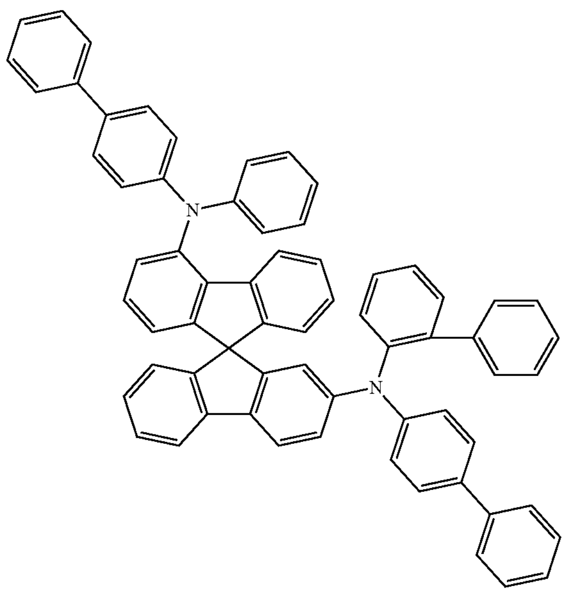
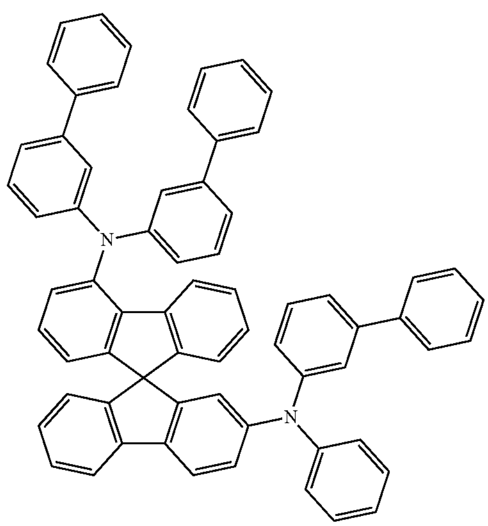
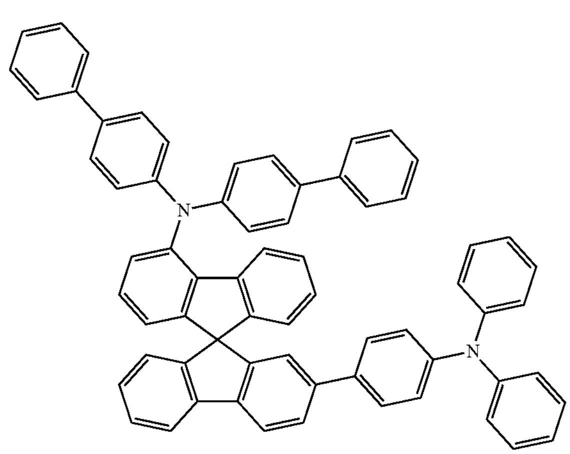
-continued
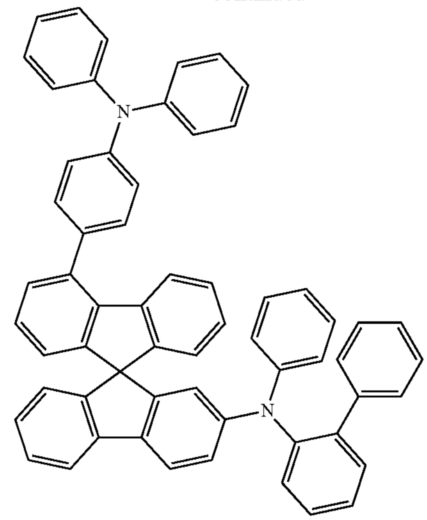
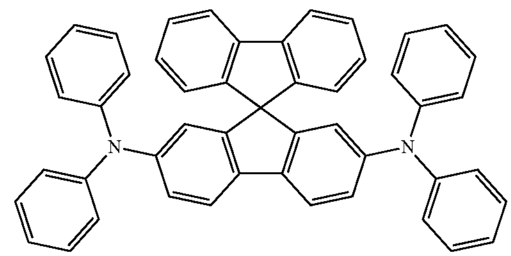
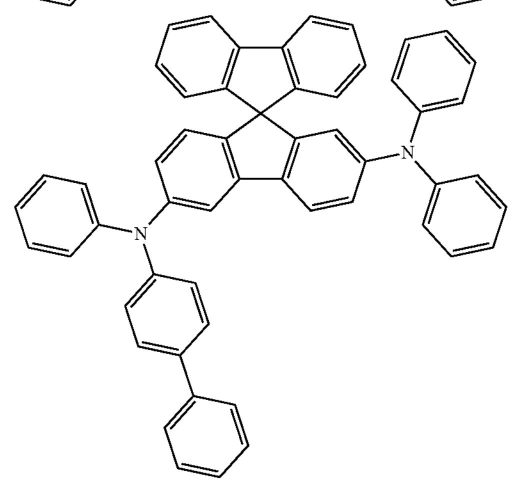
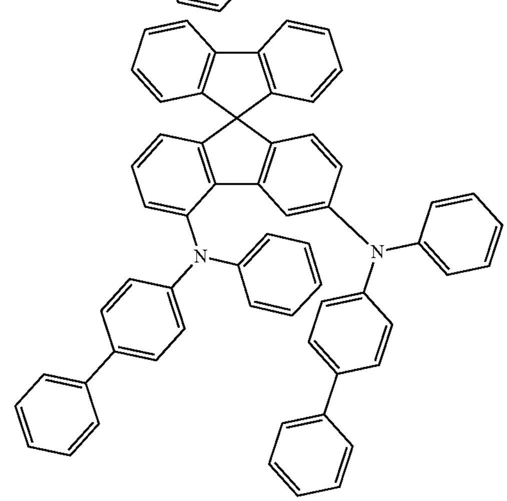

-continued
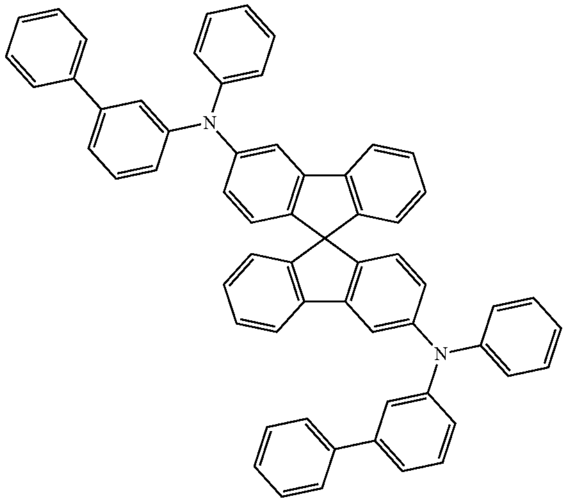
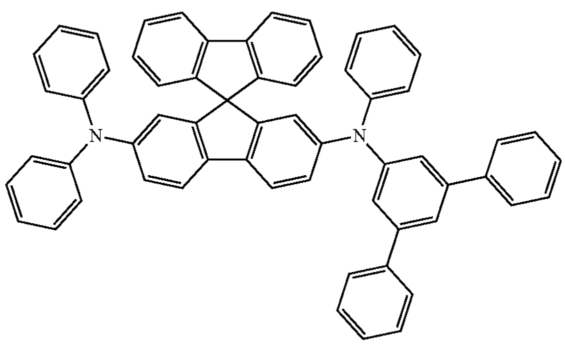
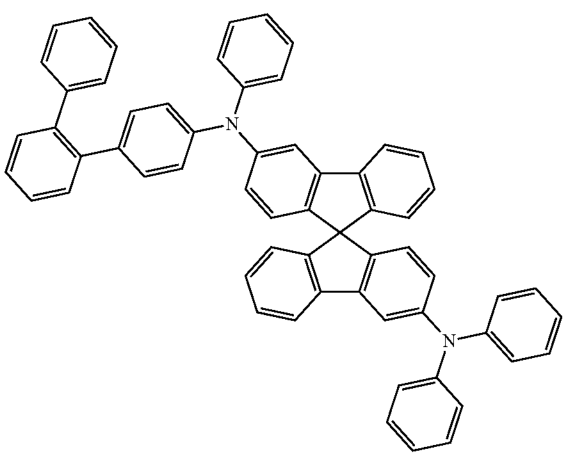
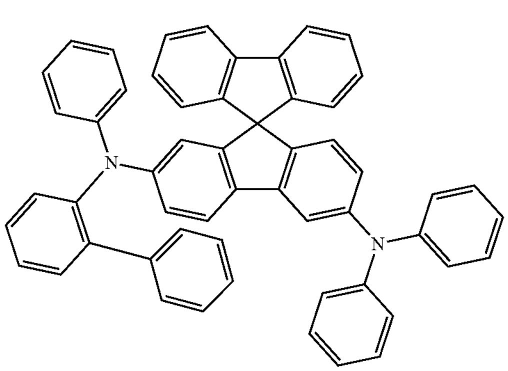
-continued
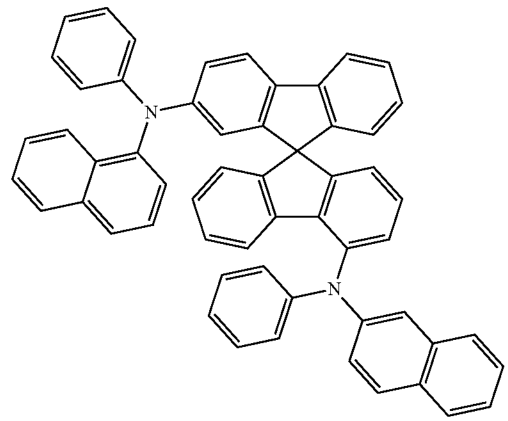
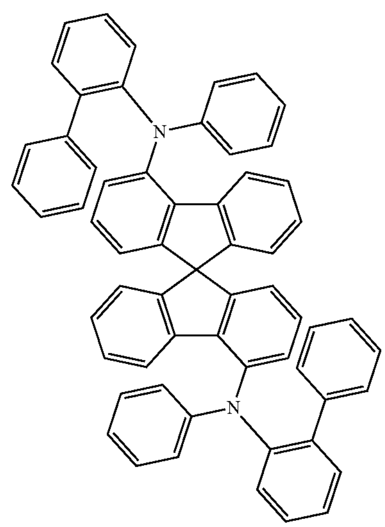
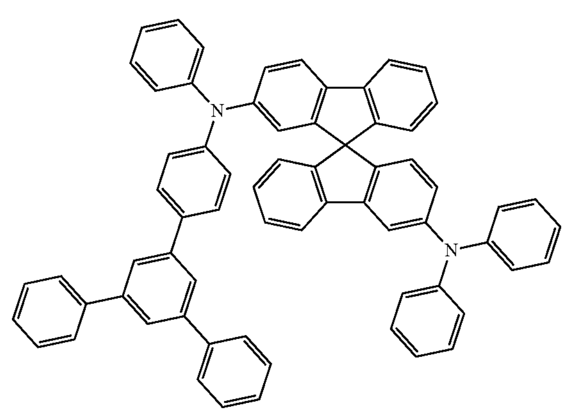

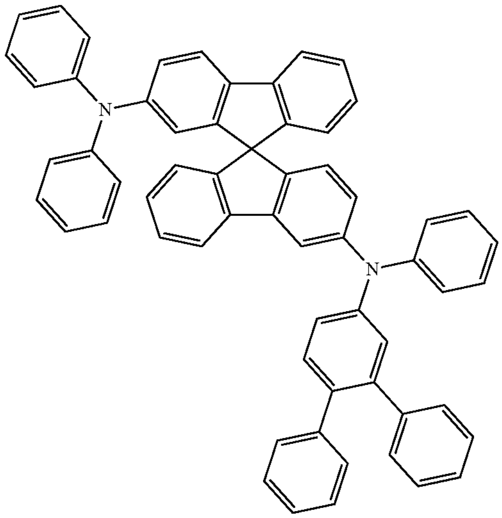
N
N
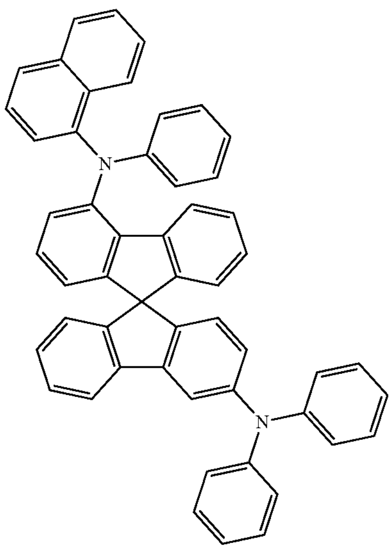 [SMILES: c1ccc(N(c2ccccc2)c2ccc3c(c2)-c2ccccc2C32c3ccccc3-c3c(N(c4ccccc4)c4cccc5ccccc45)cccc32)cc1]
N
N
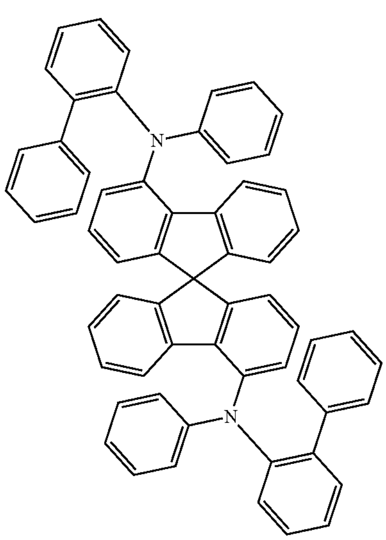
N
N
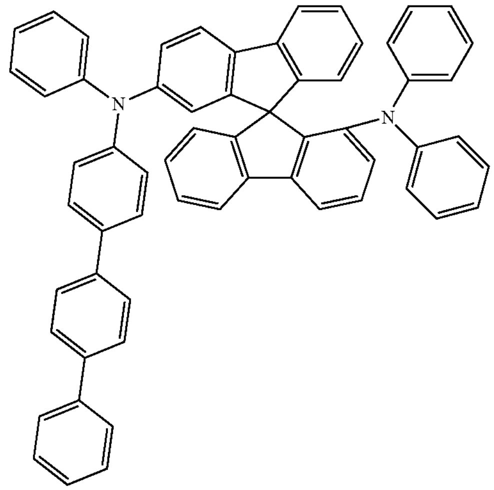
N
N
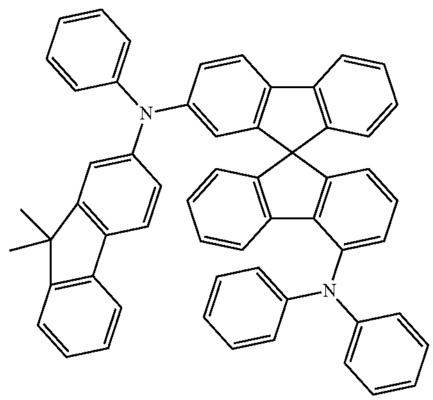
N
N
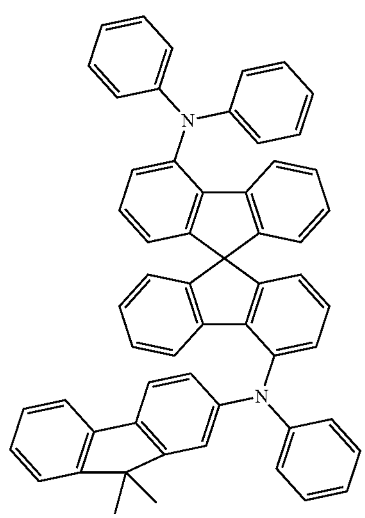 [SMILES: CC1(C)c2ccccc2-c2ccc(N(c3ccccc3)c3cccc4c3-c3ccccc3C43c4ccccc4-c4c(N(c5ccccc5)c5ccccc5)cccc43)cc21]
N
N -continued
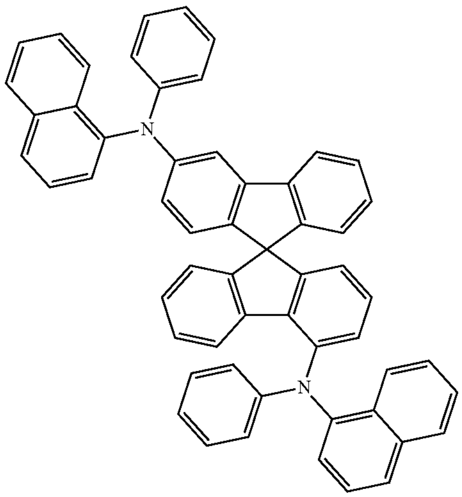
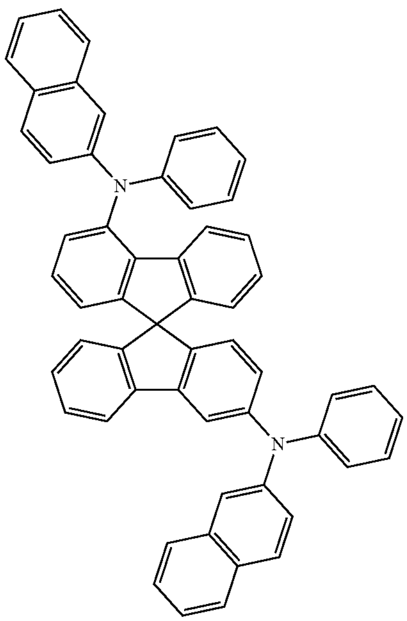
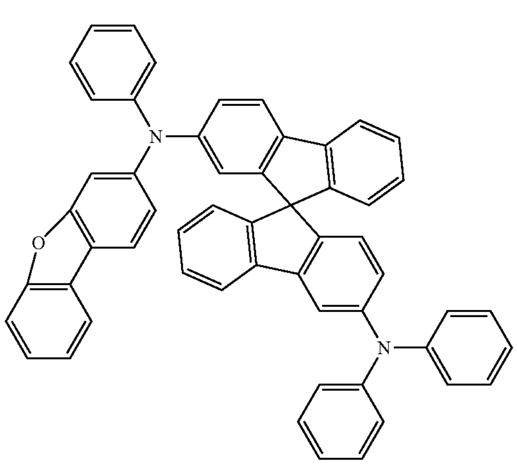
-continued
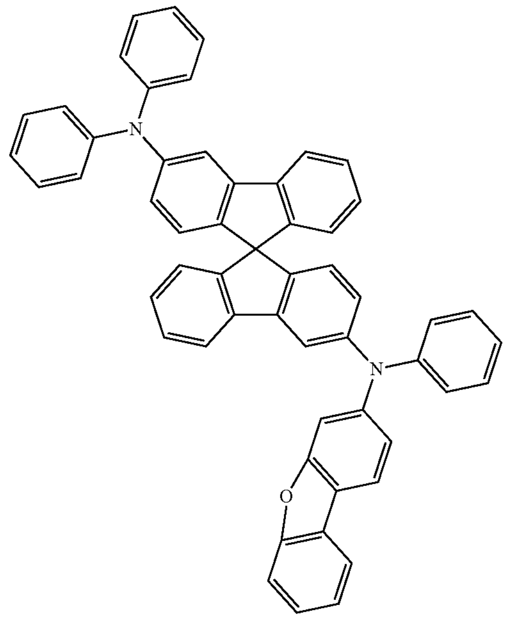
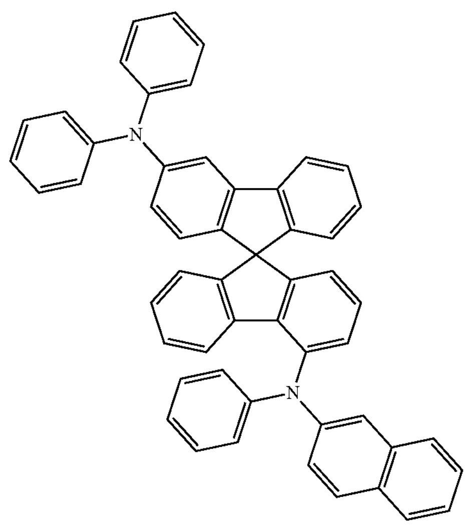
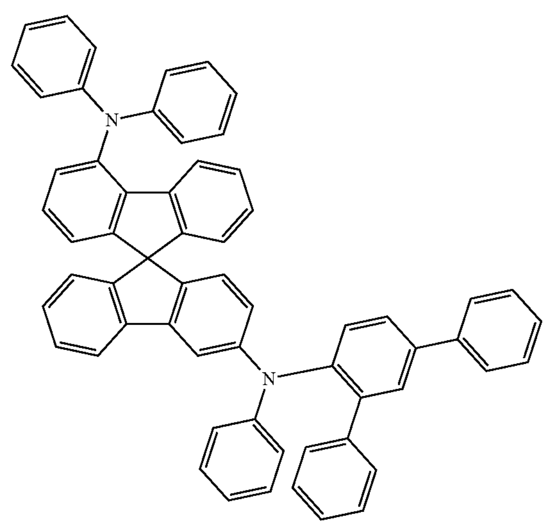

-continued
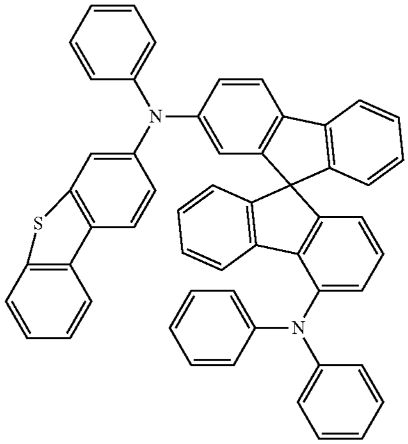
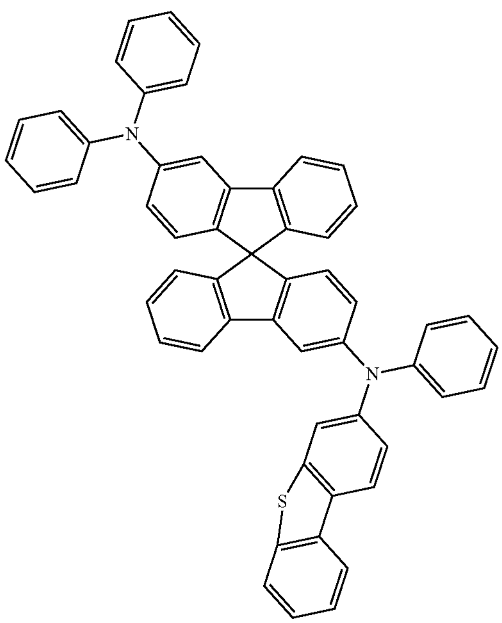 [SMILES: c1ccc(N(c2ccccc2)c2ccc3c(c2)-c2ccccc2C32c3ccccc3-c3cc(N(c4ccccc4)c4ccc5c(c4)sc4ccccc45)ccc32)cc1]
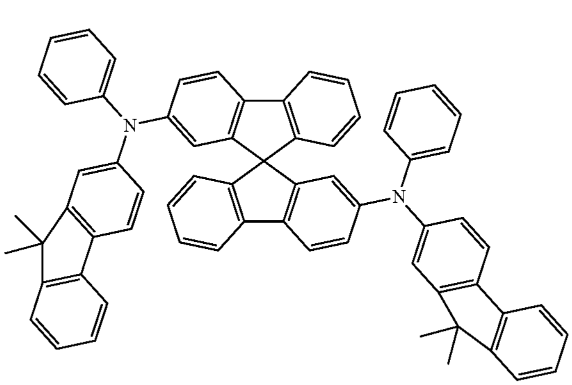
-continued
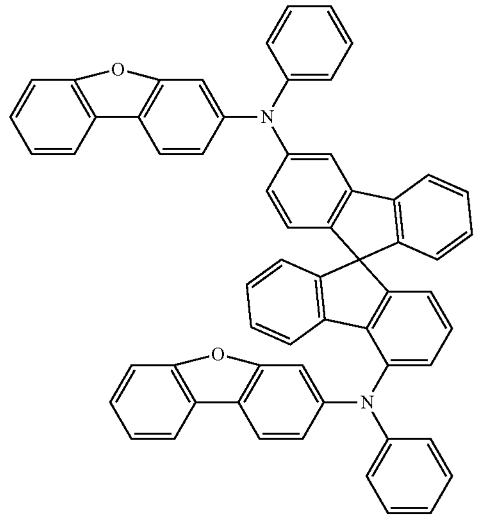
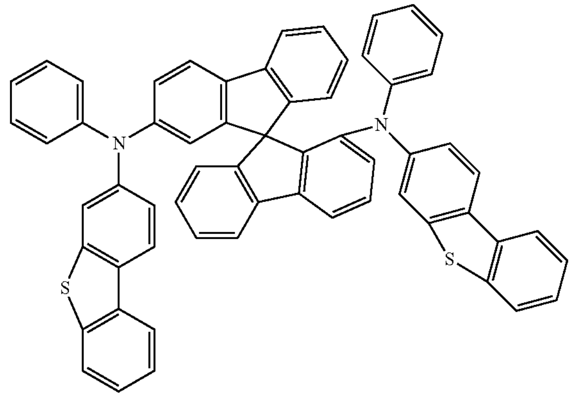
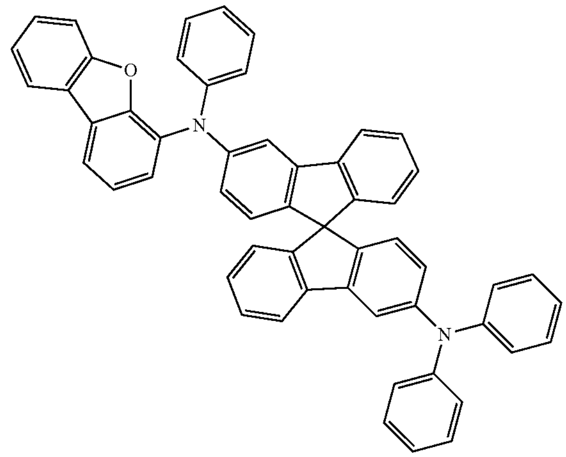

-continued
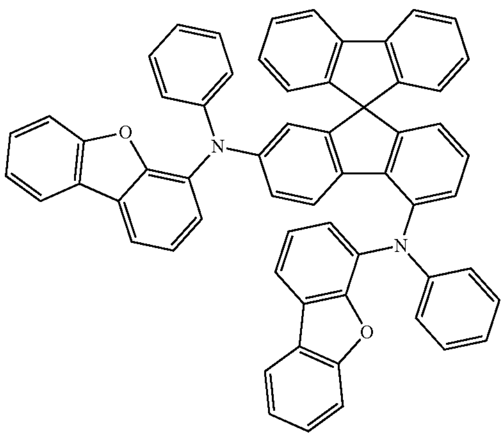
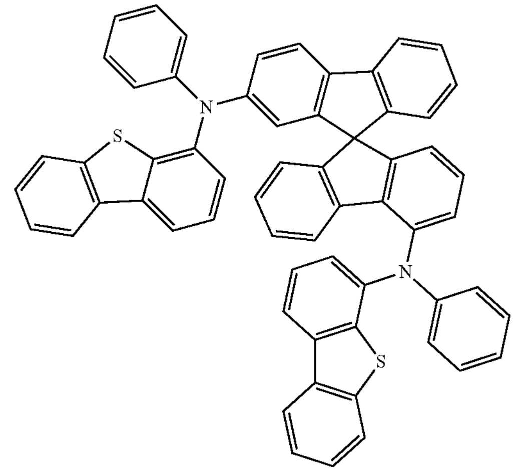
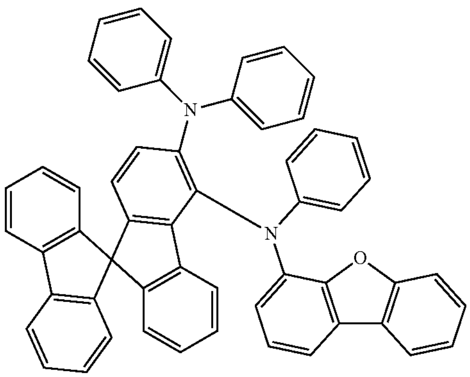
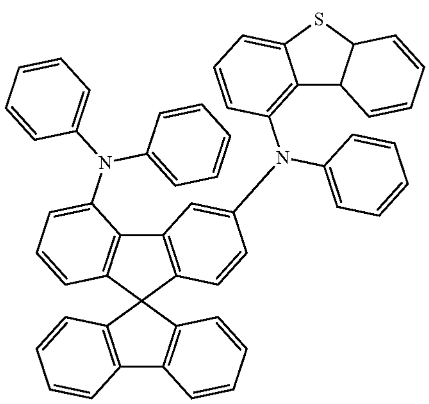
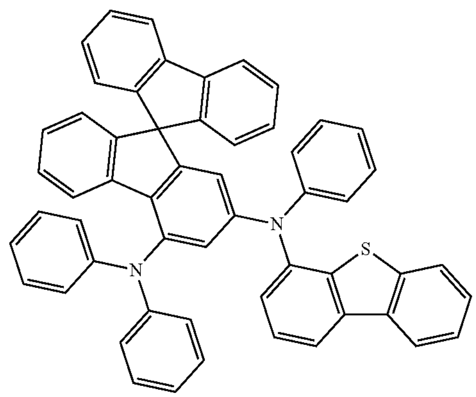
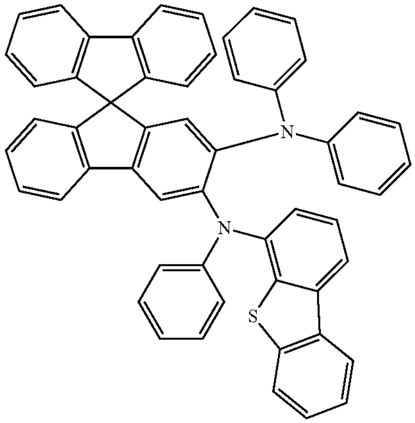
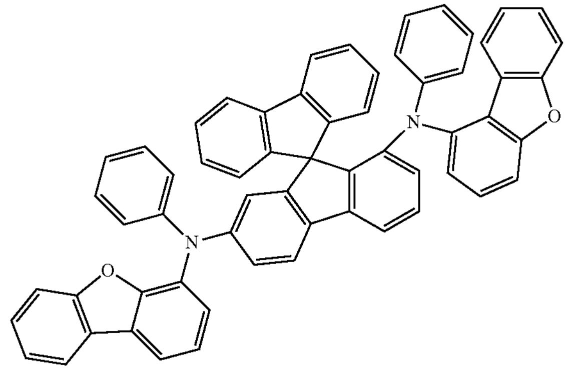

-continued
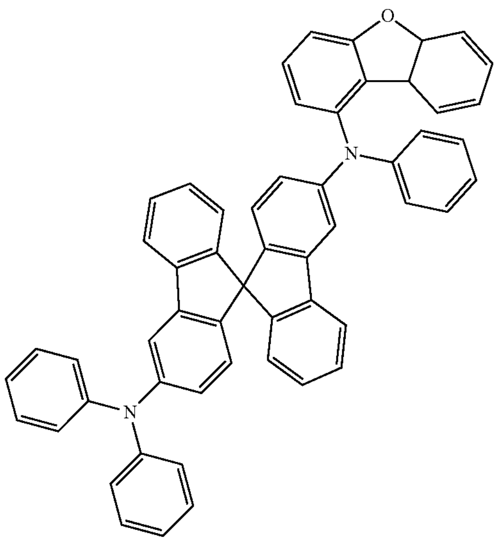
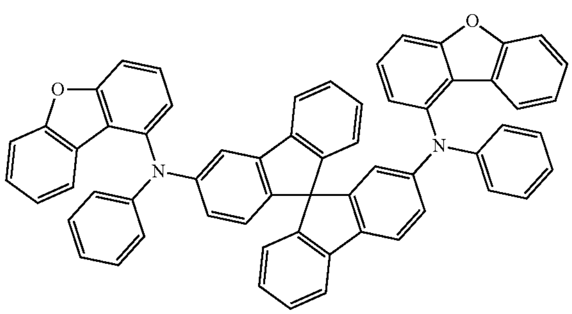
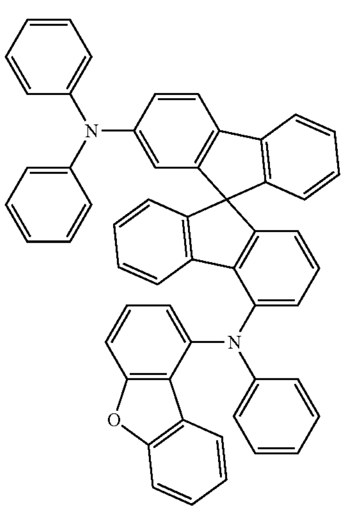
-continued
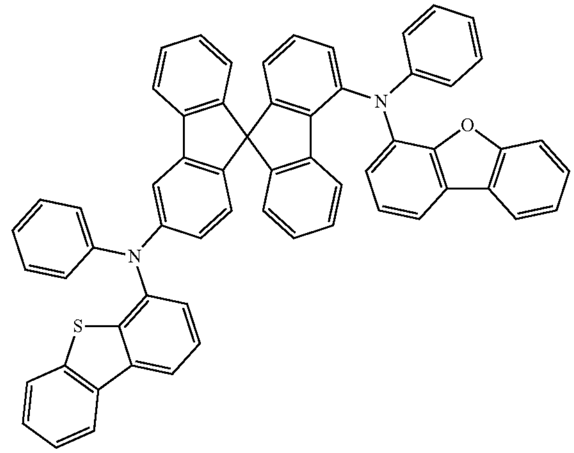
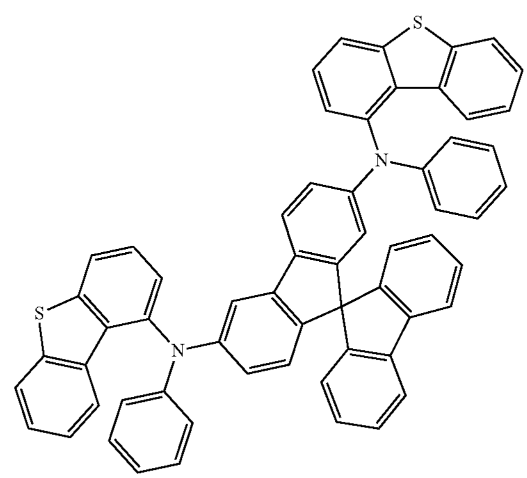
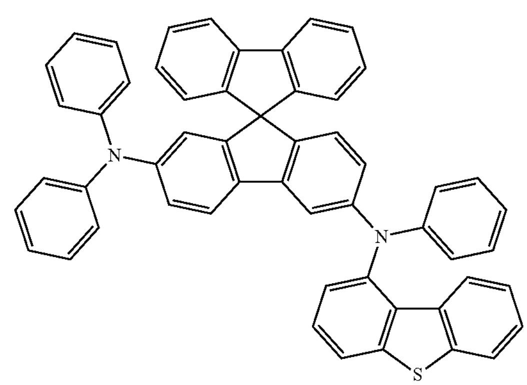

-continued
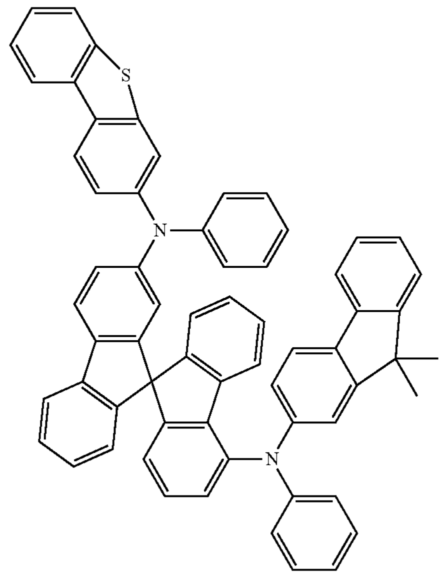
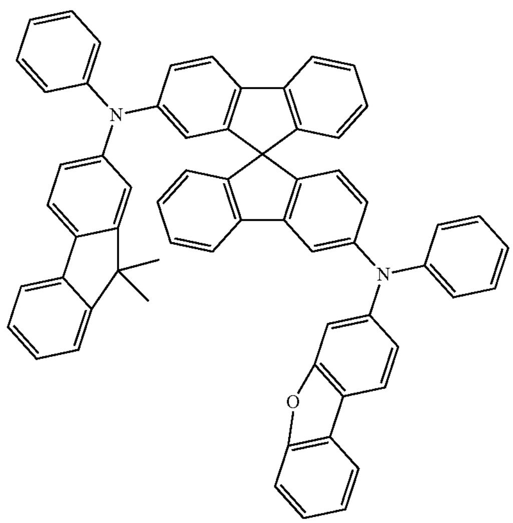 [SMILES: CC1(C)c2ccccc2-c2ccc(N(c3ccccc3)c3ccc4c(c3)C3(c5ccccc5-c5cc(N(c6ccccc6)c6ccc7c(c6)oc6ccccc67)ccc53)c3ccccc3-4)cc21]
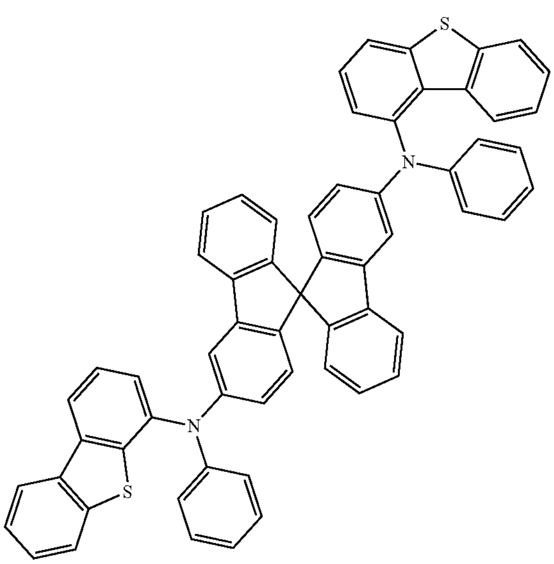
-continued
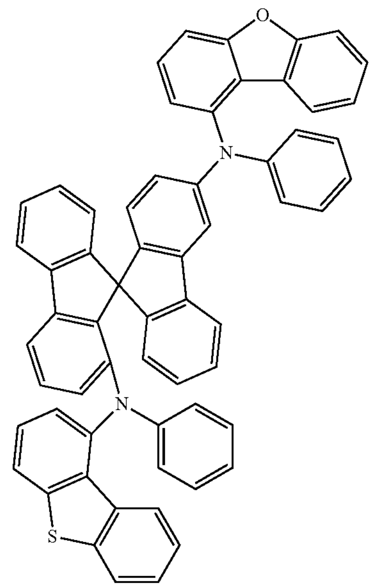
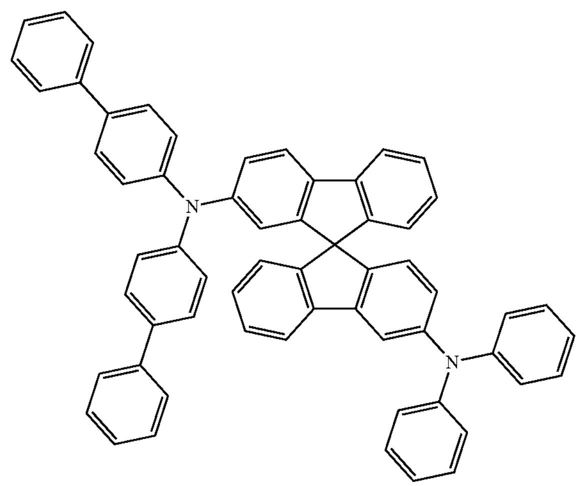
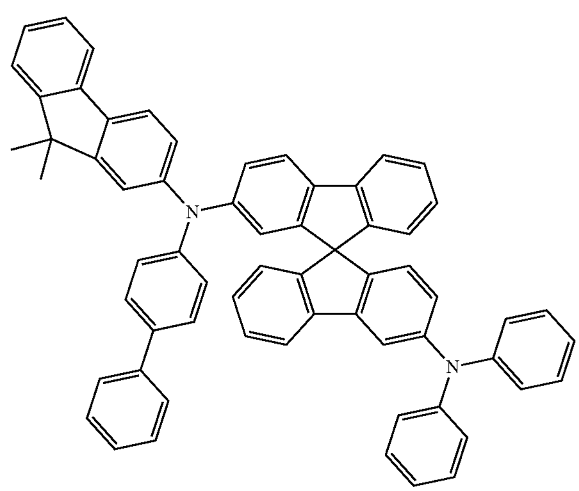 [SMILES: CC1(C)c2ccccc2-c2ccc(N(c3ccc(-c4ccccc4)cc3)c3ccc4c(c3)C3(c5ccccc5-c5cc(N(c6ccccc6)c6ccccc6)ccc53)c3ccccc3-4)cc21]

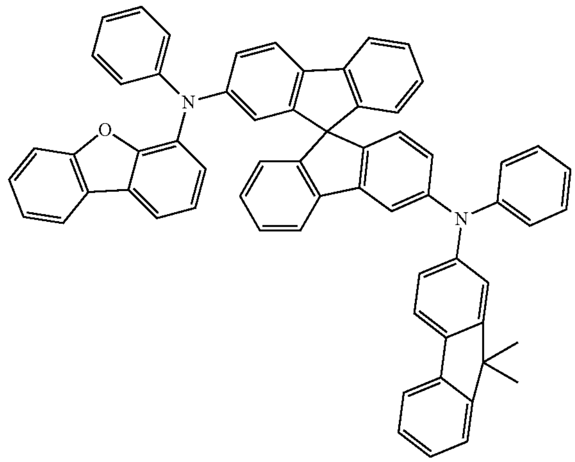
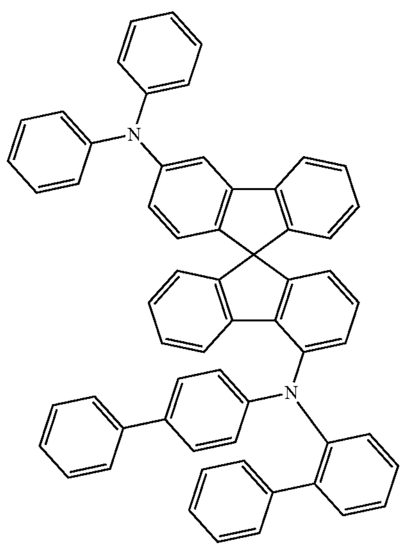
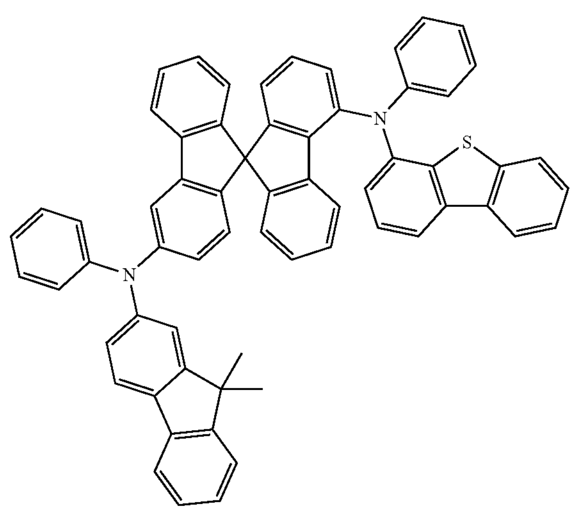
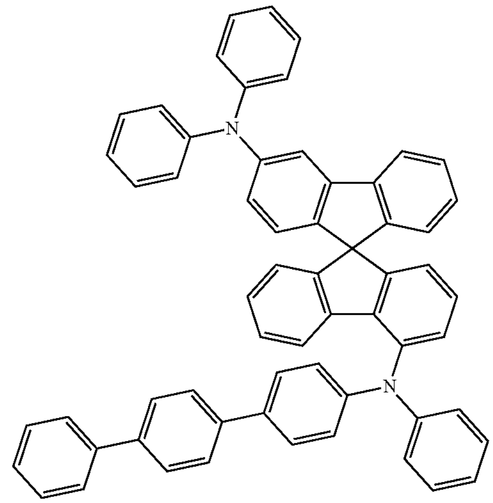 [SMILES: c1ccc(-c2ccc(-c3ccc(N(c4ccccc4)c4cccc5c4-c4ccccc4C54c5ccccc5-c5cc(N(c6ccccc6)c6ccccc6)ccc54)cc3)cc2)cc1]
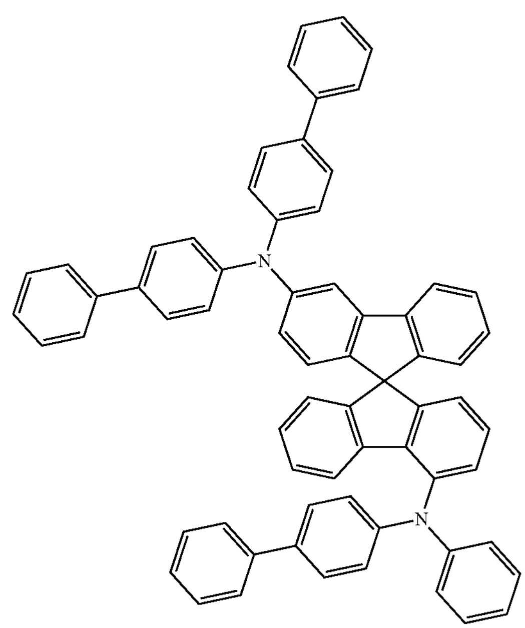

-continued
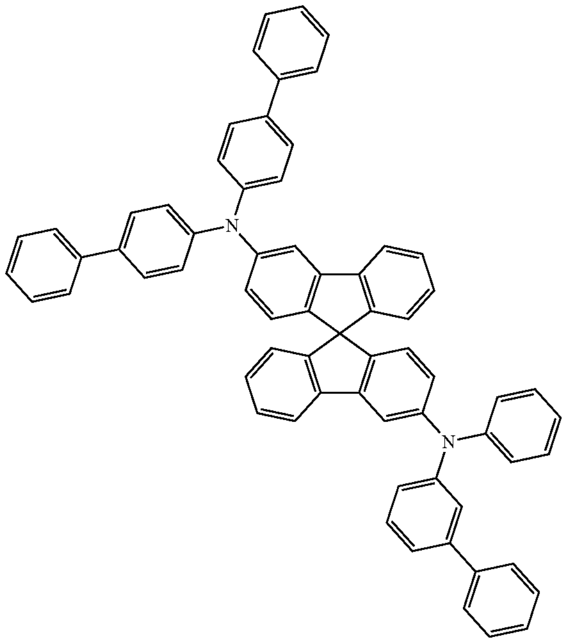
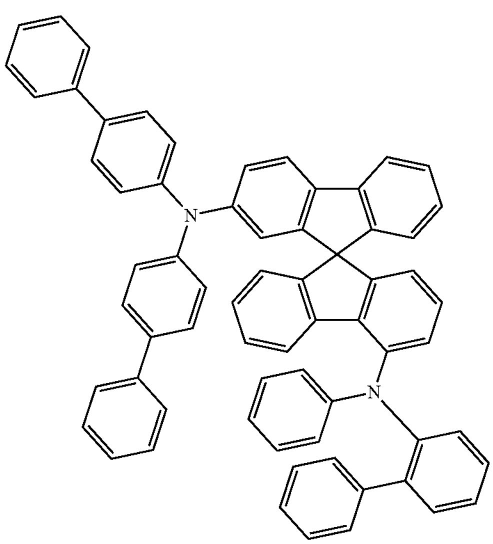
-continued
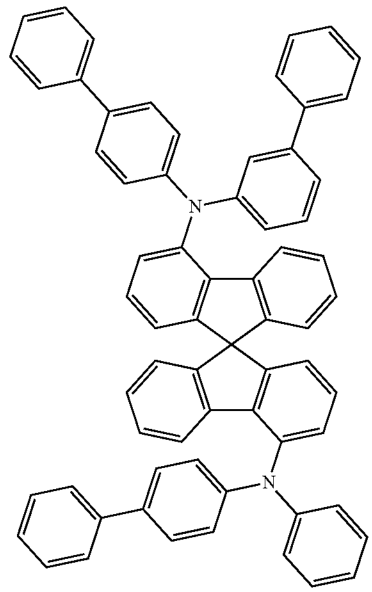
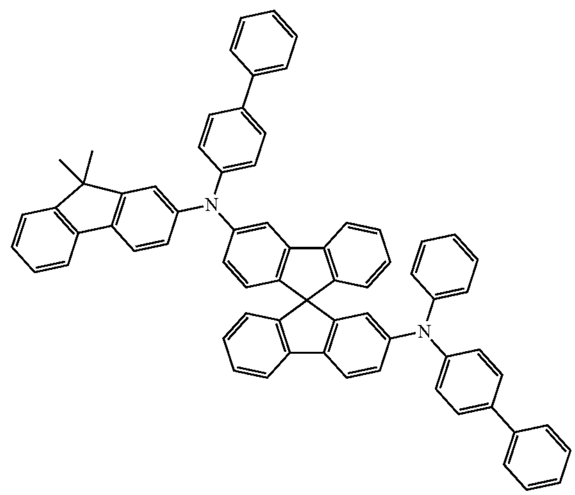
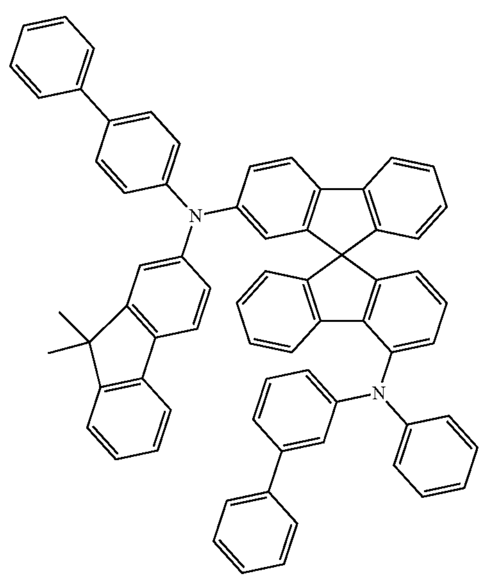

-continued
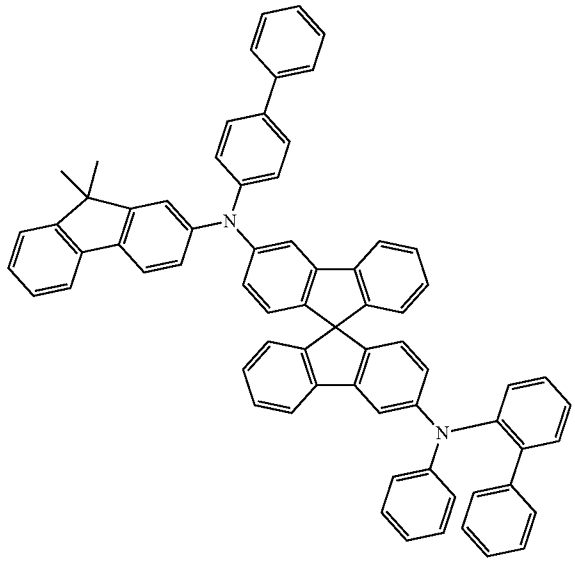
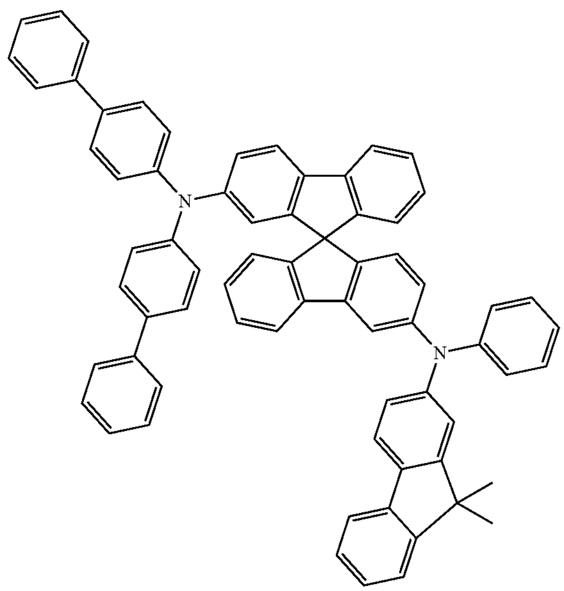 [SMILES: CC1(C)c2ccccc2-c2ccc(N(c3ccccc3)c3ccc4c(c3)-c3ccccc3C43c4ccccc4-c4ccc(N(c5ccc(-c6ccccc6)cc5)c5ccc(-c6ccccc6)cc5)cc43)cc21]
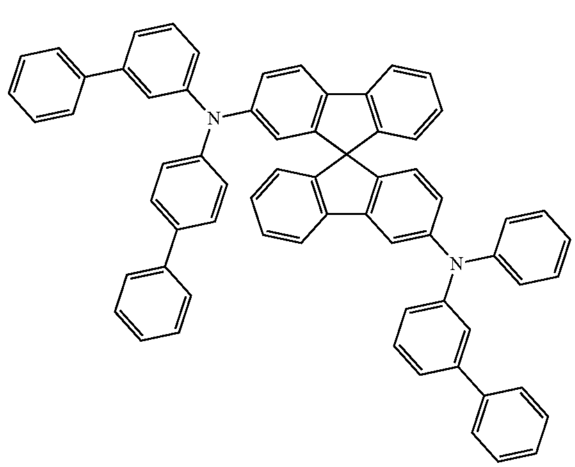
-continued
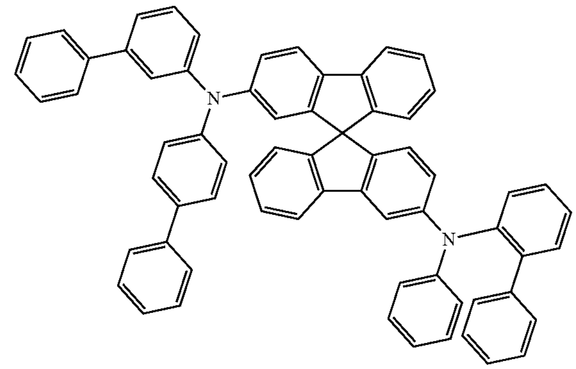
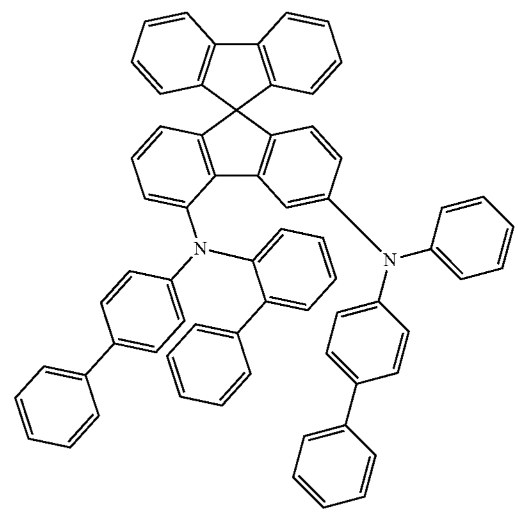
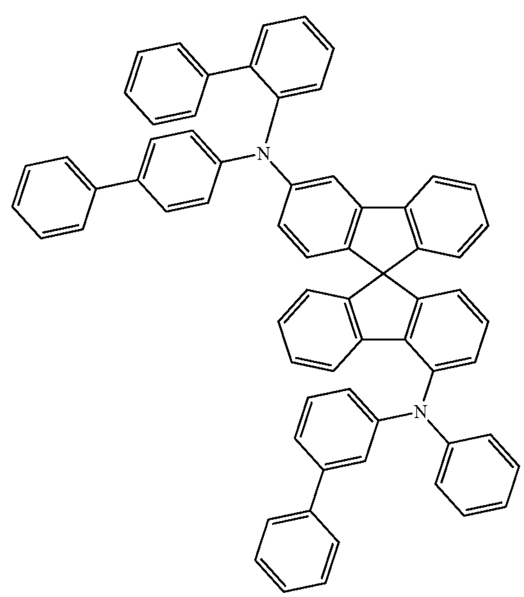 [SMILES: c1ccc(-c2ccc(N(c3ccc4c(c3)-c3ccccc3C43c4ccccc4-c4c(N(c5ccccc5)c5cccc(-c6ccccc6)c5)cccc43)c3ccccc3-c3ccccc3)cc2)cc1]

-continued
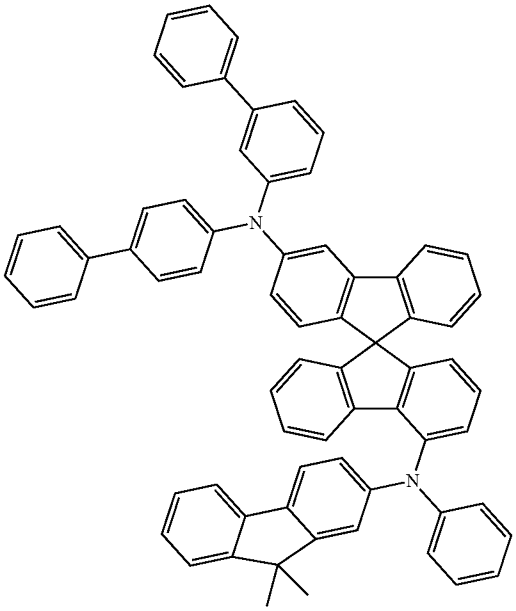
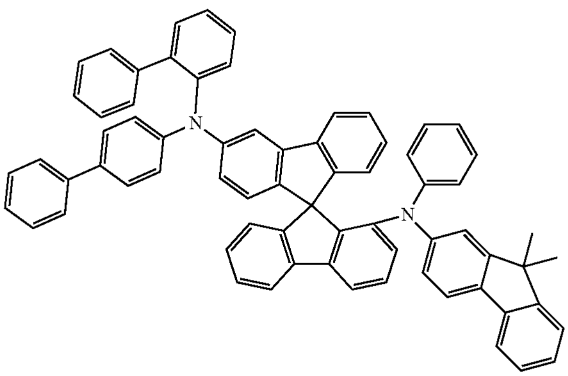
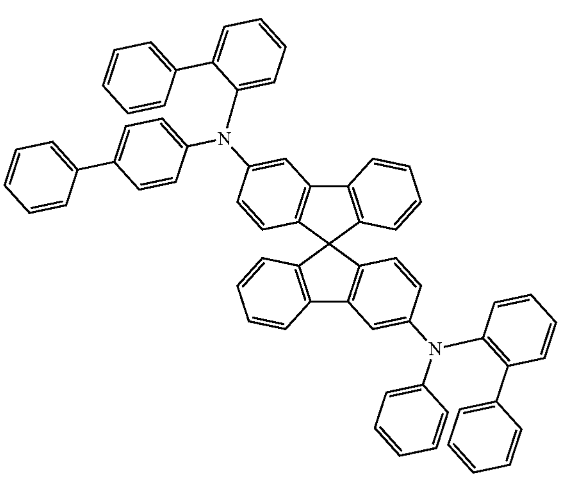
-continued
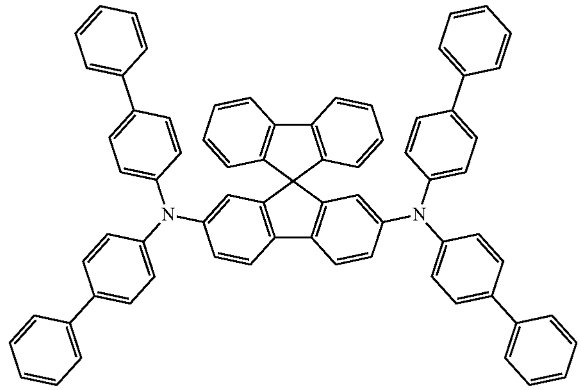
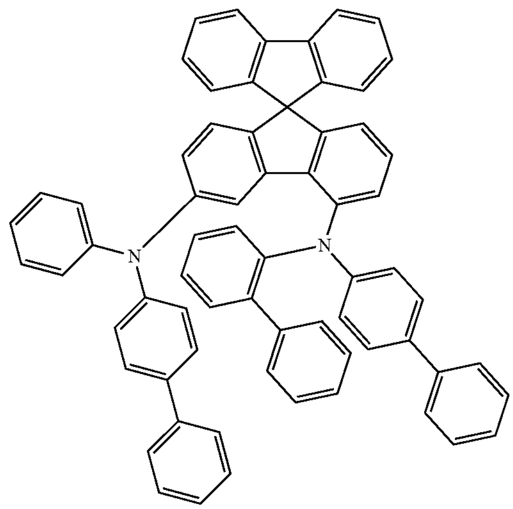
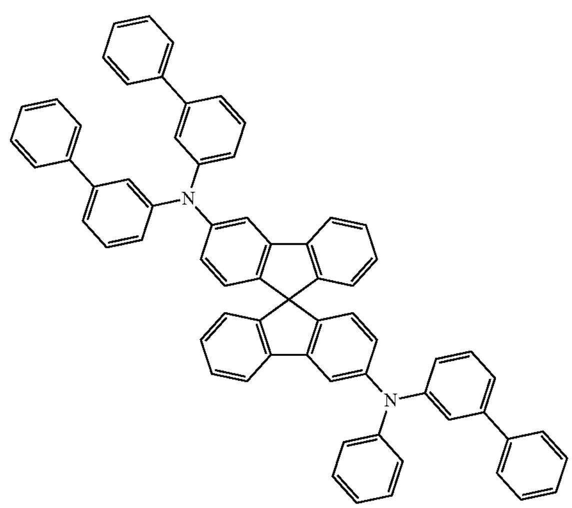

-continued
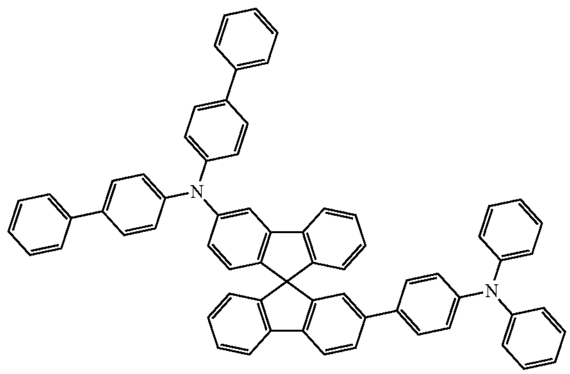 [SMILES: c1ccc(-c2ccc(N(c3ccc(-c4ccccc4)cc3)c3ccc4c(c3)-c3ccccc3C43c4ccccc4-c4ccc(-c5ccc(N(c6ccccc6)c6ccccc6)cc5)cc43)cc2)cc1]
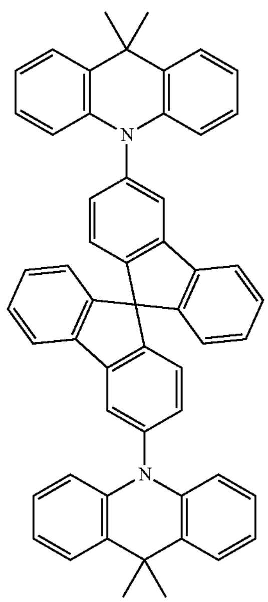
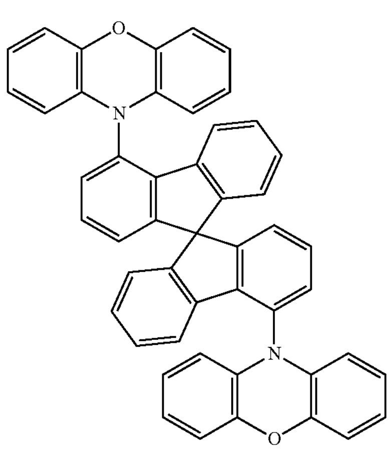
-continued
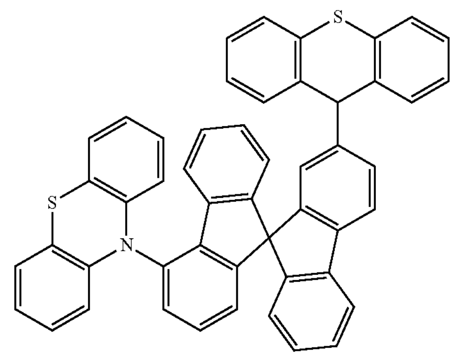
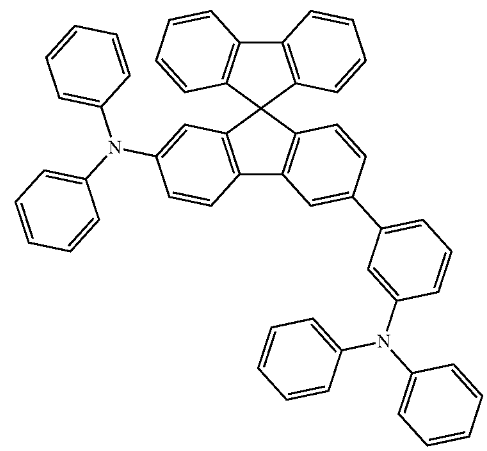
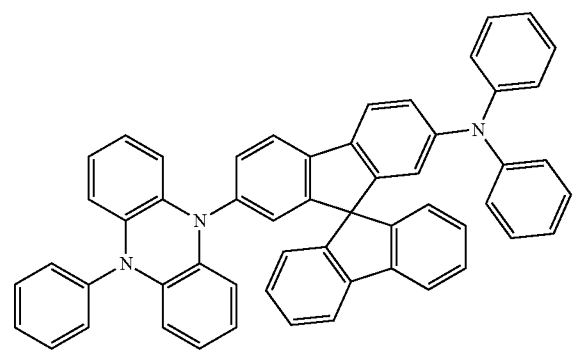
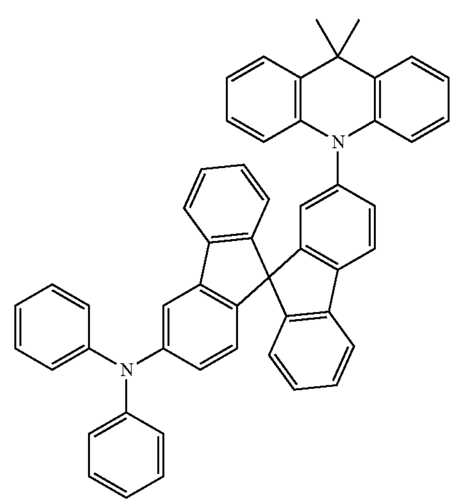

-continued
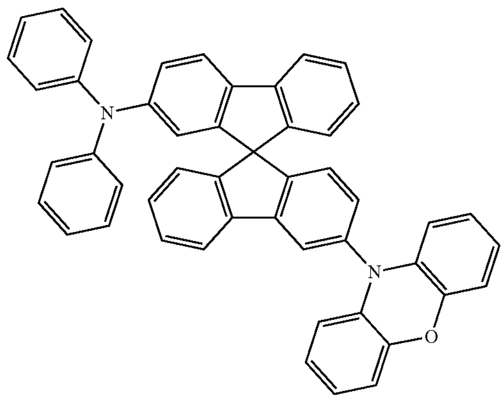
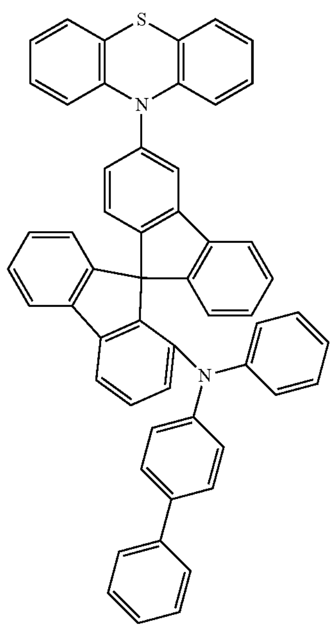
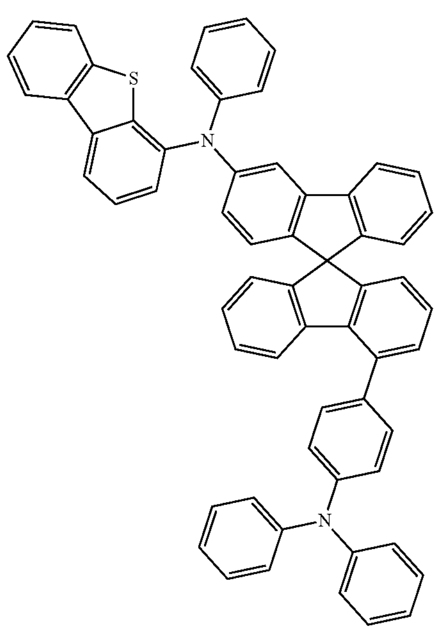
-continued
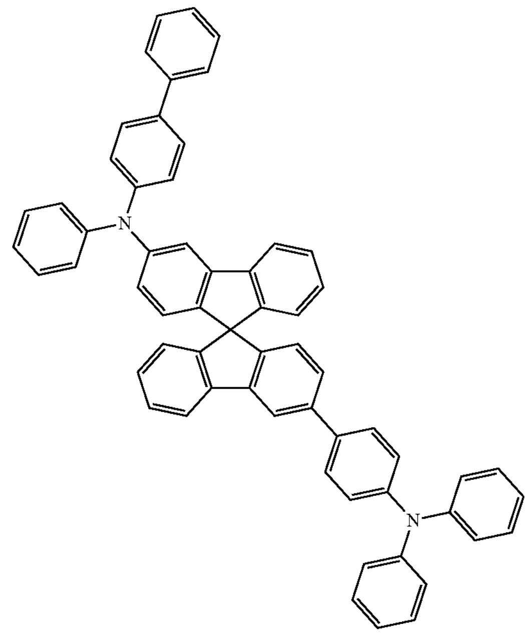
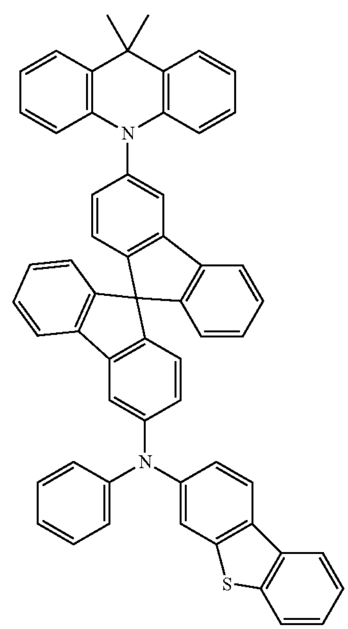
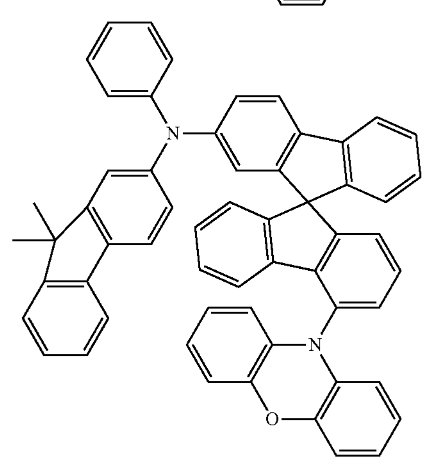

-continued
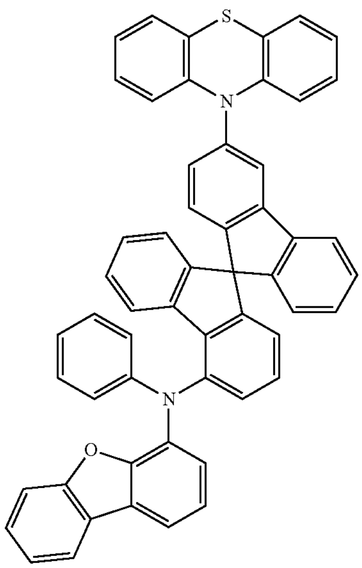
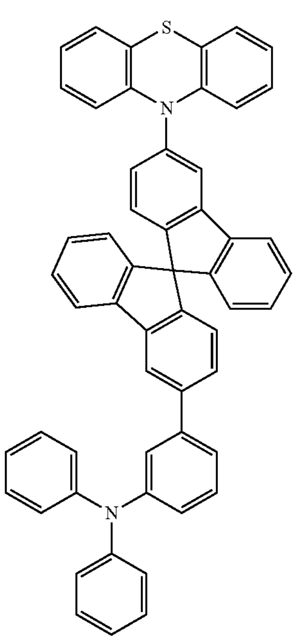
-continued
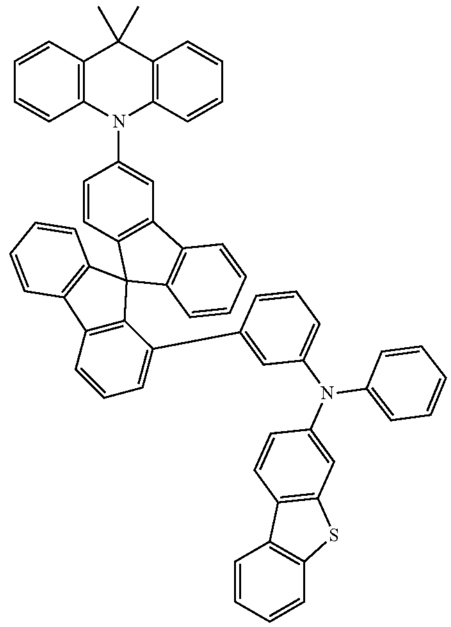
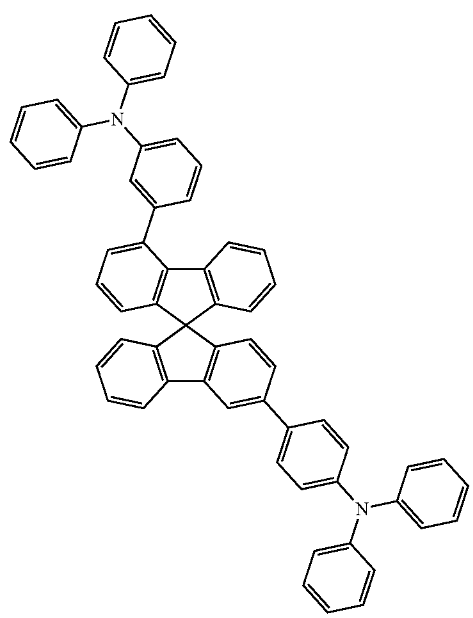

-continued
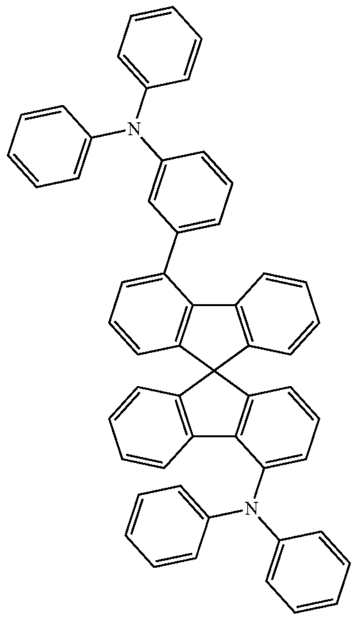
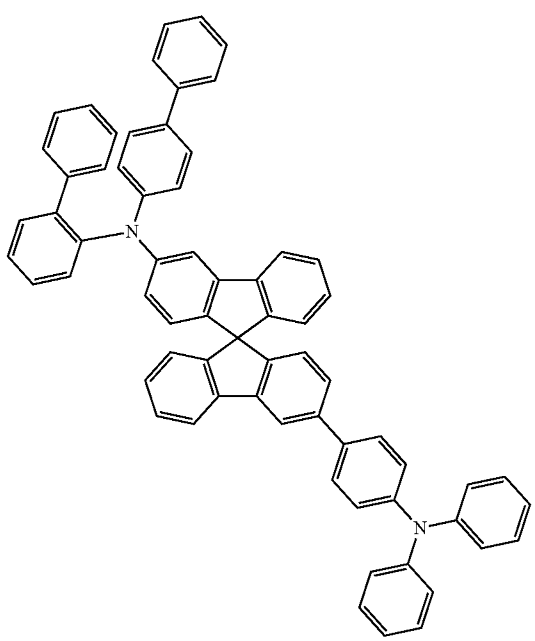
-continued
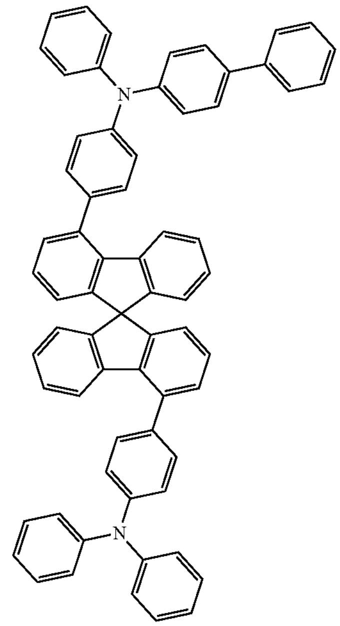
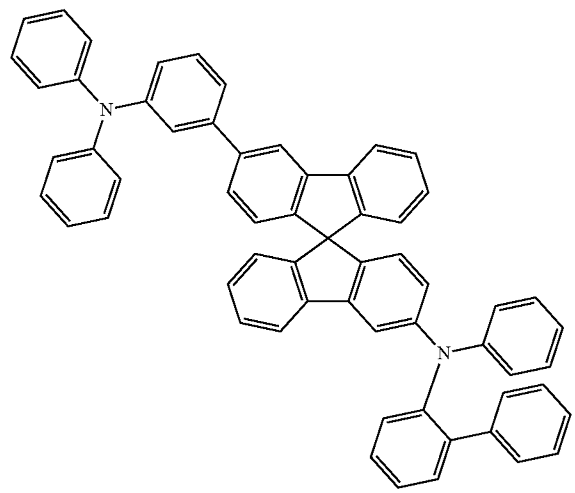
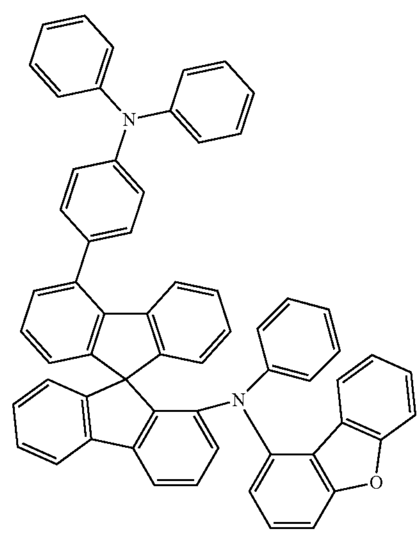

-continued
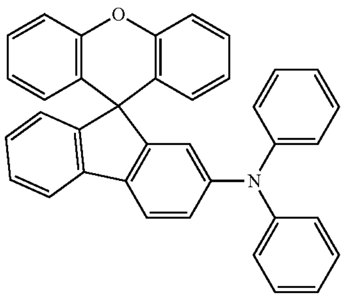
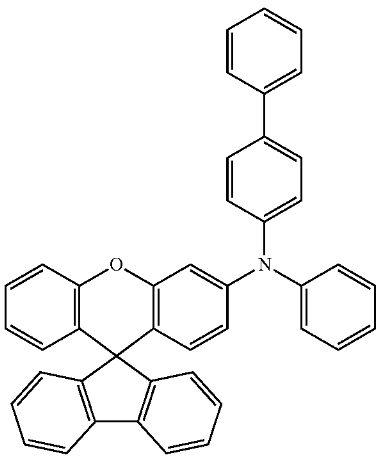
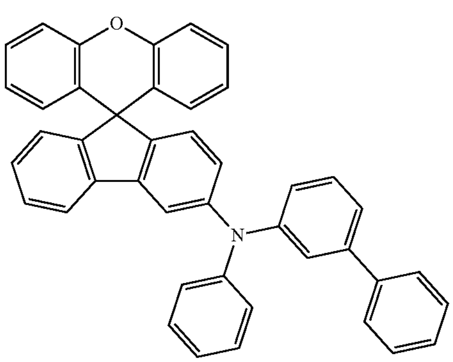
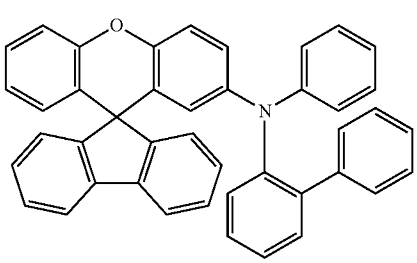
-continued
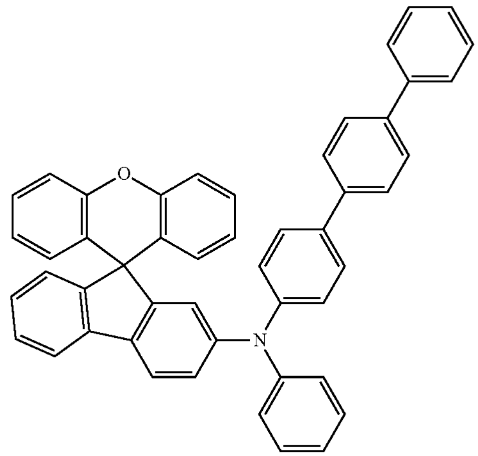
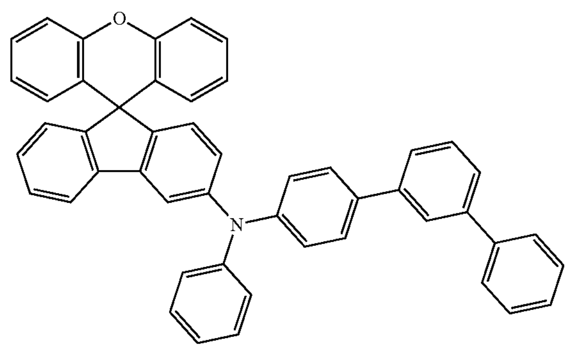
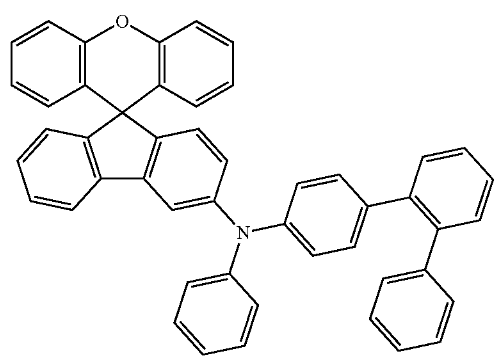
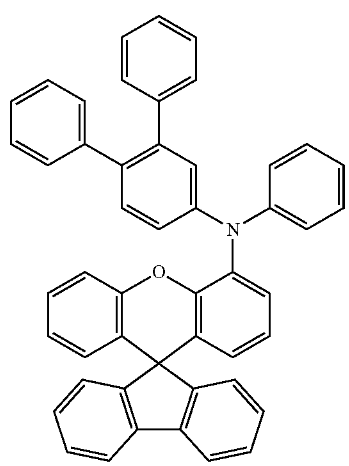

-continued
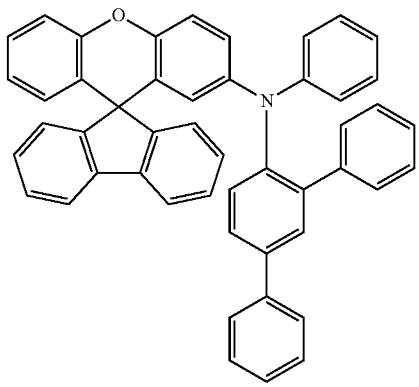
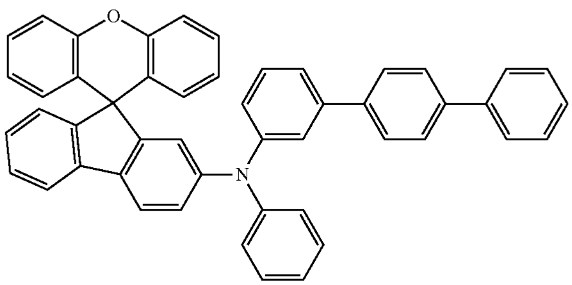
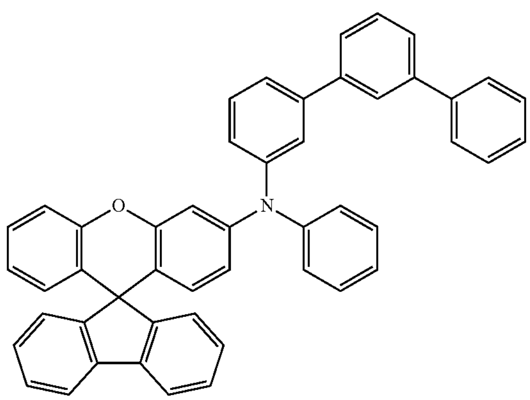
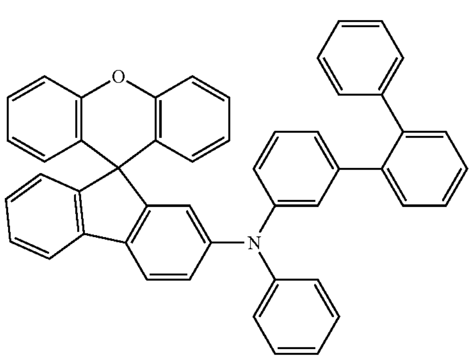
-continued
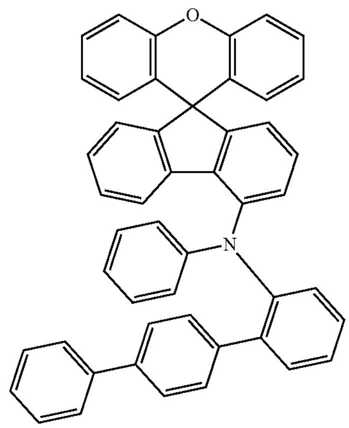
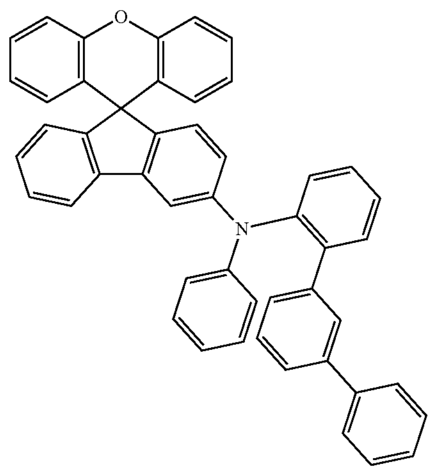
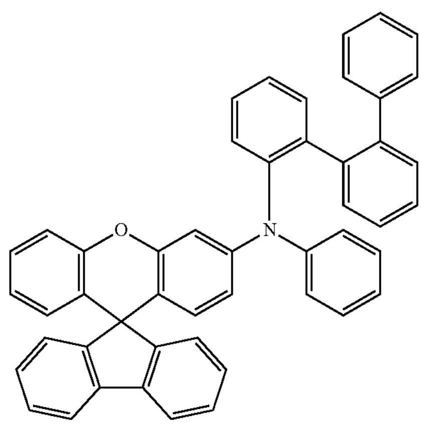
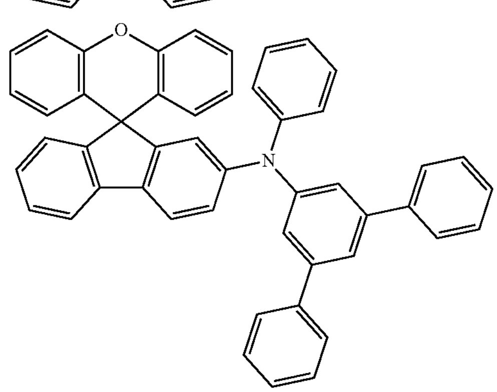

-continued
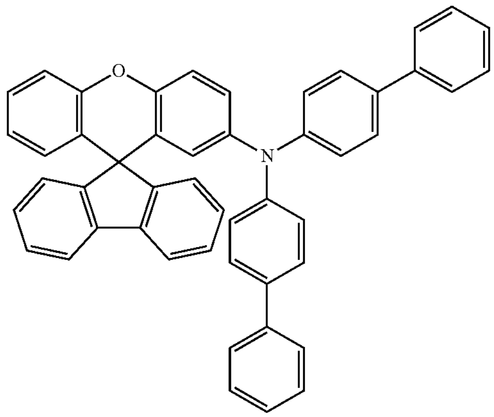
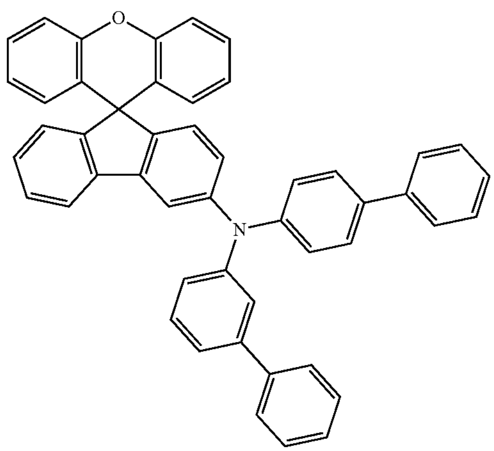
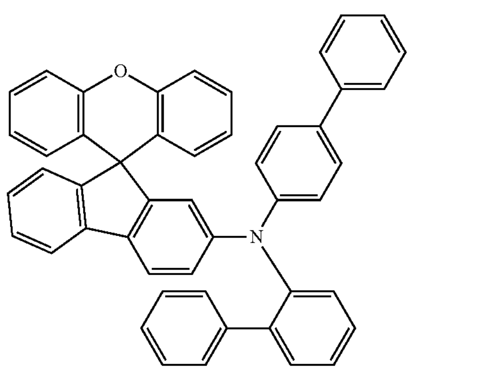
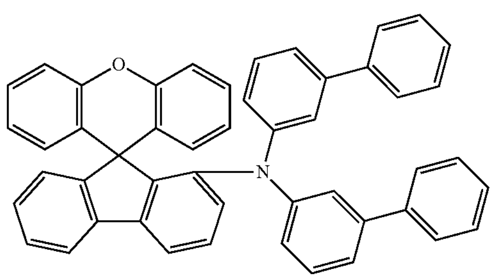
-continued
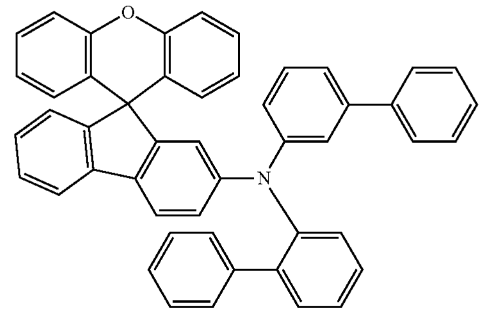
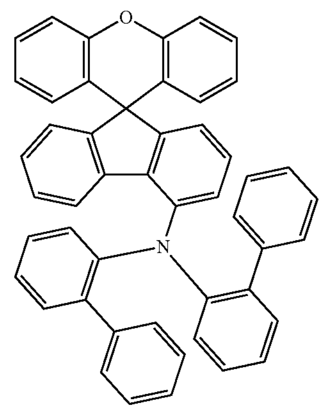
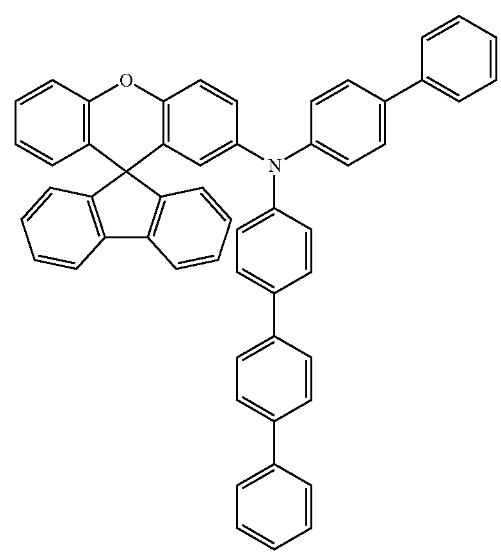

-continued
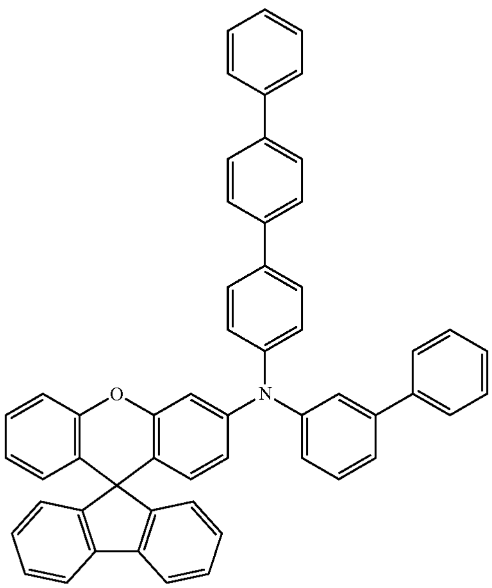
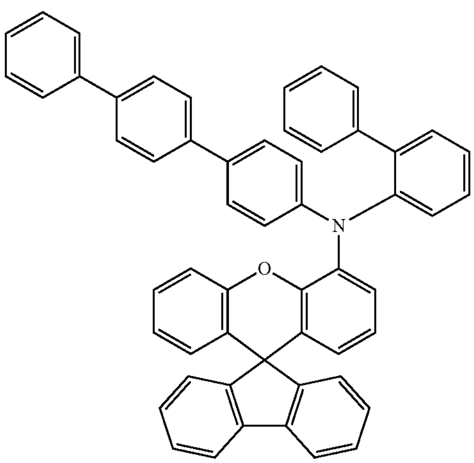
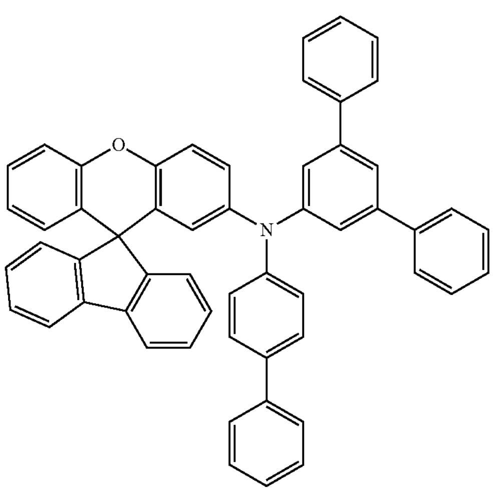
-continued
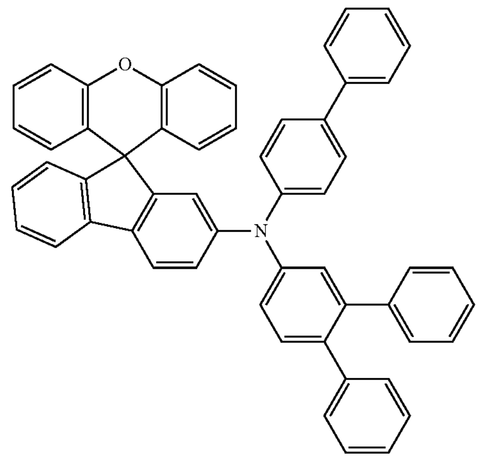
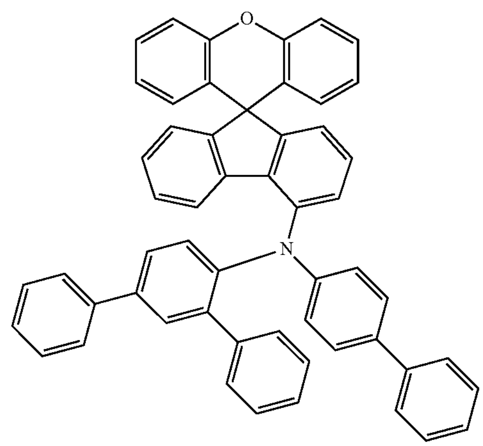
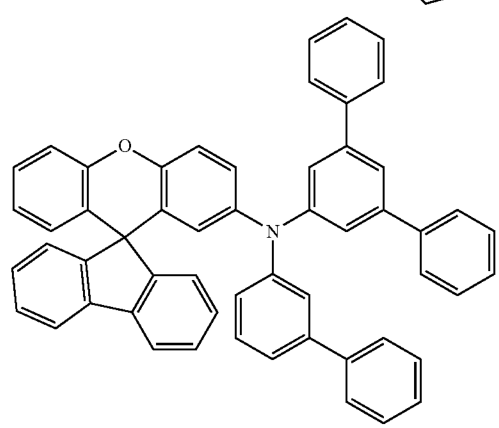
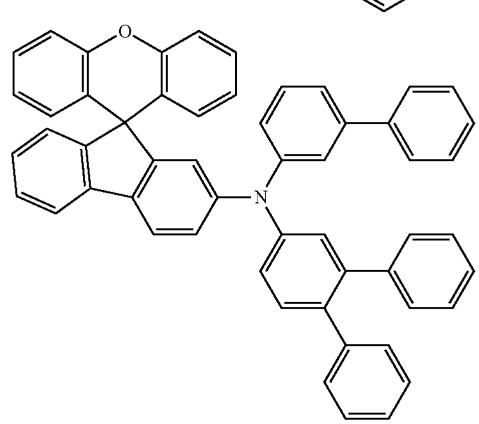

-continued
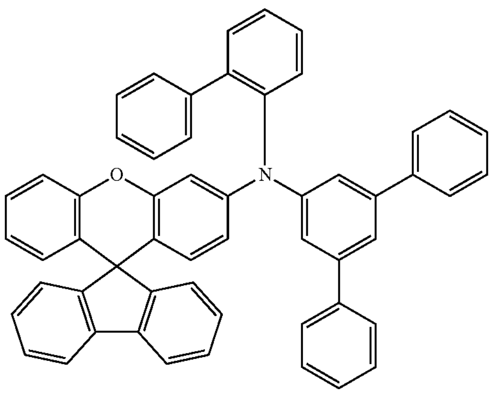
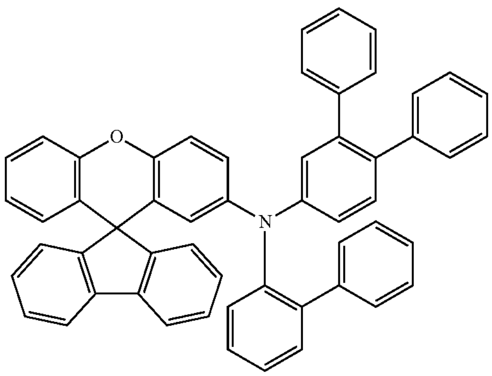
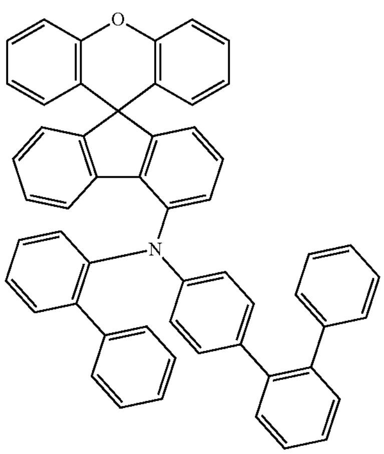
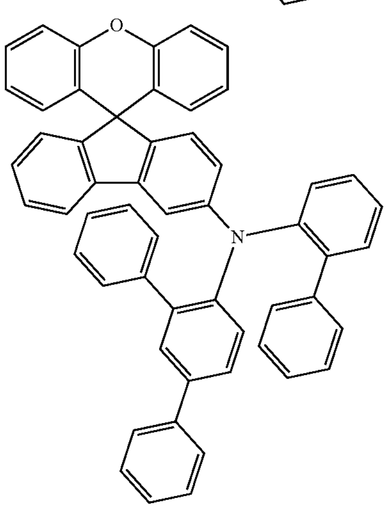
-continued
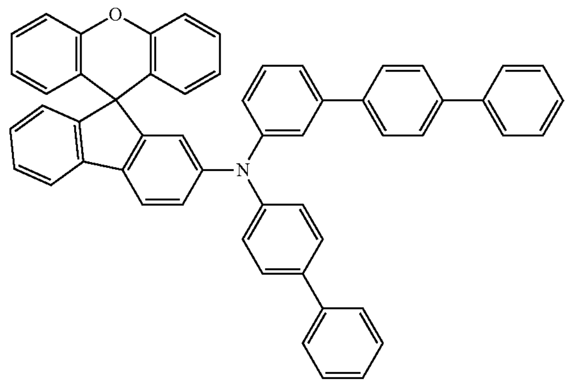
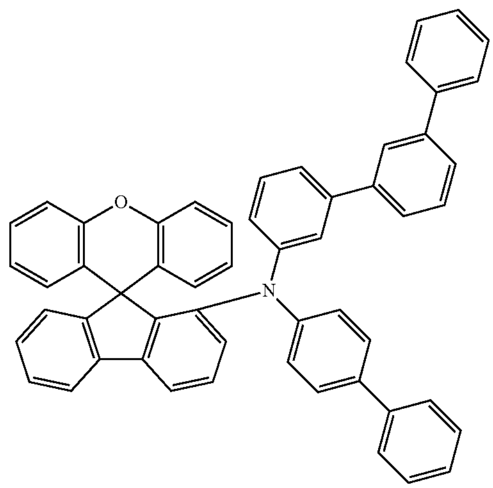
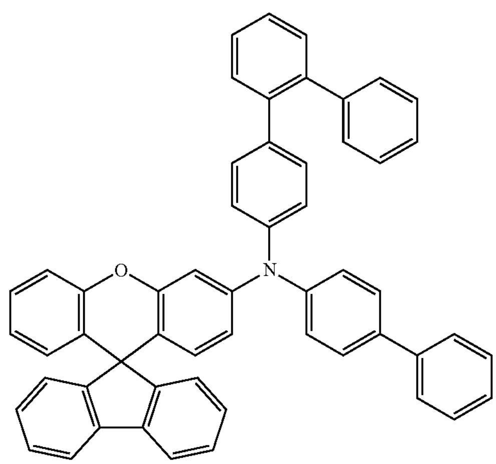

-continued
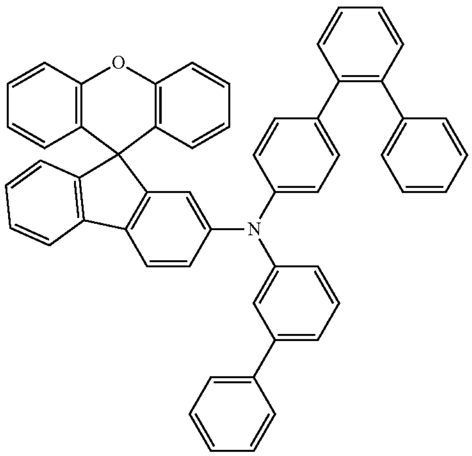
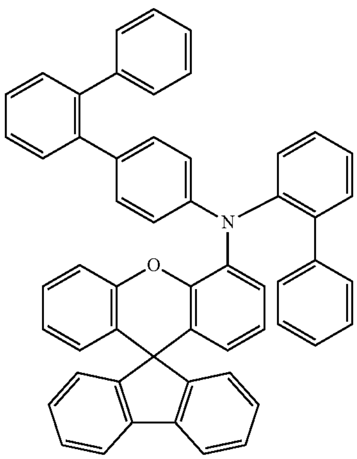
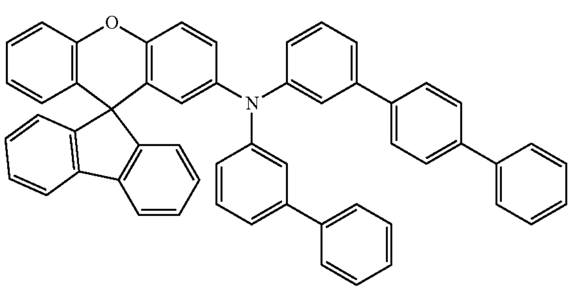
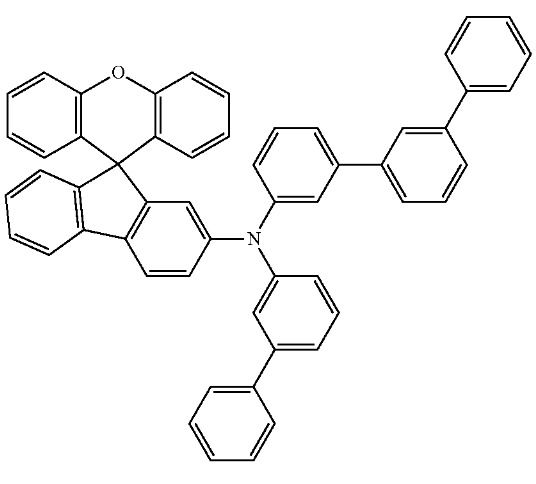
-continued
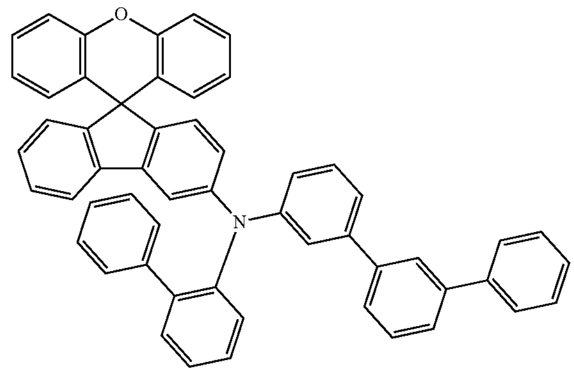
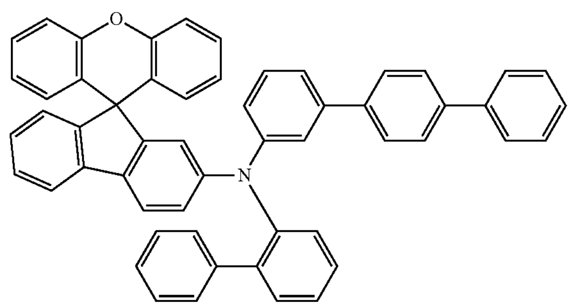
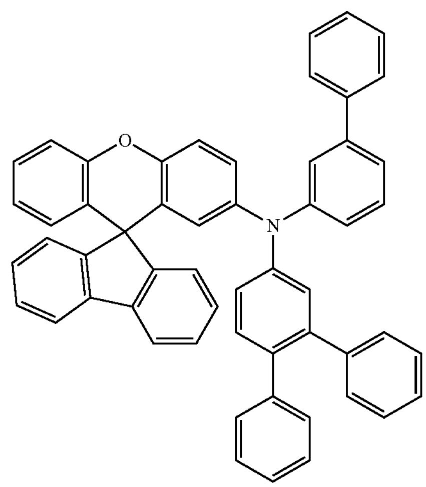
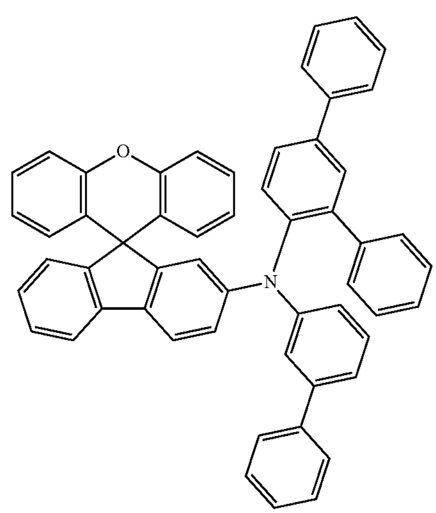

-continued
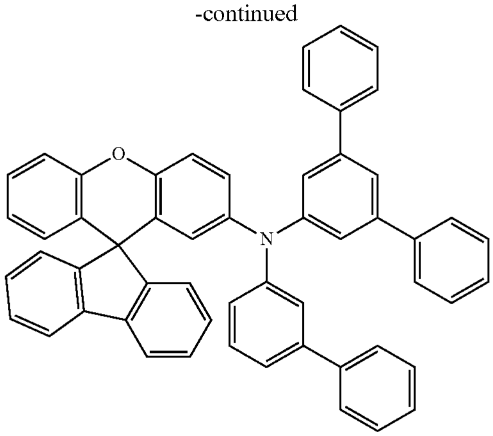
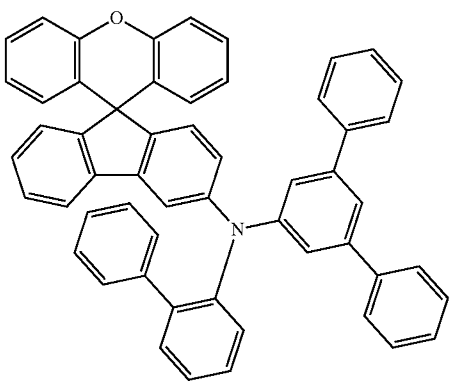
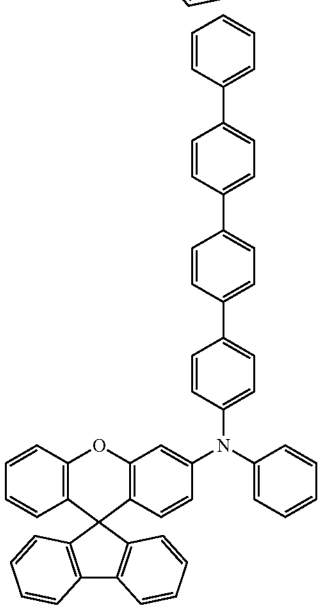
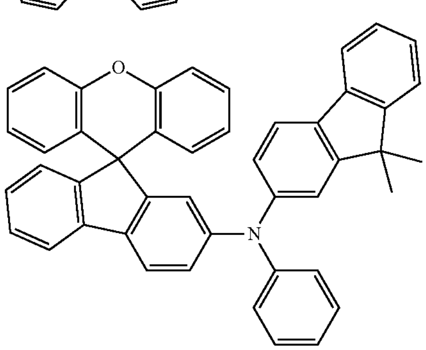
-continued
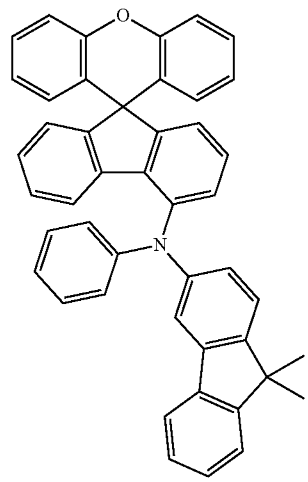
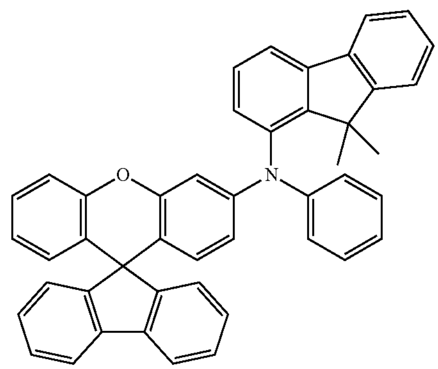
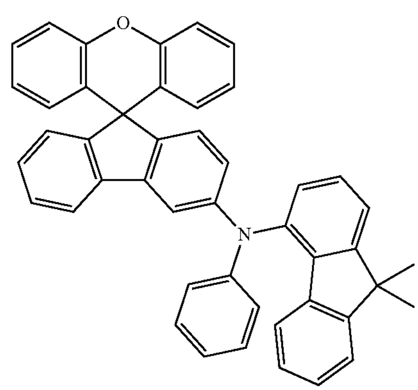
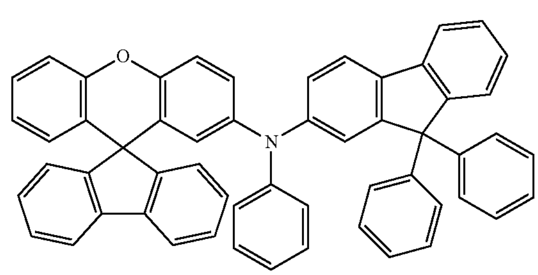

-continued
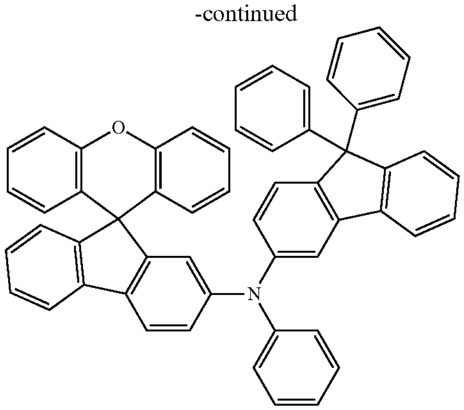
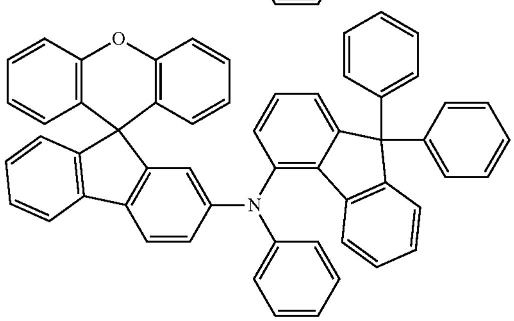
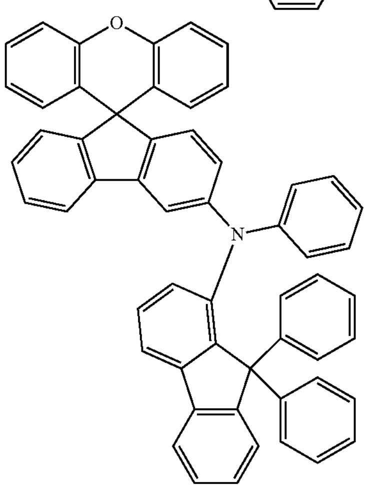
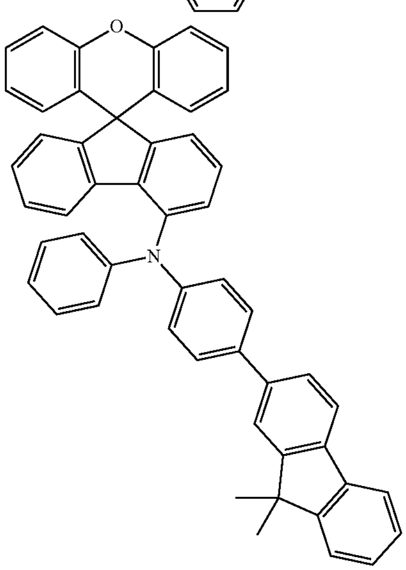
-continued
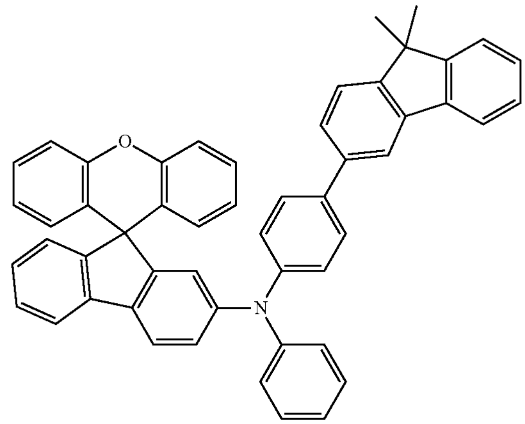
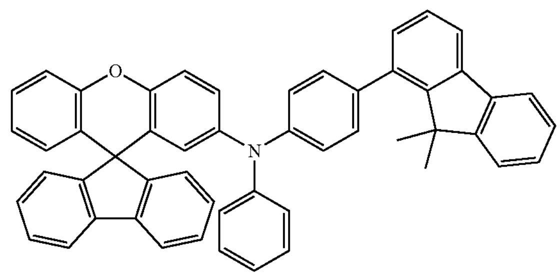
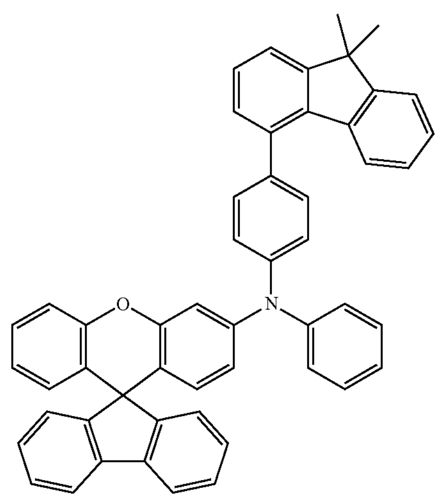
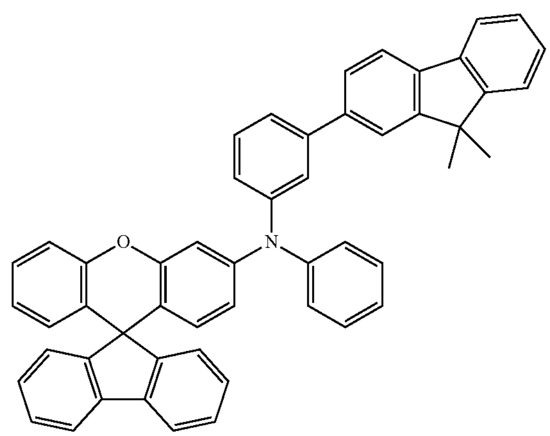

-continued
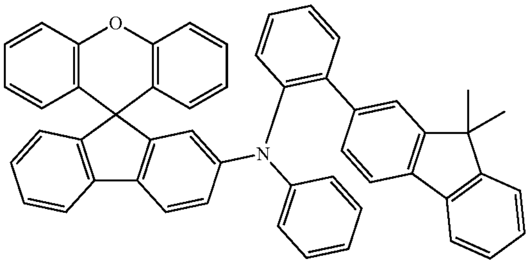
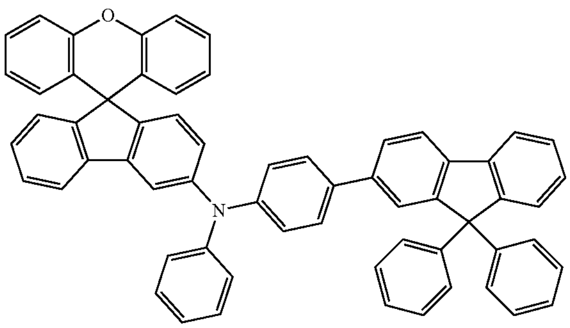
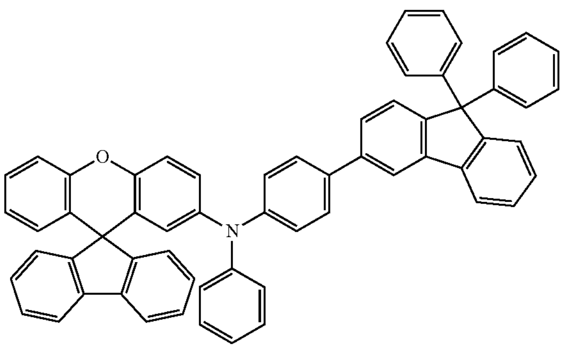
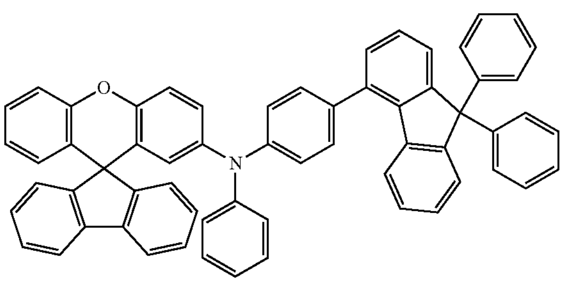
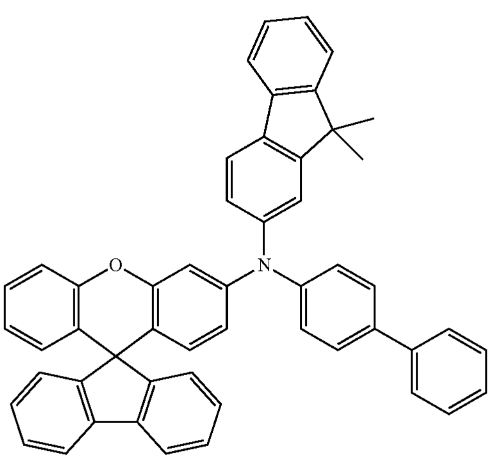
-continued
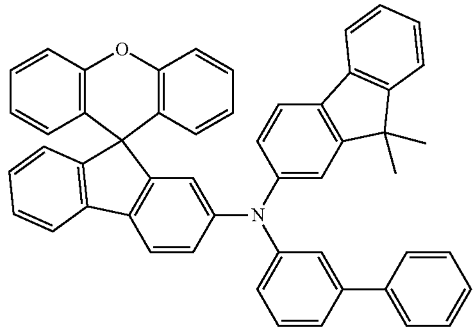
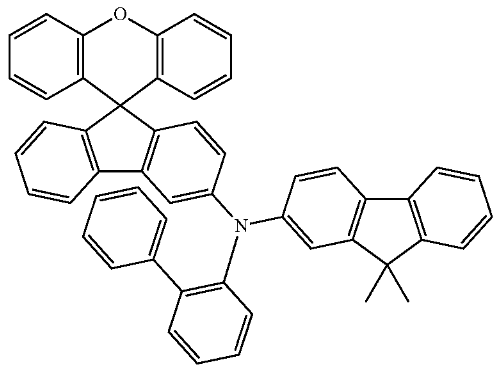
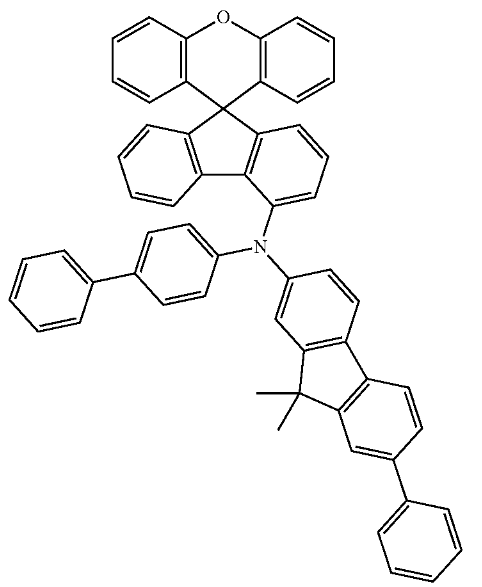
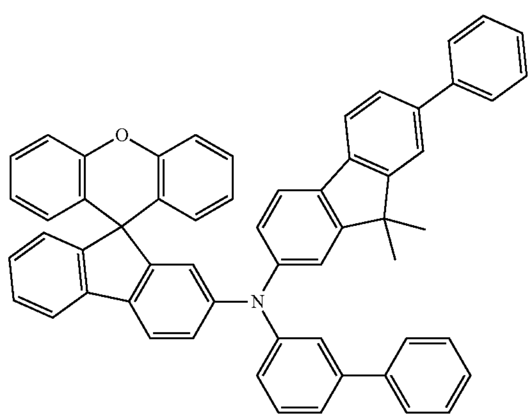

-continued
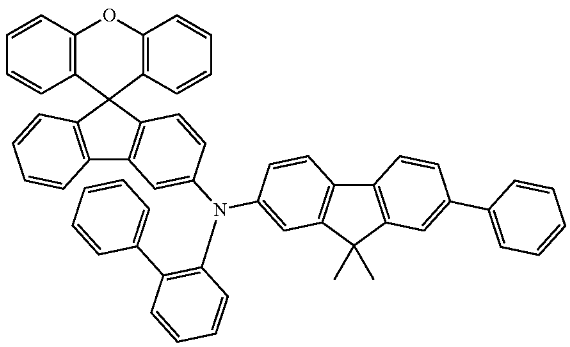
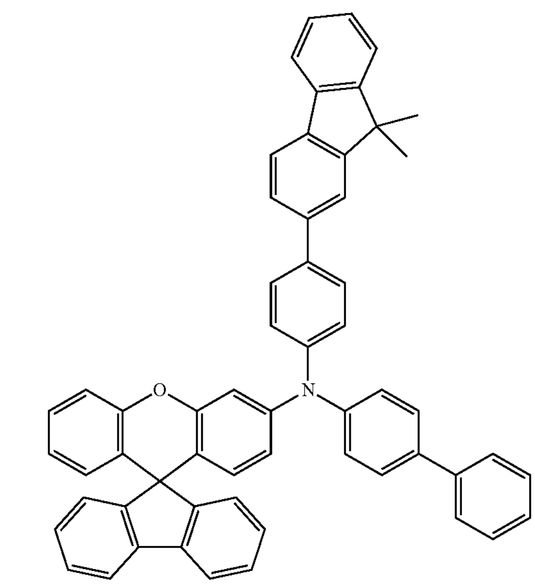
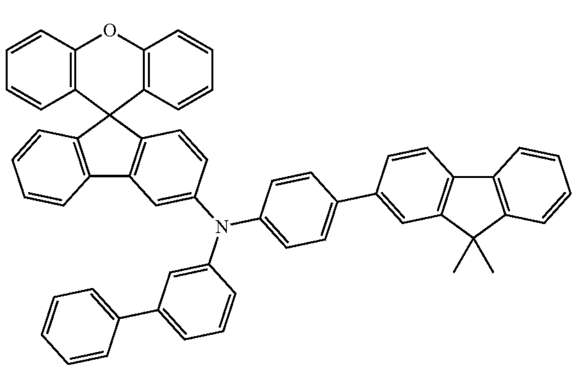
-continued
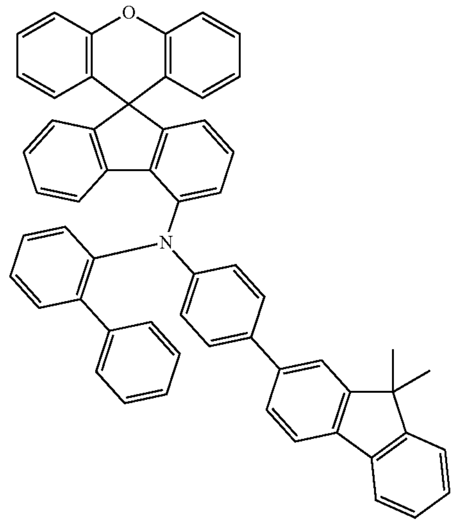
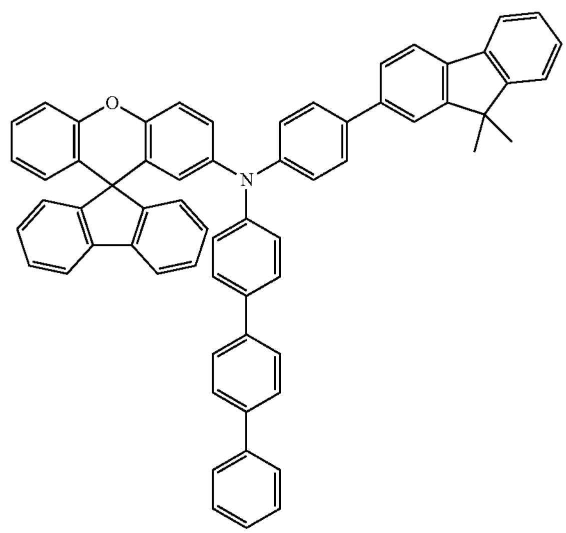
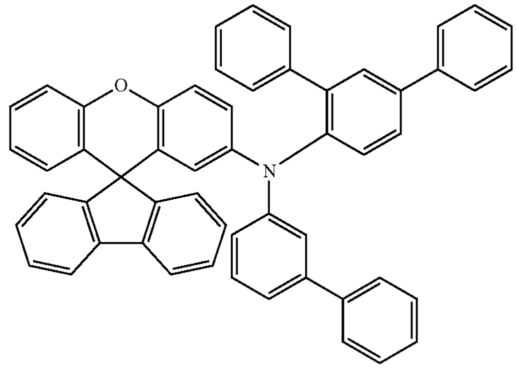

-continued
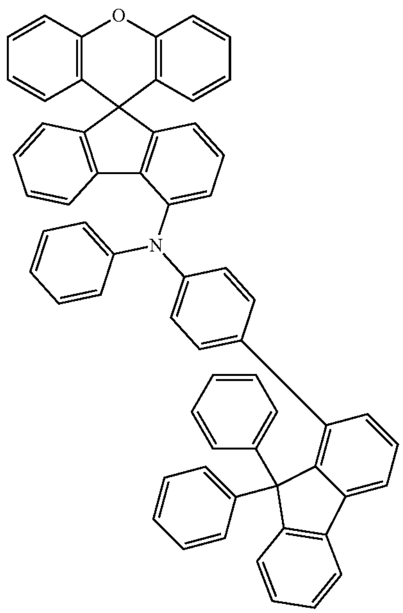
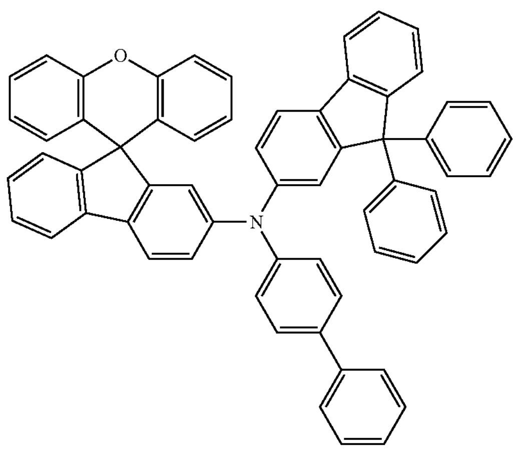
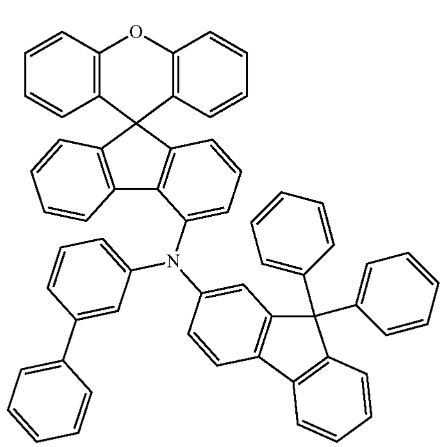
-continued
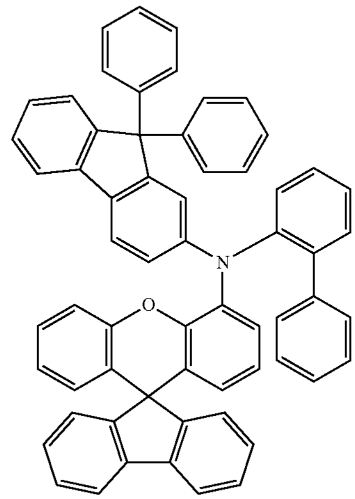
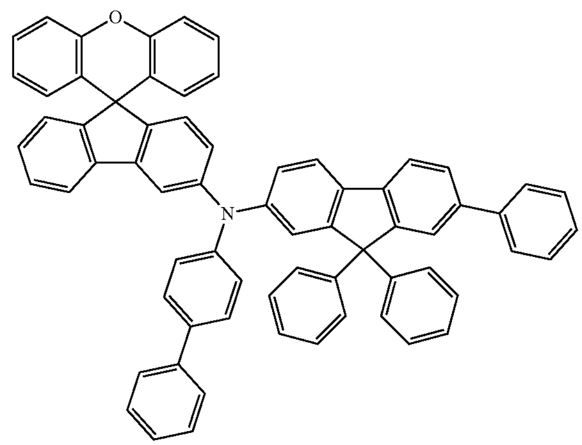
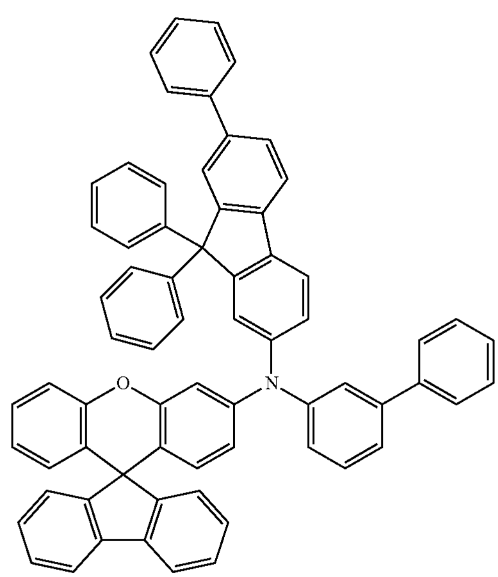

-continued
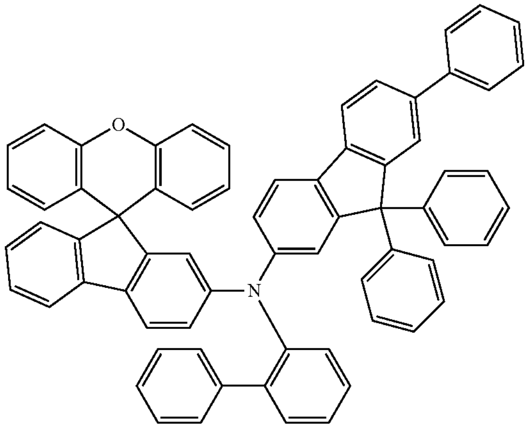
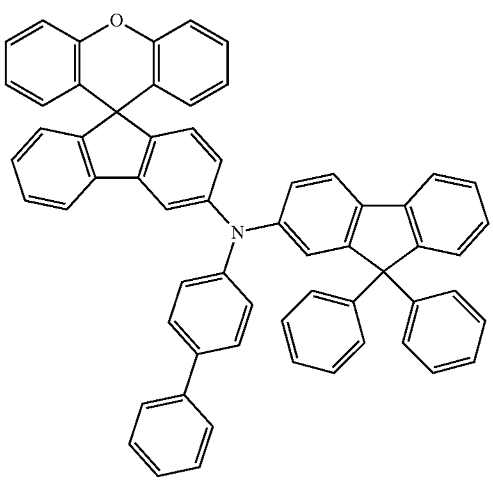
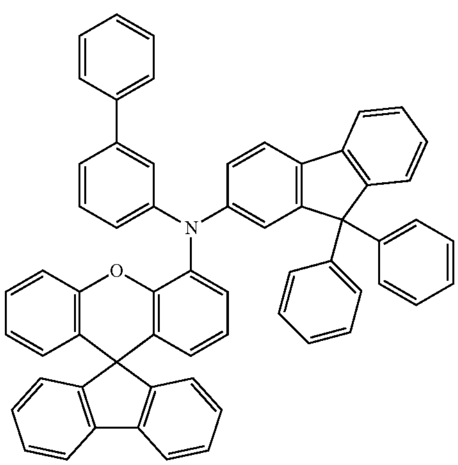
-continued
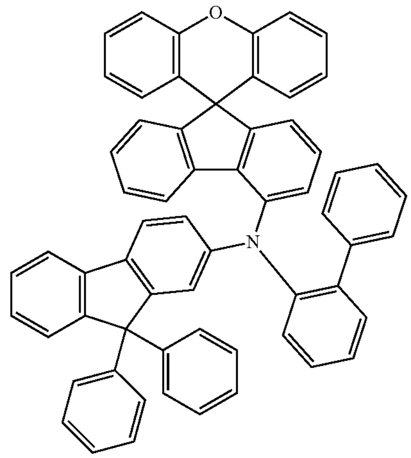
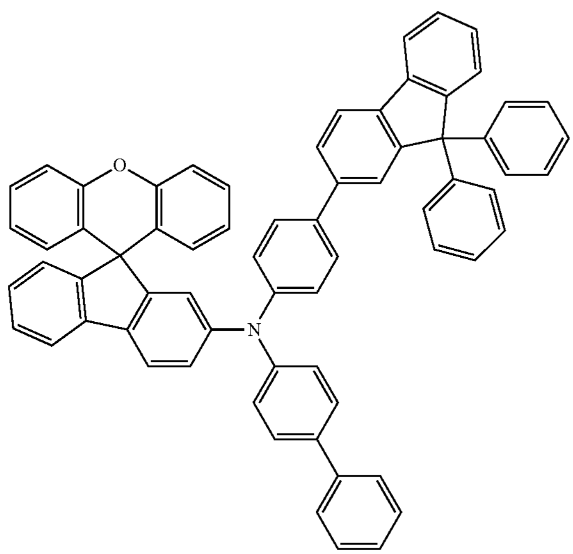
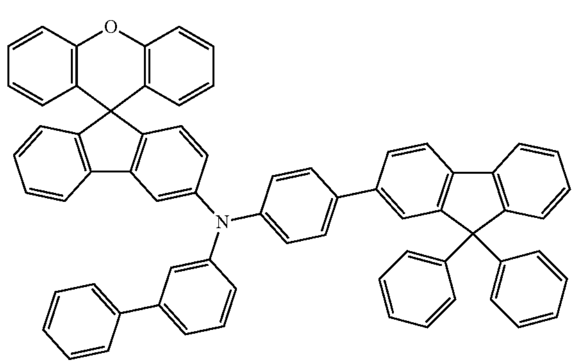

-continued
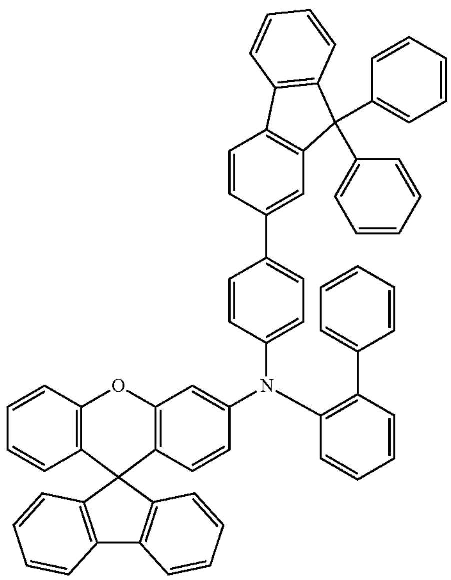
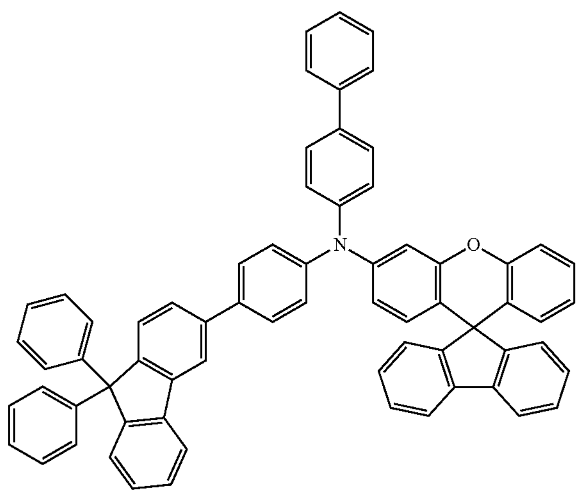
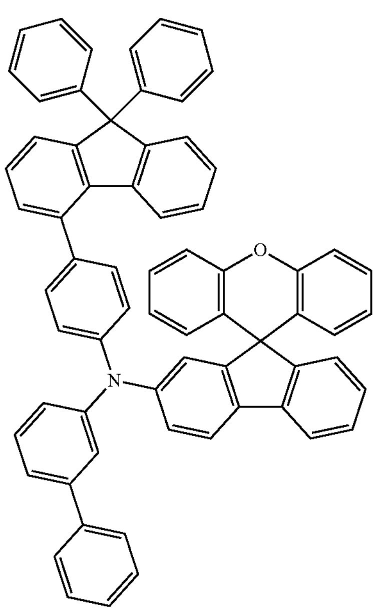
-continued
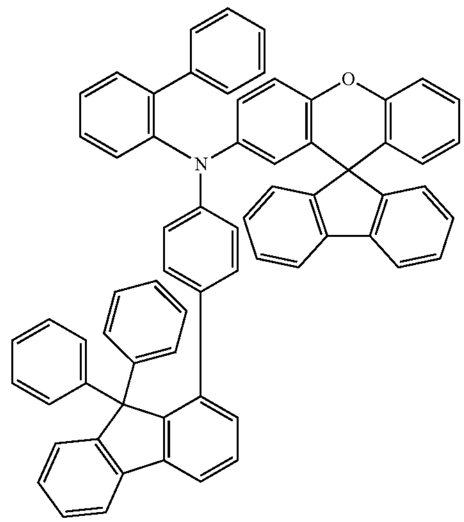
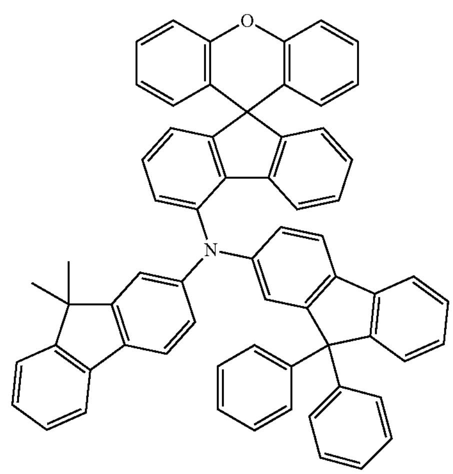
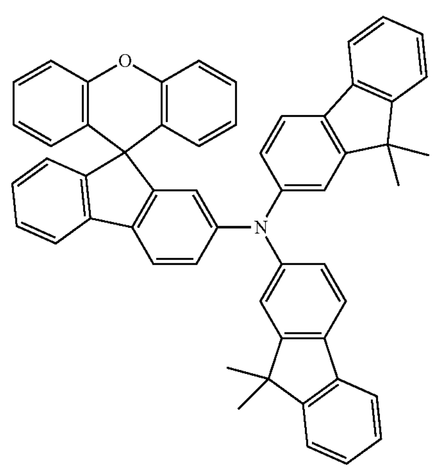

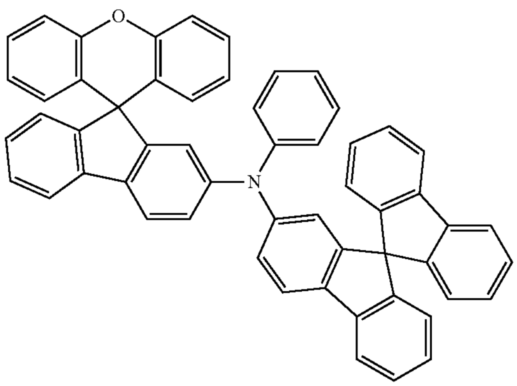
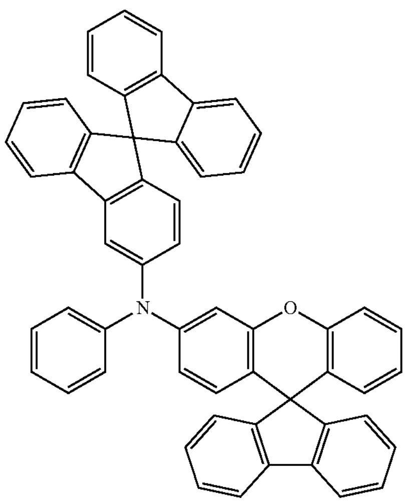
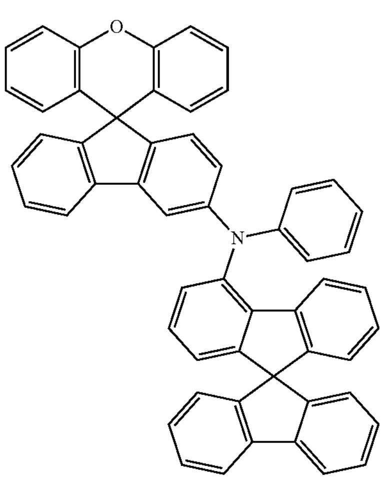
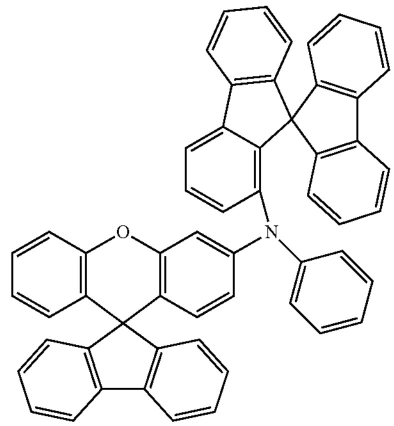
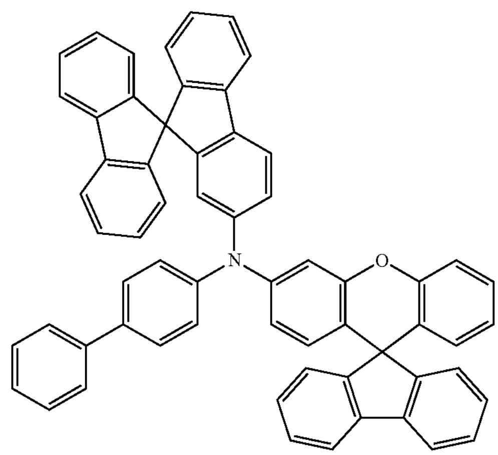
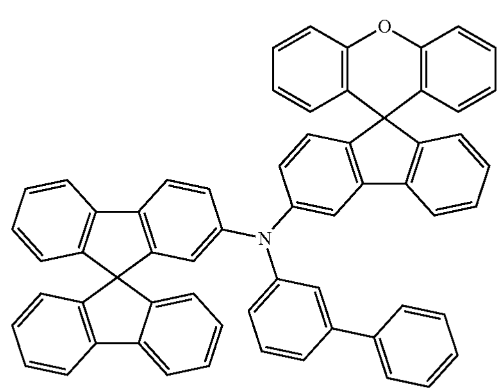

-continued
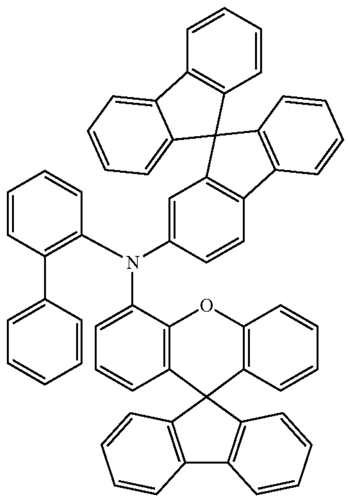
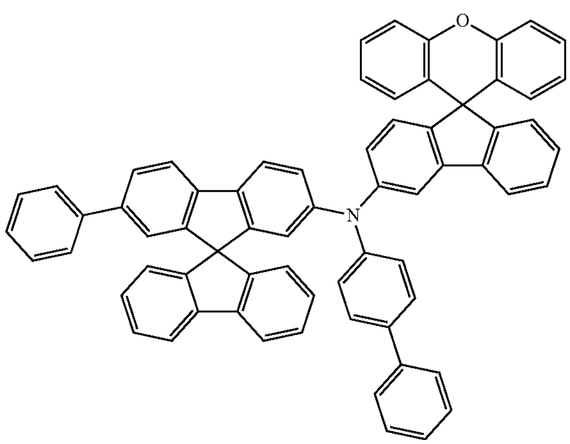
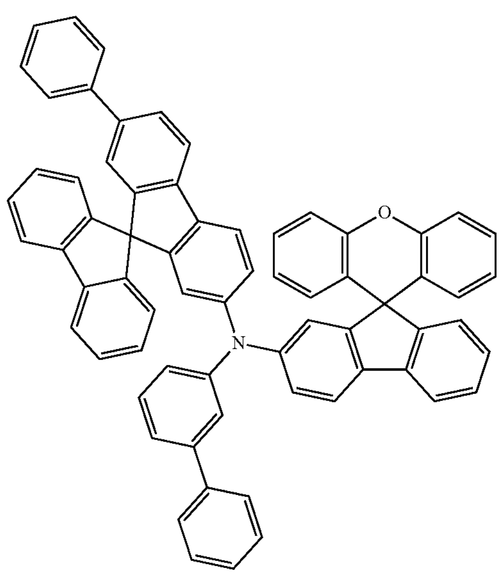
-continued
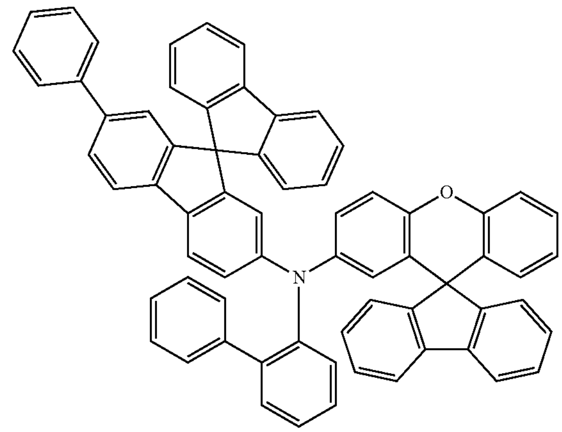
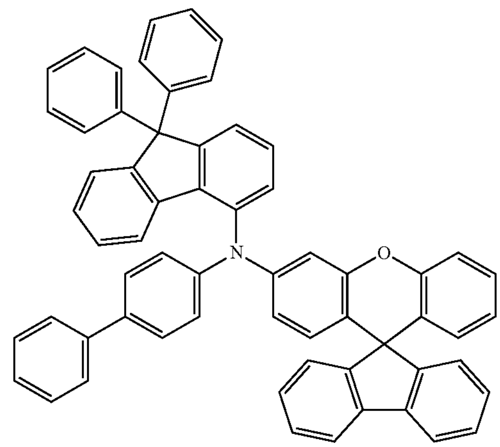
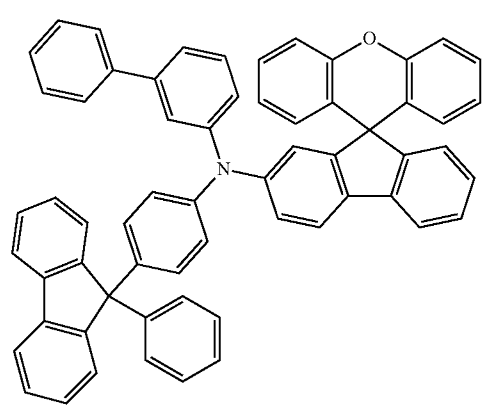

-continued
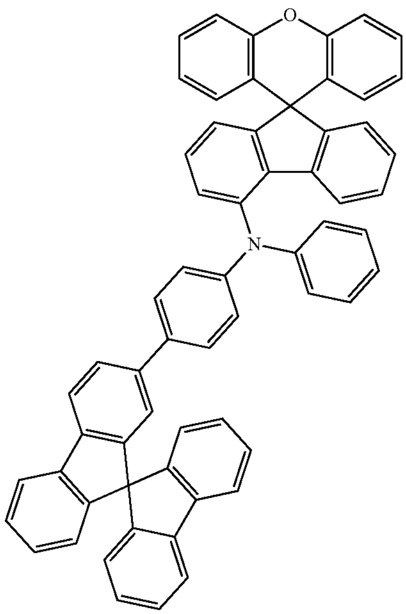
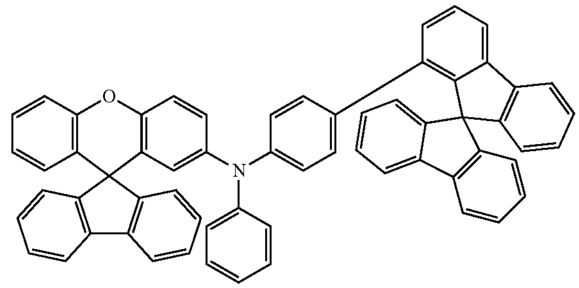
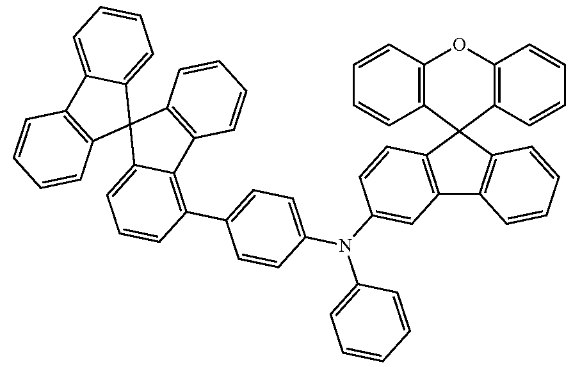
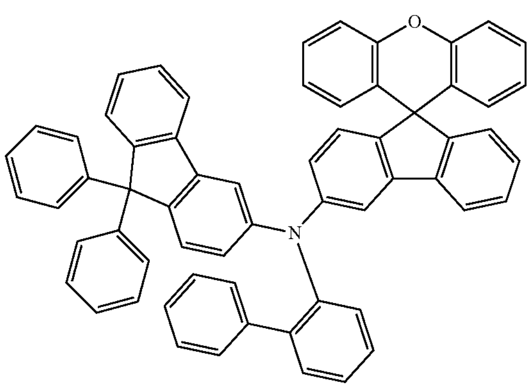
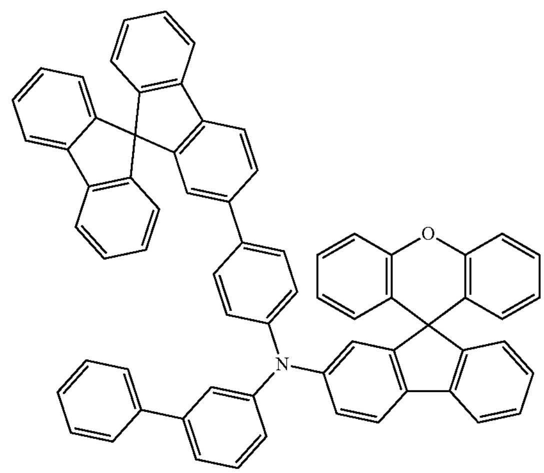 [SMILES: c1ccc(-c2cccc(N(c3ccc(-c4ccc5c(c4)C4(c6ccccc6-c6ccccc64)c4ccccc4-5)cc3)c3ccc4c(c3)C3(c5ccccc5Oc5ccccc53)c3ccccc3-4)c2)cc1]
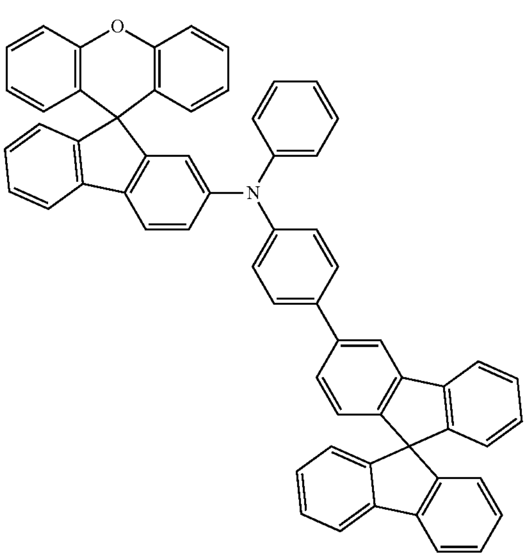
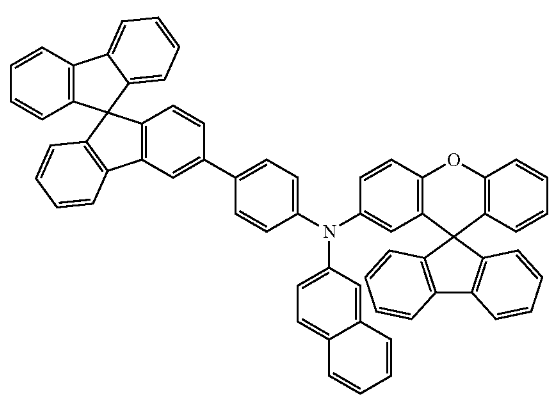
-continued -continued
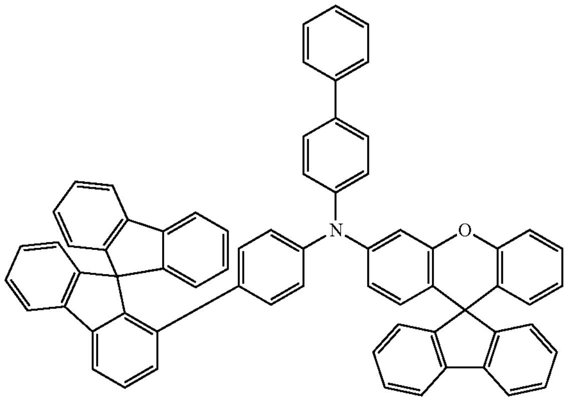
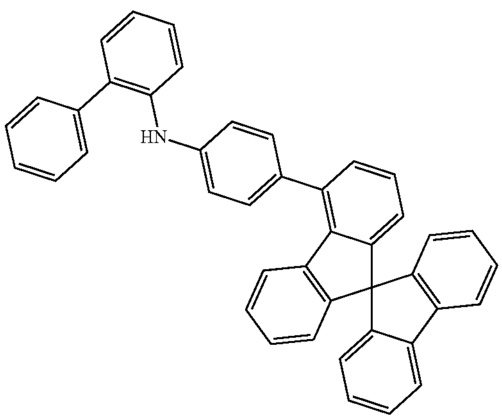
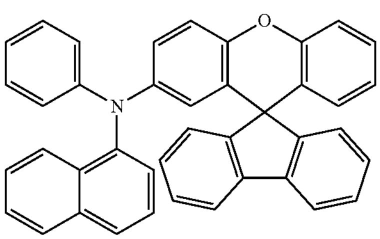
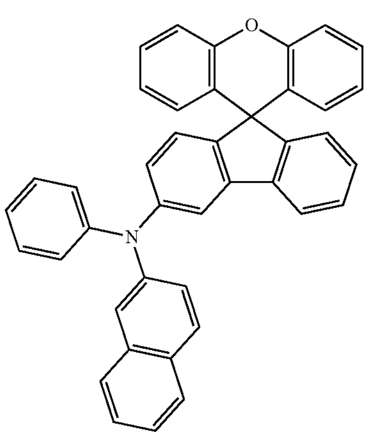
-continued
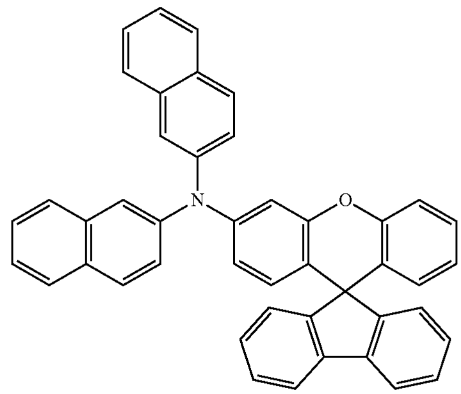
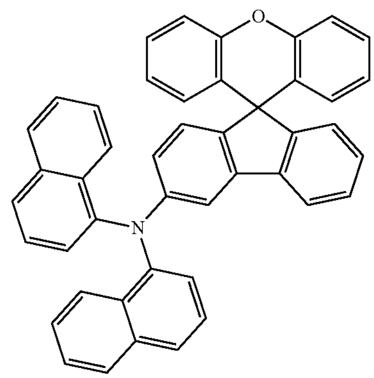
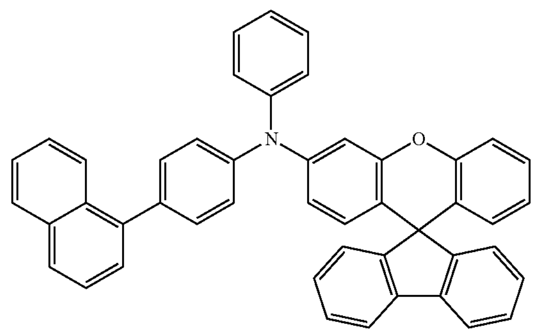
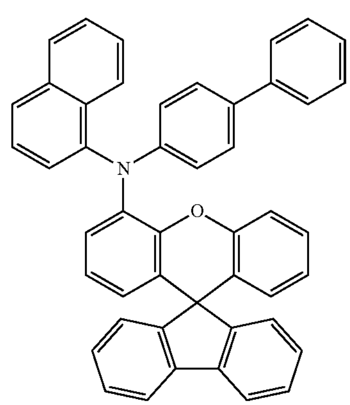

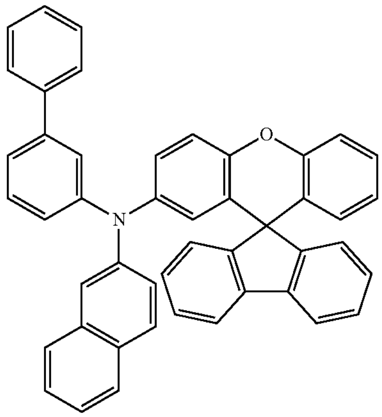
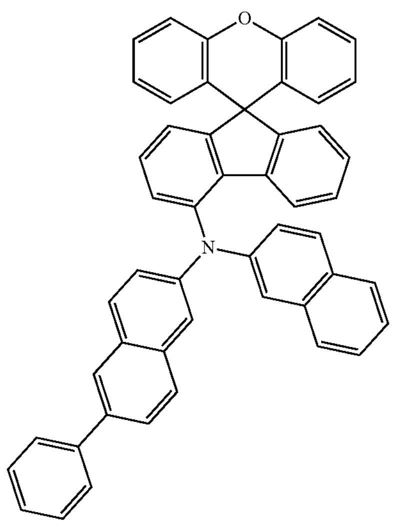
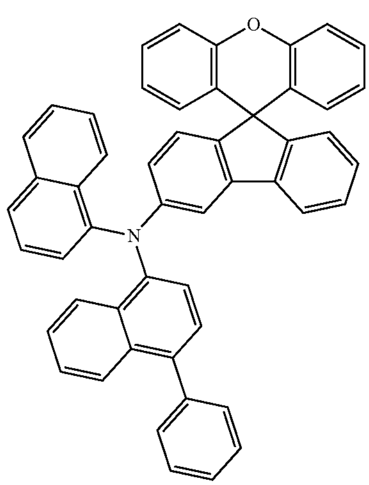
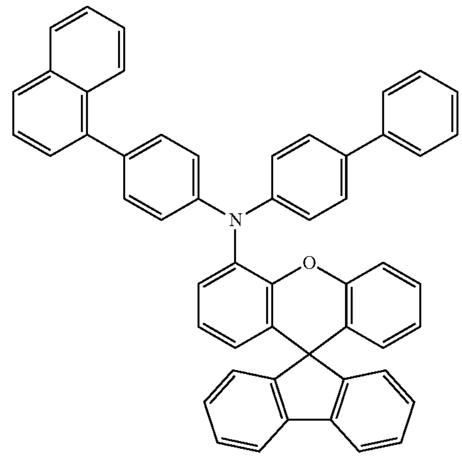 [SMILES: c1ccc(-c2ccc(N(c3ccc(-c4cccc5ccccc45)cc3)c3cccc4c3Oc3ccccc3C43c4ccccc4-c4ccccc43)cc2)cc1]
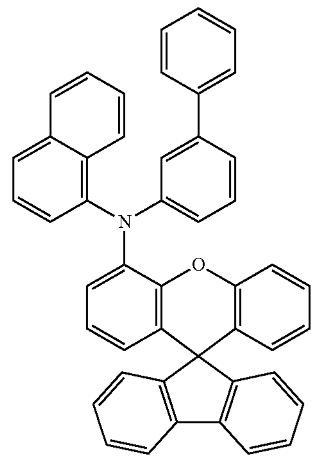
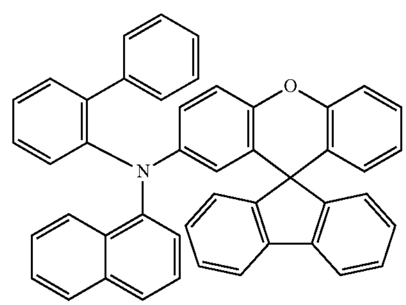
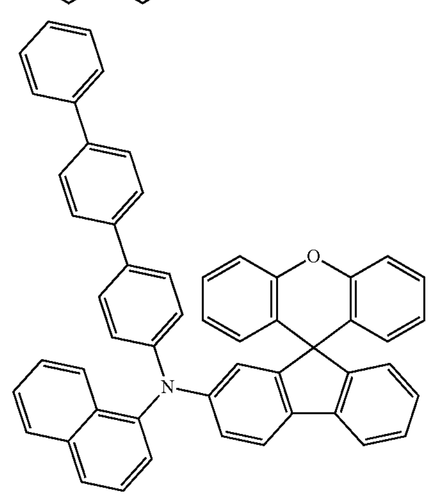
N
O -continued
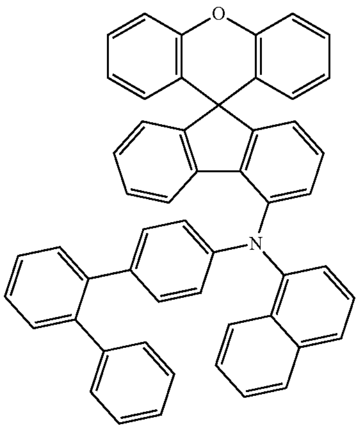
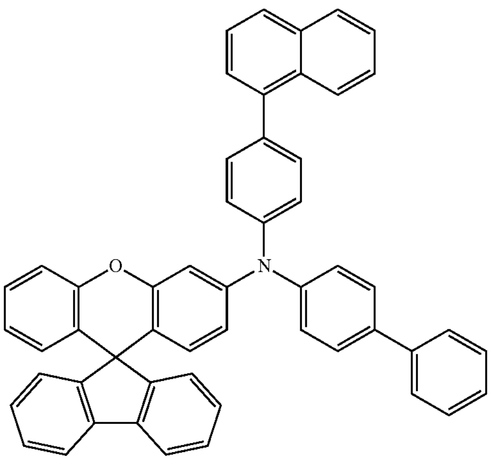 [SMILES: c1ccc(-c2ccc(N(c3ccc(-c4cccc5ccccc45)cc3)c3ccc4c(c3)Oc3ccccc3C43c4ccccc4-c4ccccc43)cc2)cc1]
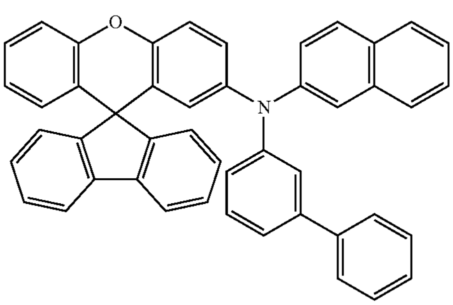
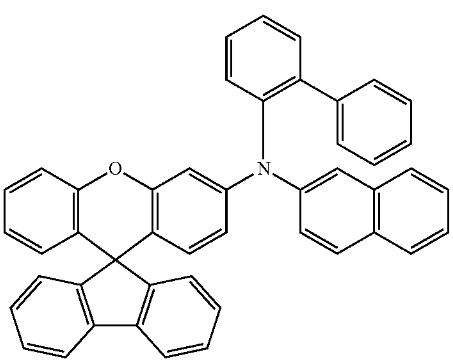
-continued
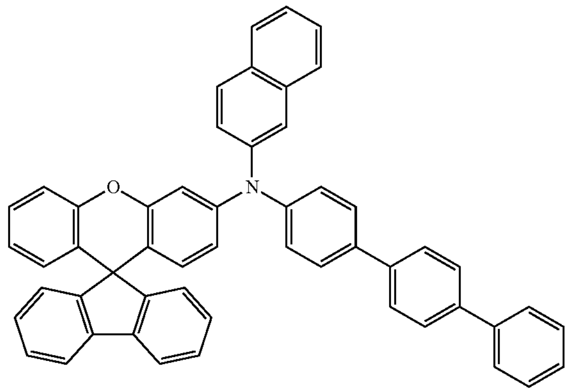
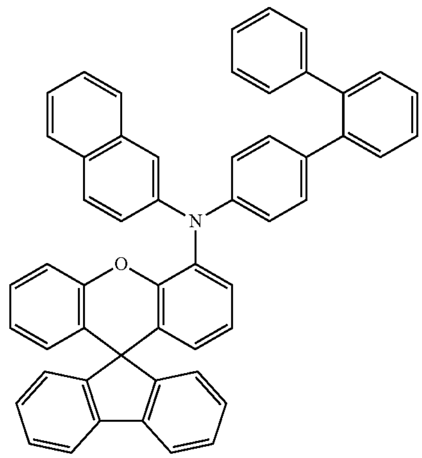
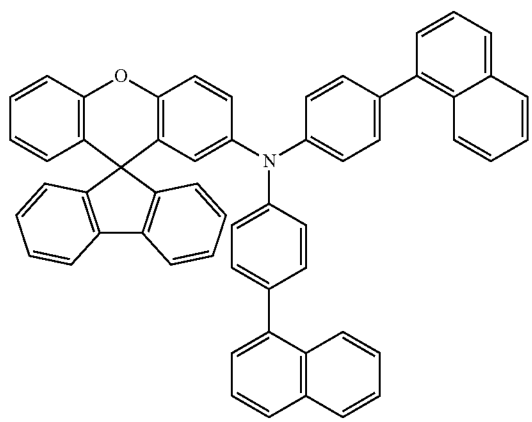 [SMILES: c1ccc2c(c1)Oc1ccc(N(c3ccc(-c4cccc5ccccc45)cc3)c3ccc(-c4cccc5ccccc45)cc3)cc1C21c2ccccc2-c2ccccc21]
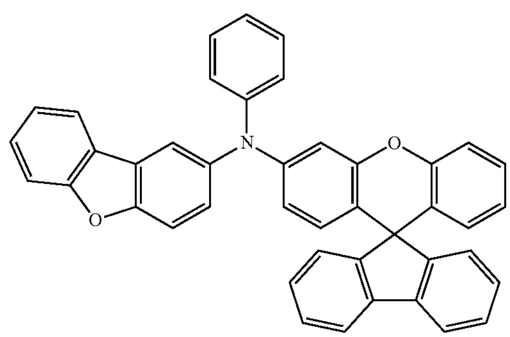

-continued
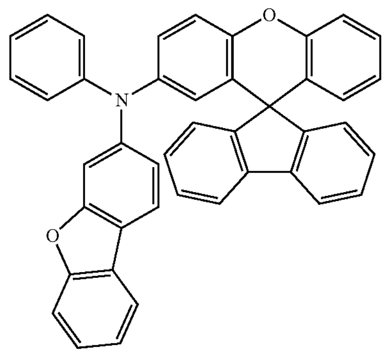
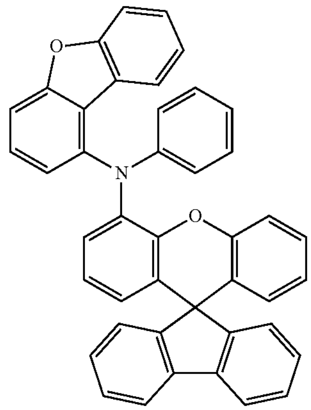
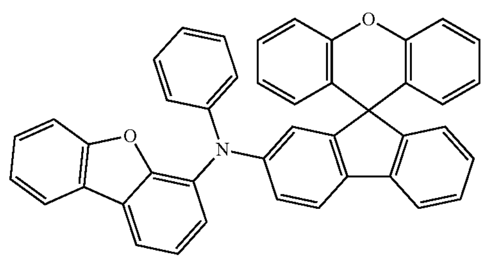
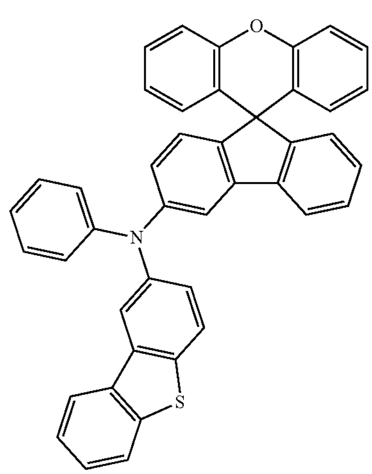 [SMILES: c1ccc(N(c2ccc3c(c2)-c2ccccc2C32c3ccccc3Oc3ccccc32)c2ccc3sc4ccccc4c3c2)cc1]
-continued
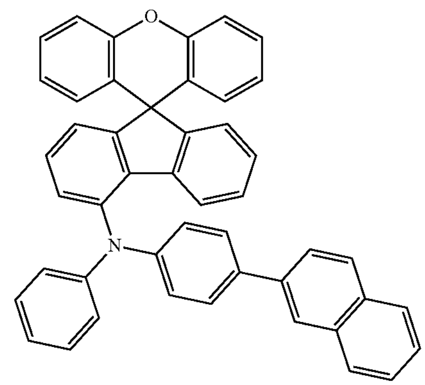
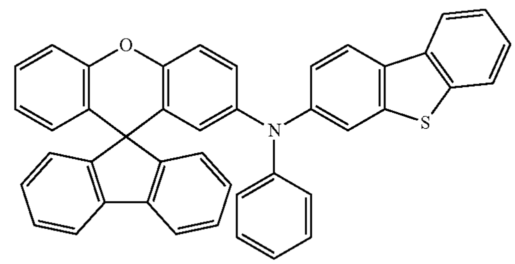
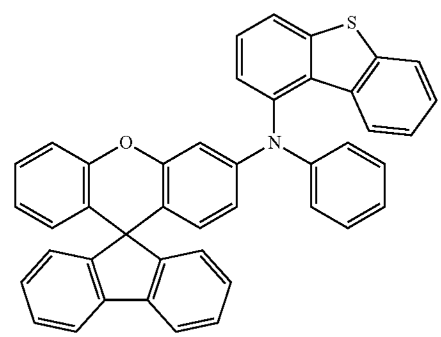
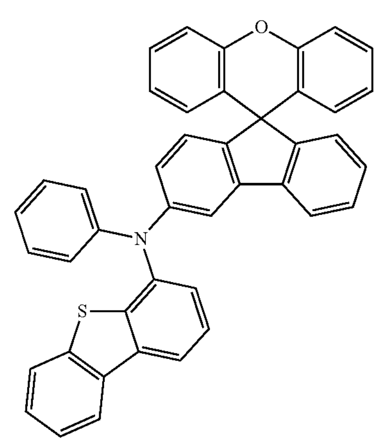

-continued
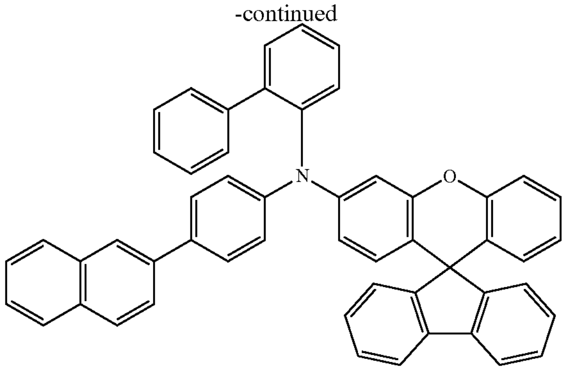
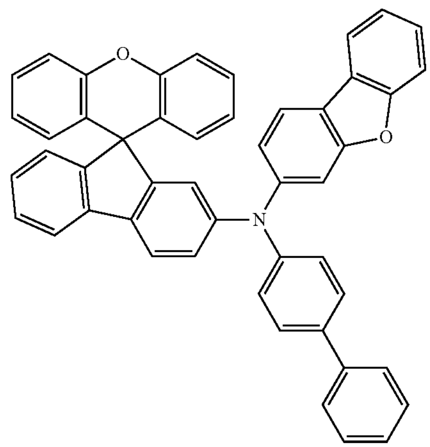
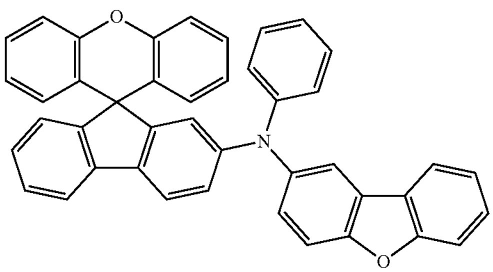
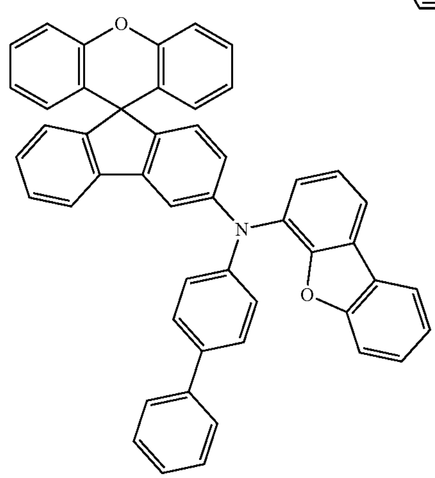
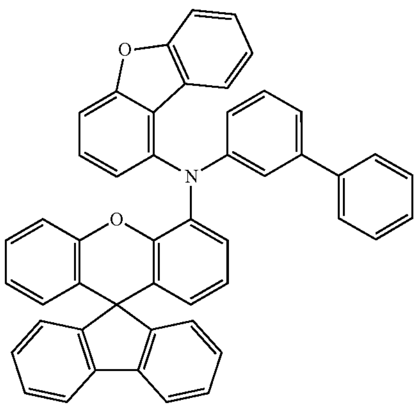
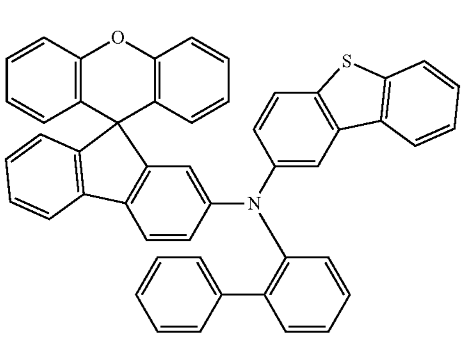
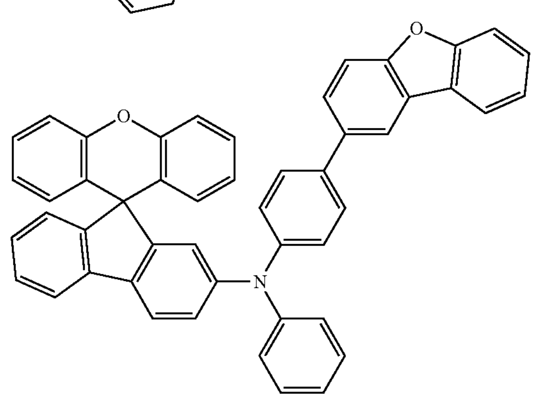

-continued
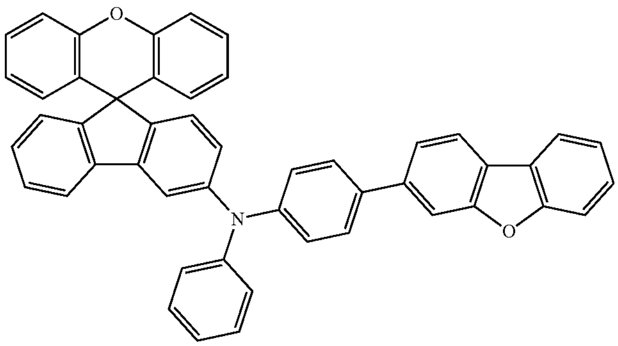
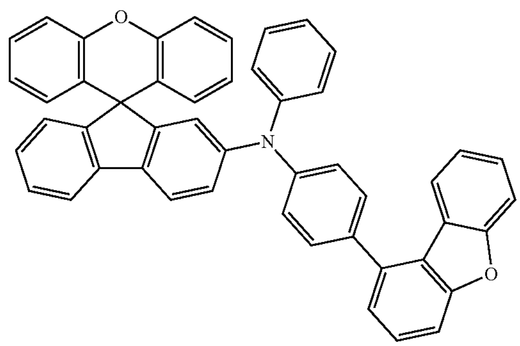
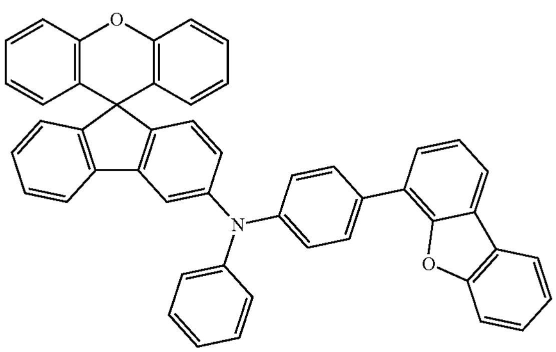
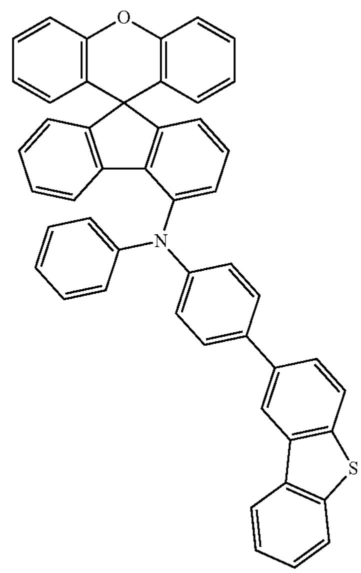
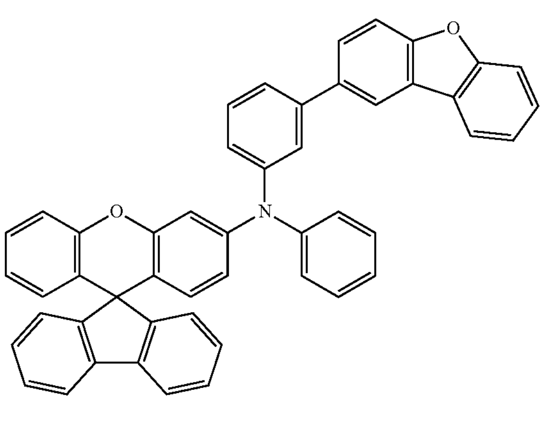
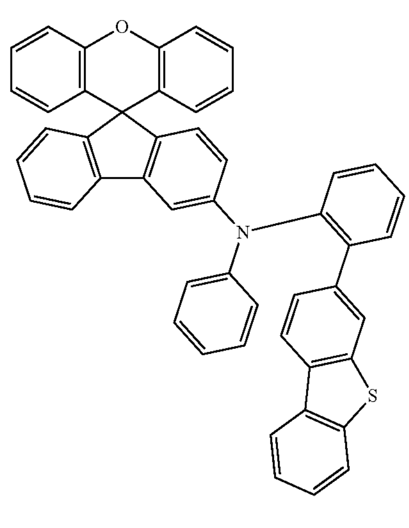

-continued
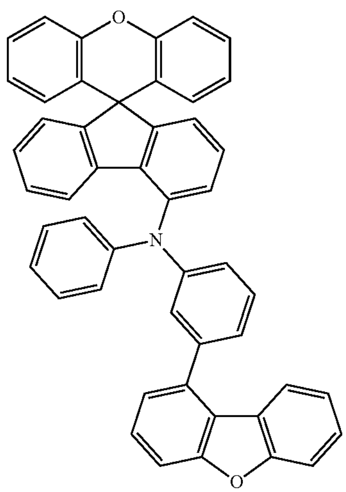
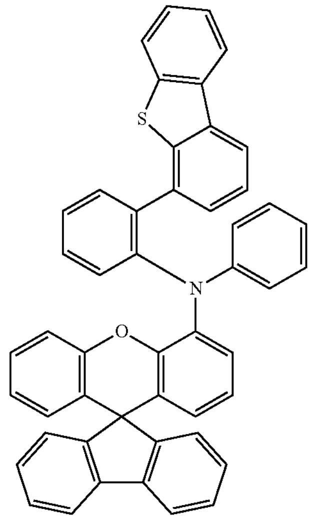
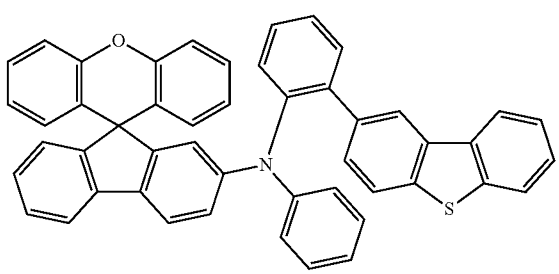
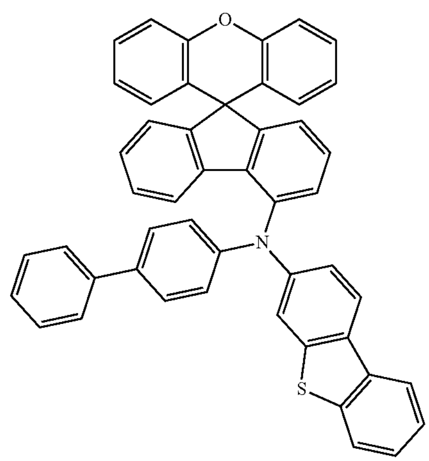
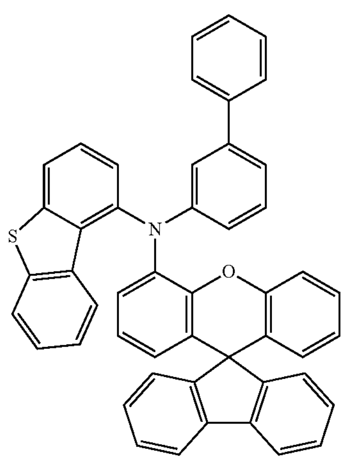
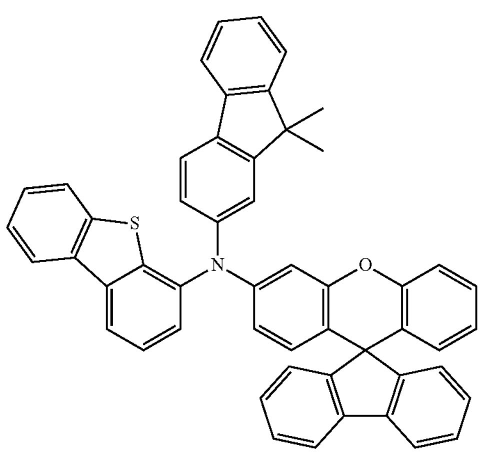

-continued
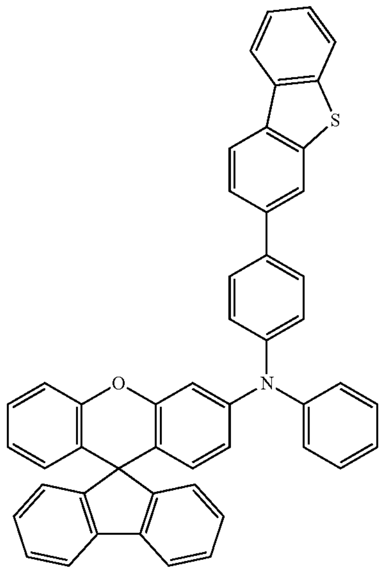
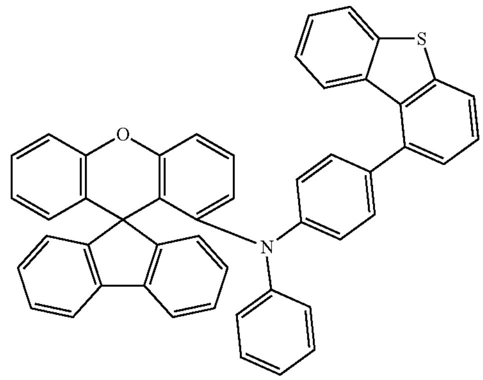
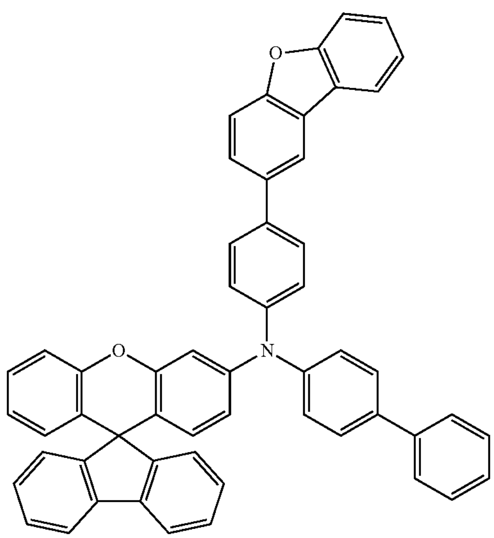
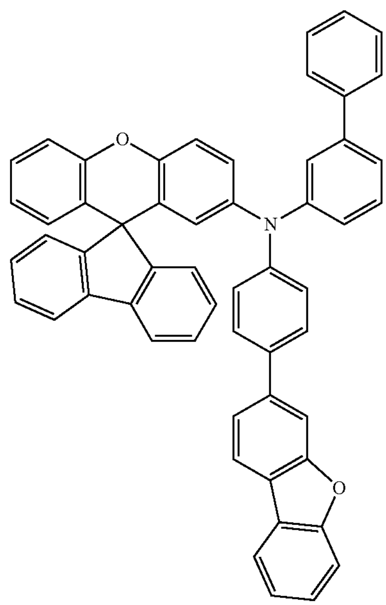
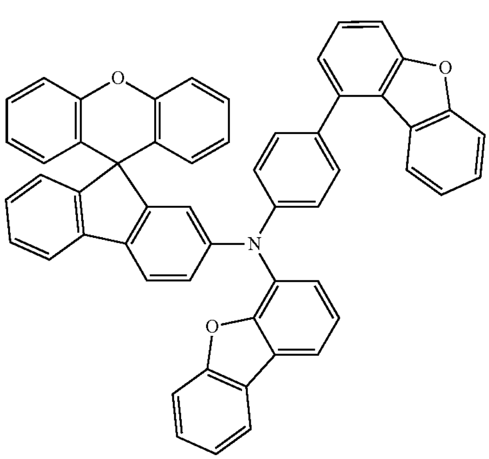
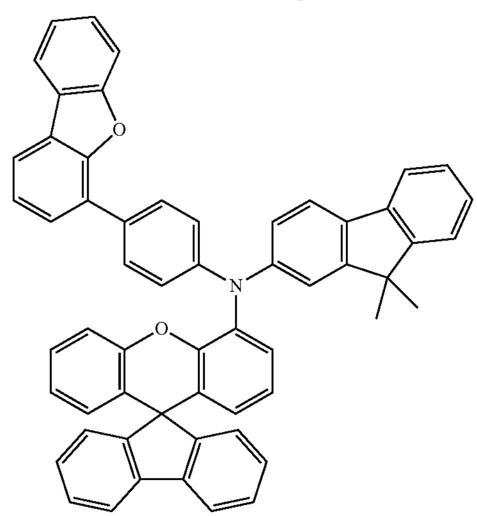

-continued
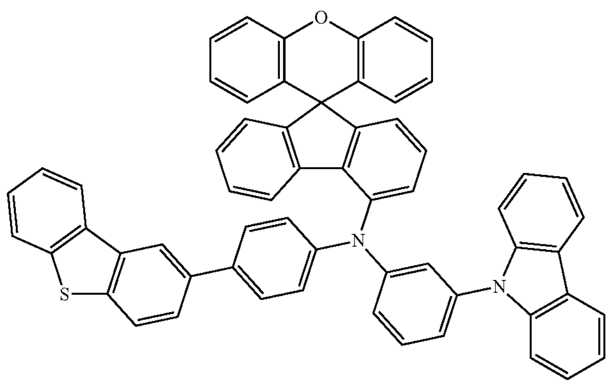
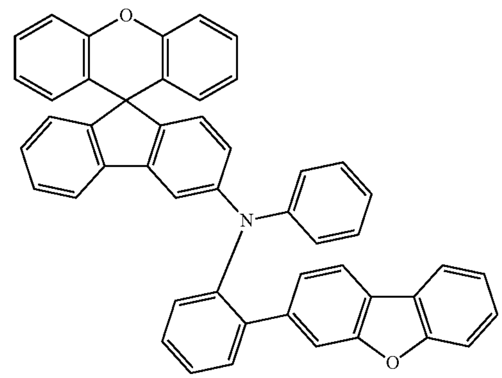
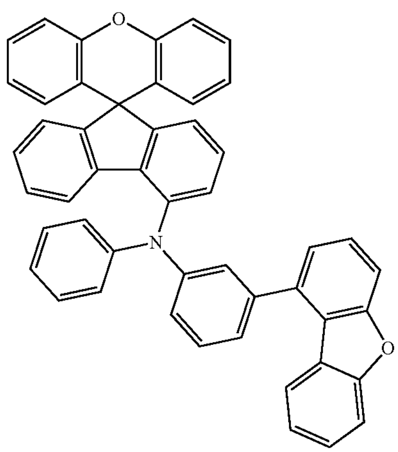
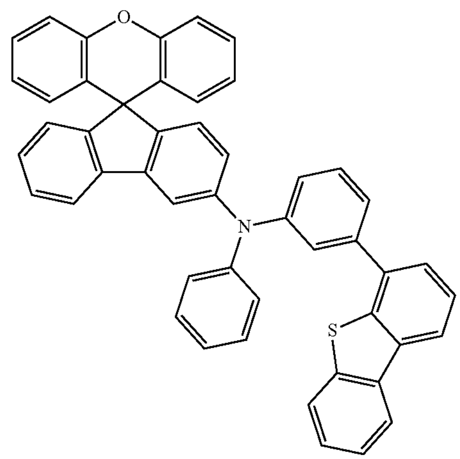
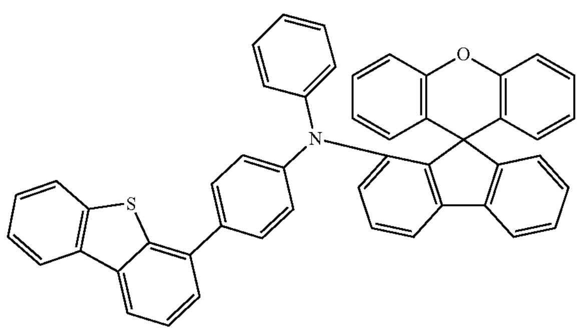
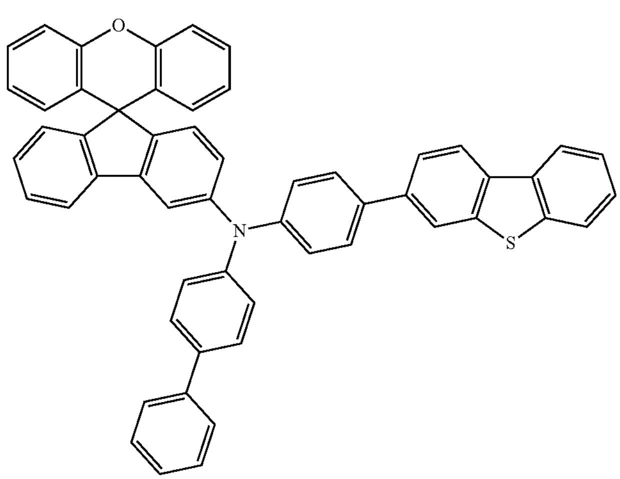
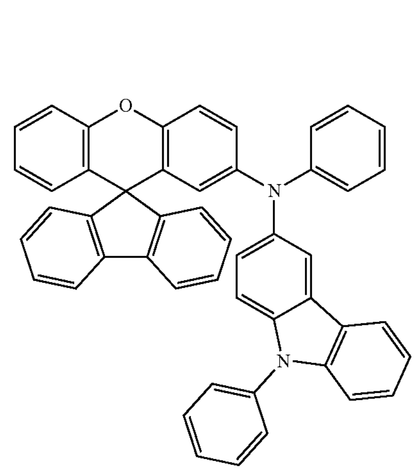

-continued
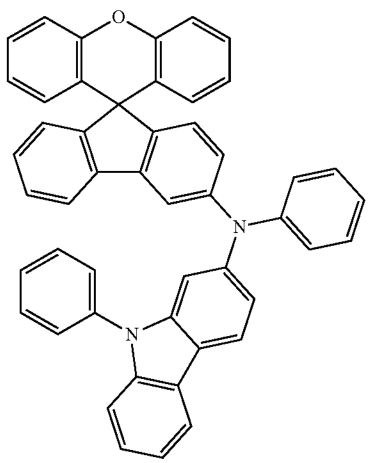
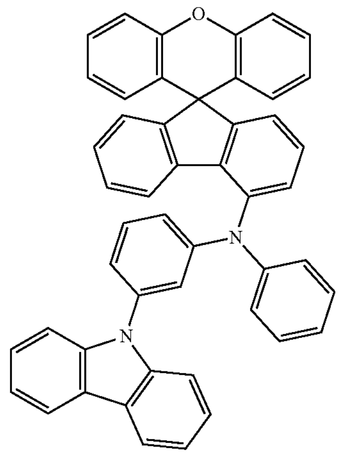
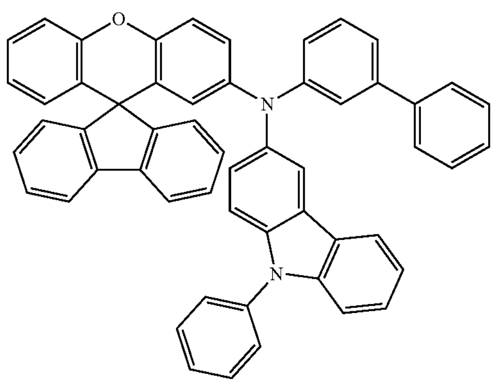
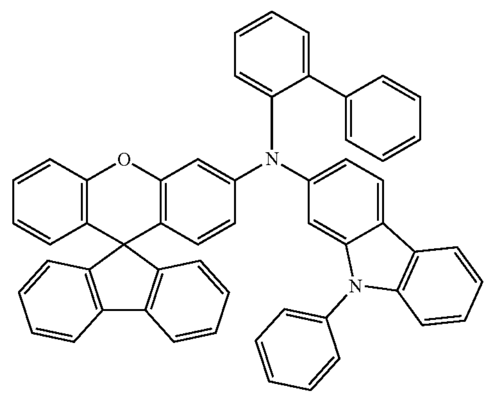
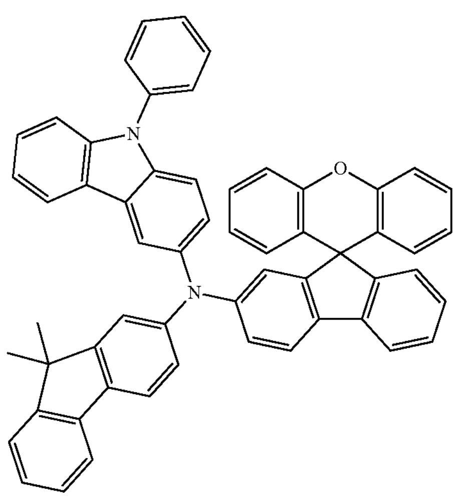
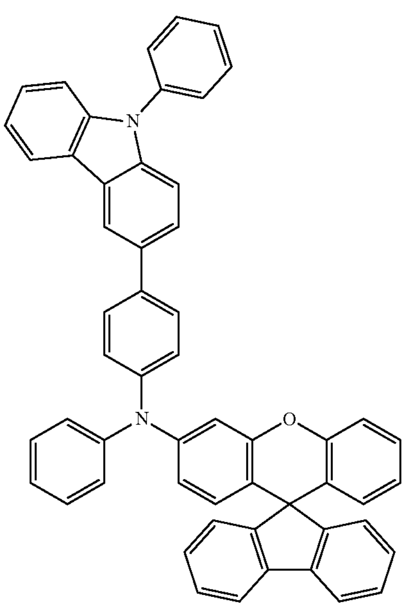

-continued
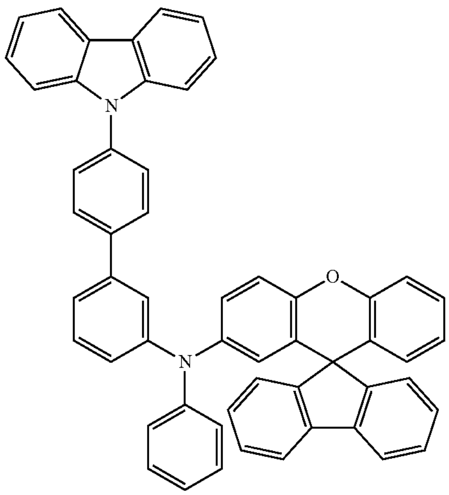
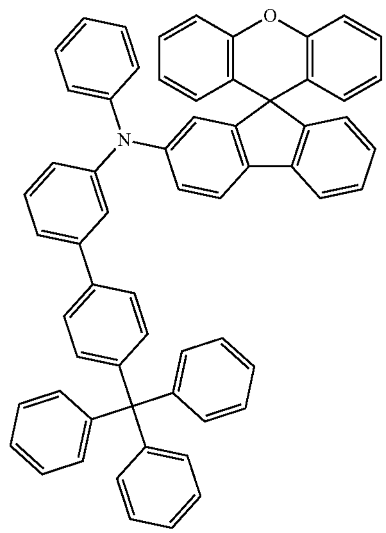
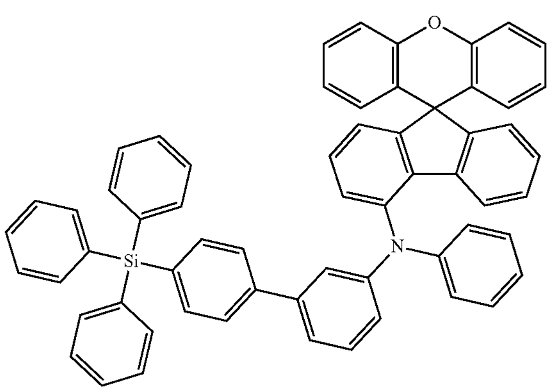
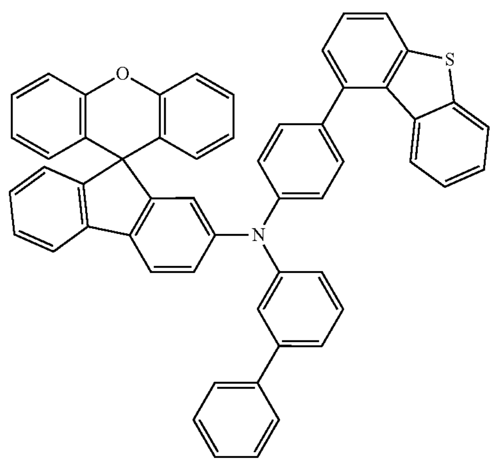
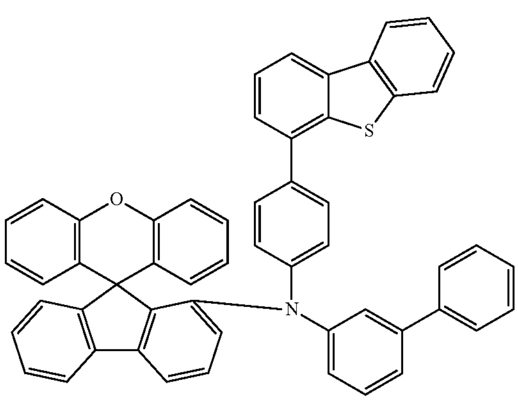
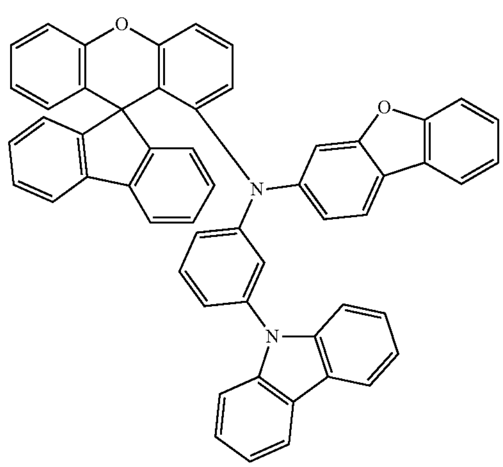

-continued
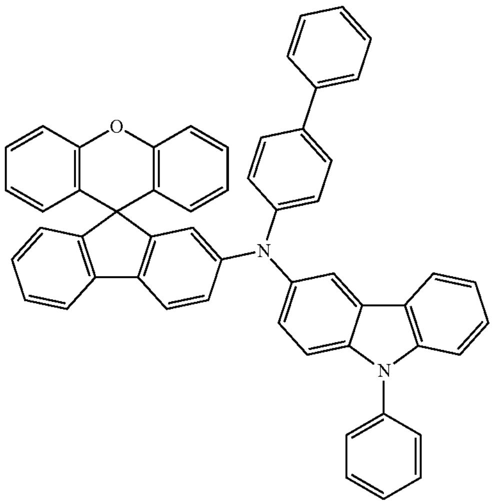
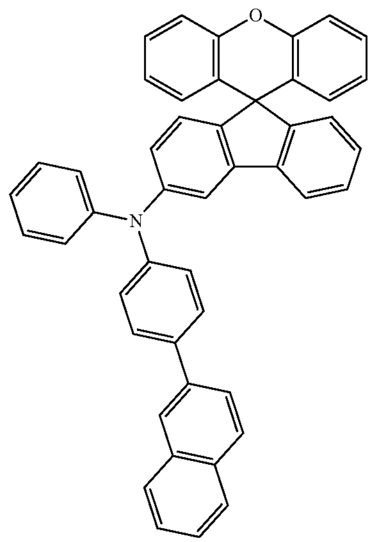
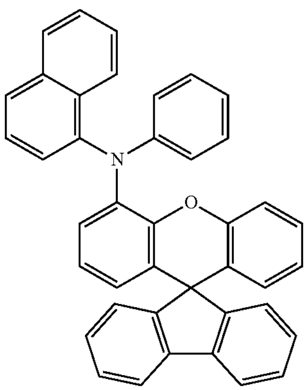
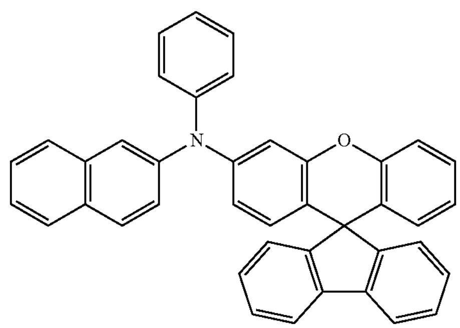
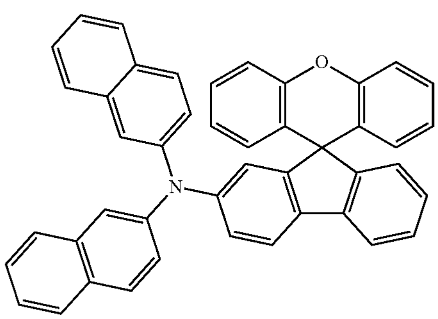
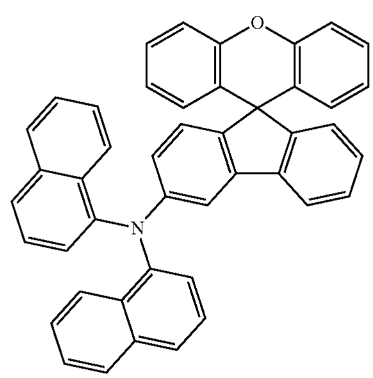
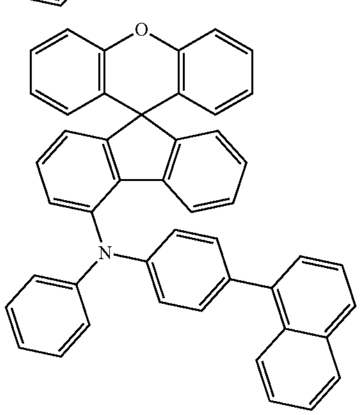
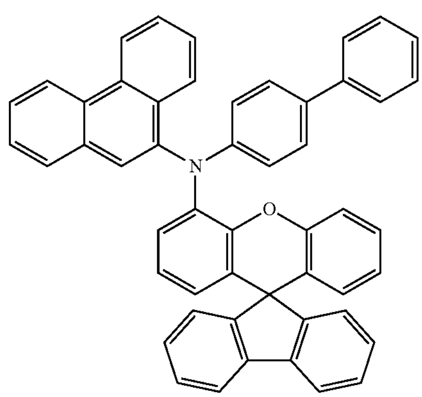

-continued
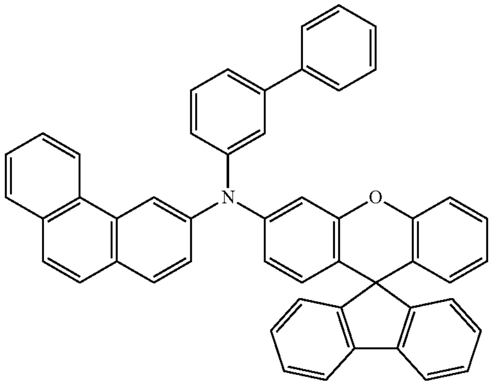
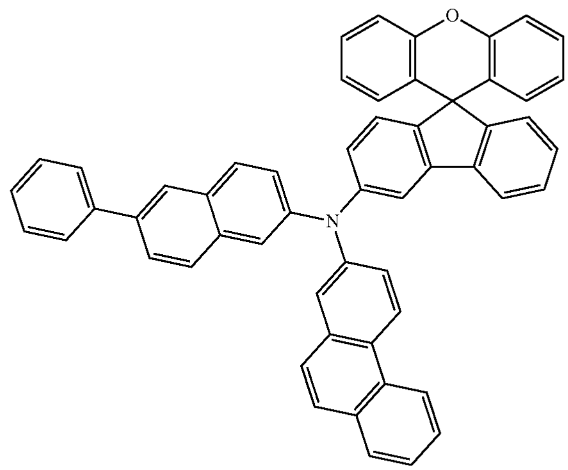
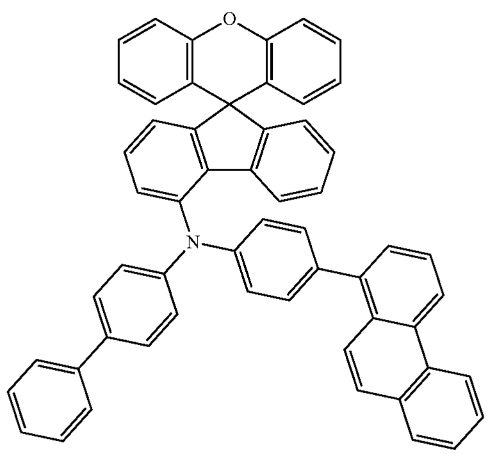
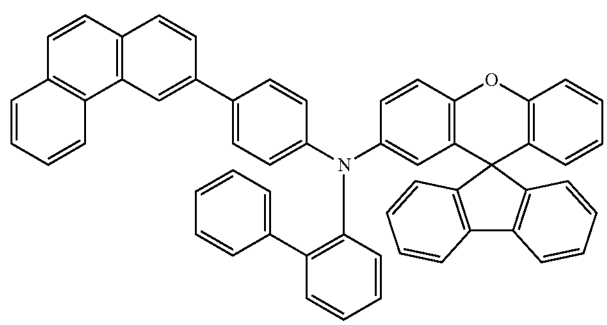
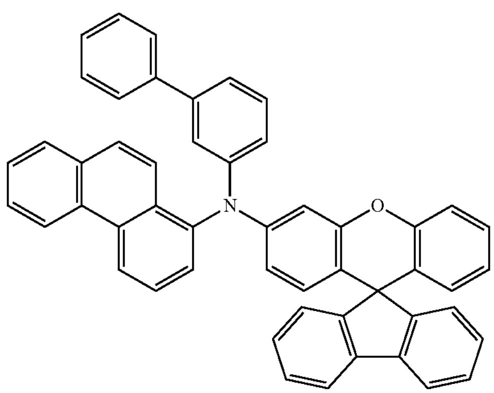
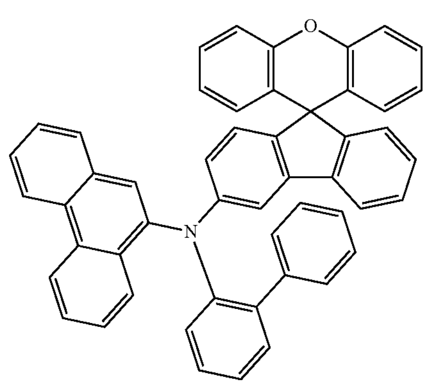

-continued
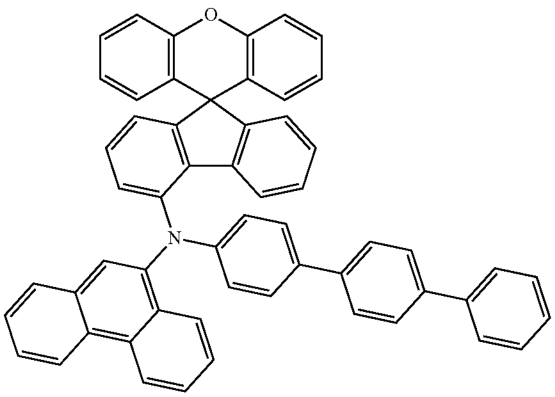
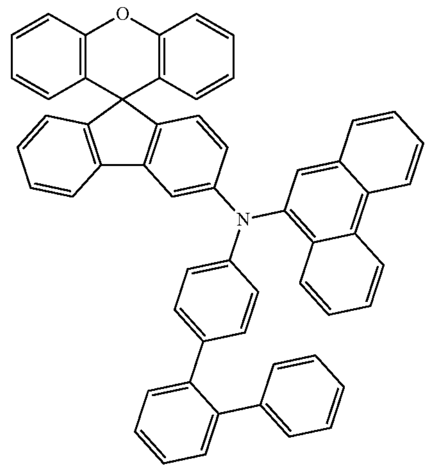
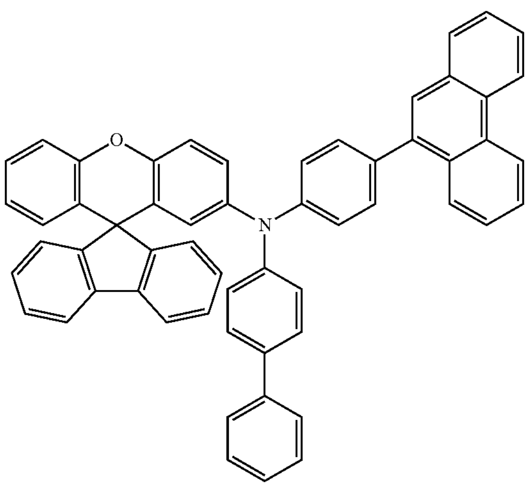
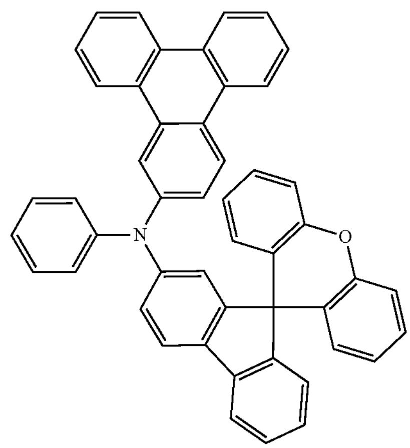
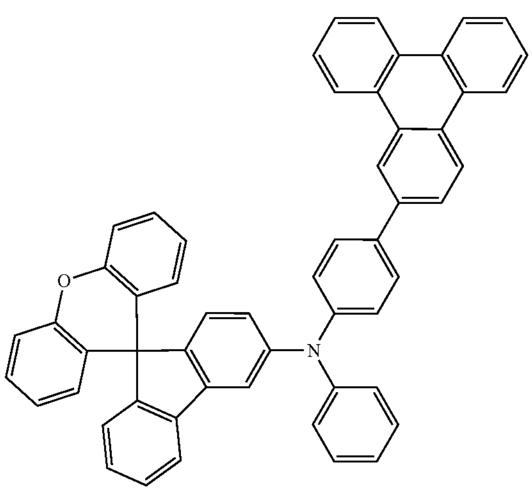
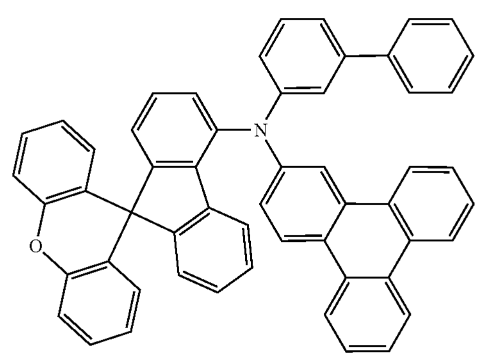

-continued
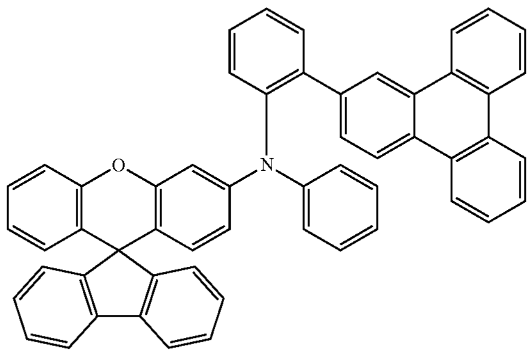
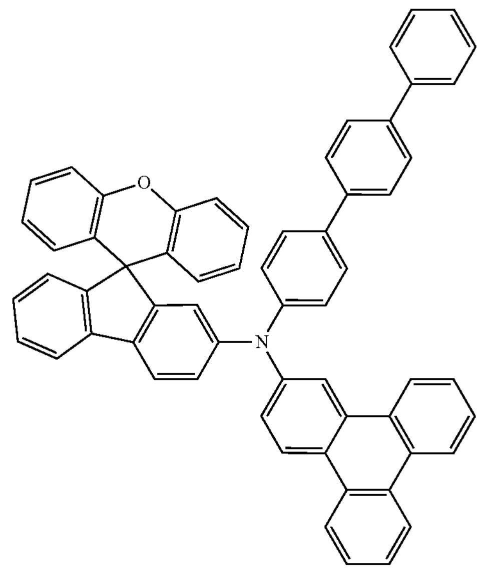
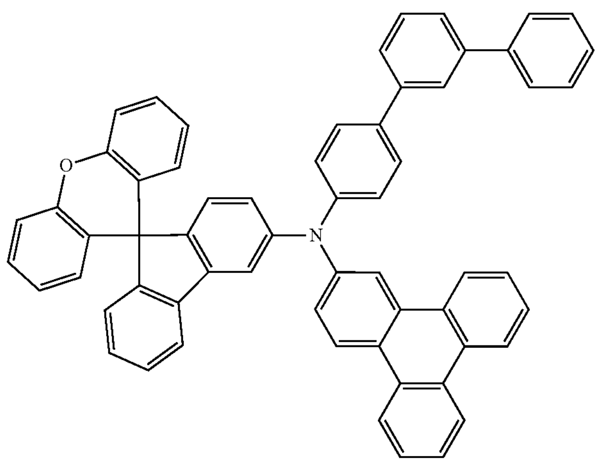
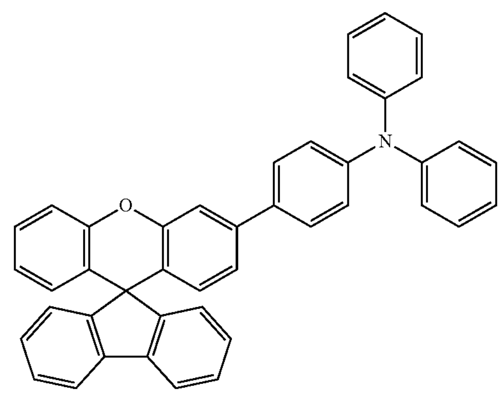
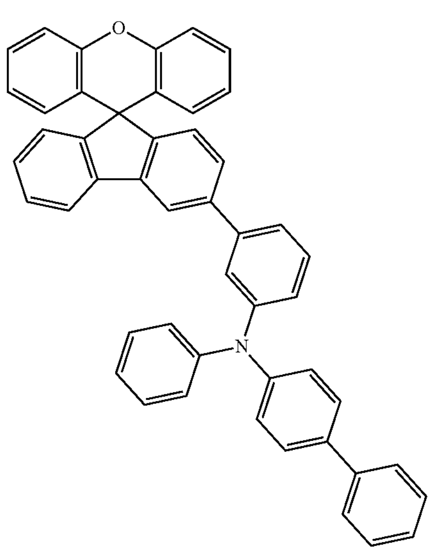
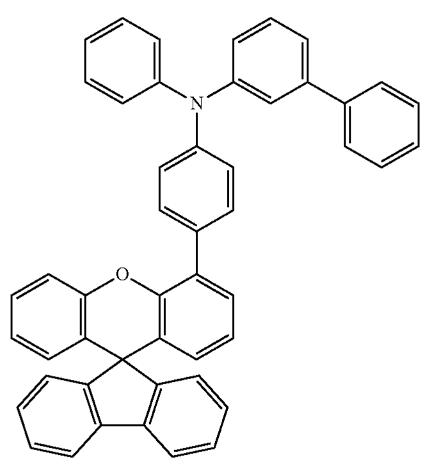

-continued
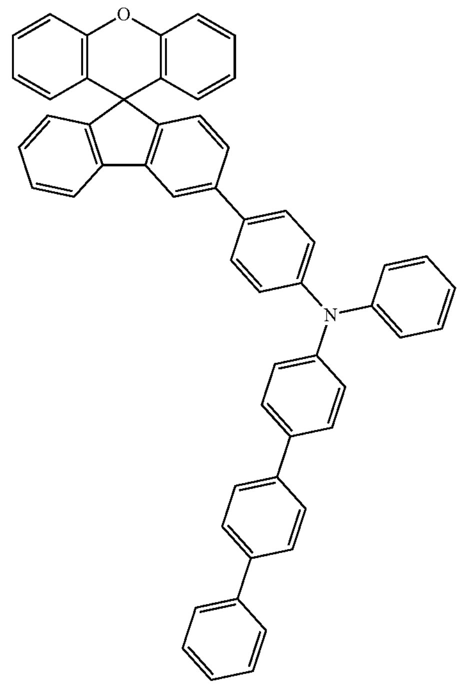
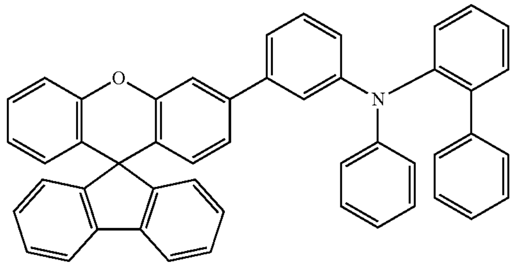
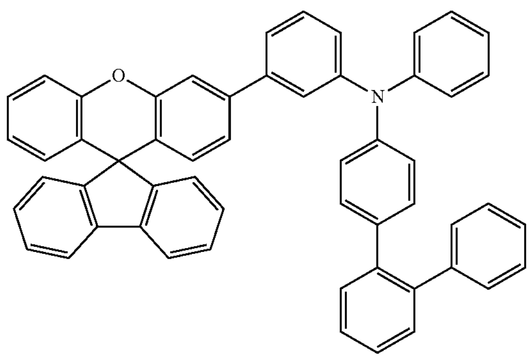
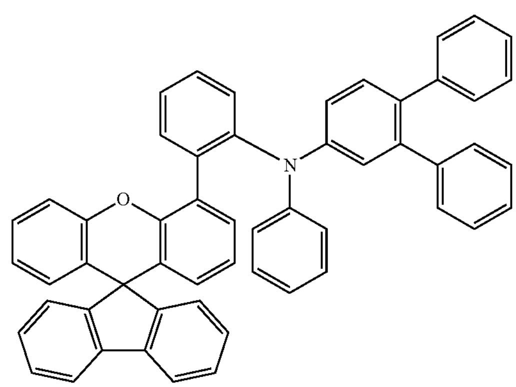
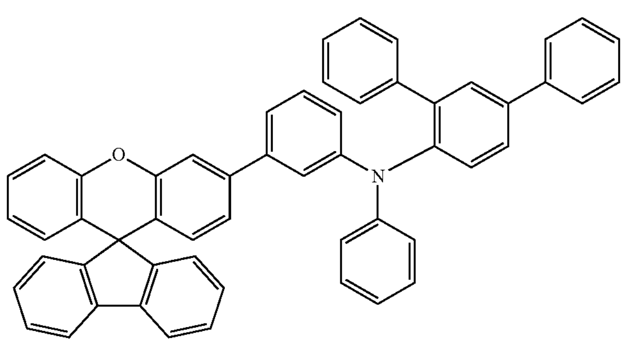

-continued
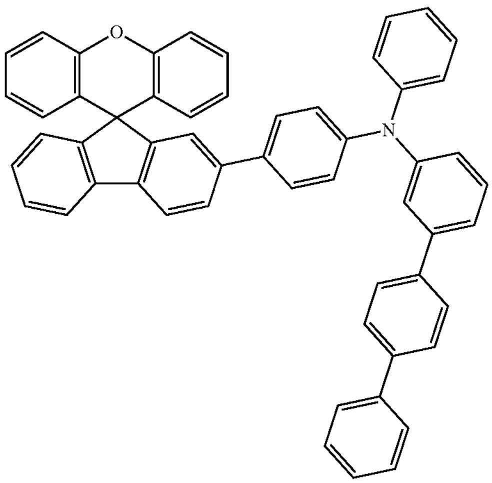
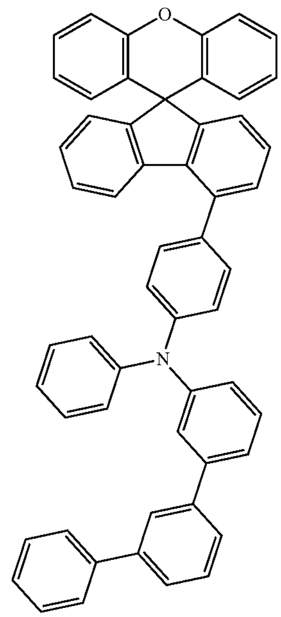
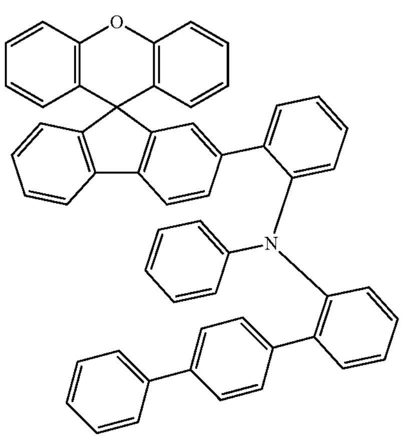
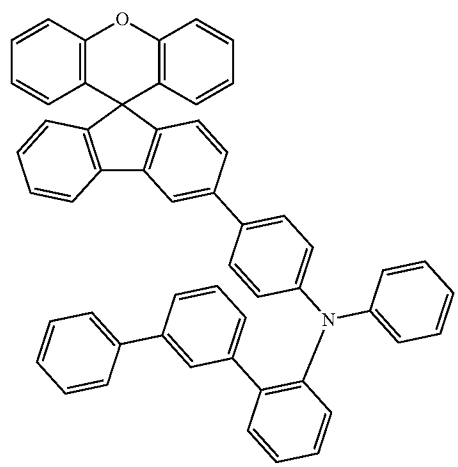
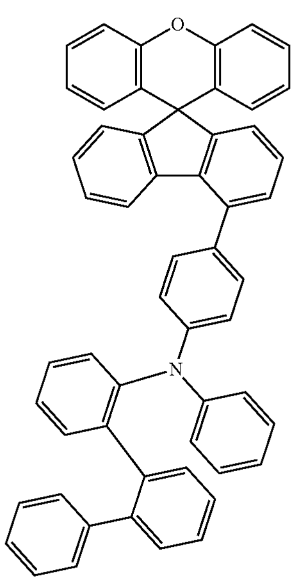
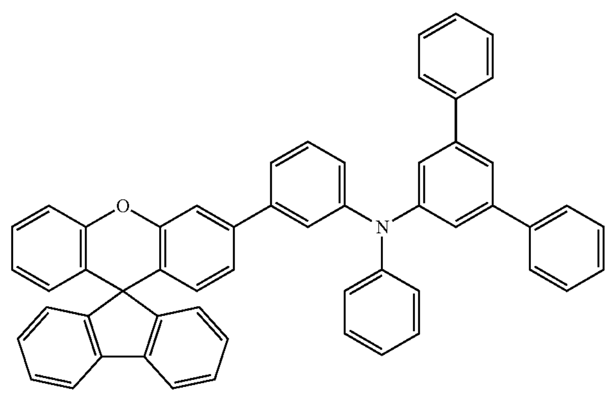

-continued
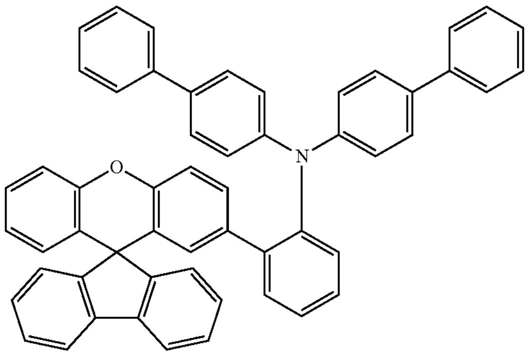
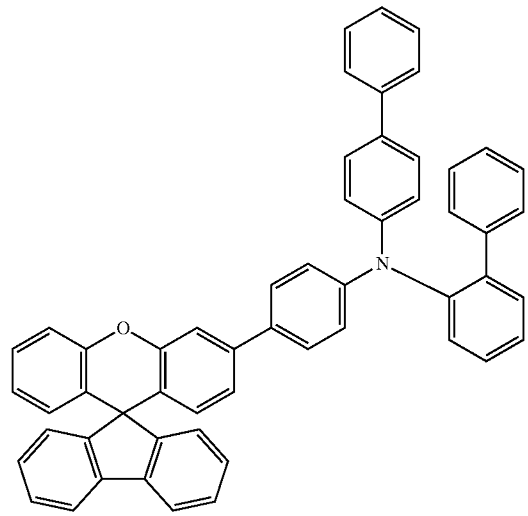
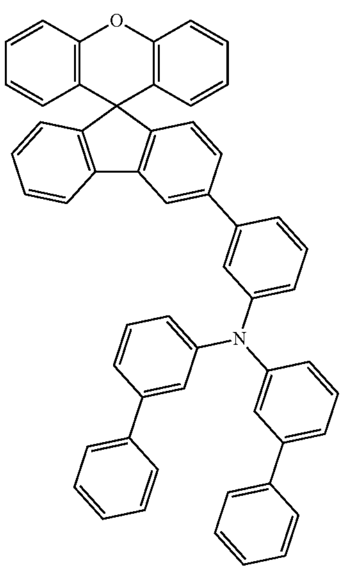
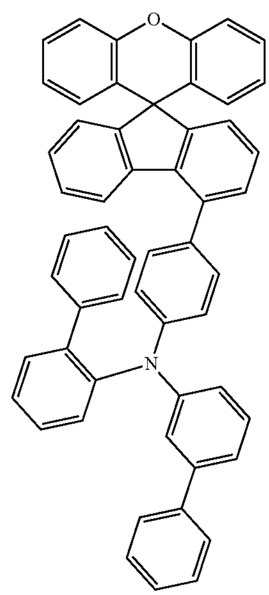
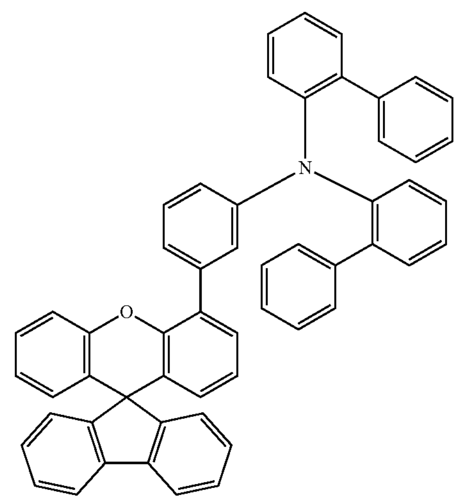
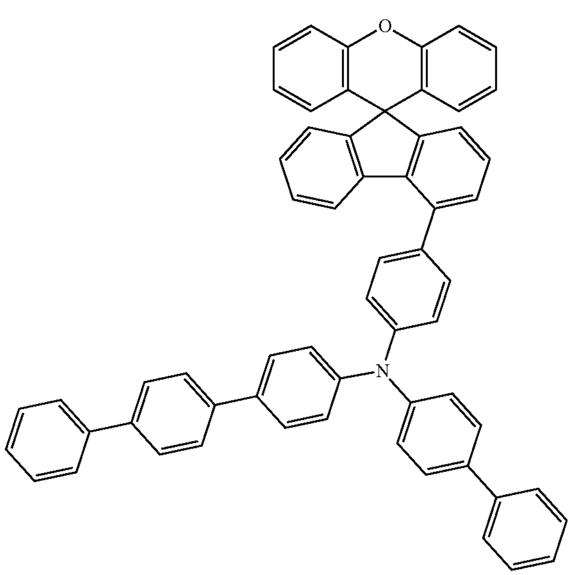
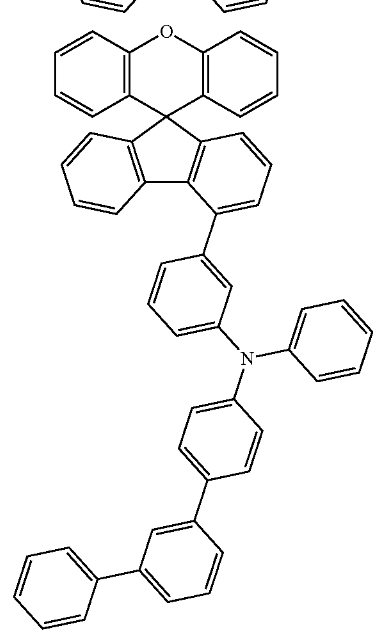

-continued
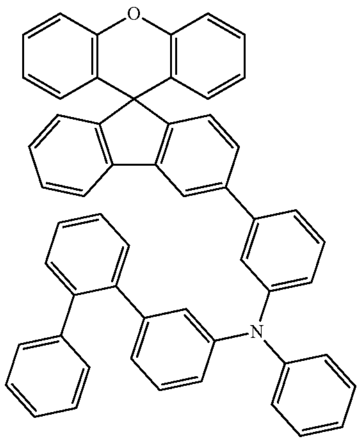
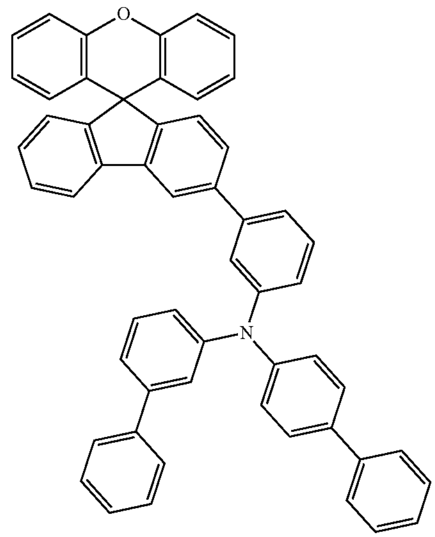
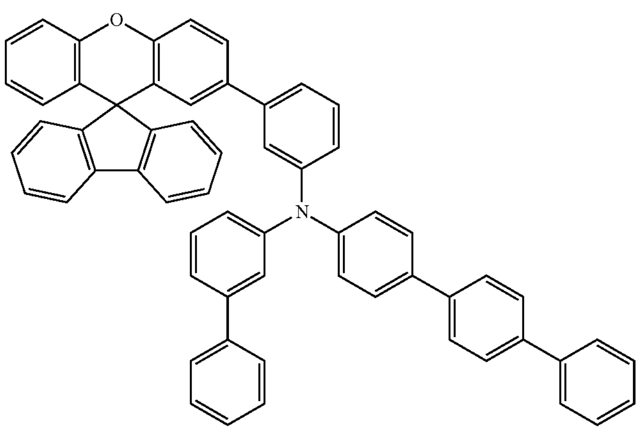
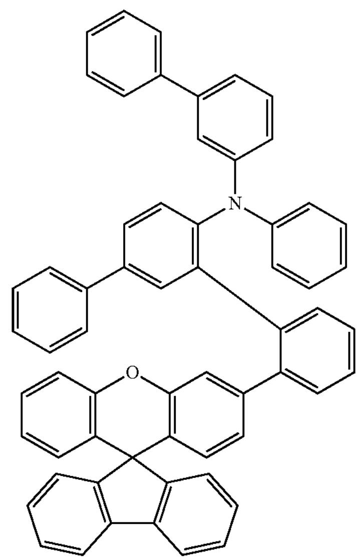
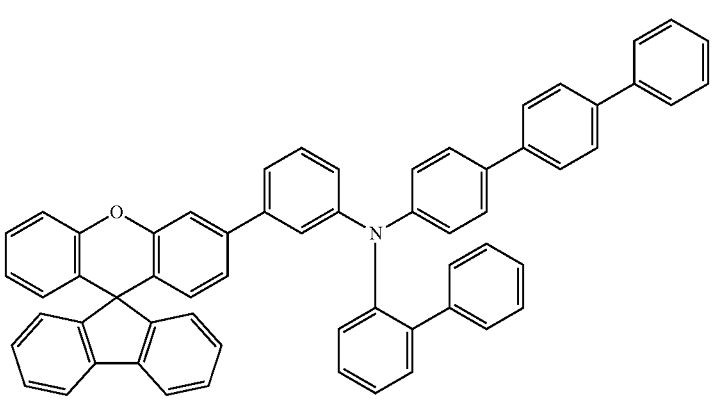

-continued
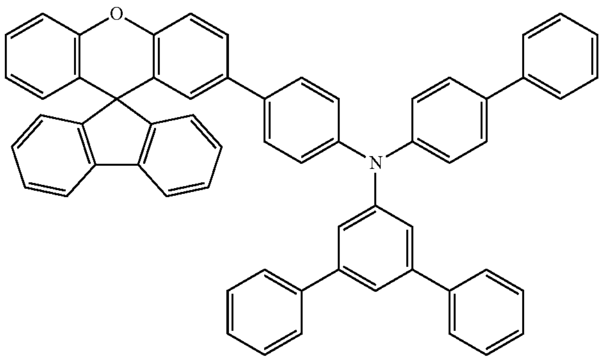
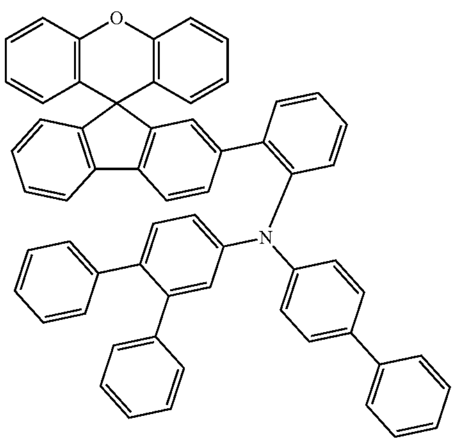
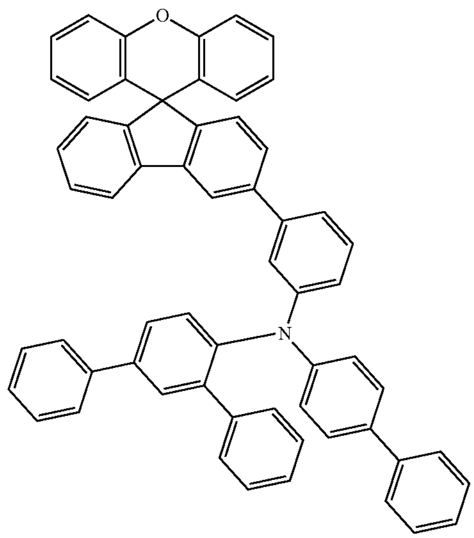
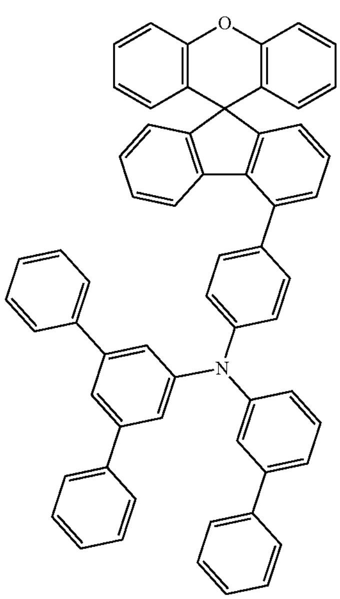
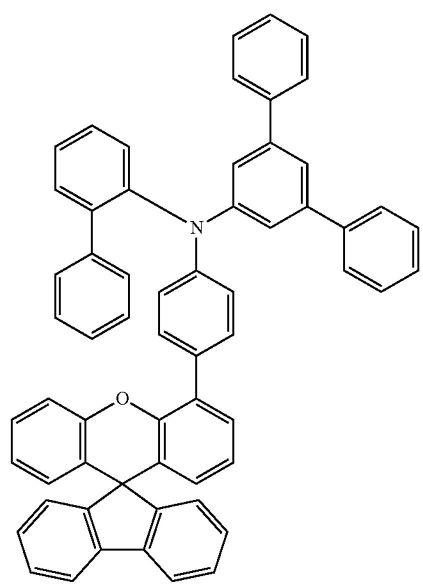

-continued
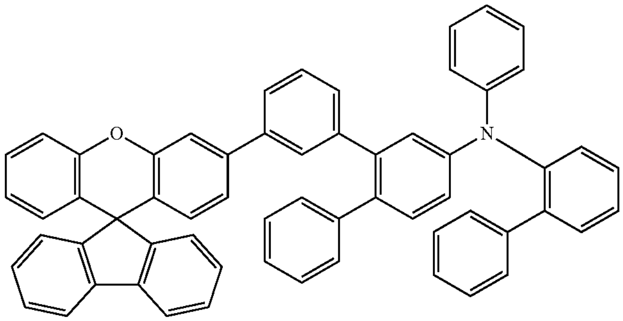
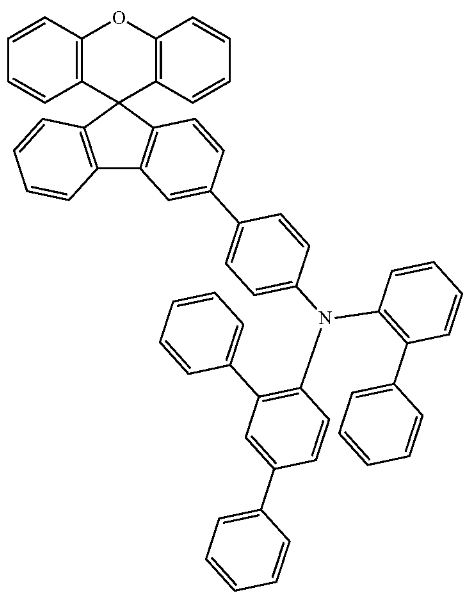
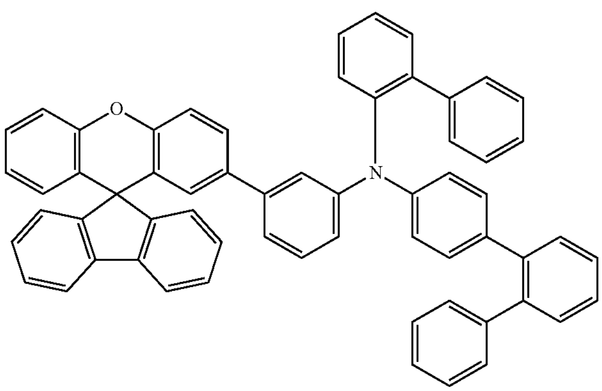
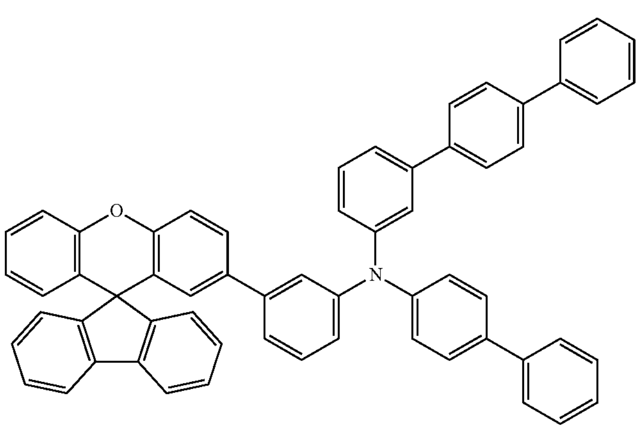

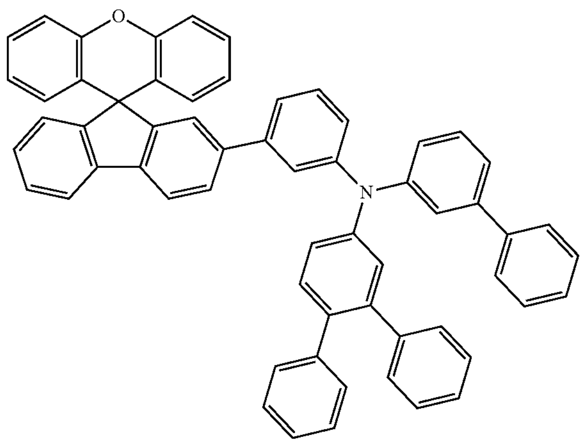
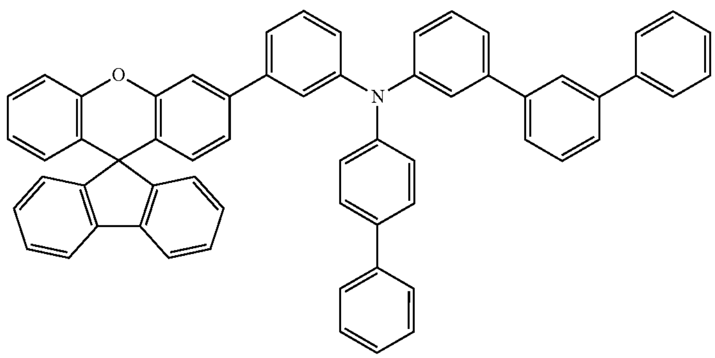
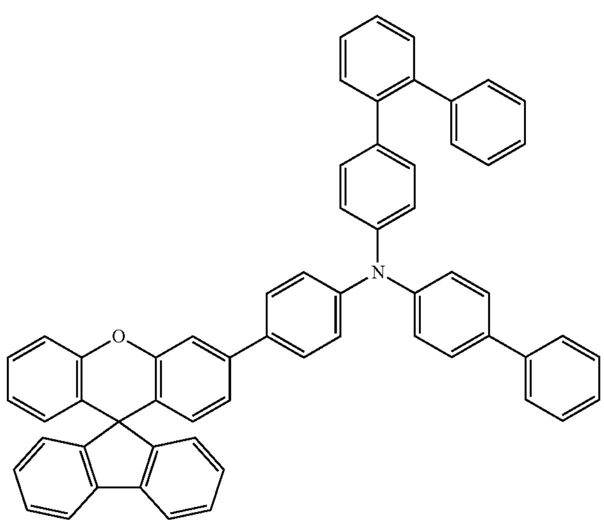
N

-continued
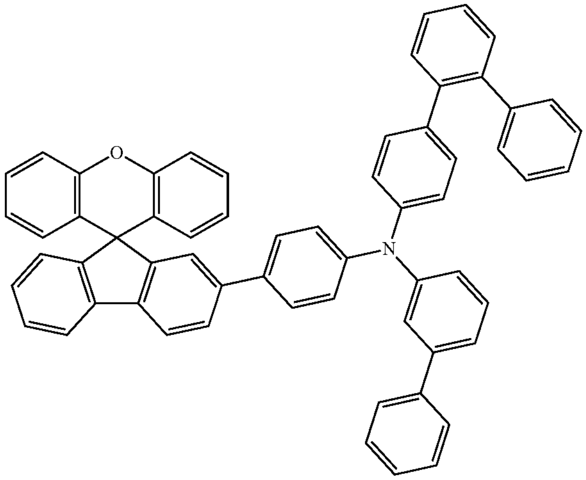
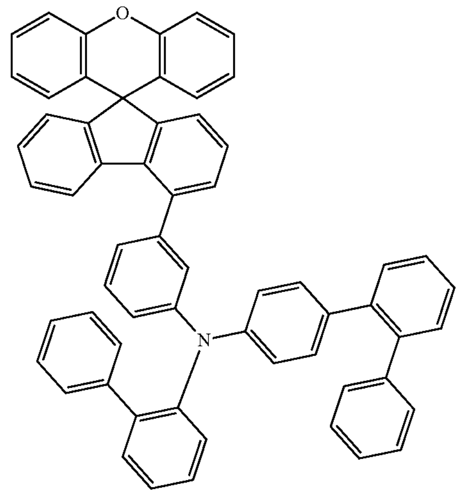
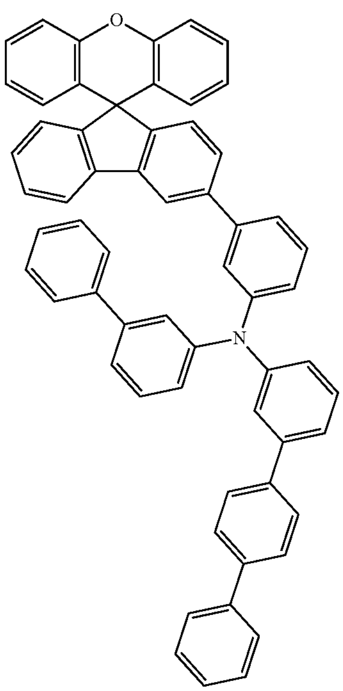
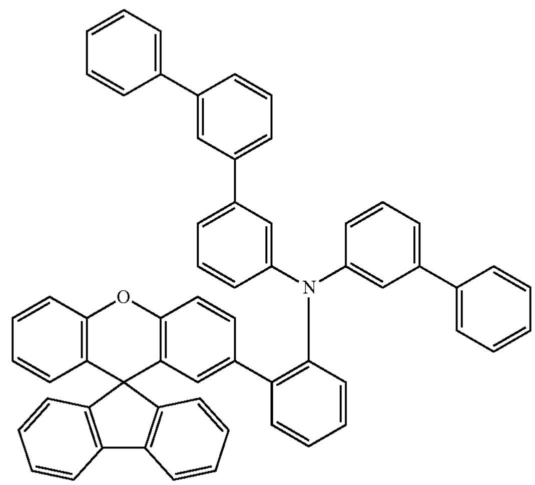
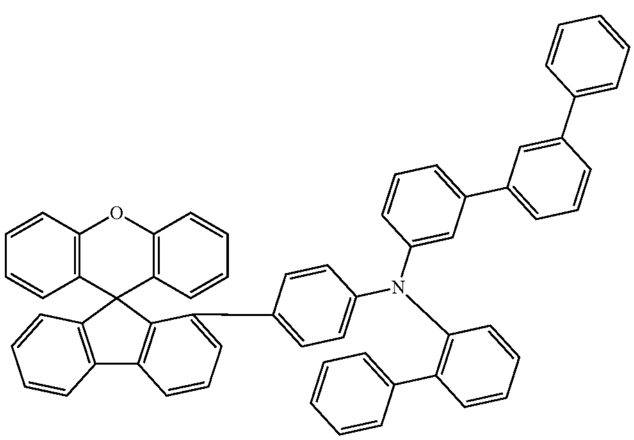

-continued
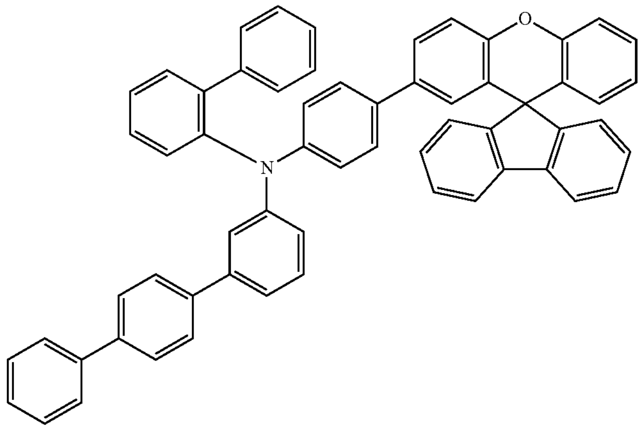
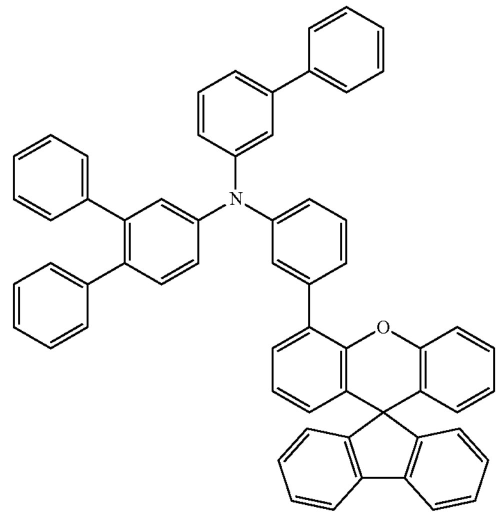
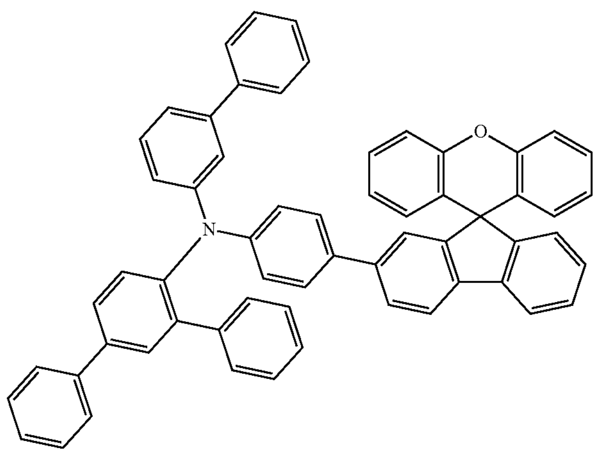
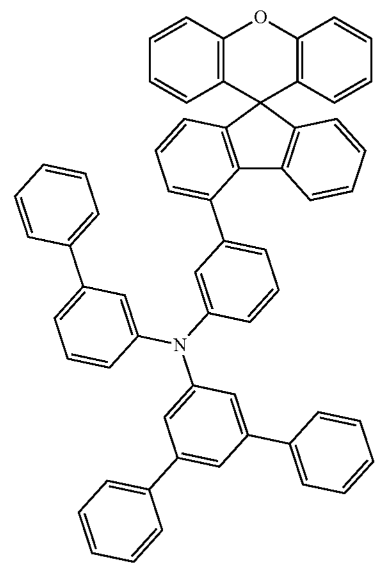
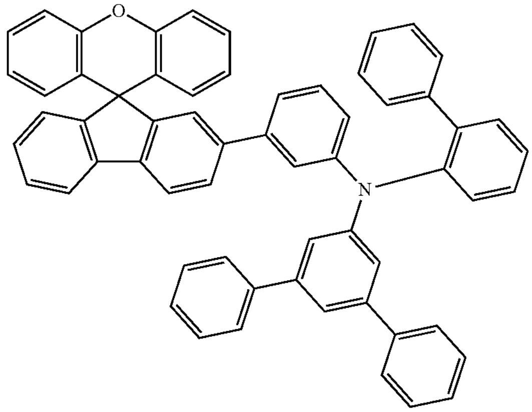

-continued
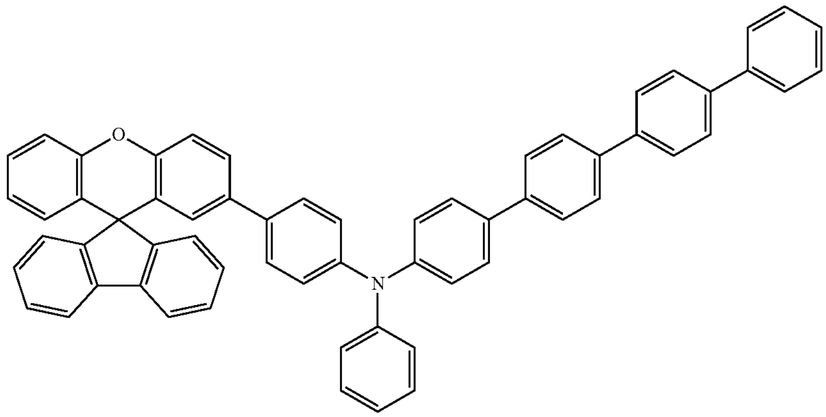
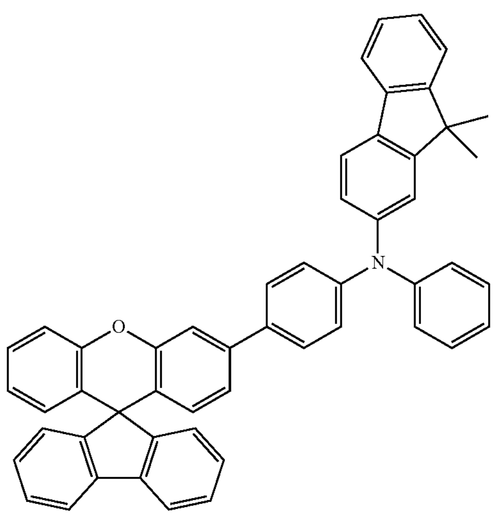
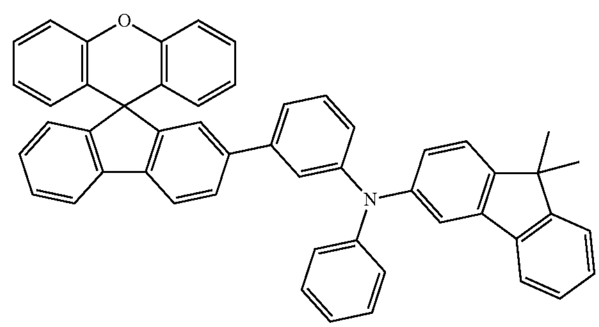
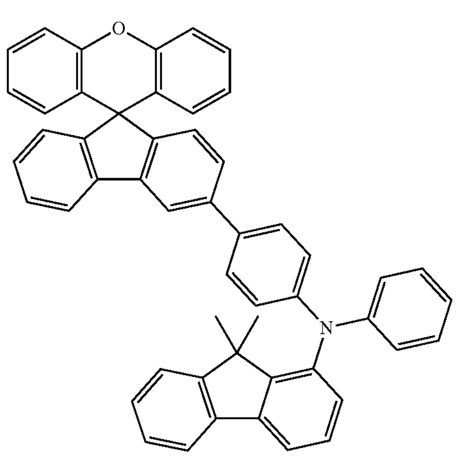
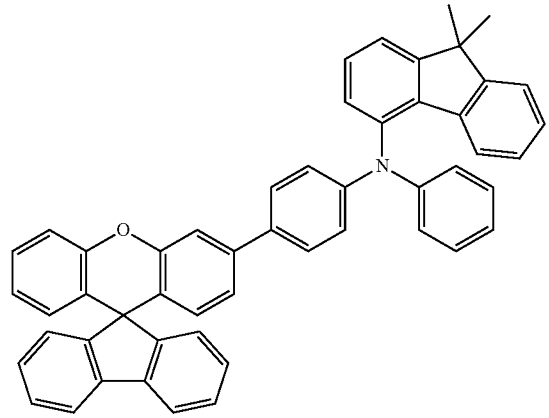

-continued
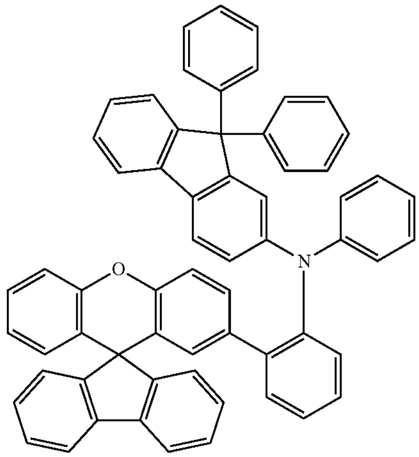
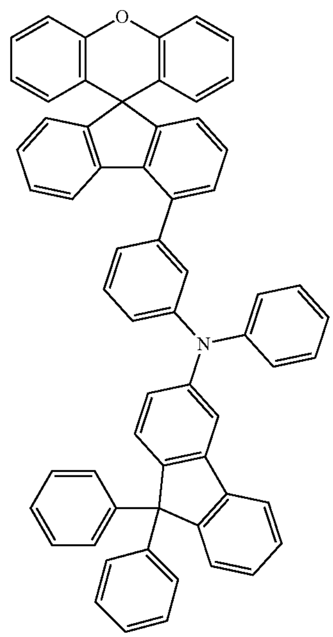
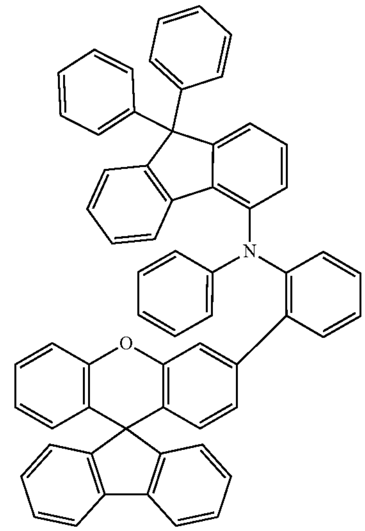
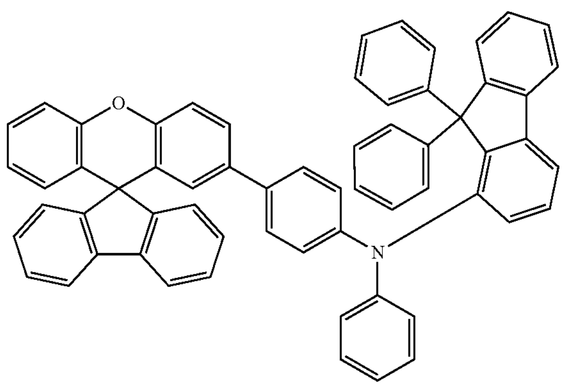
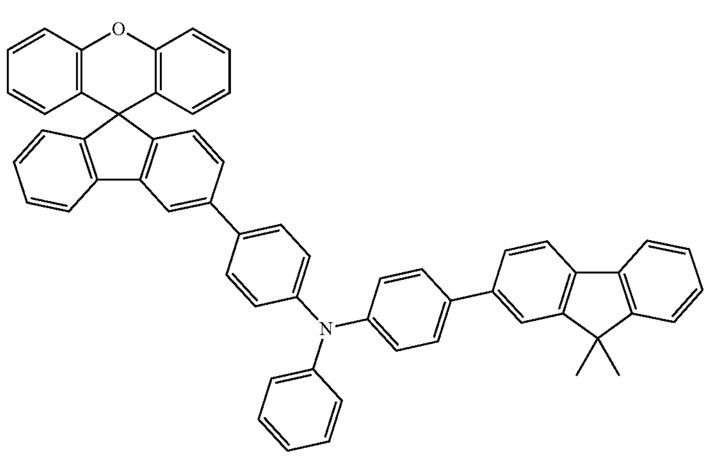

-continued
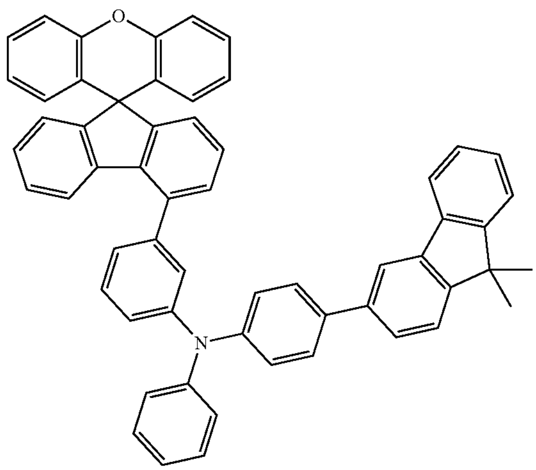
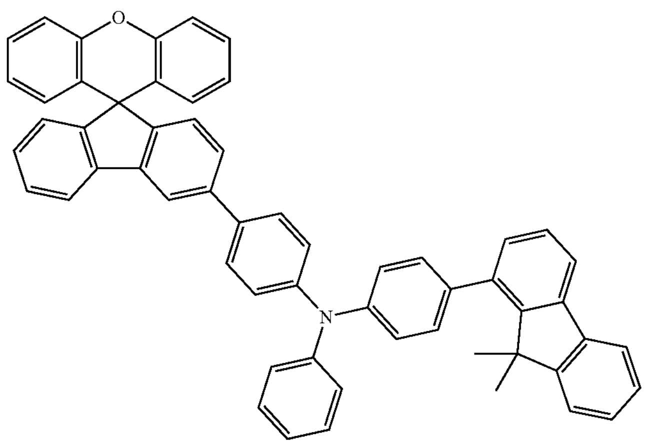
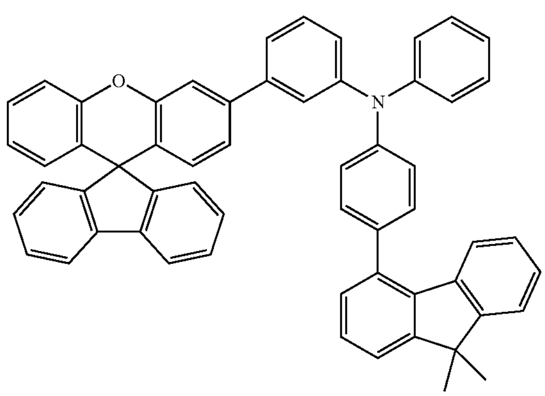
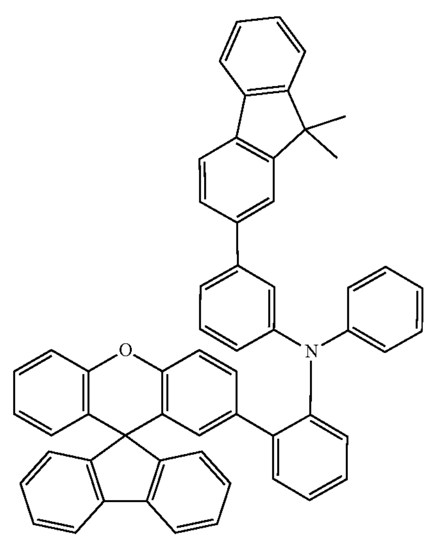
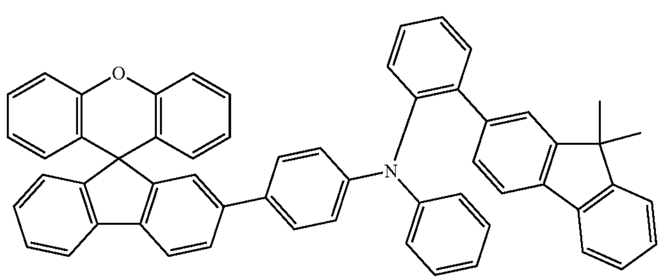

-continued
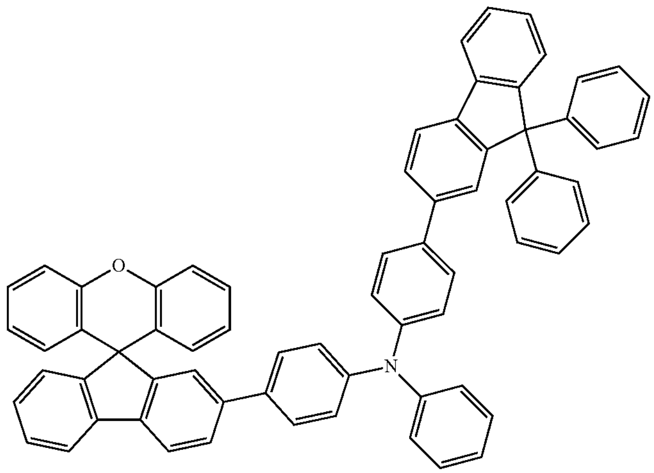
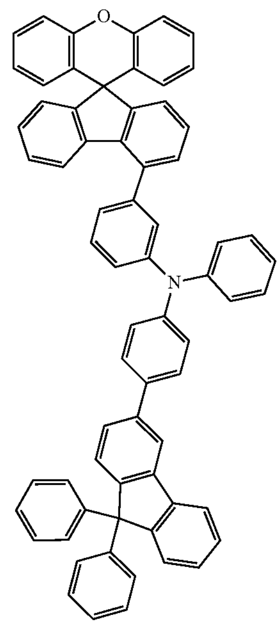
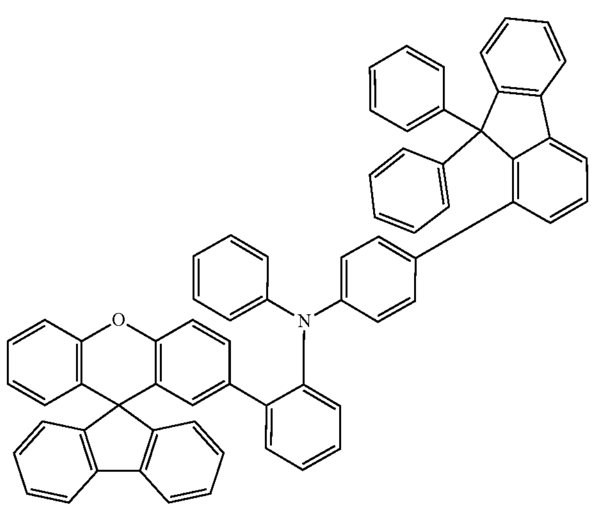
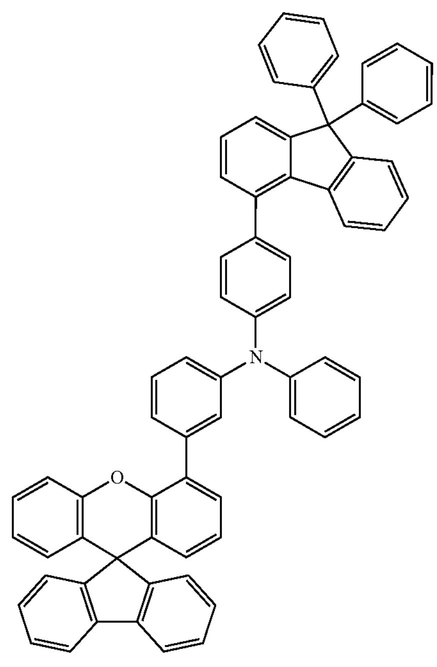

-continued
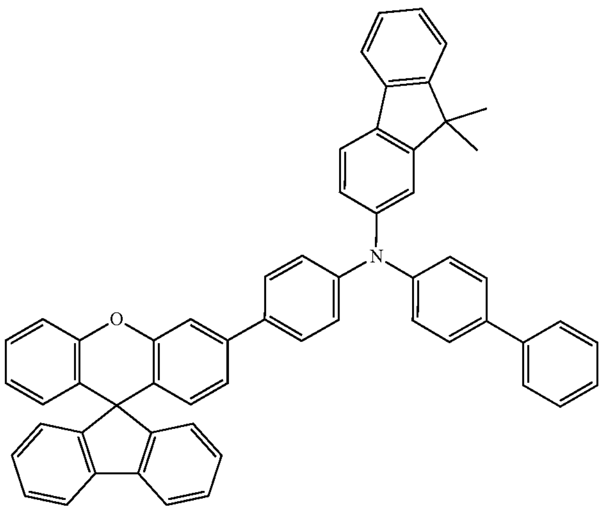
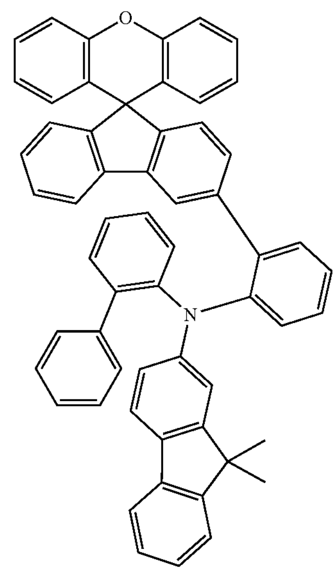
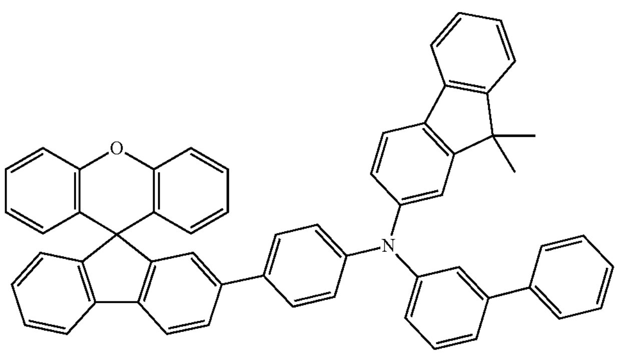
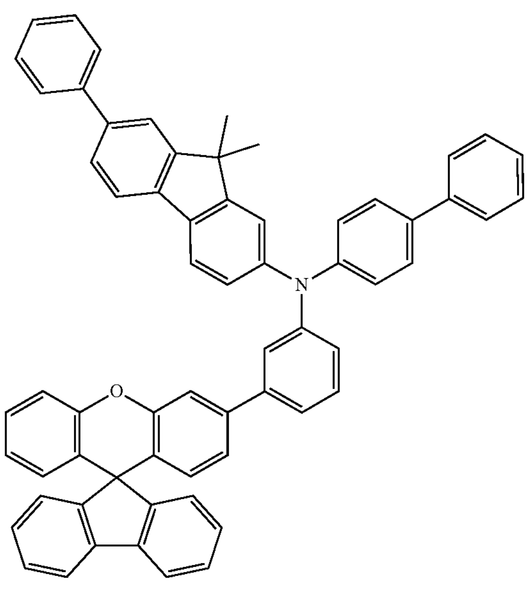
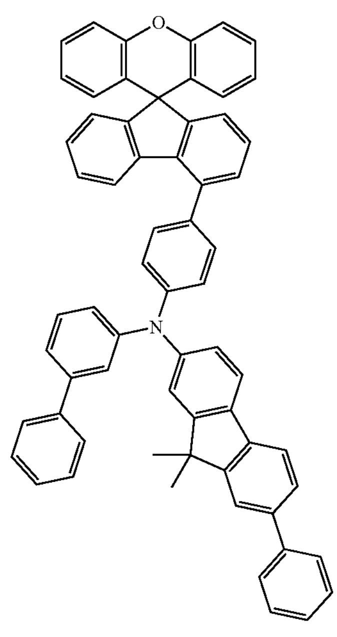

-continued
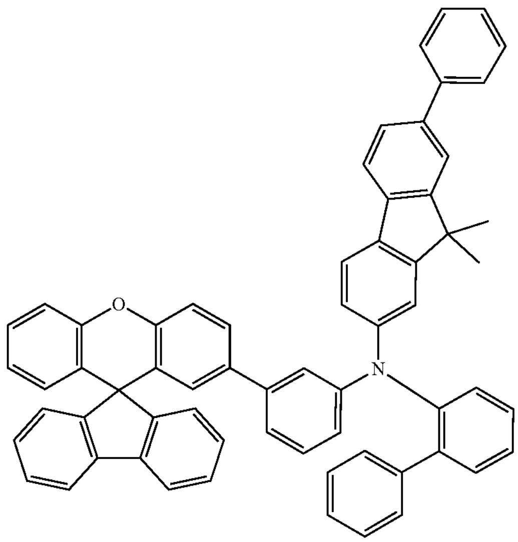
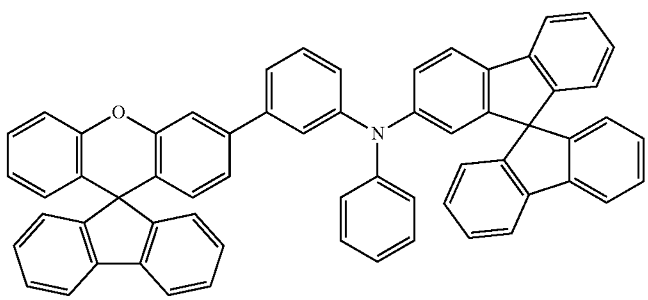
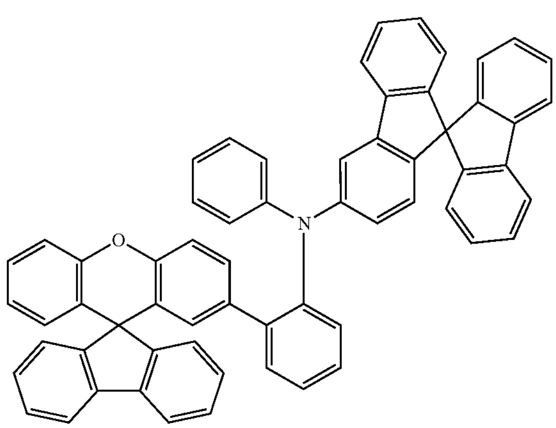

-continued
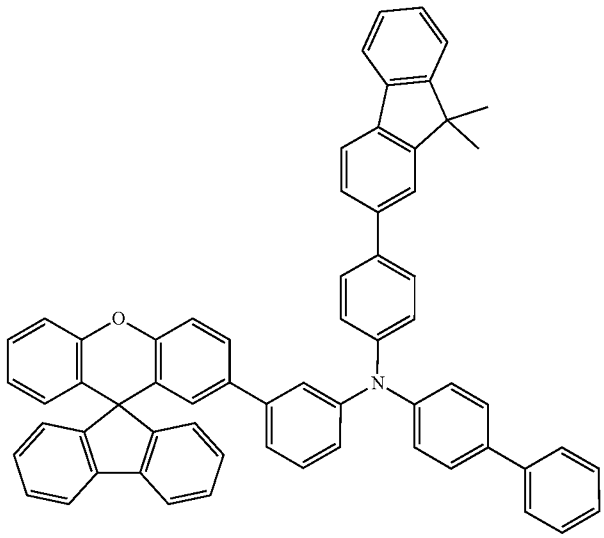
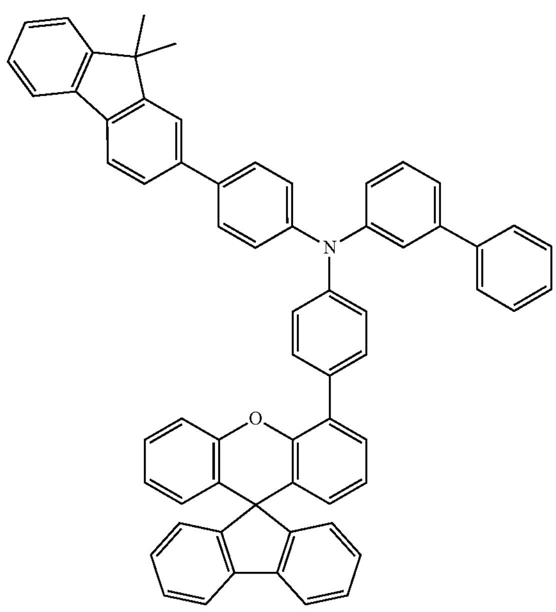
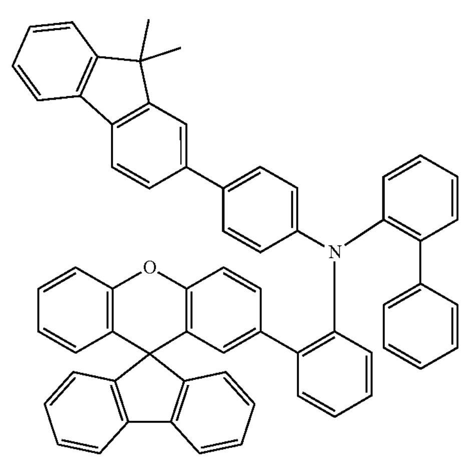

-continued
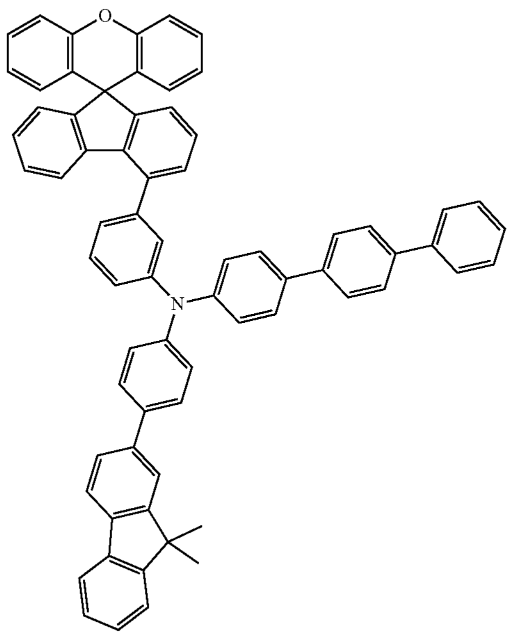
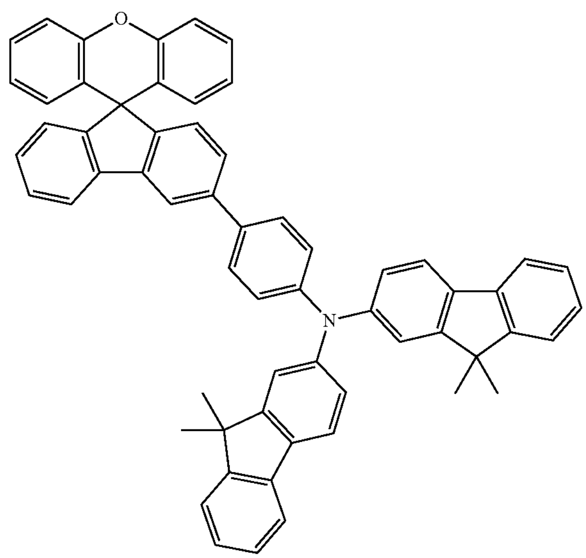
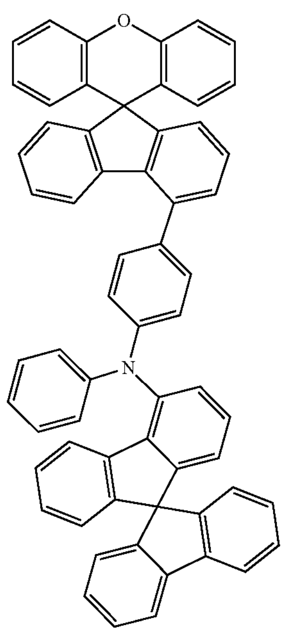
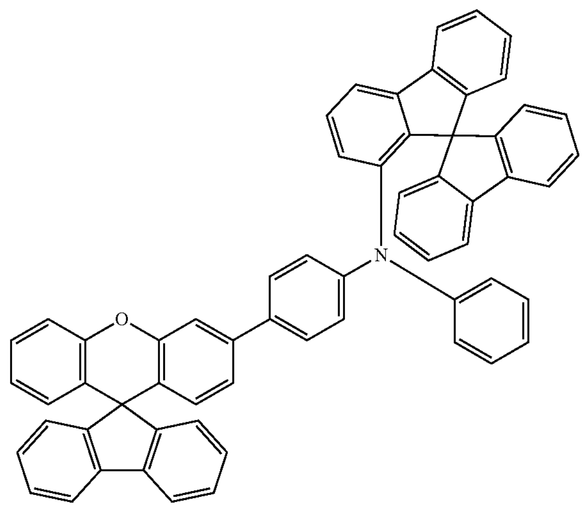
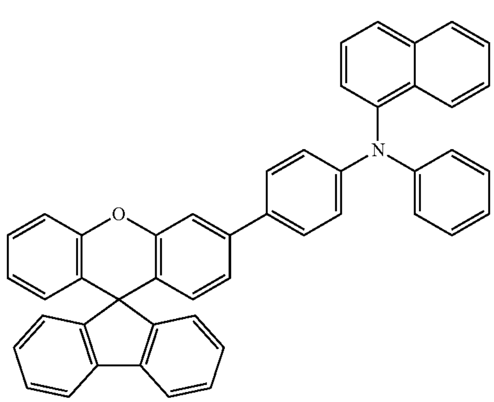
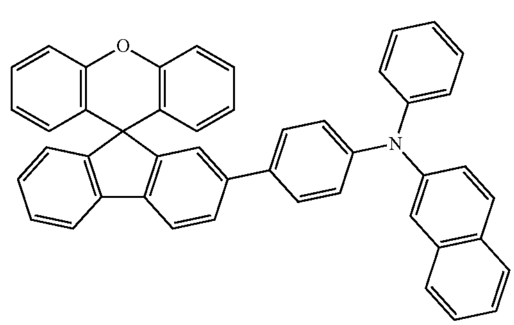

-continued
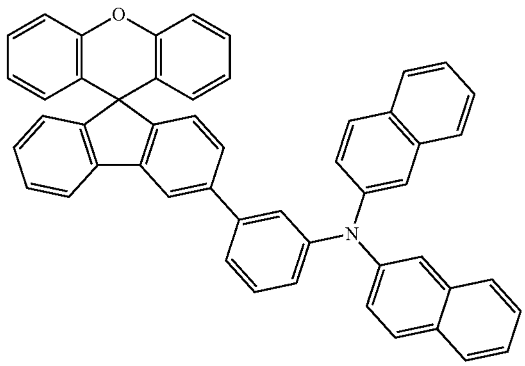
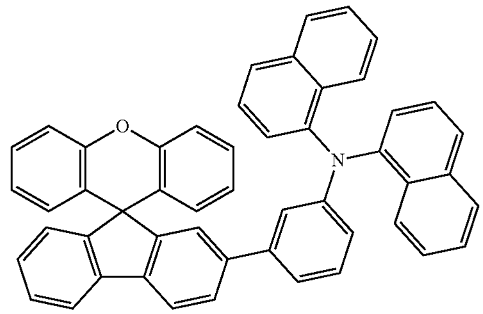
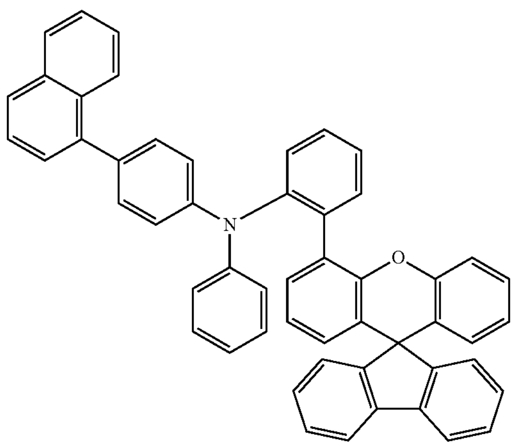
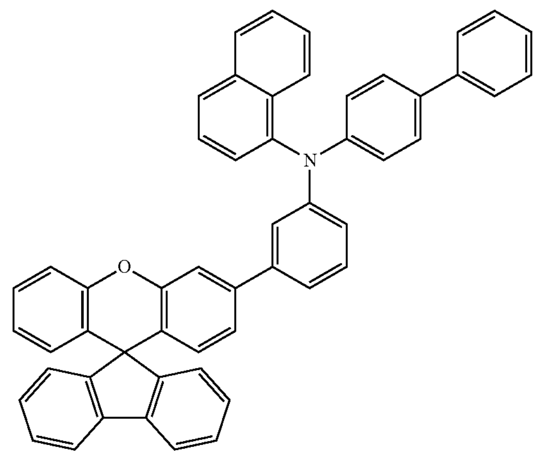
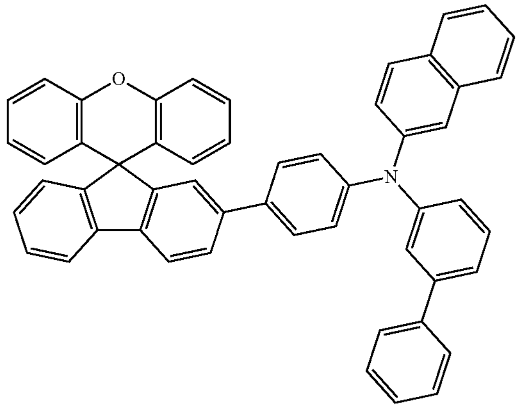
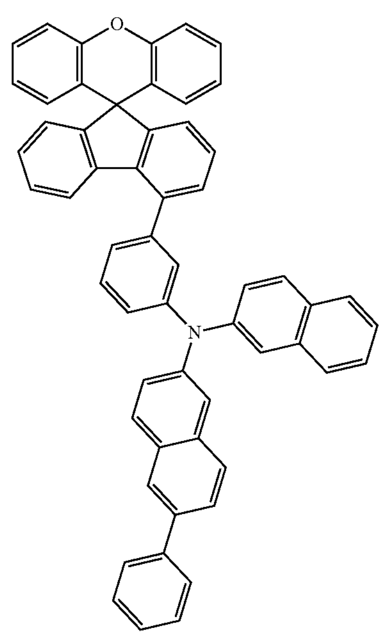

-continued
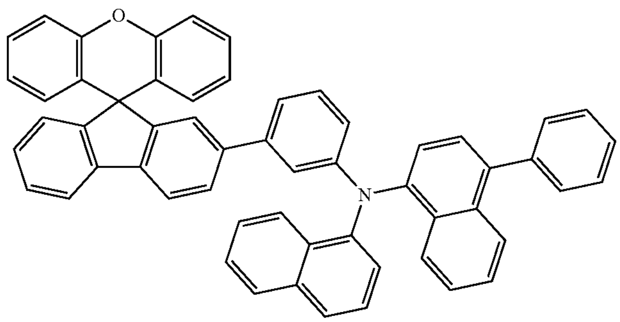
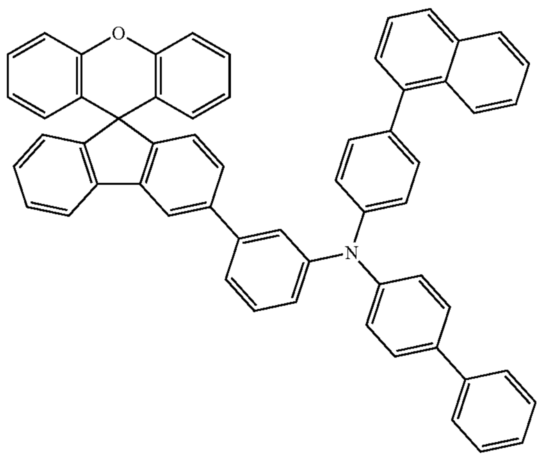
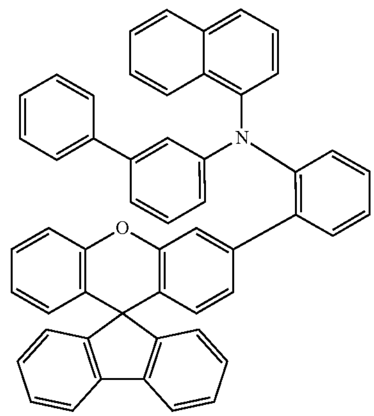
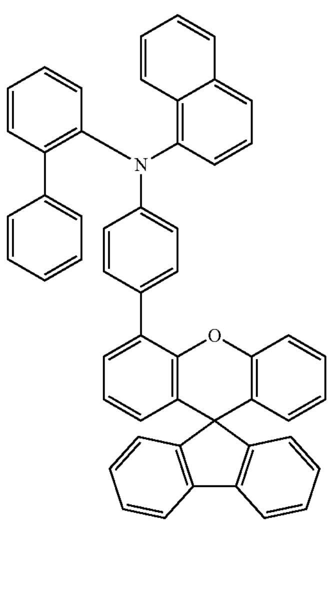
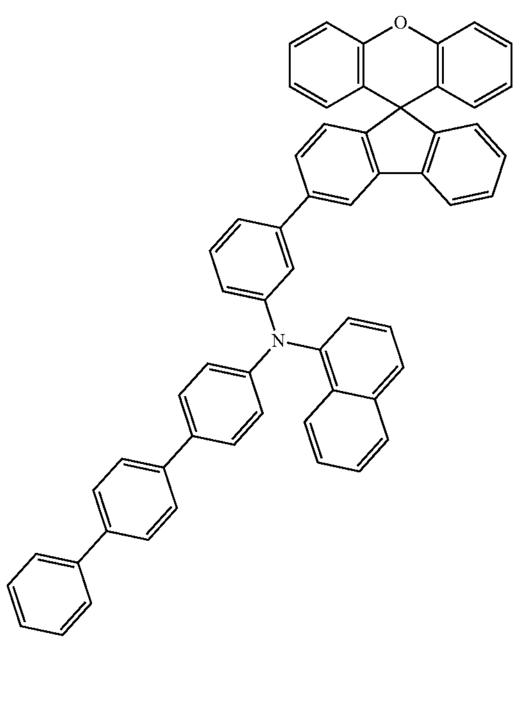

-continued
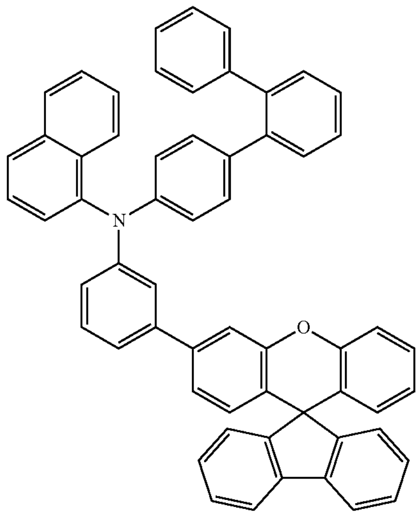
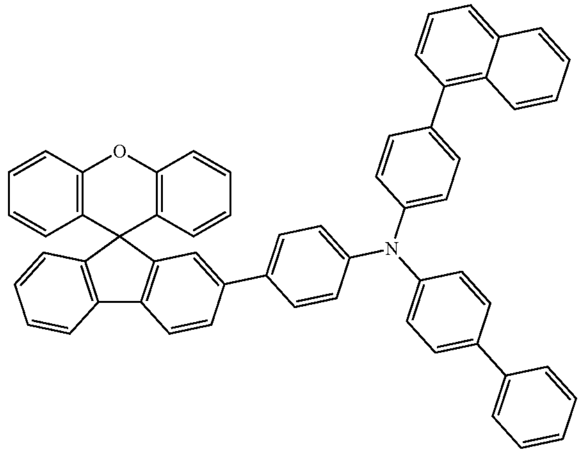
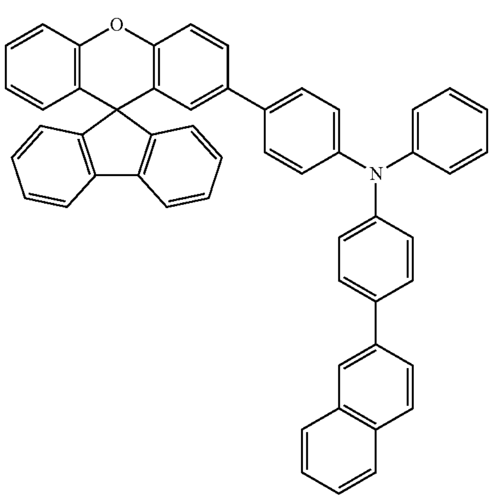
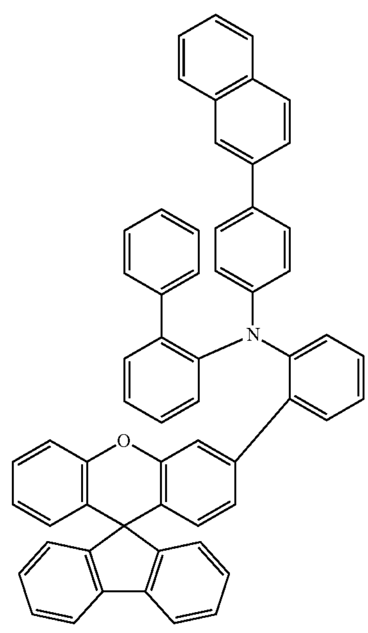

-continued
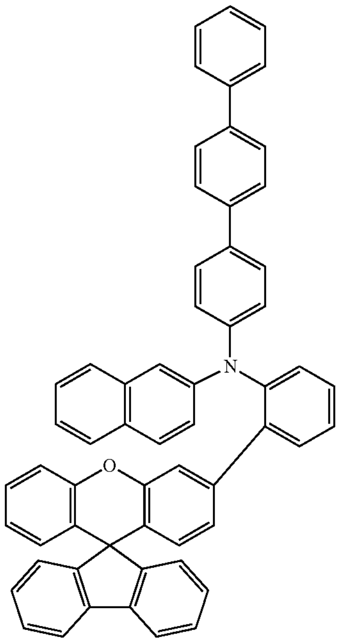
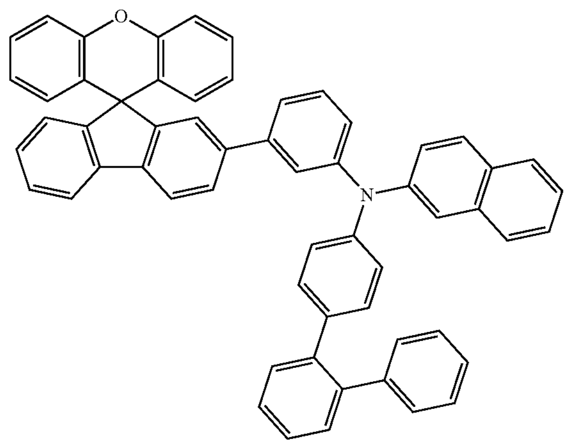
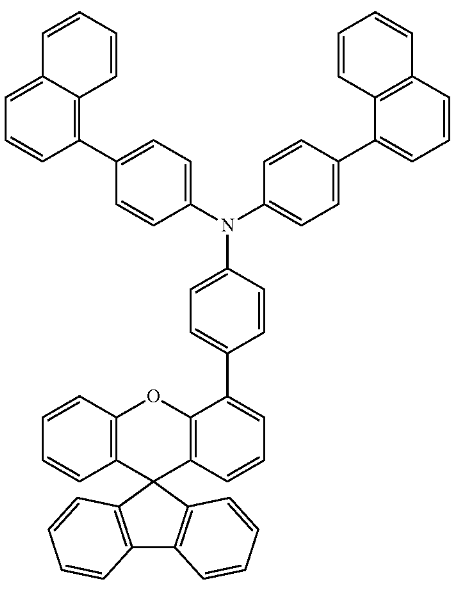
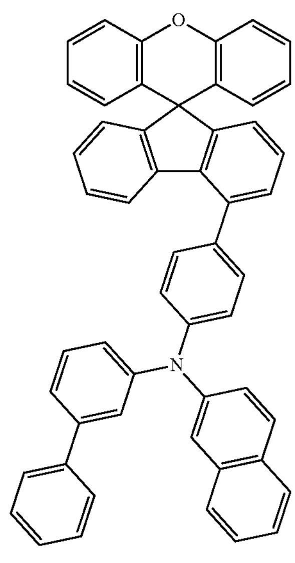
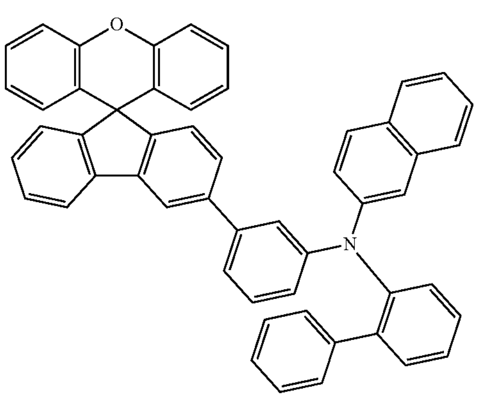
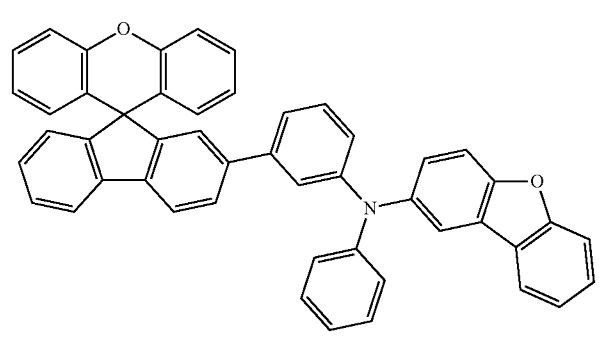

-continued
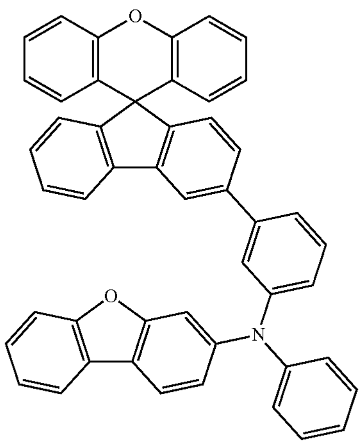
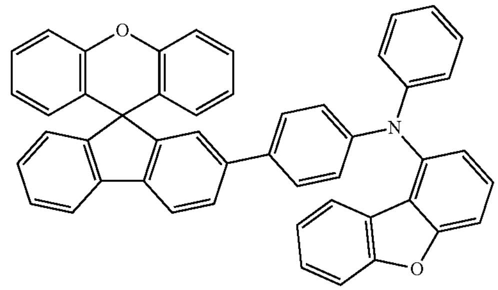
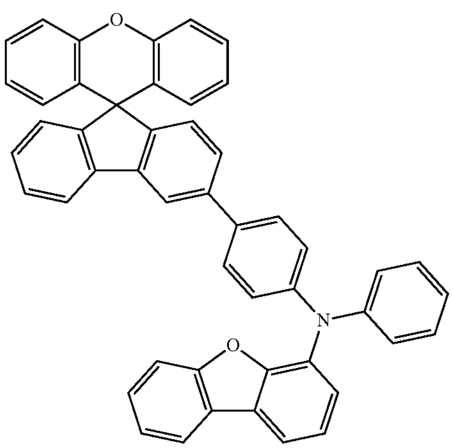
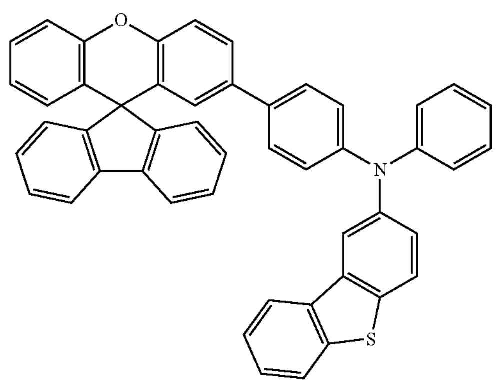
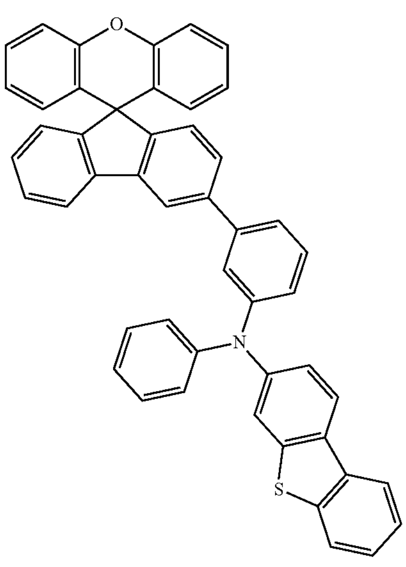
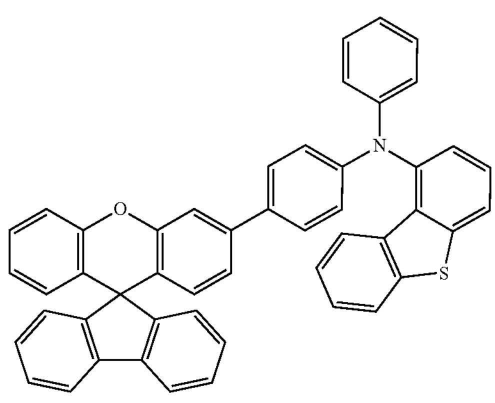

-continued
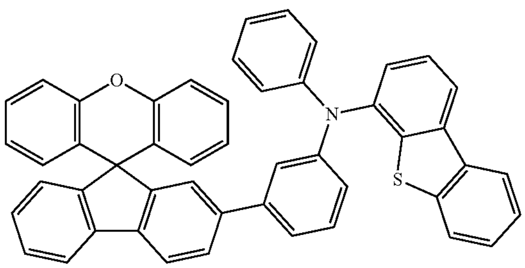
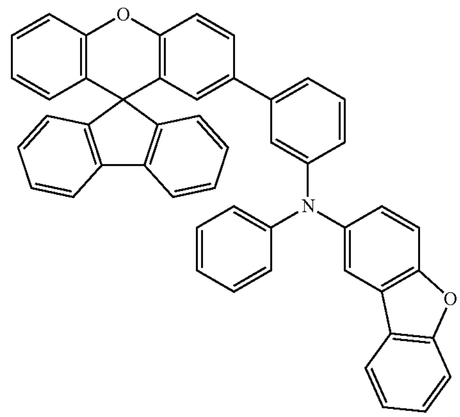
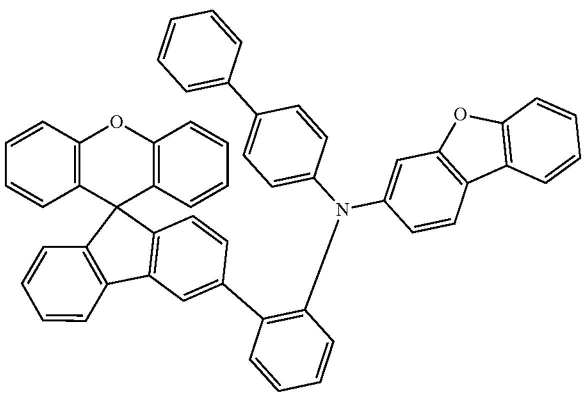
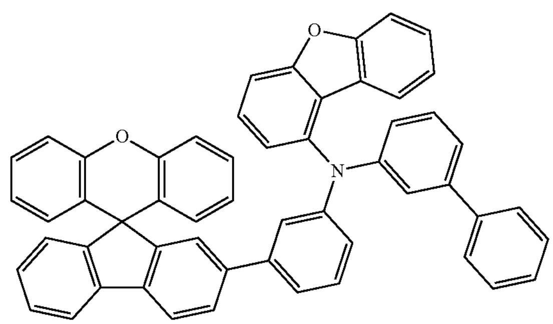
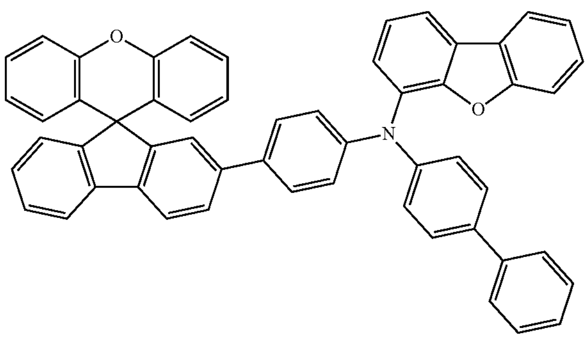
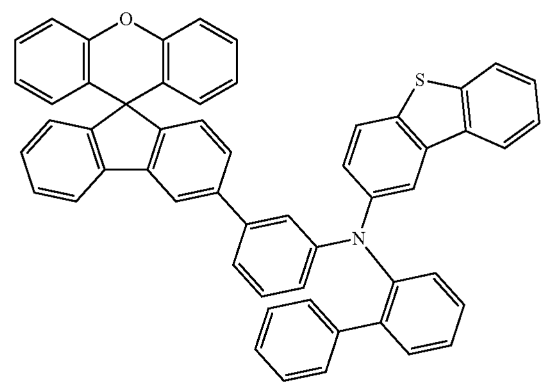

-continued
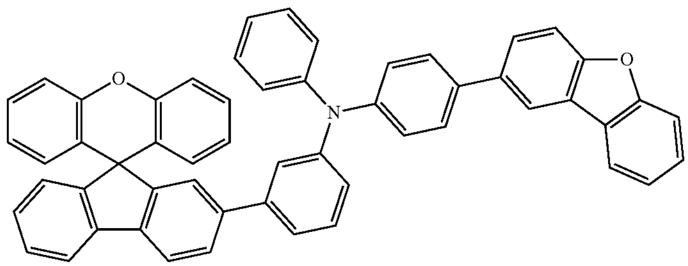
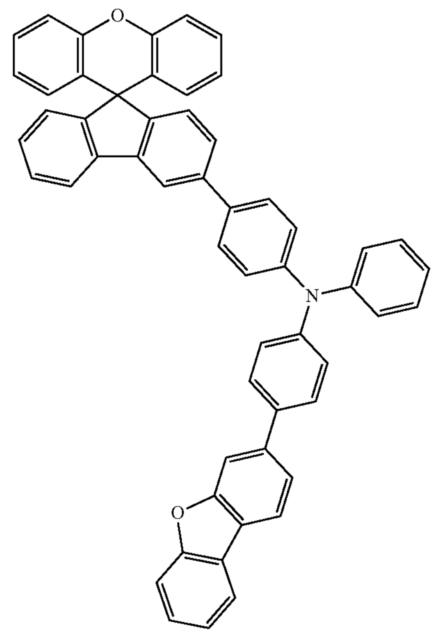
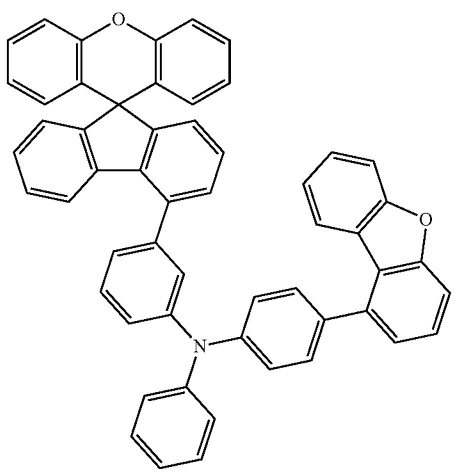
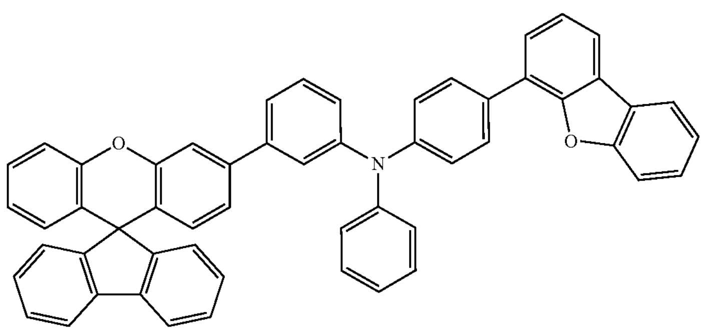

-continued
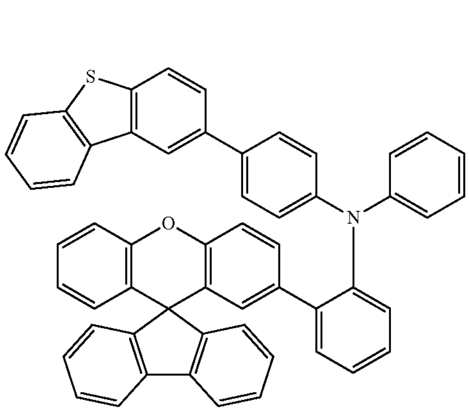
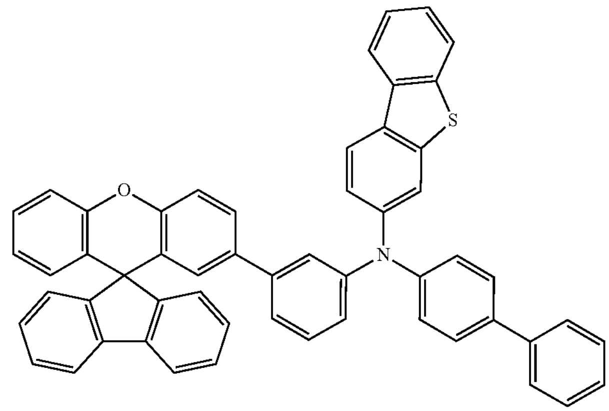
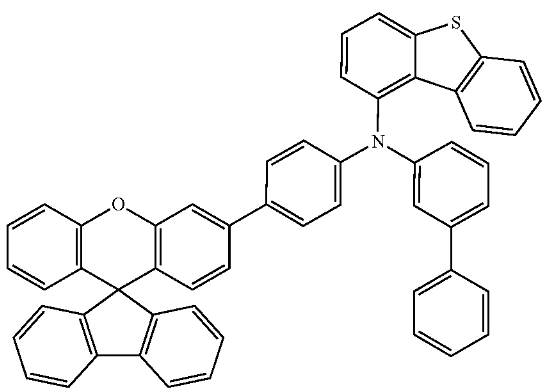
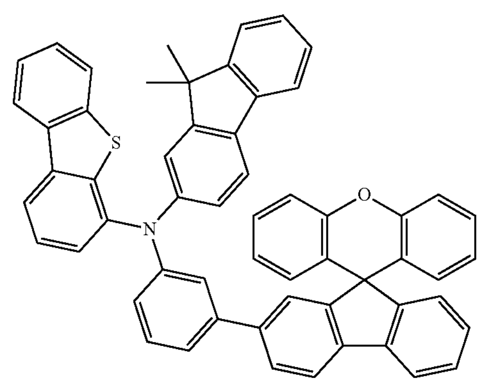
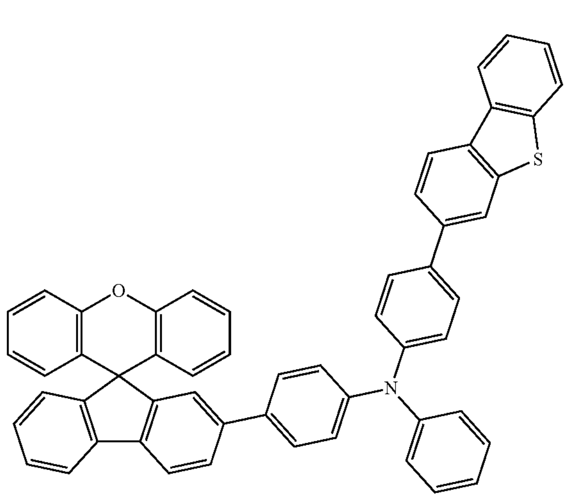
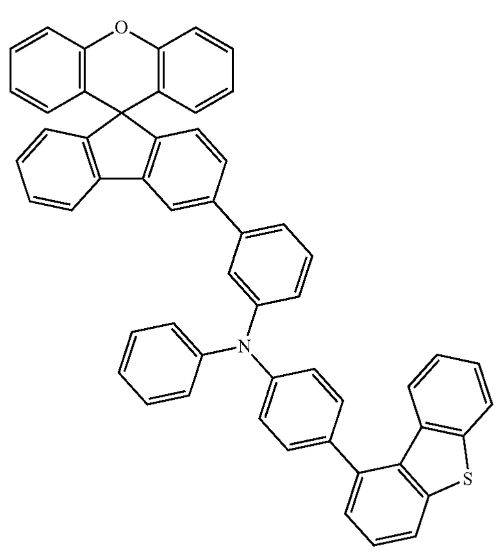

-continued
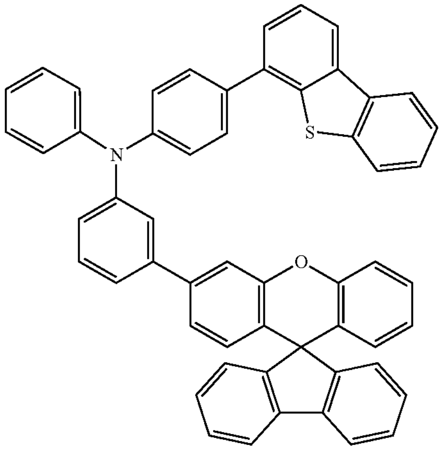
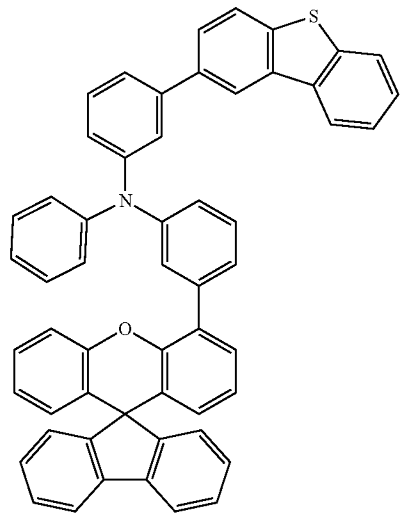
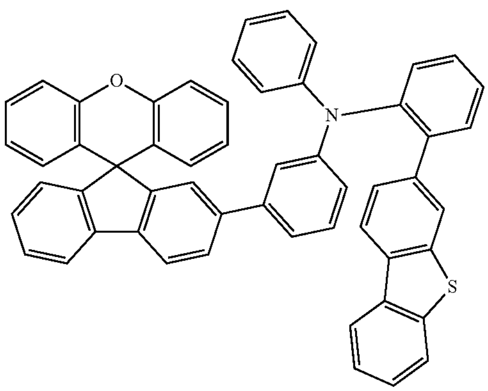
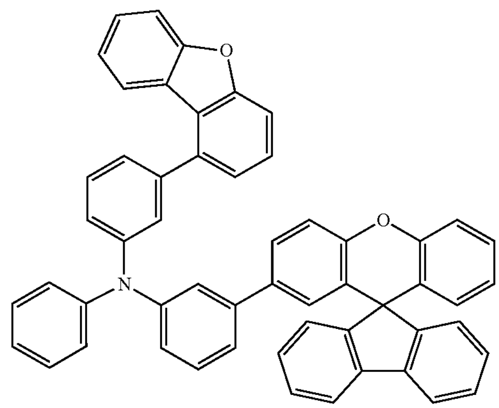
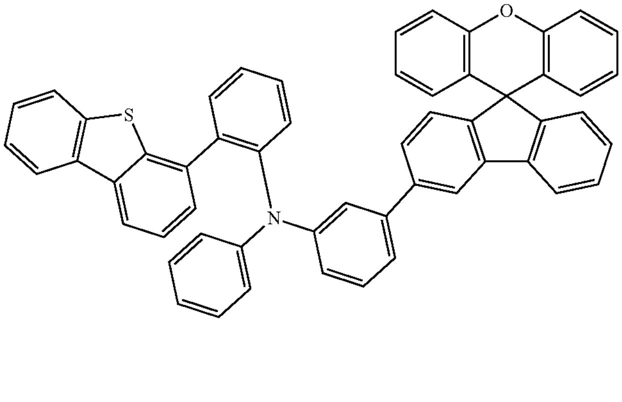
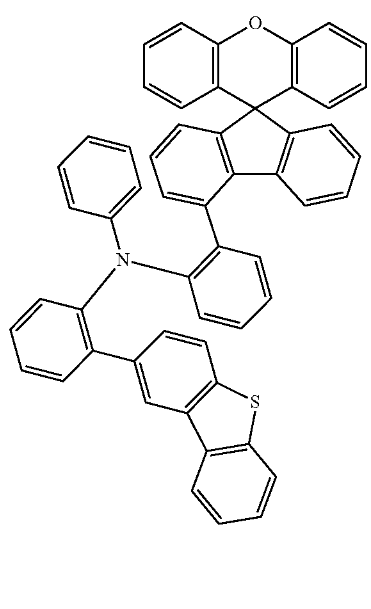

-continued
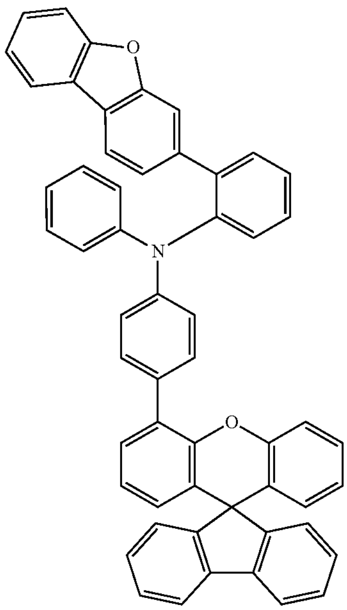
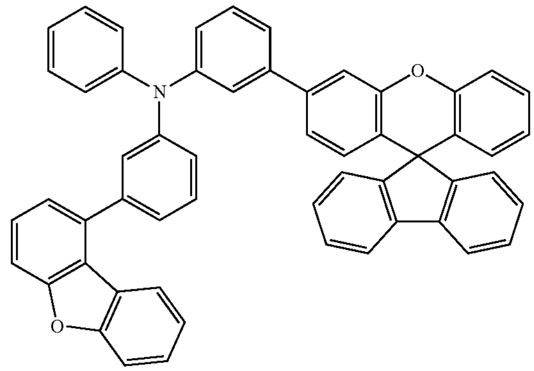
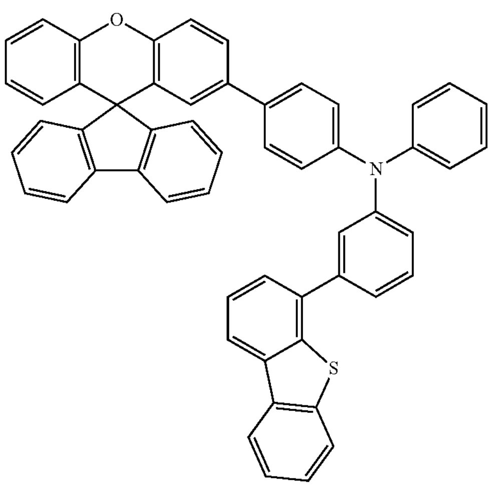
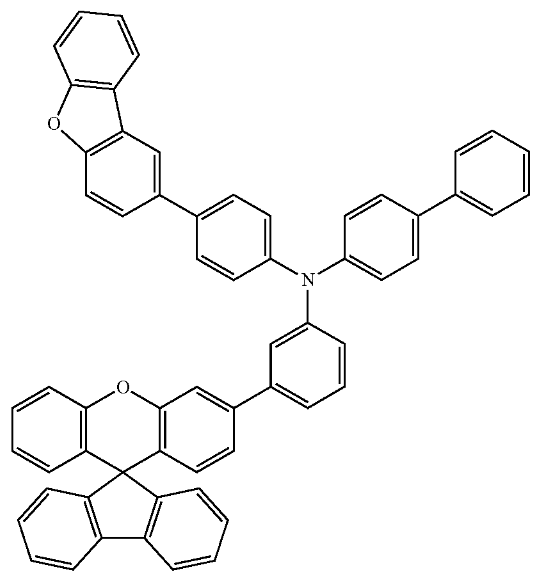
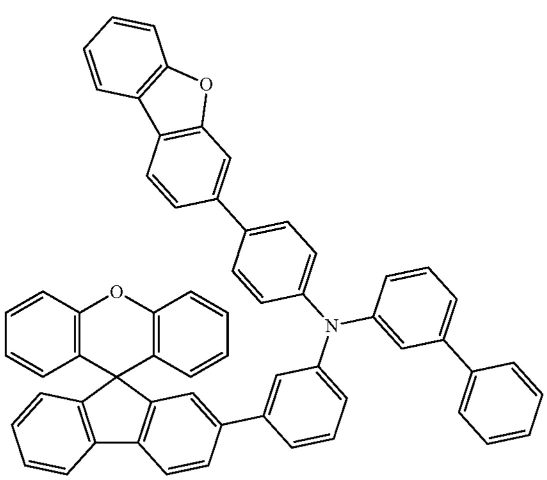
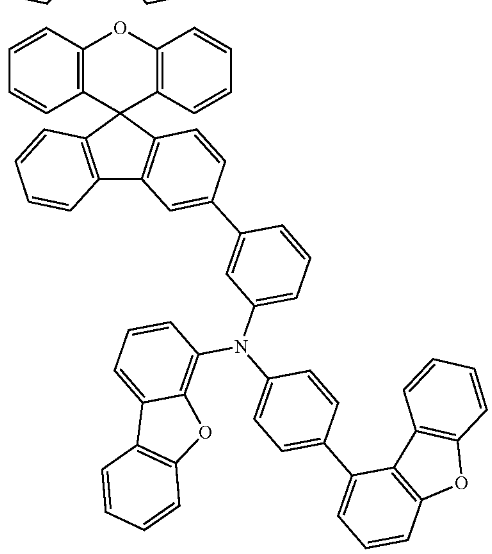

-continued
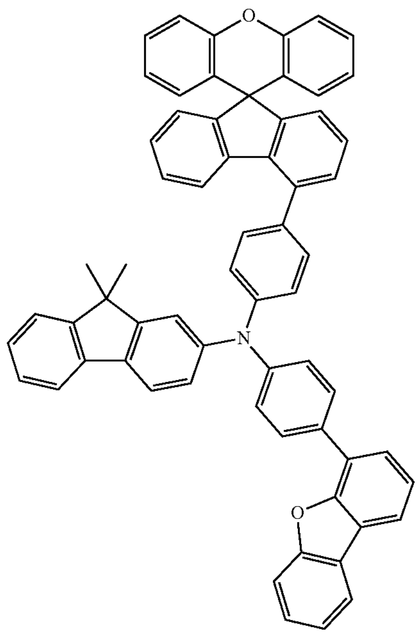
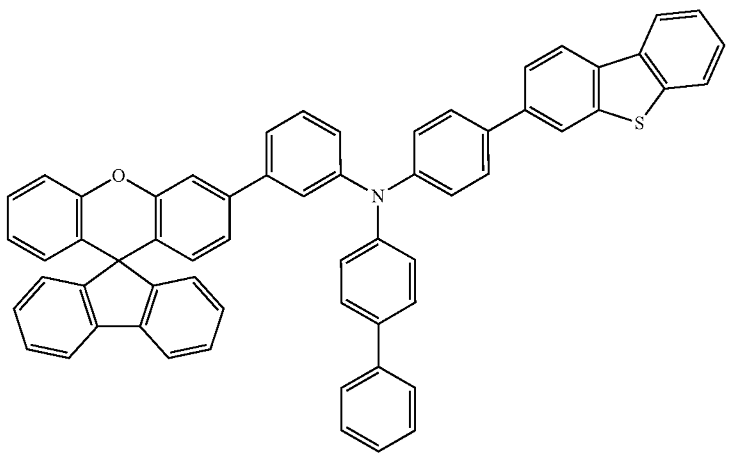
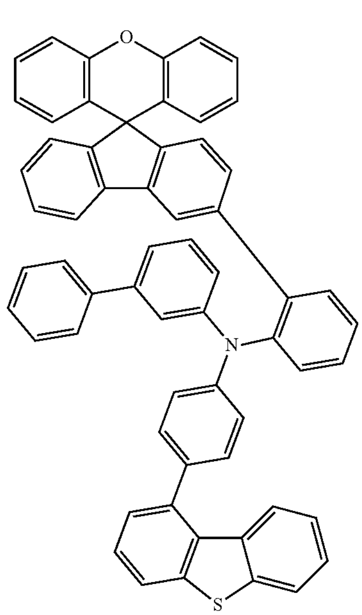
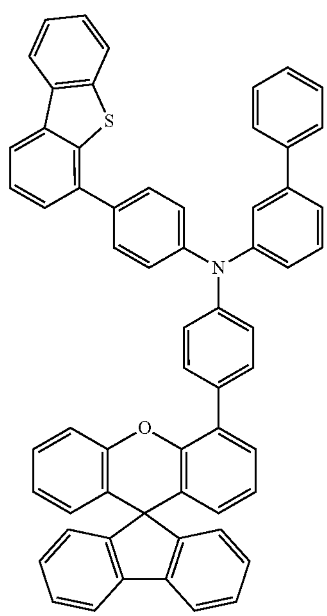
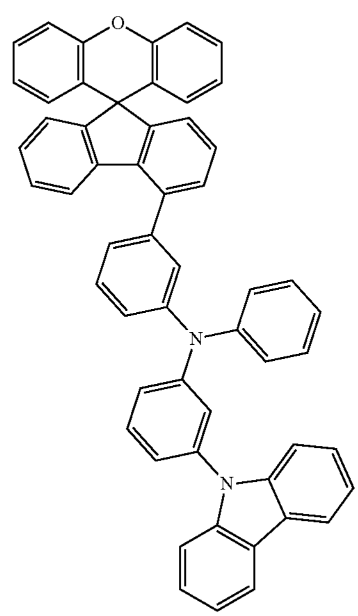

-continued
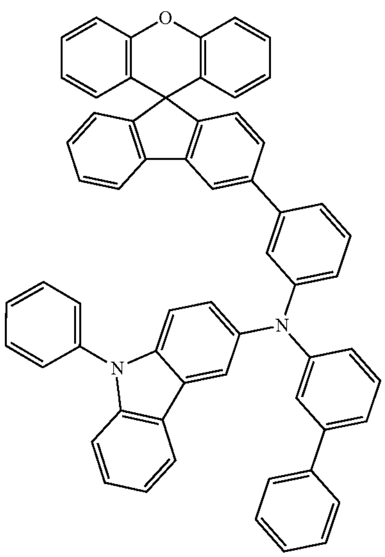
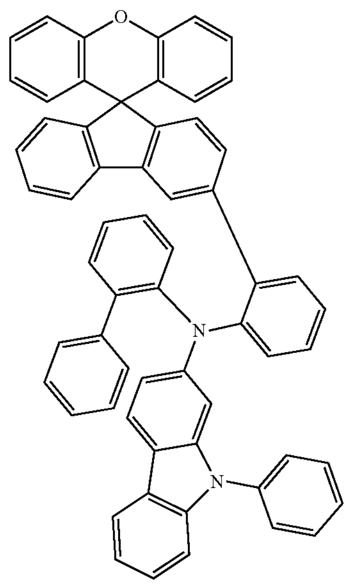
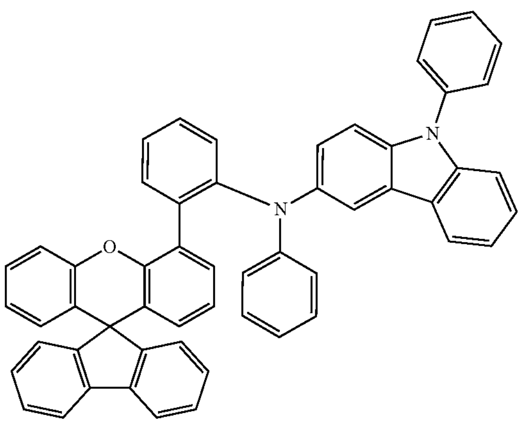
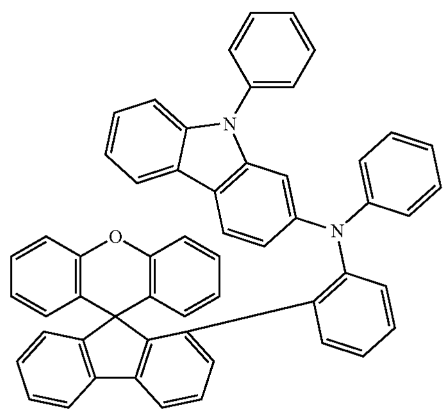
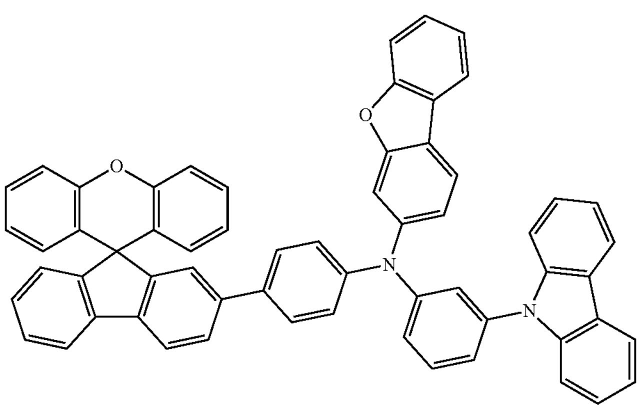

-continued
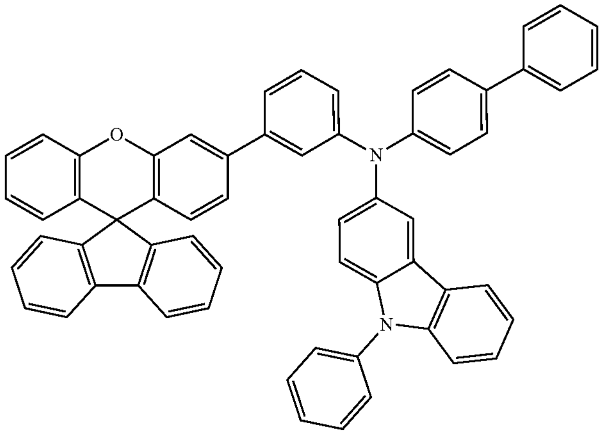
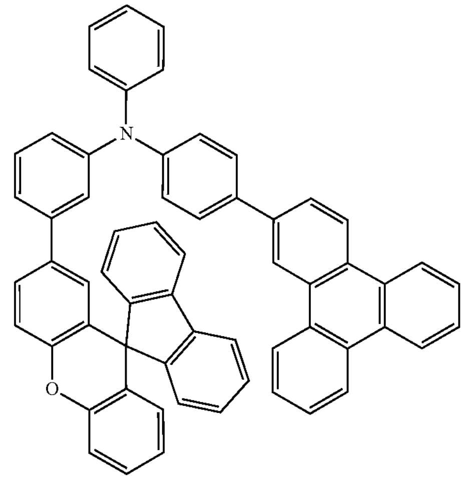
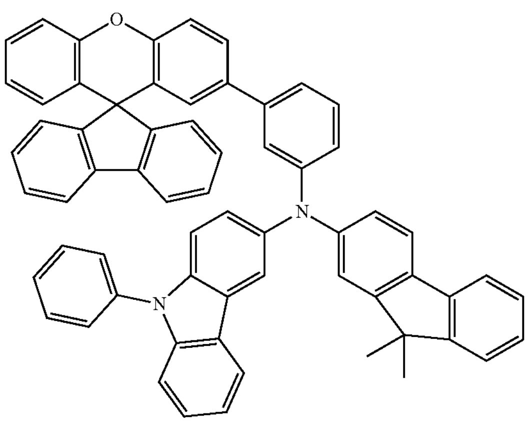
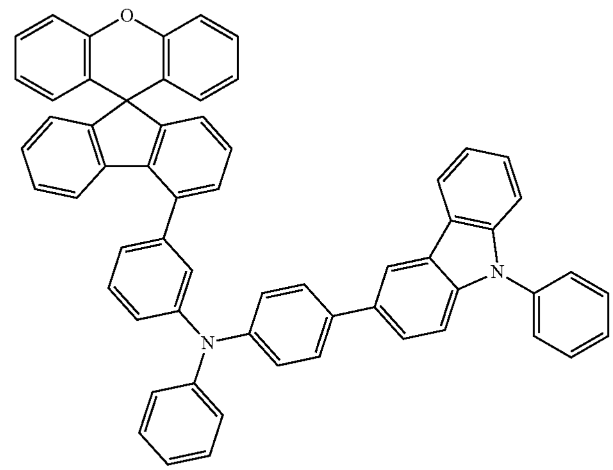
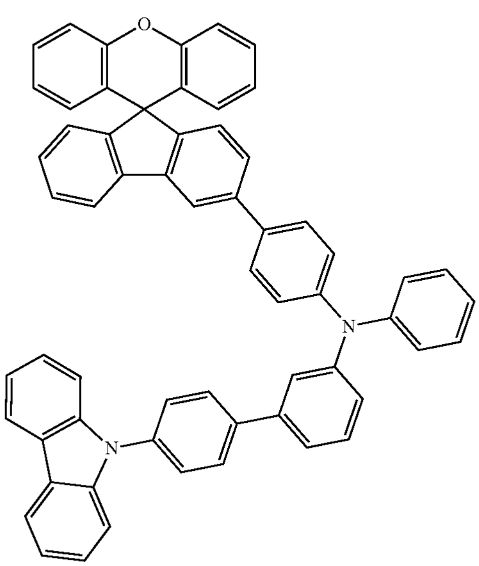
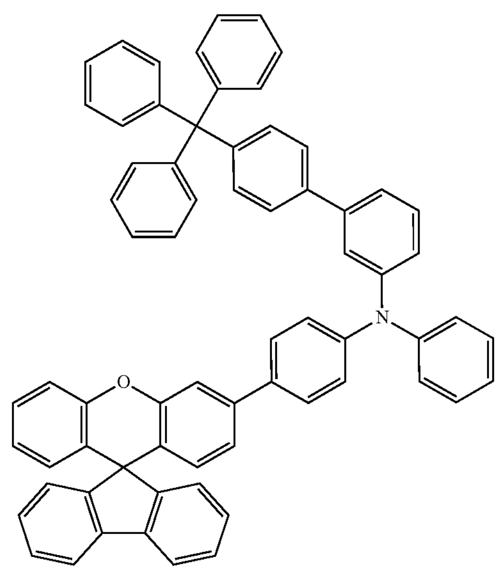

-continued
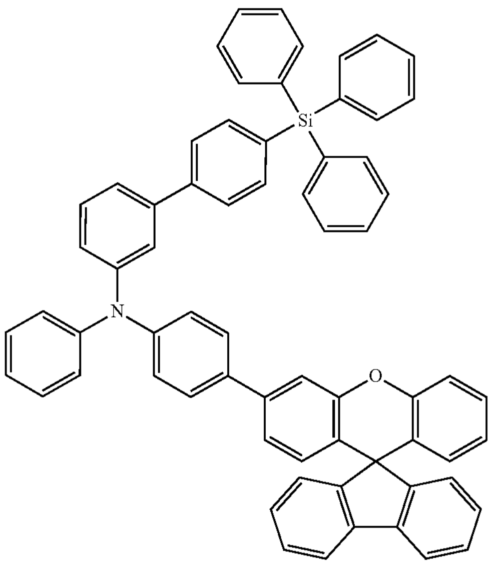
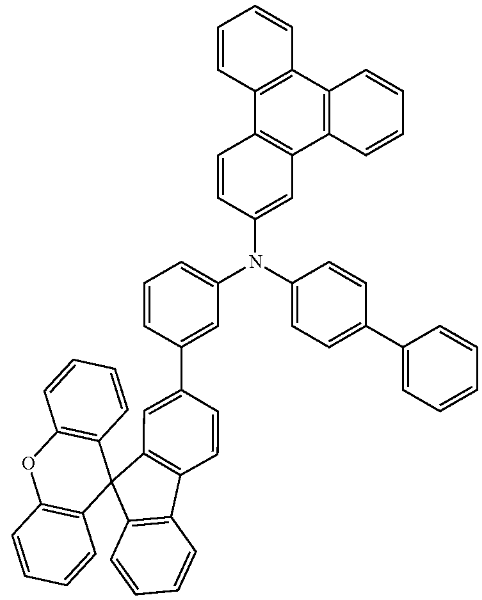
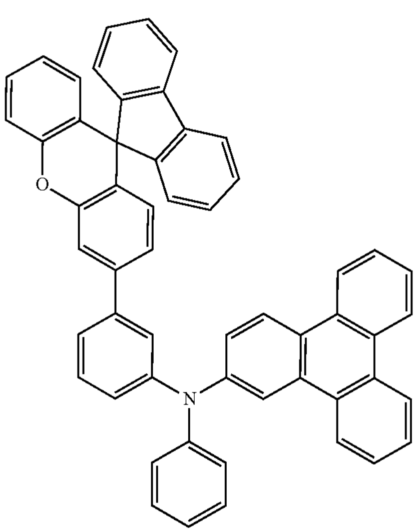
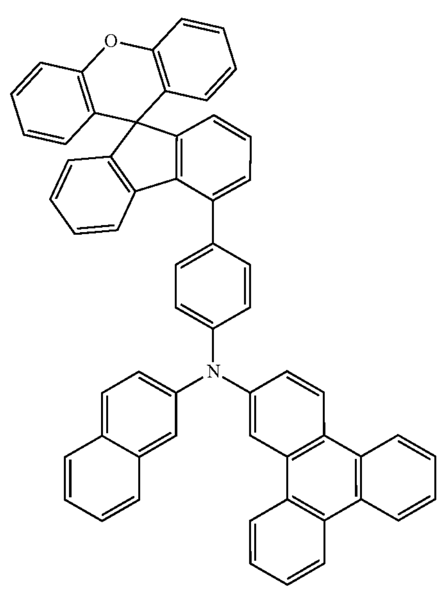

-continued
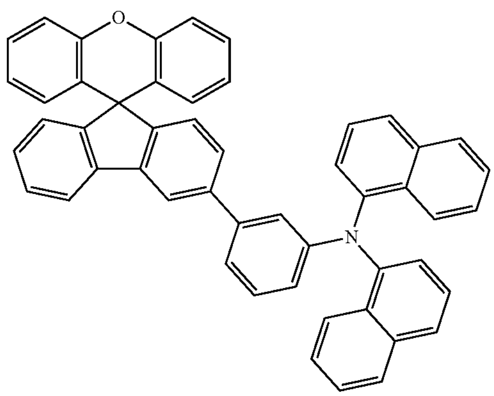
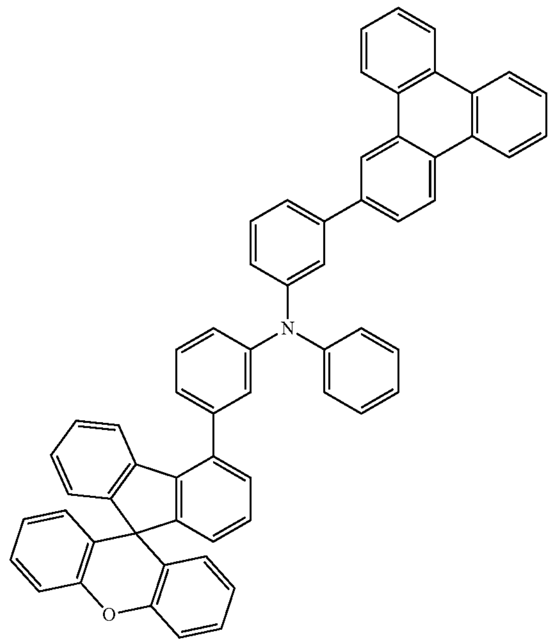
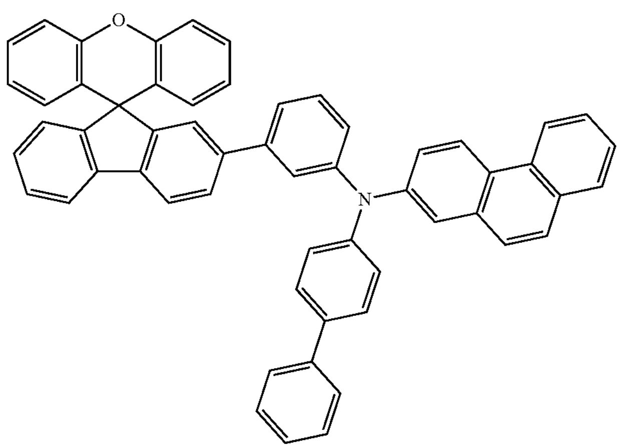
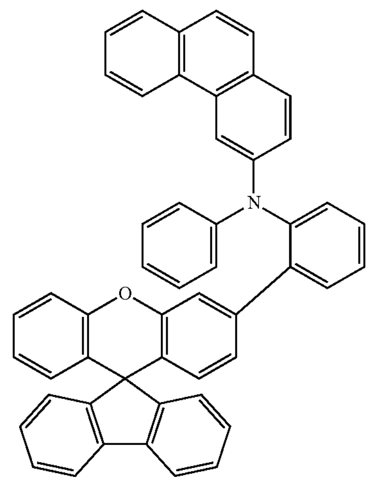
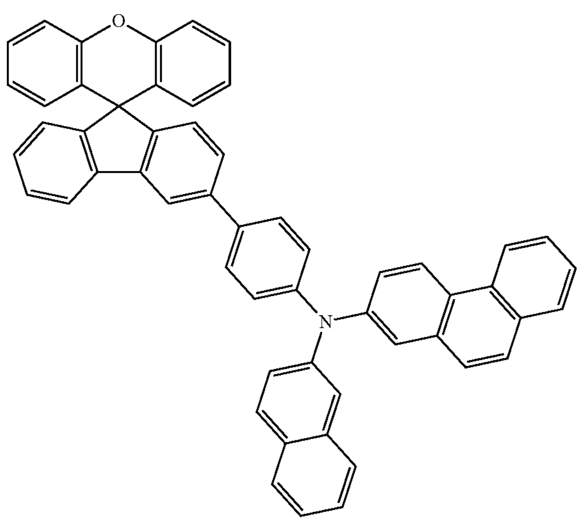
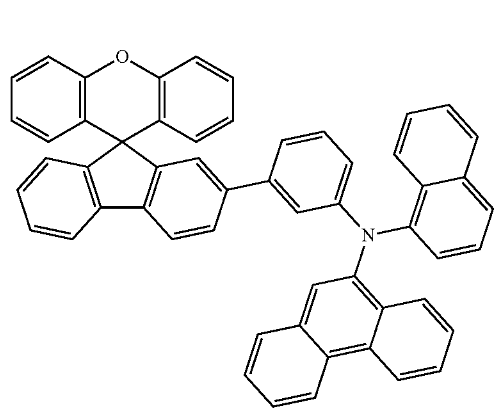

-continued
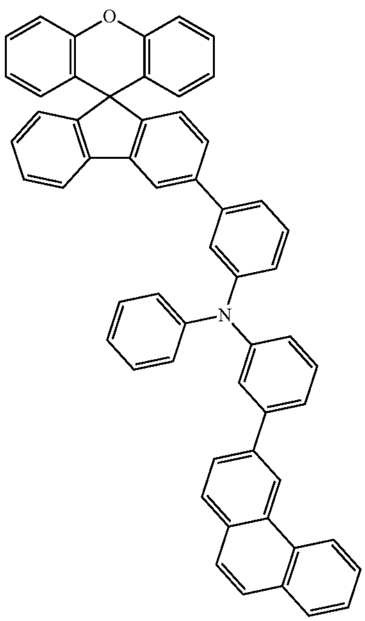
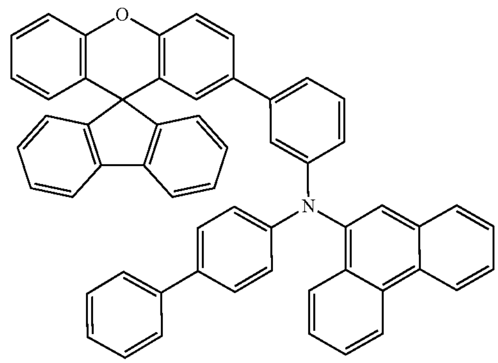
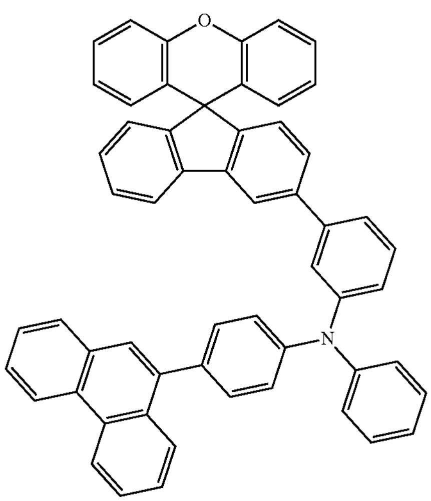
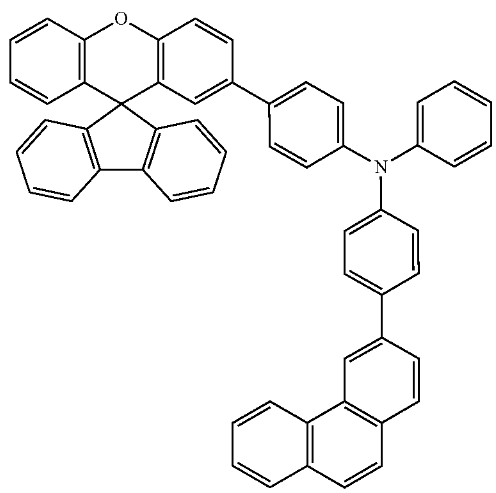
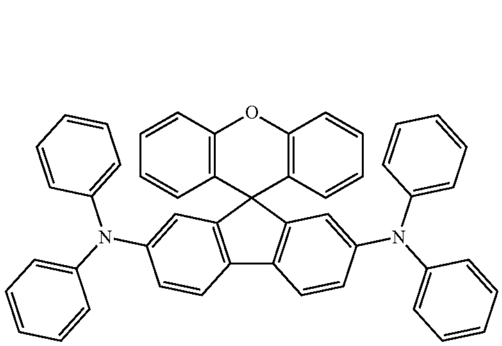
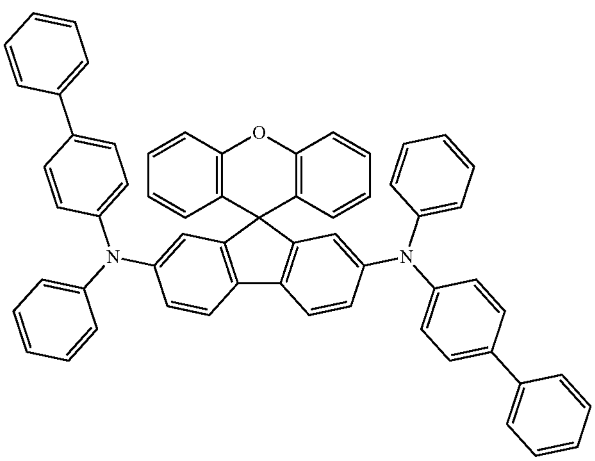

-continued
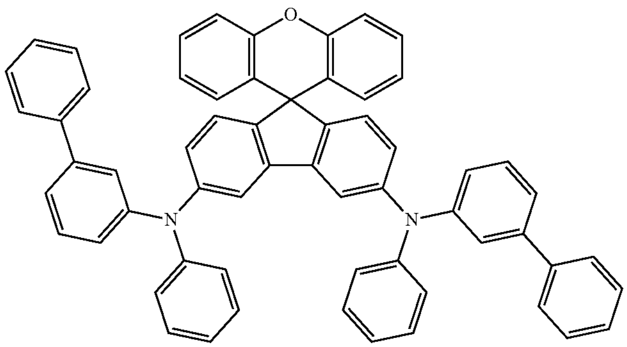
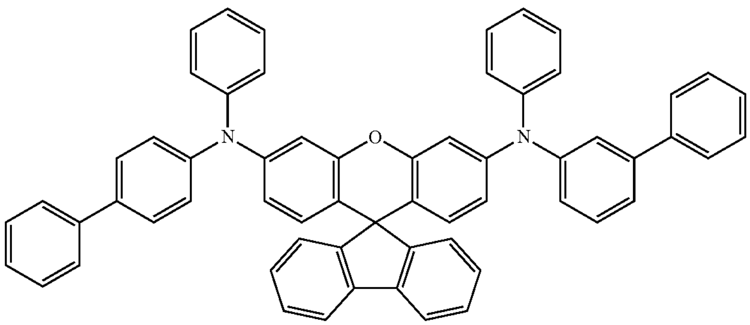
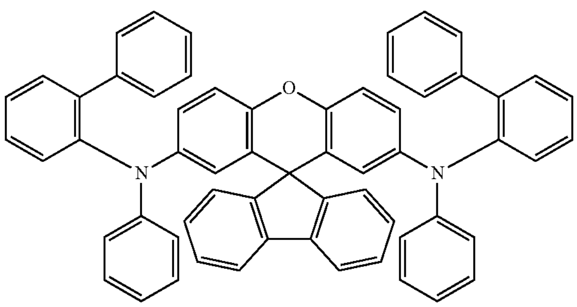
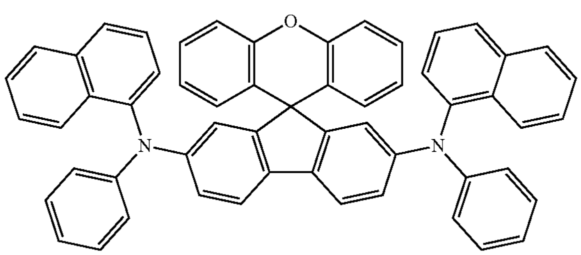
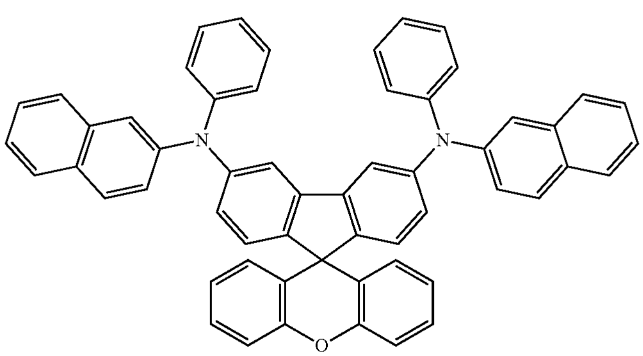

-continued
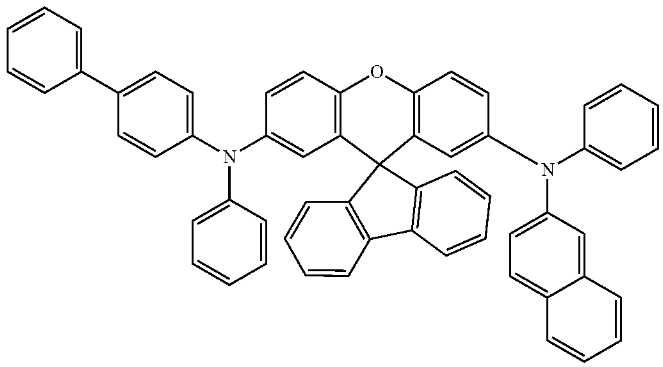
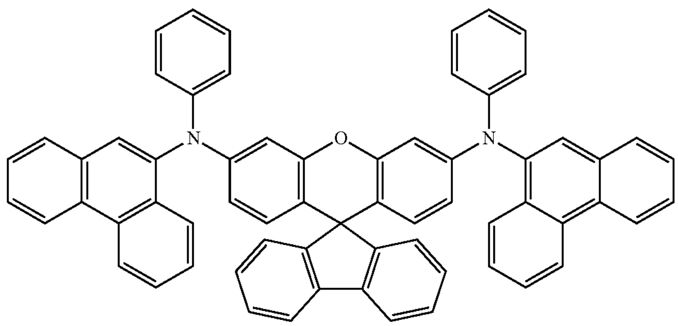
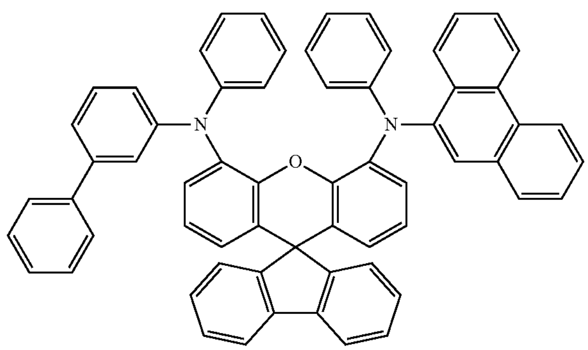
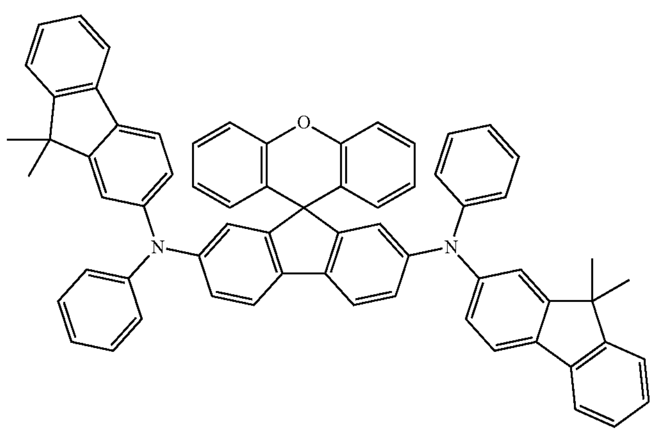

-continued
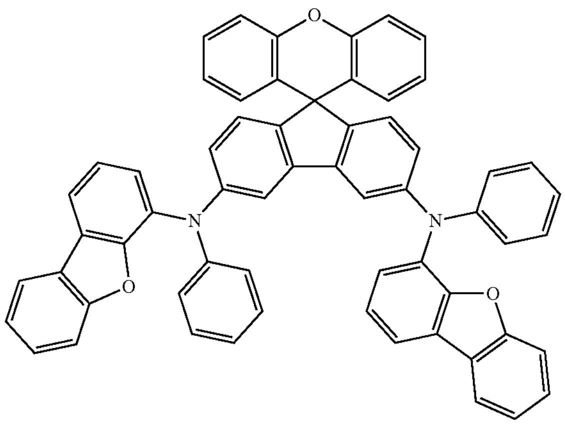
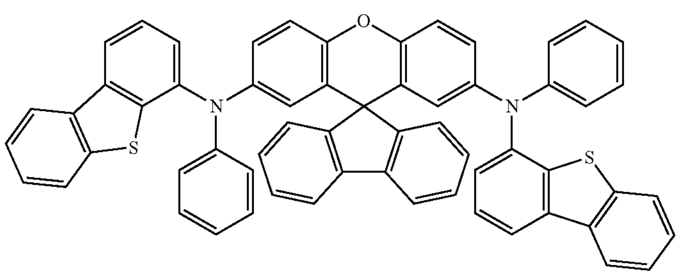
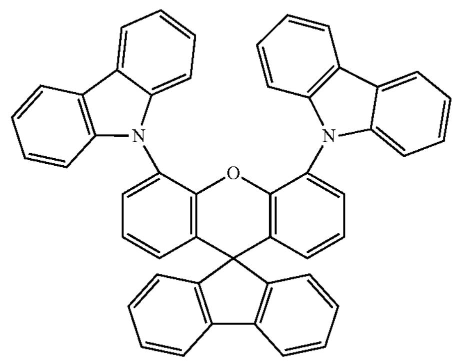
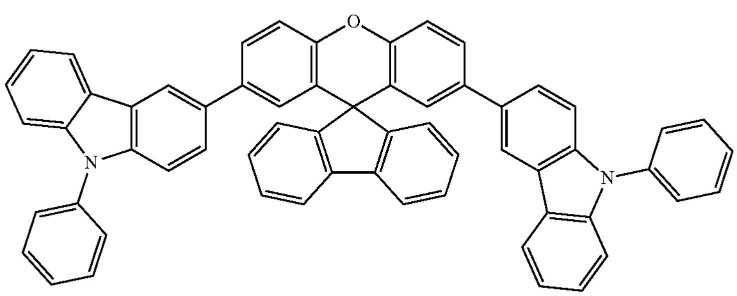
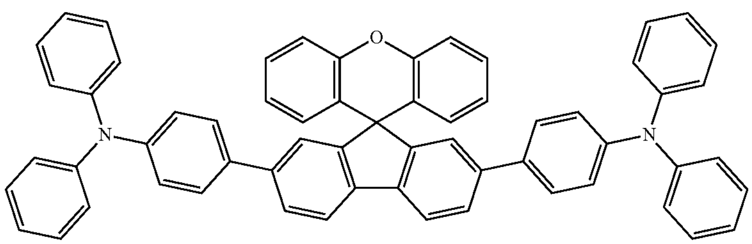
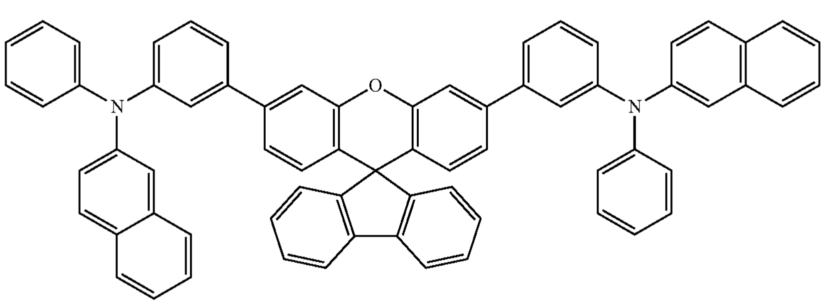

-continued
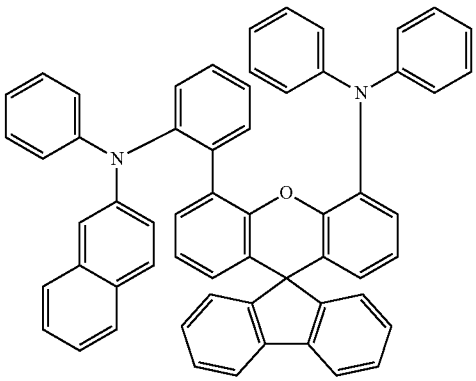
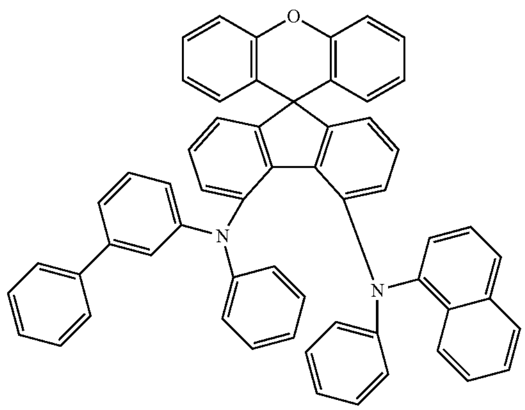
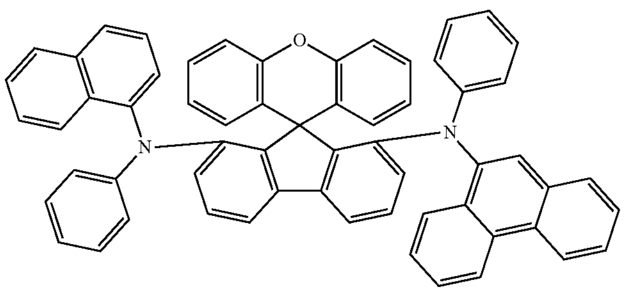
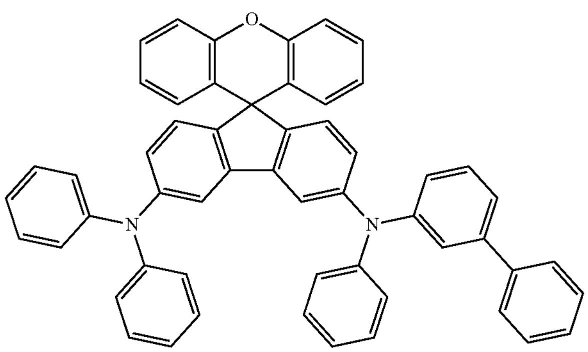
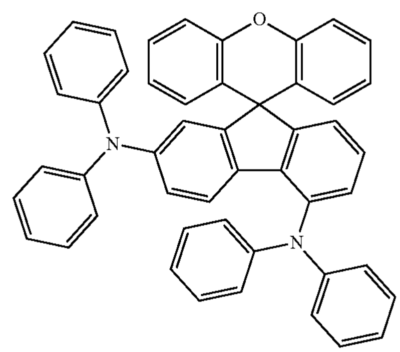
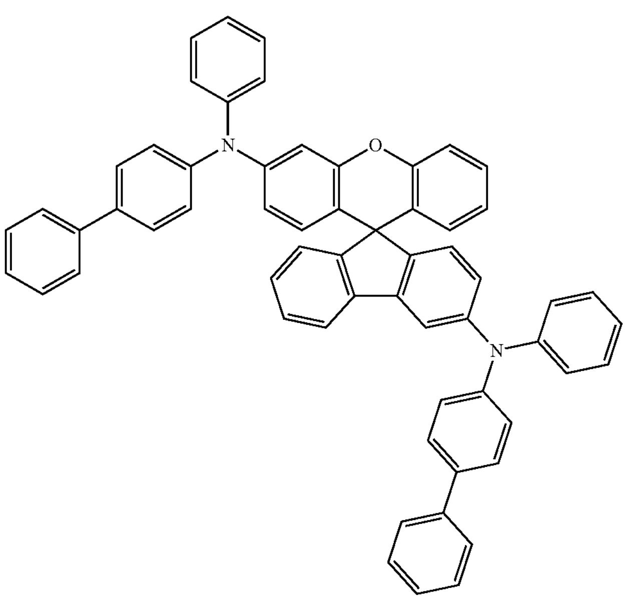

-continued
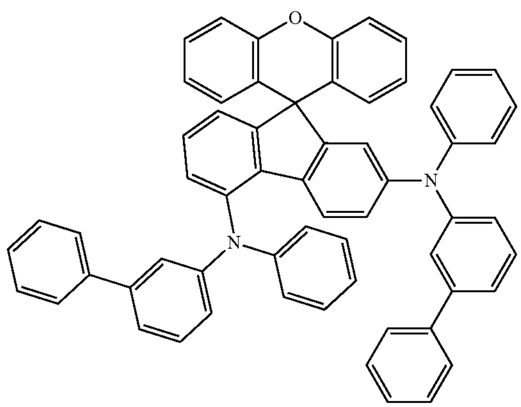
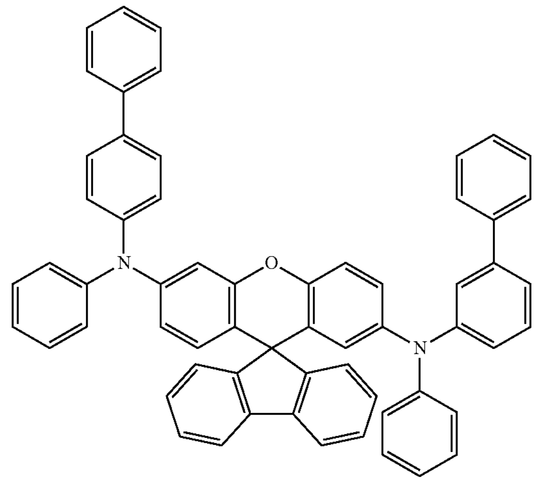
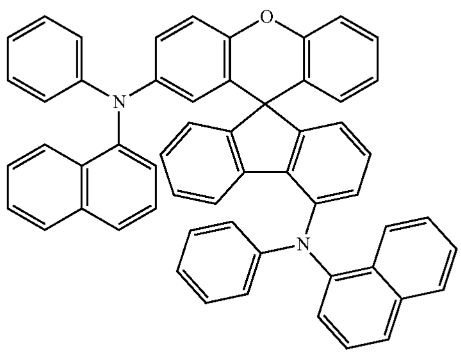
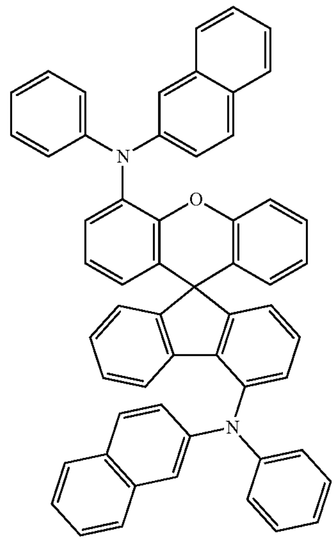
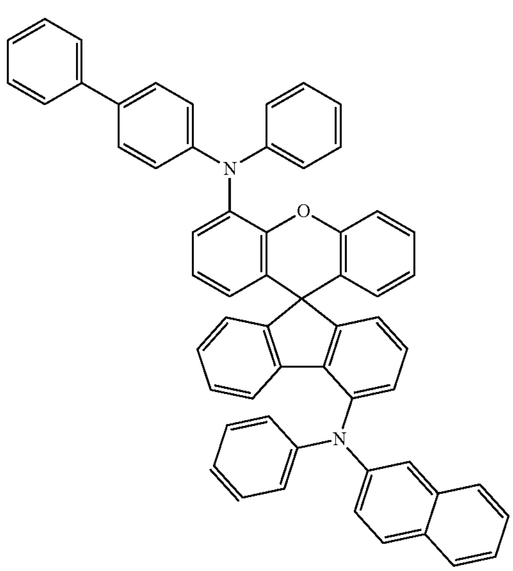
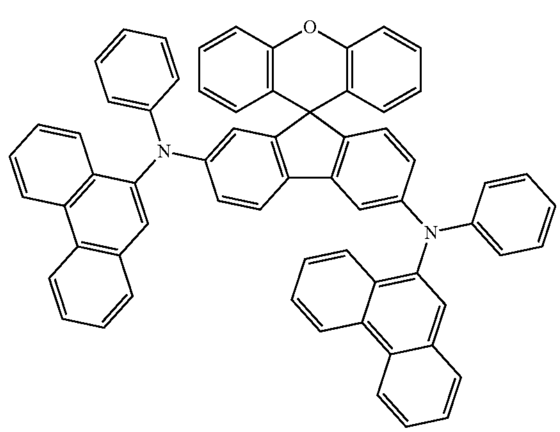

-continued
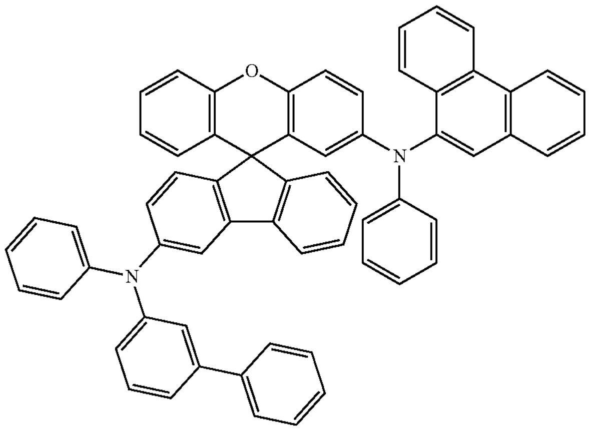
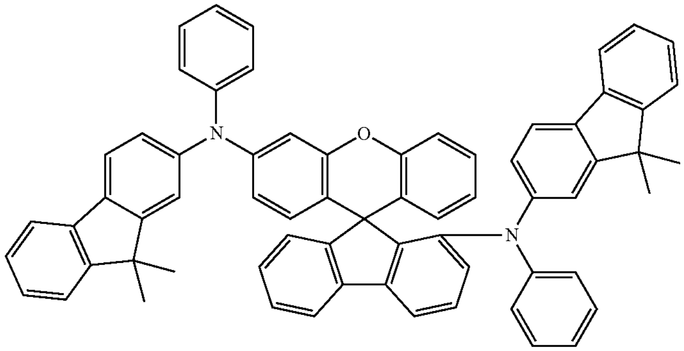
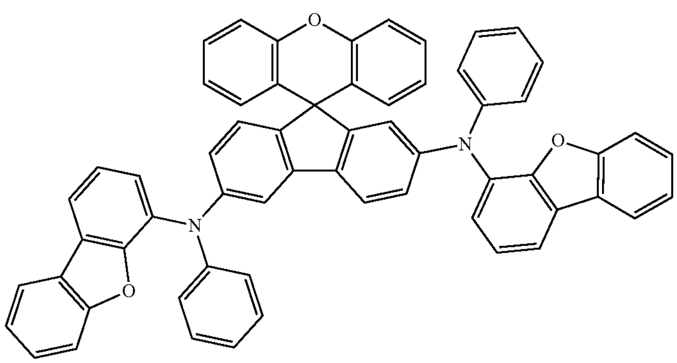
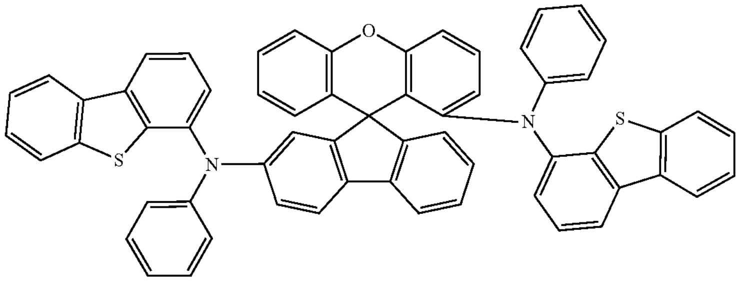

-continued
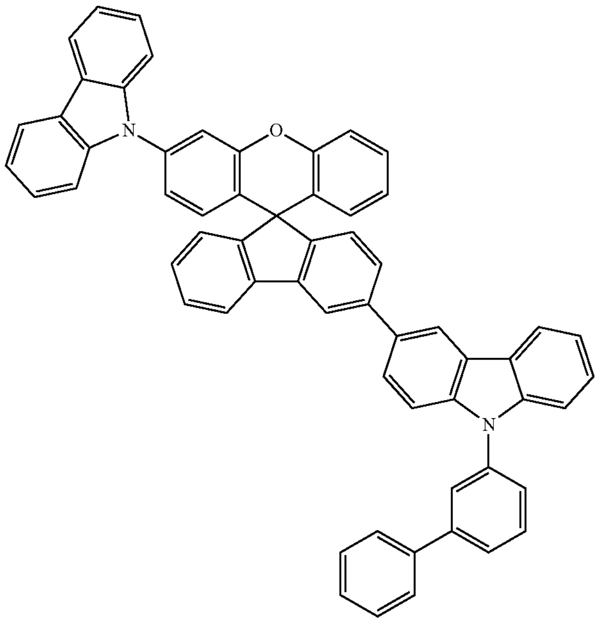
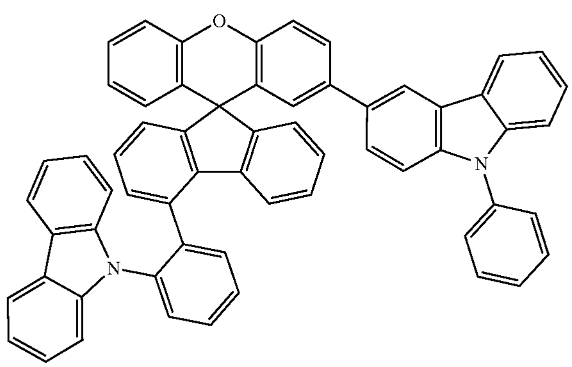
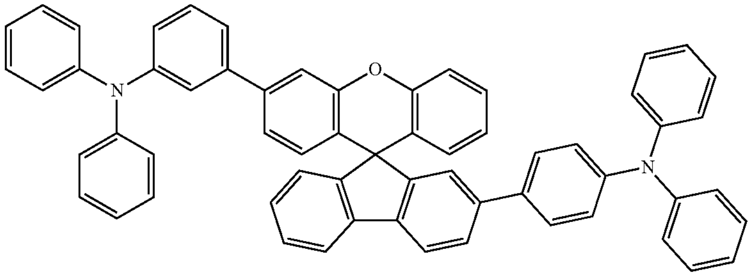

-continued
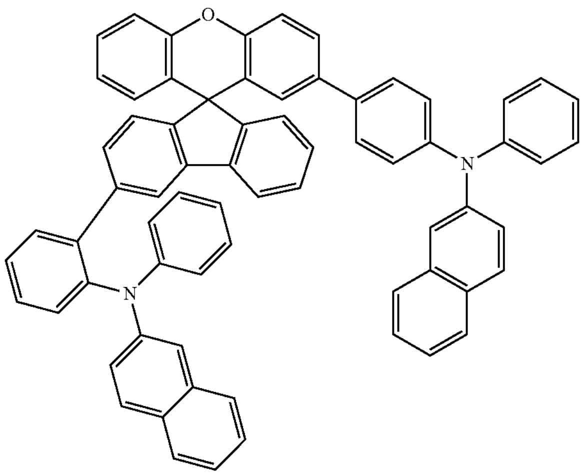
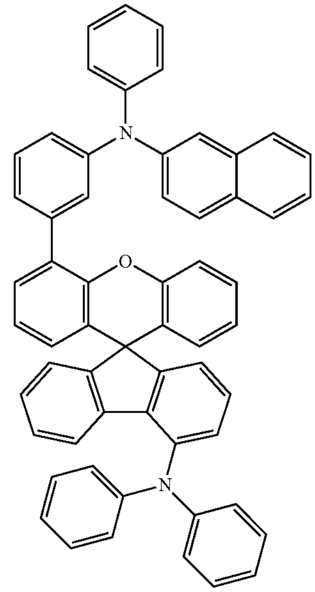
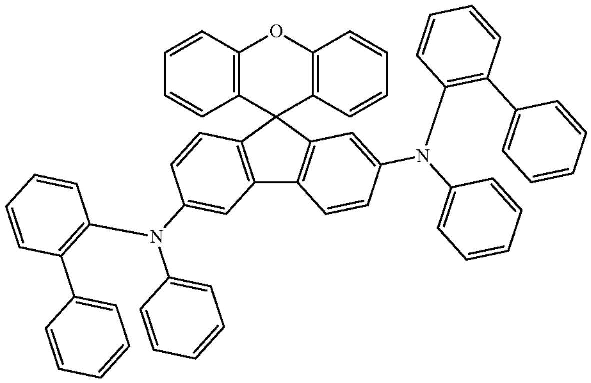
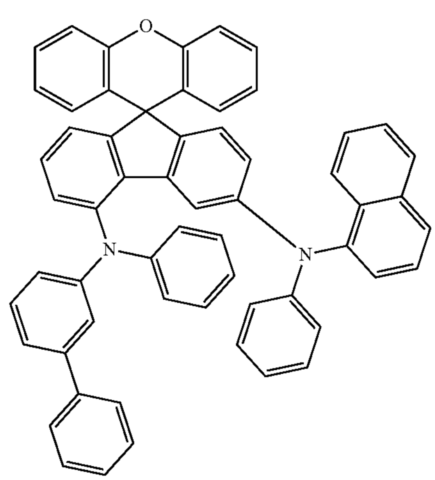

-continued
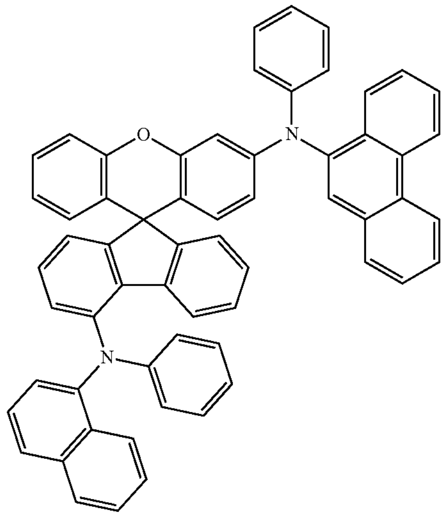
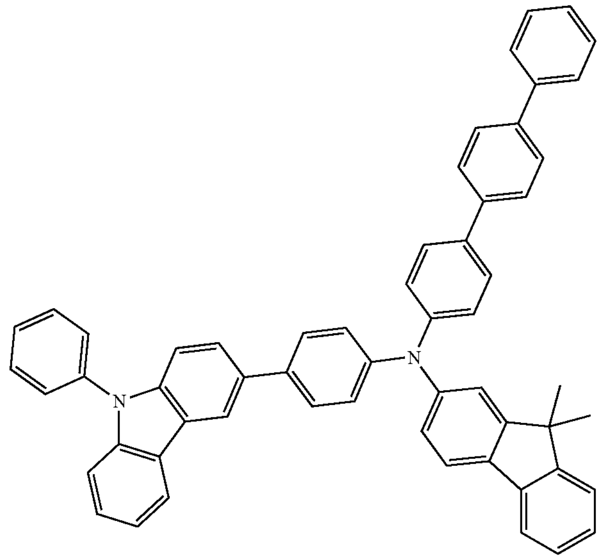
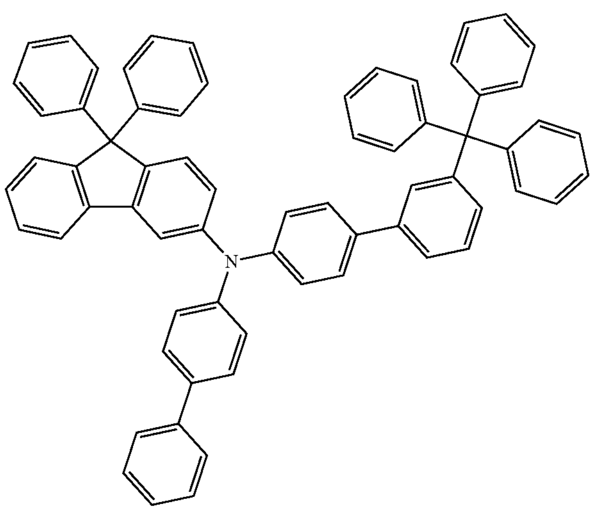
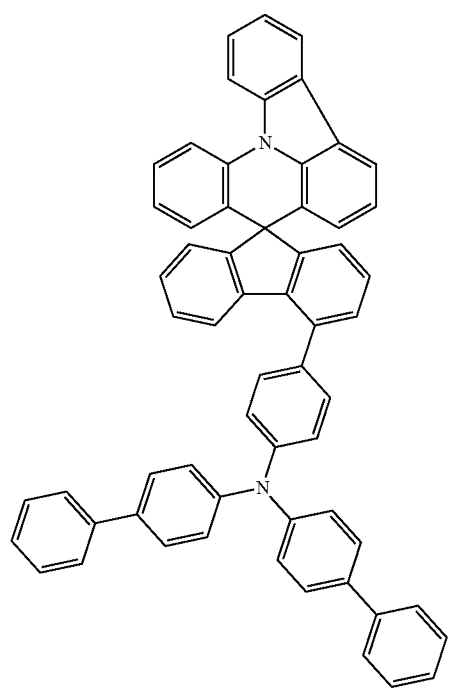

<Group B>
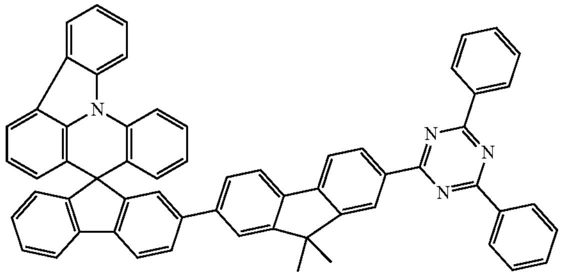
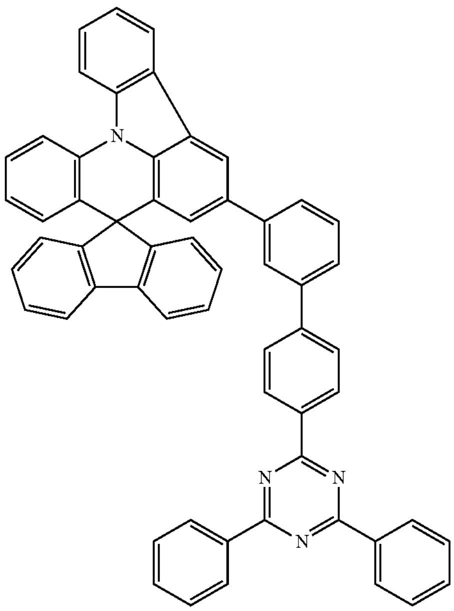
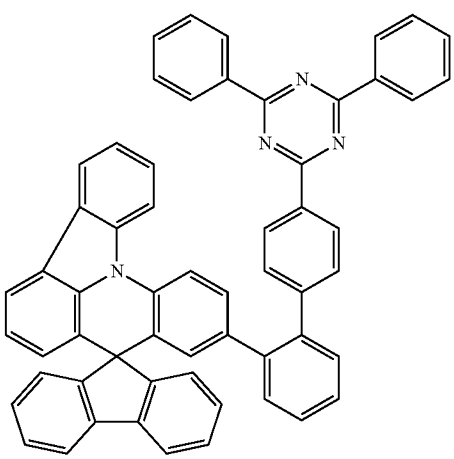
-continued
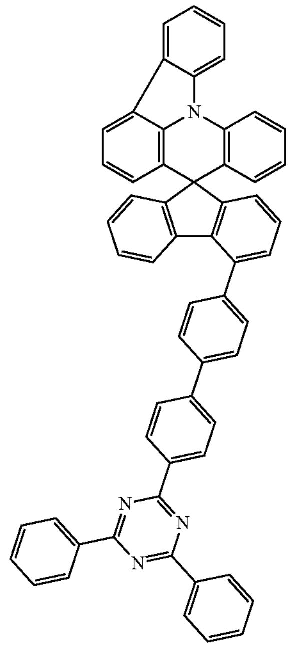
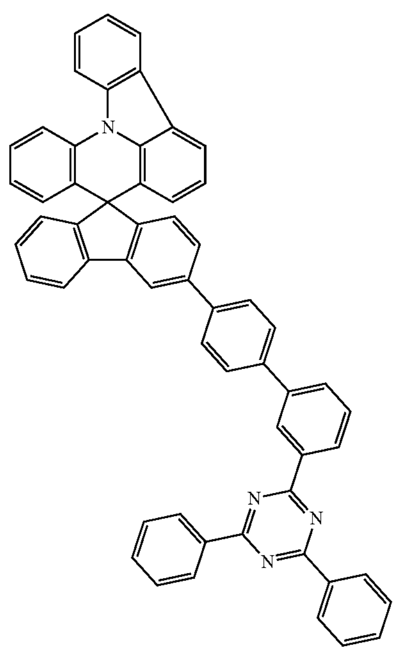

-continued
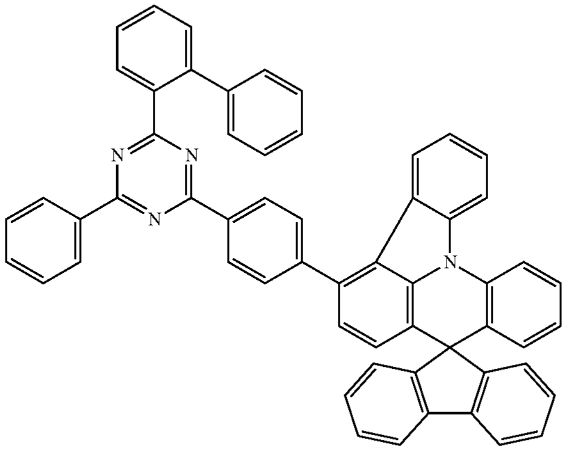
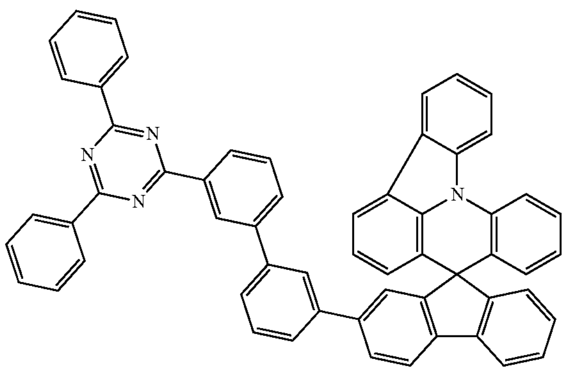
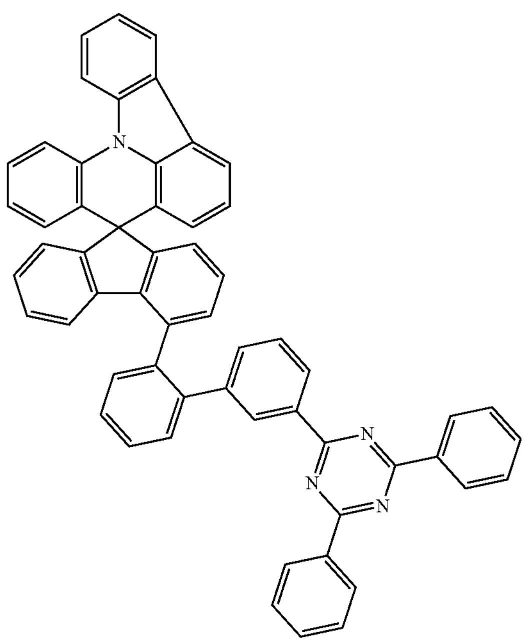
-continued
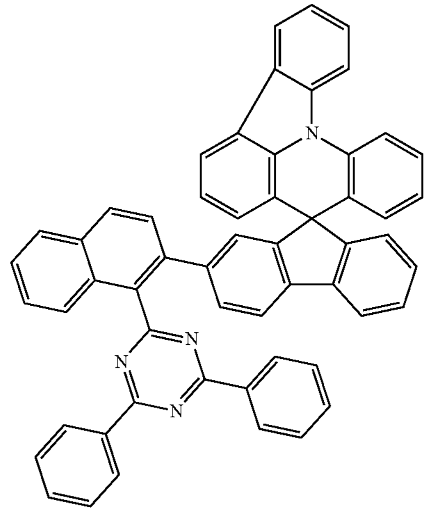
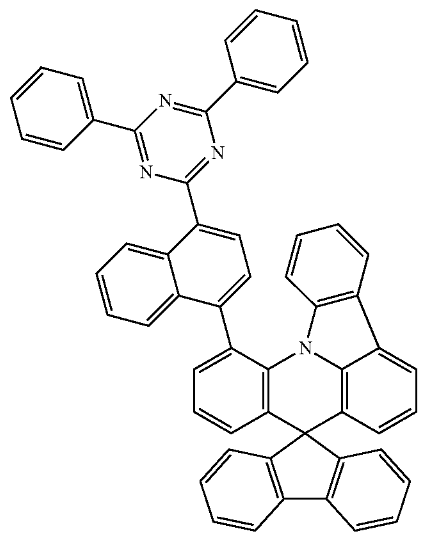
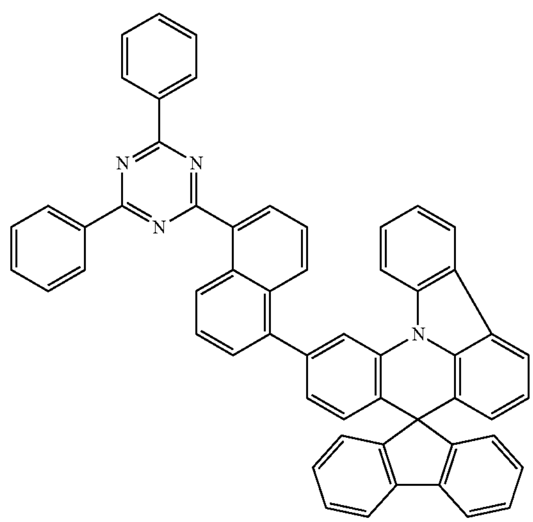

-continued
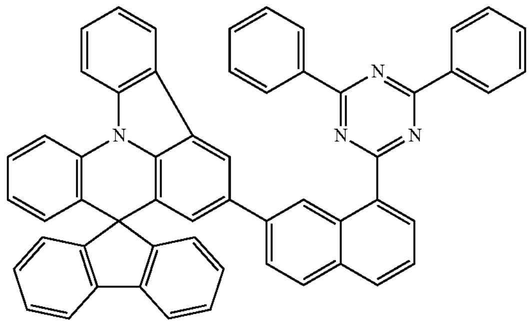
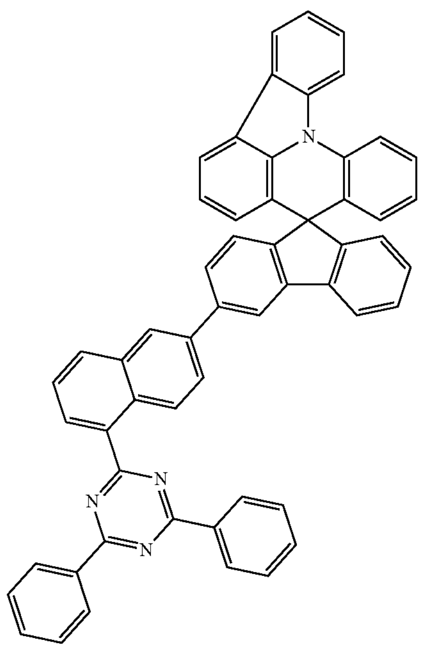
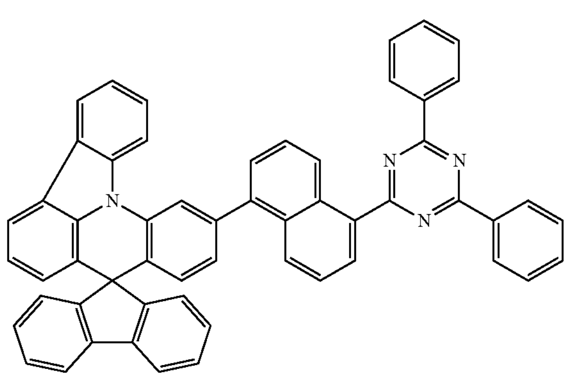
-continued
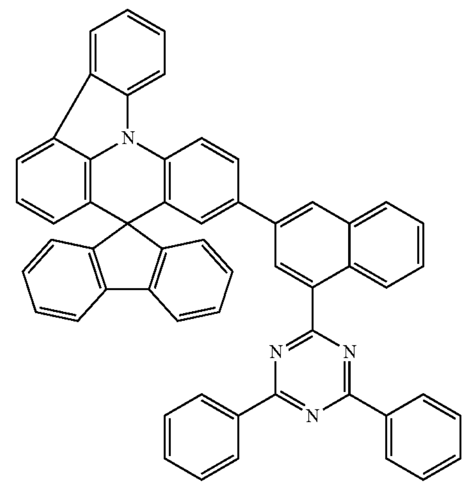
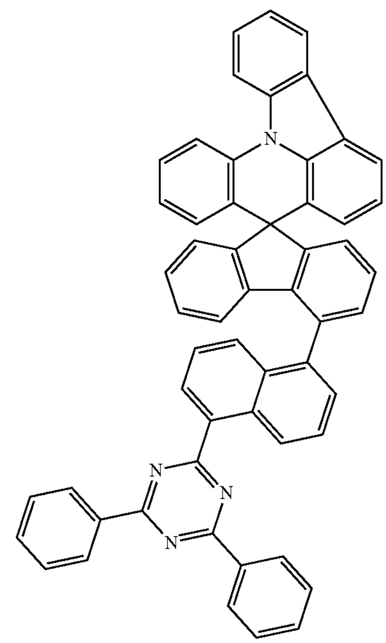
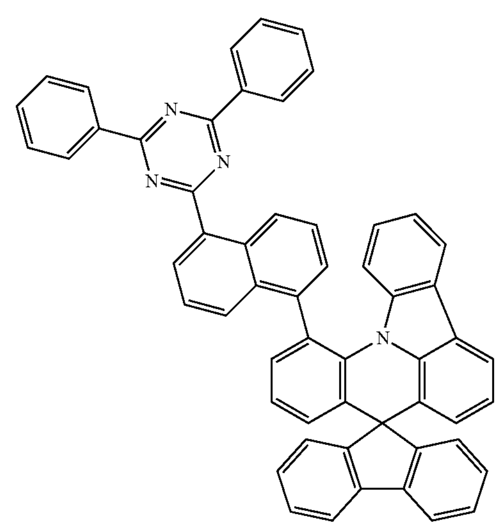

-continued
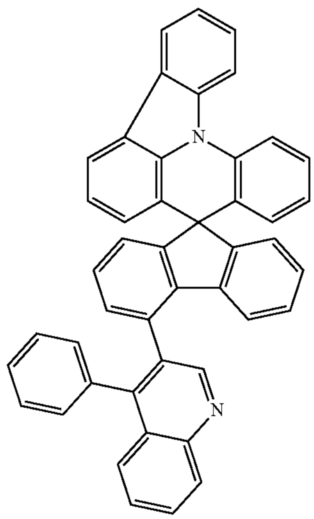
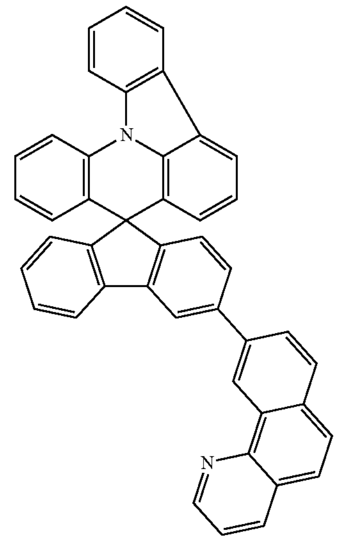
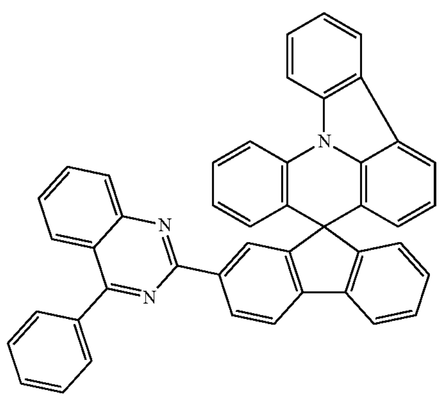
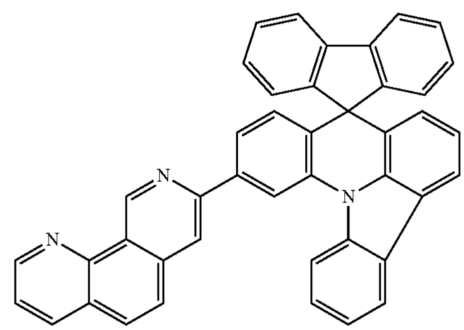
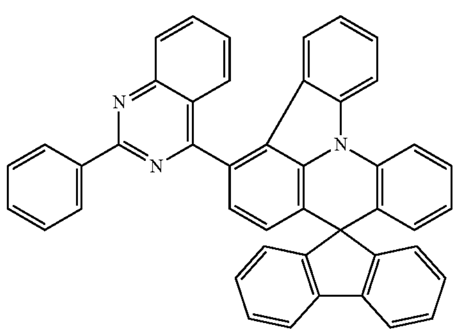
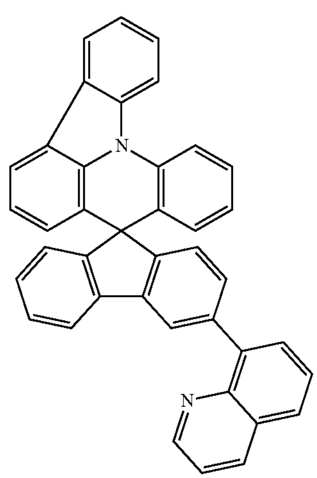
-continued

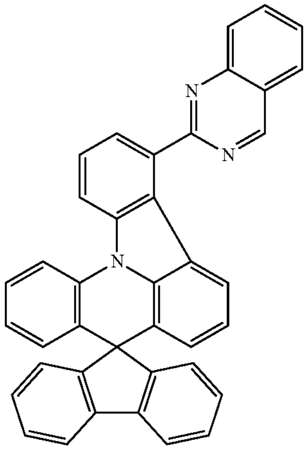
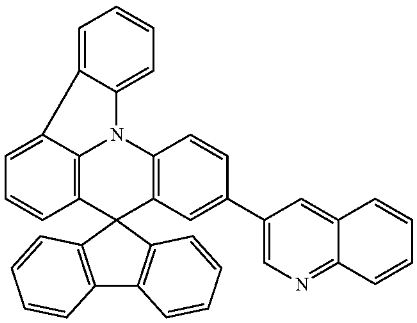
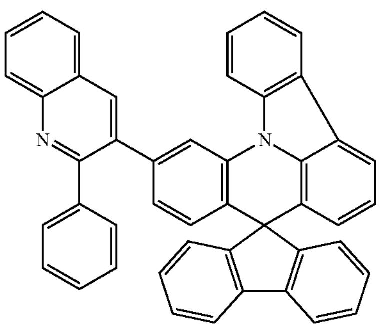
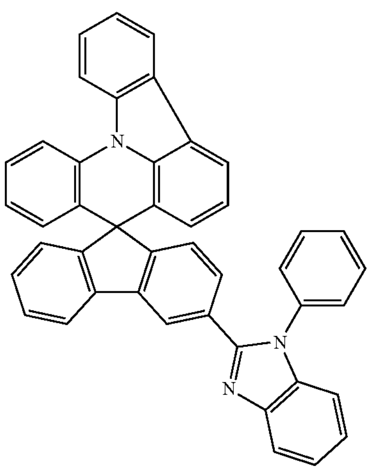
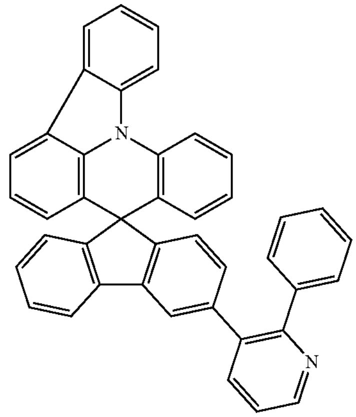
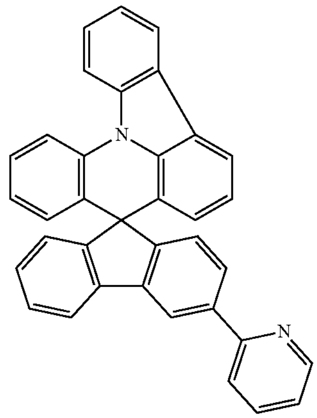
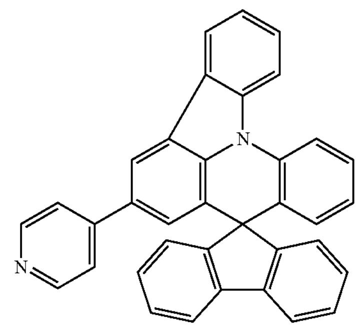
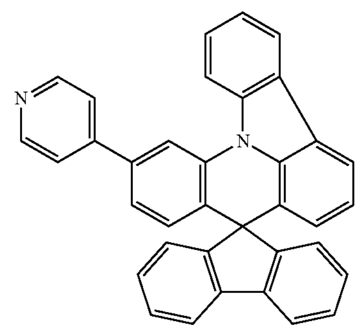

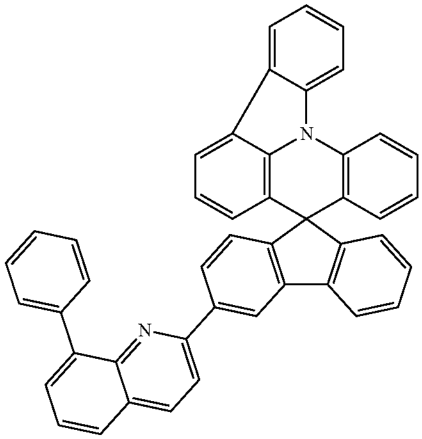
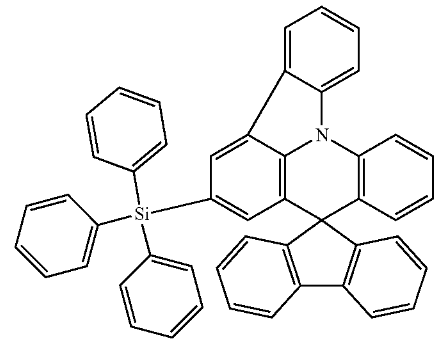
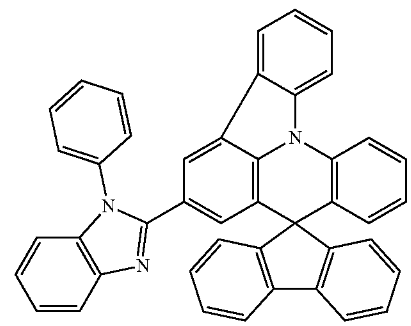
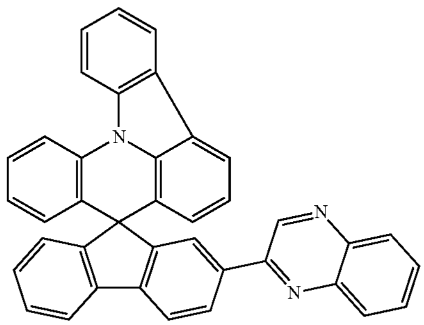
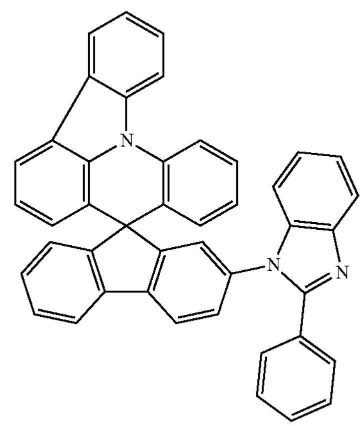
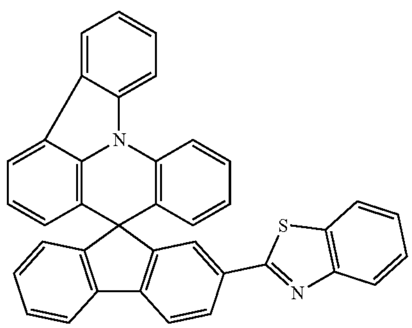
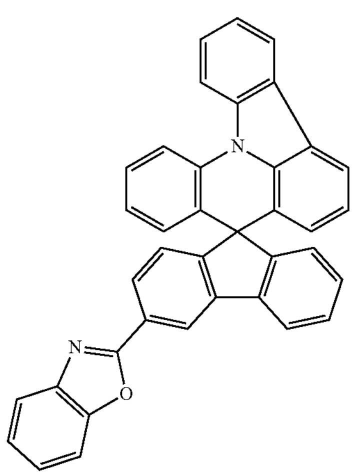
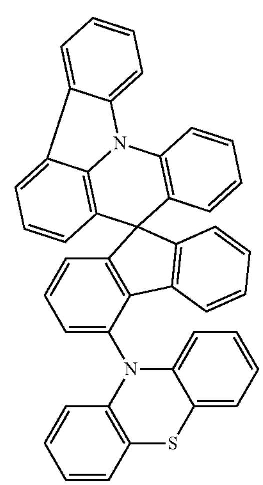

-continued
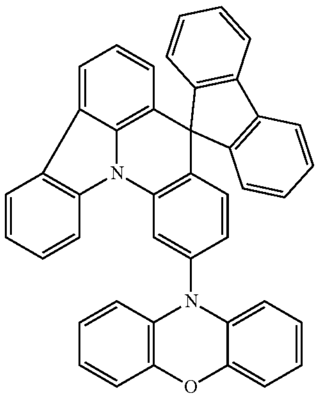
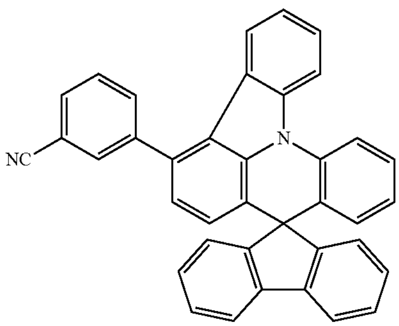
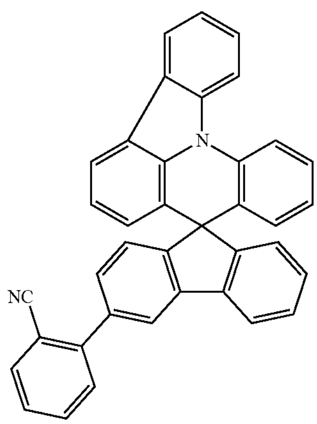
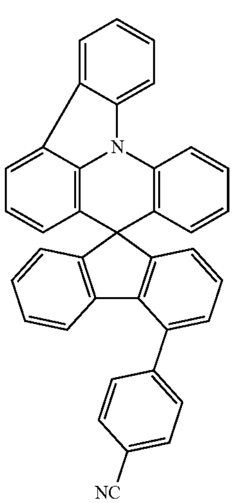
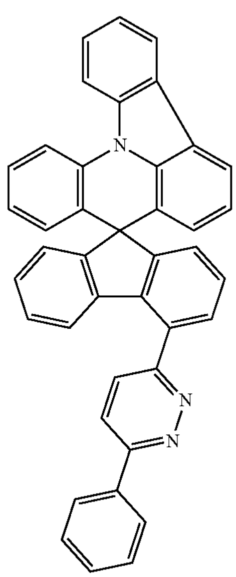
-continued
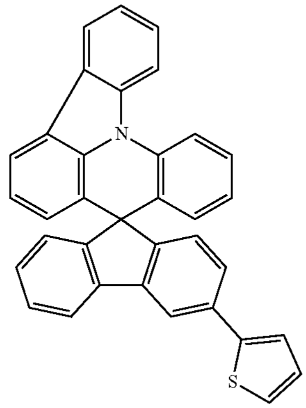
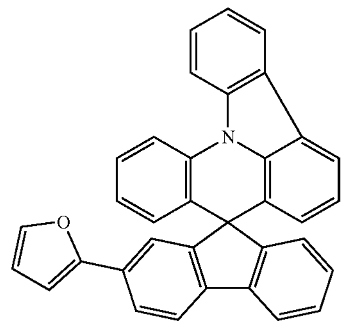
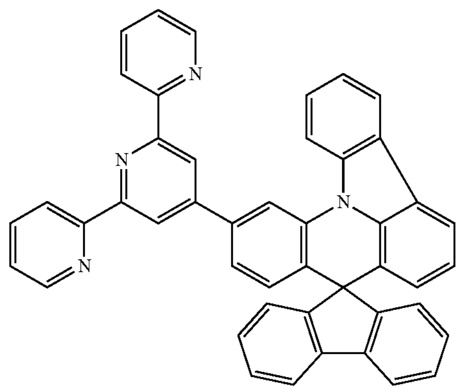
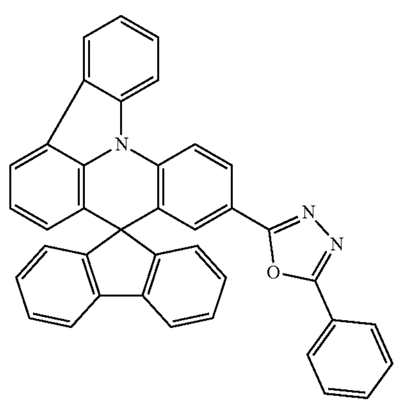

-continued
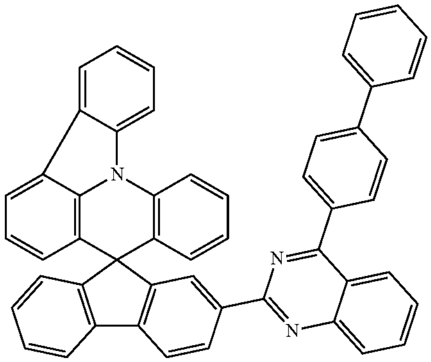
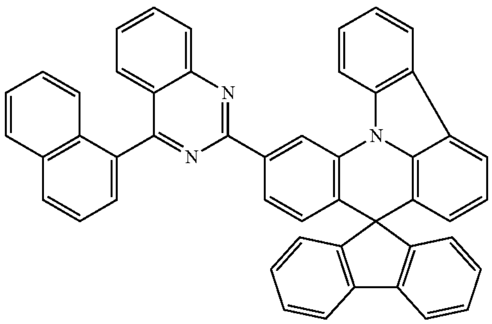
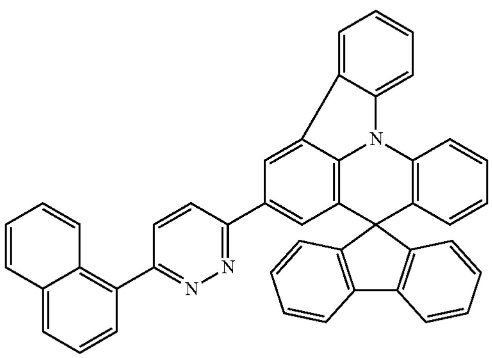
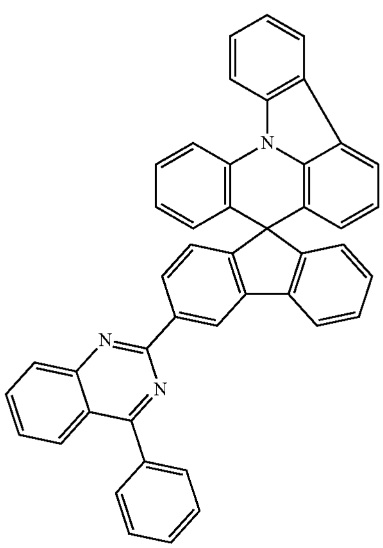
-continued
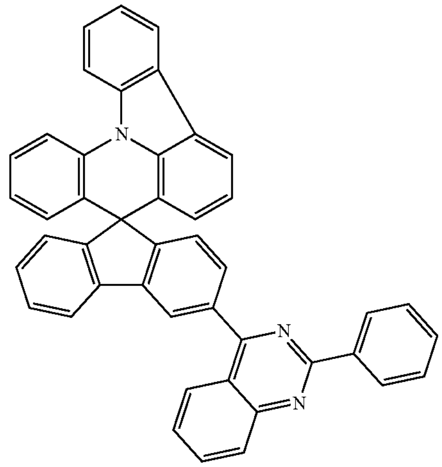
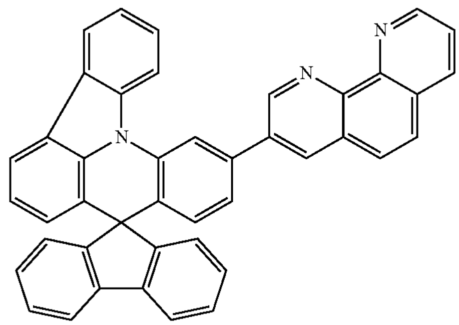
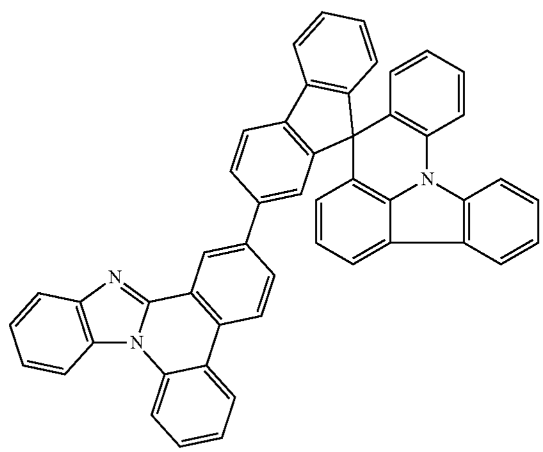
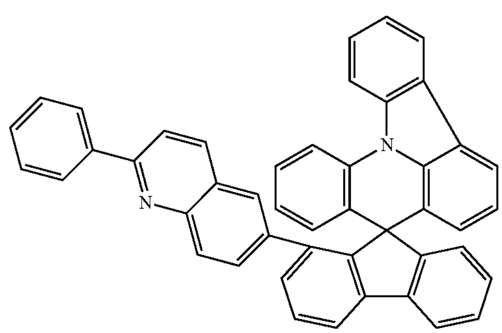

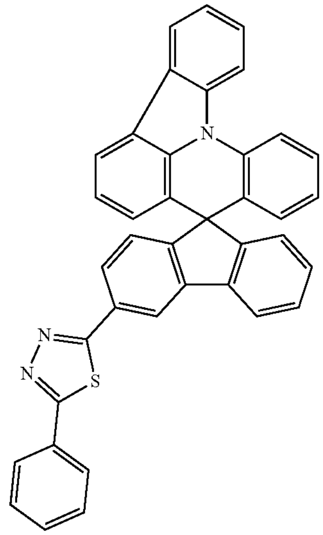
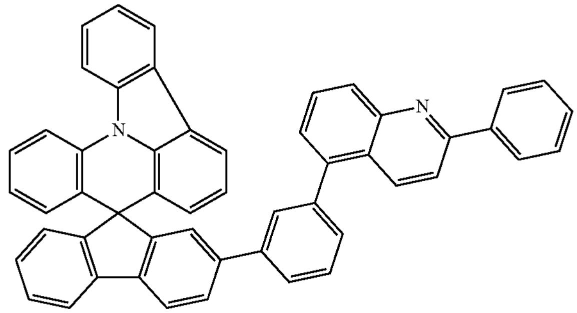
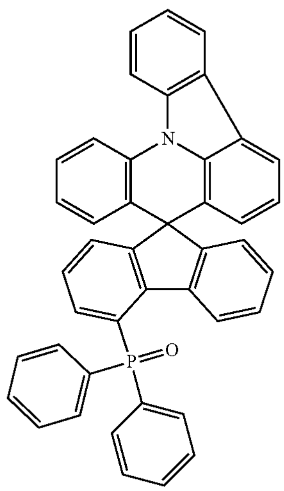
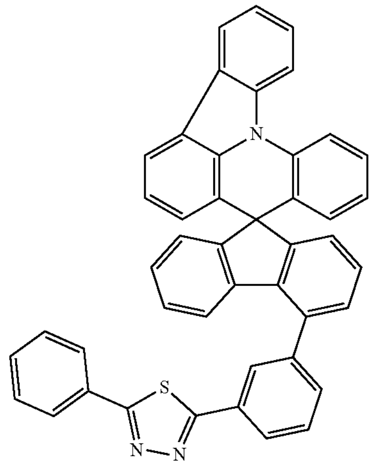
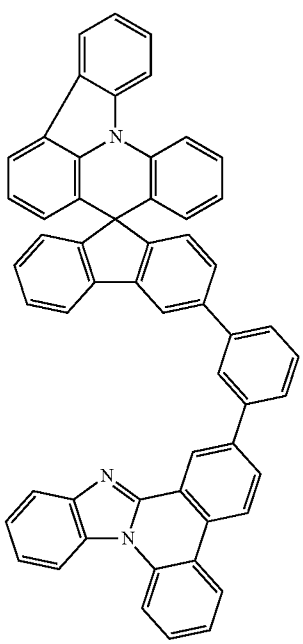
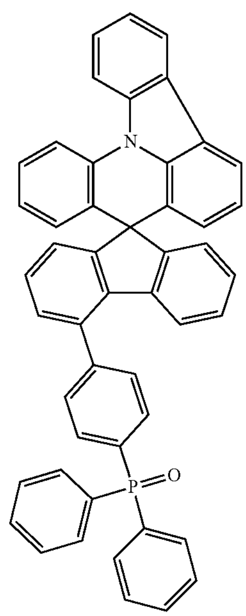

-continued
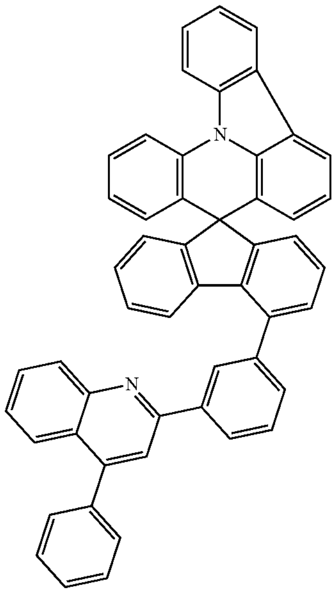
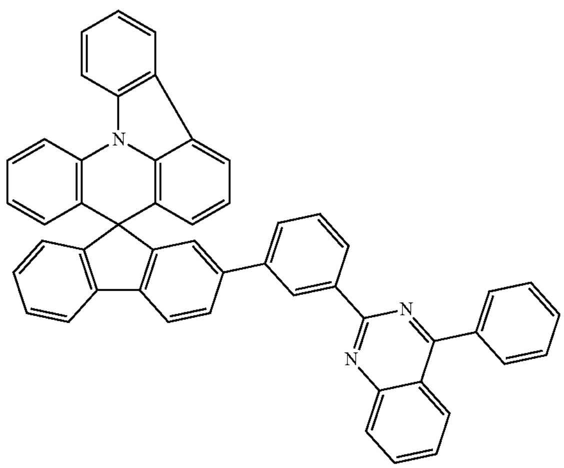
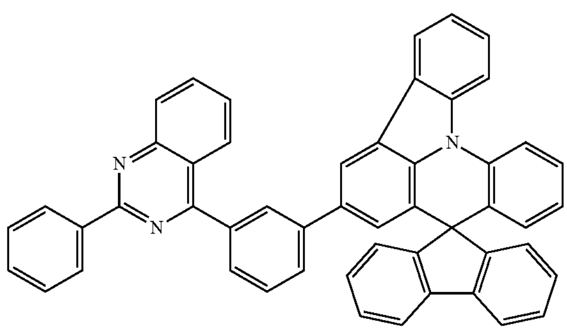
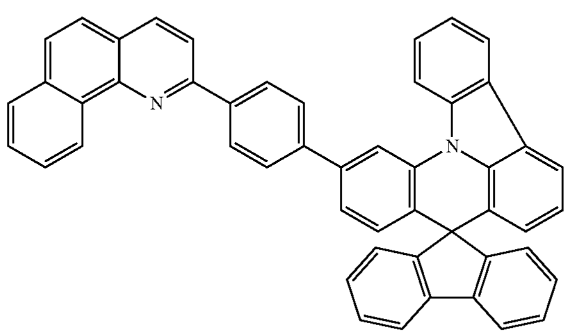
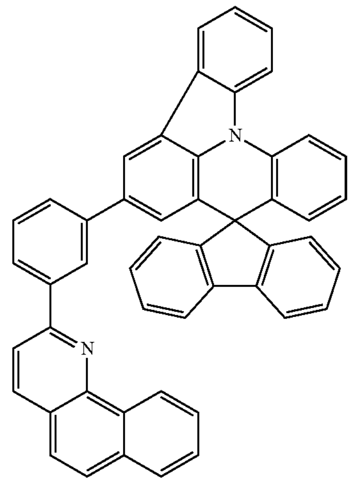
-continued
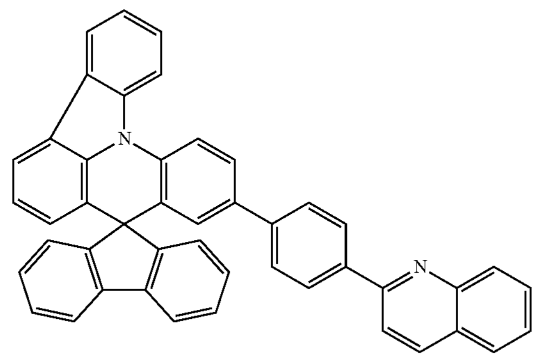
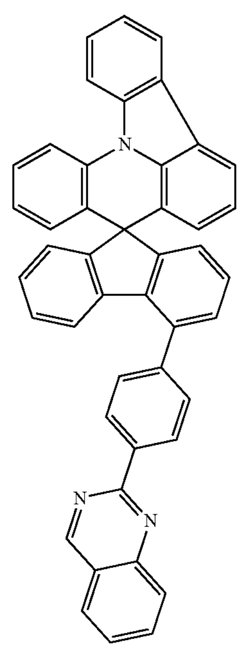

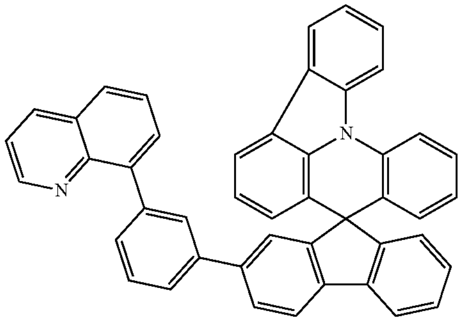
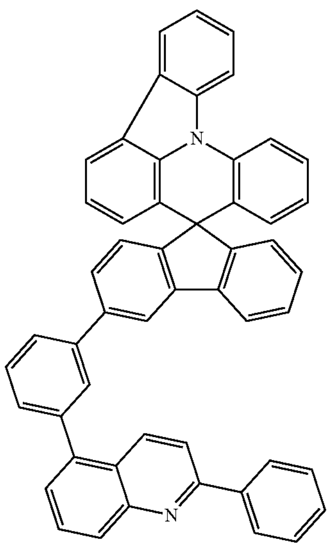
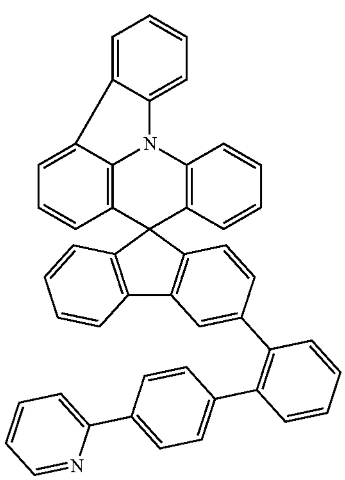
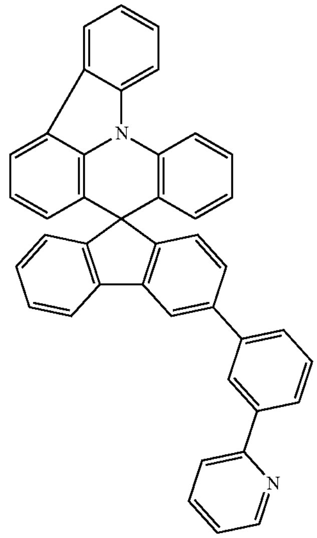
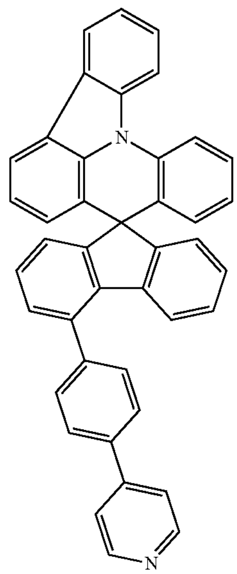
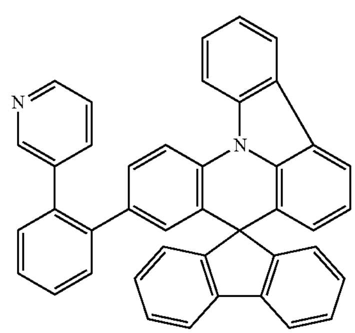

-continued
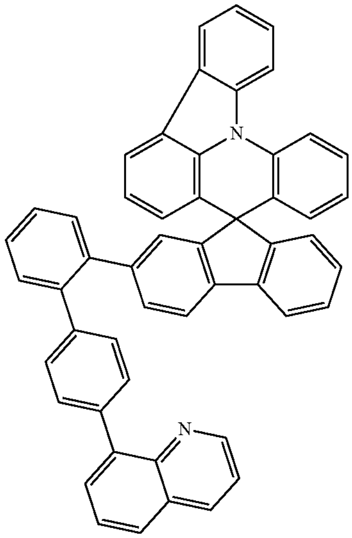
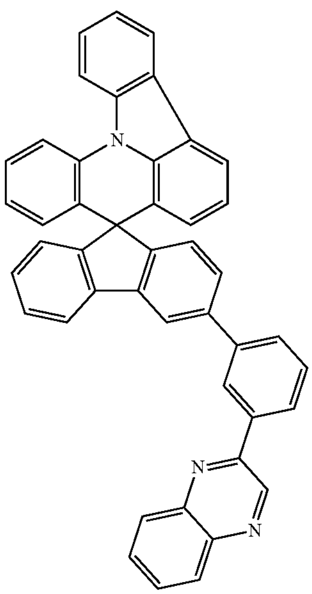
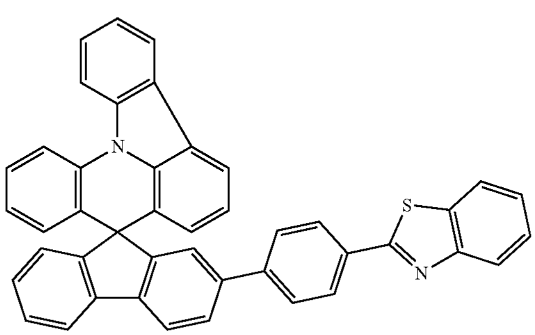
-continued
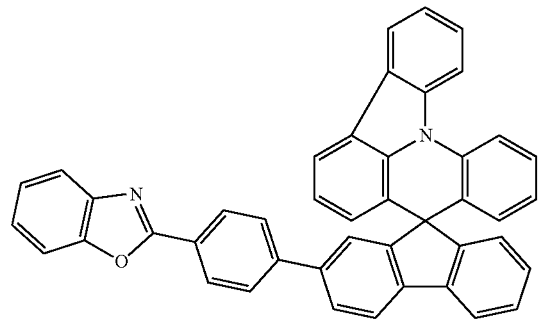
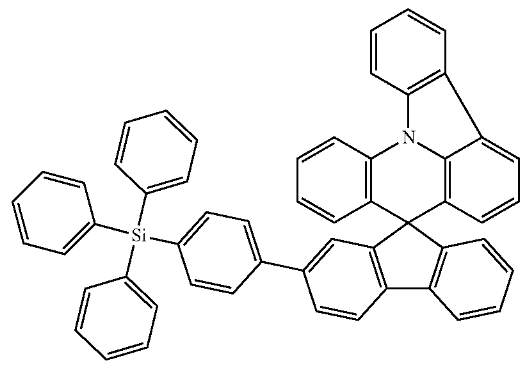
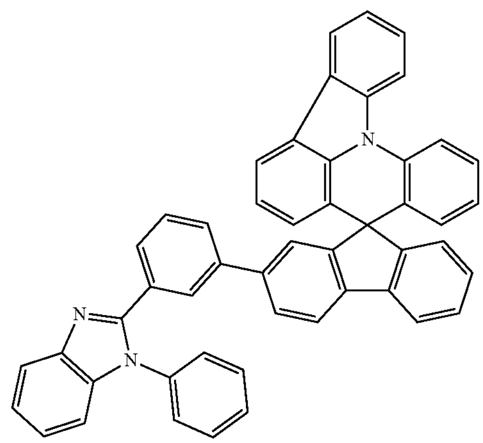
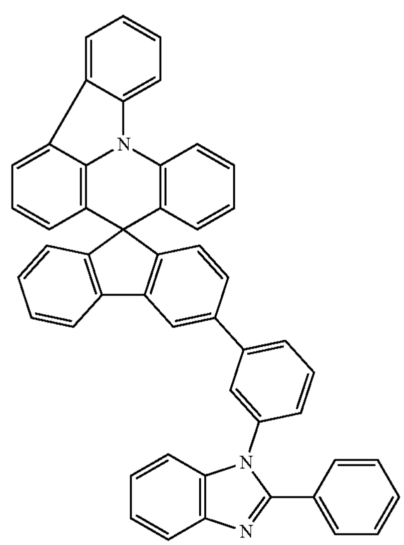

-continued
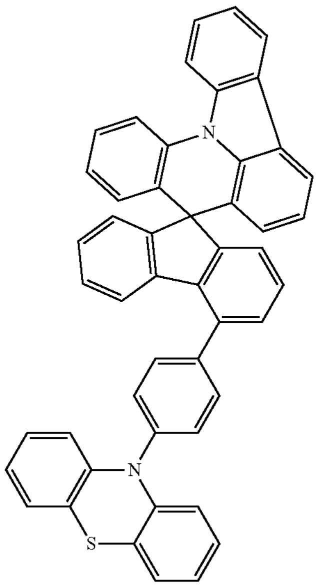
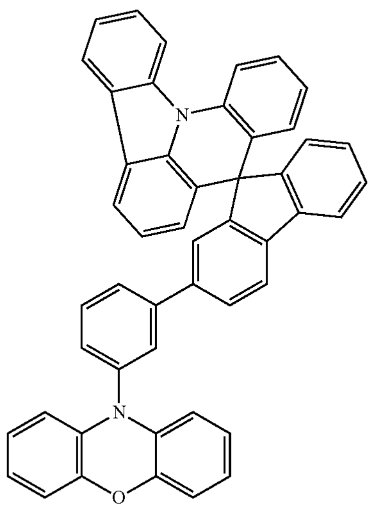
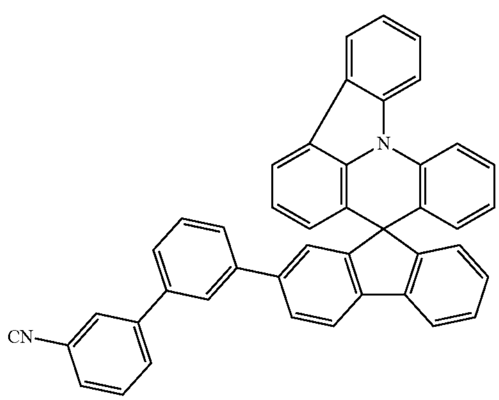
-continued
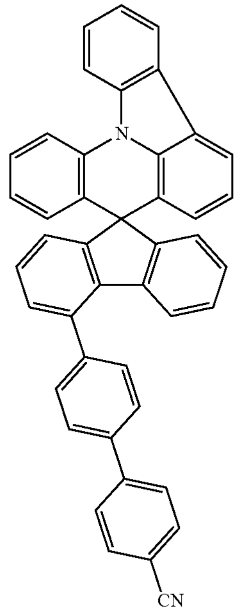
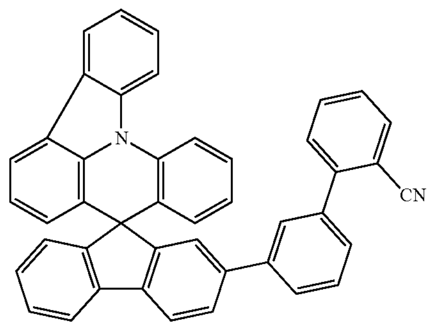
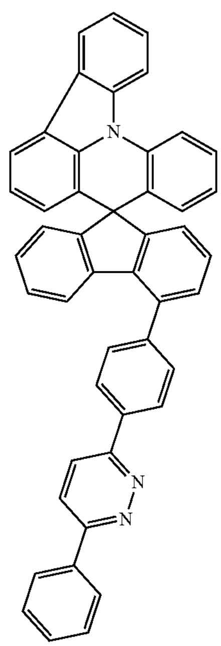
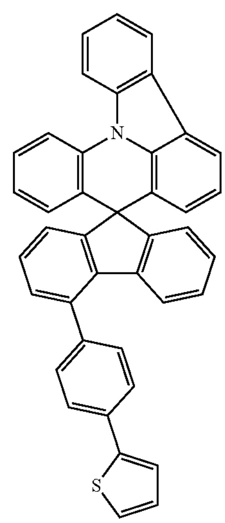

-continued
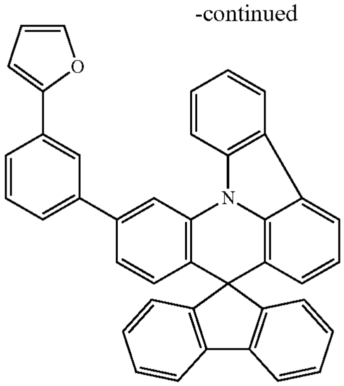
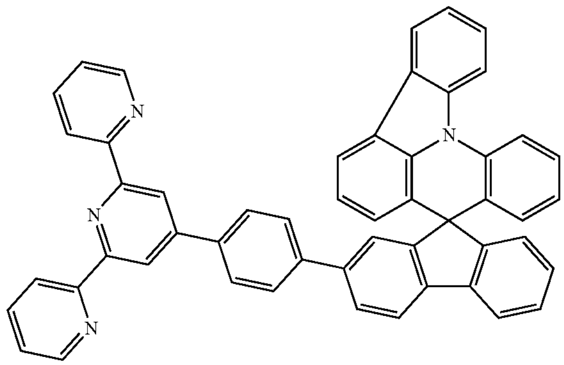
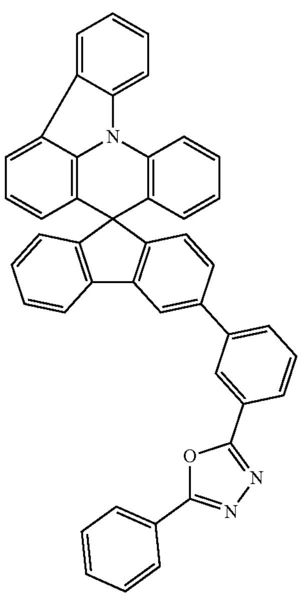
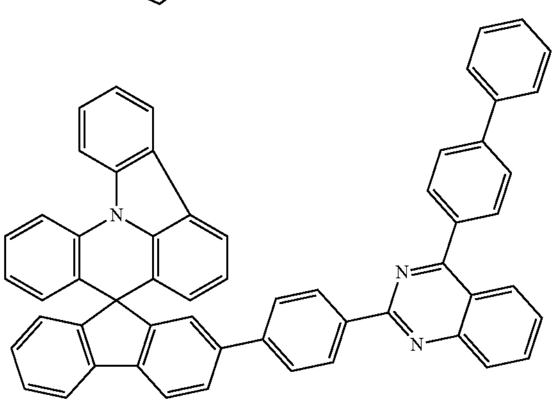
-continued
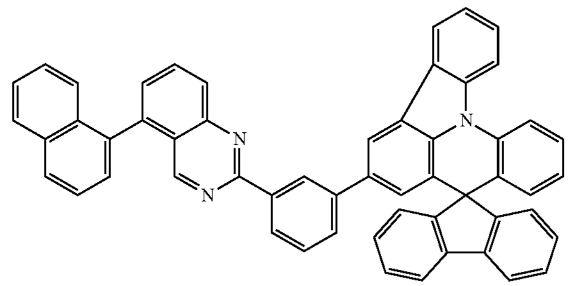
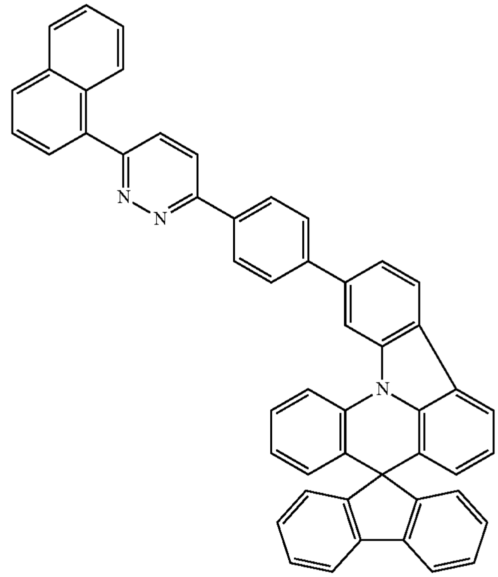
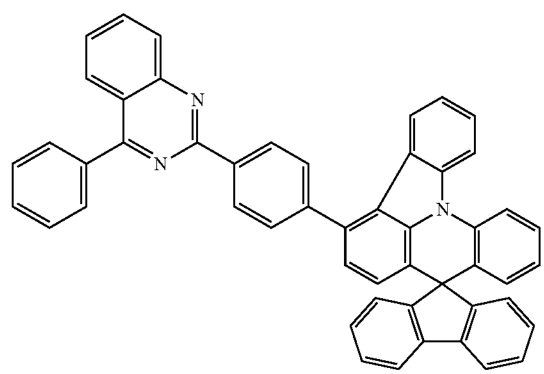

-continued
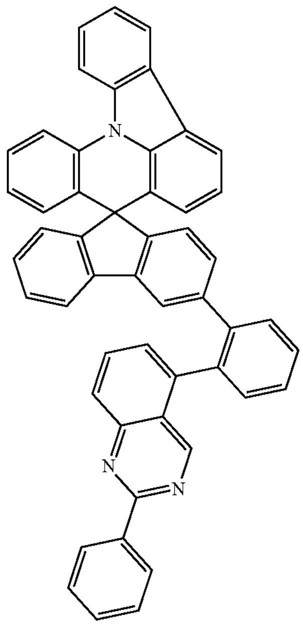
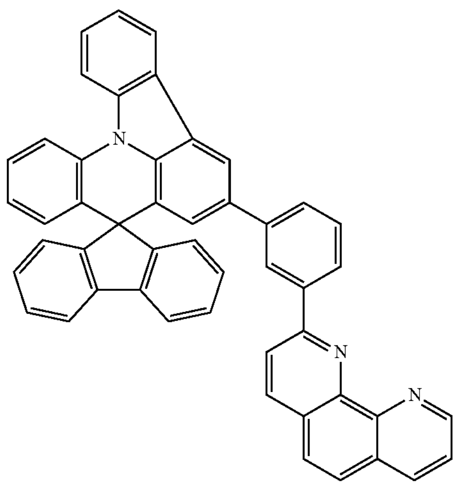
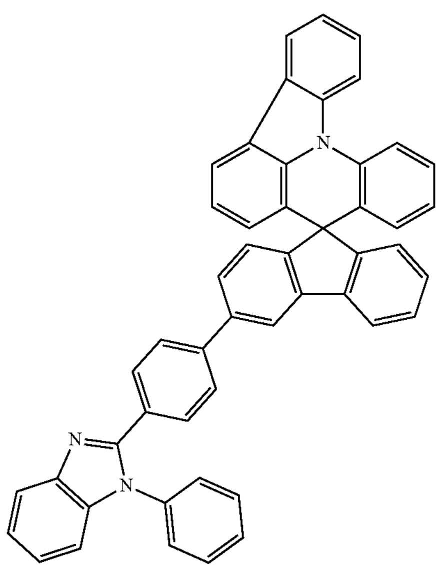
-continued
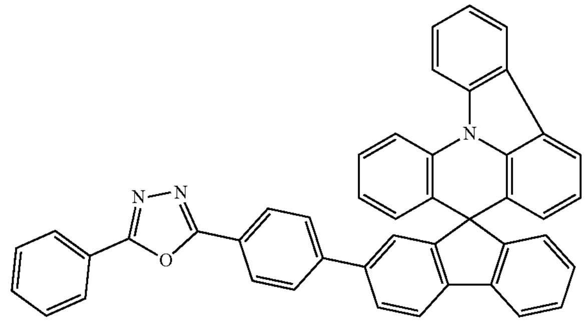
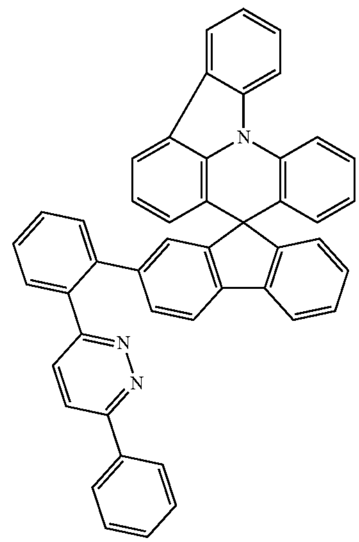
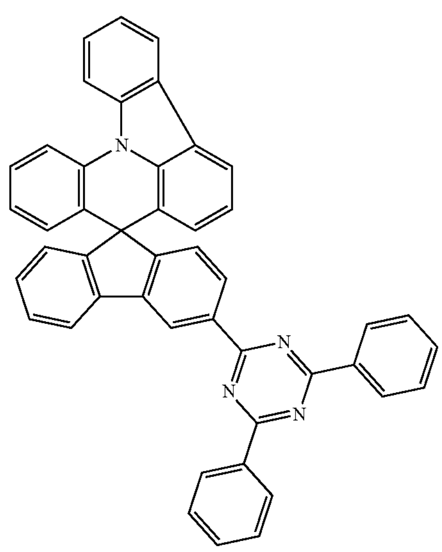

-continued
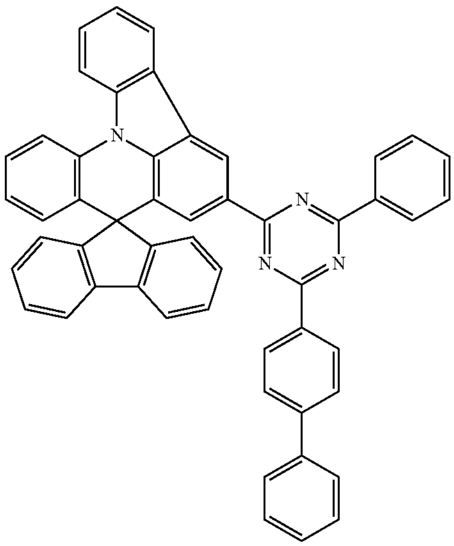
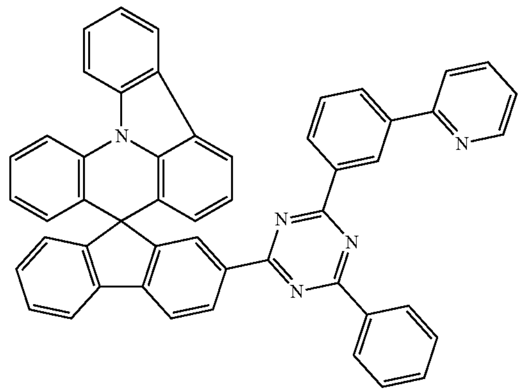
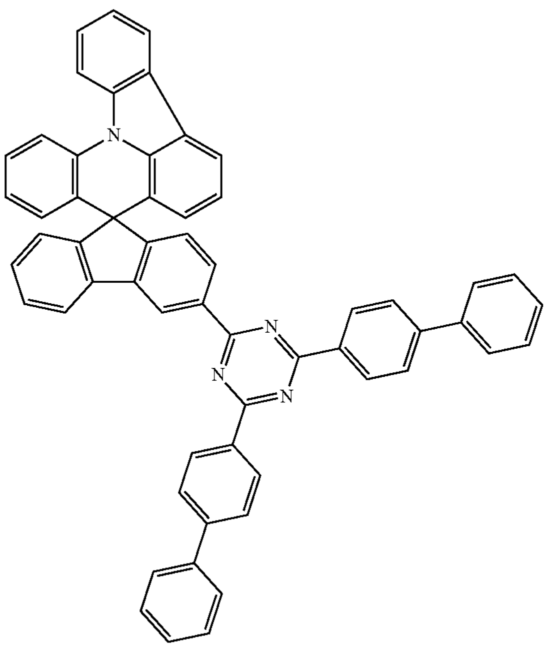
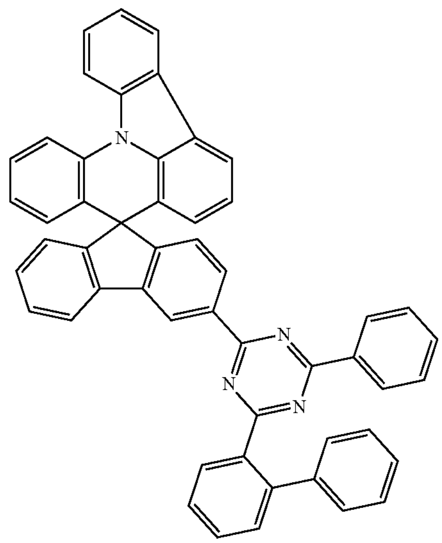
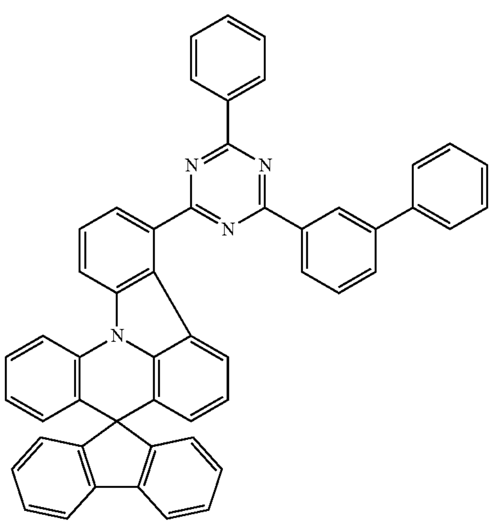
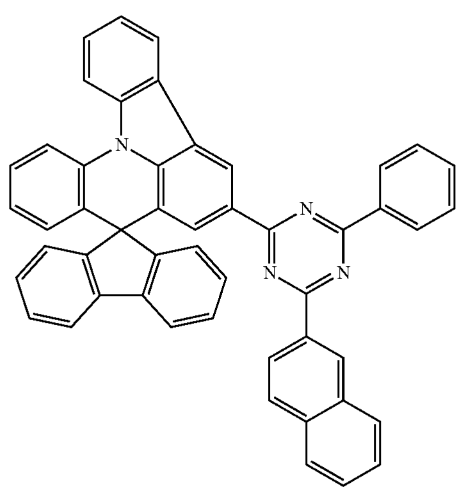
-continued -continued
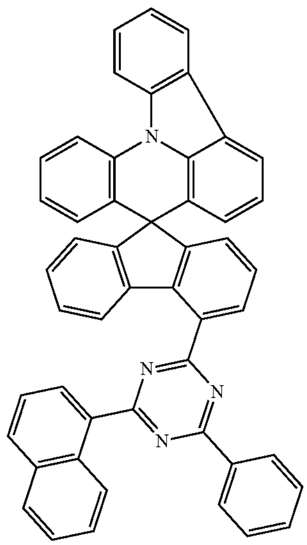
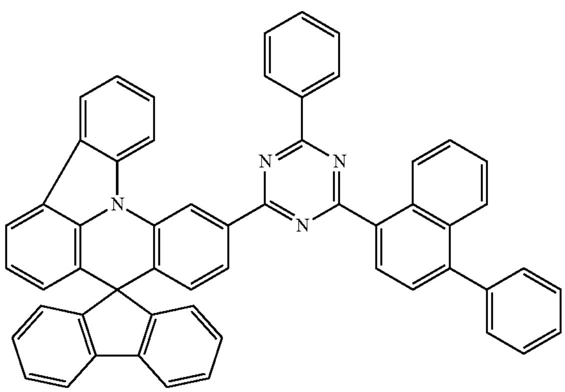
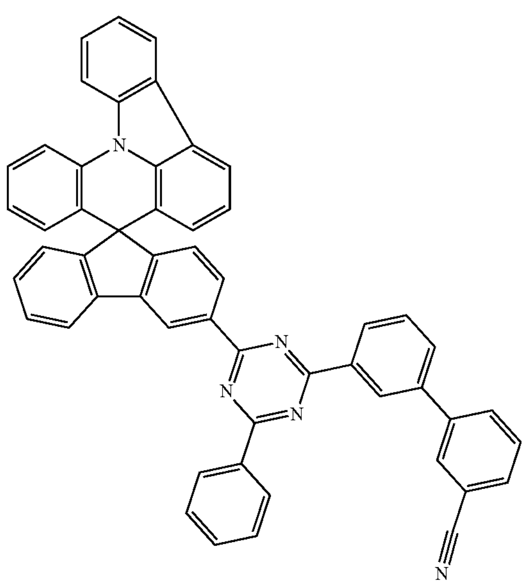
-continued
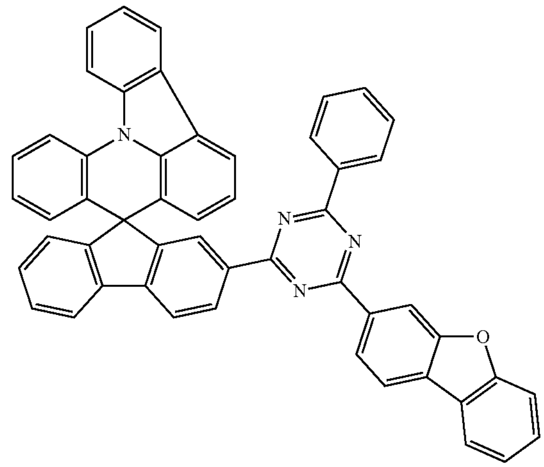
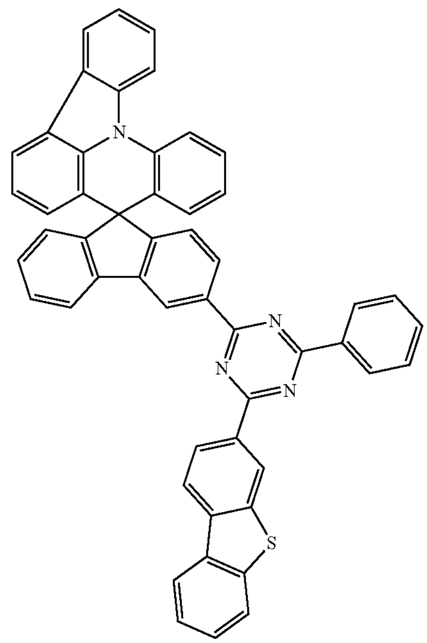
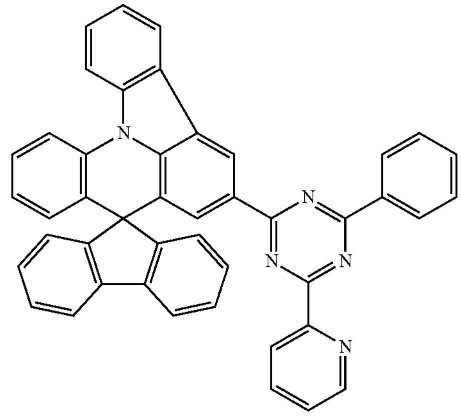

-continued
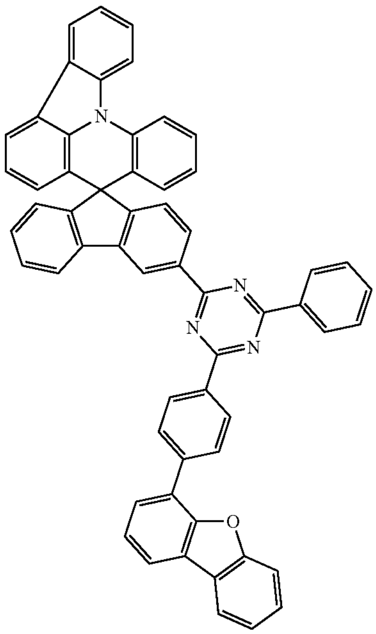
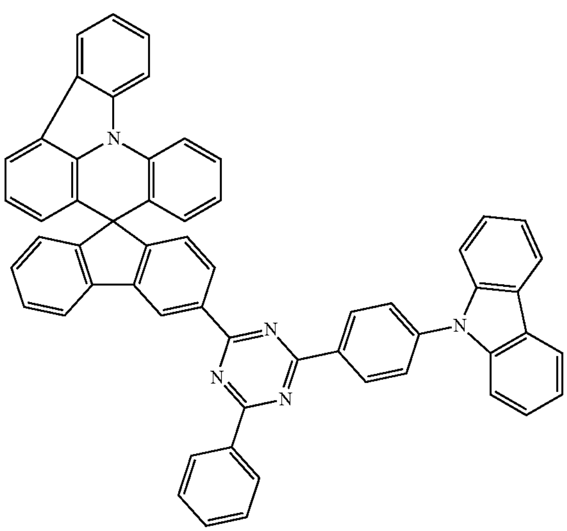
-continued
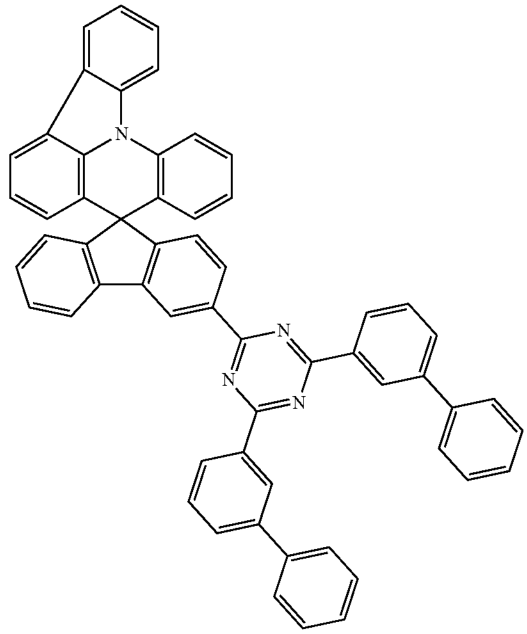
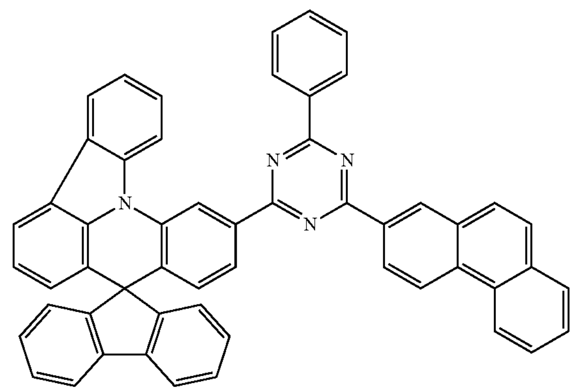
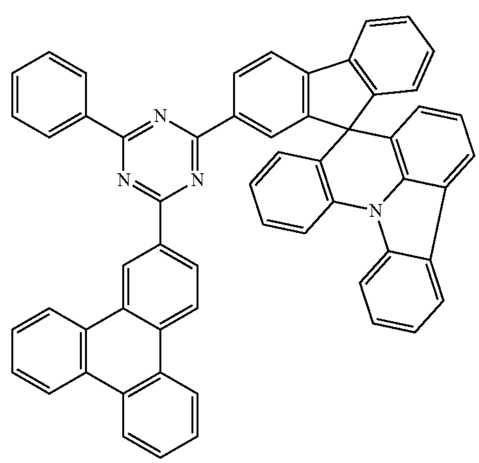

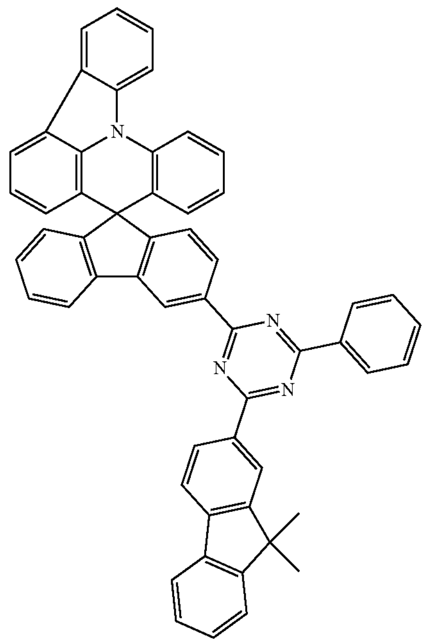
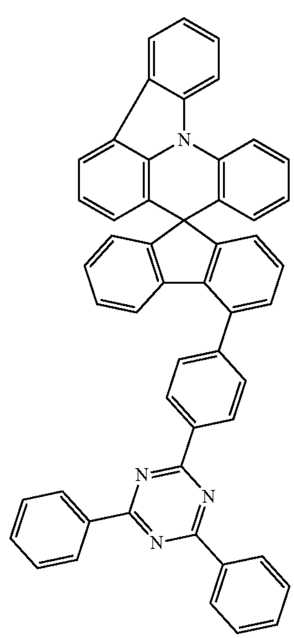
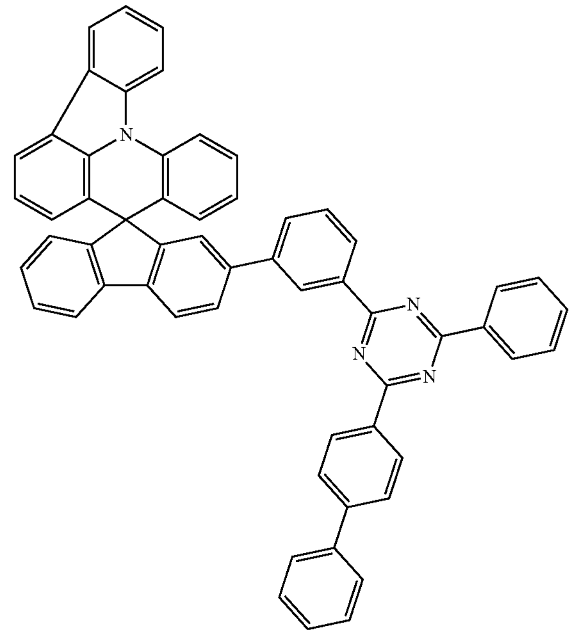
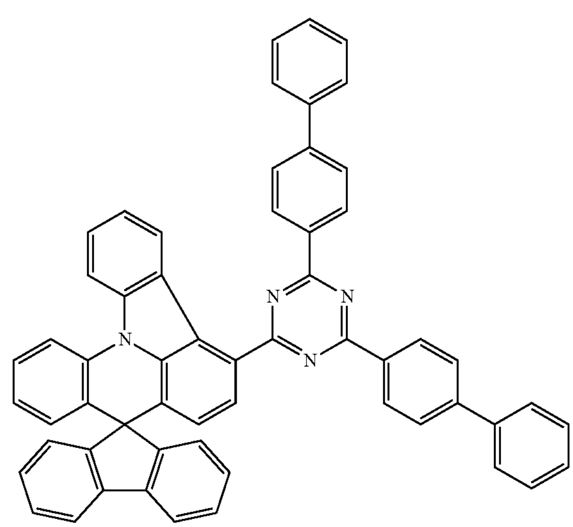

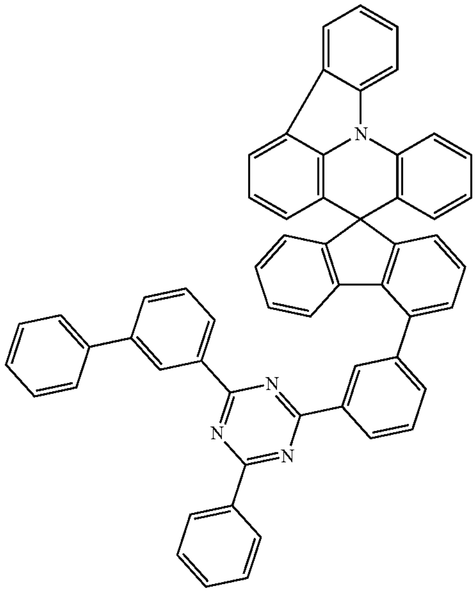
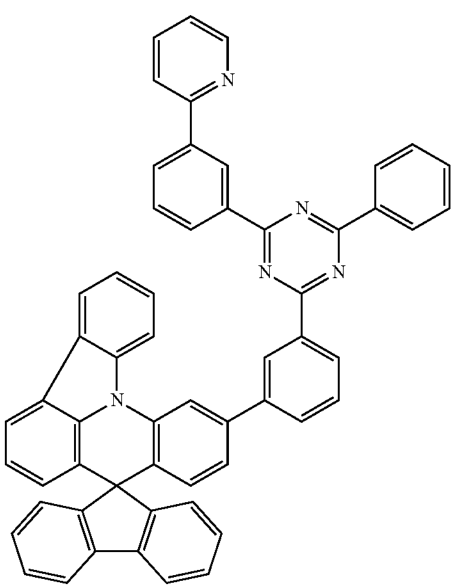
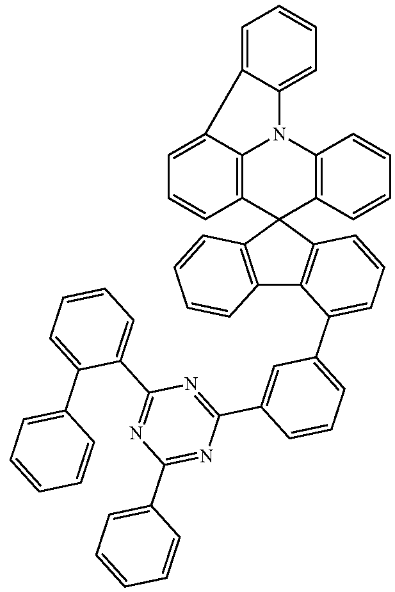
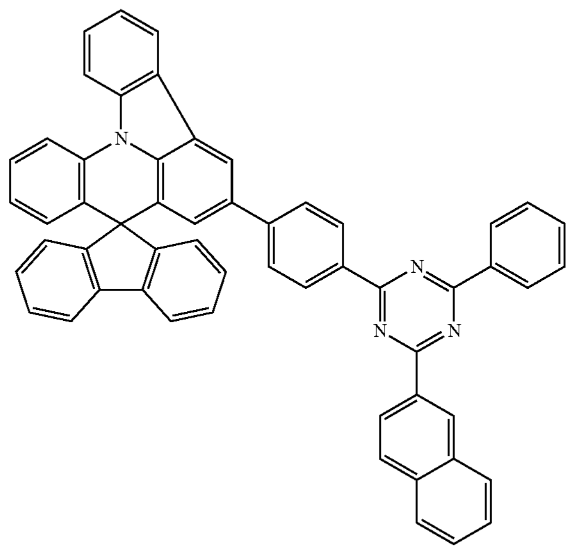
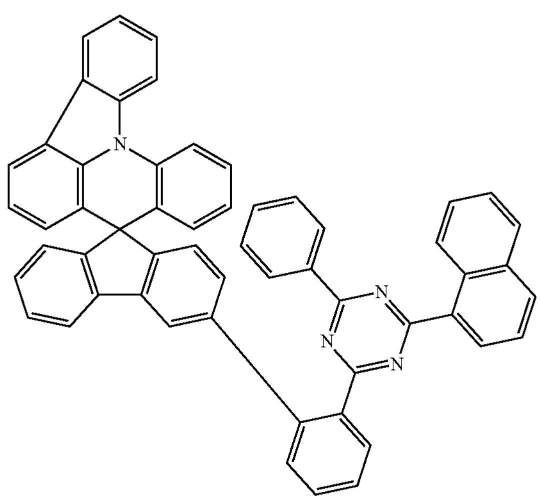
N
N
N
N

-continued
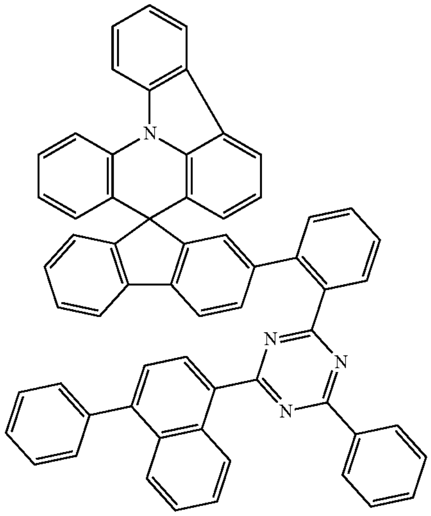
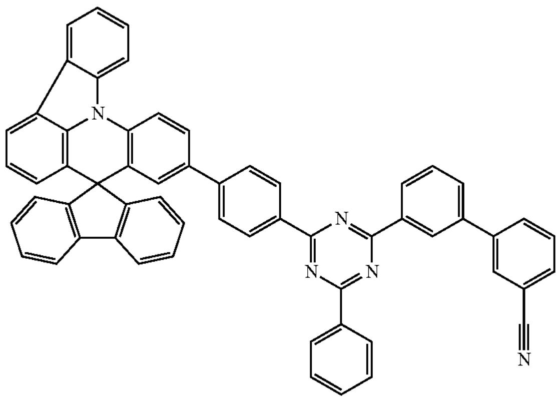
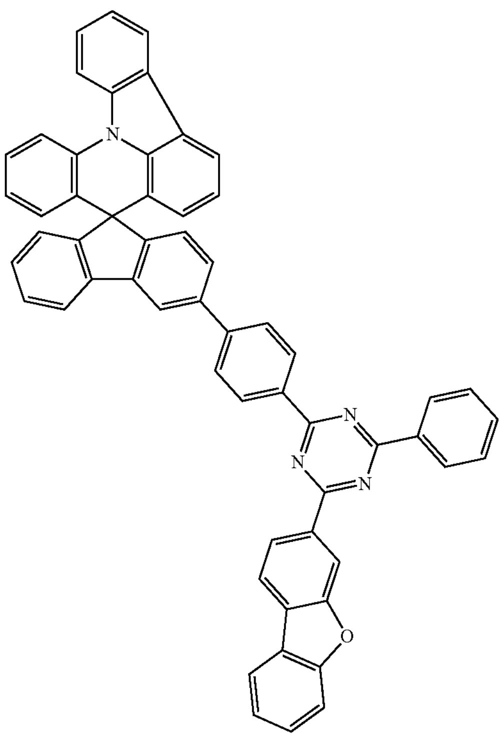
-continued
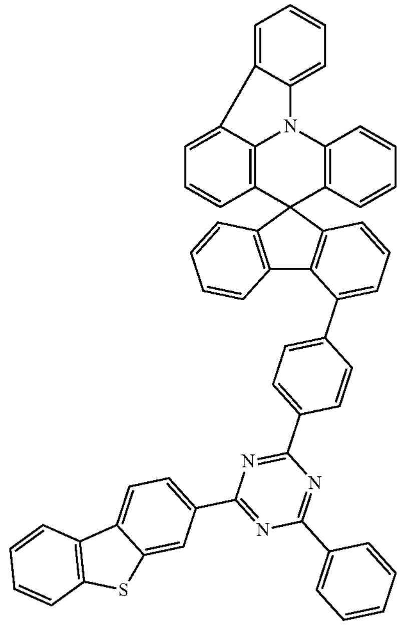
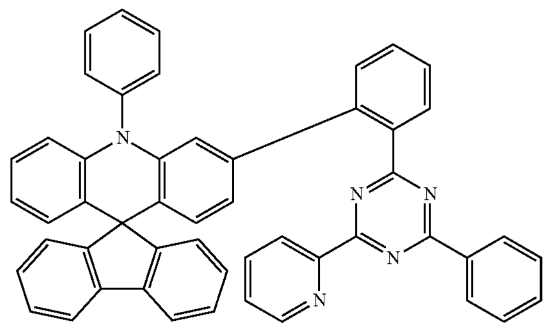
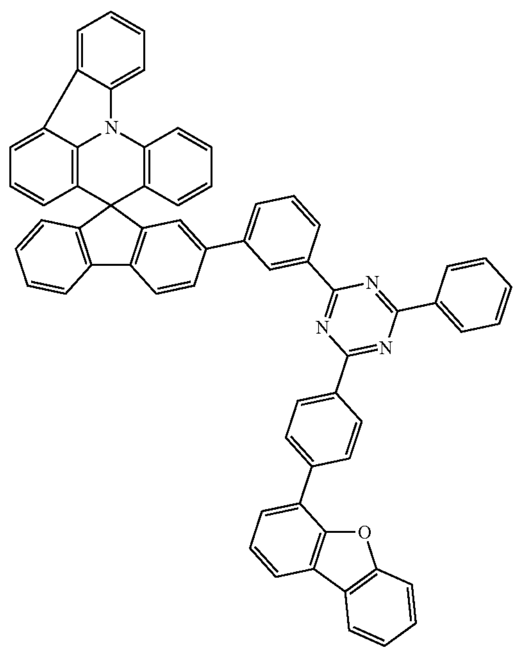

-continued
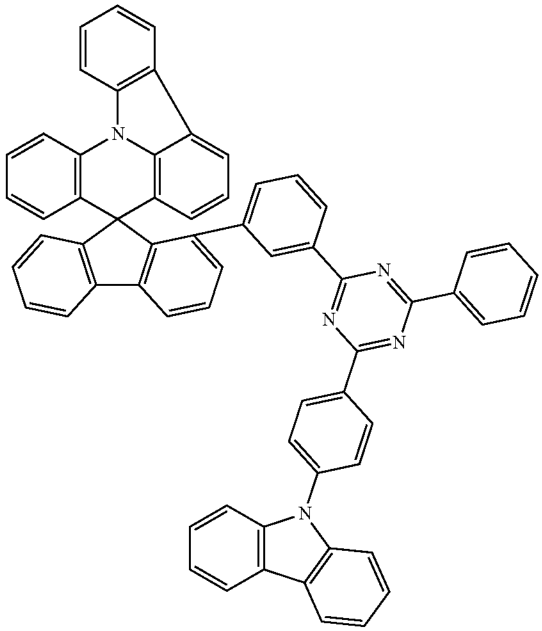
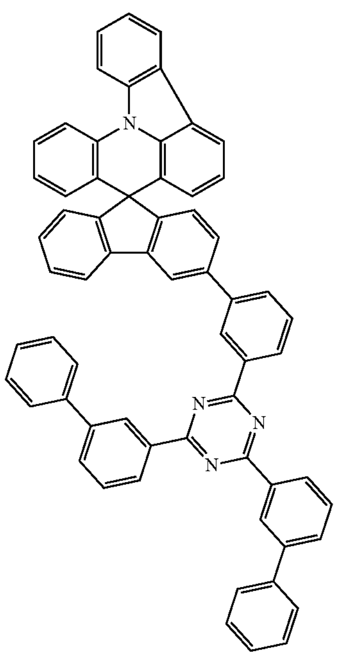
-continued
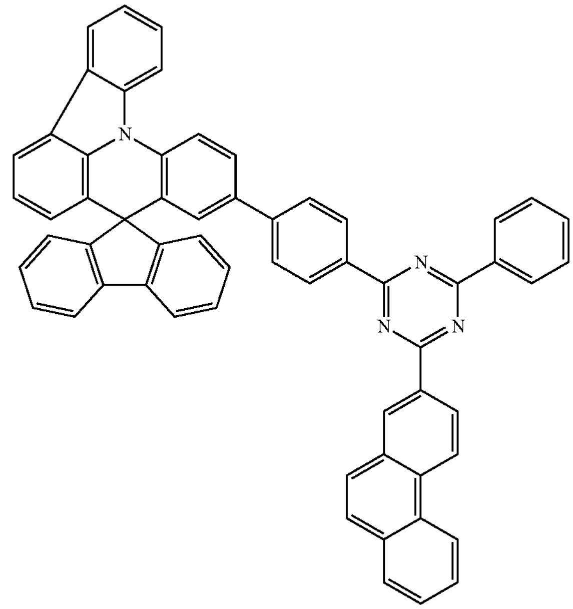
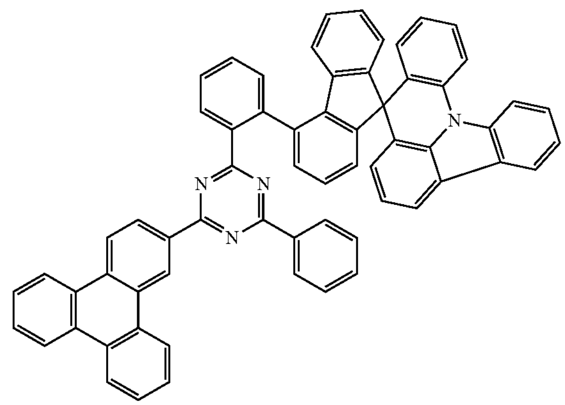
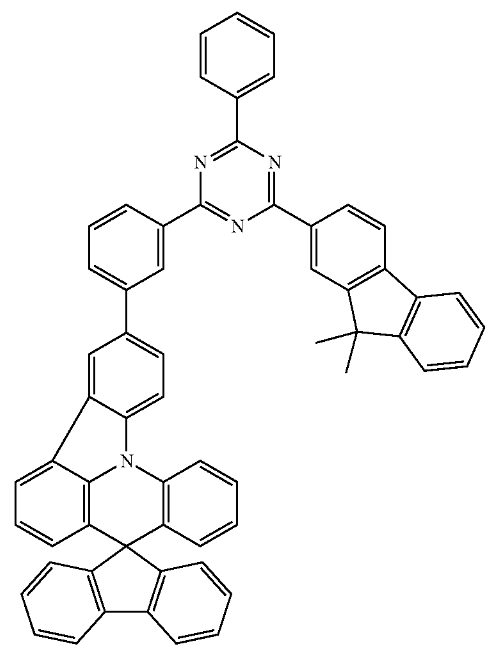

-continued
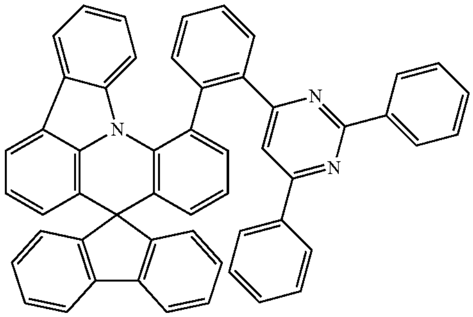
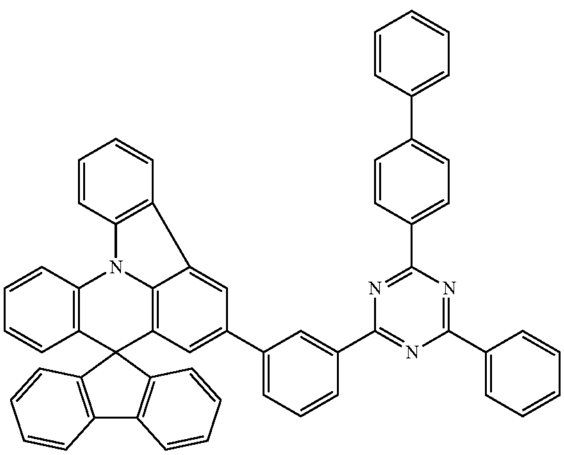
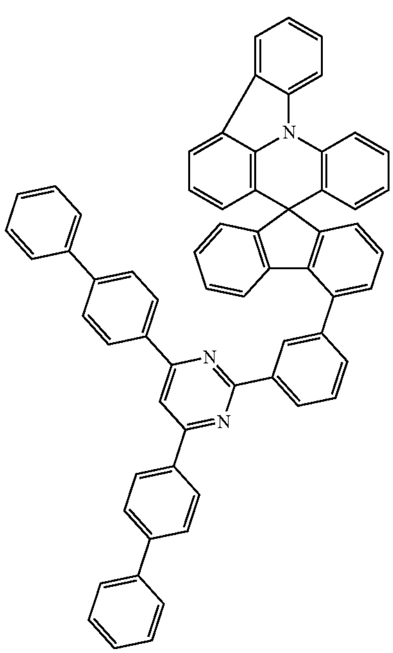
-continued
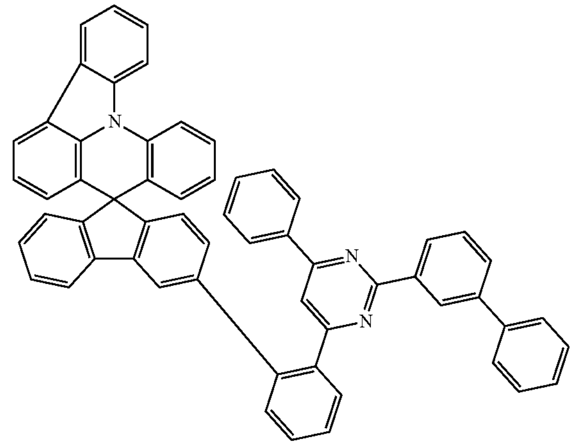
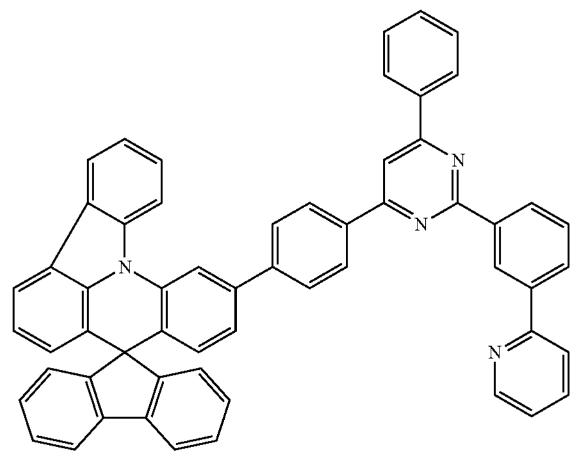
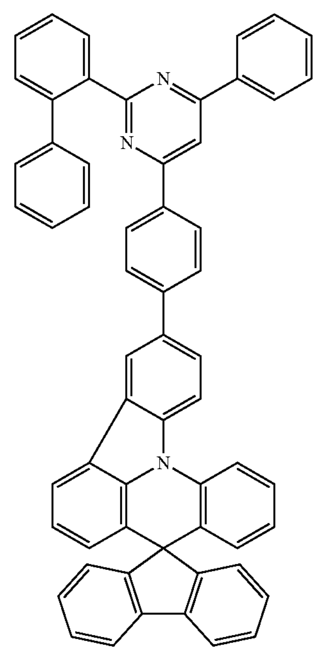

-continued
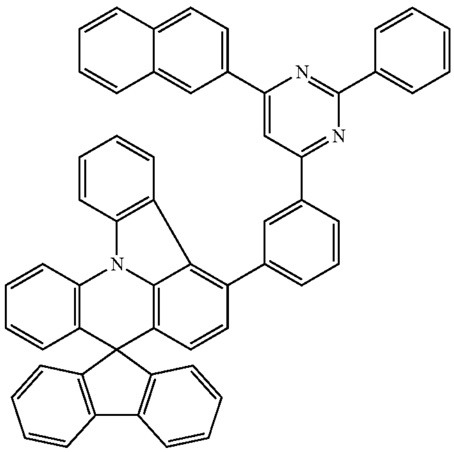
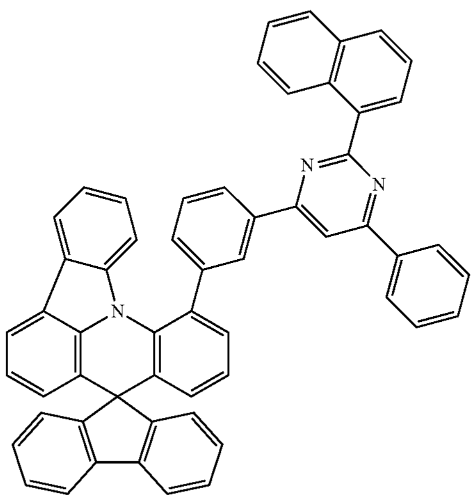
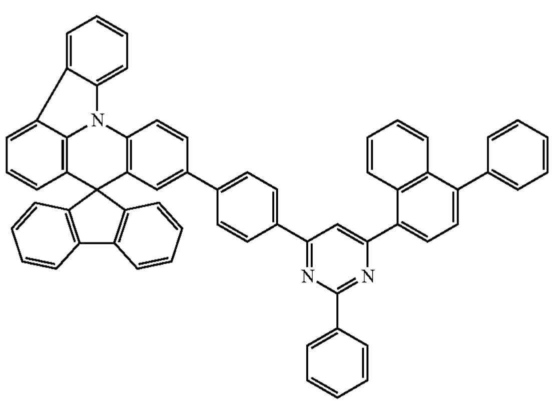
-continued
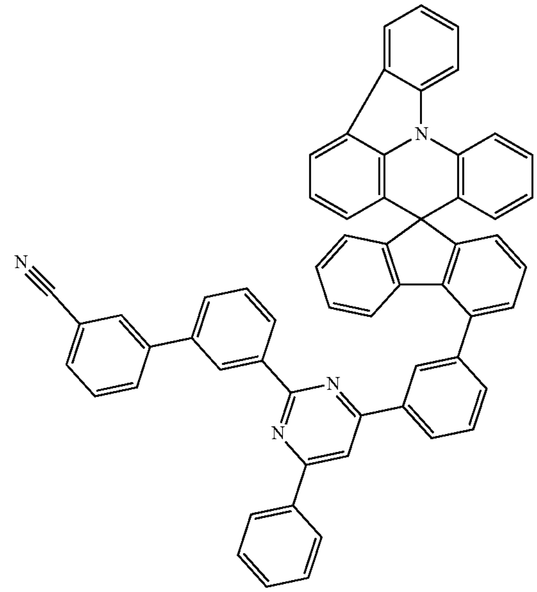
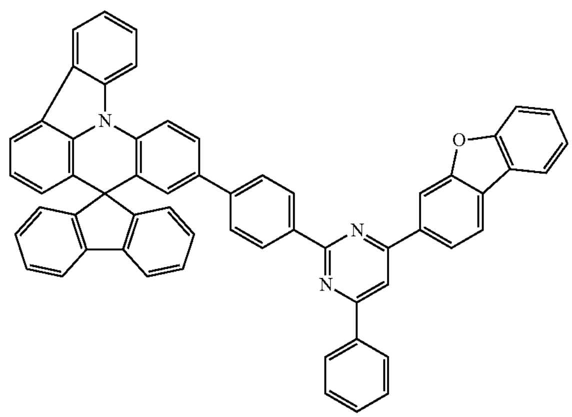
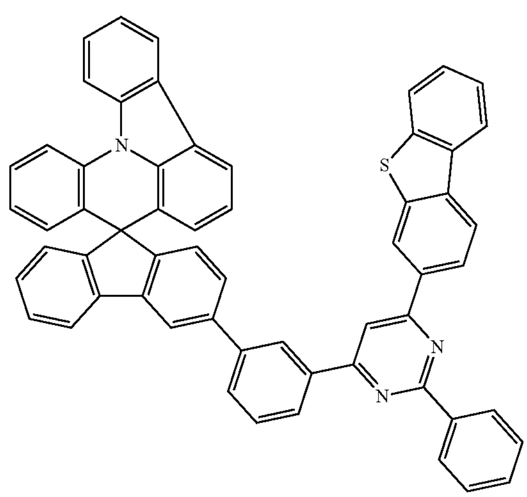

-continued
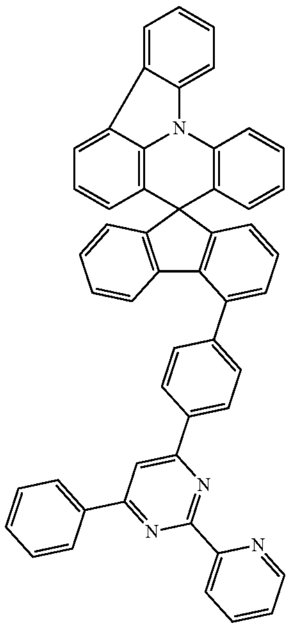
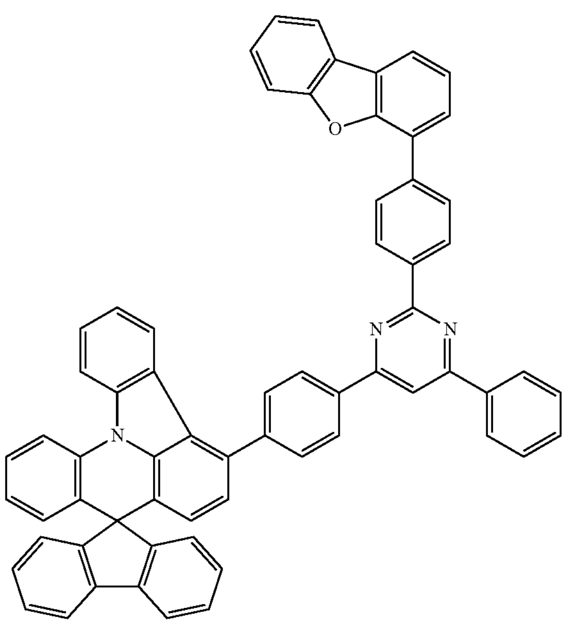
-continued
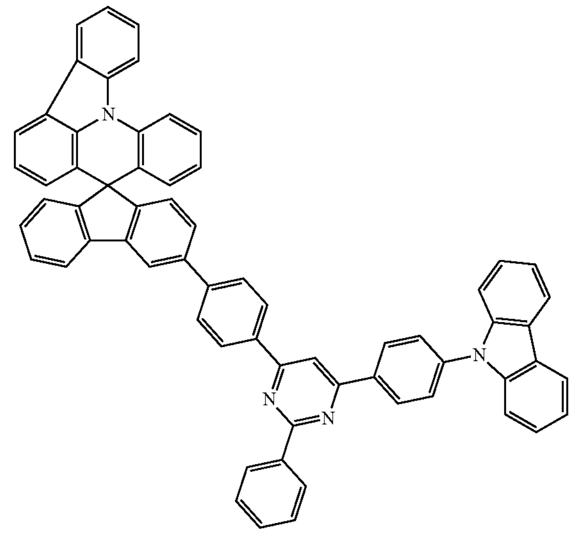
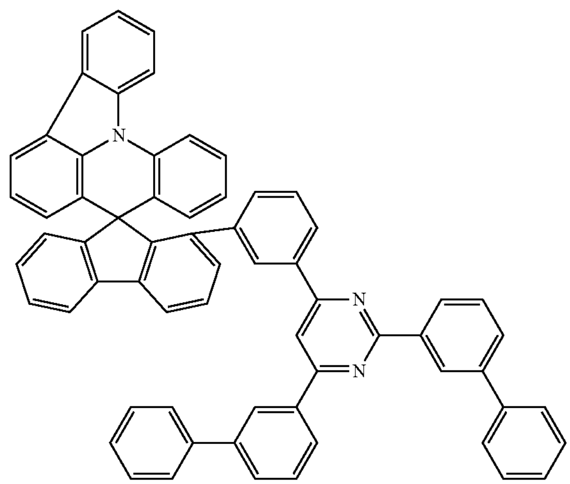
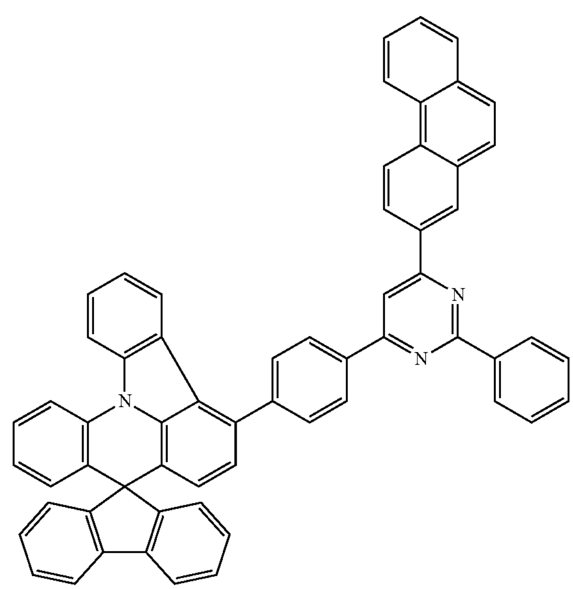

-continued
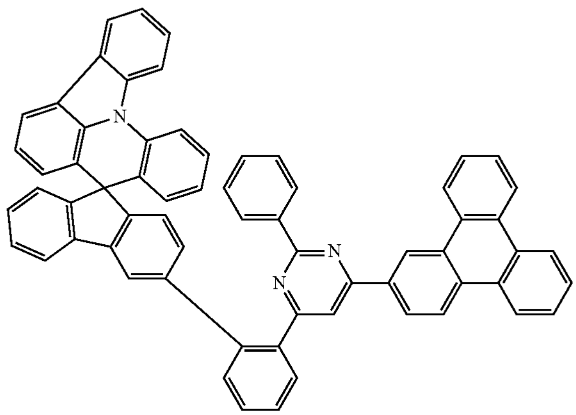
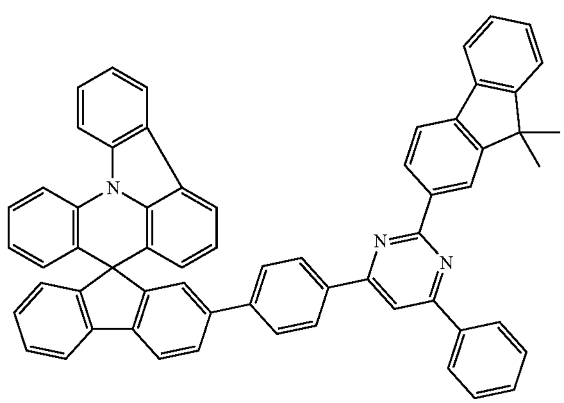
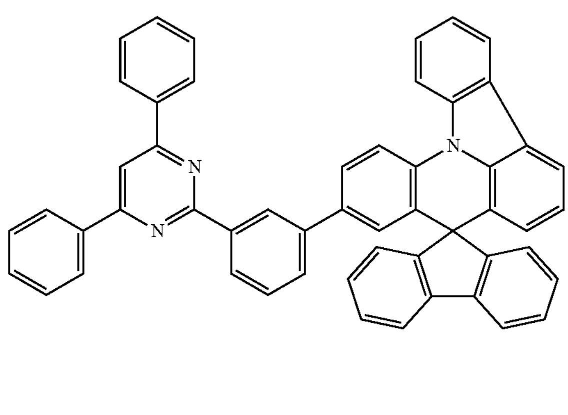
-continued
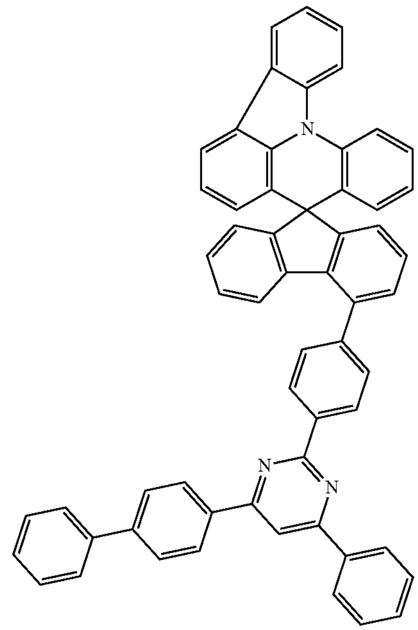
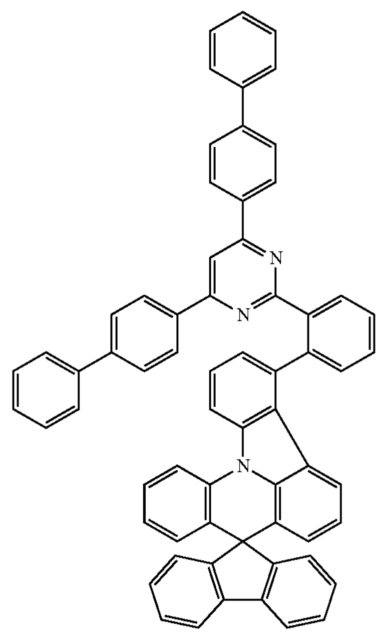
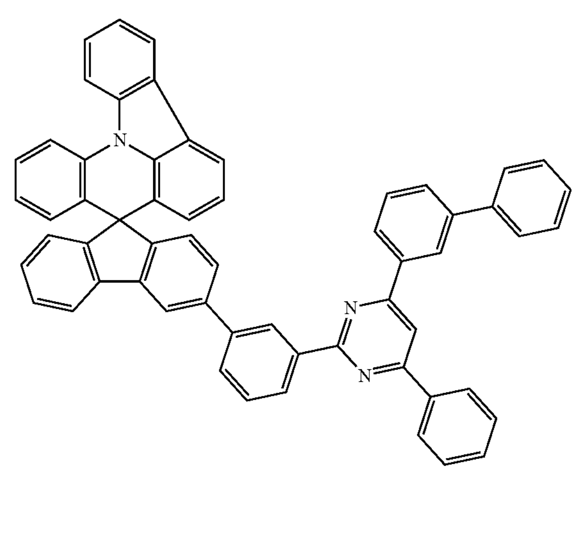

-continued
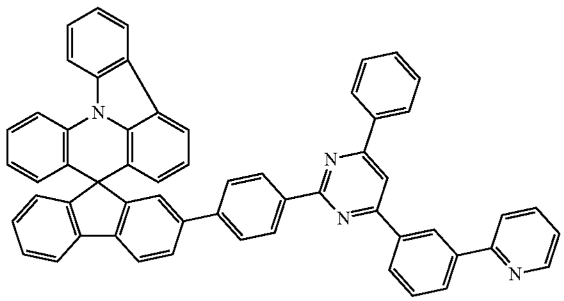
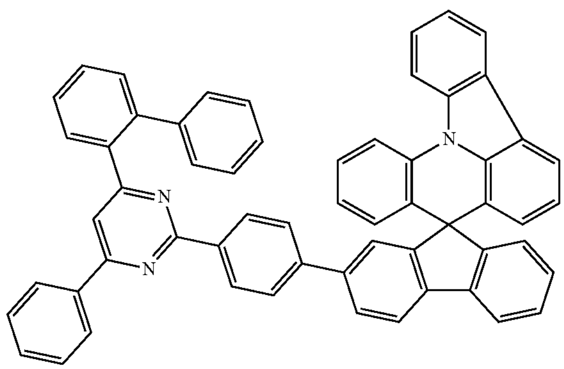
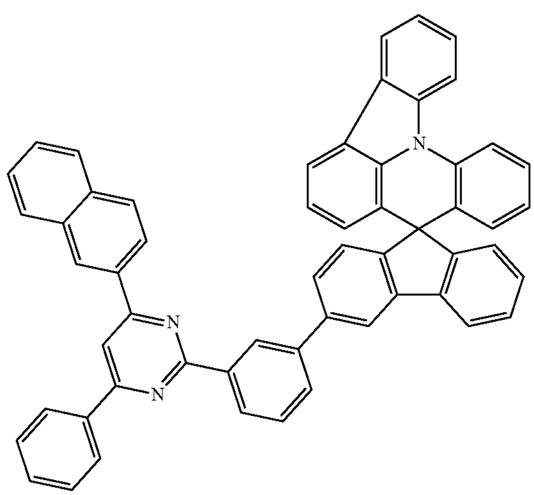
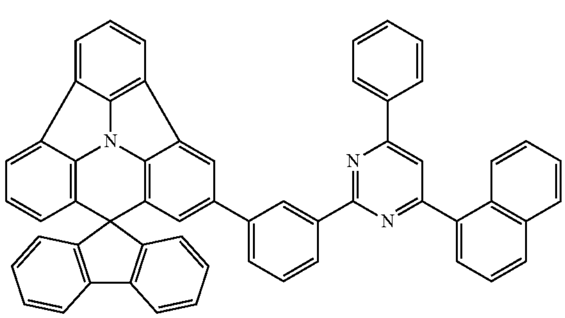
-continued
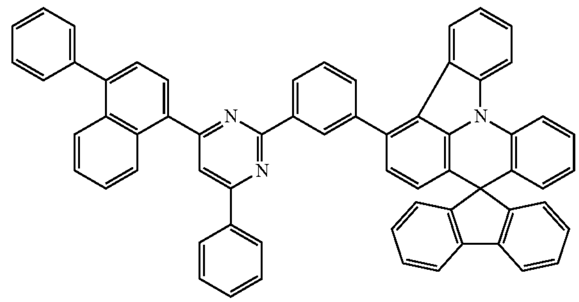
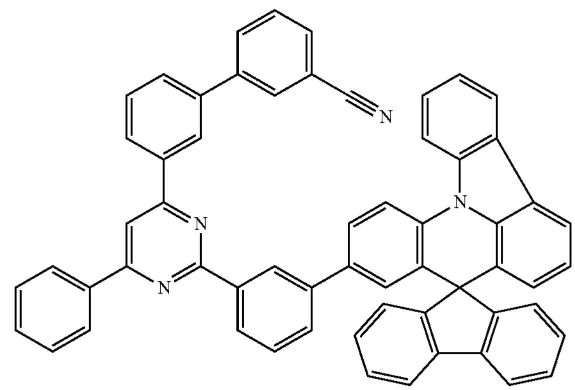
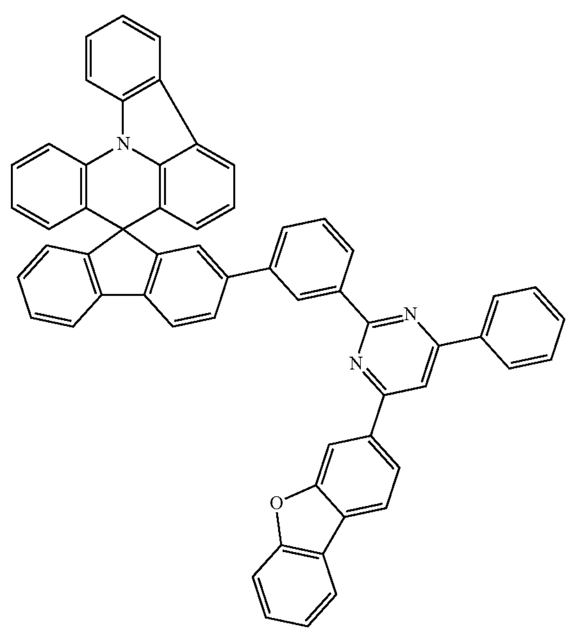

-continued
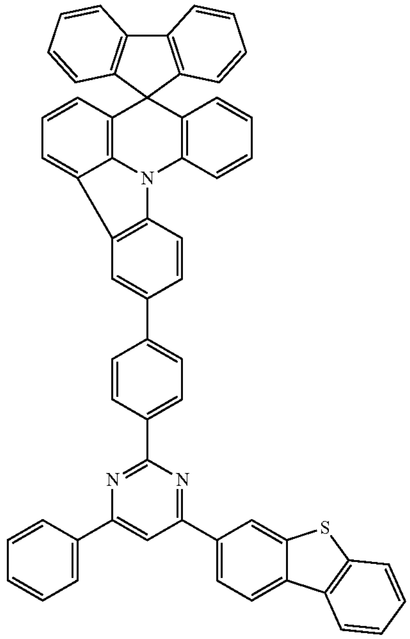
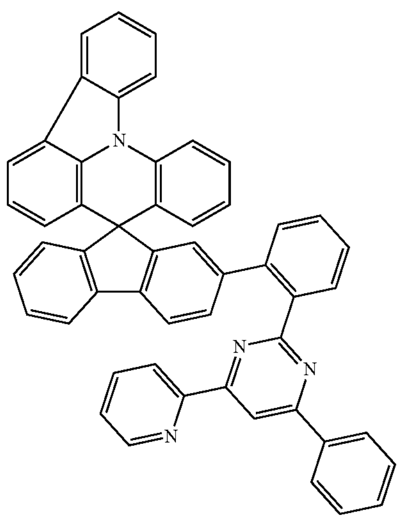
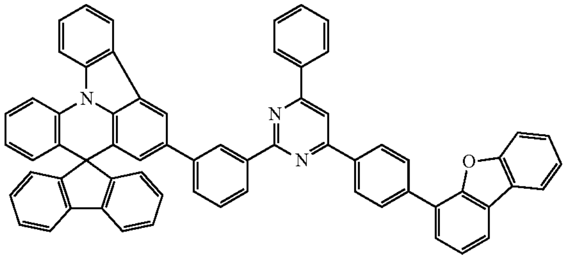
-continued
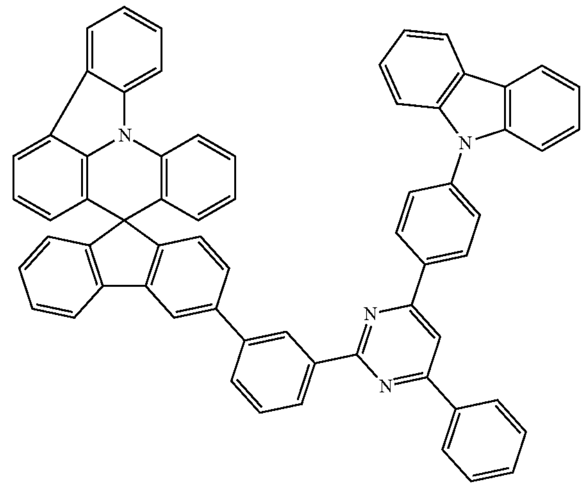
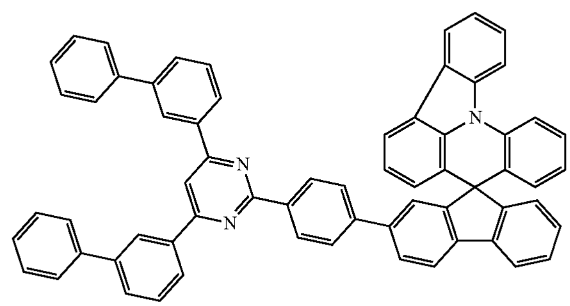
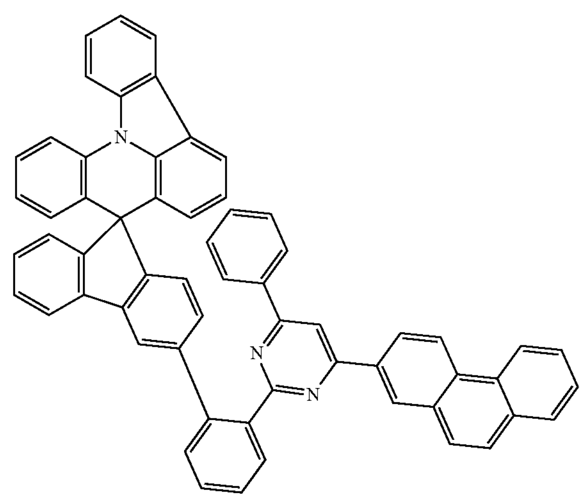

-continued
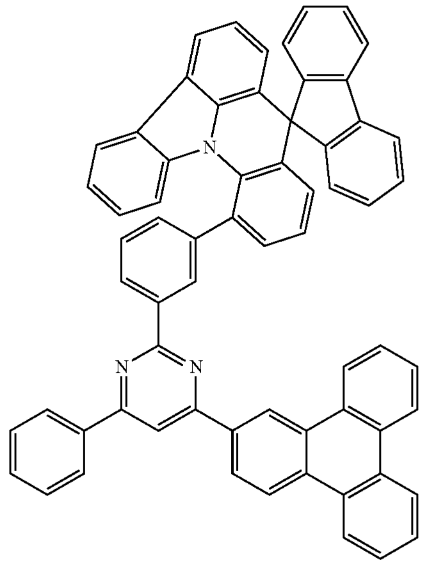
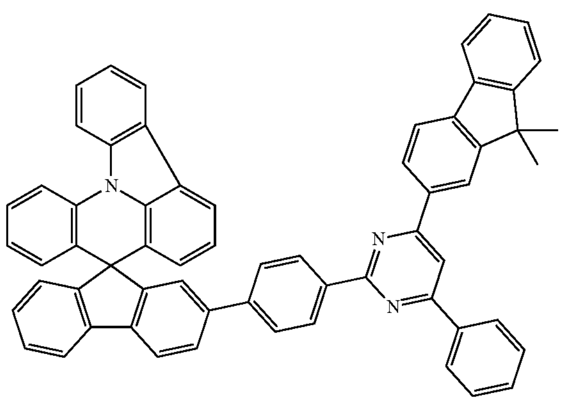 [SMILES: CC1(C)c2ccccc2-c2ccc(-c3cc(-c4ccccc4)nc(-c4ccc(-c5ccc6c(c5)C5(c7ccccc7-6)c6ccccc6-n6c7ccccc7c7cccc5c76)cc4)n3)cc21]
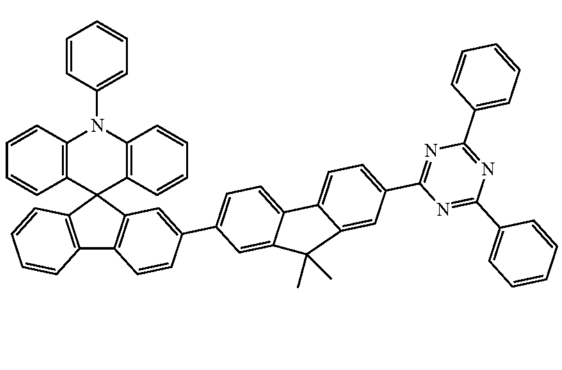
-continued
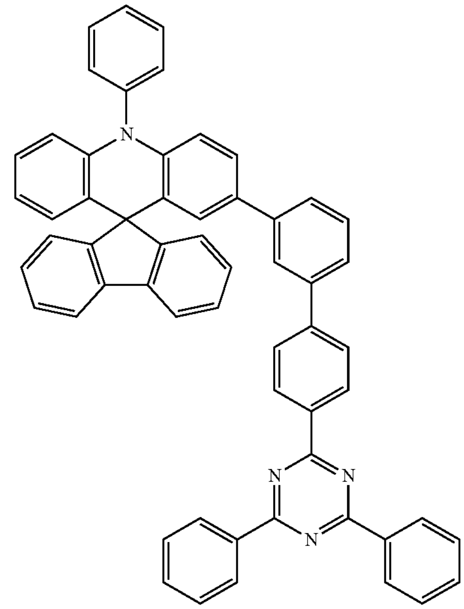
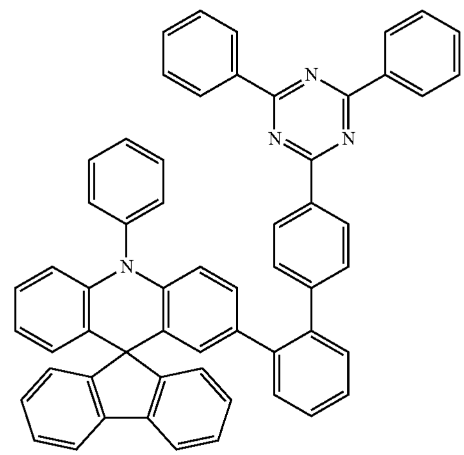
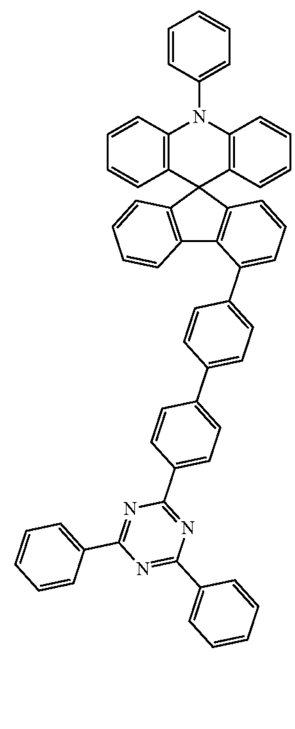

-continued
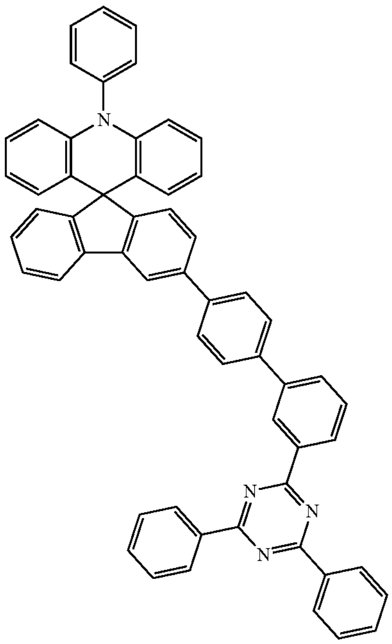
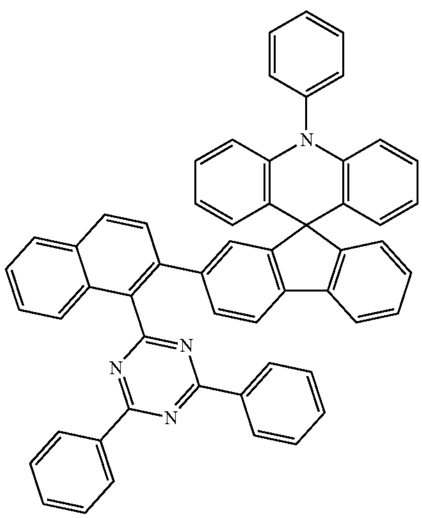
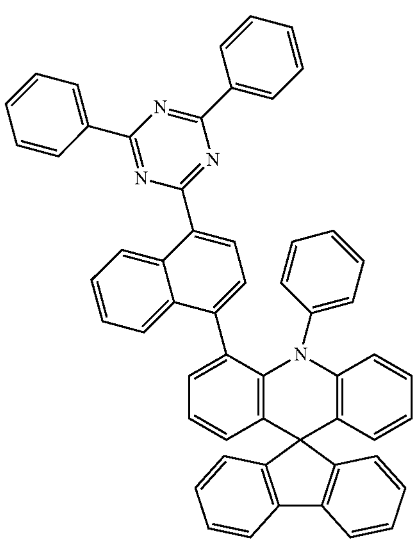
-continued
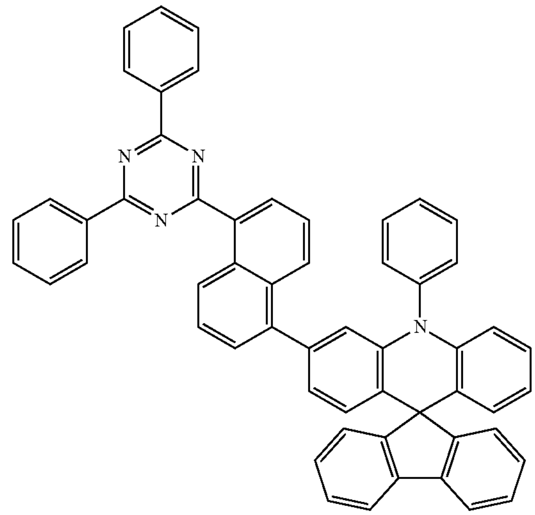
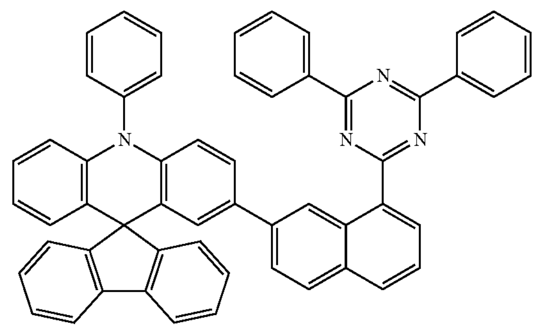
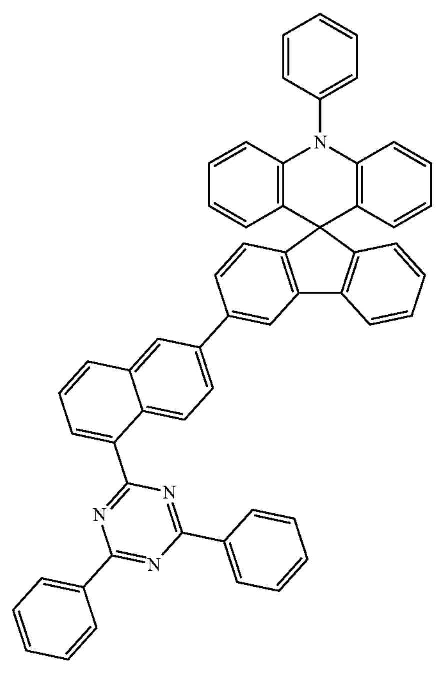

-continued
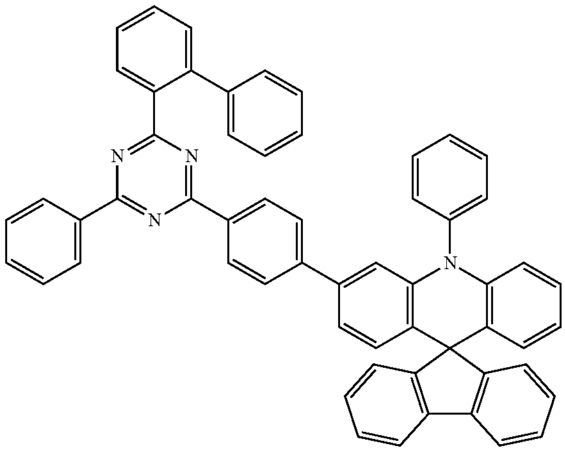
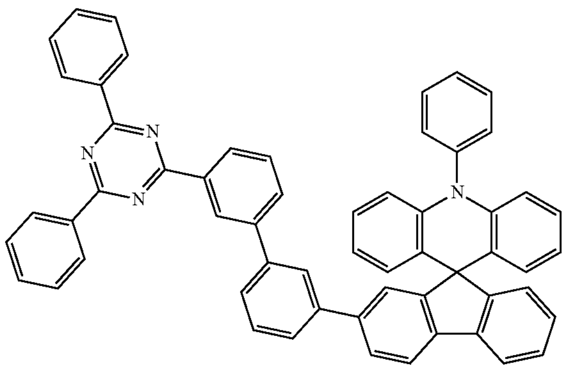
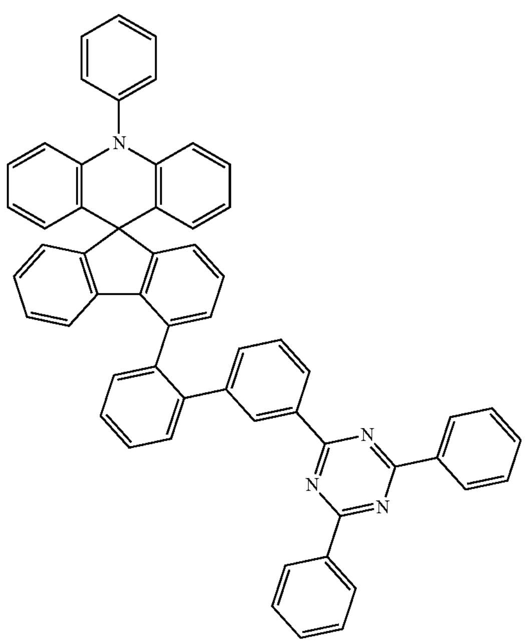
-continued
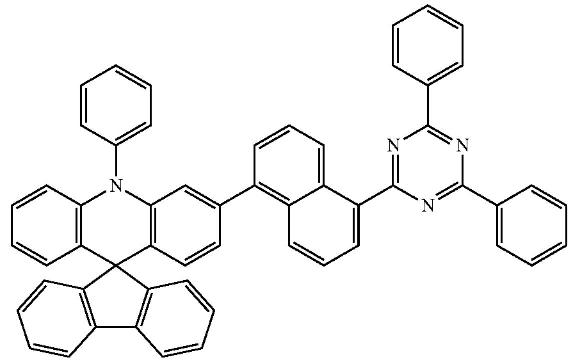
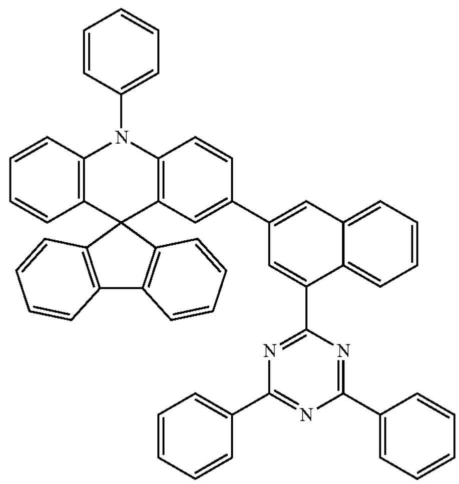
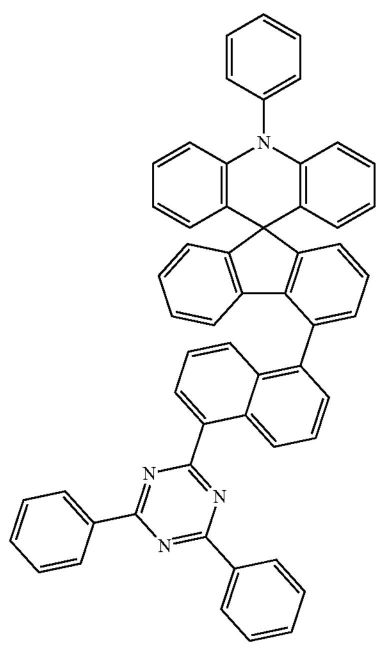

-continued
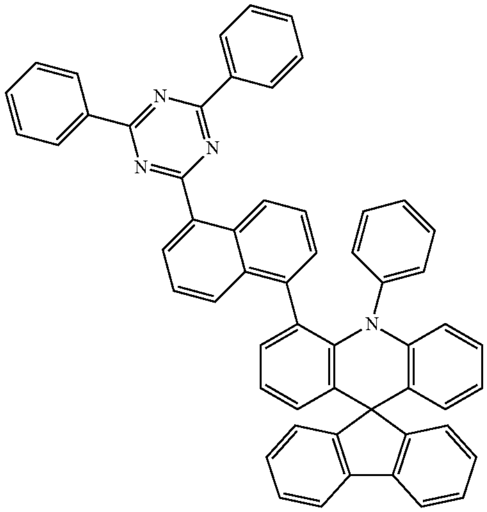
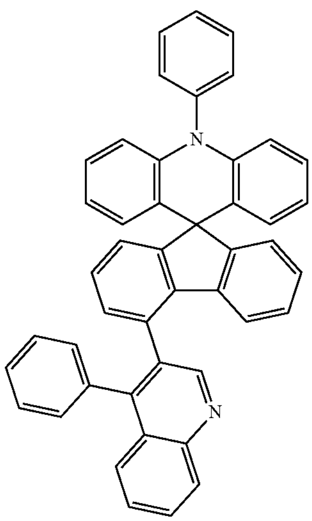
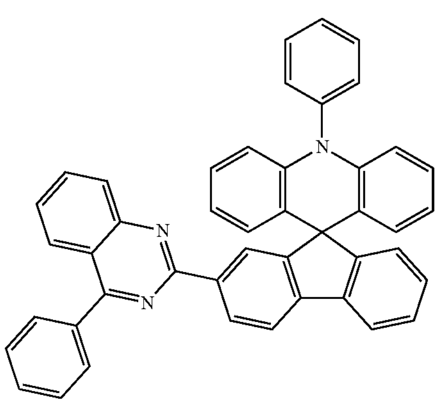
-continued
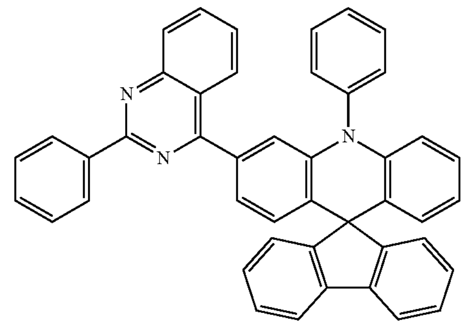
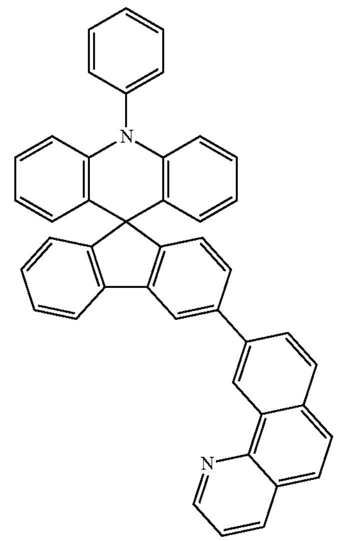
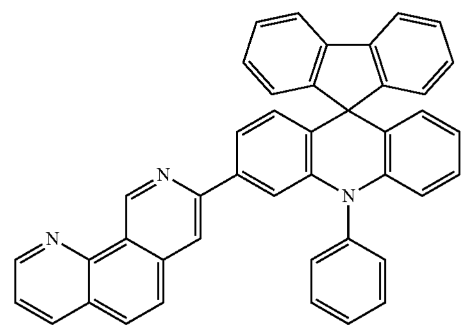
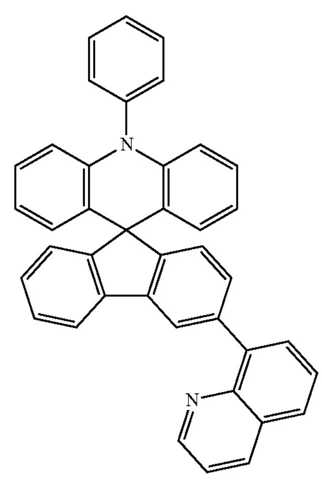

-continued
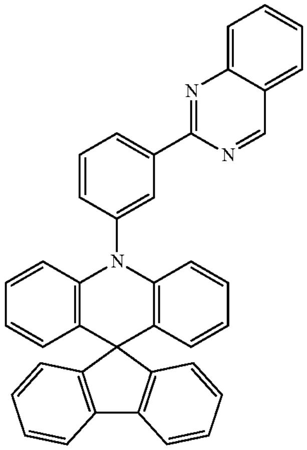
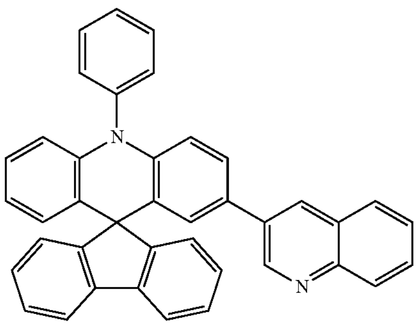
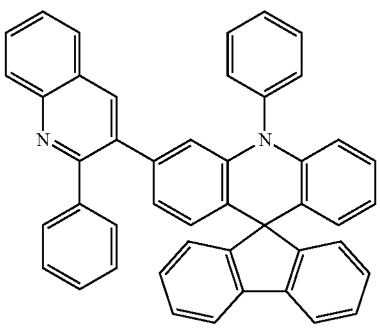
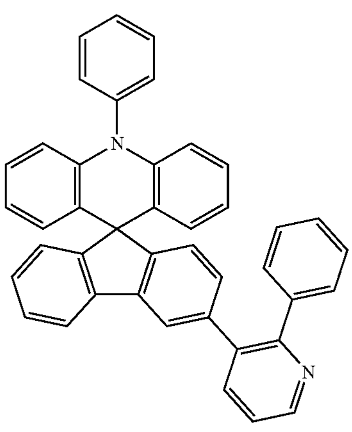
-continued
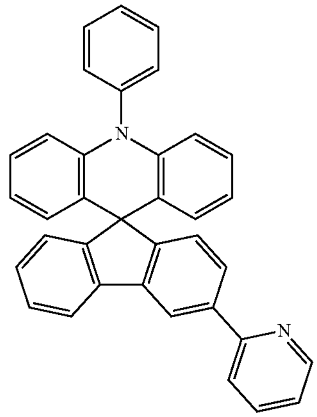
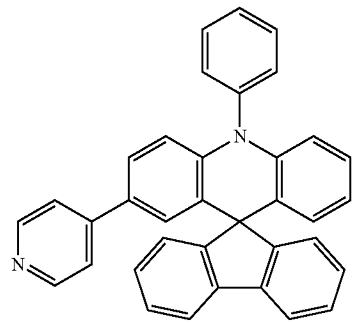
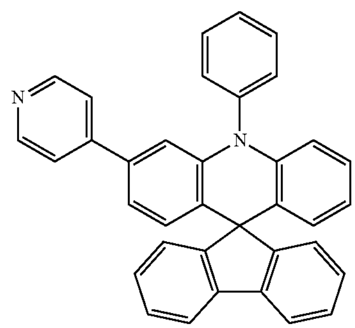
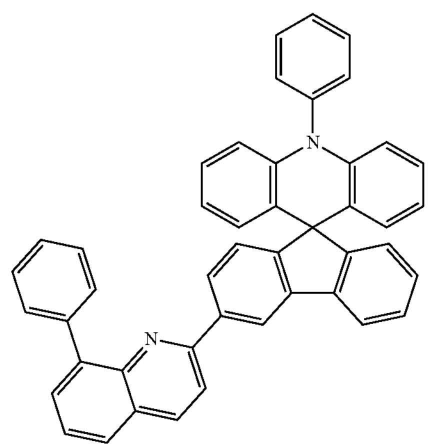

-continued
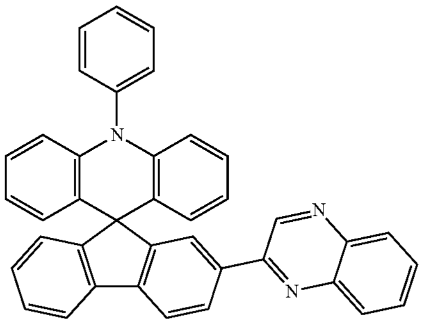
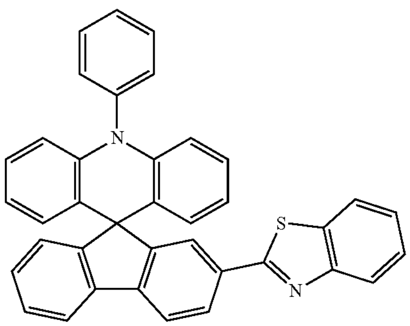
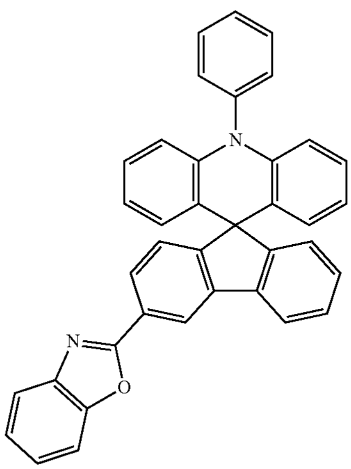
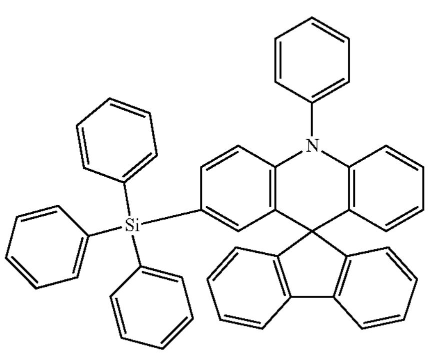
-continued
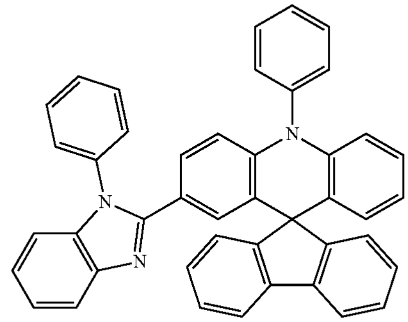
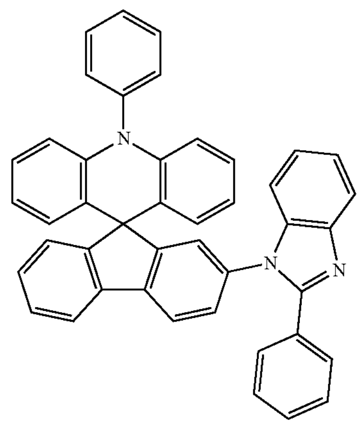
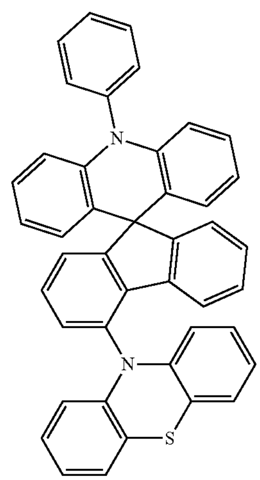
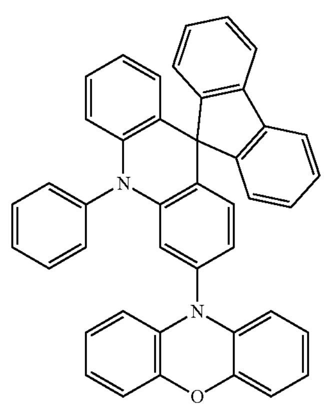

-continued
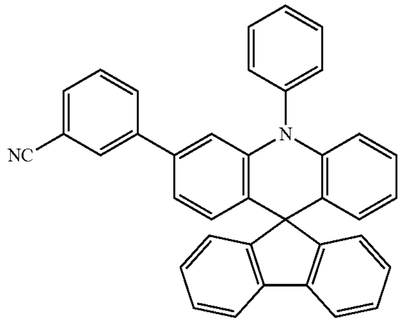
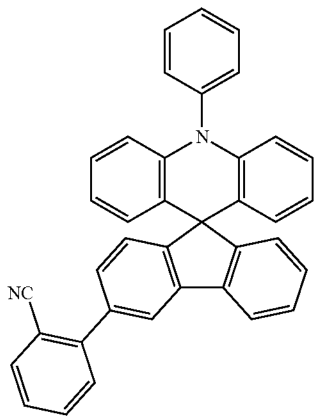
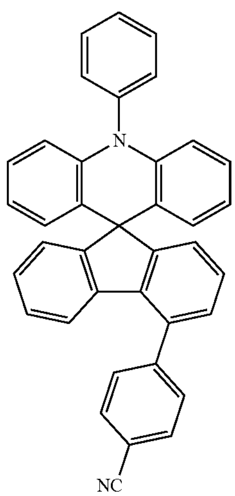
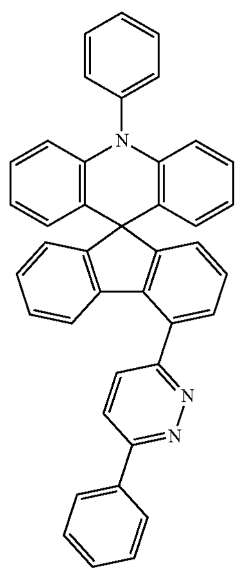
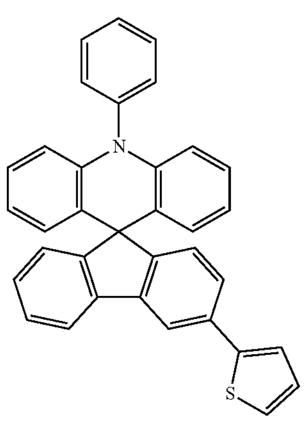
-continued
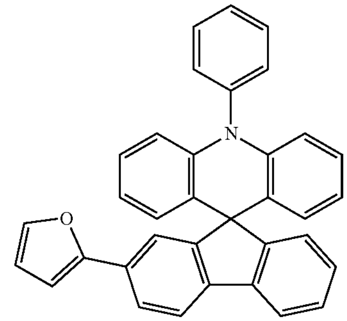
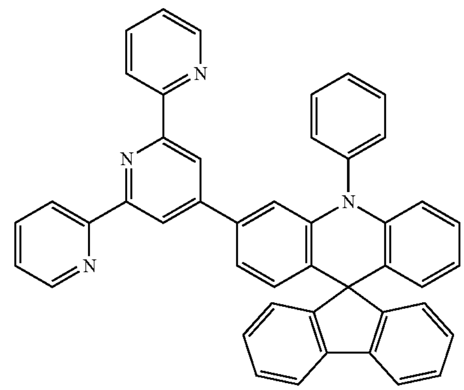
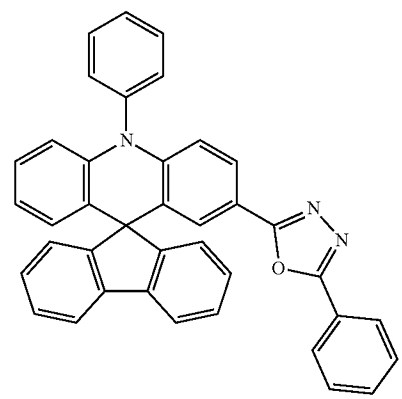
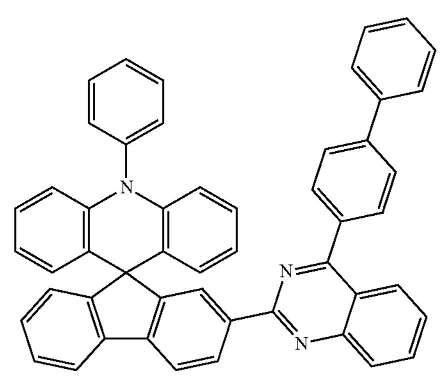

-continued
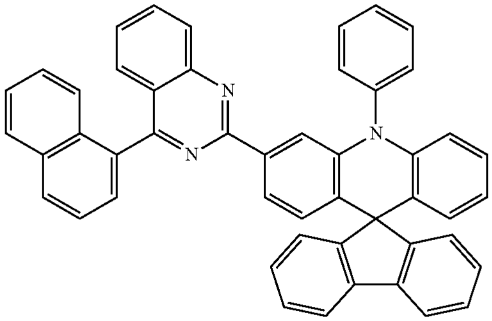
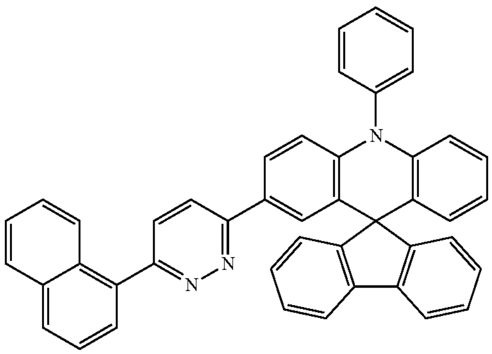
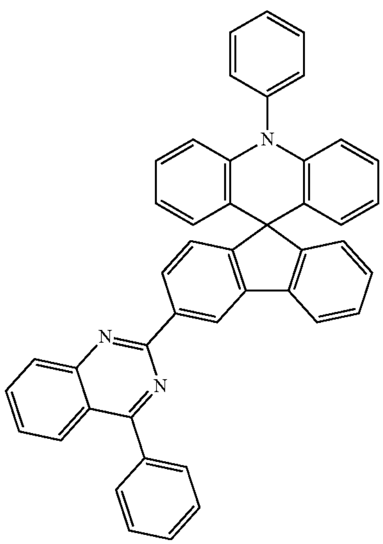
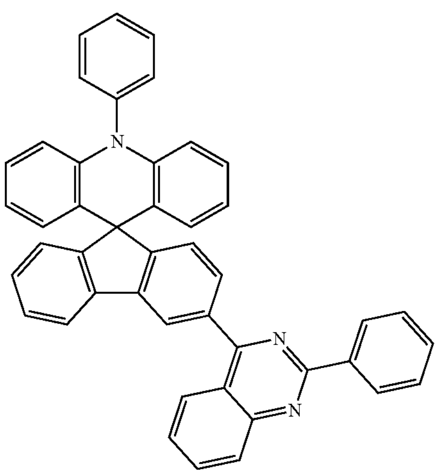
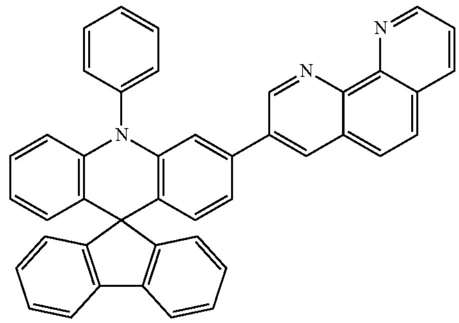
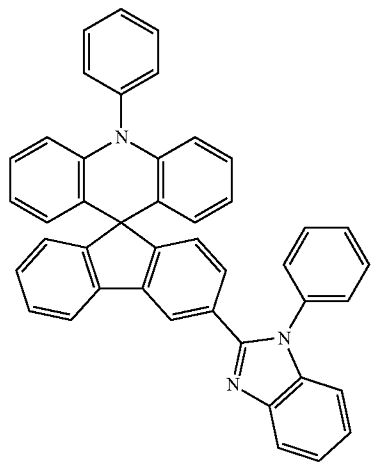
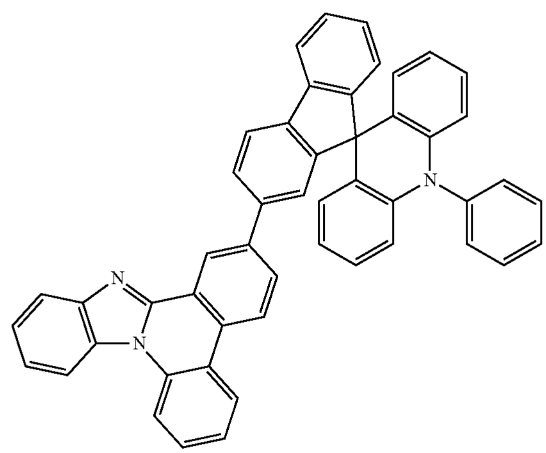
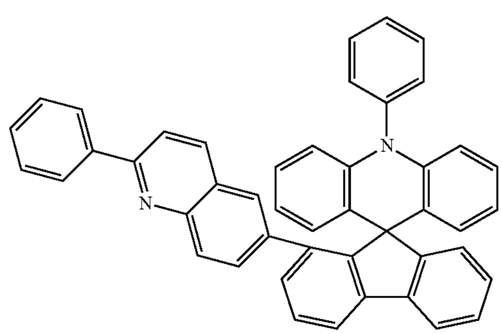

-continued
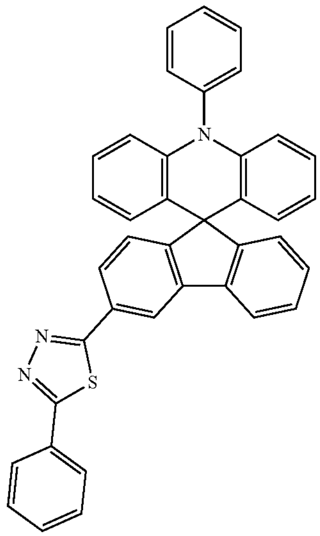 [SMILES: c1ccc(-c2nnc(-c3ccc4c(c3)-c3ccccc3C43c4ccccc4N(c4ccccc4)c4ccccc43)s2)cc1]
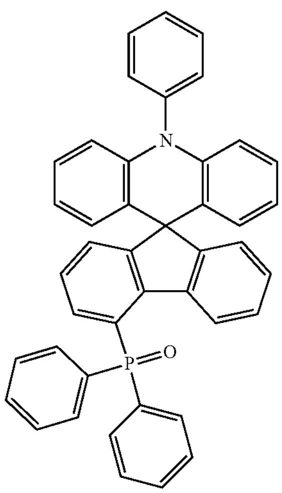
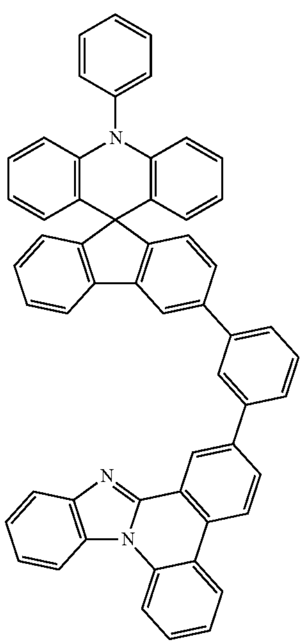
-continued
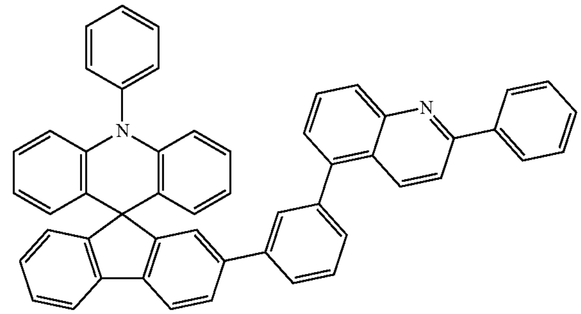
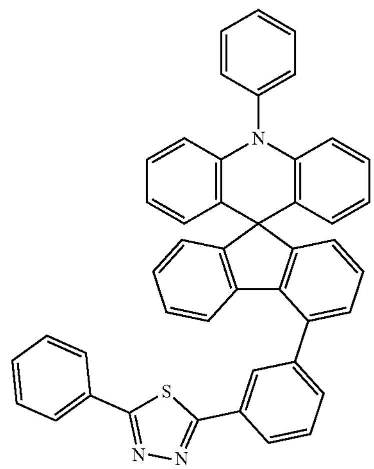
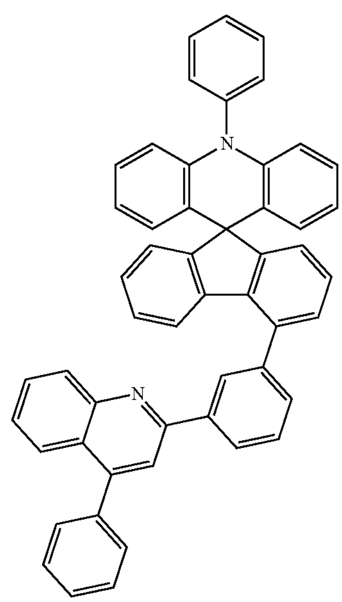

-continued
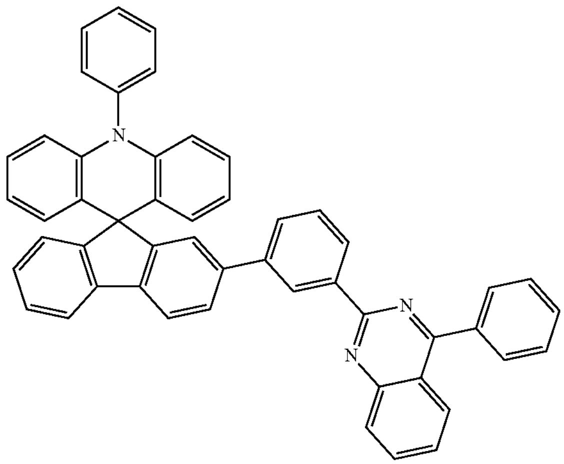
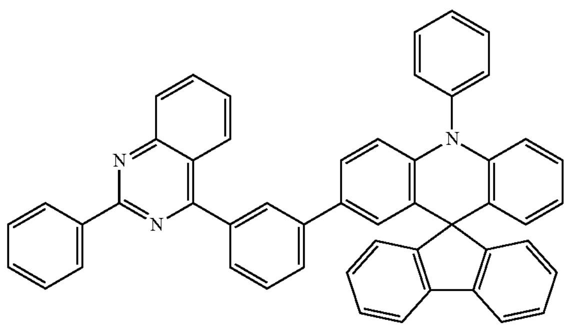
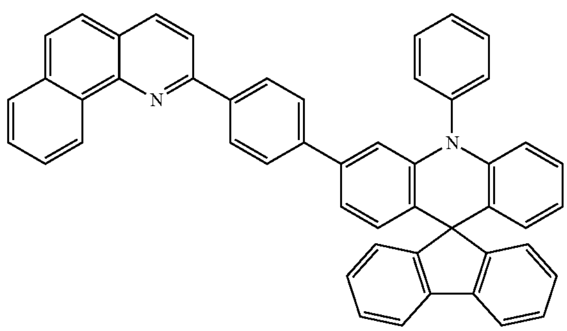
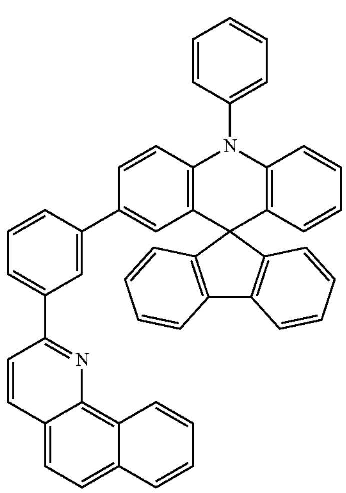
-continued
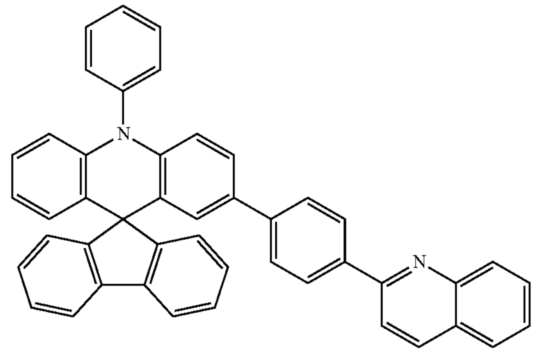
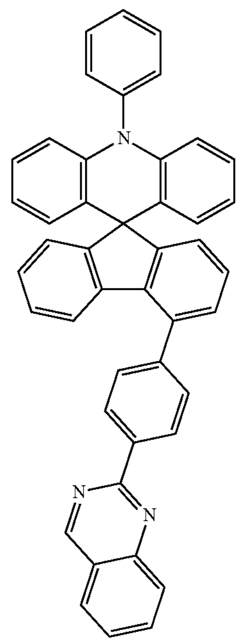
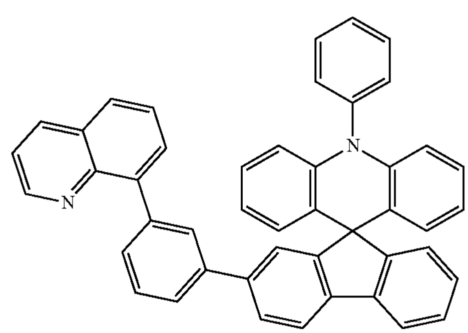

-continued
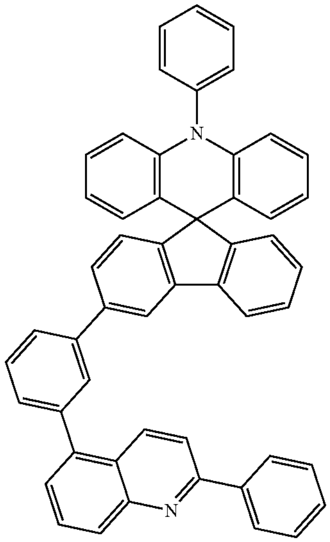
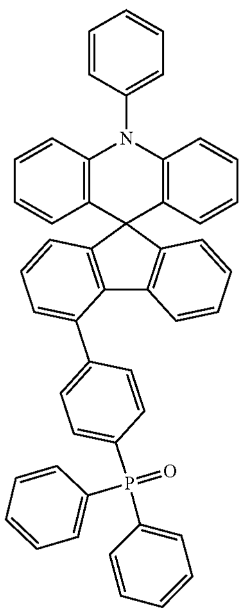
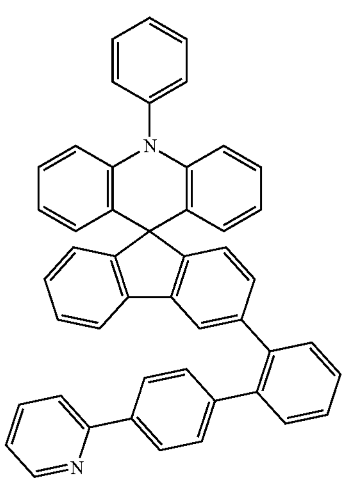
-continued
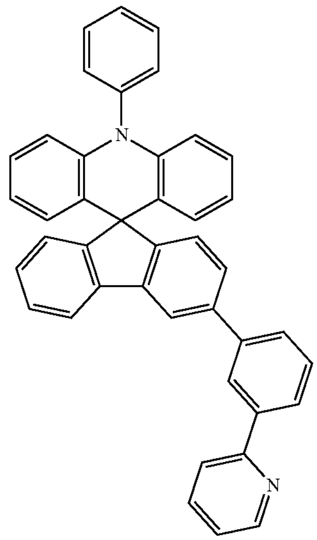
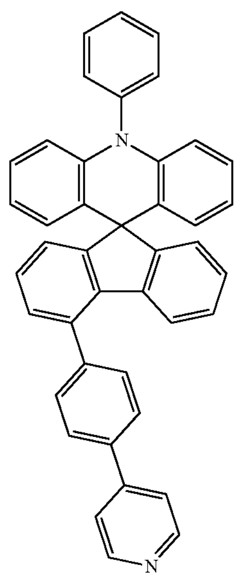
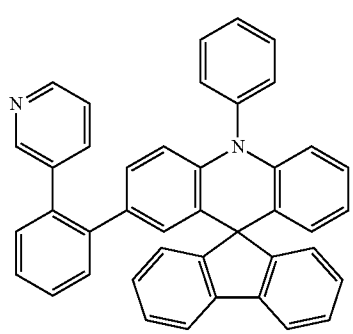

-continued
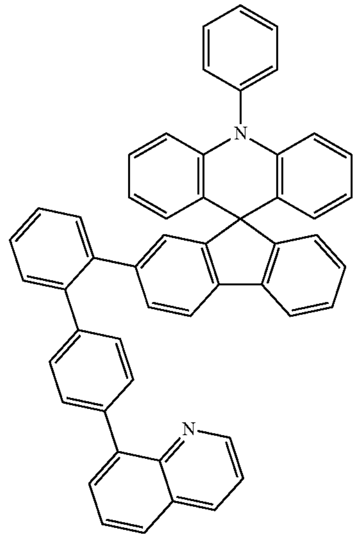
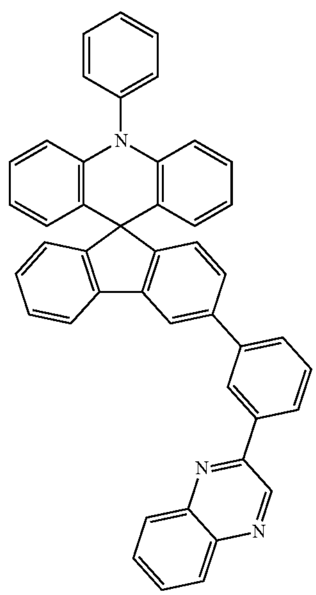
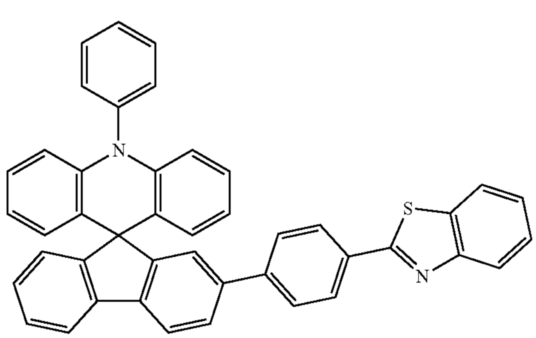
-continued
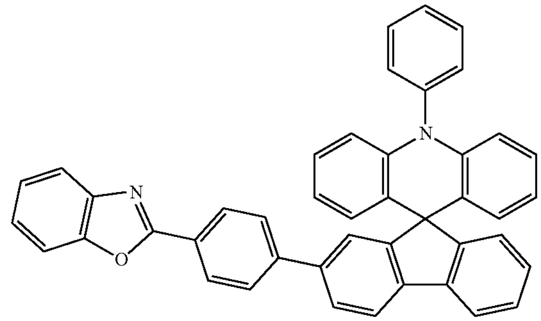
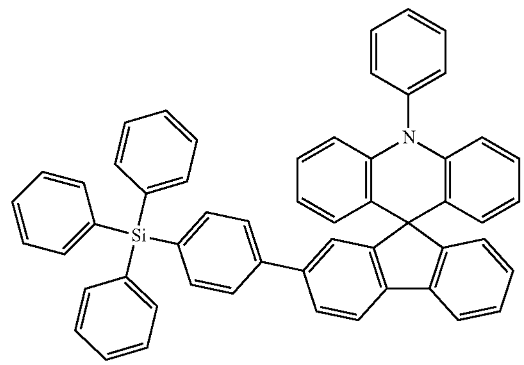
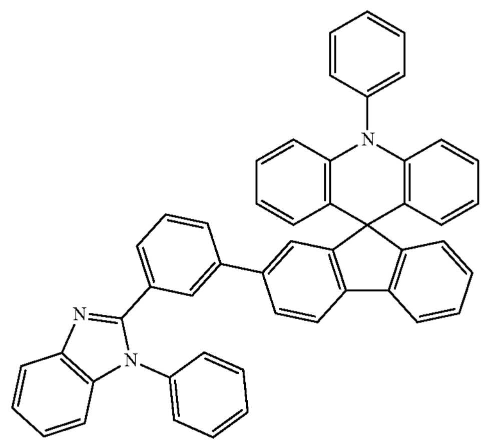
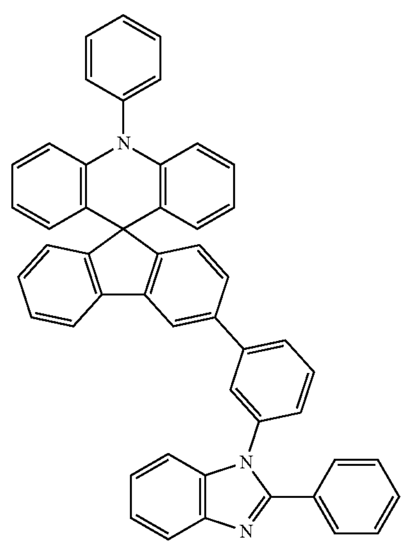

-continued
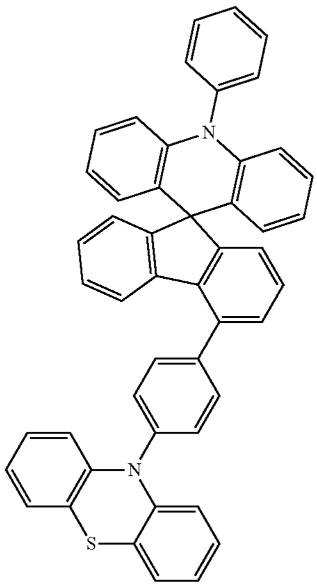
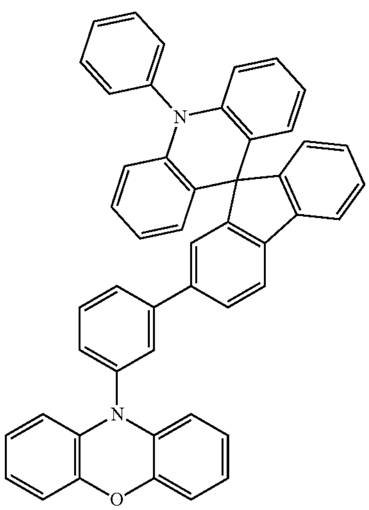
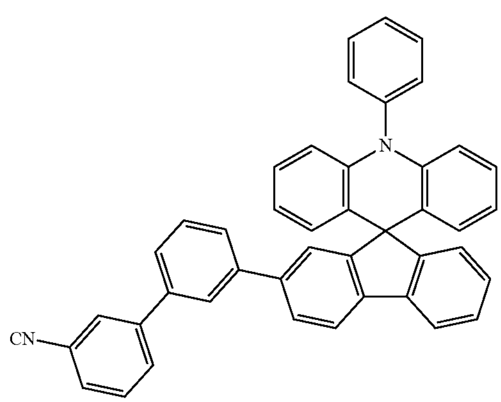
-continued
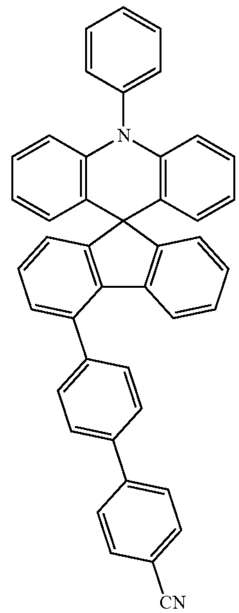
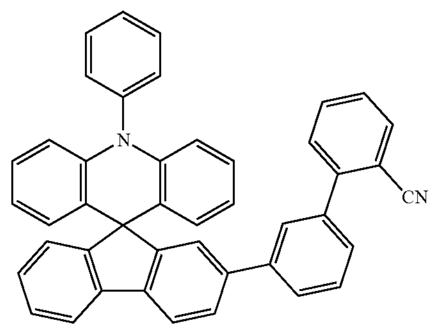
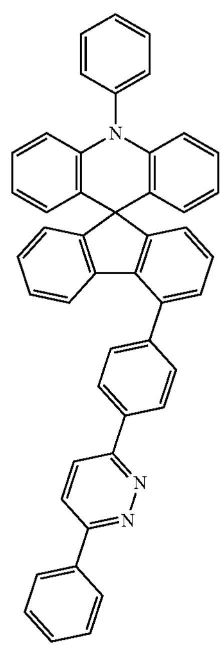
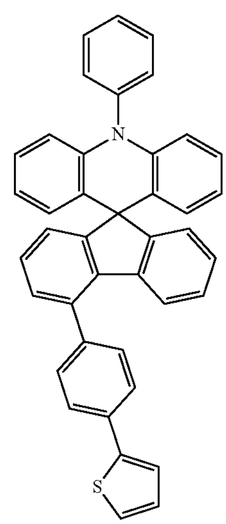

-continued
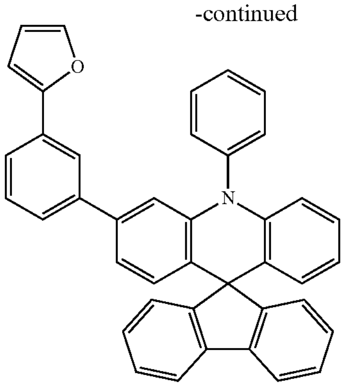
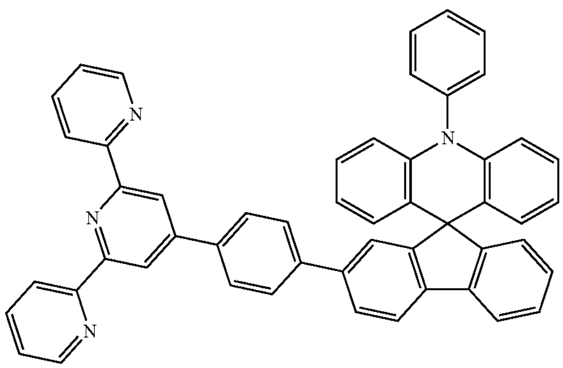
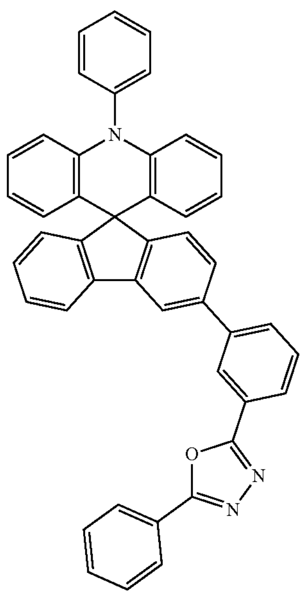
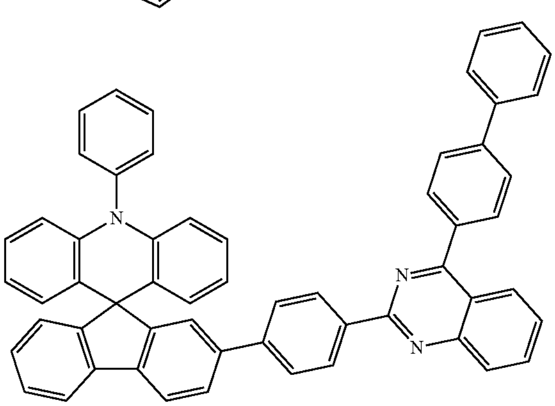
-continued
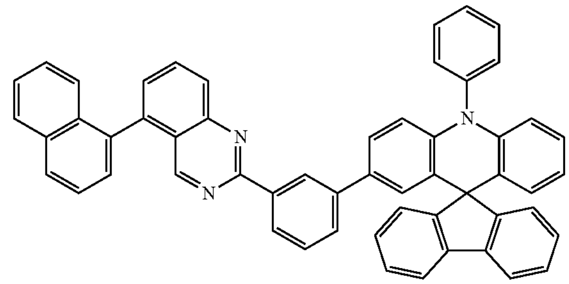
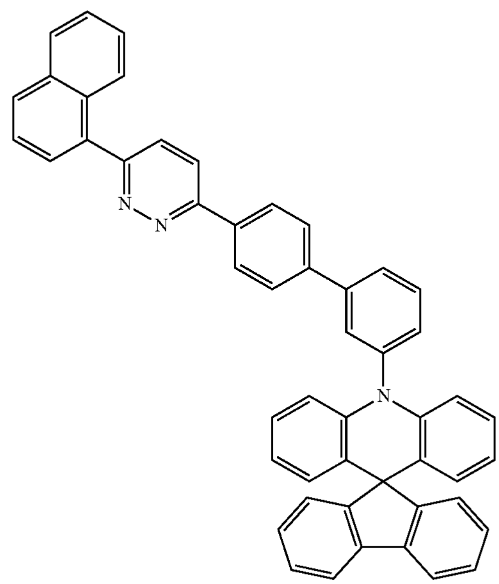
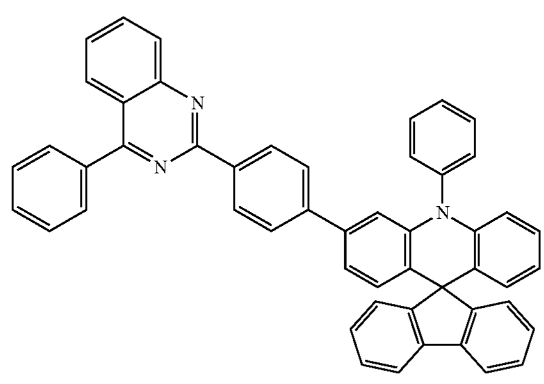

-continued
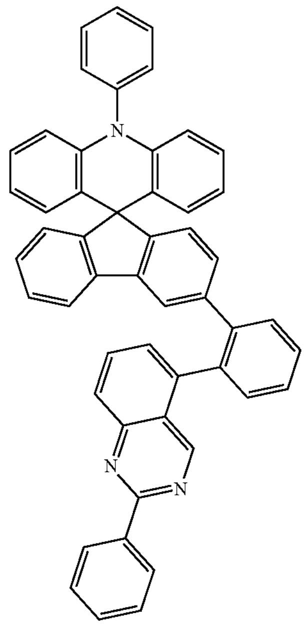
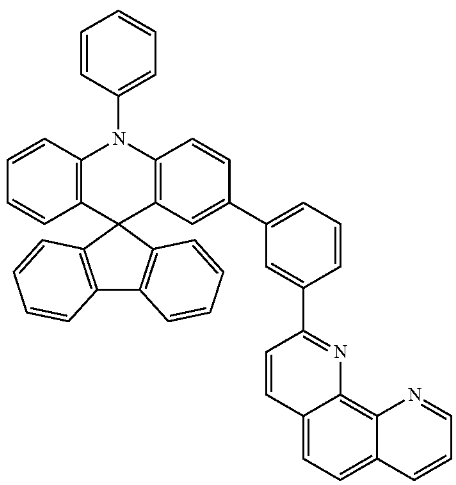
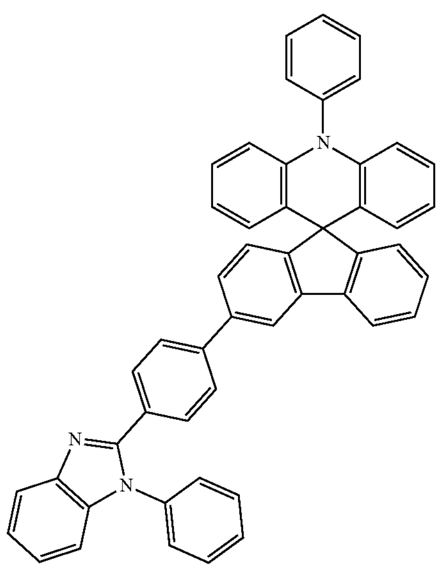
-continued
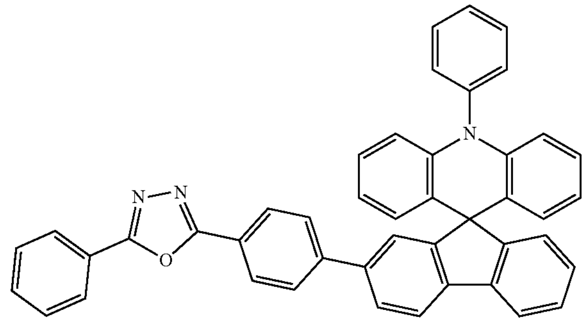
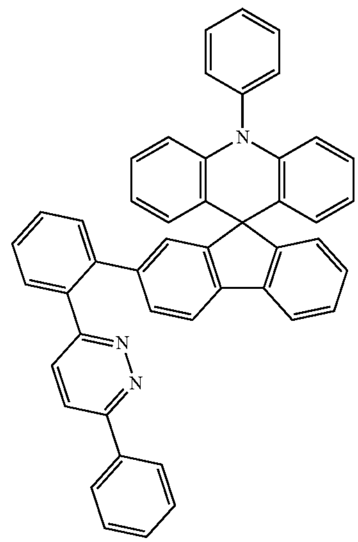
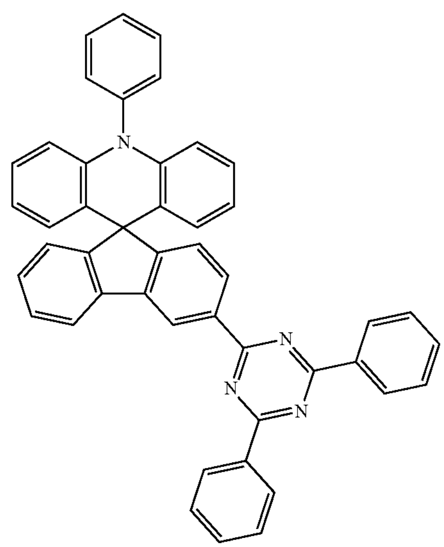

-continued
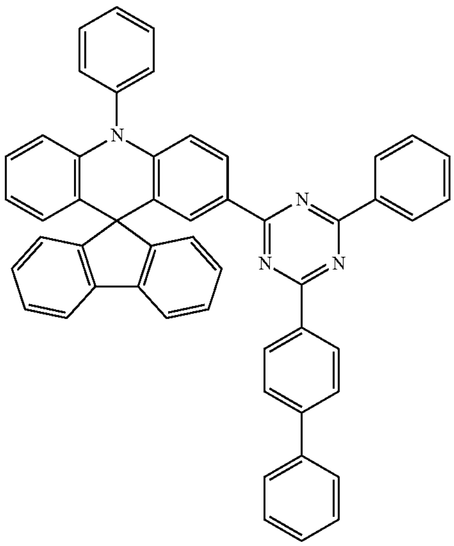
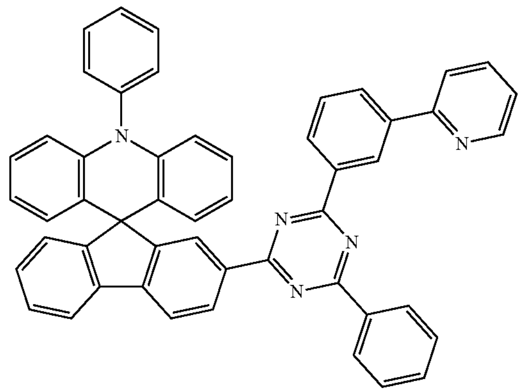
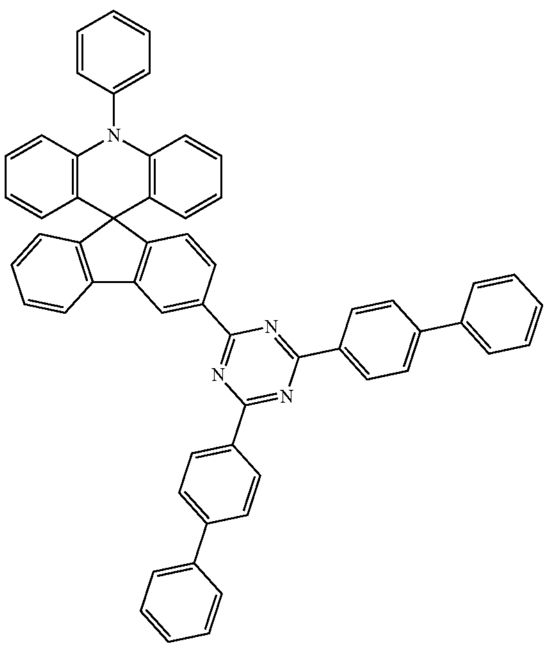
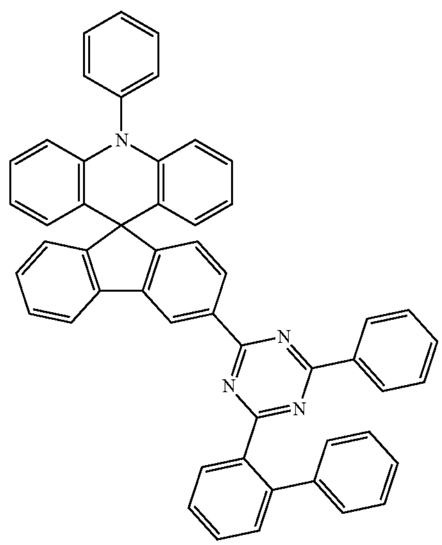
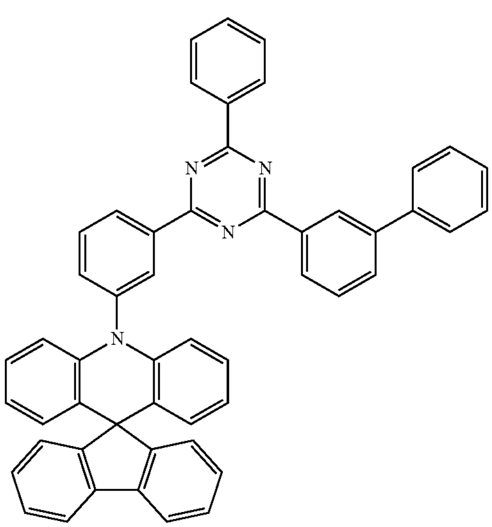
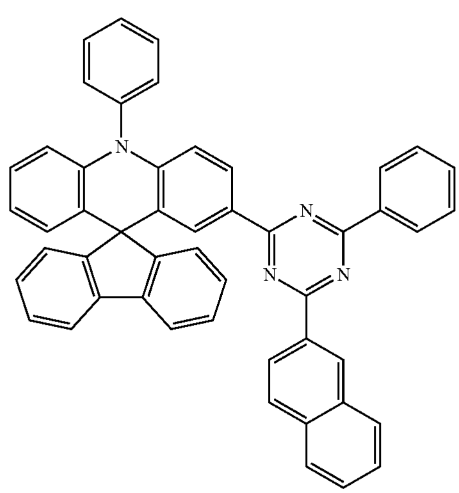

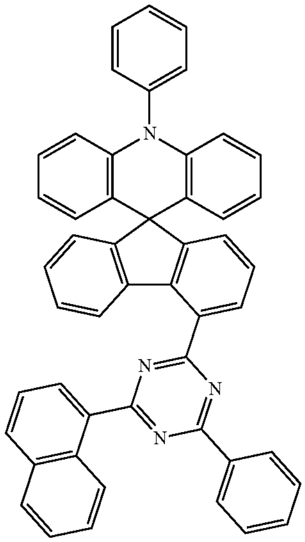
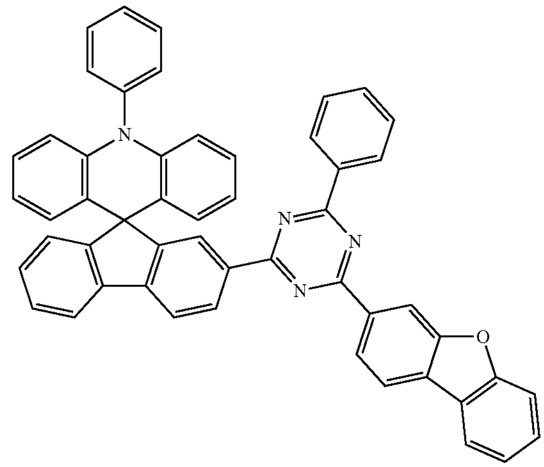
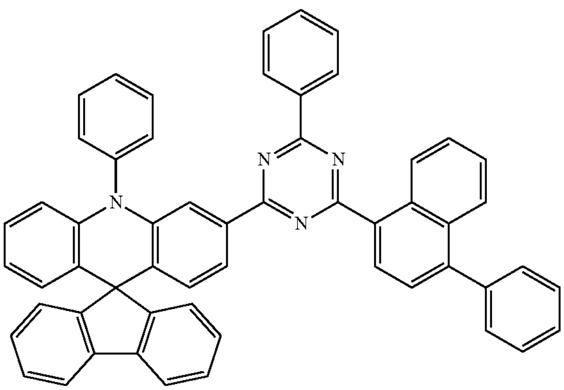
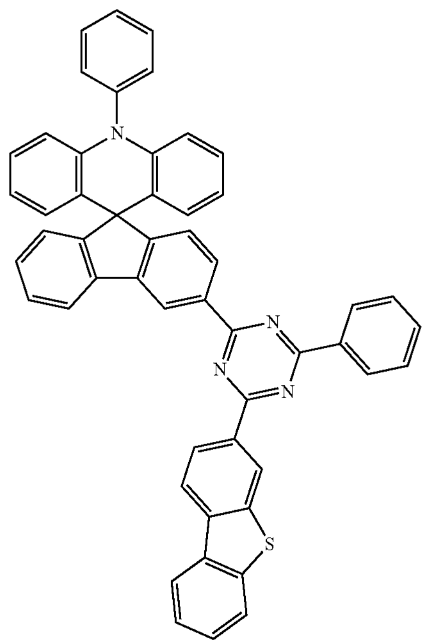
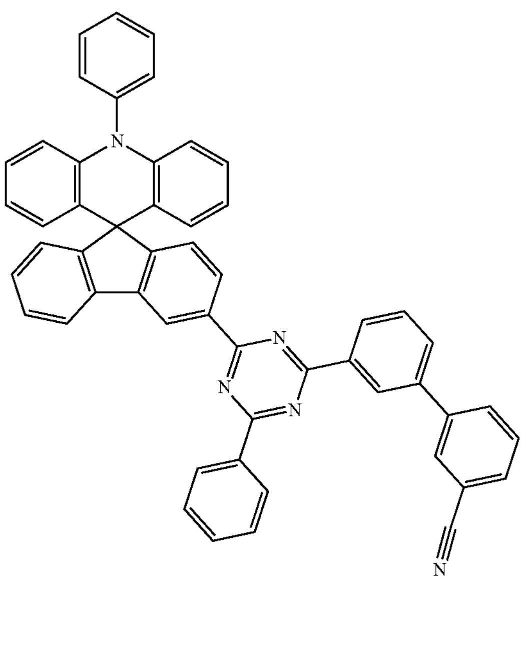
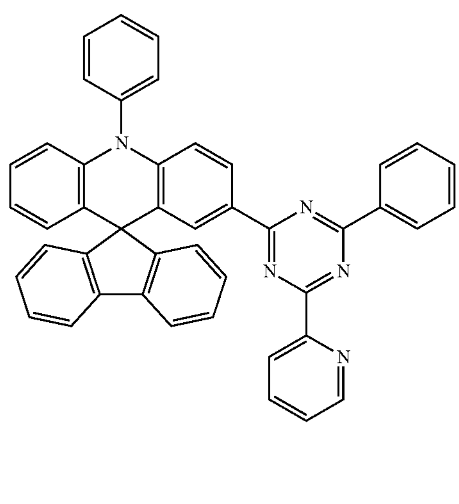

-continued
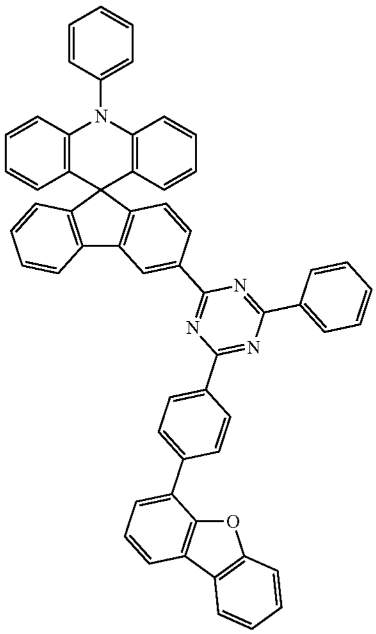
-continued
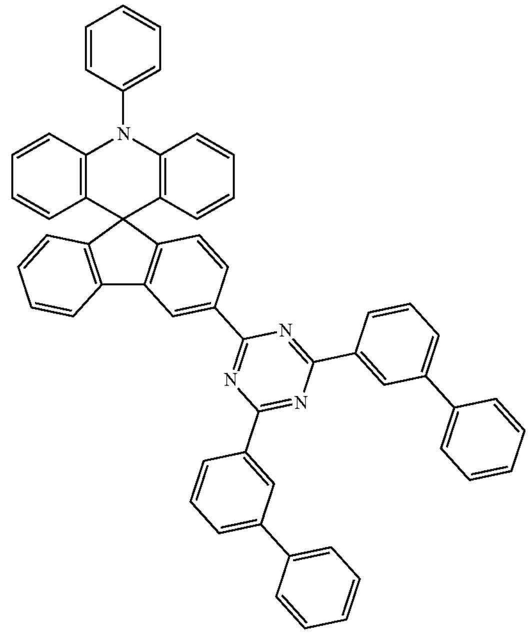
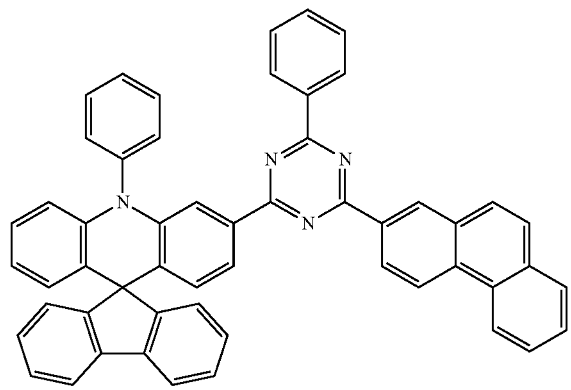
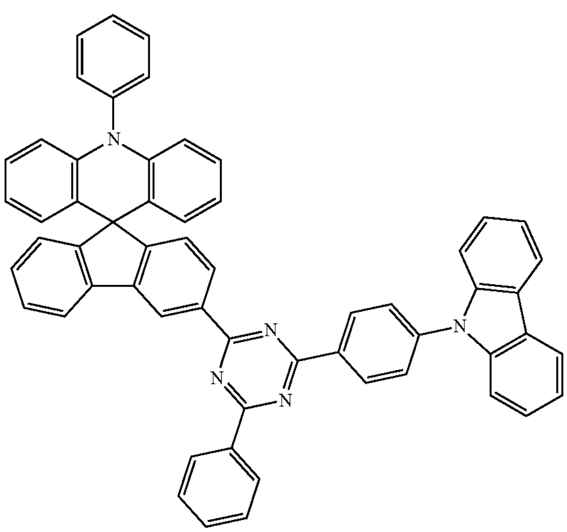
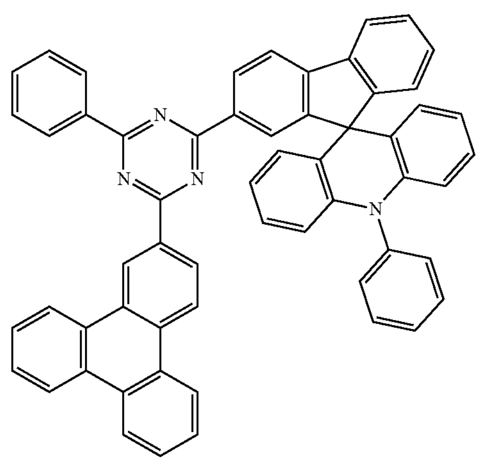

-continued
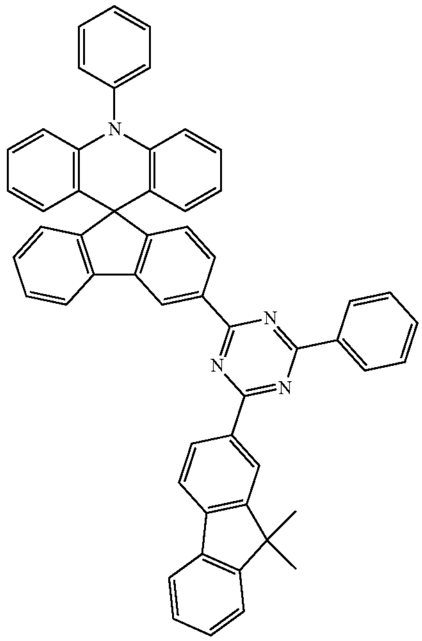
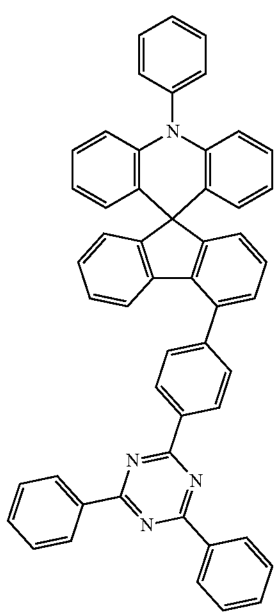
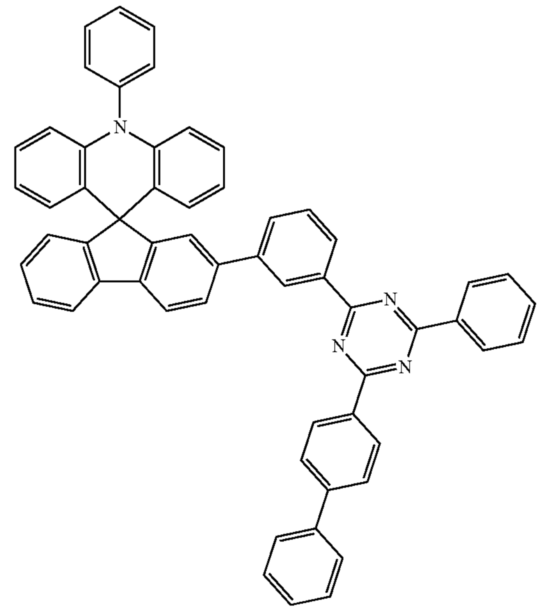
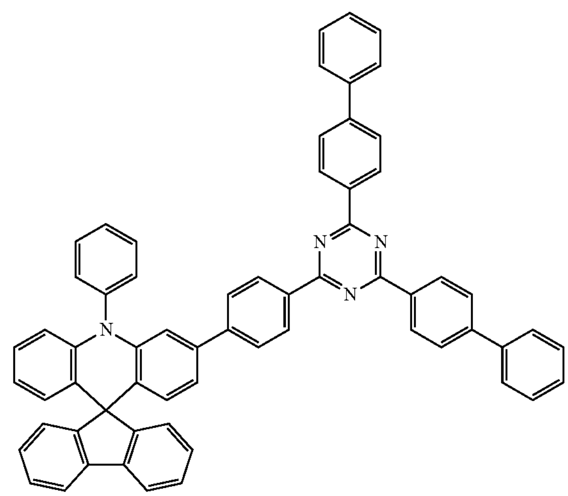
-continued
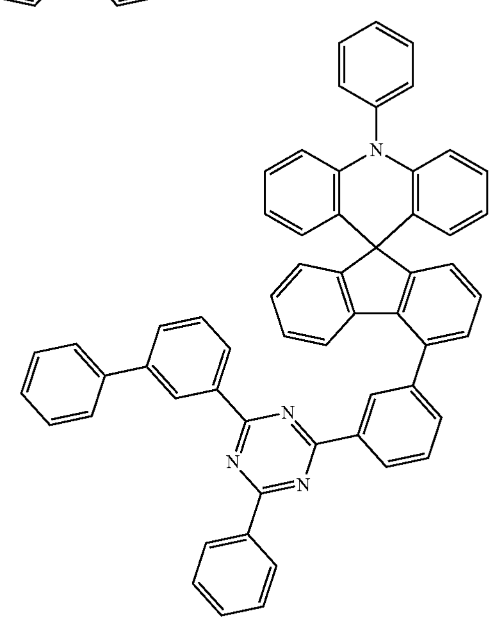

-continued
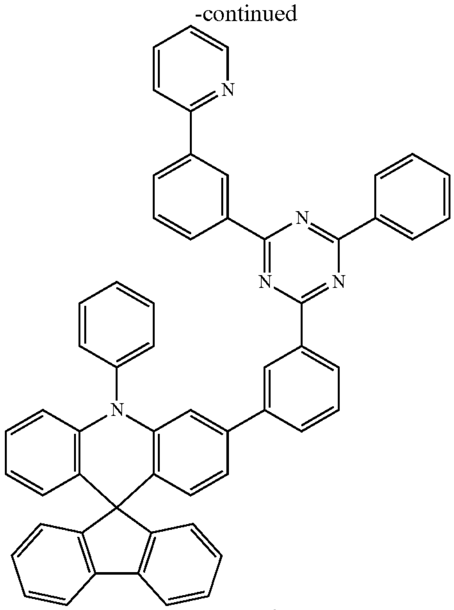
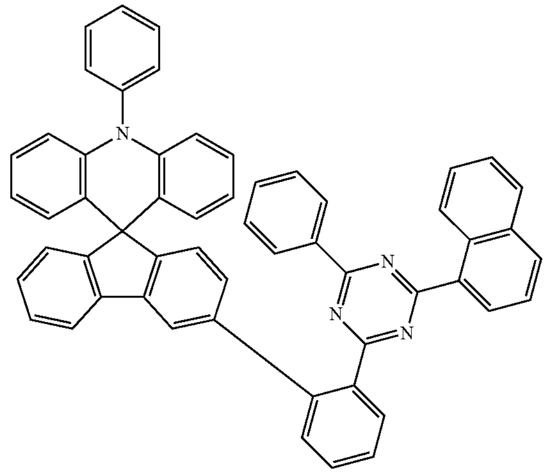
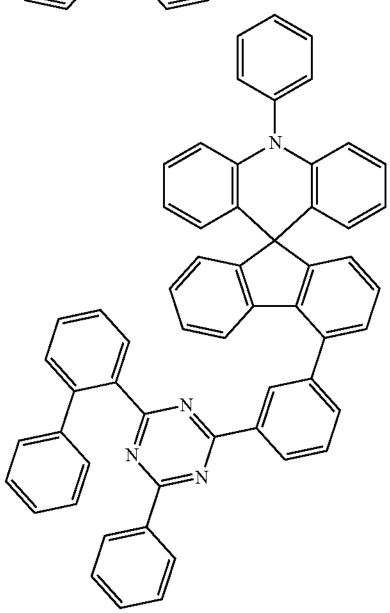
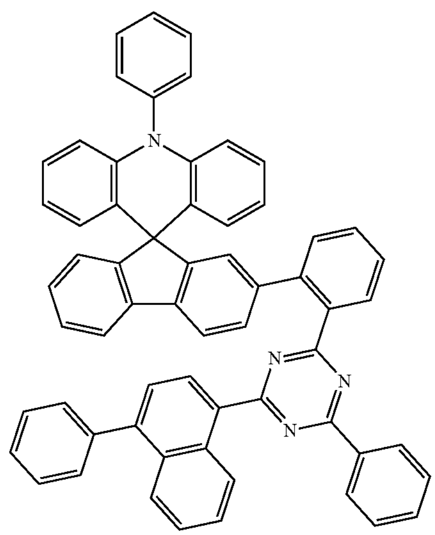
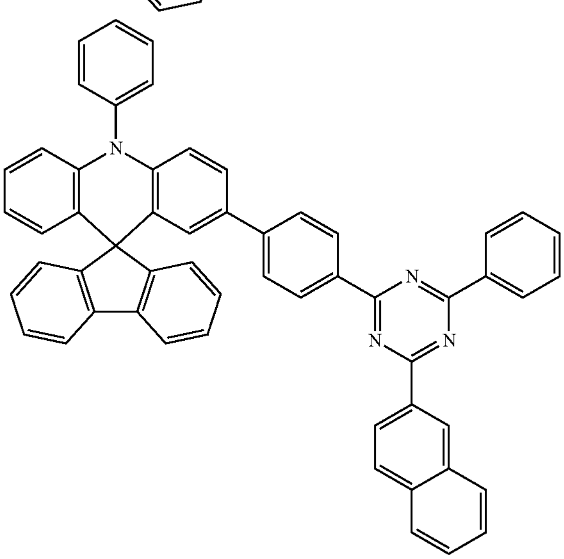
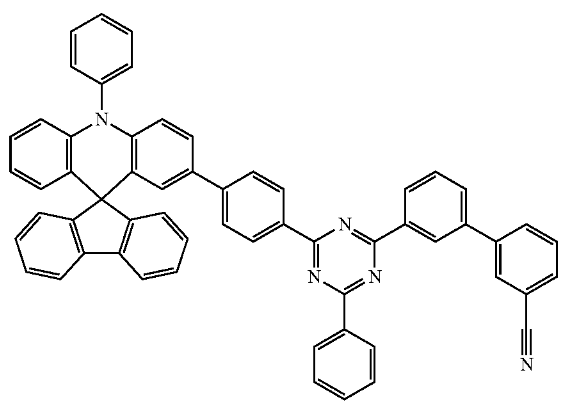
-continued -continued
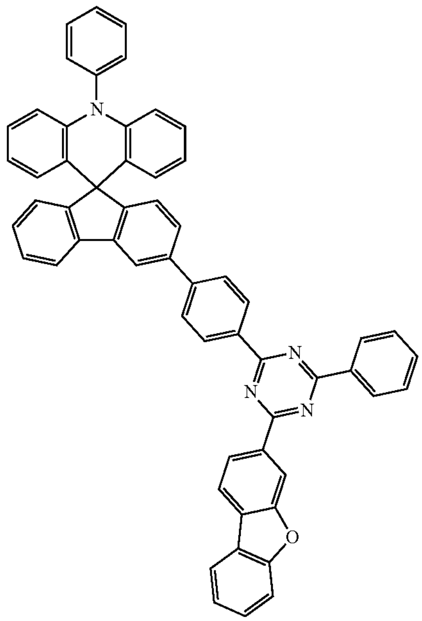
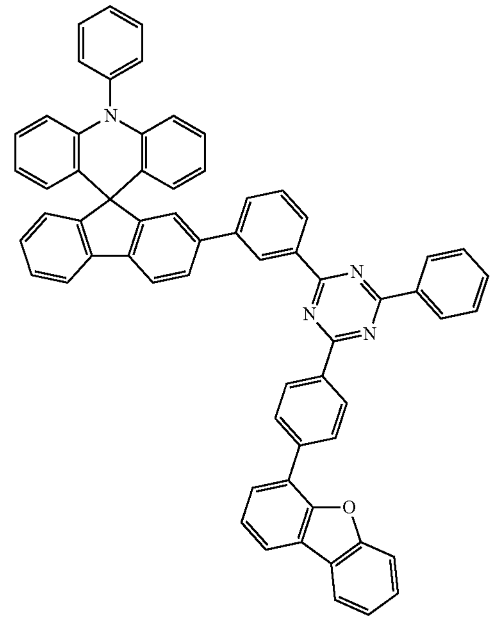
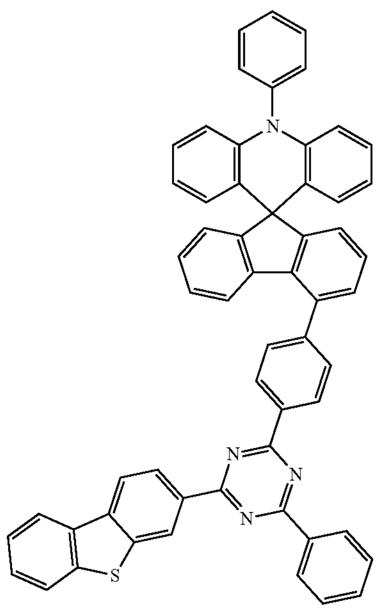
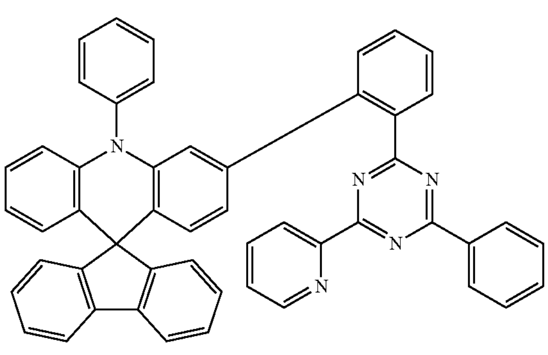
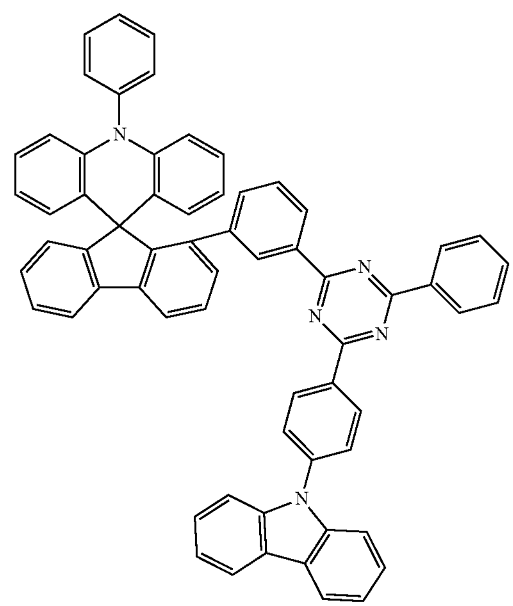

-continued
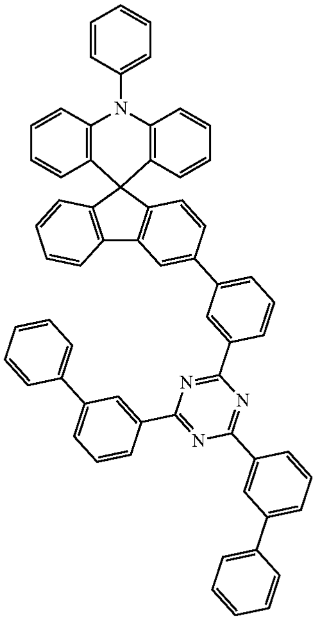
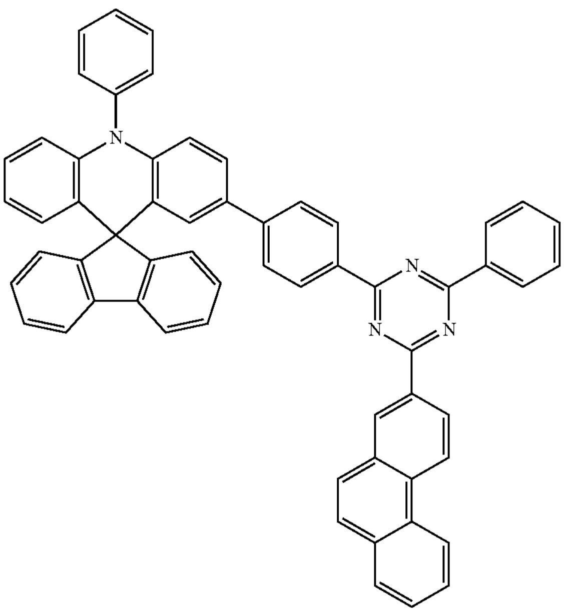
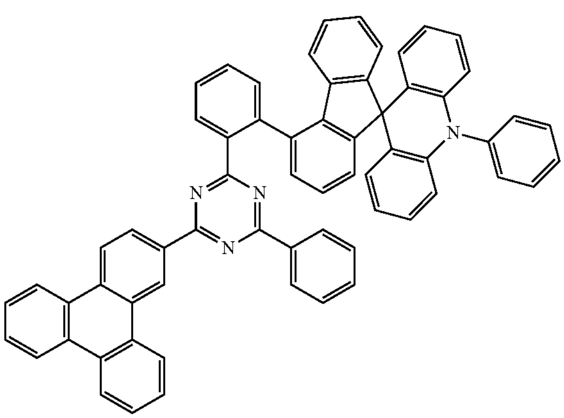
-continued
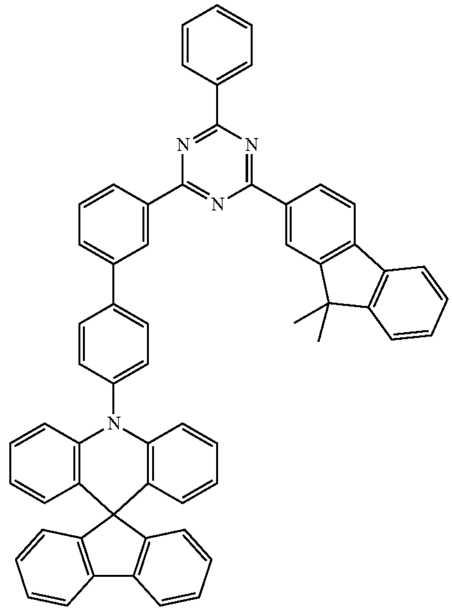
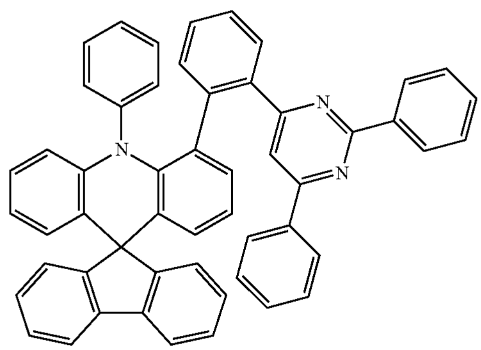
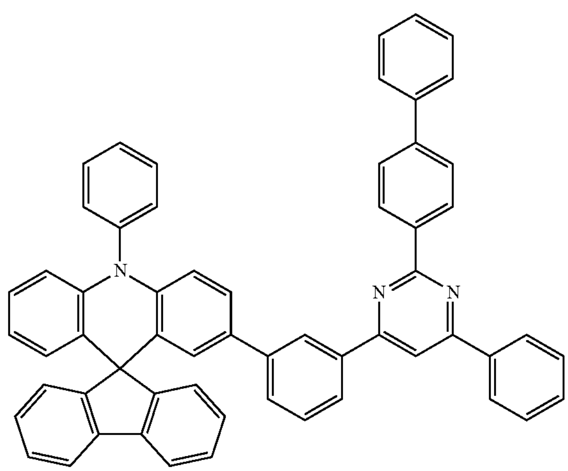

-continued
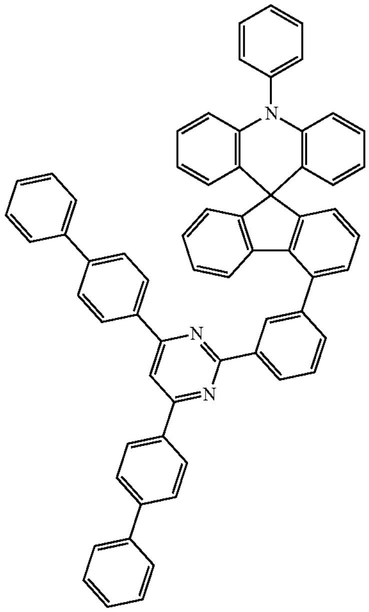
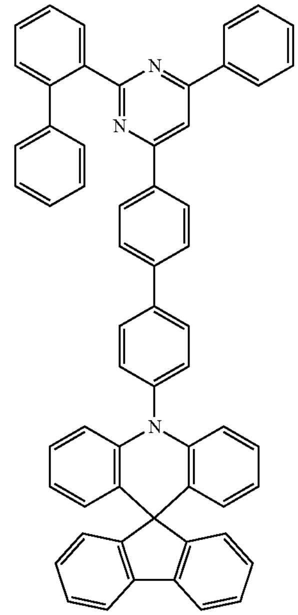
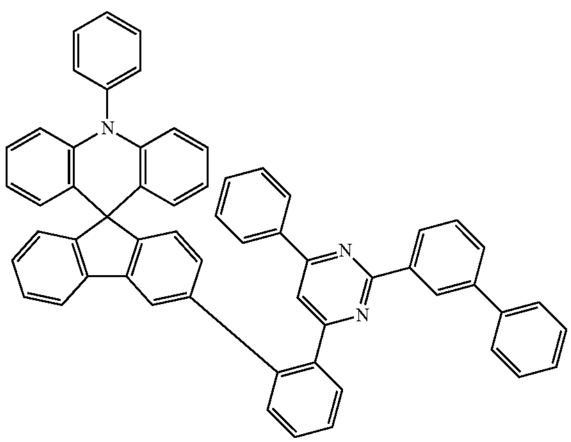
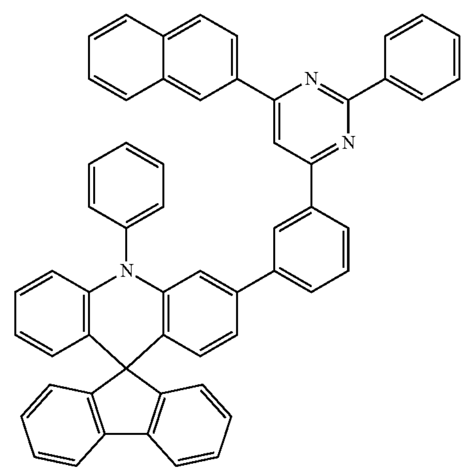
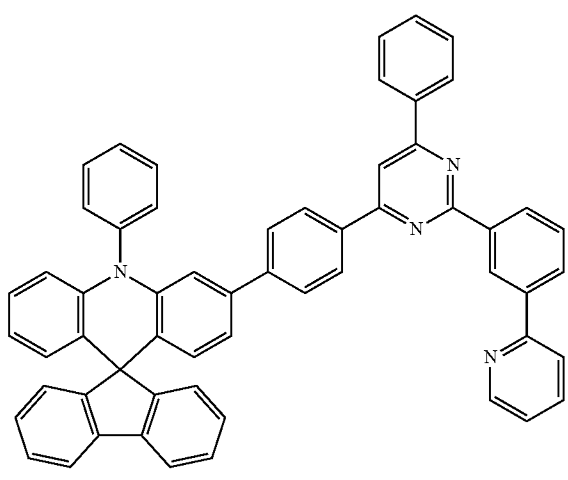
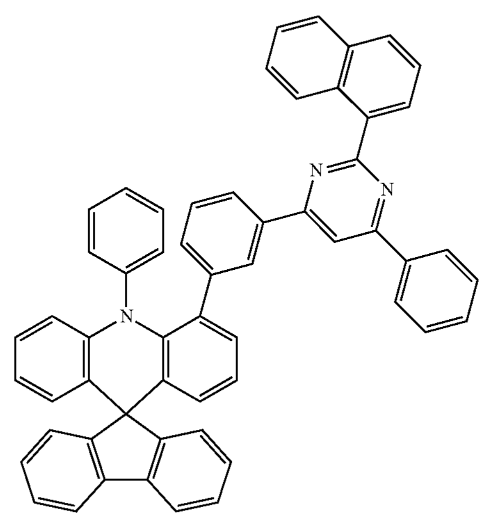
-continued -continued
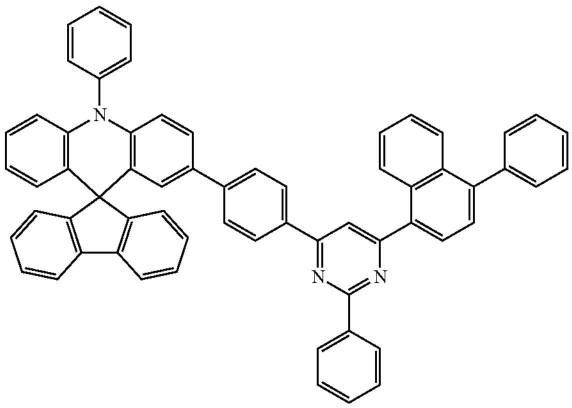
-continued
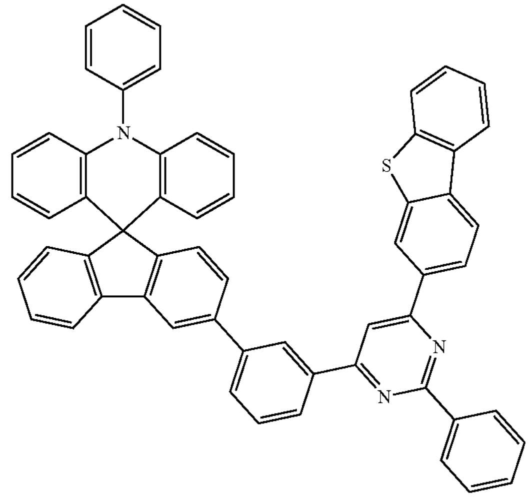
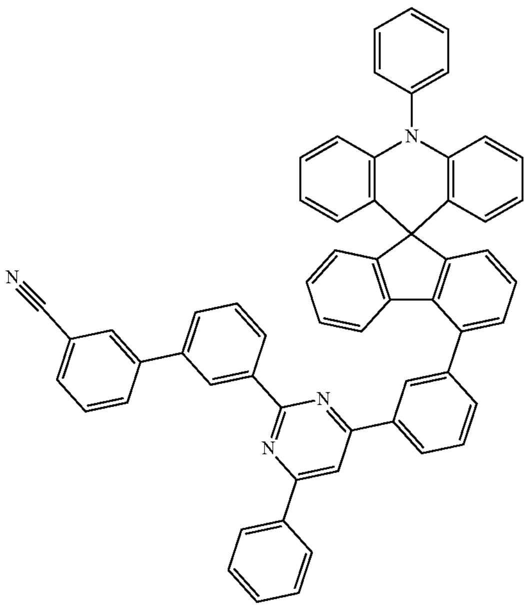
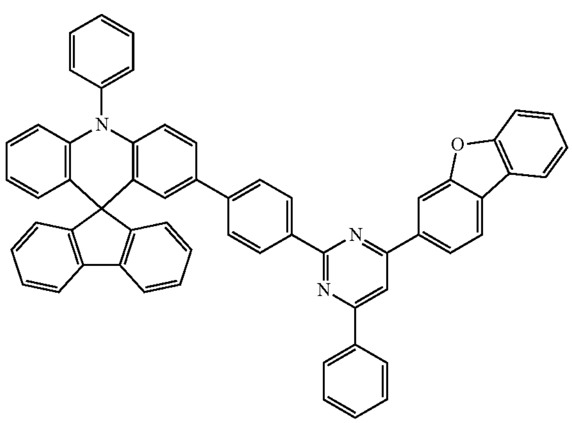
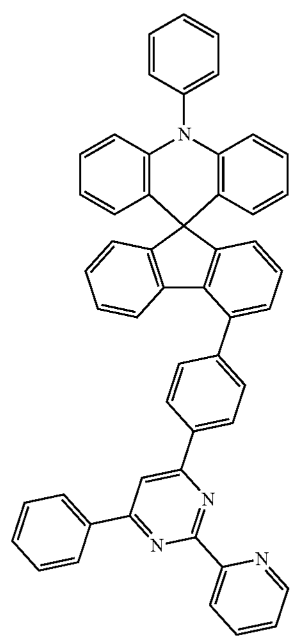

-continued
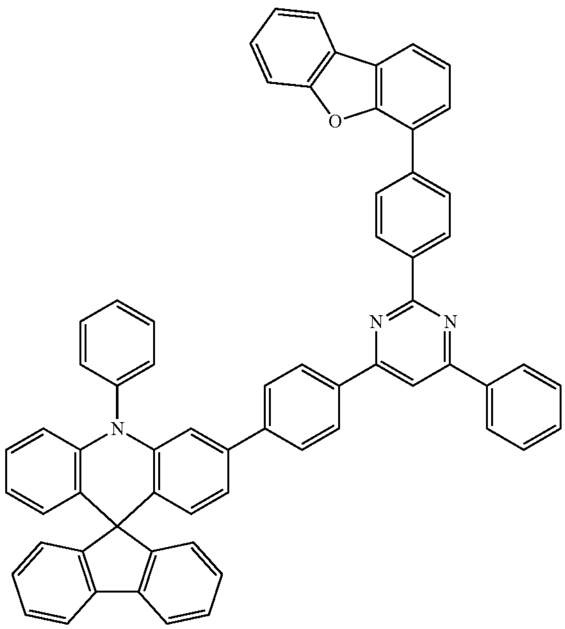
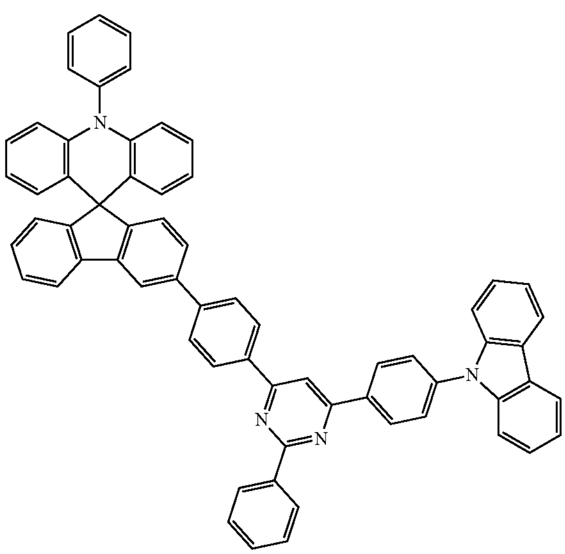
-continued
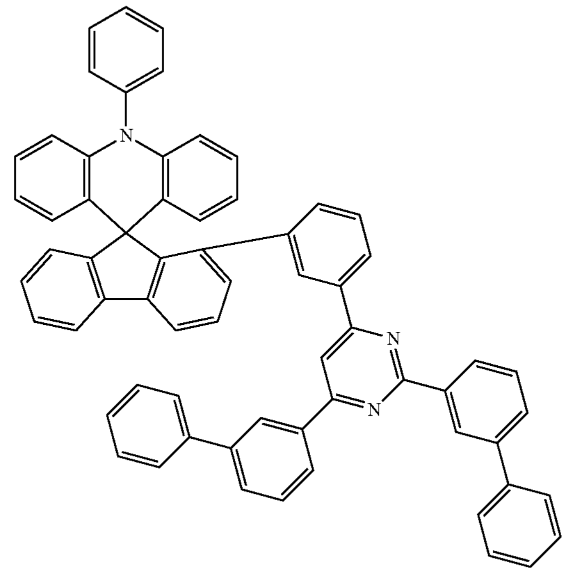
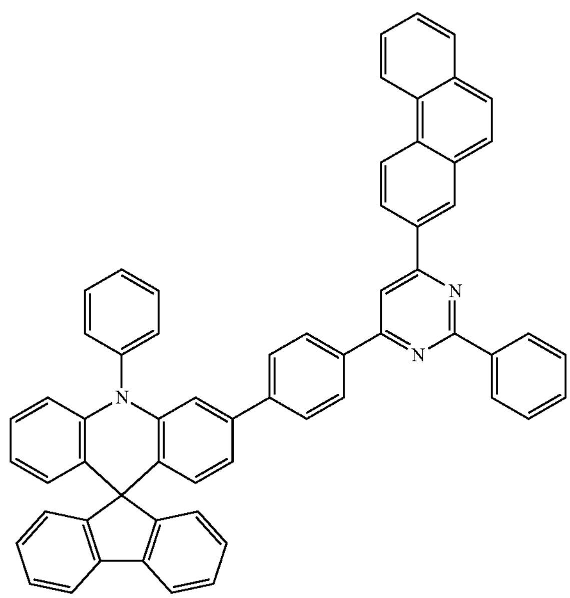
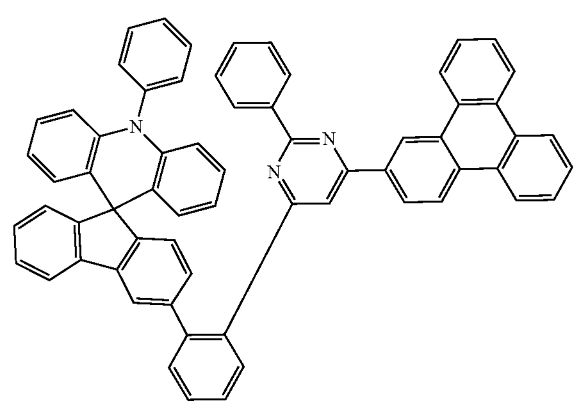

-continued
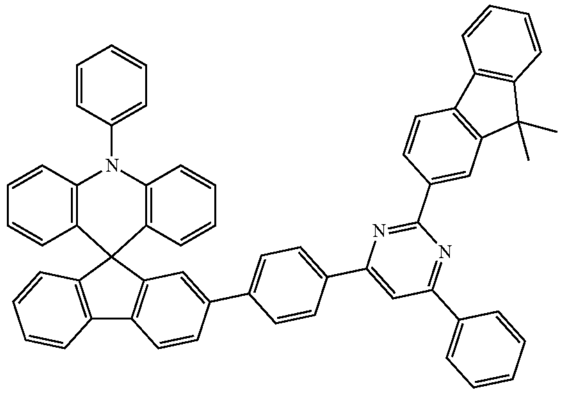
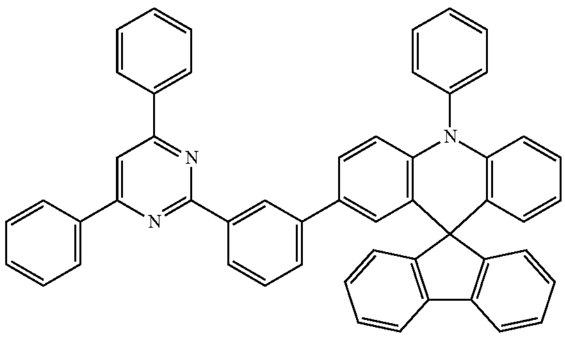
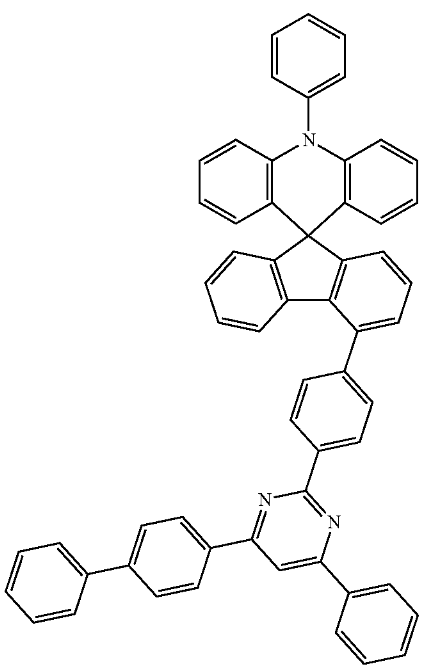
-continued
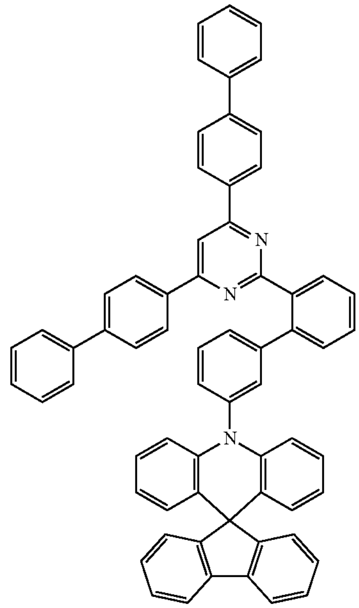
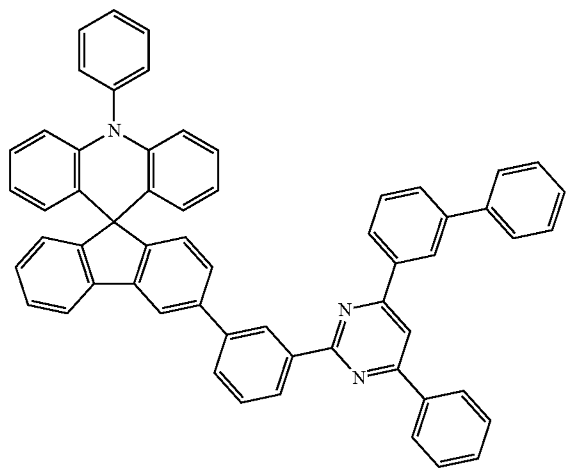
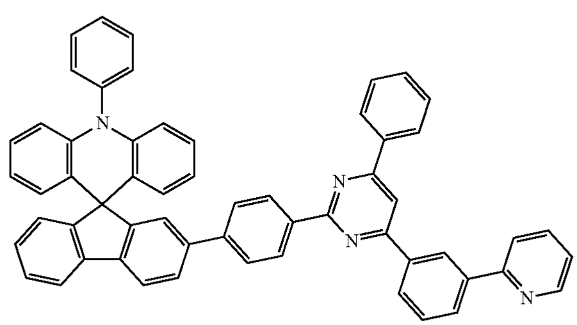

-continued
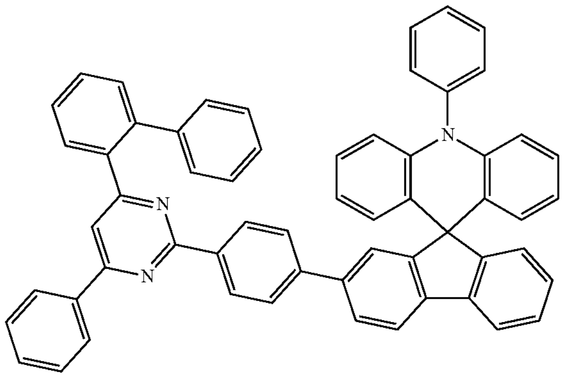
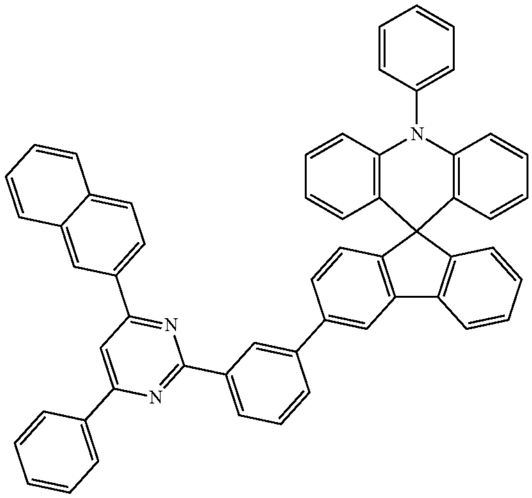
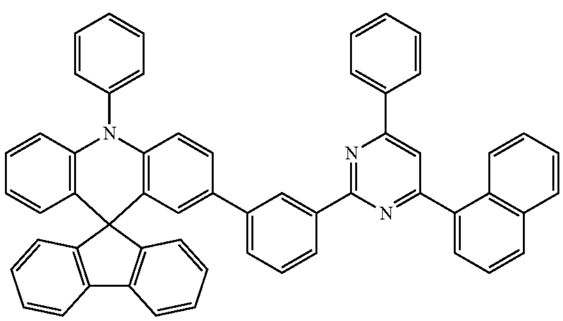
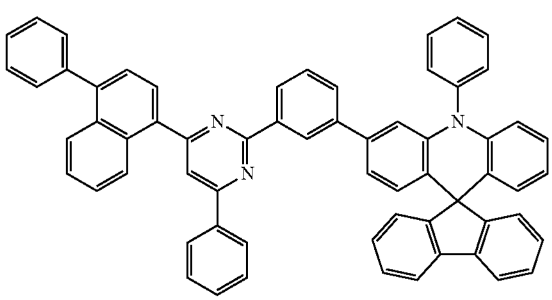
-continued
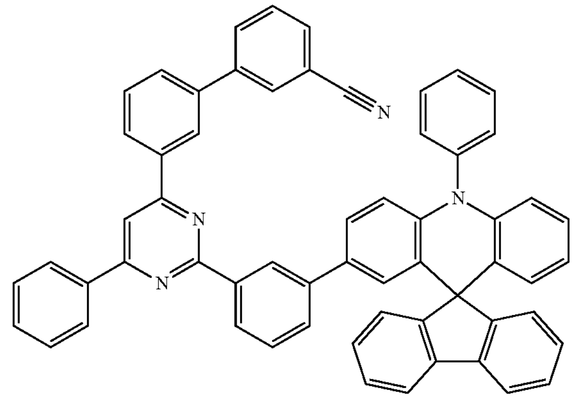
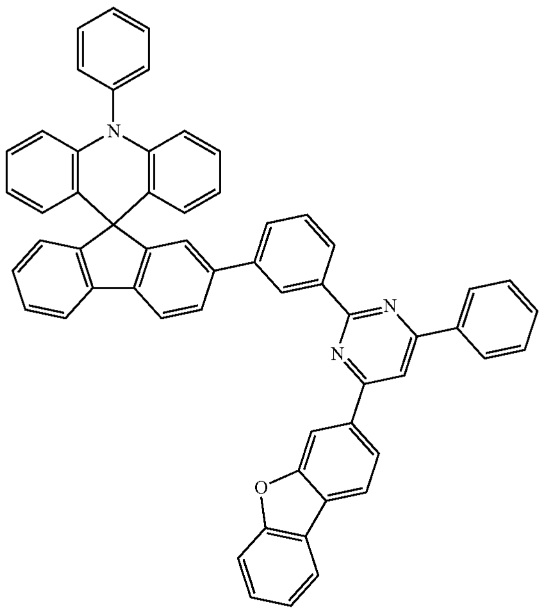
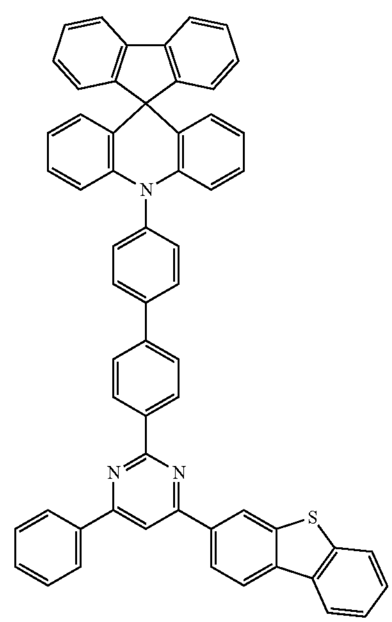

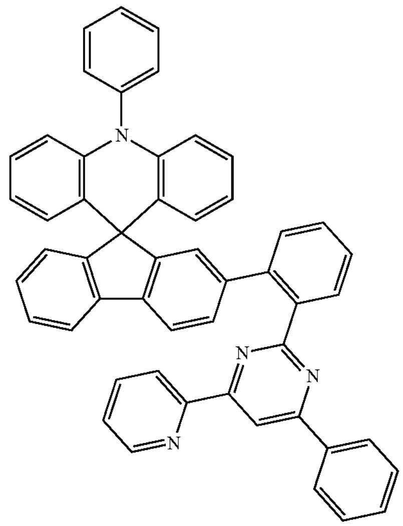
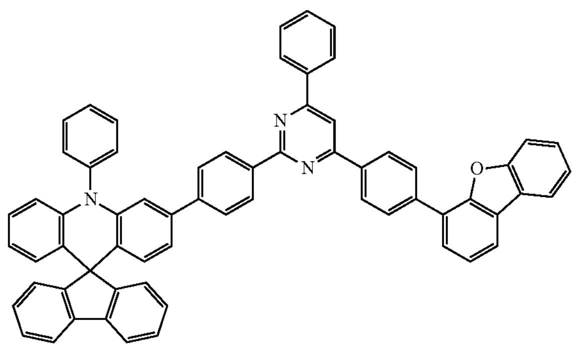
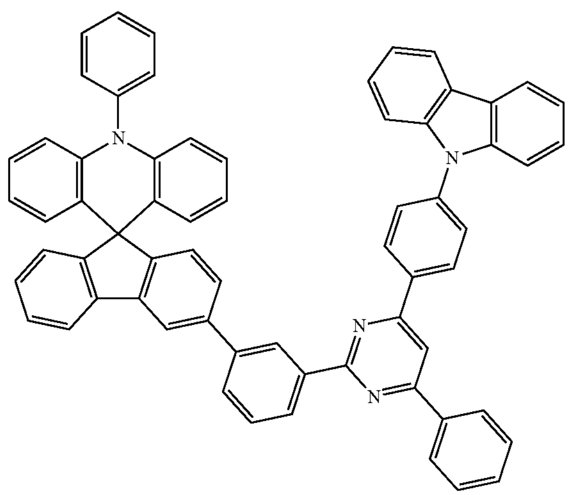
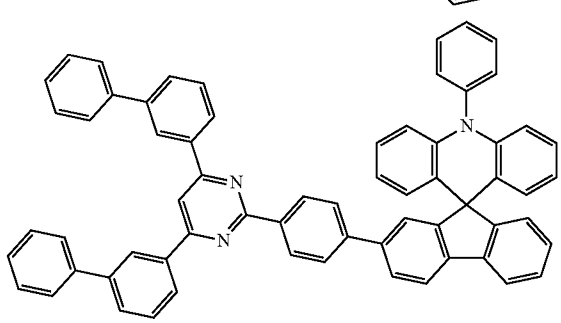
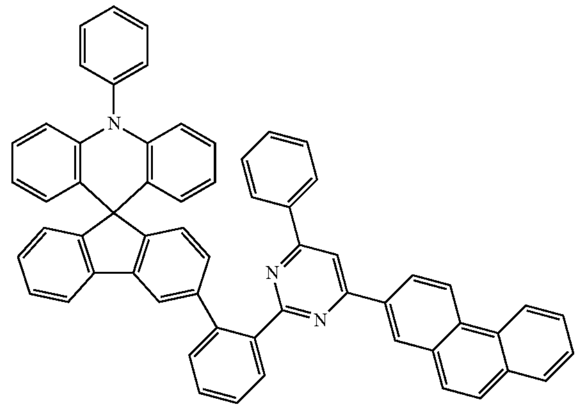
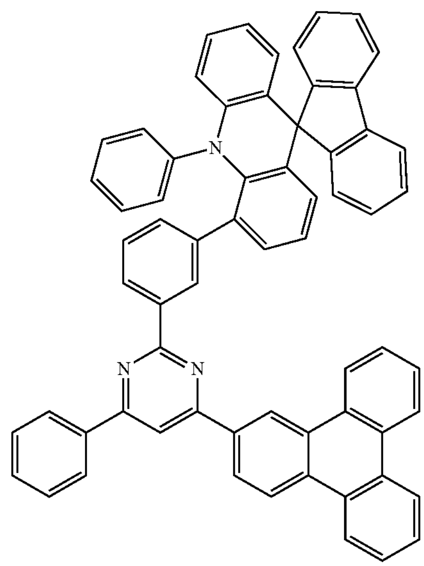
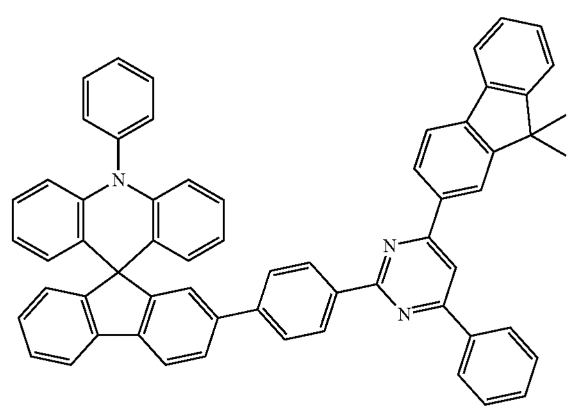

-continued
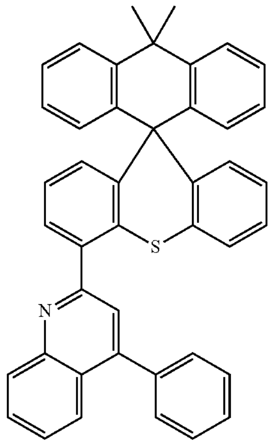
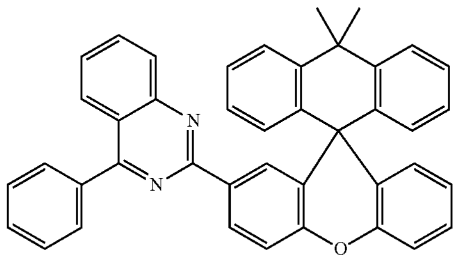
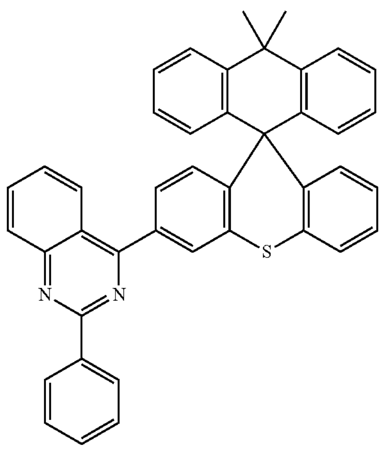
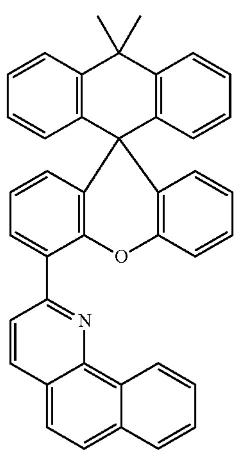
-continued
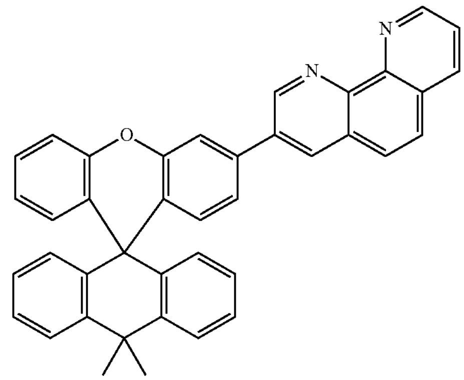
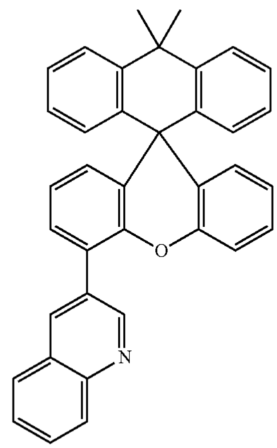
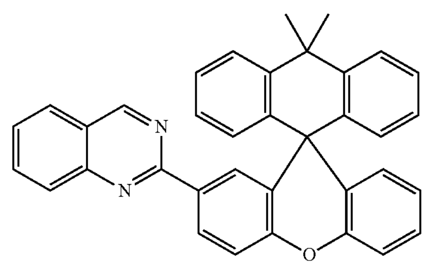
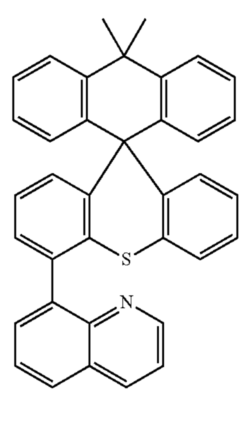

-continued
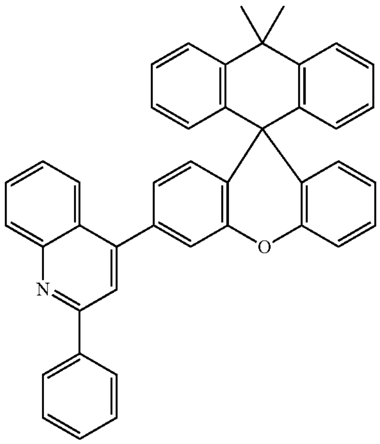
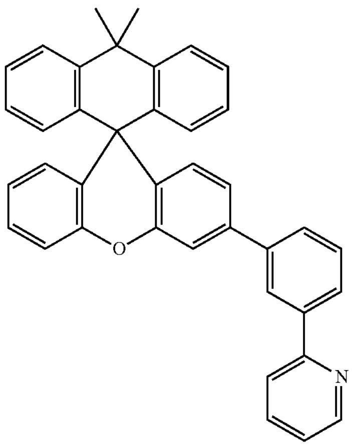
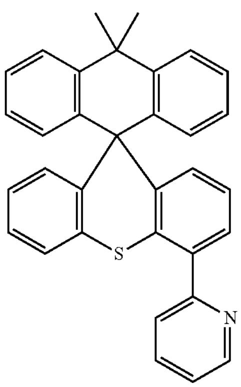
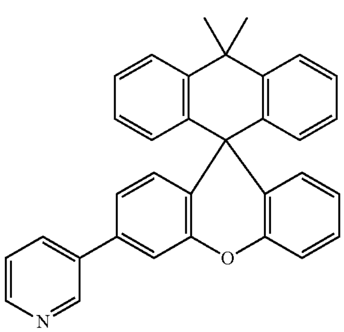
-continued
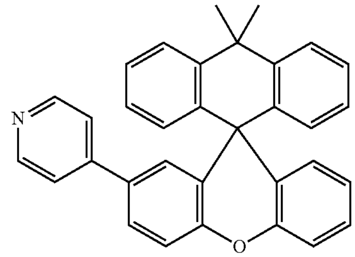
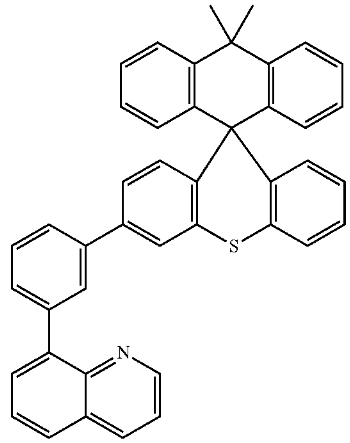
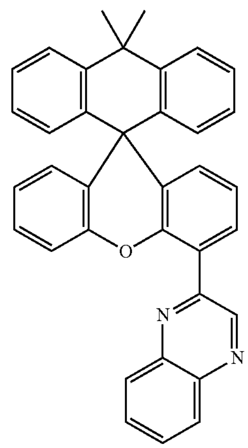
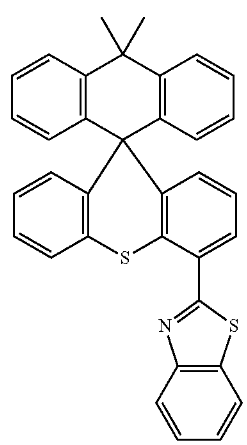

-continued
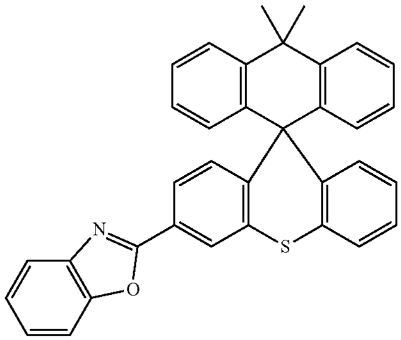
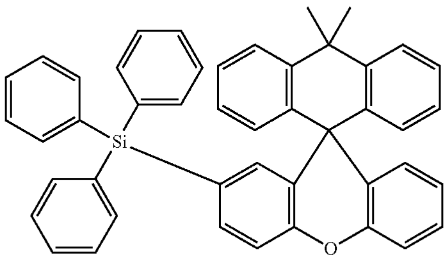
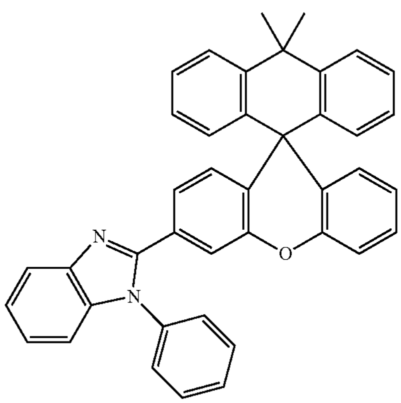
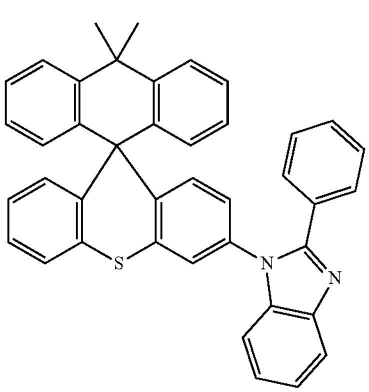
-continued
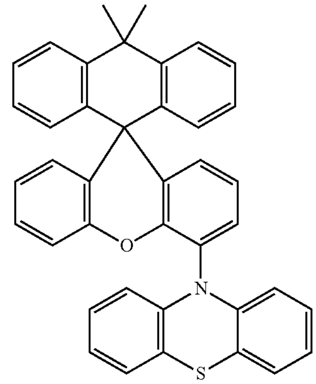
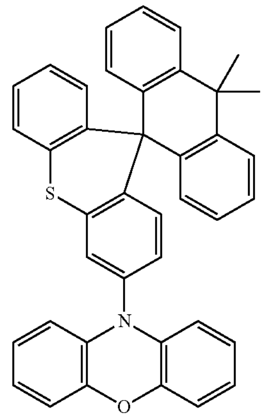
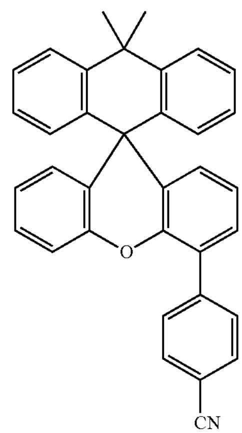
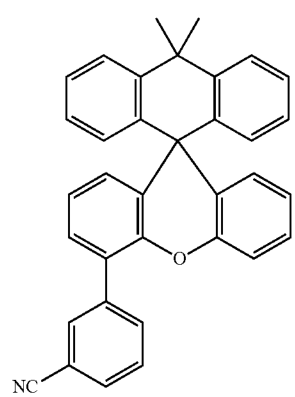

-continued
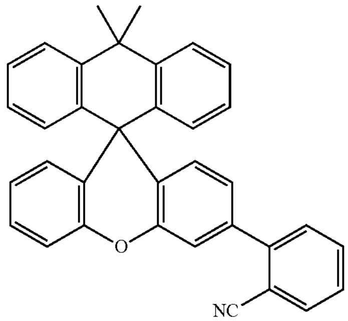
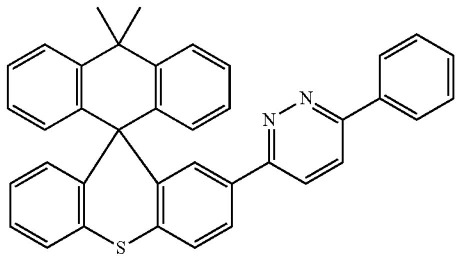
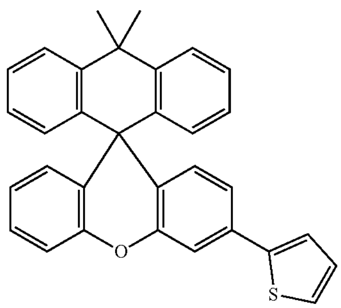
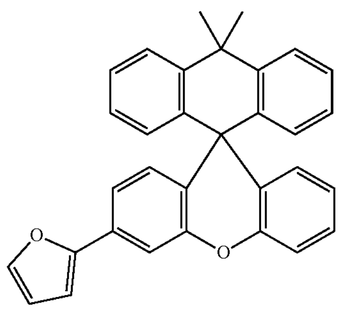
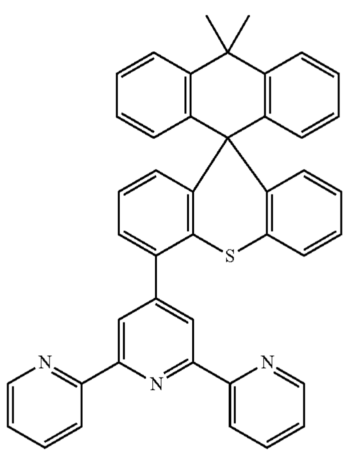
-continued
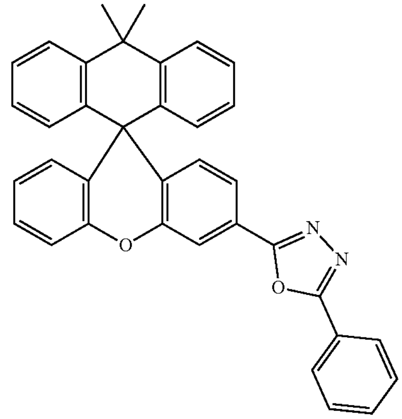
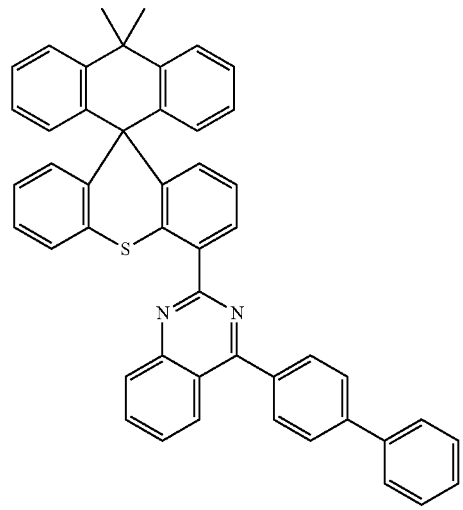
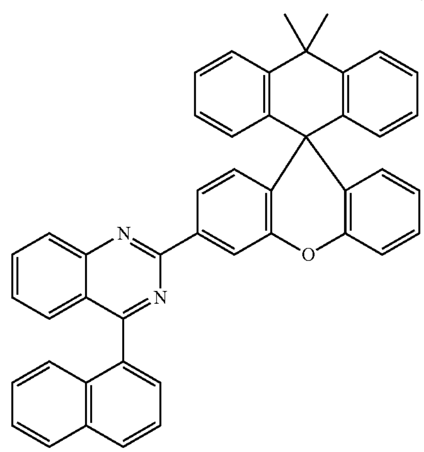
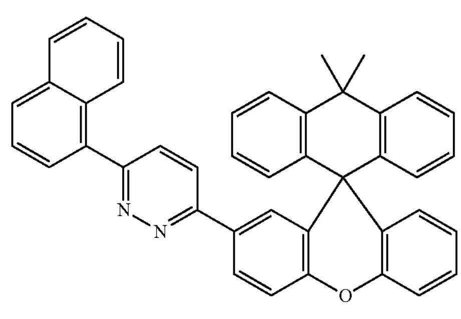

-continued
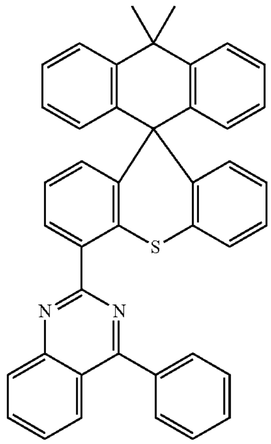
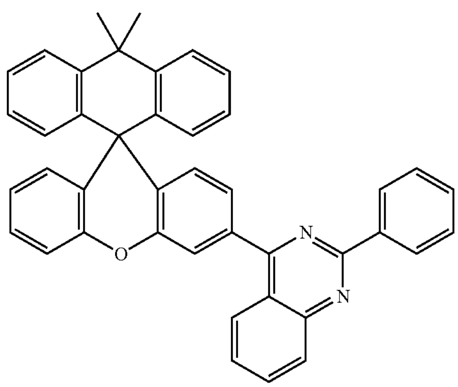
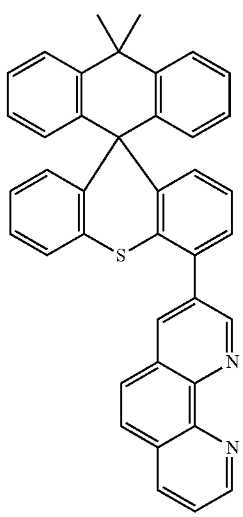
-continued
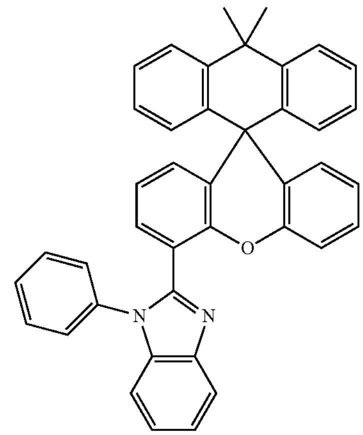
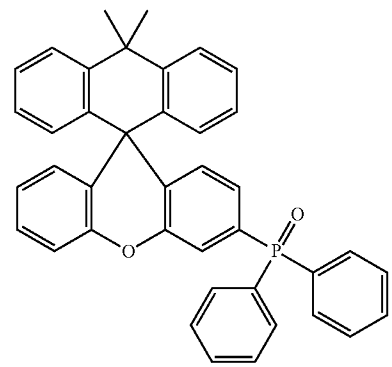
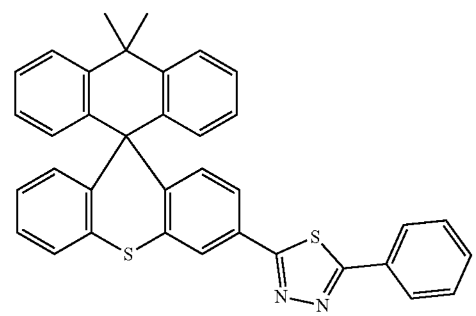
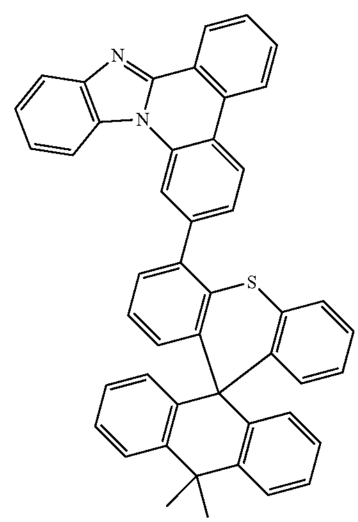

-continued
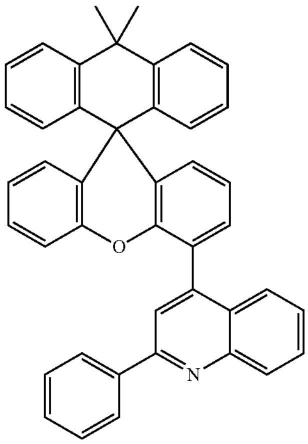
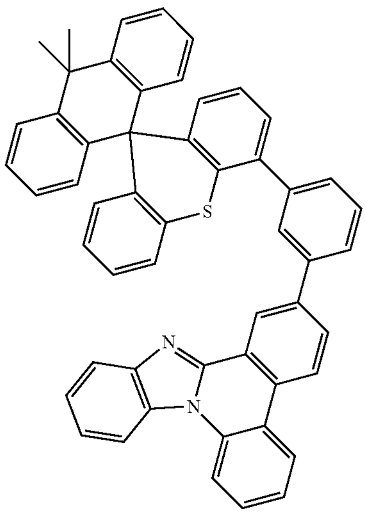
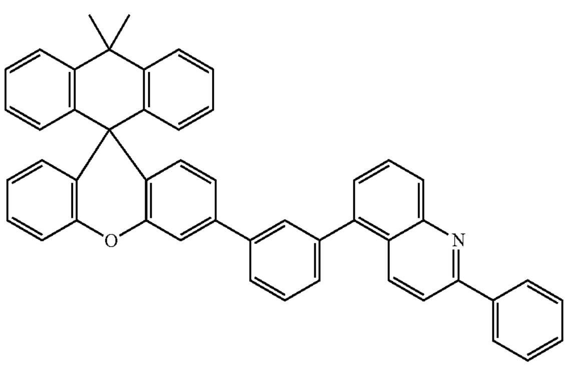
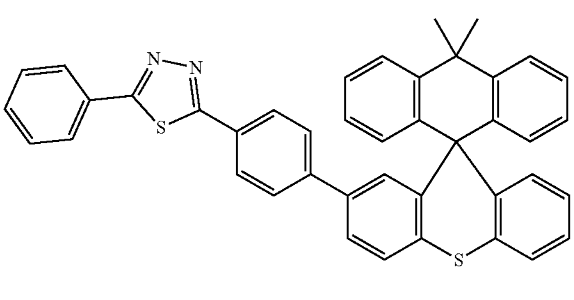
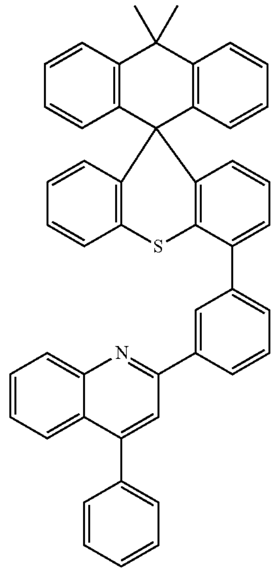
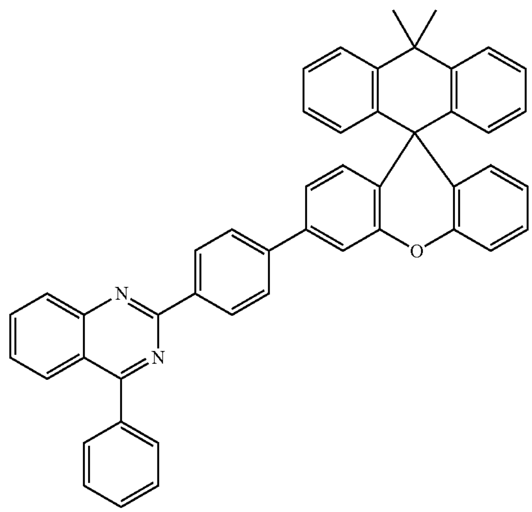
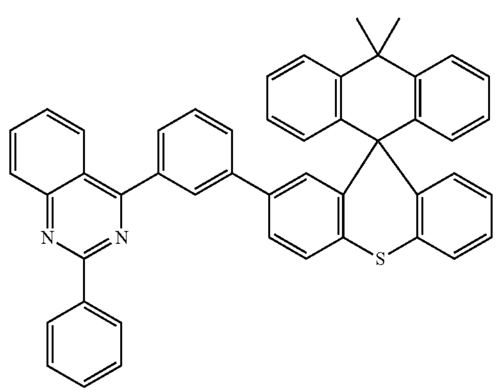
-continued -continued
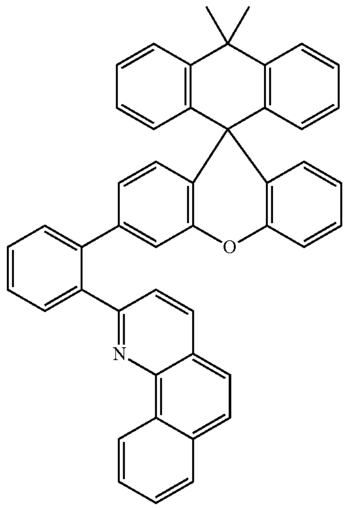
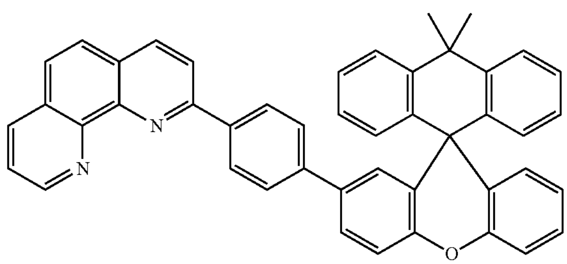
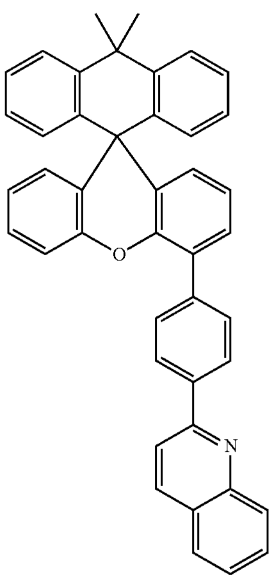
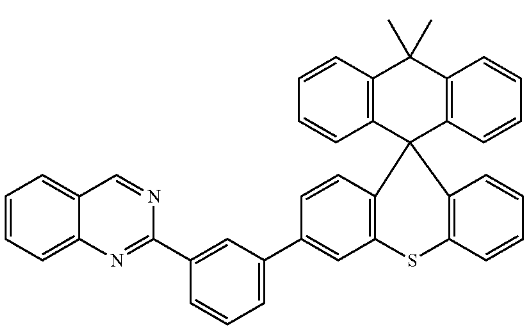
-continued
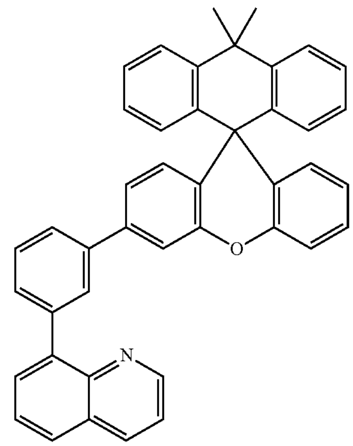
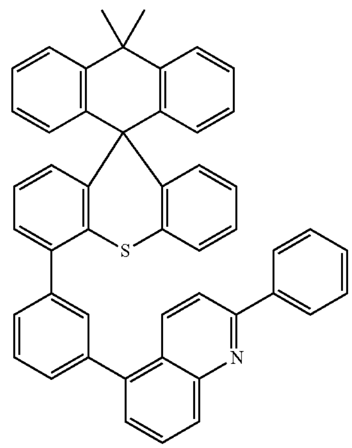
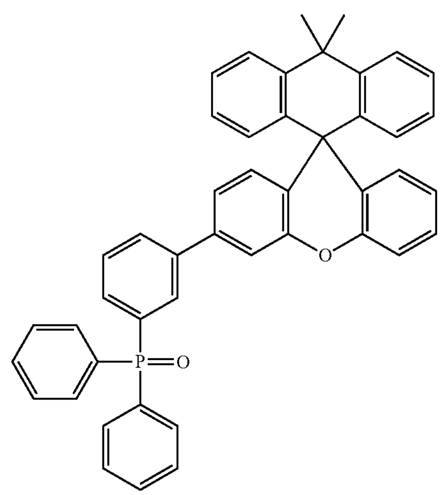
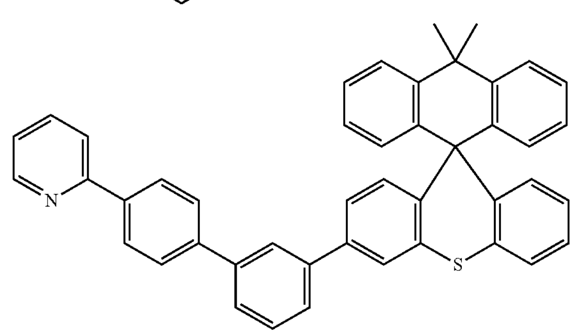

-continued
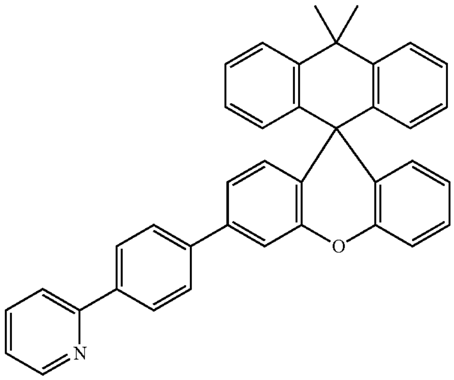
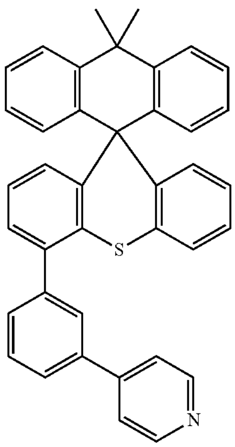
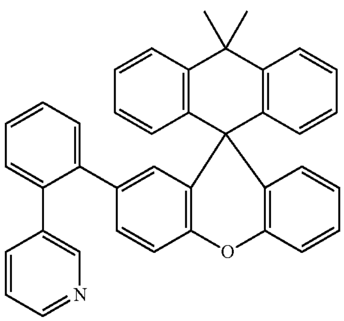
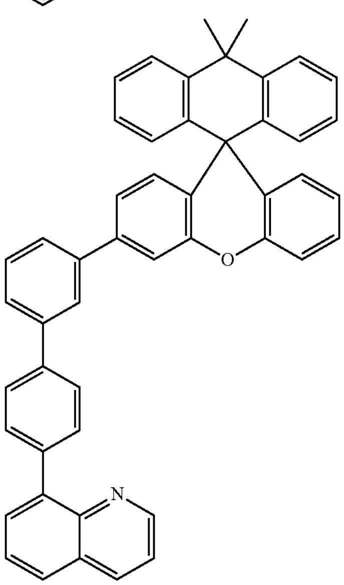
-continued
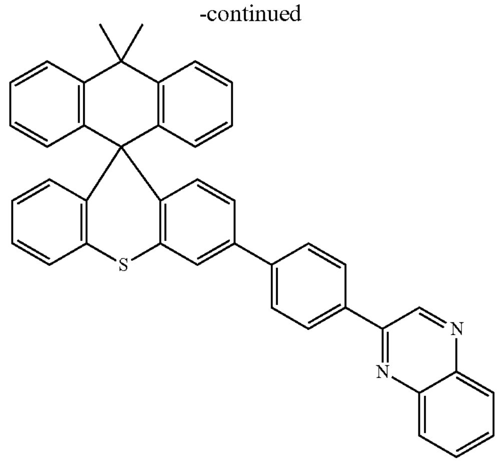
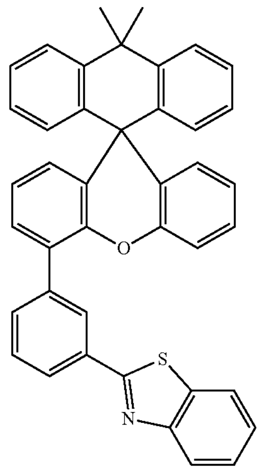
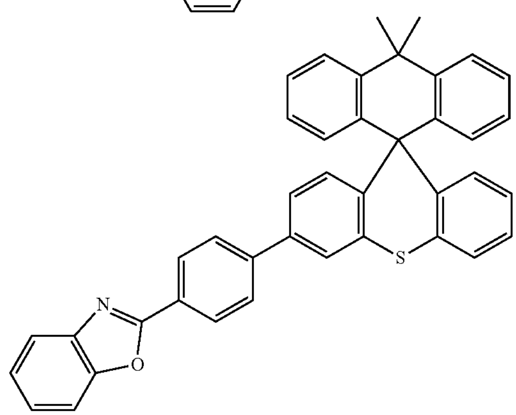
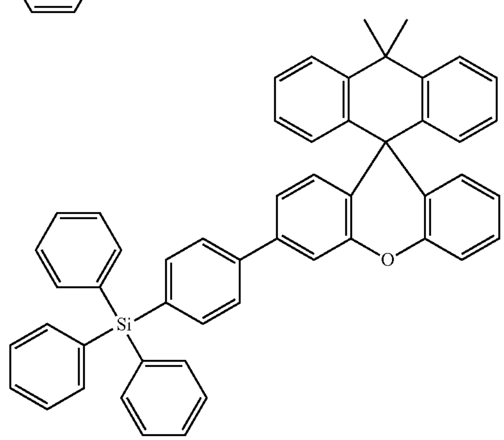

-continued
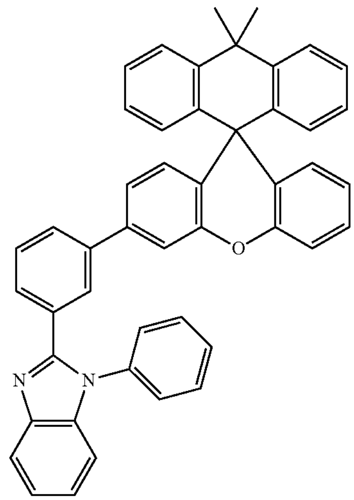
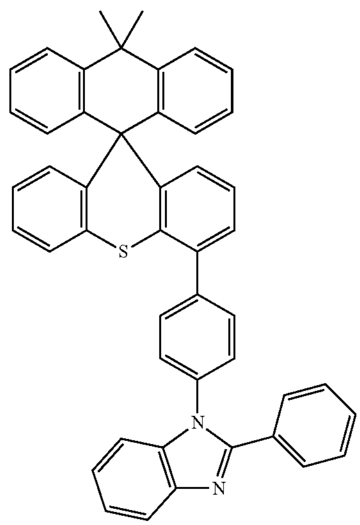
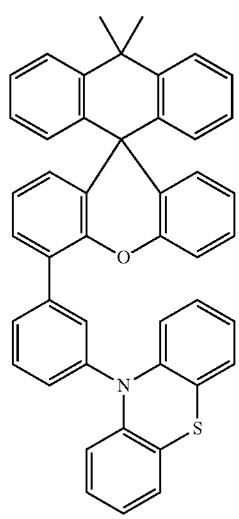
-continued
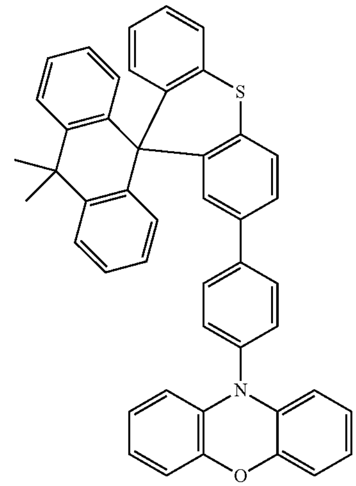
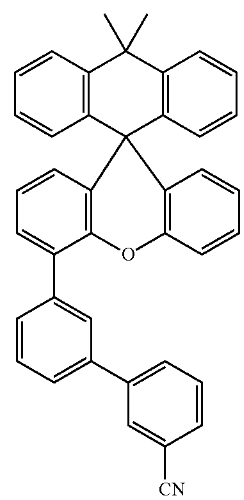
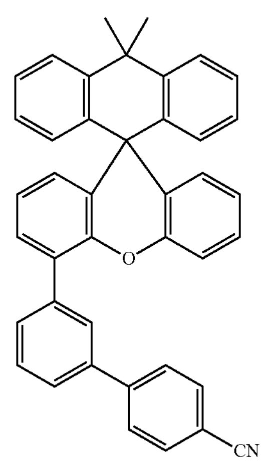

-continued
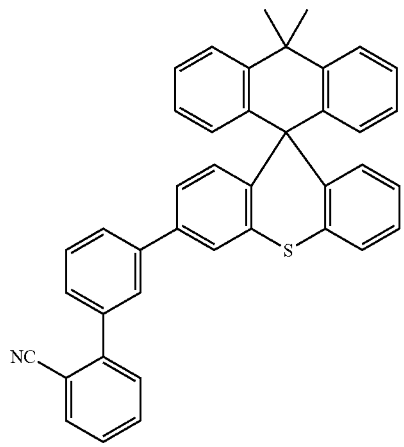
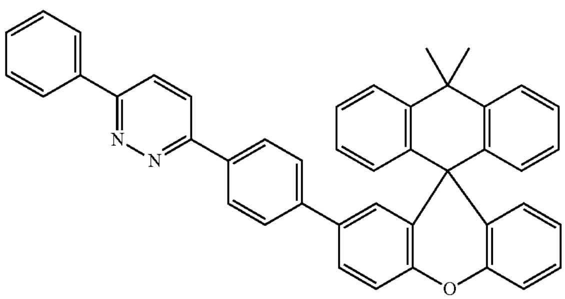
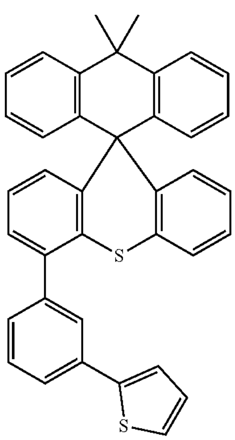
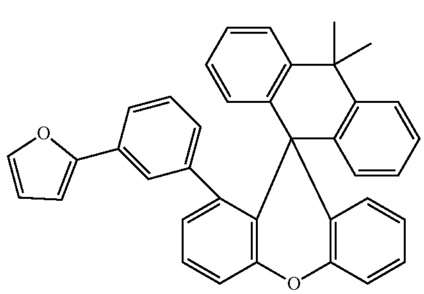
-continued
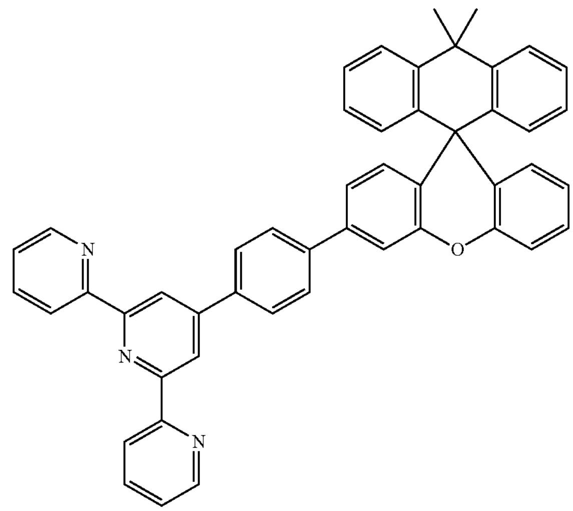
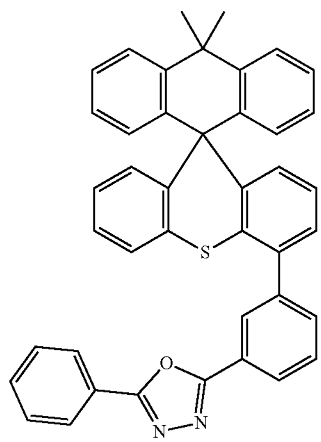
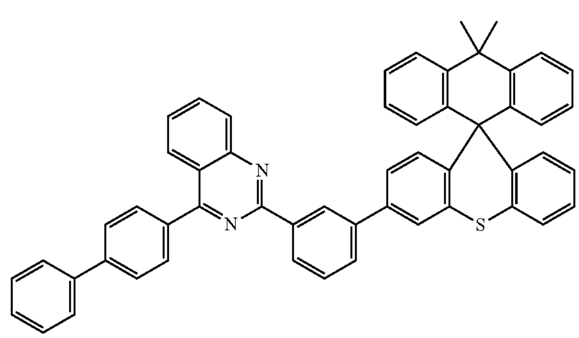

-continued
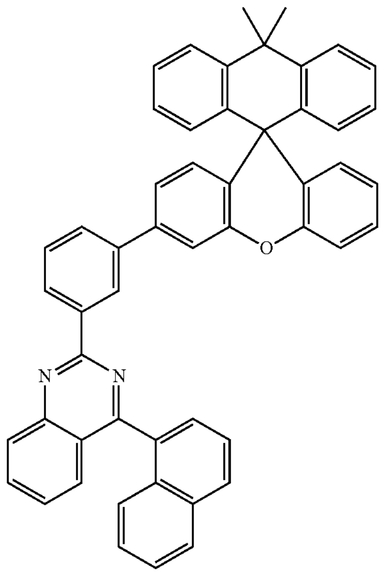
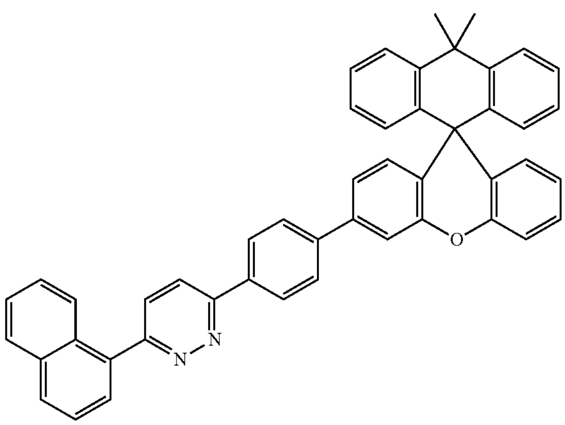
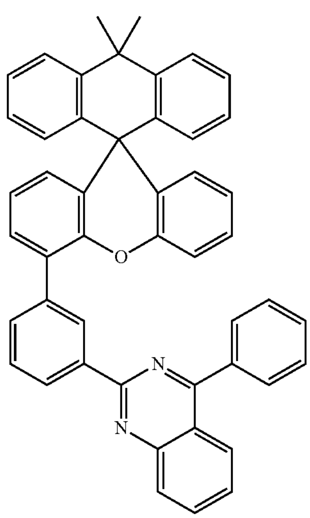
-continued
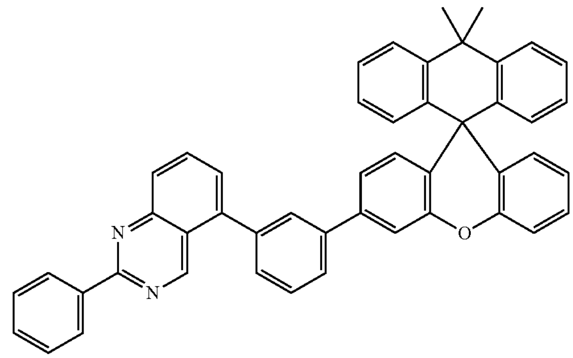
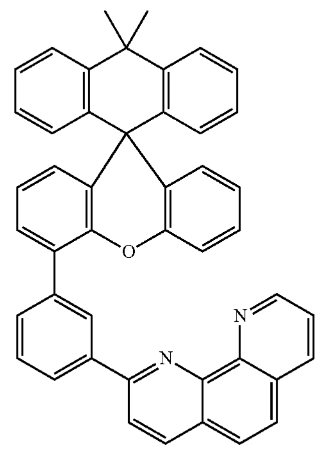
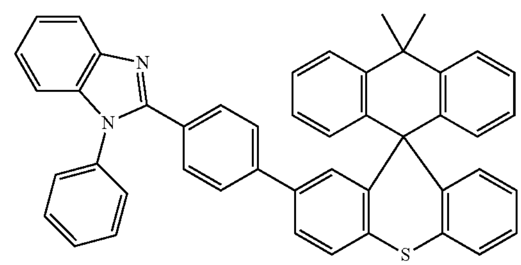
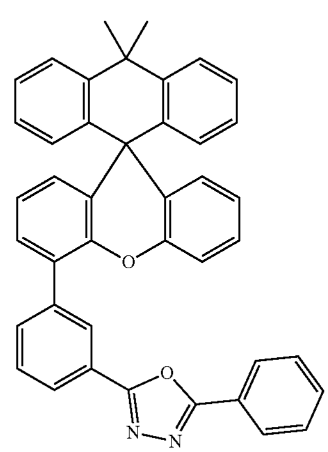

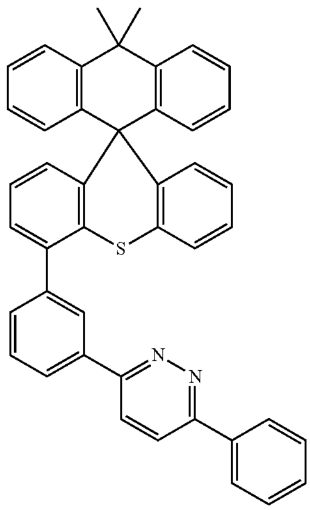
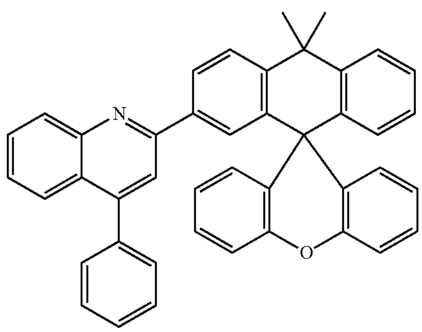
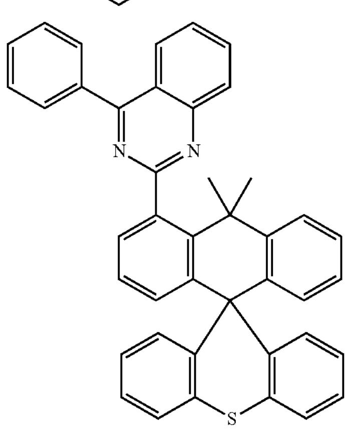
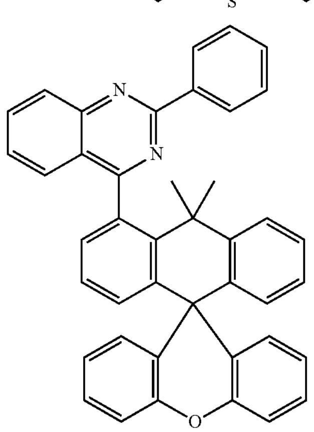
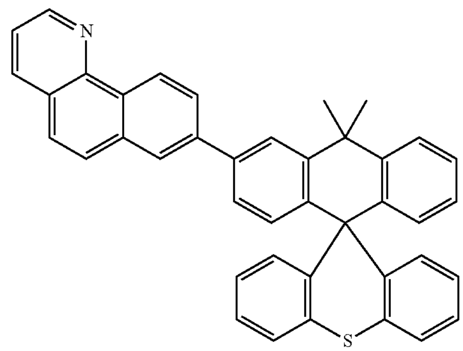
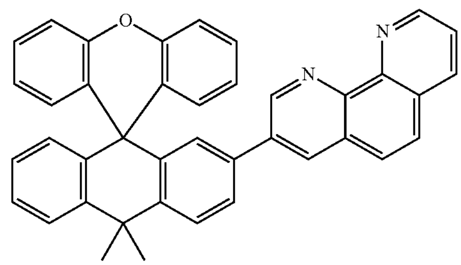
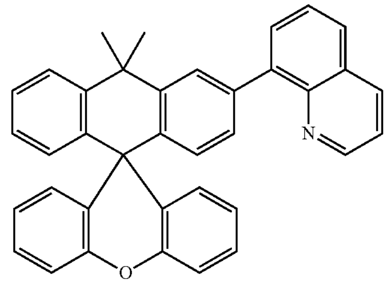
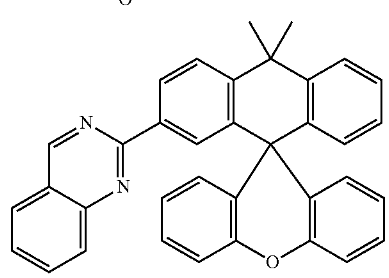
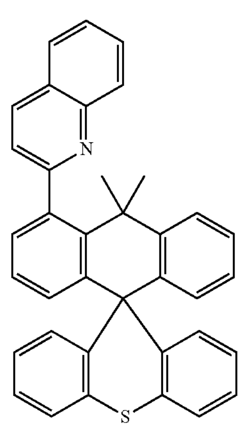

-continued
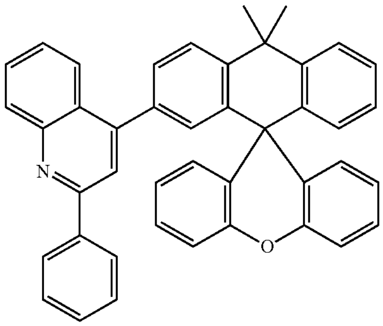
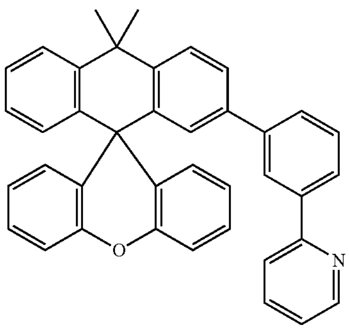
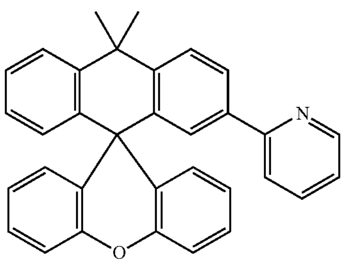
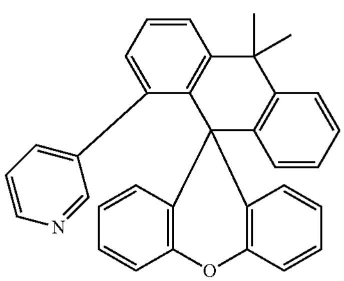
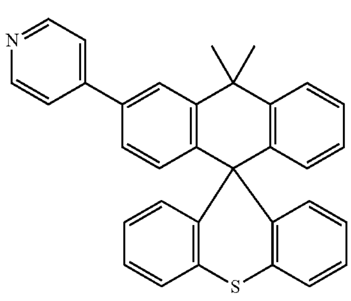
-continued
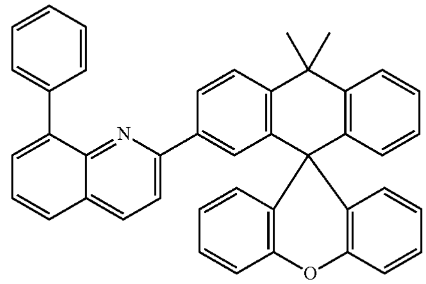
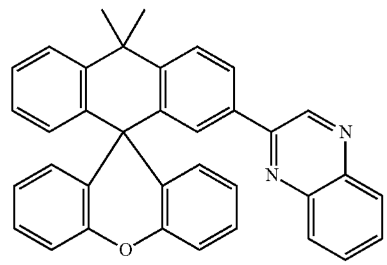
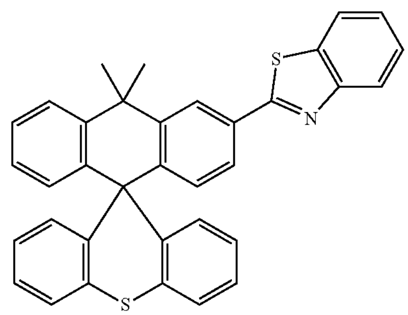
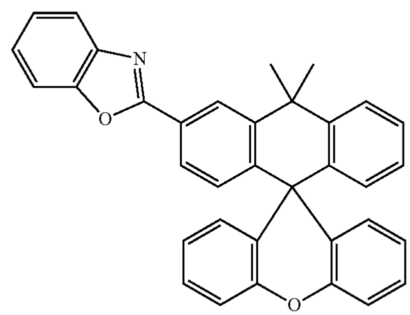
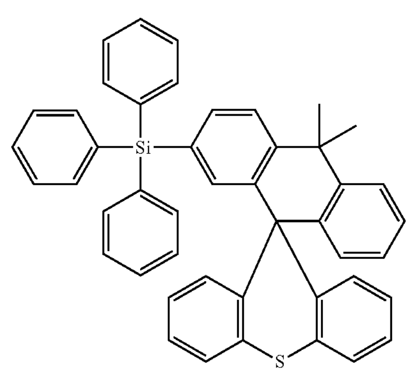

-continued
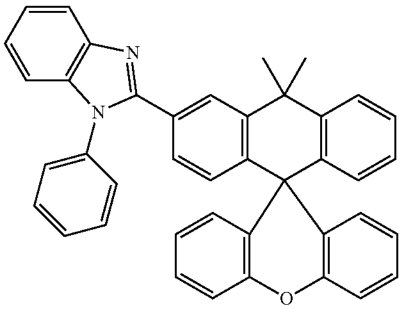
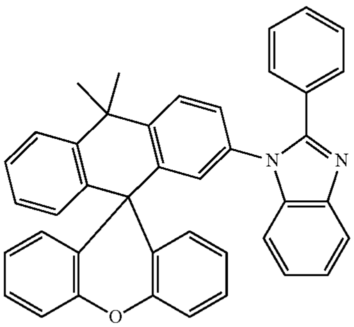
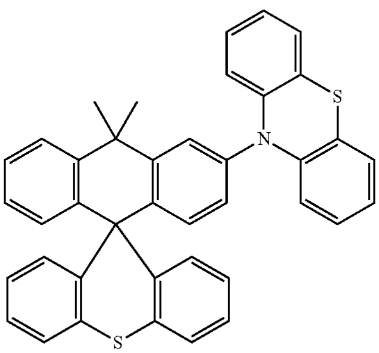
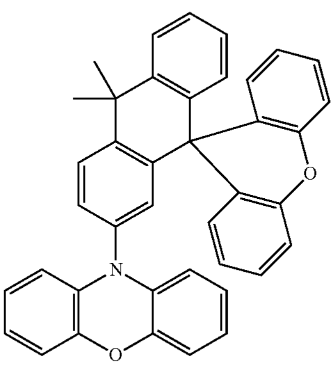
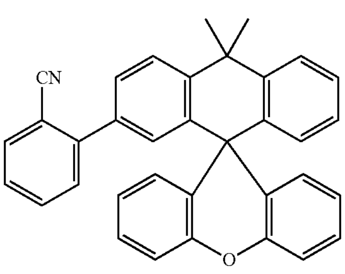
-continued
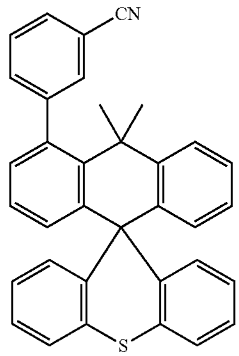
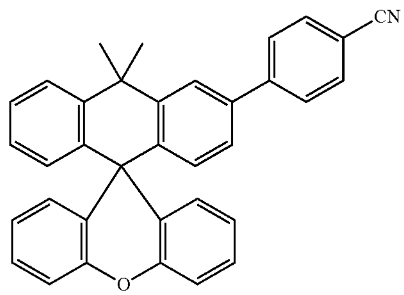
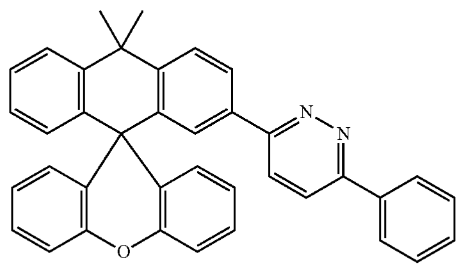
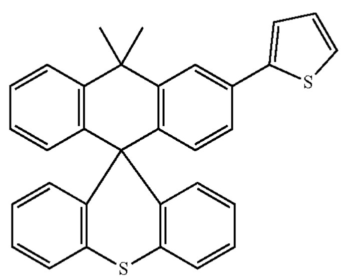
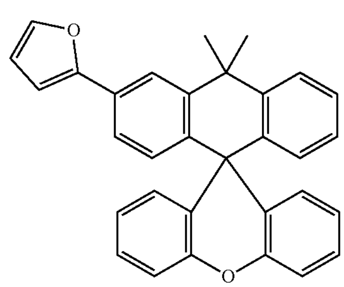

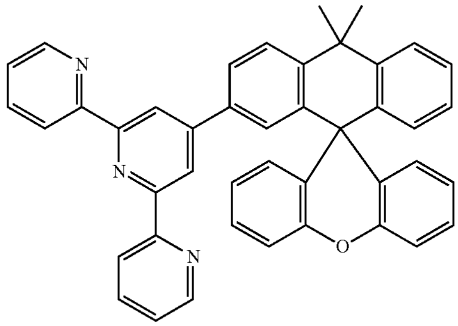
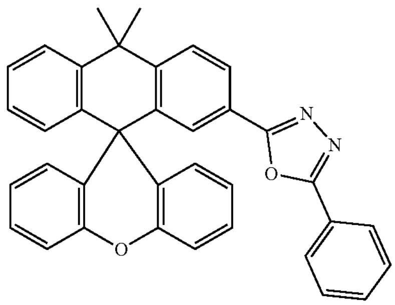
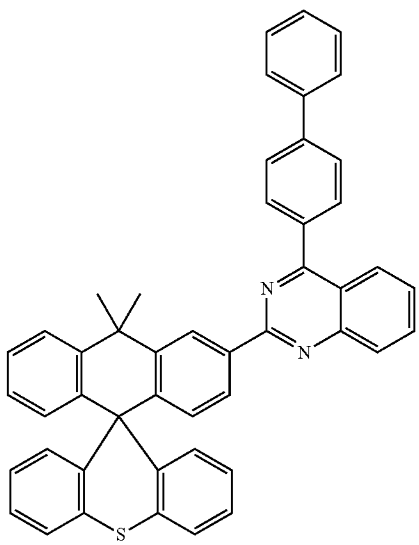
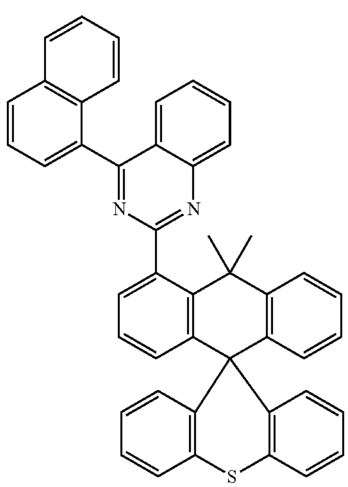
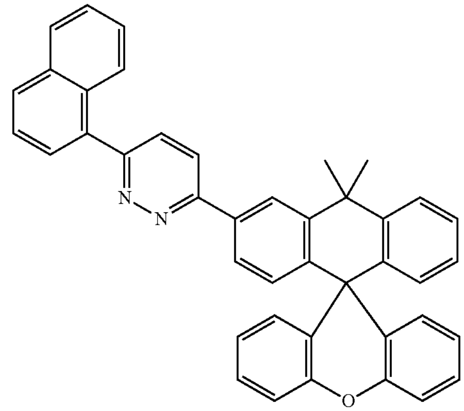
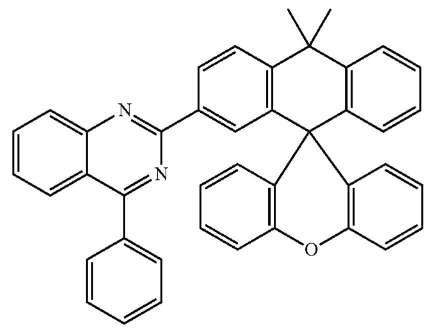
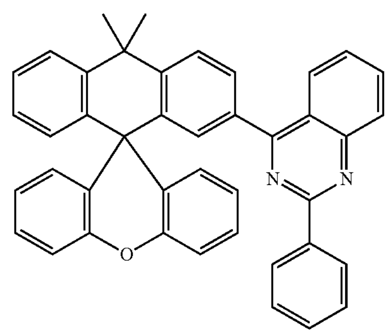
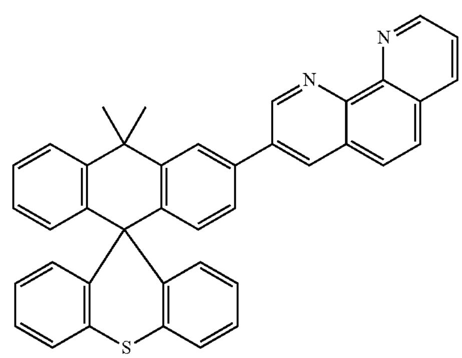
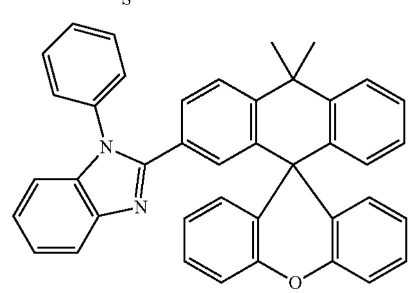

-continued
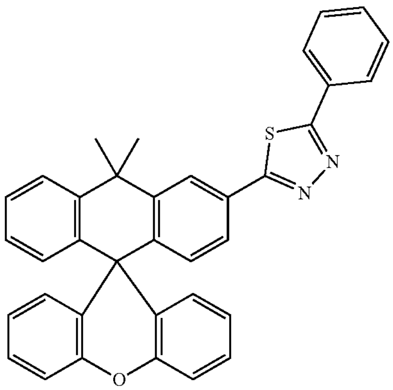
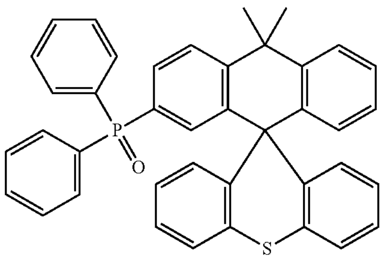
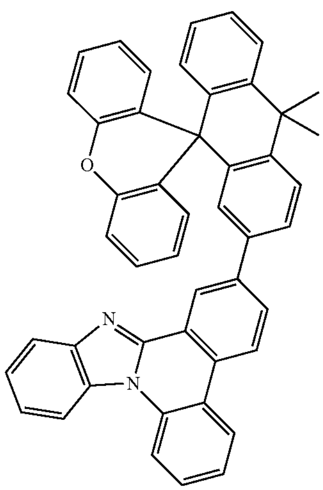
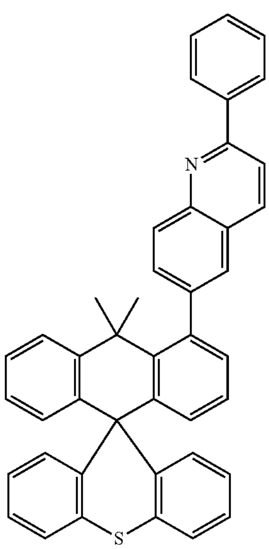
-continued
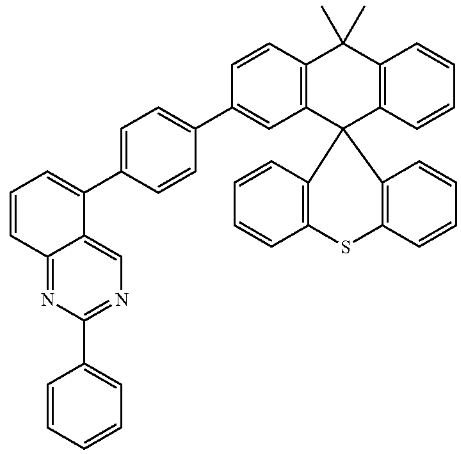
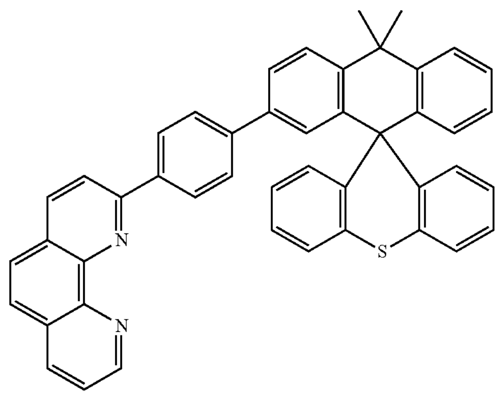
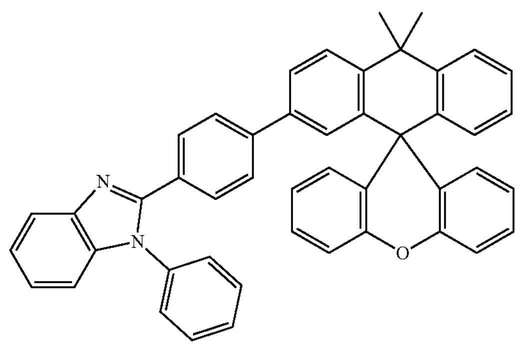
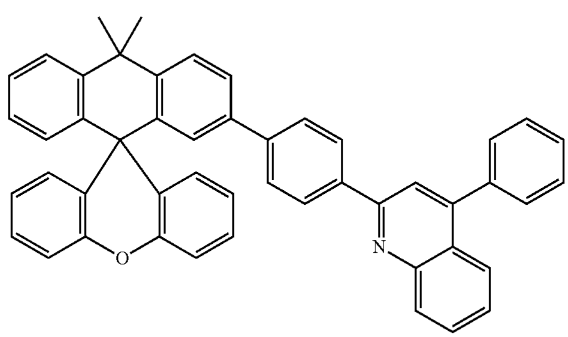

-continued
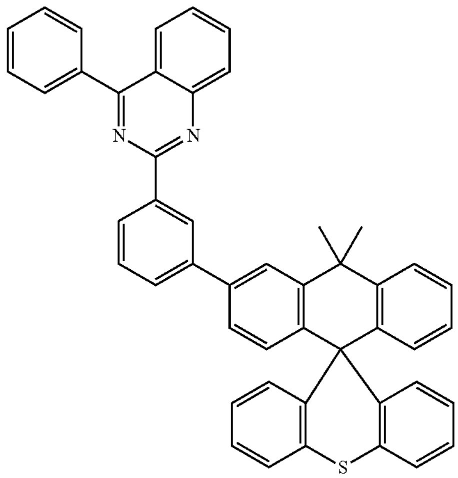
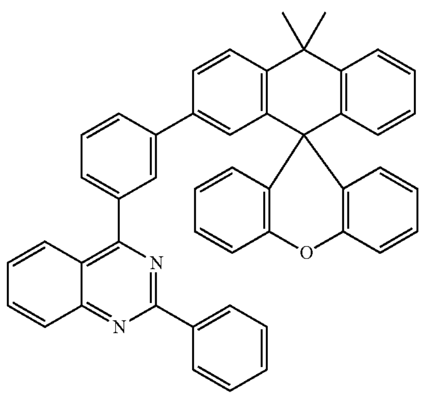
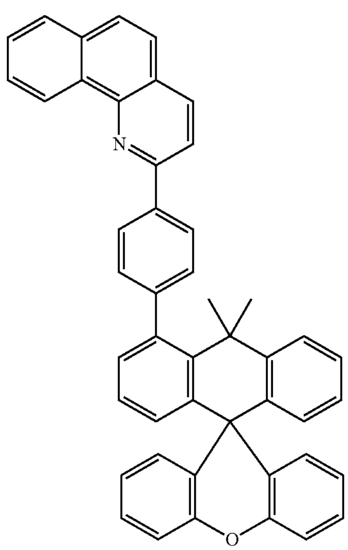
-continued
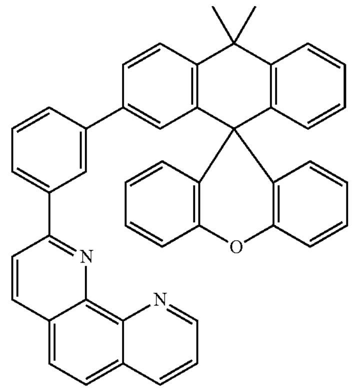
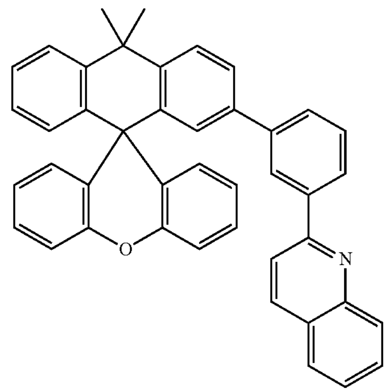
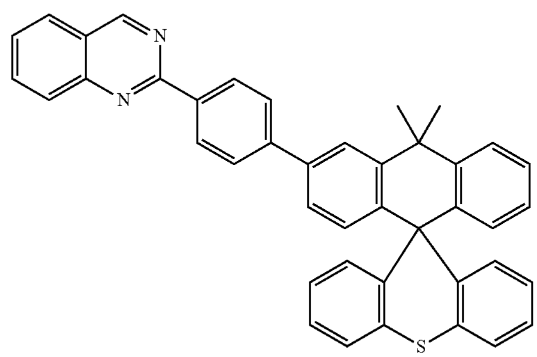
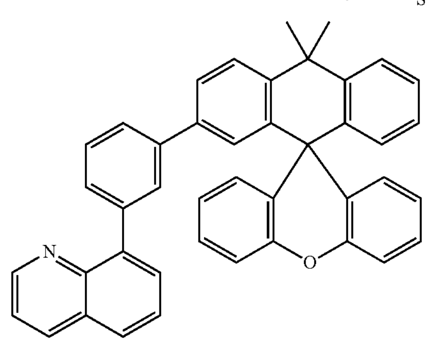

-continued
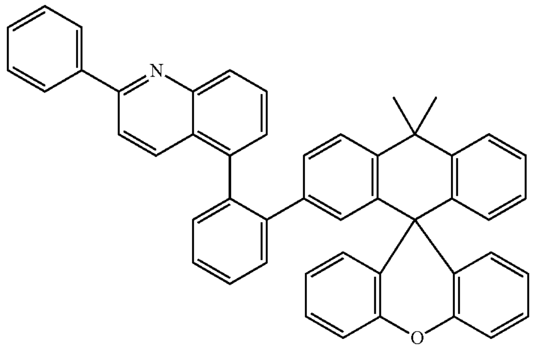
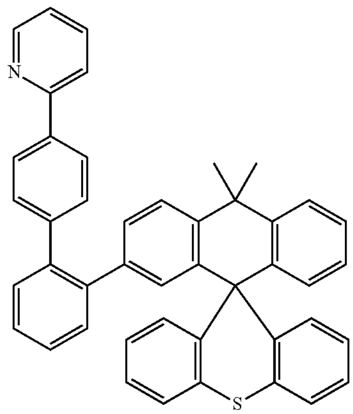
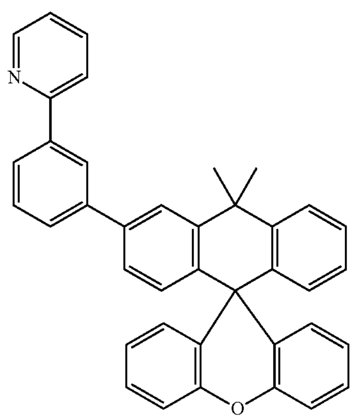
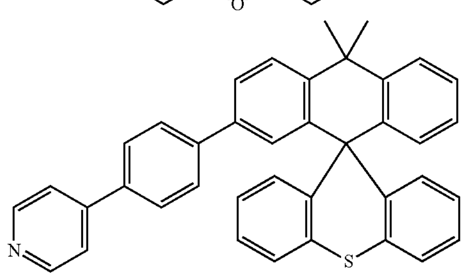
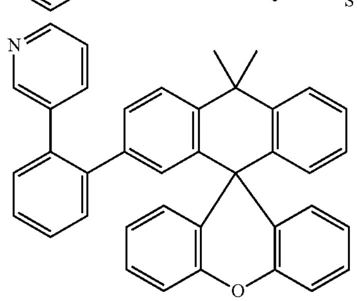
-continued
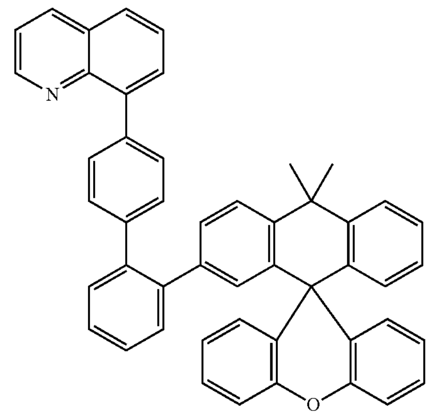
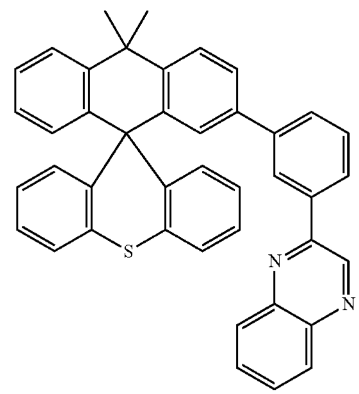
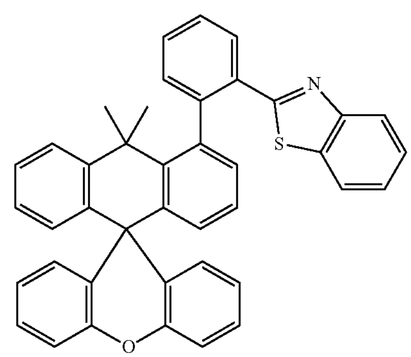
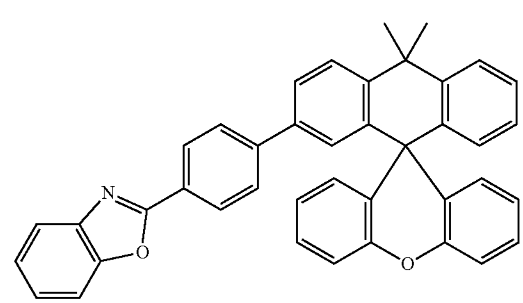

-continued
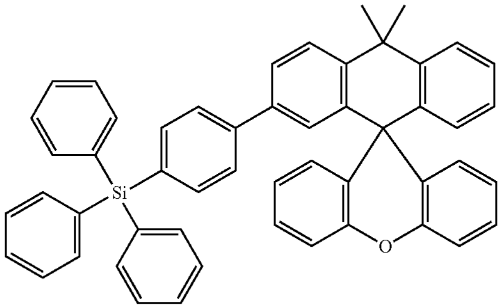
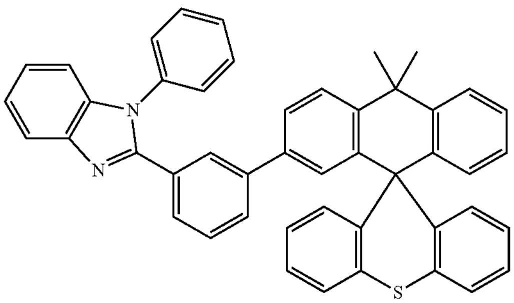
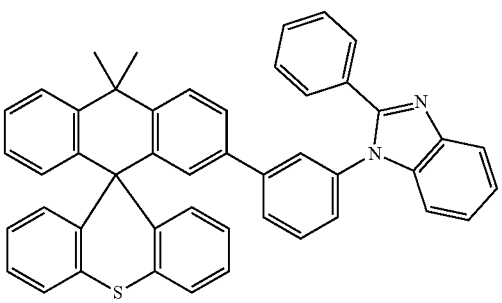
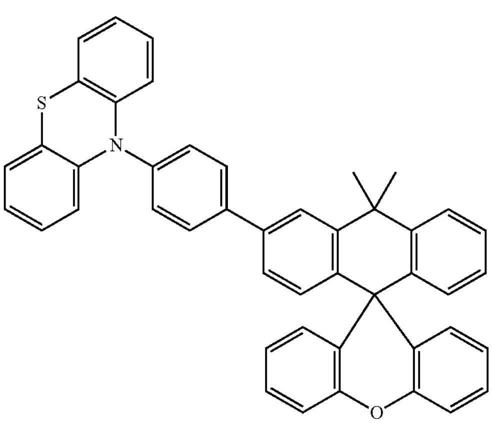
-continued
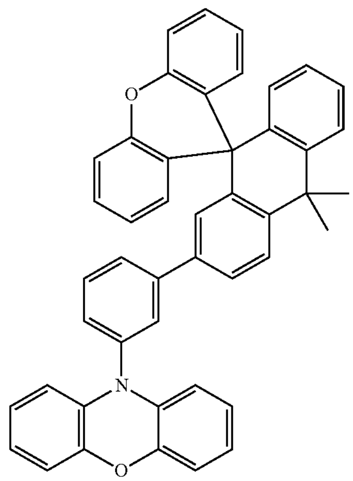
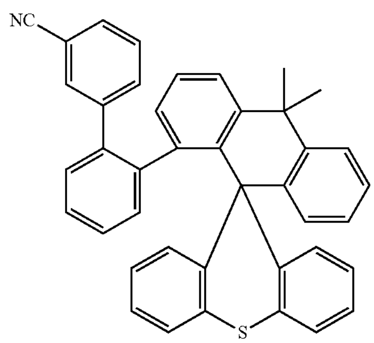
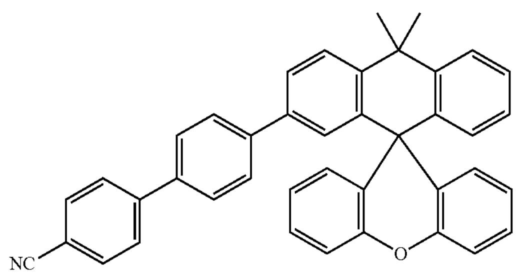
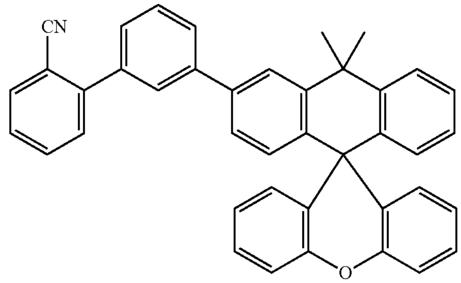
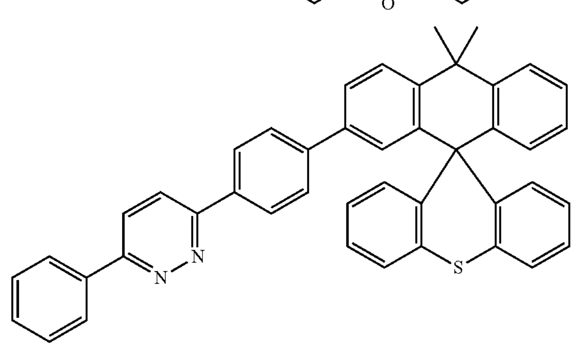

-continued
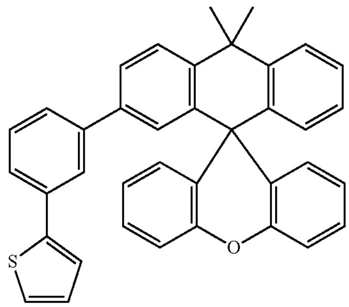
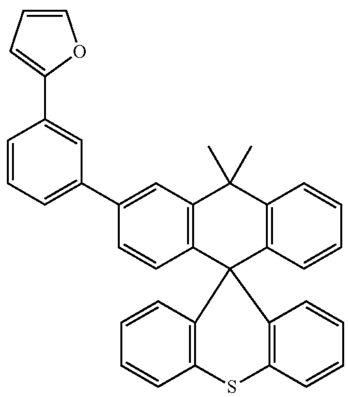
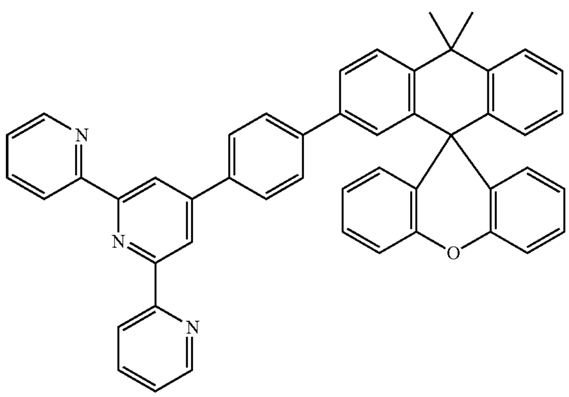
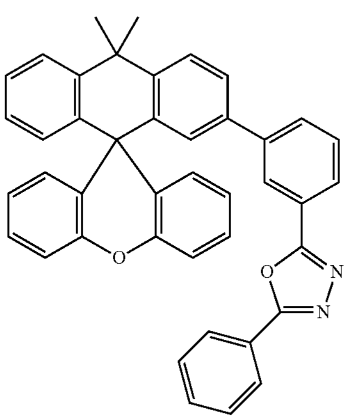
-continued
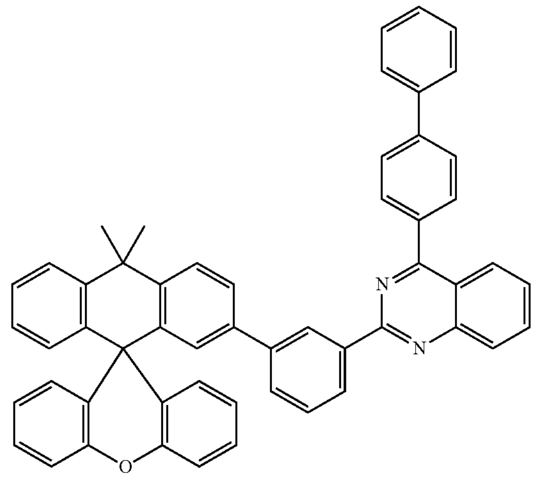
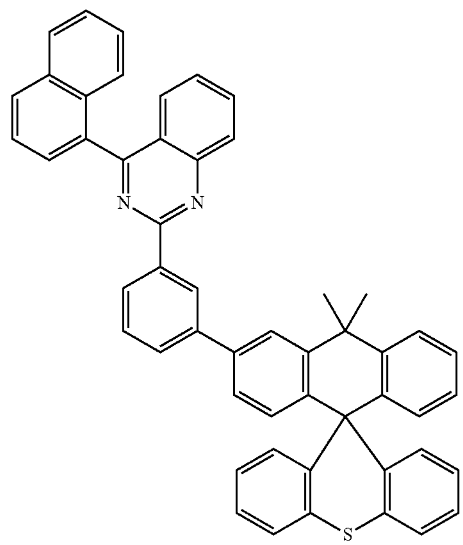
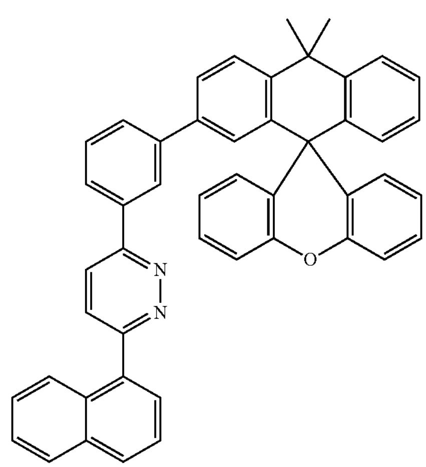

-continued
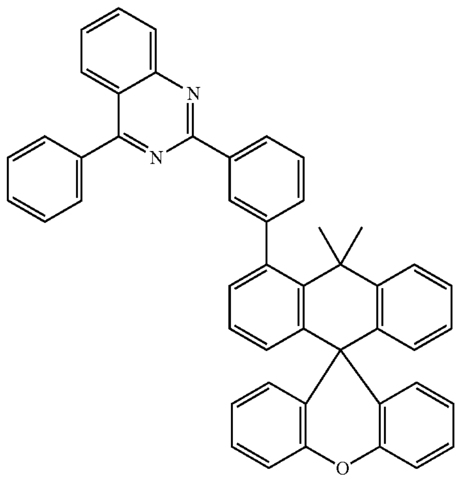
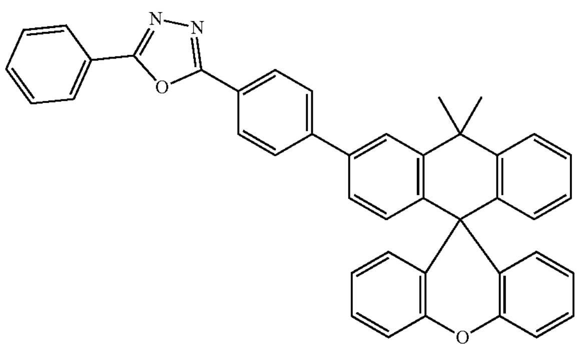
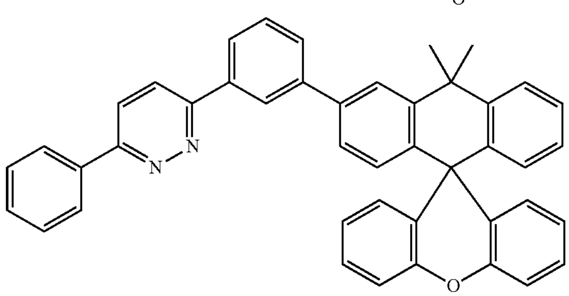
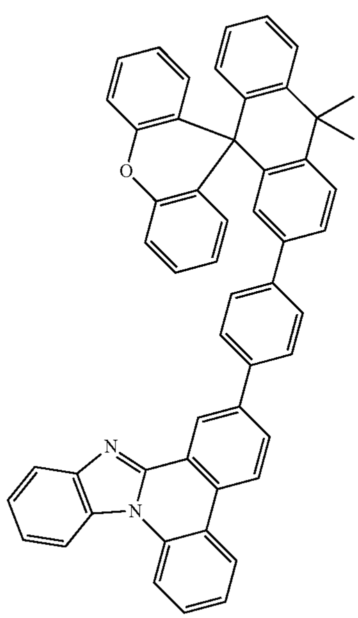
-continued
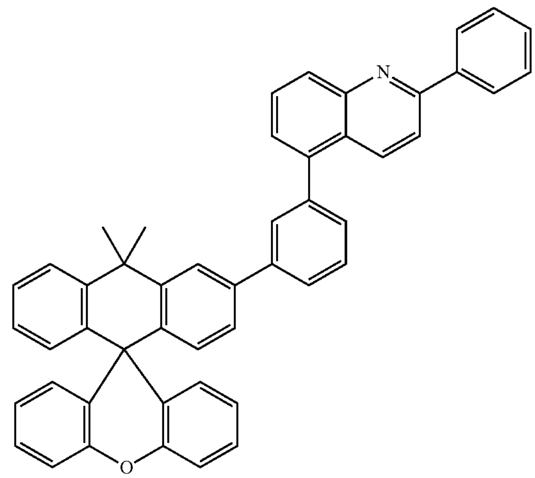
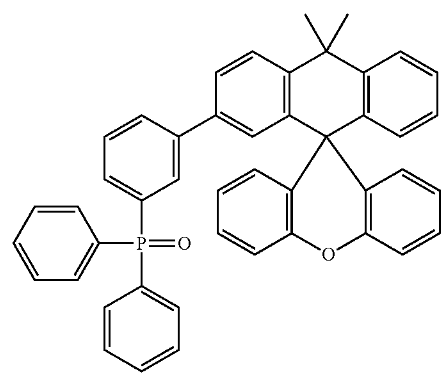
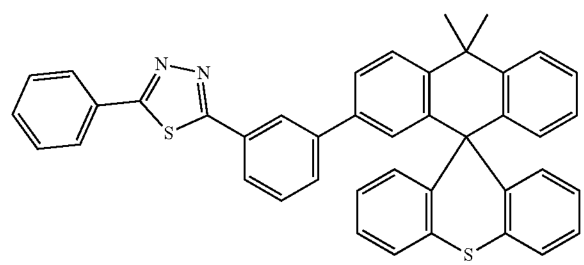
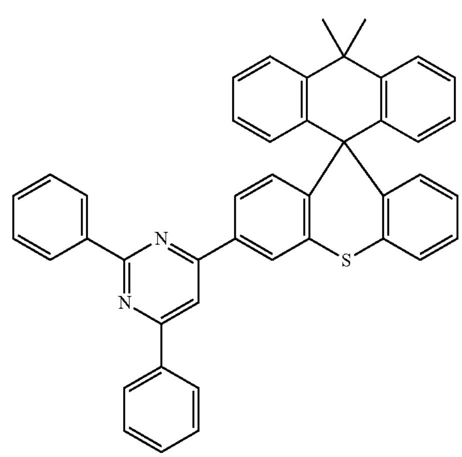

-continued
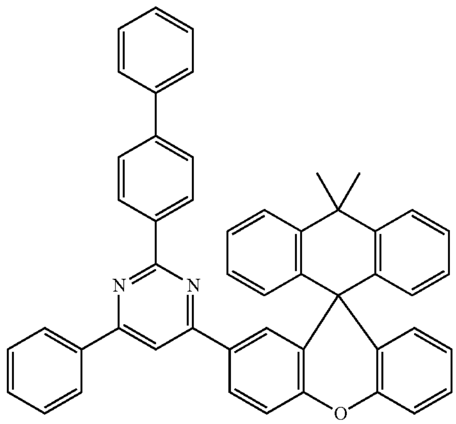
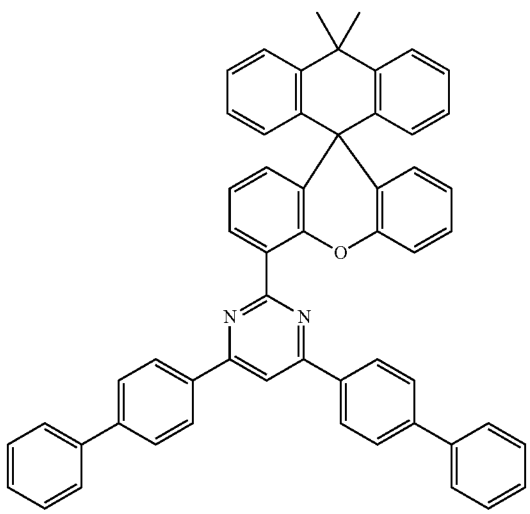
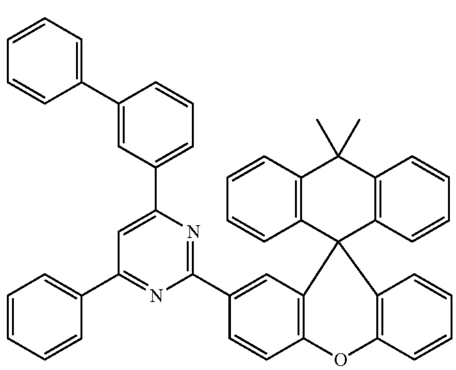
-continued
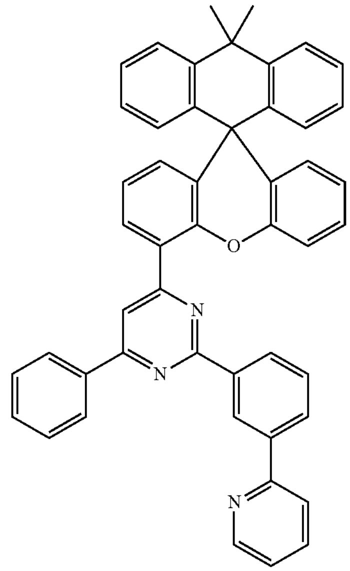
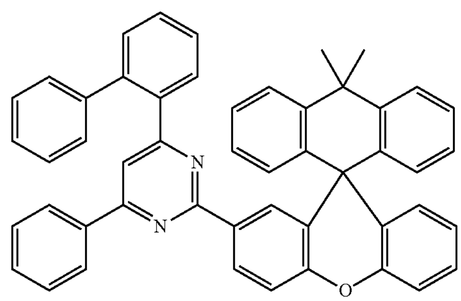
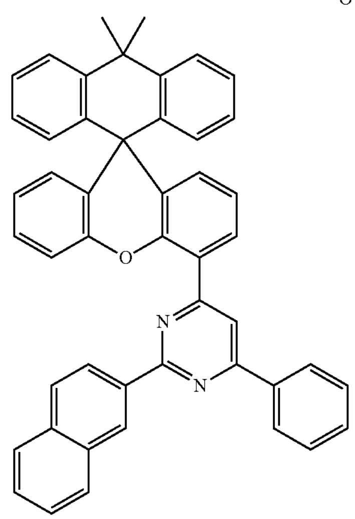
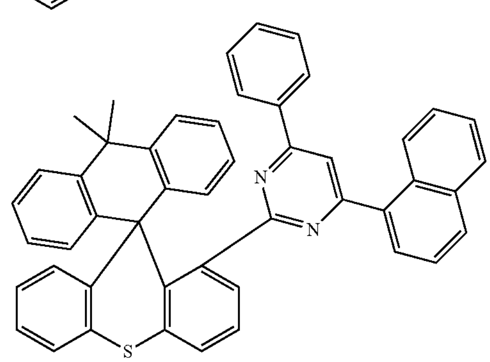

-continued
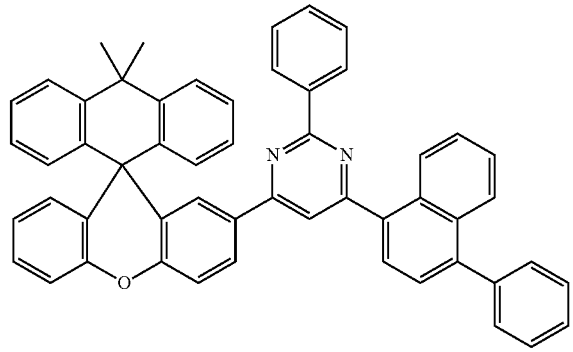
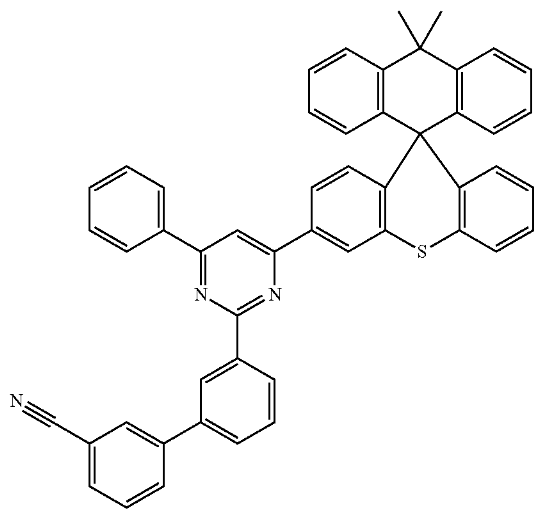
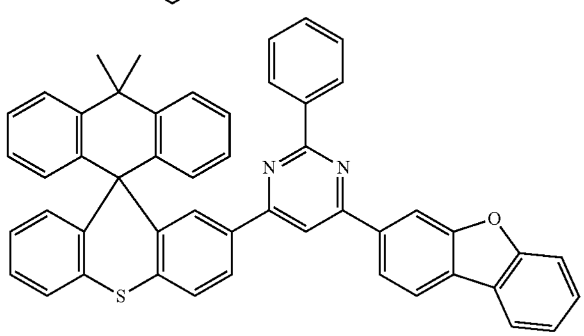
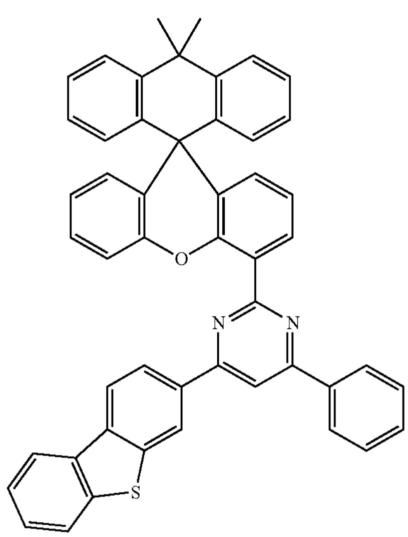
-continued
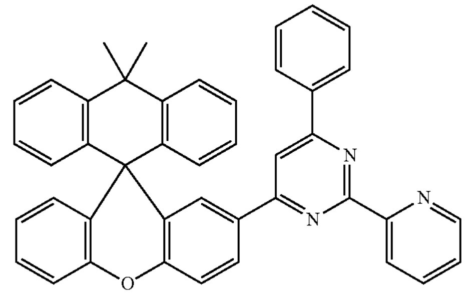
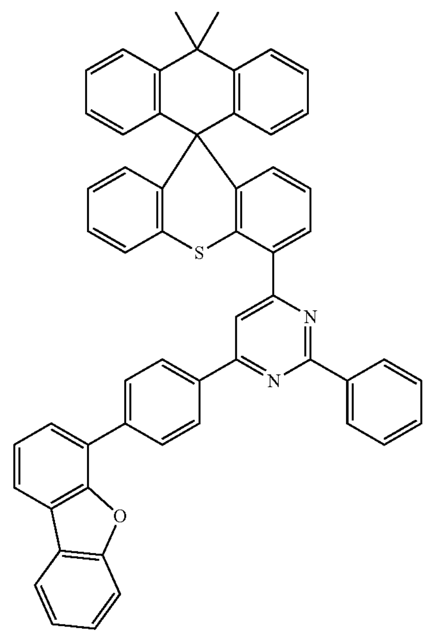
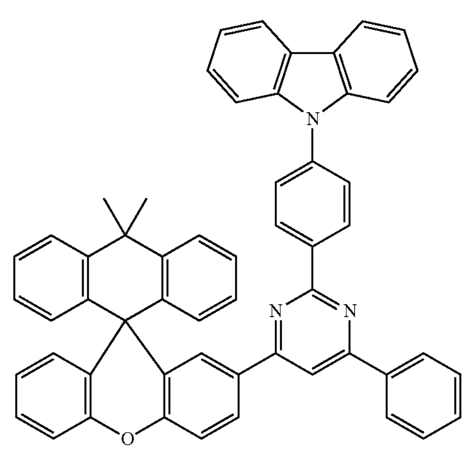

-continued
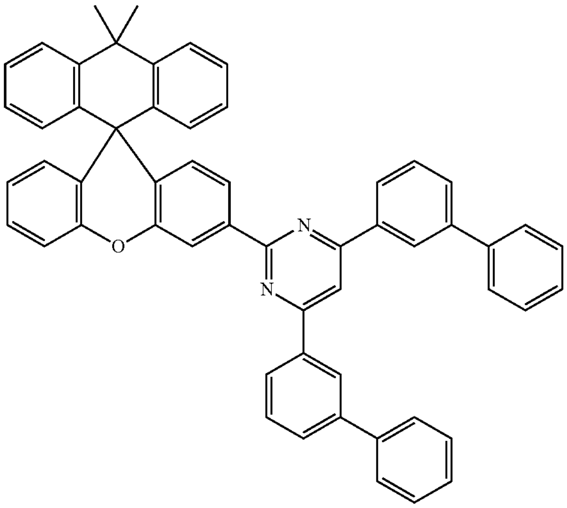
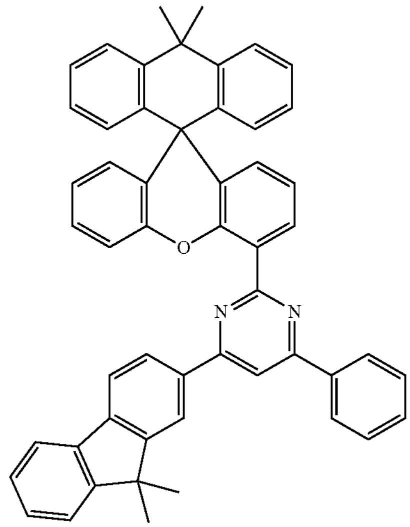
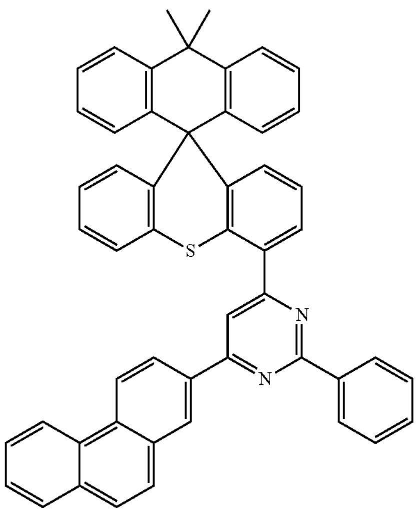
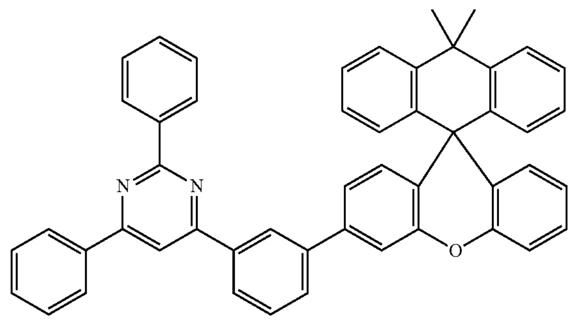
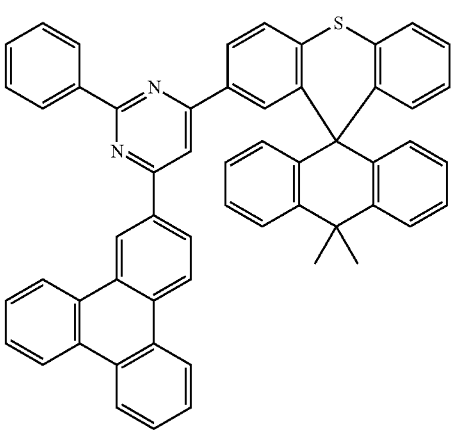
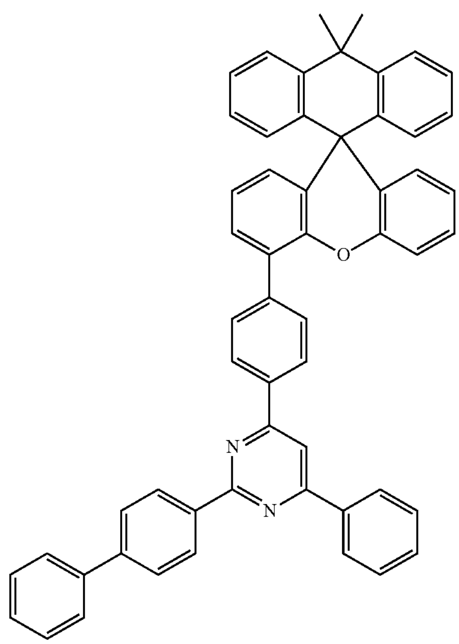

-continued
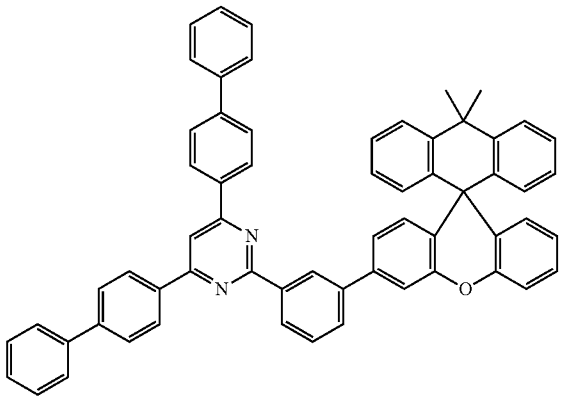
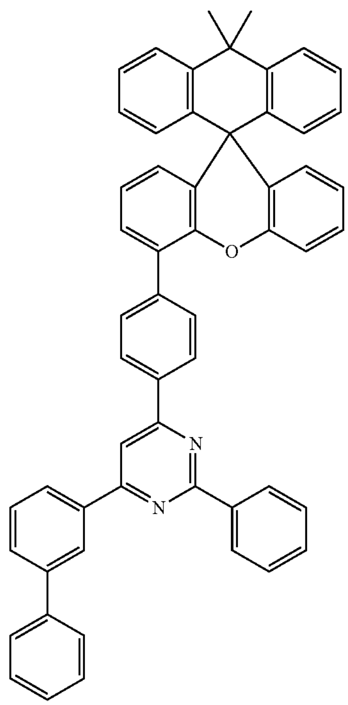
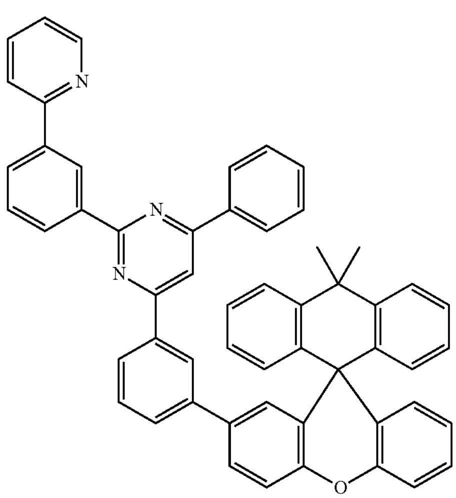
-continued
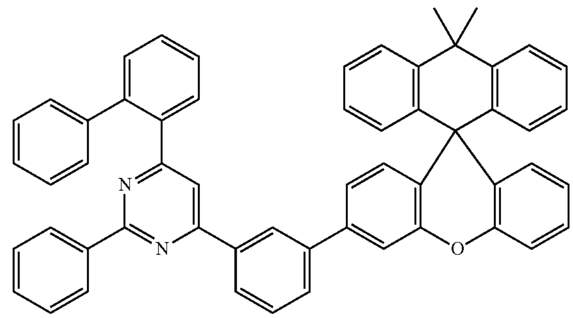
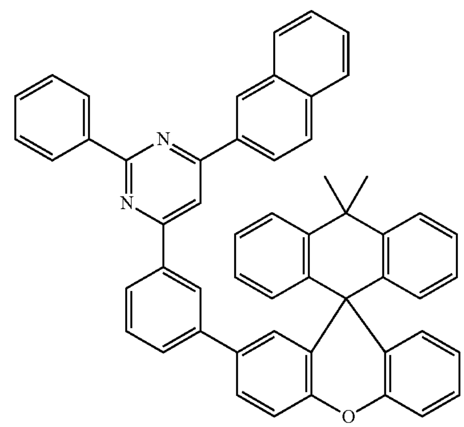
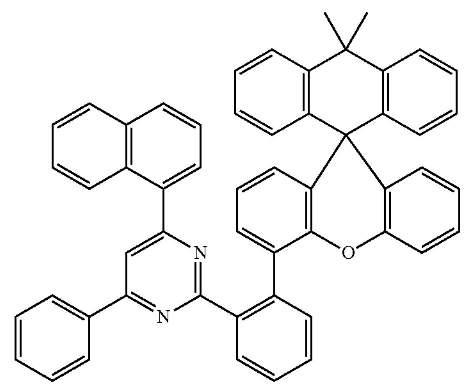
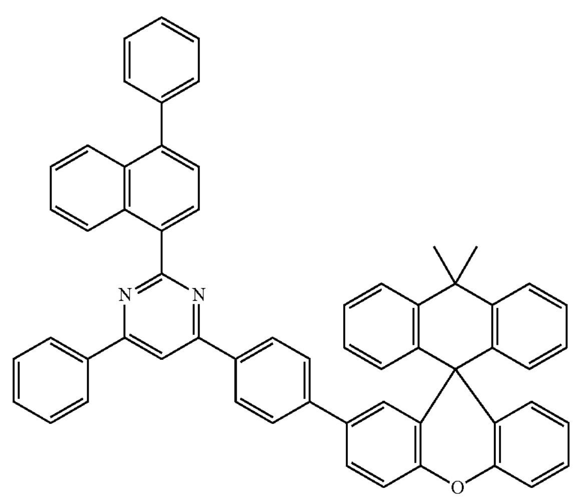

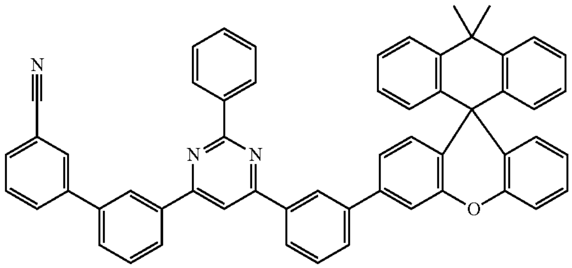
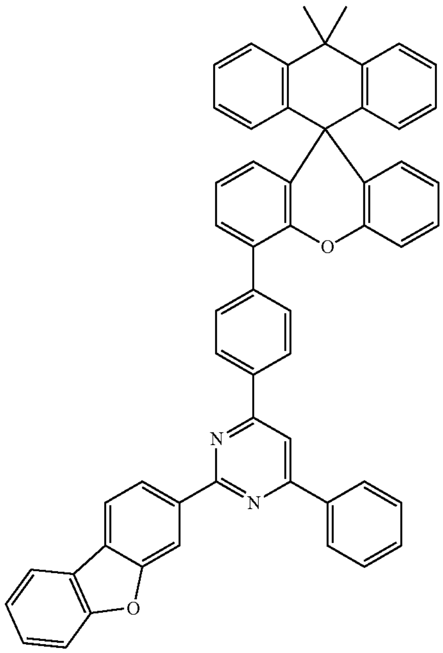
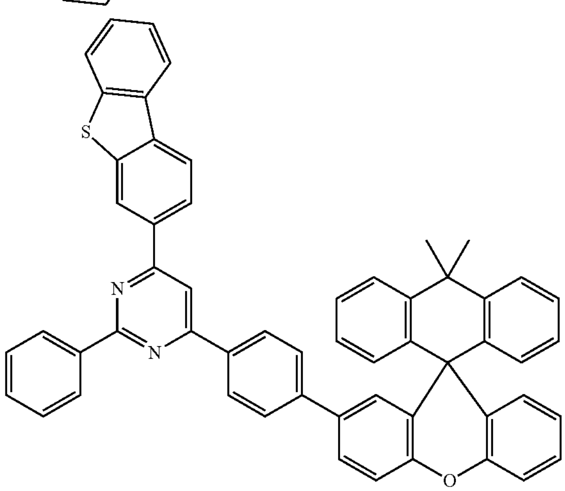
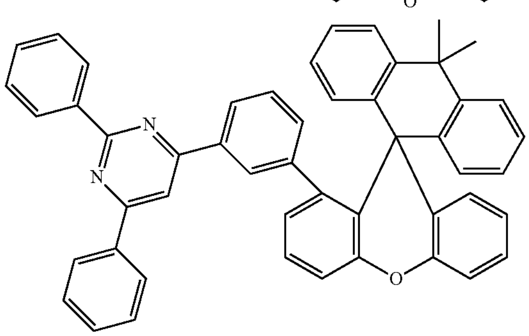
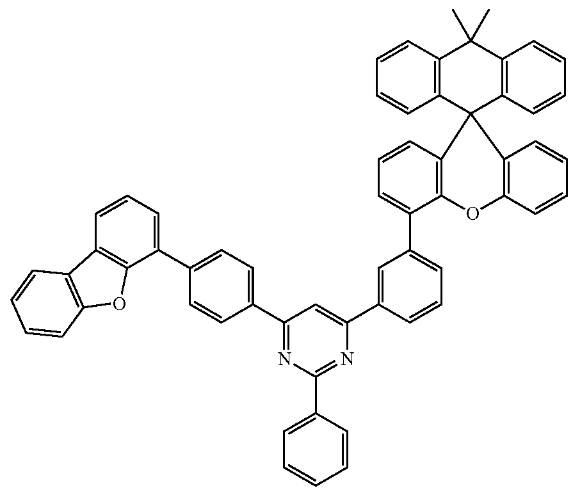
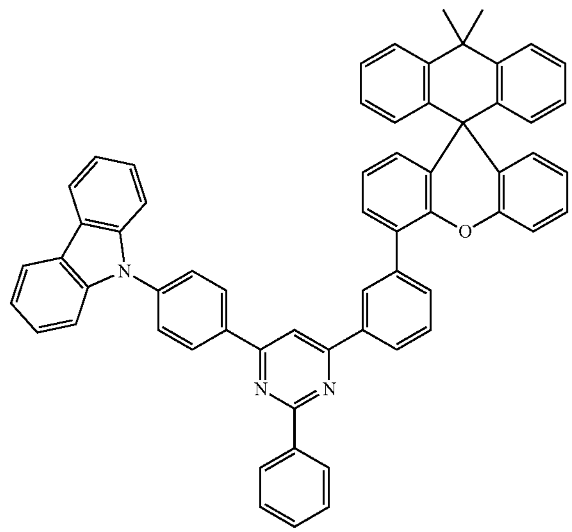
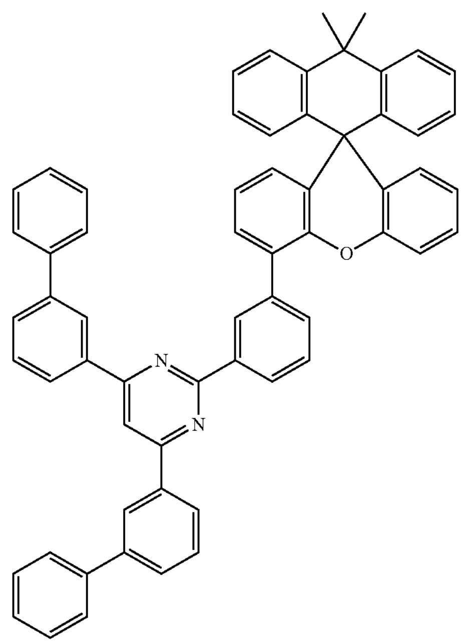

-continued
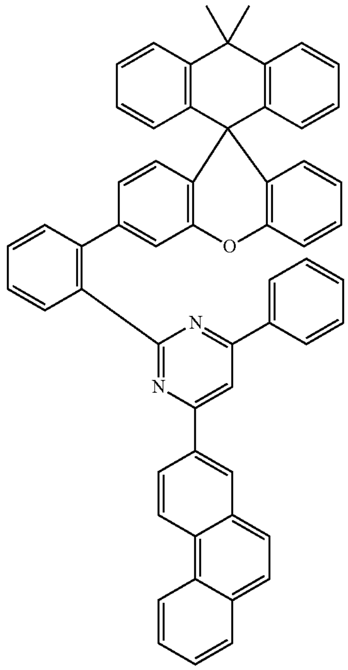
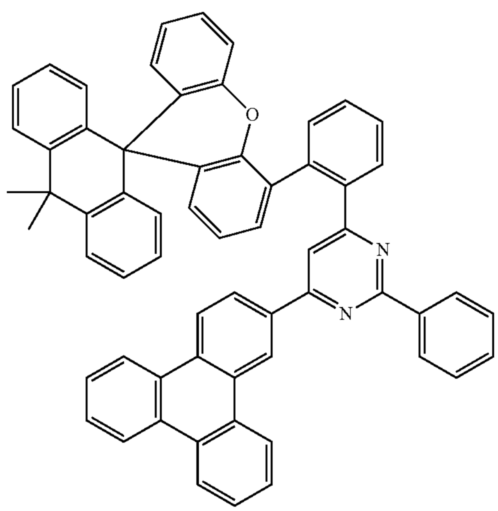
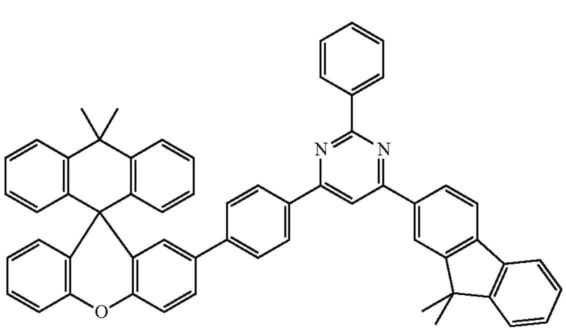
-continued
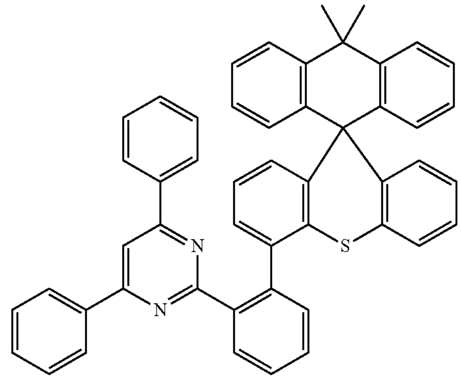
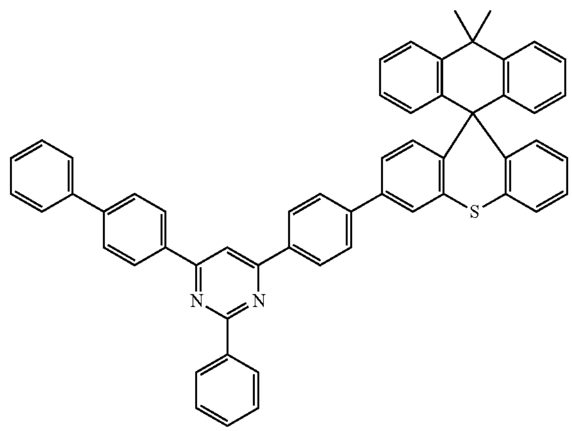
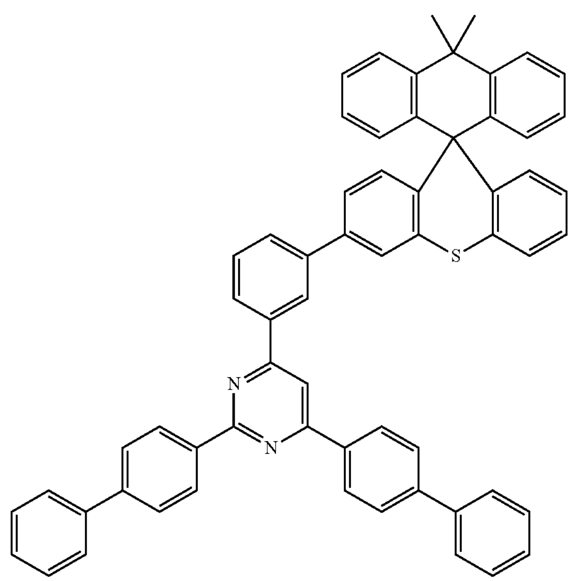

-continued
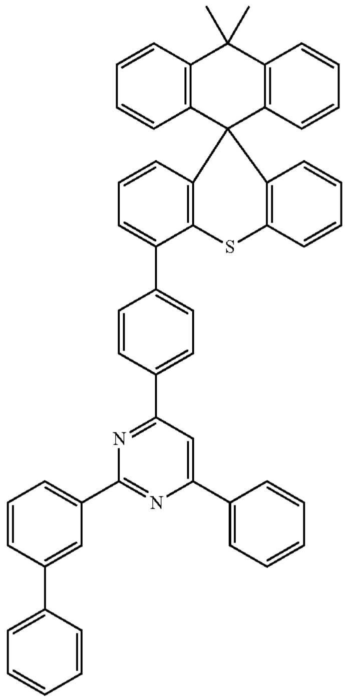
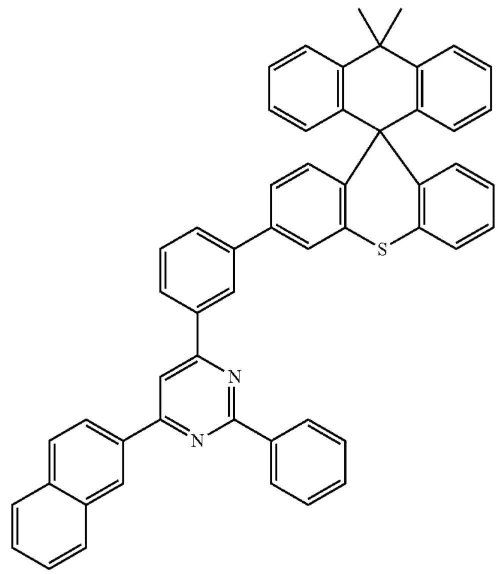
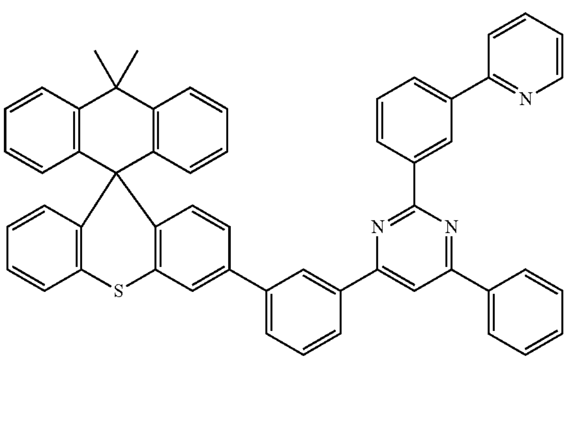
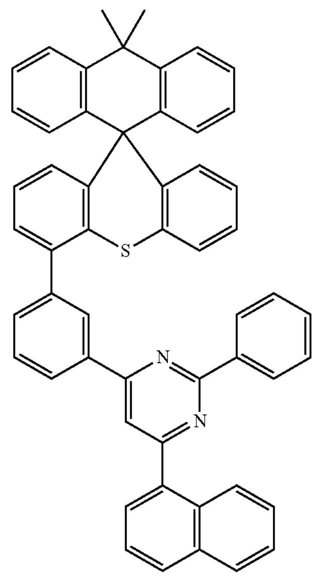
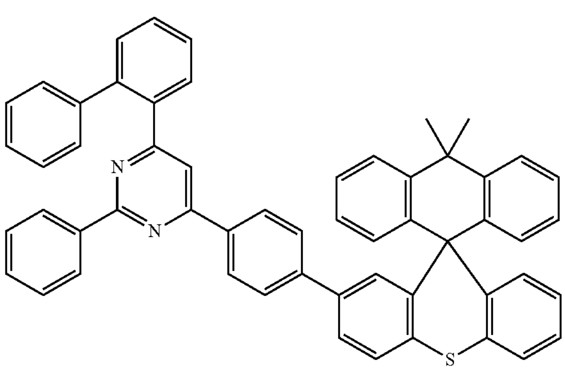
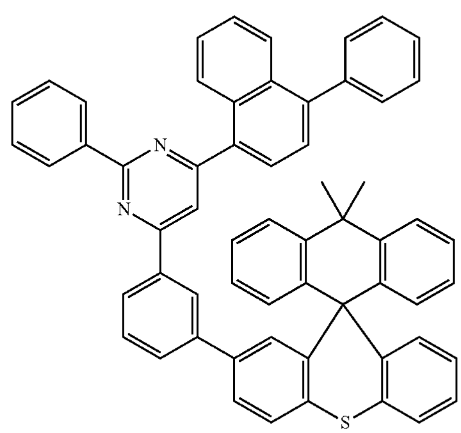
-continued -continued
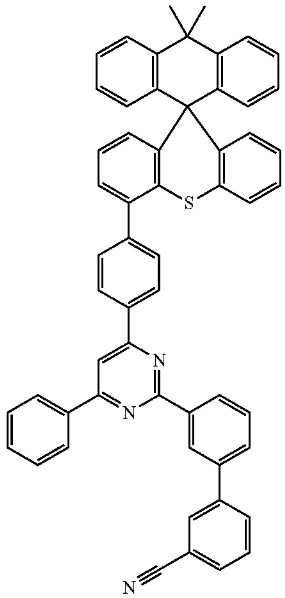
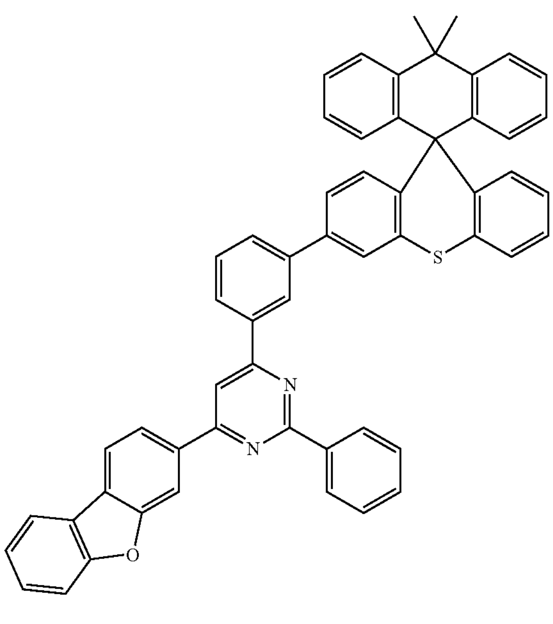
-continued
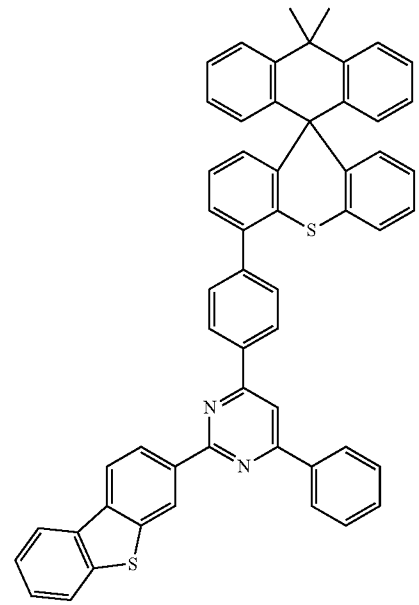
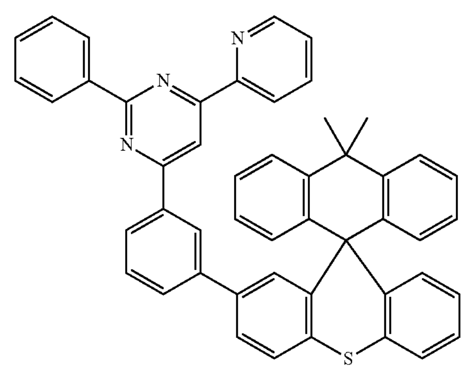
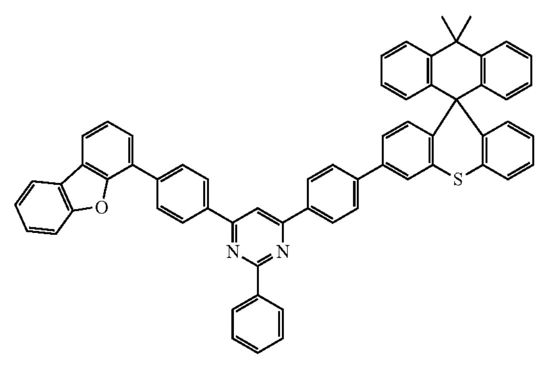

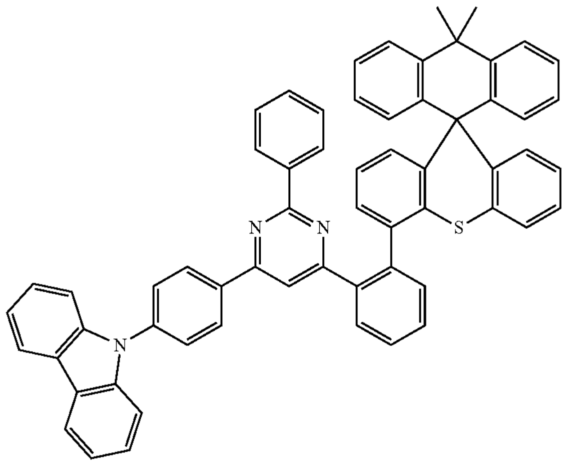
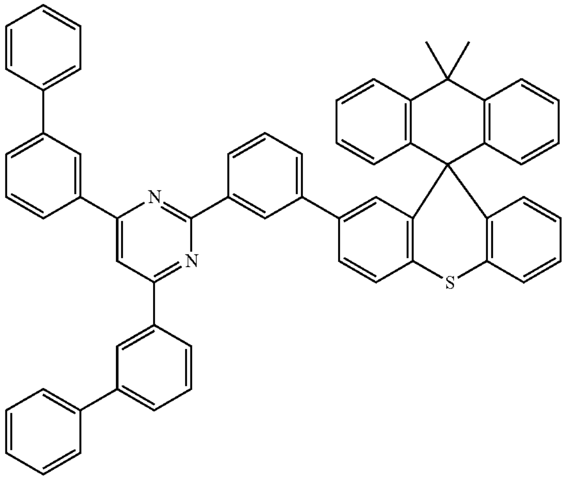
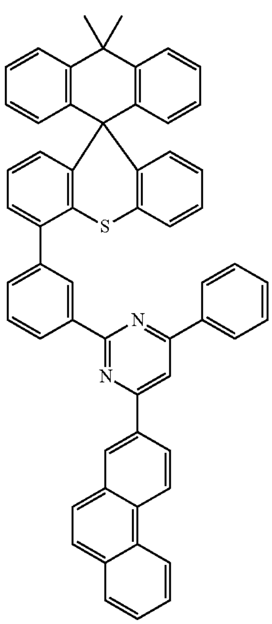
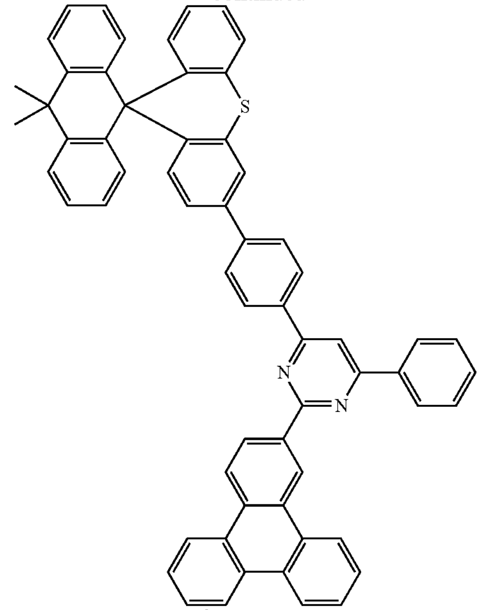
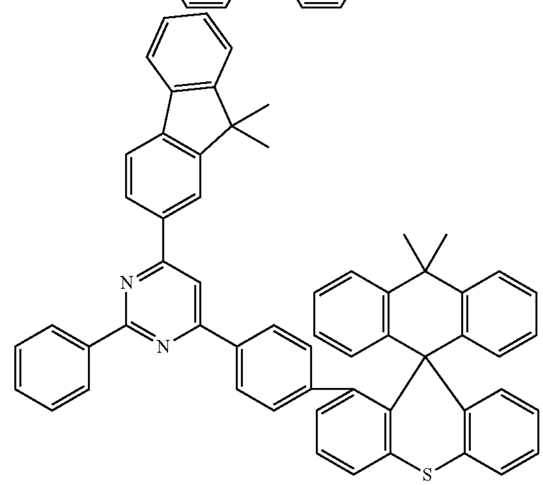
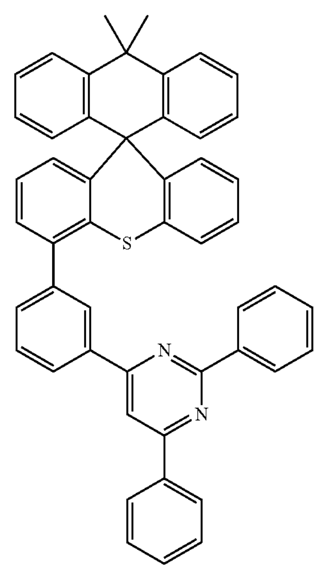
S
N
N -continued
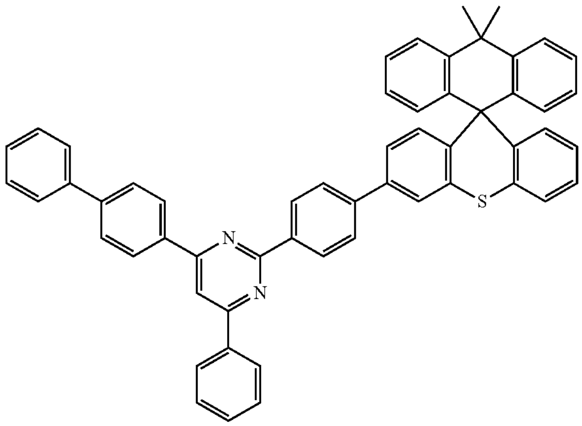
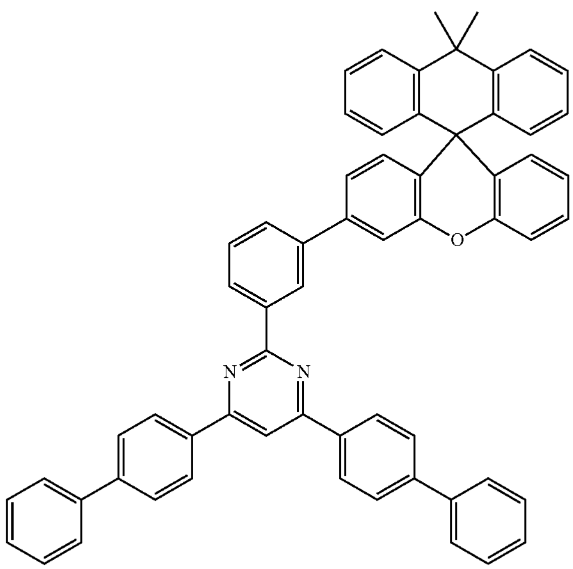
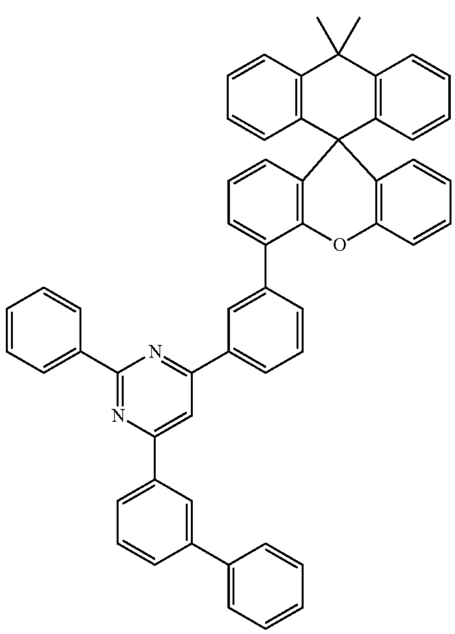
-continued
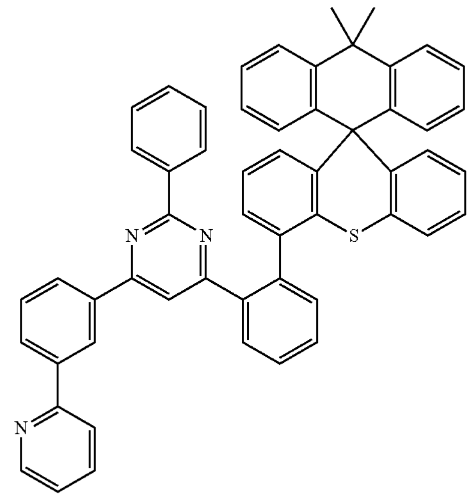
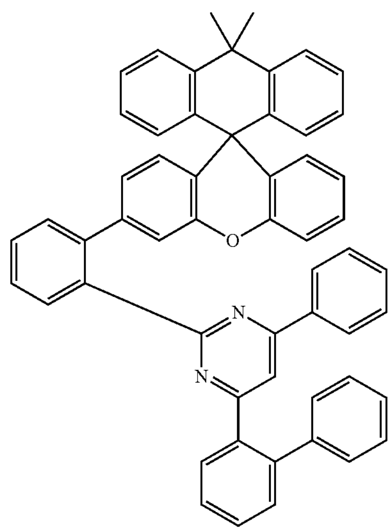
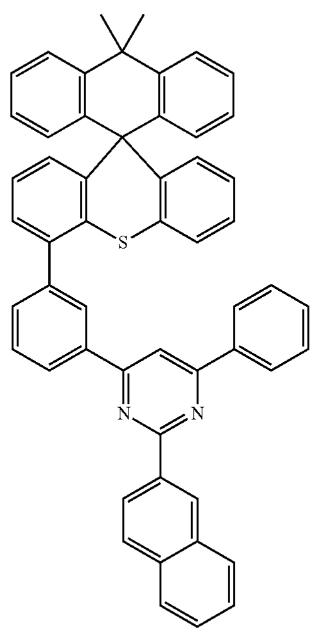

-continued
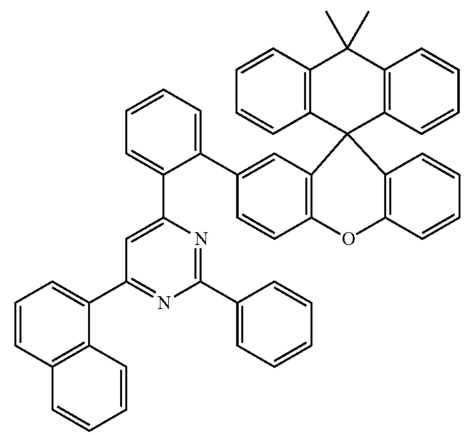
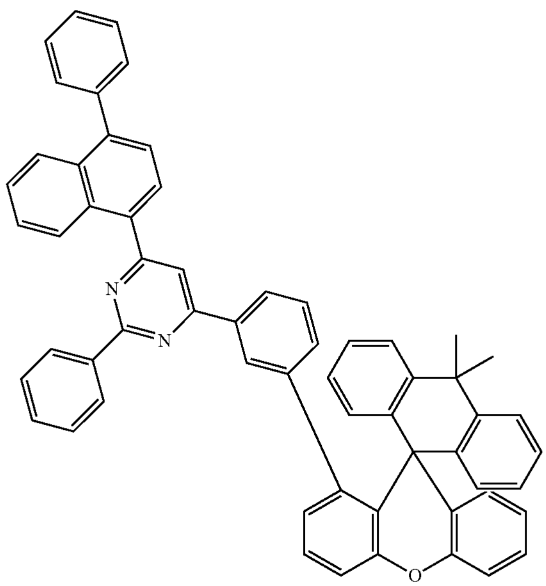
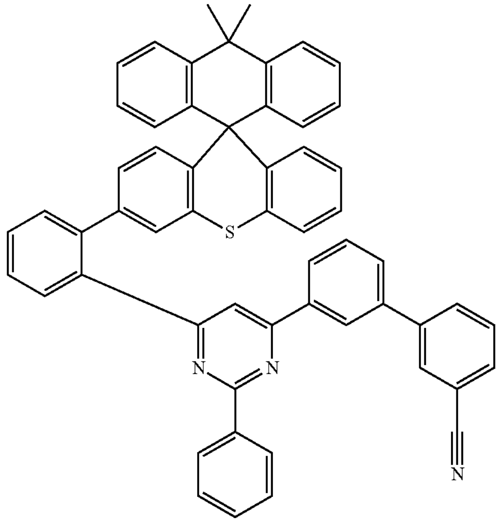
-continued
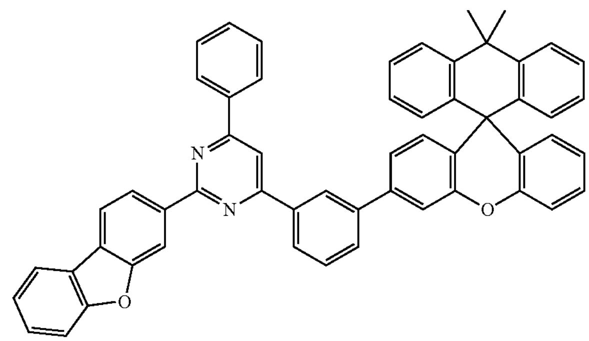
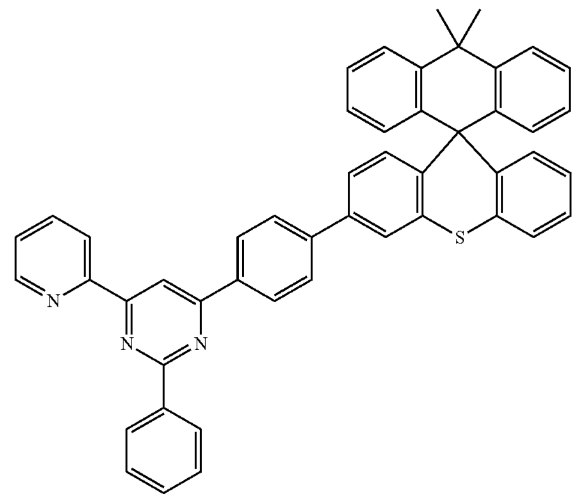
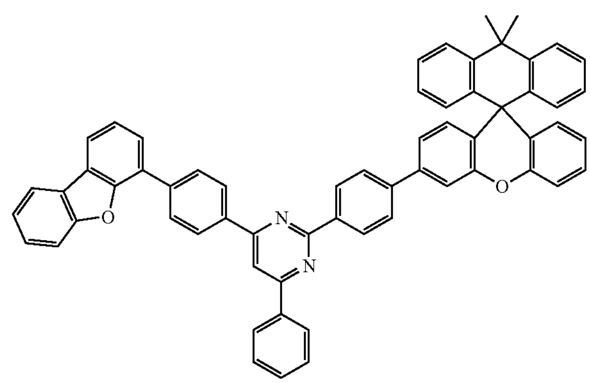
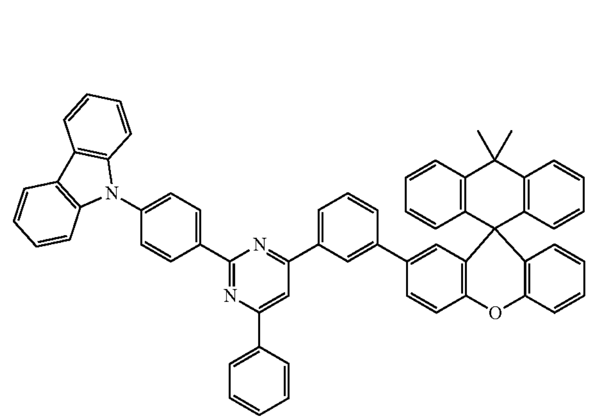

-continued
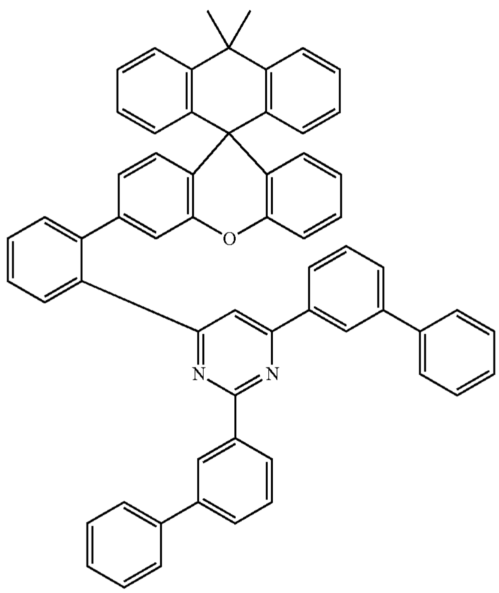
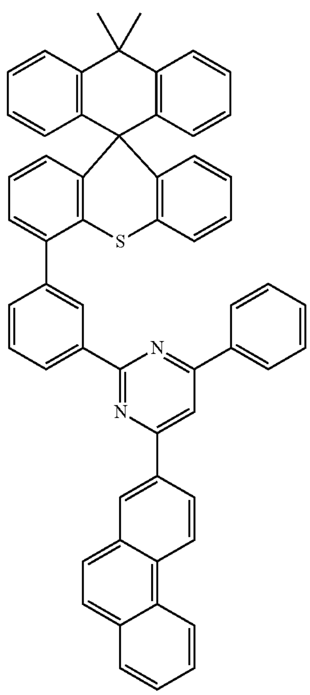
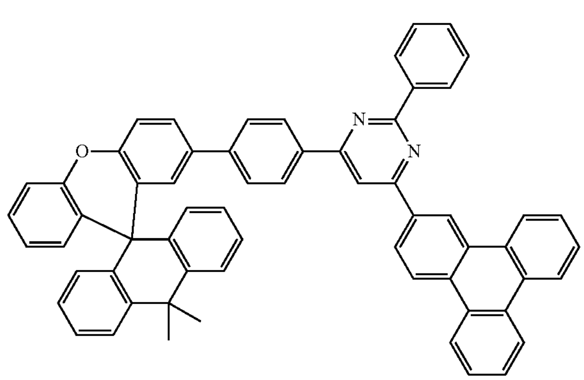
-continued
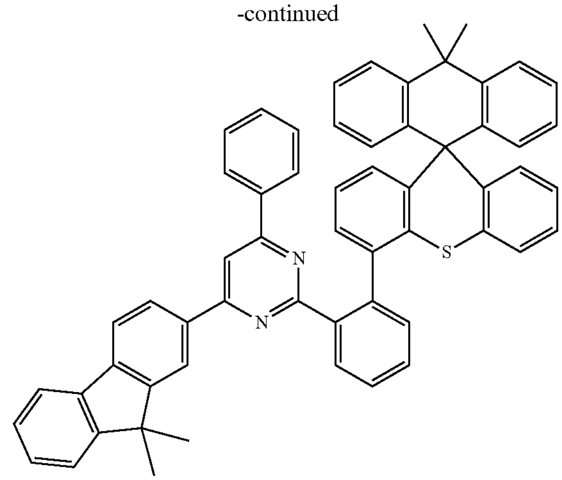
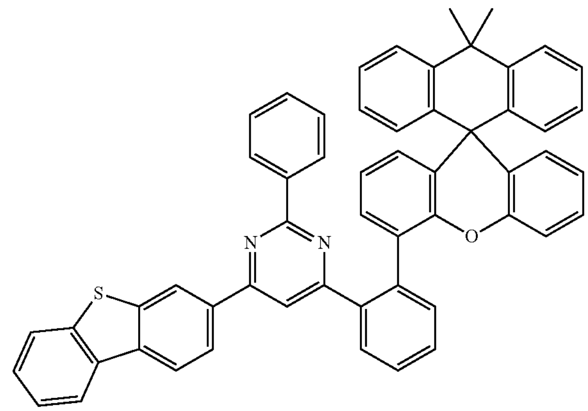
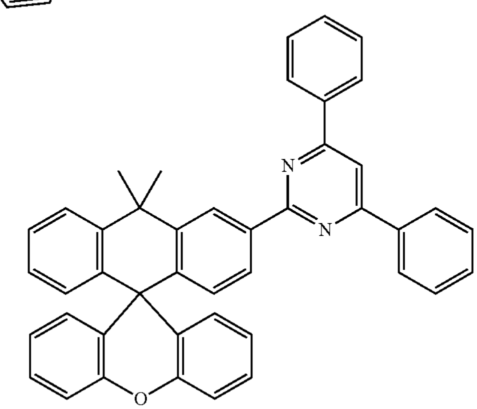
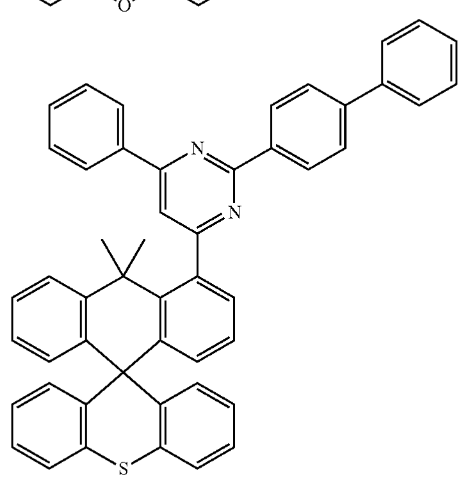

-continued
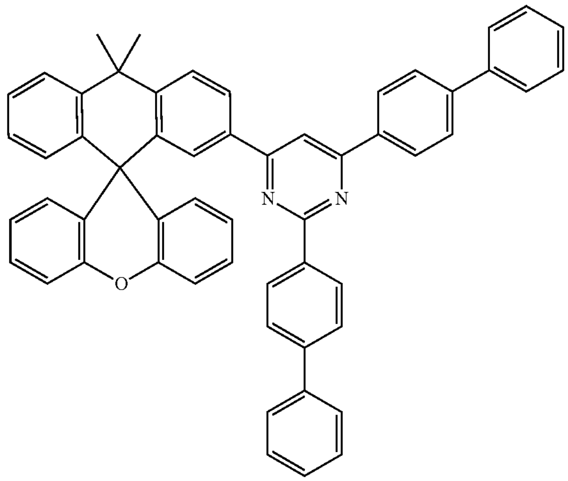
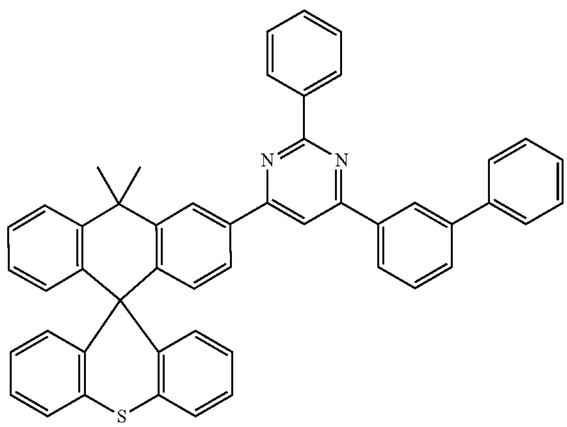
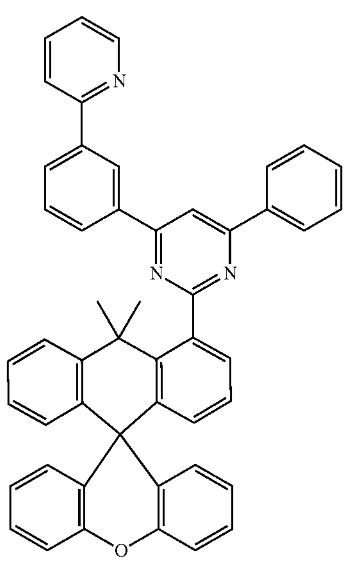
-continued
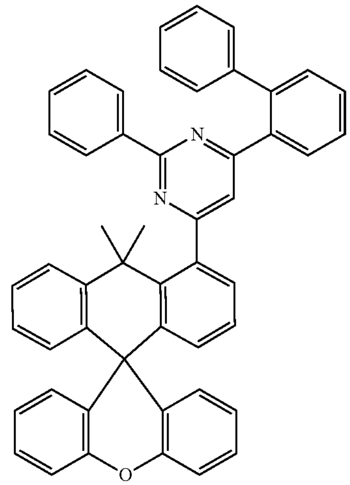
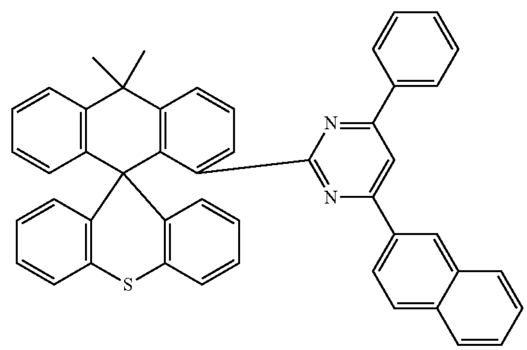
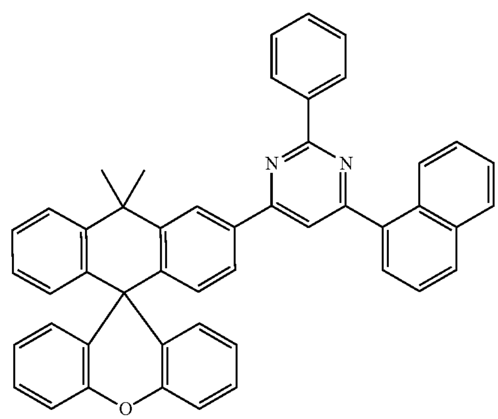
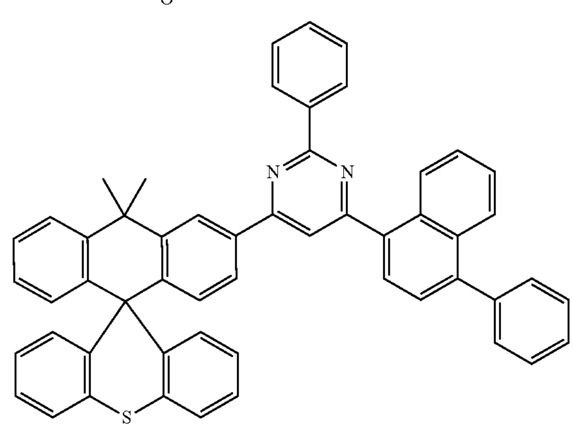

-continued
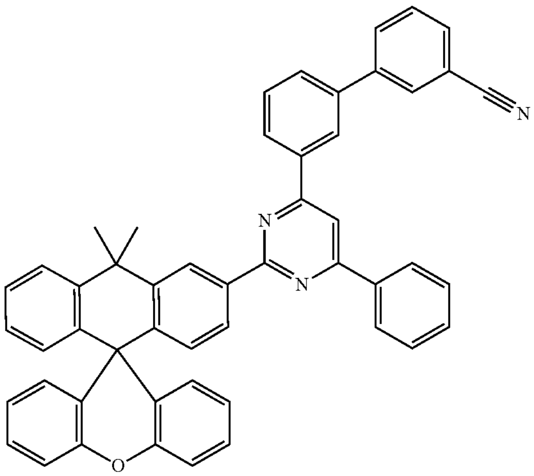
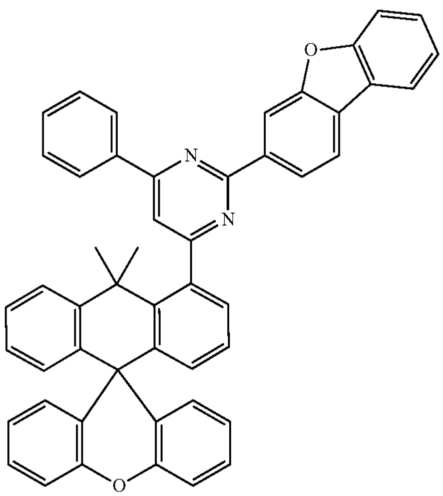
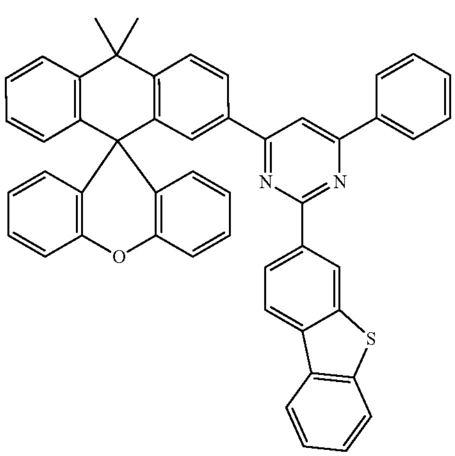
-continued
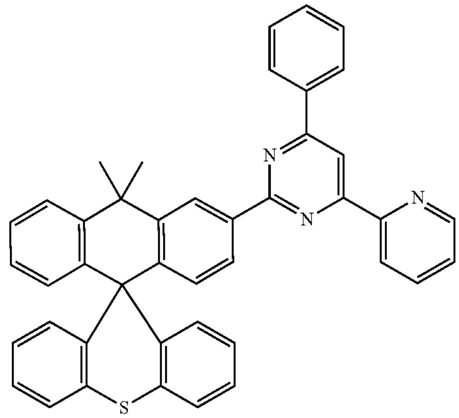
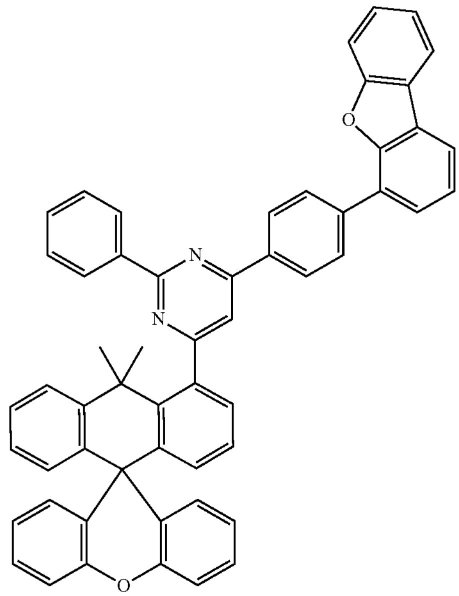
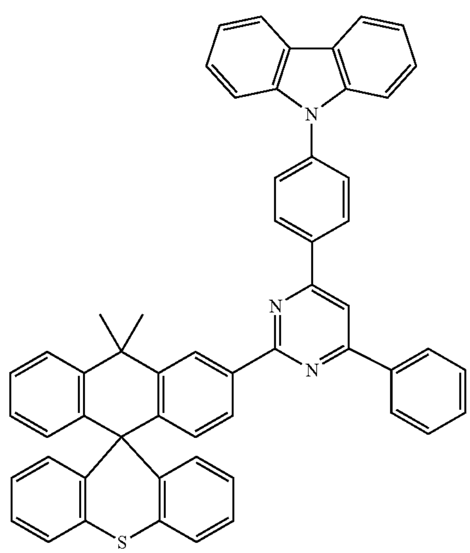

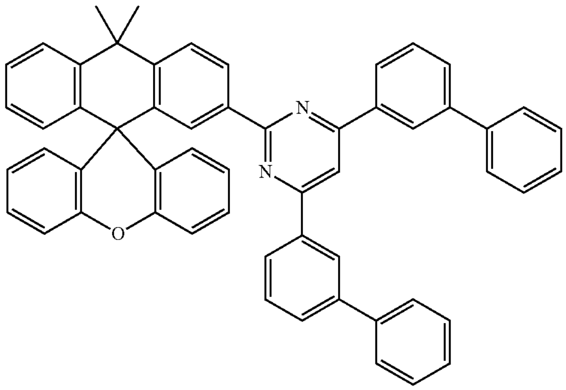
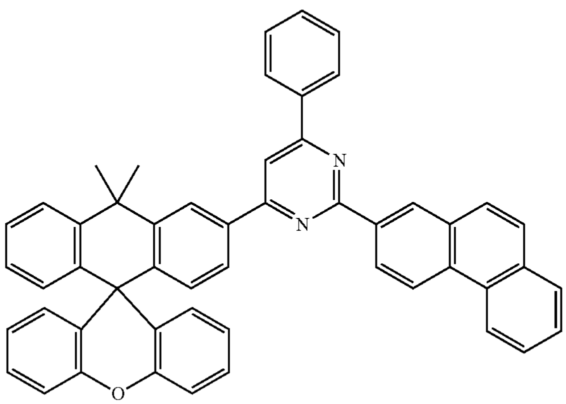
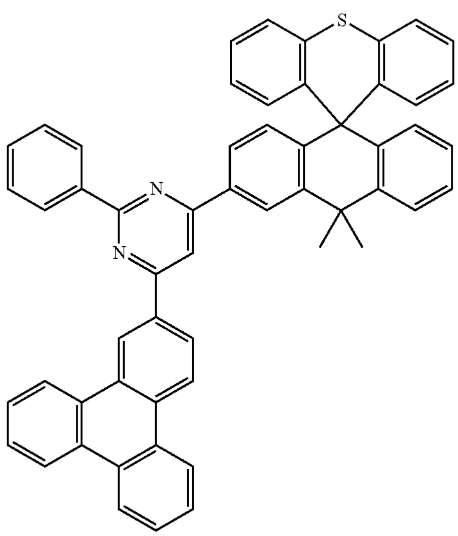
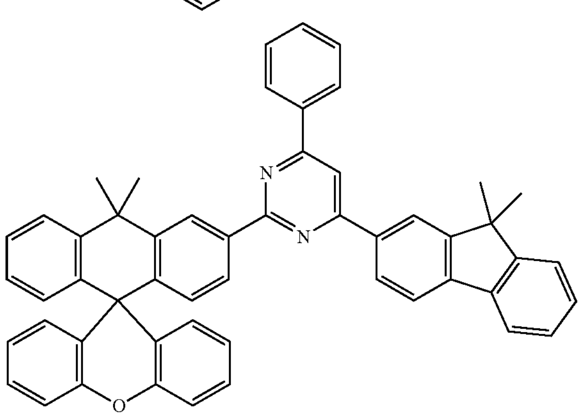
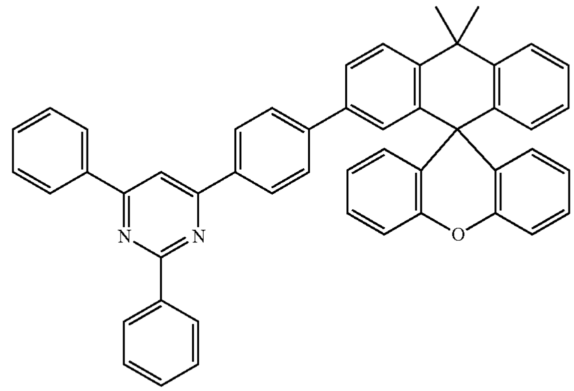
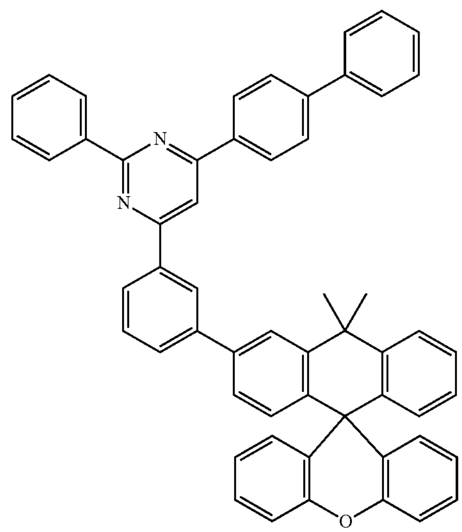
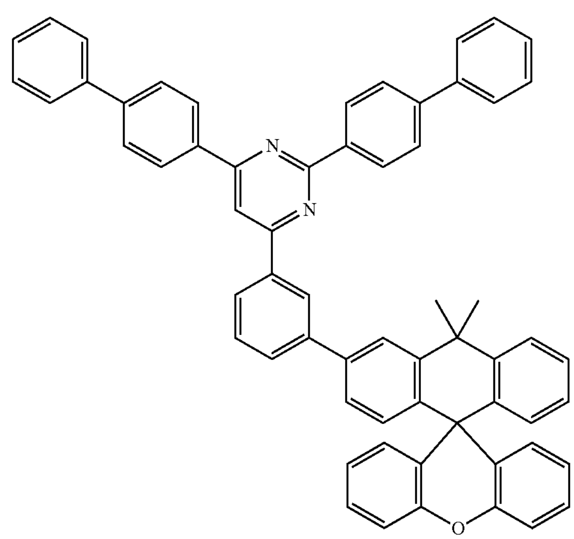

-continued
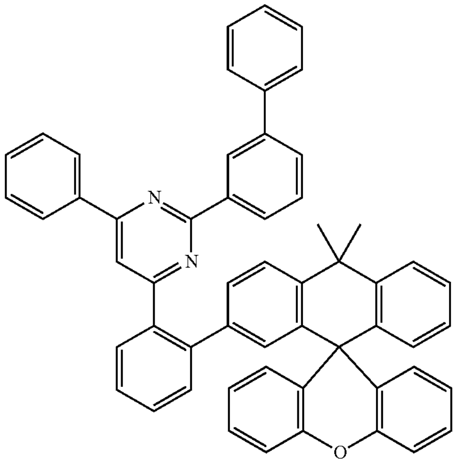
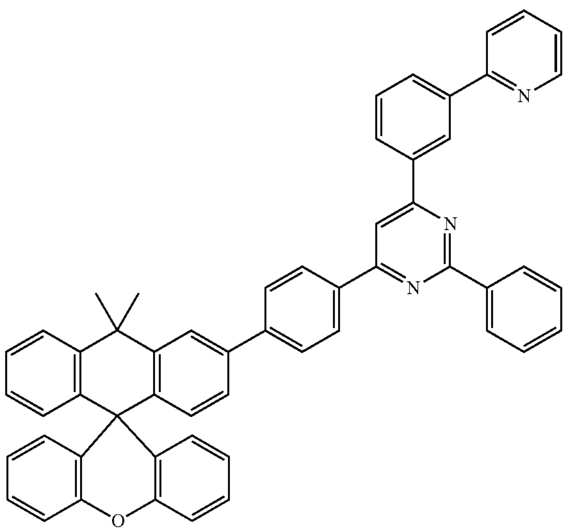
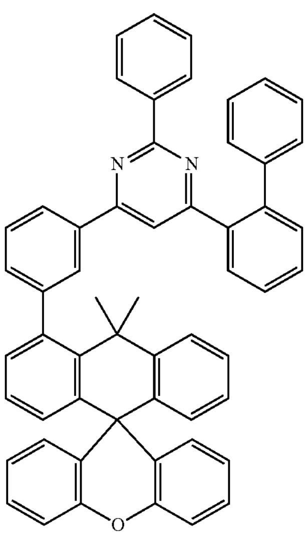
-continued
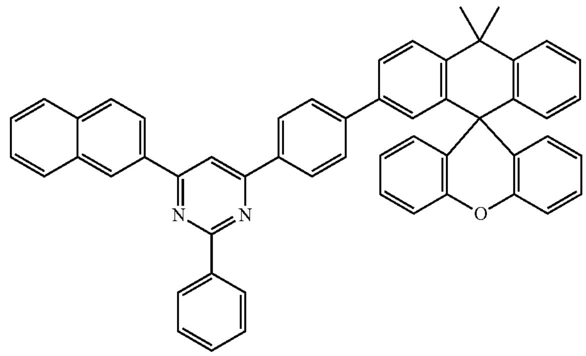
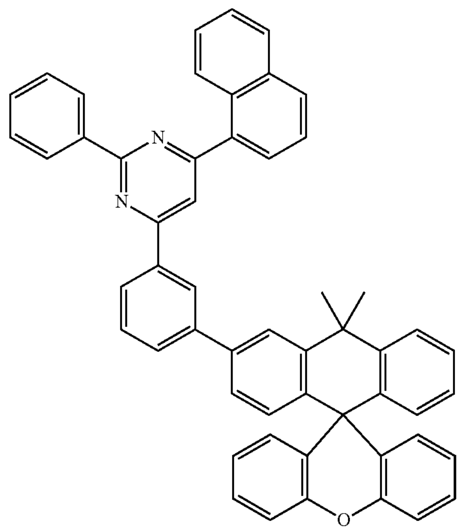
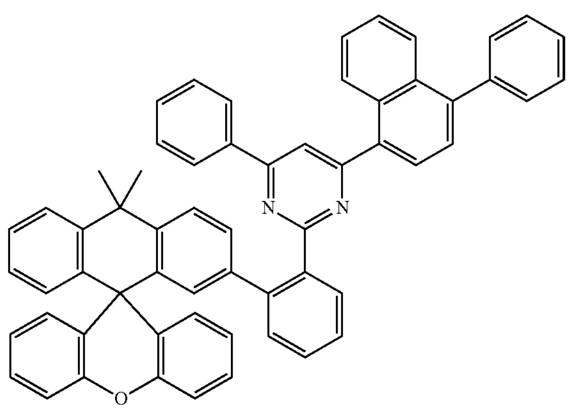

-continued
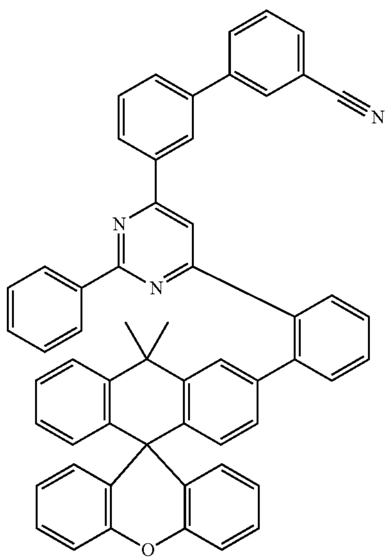
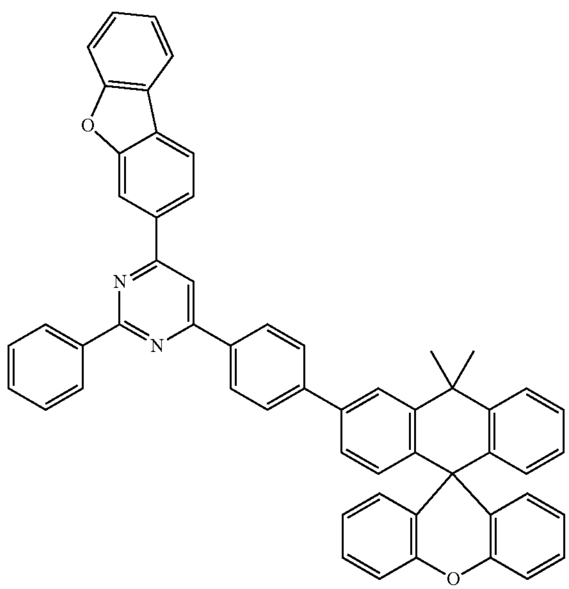
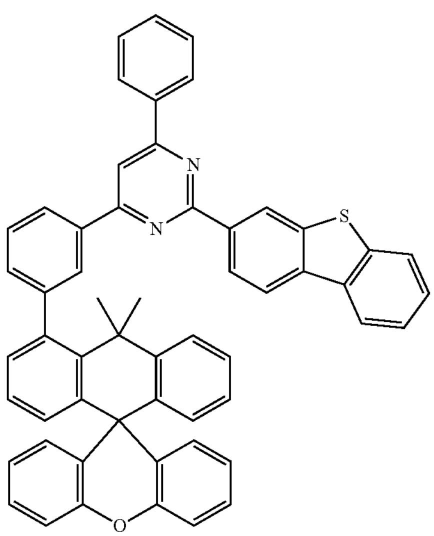
-continued
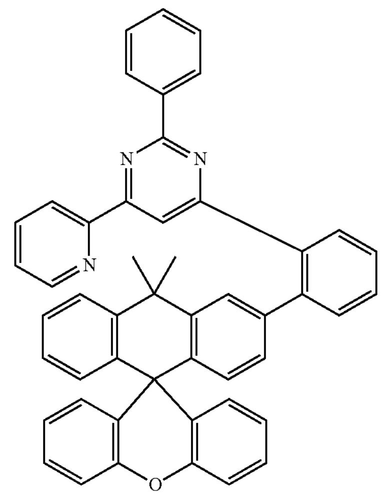
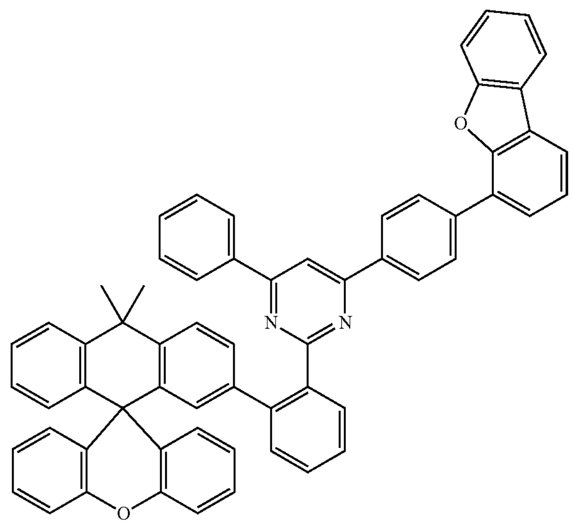
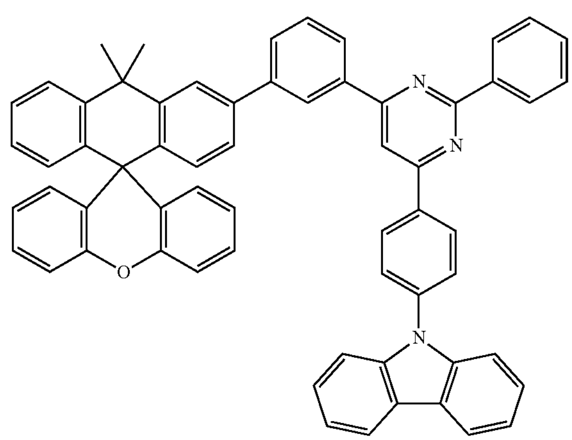

-continued
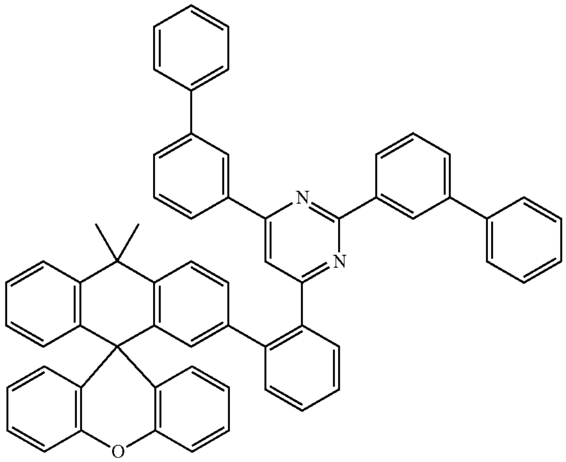
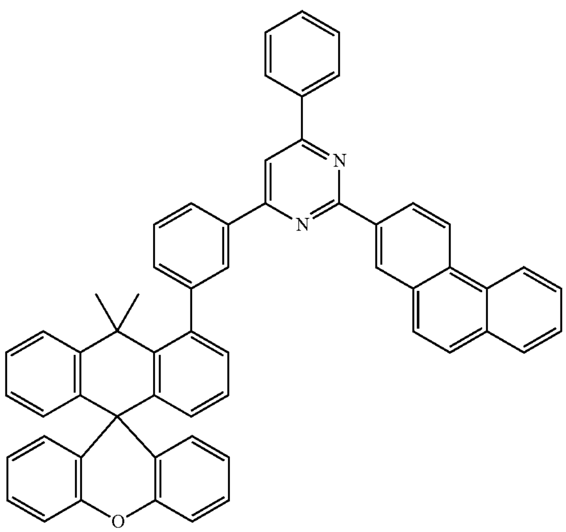
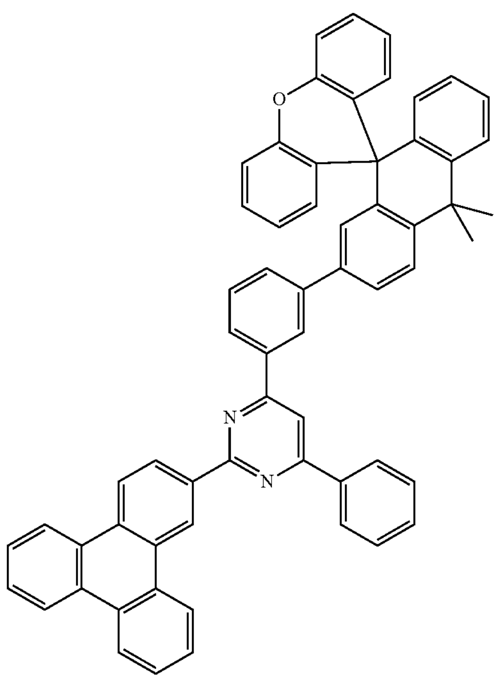
-continued
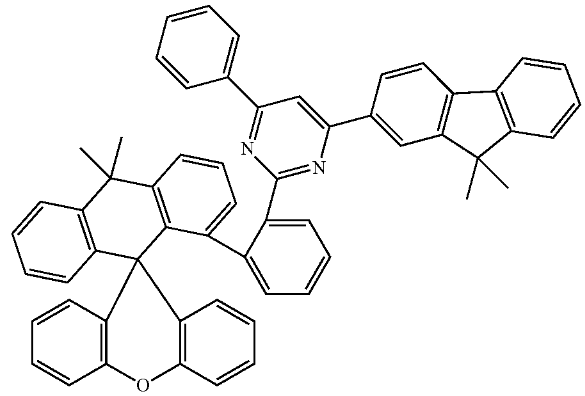
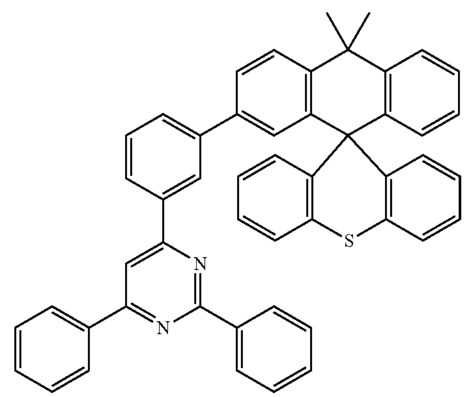
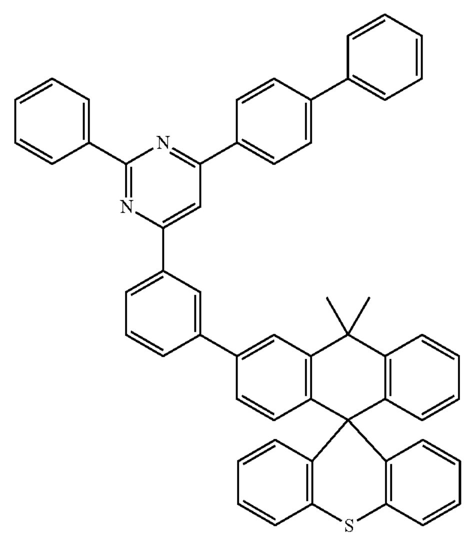

-continued
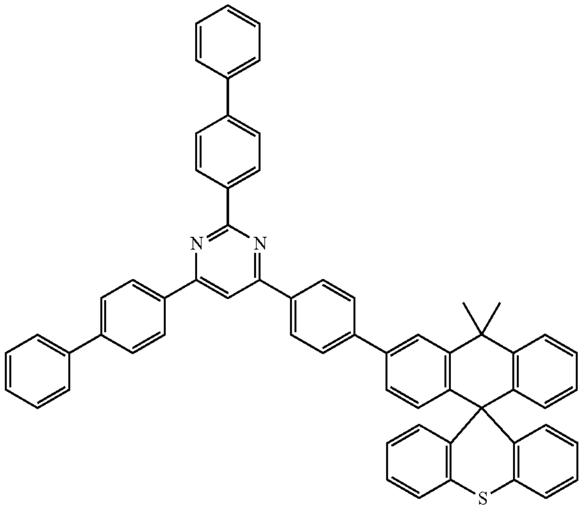
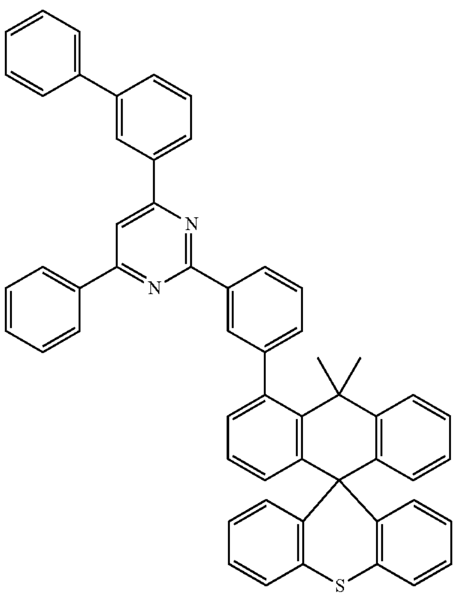
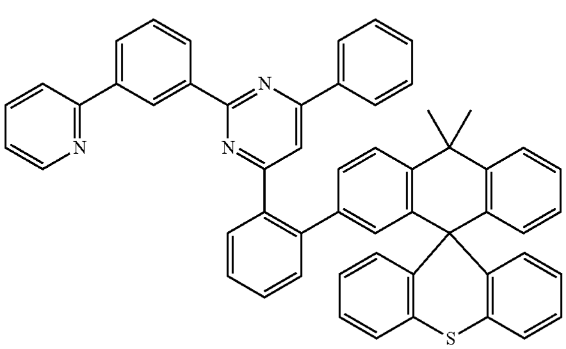
-continued
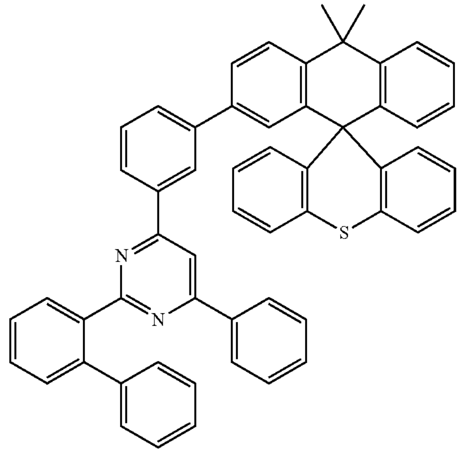
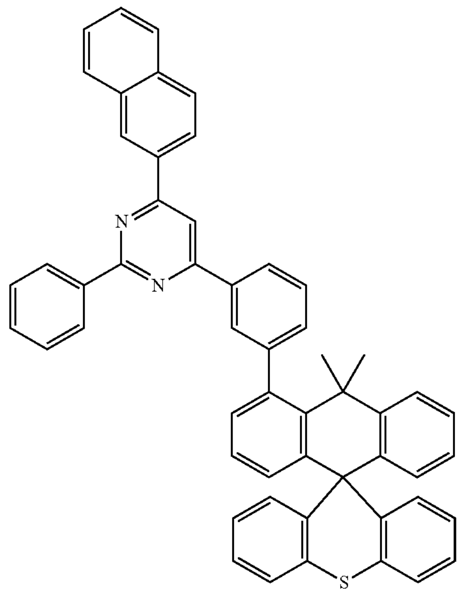
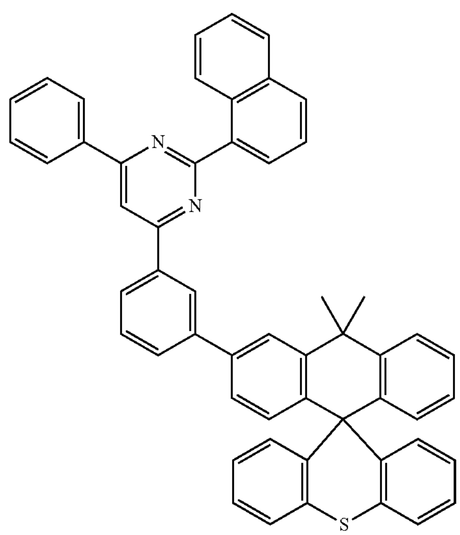

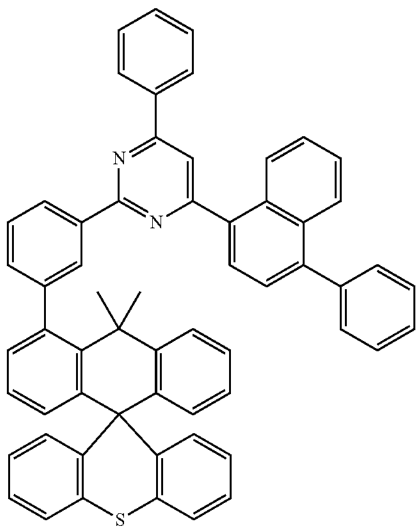
N
N
S
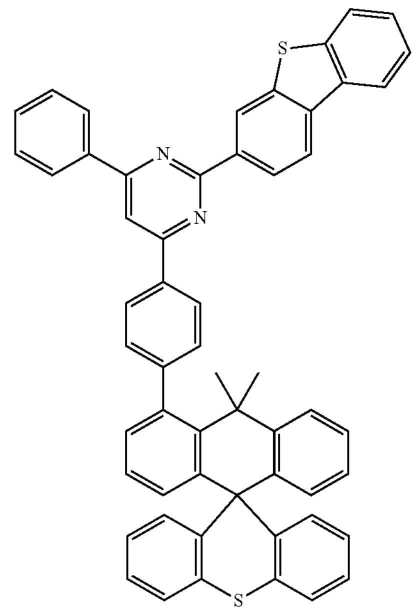
S
N
N
S
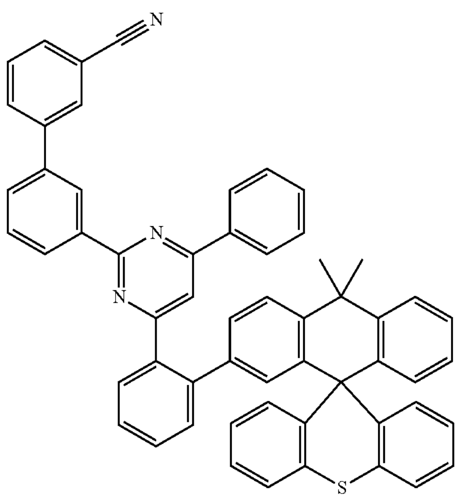
N
N
N
S
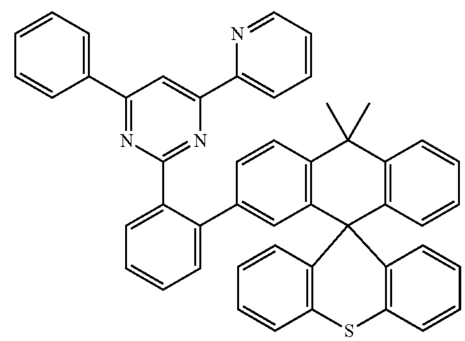
N
N
N
S
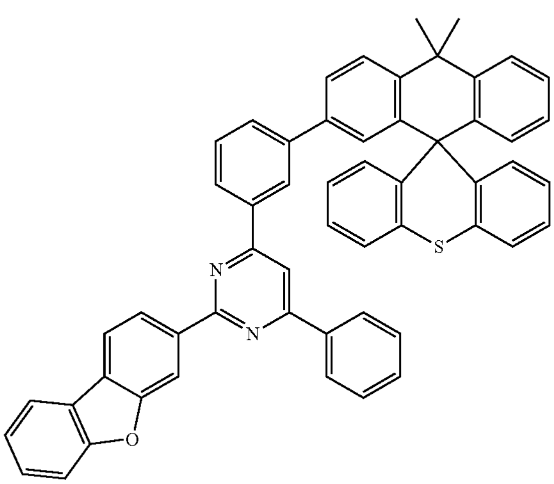
S
N
N
O
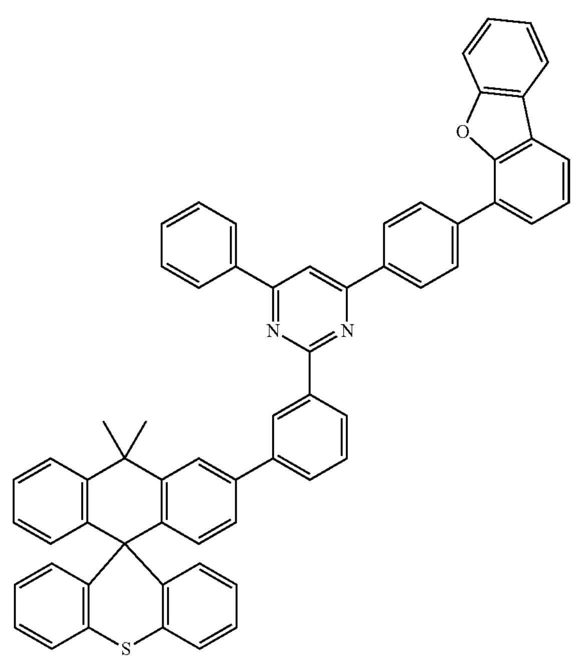
O
N
N
S -continued
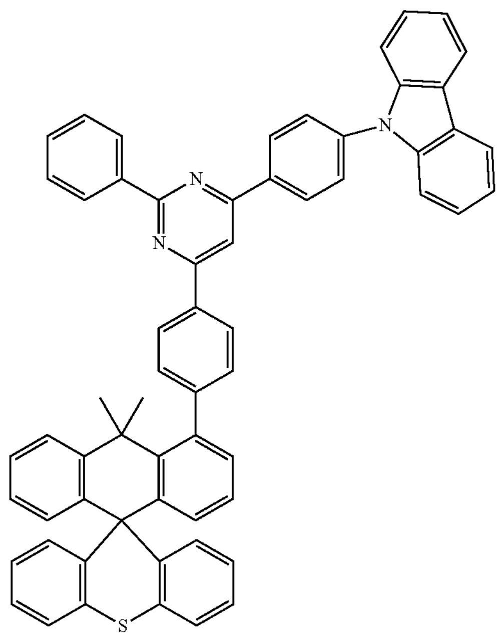
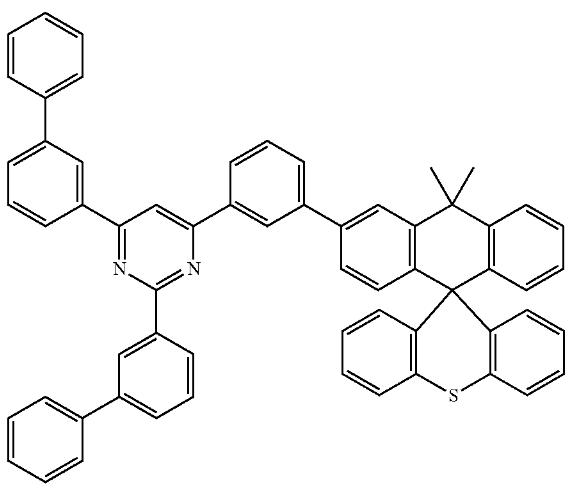
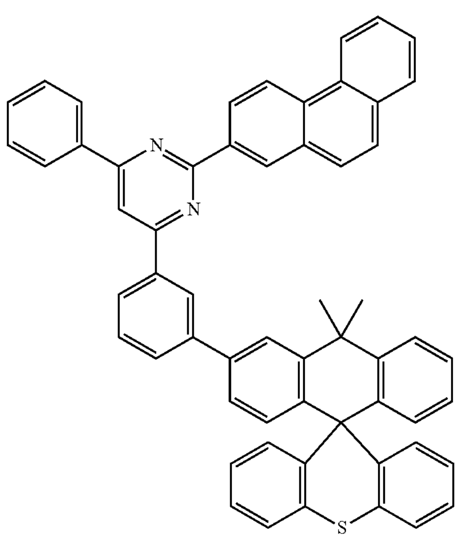
-continued
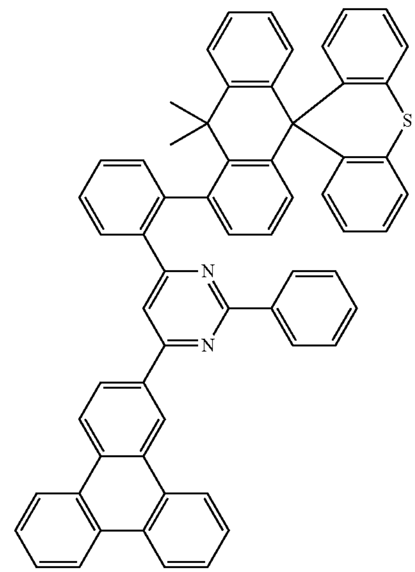
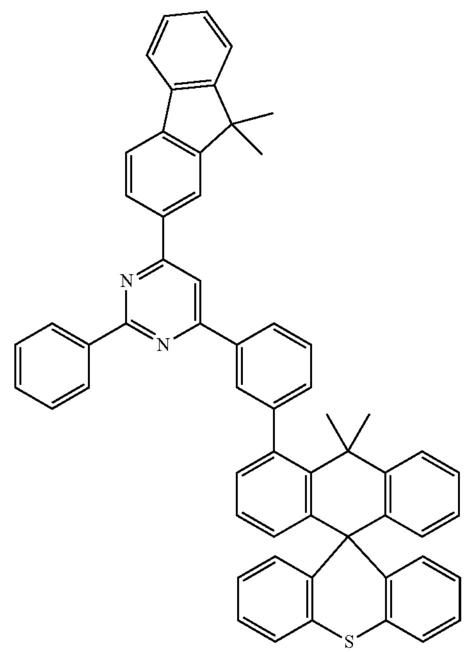
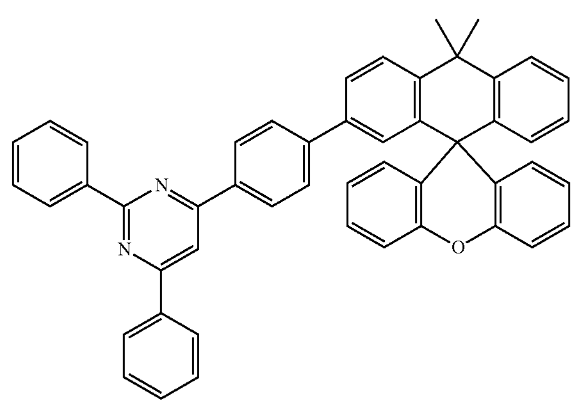

-continued
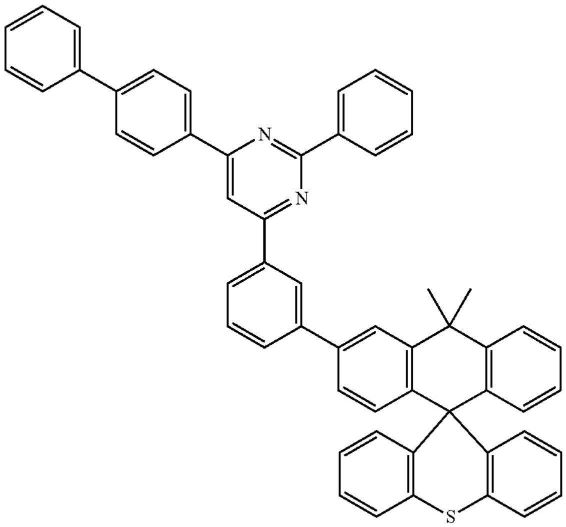
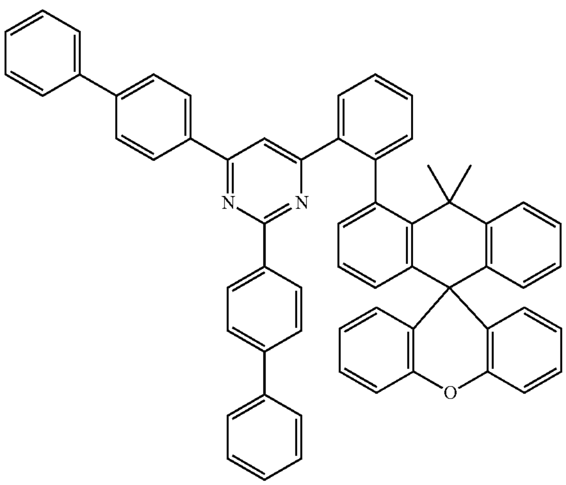
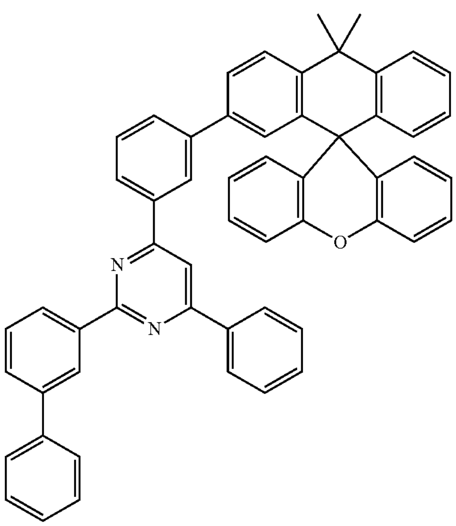
-continued
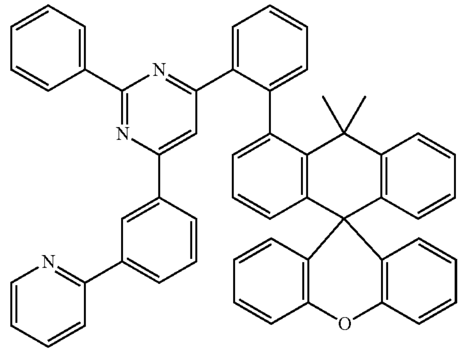
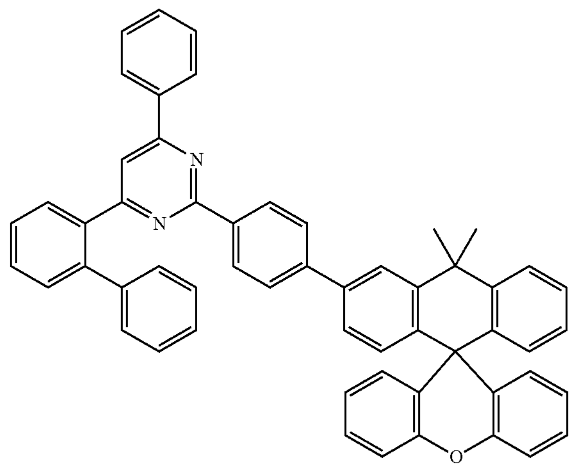
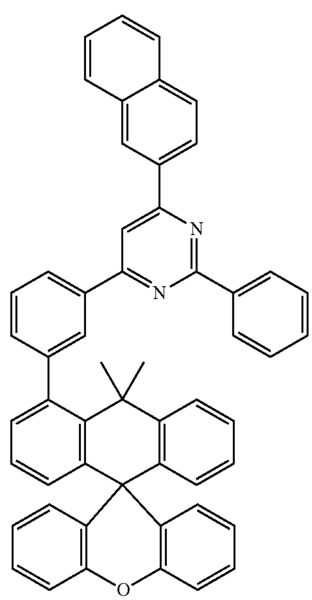

-continued
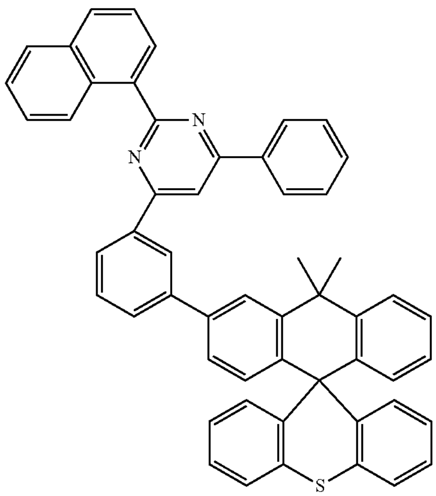
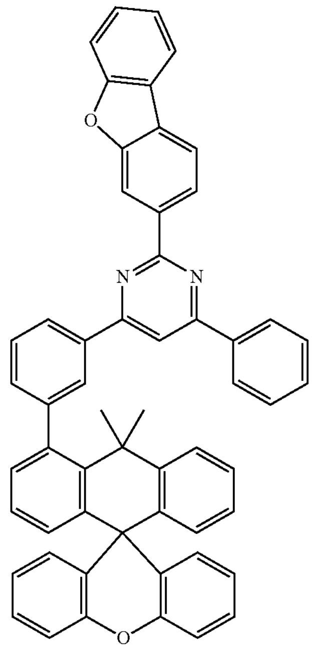
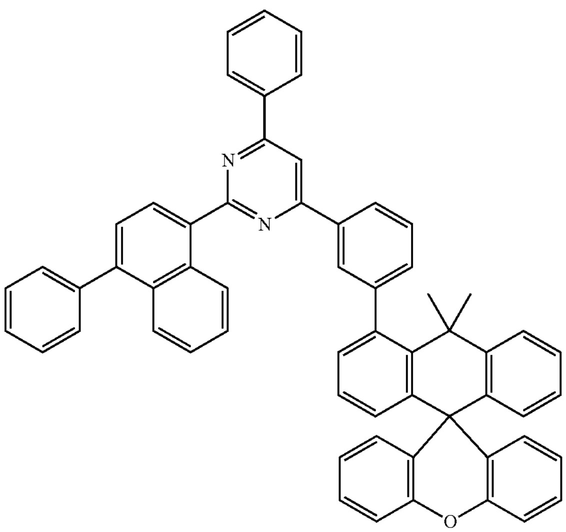
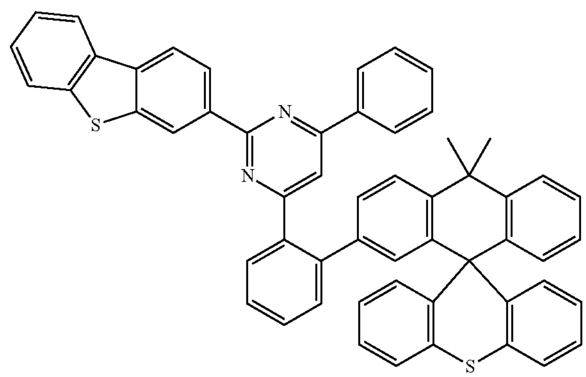
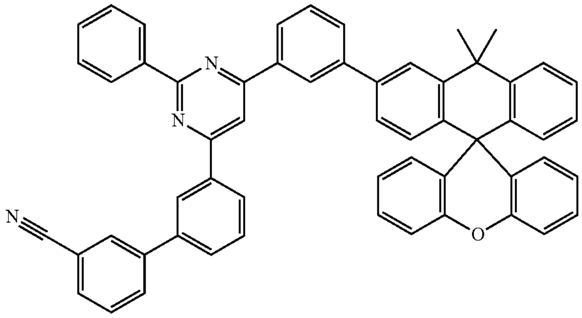
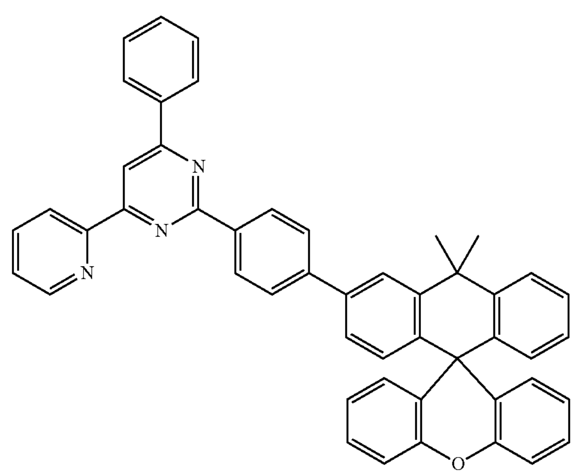

-continued
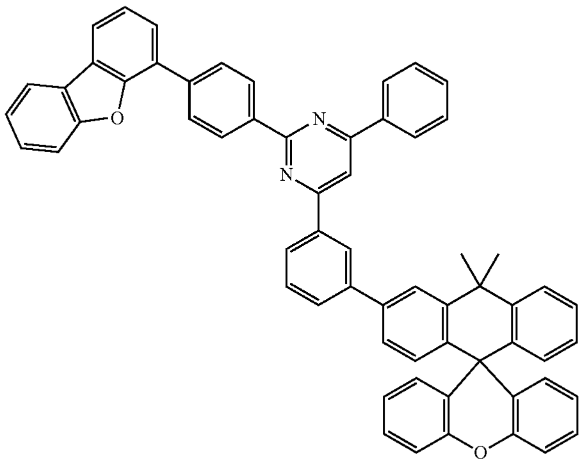
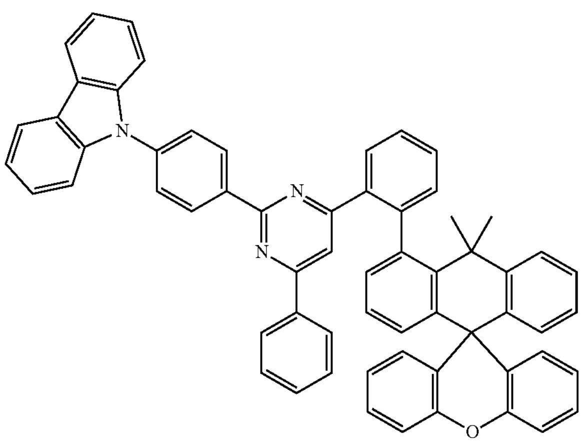
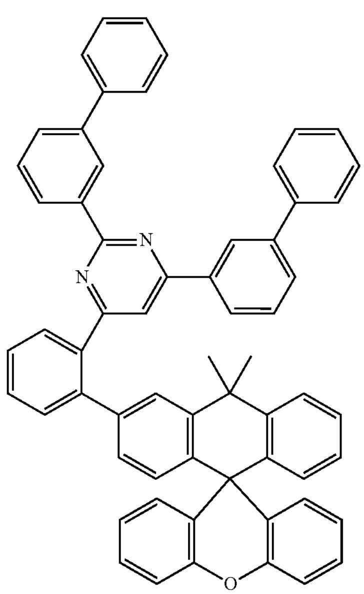
-continued
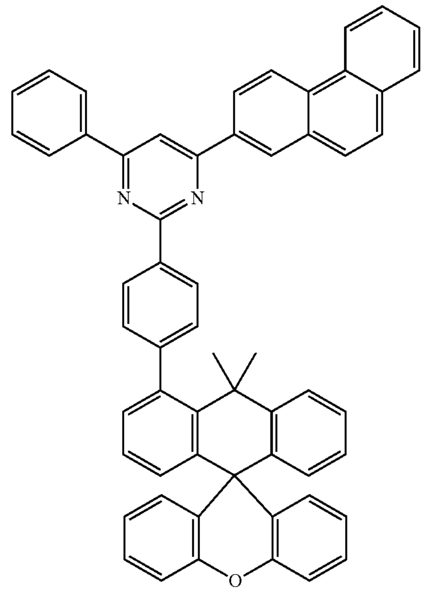
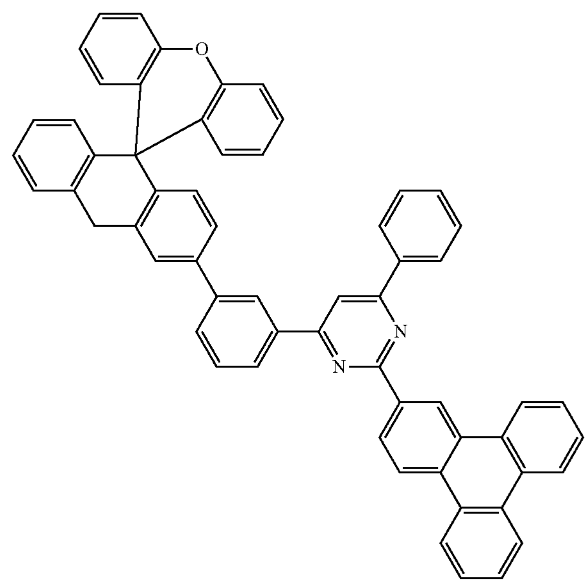
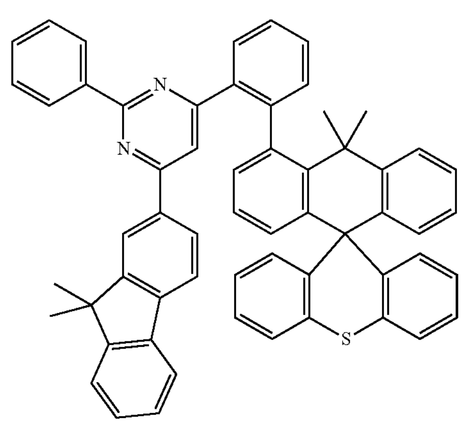

-continued
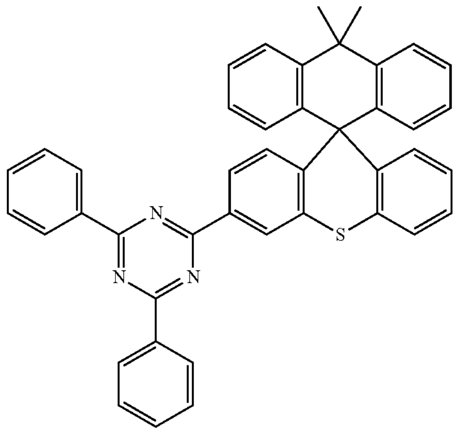
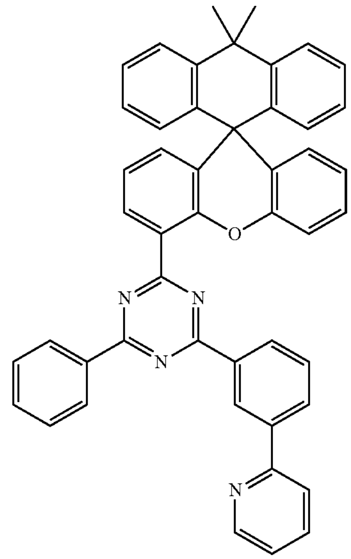
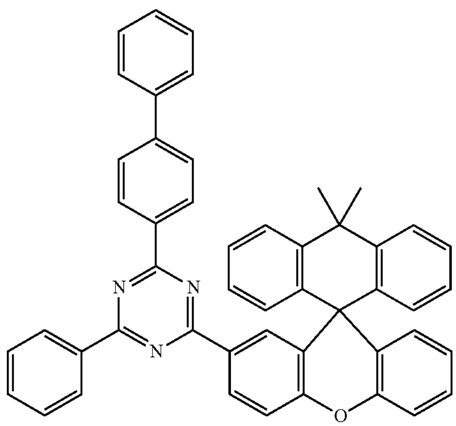
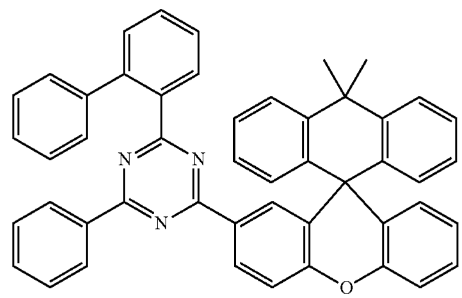
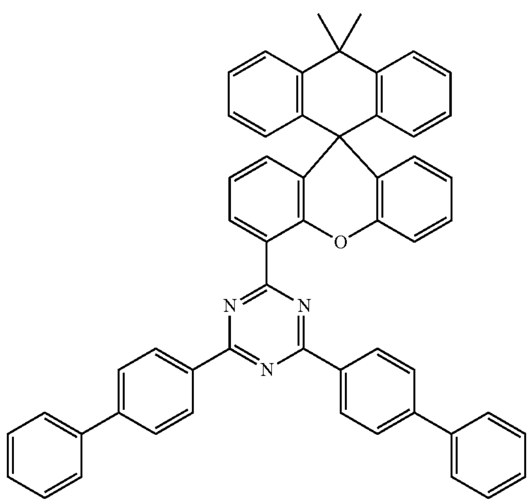
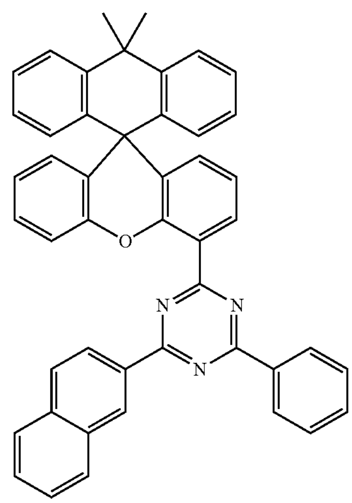
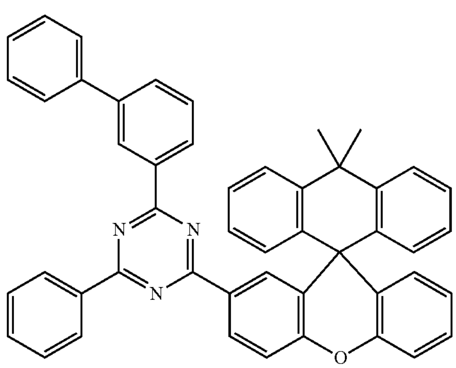
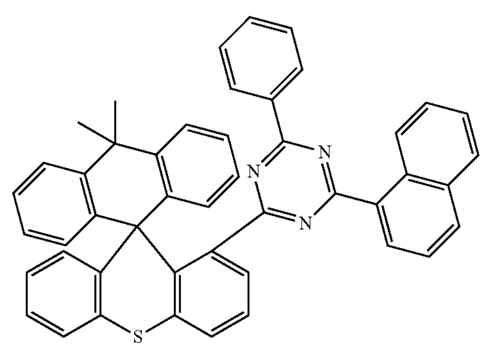
-continued -continued
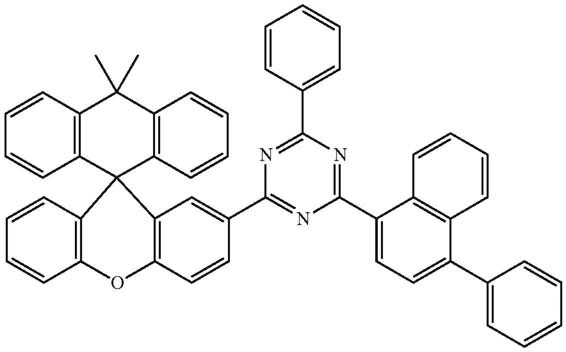
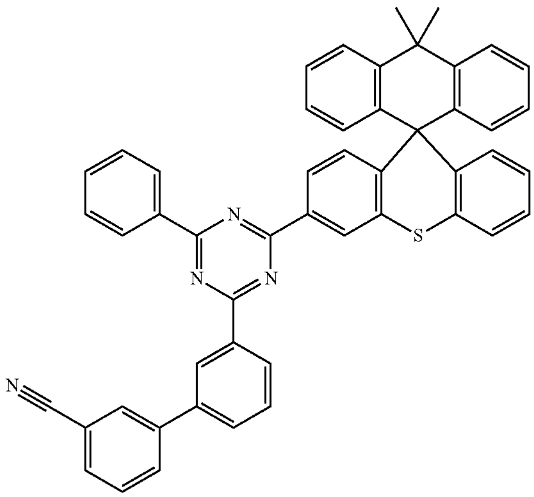
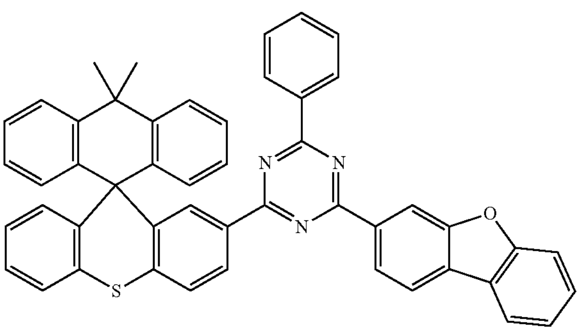
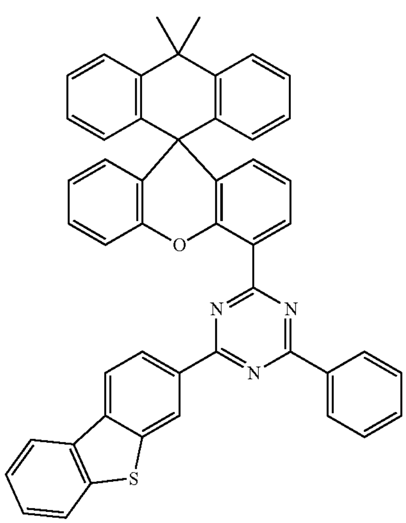
-continued
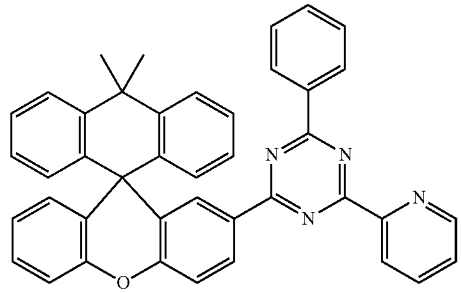
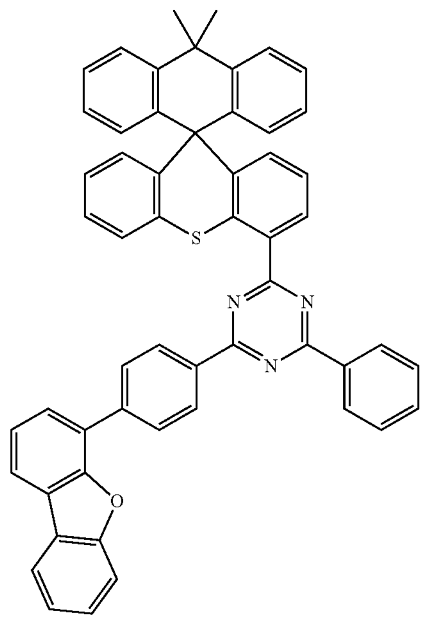
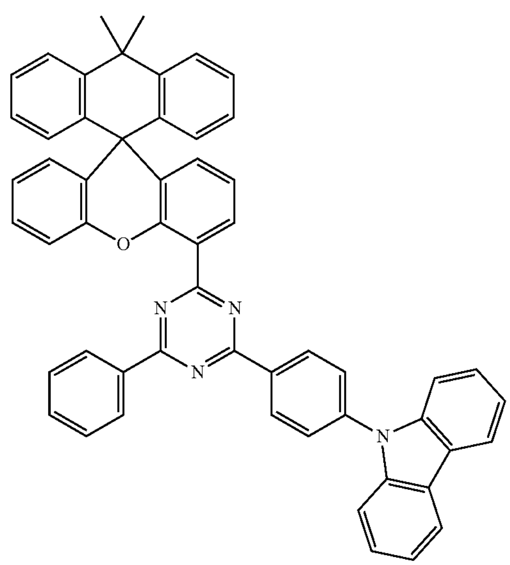

-continued
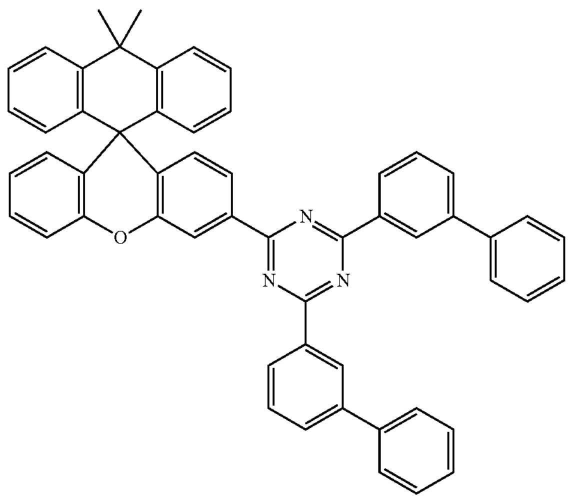
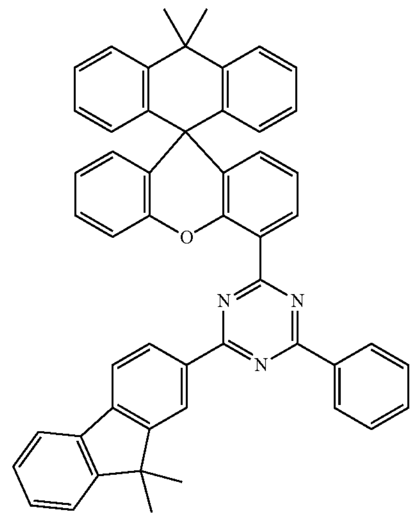
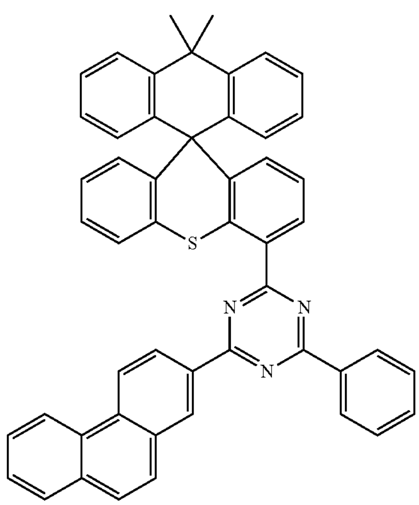
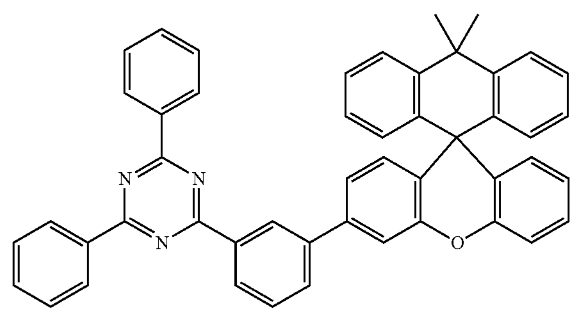
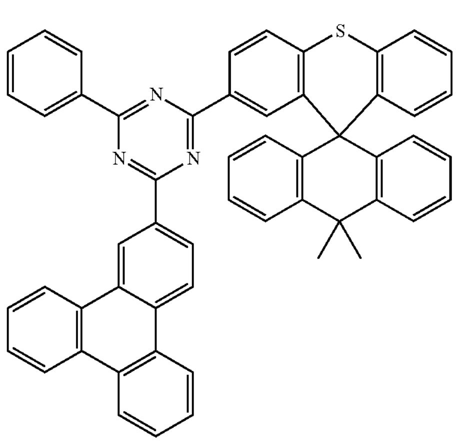
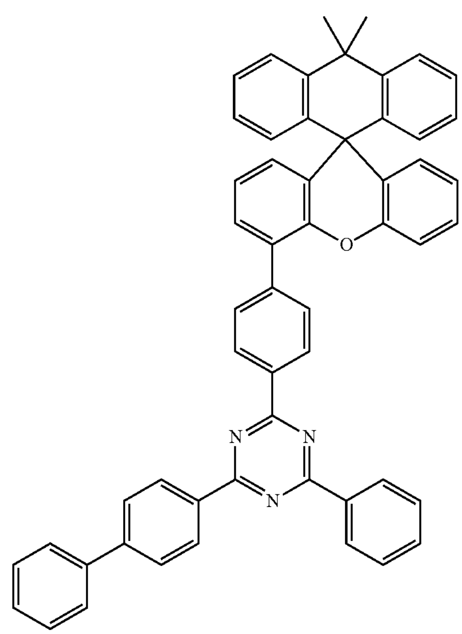

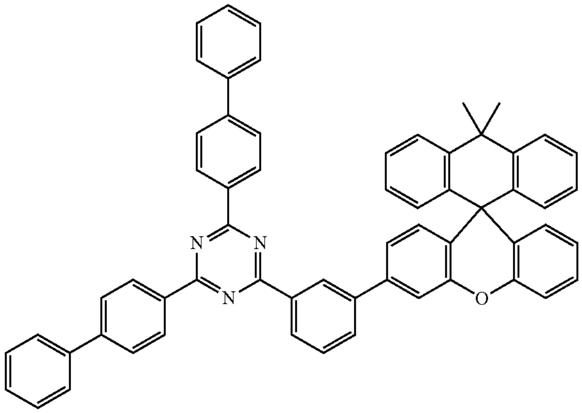
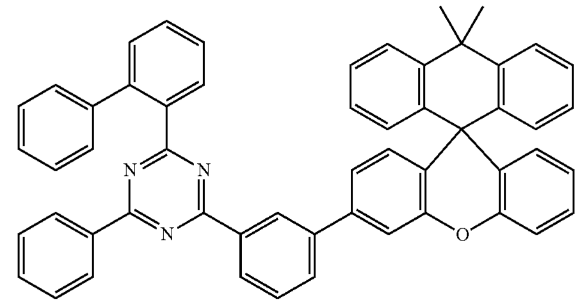
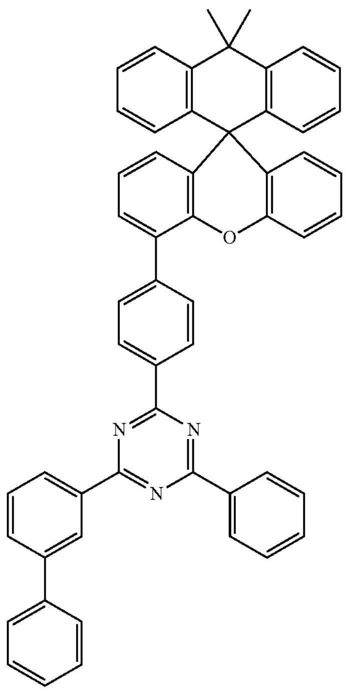
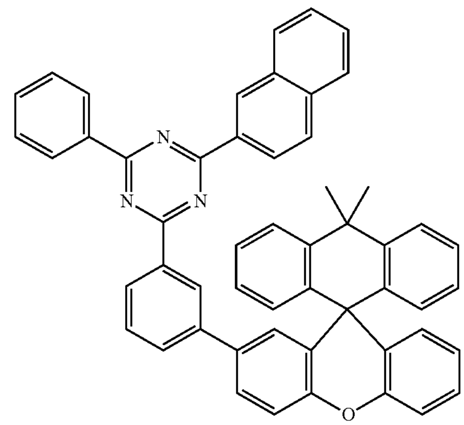
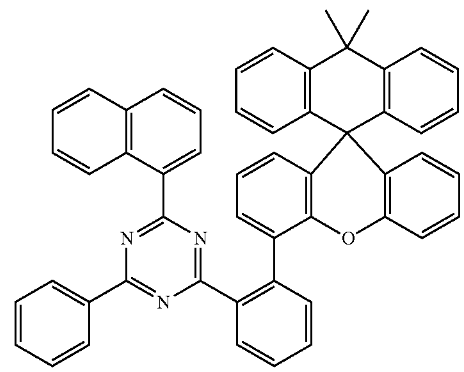
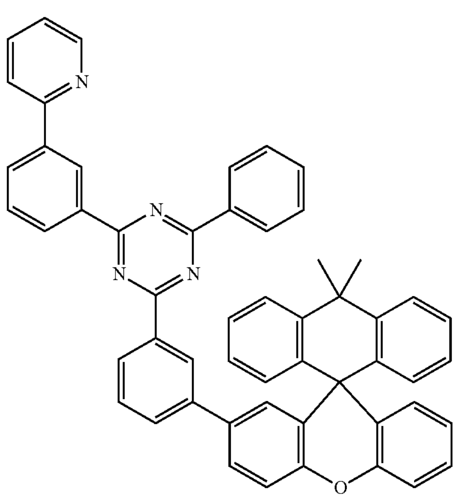
N
N
N
N
N
N
N
N
N
N
N
N
N
N
N
N
N
N
N
O
O
O
O
O
O -continued
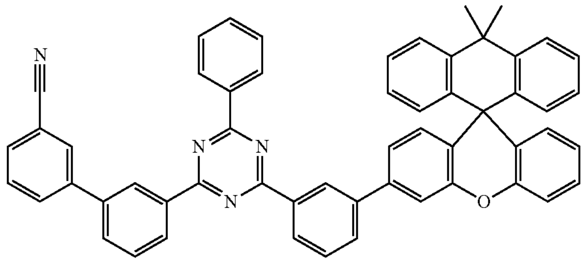
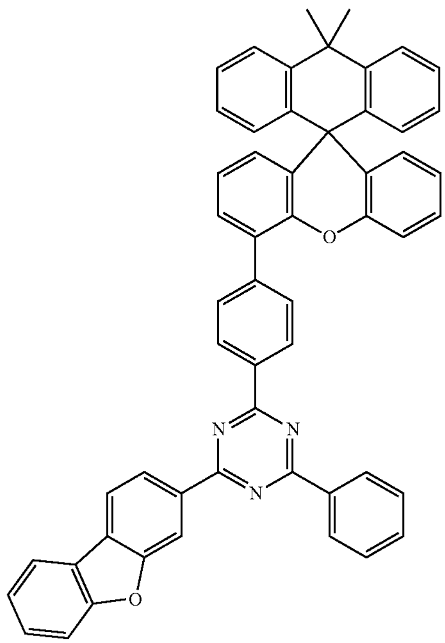
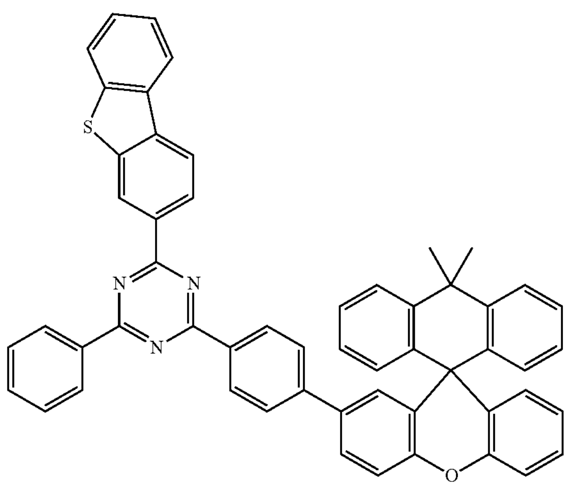
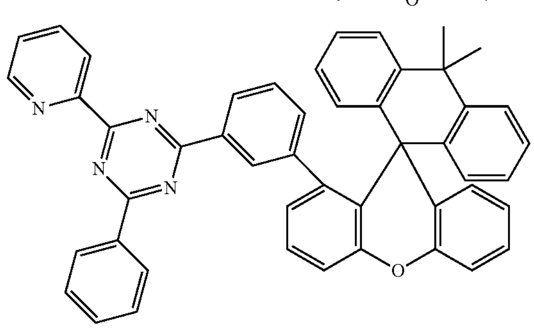
-continued
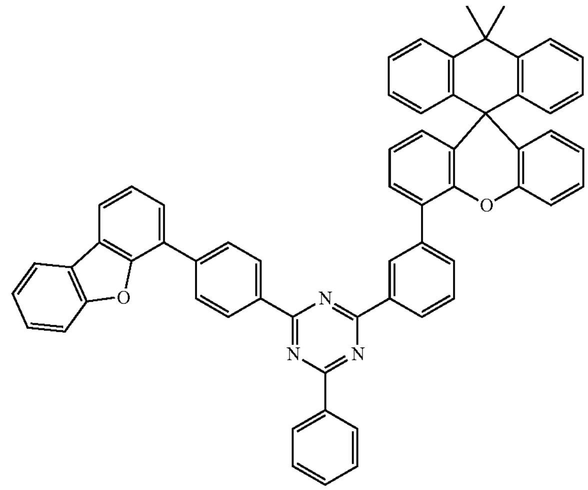
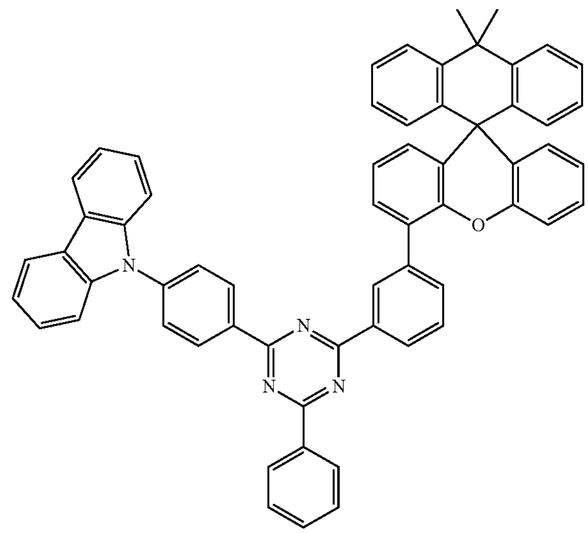
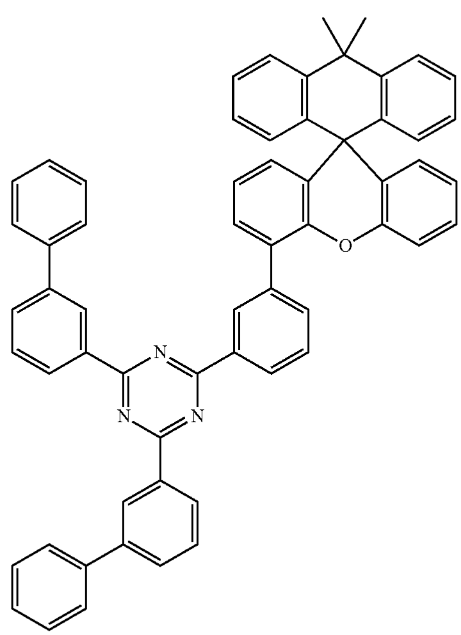

-continued
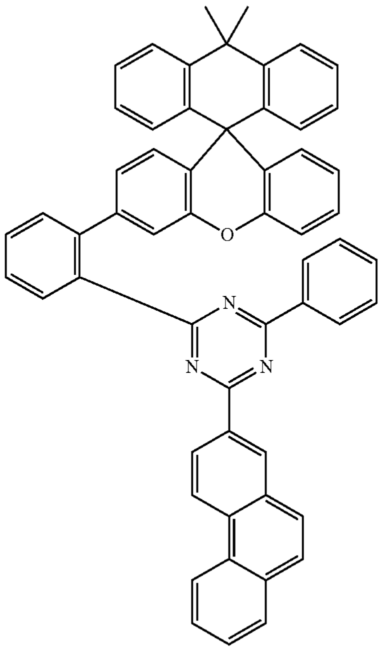
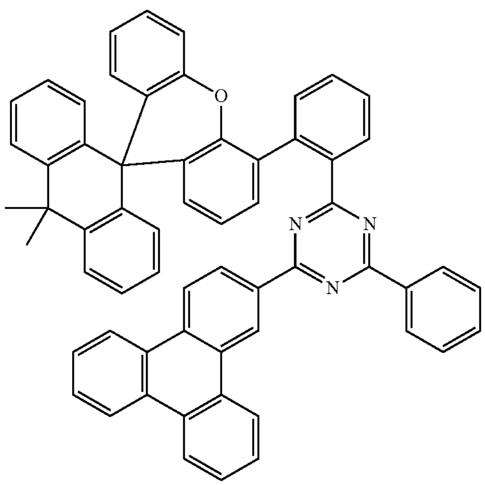
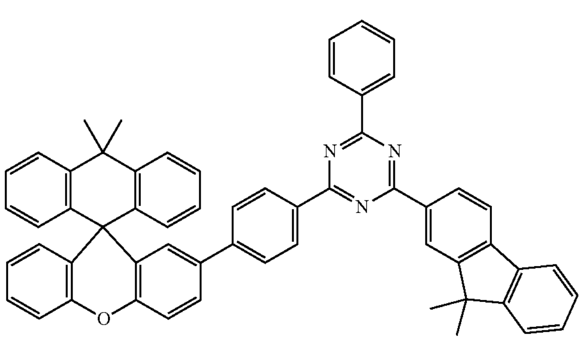
-continued
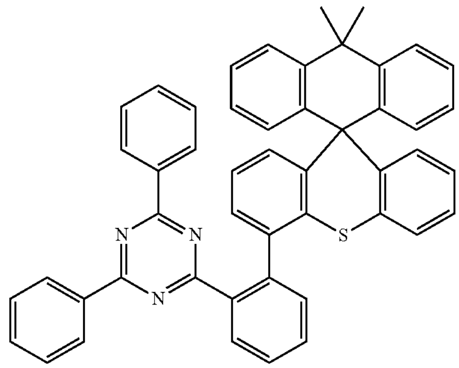
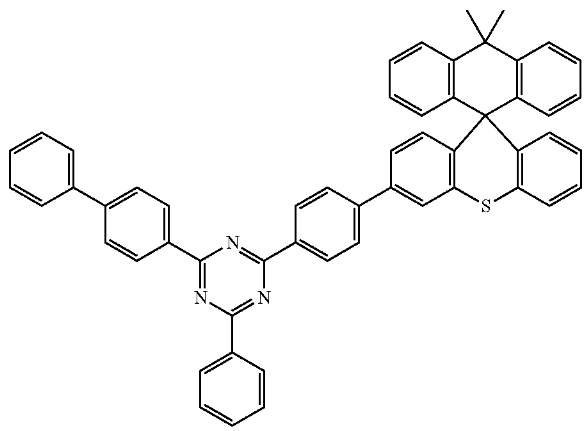
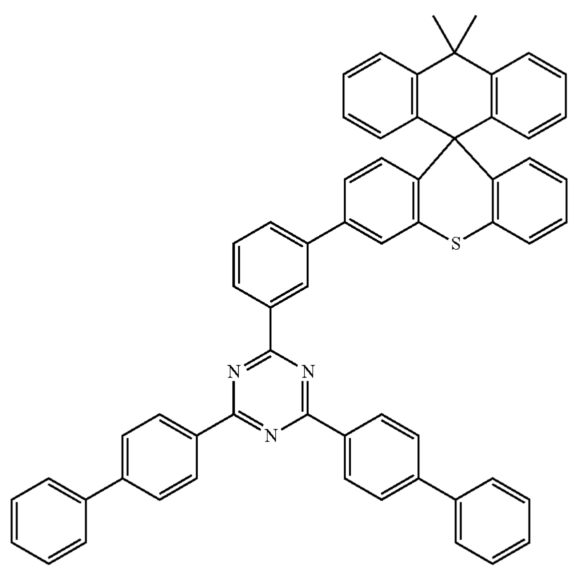

-continued
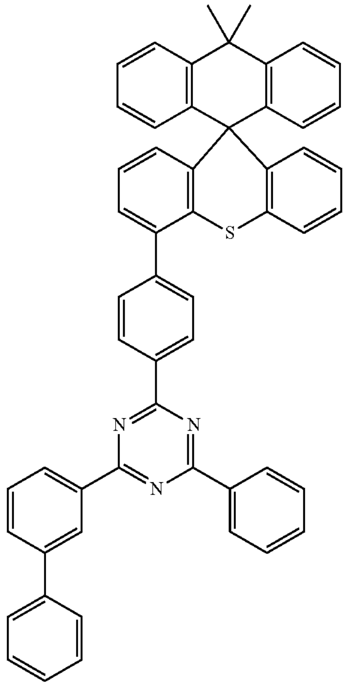
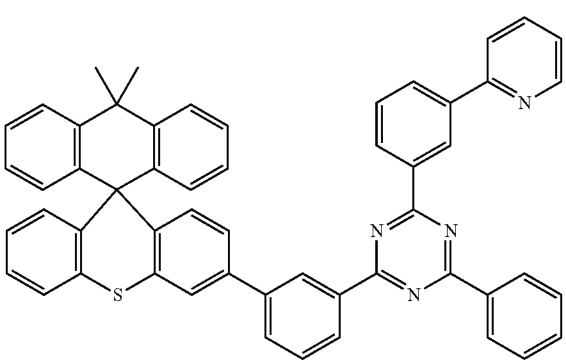
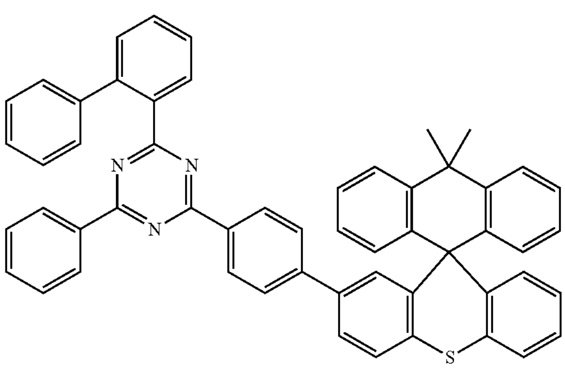
-continued
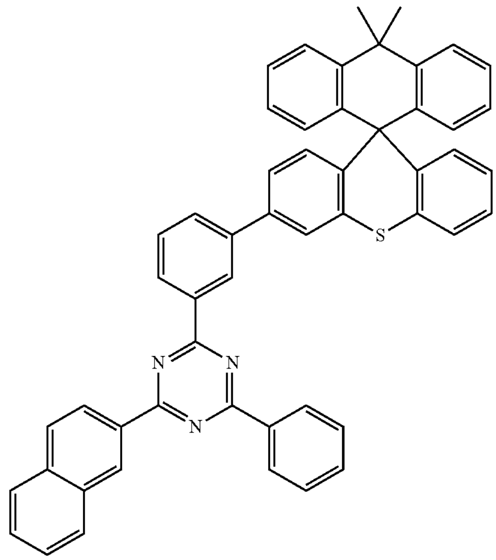
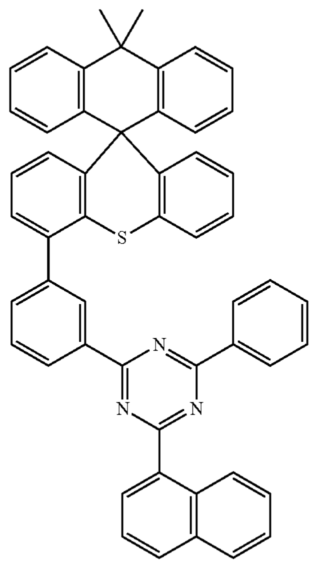
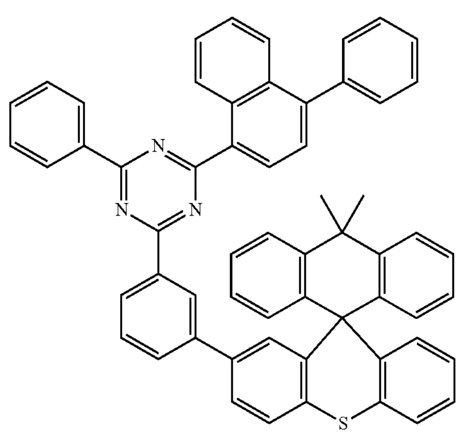

-continued
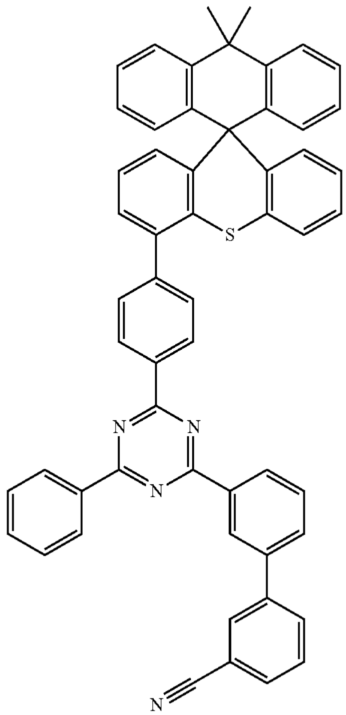
-continued
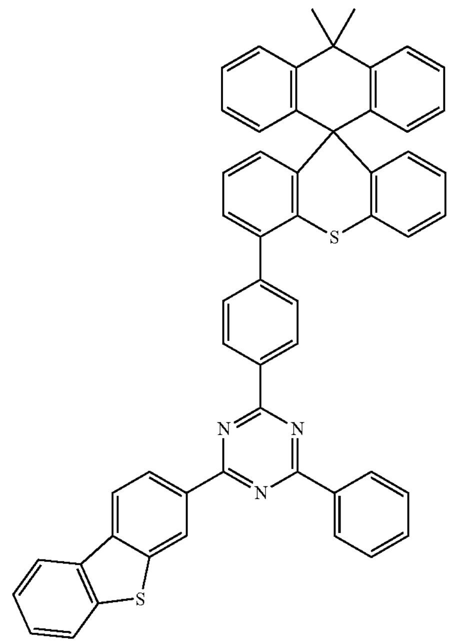
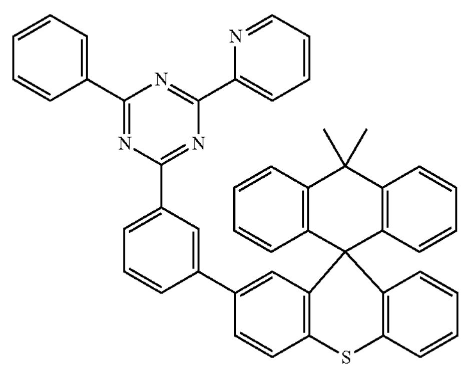
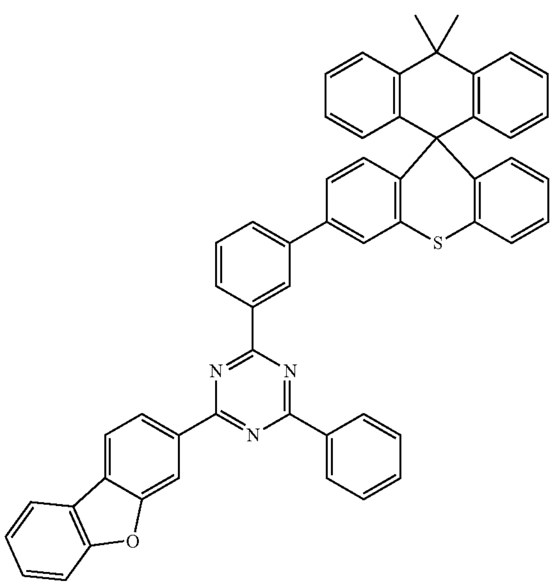
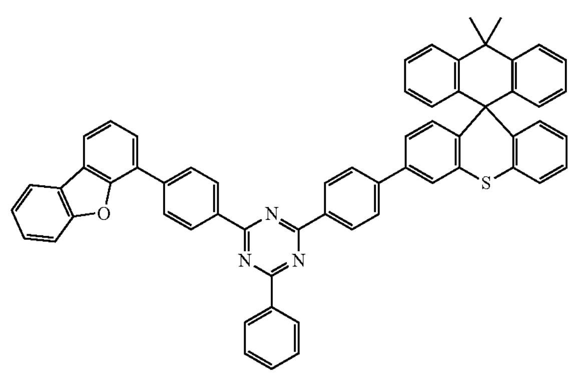

-continued
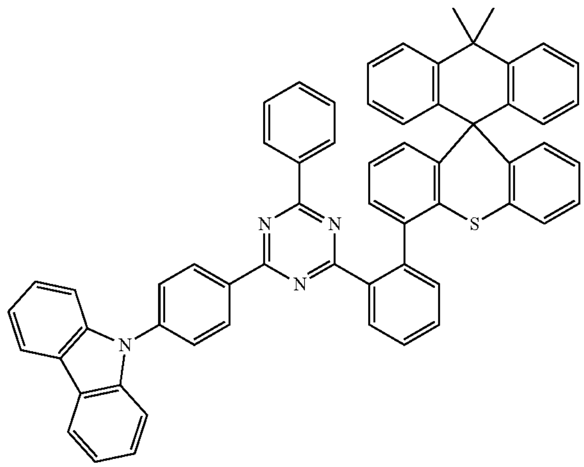
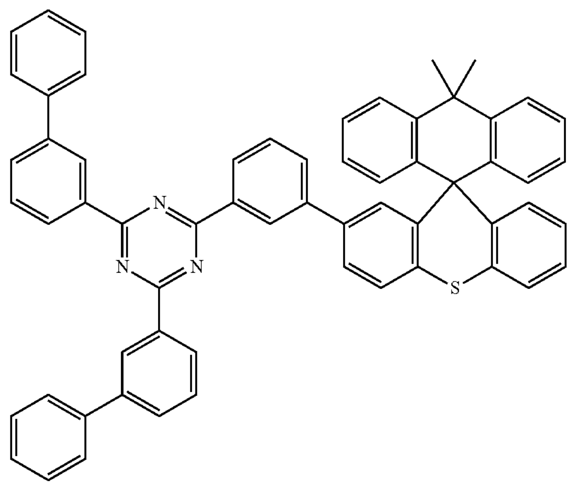
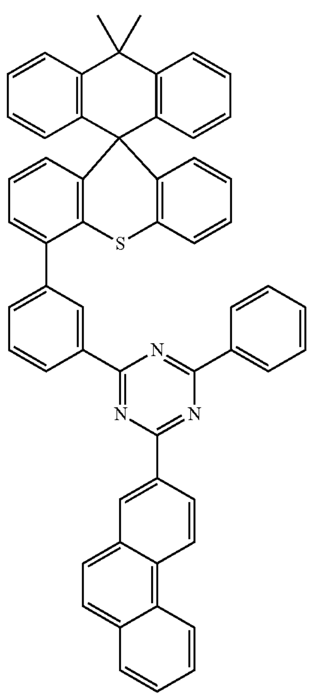
-continued
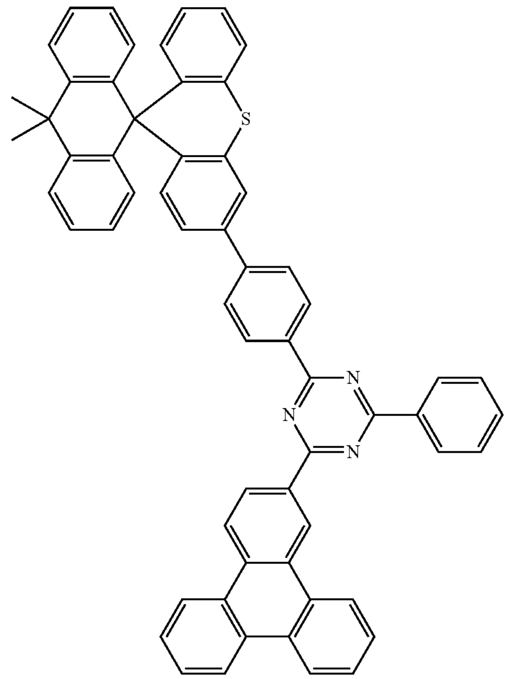
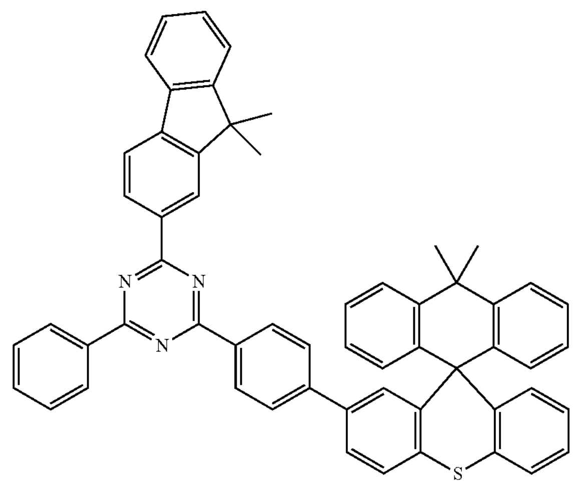
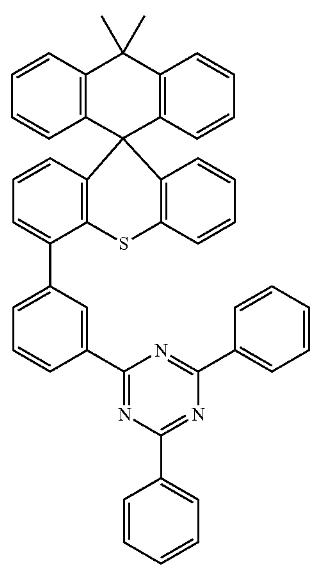

-continued
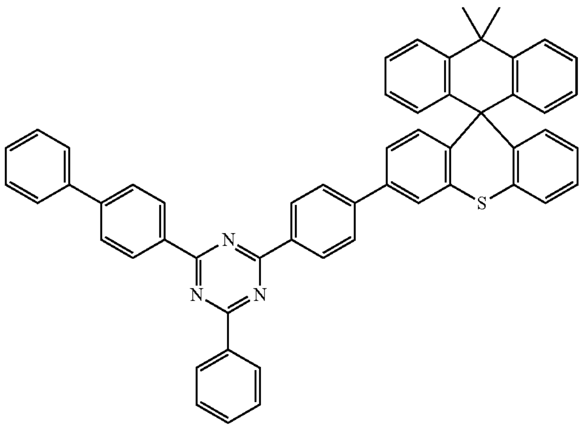
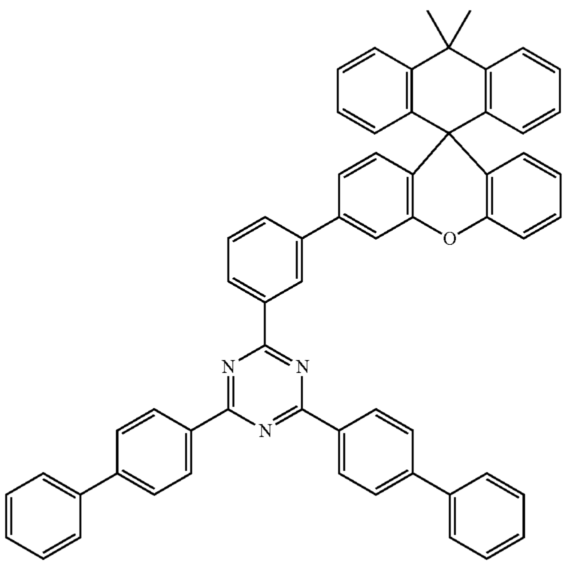
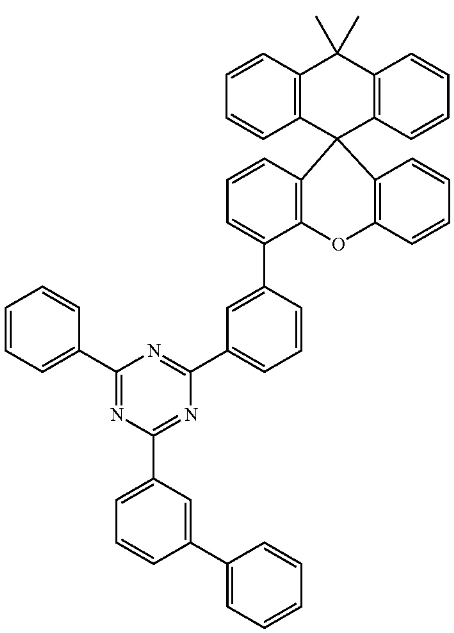
-continued
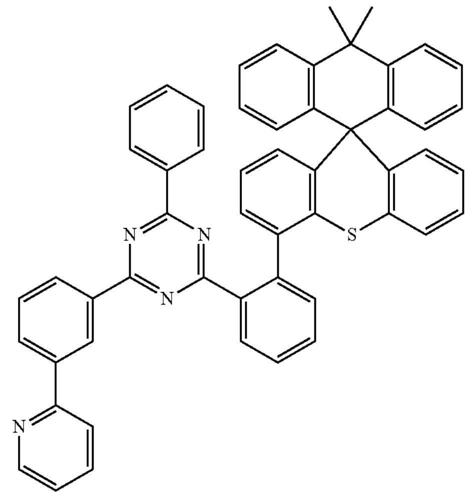
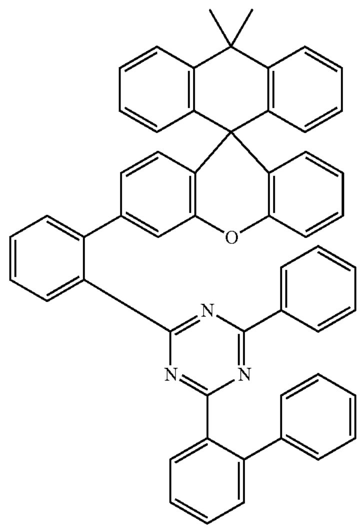
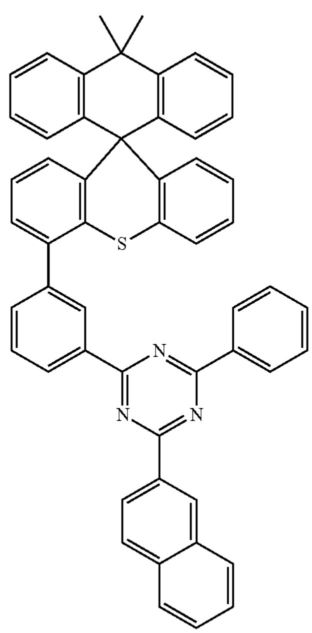

-continued
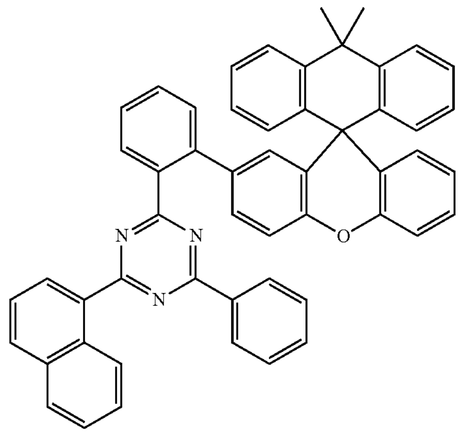
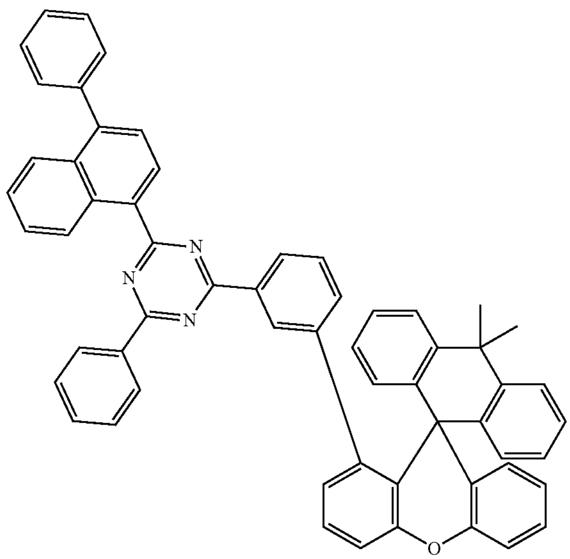
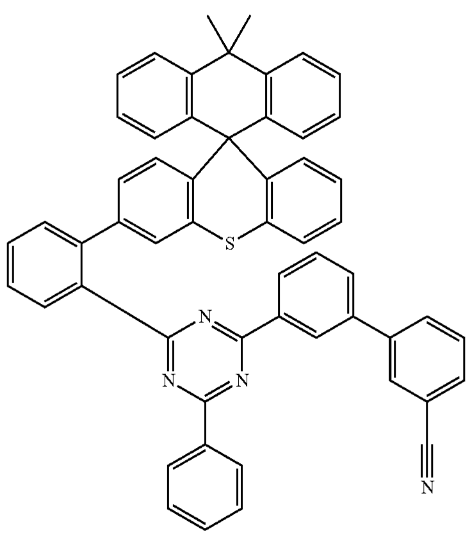
-continued
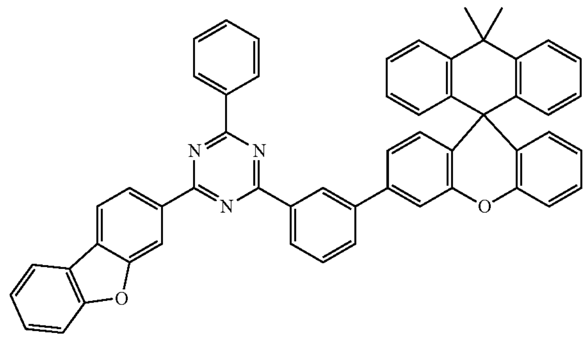
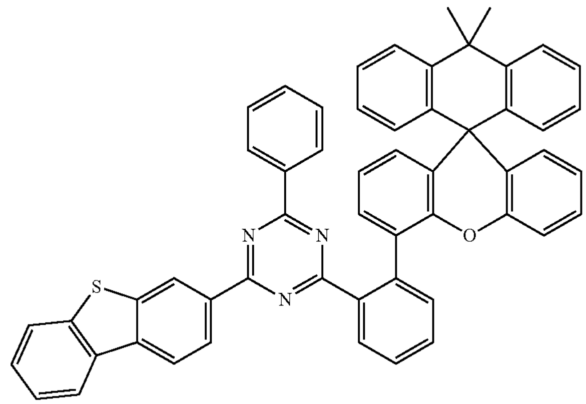
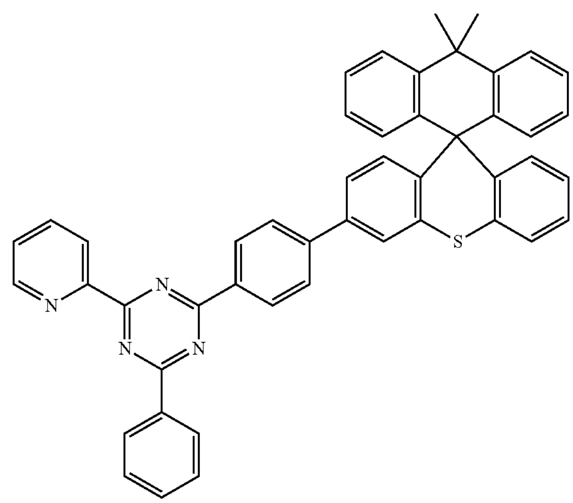
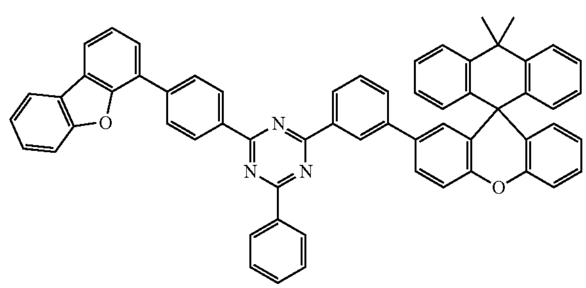

-continued
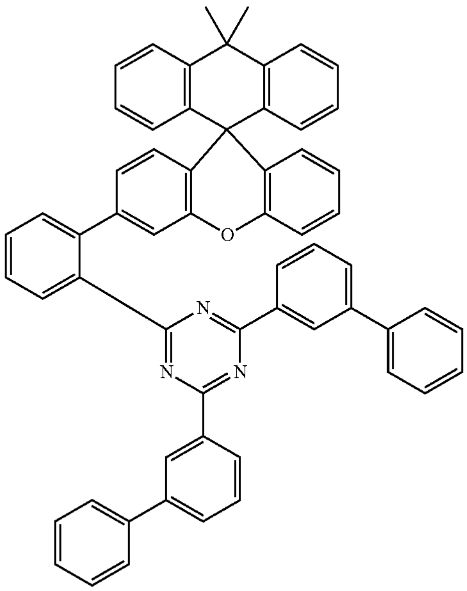
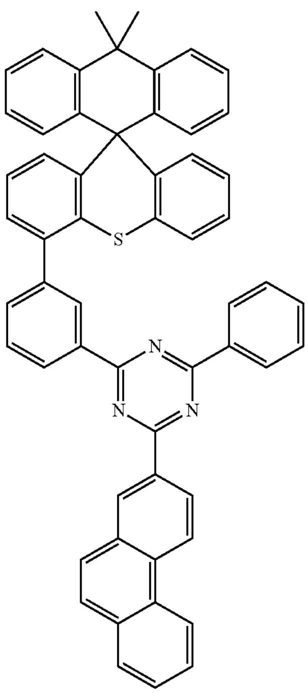
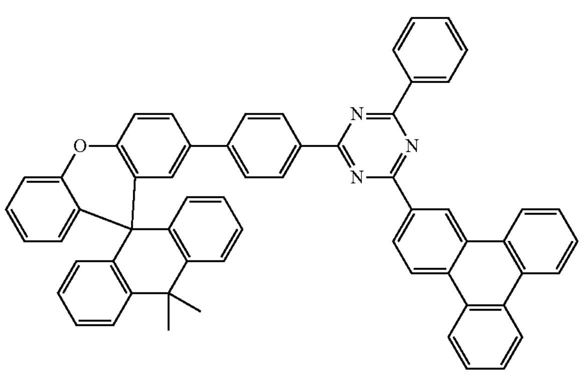
-continued
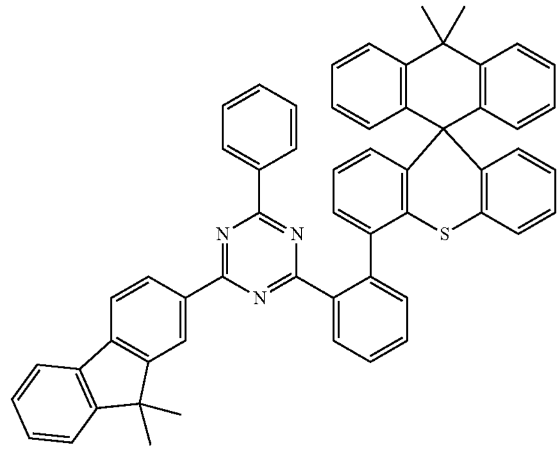
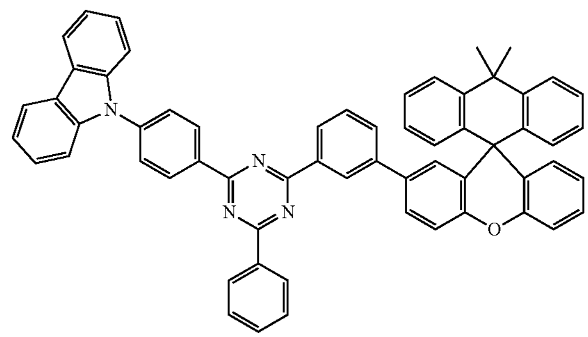
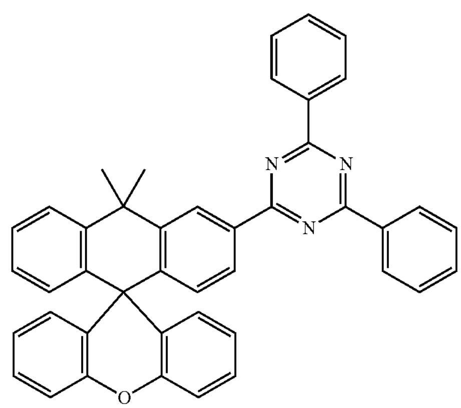
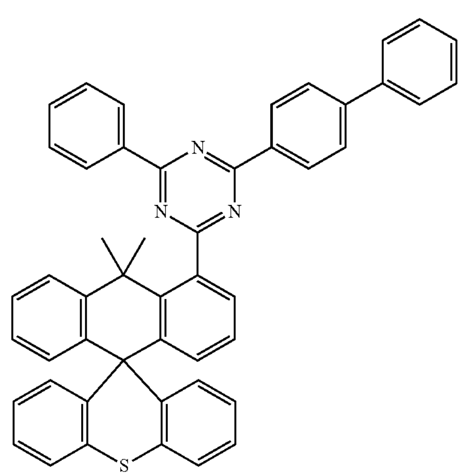

-continued
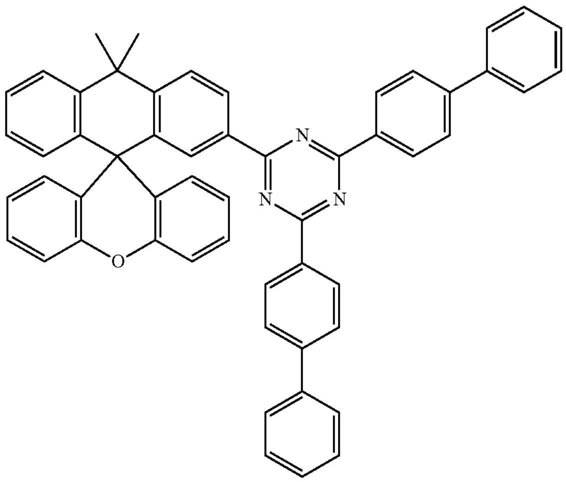
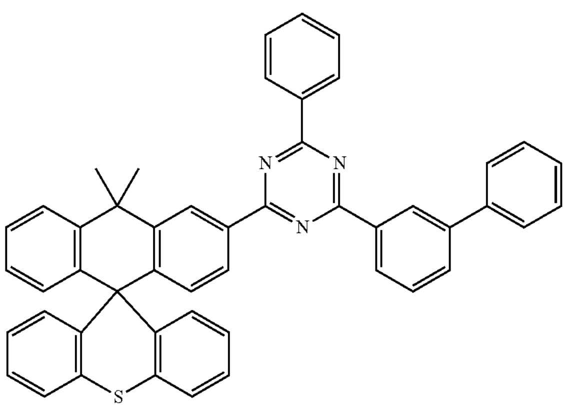
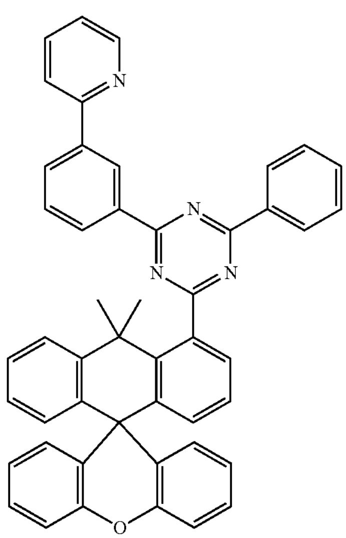
-continued
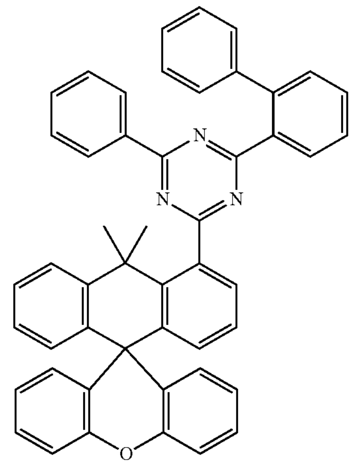
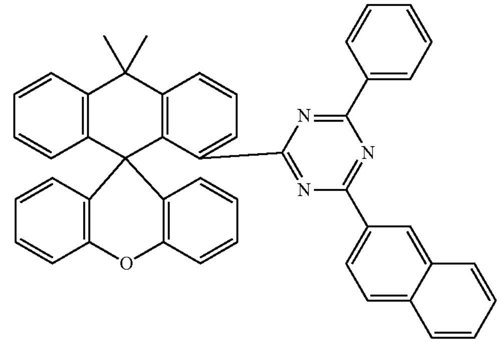
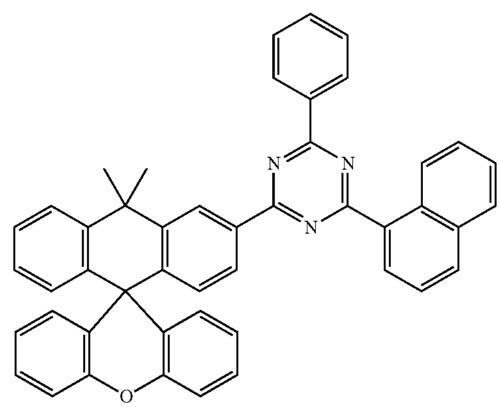
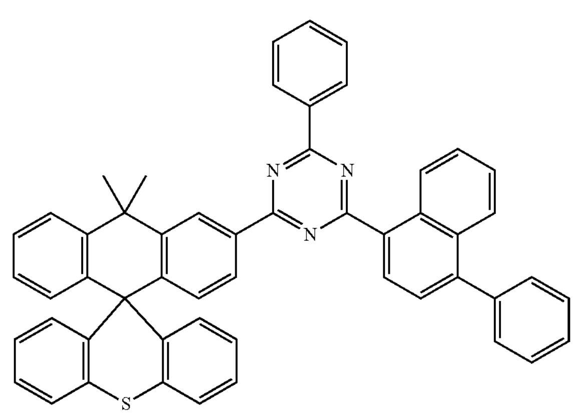

-continued
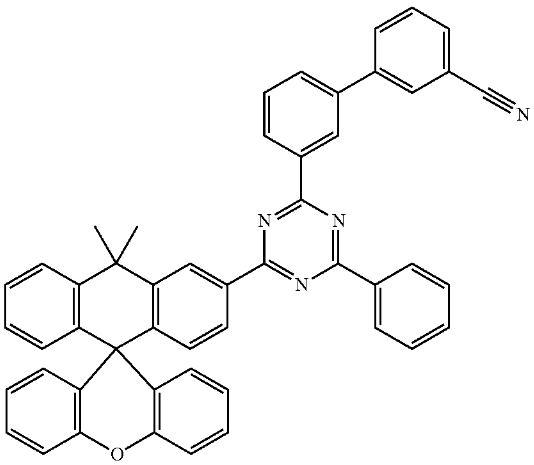
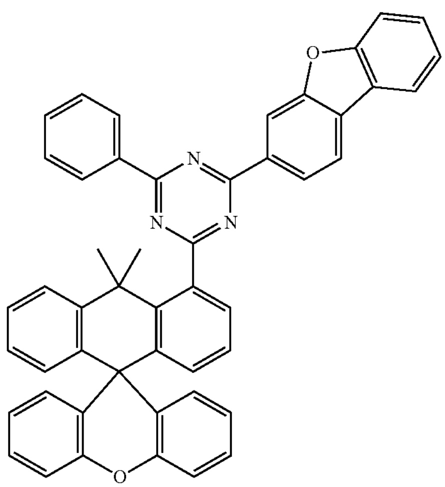
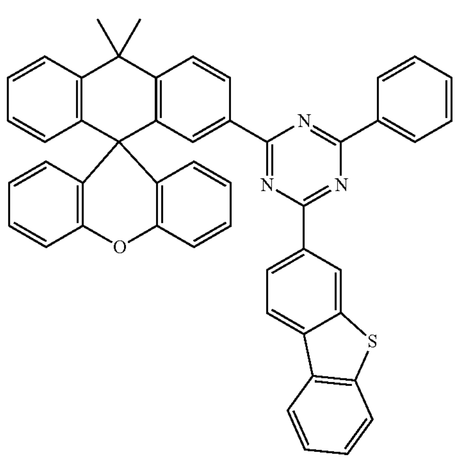
-continued
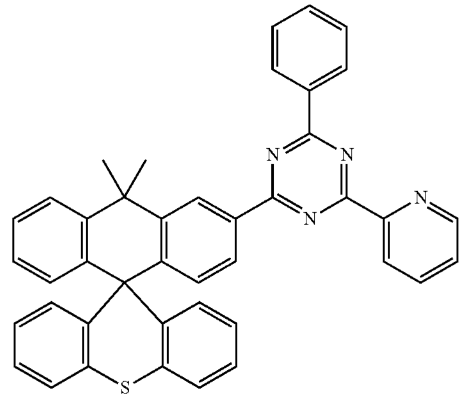
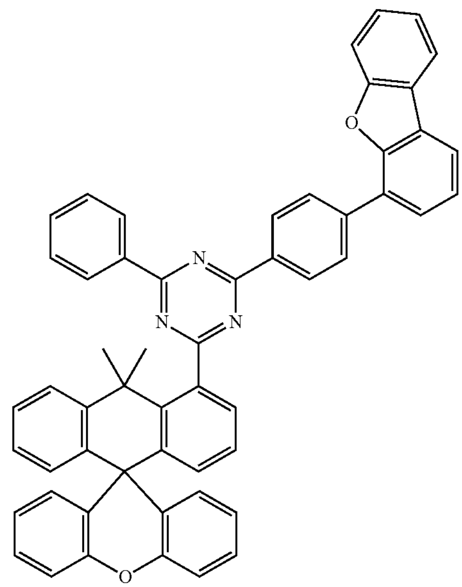
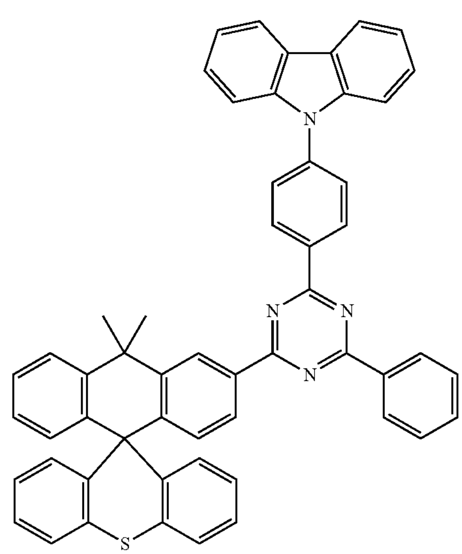

-continued
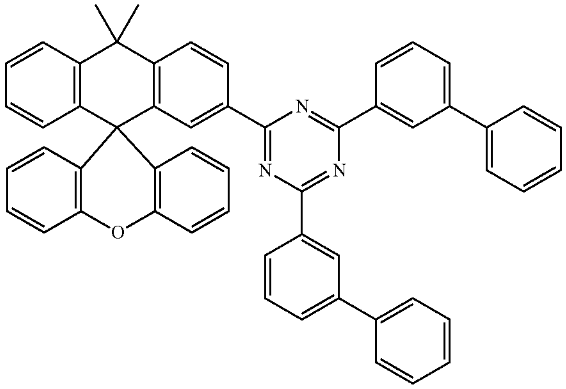
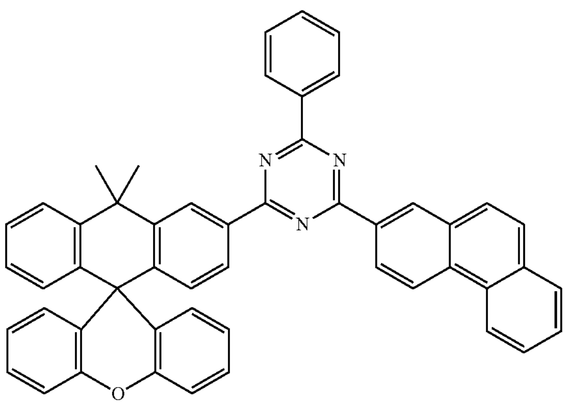
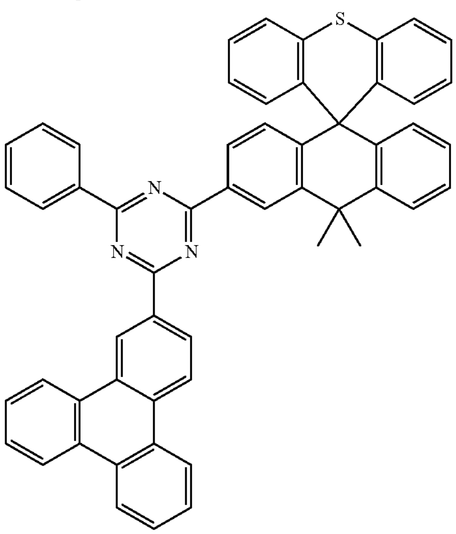
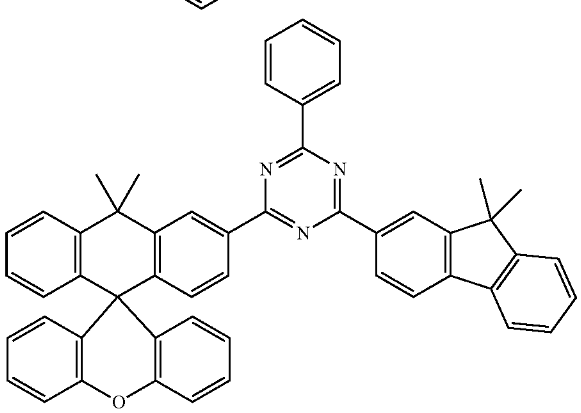
-continued
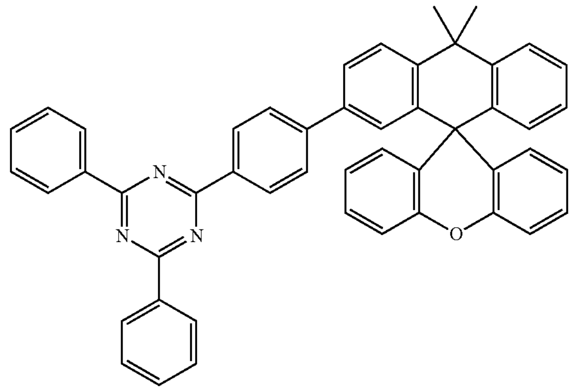
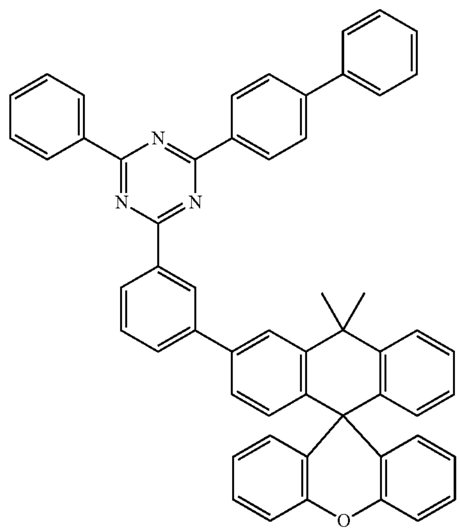
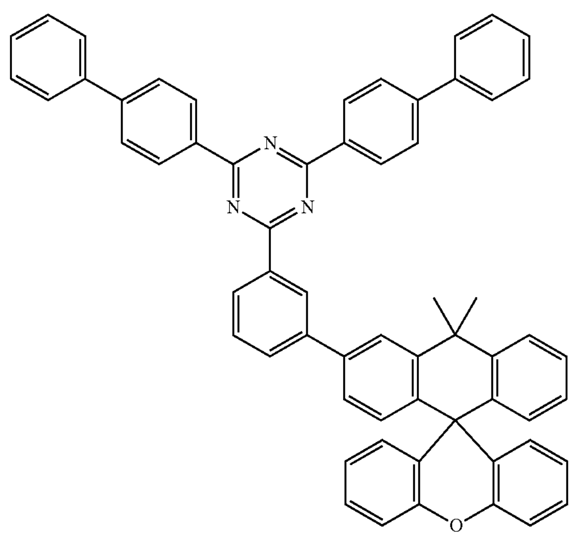

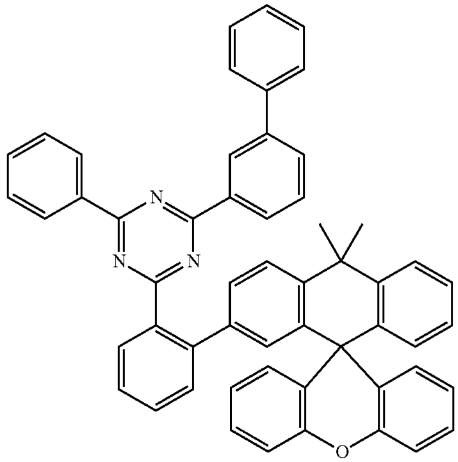
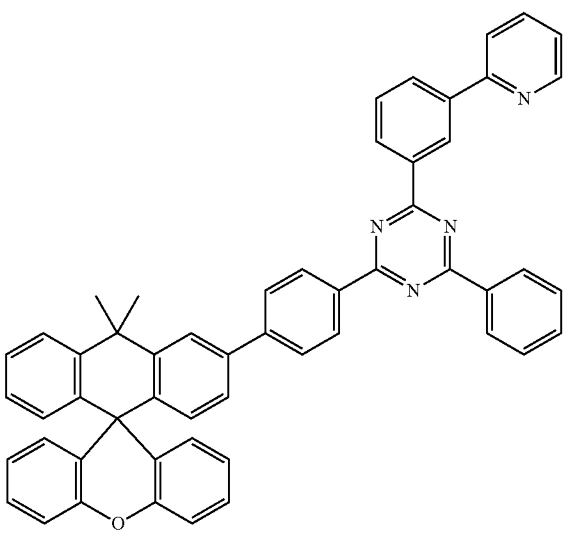
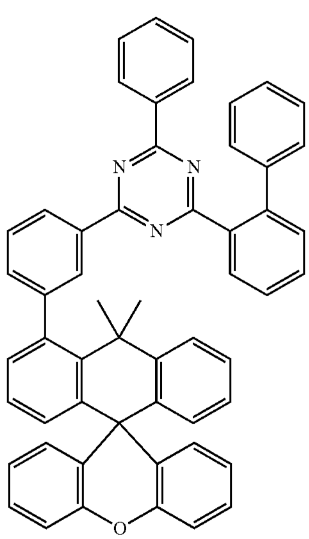
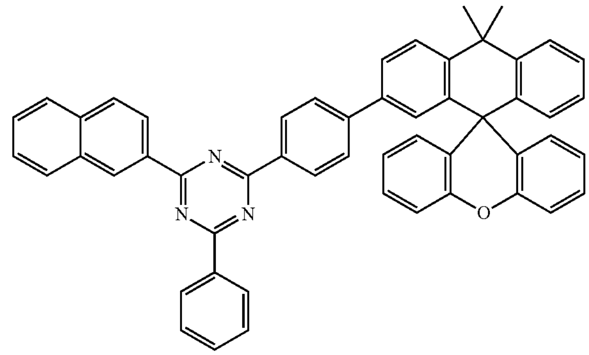
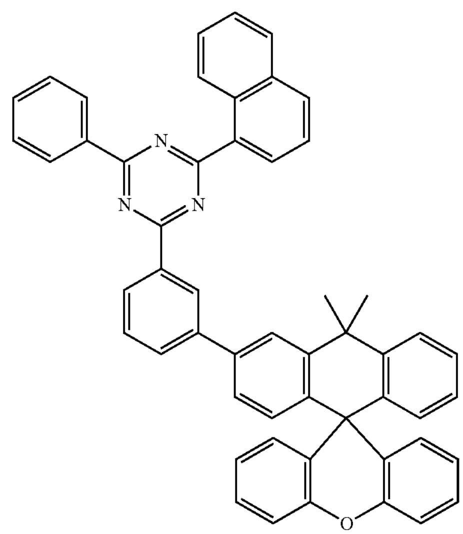
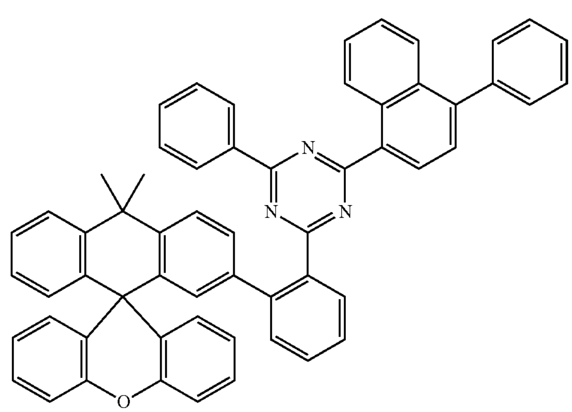

-continued
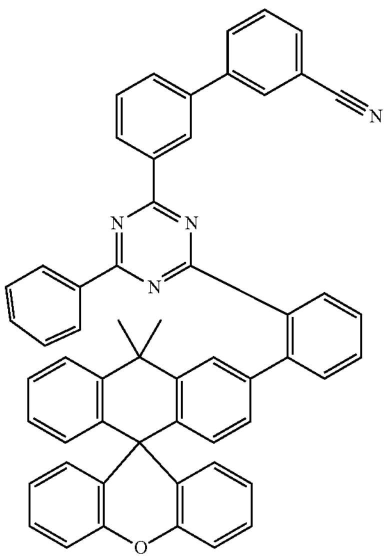
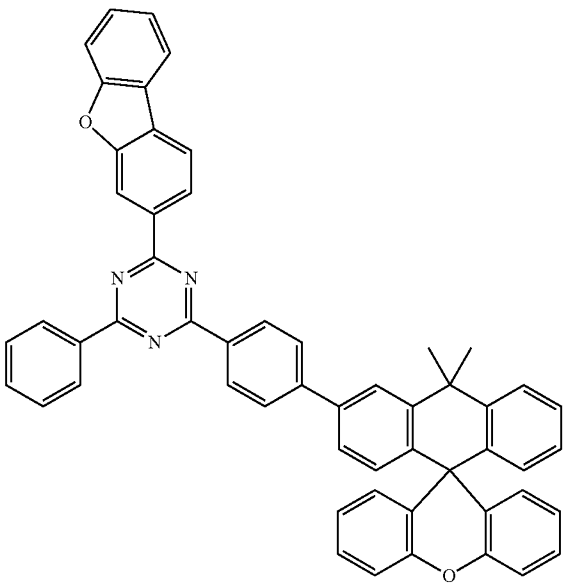
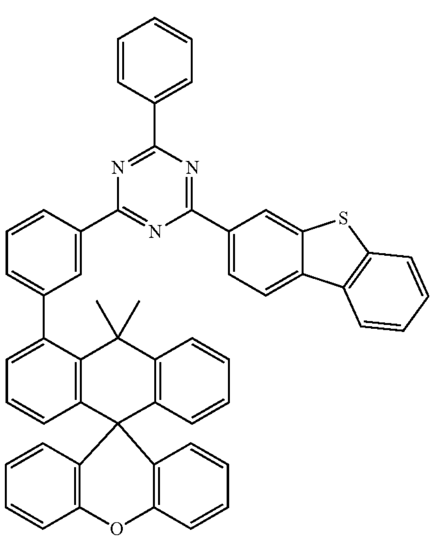
-continued
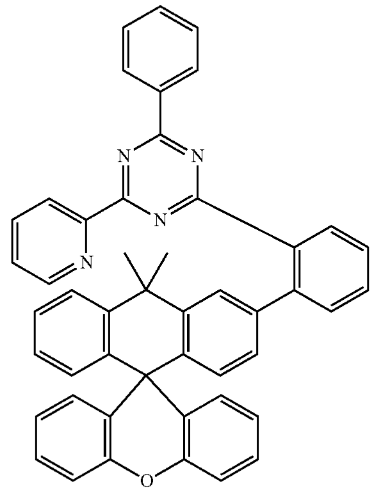
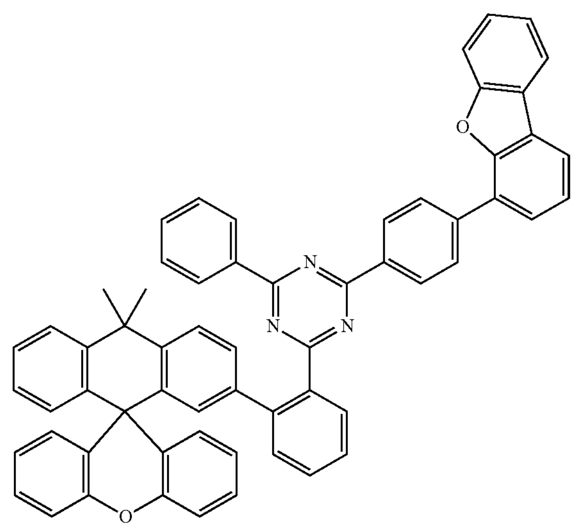
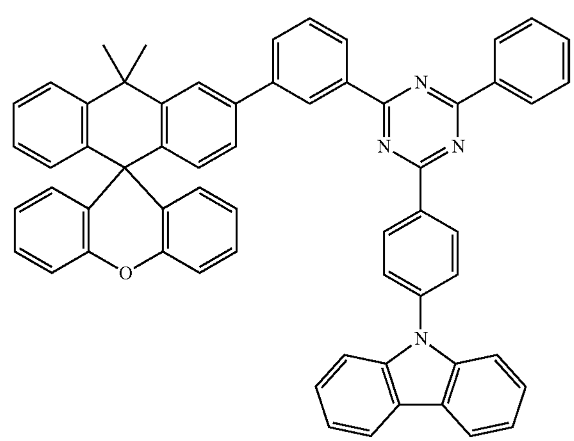

-continued
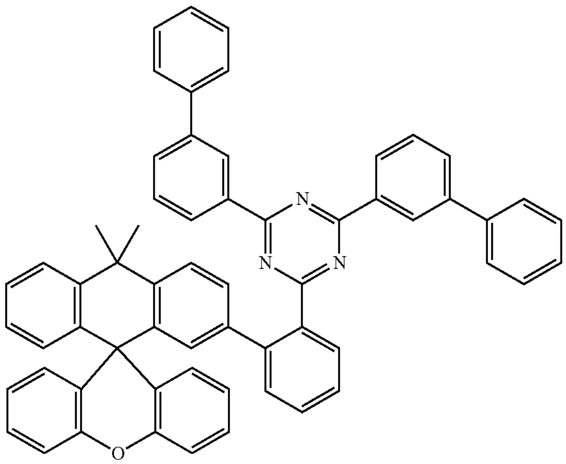
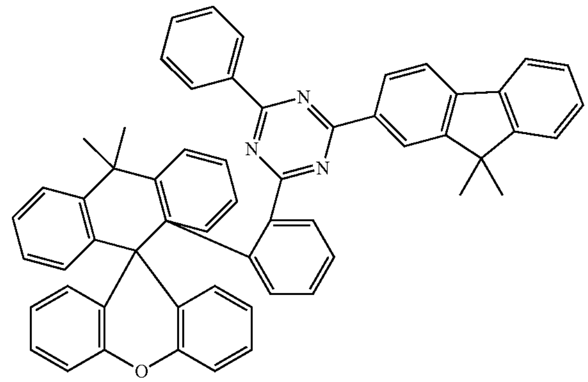
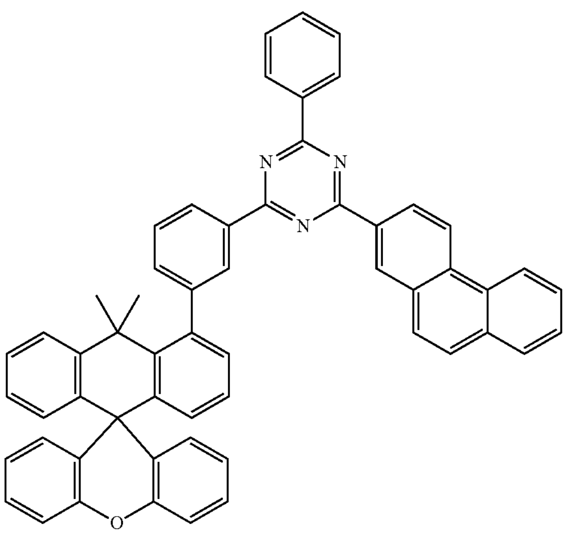
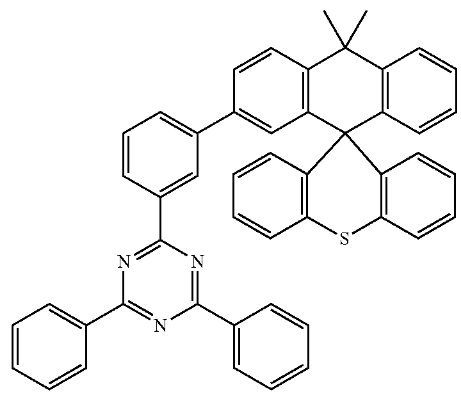
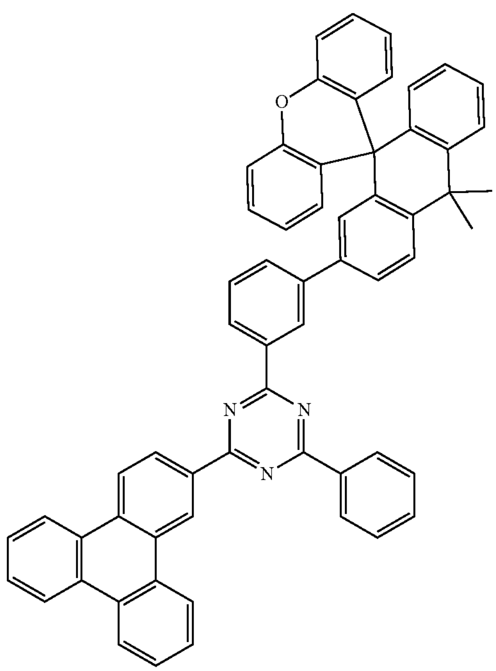
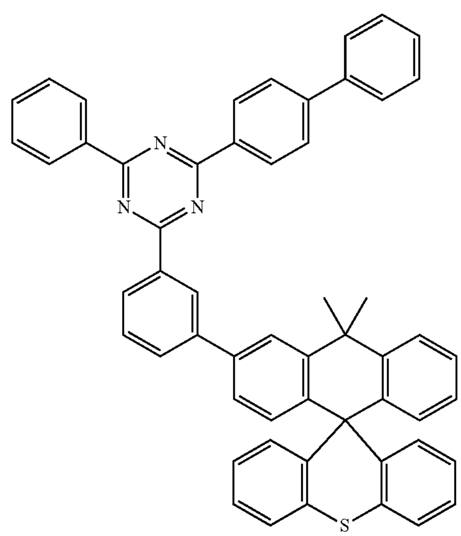

-continued
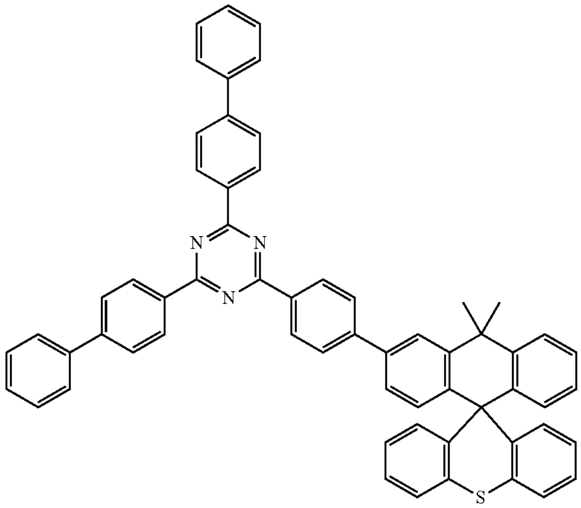
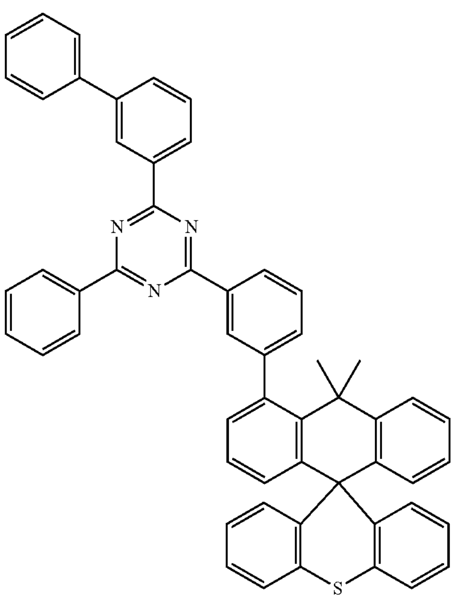
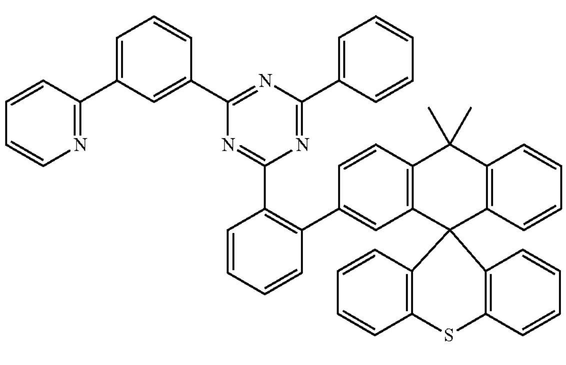
-continued
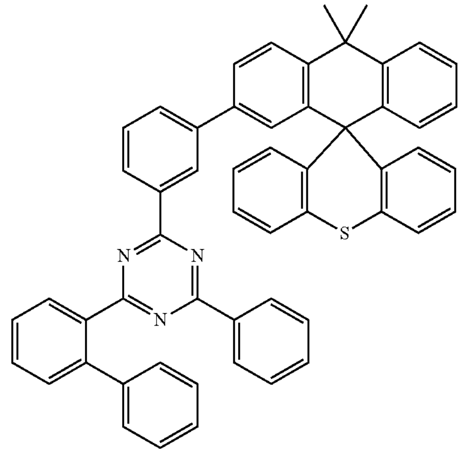
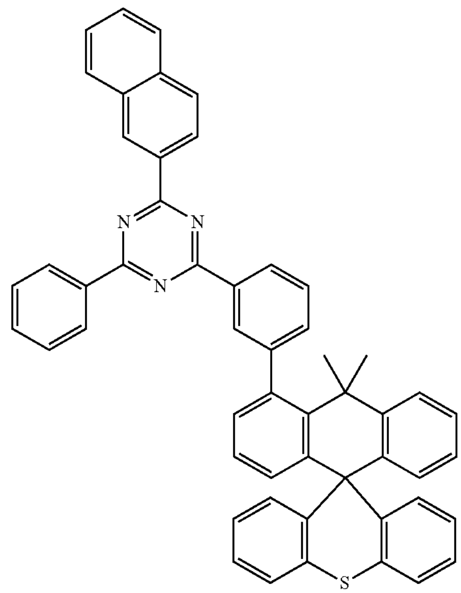
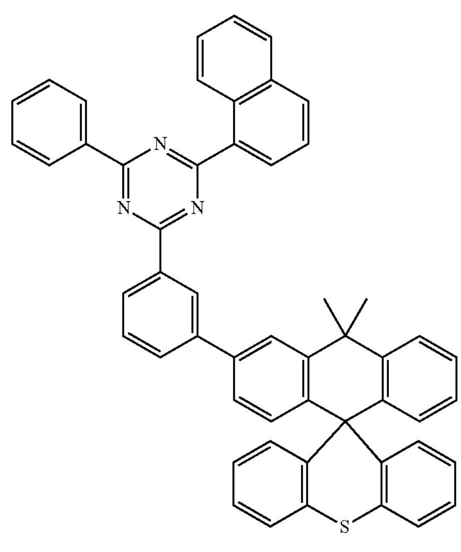

-continued
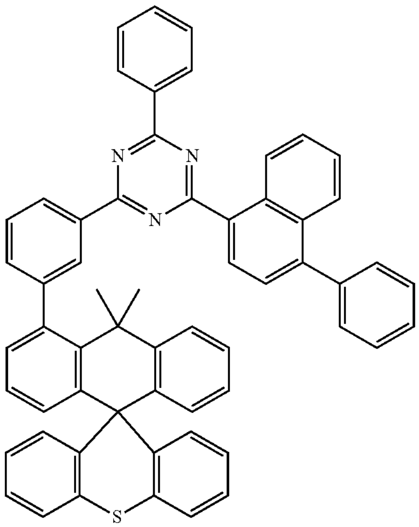
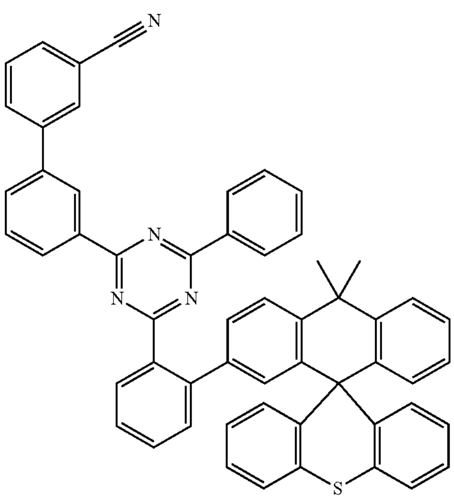
-continued
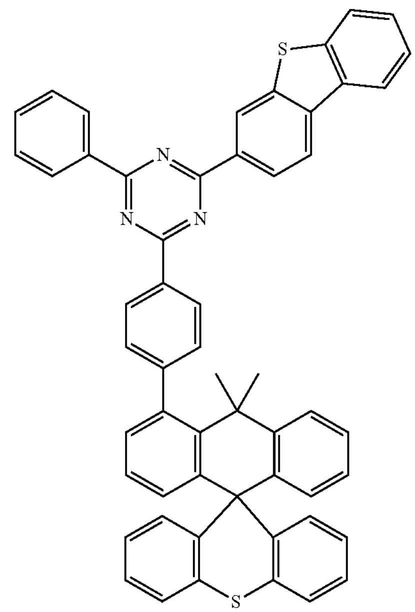
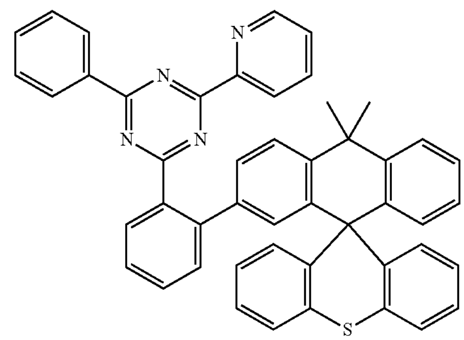
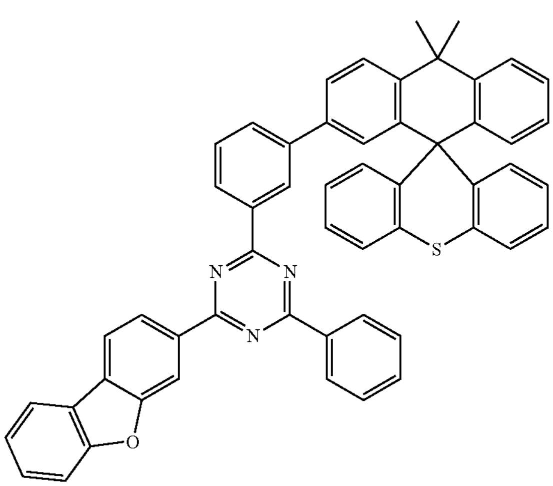
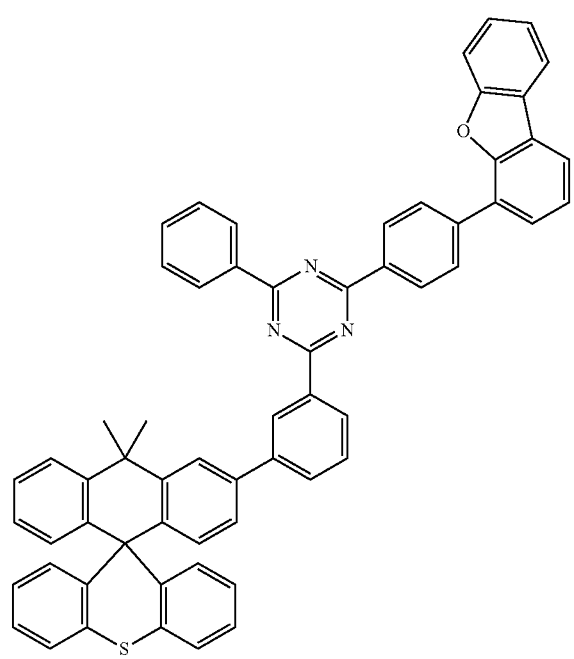

-continued
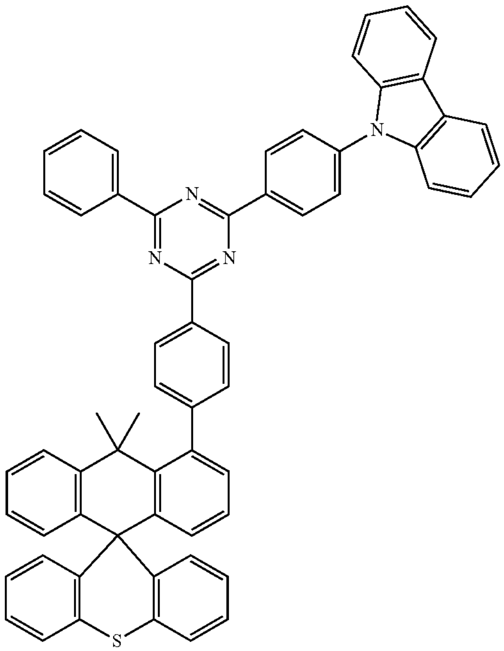
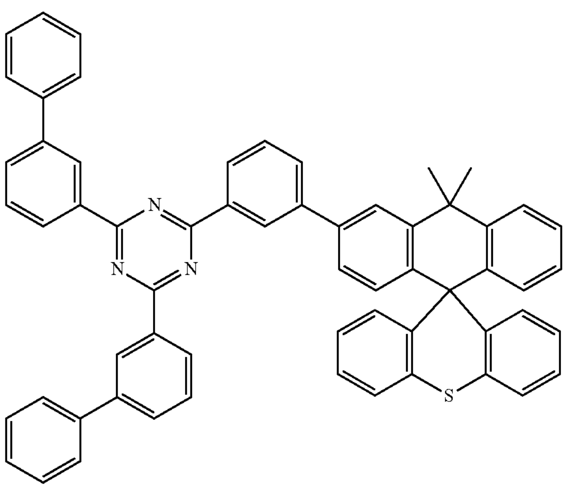
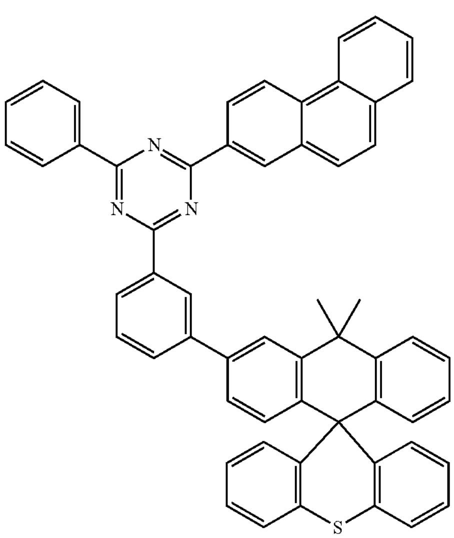
-continued
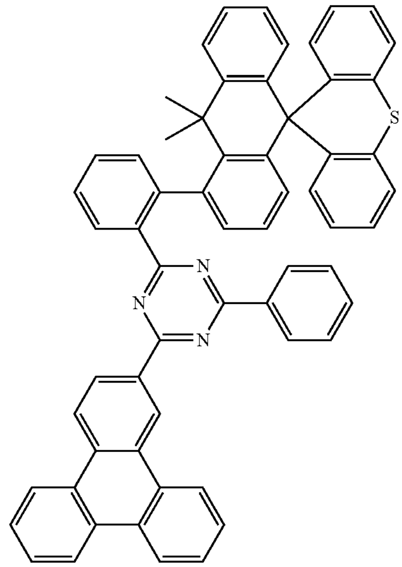
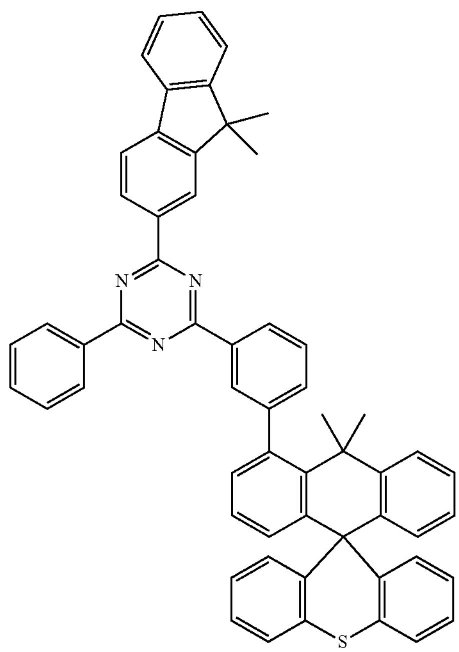
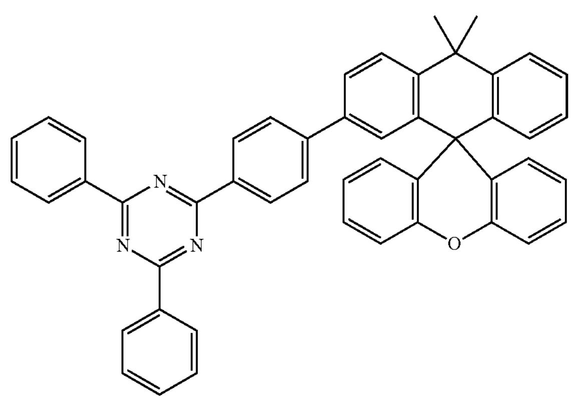

-continued
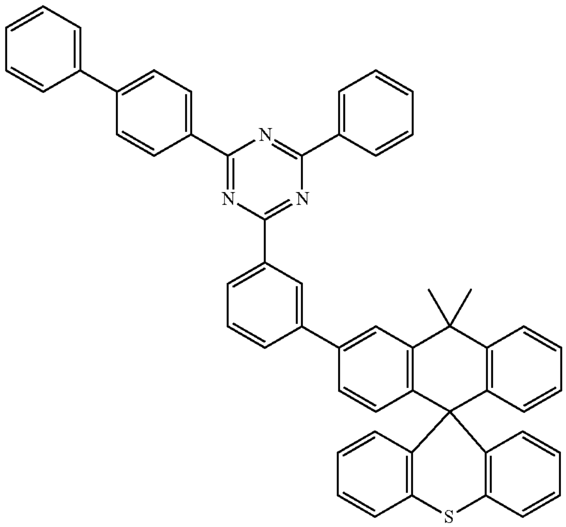
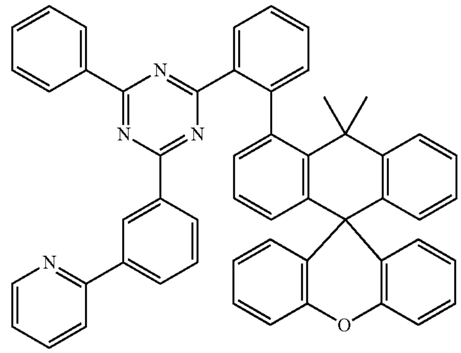
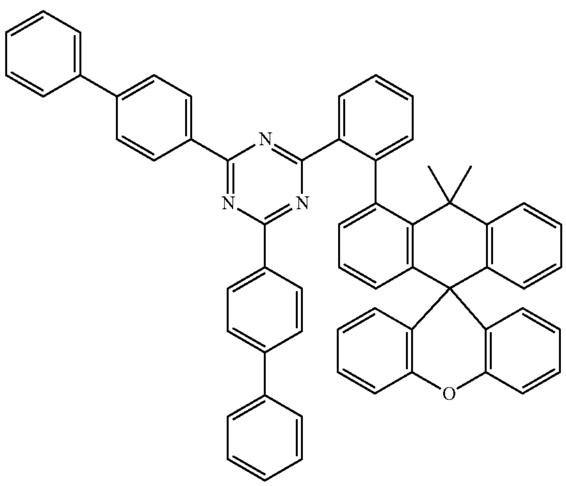
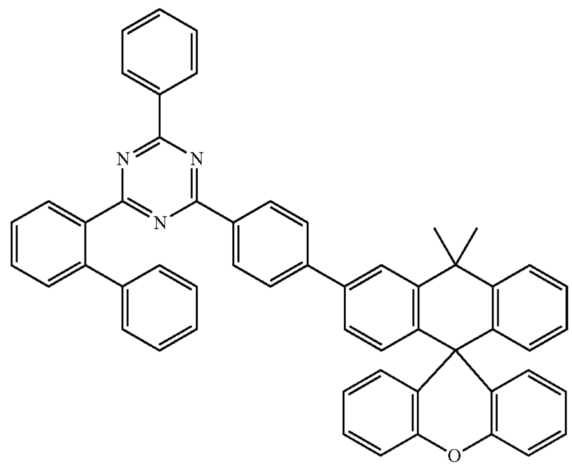
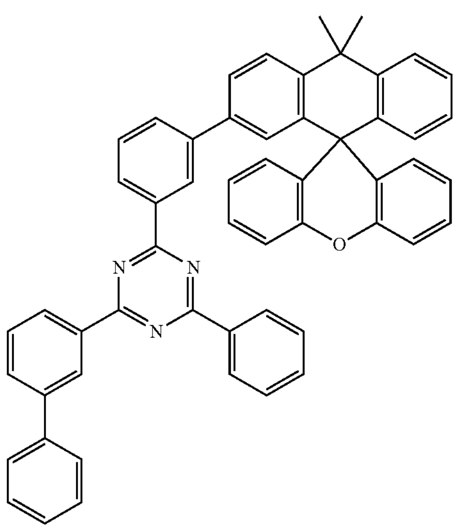
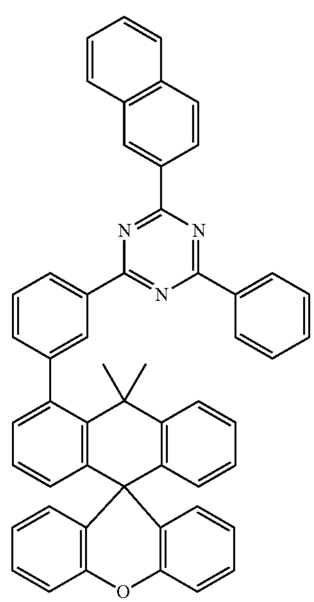

-continued
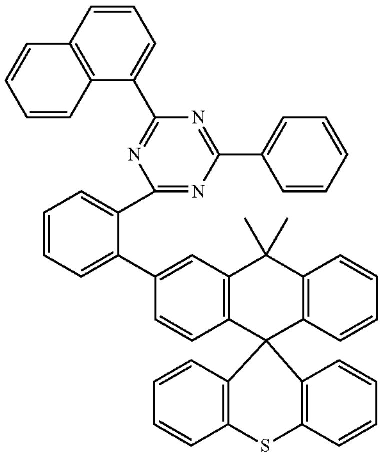
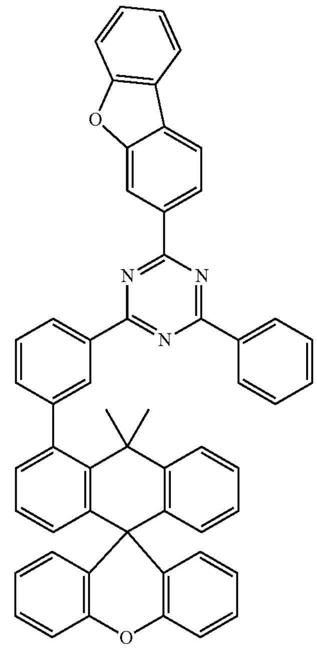
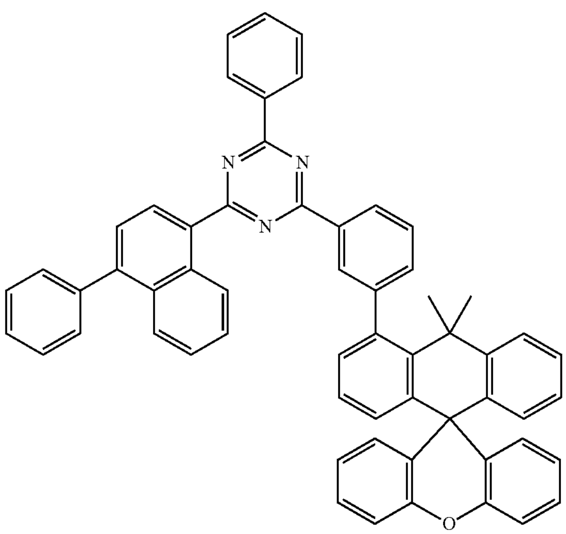
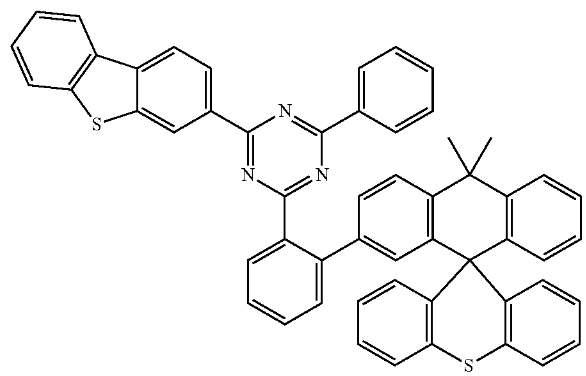
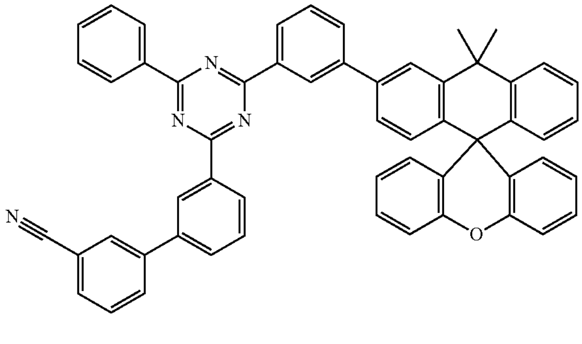
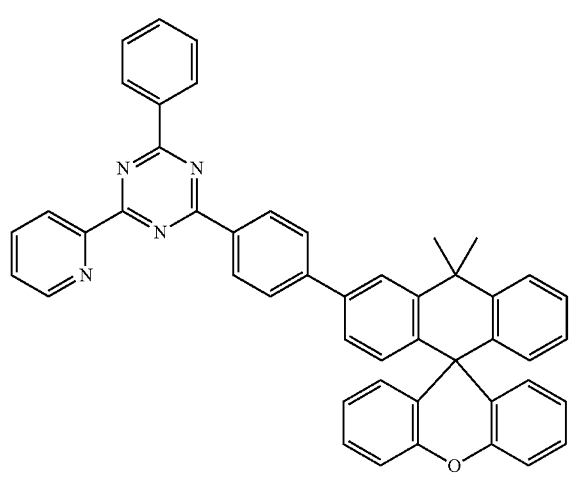

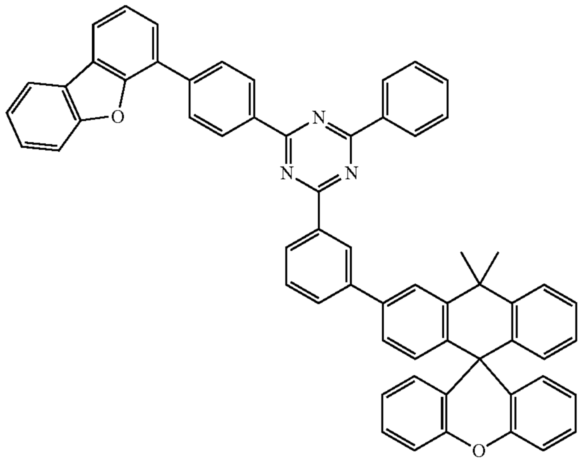
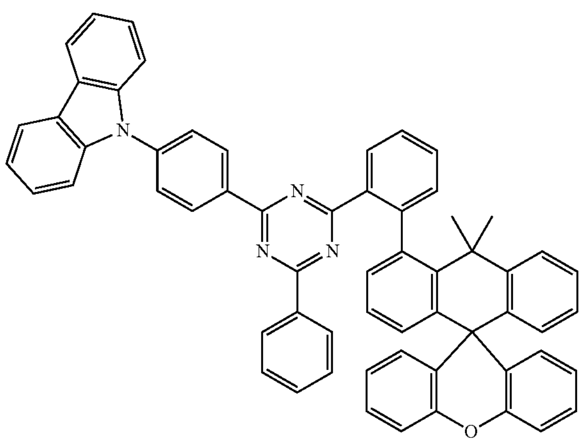
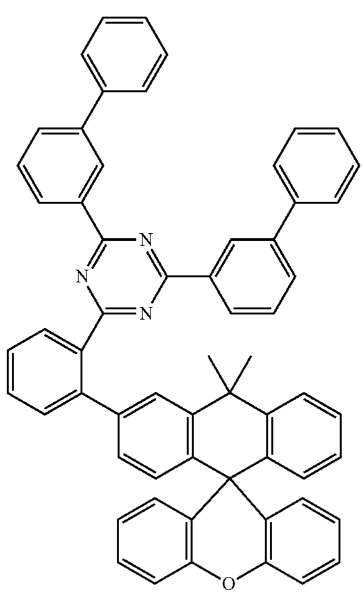
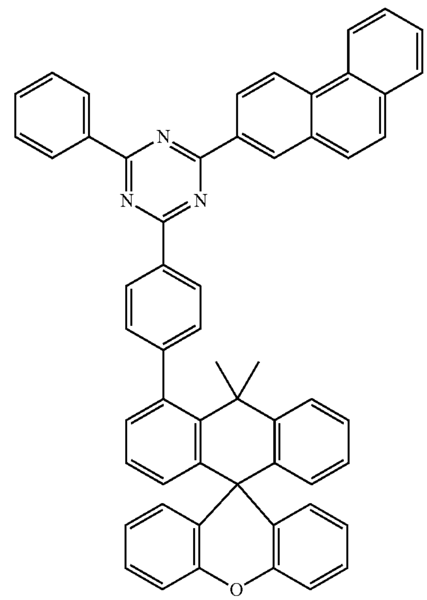
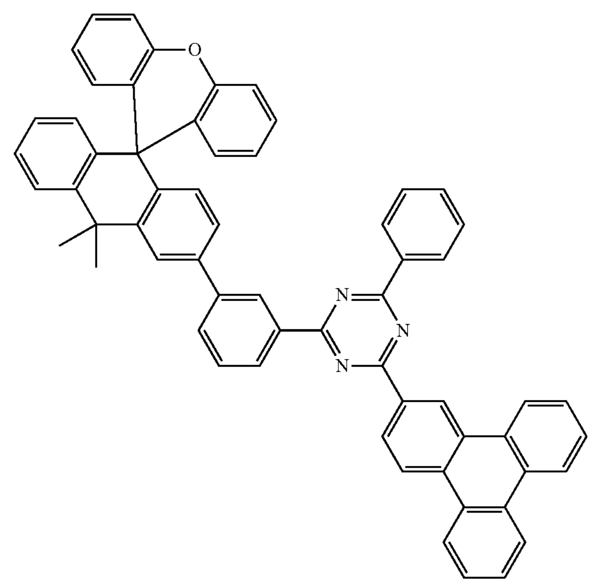
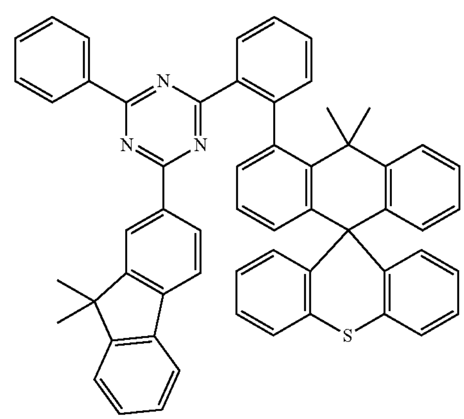

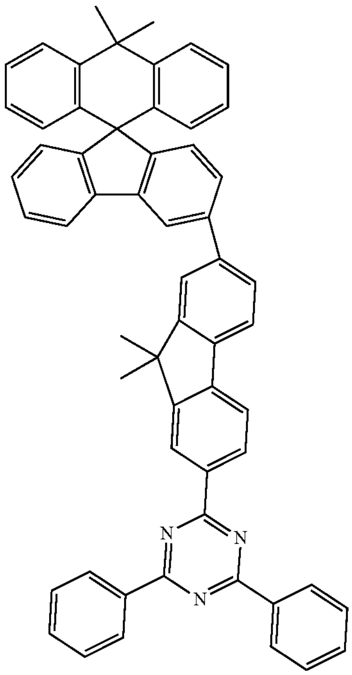
N
N
N
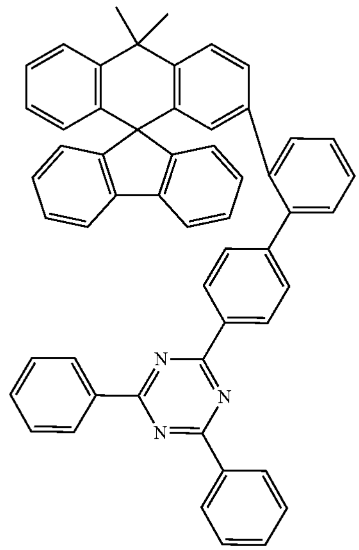
N
N
N
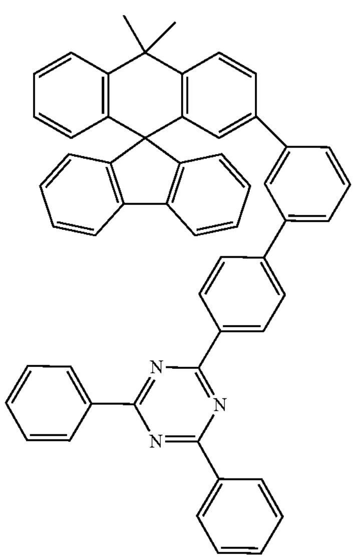
N
N
N
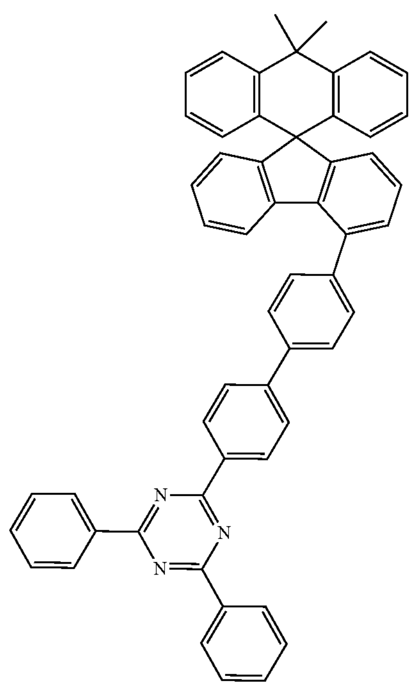
N
N
N

-continued
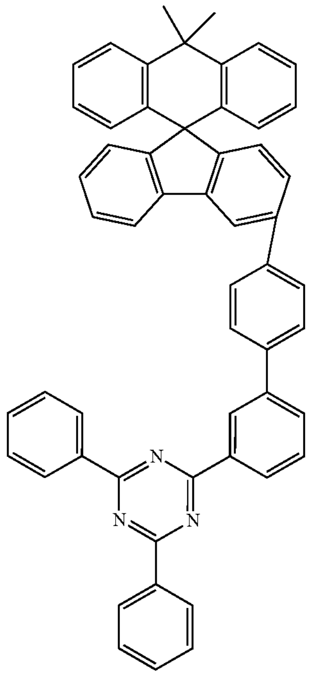
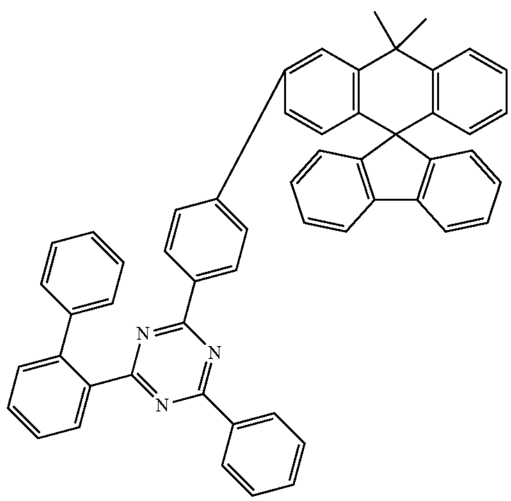
-continued
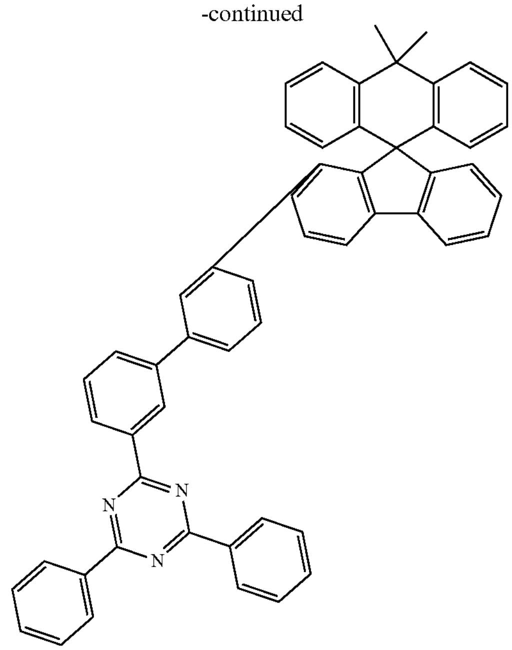
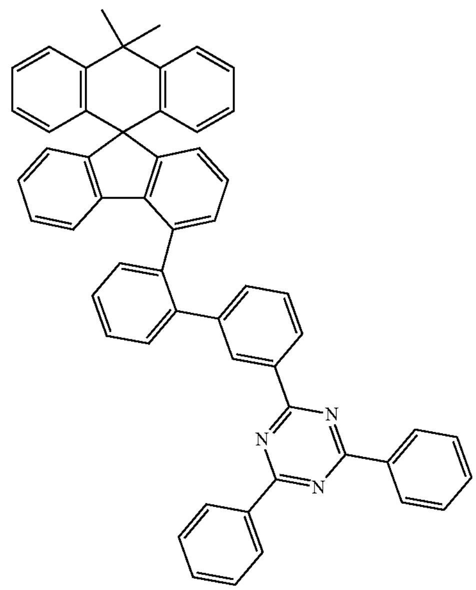
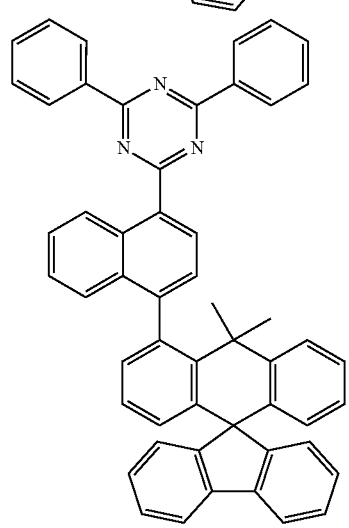

-continued
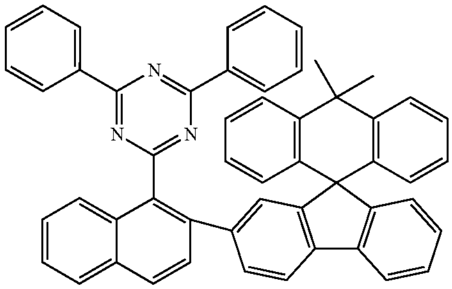
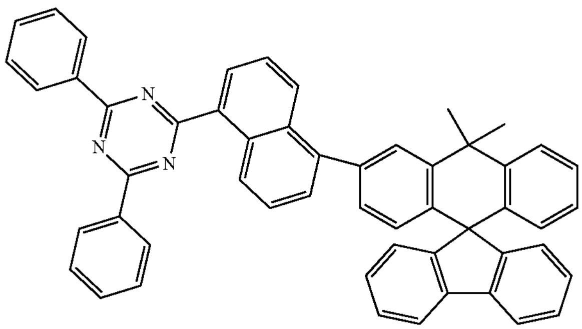
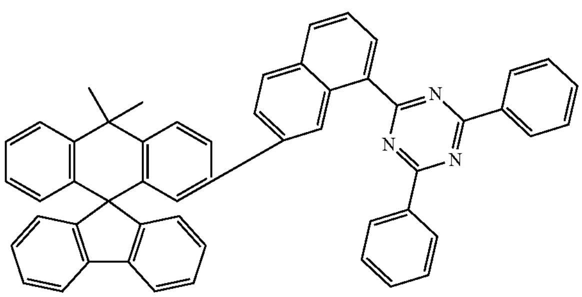
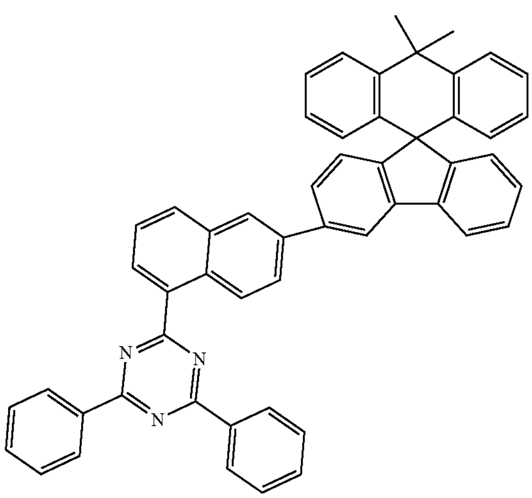
-continued
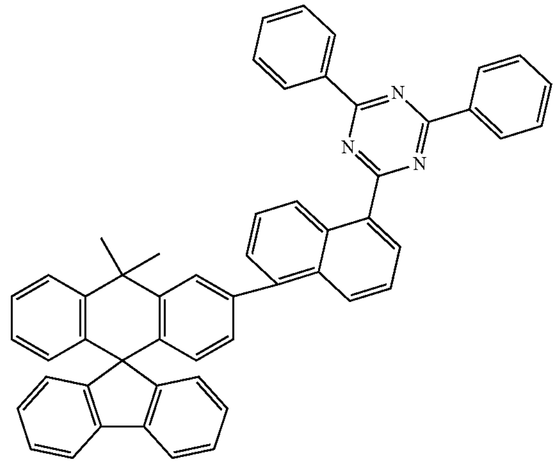
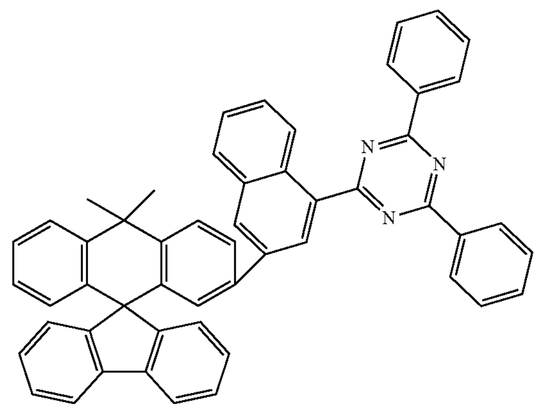
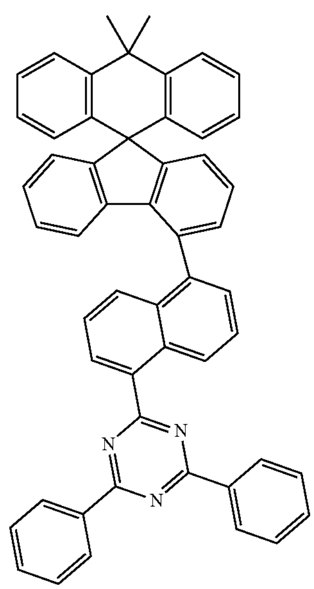

-continued
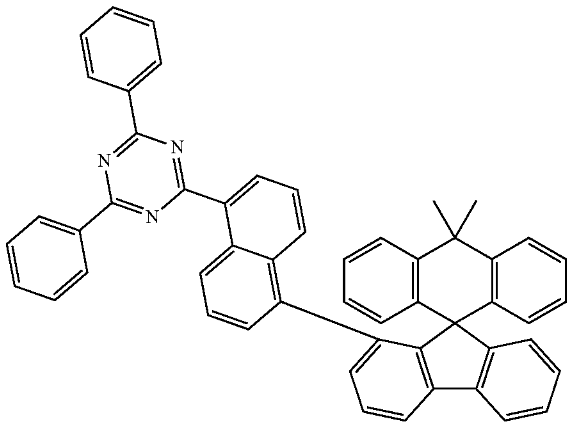
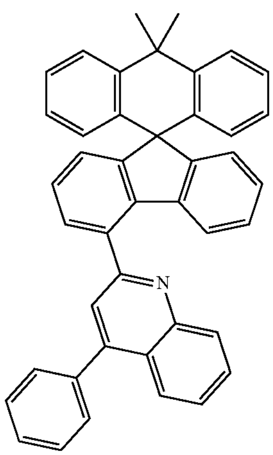
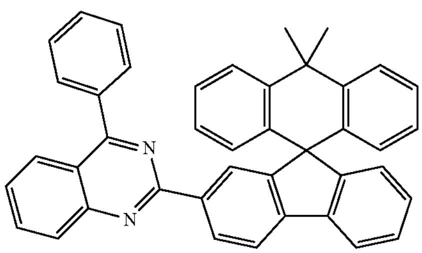
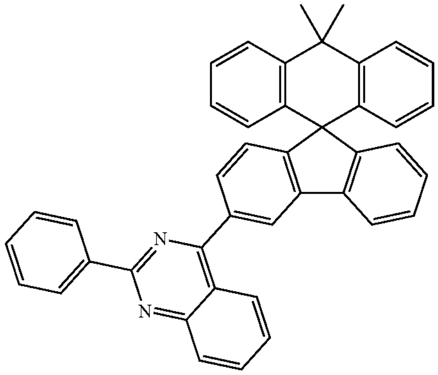
-continued
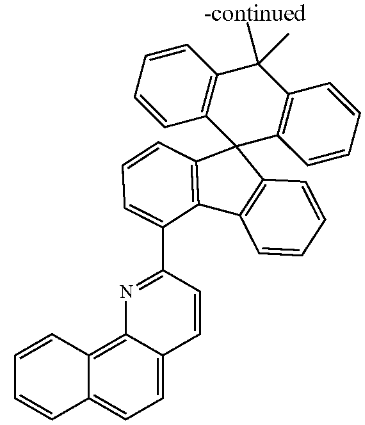
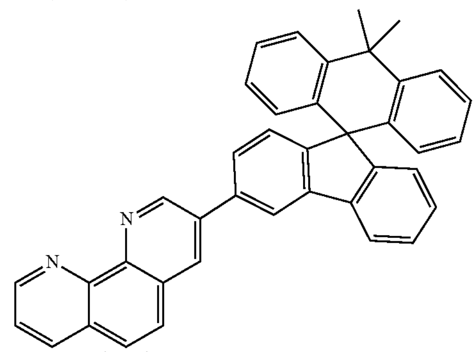
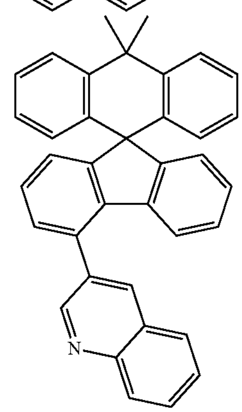
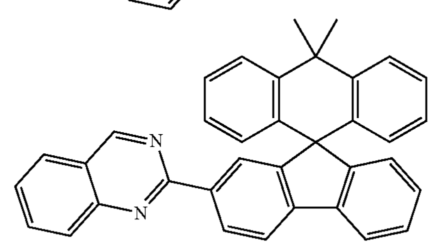
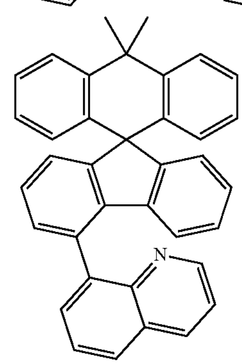

-continued
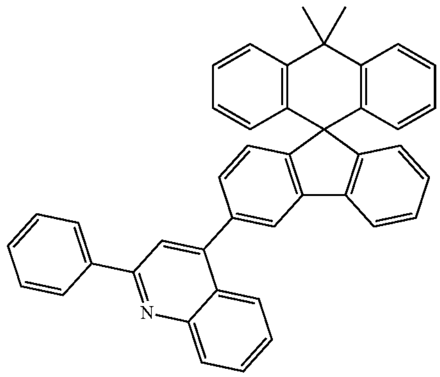
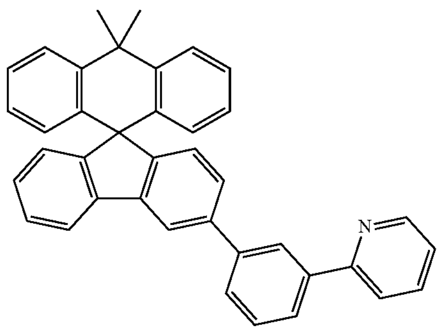
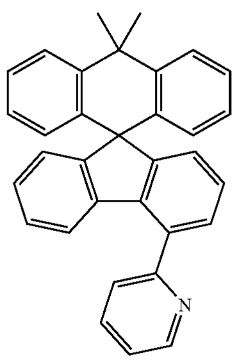
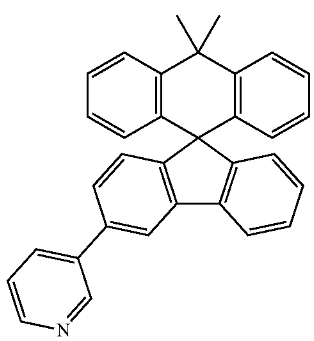
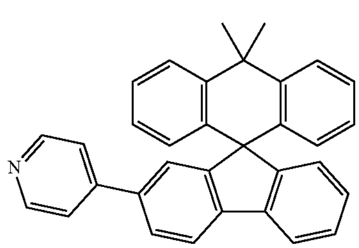
-continued
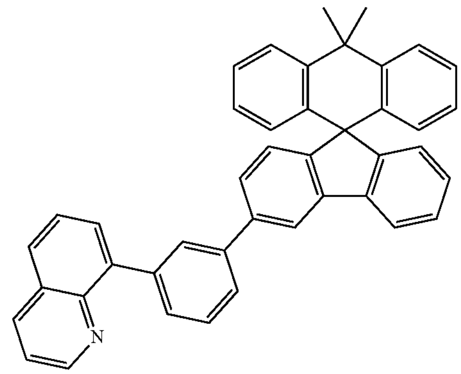
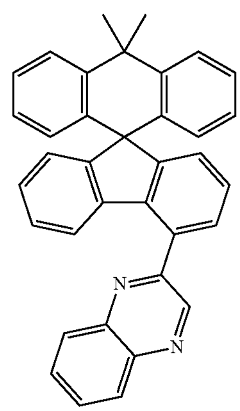
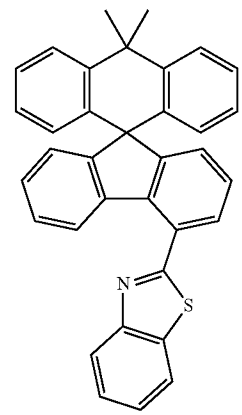
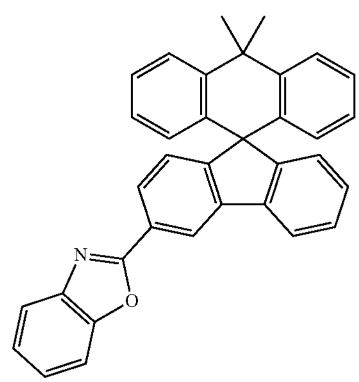
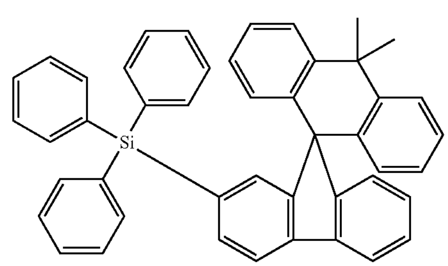

-continued
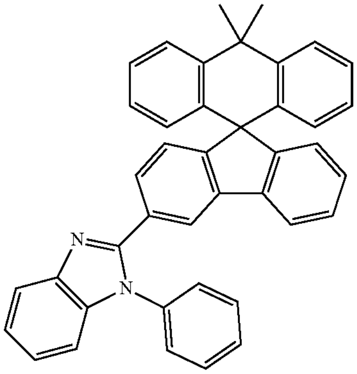
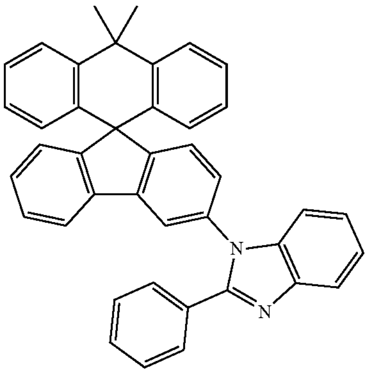
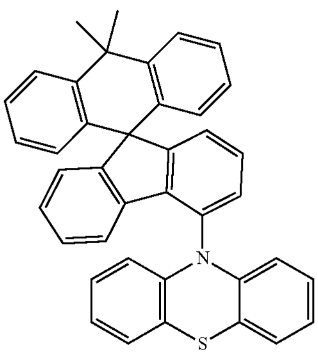
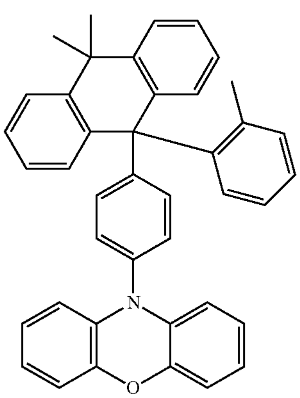
-continued
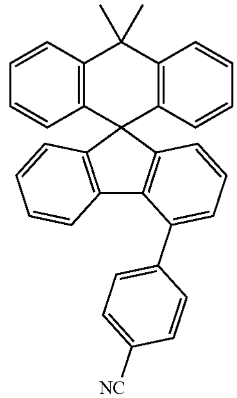
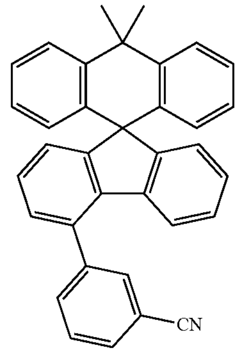
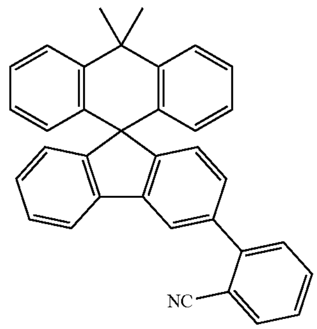
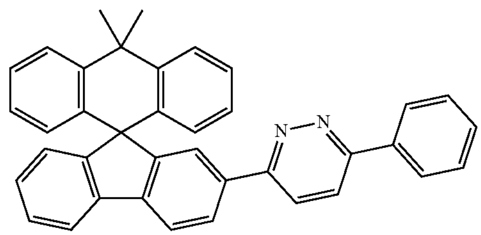
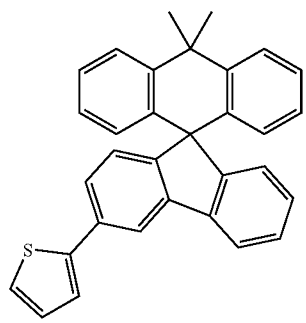
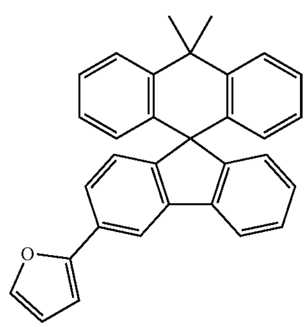

-continued
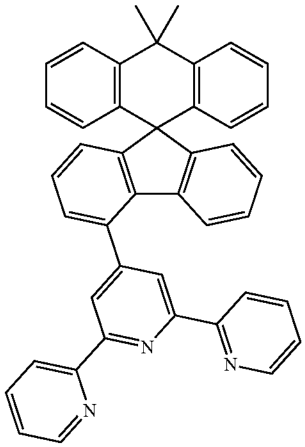
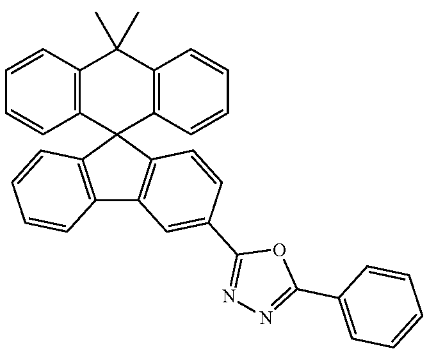
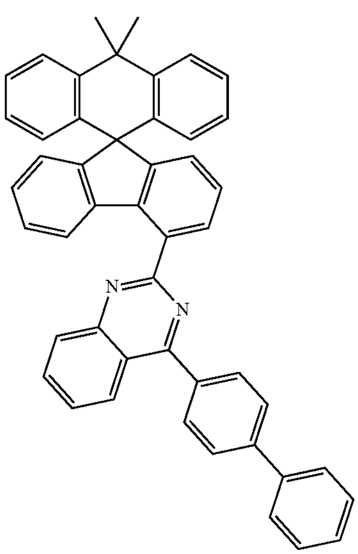
-continued
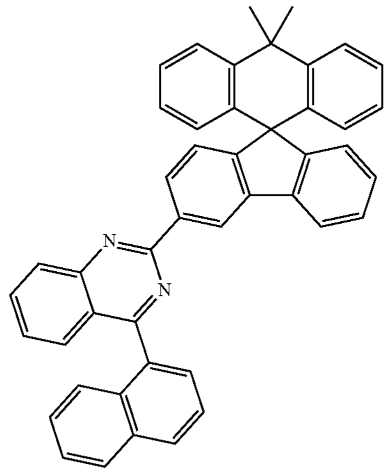
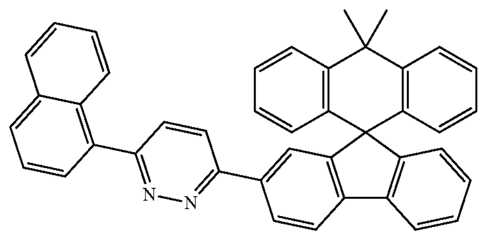
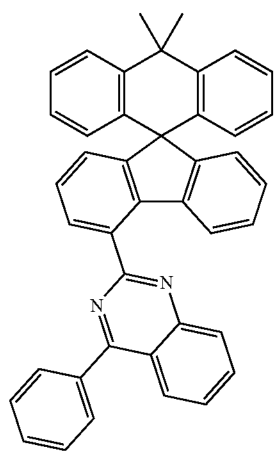
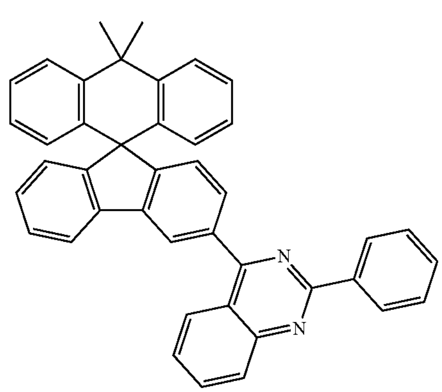

-continued
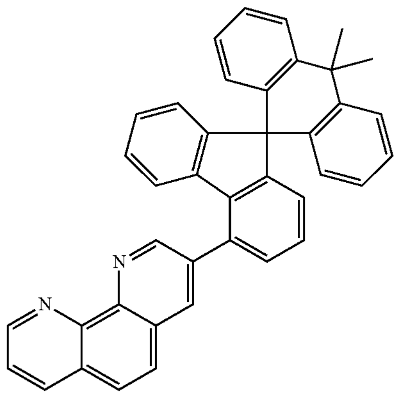
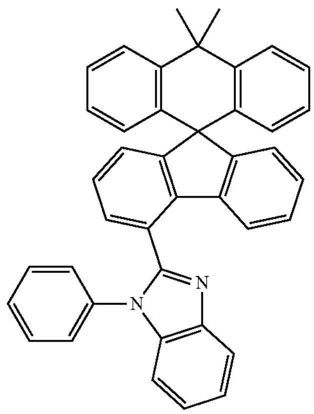
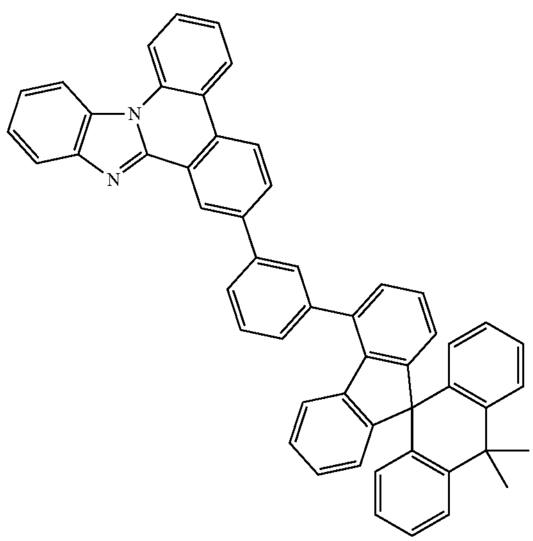
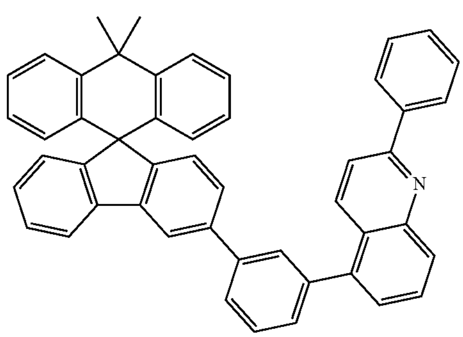
-continued
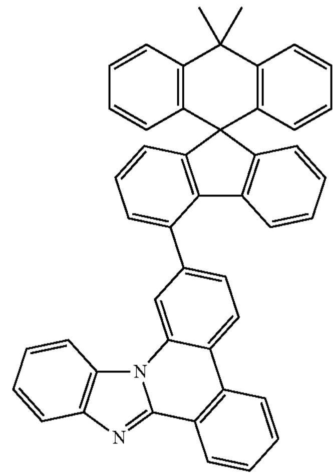
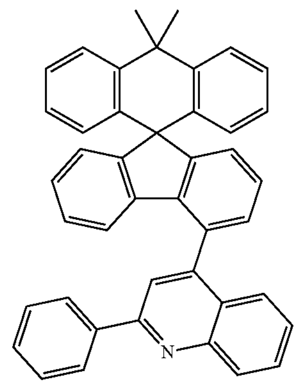
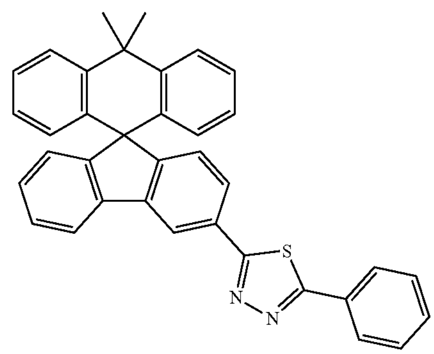
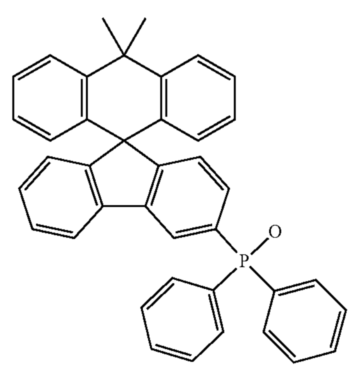

-continued
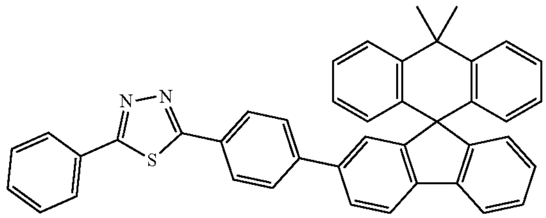
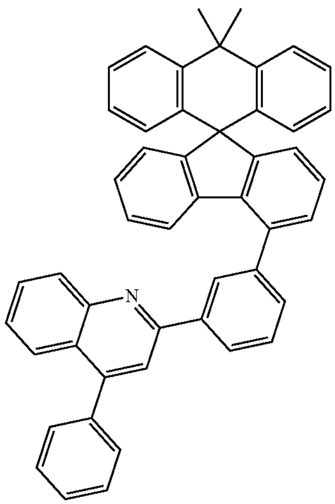
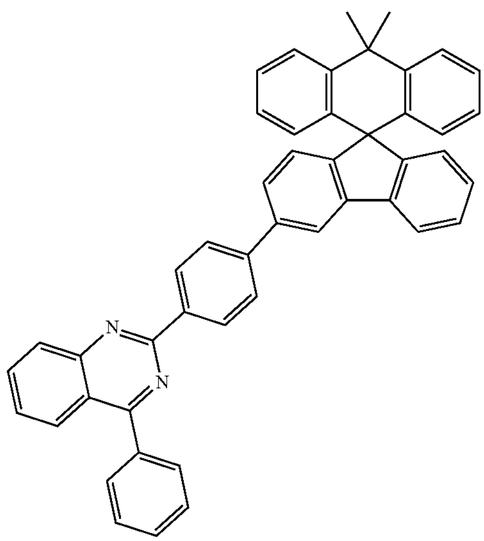
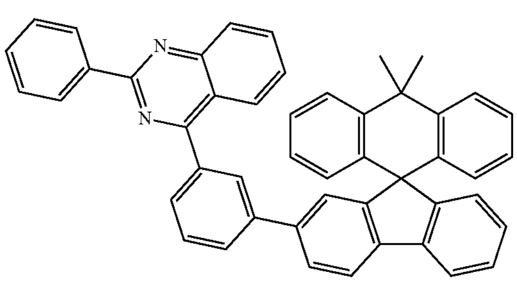
-continued
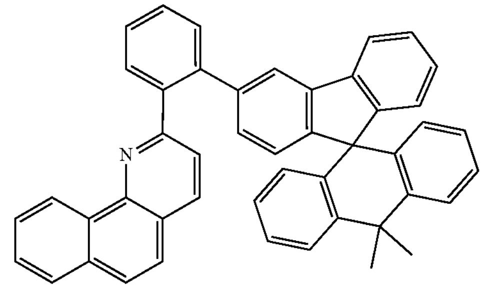
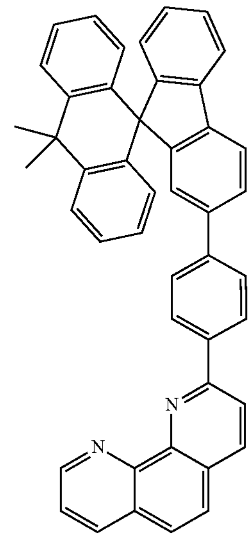
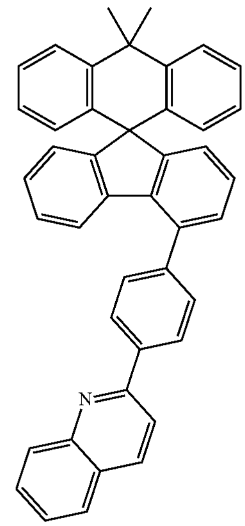
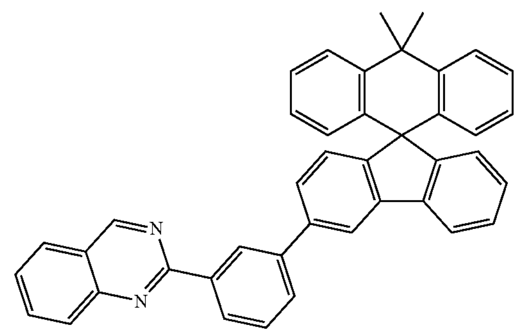
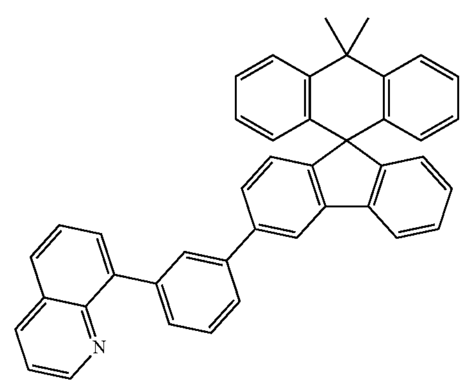

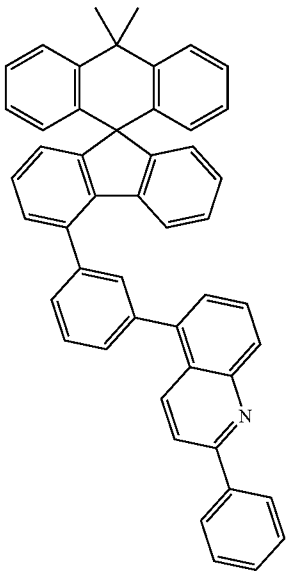
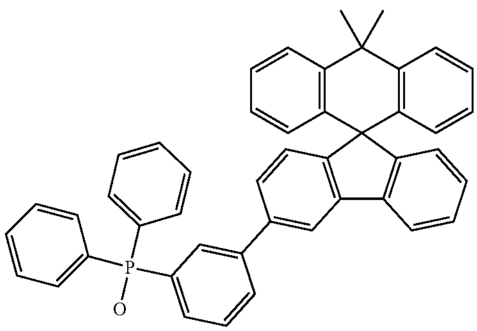
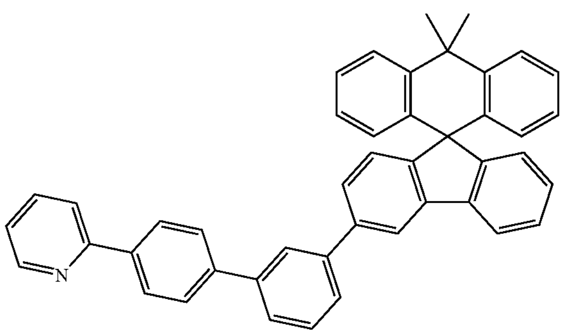
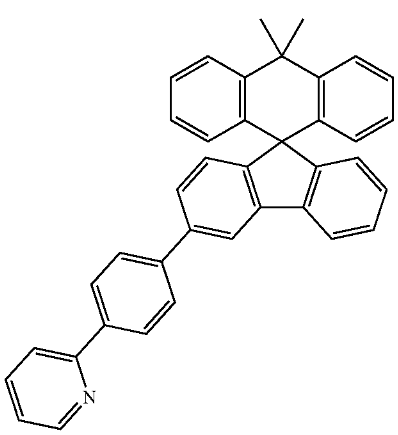
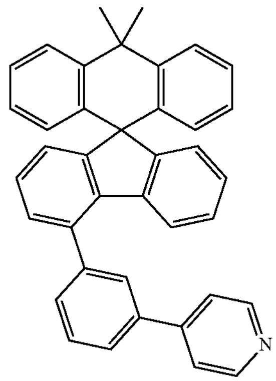
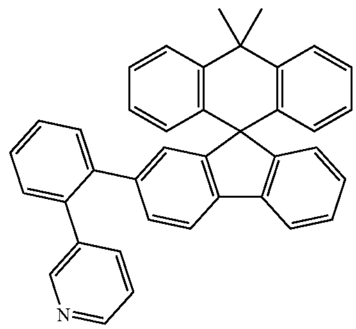
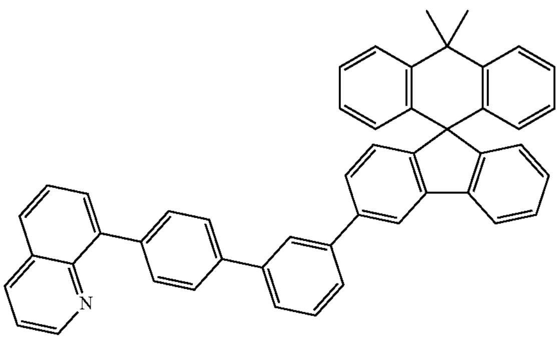
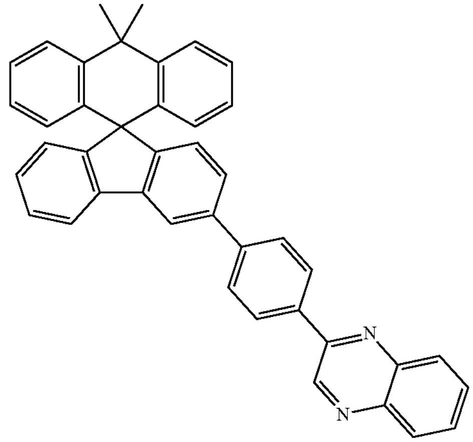

-continued
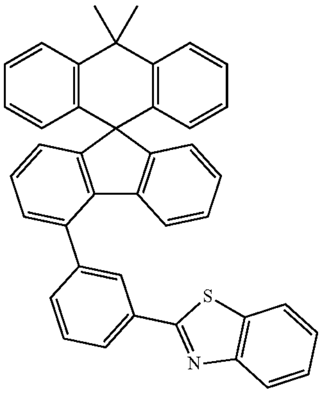
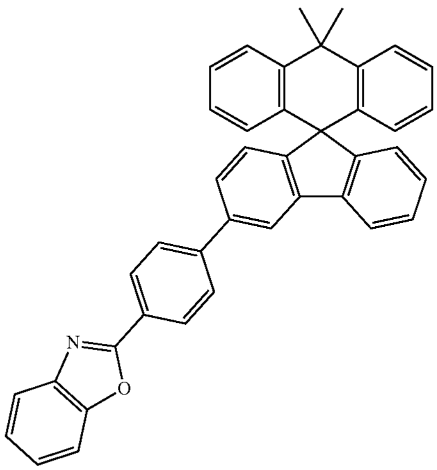
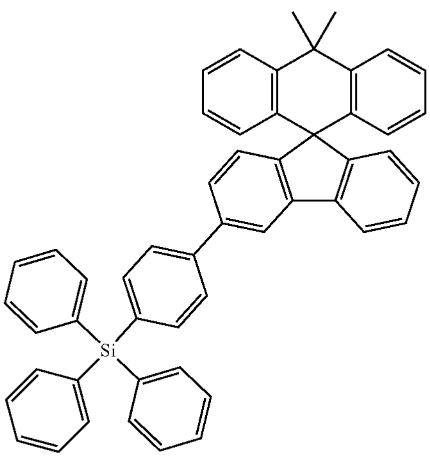
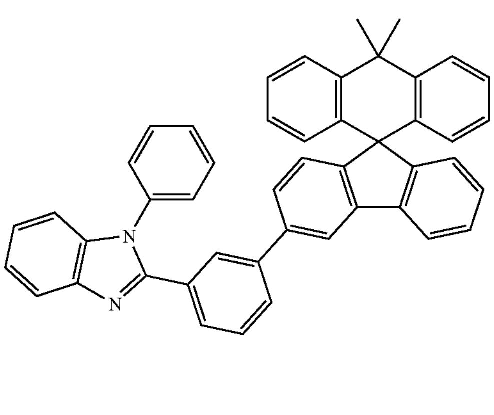
-continued
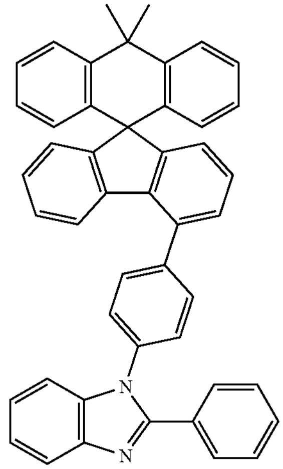
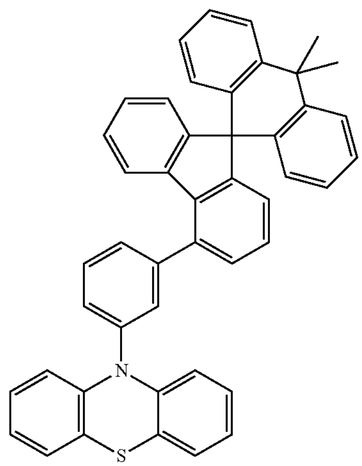
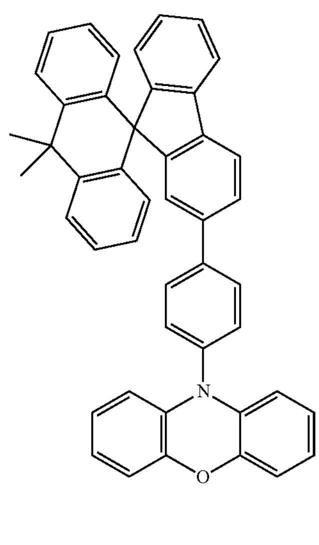

-continued
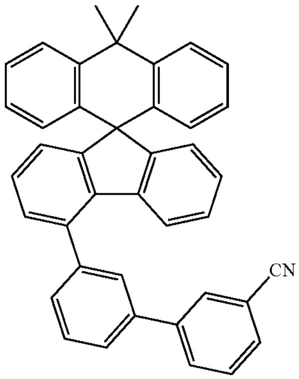
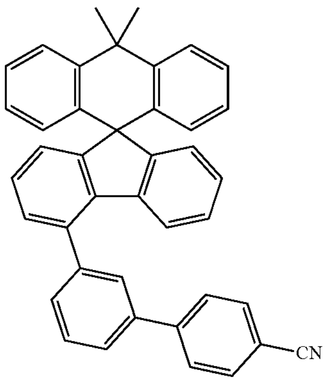
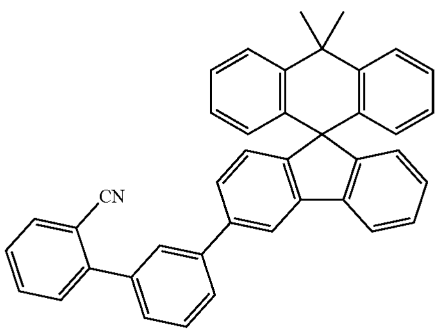
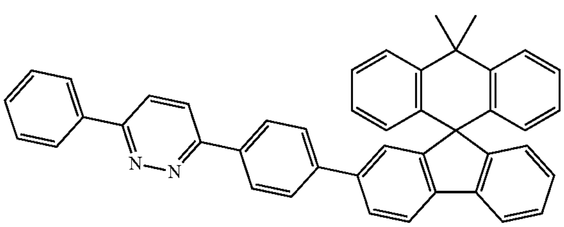
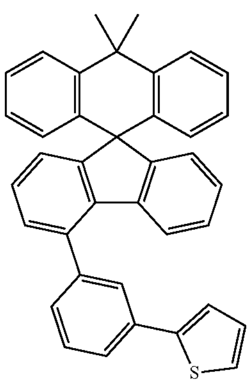
-continued
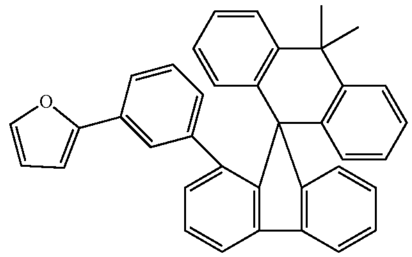
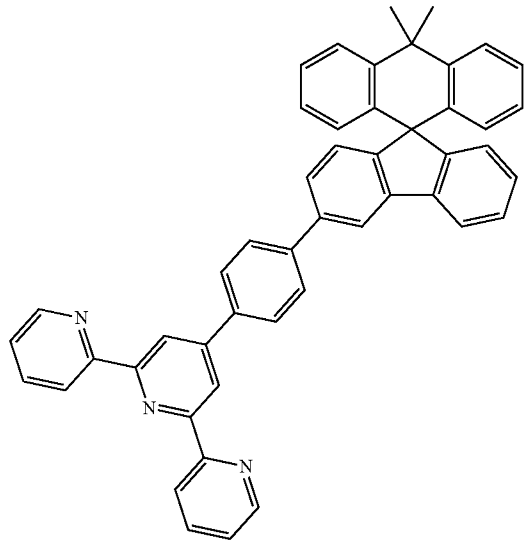
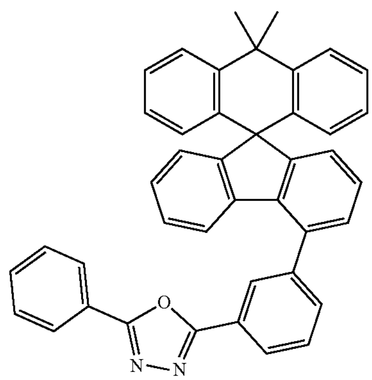
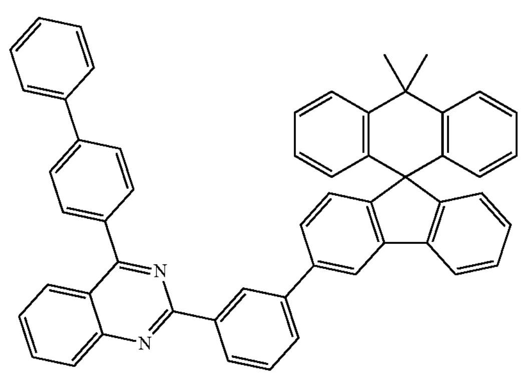

-continued
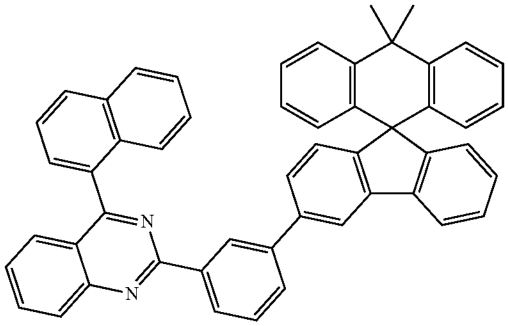
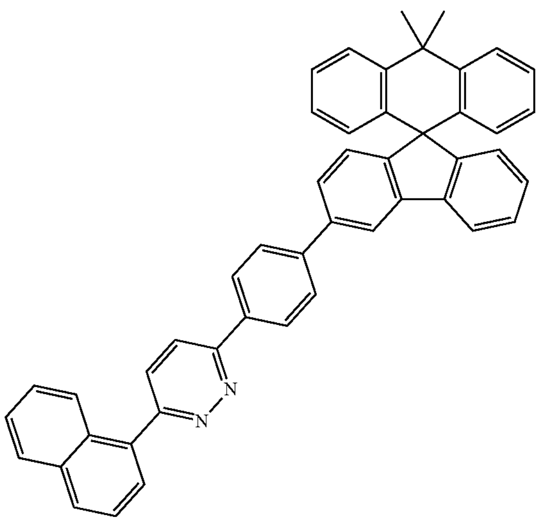
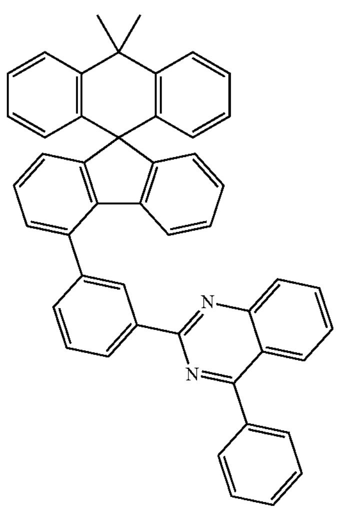
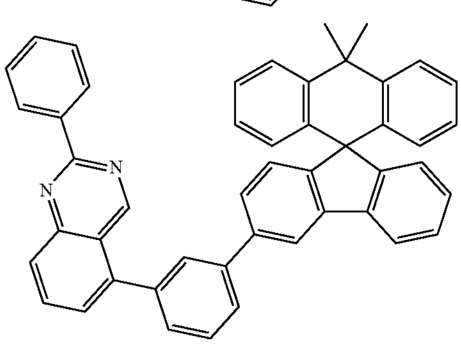
-continued
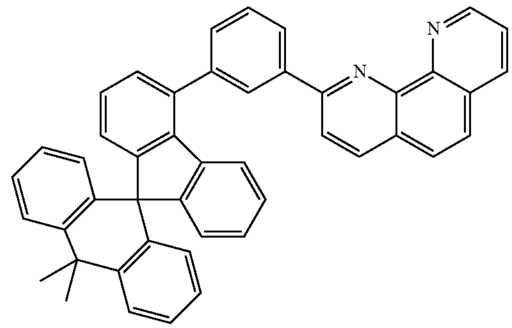
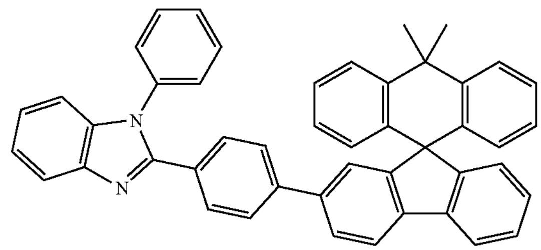
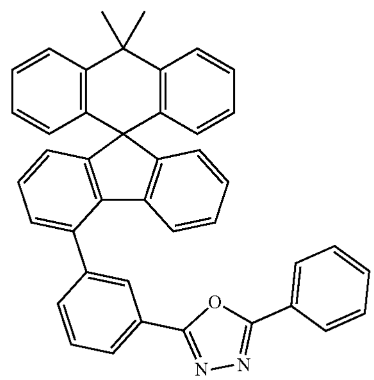
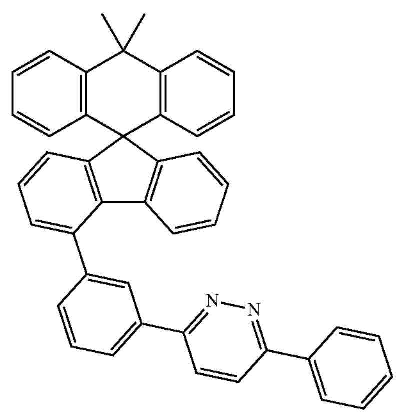
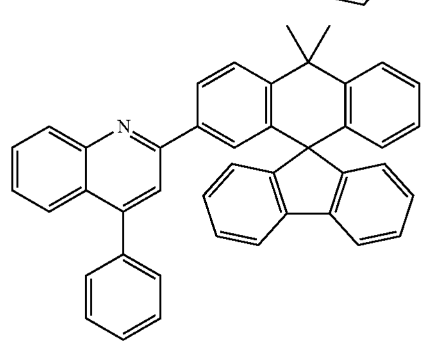

-continued
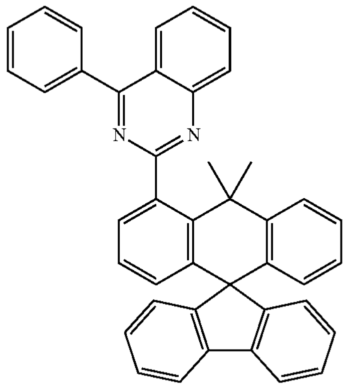
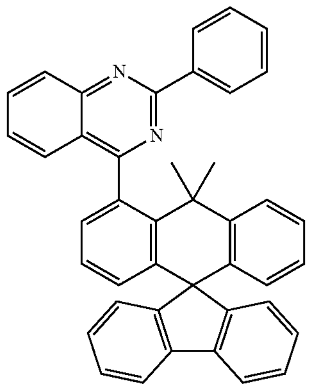
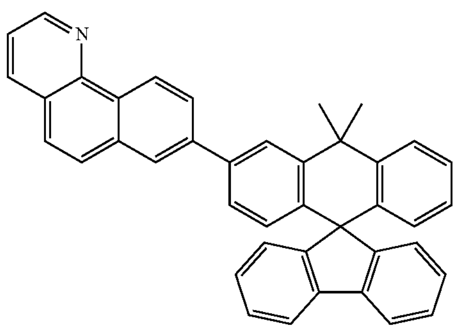
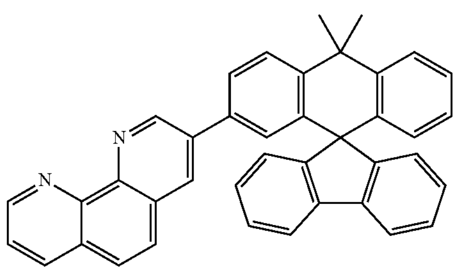
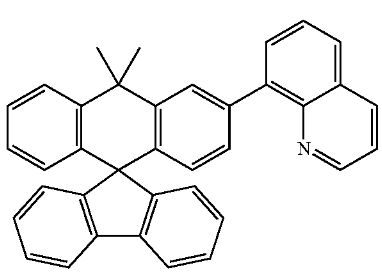
-continued
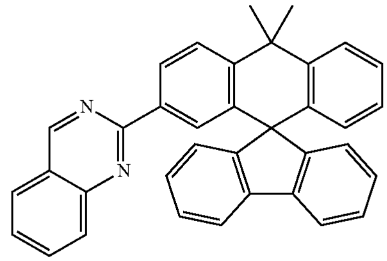
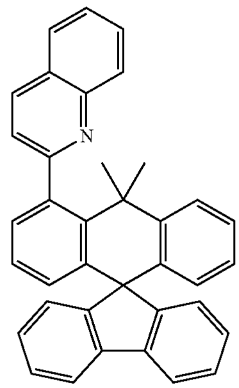
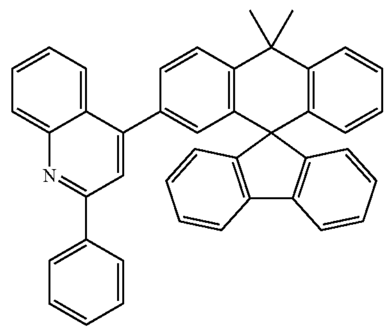
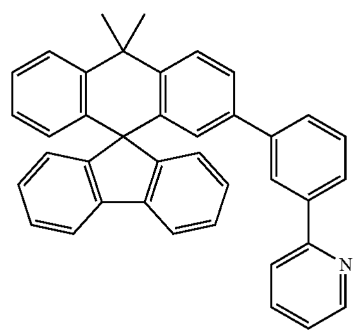
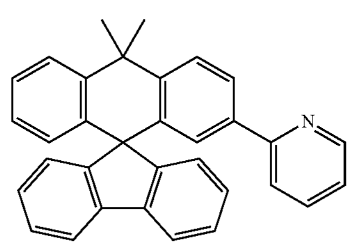

-continued
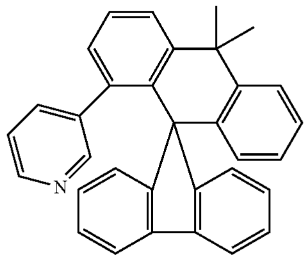
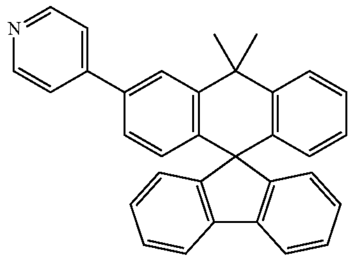
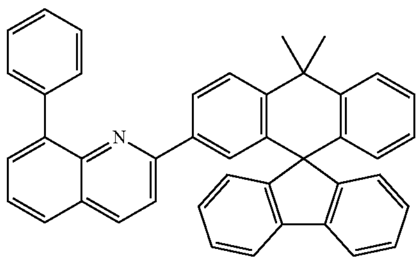
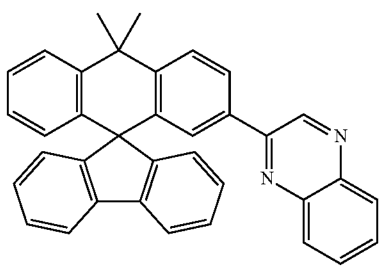
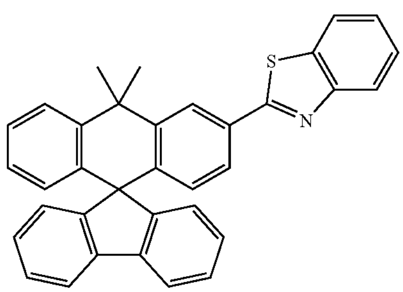
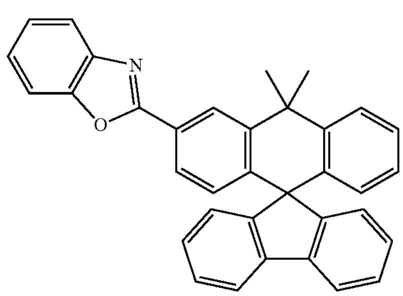
-continued
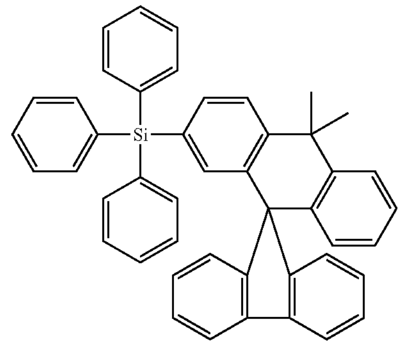
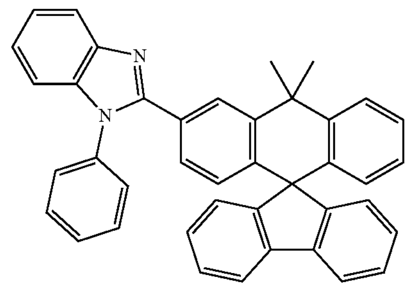
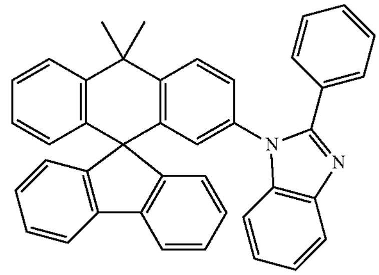
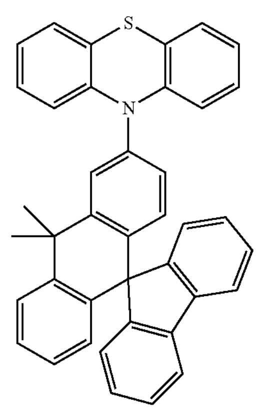
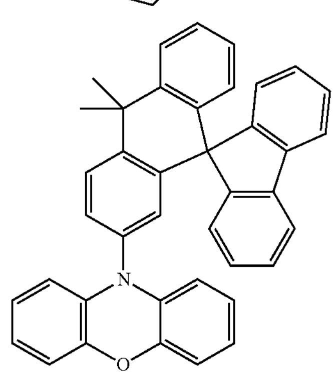

-continued
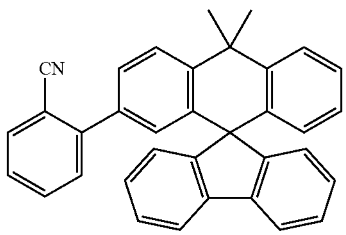
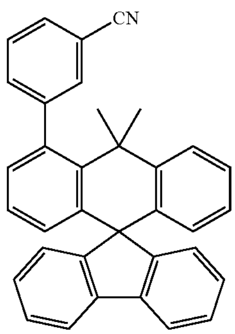
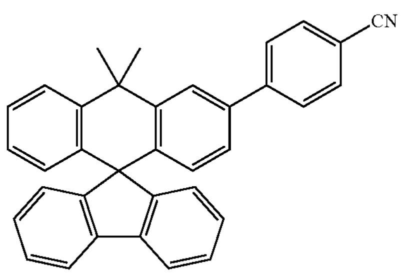
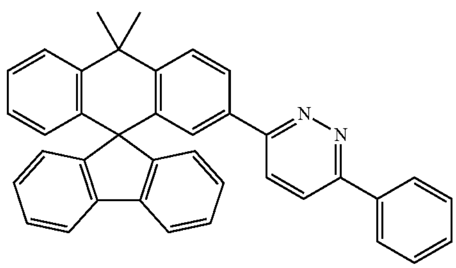
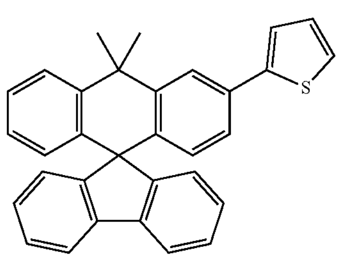
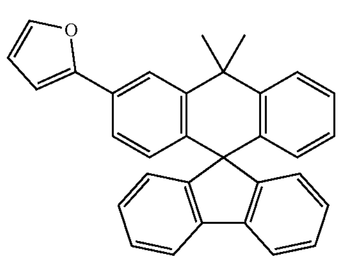
-continued
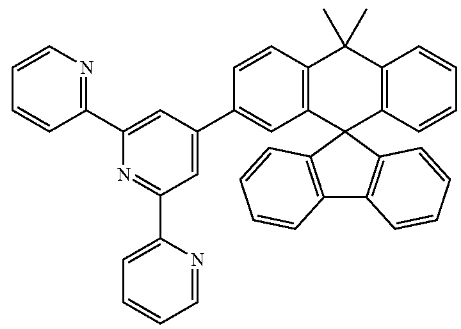
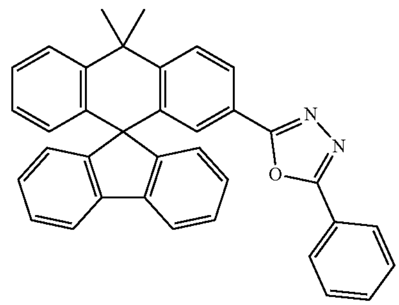
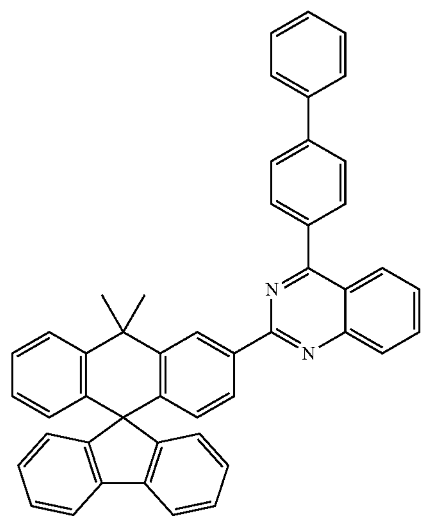
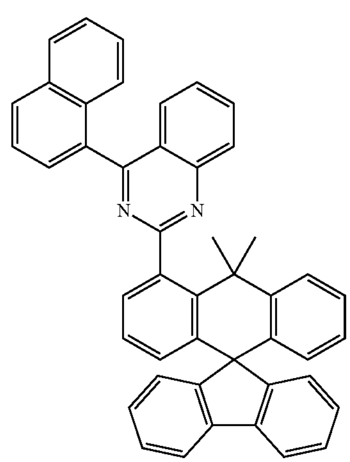

-continued
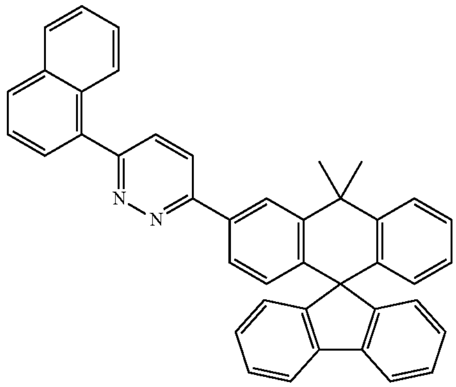
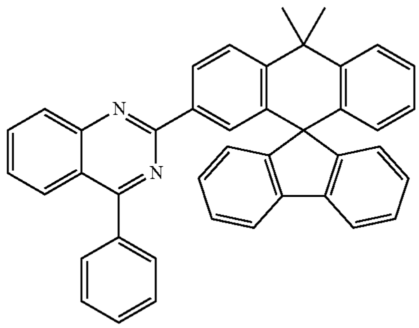
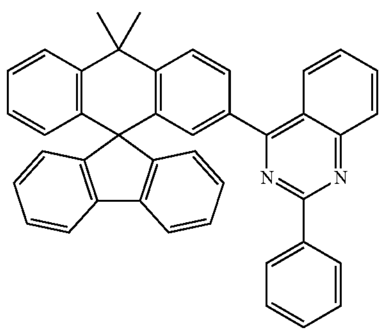
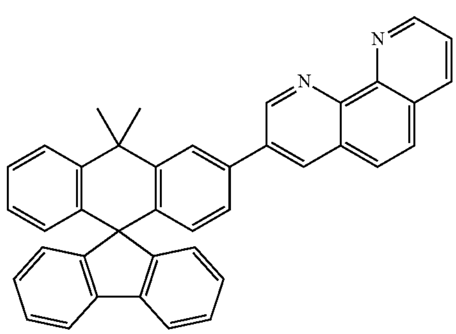
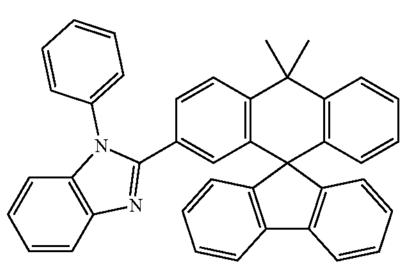
-continued
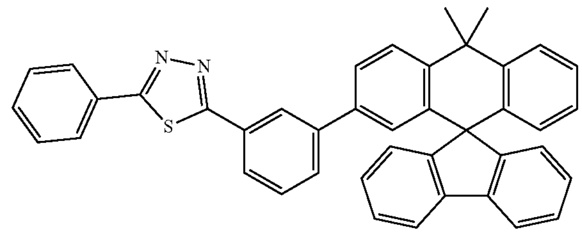
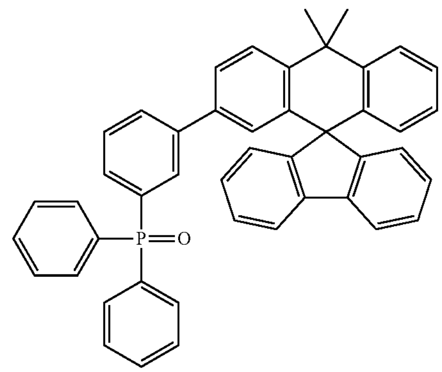
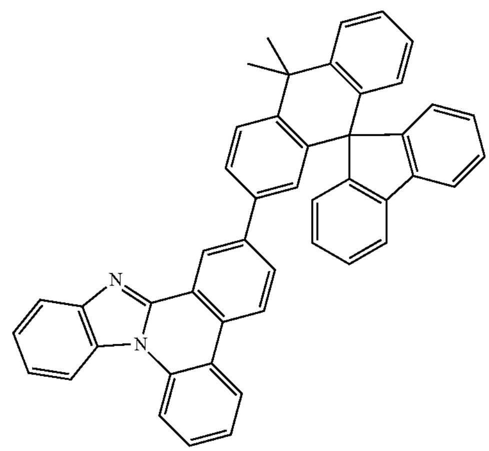
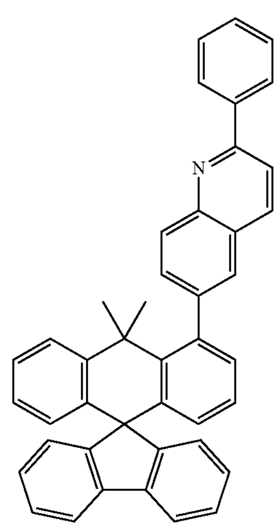

-continued
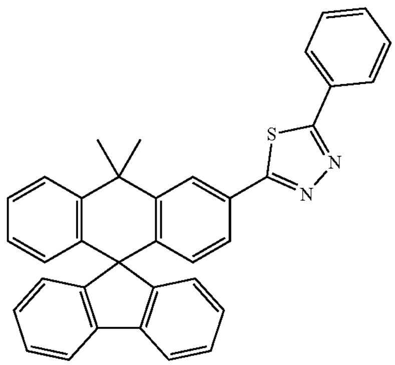
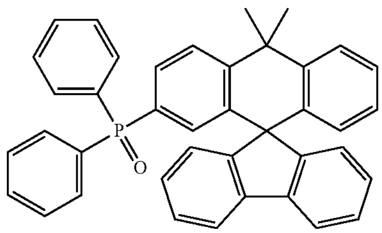
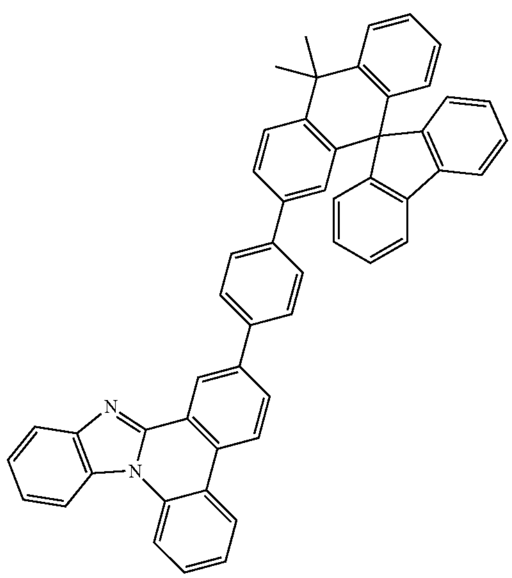
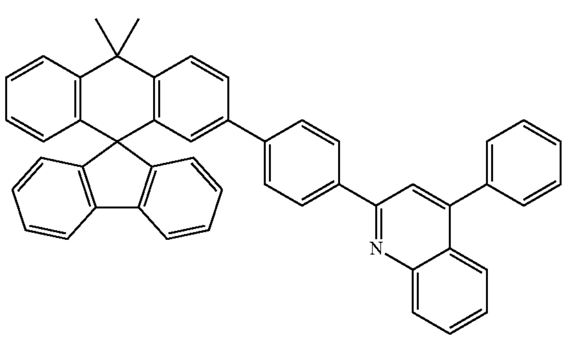
-continued
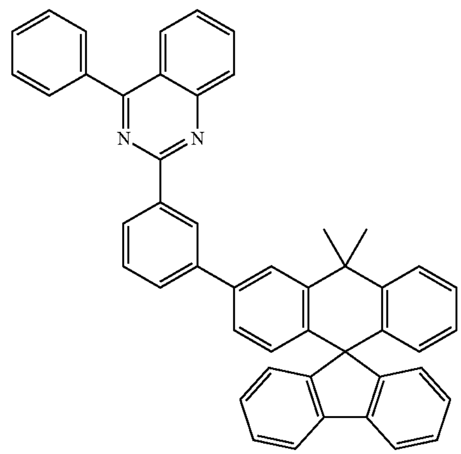
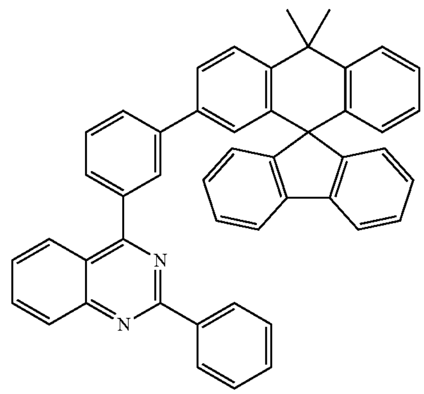
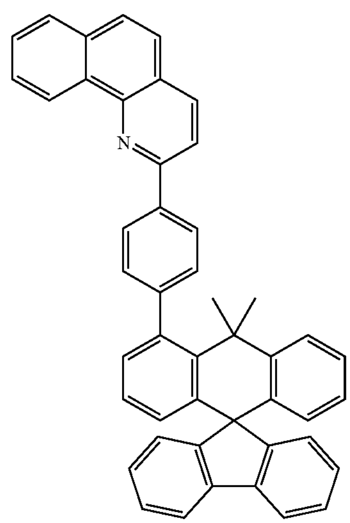
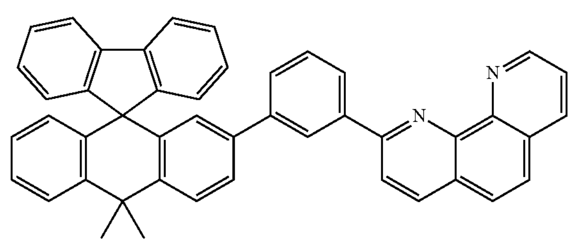

-continued
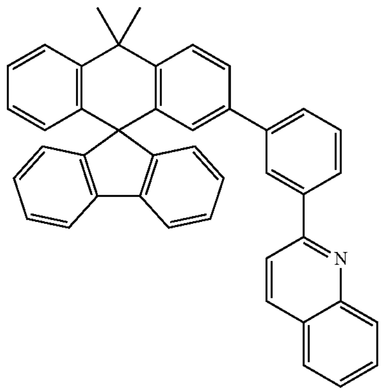
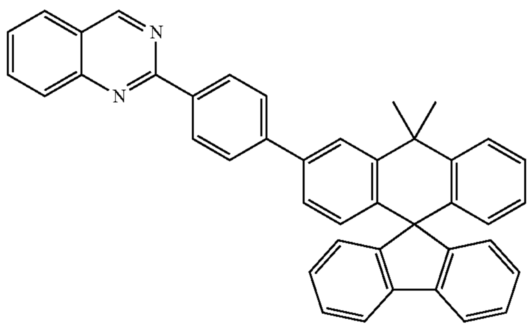
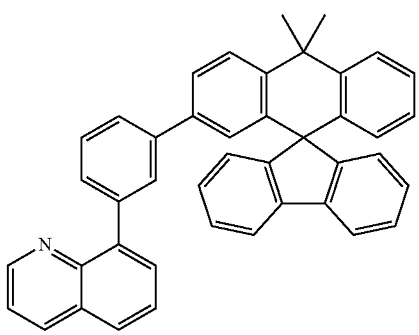
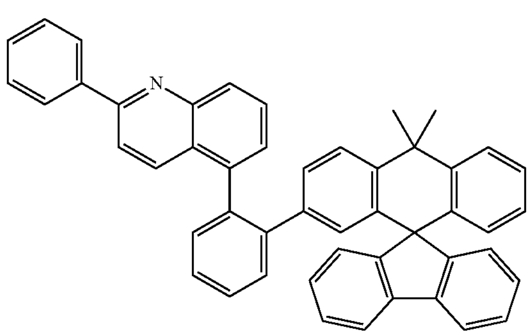
-continued
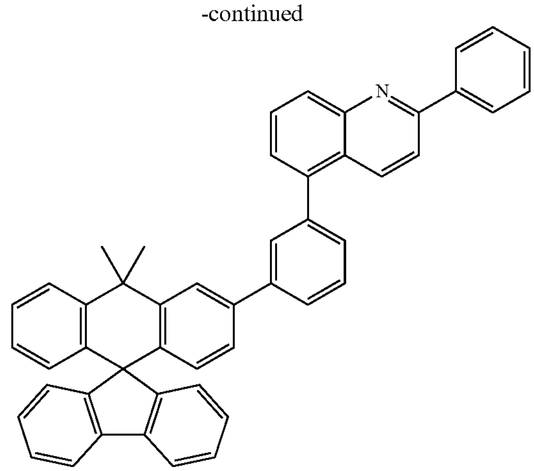
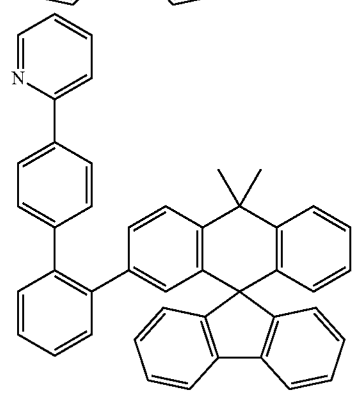
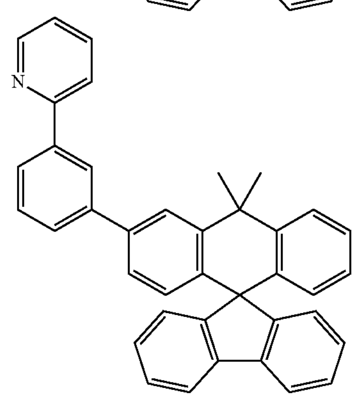
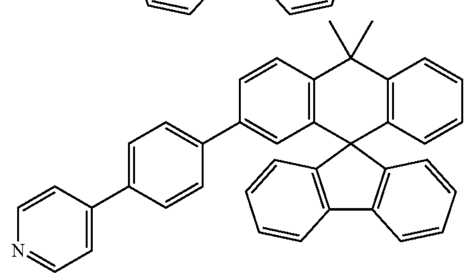
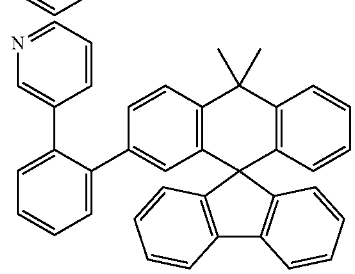

-continued
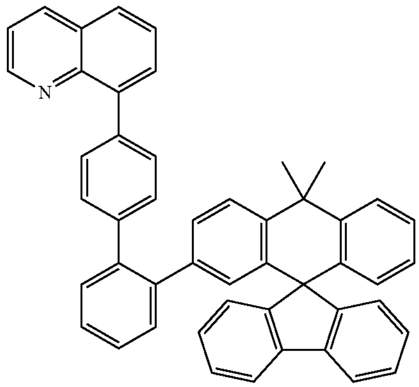
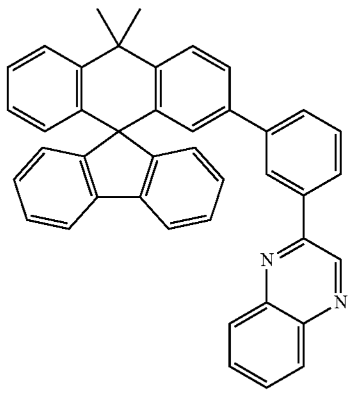
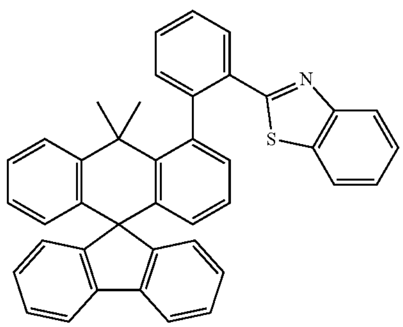
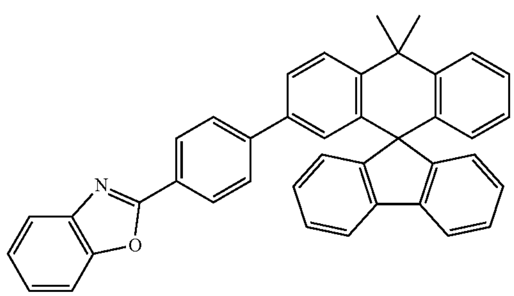
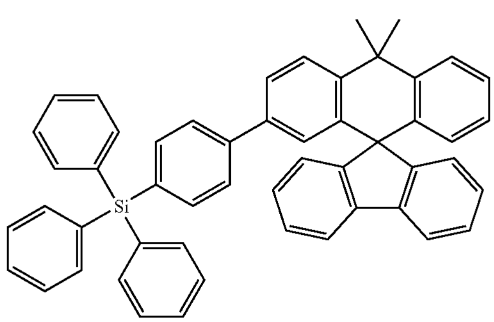
-continued
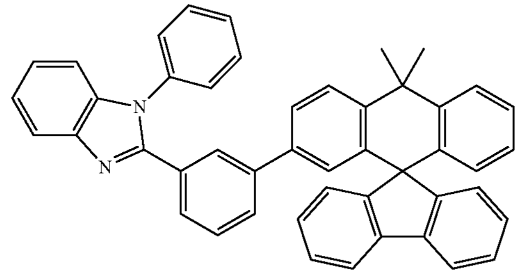
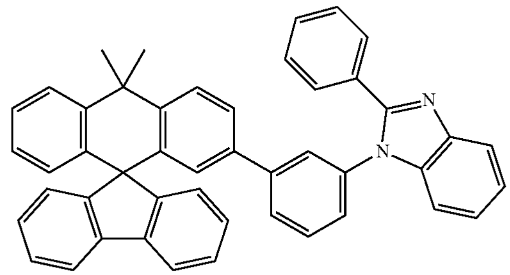
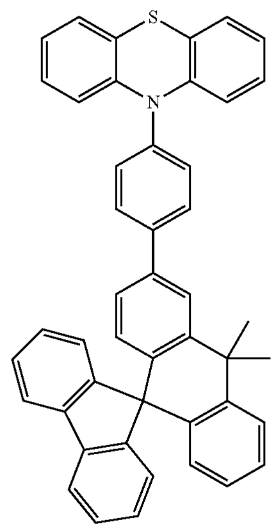
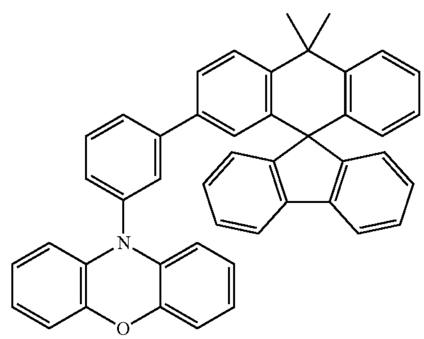
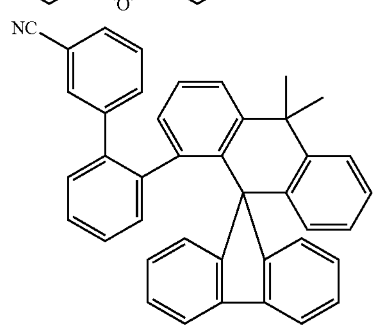

-continued
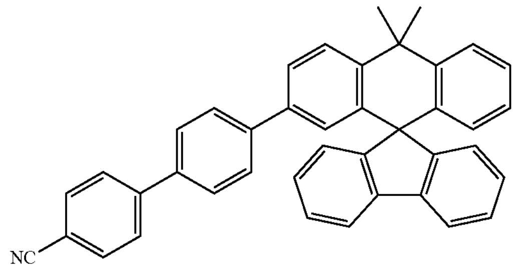
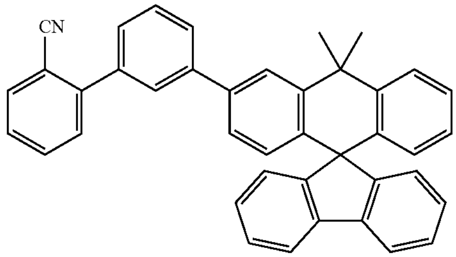
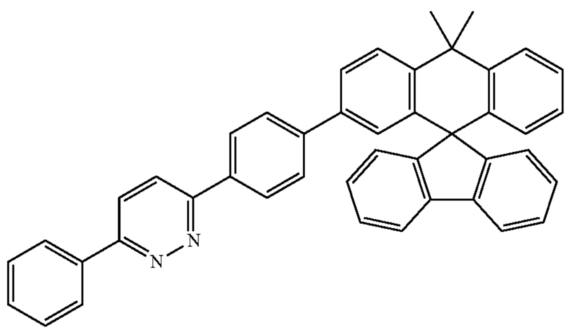
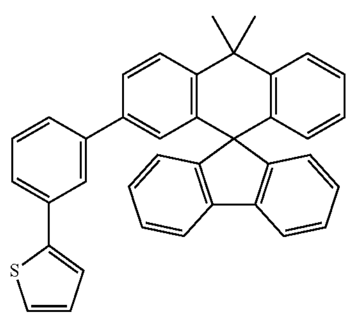
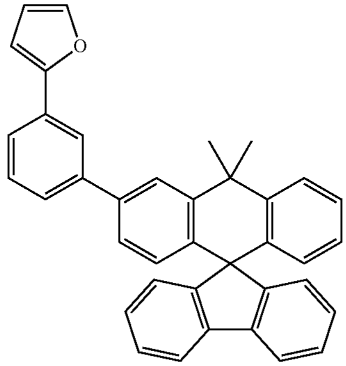
-continued
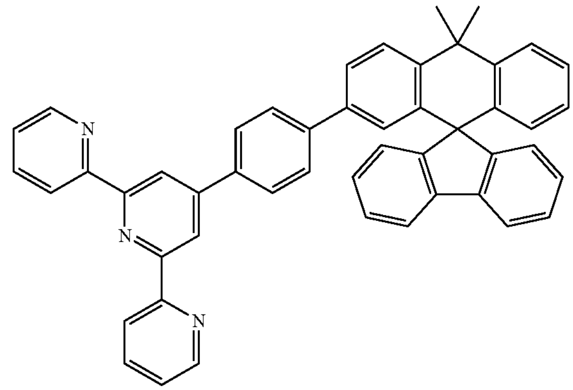
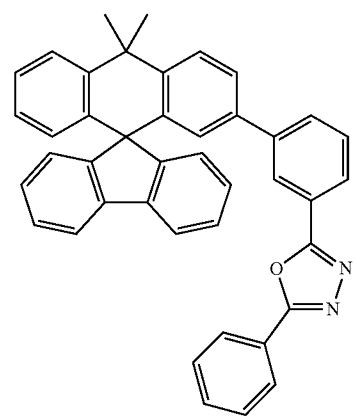
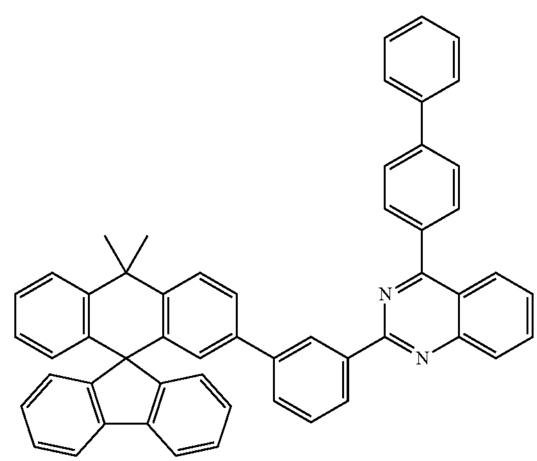

-continued
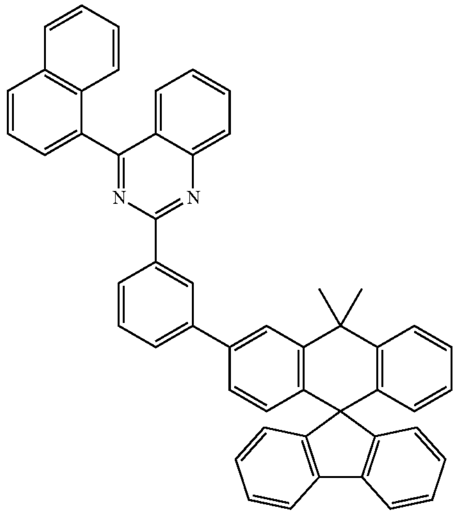
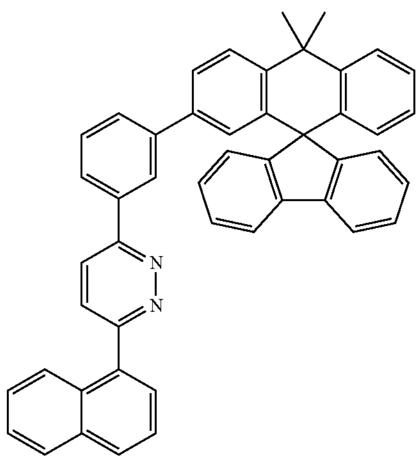
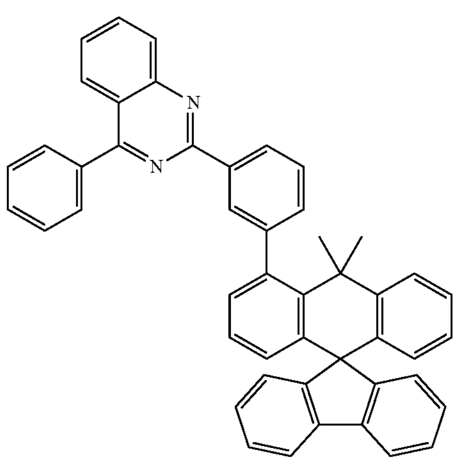
-continued
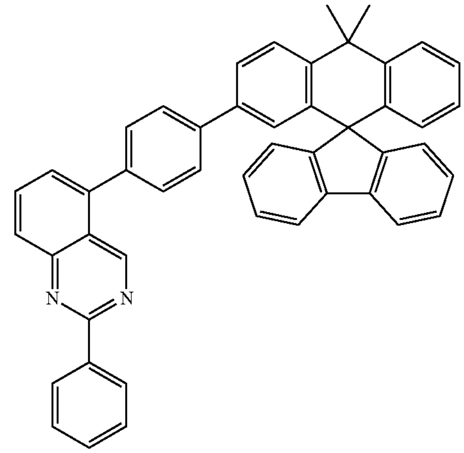
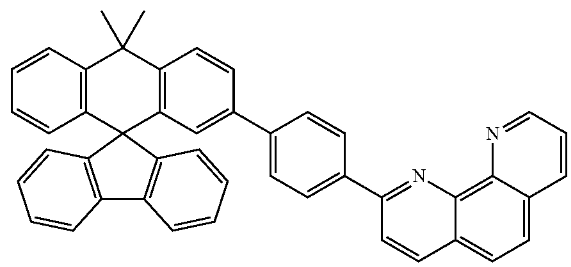
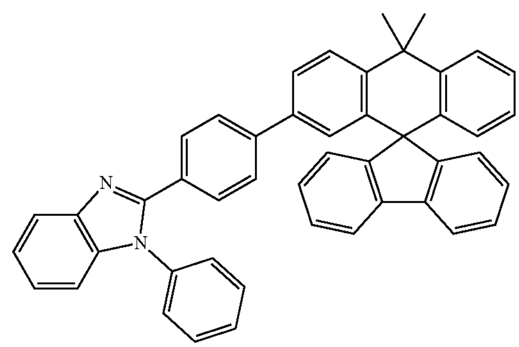
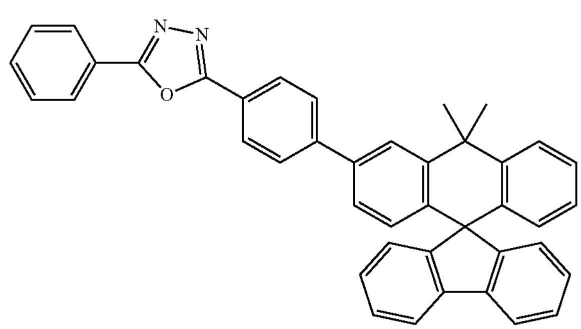
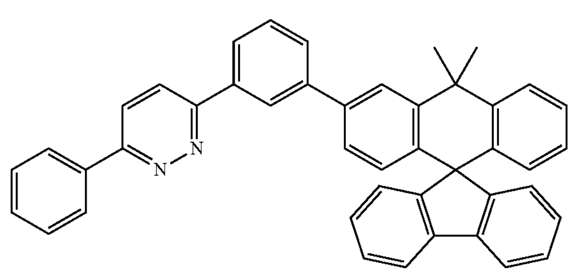

-continued
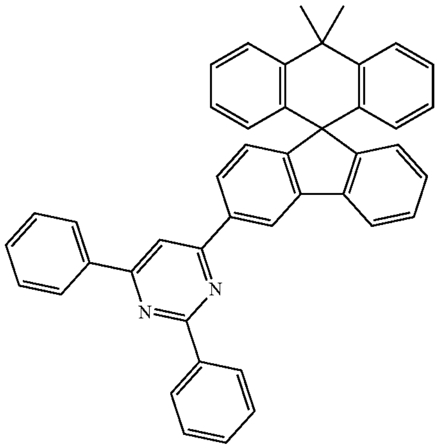
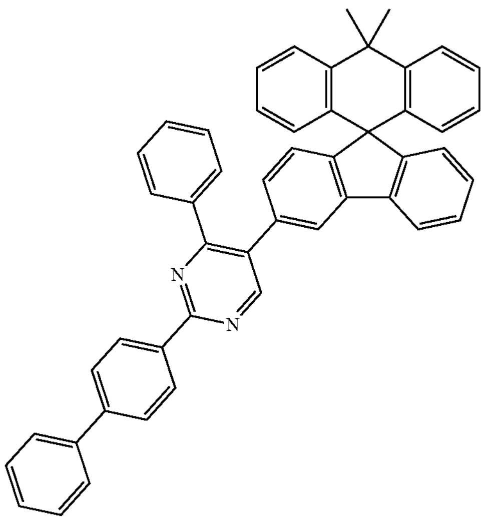
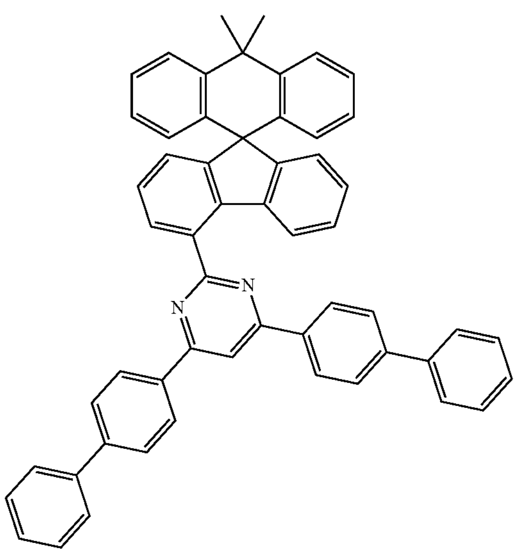
-continued
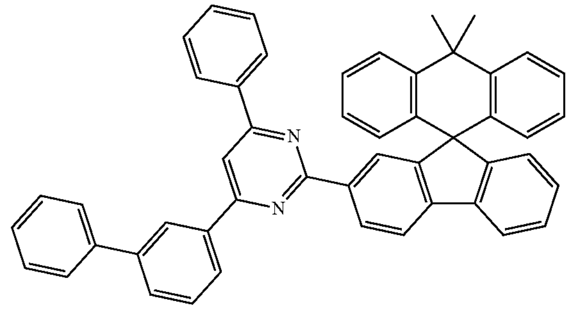
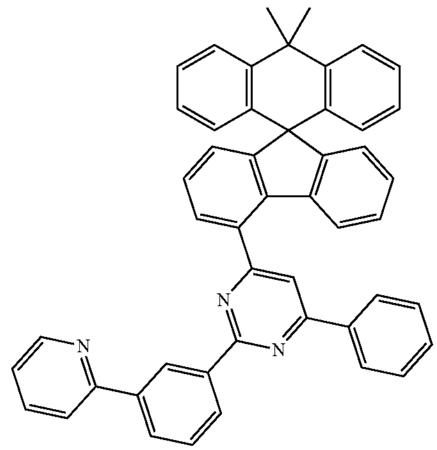
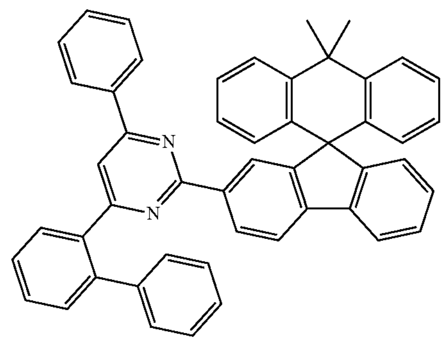
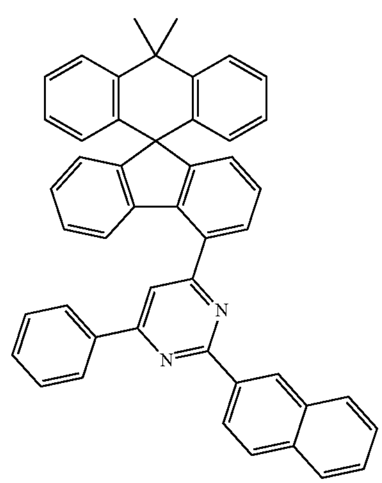

-continued
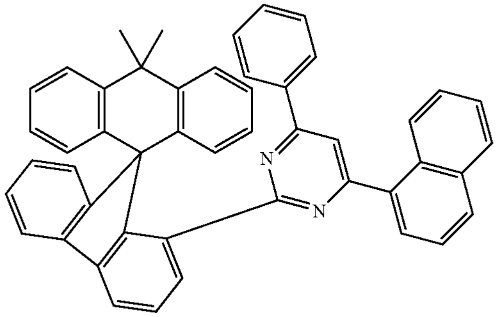
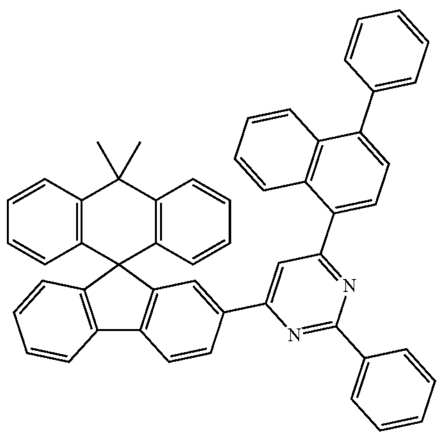
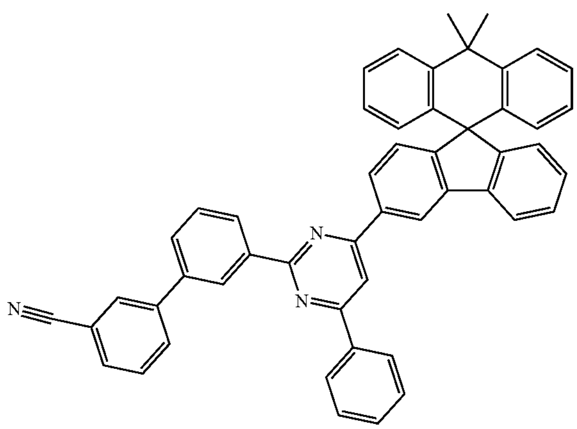
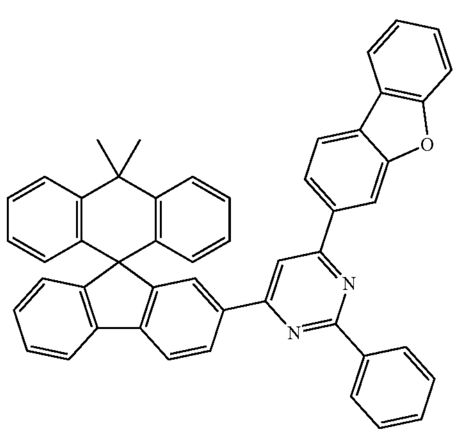
-continued
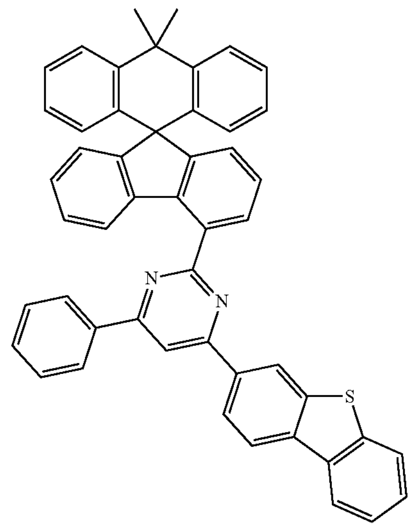
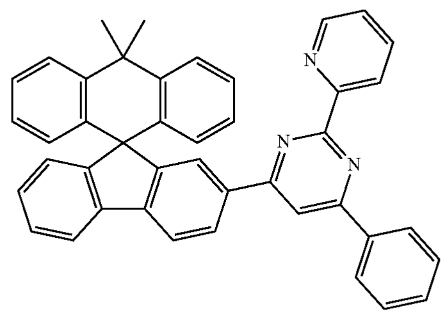
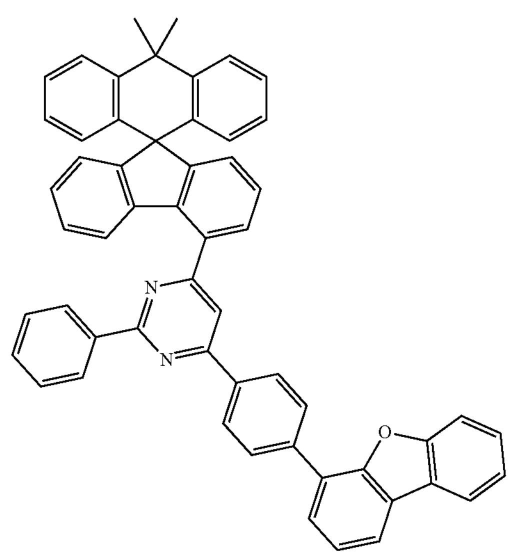 [SMILES: CC1(C)c2ccccc2C2(c3ccccc3-c3c(-c4cc(-c5ccc(-c6cccc7c6oc6ccccc67)cc5)nc(-c5ccccc5)n4)cccc32)c2ccccc21]

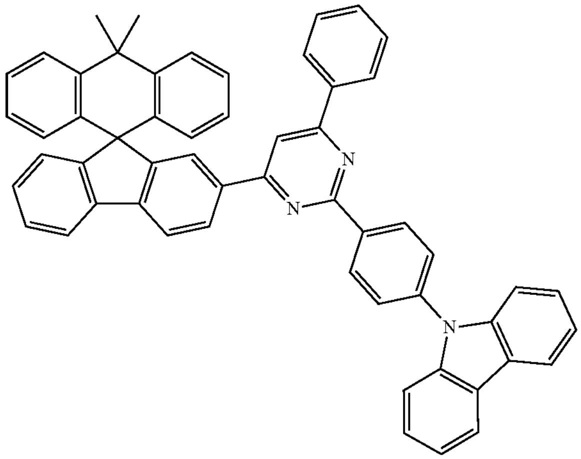
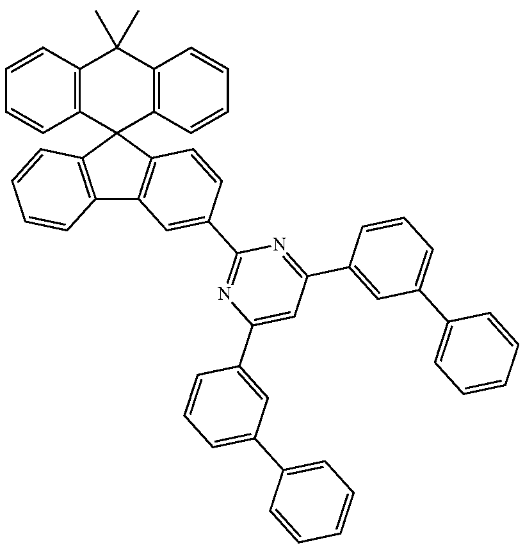
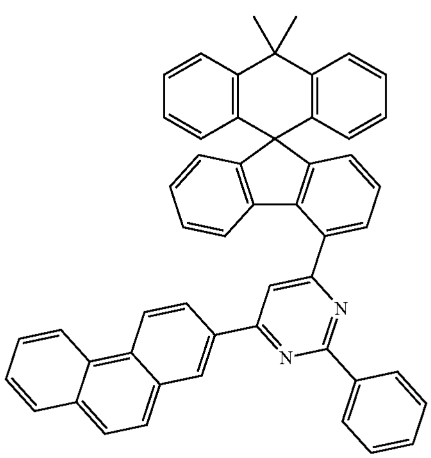
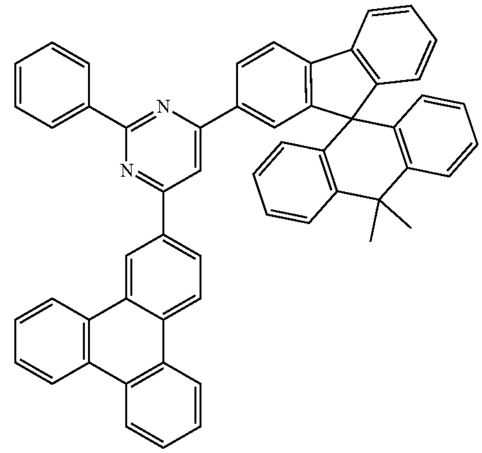
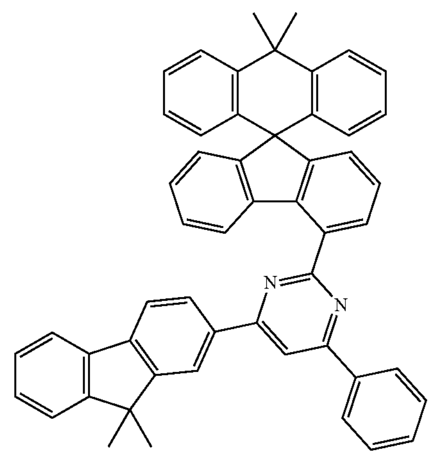
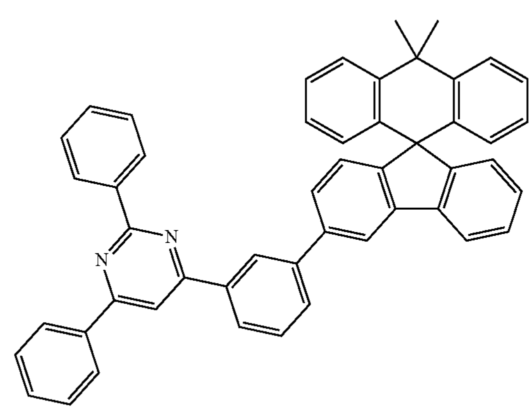

-continued
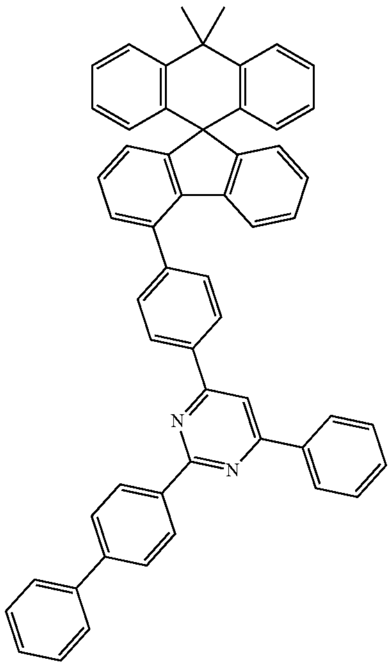
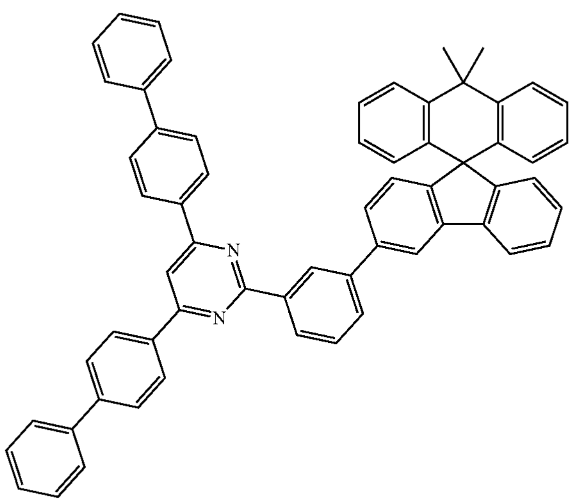
-continued
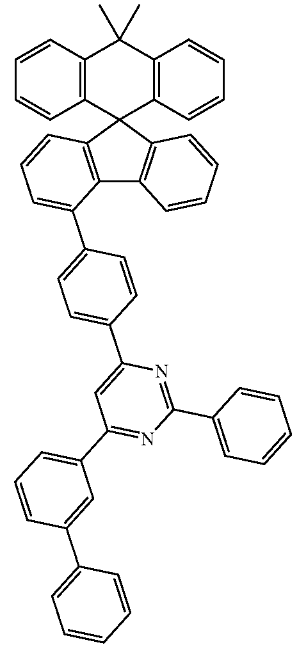
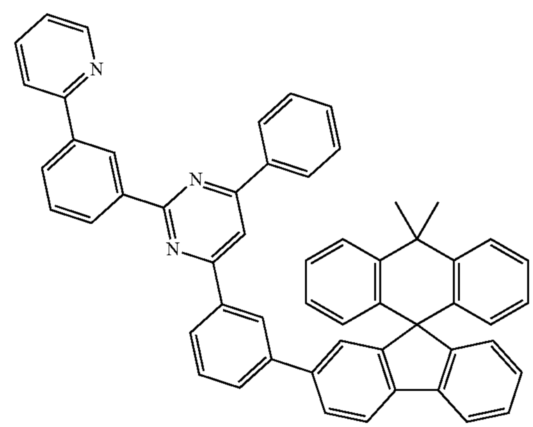
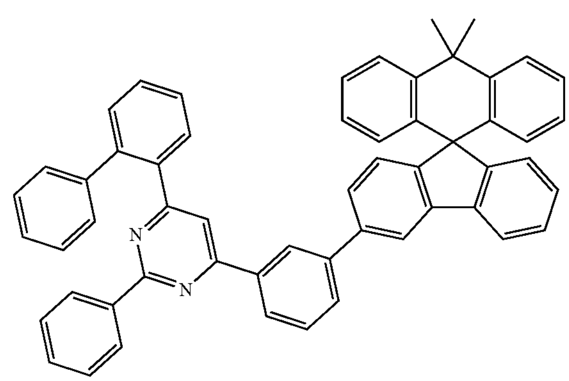

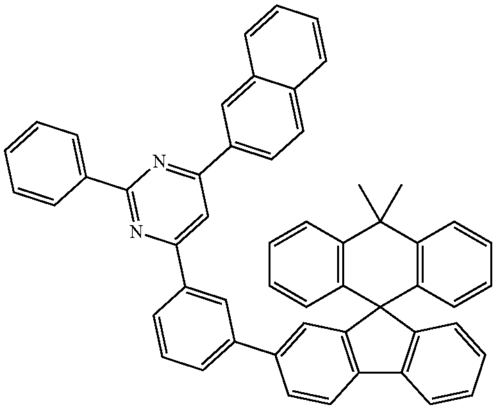
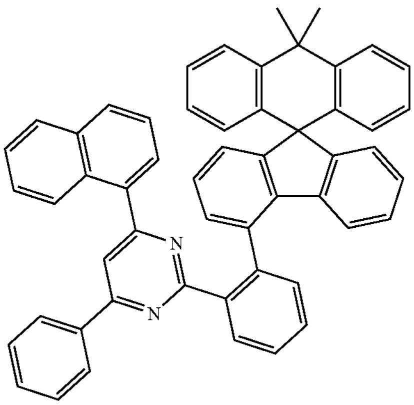
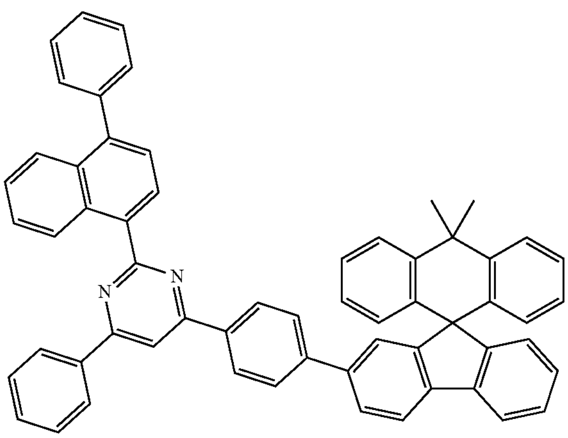
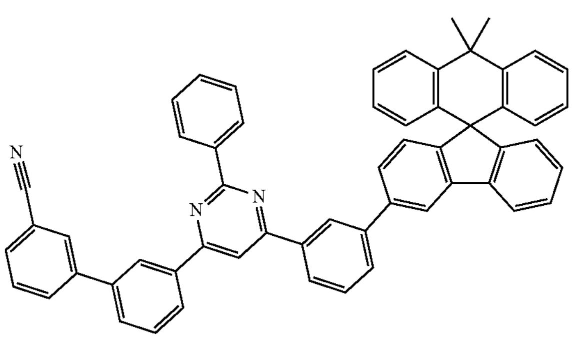
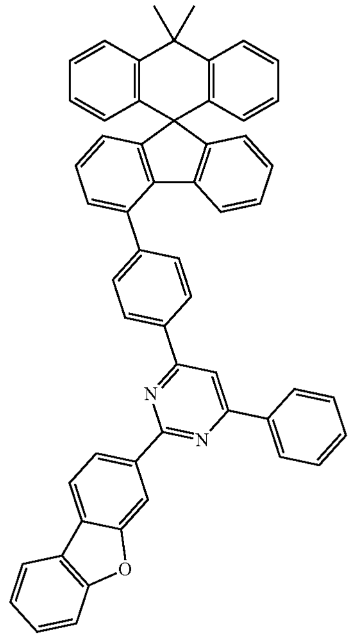
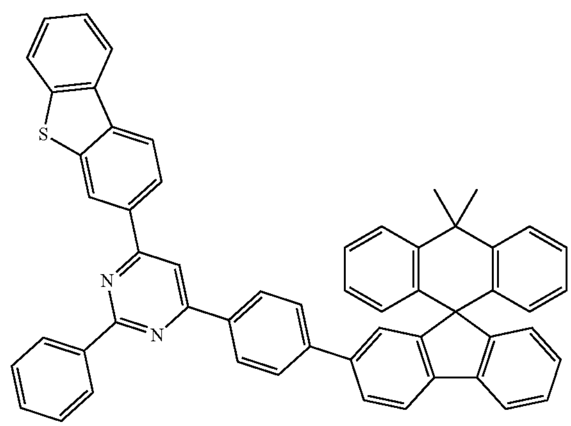
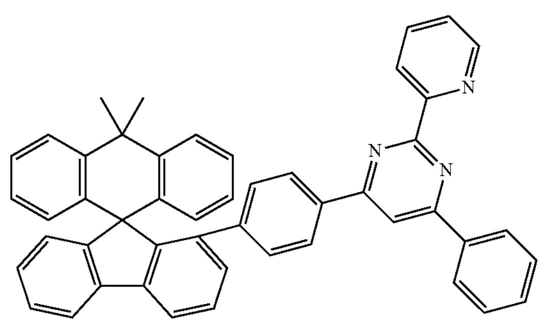

-continued
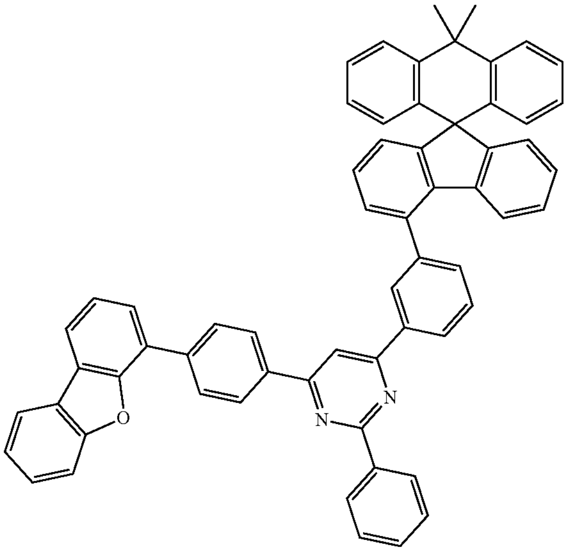
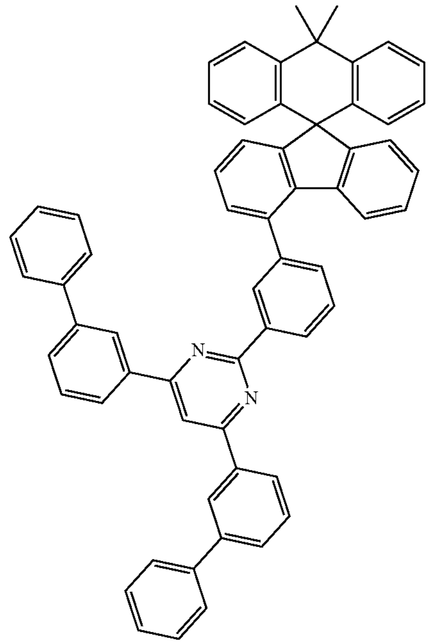
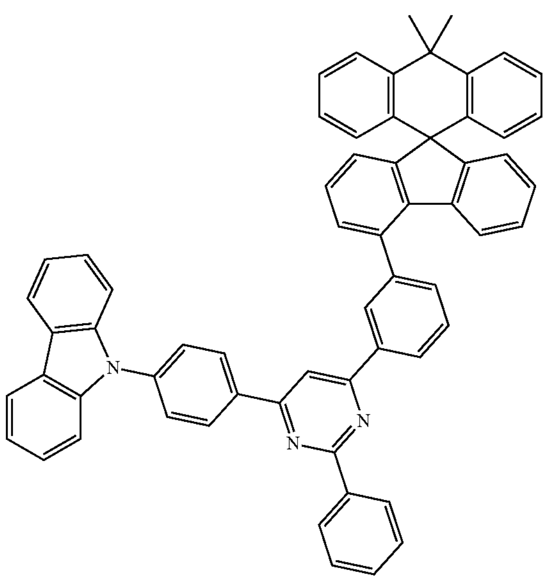
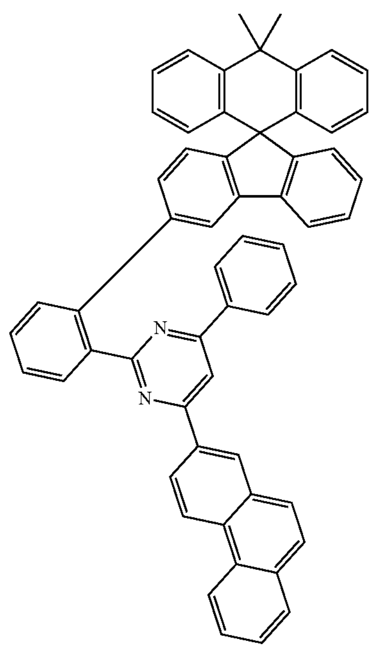

-continued
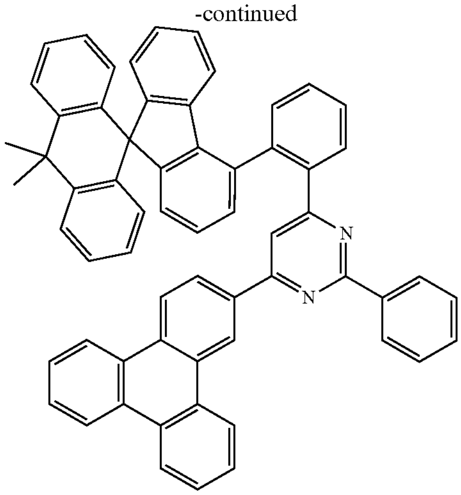
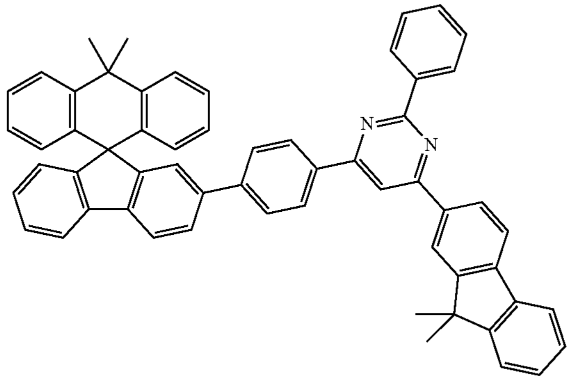
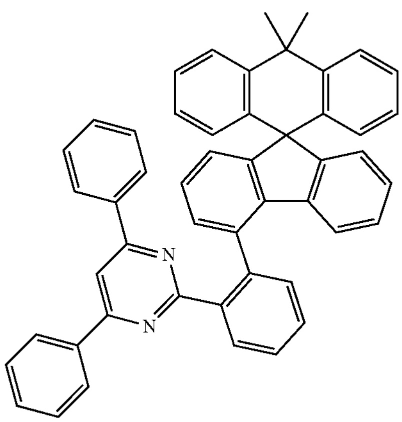
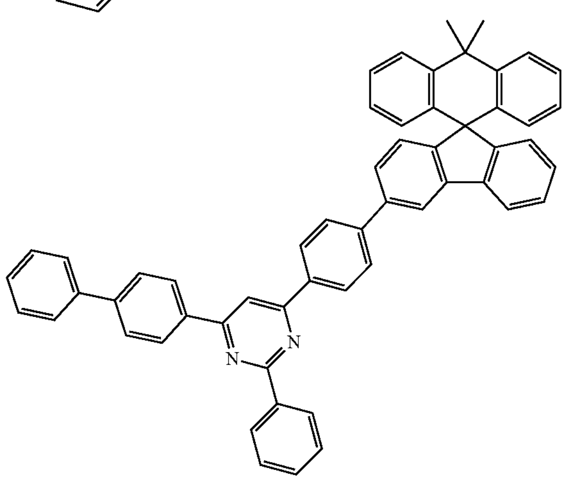
-continued
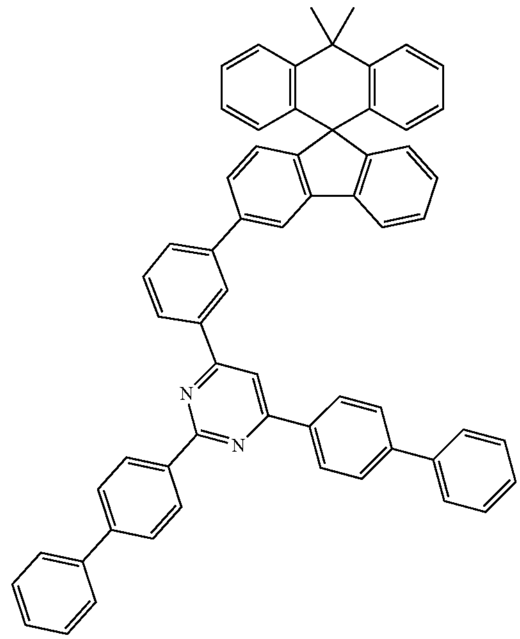
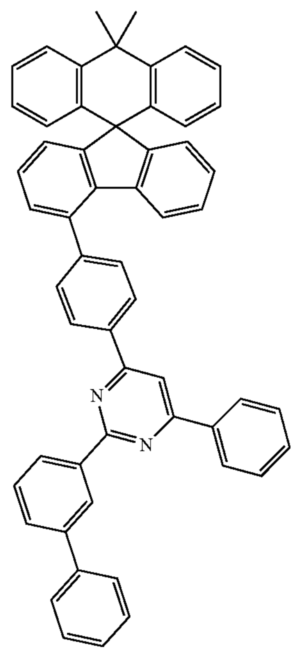
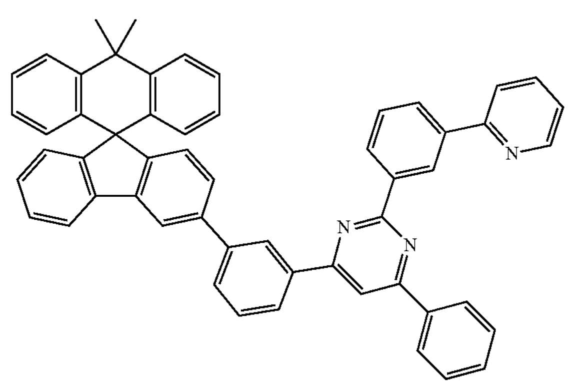

-continued
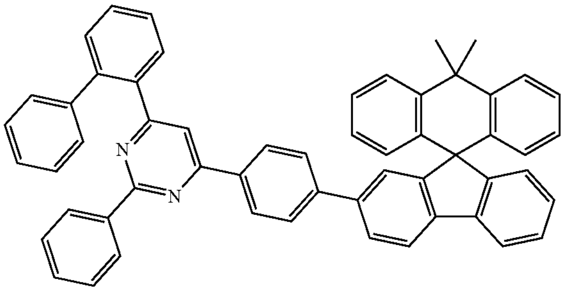
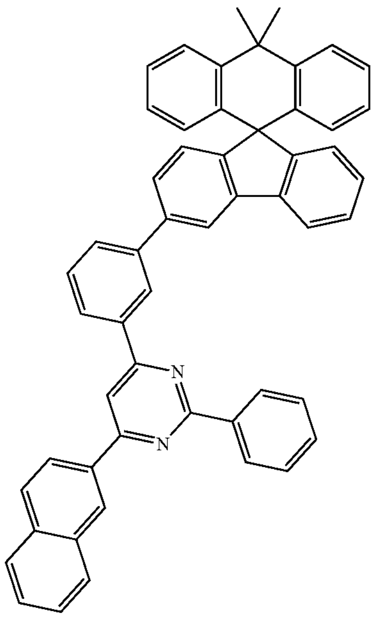
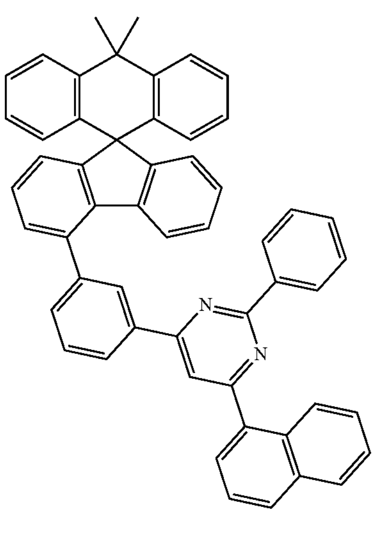
-continued
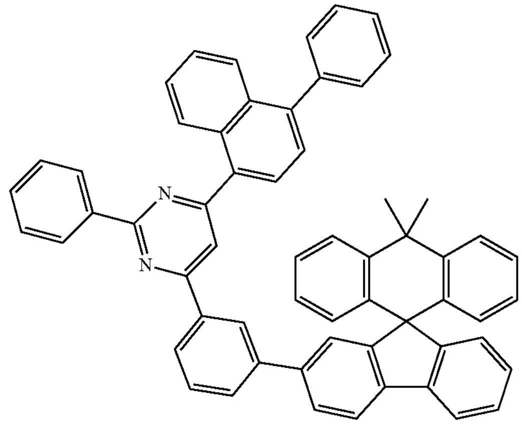
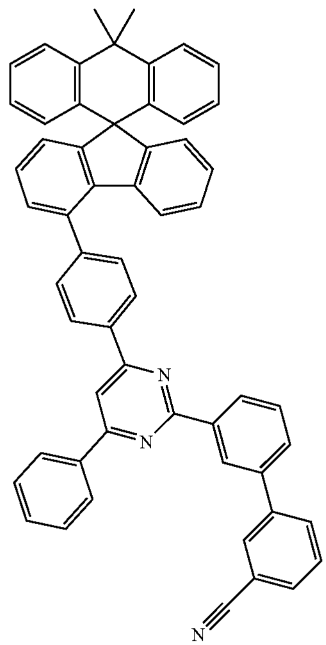
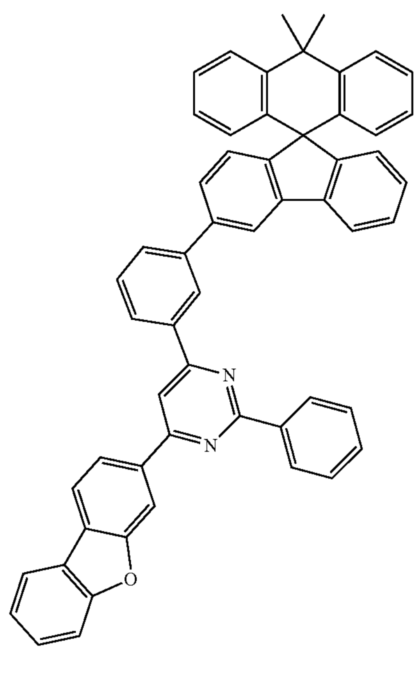

-continued
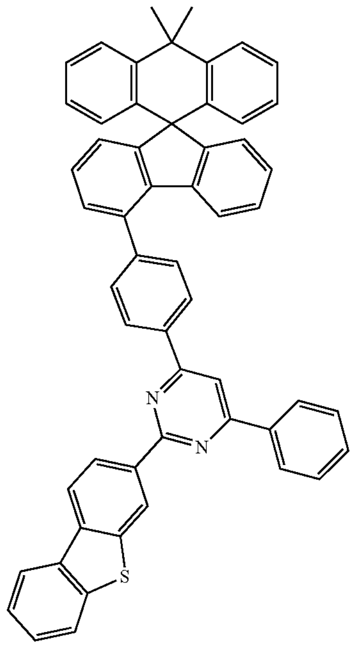
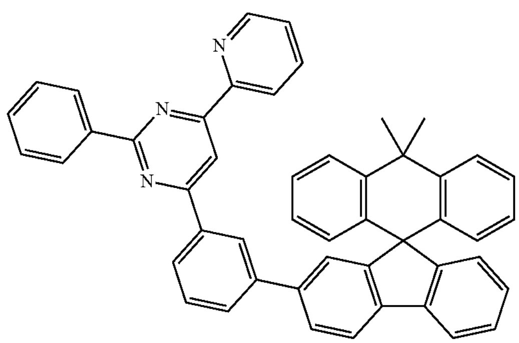
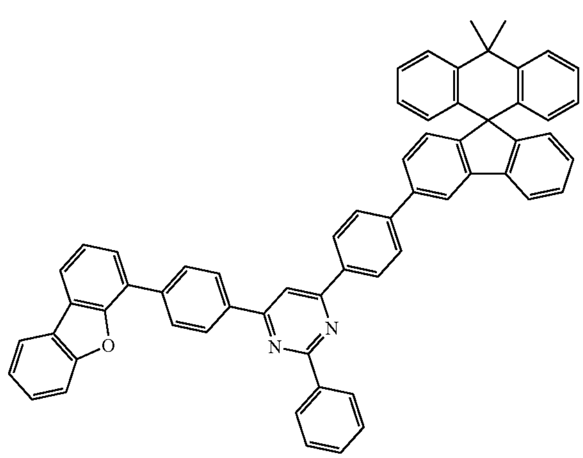
-continued
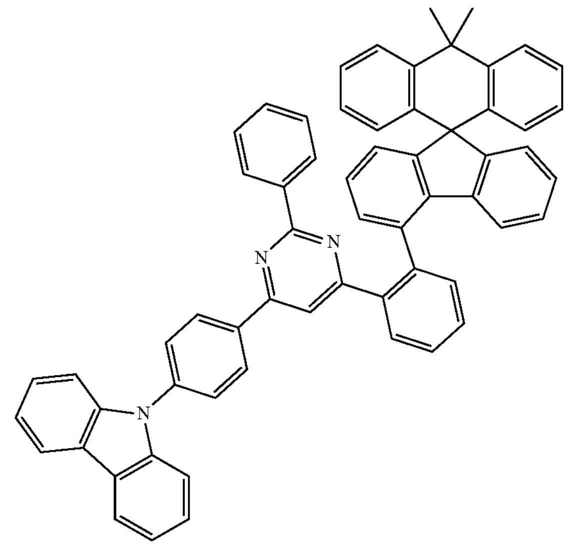
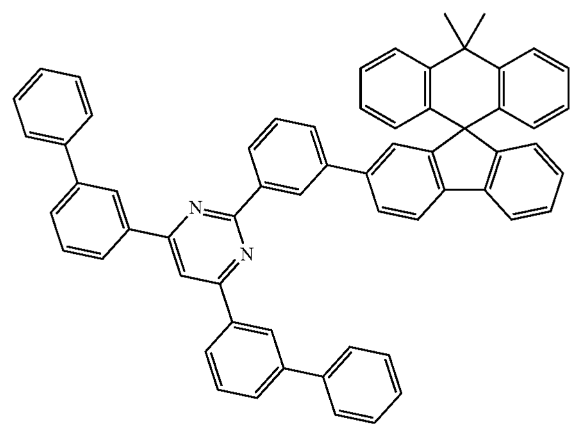
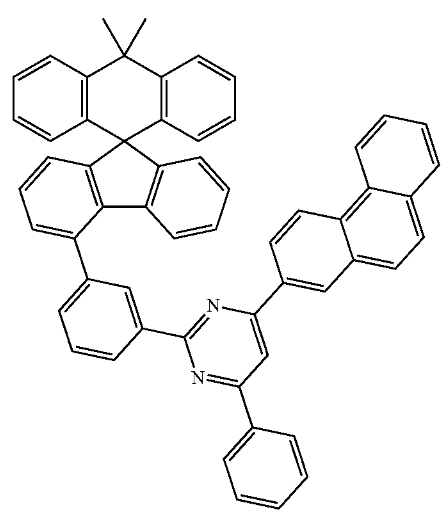

-continued
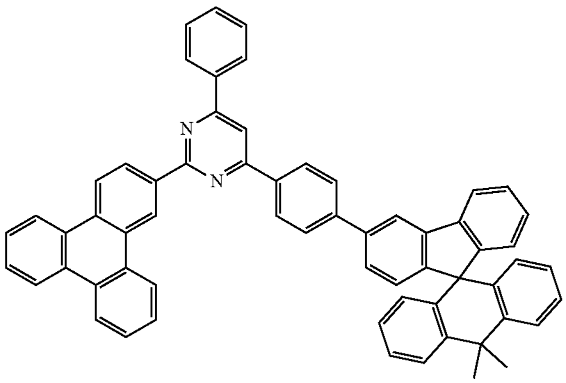
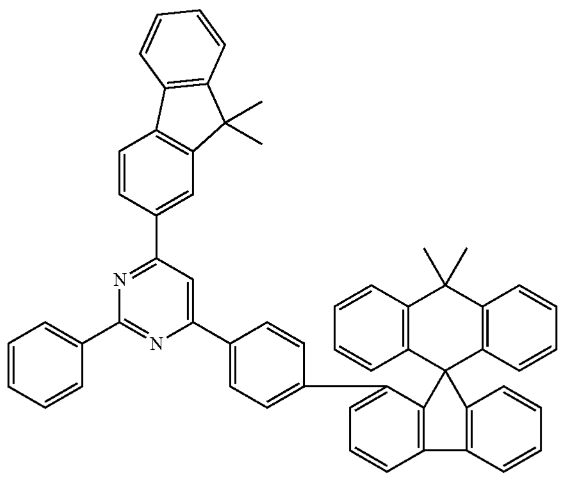
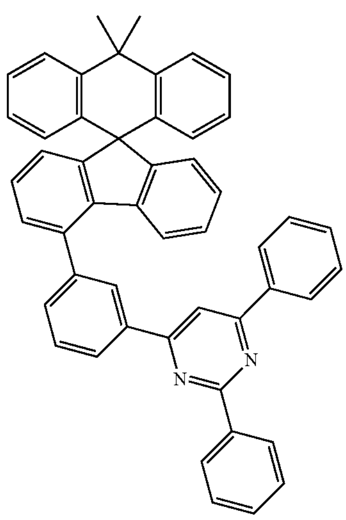
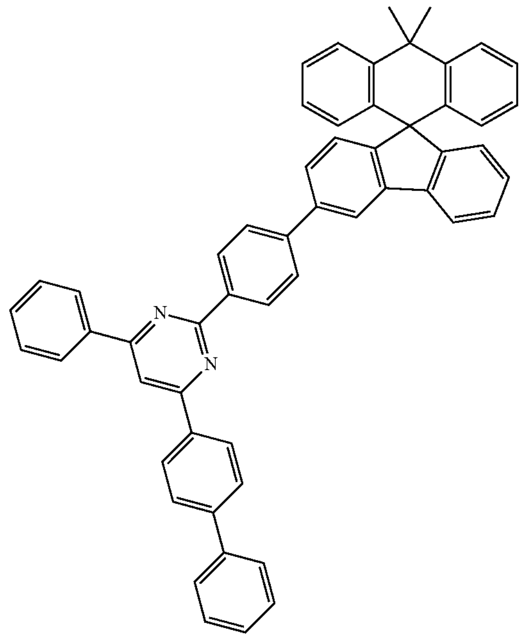
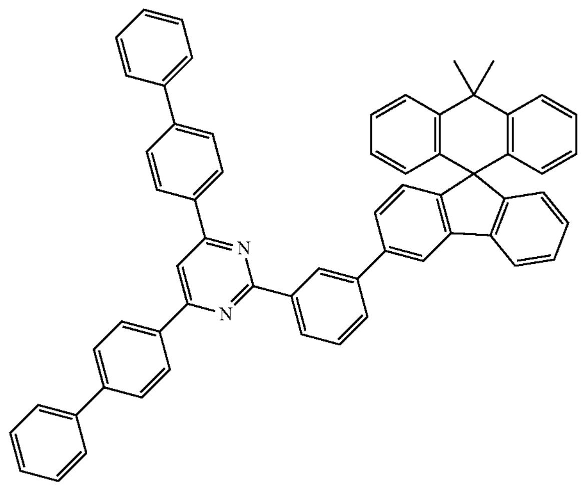
-continued
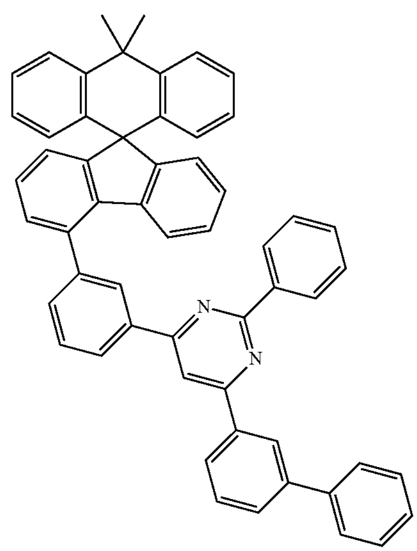

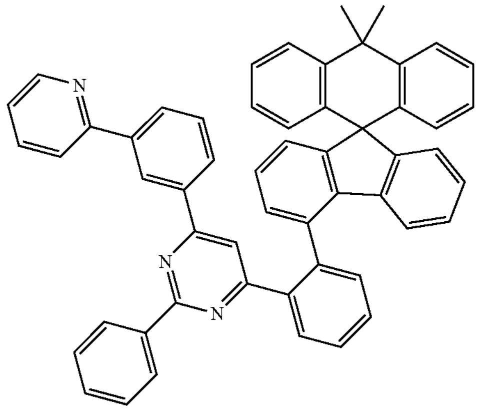
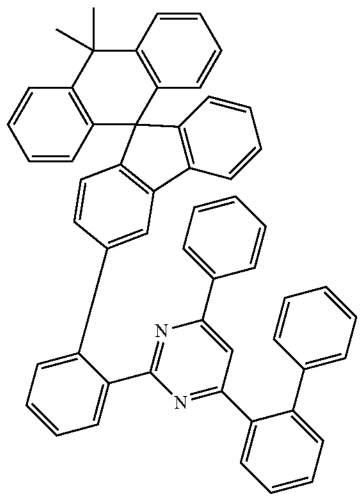
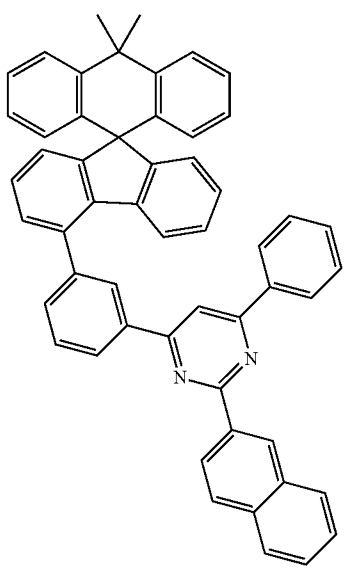
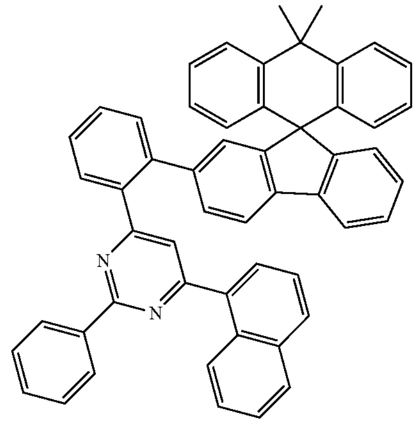
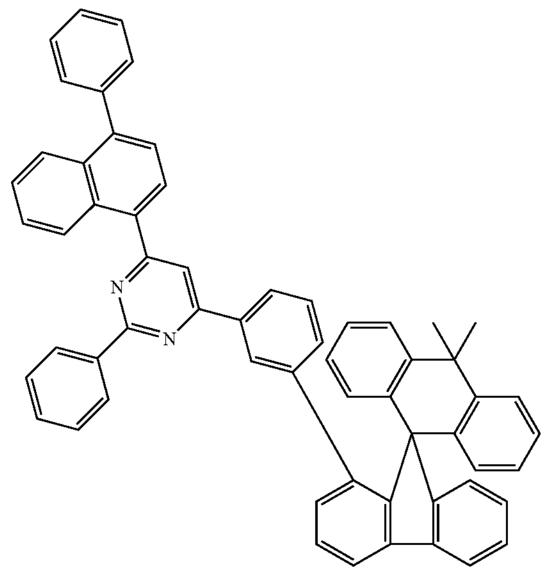
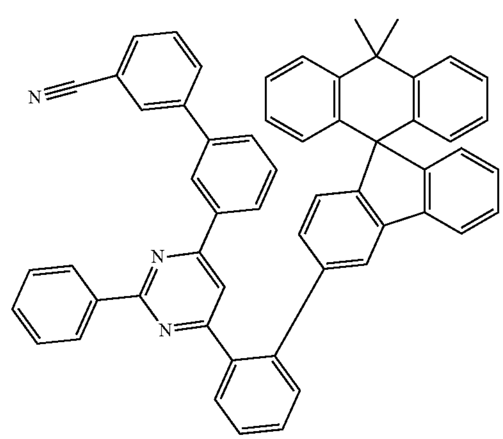

-continued
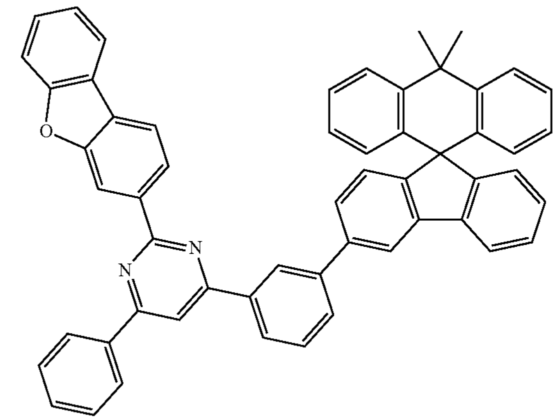
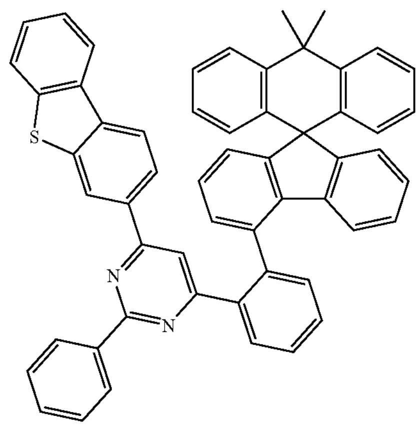
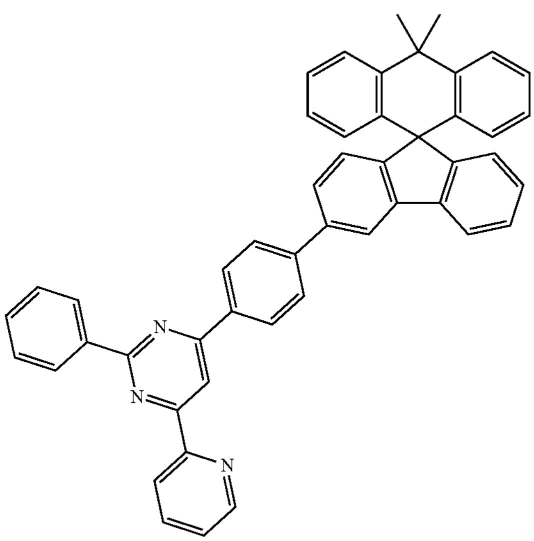
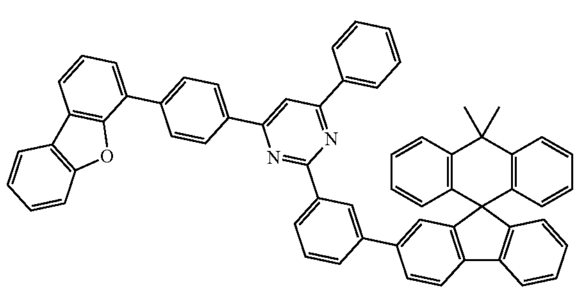
-continued
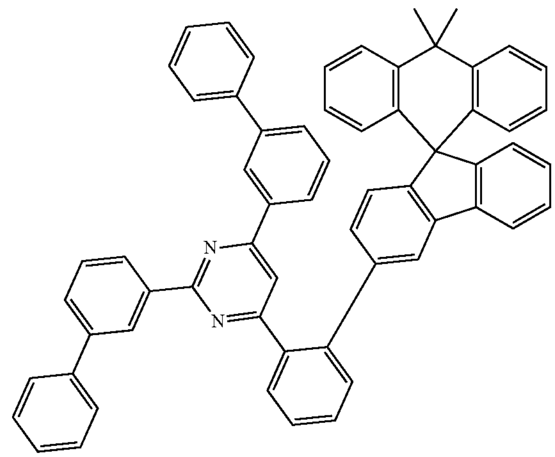
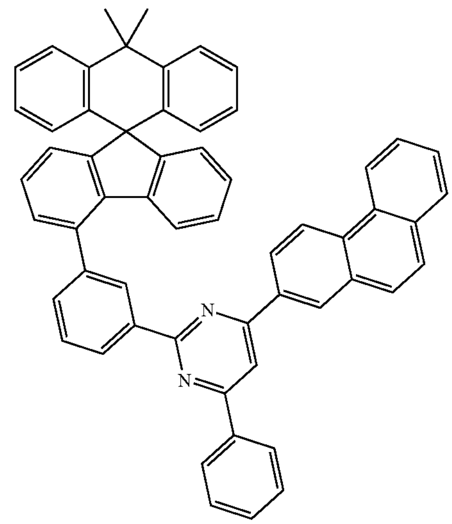
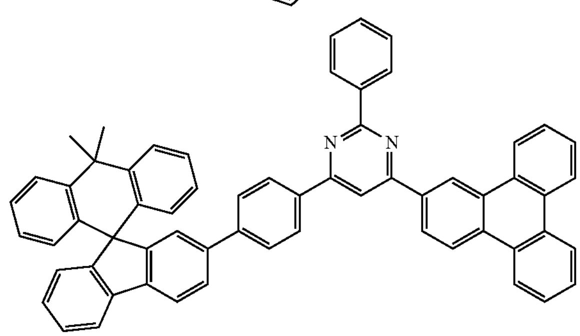
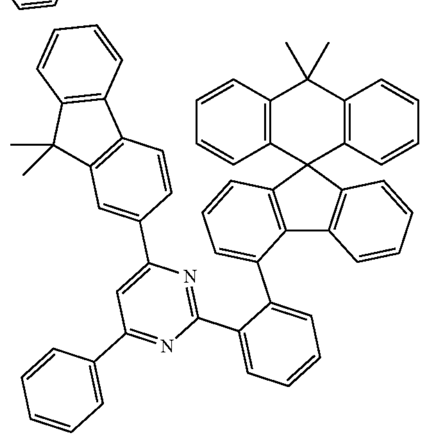

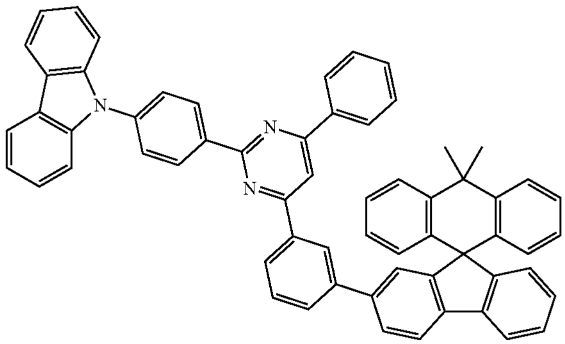
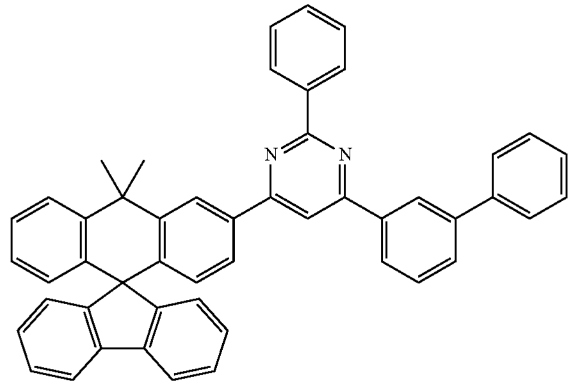
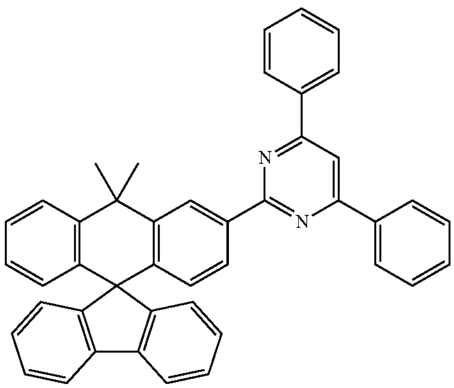
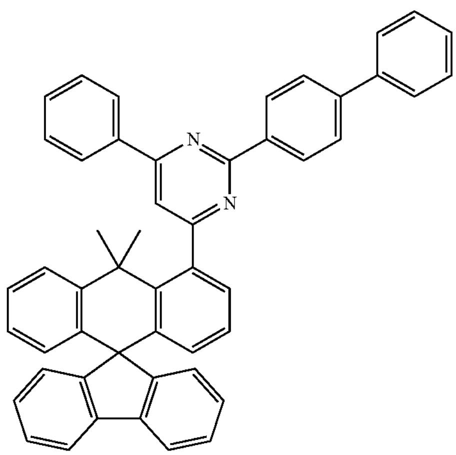
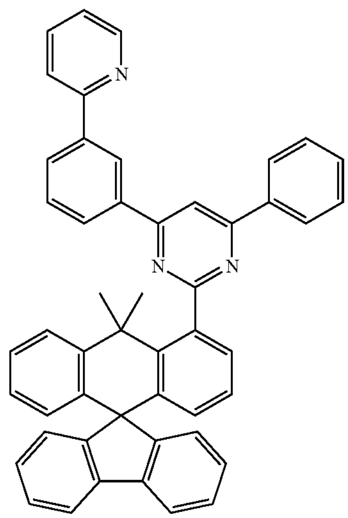
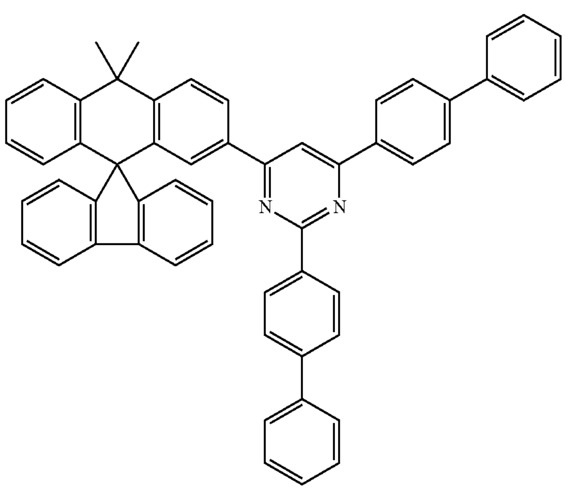
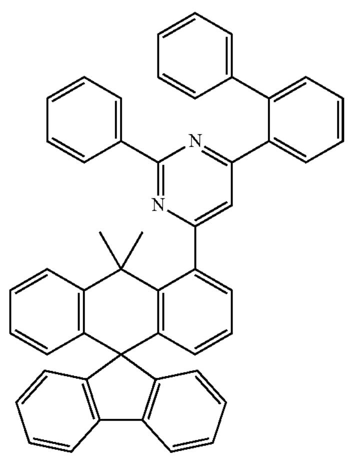

-continued
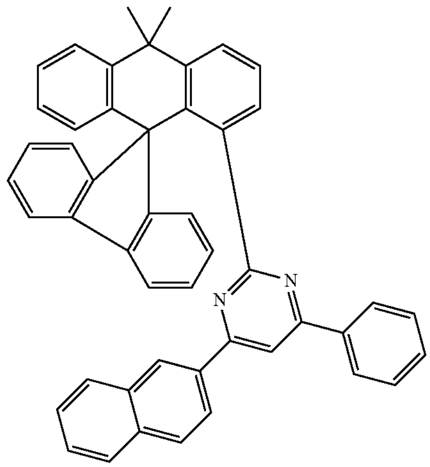
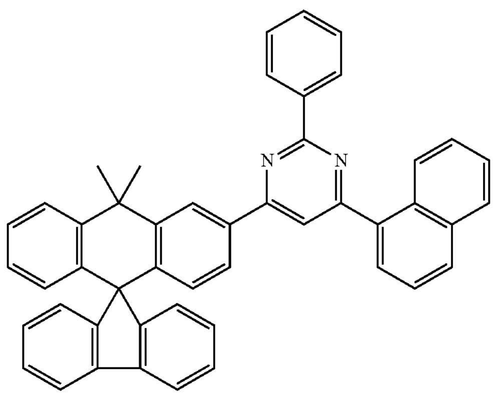
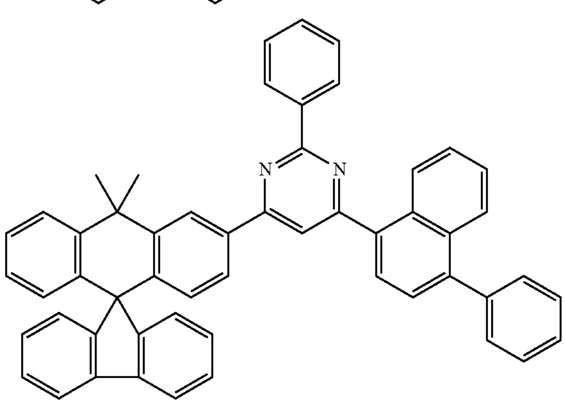
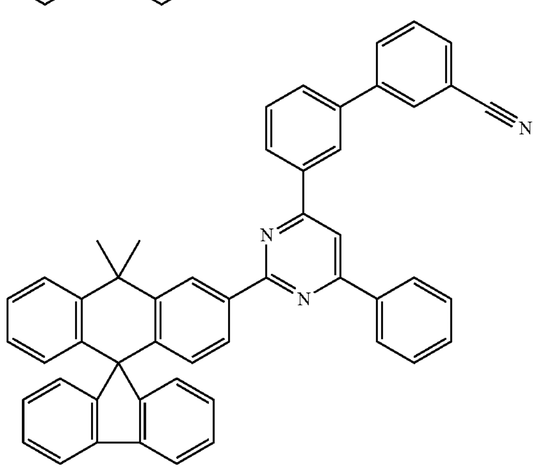
-continued
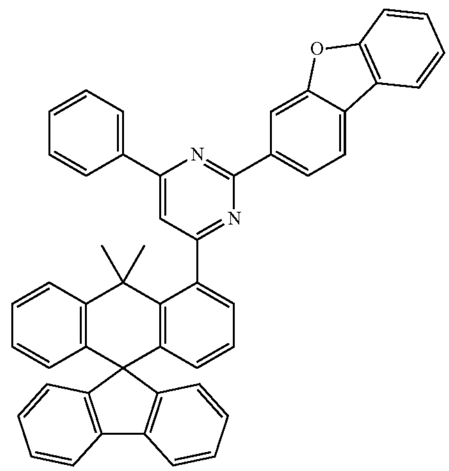
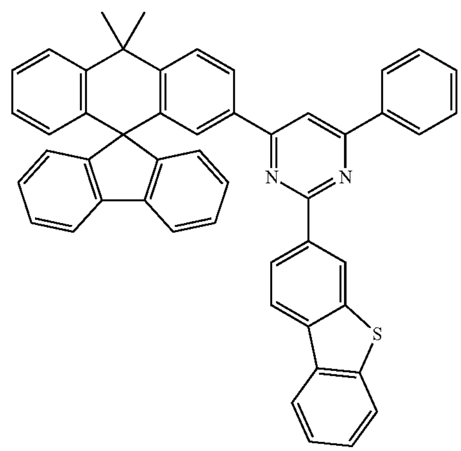
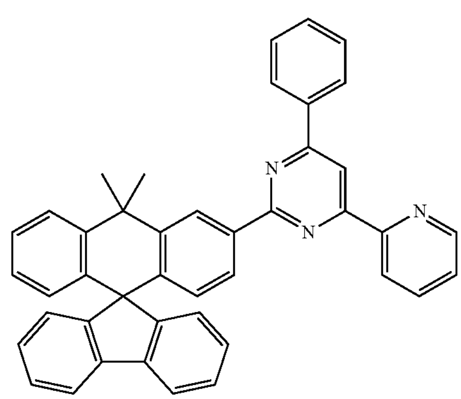

-continued
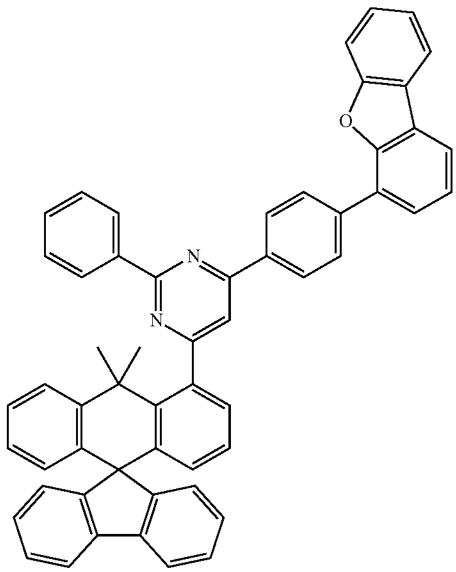
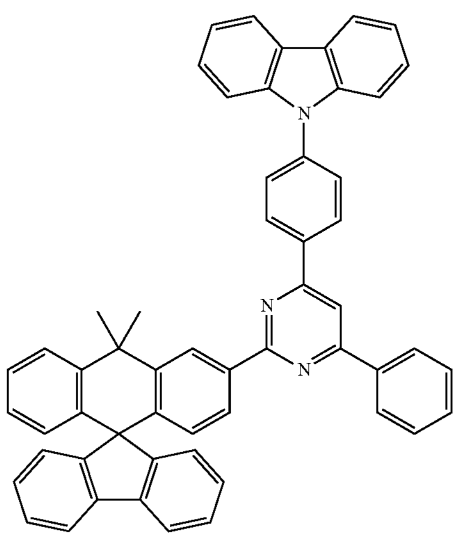
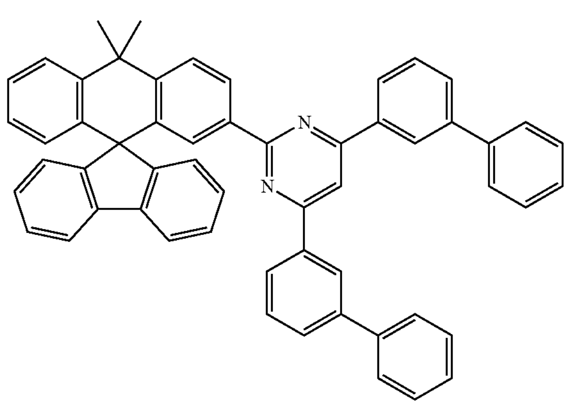
-continued
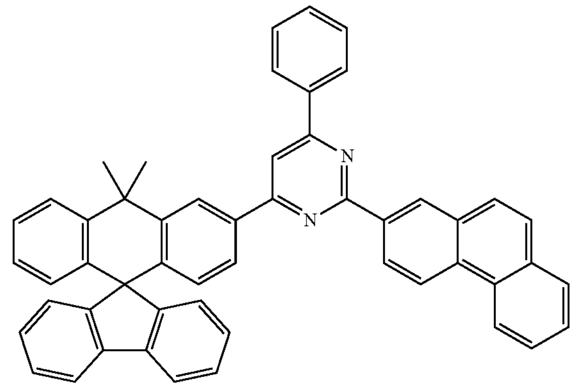
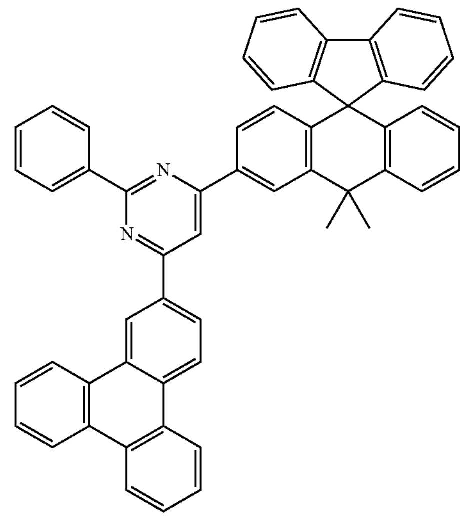
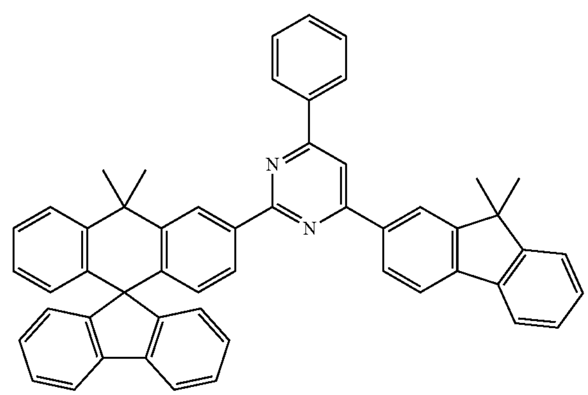
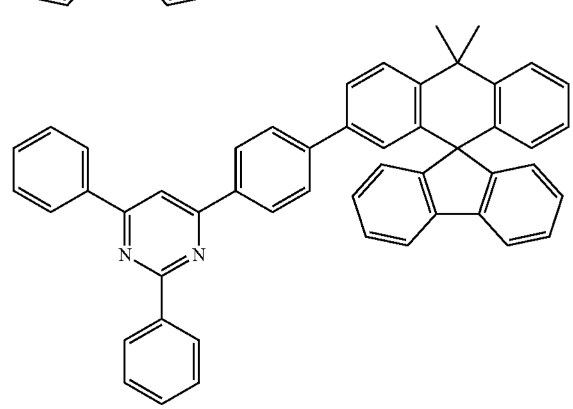

1452
-continued
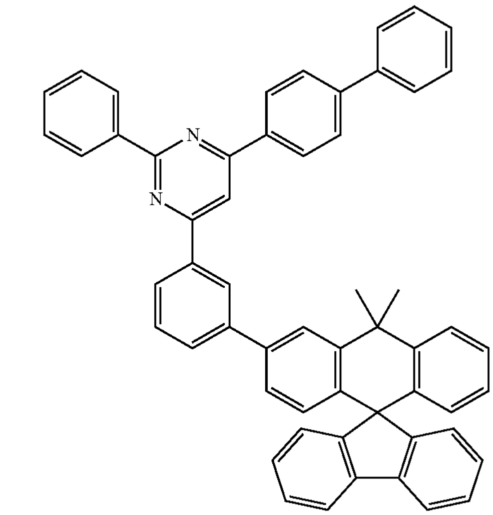
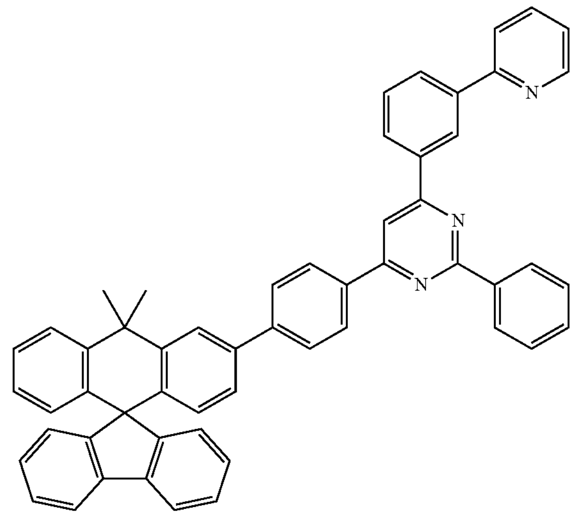
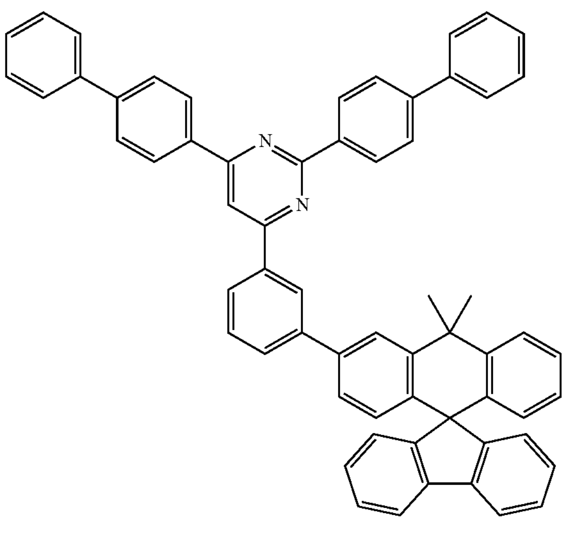
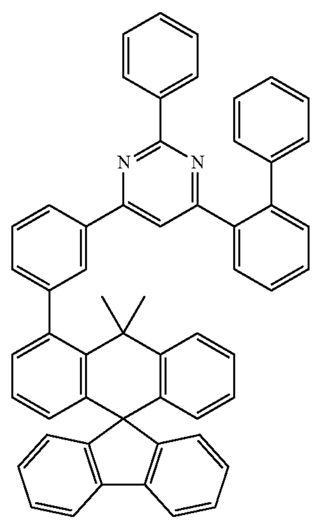
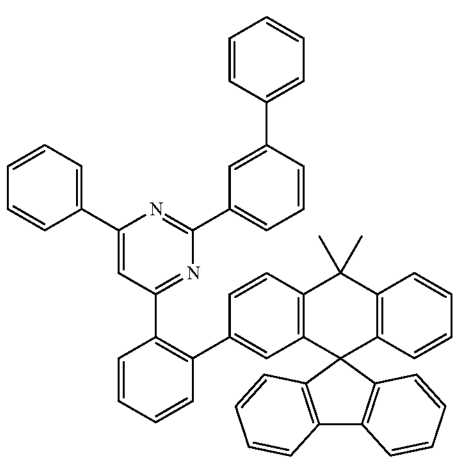
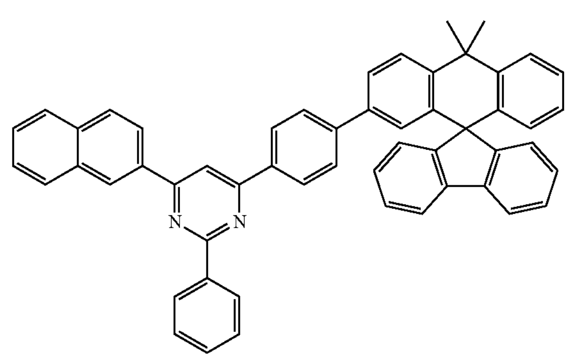

-continued
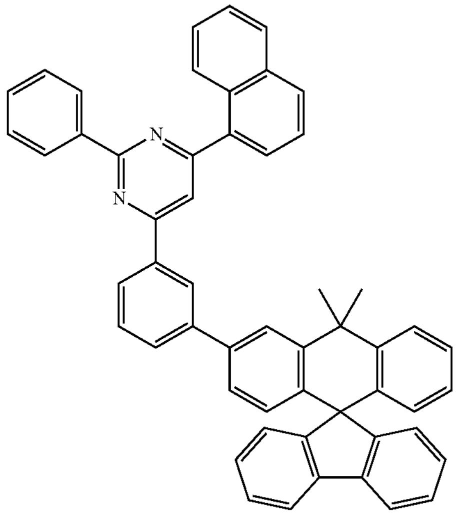
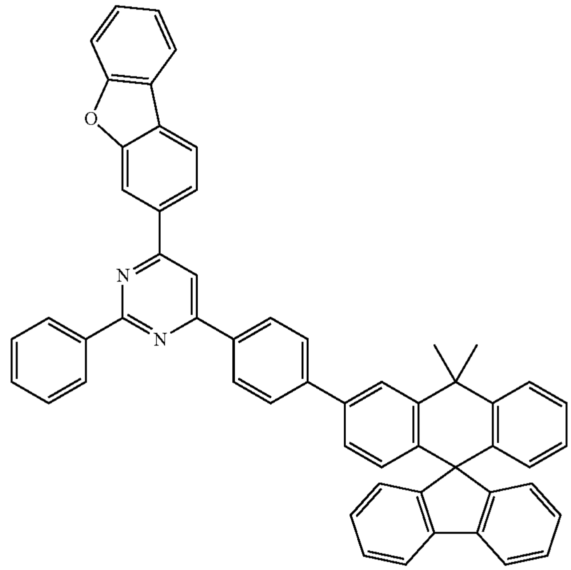
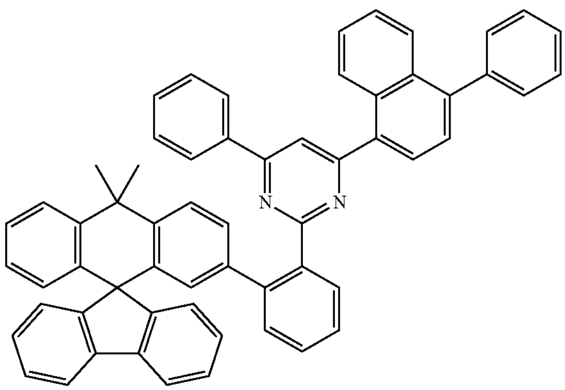
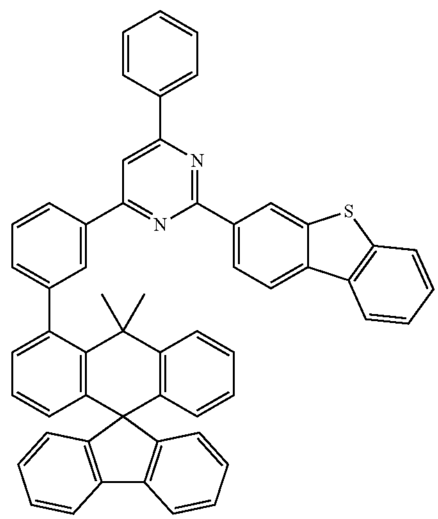
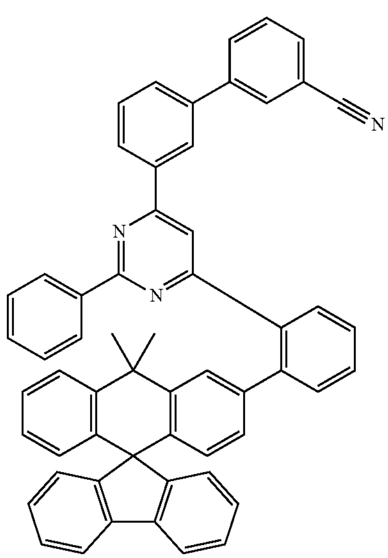
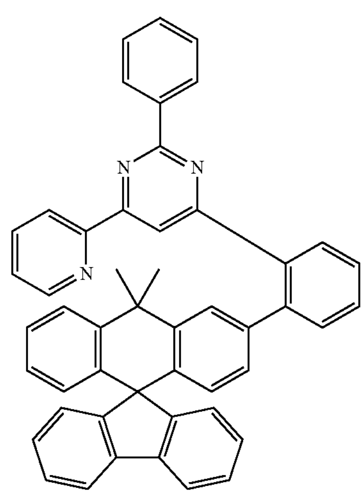

-continued
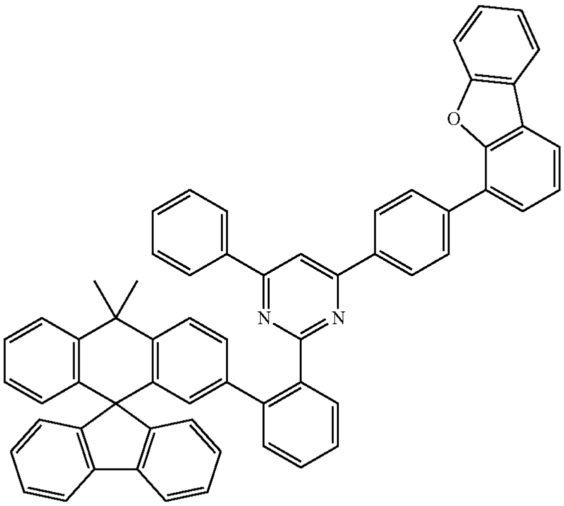
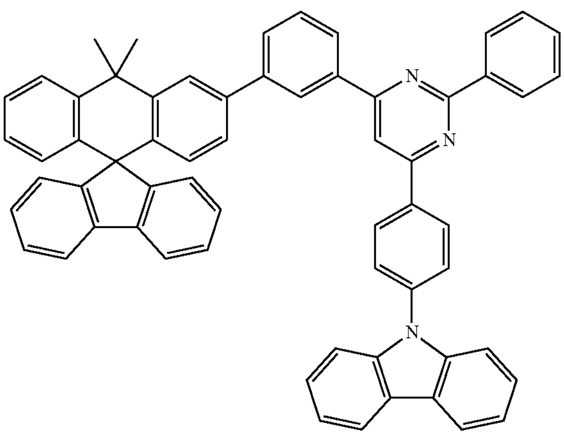
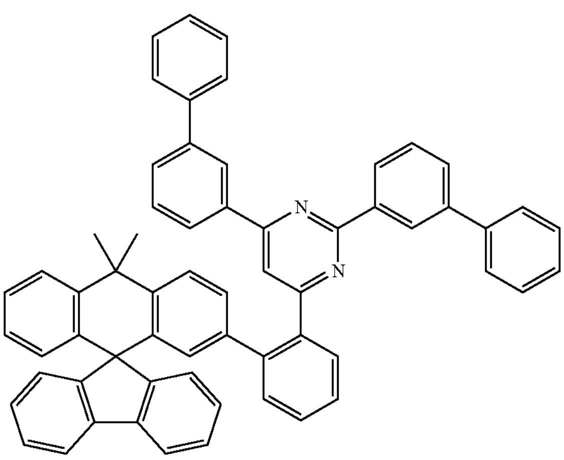
-continued
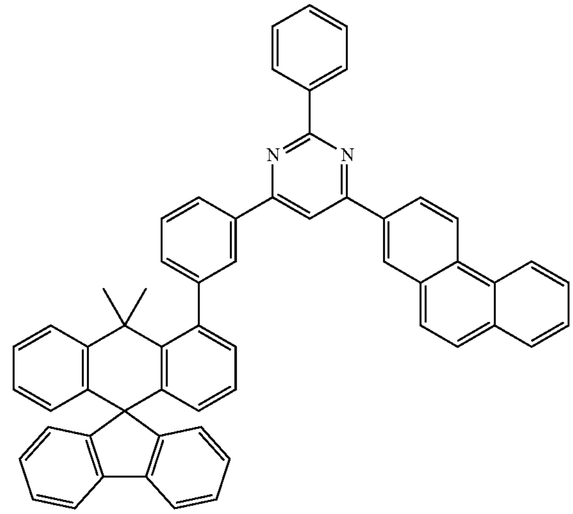
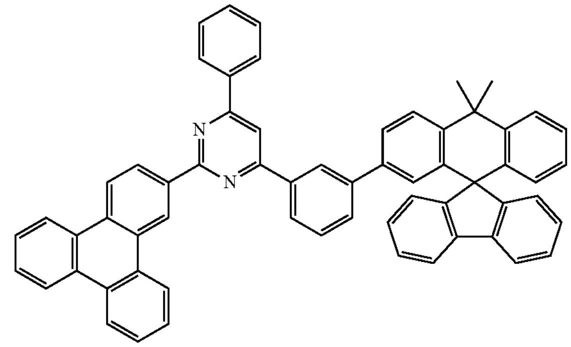
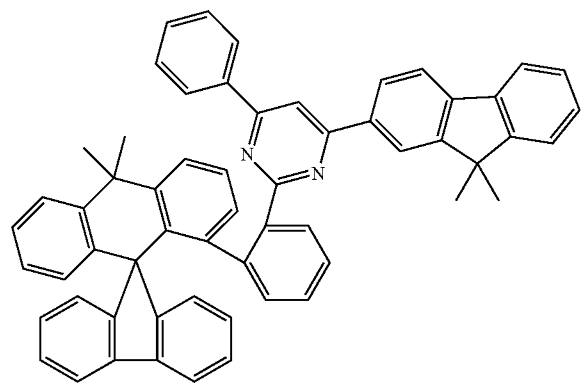
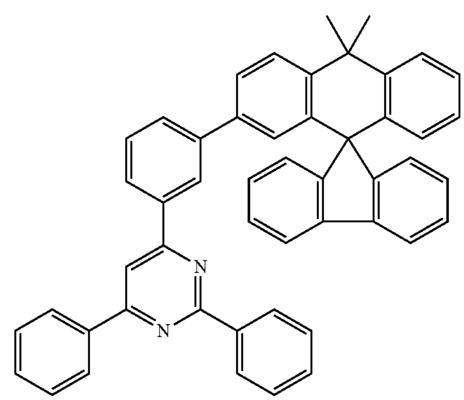

-continued
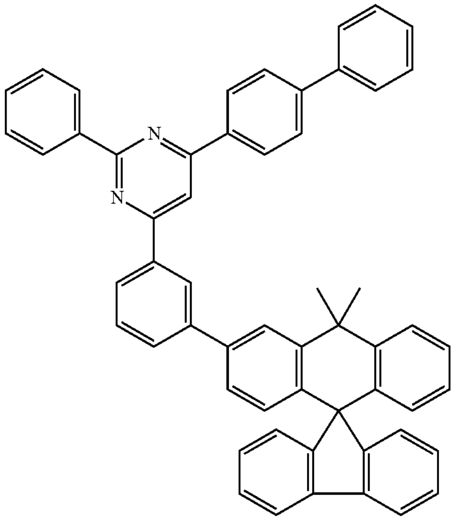
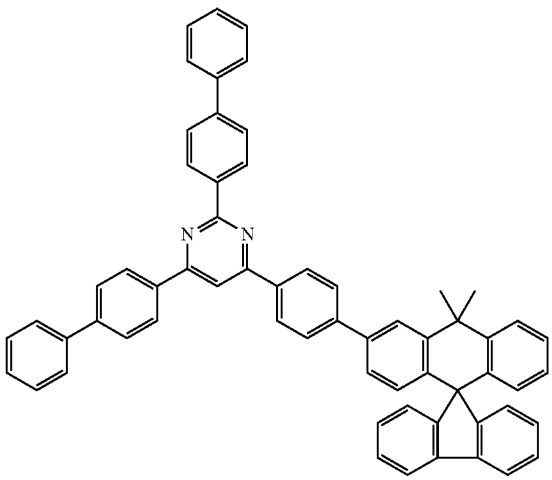
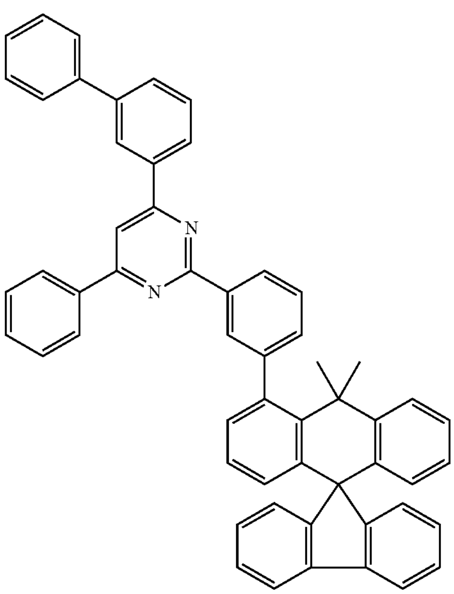
-continued
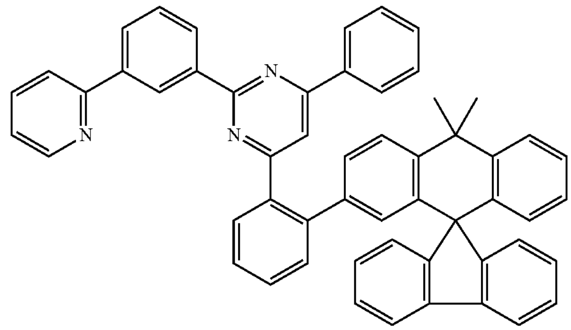
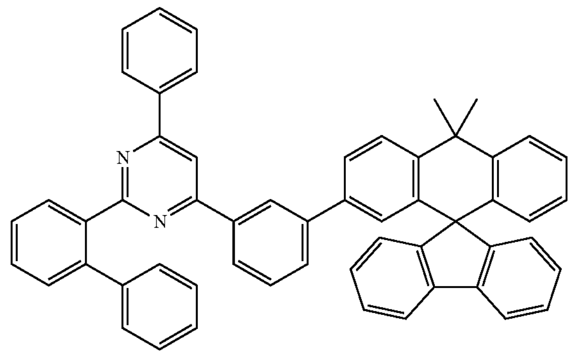
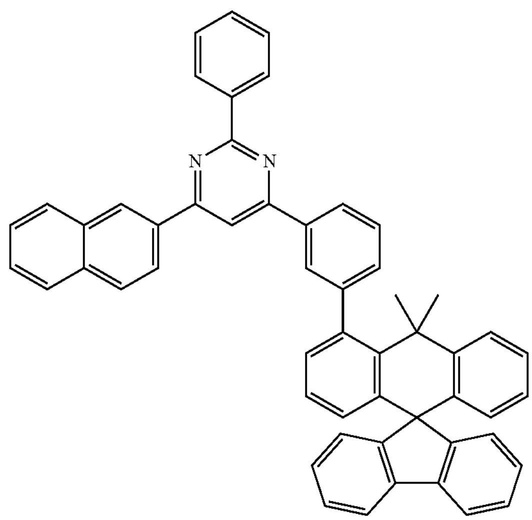
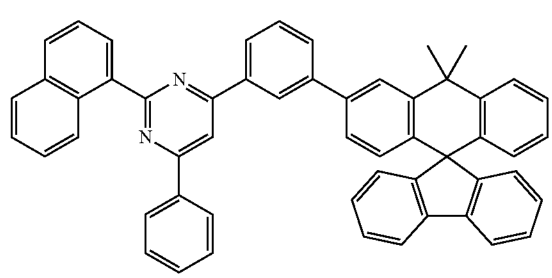

-continued
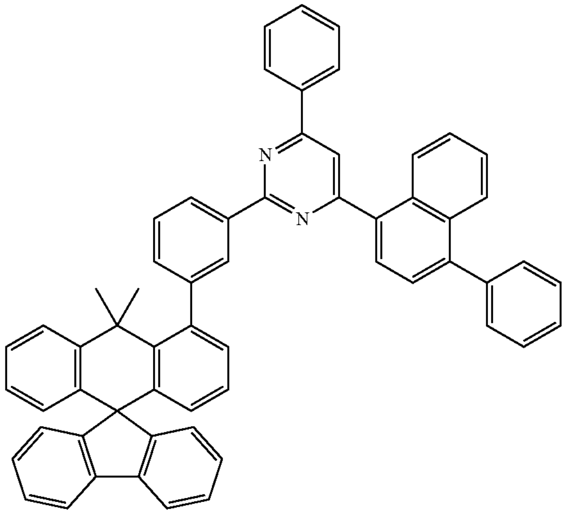
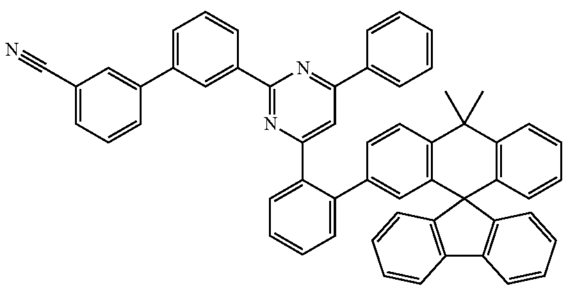
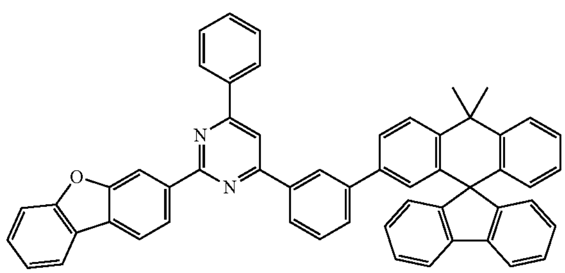
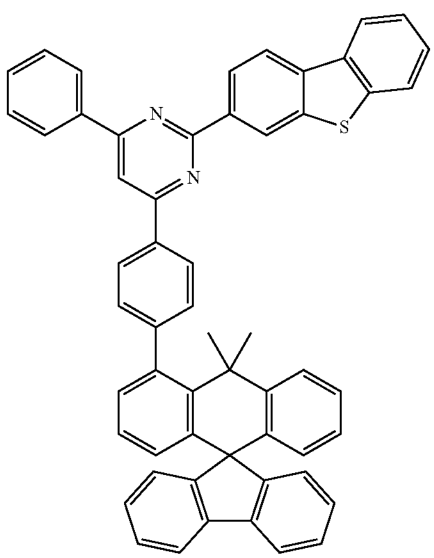
-continued
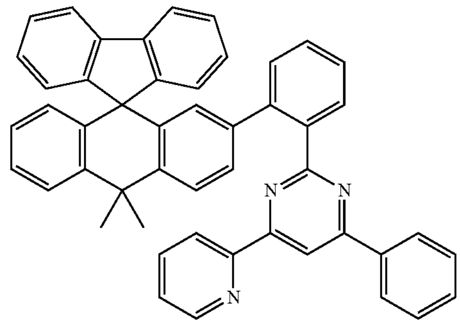
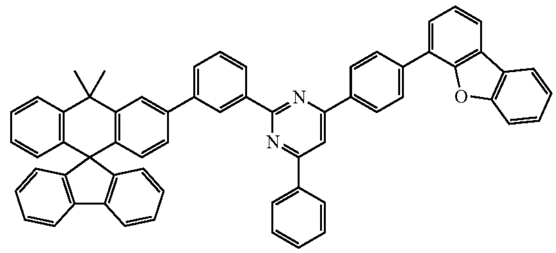
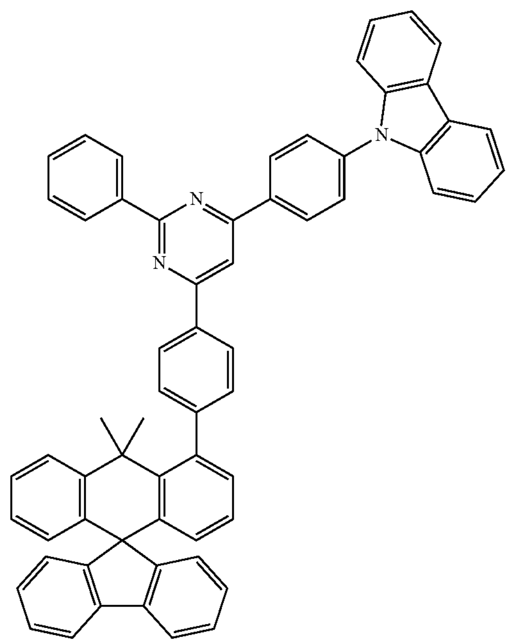
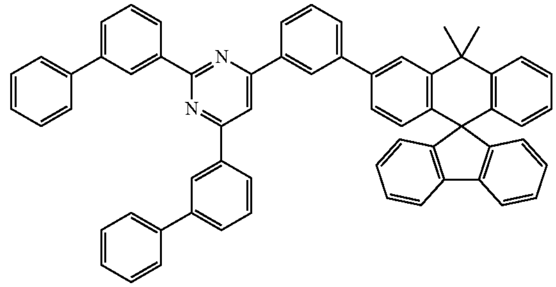

-continued
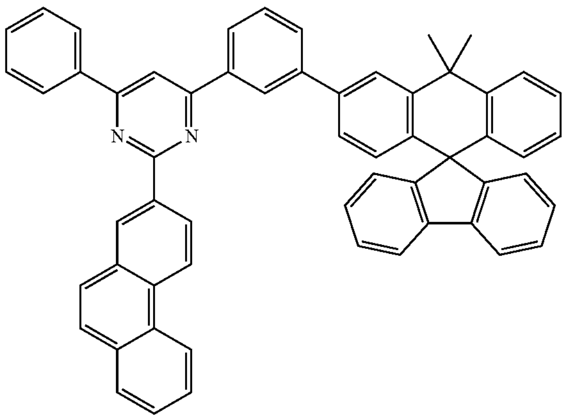
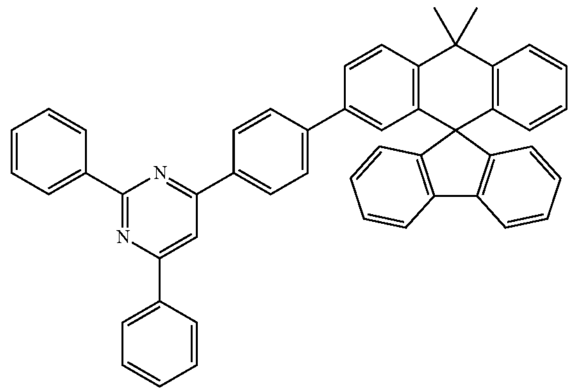
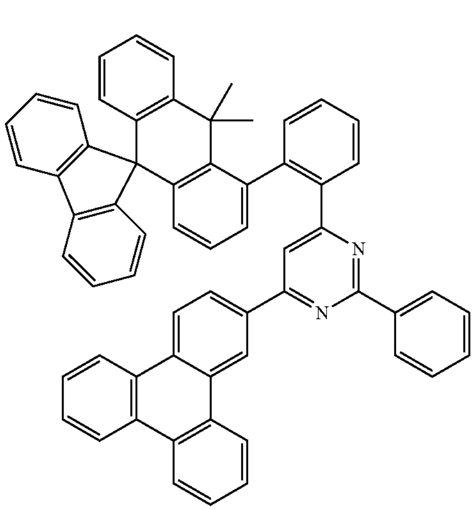
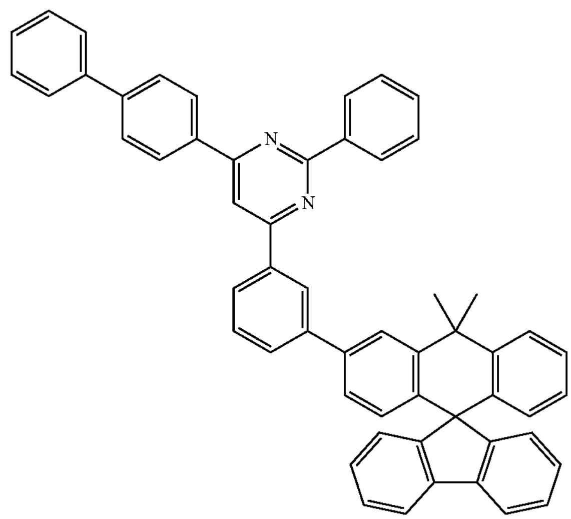
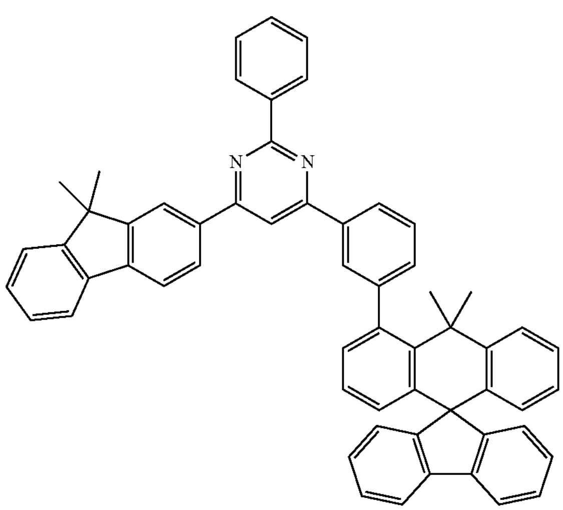
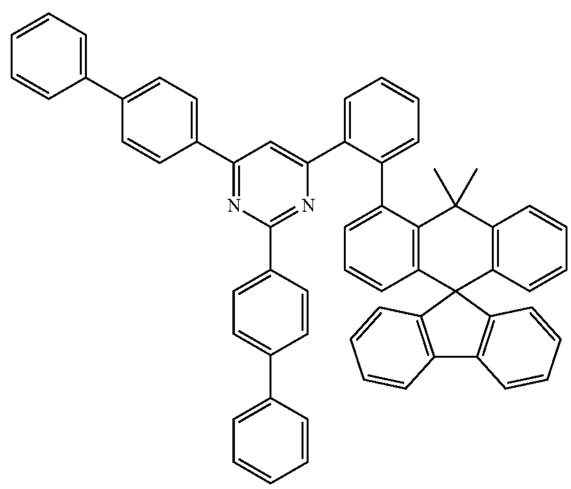
-continued -continued
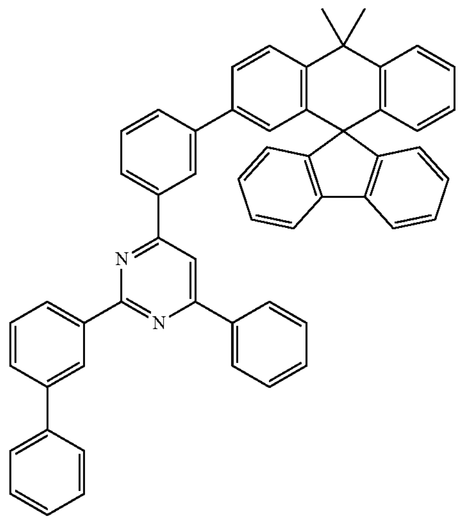
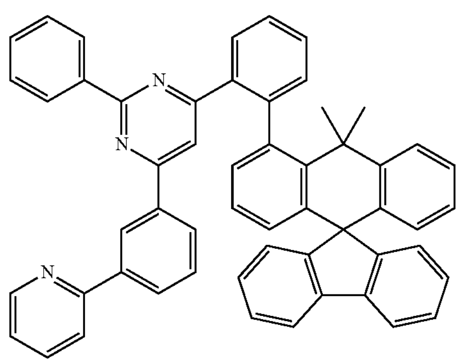
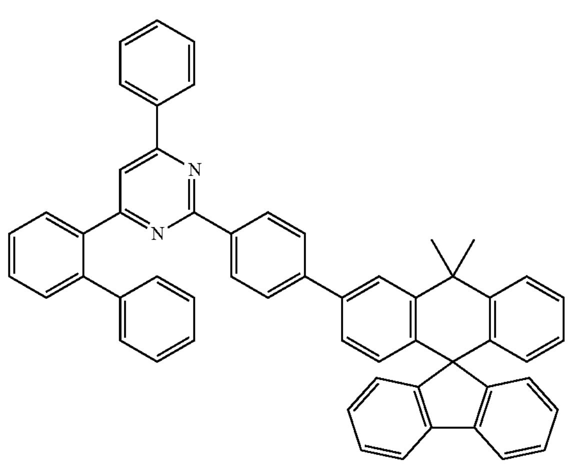
-continued
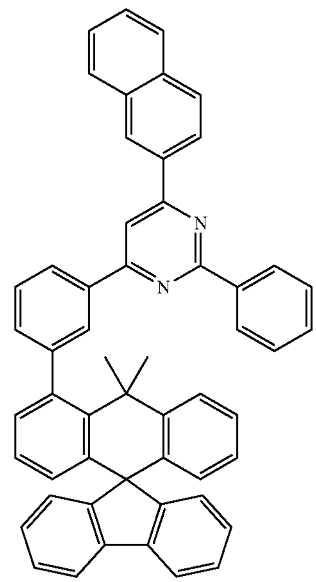
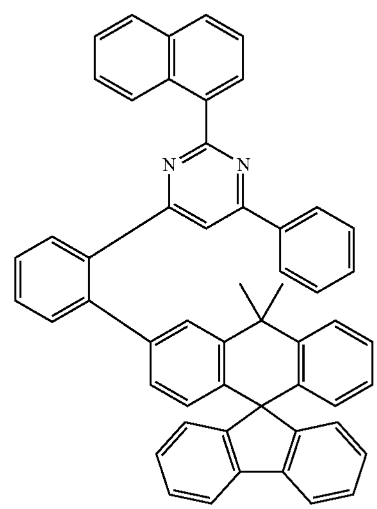
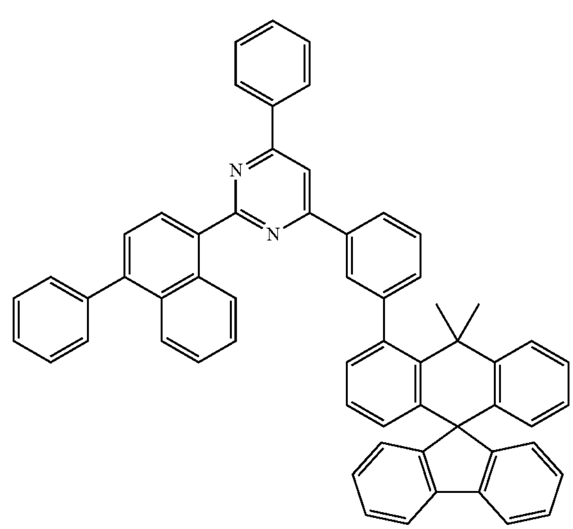

-continued
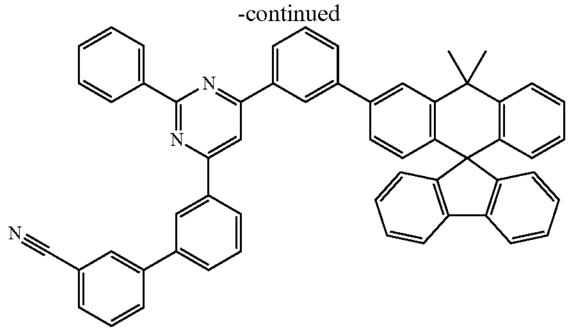
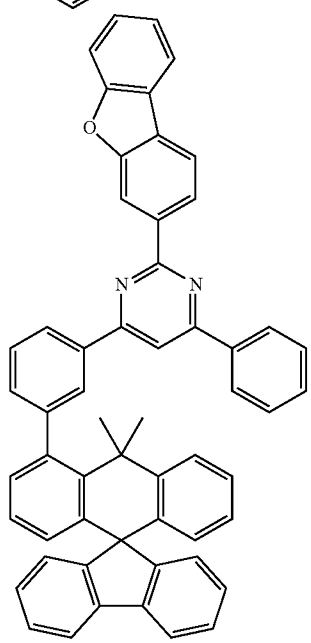
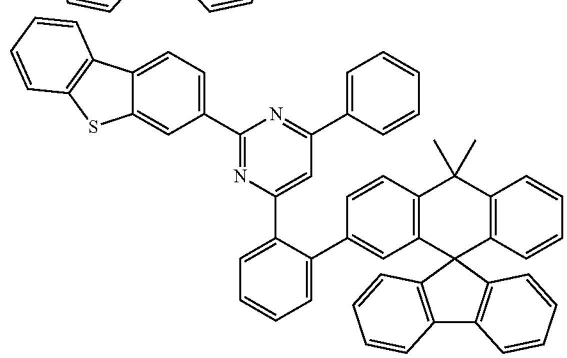
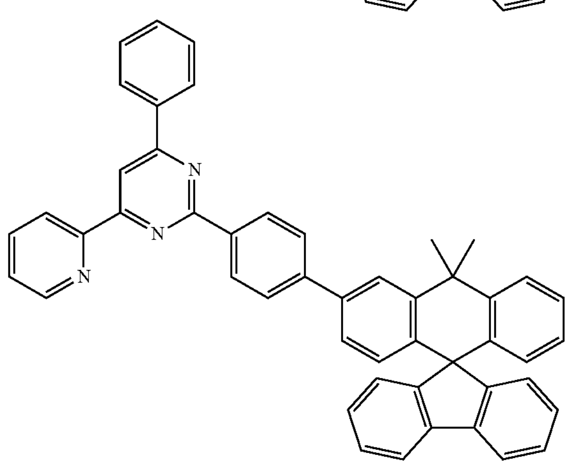
-continued
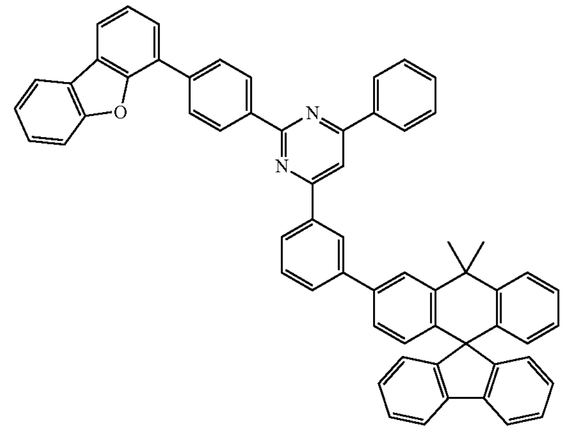
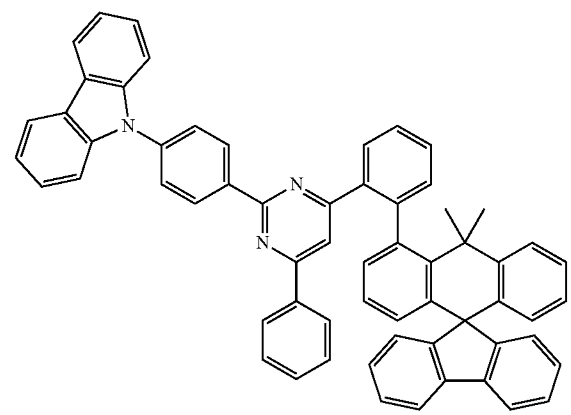
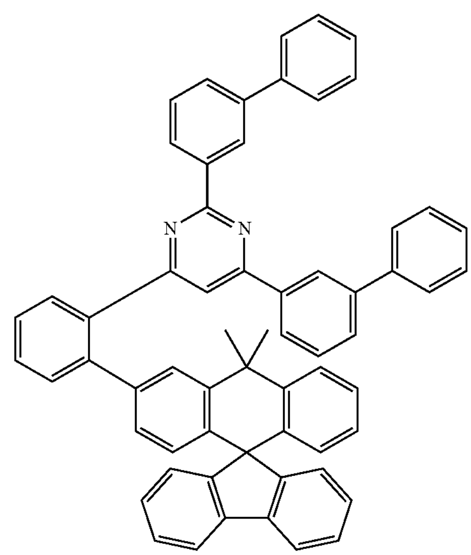

-continued
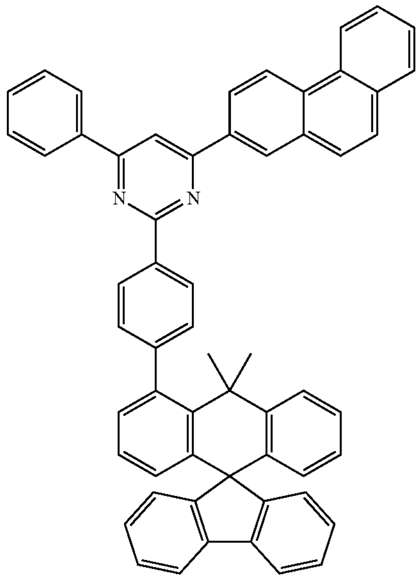
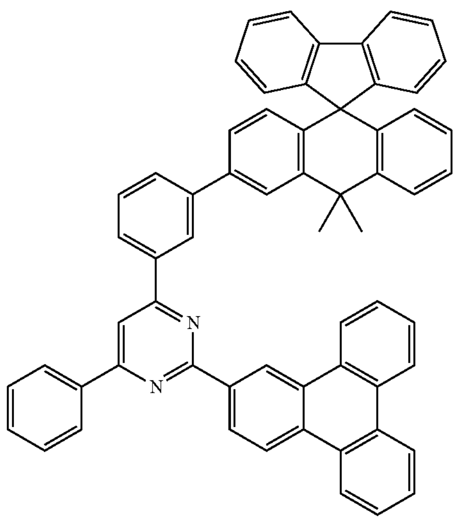
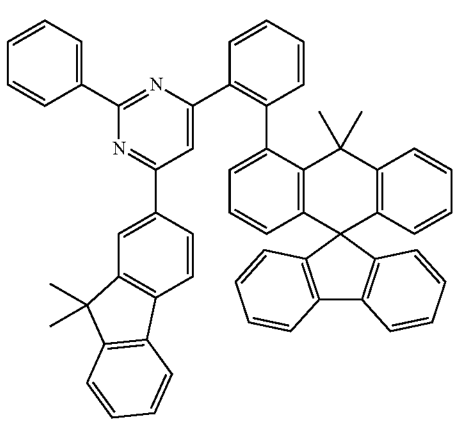
-continued
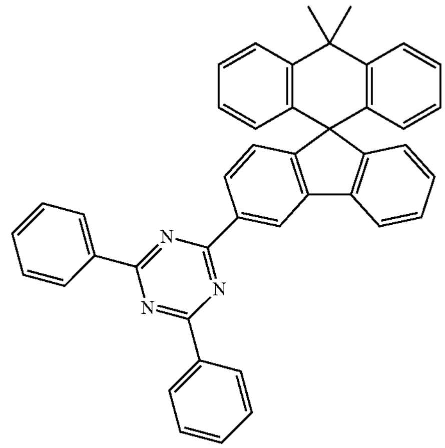
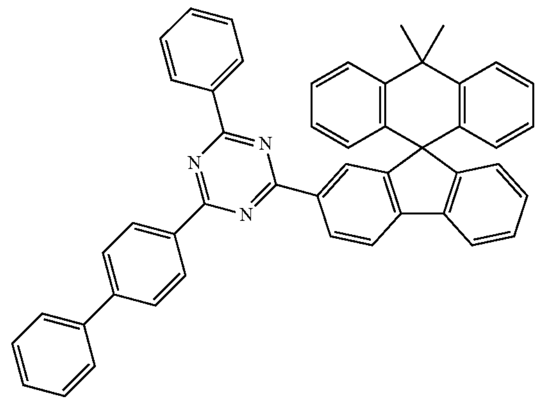
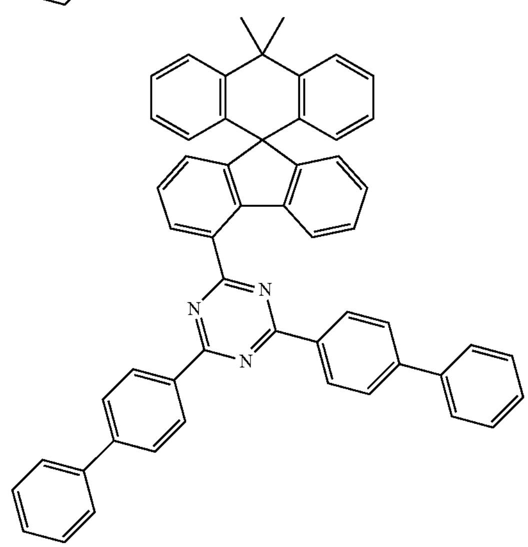
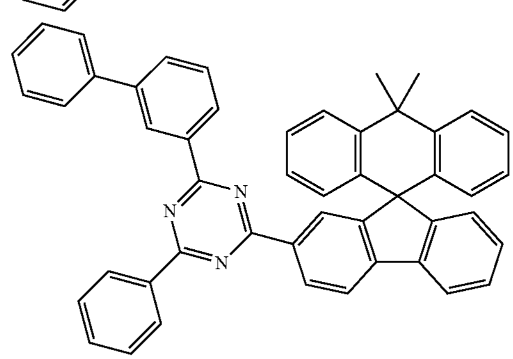

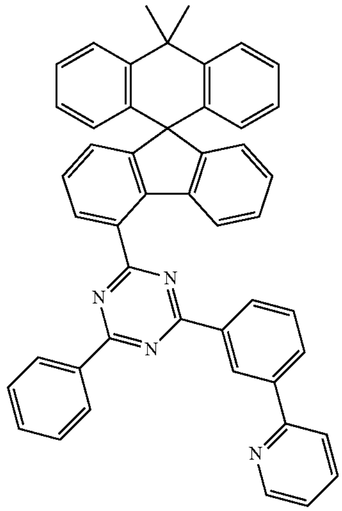
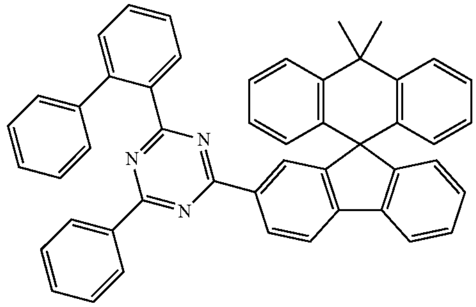
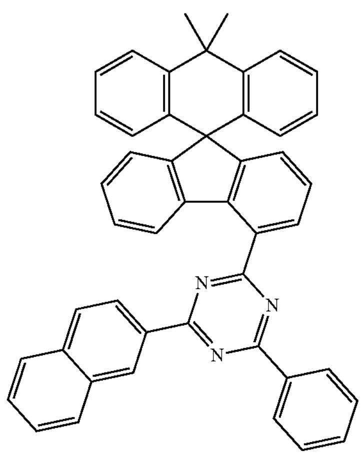
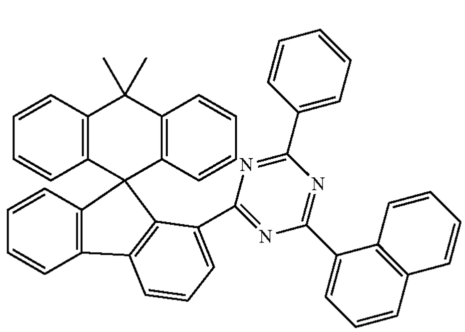
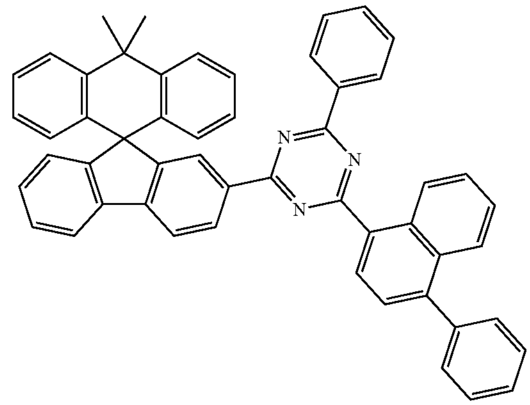
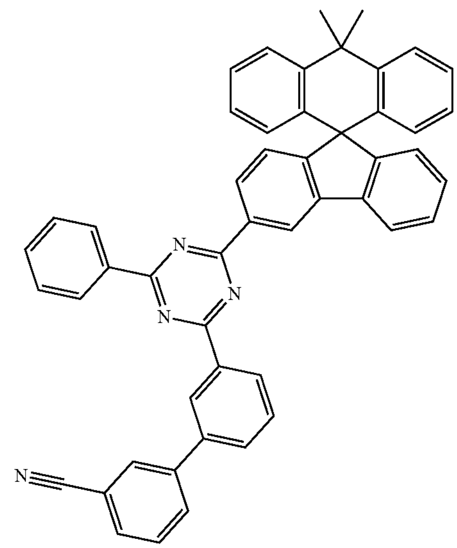
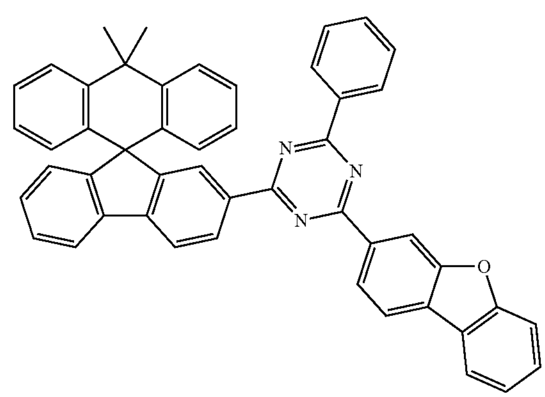

-continued
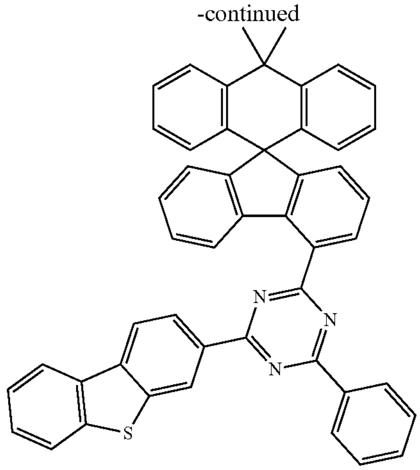
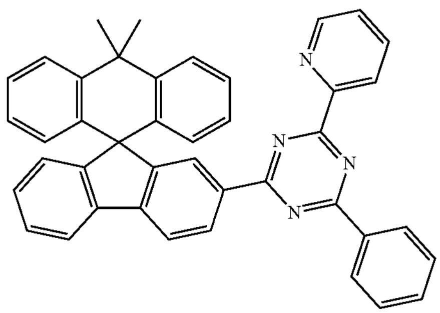
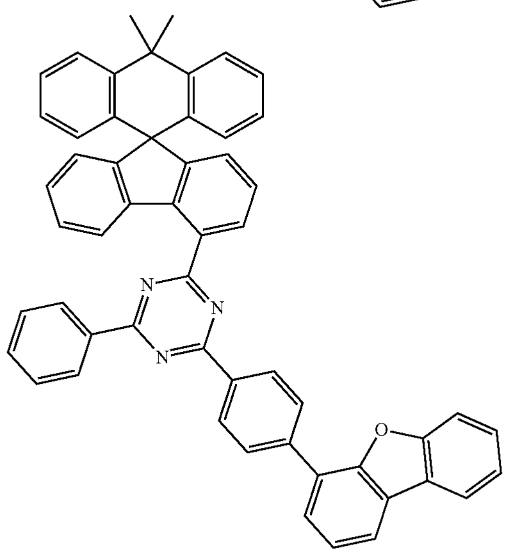
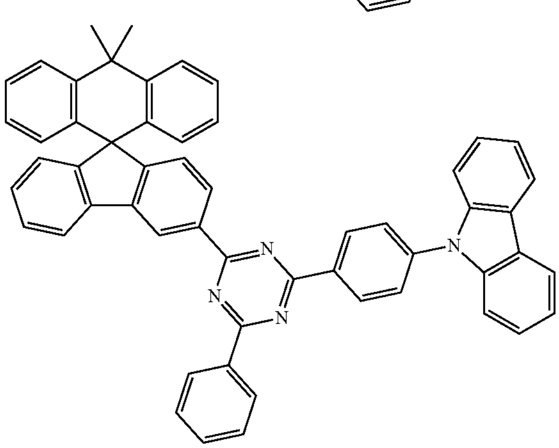
-continued
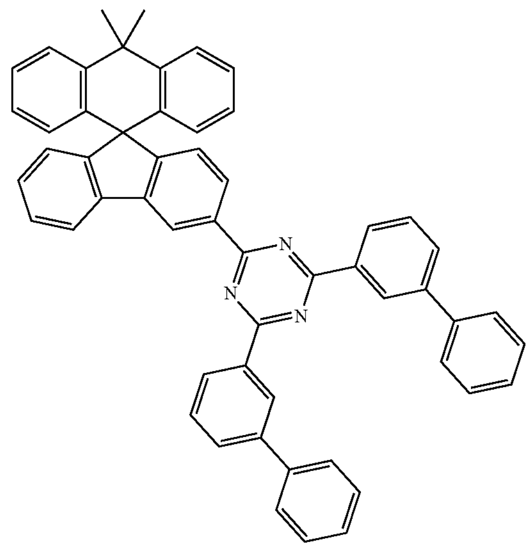
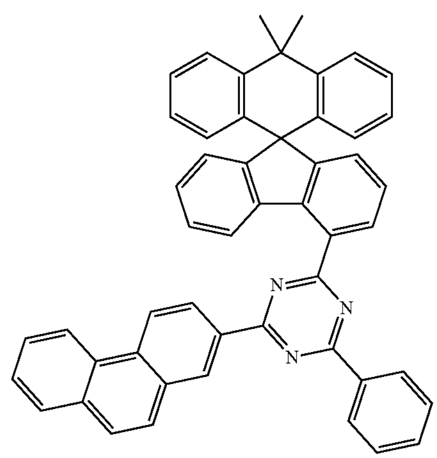
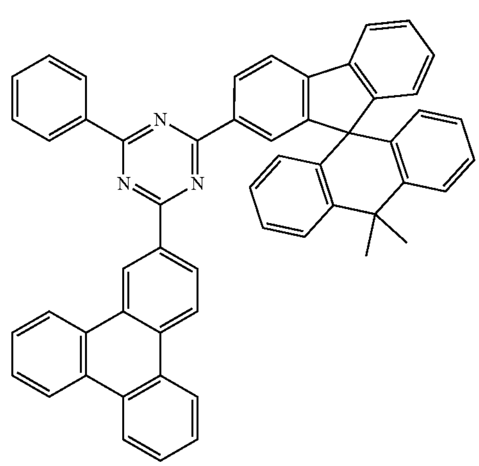

-continued
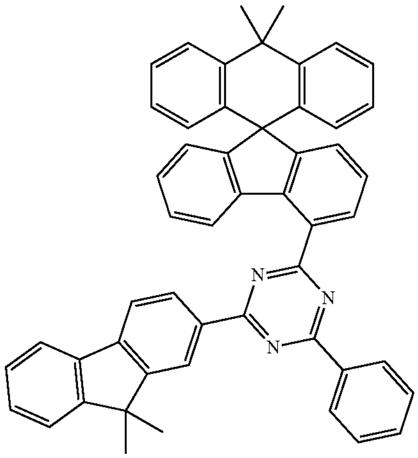
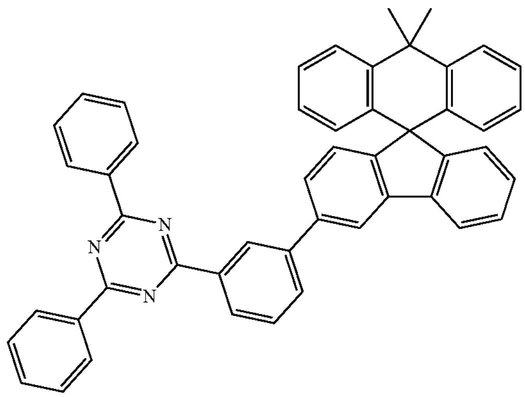
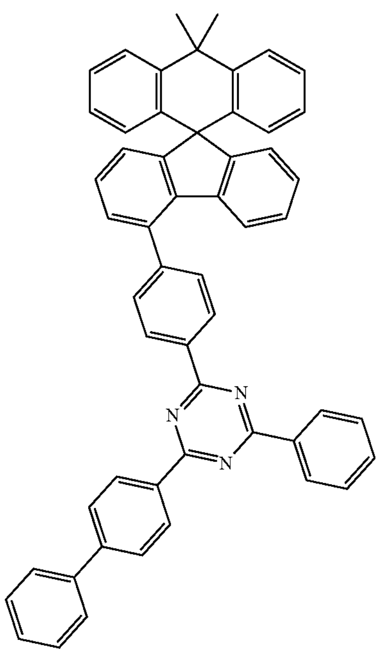
-continued
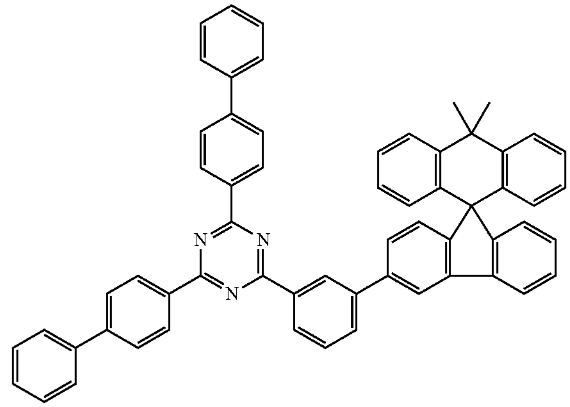
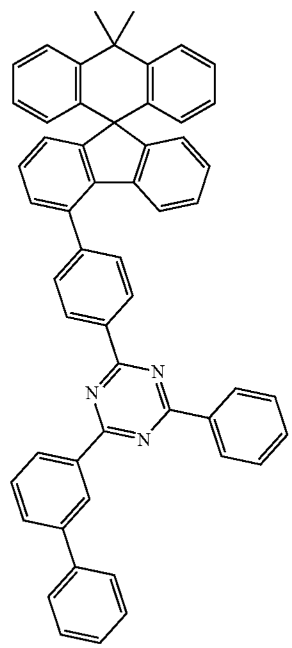
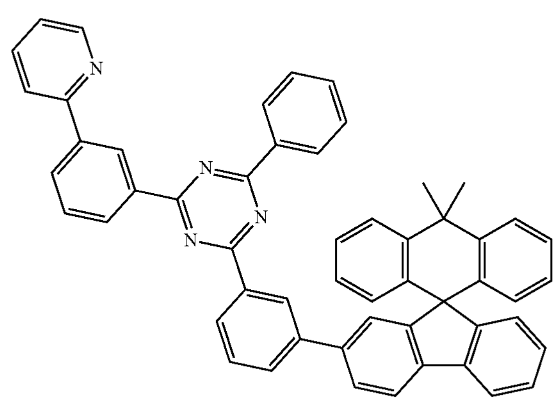

-continued
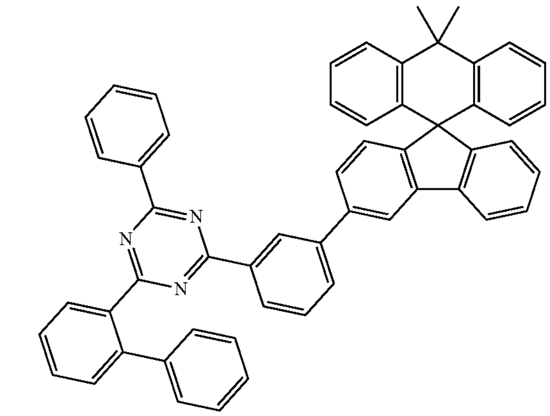
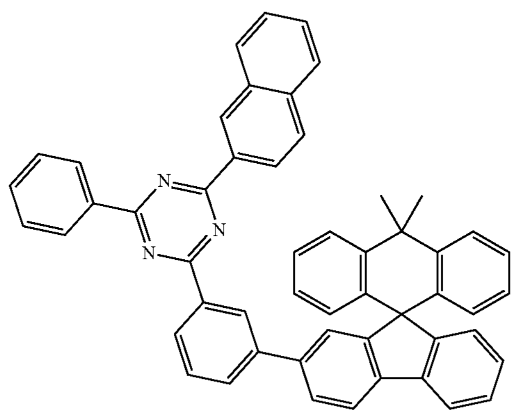
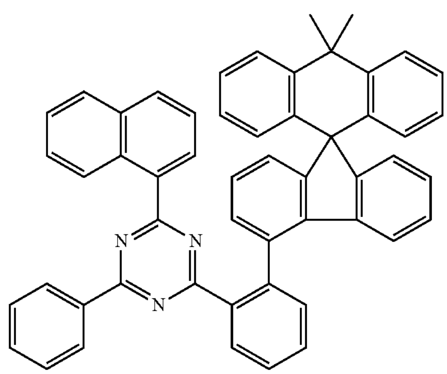
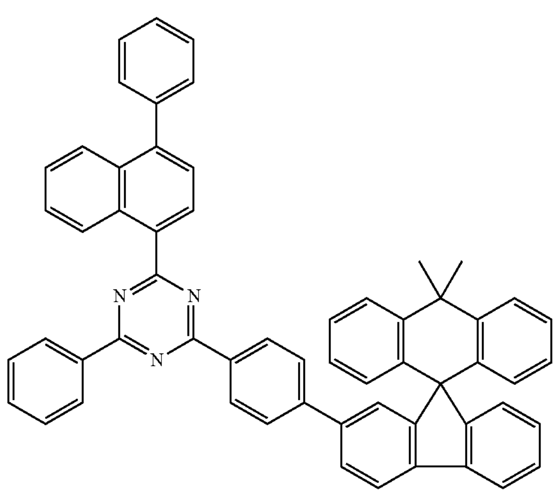
-continued
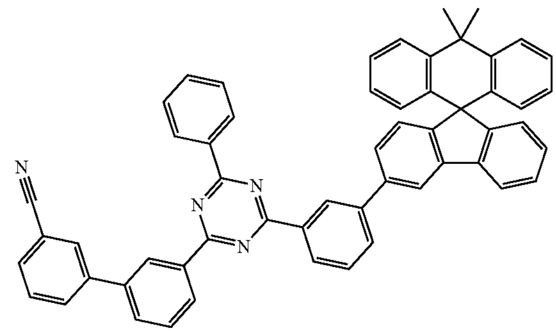
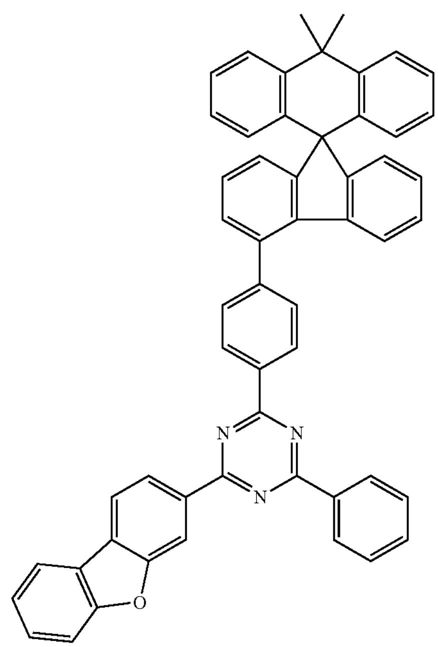
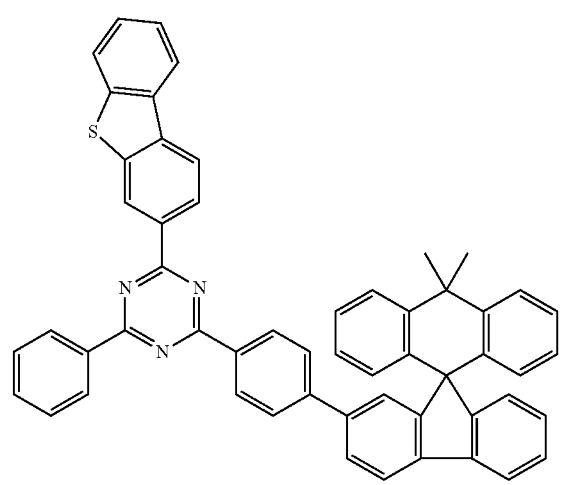

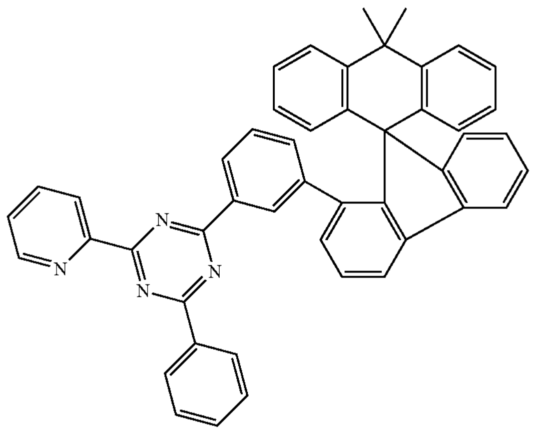
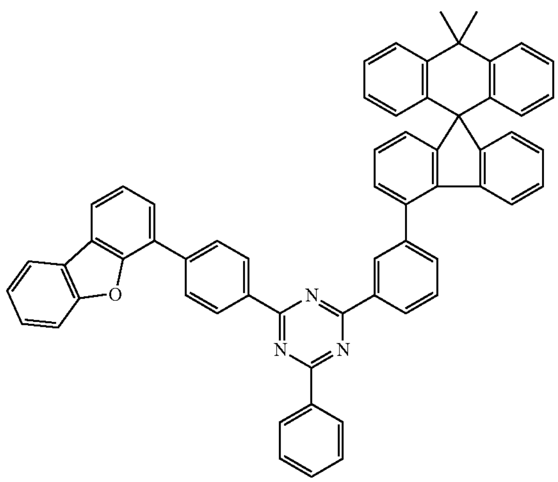
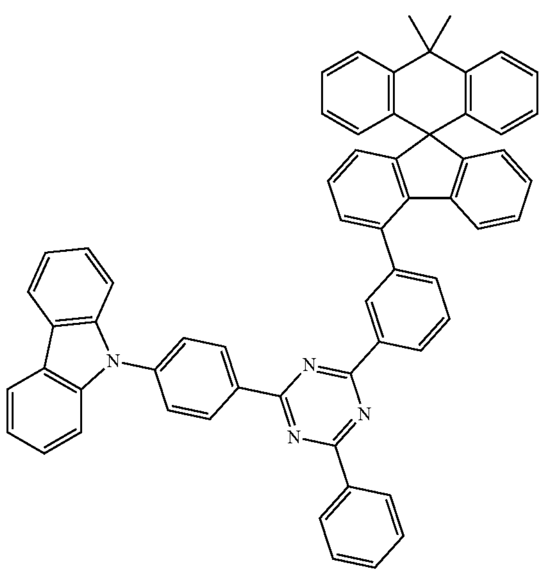
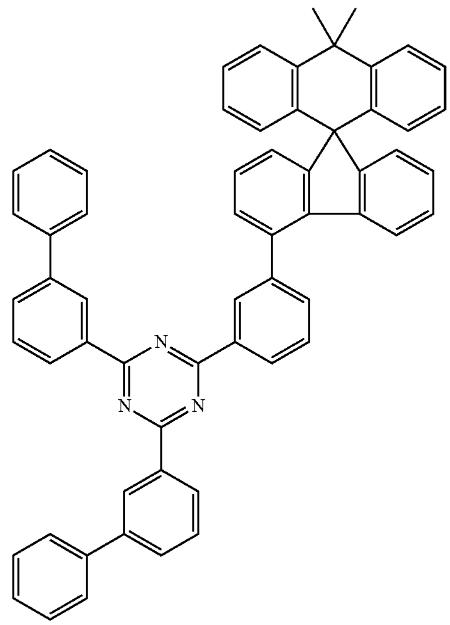
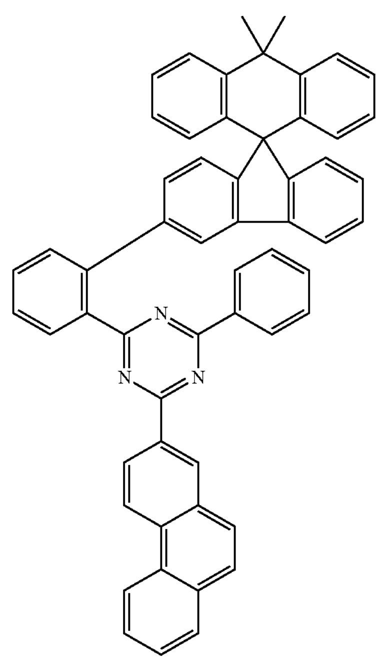

-continued
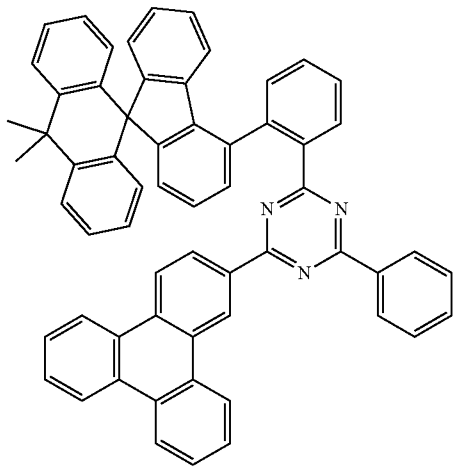
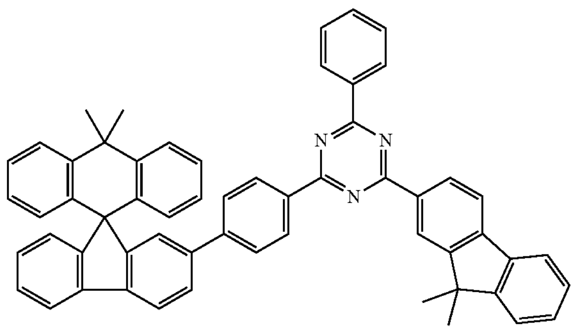
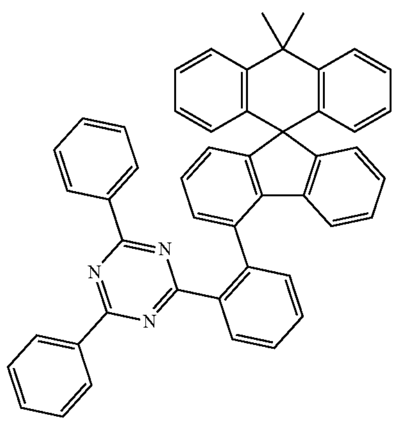
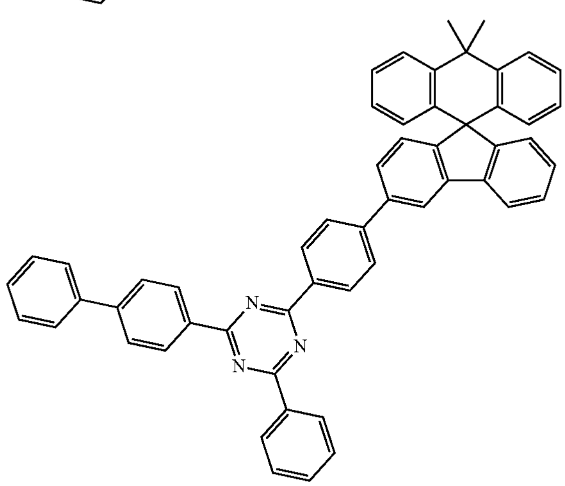
-continued
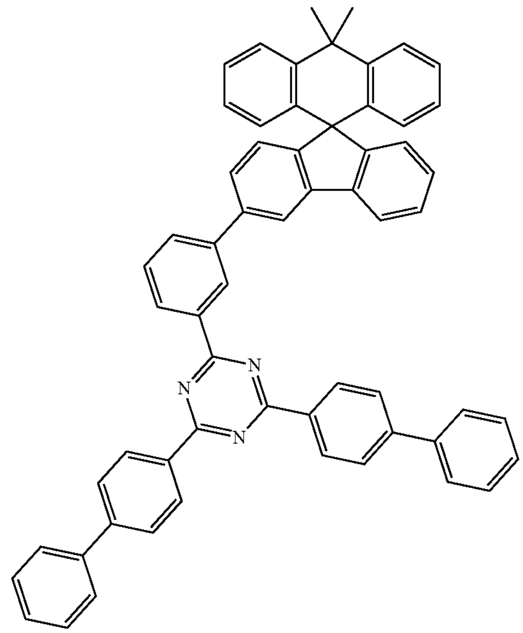
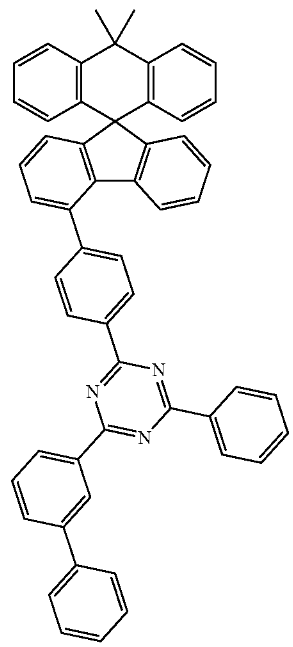
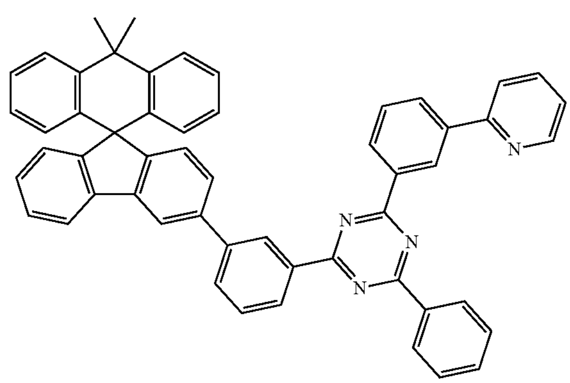

-continued
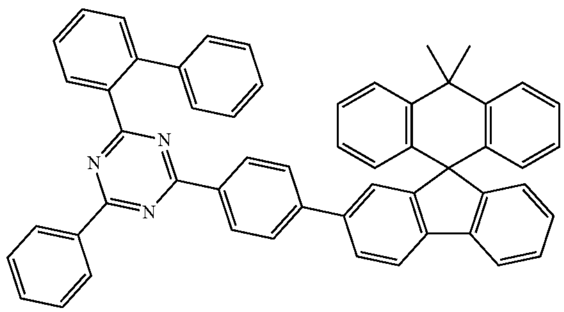
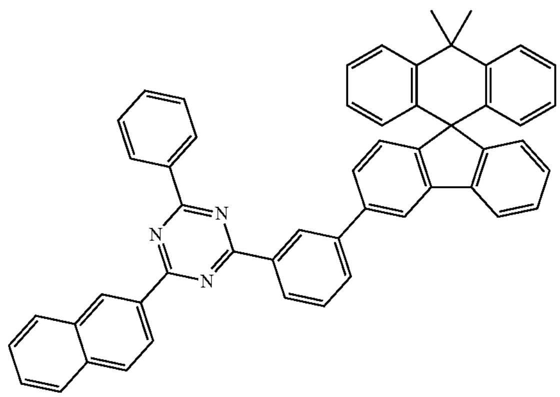
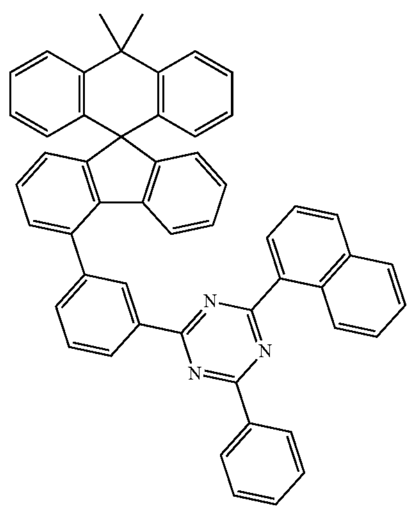
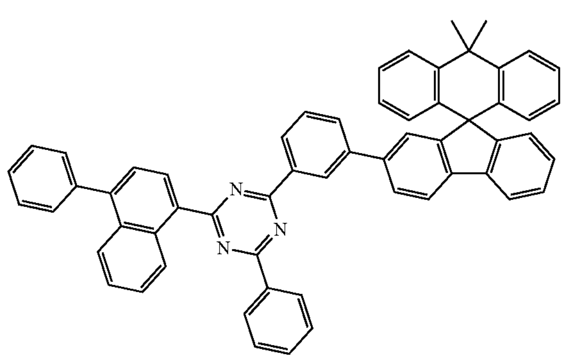
-continued
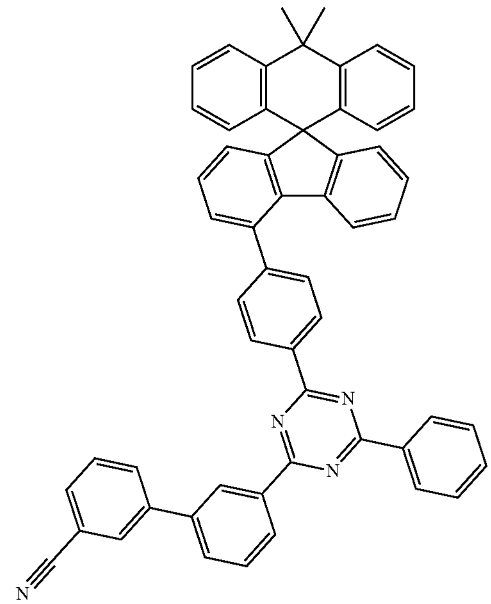
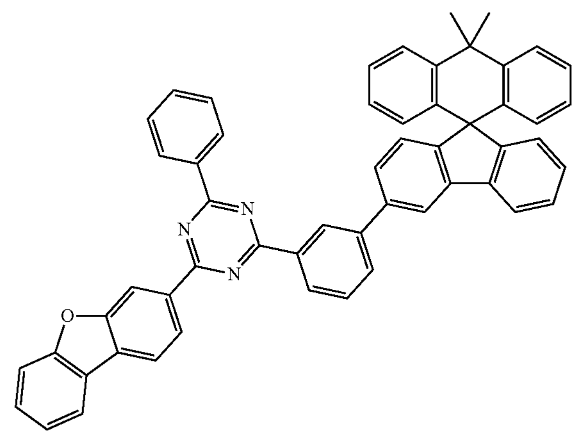
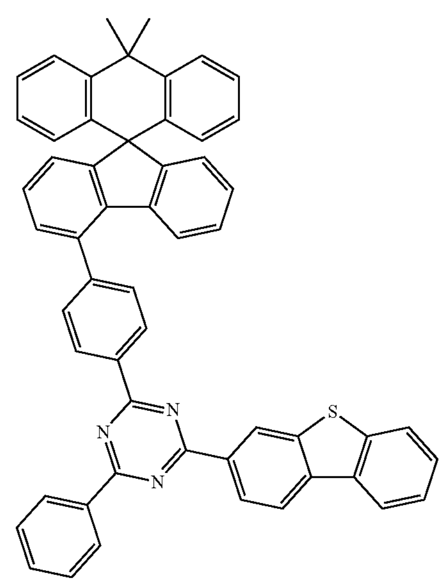

-continued
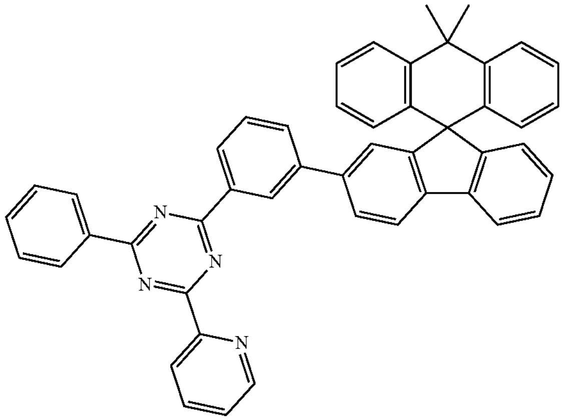
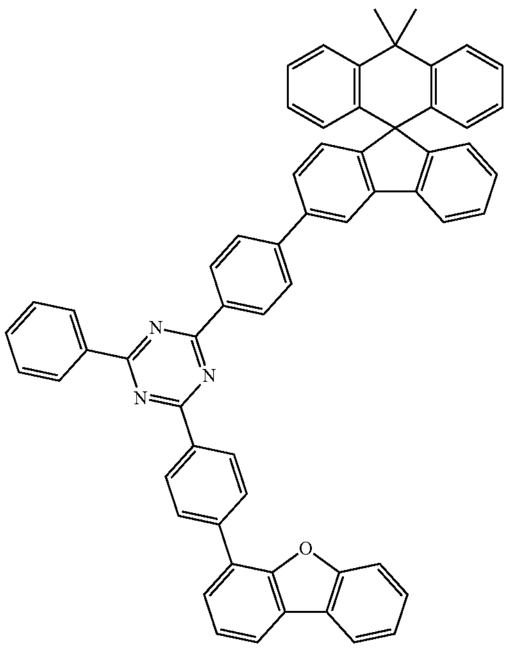
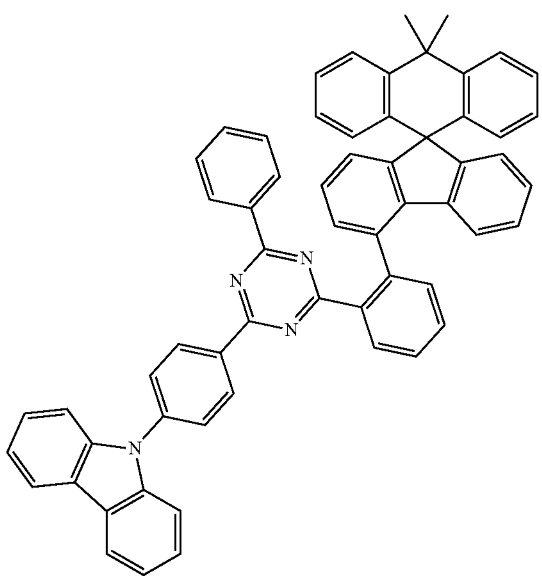
-continued
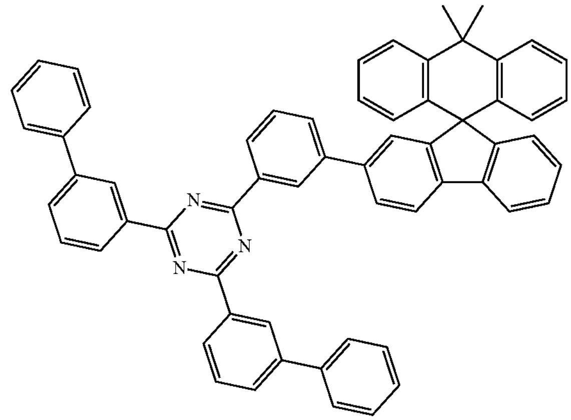
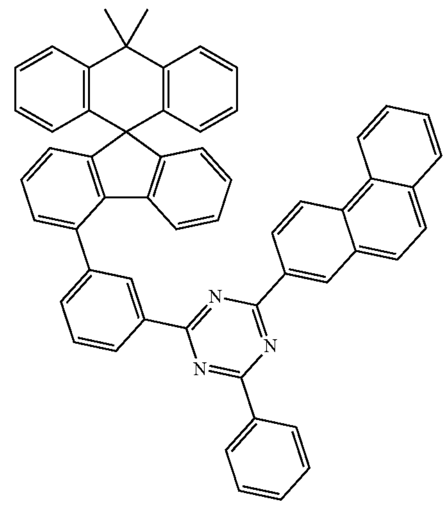
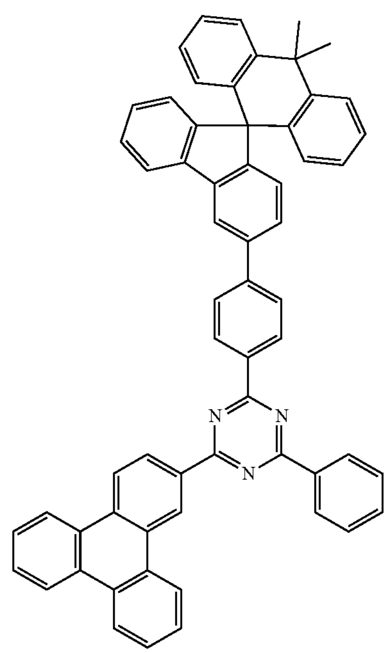

-continued
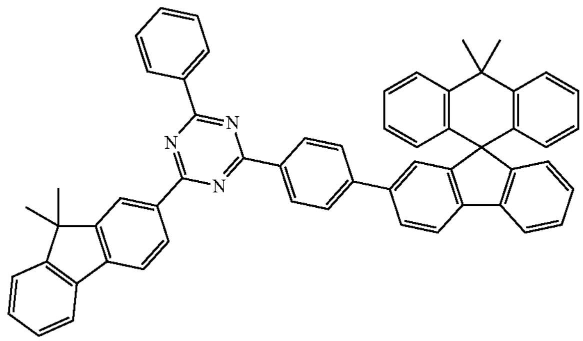
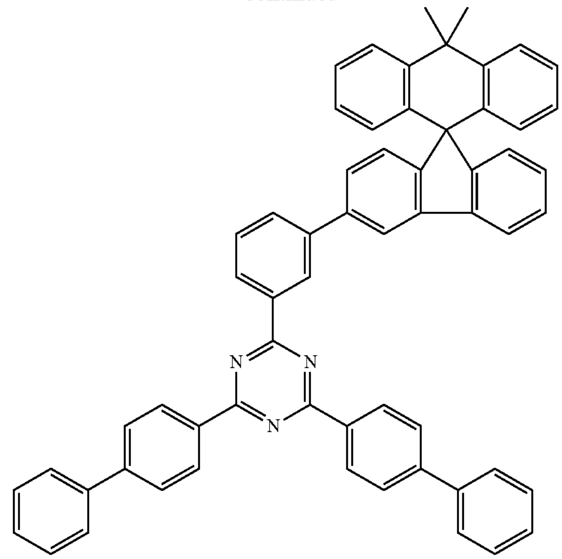
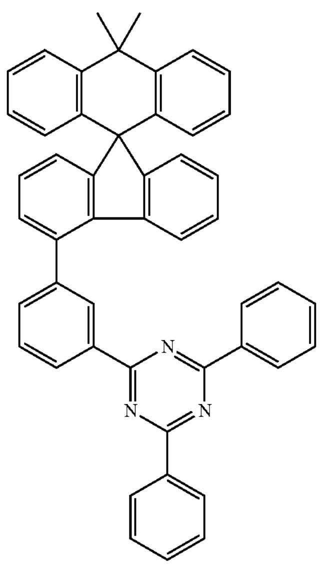
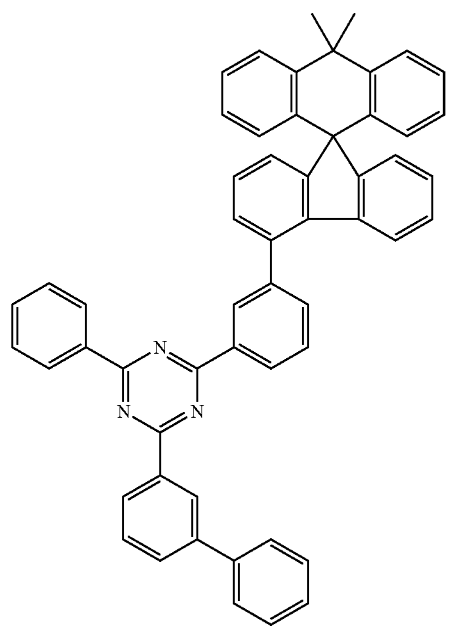
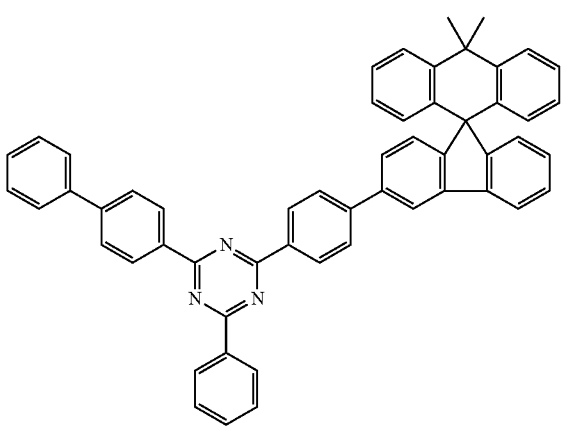
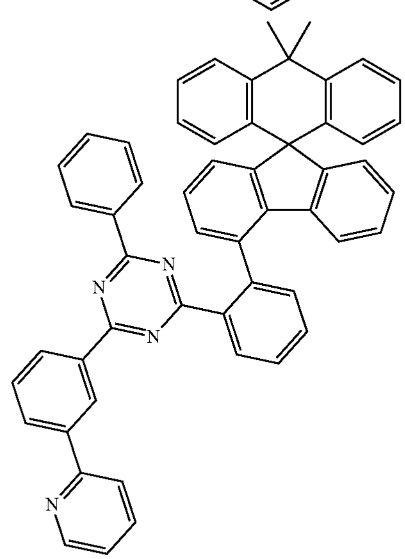
-continued -continued
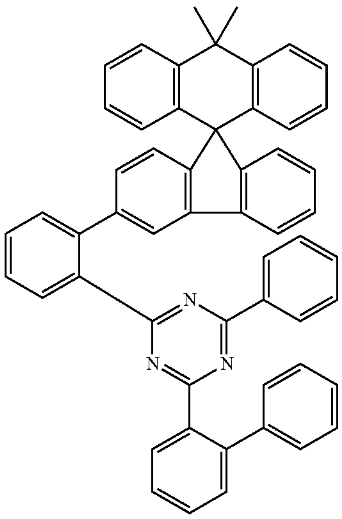
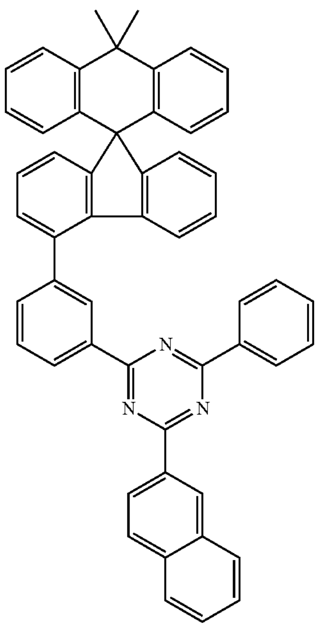
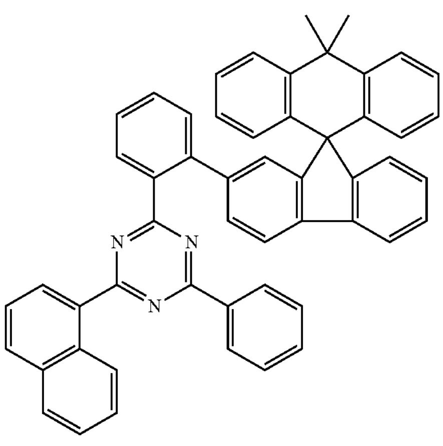
-continued
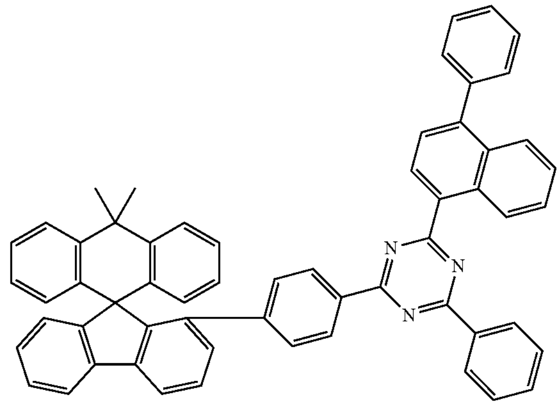
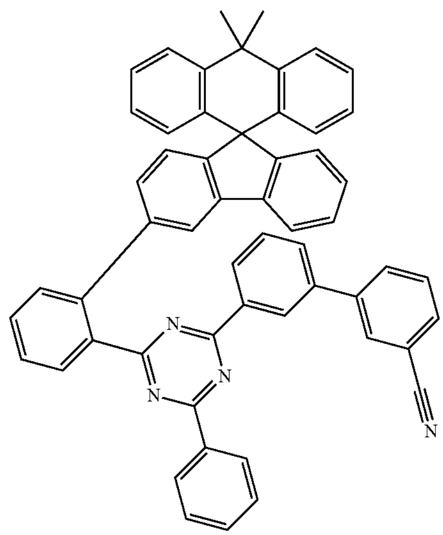
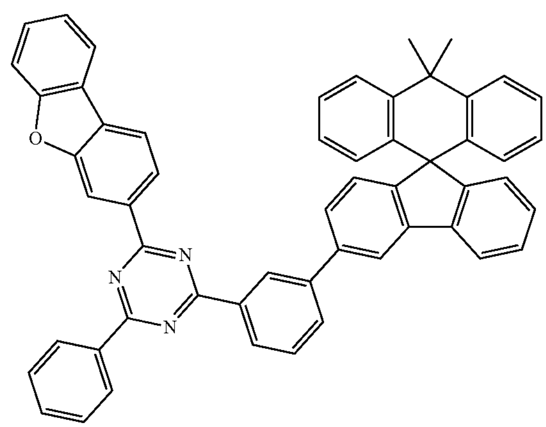

-continued
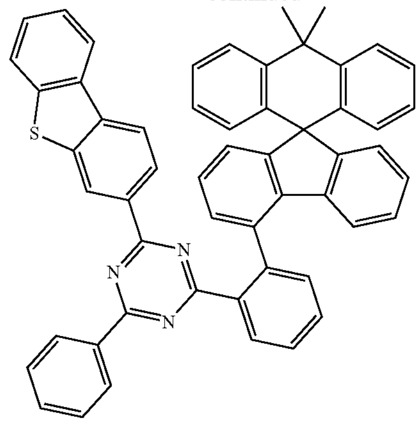
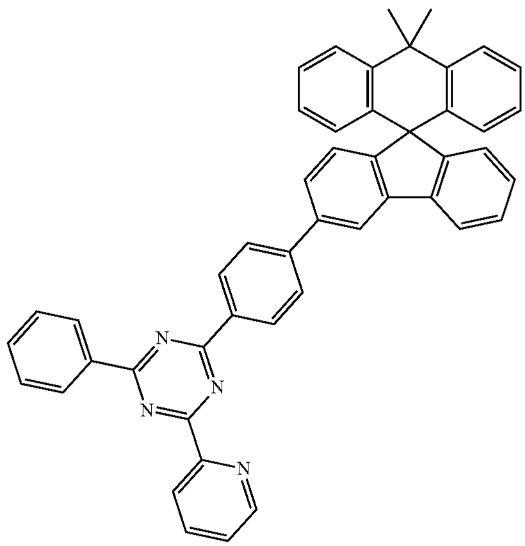
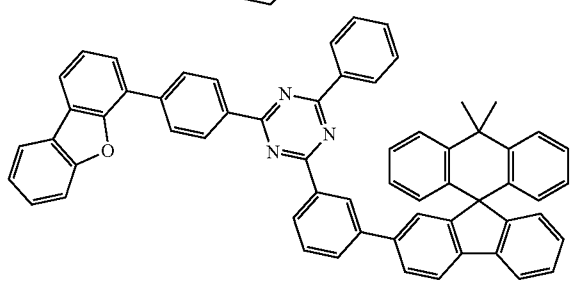
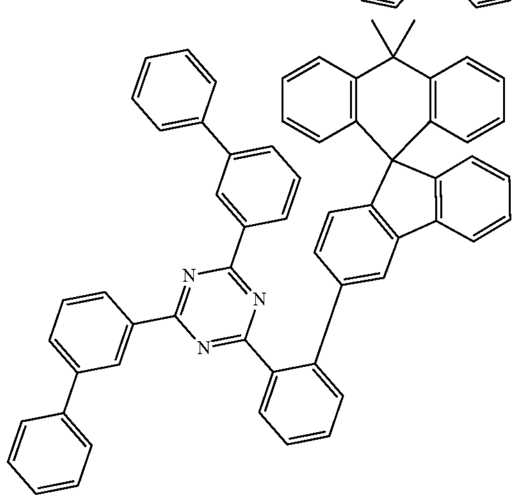
-continued
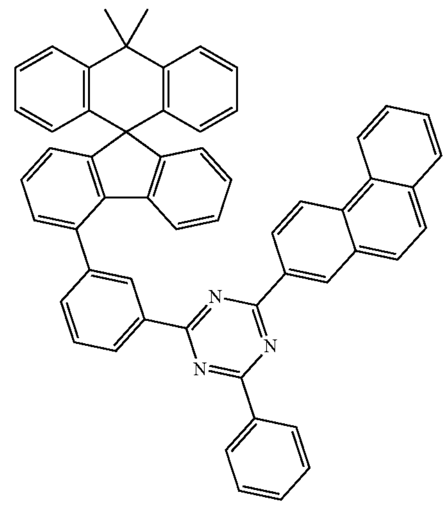
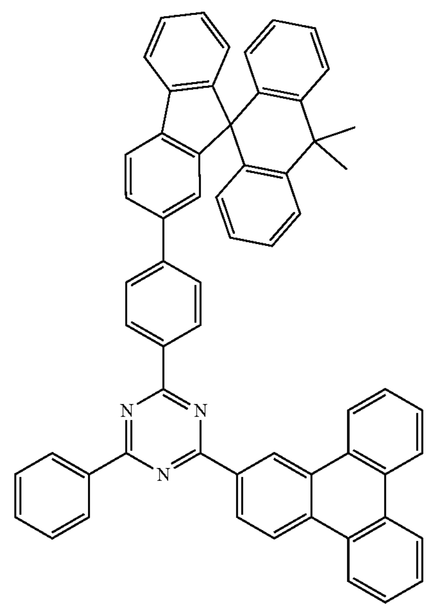
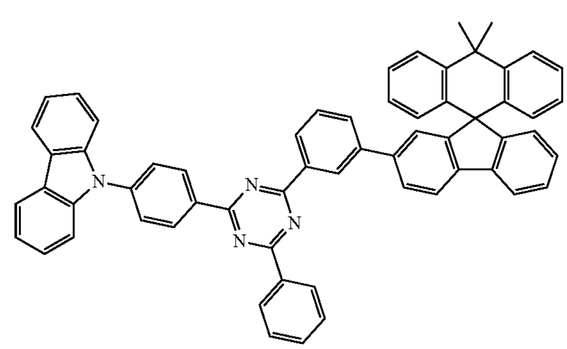

-continued
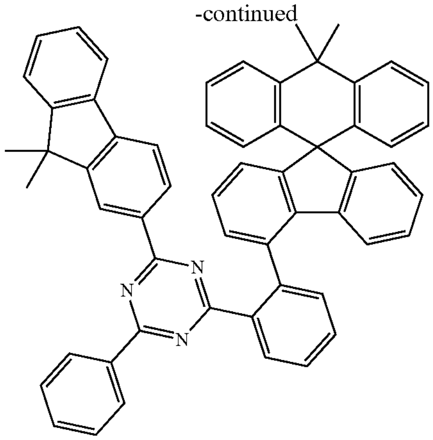
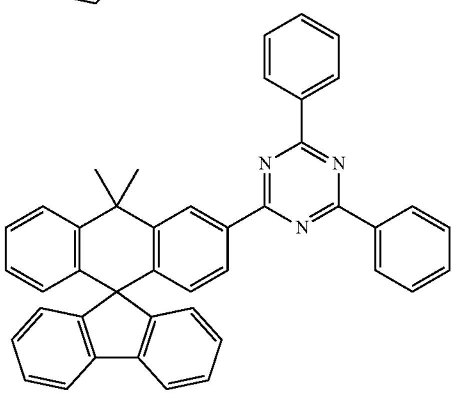
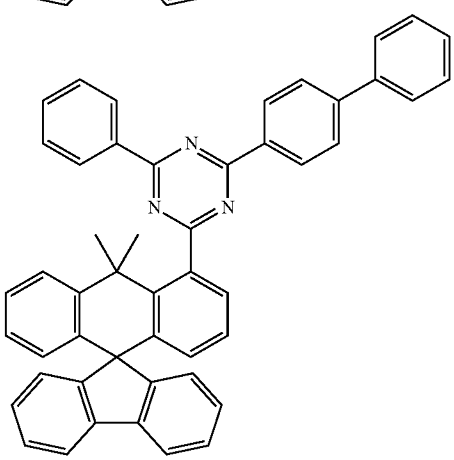
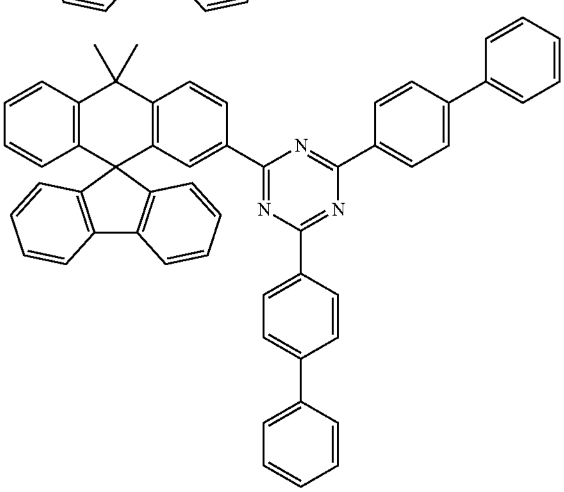
-continued
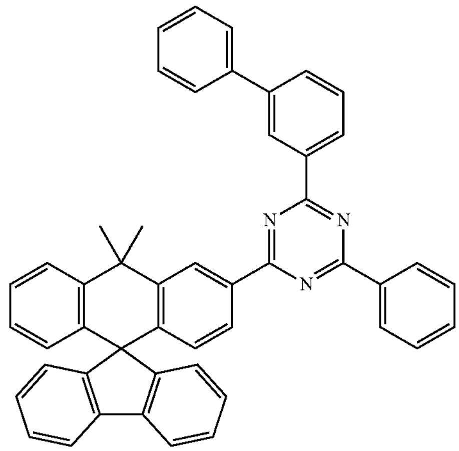
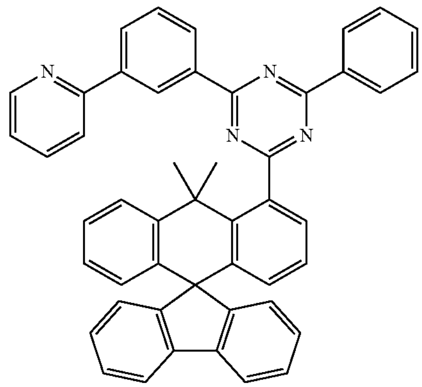
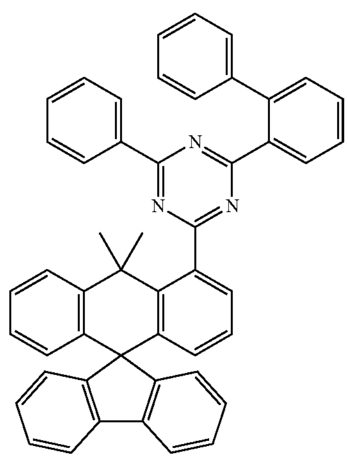
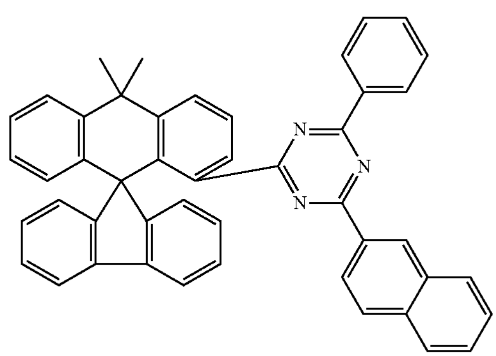

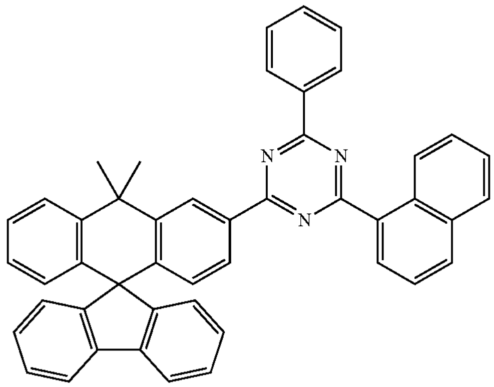
N
N
N
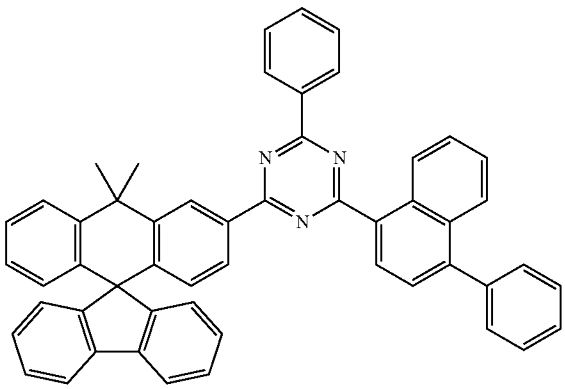
N
N
N
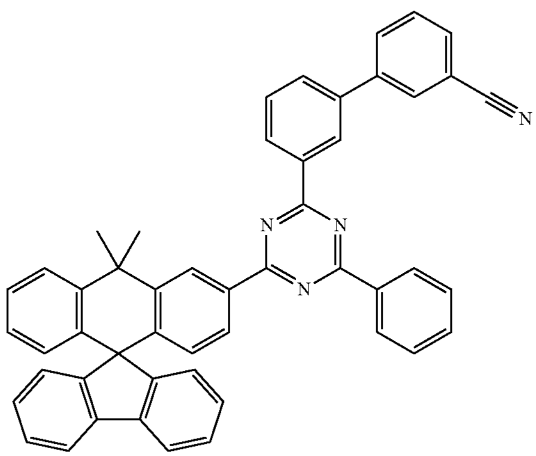
N
N
N
N
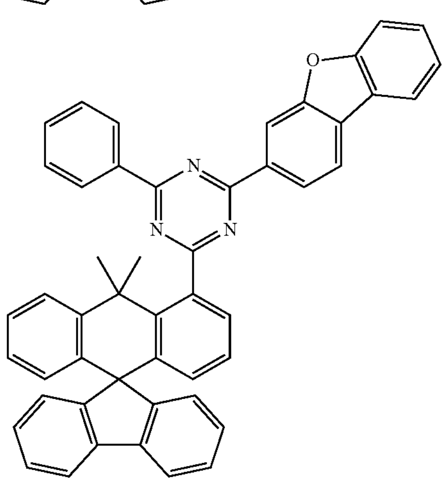
O
N
N
N
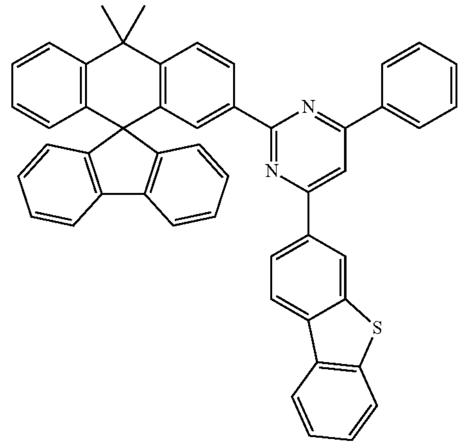
N
N
S
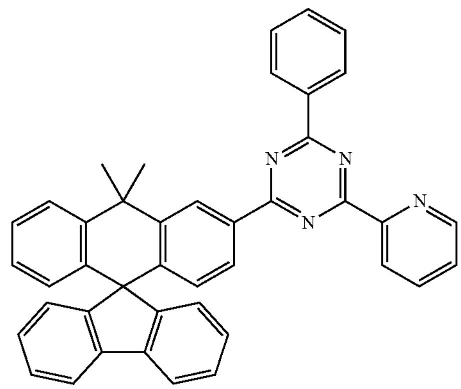
N
N
N
N
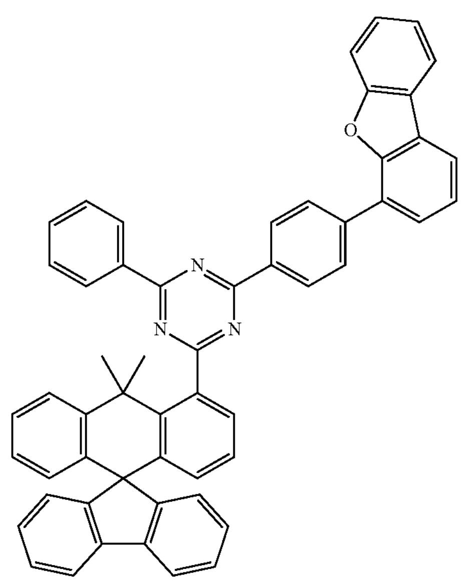
O
N
N
N -continued
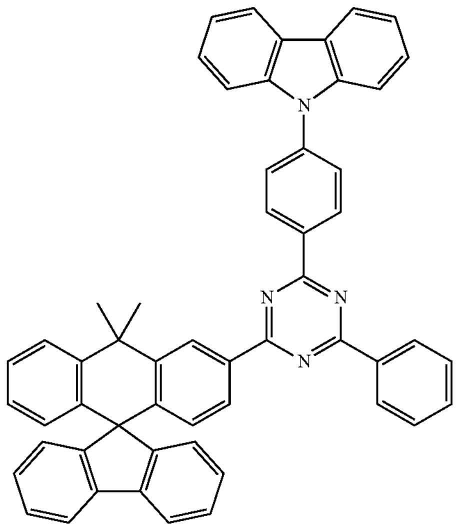
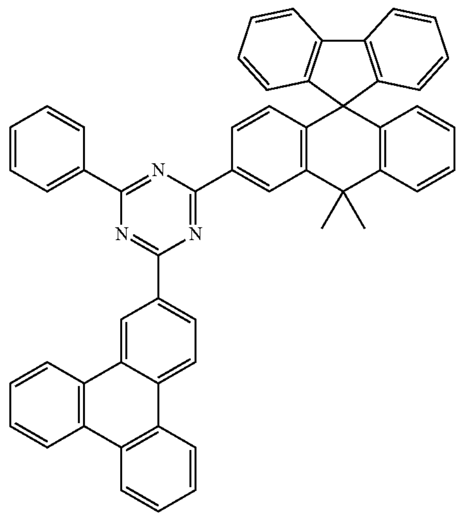
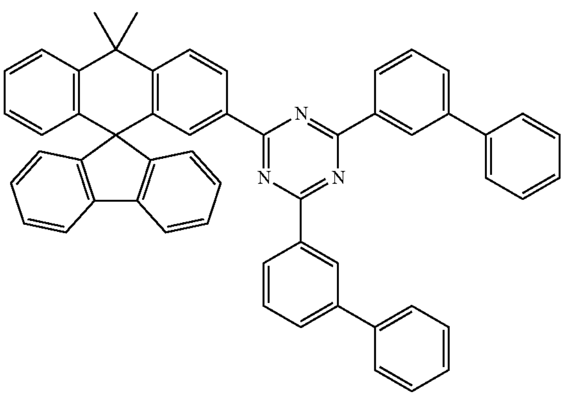
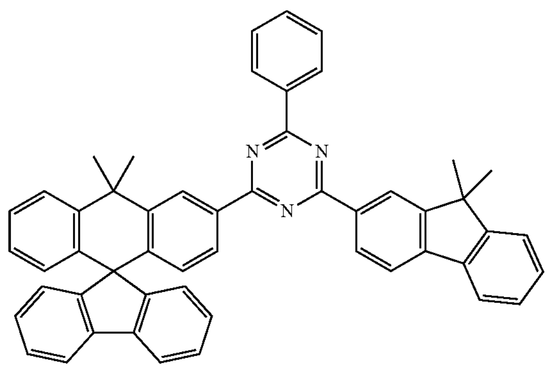
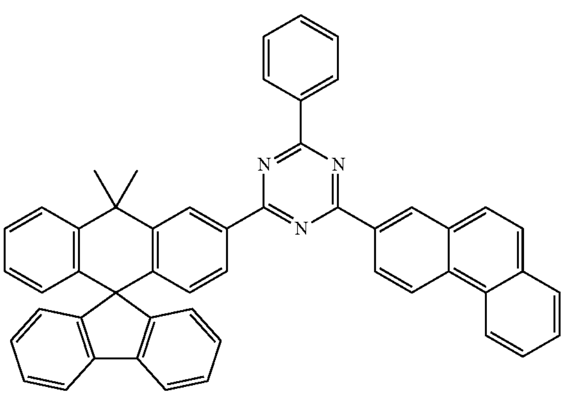
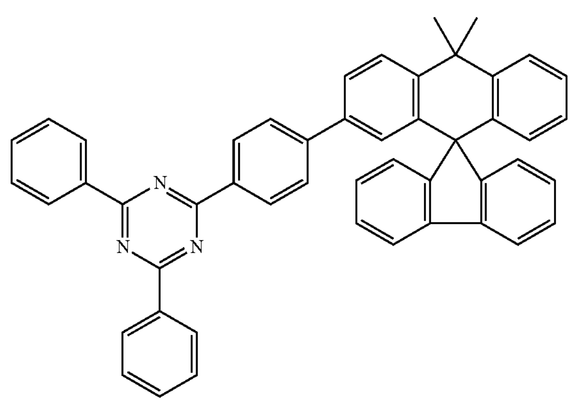

-continued
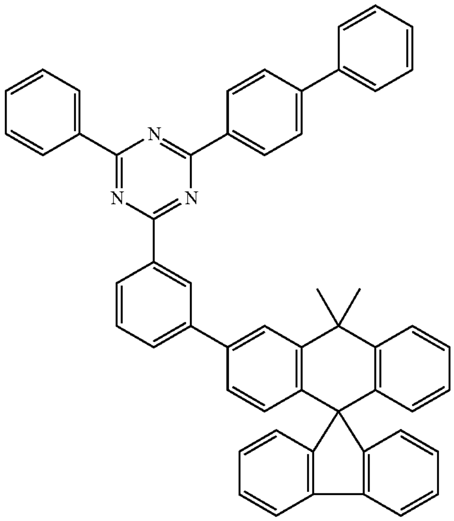
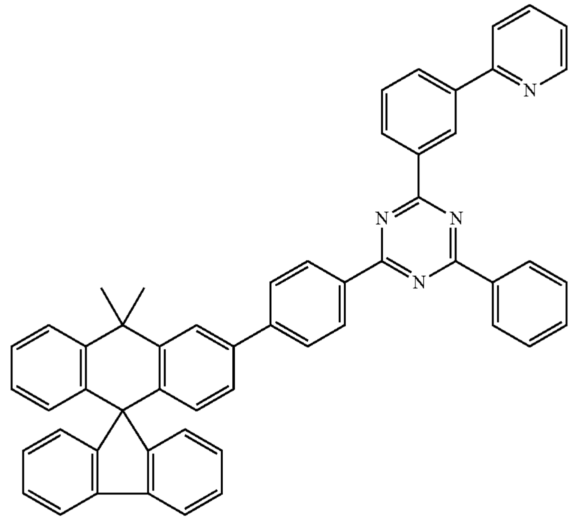
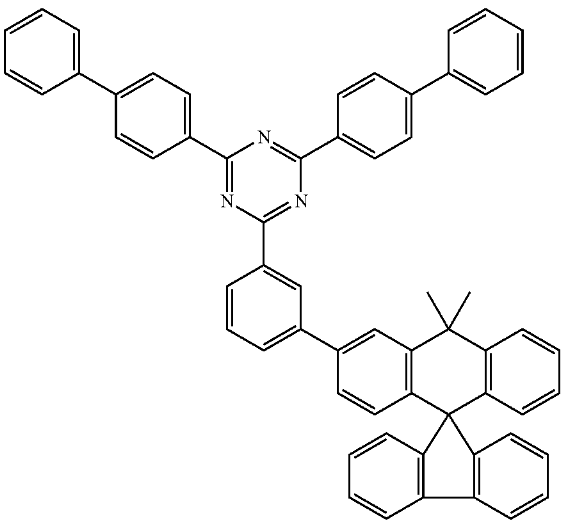
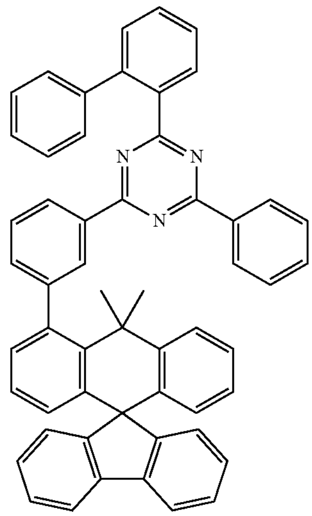
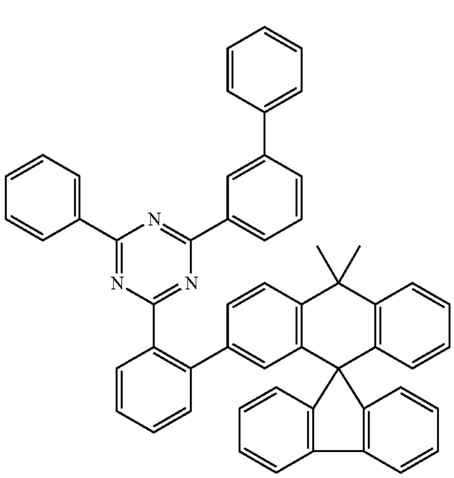
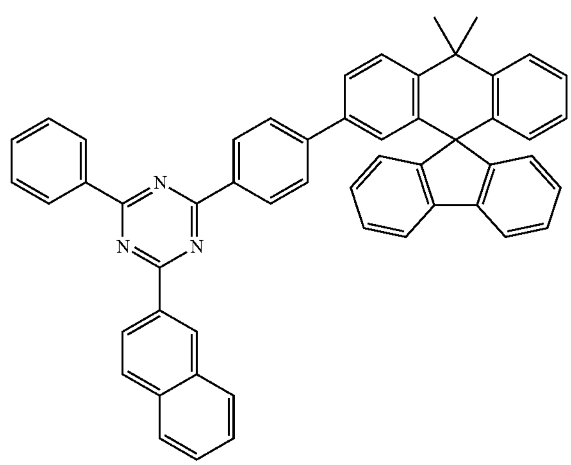
-continued -continued
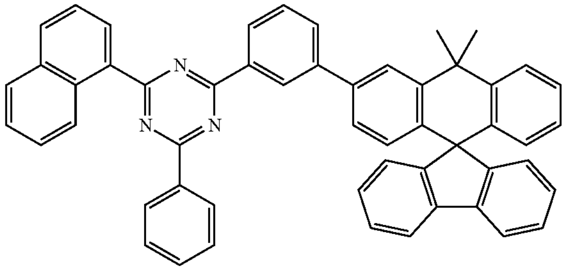
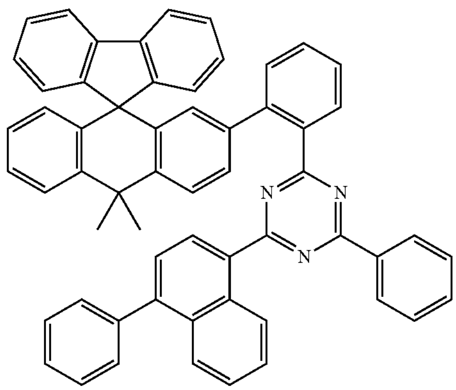
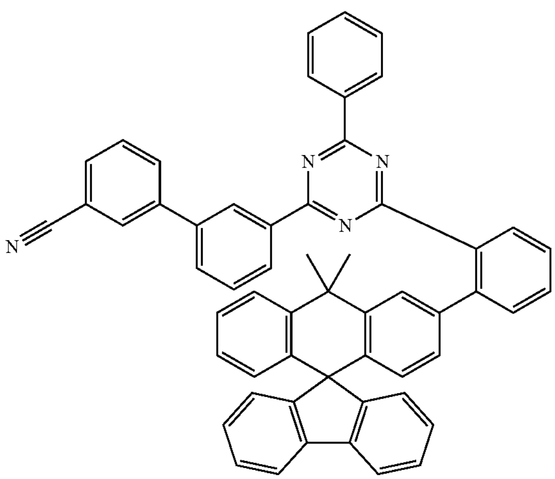
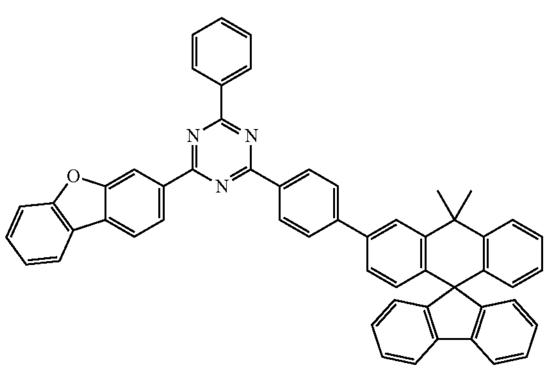
-continued
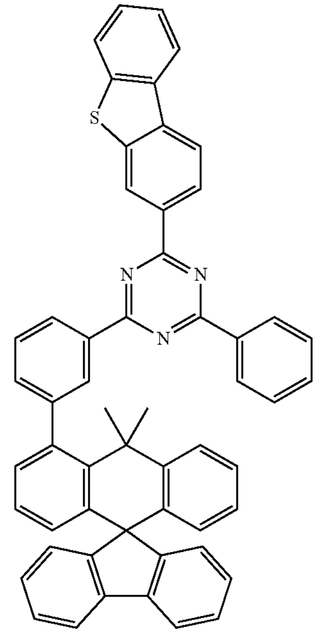
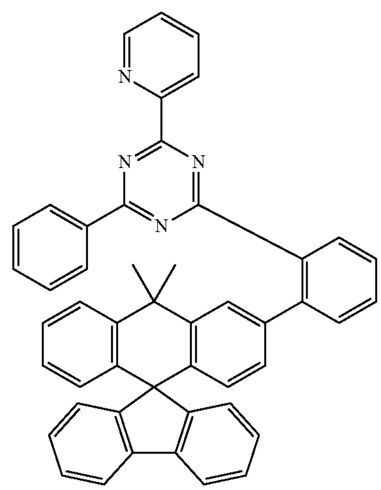
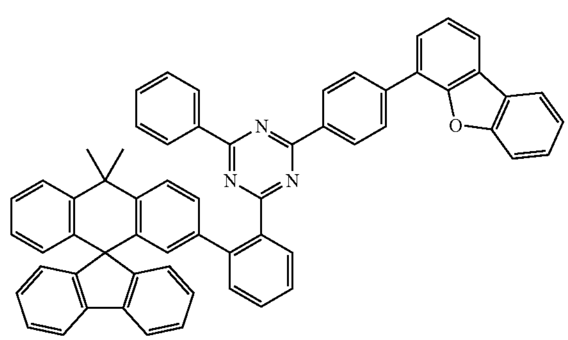

-continued
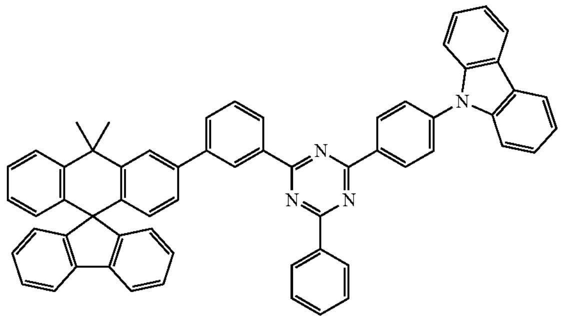
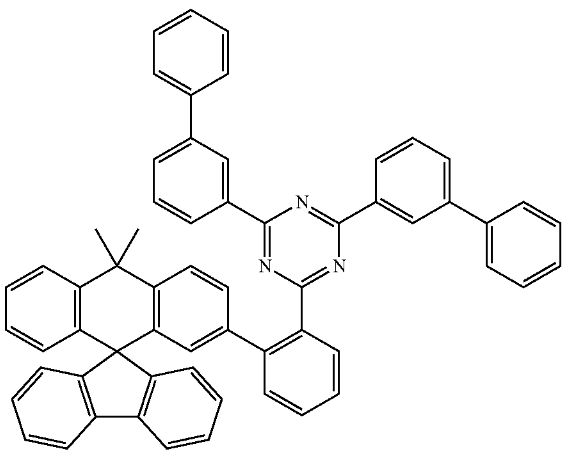
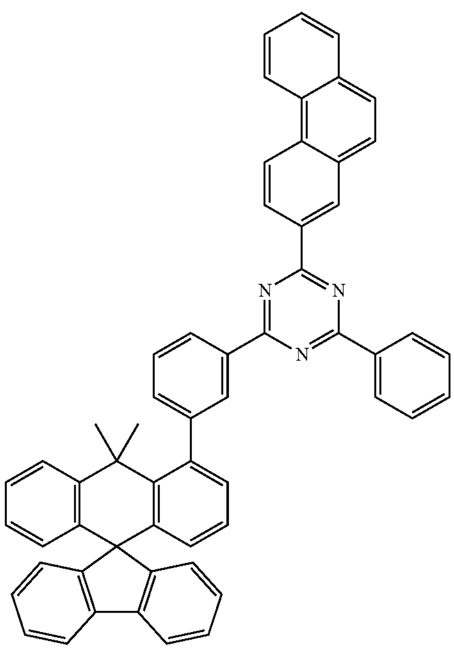
-continued
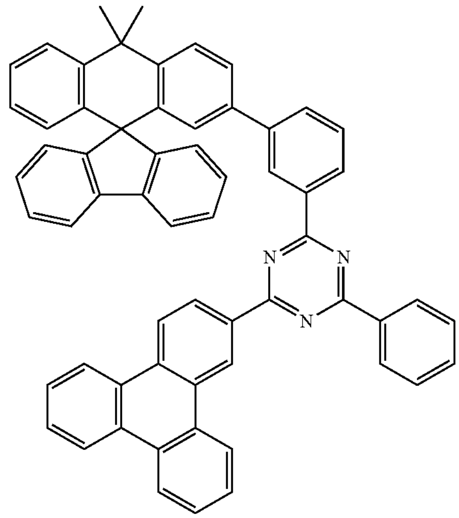
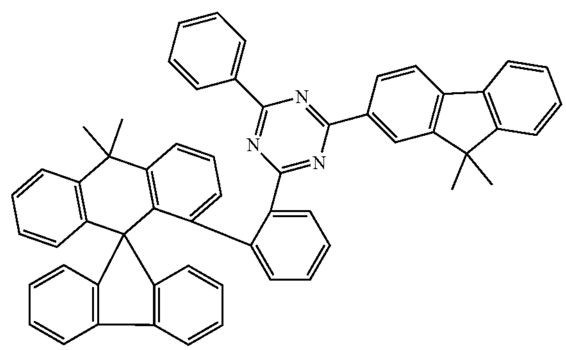
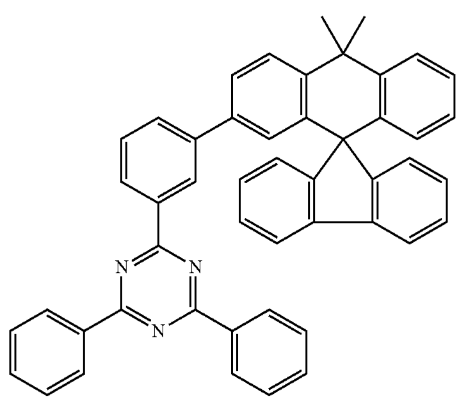

-continued
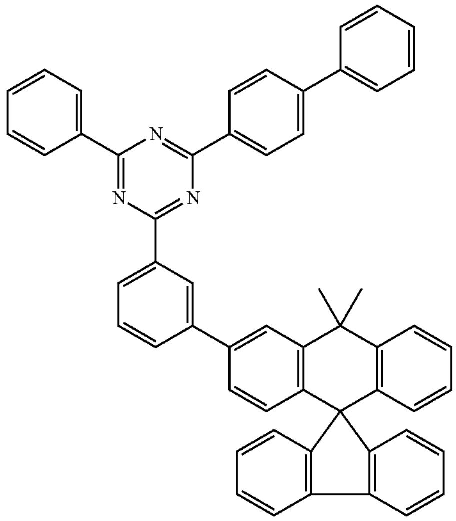
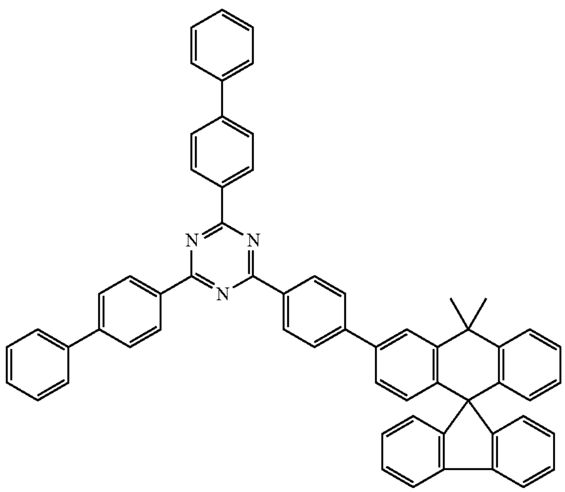
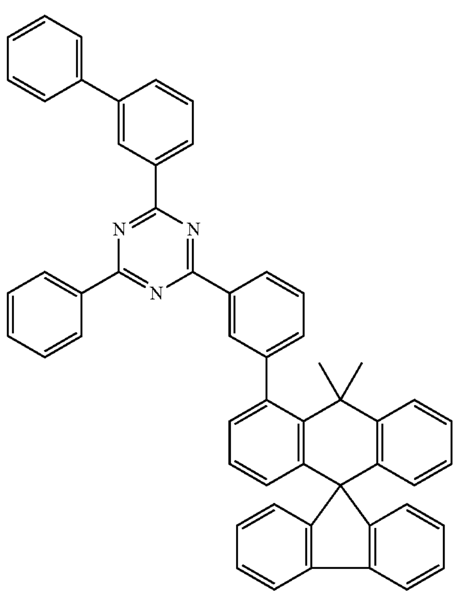
-continued
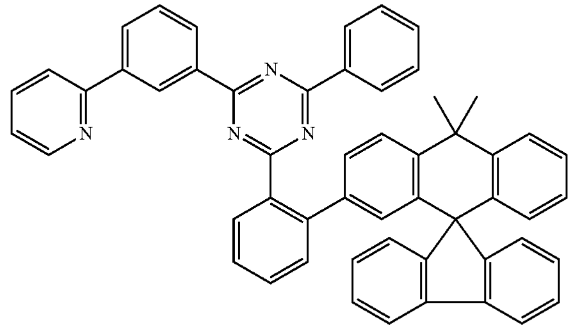
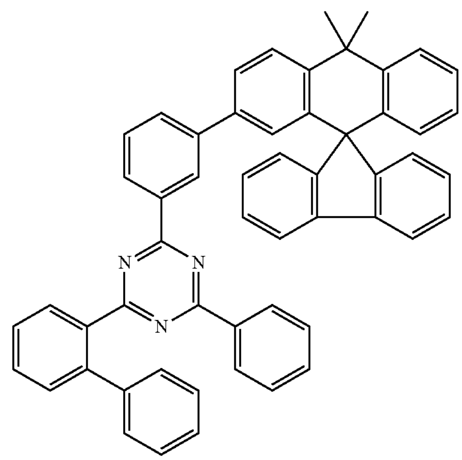
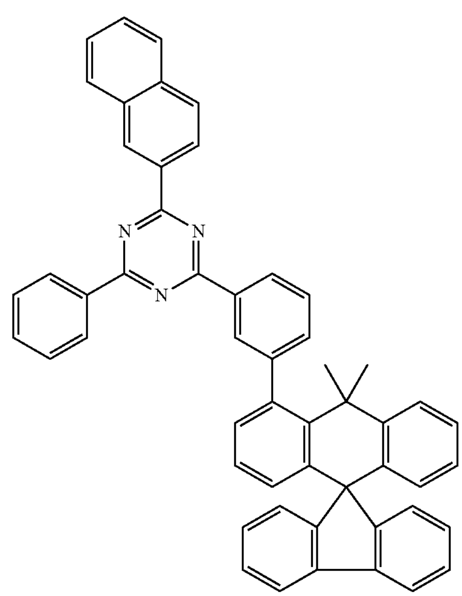

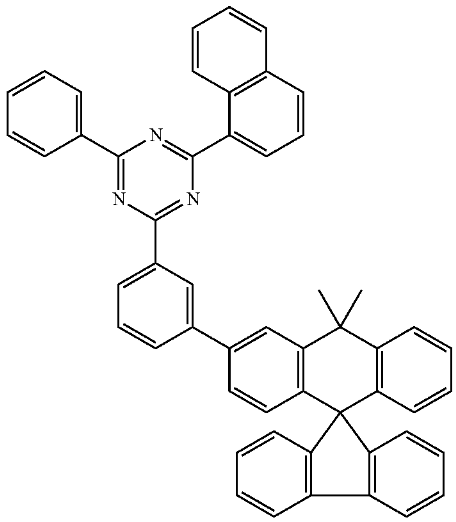
N
N
N
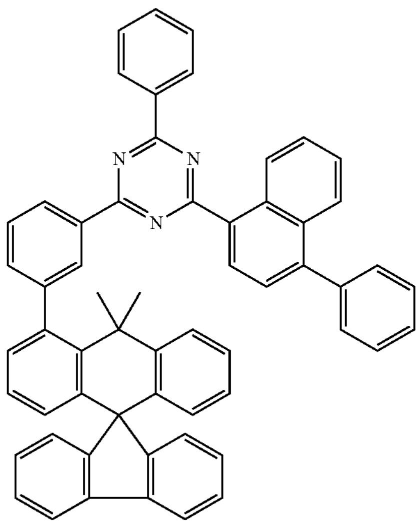
N
N
N
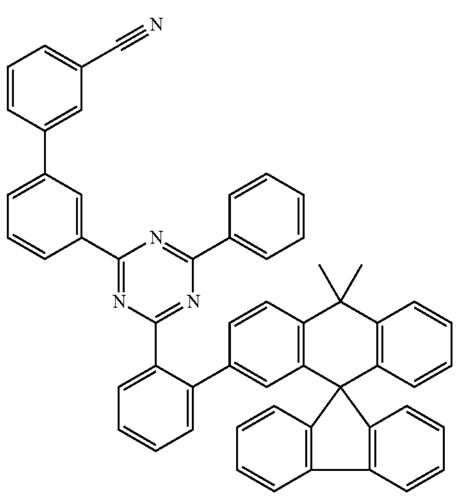
N
N
N
N
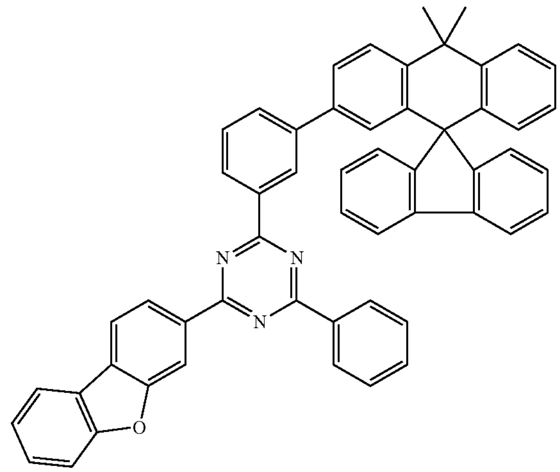
N
N
N
O
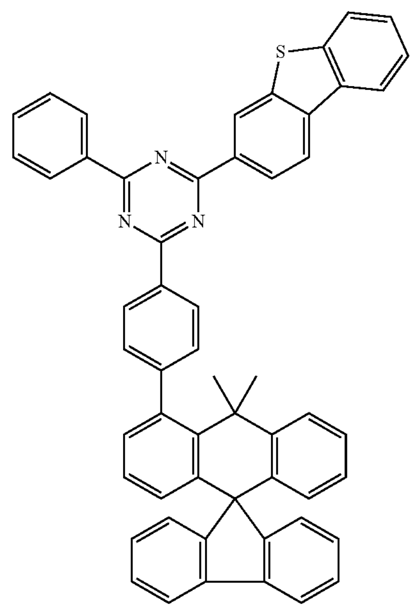
S
N
N
N
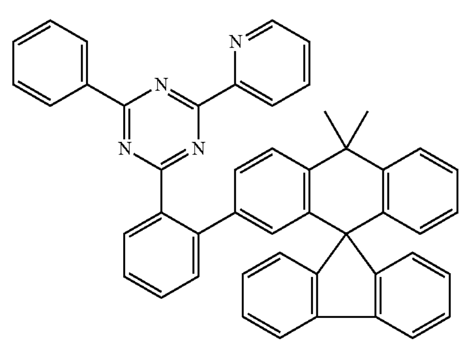
N
N
N
N -continued
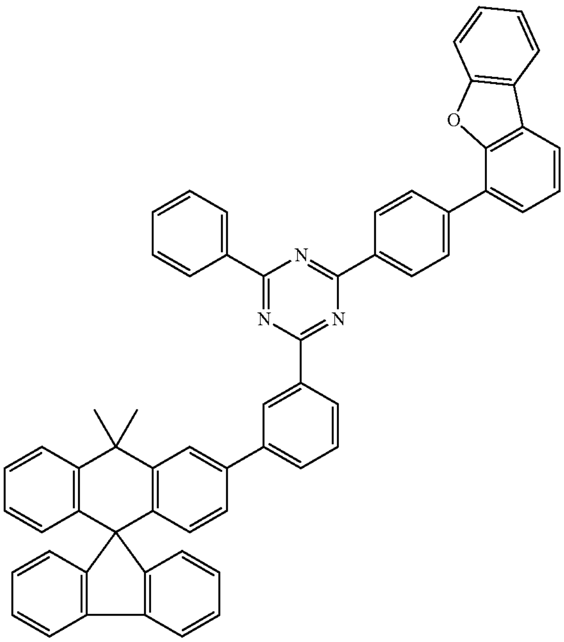
-continued
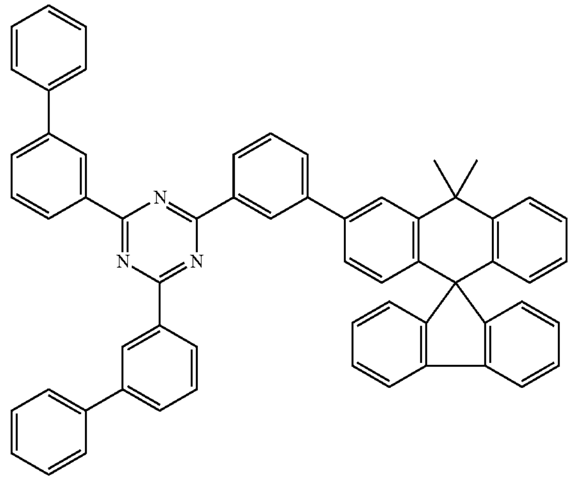
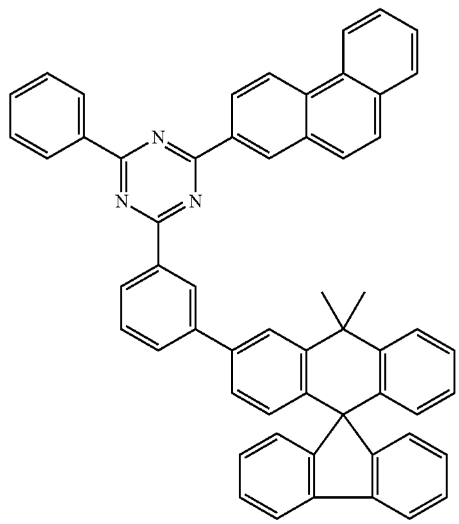
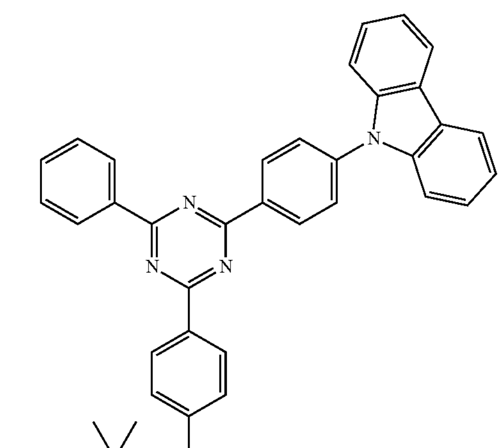
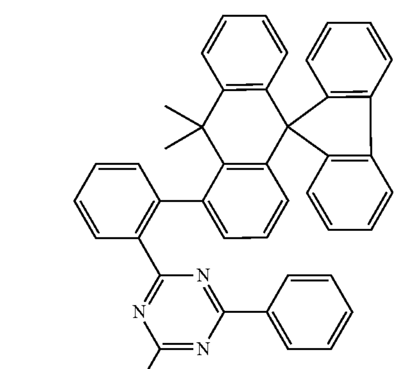

-continued
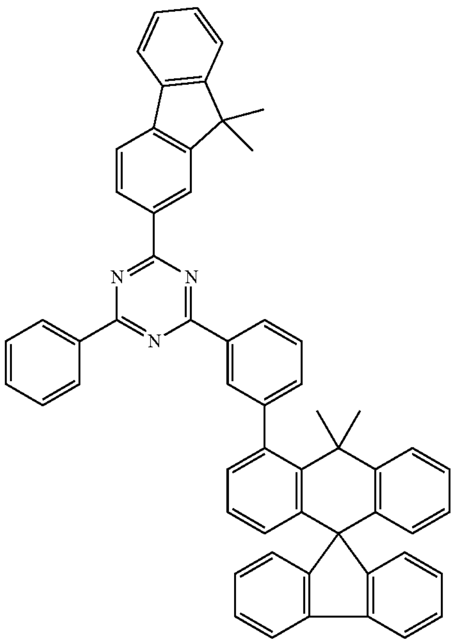
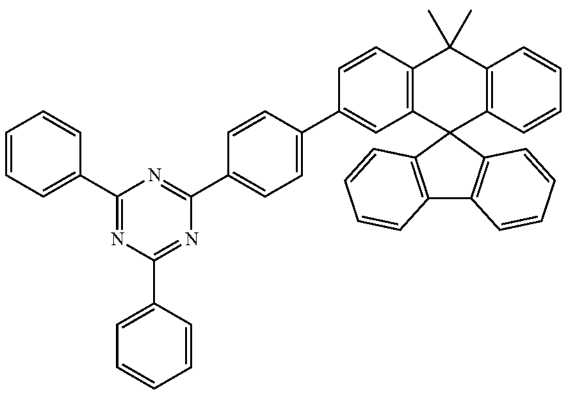
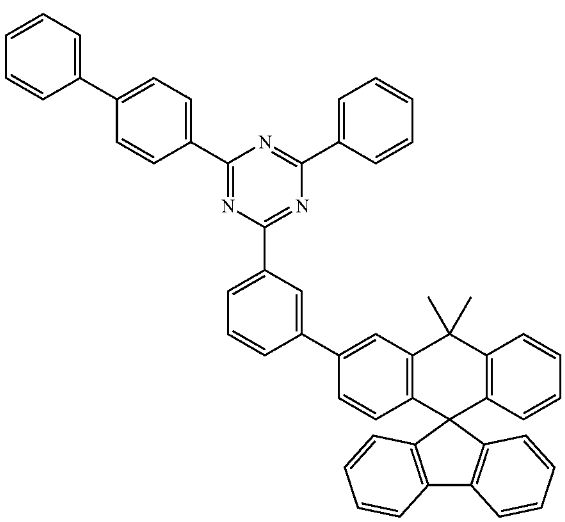
-continued
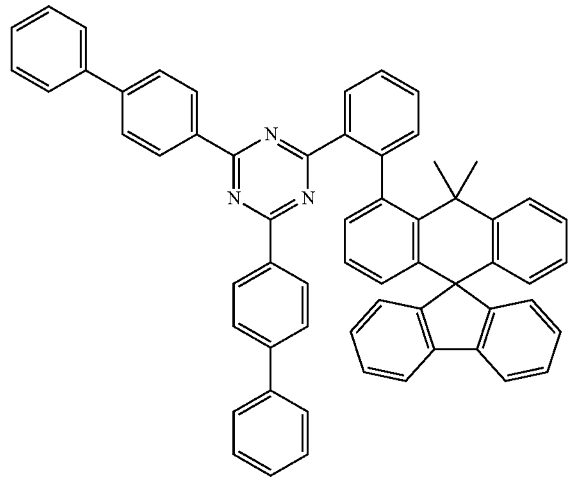
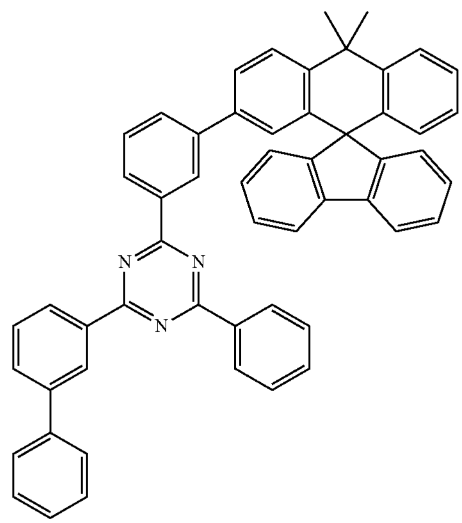
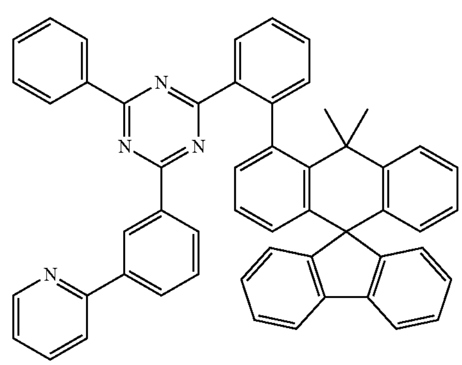

-continued
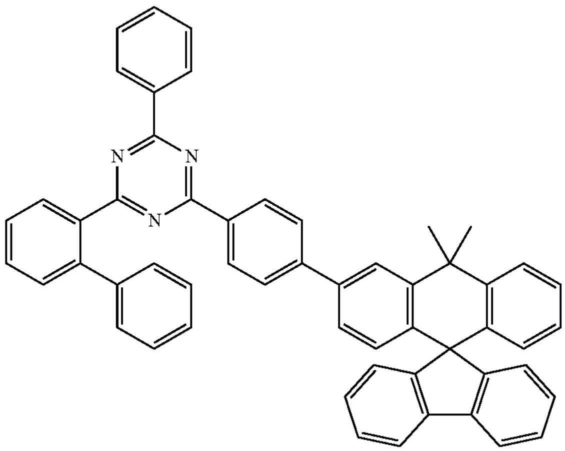
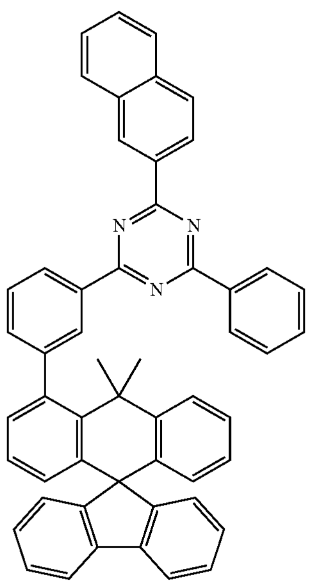
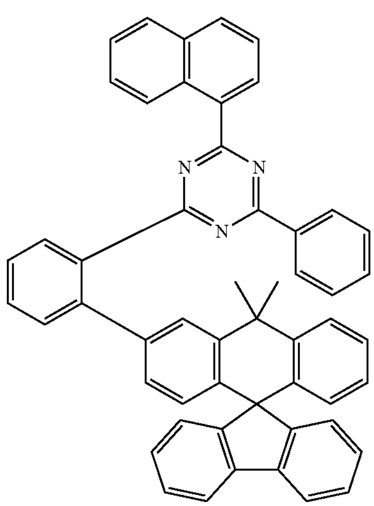
-continued
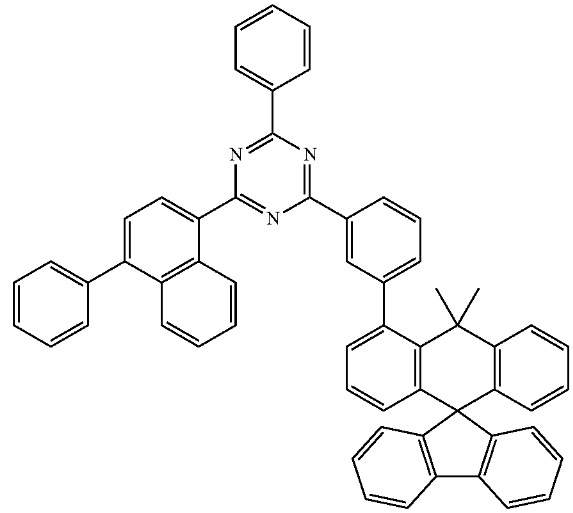
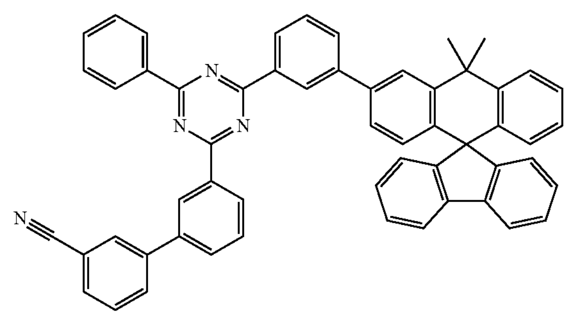
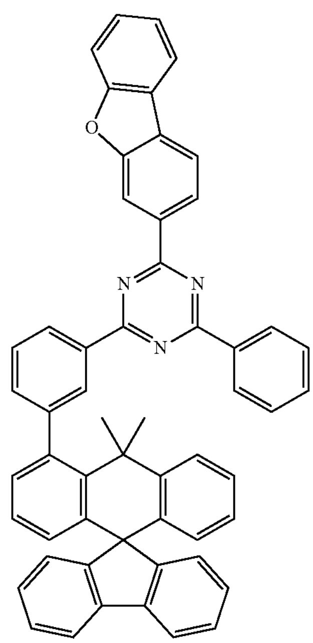

-continued
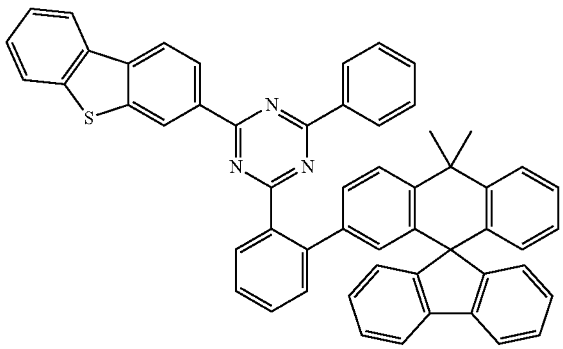
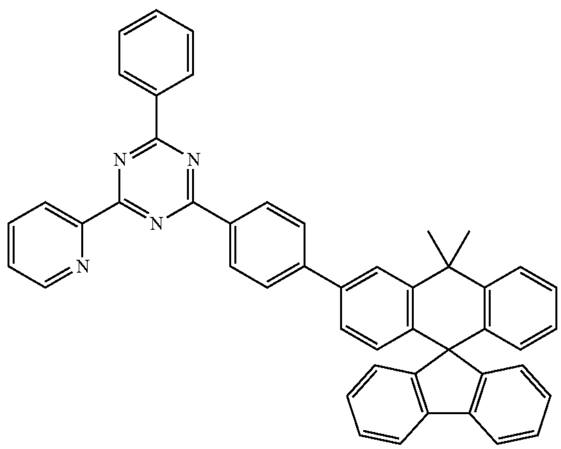
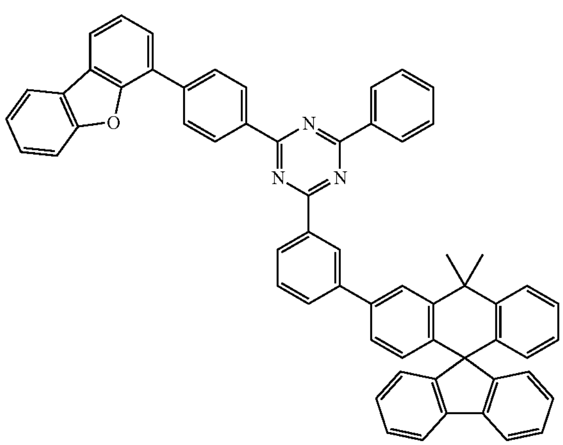
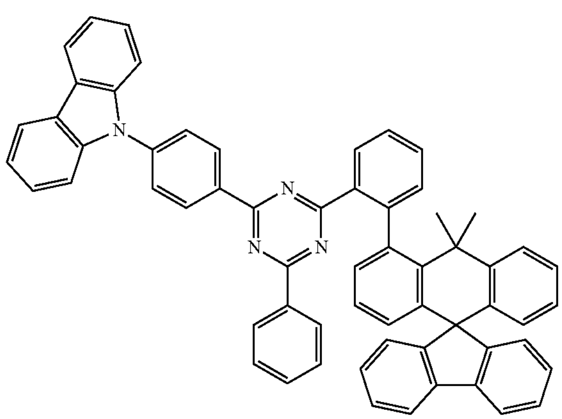
-continued
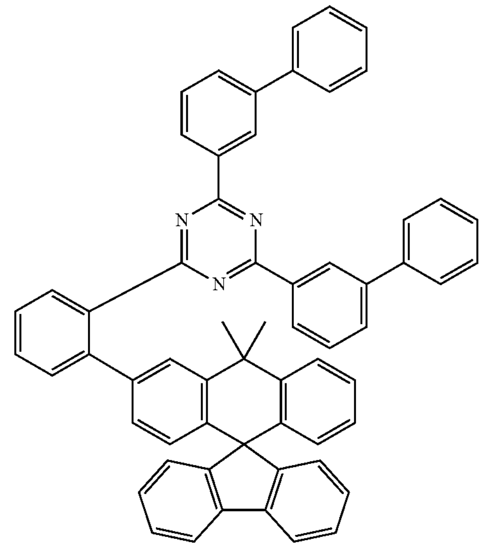
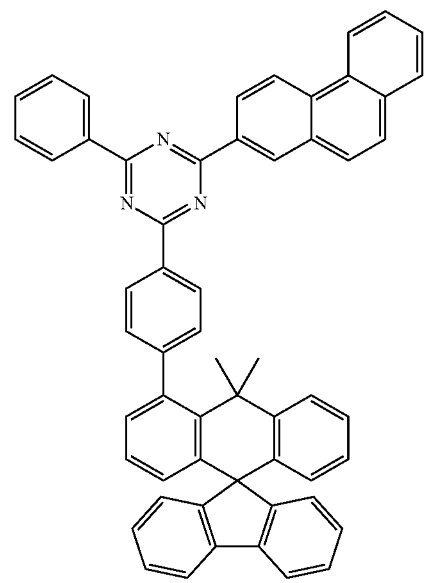
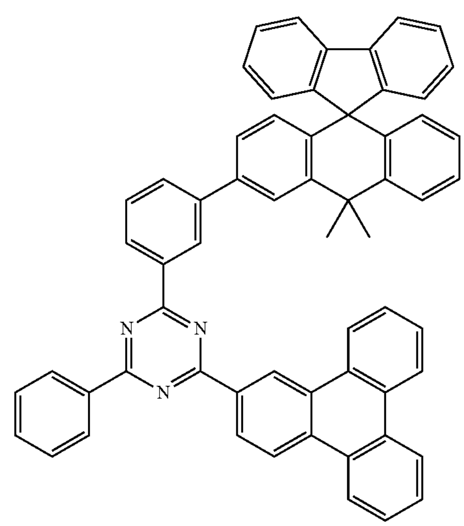

-continued
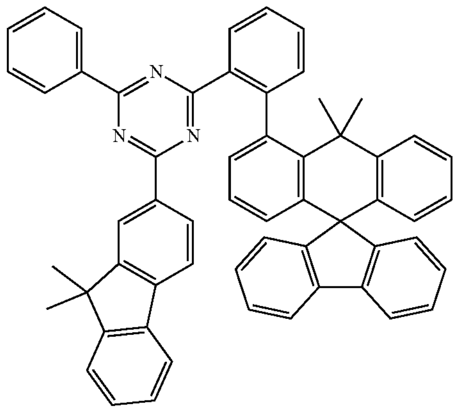
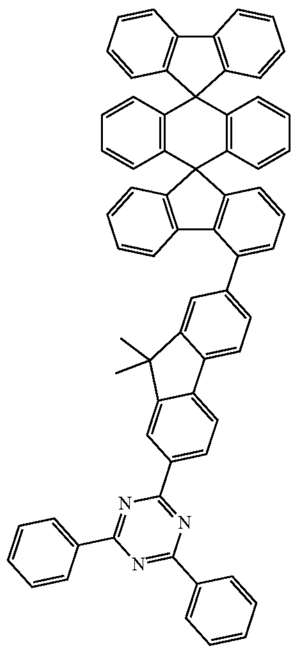
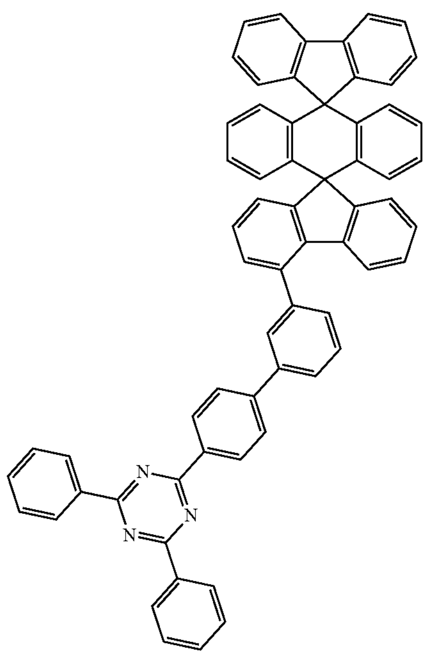
-continued
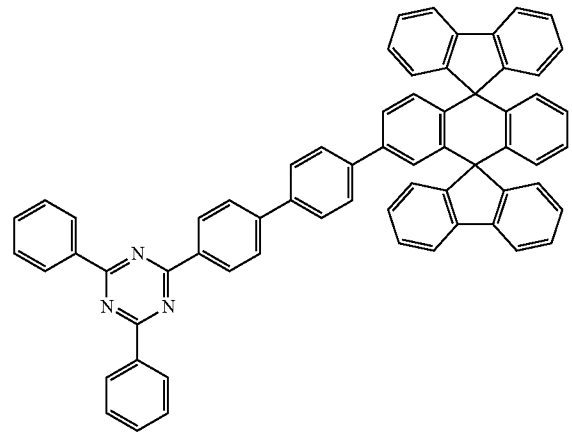
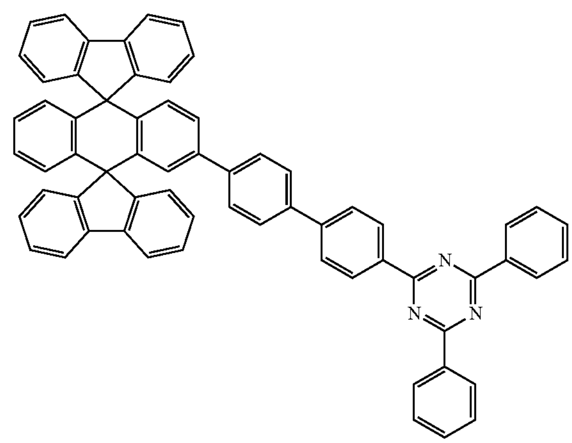
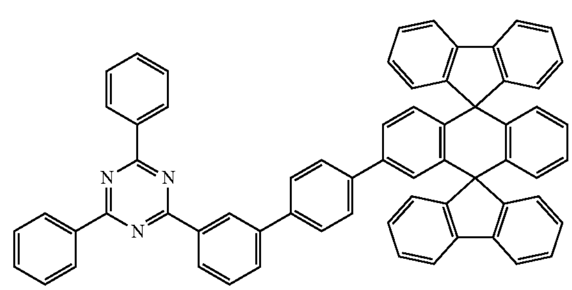

-continued
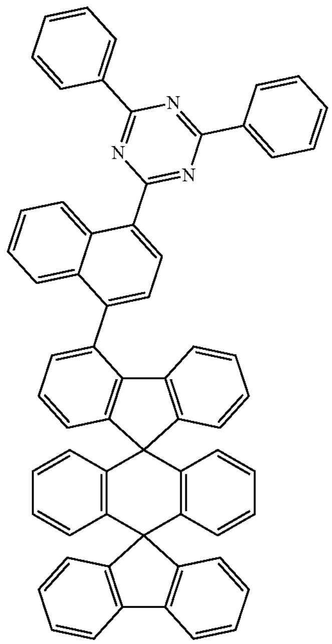
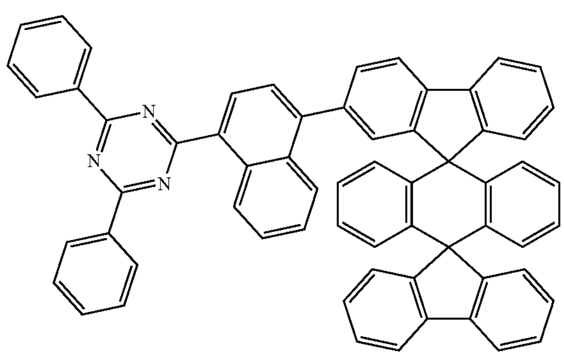
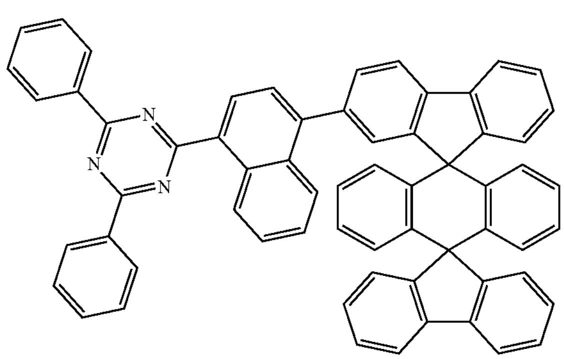
-continued
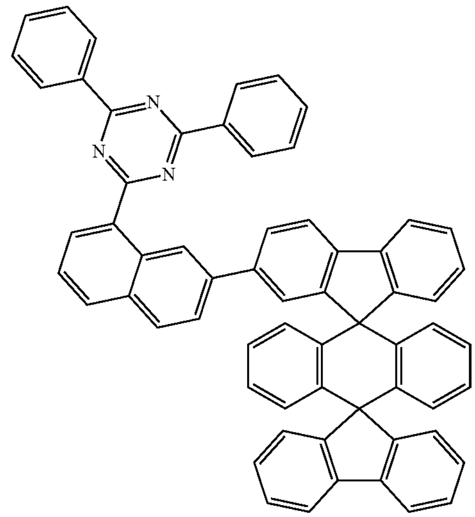
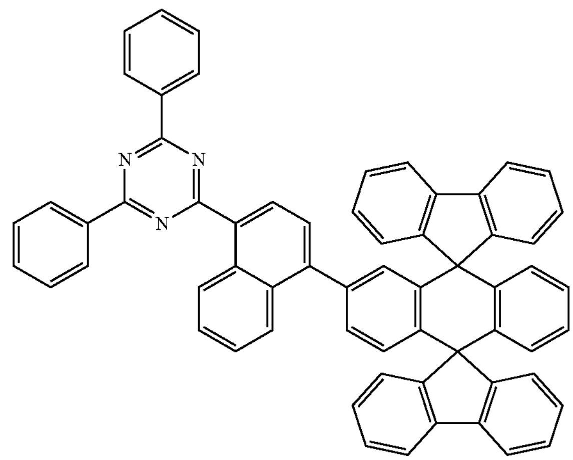
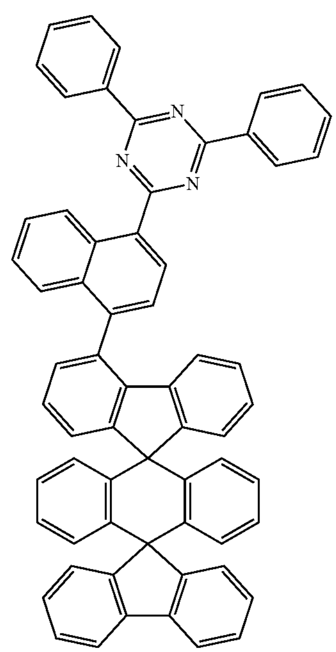

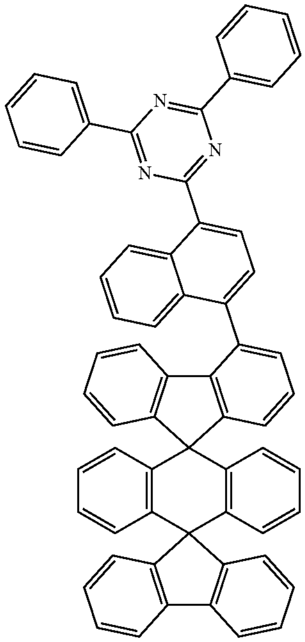
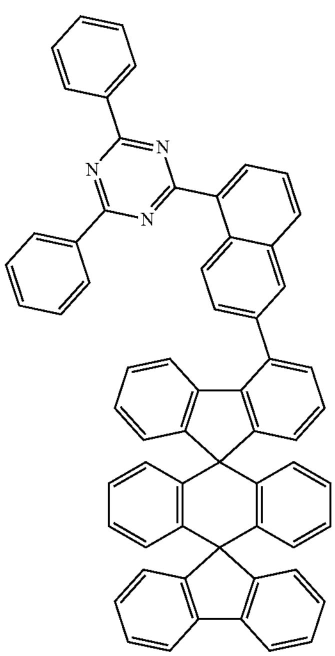
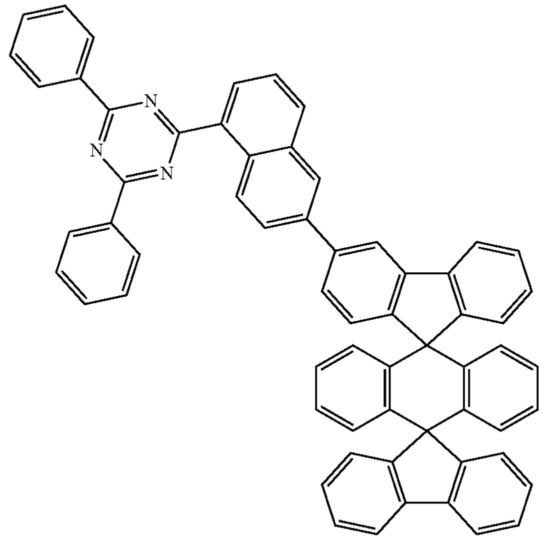
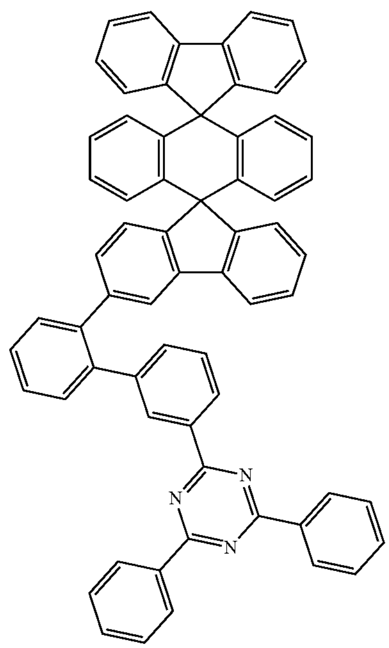
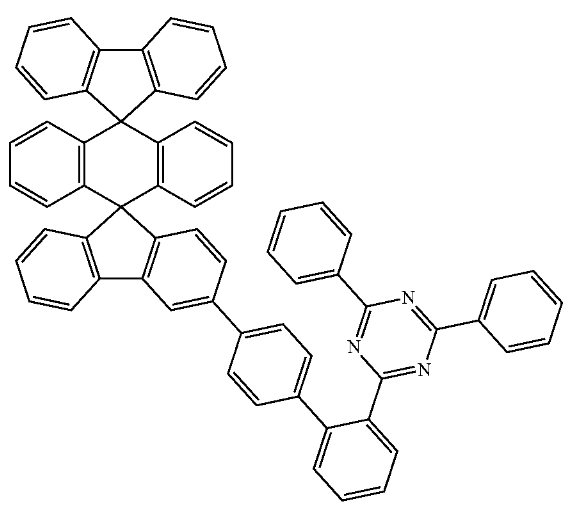

-continued
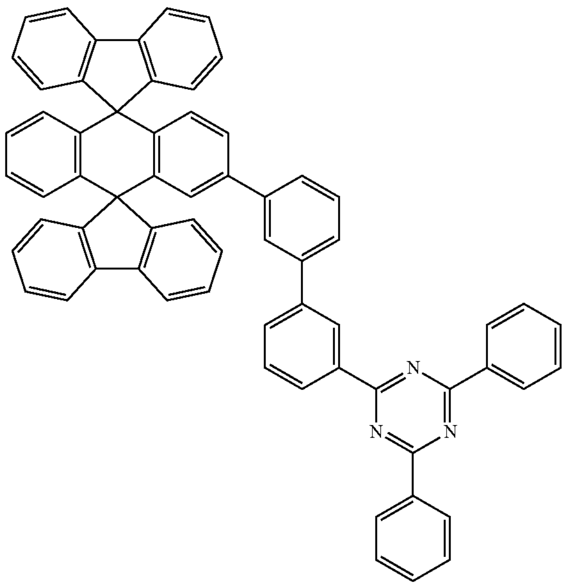
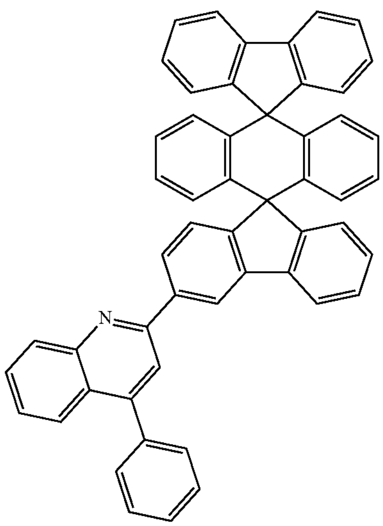
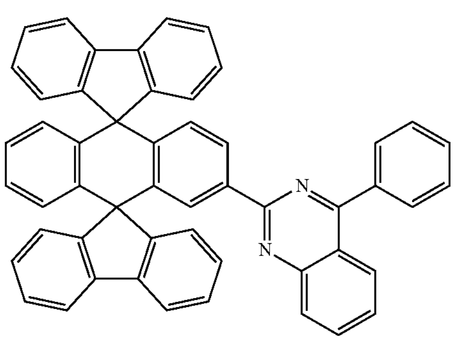
-continued
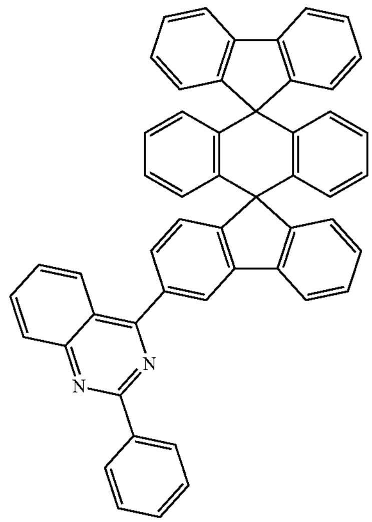
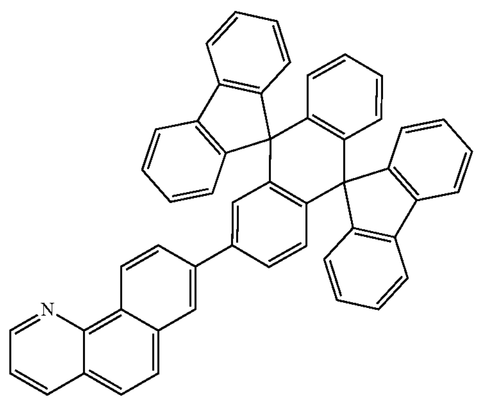
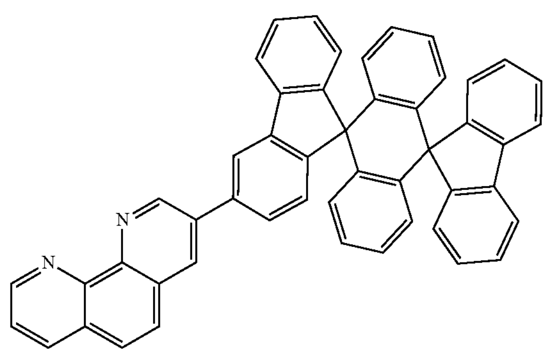

-continued
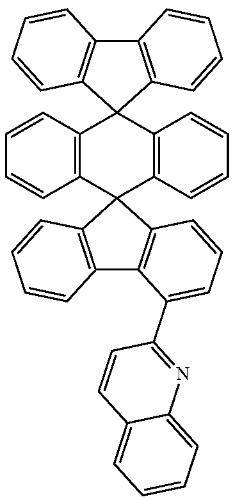
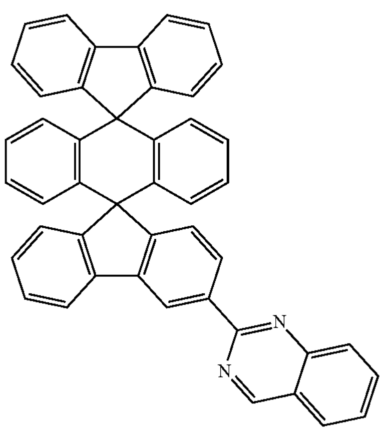
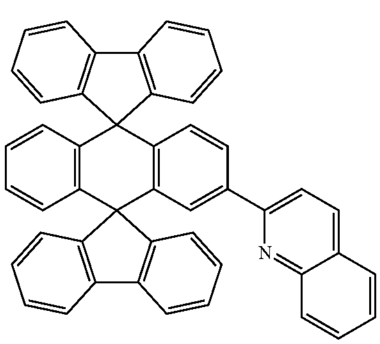
-continued
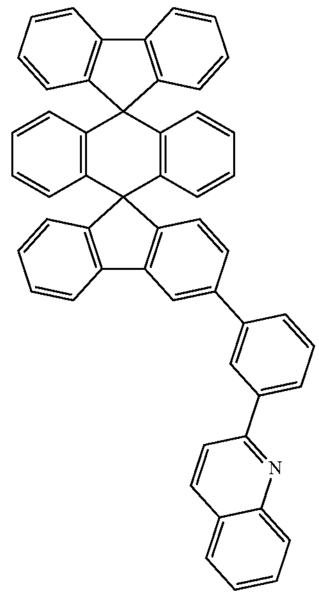
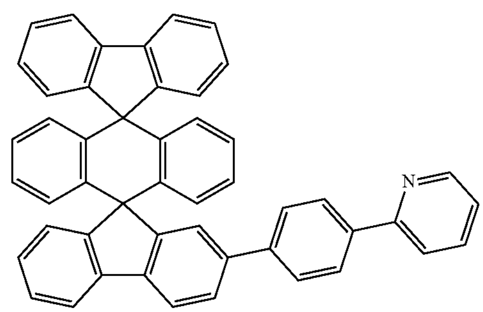
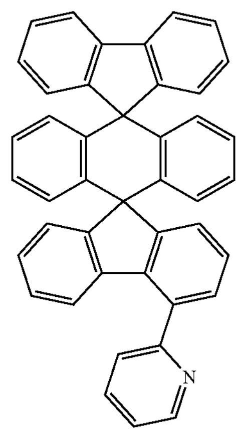
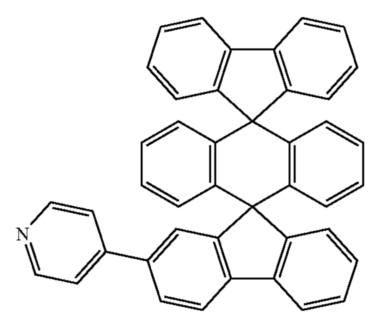

-continued
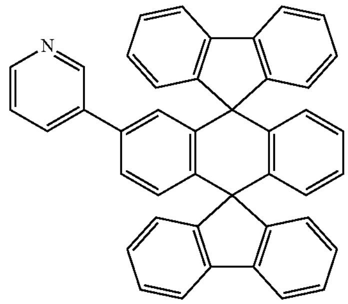
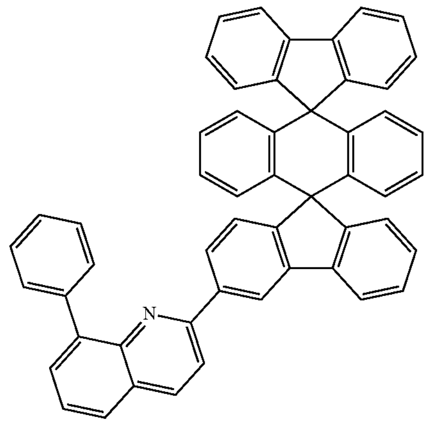
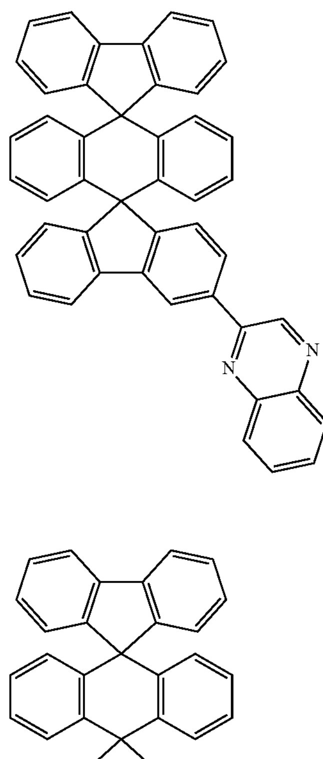
-continued
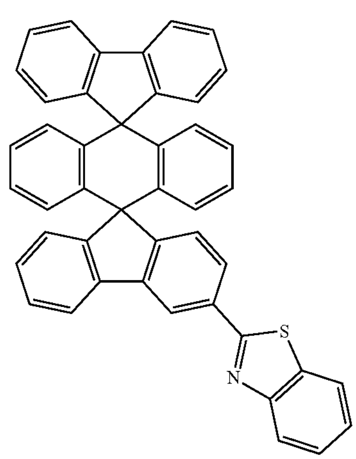
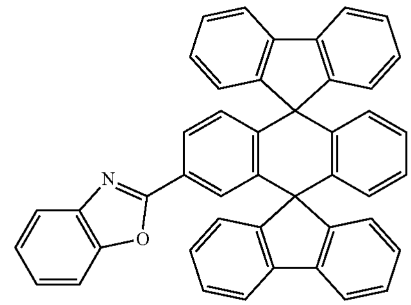
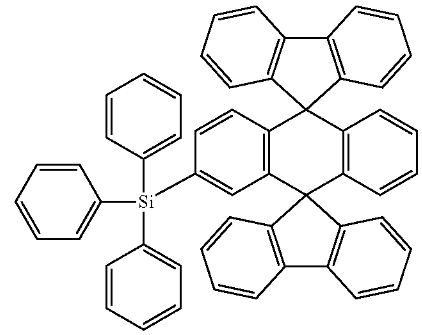
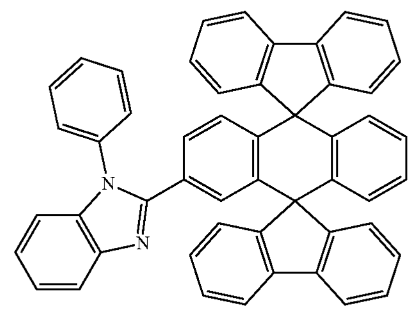
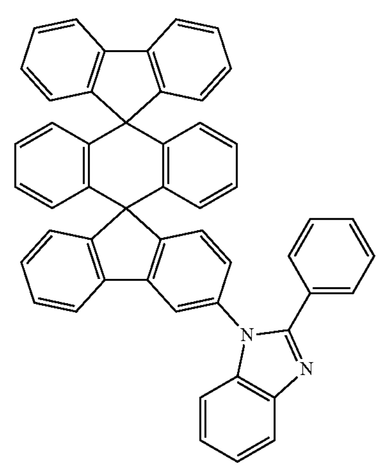

-continued
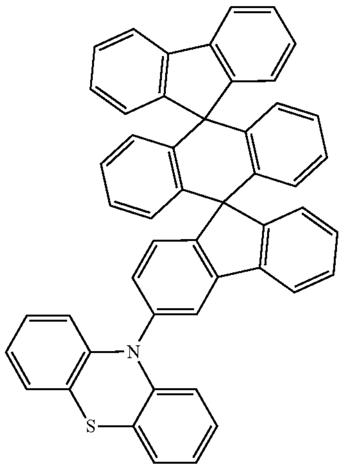
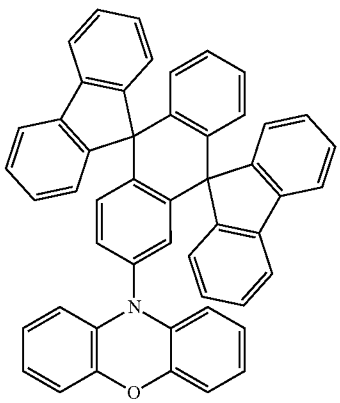
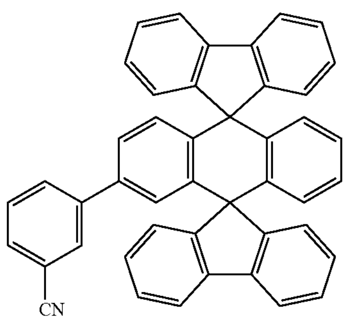
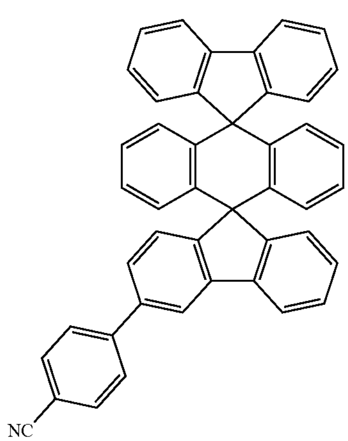
-continued
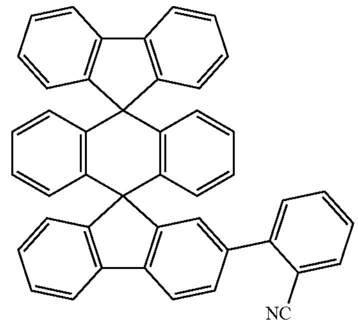
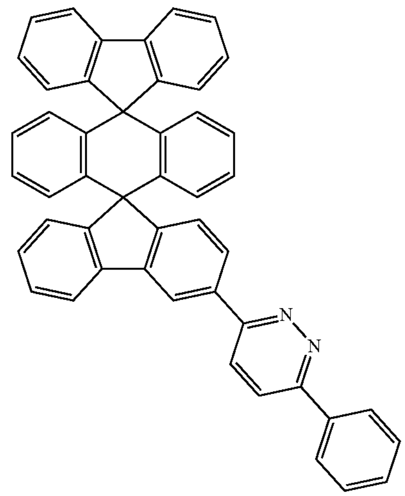
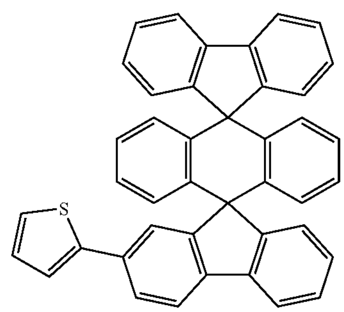
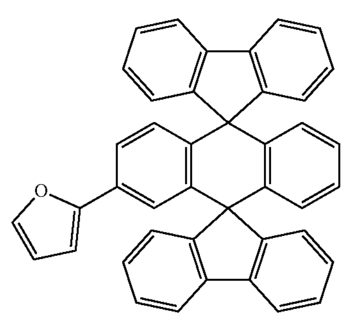

-continued
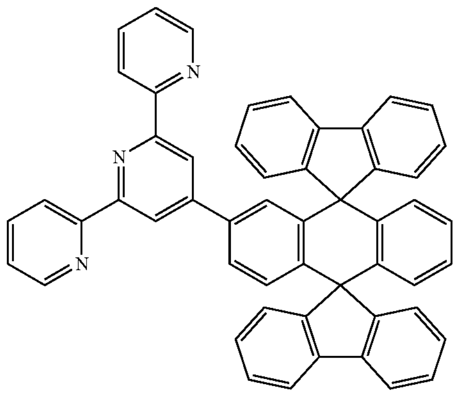
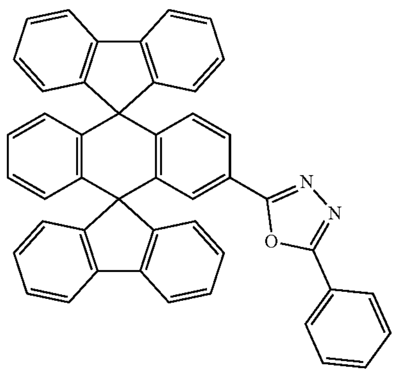
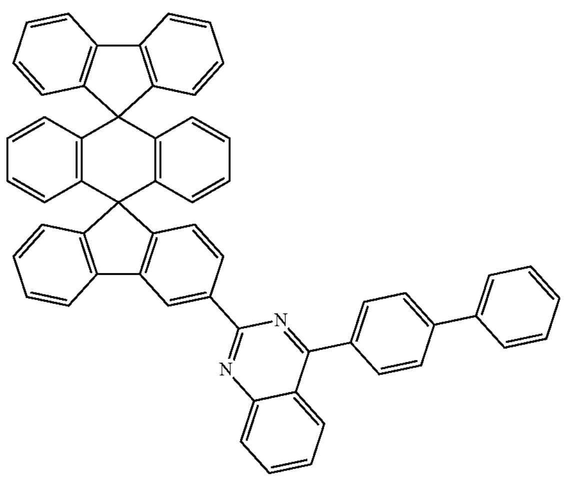
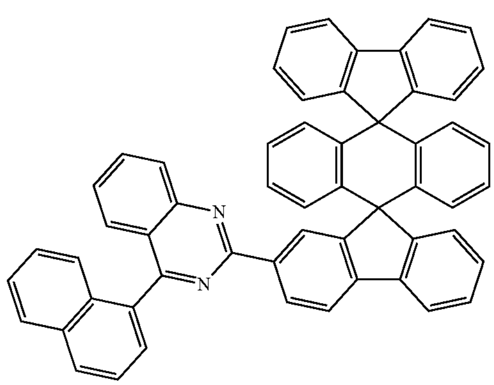
-continued
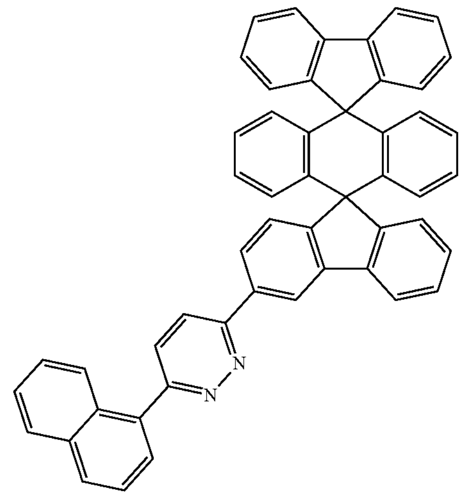
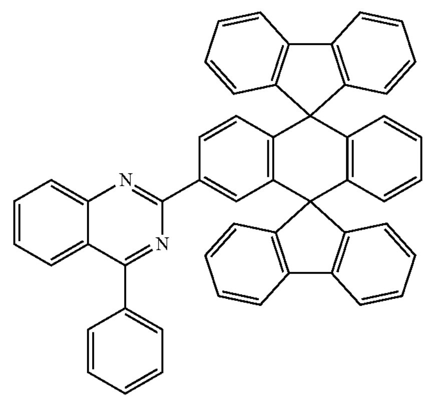
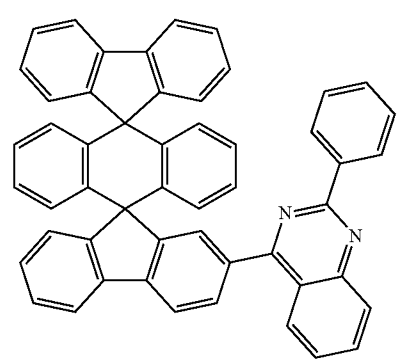

-continued
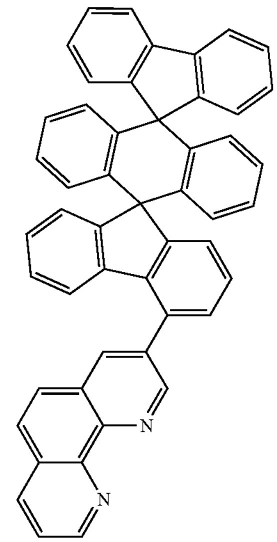
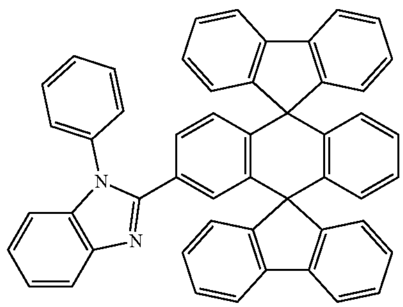
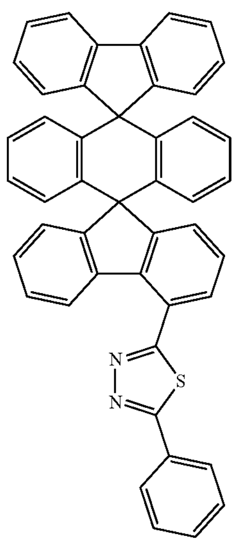
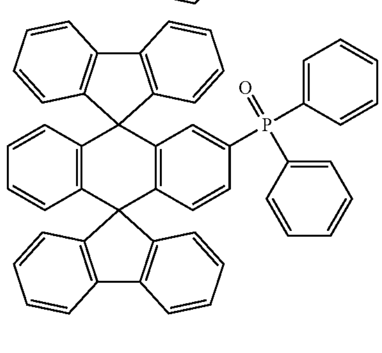
-continued
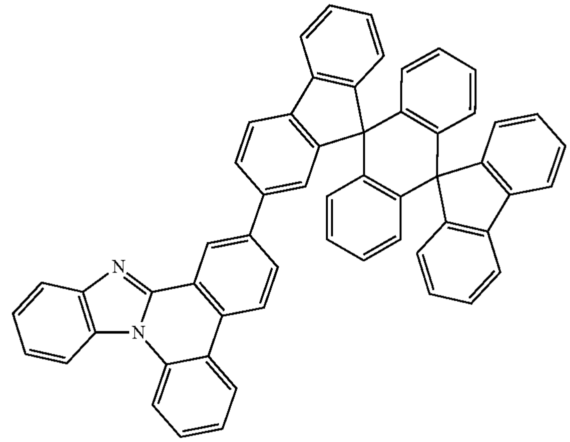
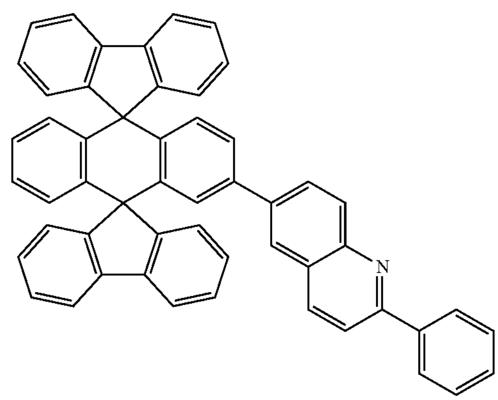
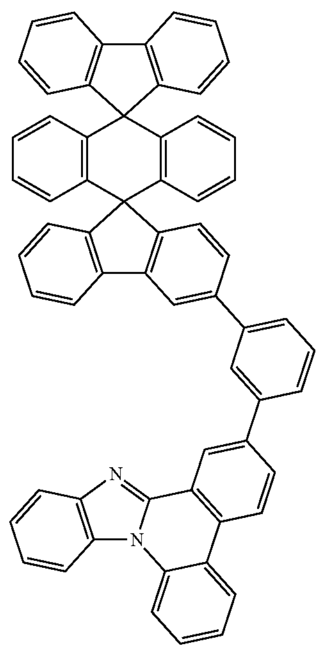

-continued
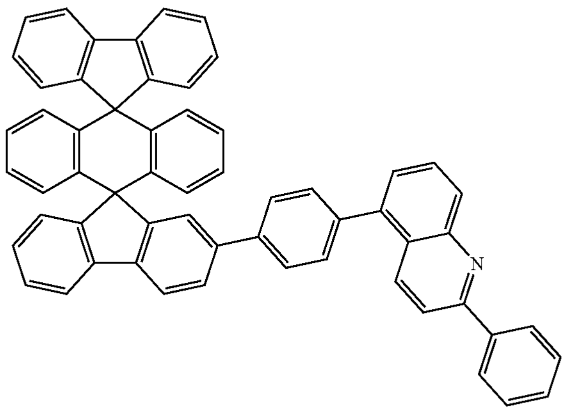
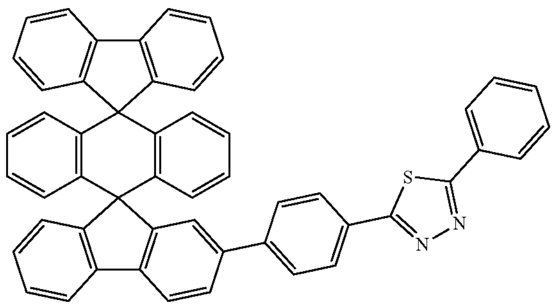
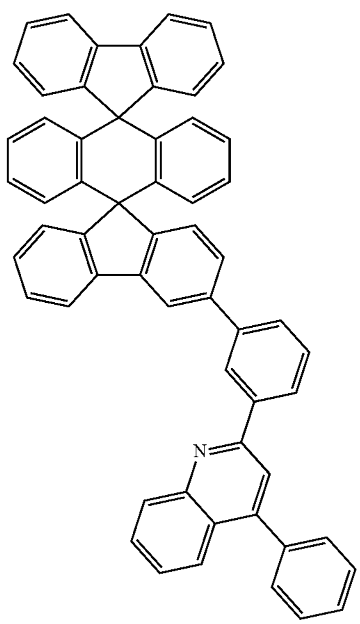
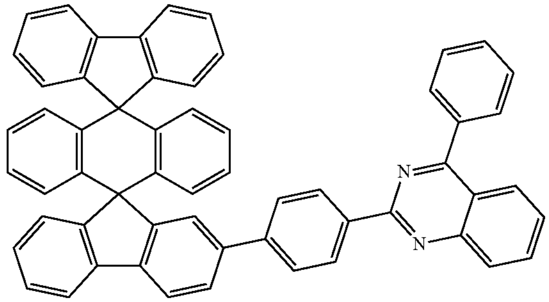
-continued
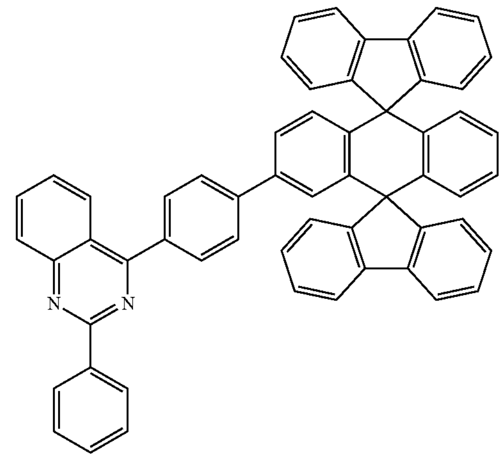
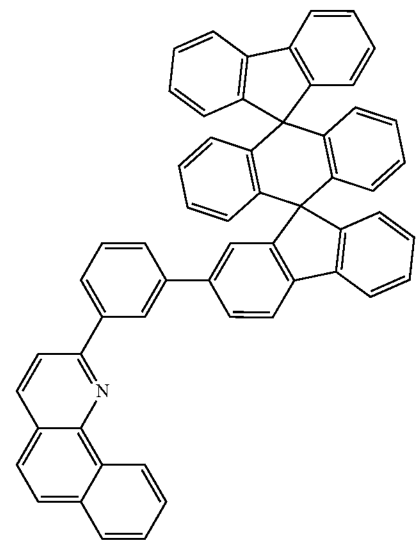
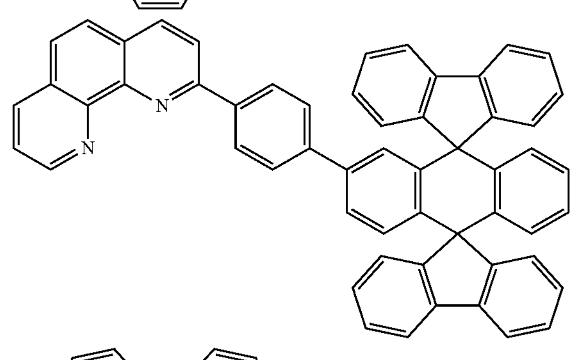
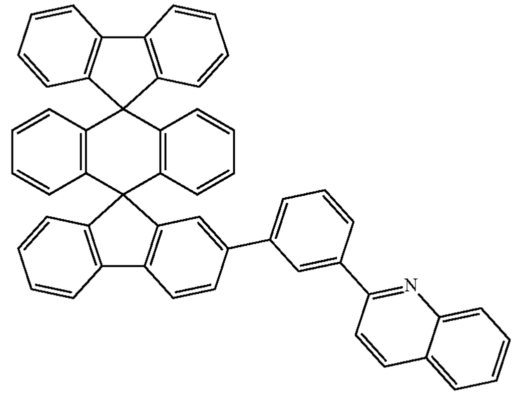

-continued
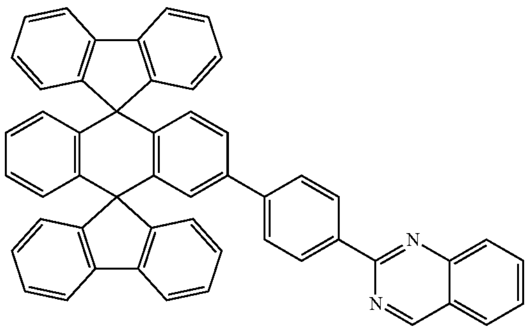
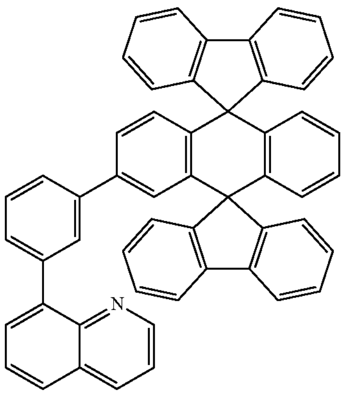
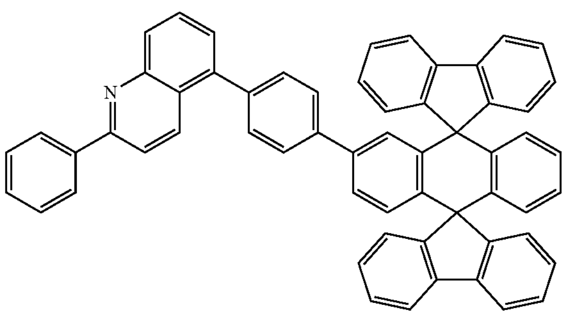
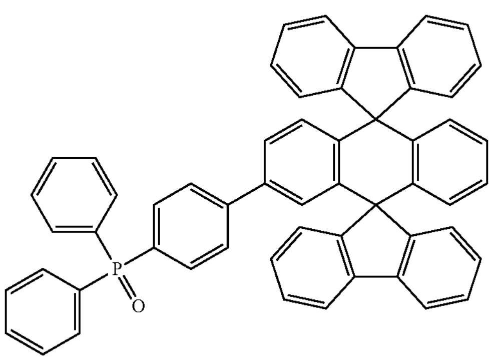
-continued
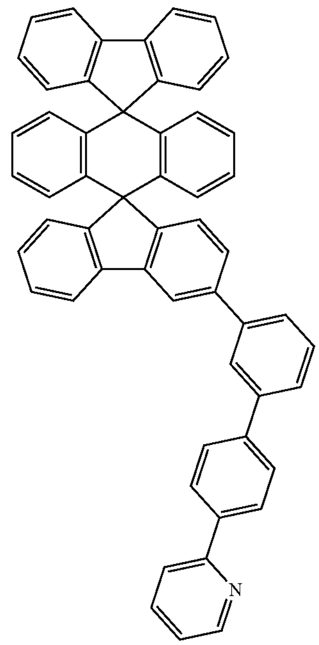
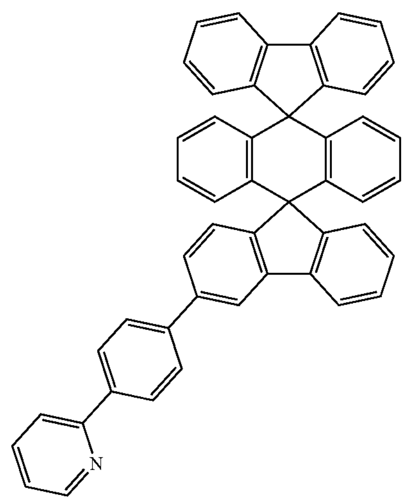
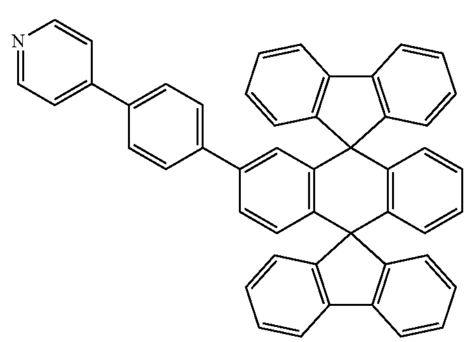

-continued
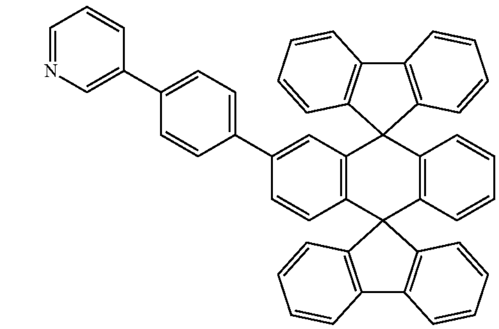
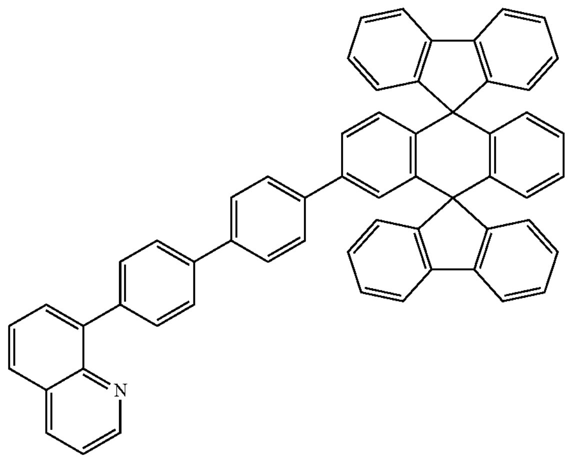
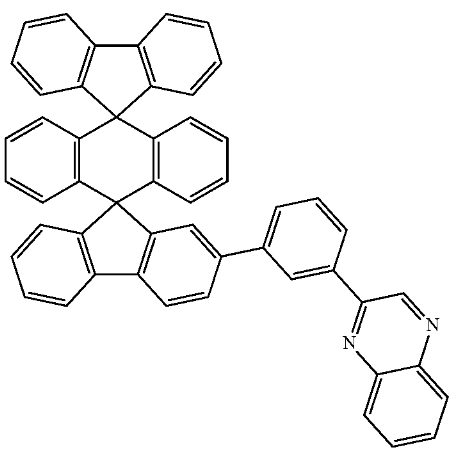
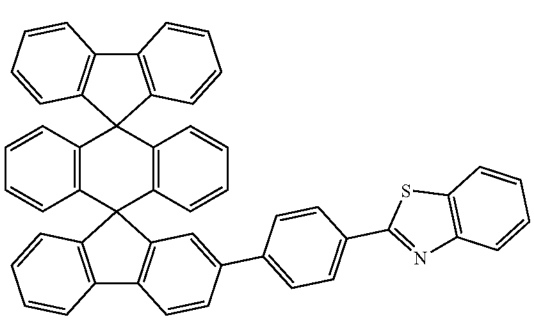
-continued
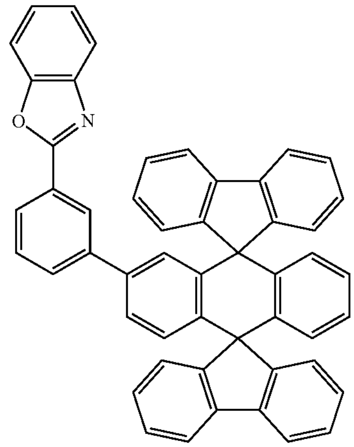
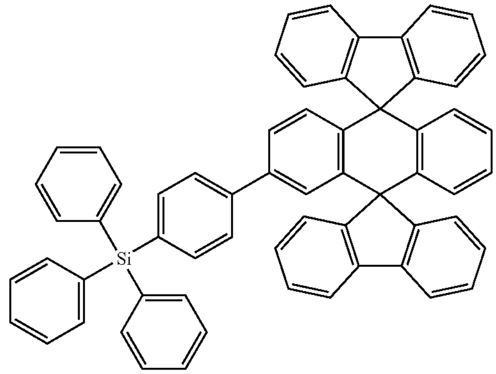
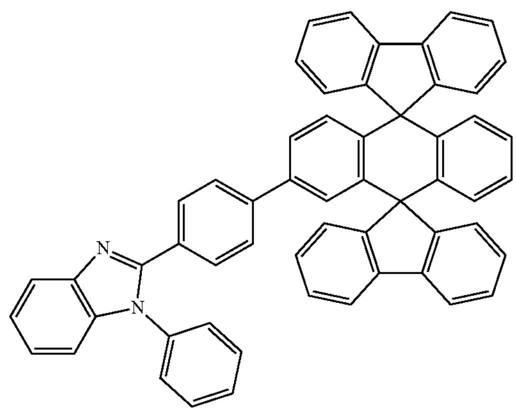
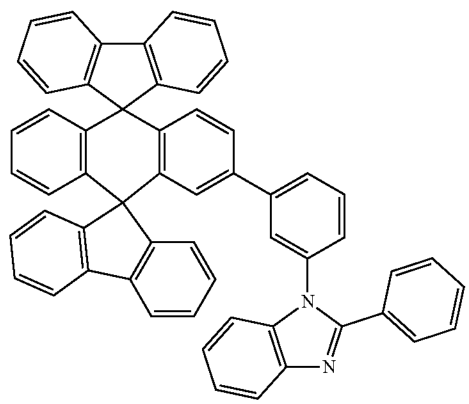

-continued
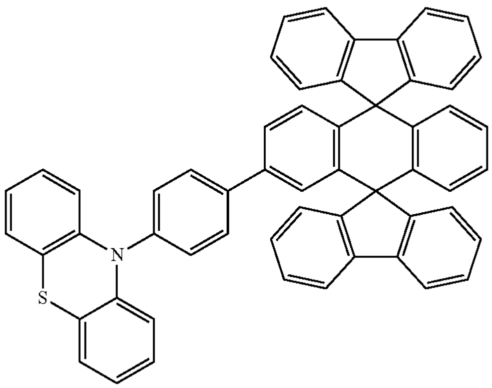
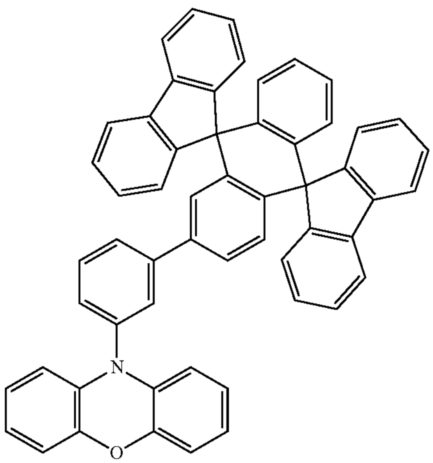
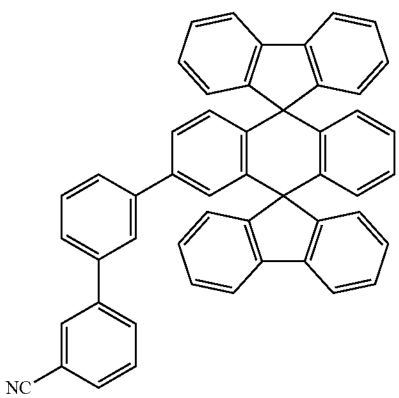
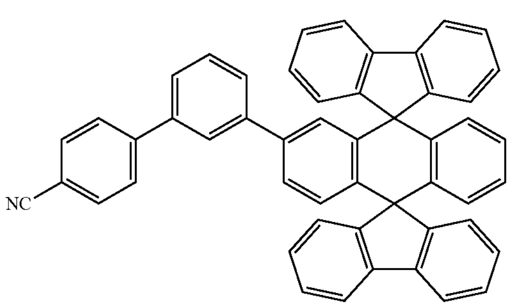
-continued
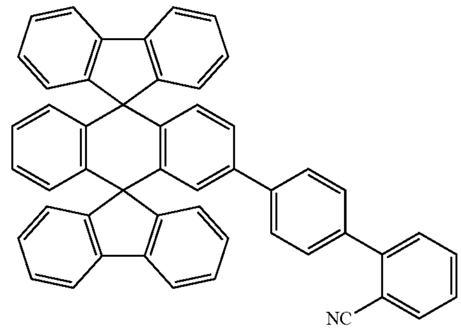
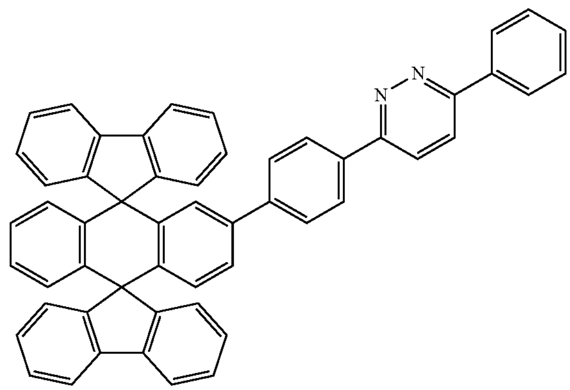
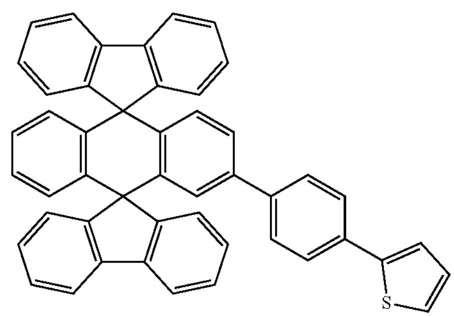
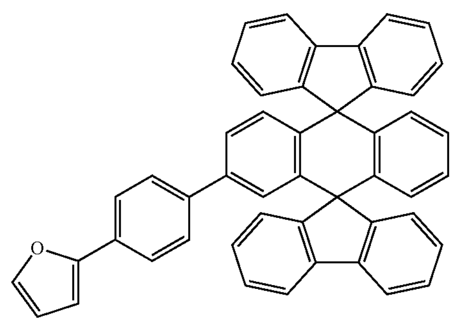
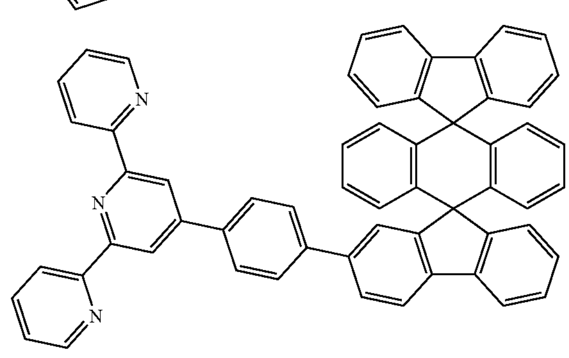

-continued
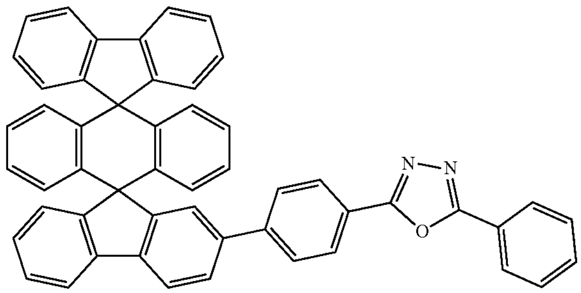
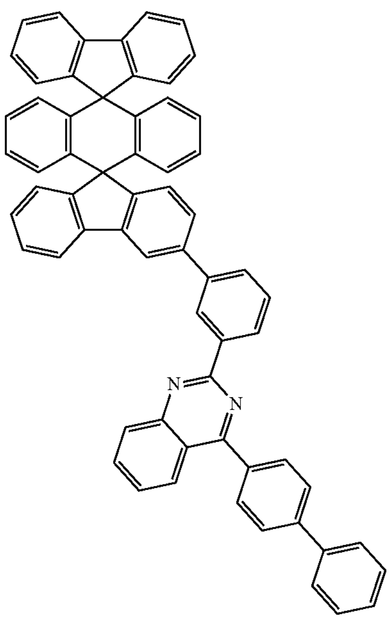
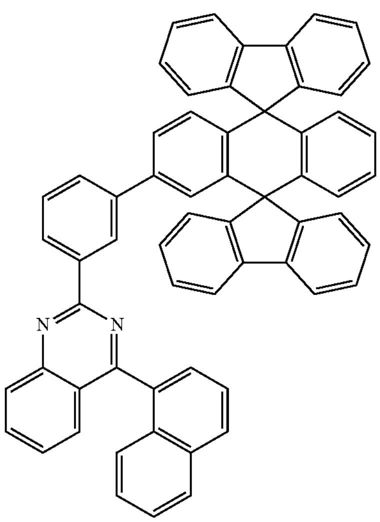
-continued
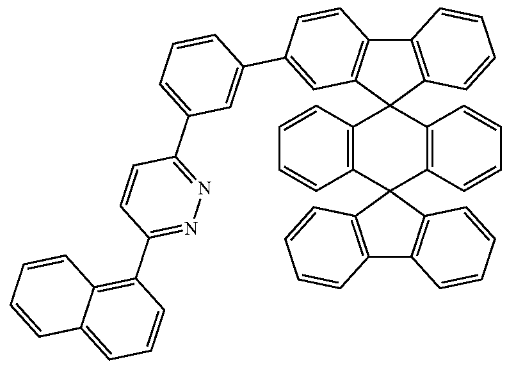
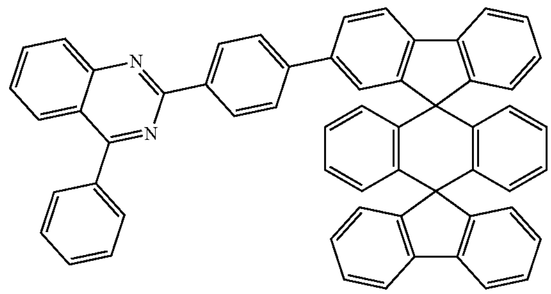
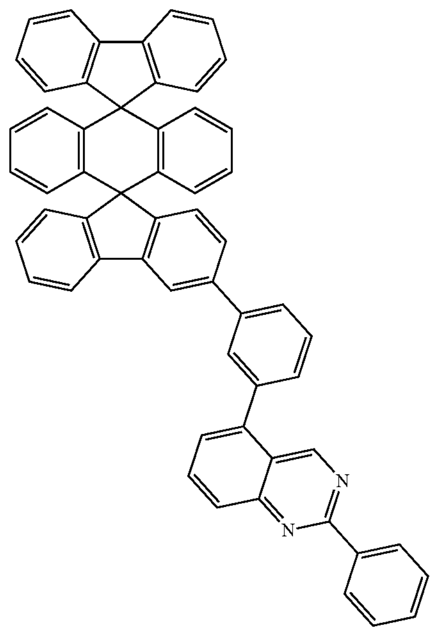
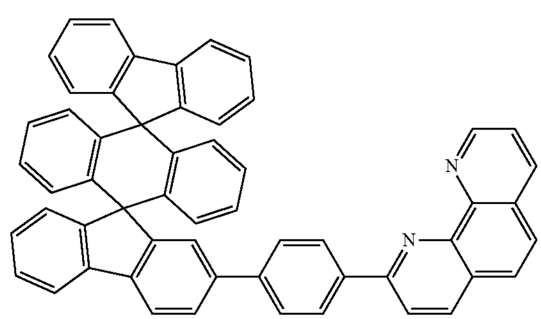

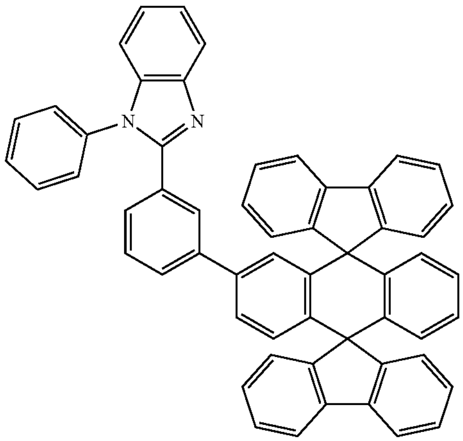
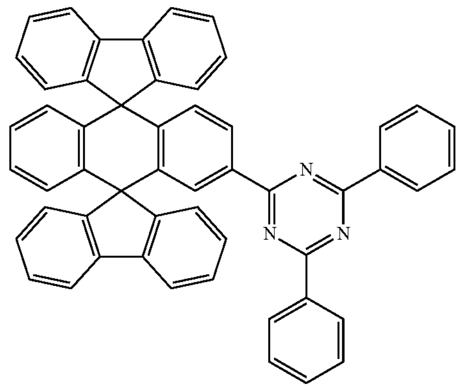
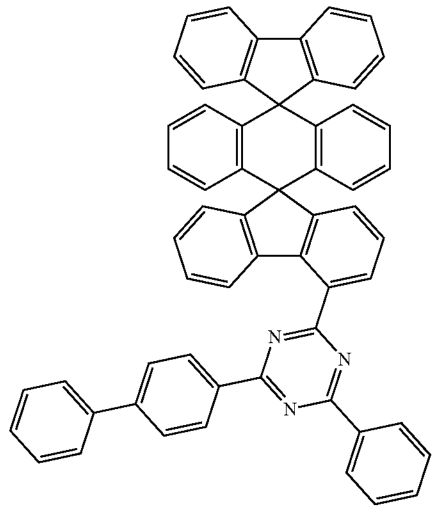
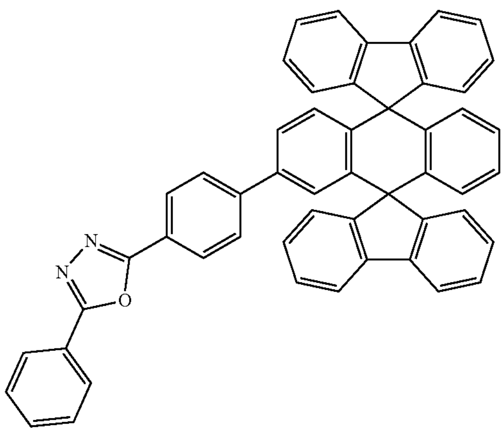
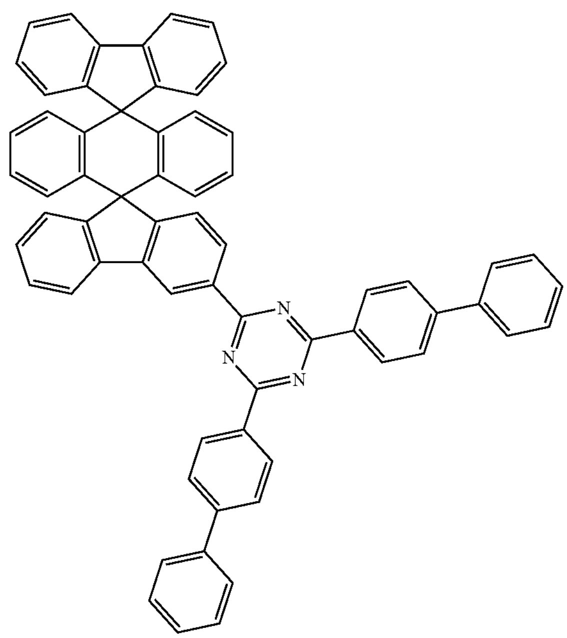
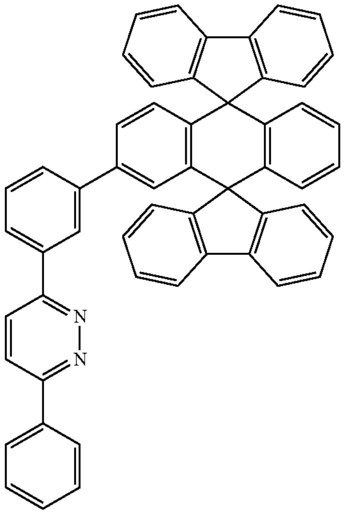

-continued
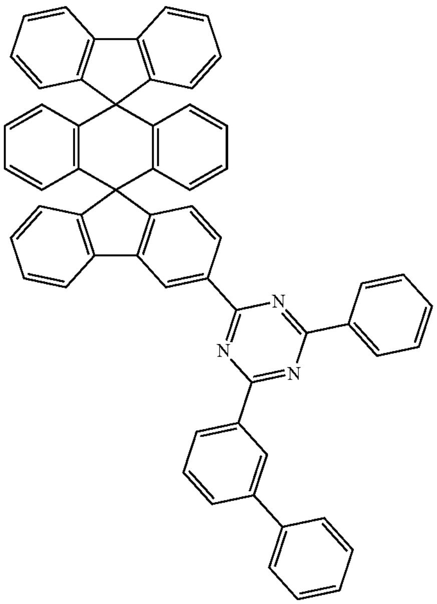
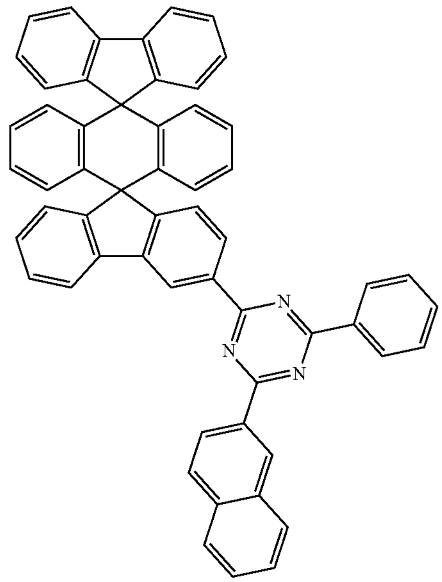
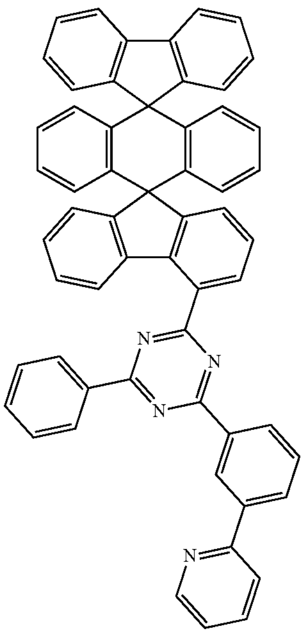
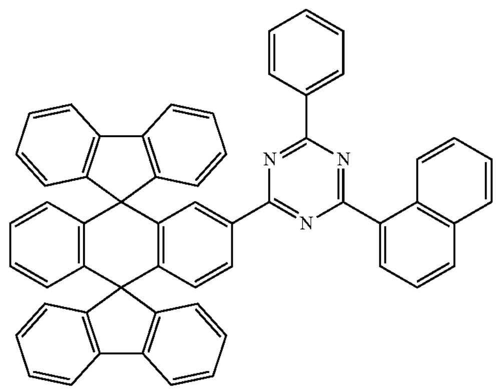
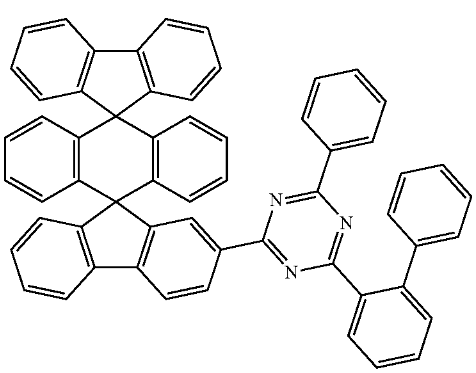
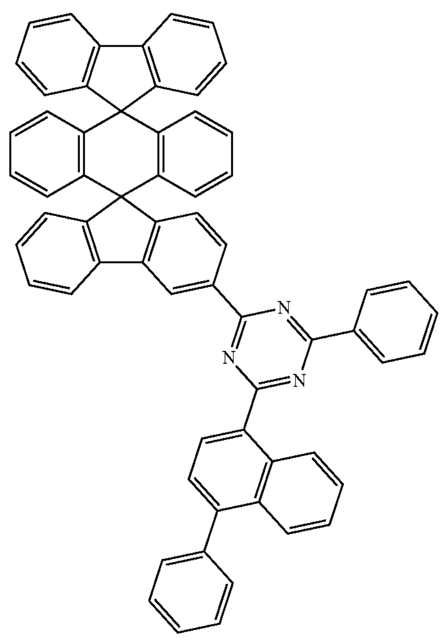
-continued -continued
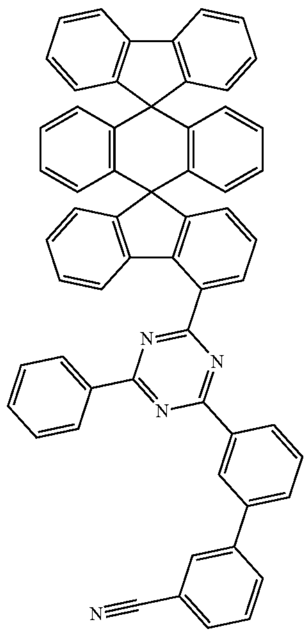
-continued
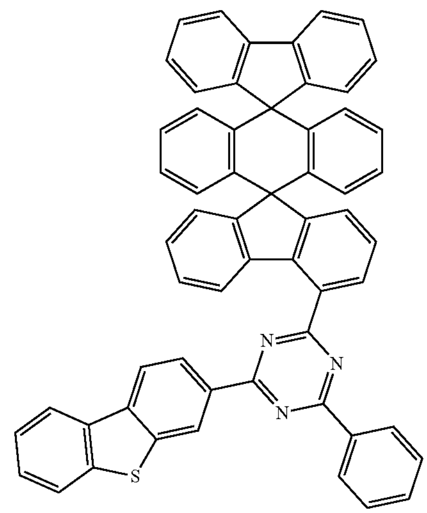
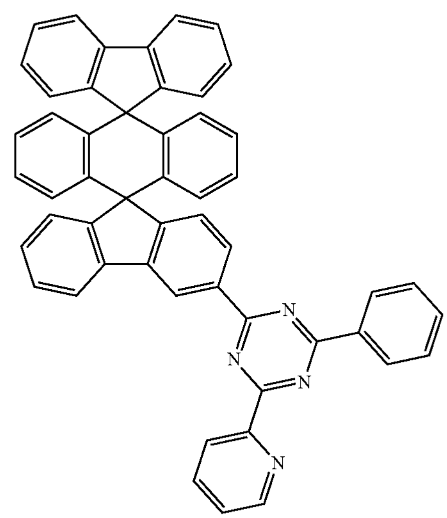
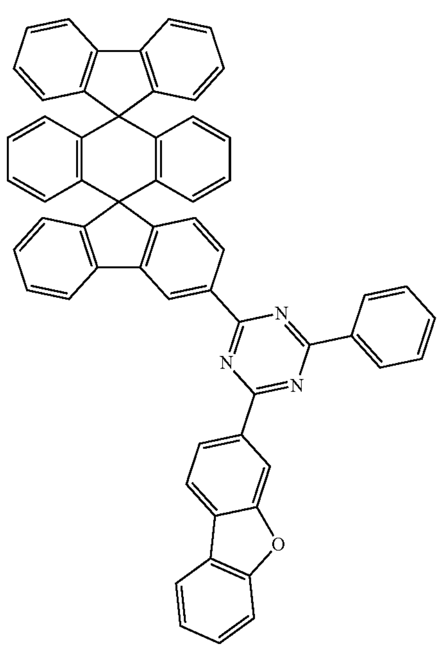
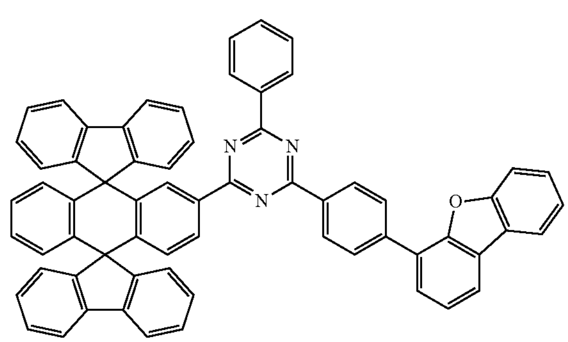

-continued
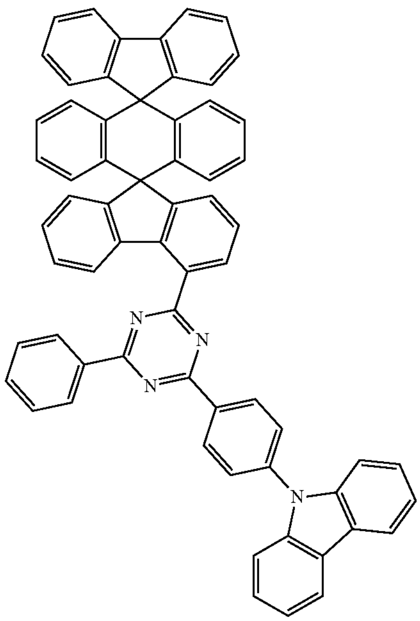
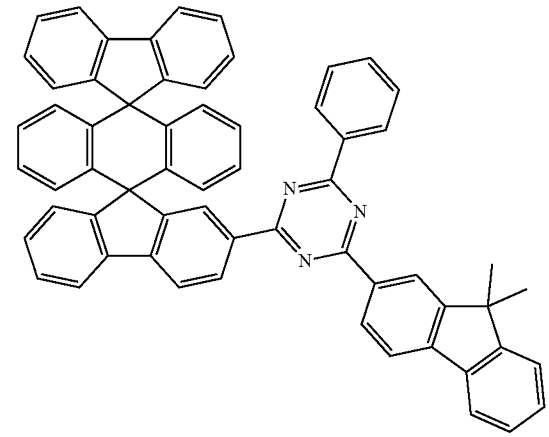
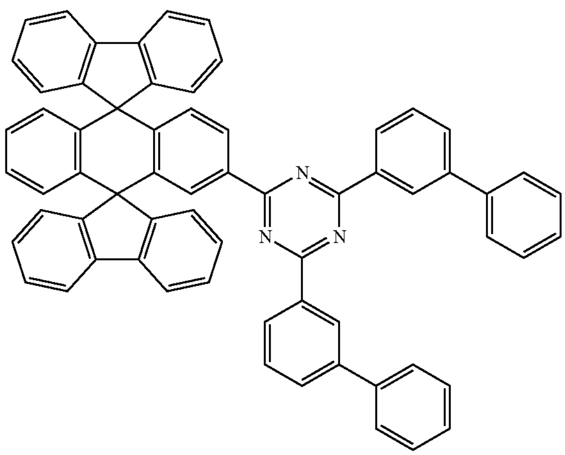
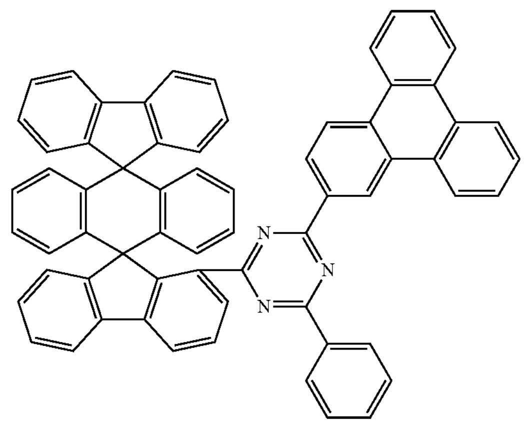
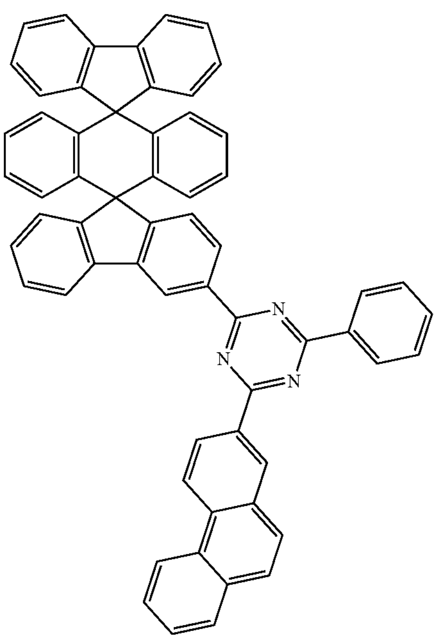
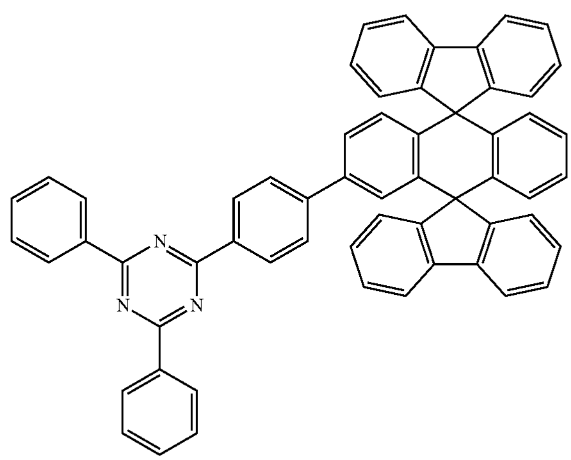

-continued
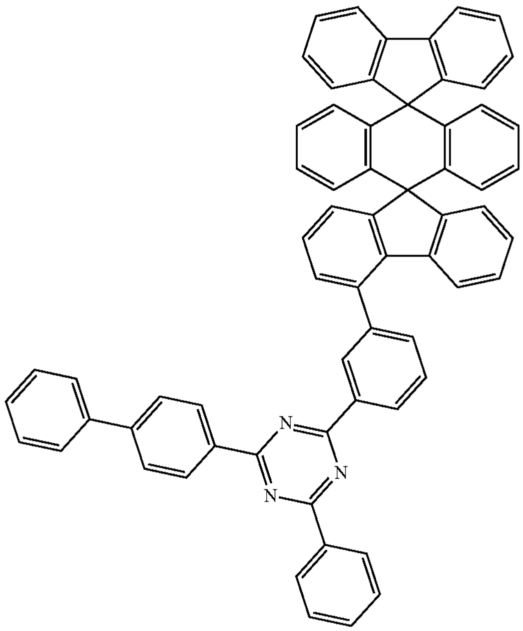
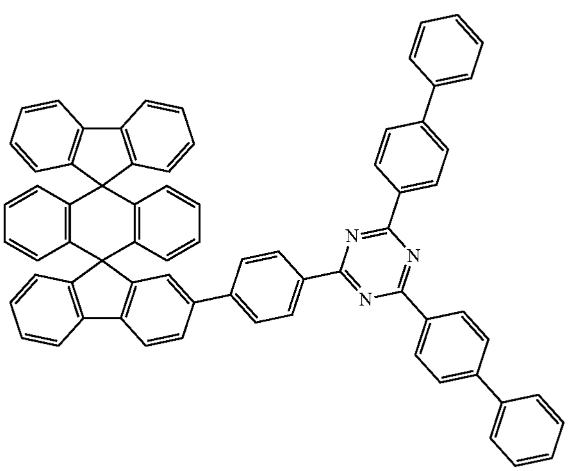
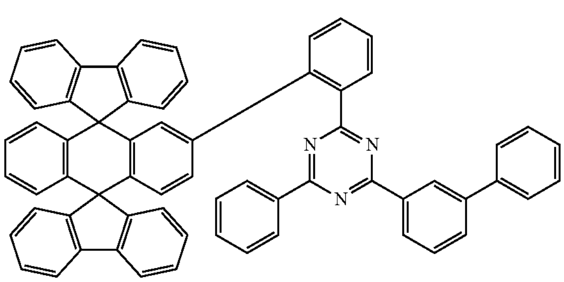
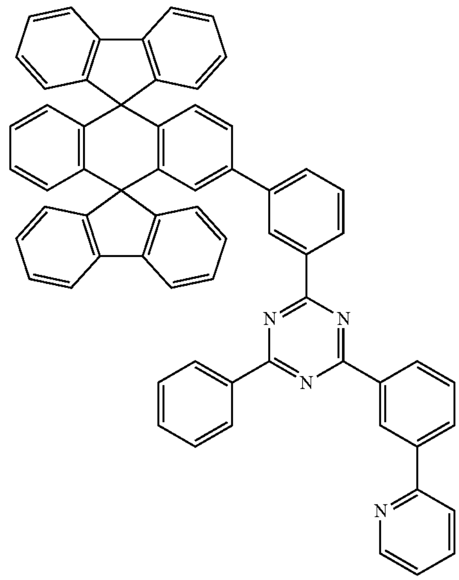
-continued
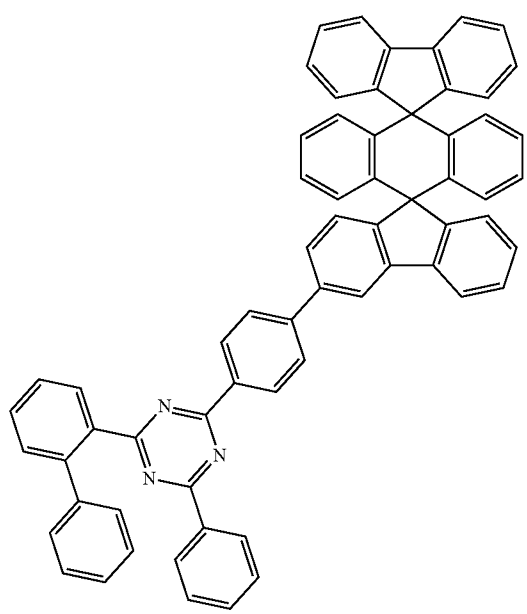

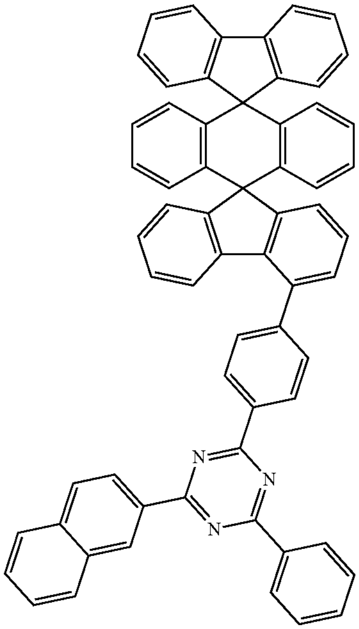
N
N
N
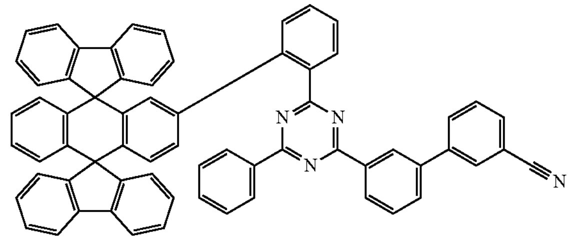
N
N
N
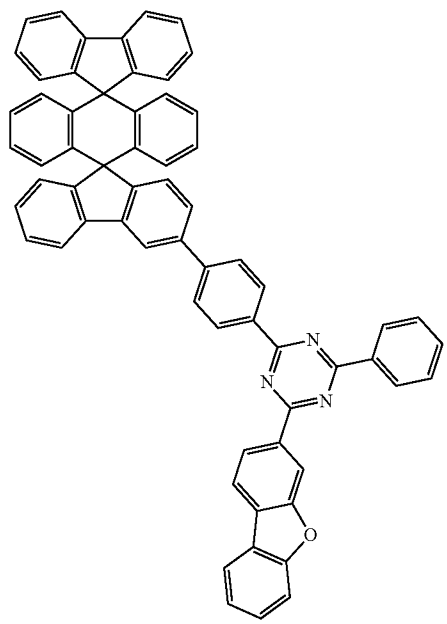
N
N
N
N
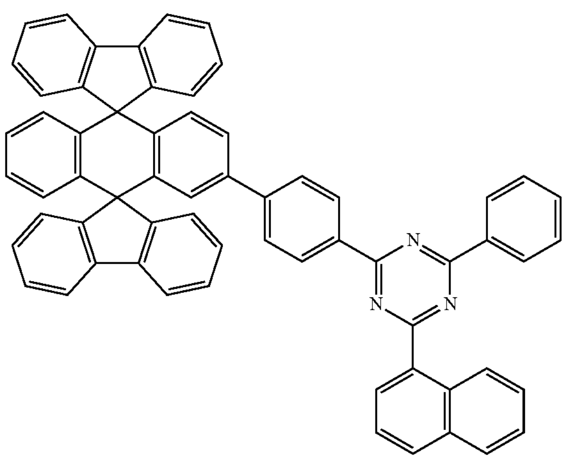
N
N
N
O
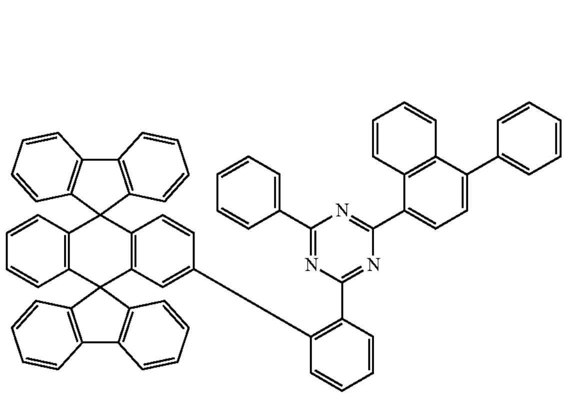
N
N
N
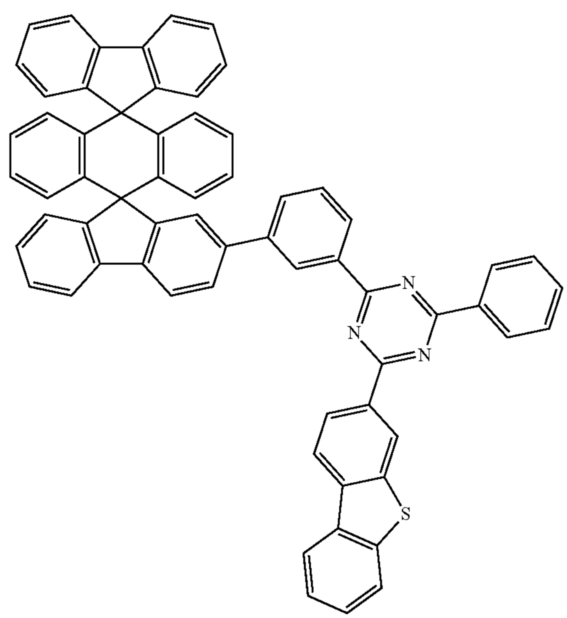
N
N
N
S -continued
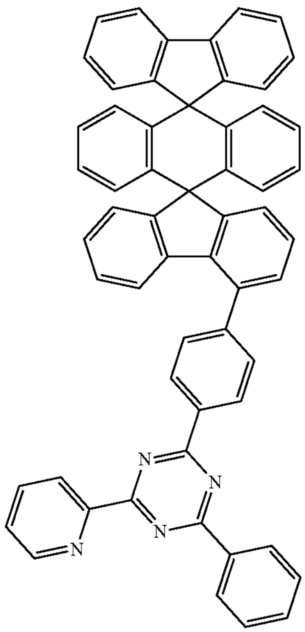
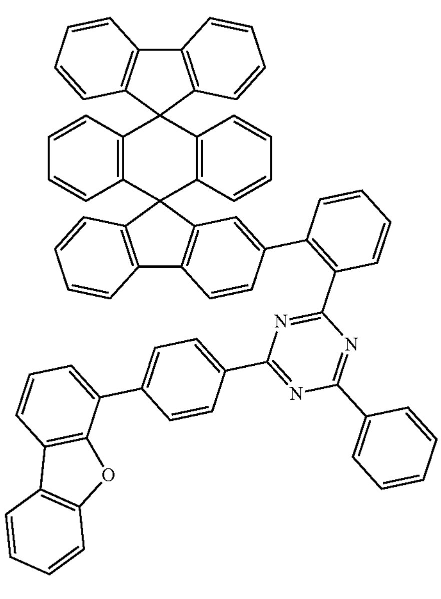
-continued
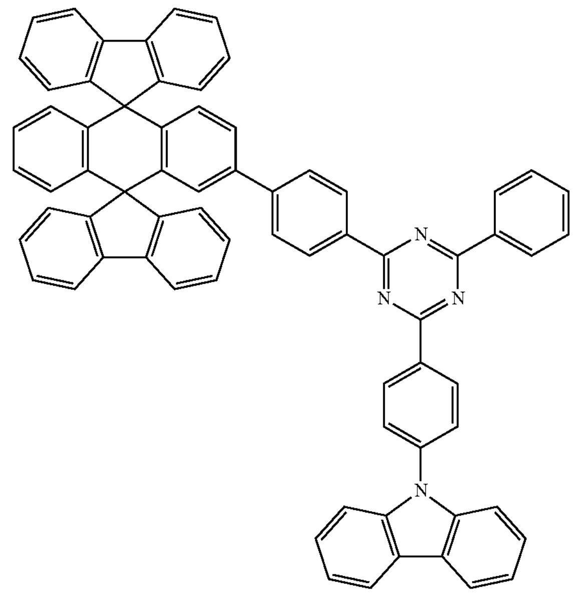
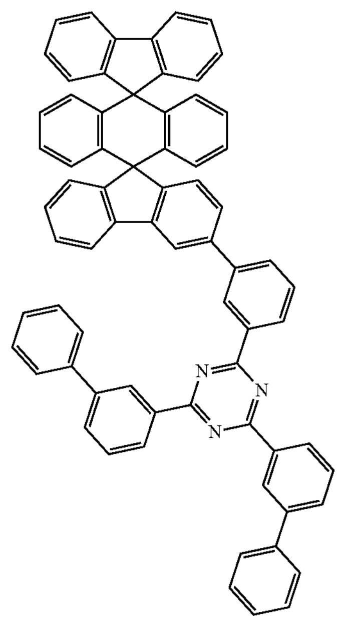
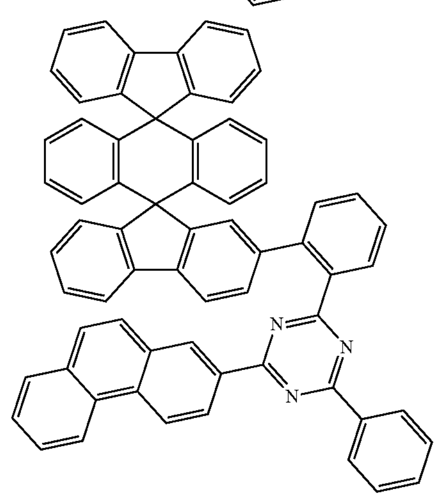

-continued
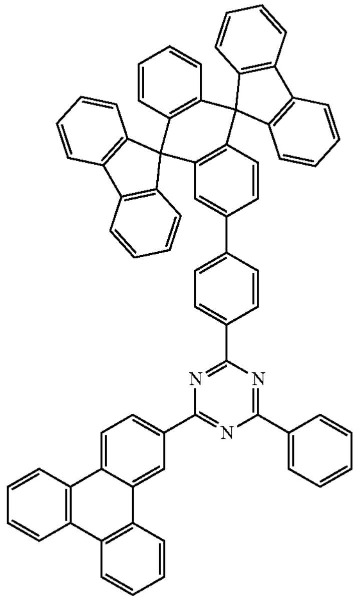
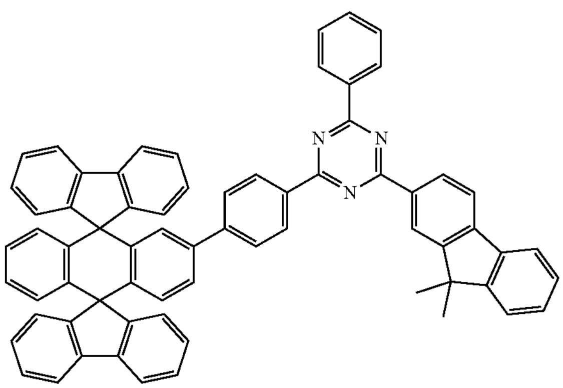
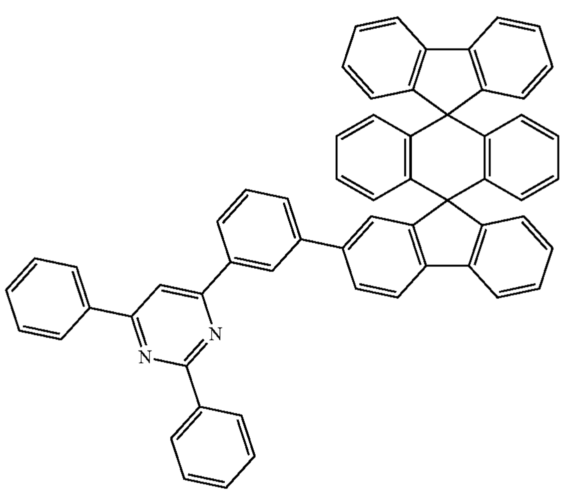
-continued
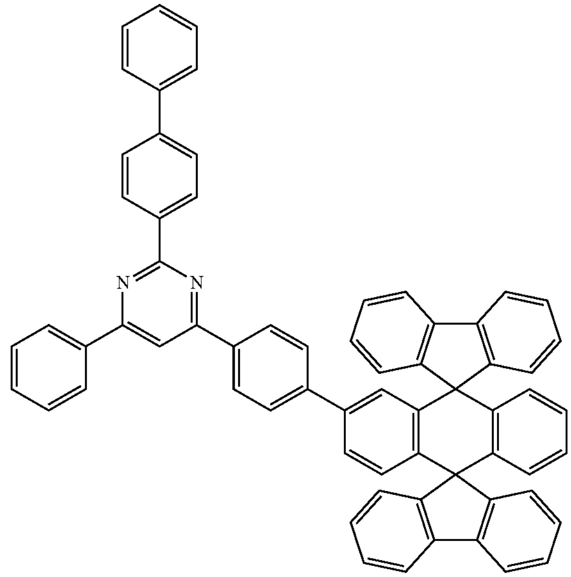
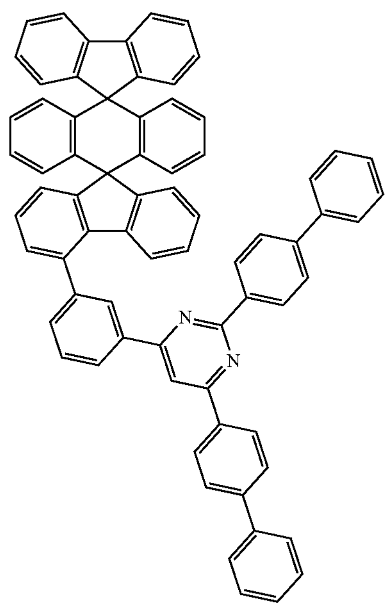

-continued
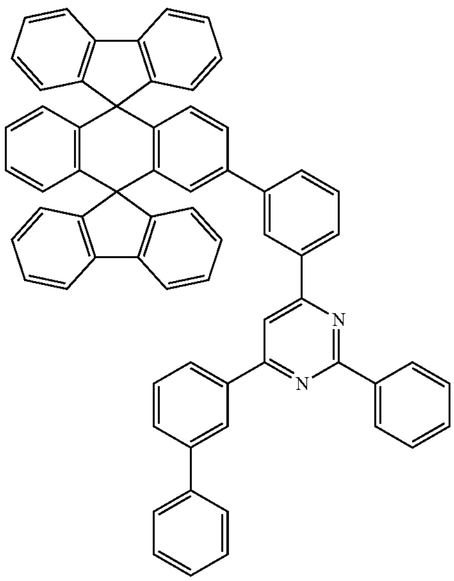
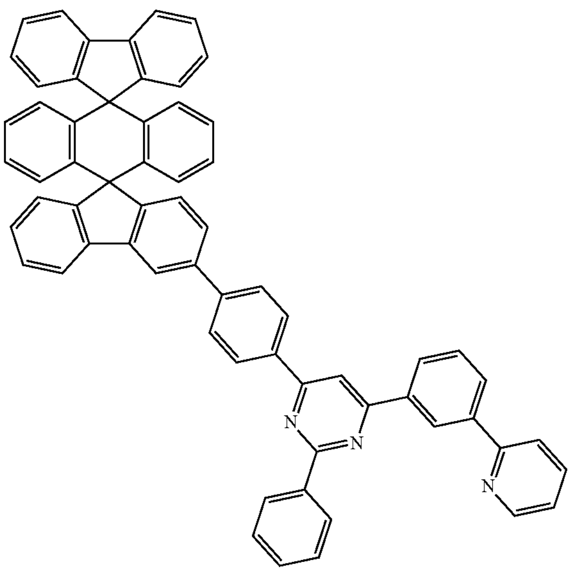
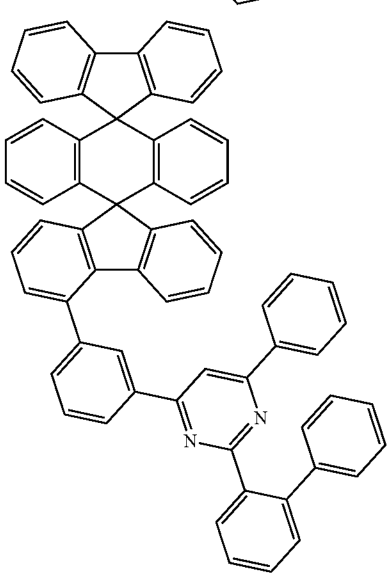
-continued
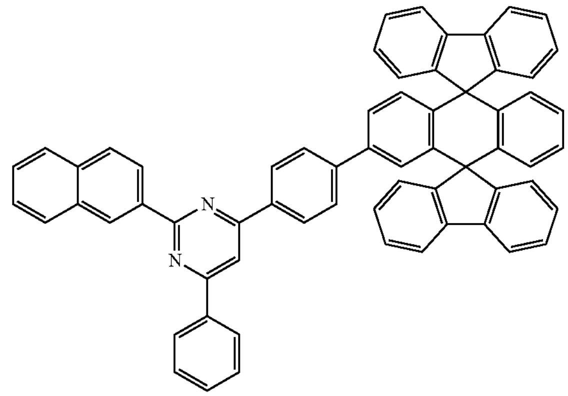
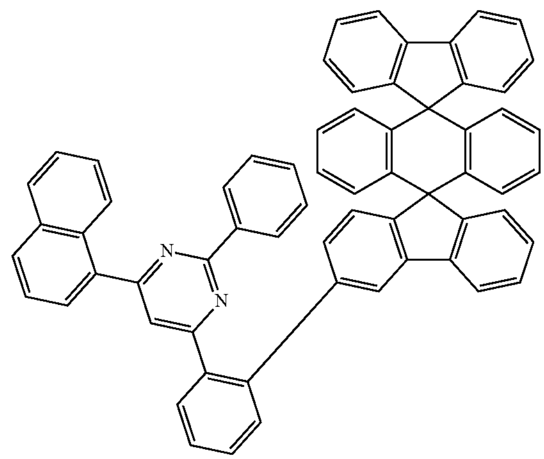
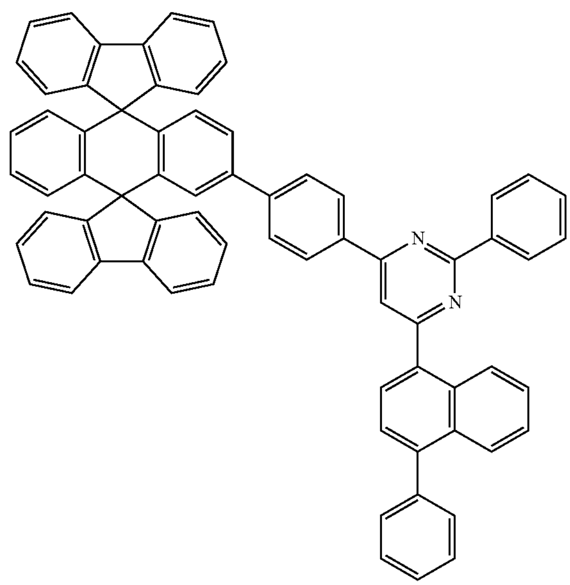

-continued
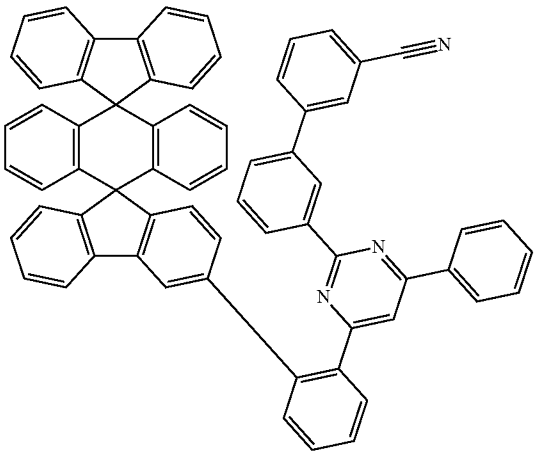
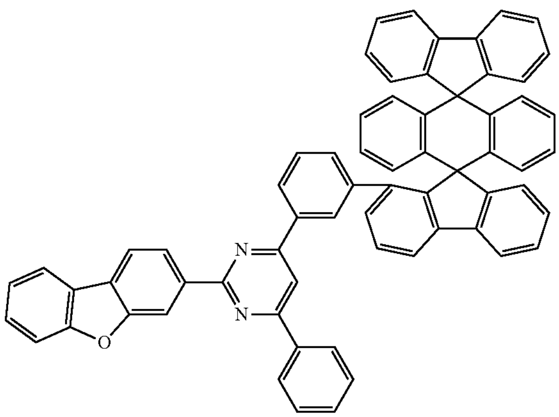
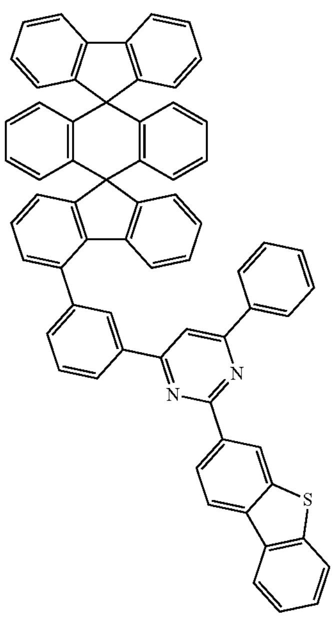
-continued
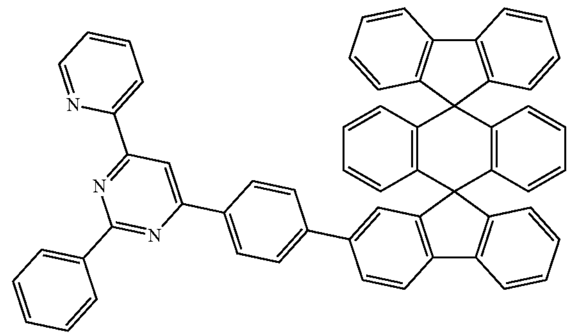
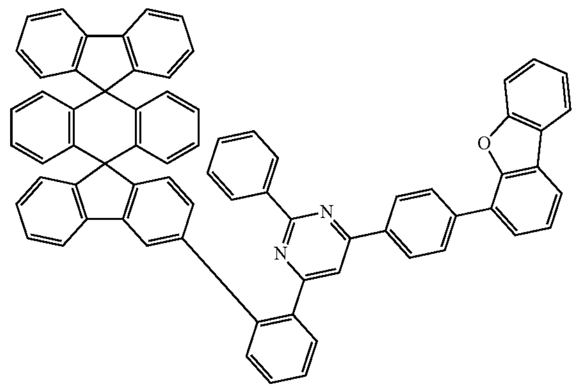
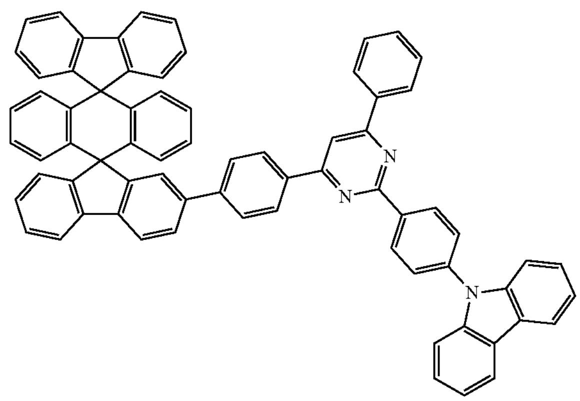
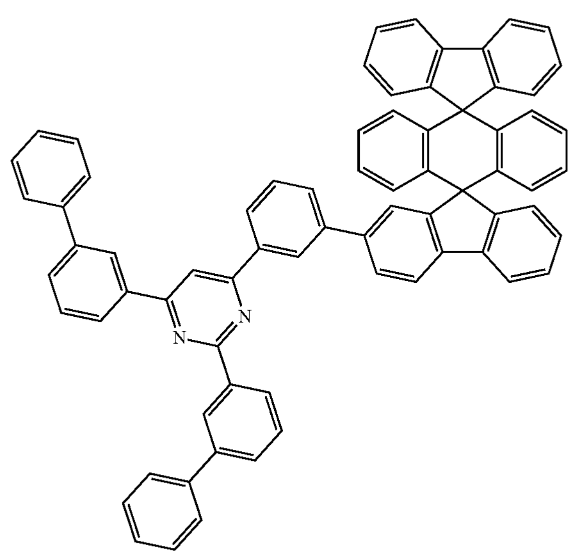

-continued
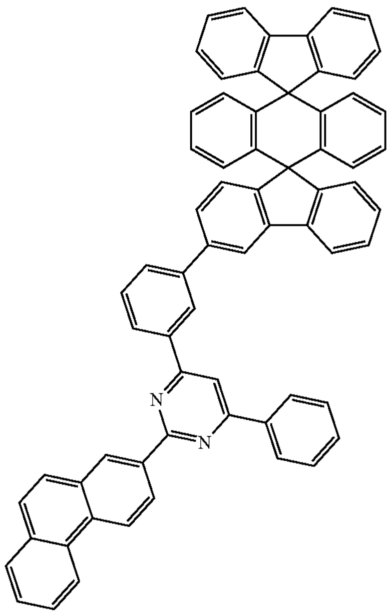
-continued
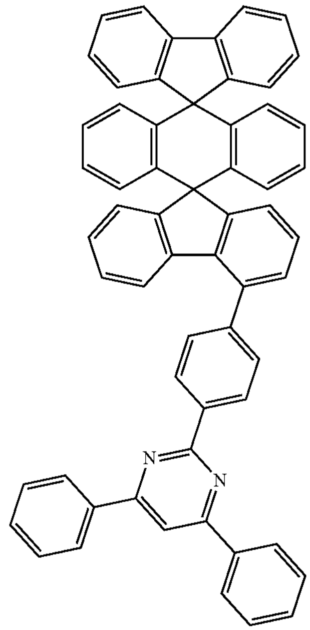
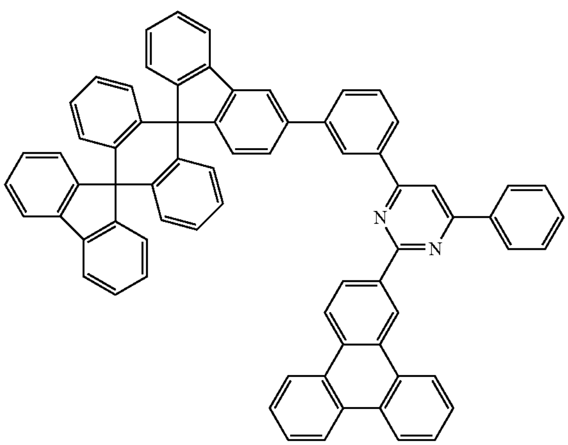
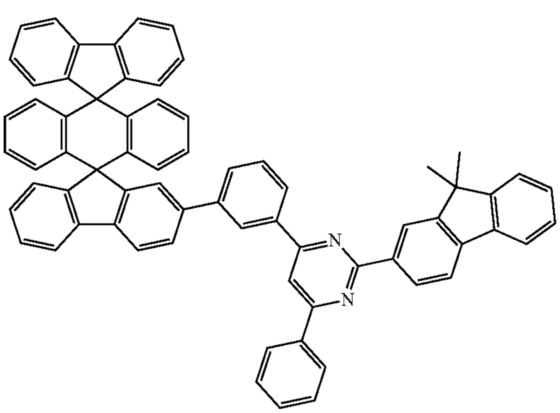
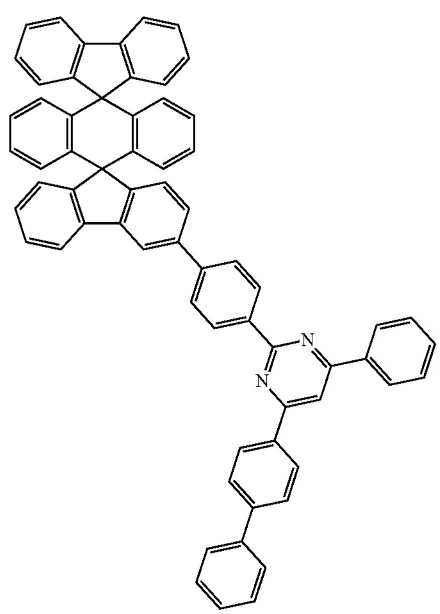

-continued
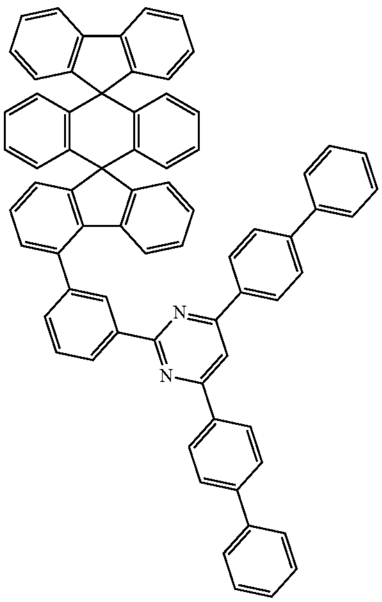
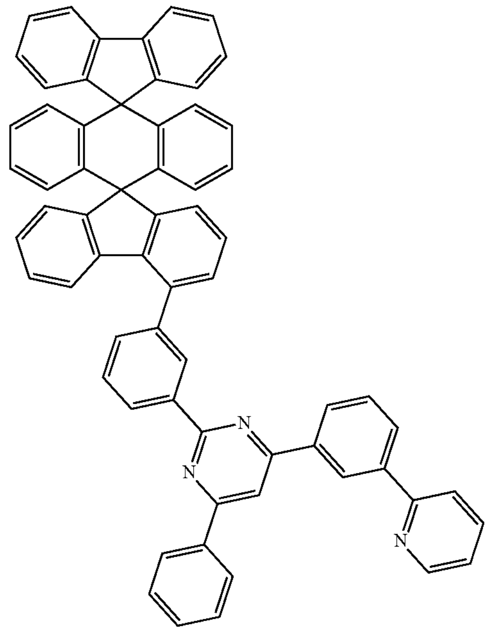
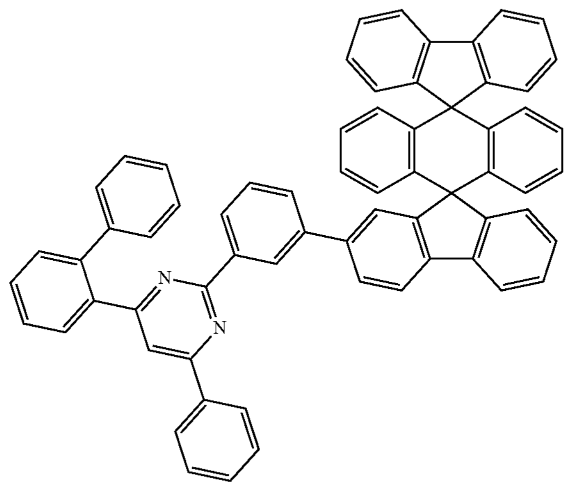
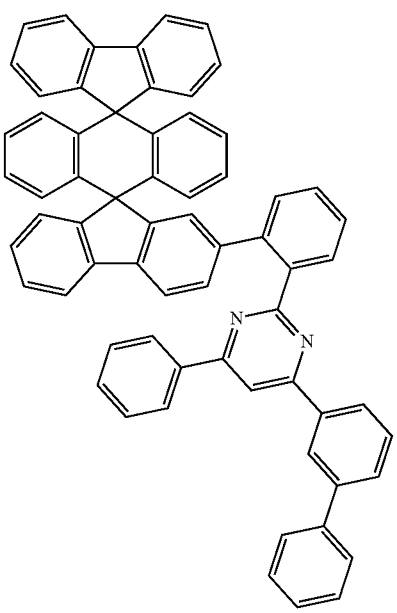
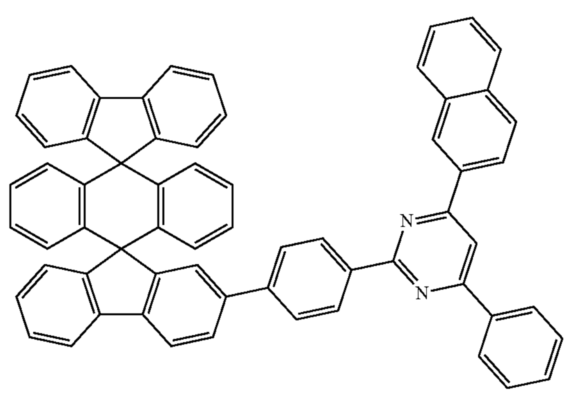

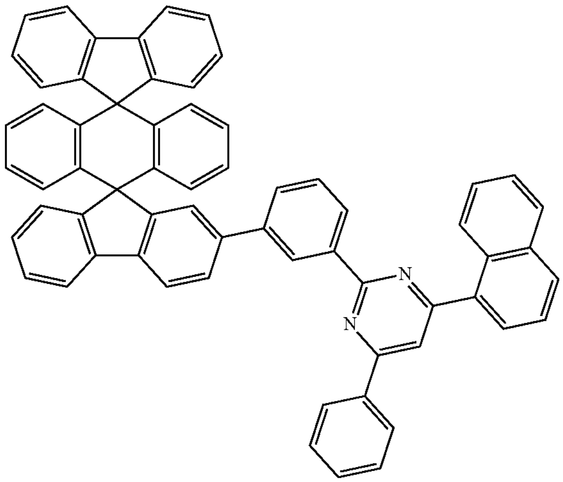
N
N
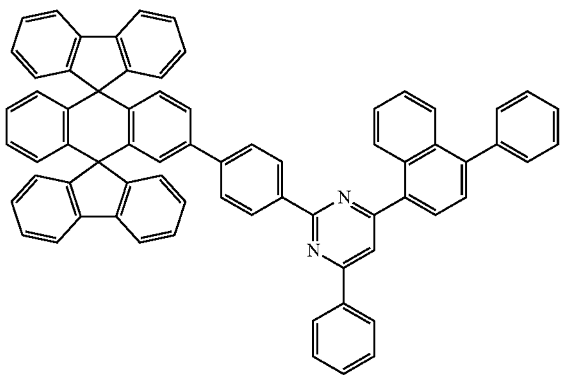
N
N
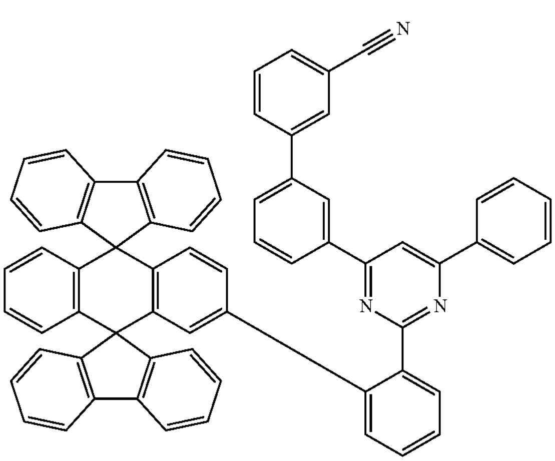
N
N
N
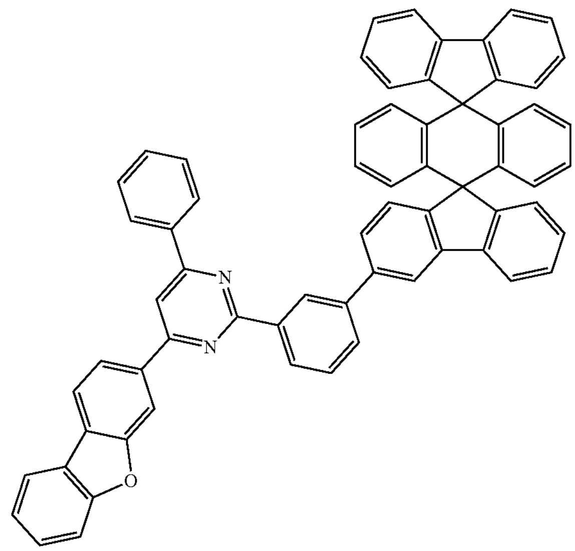
N
N
O
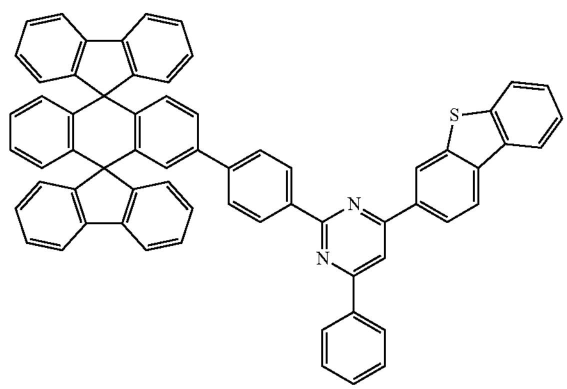
S
N
N
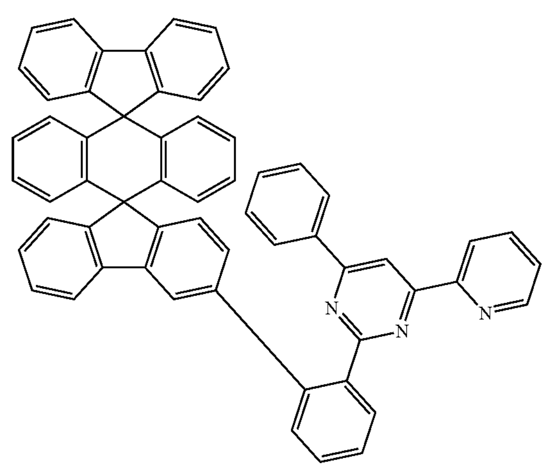
N
N
N

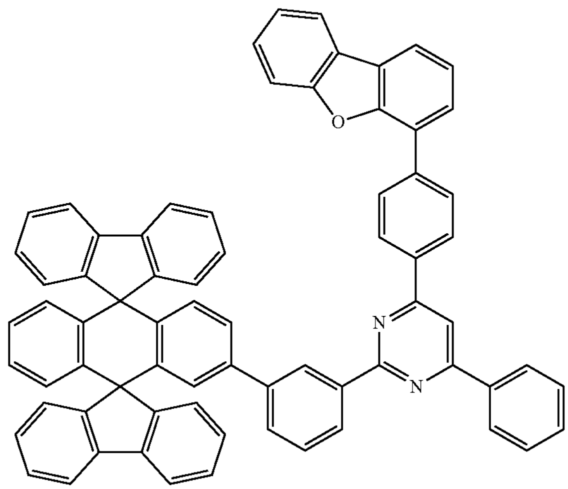
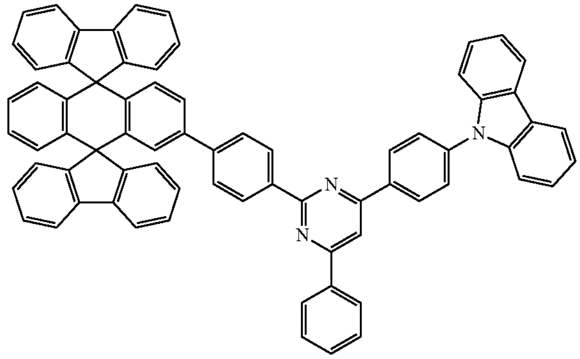
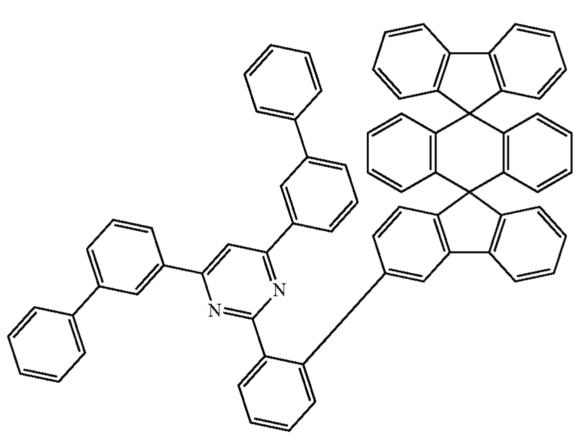
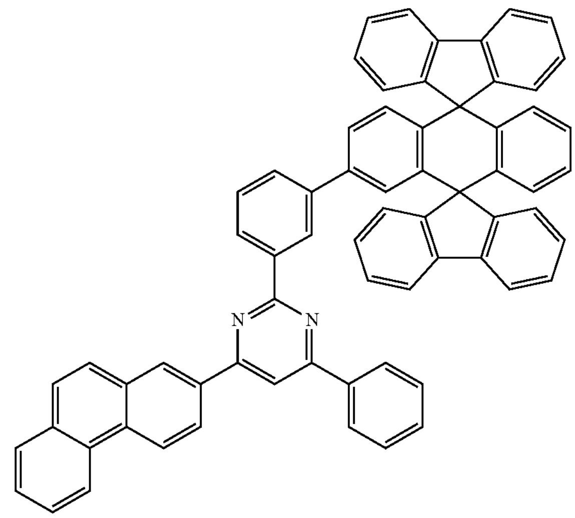
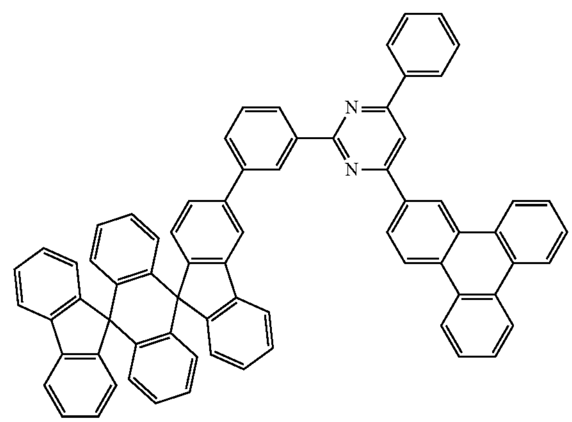
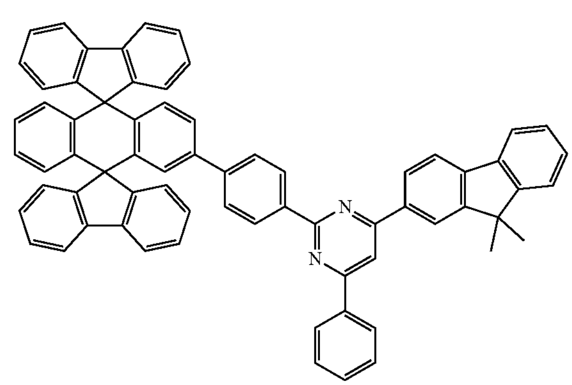

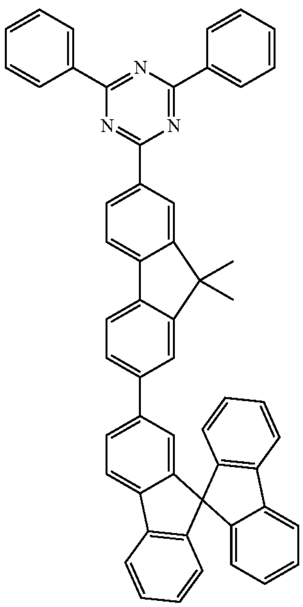
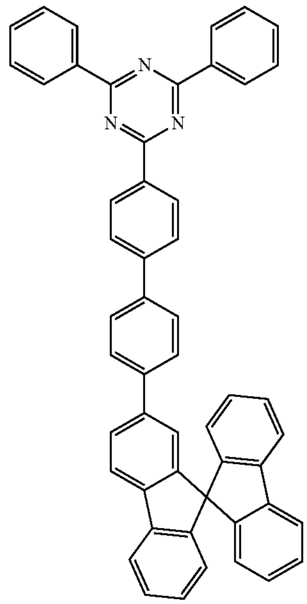
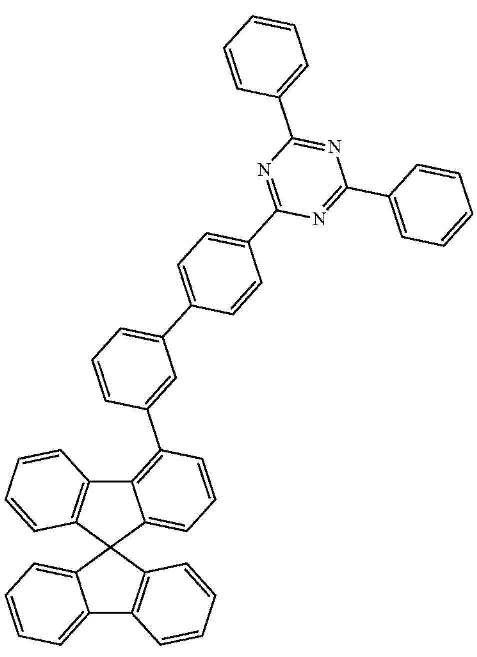
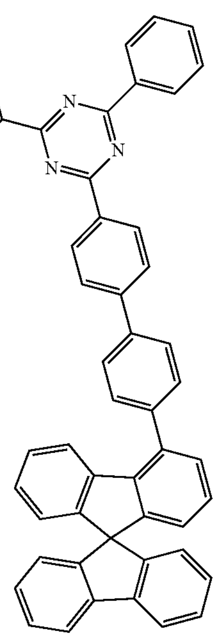

-continued
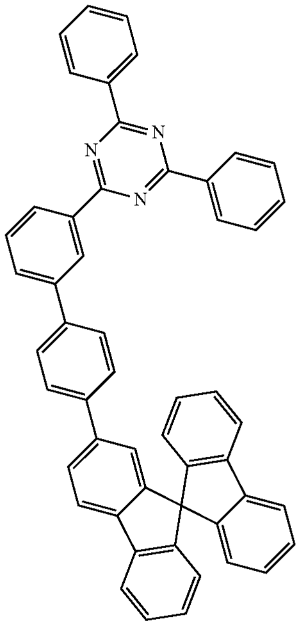
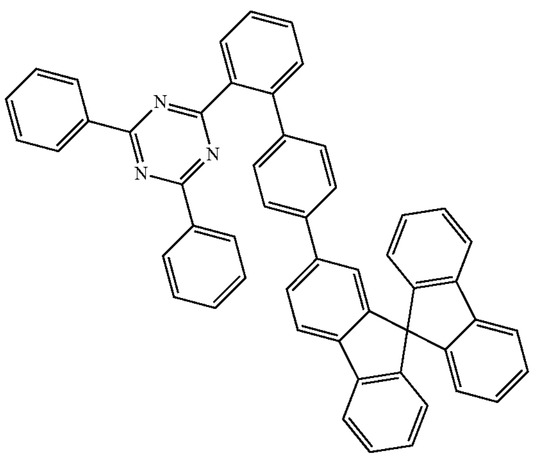
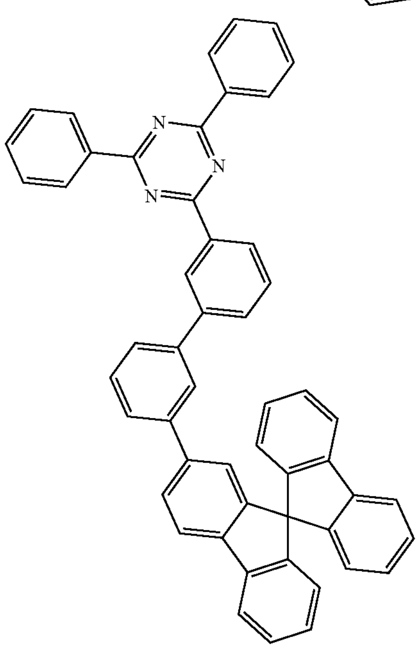
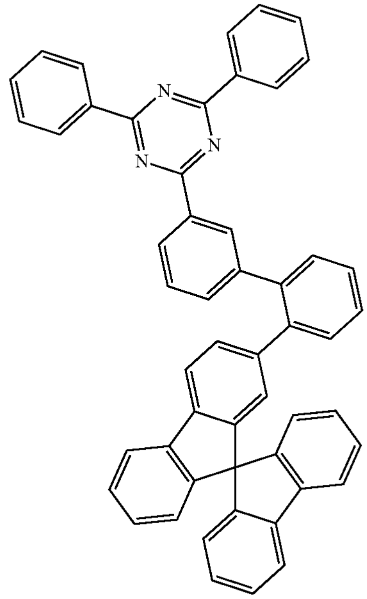
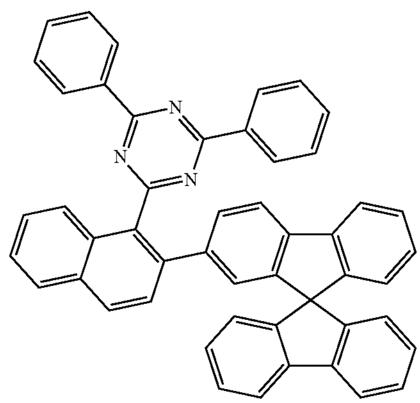
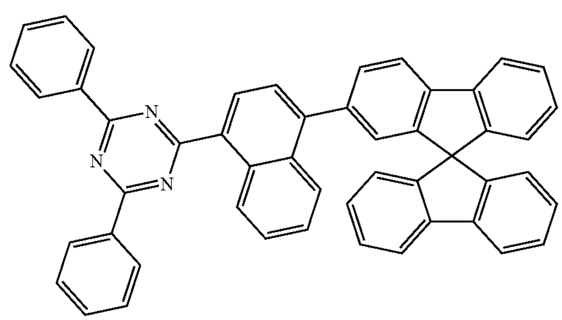
-continued -continued
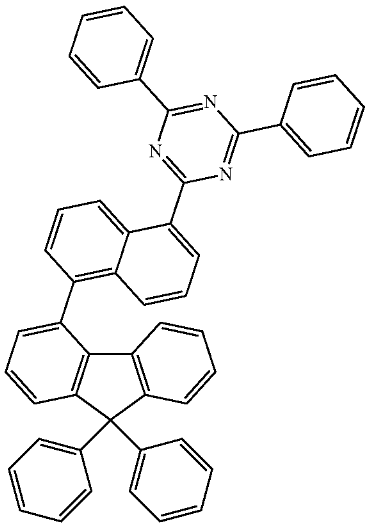
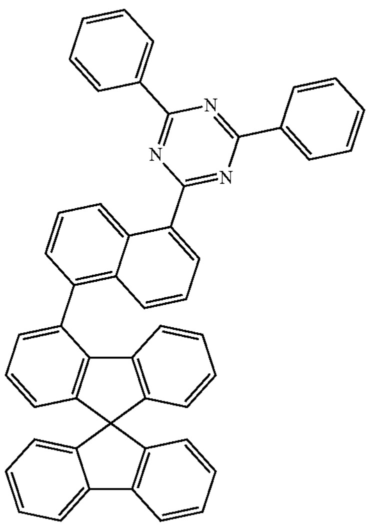
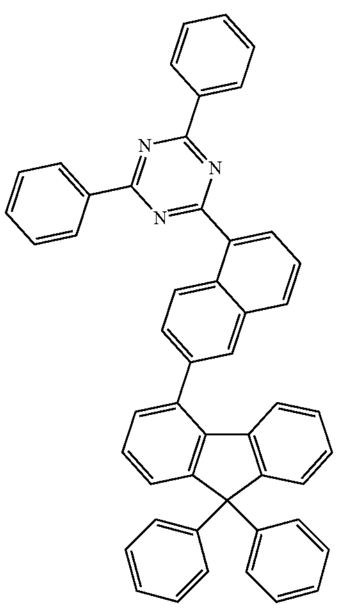
-continued
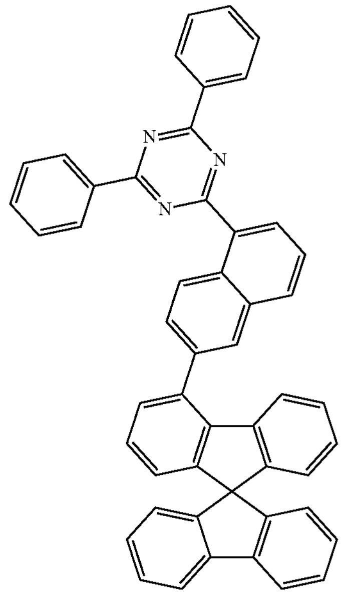
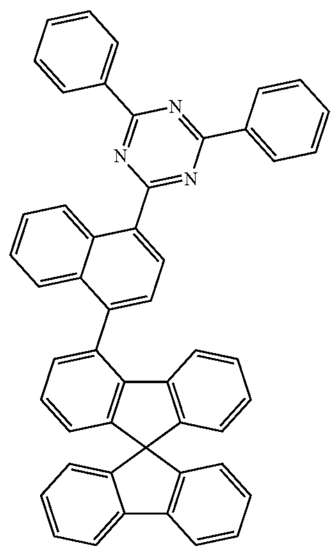
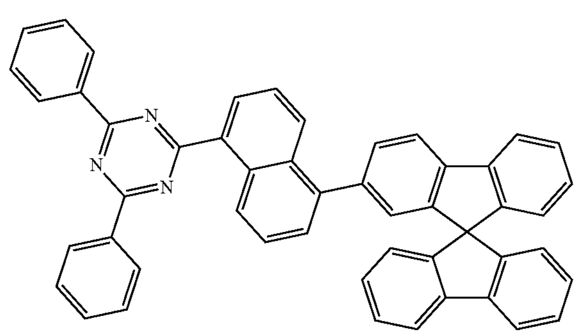

-continued
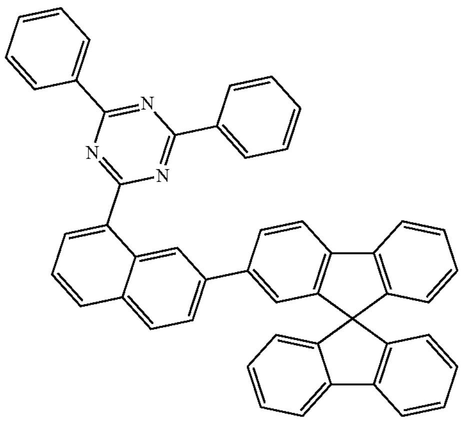
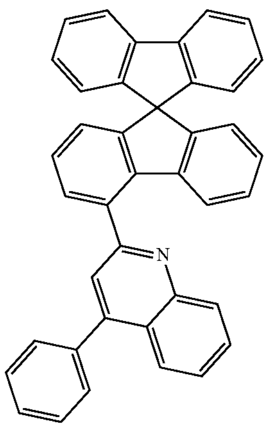
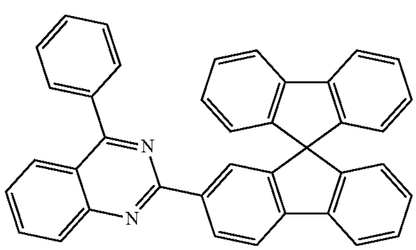
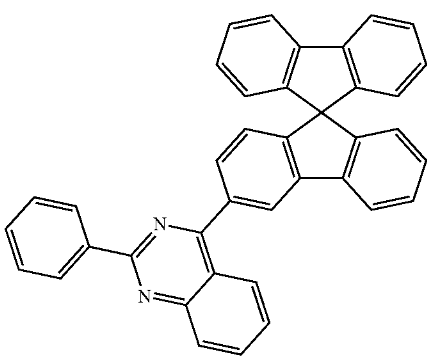
-continued
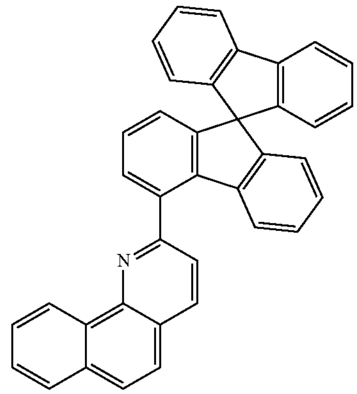
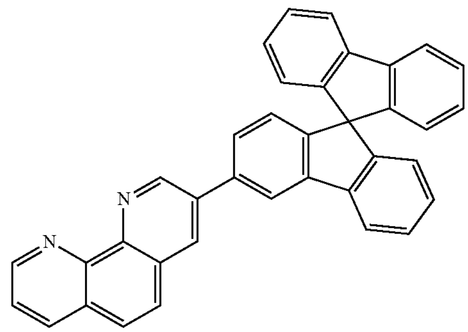
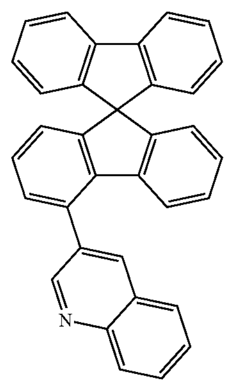
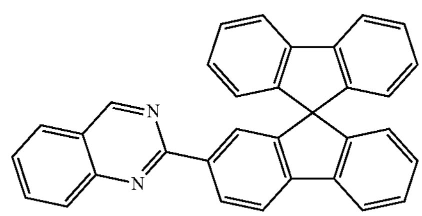
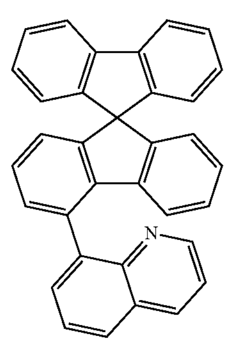

-continued
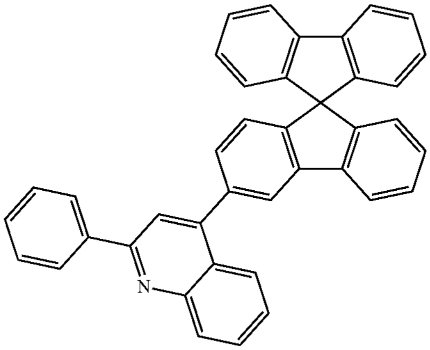
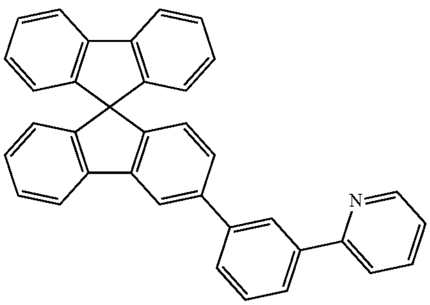
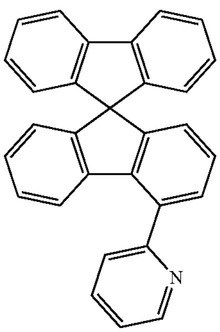
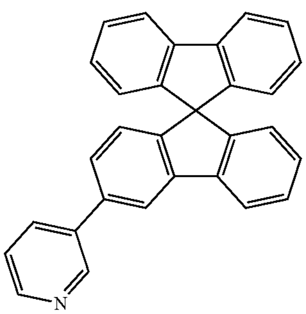
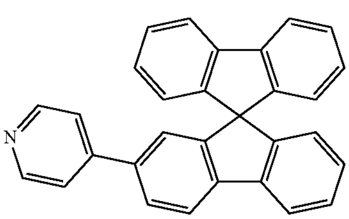
-continued
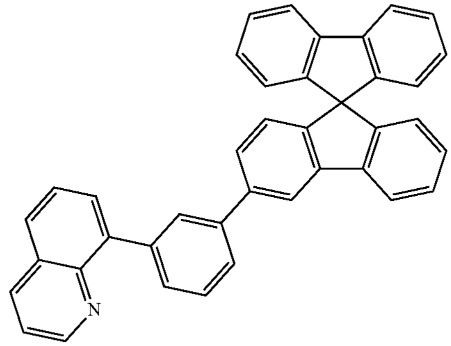
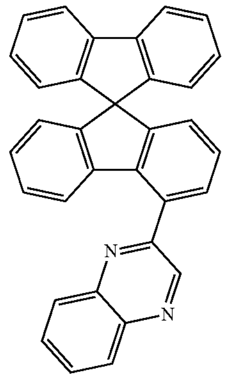
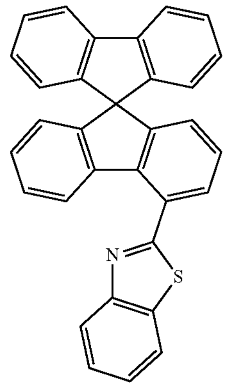
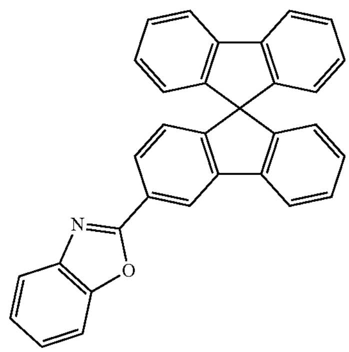
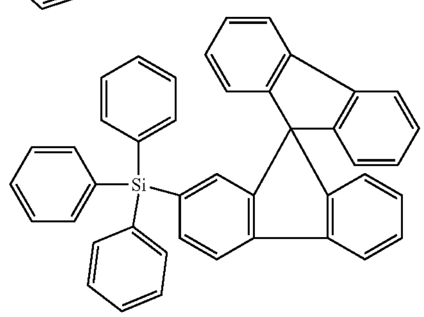
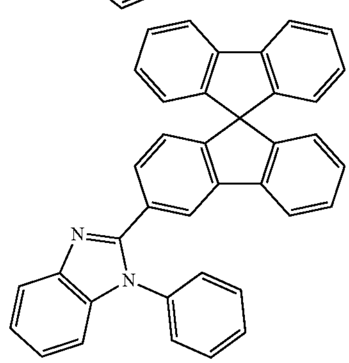

-continued
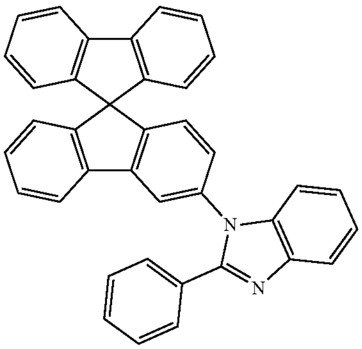
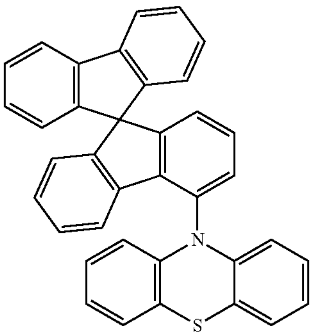
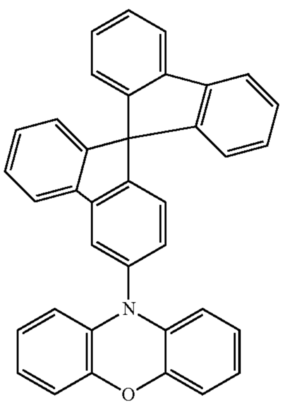
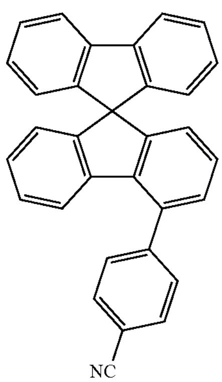
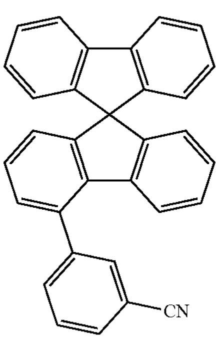
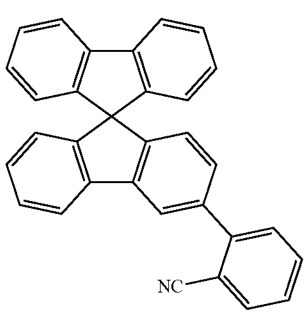
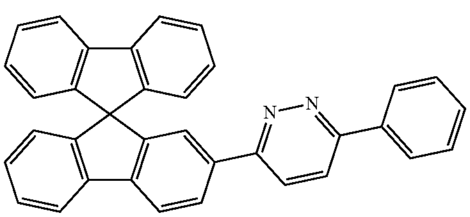
-continued
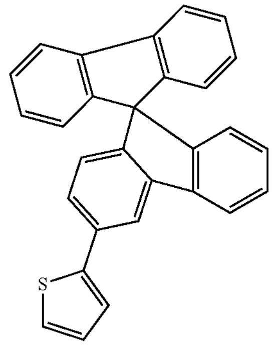
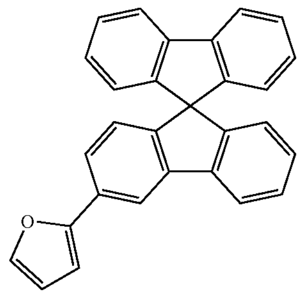
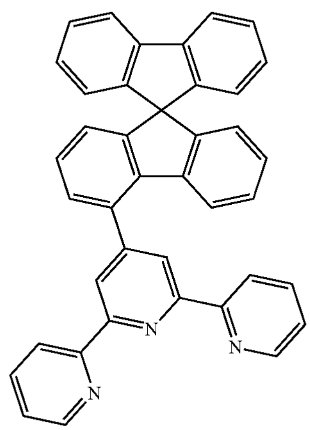
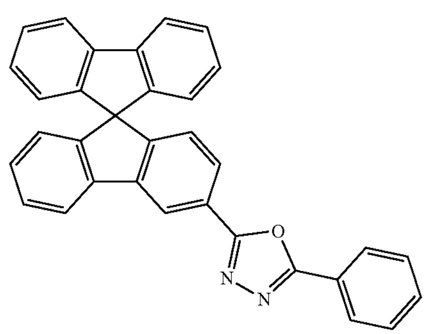

-continued
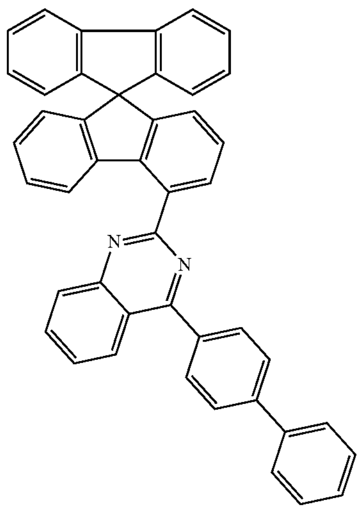
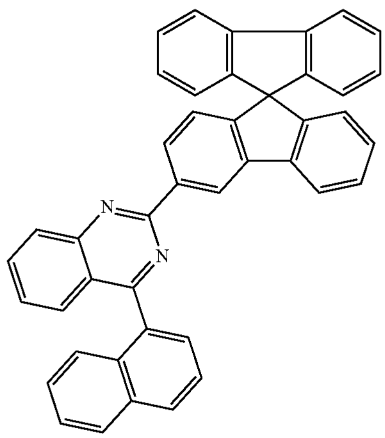
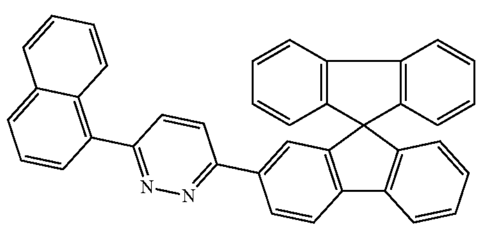
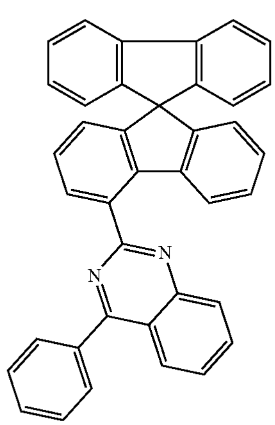
-continued
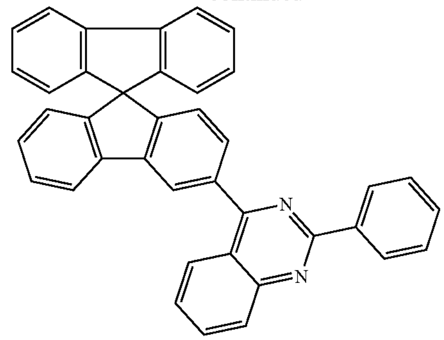
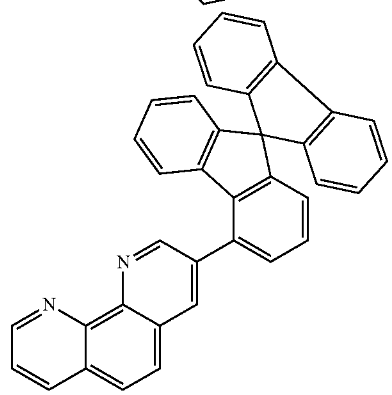
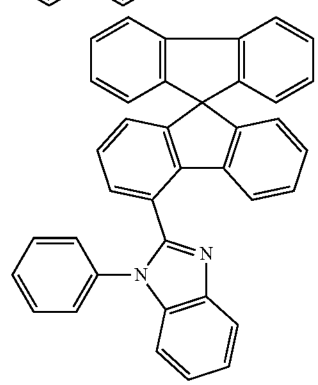
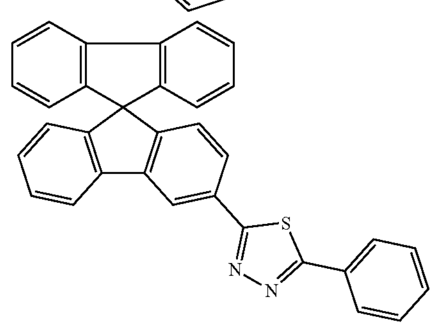
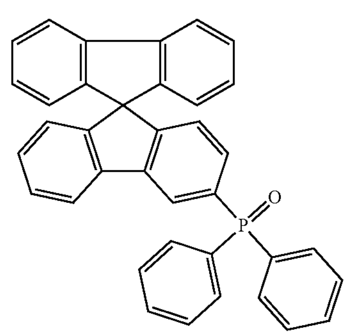

-continued
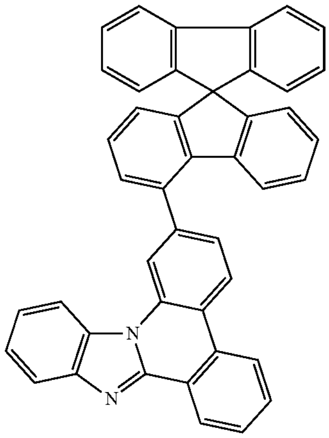
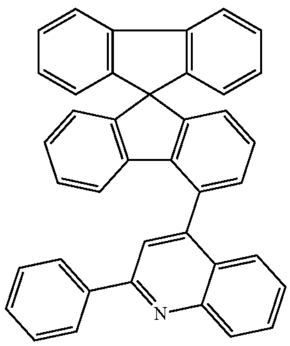
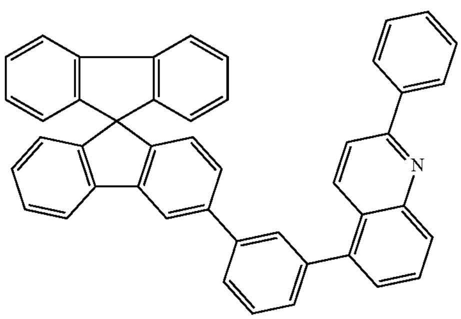
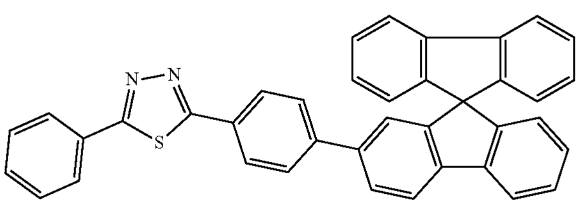
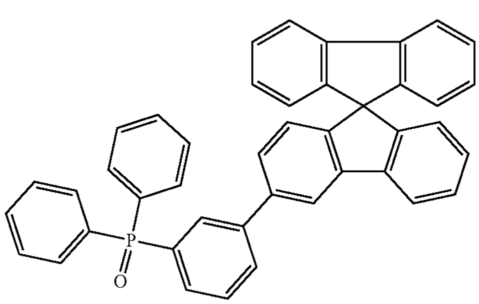
-continued
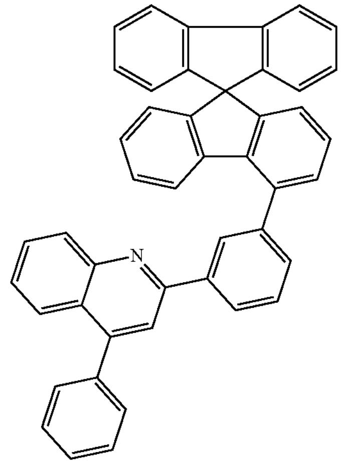
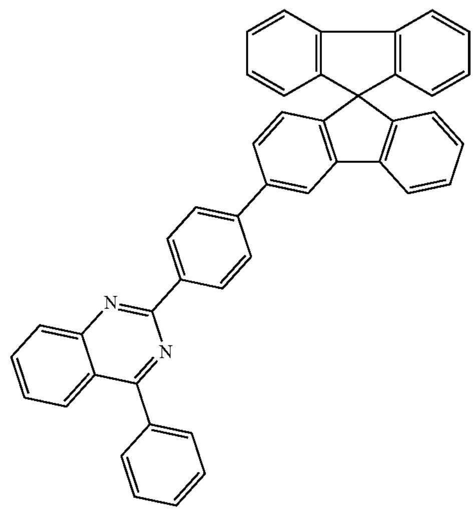
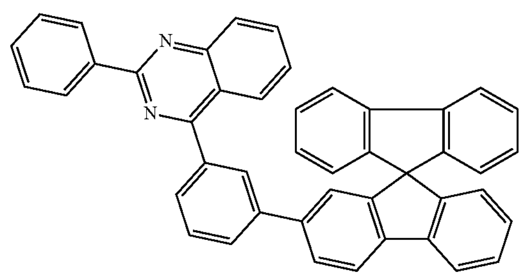
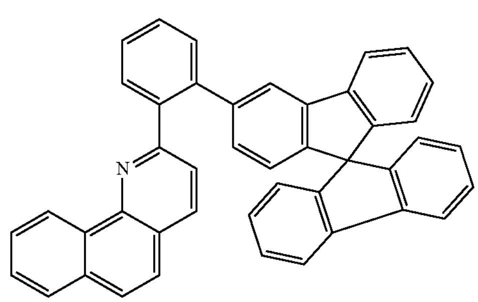

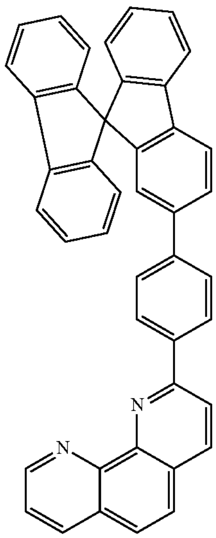
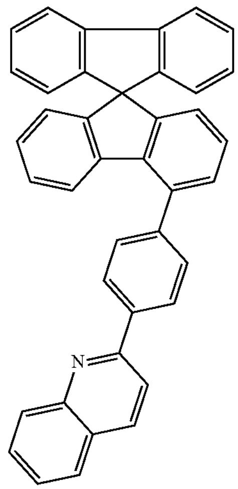
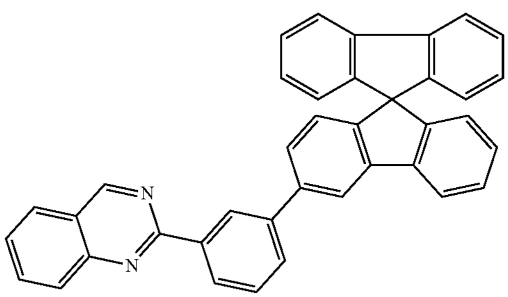
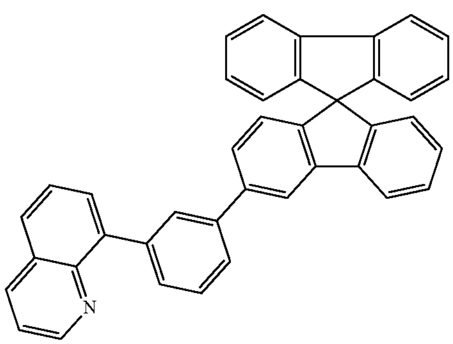
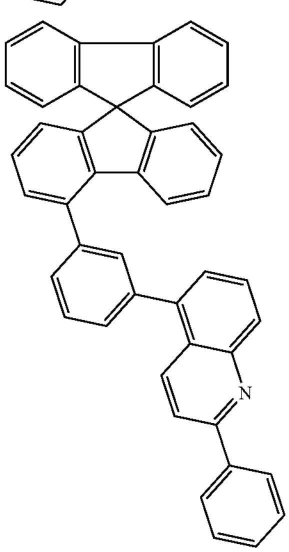
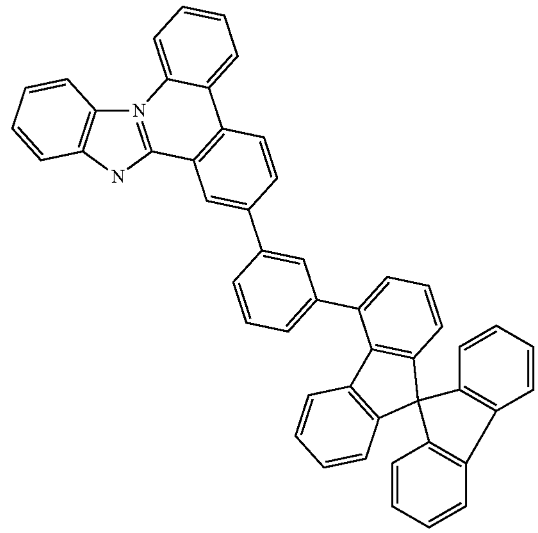
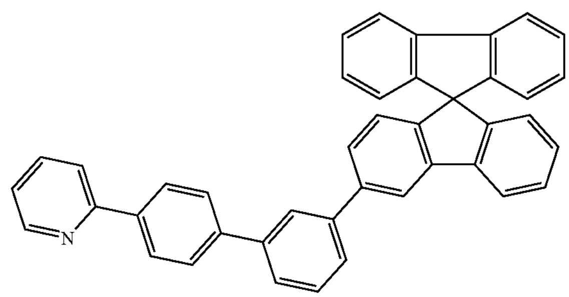
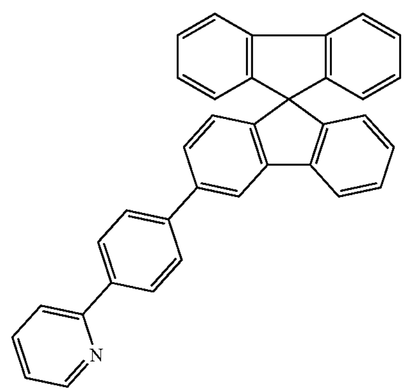
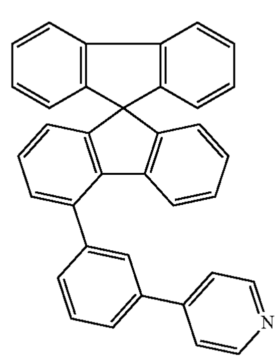

-continued
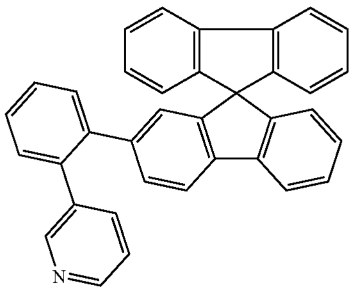
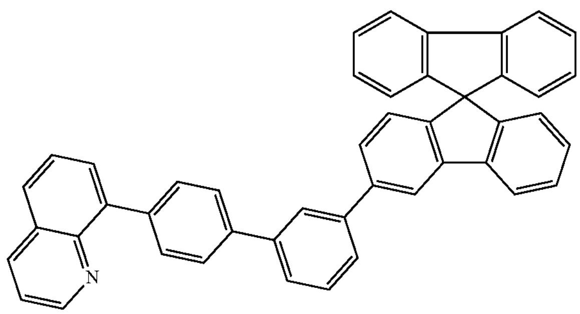
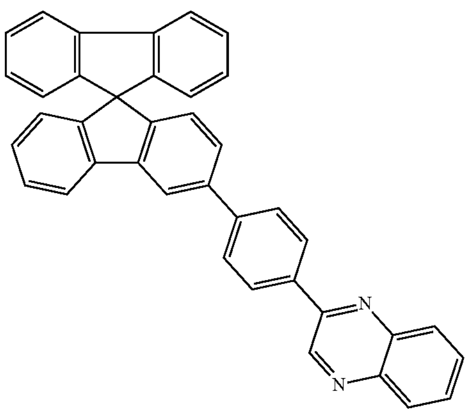
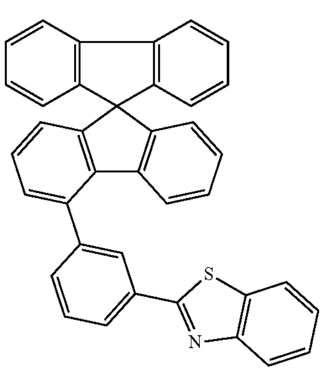
-continued
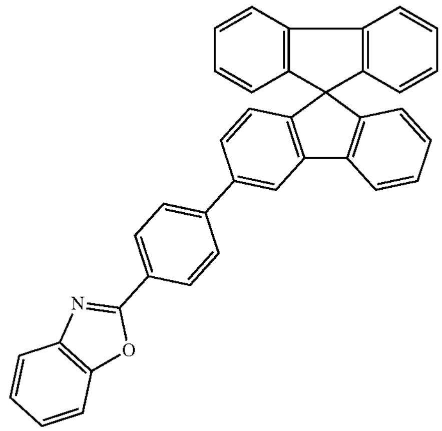
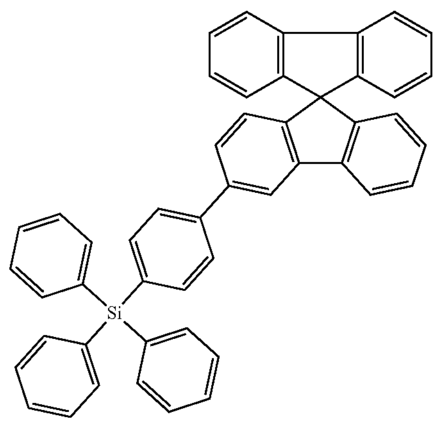
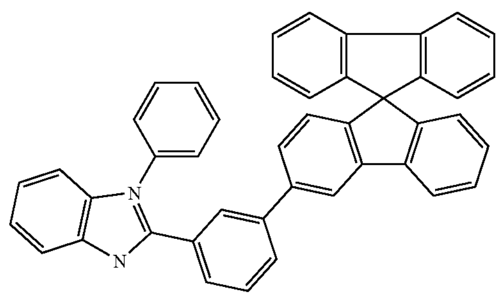
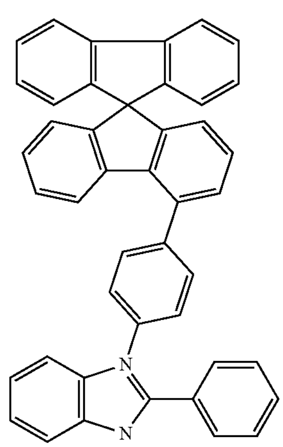

-continued
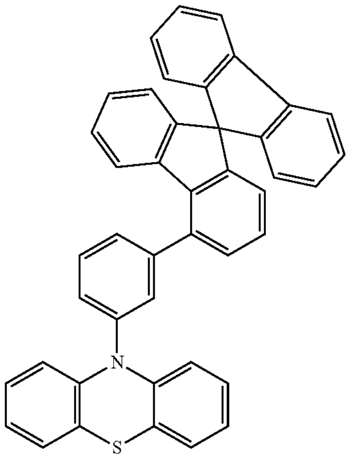
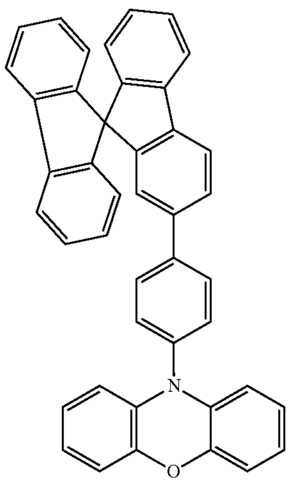
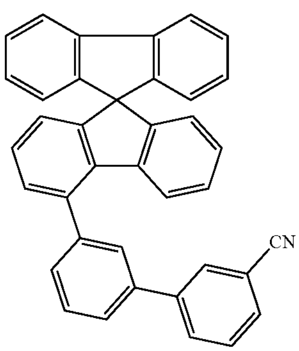
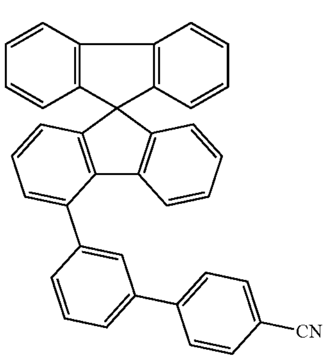
-continued
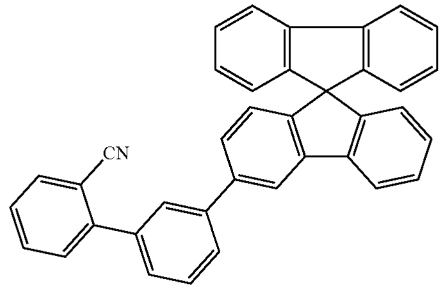
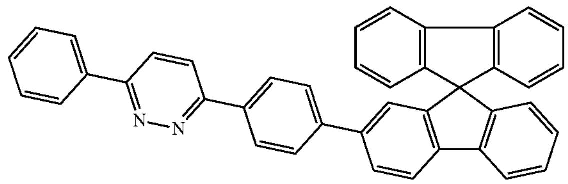
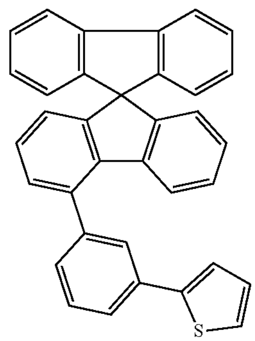
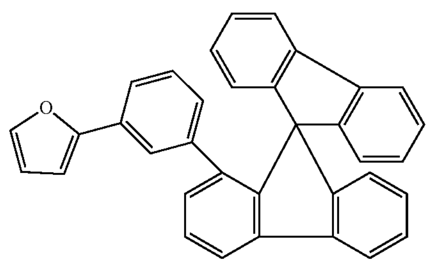
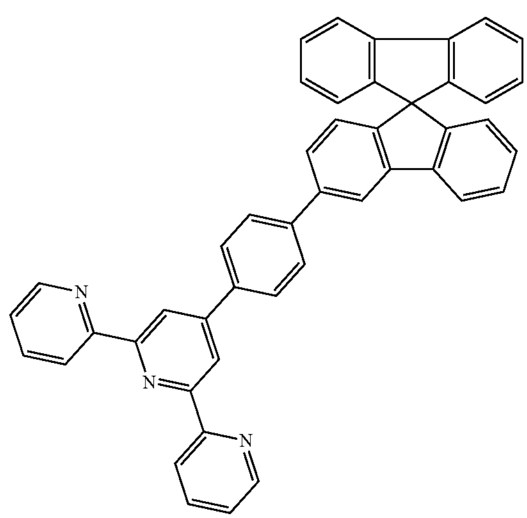

-continued
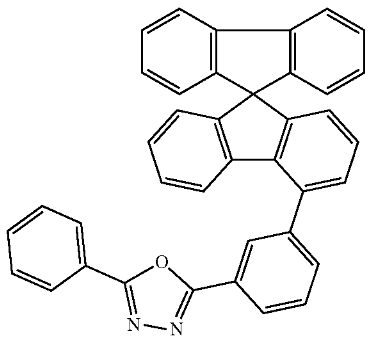
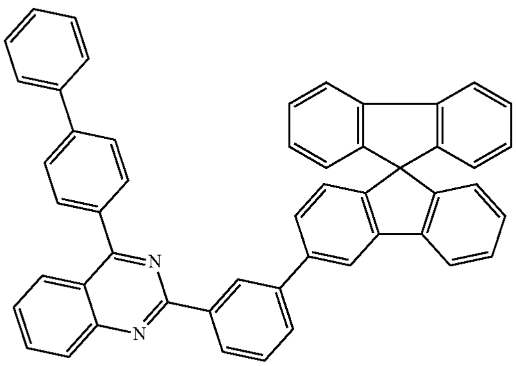
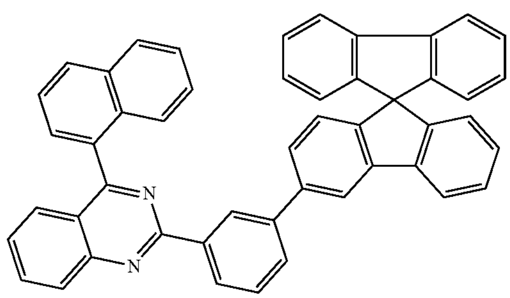
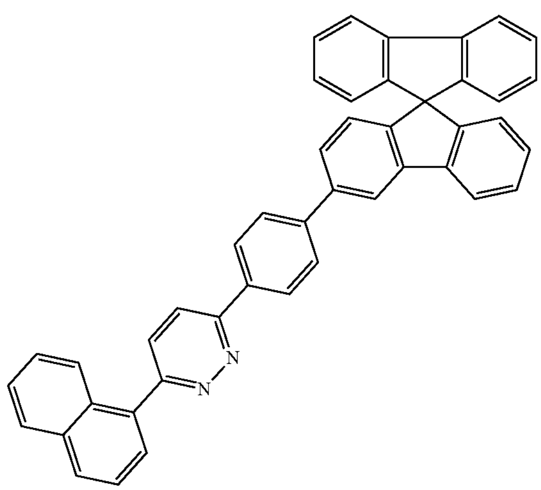
-continued
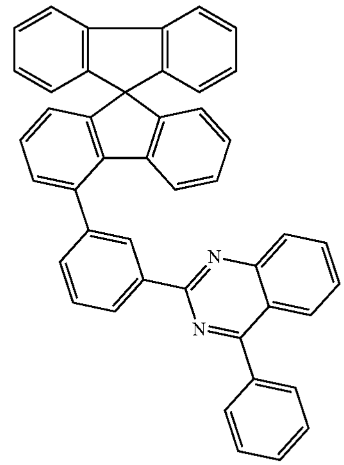
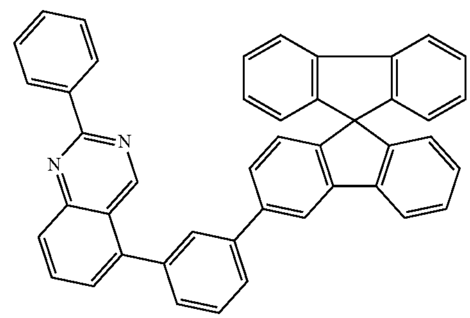
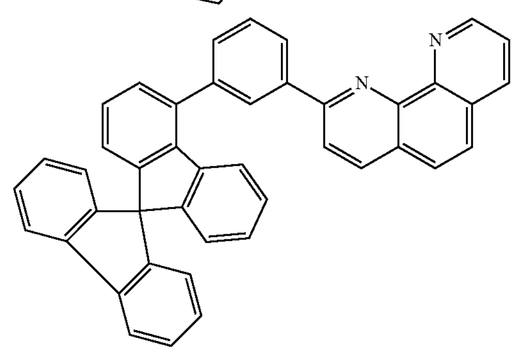
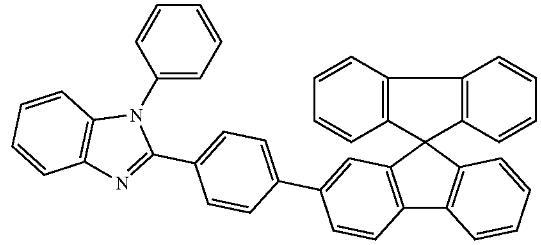
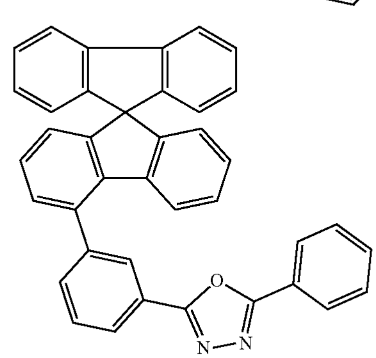

-continued
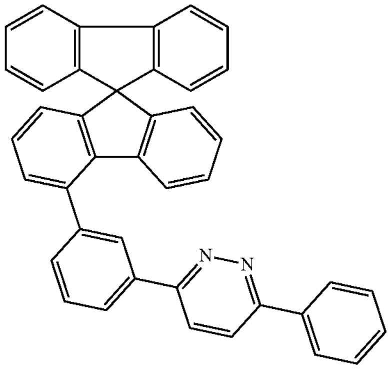
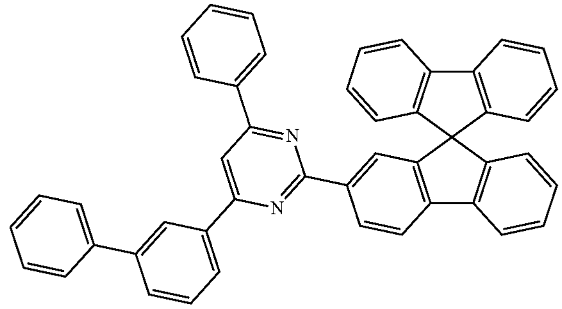
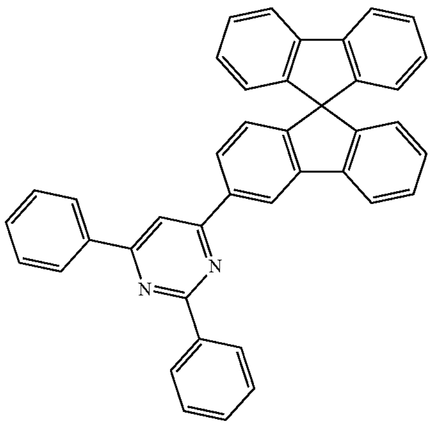
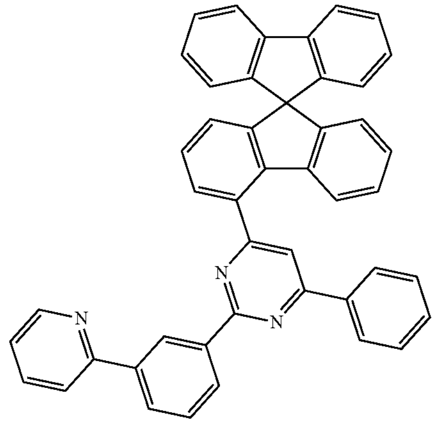
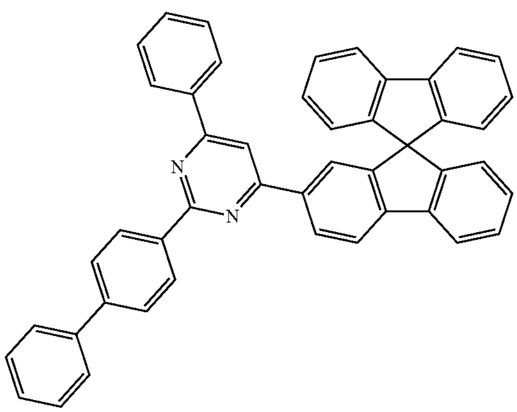
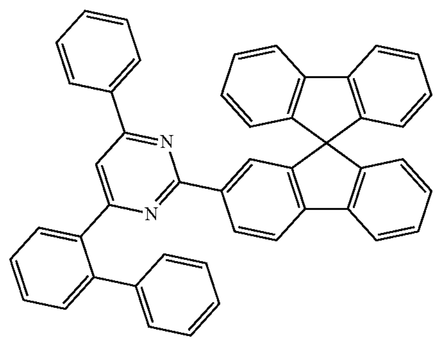
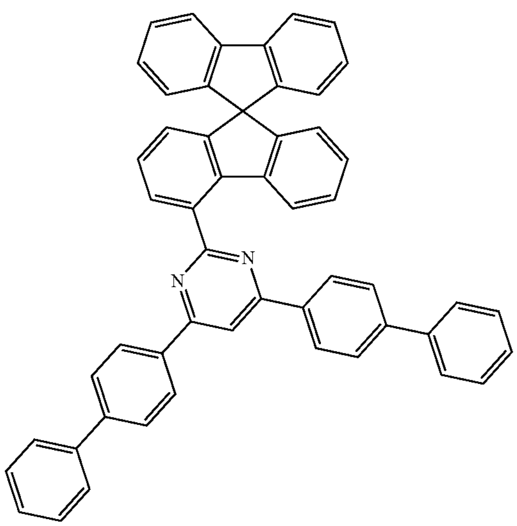
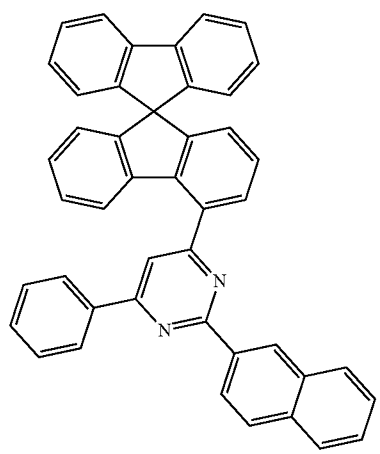

-continued
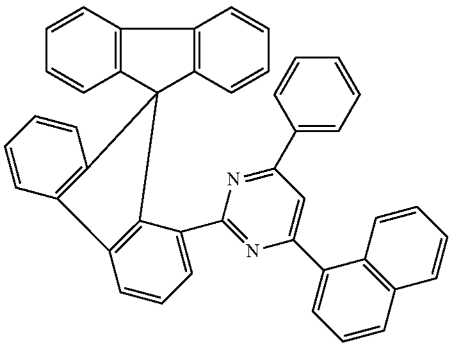
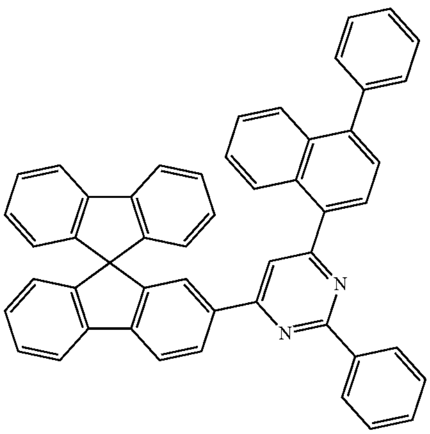
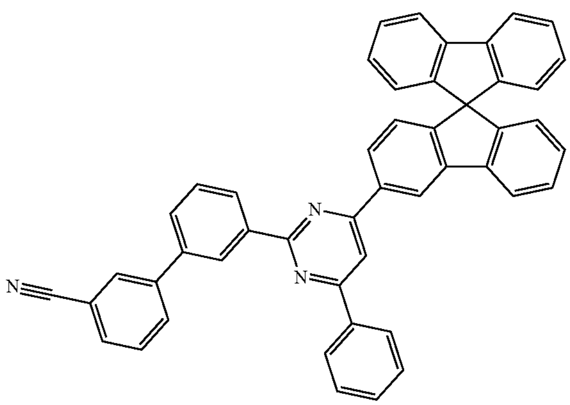
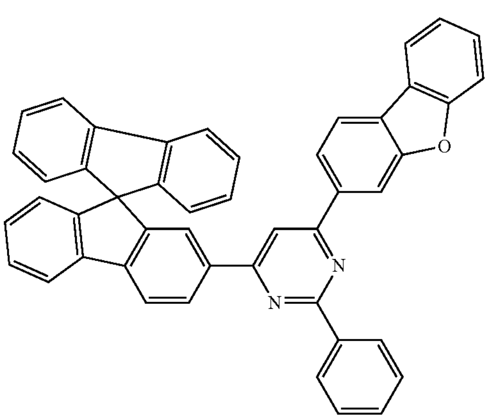
-continued
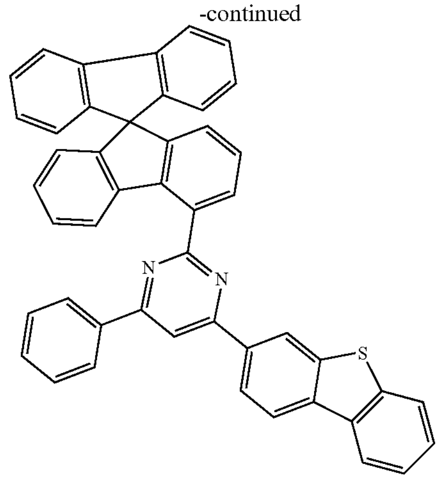
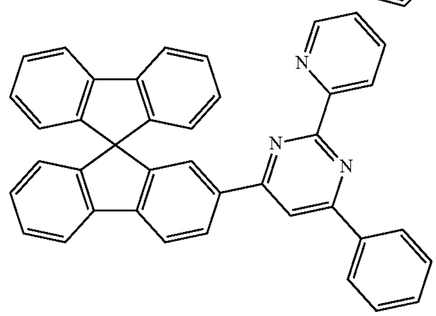
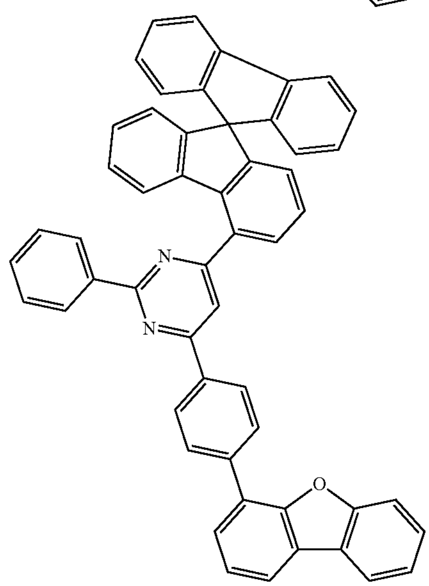
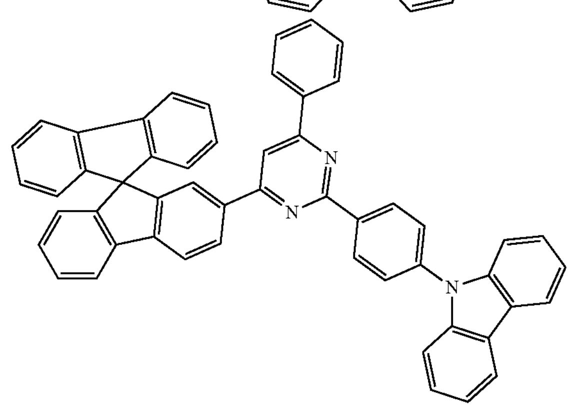

-continued
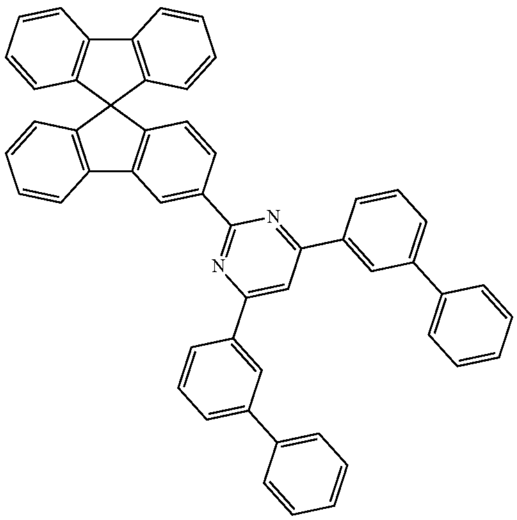
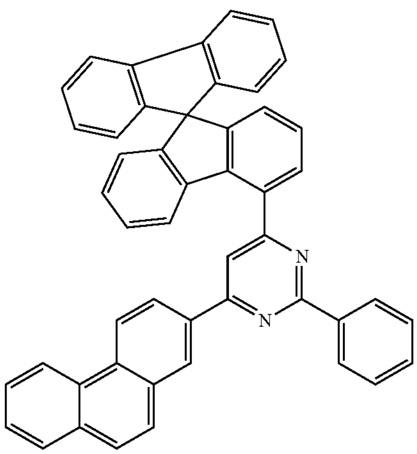
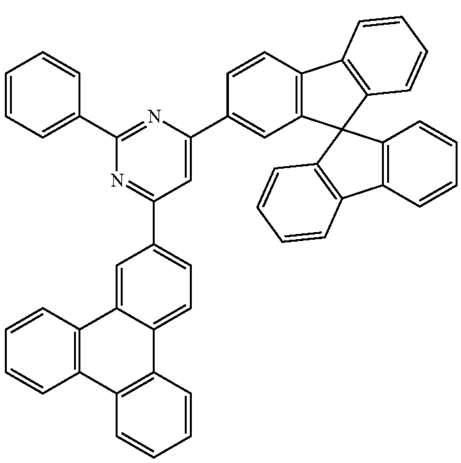
-continued
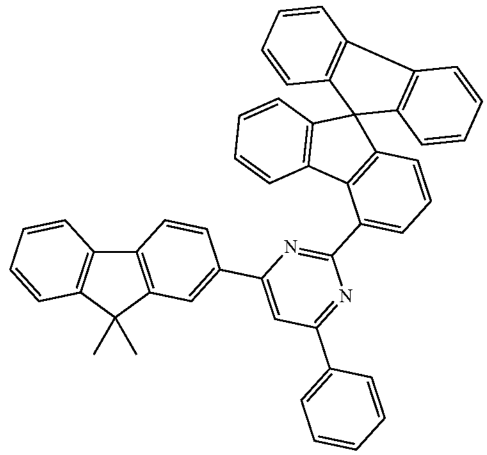
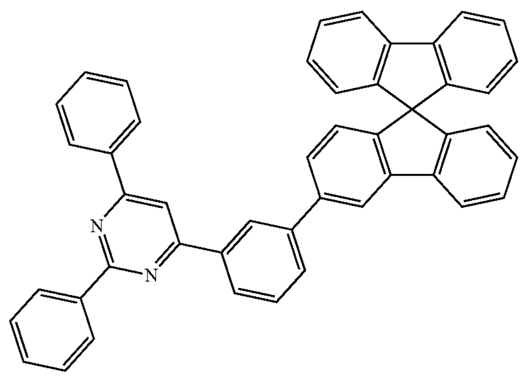
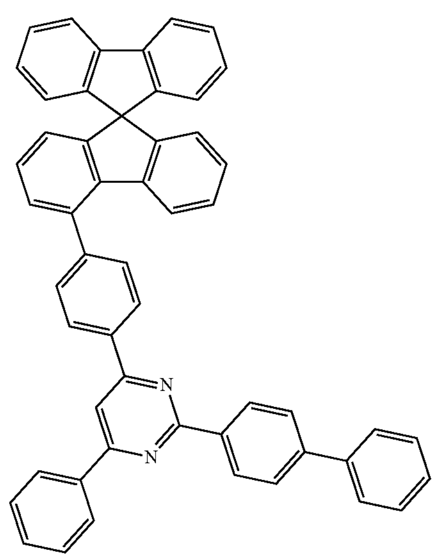

-continued
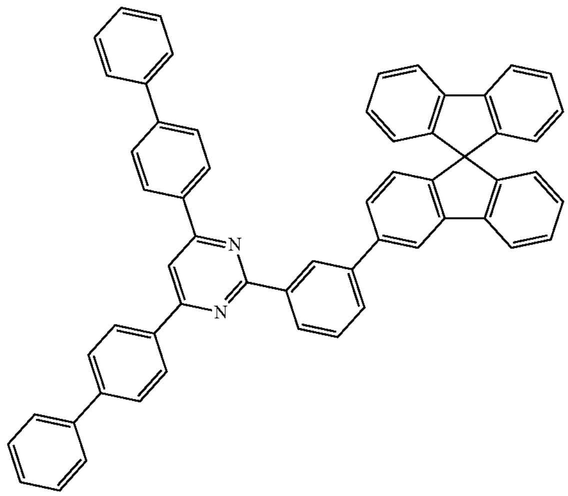
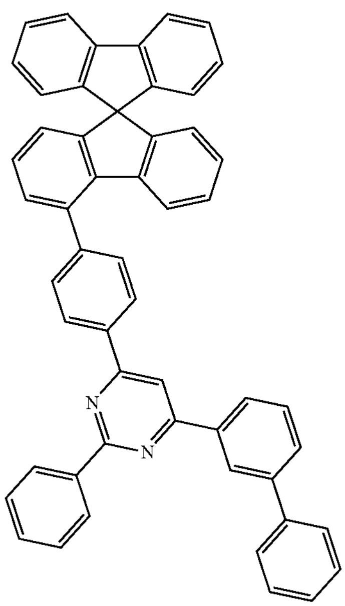
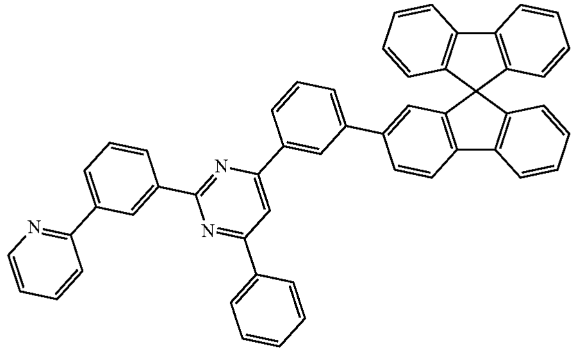
-continued
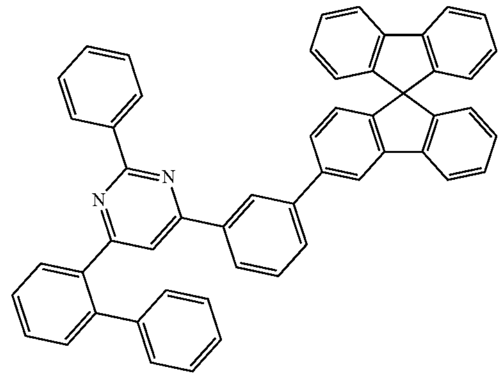
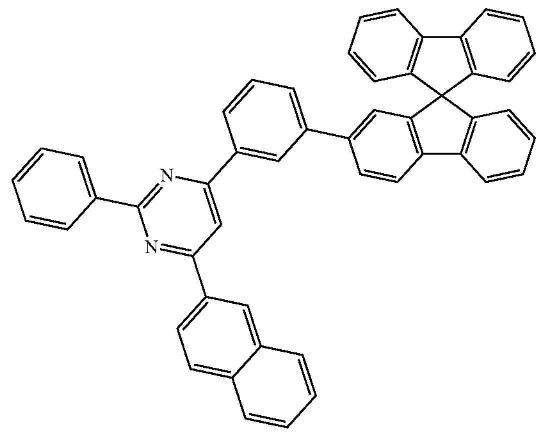
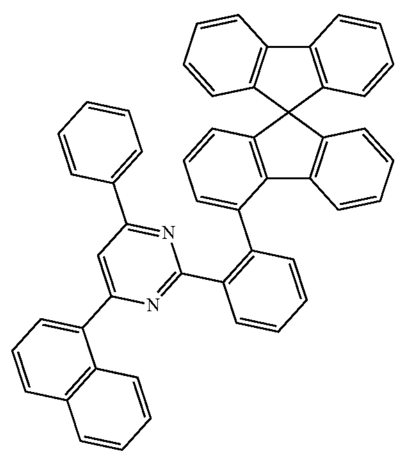
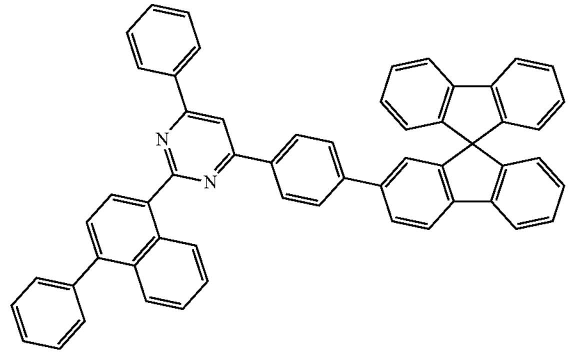

-continued
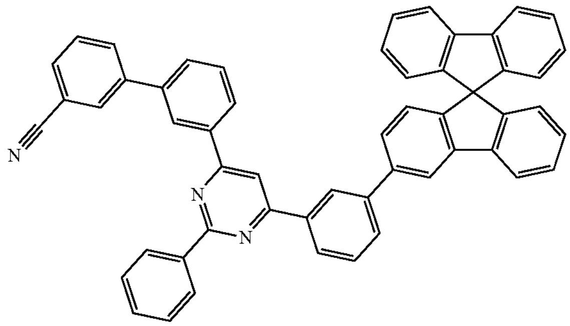
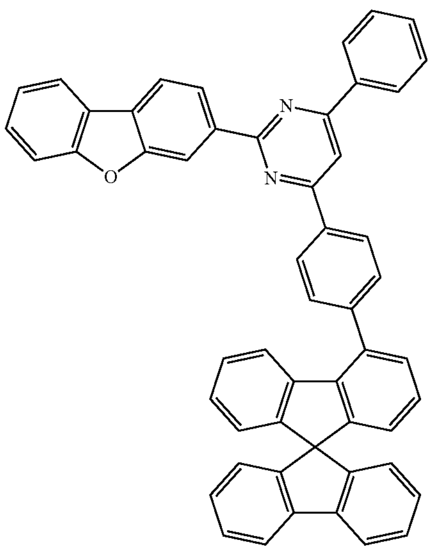
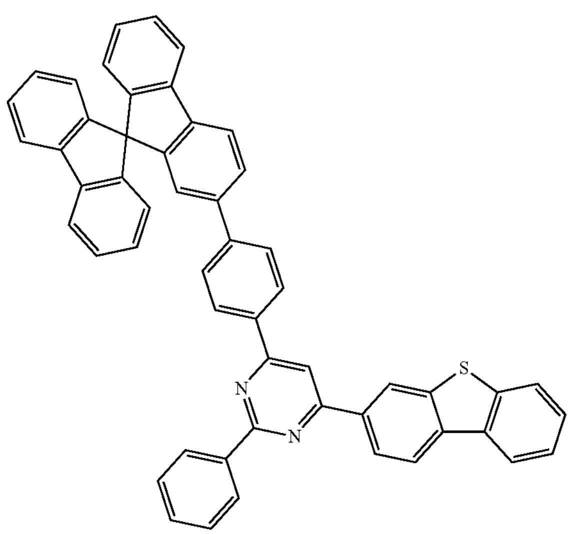
-continued
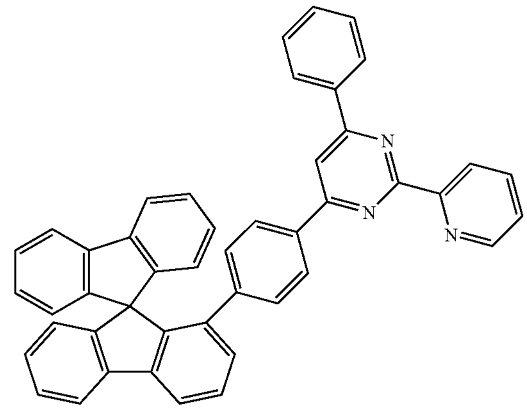
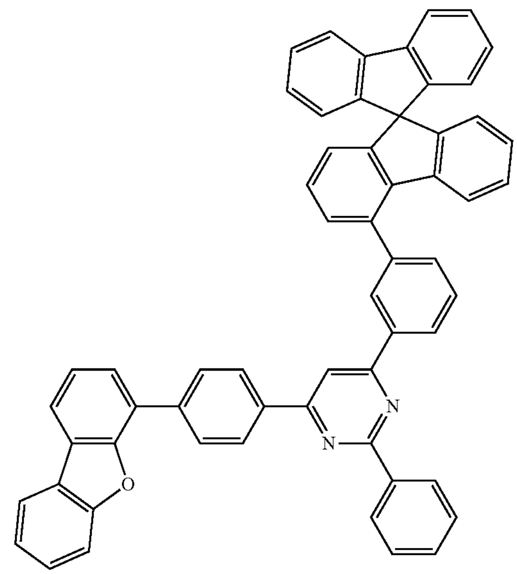
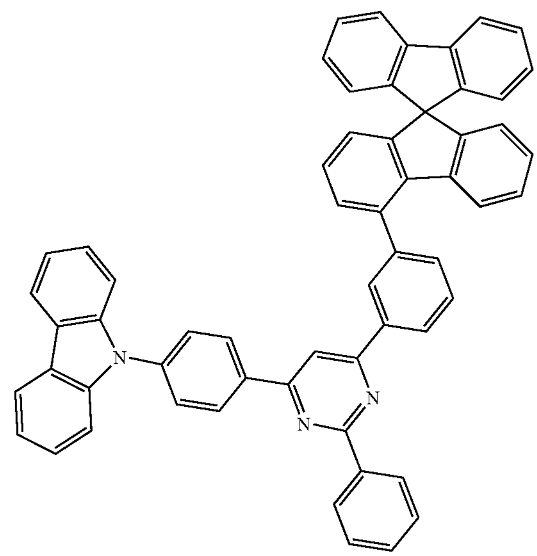

-continued
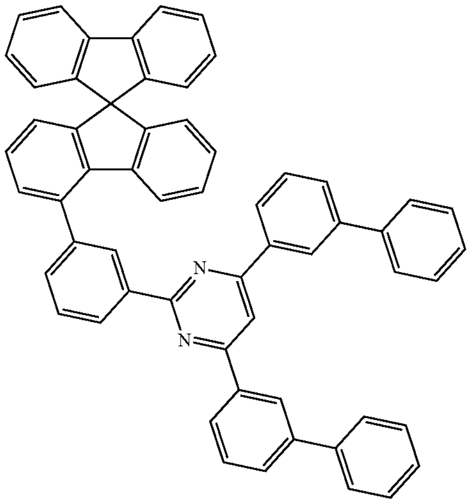
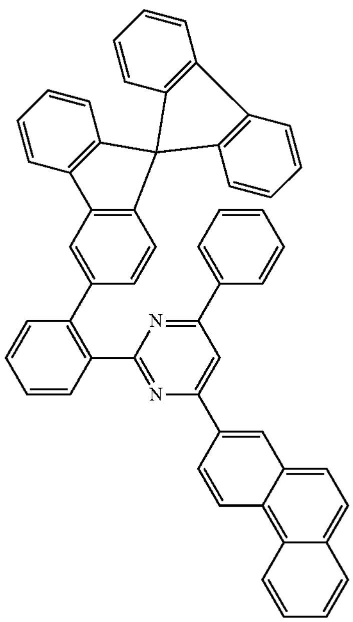
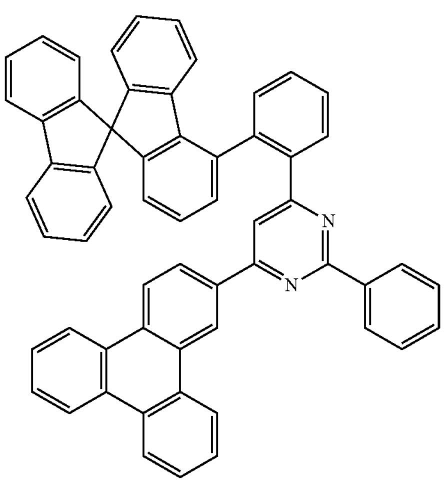
-continued
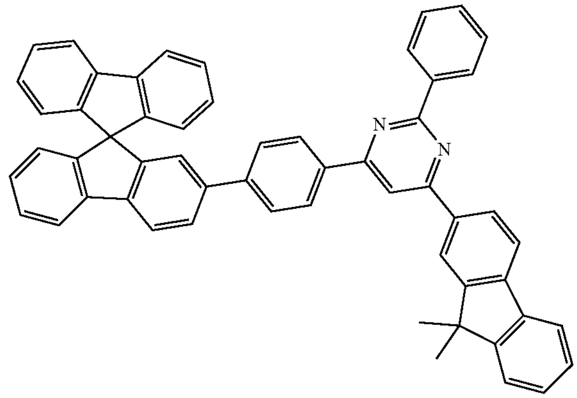
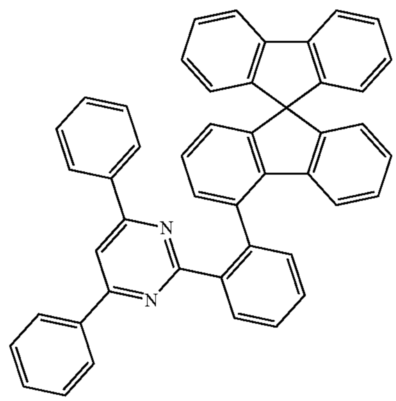
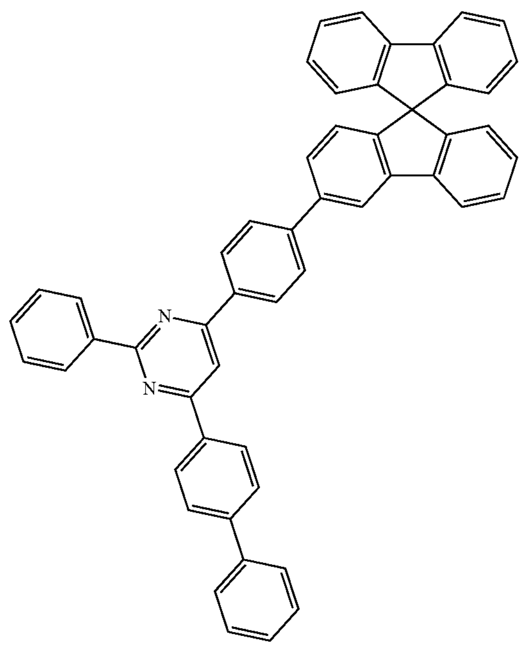

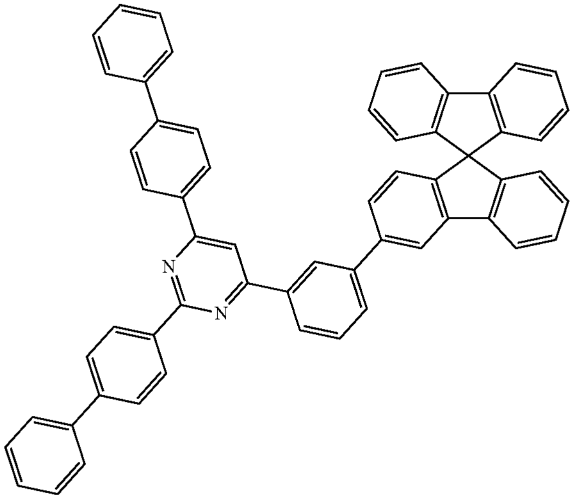
N
N
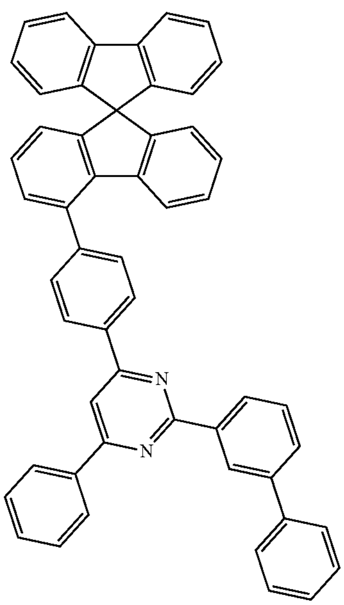
N
N
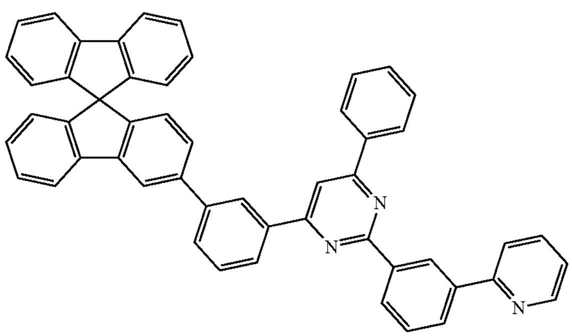
N
N
N
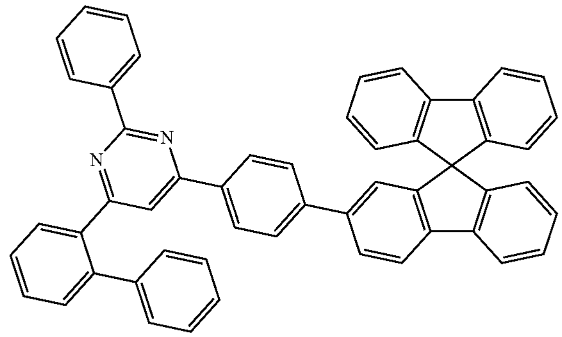
N
N
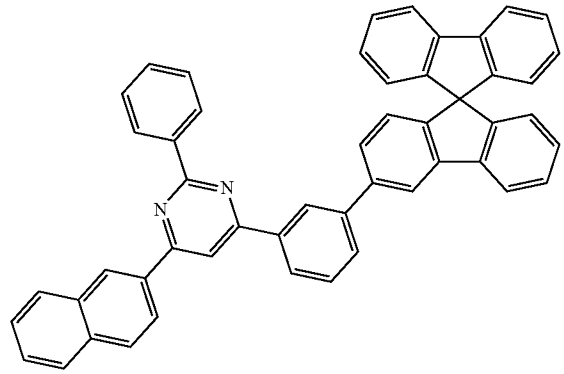
N
N
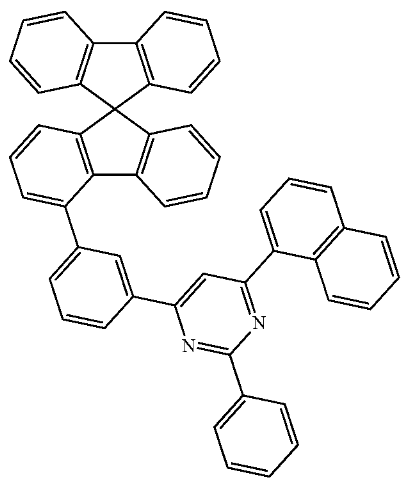
N
N
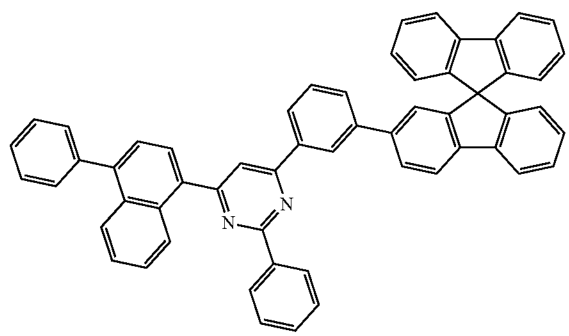
N
N -continued
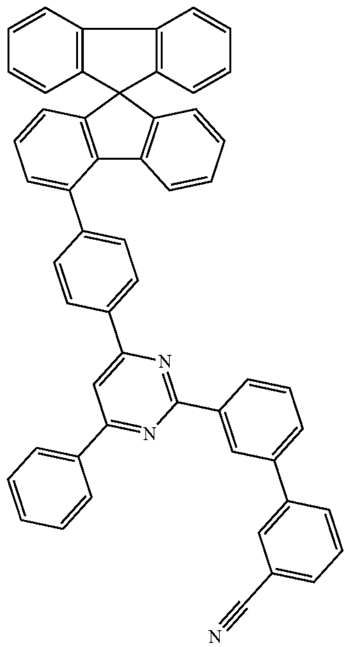
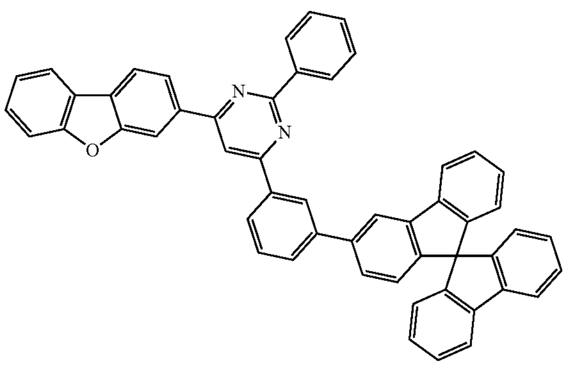
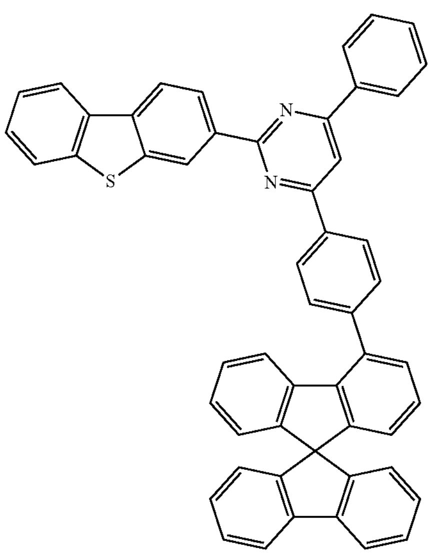
-continued
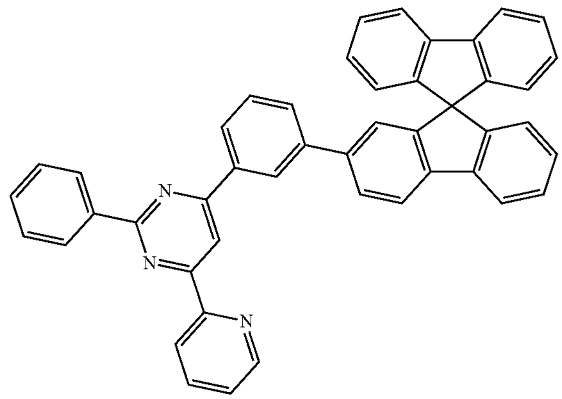
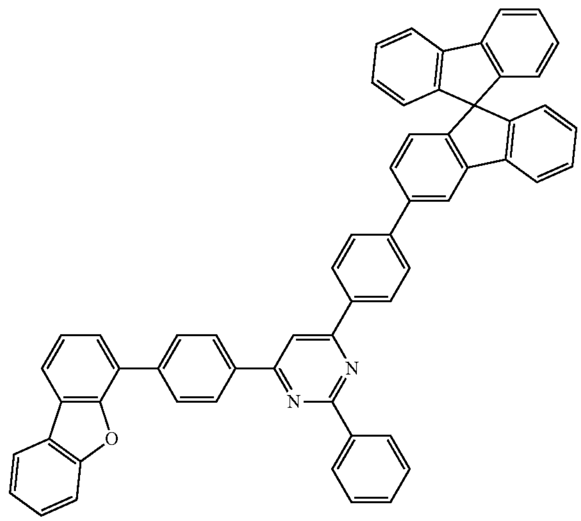
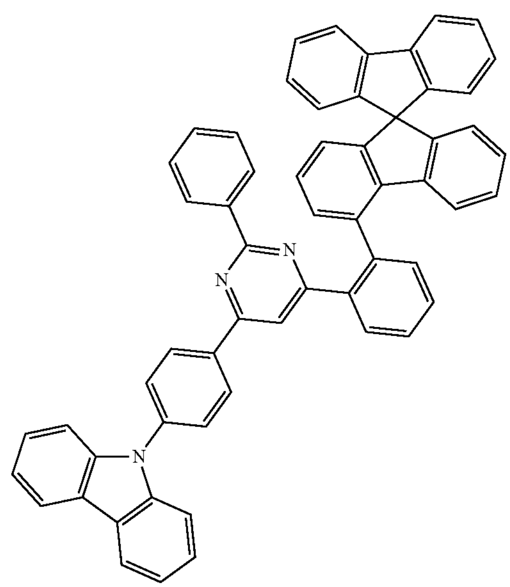

-continued
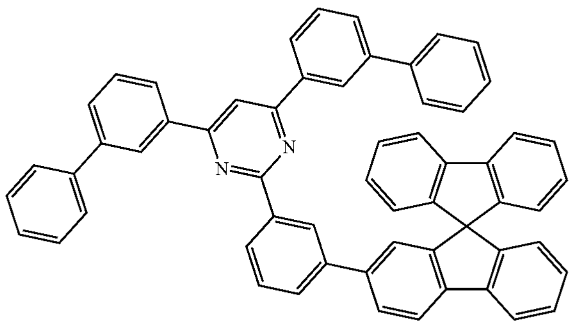
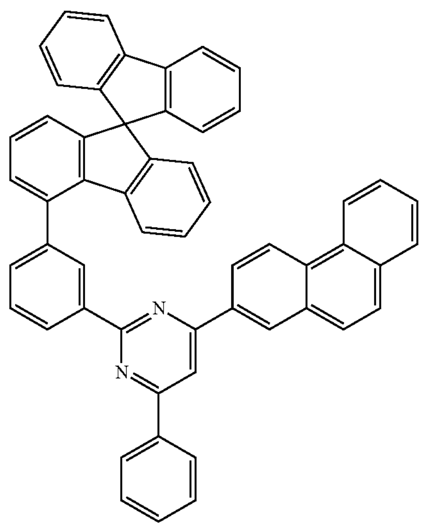
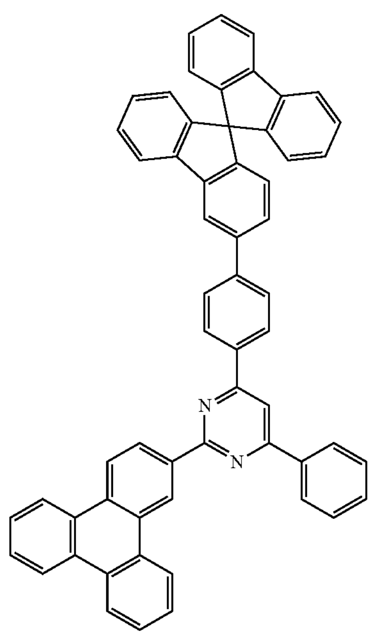
-continued
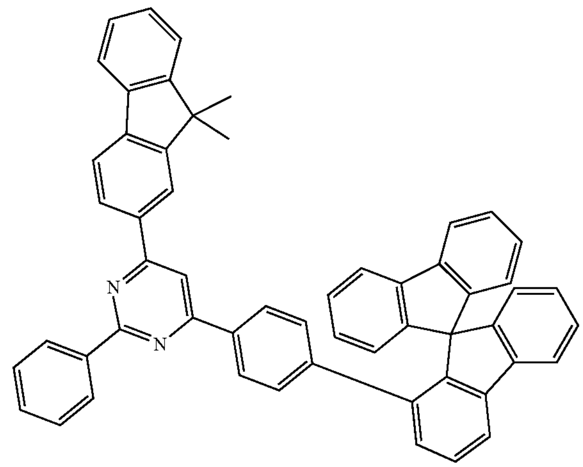
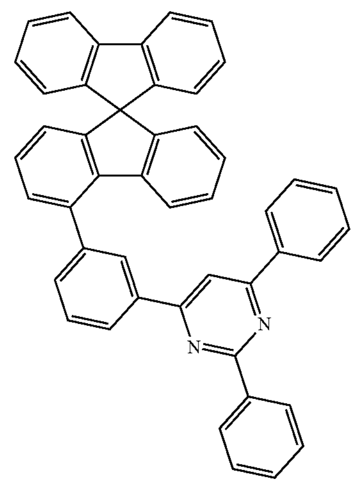
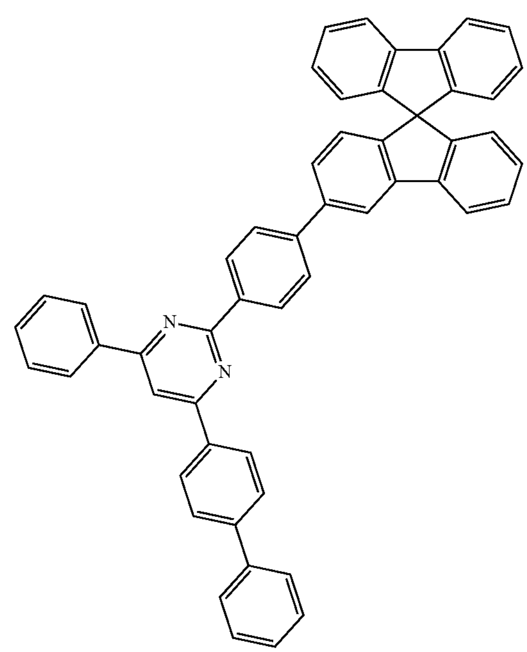

-continued
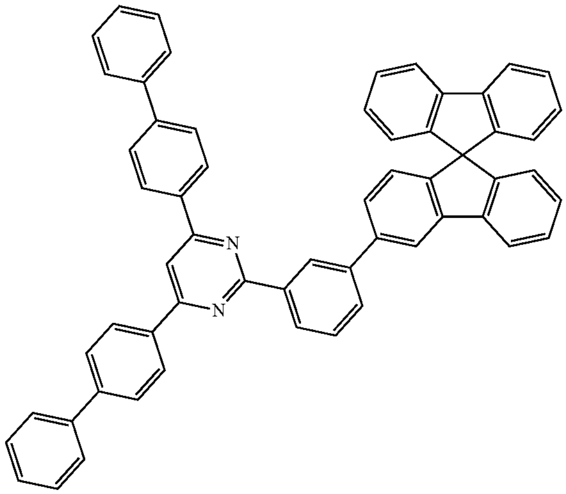
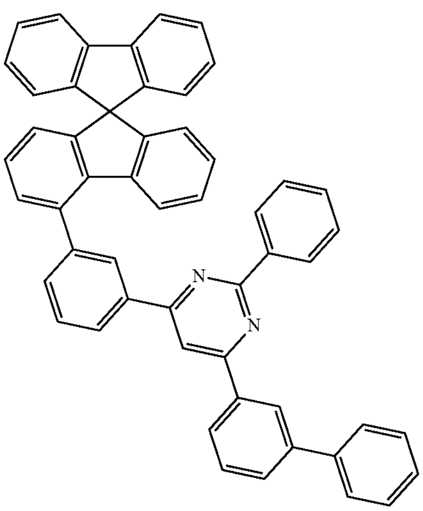
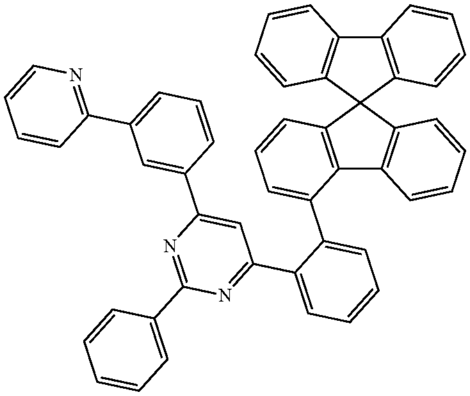
-continued
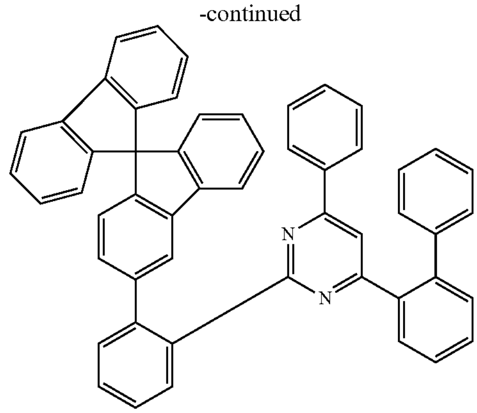
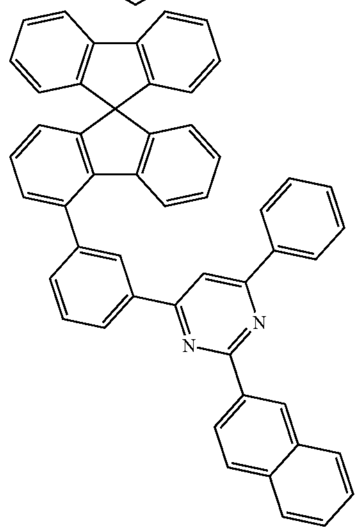
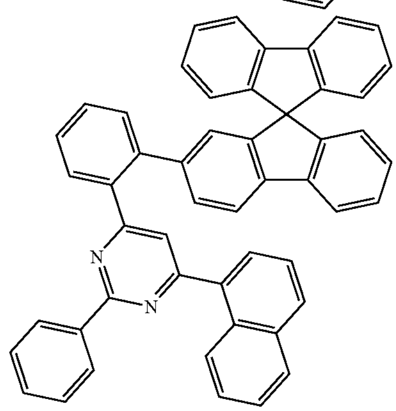
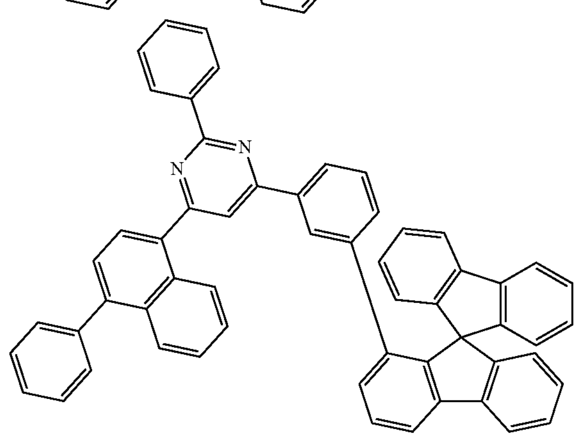

-continued
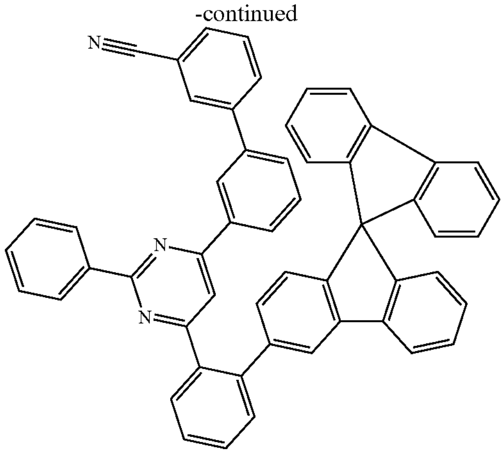
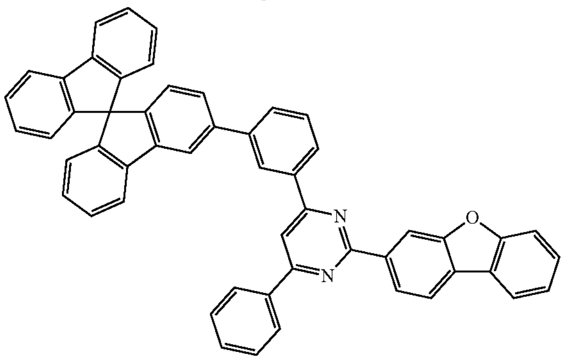
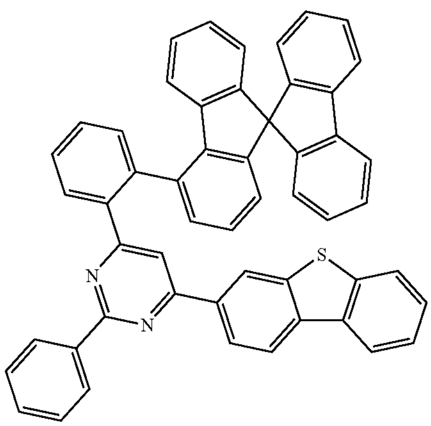
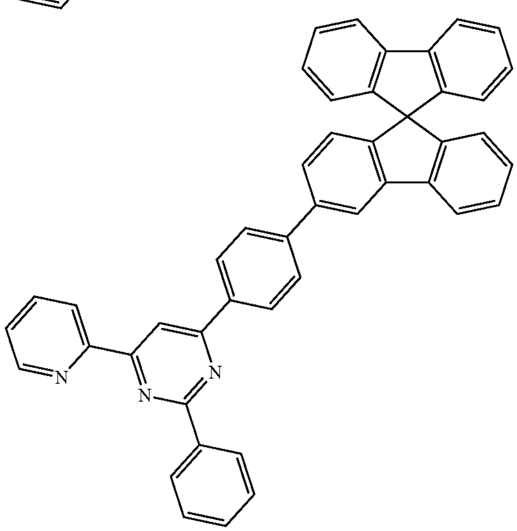
-continued
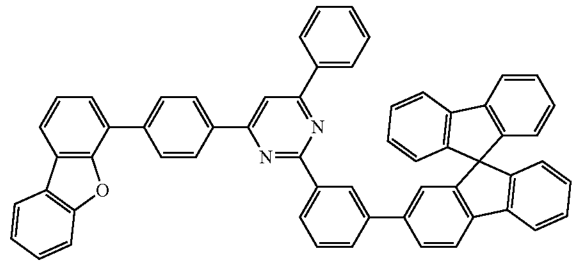
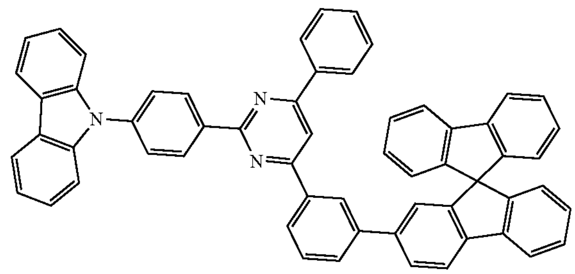
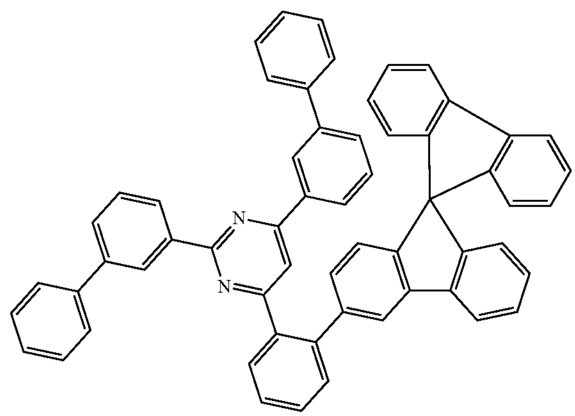
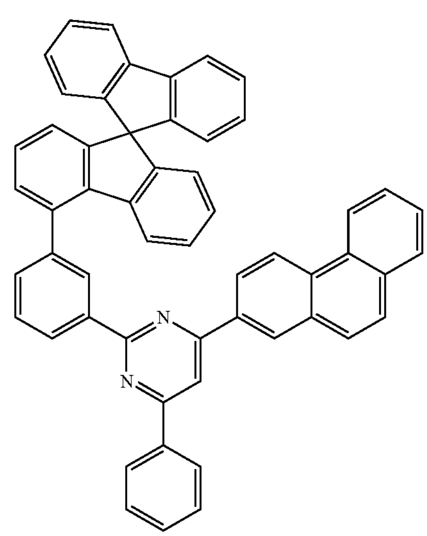

-continued
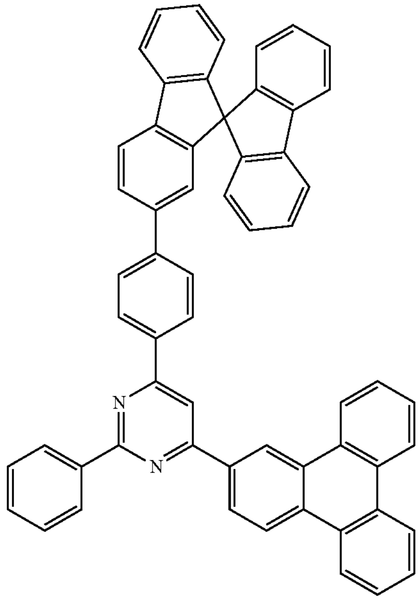
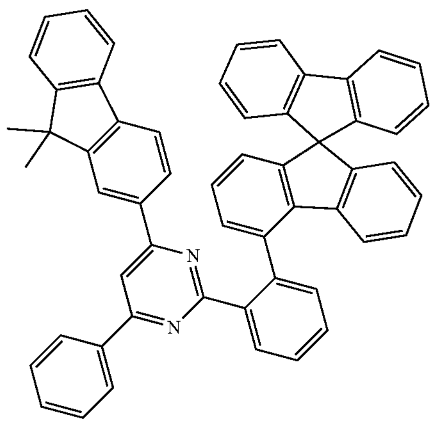 [SMILES: CC1(C)c2ccccc2-c2ccc(-c3cc(-c4ccccc4)nc(-c4ccccc4-c4cccc5c4-c4ccccc4C54c5ccccc5-c5ccccc54)n3)cc21]
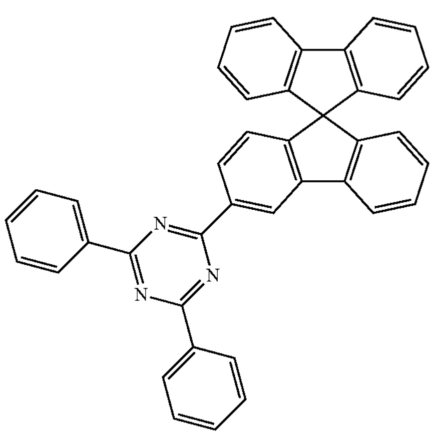
-continued
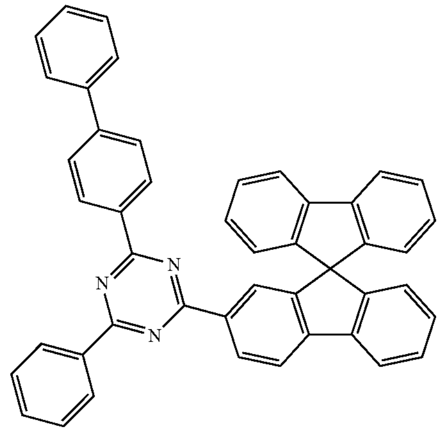
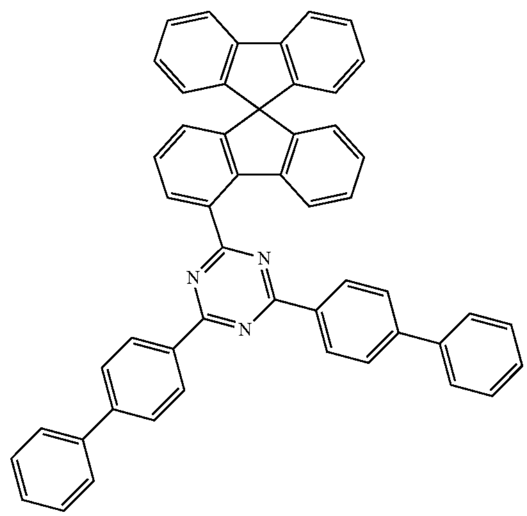
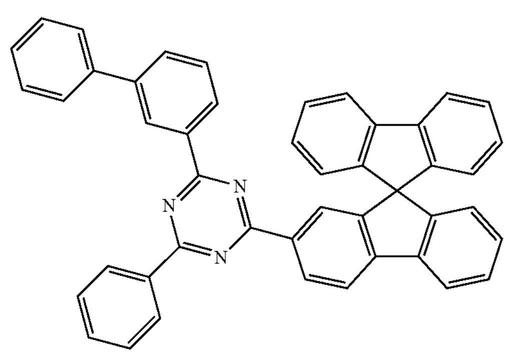

-continued
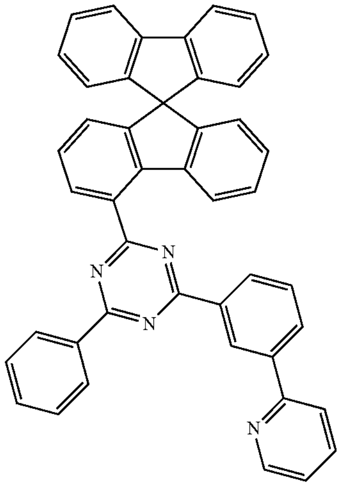
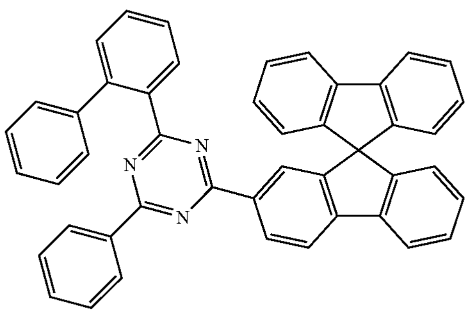
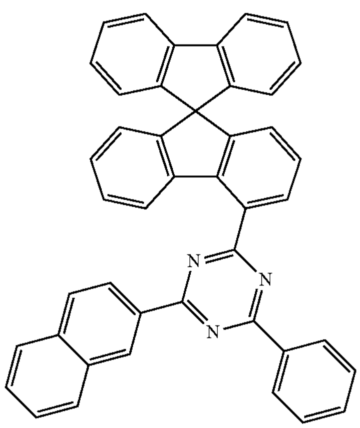
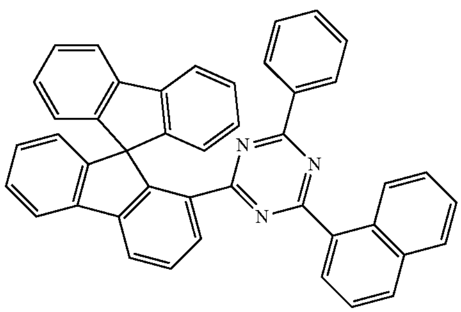
-continued
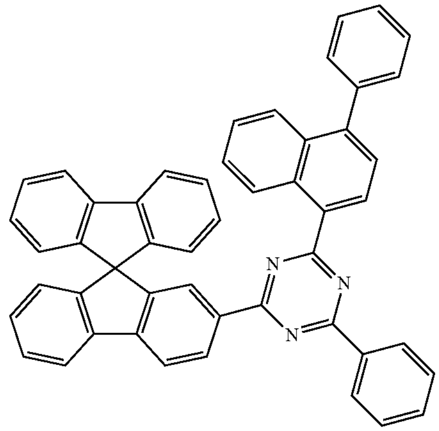
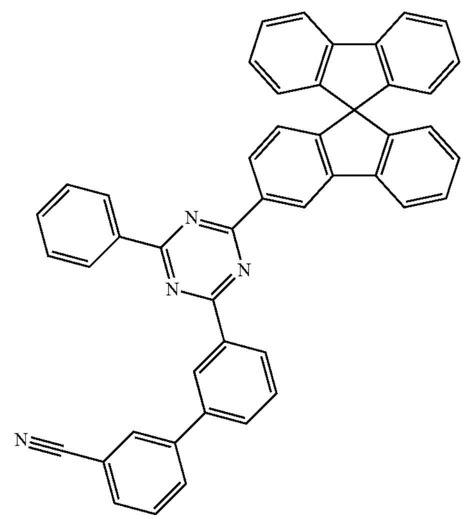
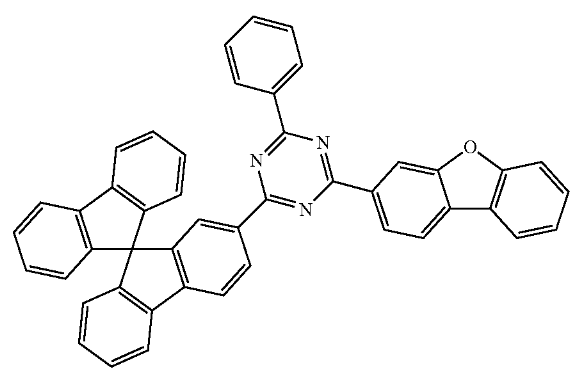

-continued
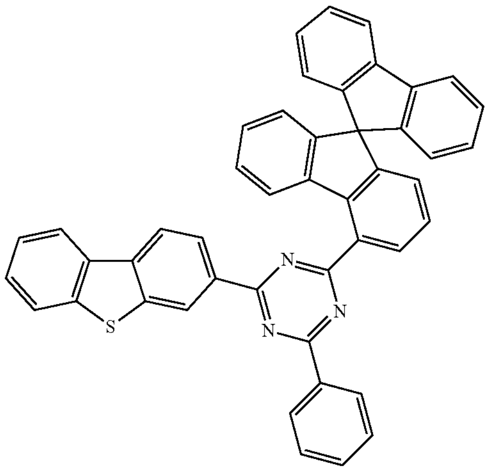
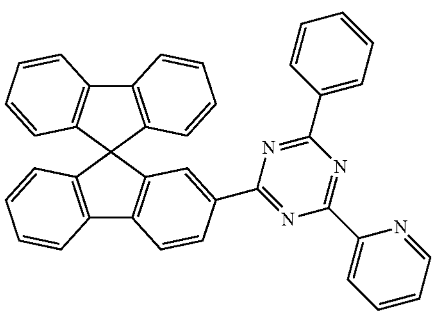
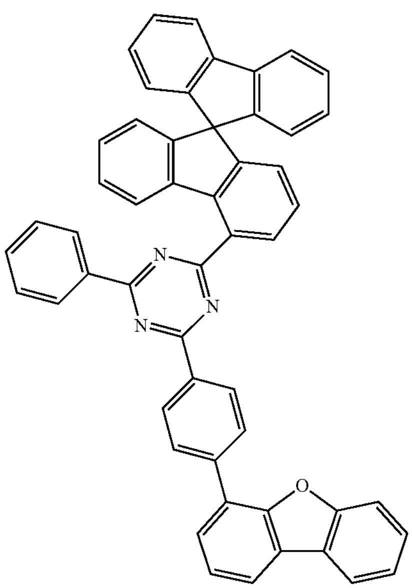
-continued
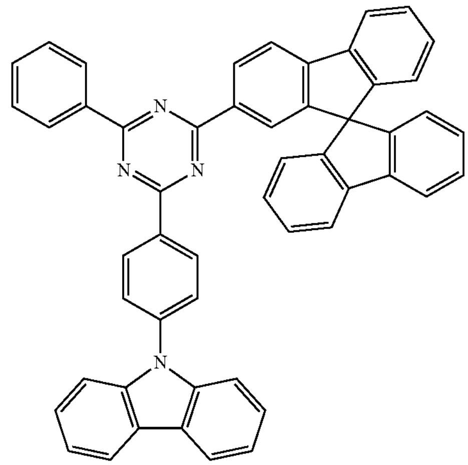
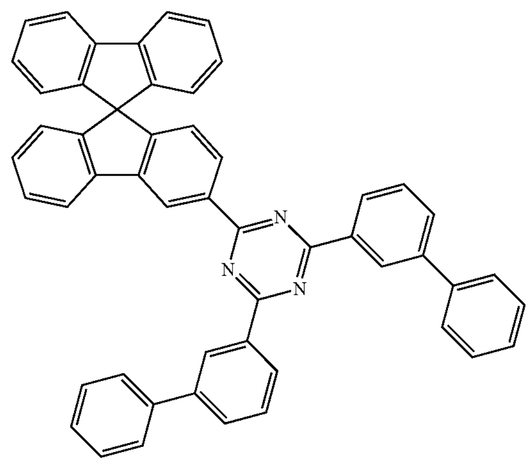
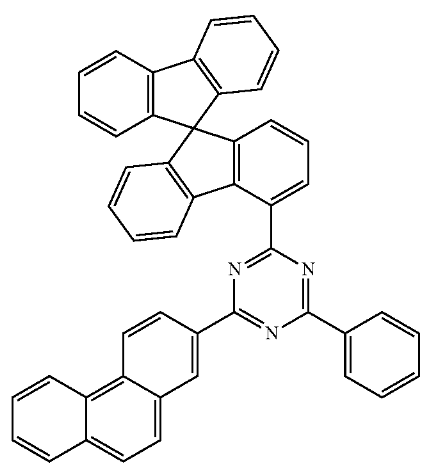

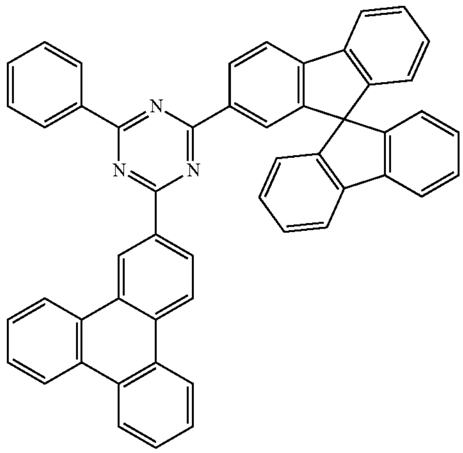
N
N
N
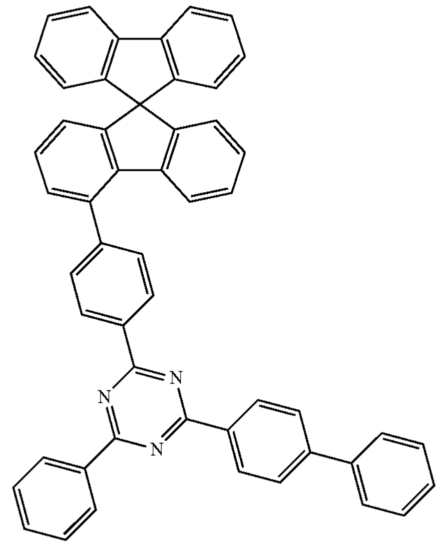
N
N
N
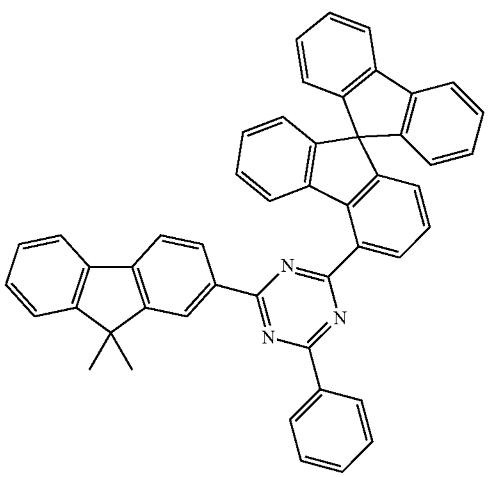
N
N
N
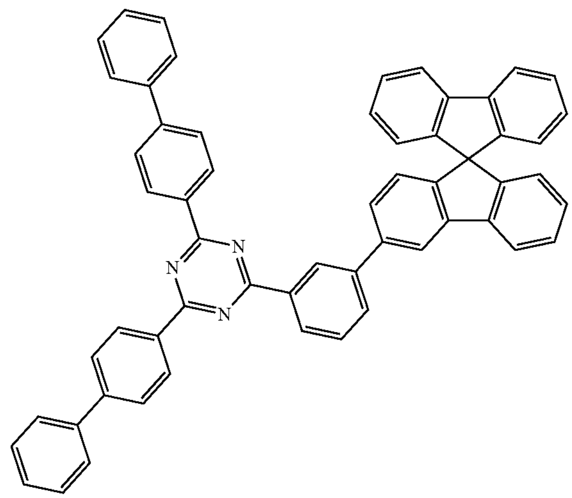
N
N
N
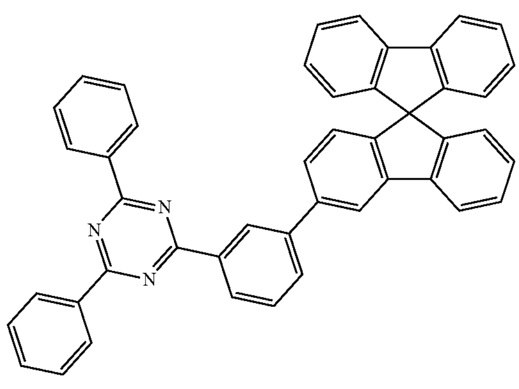
N
N
N
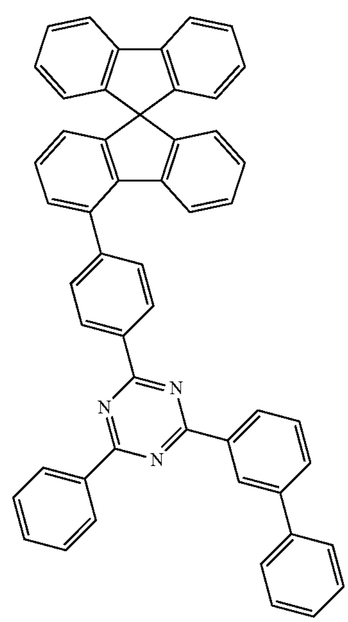
N
N
N -continued
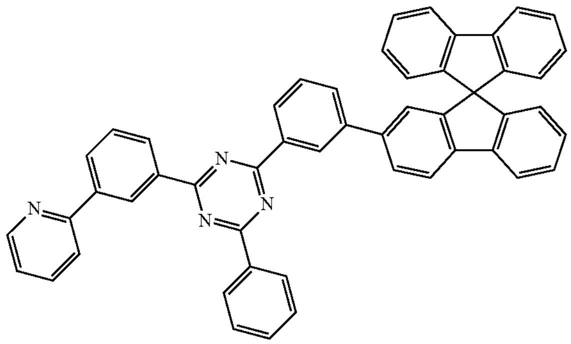
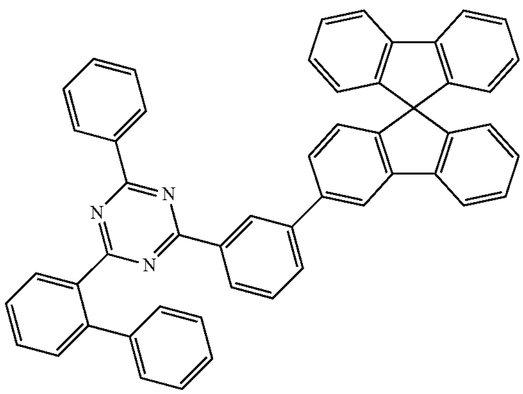
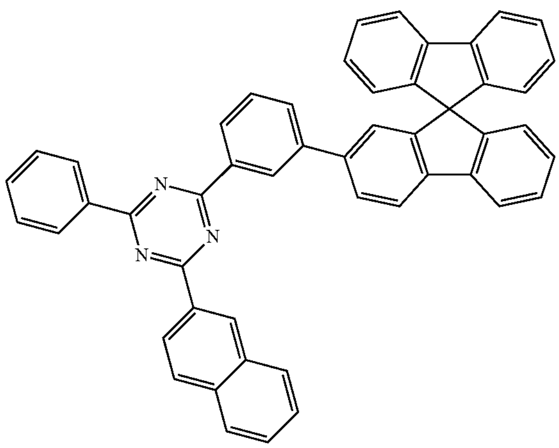
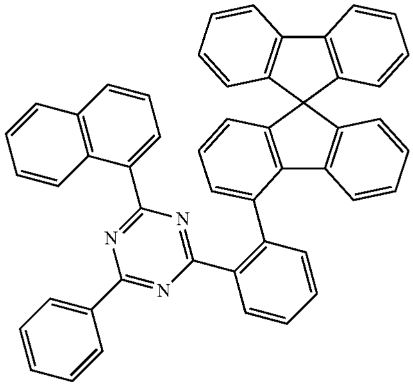
-continued
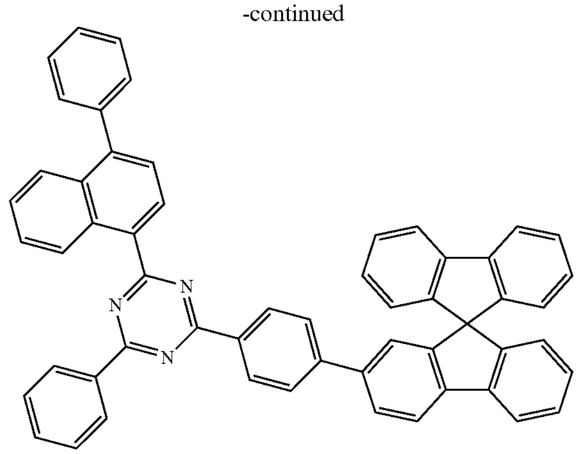
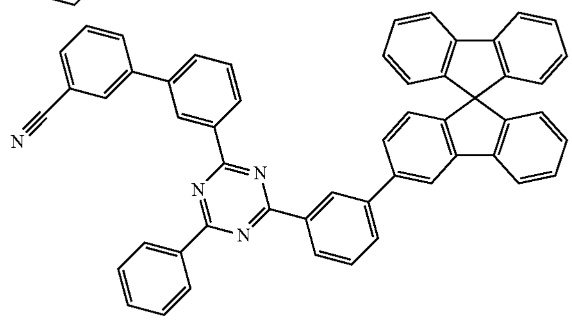
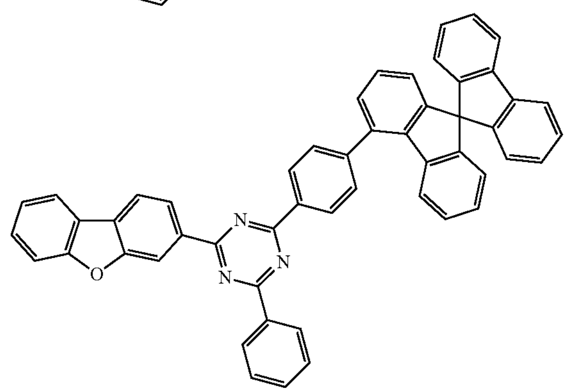
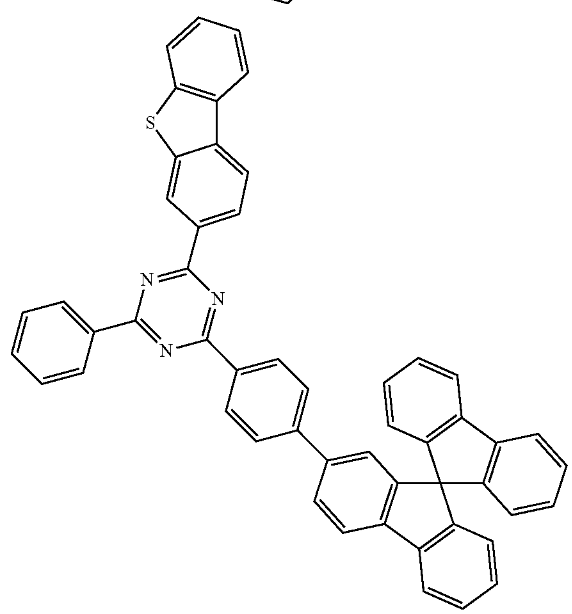

-continued
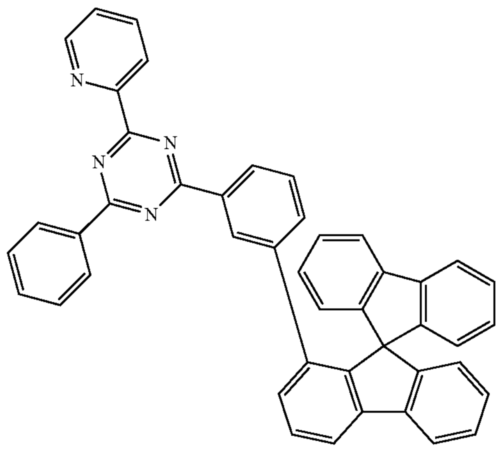
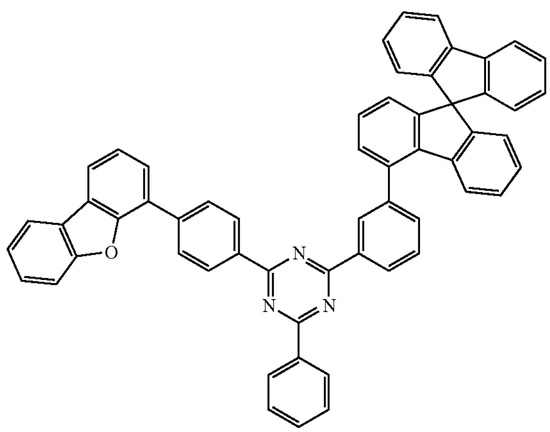
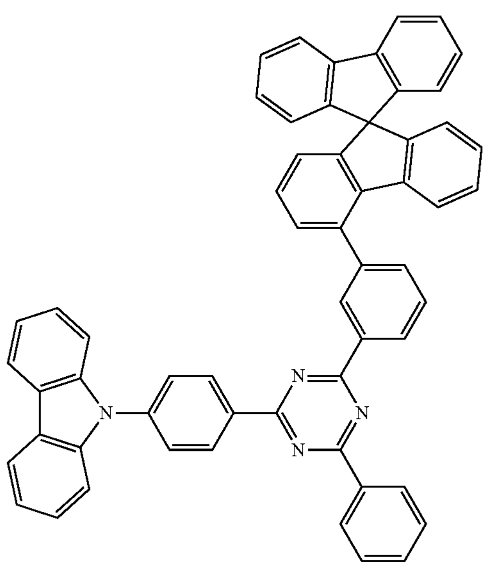
-continued
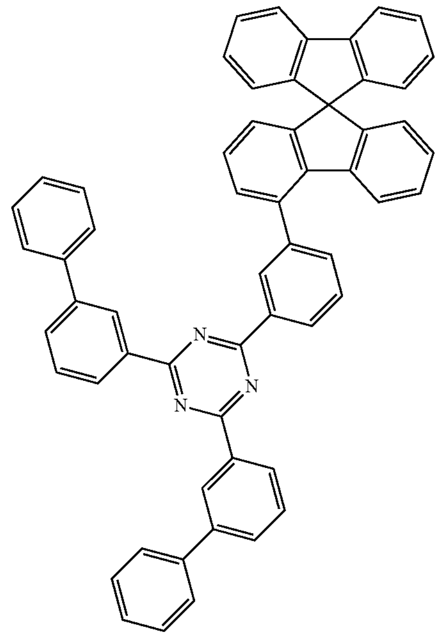
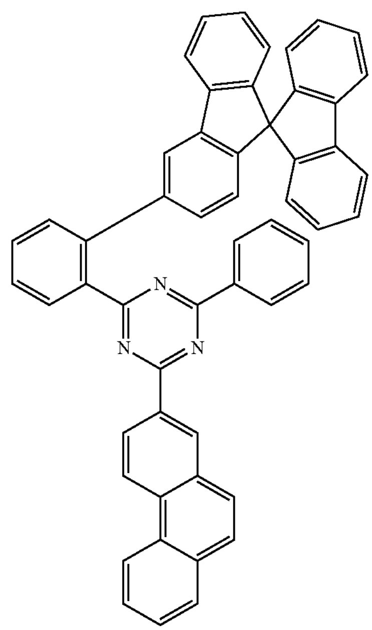
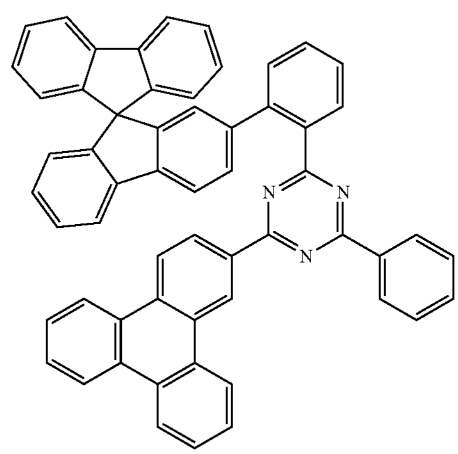

-continued
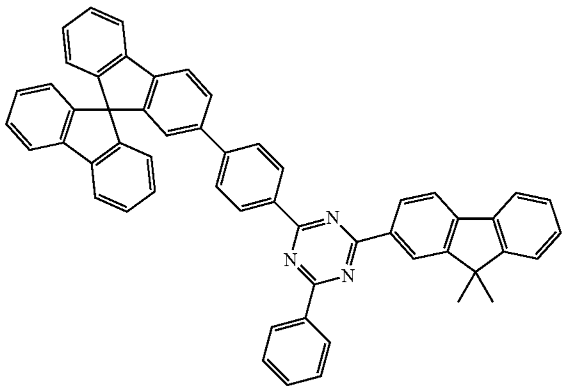
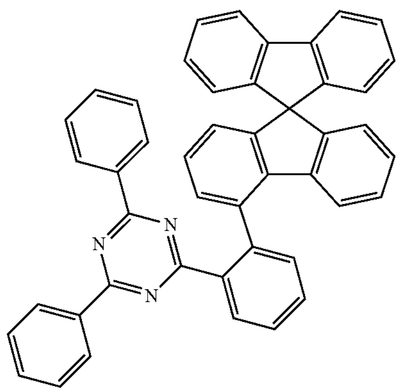
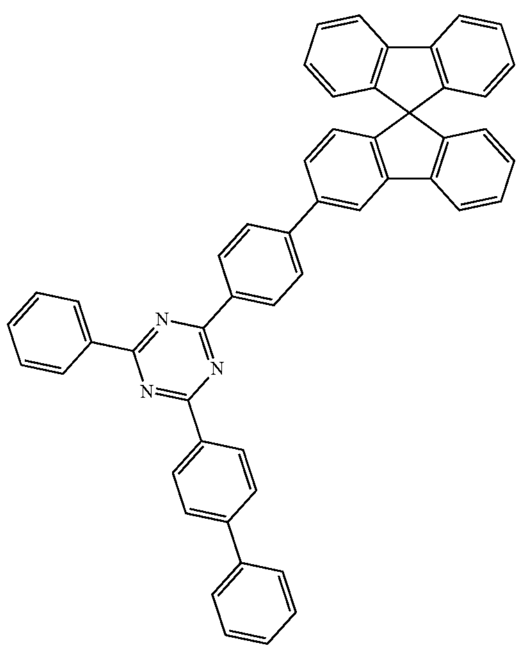
-continued
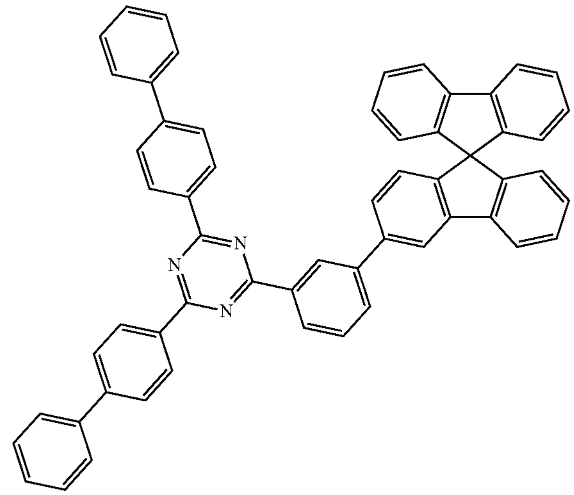
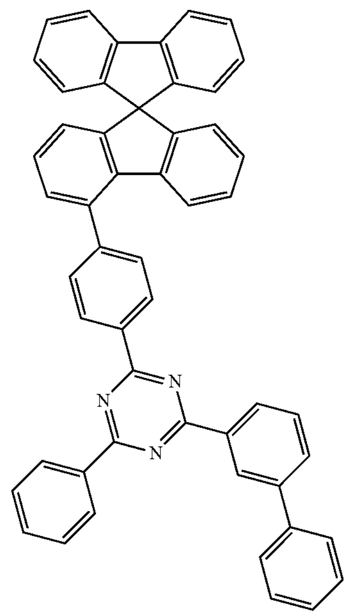
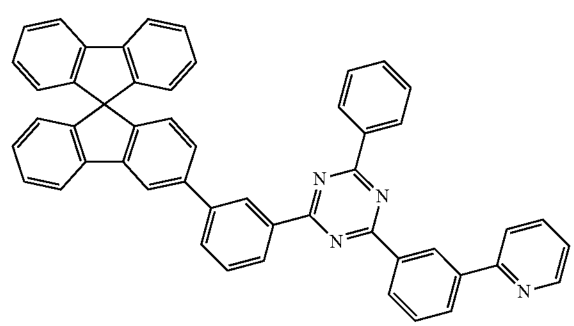

-continued
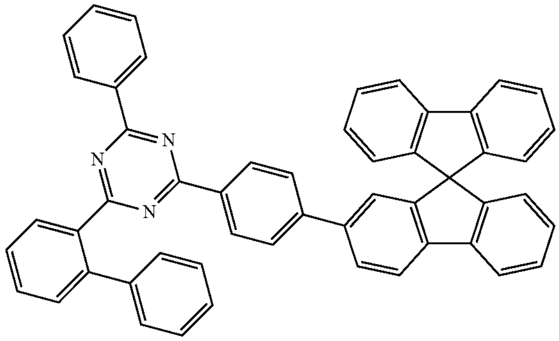
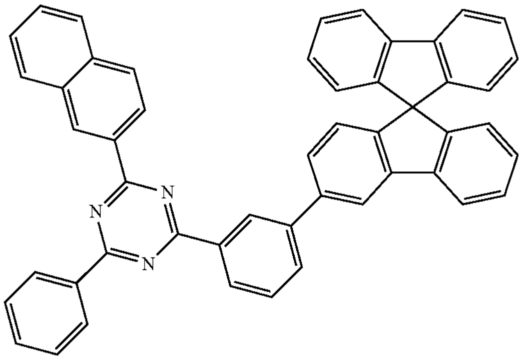
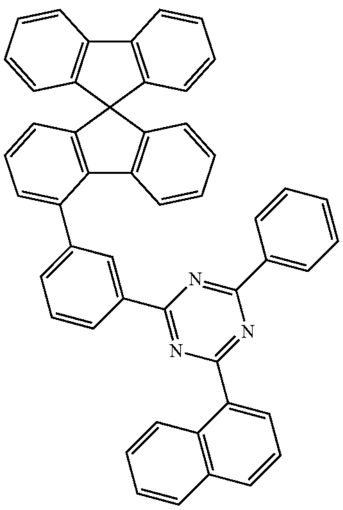
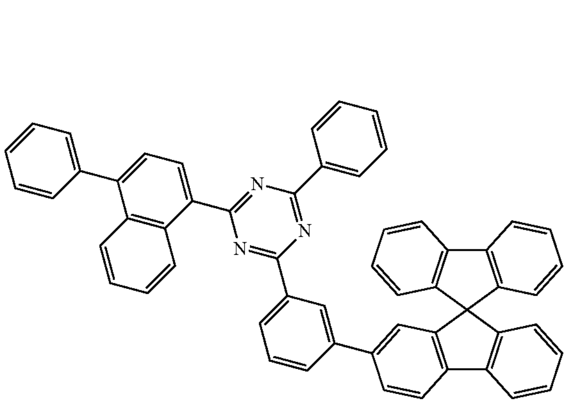
-continued
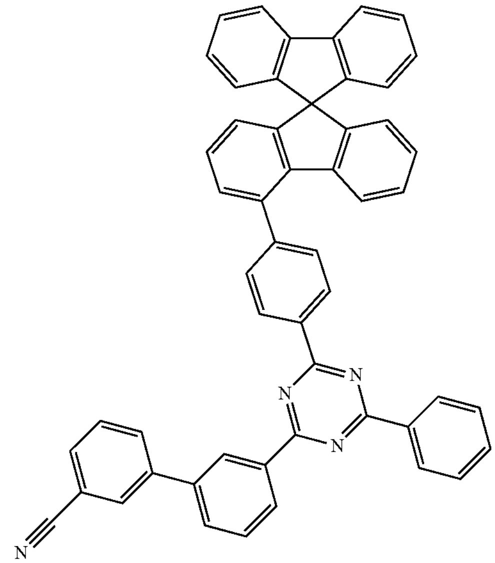
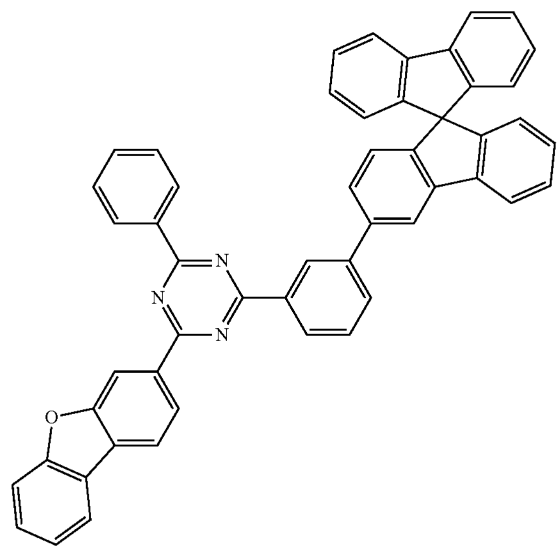
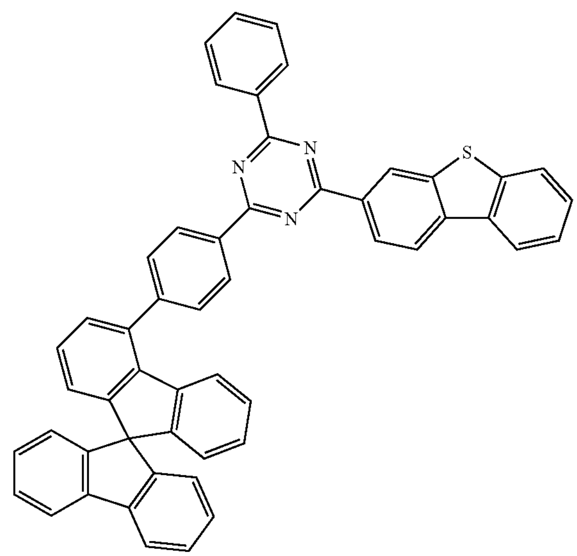

-continued
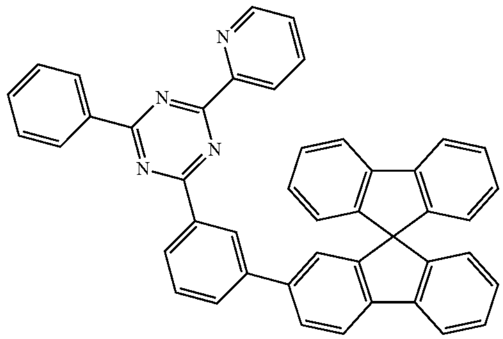
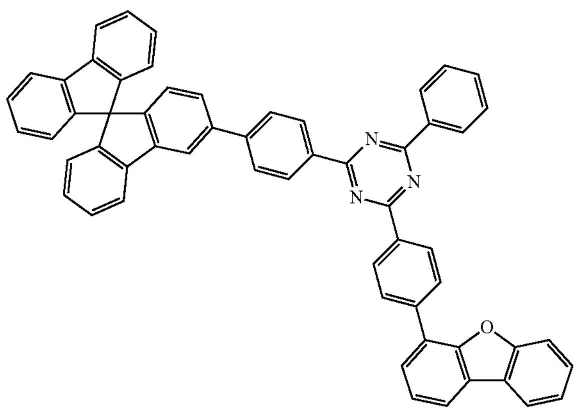
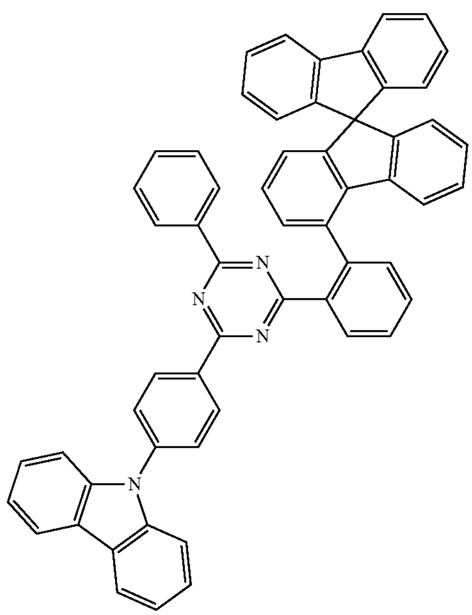
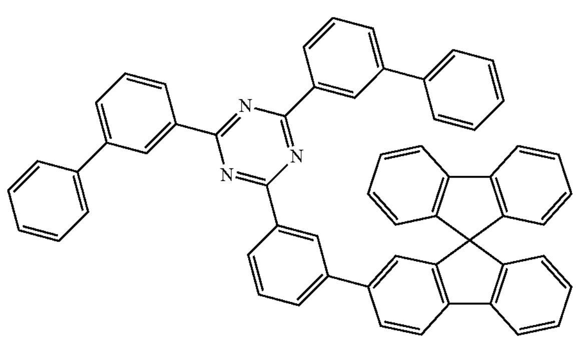
-continued
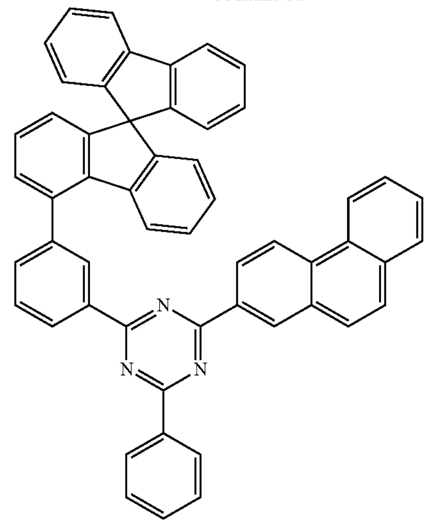
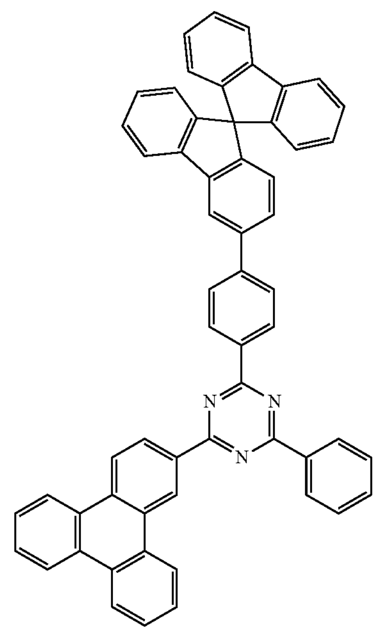
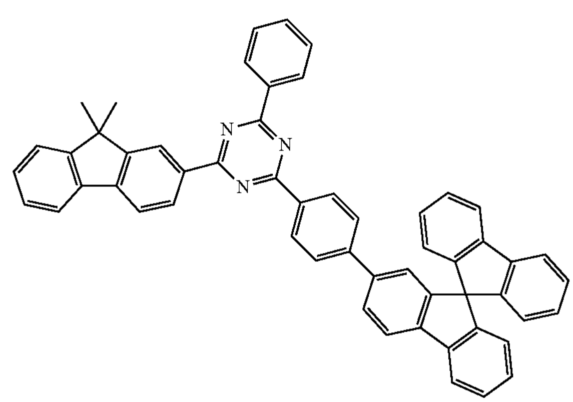

-continued
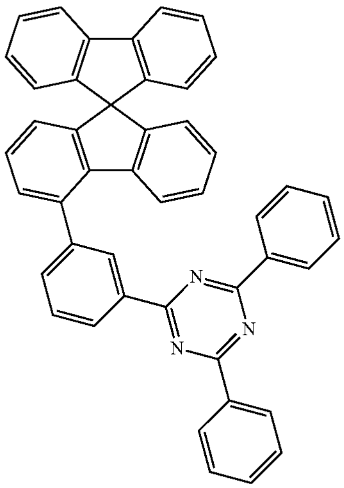
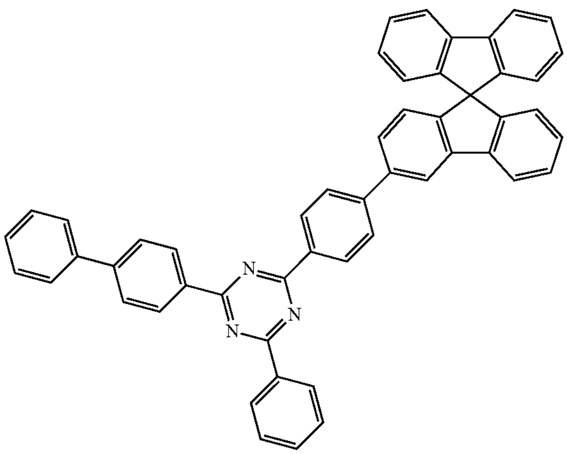
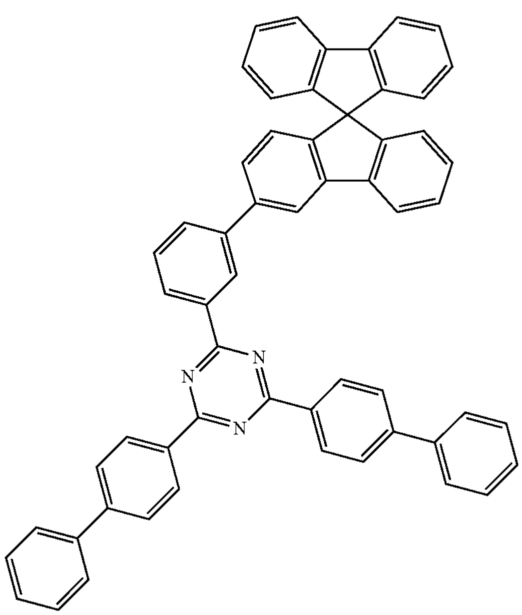
-continued
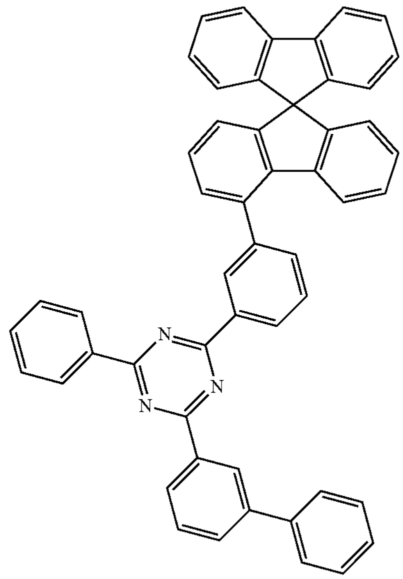
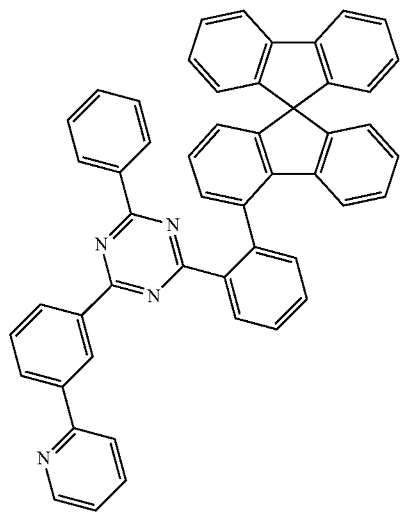
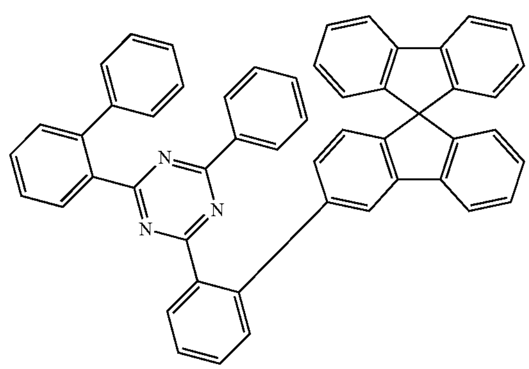

-continued
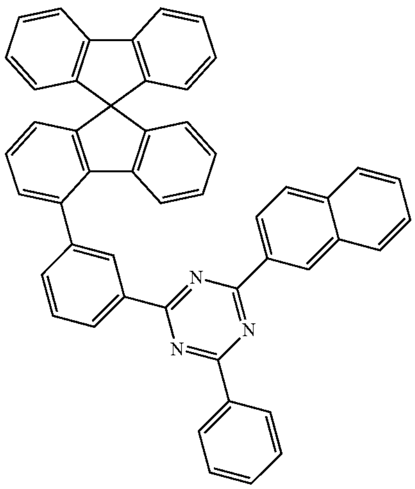
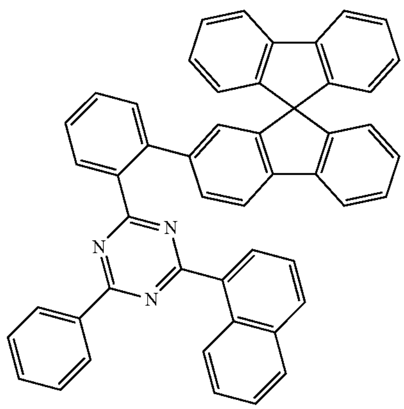
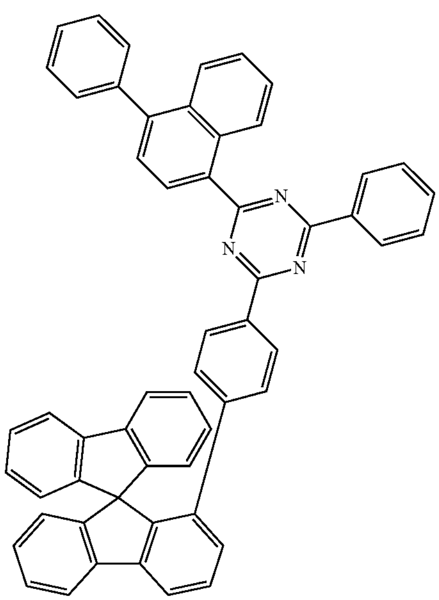
-continued
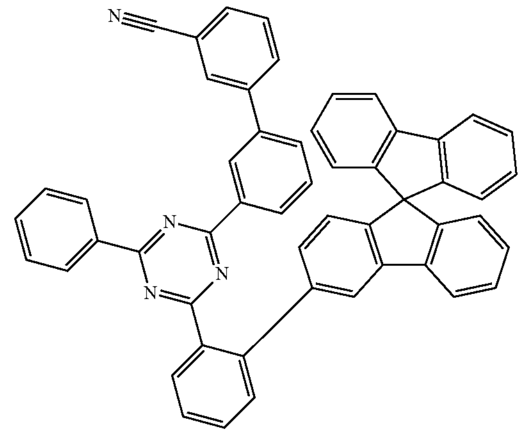
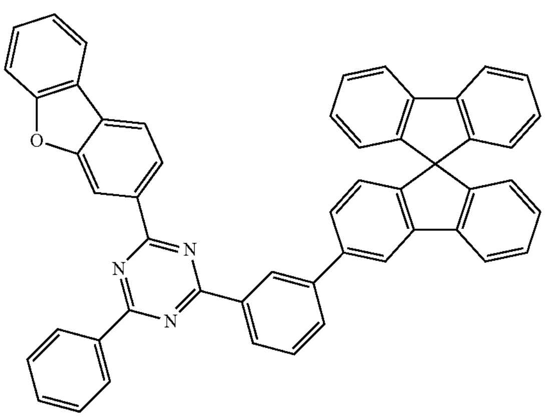
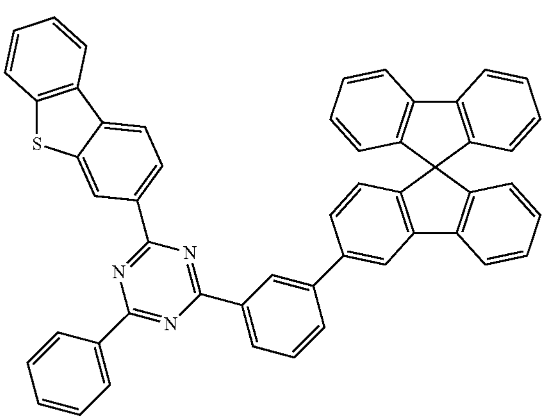

-continued
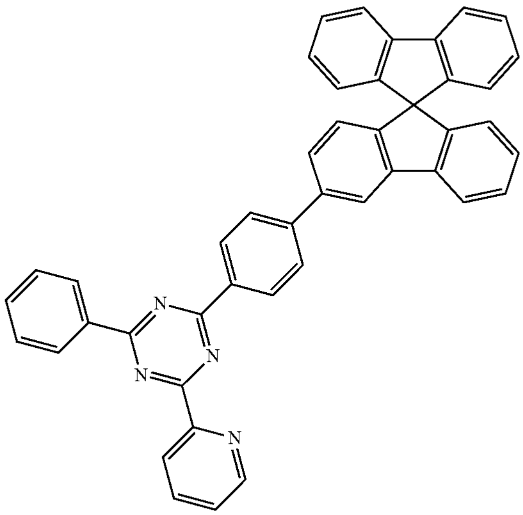
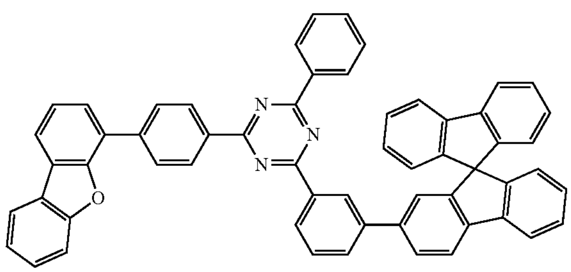
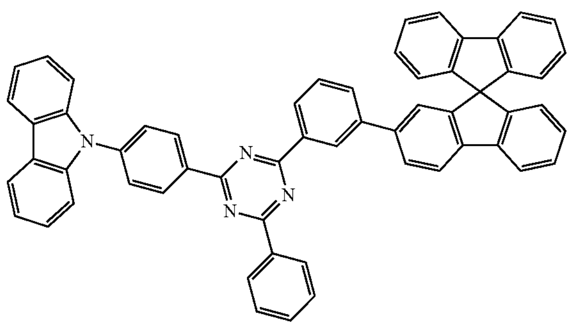
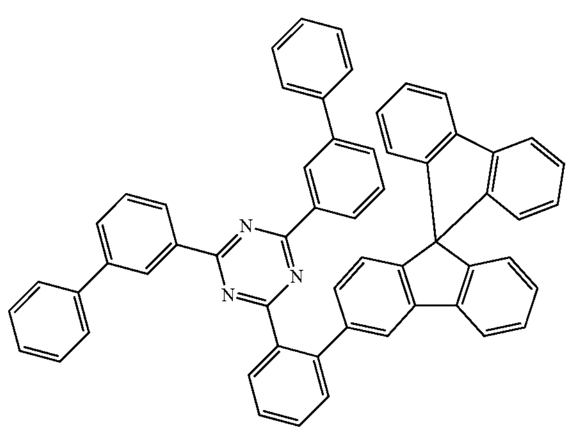
-continued
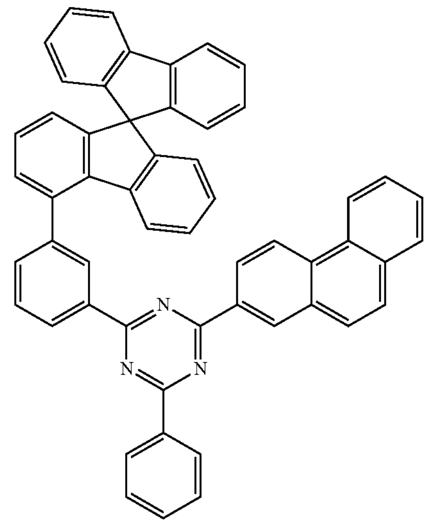
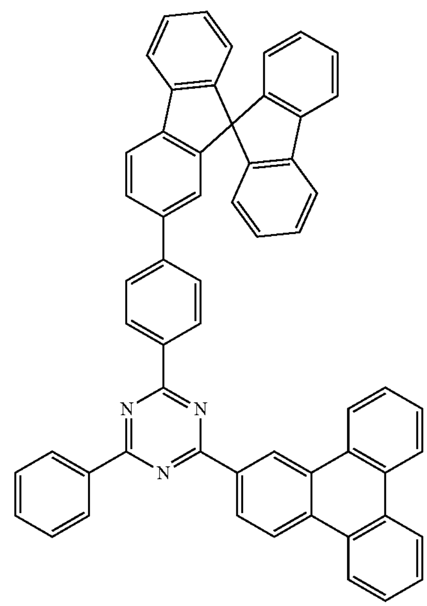
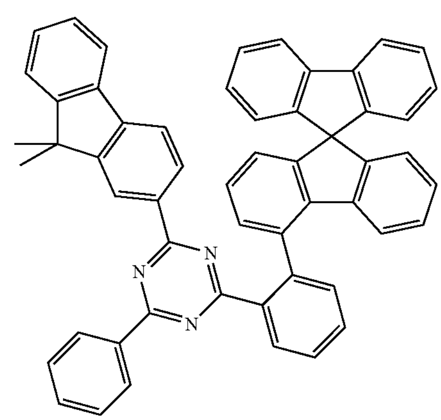

-continued
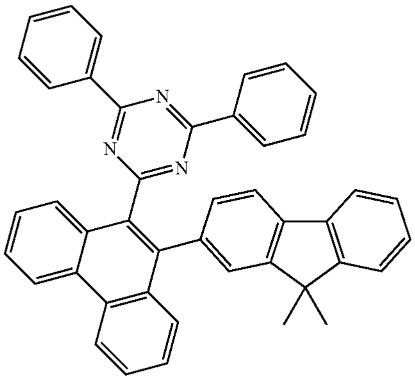
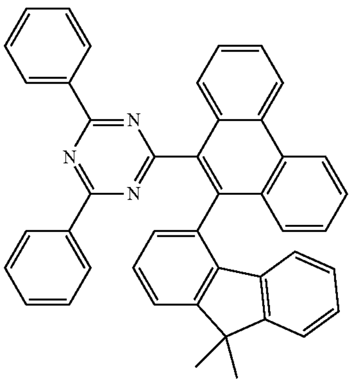
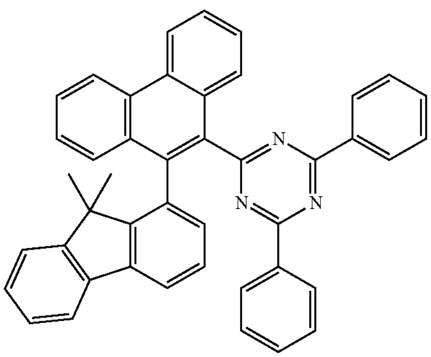
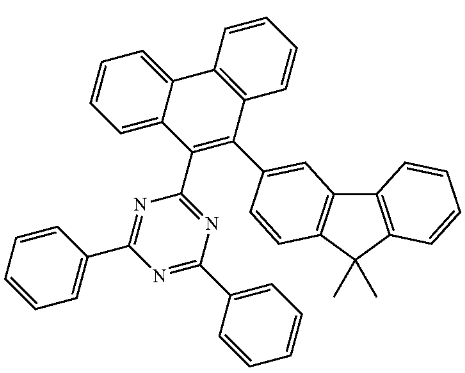
-continued
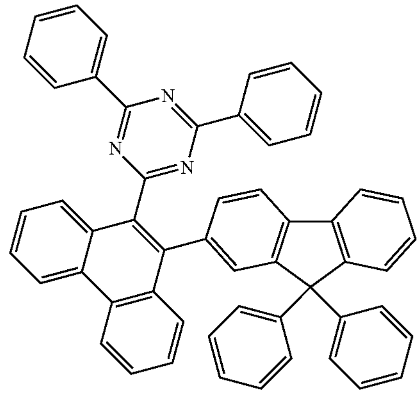
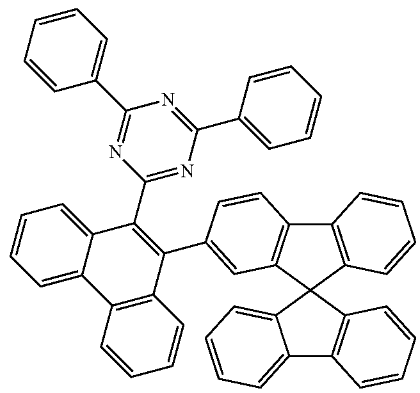
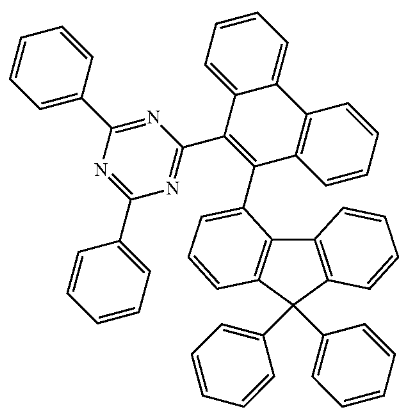
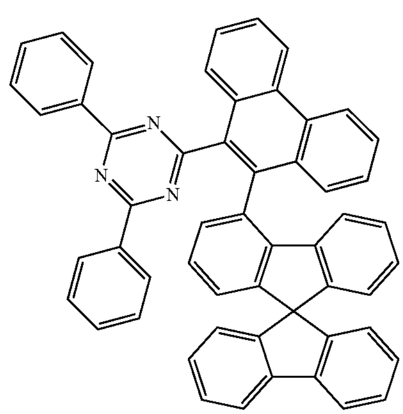

-continued
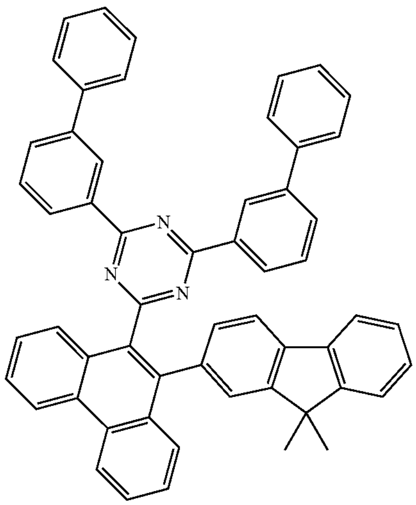
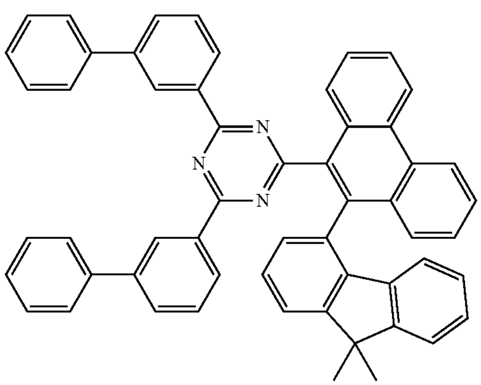
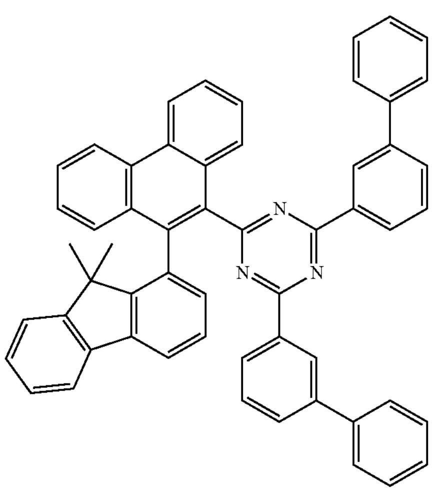
-continued
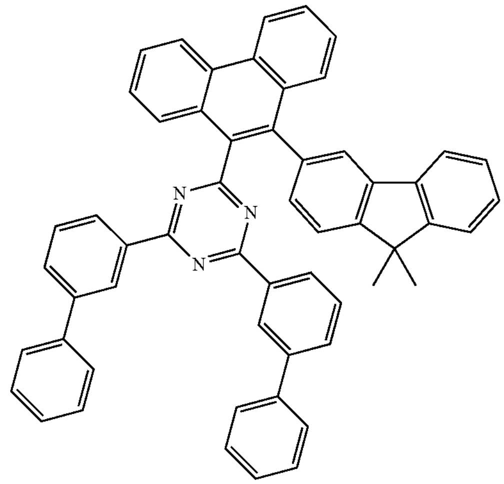
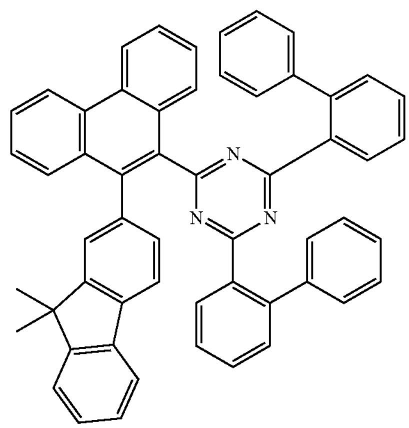
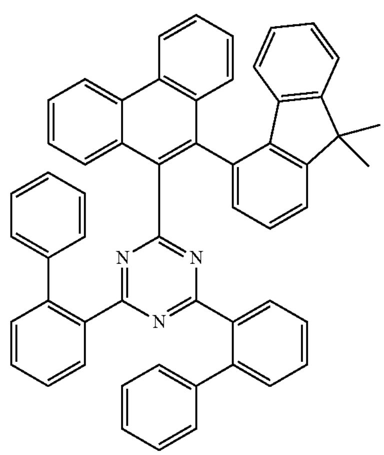
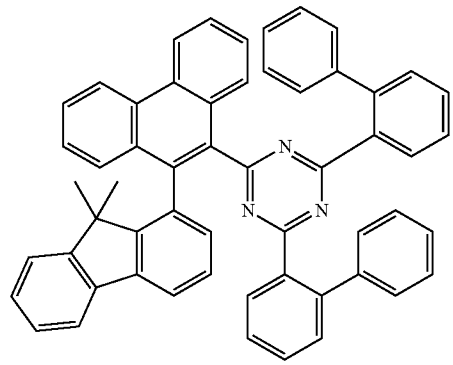

-continued
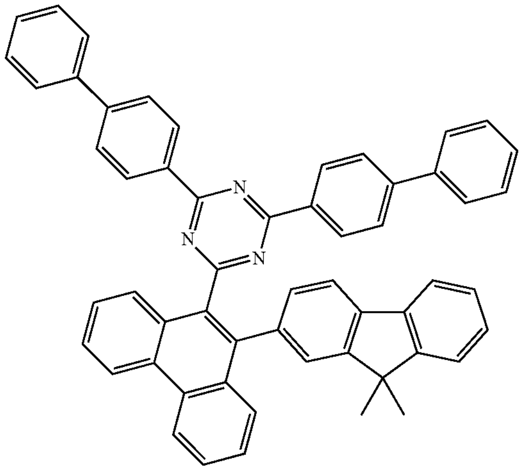
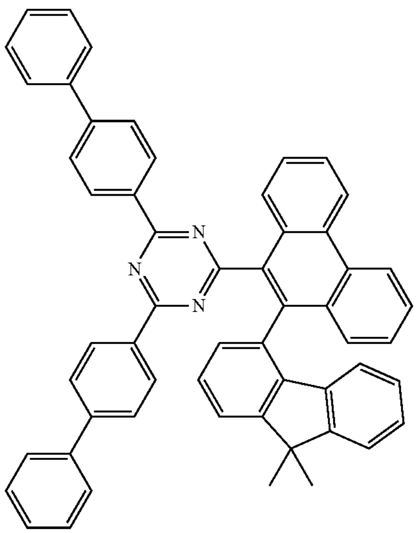
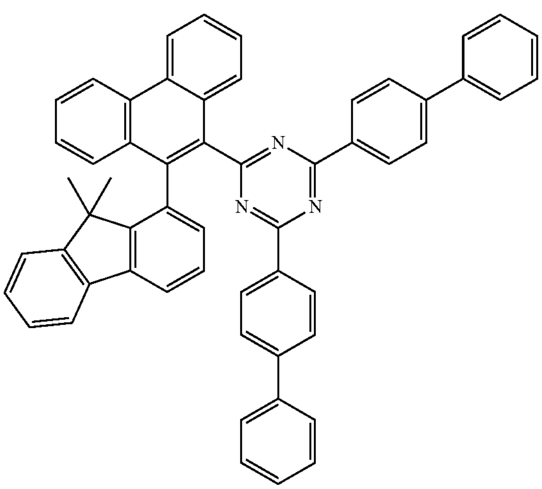
-continued
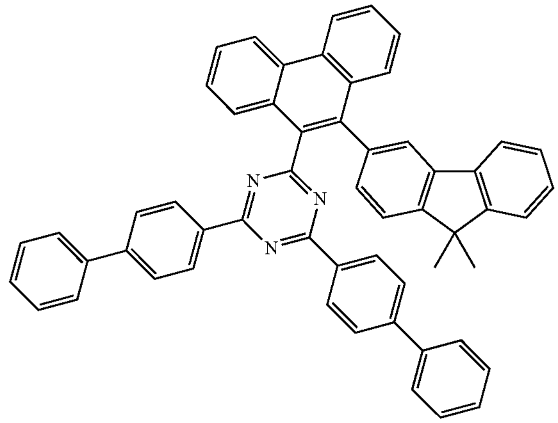
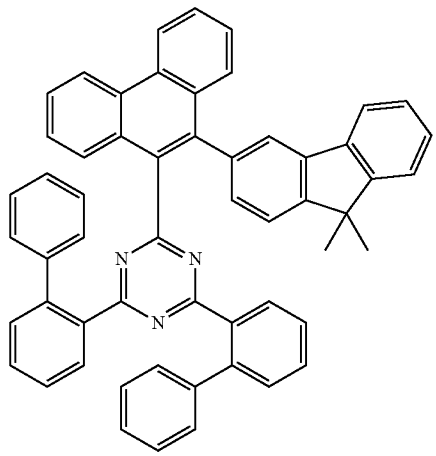
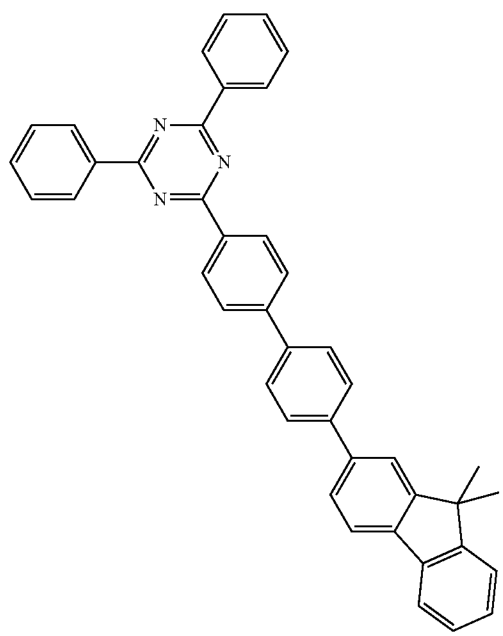

-continued
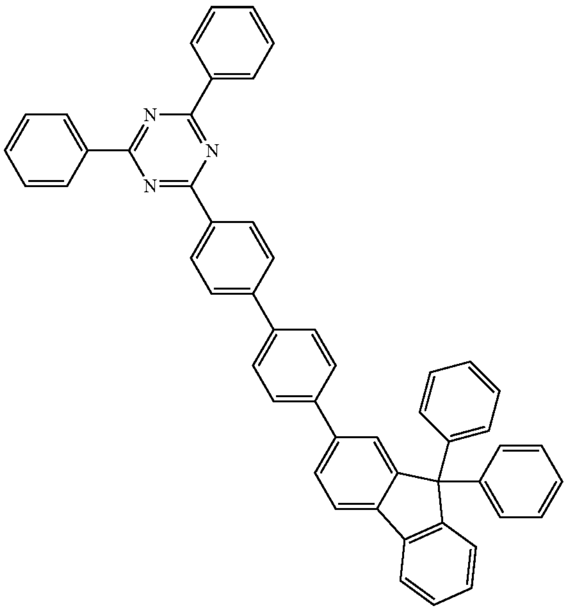
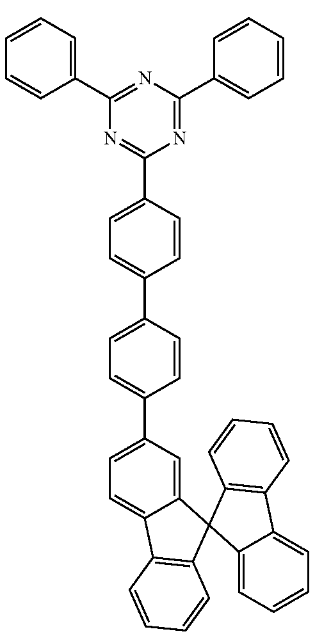
-continued
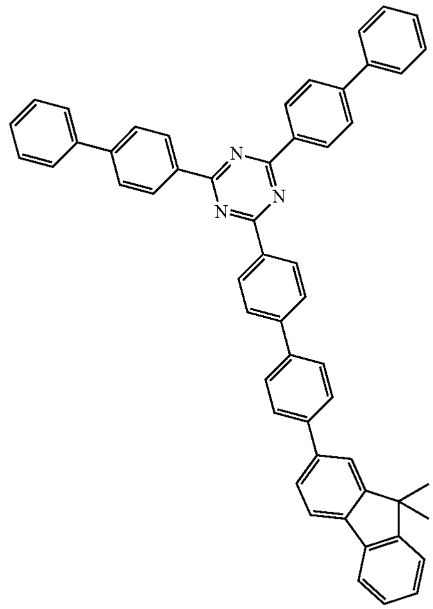
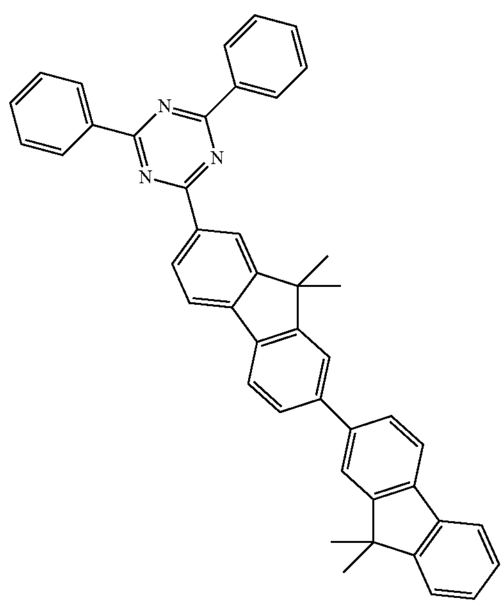

-continued
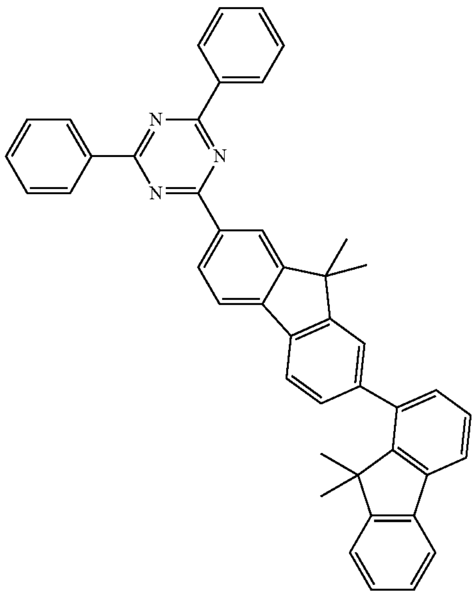
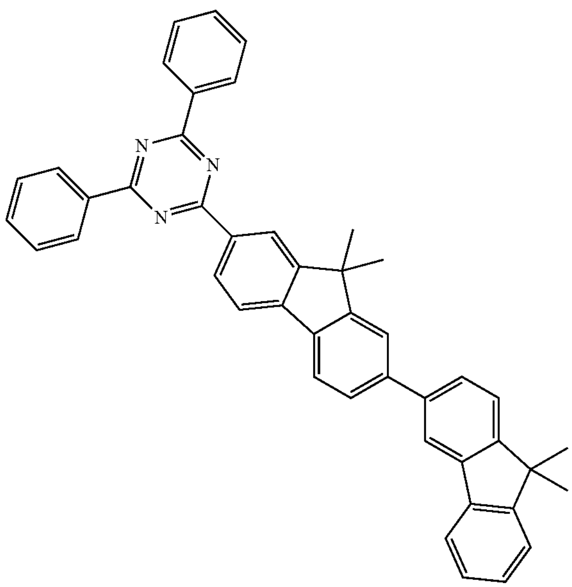
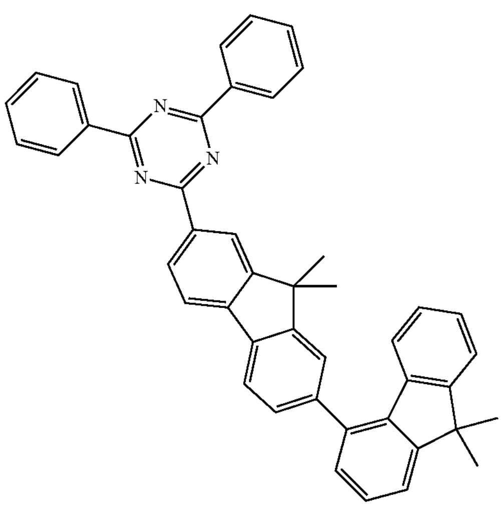
-continued
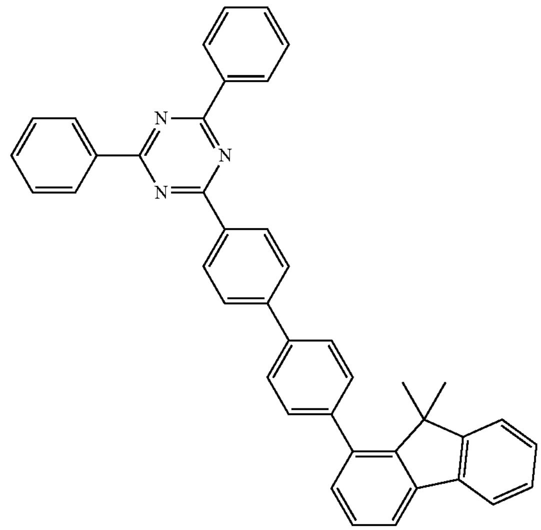
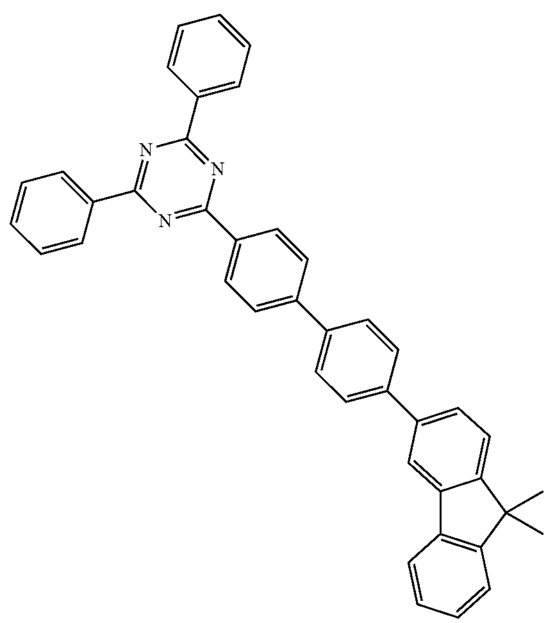

-continued
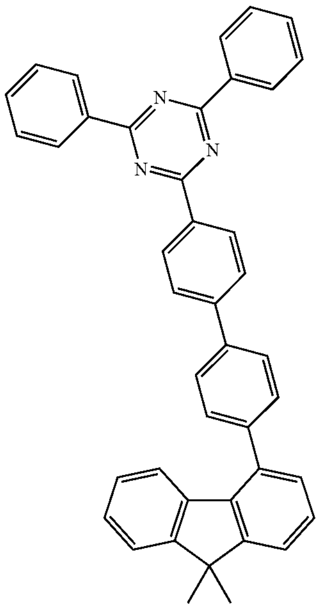
-continued
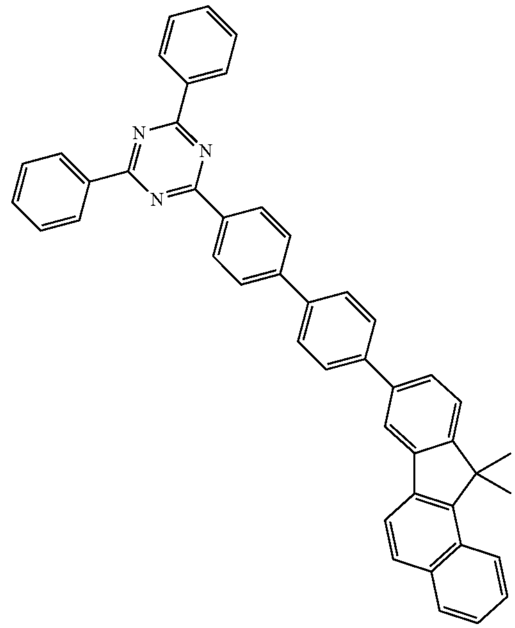
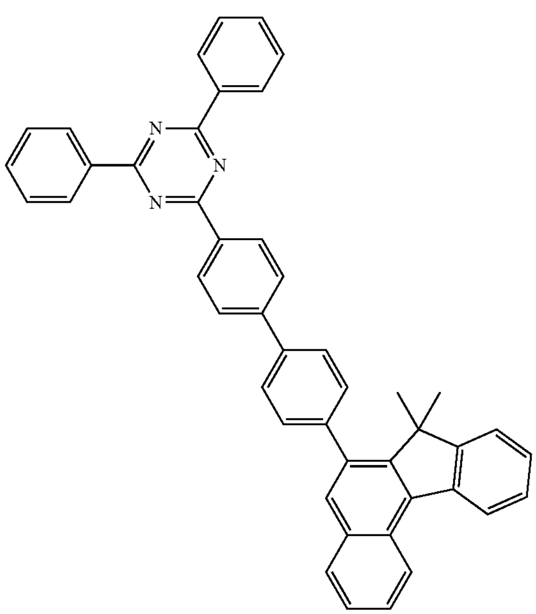
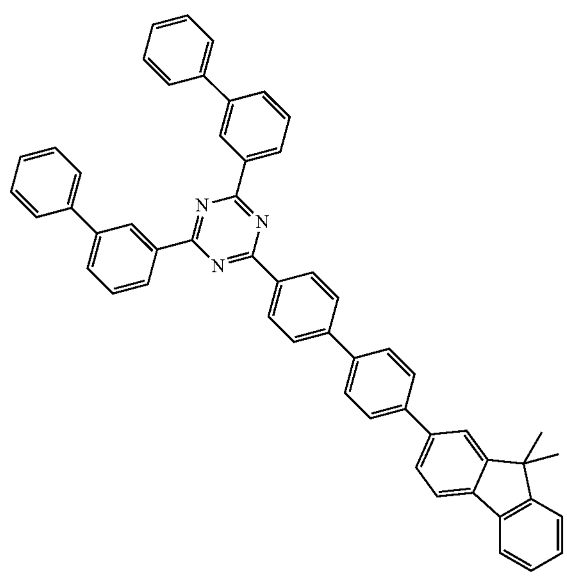

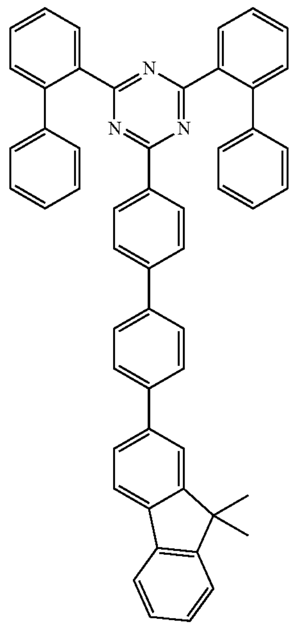
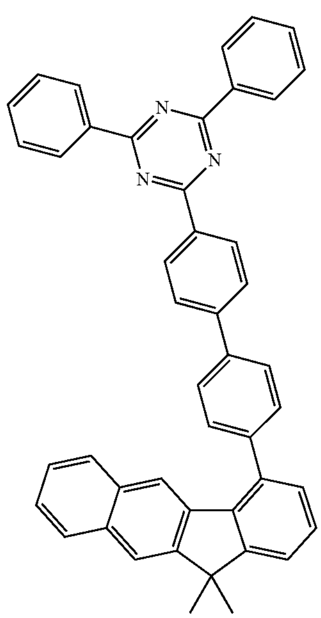
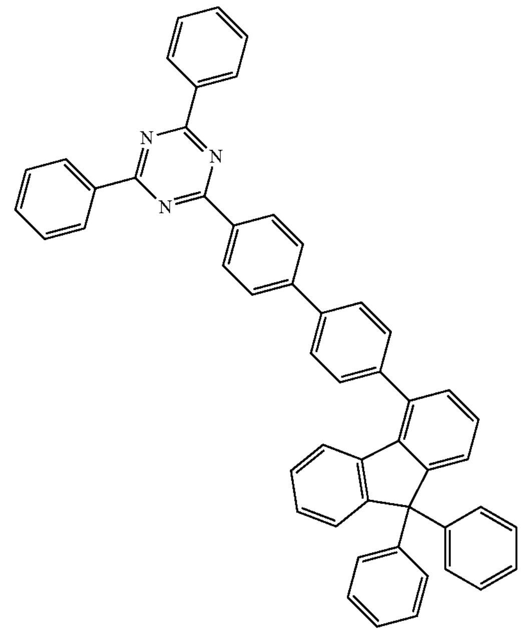
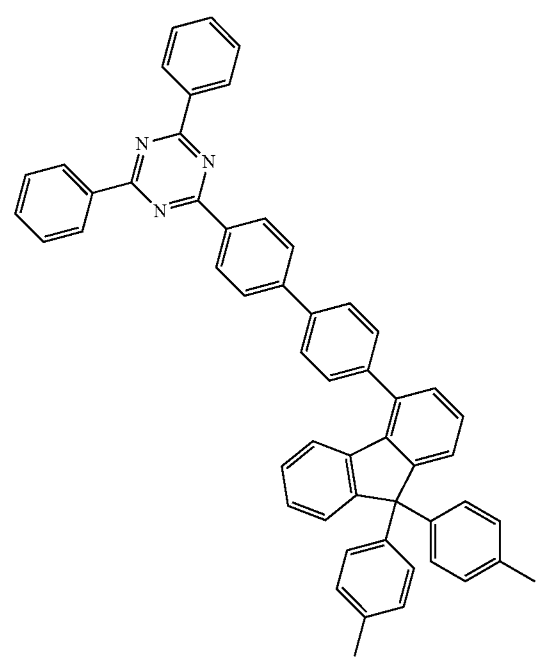

-continued
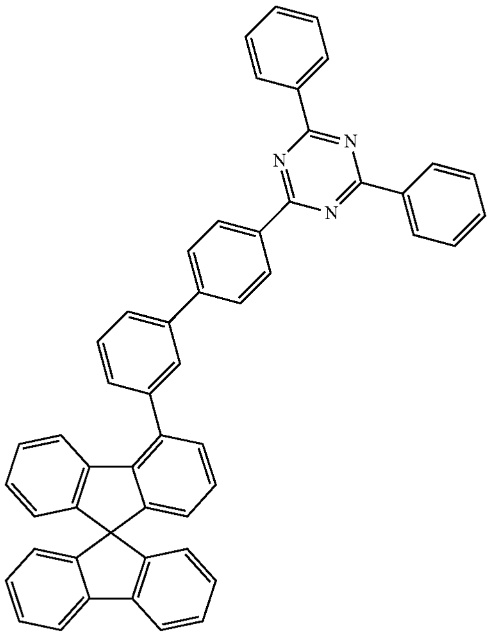
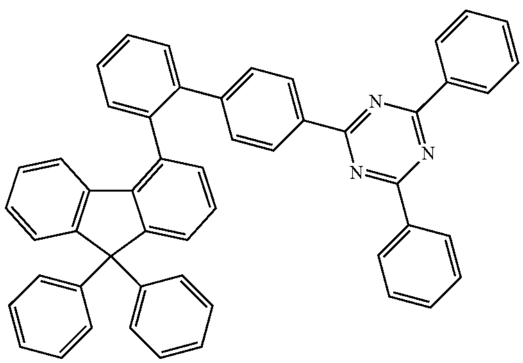
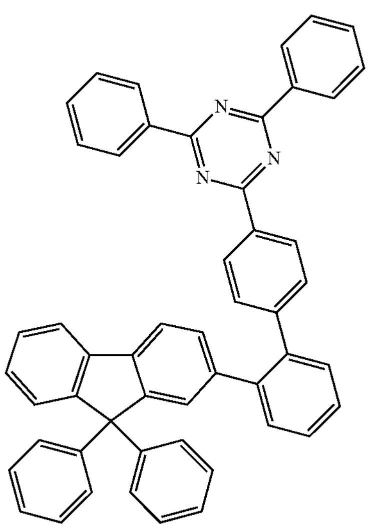
-continued
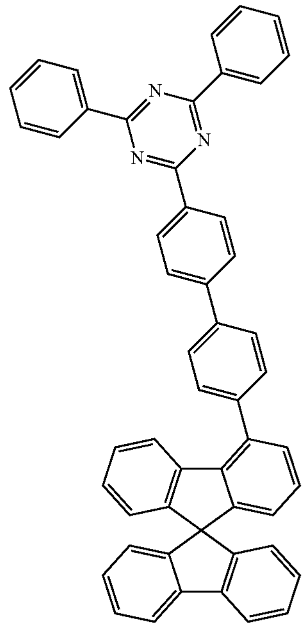
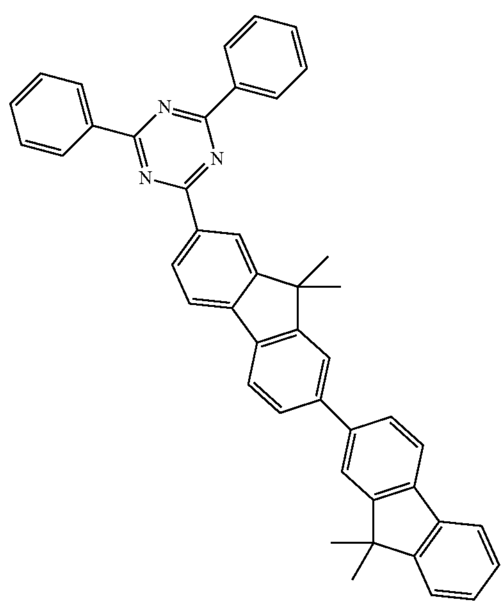

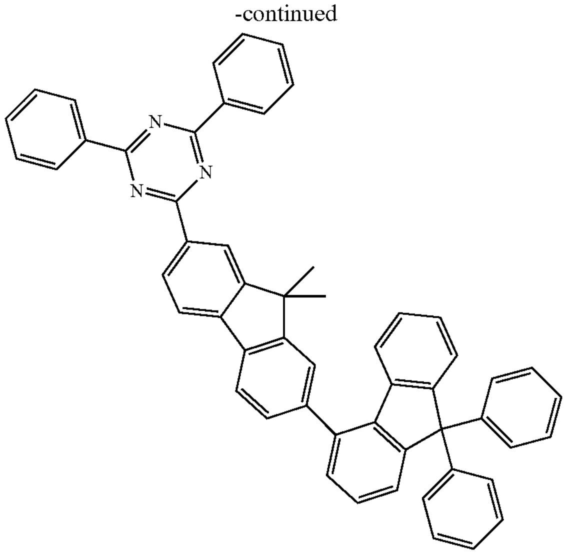
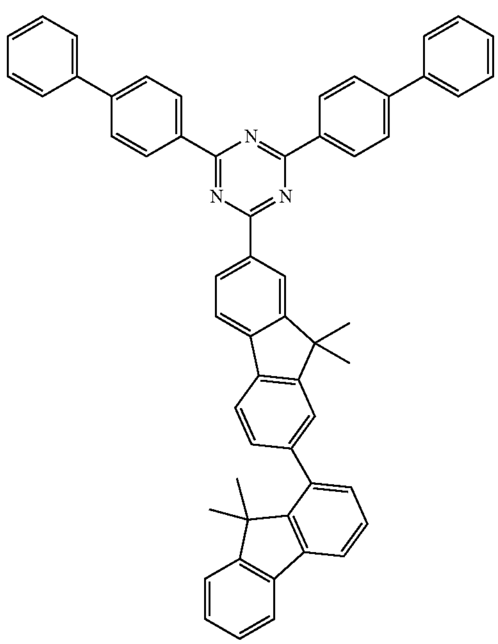
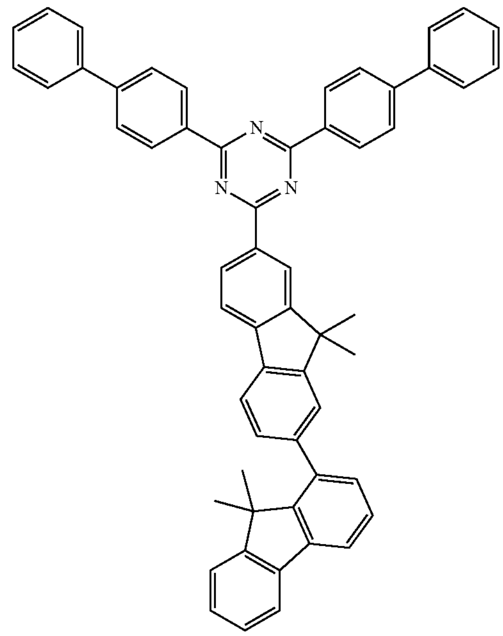
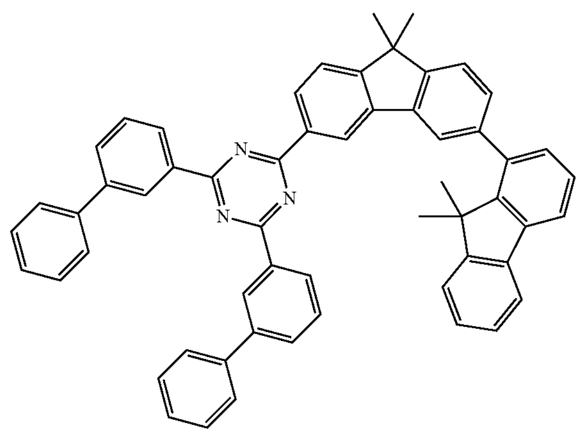
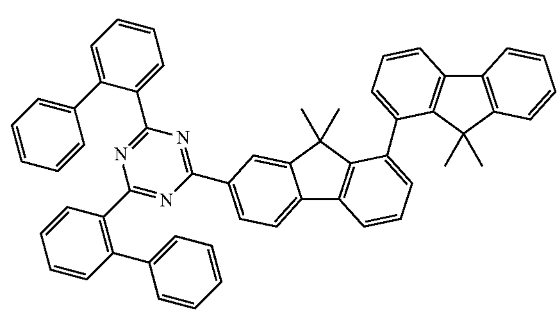

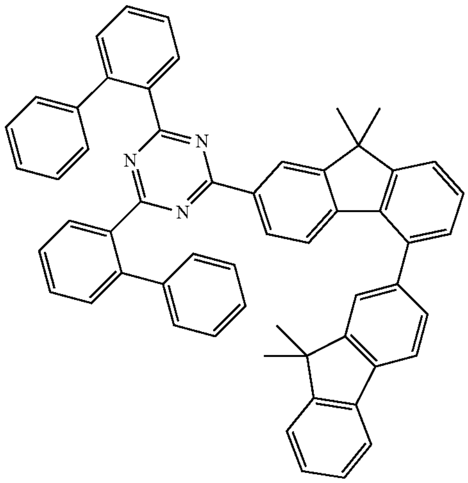
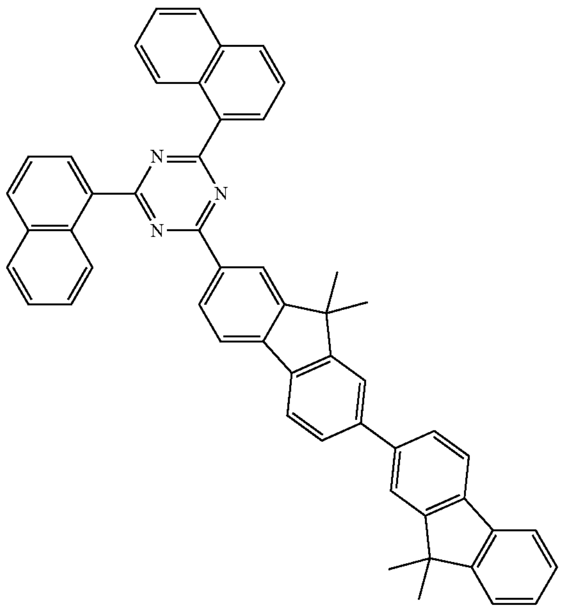
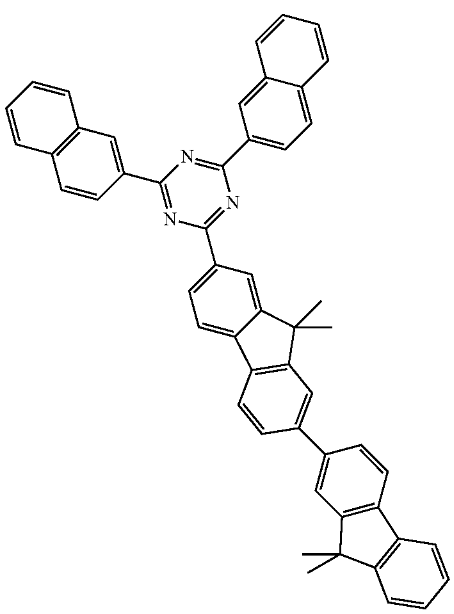
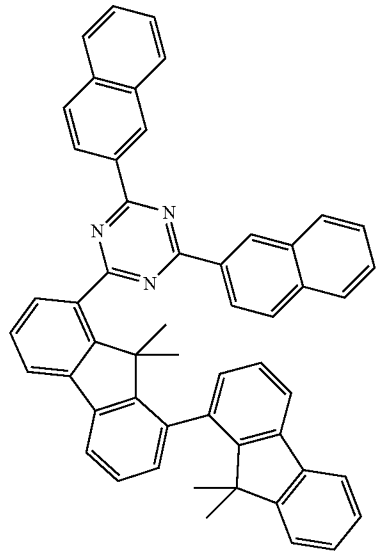
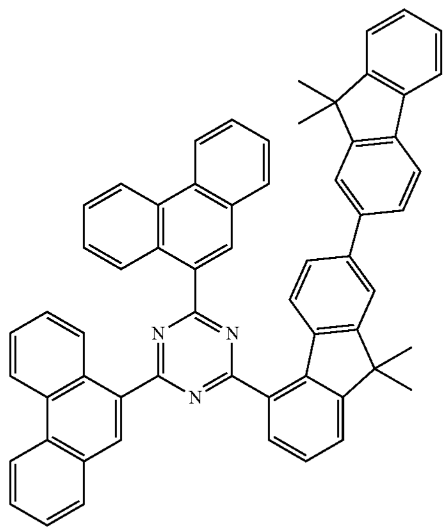
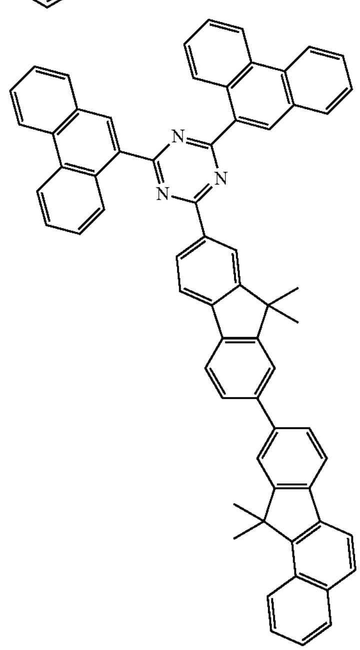

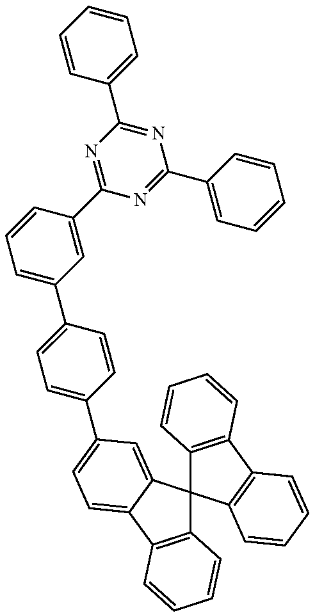
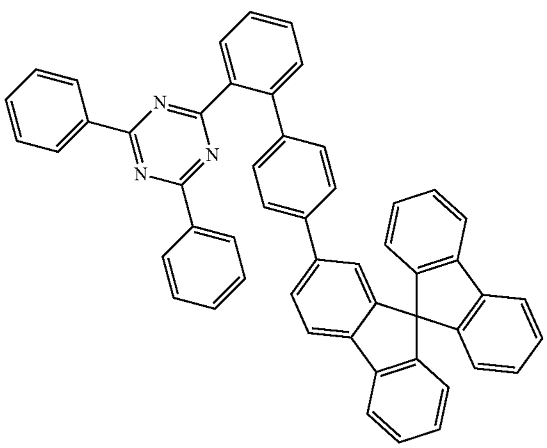
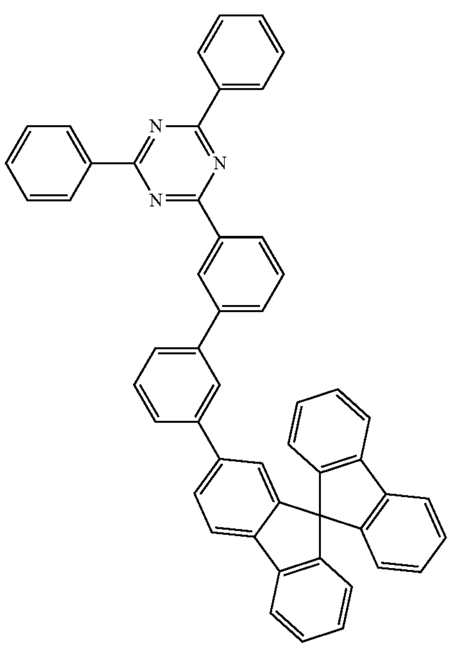
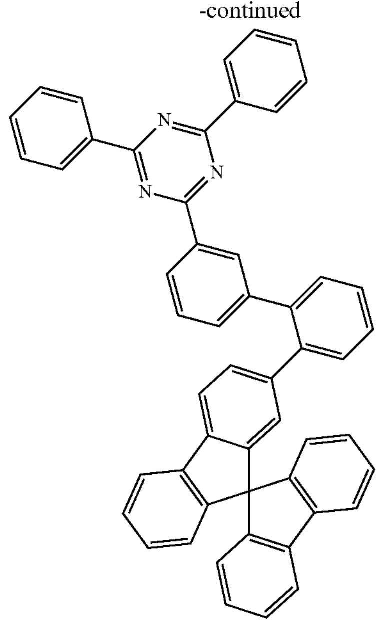
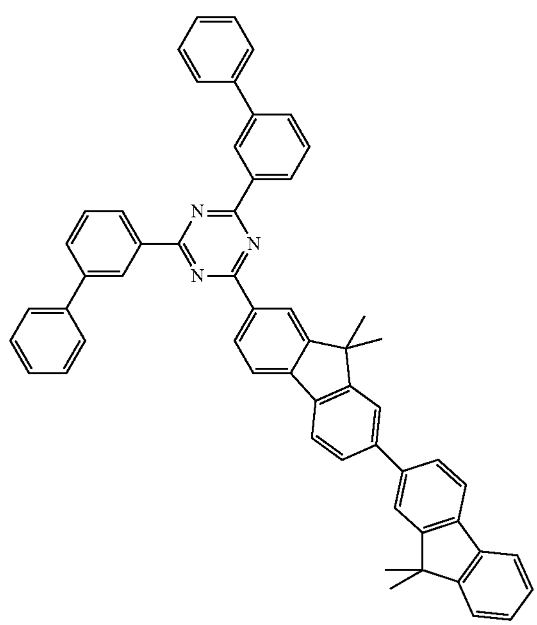

-continued
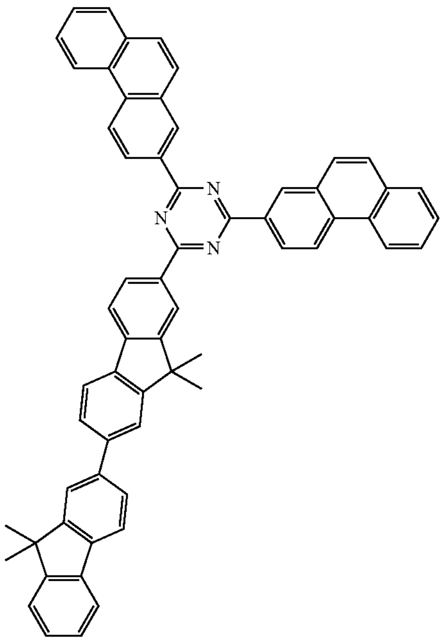
-continued
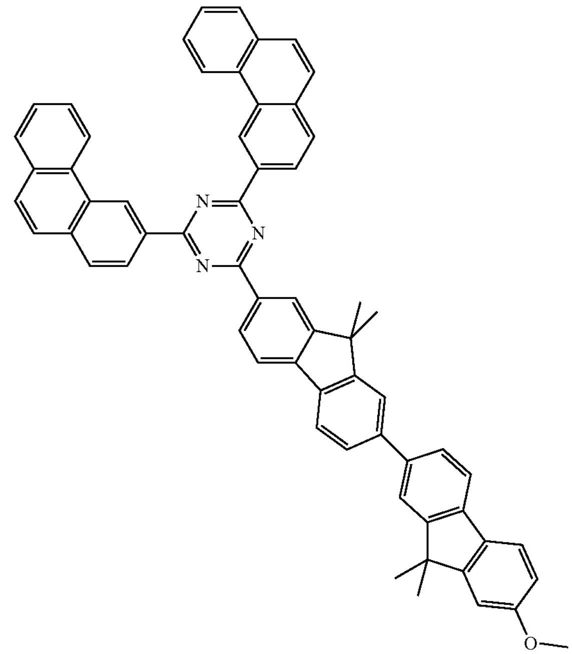
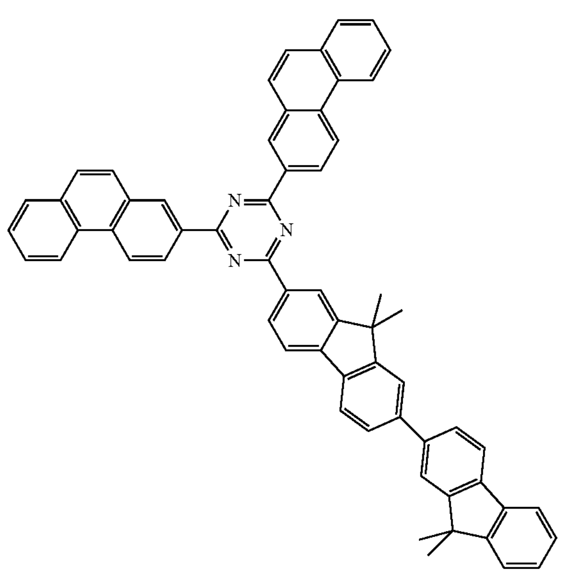
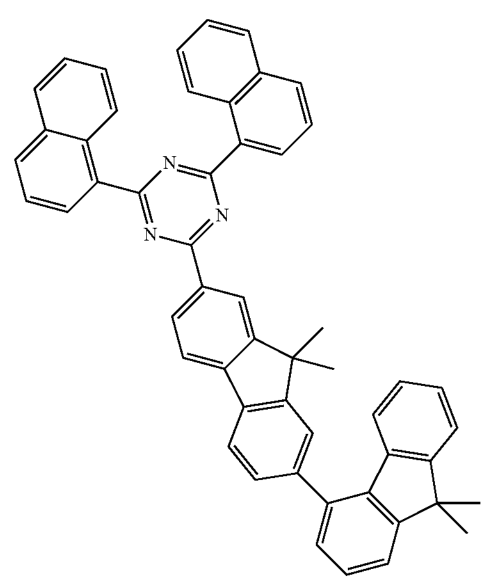

-continued
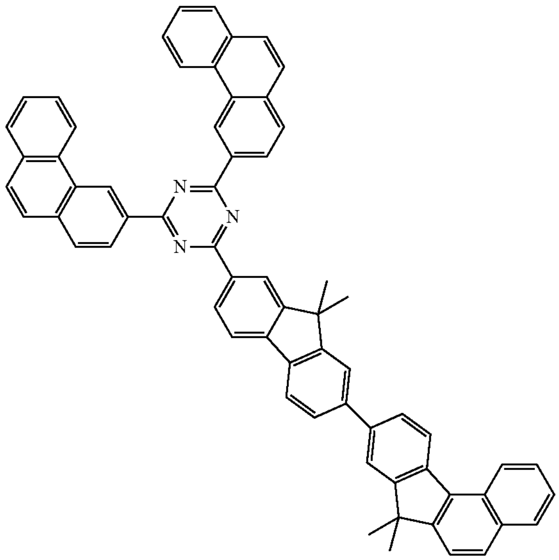
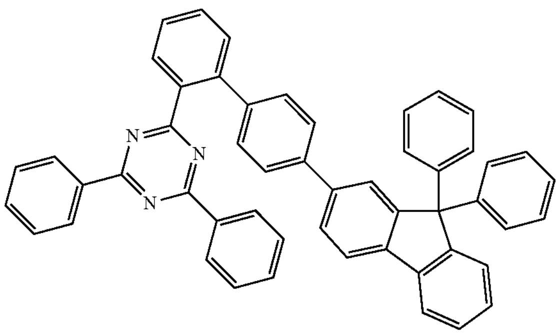
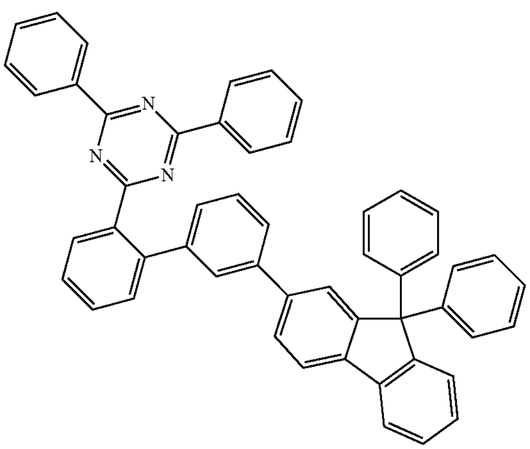
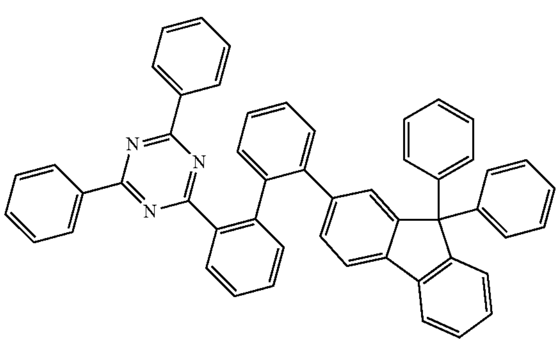
-continued
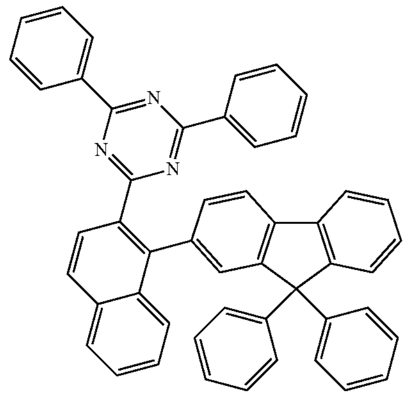
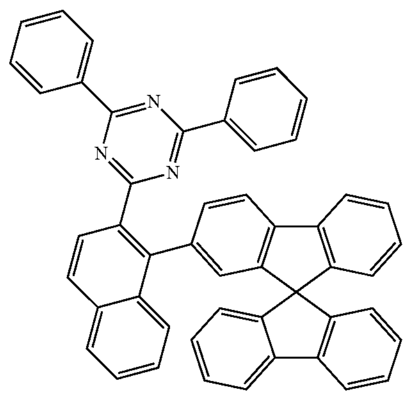
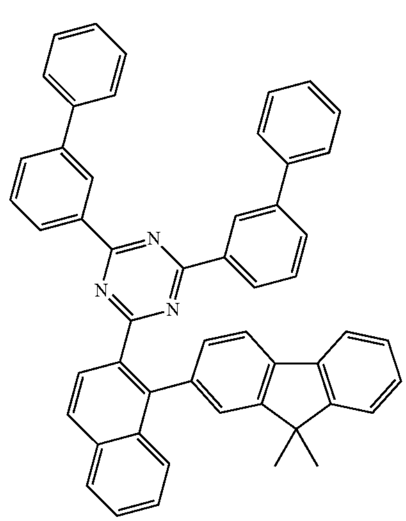

-continued
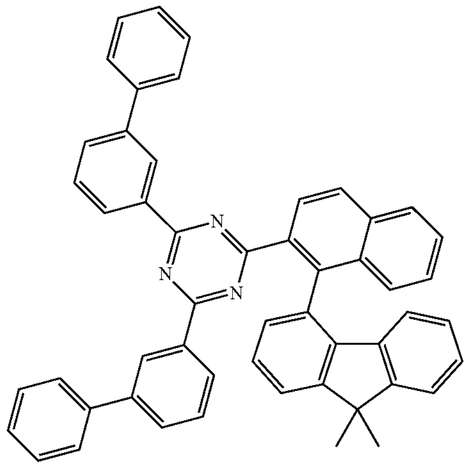
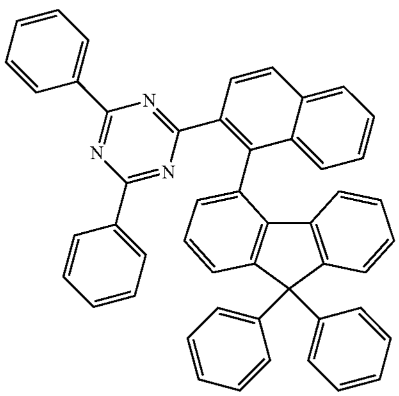
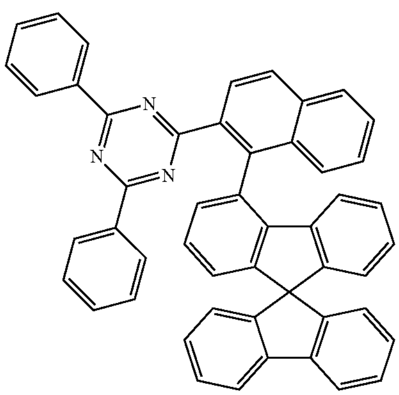
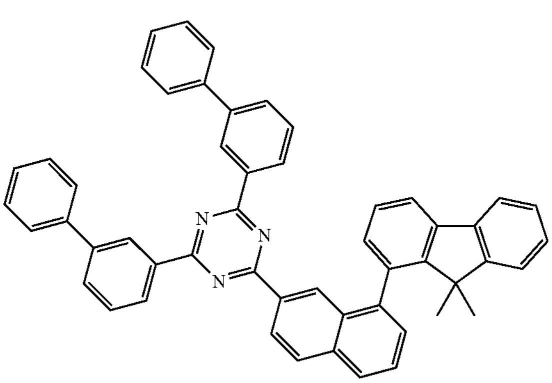
-continued
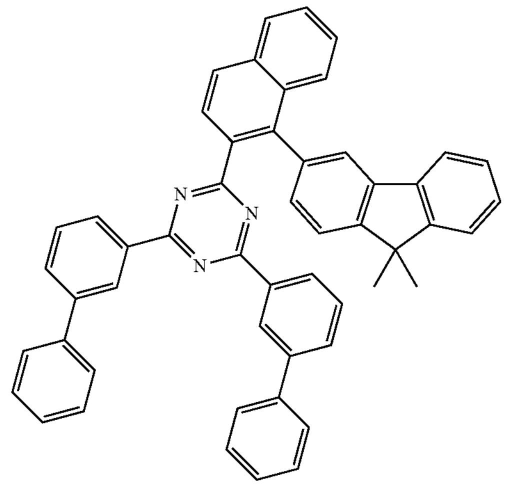
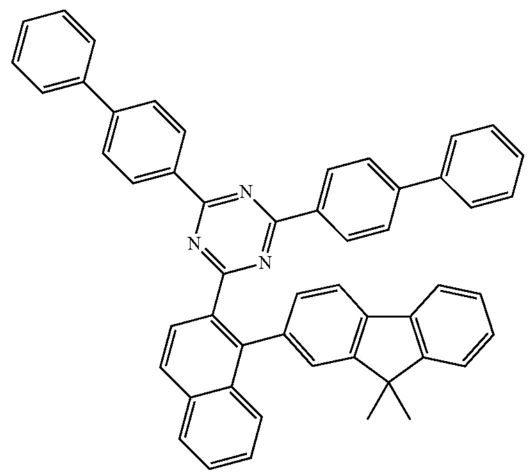
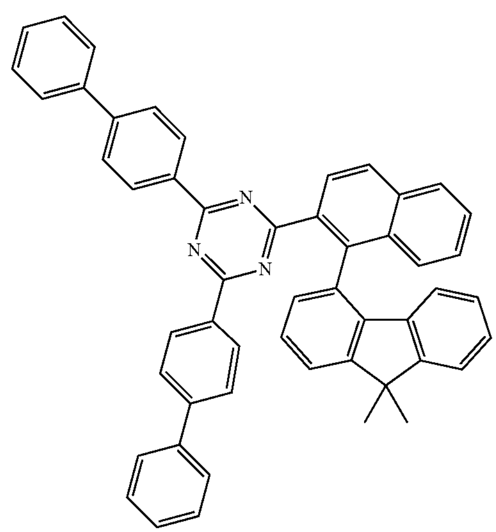

-continued
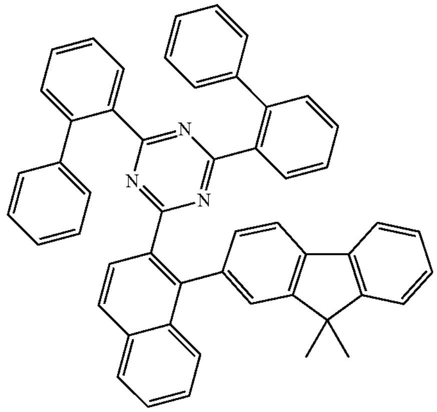
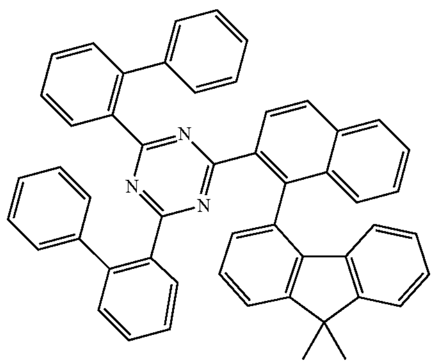
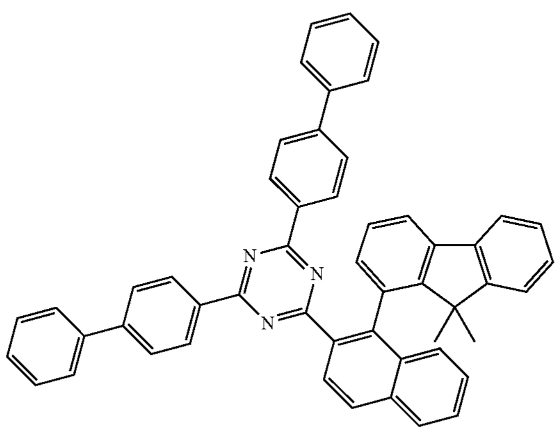
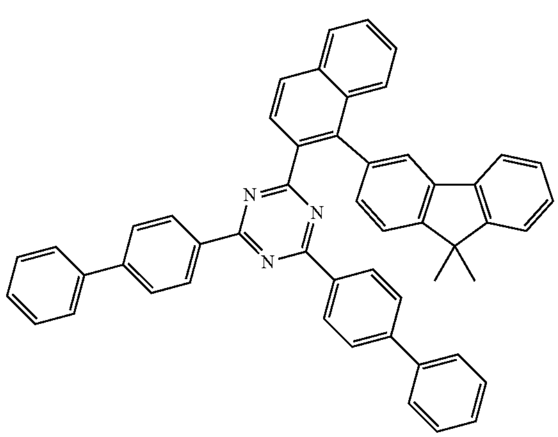
-continued
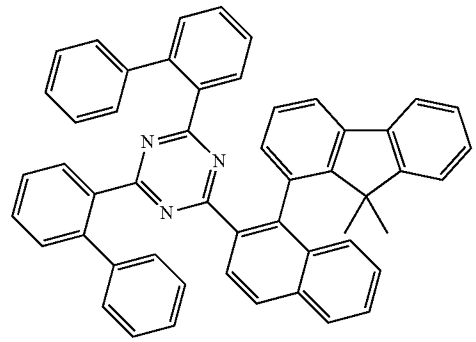
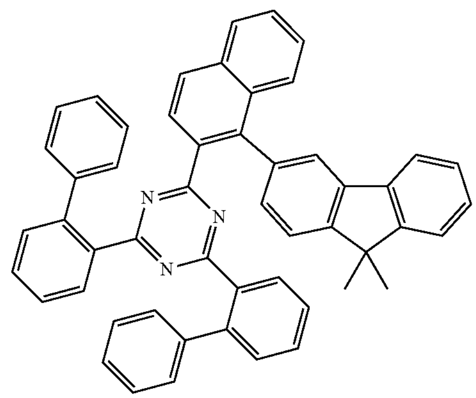
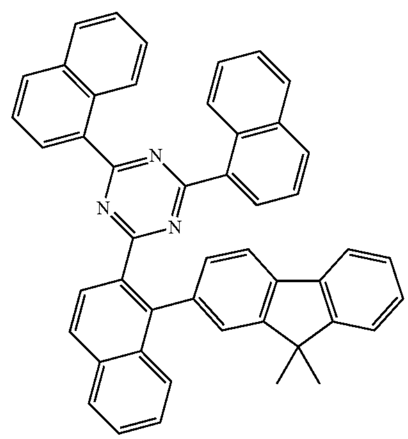
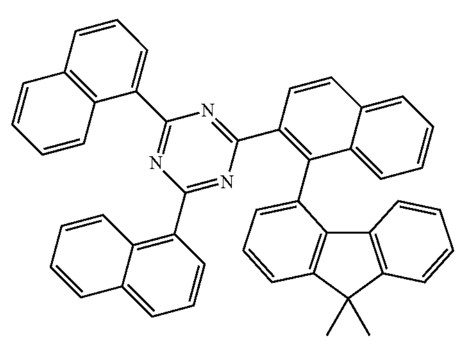

-continued
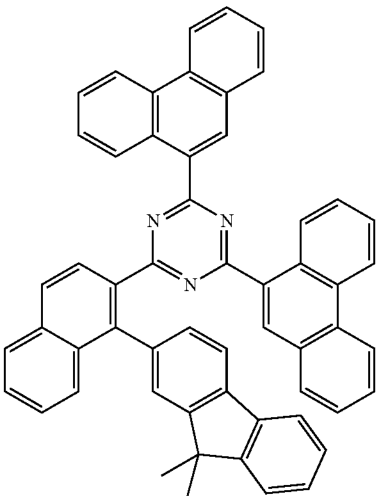
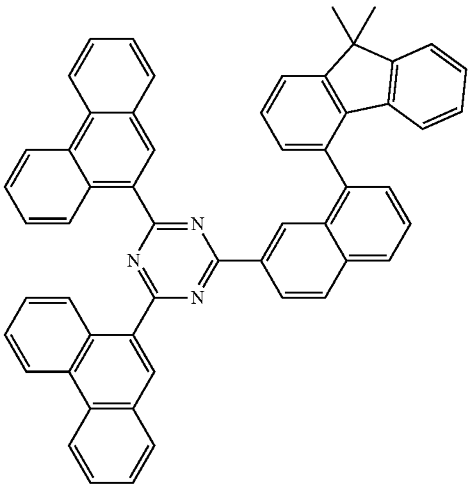
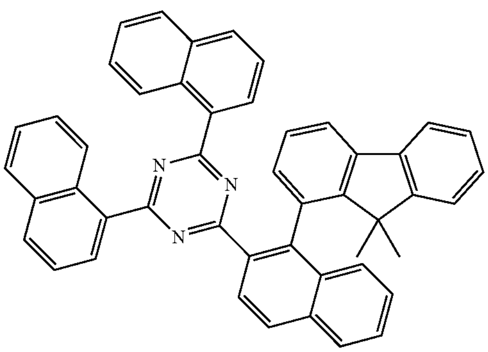
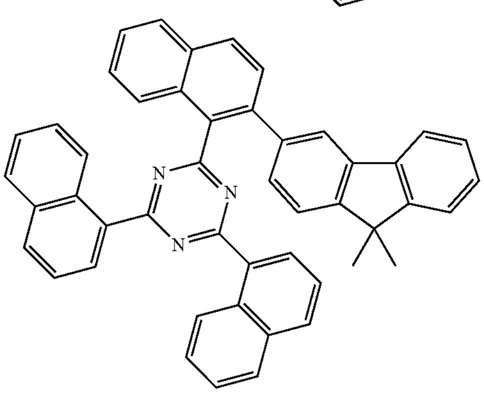
-continued
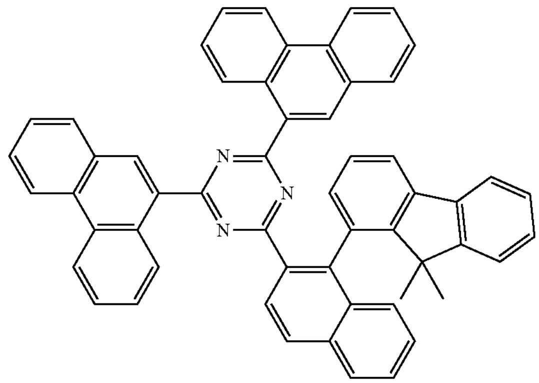
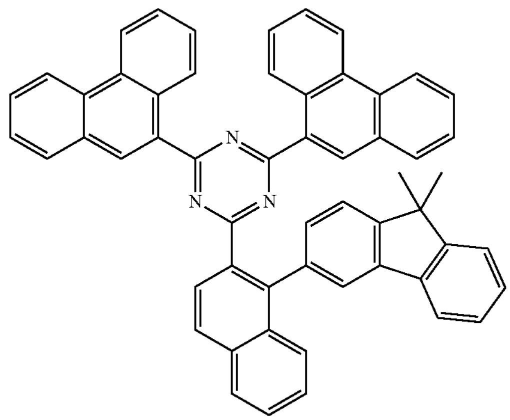
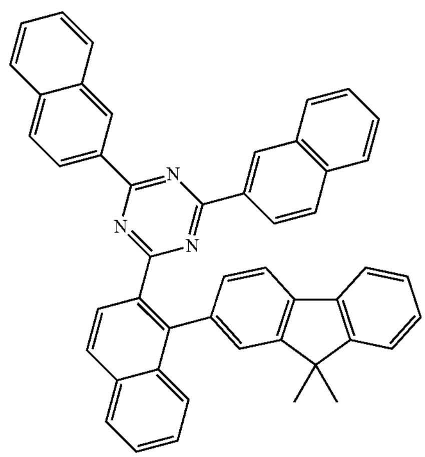
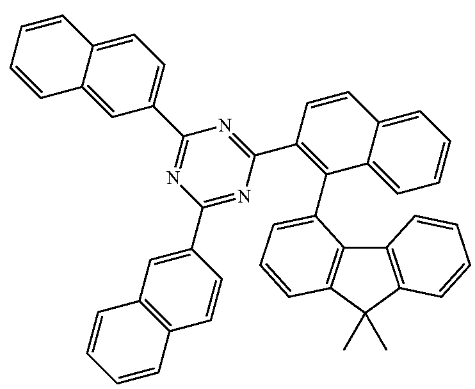

-continued
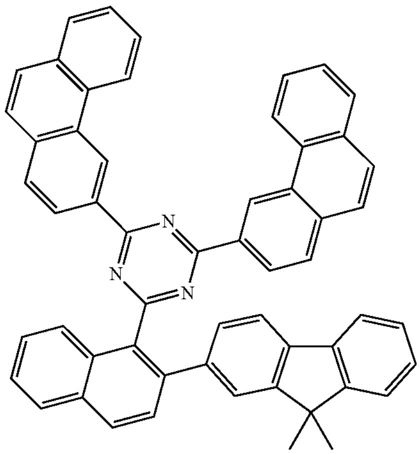
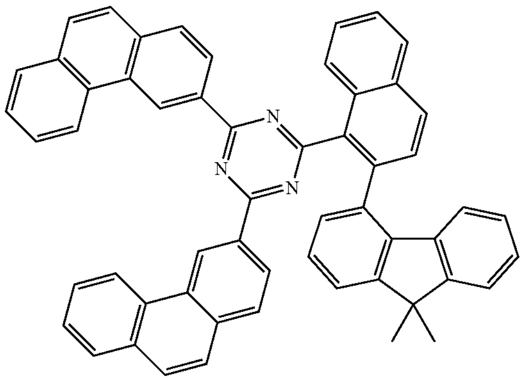
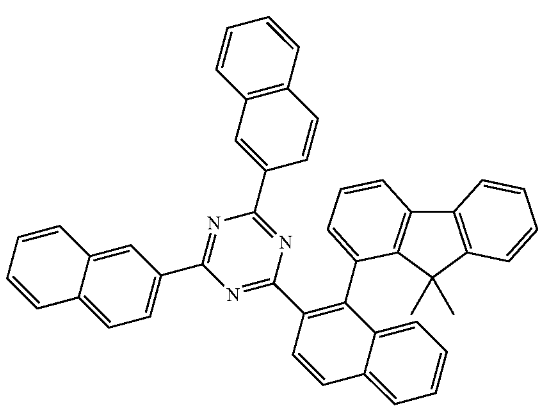
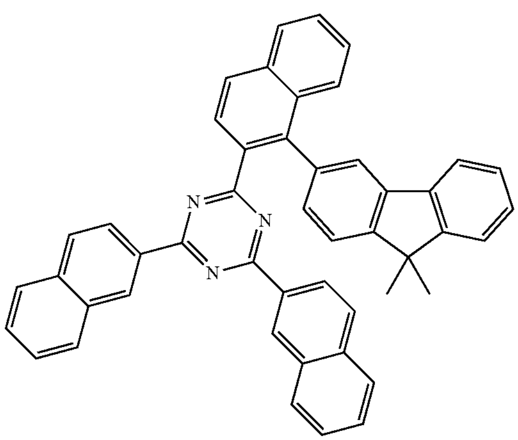
-continued
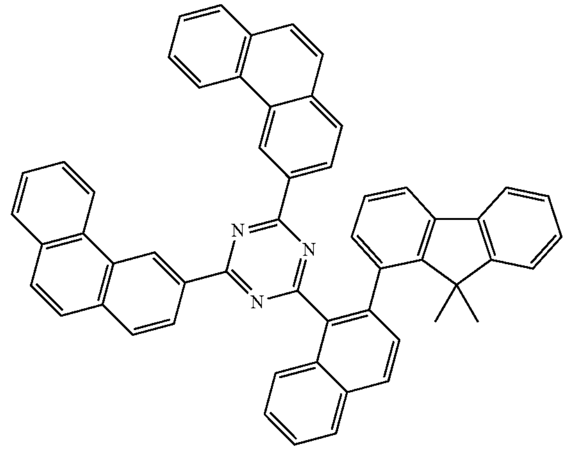
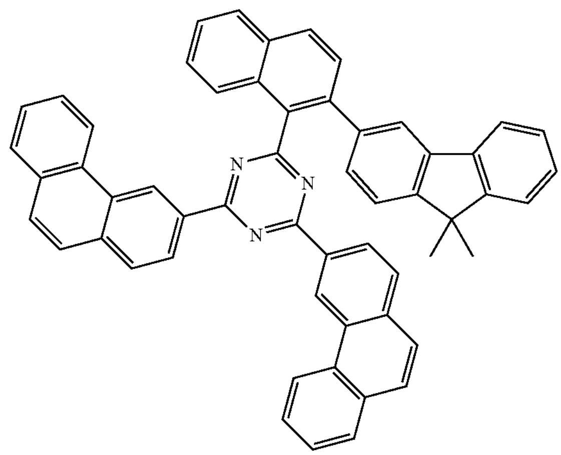
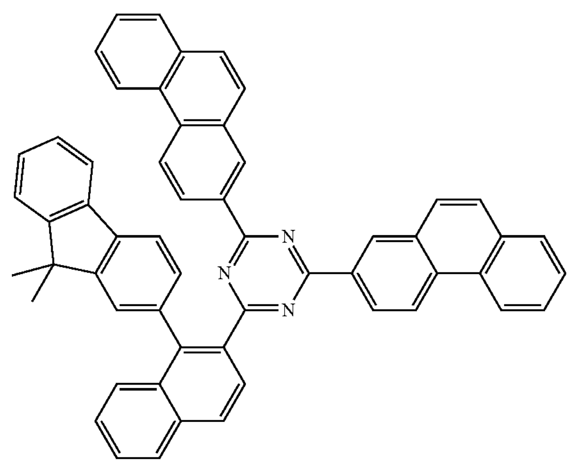

-continued
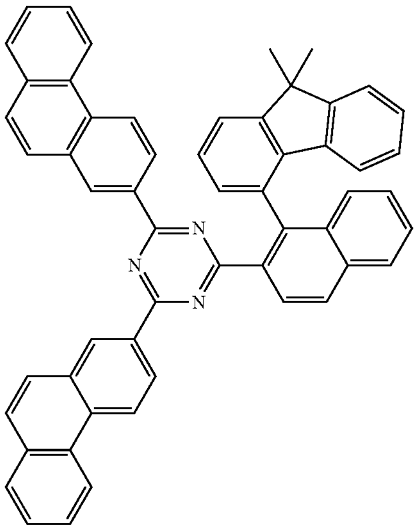
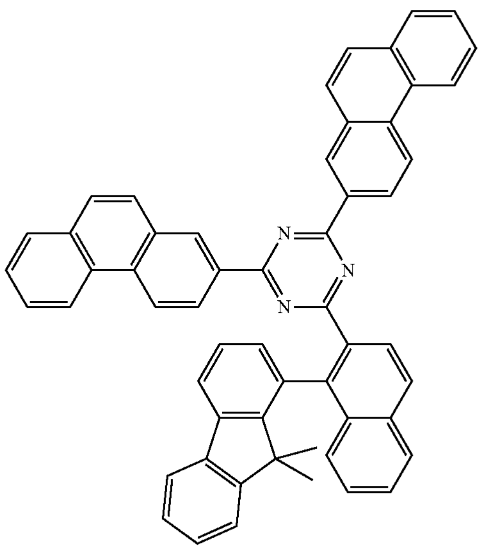
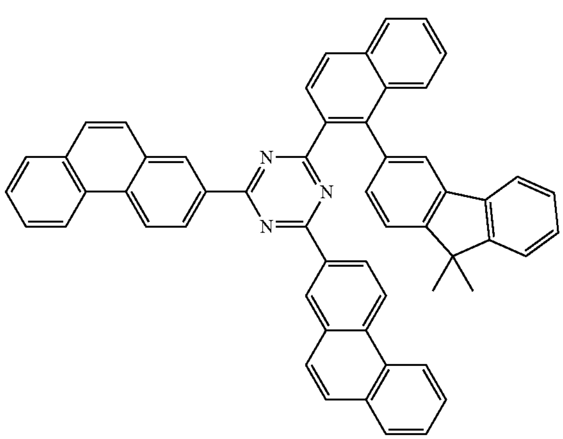 [SMILES: CC1(C)c2ccccc2-c2cc(-c3c(-c4nc(-c5ccc6c(ccc7ccccc76)c5)nc(-c5ccc6c(ccc7ccccc76)c5)n4)ccc4ccccc34)ccc21]
-continued
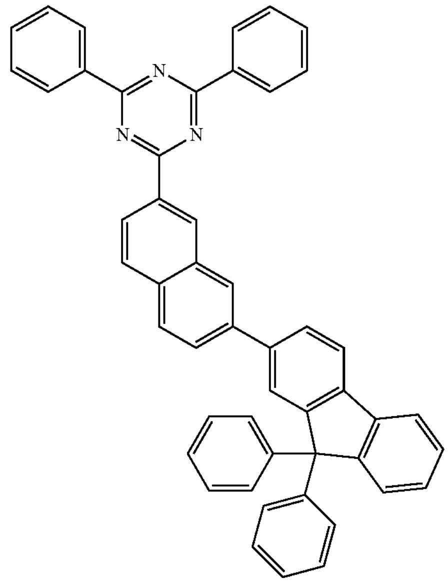
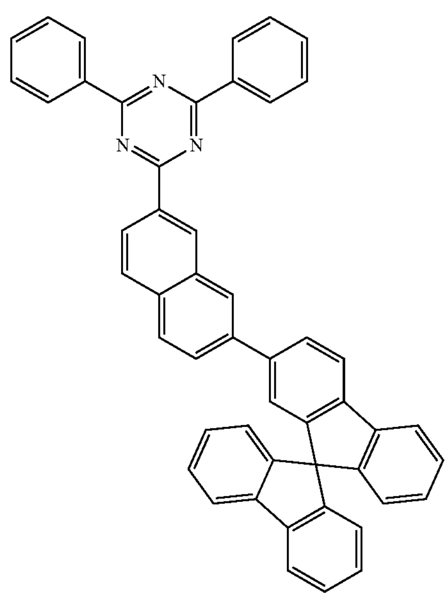

-continued
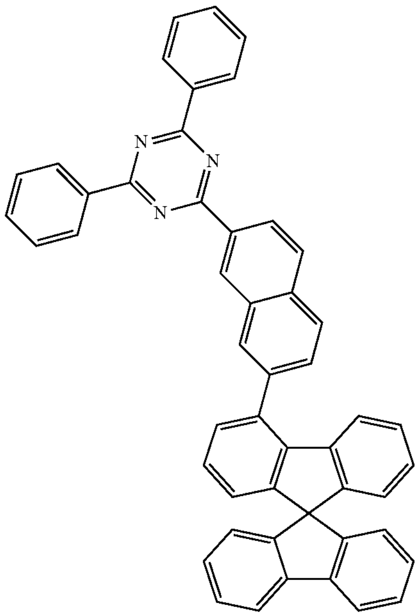
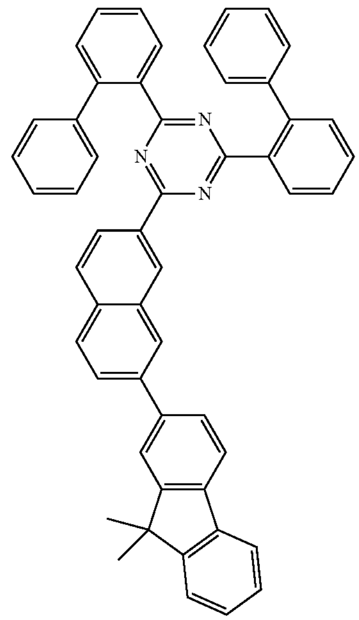
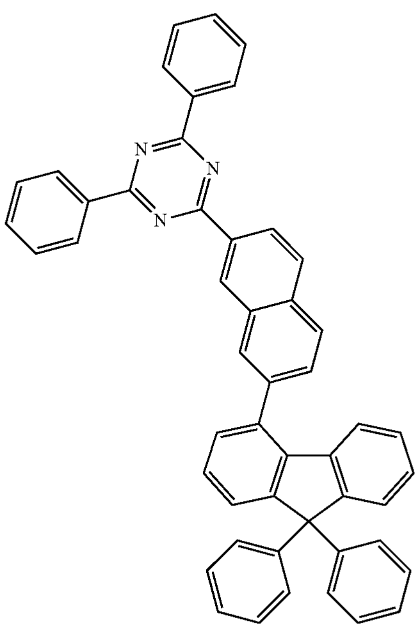
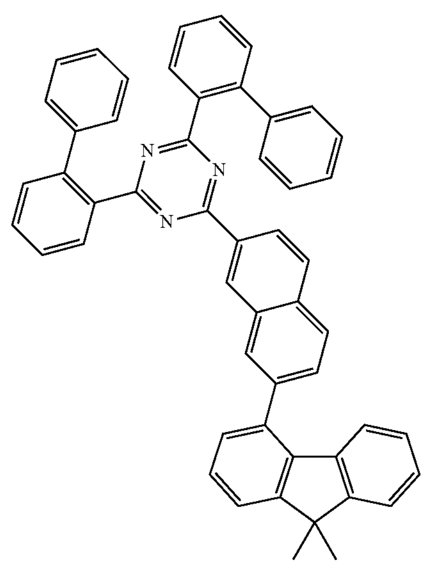
-continued

-continued
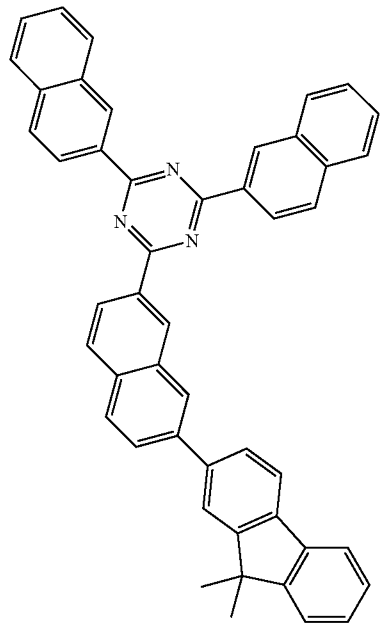
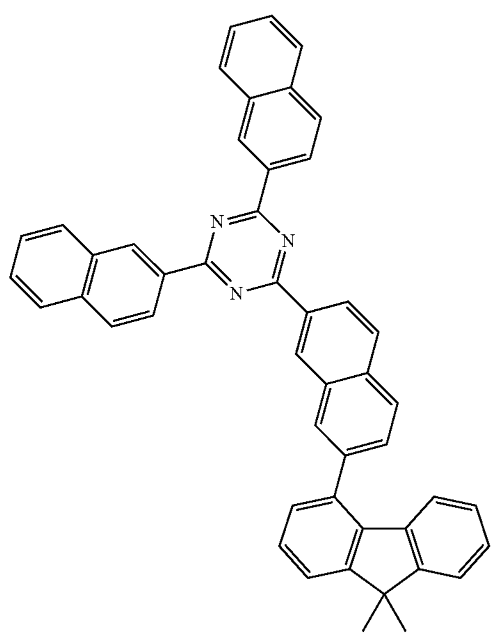
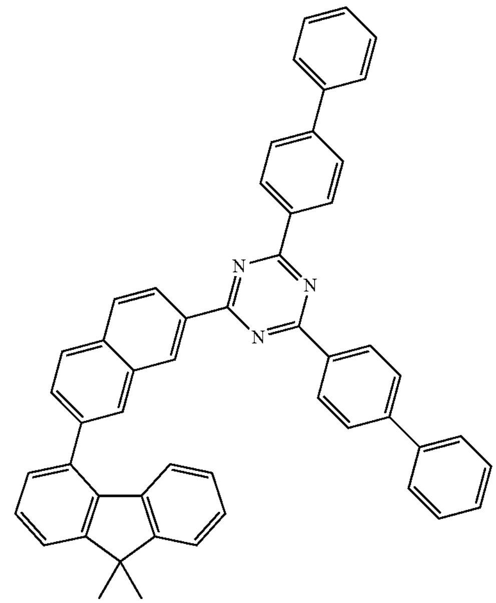
-continued
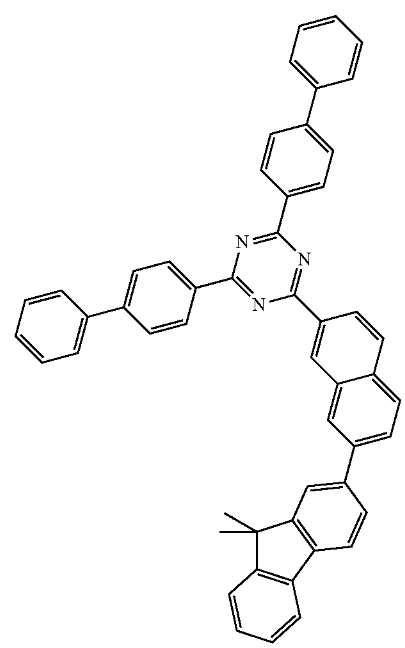

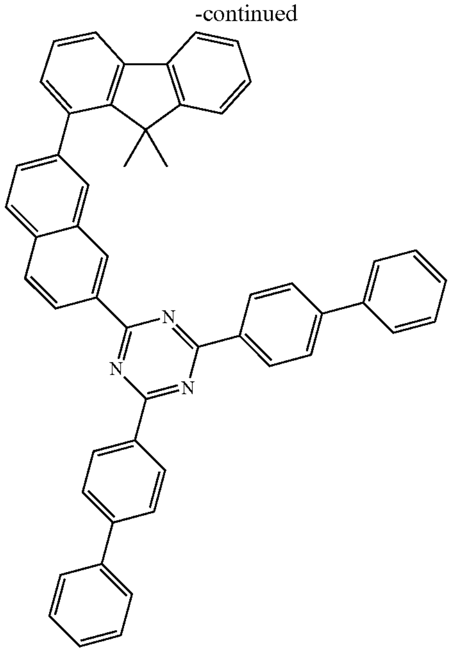
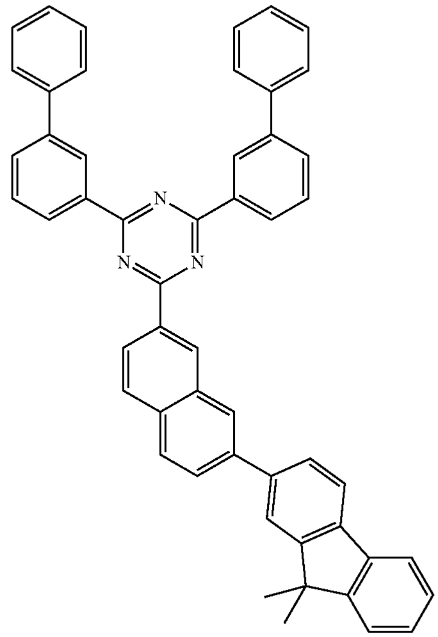
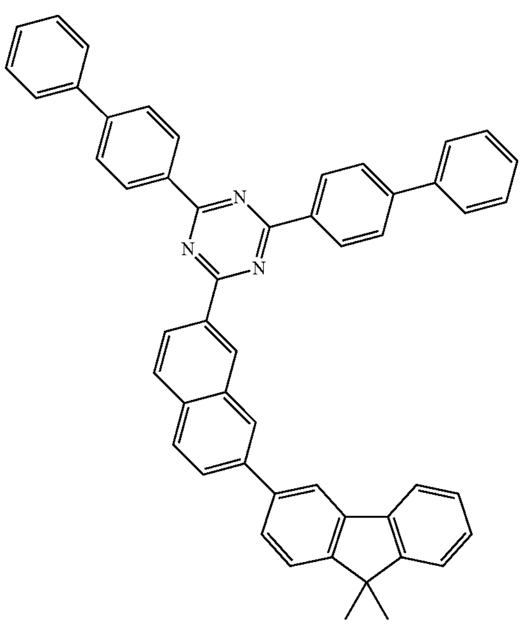
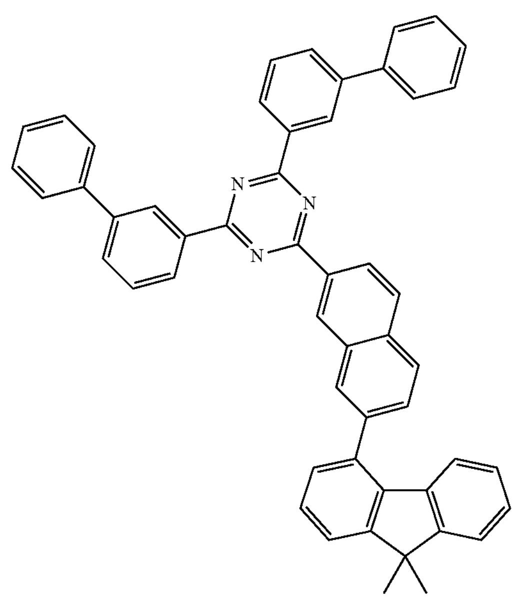

-continued
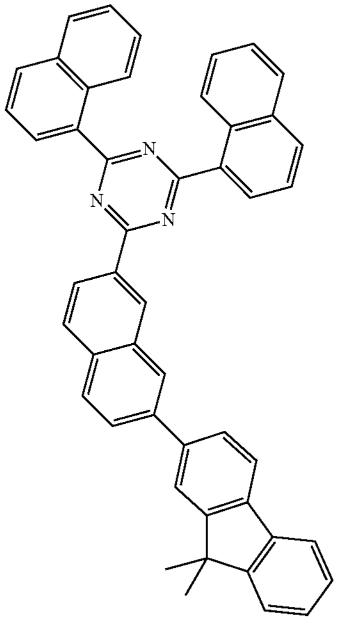
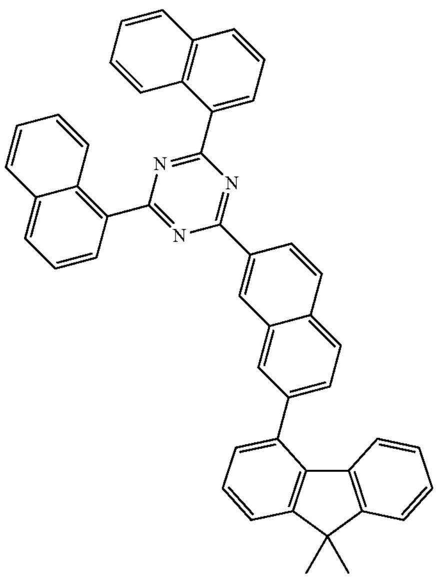
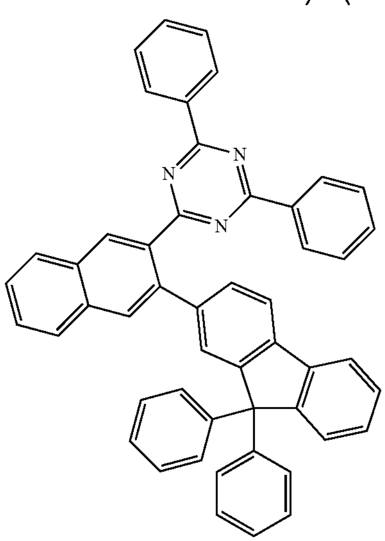
-continued
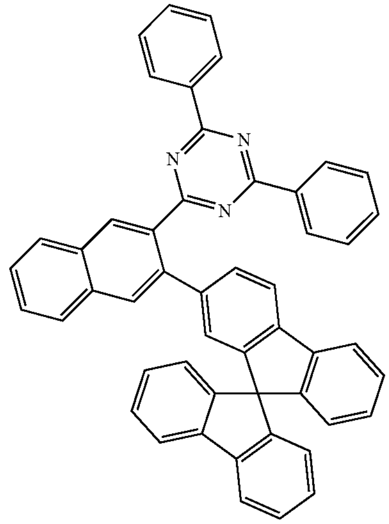
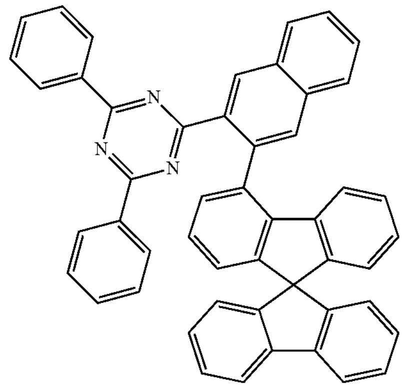
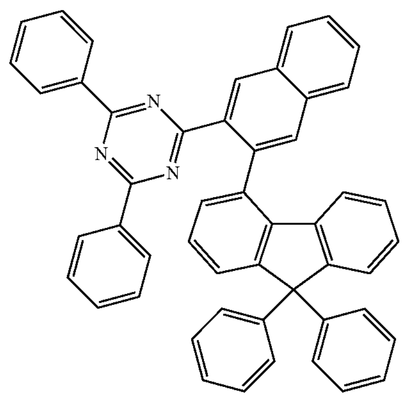

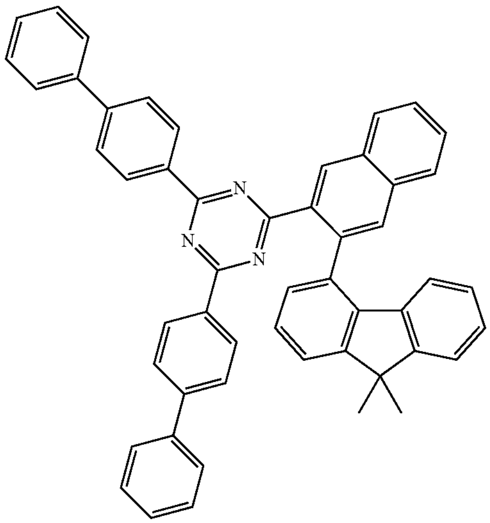
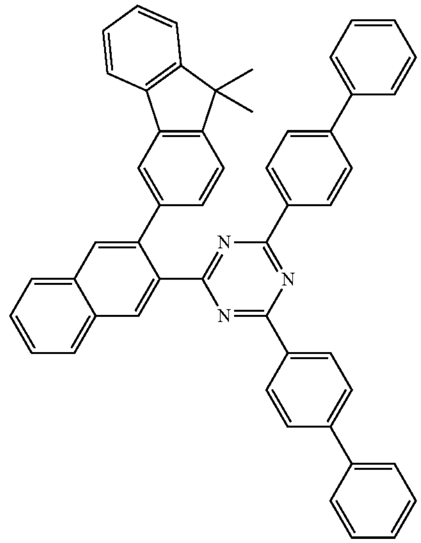
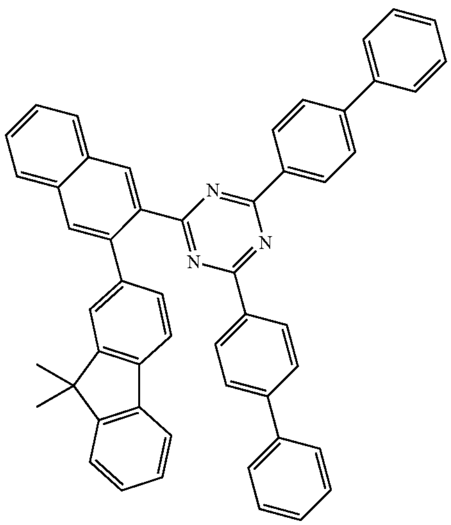
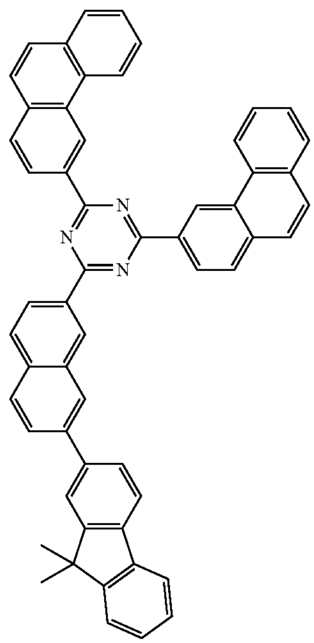
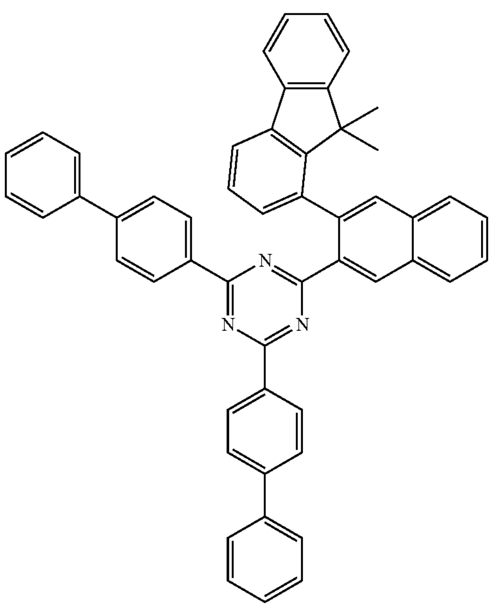
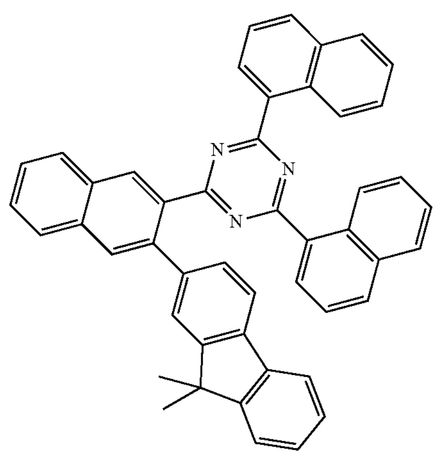
N
N
N

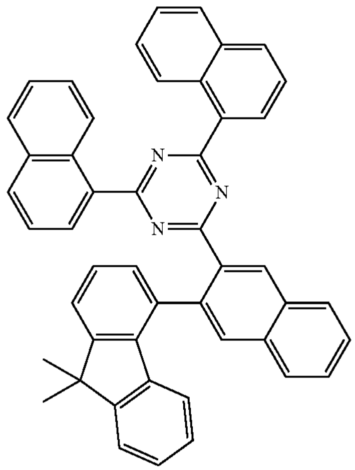
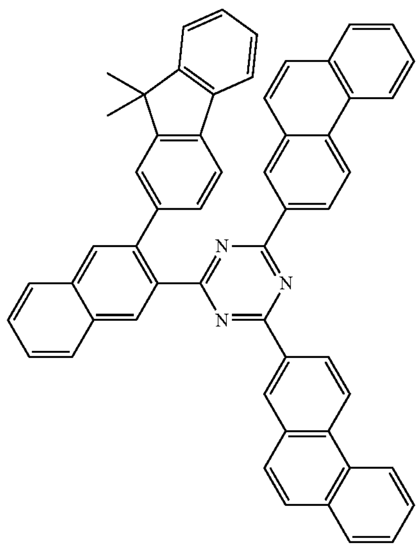
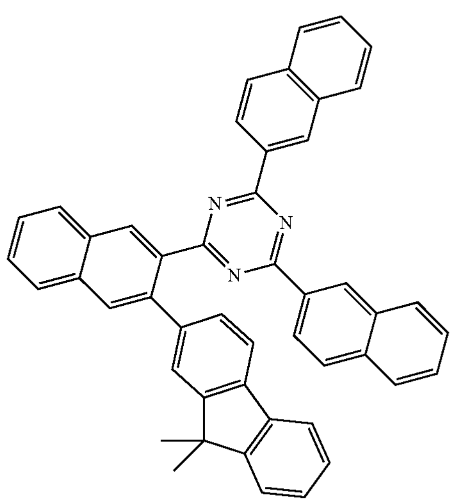
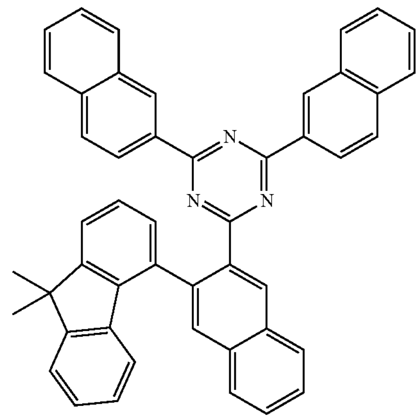
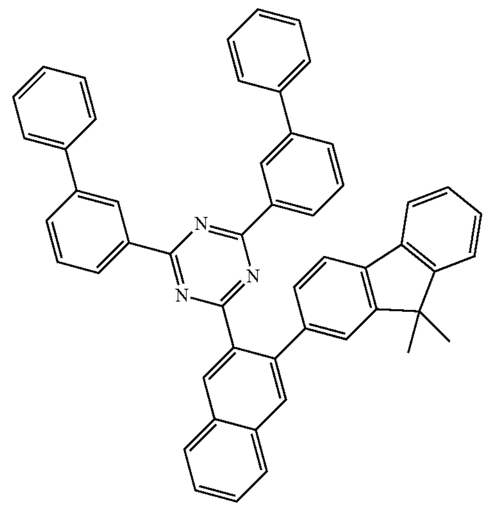
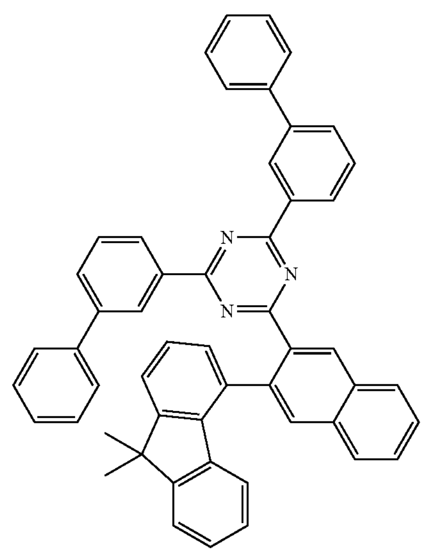
N
N
N -continued
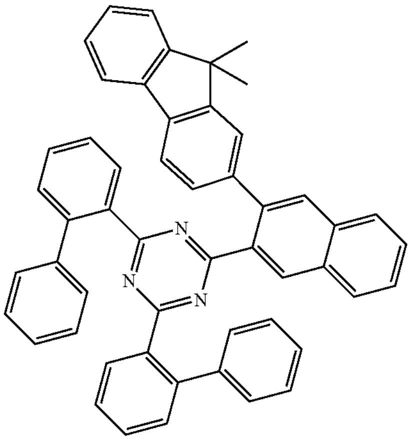
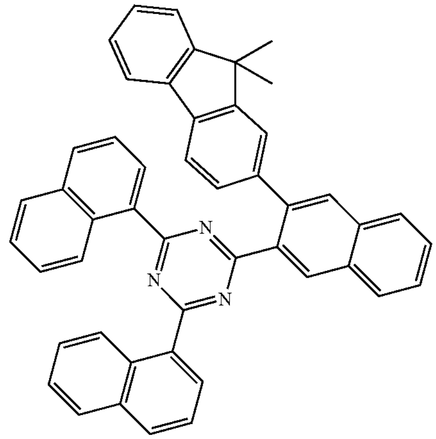
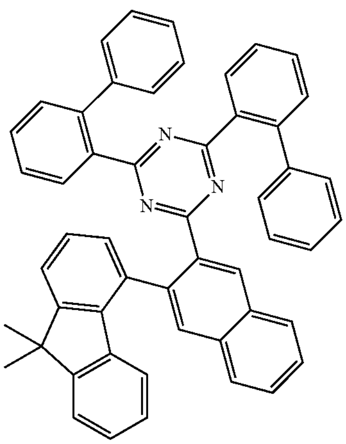
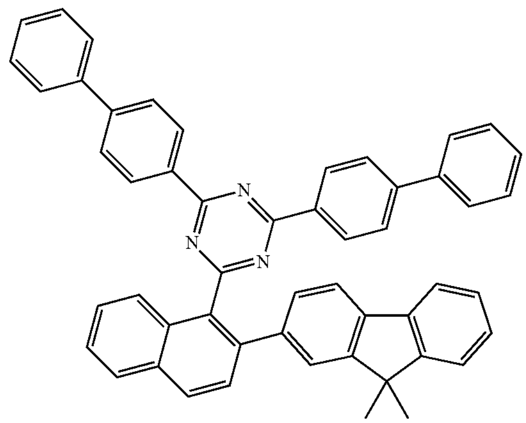
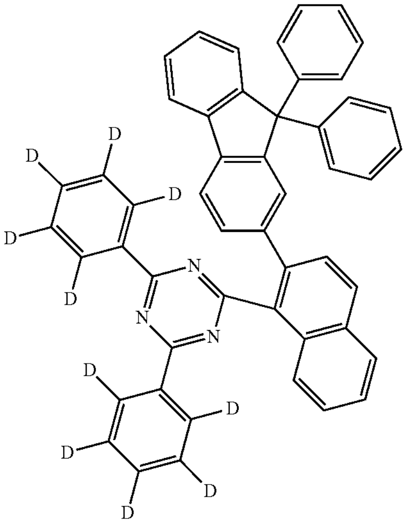
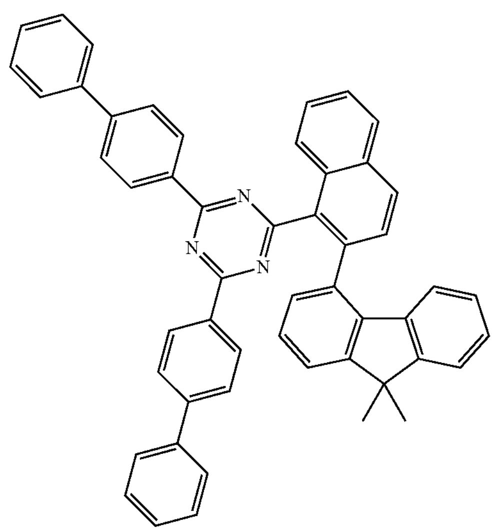

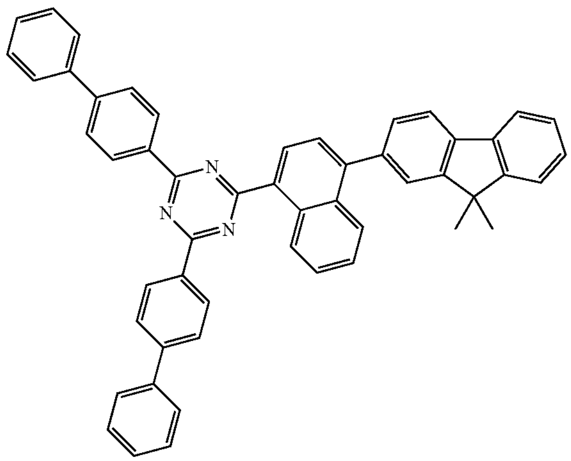
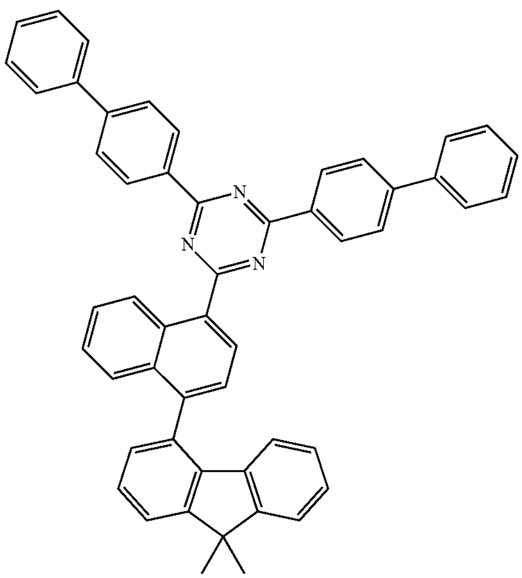
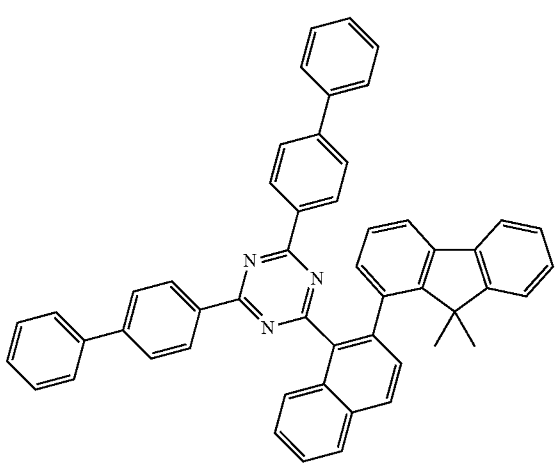
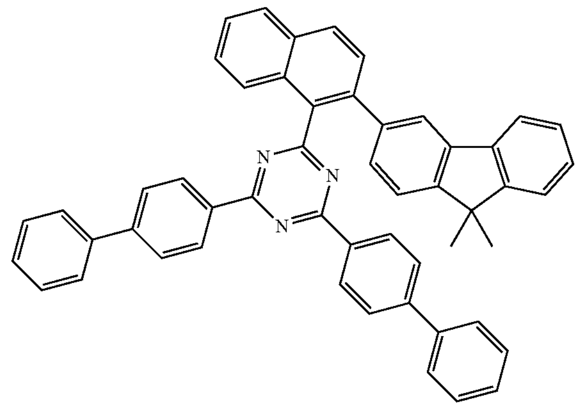
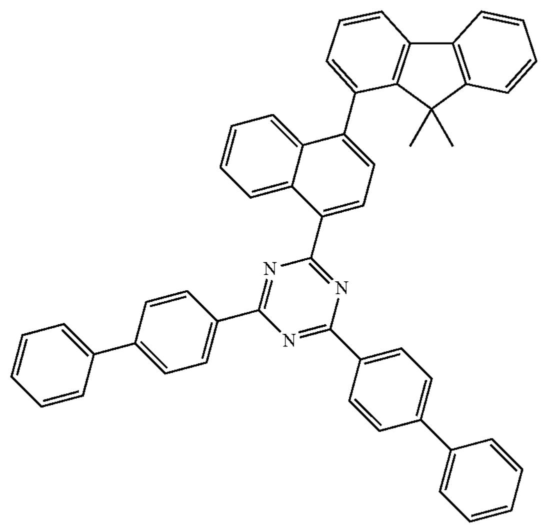
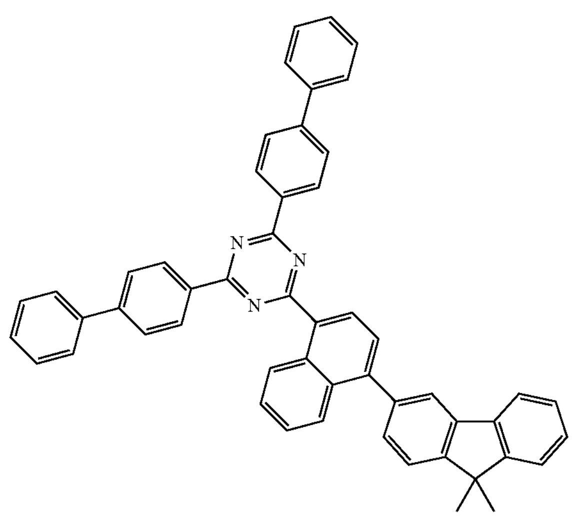

-continued
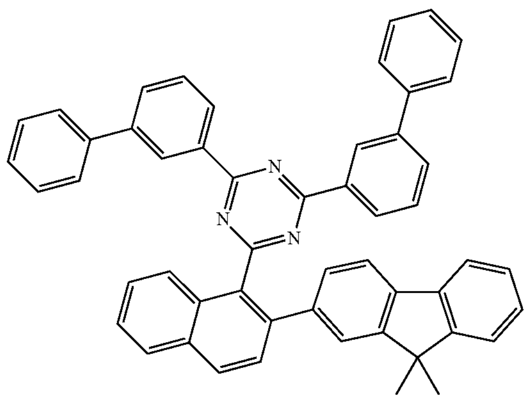
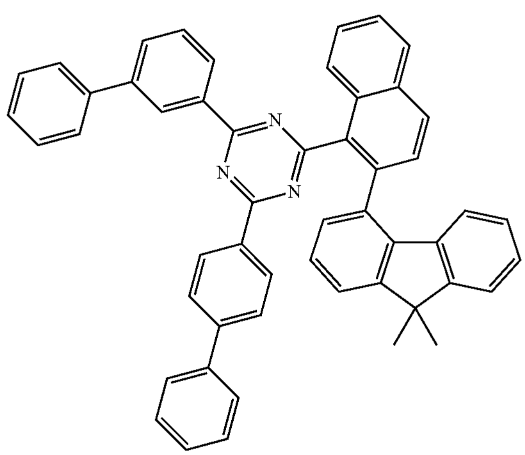
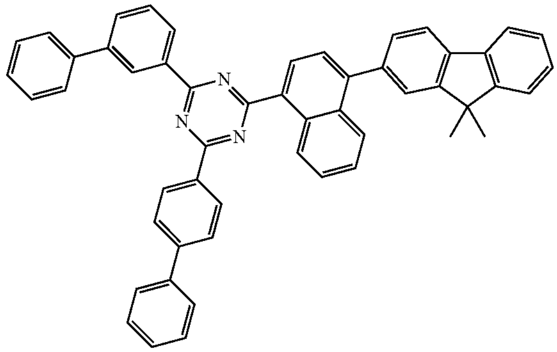
-continued
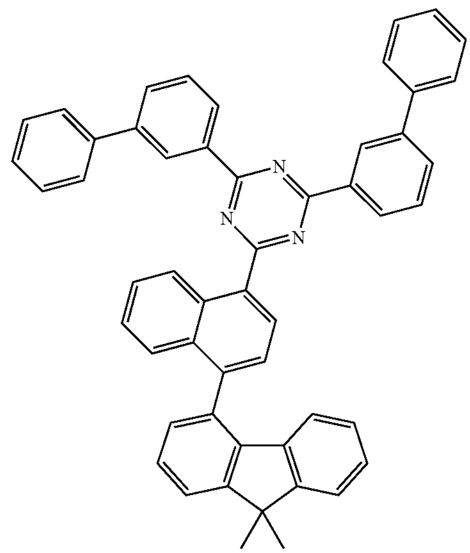
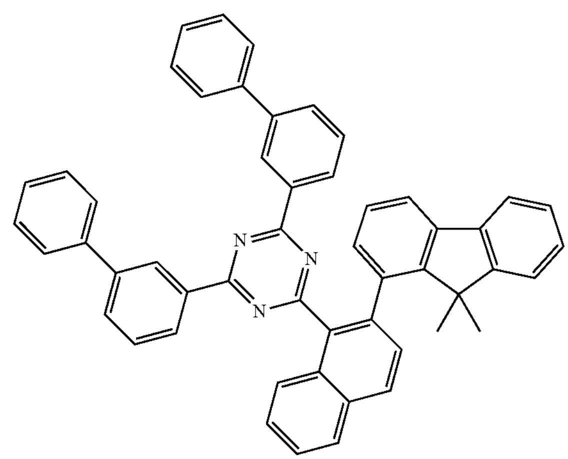
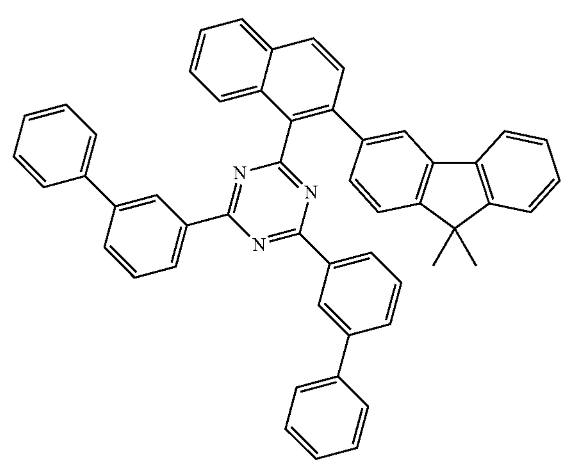

-continued
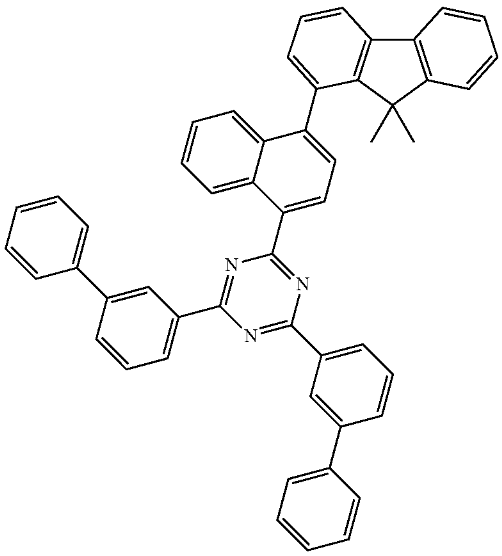
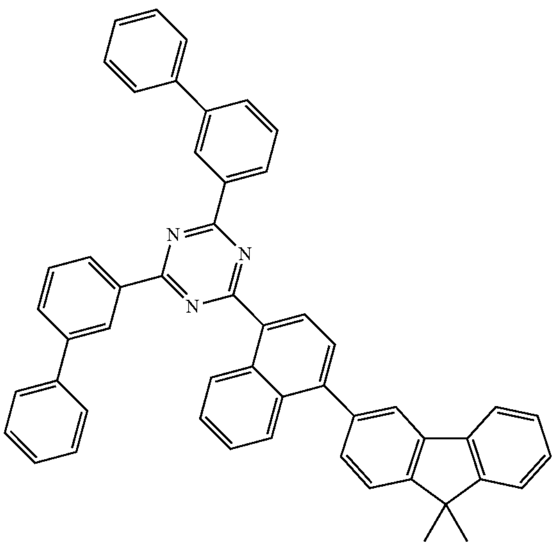
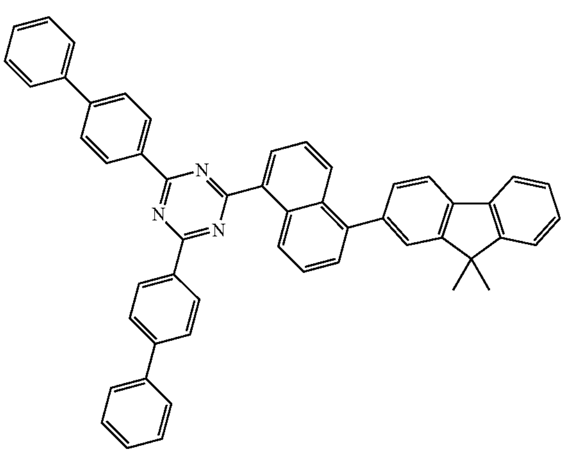
-continued
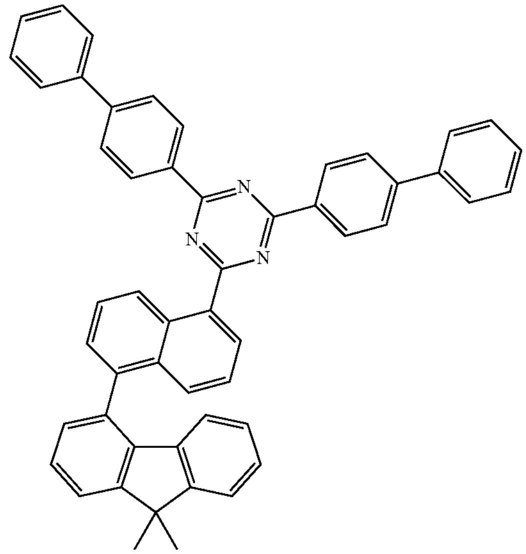
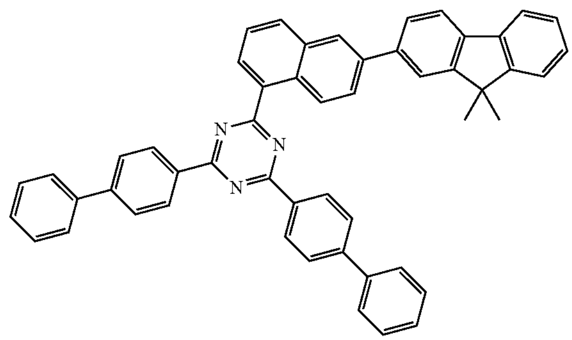
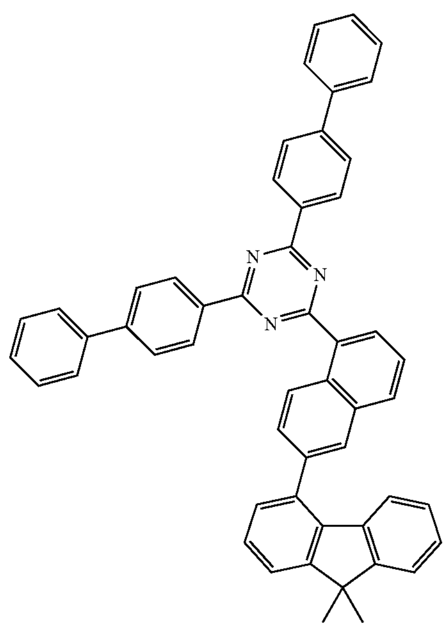

-continued
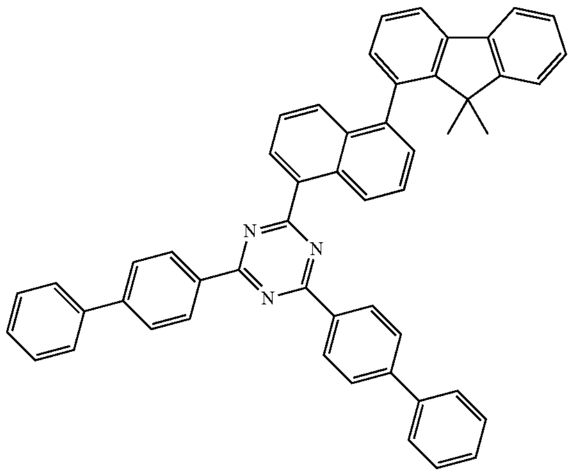
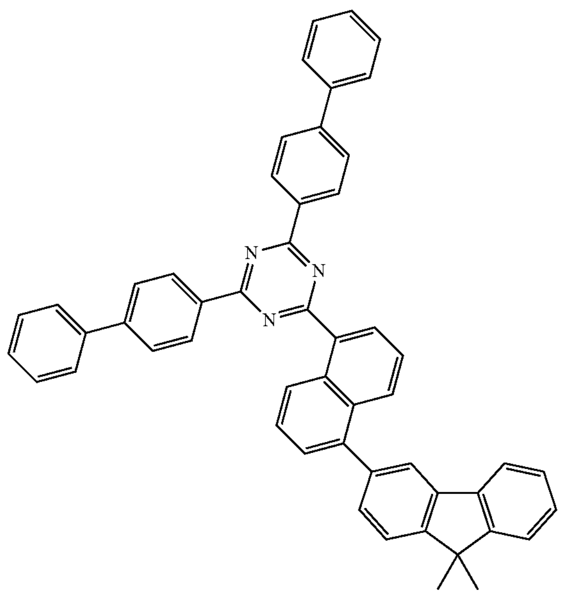
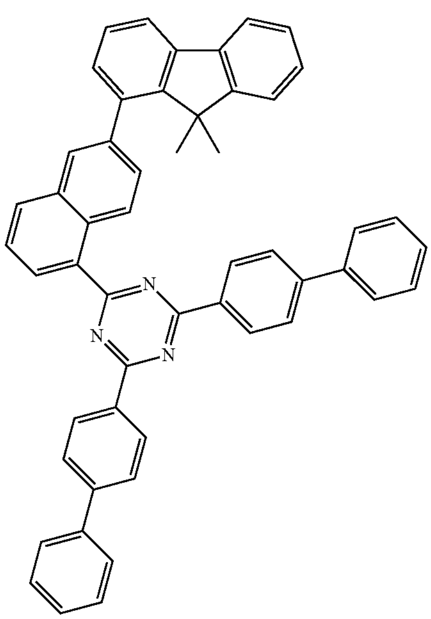
-continued
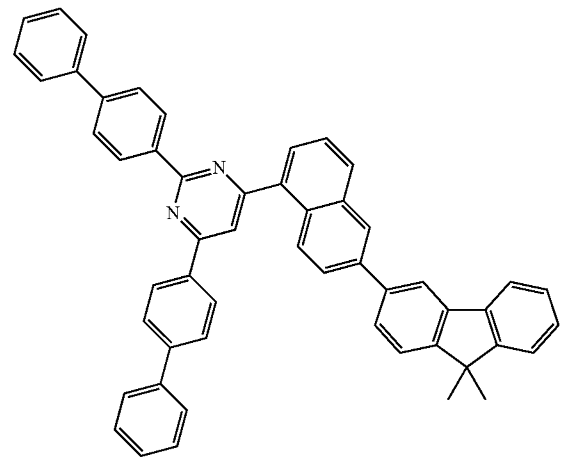
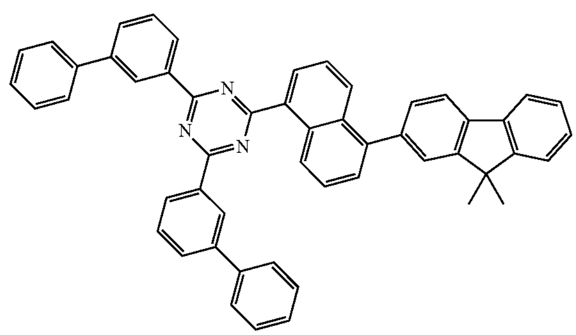
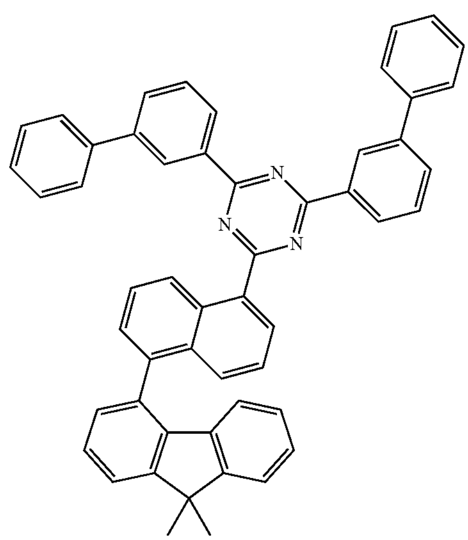
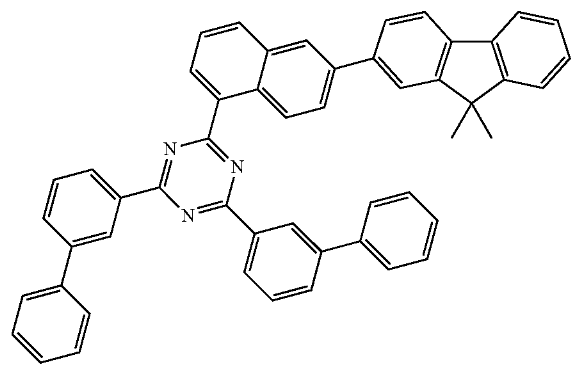

-continued
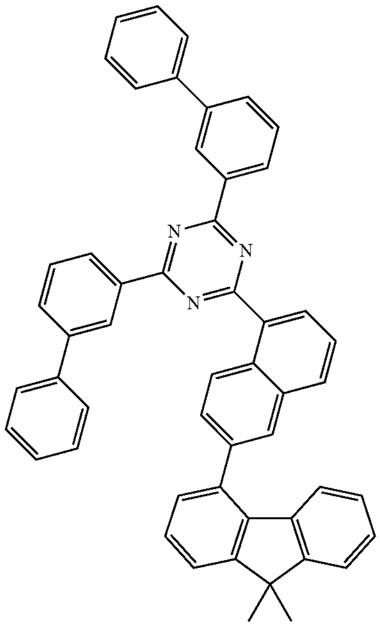
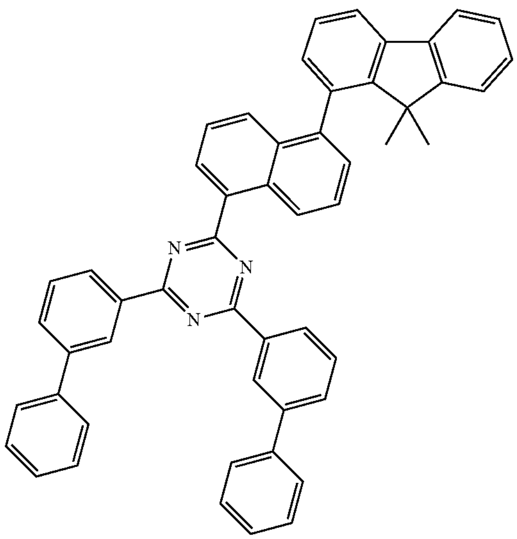
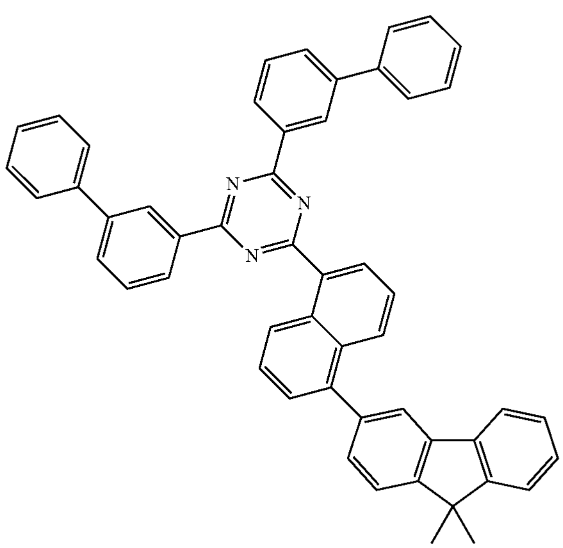
-continued
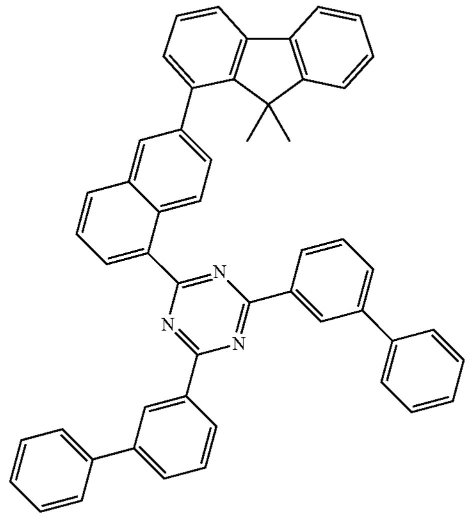
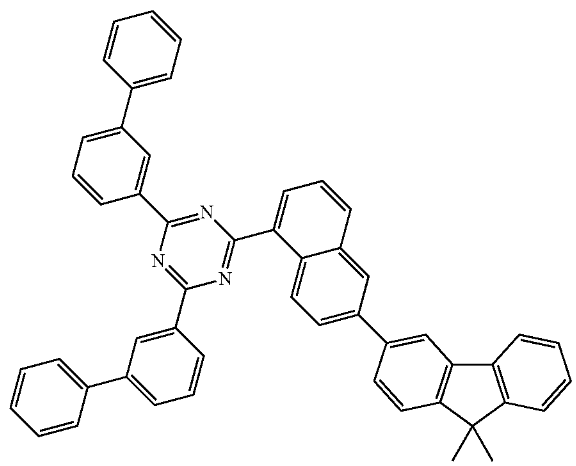 [SMILES: CC1(C)c2ccccc2-c2cc(-c3ccc4c(-c5nc(-c6cccc(-c7ccccc7)c6)nc(-c6cccc(-c7ccccc7)c6)n5)cccc4c3)ccc21]
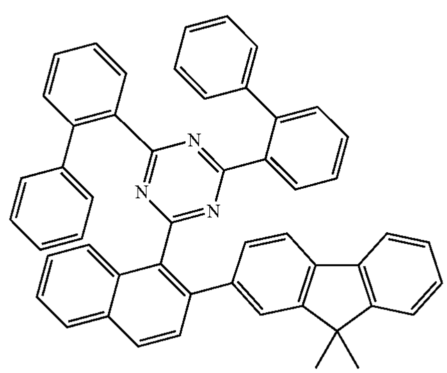

-continued
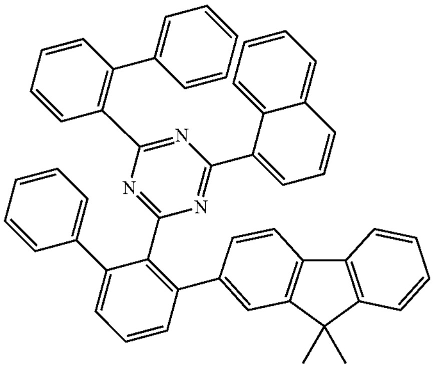
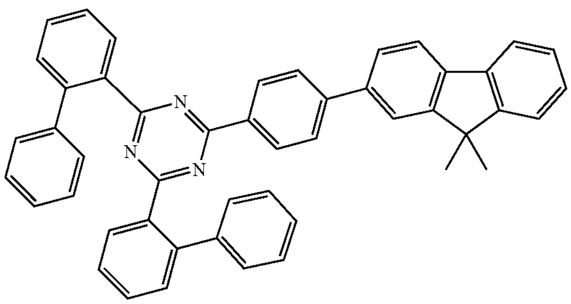
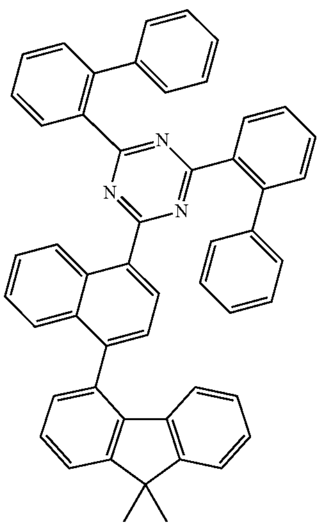
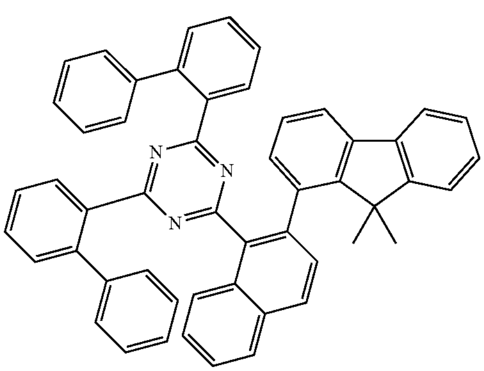
-continued
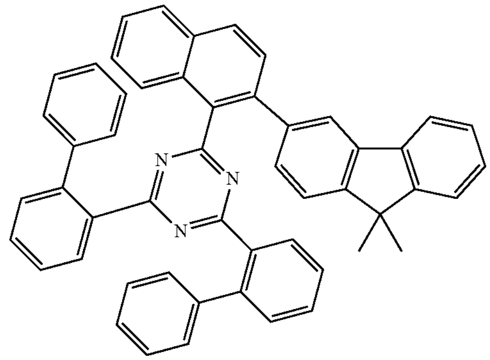
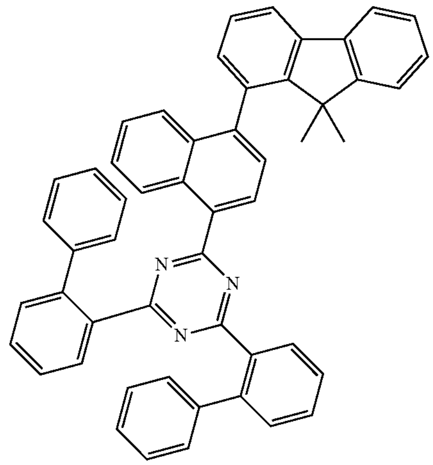
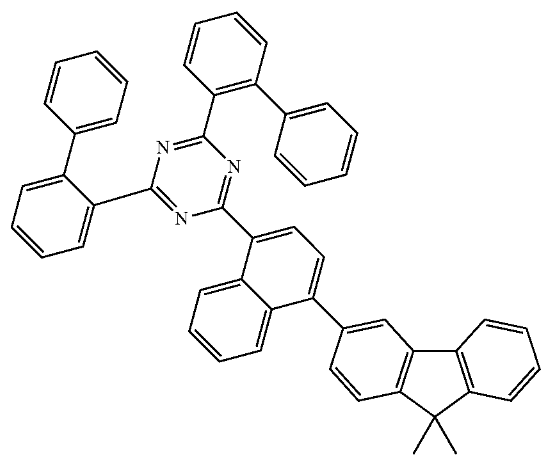
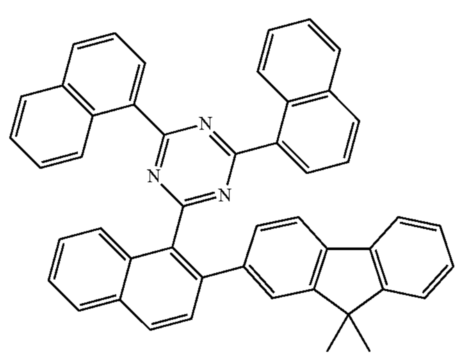

-continued
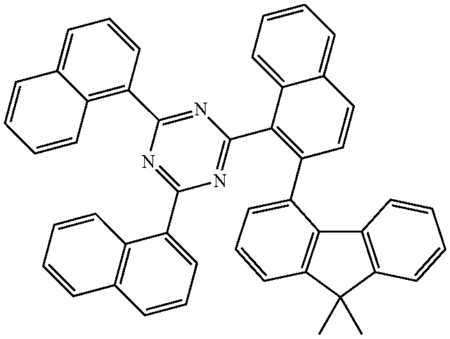
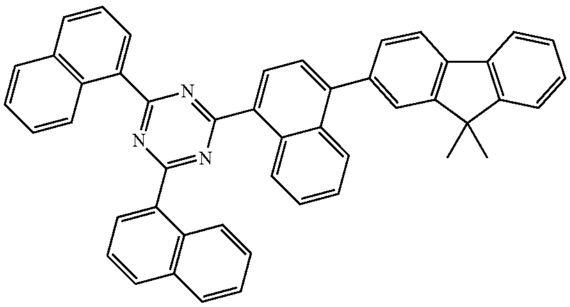
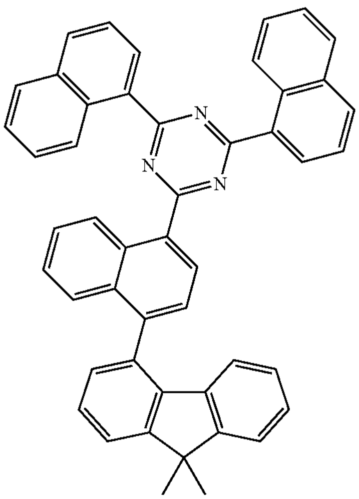
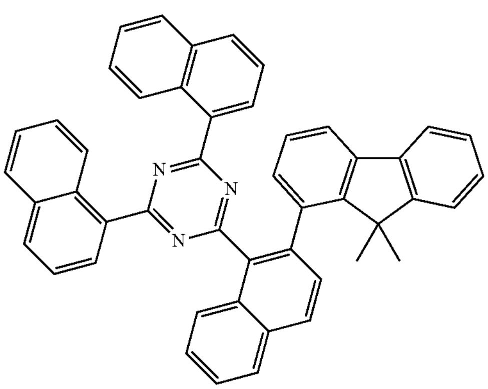
-continued
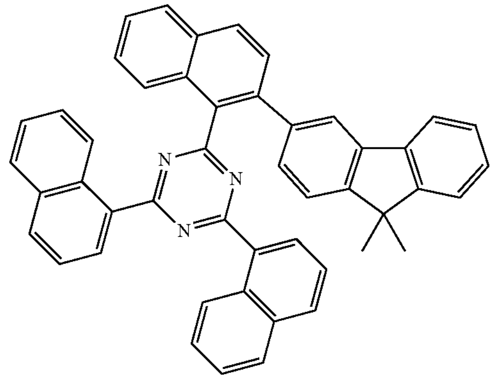
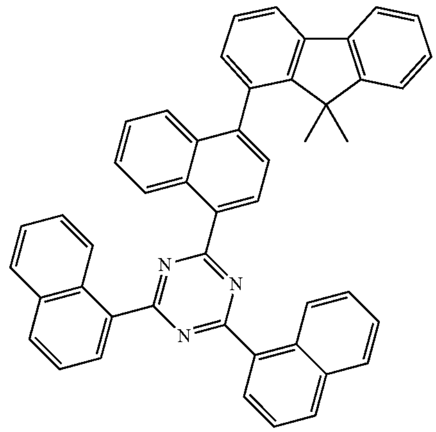
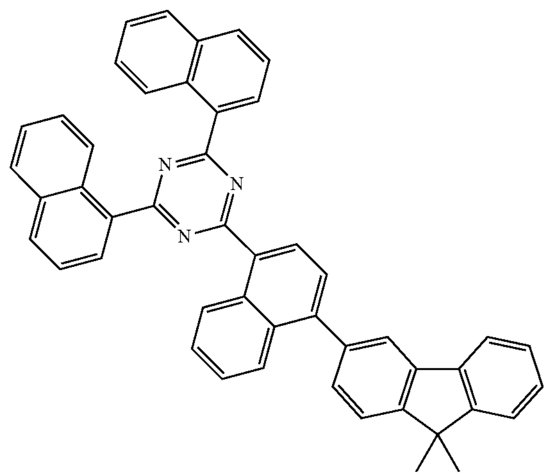
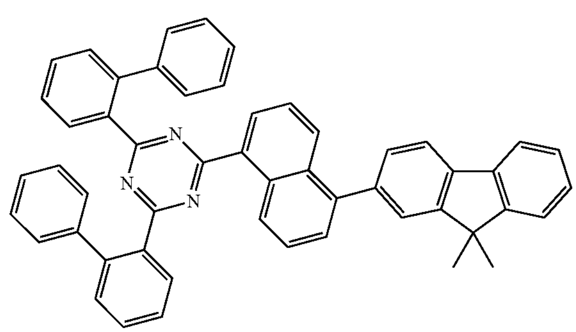

-continued
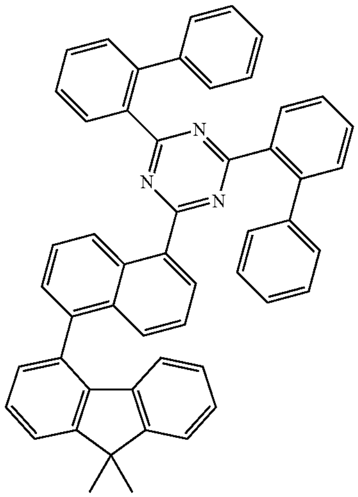
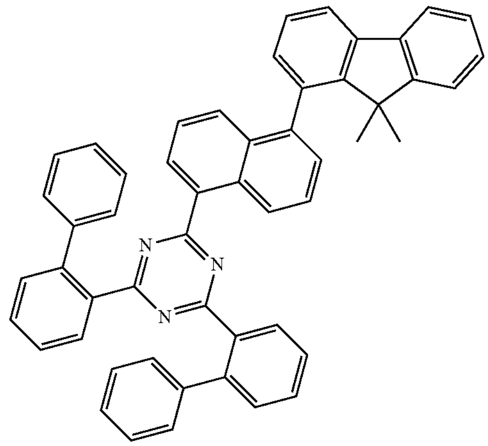
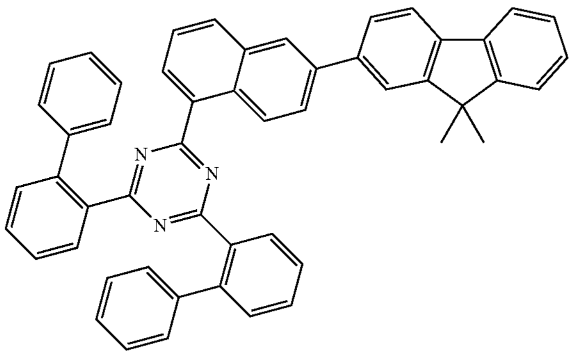
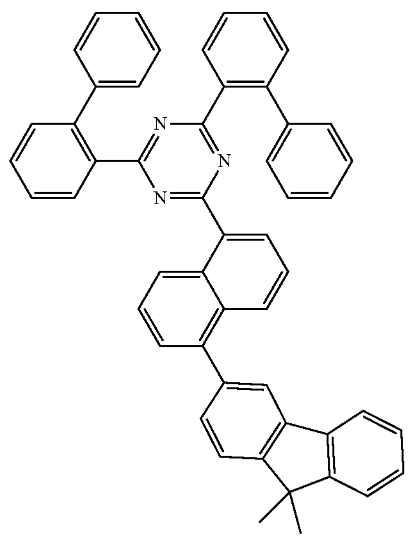
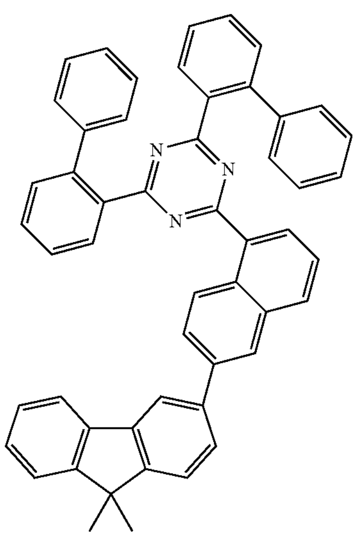
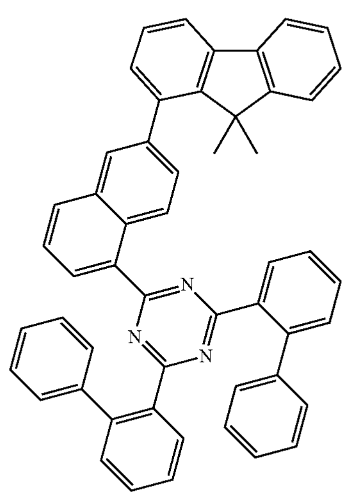

-continued
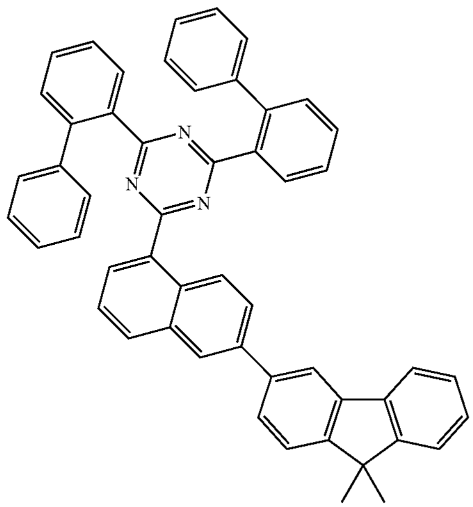 [SMILES: CC1(C)c2ccccc2-c2cc(-c3ccc4c(-c5nc(-c6ccccc6-c6ccccc6)nc(-c6ccccc6-c6ccccc6)n5)cccc4c3)ccc21]
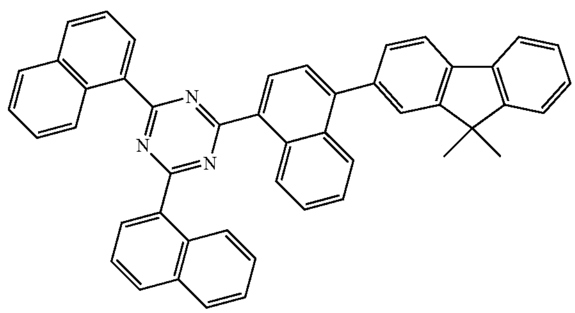
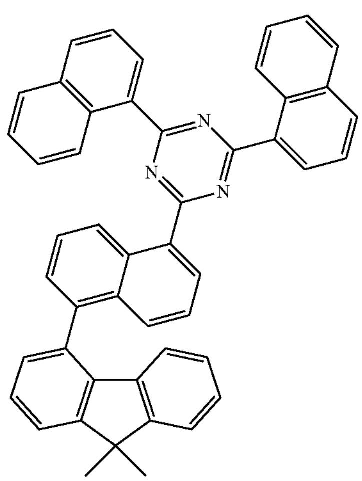
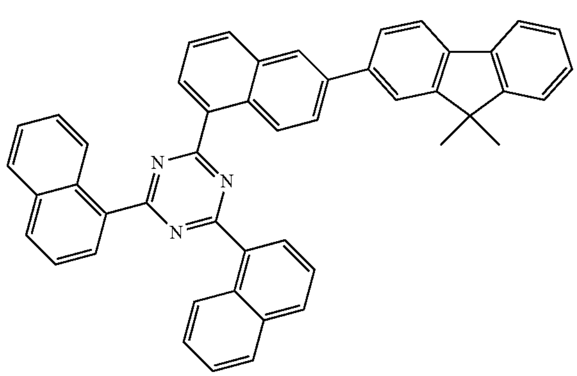
-continued
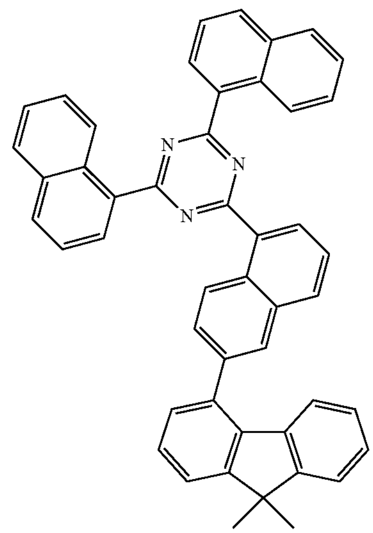
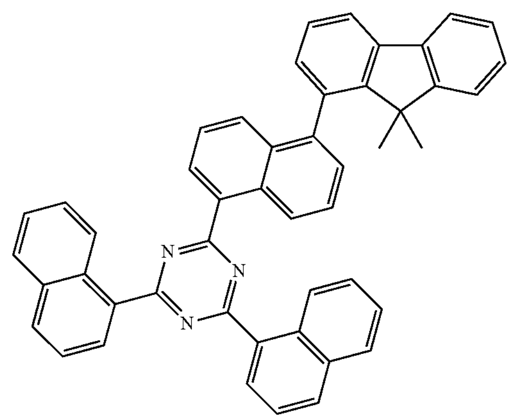
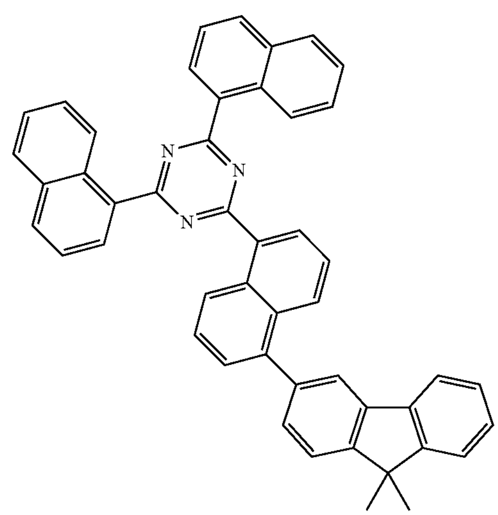

-continued
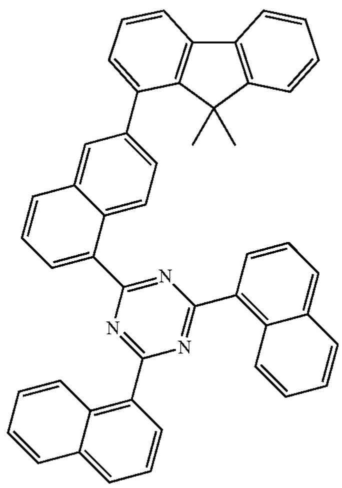
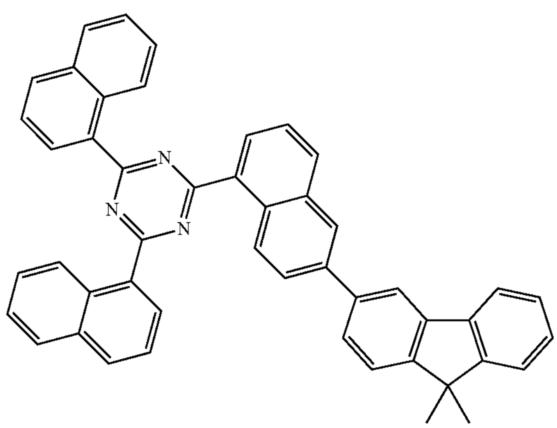
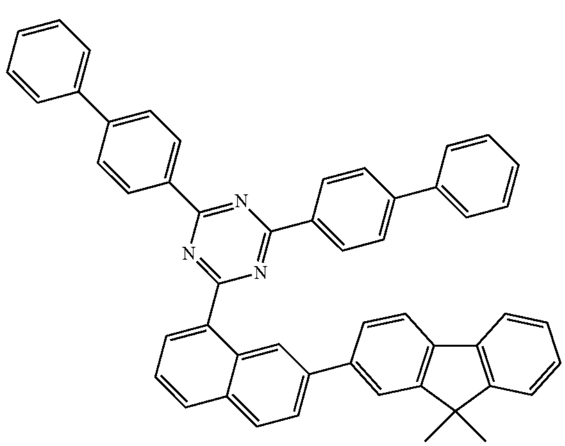
-continued
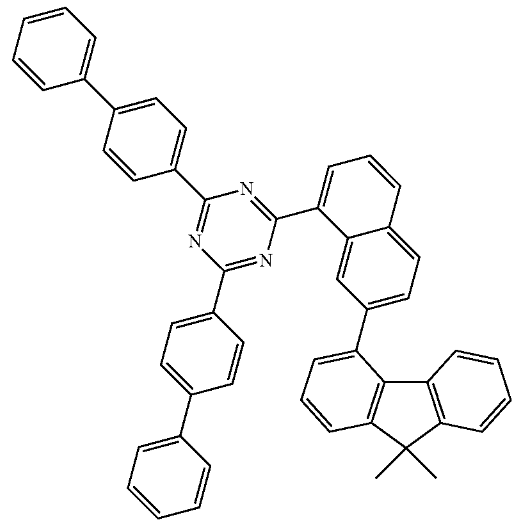
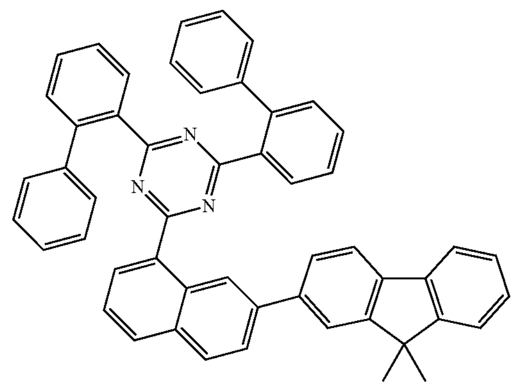
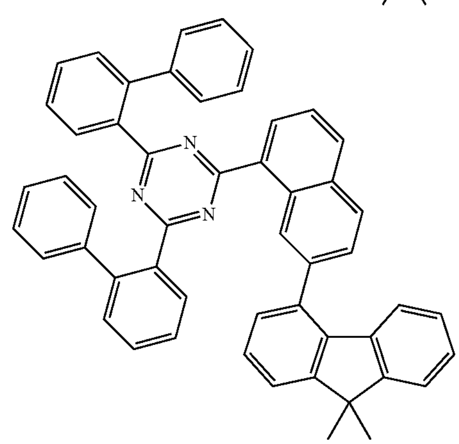
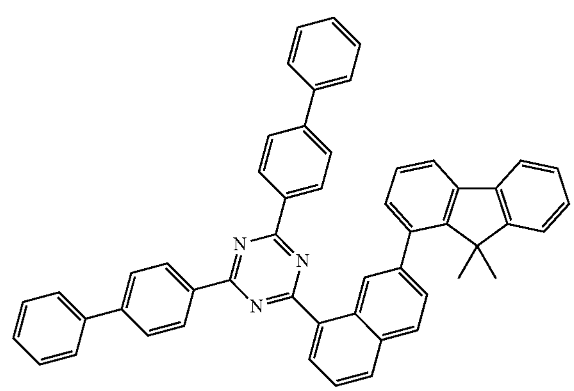

-continued
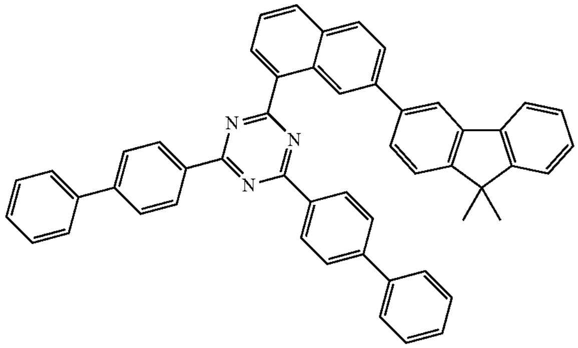
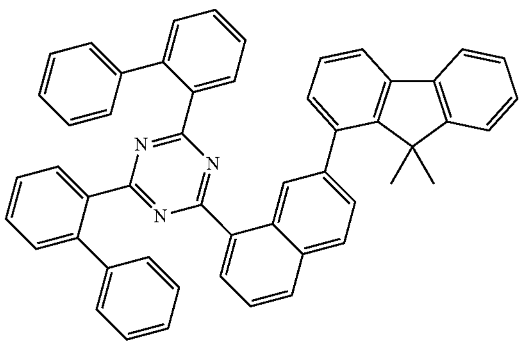
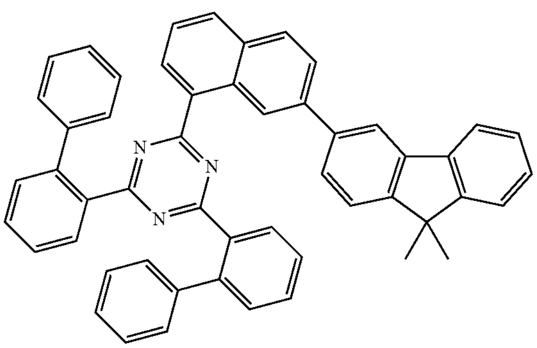
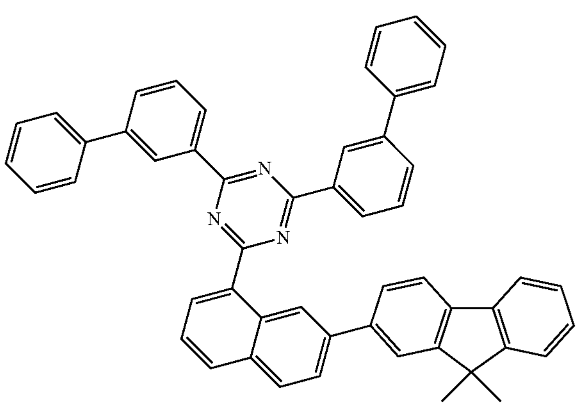
-continued
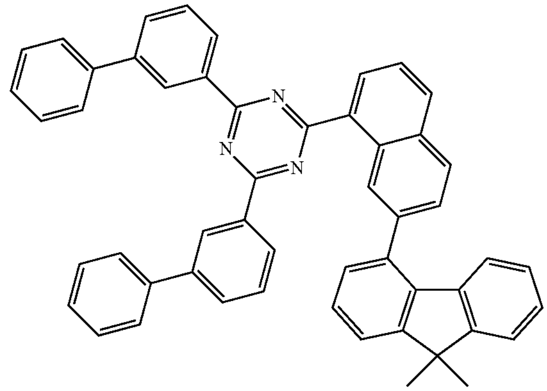
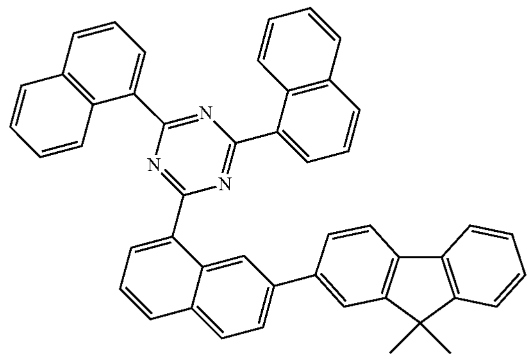
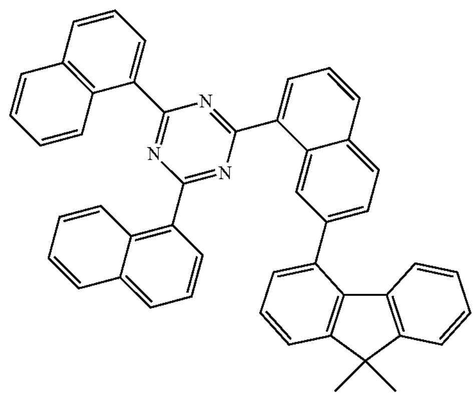
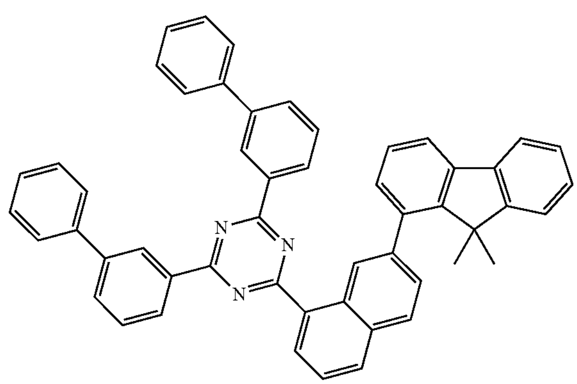

-continued
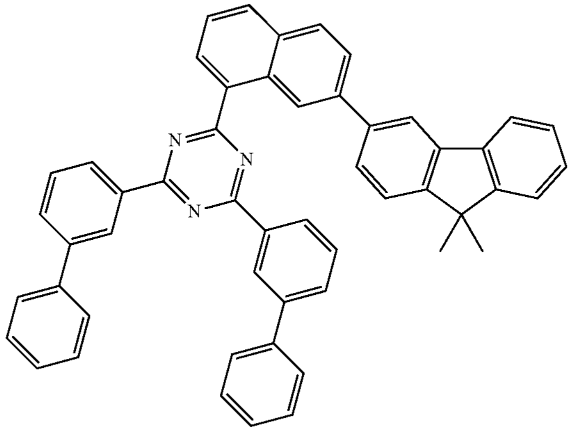
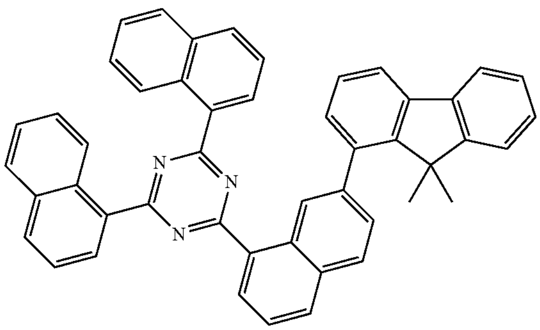
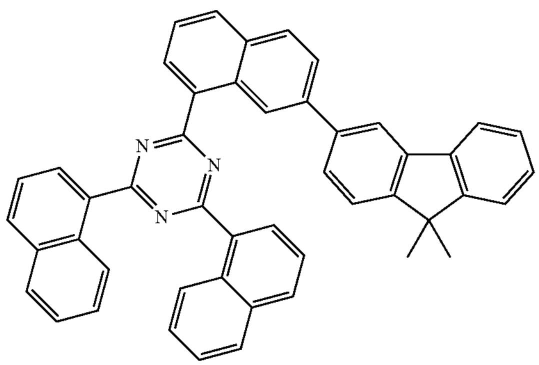
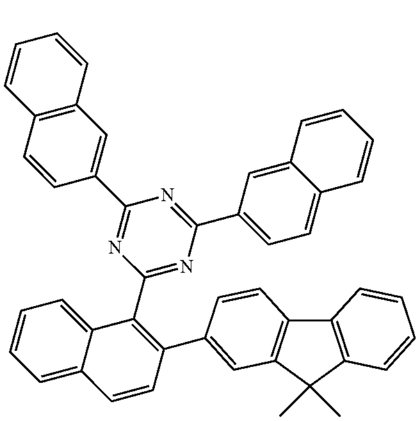
-continued
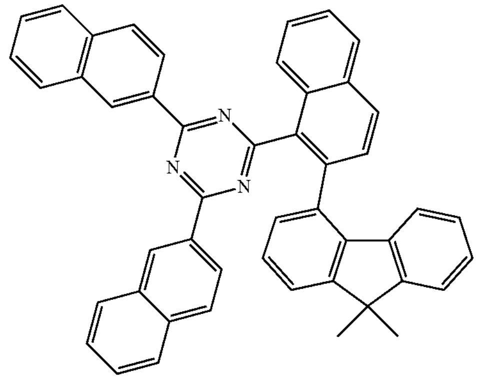
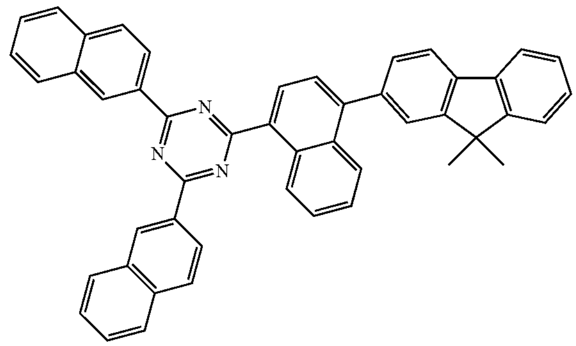
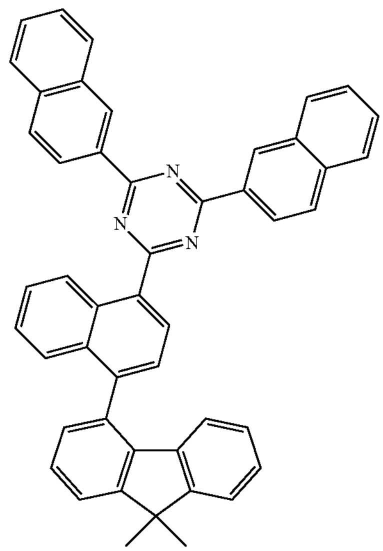
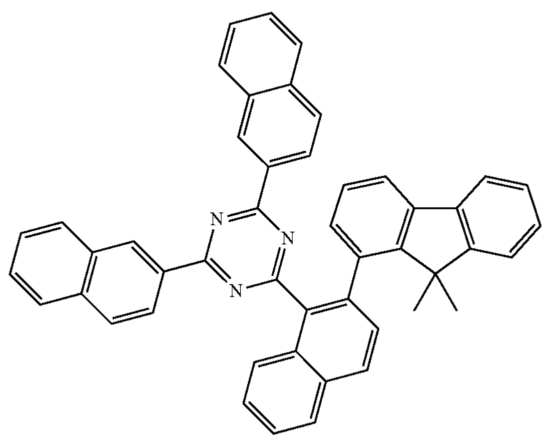

-continued
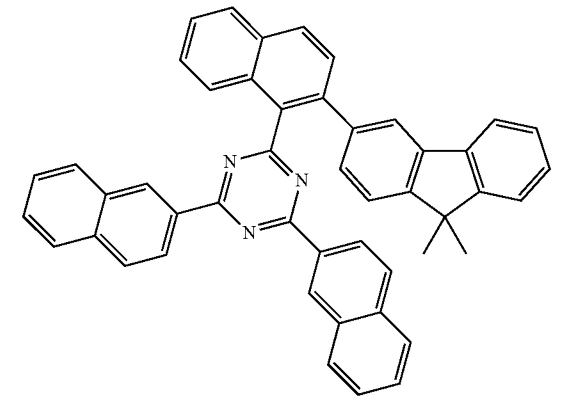
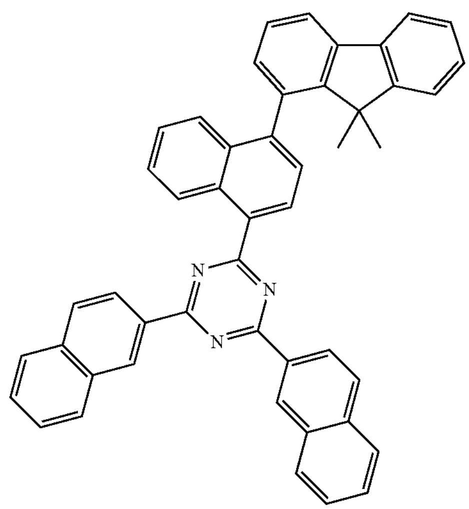
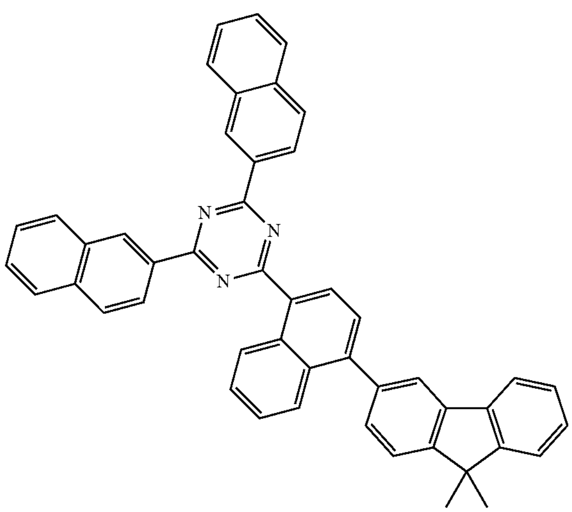
-continued
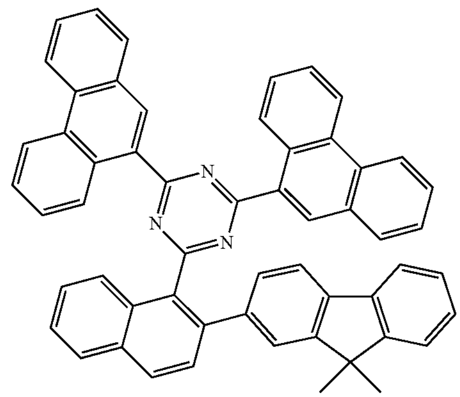
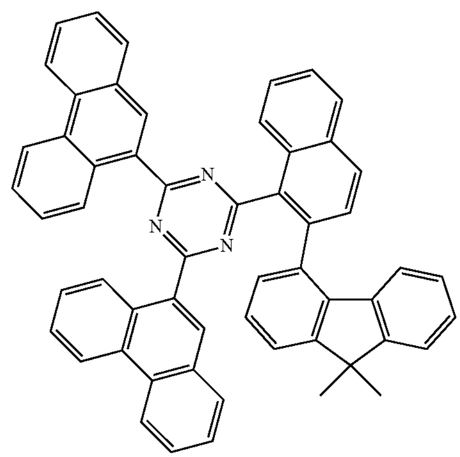
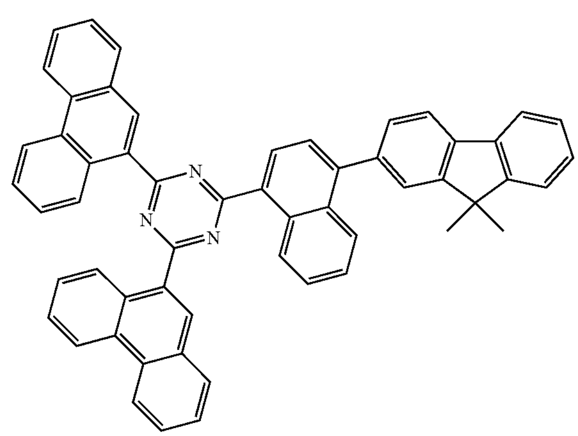

-continued
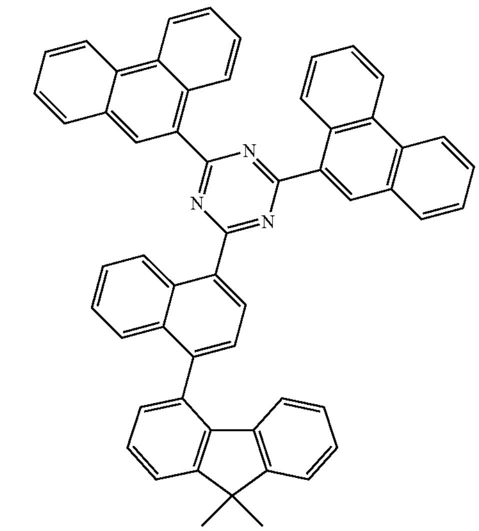
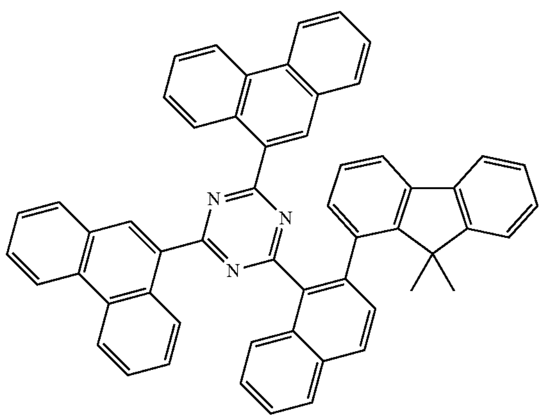
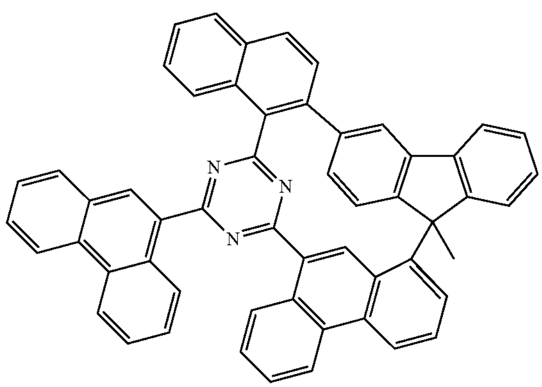
-continued
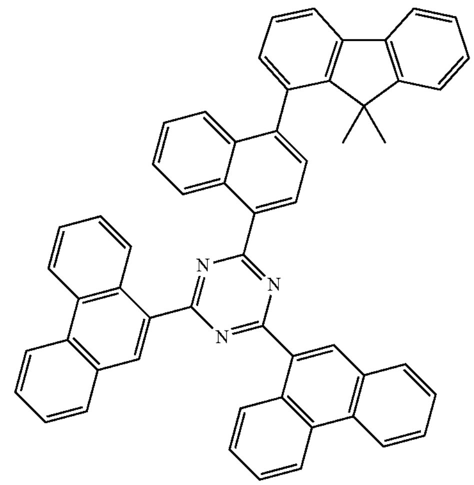
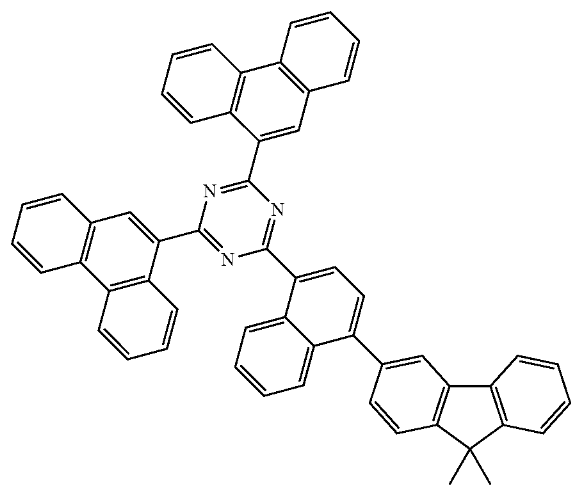
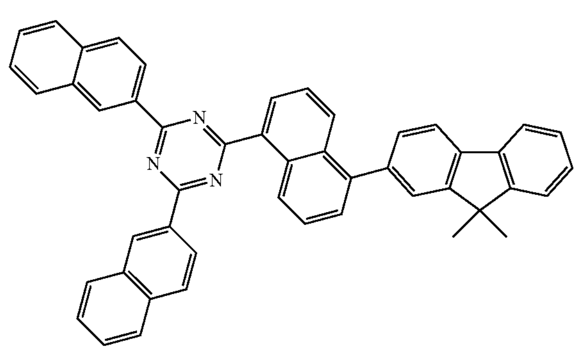

-continued
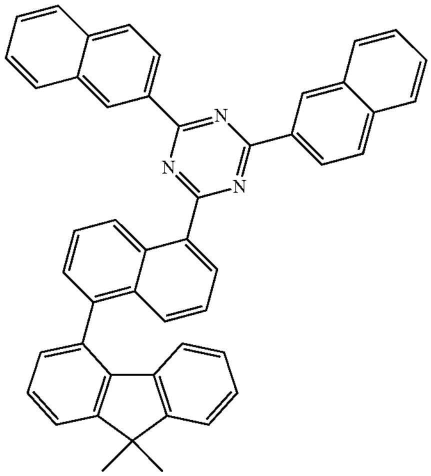
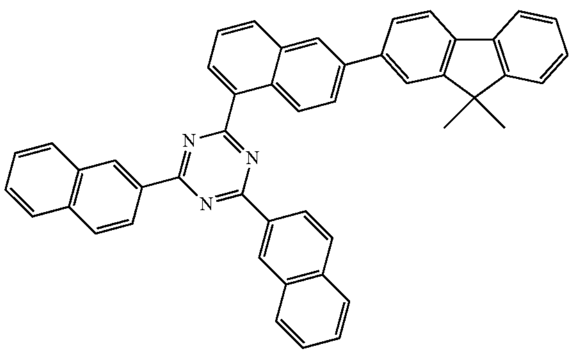
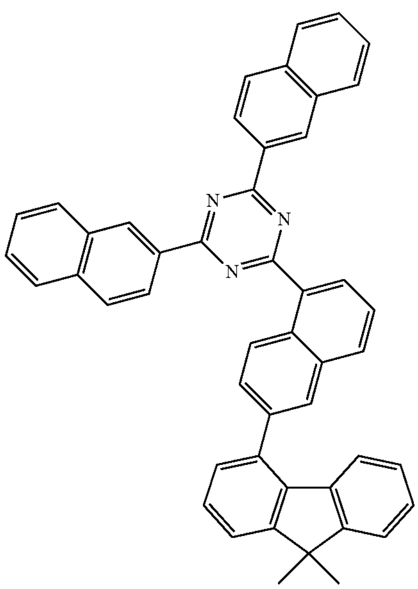
-continued
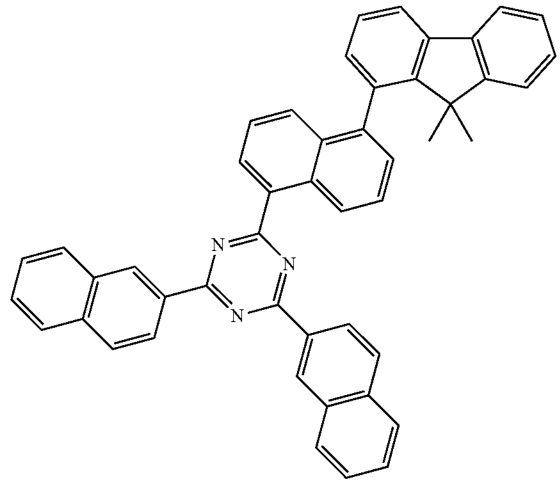
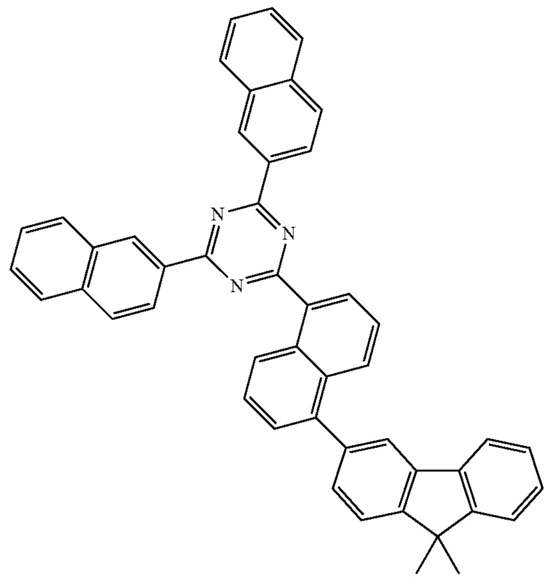
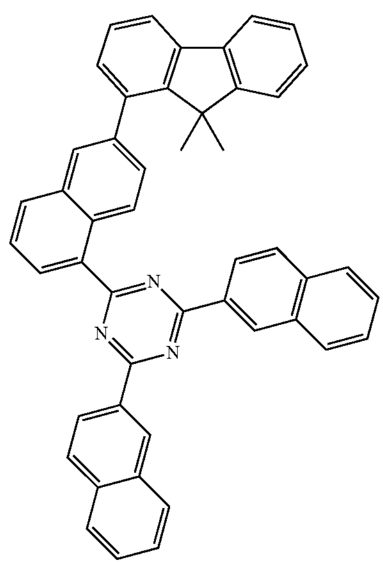

-continued
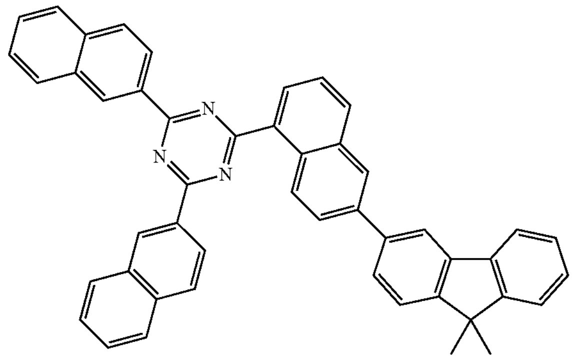
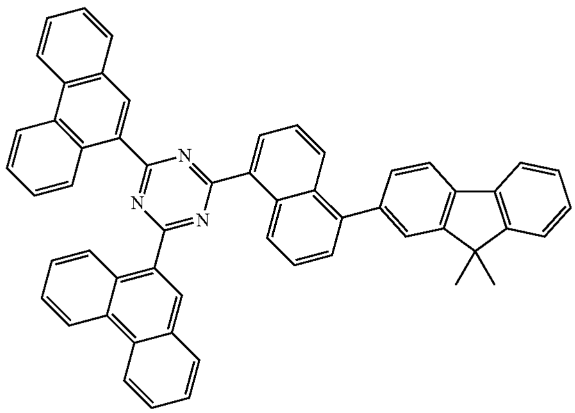
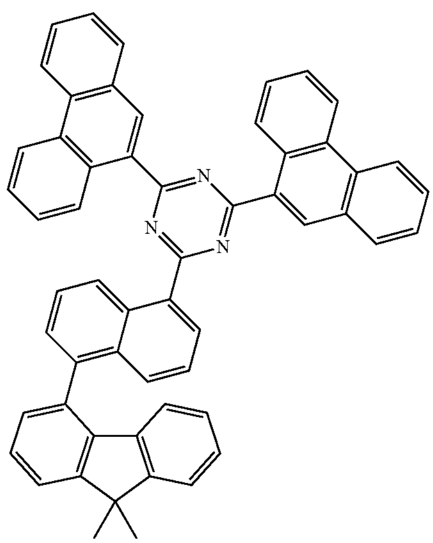
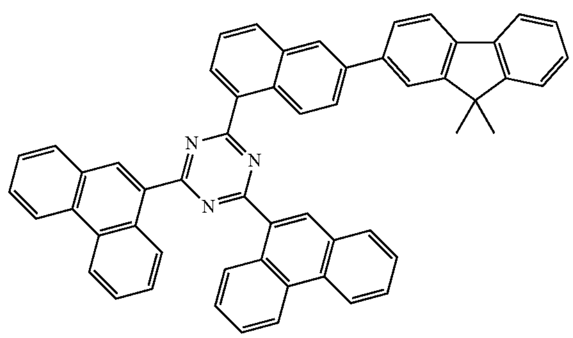
-continued
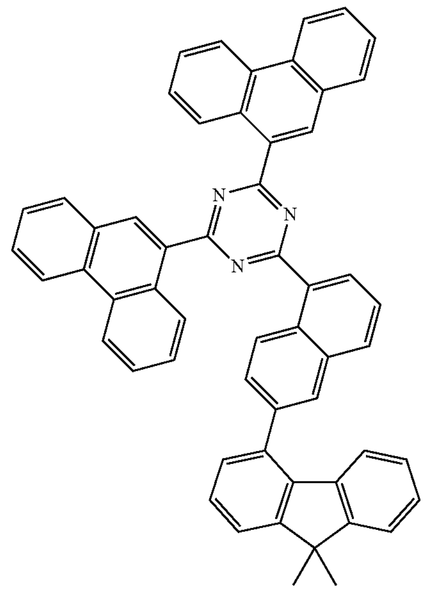
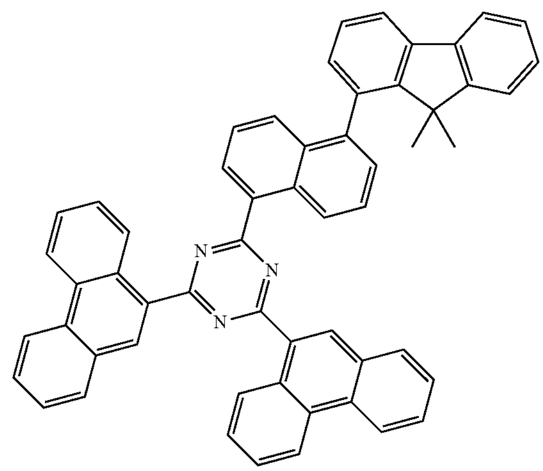
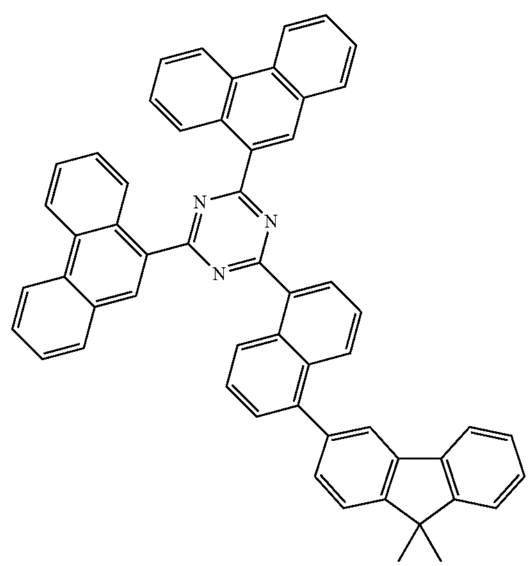

-continued
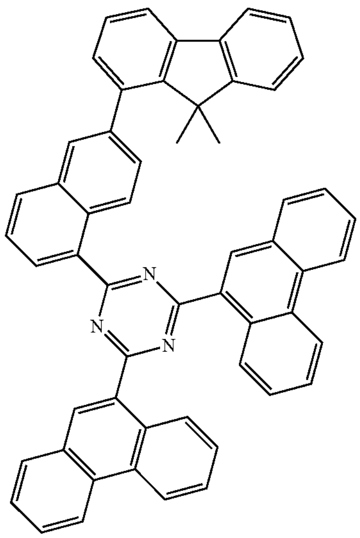
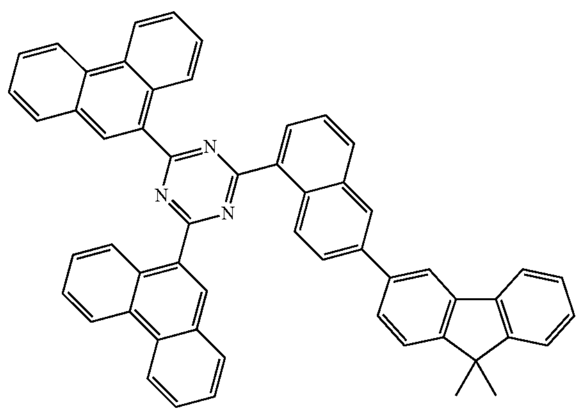
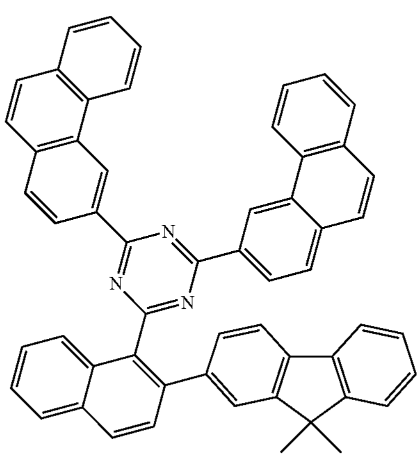
-continued
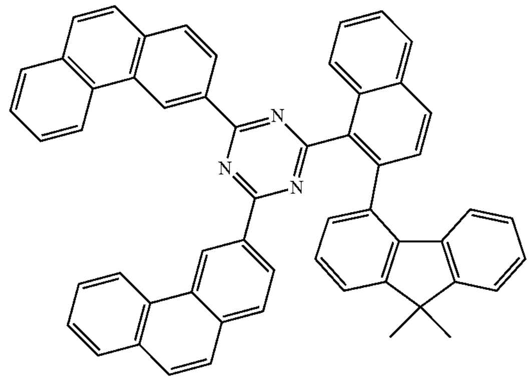
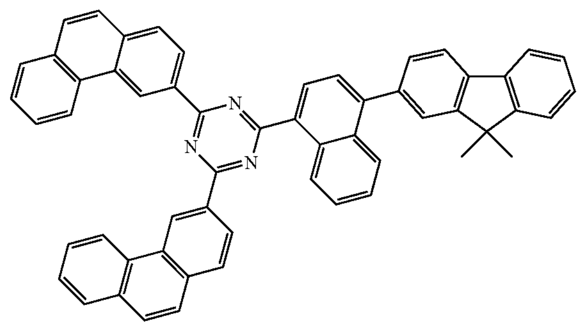
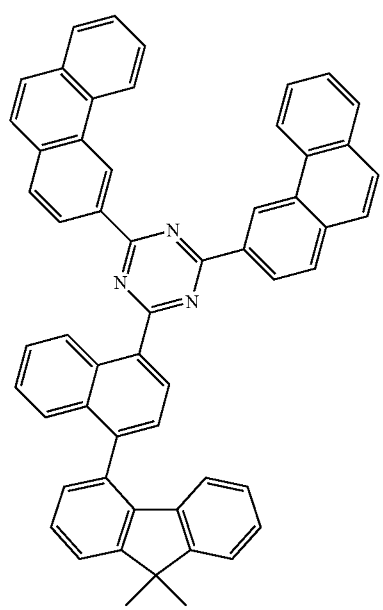

-continued
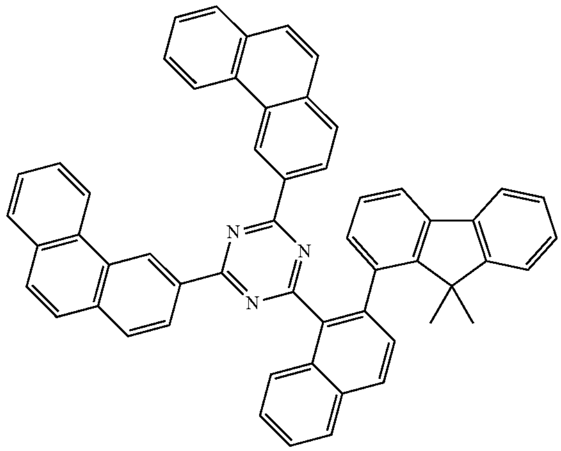
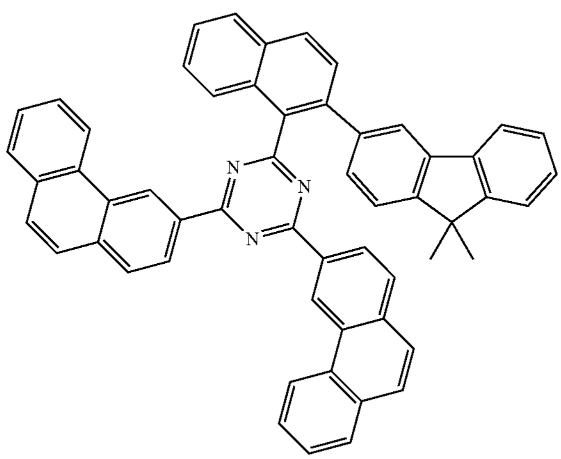
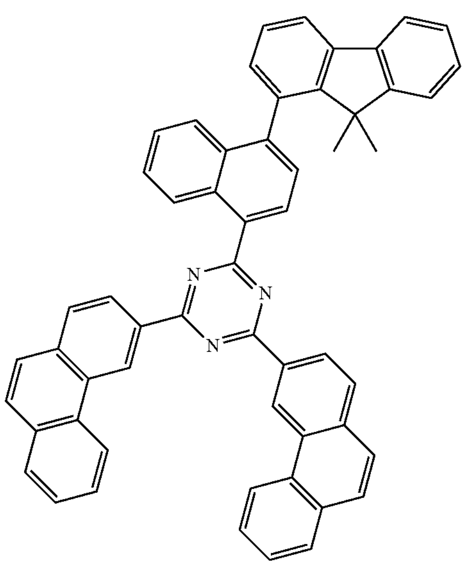
-continued
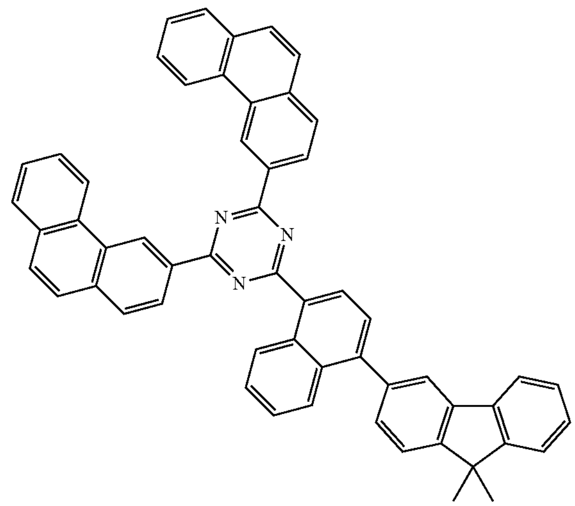
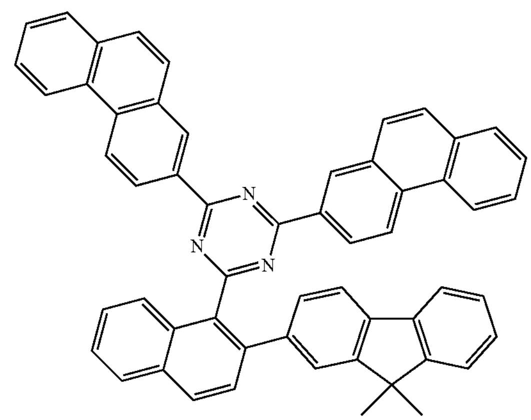
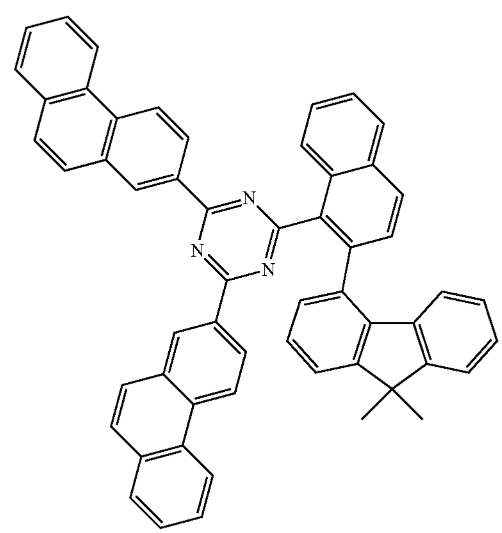

-continued
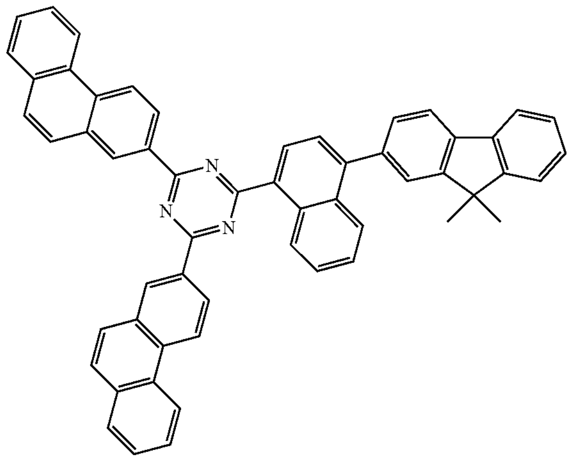
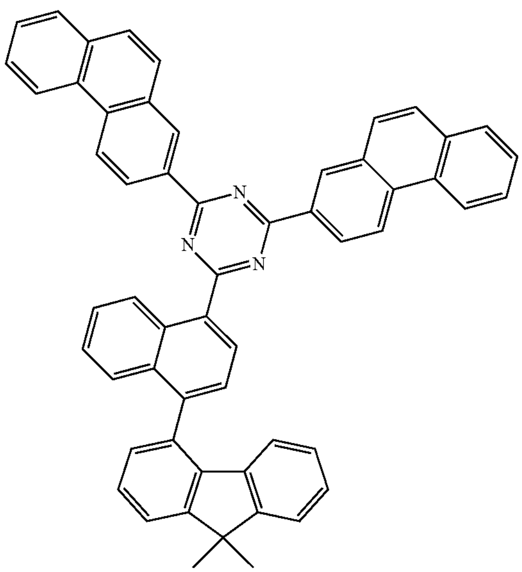
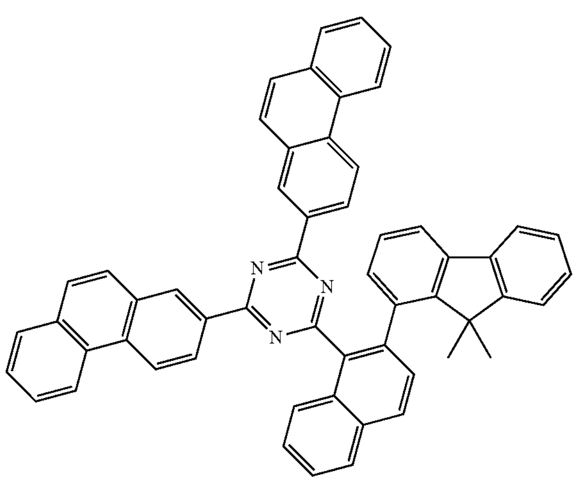
-continued
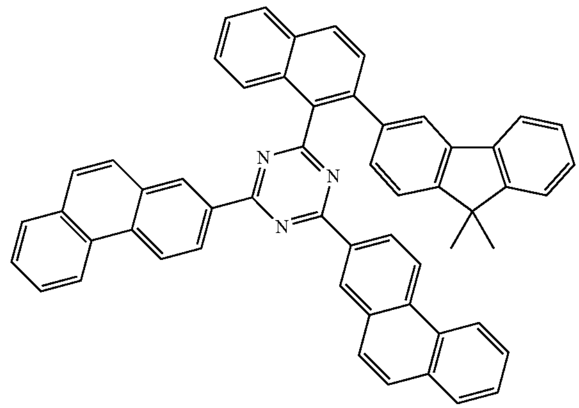
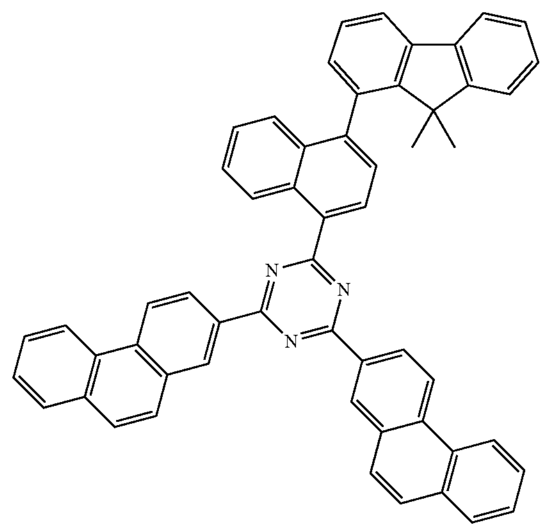
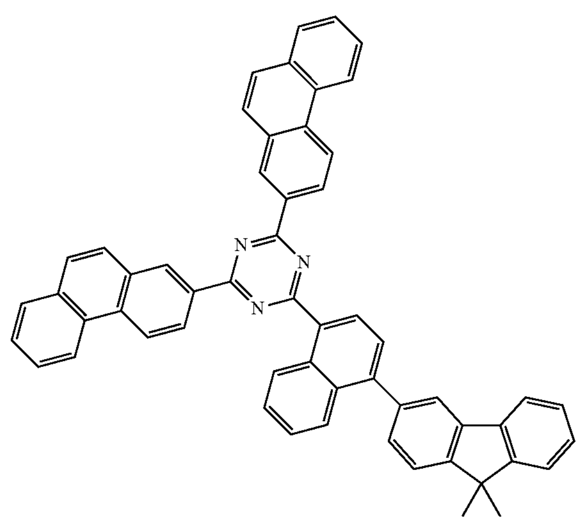

-continued
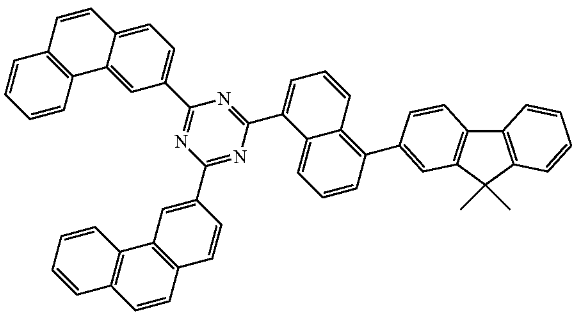
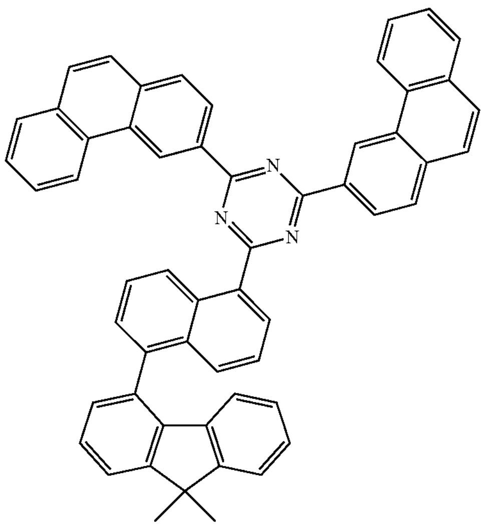
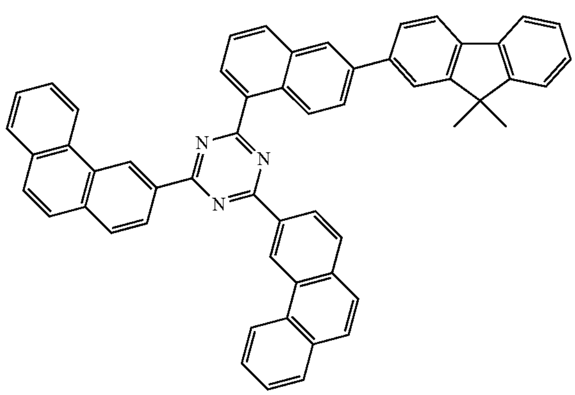
-continued
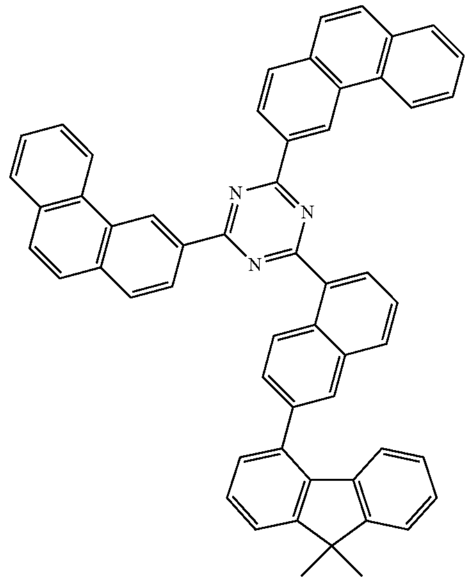
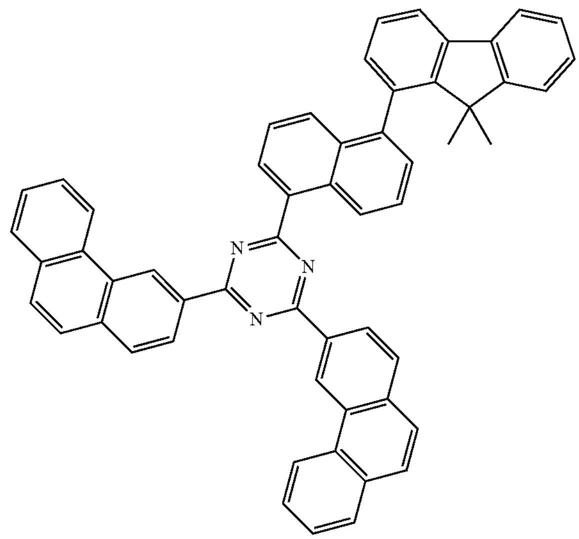
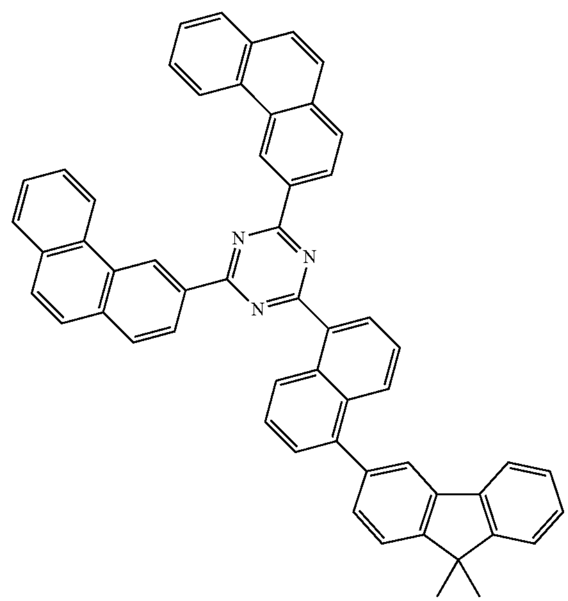

-continued
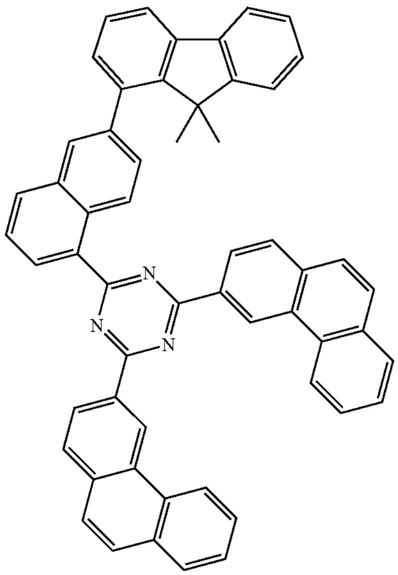
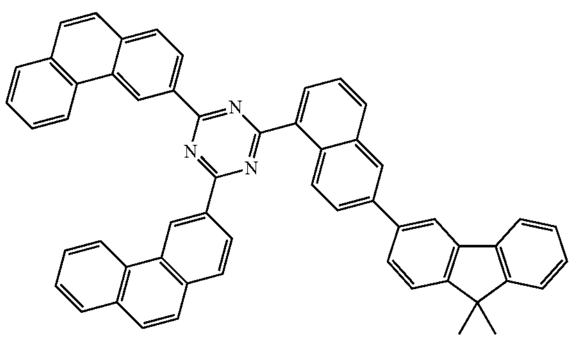
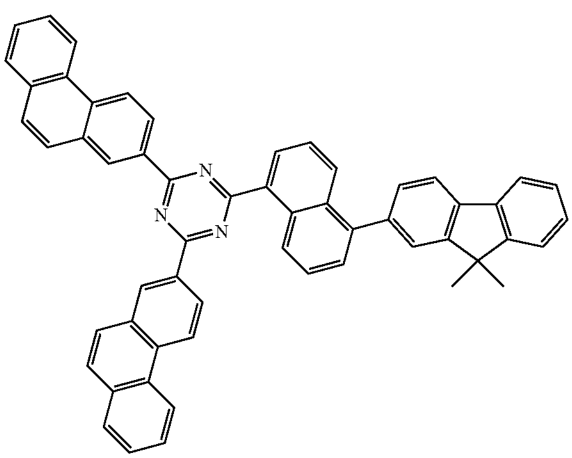
-continued
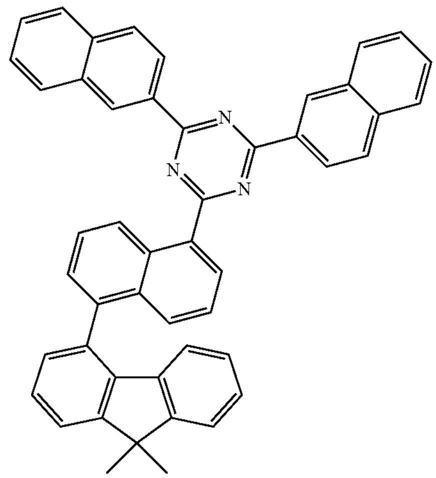
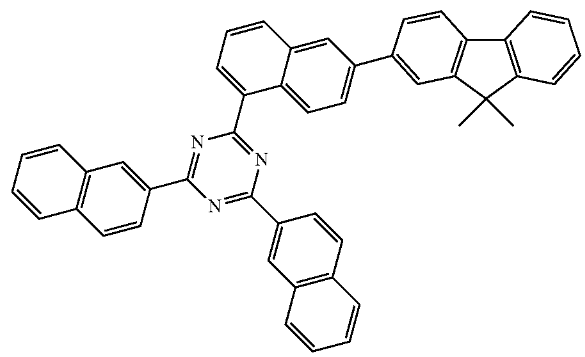
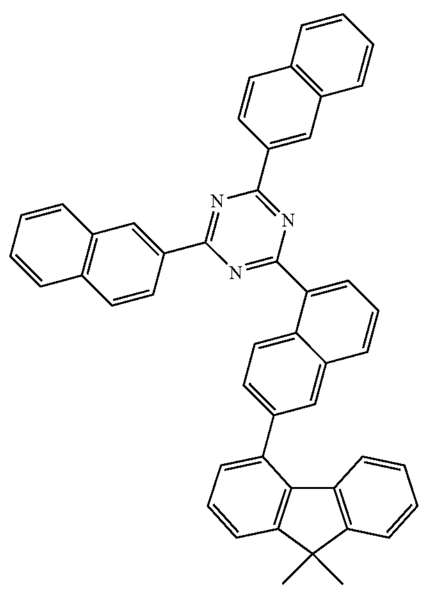

-continued
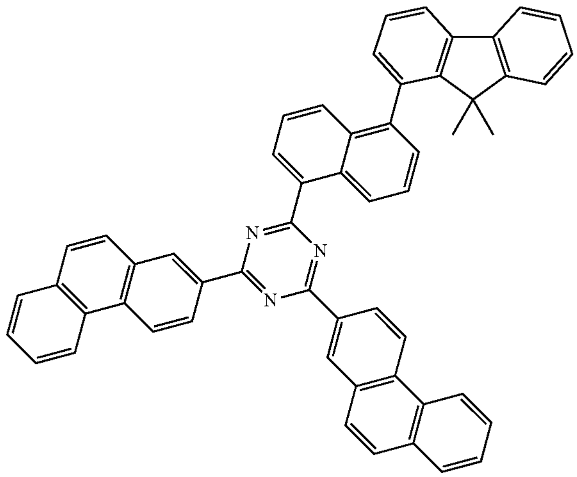
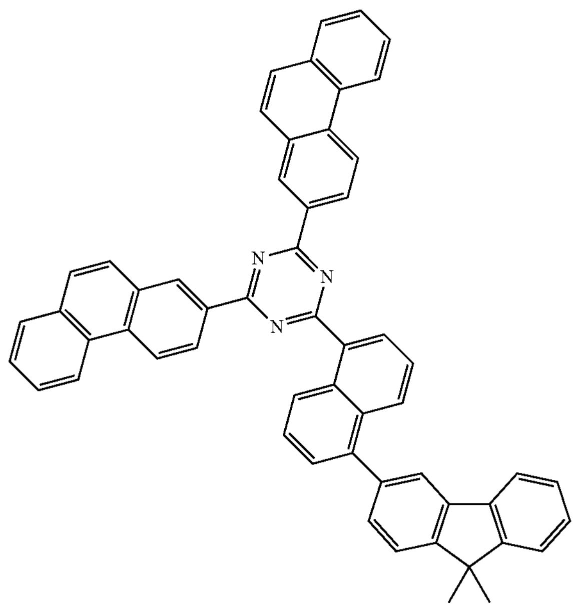
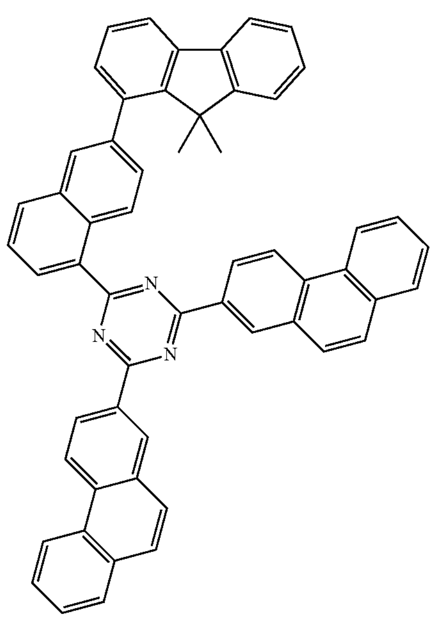
-continued
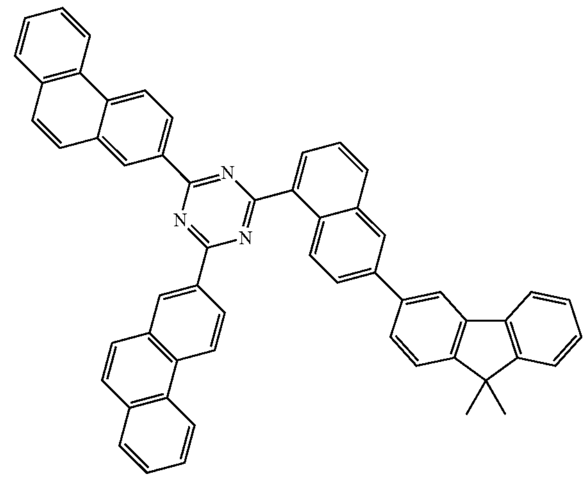
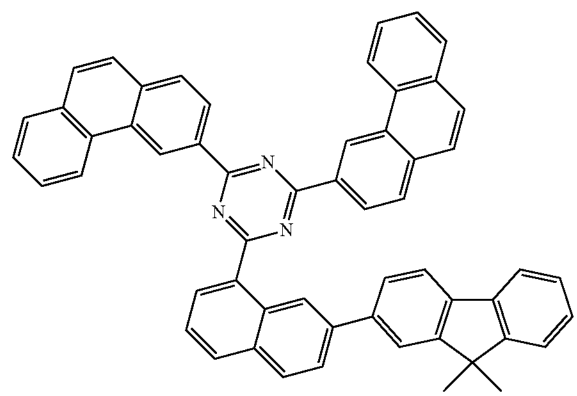
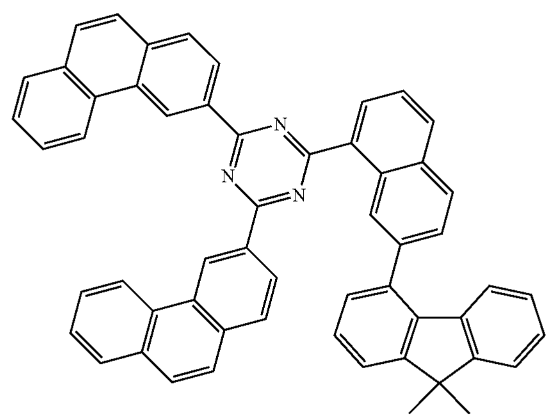
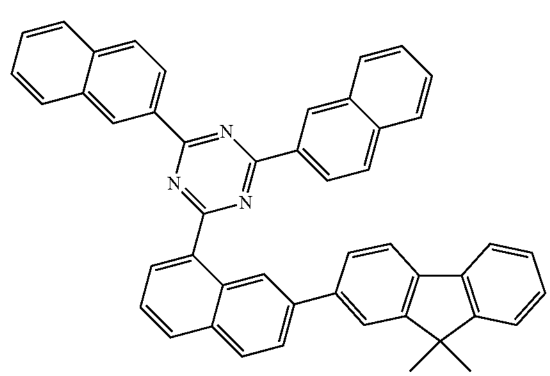

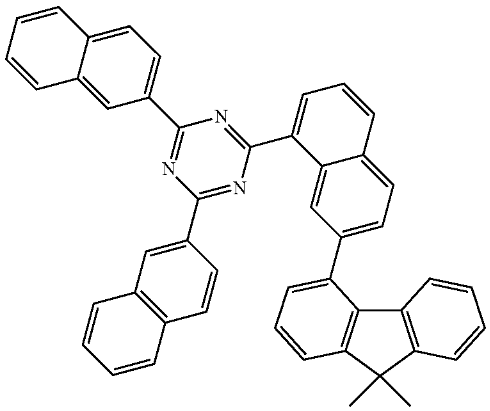
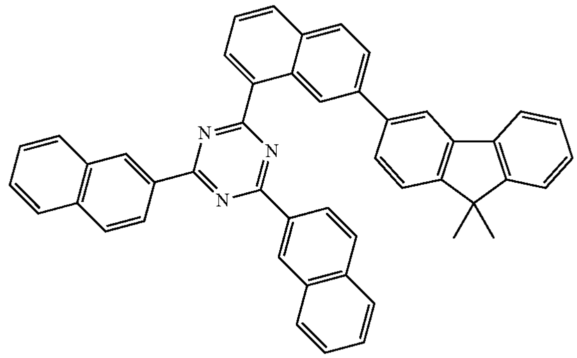
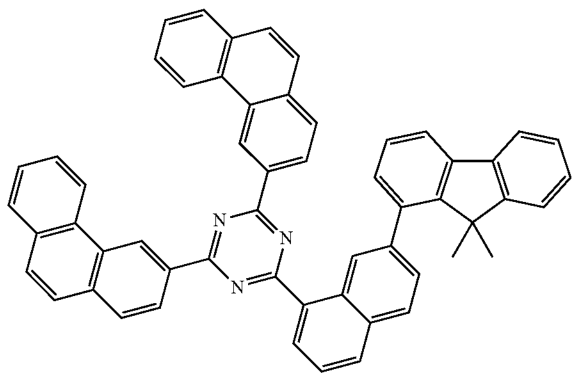
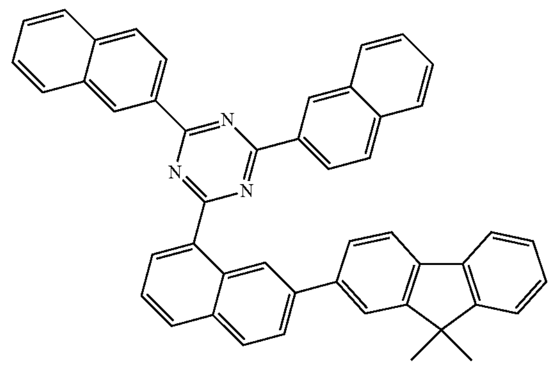
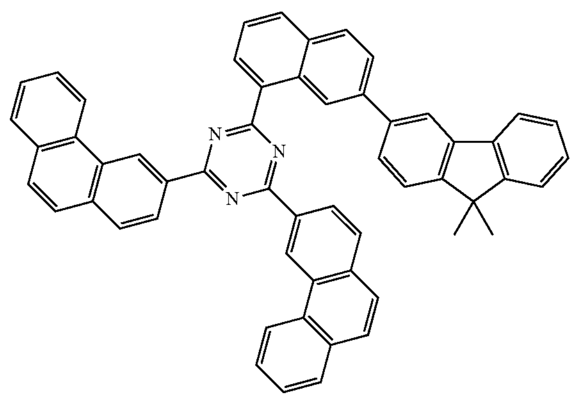
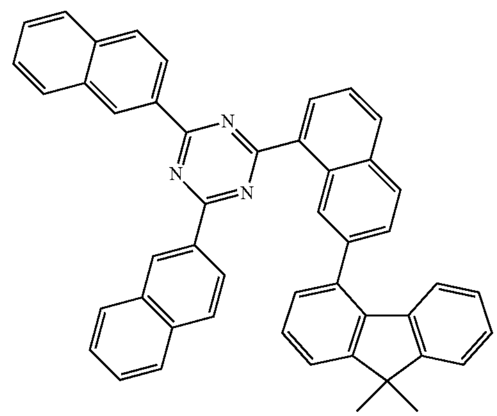
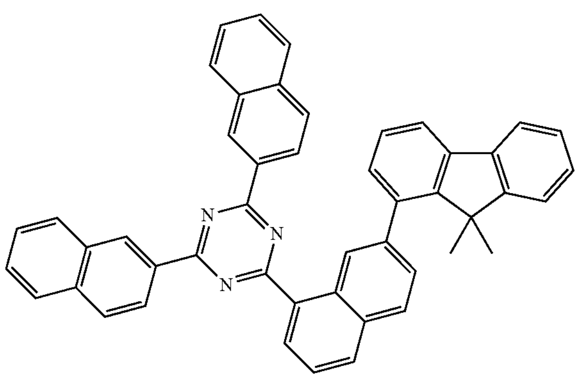
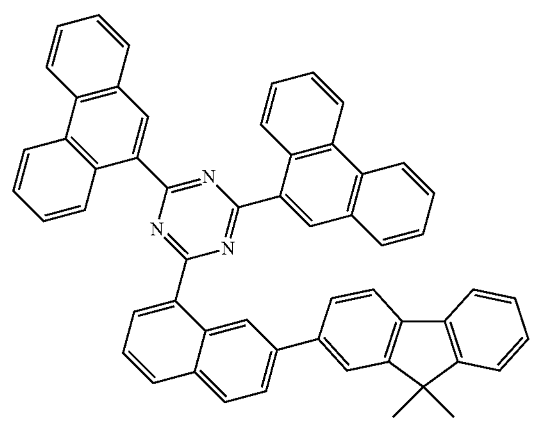

-continued
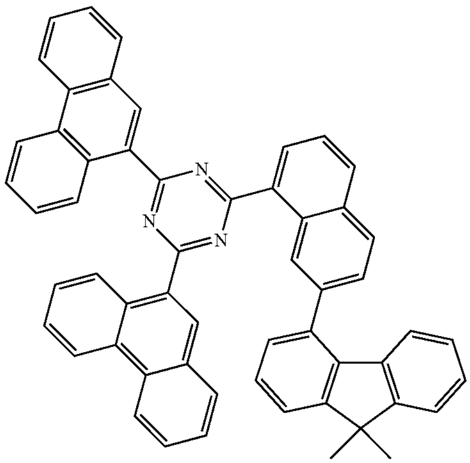
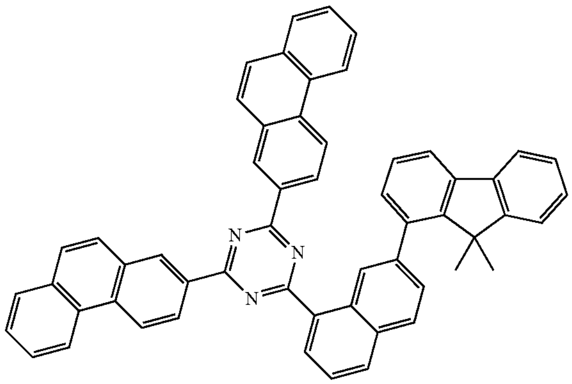
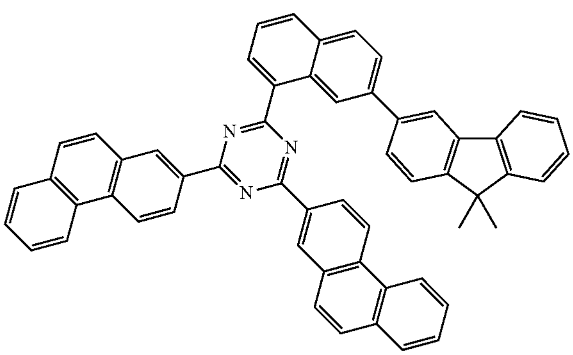
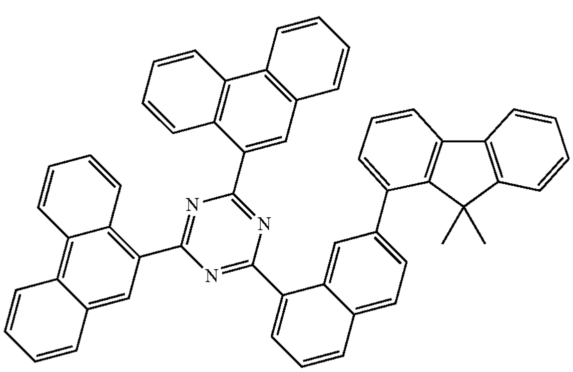
-continued
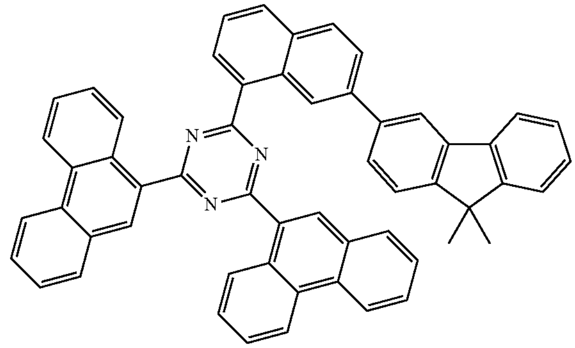
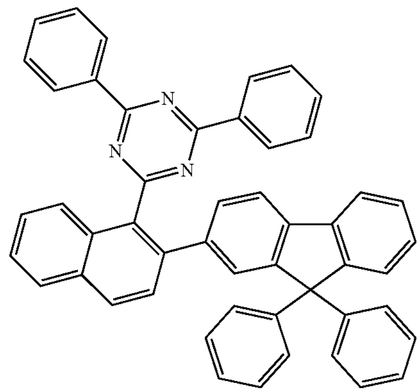
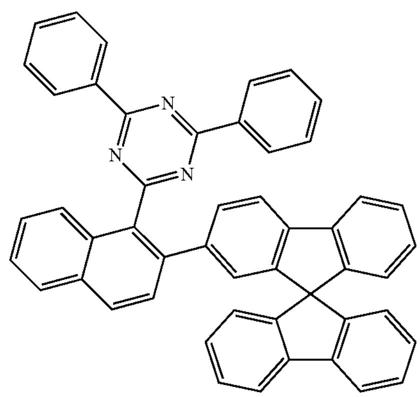
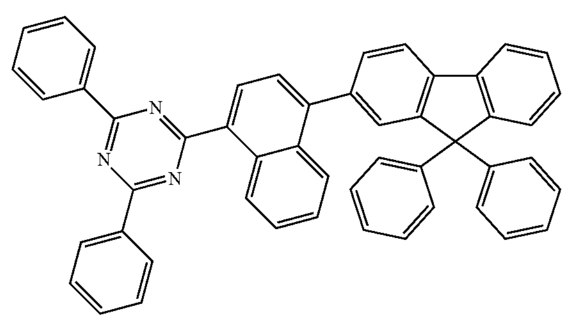

-continued
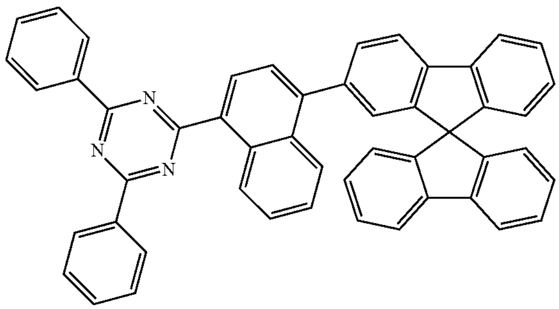
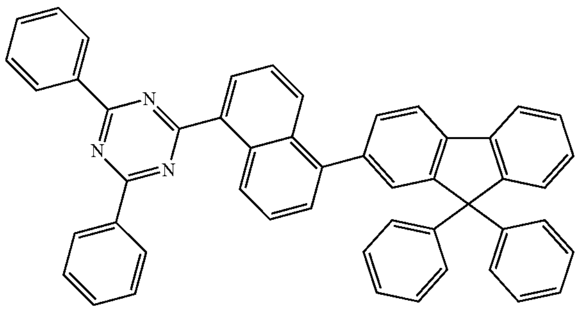
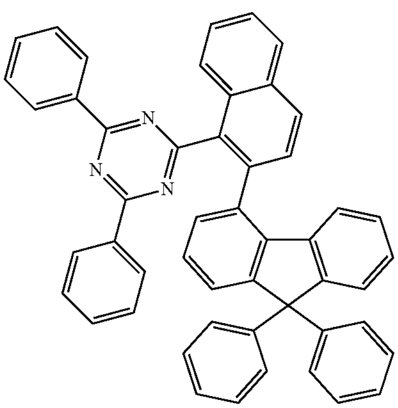
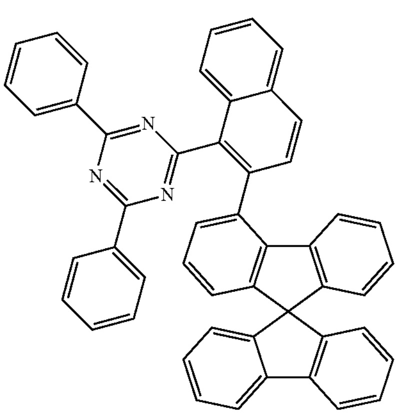
-continued
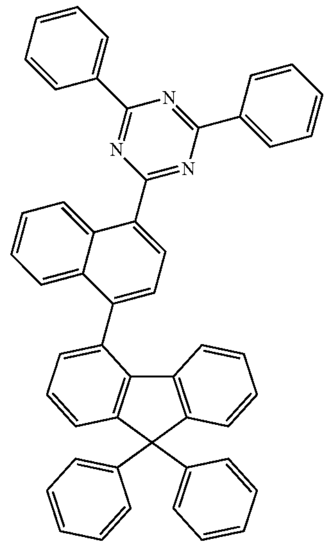
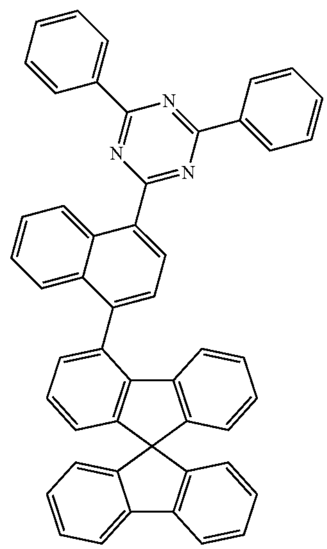
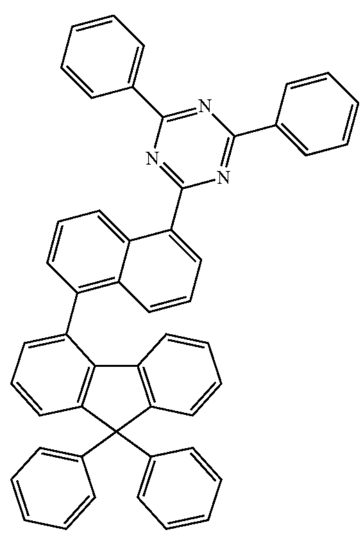

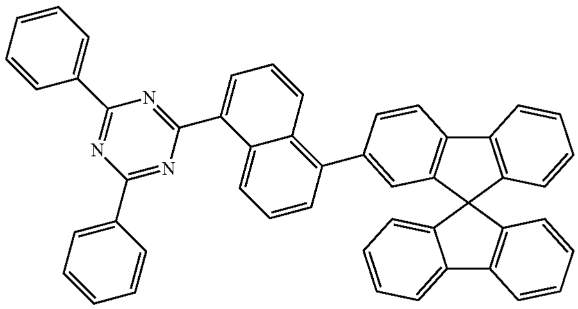
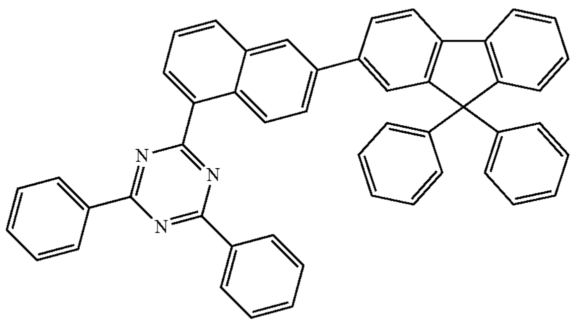
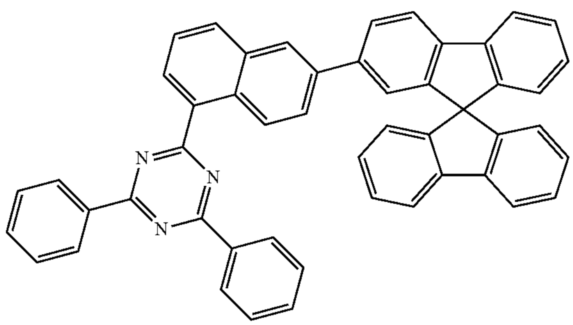
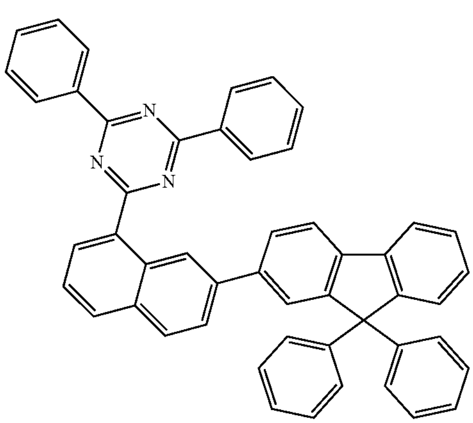
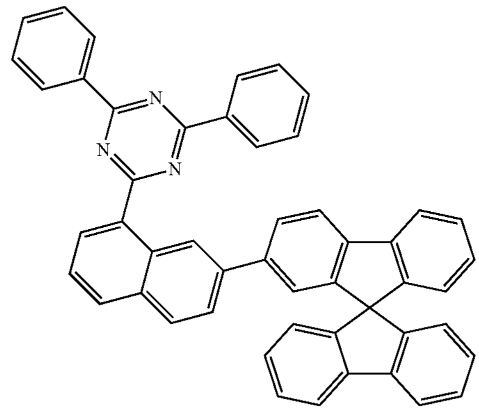
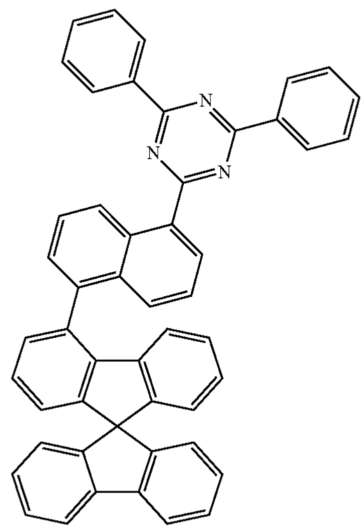
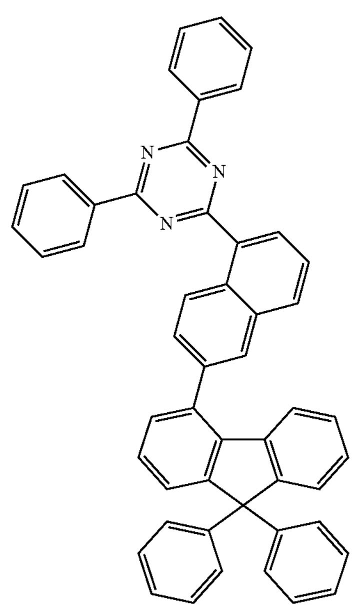

-continued
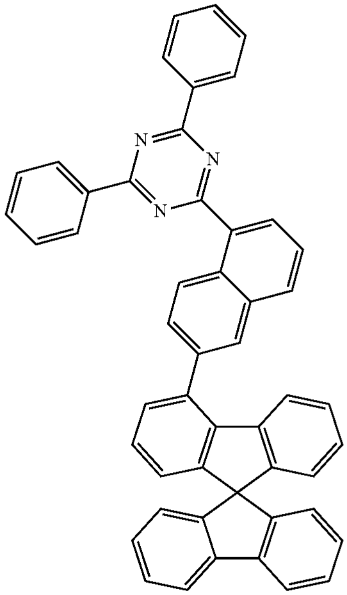
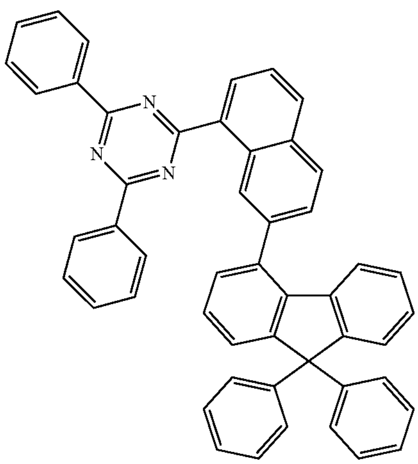
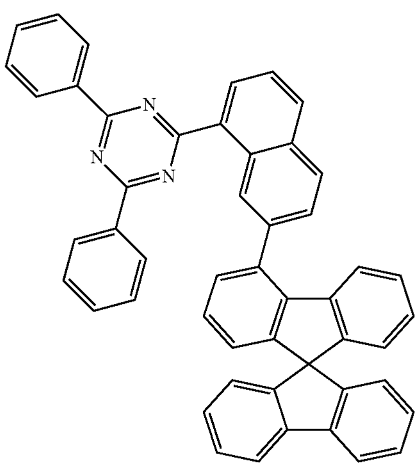
-continued
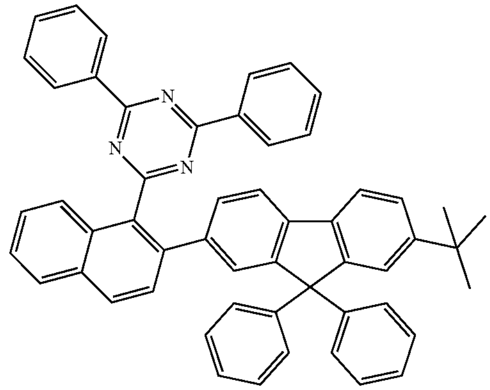
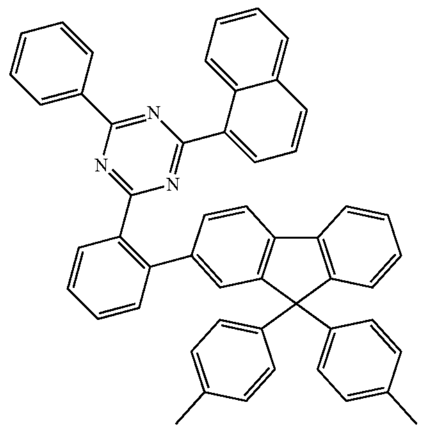
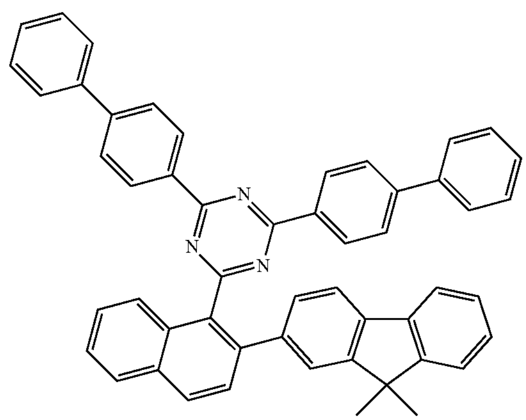
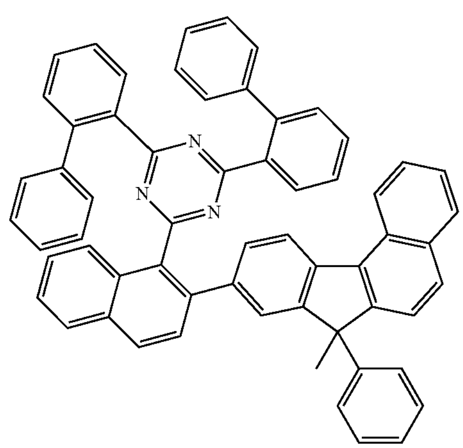

-continued
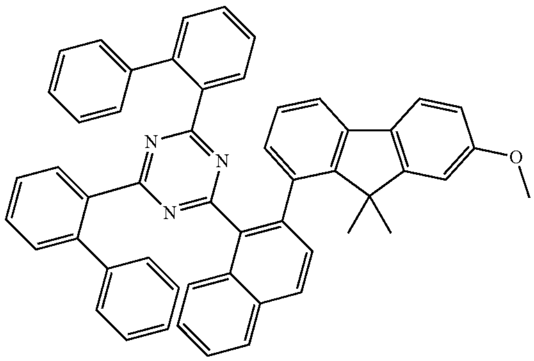
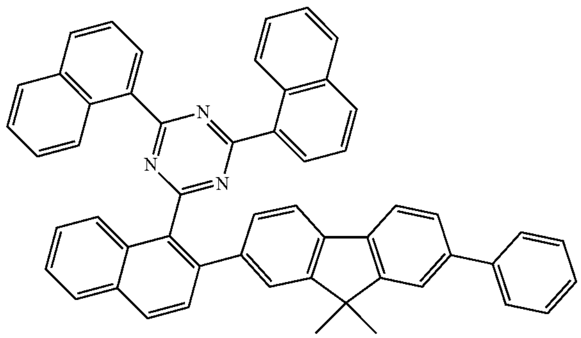
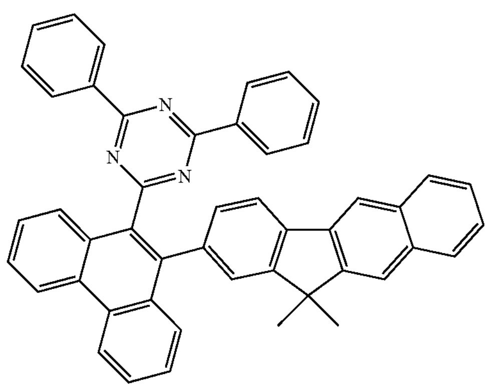
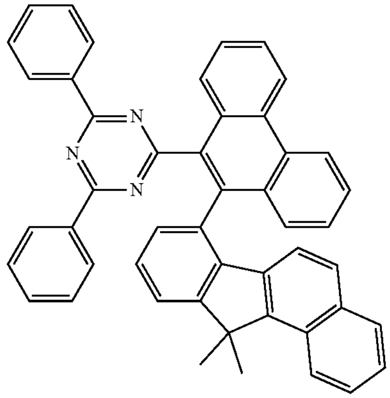
-continued
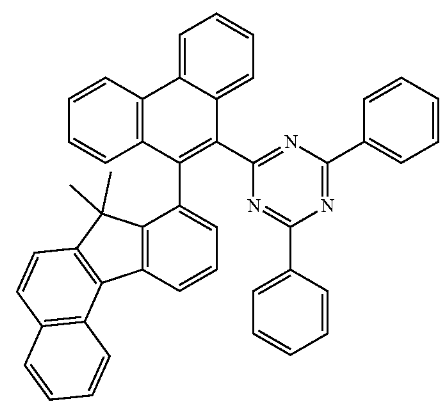
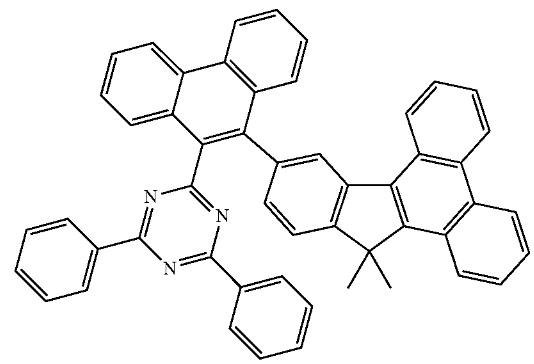
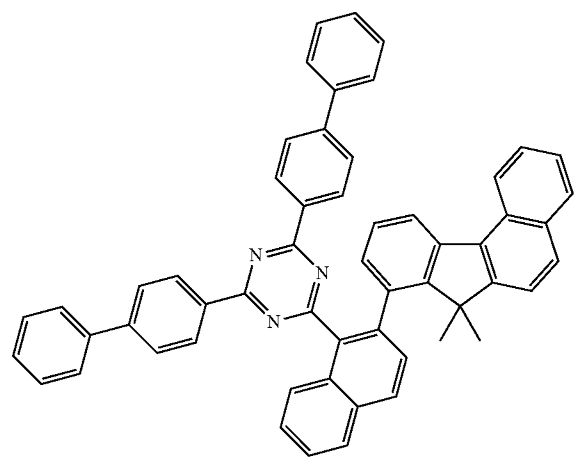
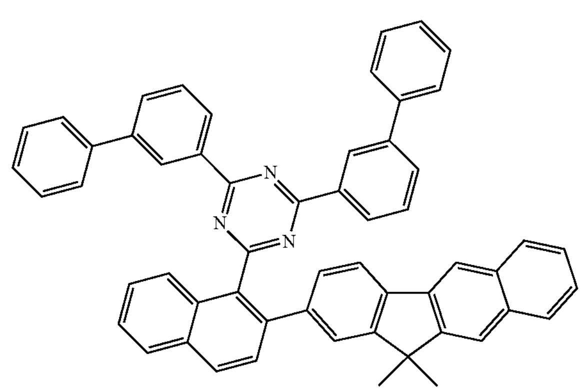

-continued
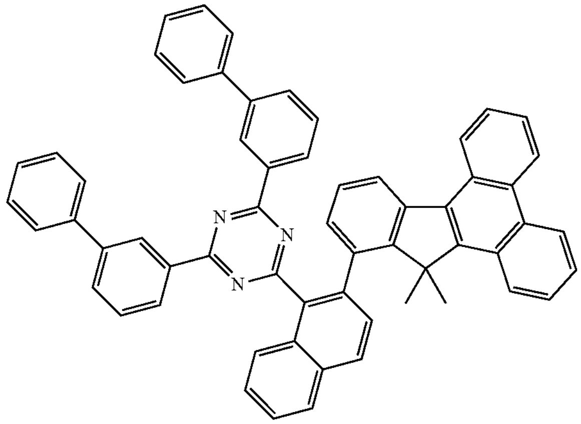
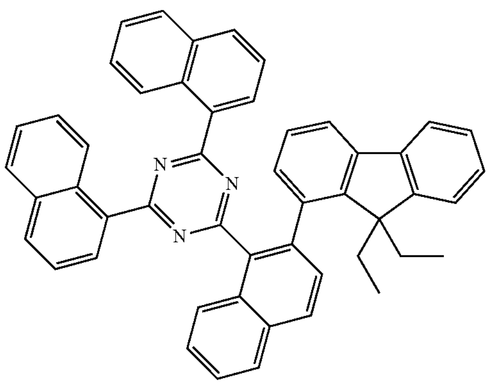
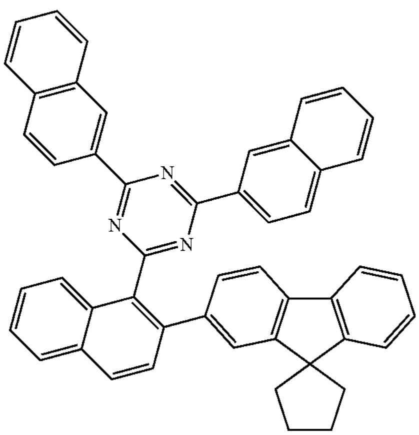
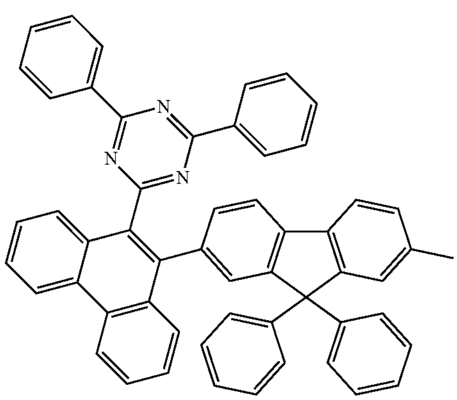
-continued
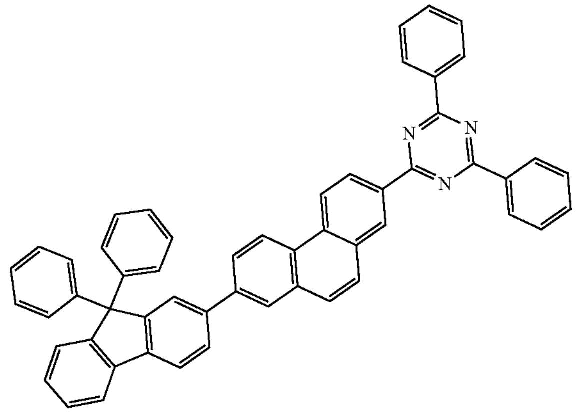
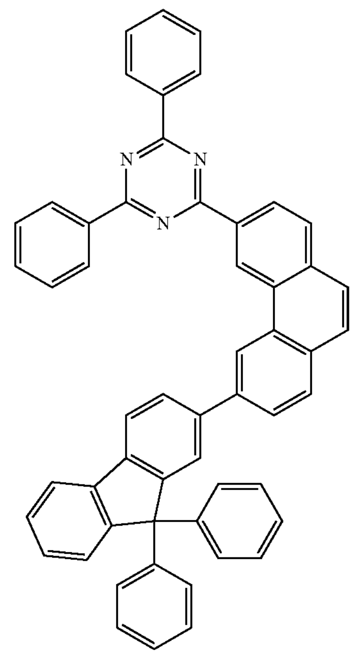
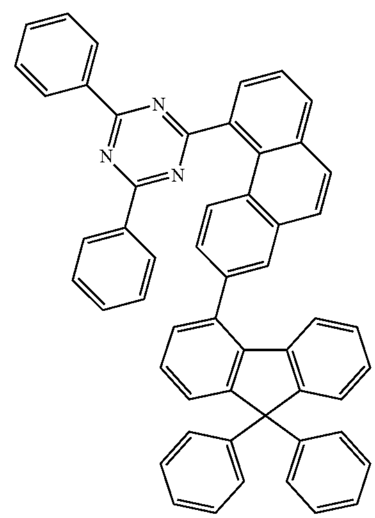

-continued
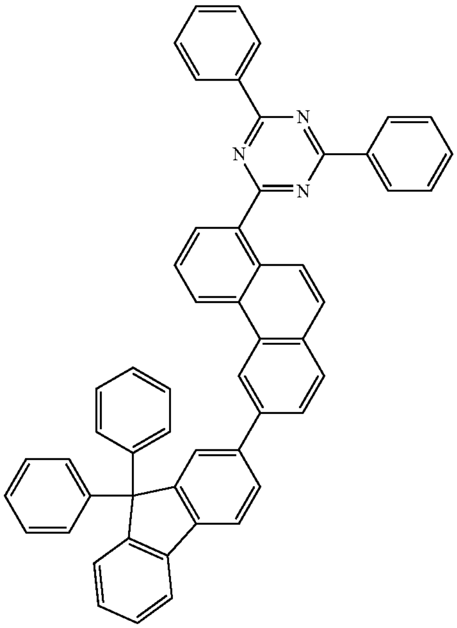
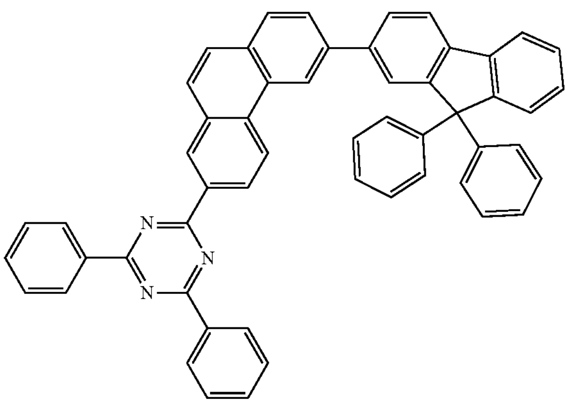
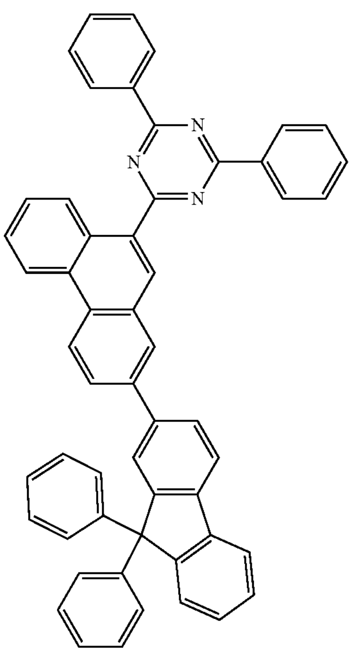
-continued
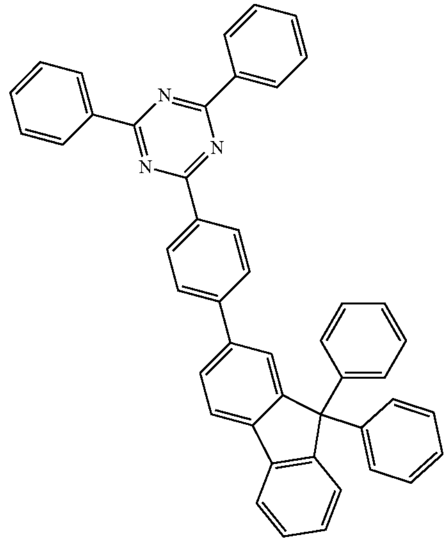
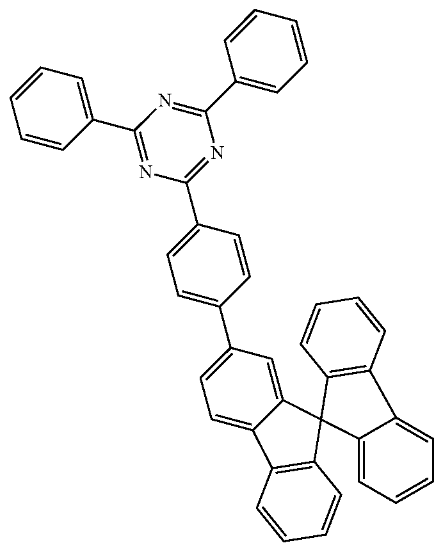
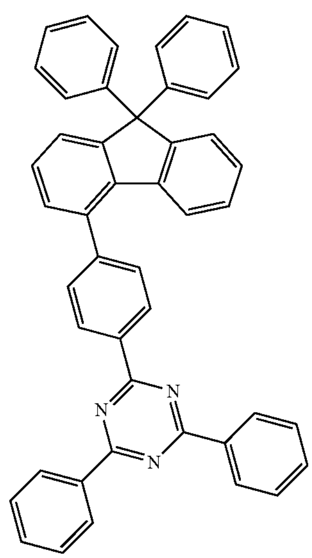

-continued
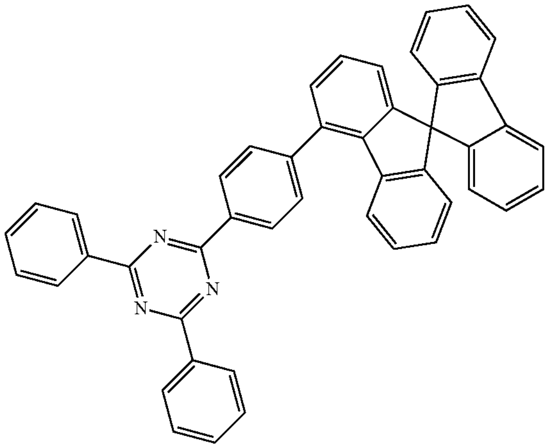
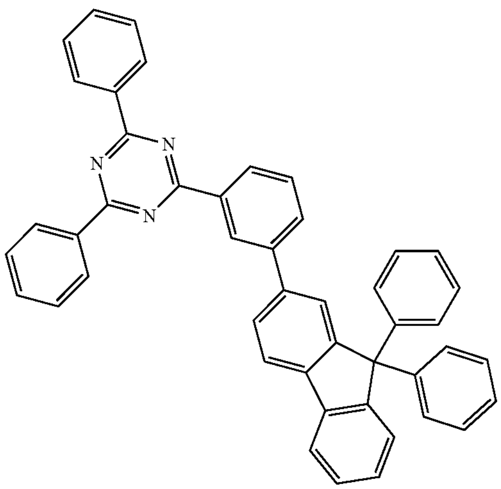
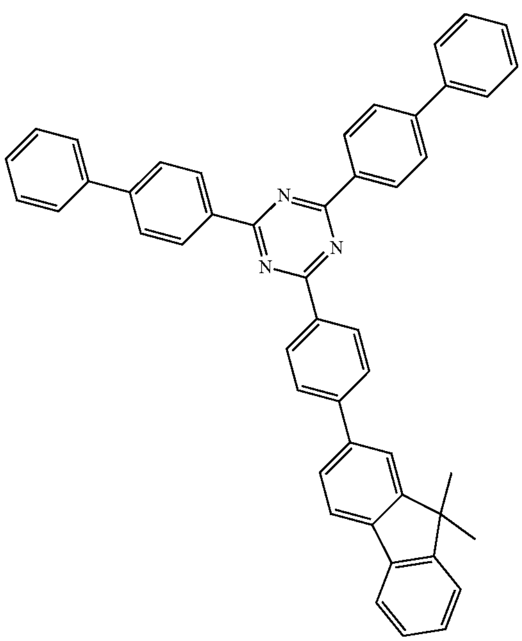
-continued
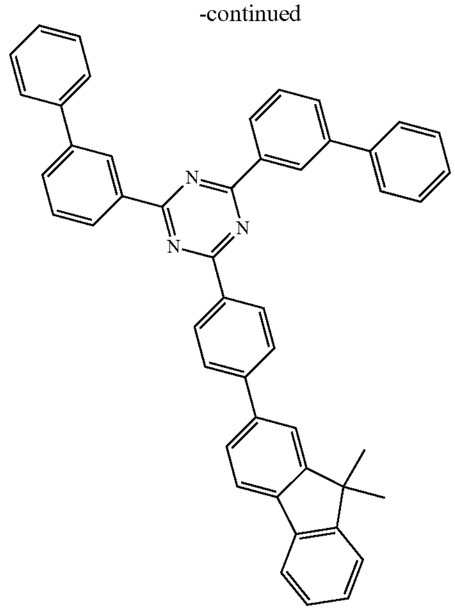
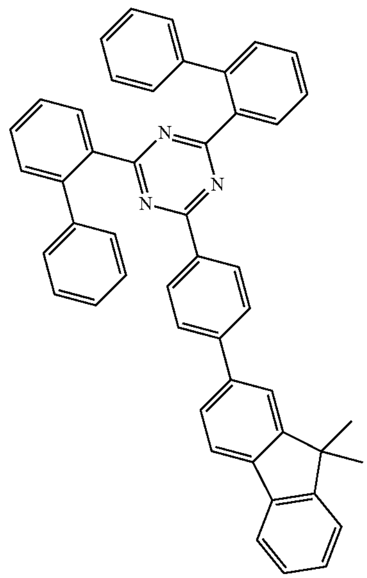
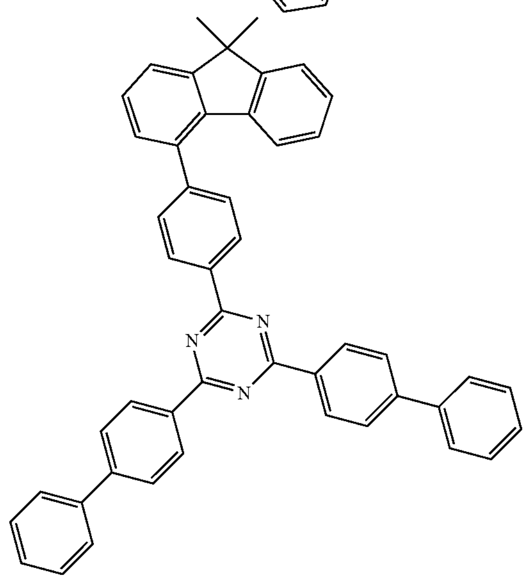

-continued
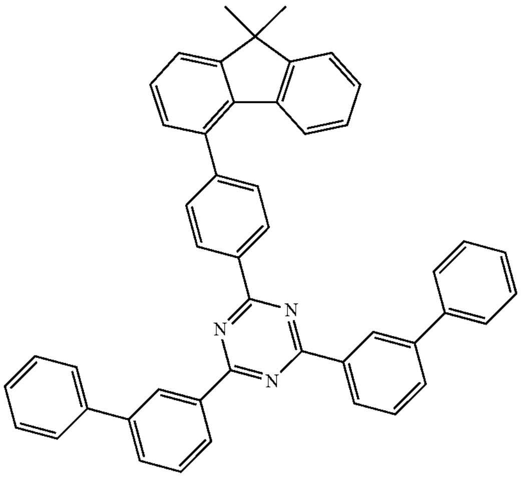
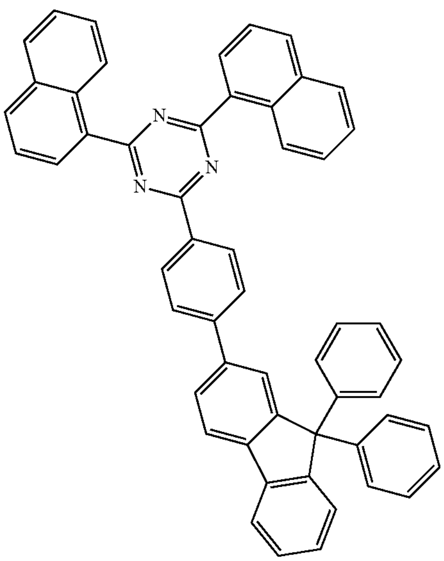
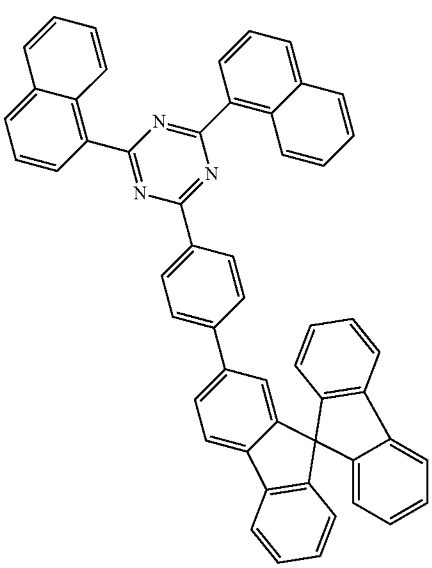
-continued
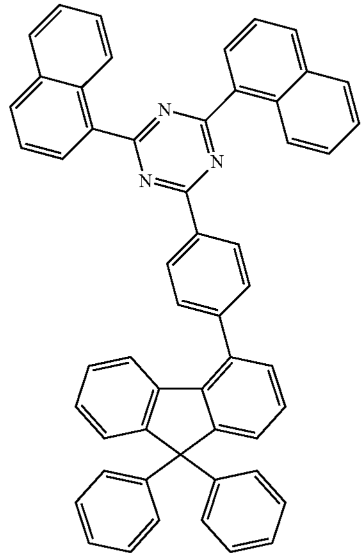
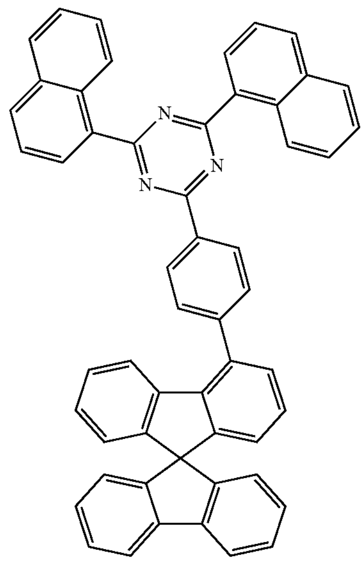
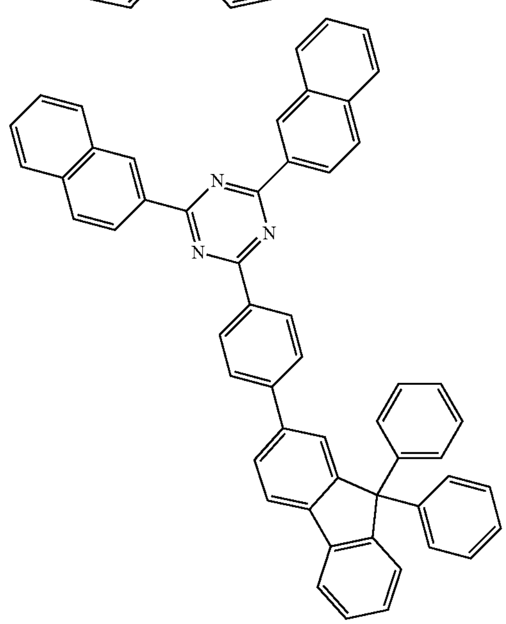

-continued
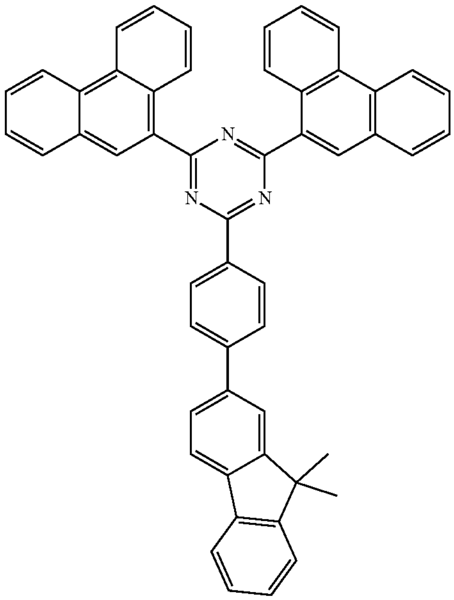
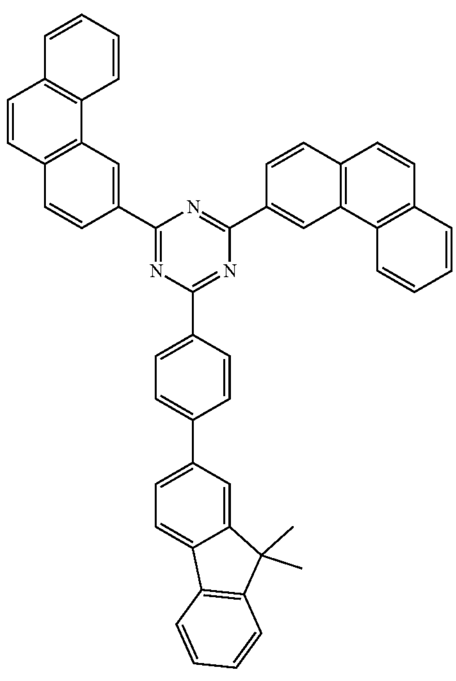
-continued
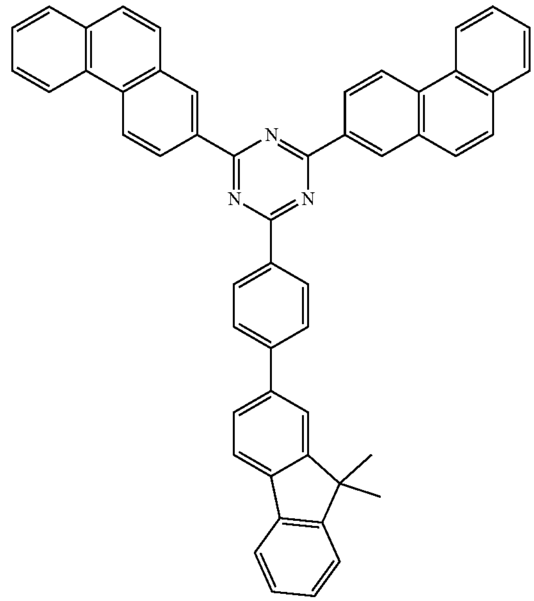
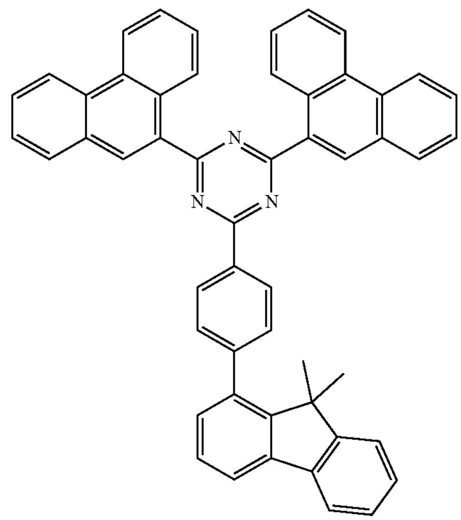
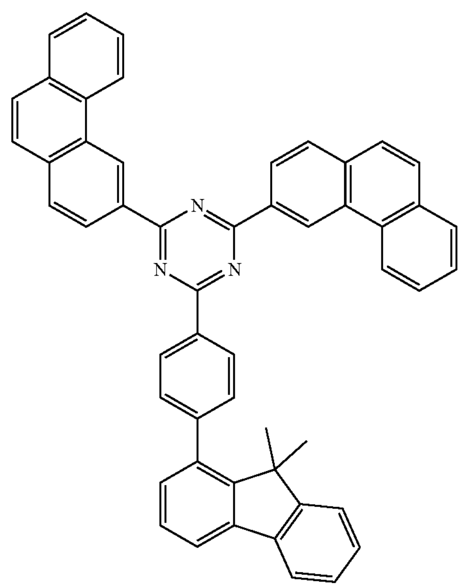

-continued
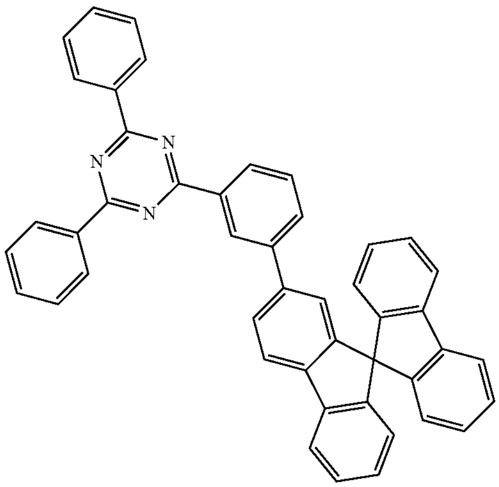
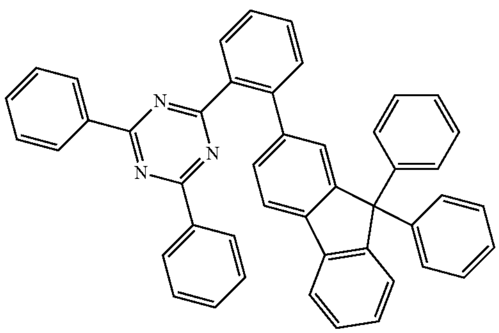
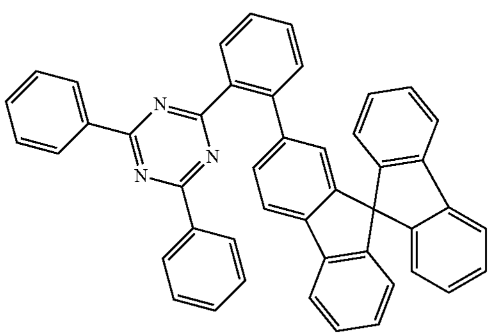
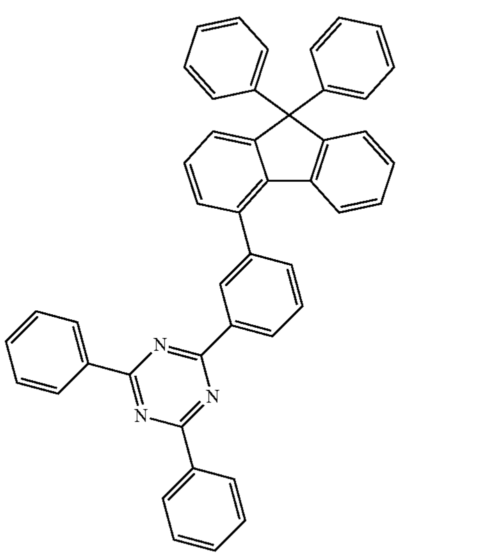
-continued
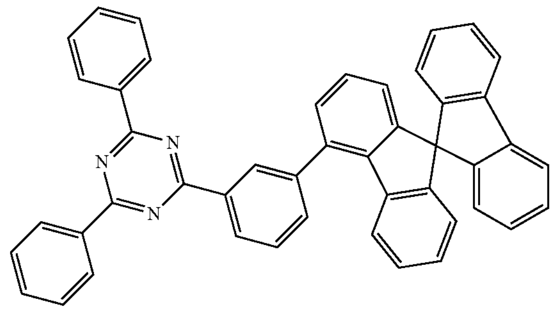
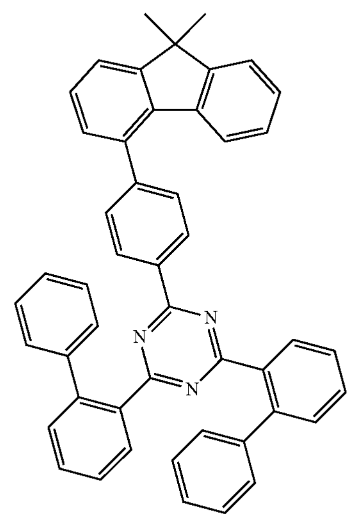
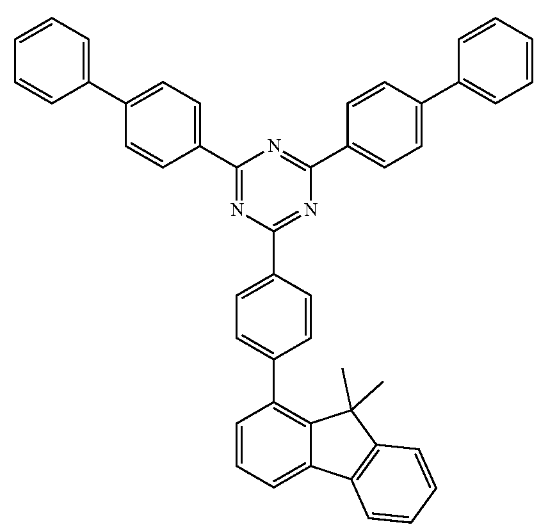

-continued
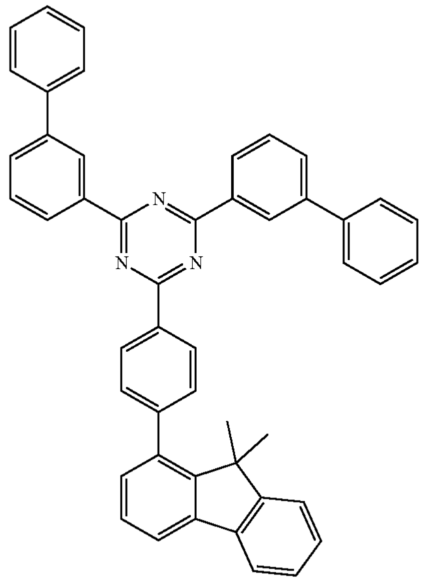
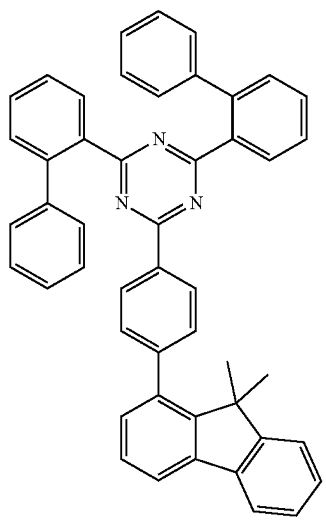
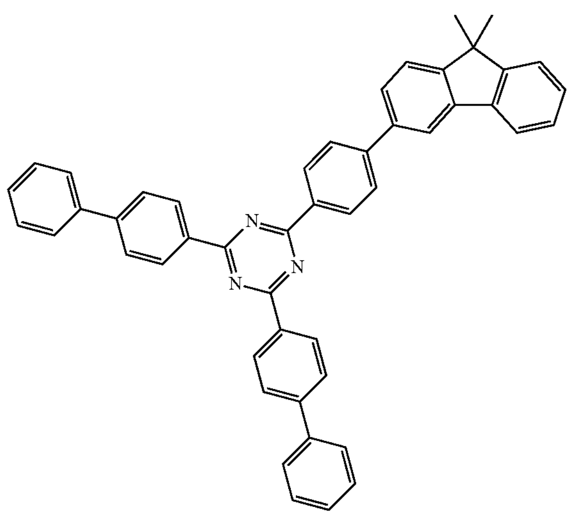
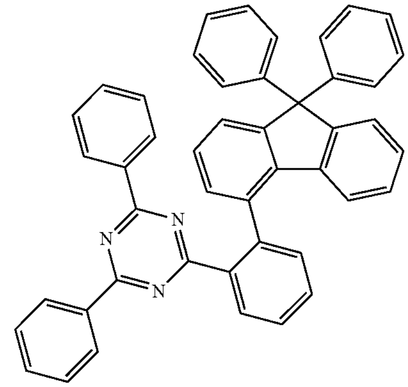
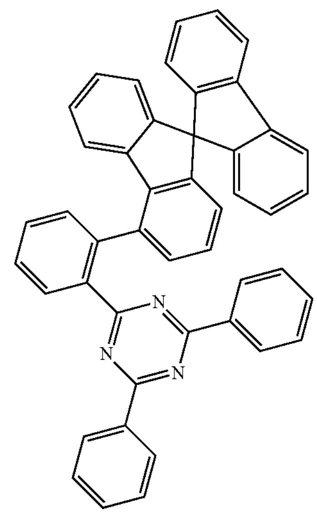
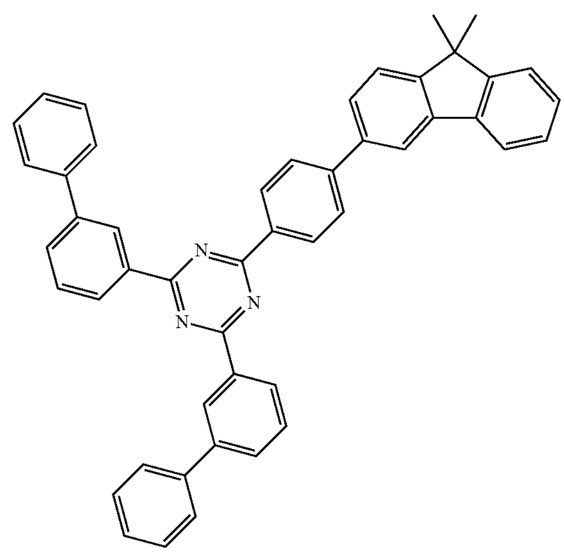
-continued -continued
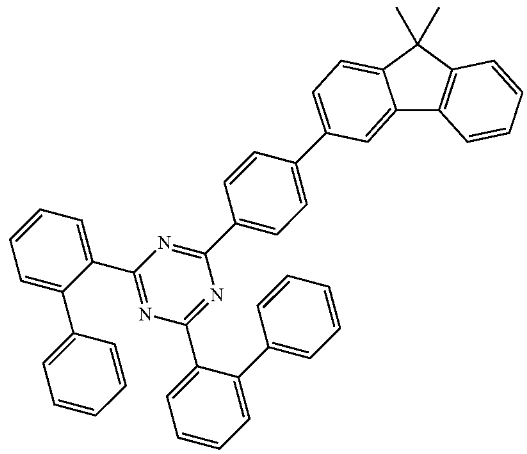
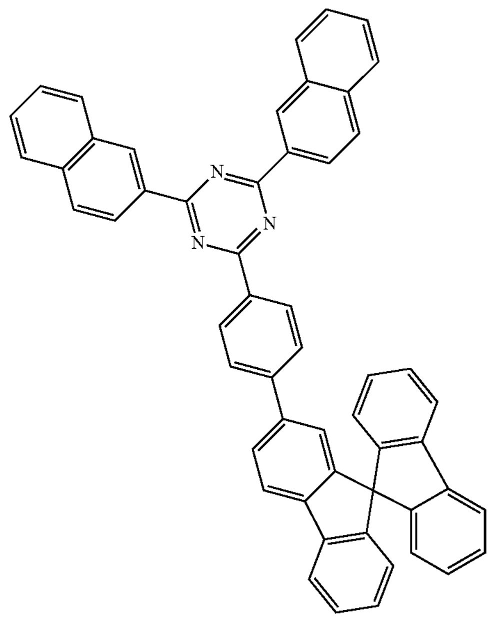
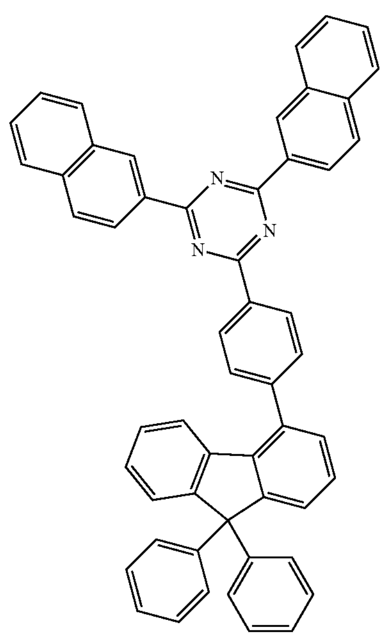
-continued
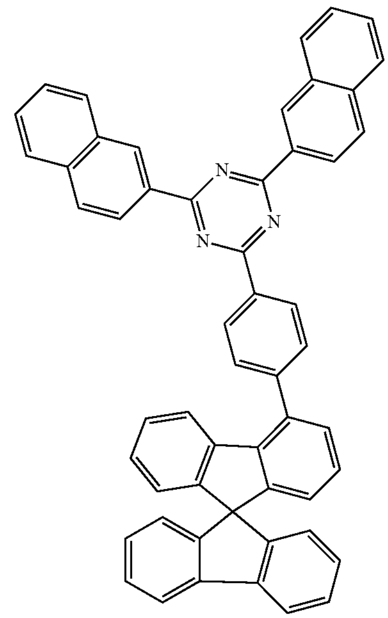
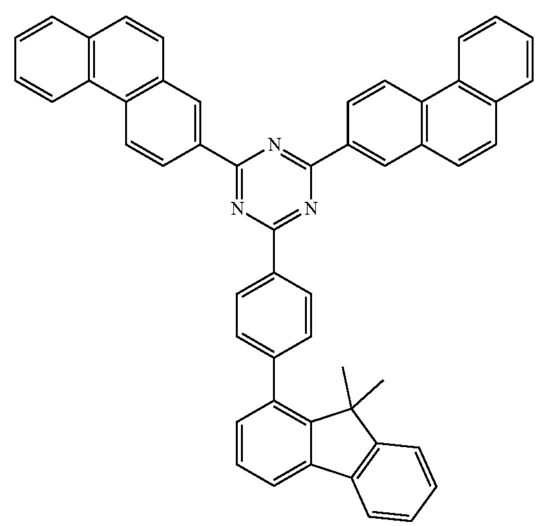
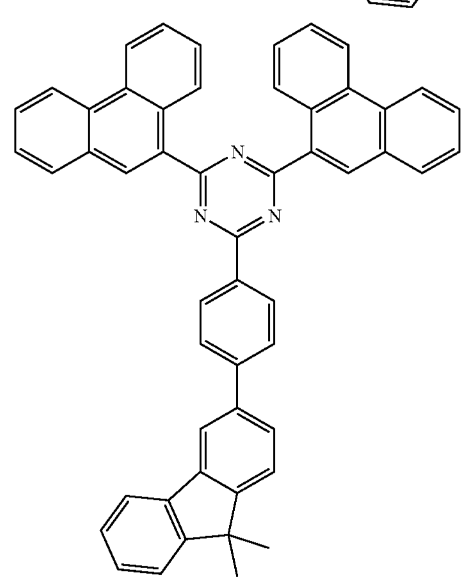

-continued
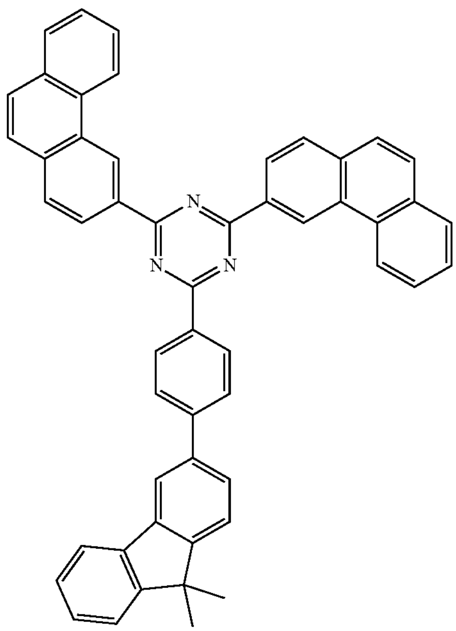
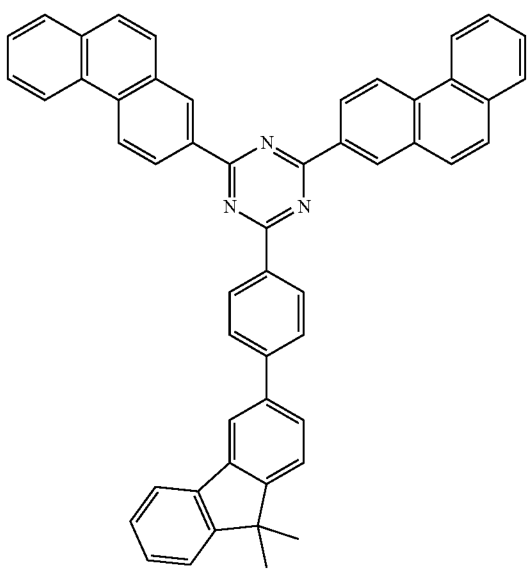
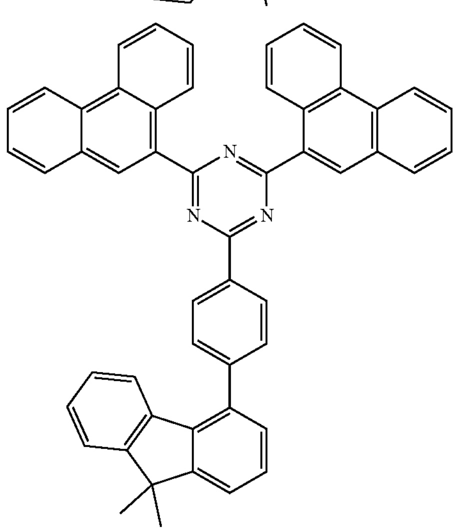
-continued
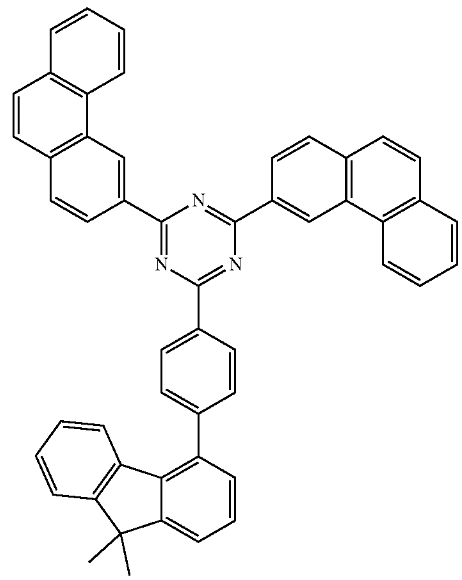
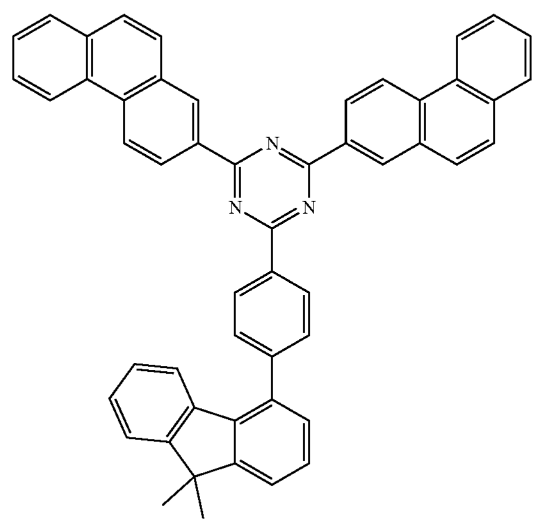
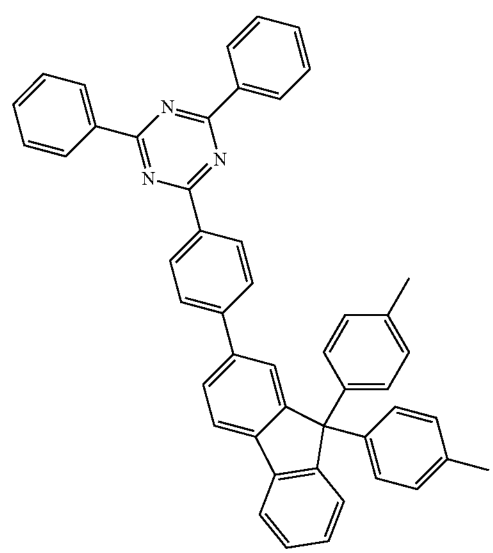

-continued
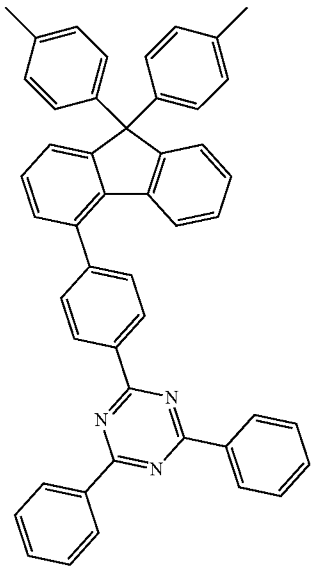
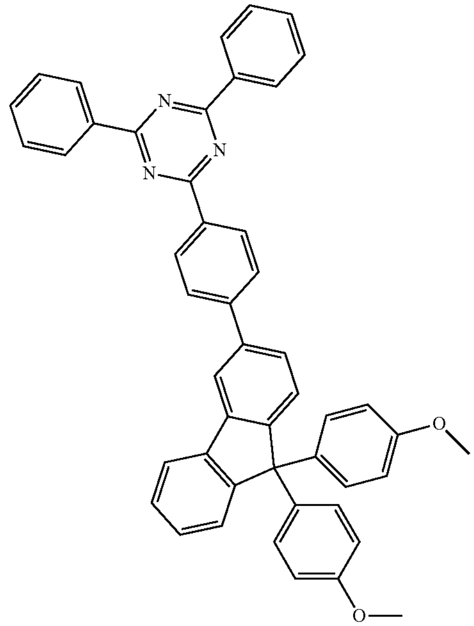
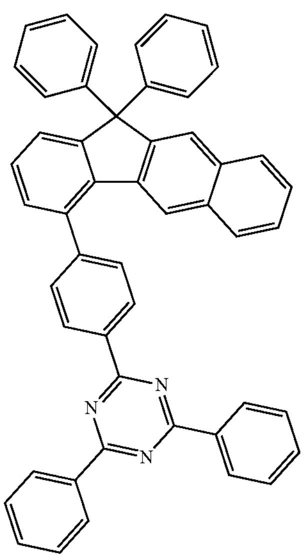
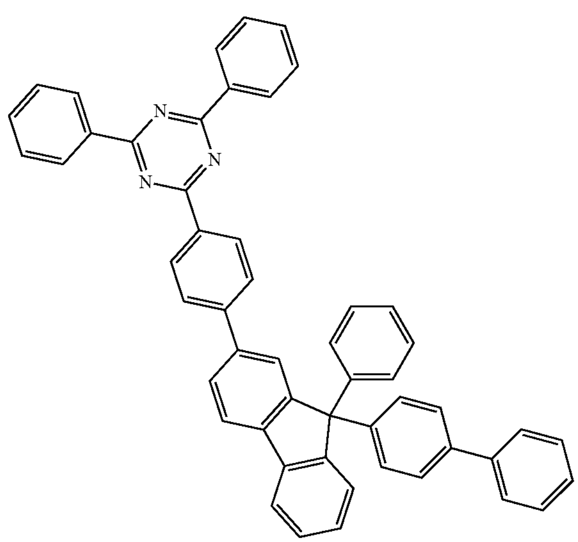

-continued
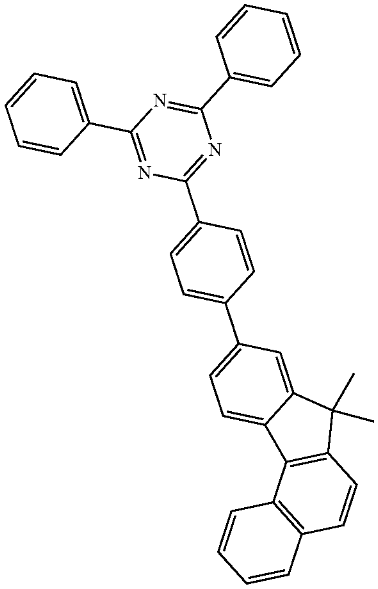
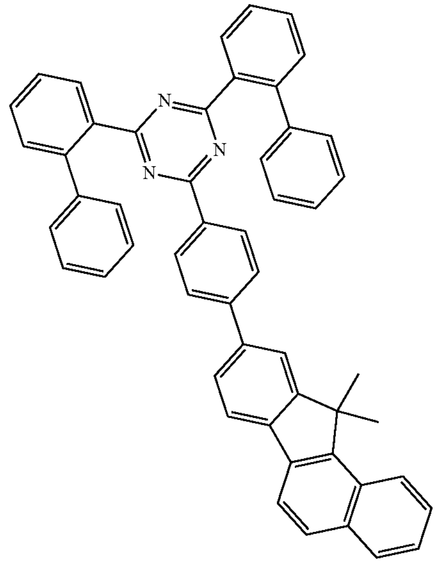
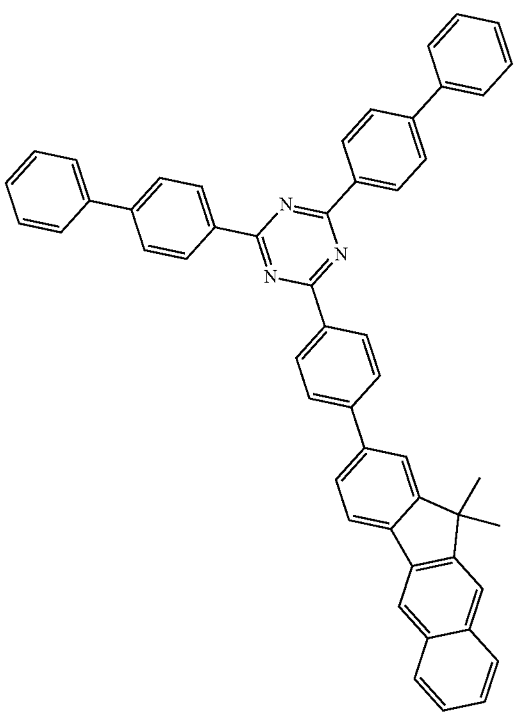
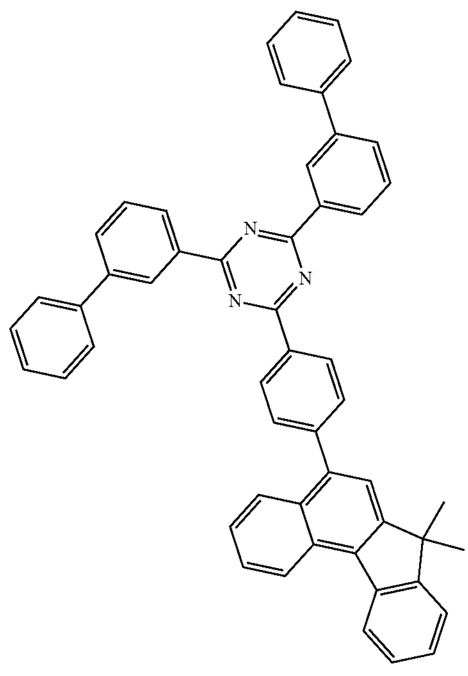

-continued
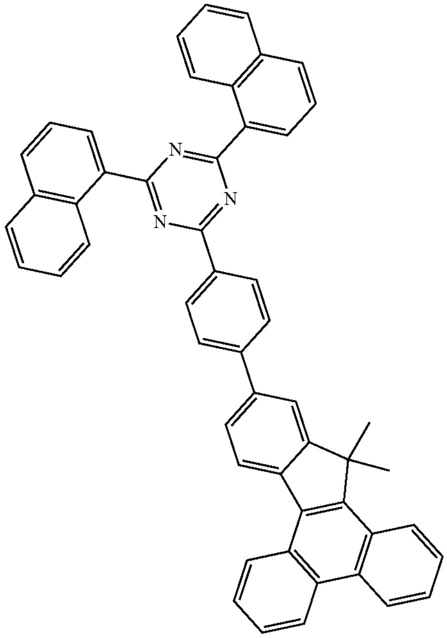
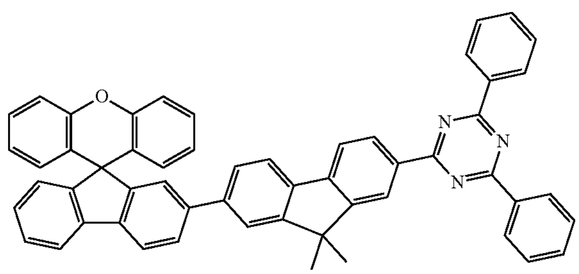
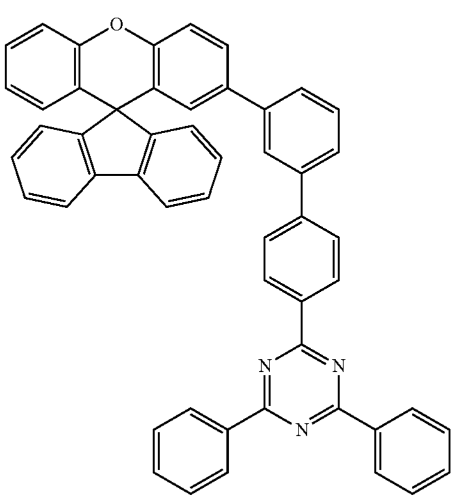
-continued
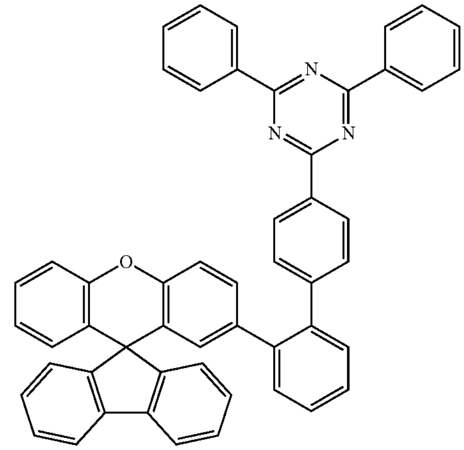
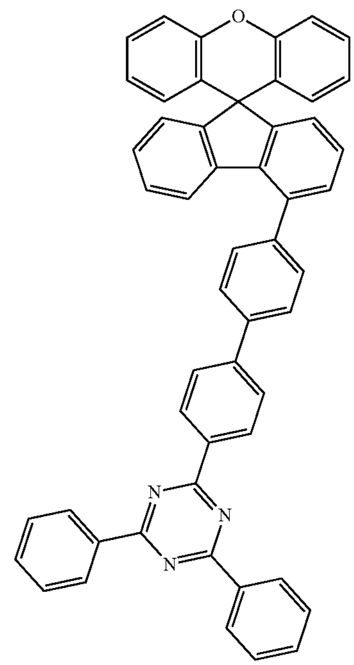
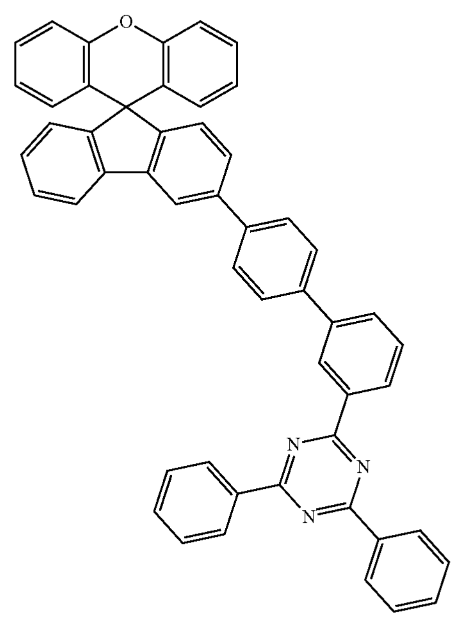

-continued
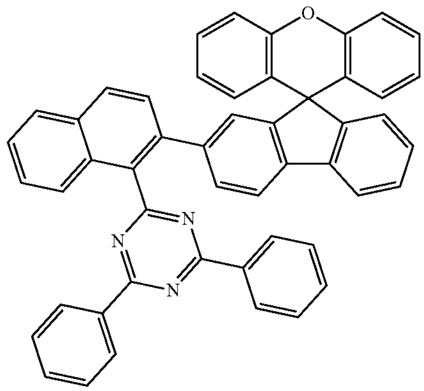
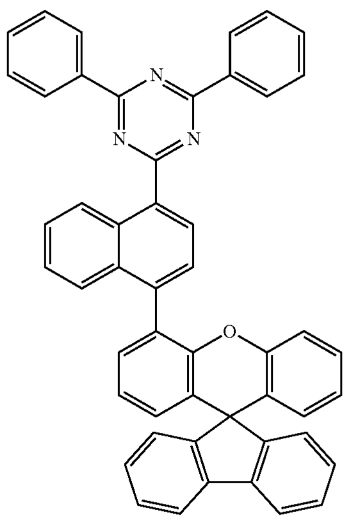
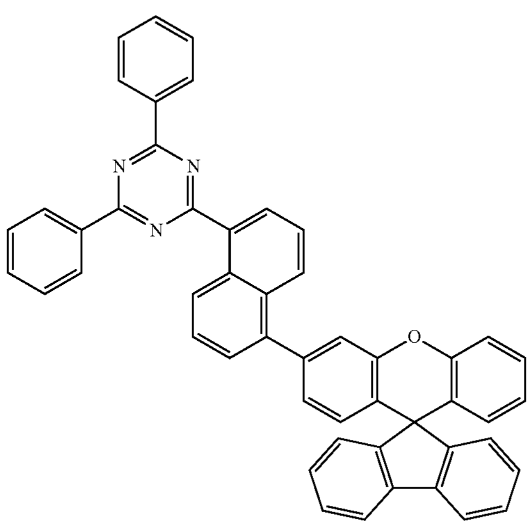
-continued
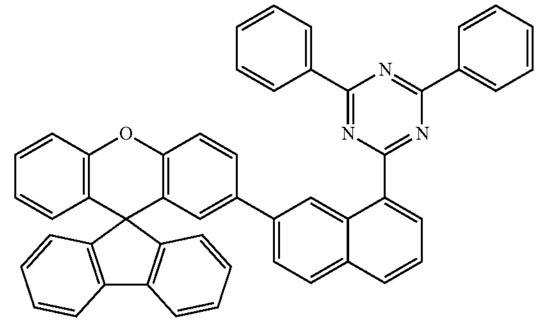
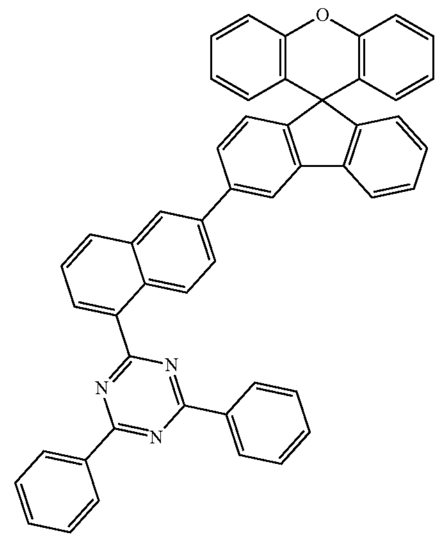
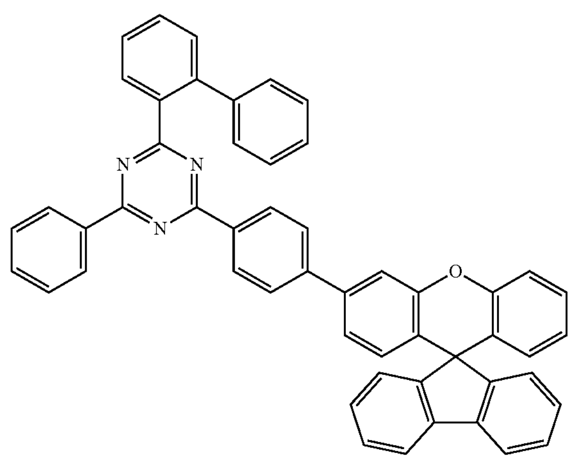
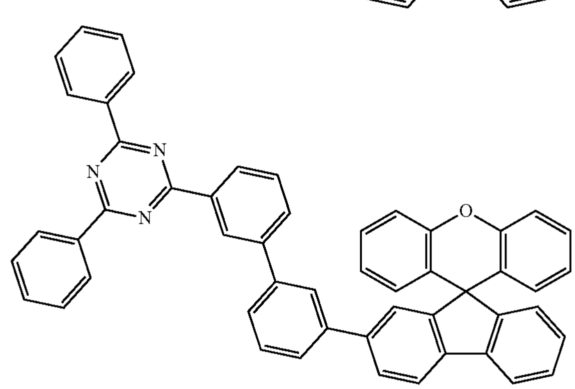

-continued
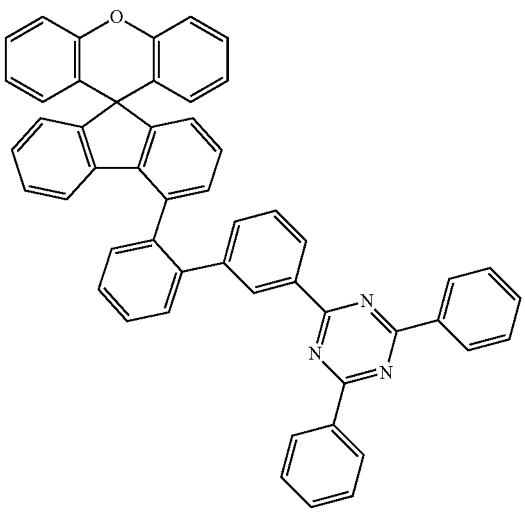
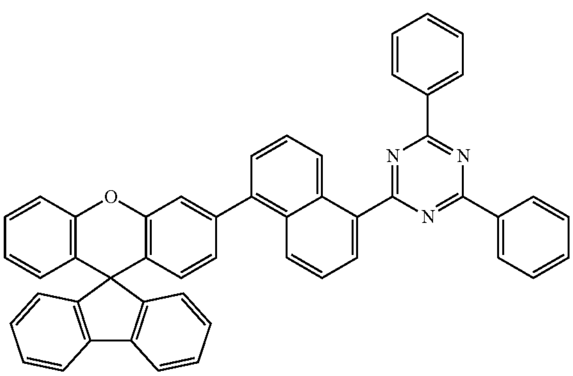
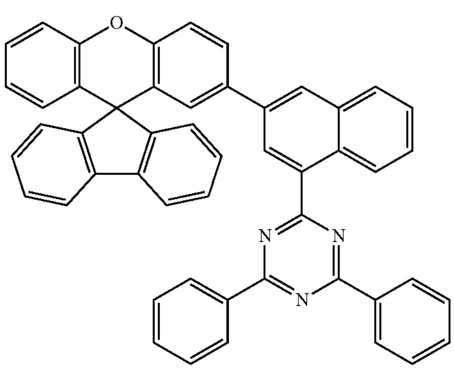
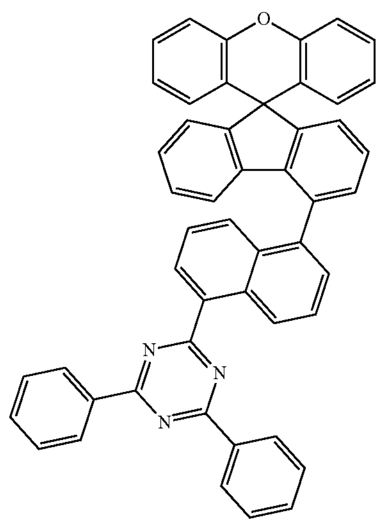
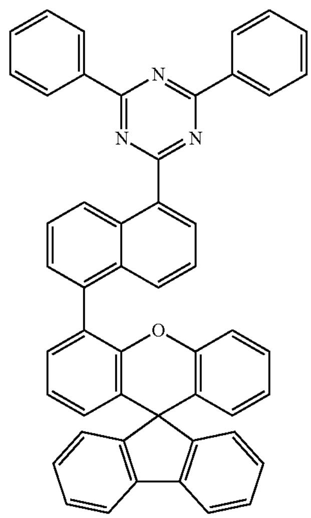
-continued
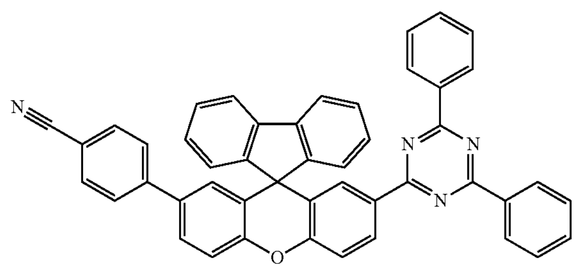
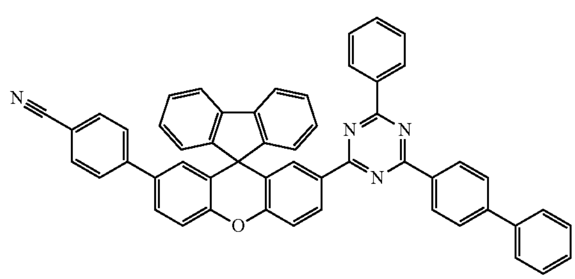

-continued
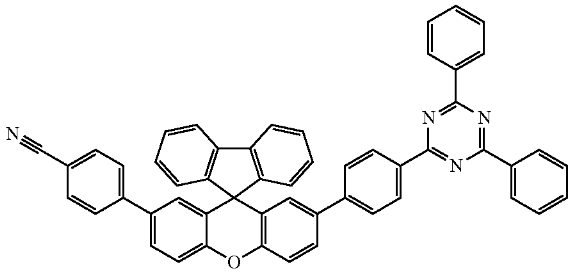
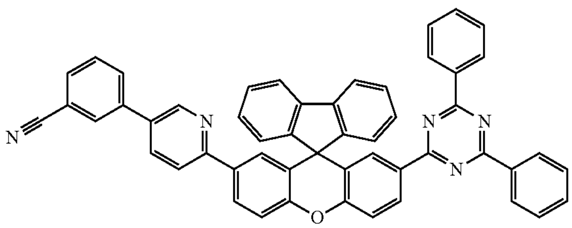
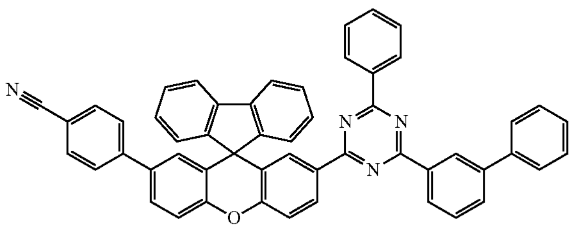
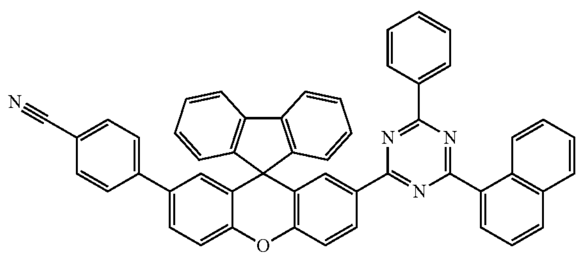
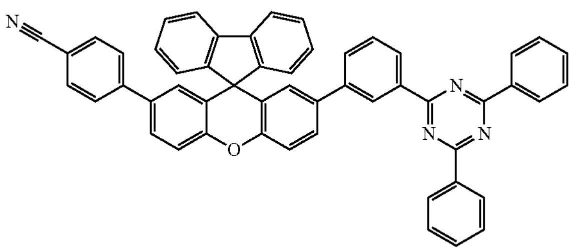
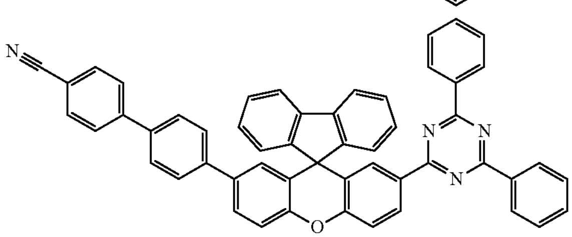
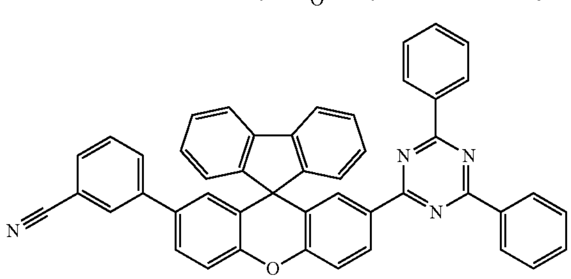
-continued
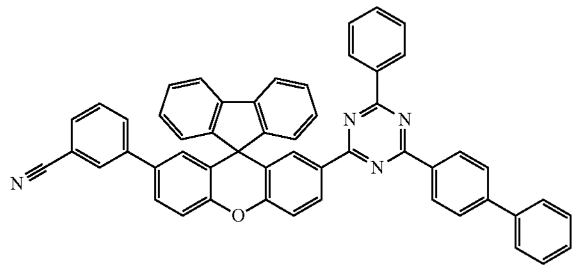
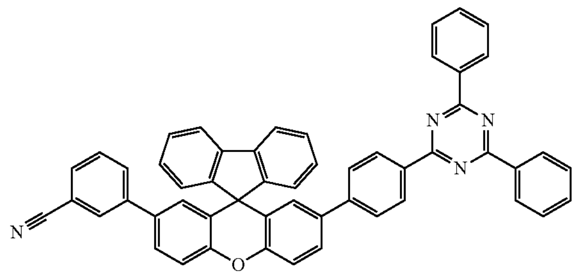
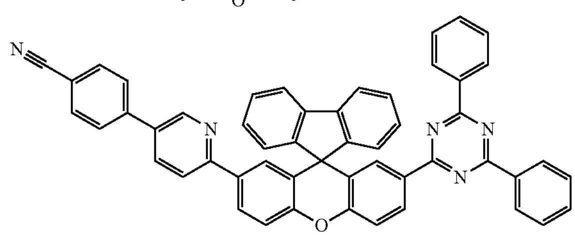
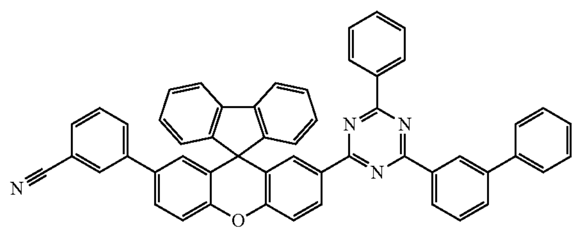
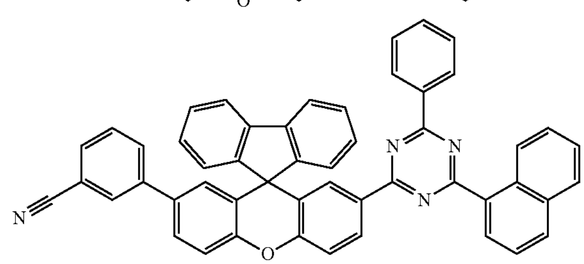
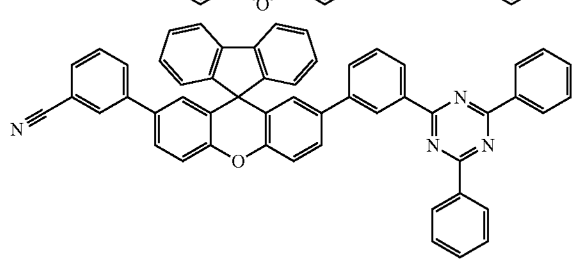
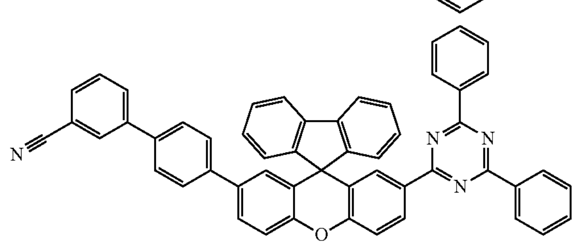

-continued
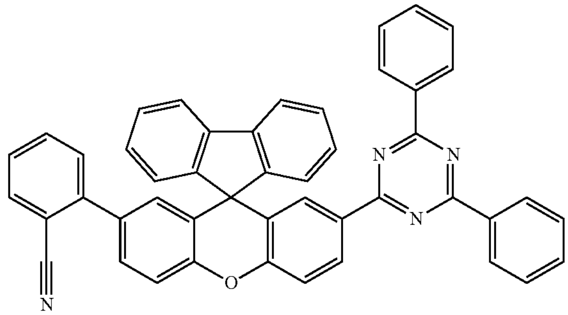
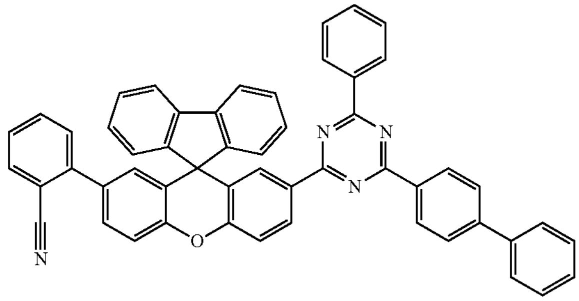
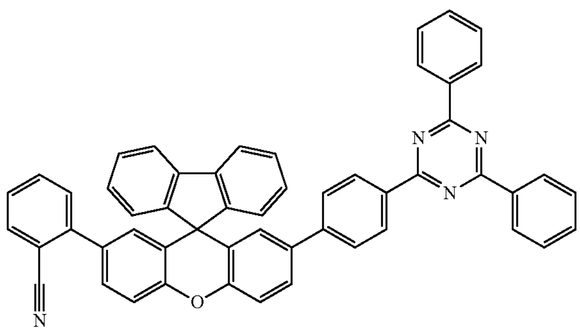
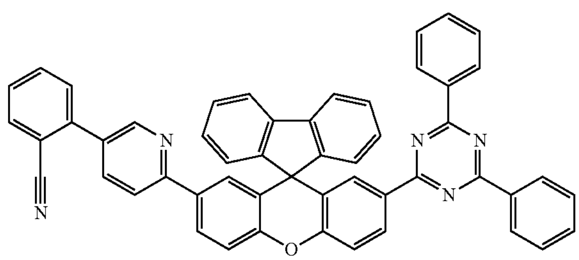
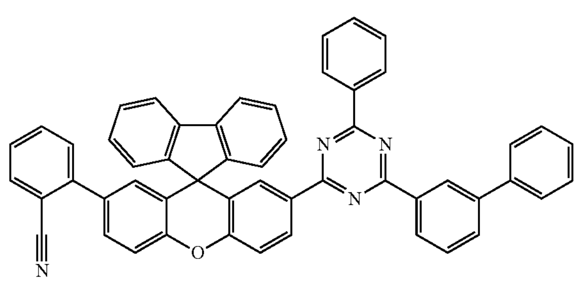
-continued
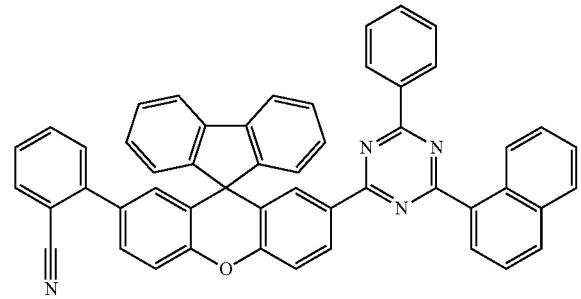
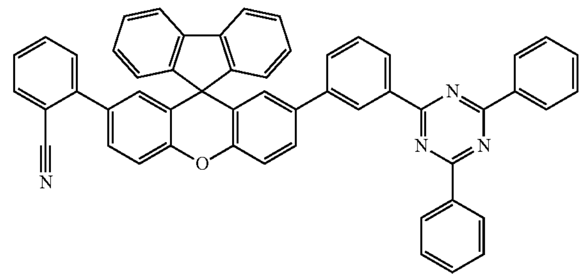
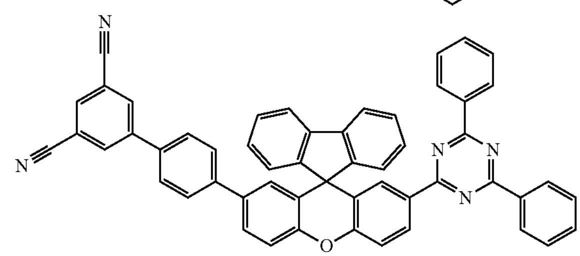
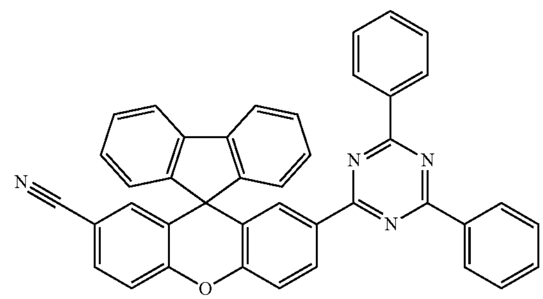
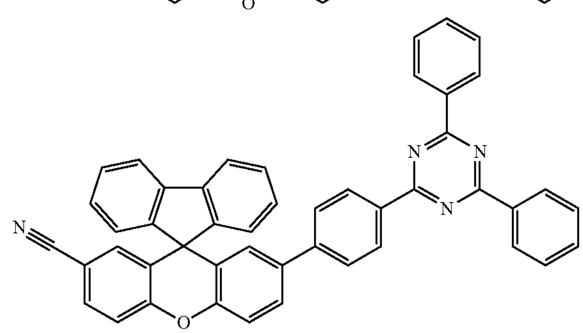
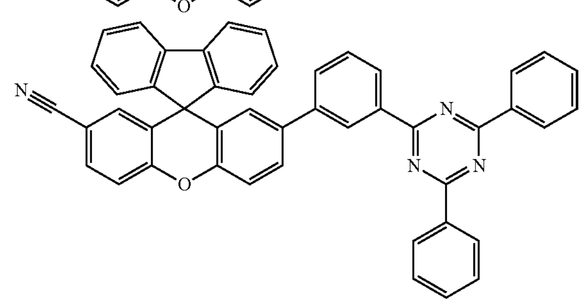

-continued
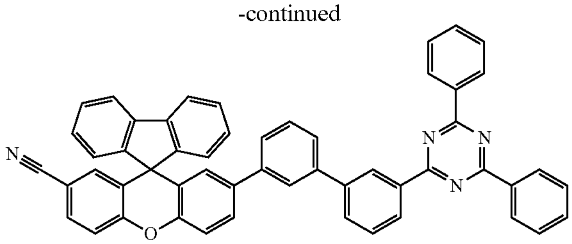
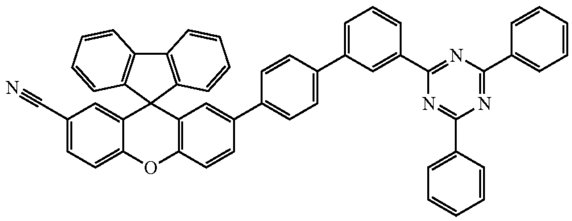
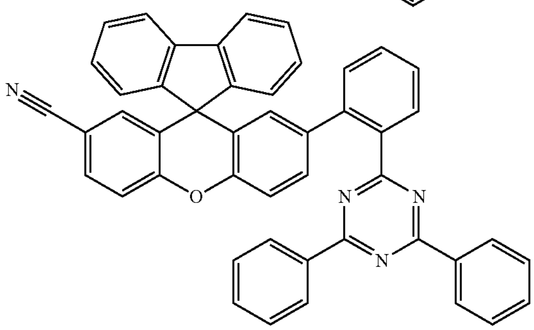
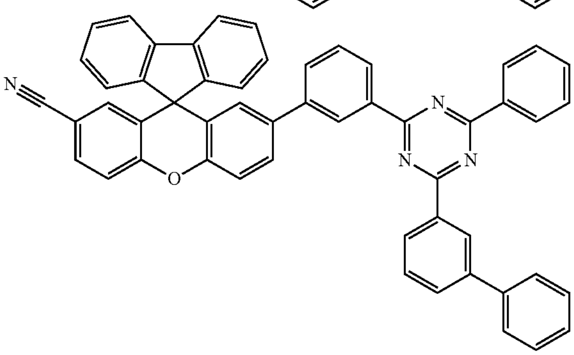
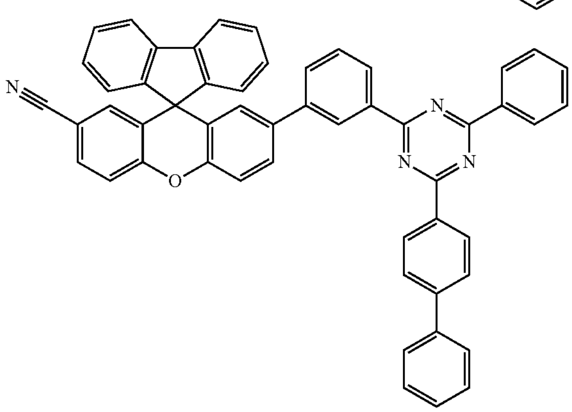
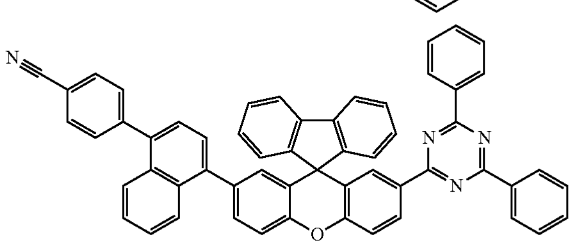
-continued
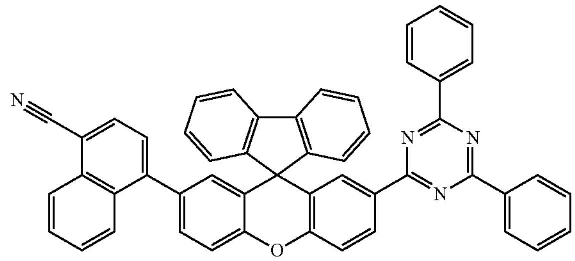
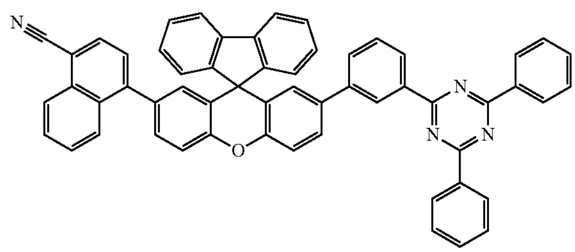
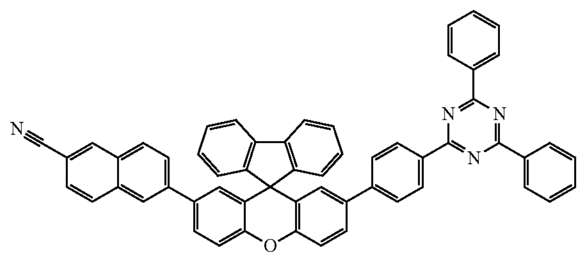
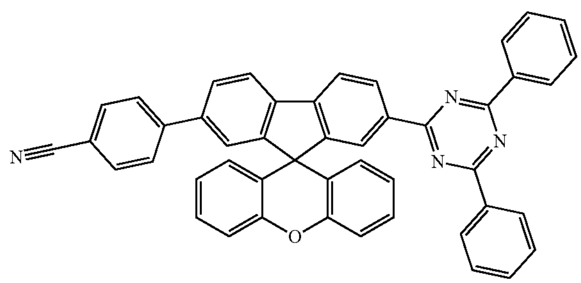
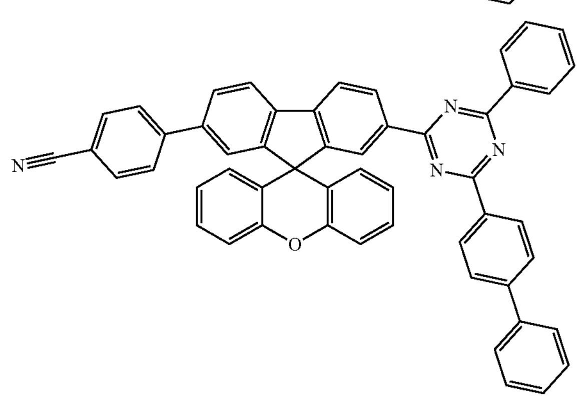
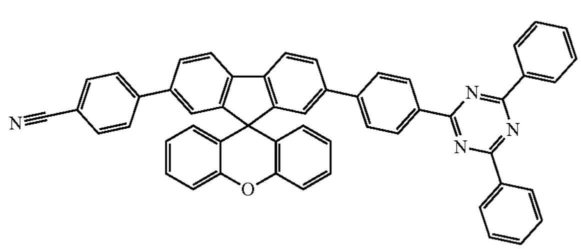

-continued
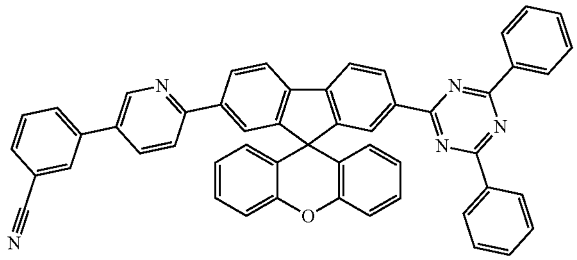
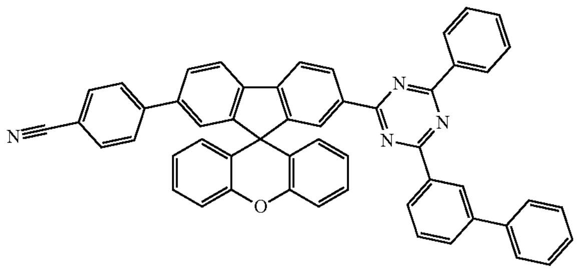
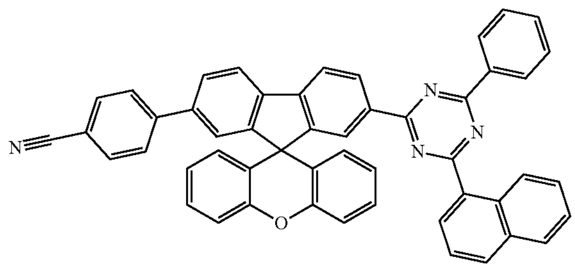
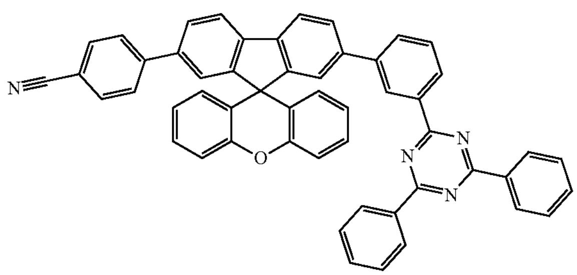
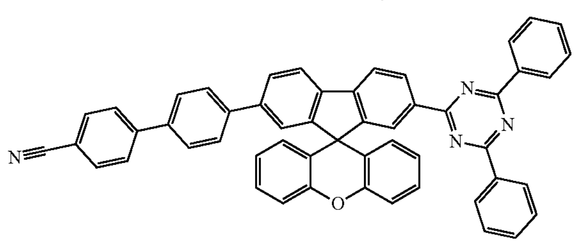
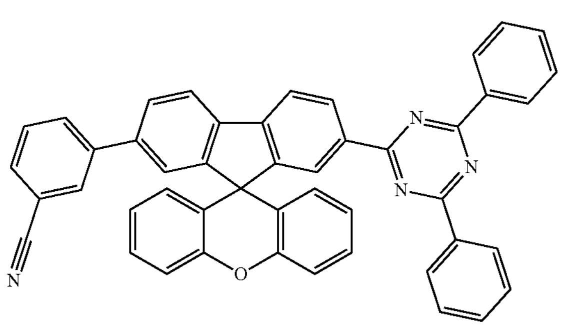
-continued
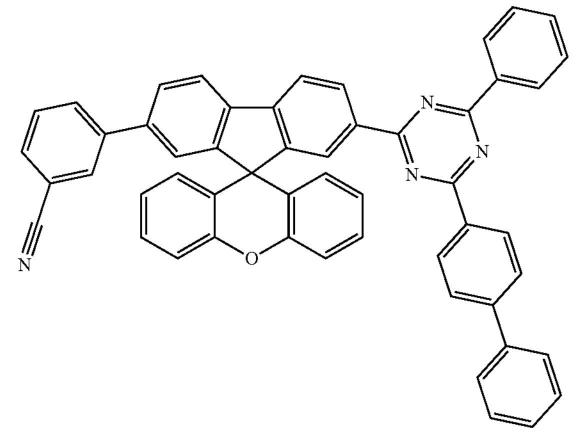
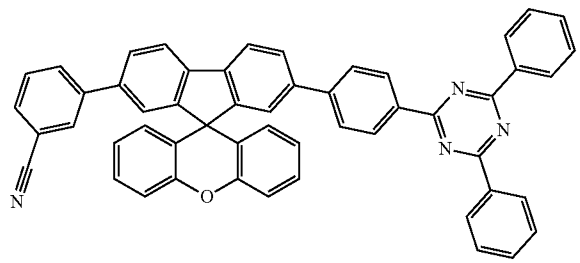
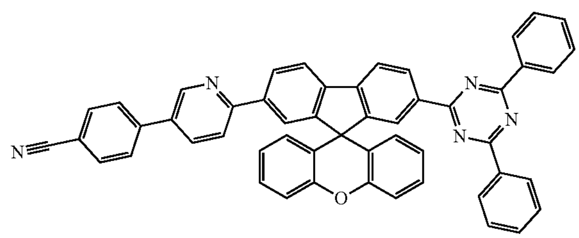
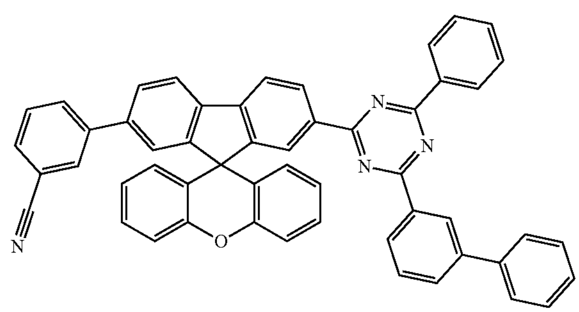
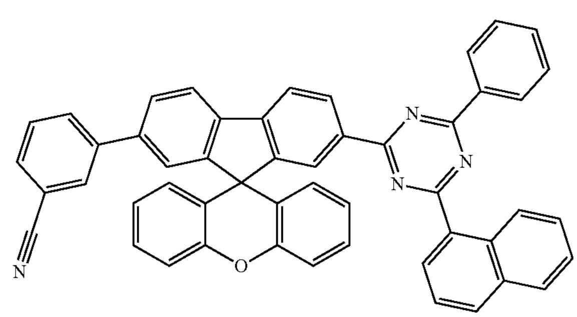

-continued
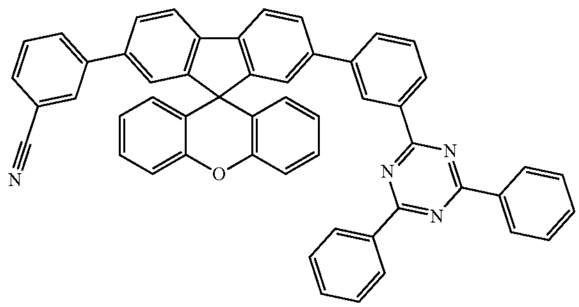
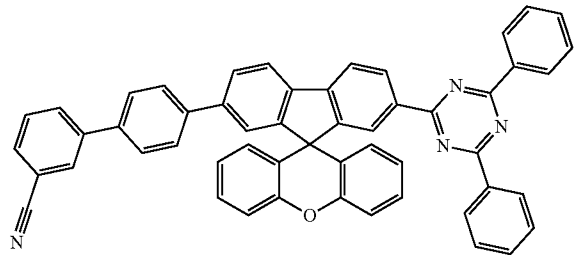
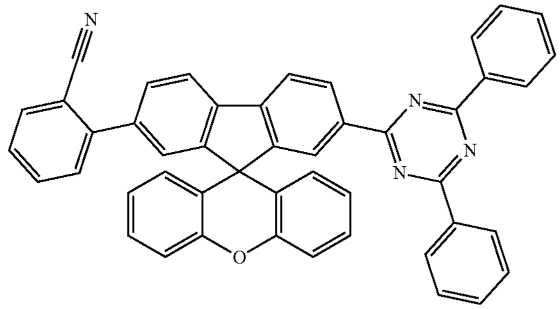
-continued
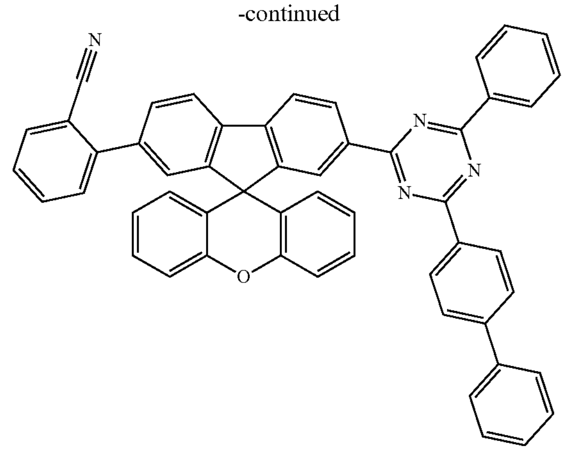
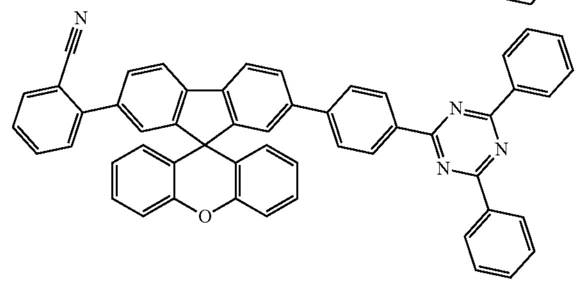
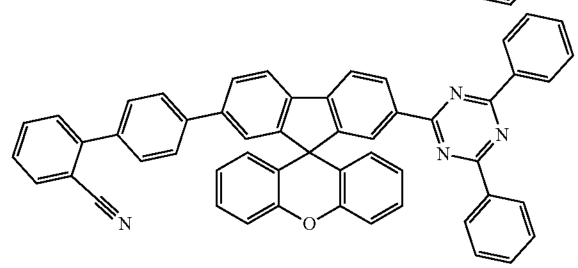
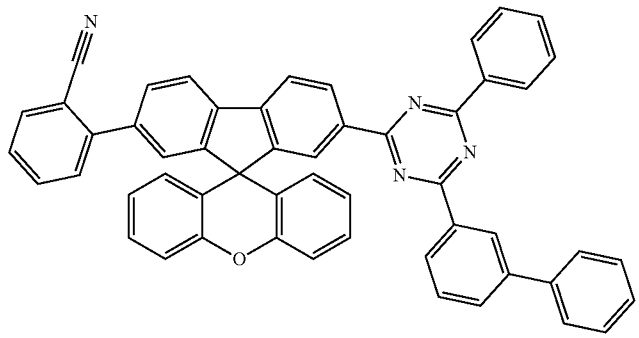
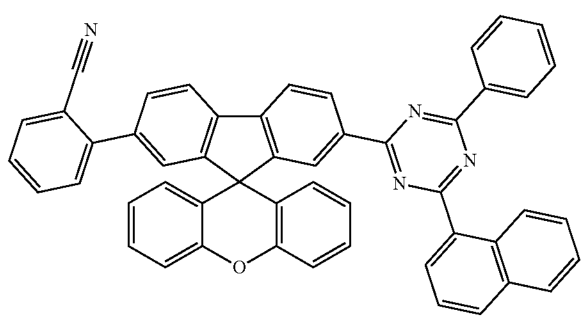

-continued
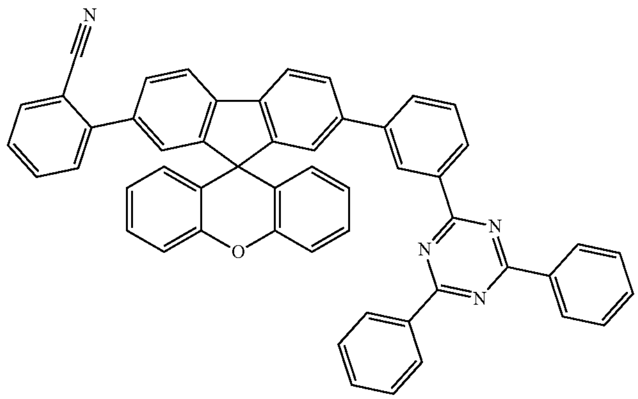
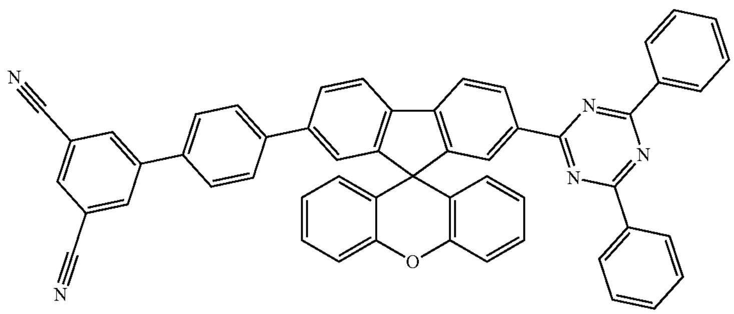
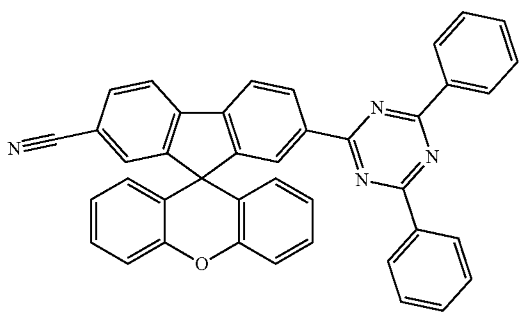
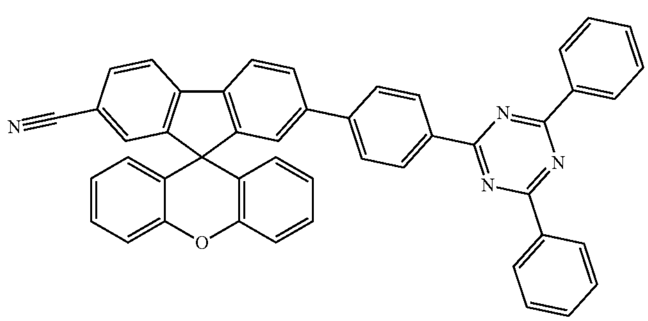
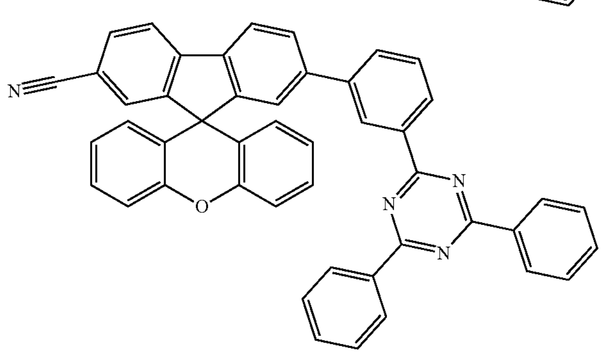

-continued
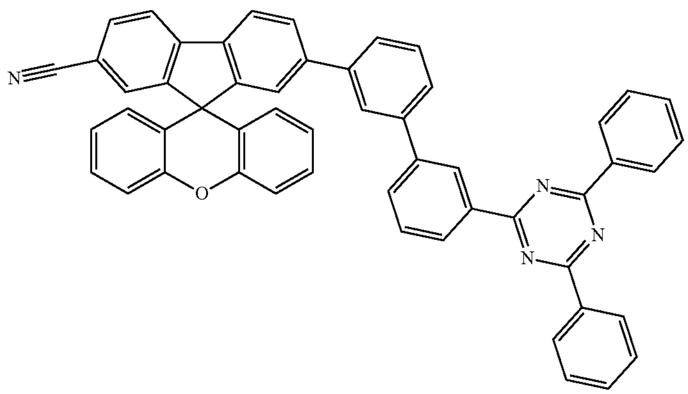
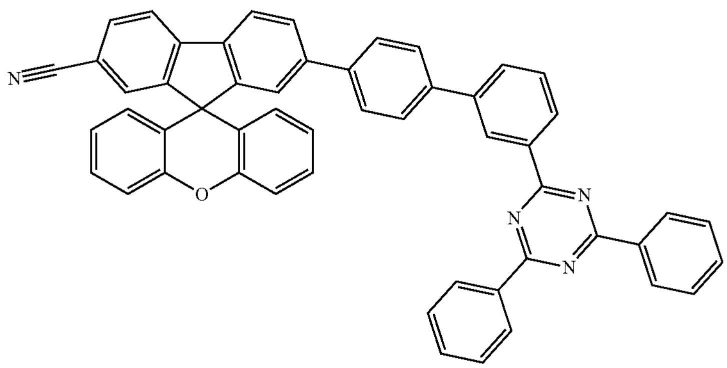
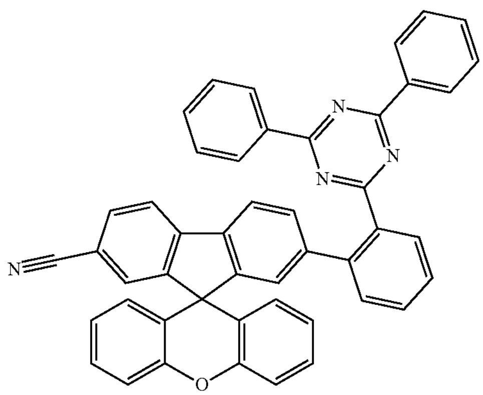
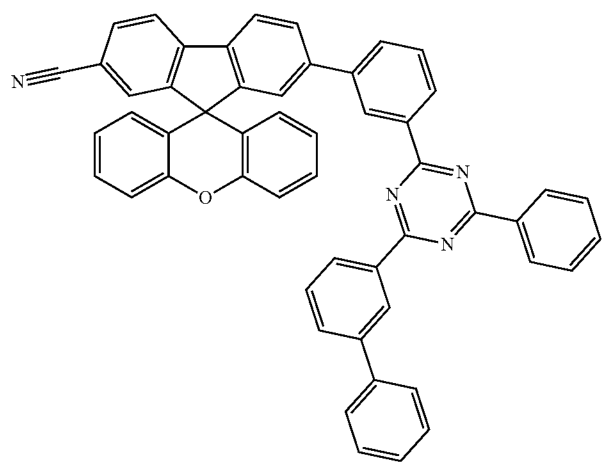
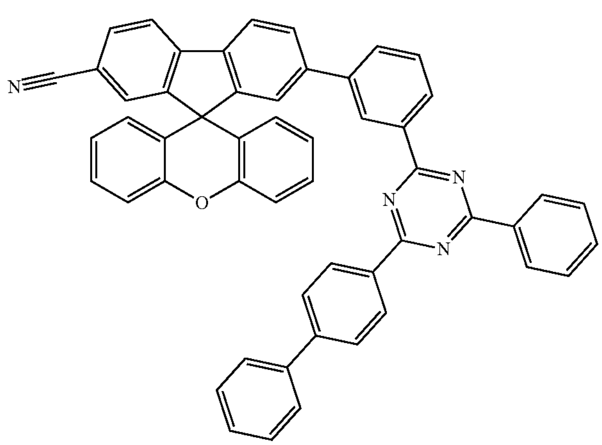

-continued
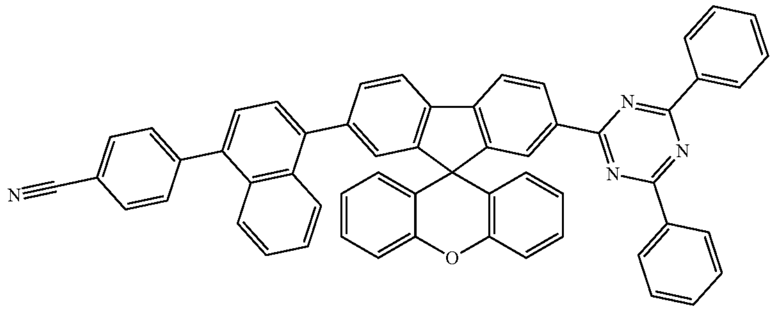
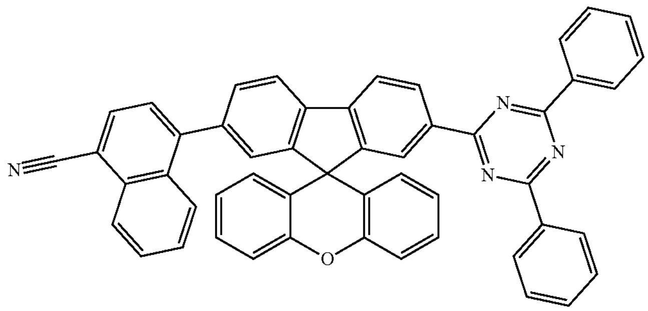
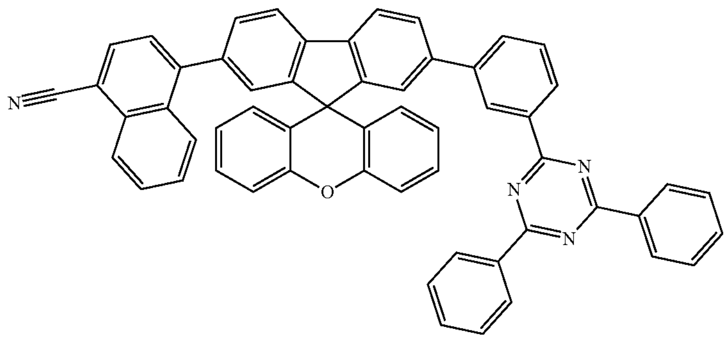
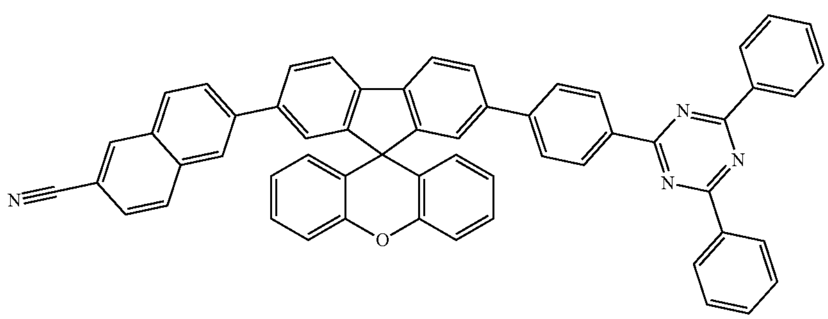
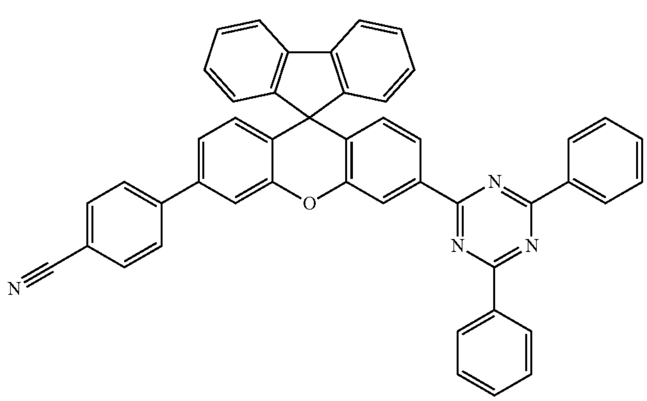

-continued
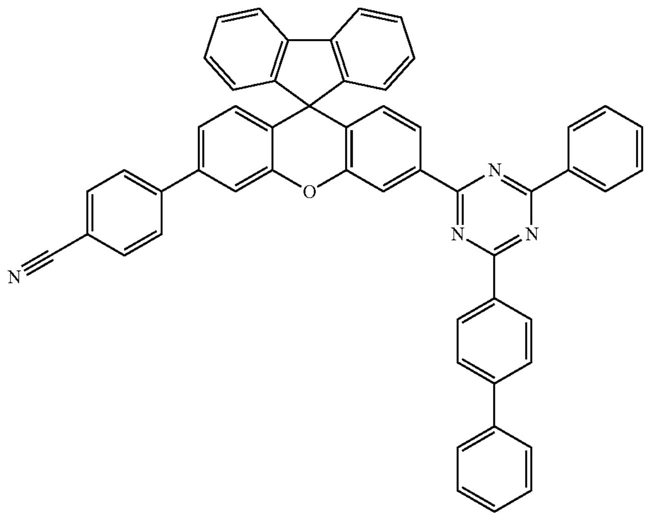
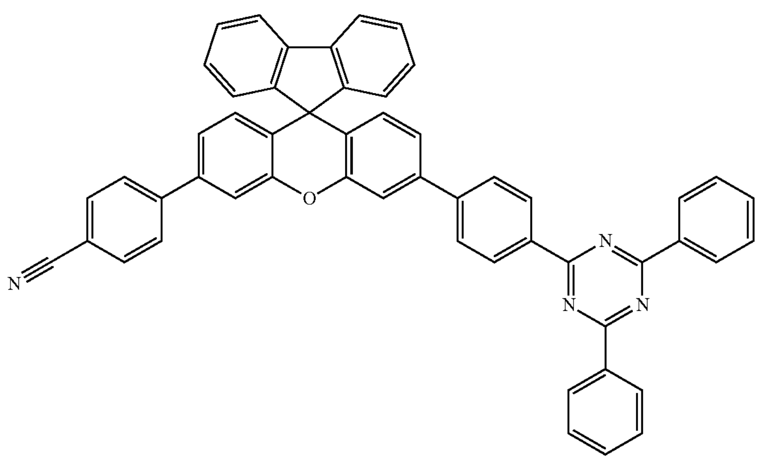
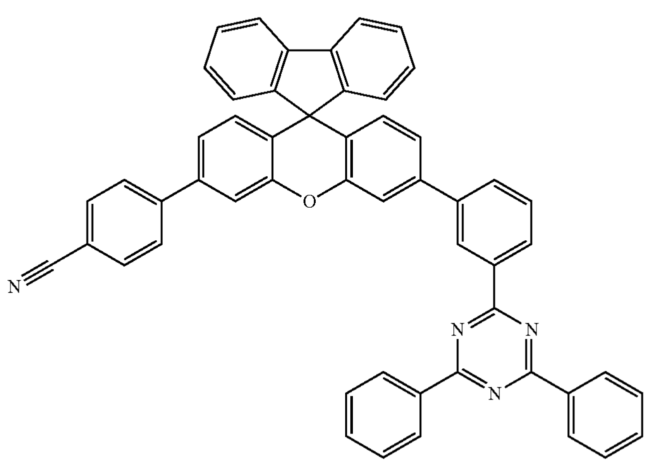

-continued
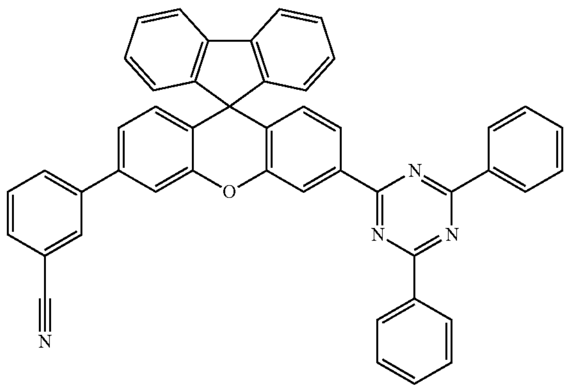
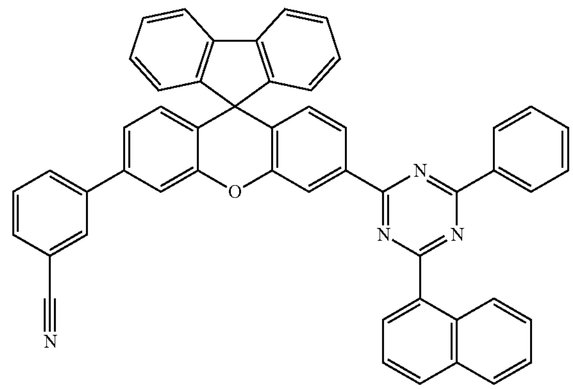
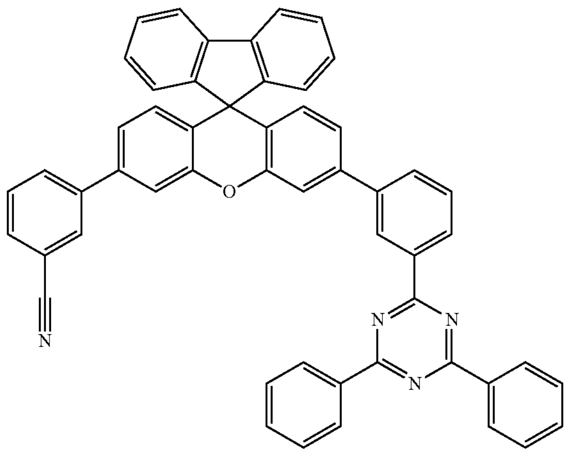
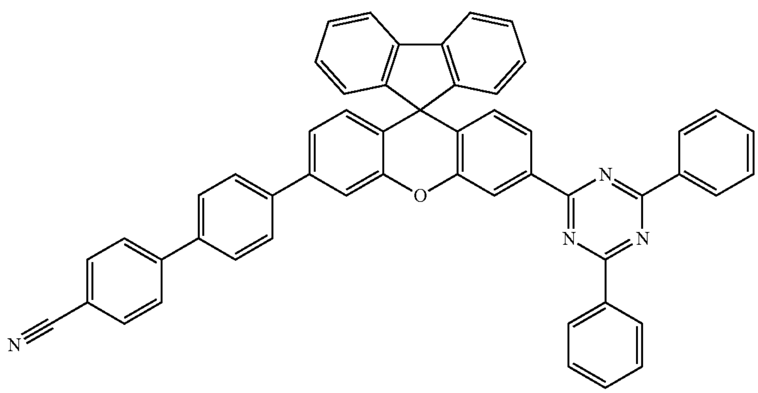
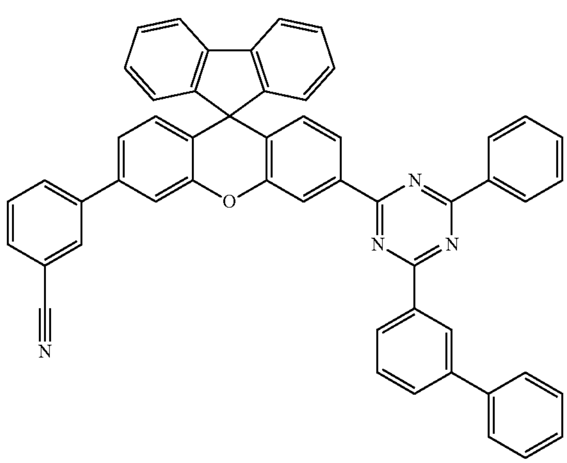
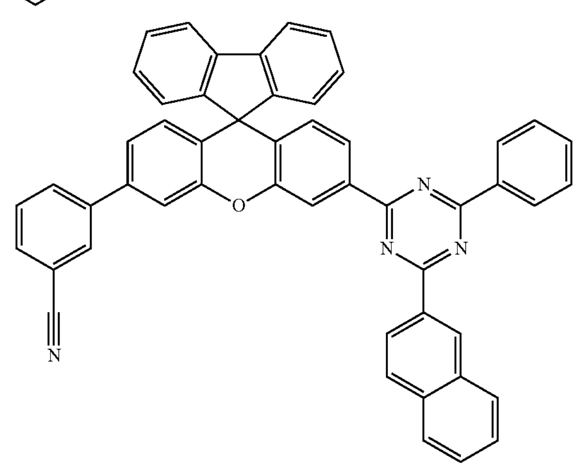

-continued
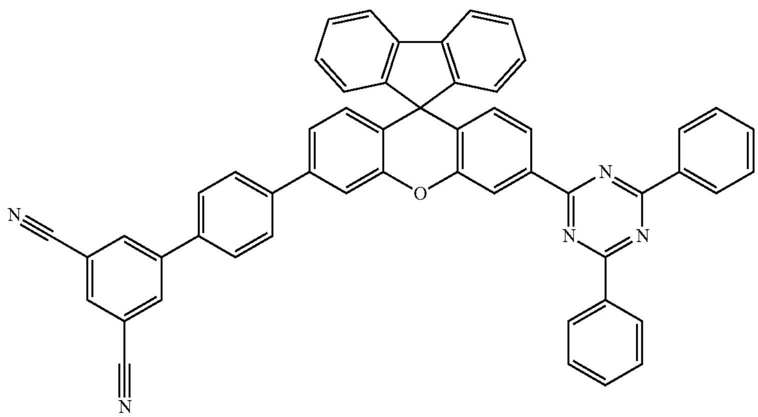
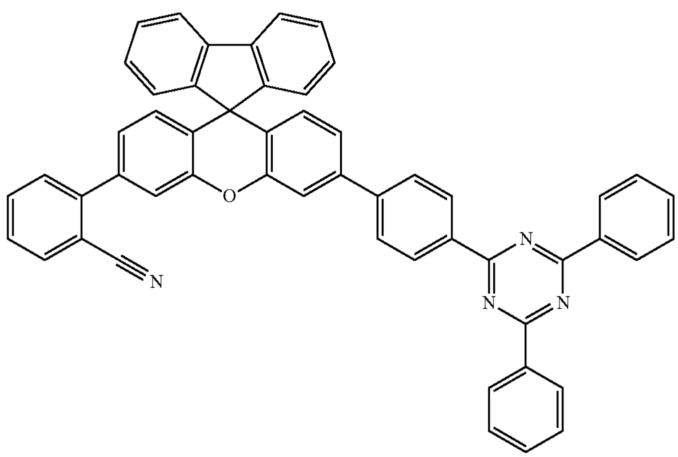
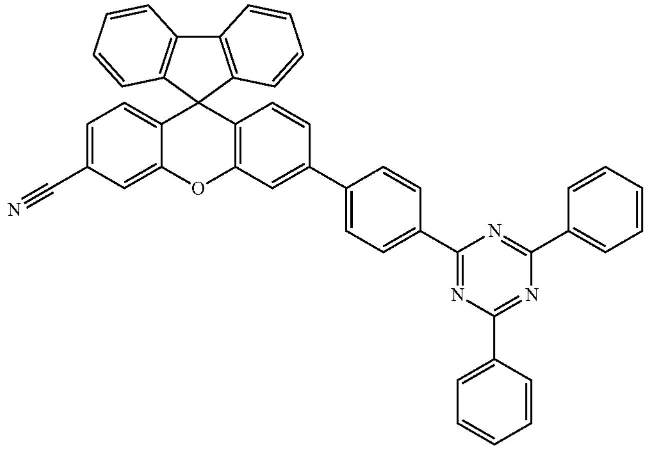

-continued
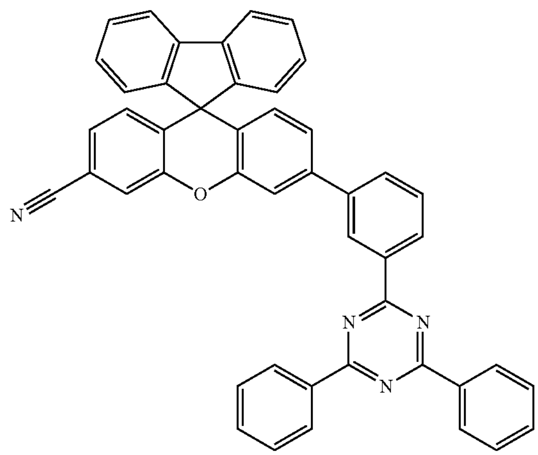
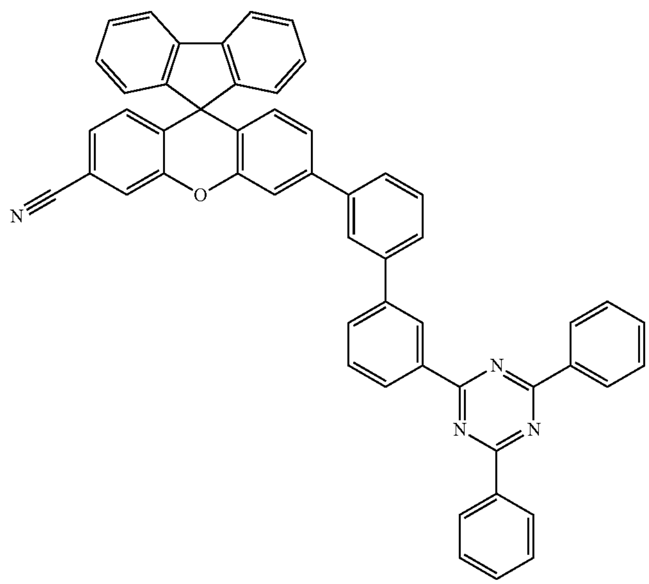
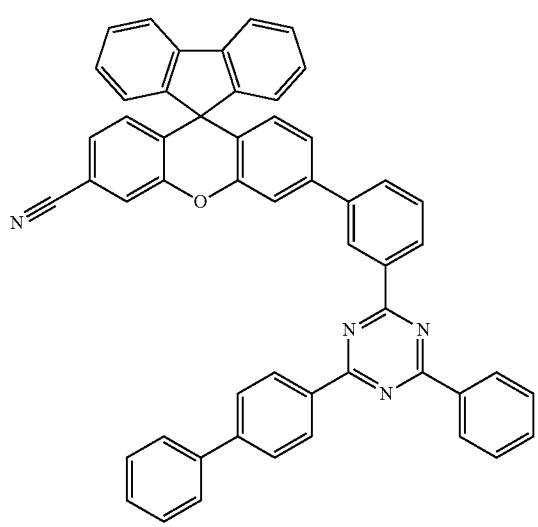

-continued
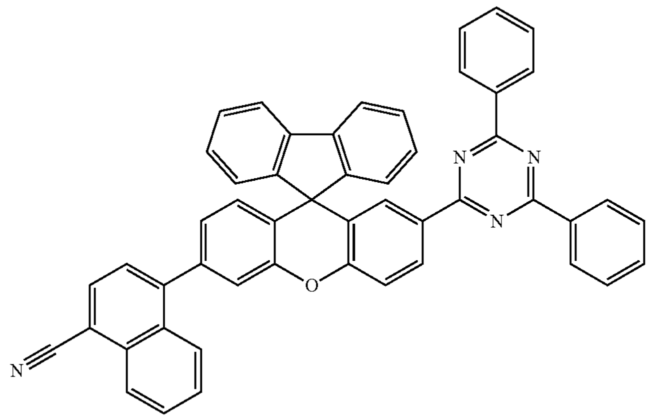
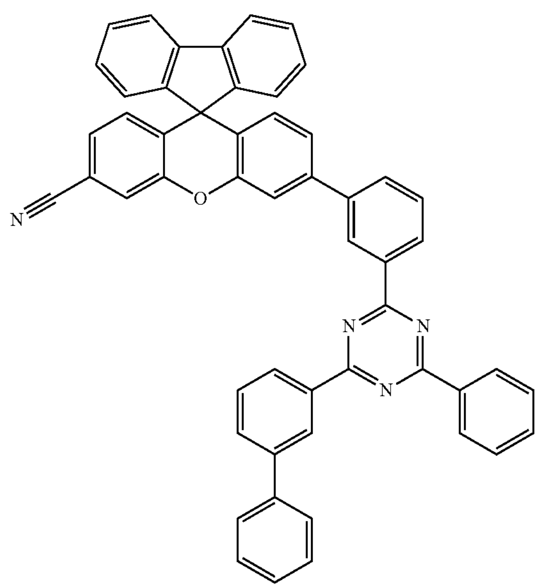
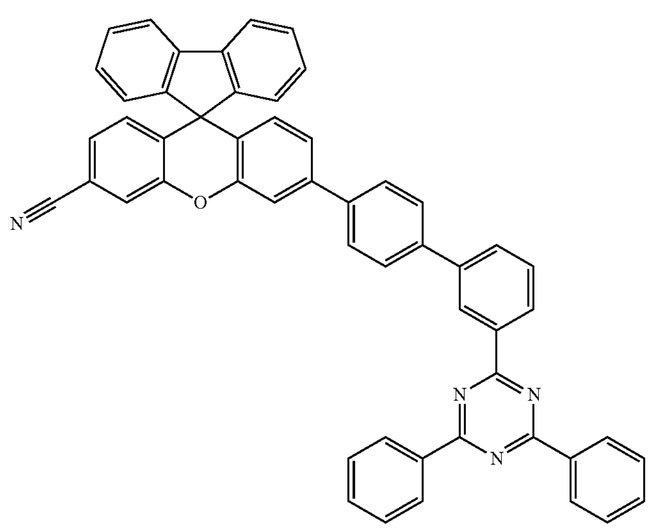

-continued
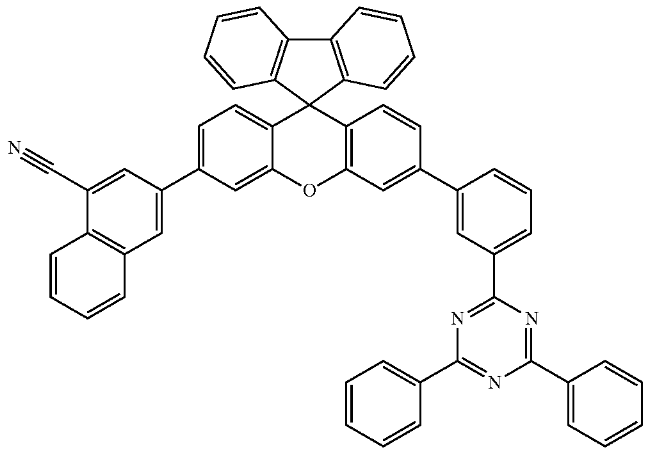
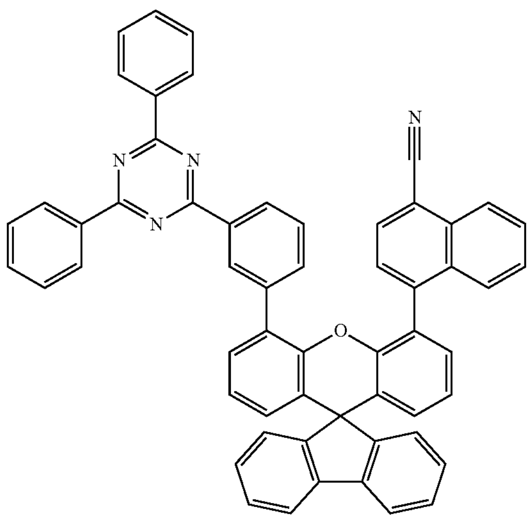
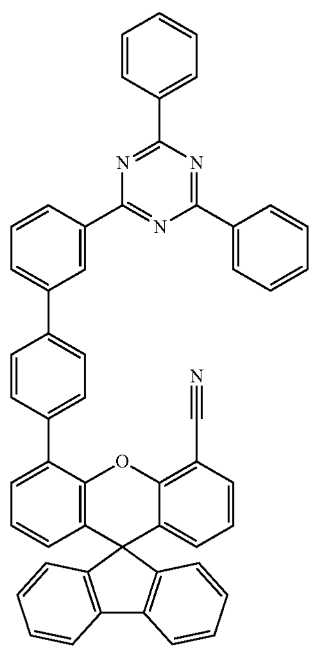

-continued
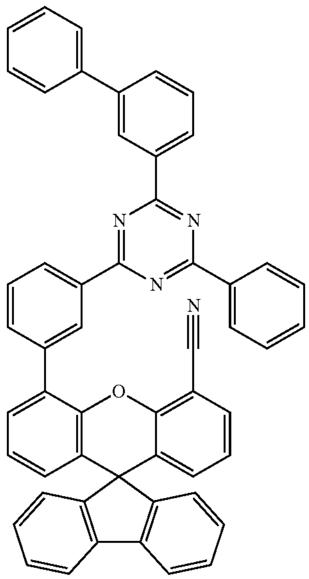
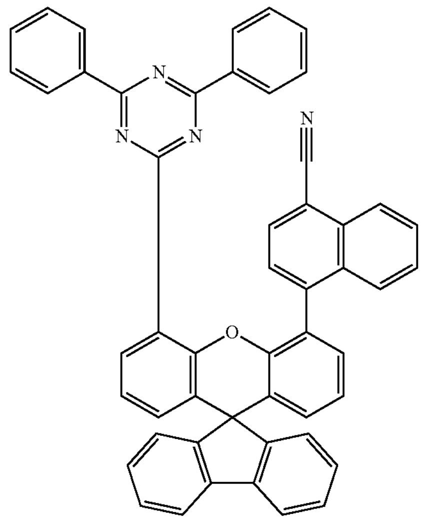
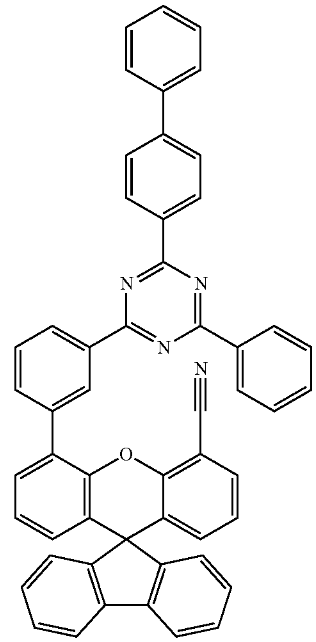
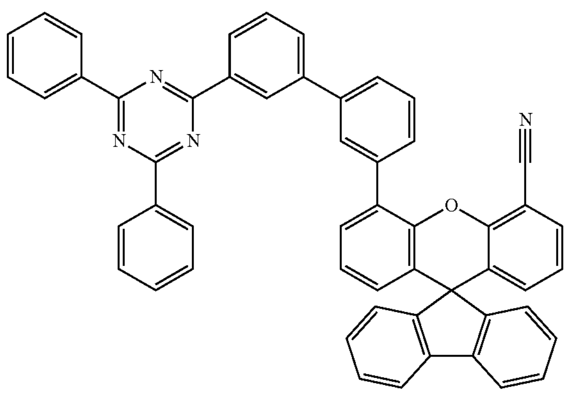
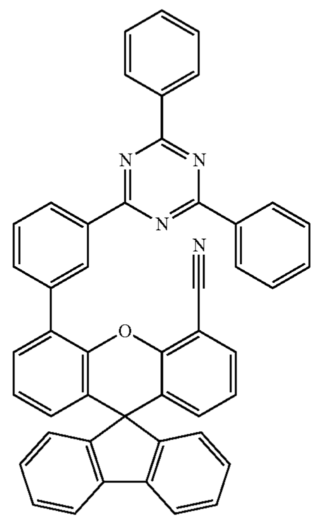
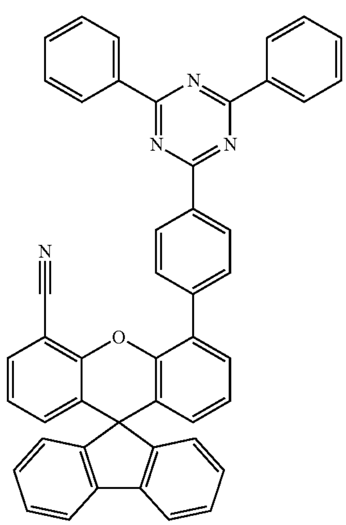
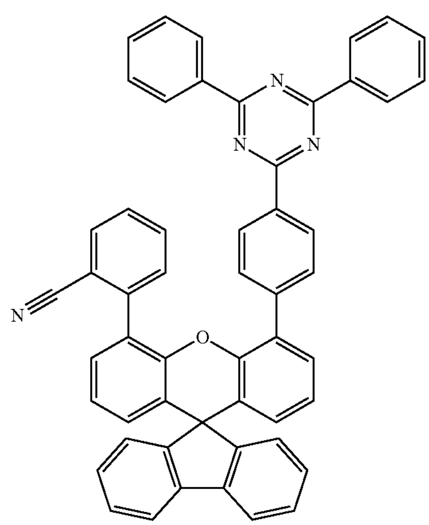

-continued
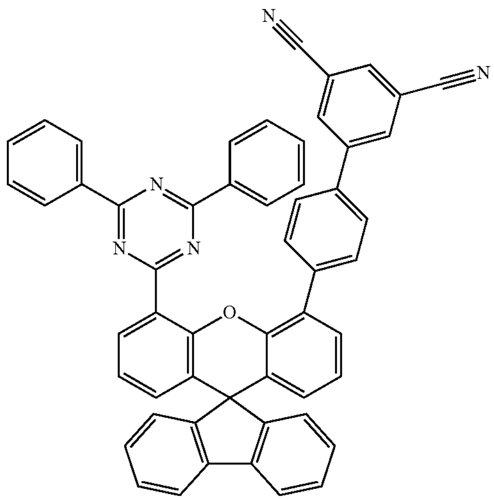
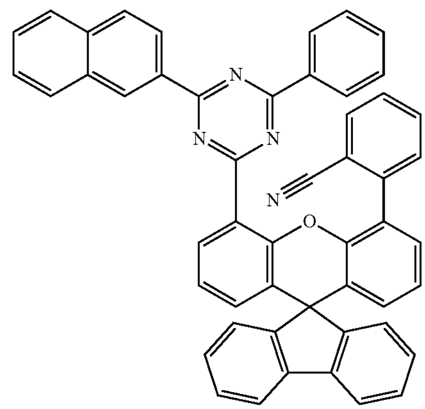
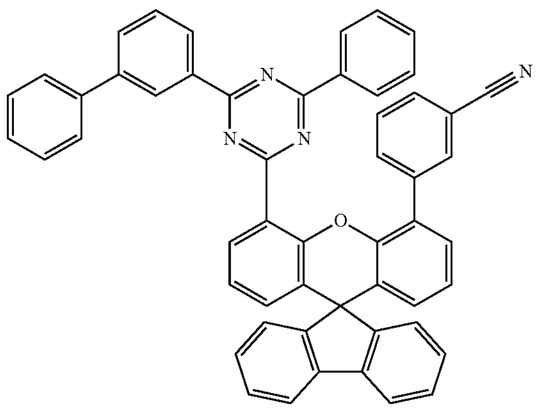
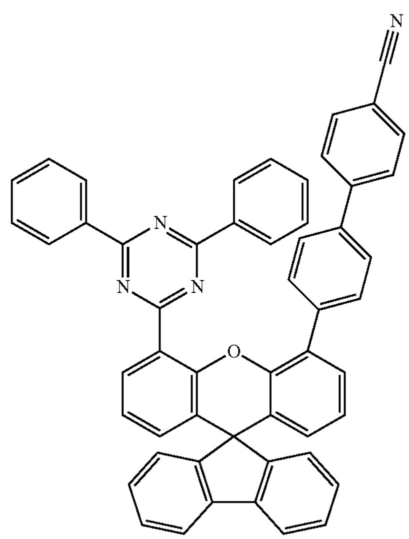
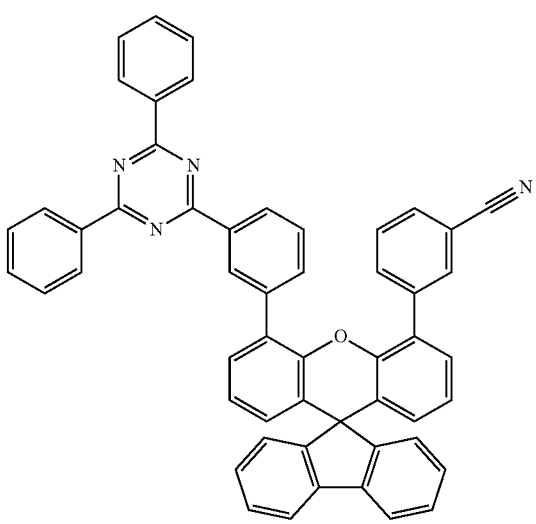
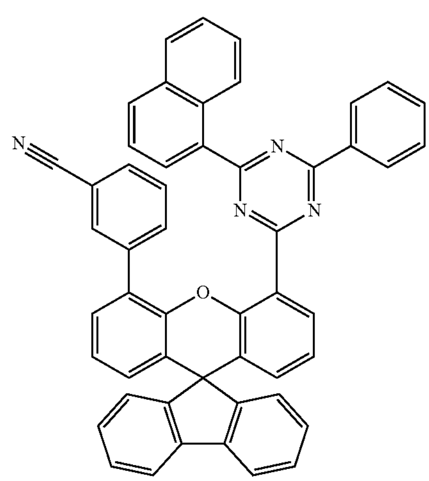

-continued
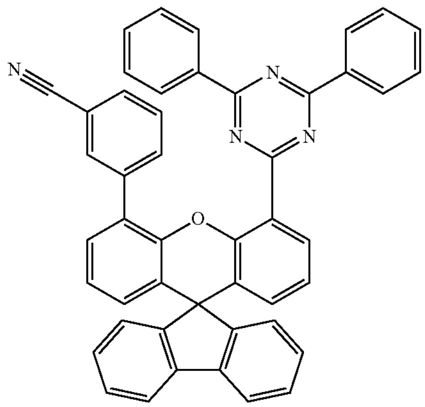
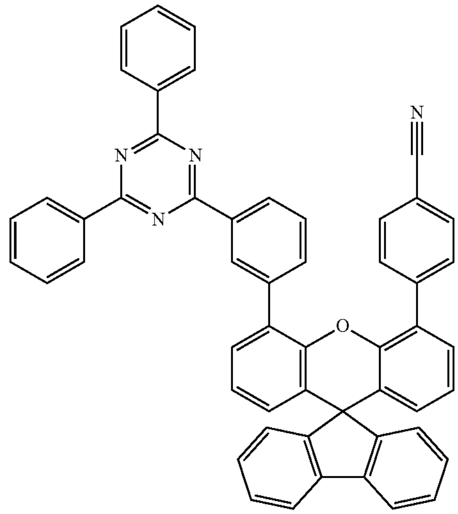
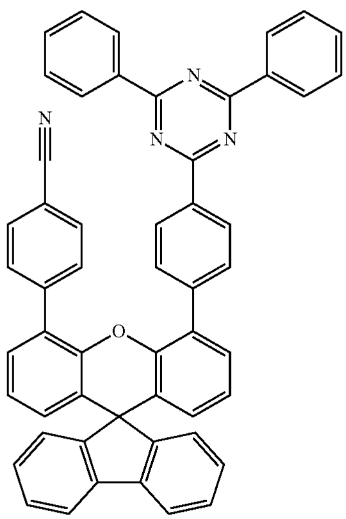
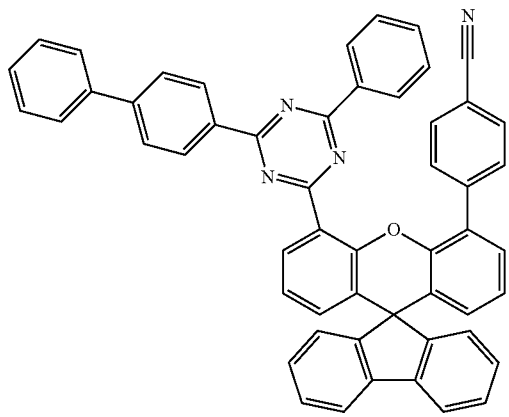
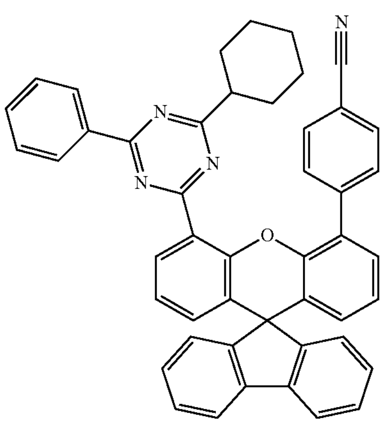
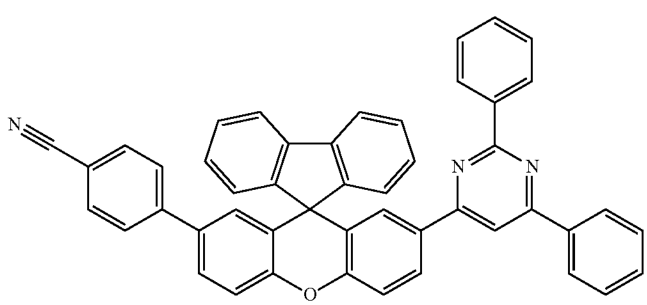

-continued
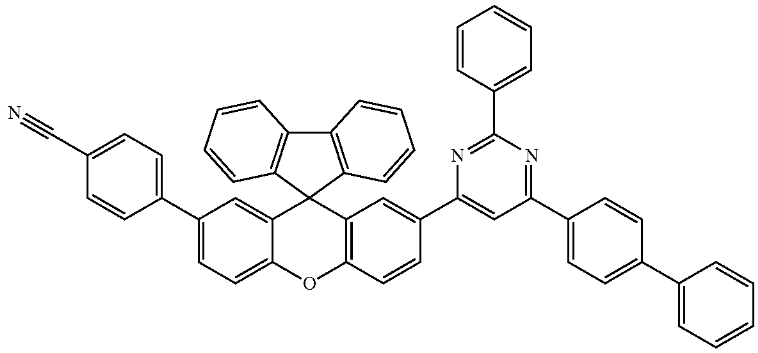
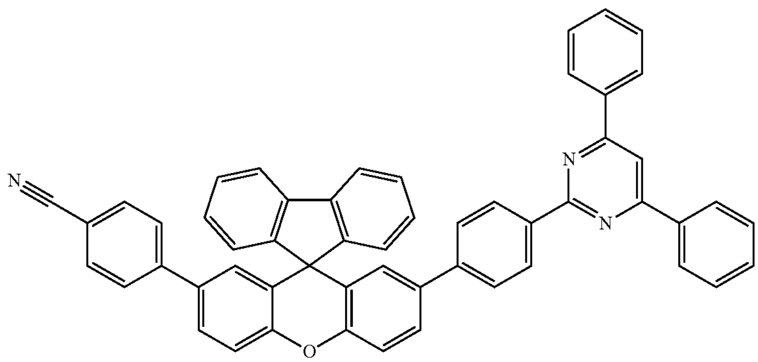
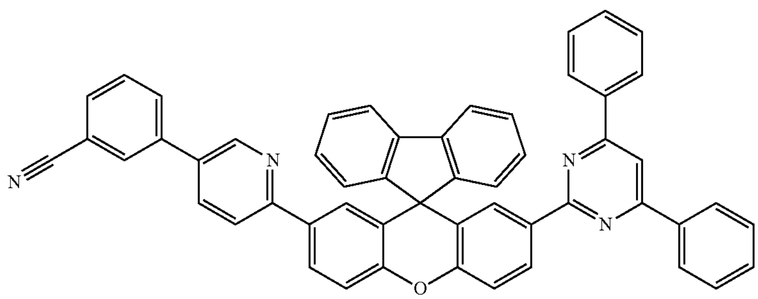
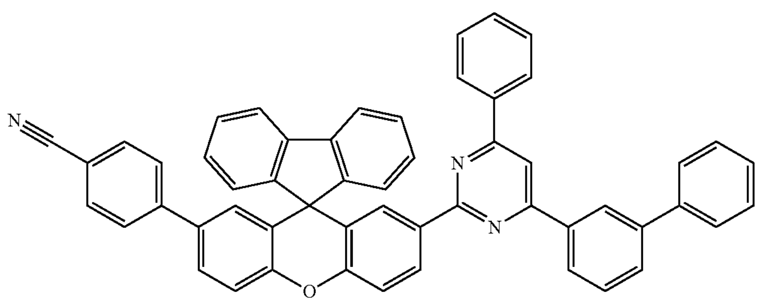
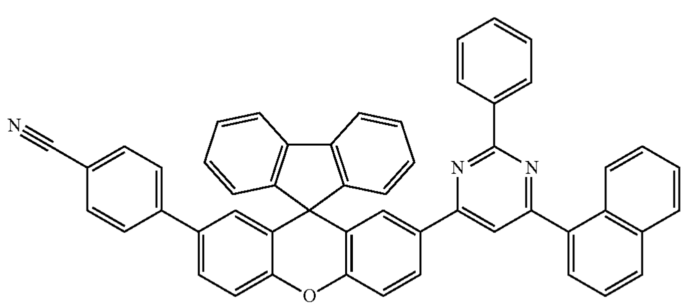

-continued
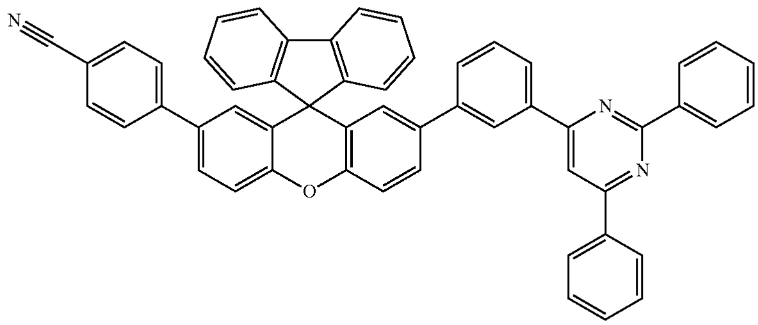
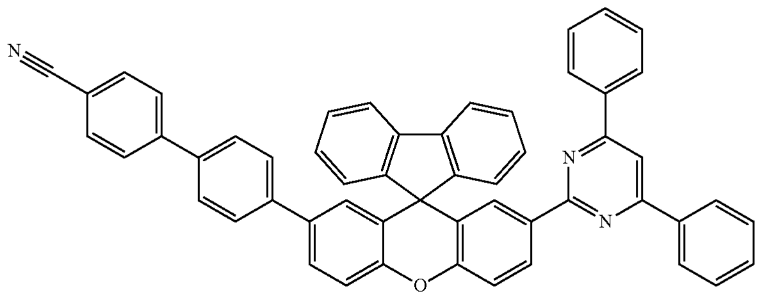
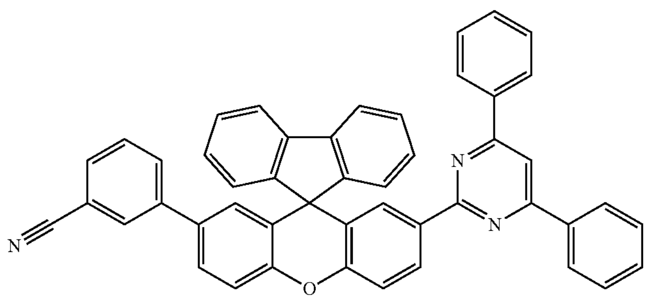
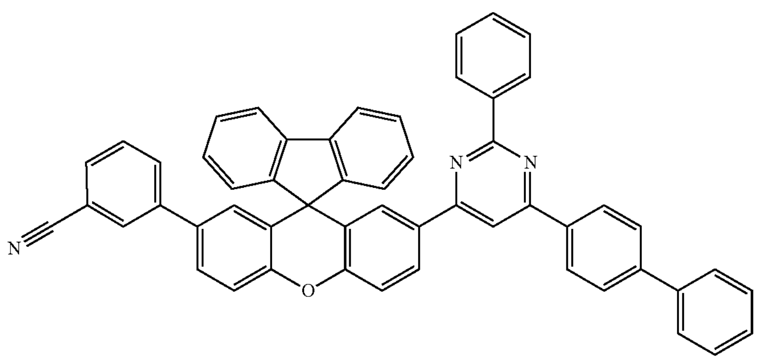
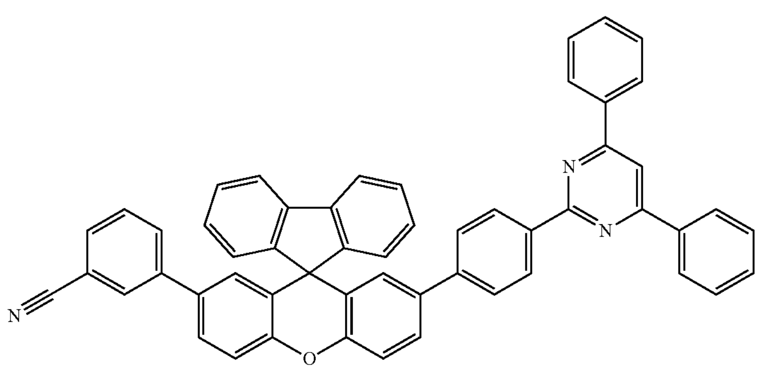

-continued
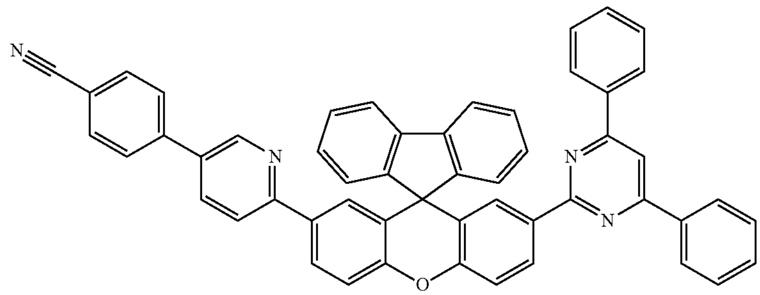
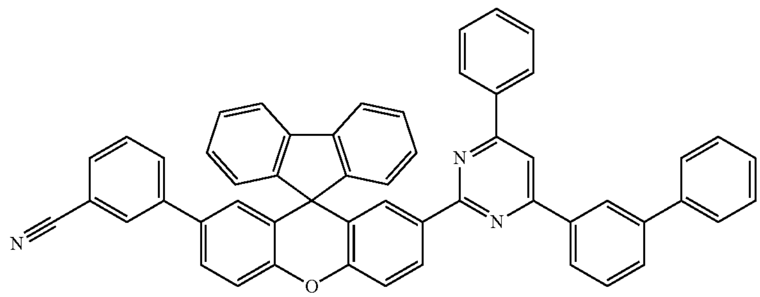
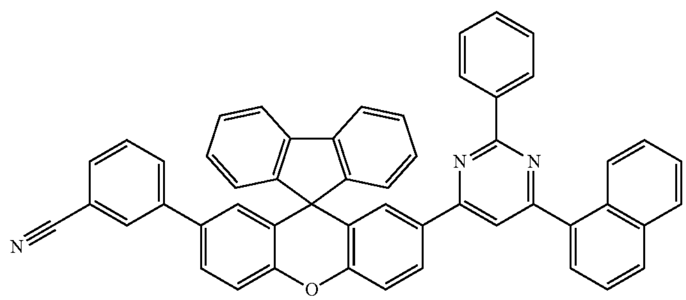
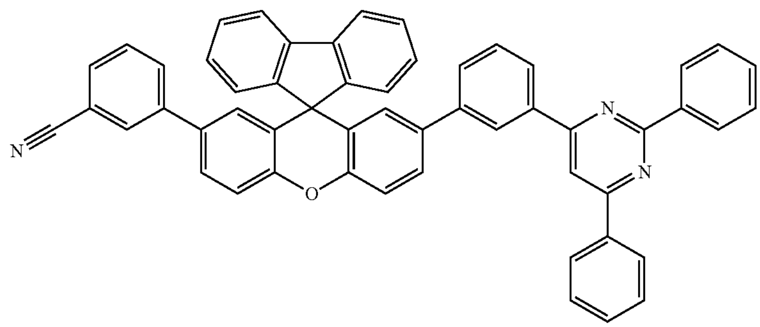
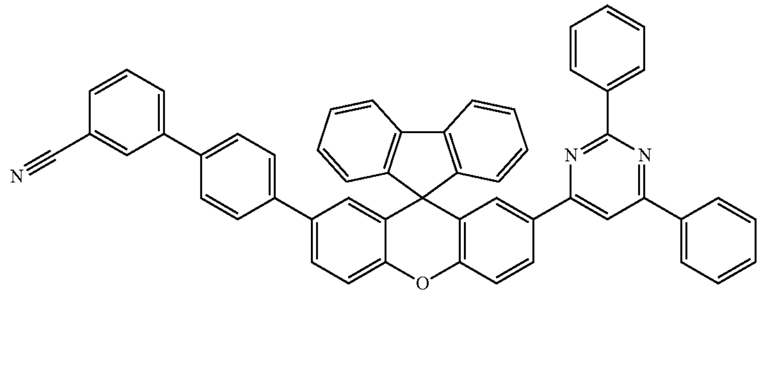

-continued
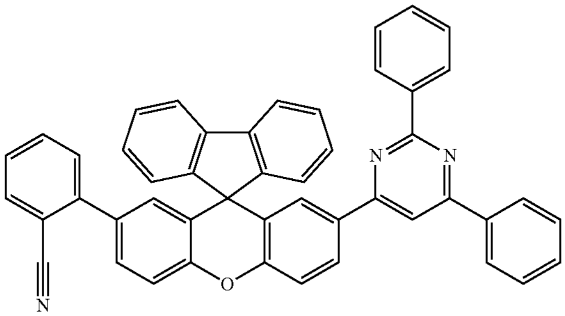
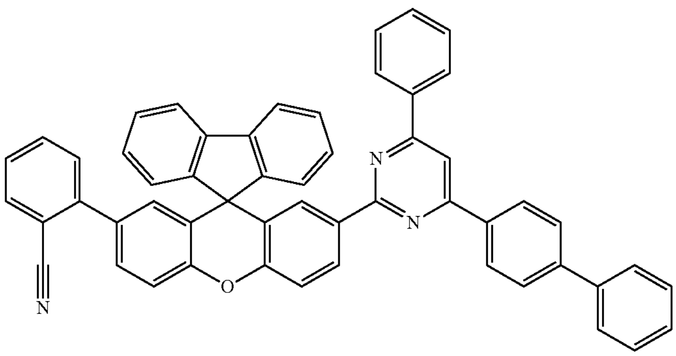
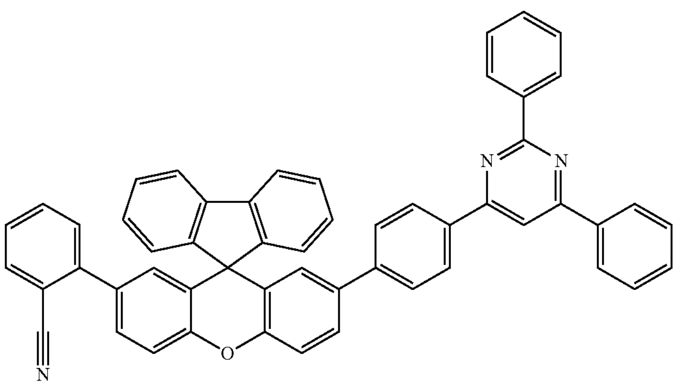
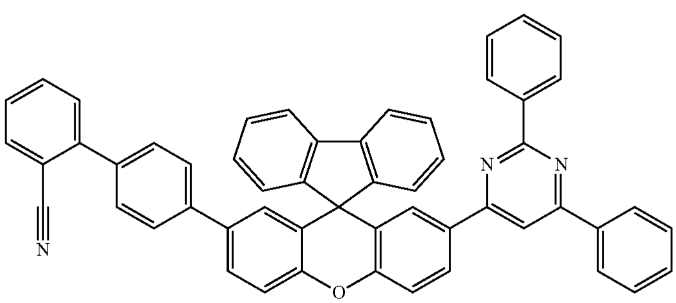
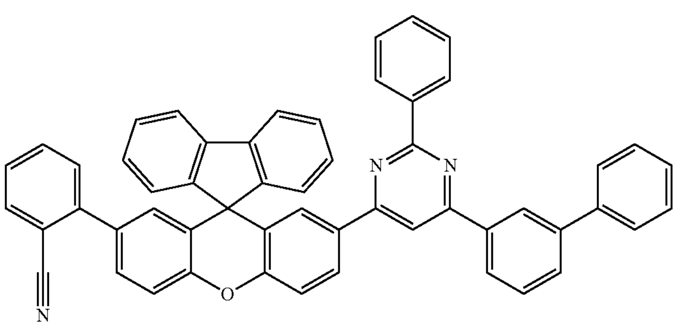

-continued
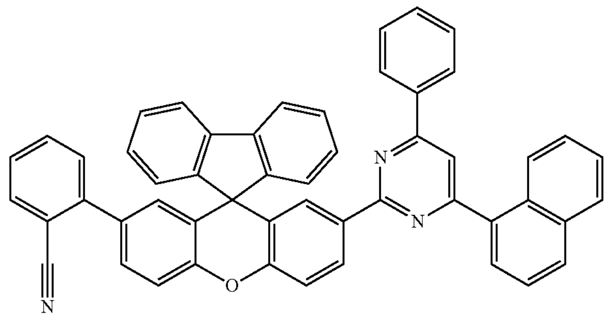
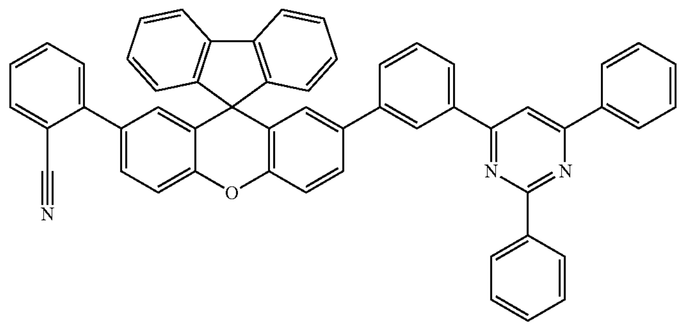
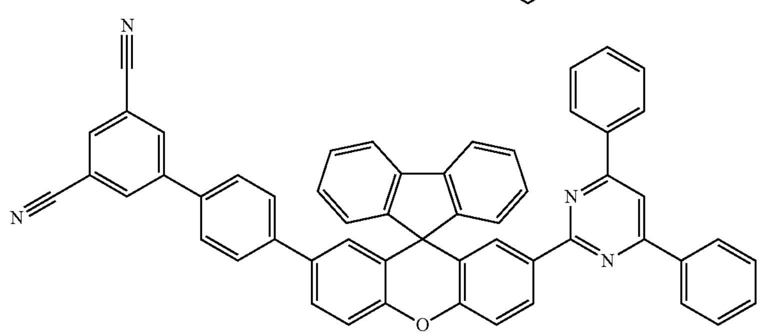
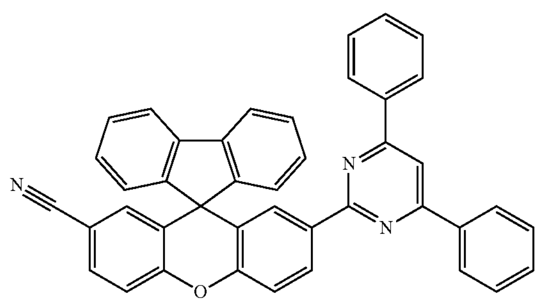
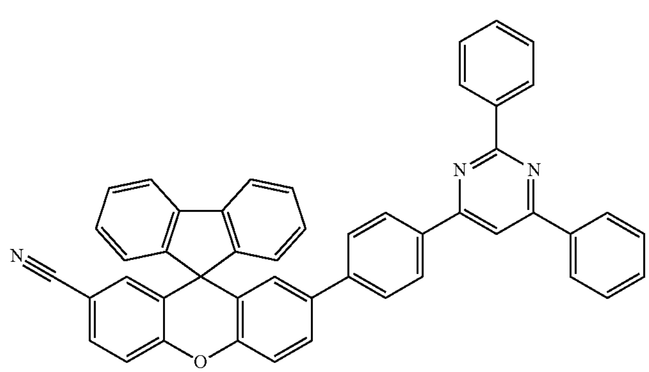

-continued
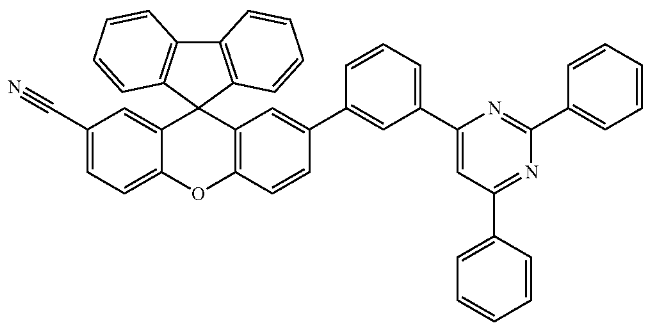
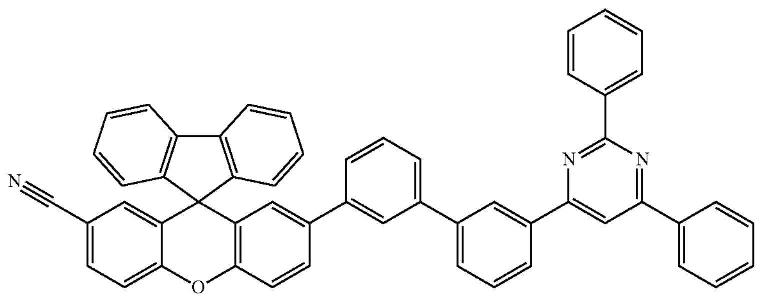
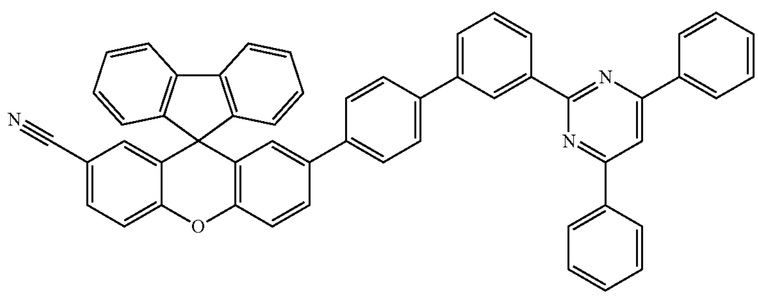
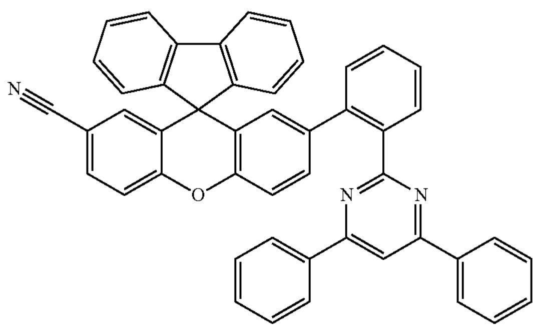
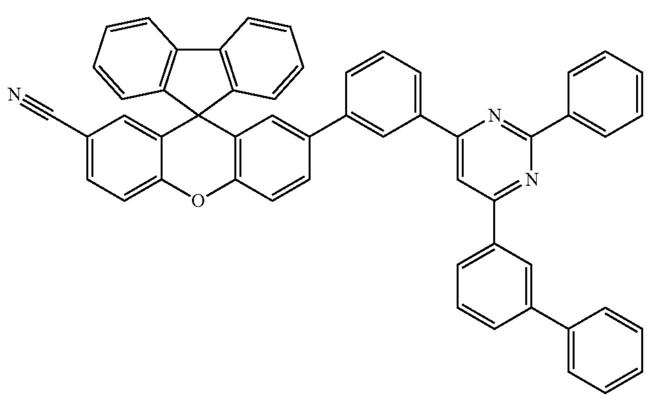

-continued
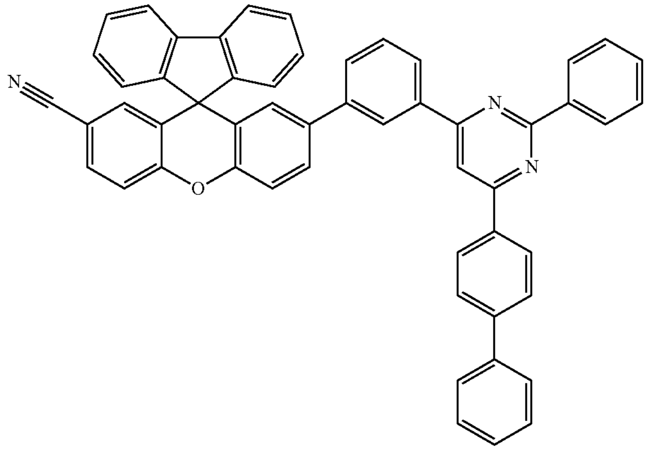
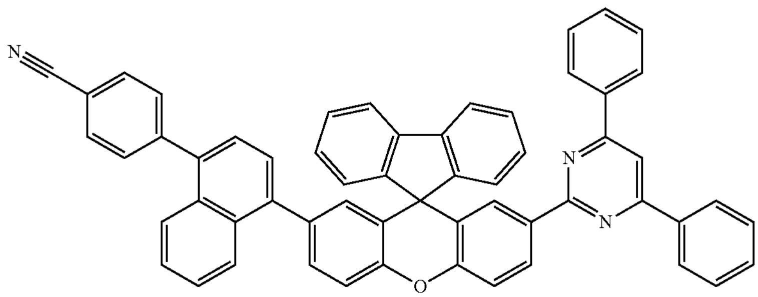
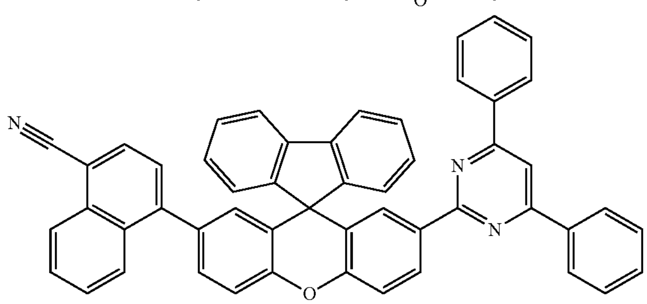
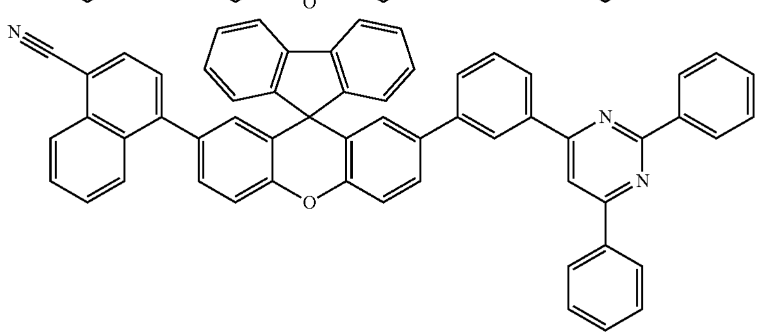
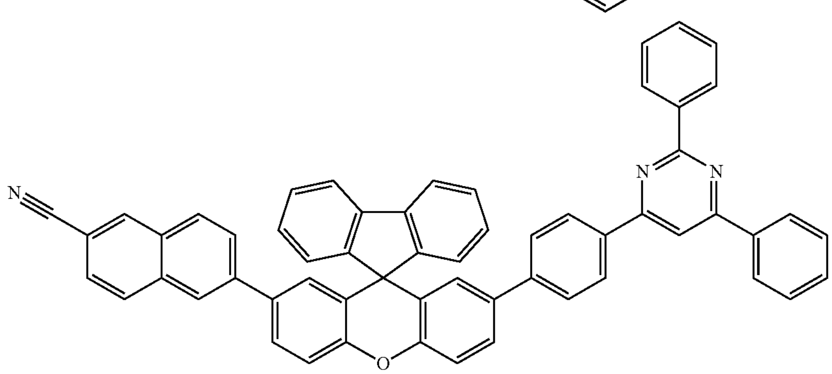

-continued
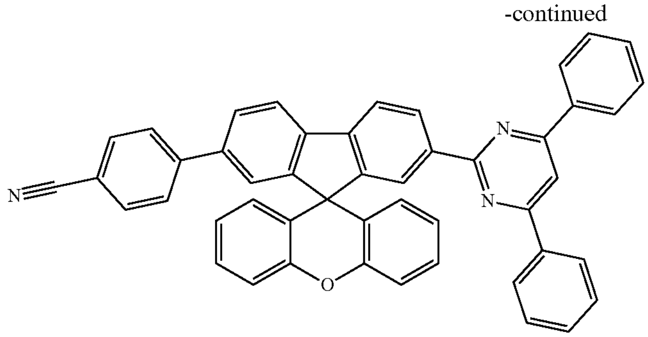
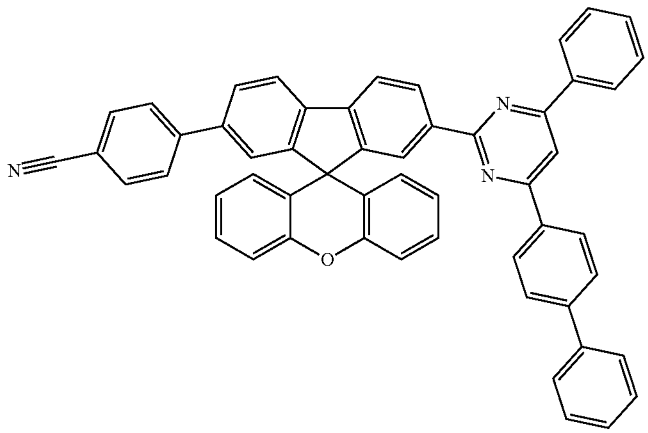
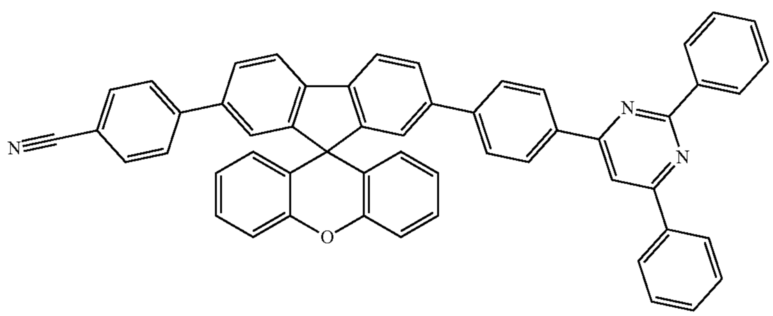
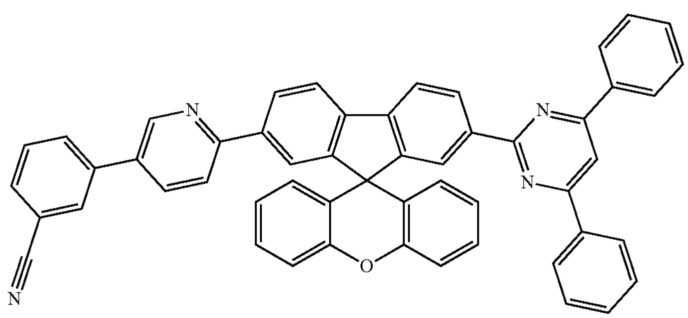
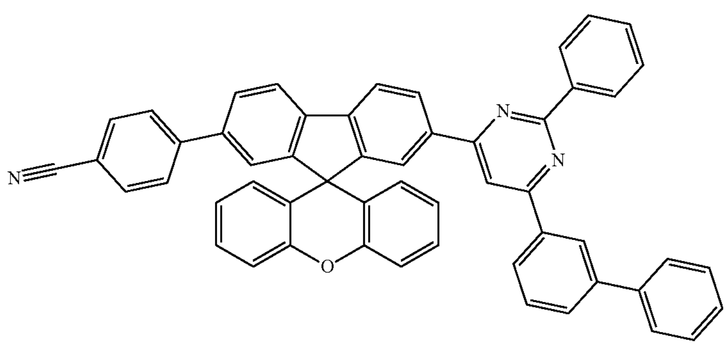

-continued
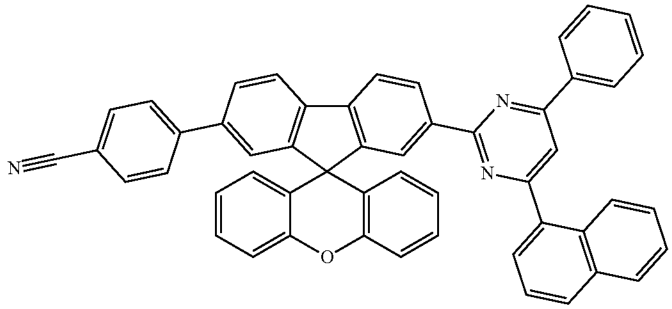
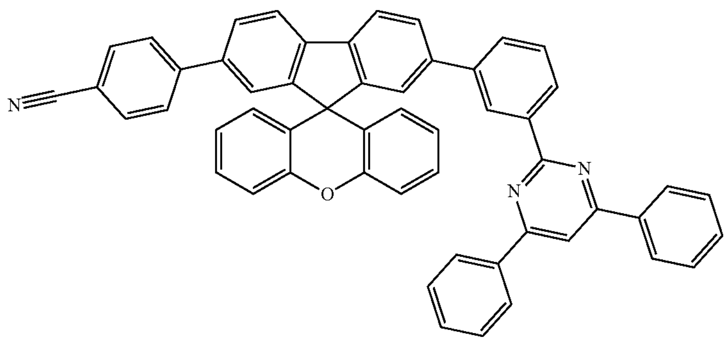
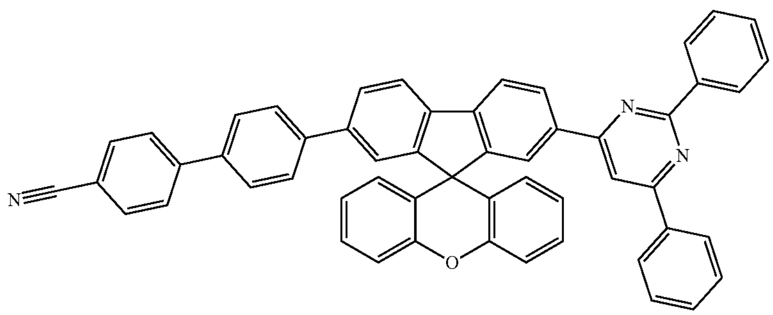
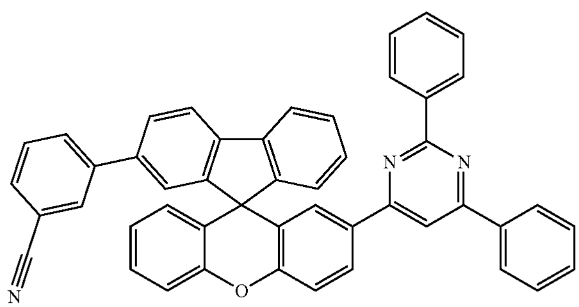
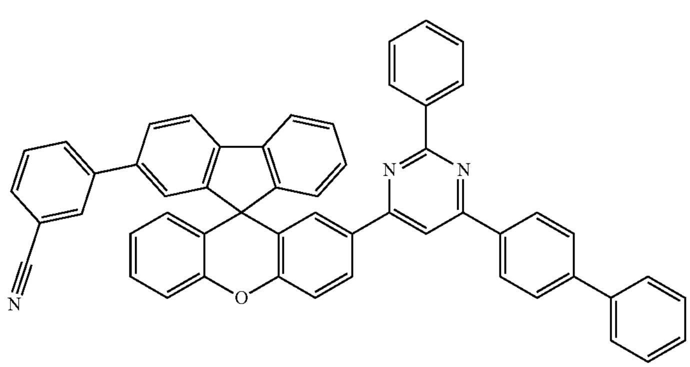

-continued
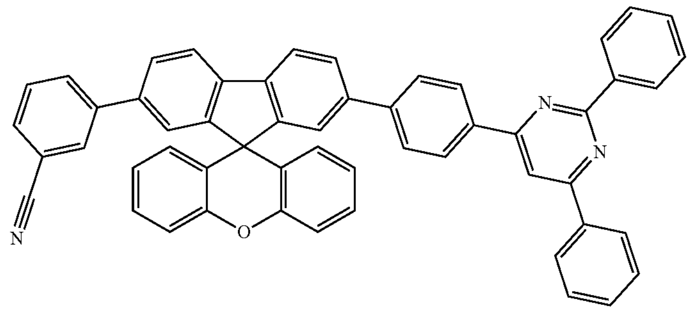
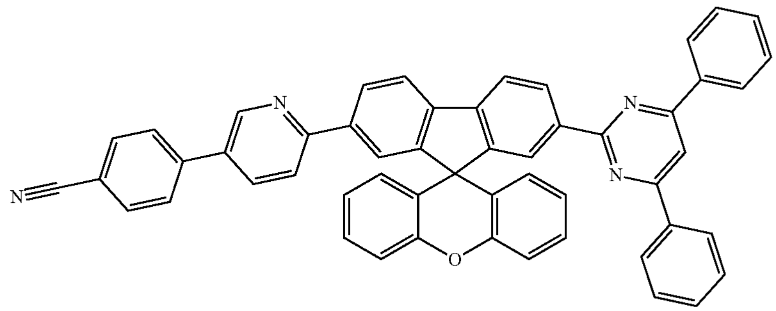
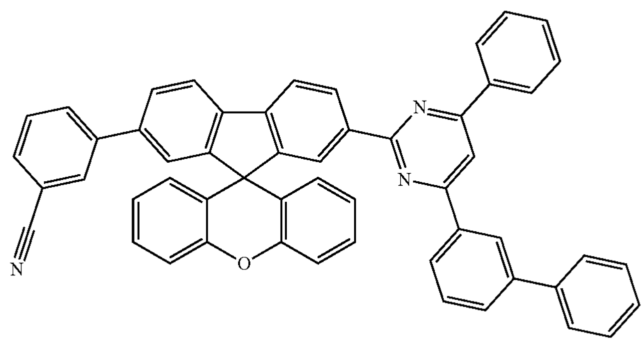
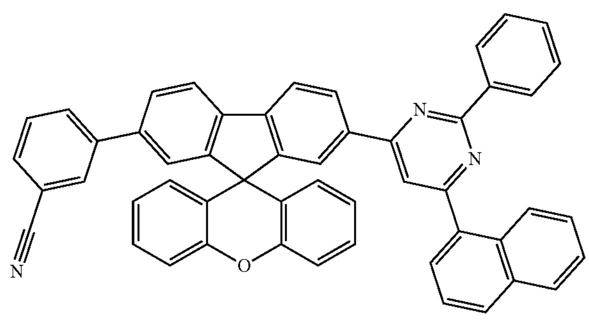
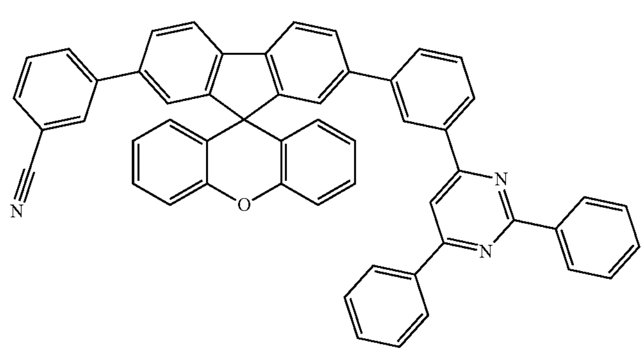

-continued
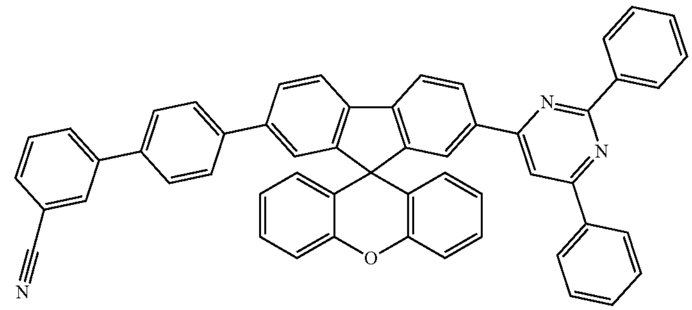
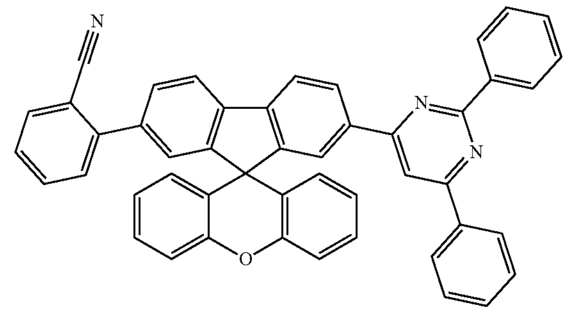
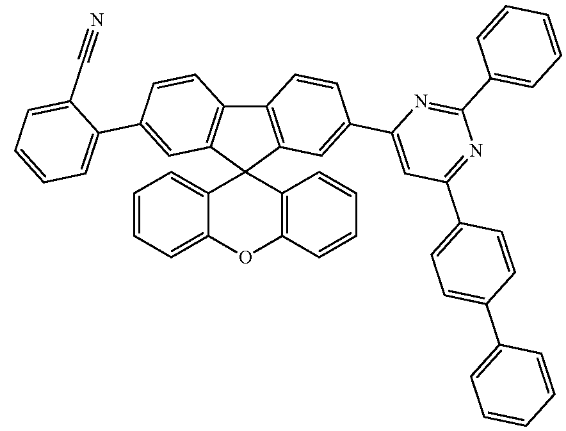
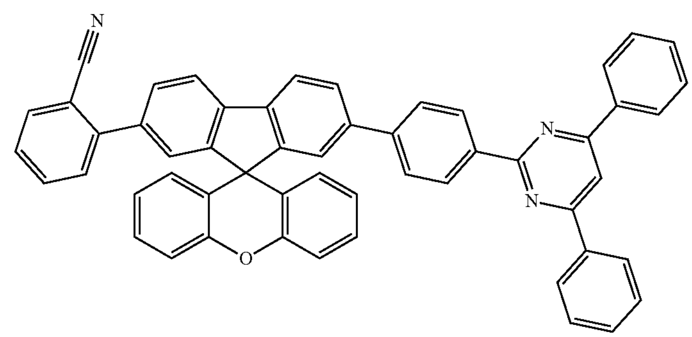
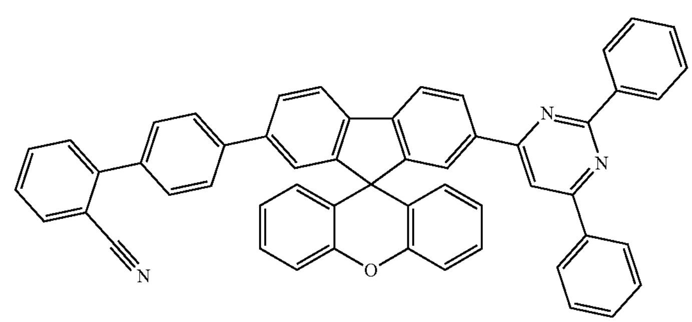

-continued
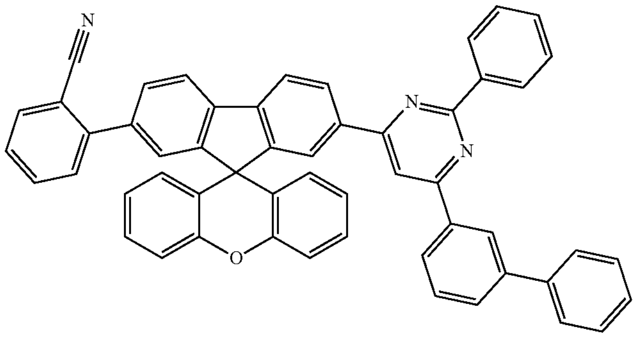
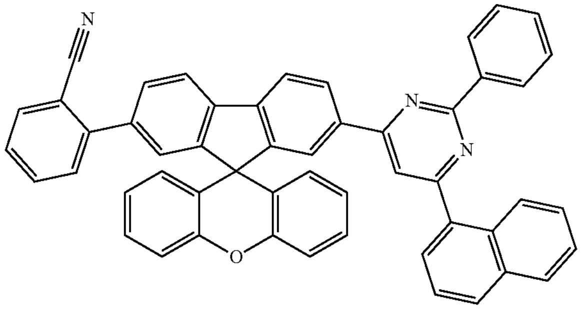
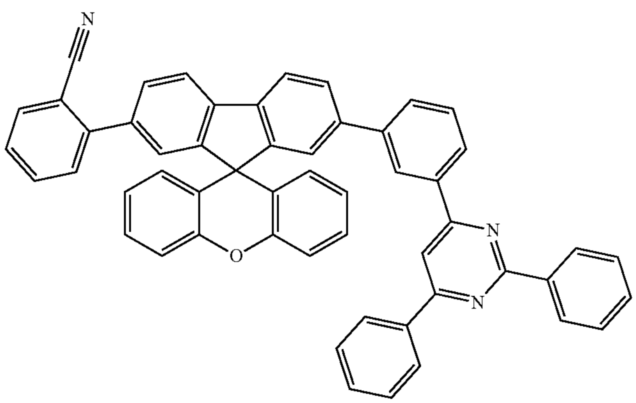
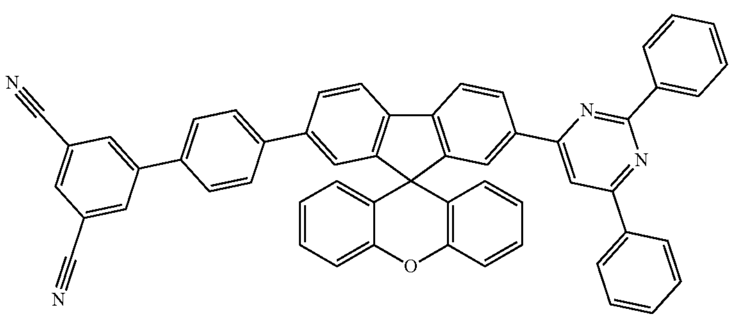
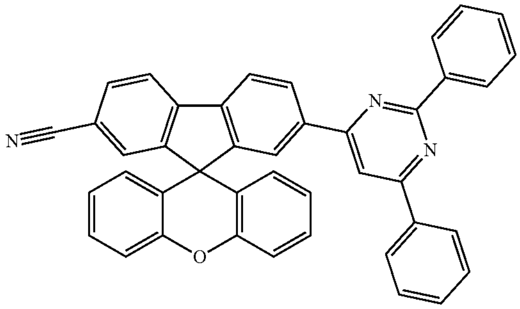

-continued
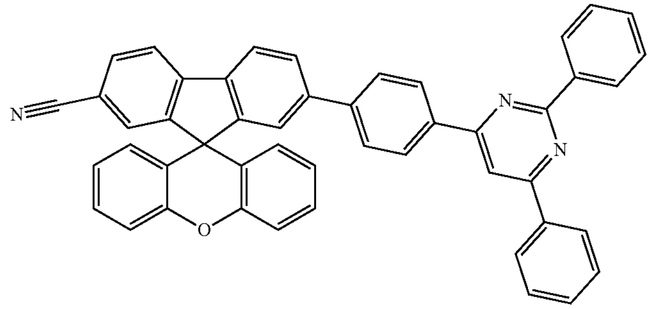
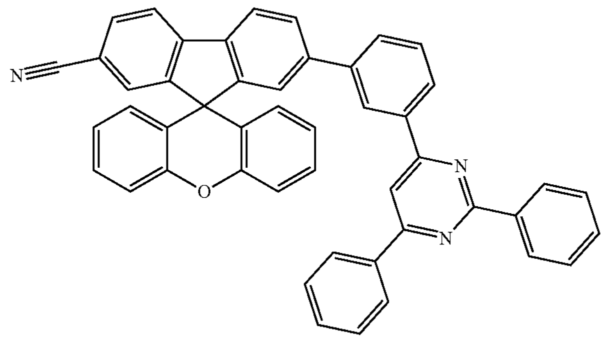
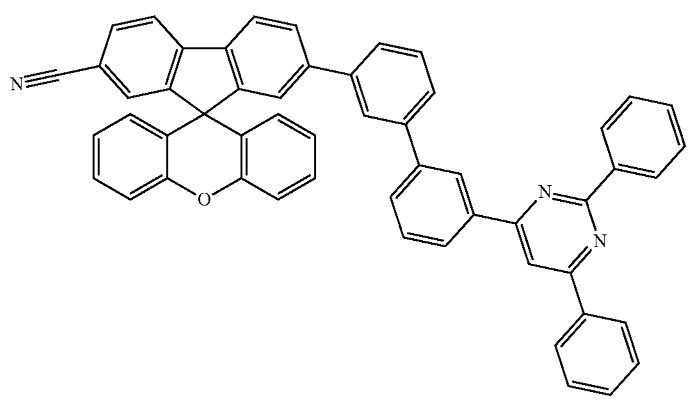
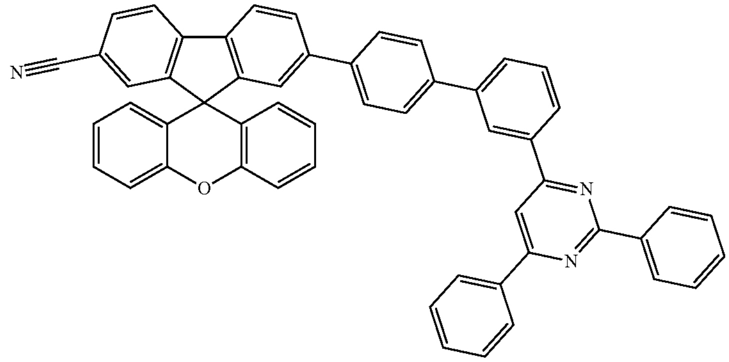

-continued
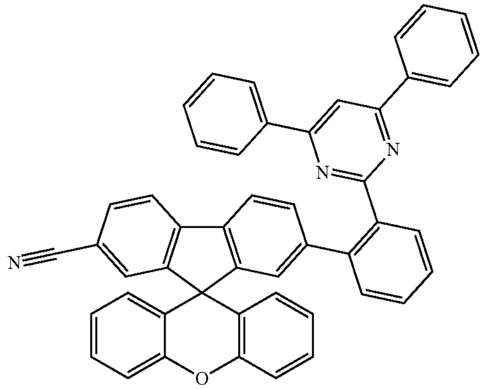
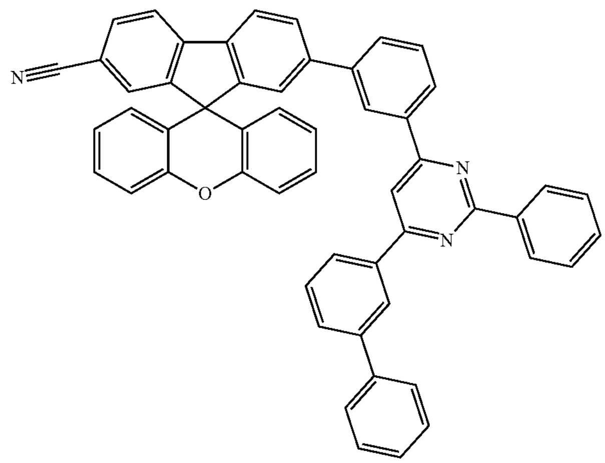
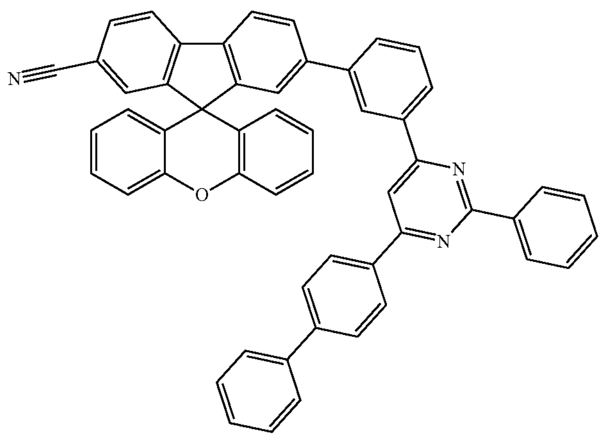
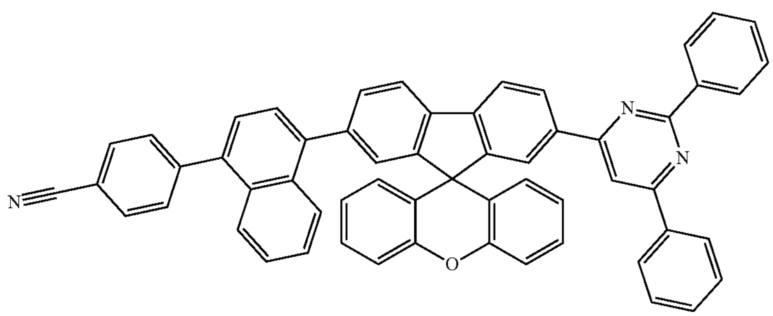
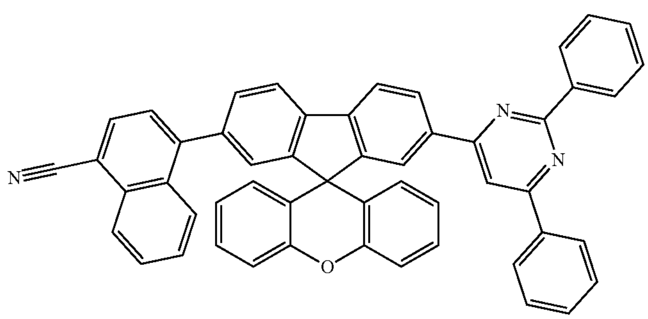

-continued
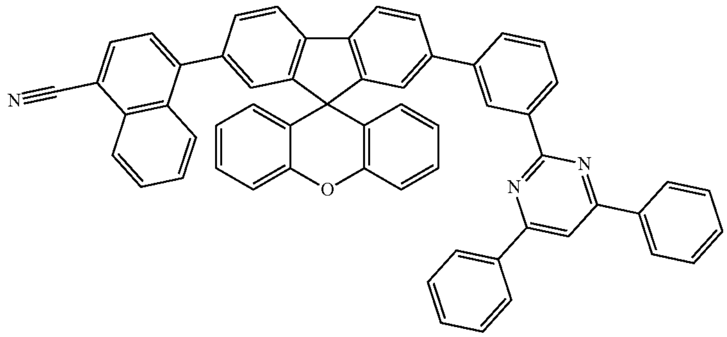
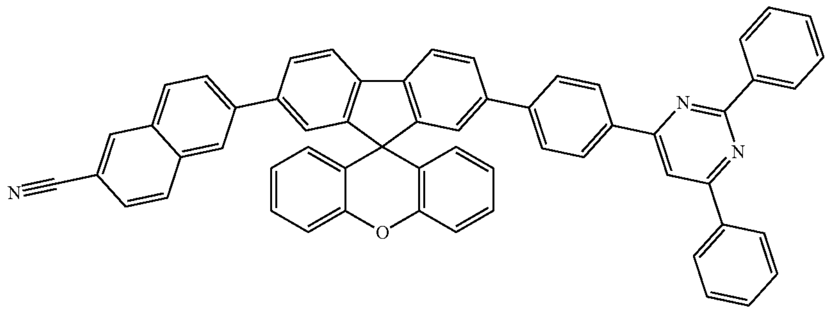
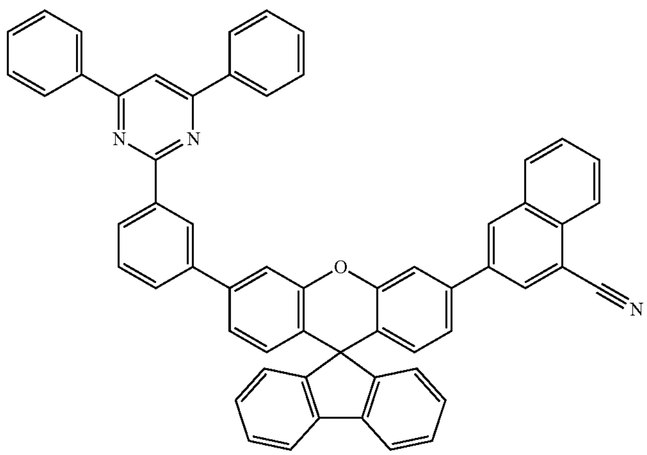
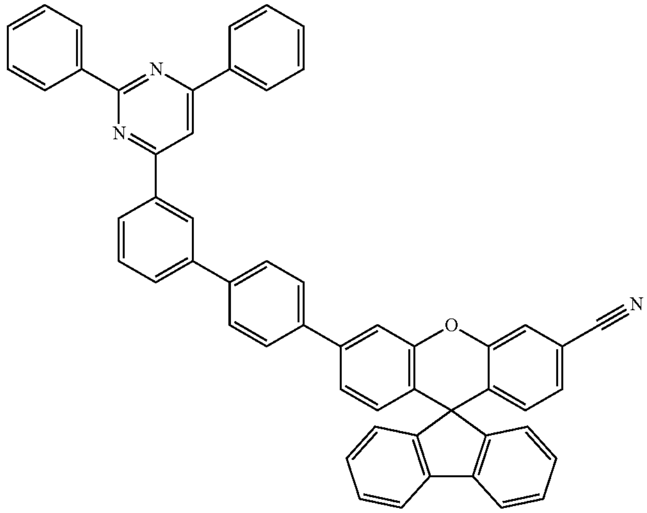

-continued
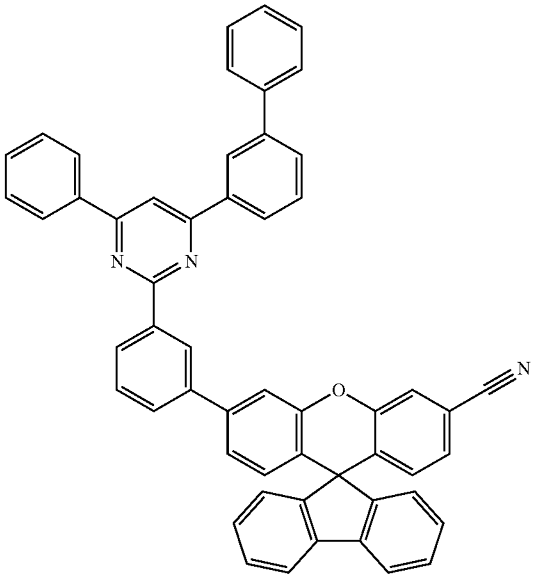
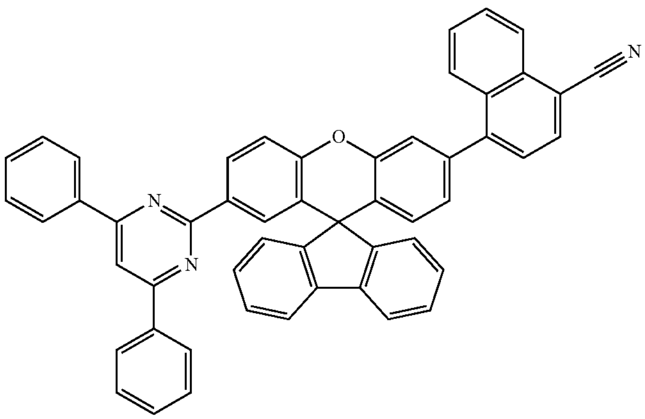
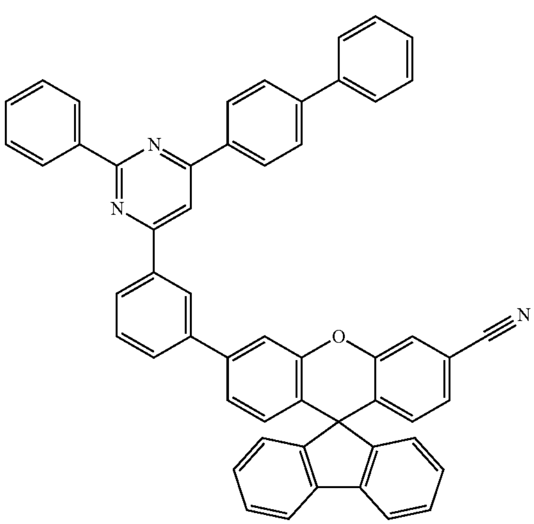

-continued
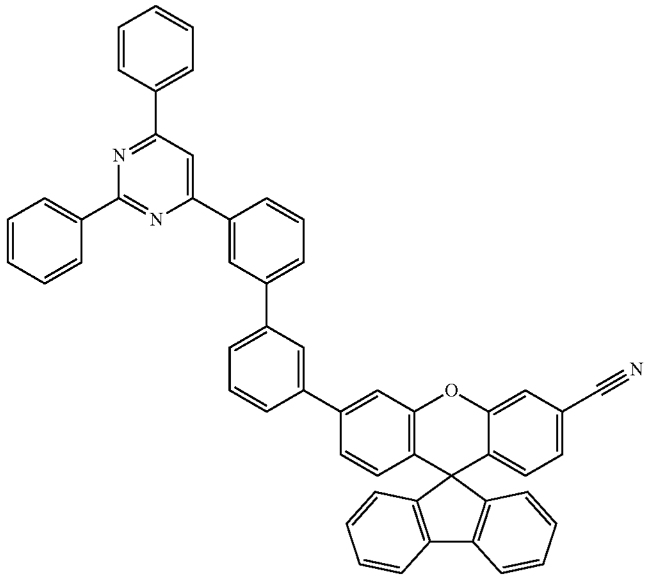
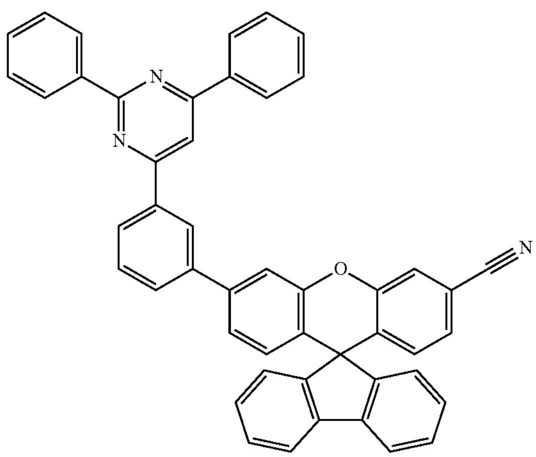
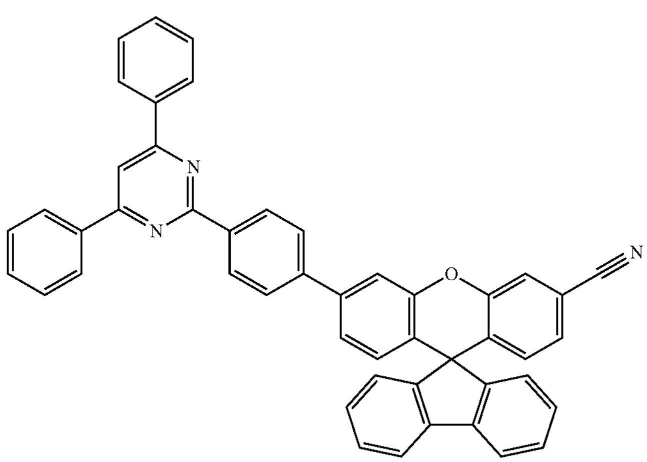

-continued
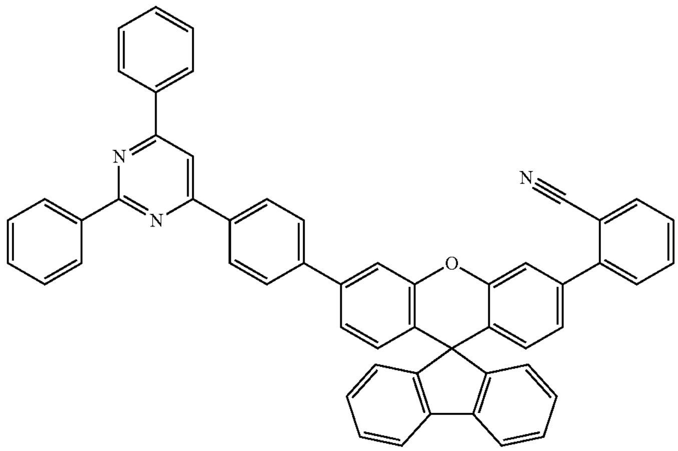
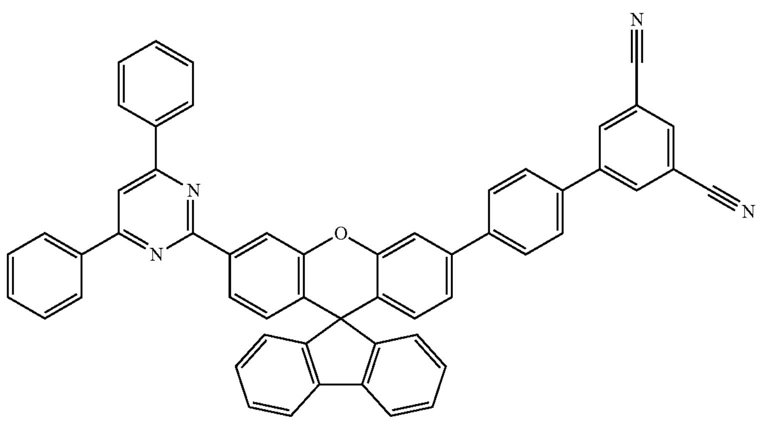
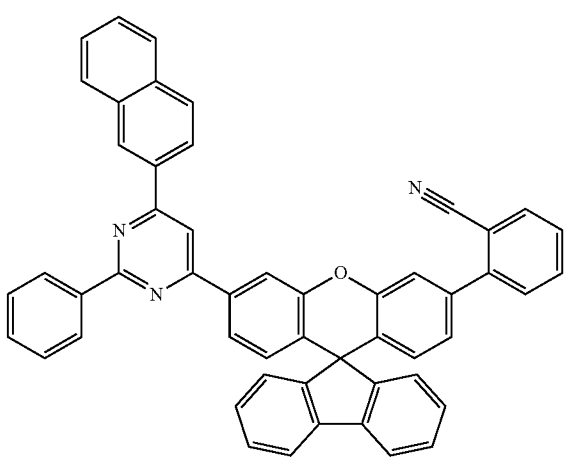

-continued
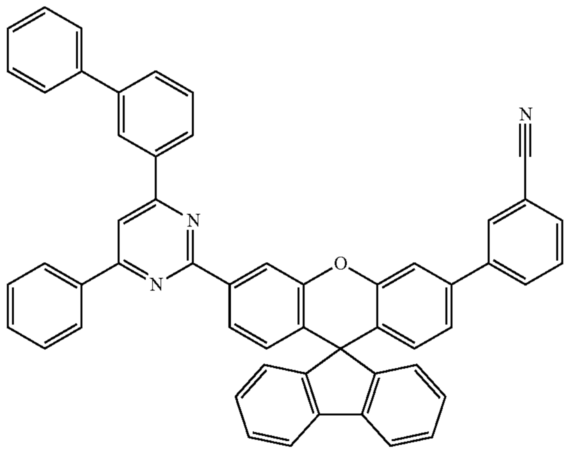
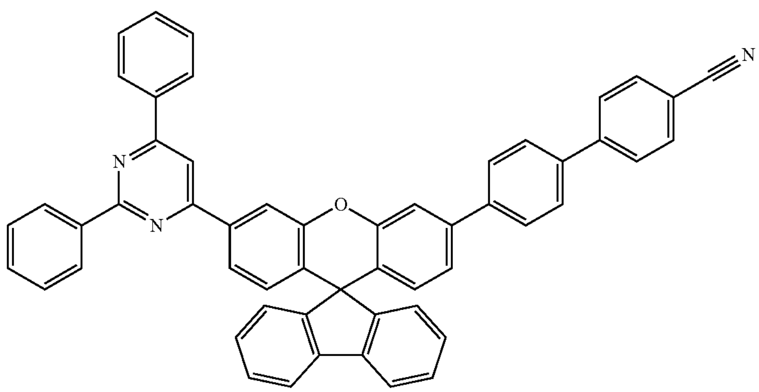
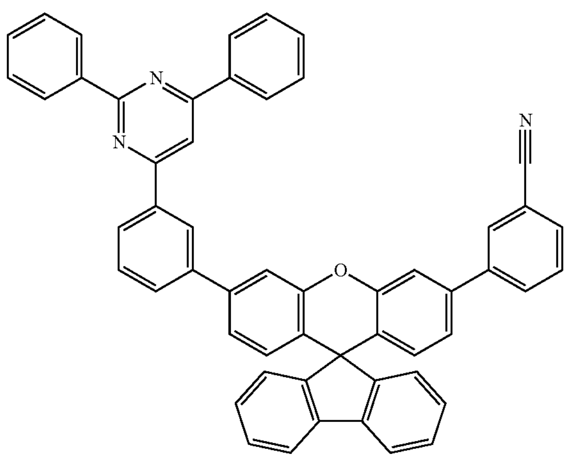
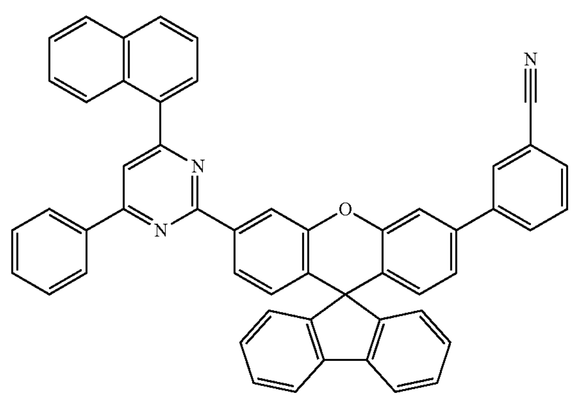
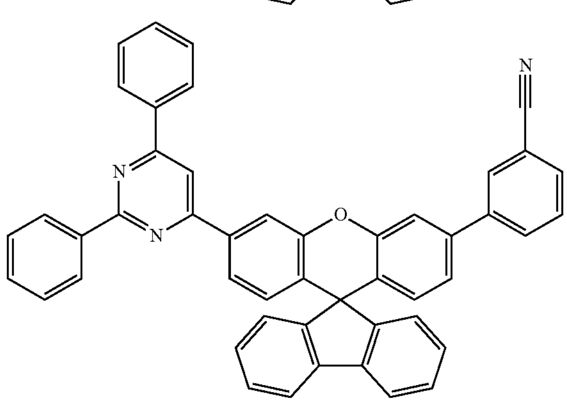

-continued
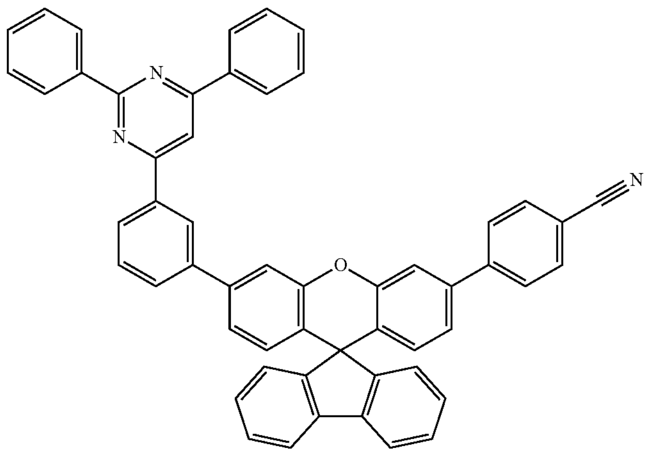
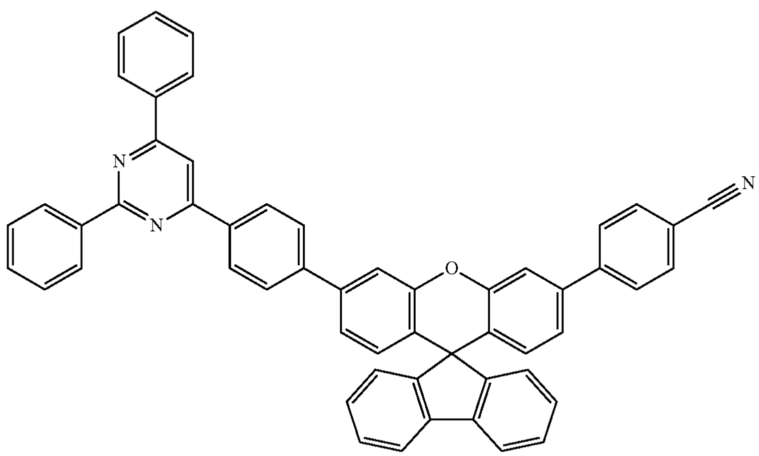
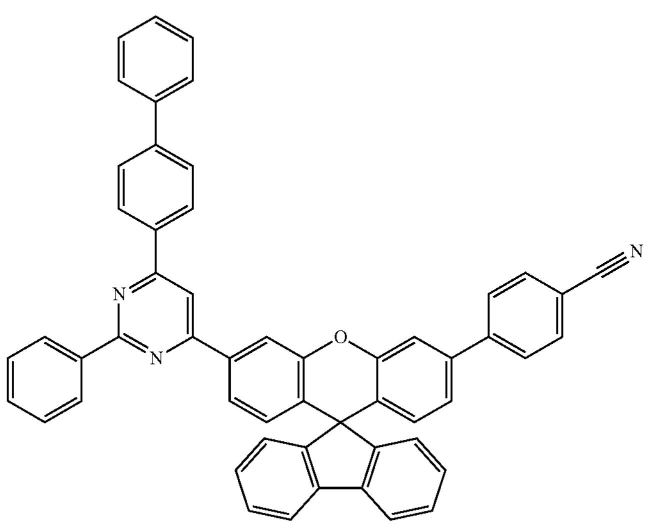

-continued
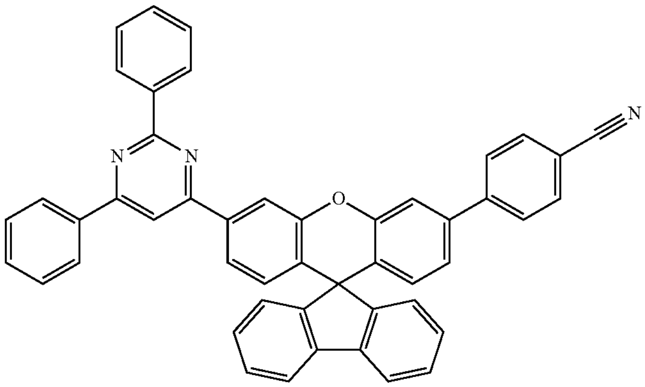
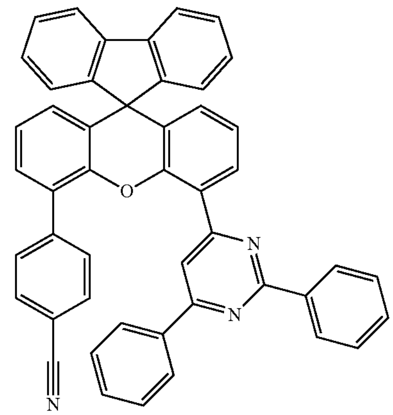
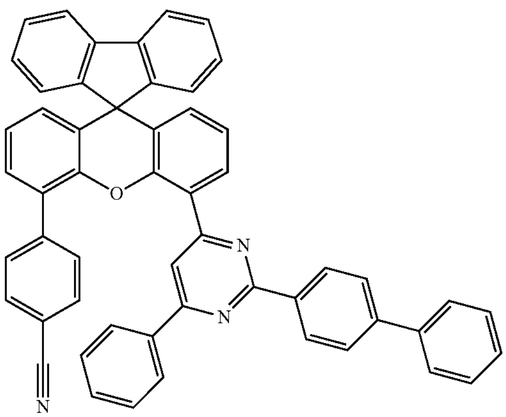
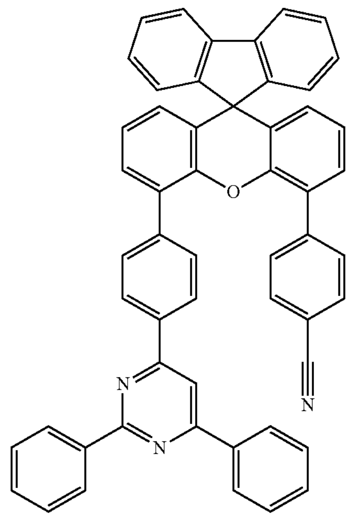
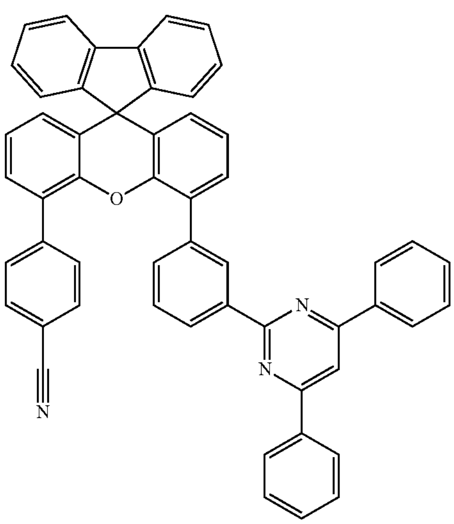
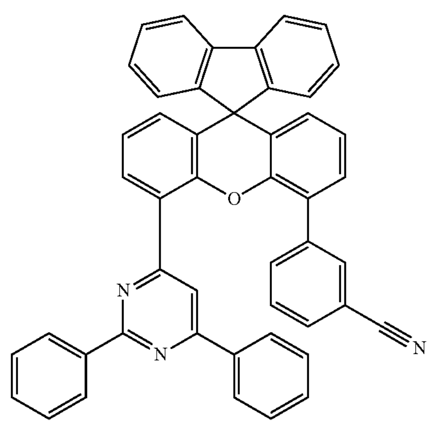

-continued
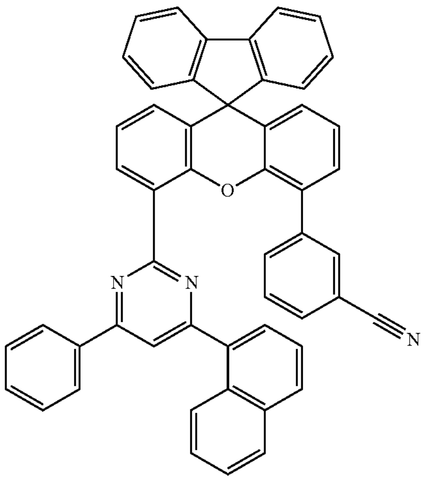
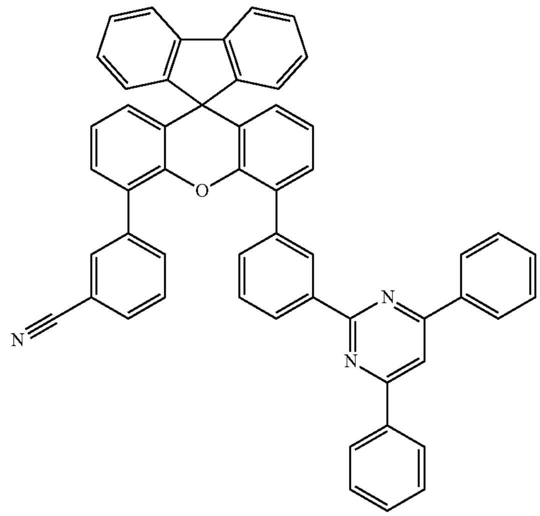
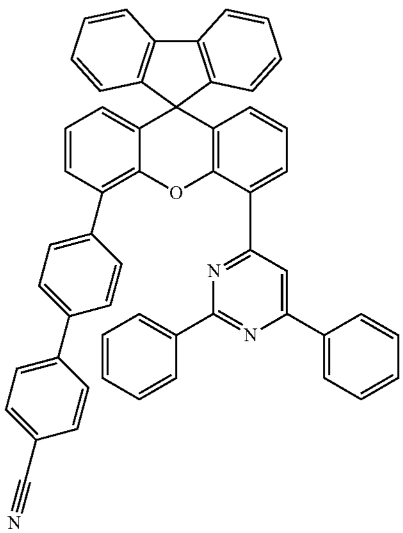
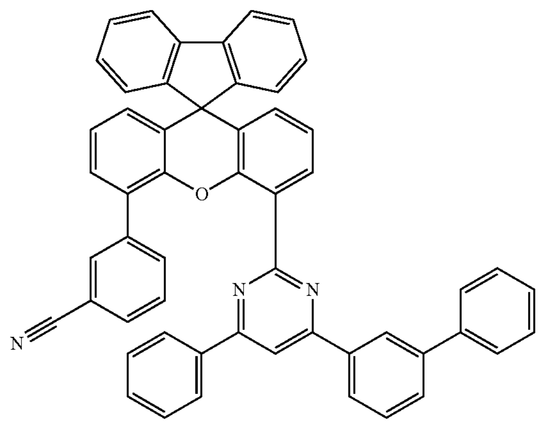
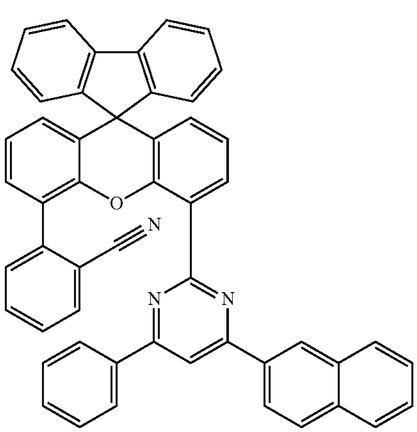
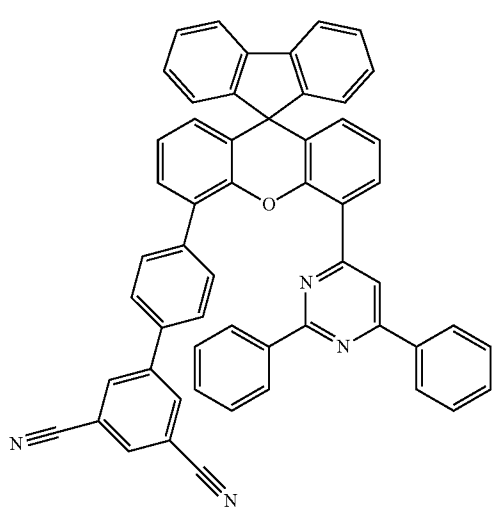

-continued
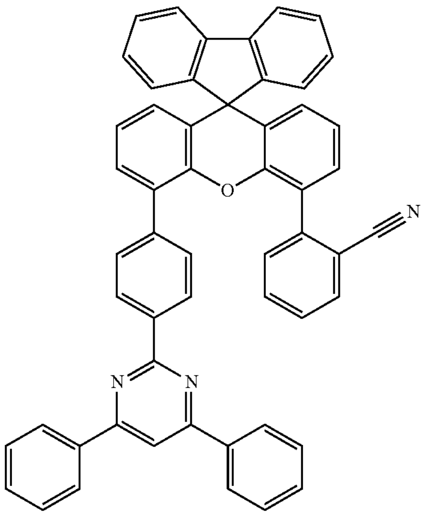
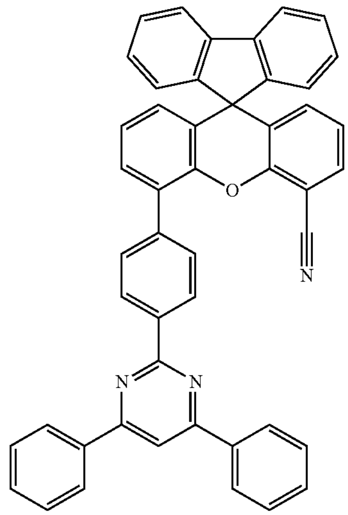
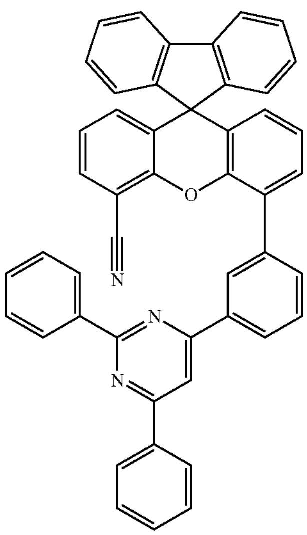
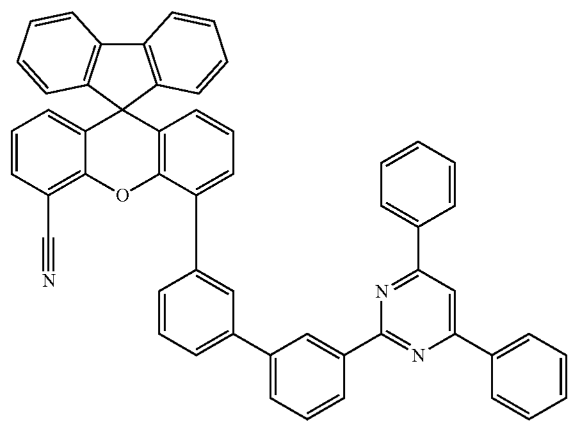
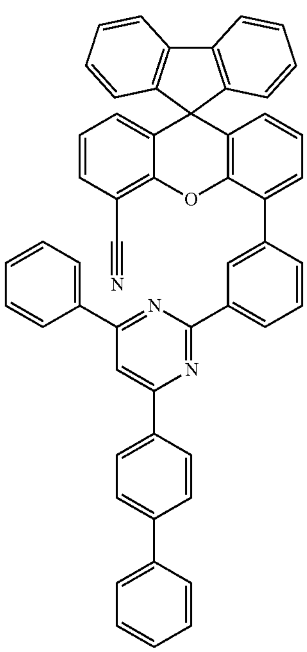
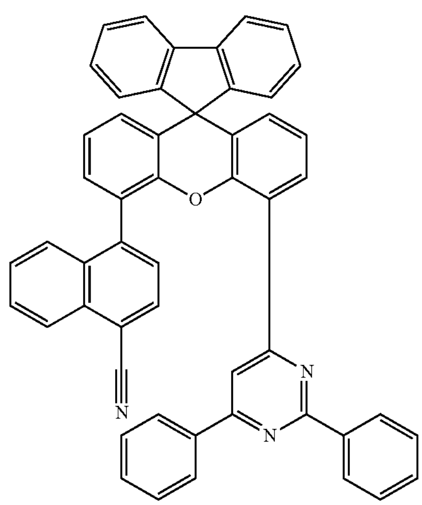
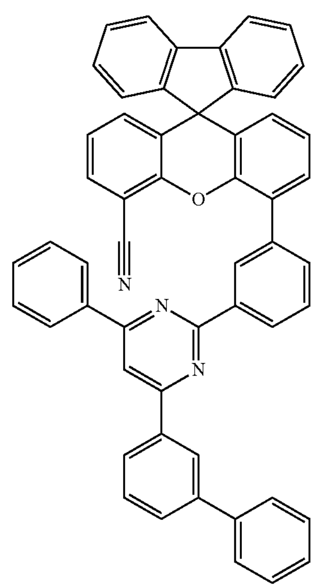

-continued
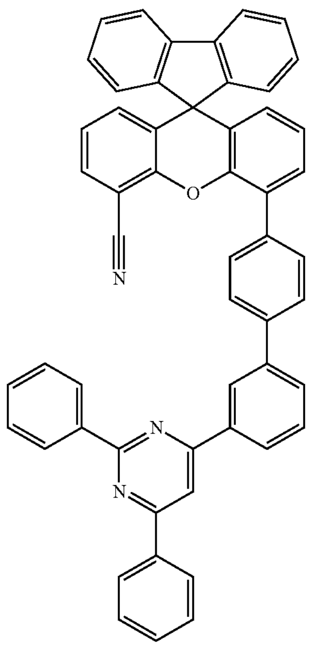
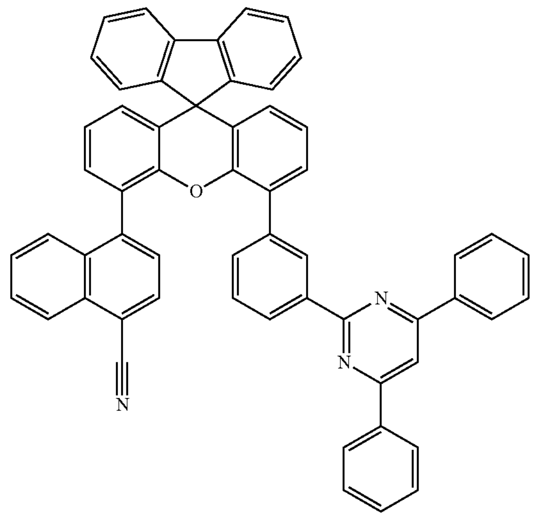
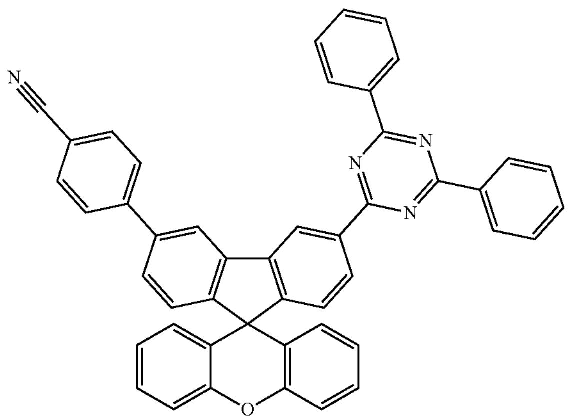
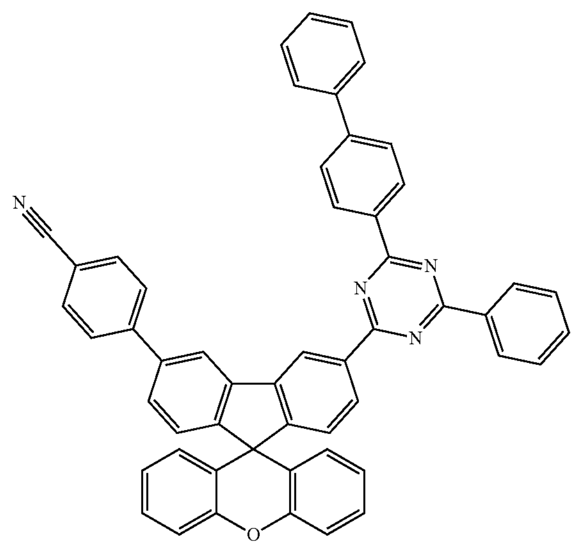
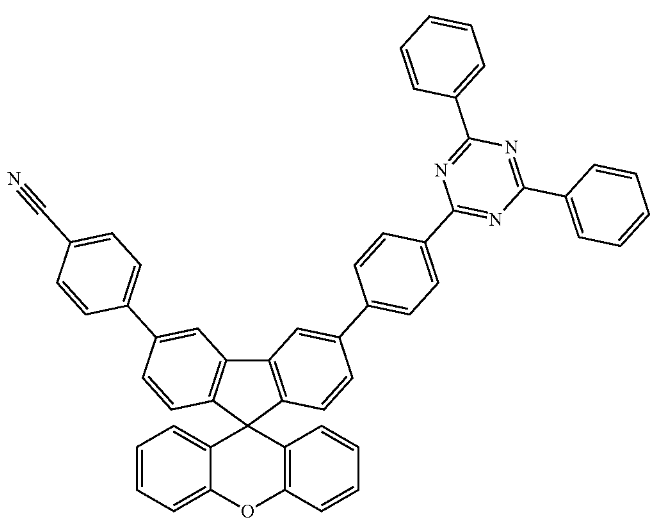

-continued
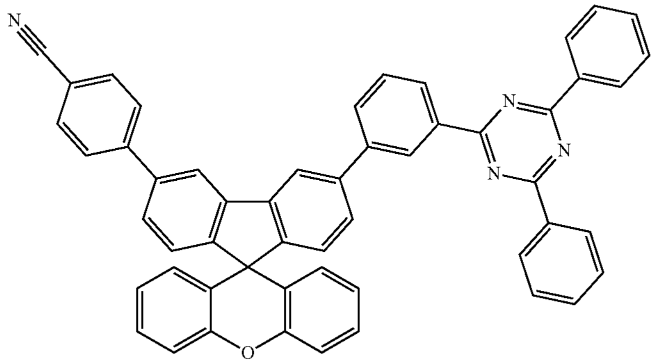
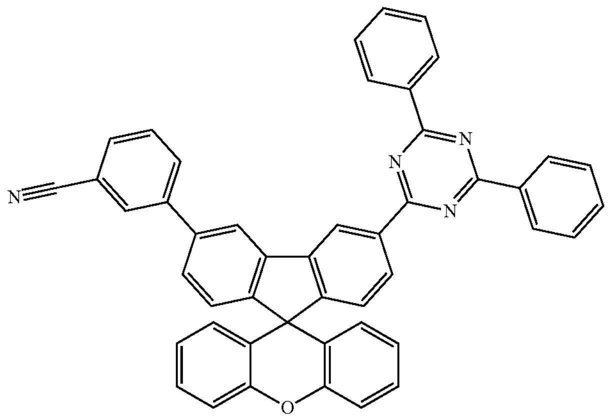
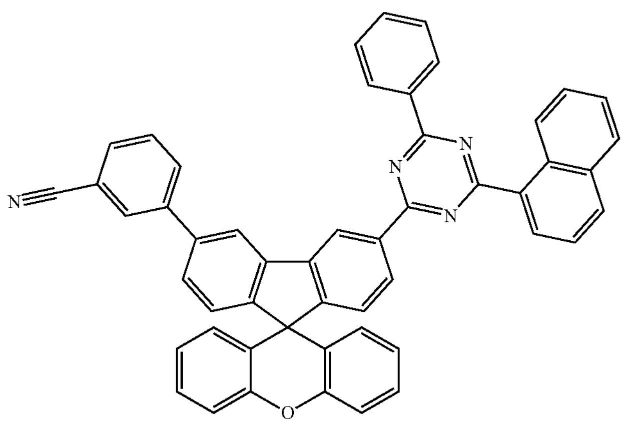
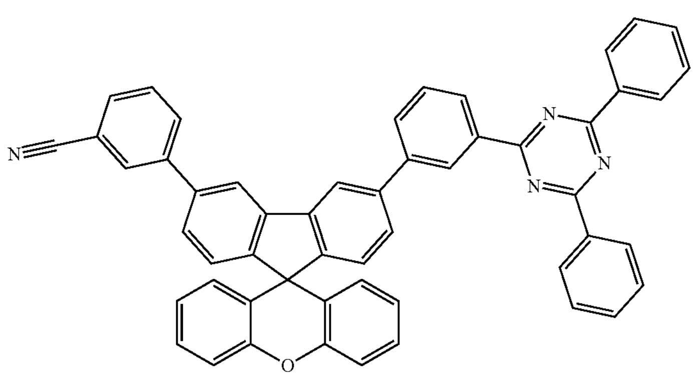

-continued
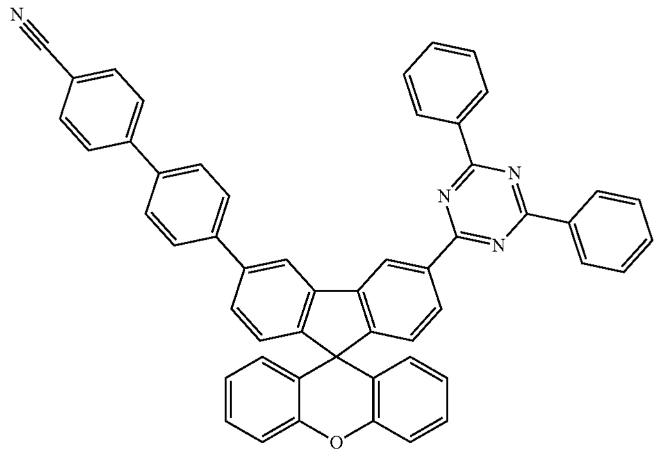
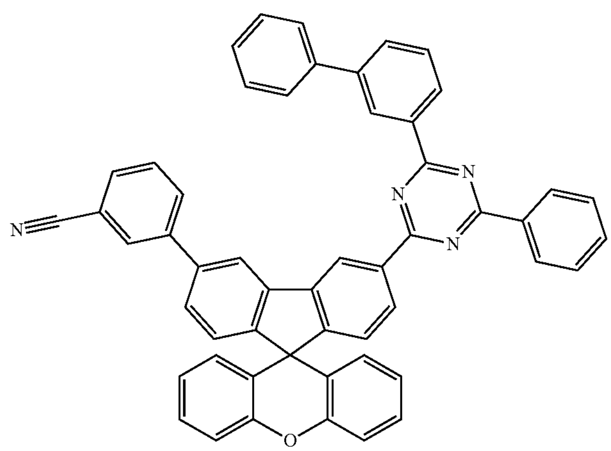
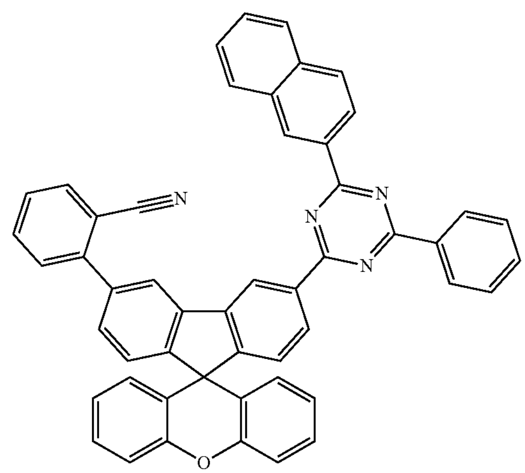
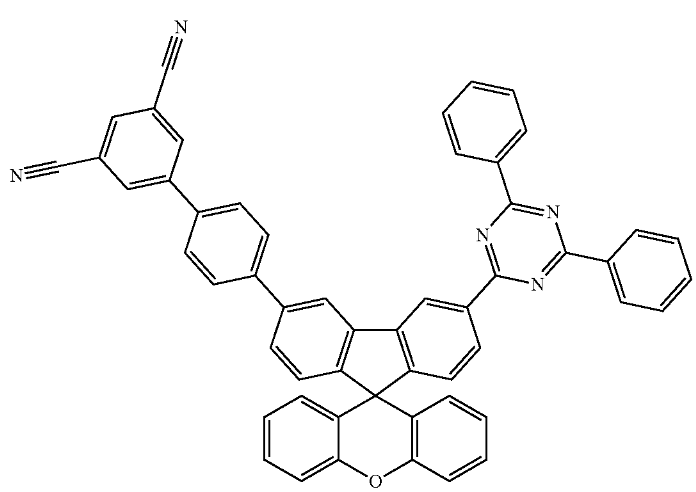

-continued
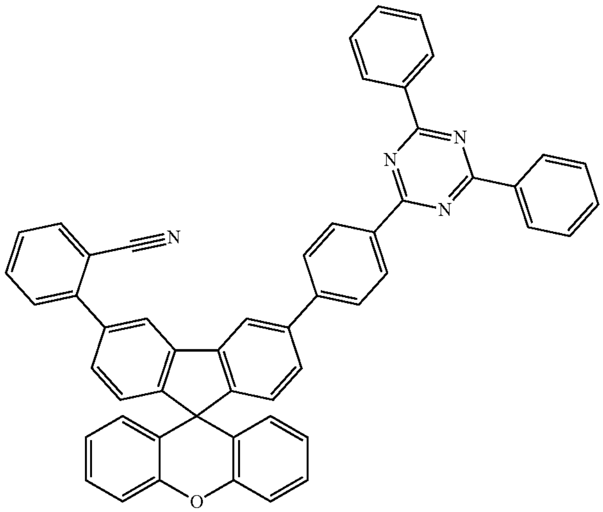
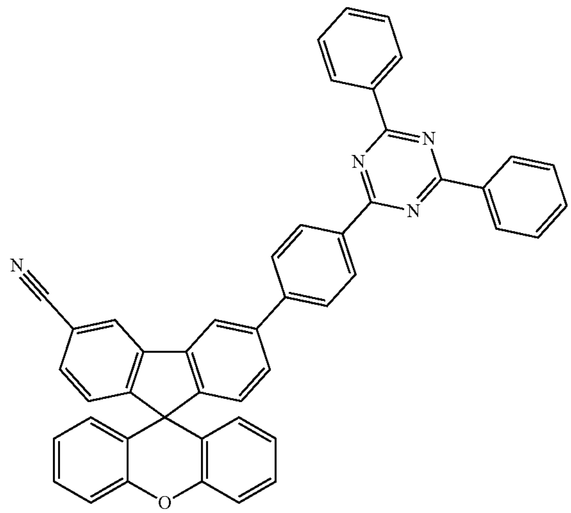
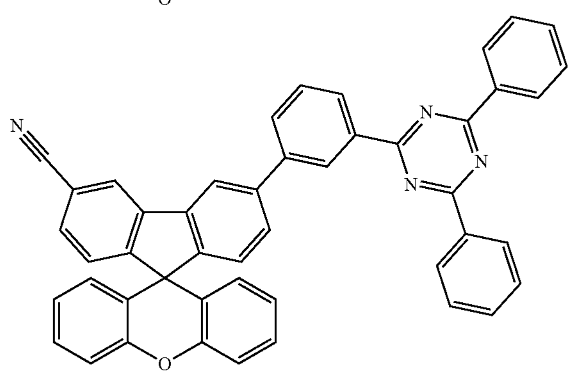
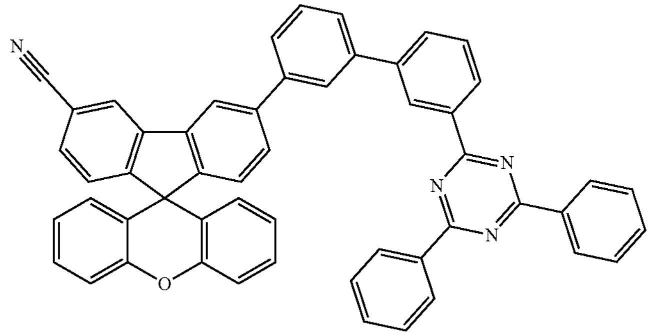

-continued
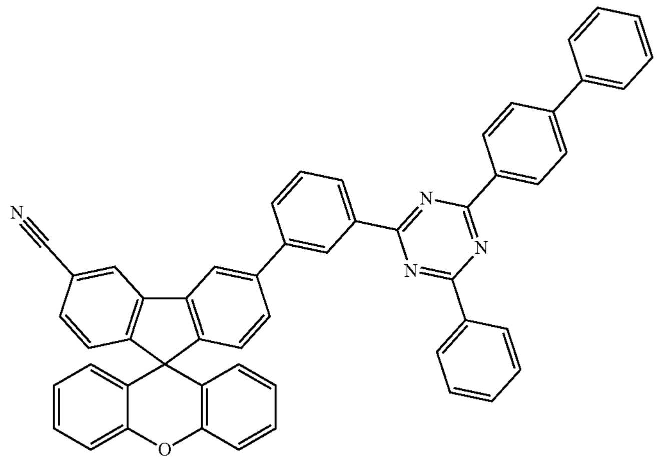
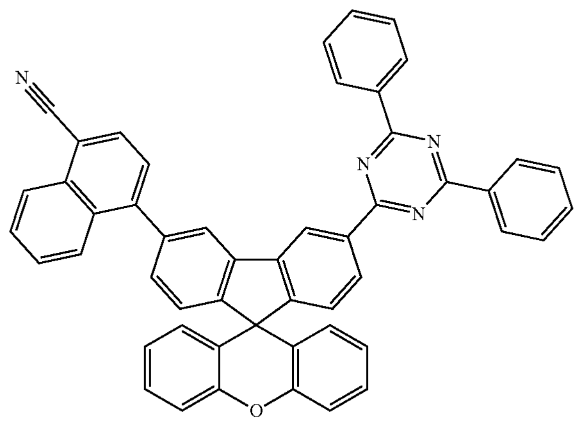
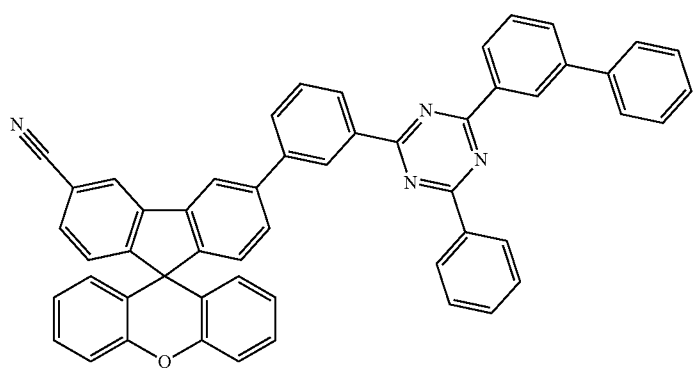
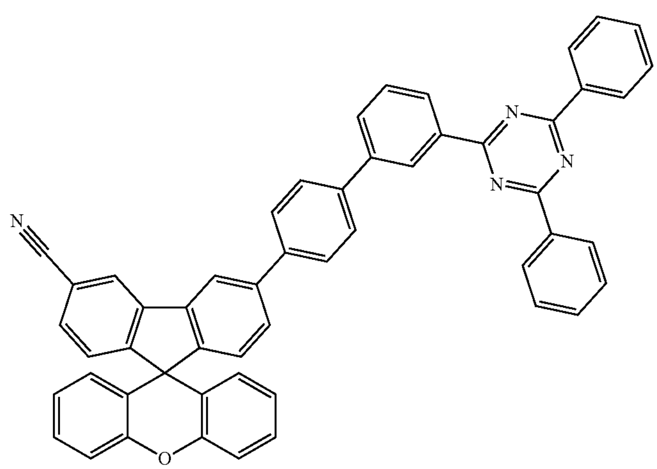

-continued
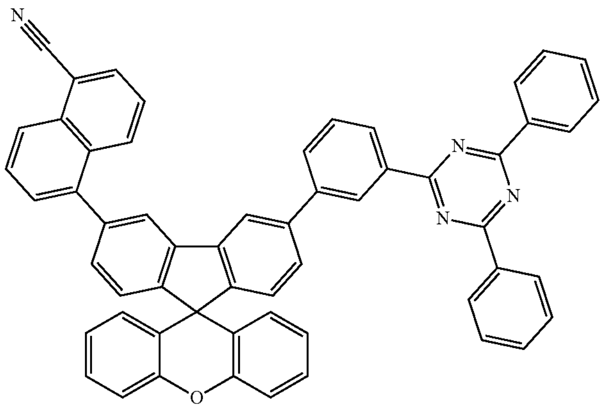
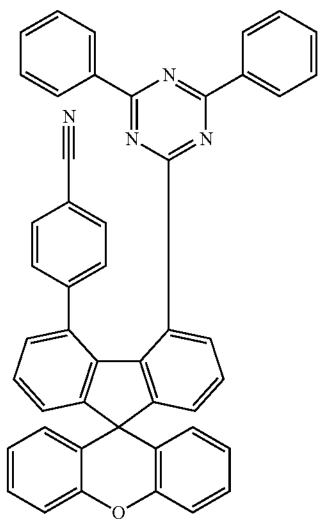
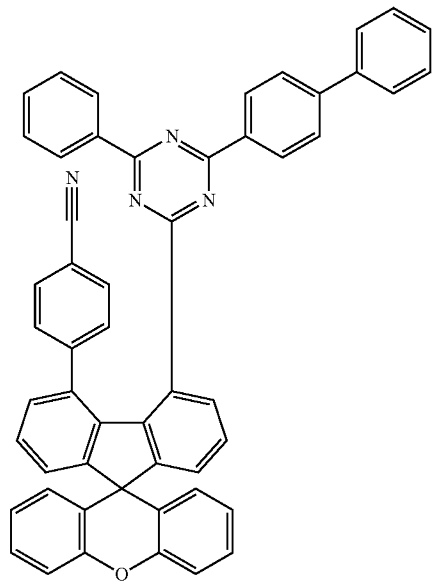
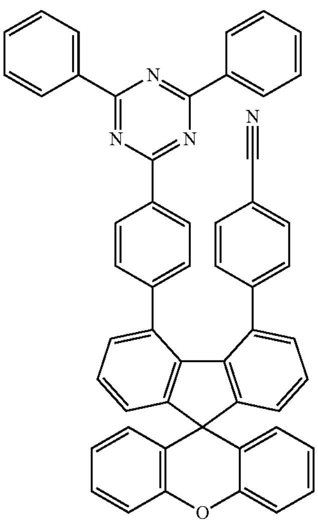
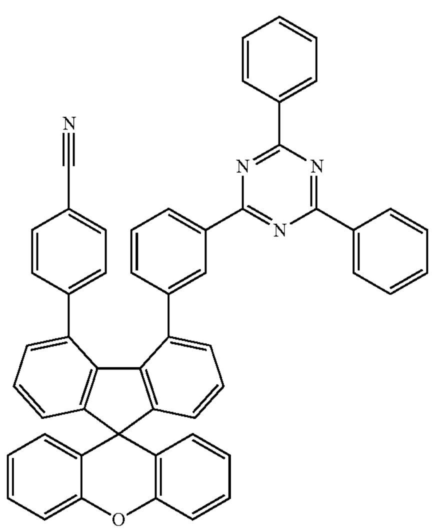
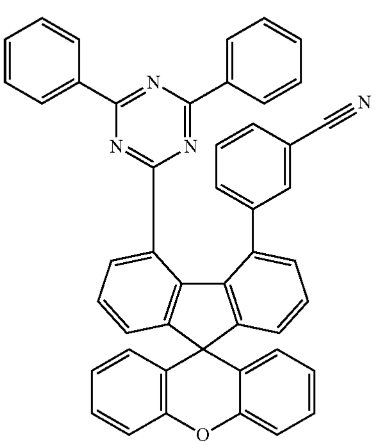

-continued
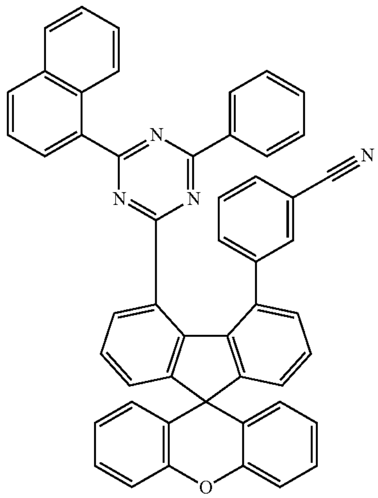
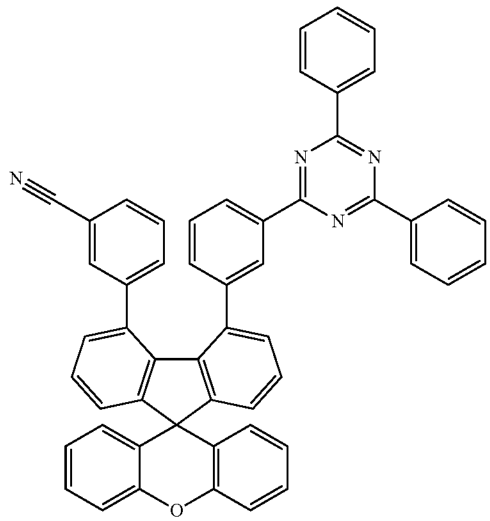
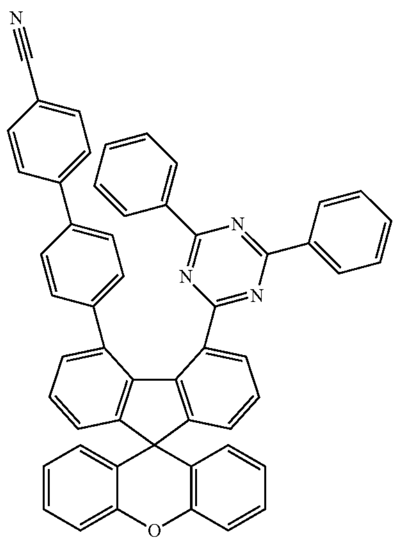
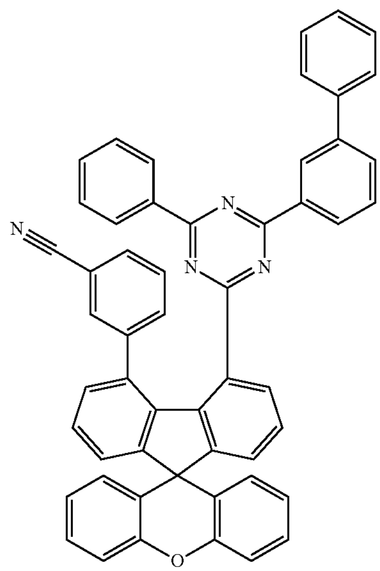
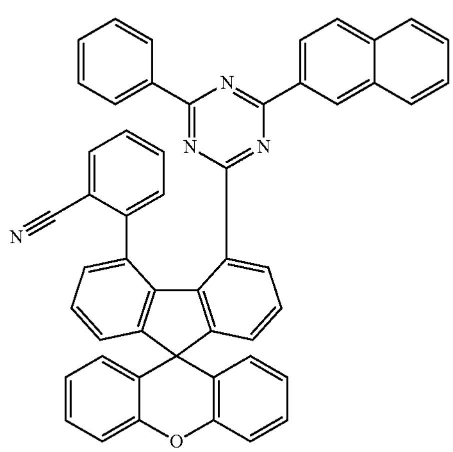
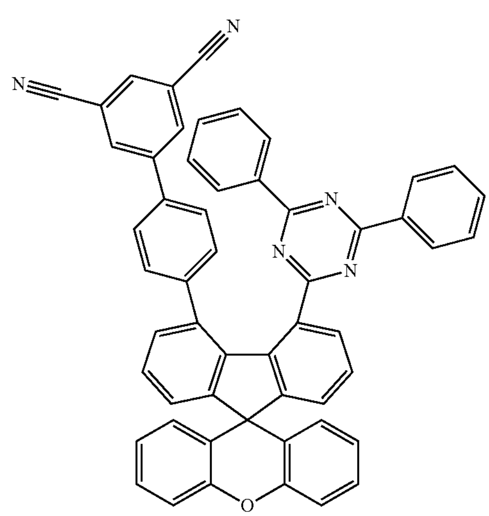

-continued
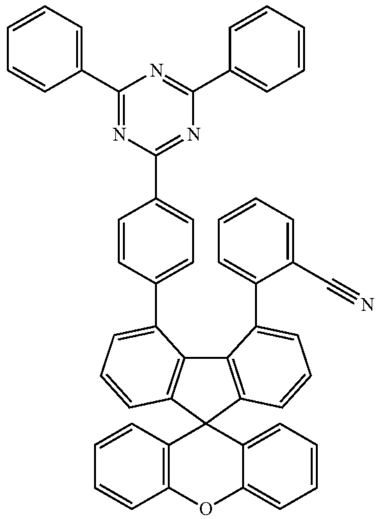
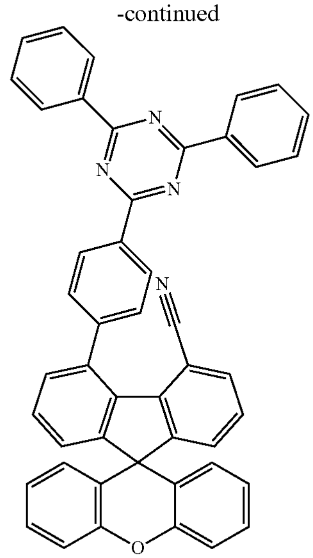
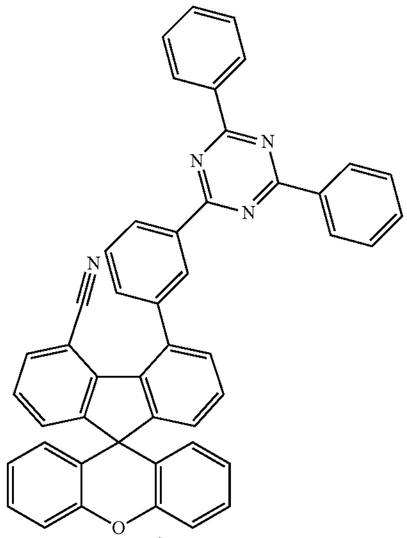
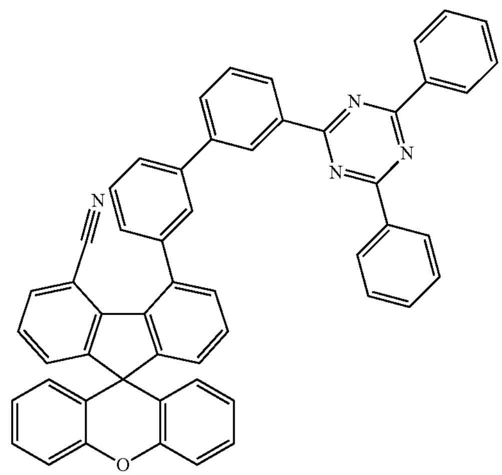
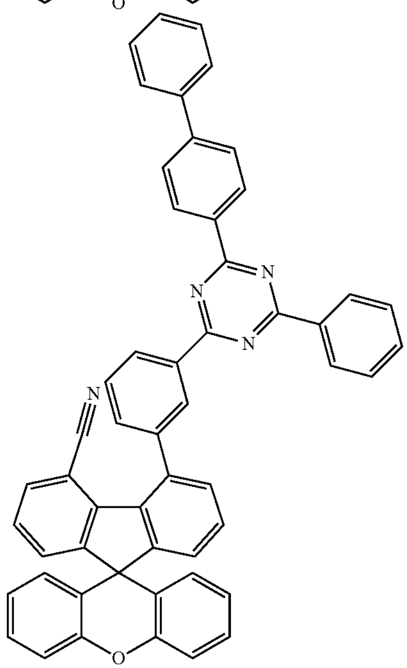
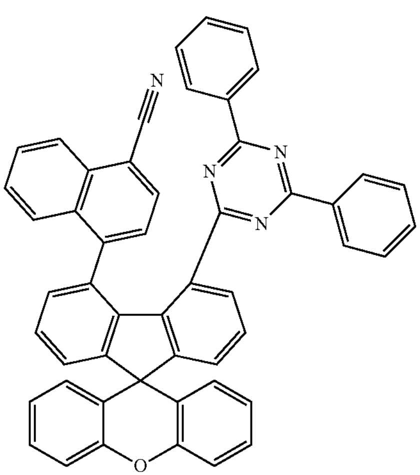

-continued
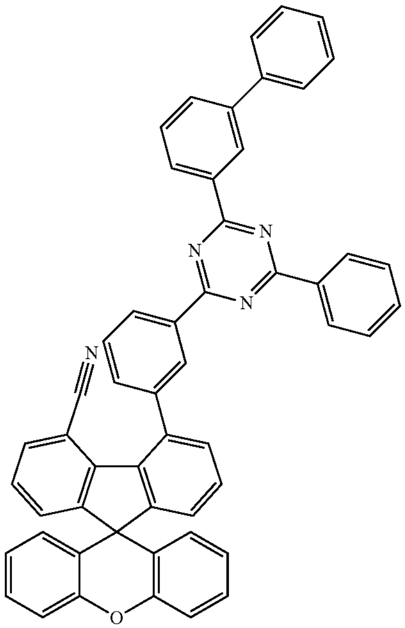
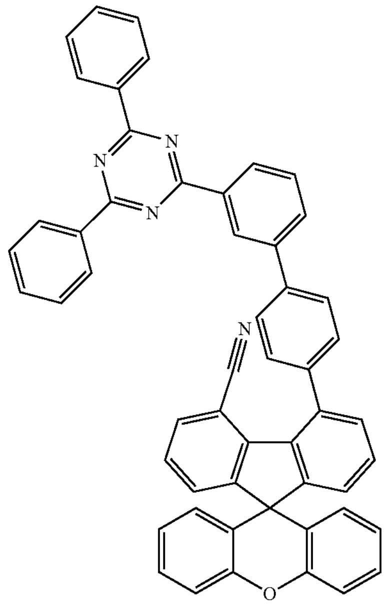
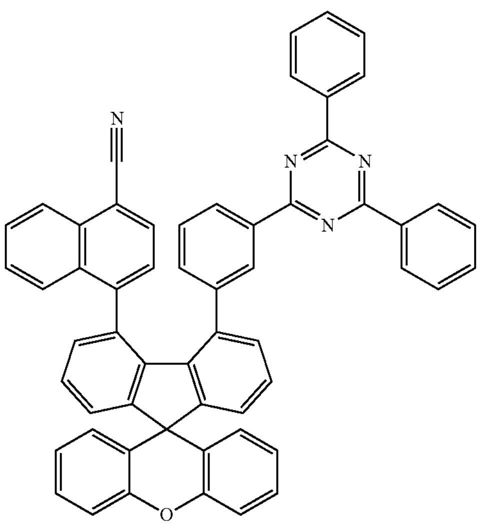
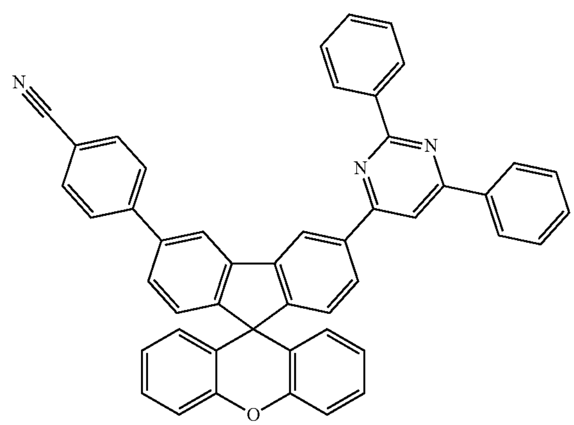
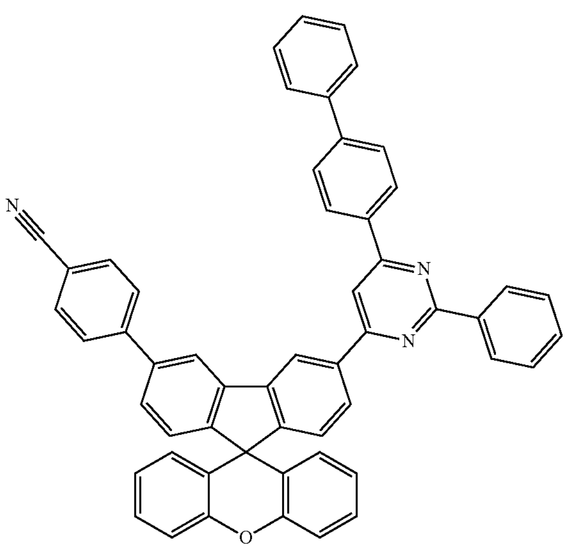

-continued
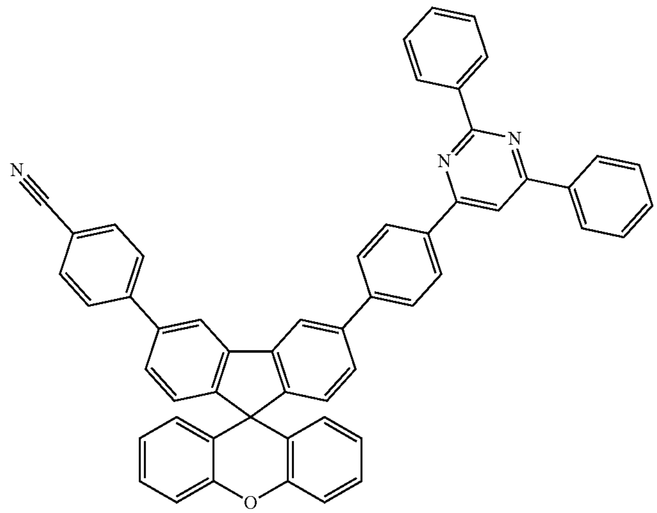
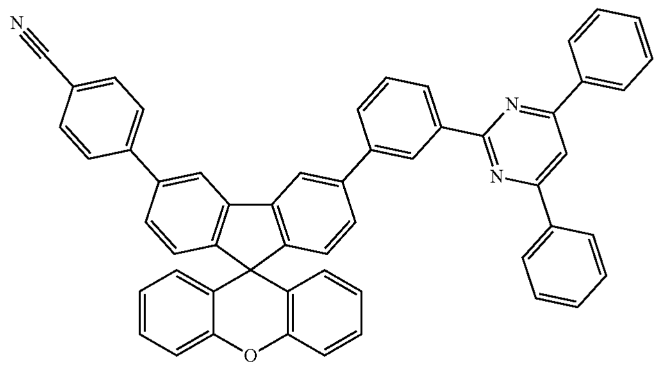
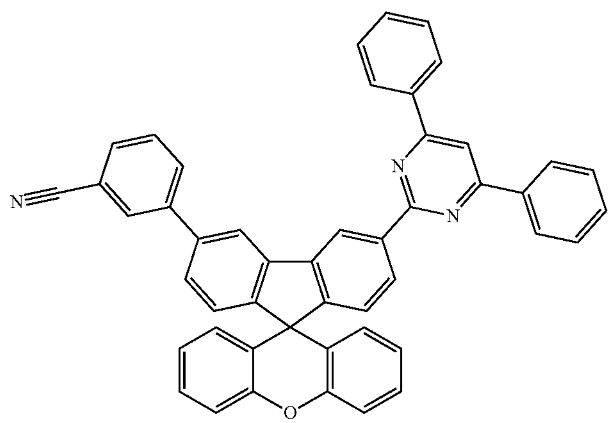
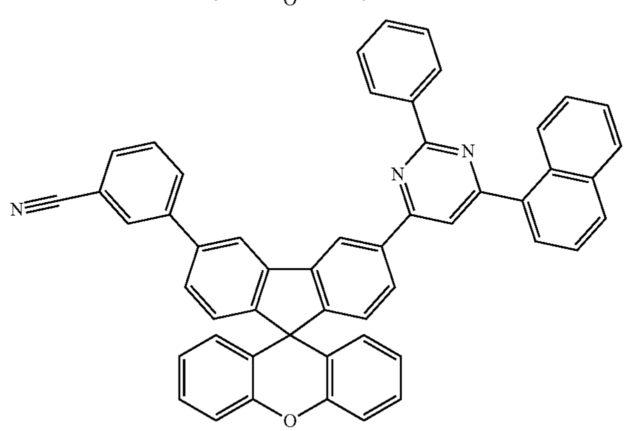

-continued
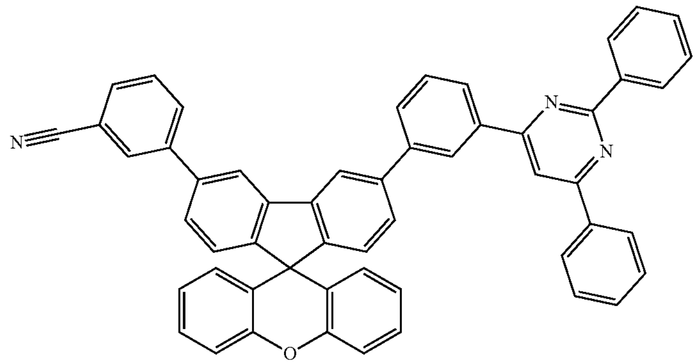
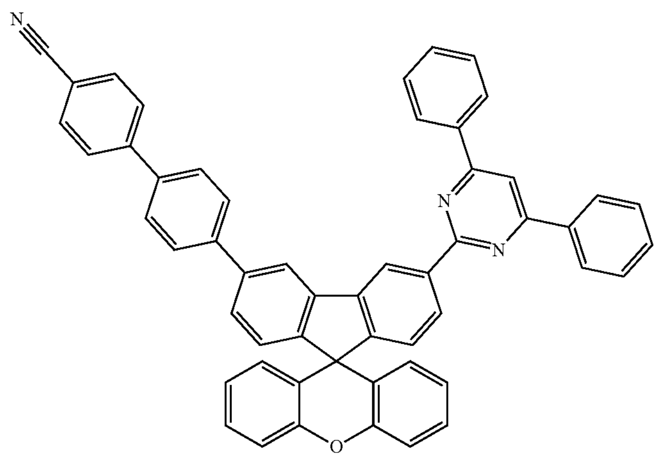
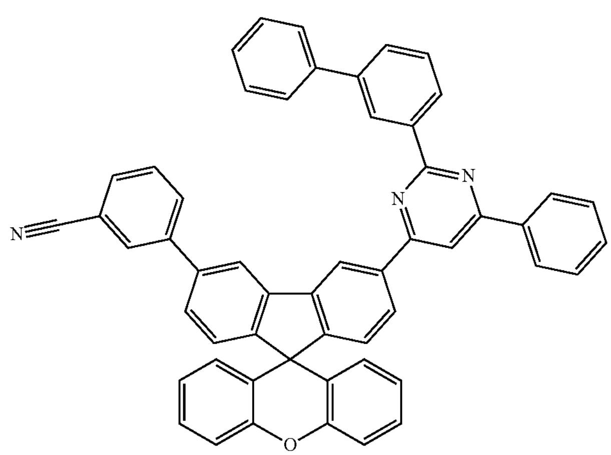
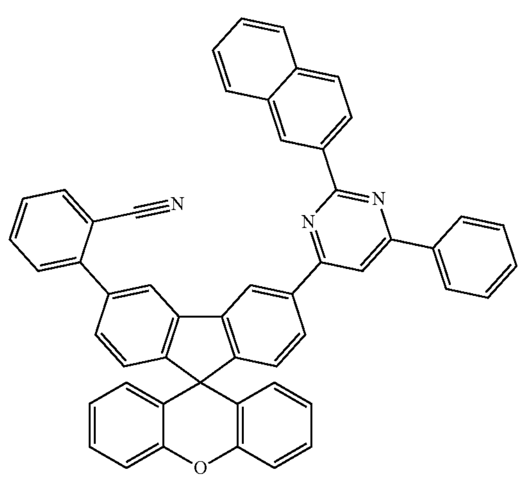

-continued
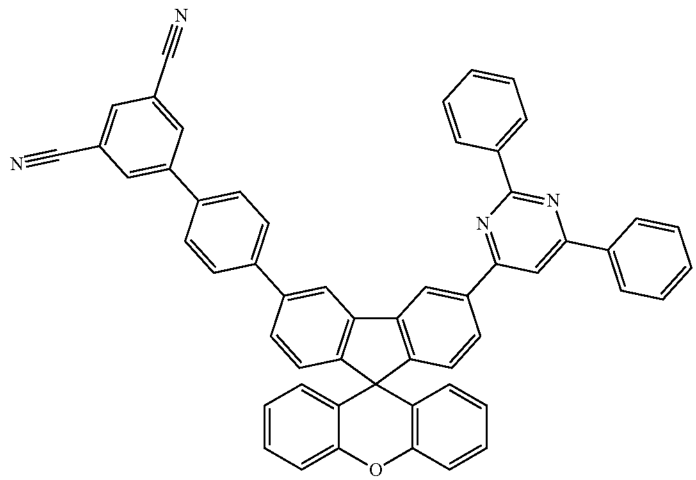
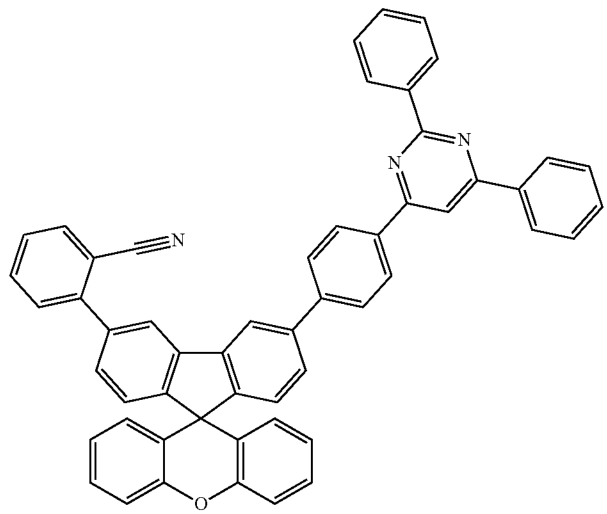
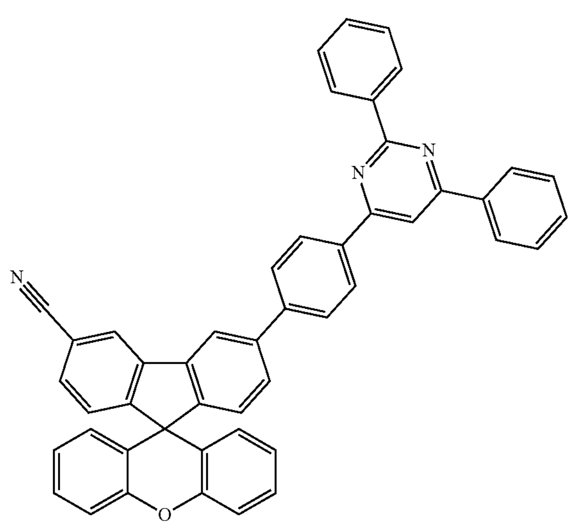

-continued
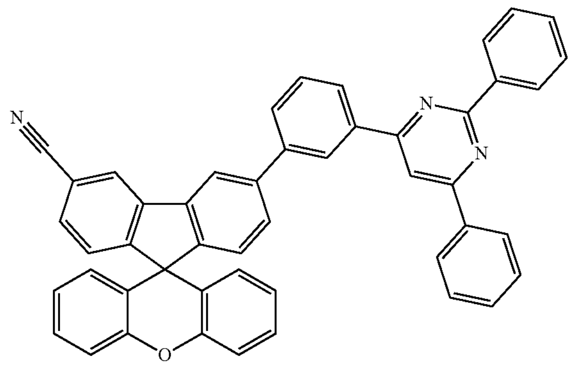
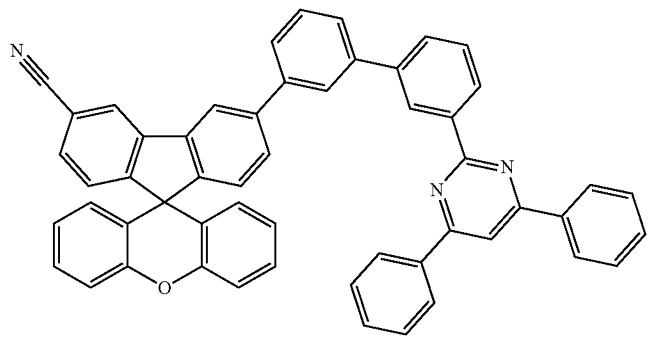
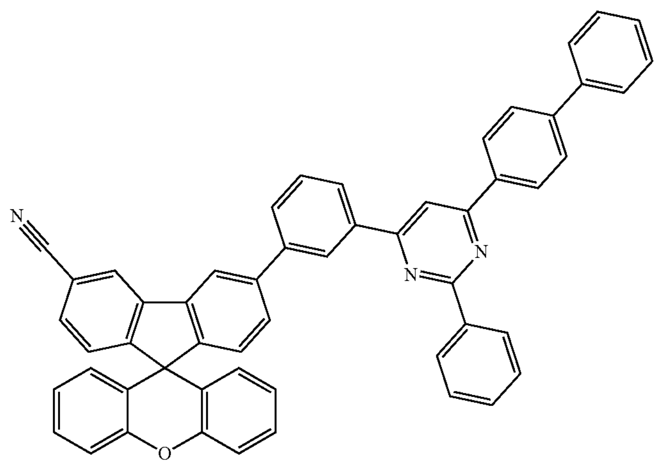
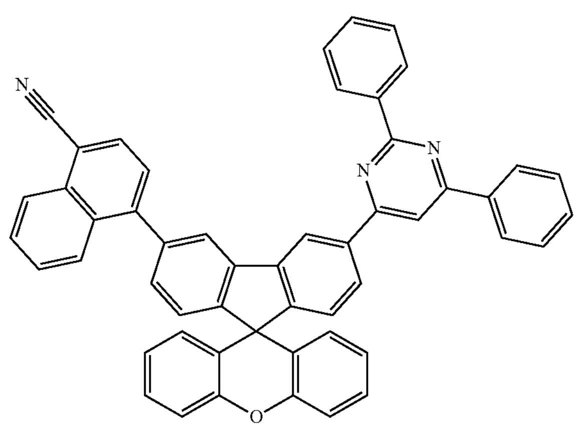

-continued
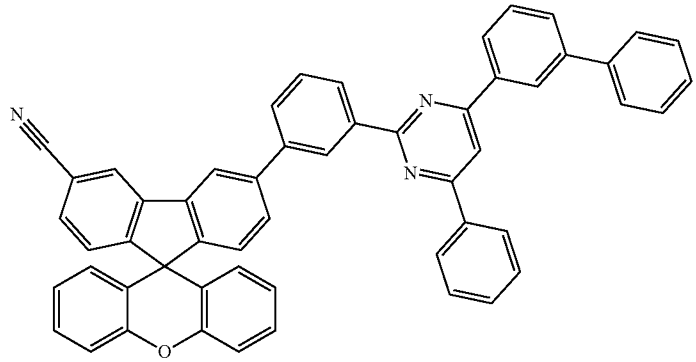
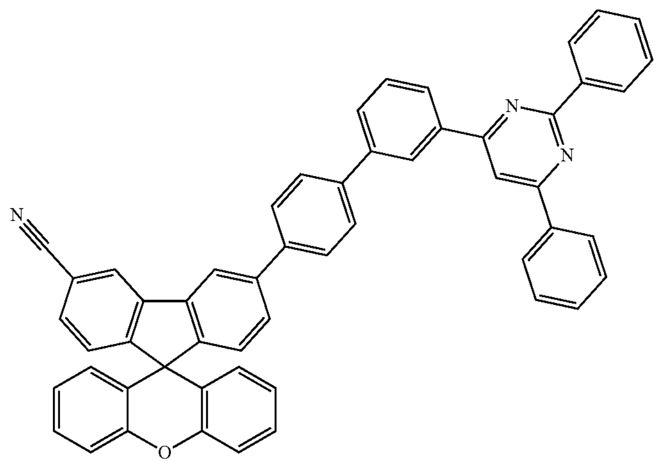
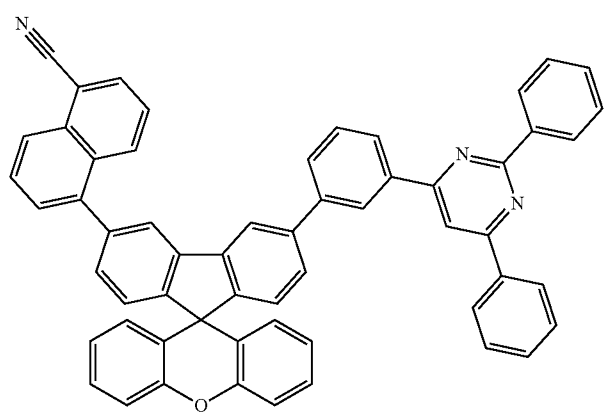
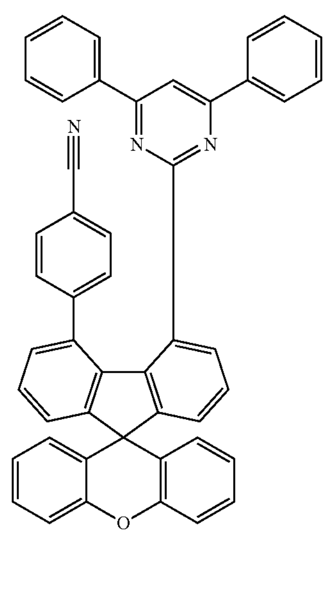

-continued
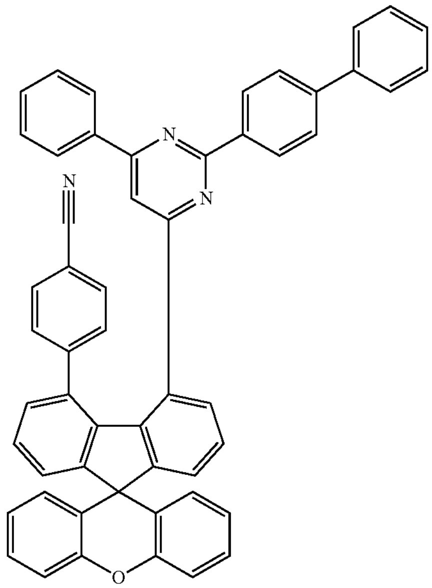
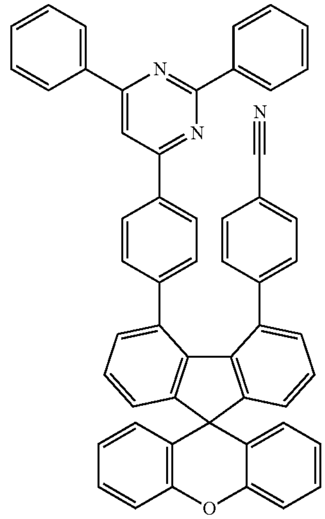
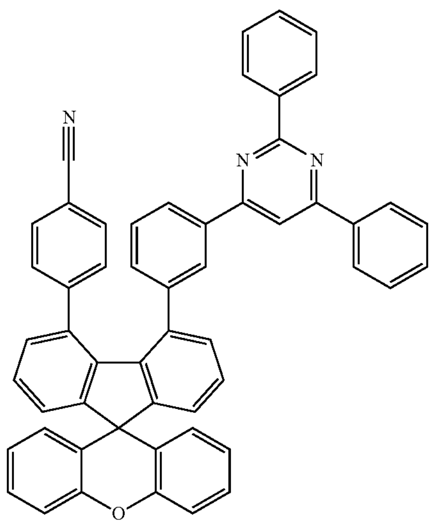
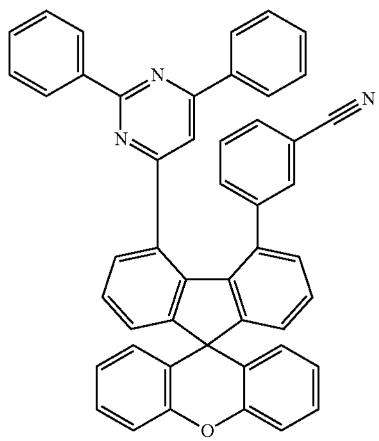
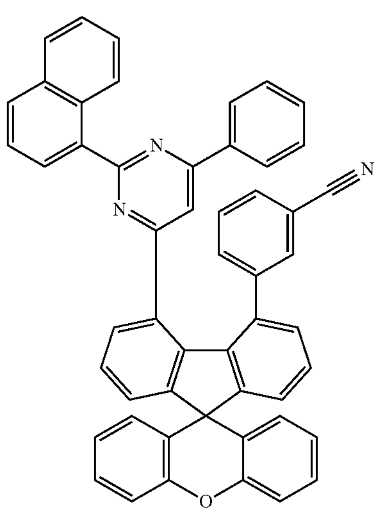
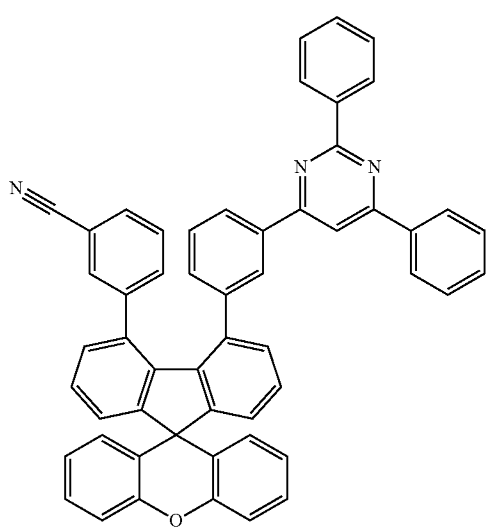

-continued
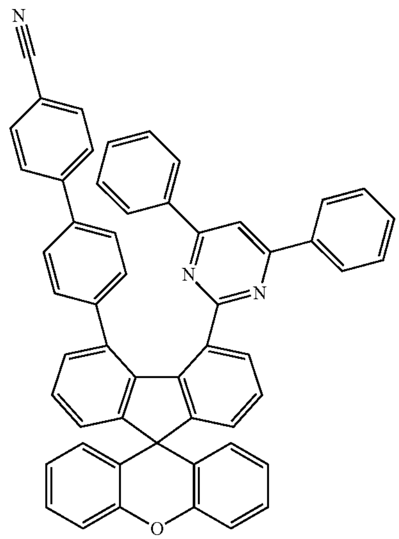
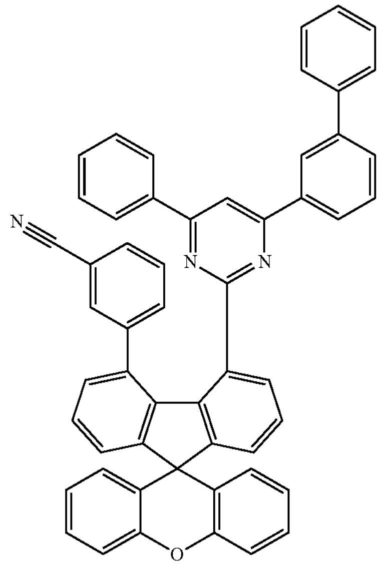
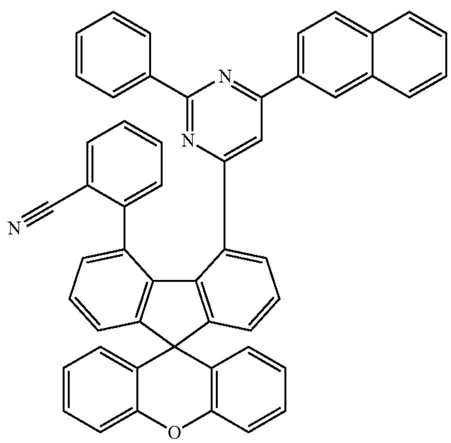
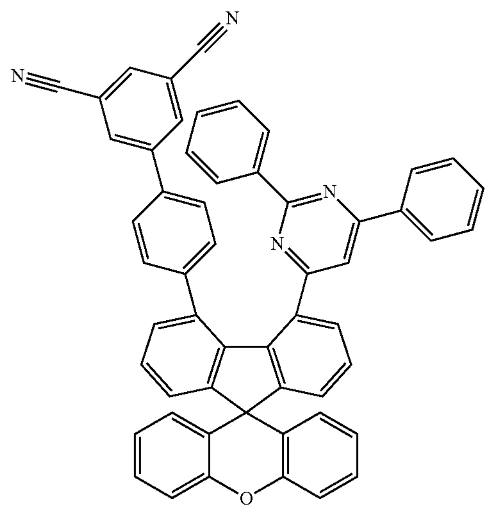
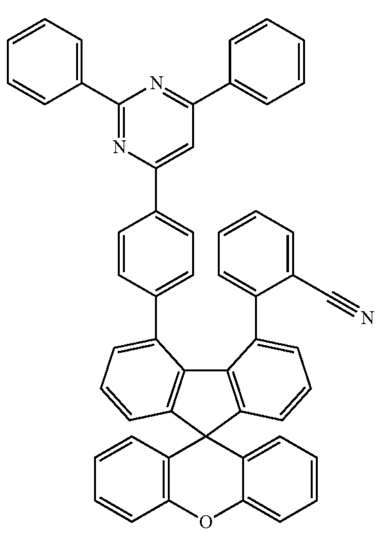
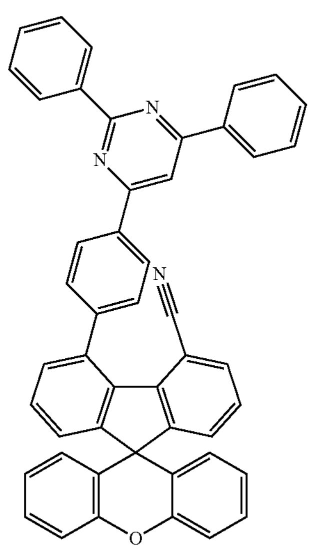

-continued
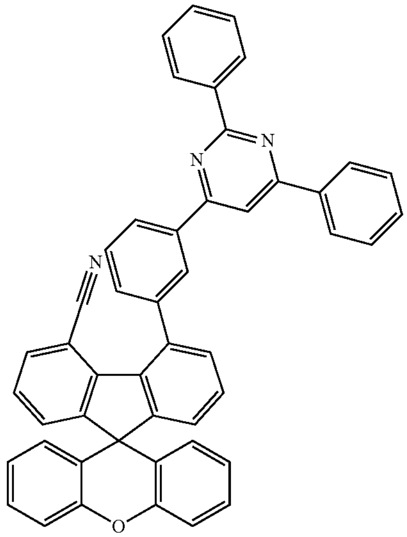
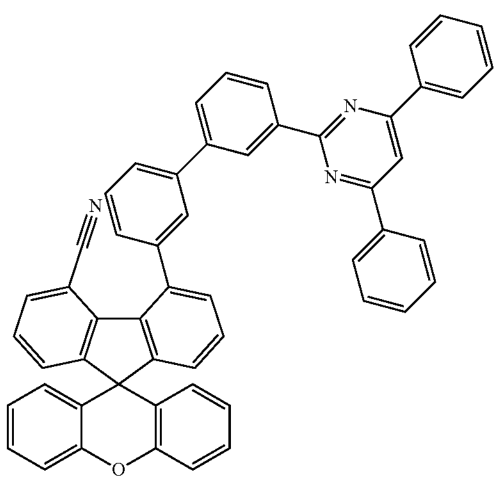
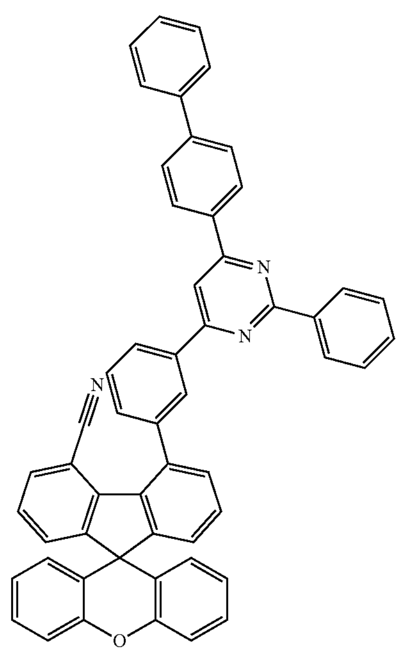

-continued
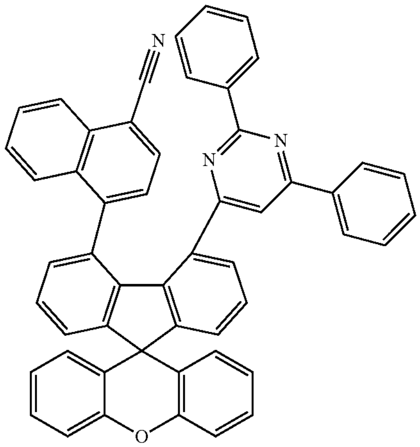
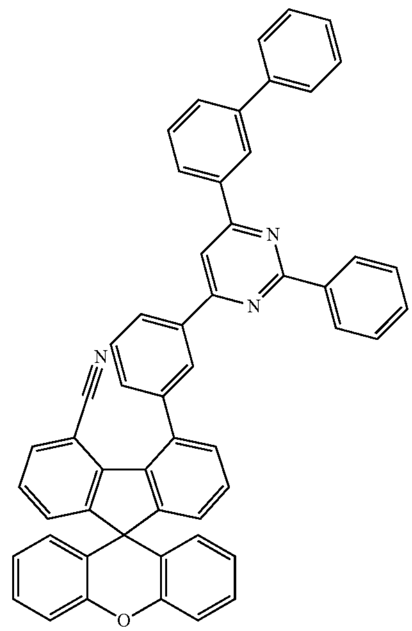
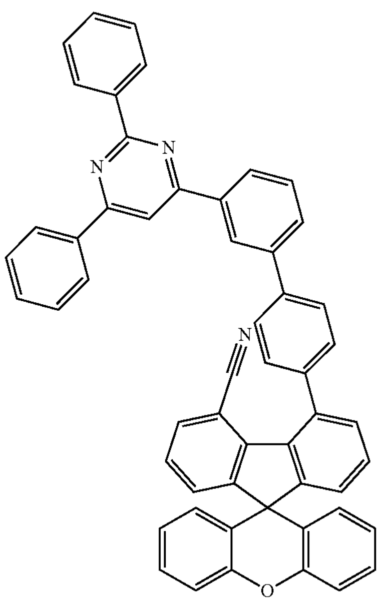
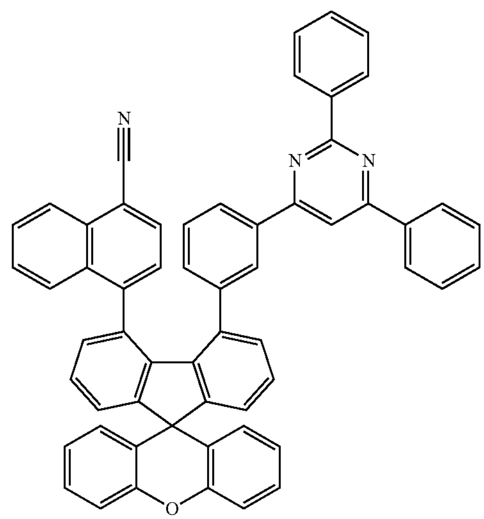
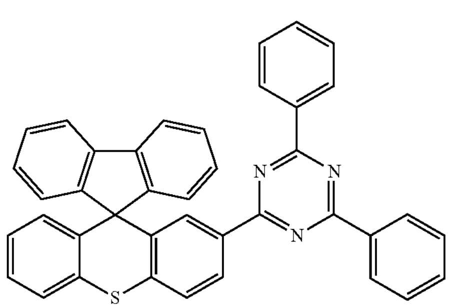
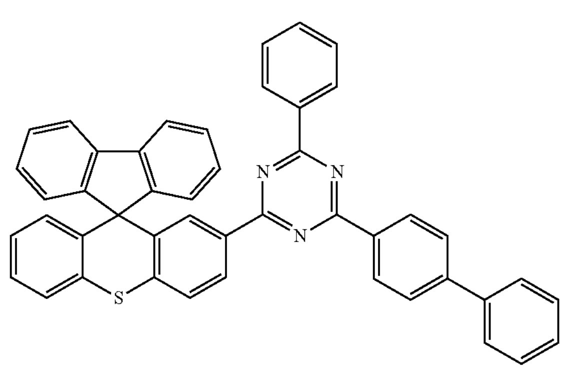

-continued
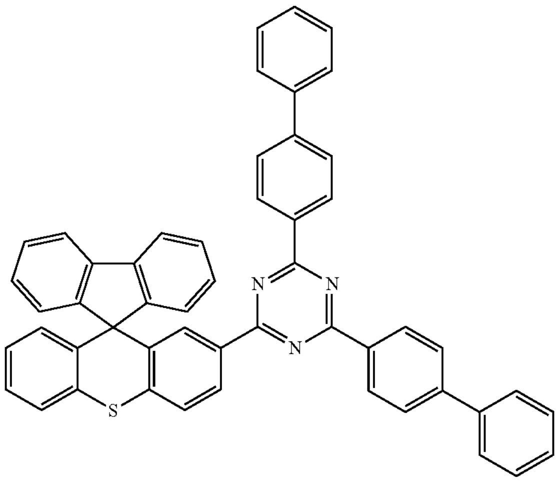
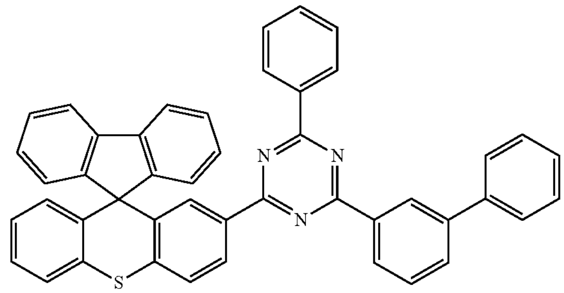
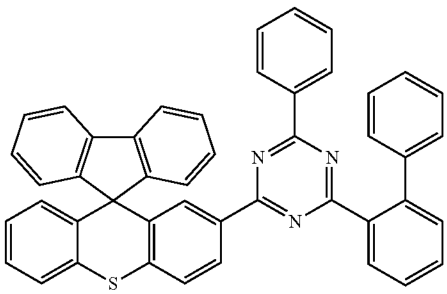
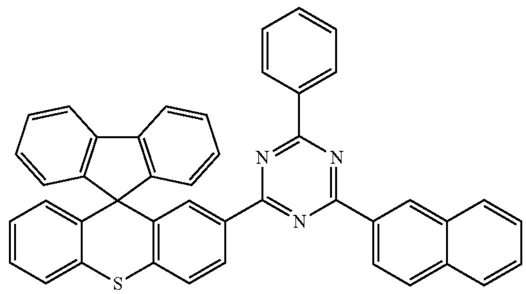
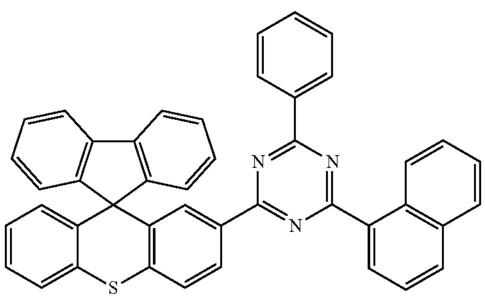
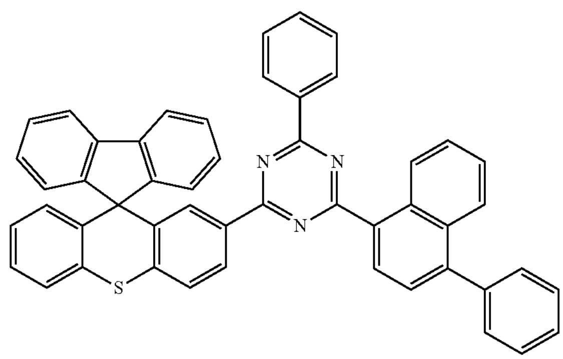
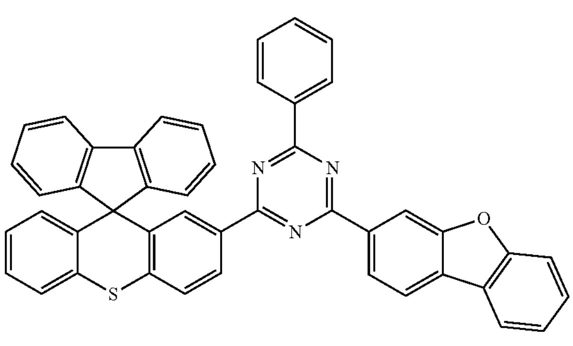
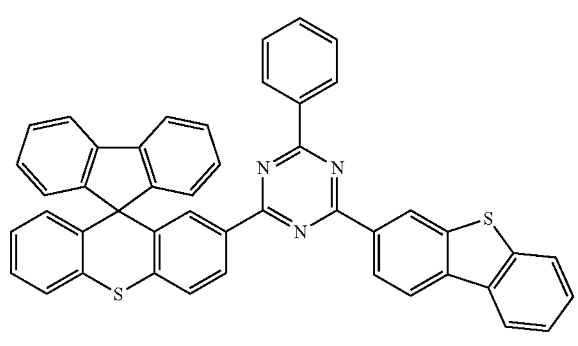

-continued
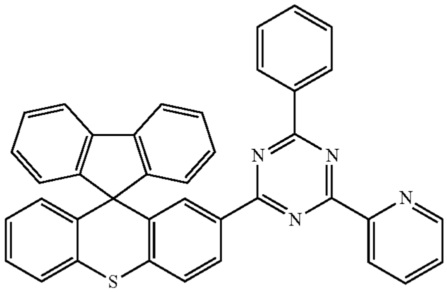
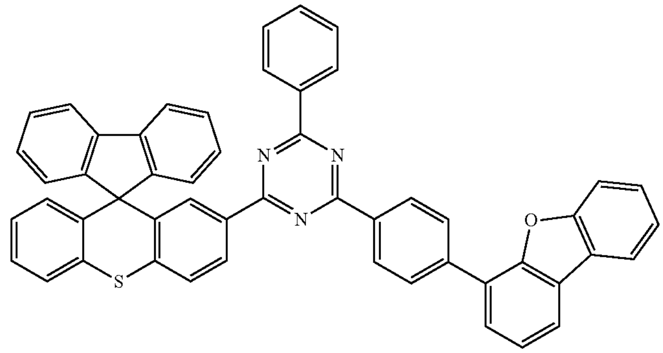
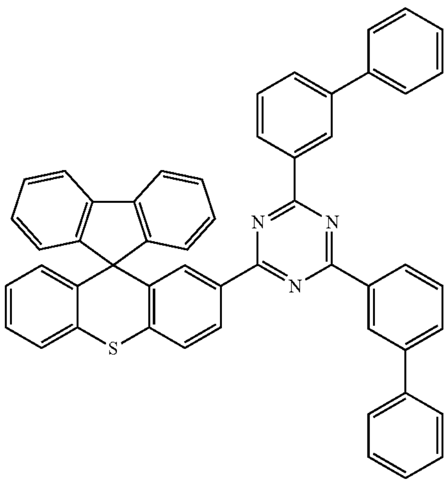
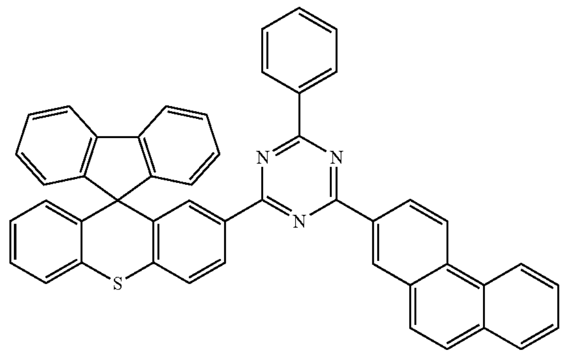
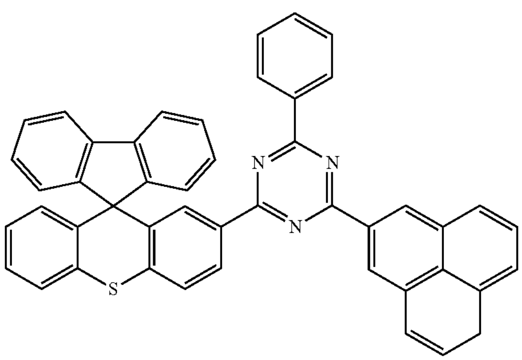
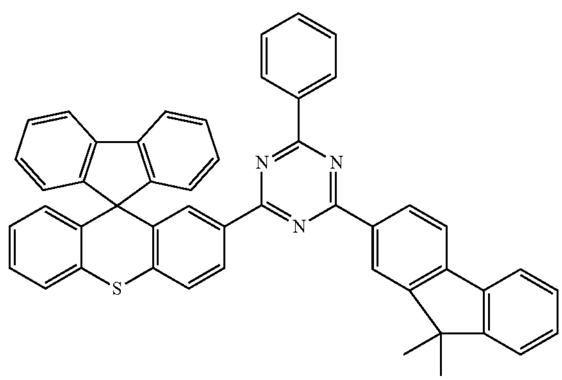
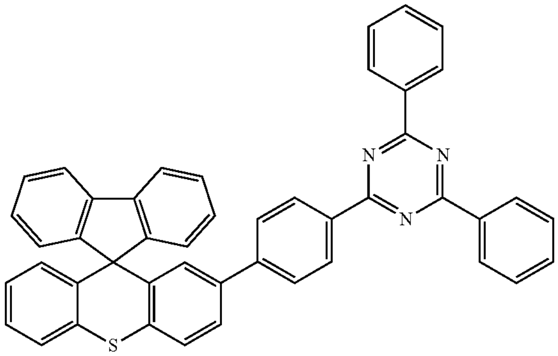

-continued
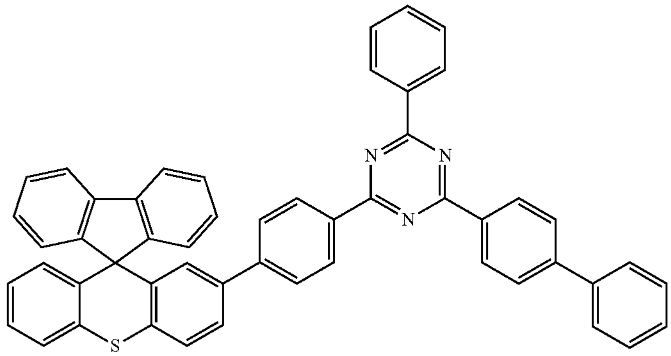
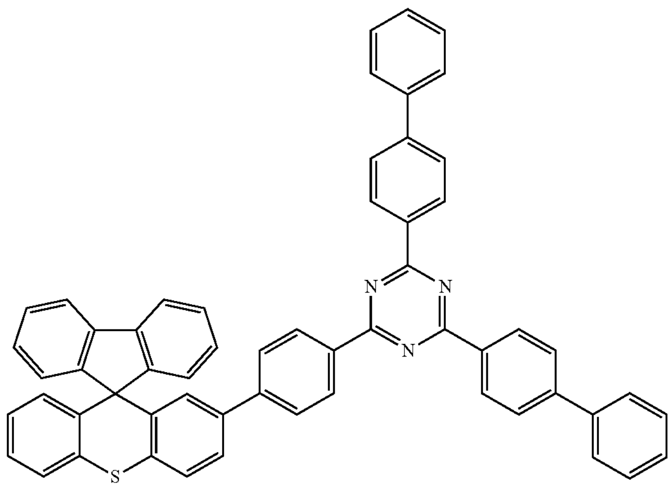
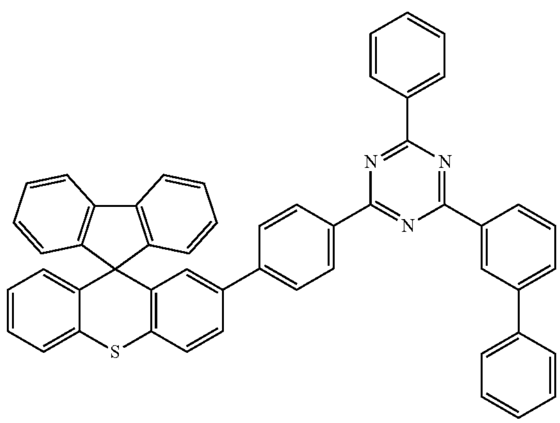
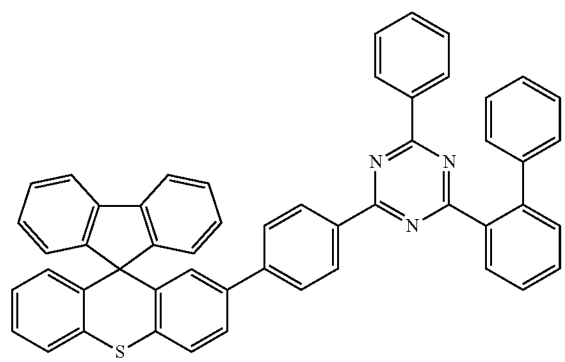
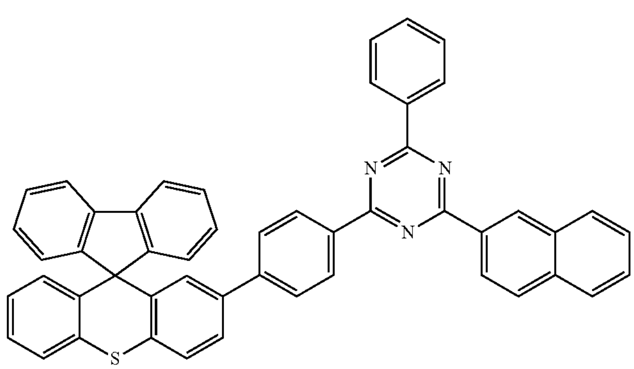

-continued
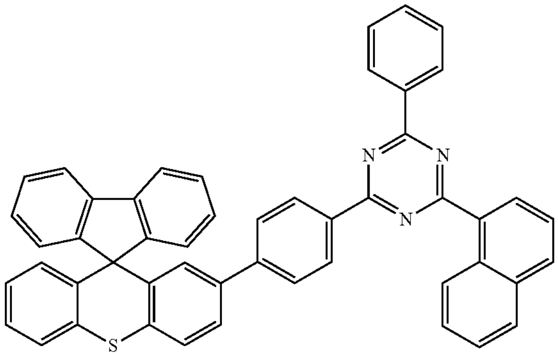
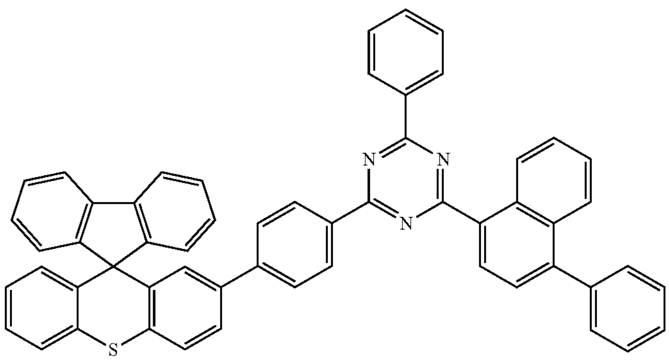
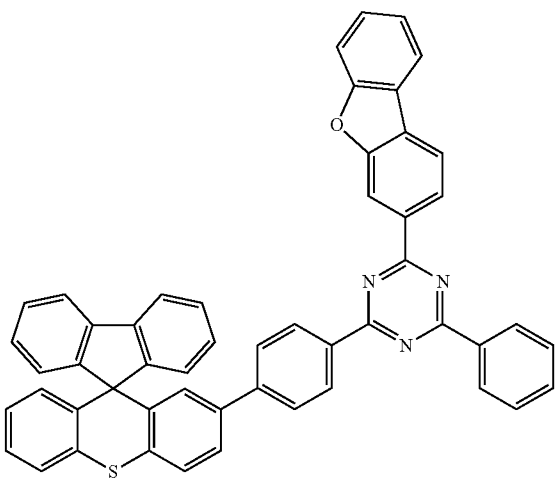
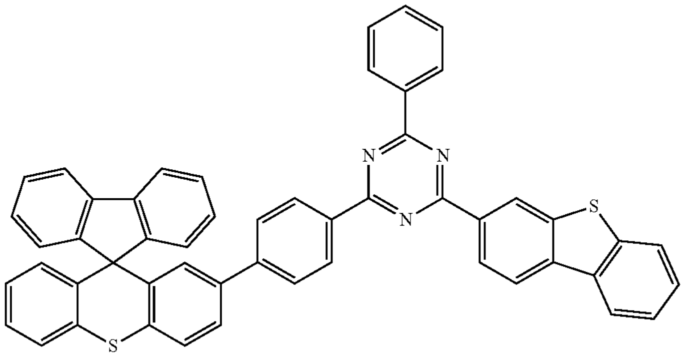

-continued
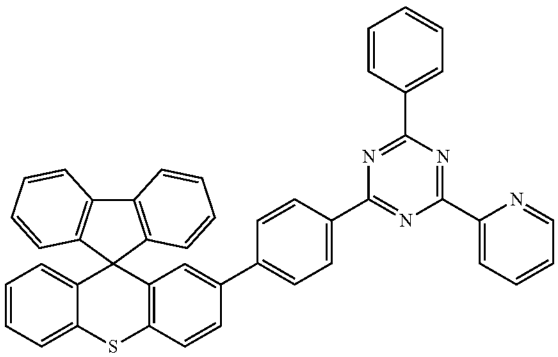
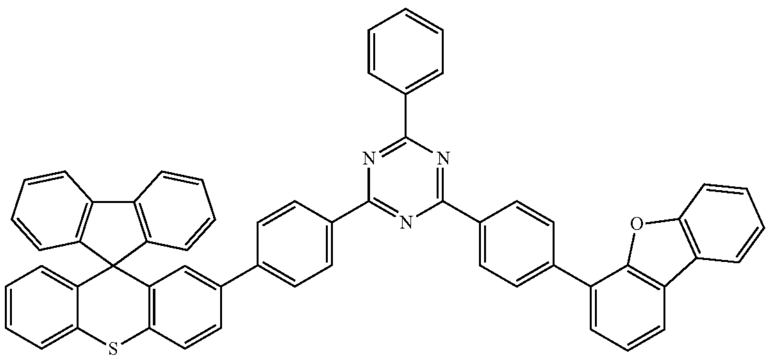
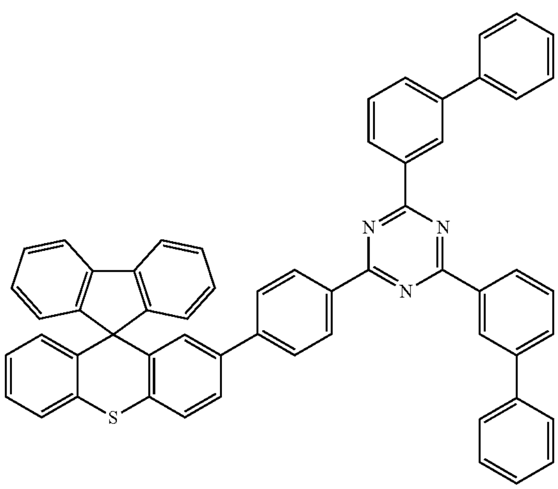
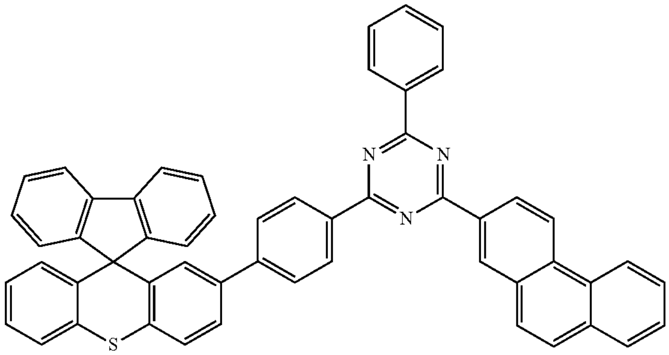

-continued
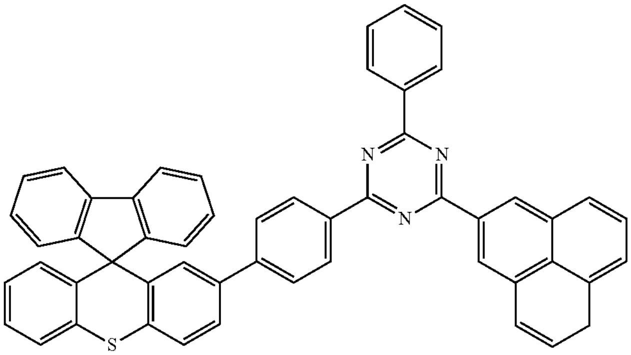
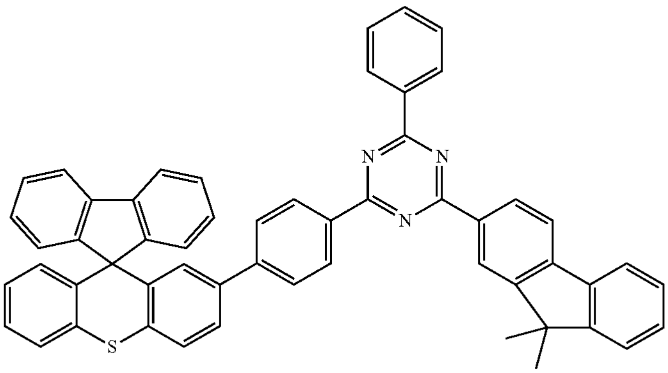
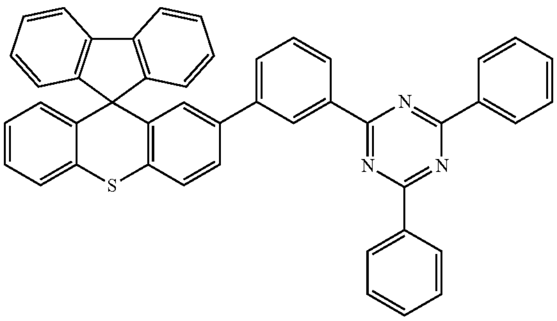
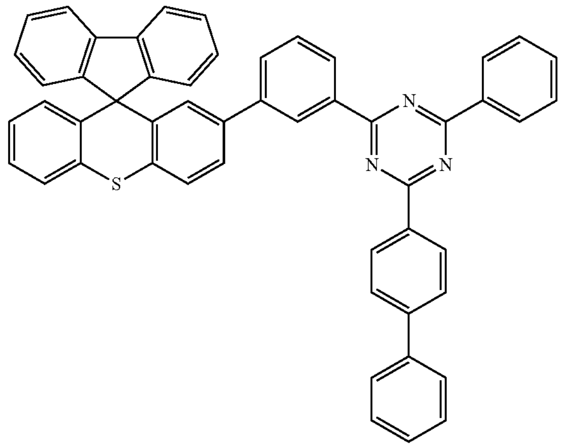
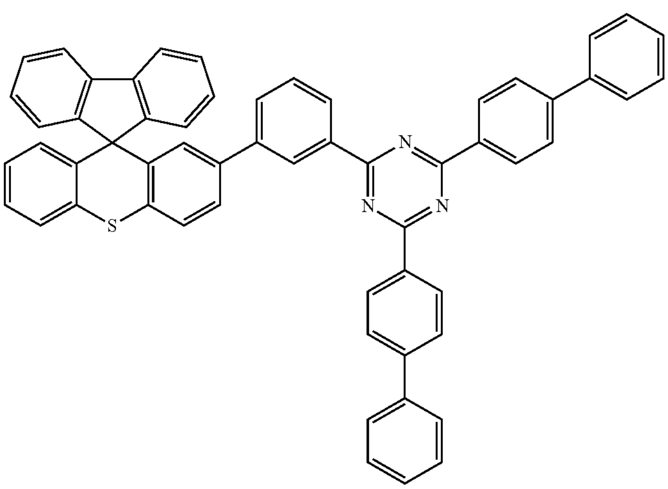

-continued
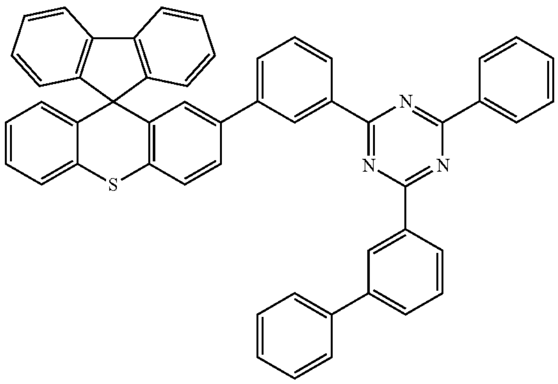
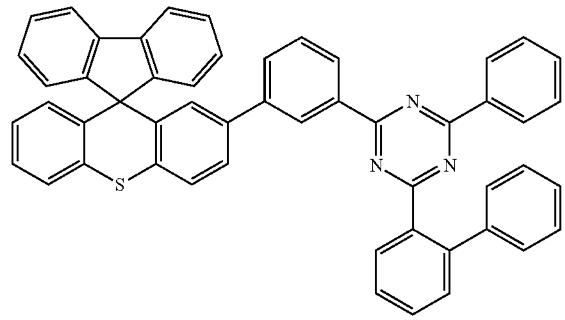
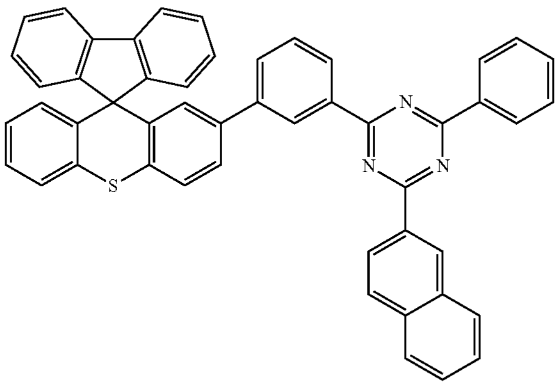
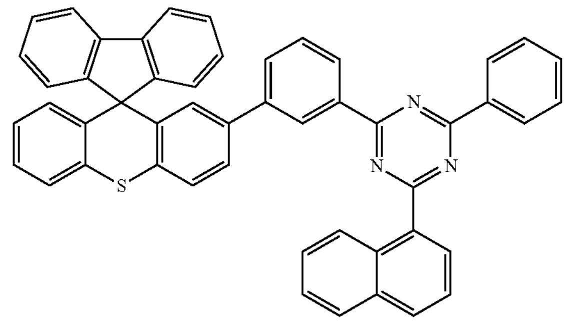
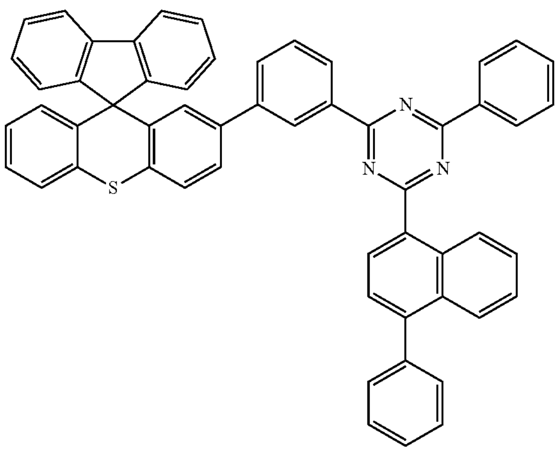
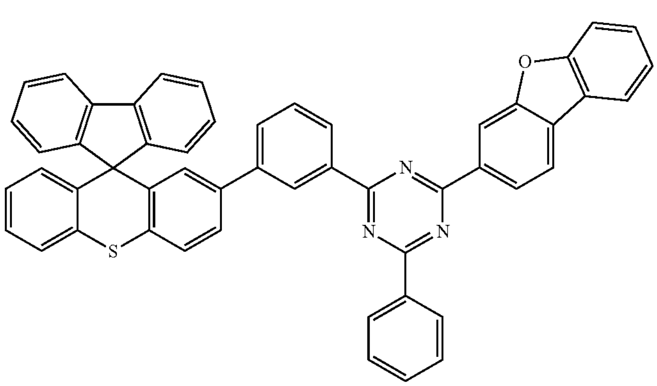

-continued
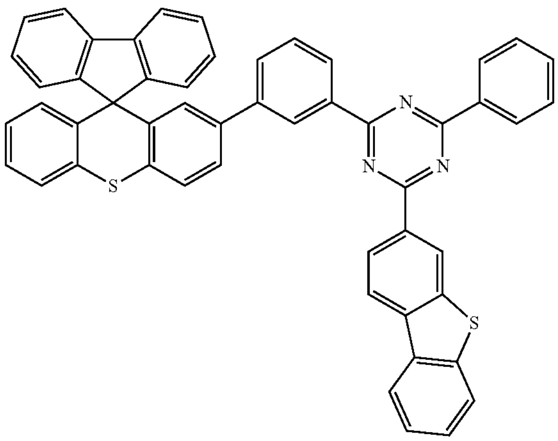
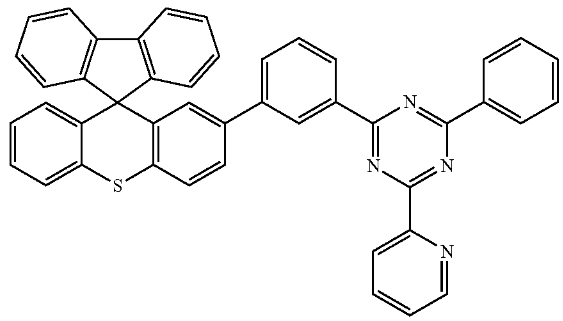
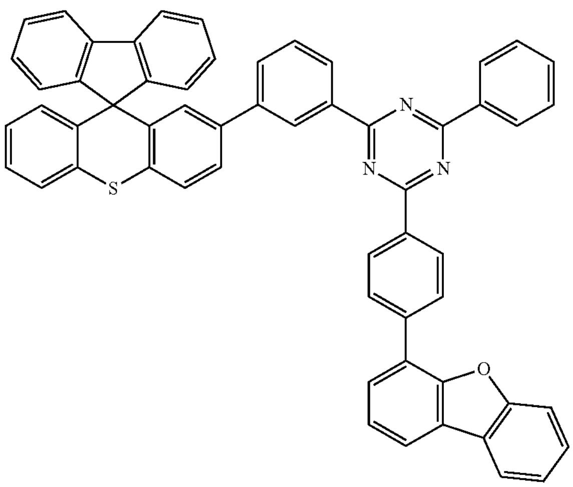
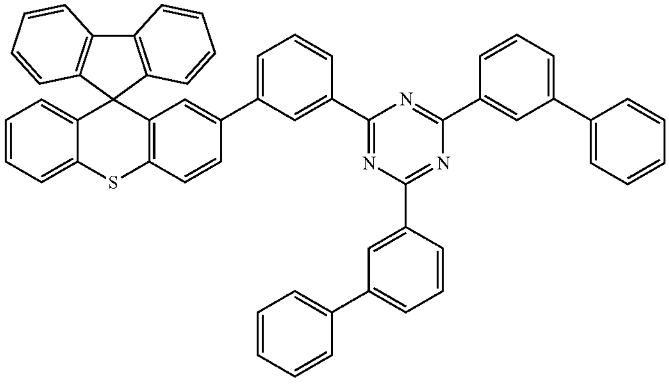

-continued
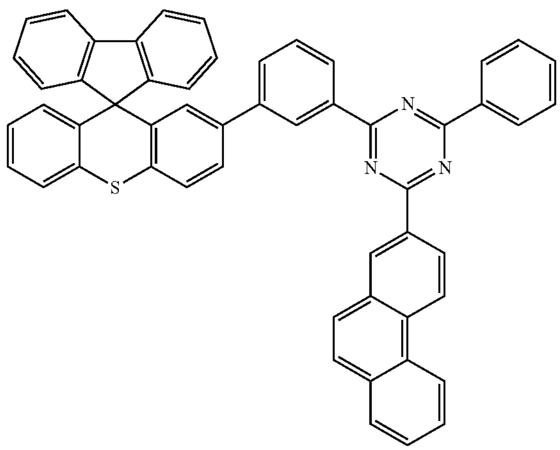
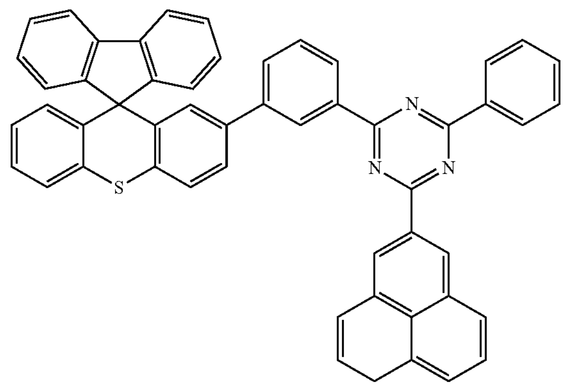
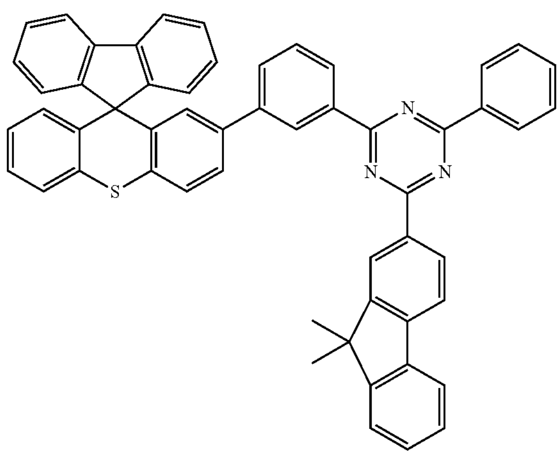 [SMILES: CC1(C)c2ccccc2-c2ccc(-c3nc(-c4ccccc4)nc(-c4cccc(-c5ccc6c(c5)C5(c7ccccc7S6)c6ccccc6-c6ccccc65)c4)n3)cc21]
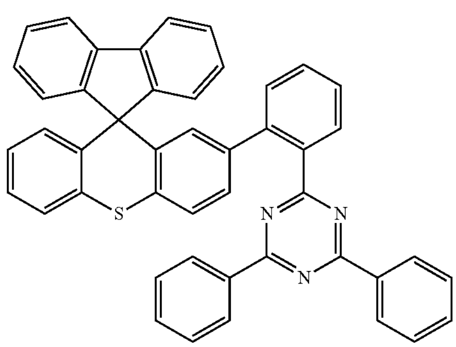
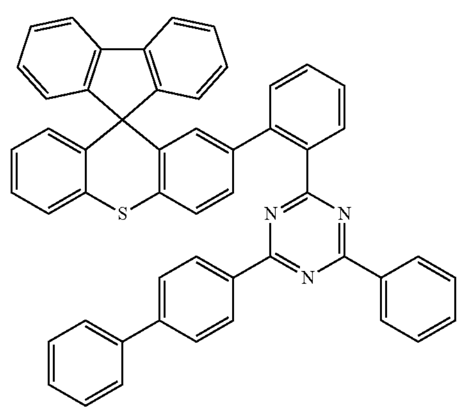

-continued
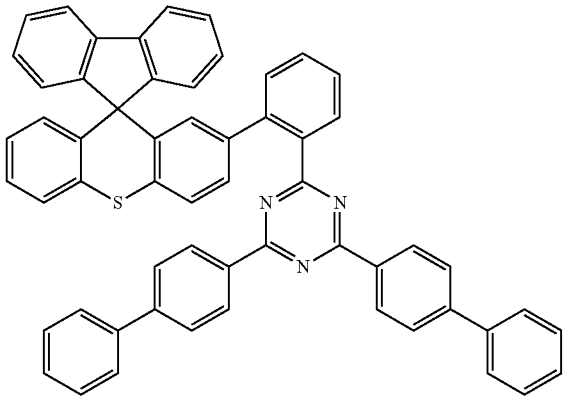
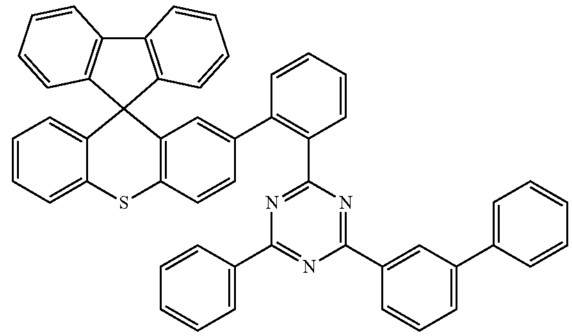
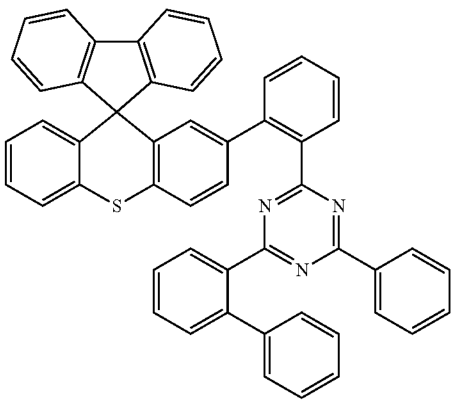
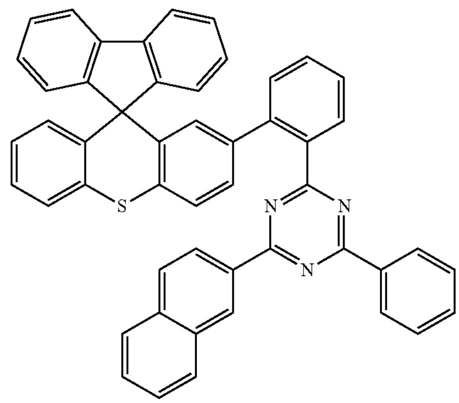
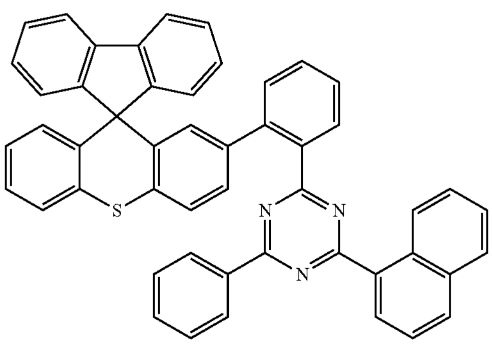
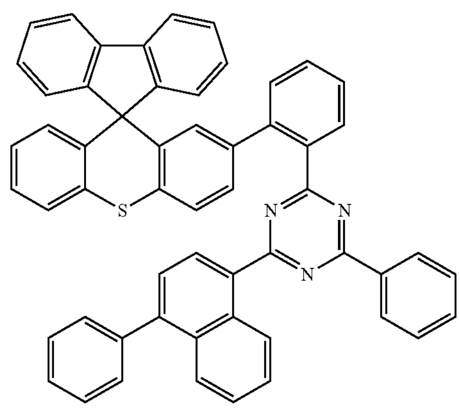
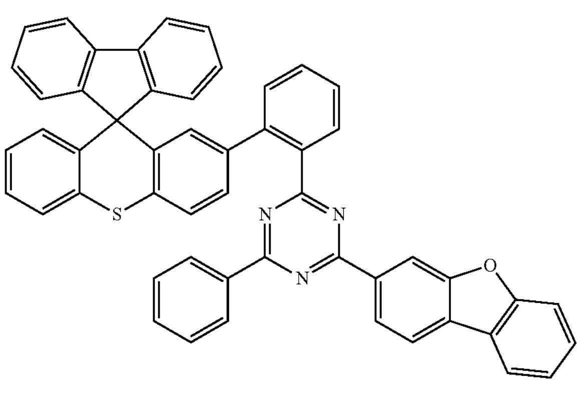
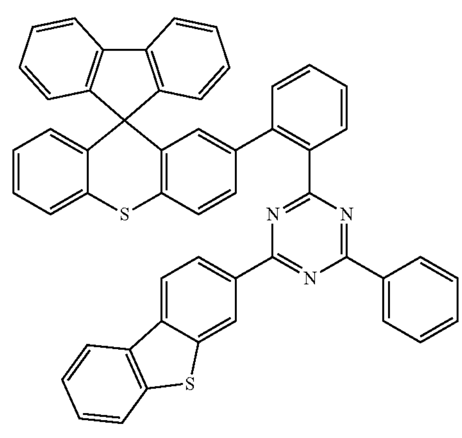

-continued
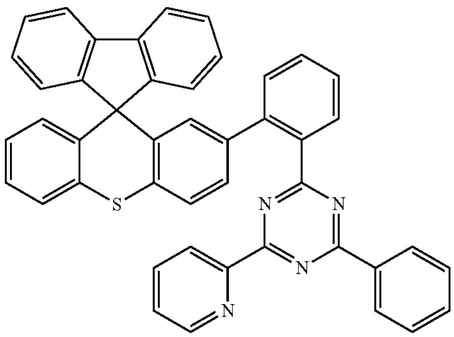
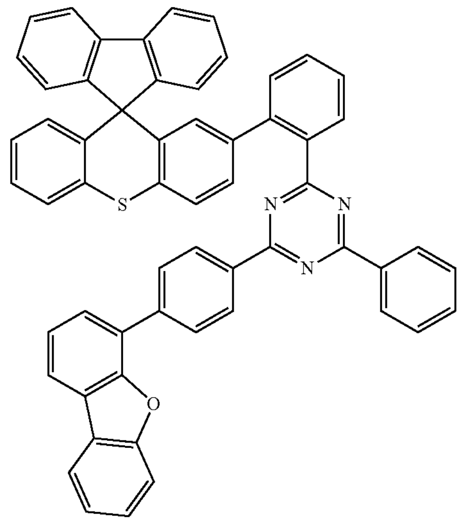
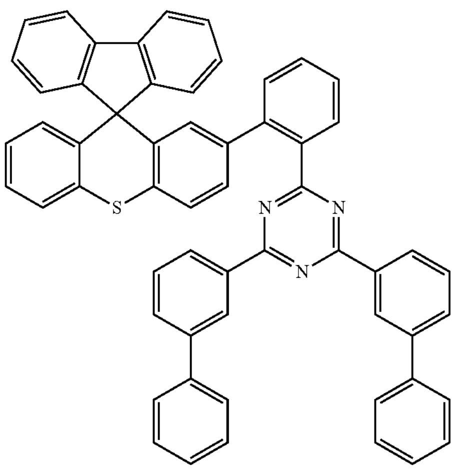
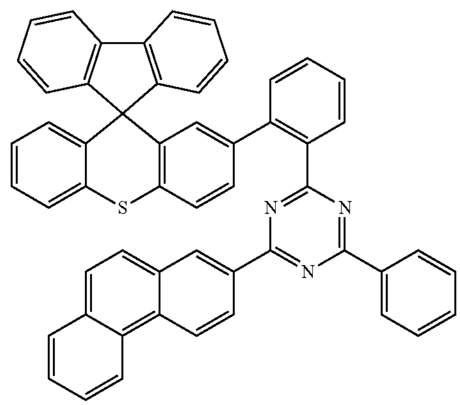
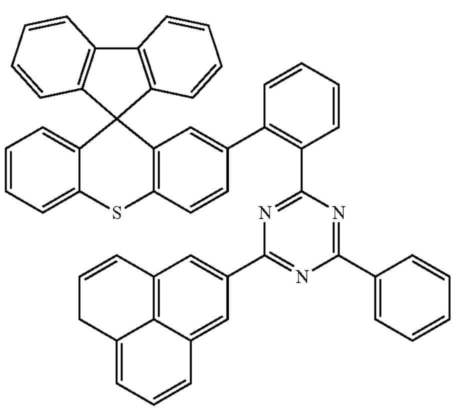
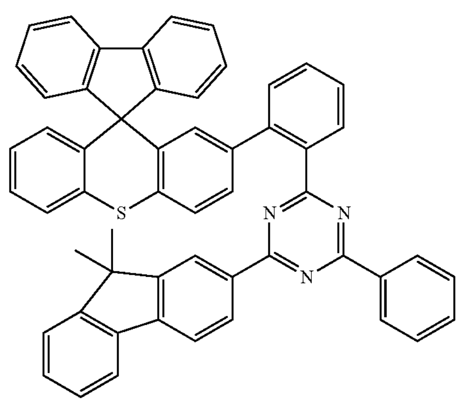
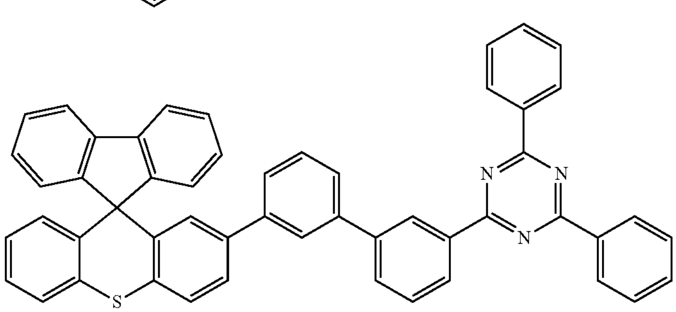

-continued
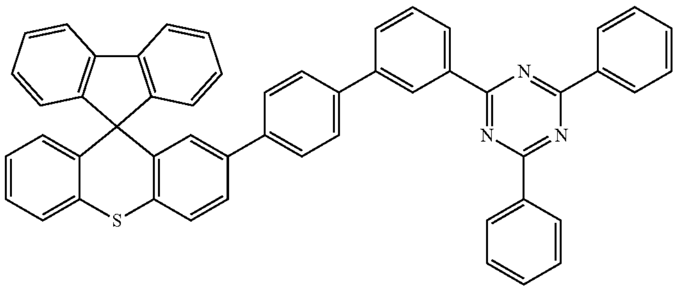
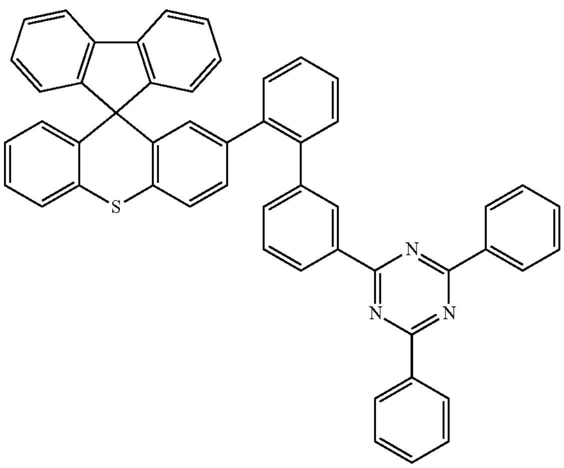
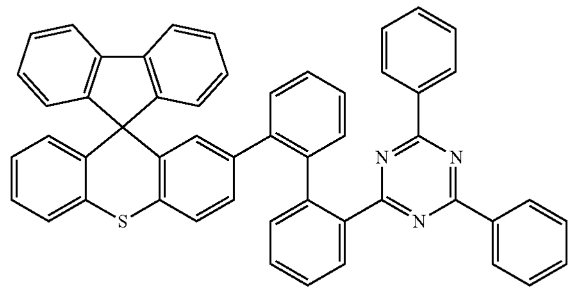
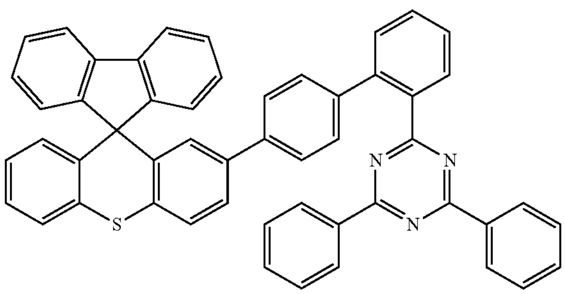
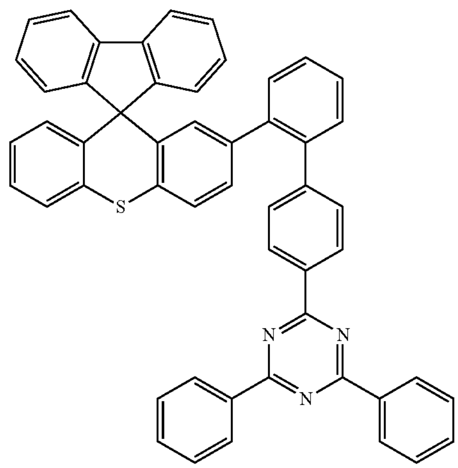
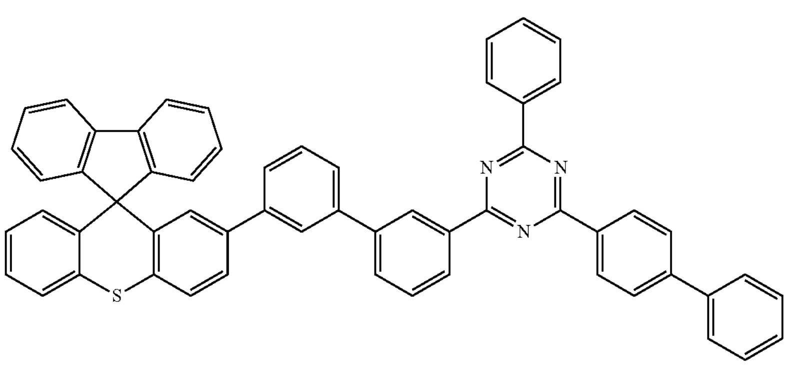

-continued
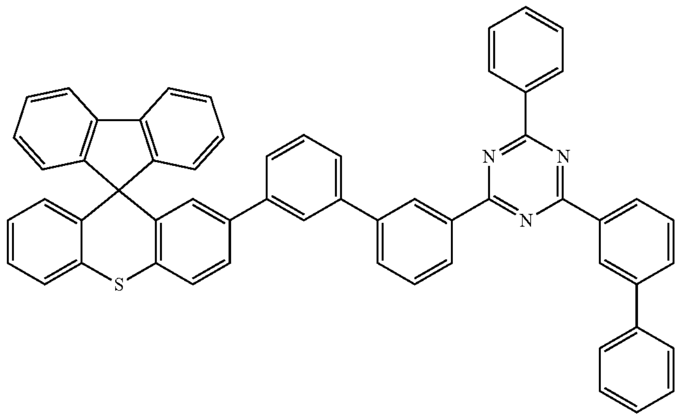
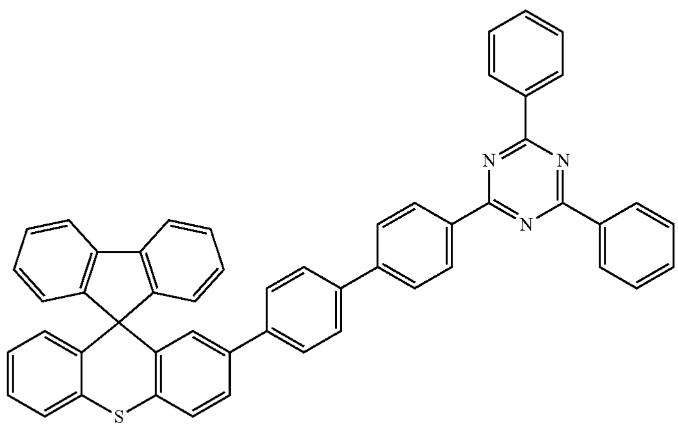
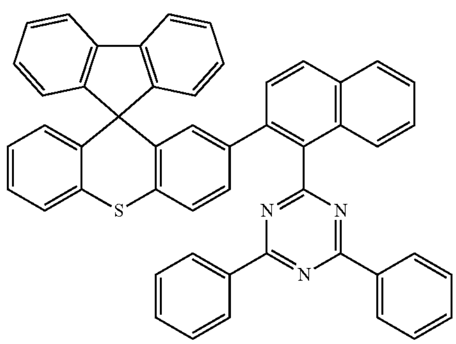
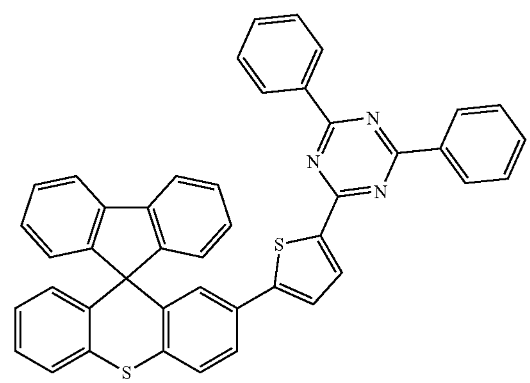
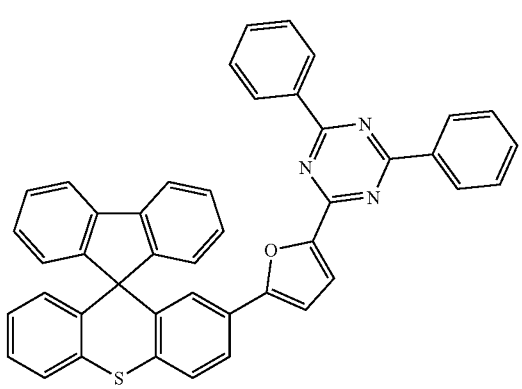
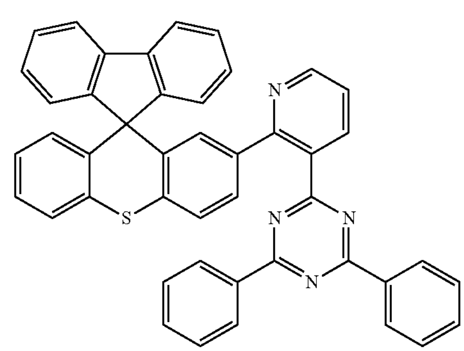

-continued
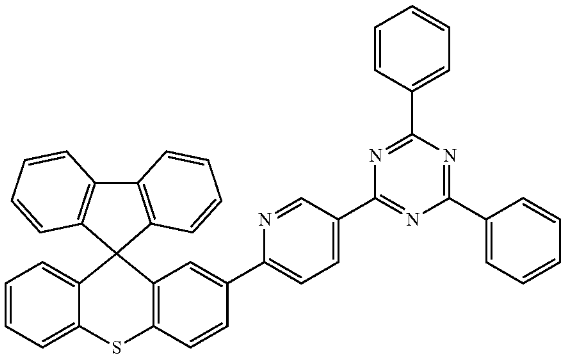
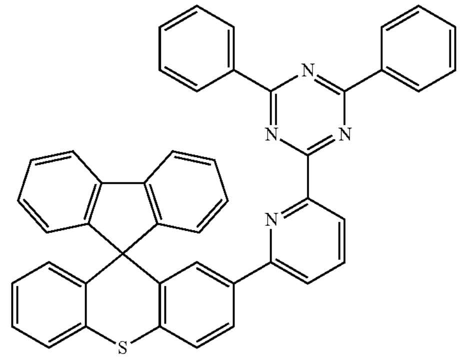
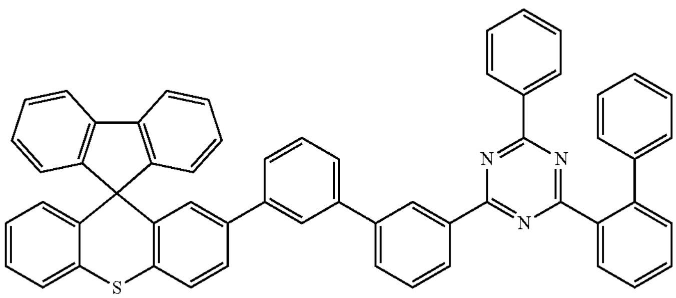
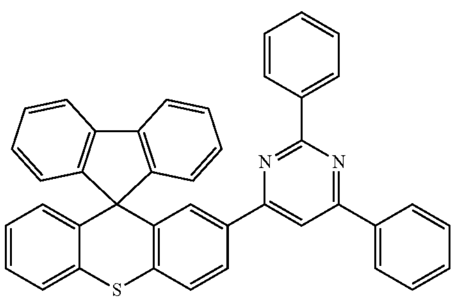
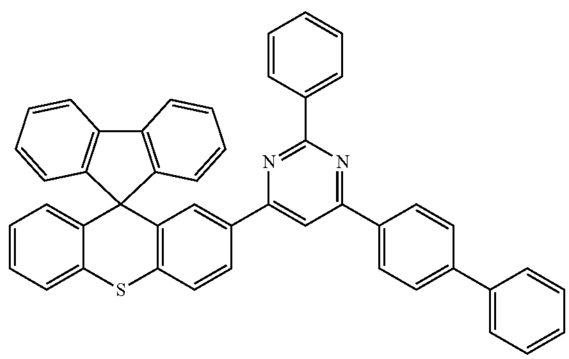
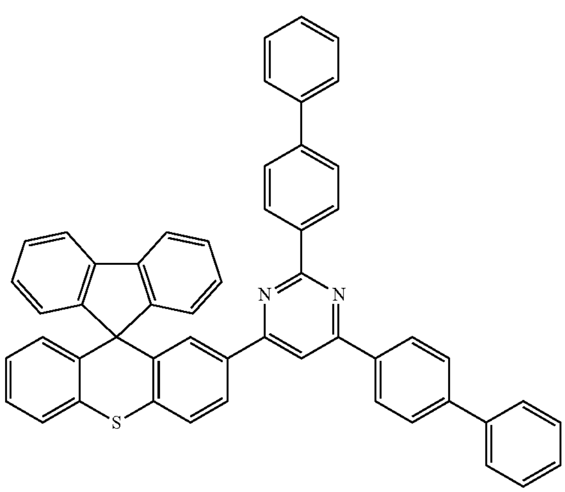
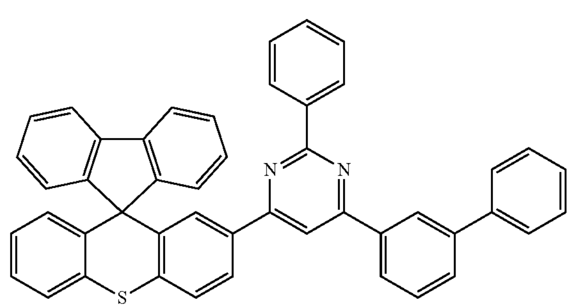

-continued
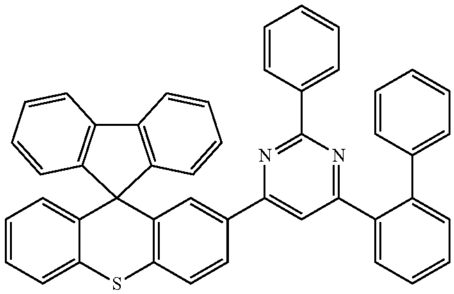
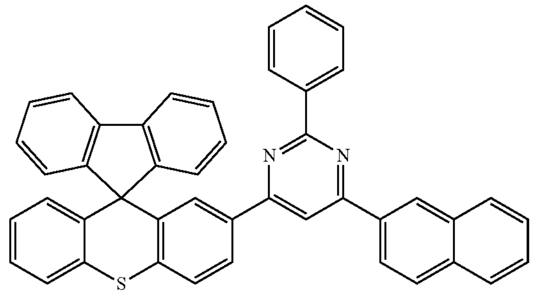
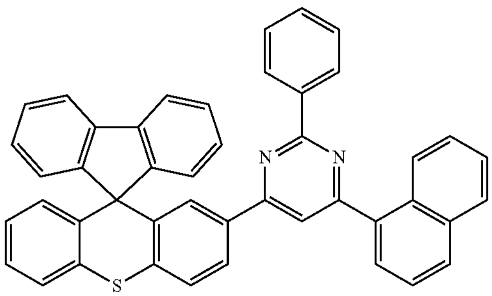
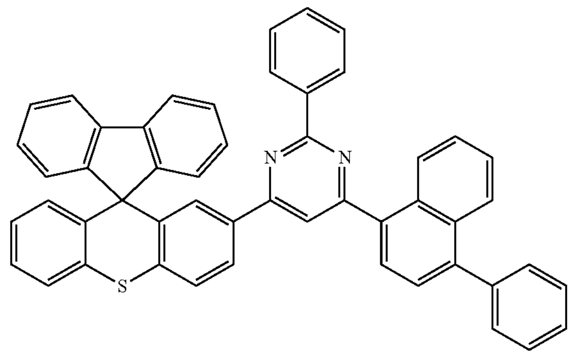
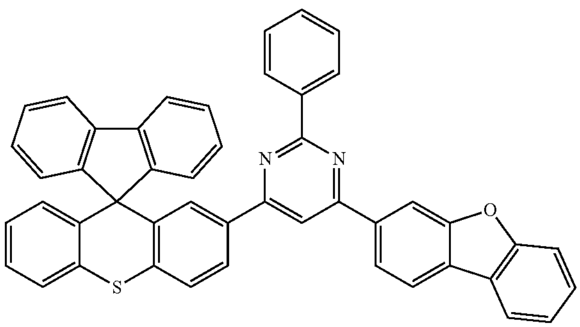
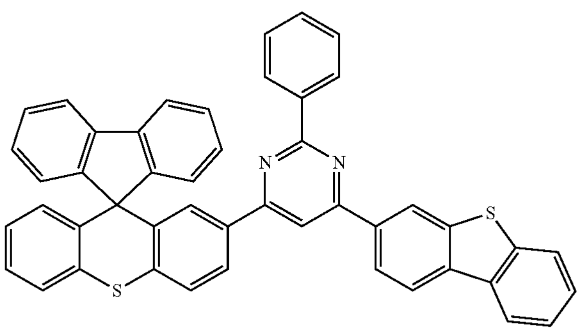
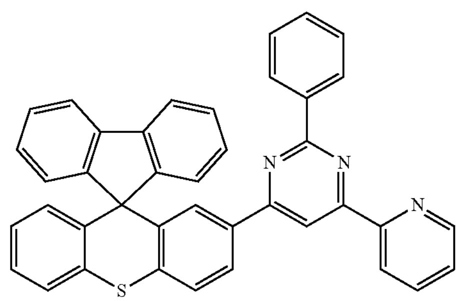
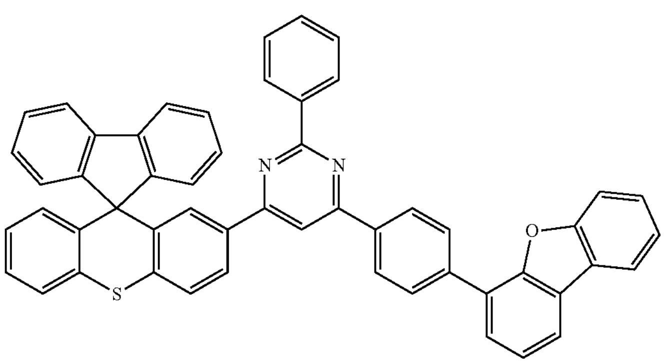

-continued
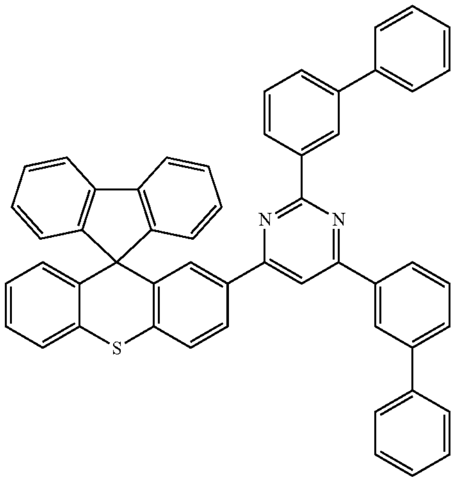
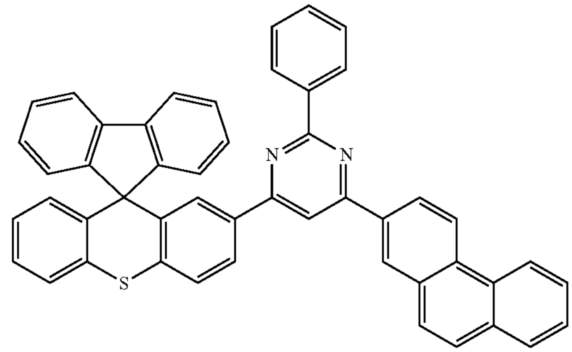
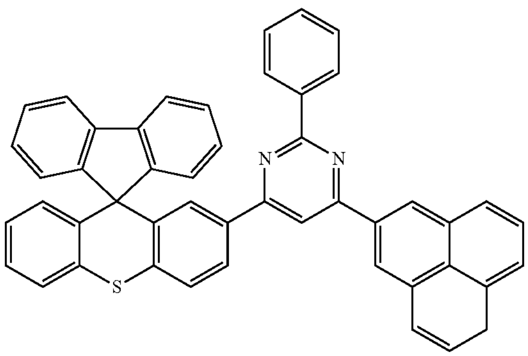
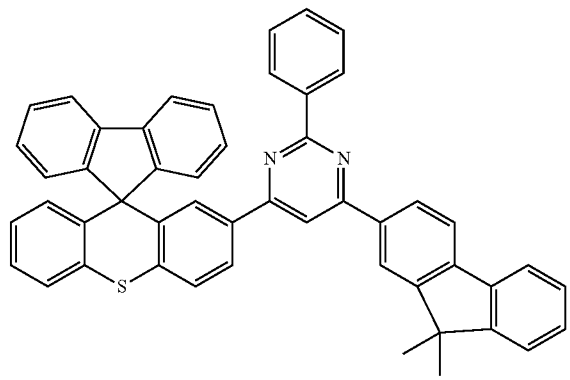
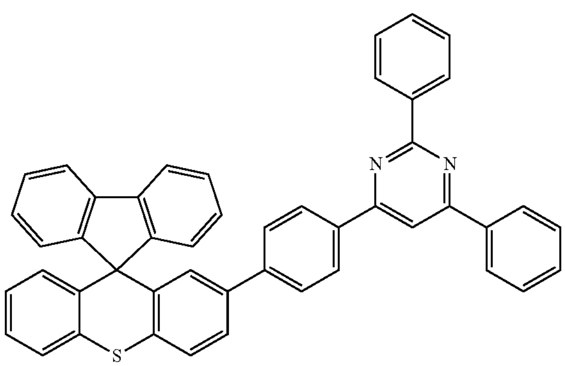
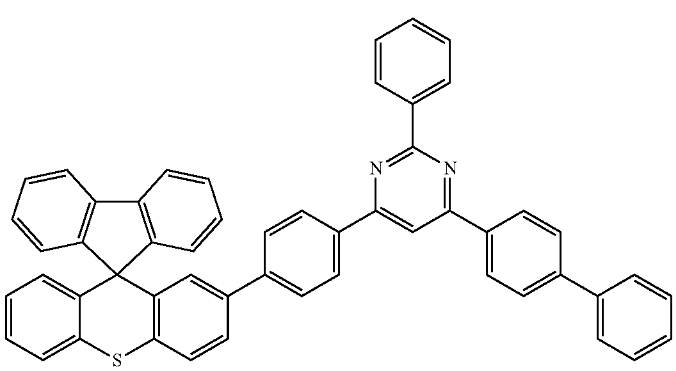

-continued
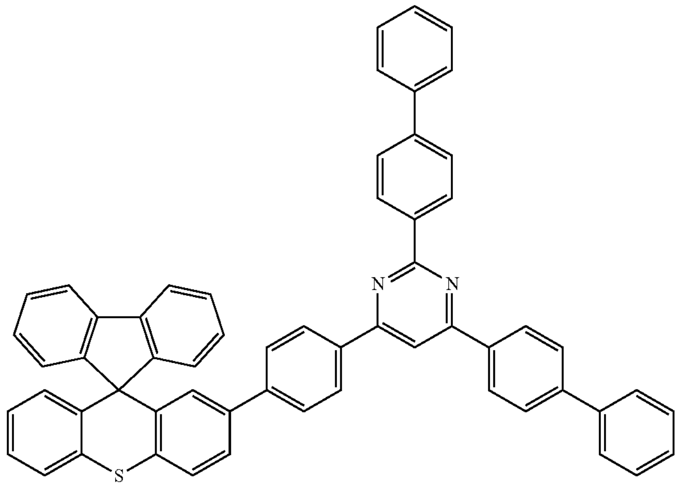
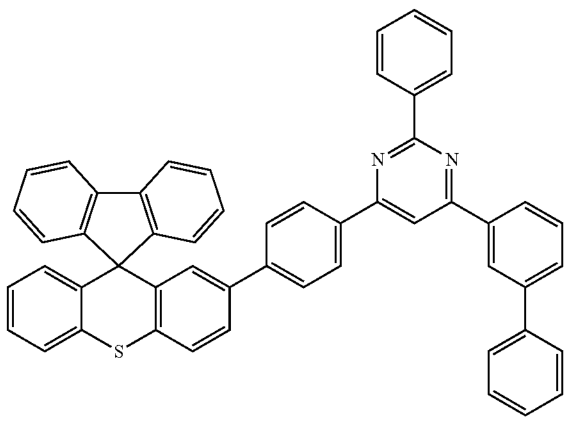
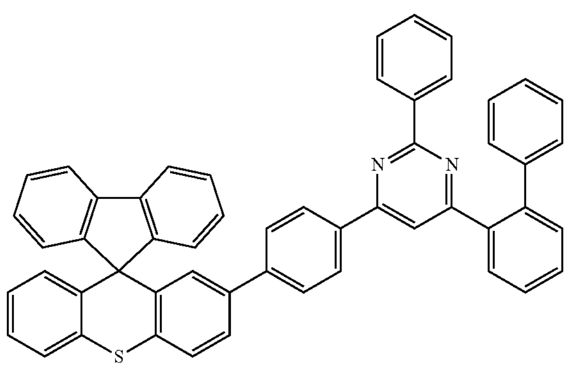
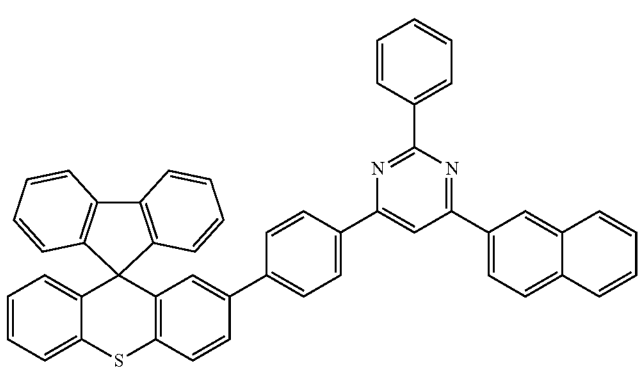

-continued
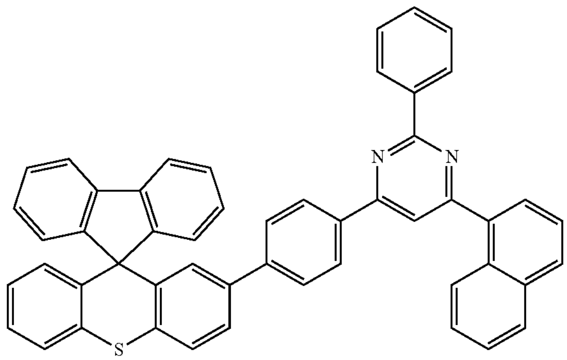
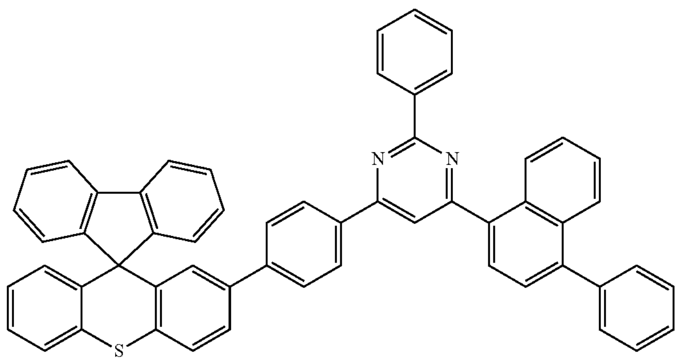
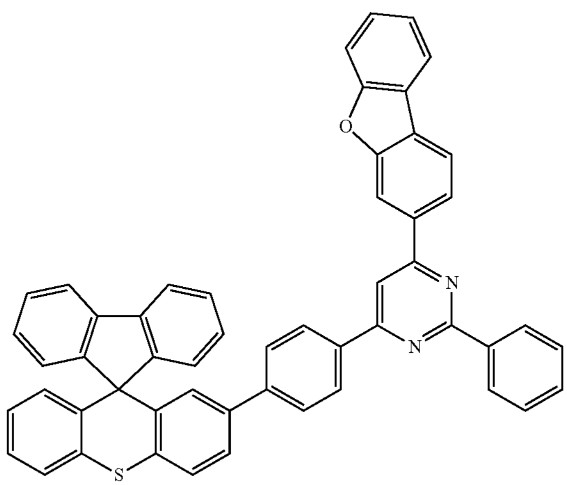
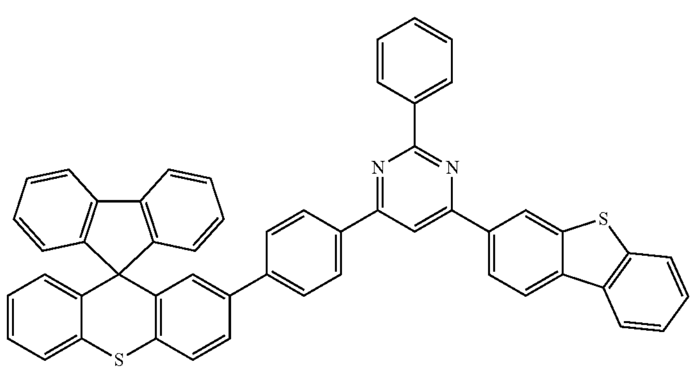

-continued
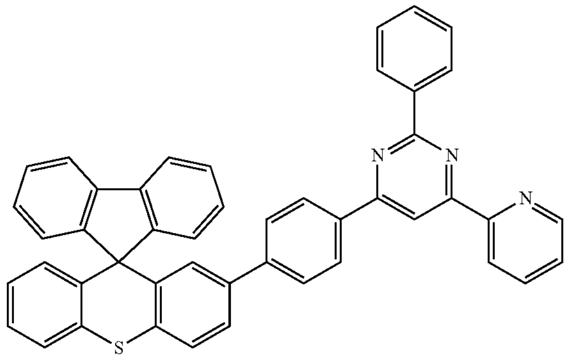
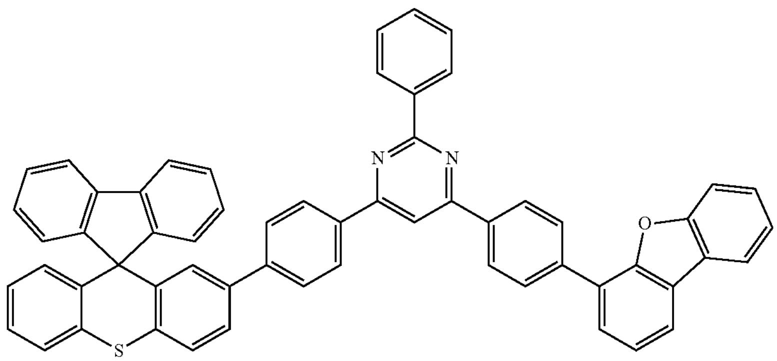
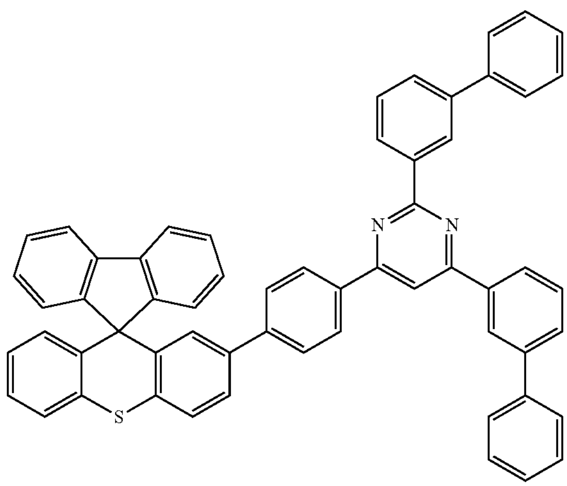
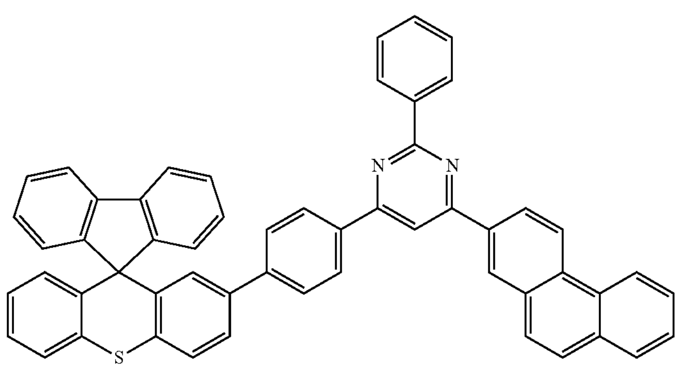

-continued
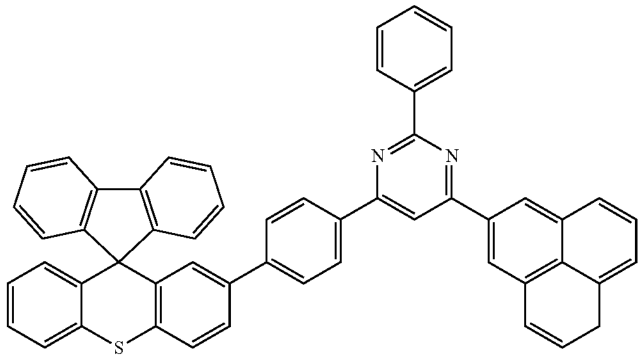
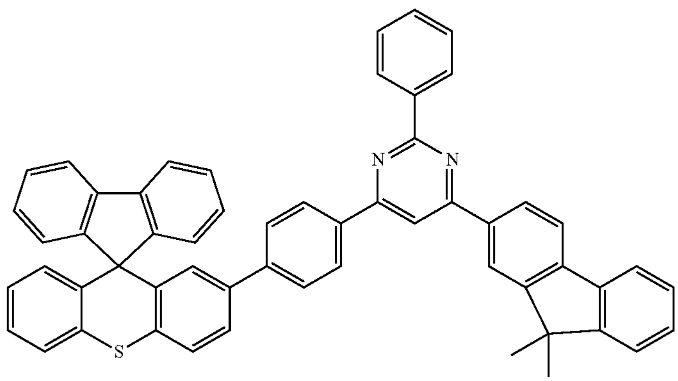
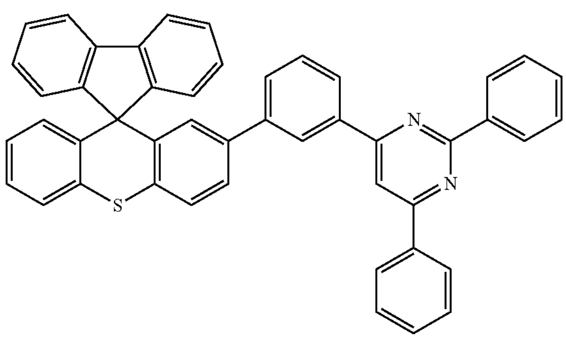
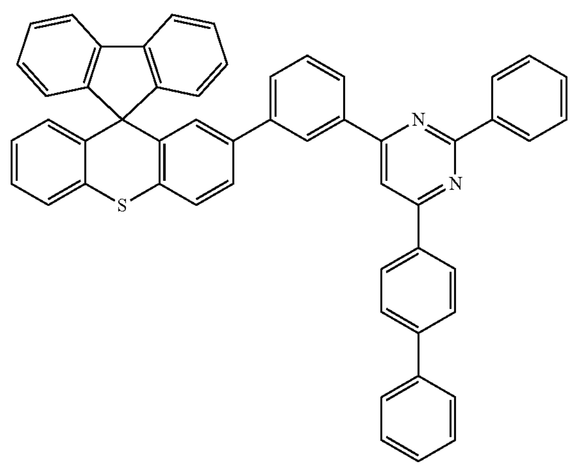
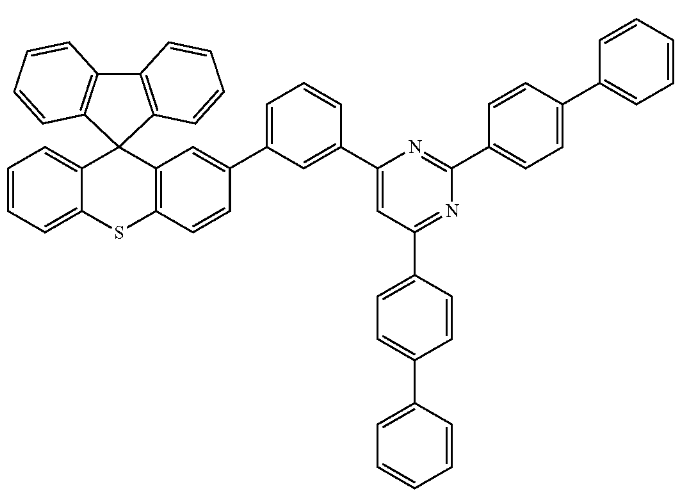

-continued
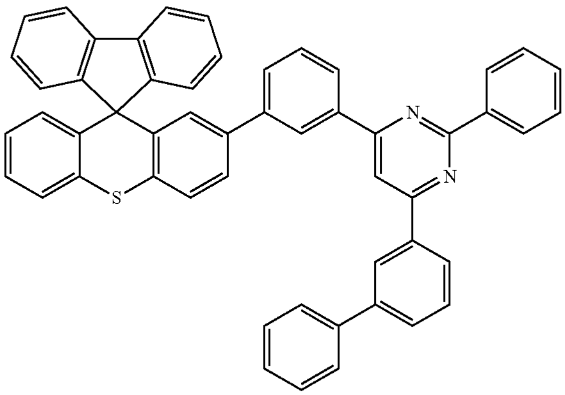
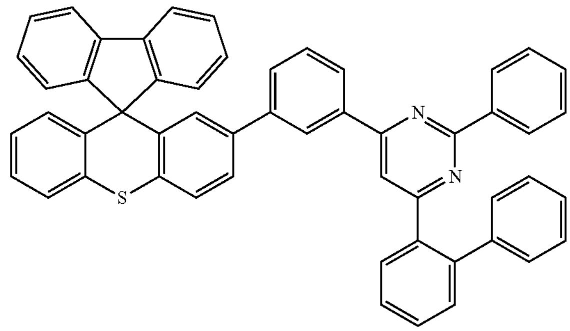
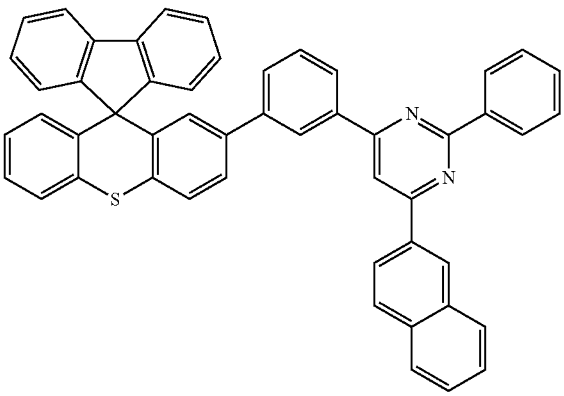
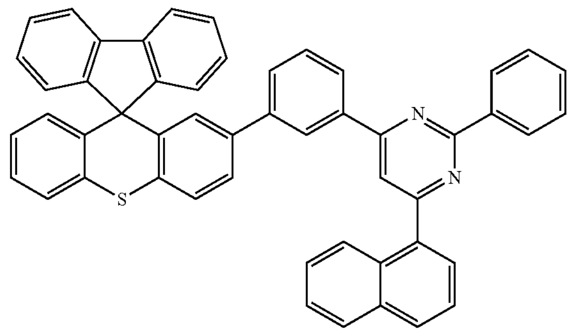
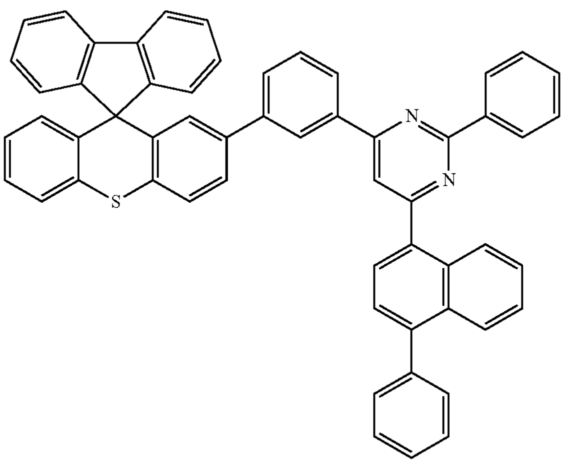
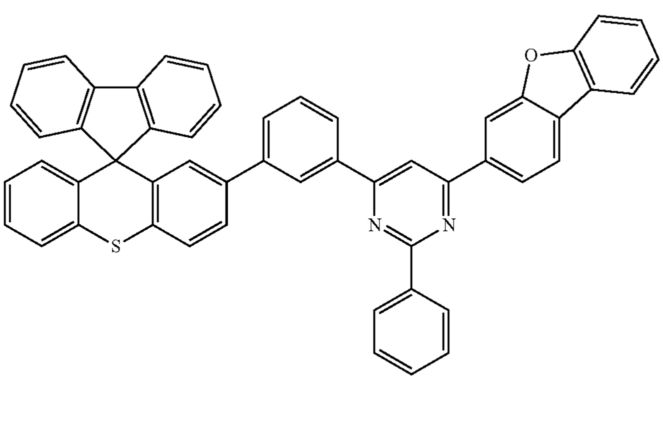

-continued
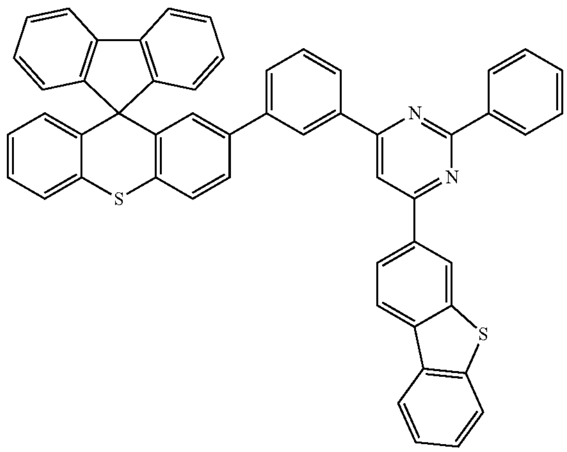
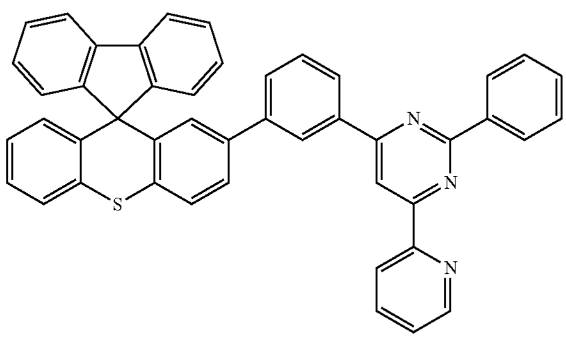
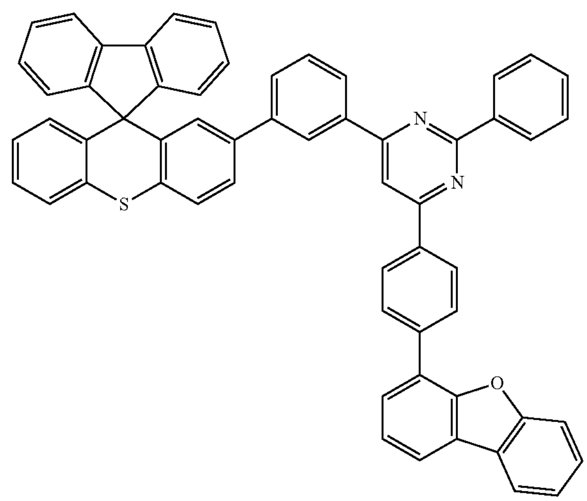
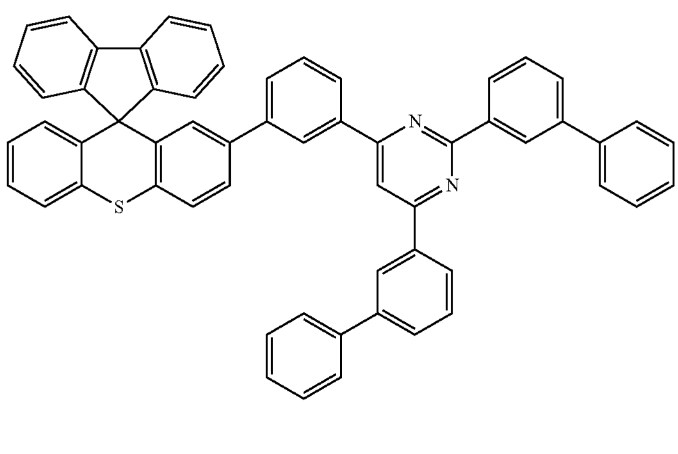

-continued
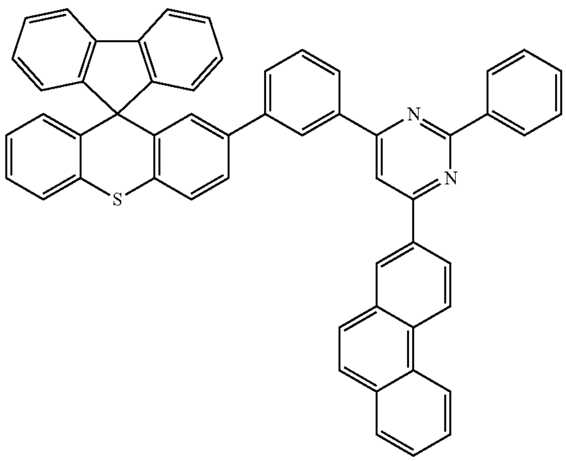
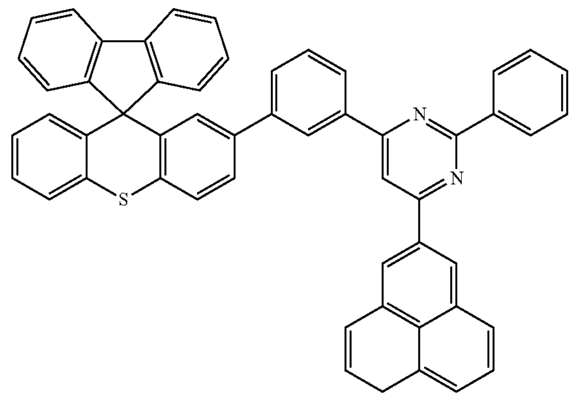
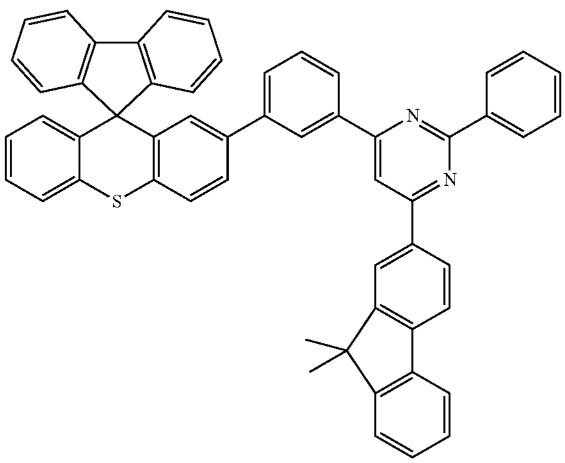
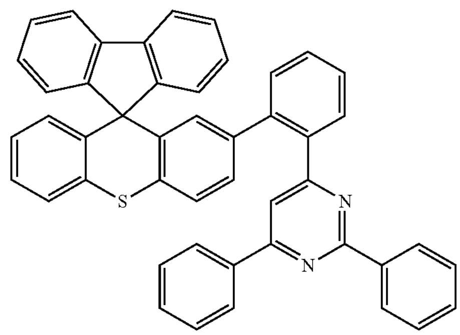
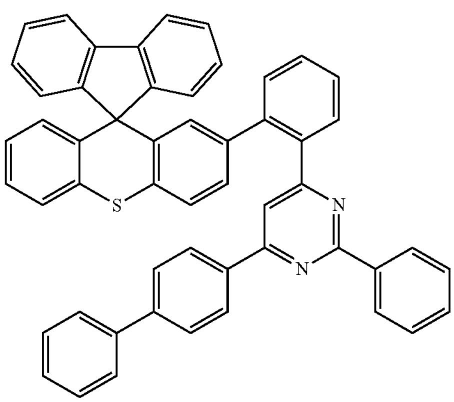
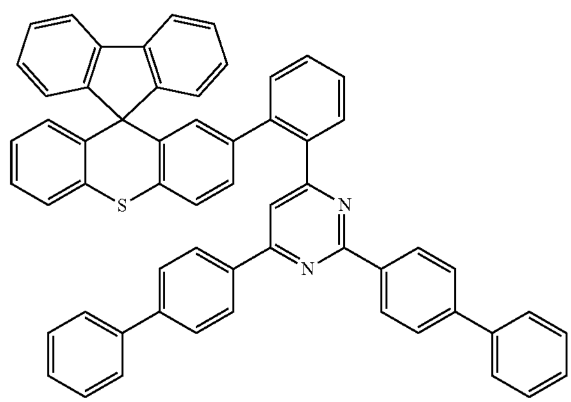
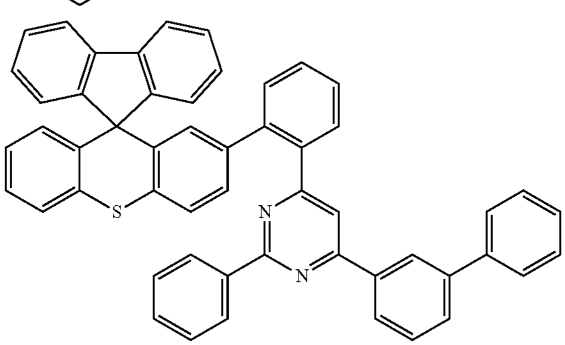
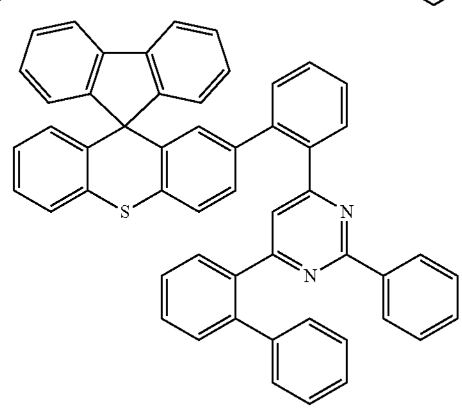

-continued
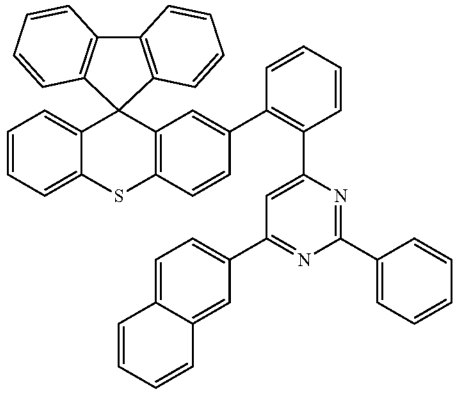
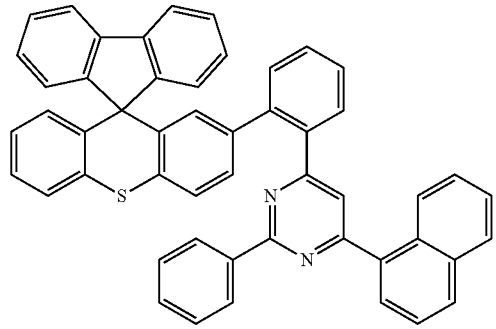
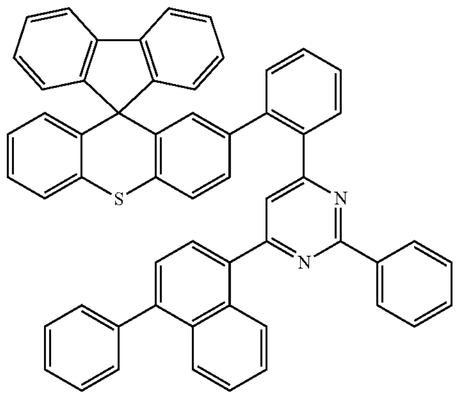
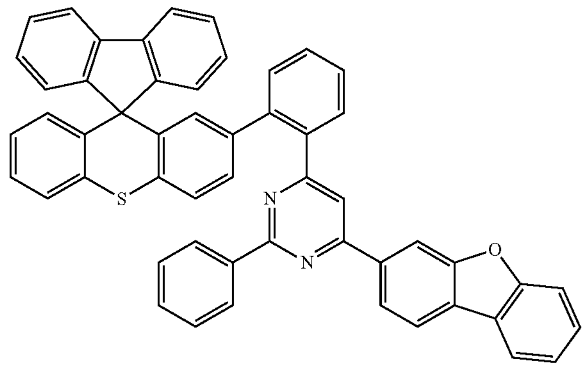
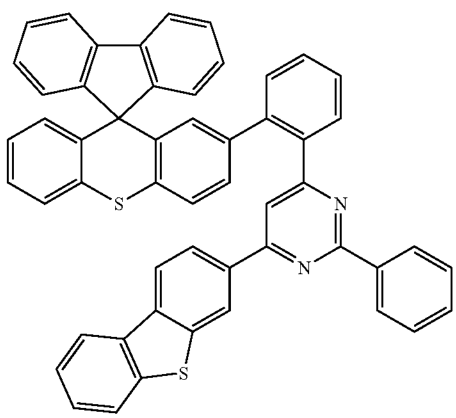
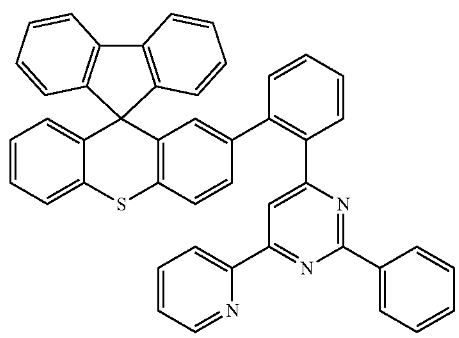
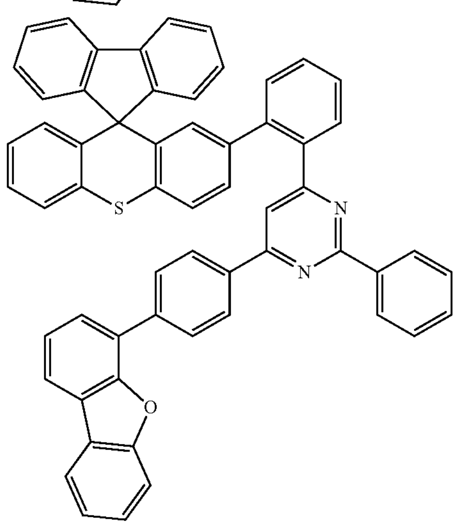
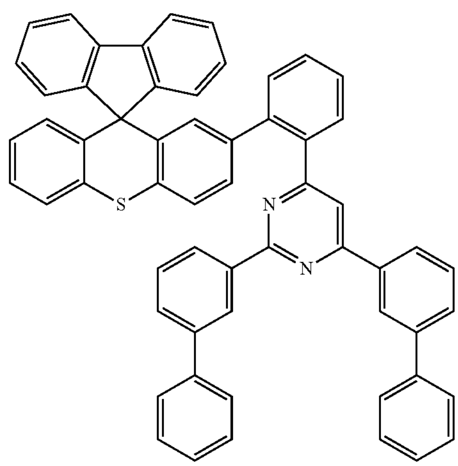

-continued
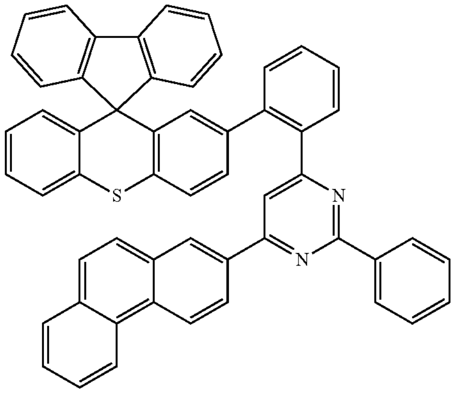
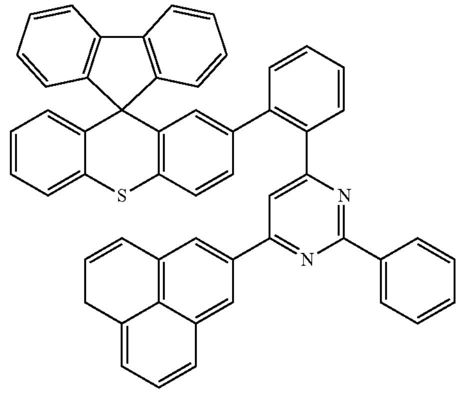
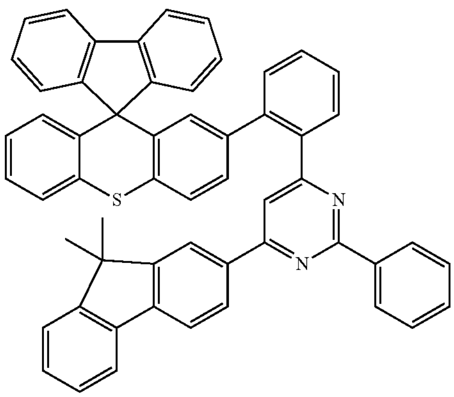
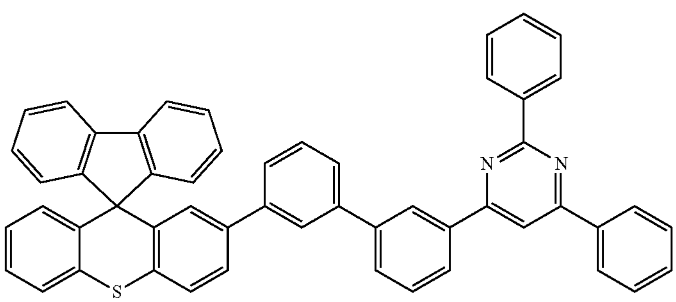
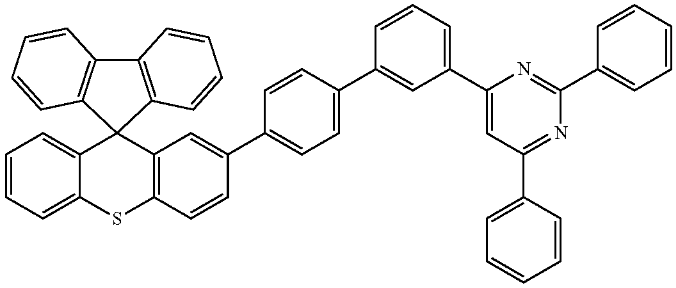

-continued
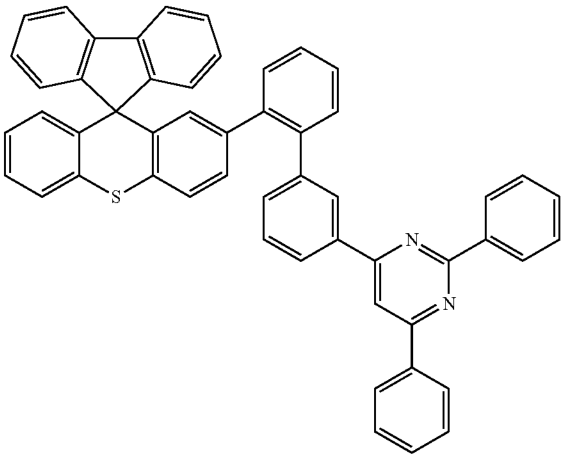
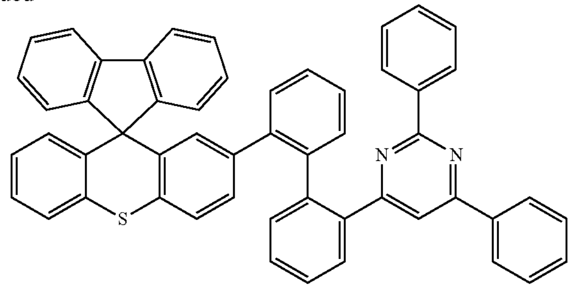
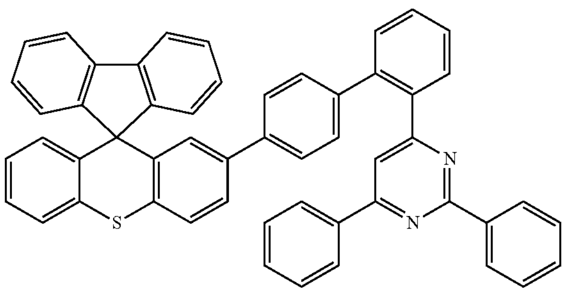
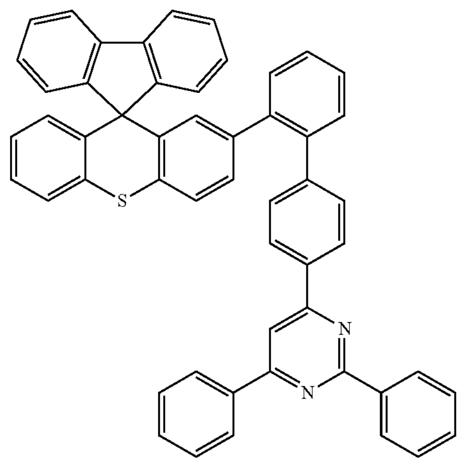
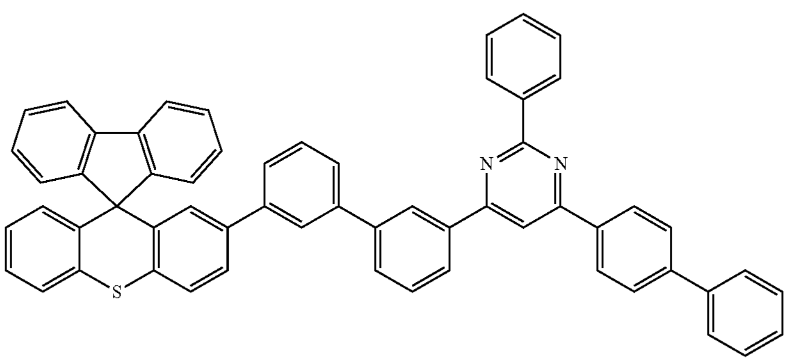
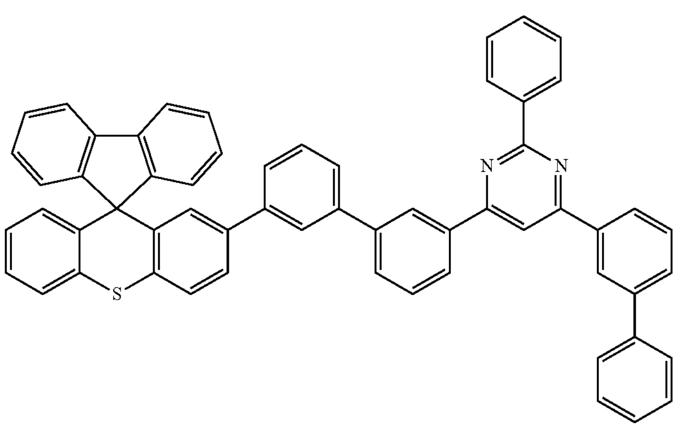

-continued
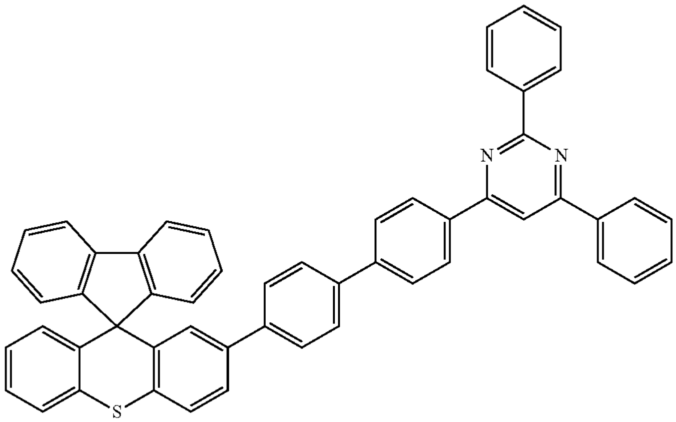
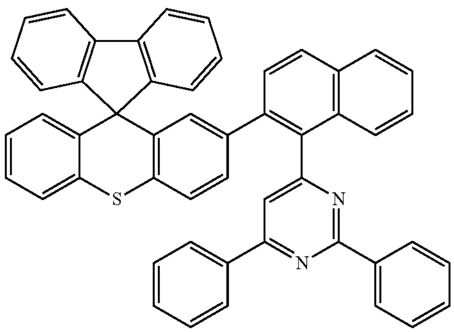
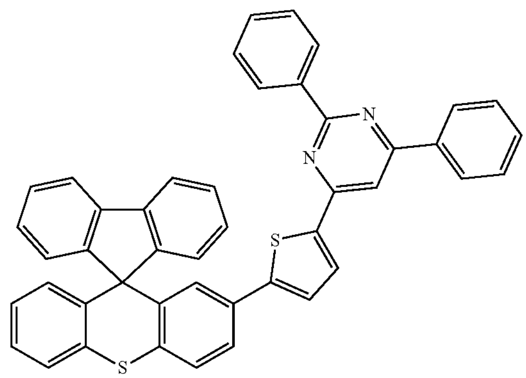
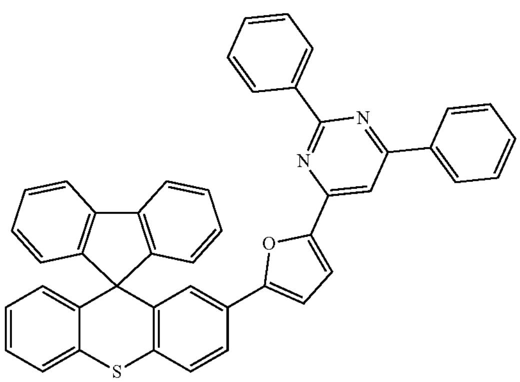
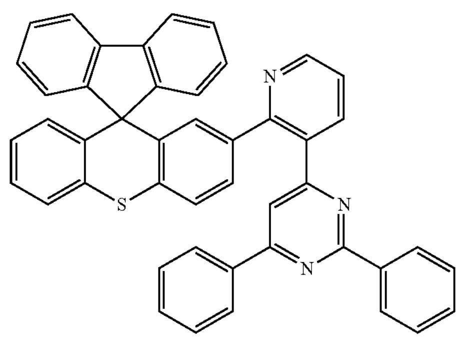
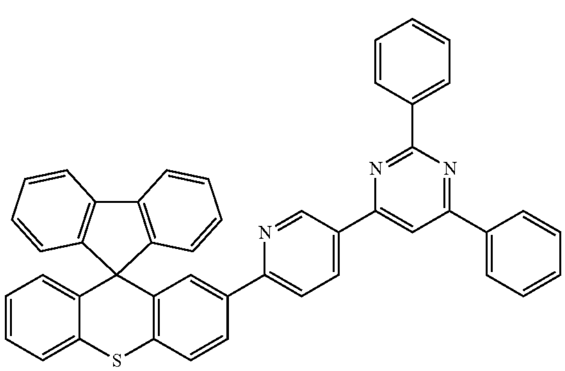
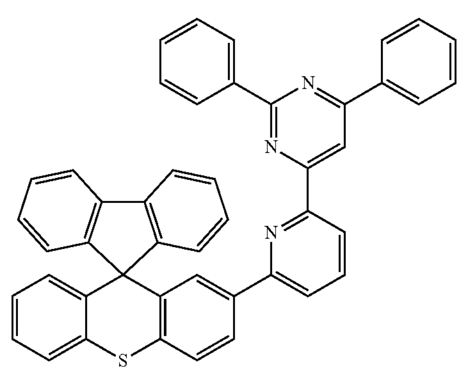

-continued
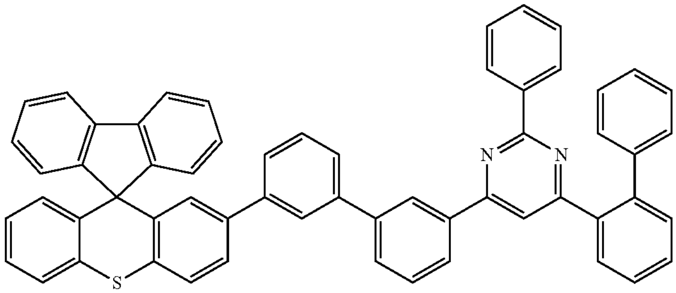
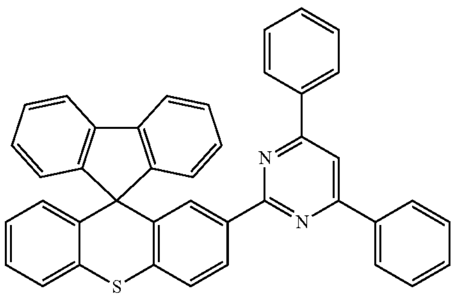
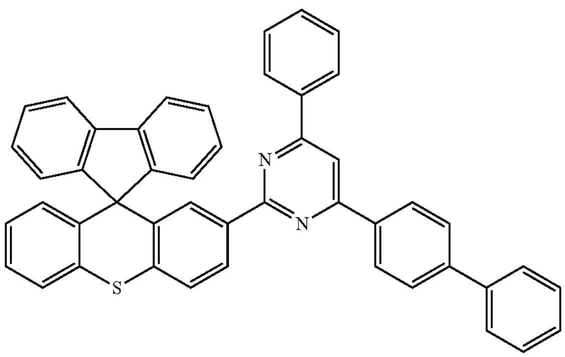
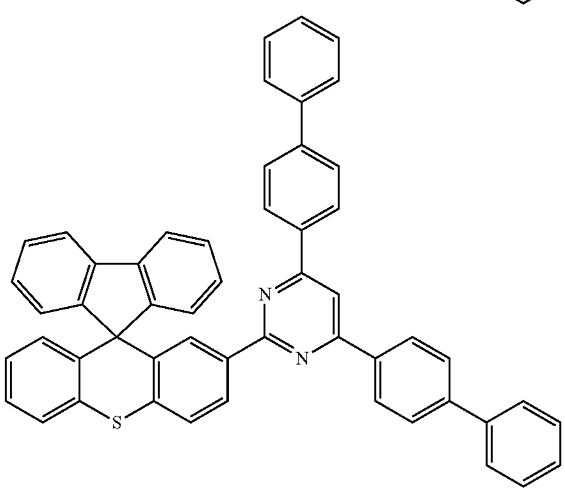
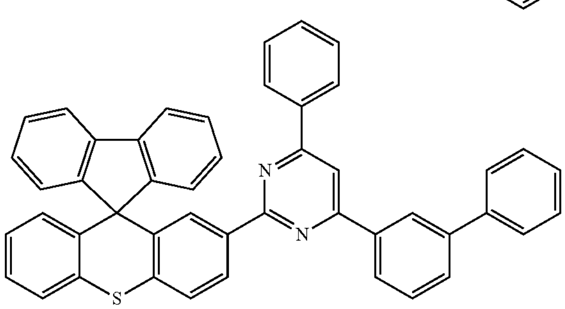
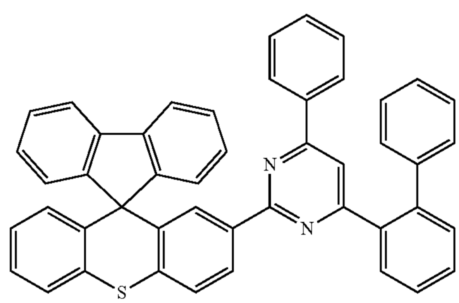

-continued
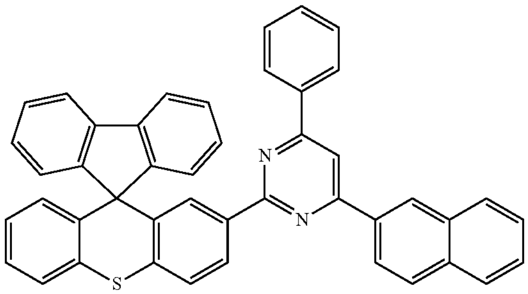
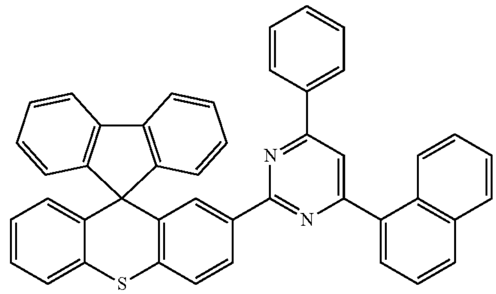
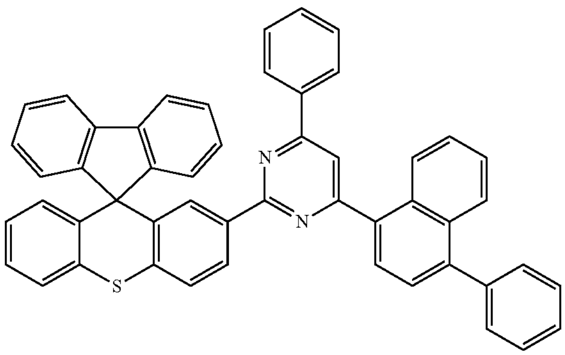
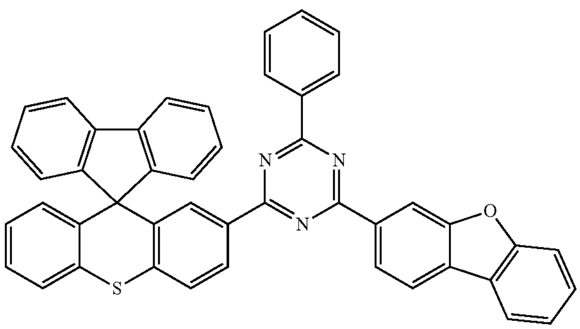
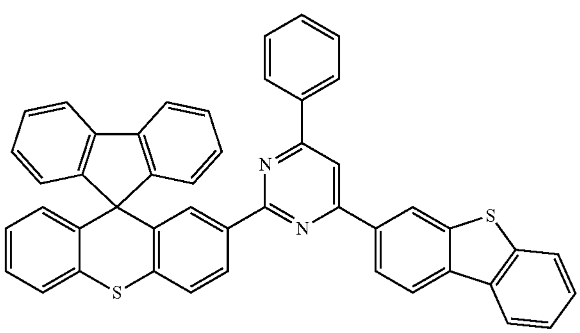
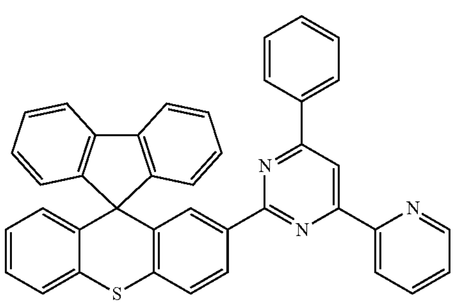
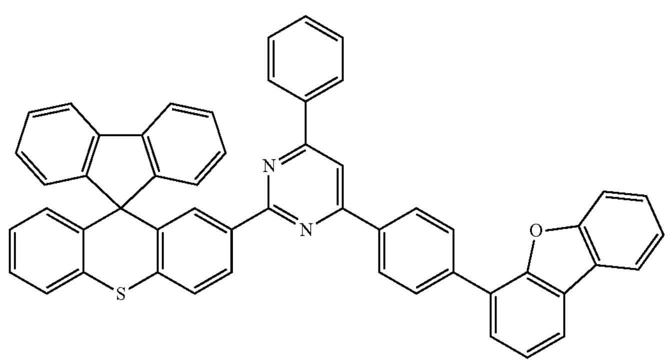

-continued
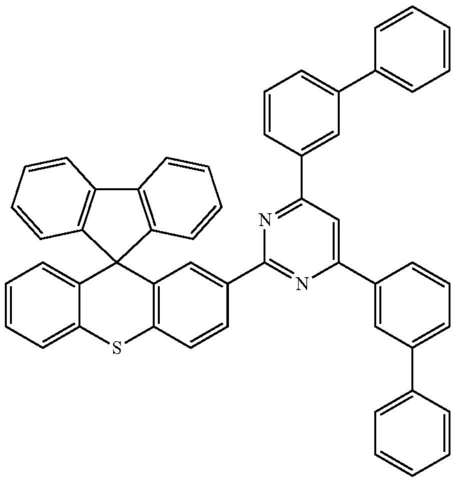
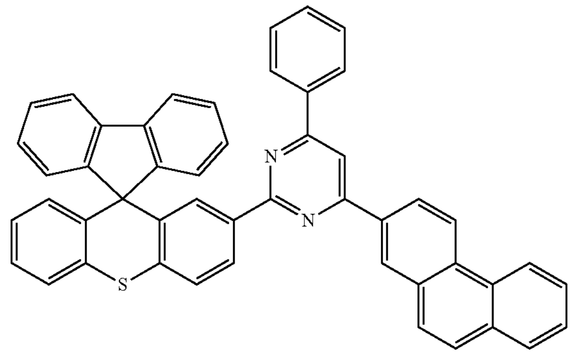
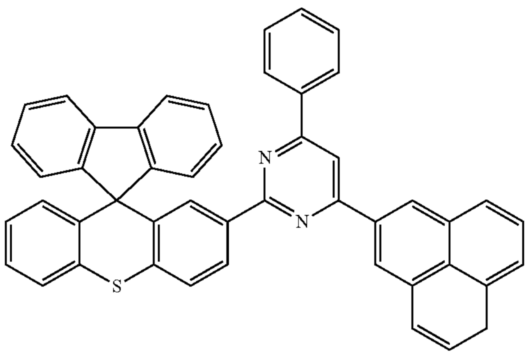
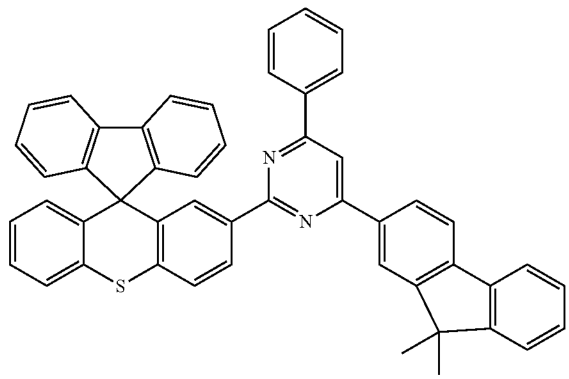
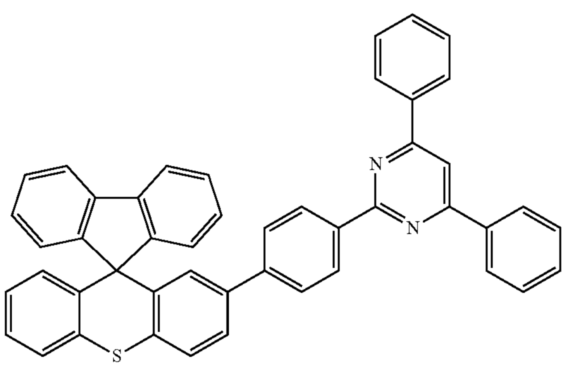
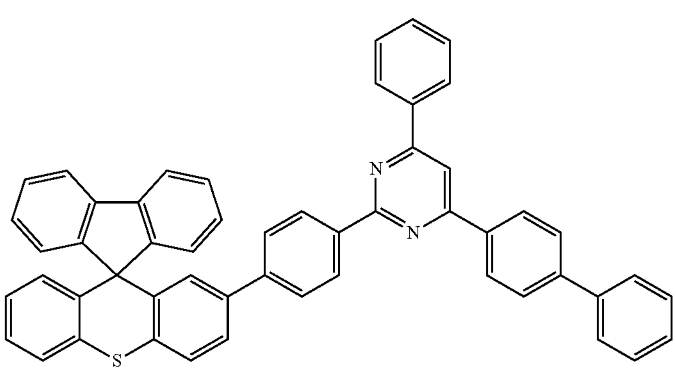

-continued
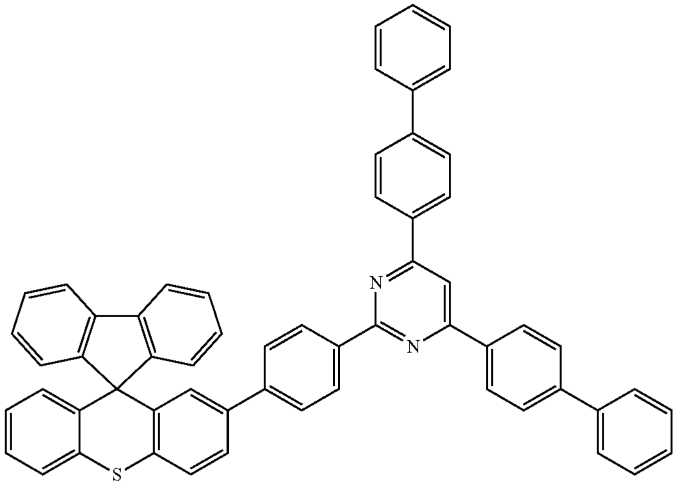
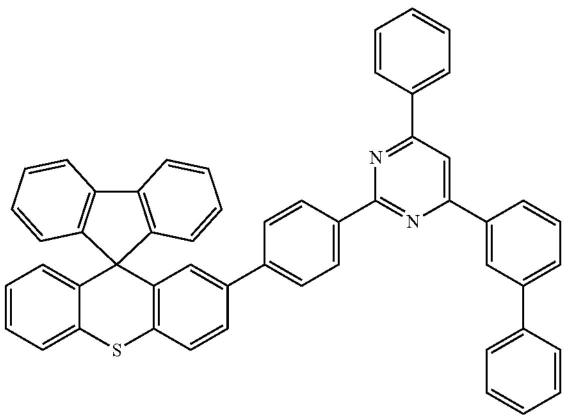
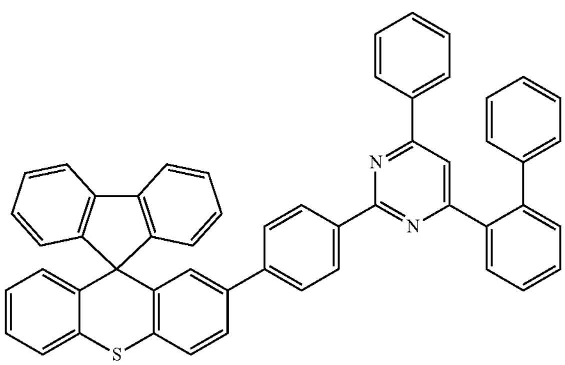
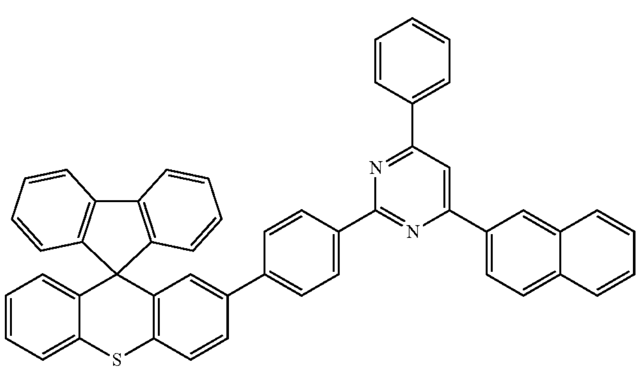

-continued
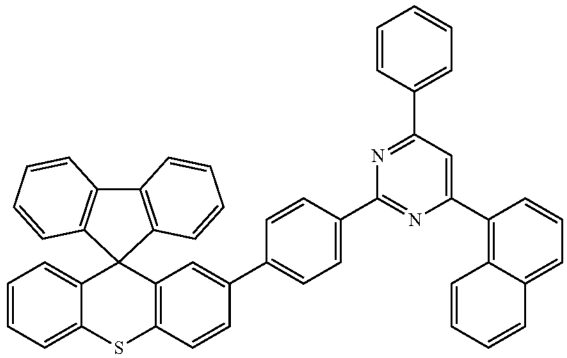
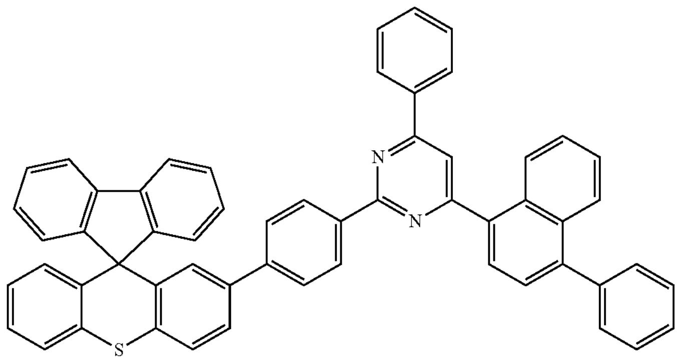
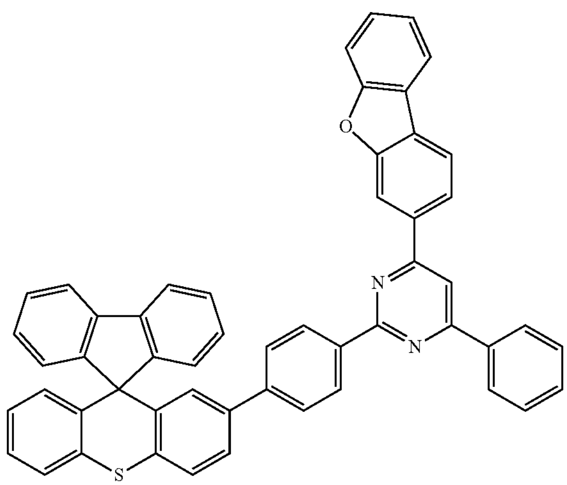
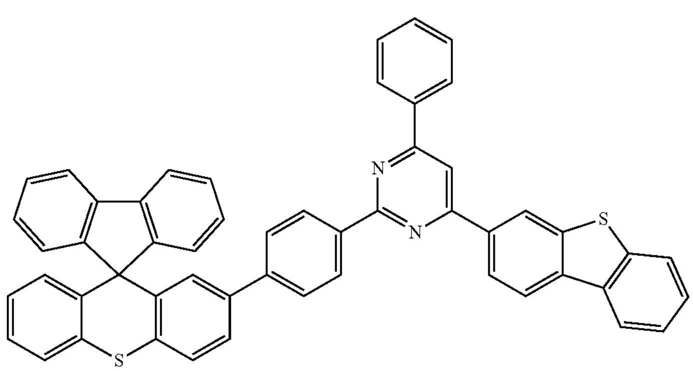

-continued
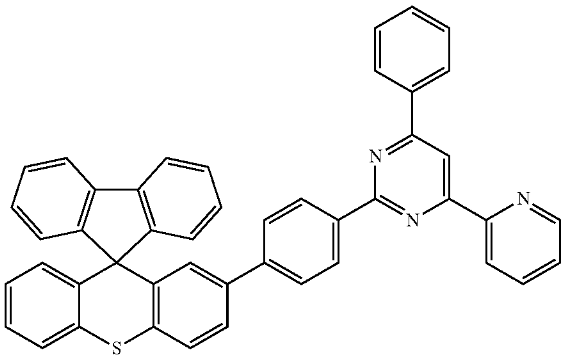
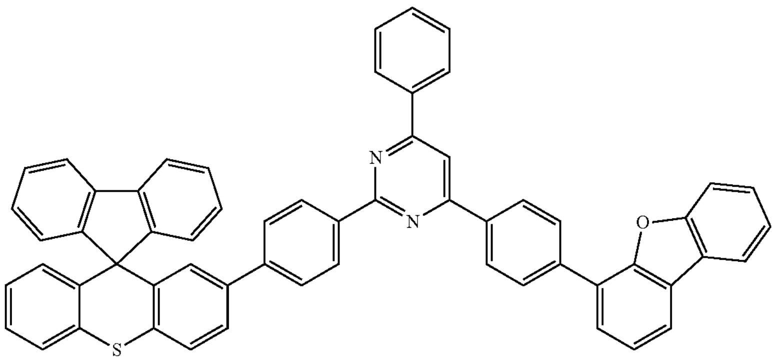
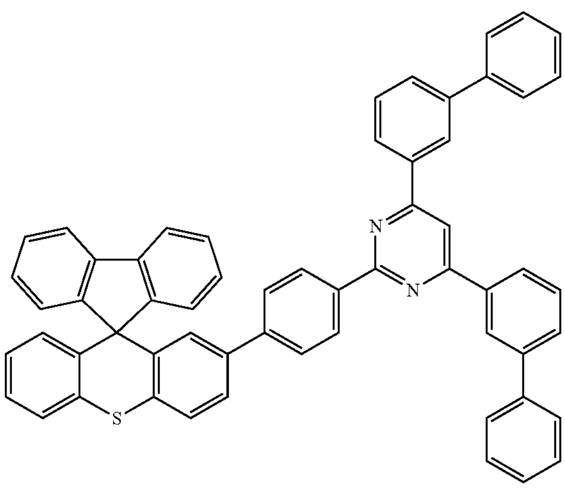
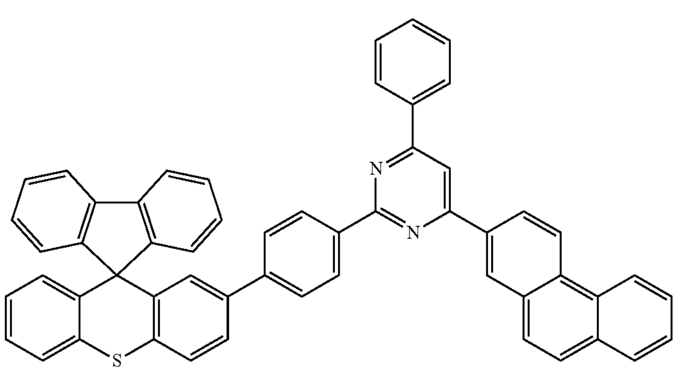

-continued
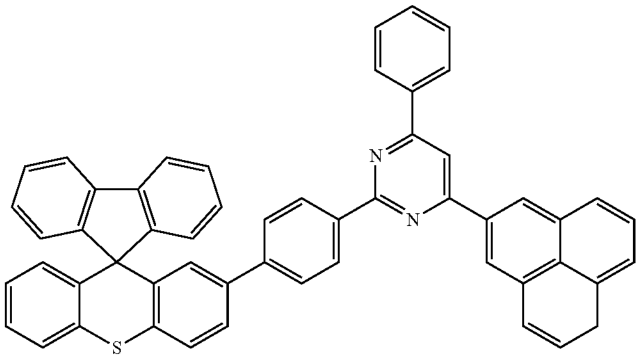
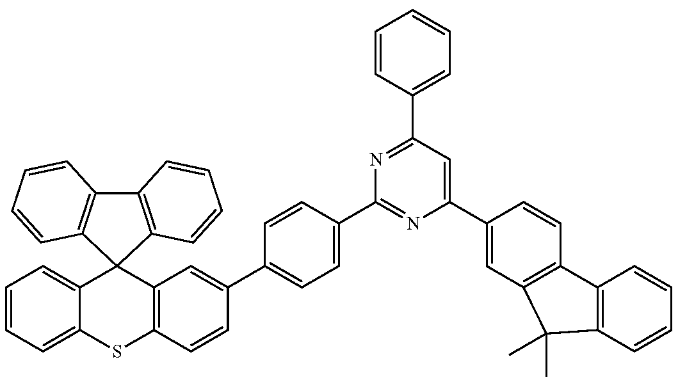
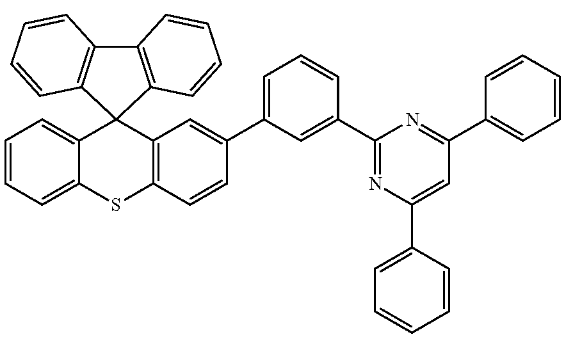
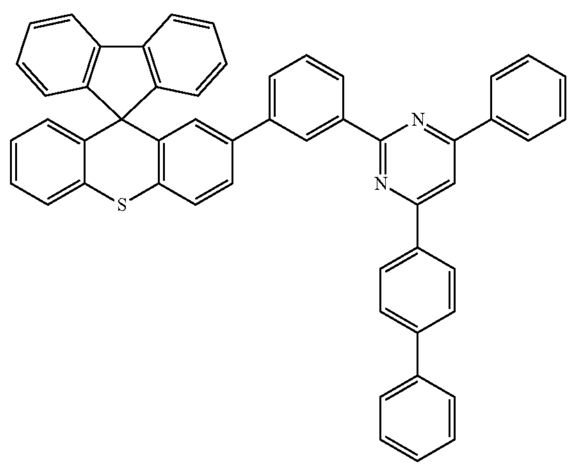
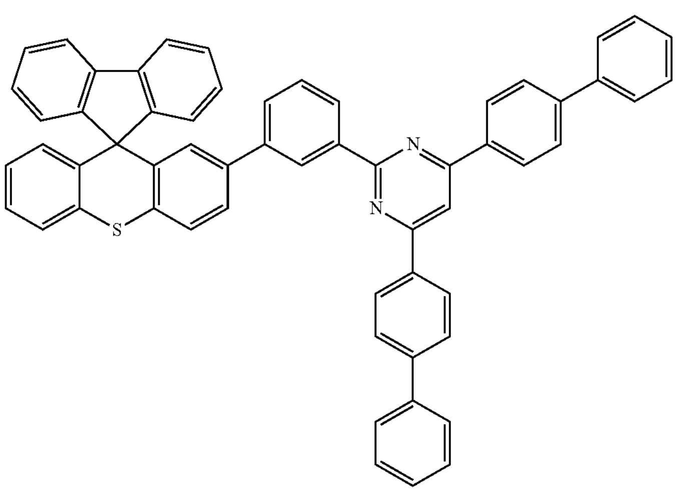

-continued
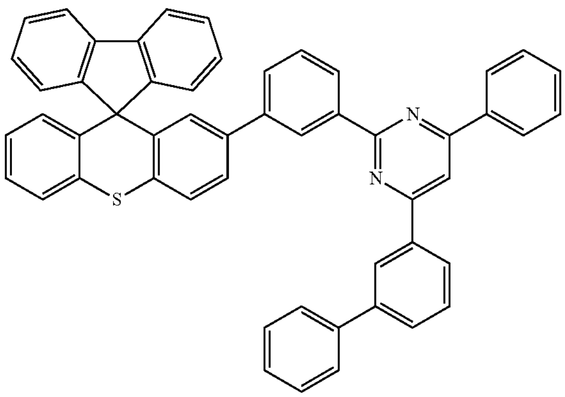
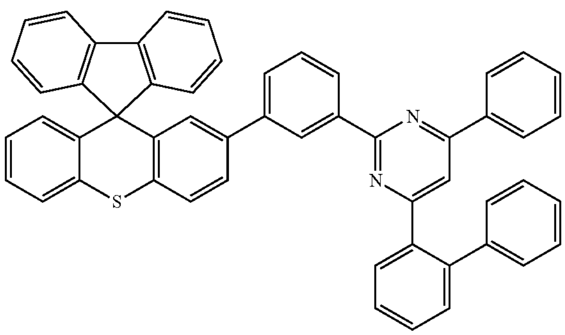
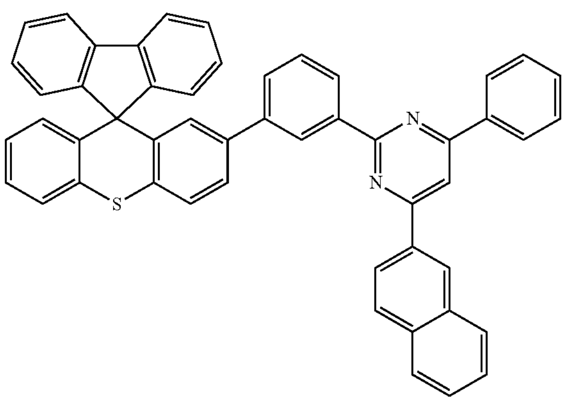
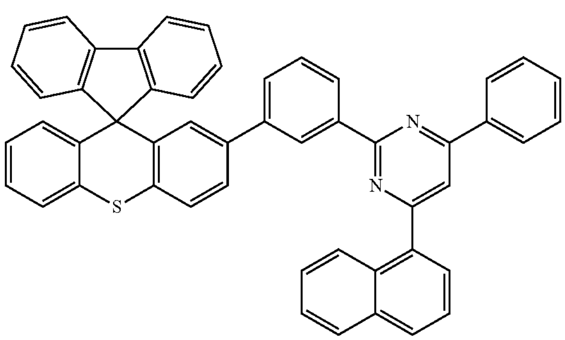

-continued
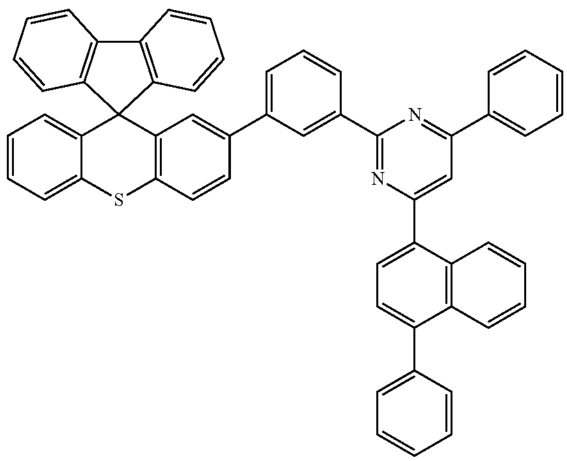
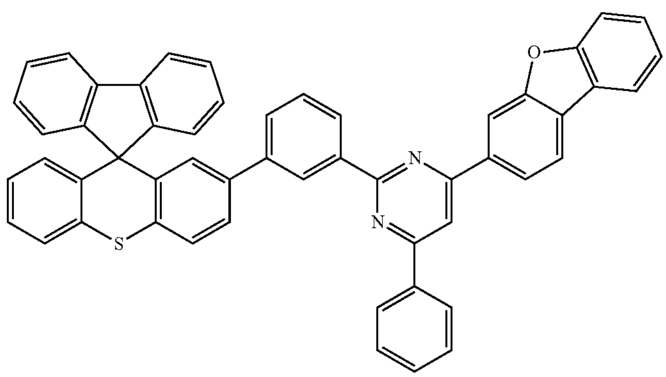
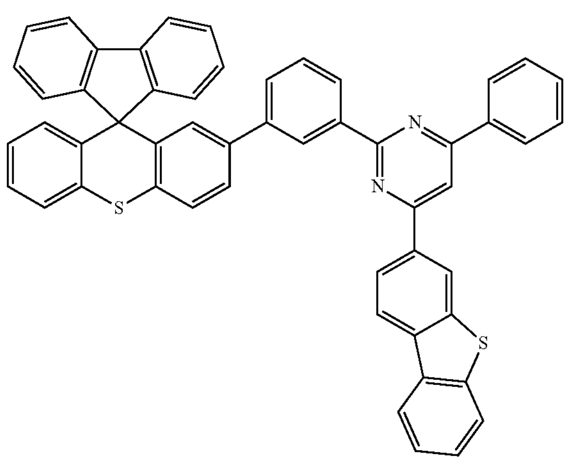

-continued
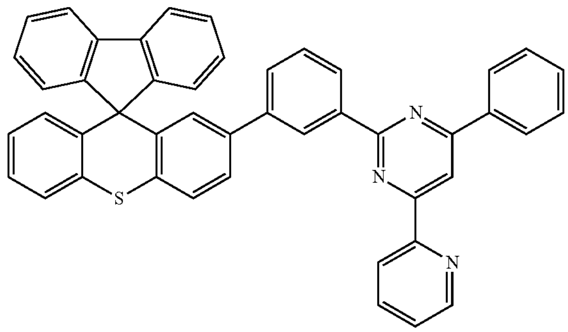
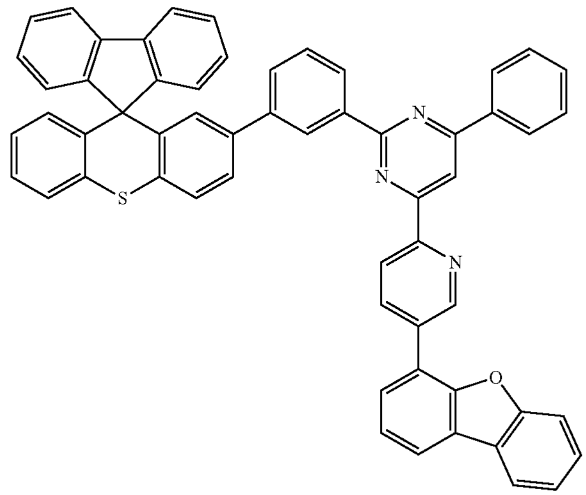
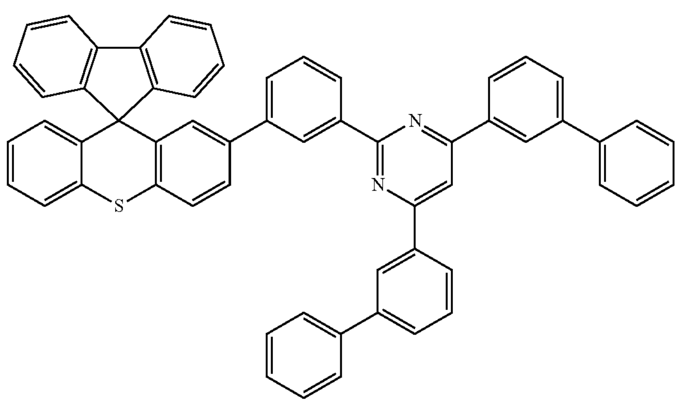
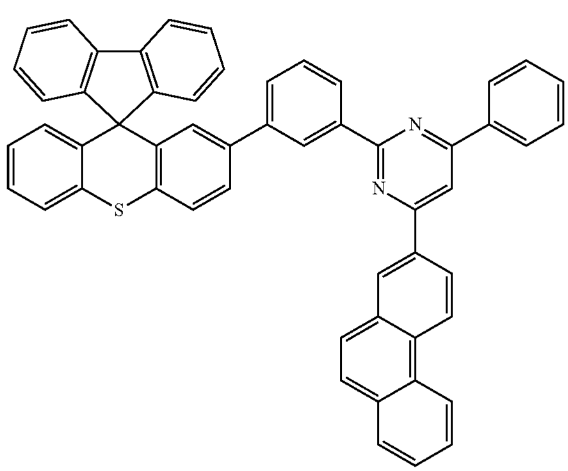
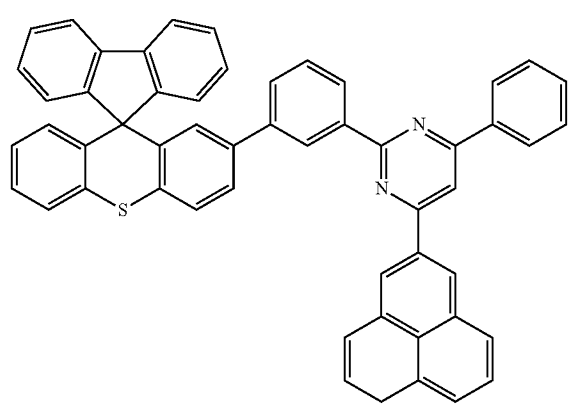

-continued
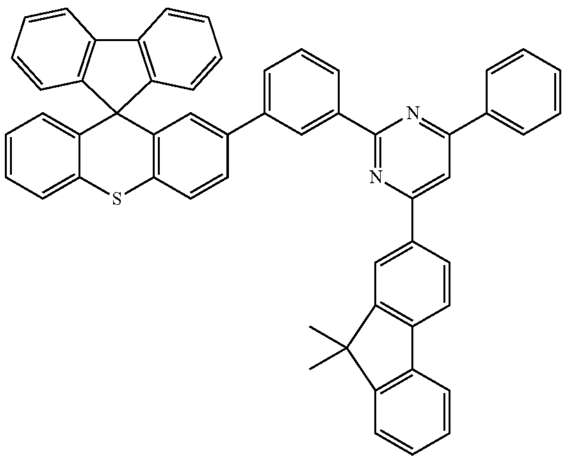
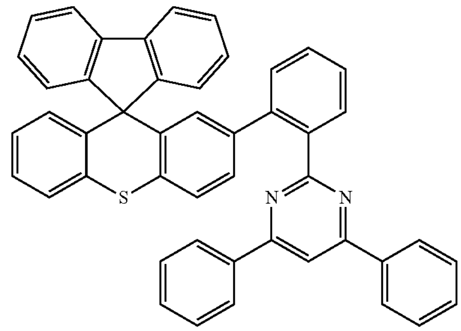
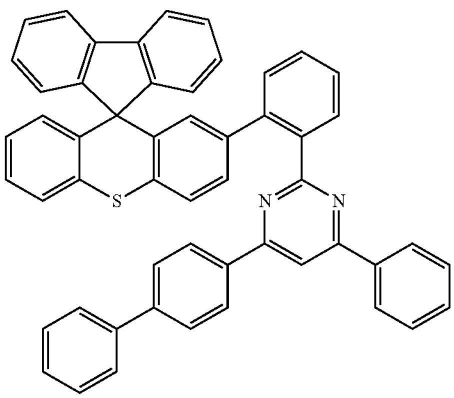
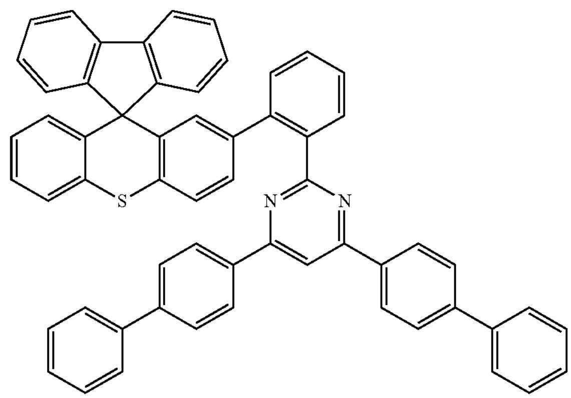
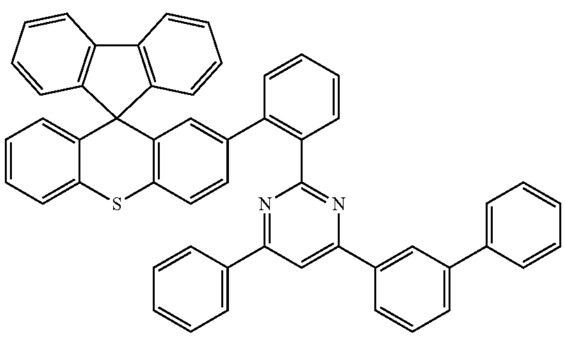
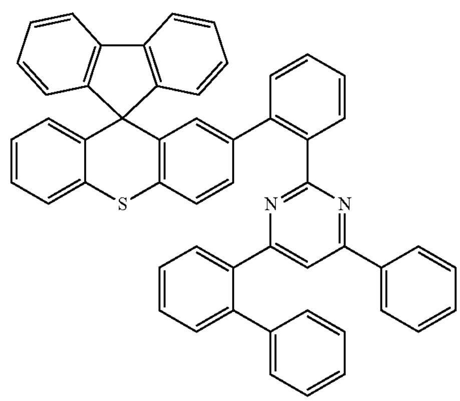
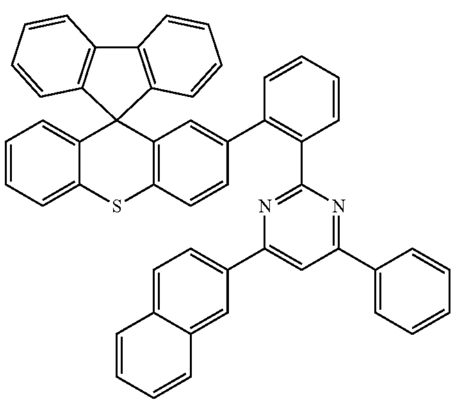
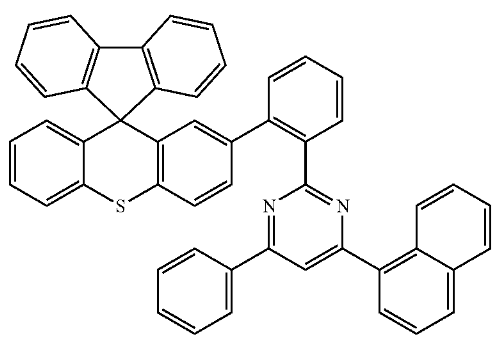

-continued
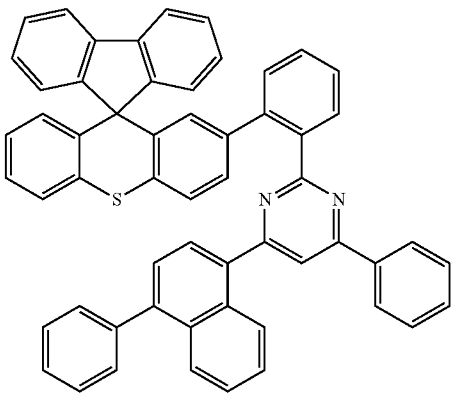
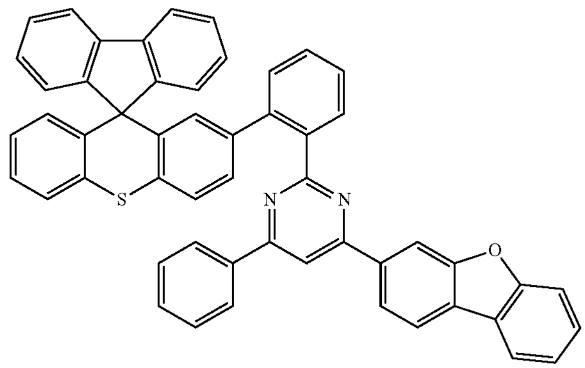
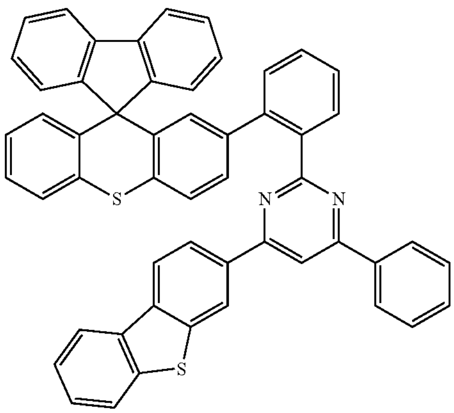
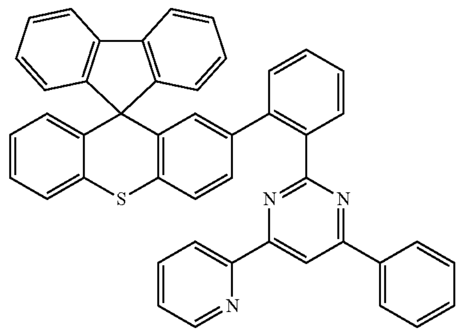
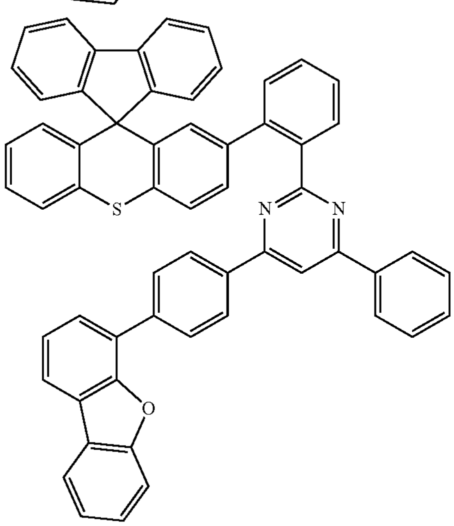
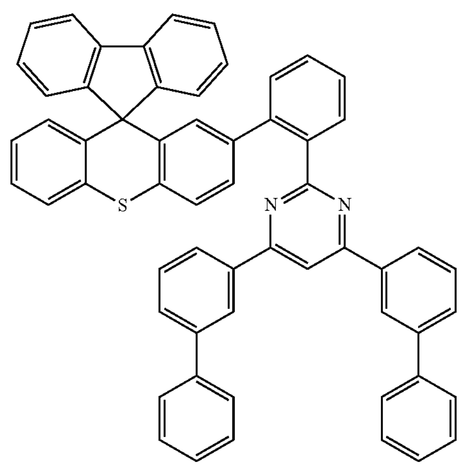
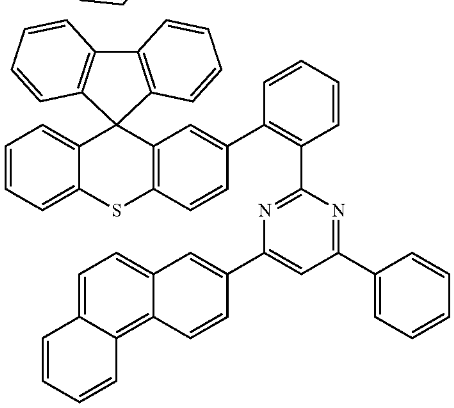
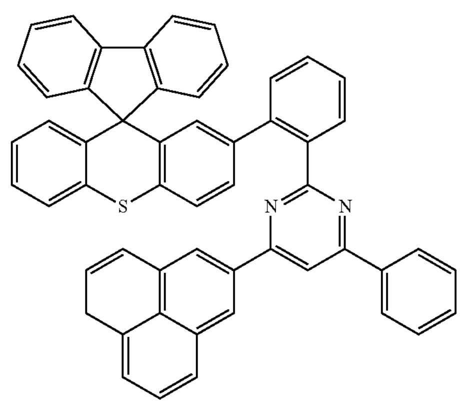

-continued
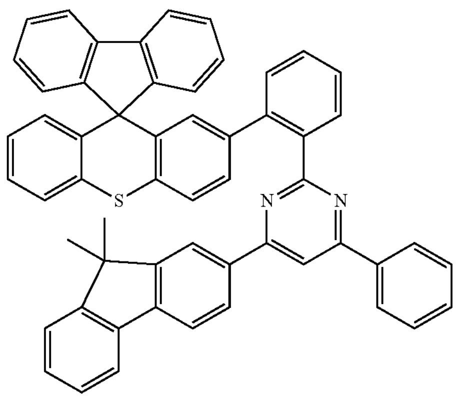
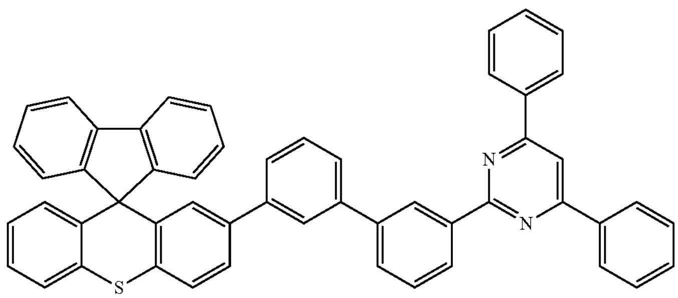
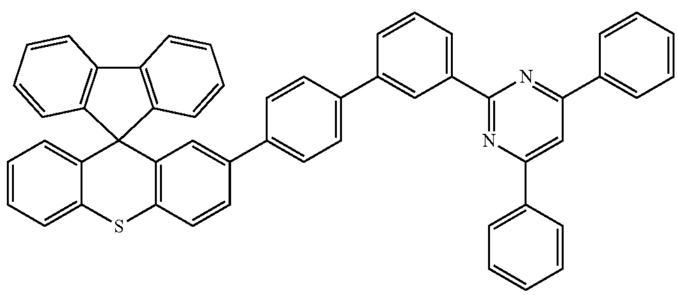
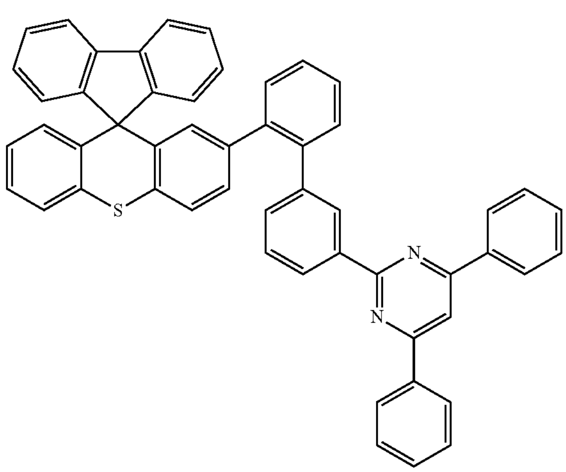
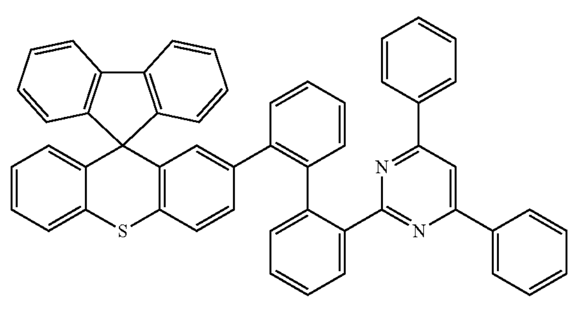

-continued
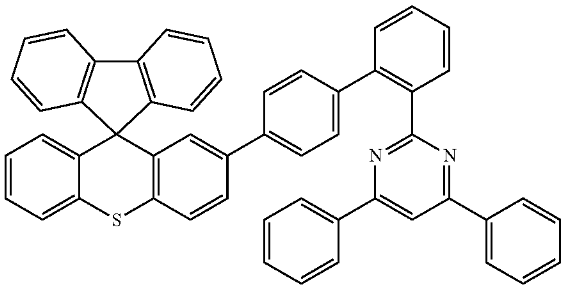
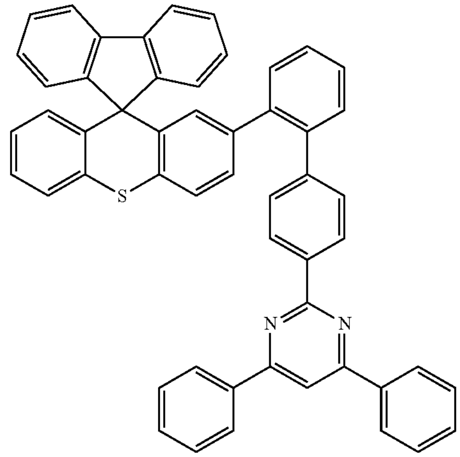
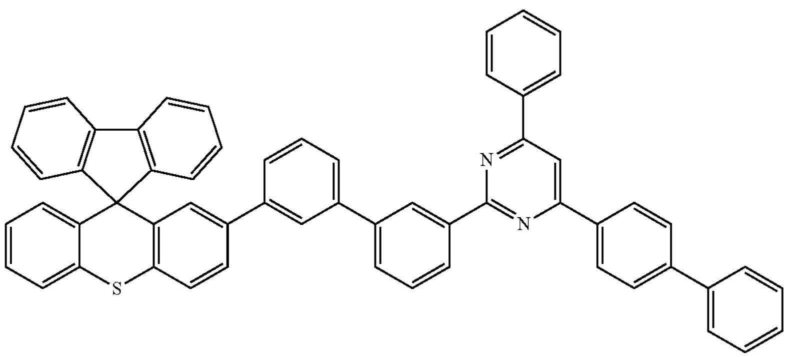
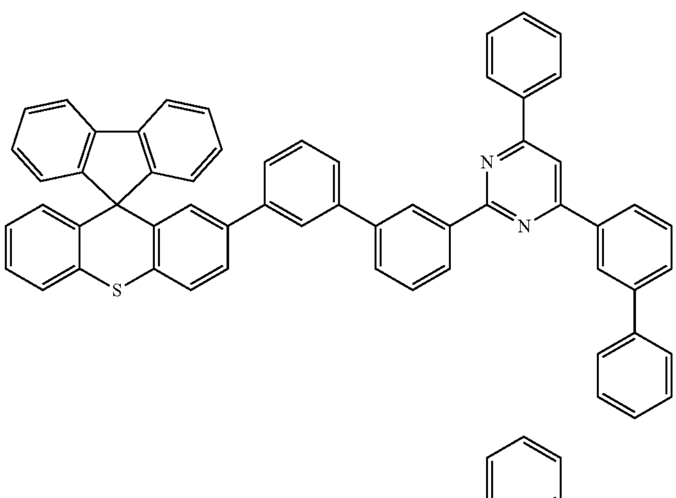
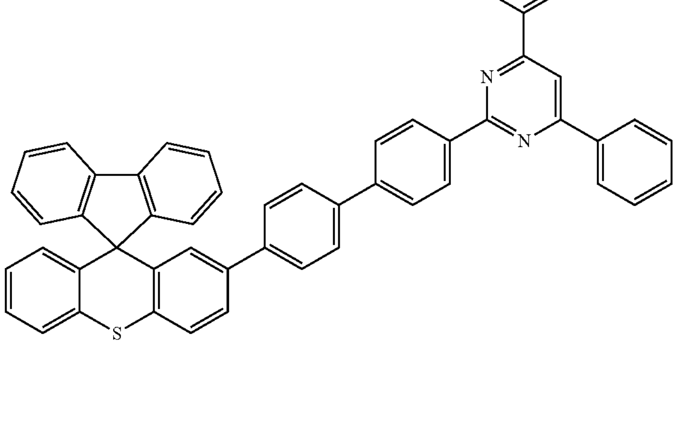

-continued
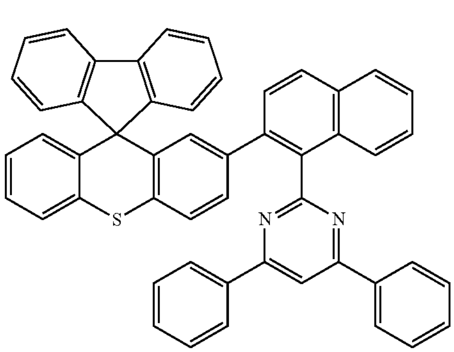
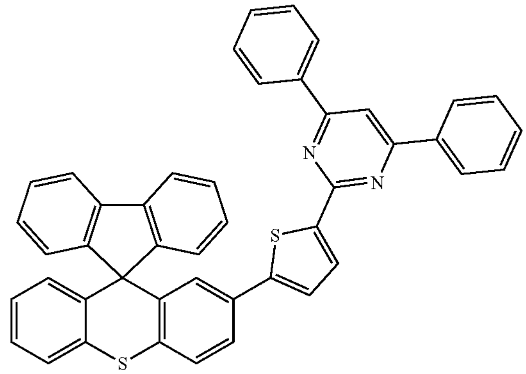
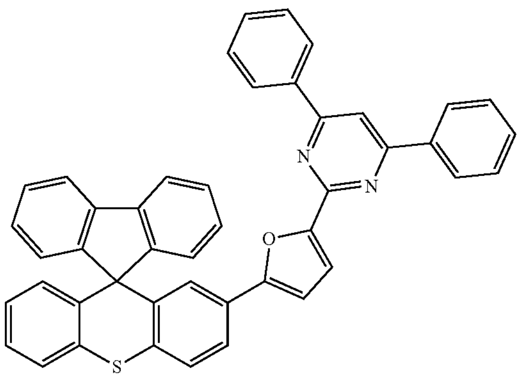
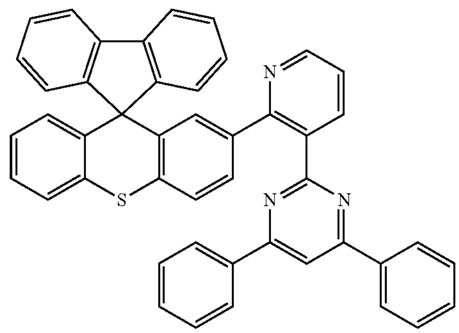
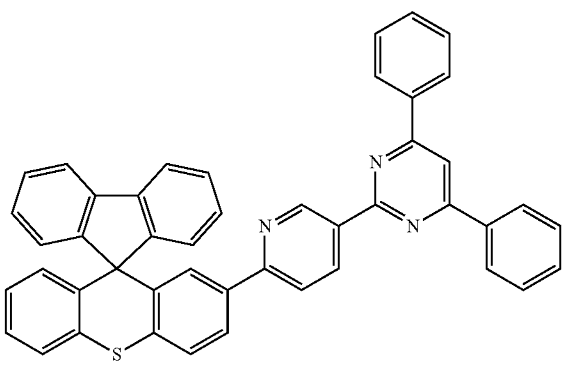
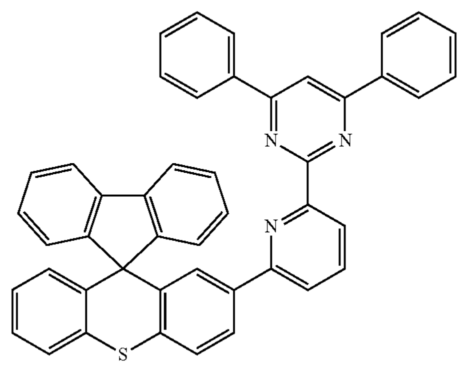
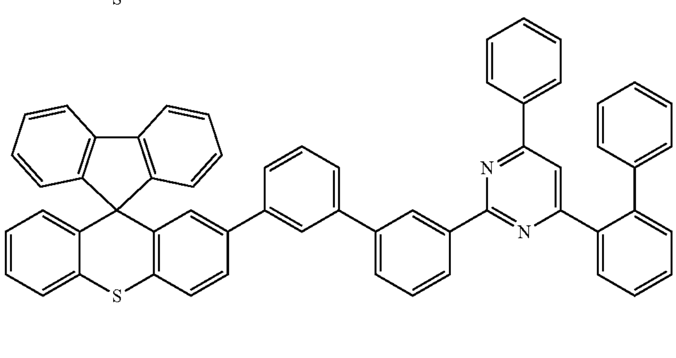
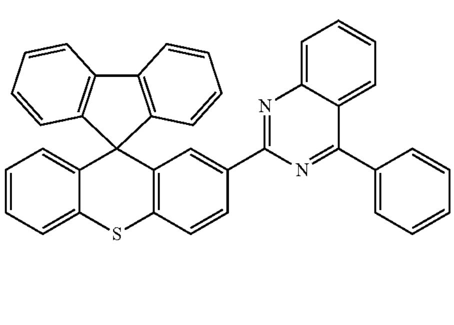
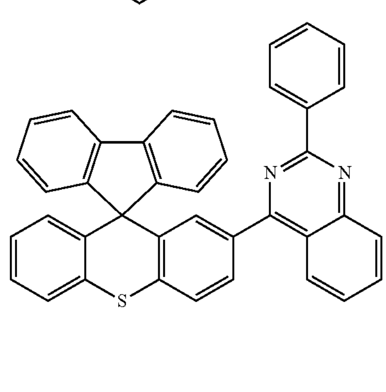

-continued
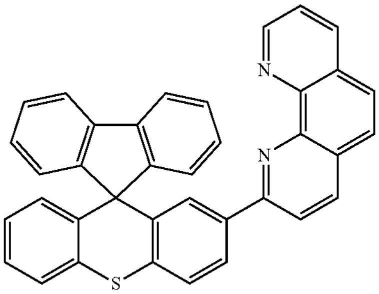
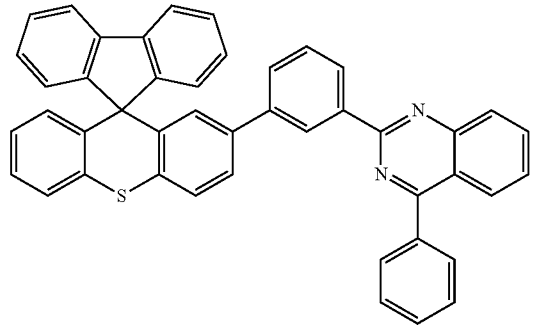
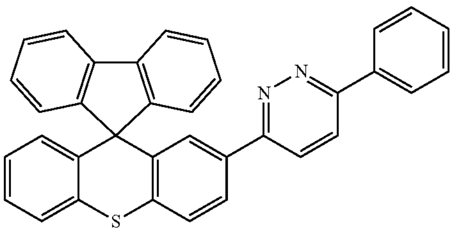
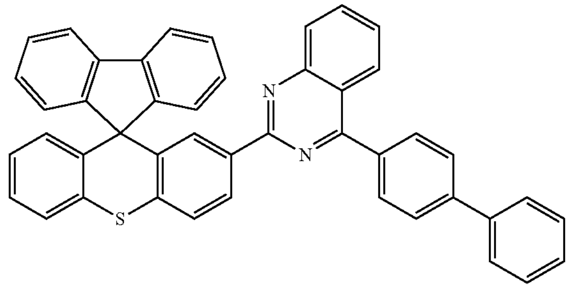
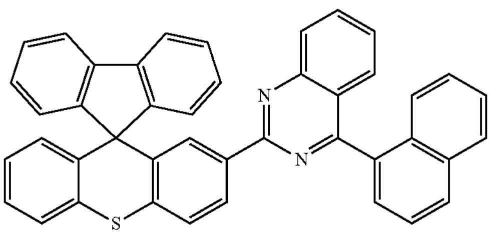
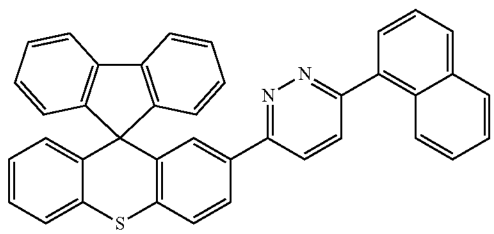
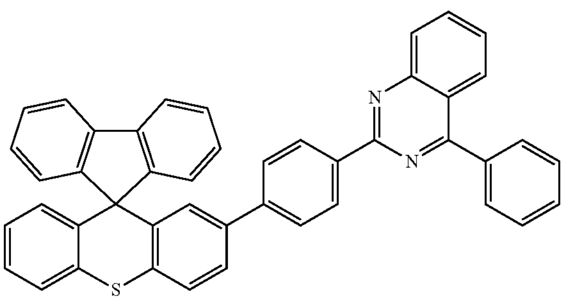
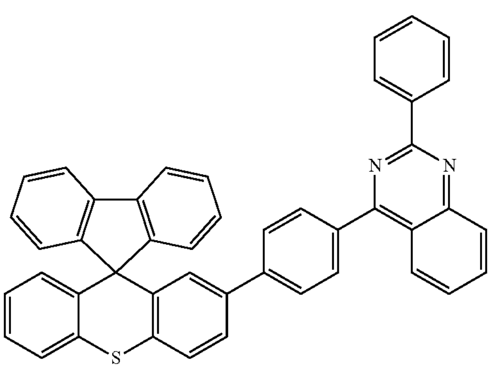
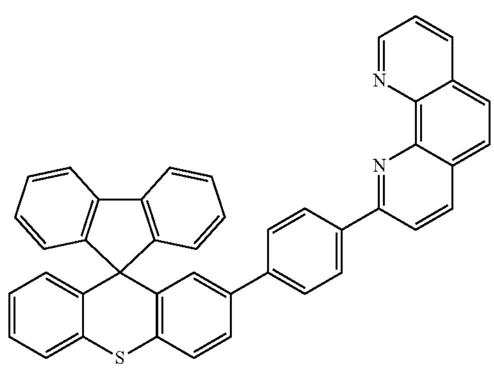

-continued
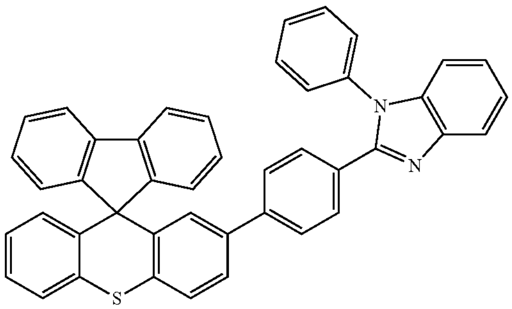
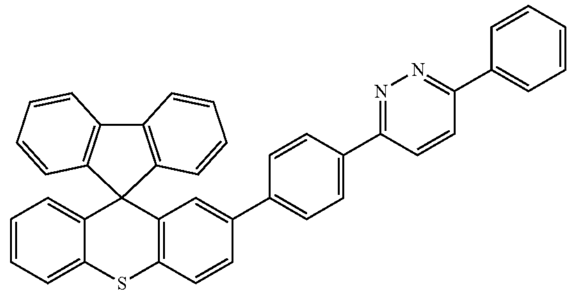
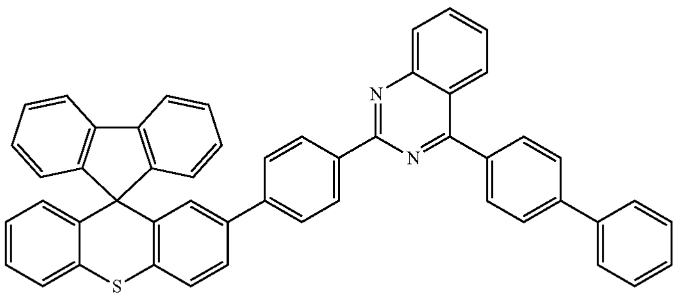
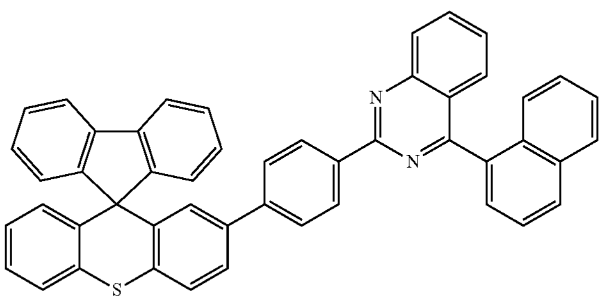
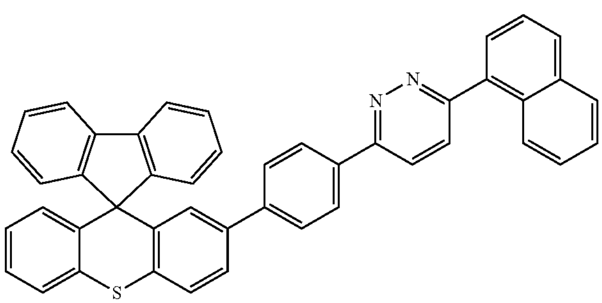
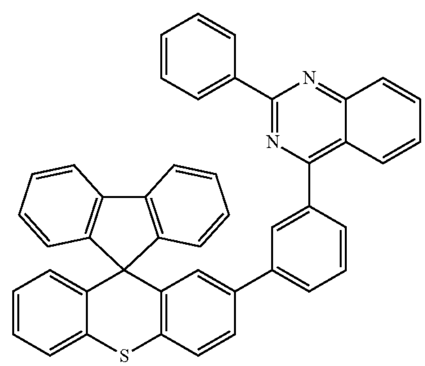
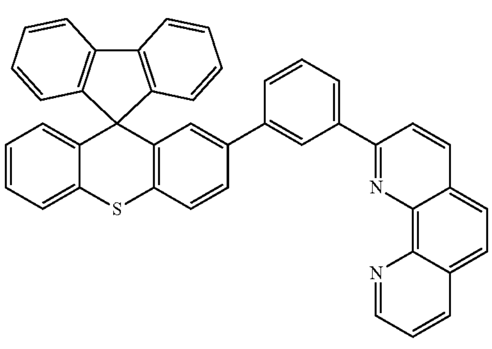

-continued
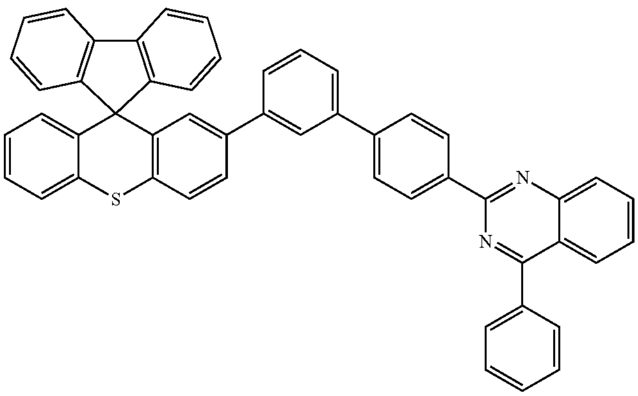
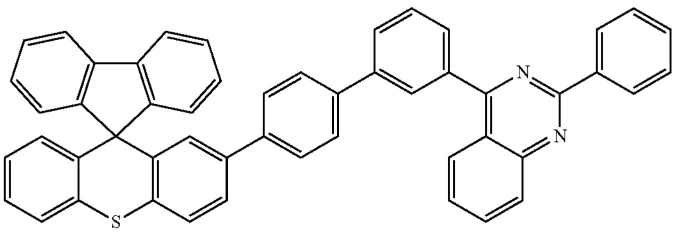
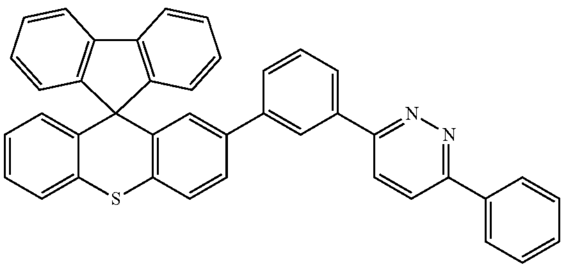
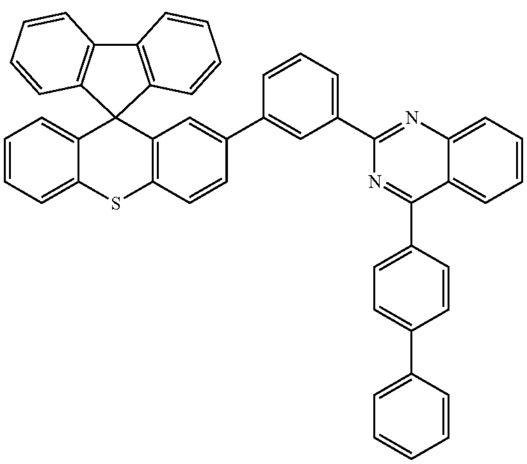
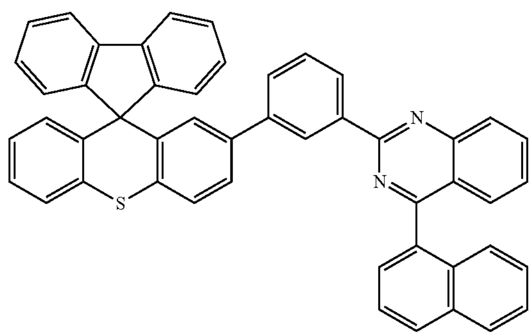
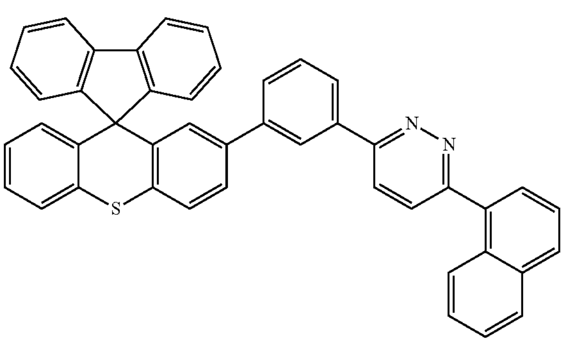
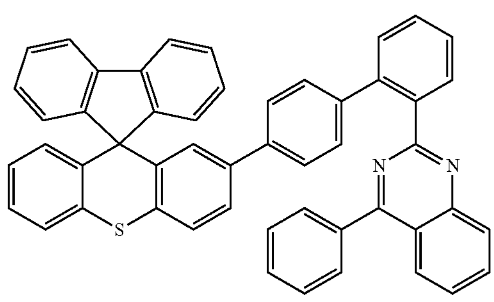

-continued
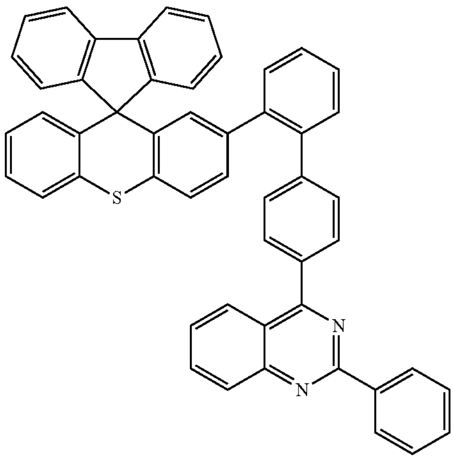
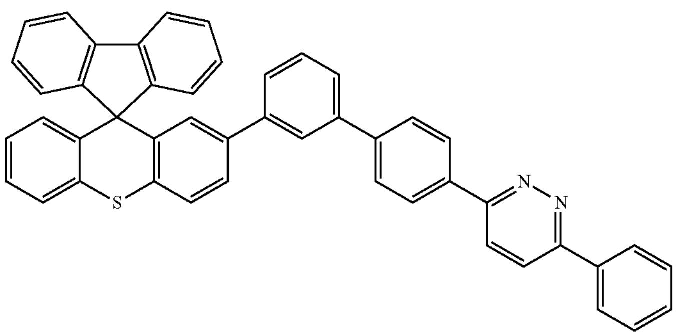
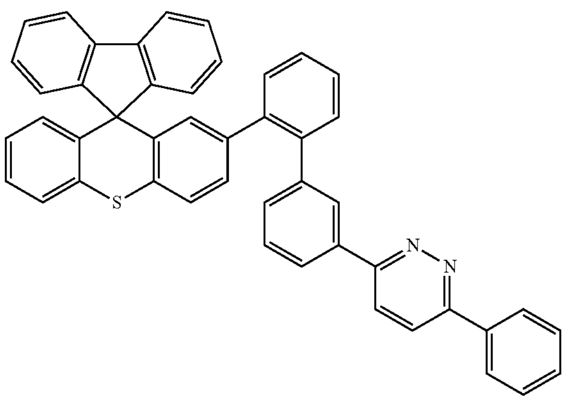
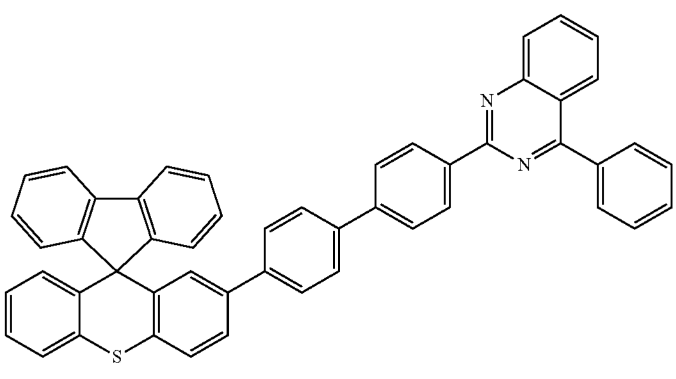

-continued
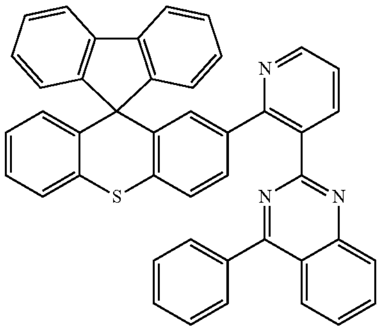
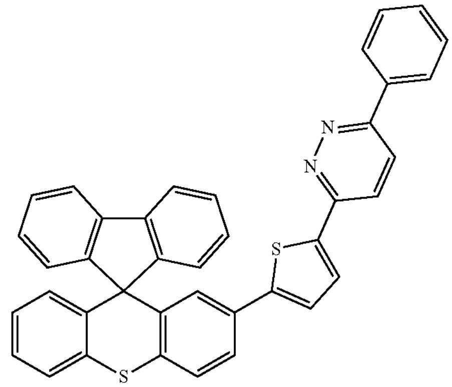
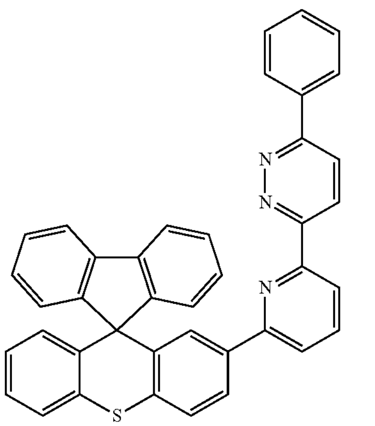
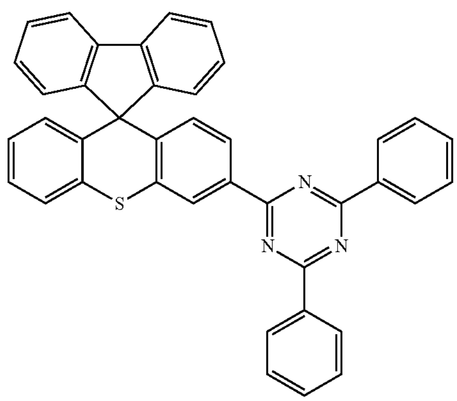
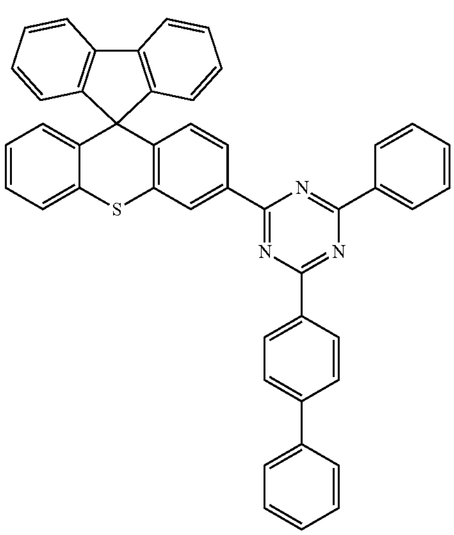
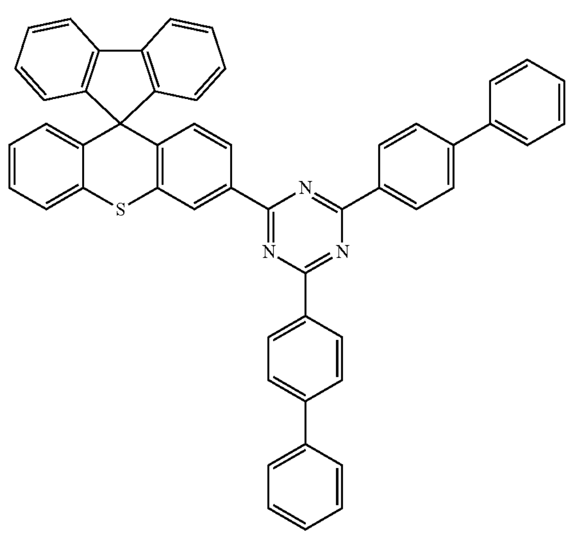

-continued
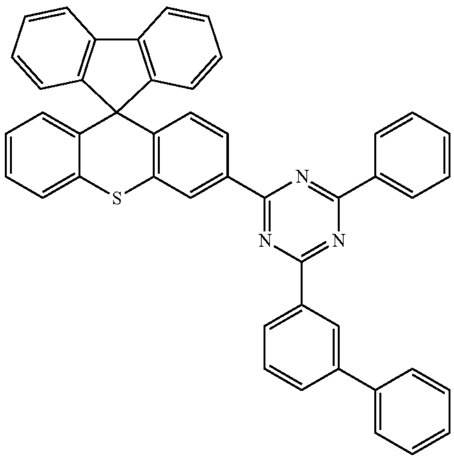
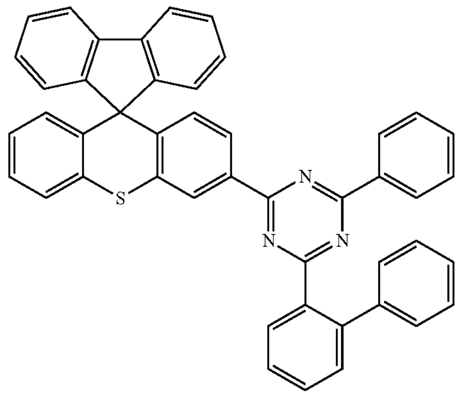
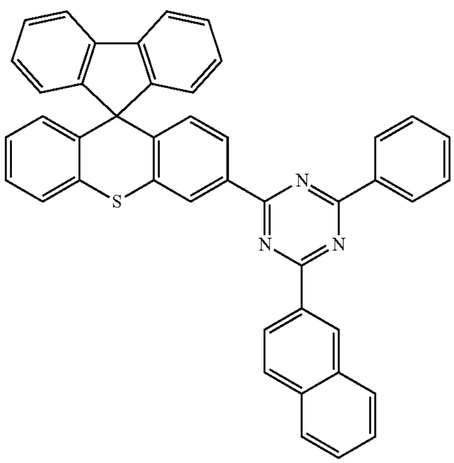
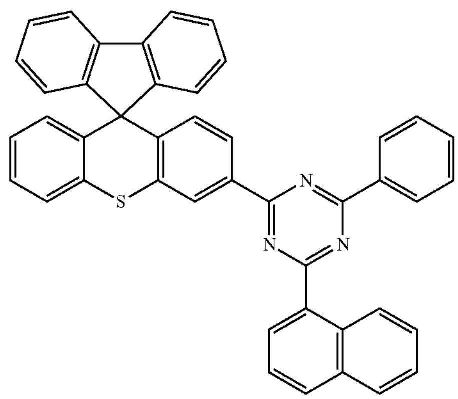
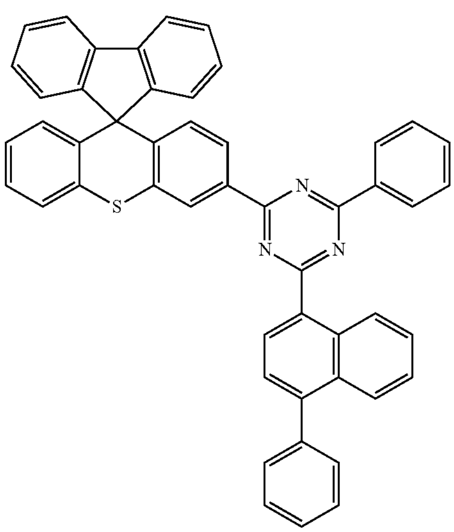
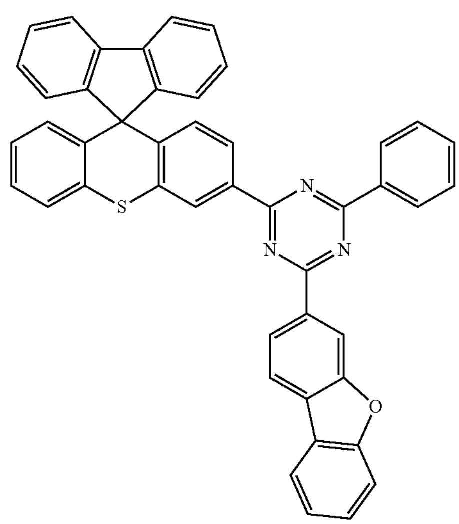

-continued
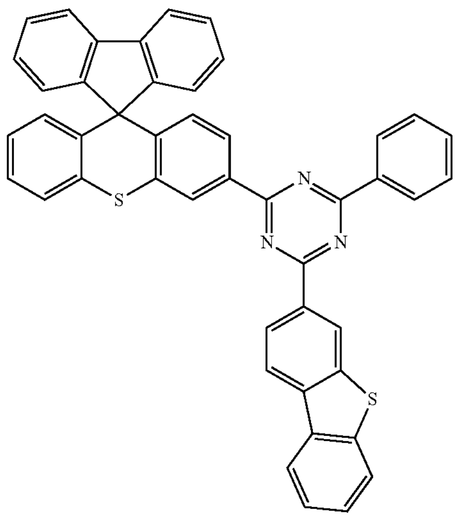
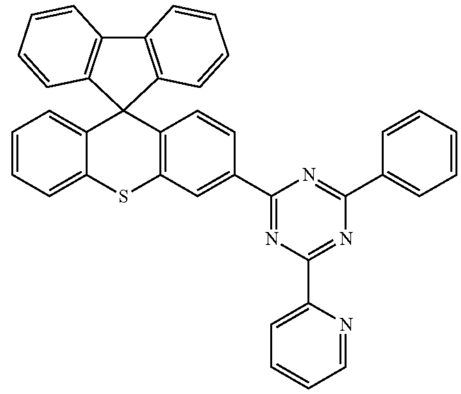
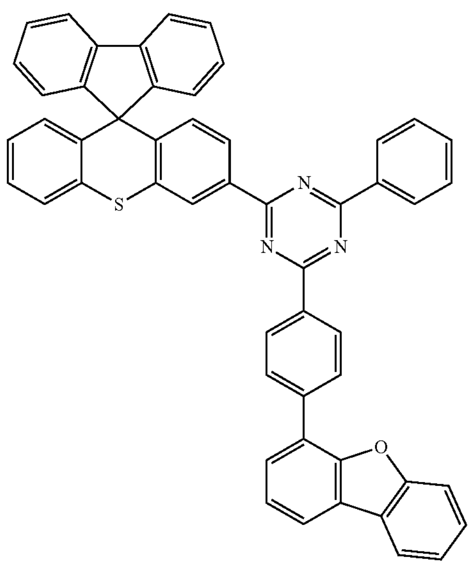
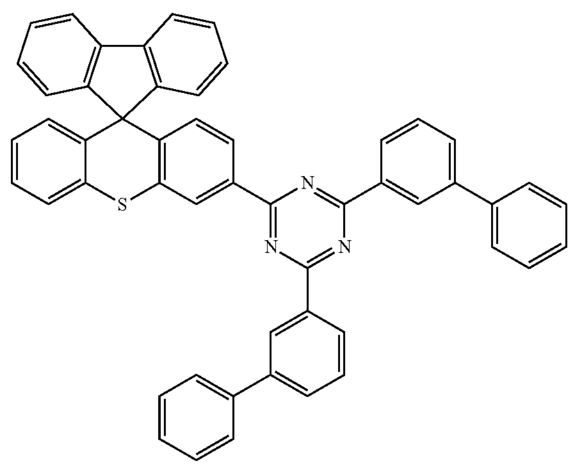
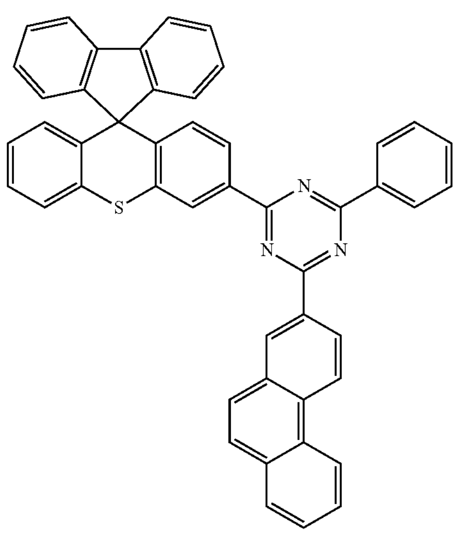
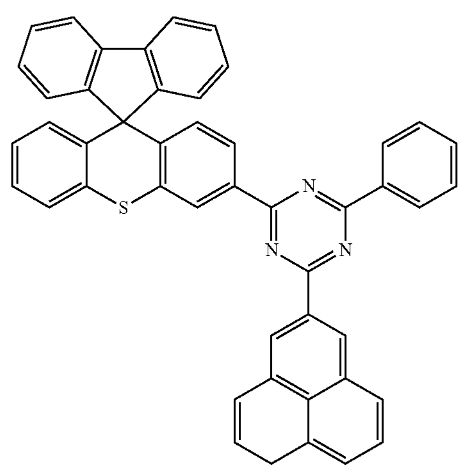

-continued
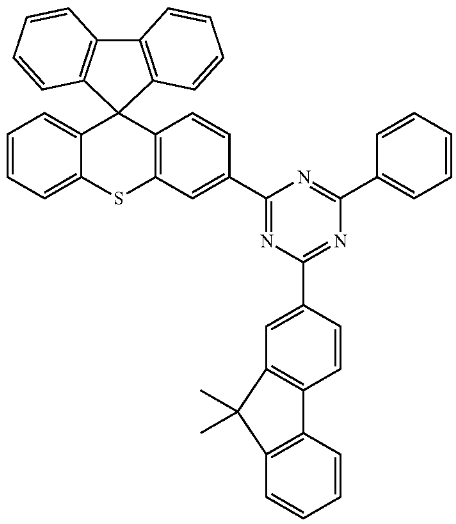
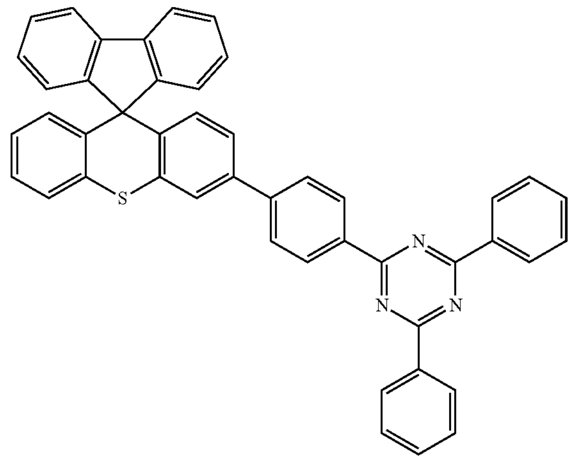
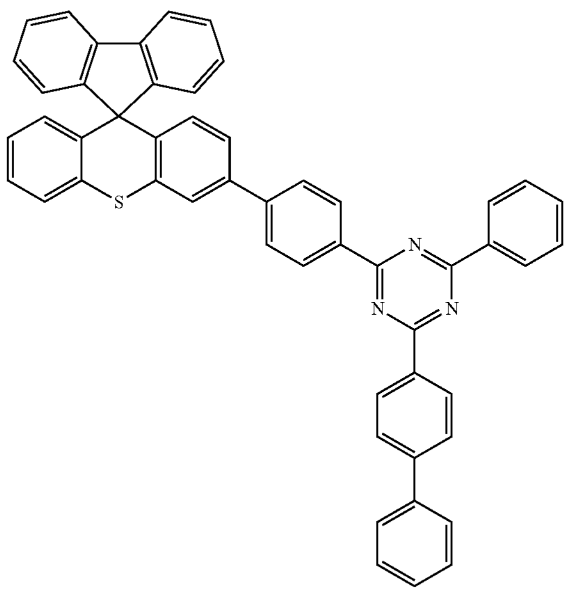
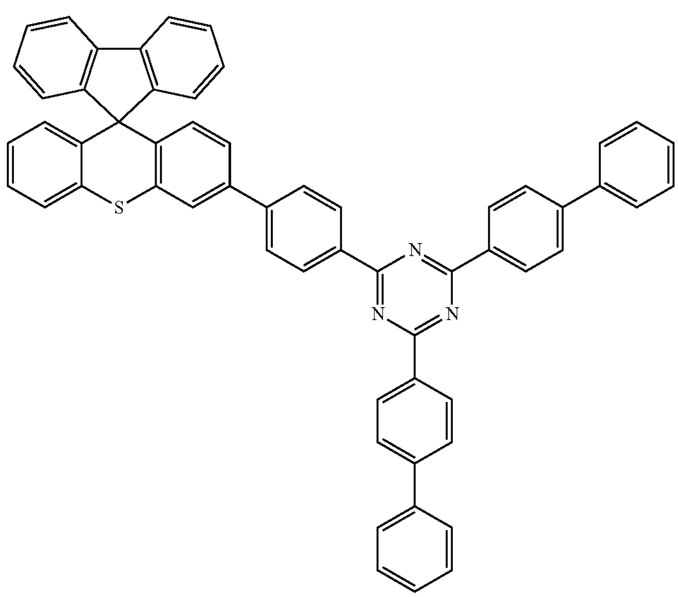

-continued
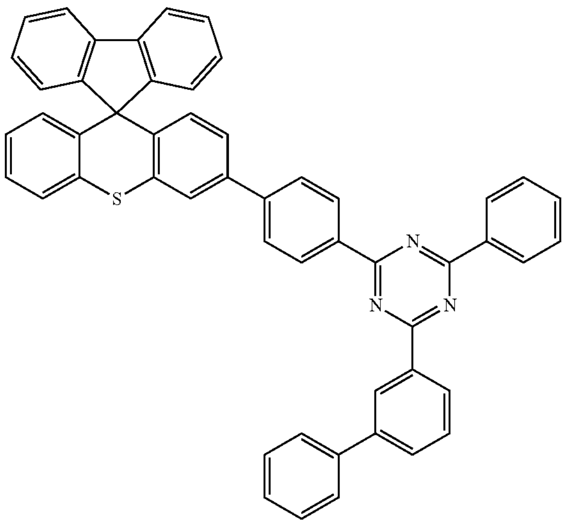
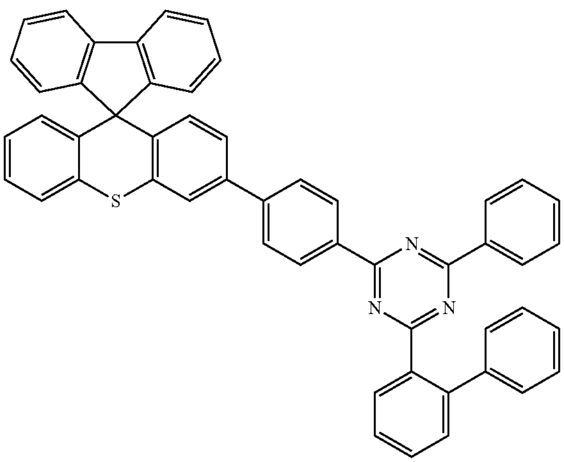
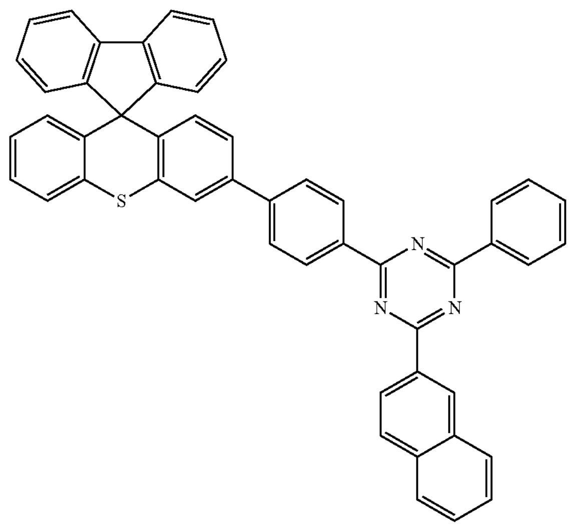
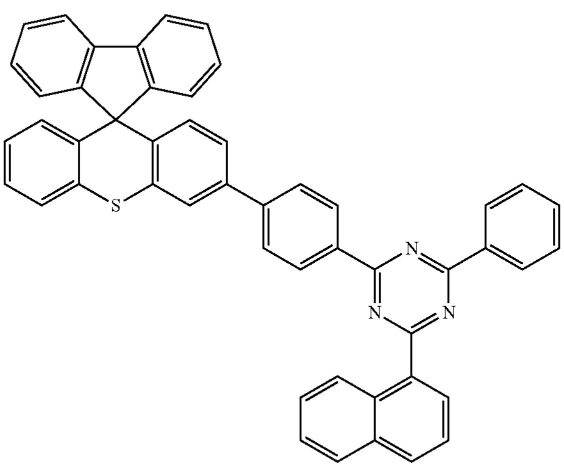
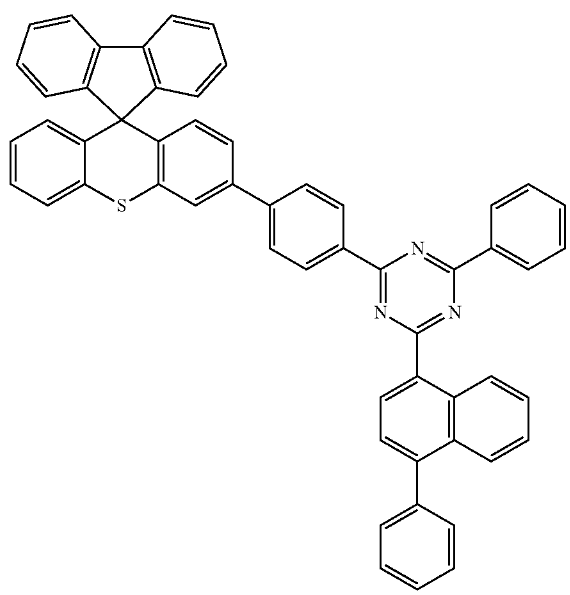

-continued
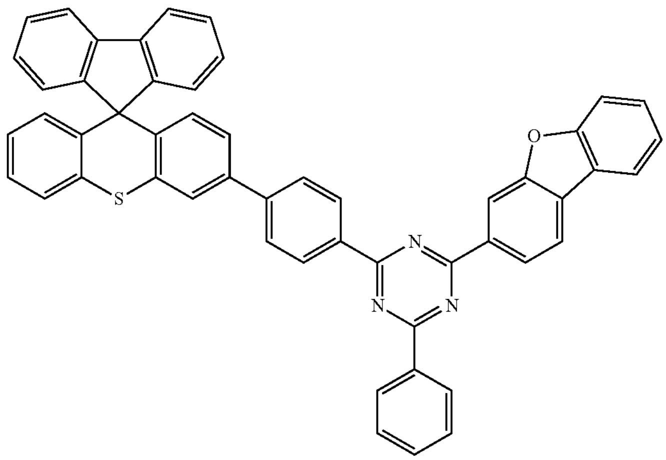
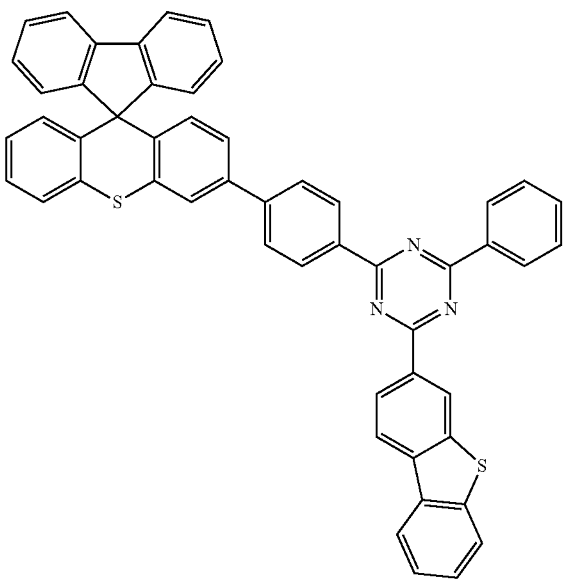
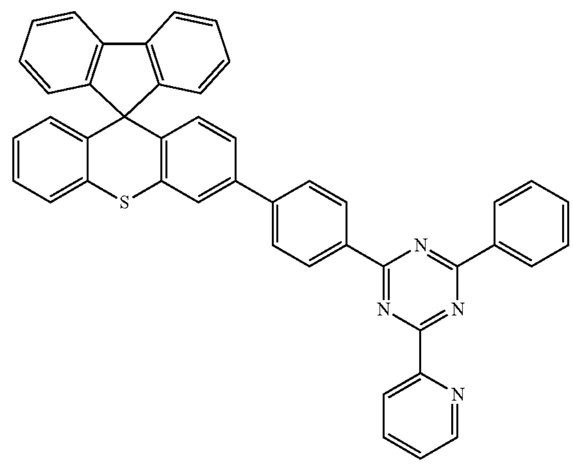
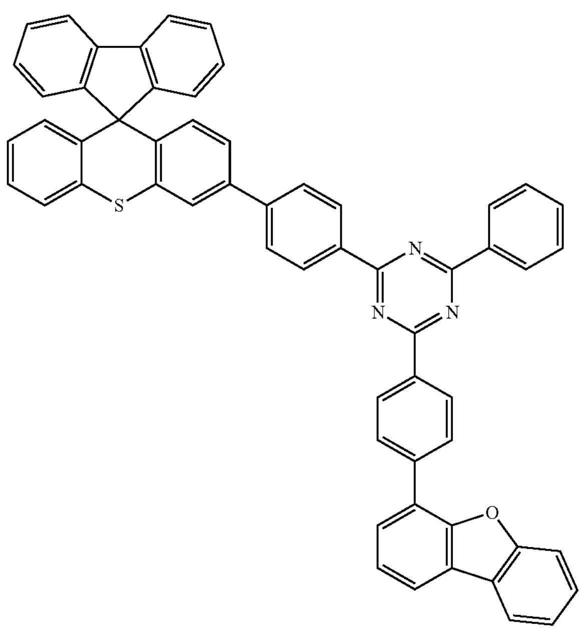

-continued
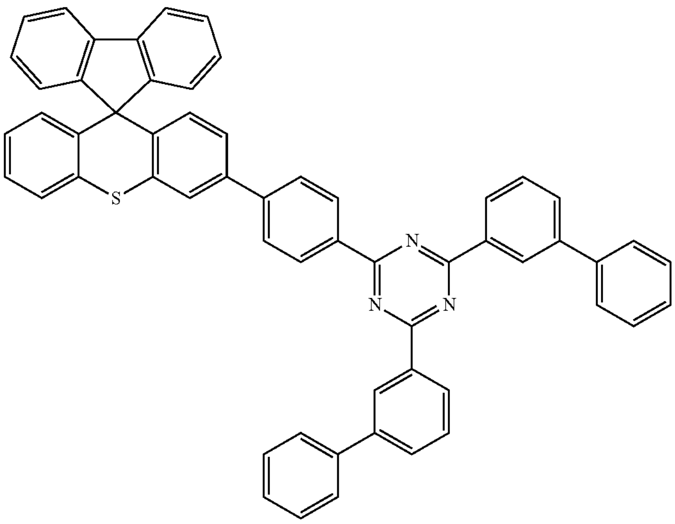
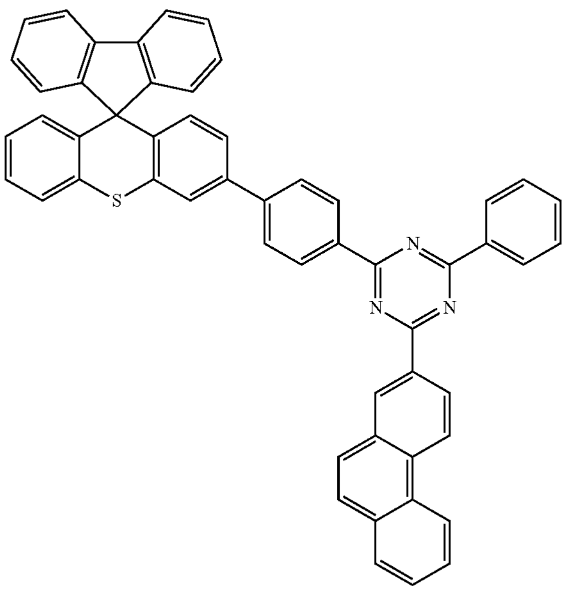
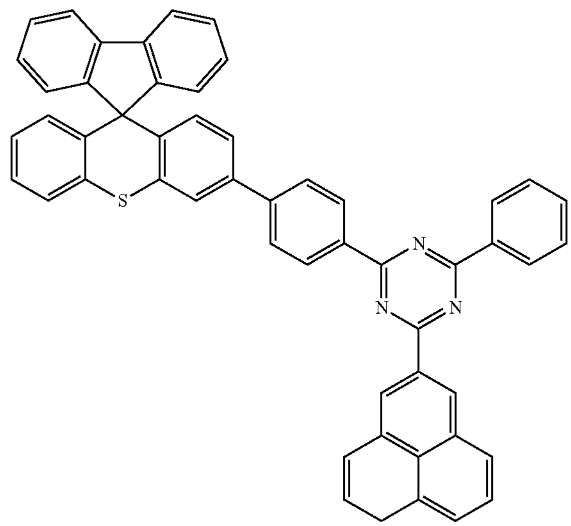
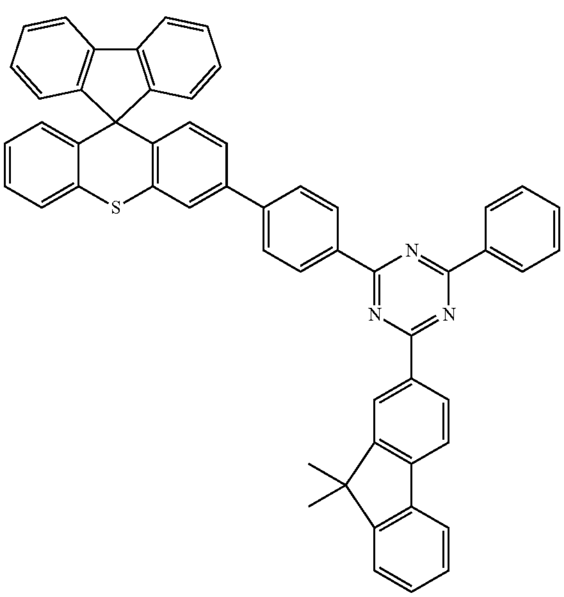

-continued
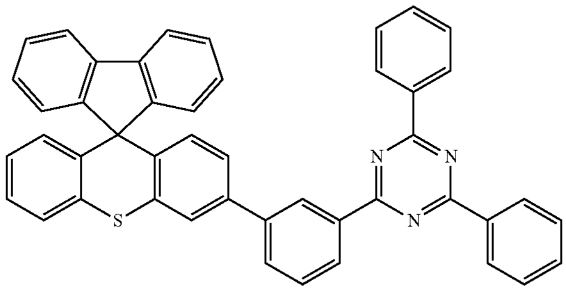
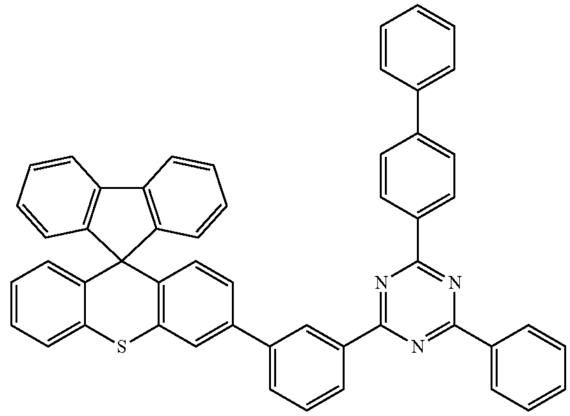
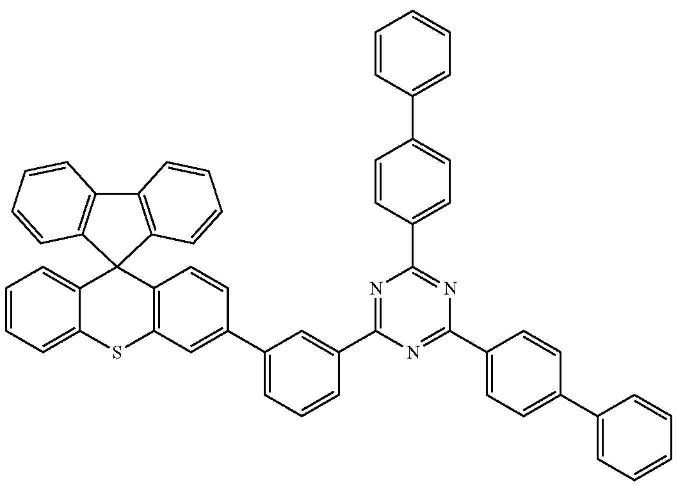
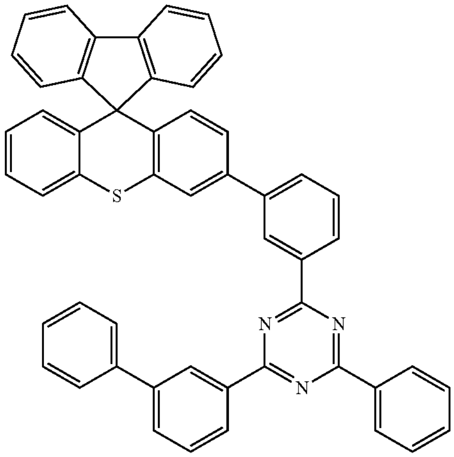
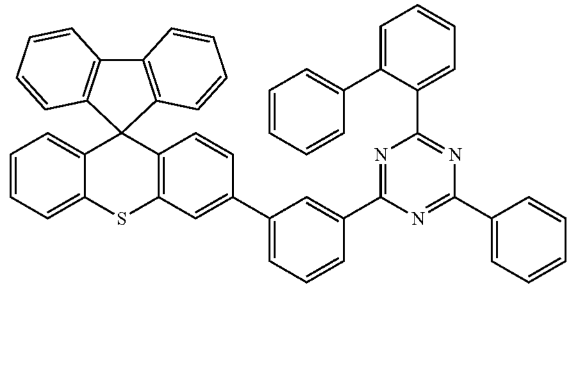

-continued
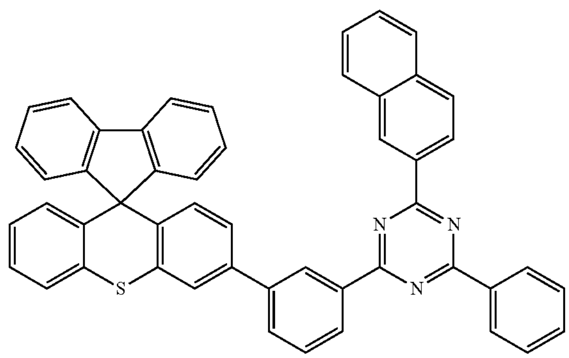
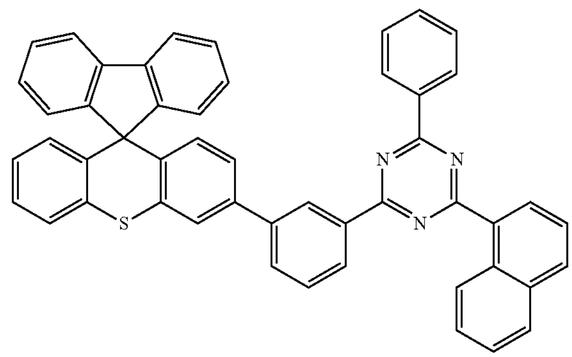
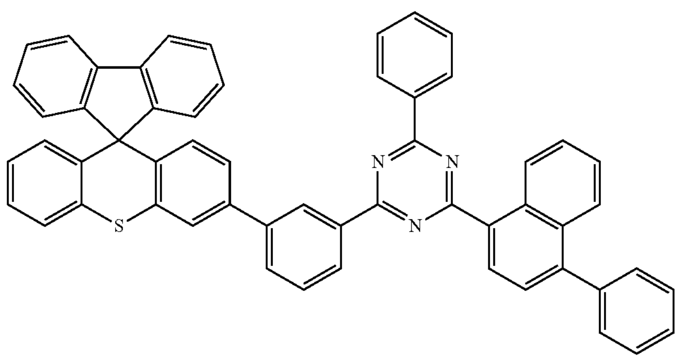
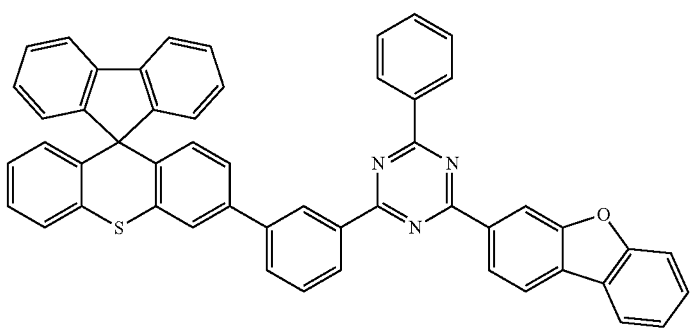
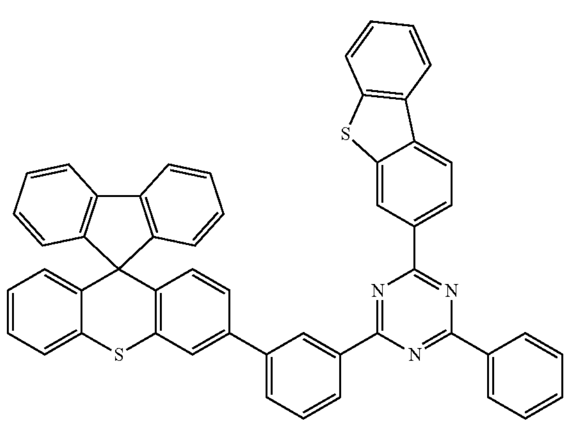
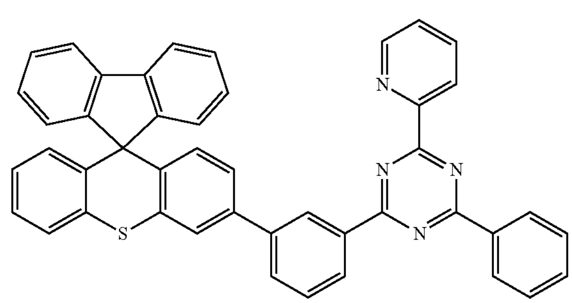

-continued
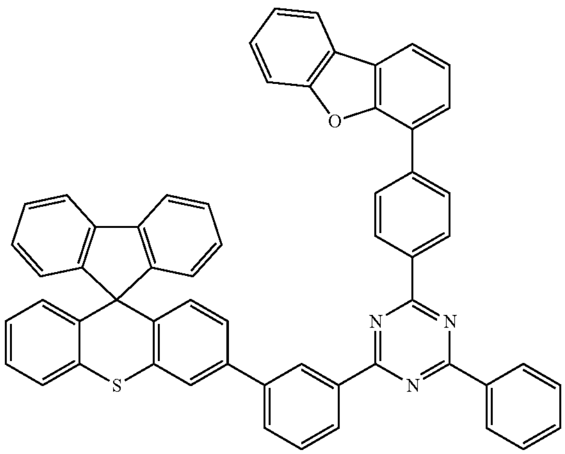
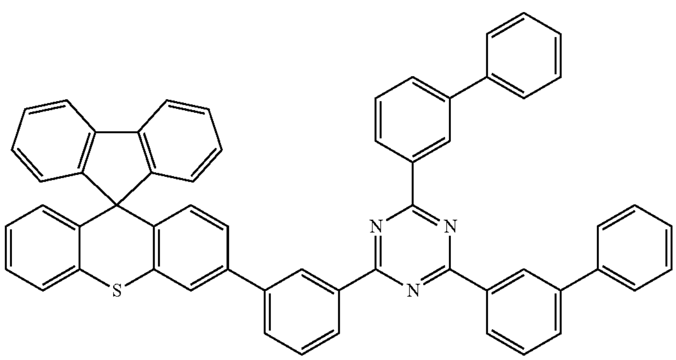
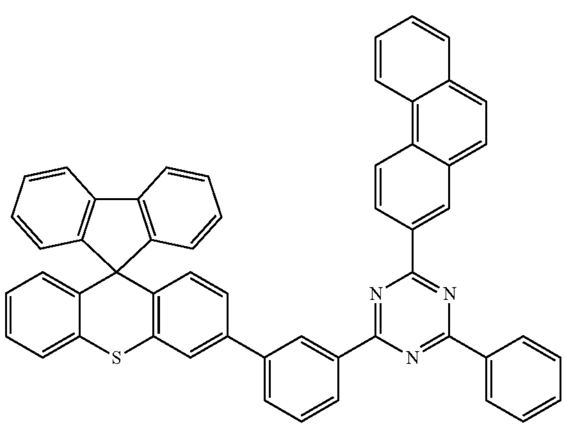
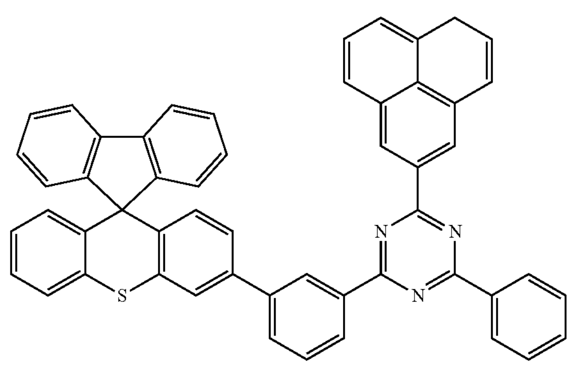

-continued
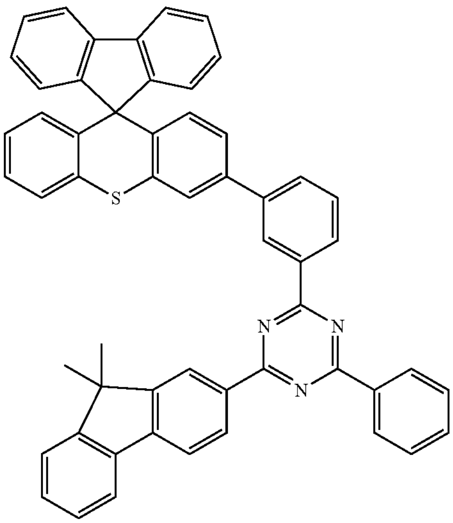
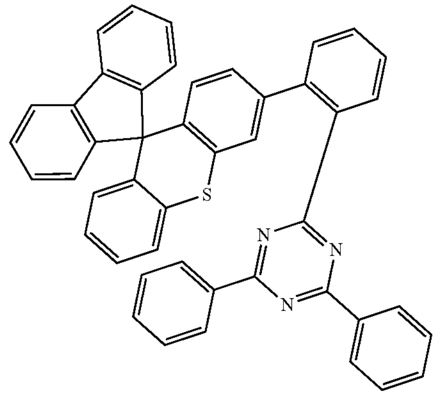
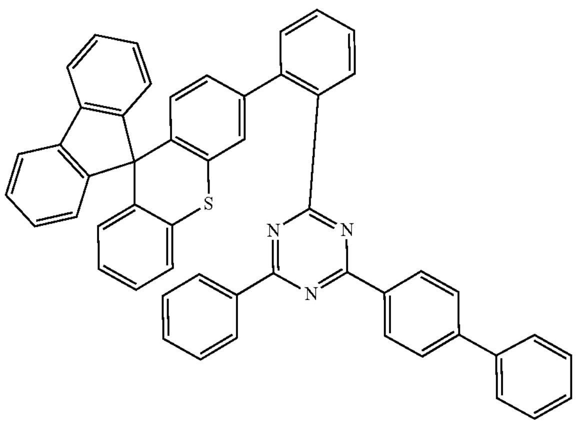
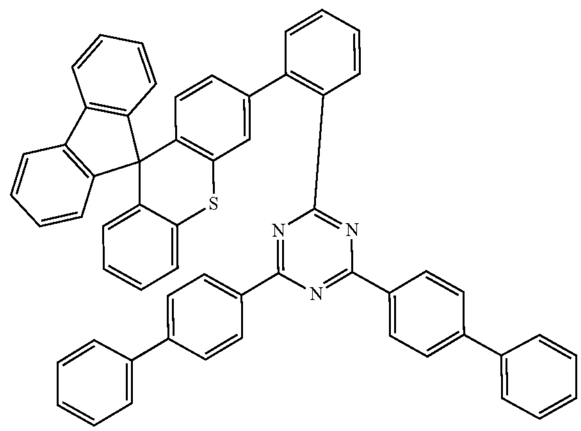
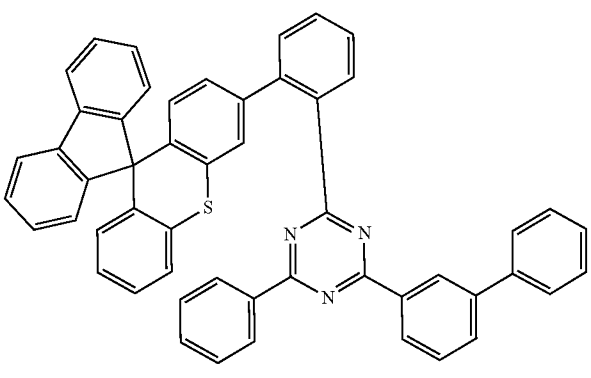
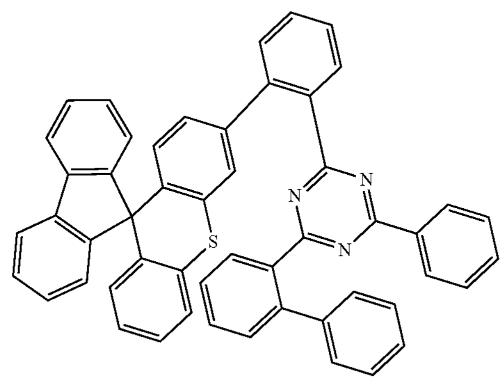
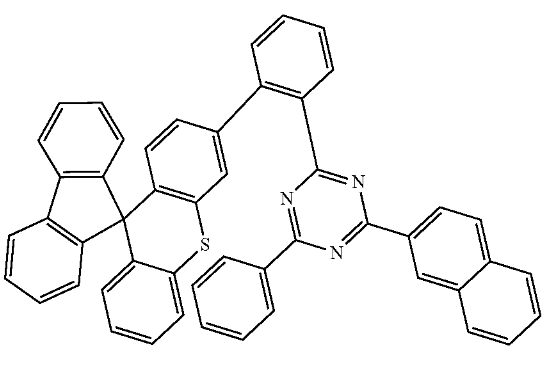
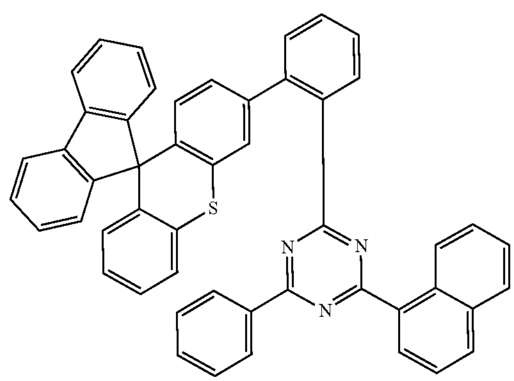

-continued
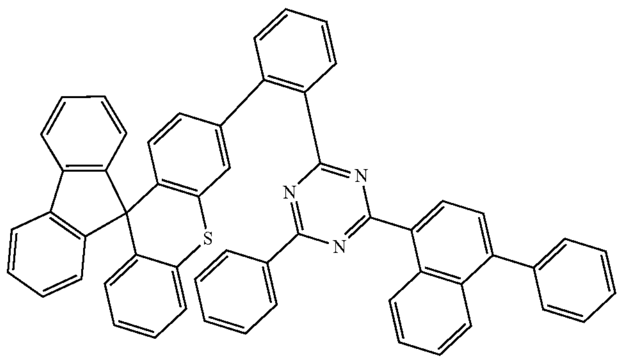
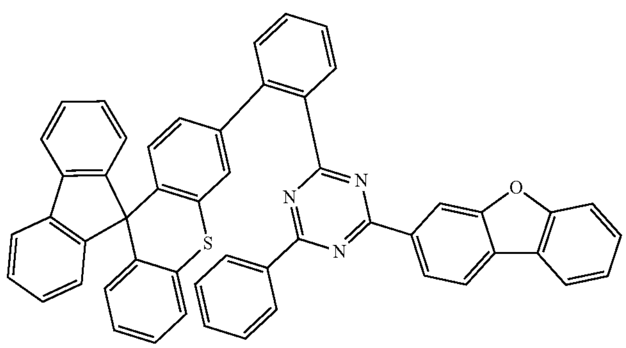
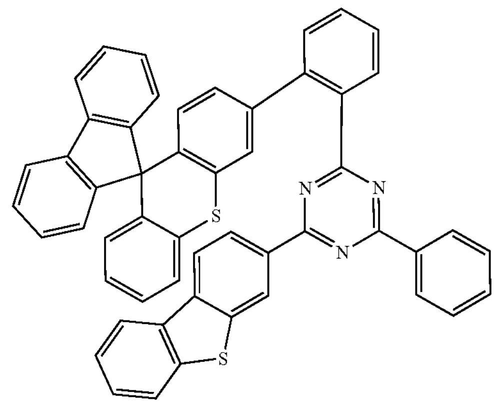
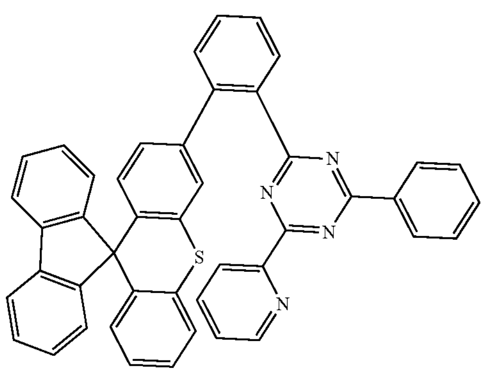
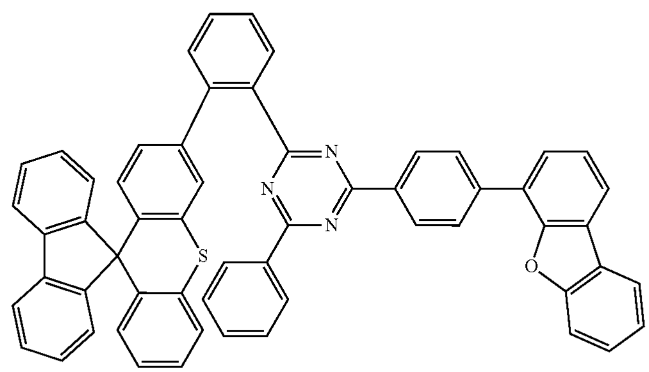
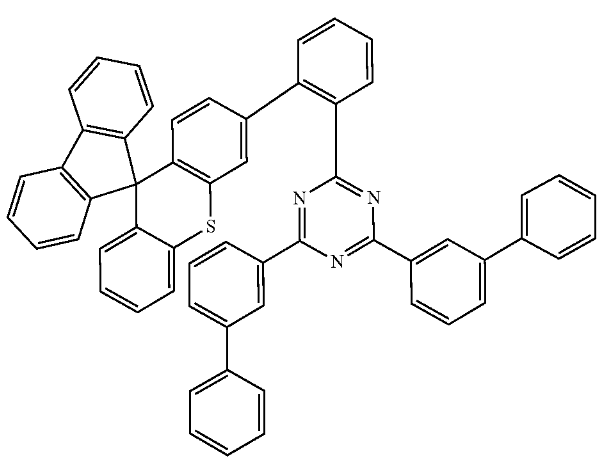

-continued
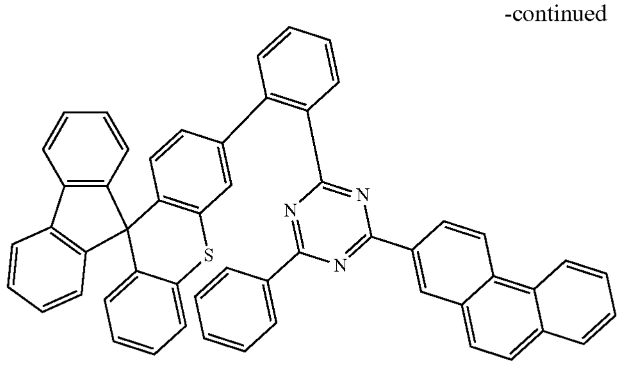
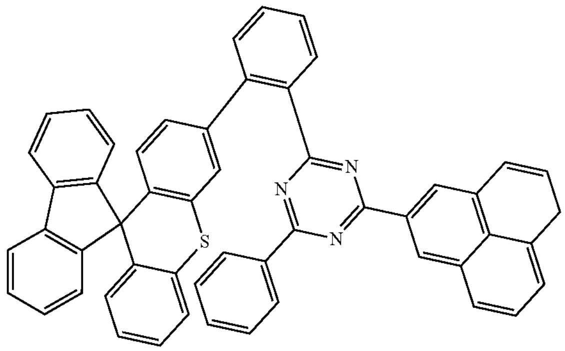
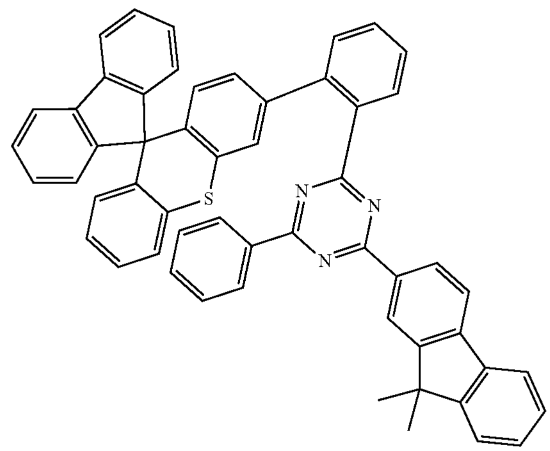
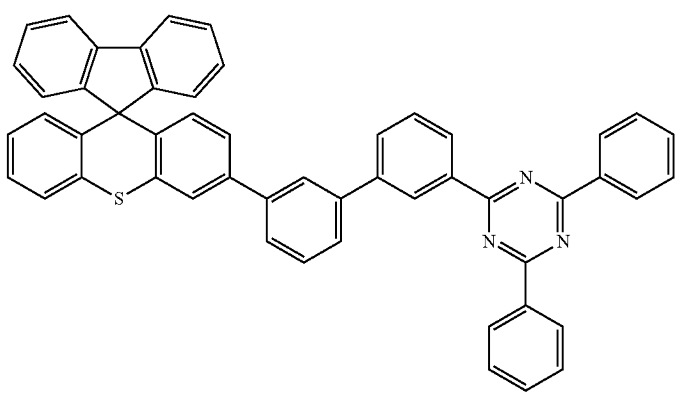
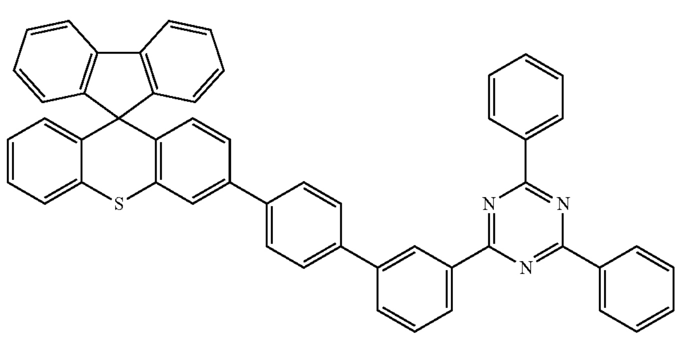

-continued
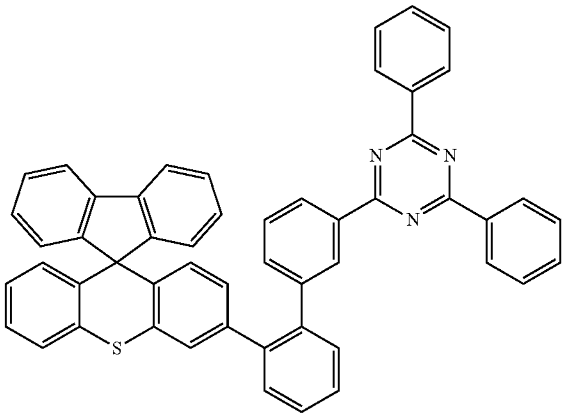
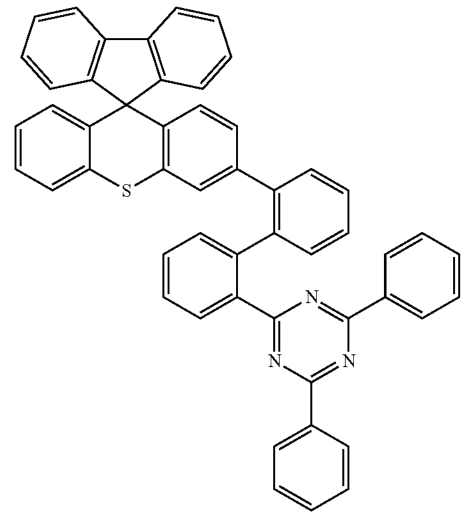
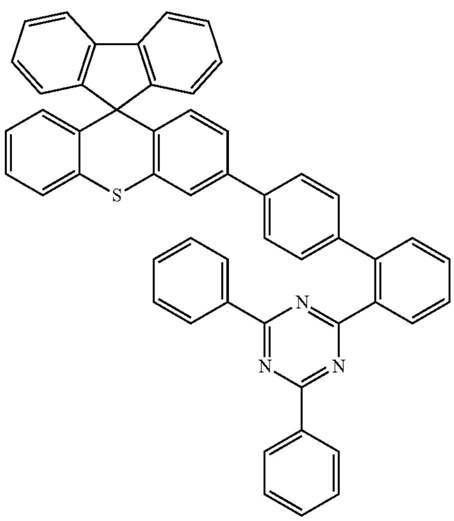
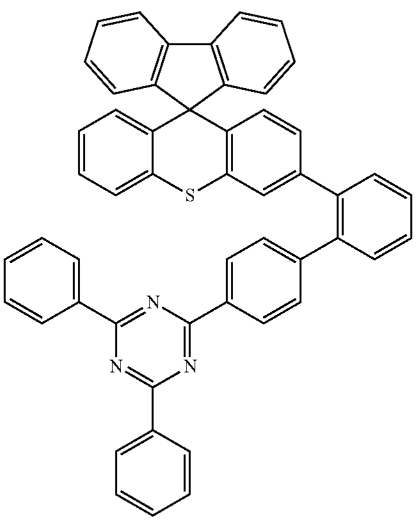
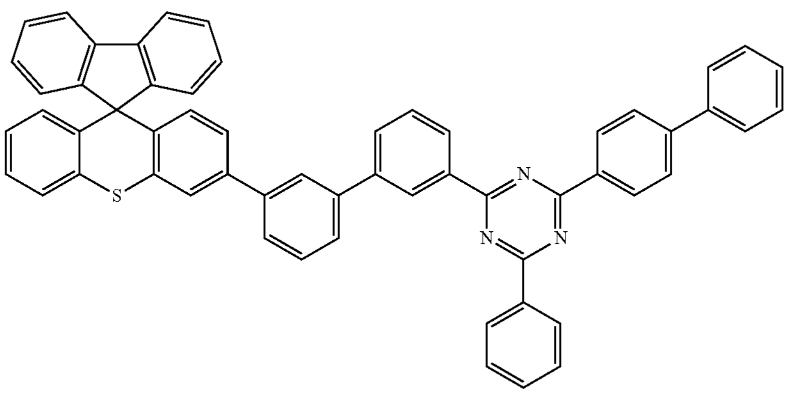

-continued
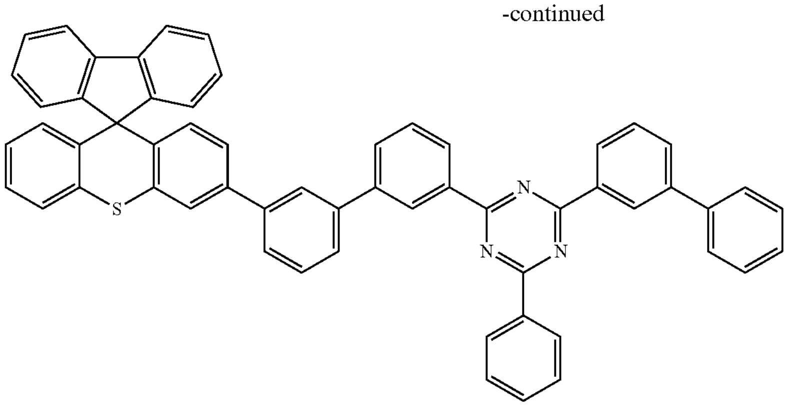
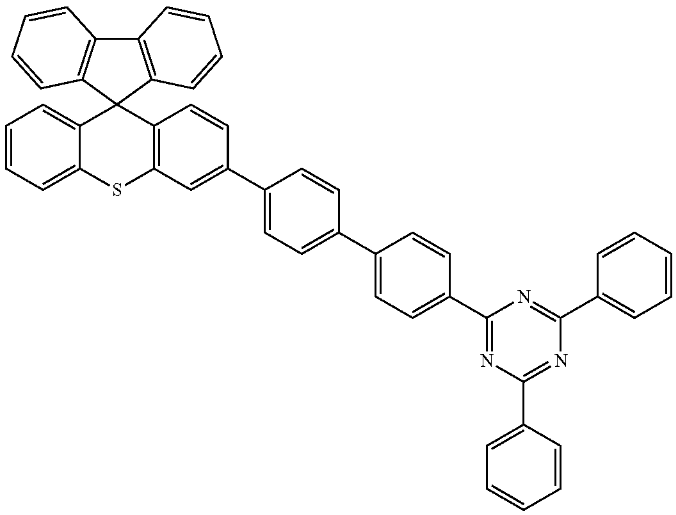
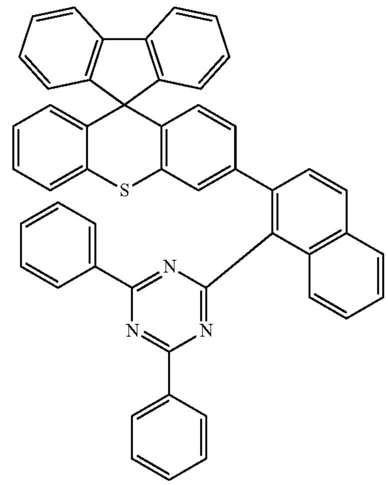
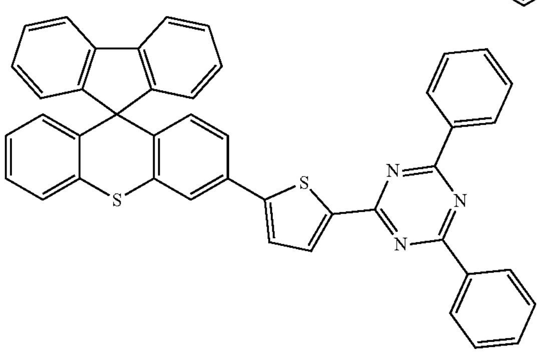
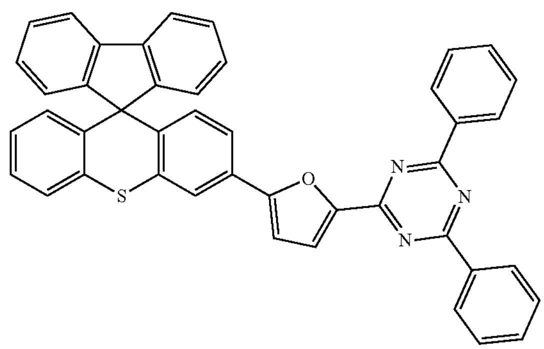
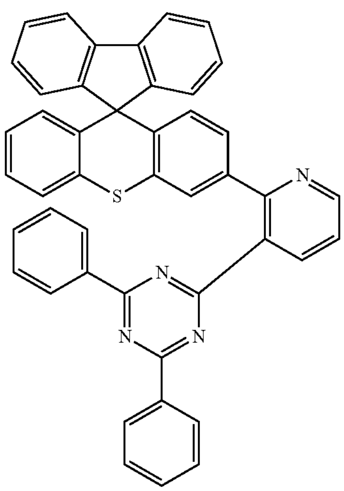
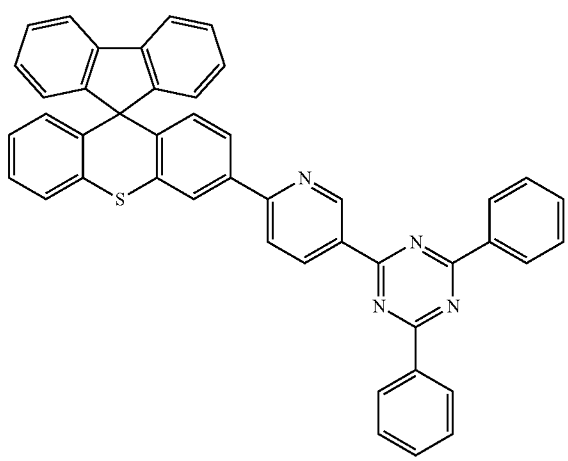

-continued
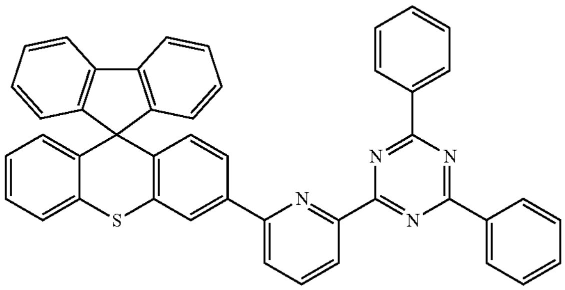
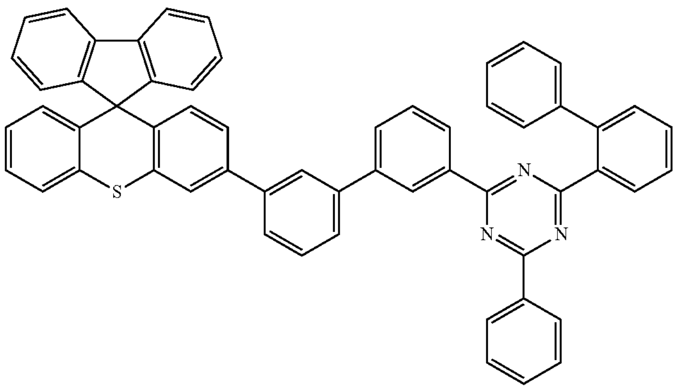
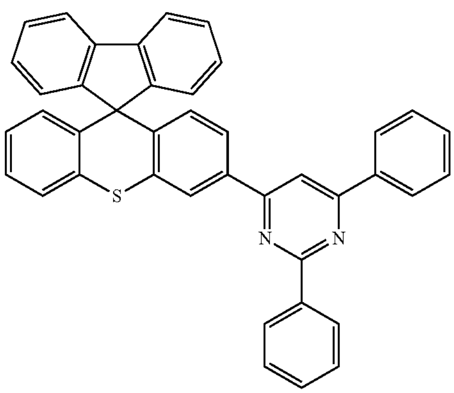
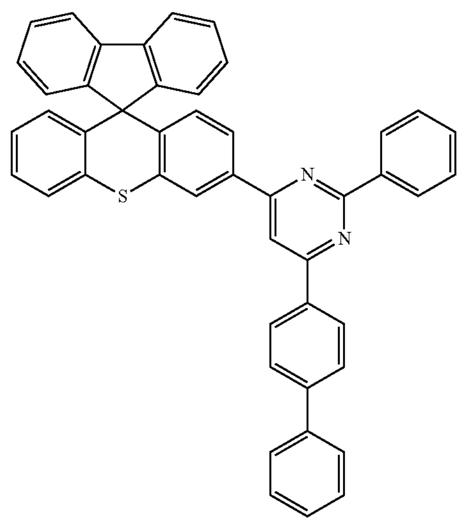
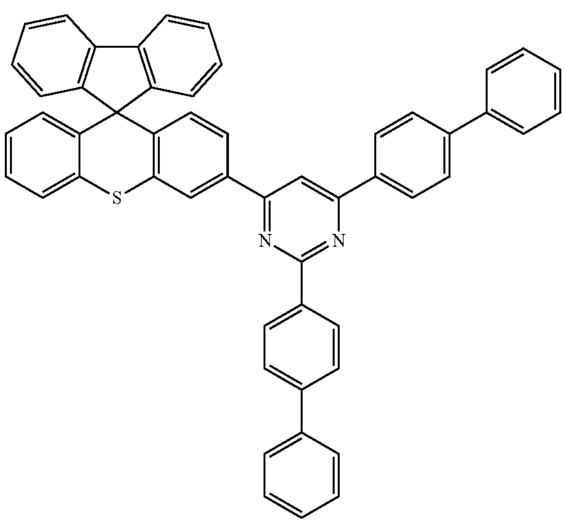
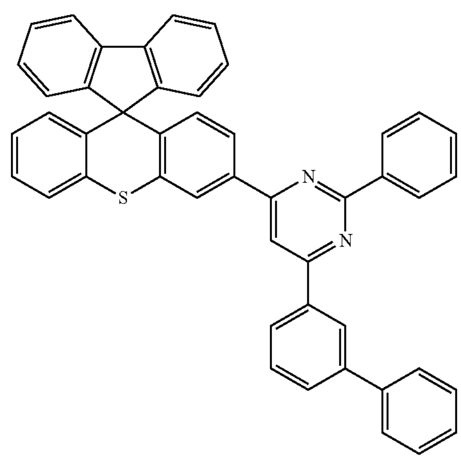

-continued
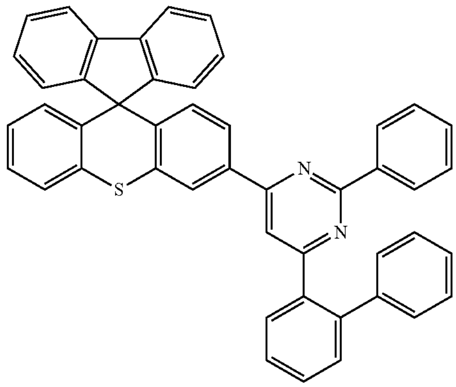
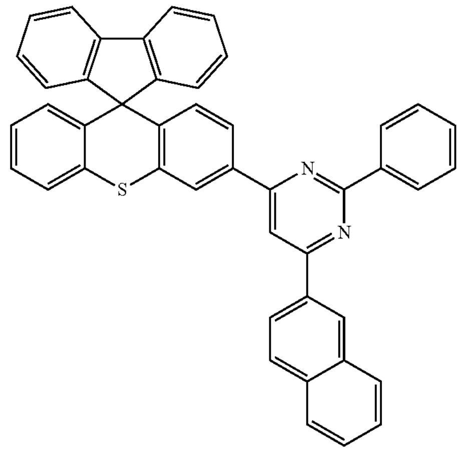
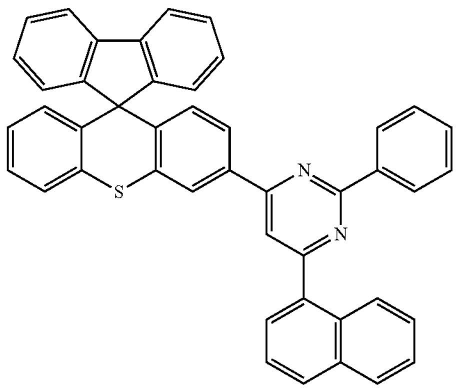
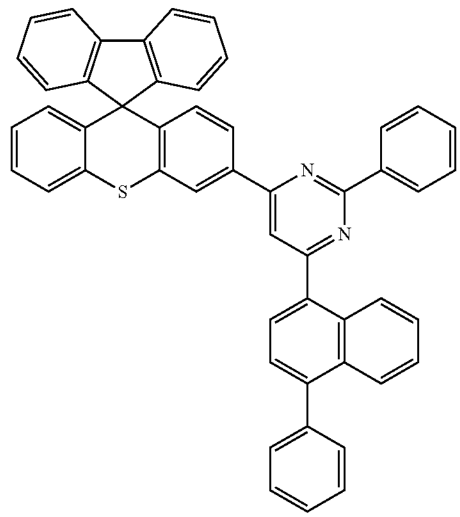
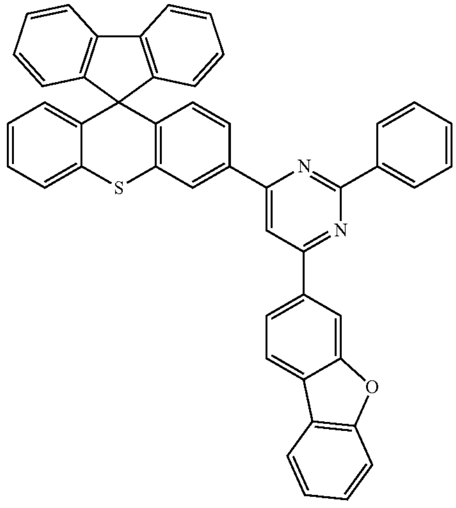
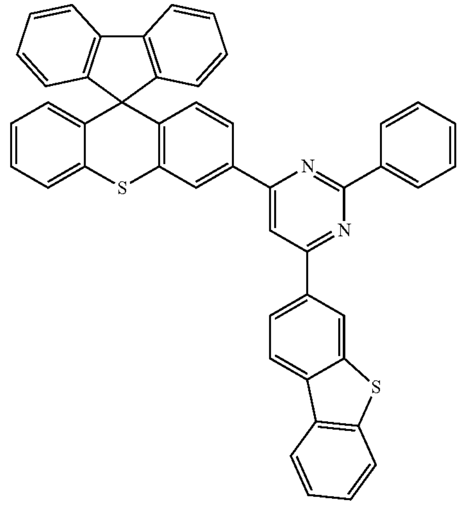

-continued
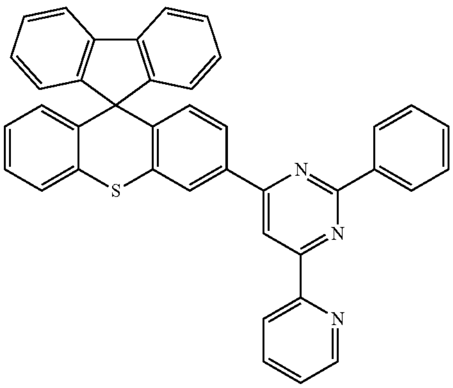
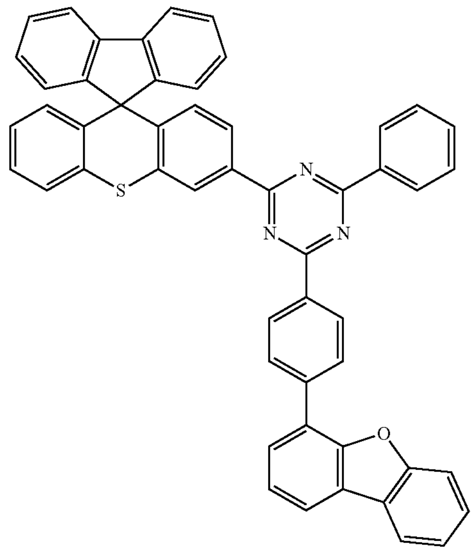
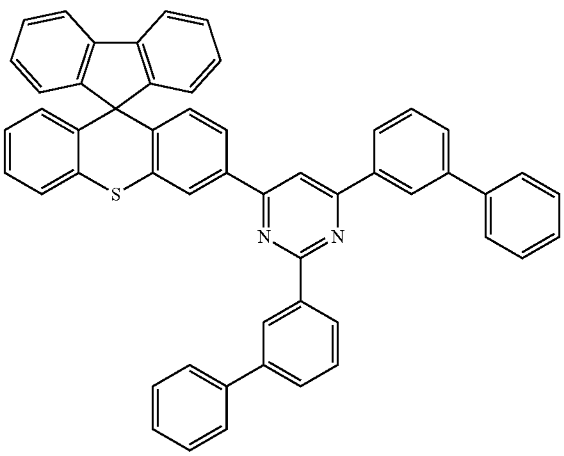
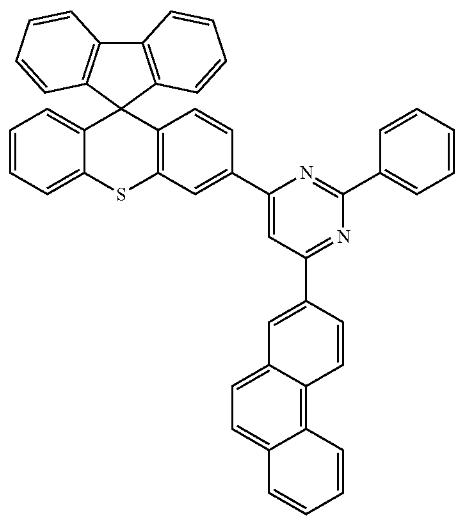
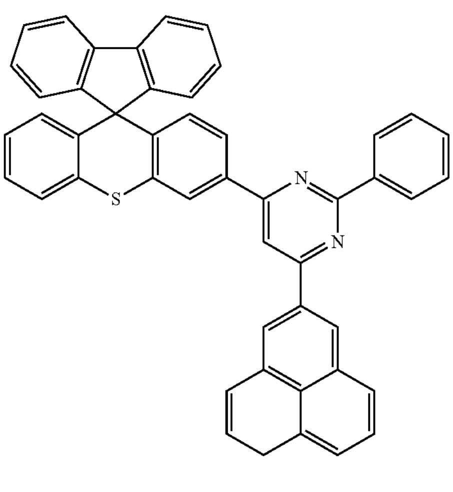
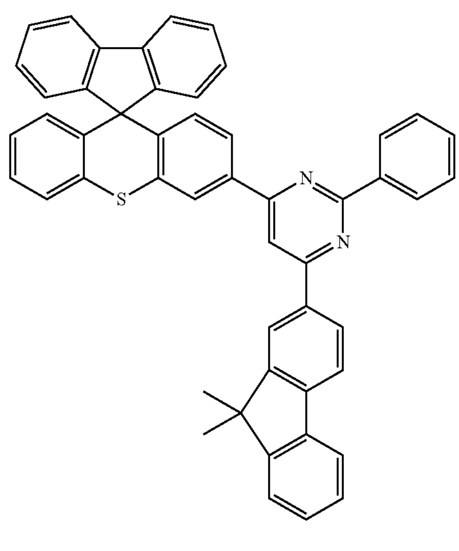

-continued
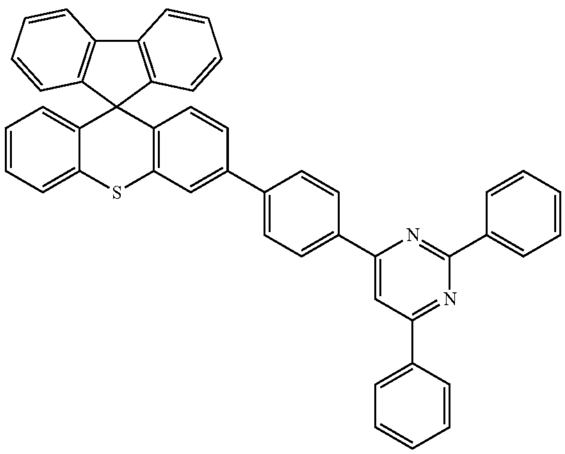
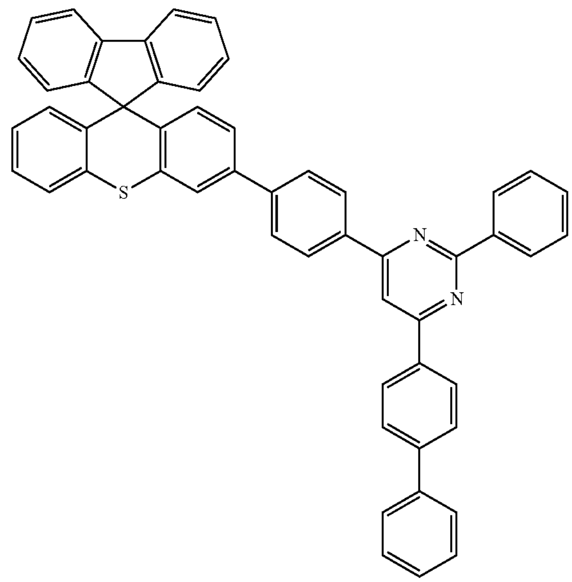
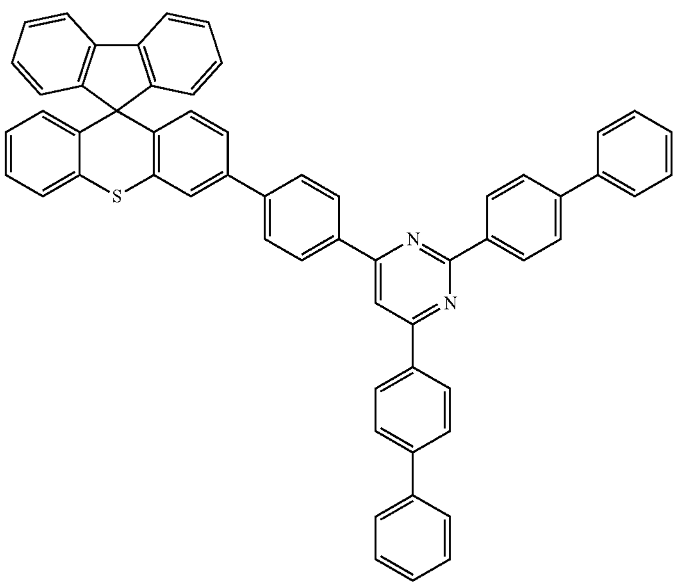
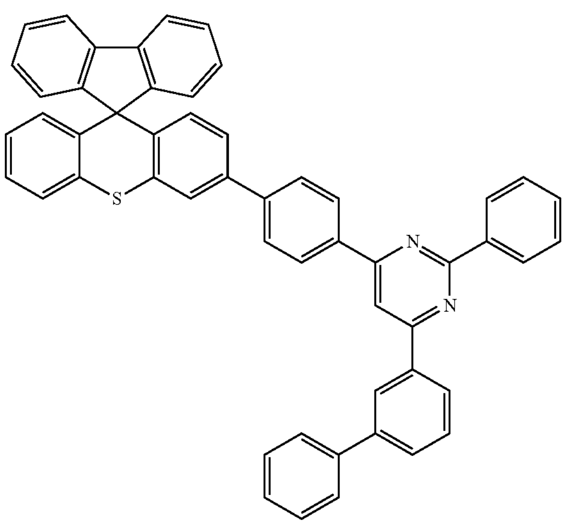
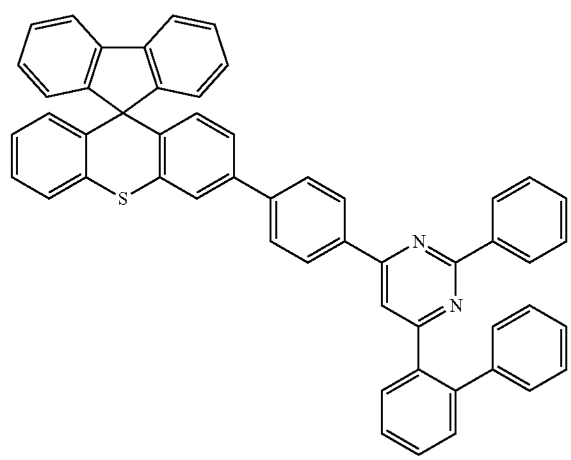

-continued
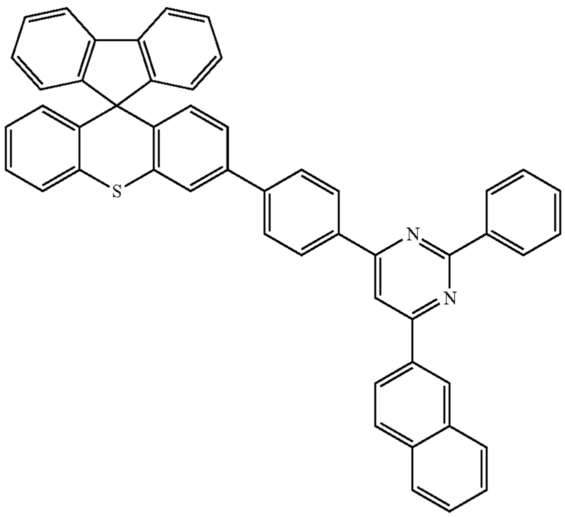
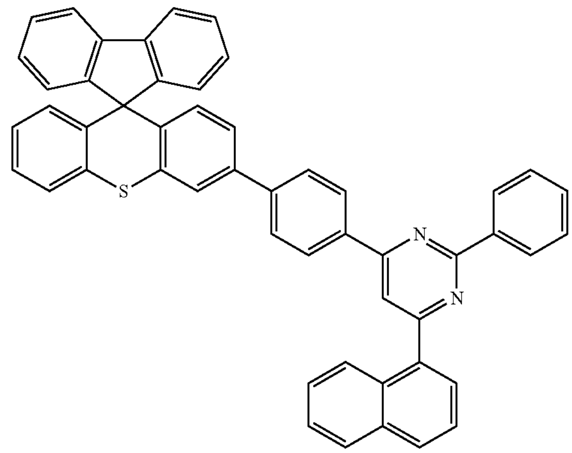
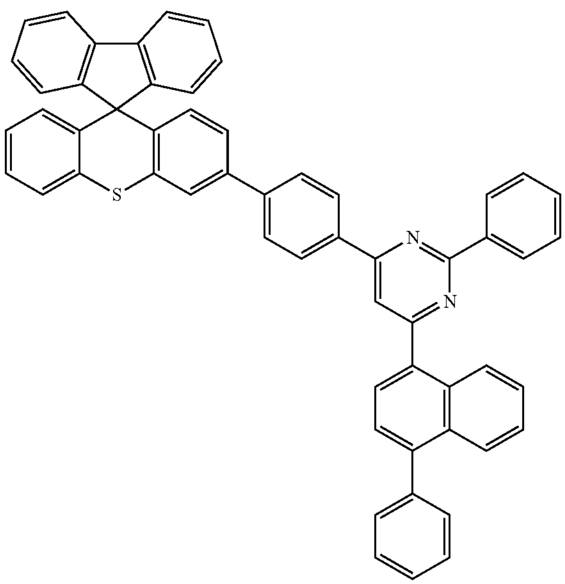
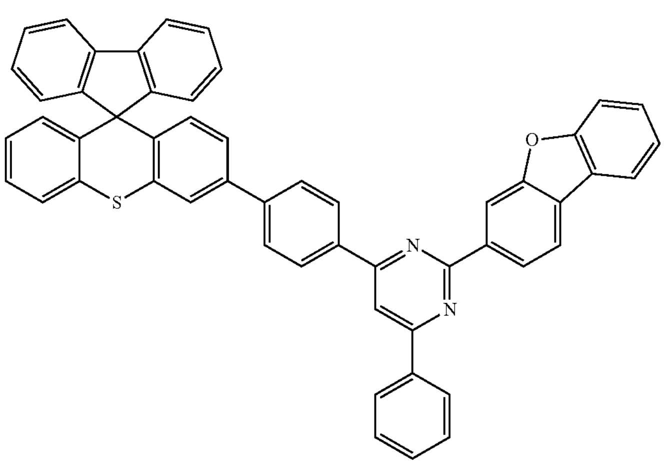

-continued
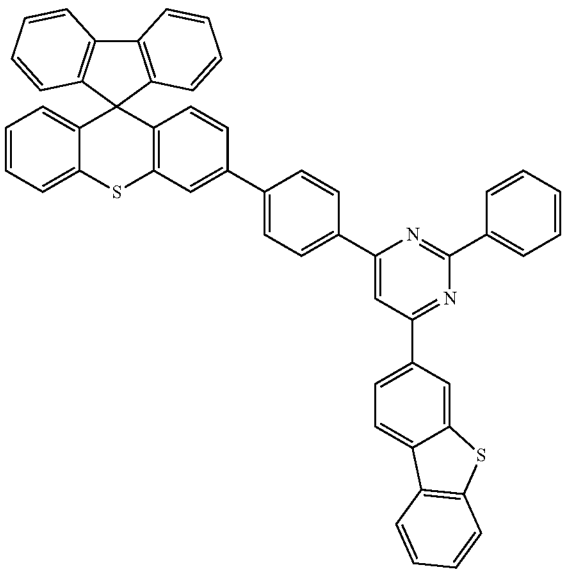
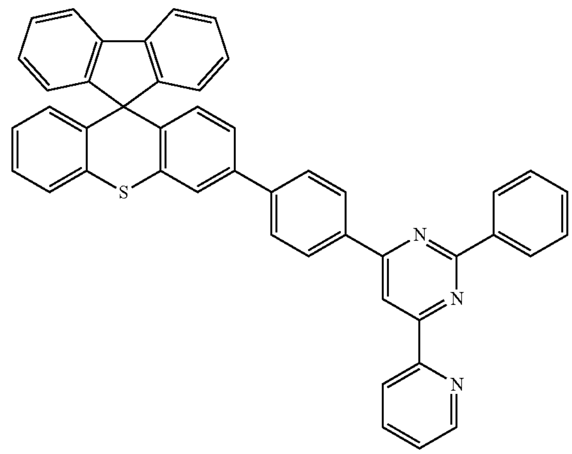
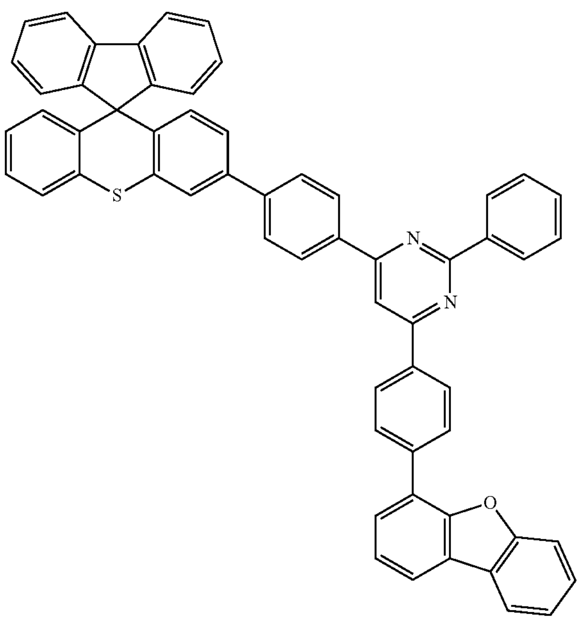
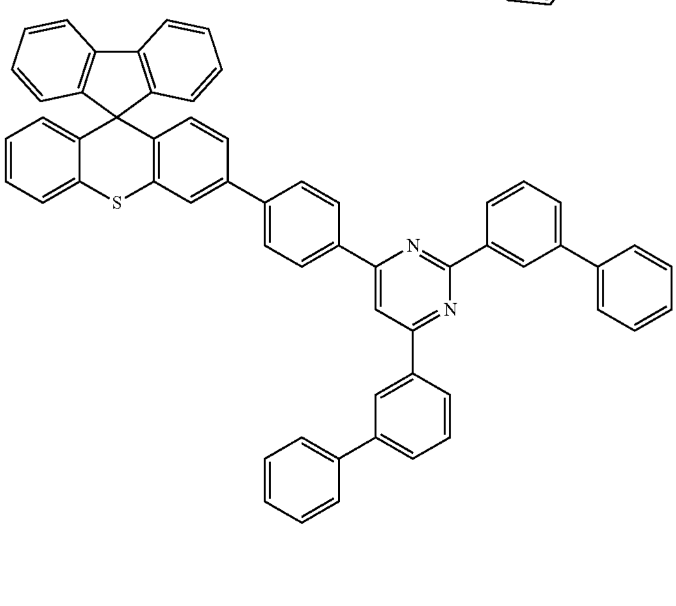

-continued
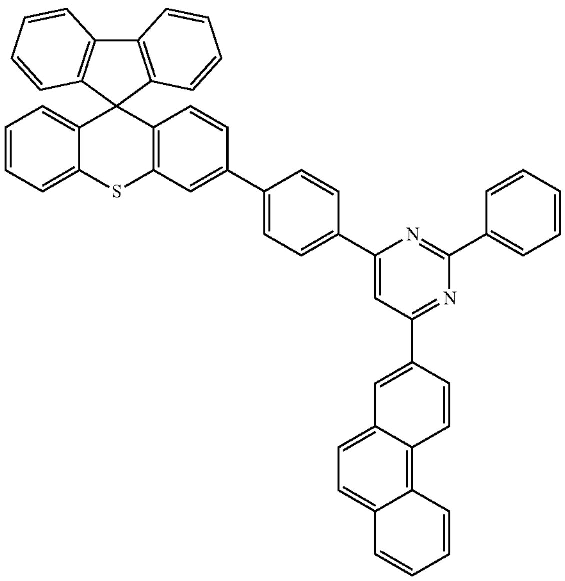
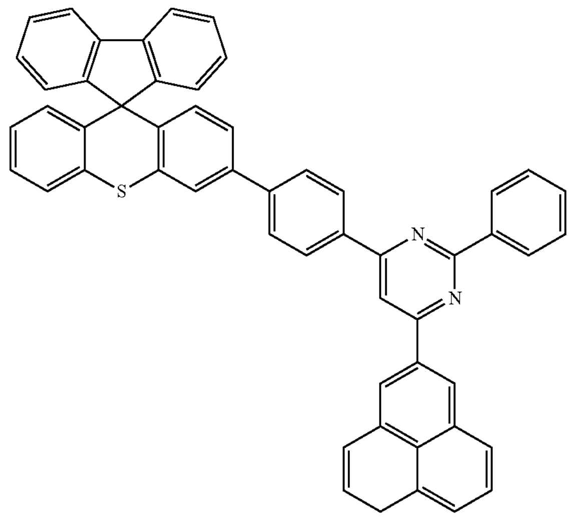
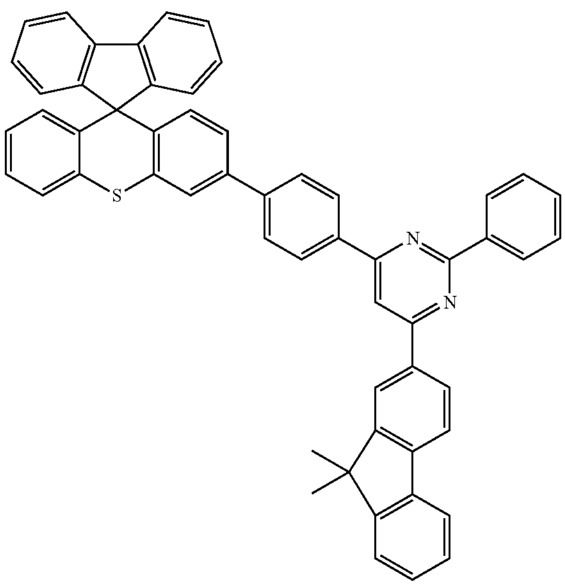
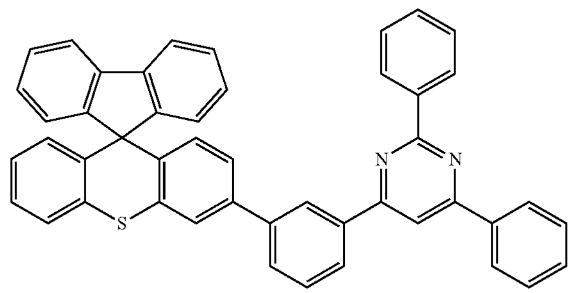
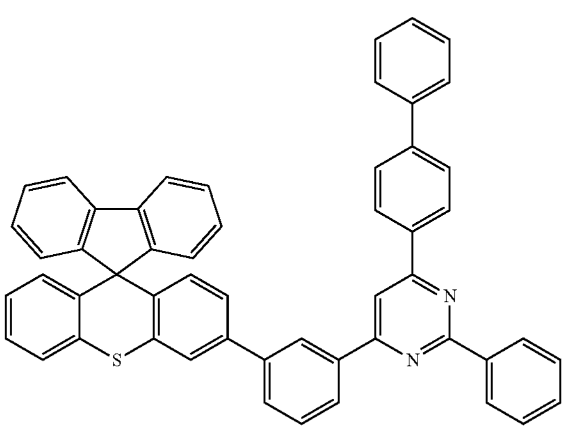

-continued
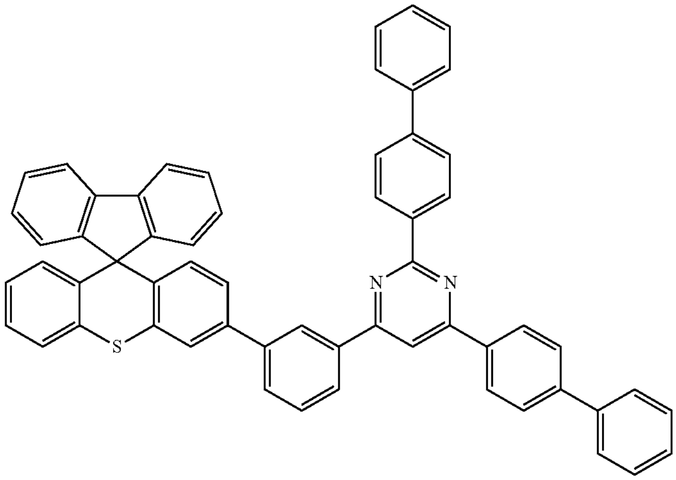
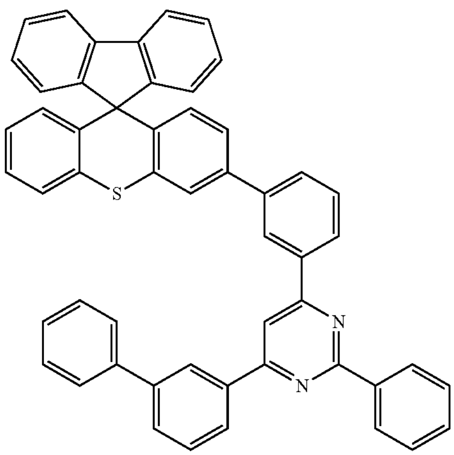
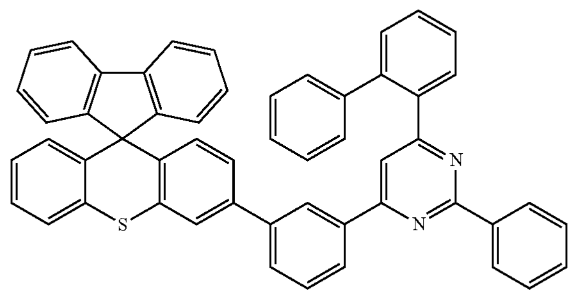
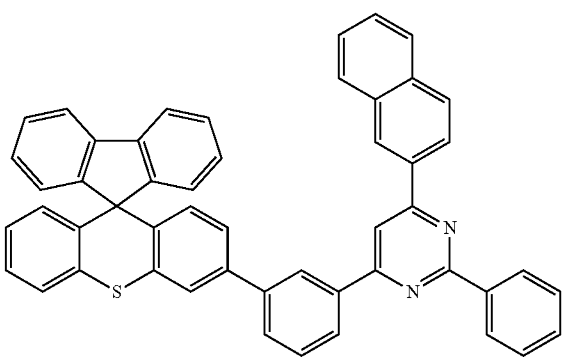
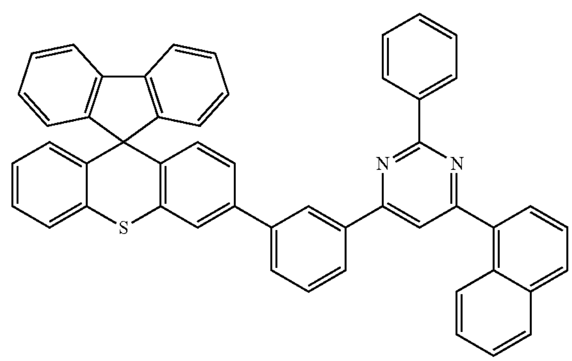
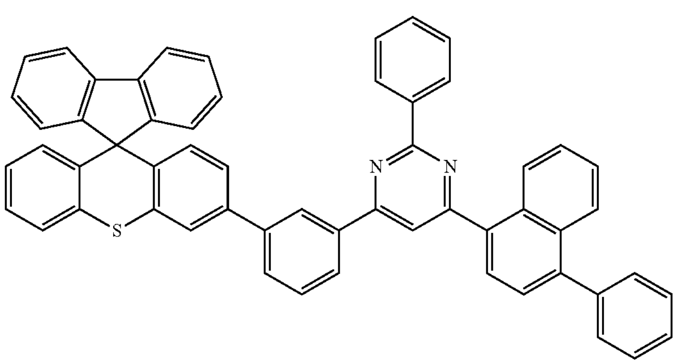

-continued
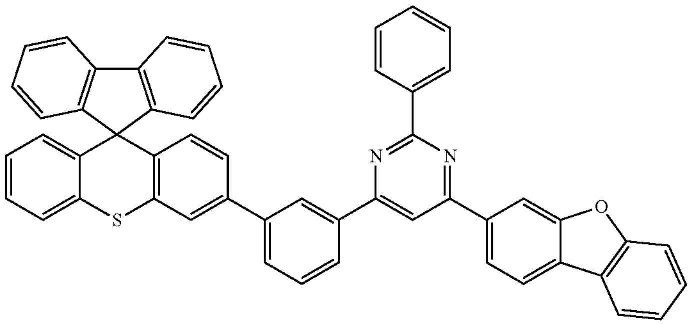
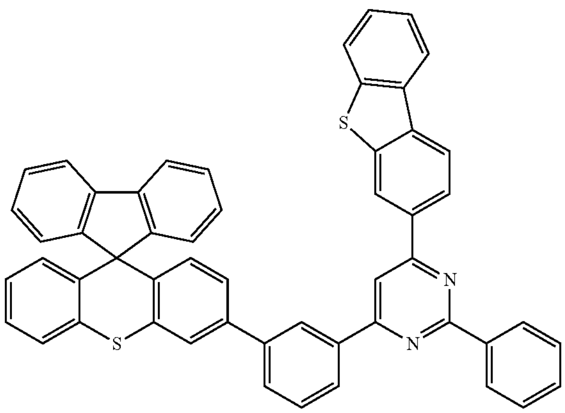
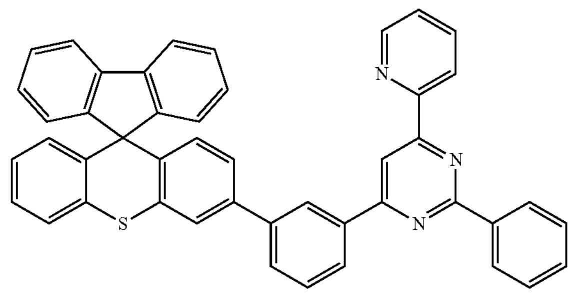
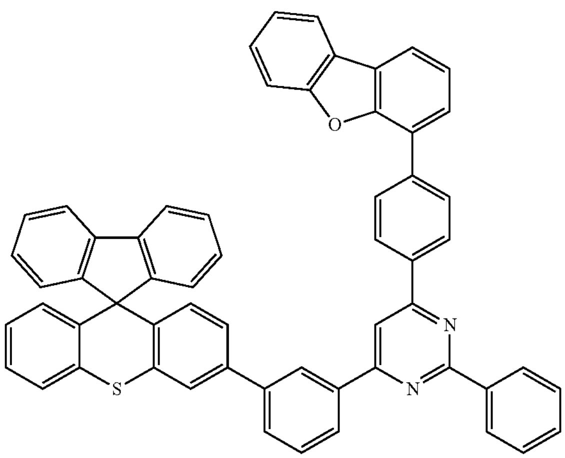
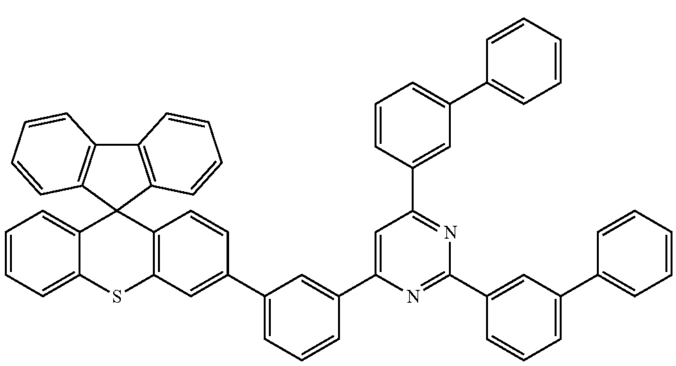

-continued
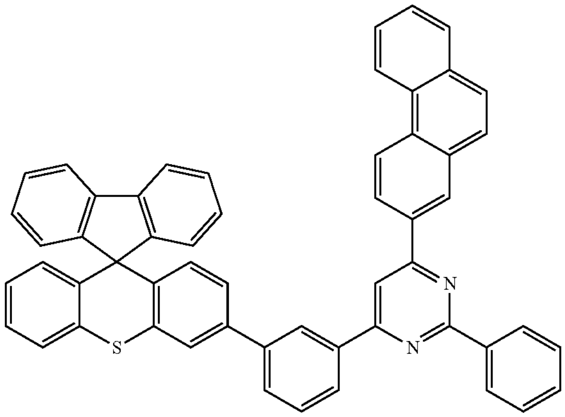
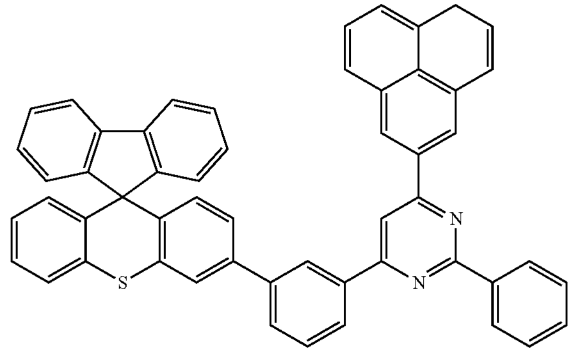
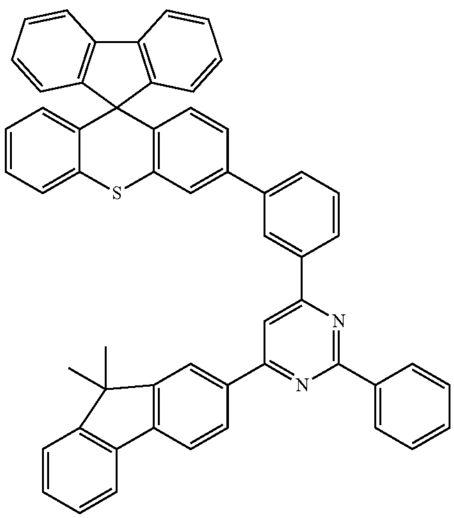
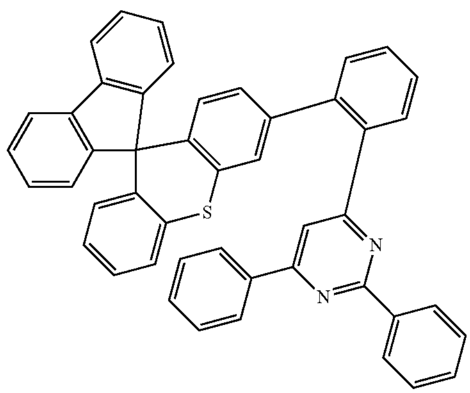
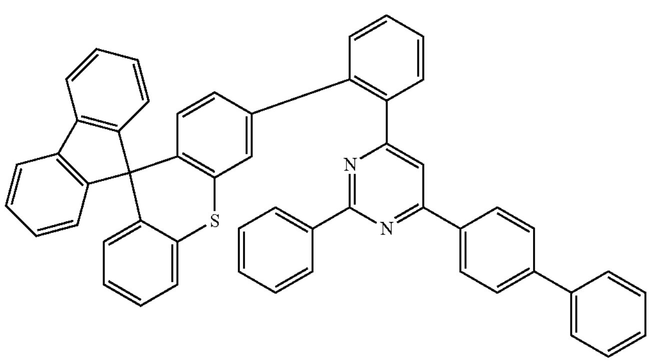

-continued
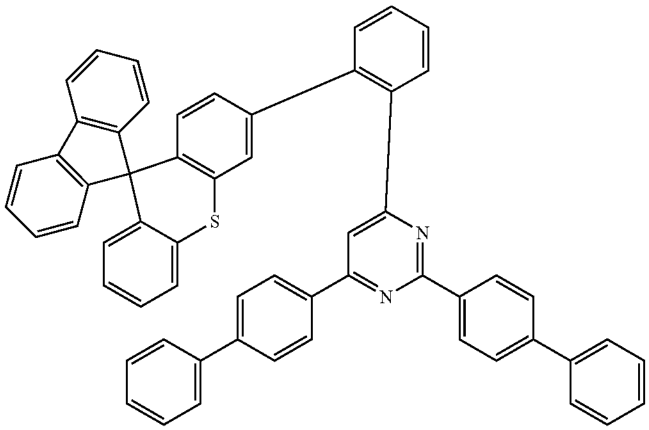
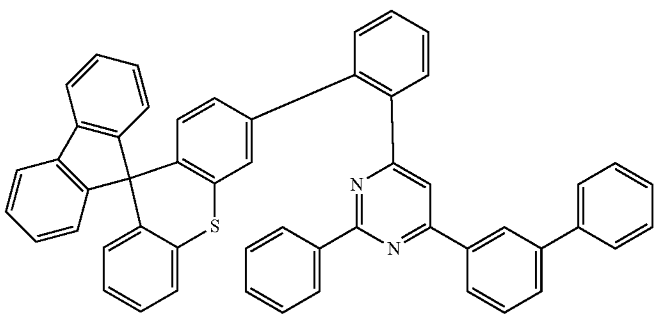
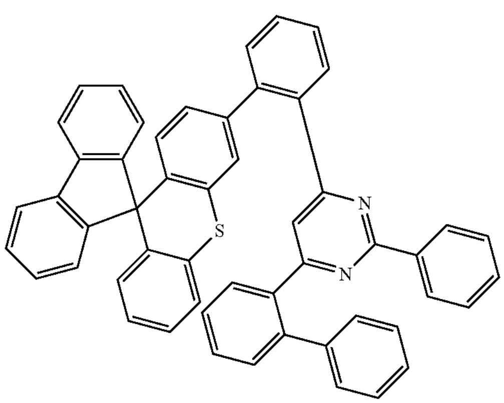
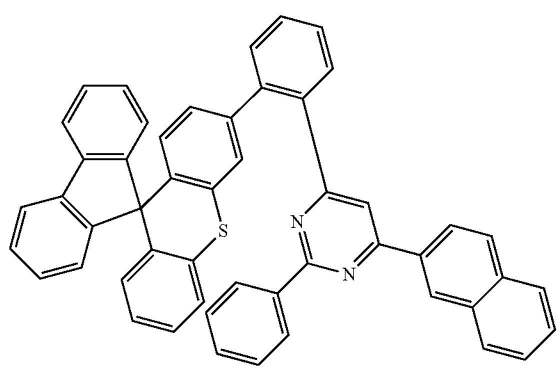
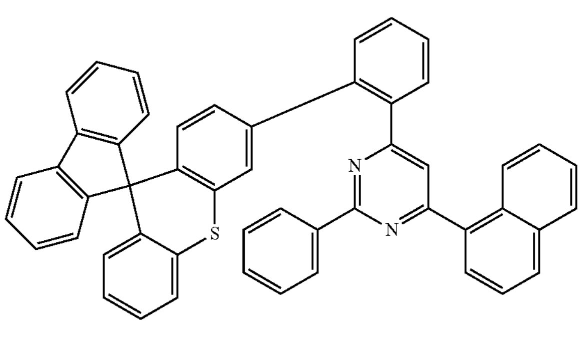

-continued
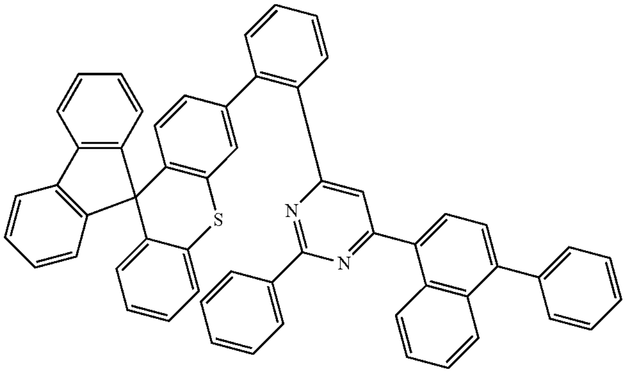
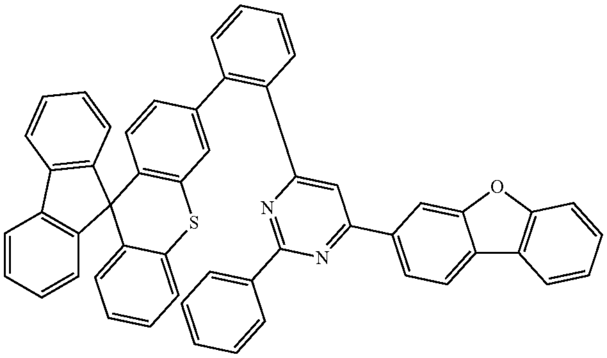
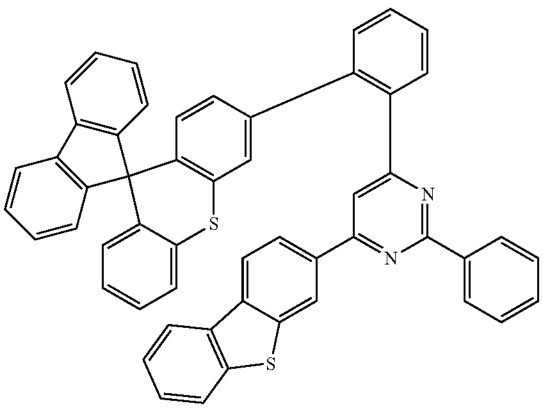
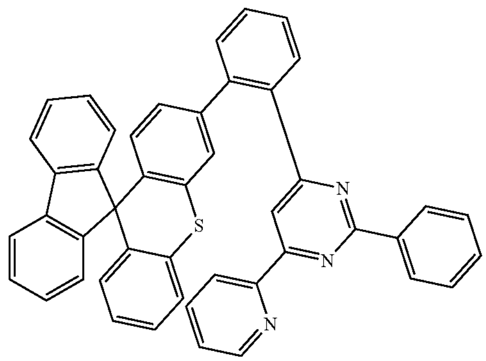
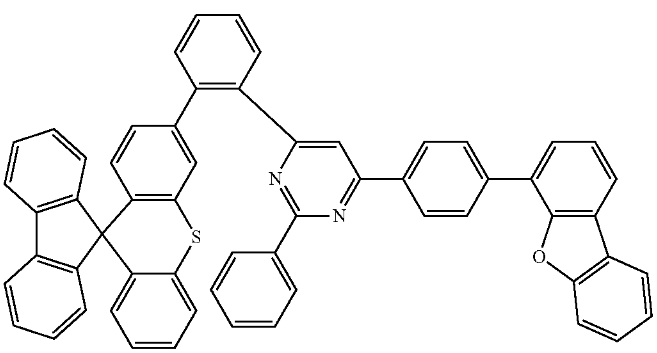

-continued
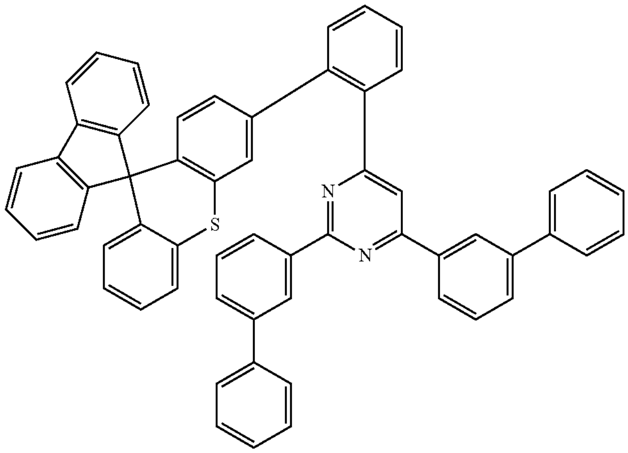
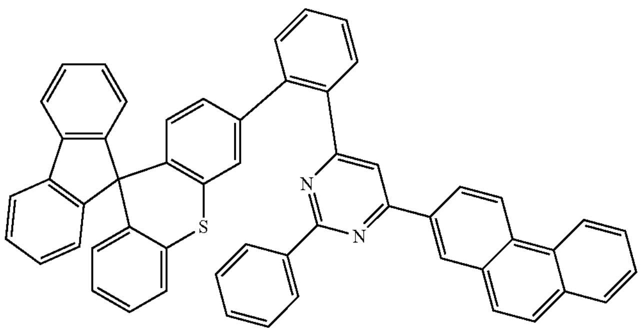
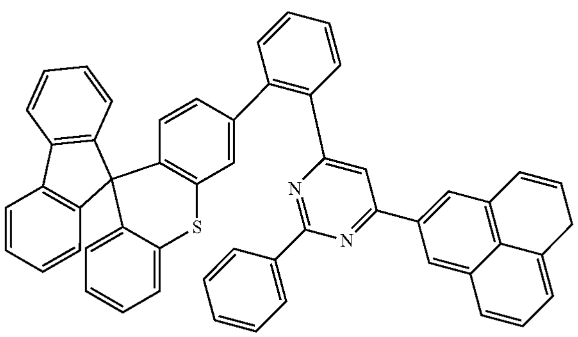
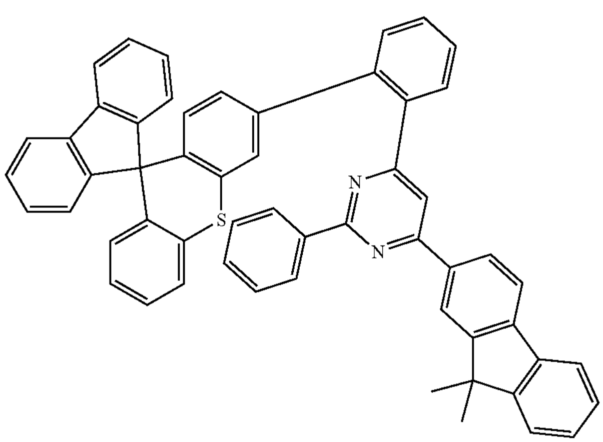

-continued
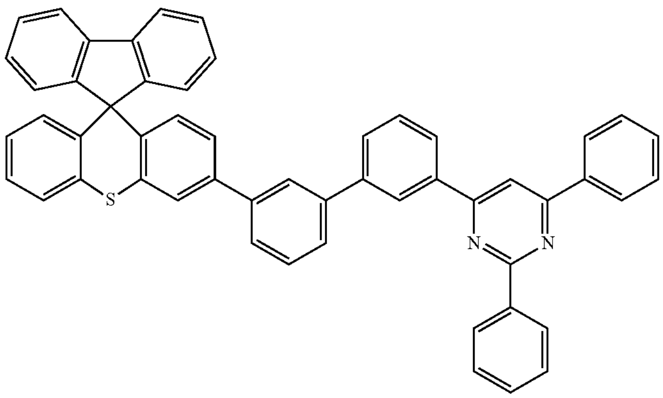
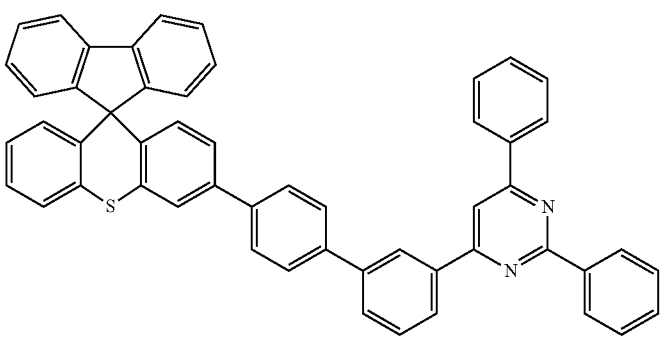
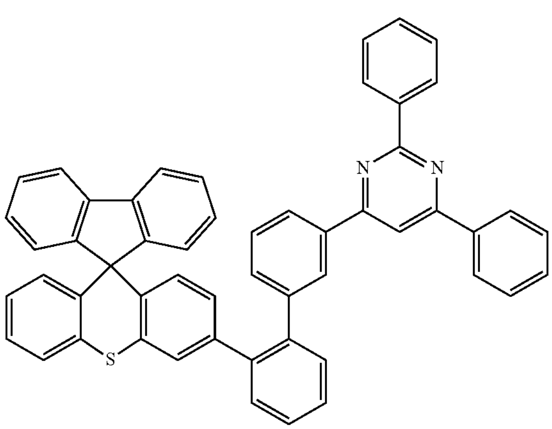
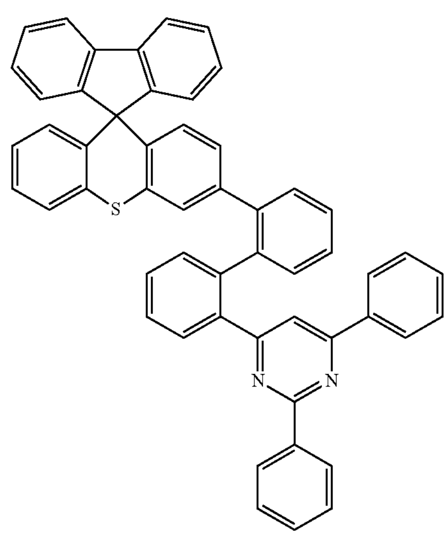

-continued
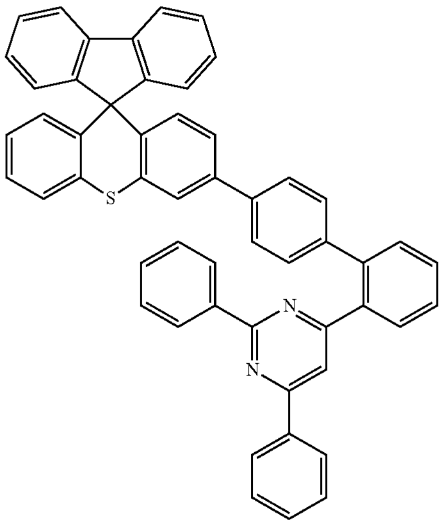
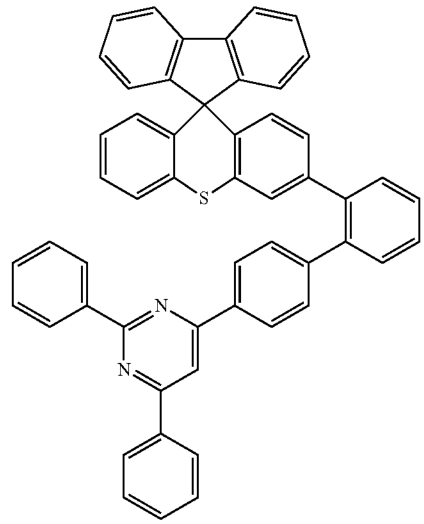
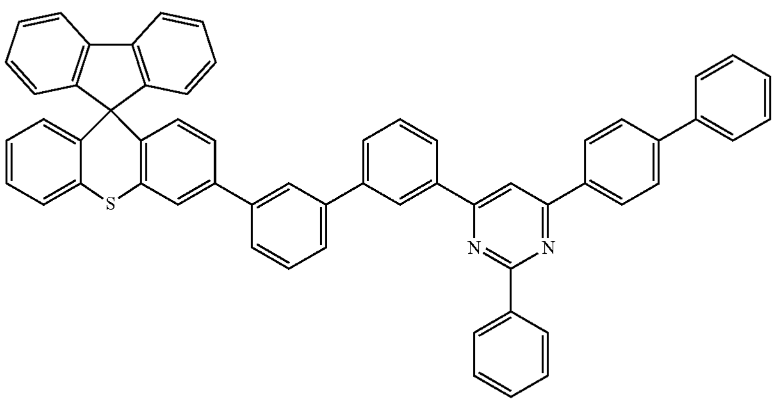
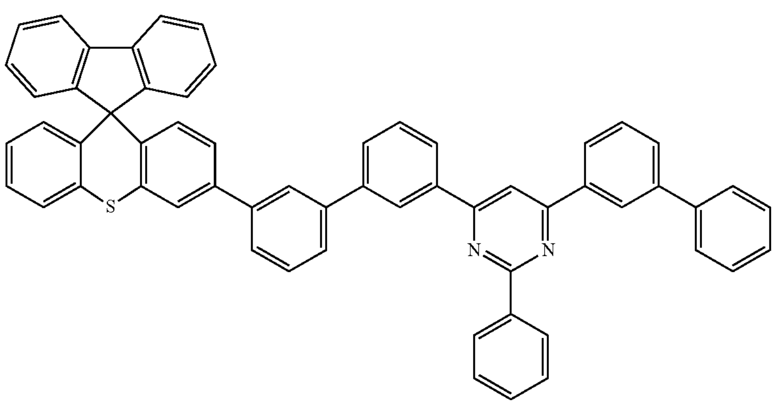

-continued
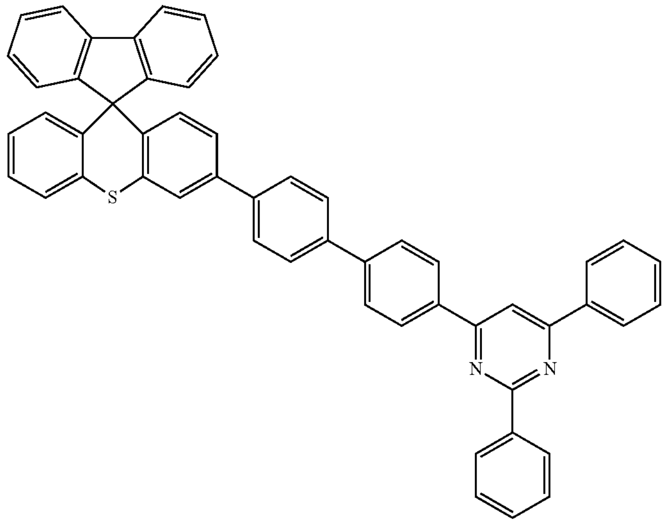
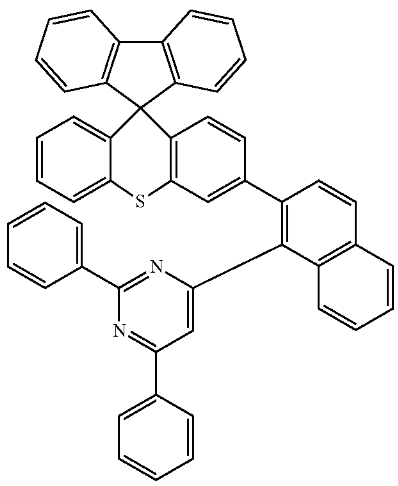
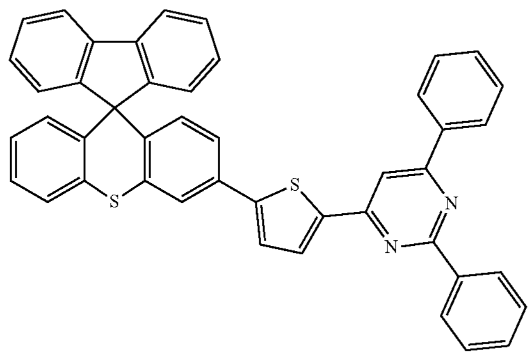
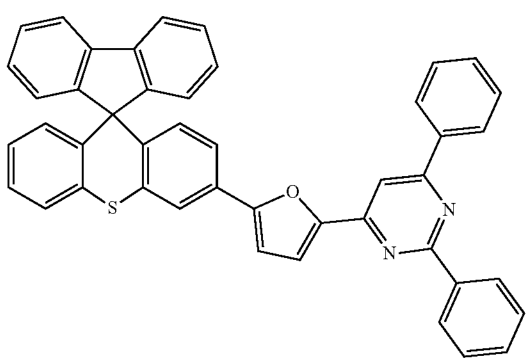
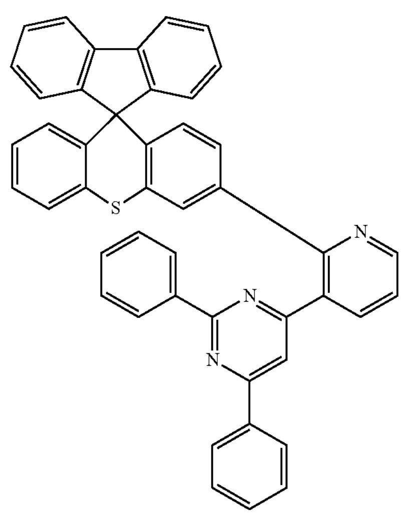

-continued
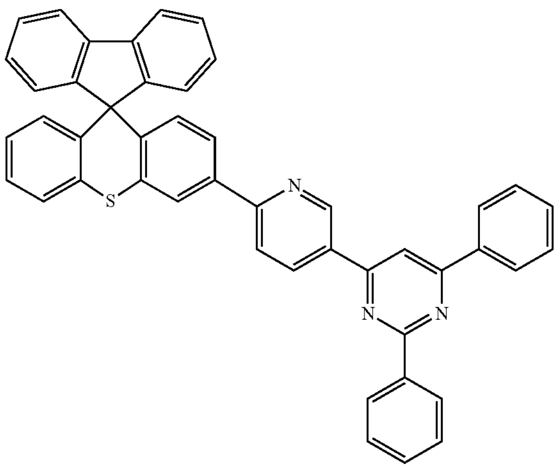
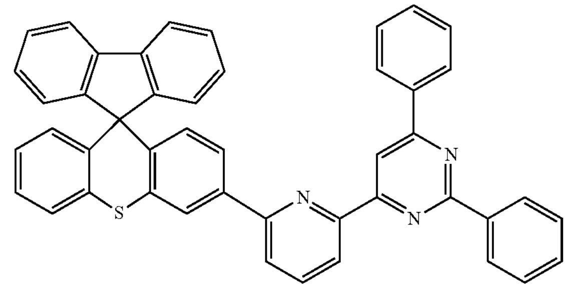
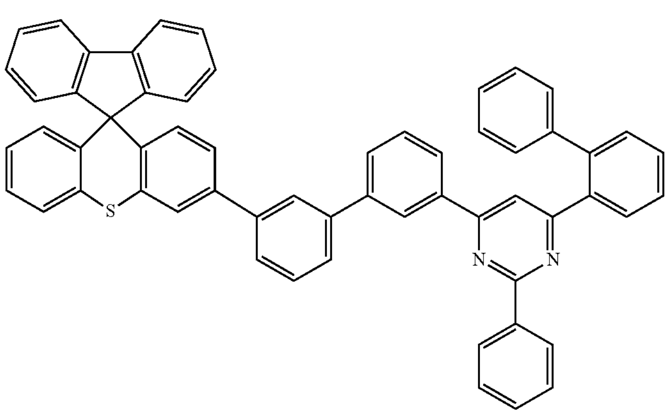
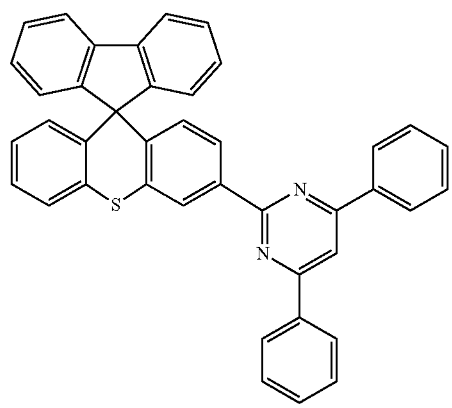
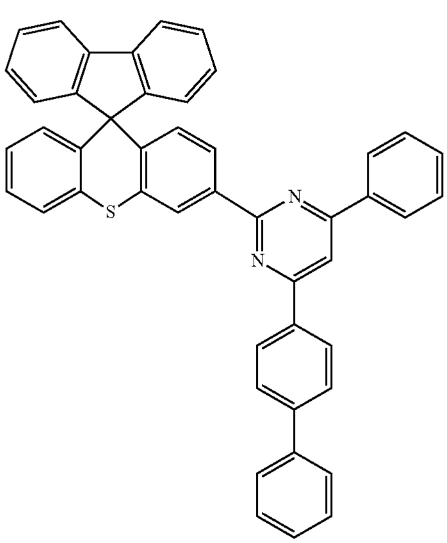
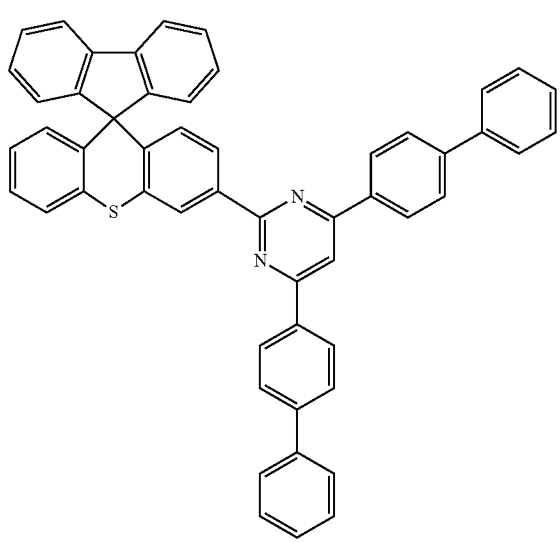

-continued
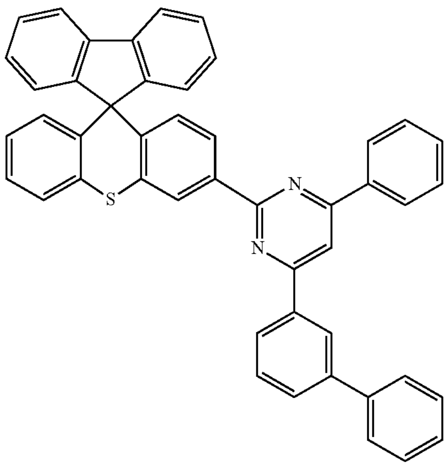
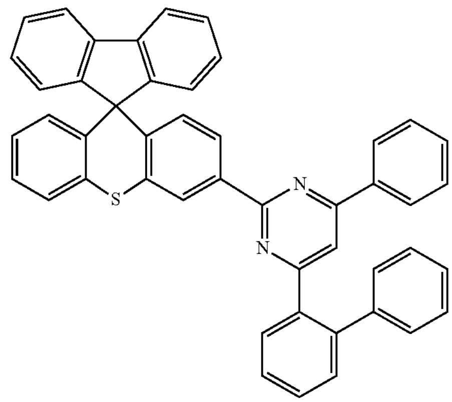
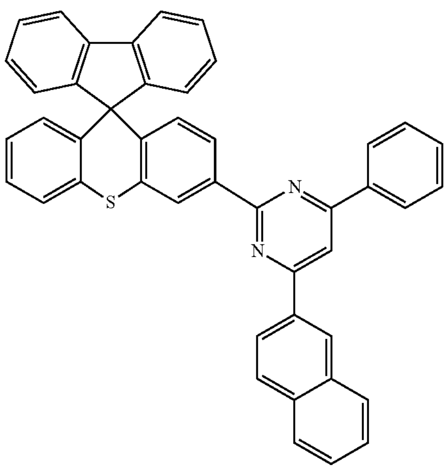
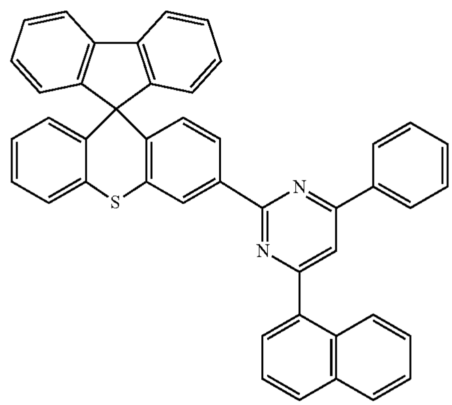
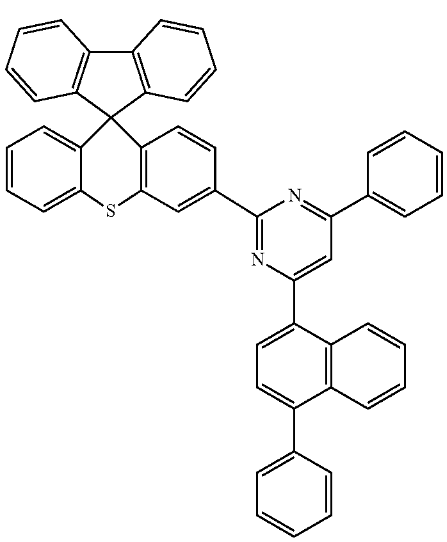
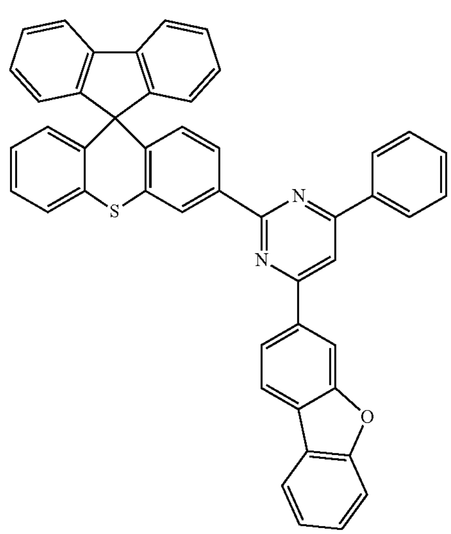

-continued
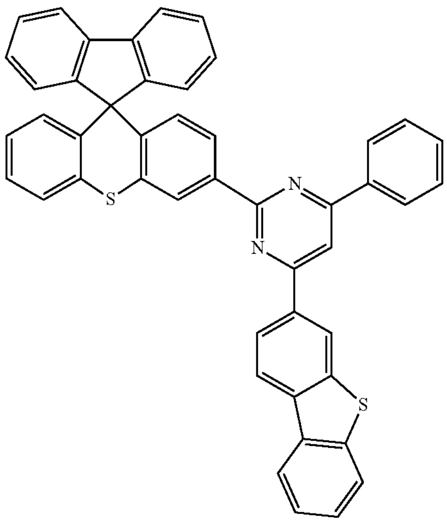
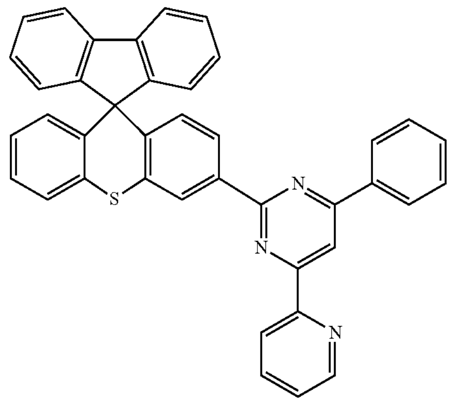
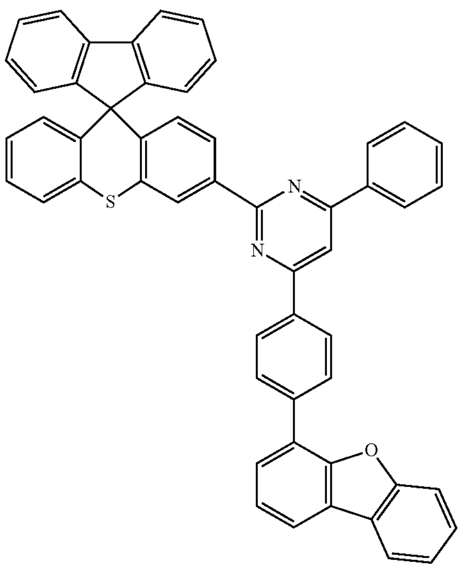
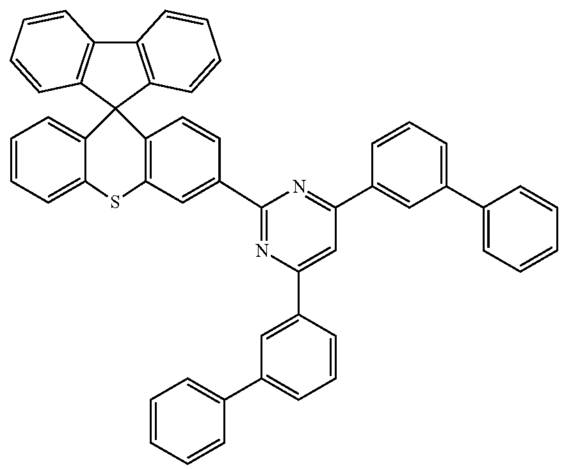
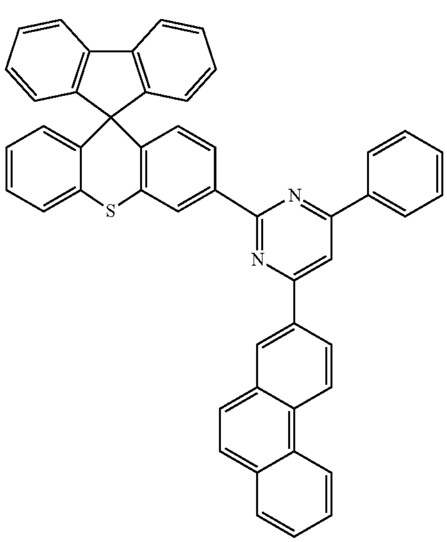
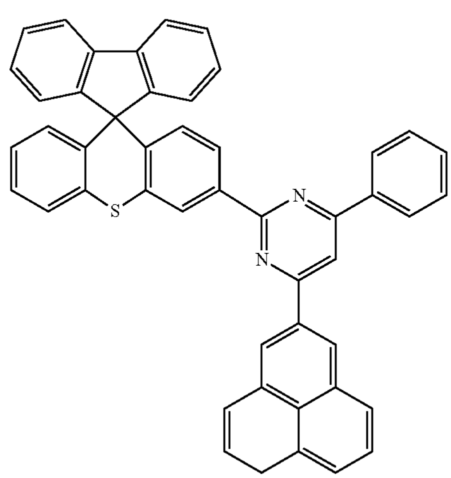

-continued
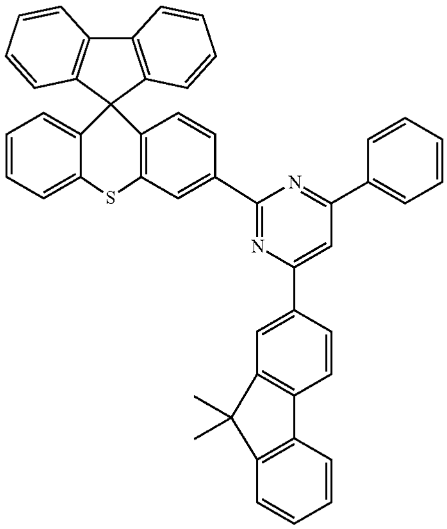
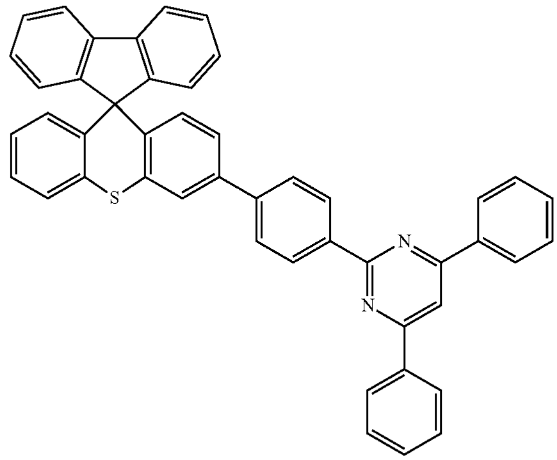
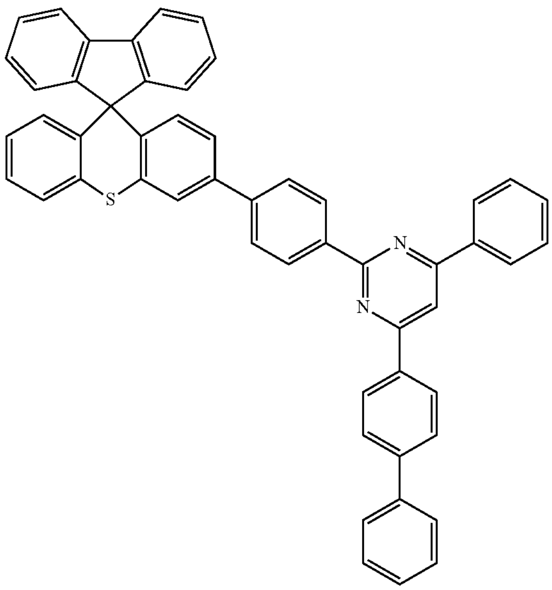
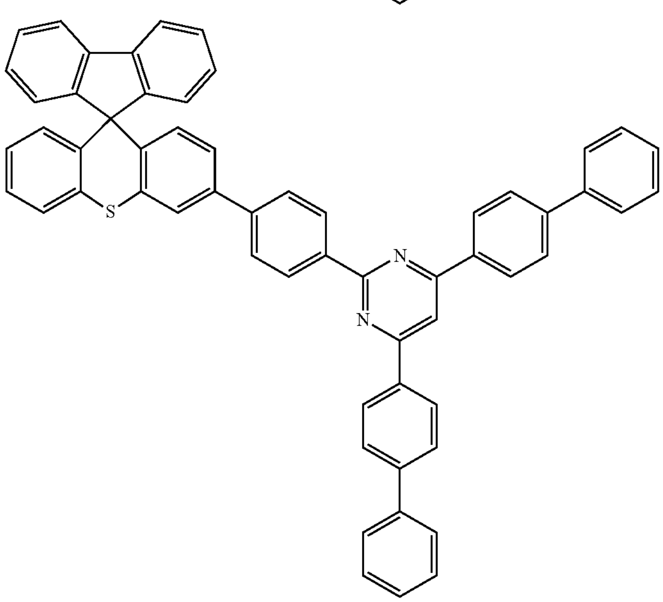

-continued
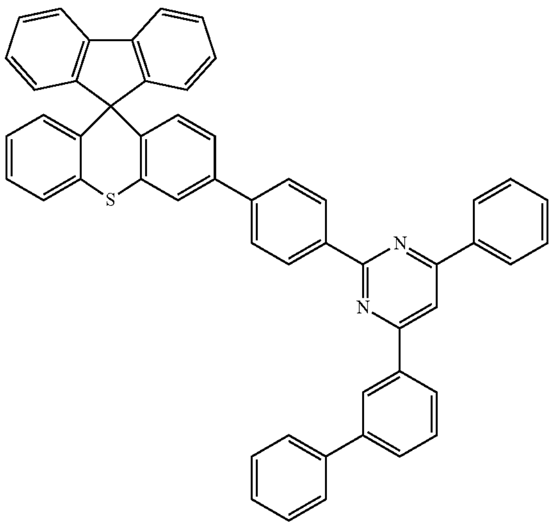
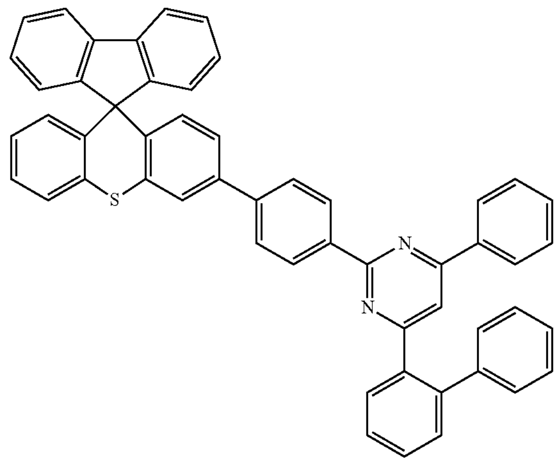
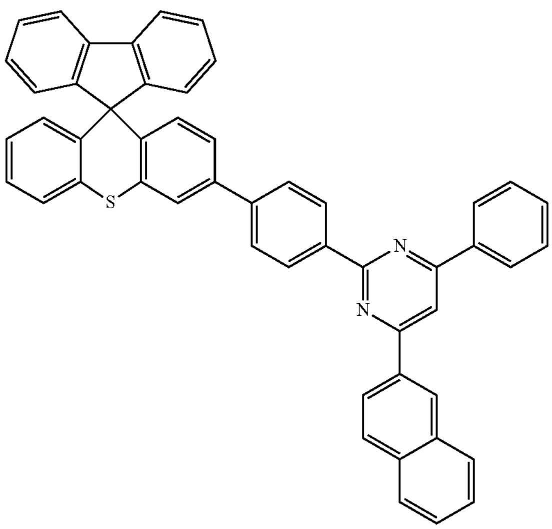
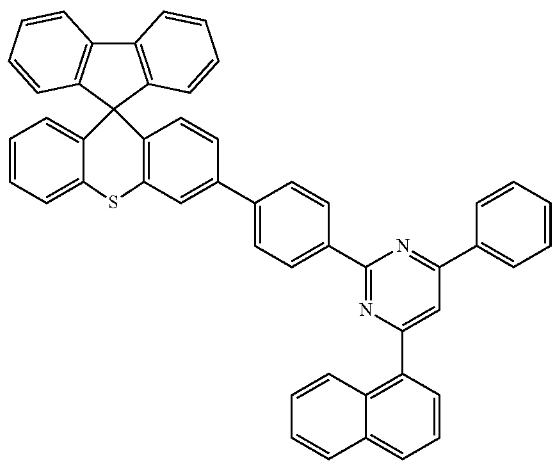
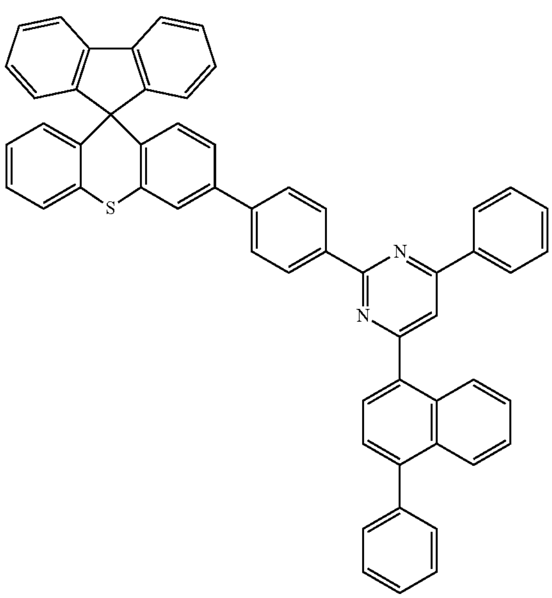

-continued
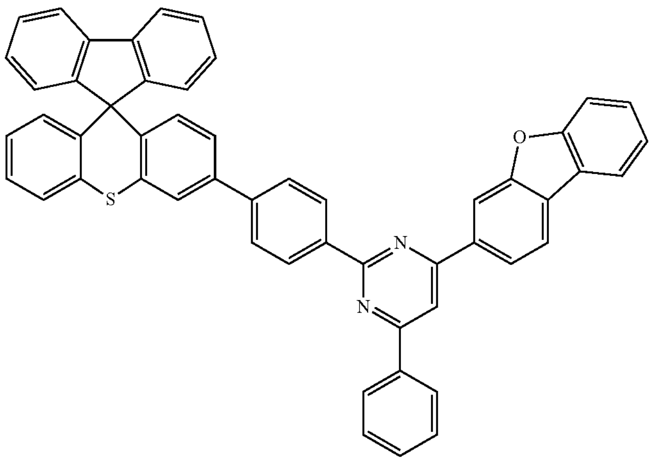
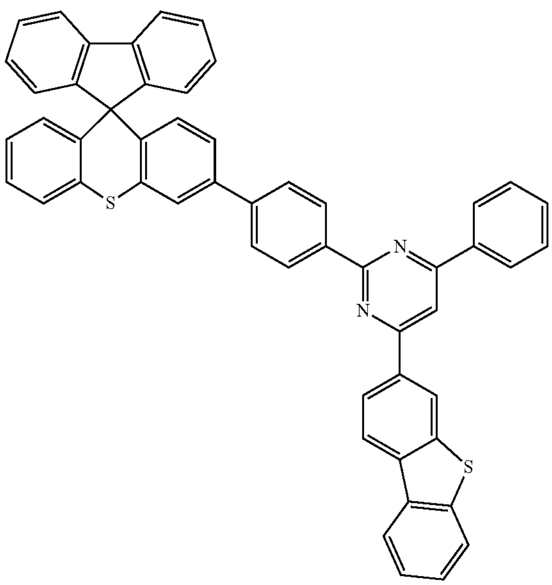
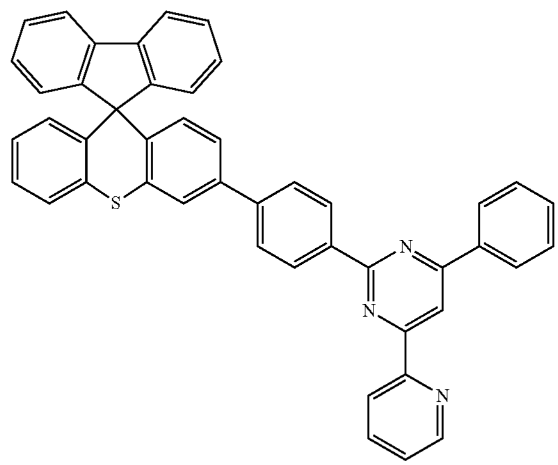
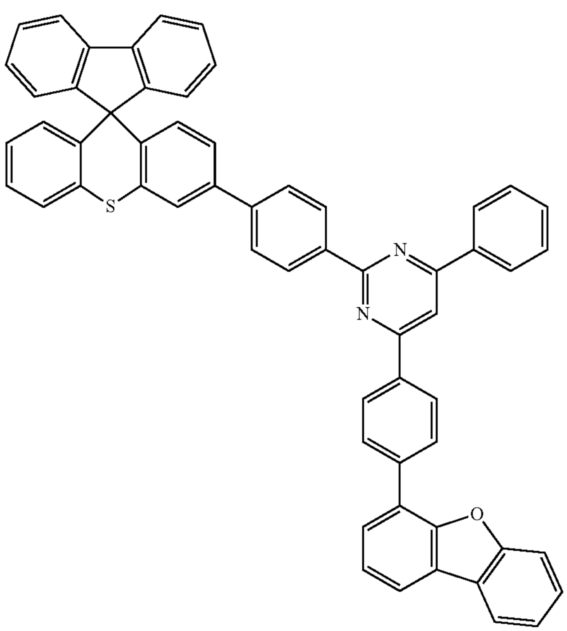

-continued
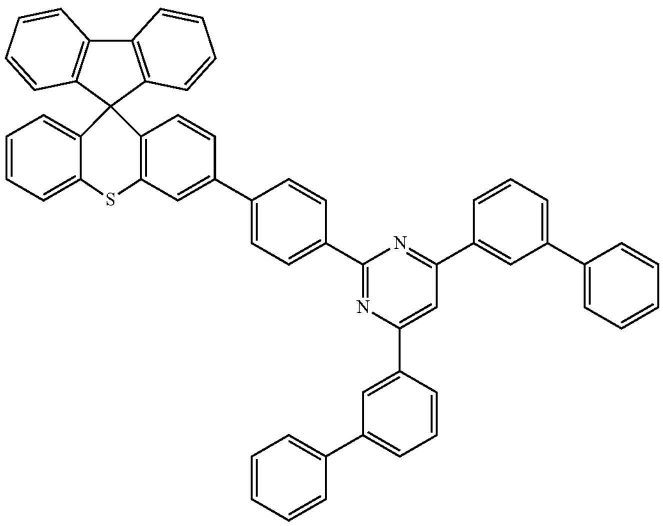
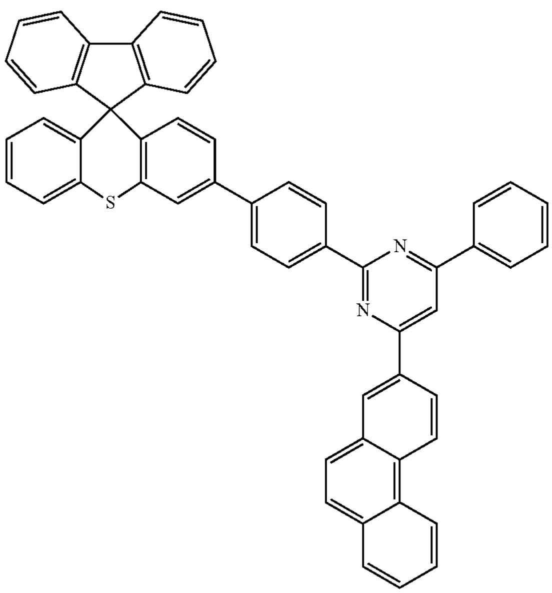
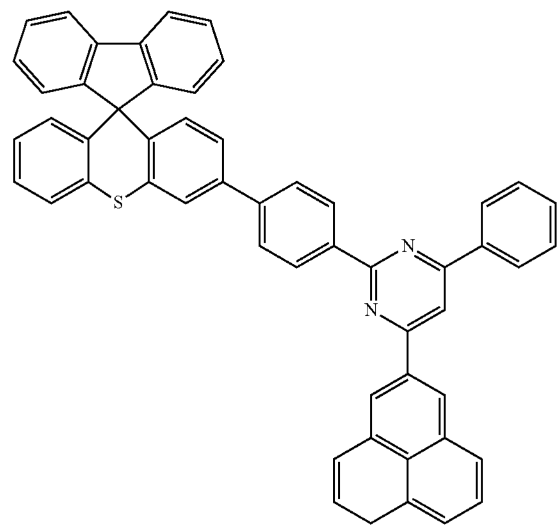
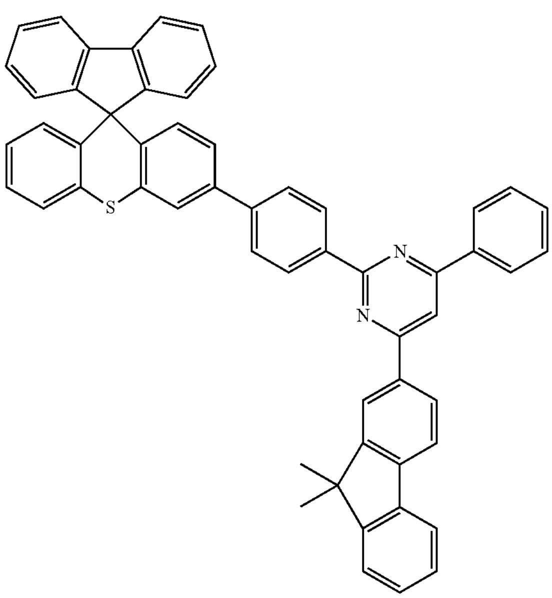
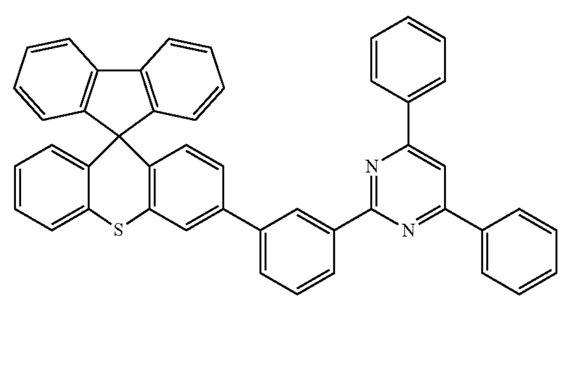

-continued
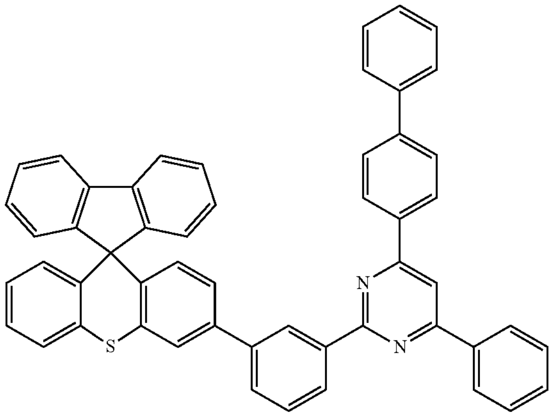
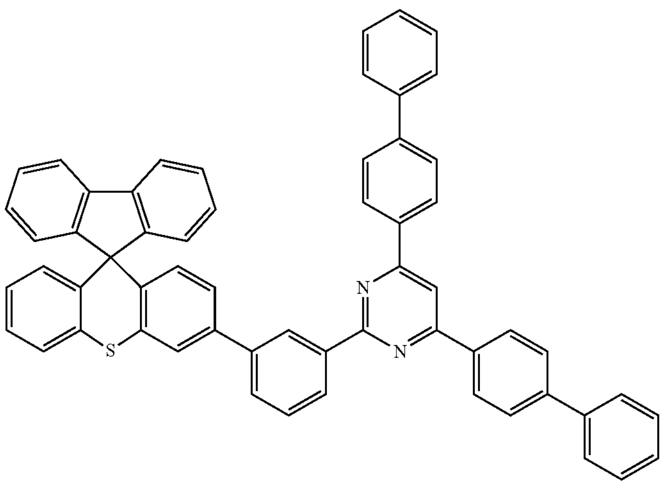
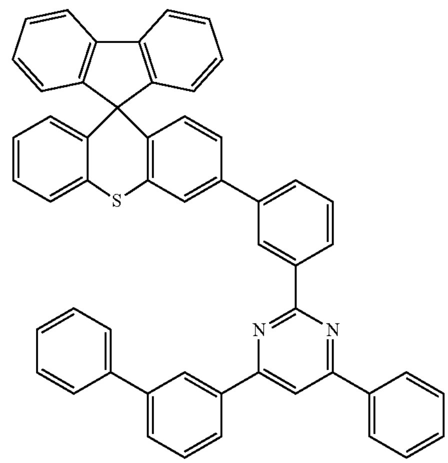
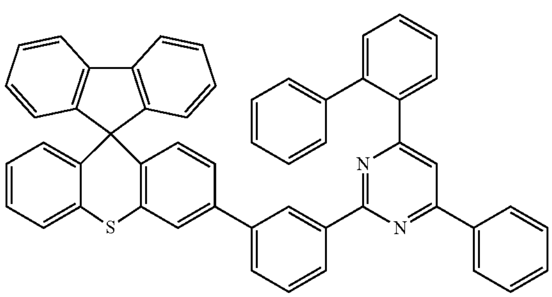
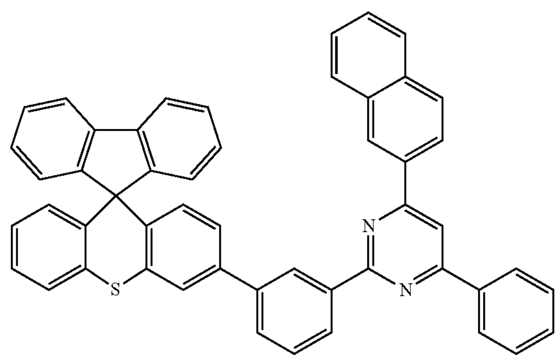
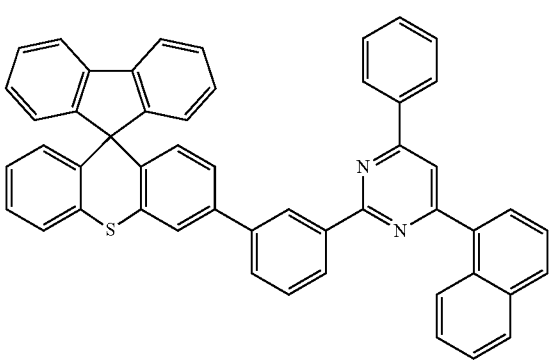

-continued
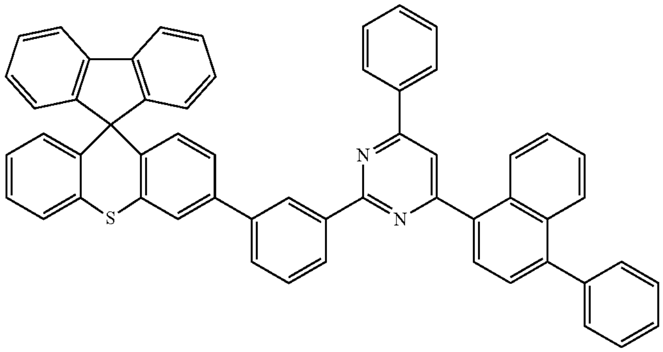
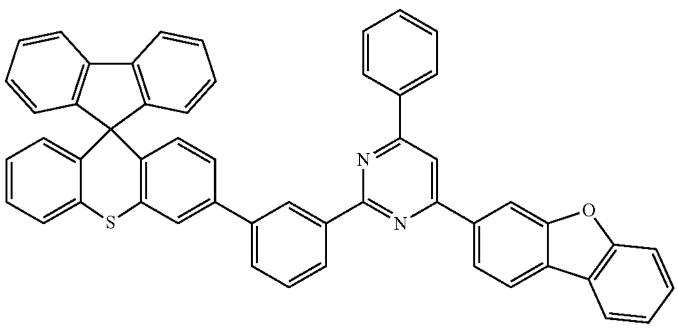
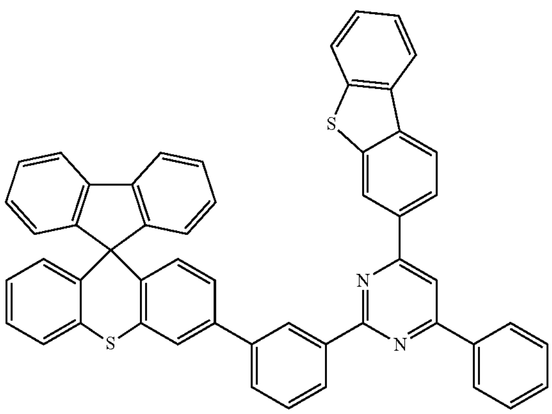
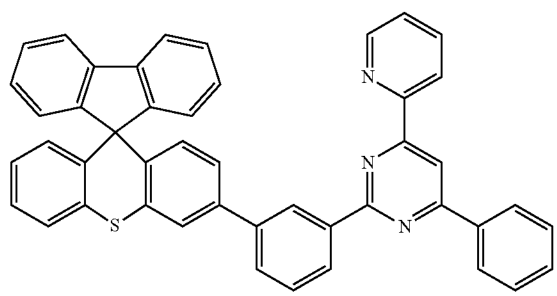
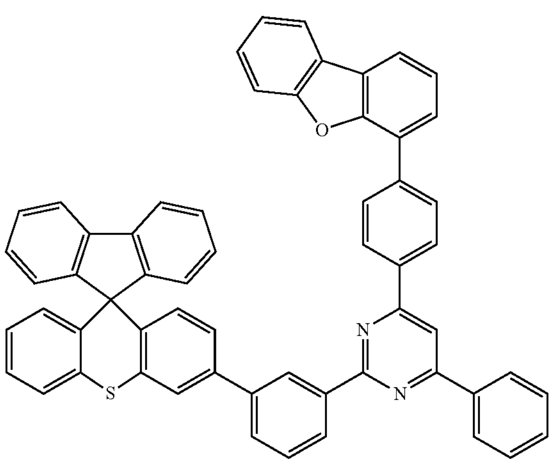

-continued
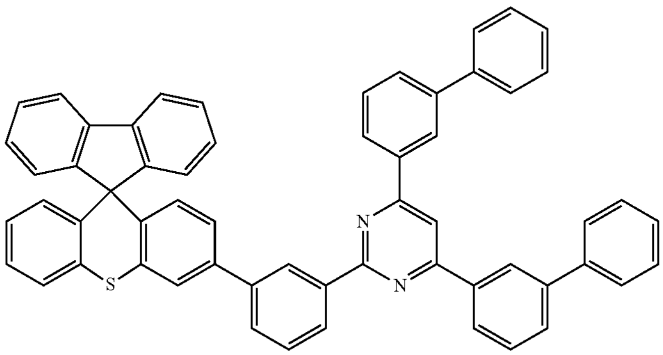
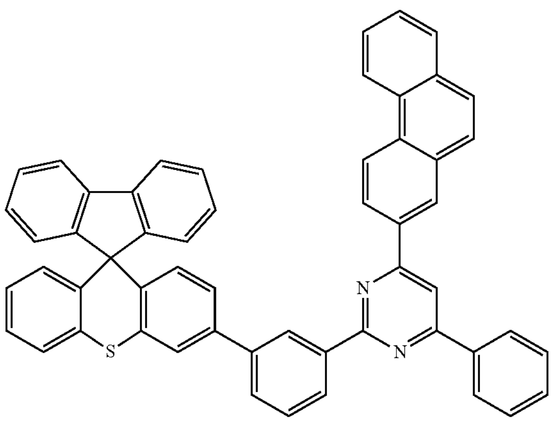
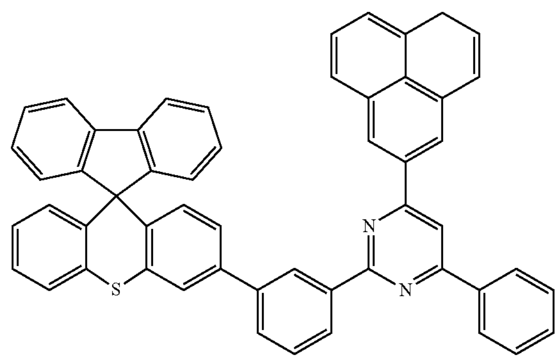
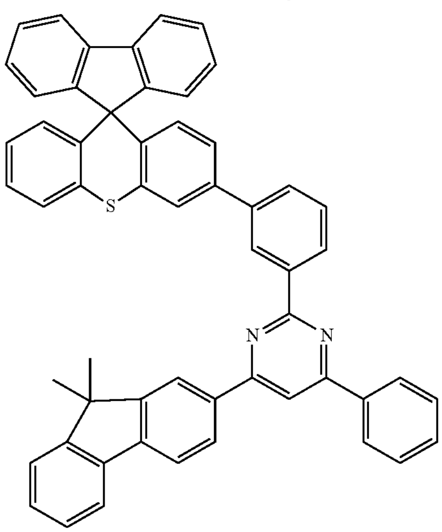
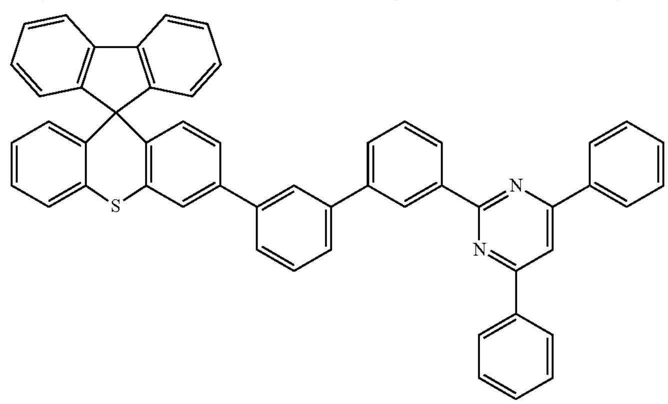
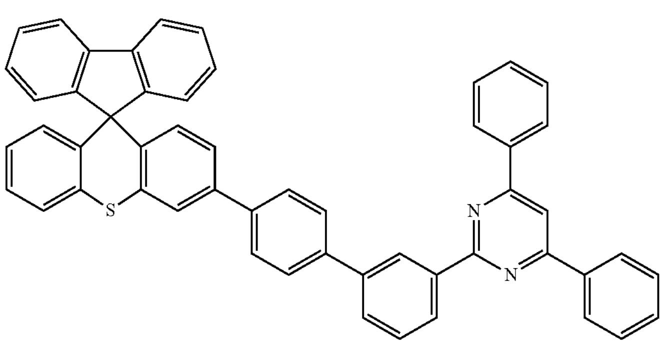

-continued
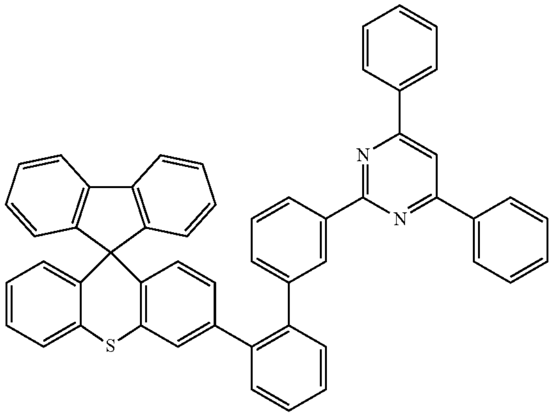
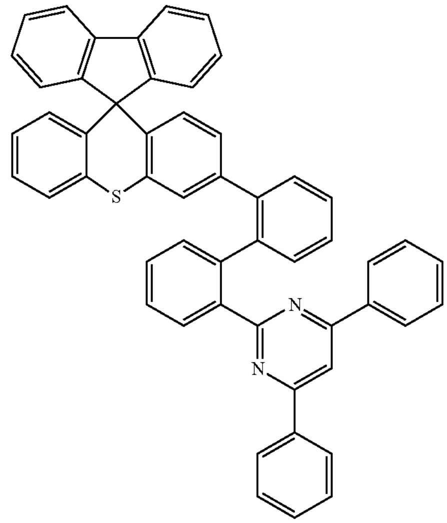
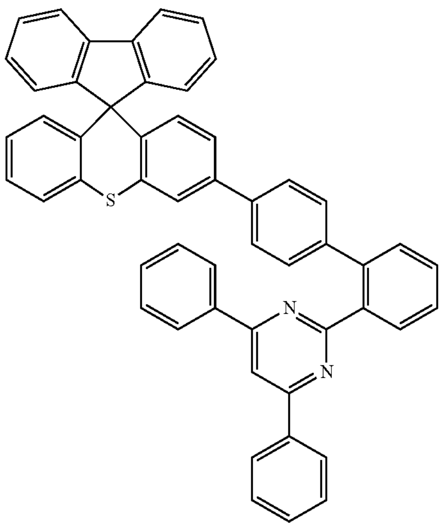
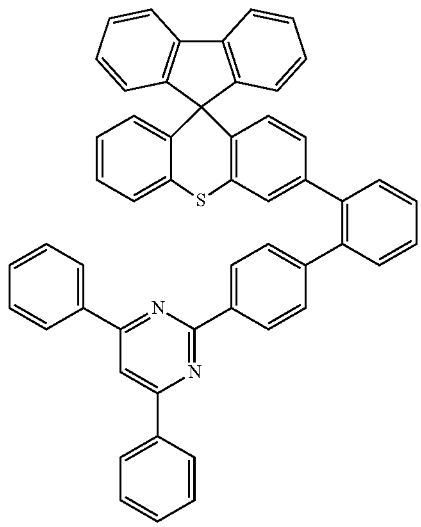
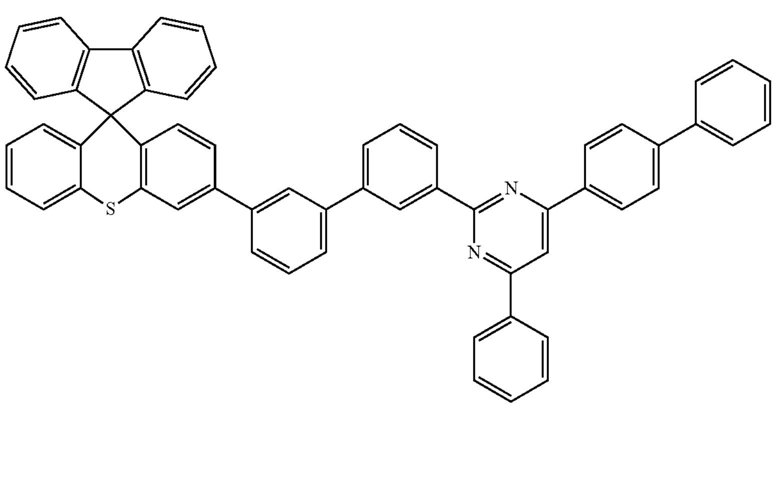

-continued
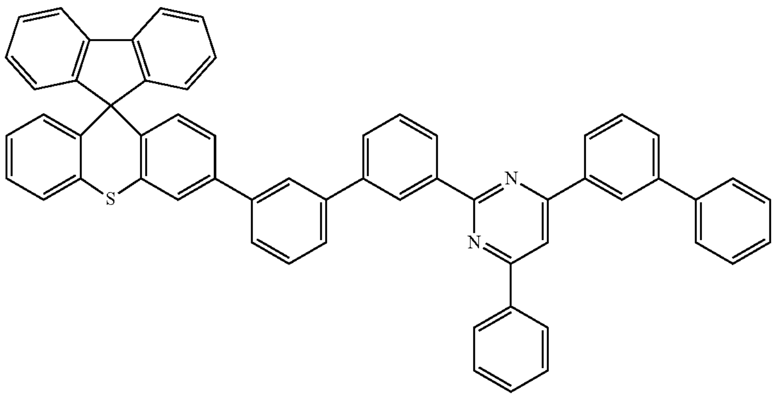
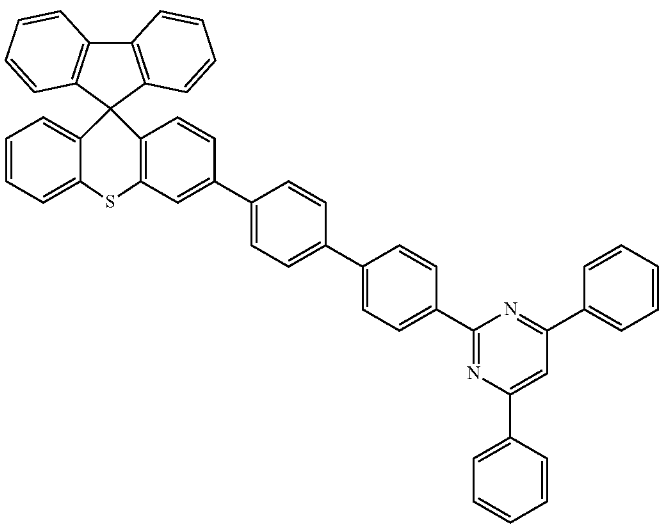
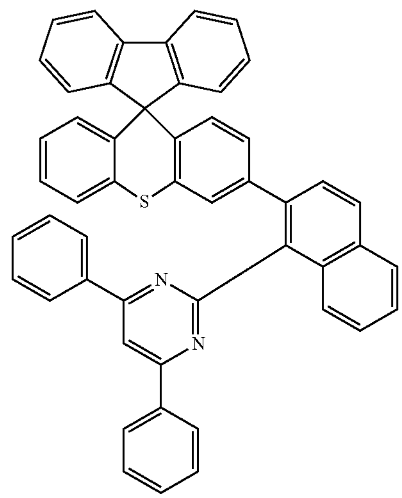
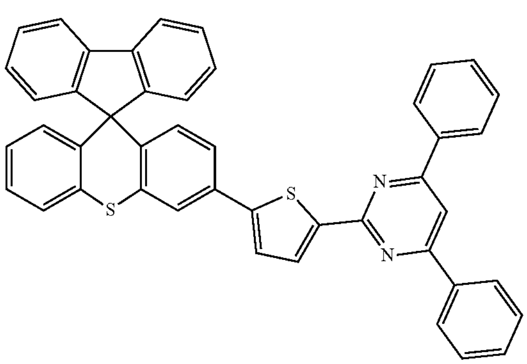
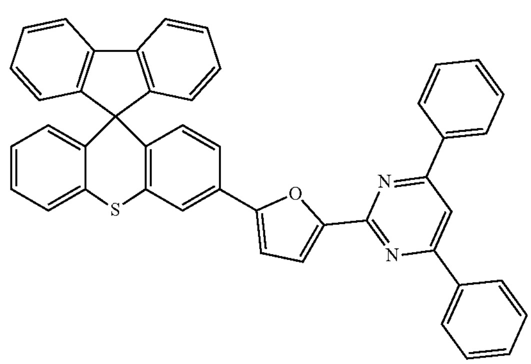

-continued
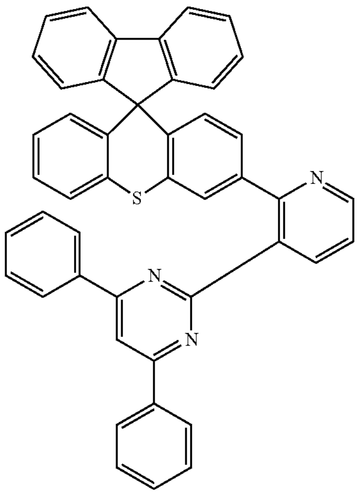
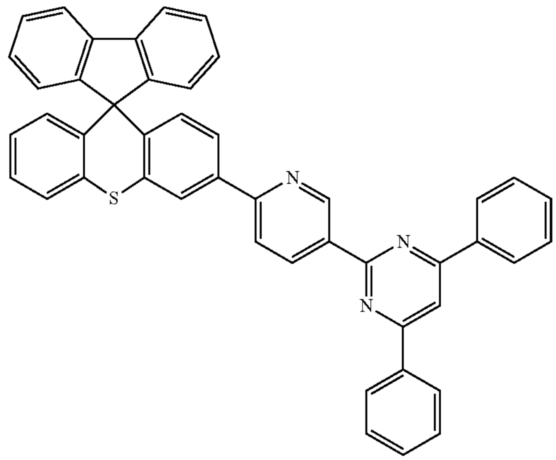
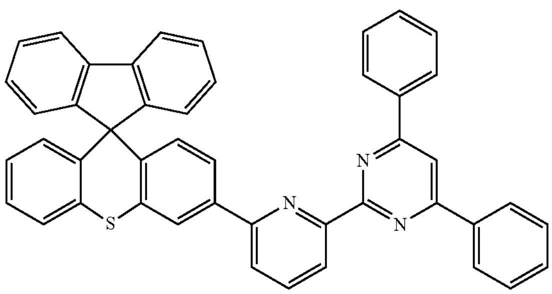
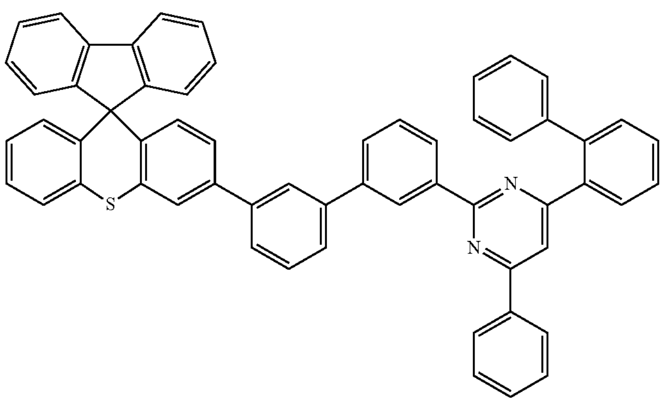
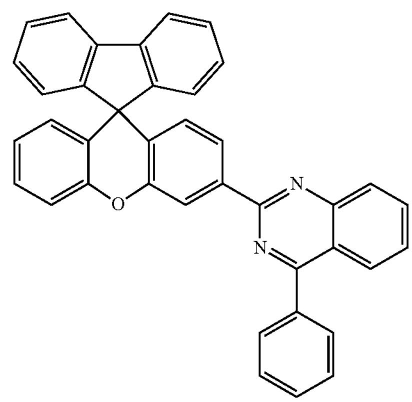
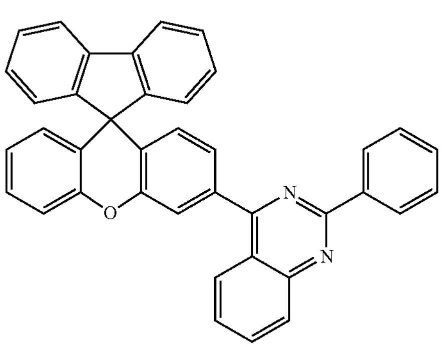
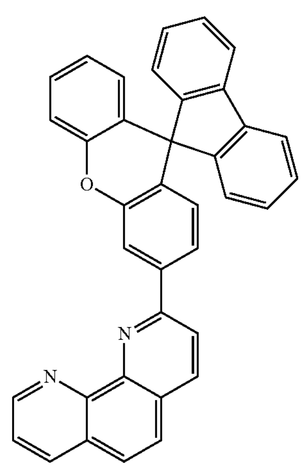

-continued
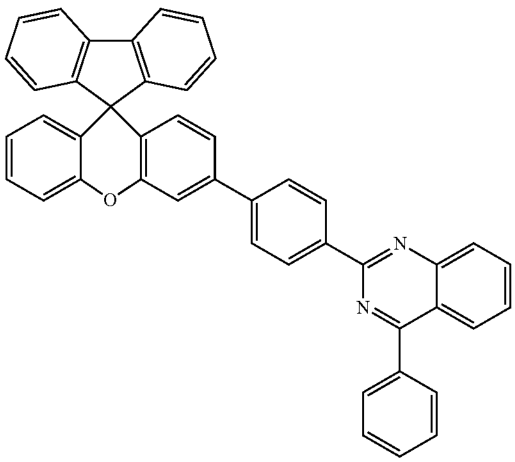
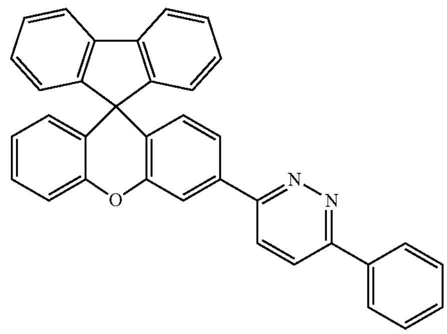
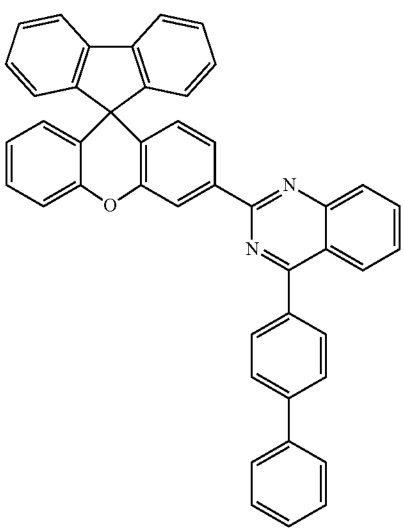
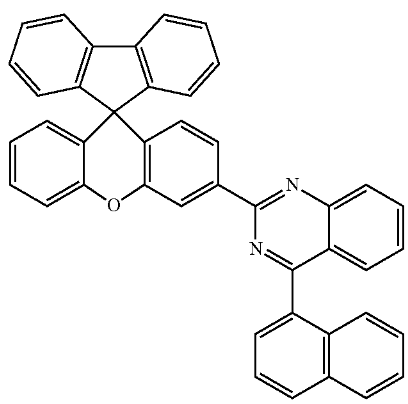
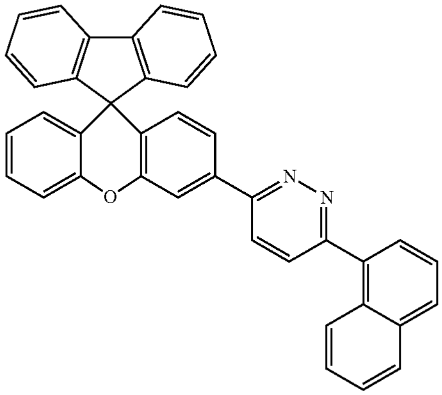
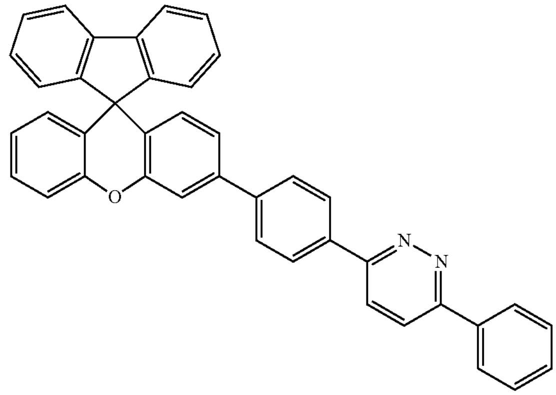

-continued
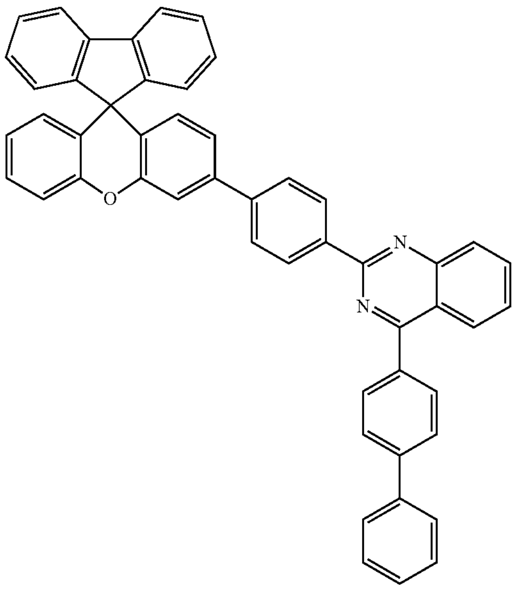
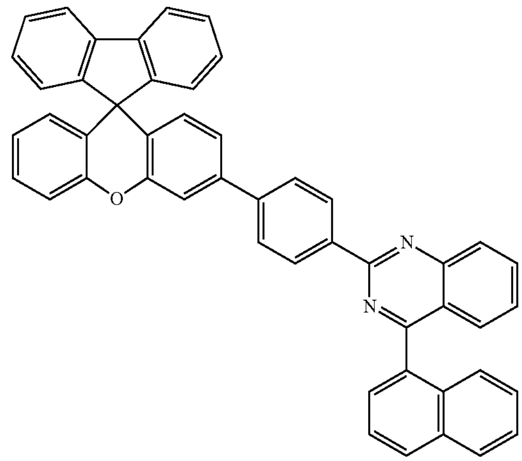
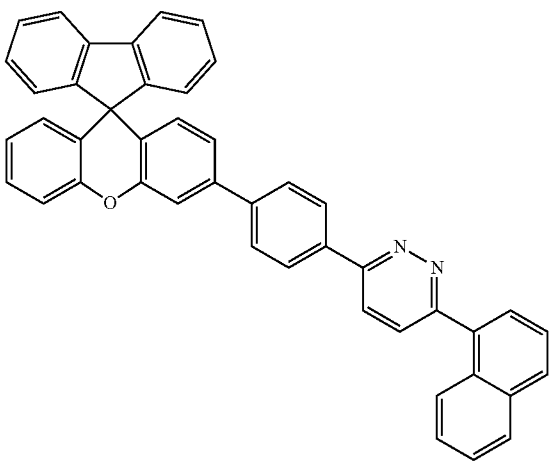
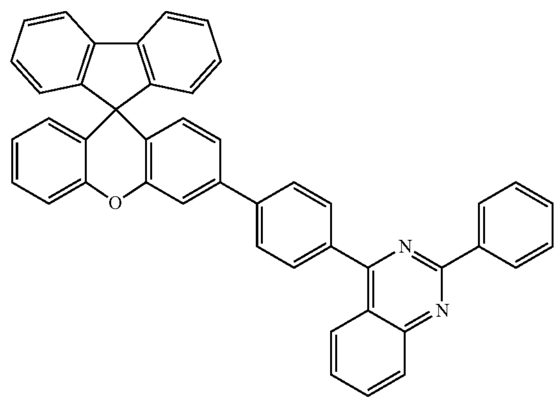
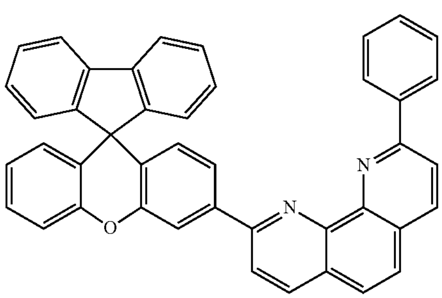
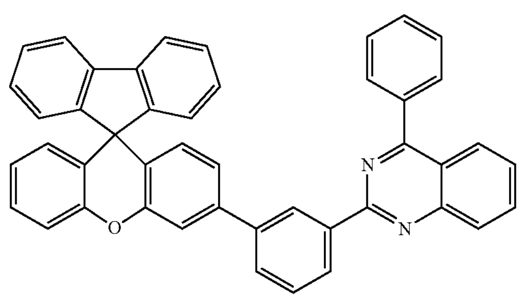
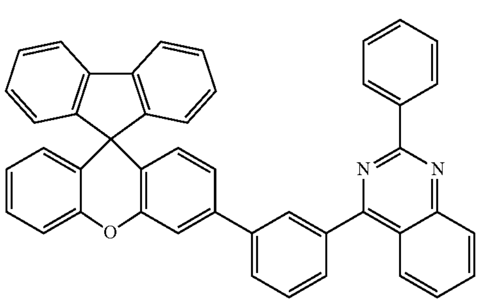
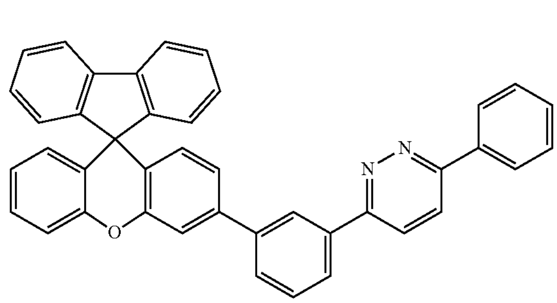

-continued
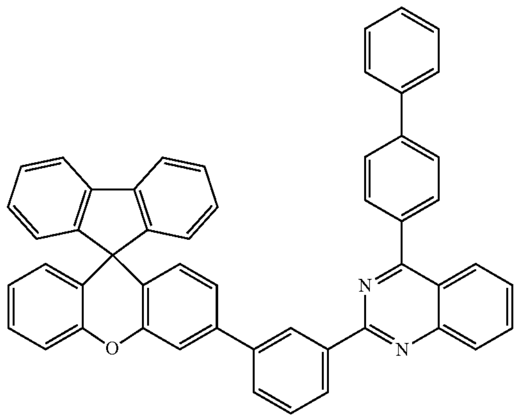
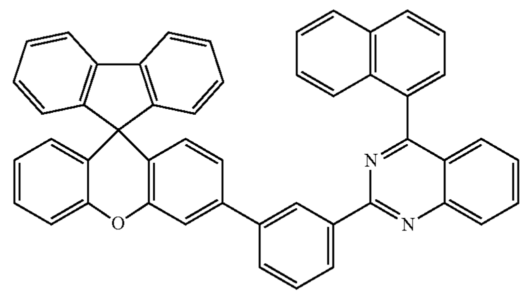
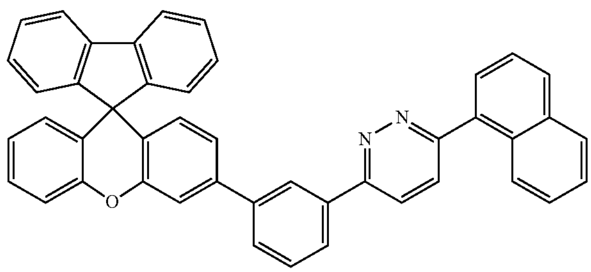
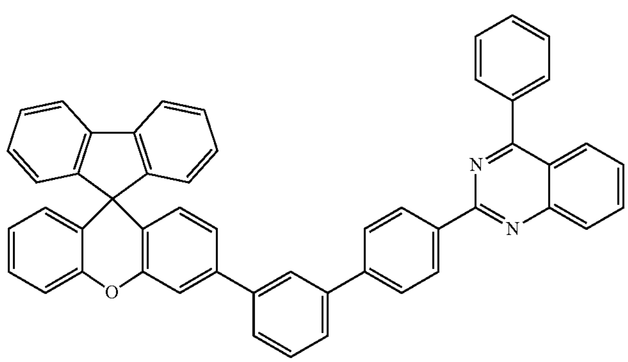
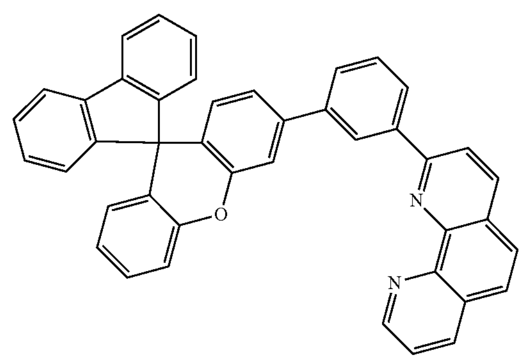
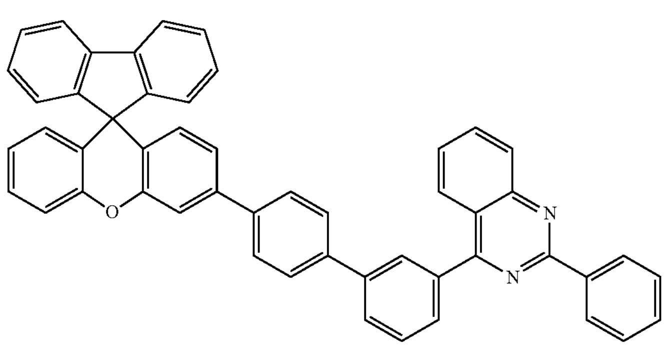

-continued
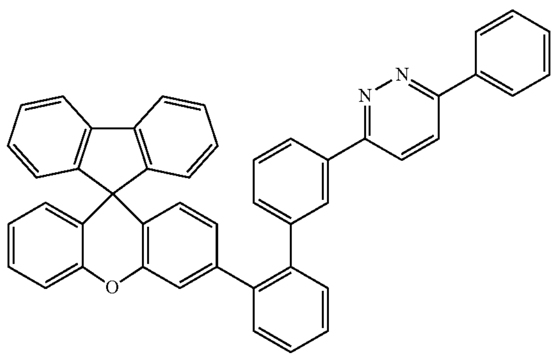
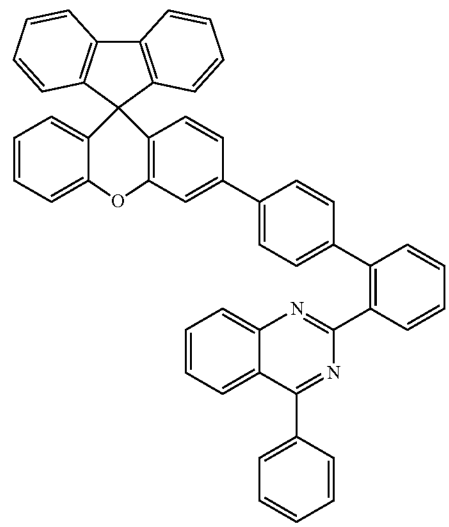
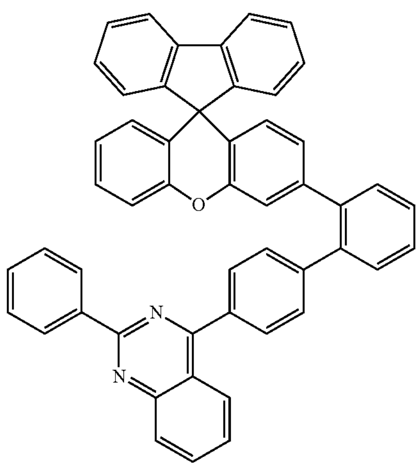
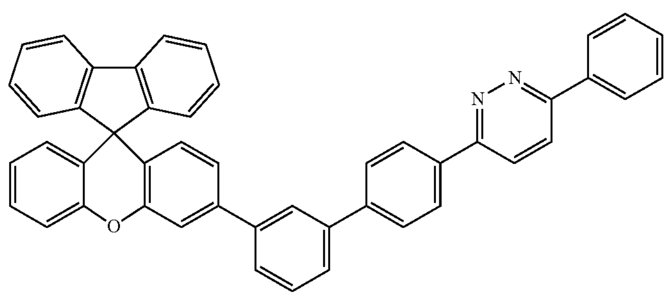
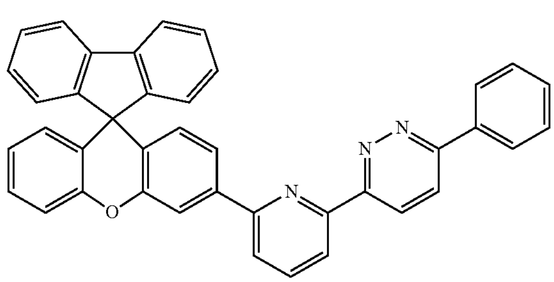
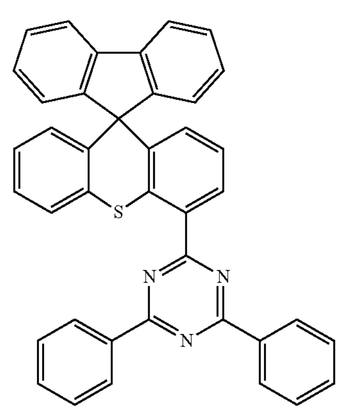

-continued
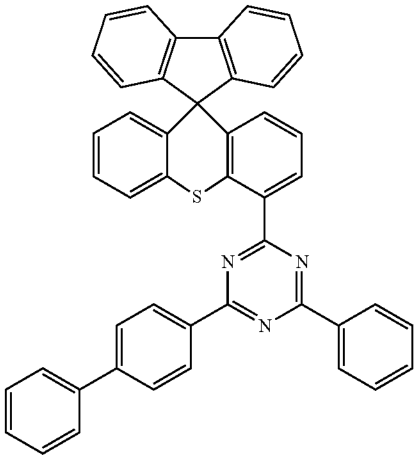
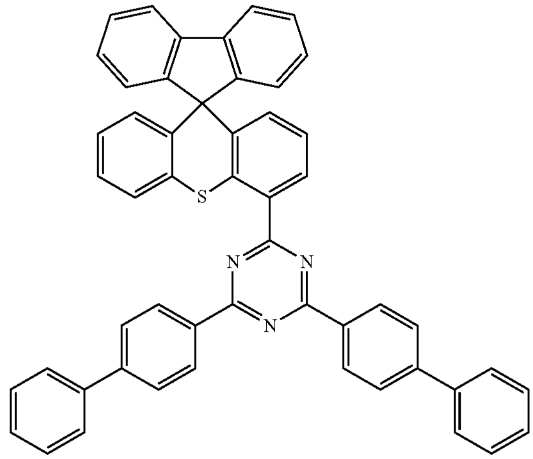
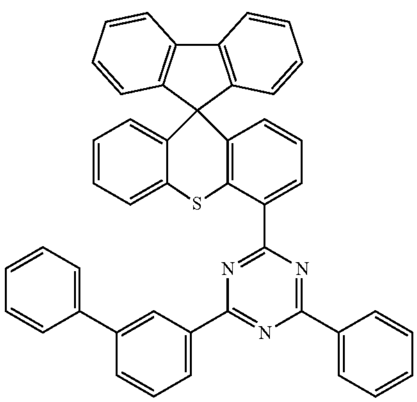
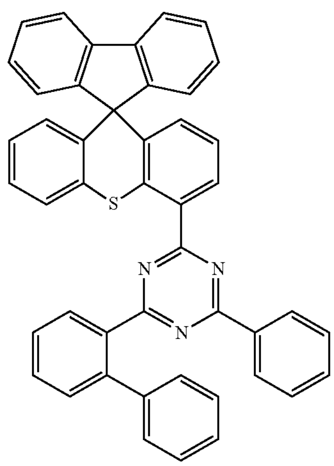
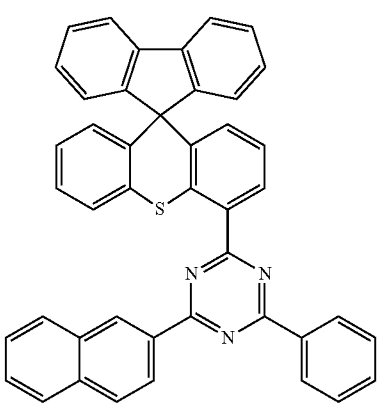
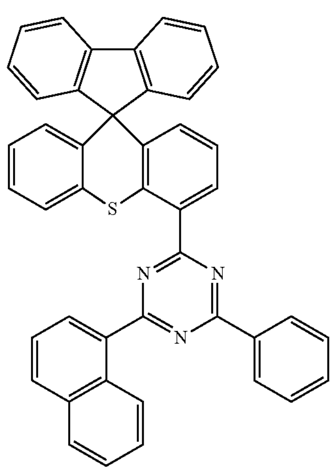

-continued
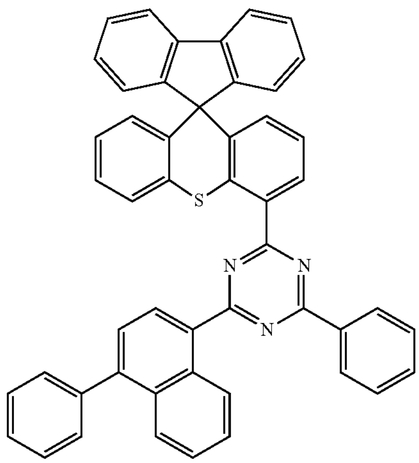
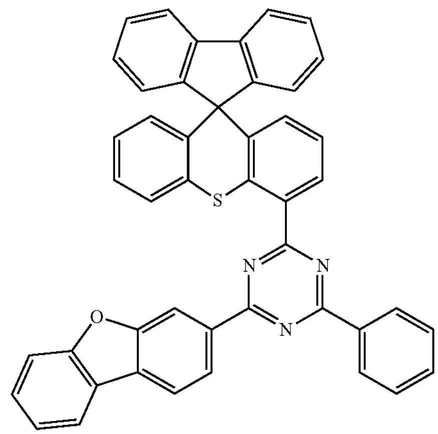
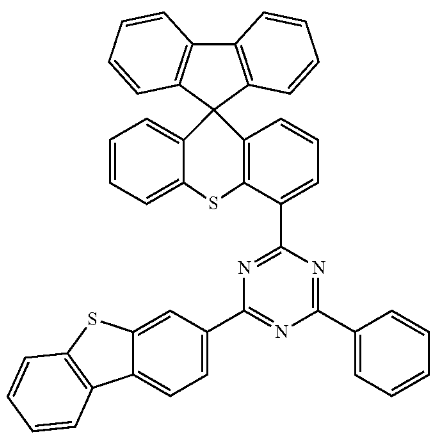
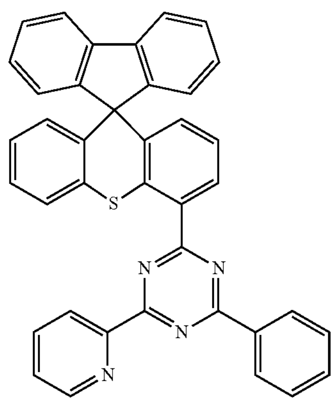
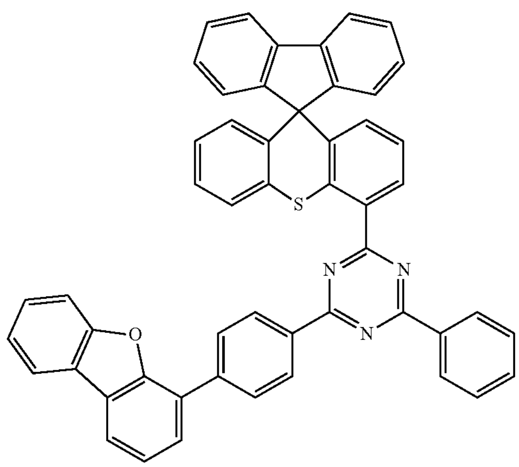

-continued
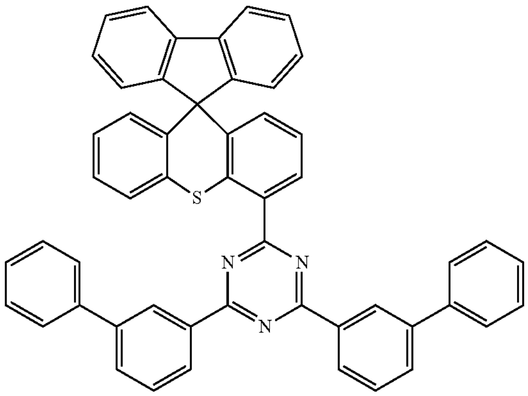
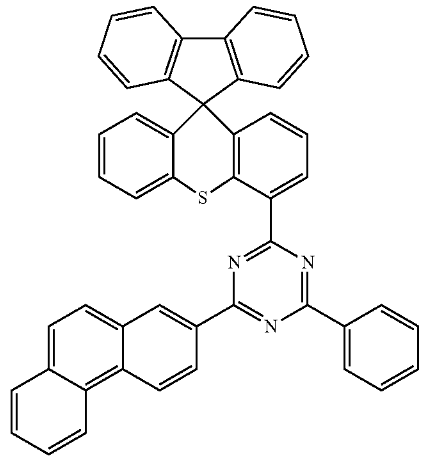
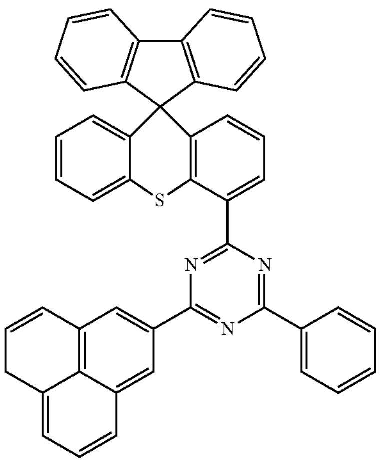
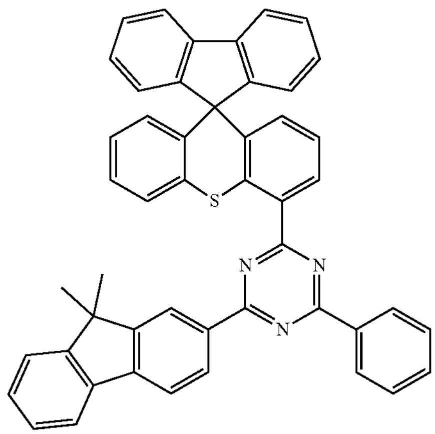
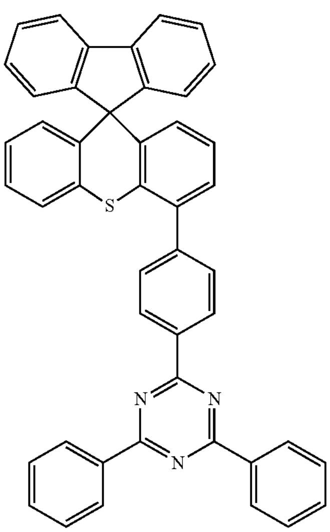
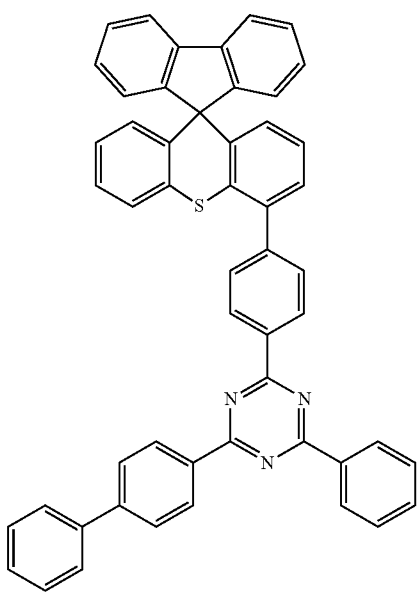

-continued
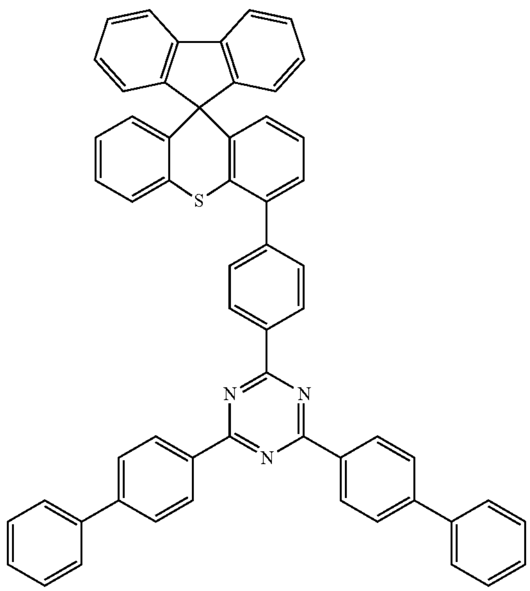
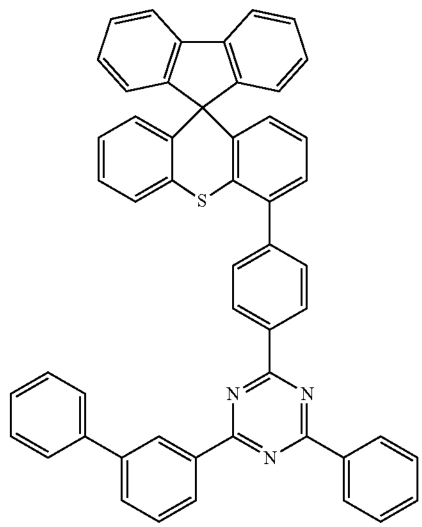
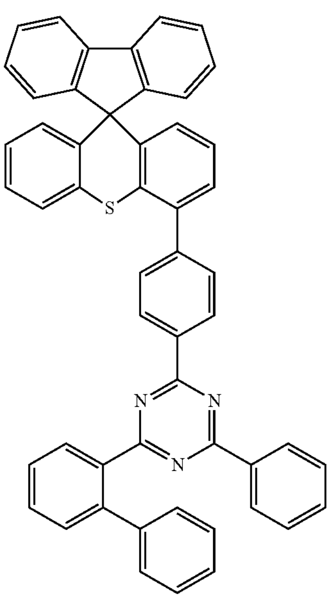
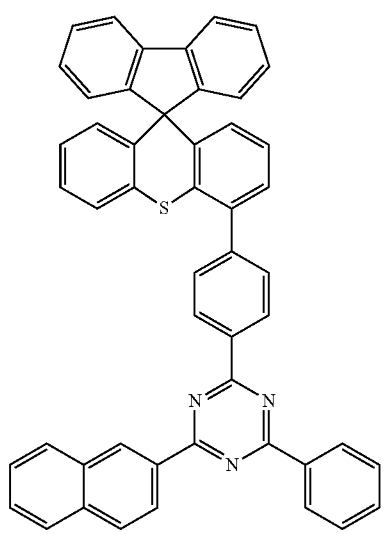
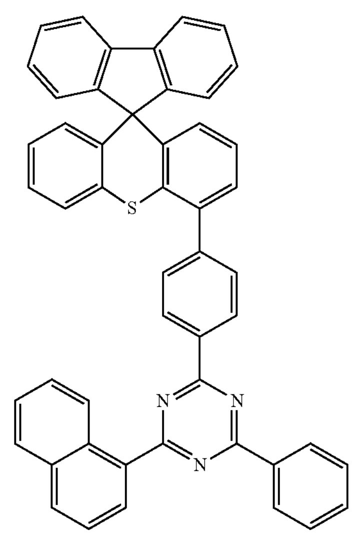

-continued
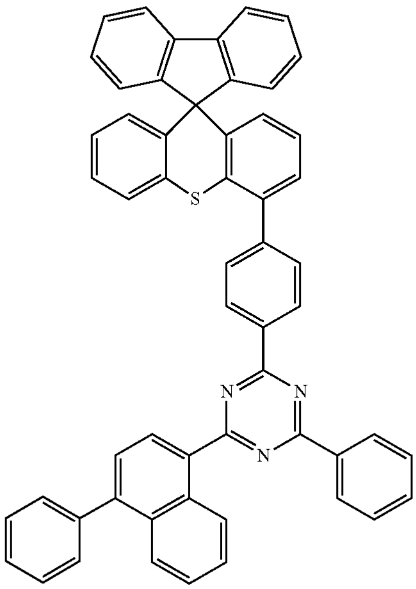
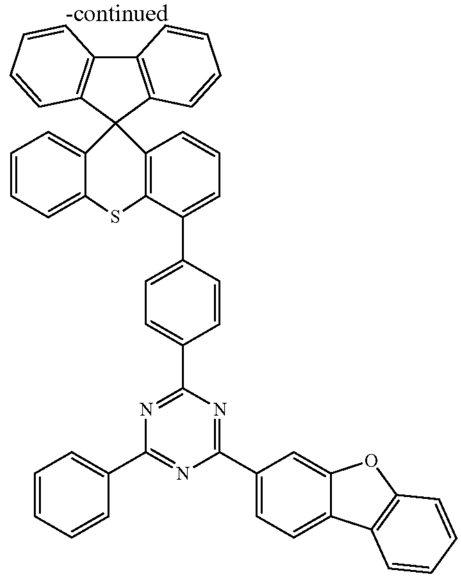
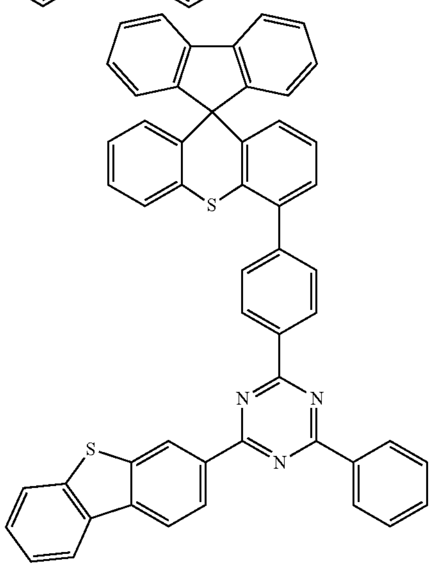
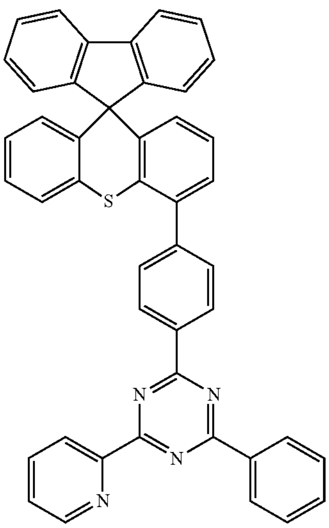
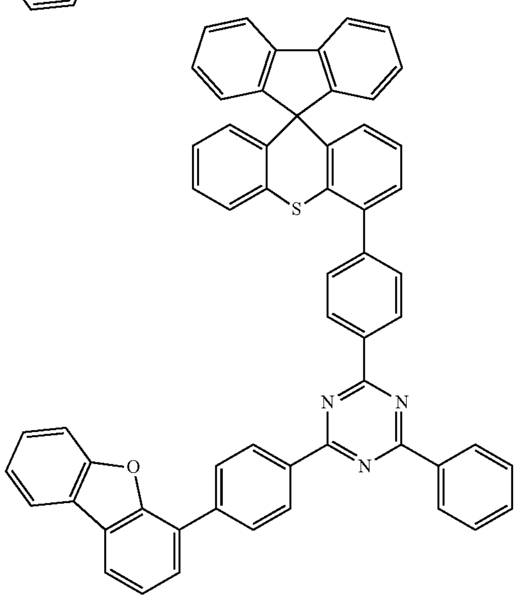

-continued
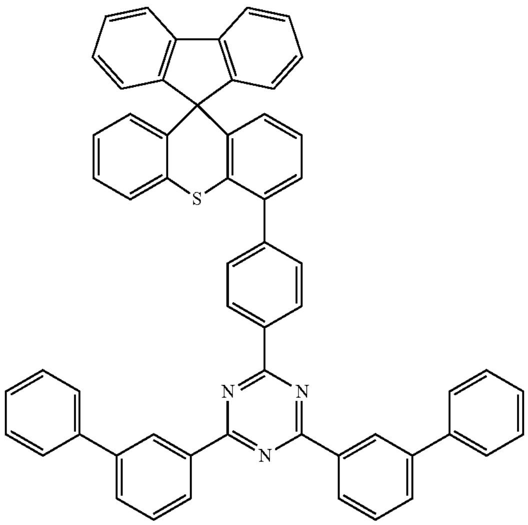
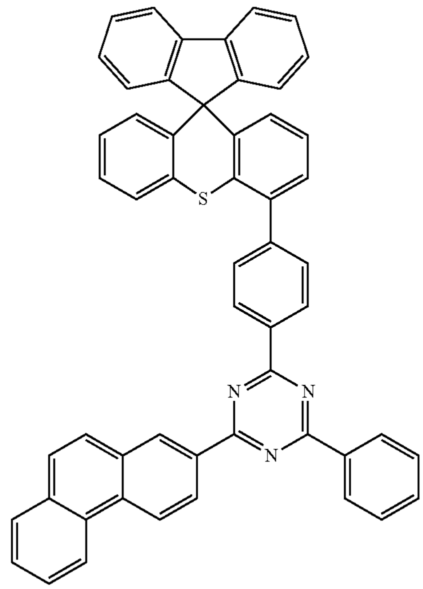
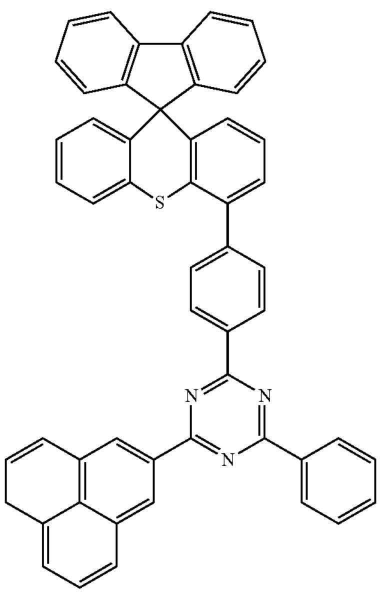
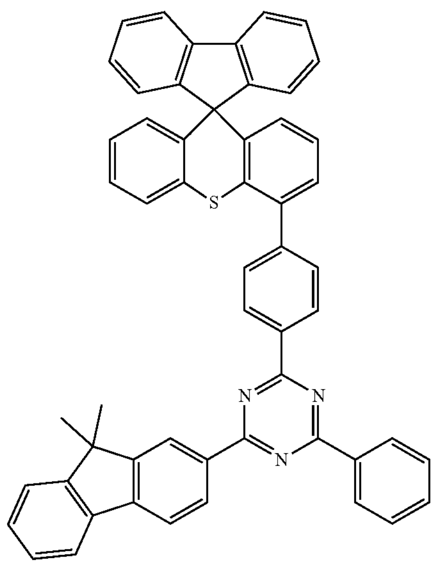
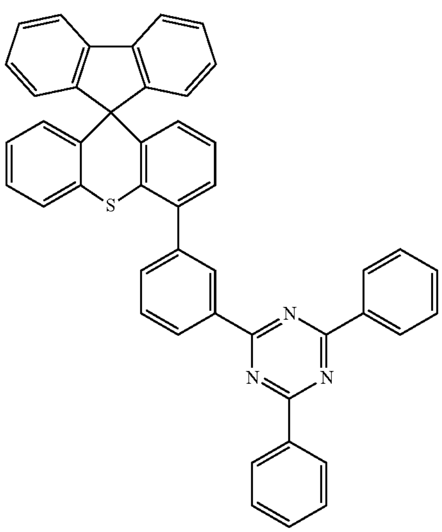
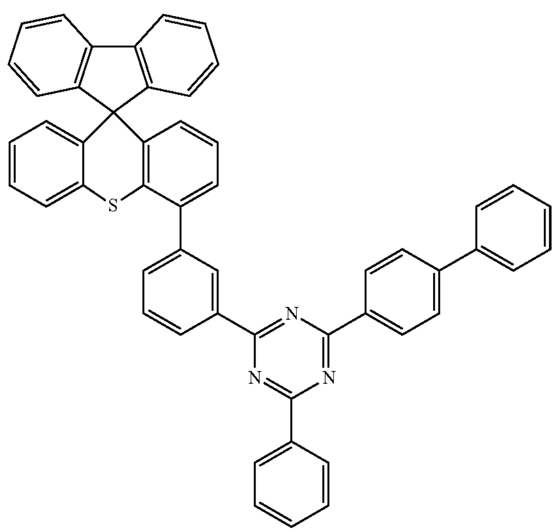

-continued
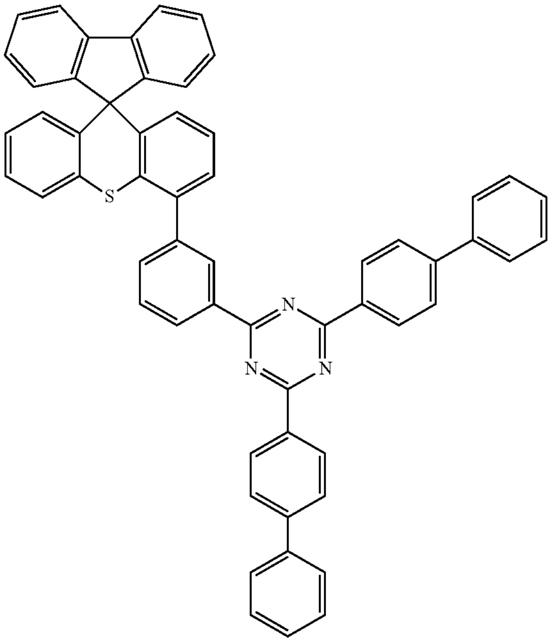
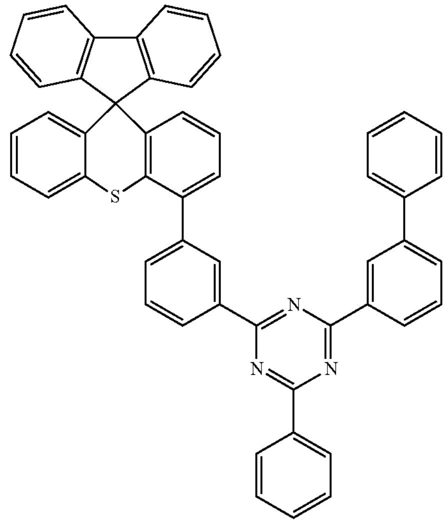
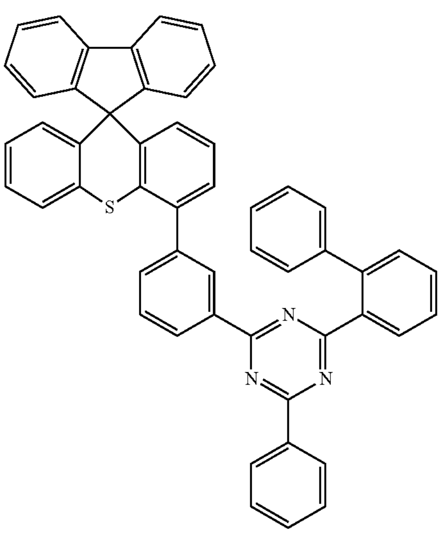
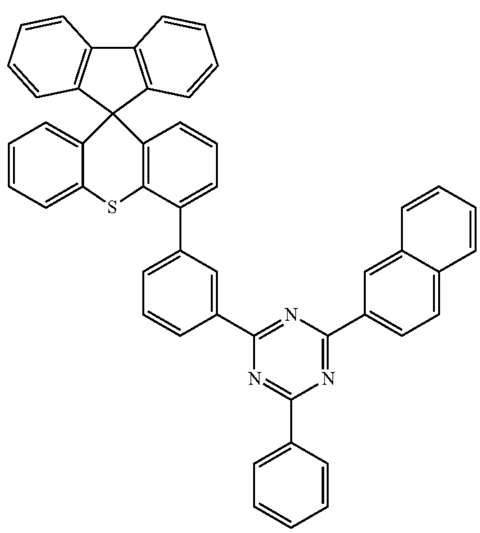

-continued
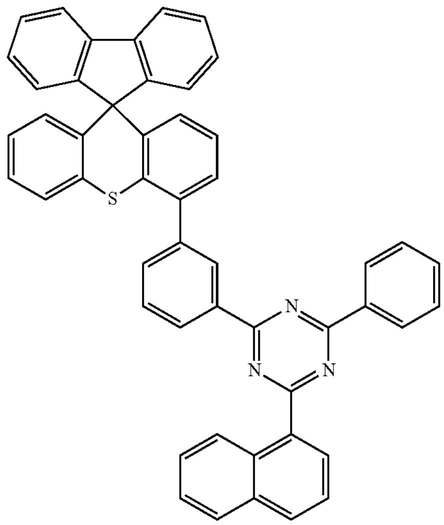
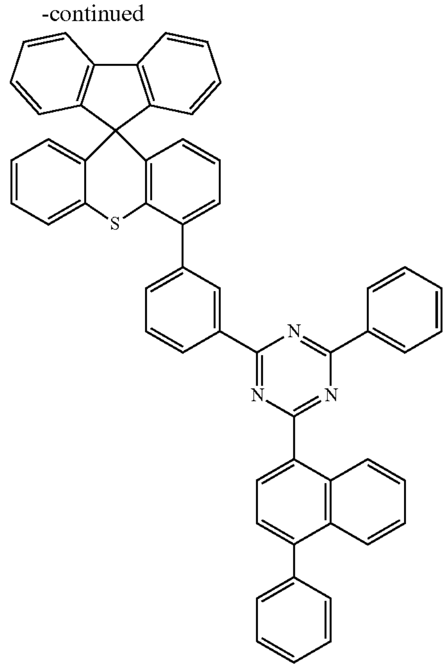
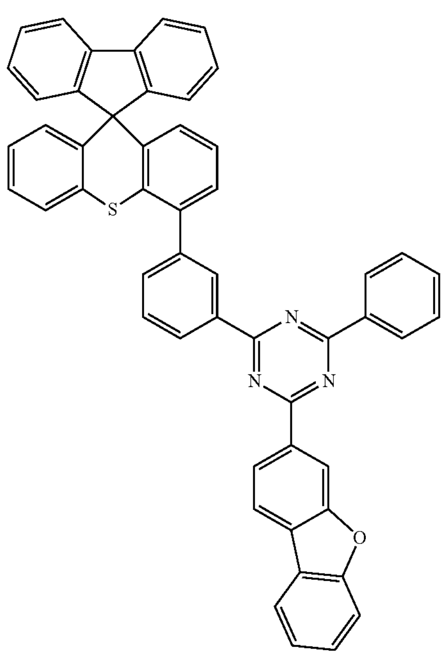
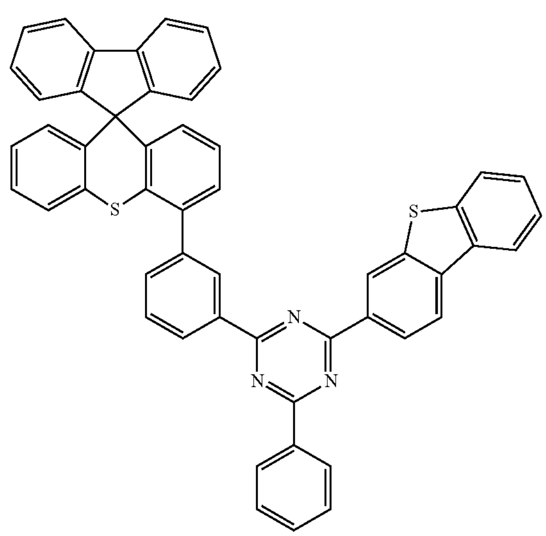

-continued
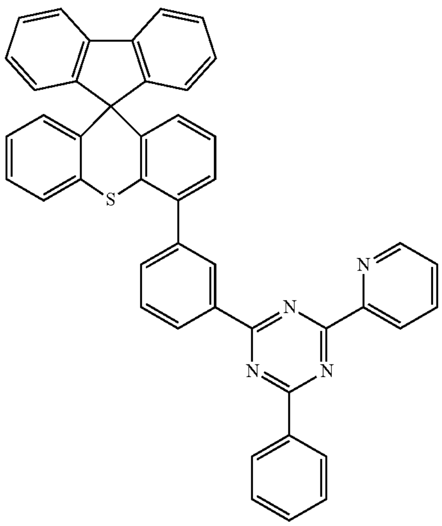
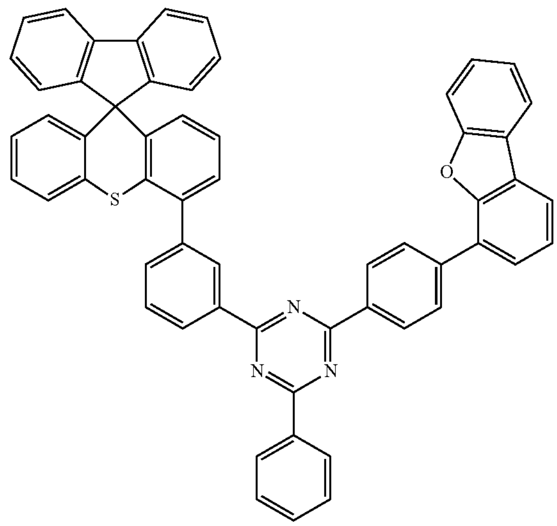
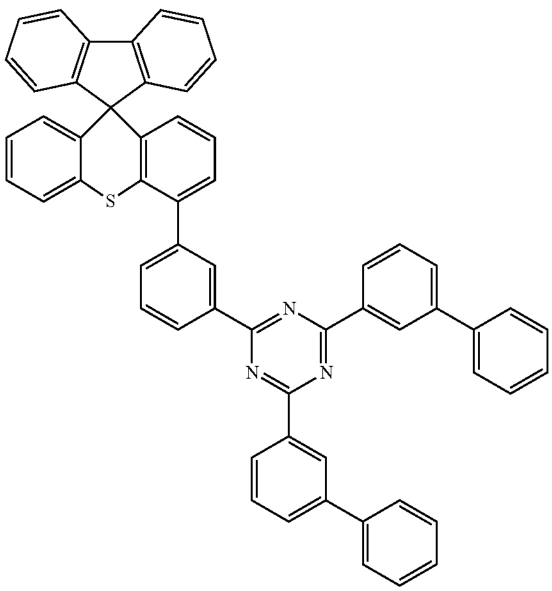
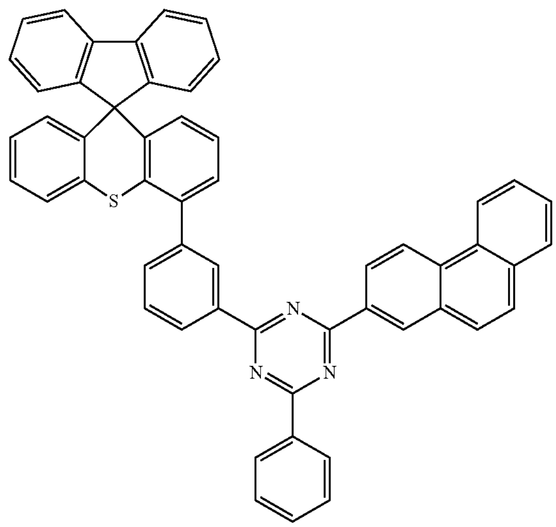
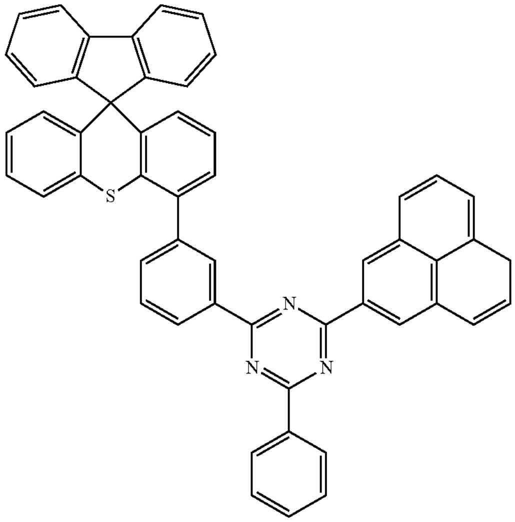
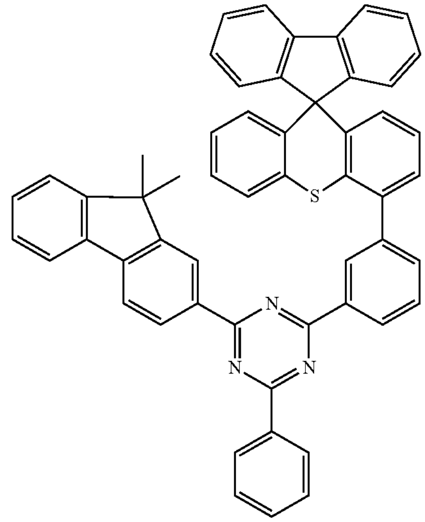

-continued
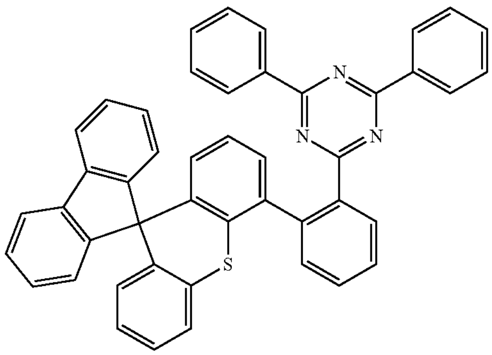
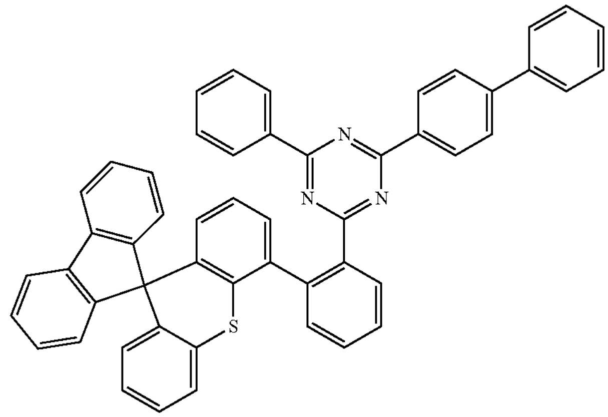
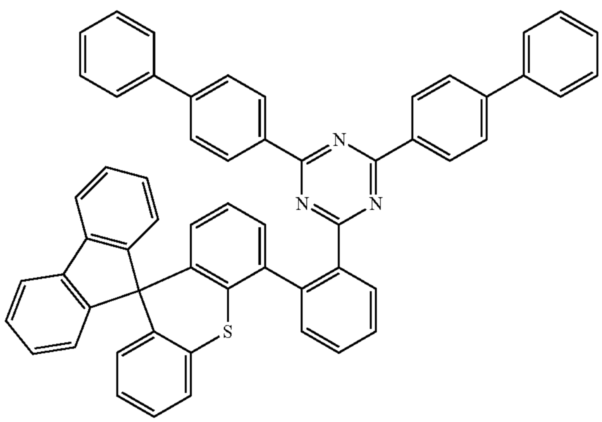
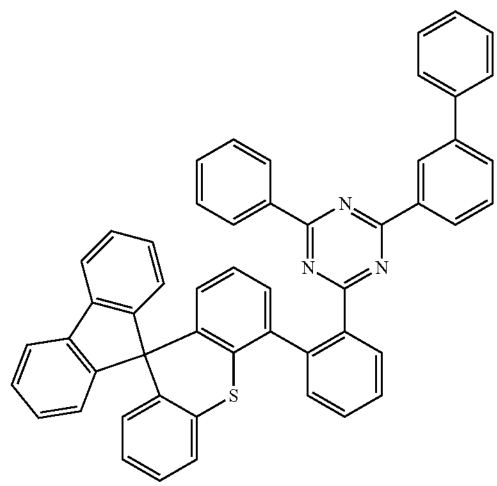
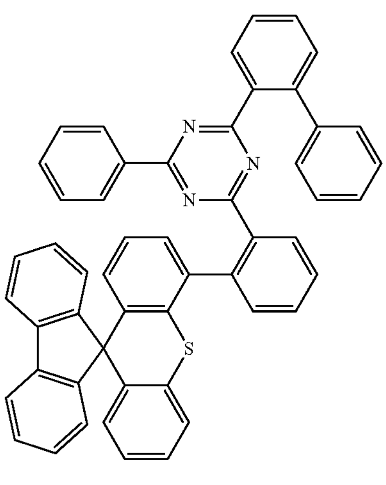
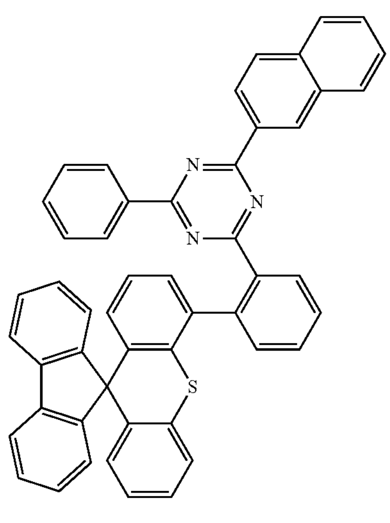

-continued
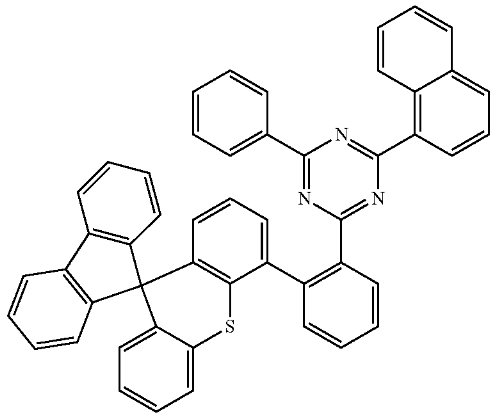
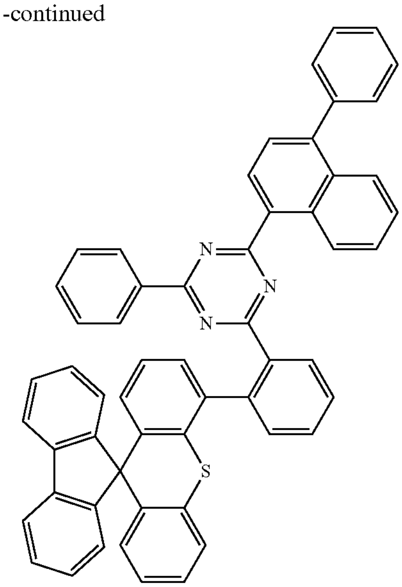
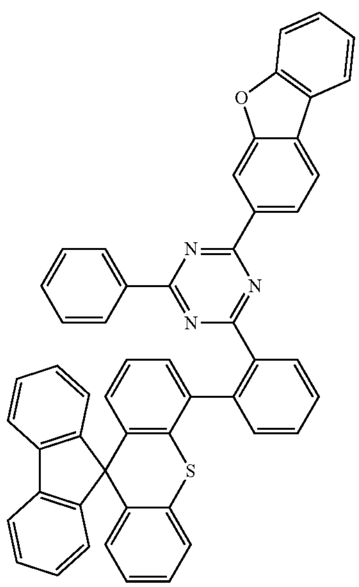
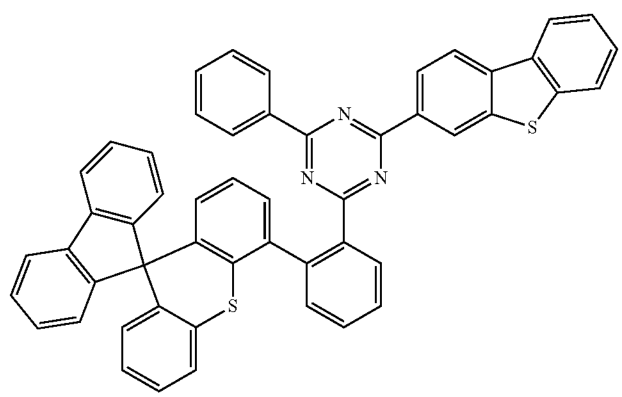
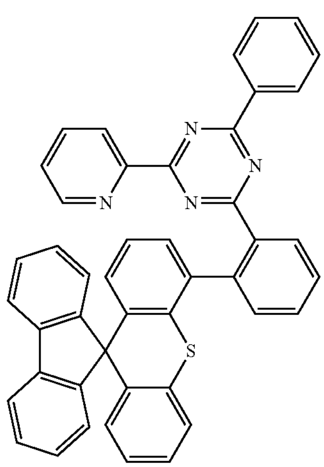
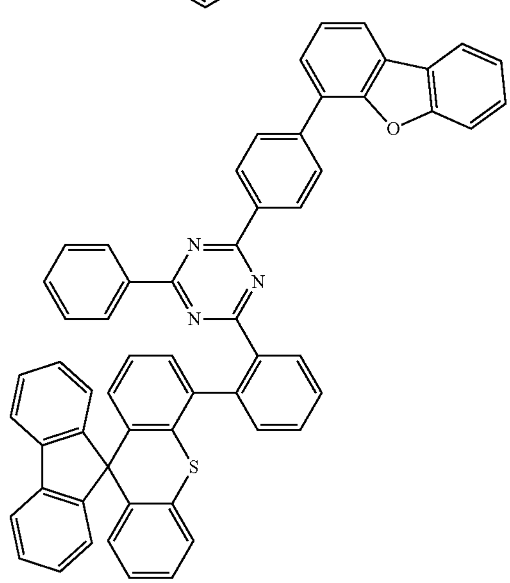

-continued
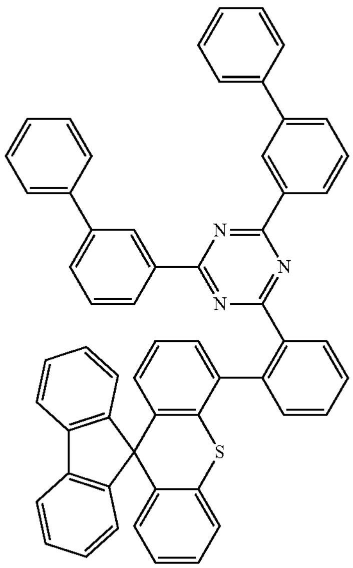
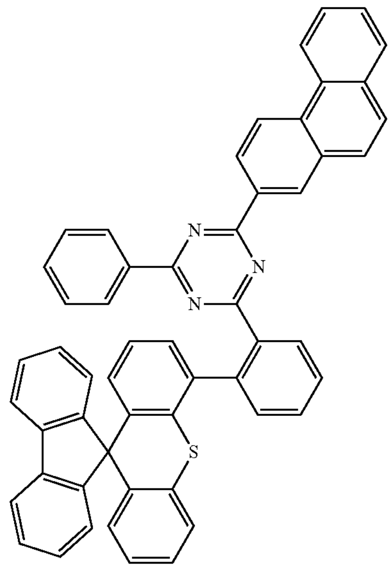
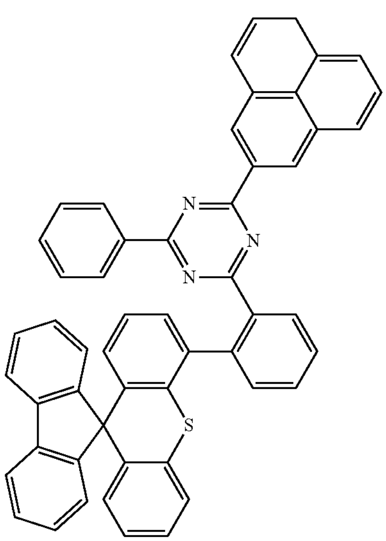
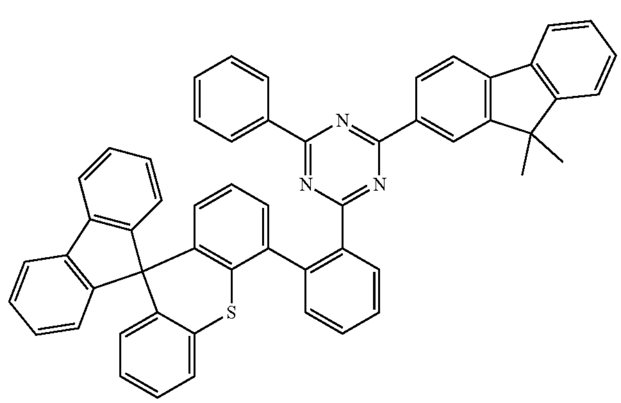

-continued
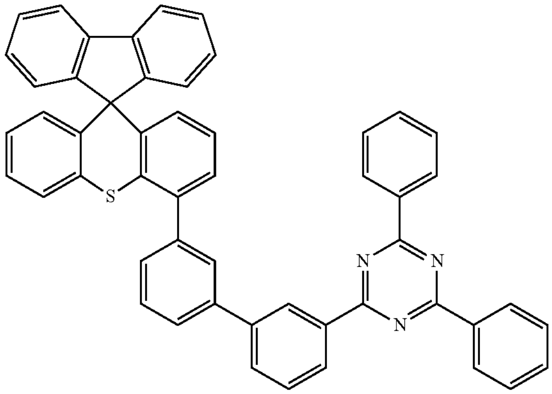
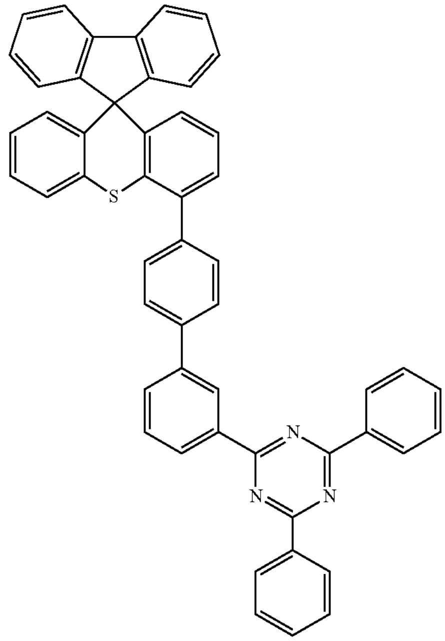
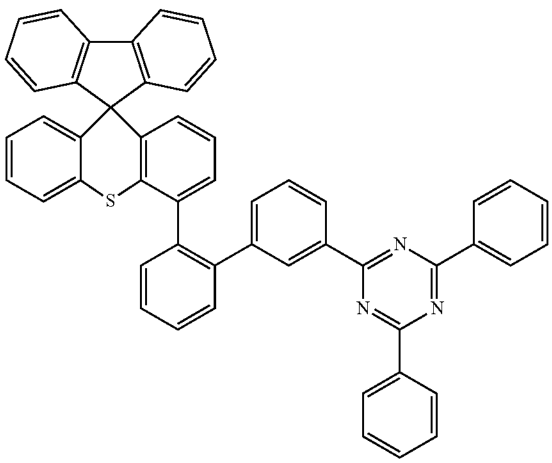
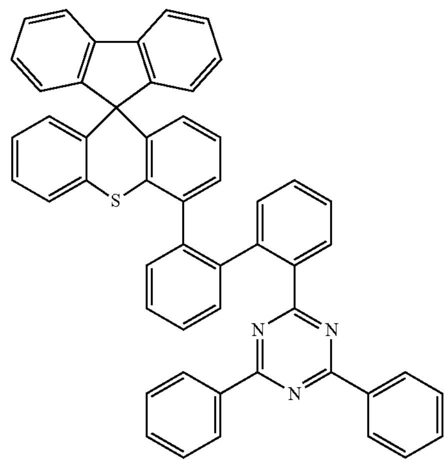
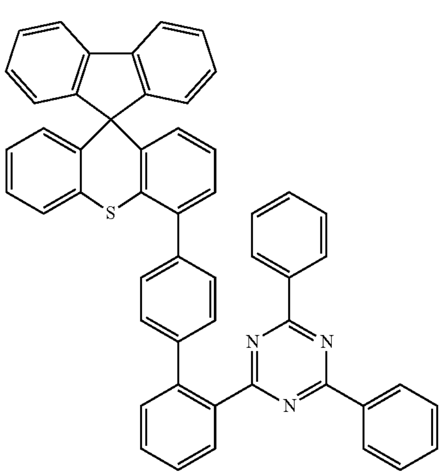
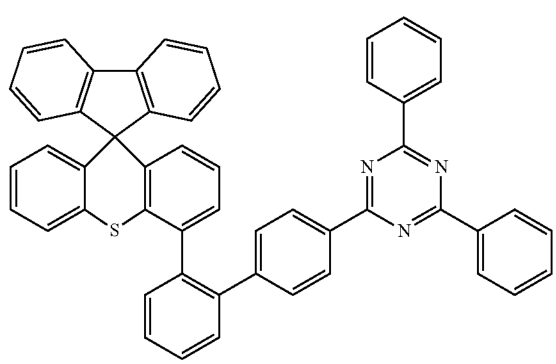

-continued
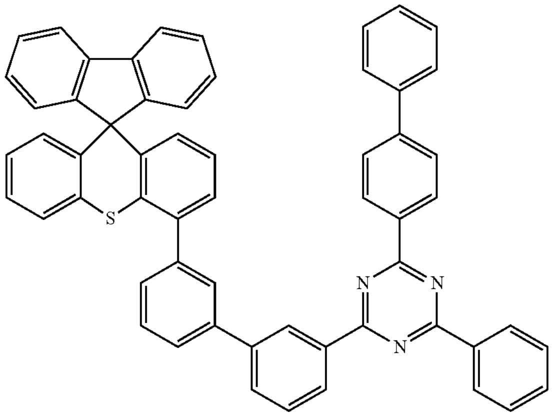
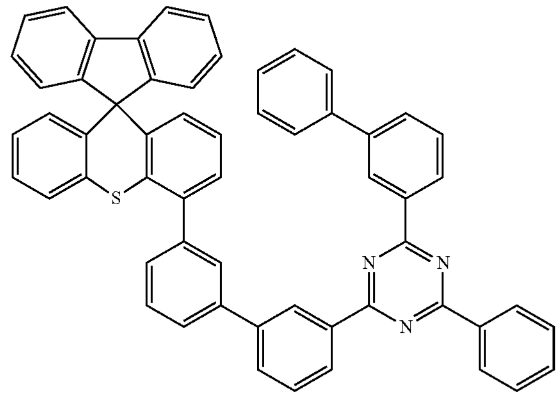
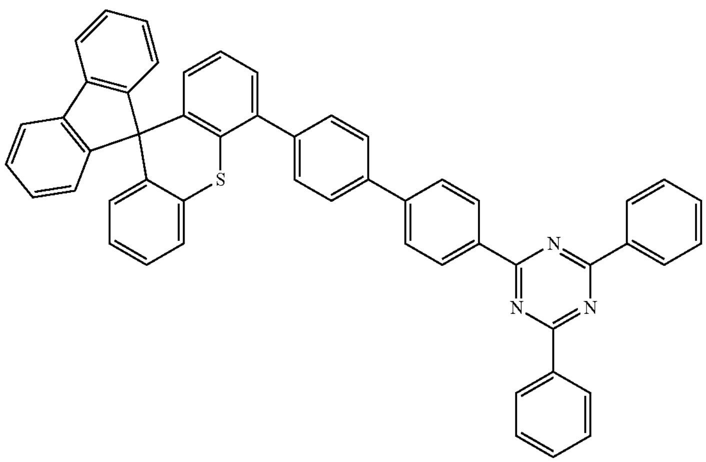
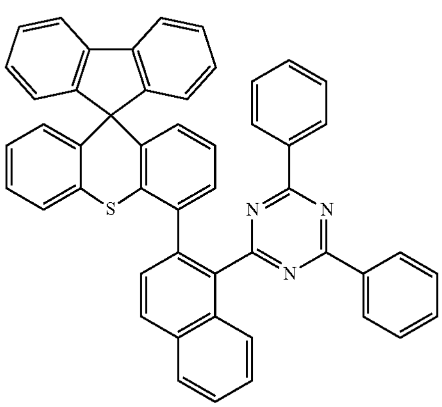
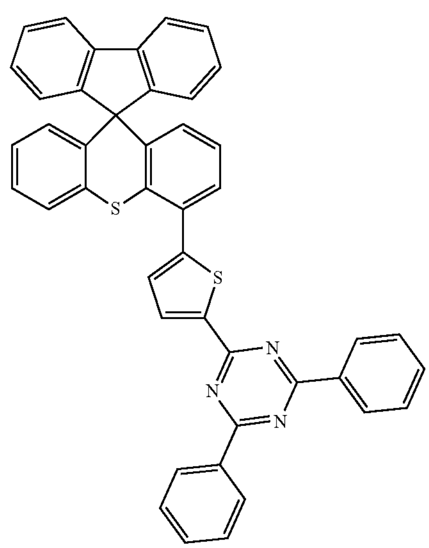

-continued
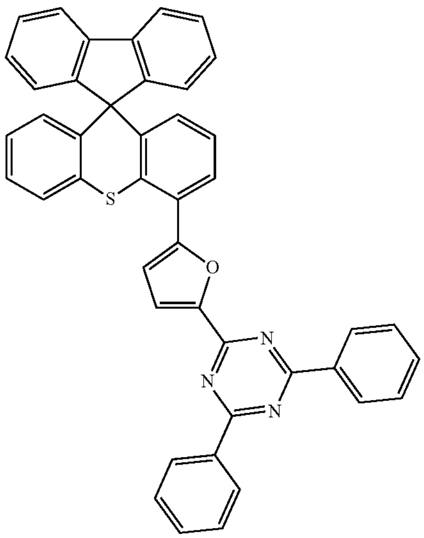
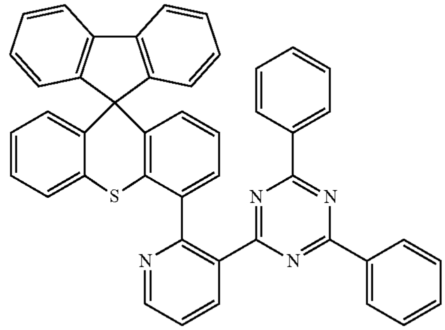
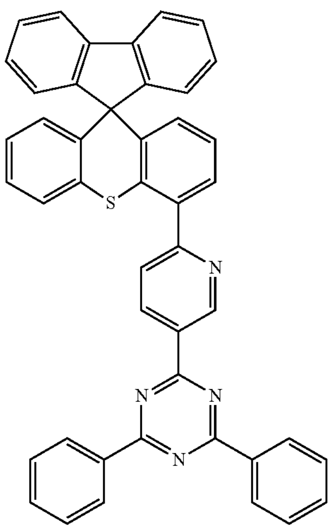
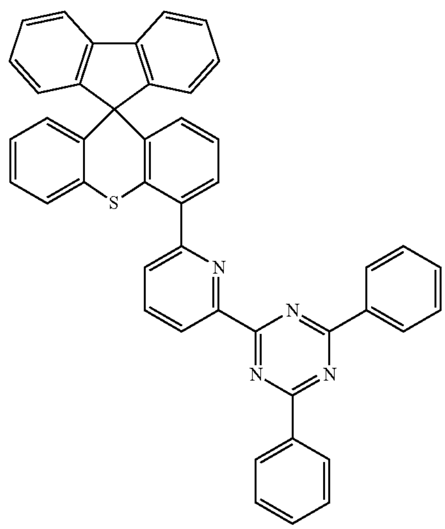
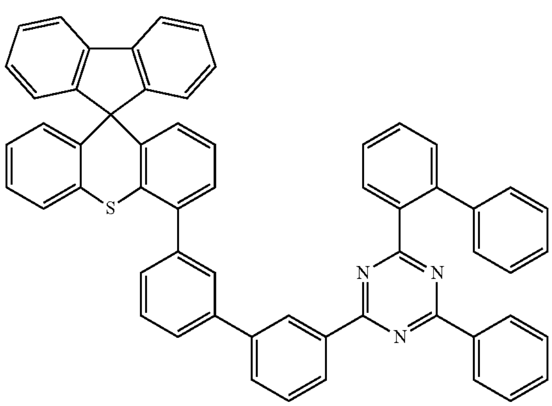
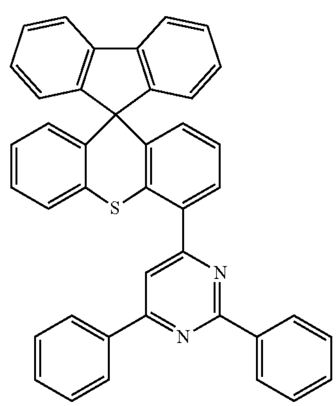

-continued
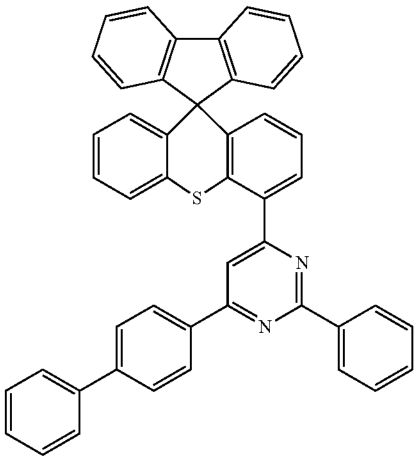
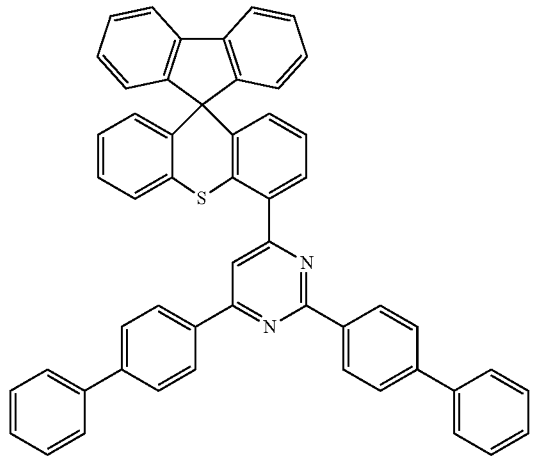
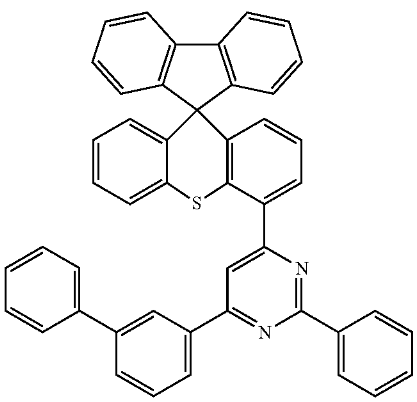
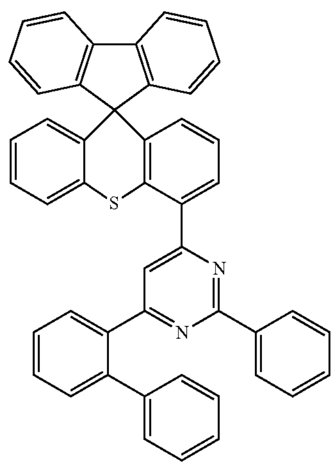
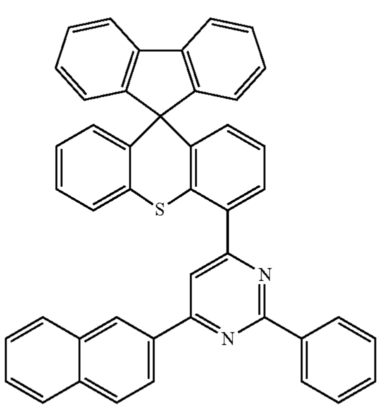
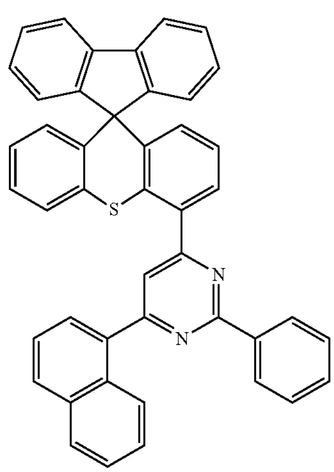

-continued
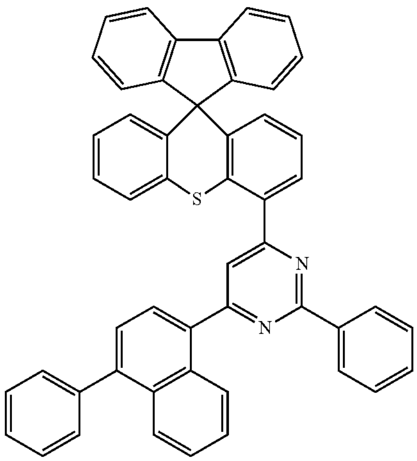
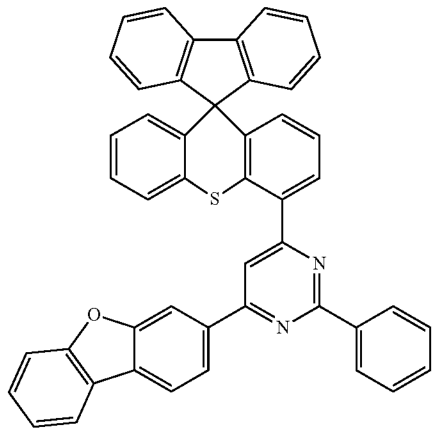
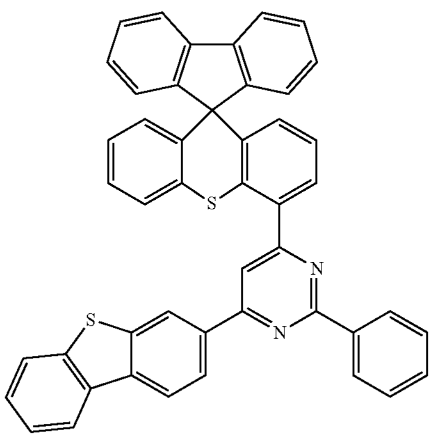
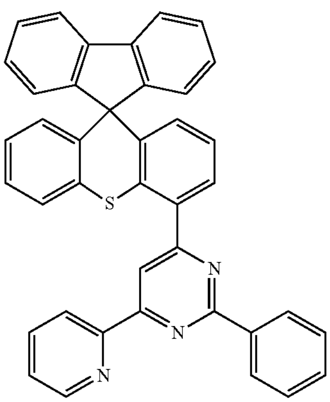
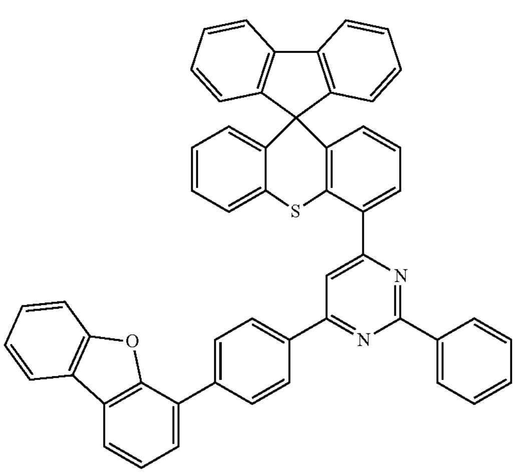
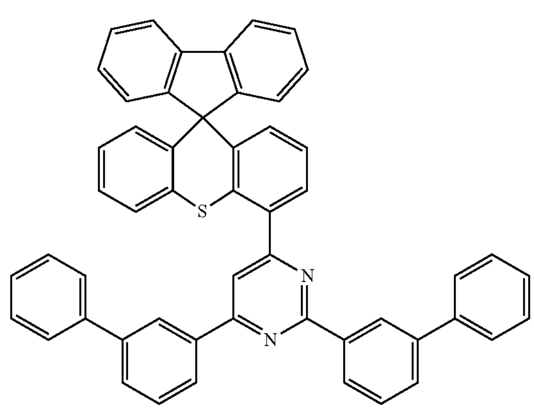

-continued
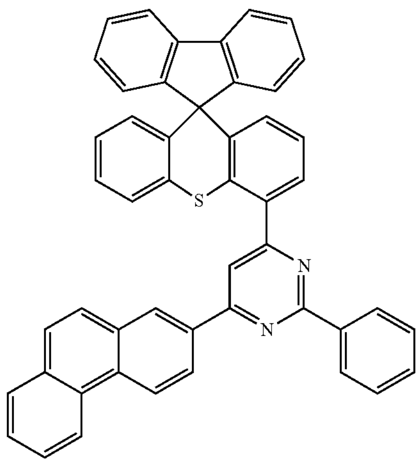
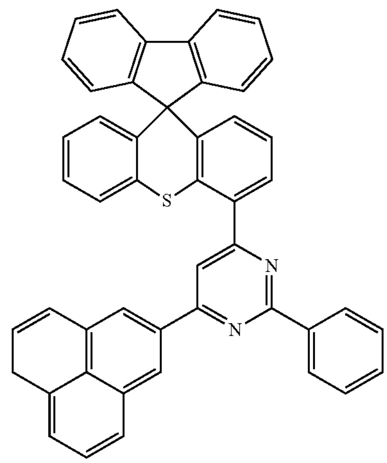
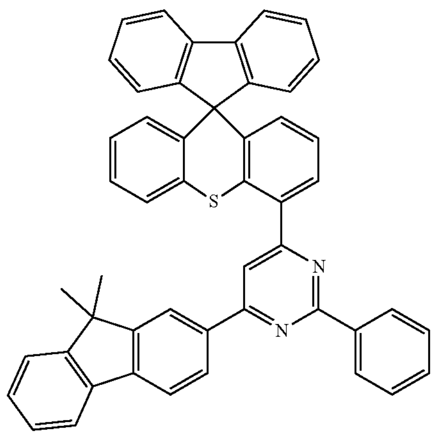
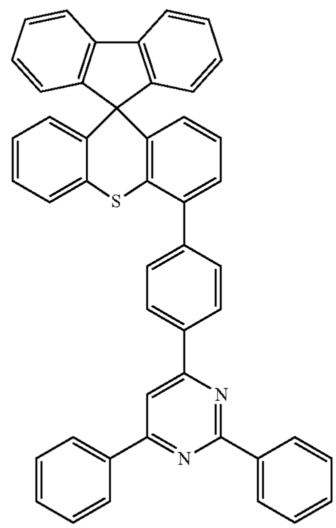
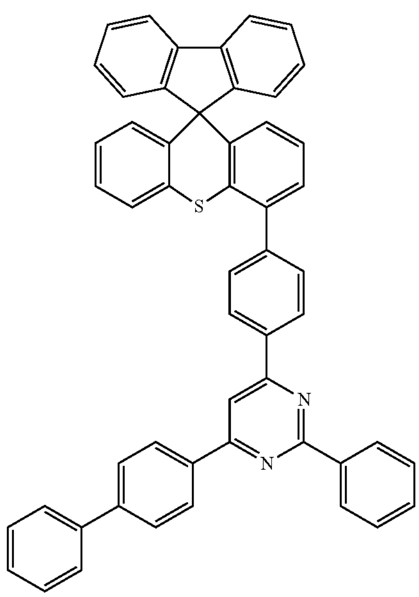
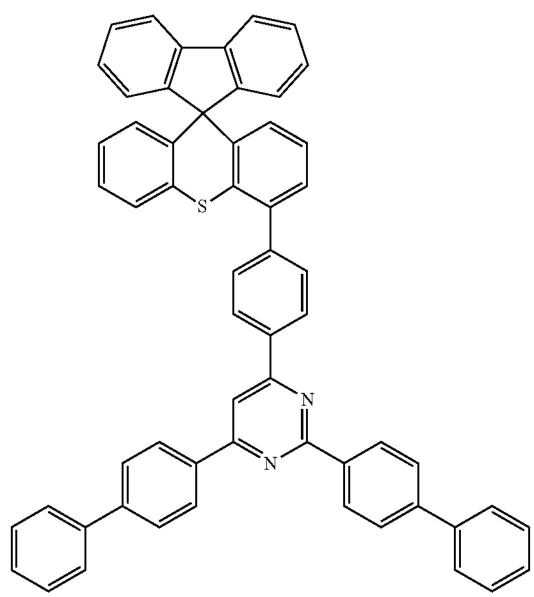

-continued
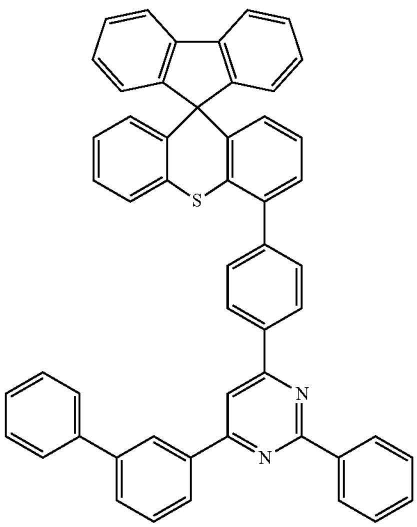
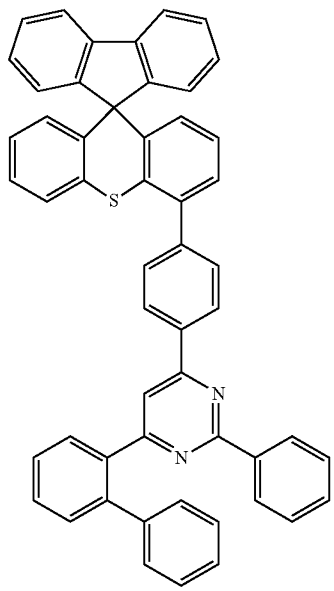
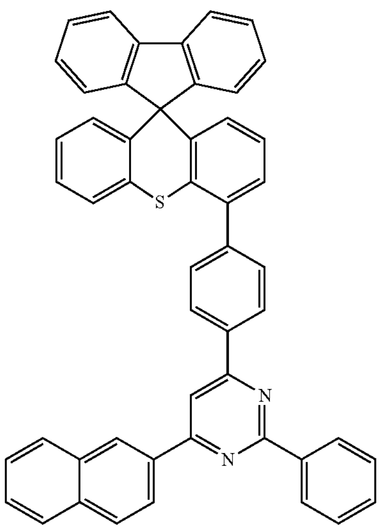
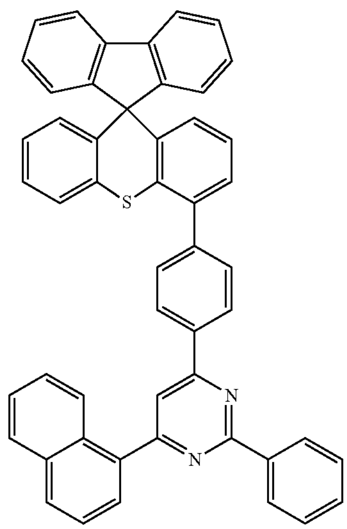
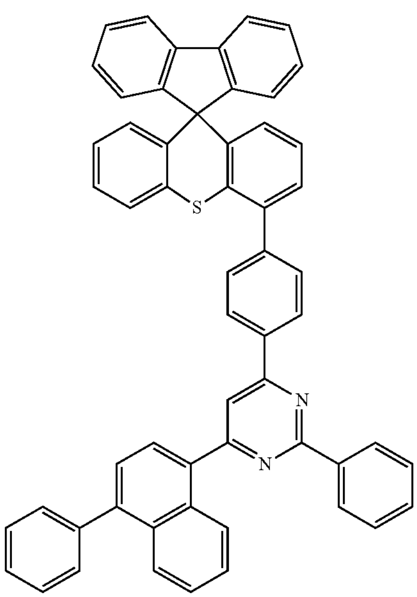
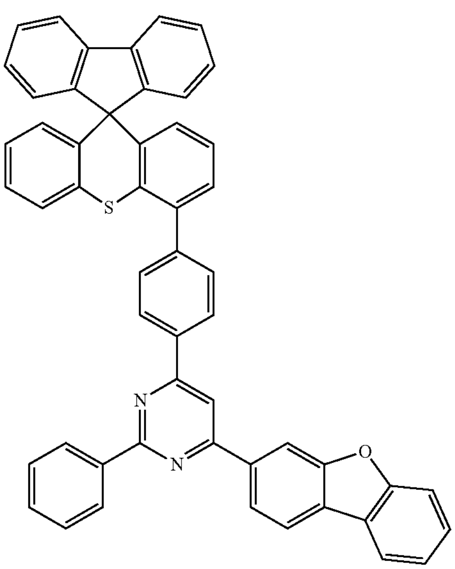

-continued
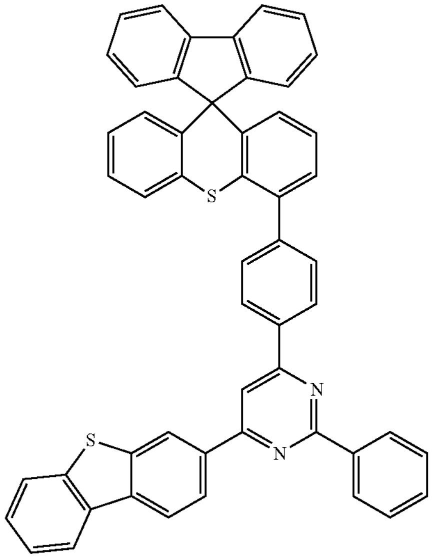
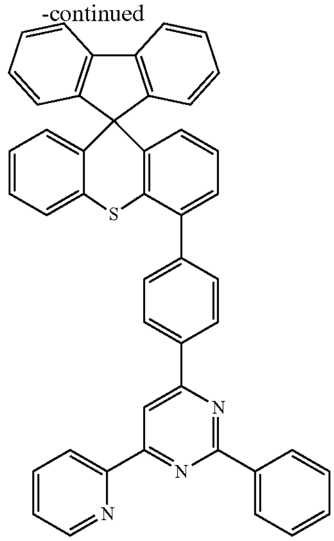
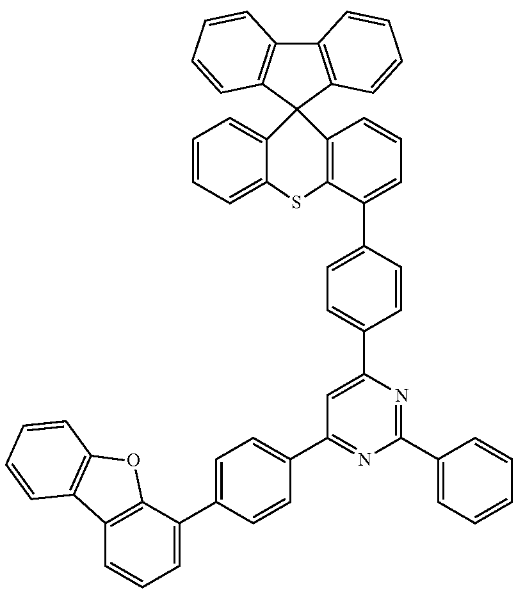
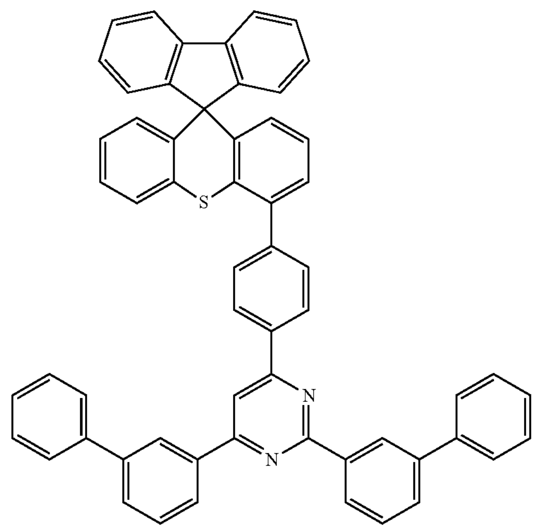
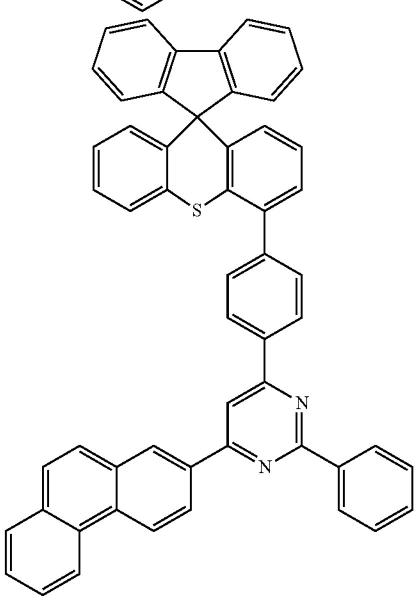
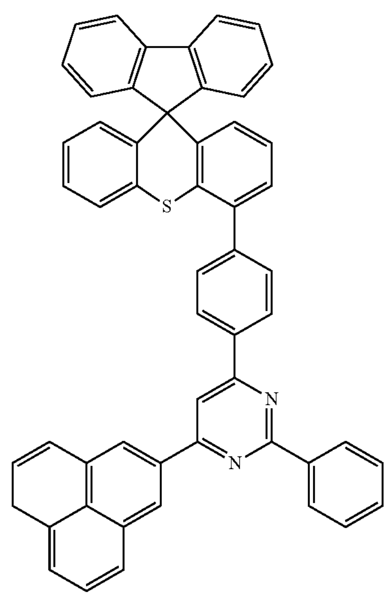

-continued
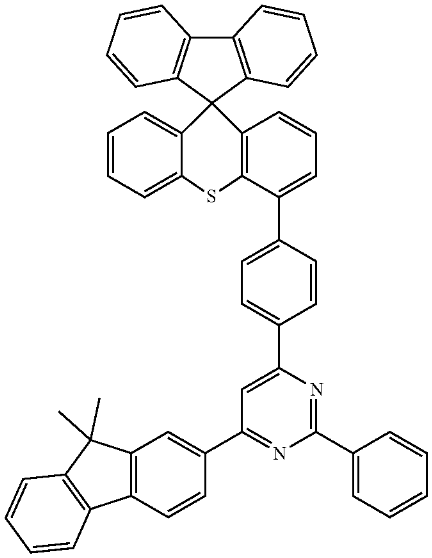
-continued
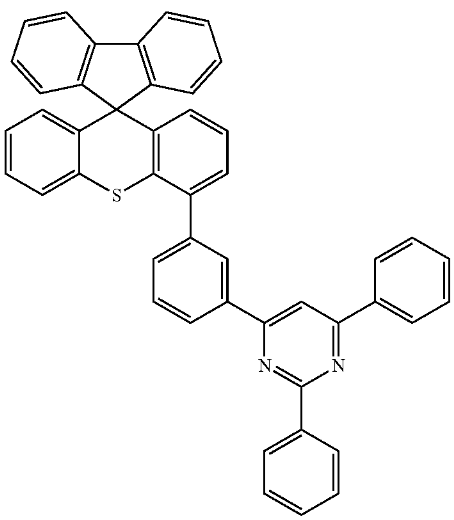
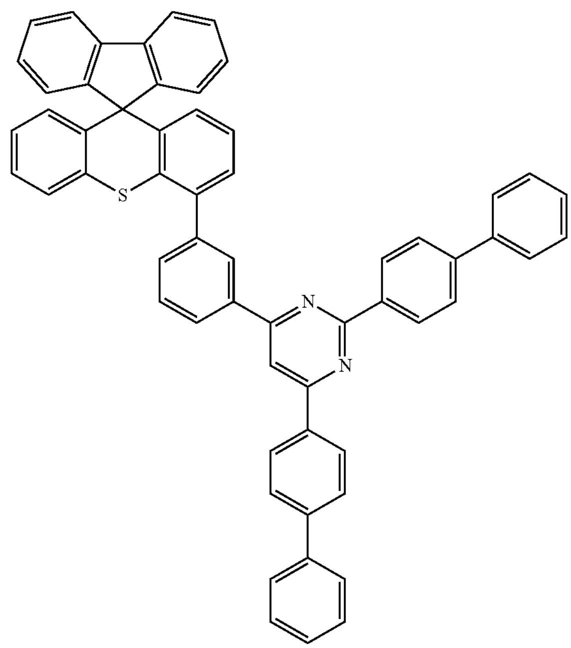
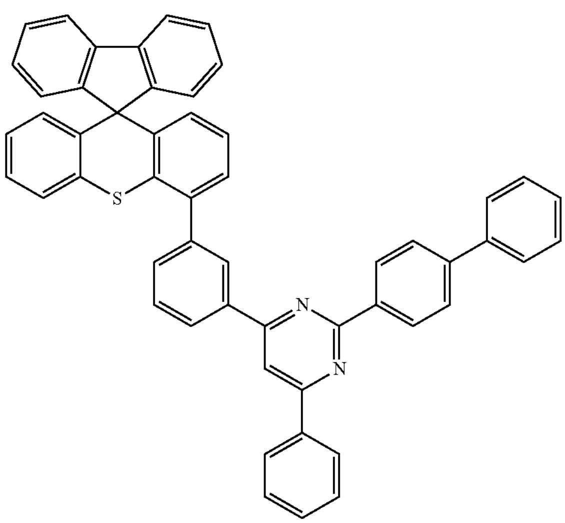

-continued
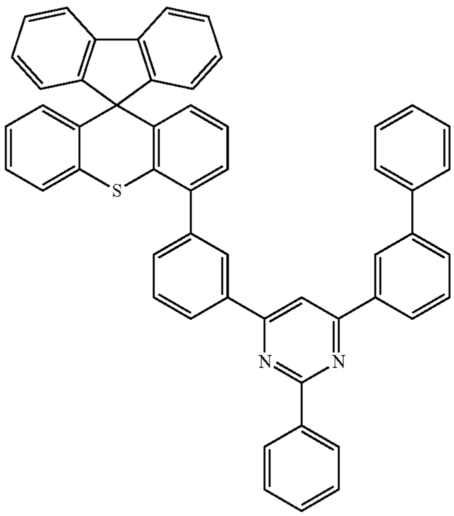
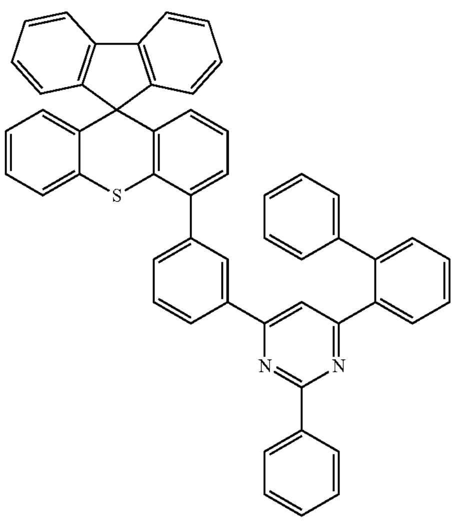
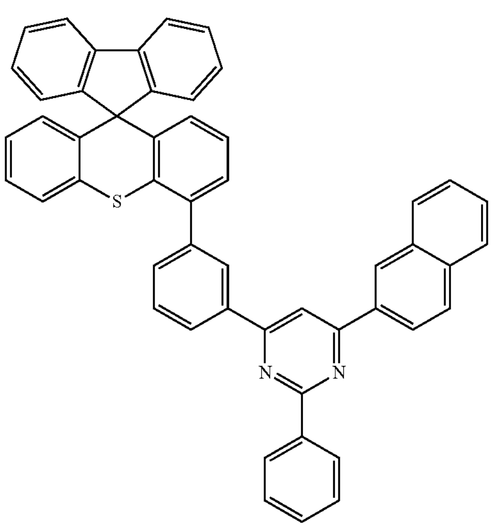
-continued
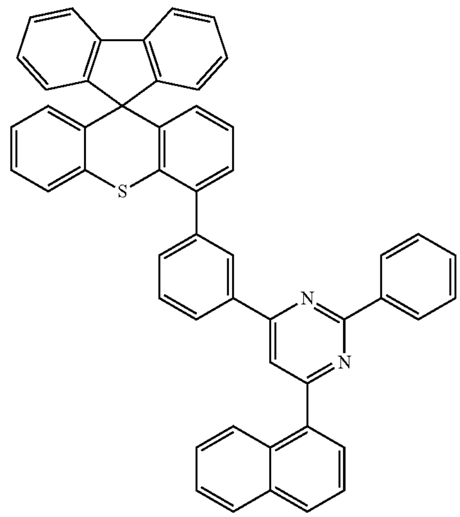
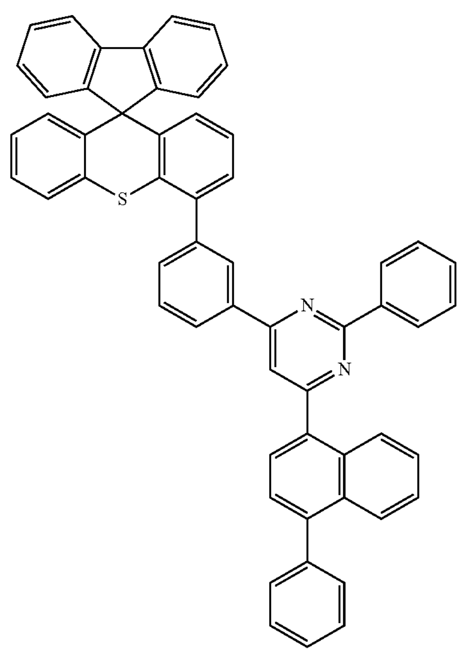

-continued
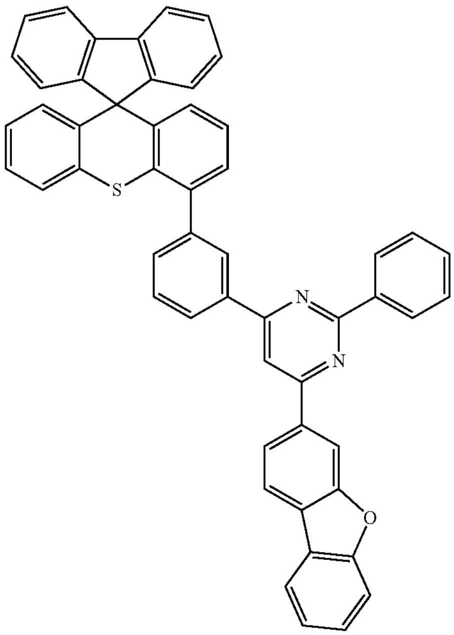
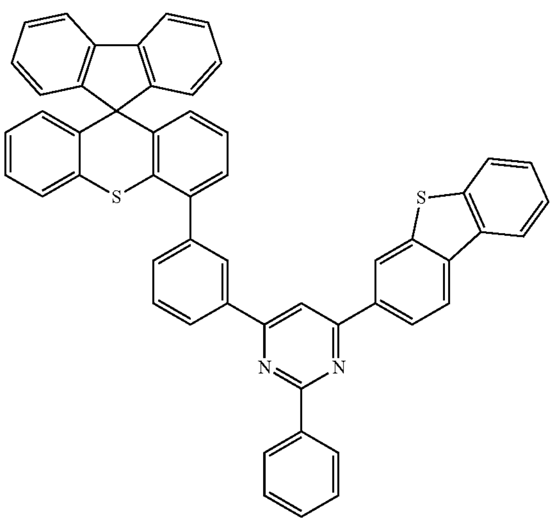
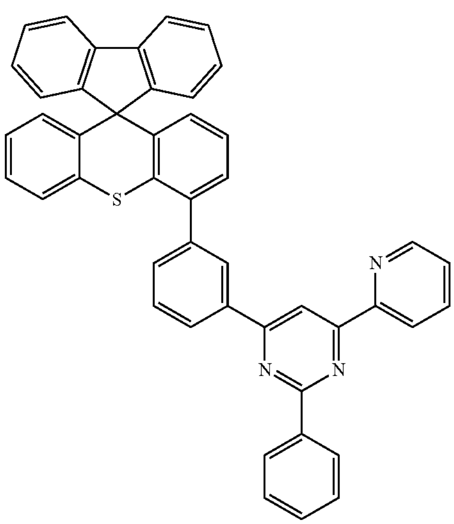
-continued
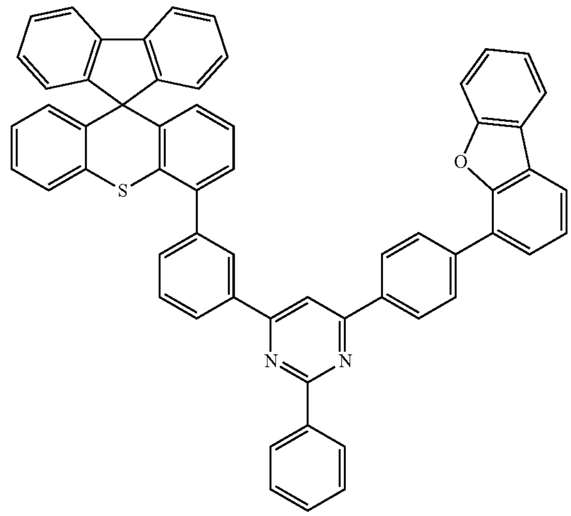
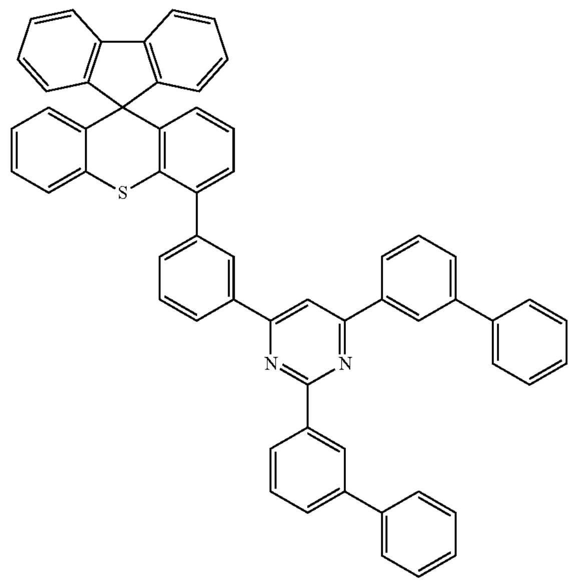
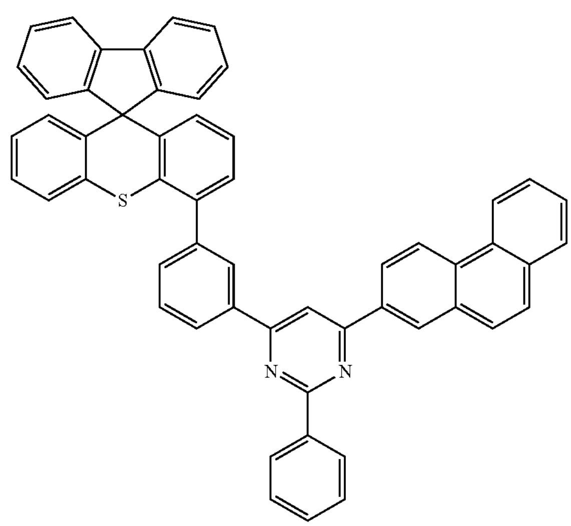

-continued
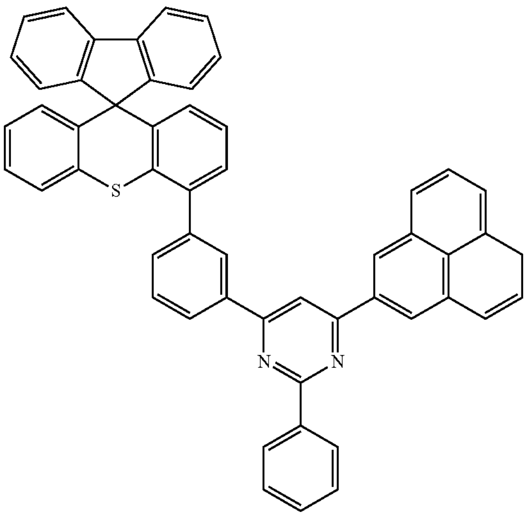
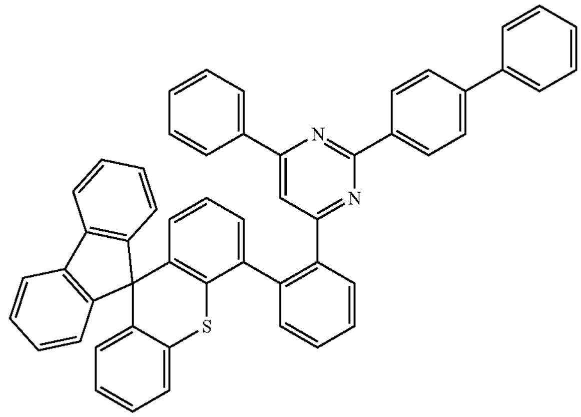
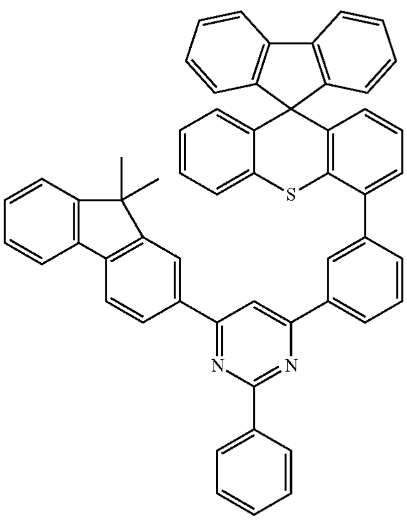
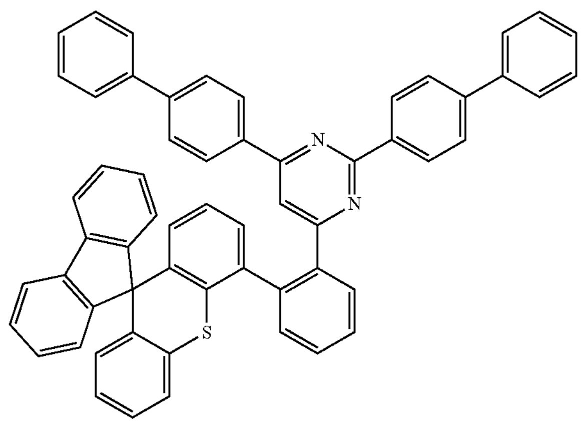
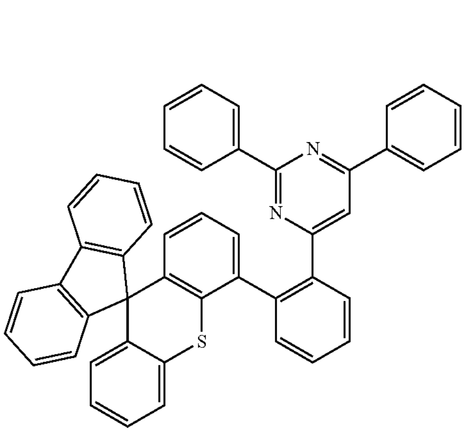
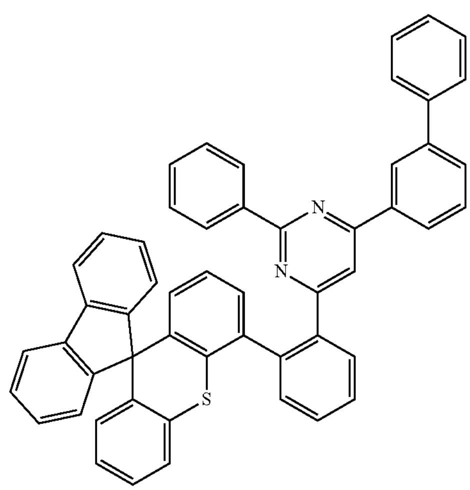 [SMILES: c1ccc(-c2cccc(-c3cc(-c4ccccc4-c4cccc5c4Sc4ccccc4C54c5ccccc5-c5ccccc54)nc(-c4ccccc4)n3)c2)cc1]

-continued
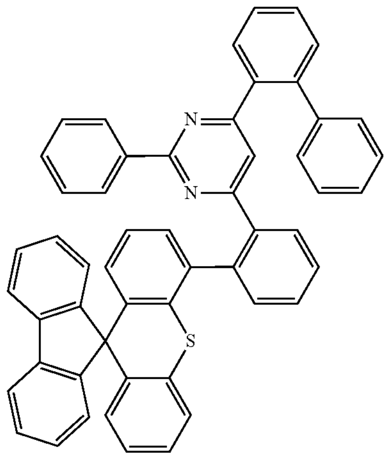
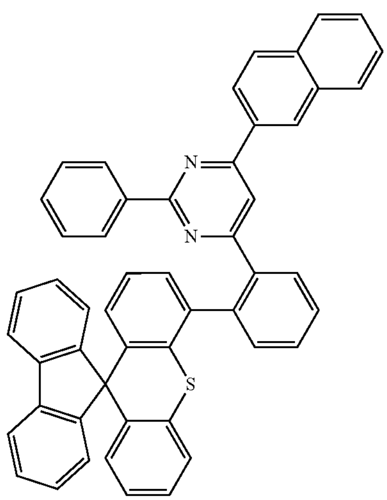
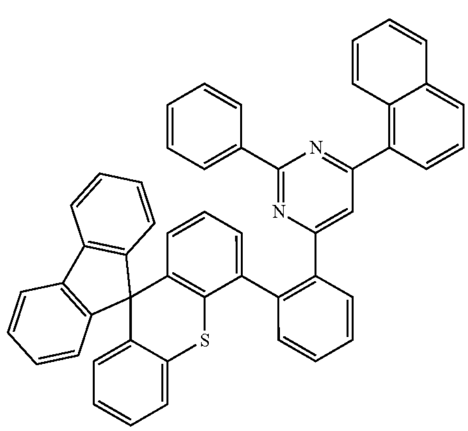
-continued
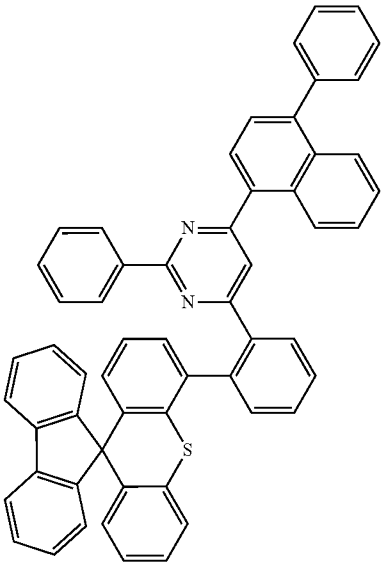
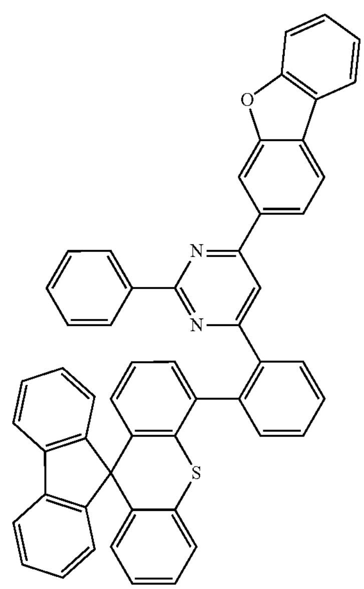
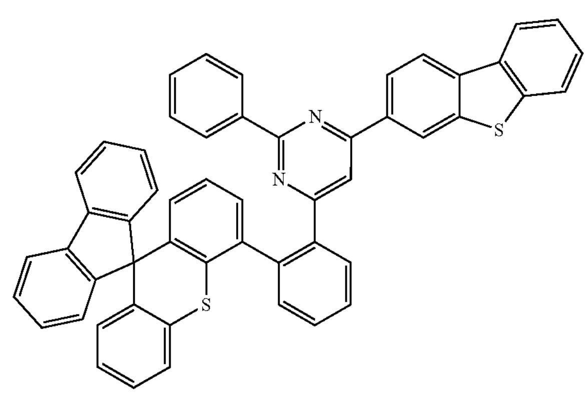

-continued
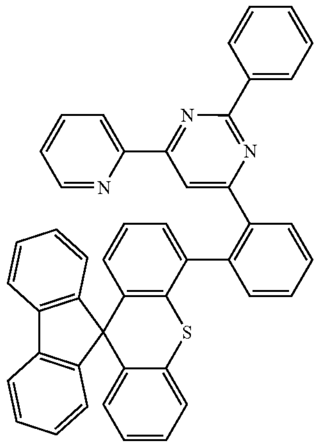
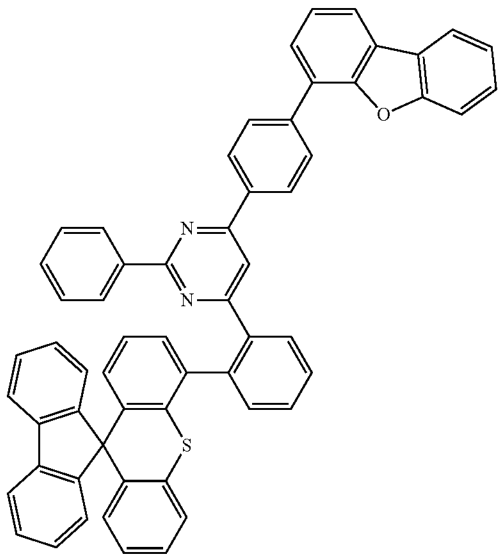
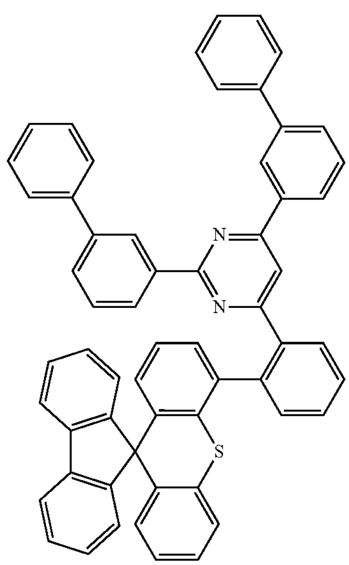
-continued
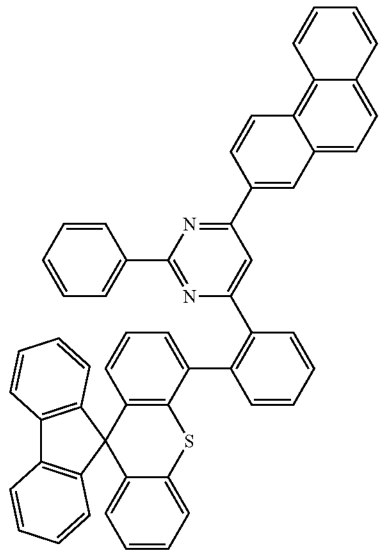
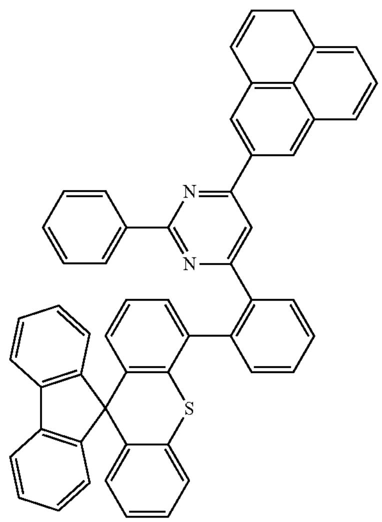
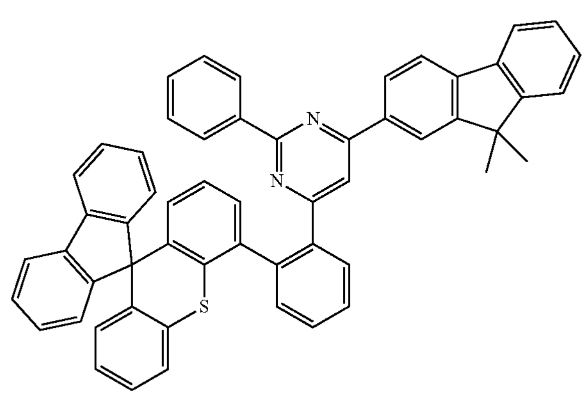

-continued
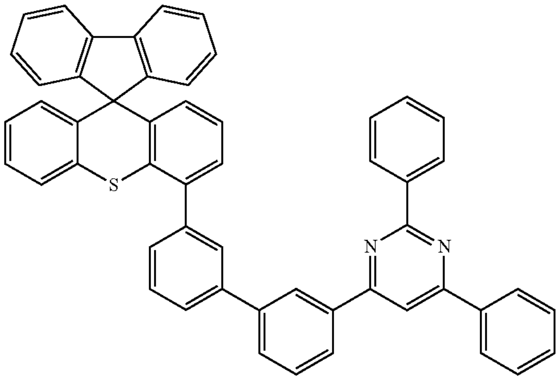
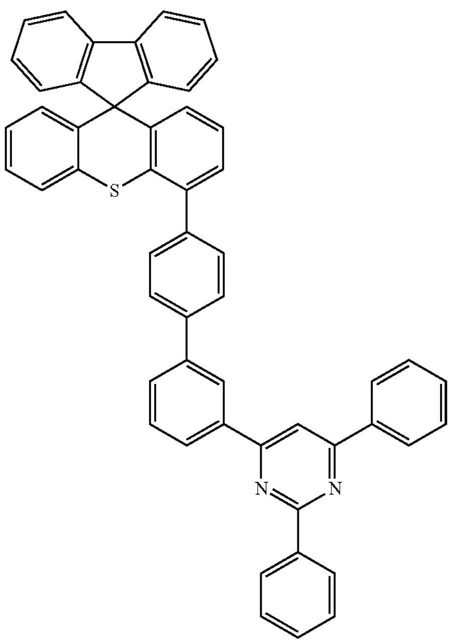
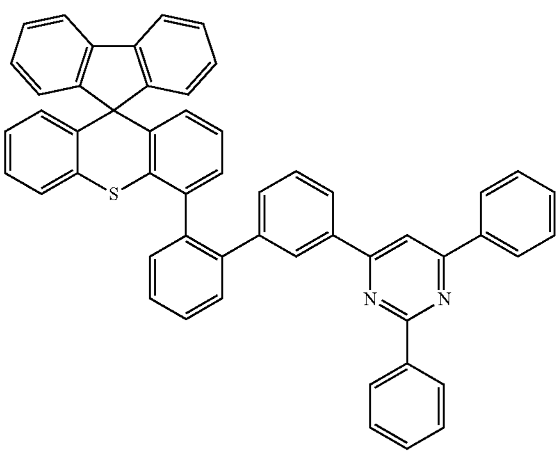
-continued
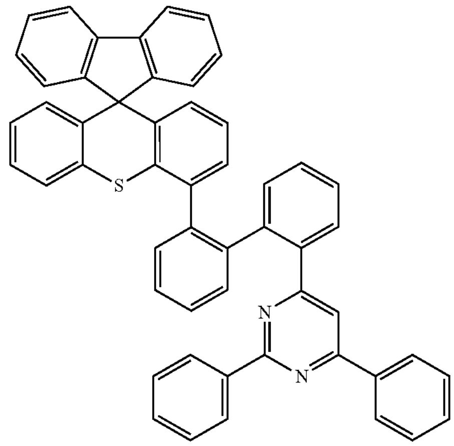
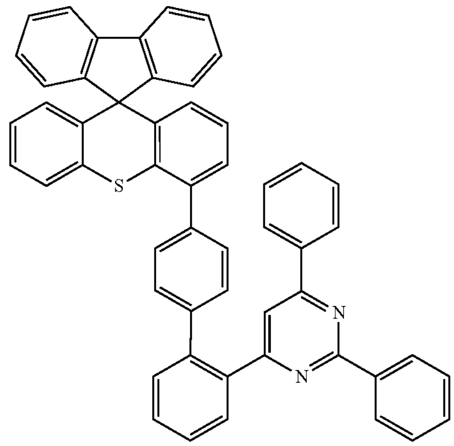
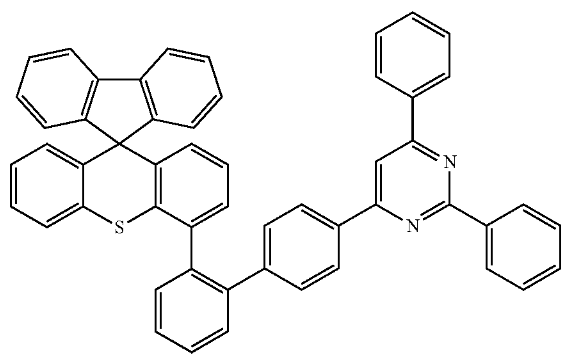
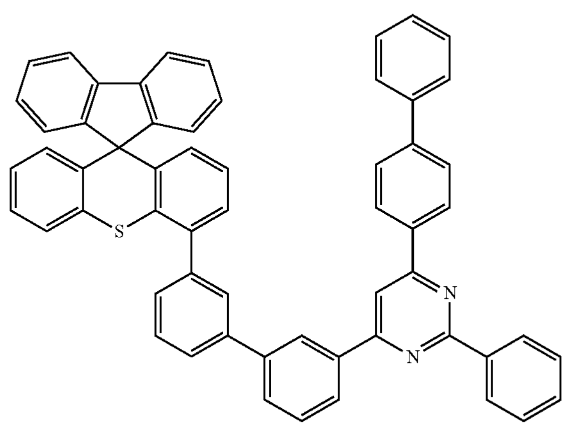

-continued
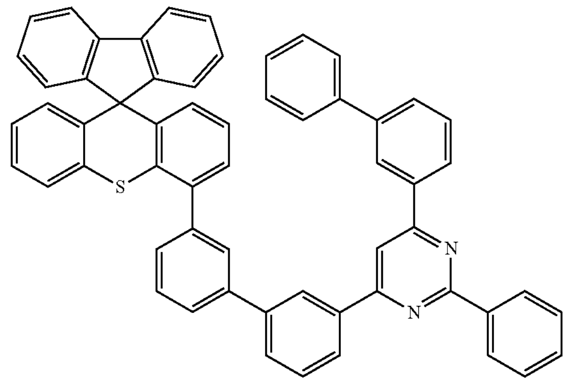
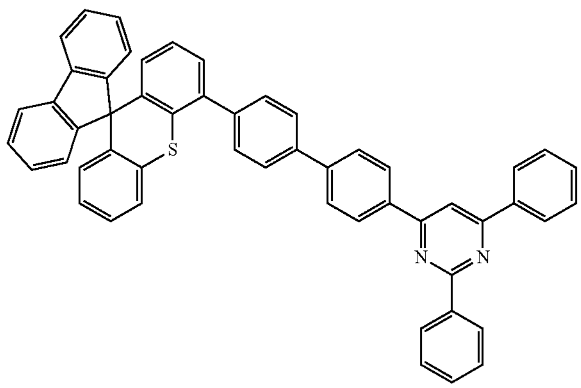
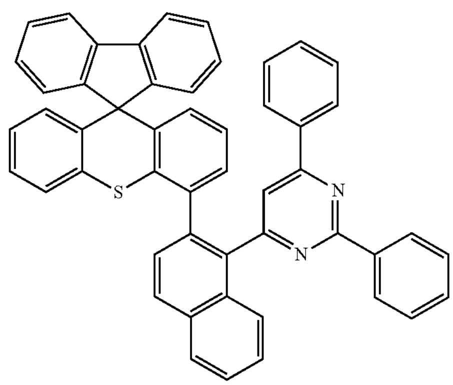
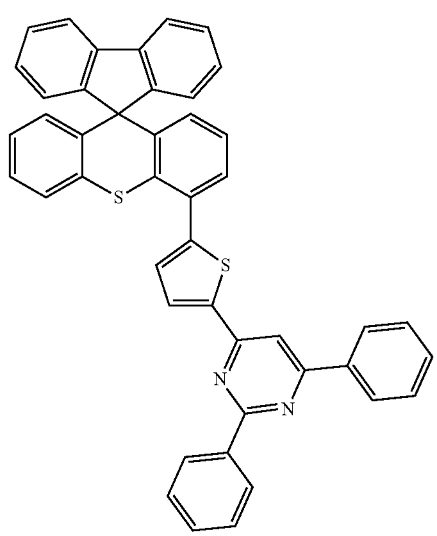
-continued
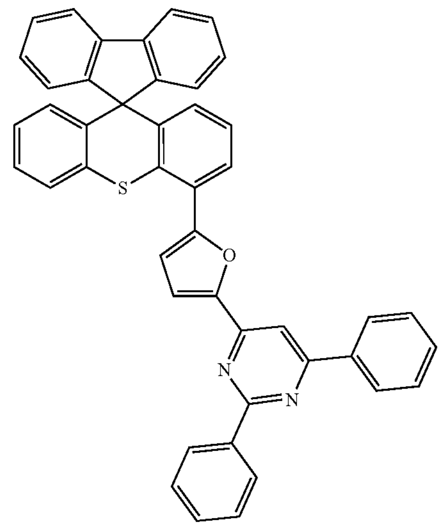
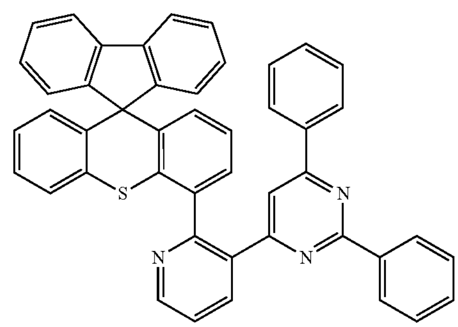
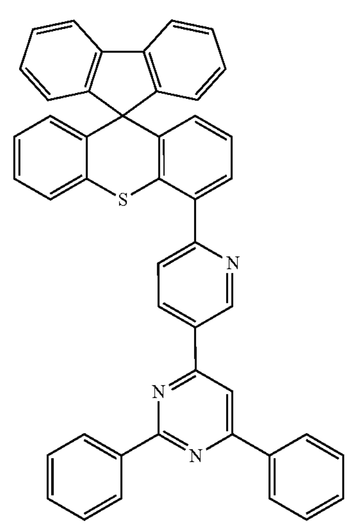

-continued
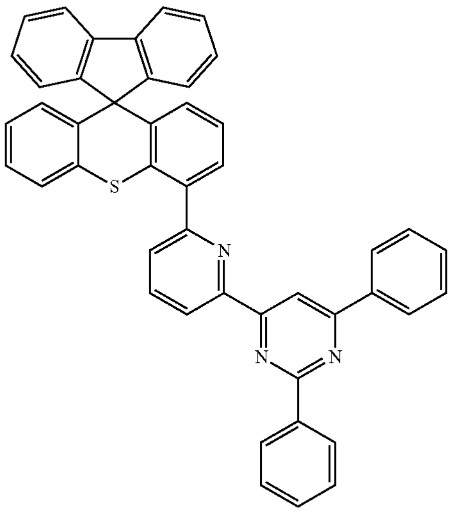
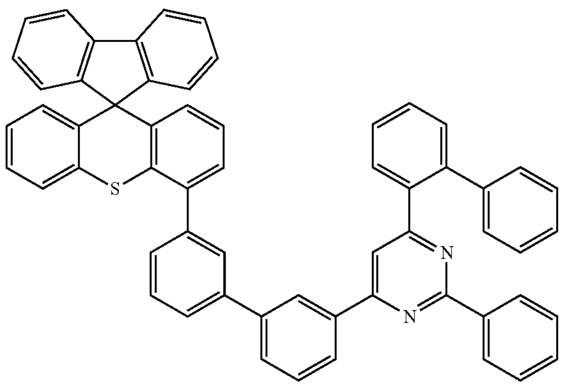
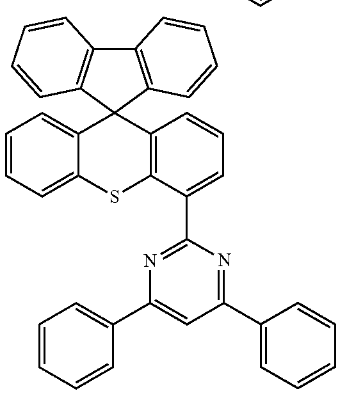
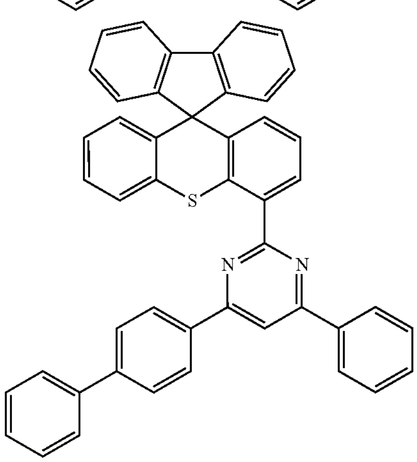
-continued
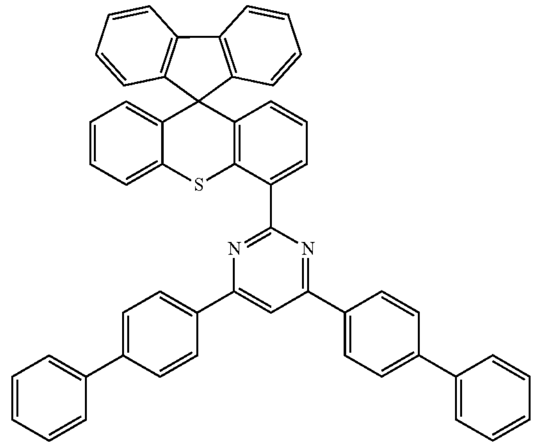
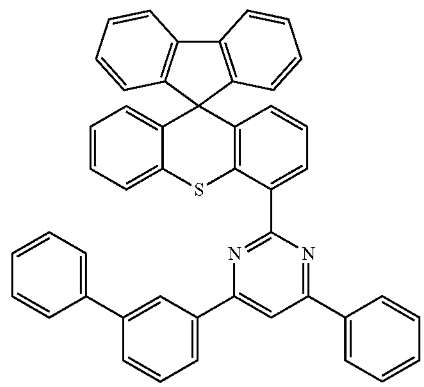
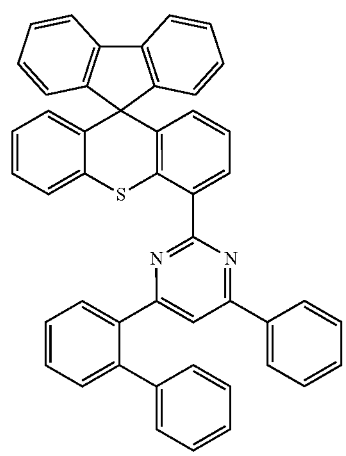
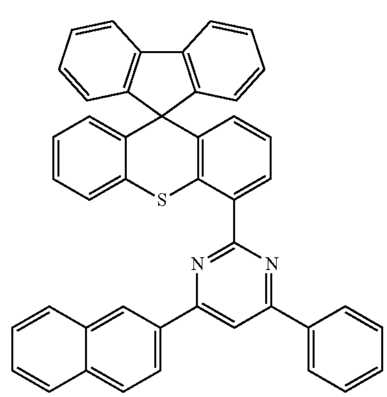

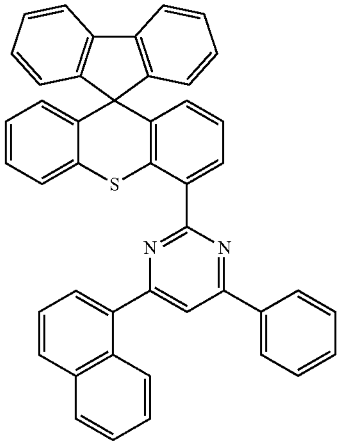 [SMILES: c1ccc(-c2cc(-c3cccc4ccccc34)nc(-c3cccc4c3Sc3ccccc3C43c4ccccc4-c4ccccc43)n2)cc1]
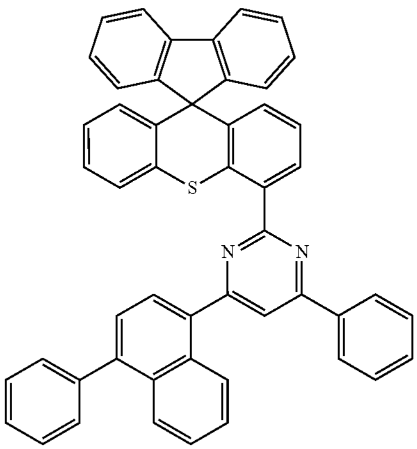
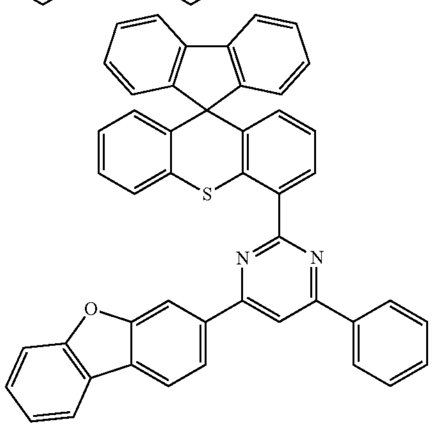
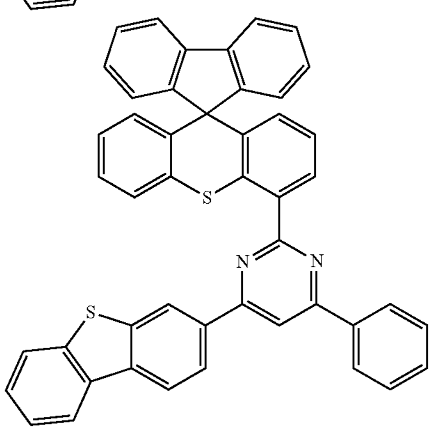
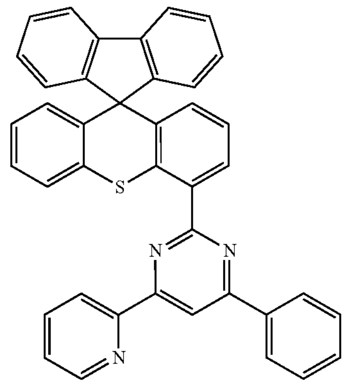
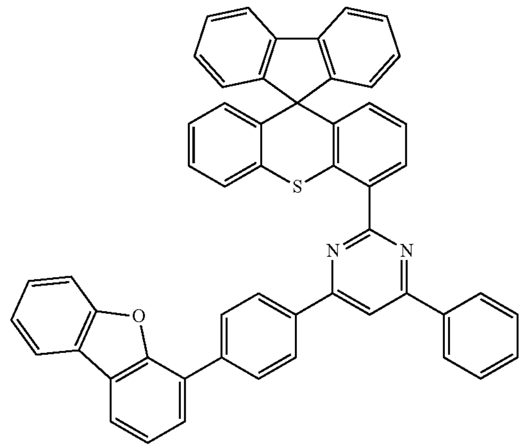
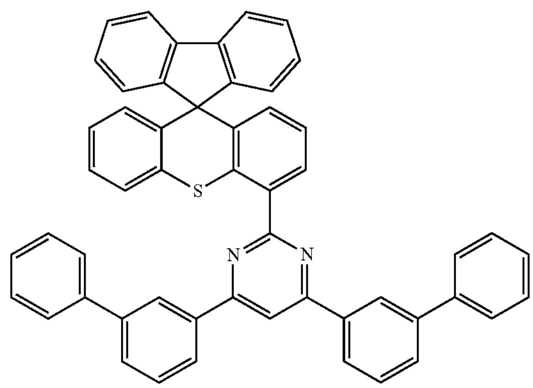
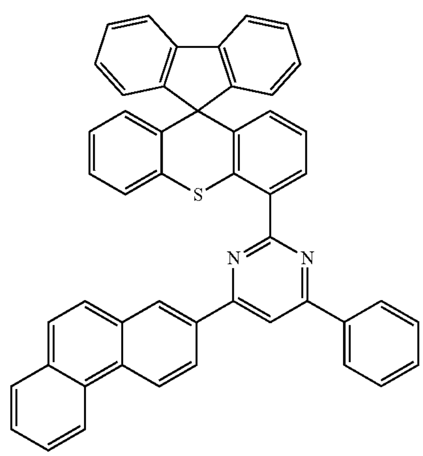

-continued
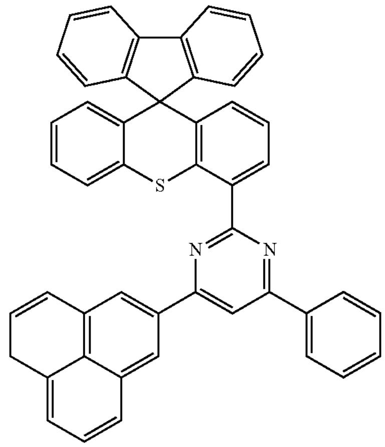
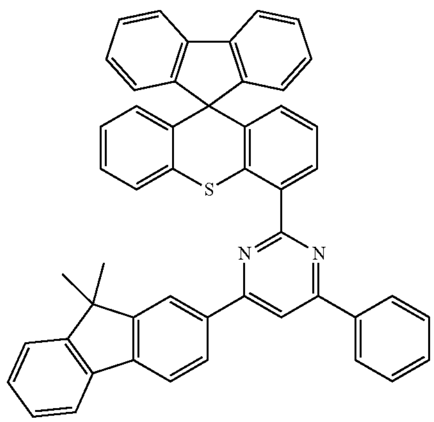 [SMILES: CC1(C)c2ccccc2-c2ccc(-c3cc(-c4ccccc4)nc(-c4cccc5c4Sc4ccccc4C54c5ccccc5-c5ccccc54)n3)cc21]
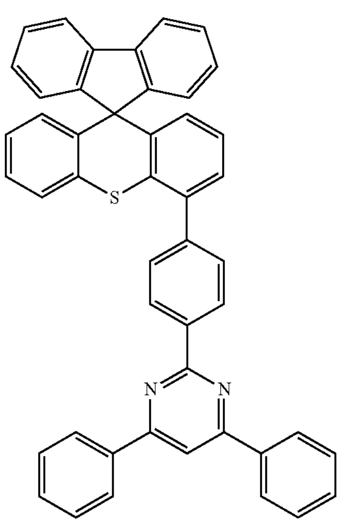
-continued
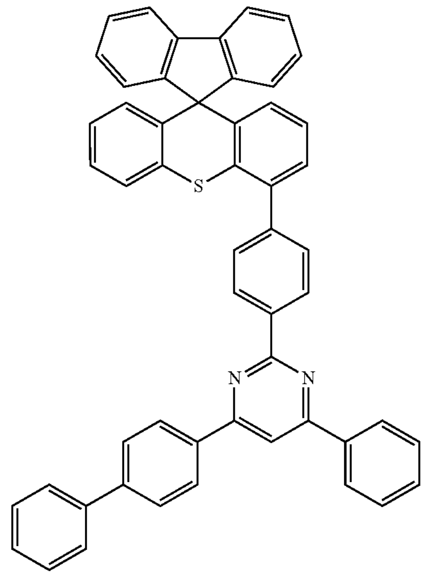
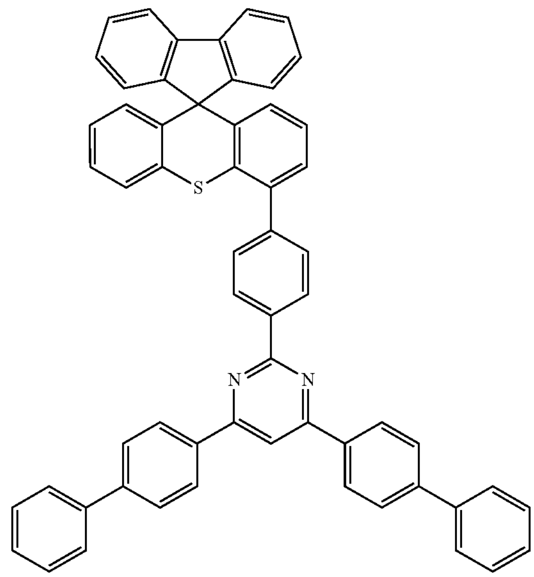
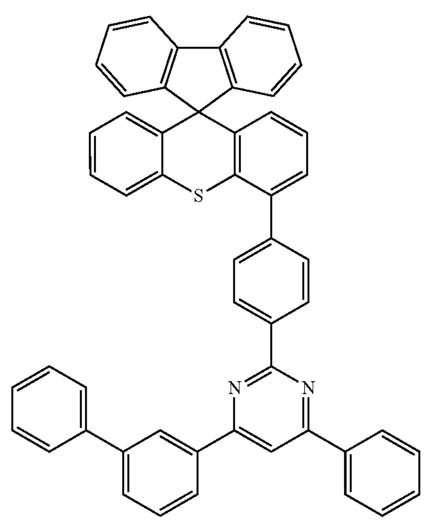

-continued
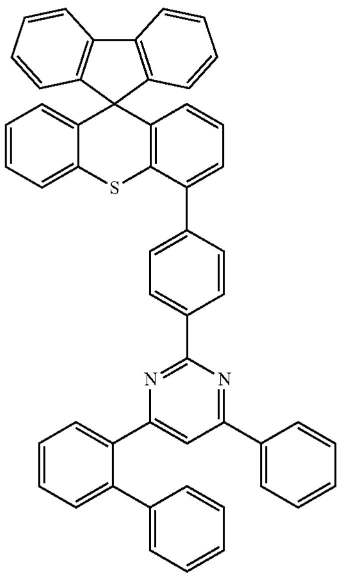
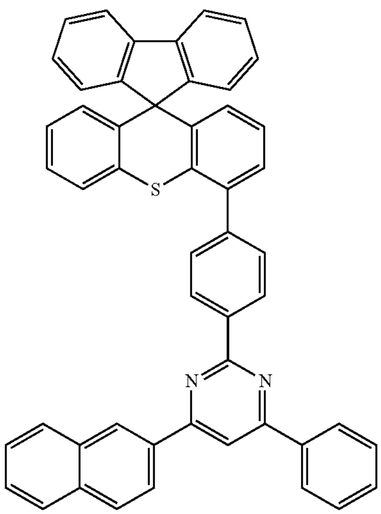
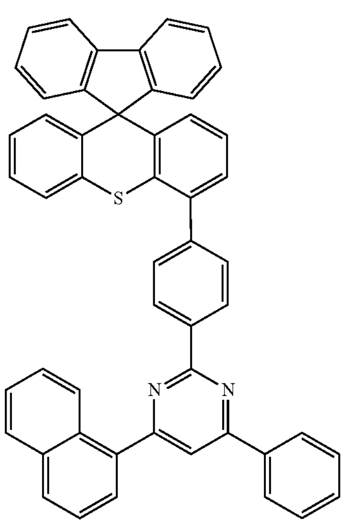
-continued
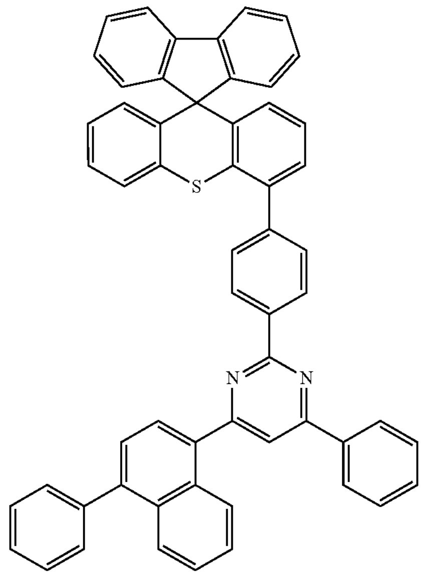
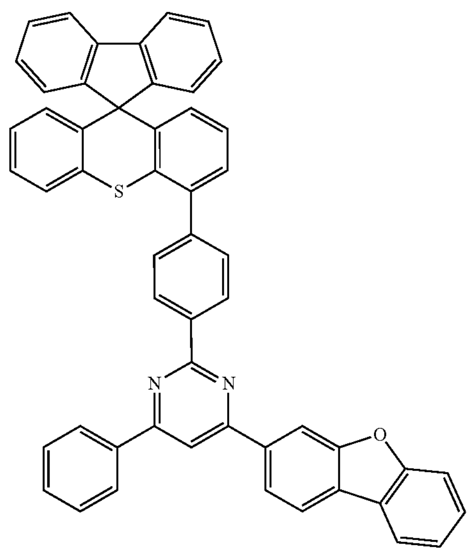
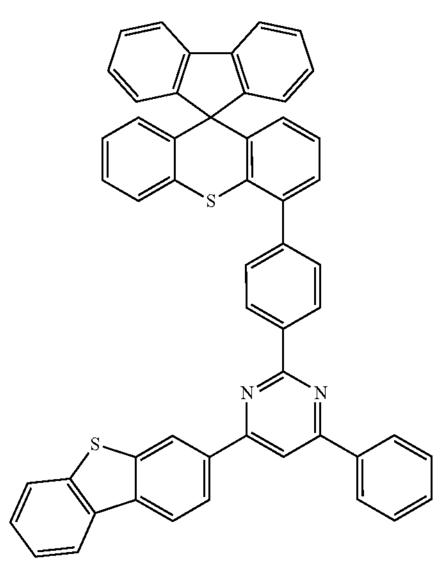

-continued
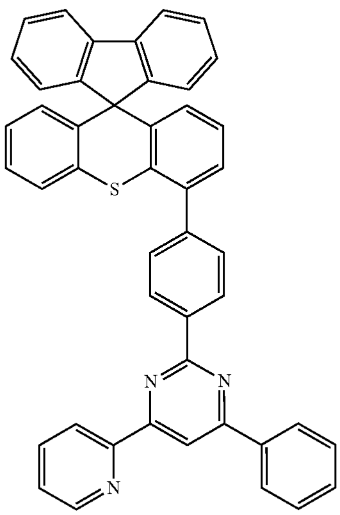
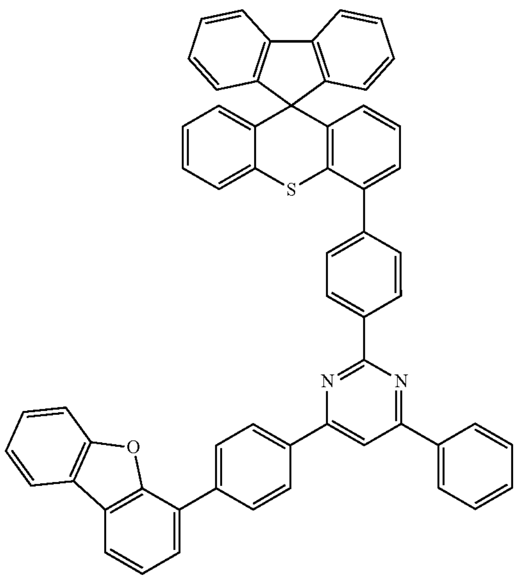
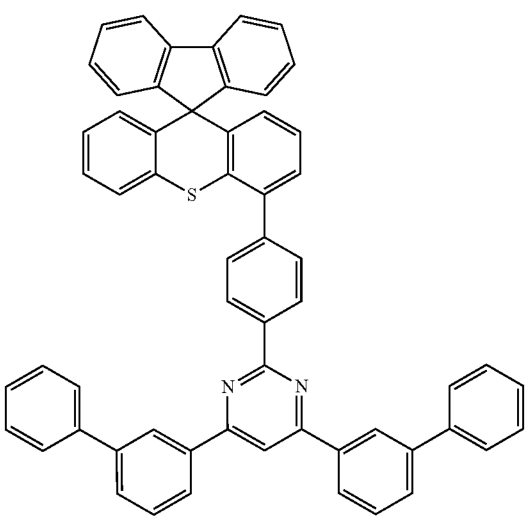
-continued
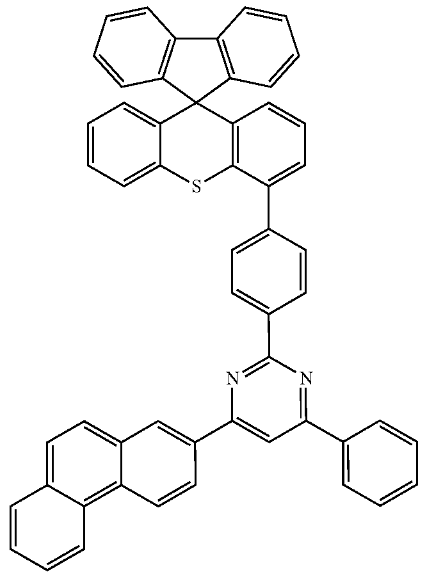
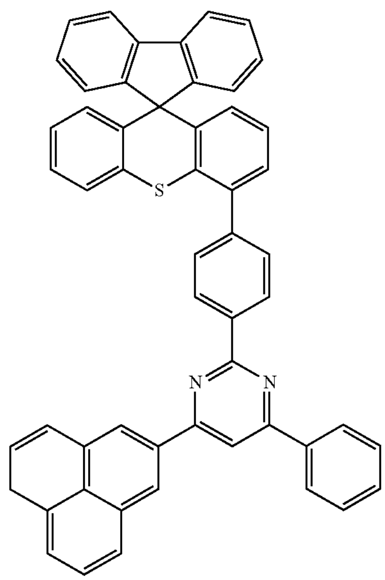
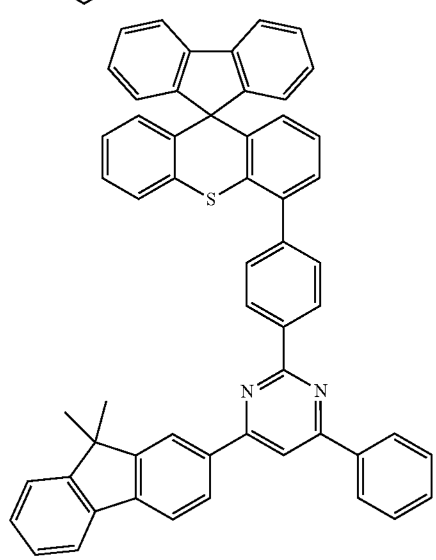

-continued
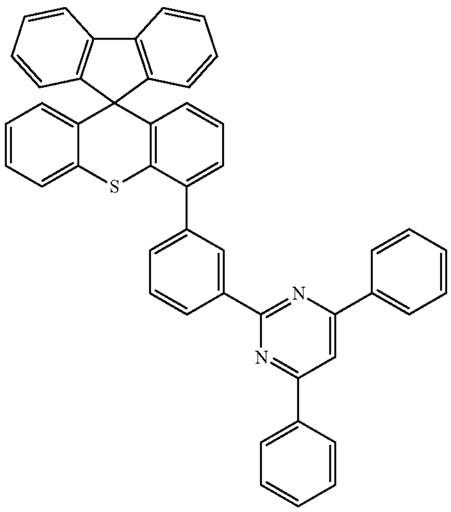
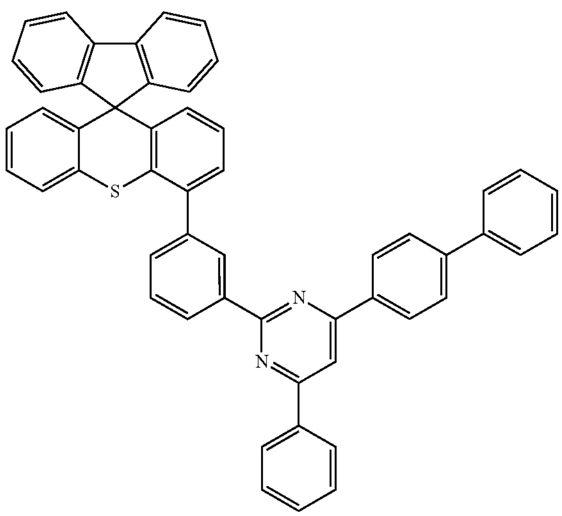
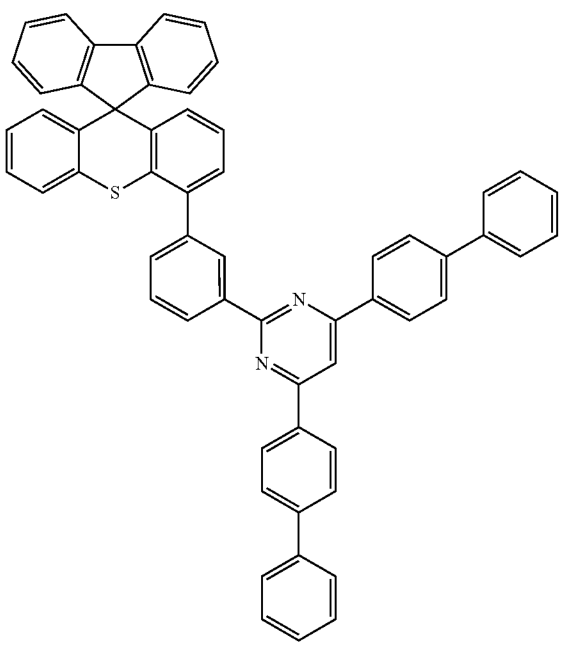
-continued
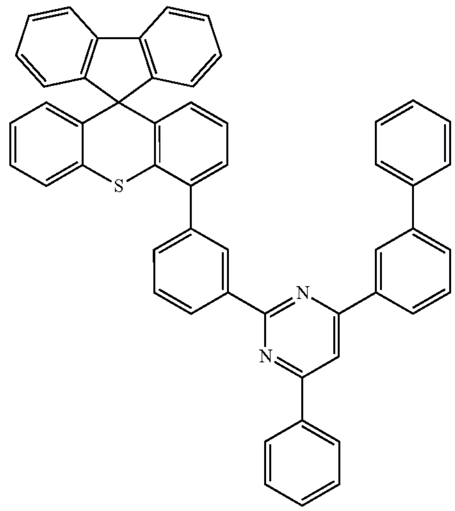
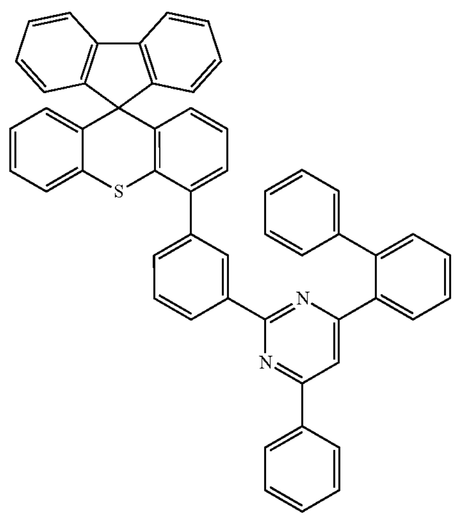
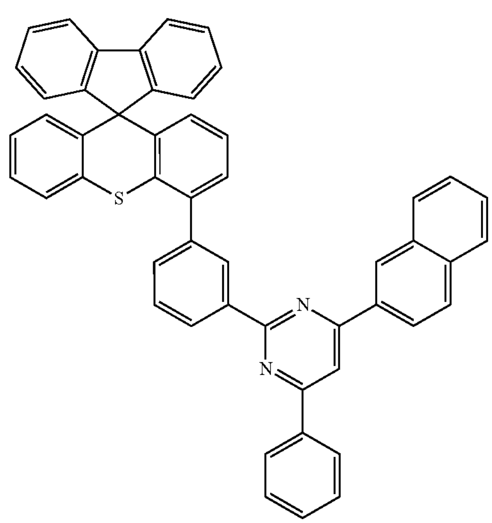

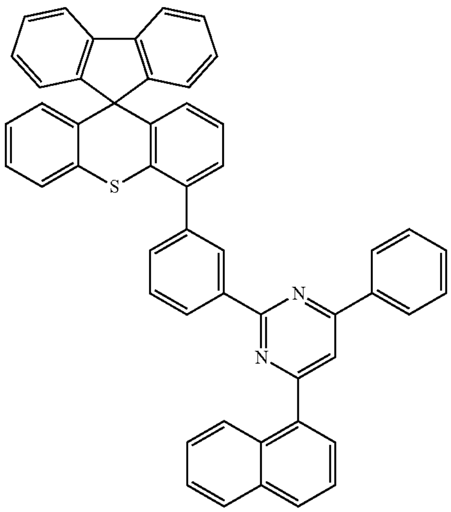
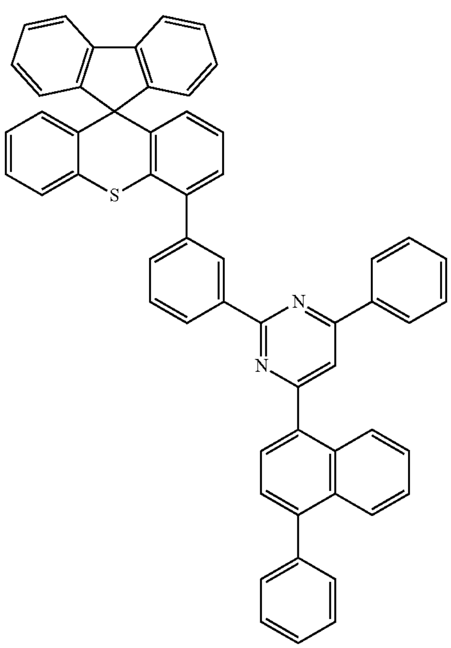
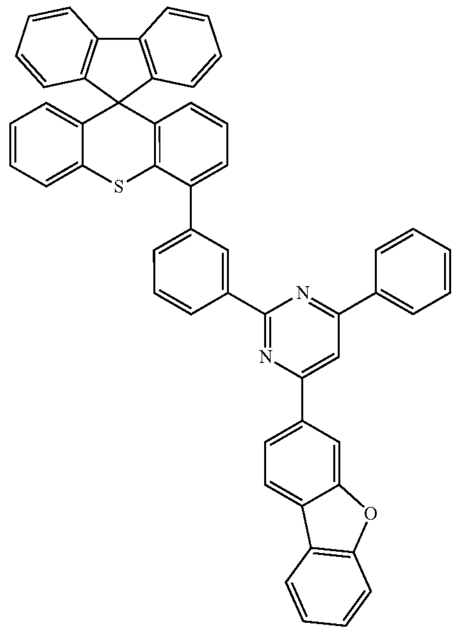
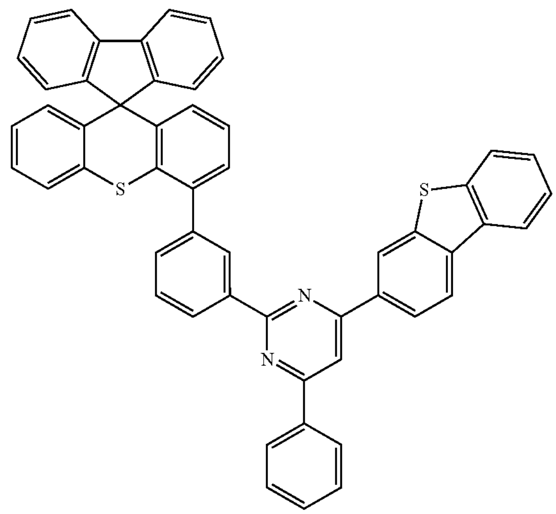
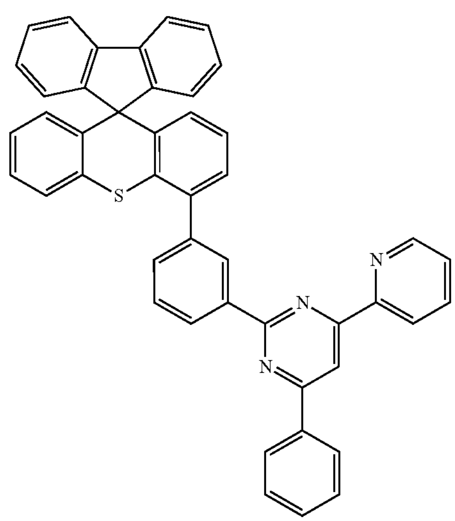

-continued
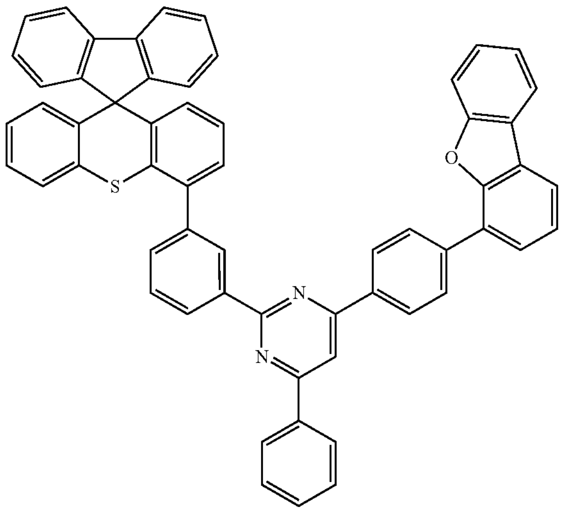
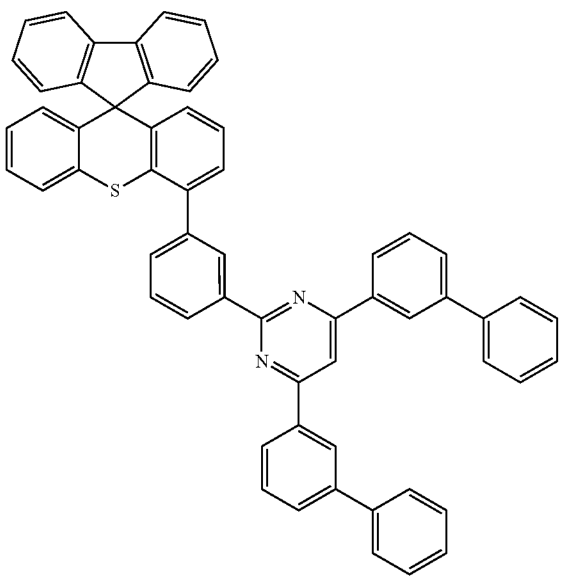
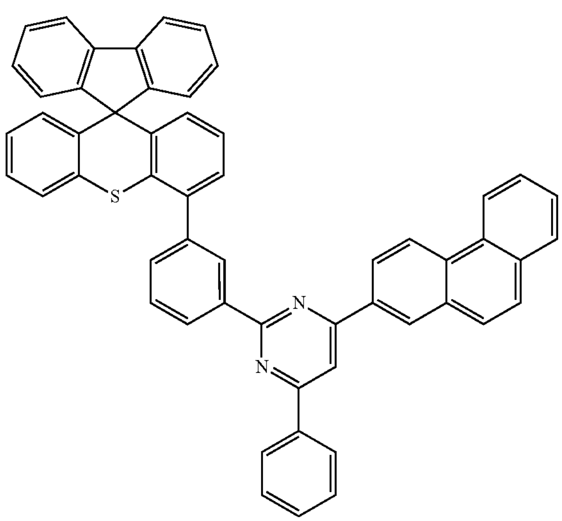
-continued
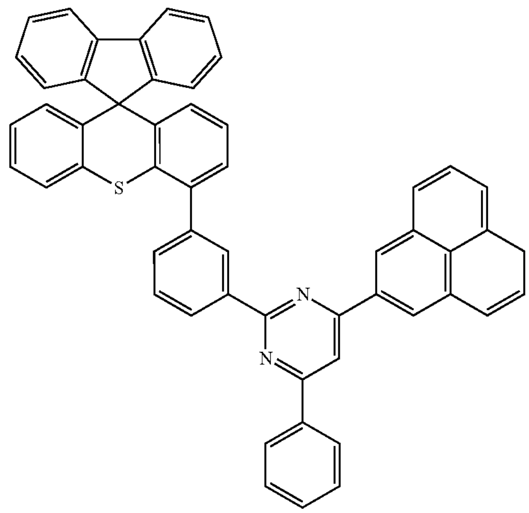
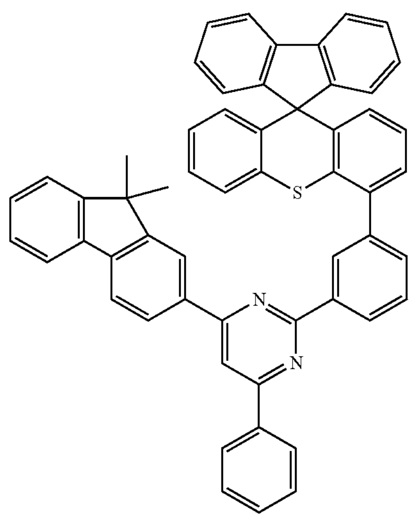
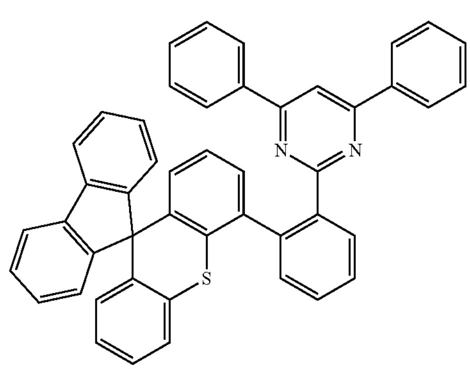

-continued
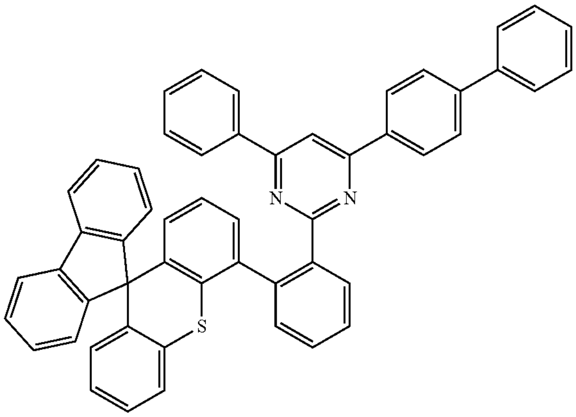
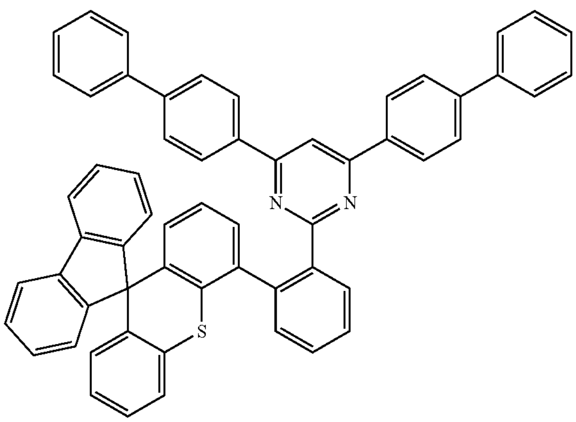
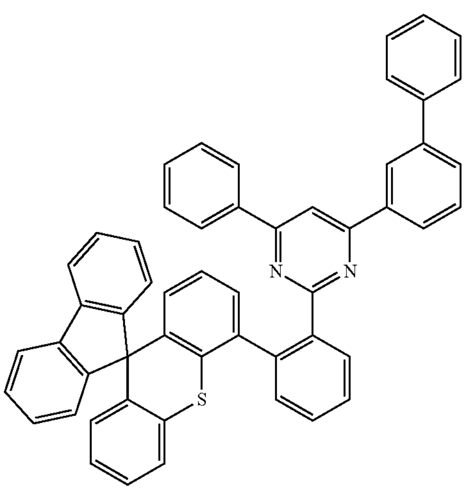
-continued
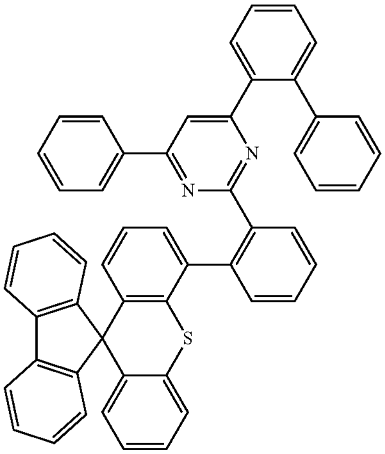
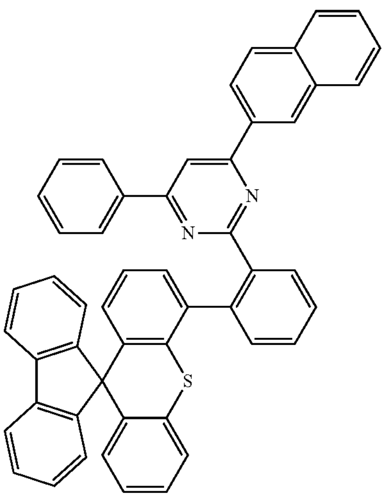
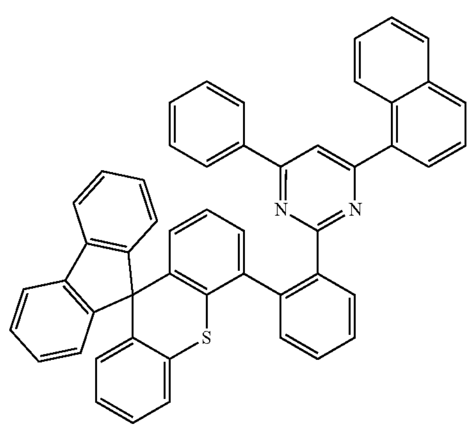

-continued
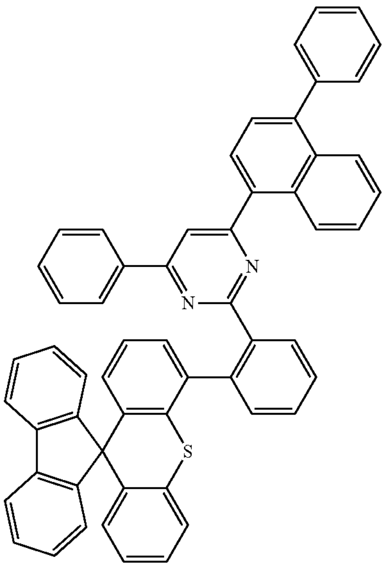
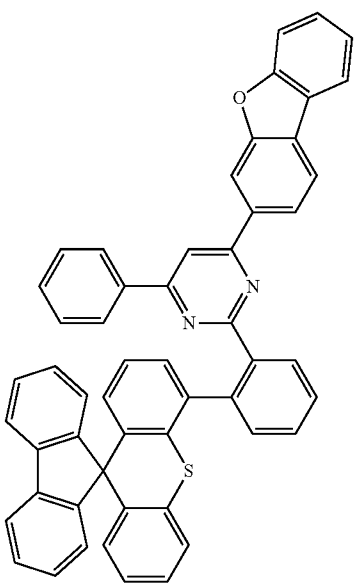
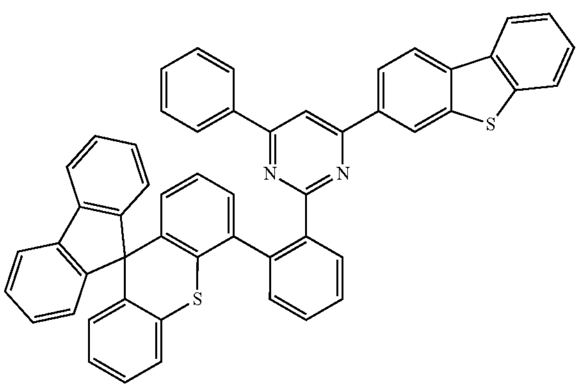
-continued
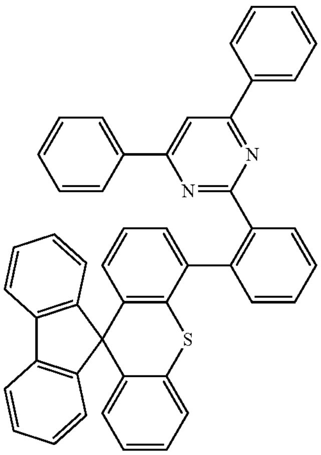
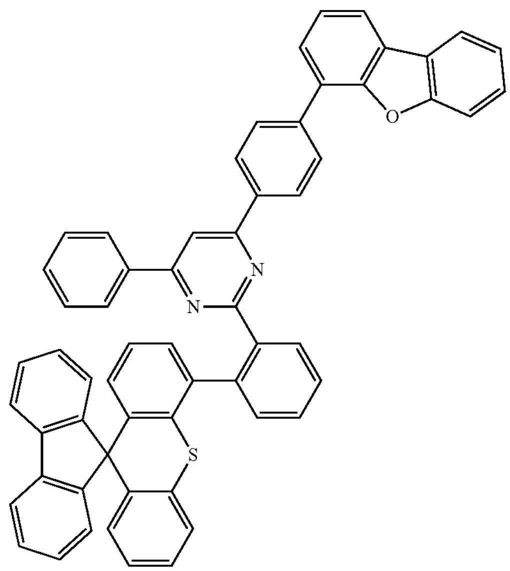
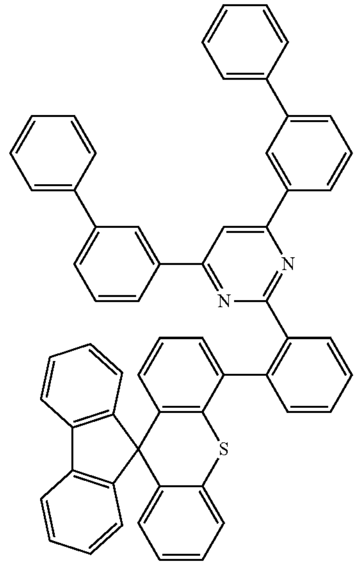

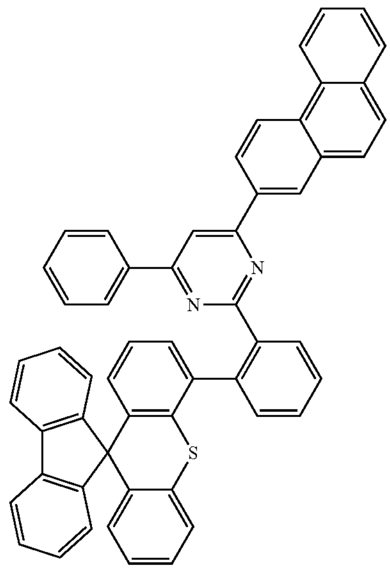
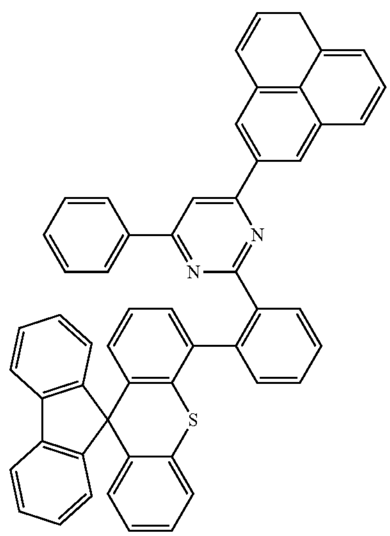
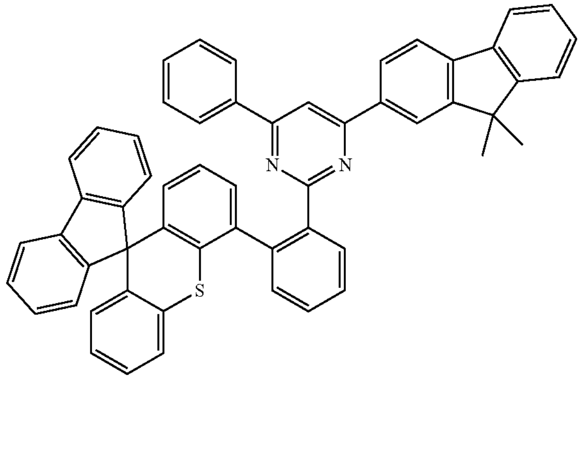
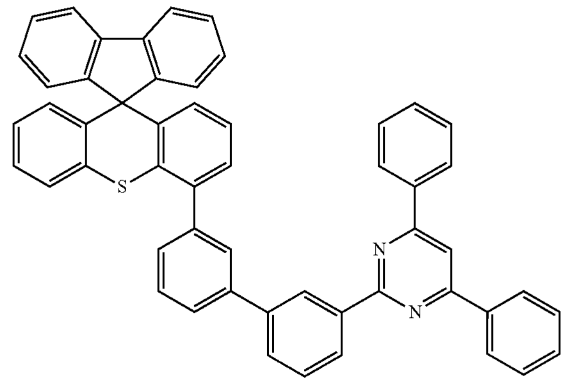
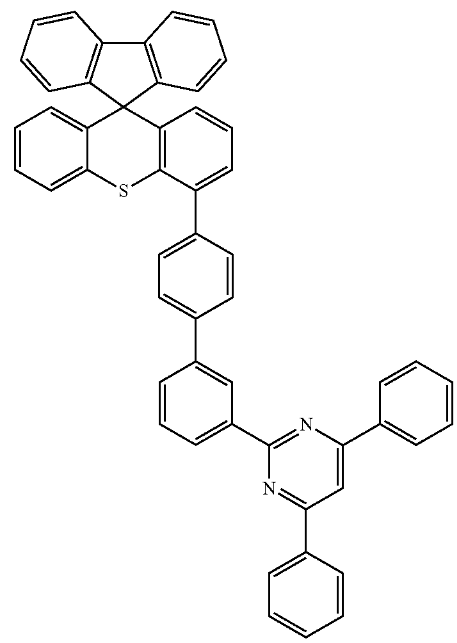
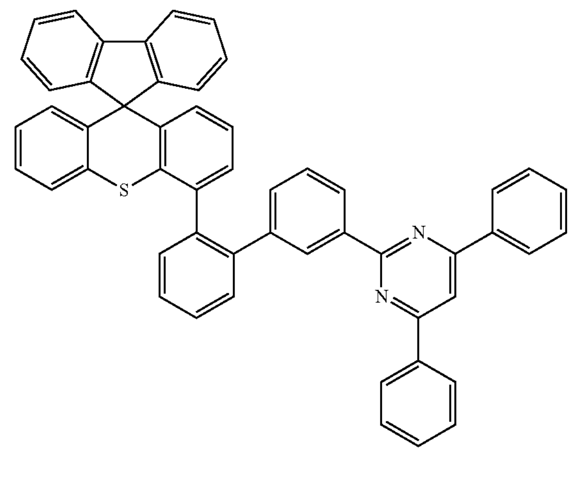

-continued
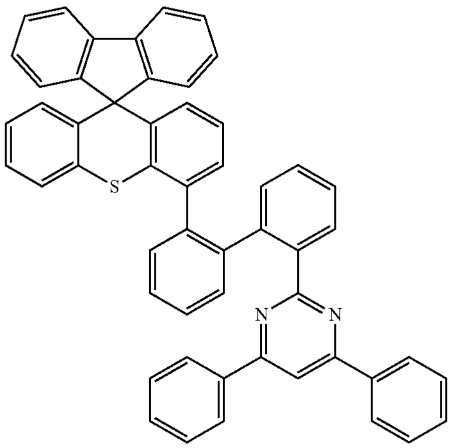
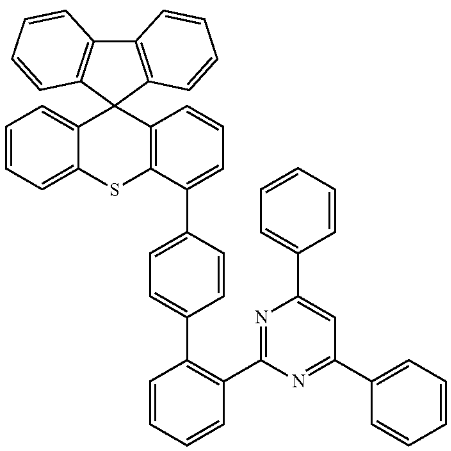
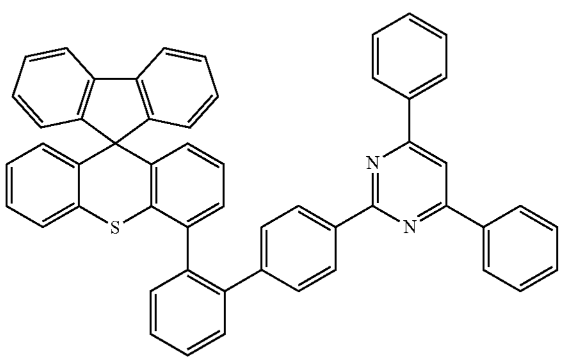
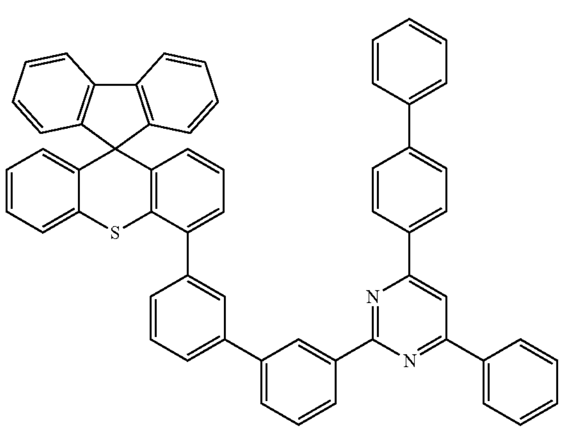
-continued
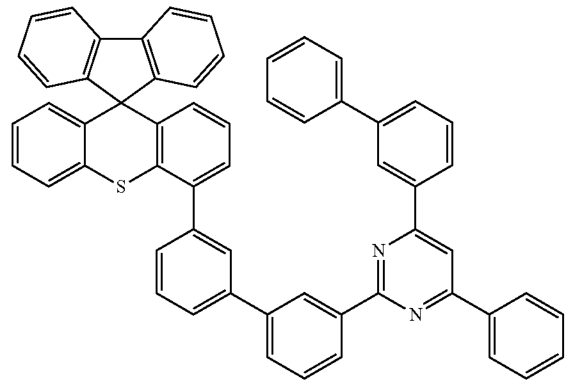
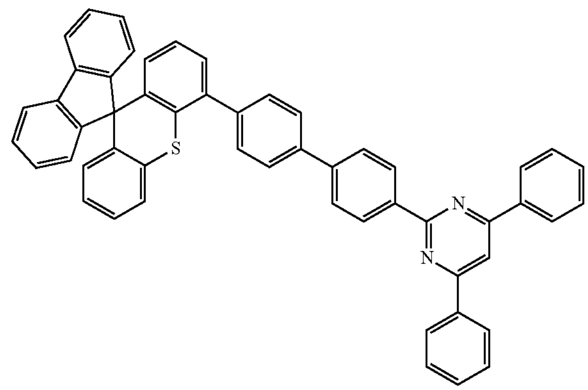
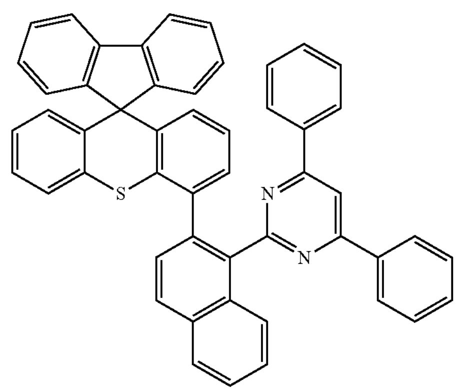
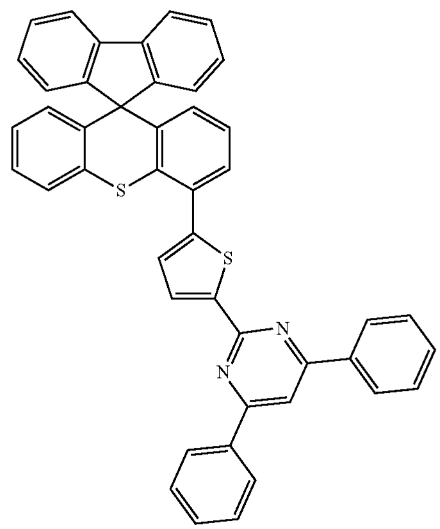

-continued
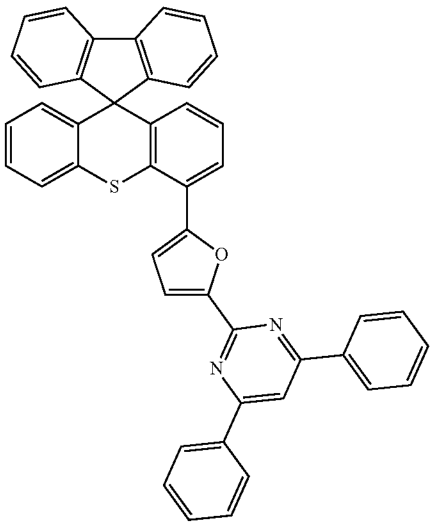
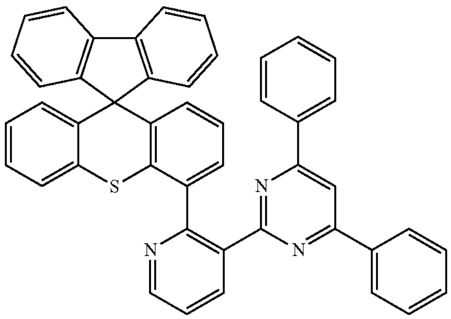
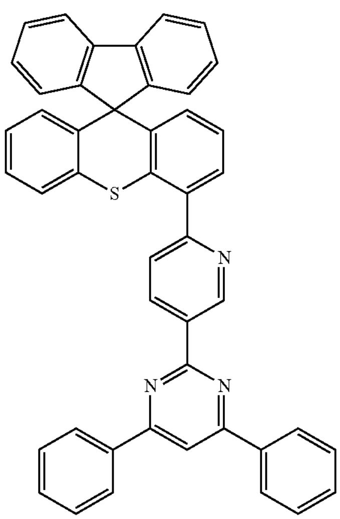
-continued
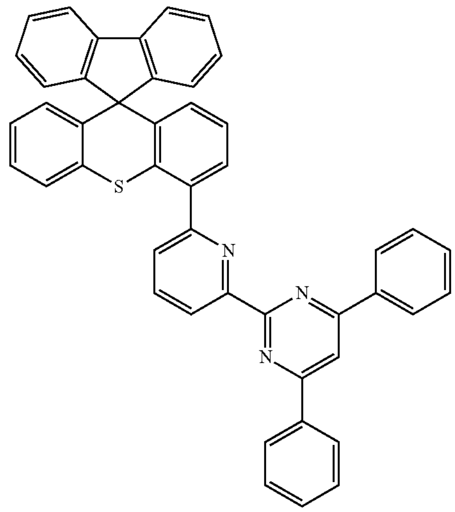
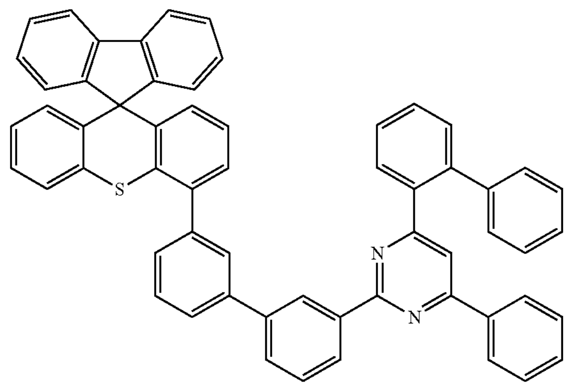
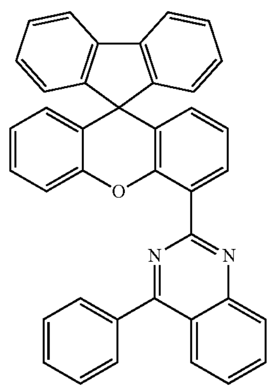
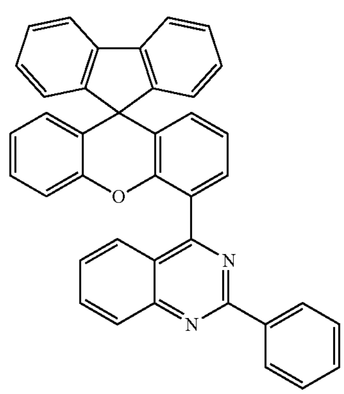

-continued
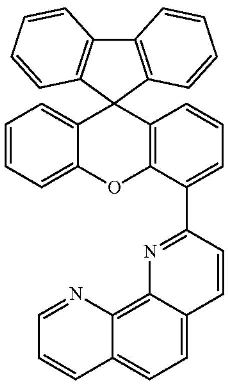
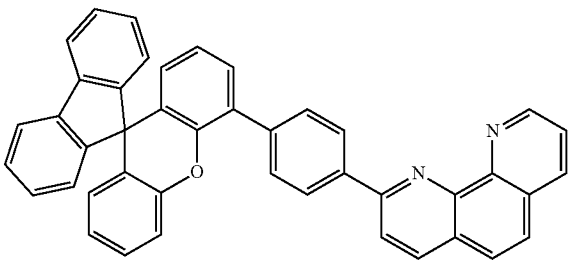
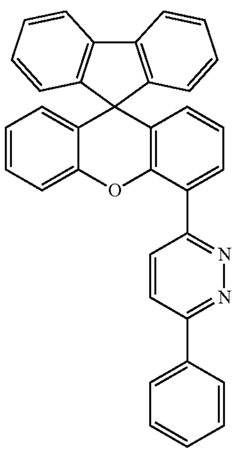
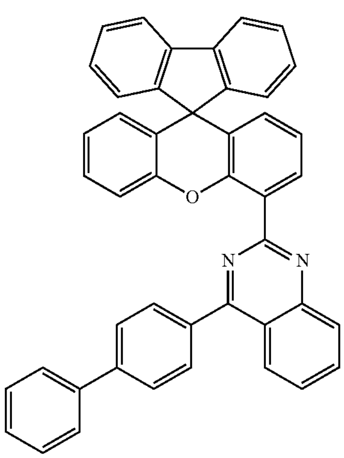
-continued
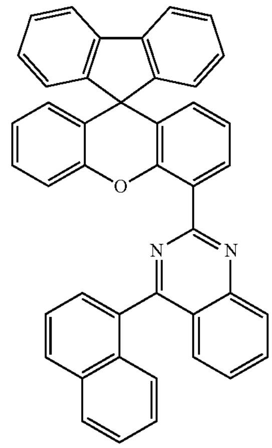
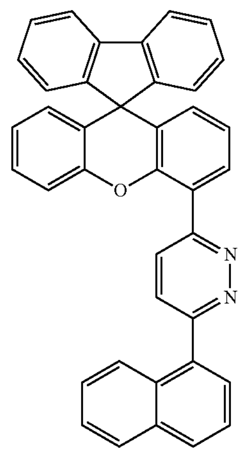
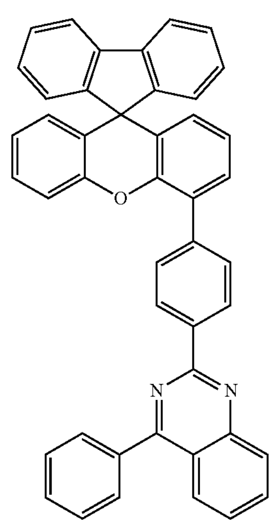

-continued
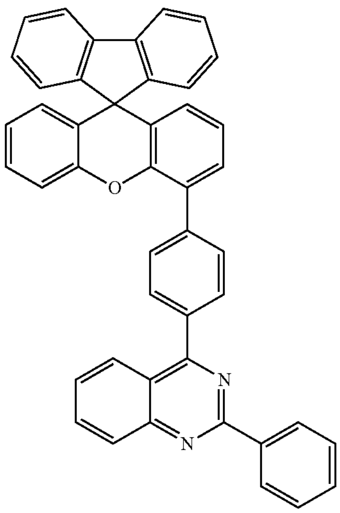
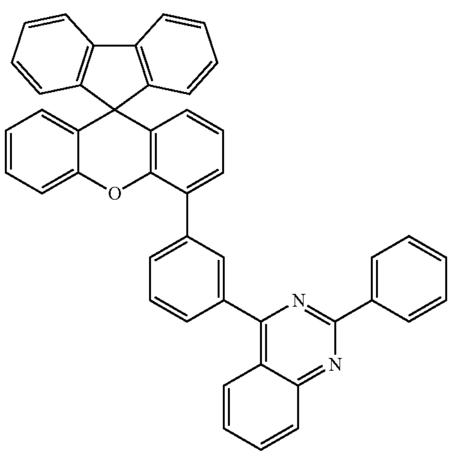
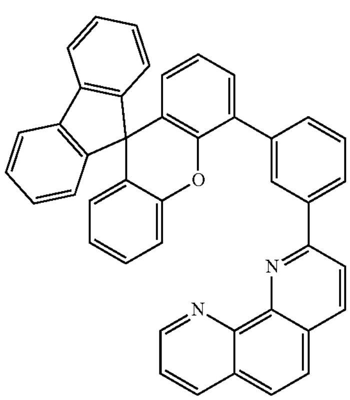
-continued
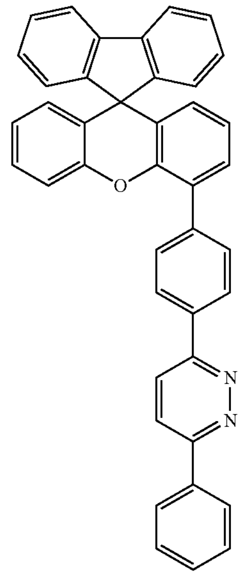
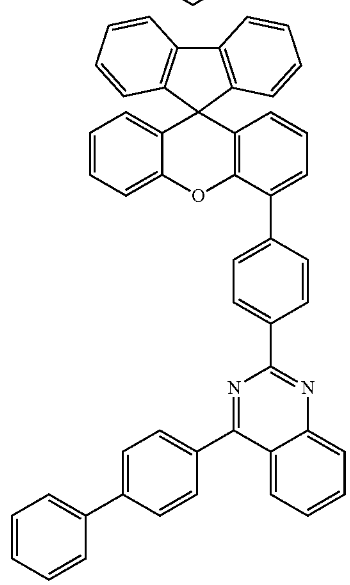
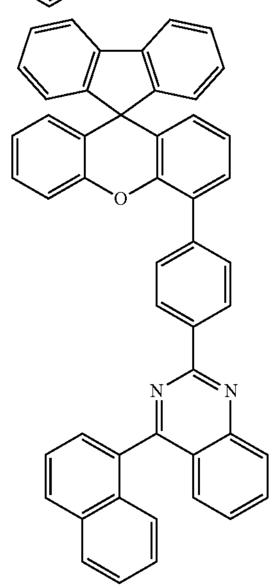

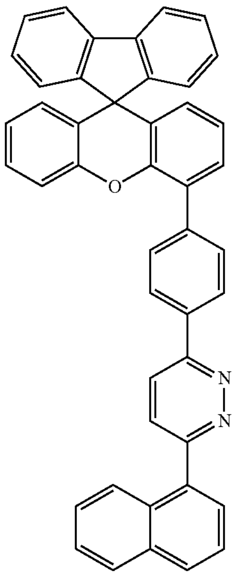
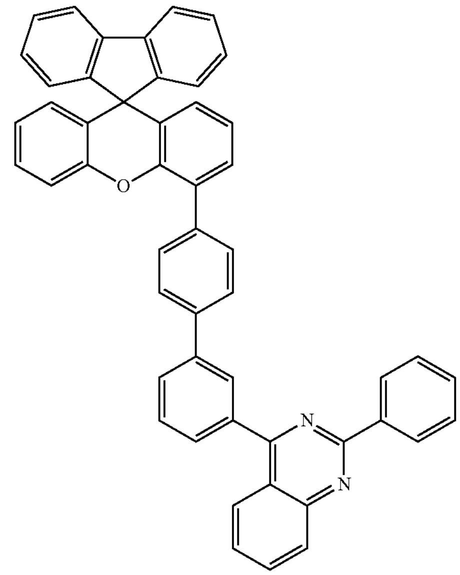
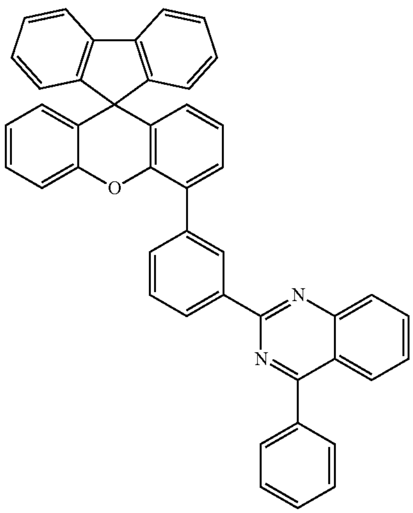
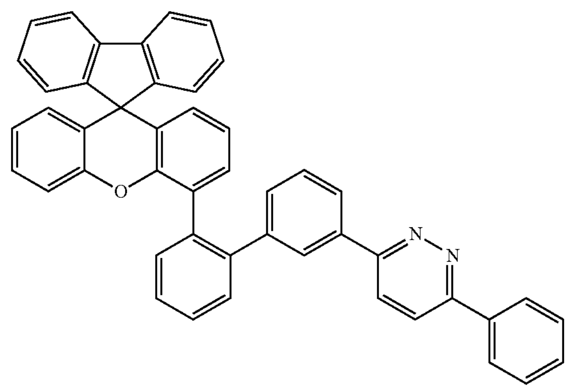
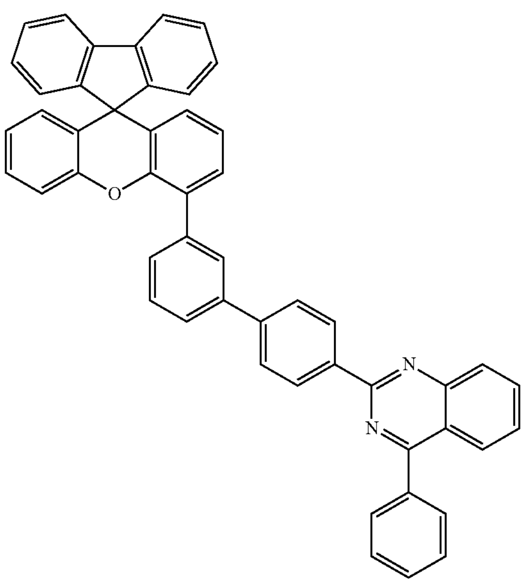
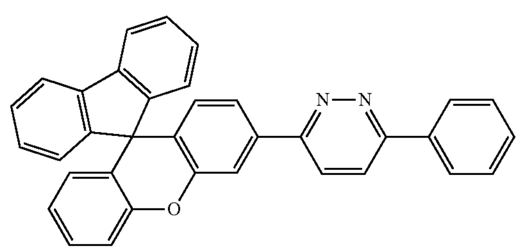

-continued
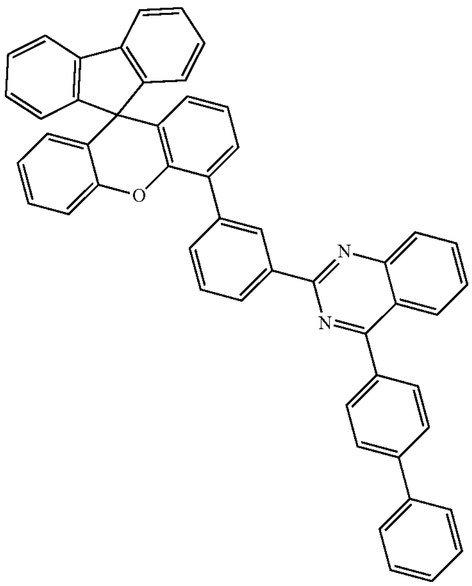
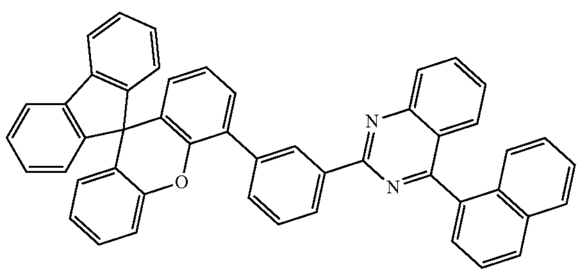
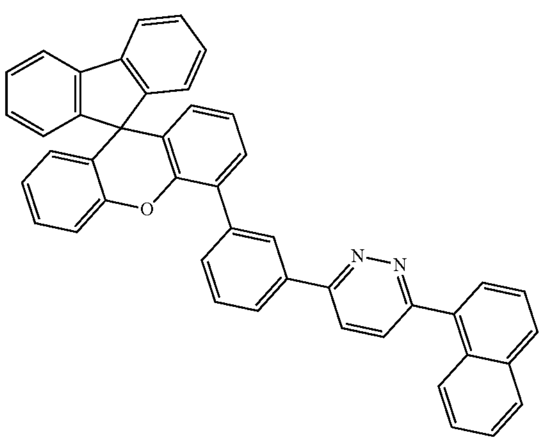
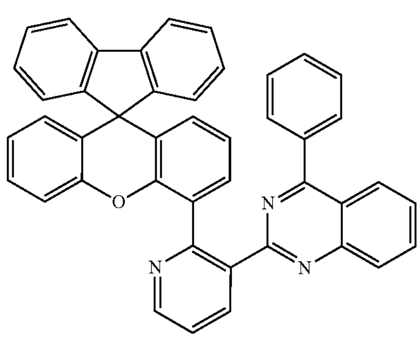
-continued
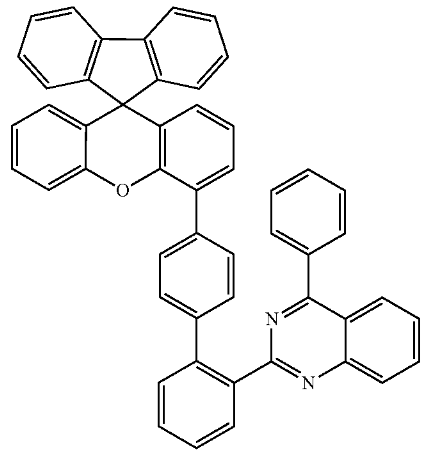
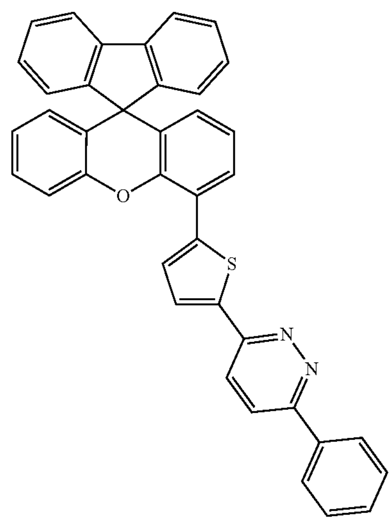
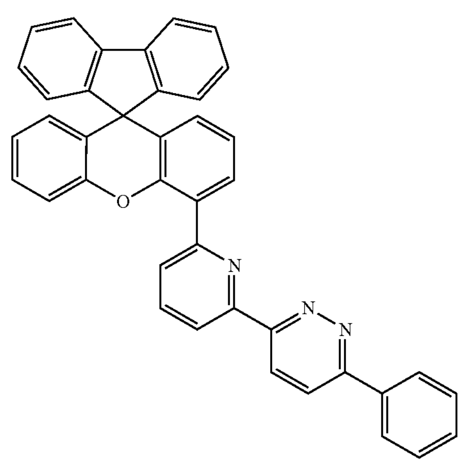

-continued
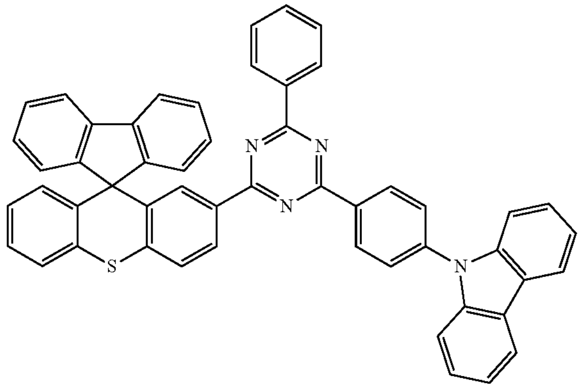
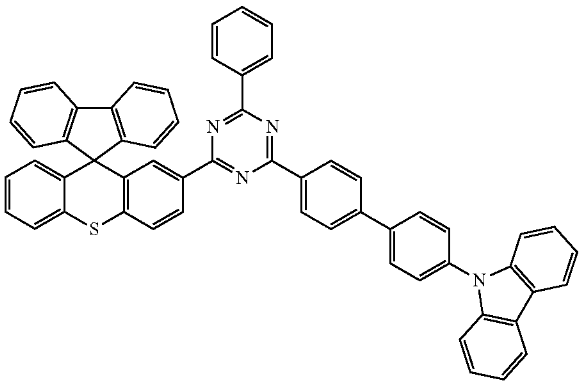
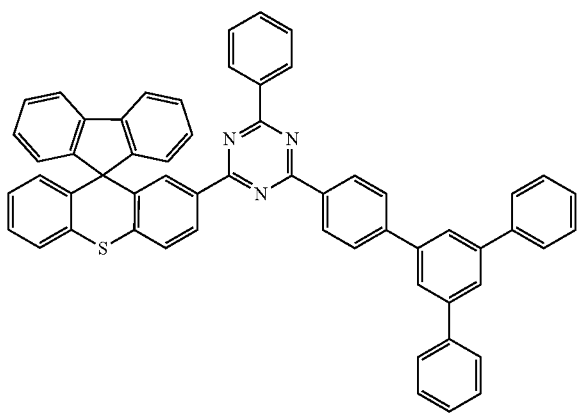
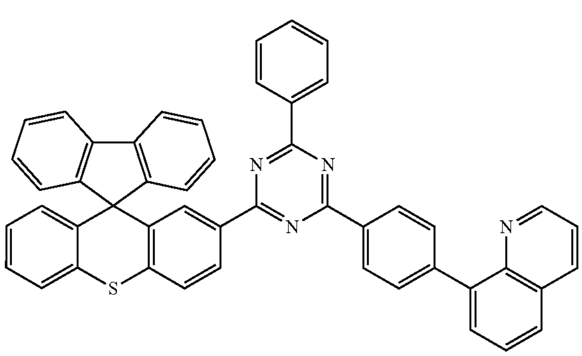
-continued
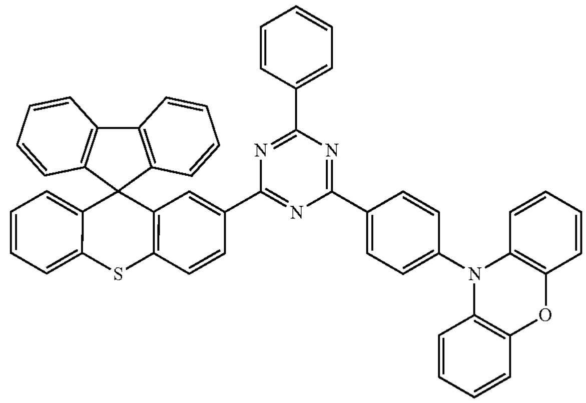
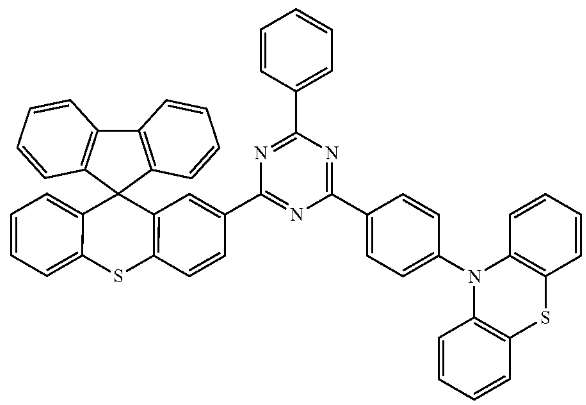
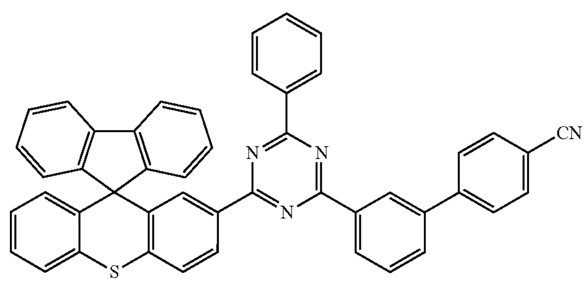
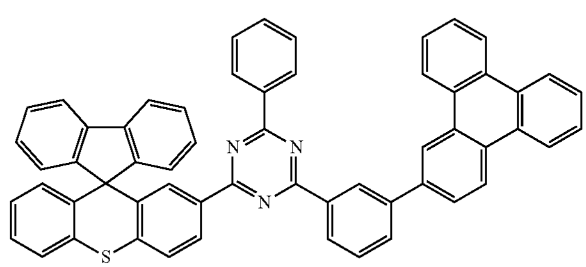
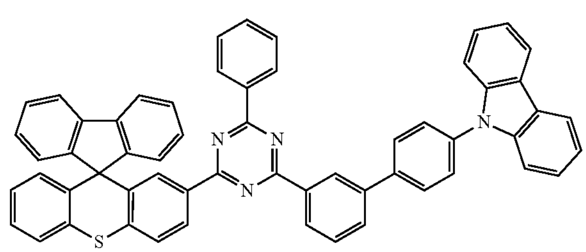

-continued
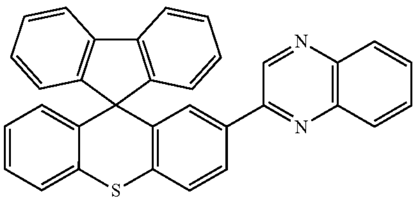
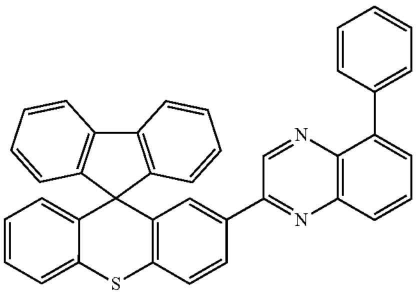
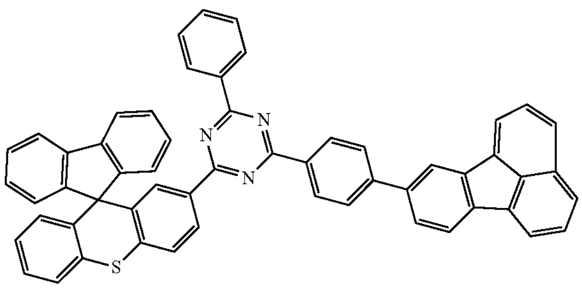
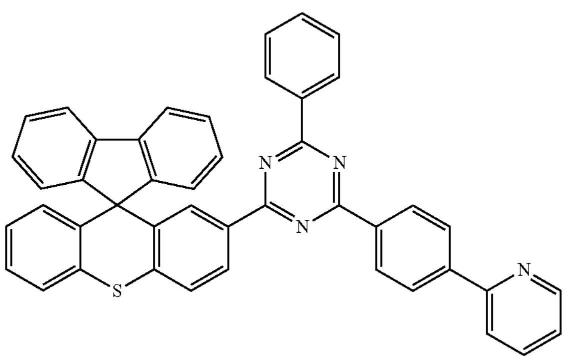
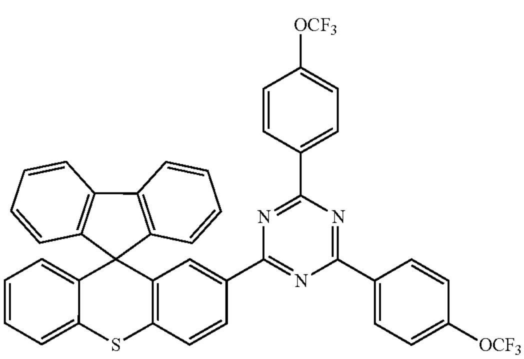
-continued
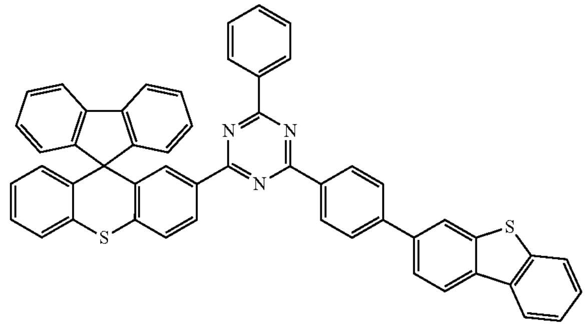
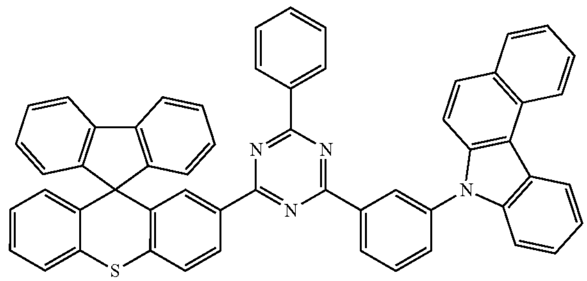
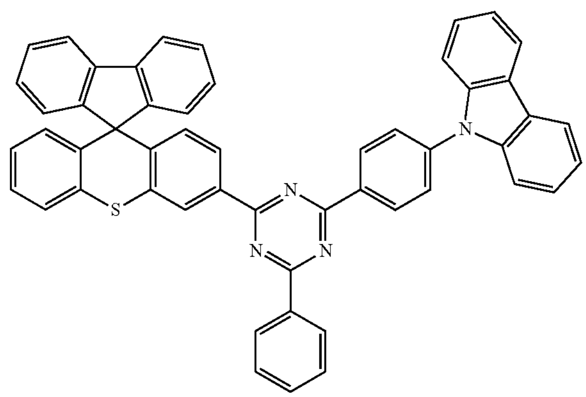
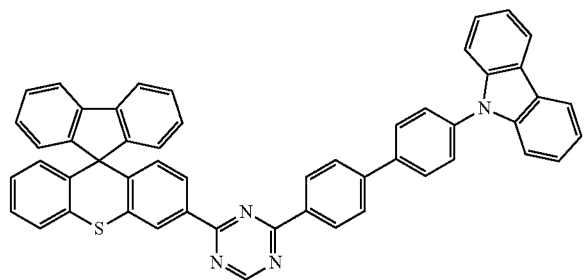

-continued
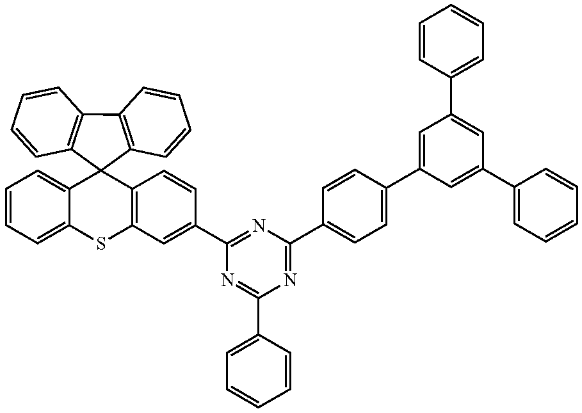
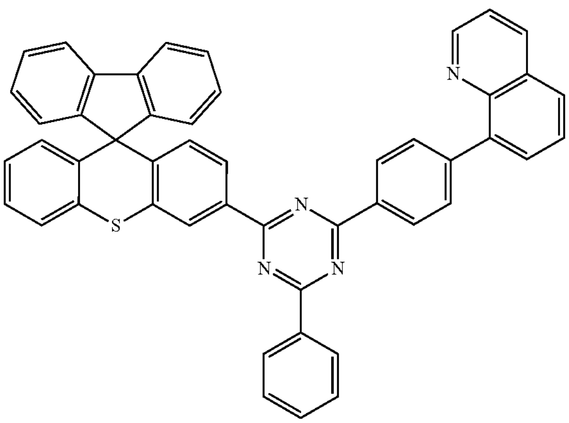
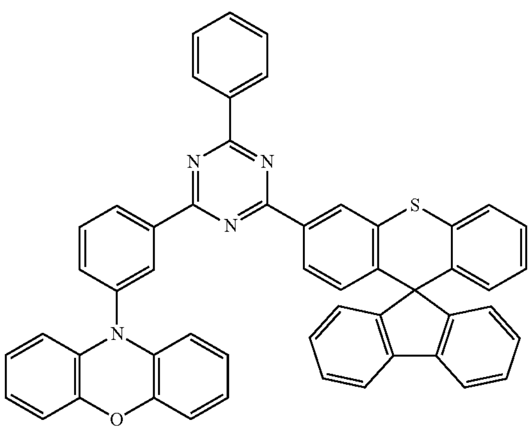
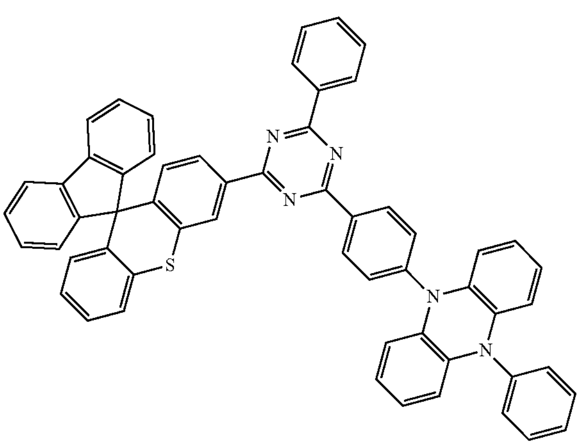
-continued
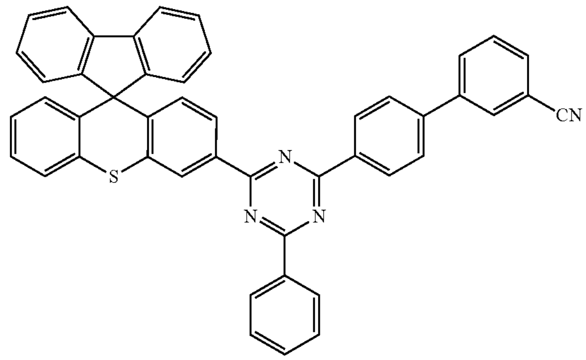
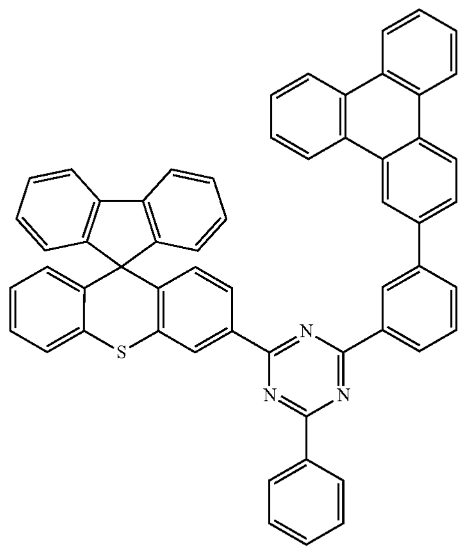
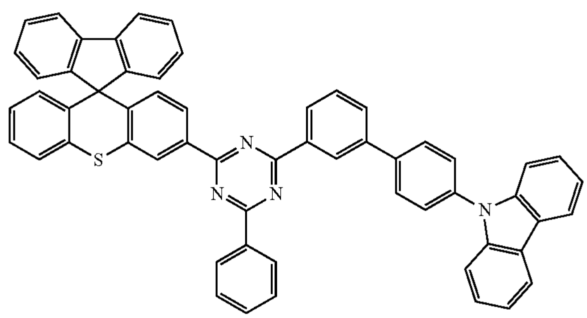
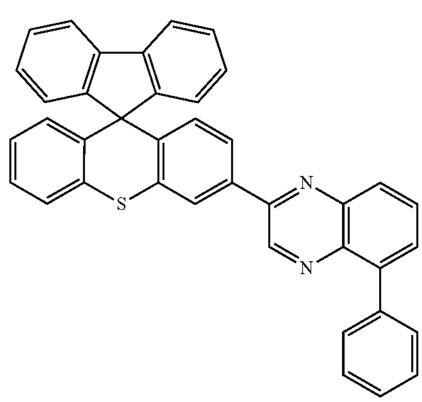

-continued
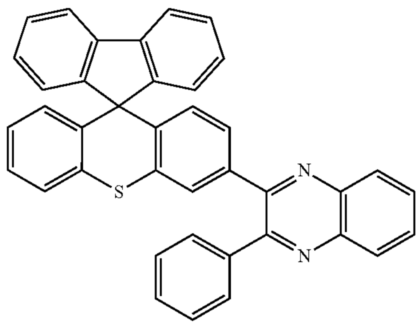
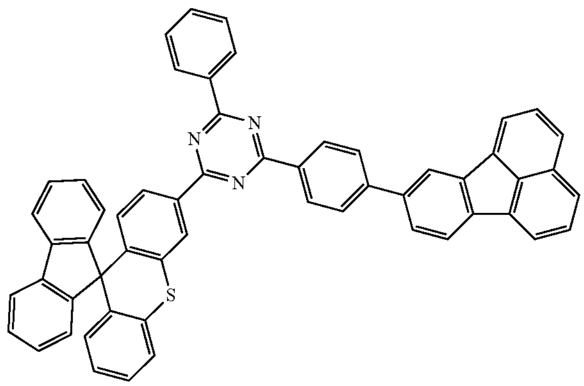
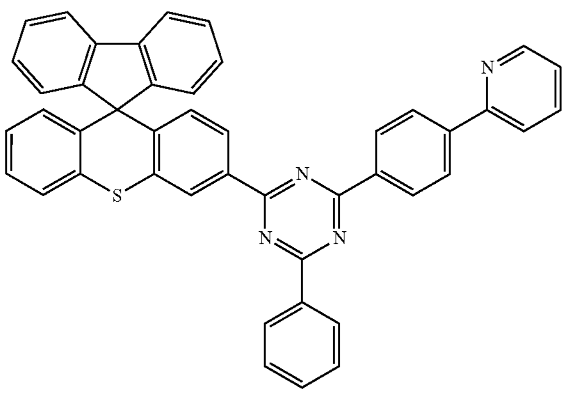
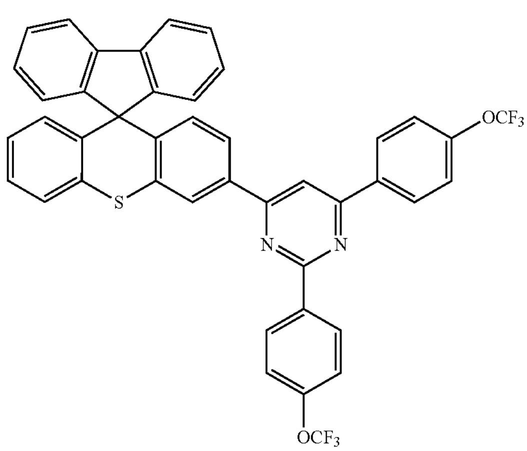
-continued
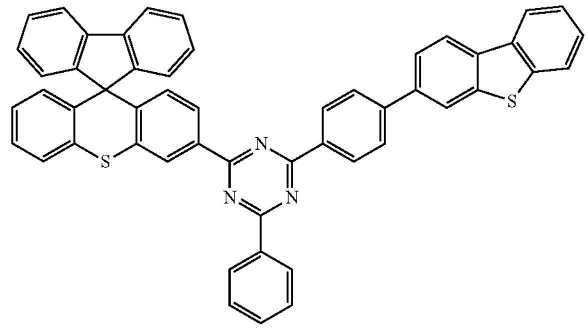
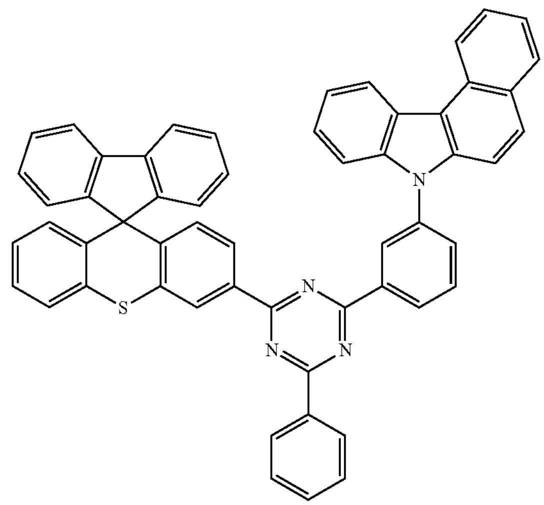
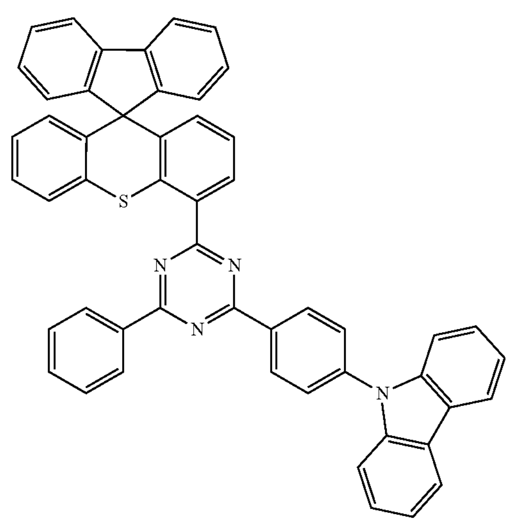

-continued
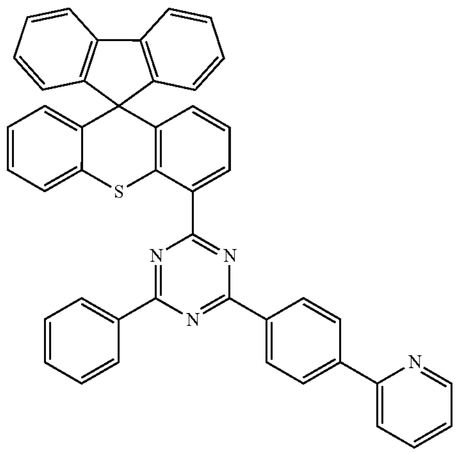
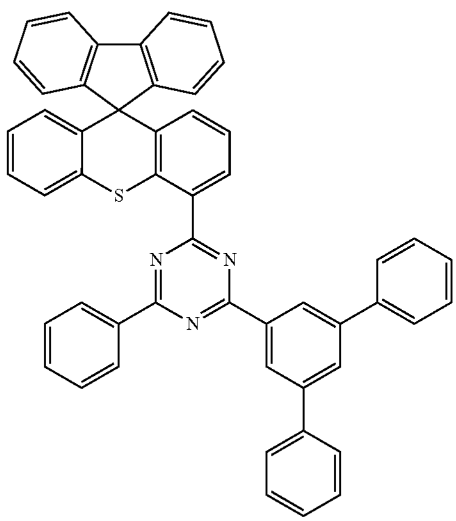
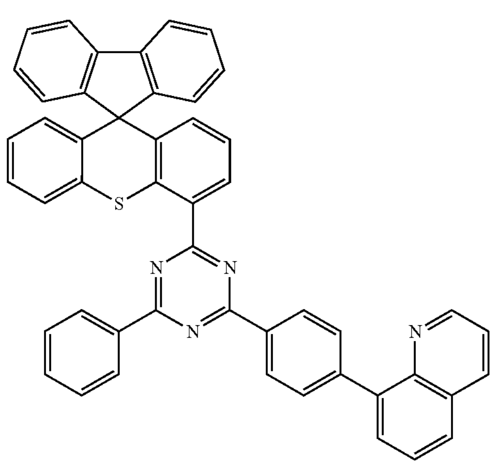
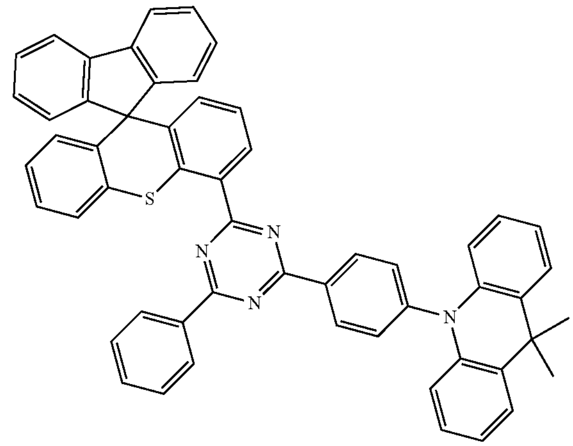
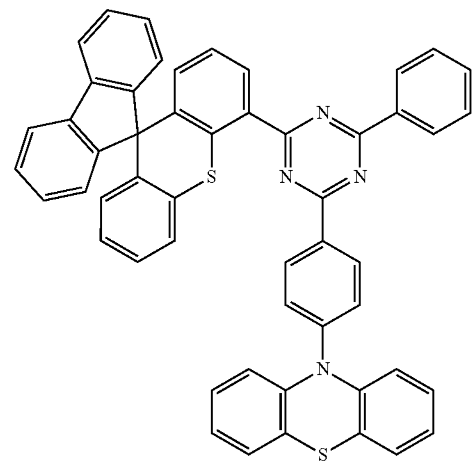
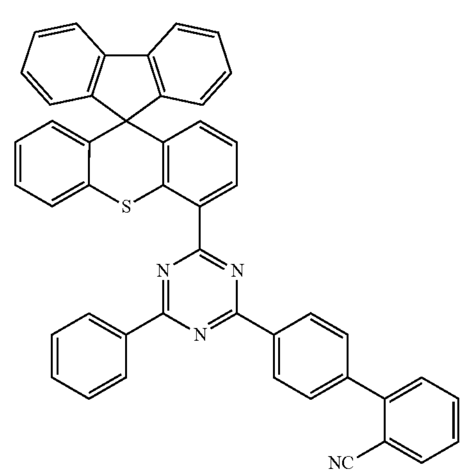

-continued
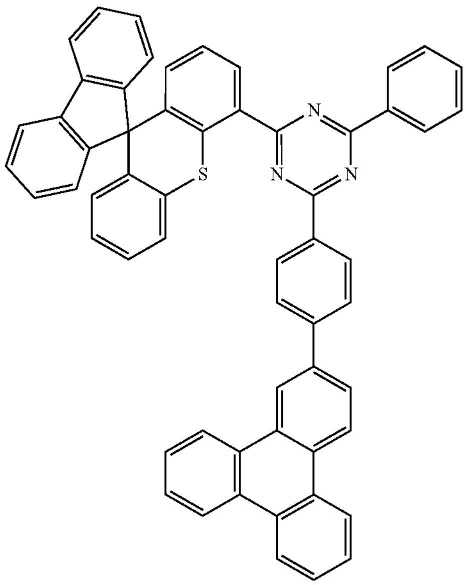
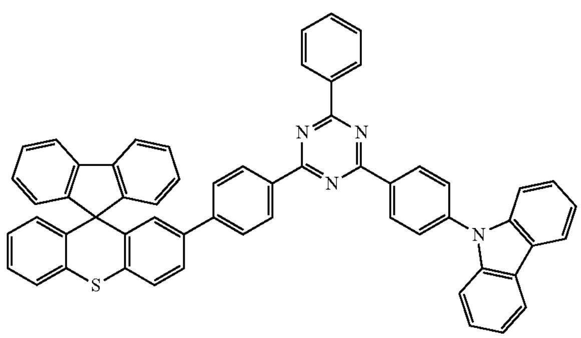
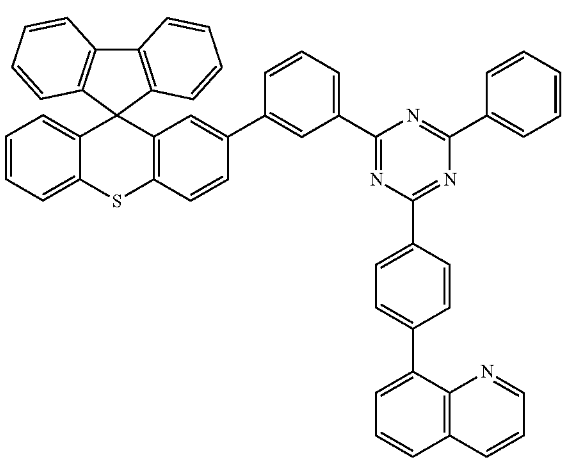
-continued
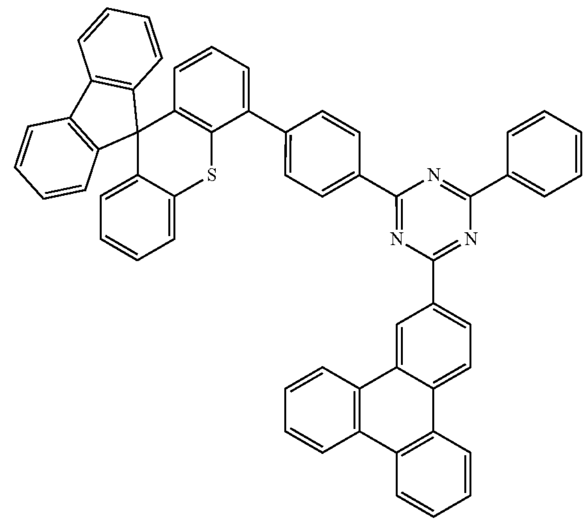
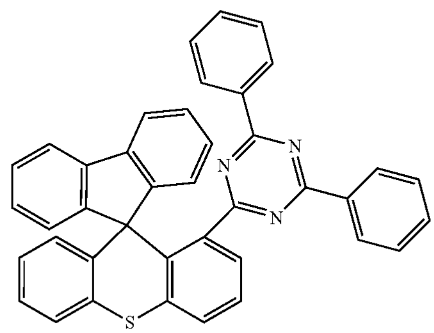
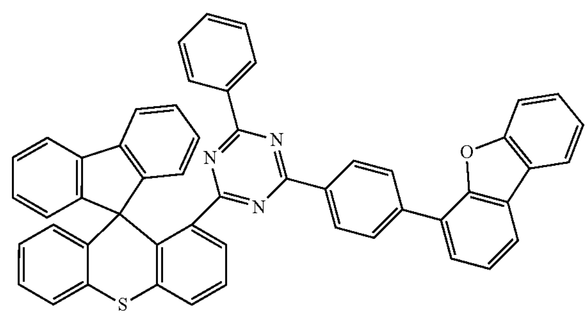
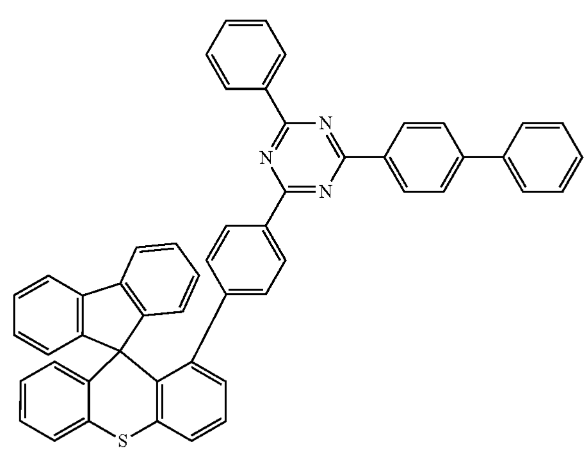

-continued
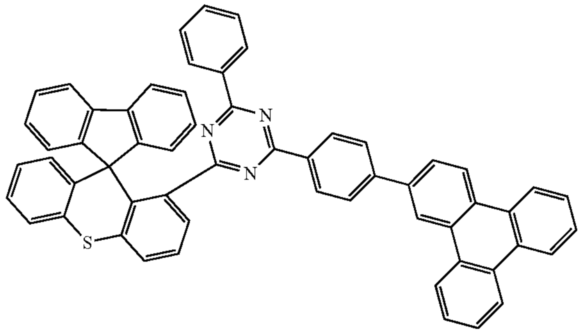
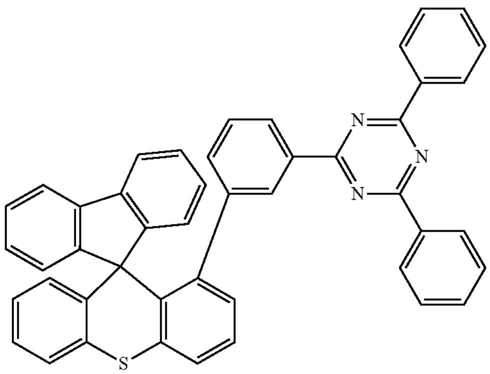
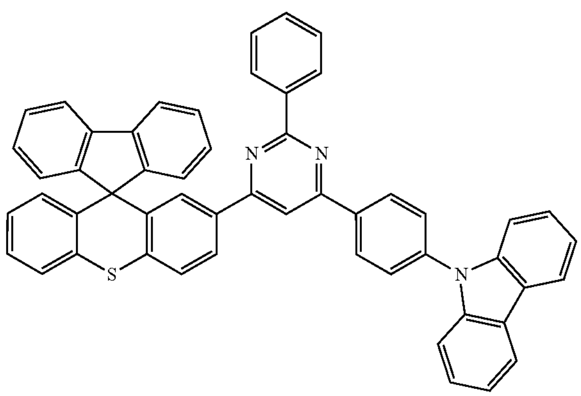
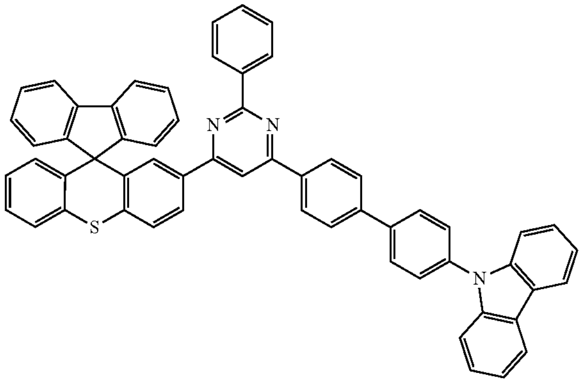
-continued
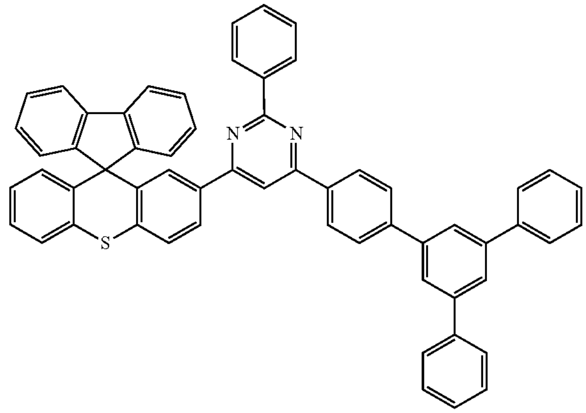
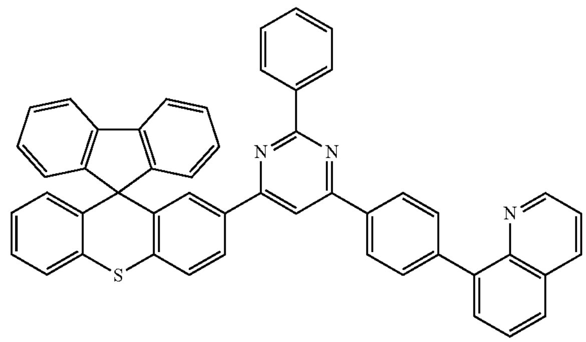
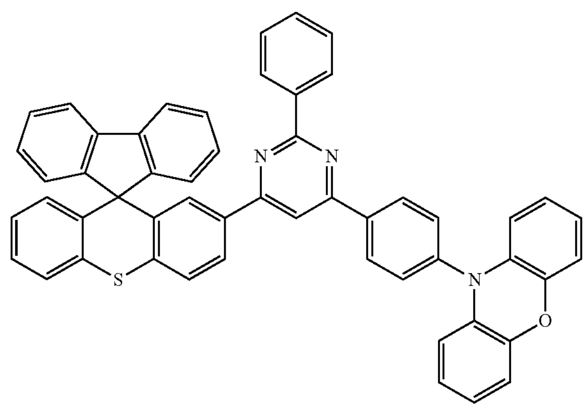
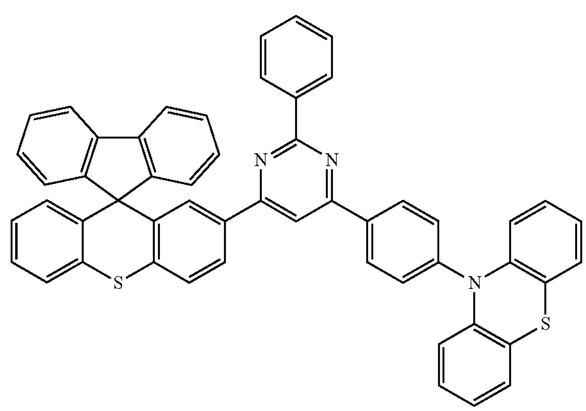

-continued
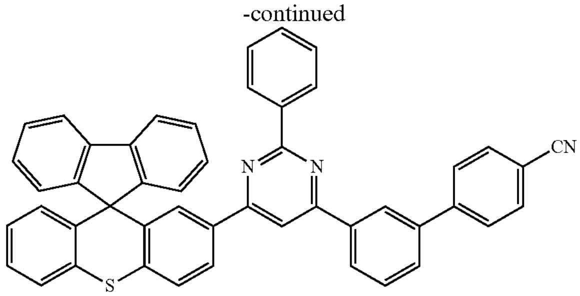
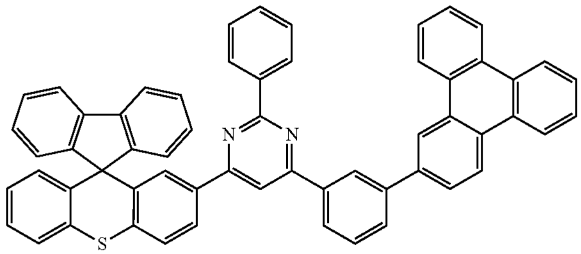
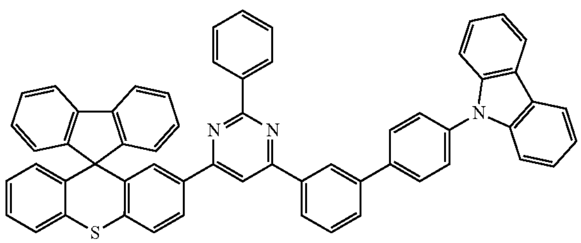
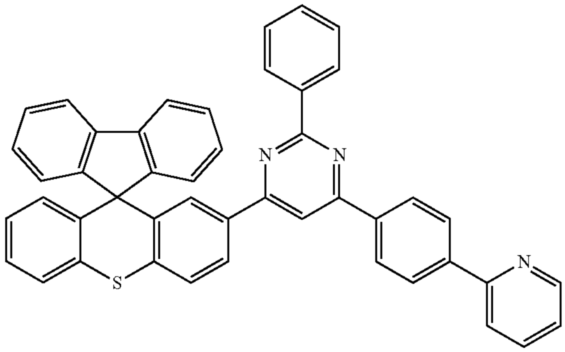
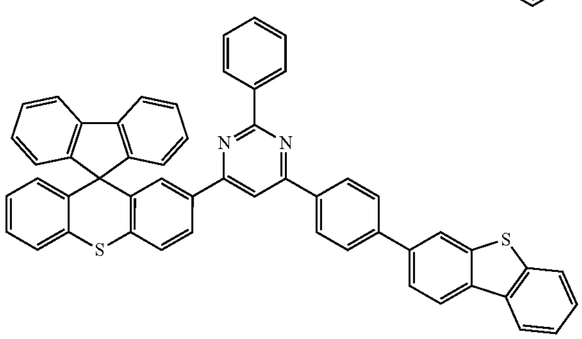
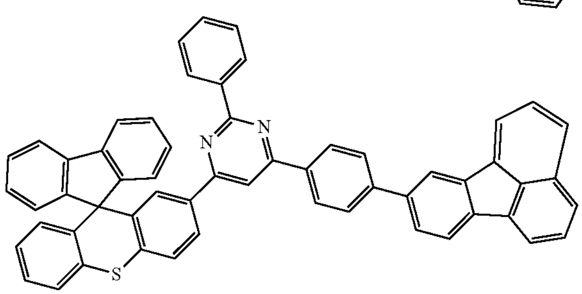
-continued
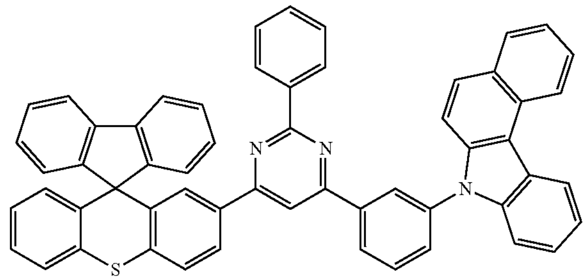
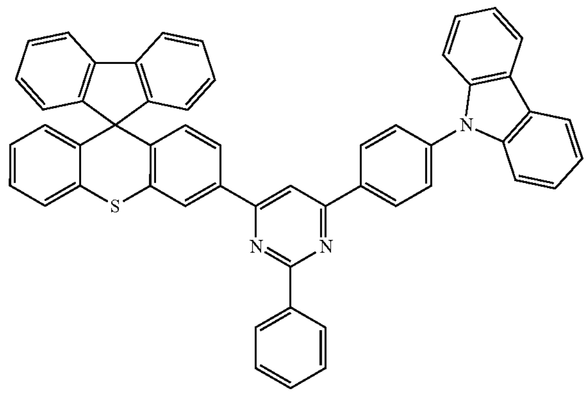
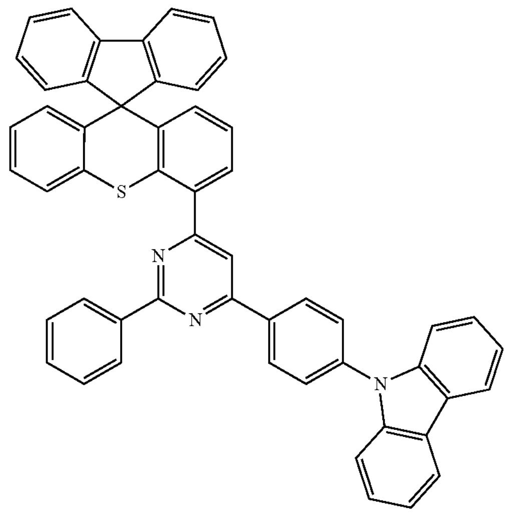
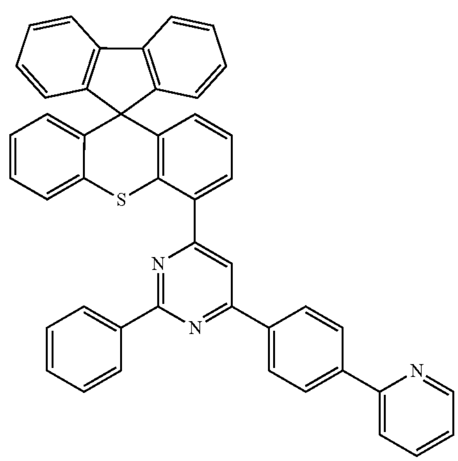

-continued
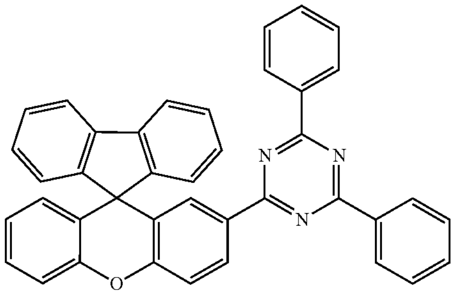
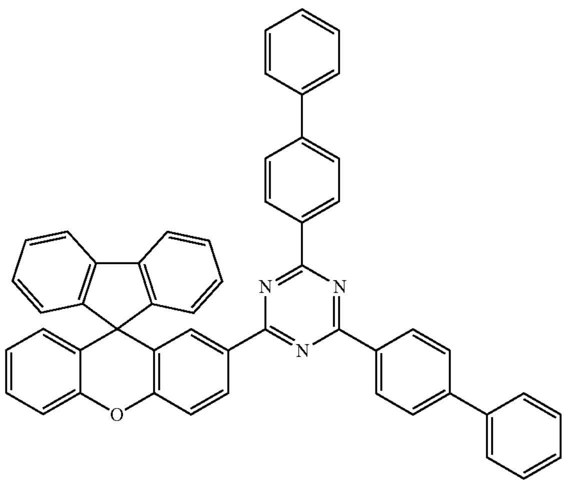
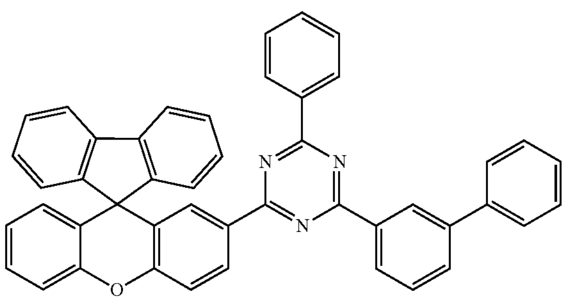
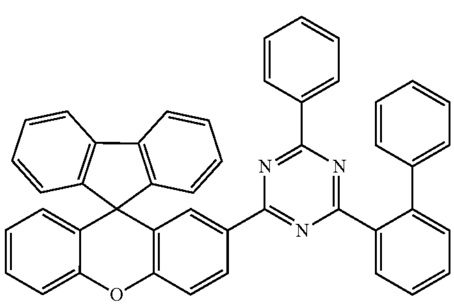
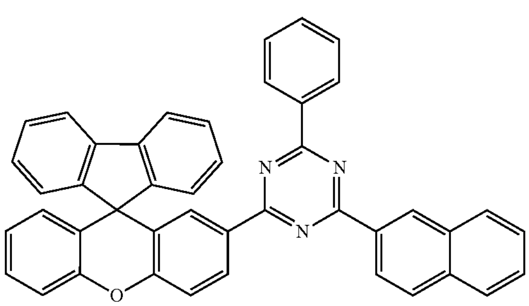
-continued
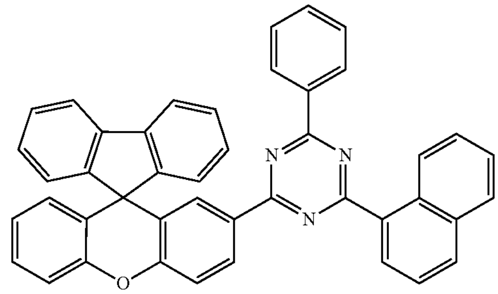
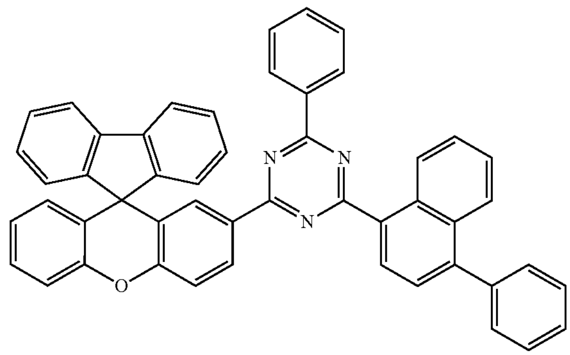
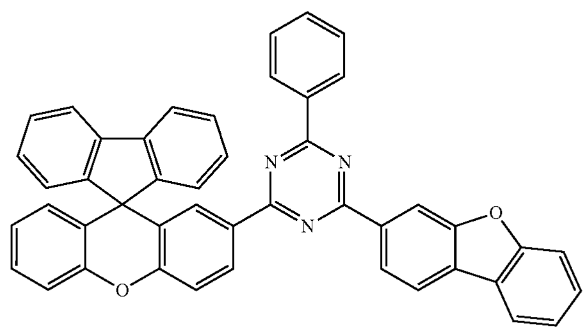
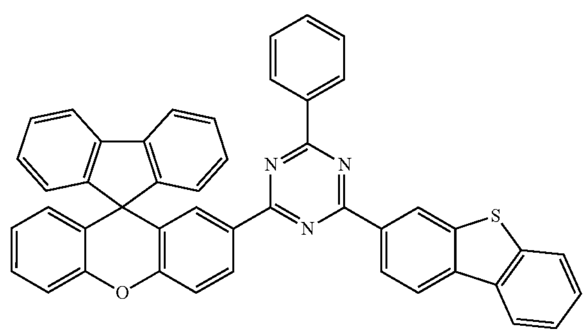
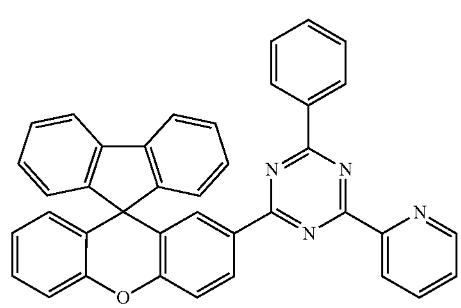

-continued
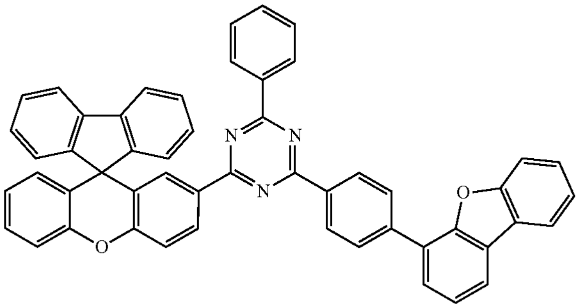
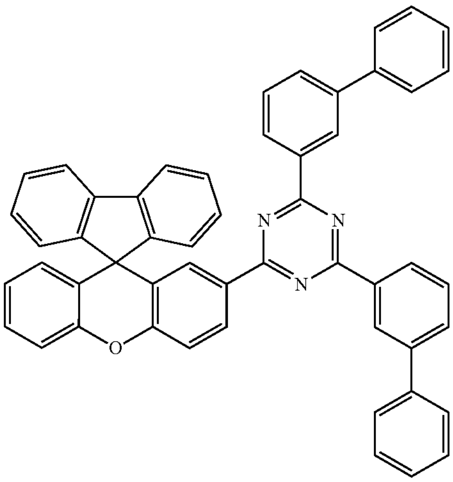
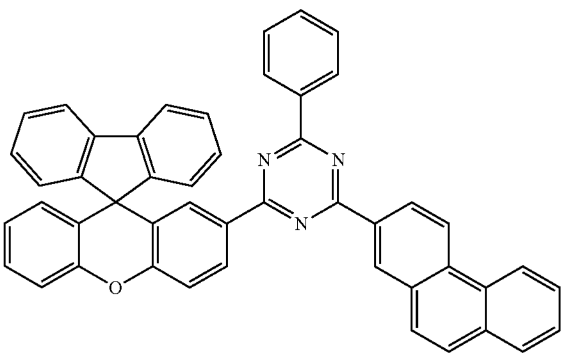
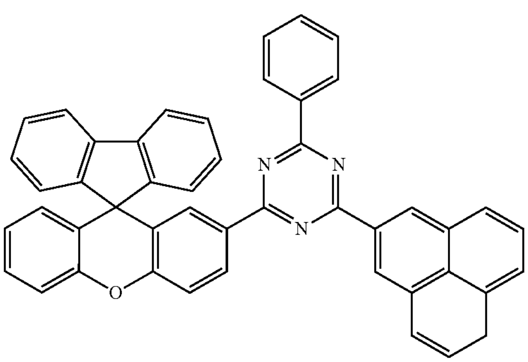
-continued
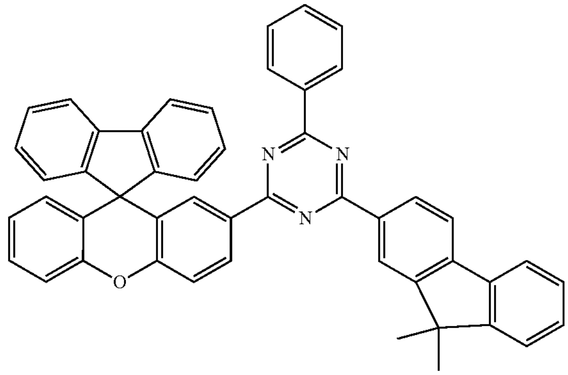
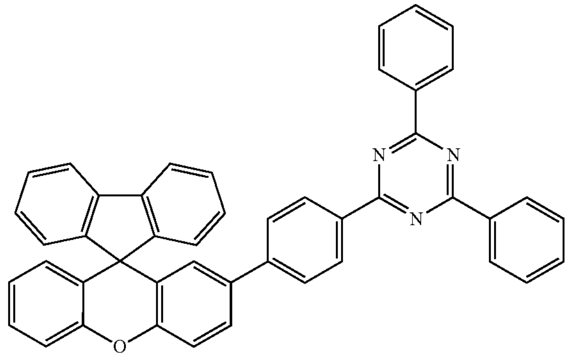
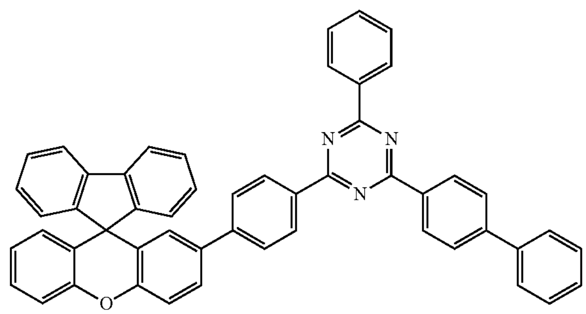
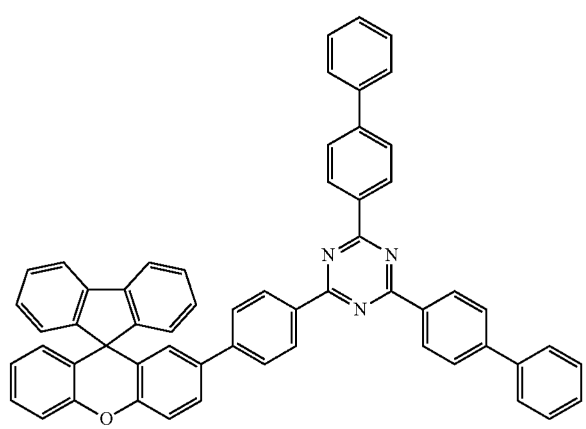

-continued
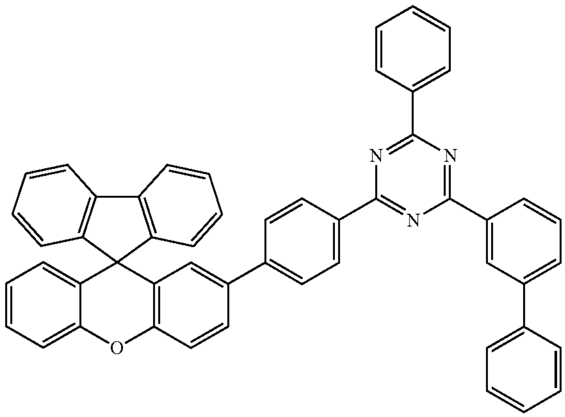
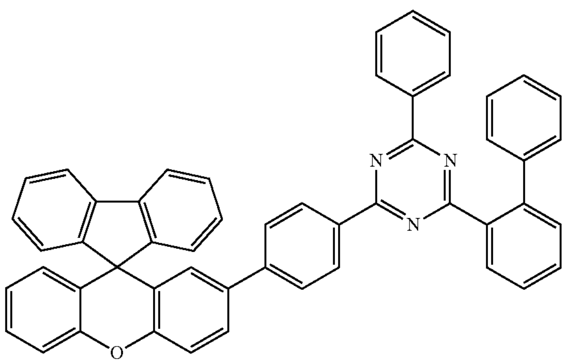
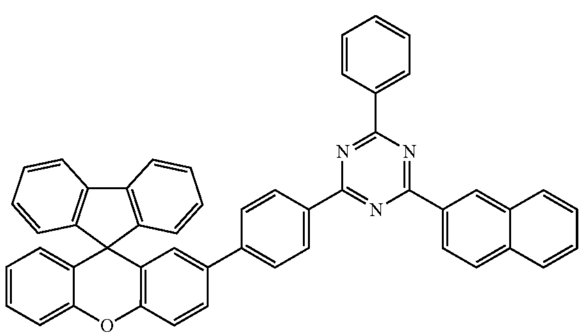
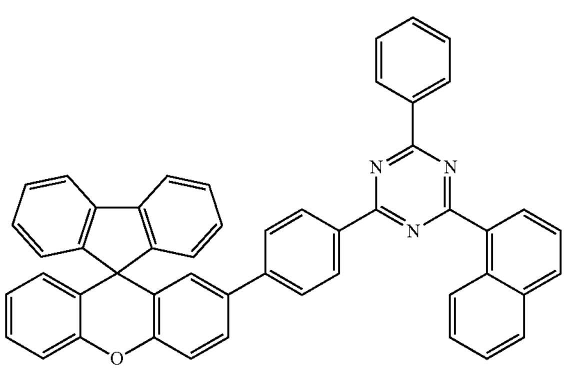
-continued
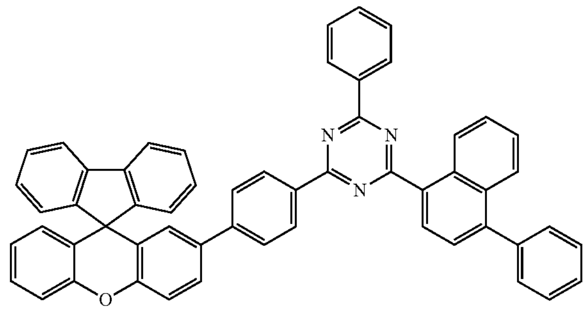
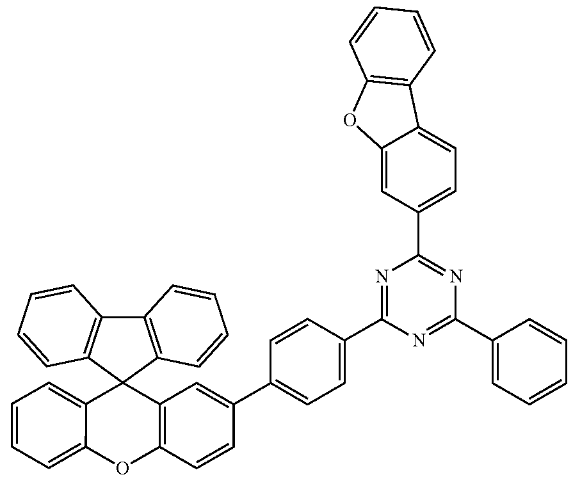
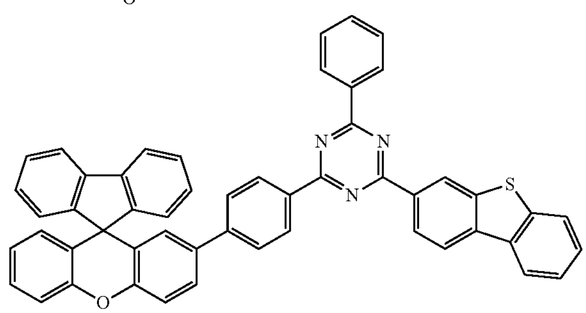
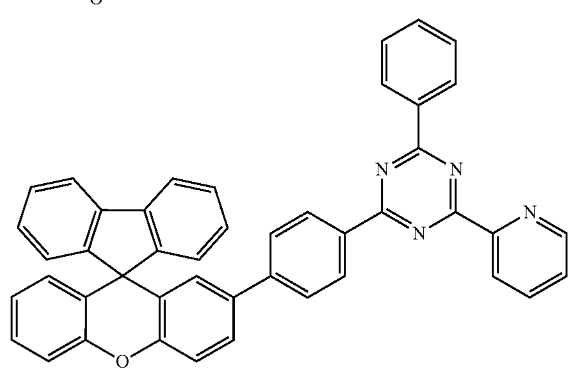
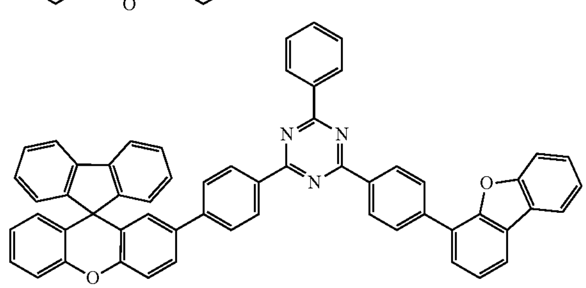

-continued
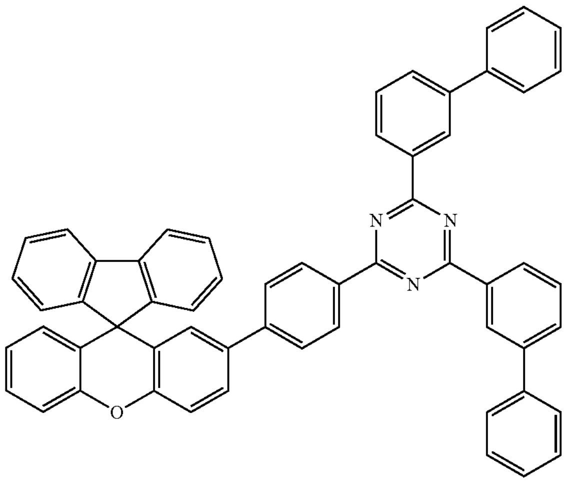
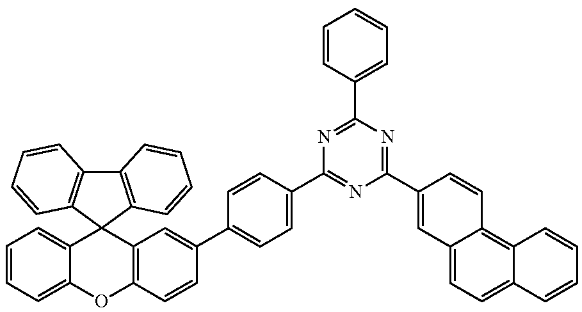
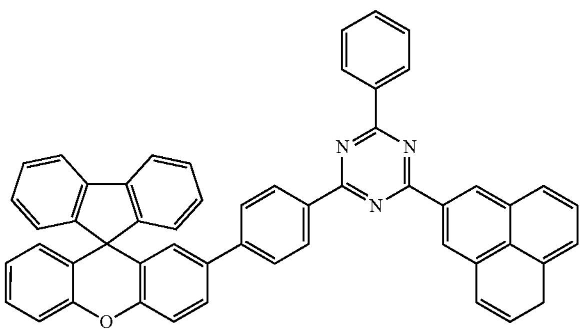
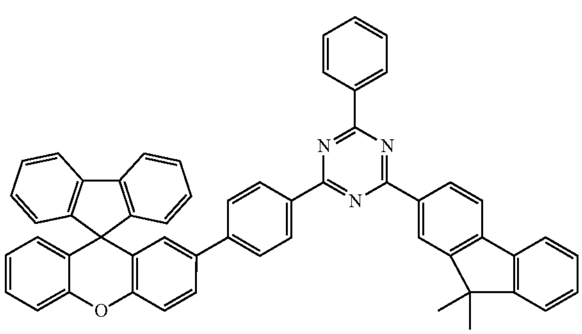
-continued
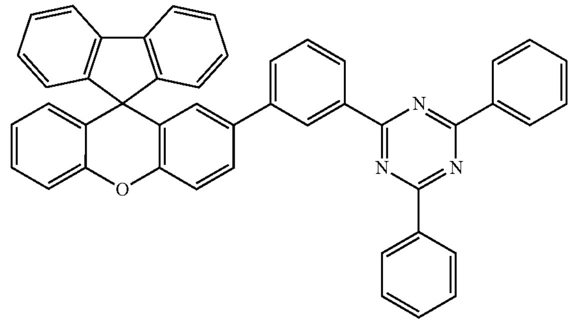
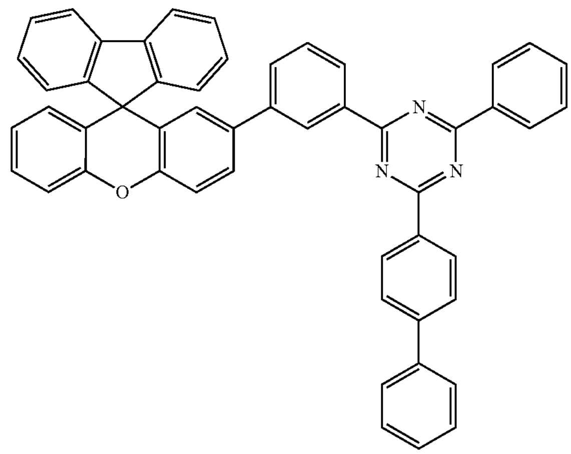
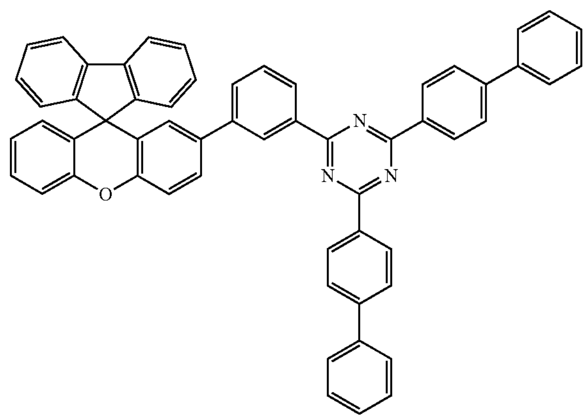
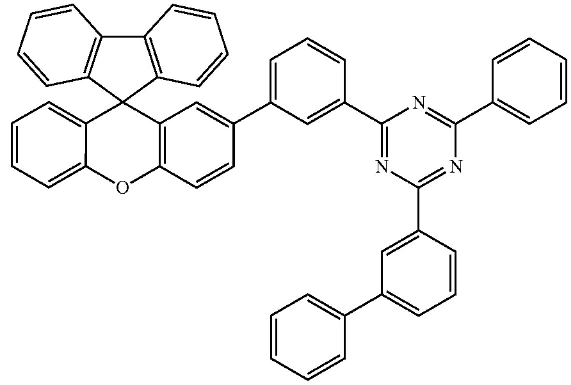

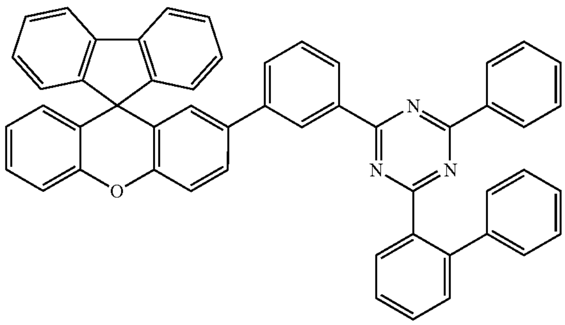
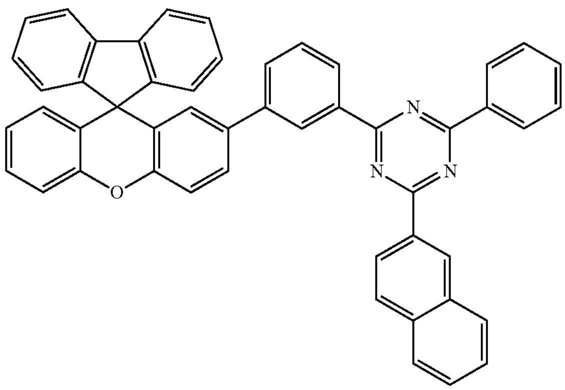
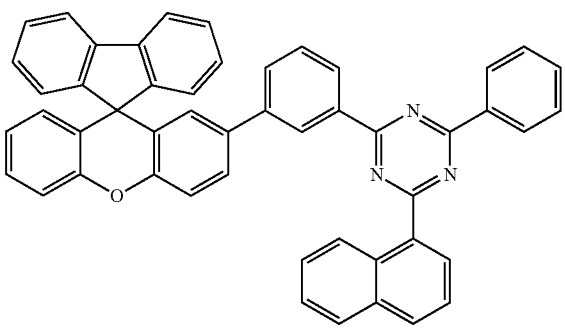
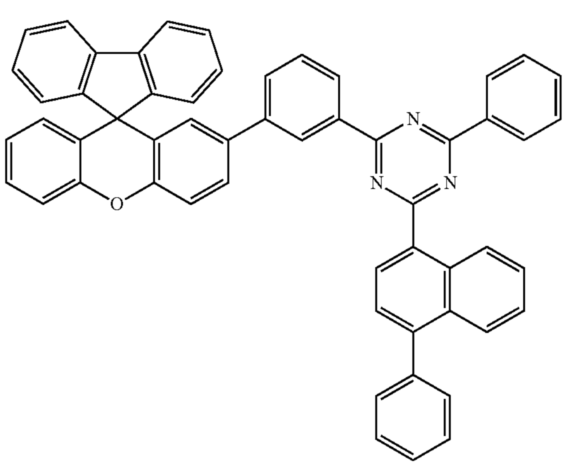
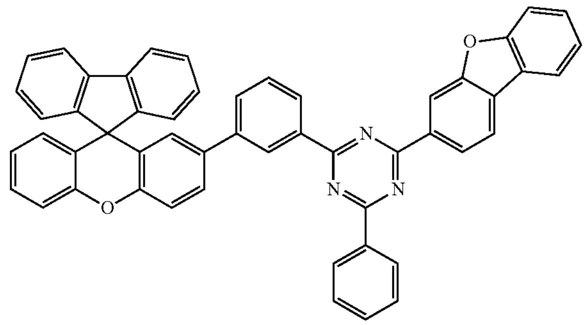
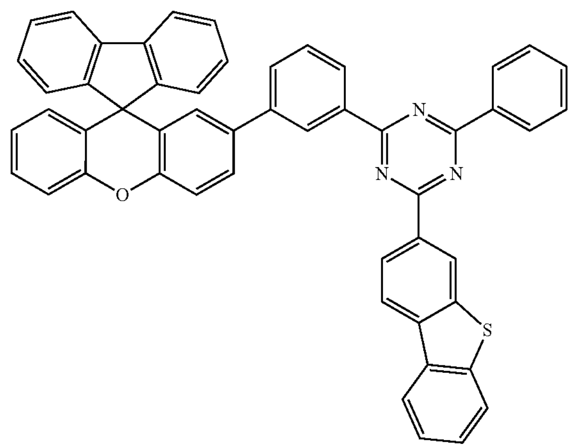
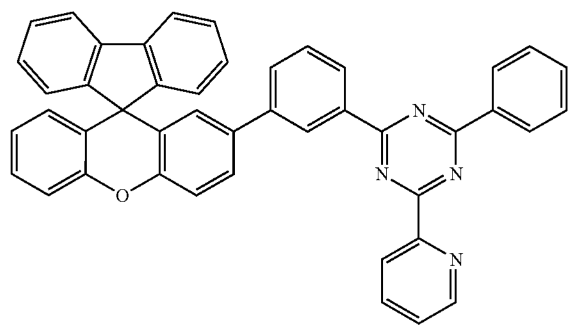
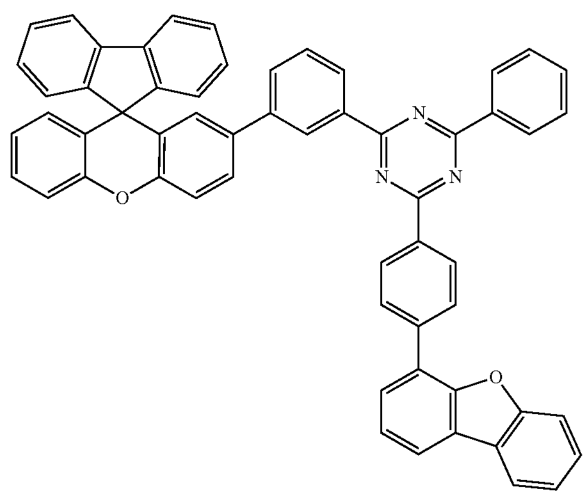

-continued
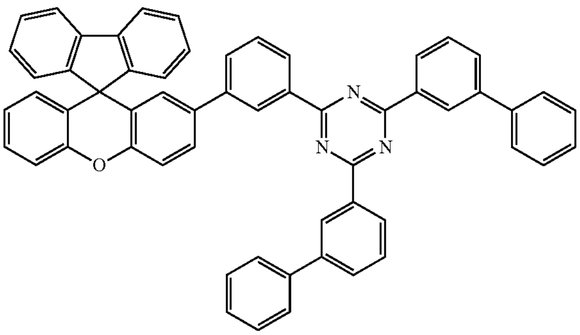
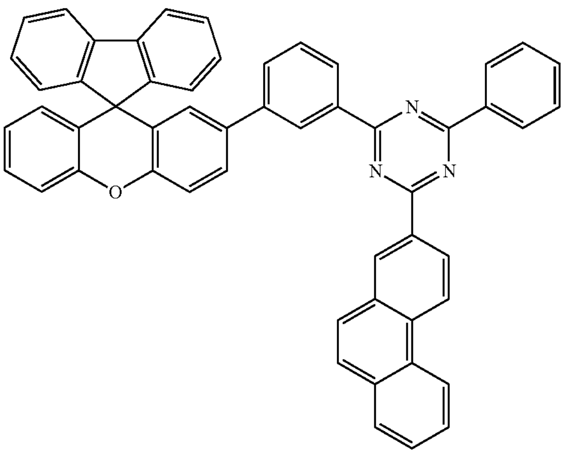
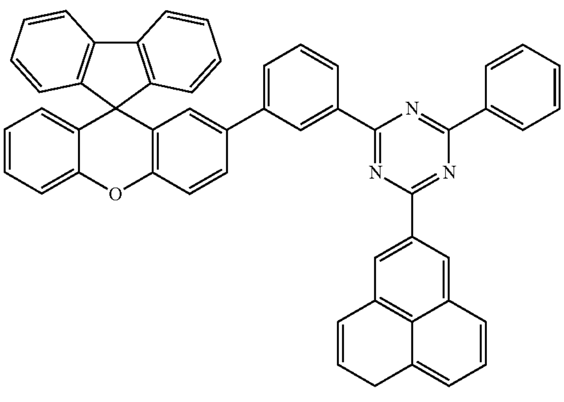
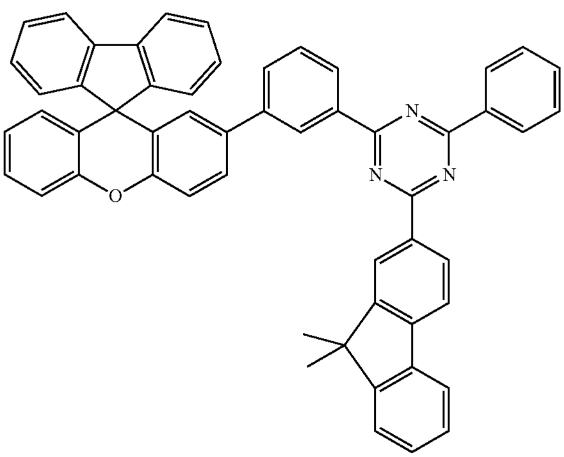
-continued
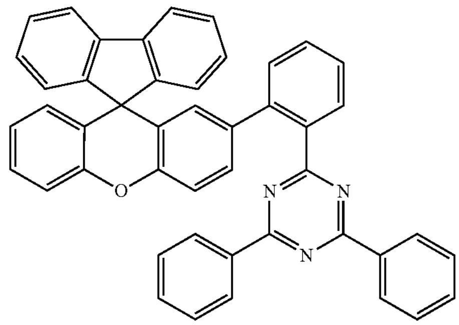
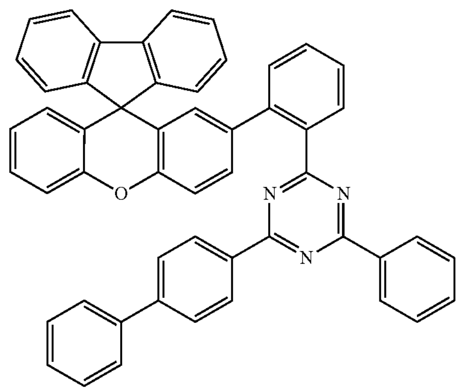
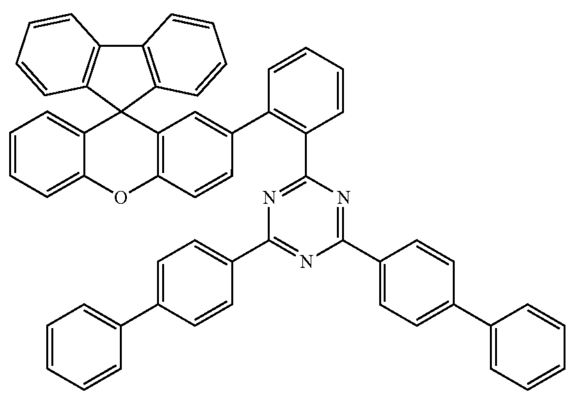
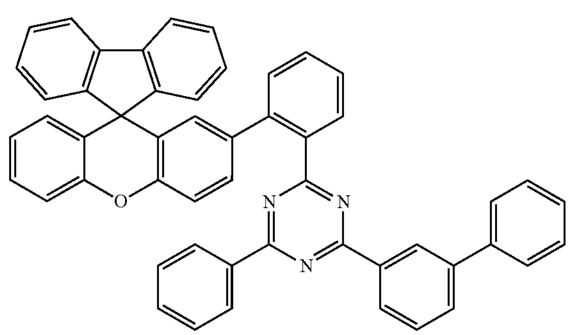

-continued
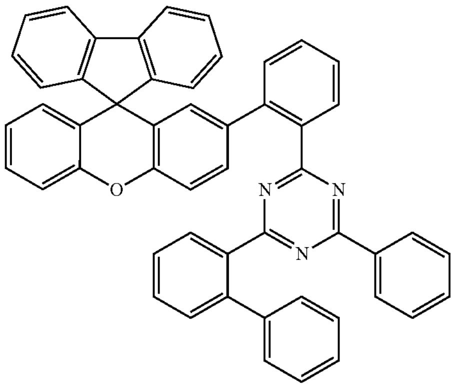
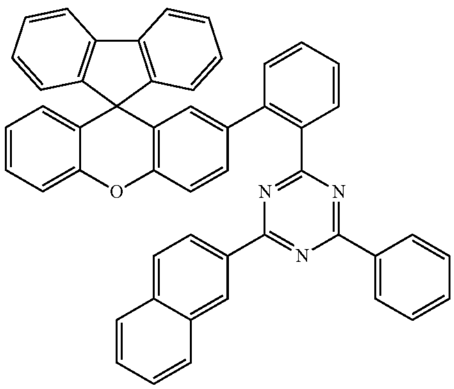
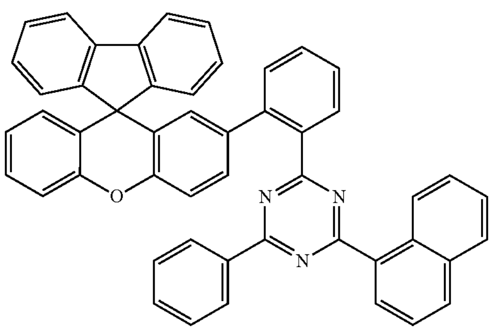
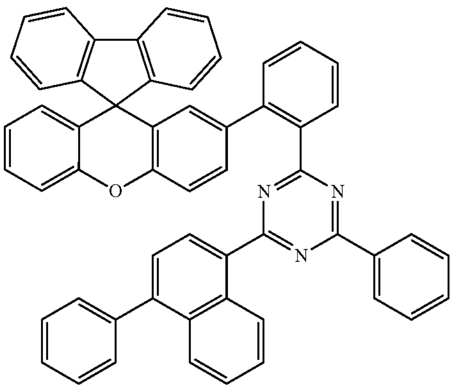
-continued
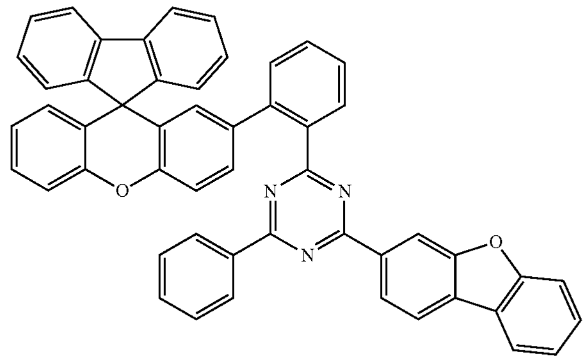
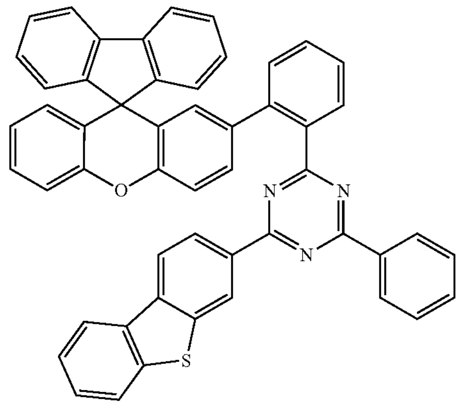
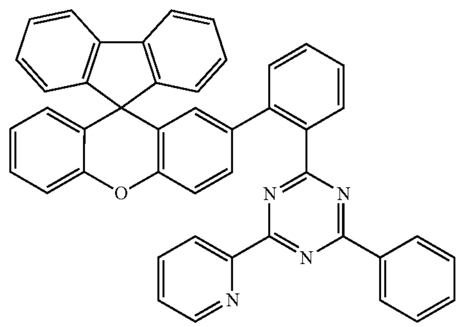
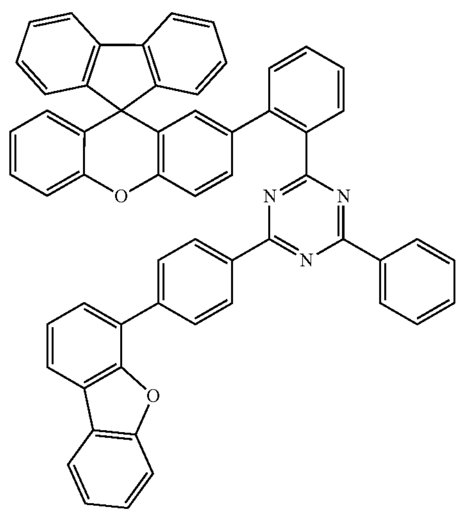

-continued
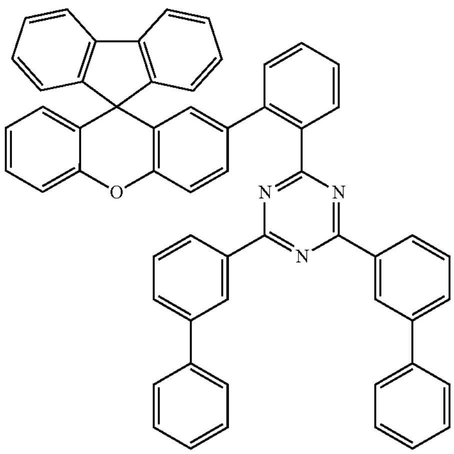
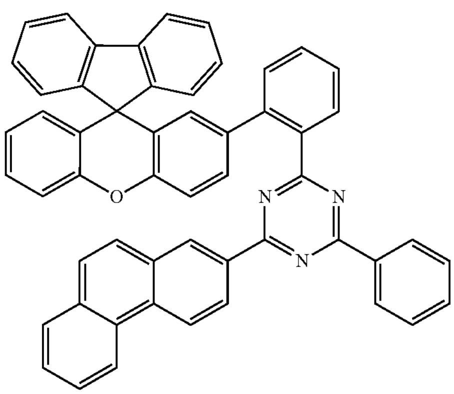
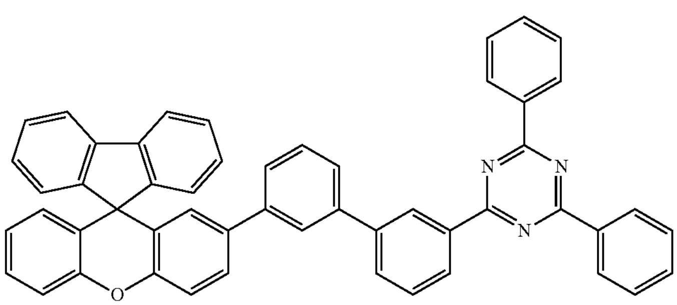
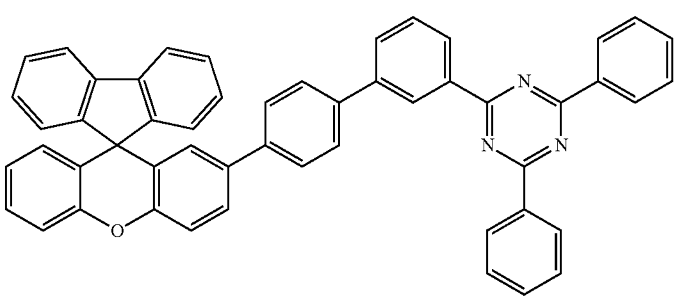
-continued
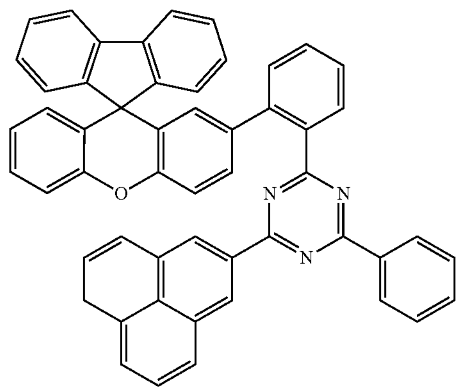
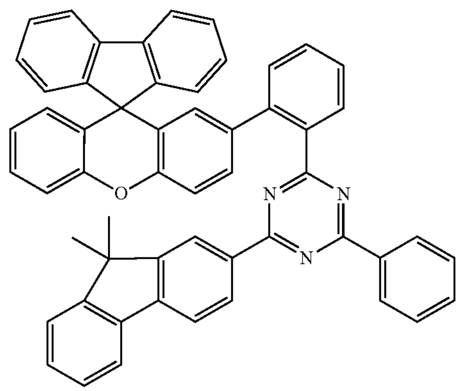

-continued
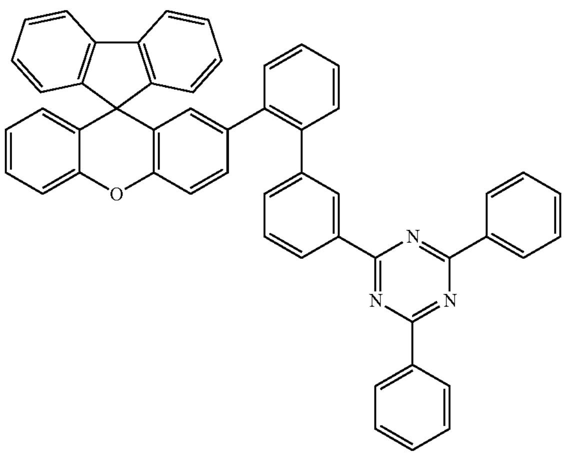
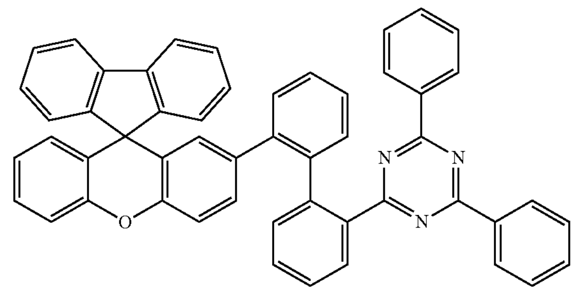
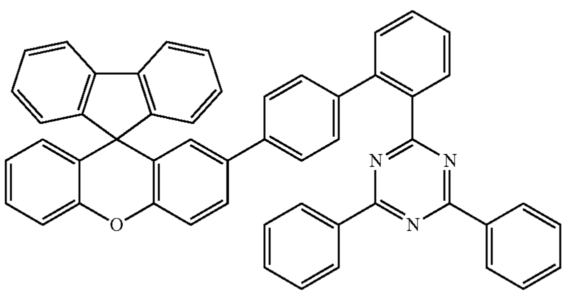
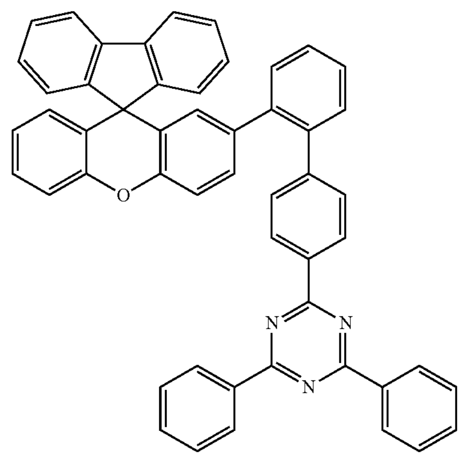
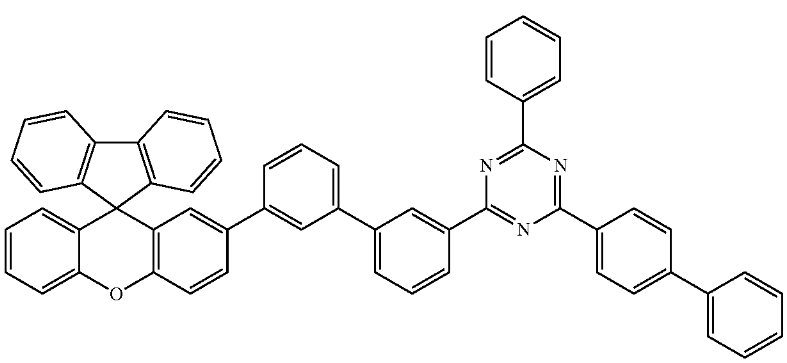
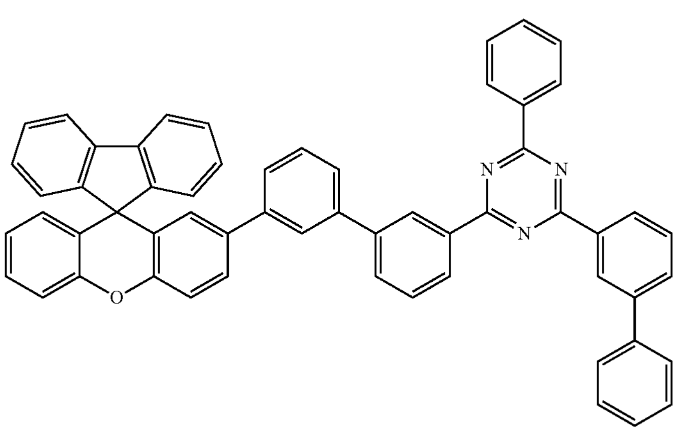

-continued
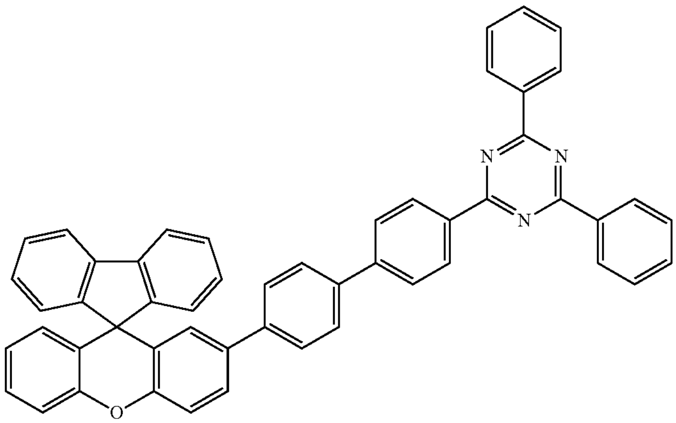
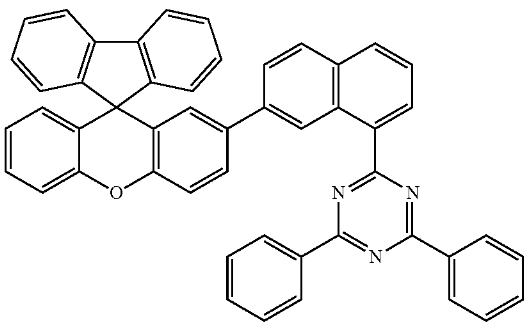
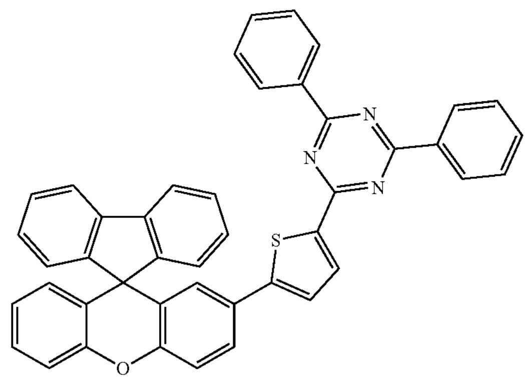
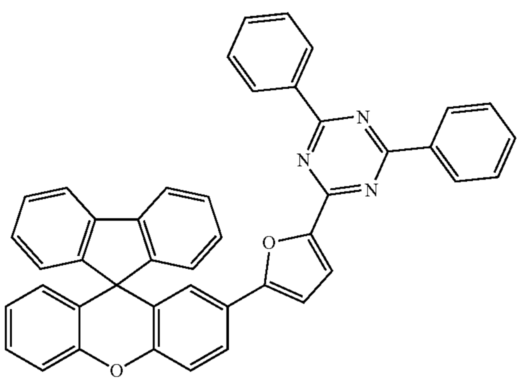
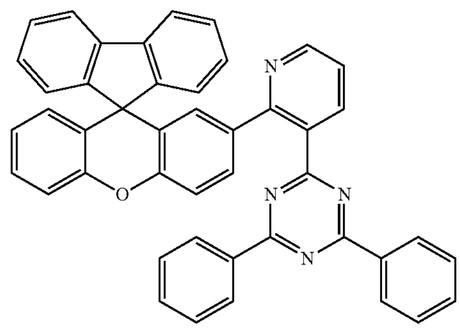
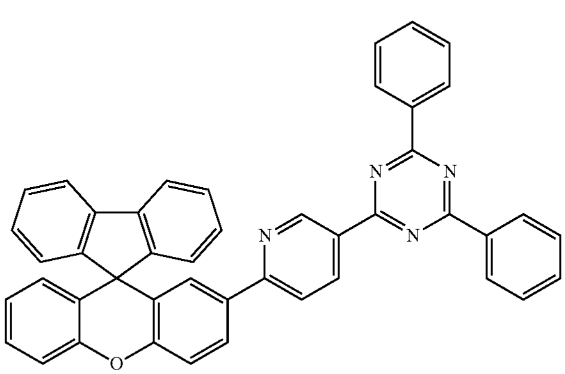
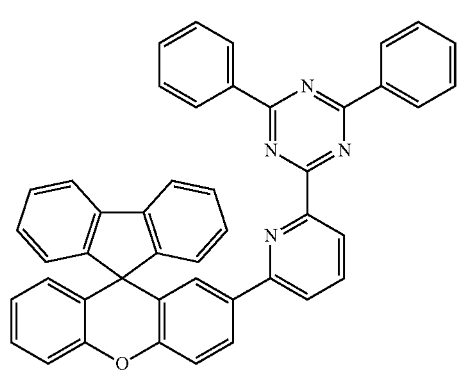

-continued
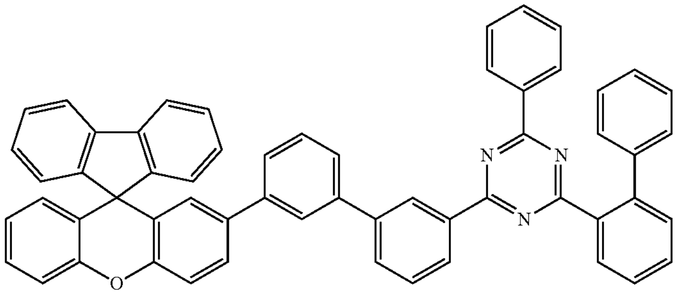
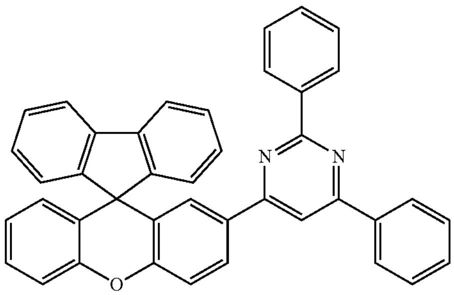
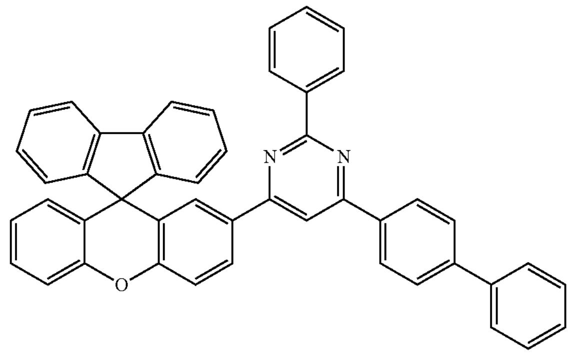
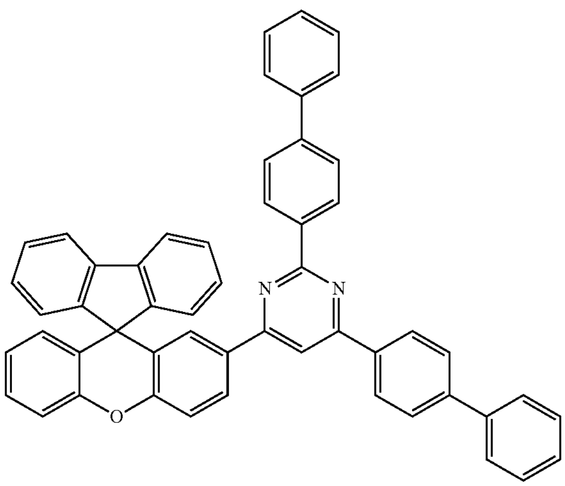
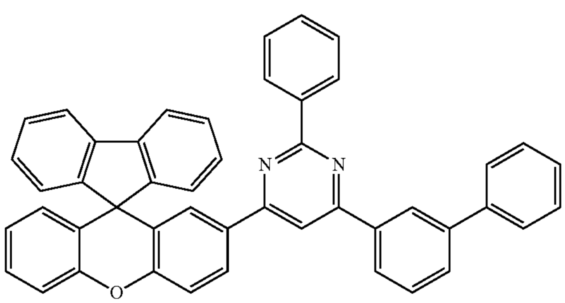
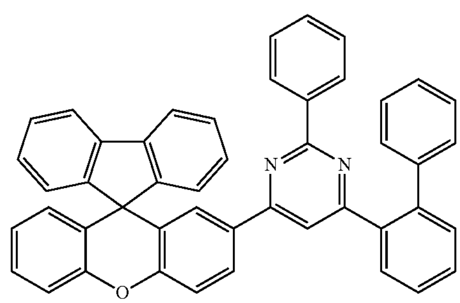
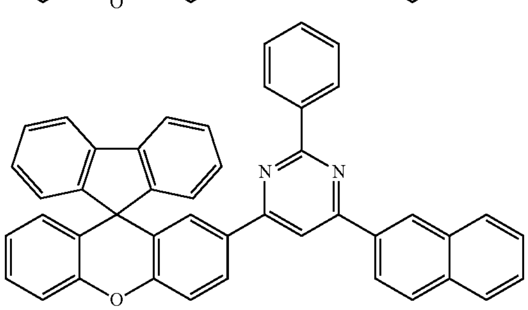
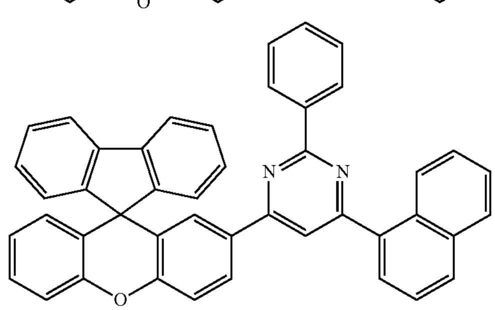

-continued
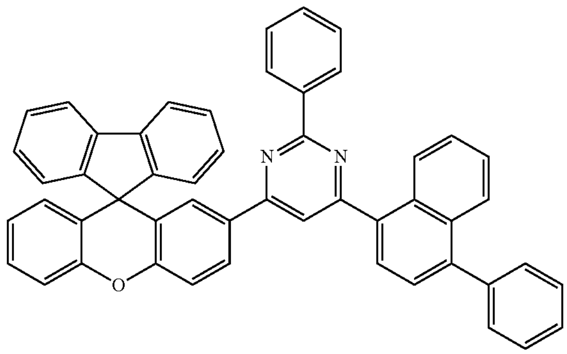
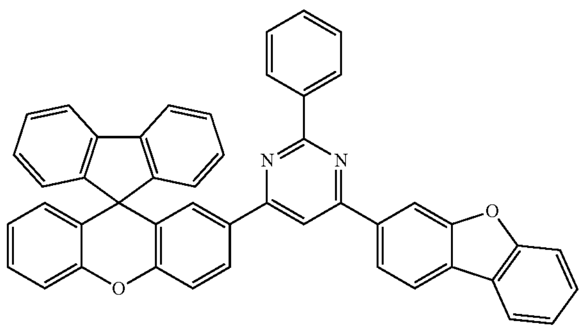
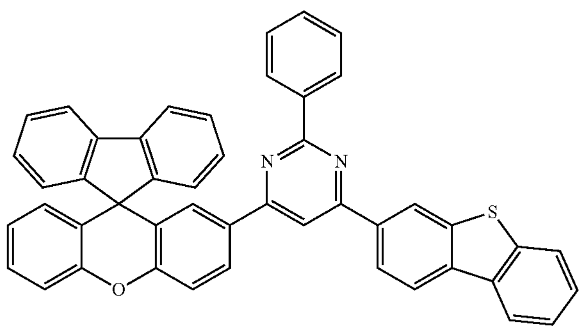
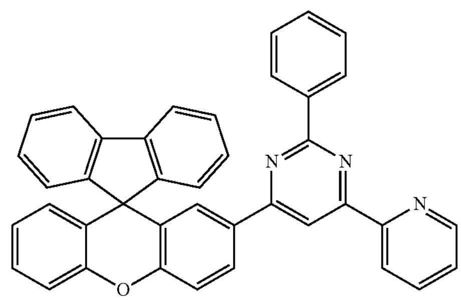
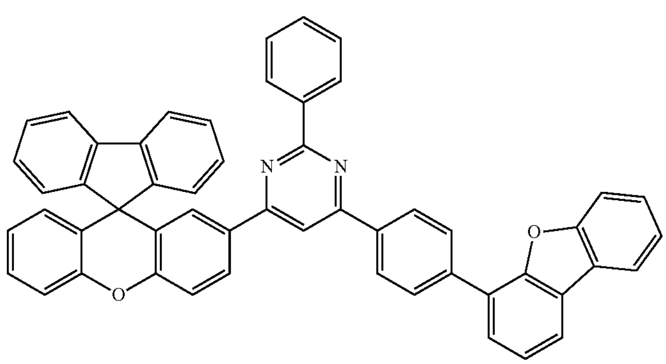
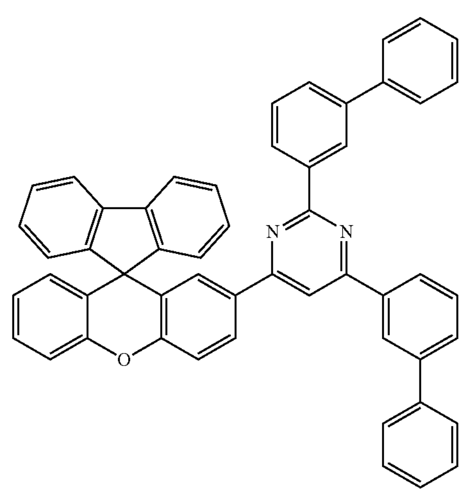

-continued
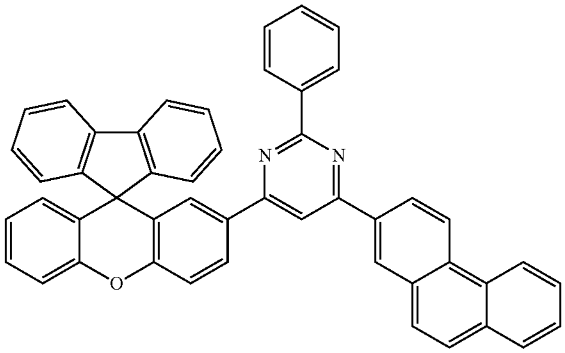
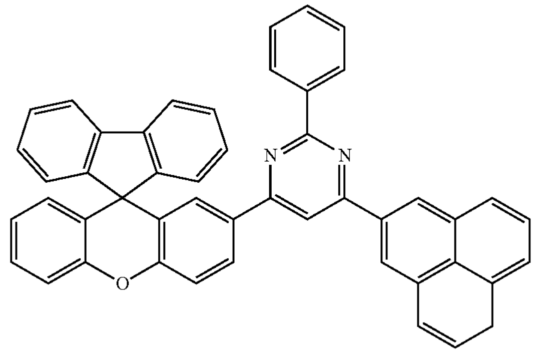
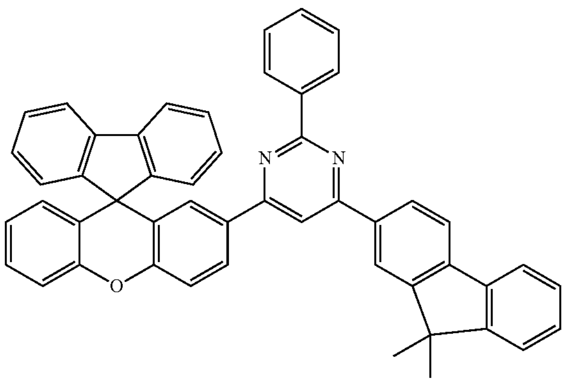
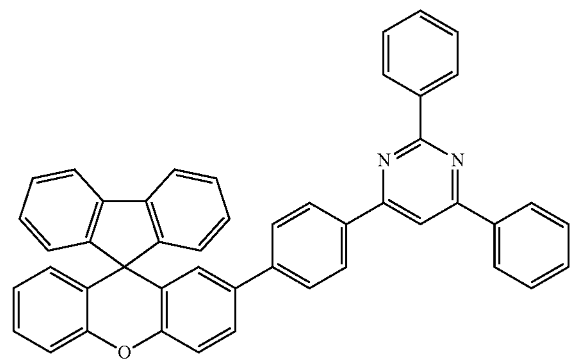
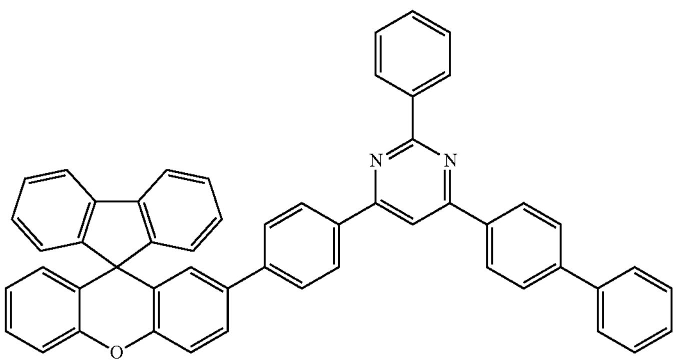
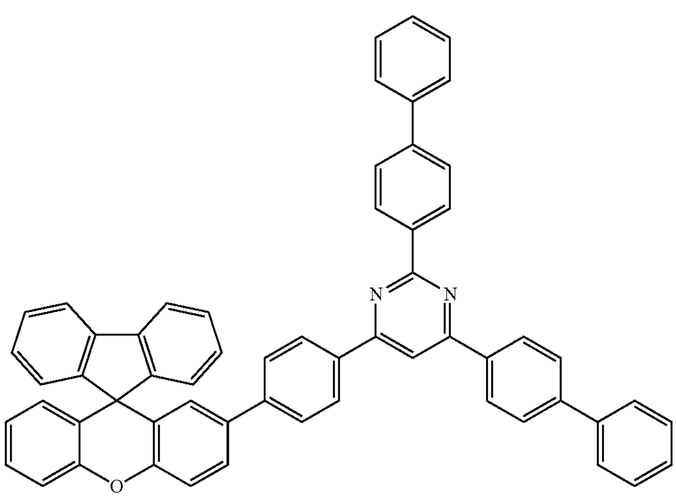

-continued
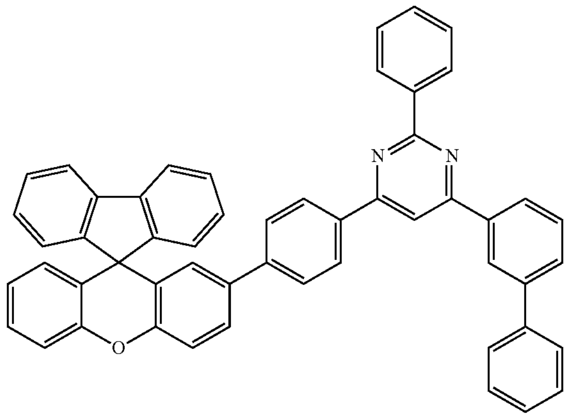
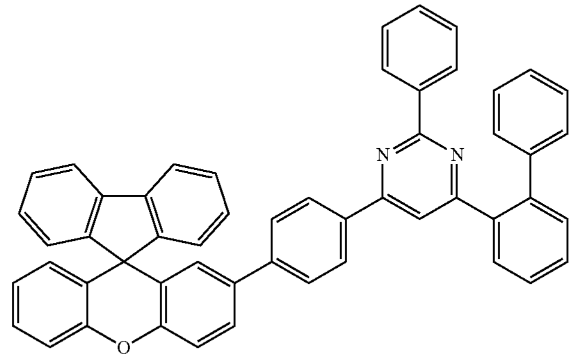
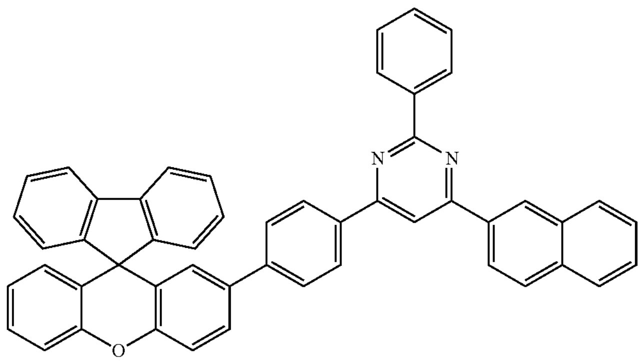
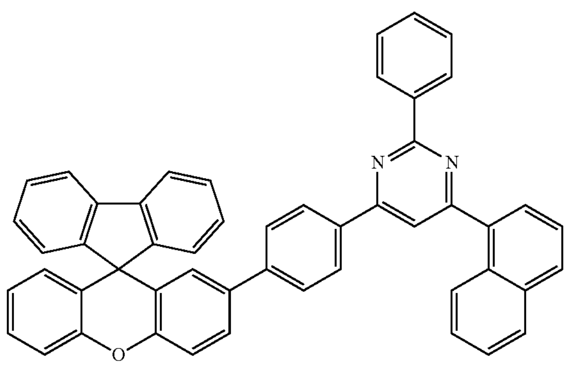
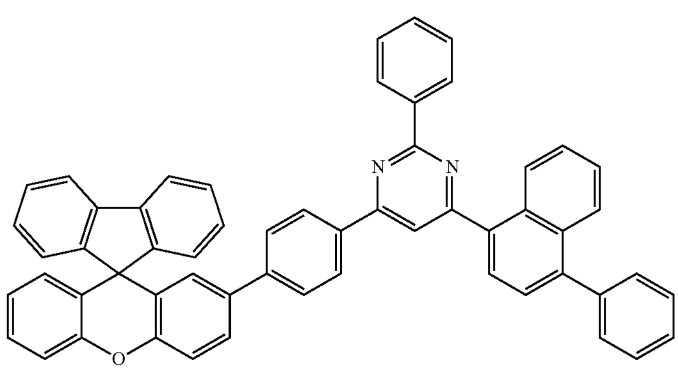

-continued
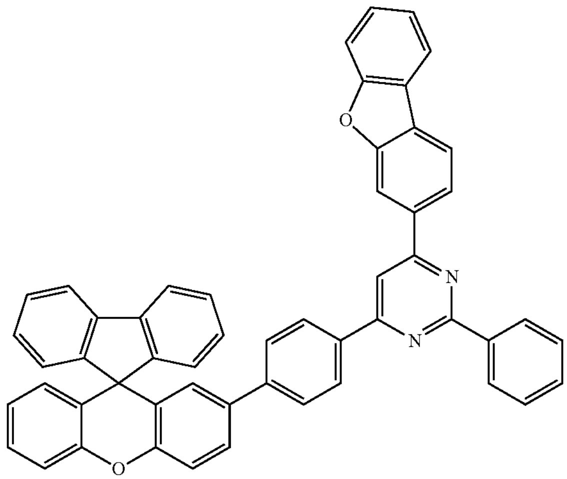
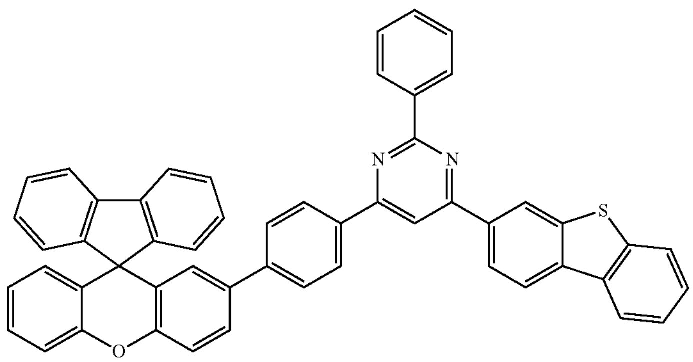
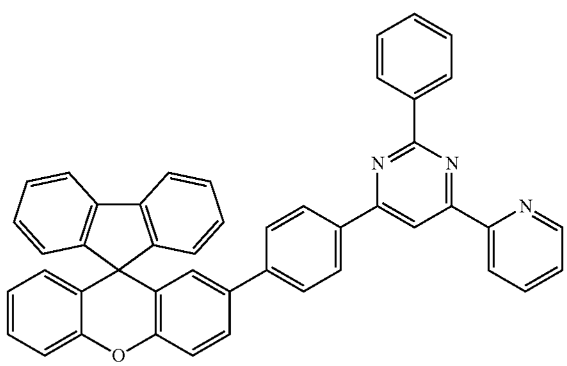
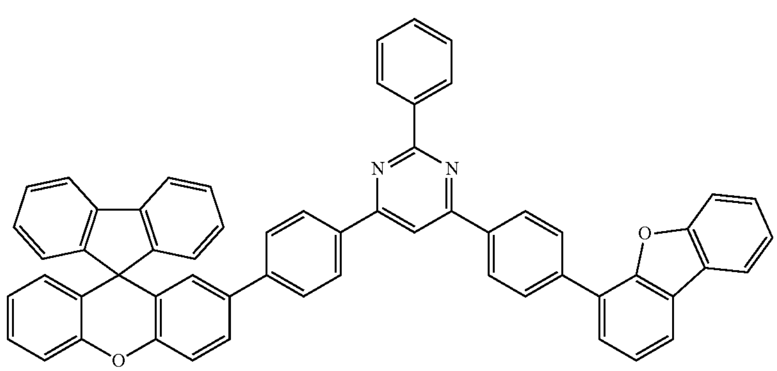

-continued
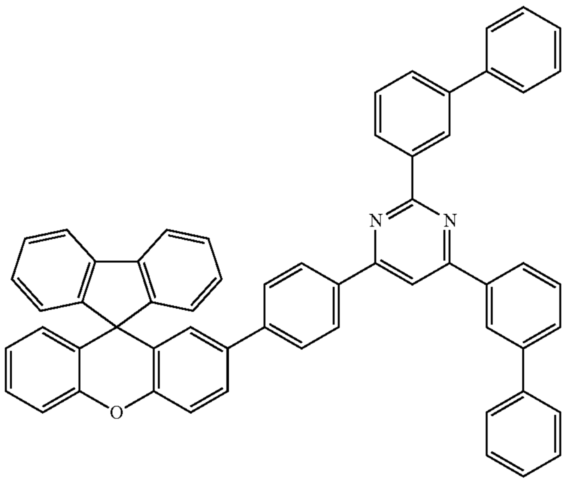
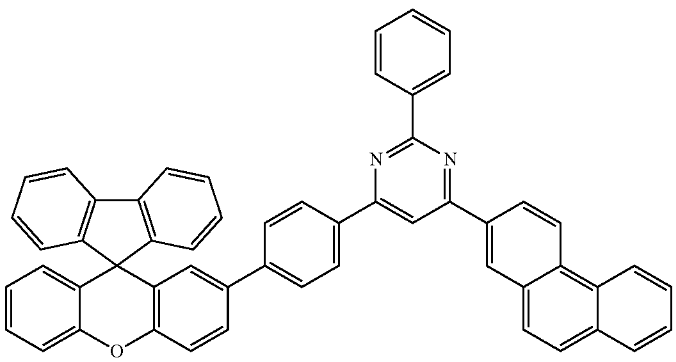
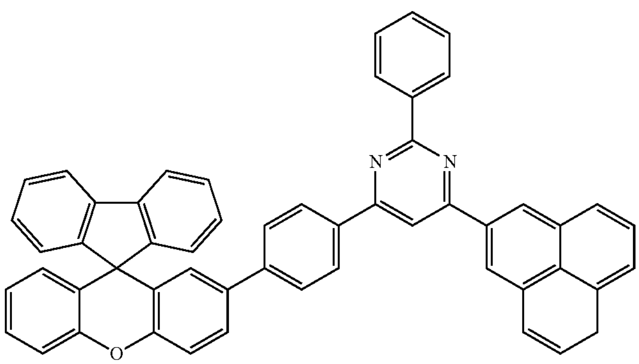
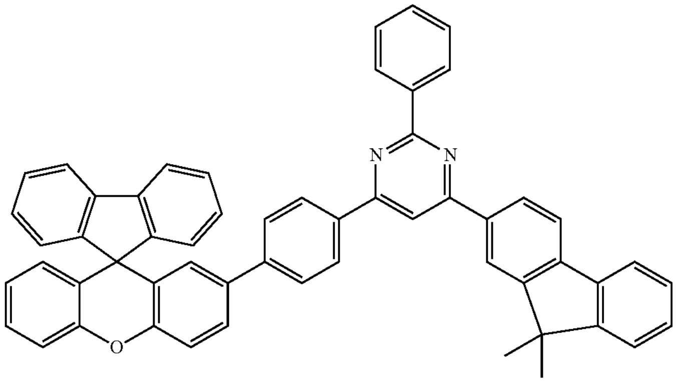

-continued
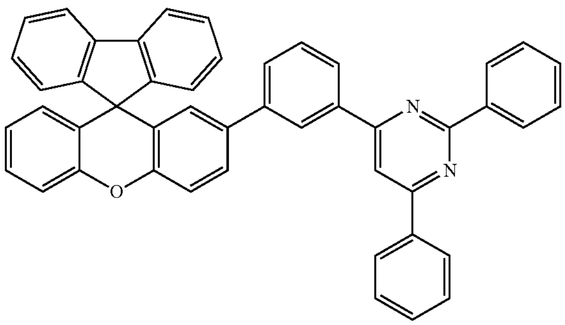
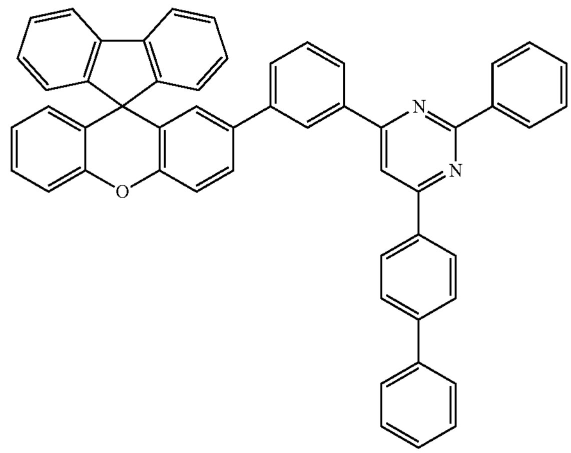
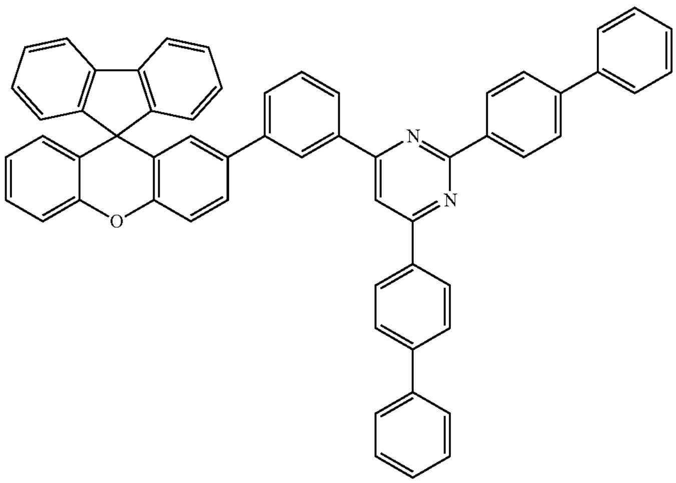
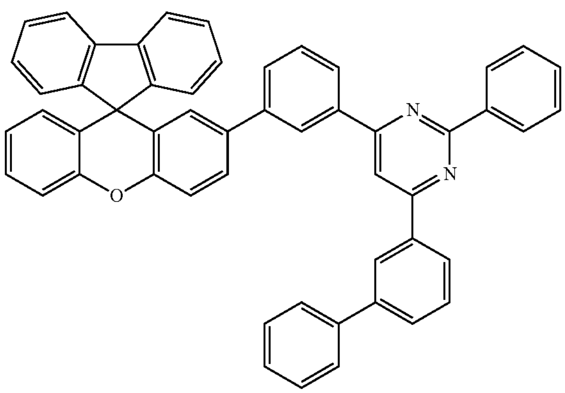
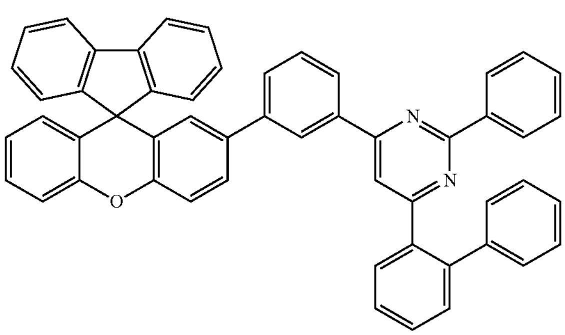
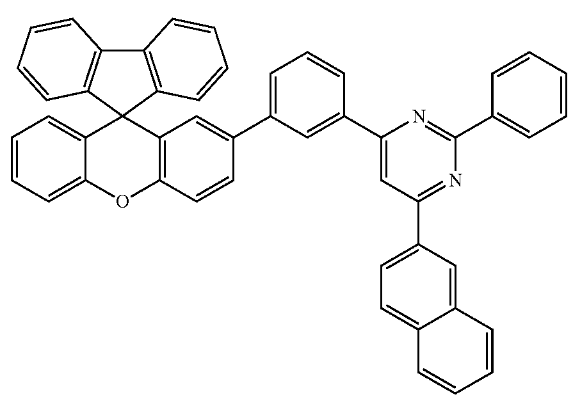

-continued
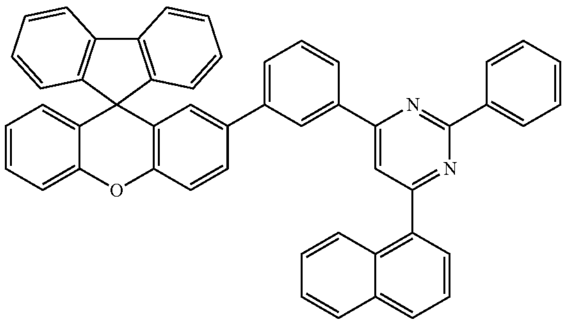
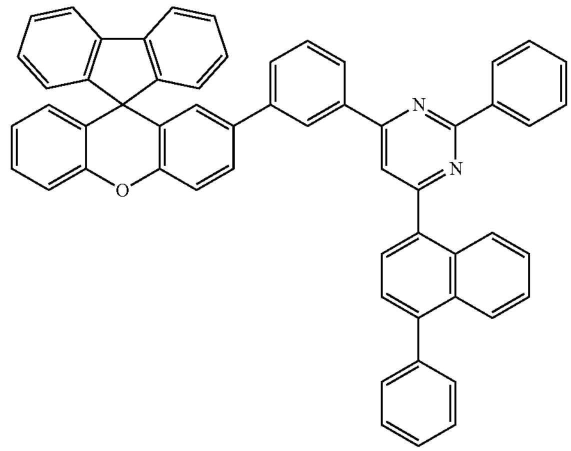
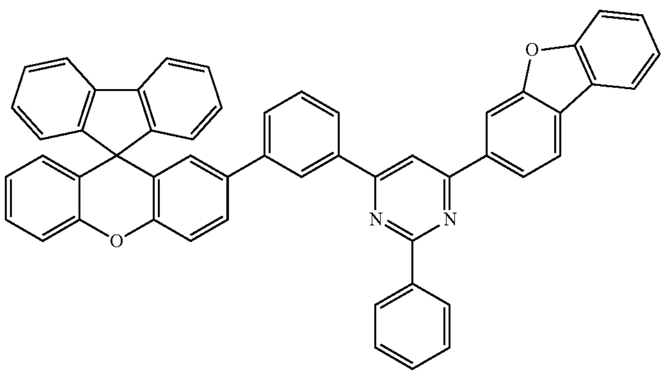
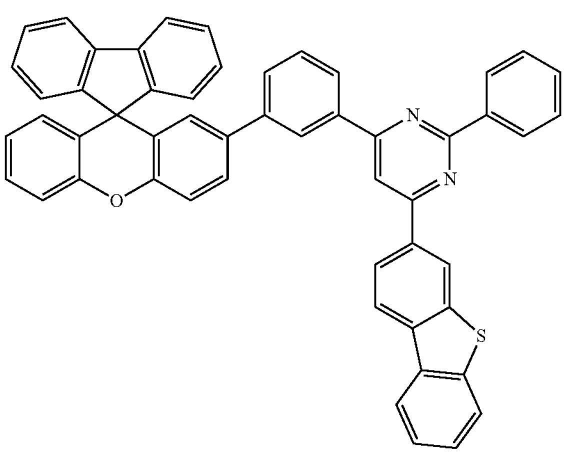
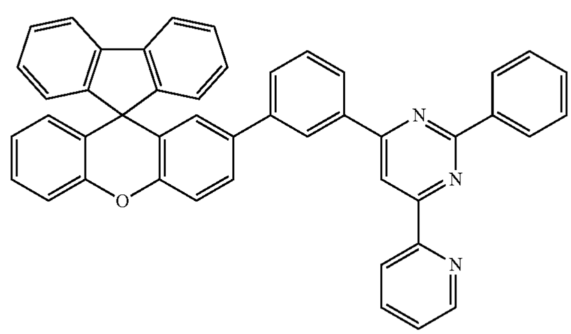

-continued
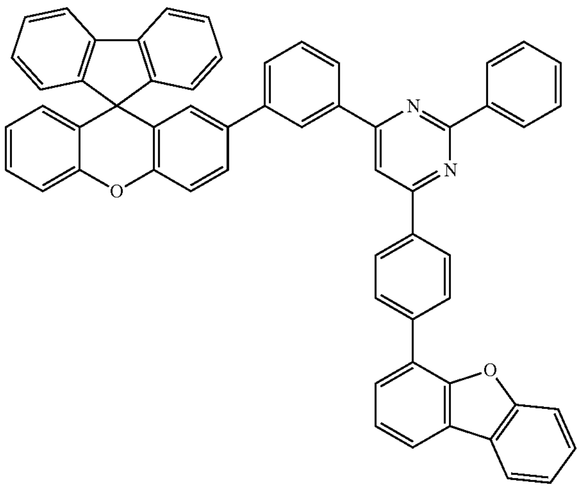
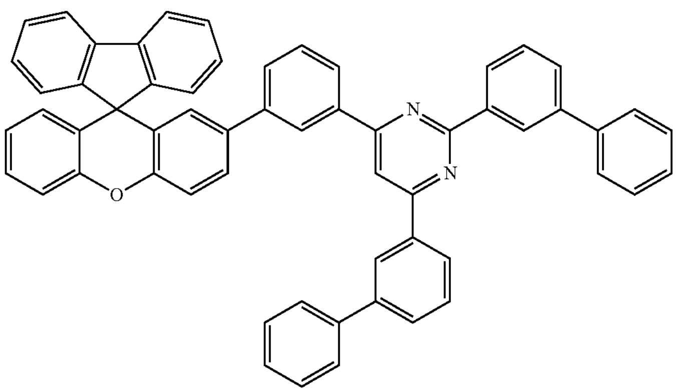
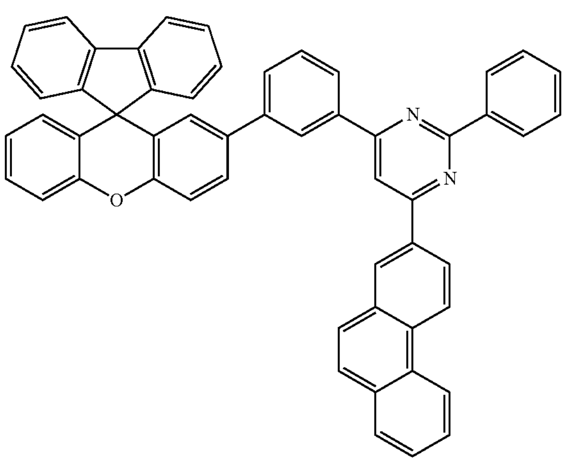
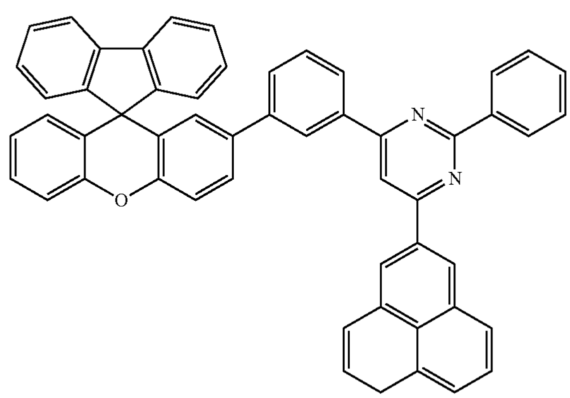

-continued
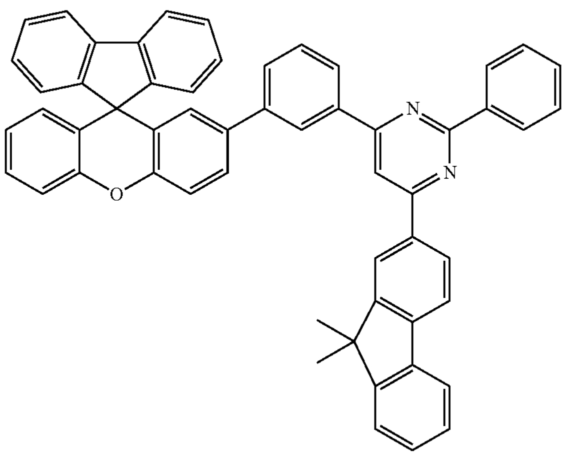
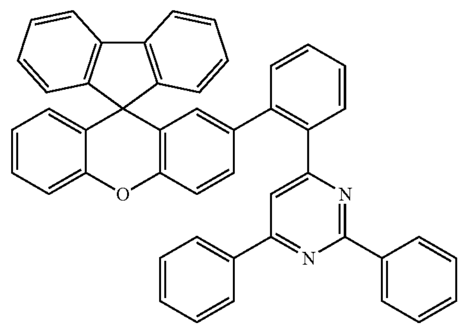
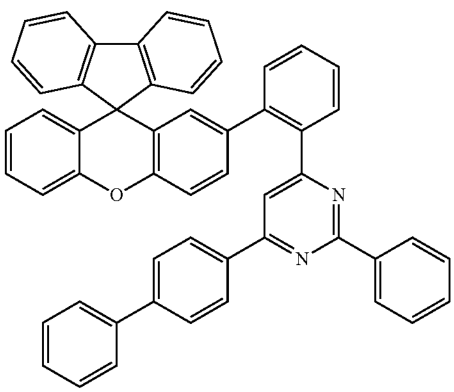
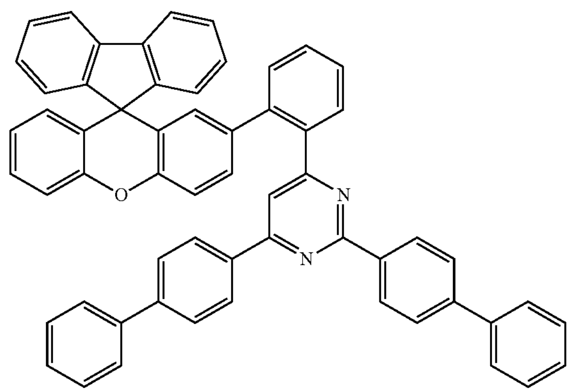
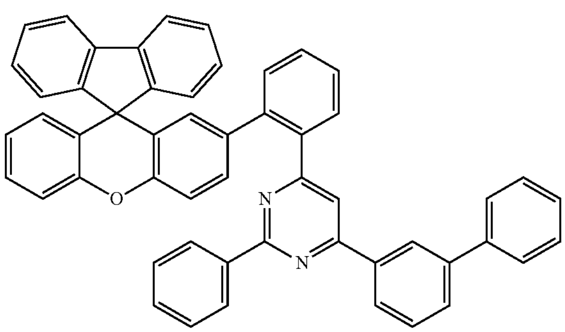
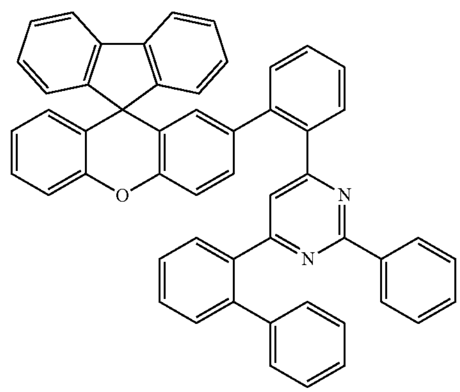
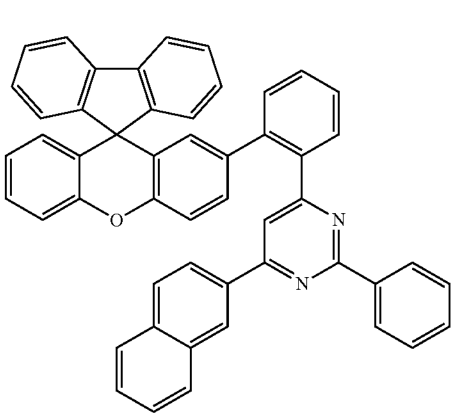
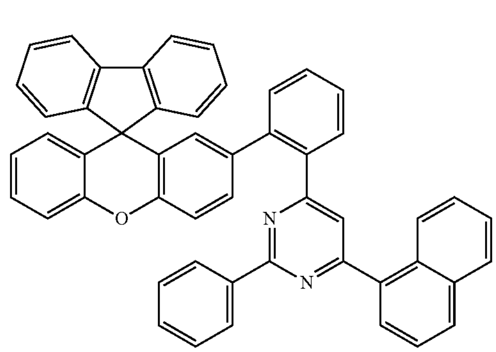

-continued
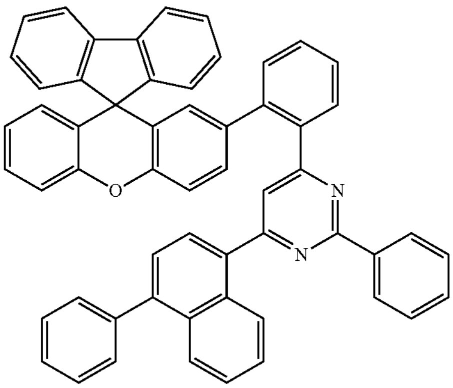
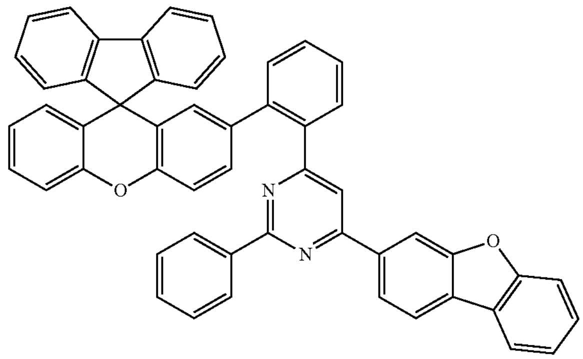
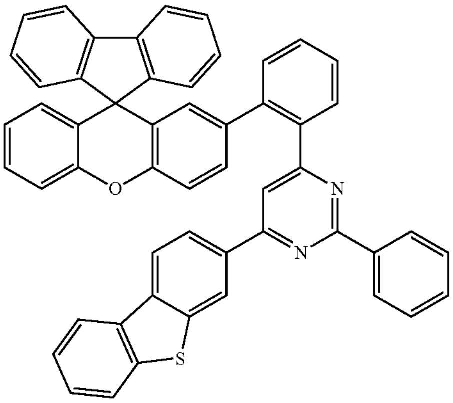
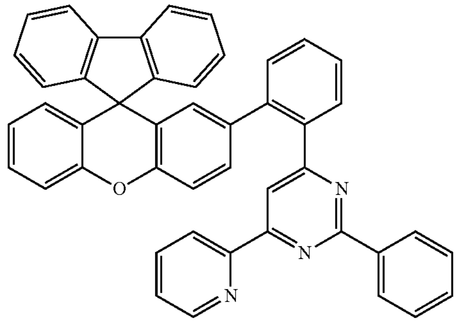
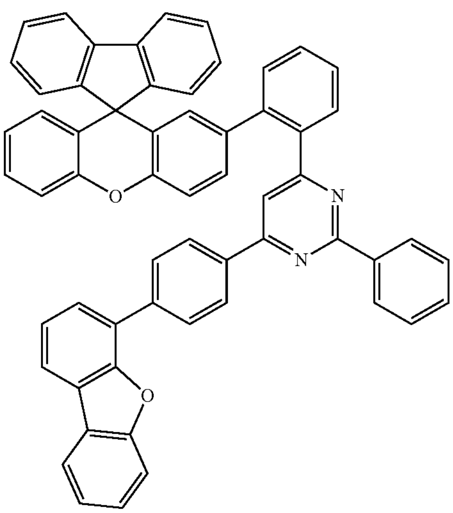
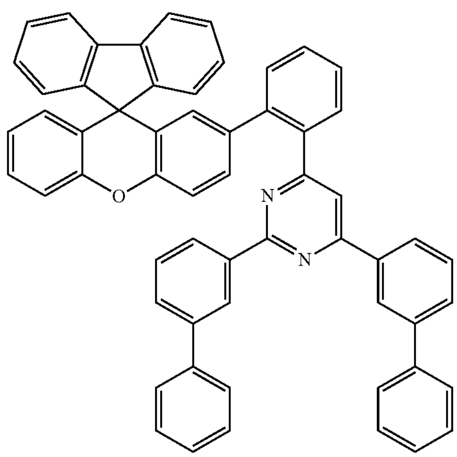
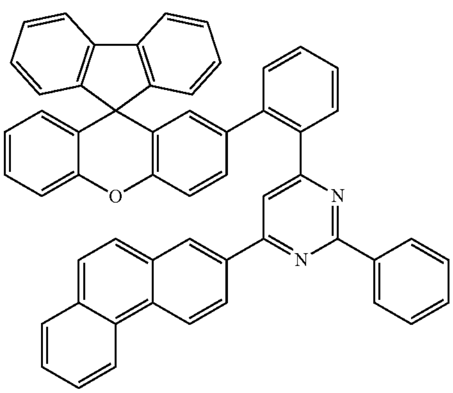
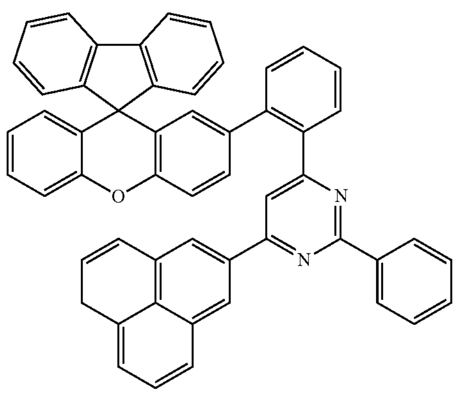

-continued
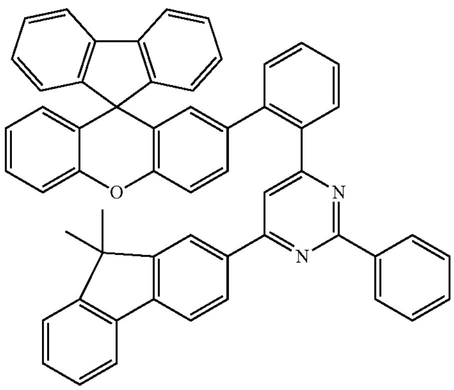
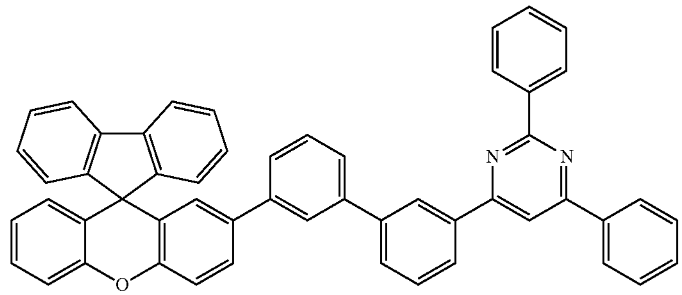
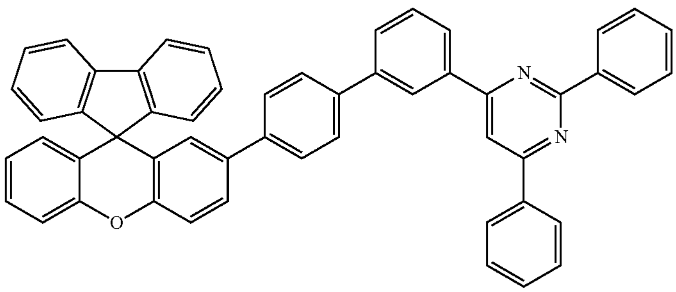
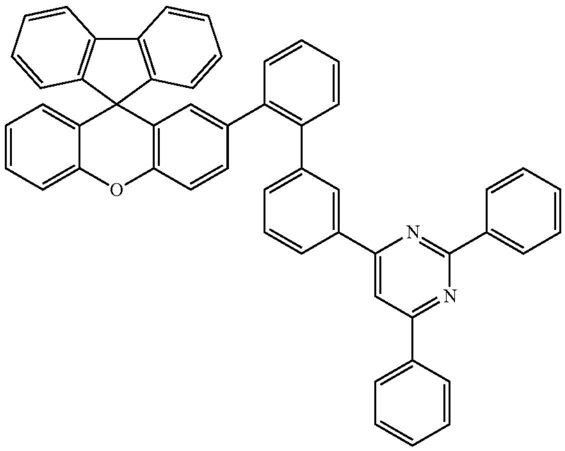
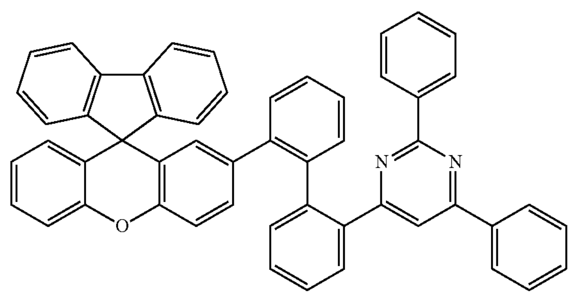
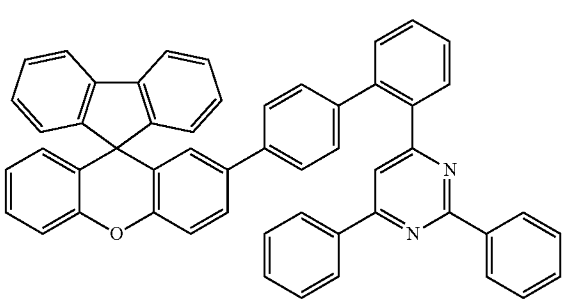
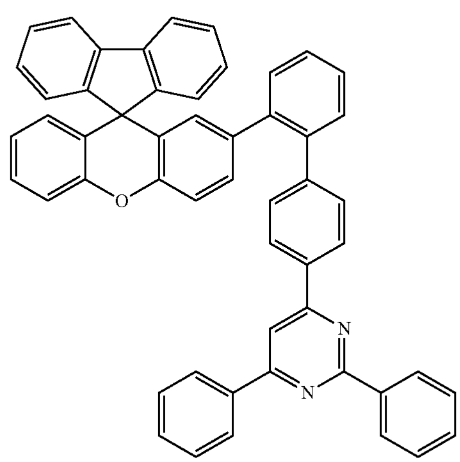

-continued
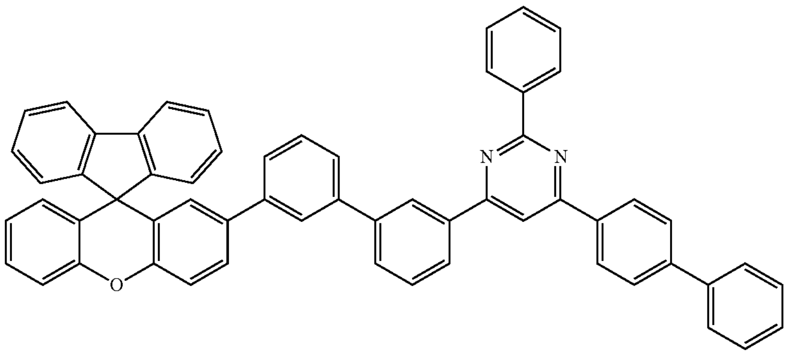
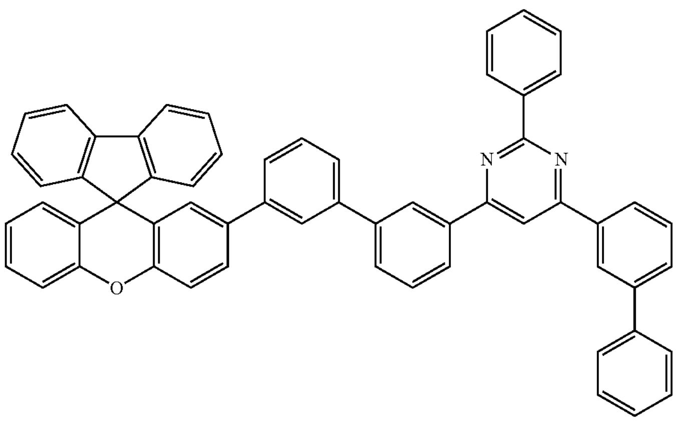
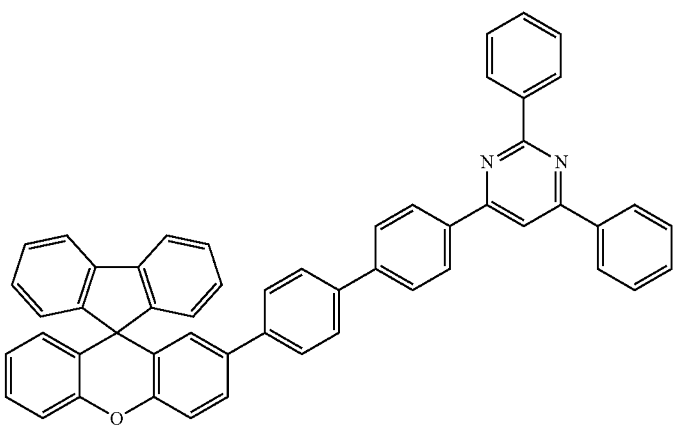
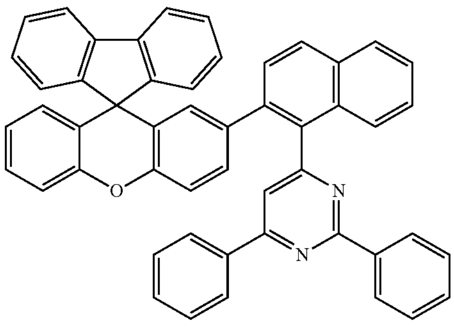
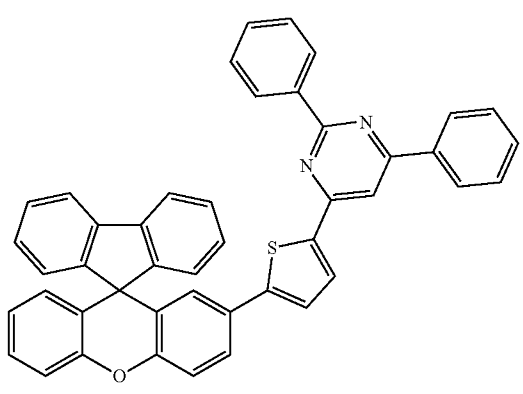

-continued
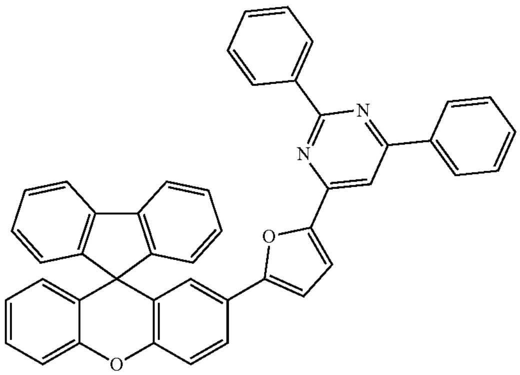
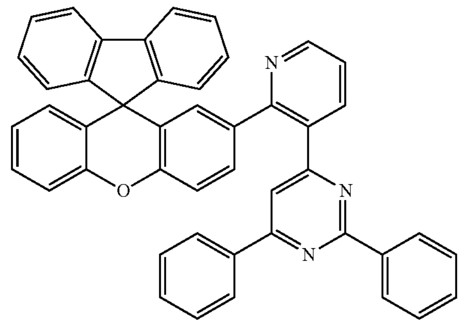
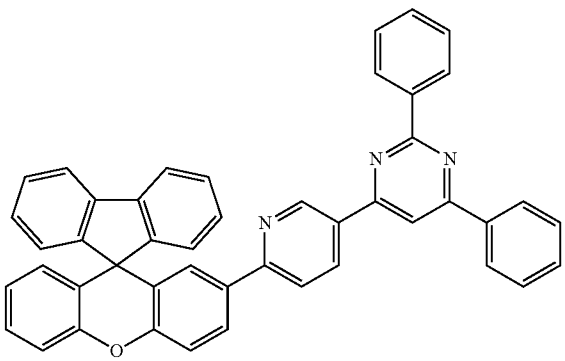
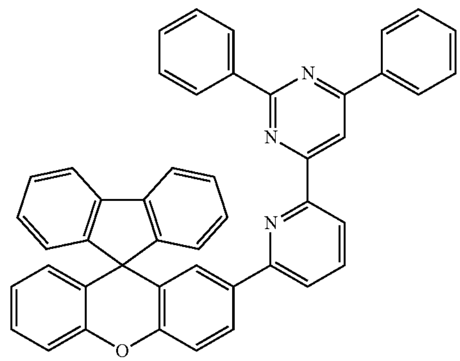
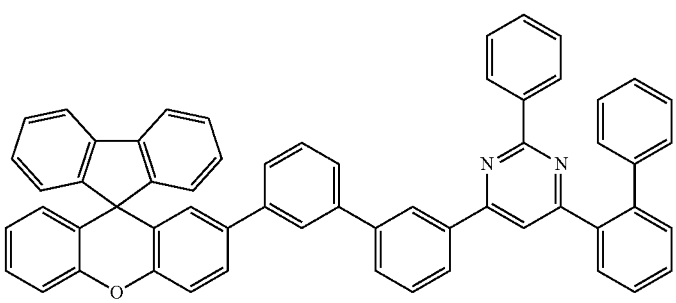
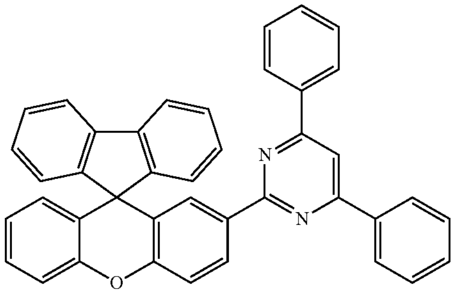
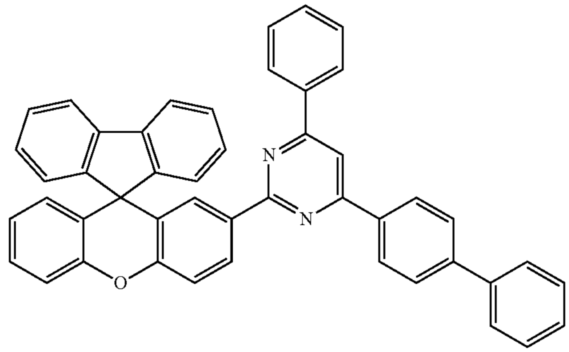

-continued
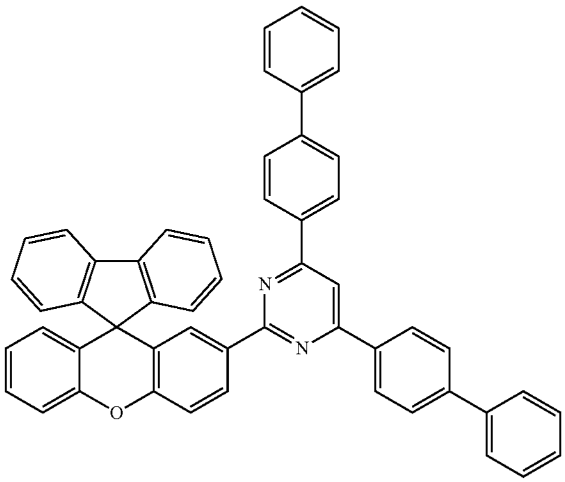
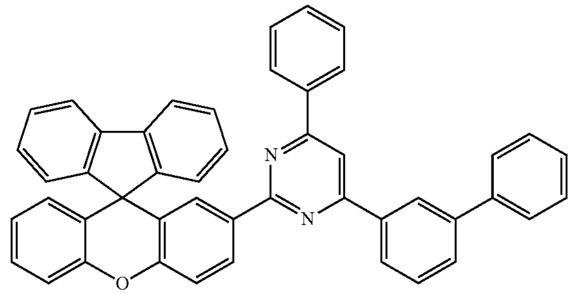
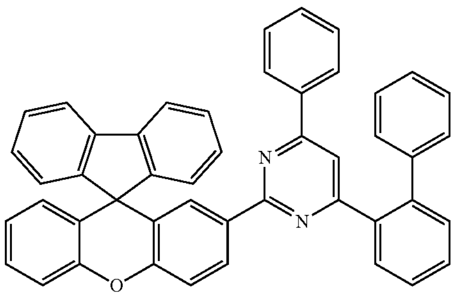
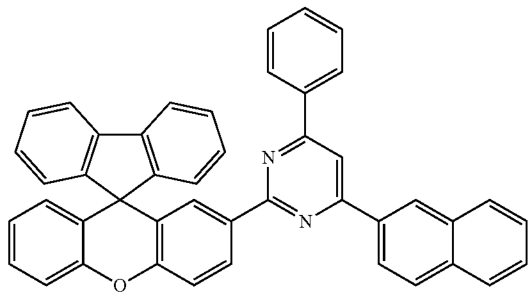
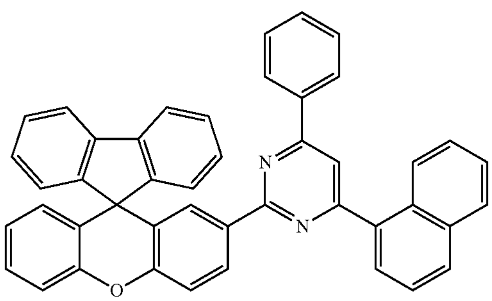
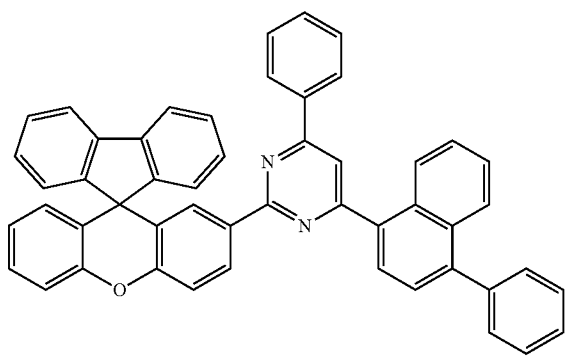
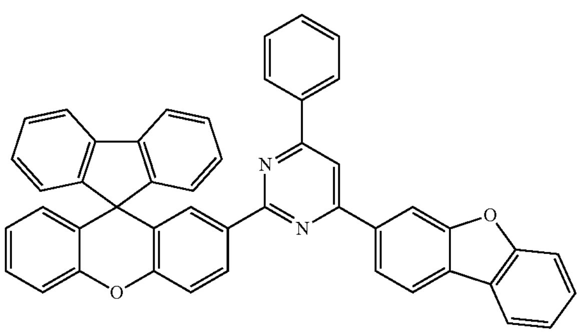

-continued
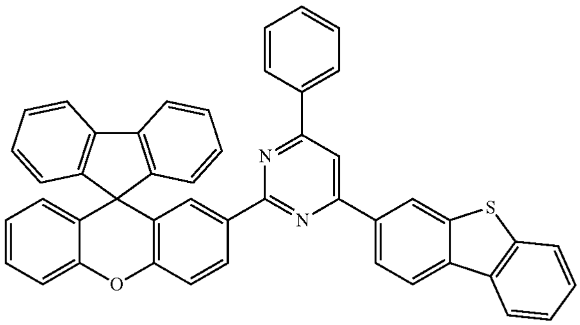
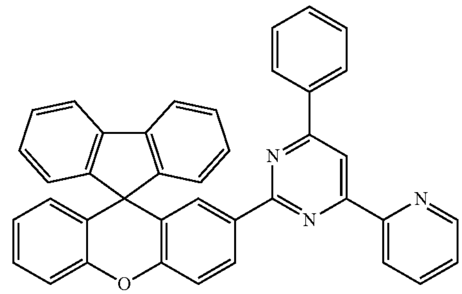
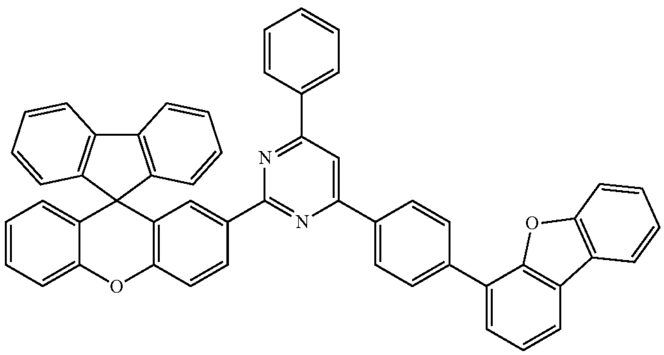
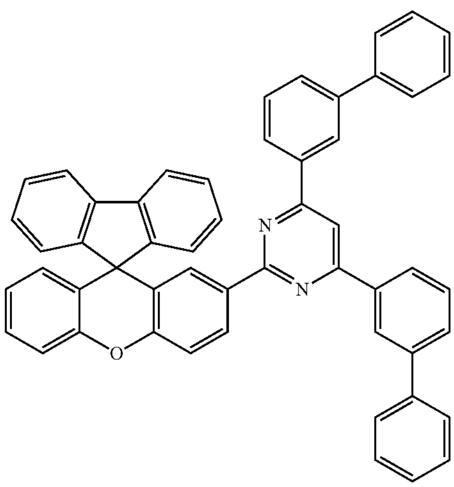
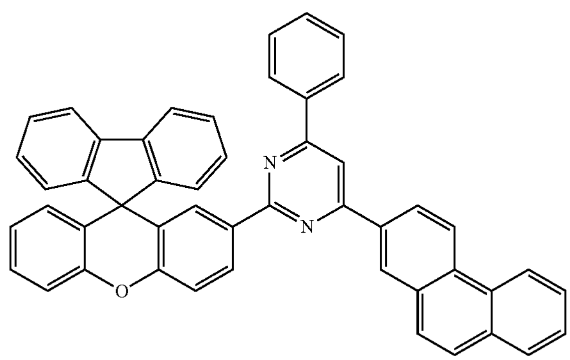
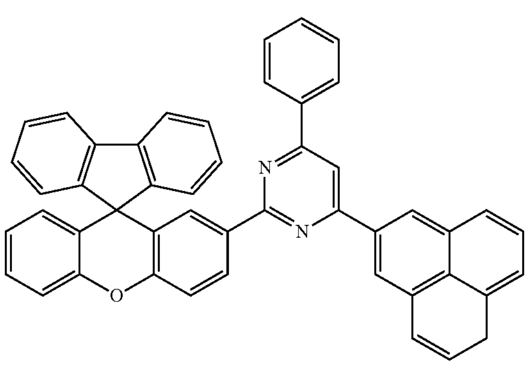
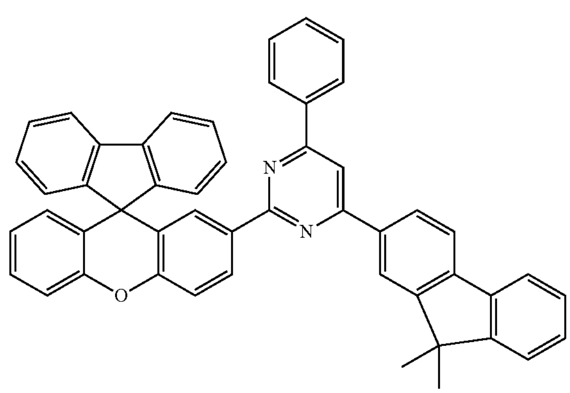

-continued
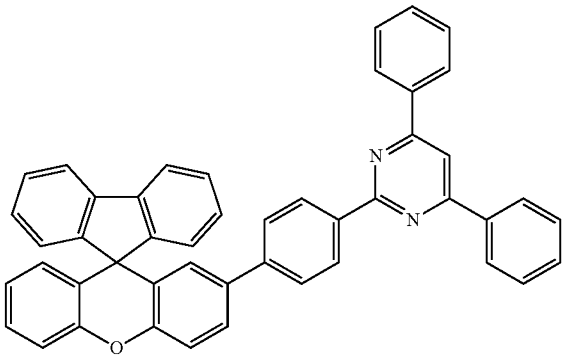
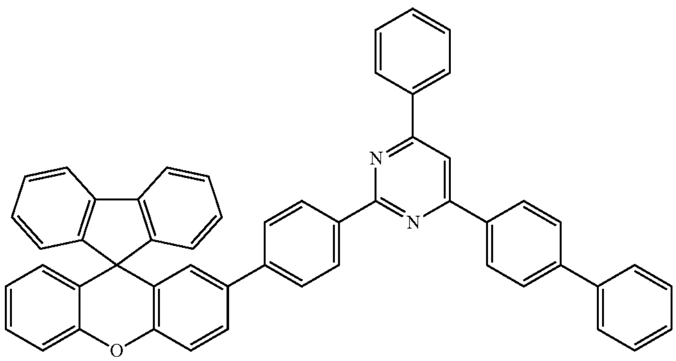
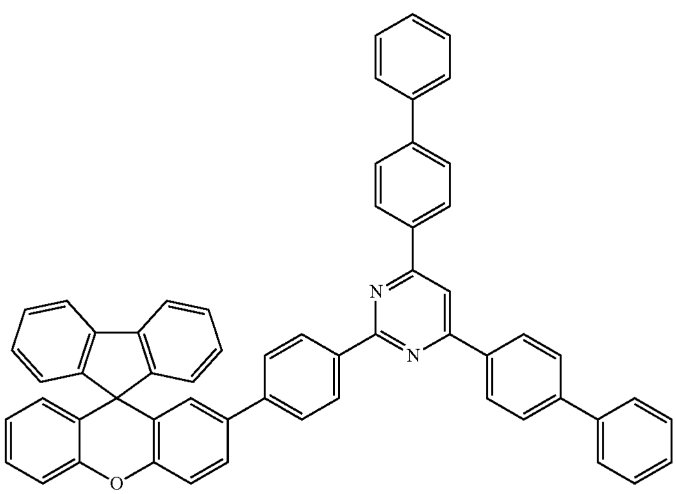
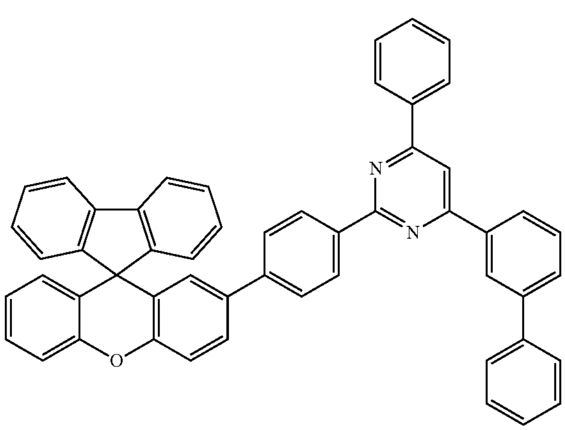
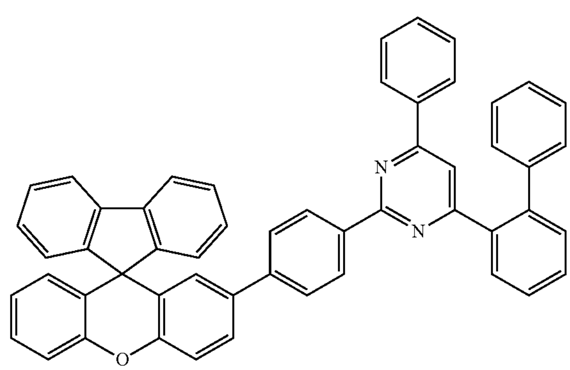

-continued
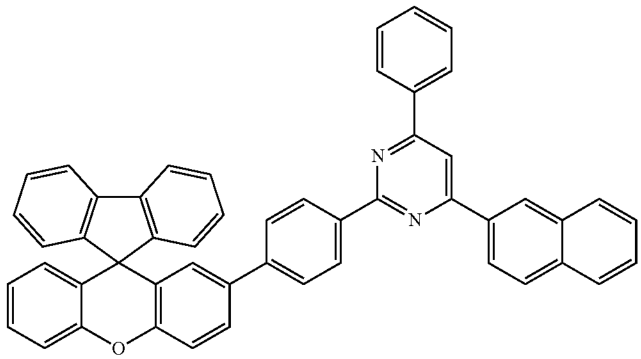
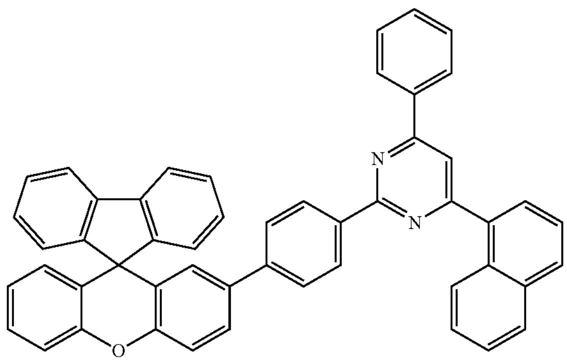
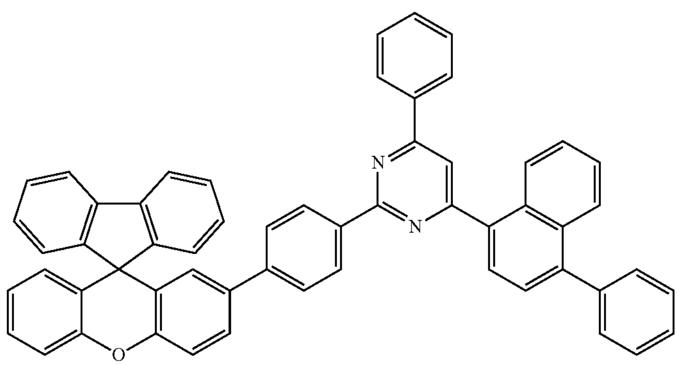
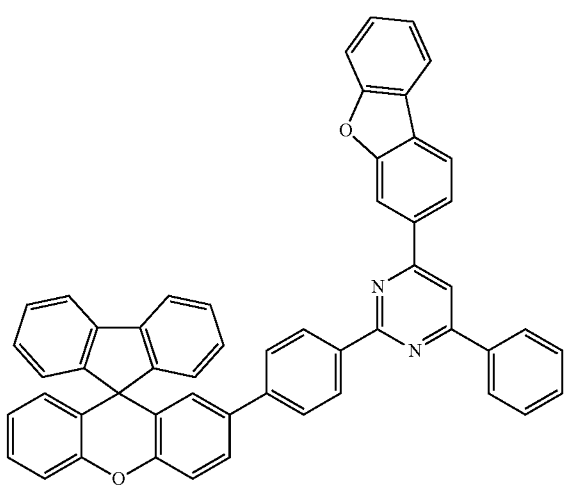

-continued
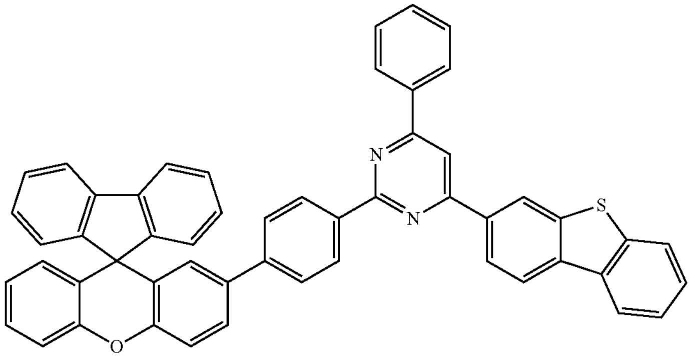
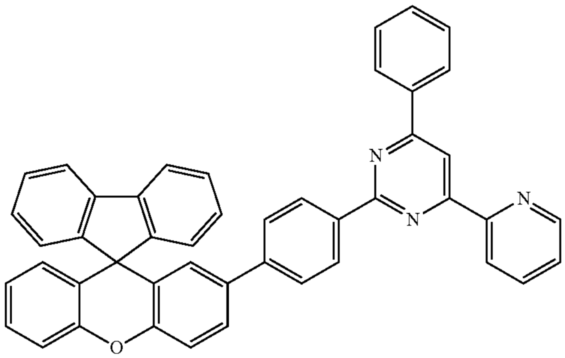
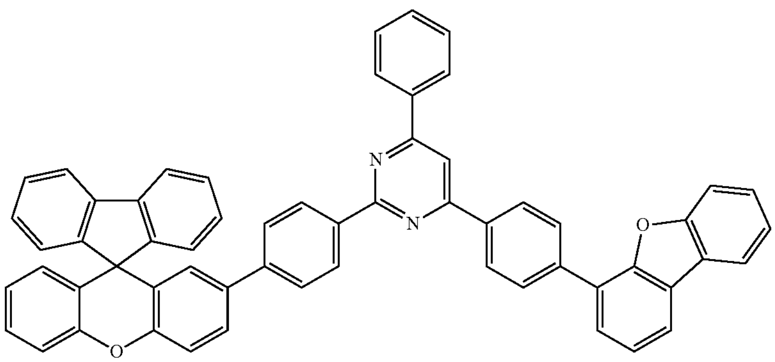
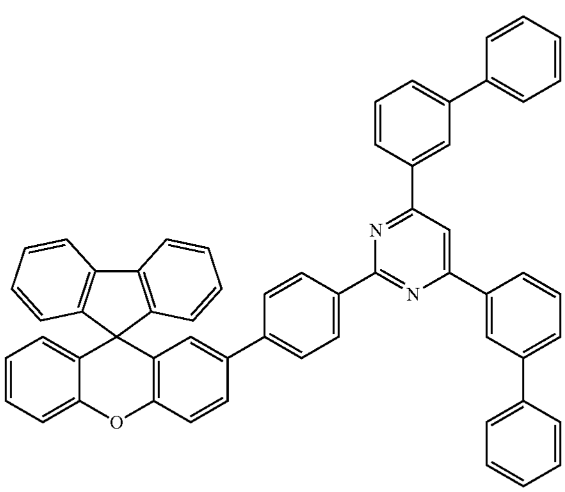

-continued
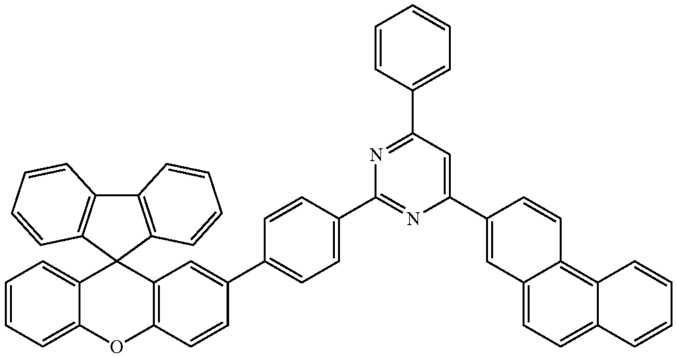
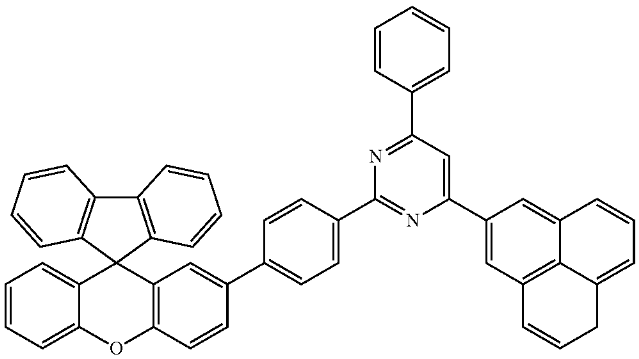
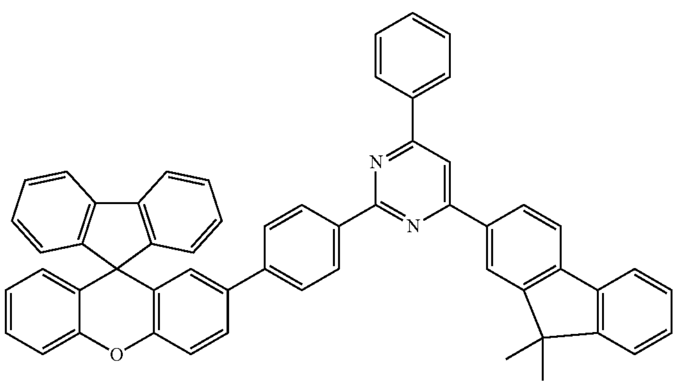
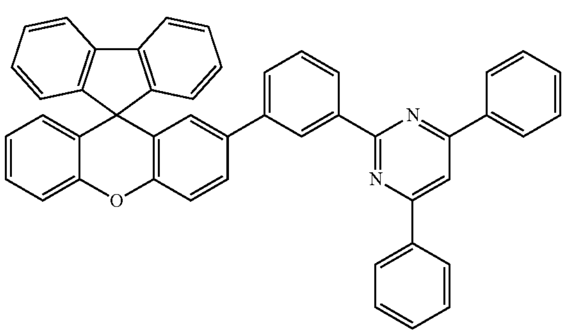
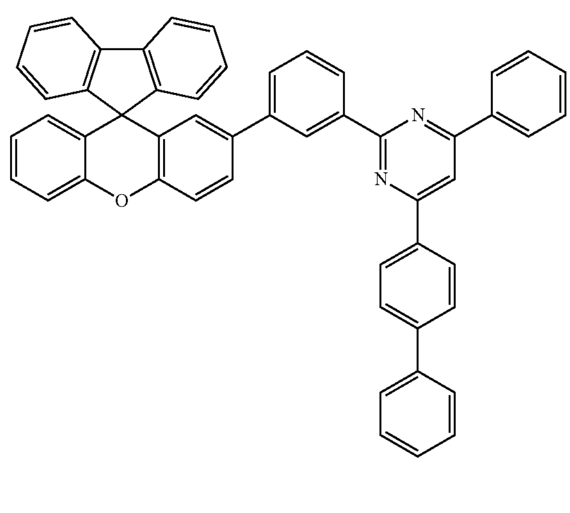

-continued
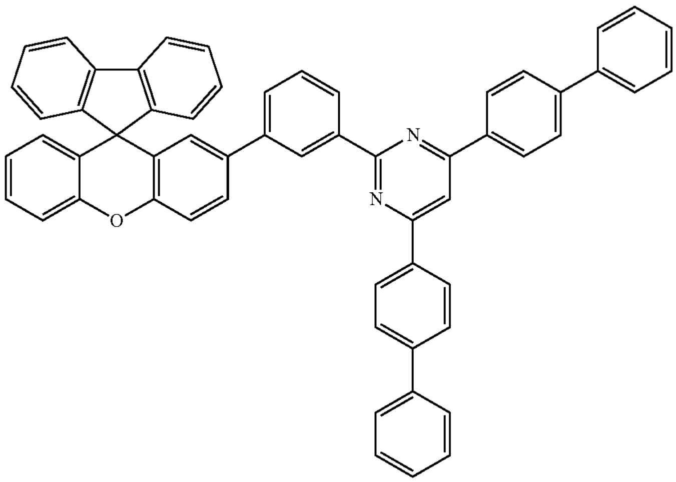
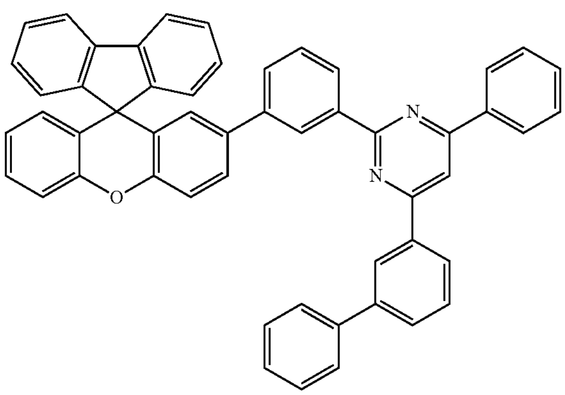
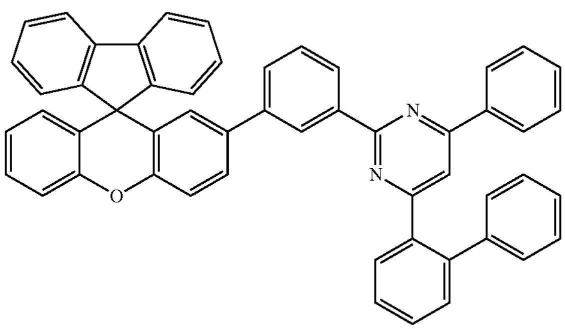
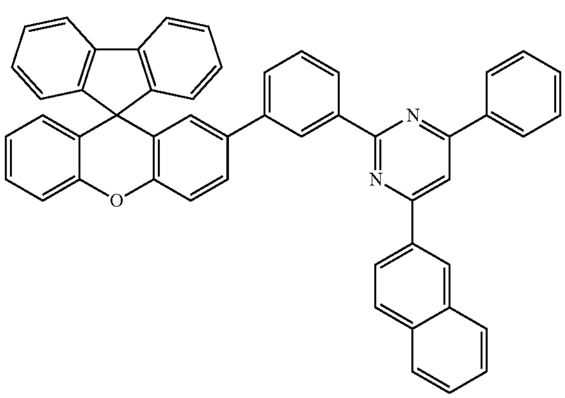
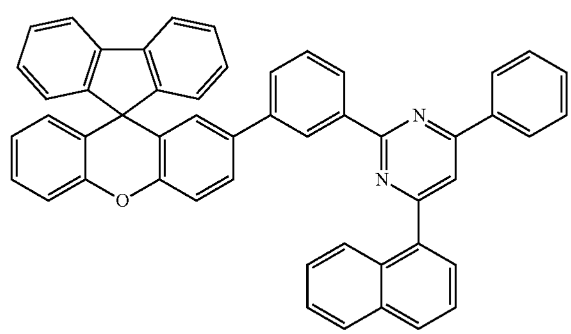

-continued
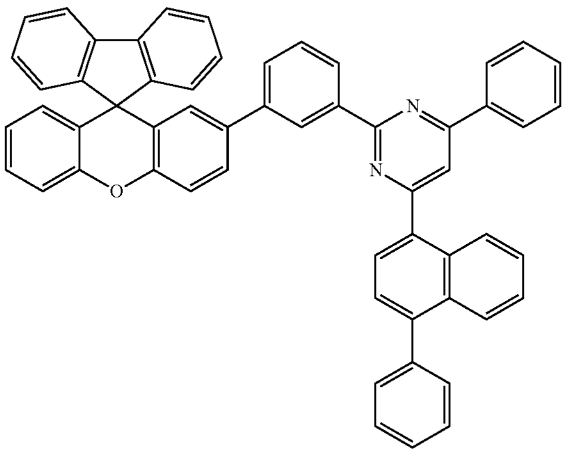
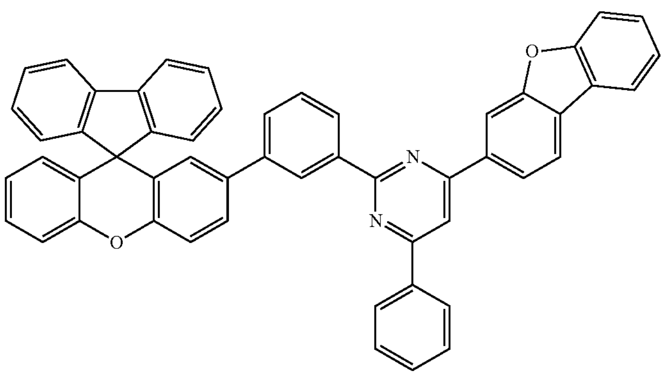
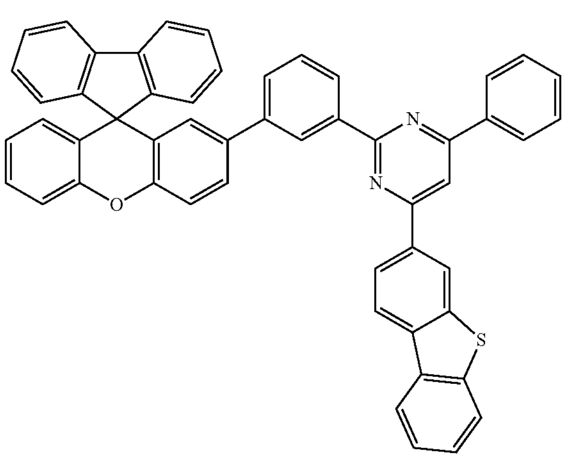
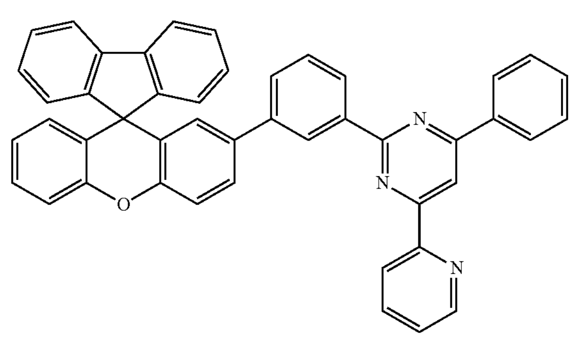

-continued
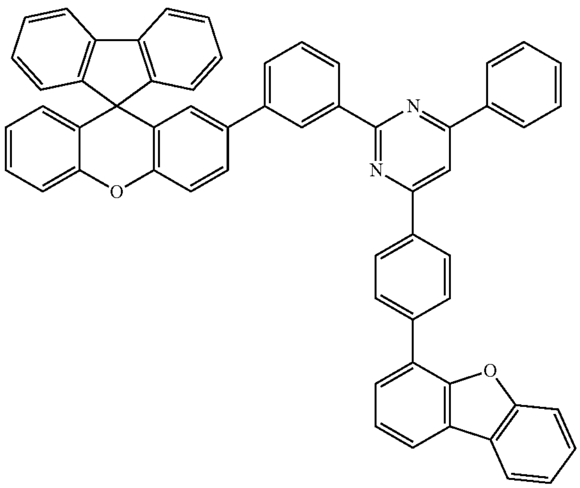
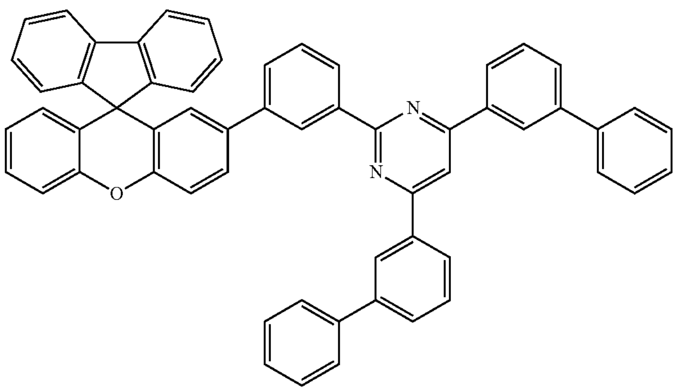
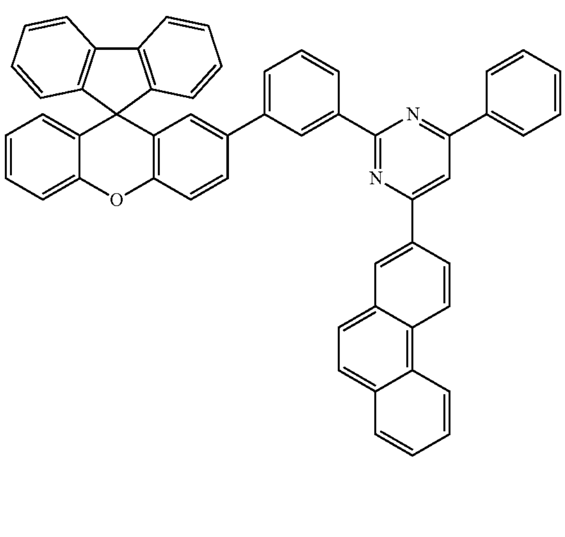
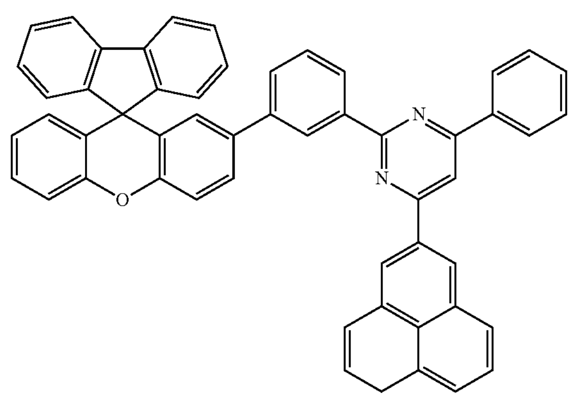

-continued
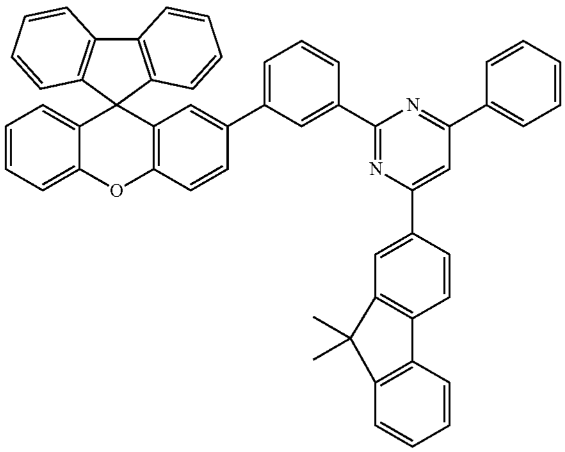
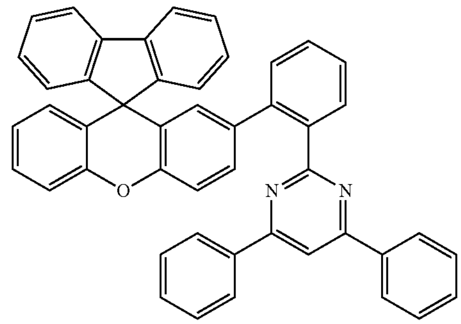
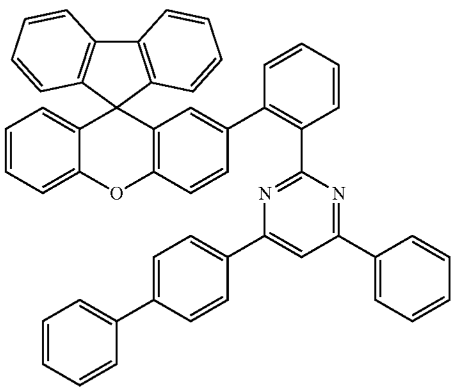
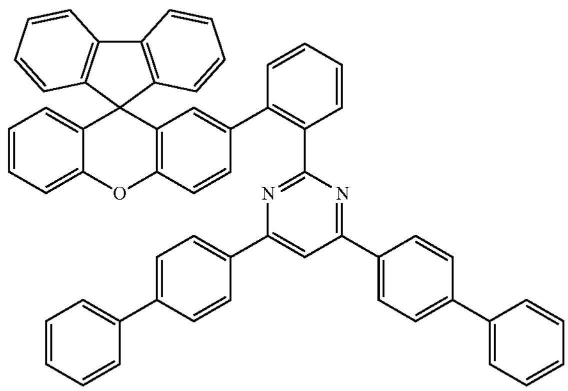
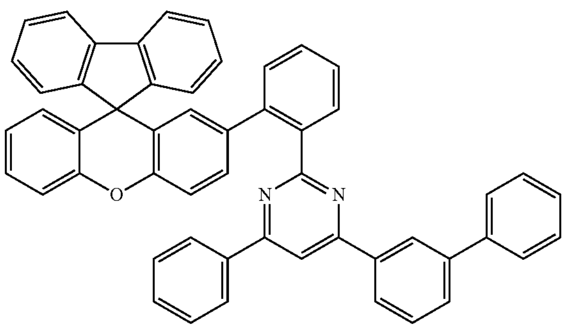
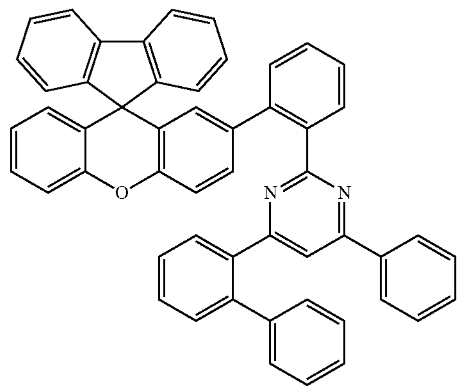
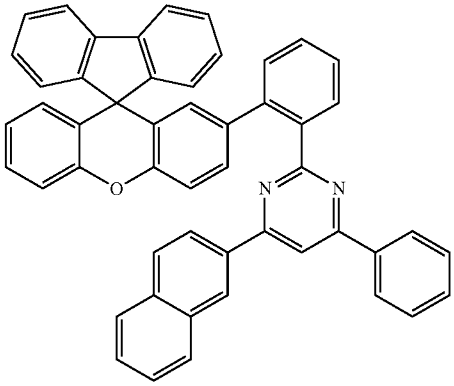
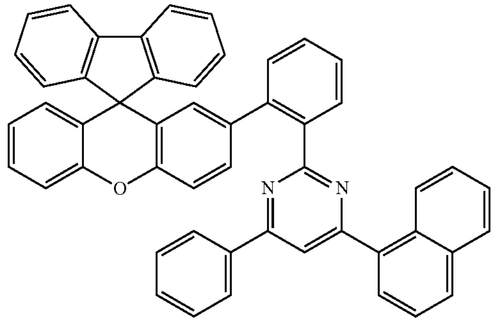

-continued
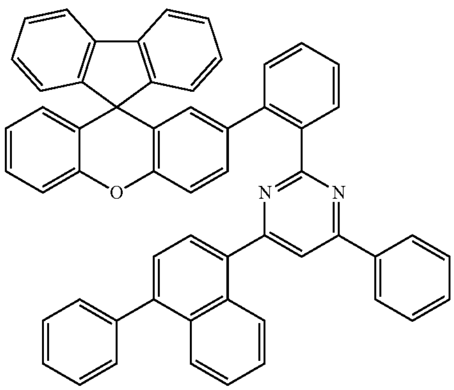
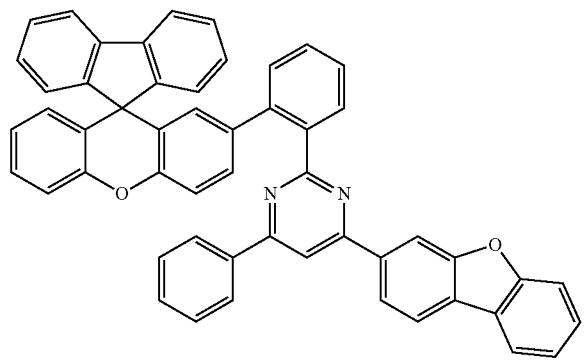
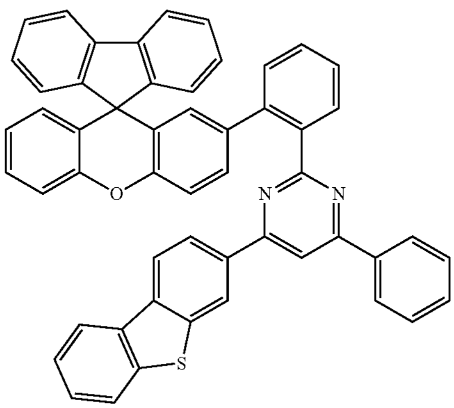
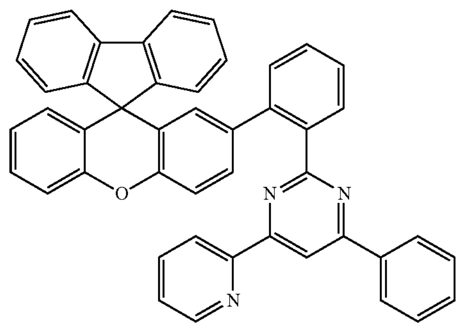
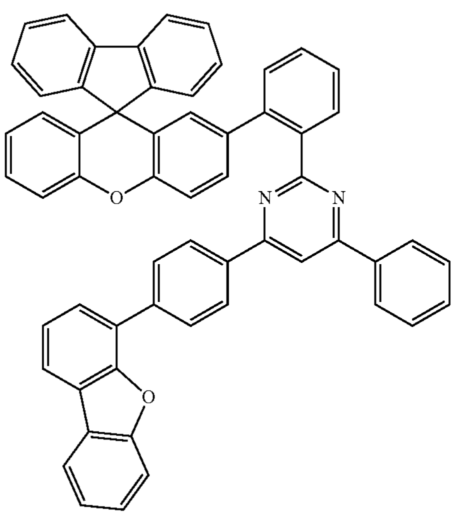
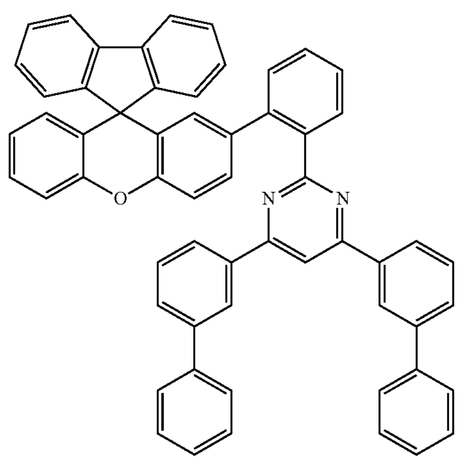
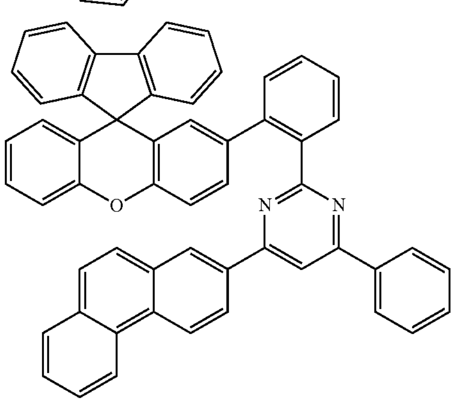
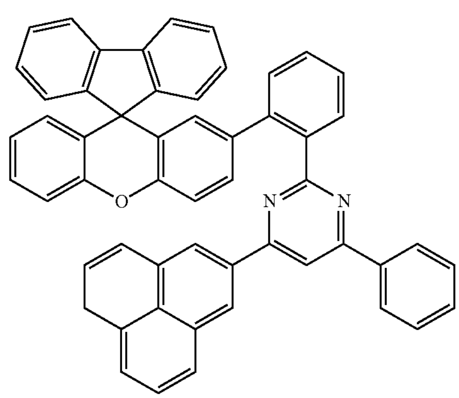

-continued
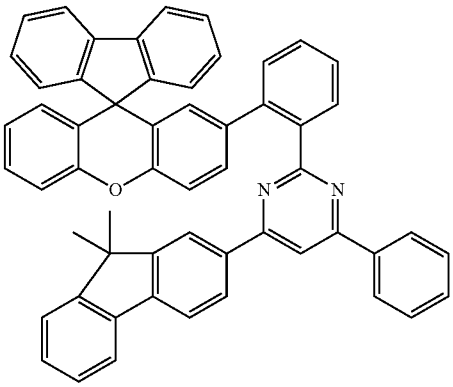
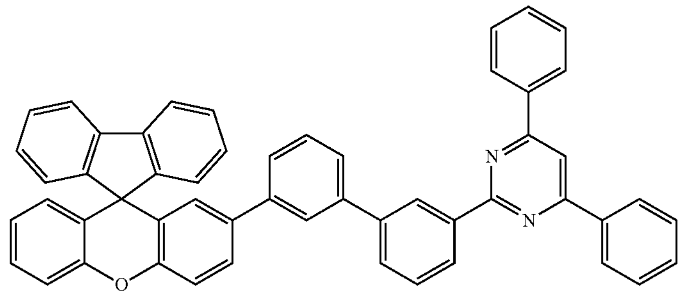
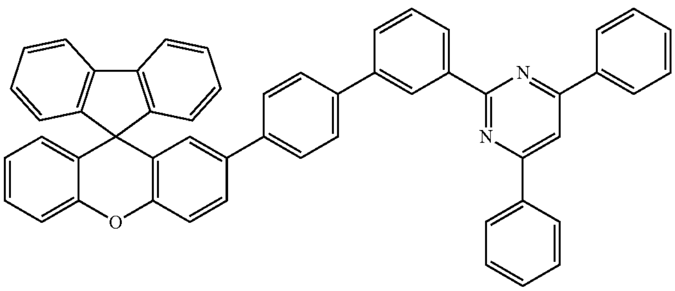
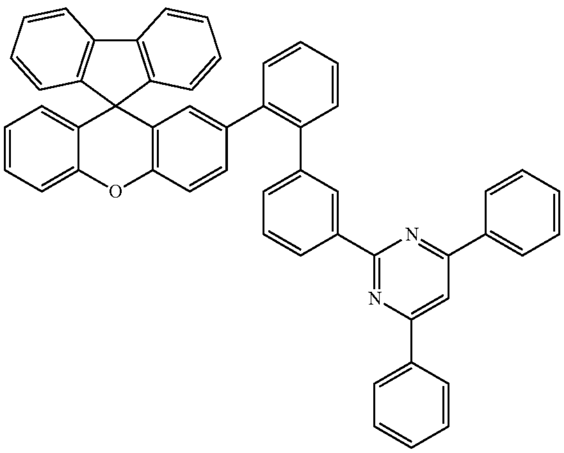
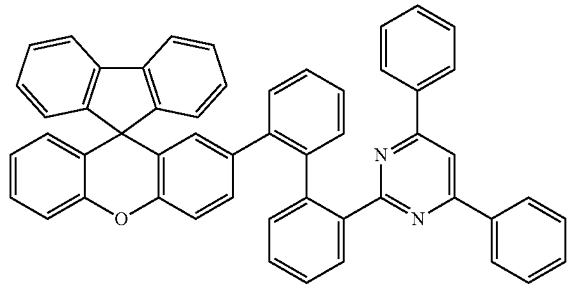
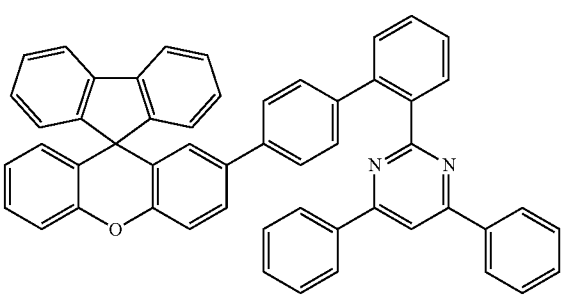
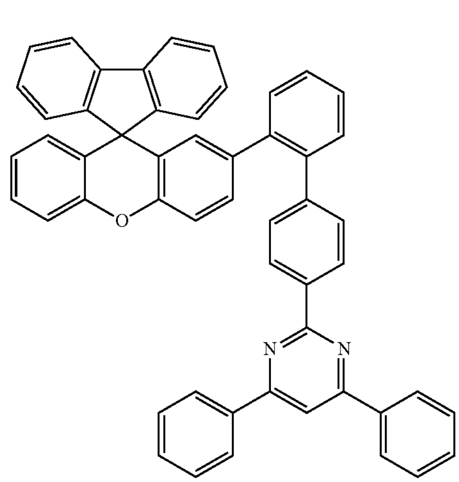

-continued
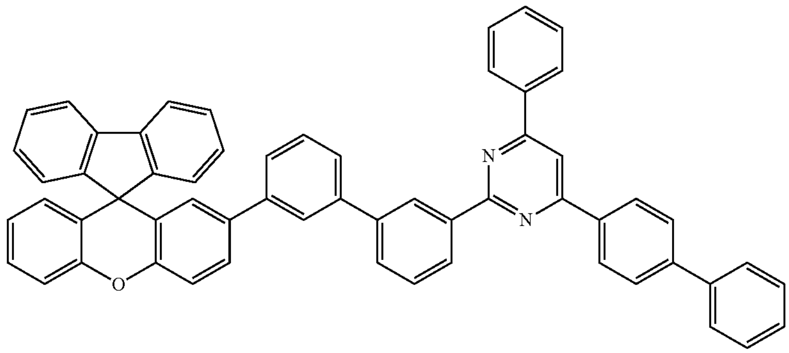
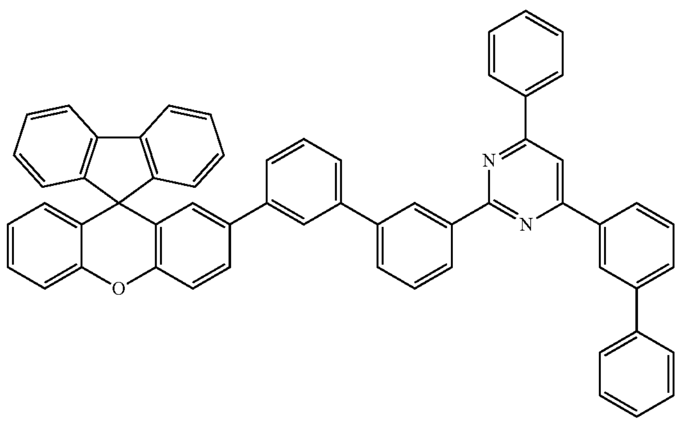
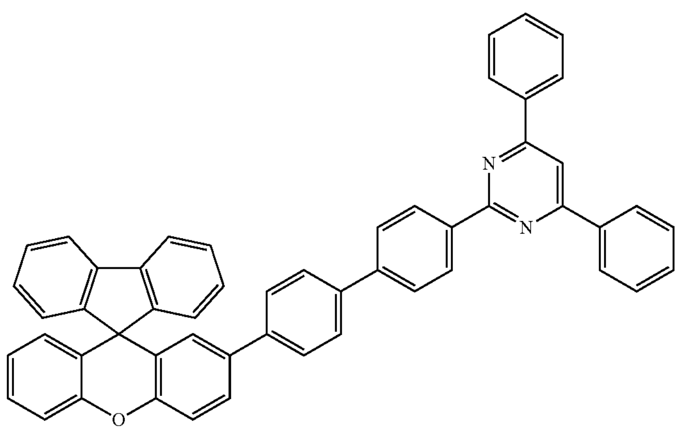
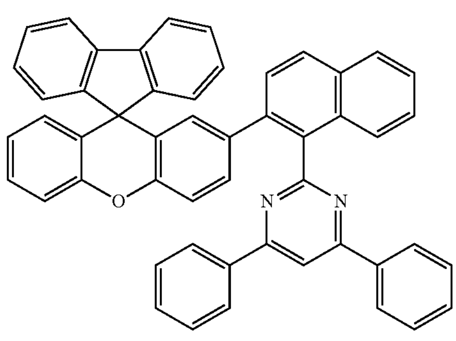
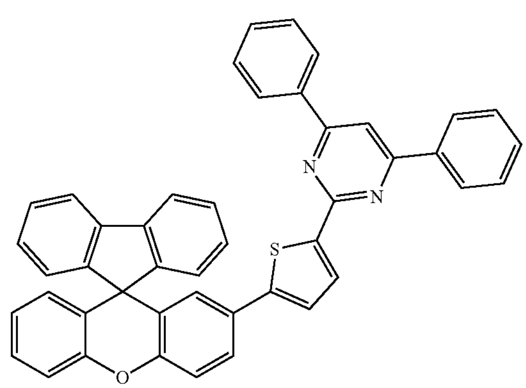

-continued
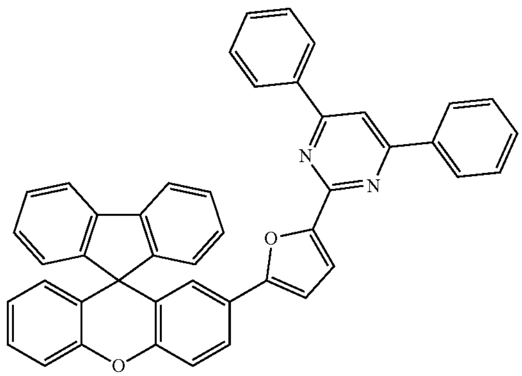
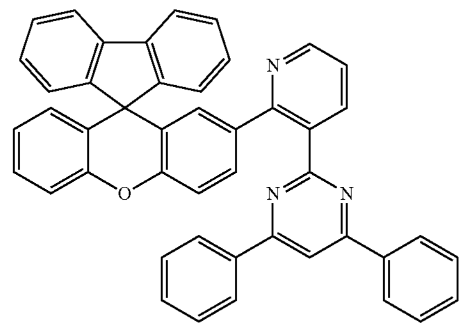
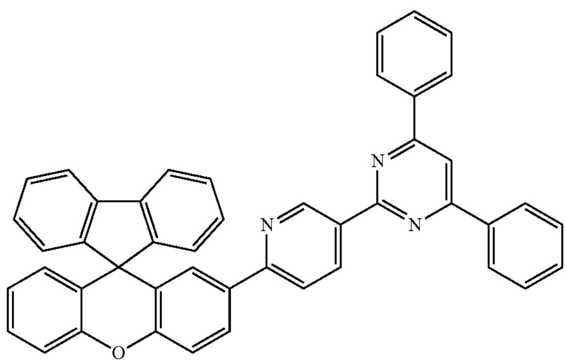
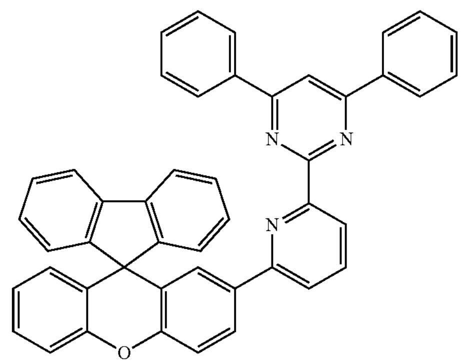
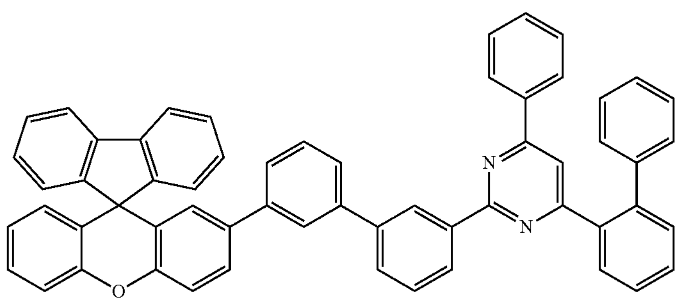
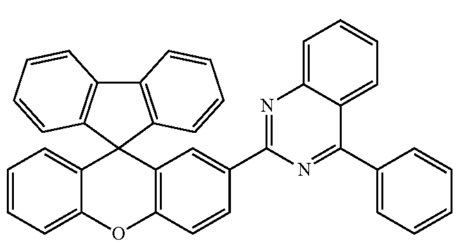
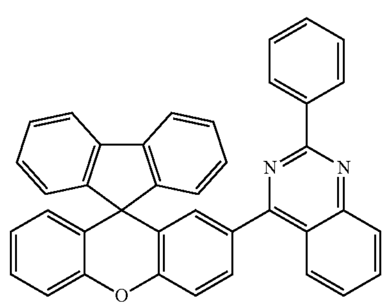
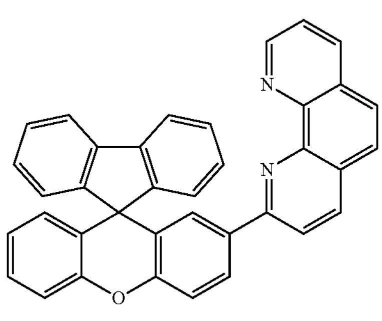
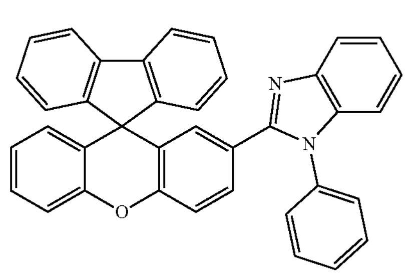

-continued
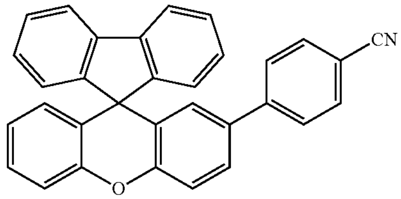
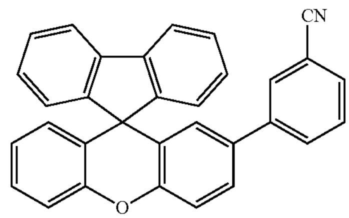
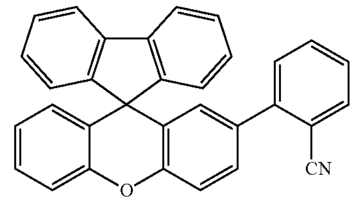
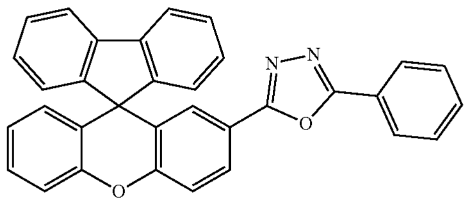
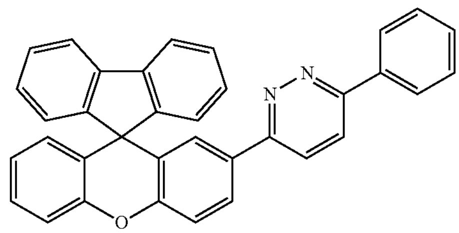
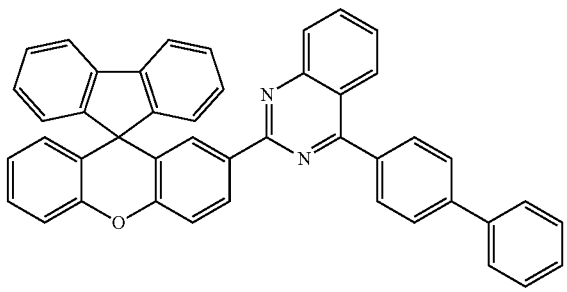
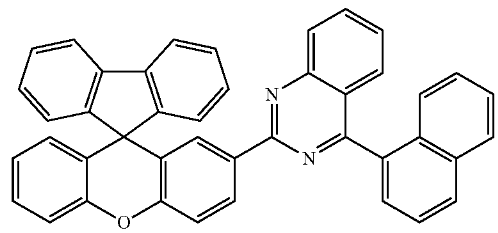
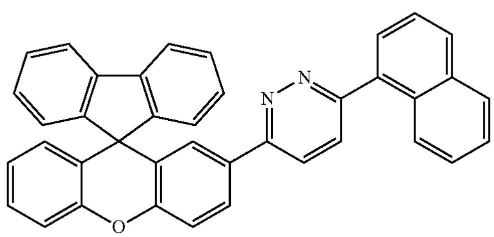
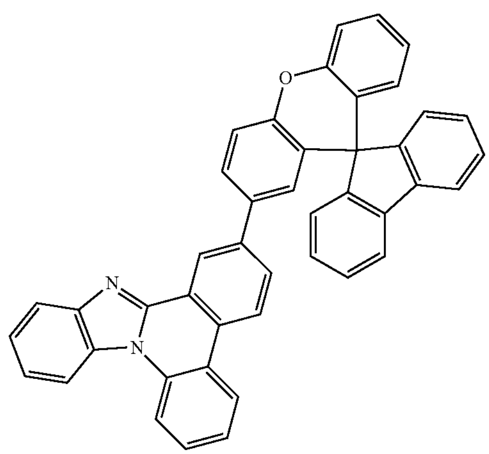
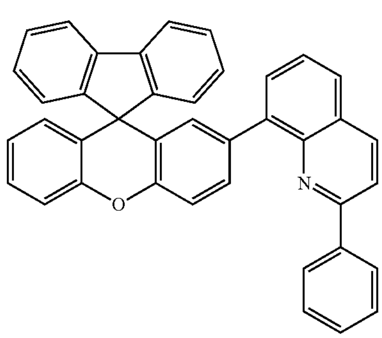
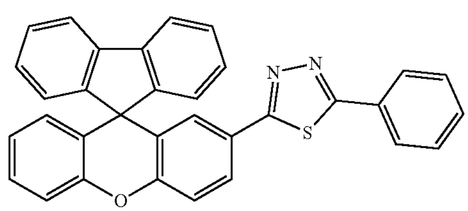

-continued
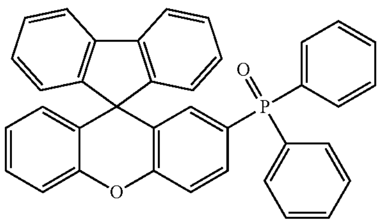
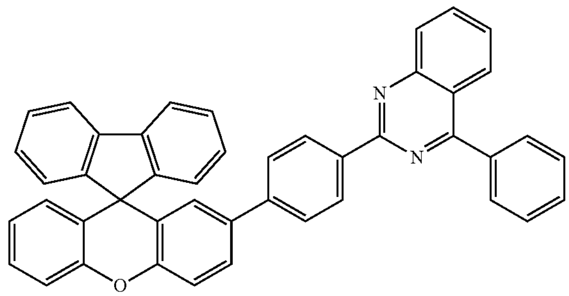
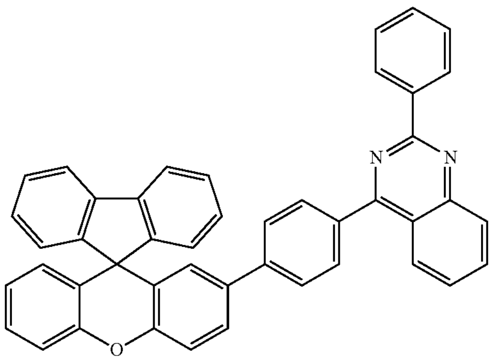
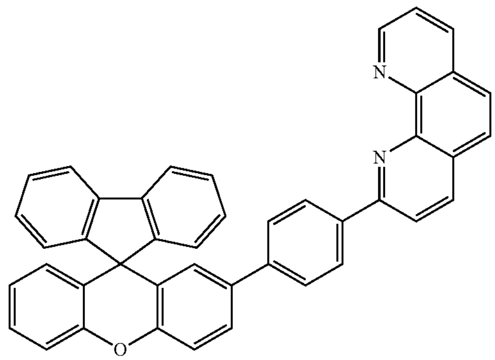
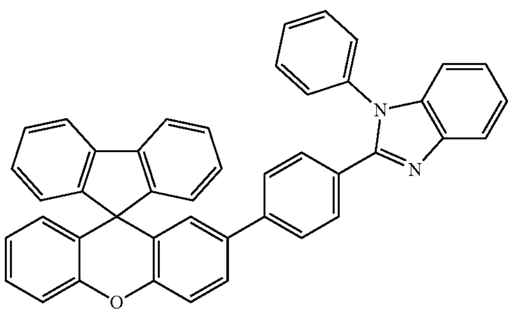
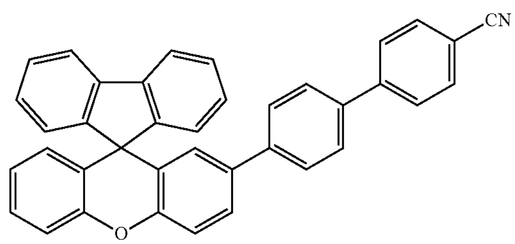
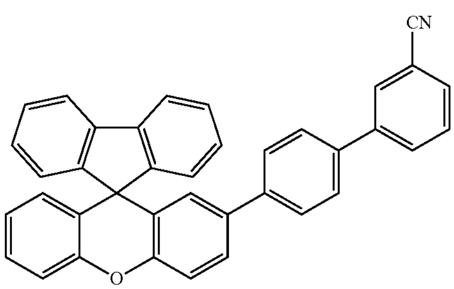
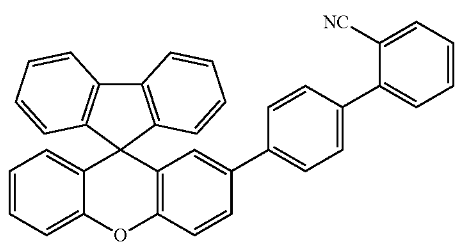
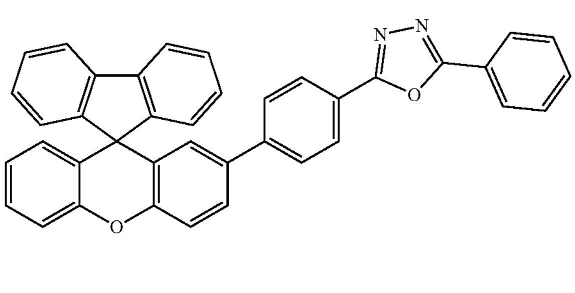

-continued
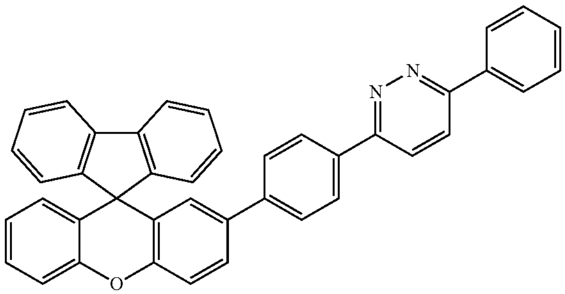
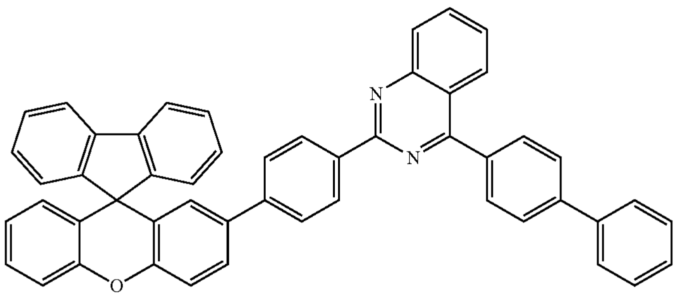
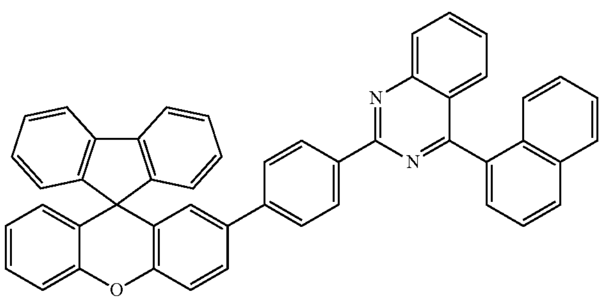
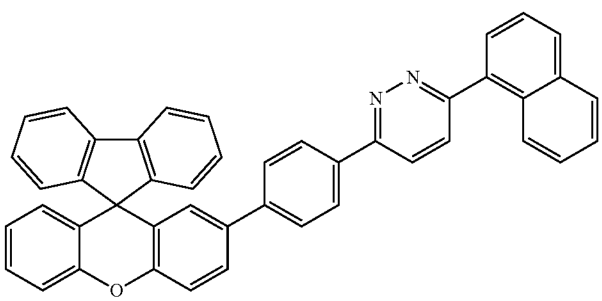
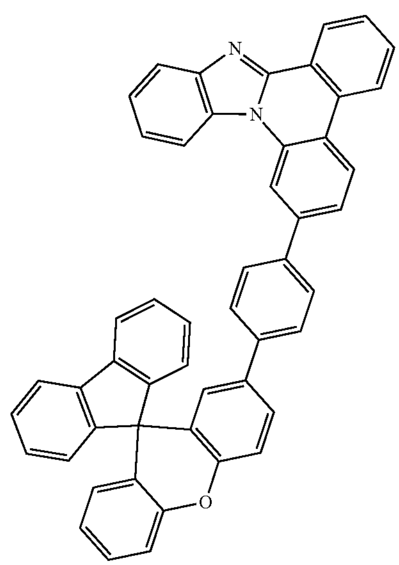
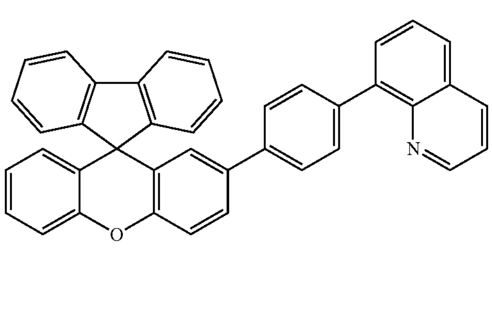
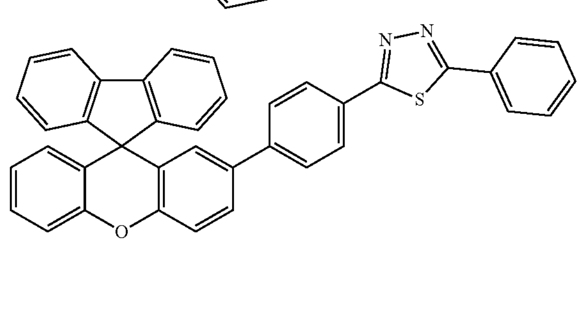

-continued
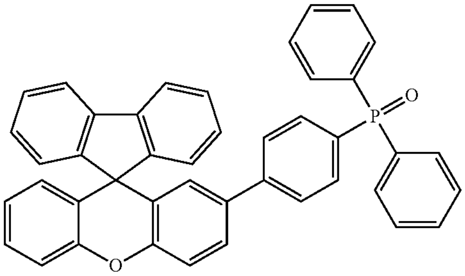
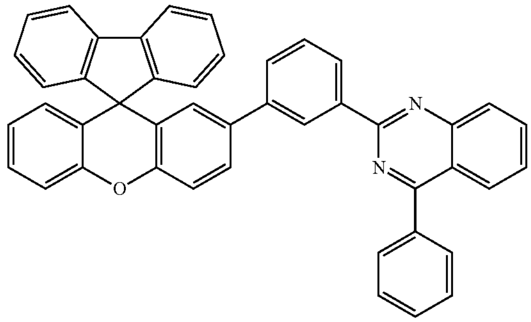
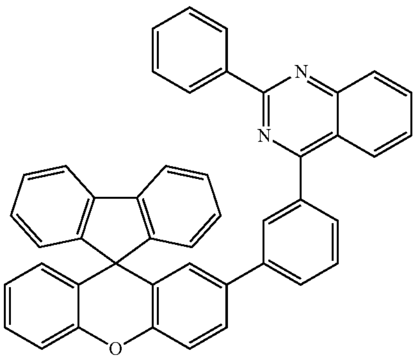
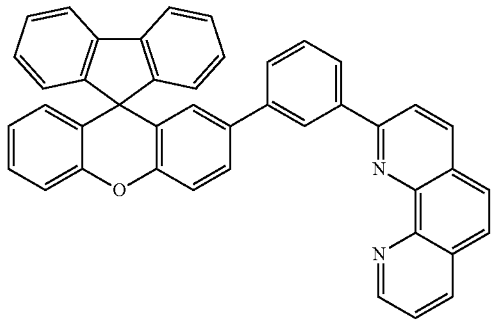
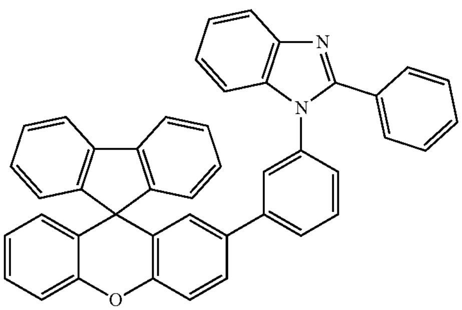
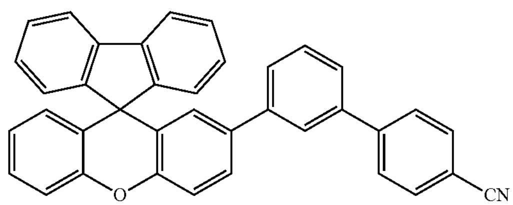
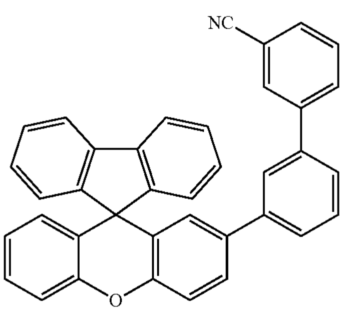
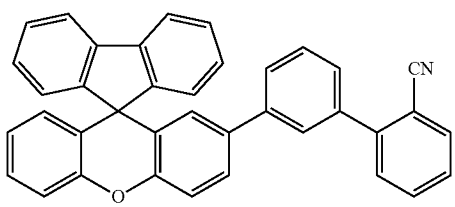
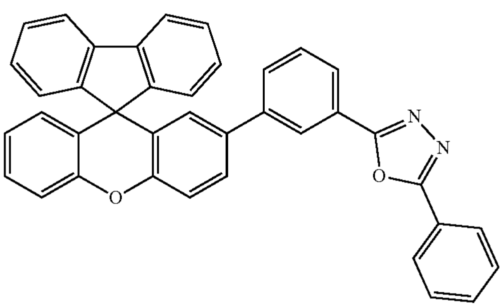
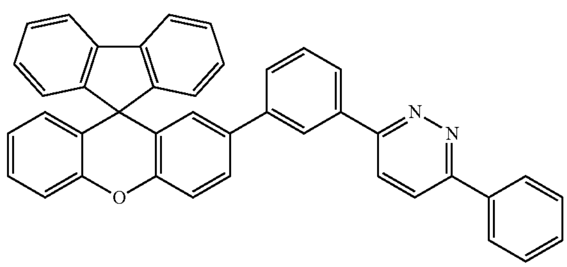

-continued
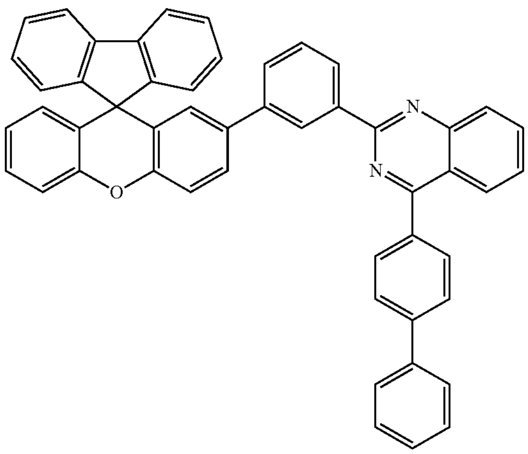
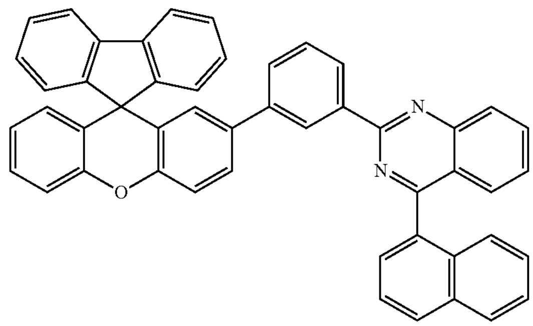
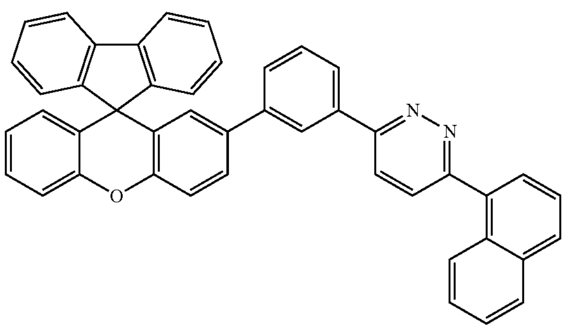
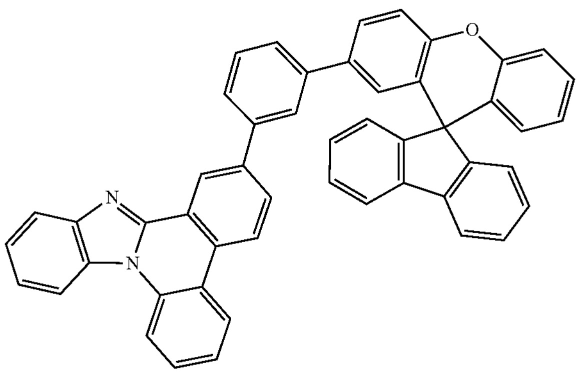
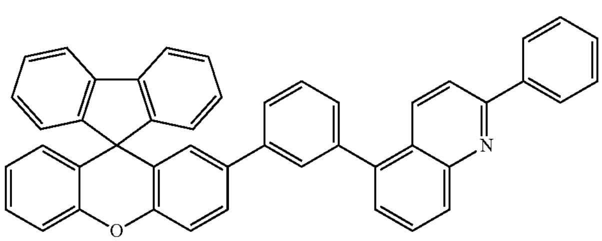
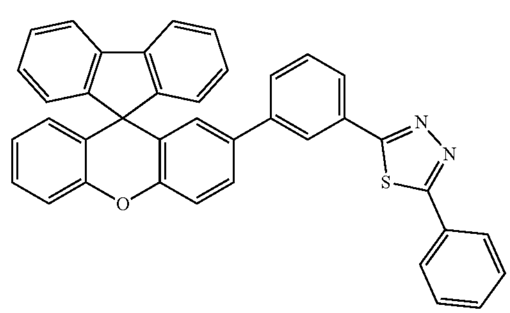
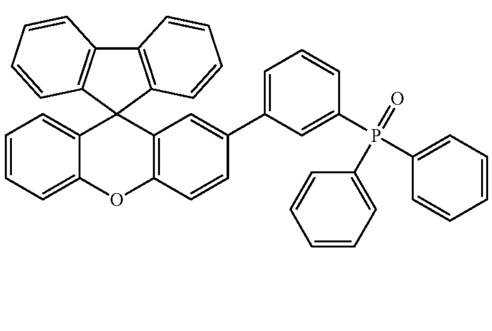

-continued
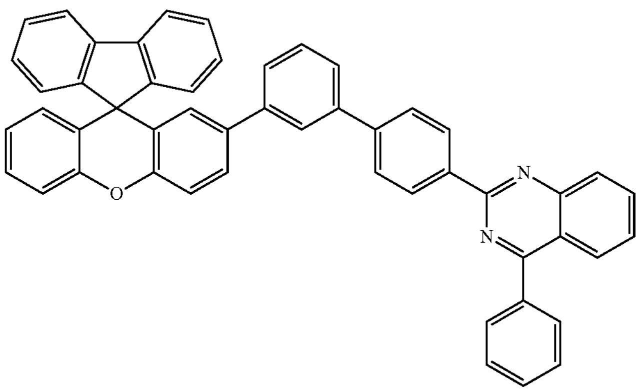
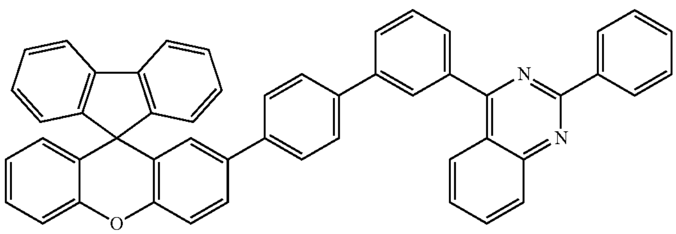
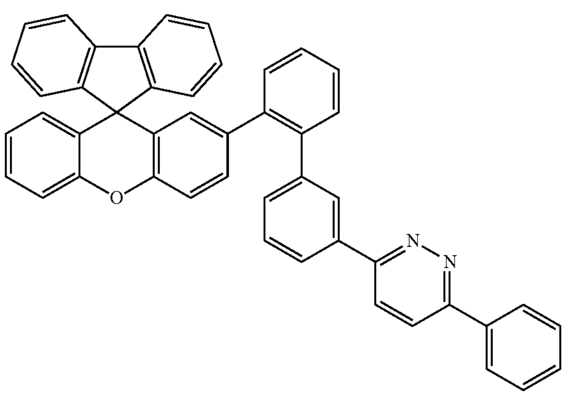
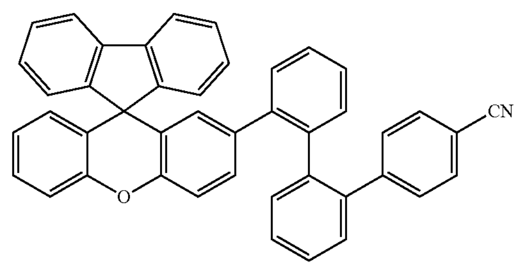
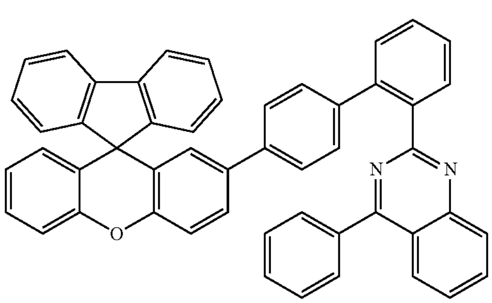
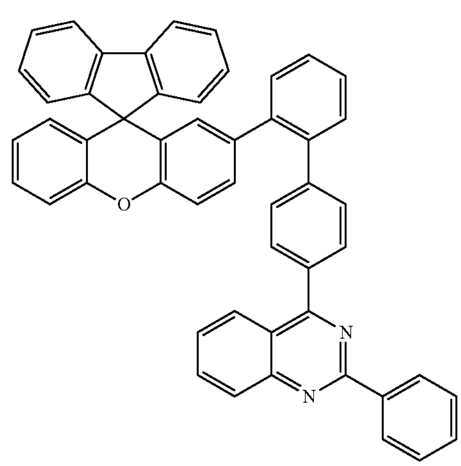

-continued
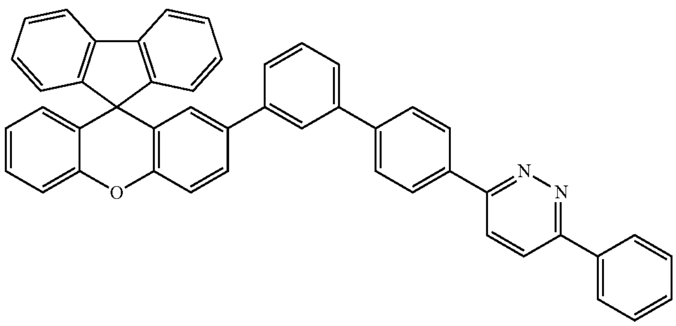
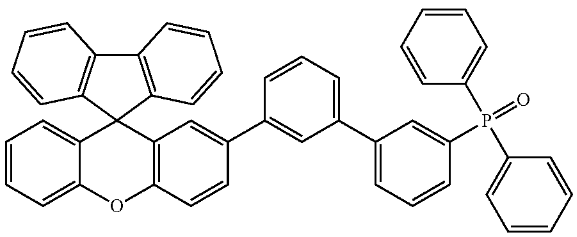
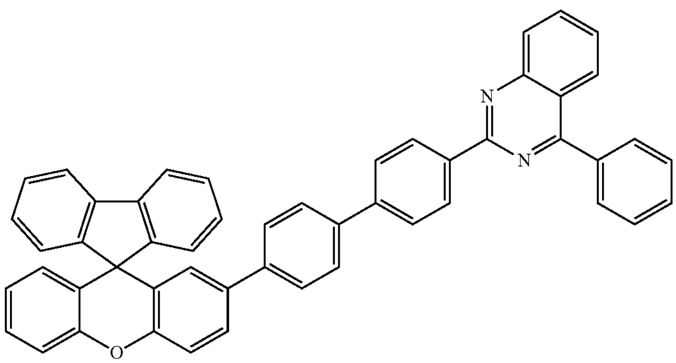
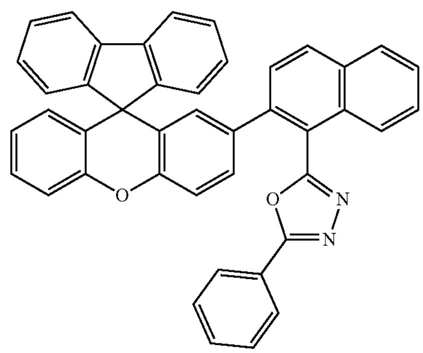
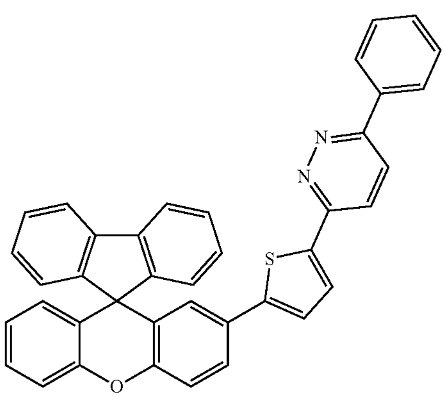
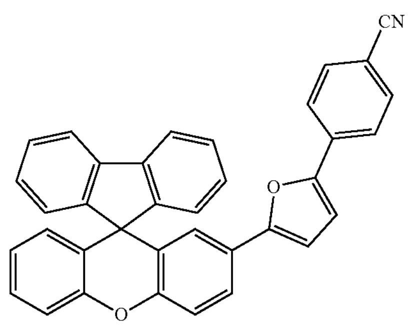
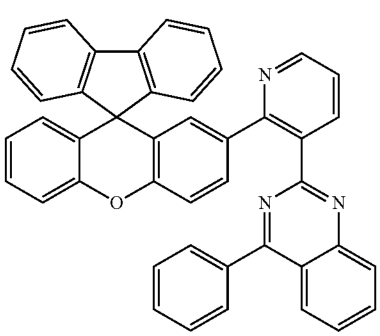
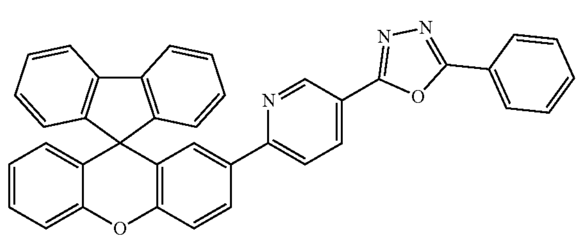

-continued
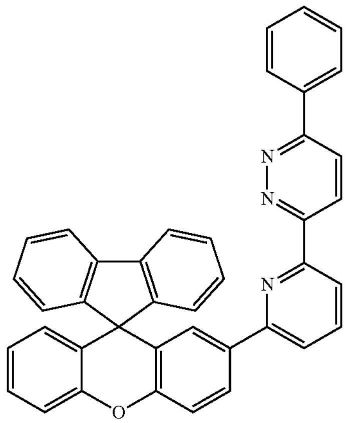
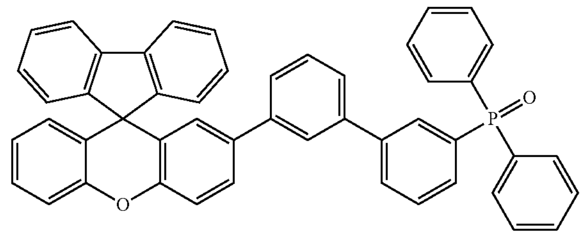
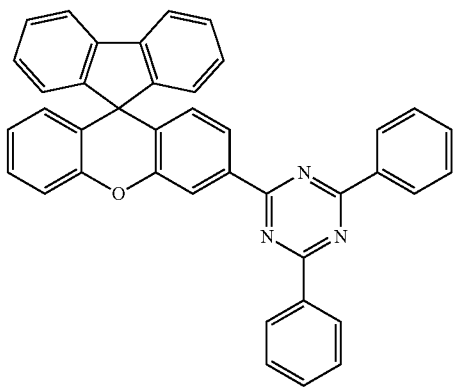
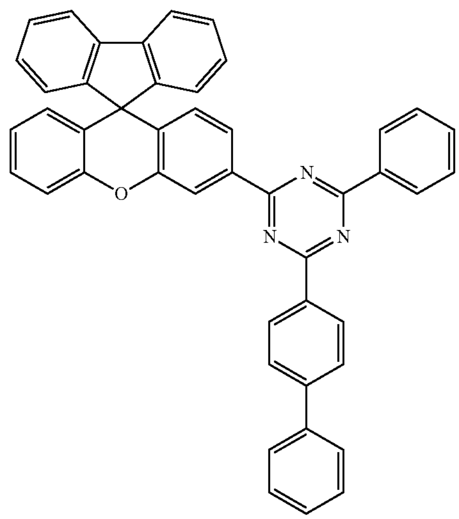
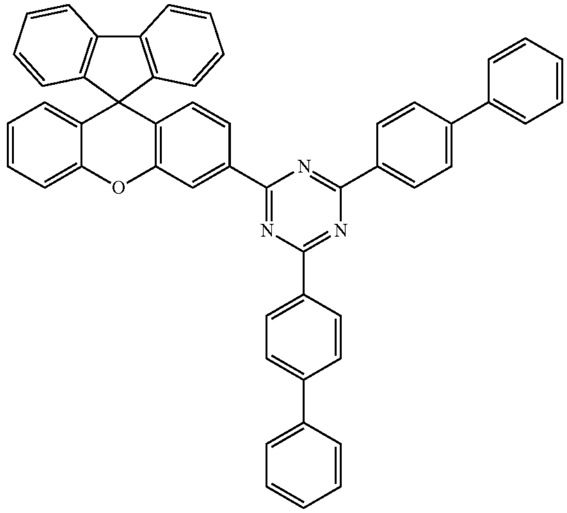
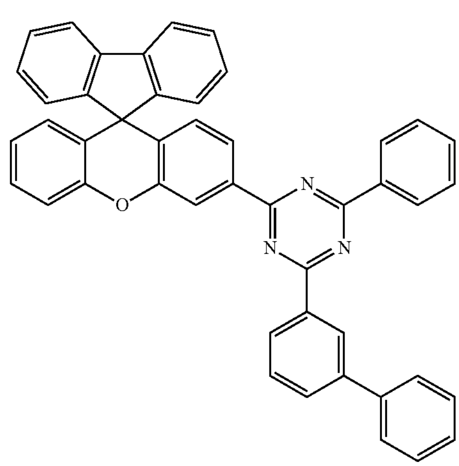

-continued
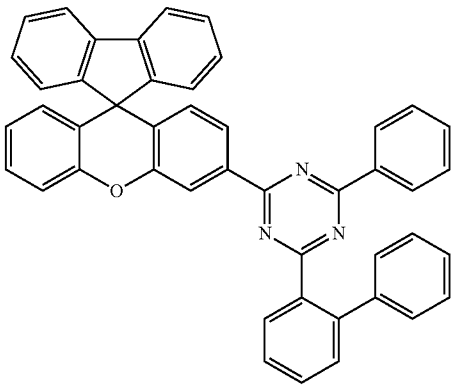
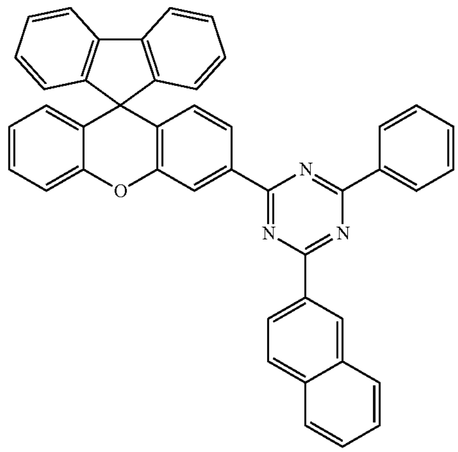
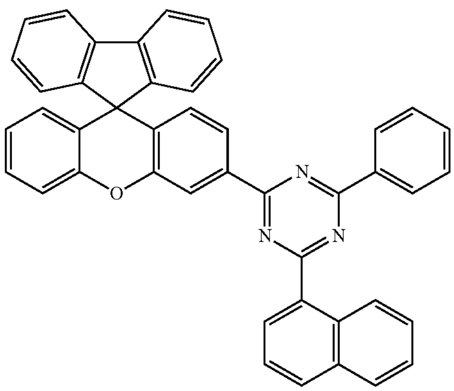
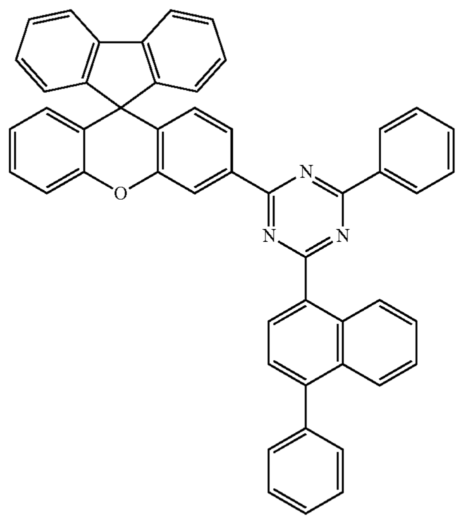
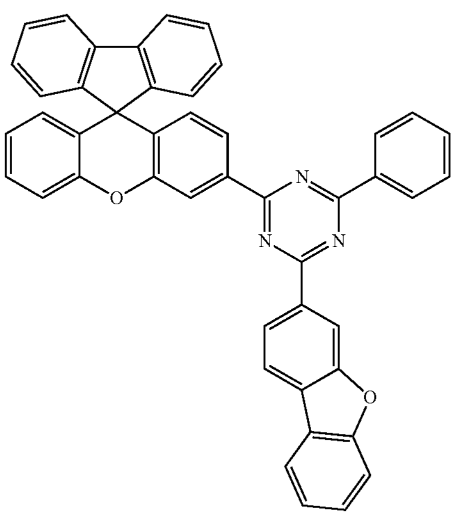
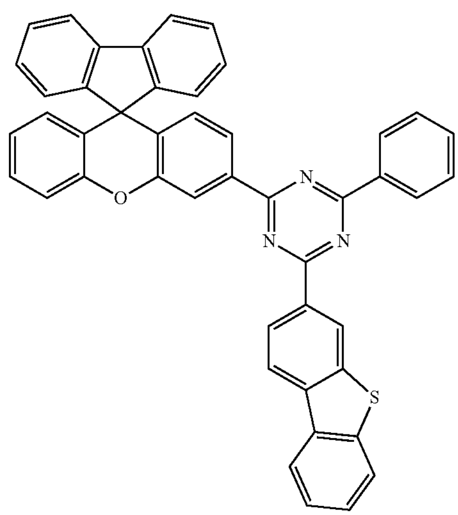

-continued
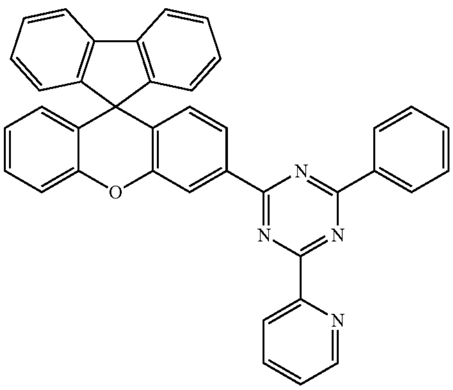
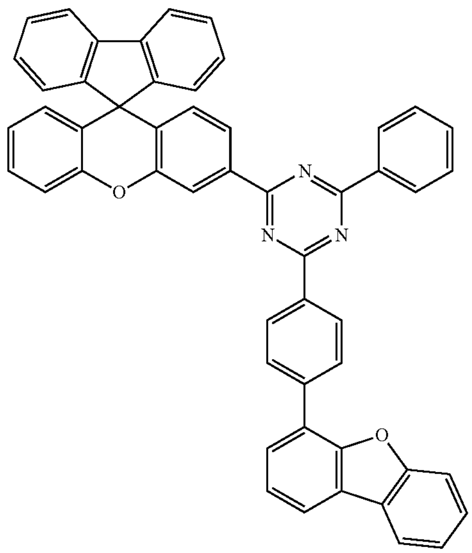
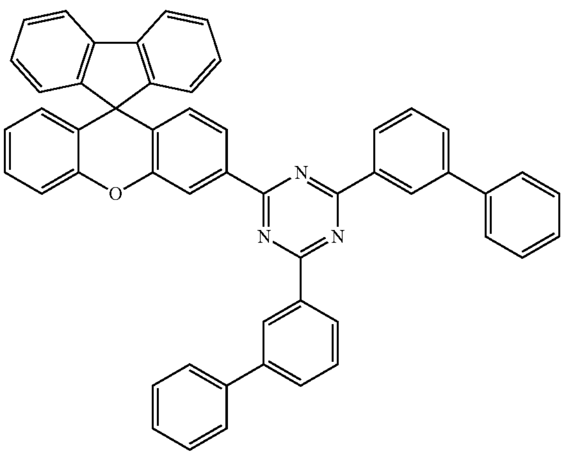
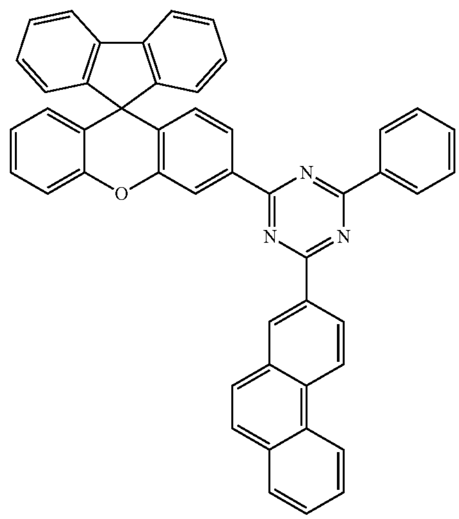
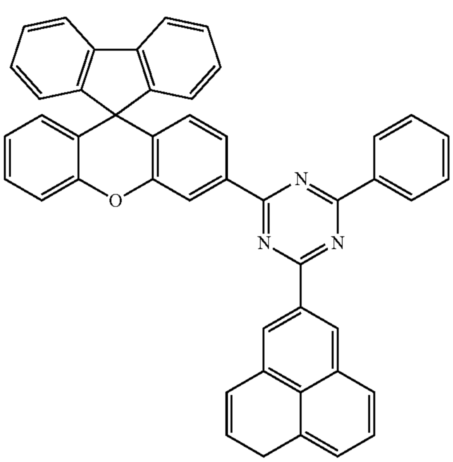
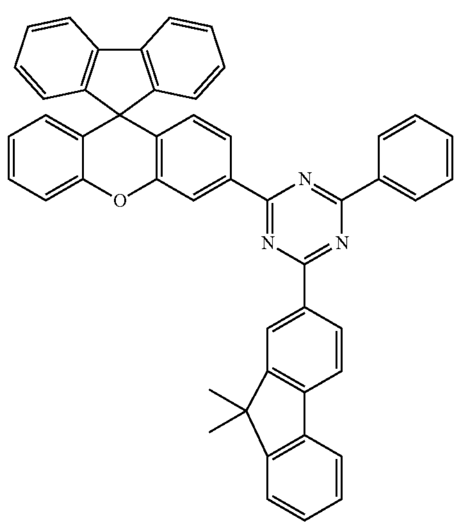

-continued
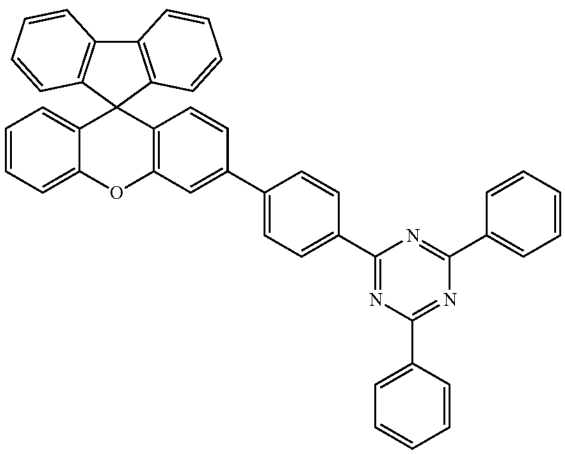
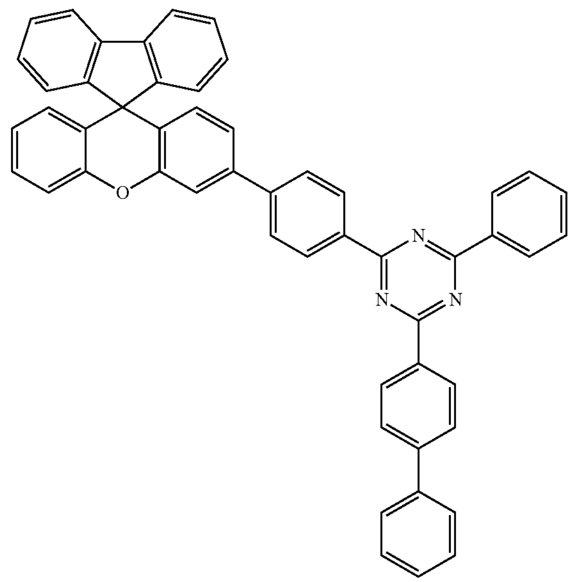
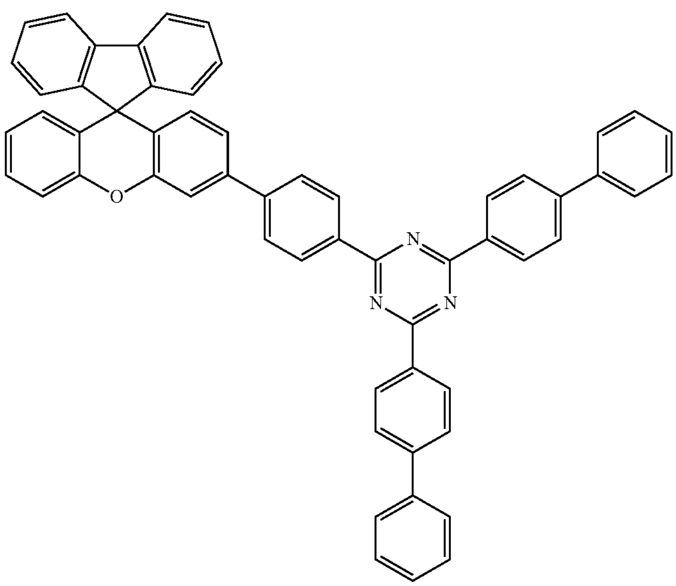
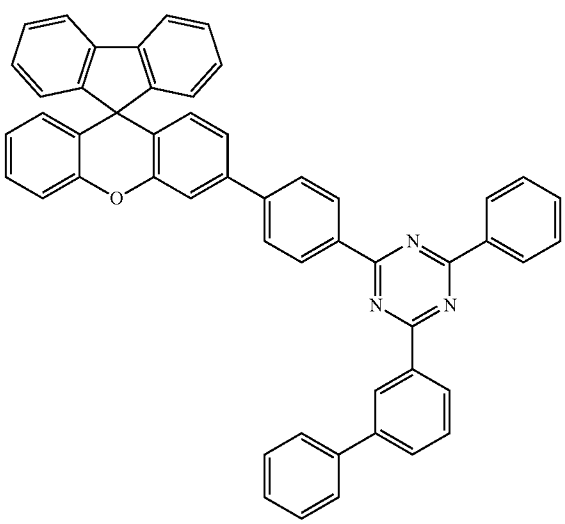

-continued
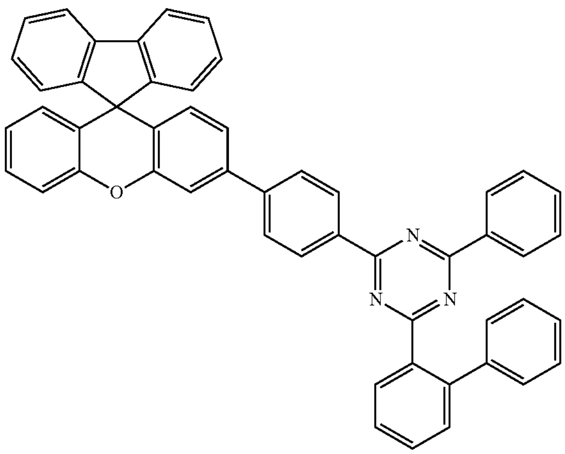
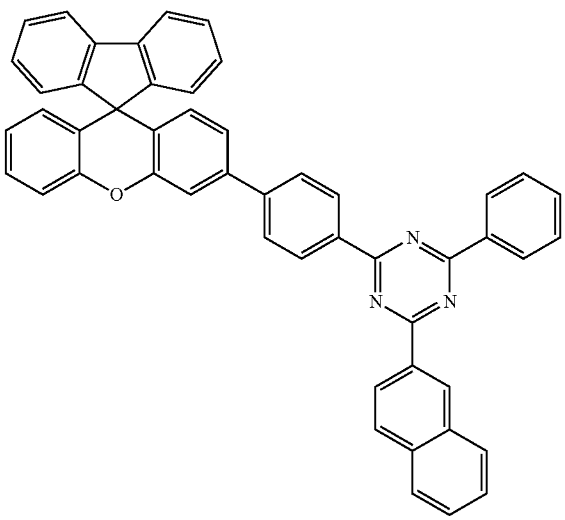
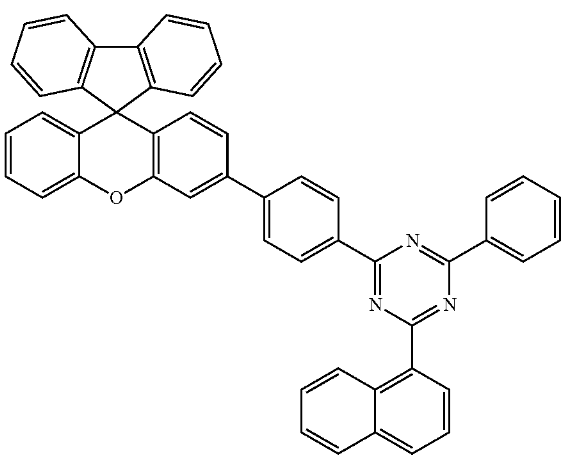

-continued
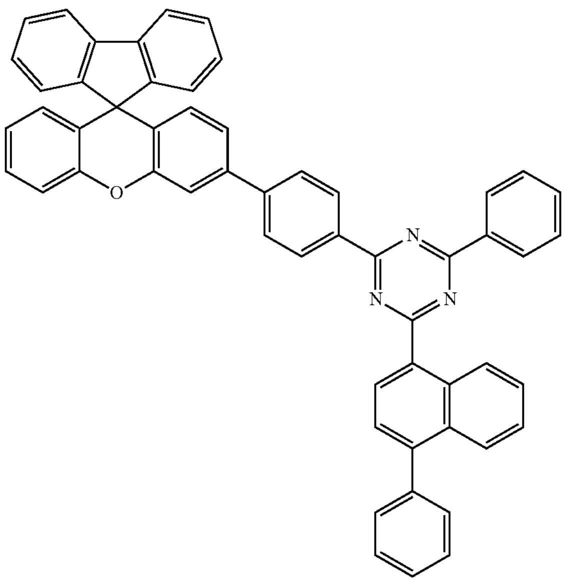
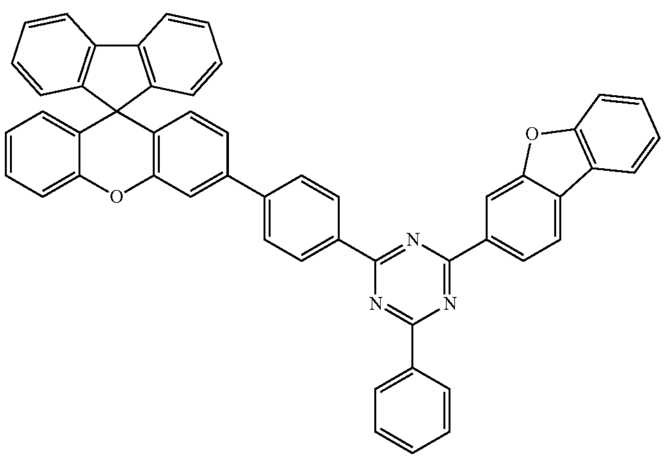
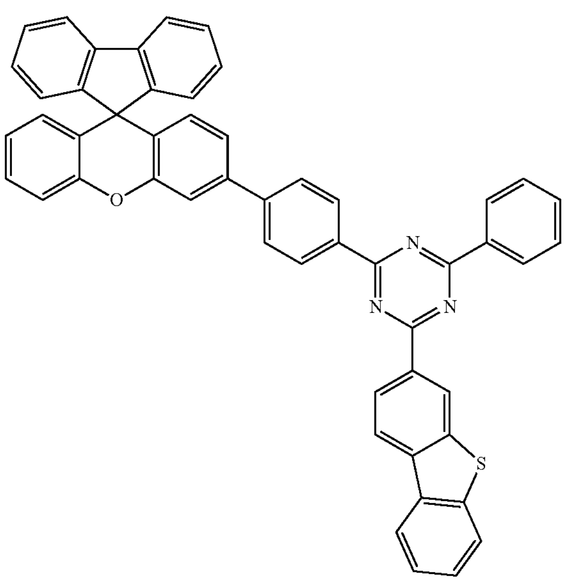
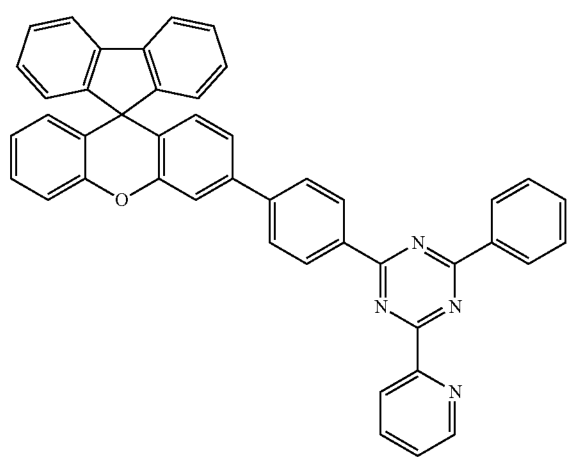

-continued
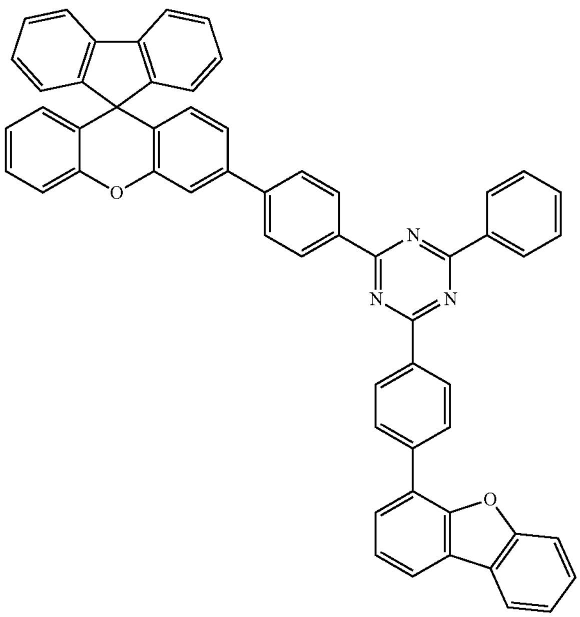
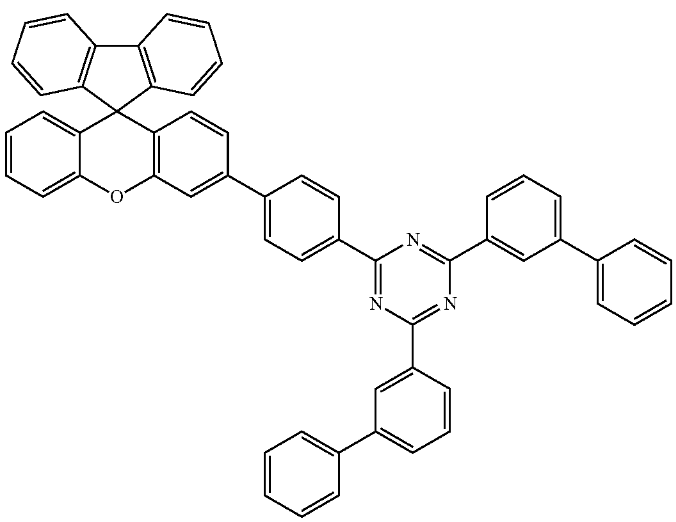
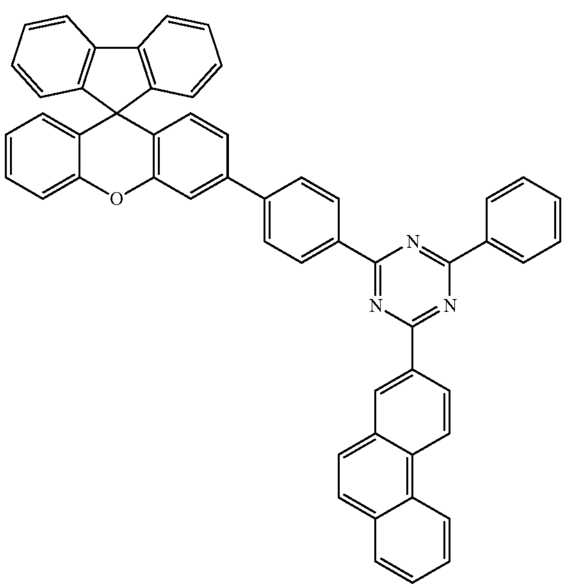
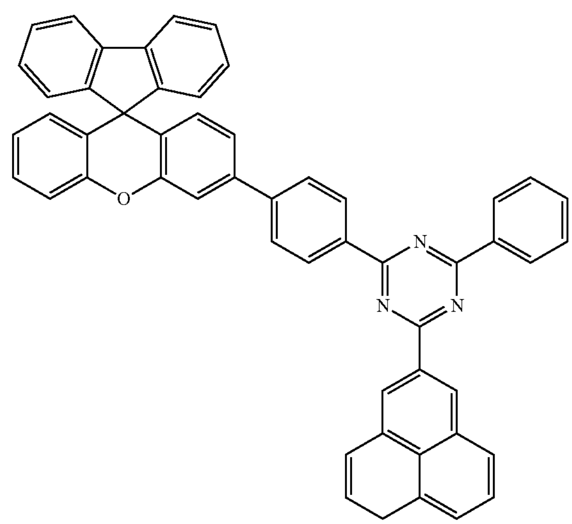

-continued
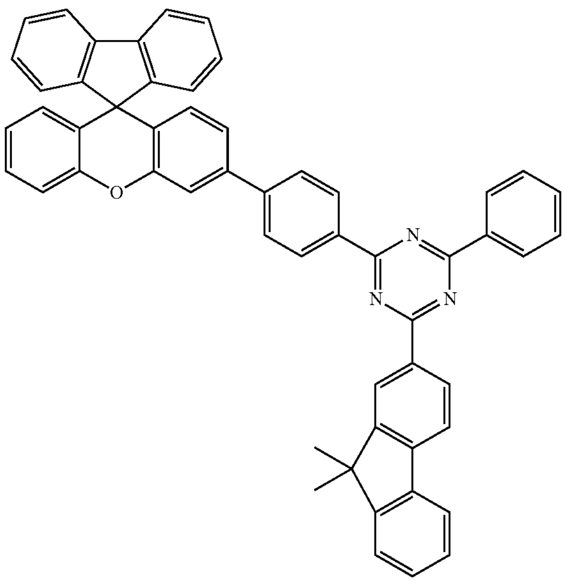
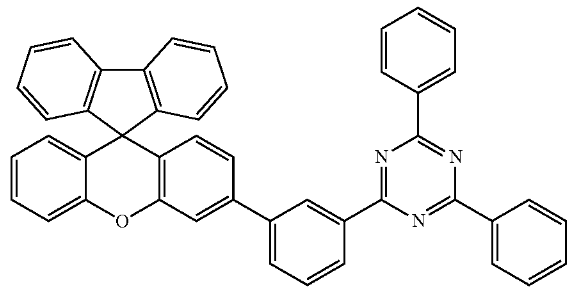
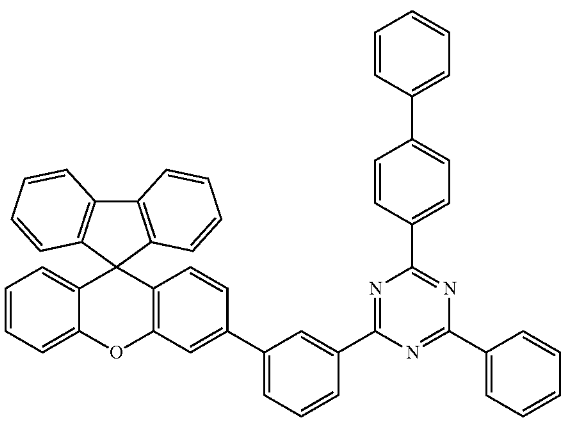
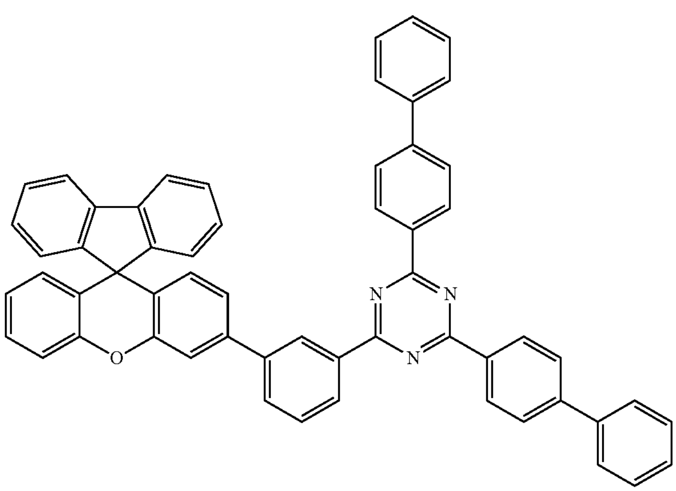
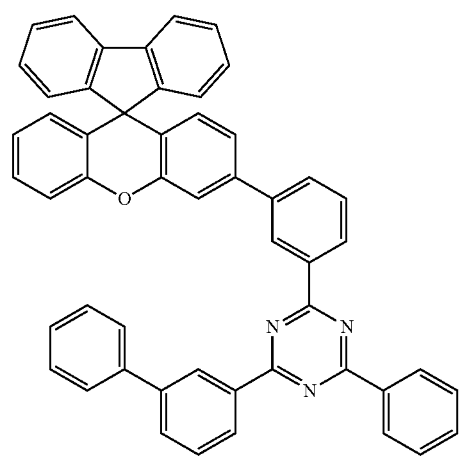

-continued
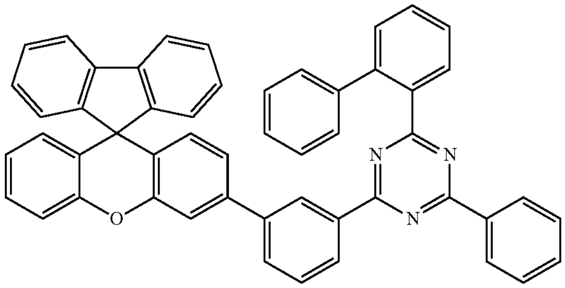
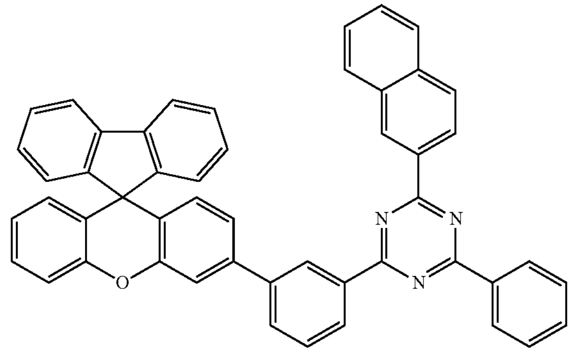
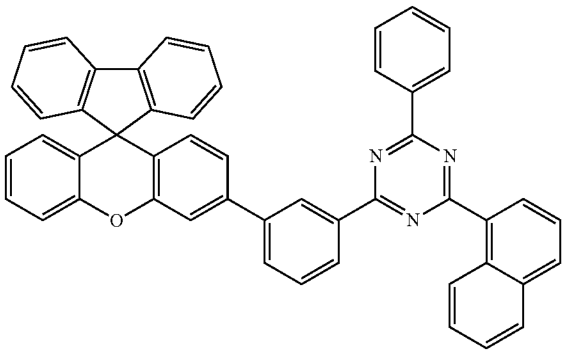
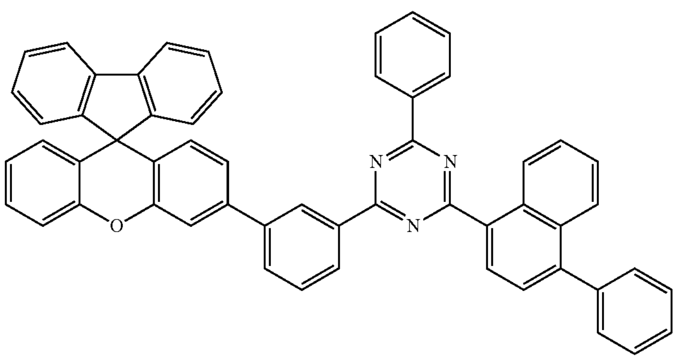
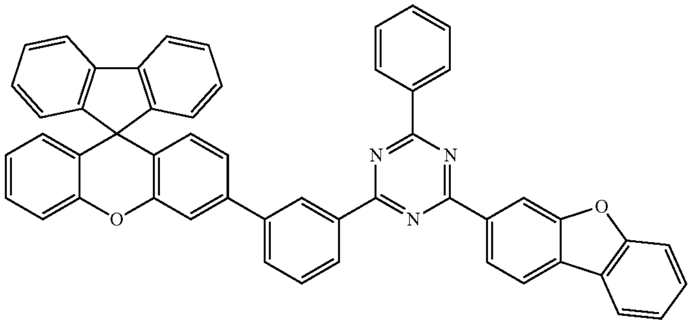

-continued
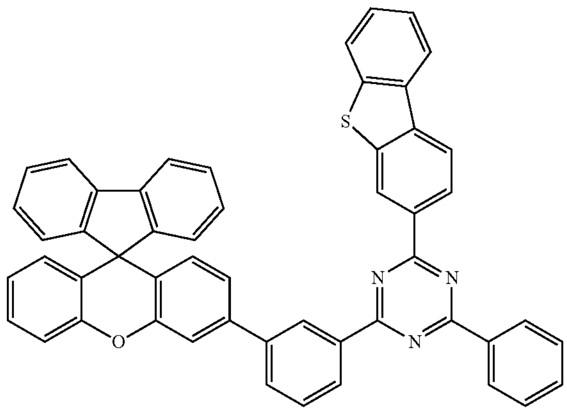
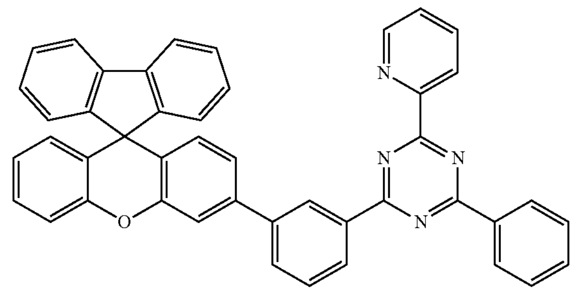
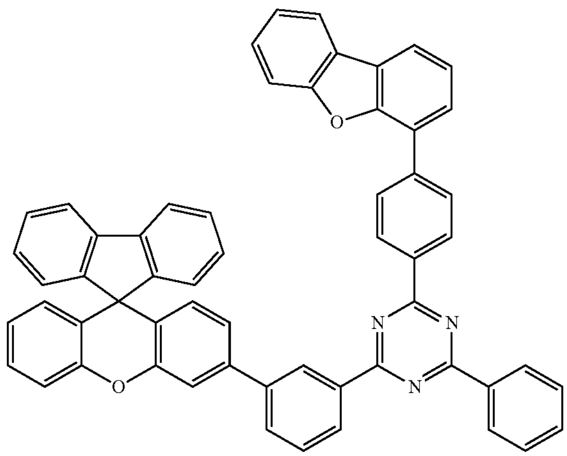
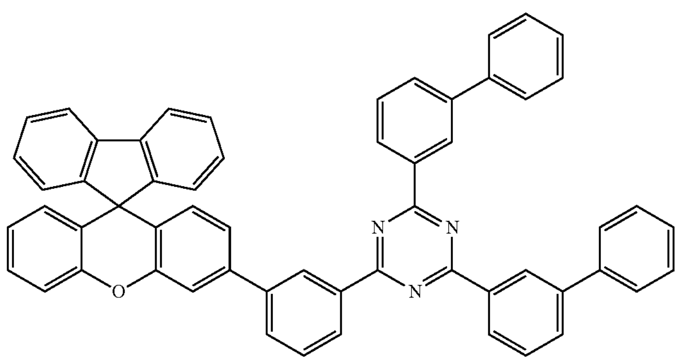
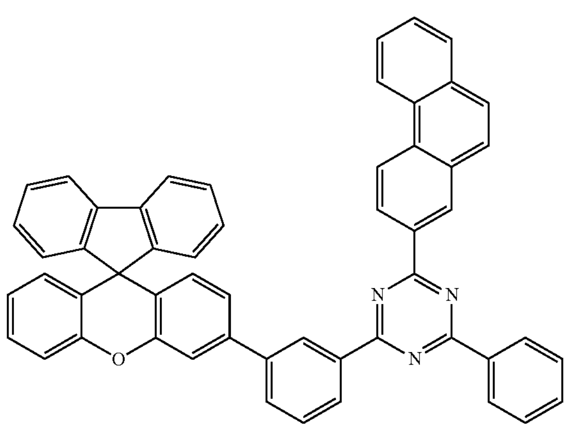

-continued
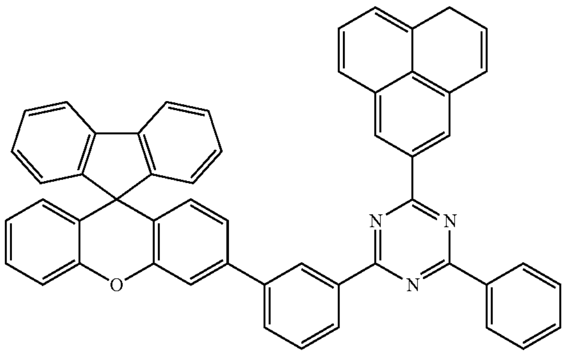
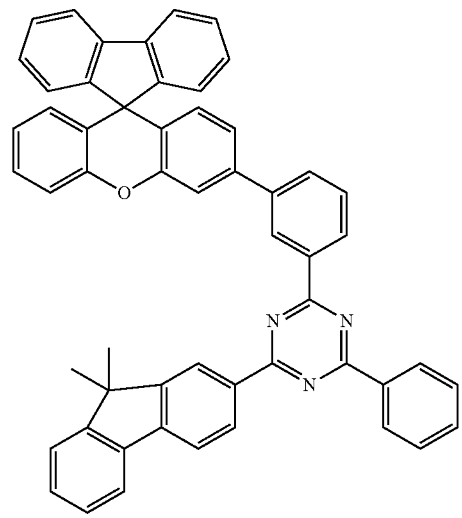
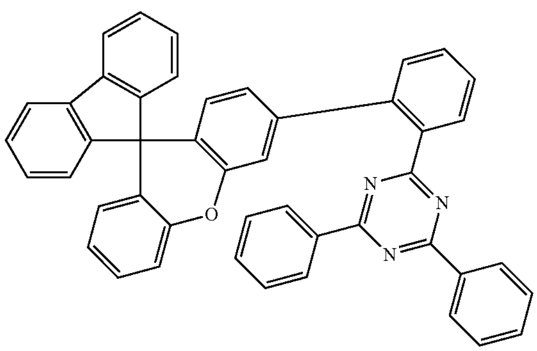
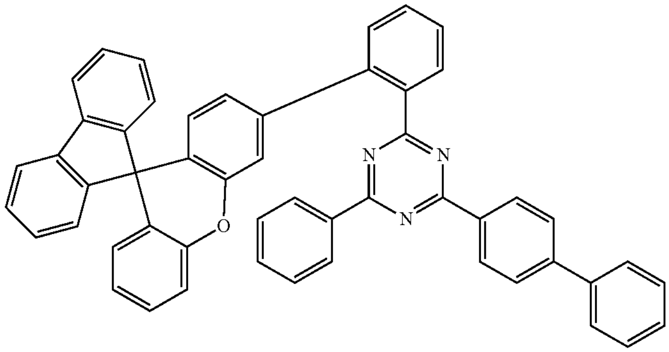

-continued
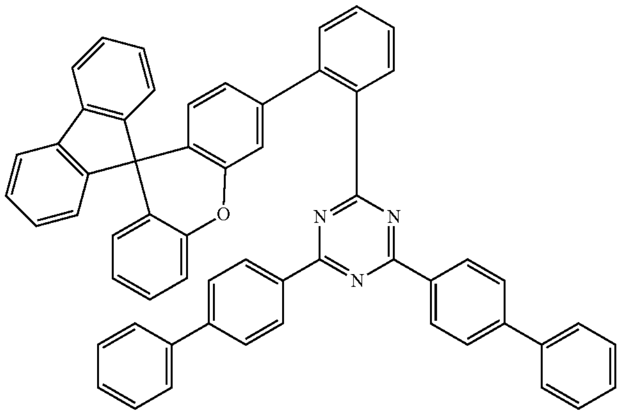
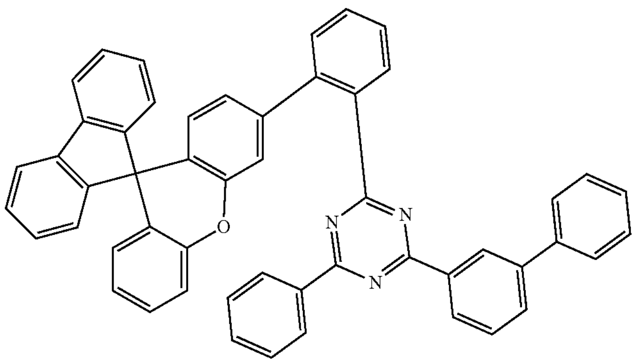
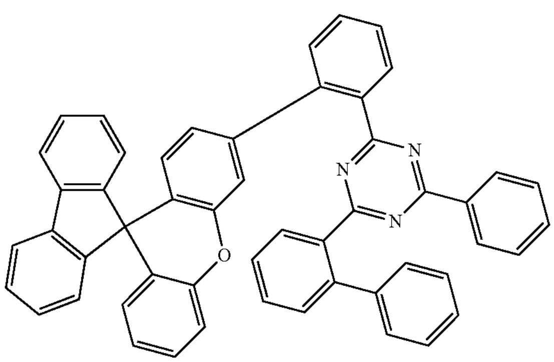
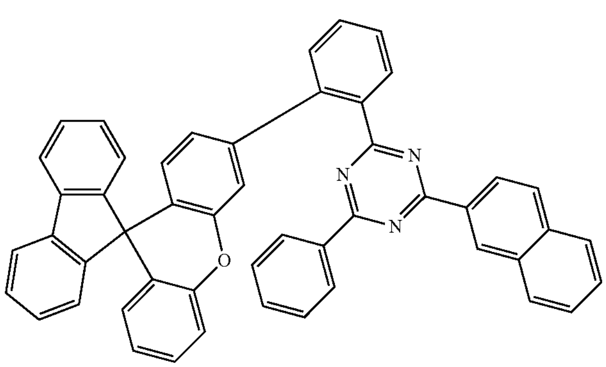

-continued
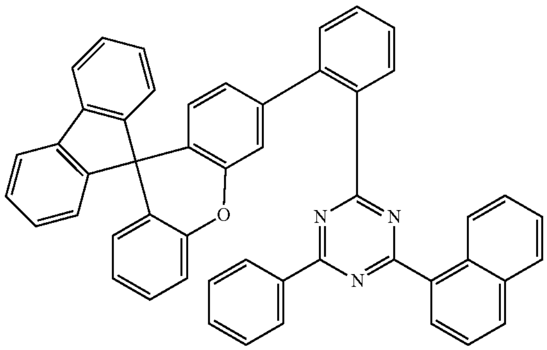
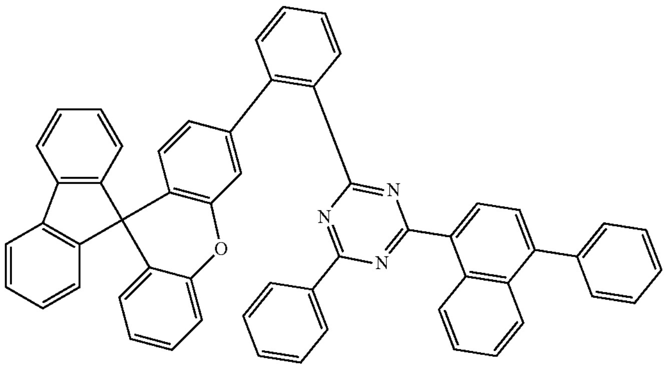
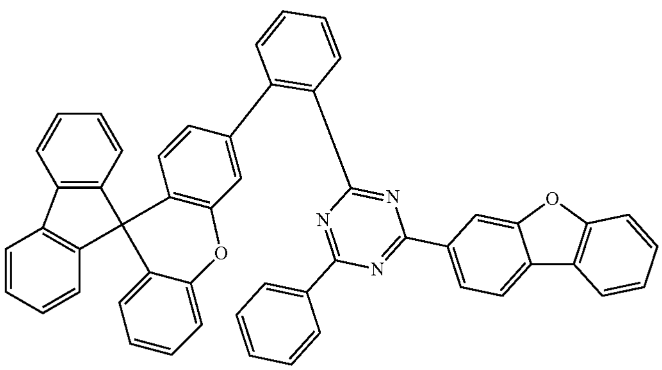
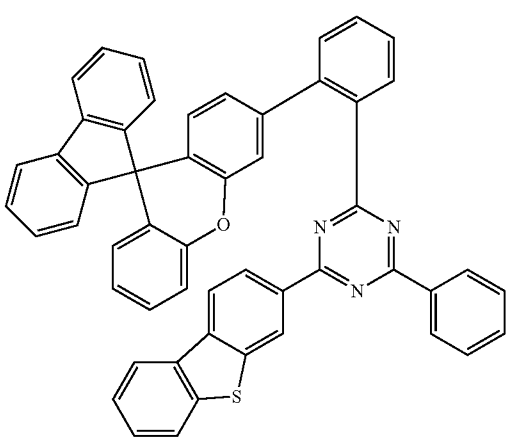
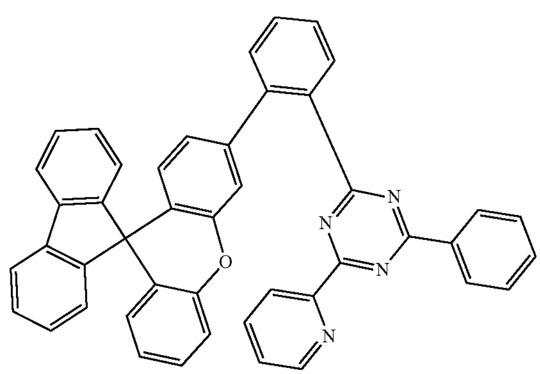

-continued
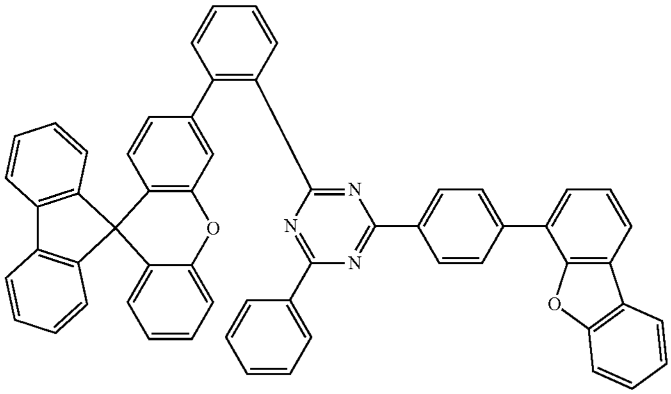
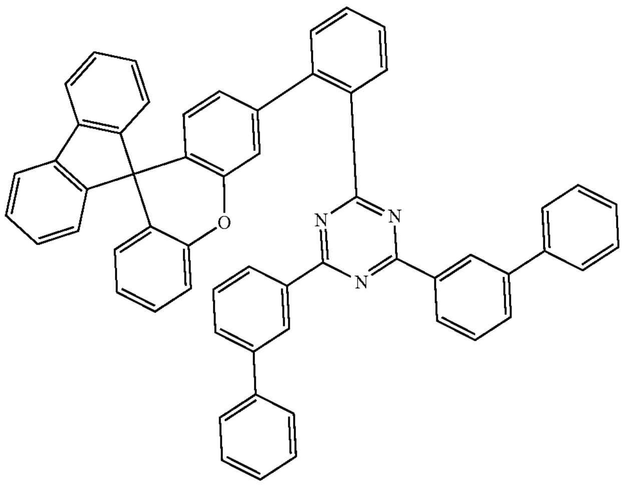
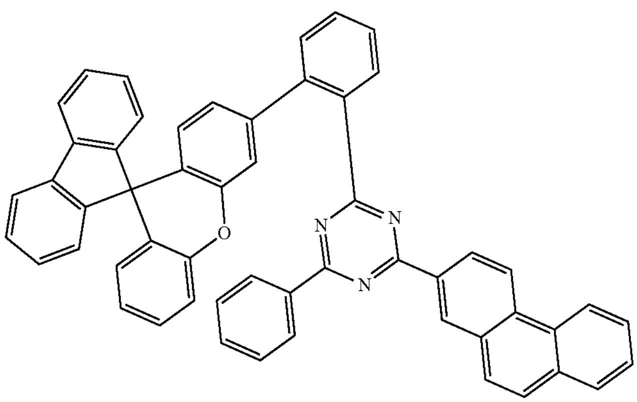
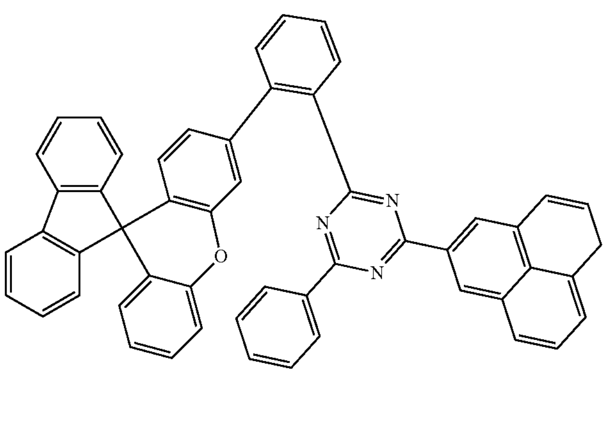

-continued
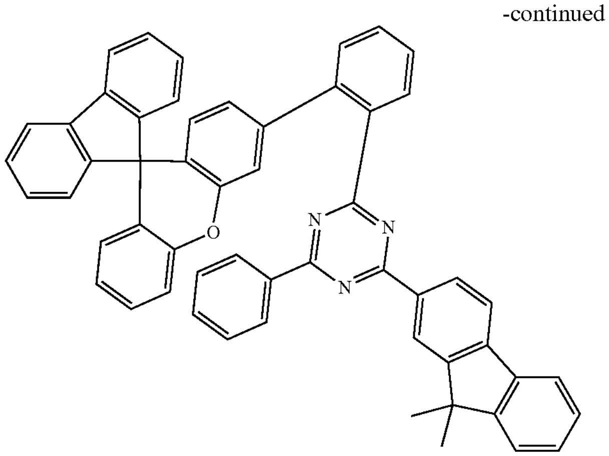
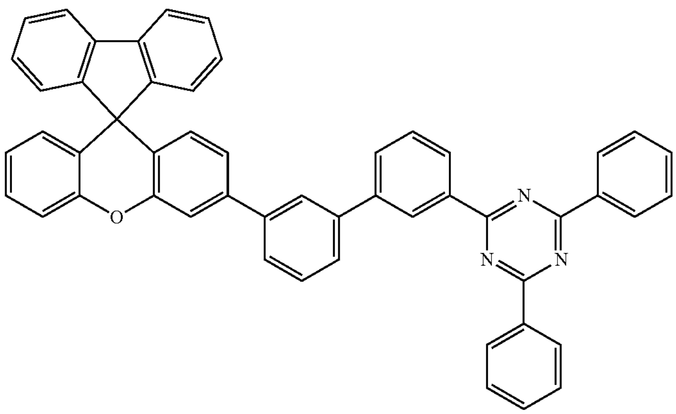
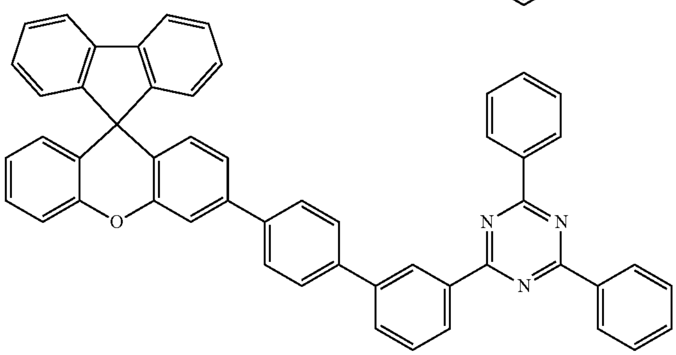
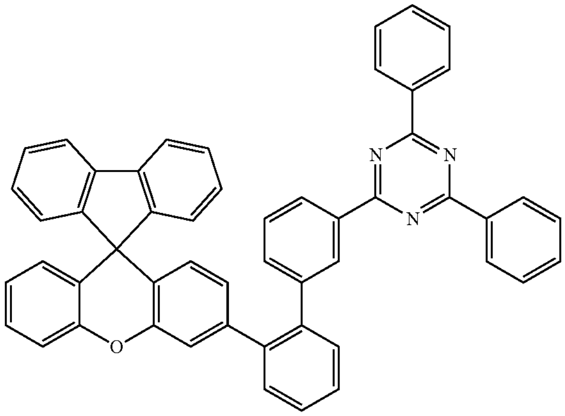
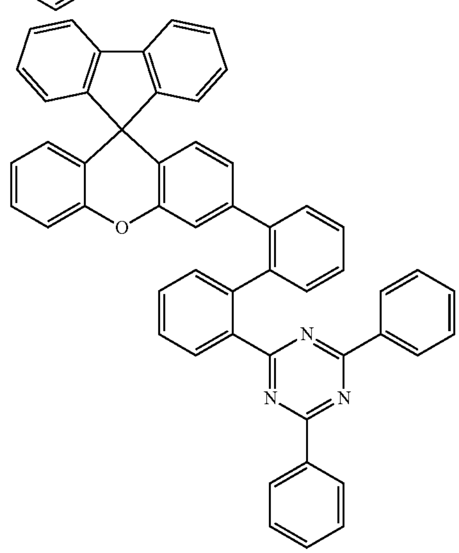

-continued
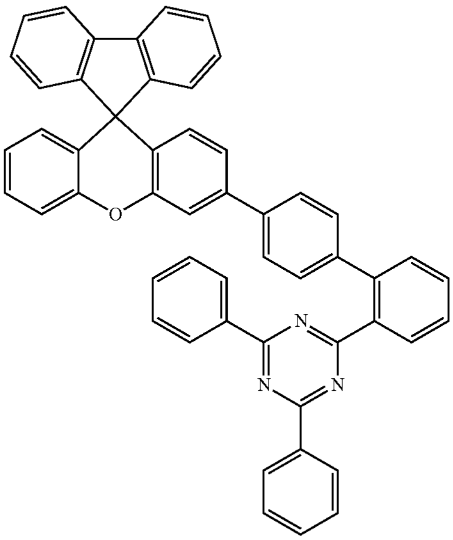
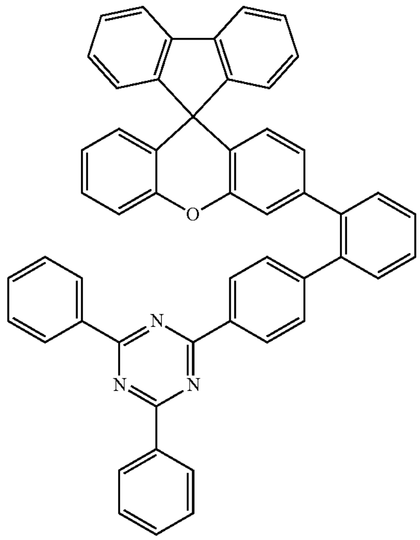
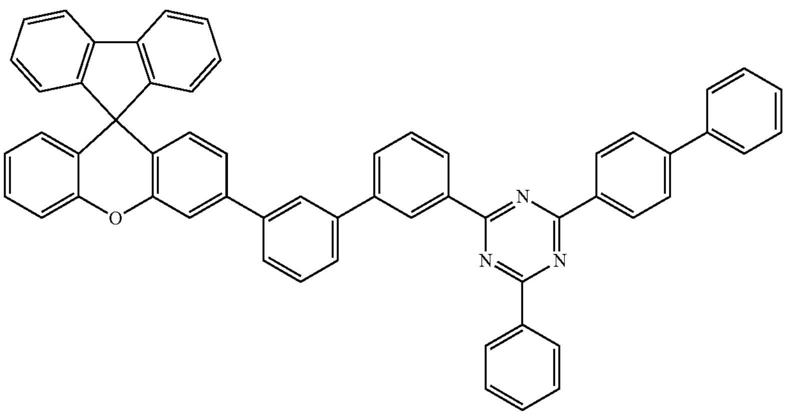
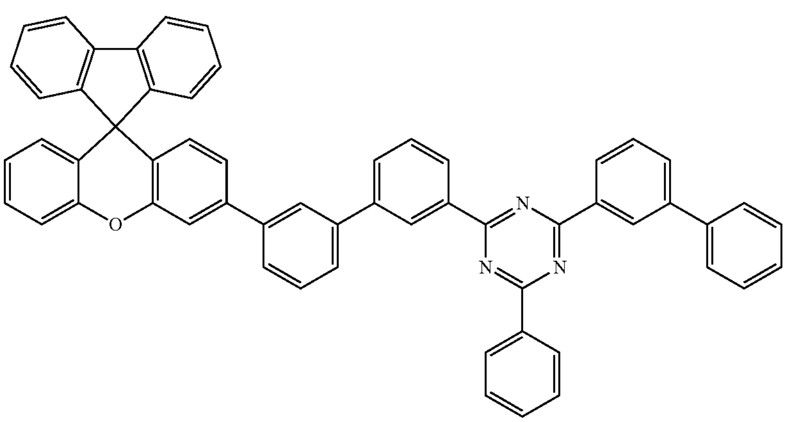

-continued
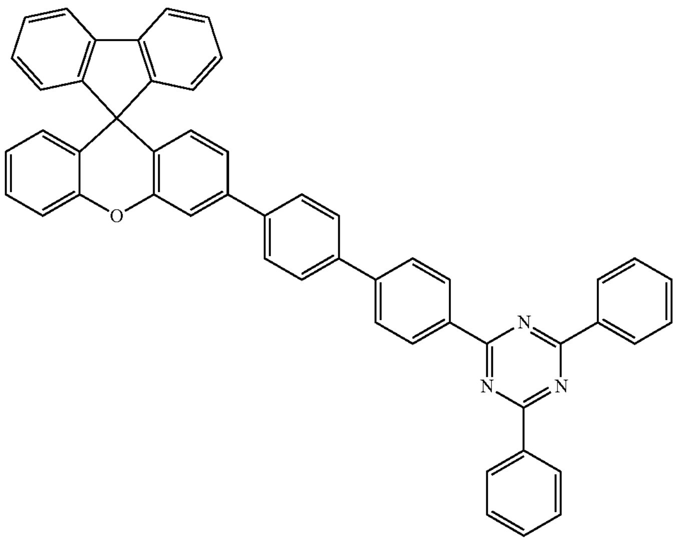
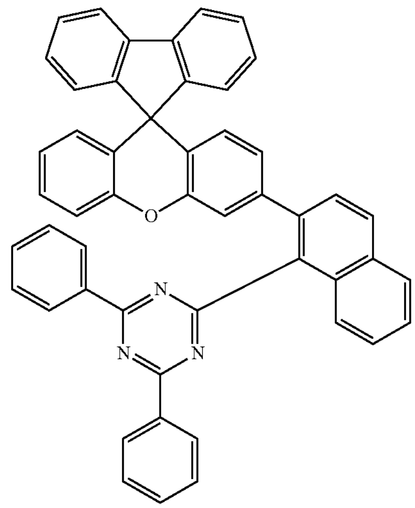
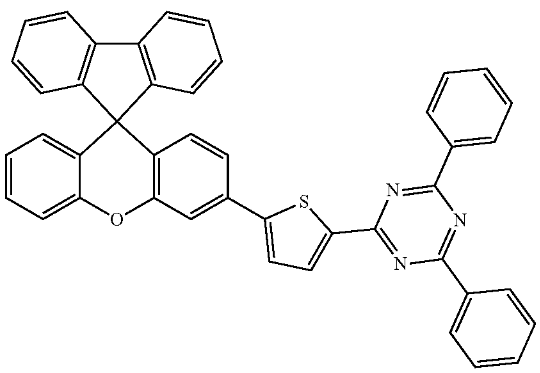
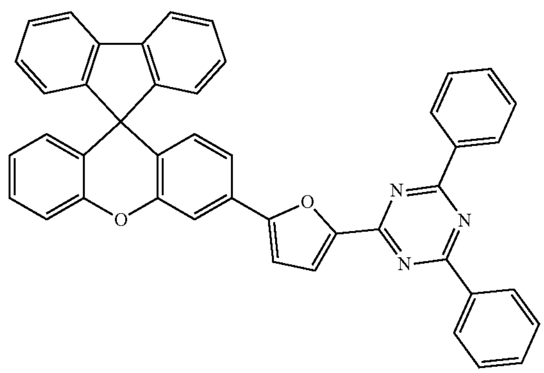
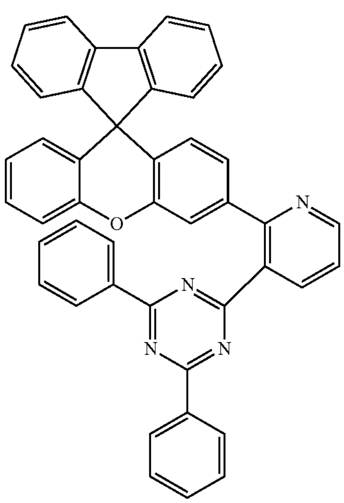
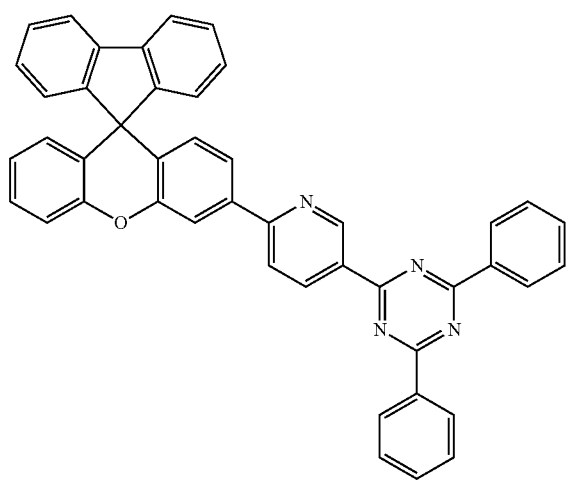
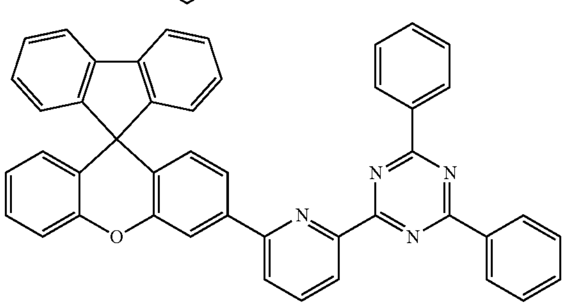

-continued
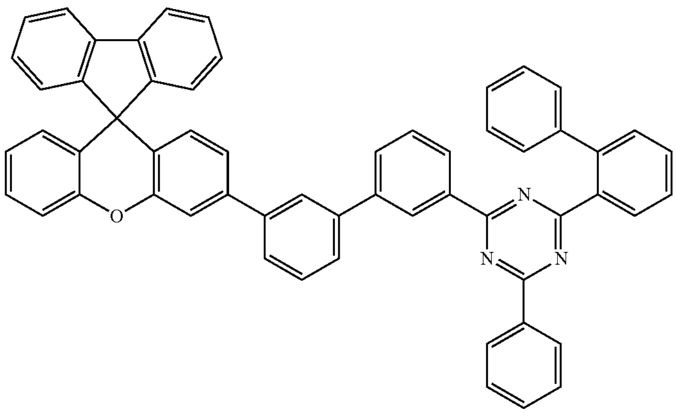
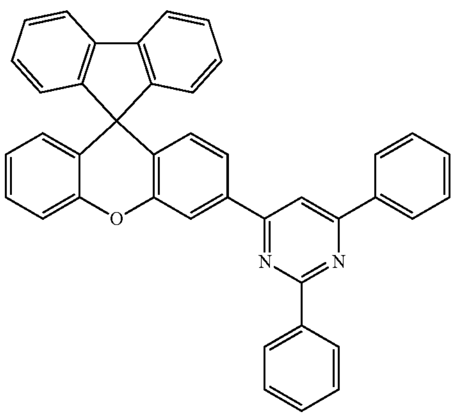
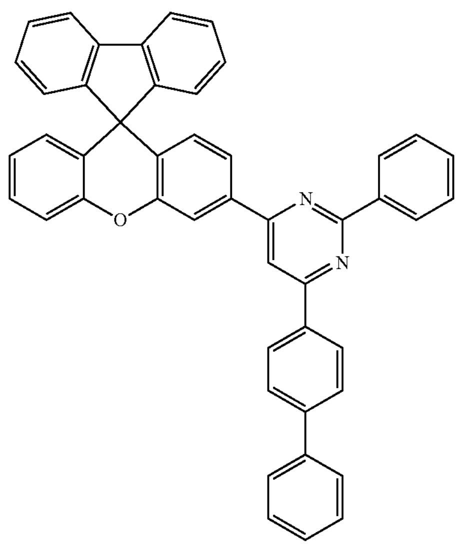
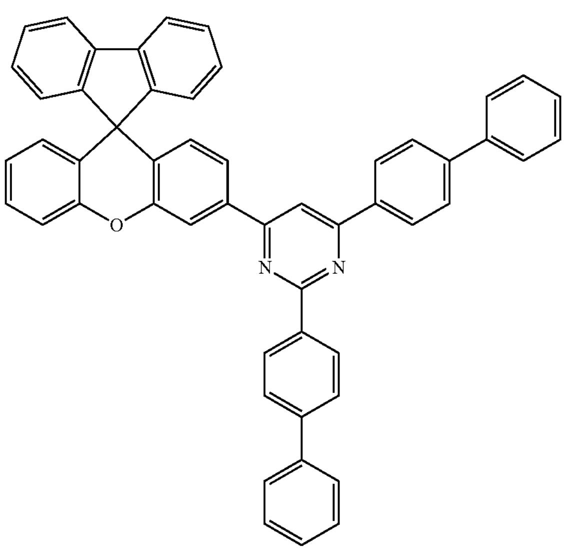
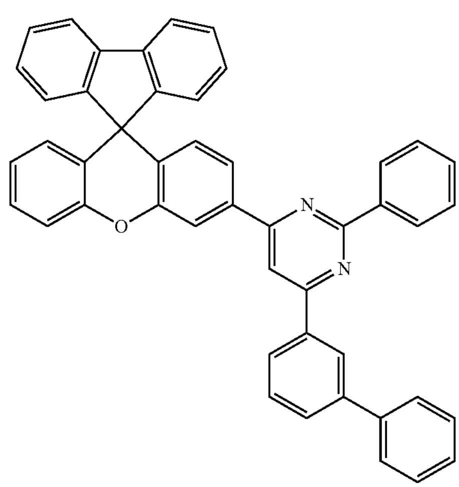

-continued
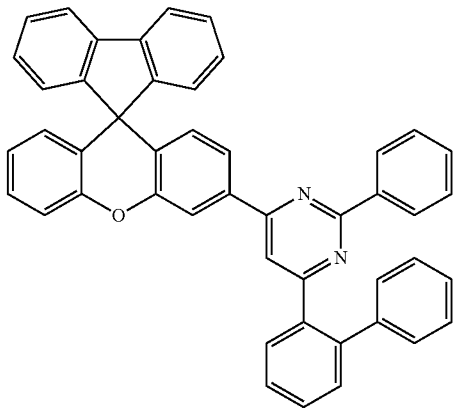
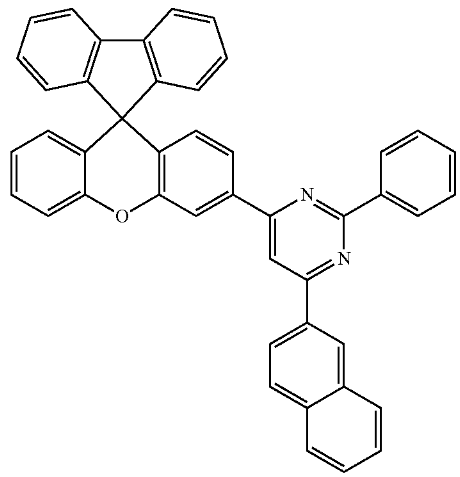
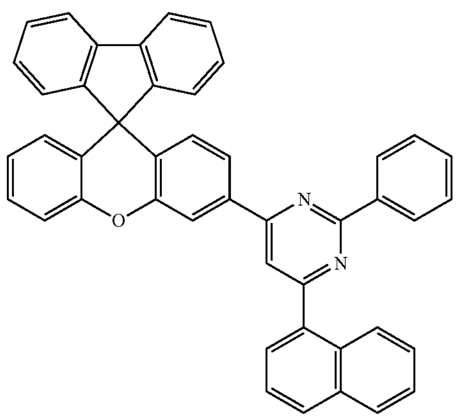
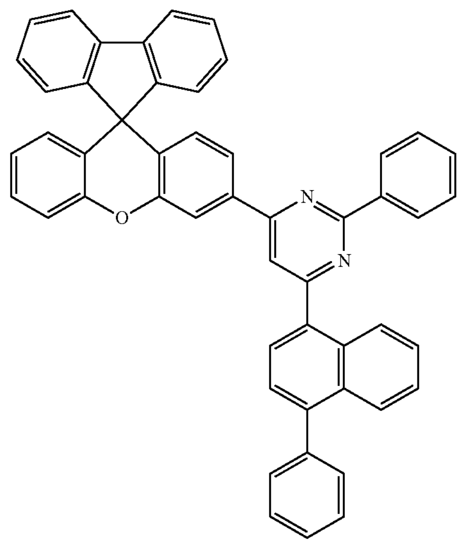
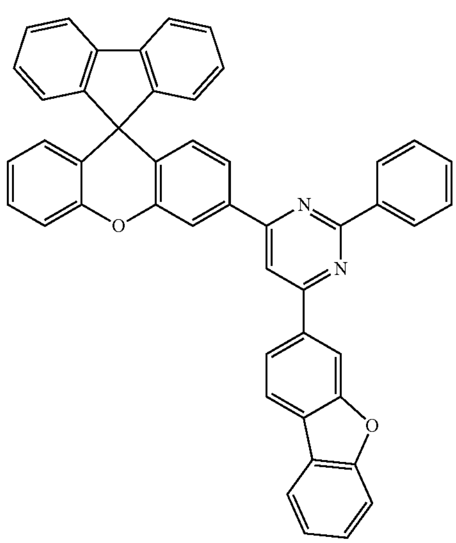
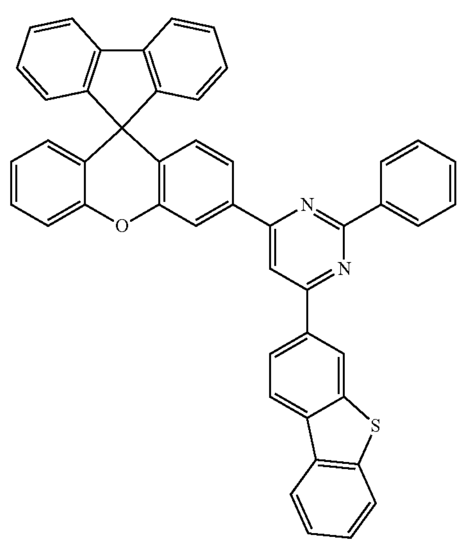

-continued
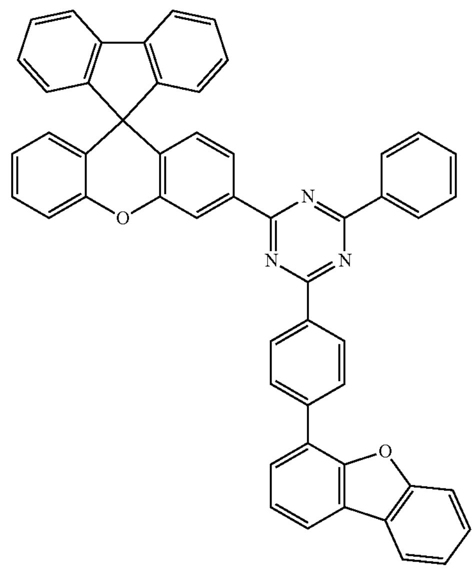
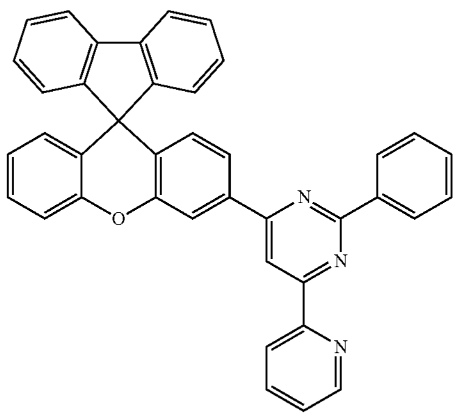
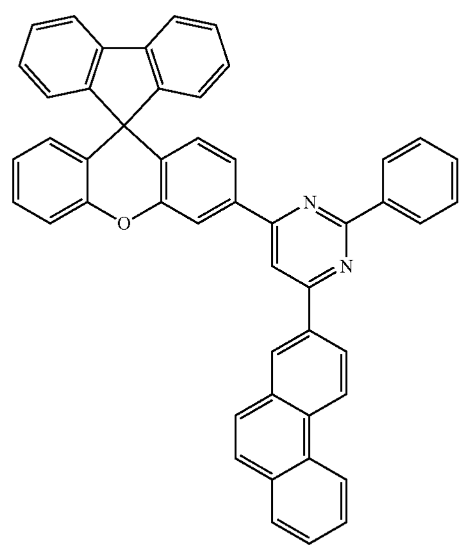
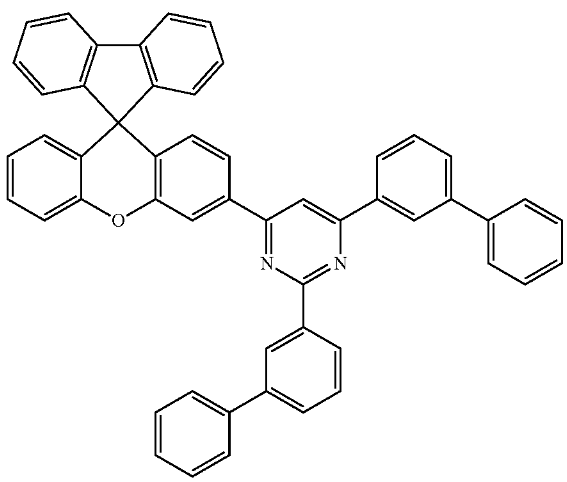
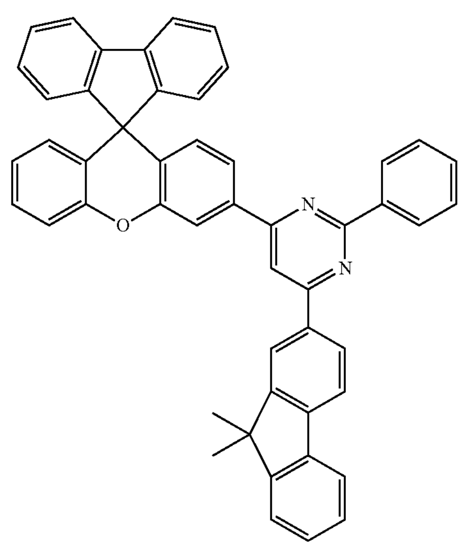
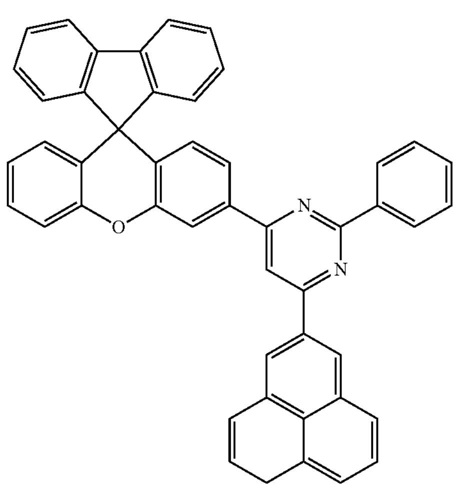

-continued
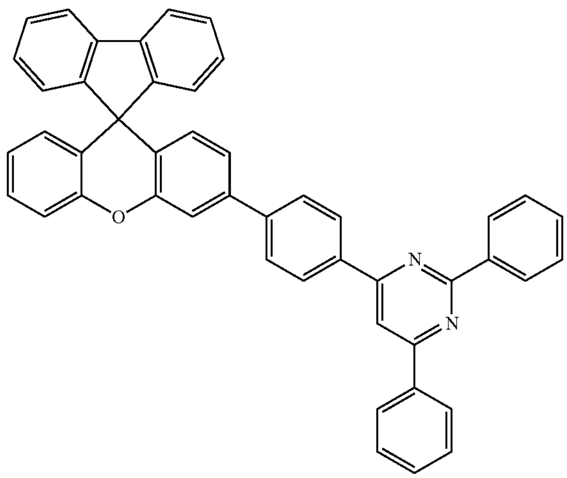
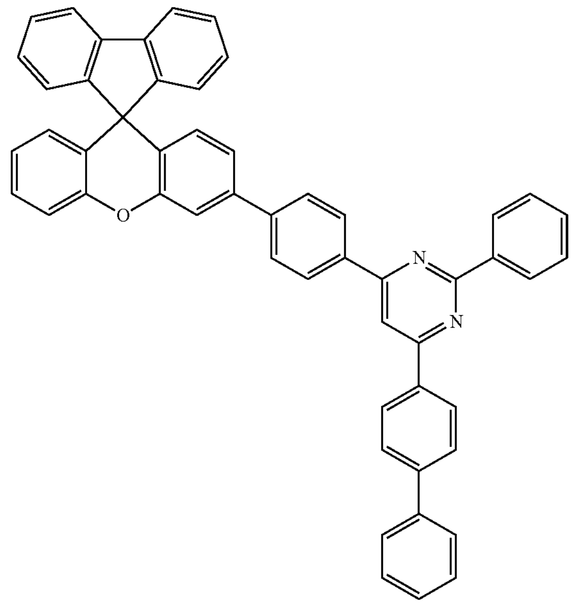
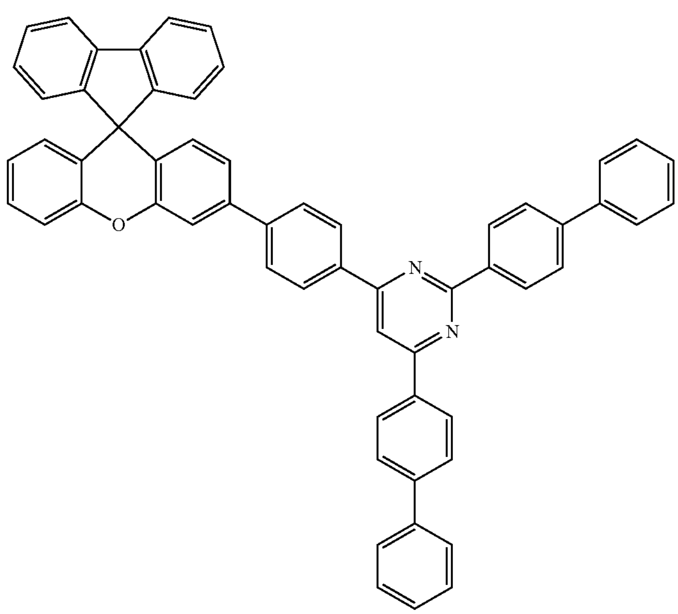

-continued
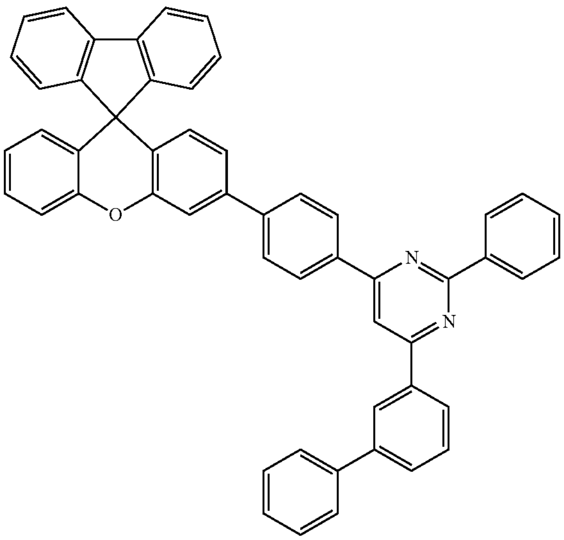
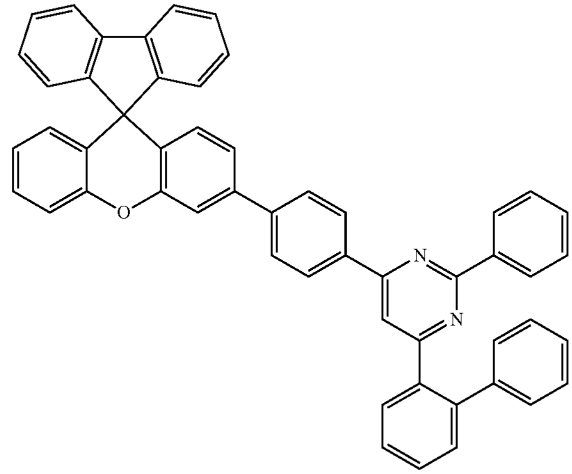
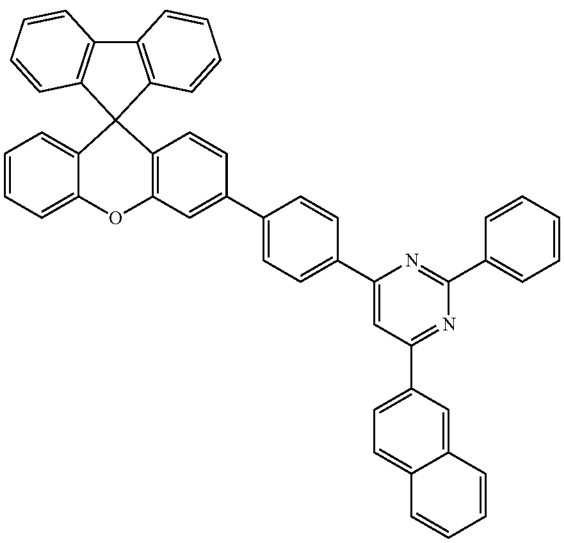
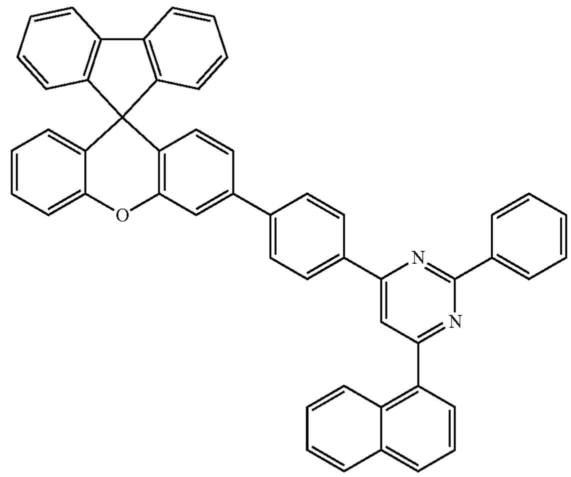
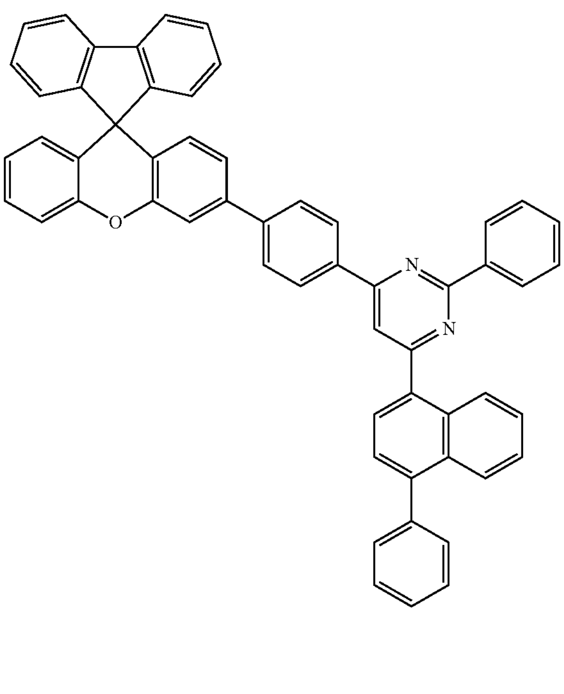

-continued
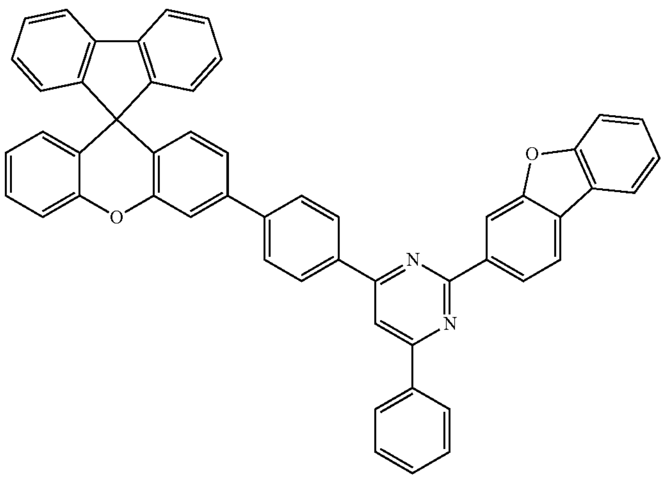
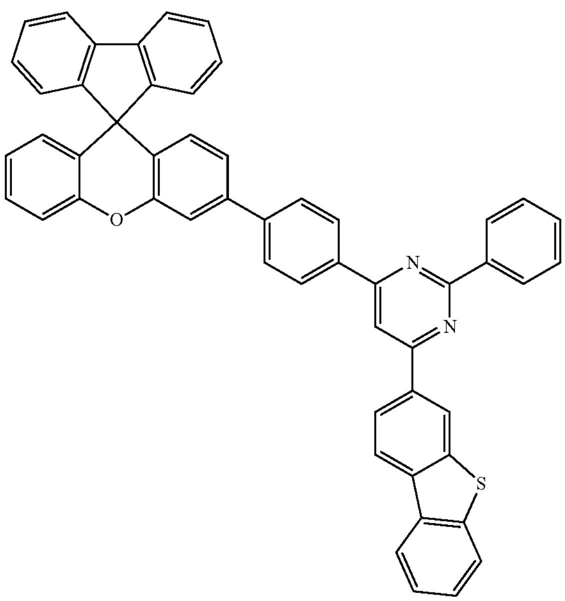
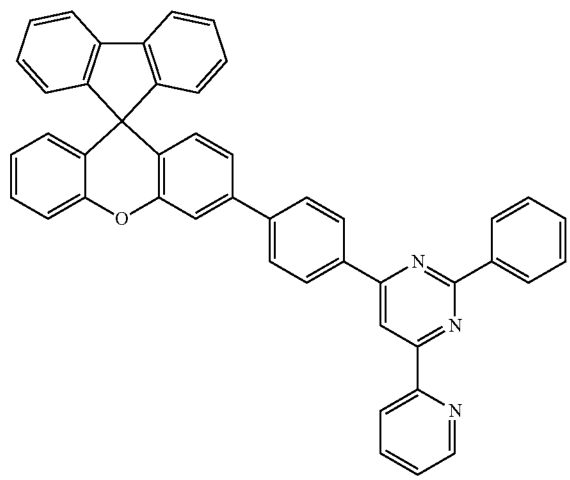
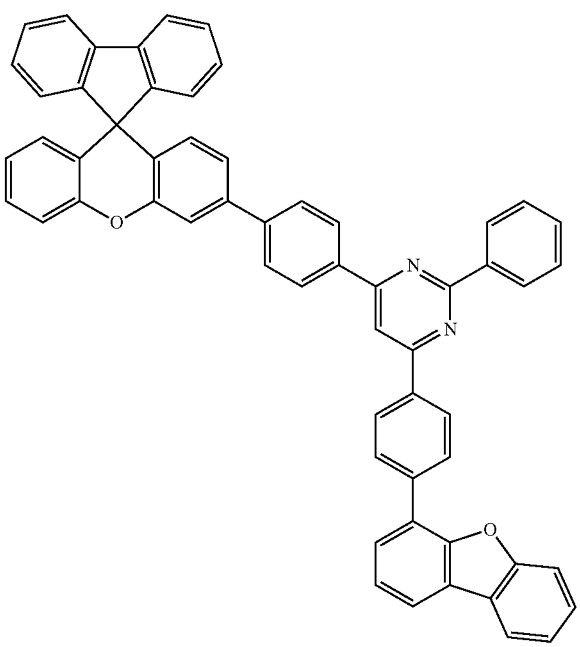

-continued
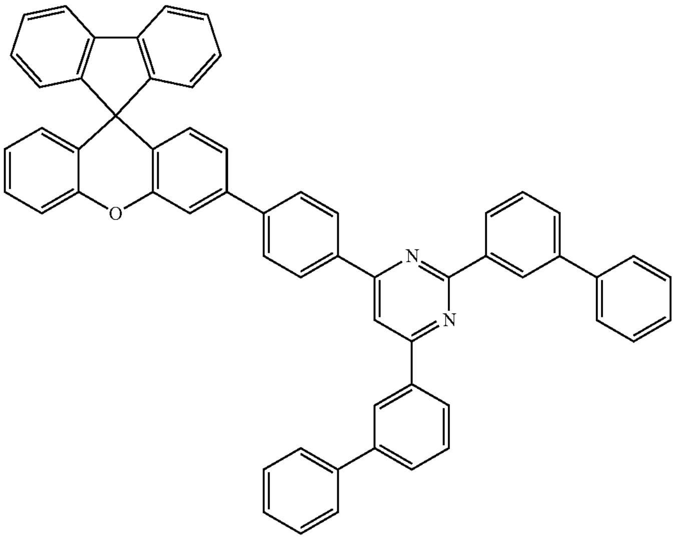
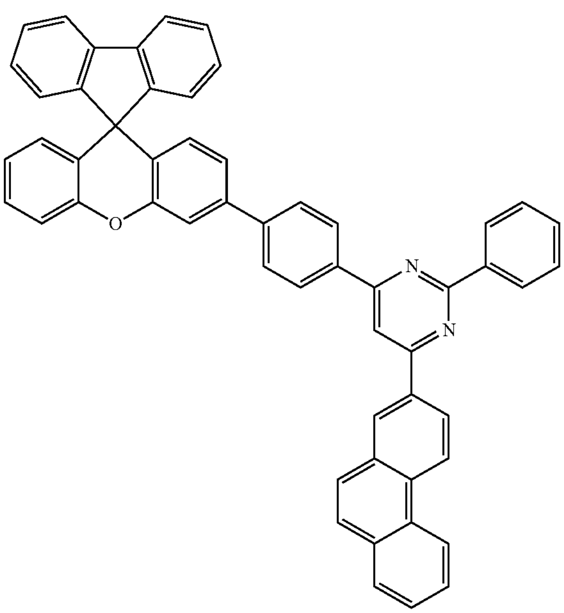
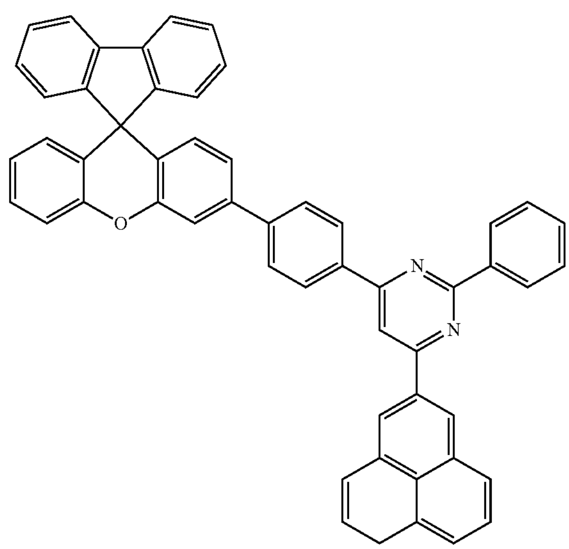

-continued
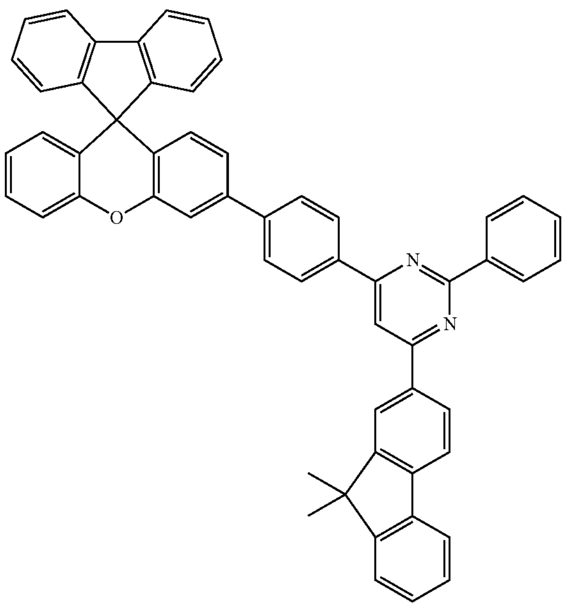
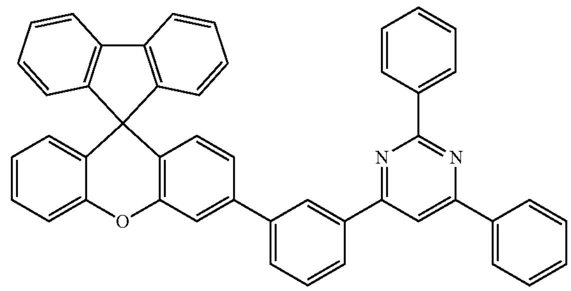
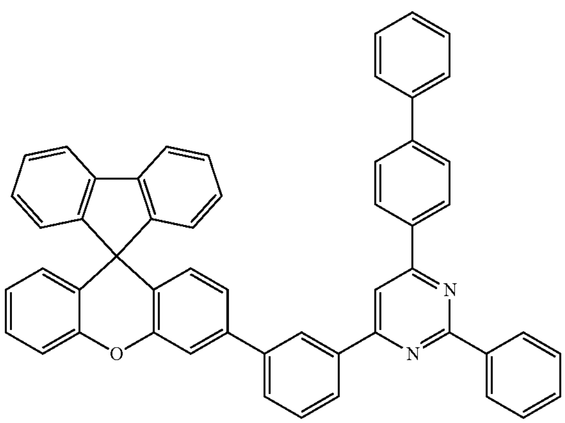
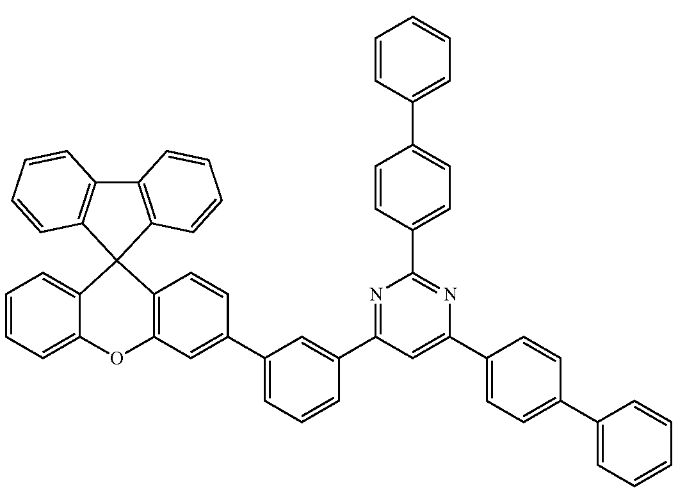
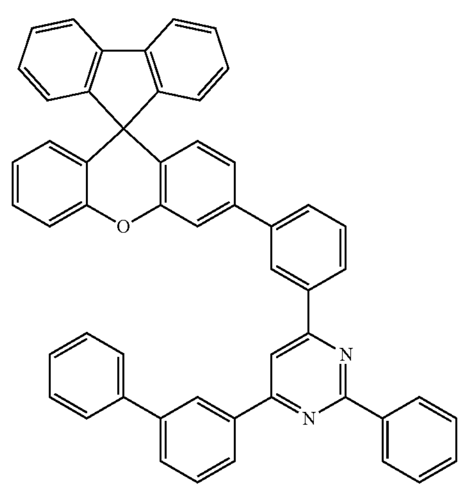

-continued
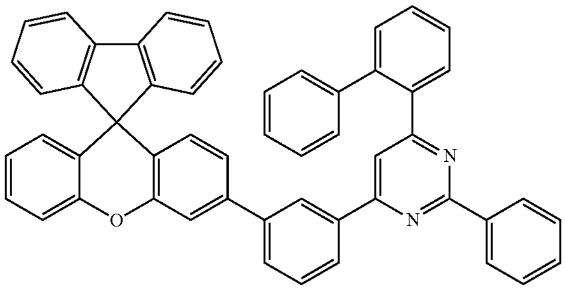
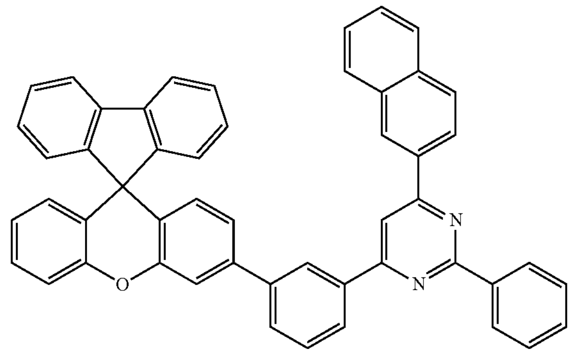
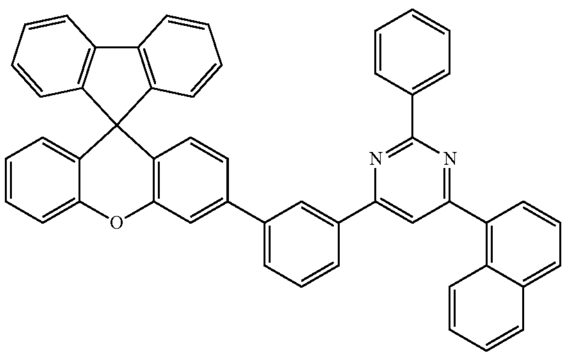
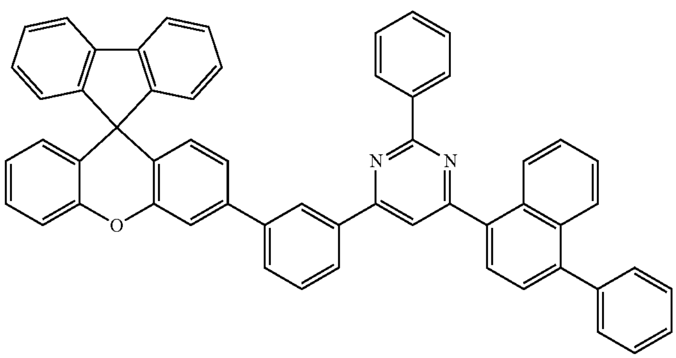
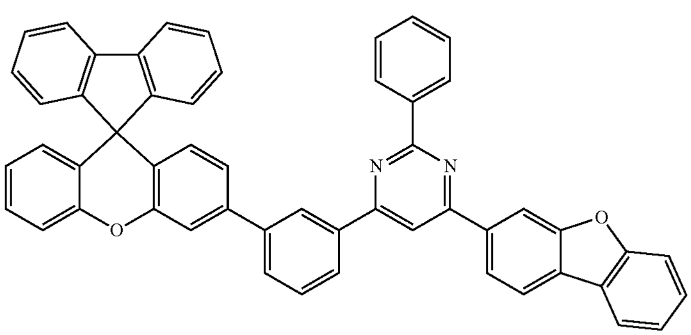

-continued
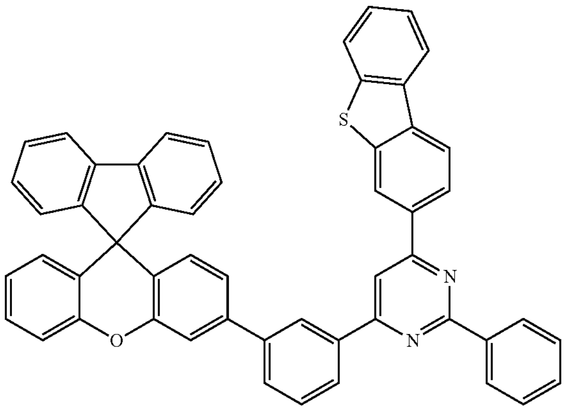
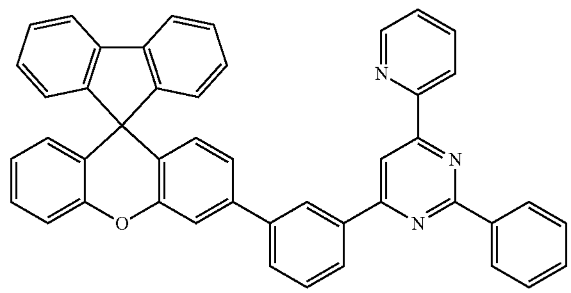
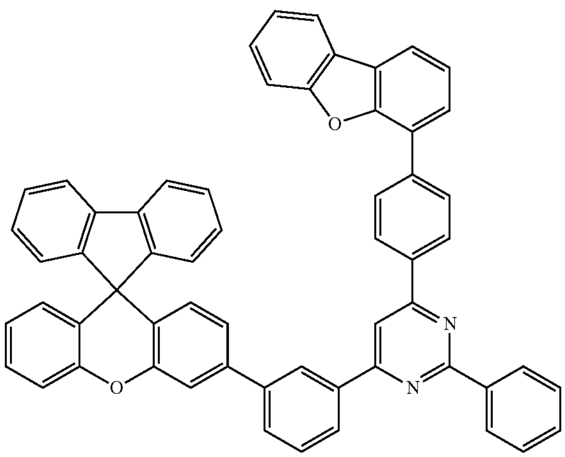
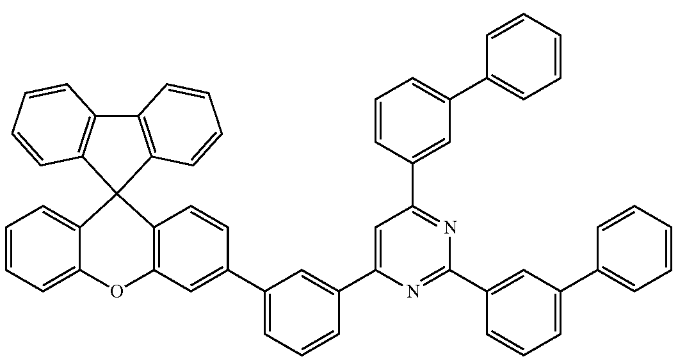
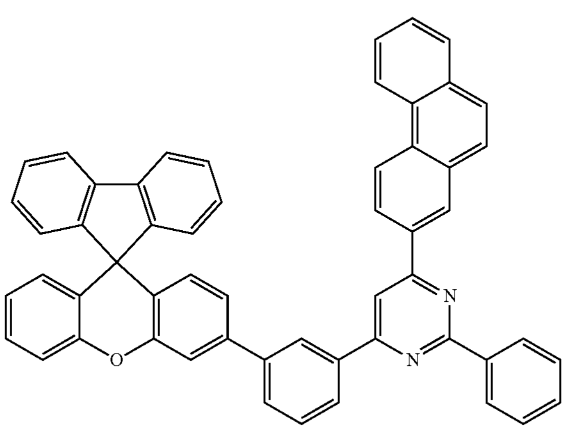
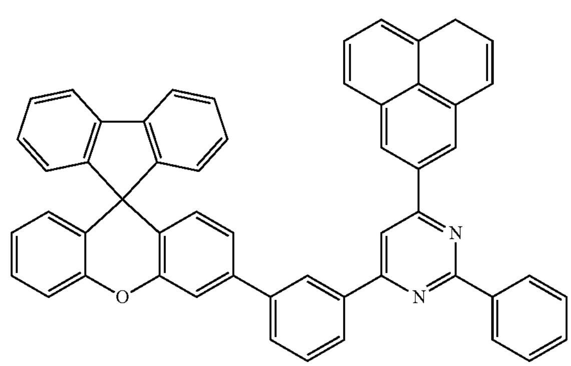

-continued
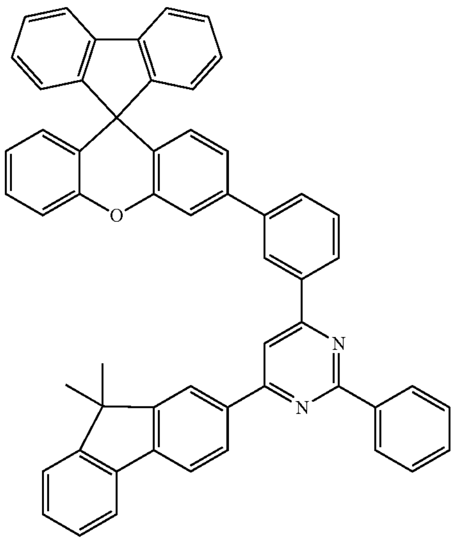
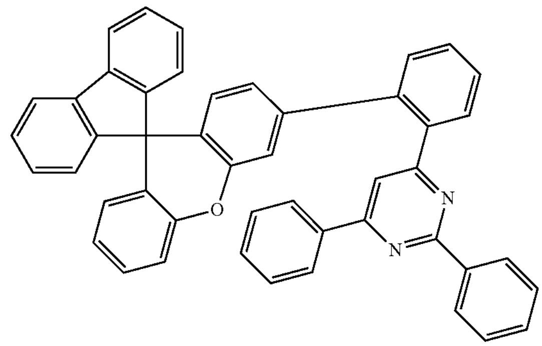
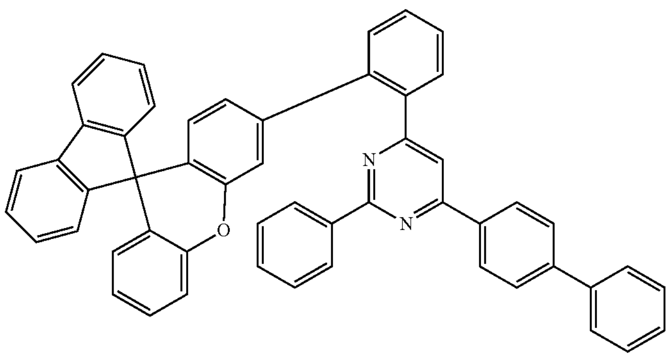
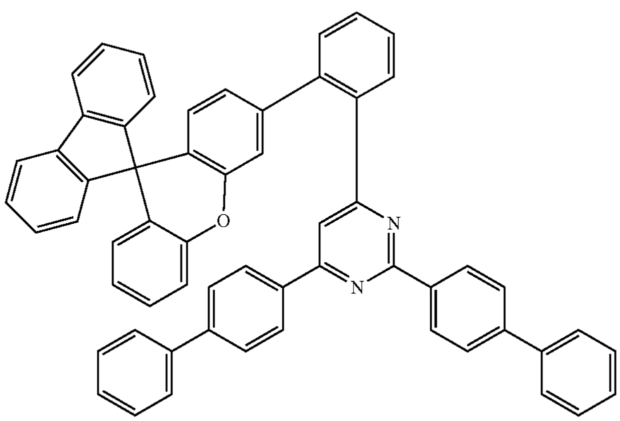
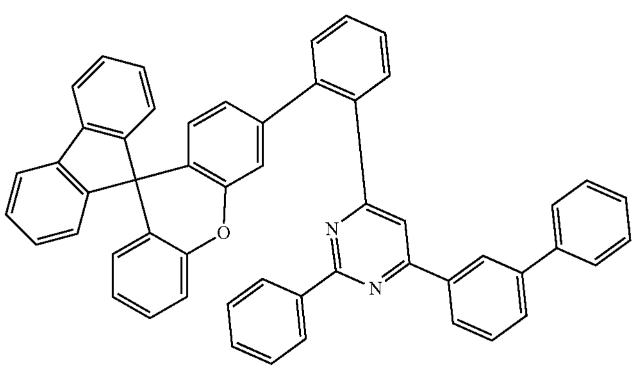

-continued
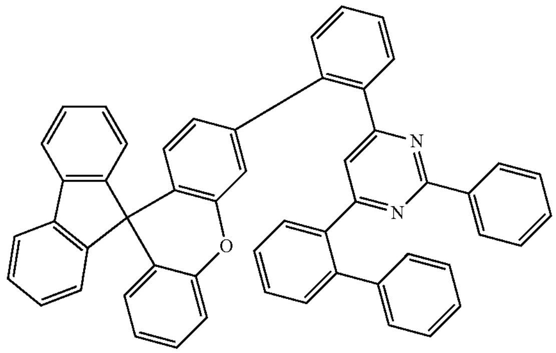
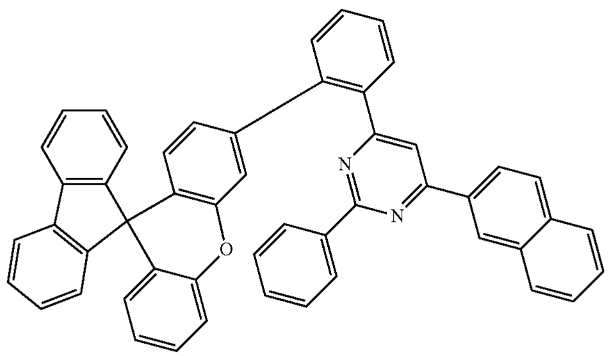
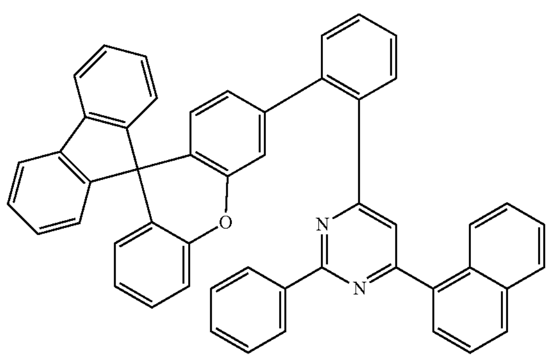
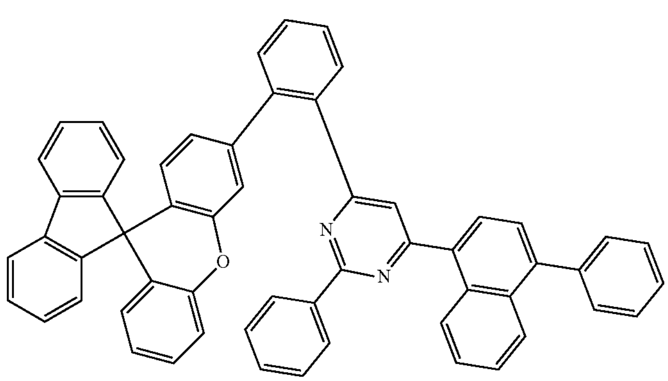

-continued
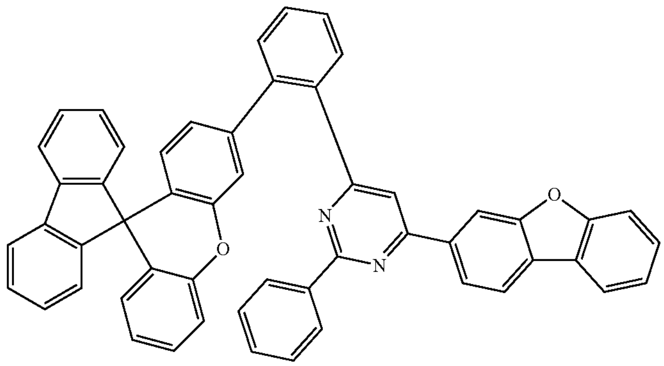
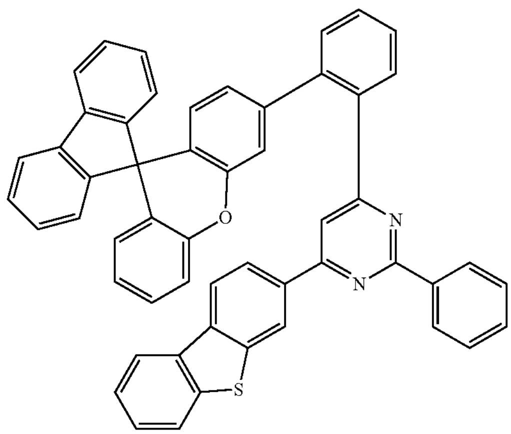
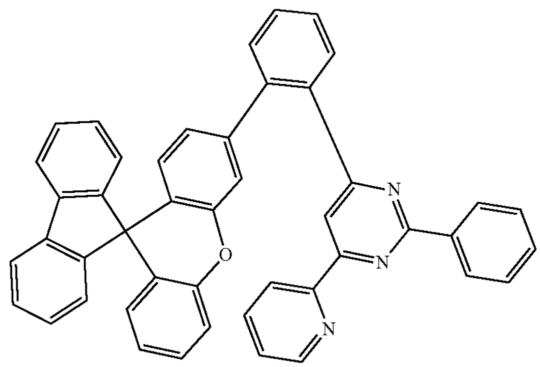
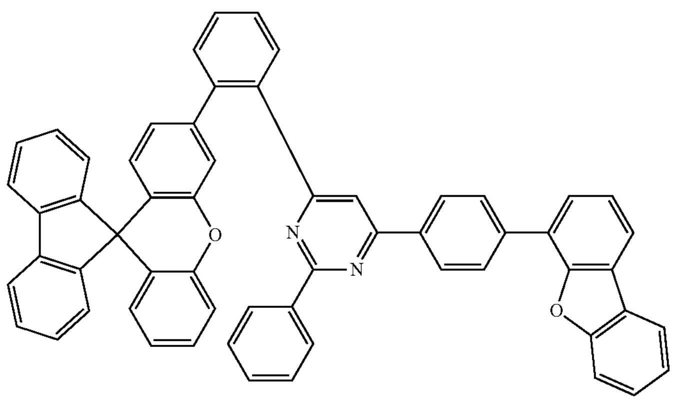
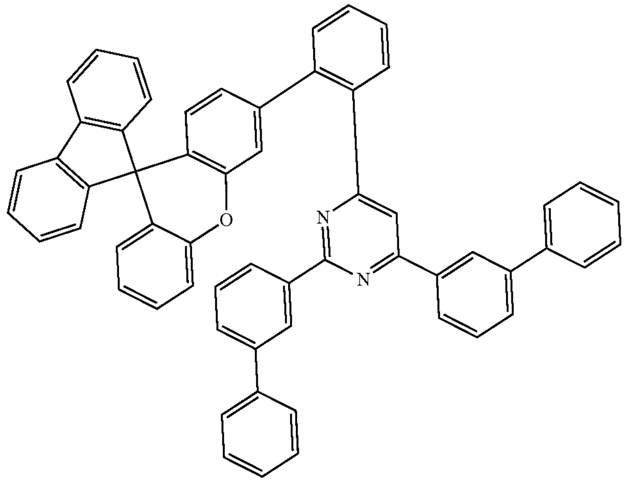

-continued
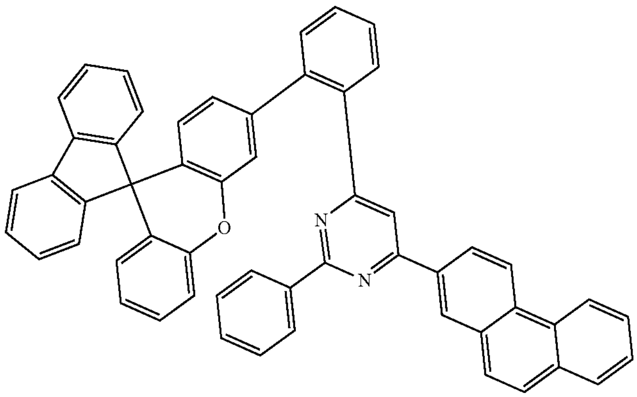
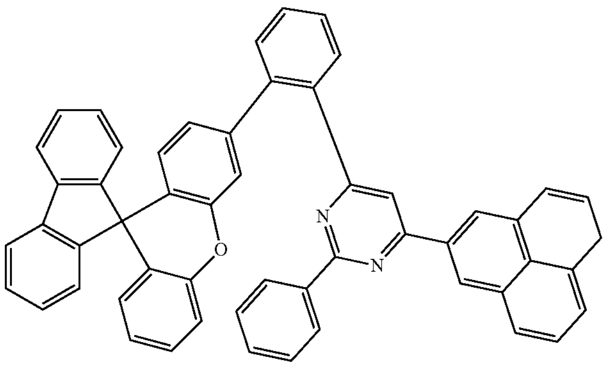
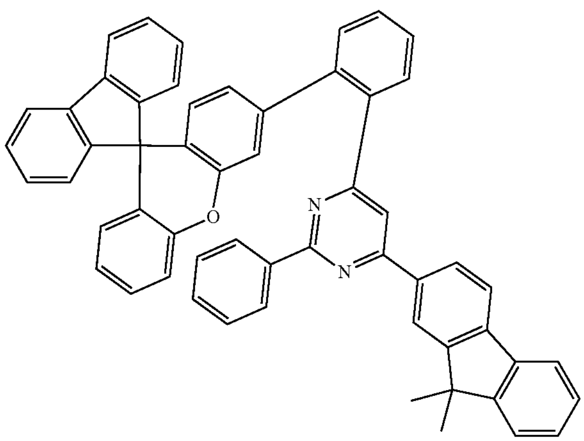
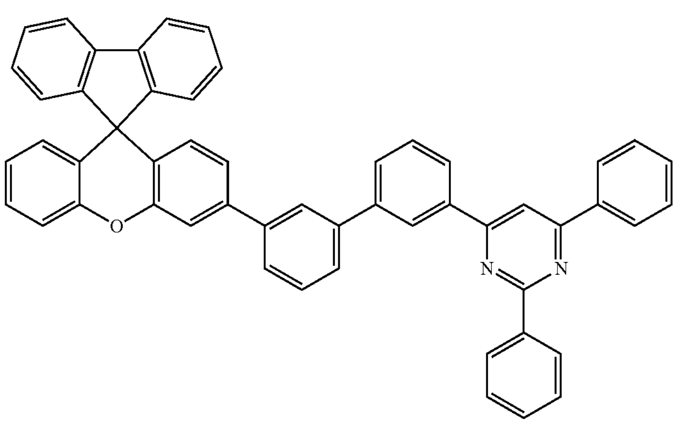

-continued
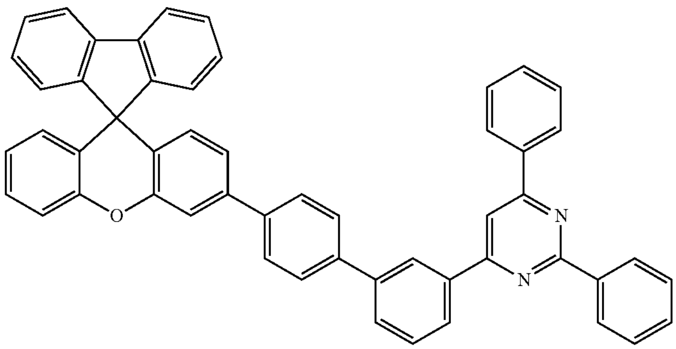
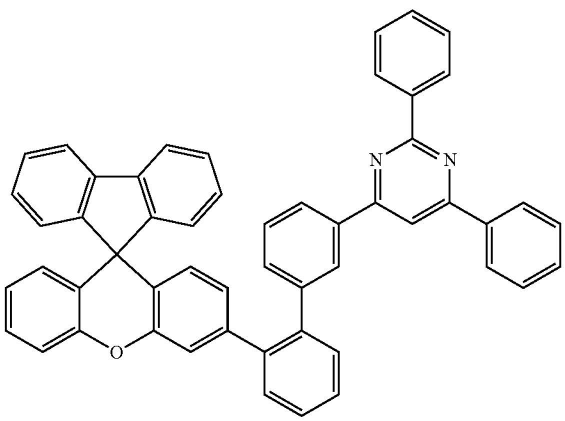
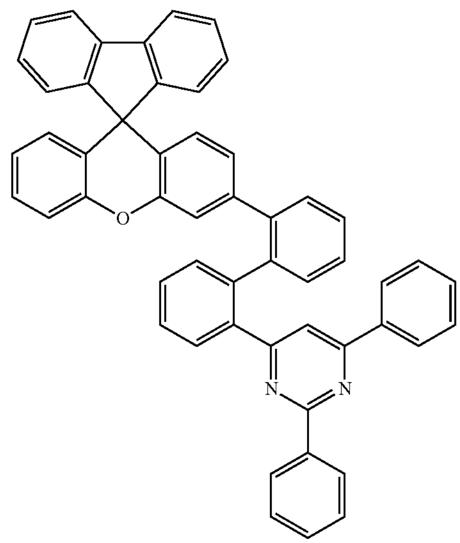
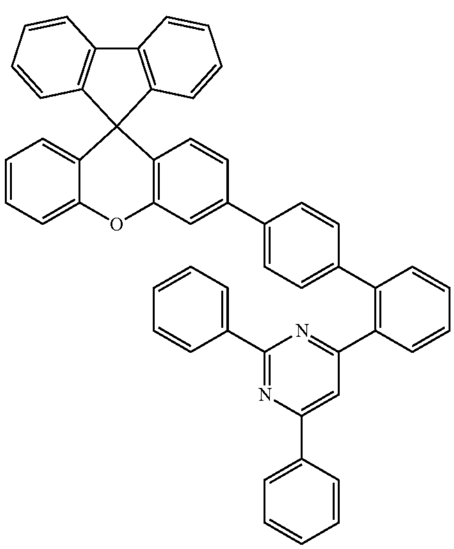
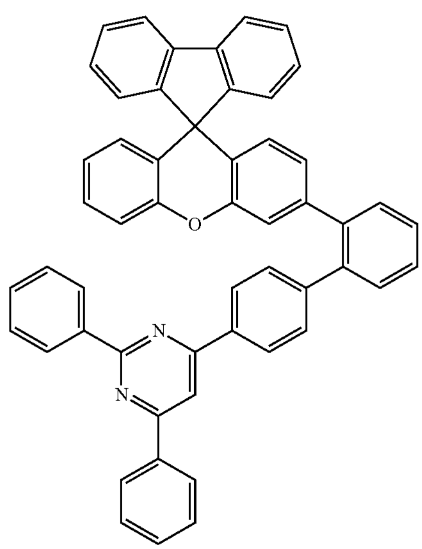

-continued
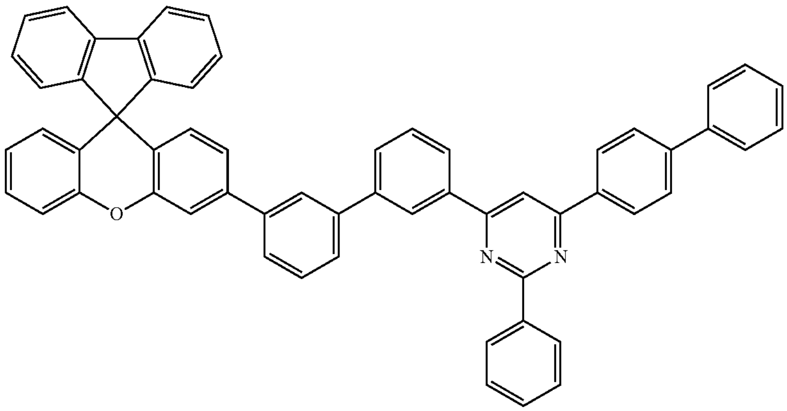
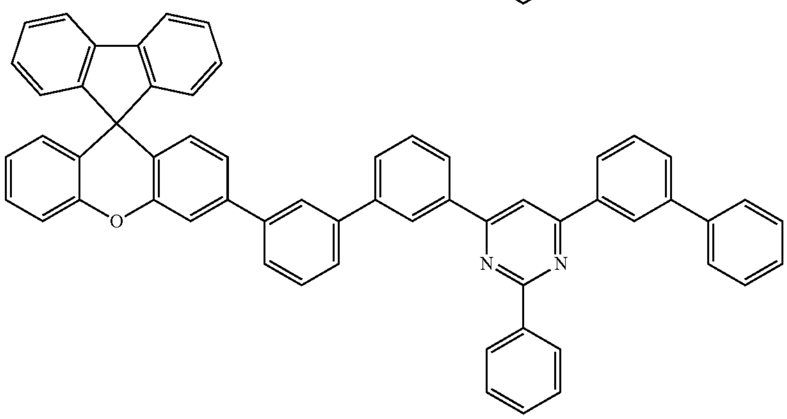
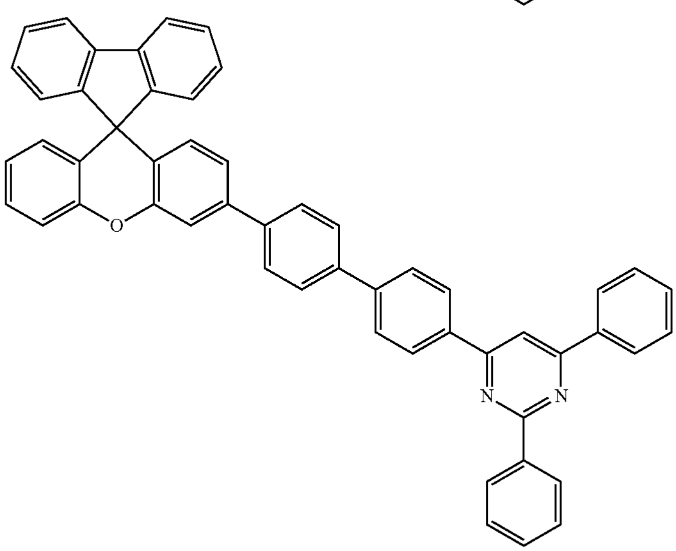
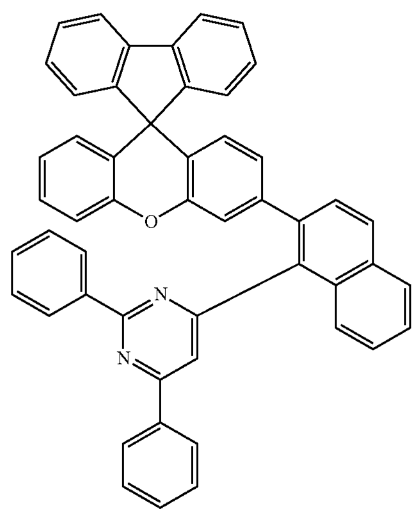
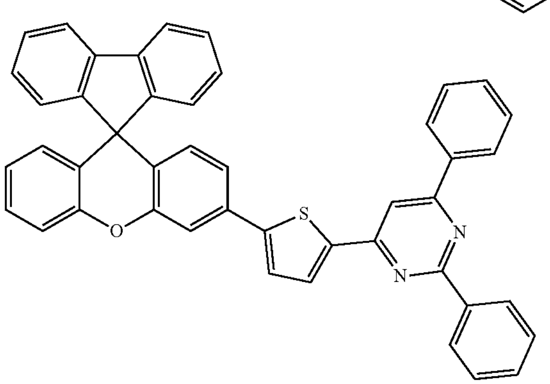
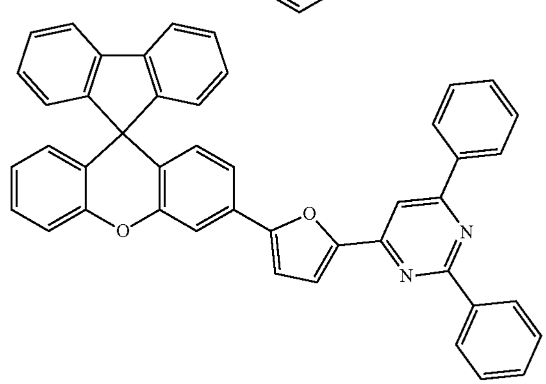

-continued
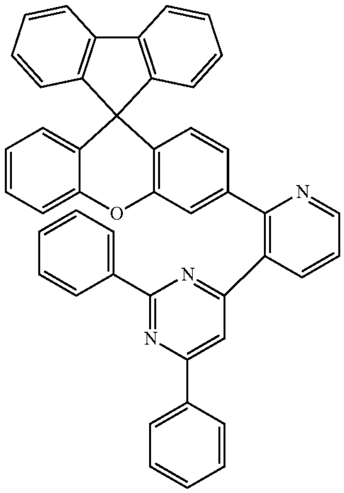
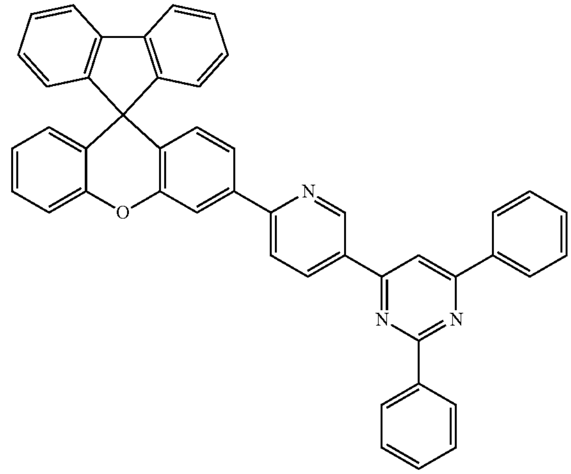
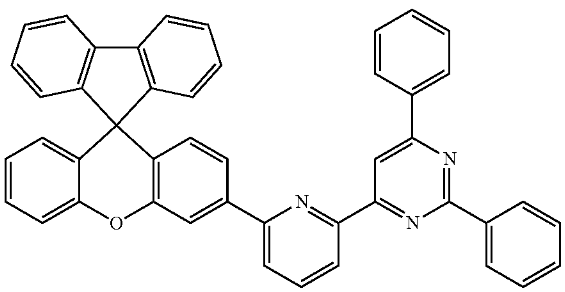
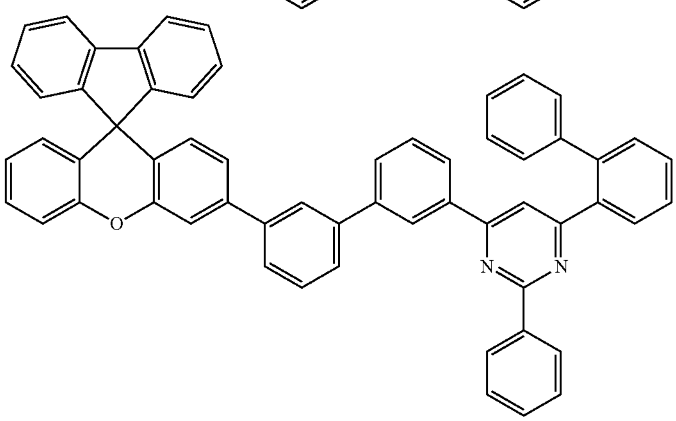
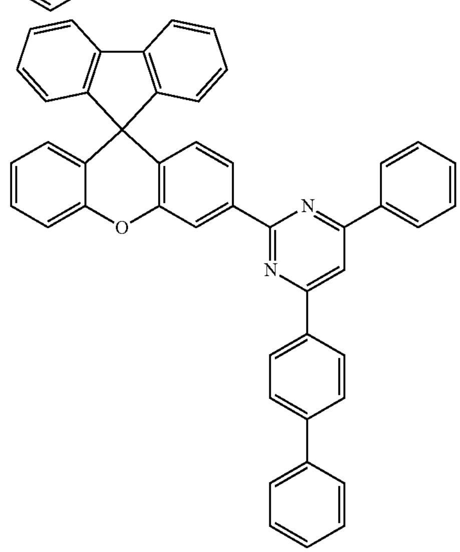
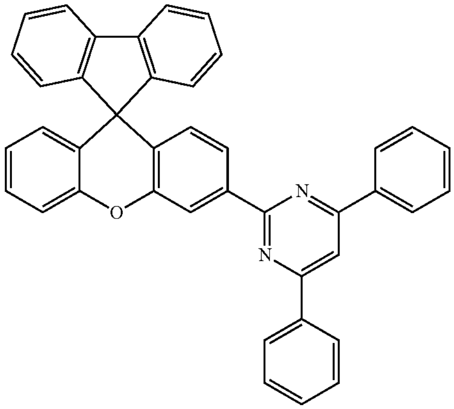

-continued
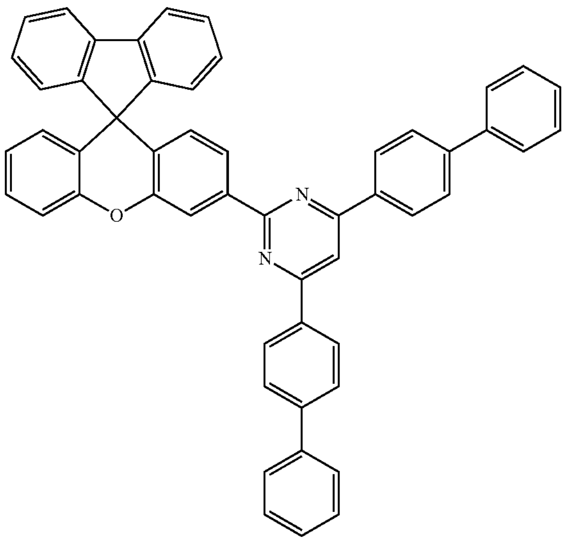
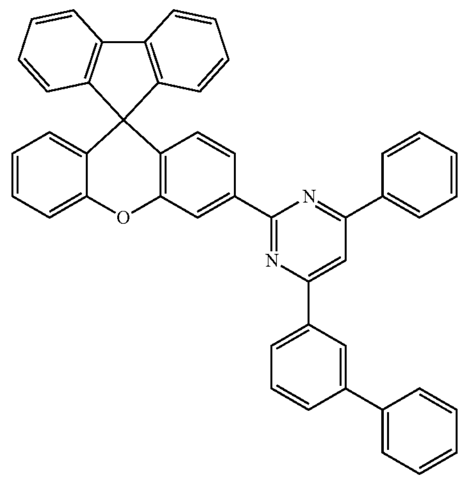
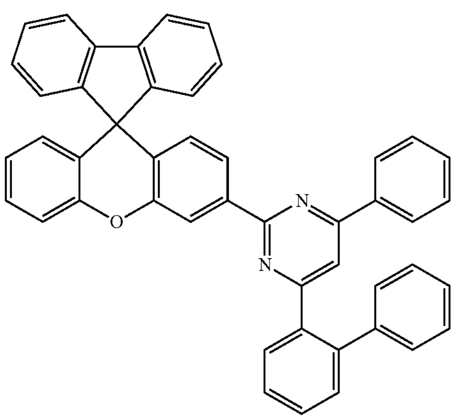
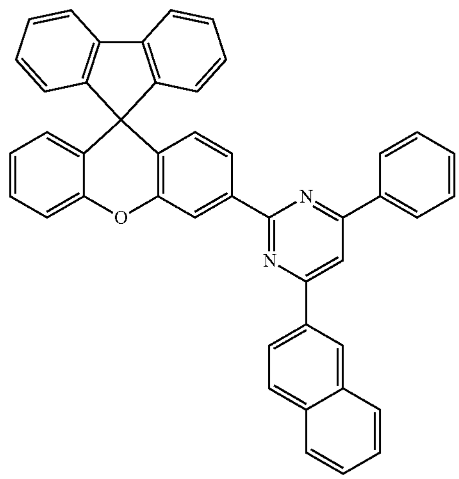
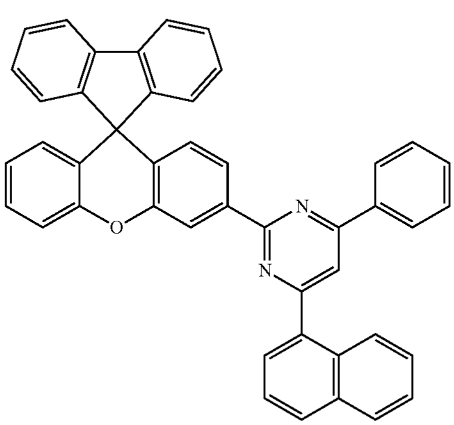
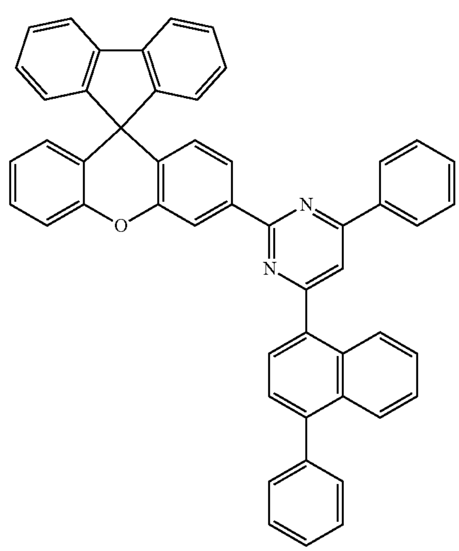

-continued
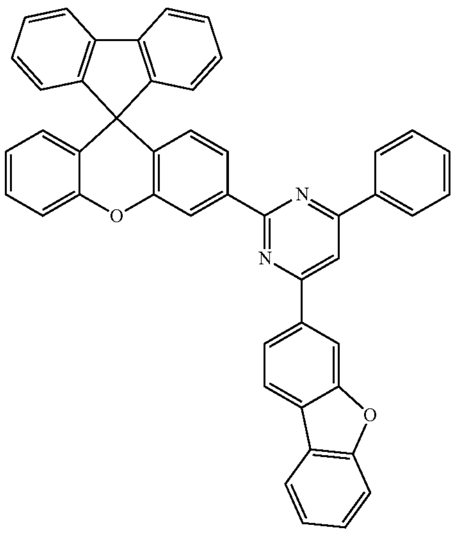
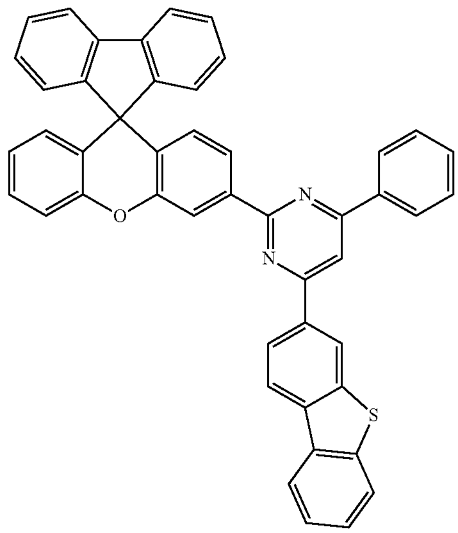
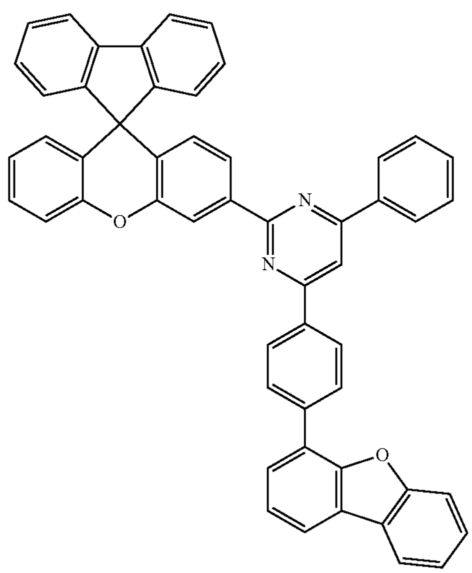
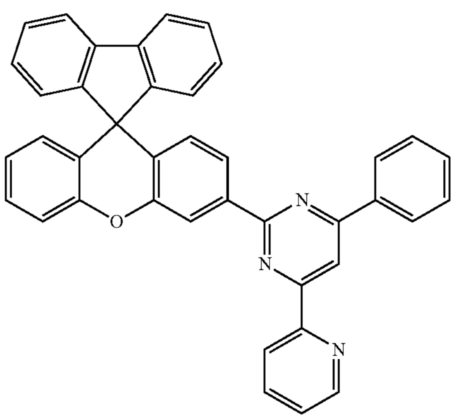
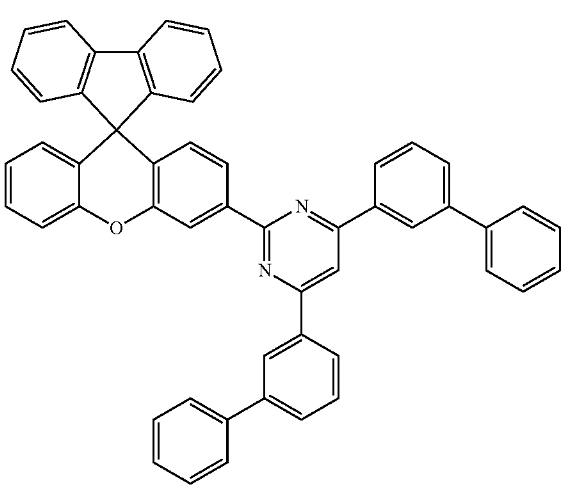
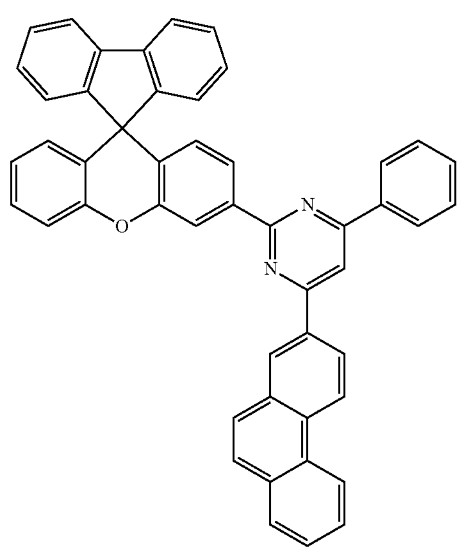

-continued
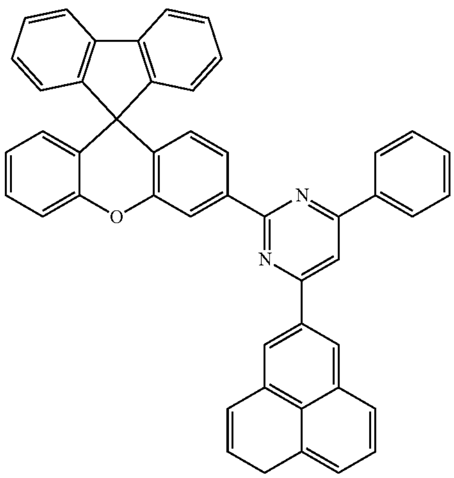
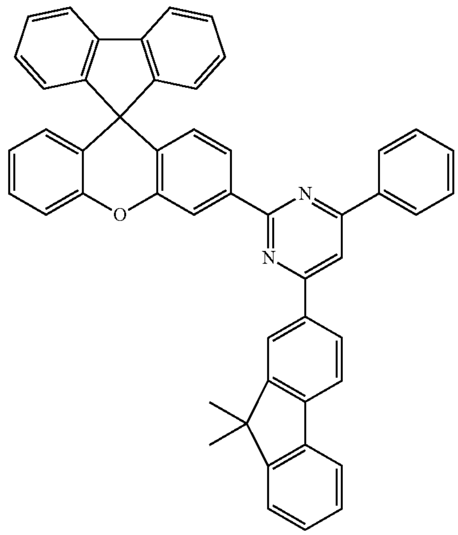
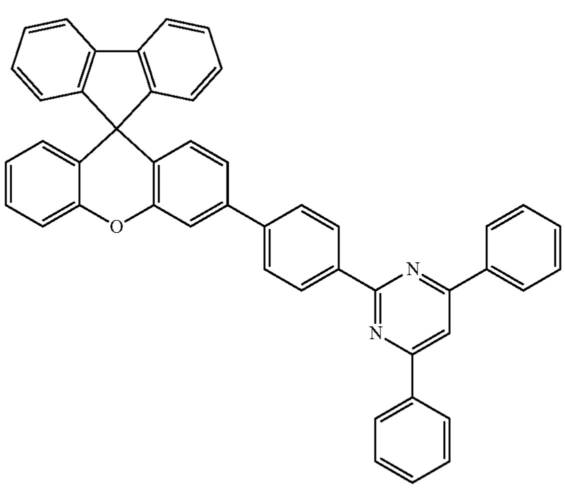
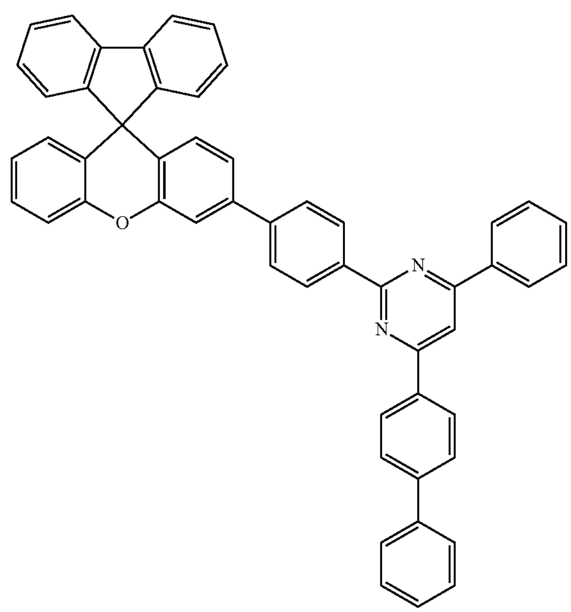

-continued
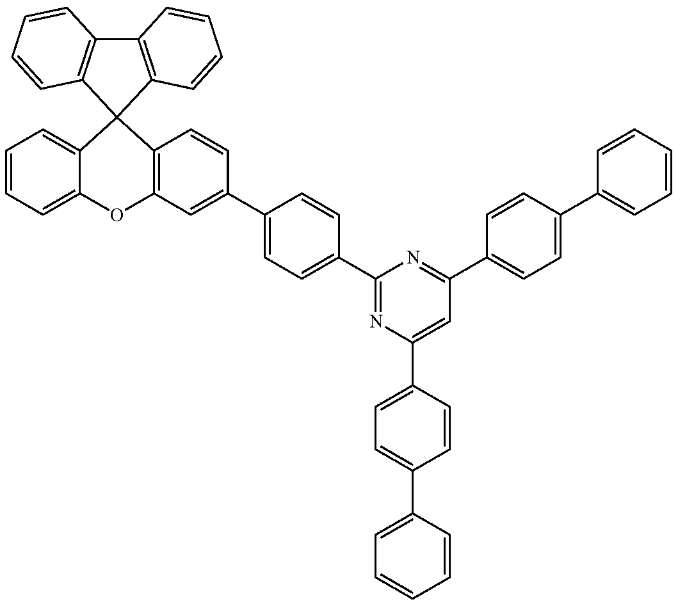
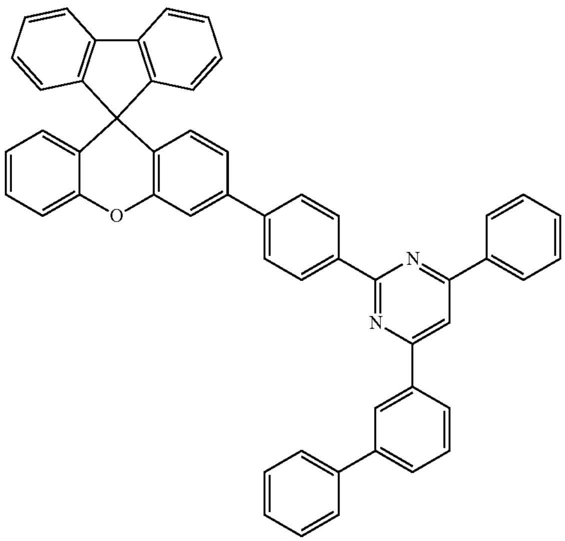
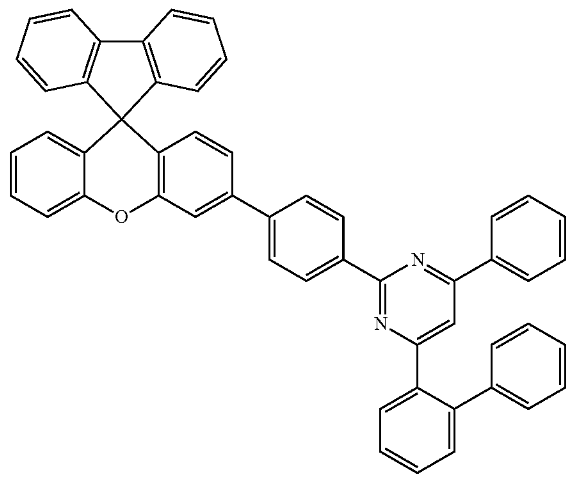
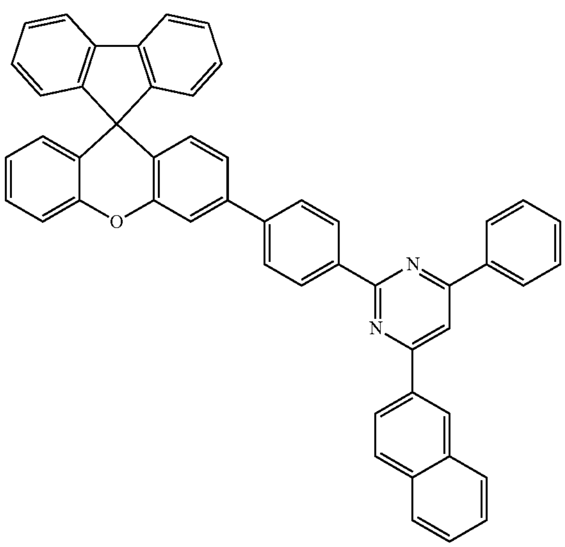
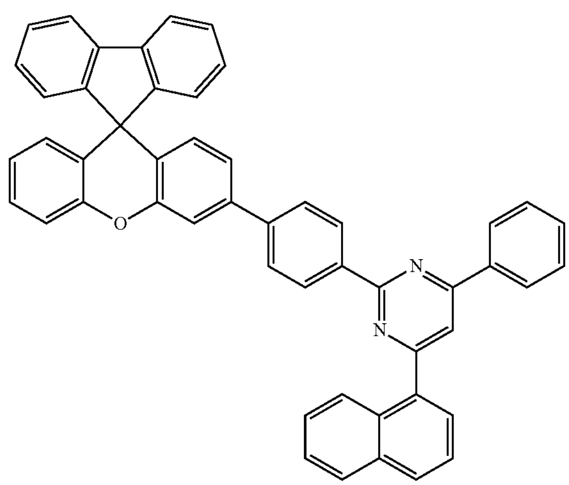

-continued
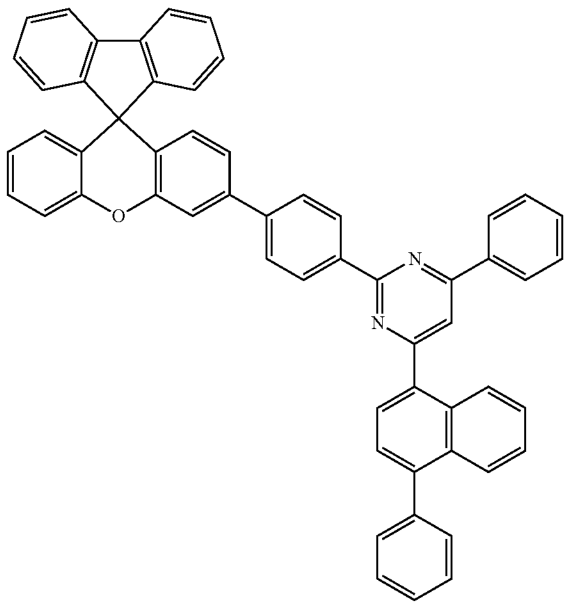
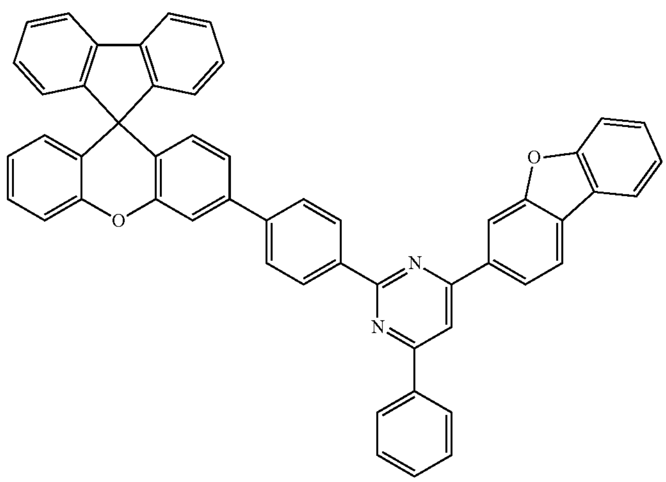
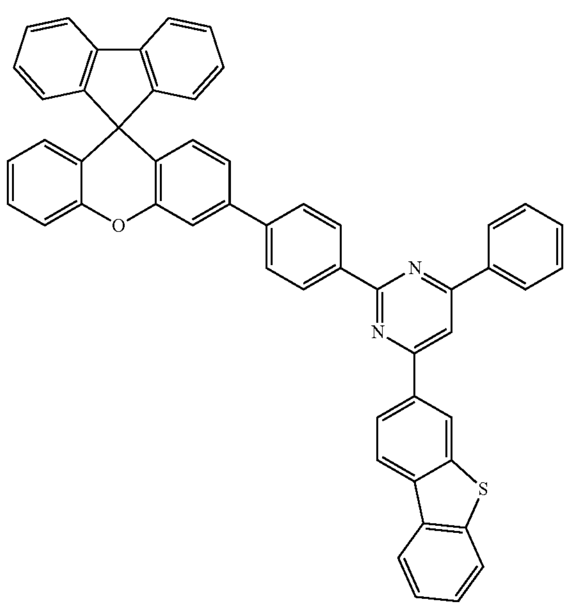
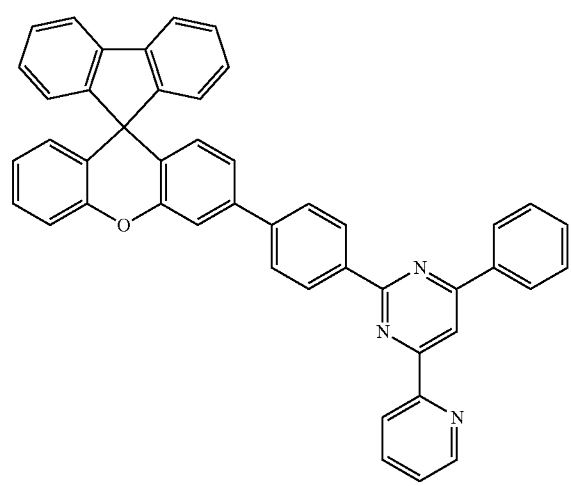

-continued
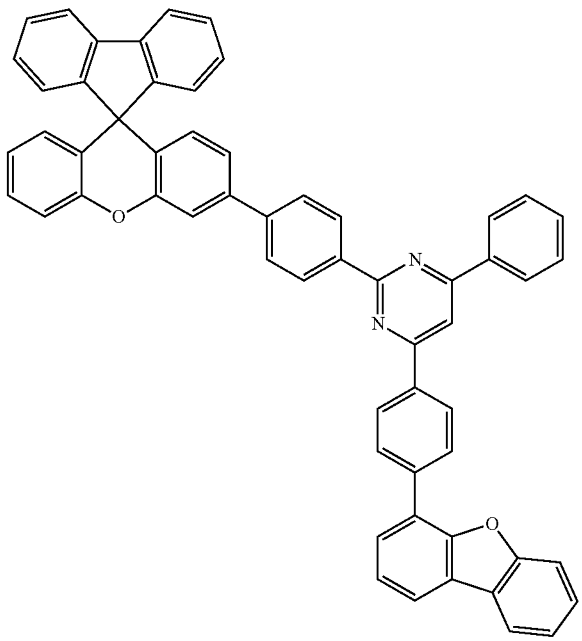
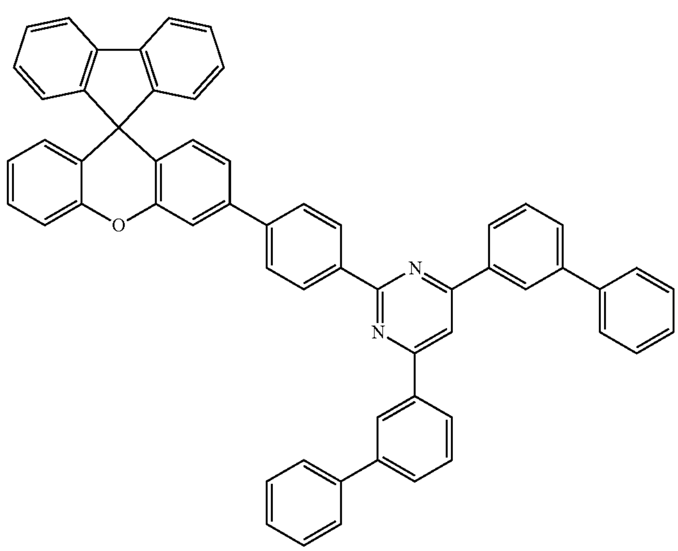

-continued
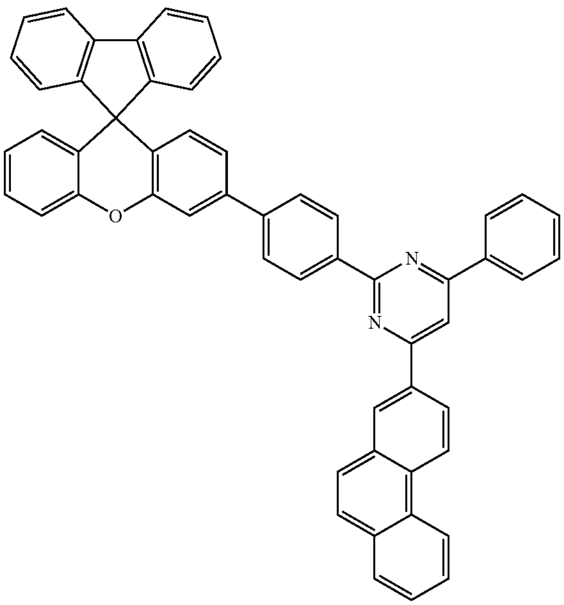
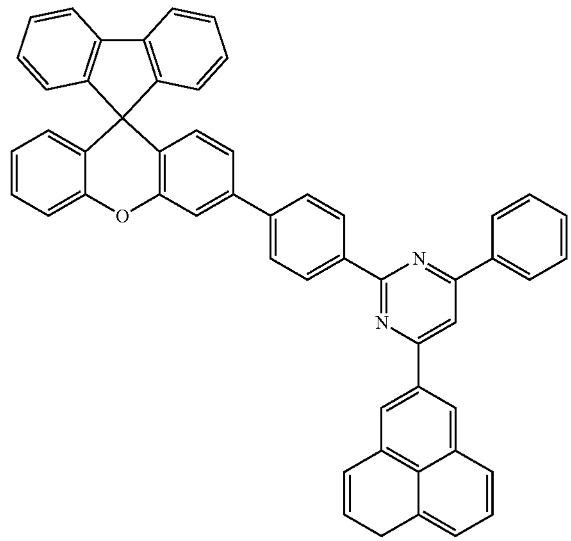
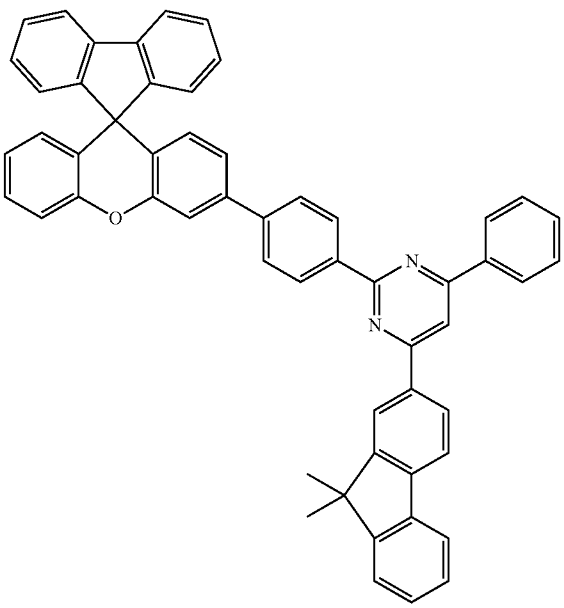
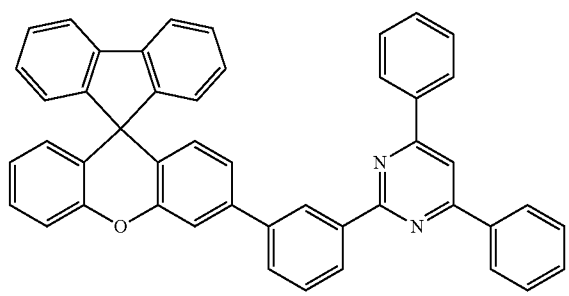
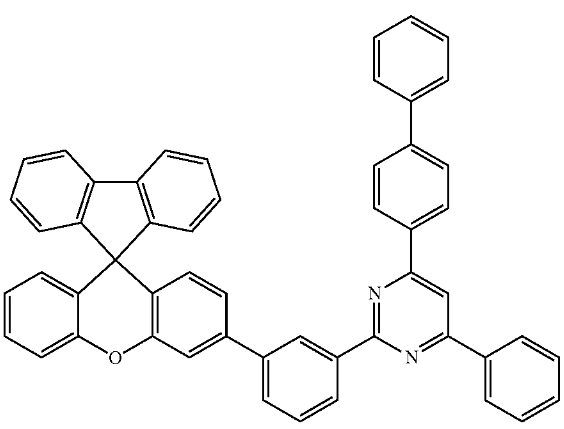

-continued
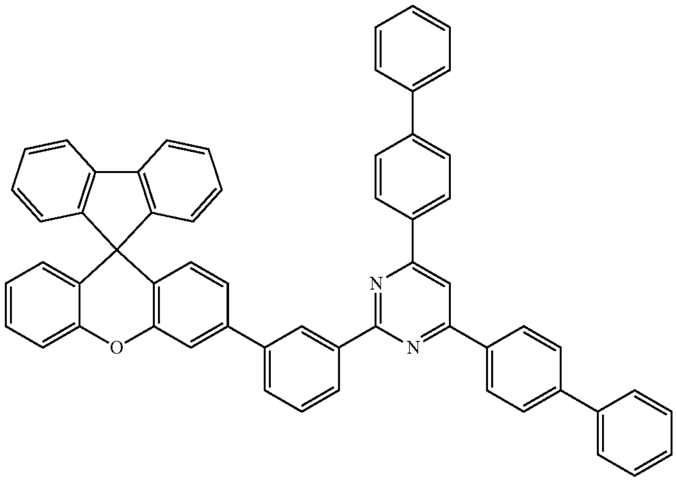
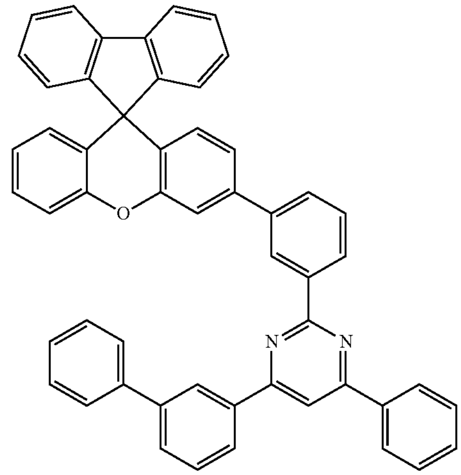
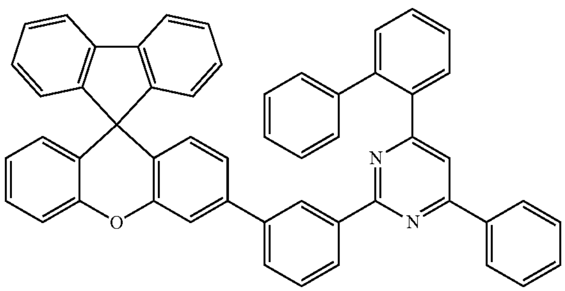
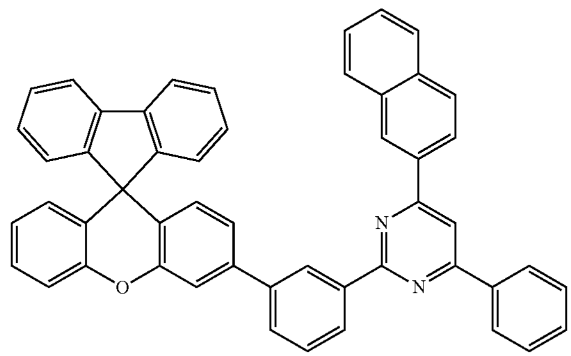
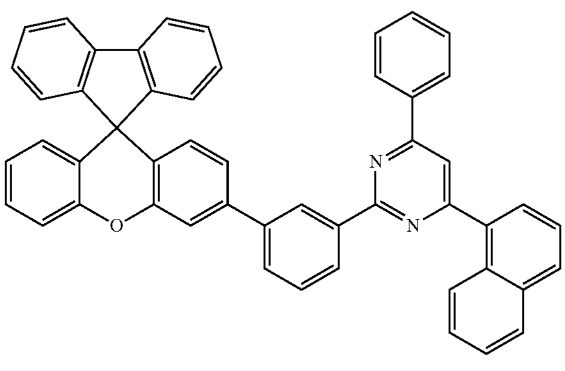
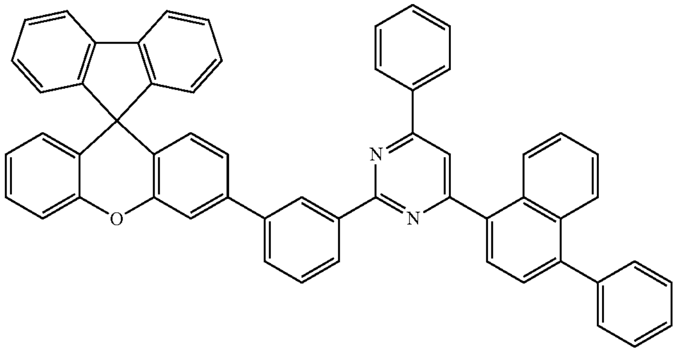

-continued
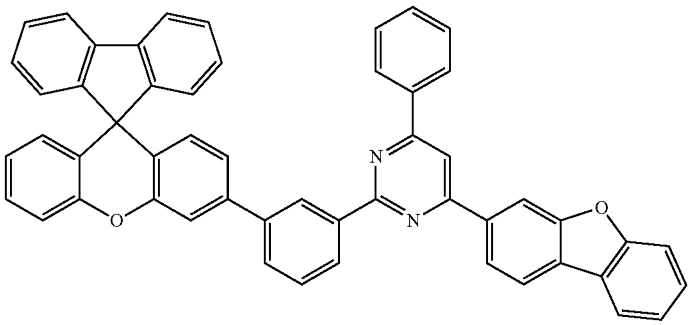
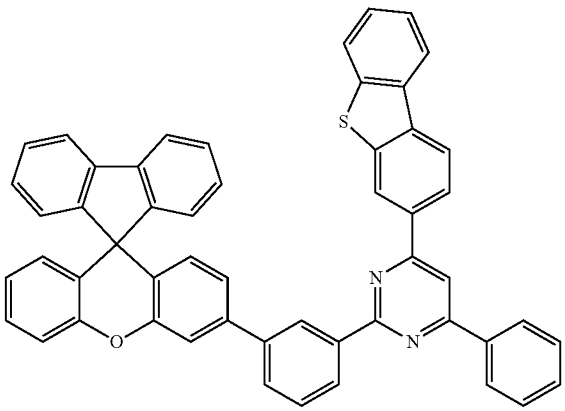
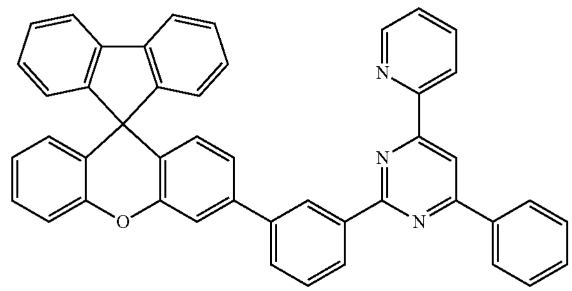
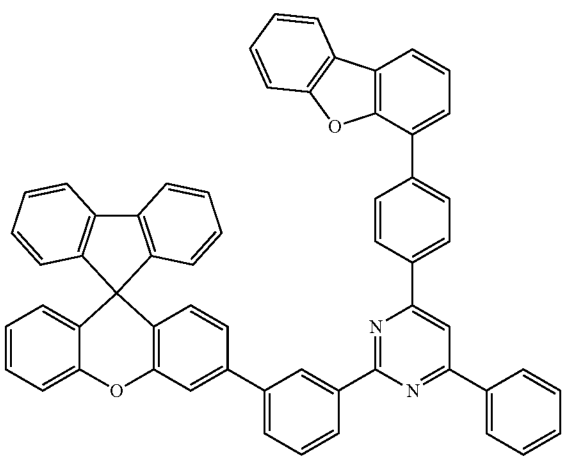
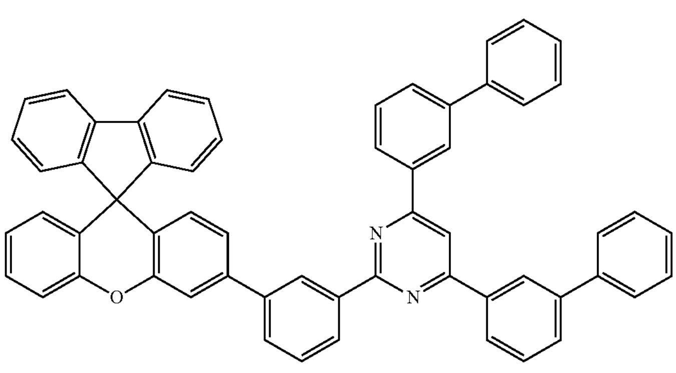

-continued
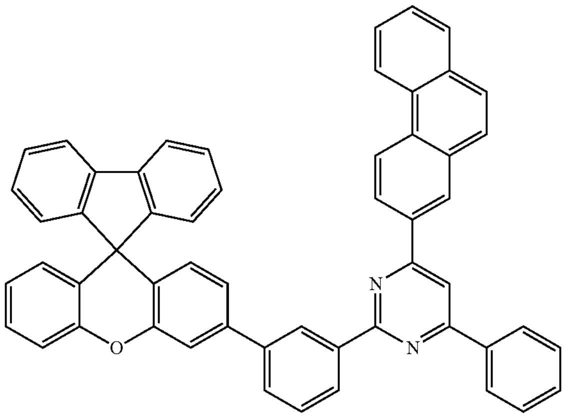
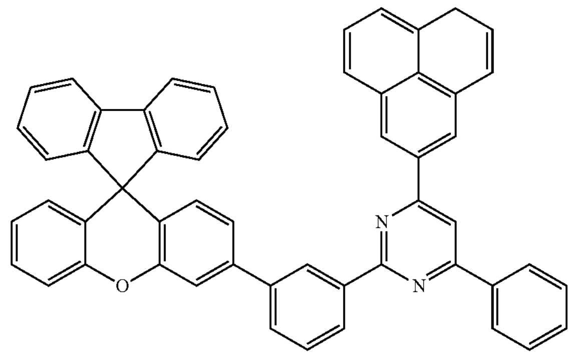
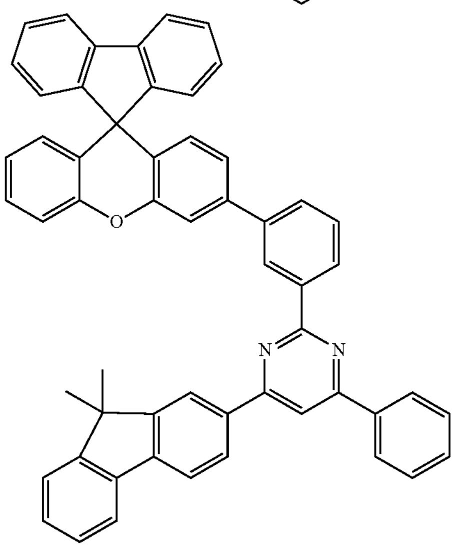
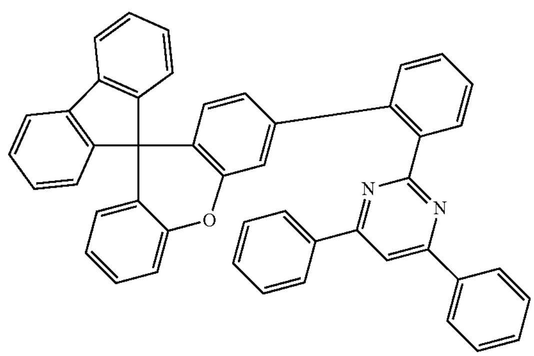
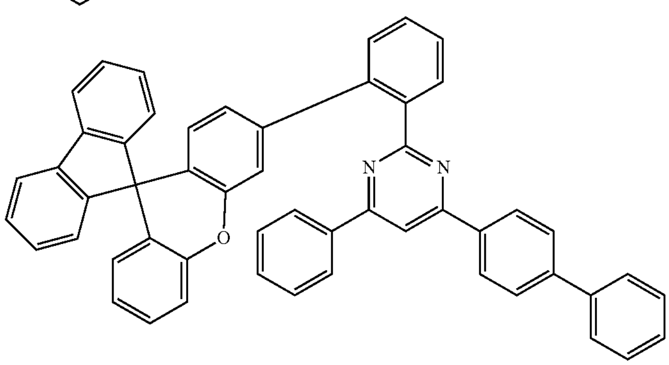
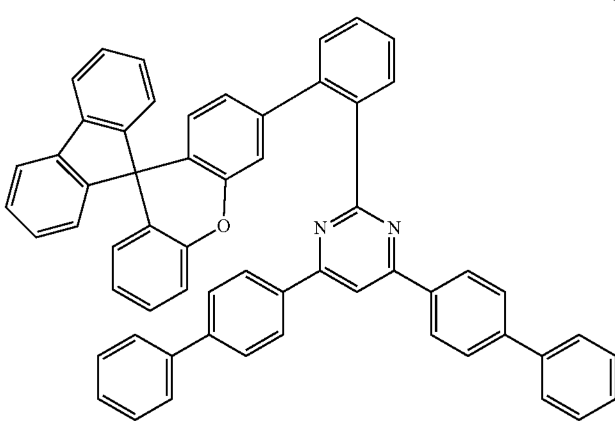

-continued
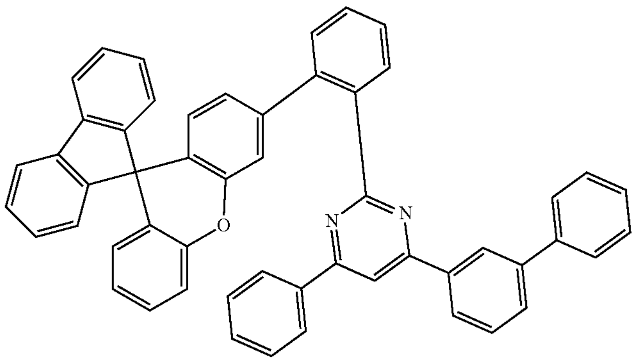
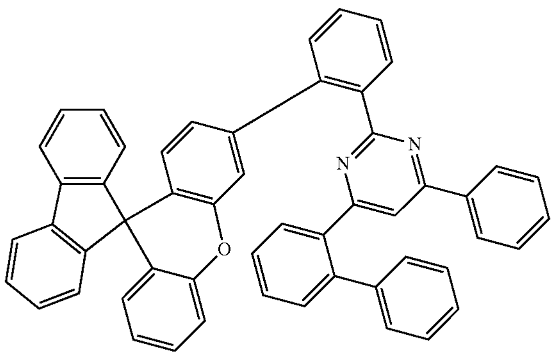
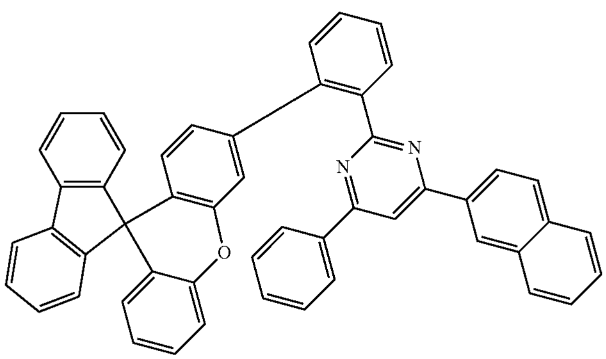
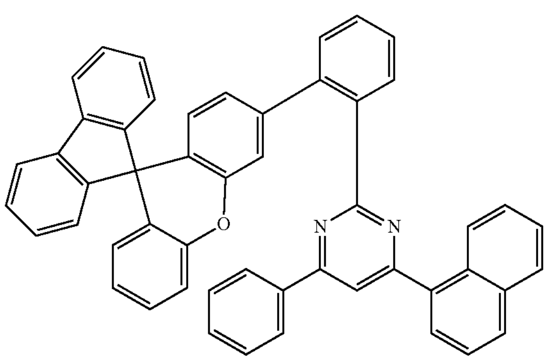

-continued
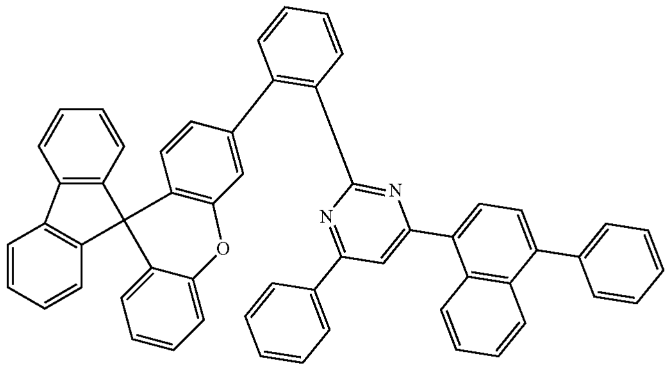
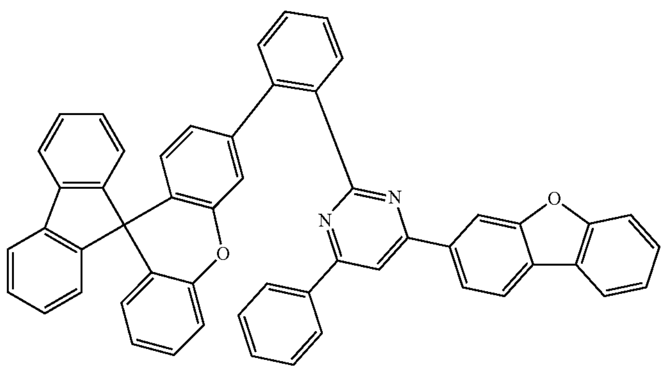
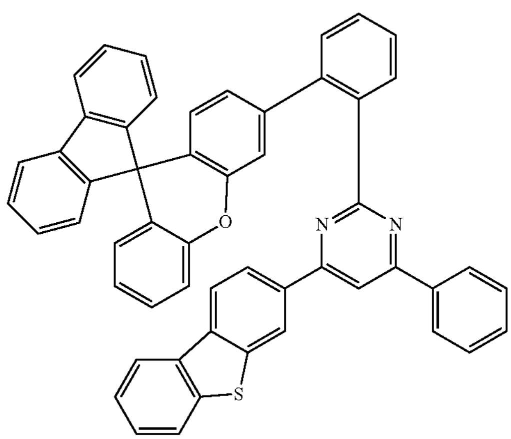
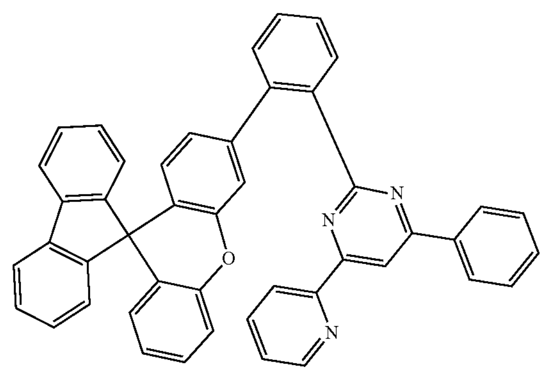
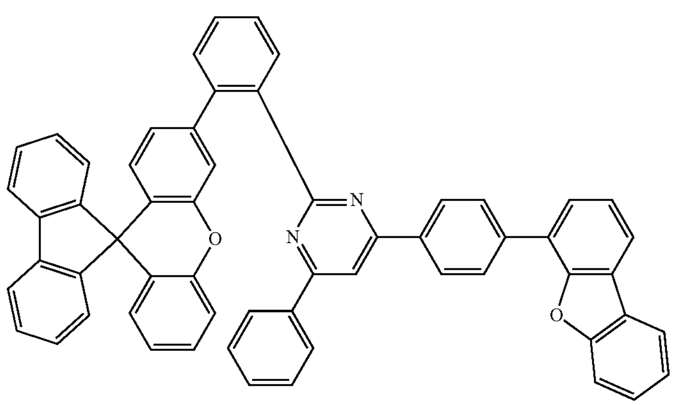

-continued
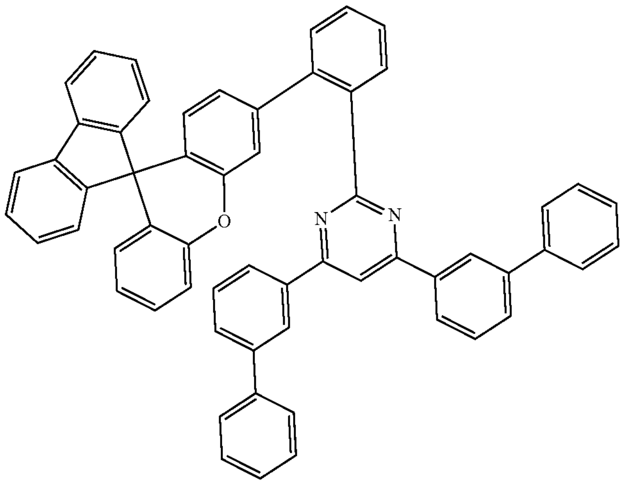
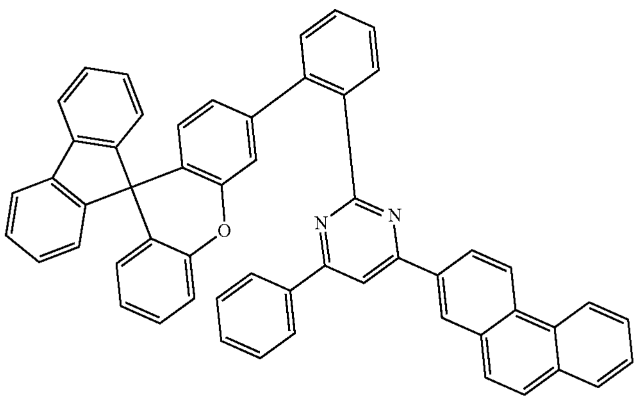
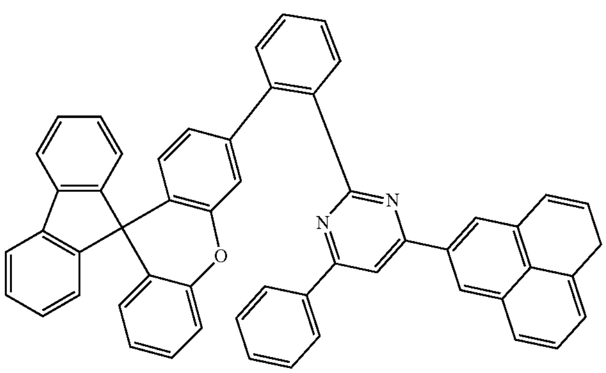
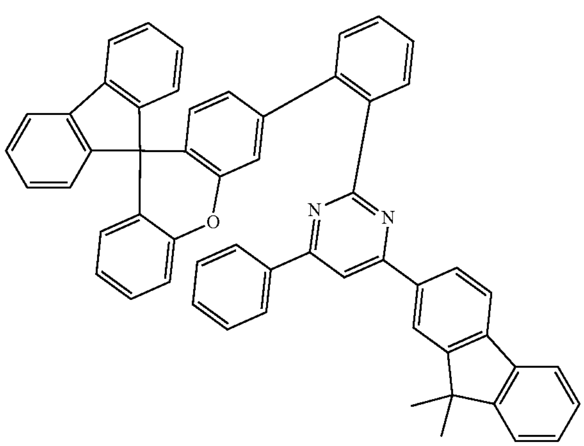

-continued
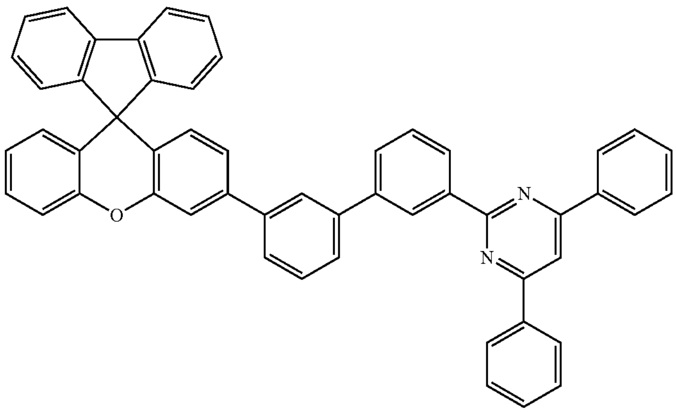
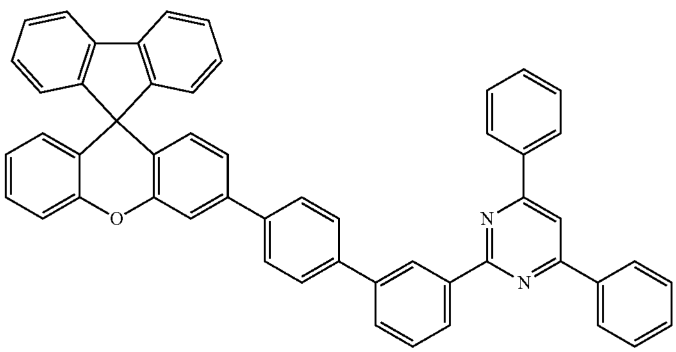
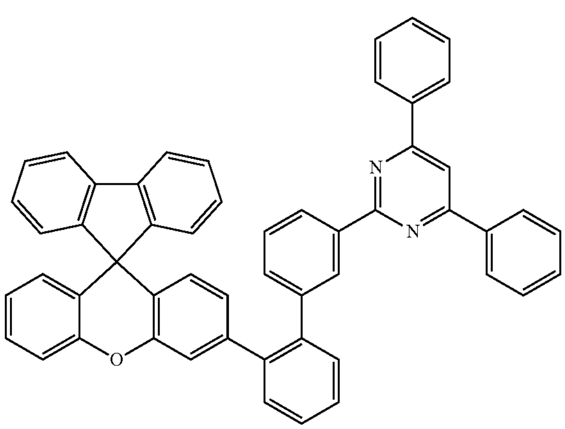
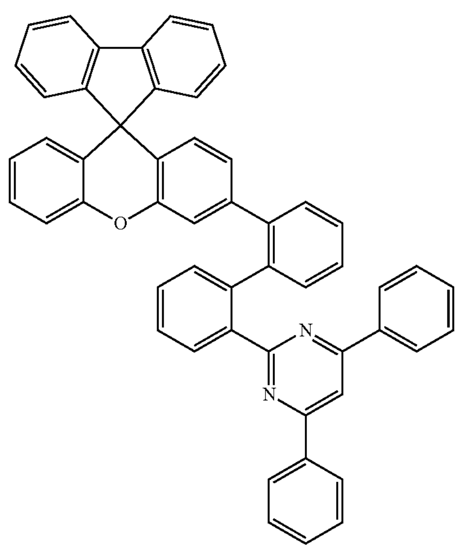

-continued
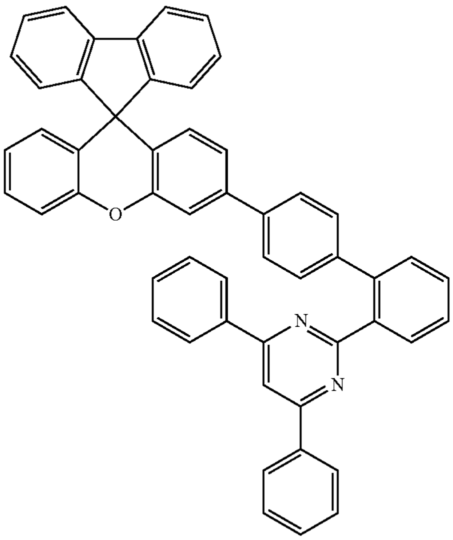
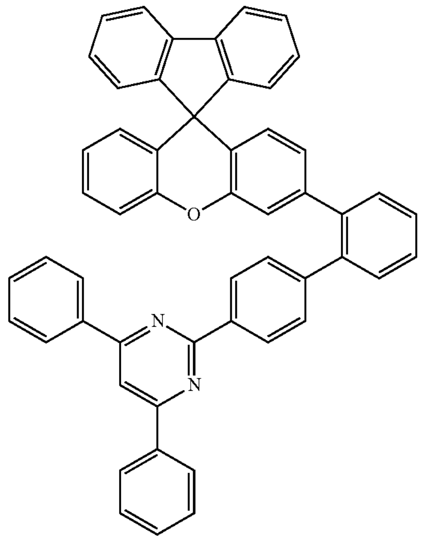
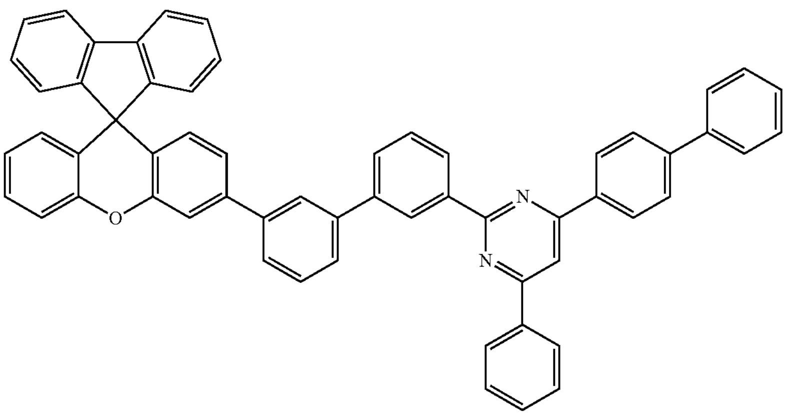
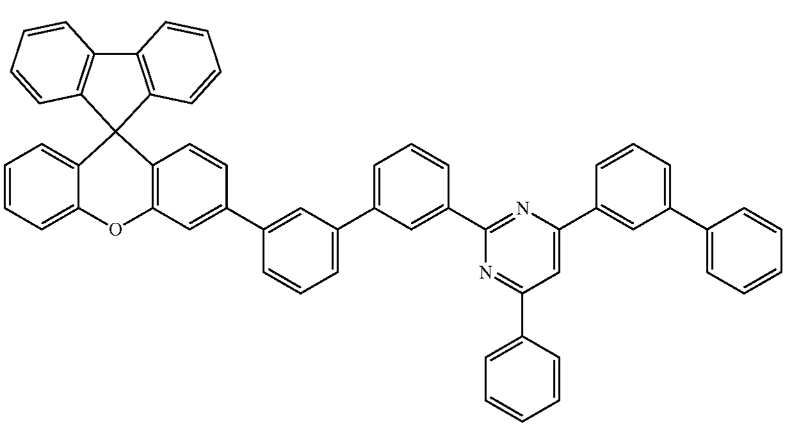

-continued
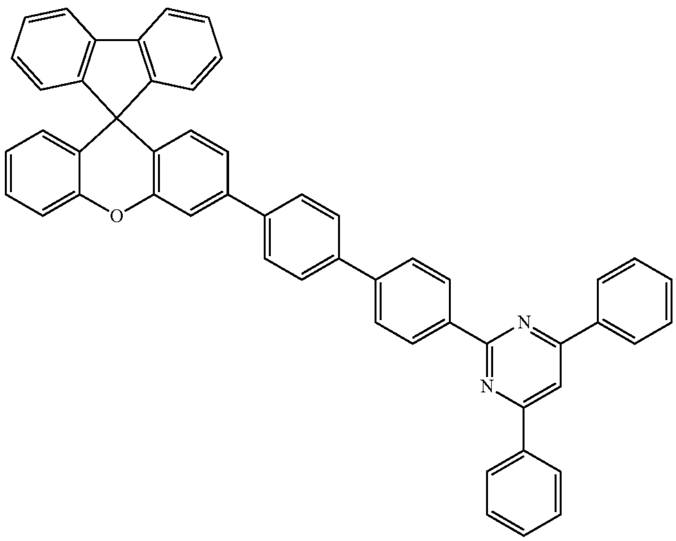
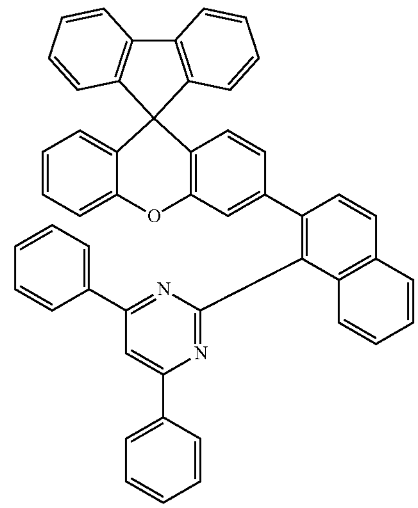
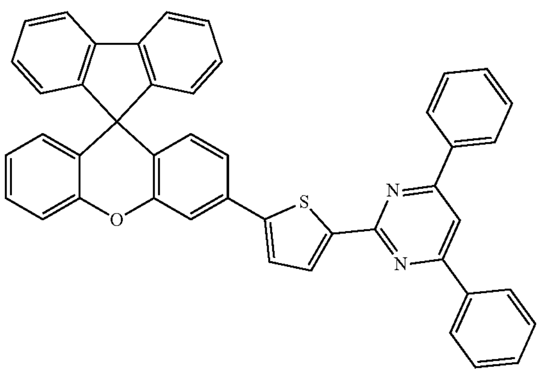
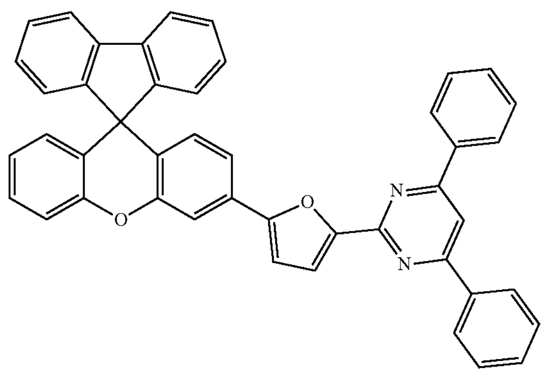
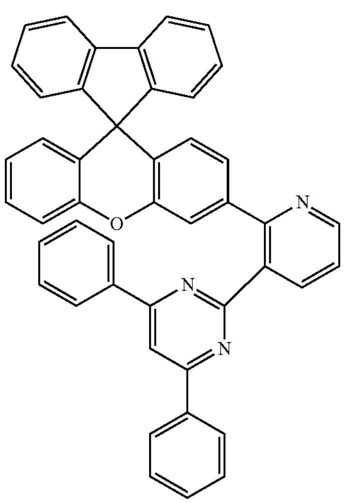
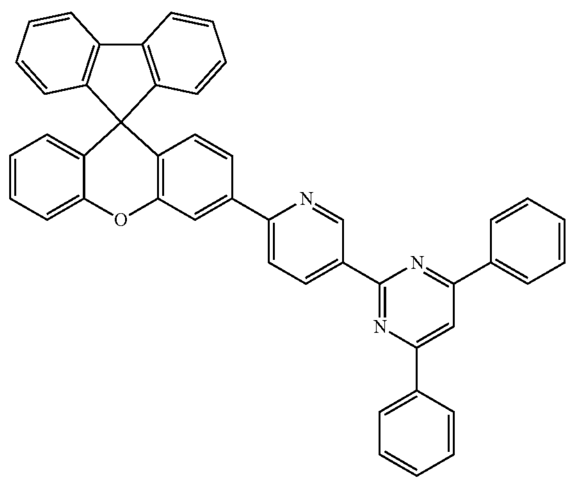
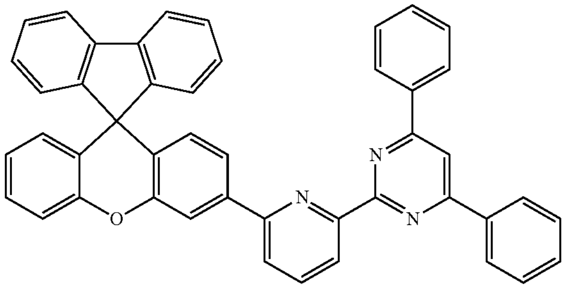

-continued
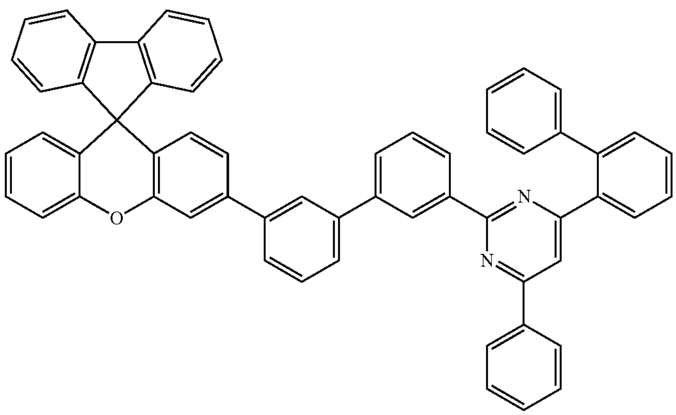
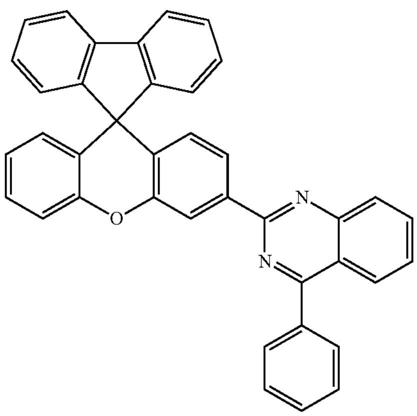
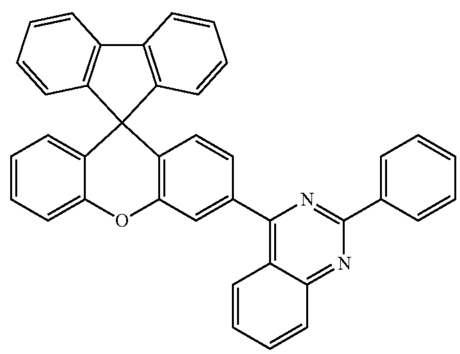
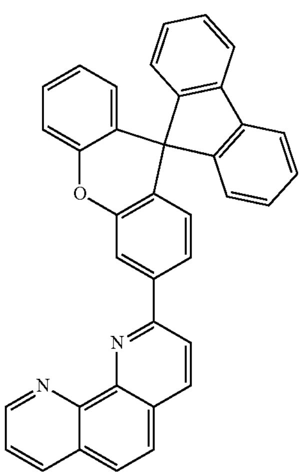
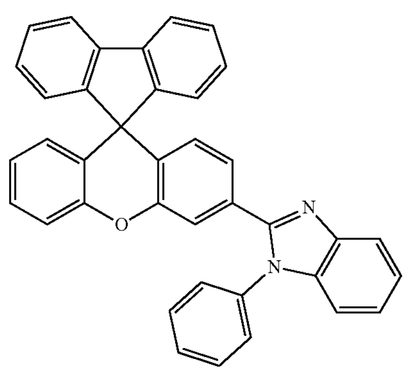
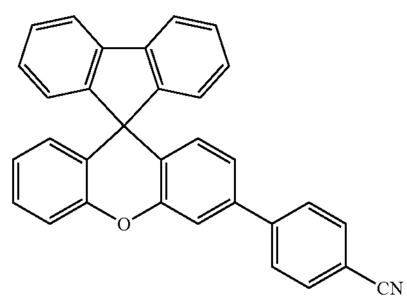
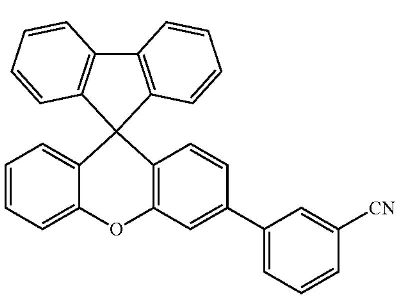
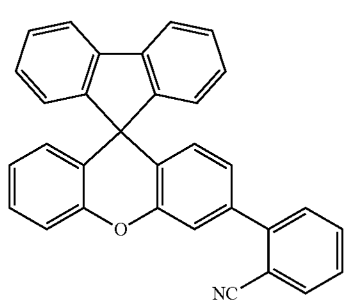

-continued
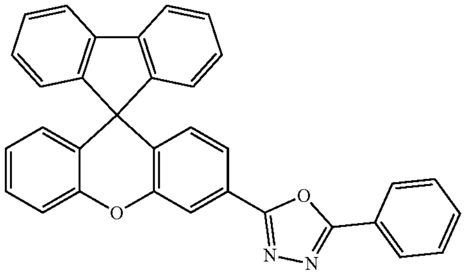
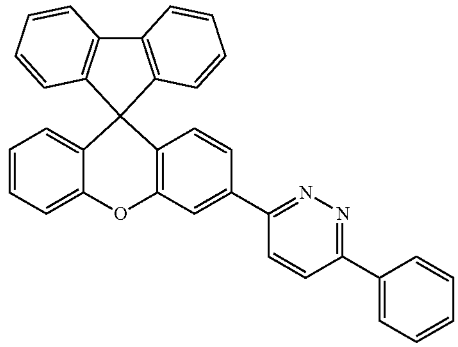
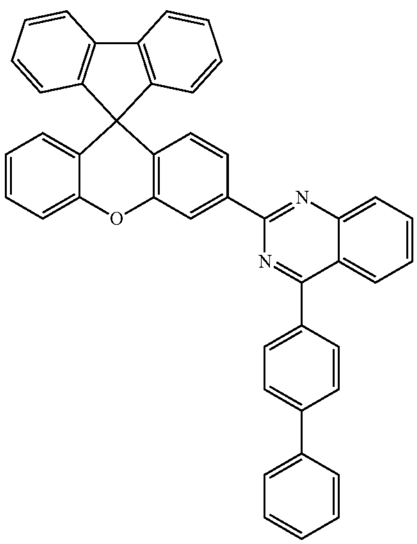
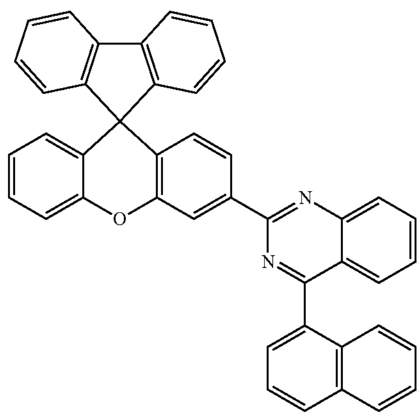
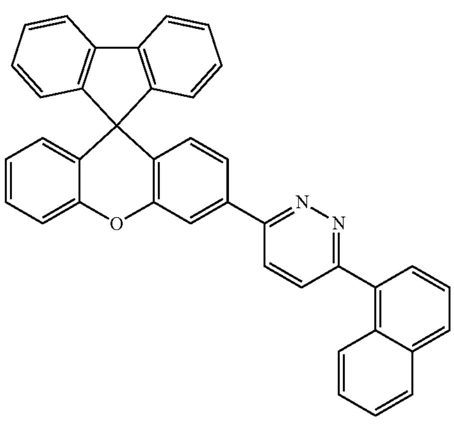
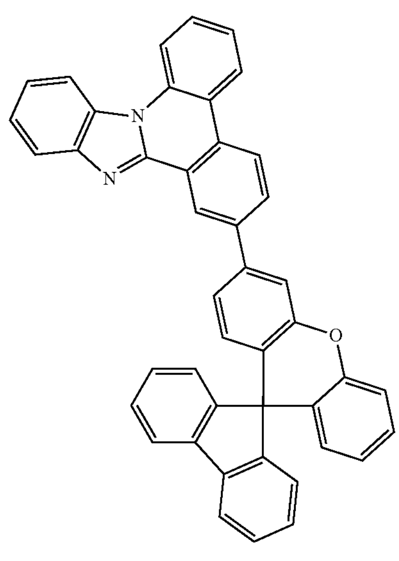

-continued
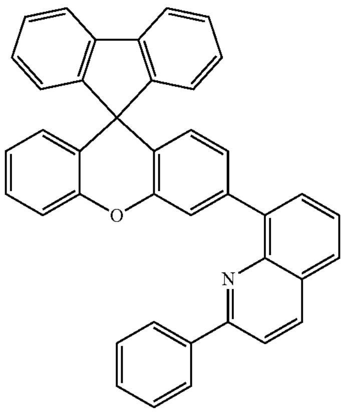
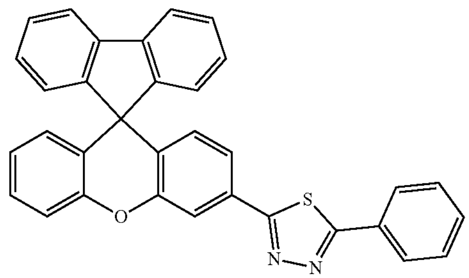
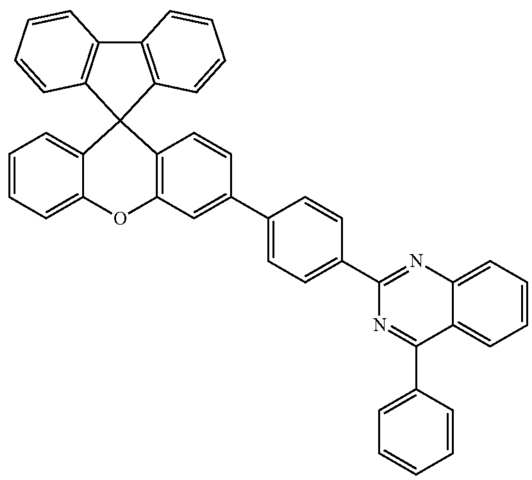
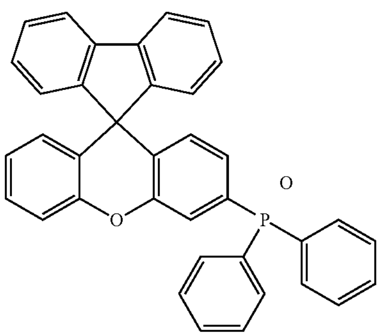
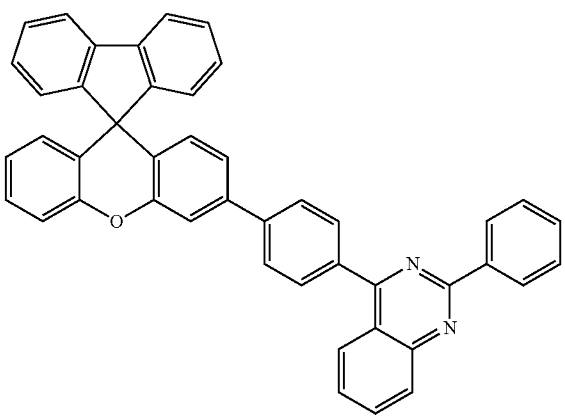
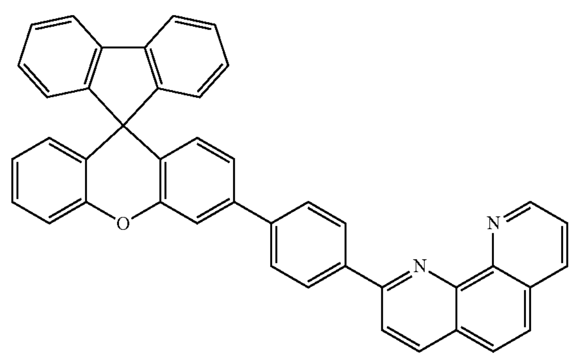
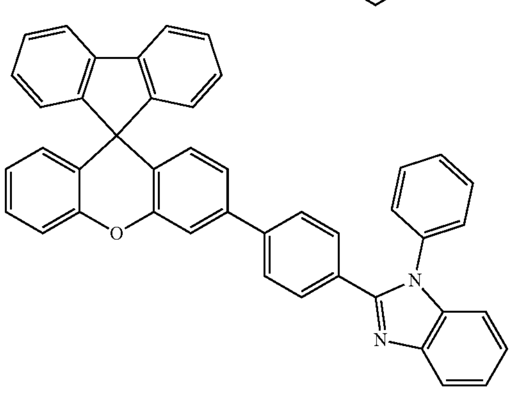
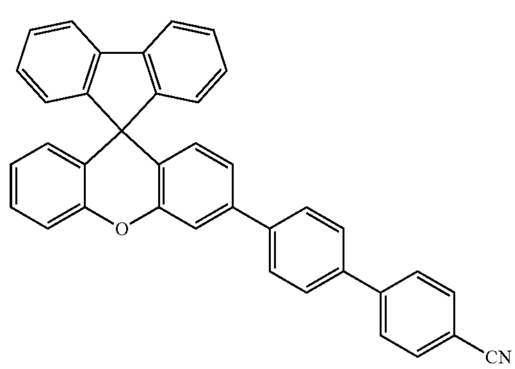

-continued
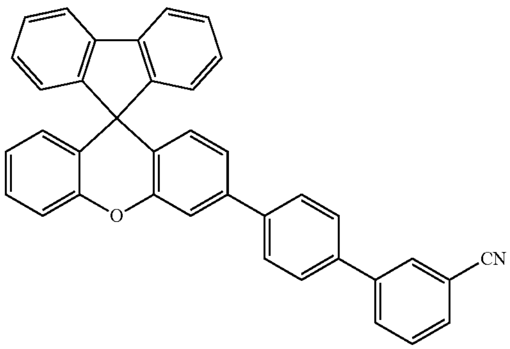
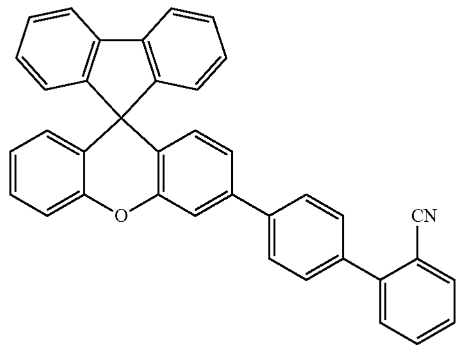
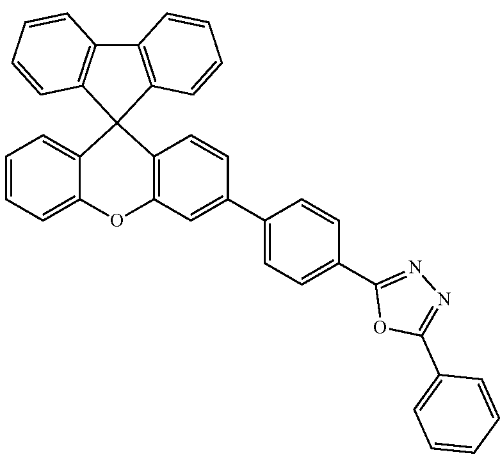
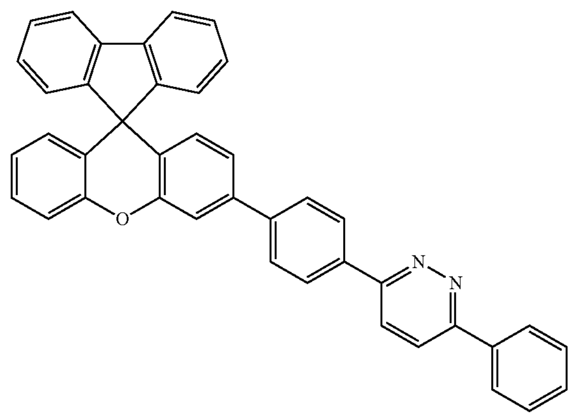
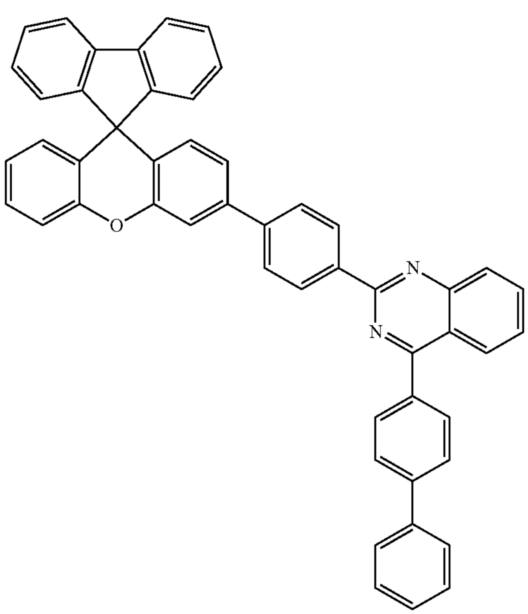
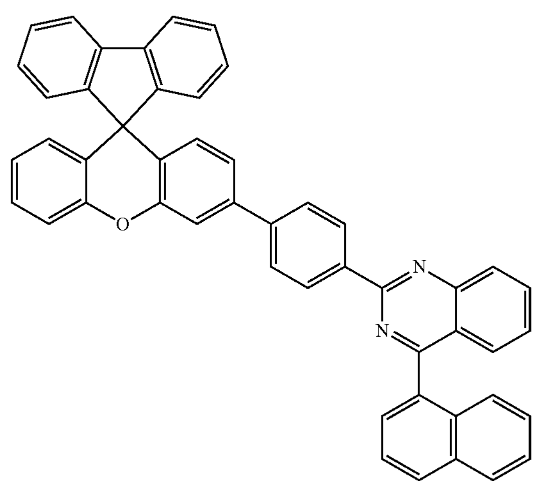

-continued
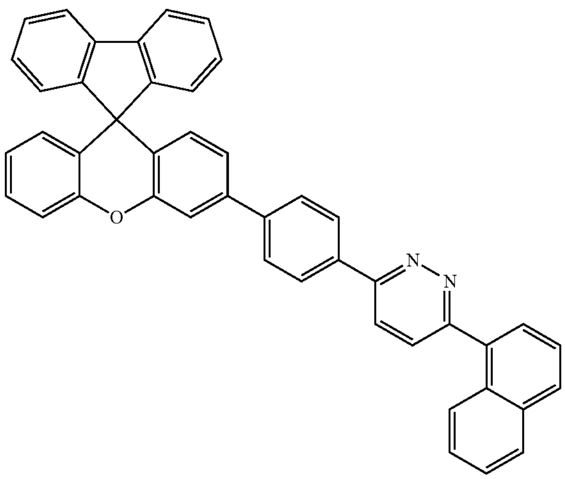
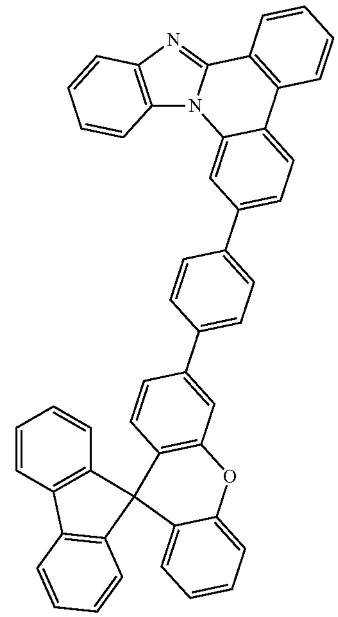
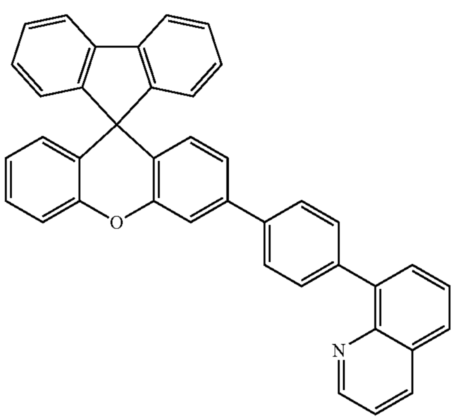
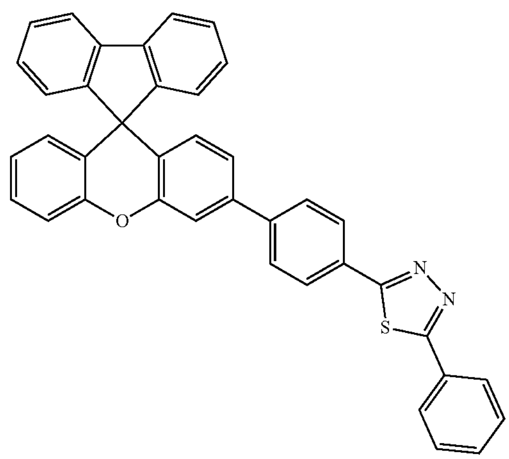
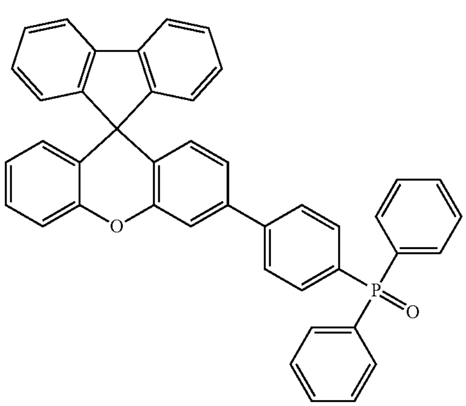
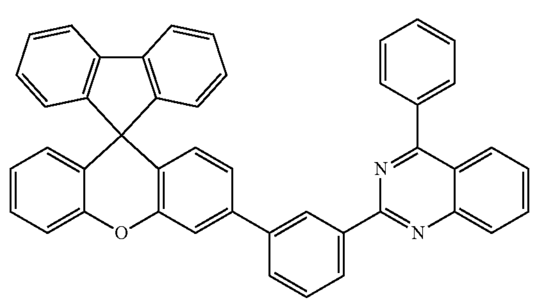

-continued
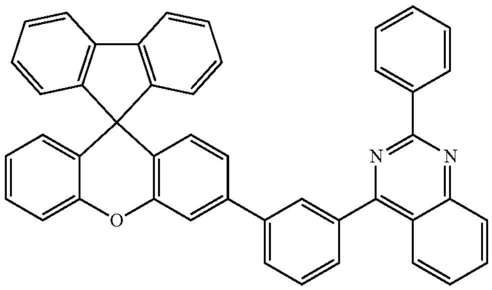
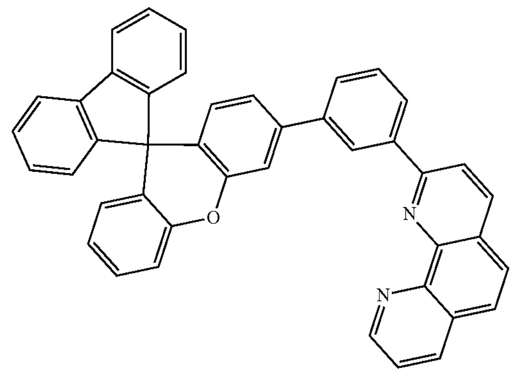
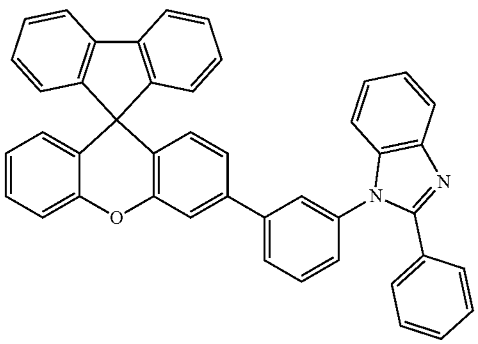
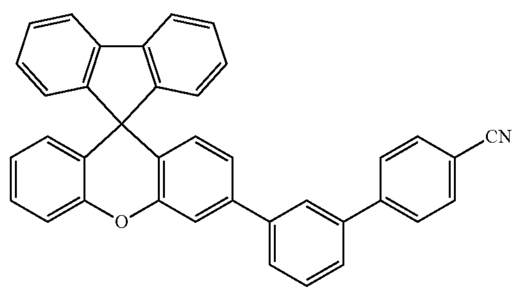
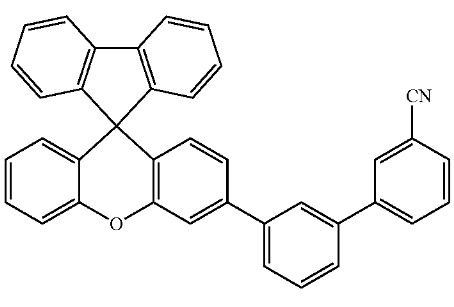
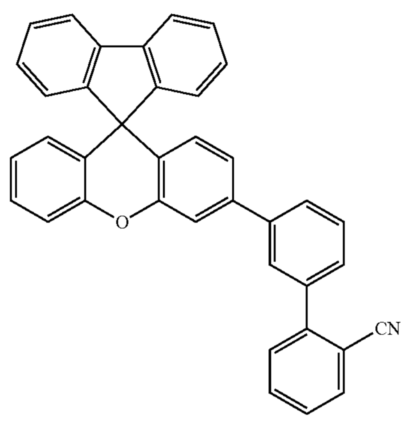
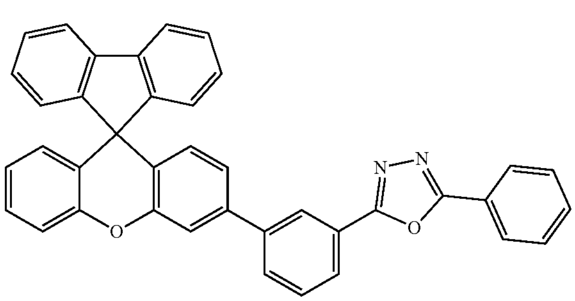

-continued
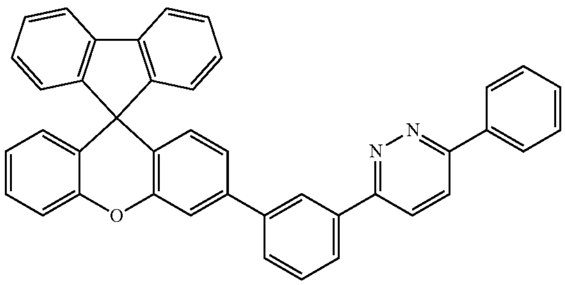
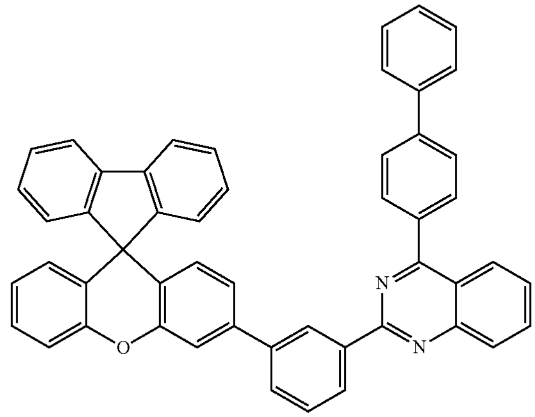
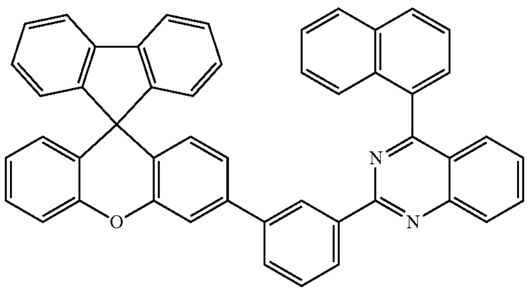
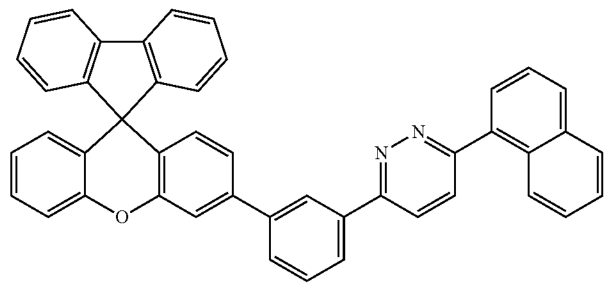
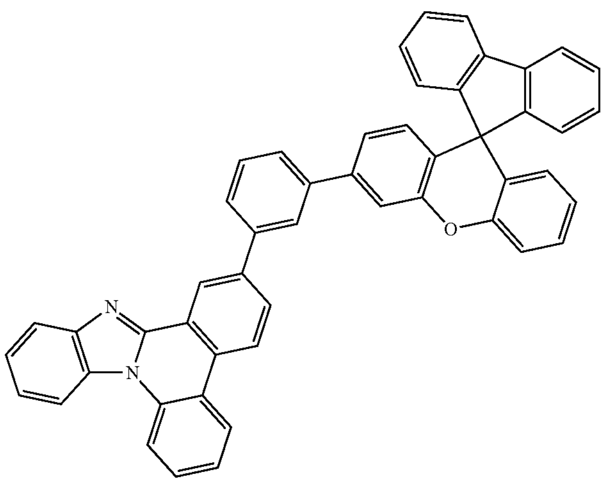
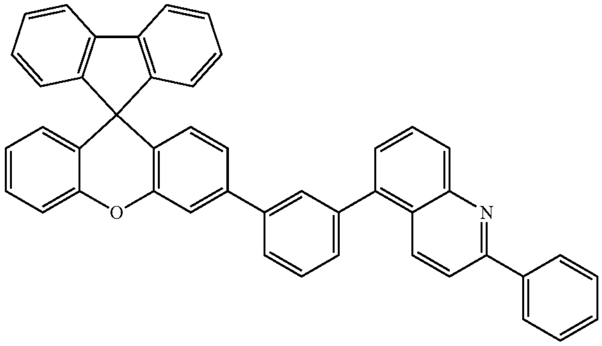

-continued
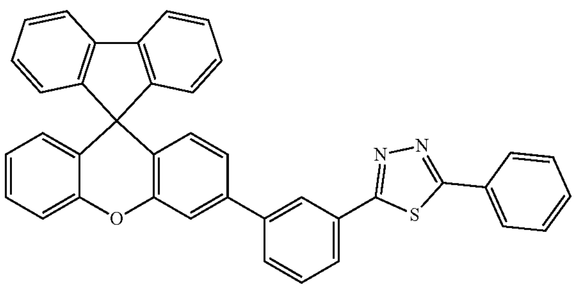
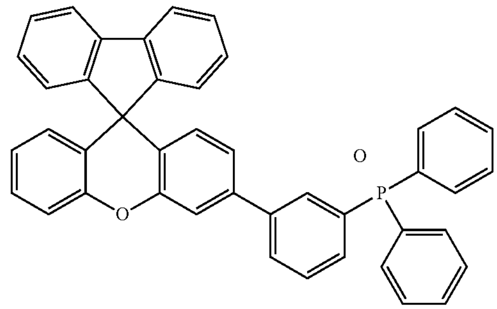
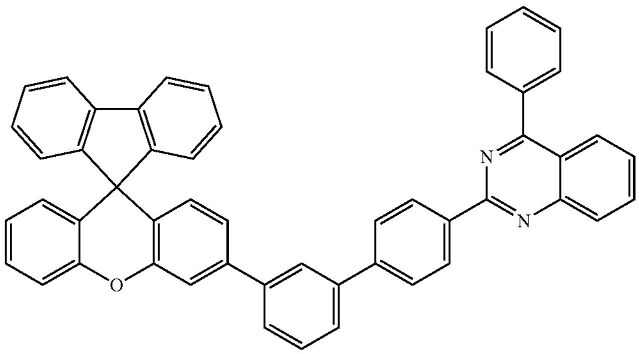
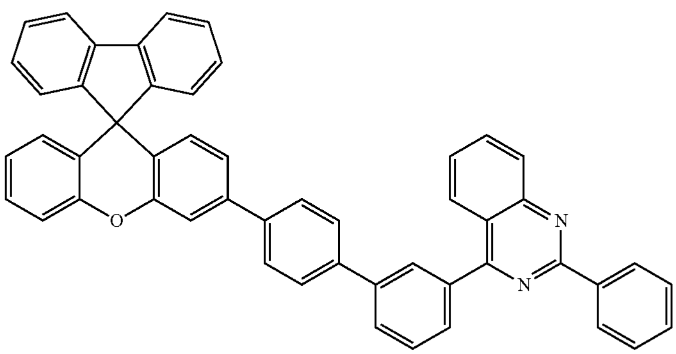
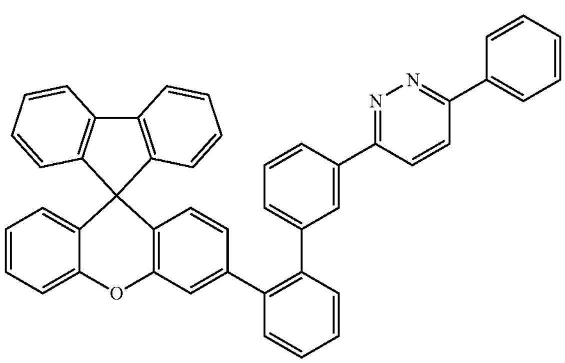
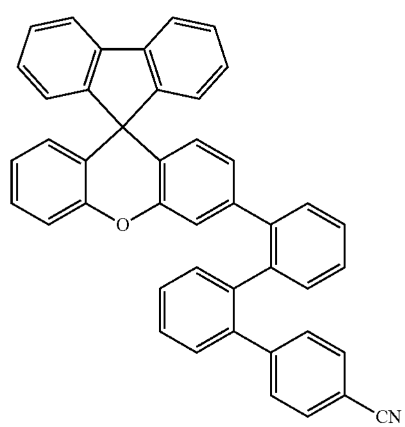

-continued
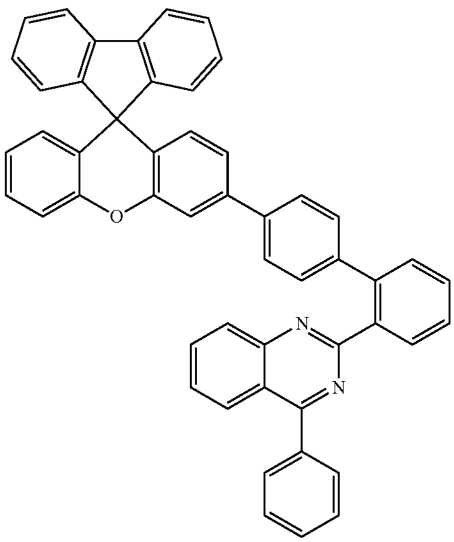
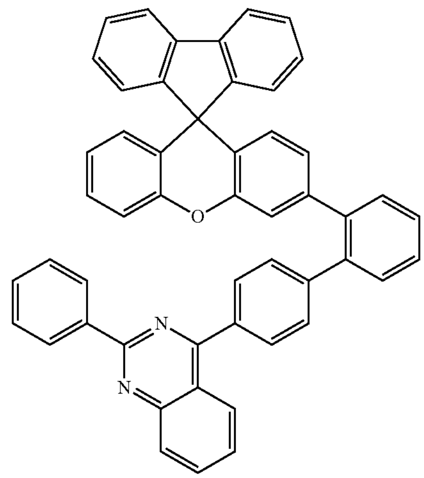
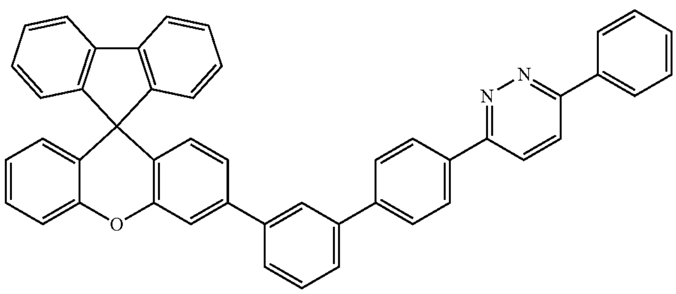
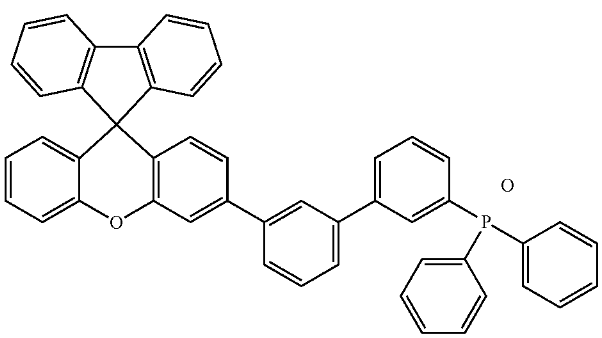
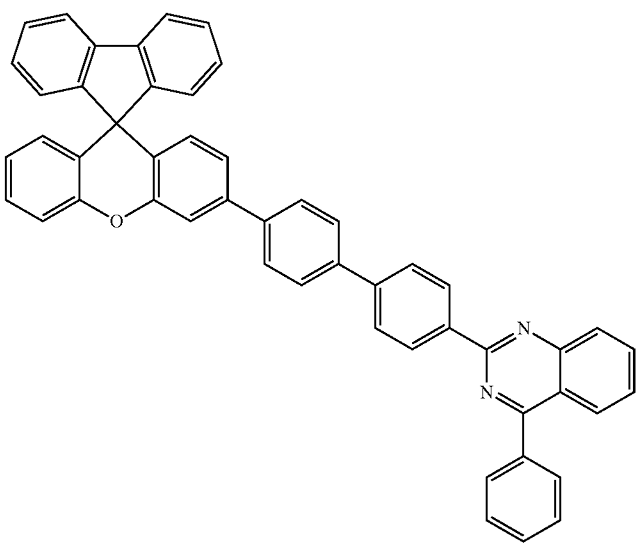
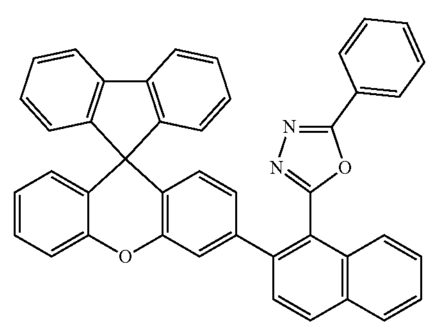

-continued
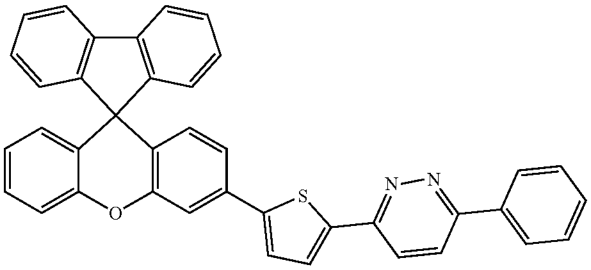
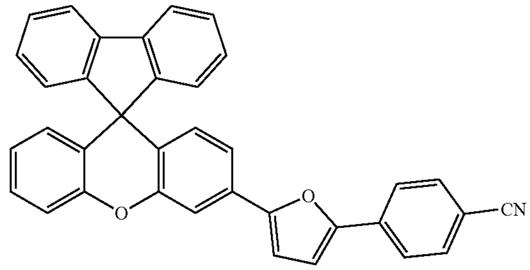
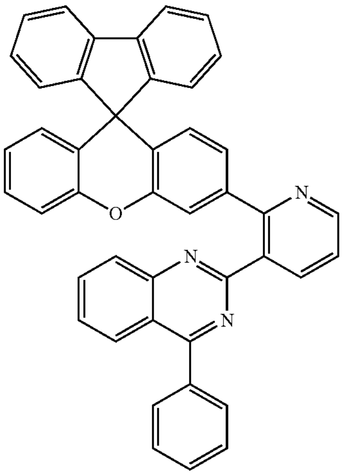
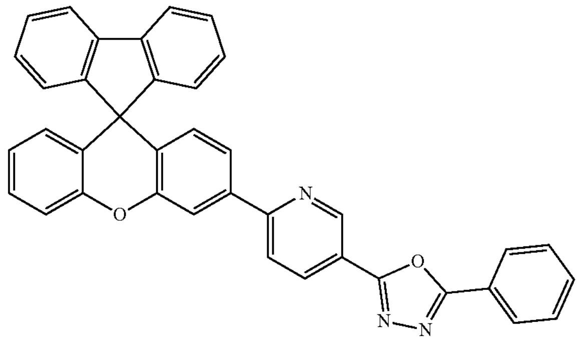
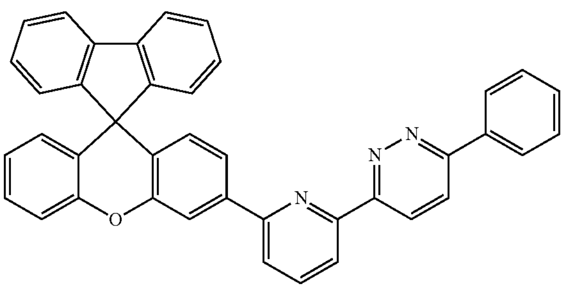
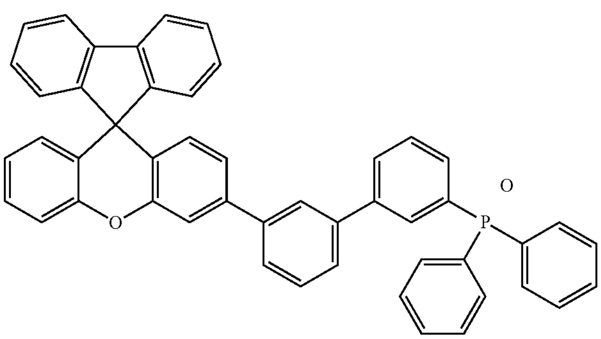

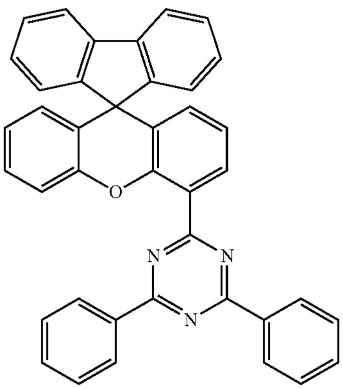
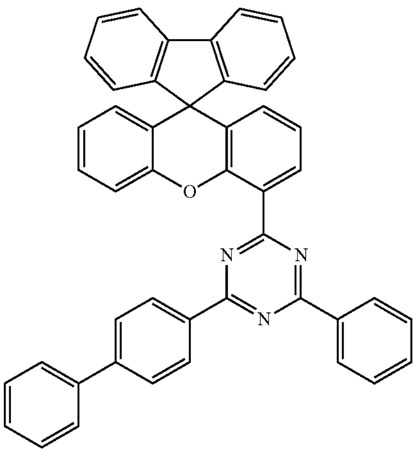
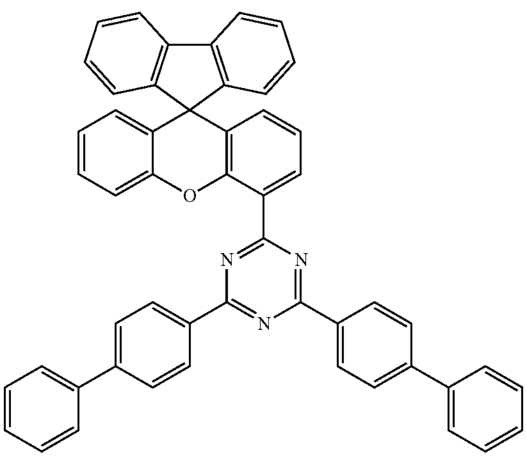
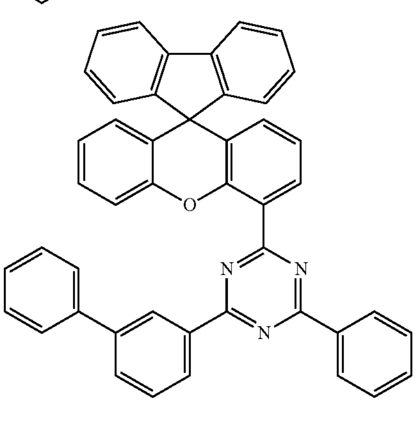
-continued
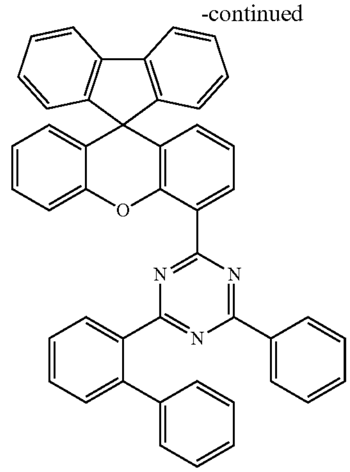
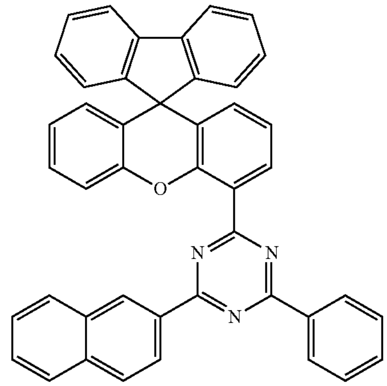
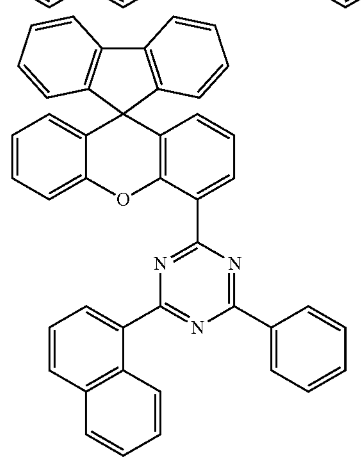
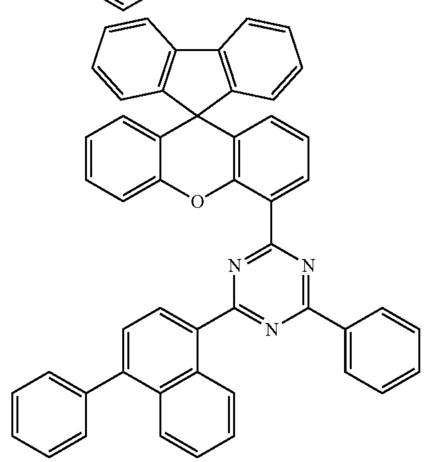

-continued
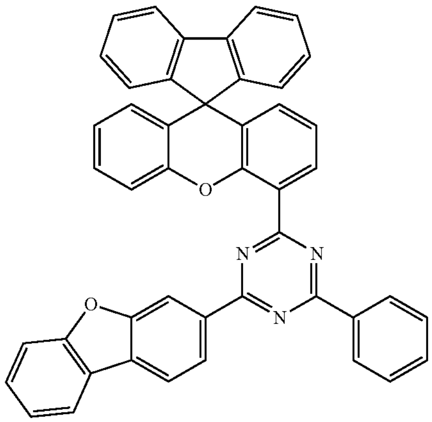
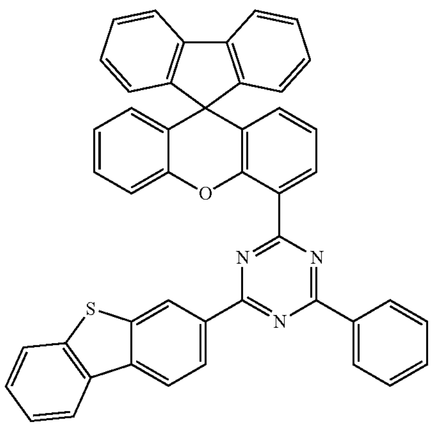
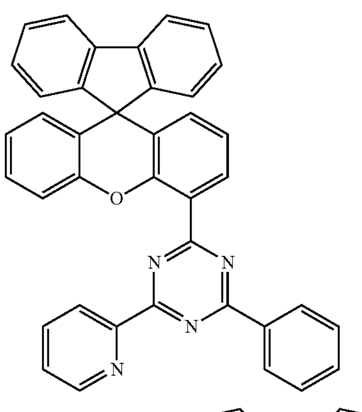
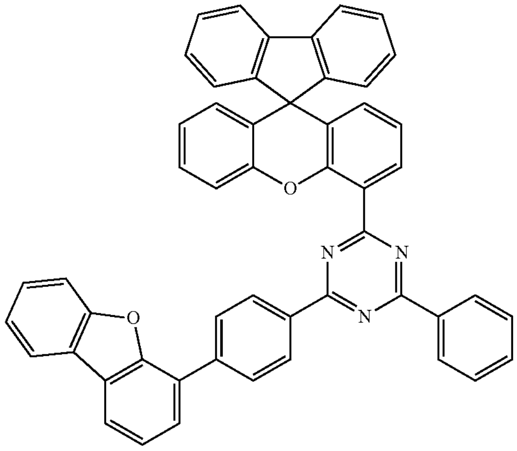
-continued
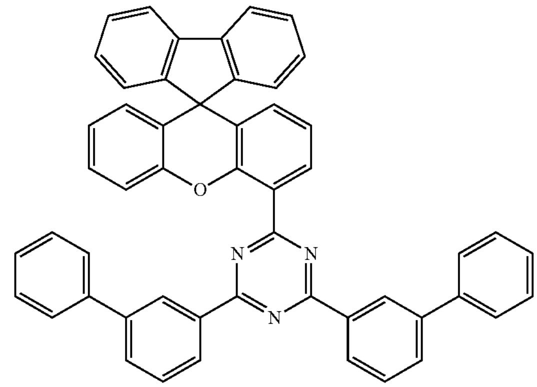
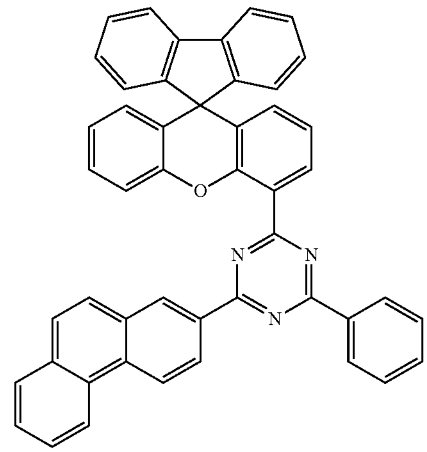
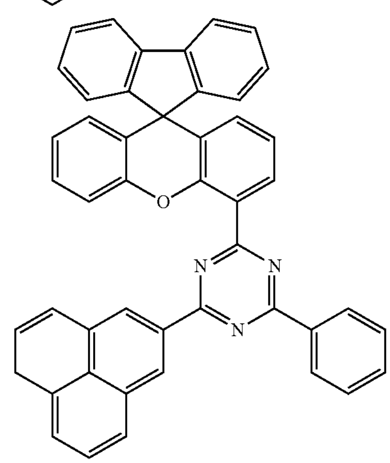
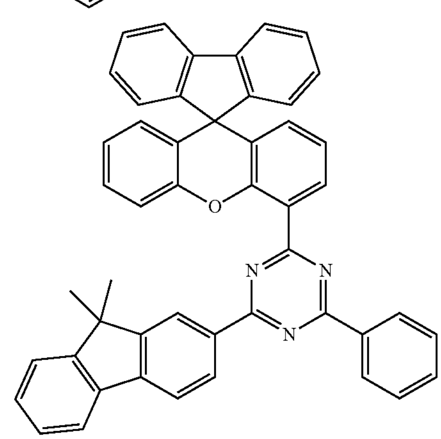

-continued
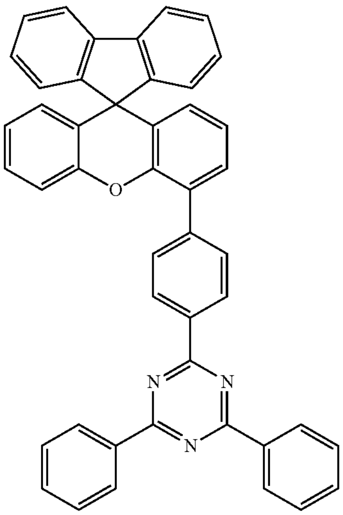
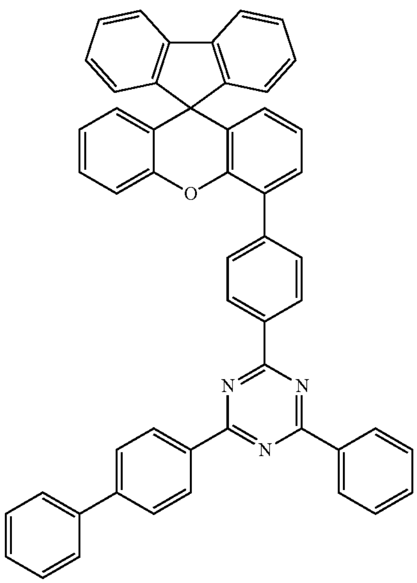
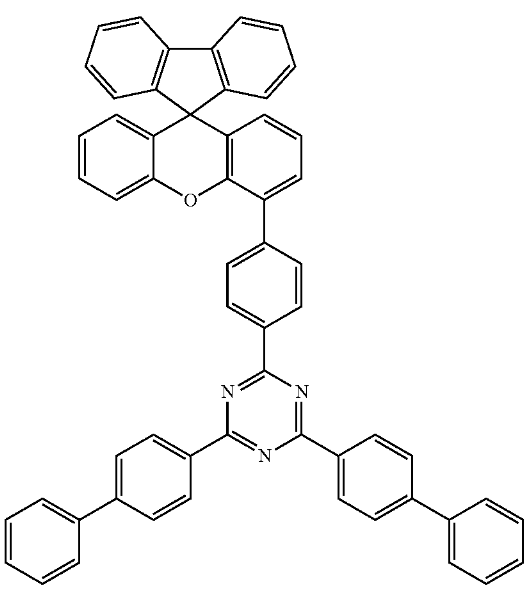
-continued
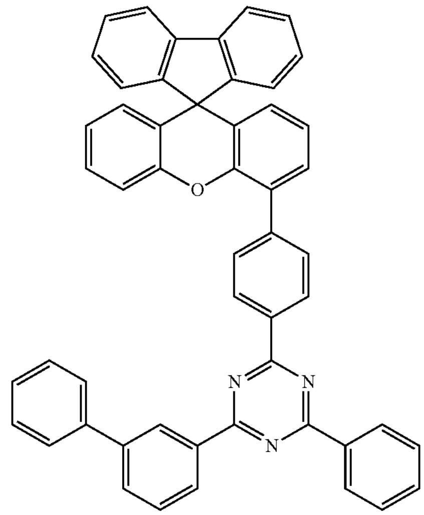
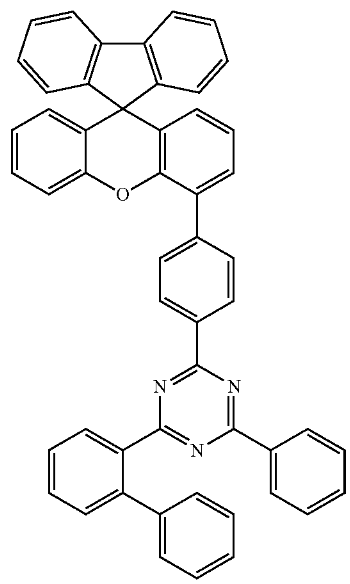
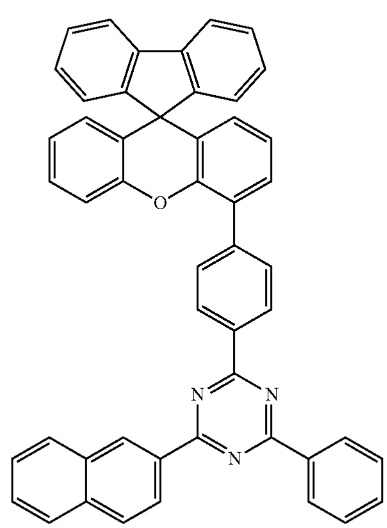

-continued
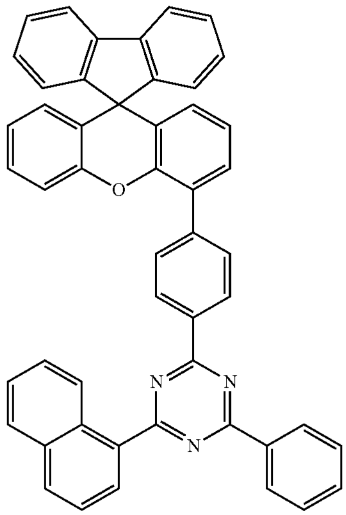
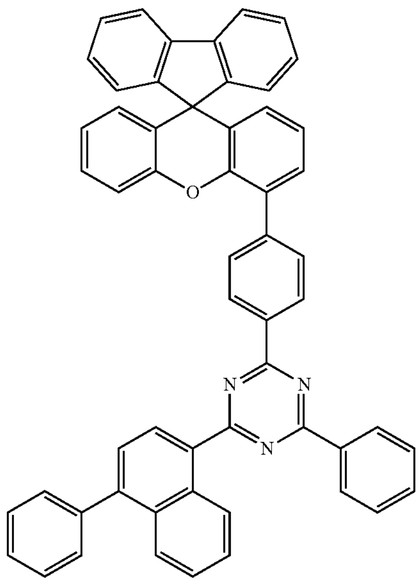
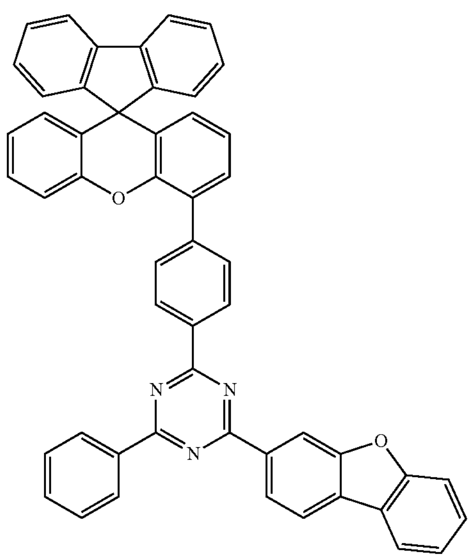
-continued
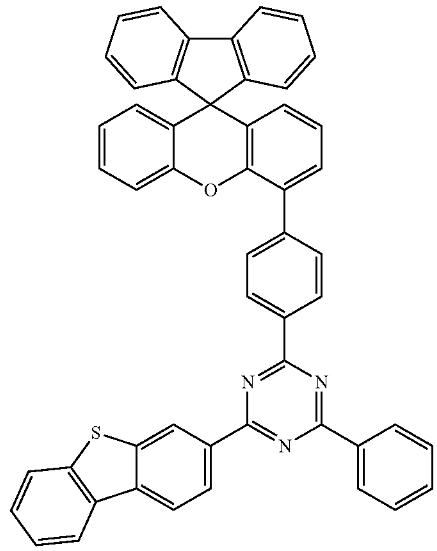
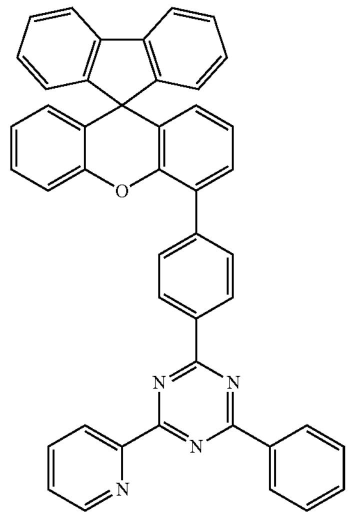
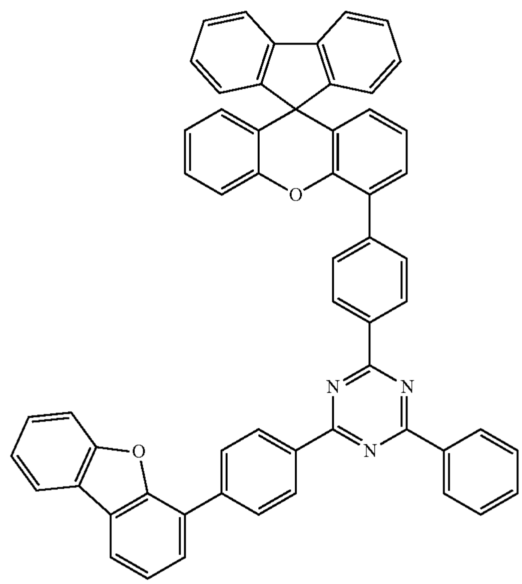

-continued
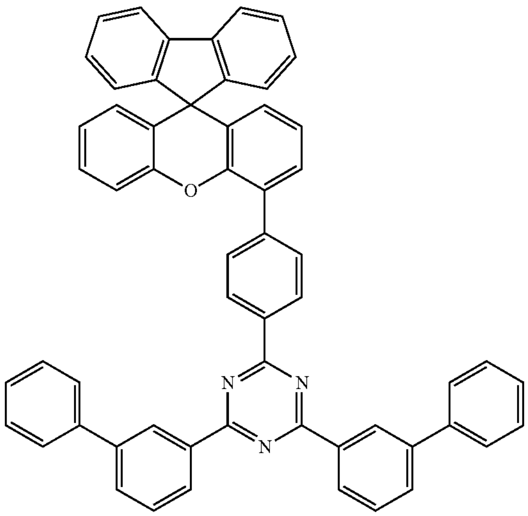
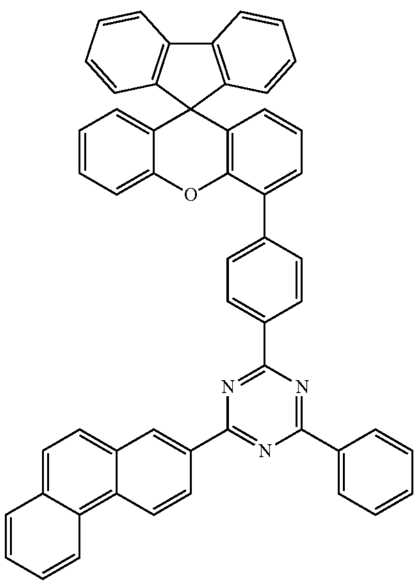
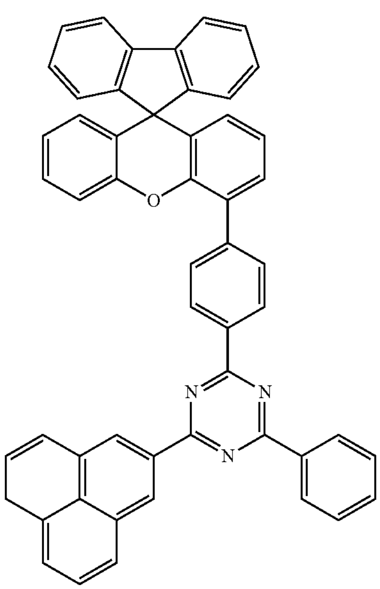
-continued
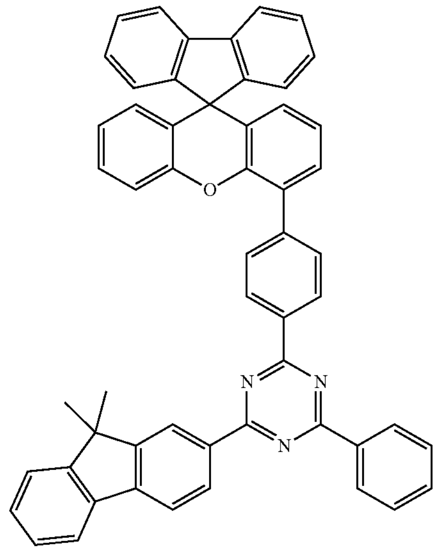
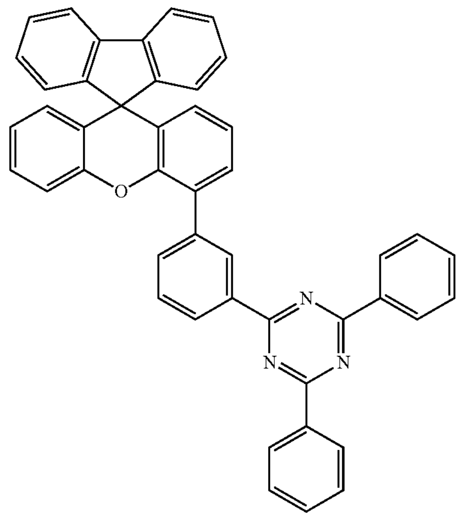
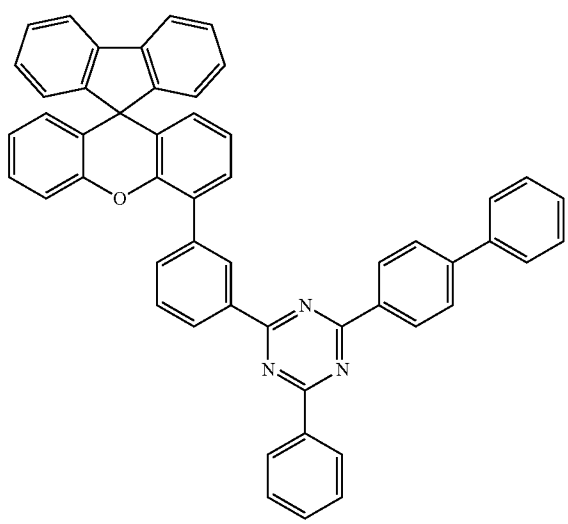

-continued
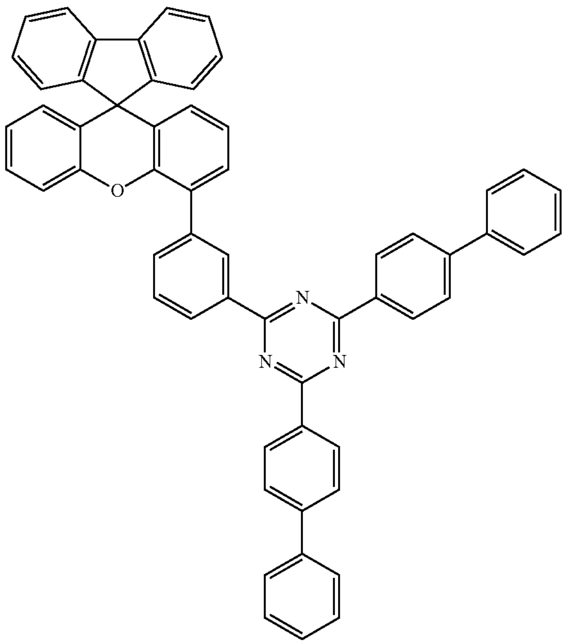
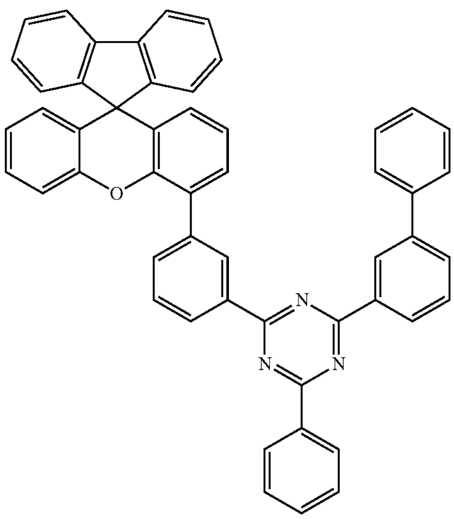
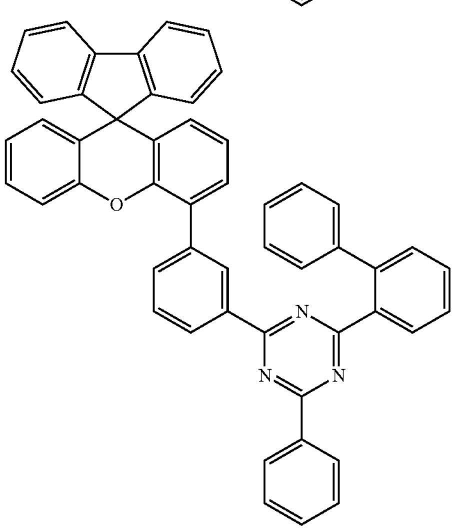
-continued
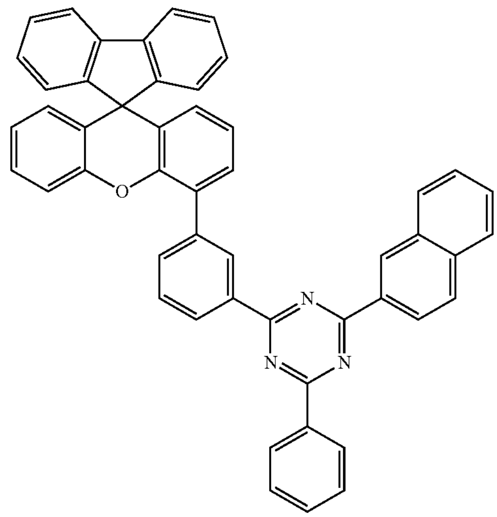
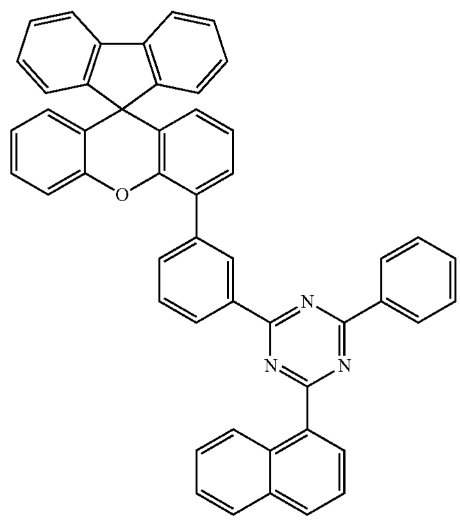
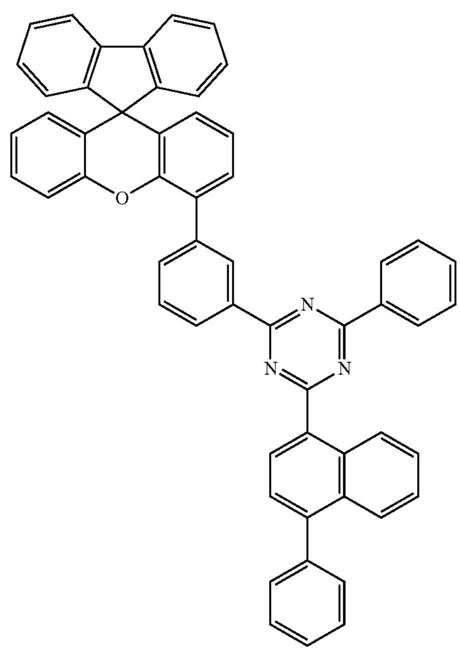

-continued
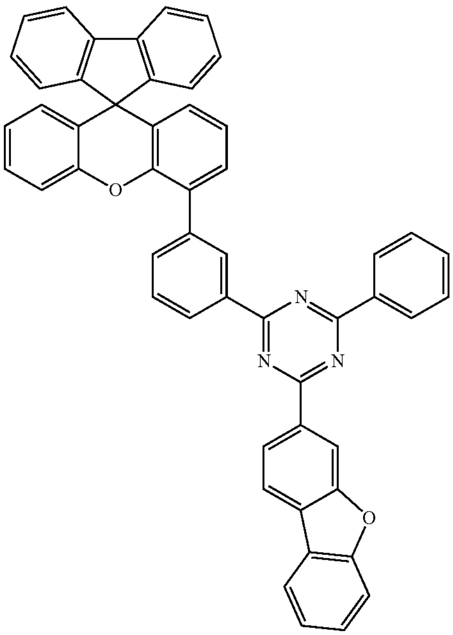
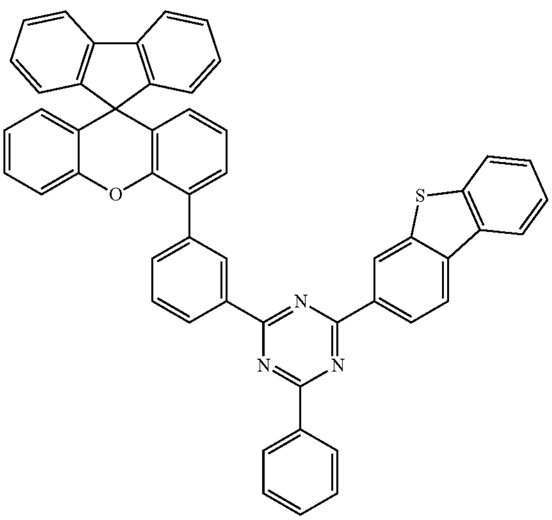
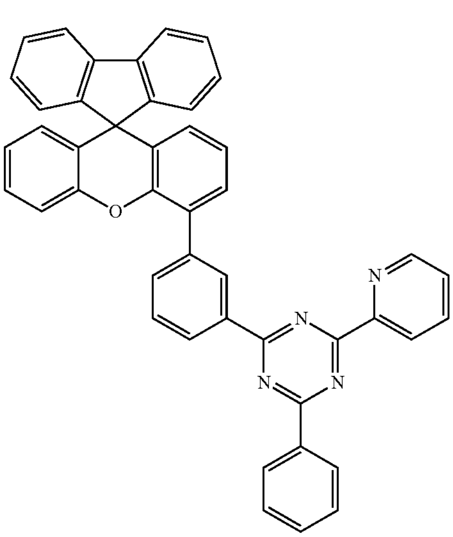
-continued
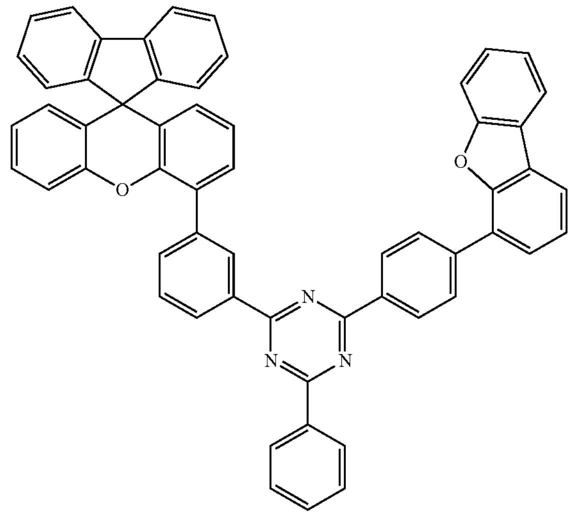
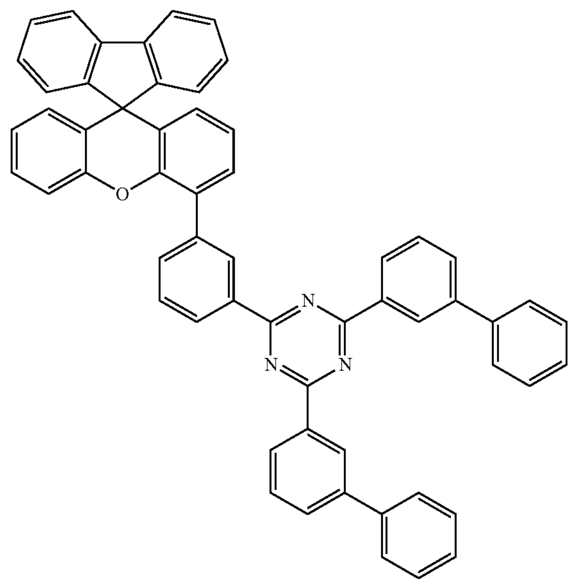
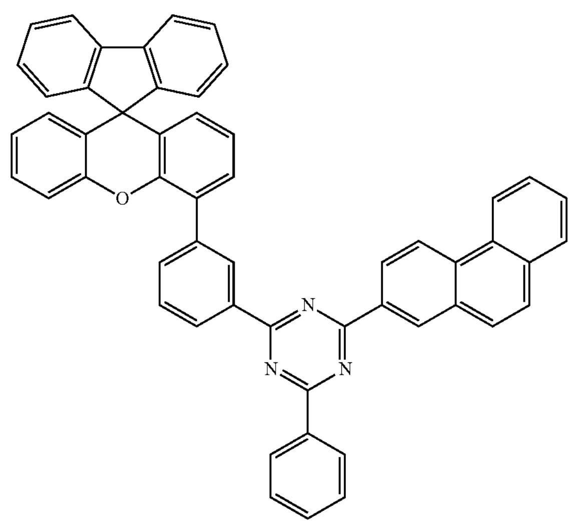

-continued
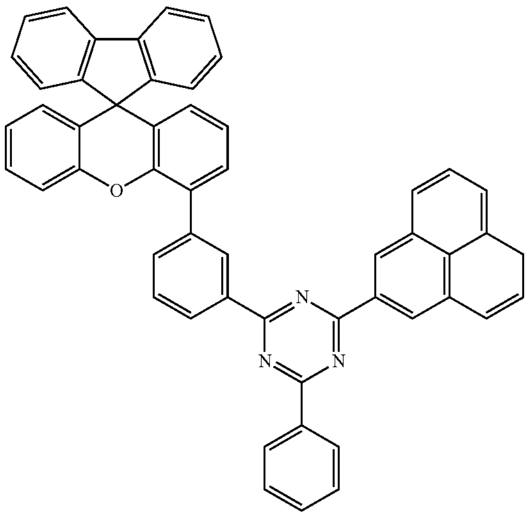
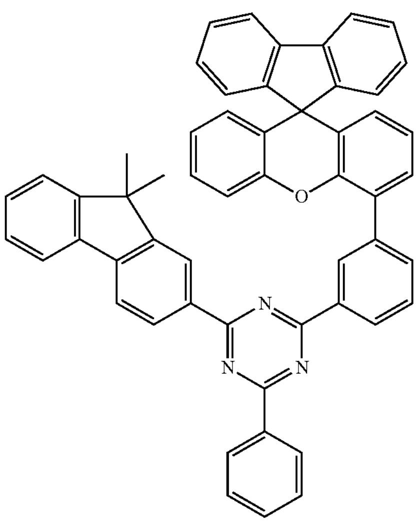
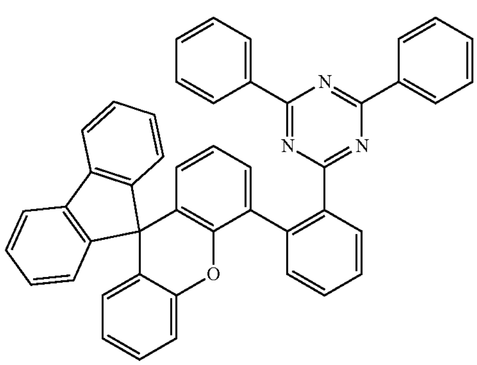
-continued
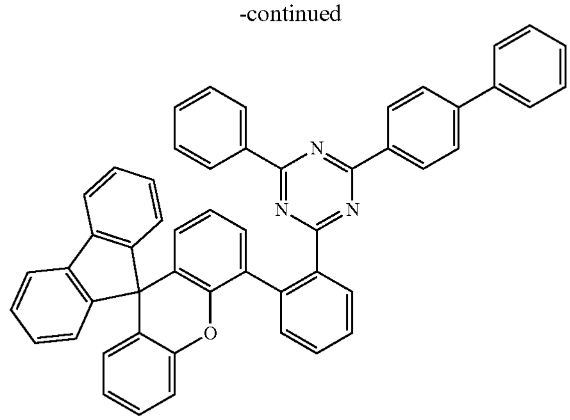
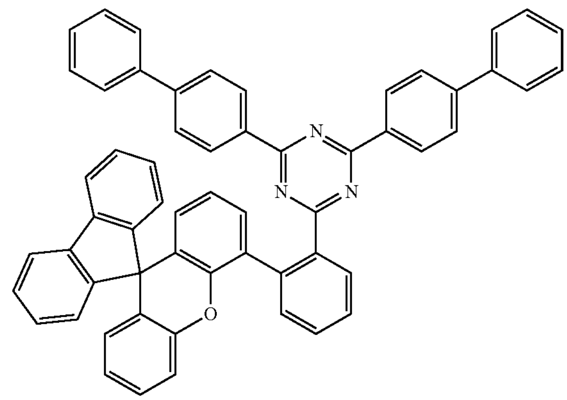
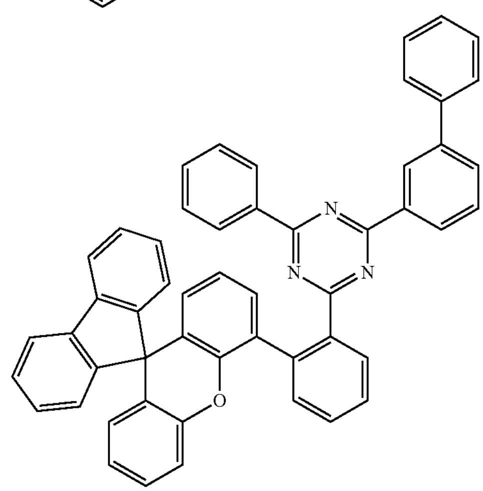
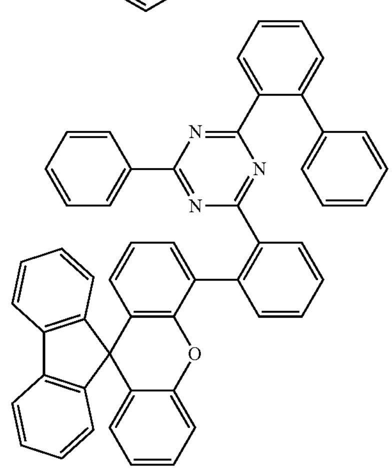

-continued
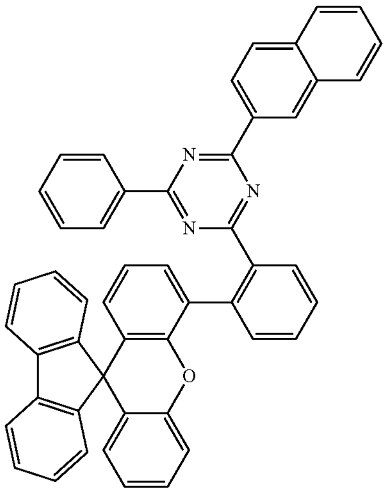
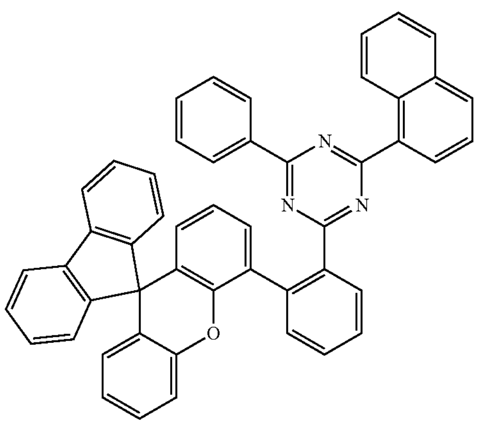
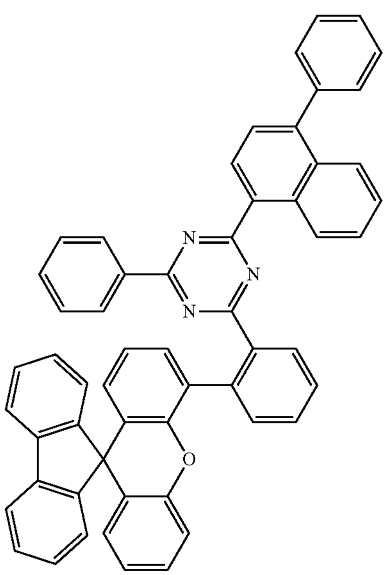
-continued
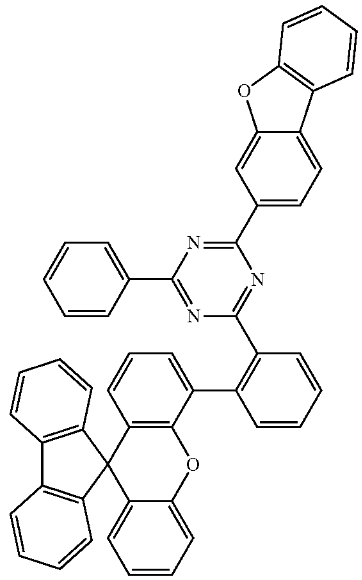
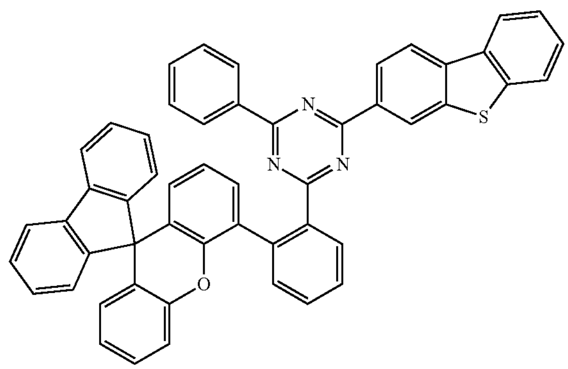
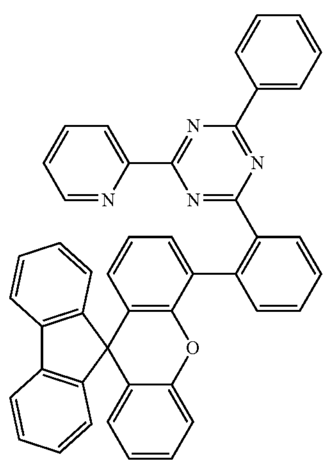

-continued
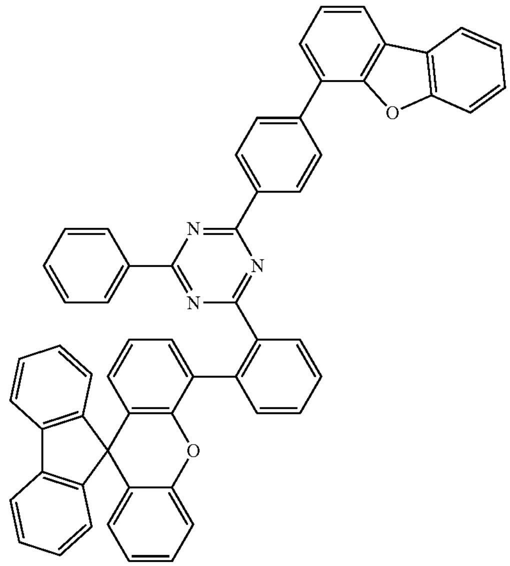
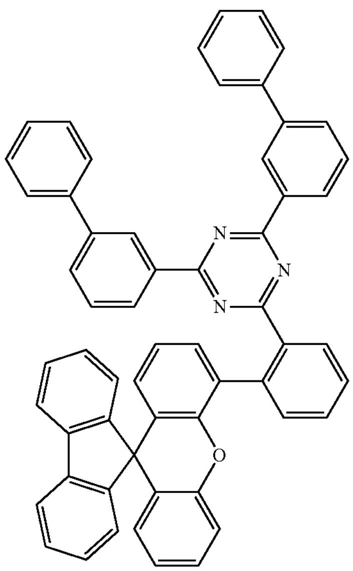
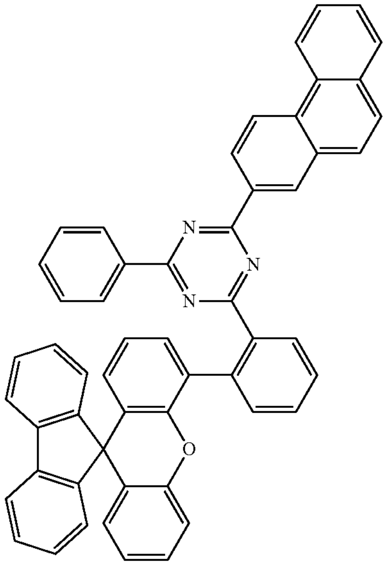
-continued
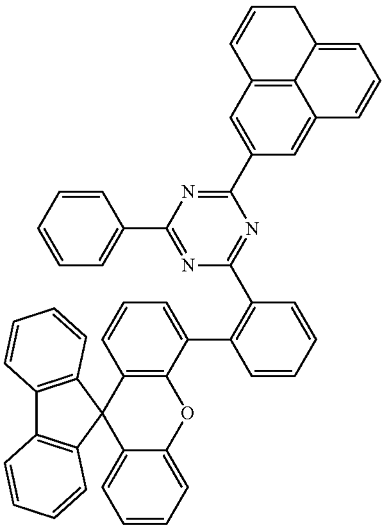
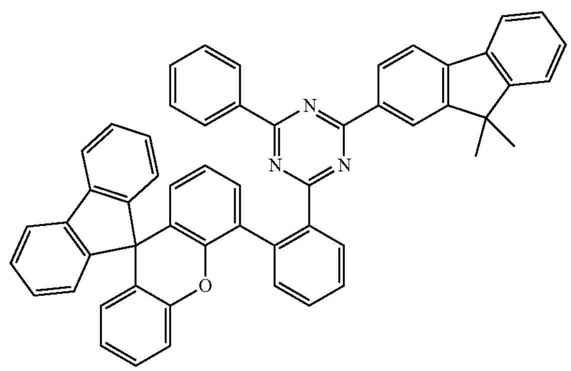
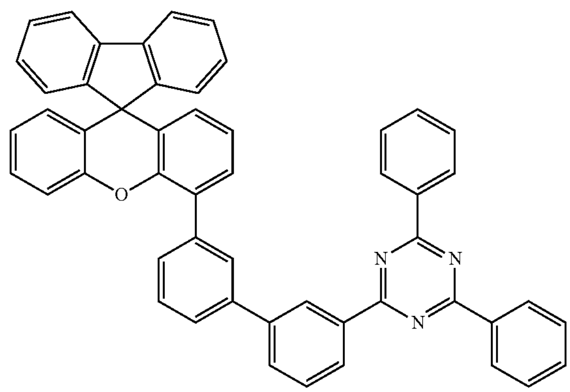

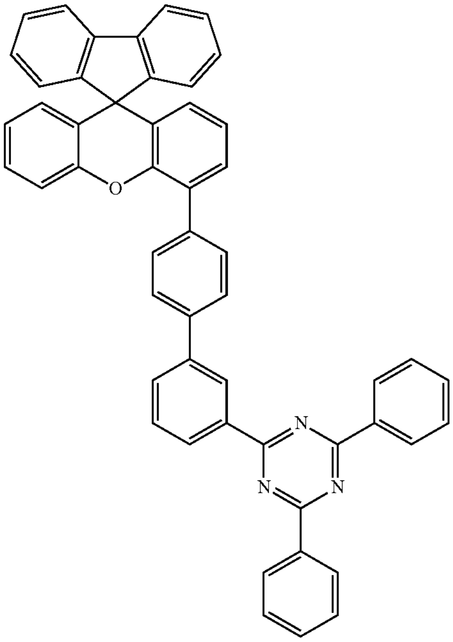
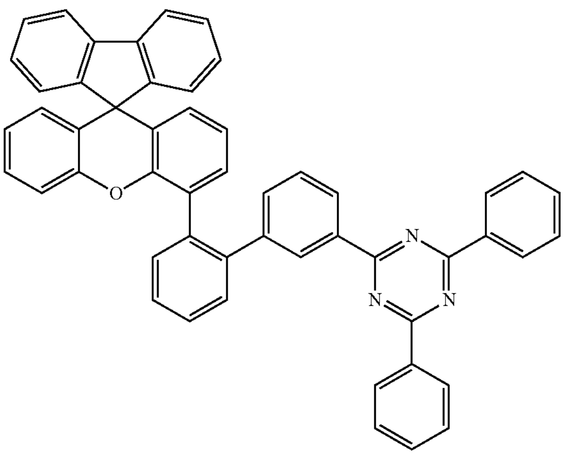
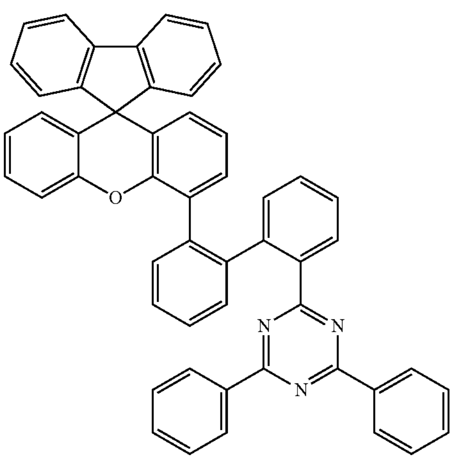
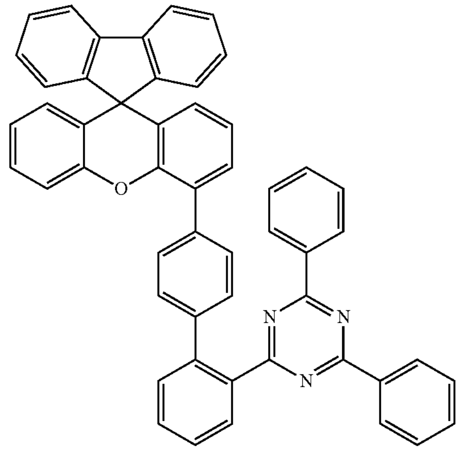
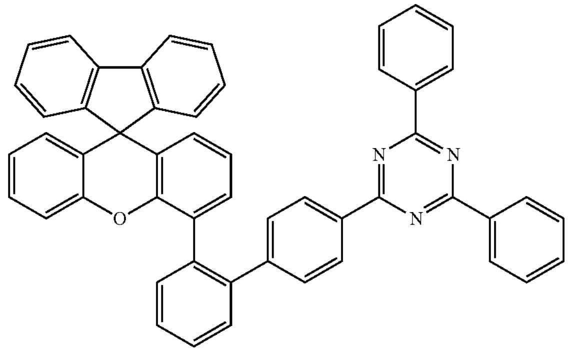
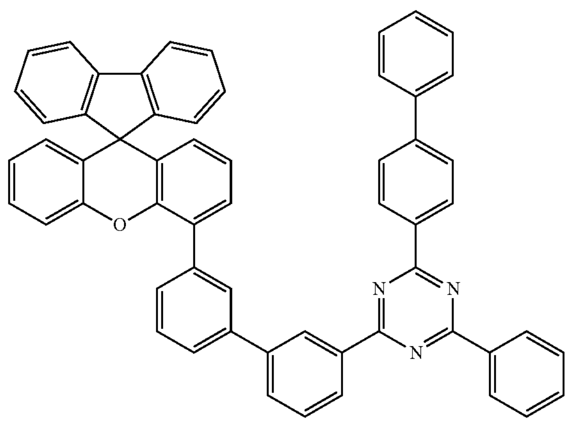
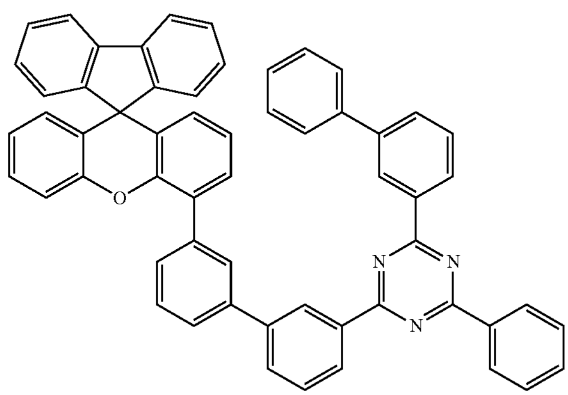

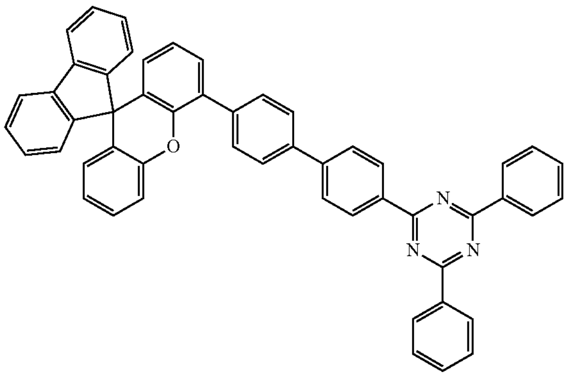
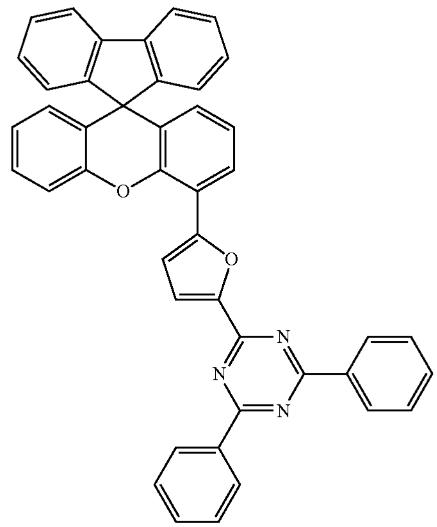
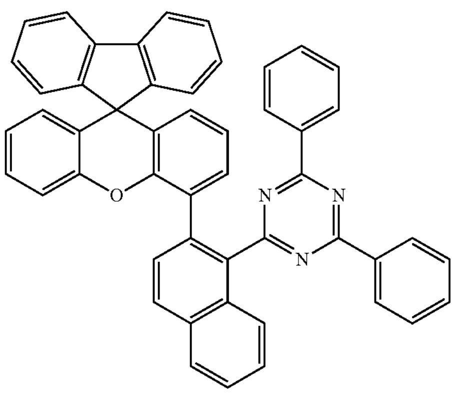
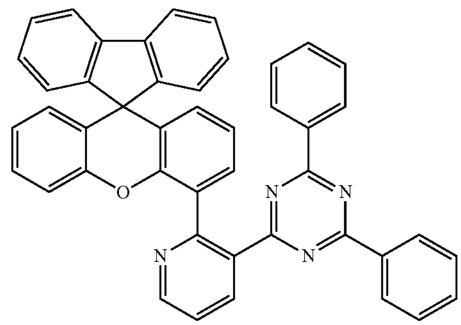
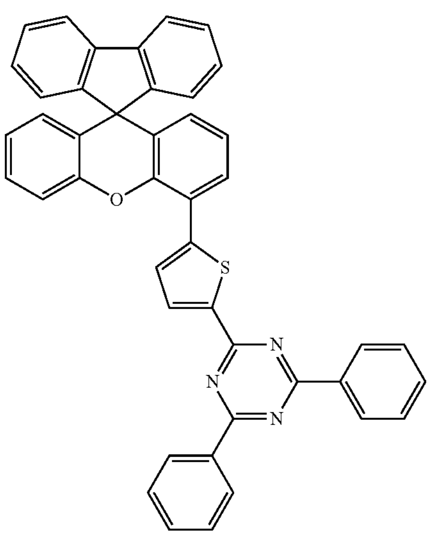
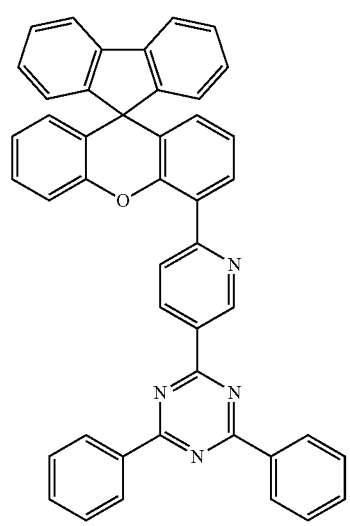

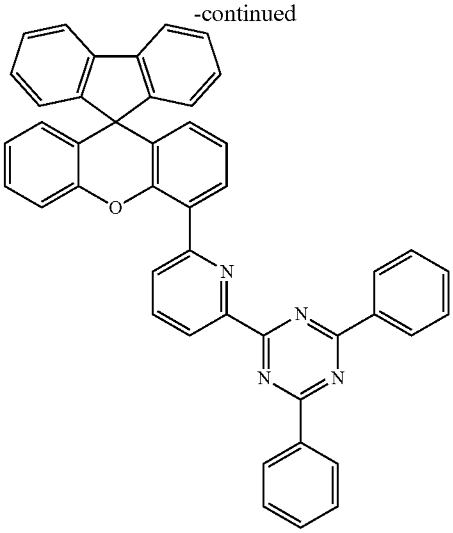
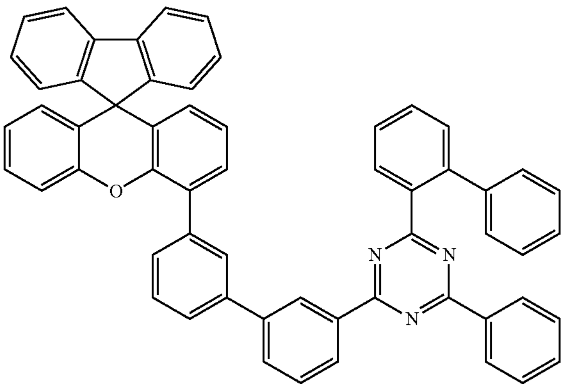
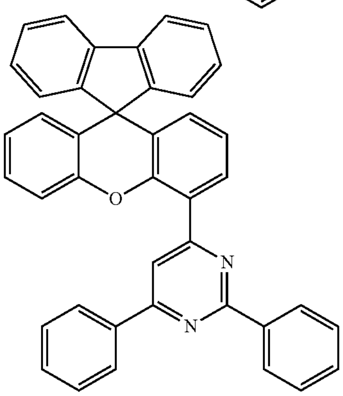
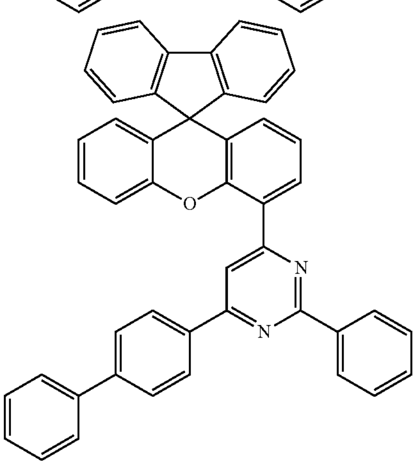
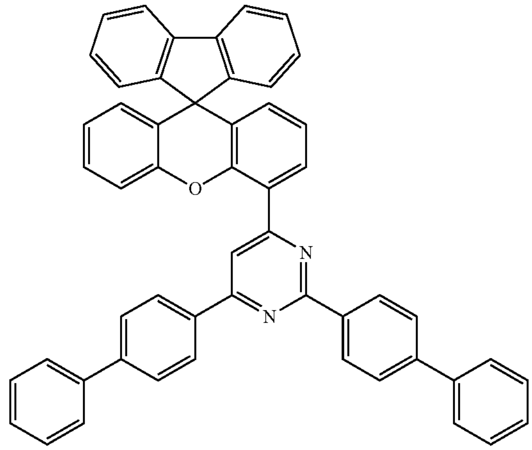
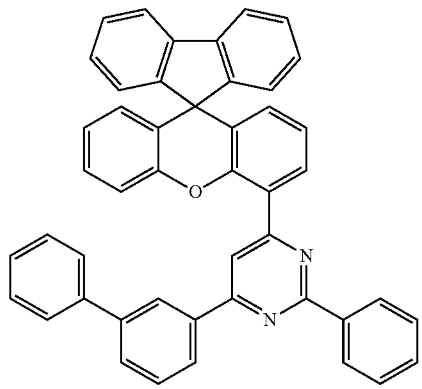
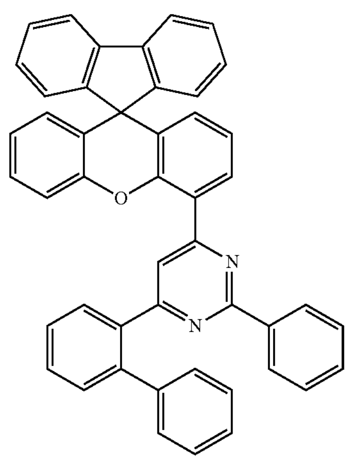
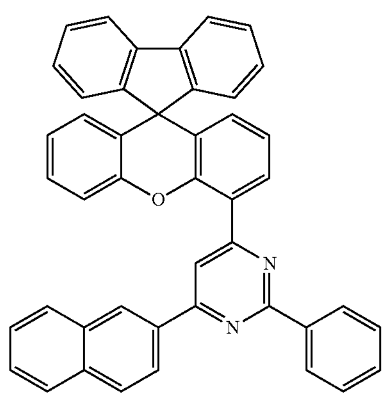

-continued
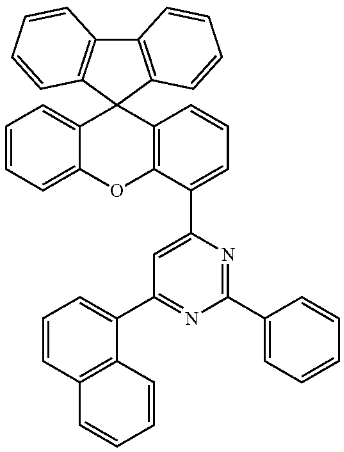
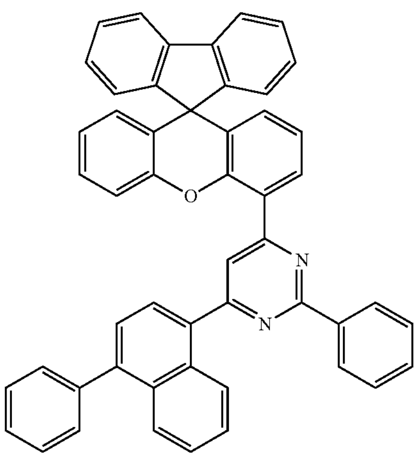
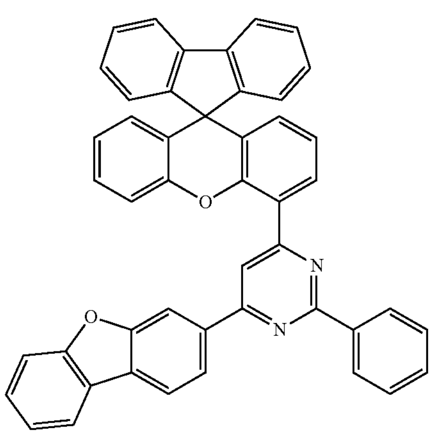
-continued
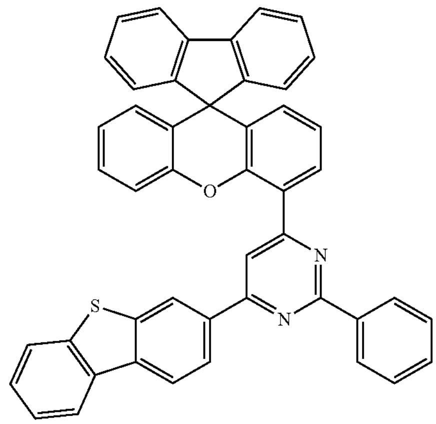
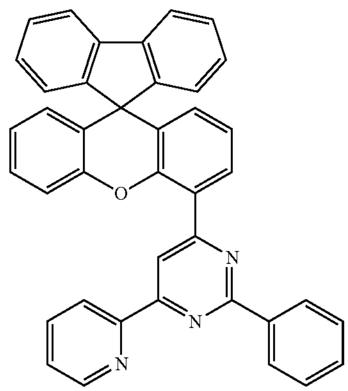
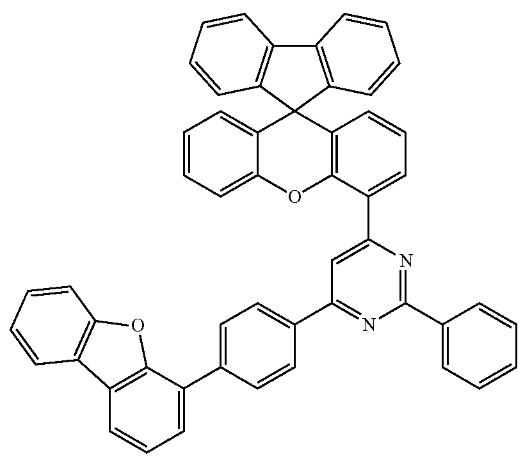
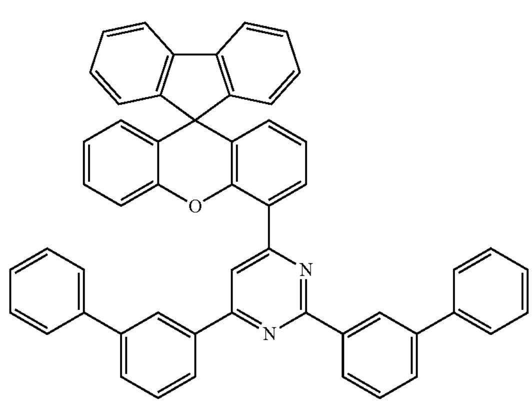

-continued
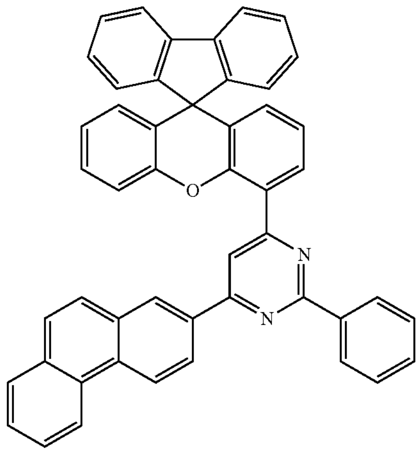
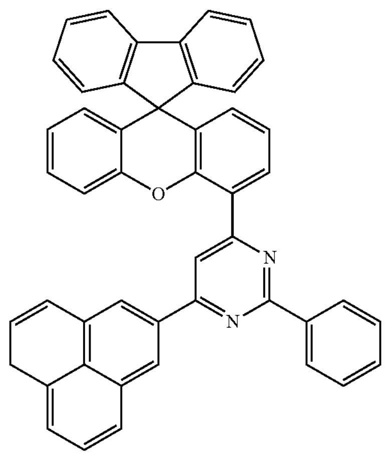
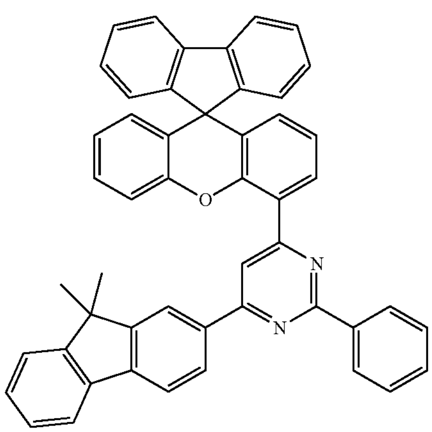
-continued
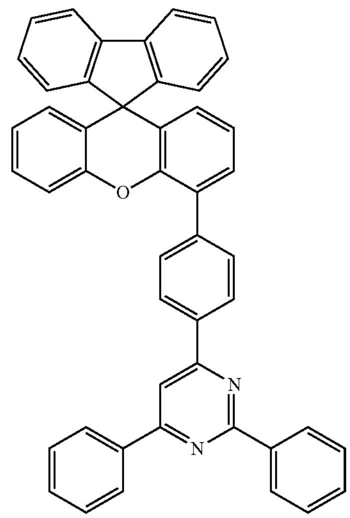
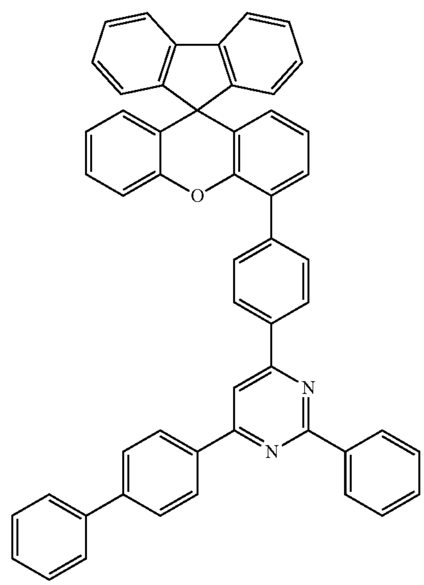
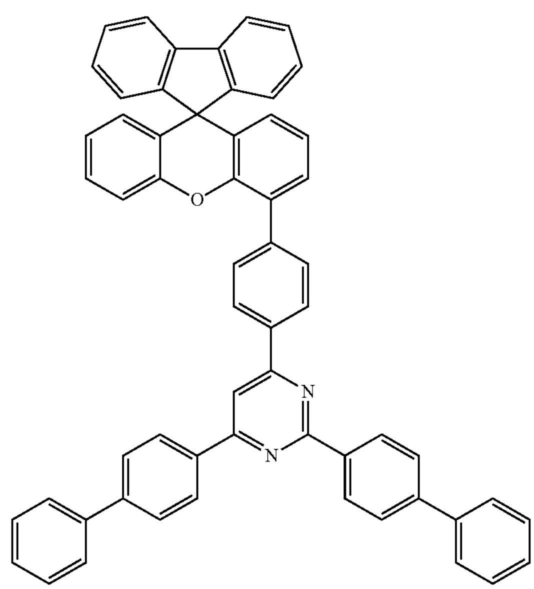

-continued
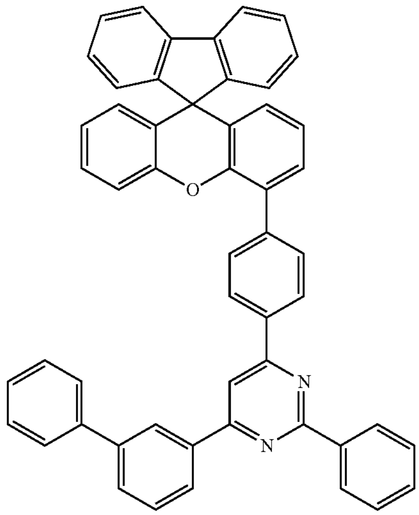
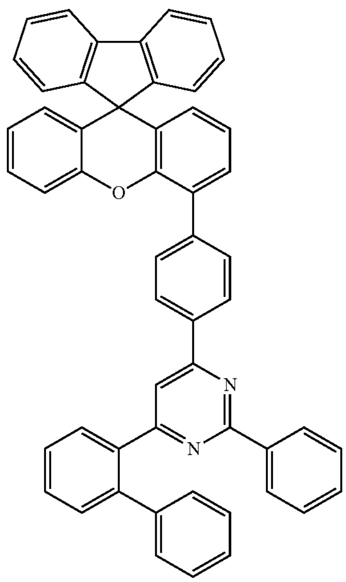
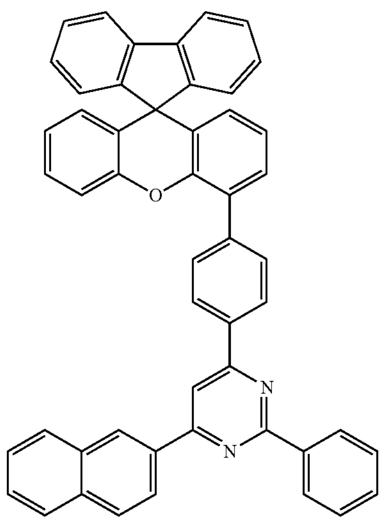
-continued
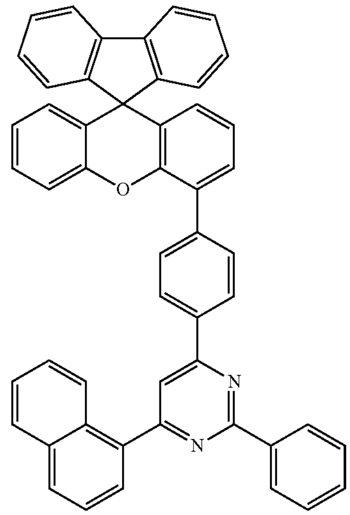
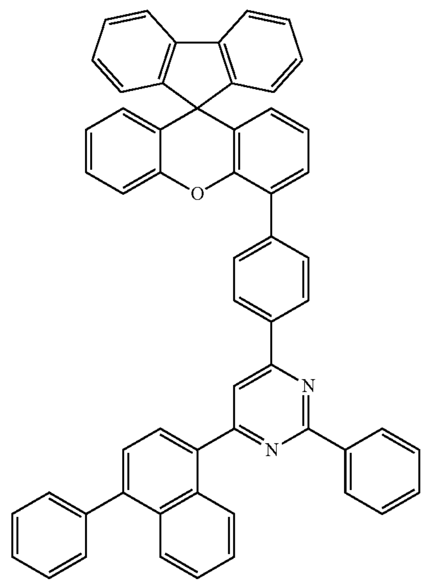
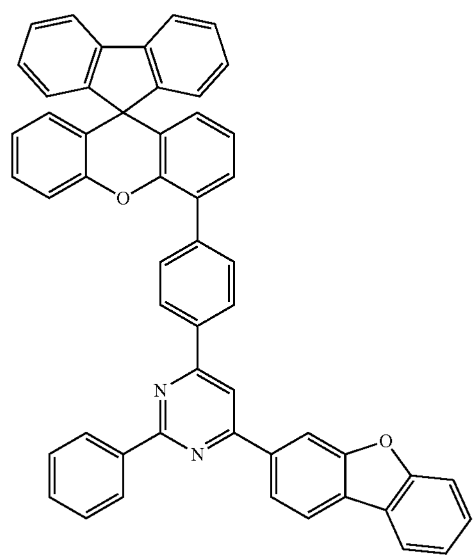

-continued
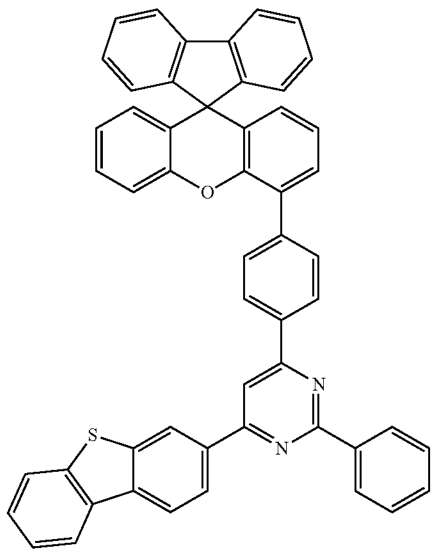
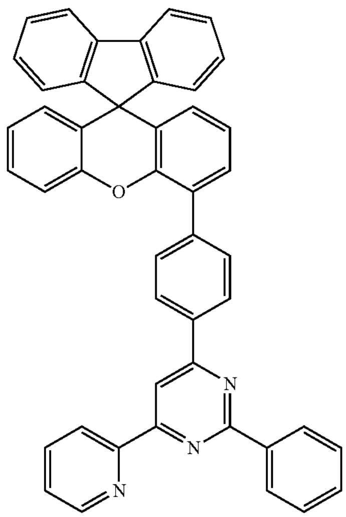
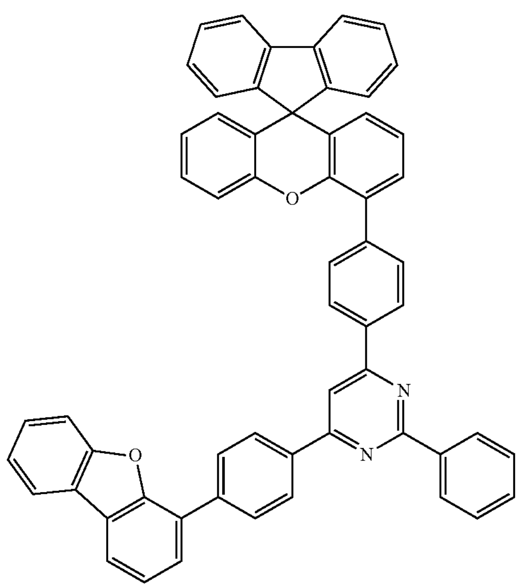
-continued
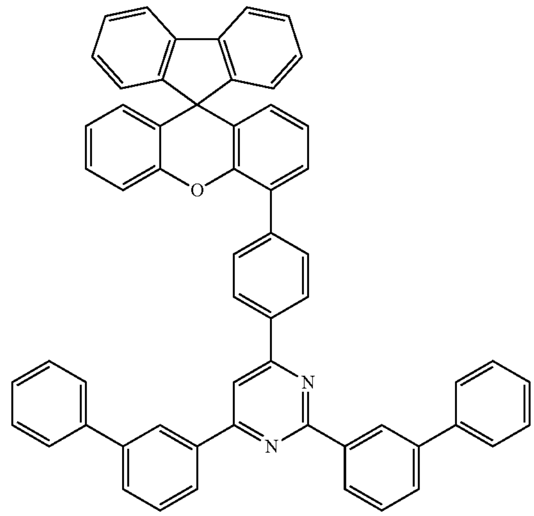
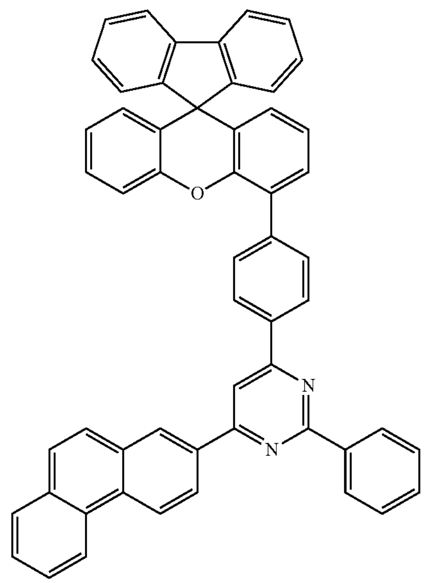
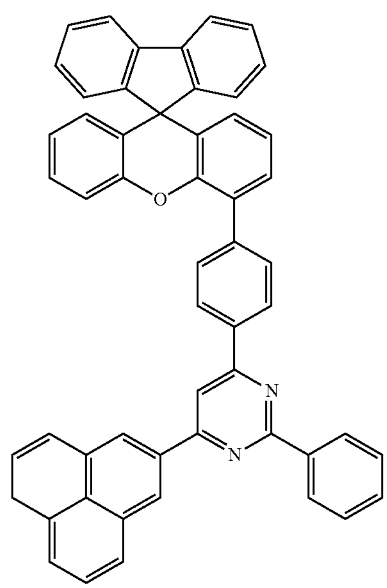

-continued
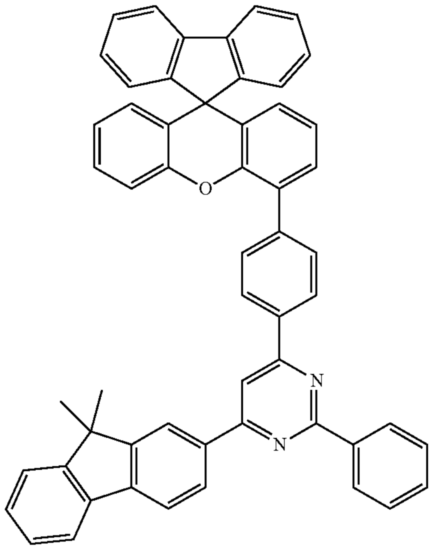
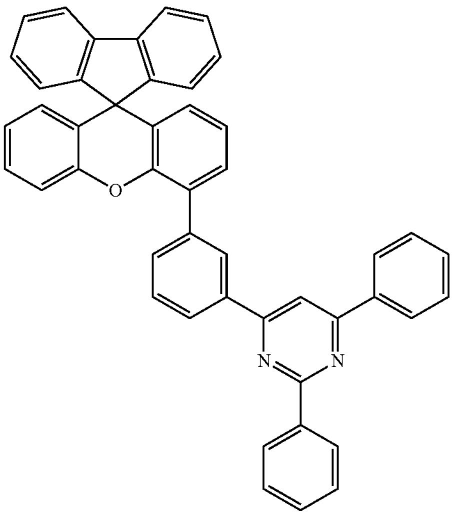
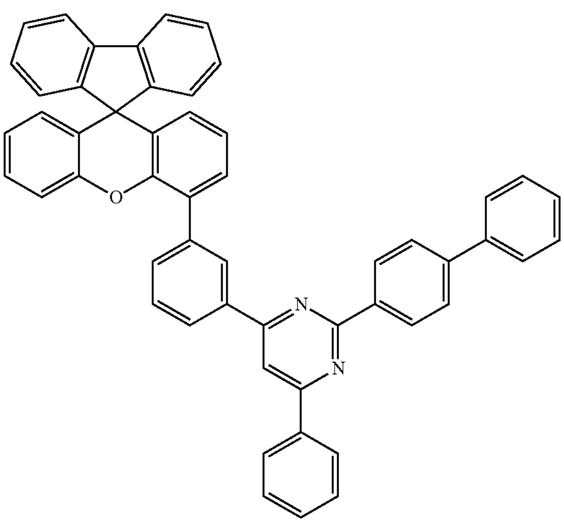
-continued
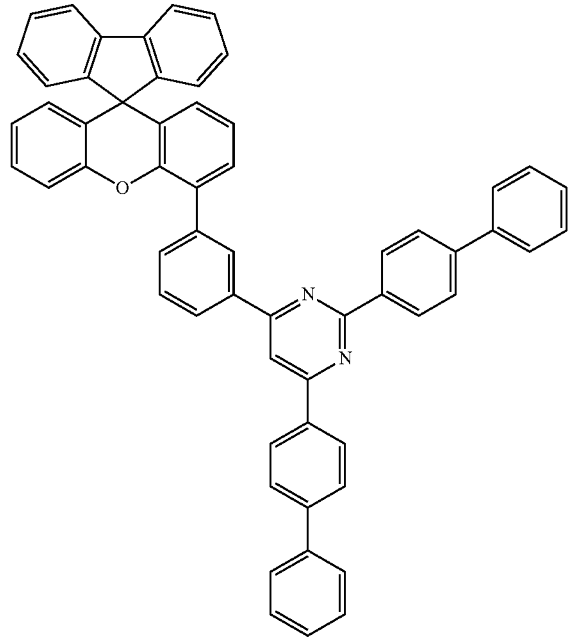
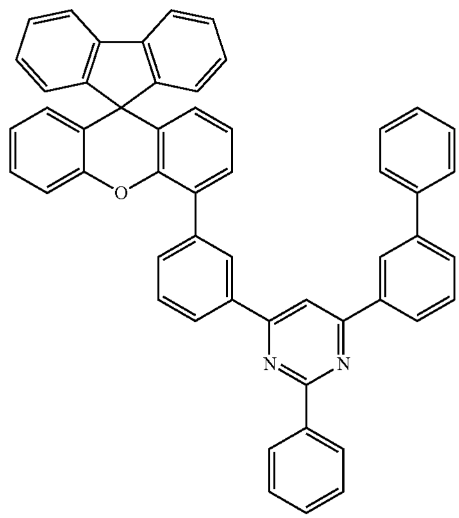
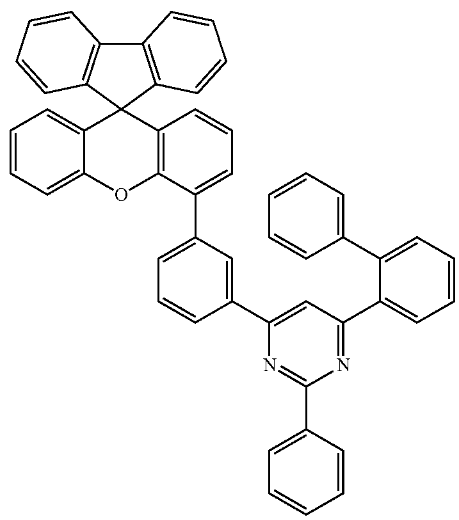

-continued
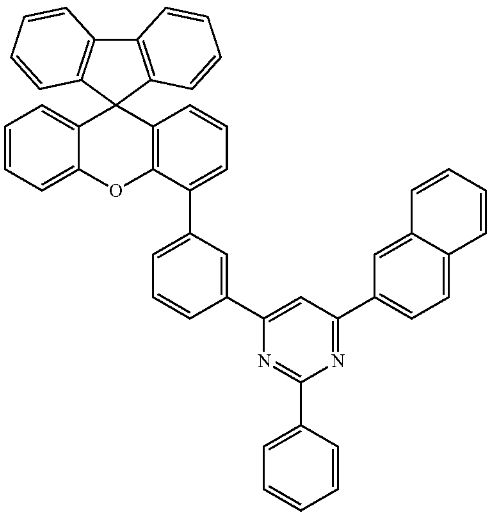
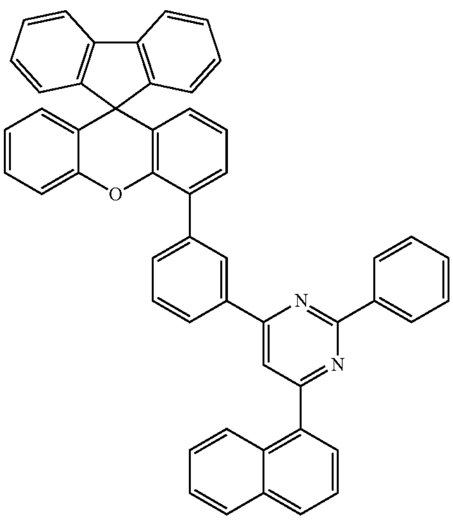
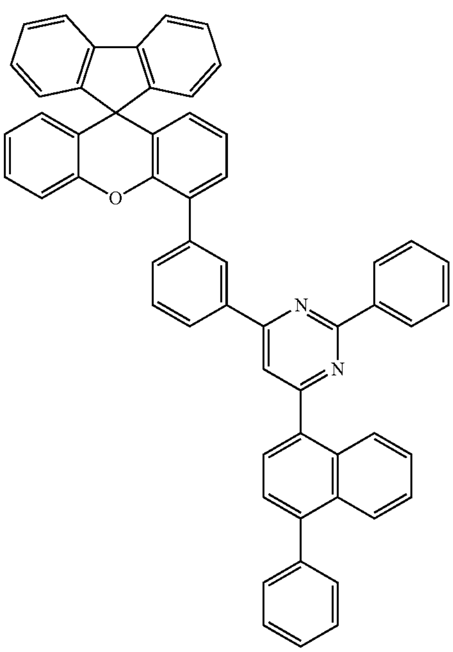
-continued
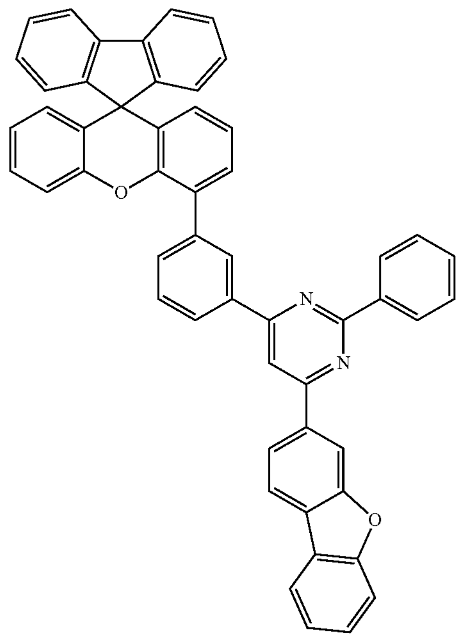
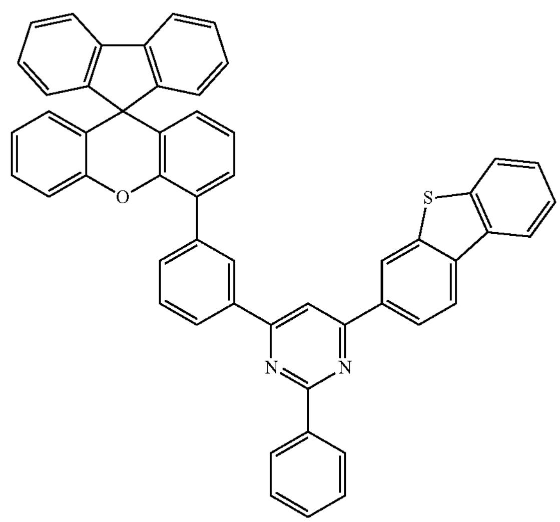
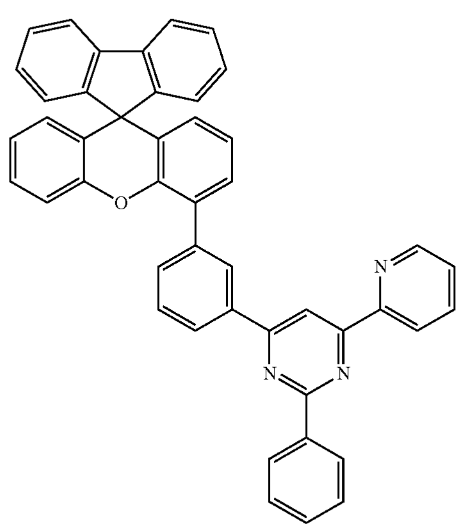

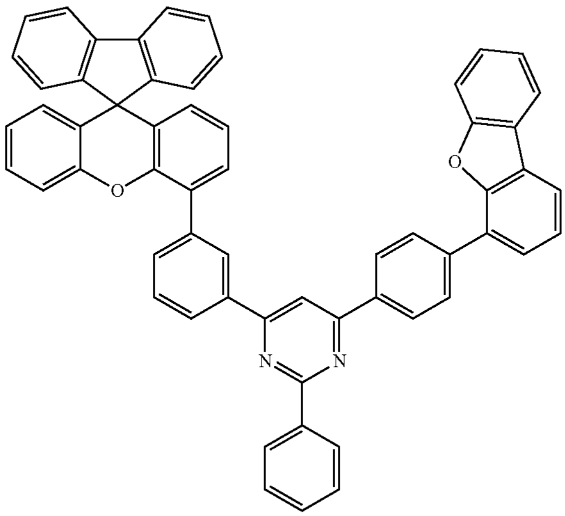
O
O
N
N
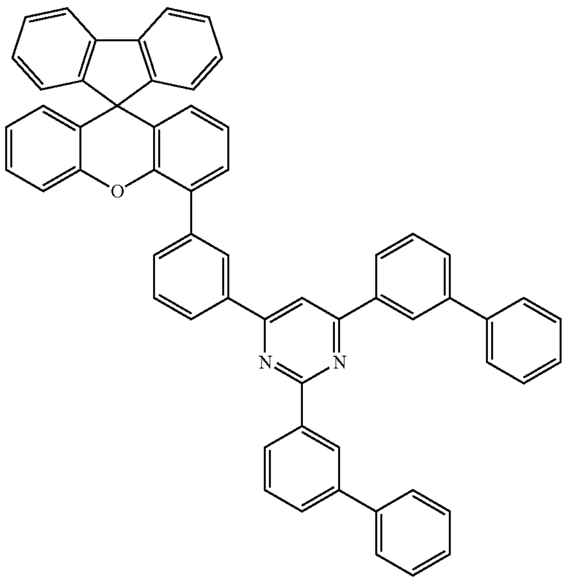
O
N
N
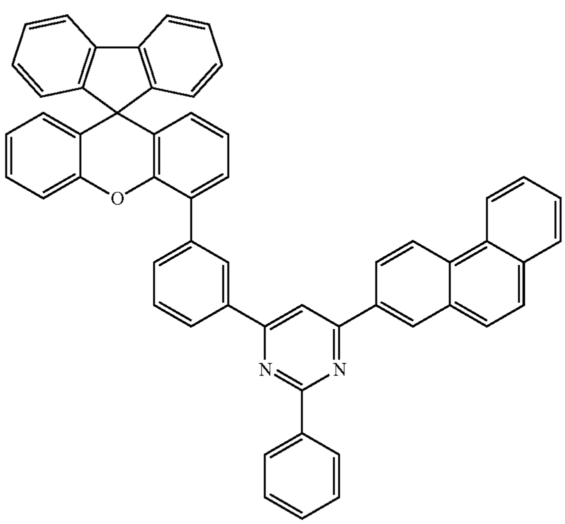
O
N
N
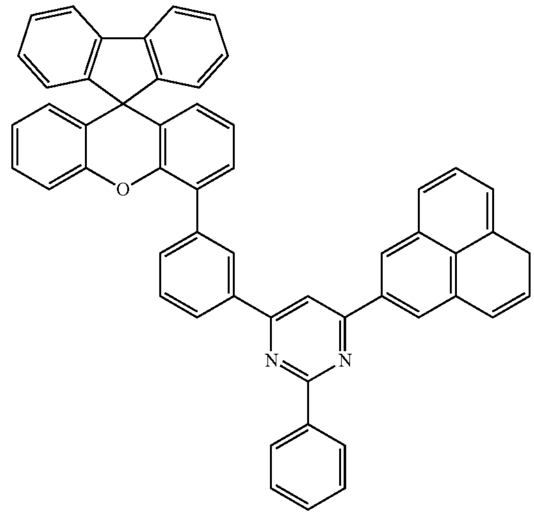
O
N
N
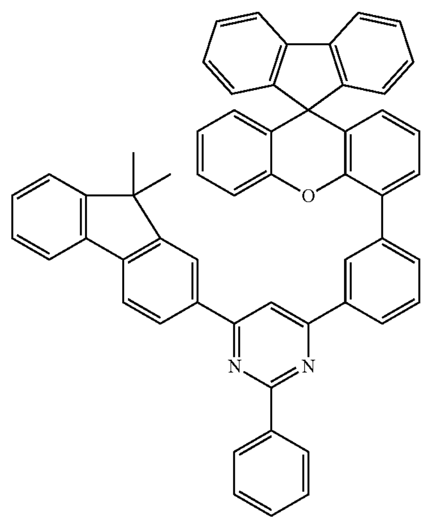
O
N
N
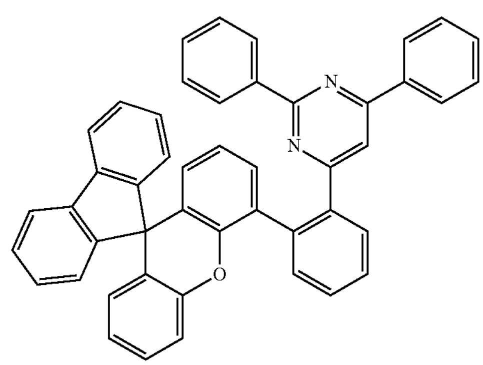
N
N
O -continued
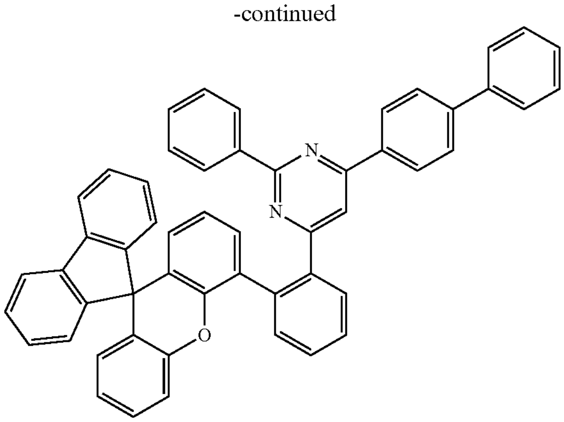
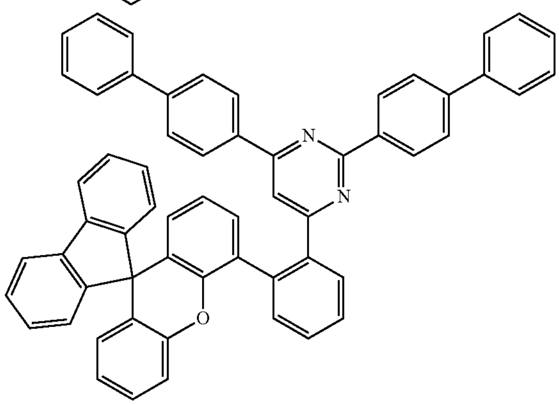
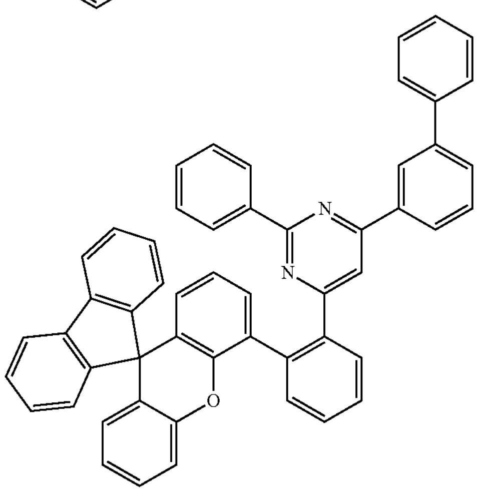
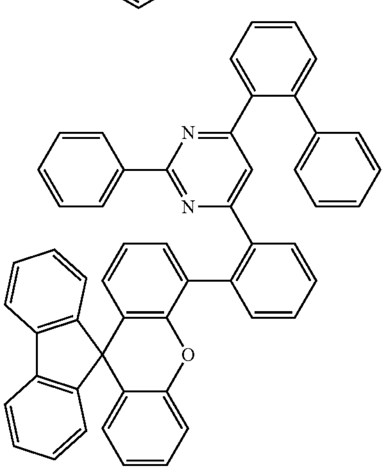
-continued
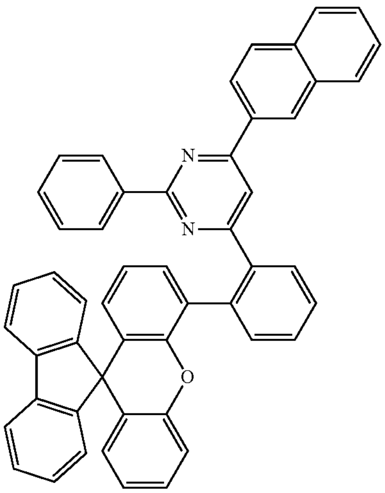
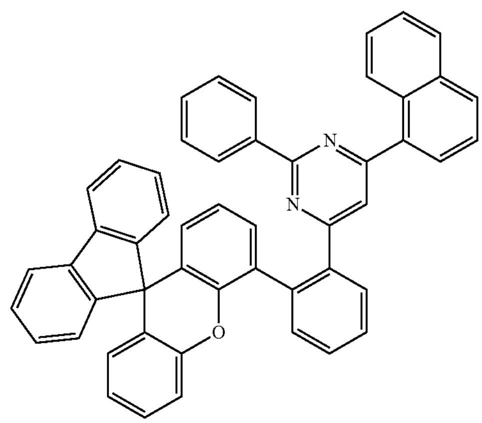
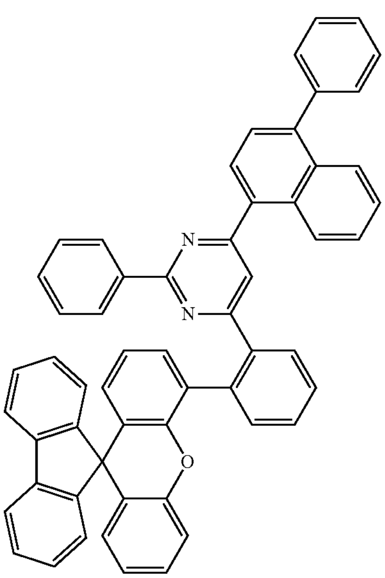

-continued
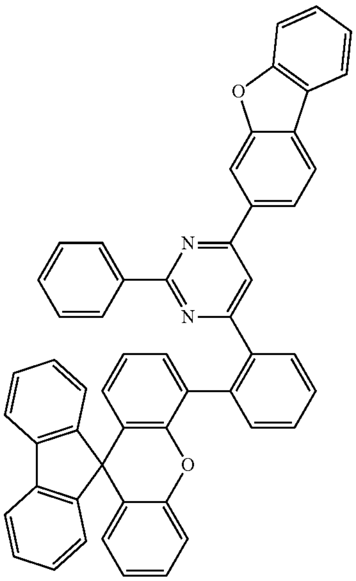
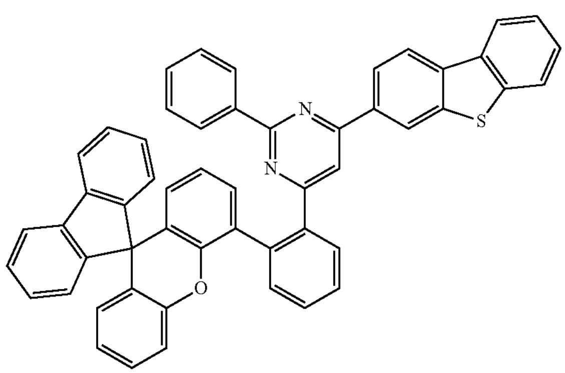
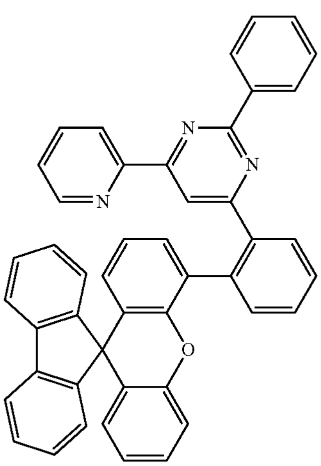
-continued
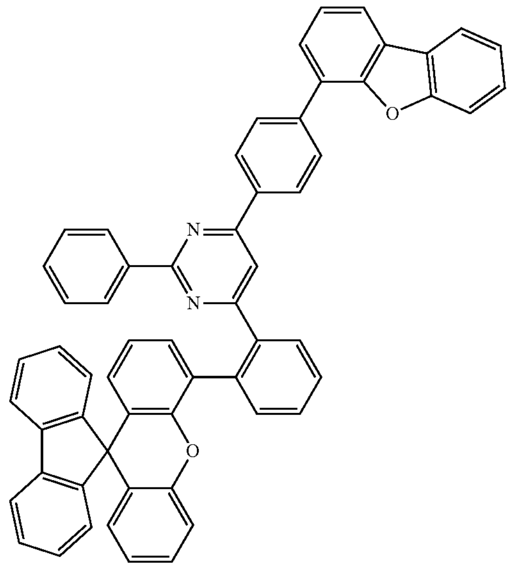
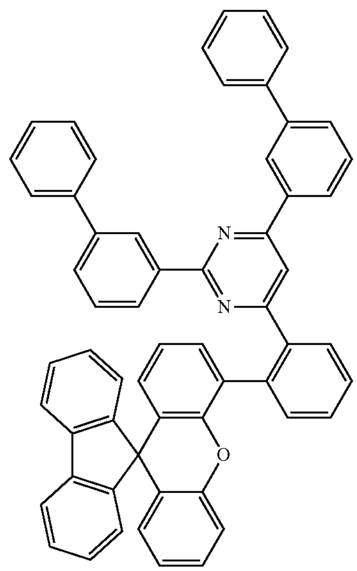
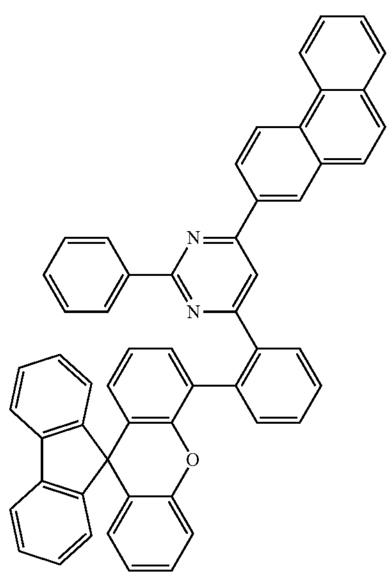

-continued
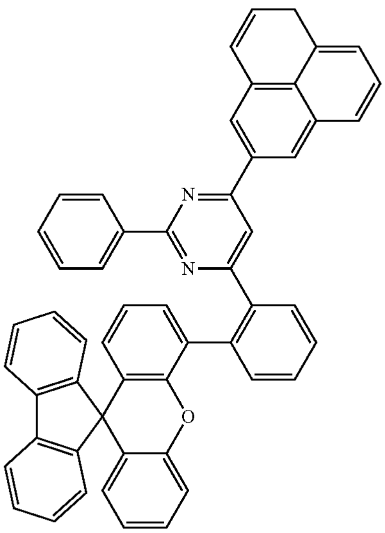
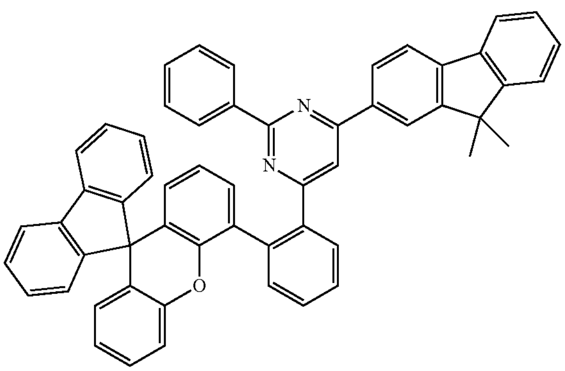
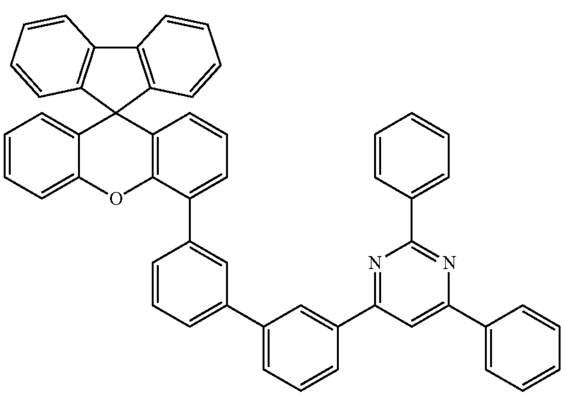
-continued
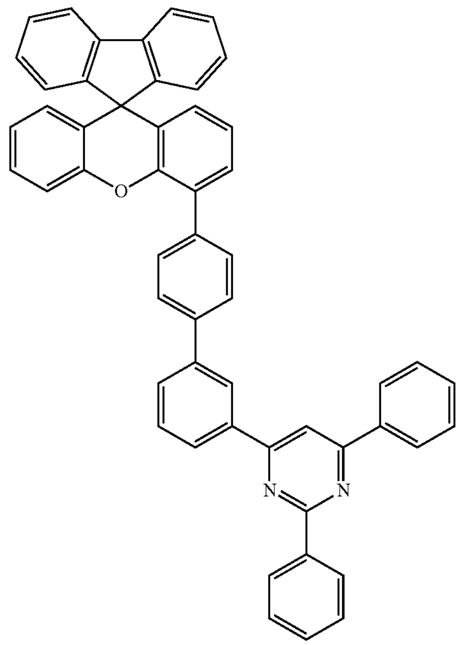
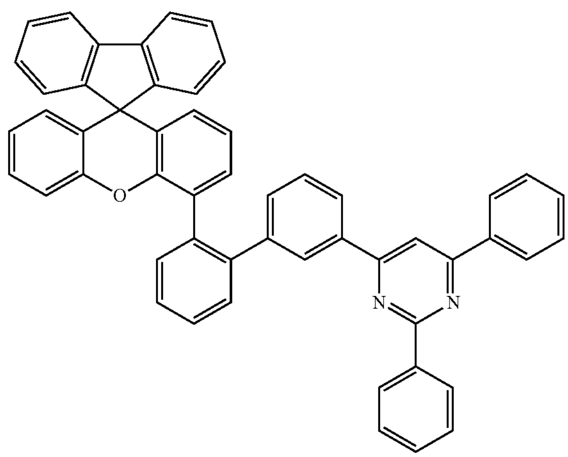
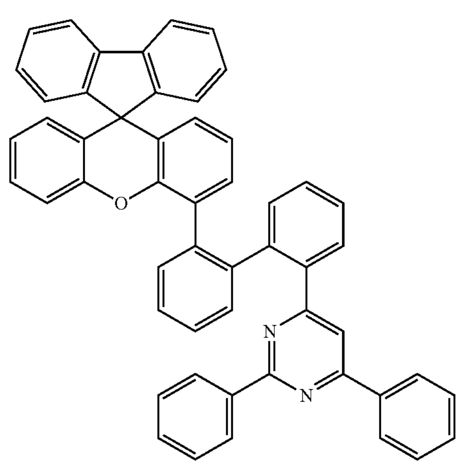

-continued
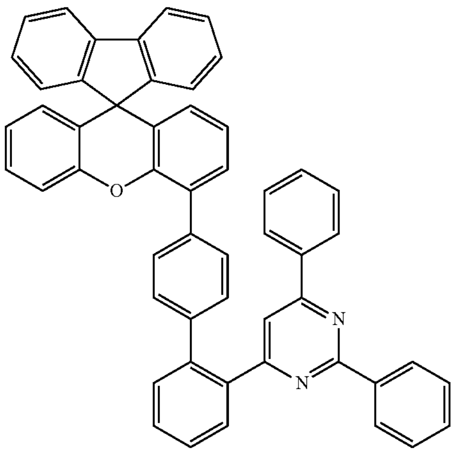
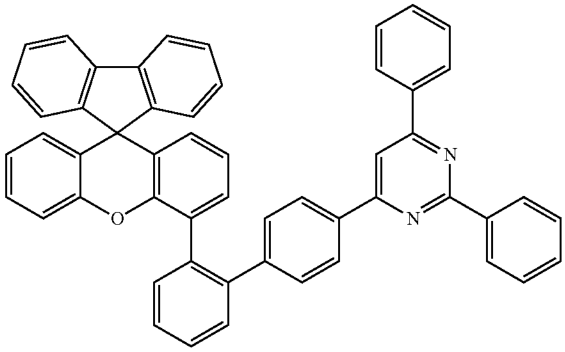
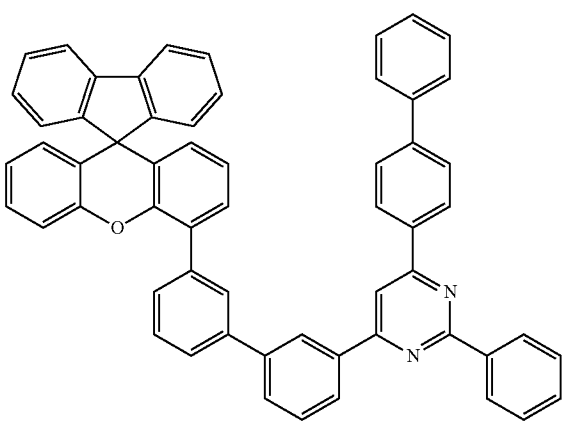
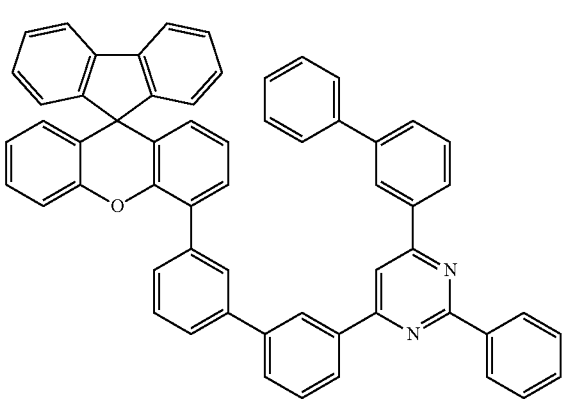
-continued
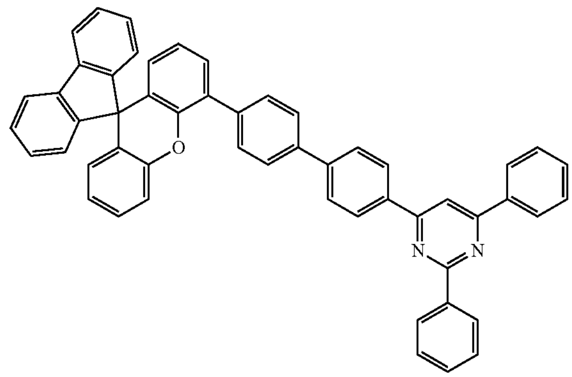
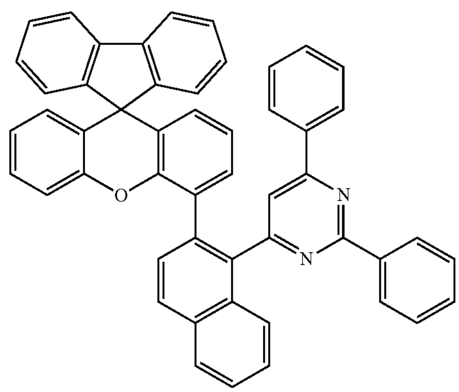
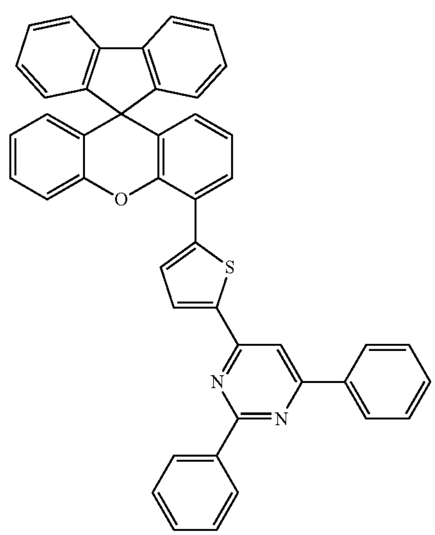

-continued
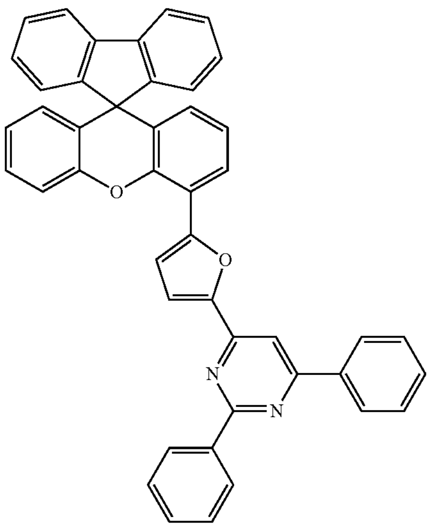
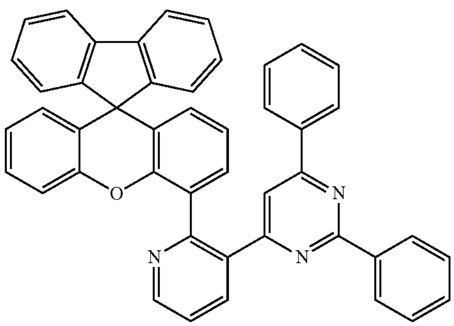
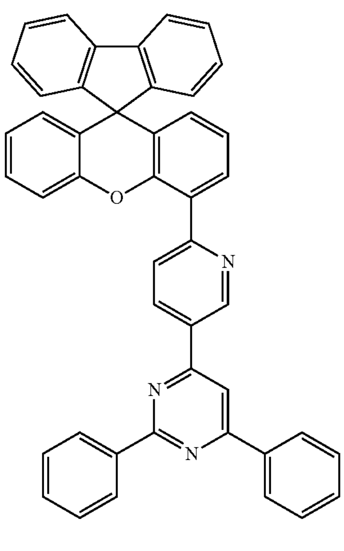
-continued
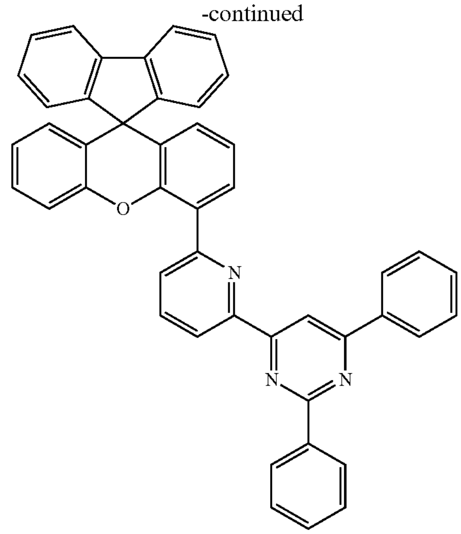
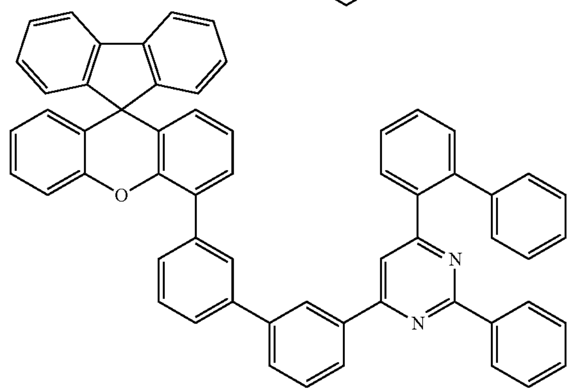
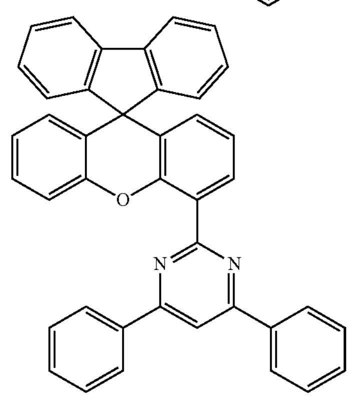
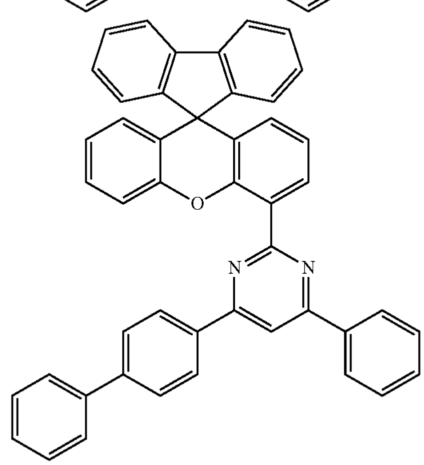

-continued
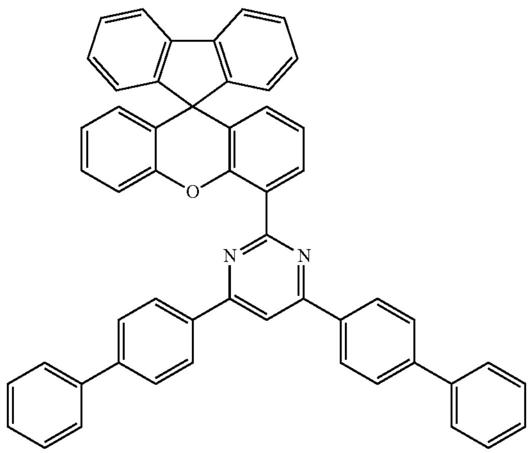
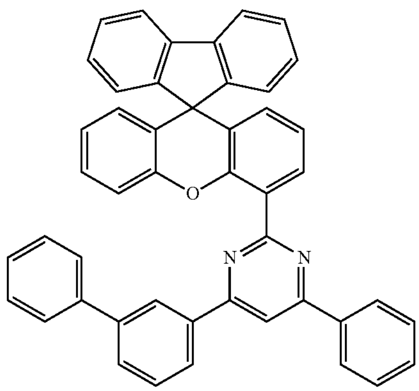
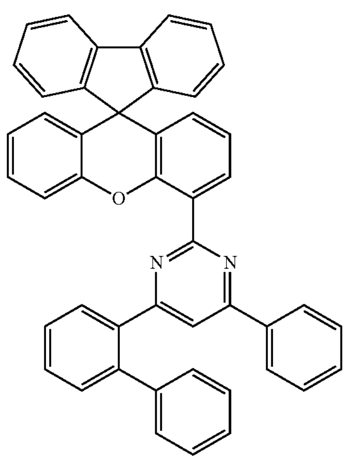
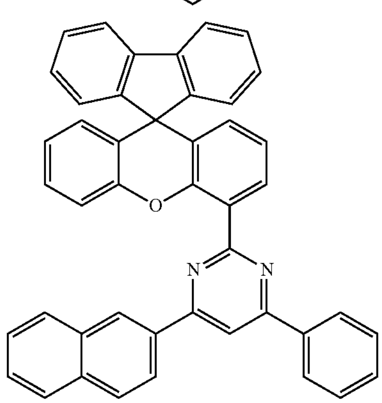
-continued
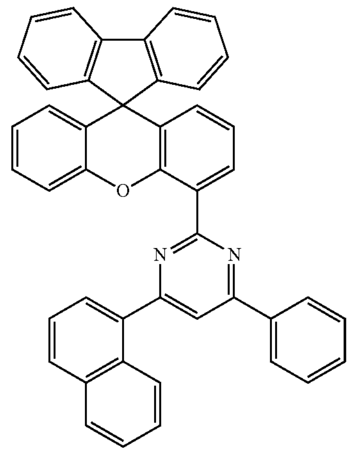
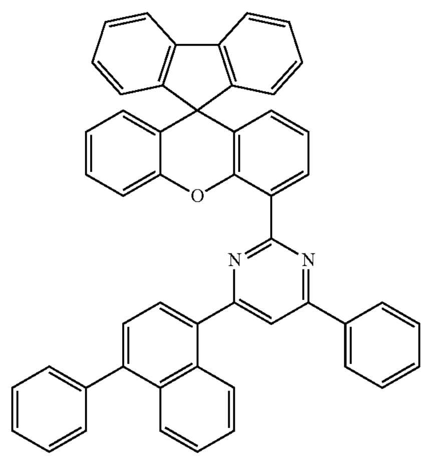
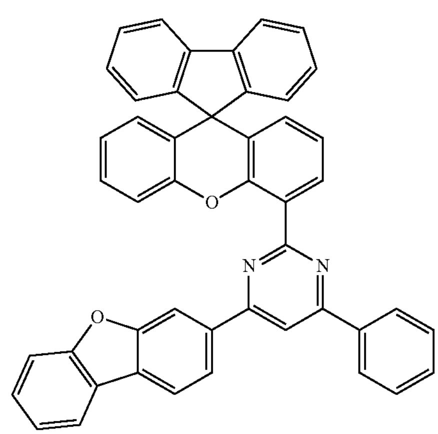

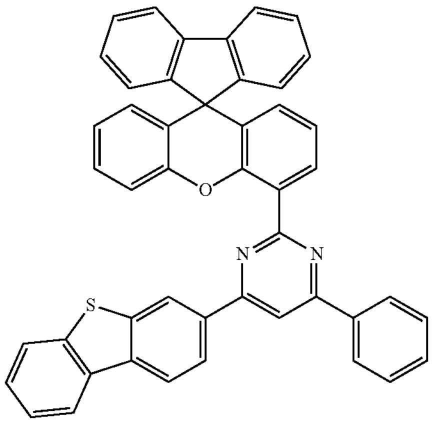
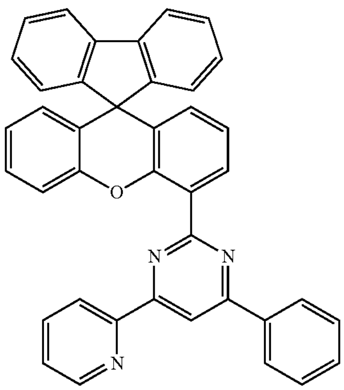
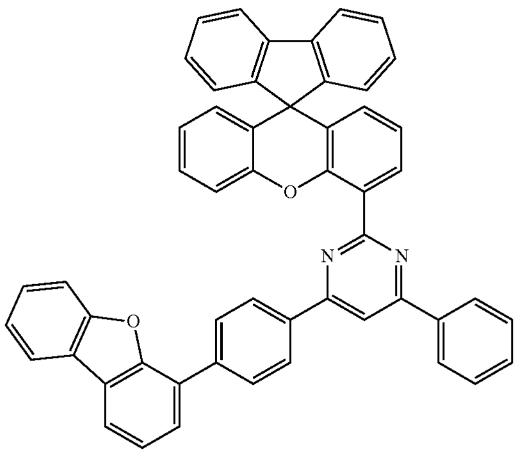
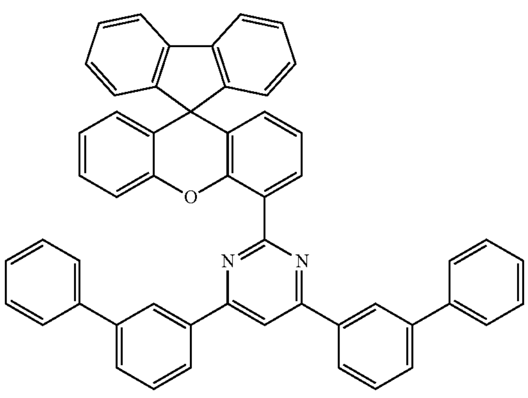
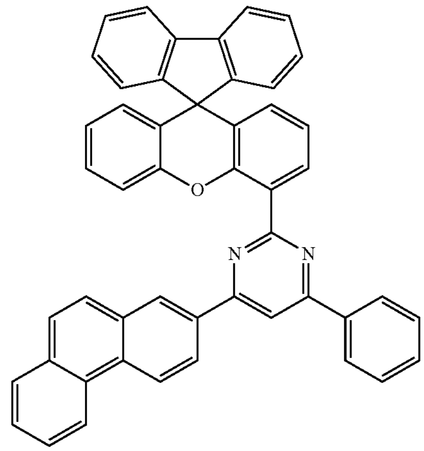
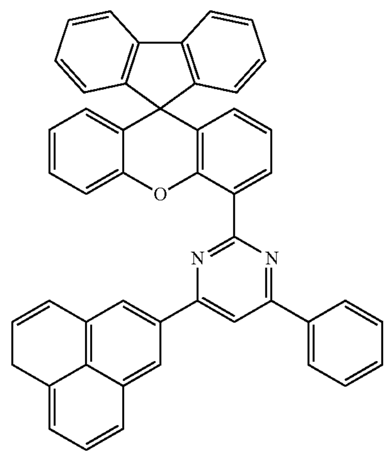
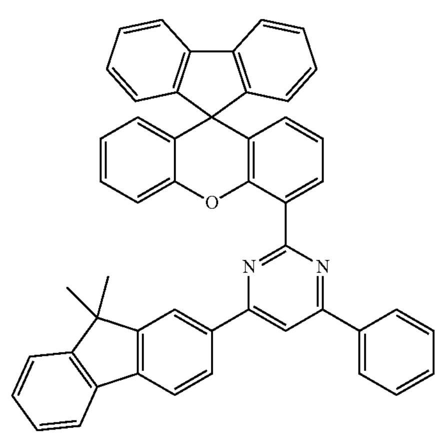

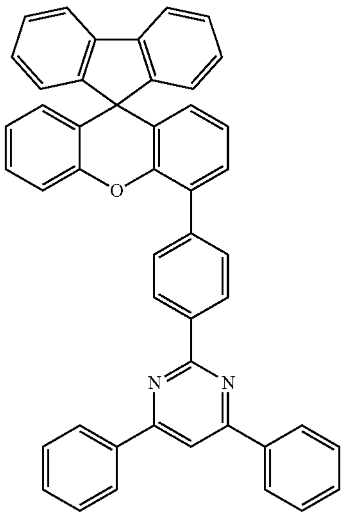
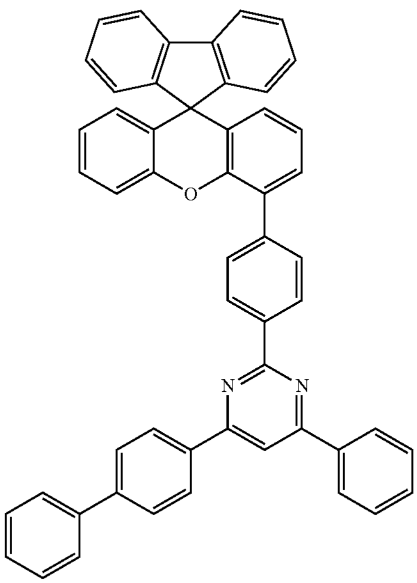
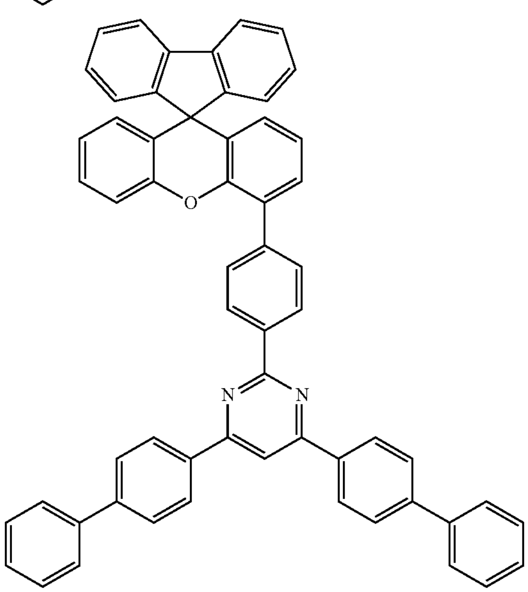
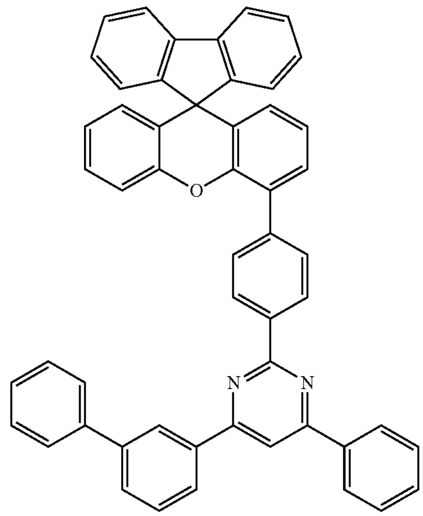
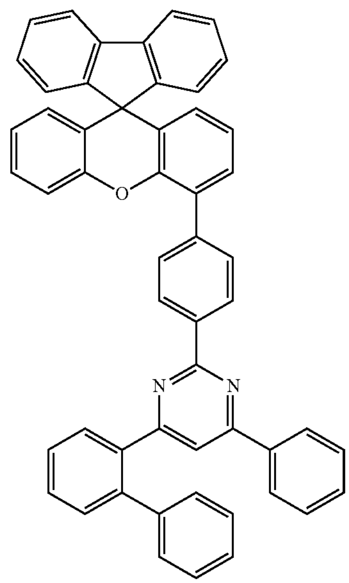
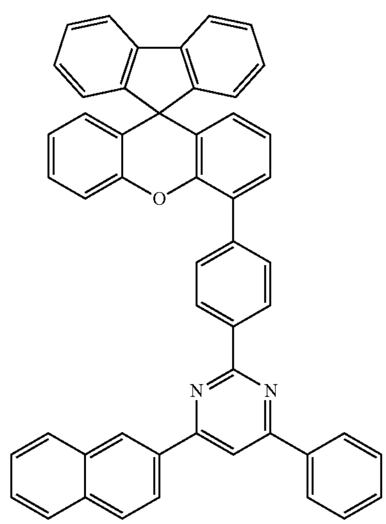

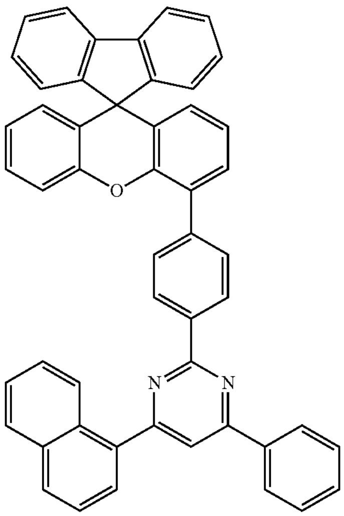
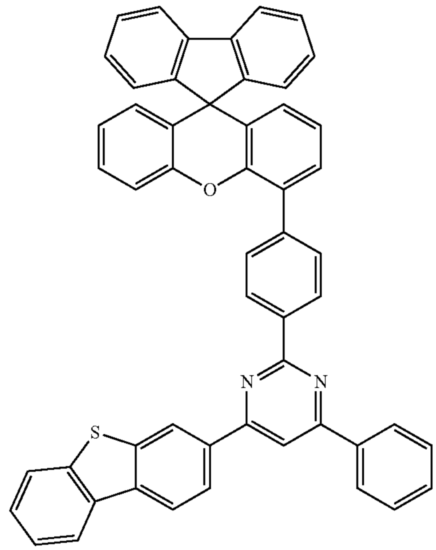
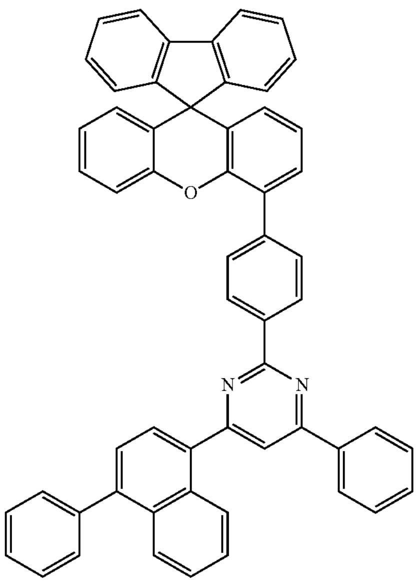
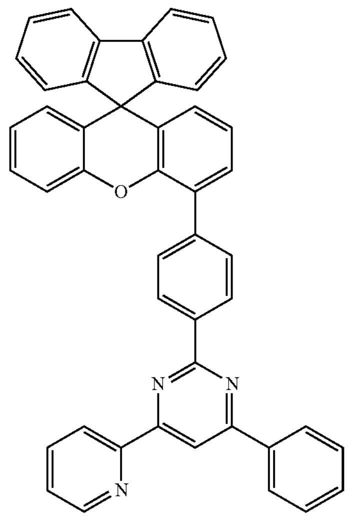
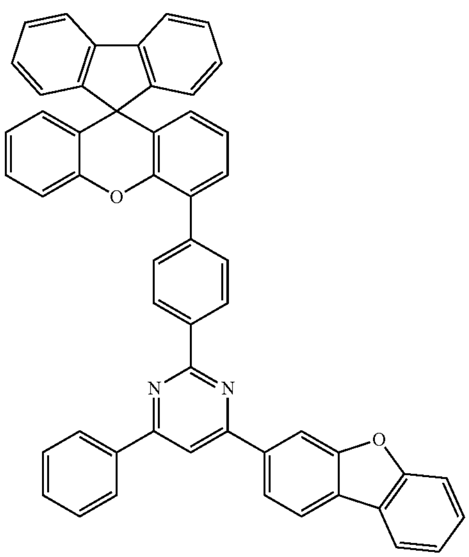
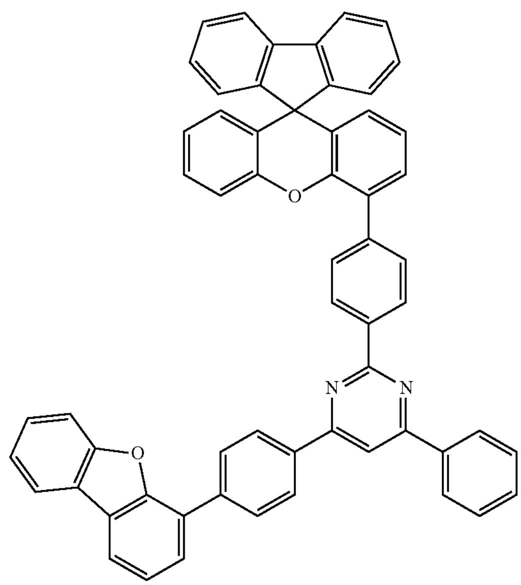
O
N
N
O -continued
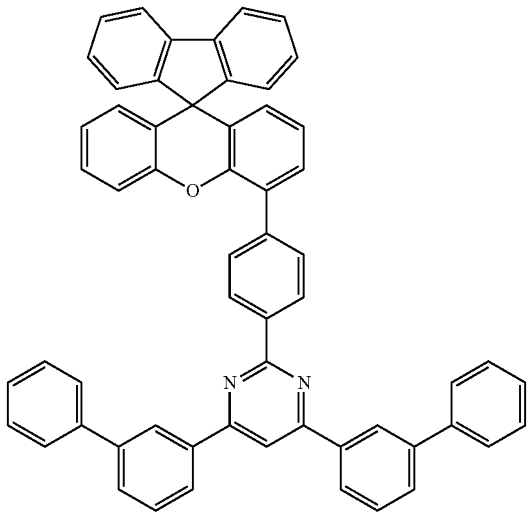
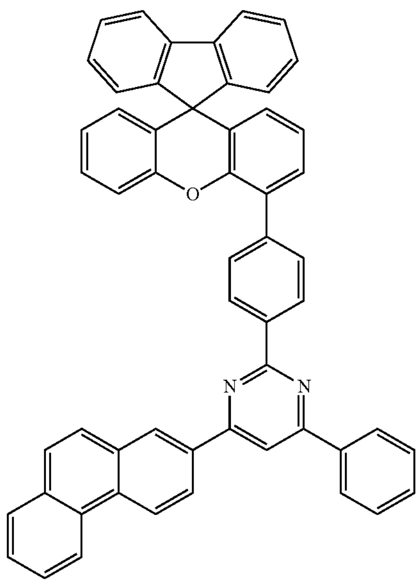
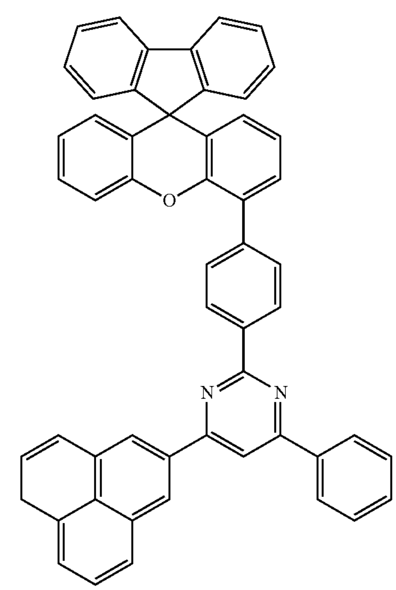
-continued
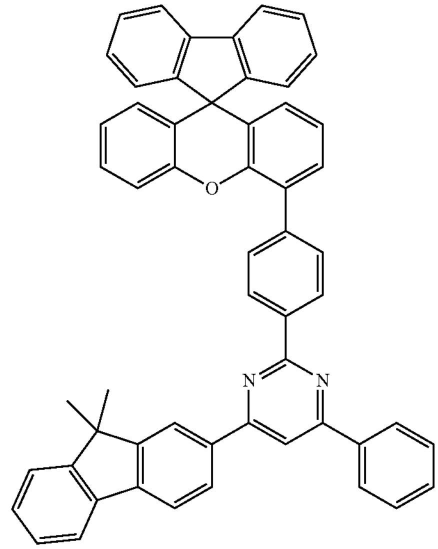
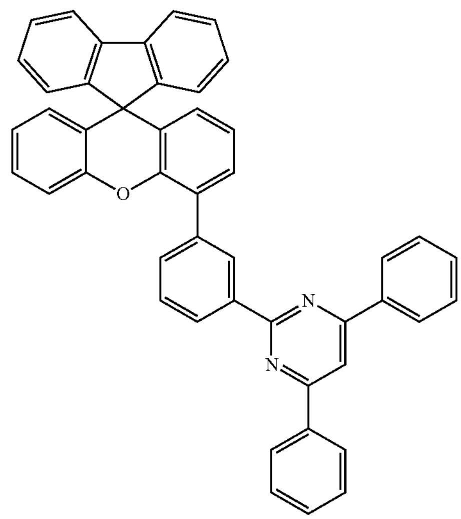
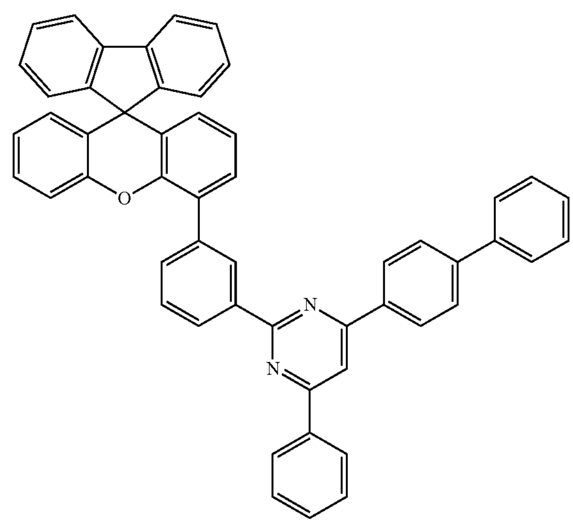

-continued
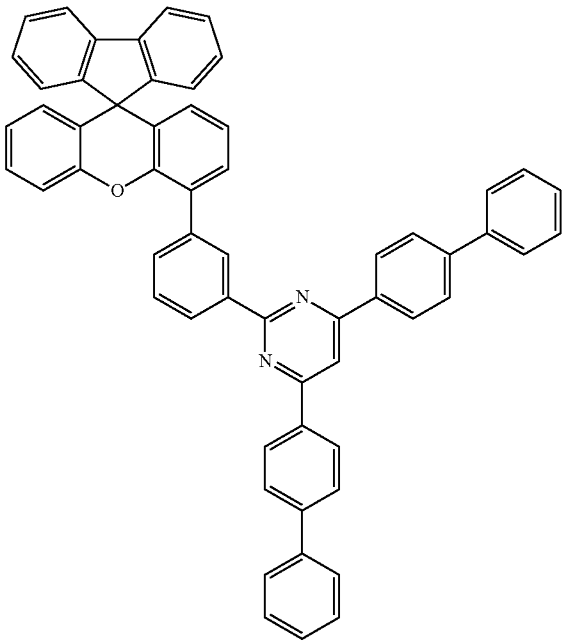
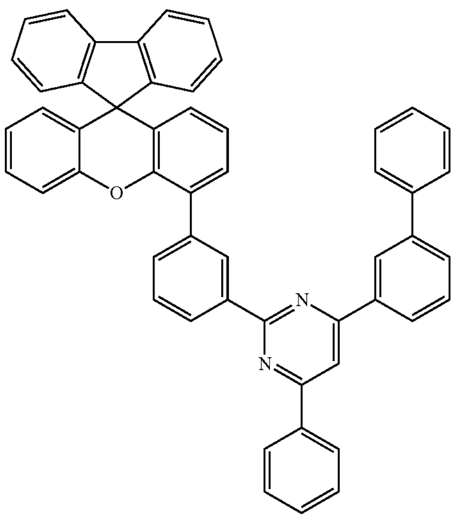
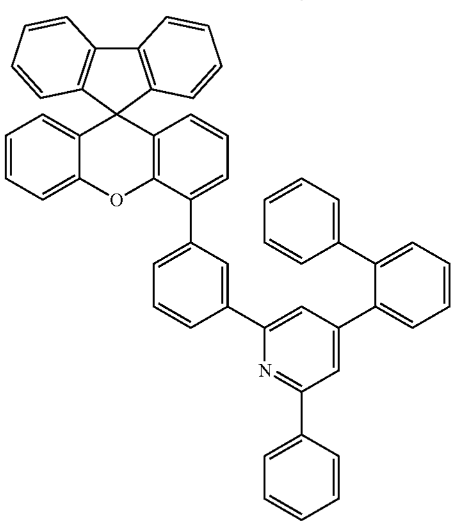
-continued
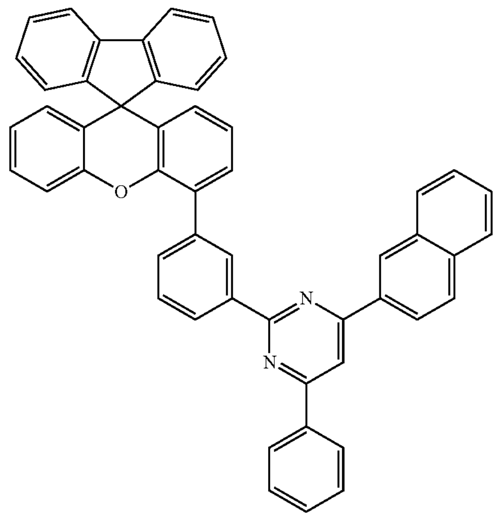
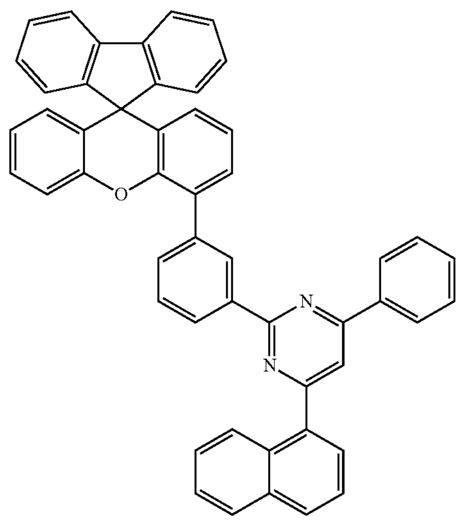
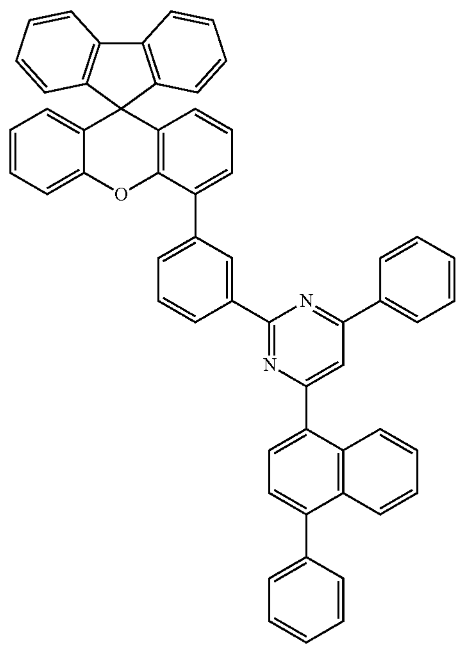

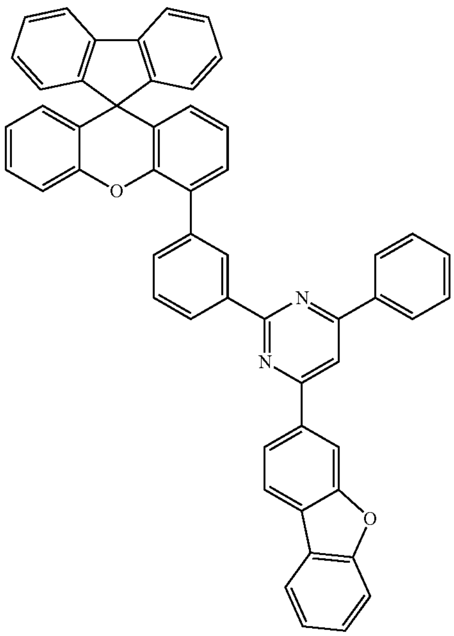
O
N
N
O
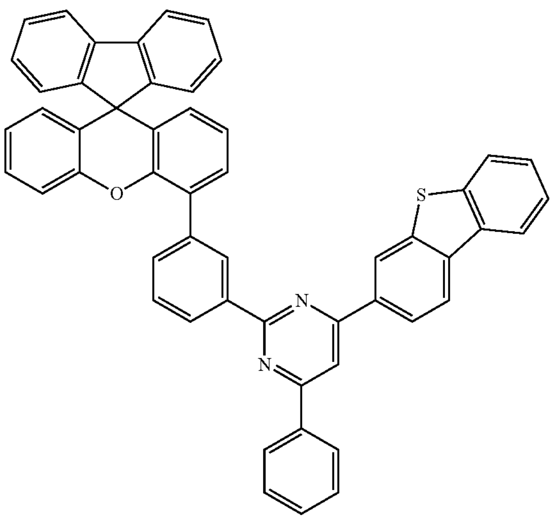
O
S
N
N
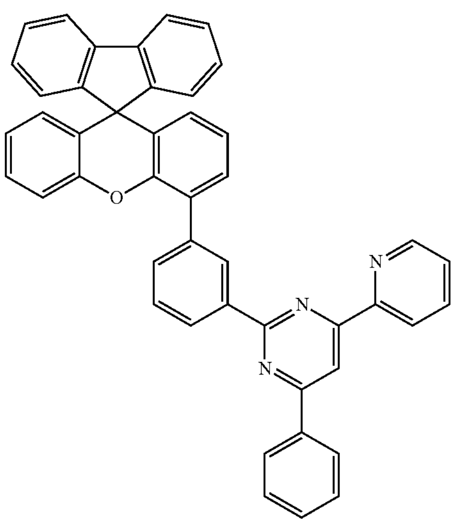
O
N
N
N
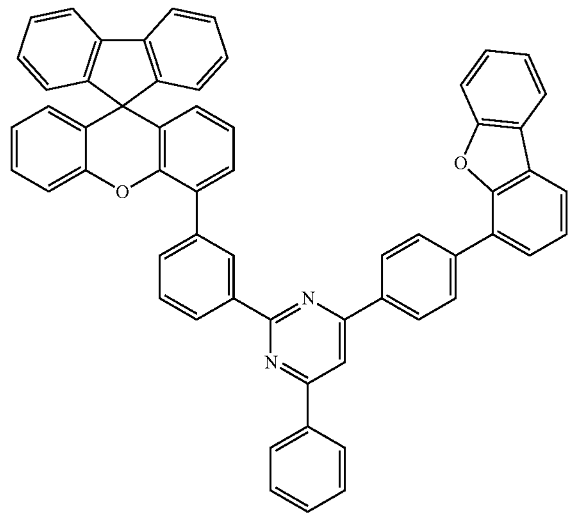
O
O
N
N
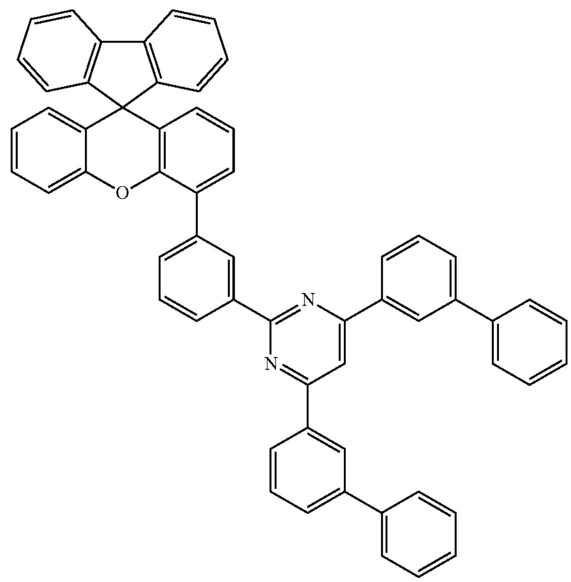
O
N
N
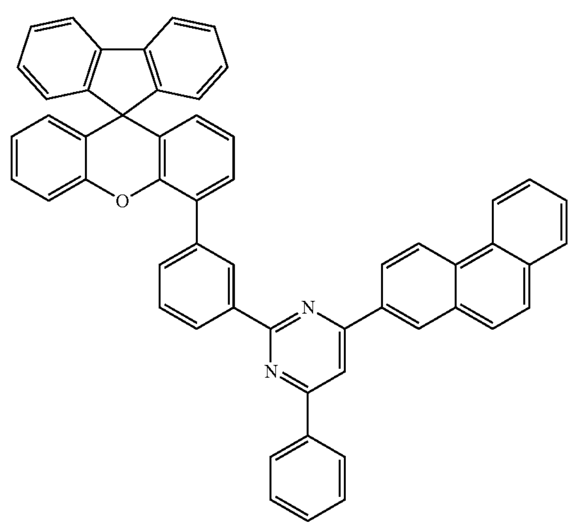
O
N
N -continued
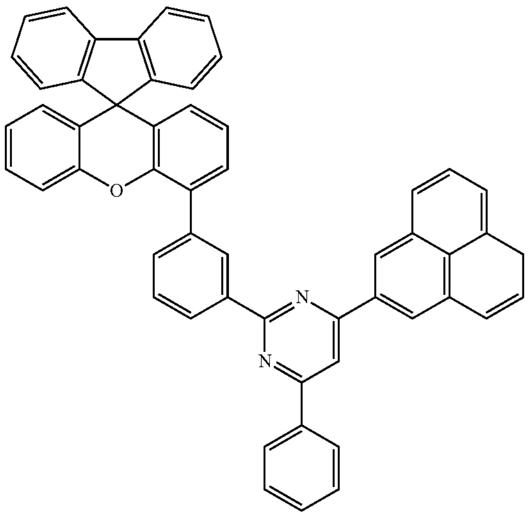
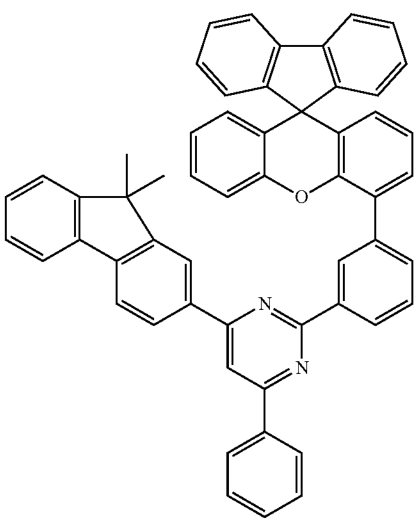
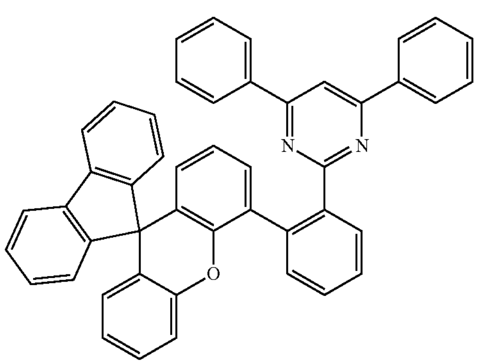
-continued
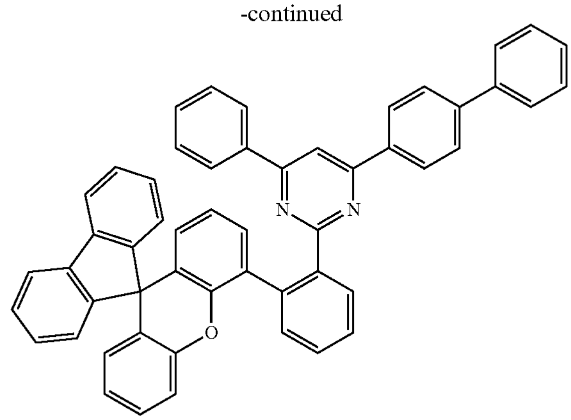
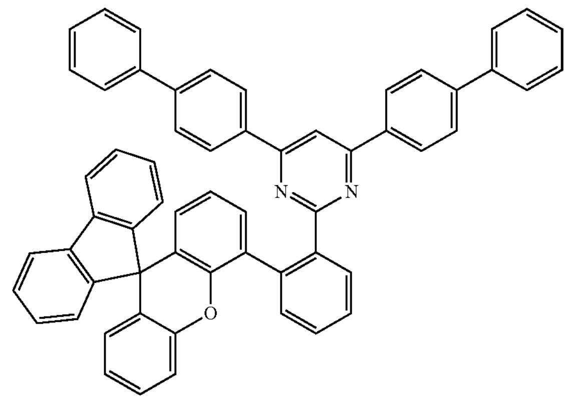
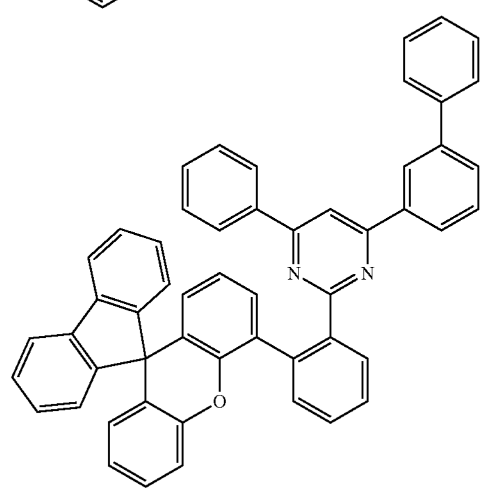
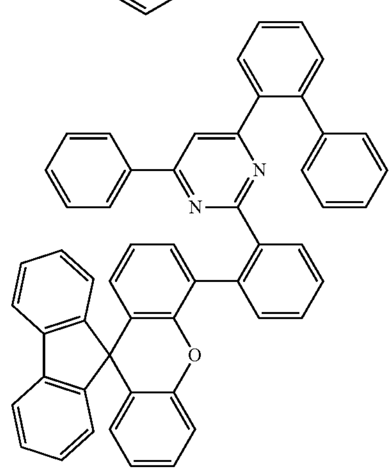

-continued
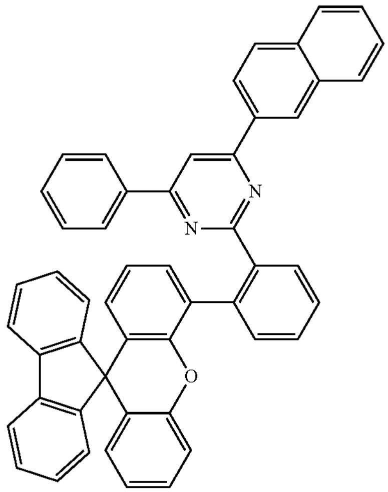
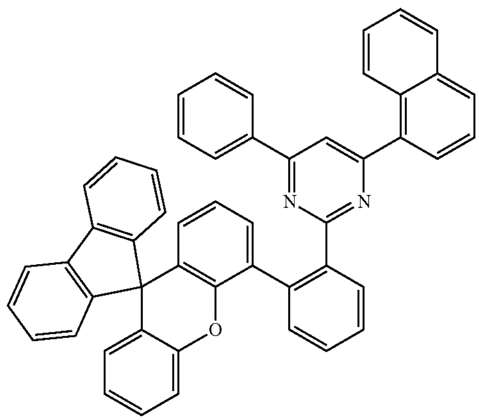
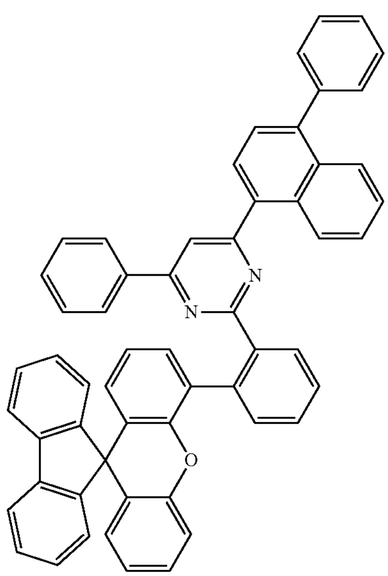
-continued
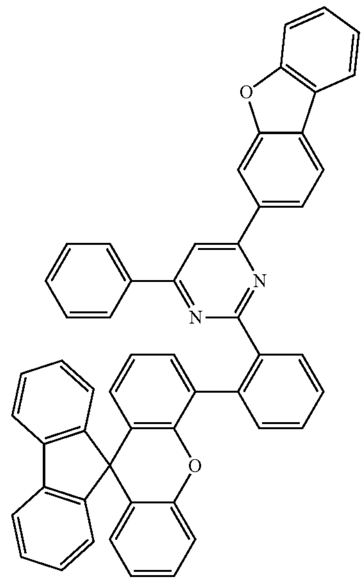
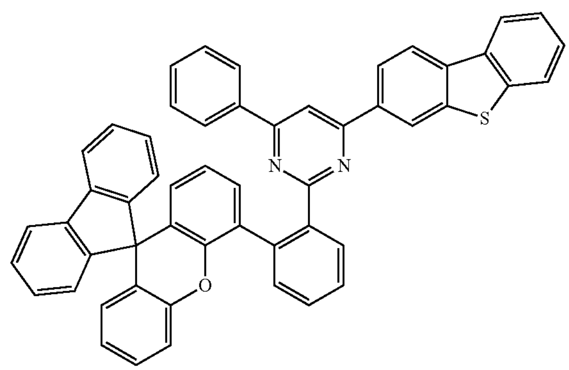
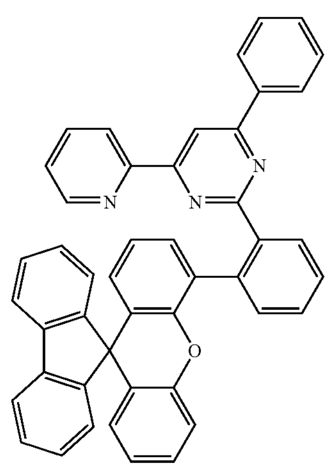

-continued
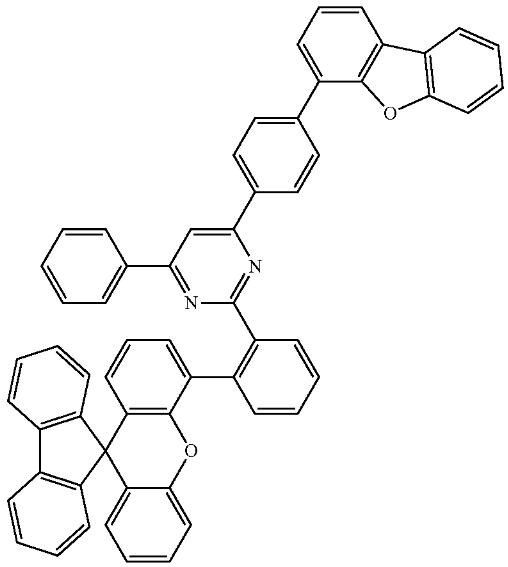
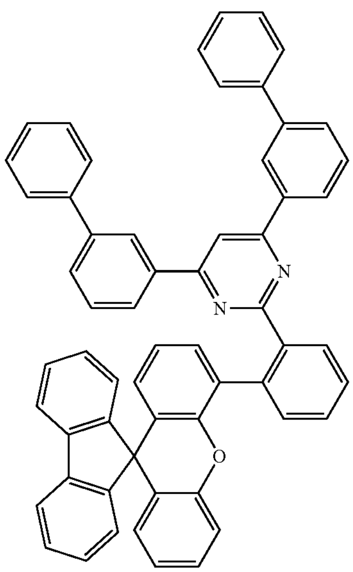
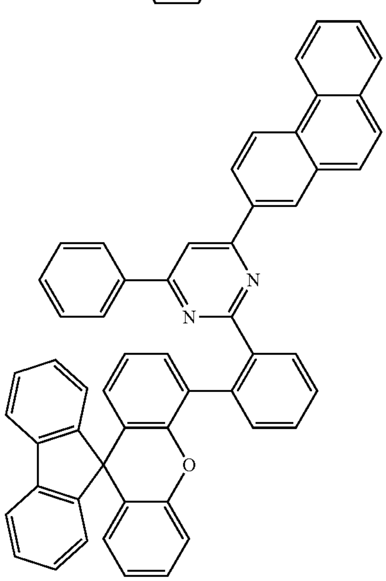
-continued
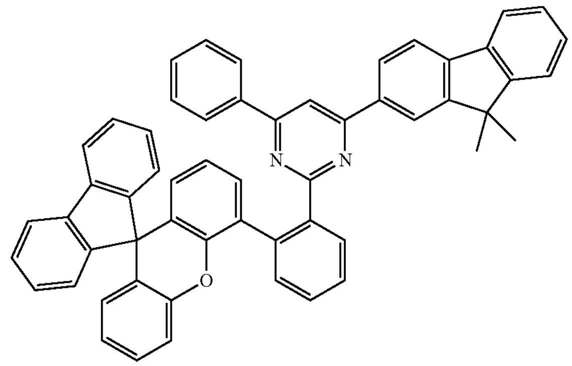
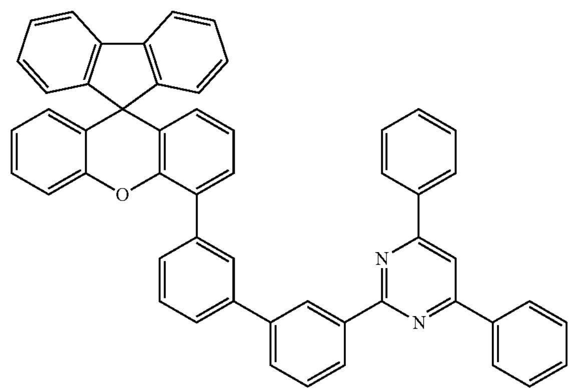
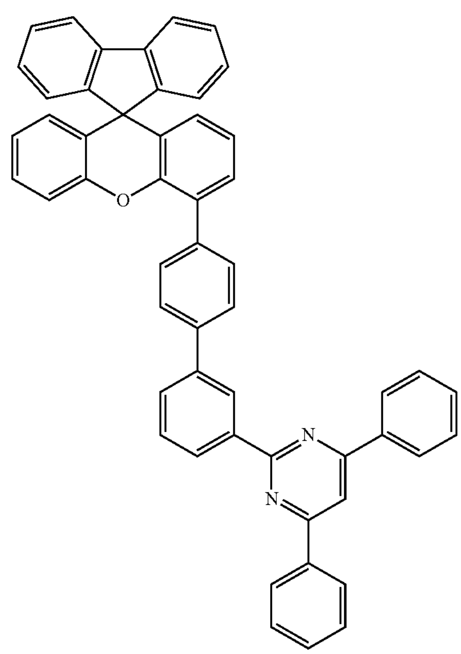

-continued
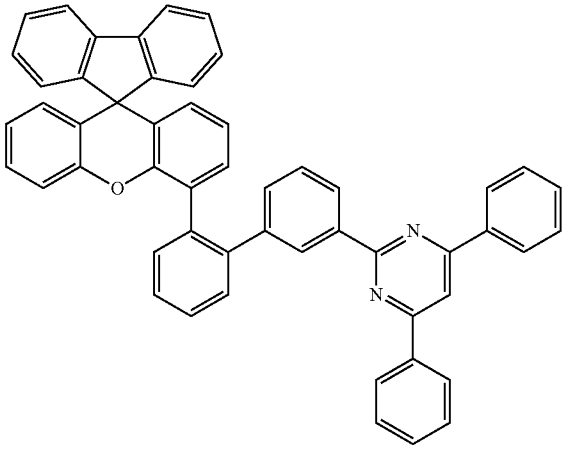
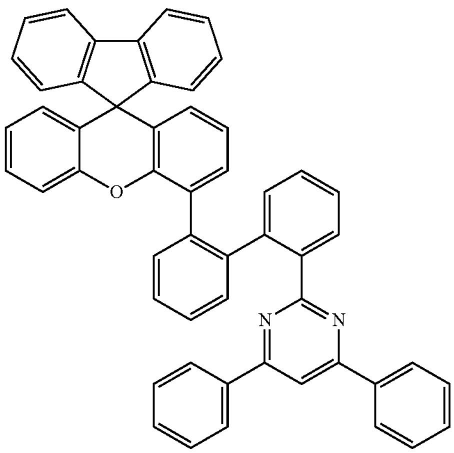
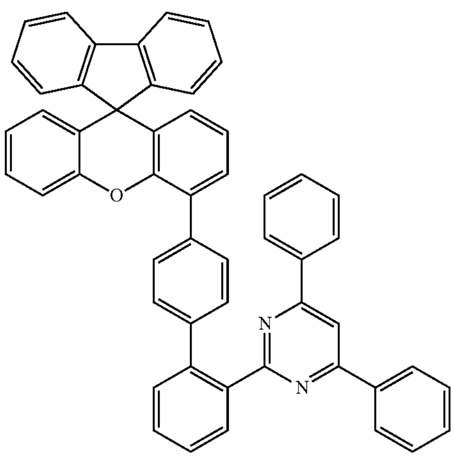
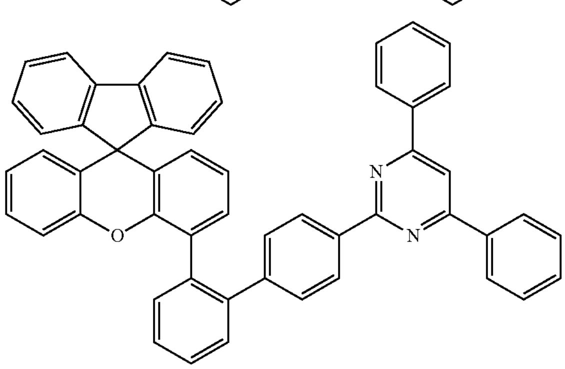
-continued
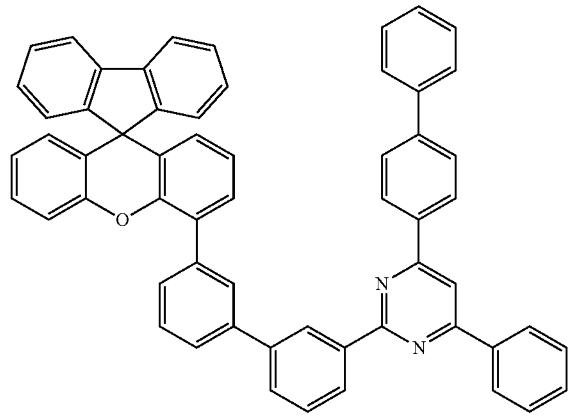
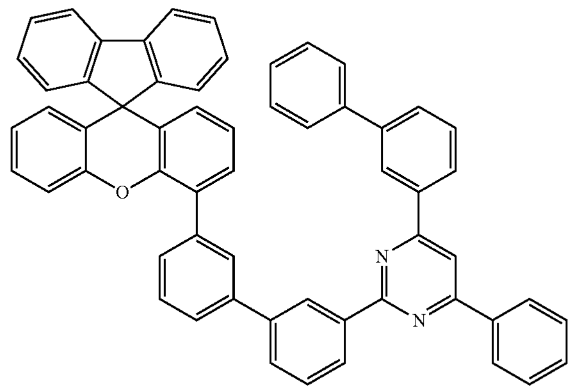
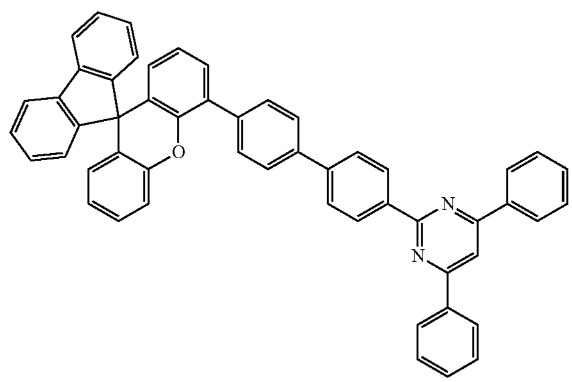
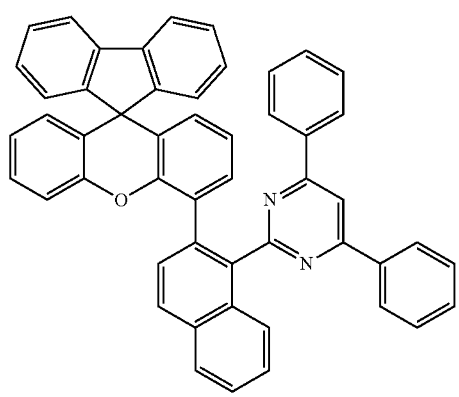

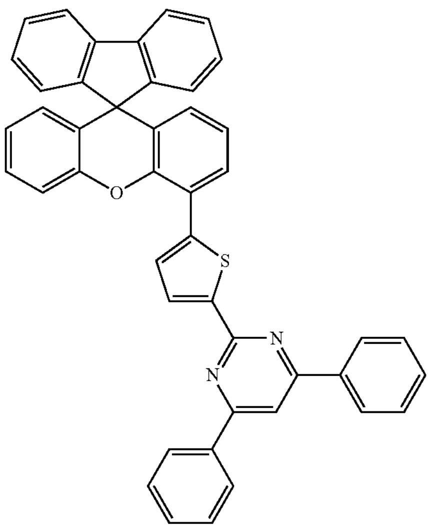
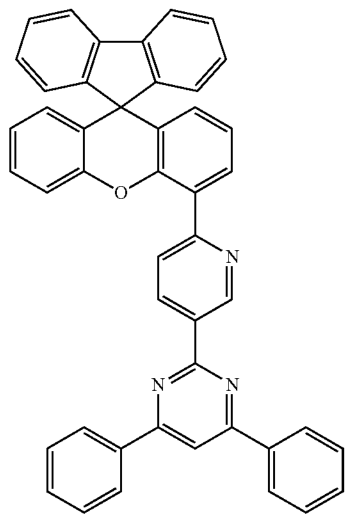
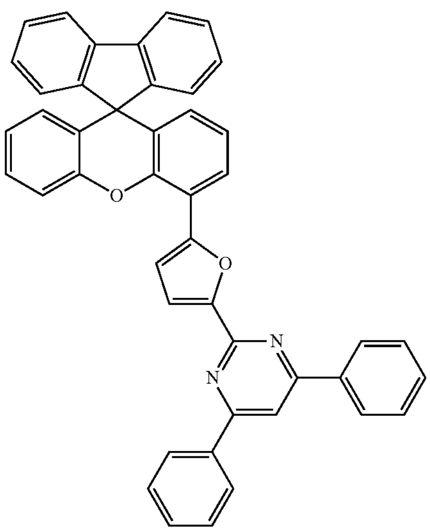
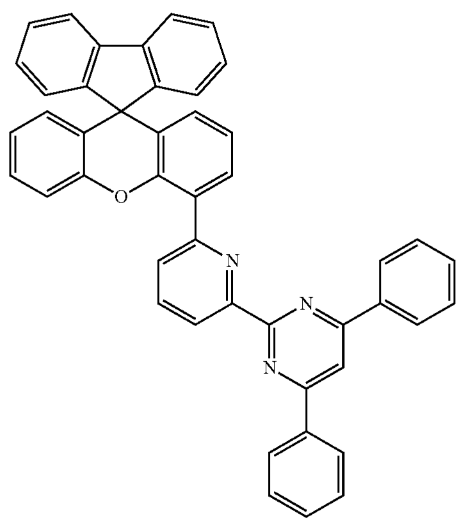
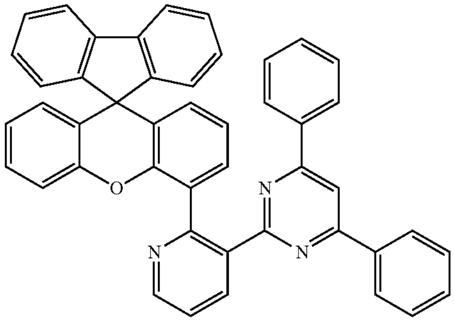
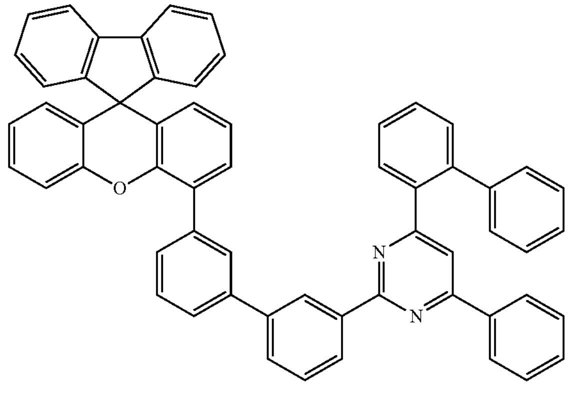
N
N -continued
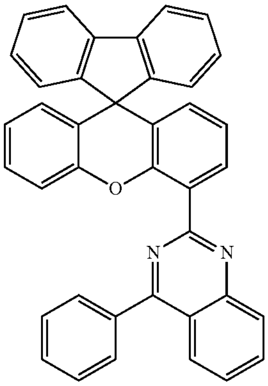
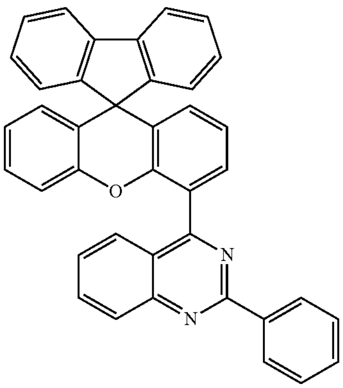
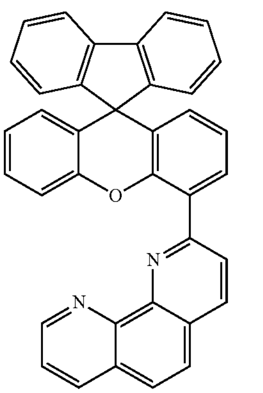
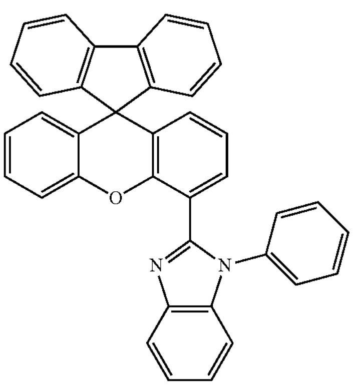
-continued
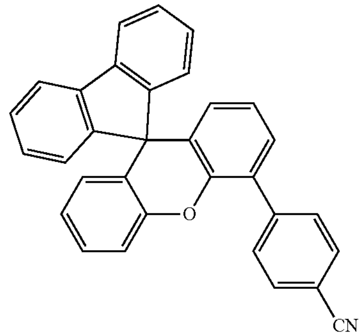
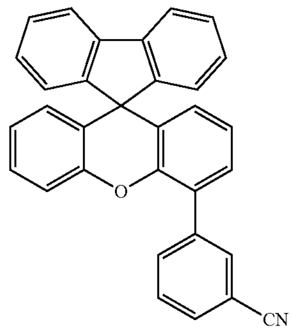
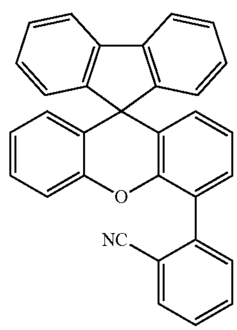
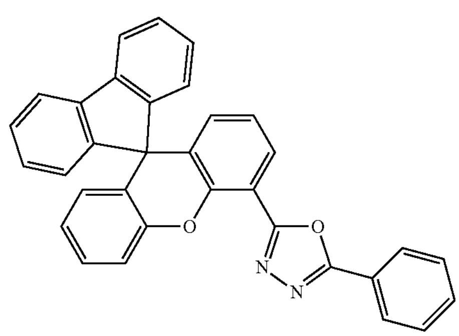

-continued
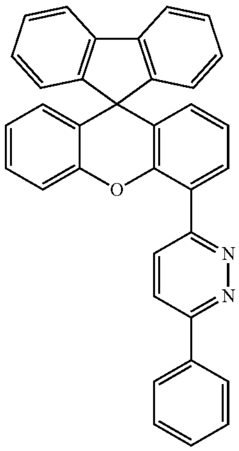
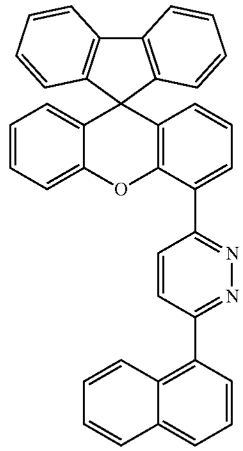
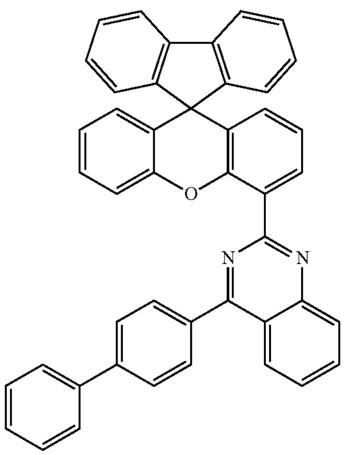
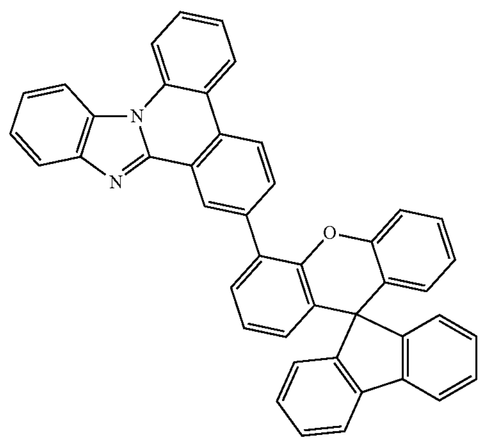
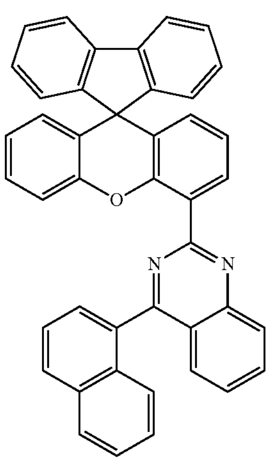
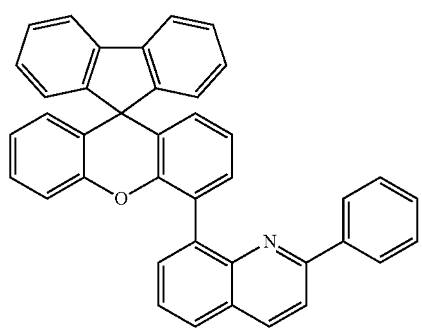

-continued
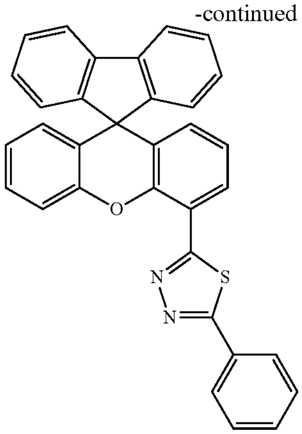
-continued
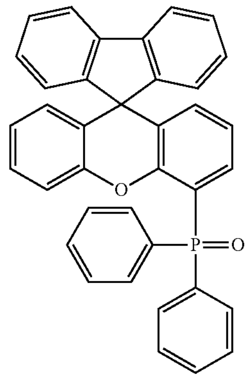
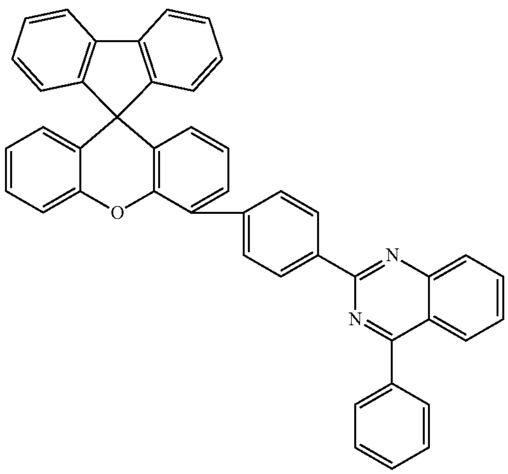
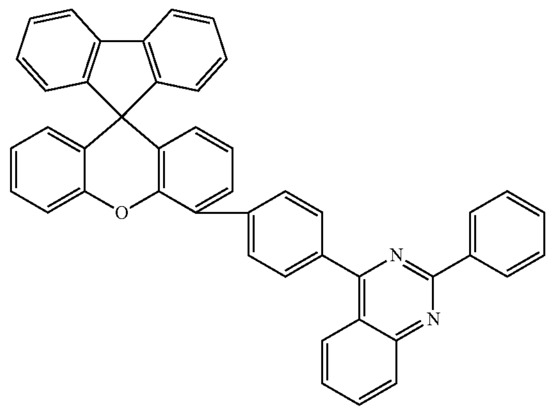
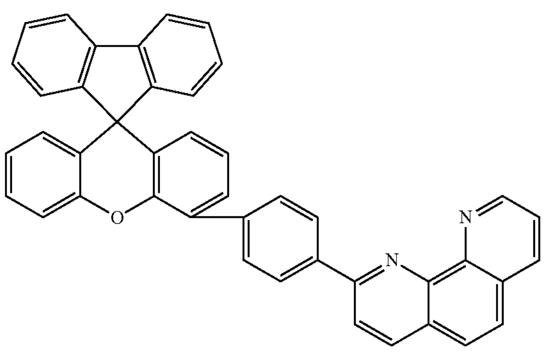
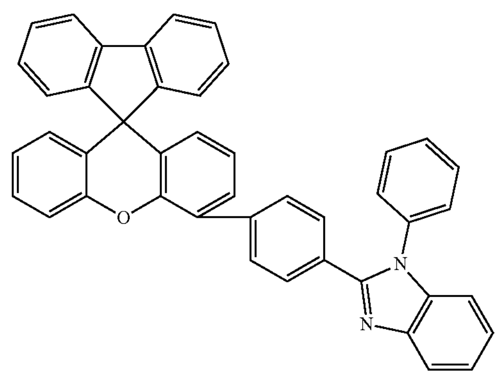
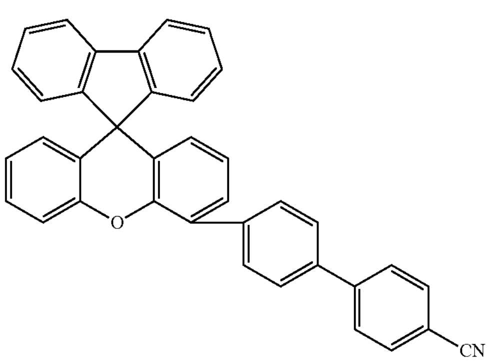
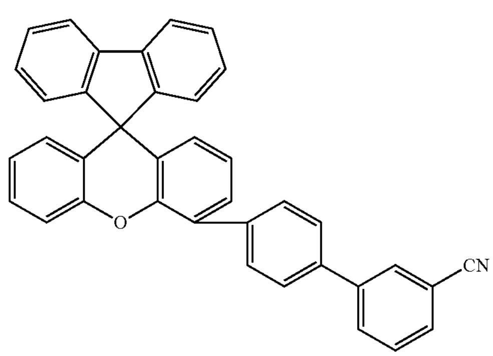

-continued
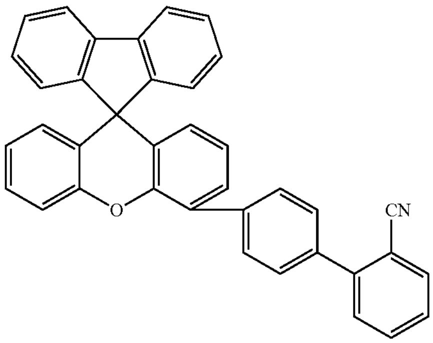
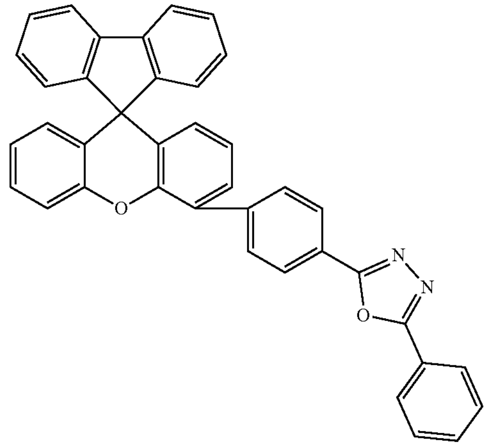
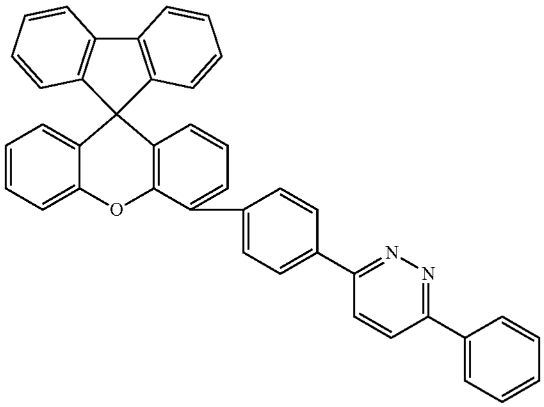
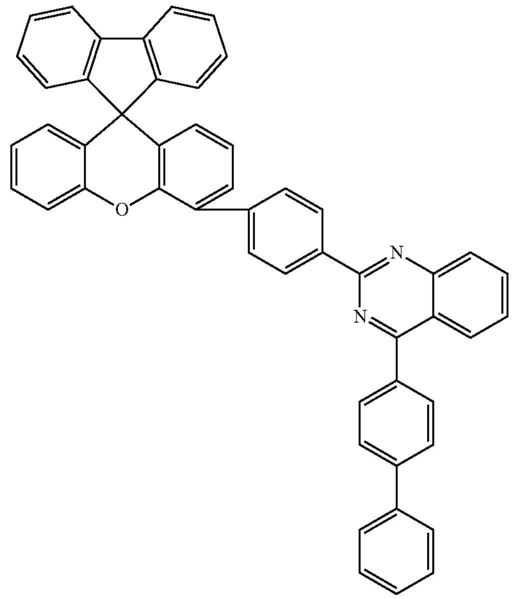
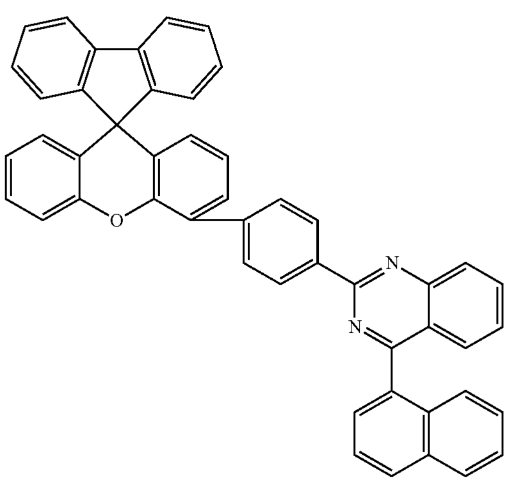
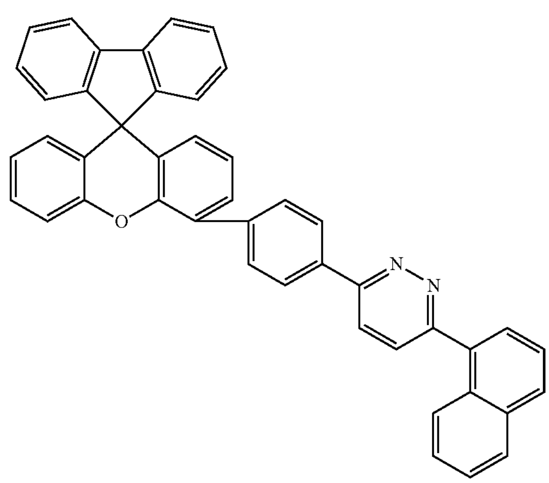

-continued
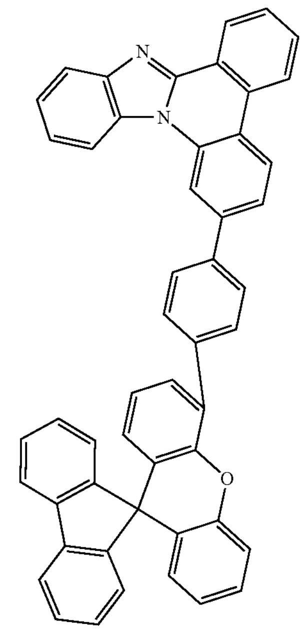
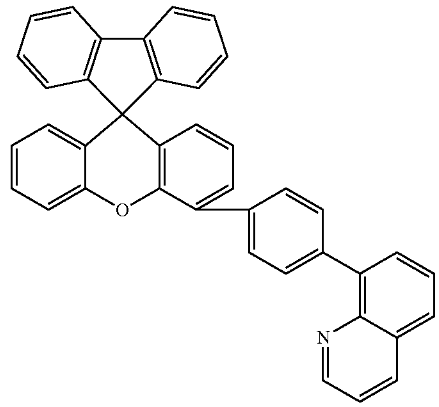
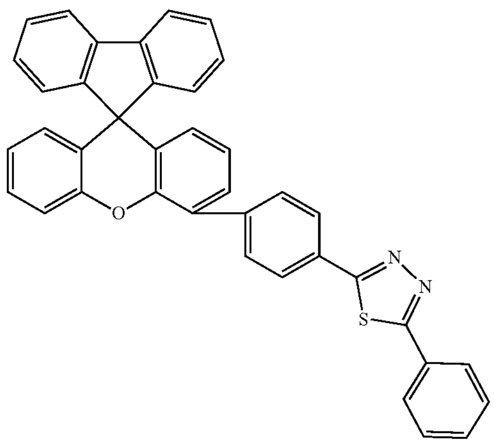
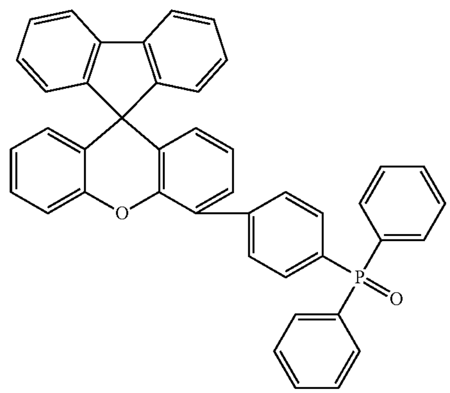
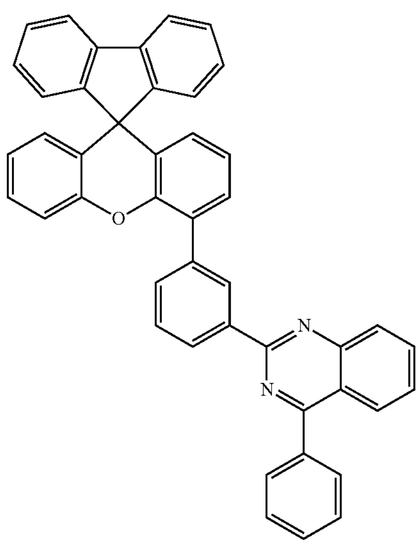
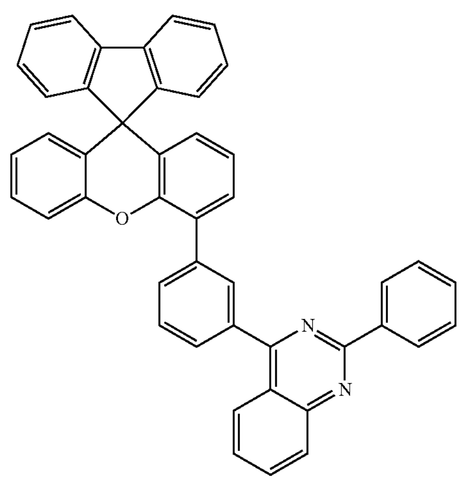

-continued
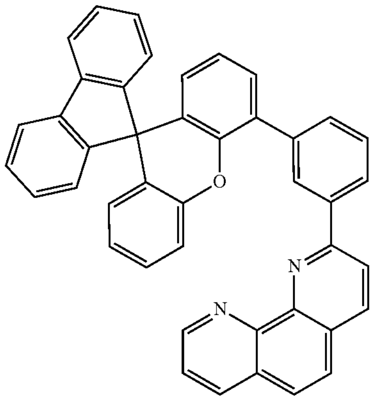
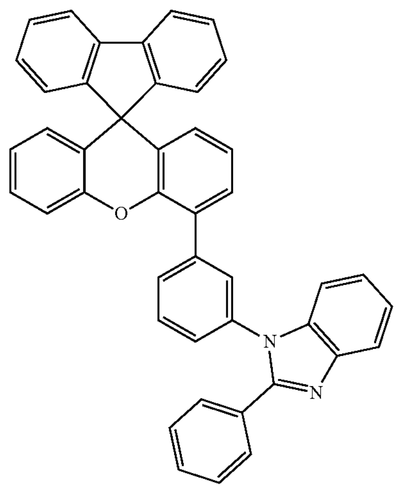
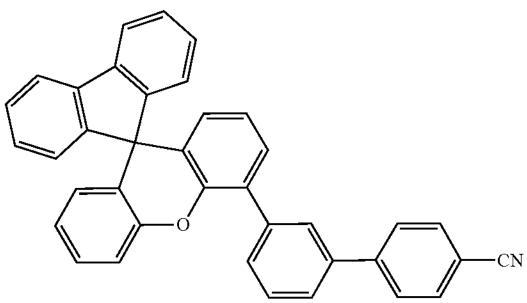
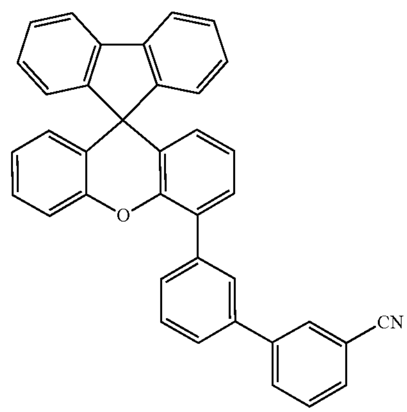
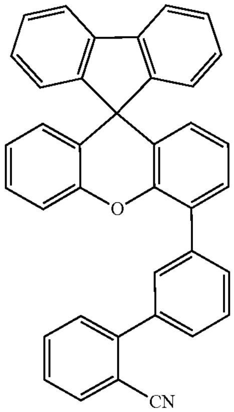
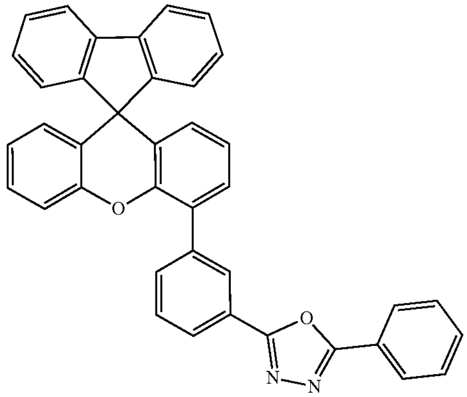

-continued
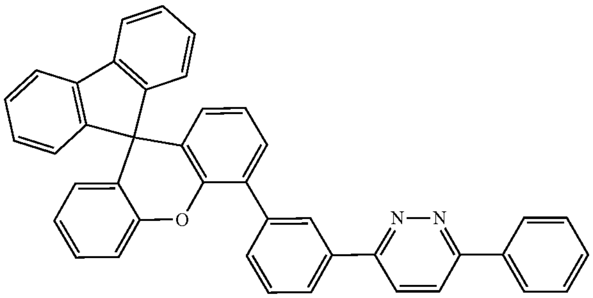
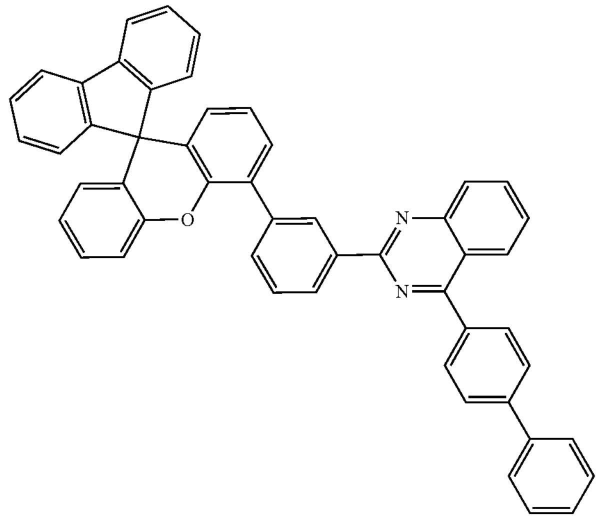
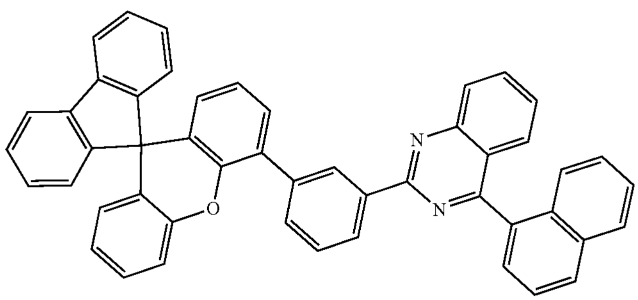
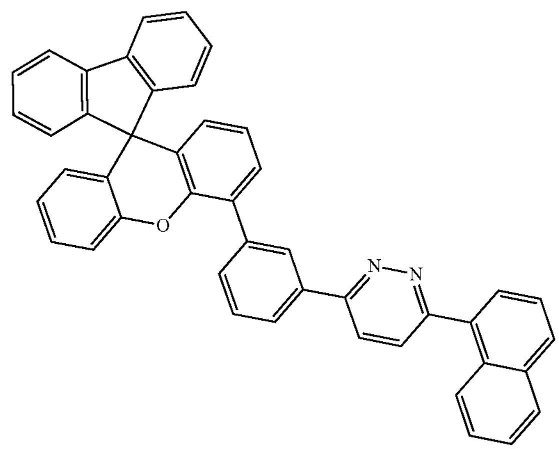
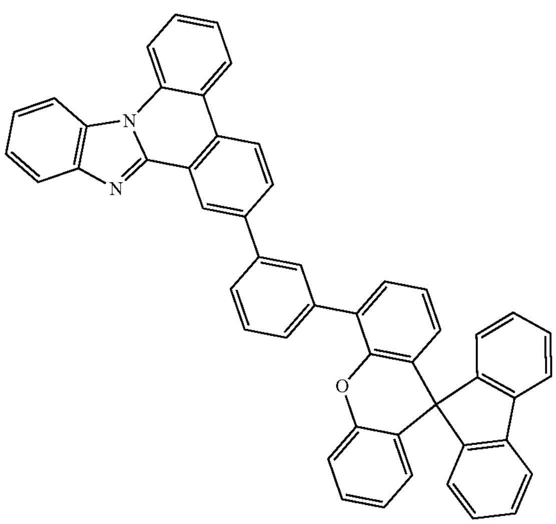
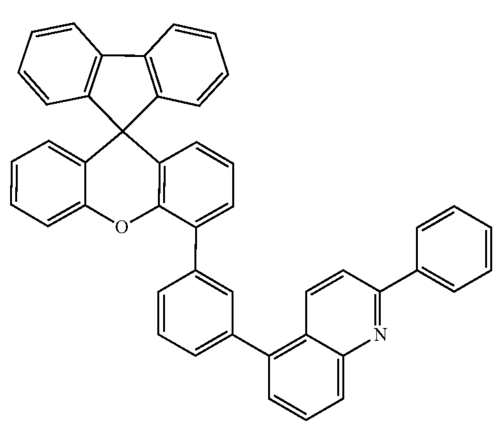

-continued
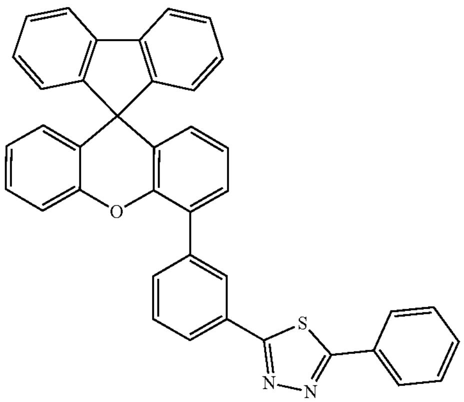
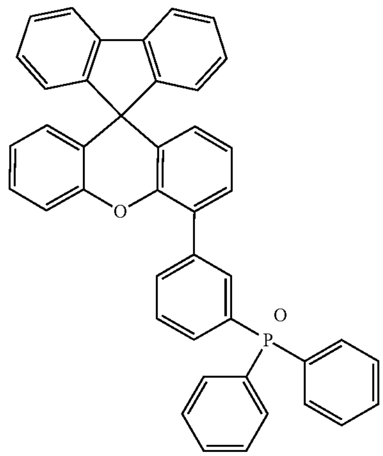
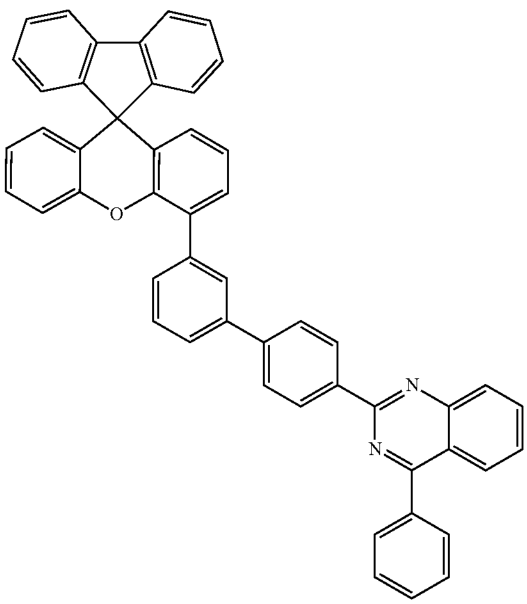
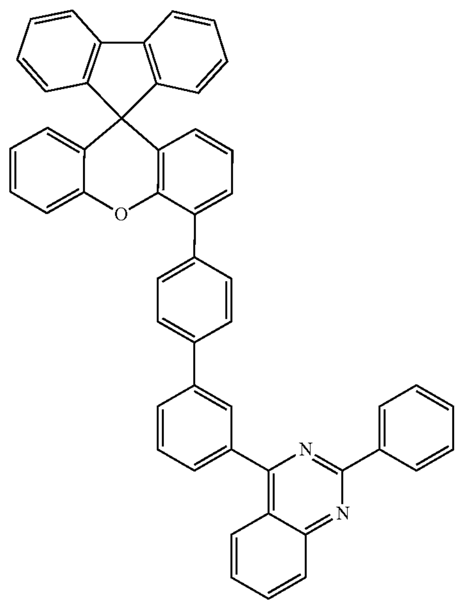
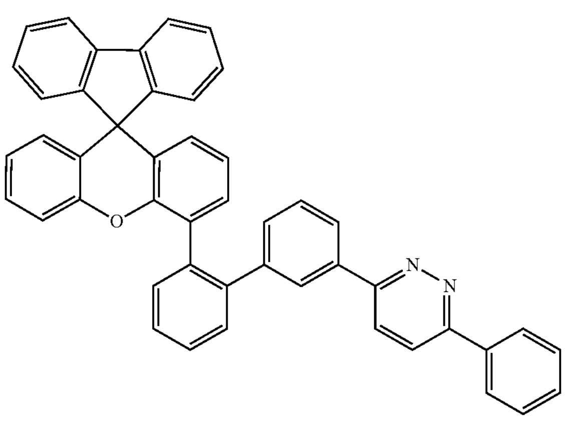
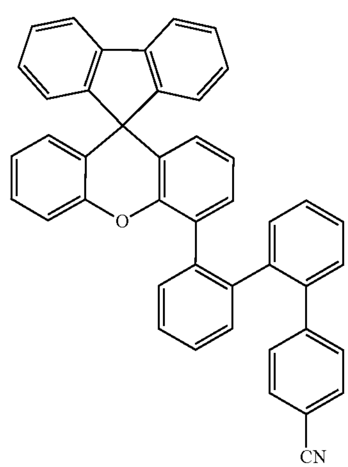

-continued
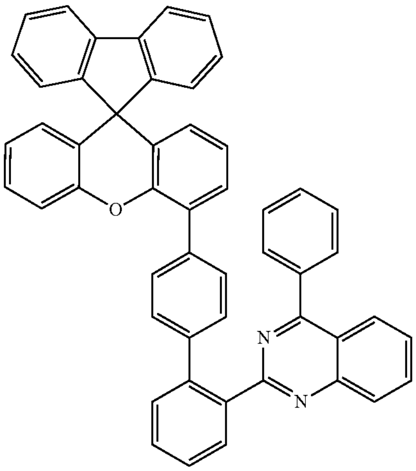
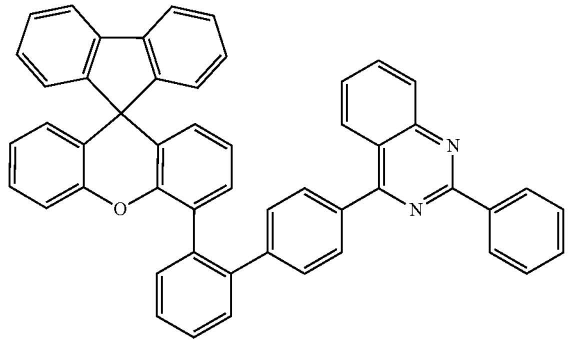
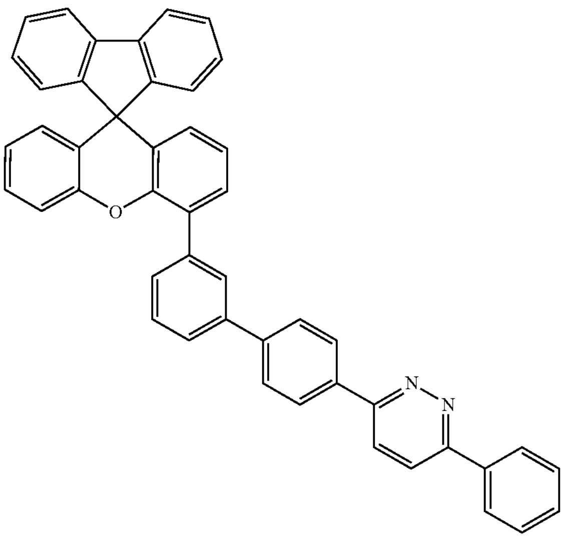
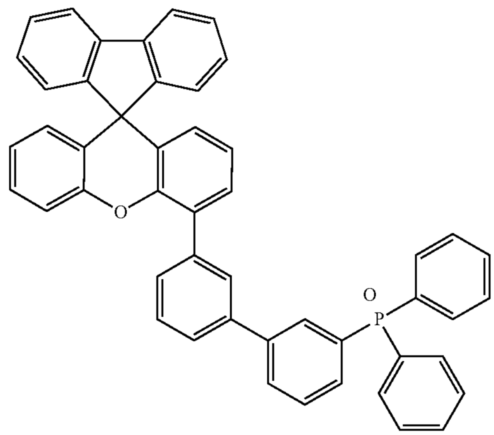
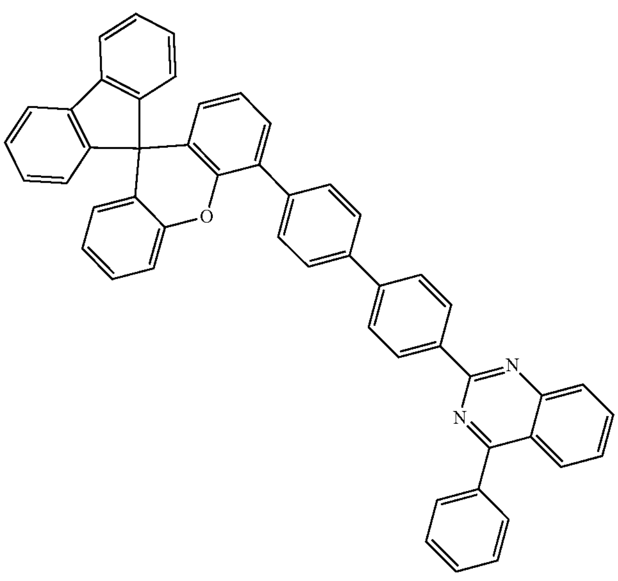
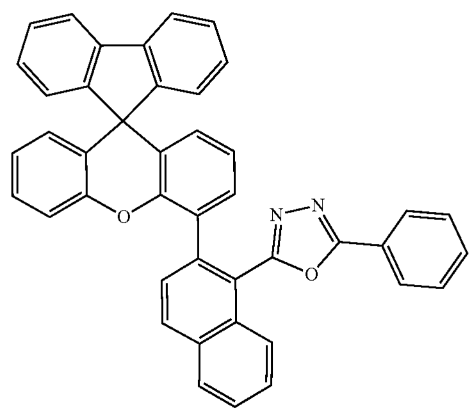

-continued
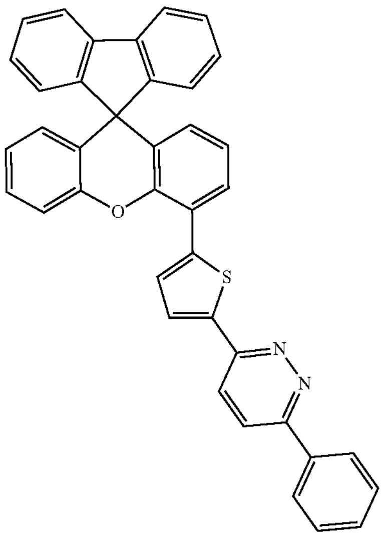
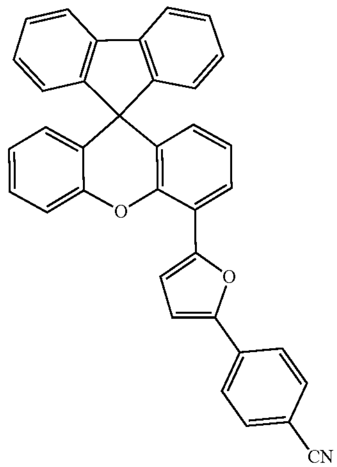
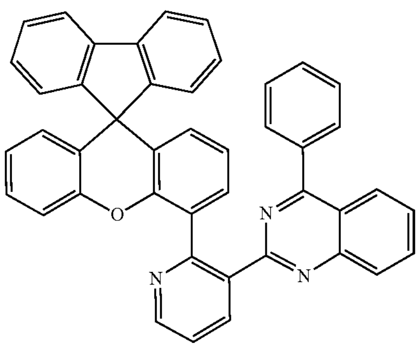
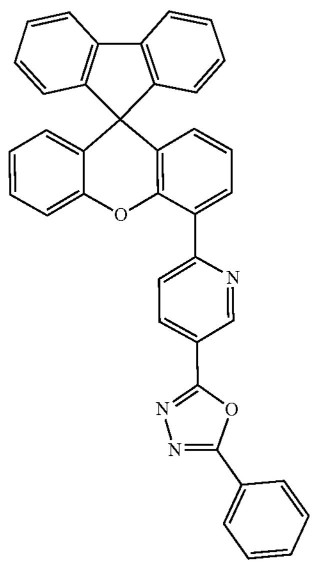
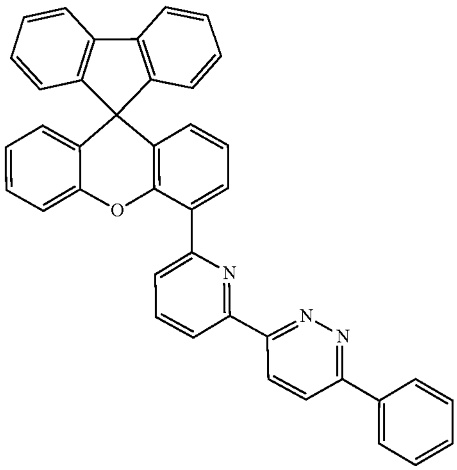
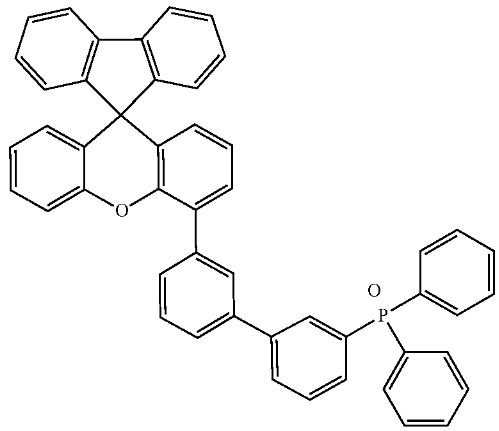

-continued
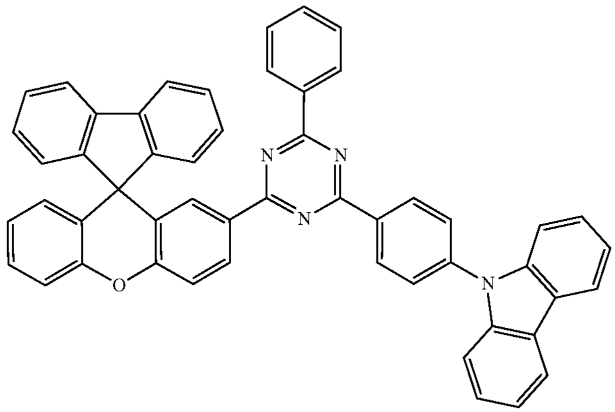
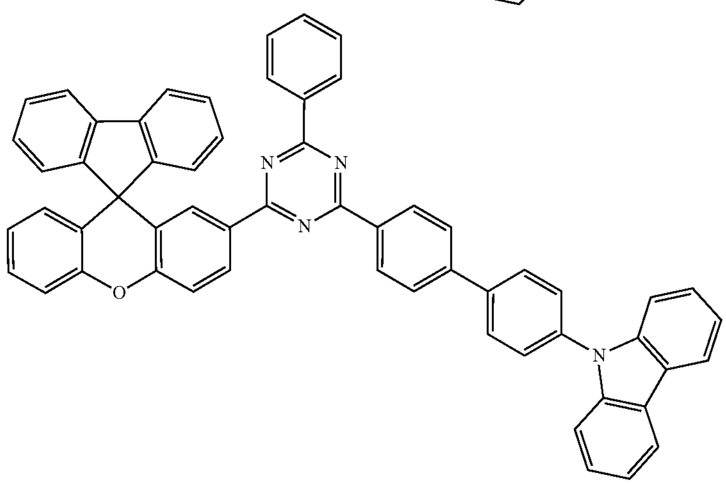
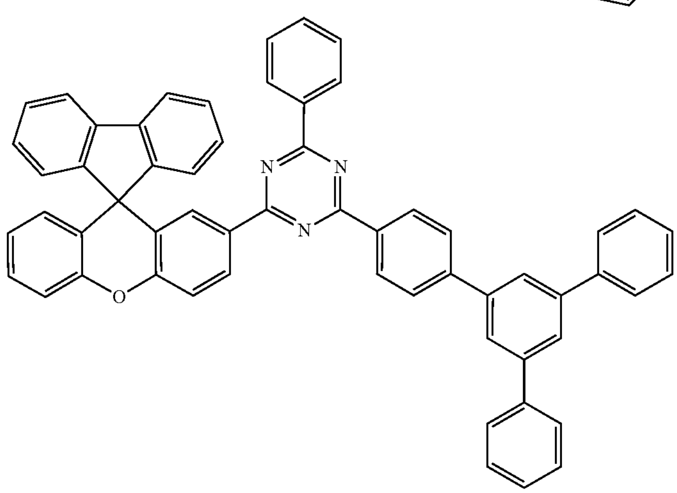
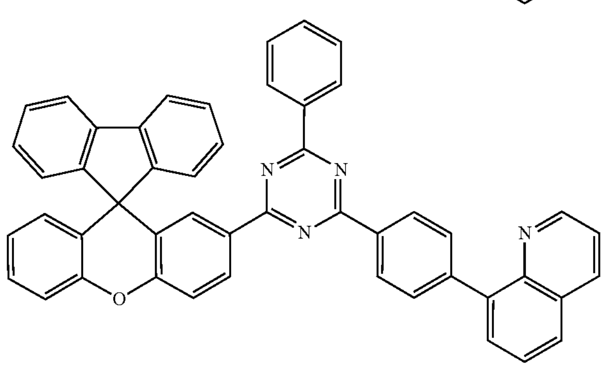

-continued
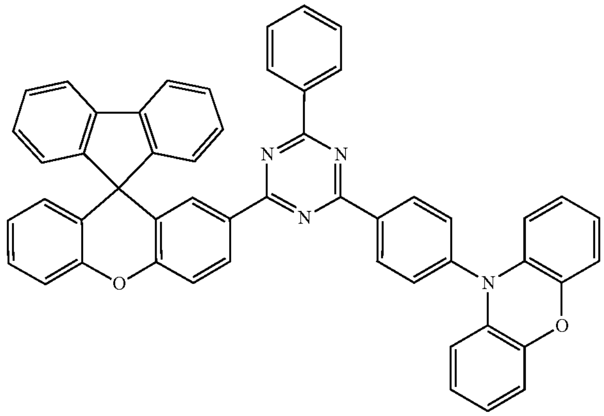
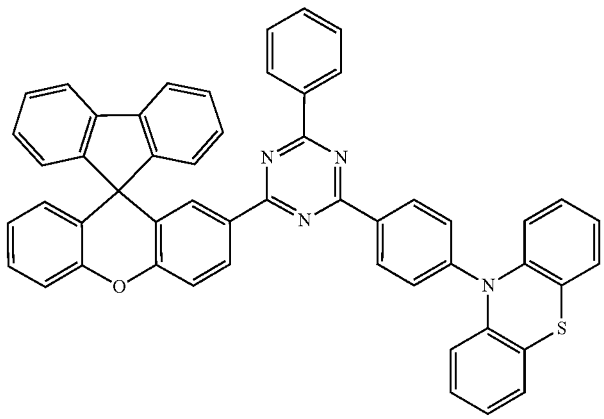
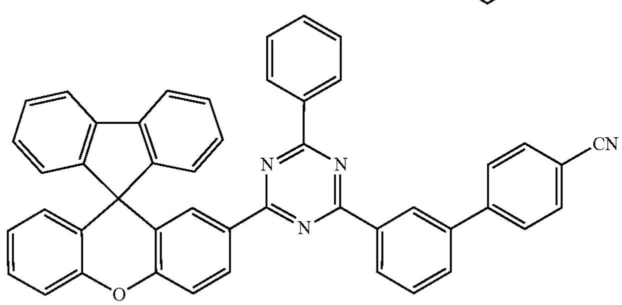
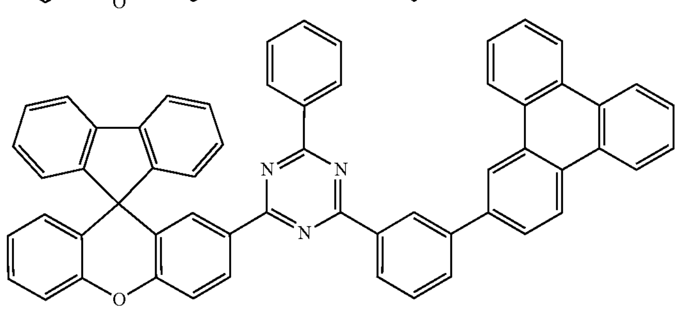
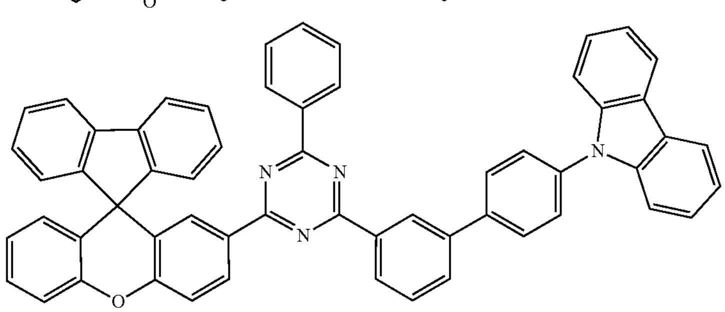
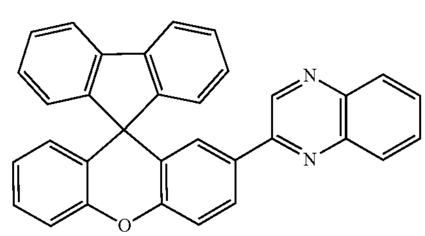

-continued
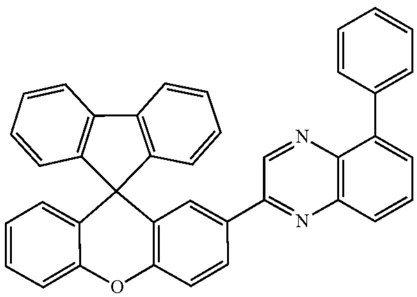
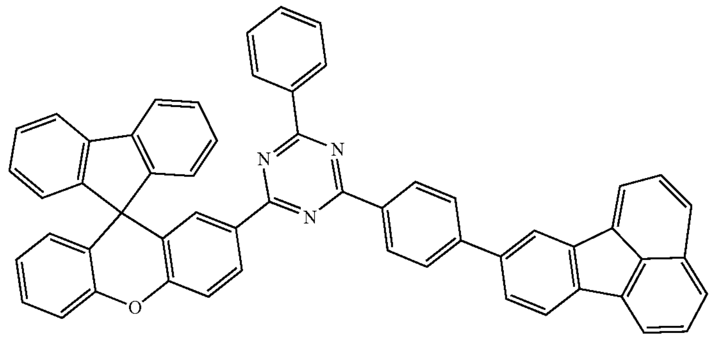
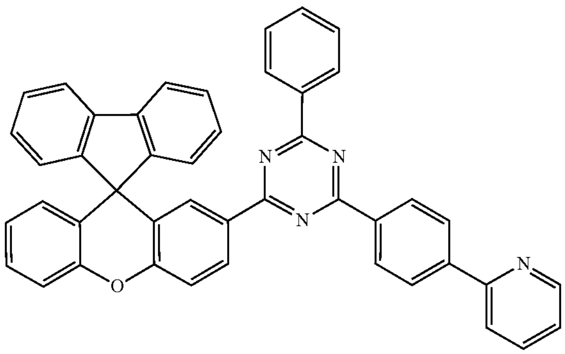
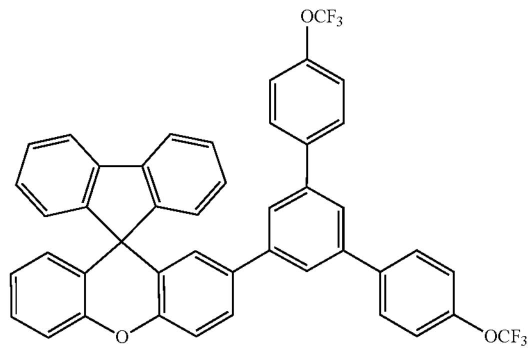
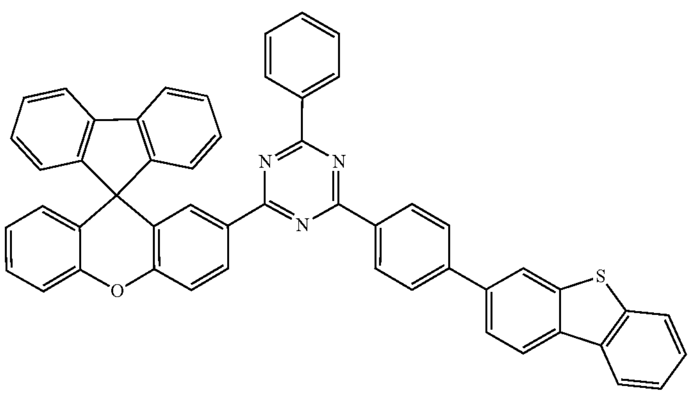
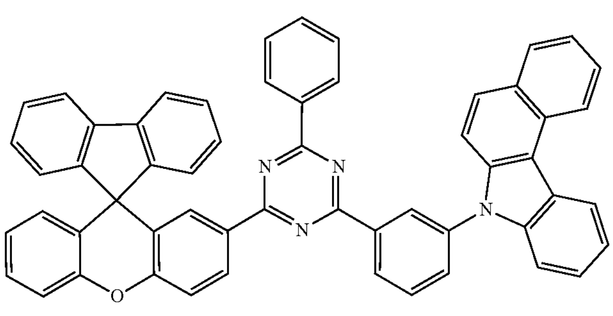

-continued
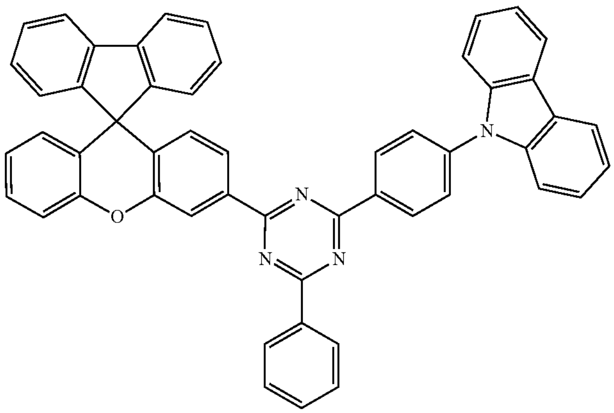
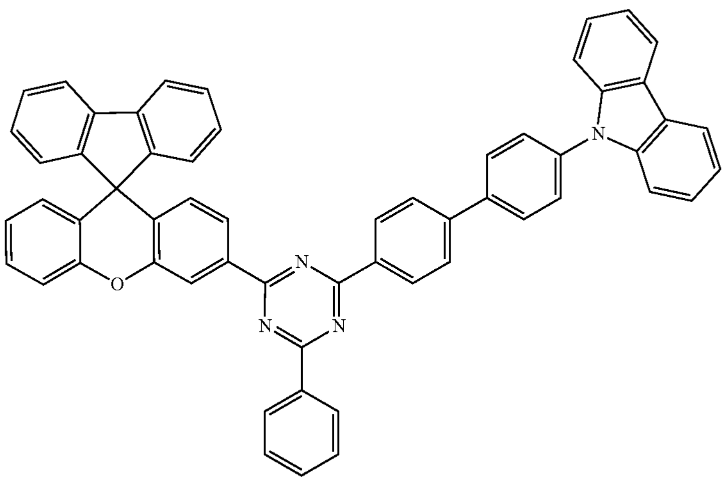
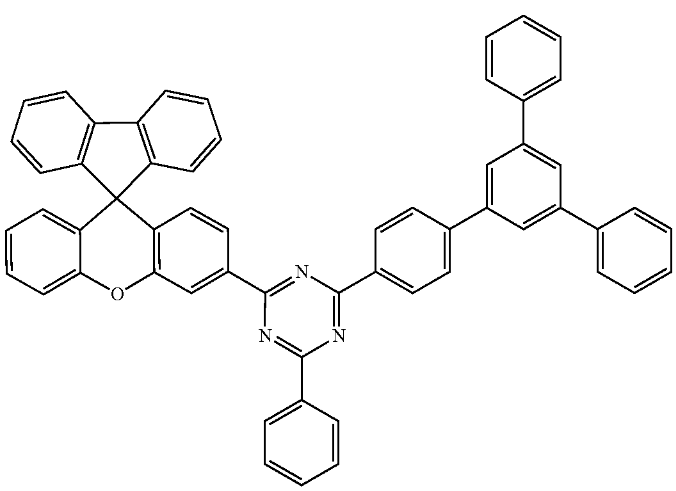

-continued
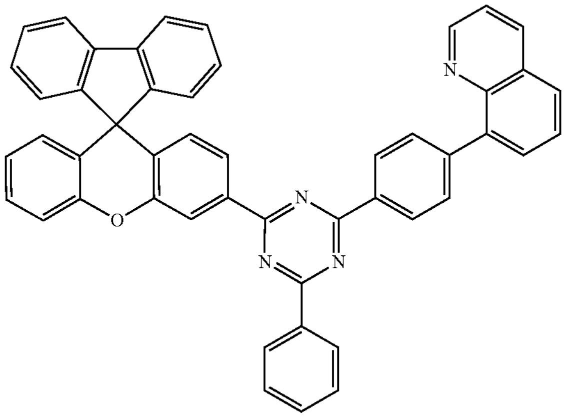
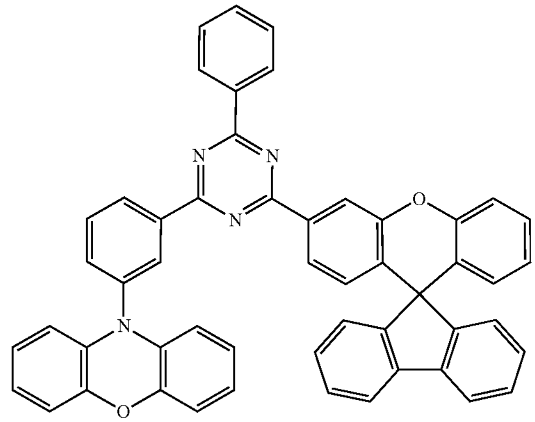
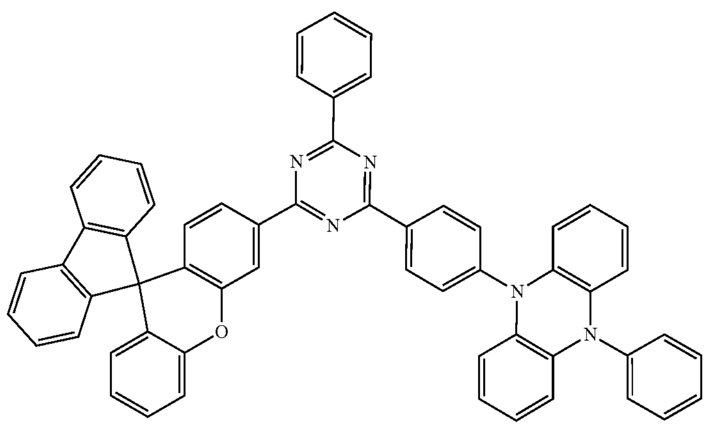
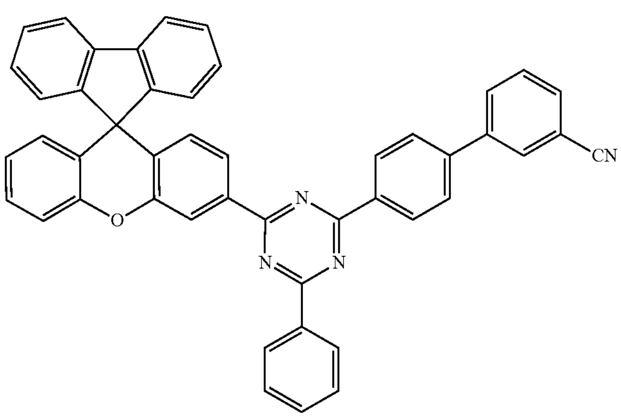
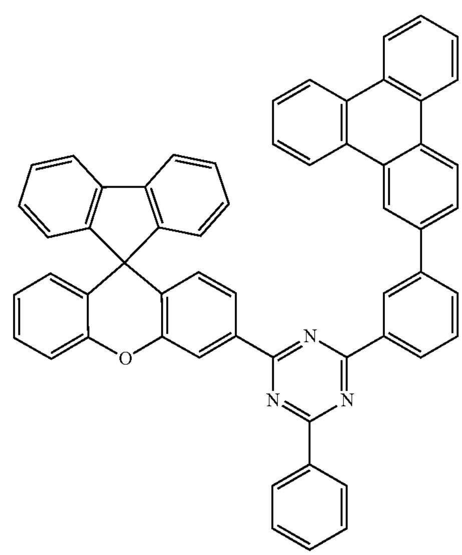

-continued
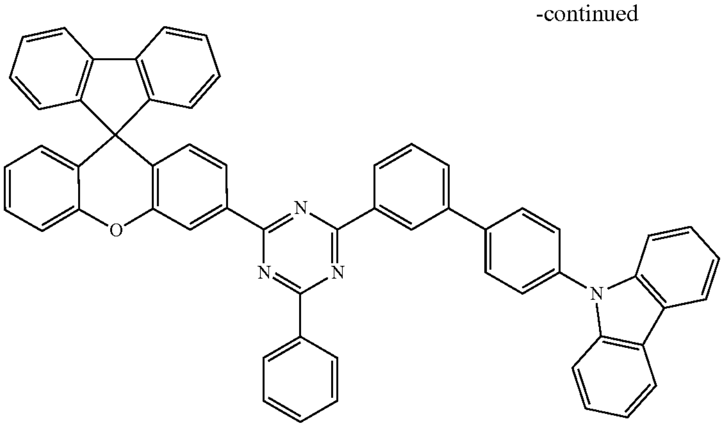
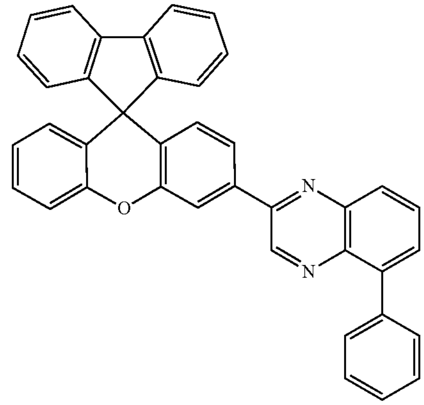
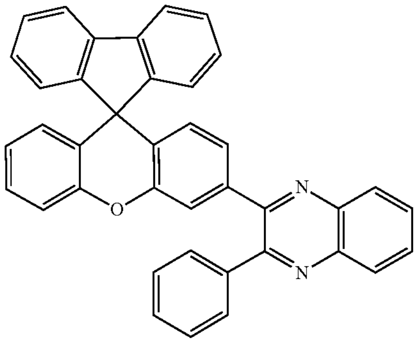
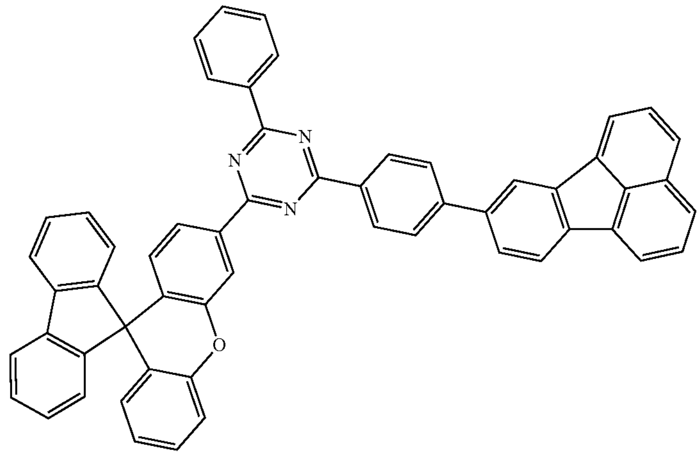
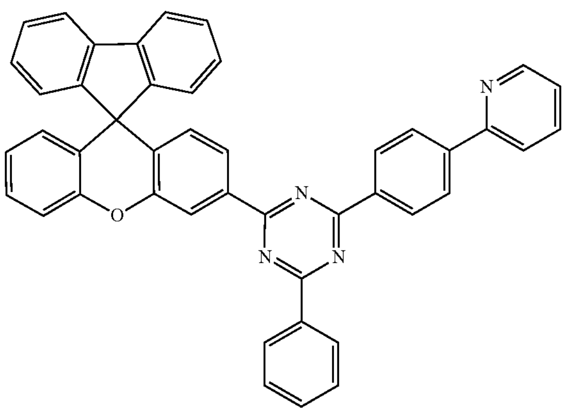
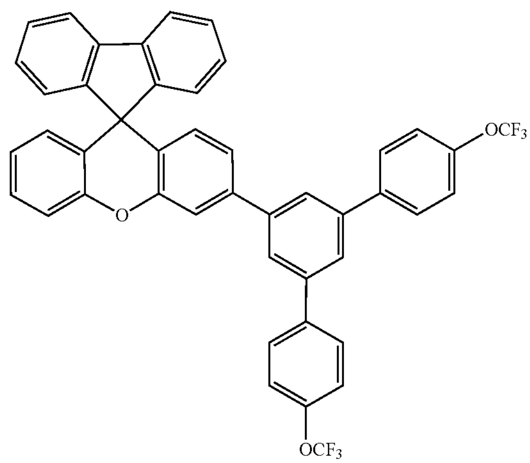
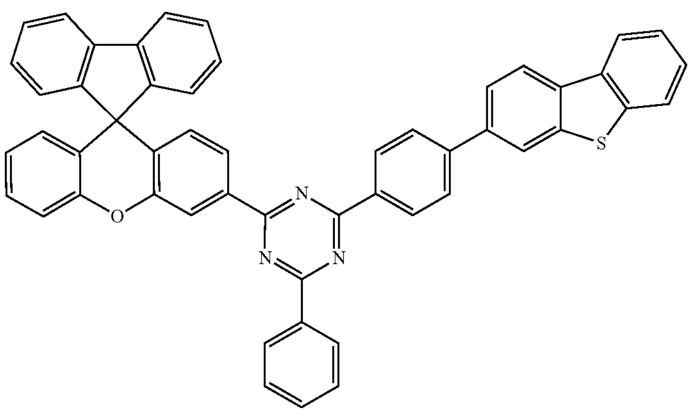

-continued
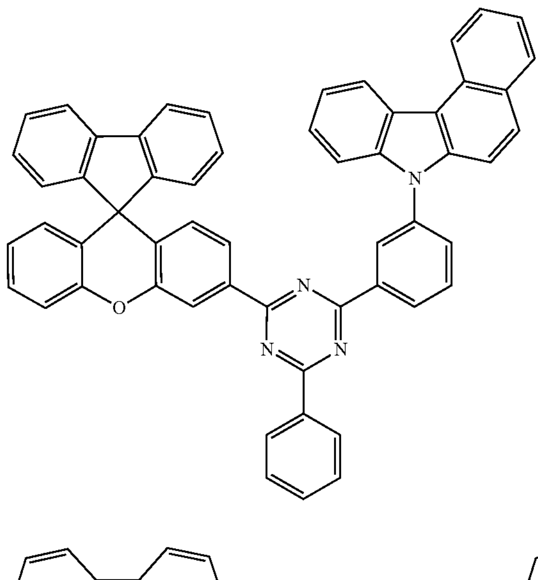
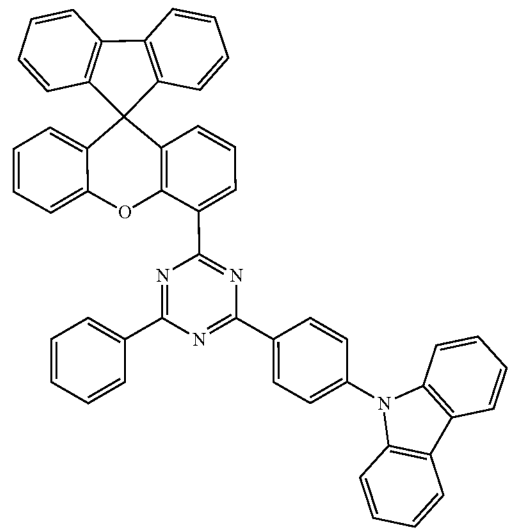
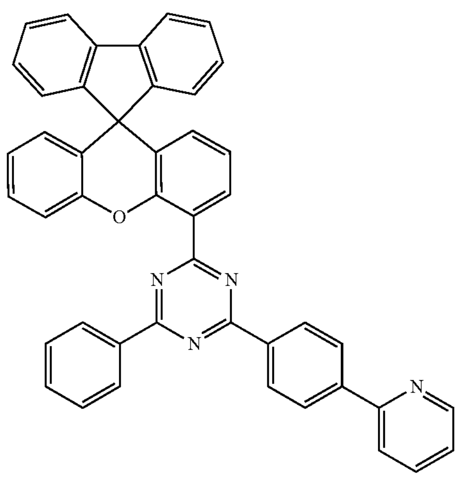
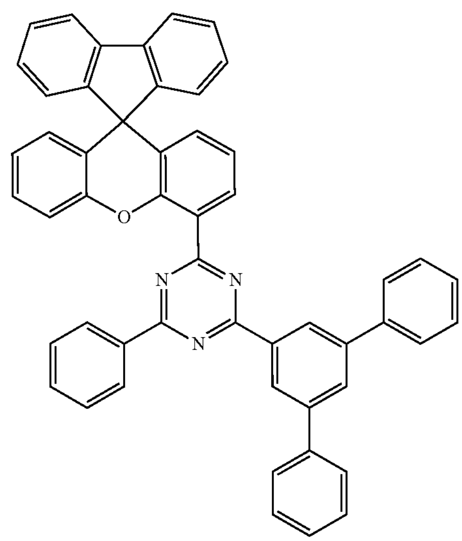
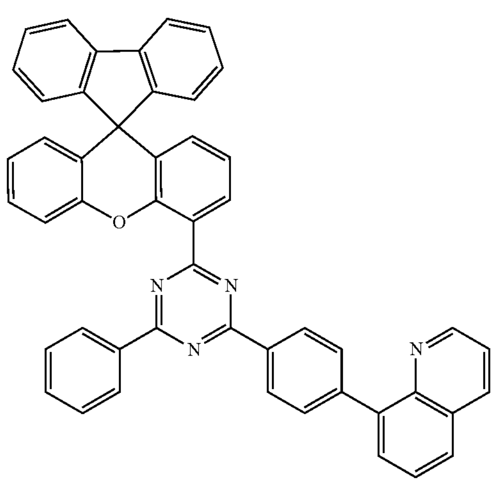
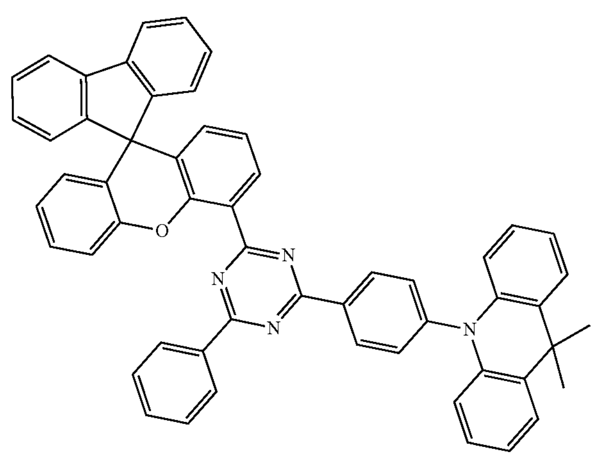

-continued
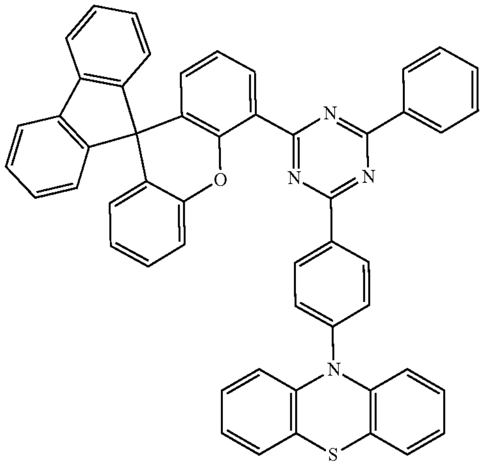
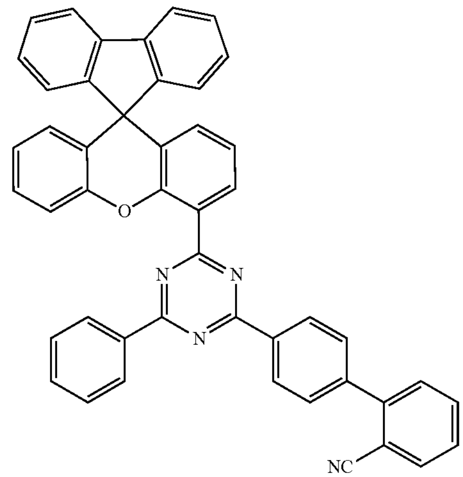
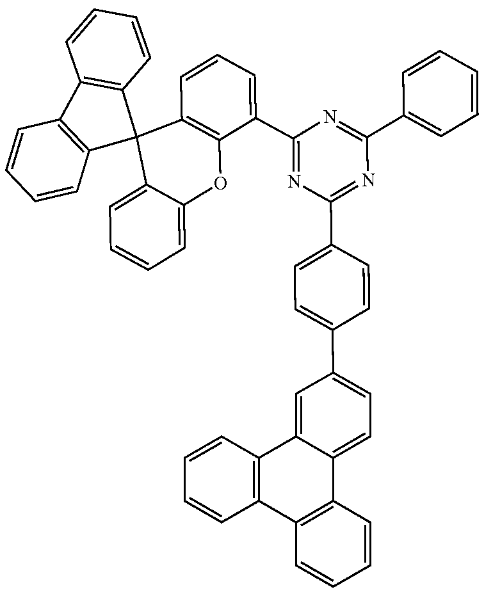
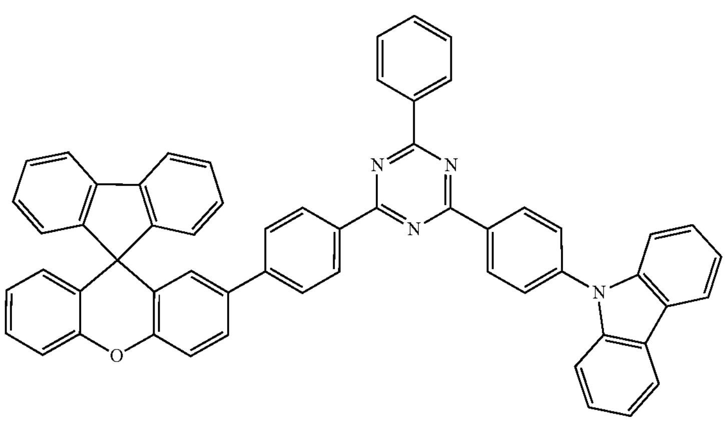

-continued
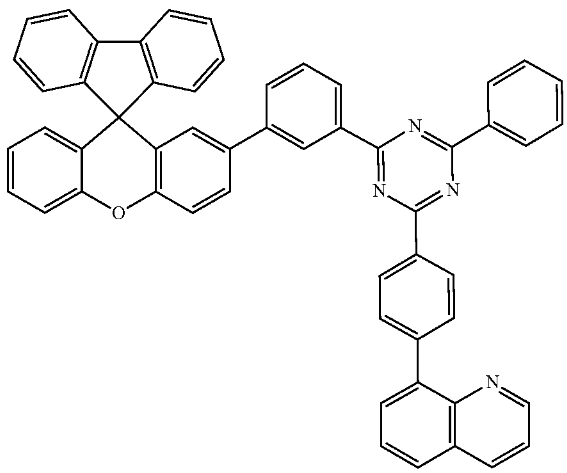
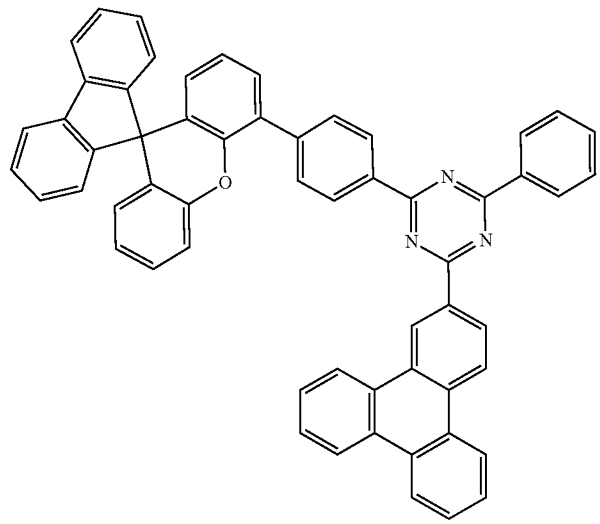
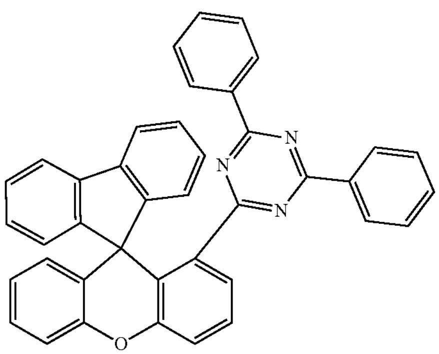
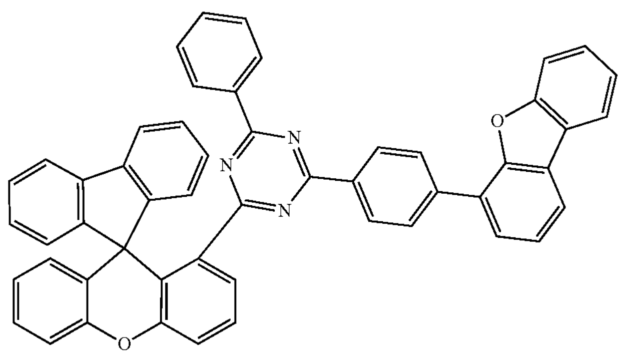
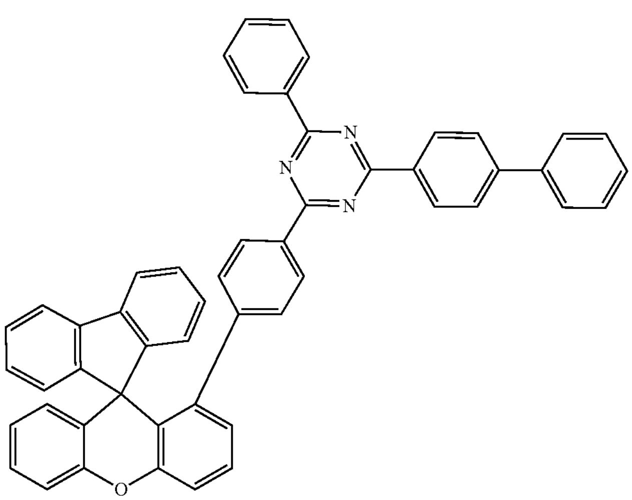

-continued
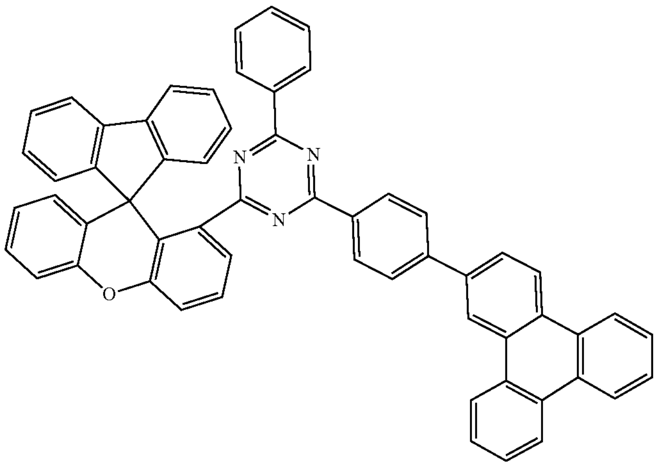
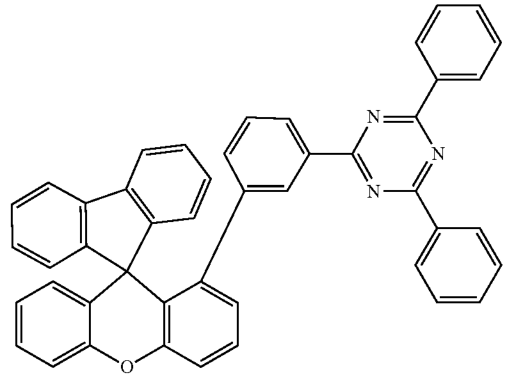
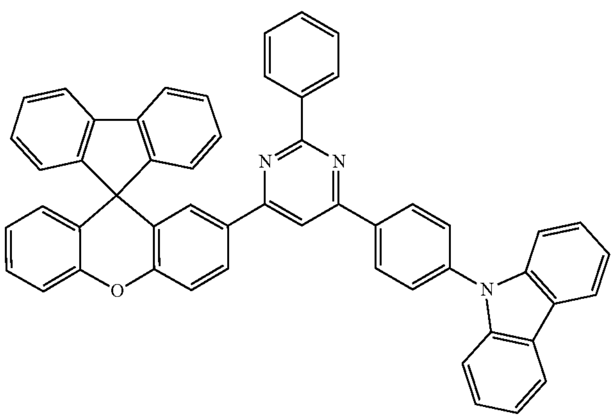
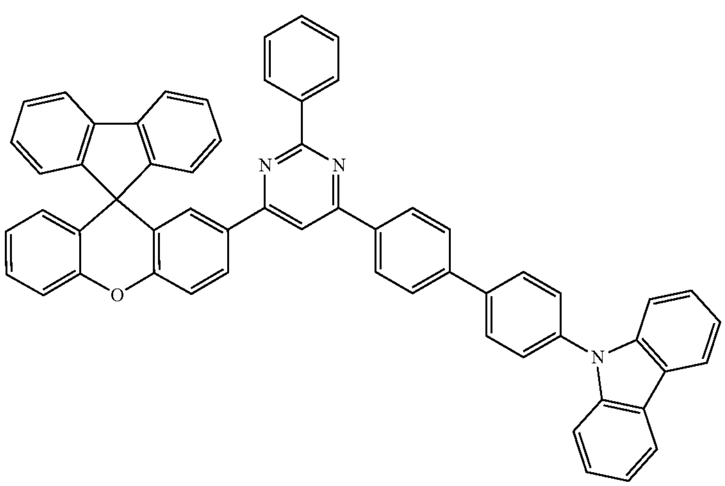

-continued
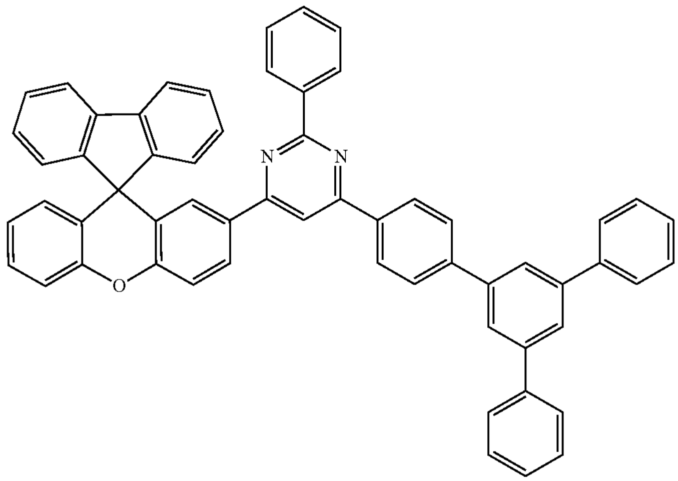
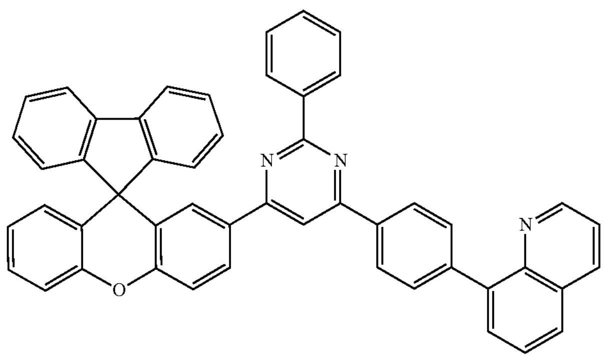
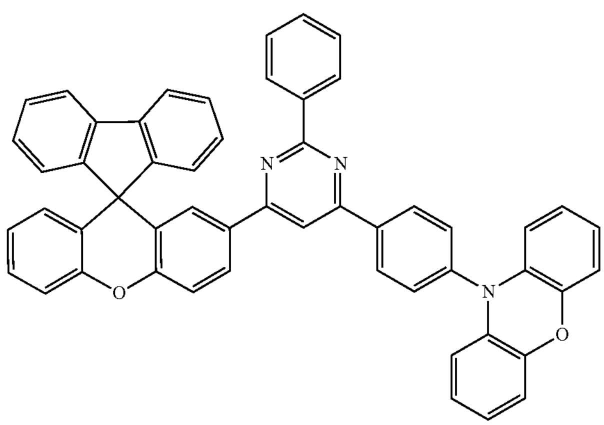
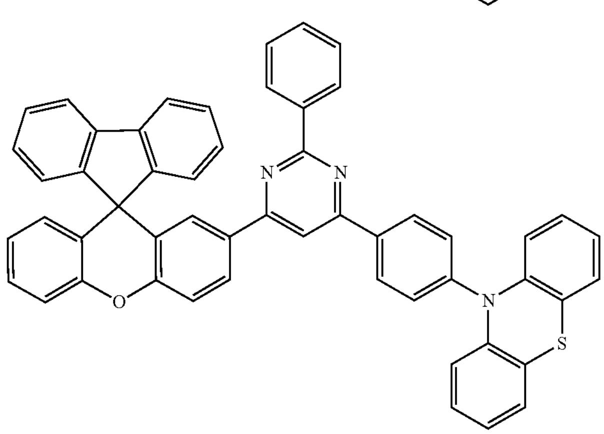

-continued
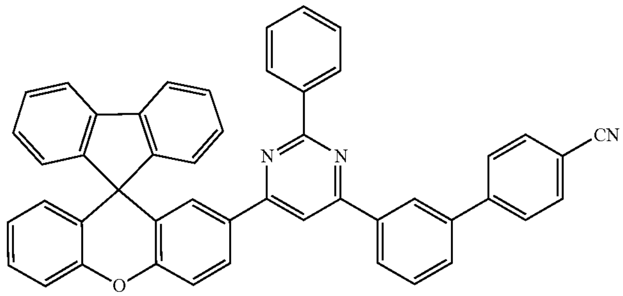
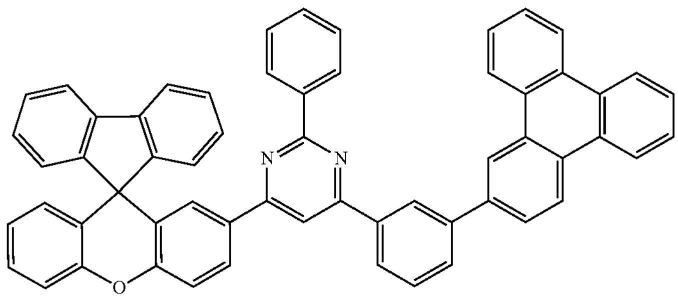
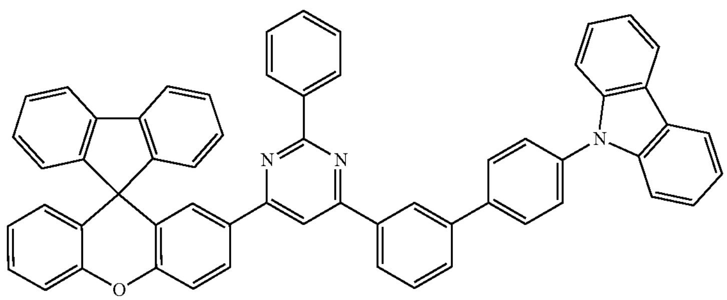
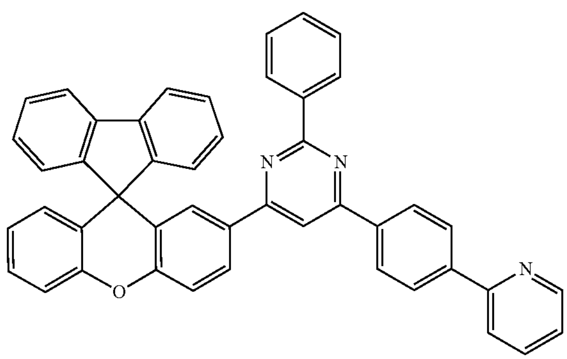
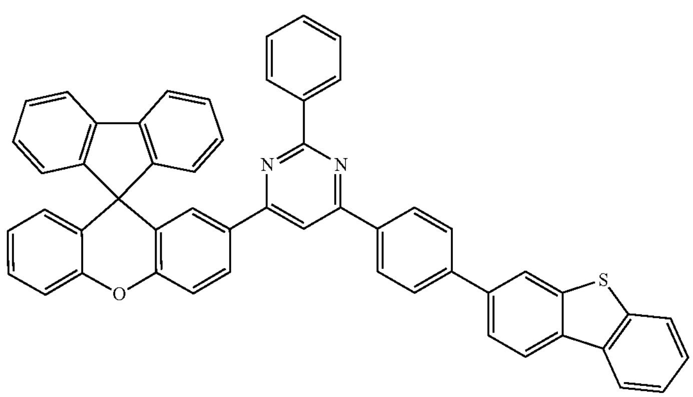

-continued
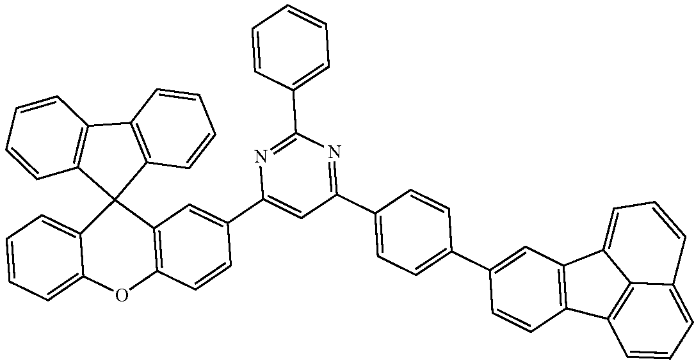
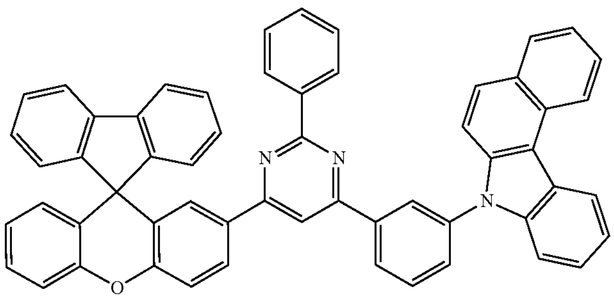
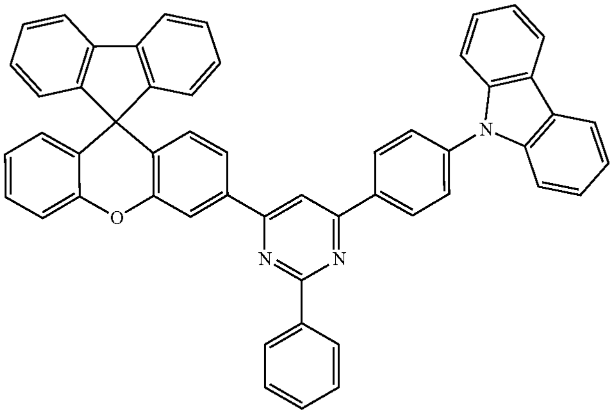
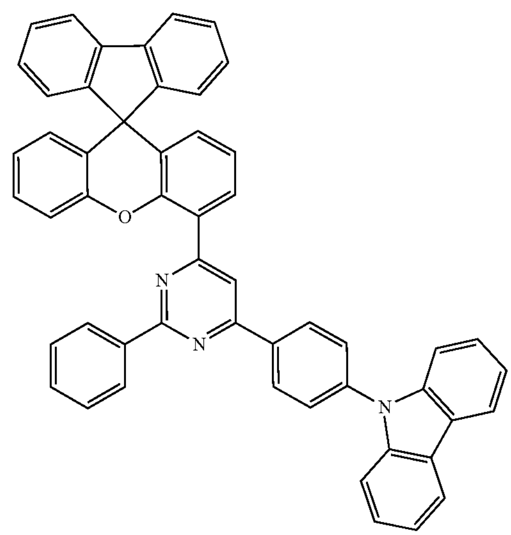
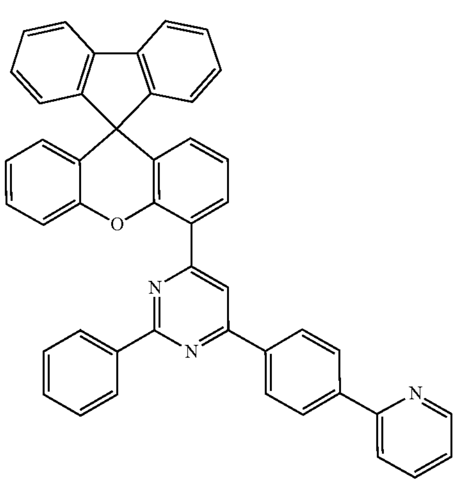
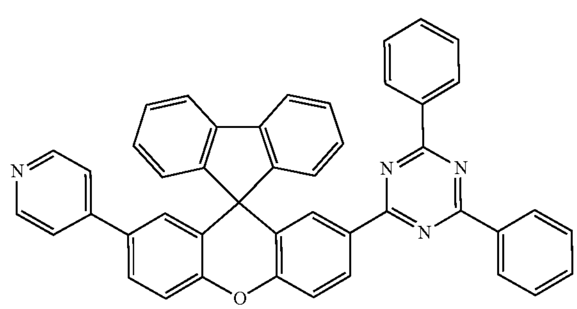

-continued
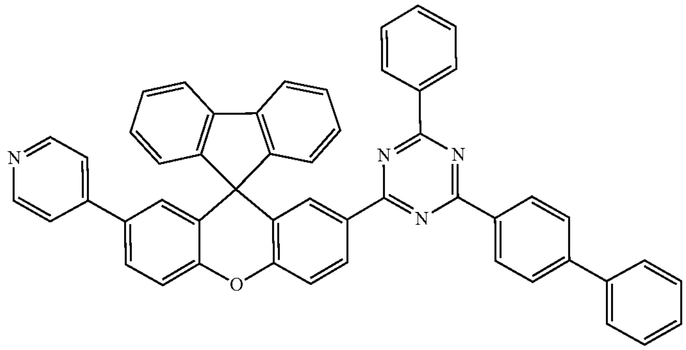
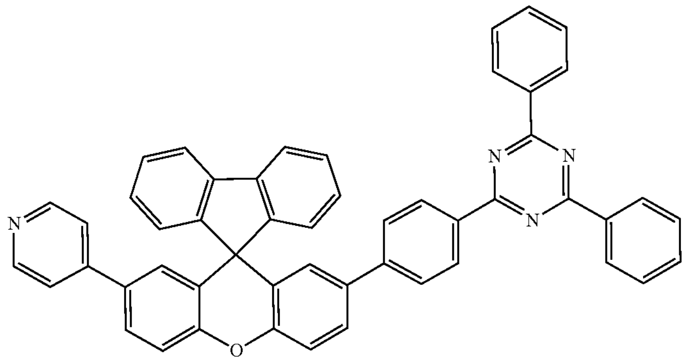
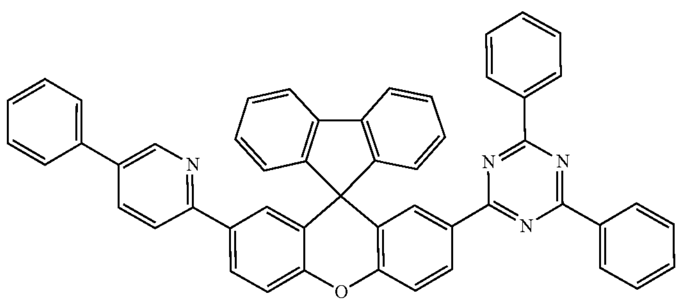
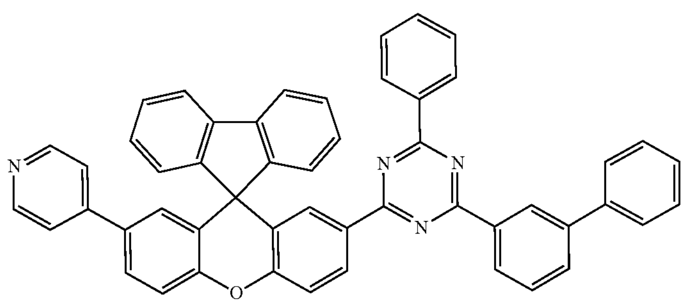
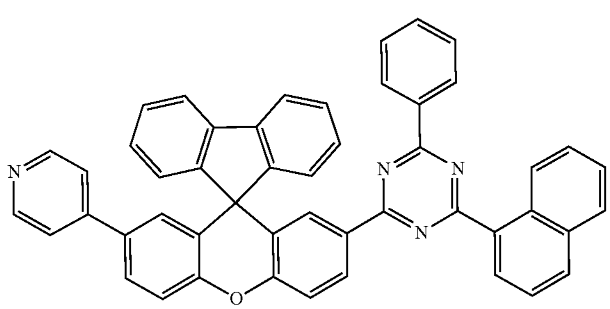

-continued
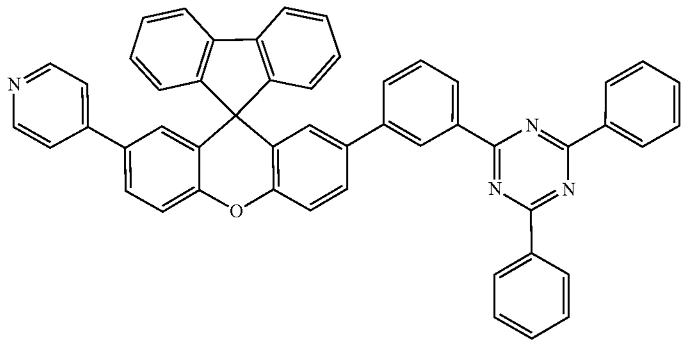
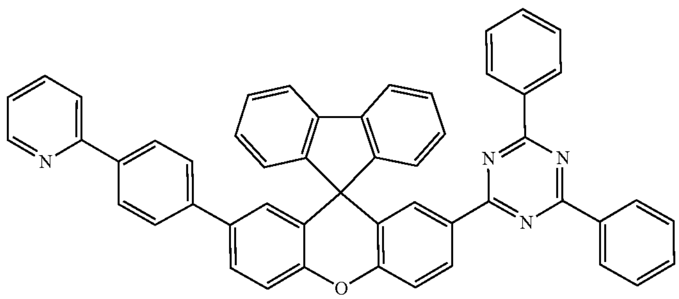
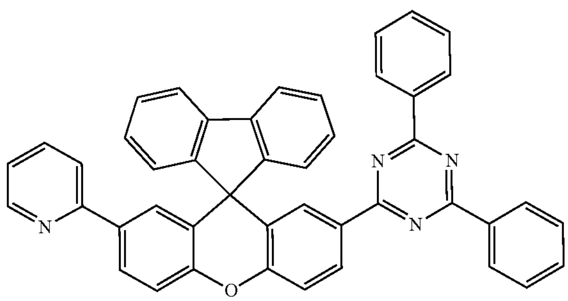
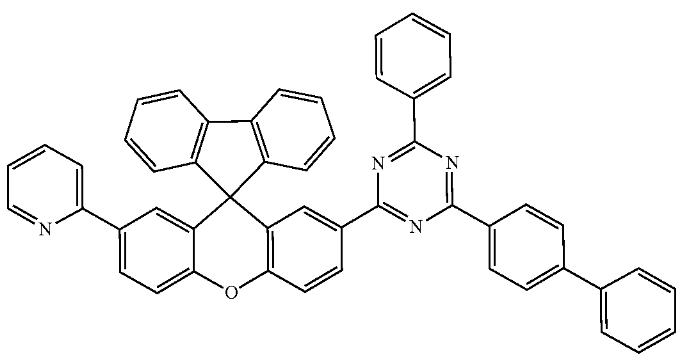
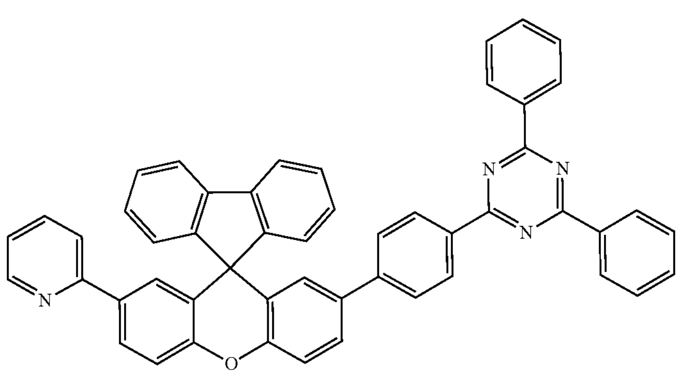

-continued
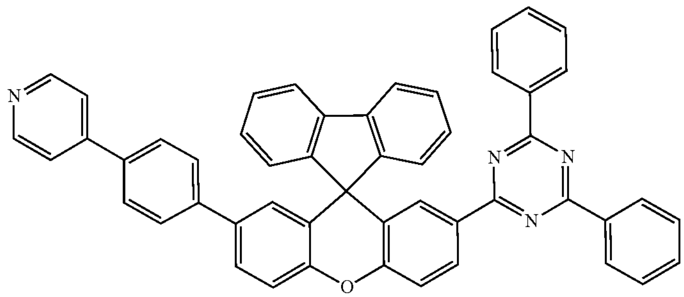
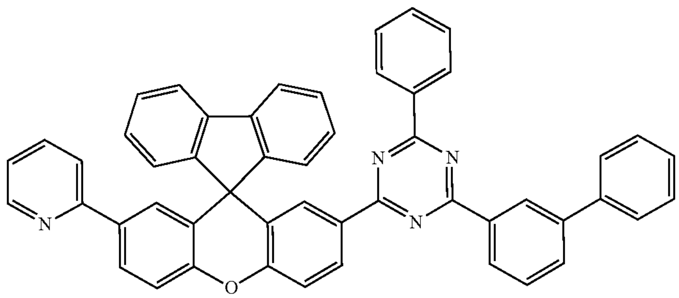
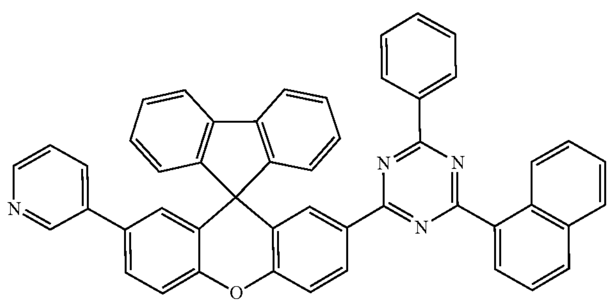
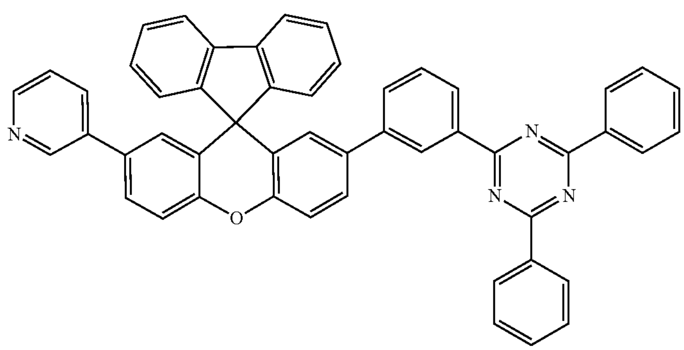
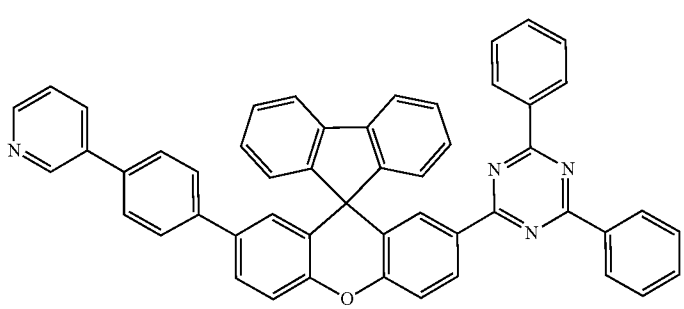

-continued
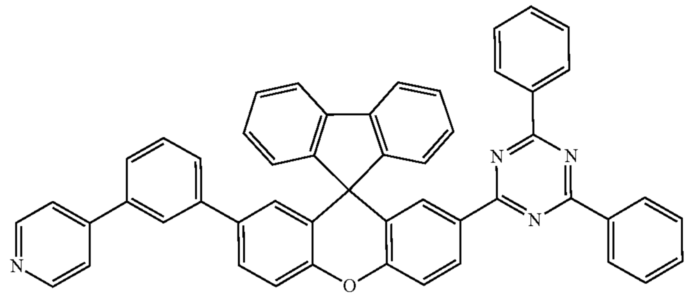
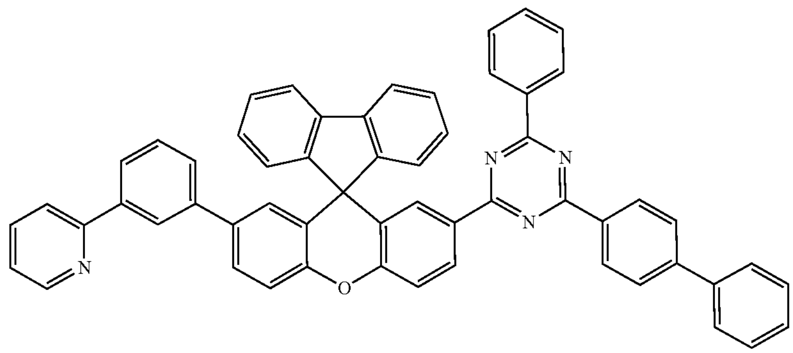
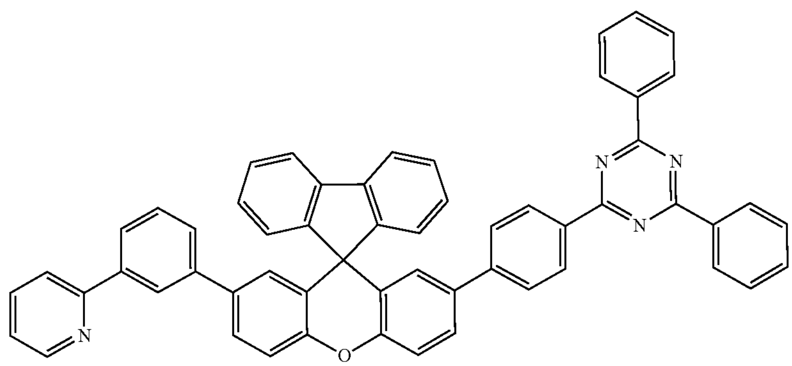
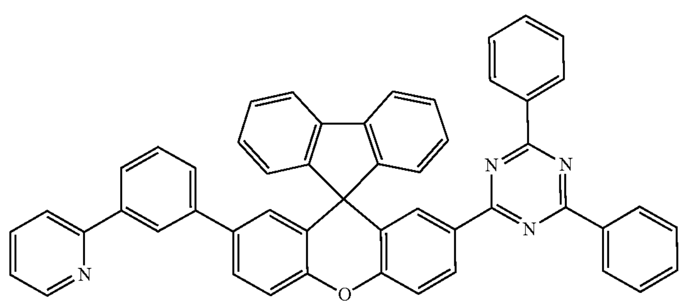
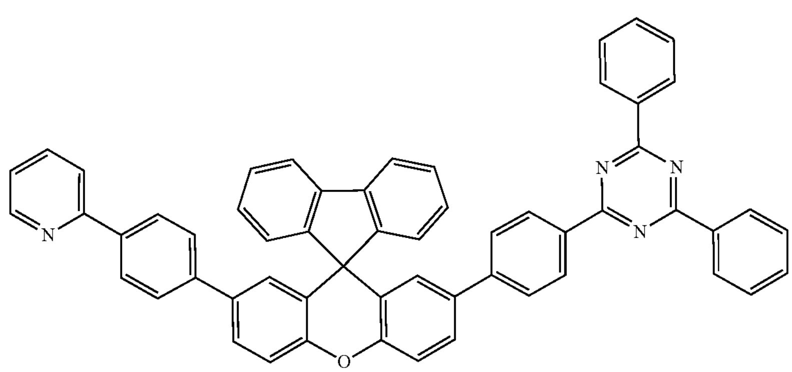

-continued
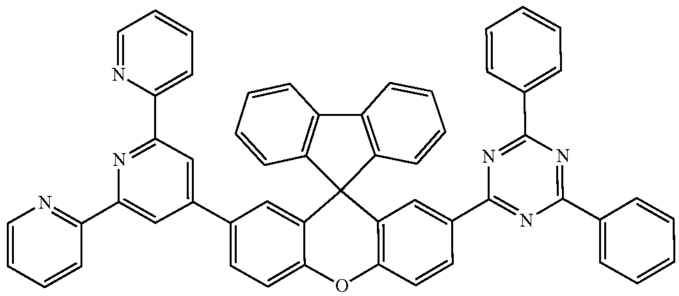
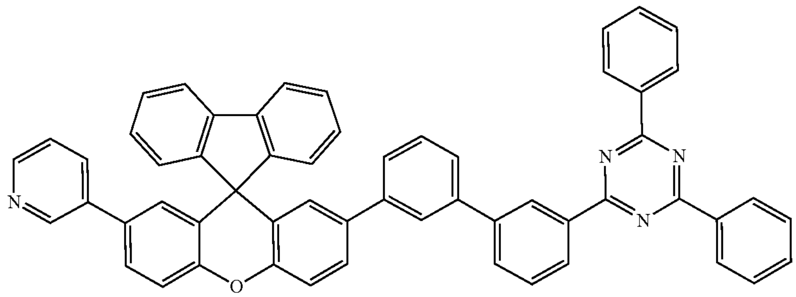
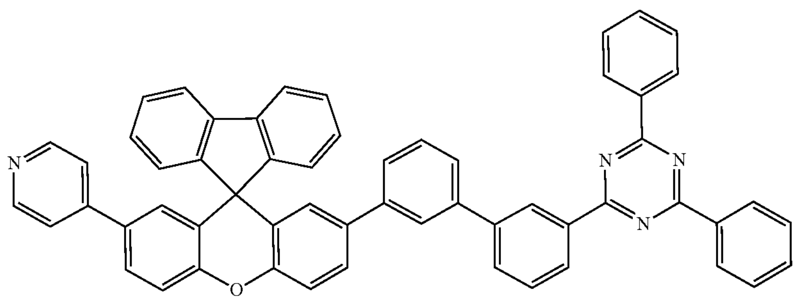
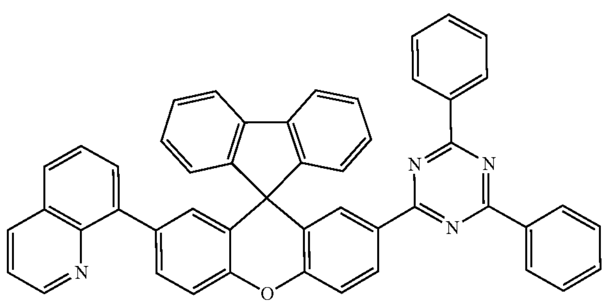
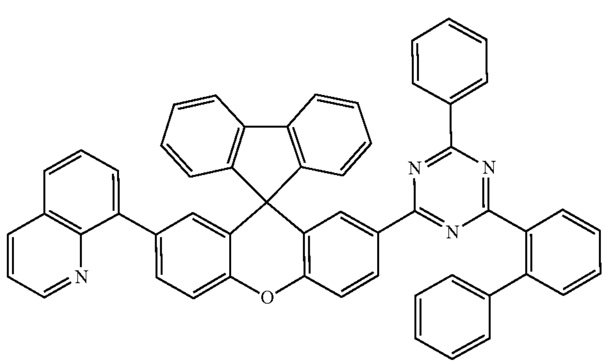

-continued
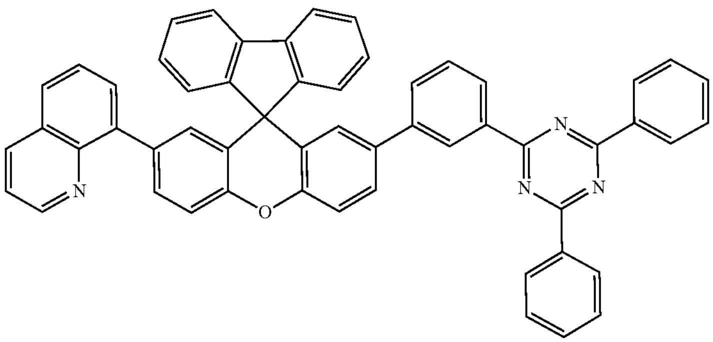
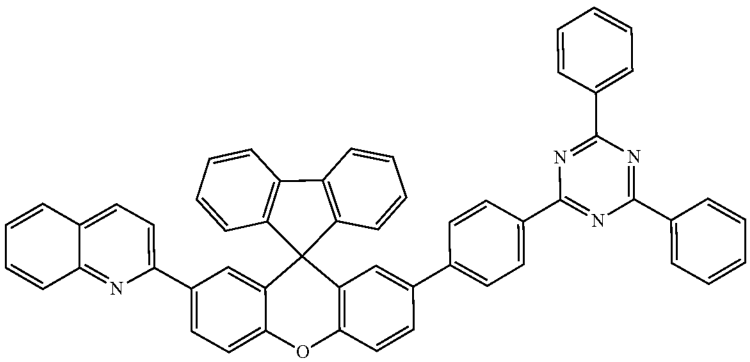
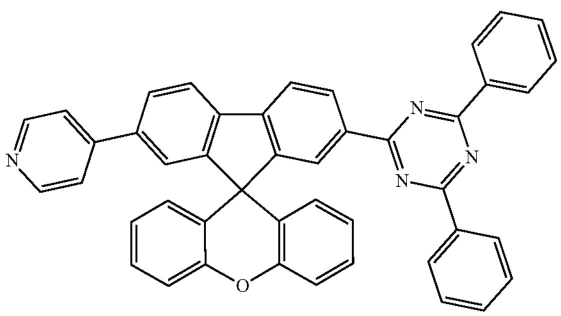
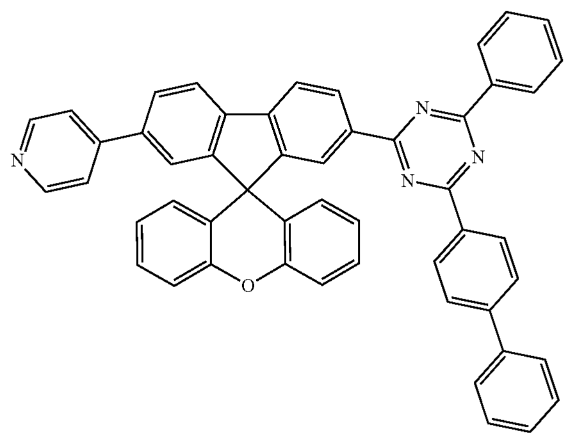
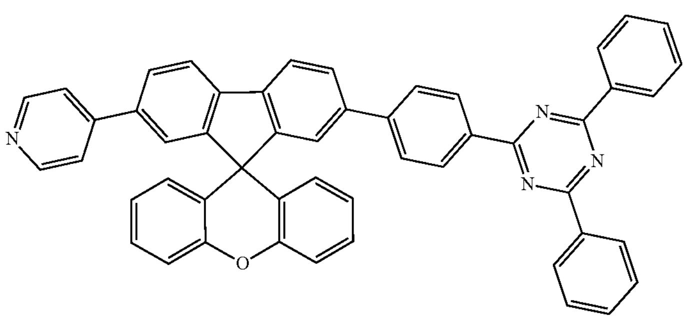

-continued
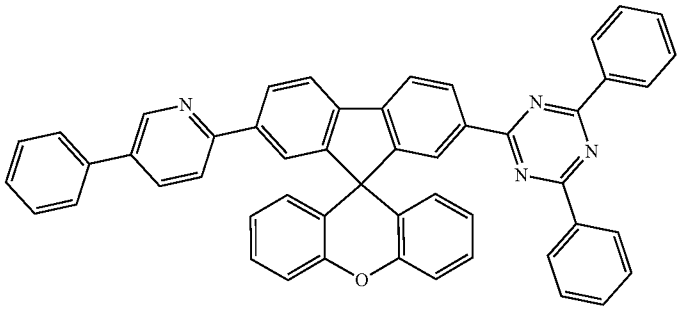
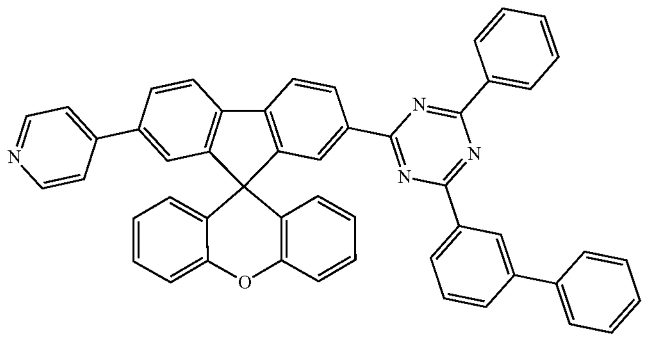
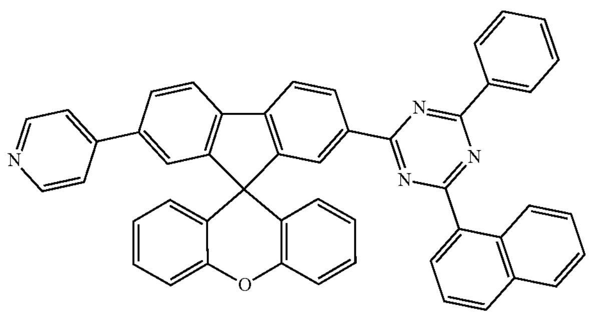
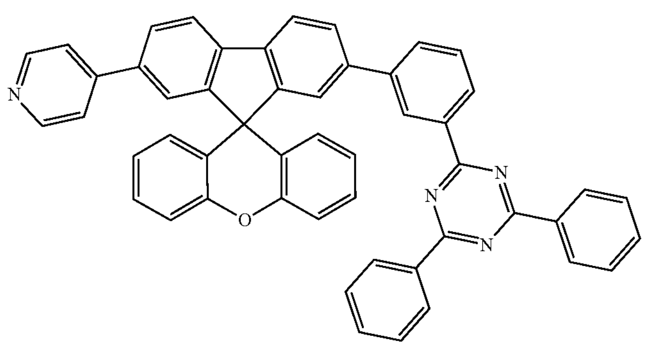
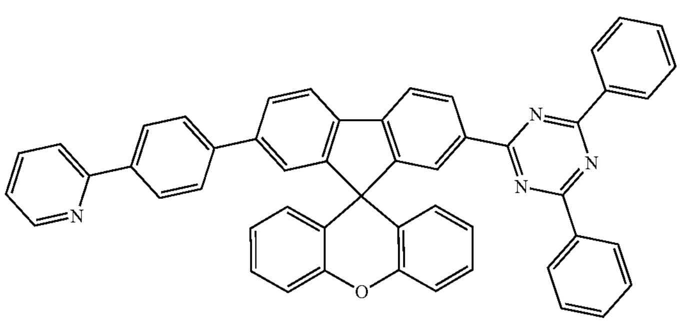

-continued
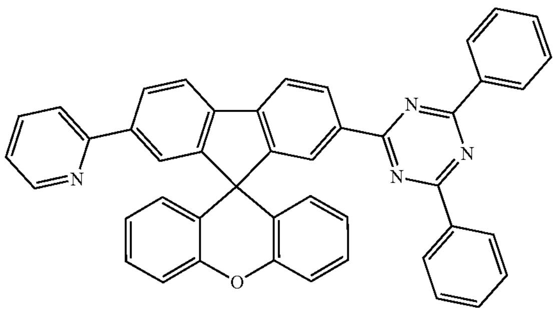
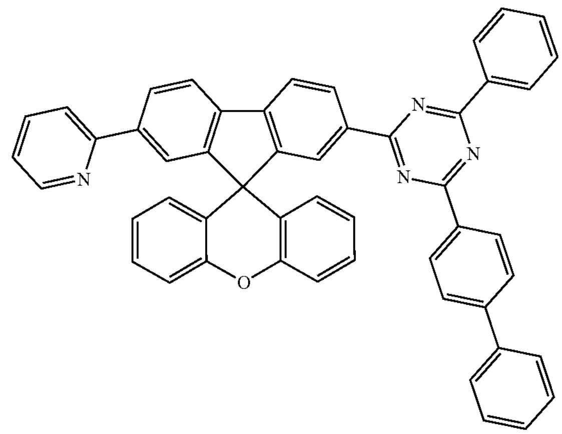
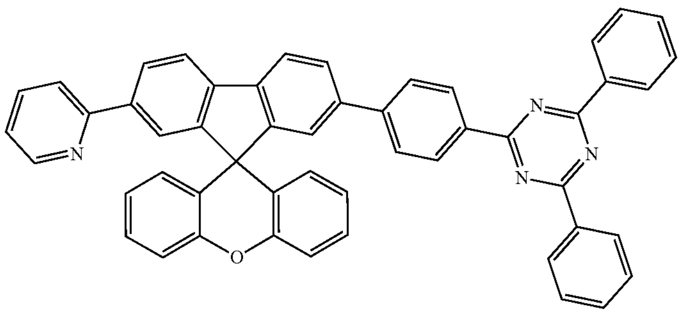
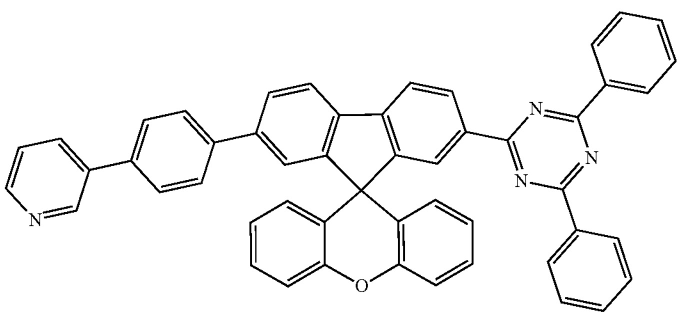
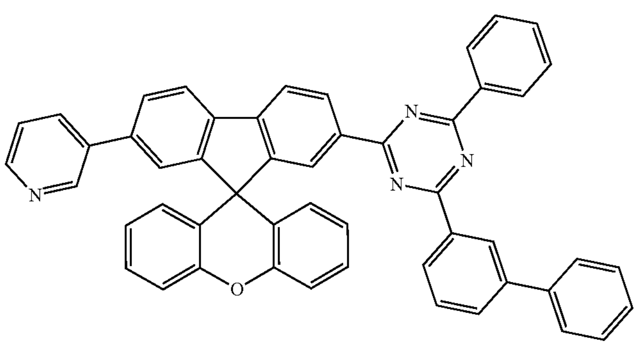
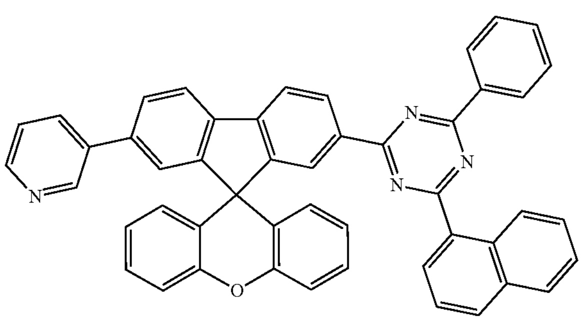

-continued
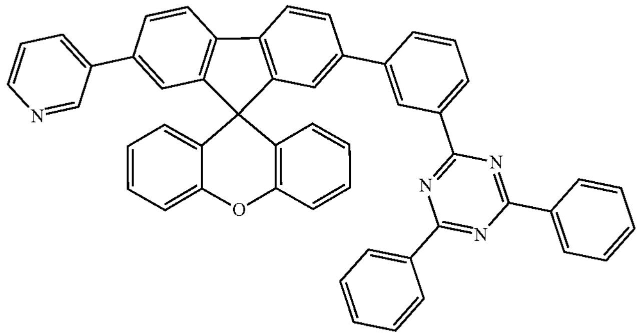
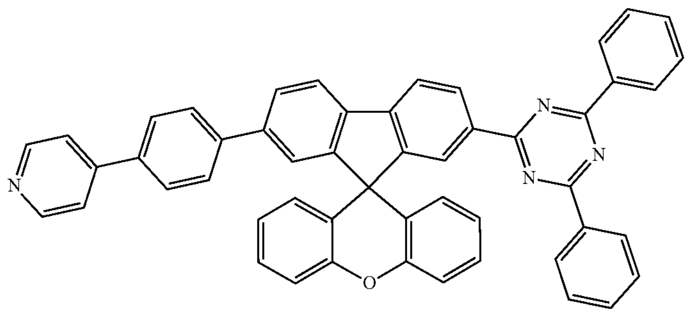
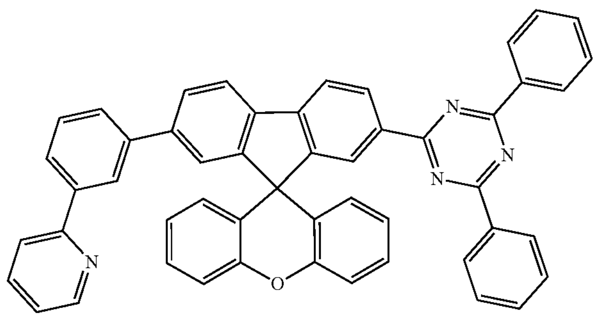
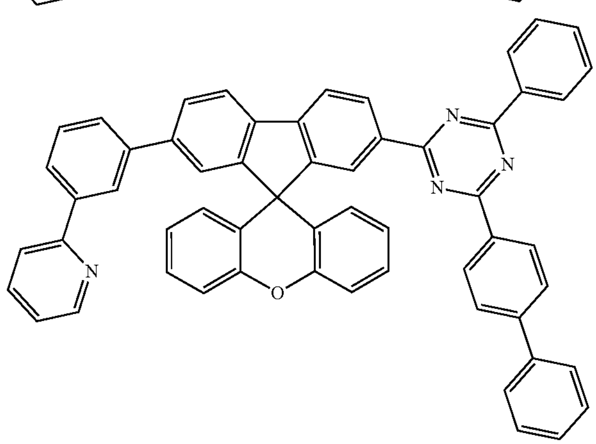
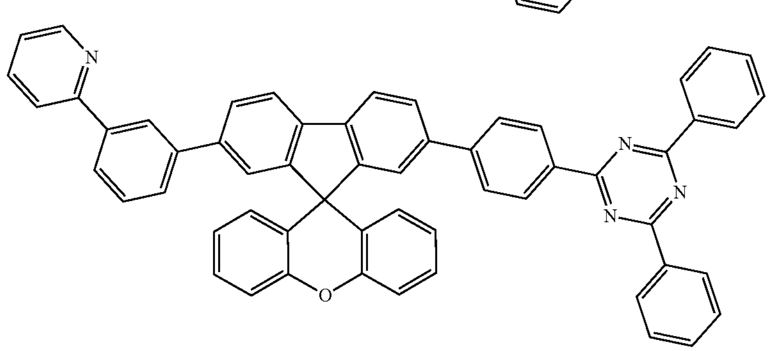

-continued
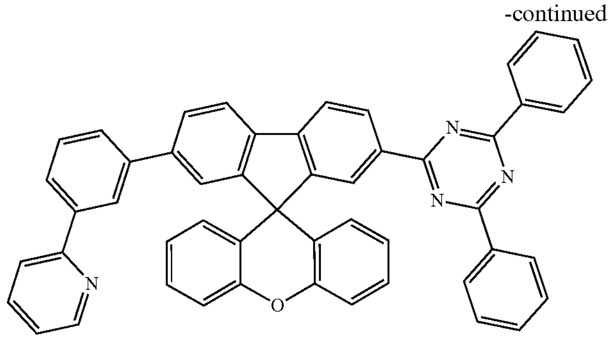
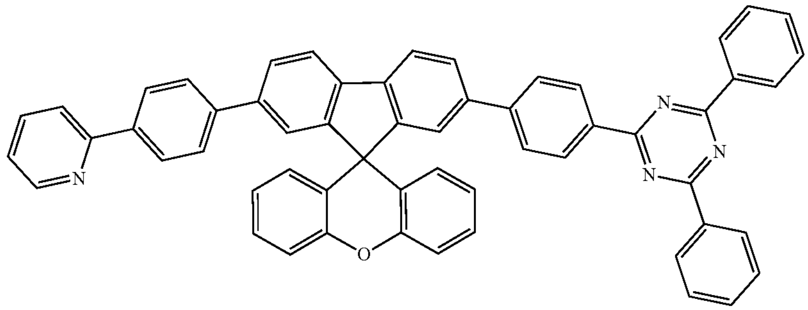
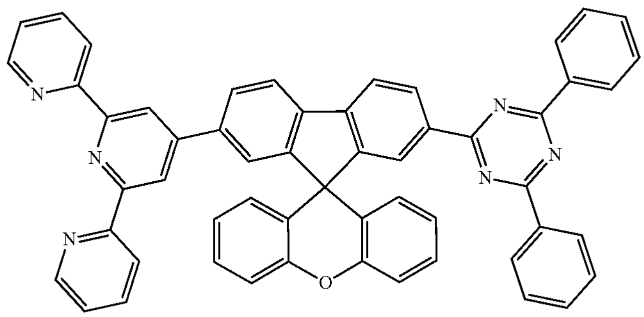
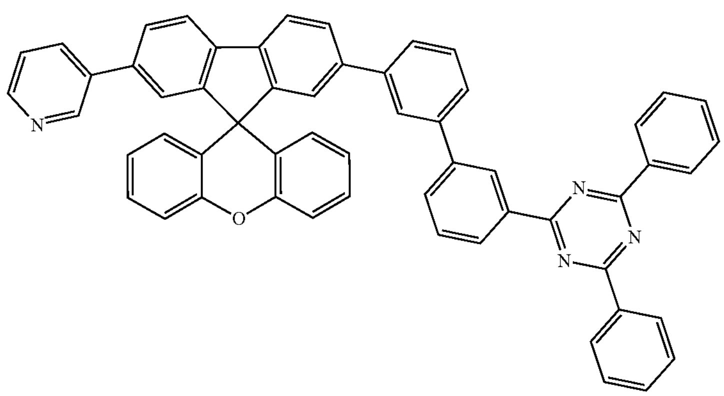
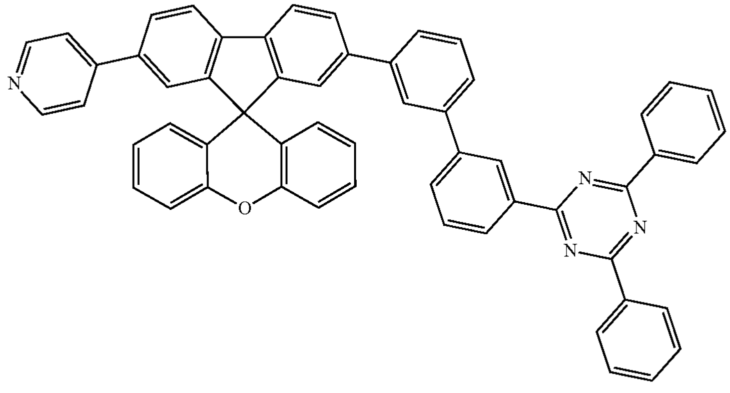

-continued
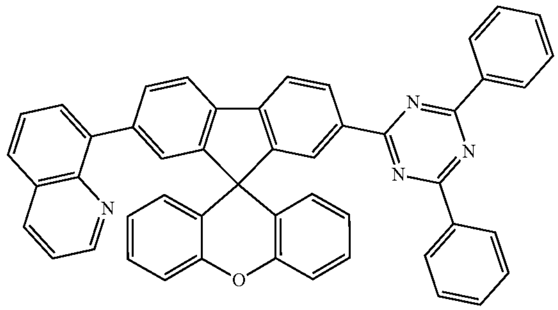
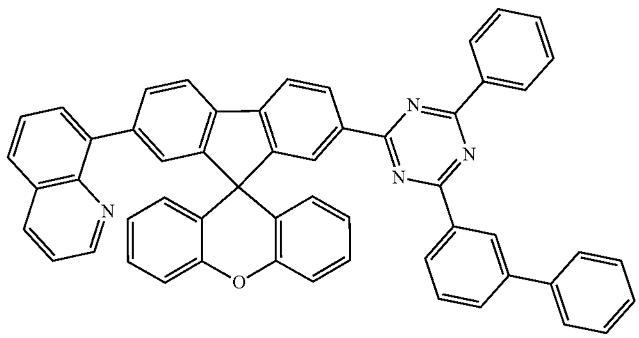
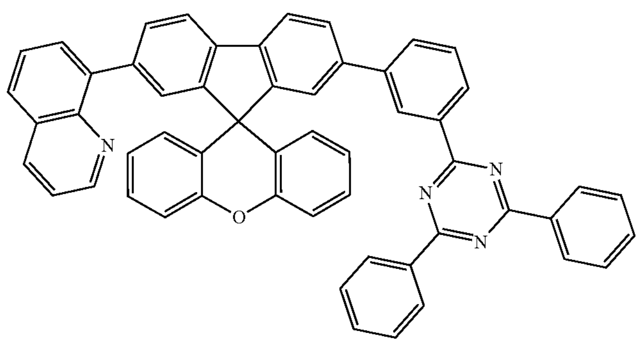
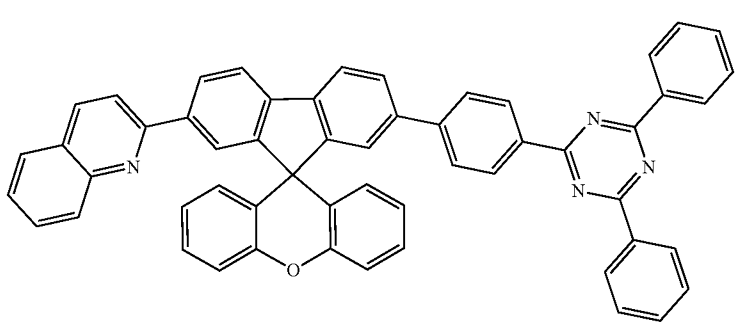

-continued
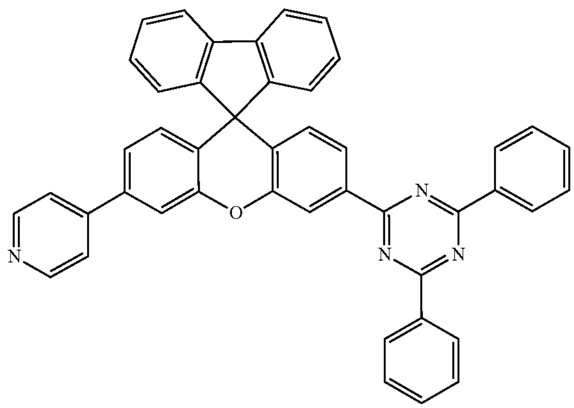
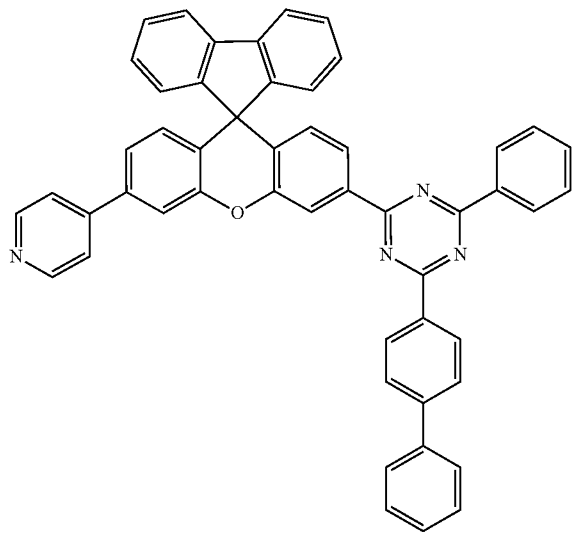
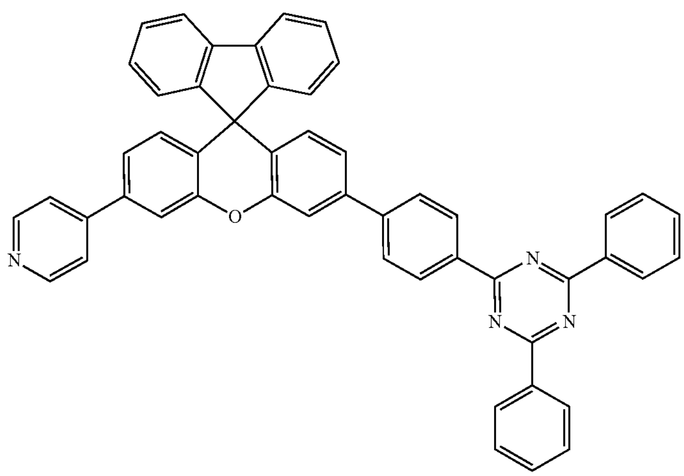
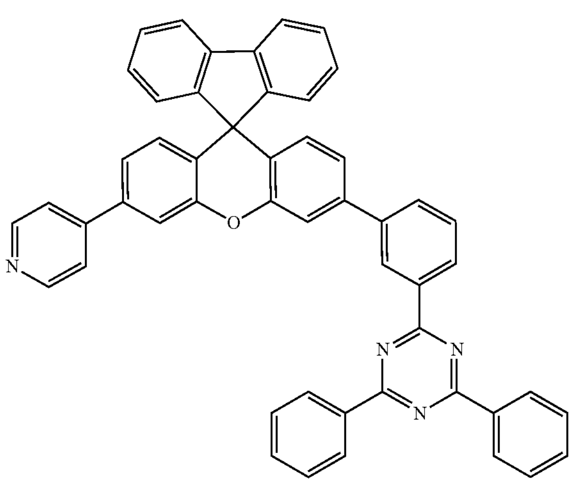
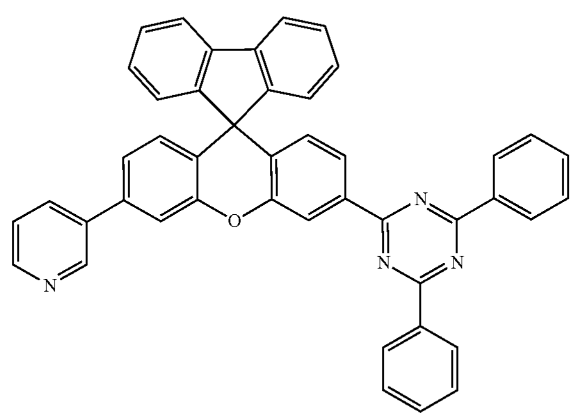

-continued
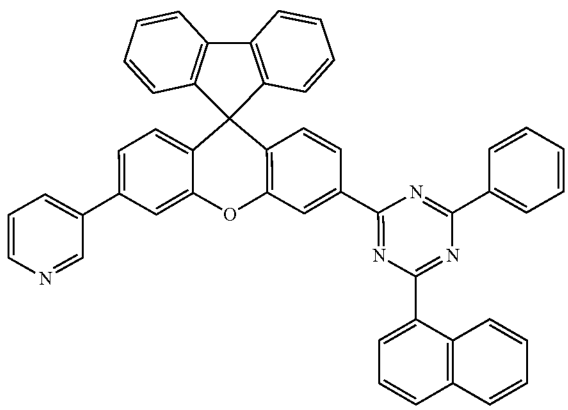
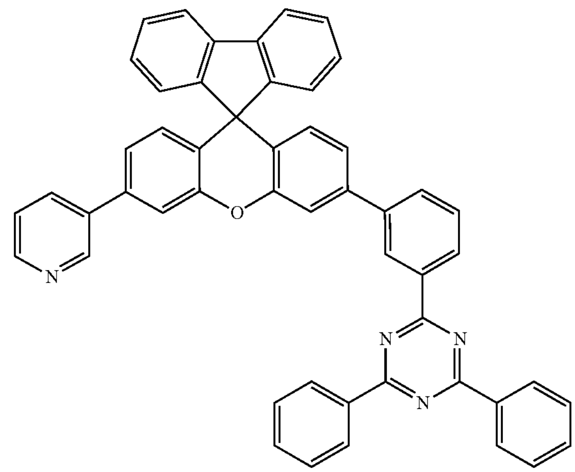
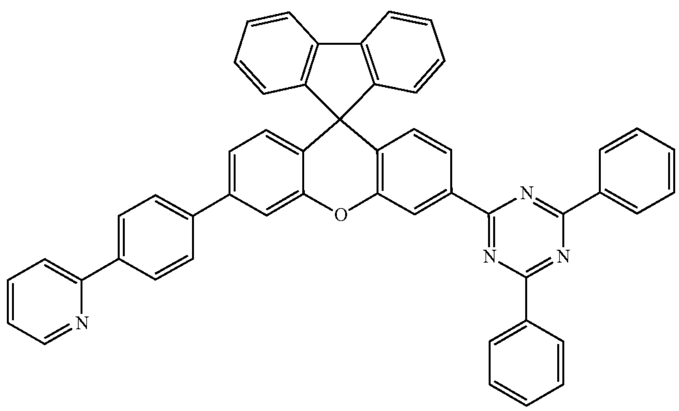
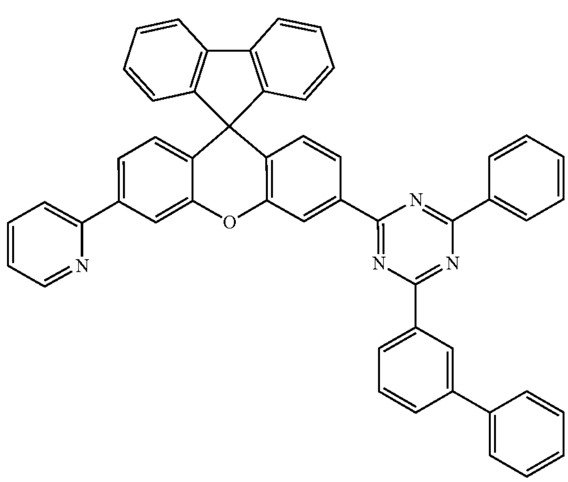
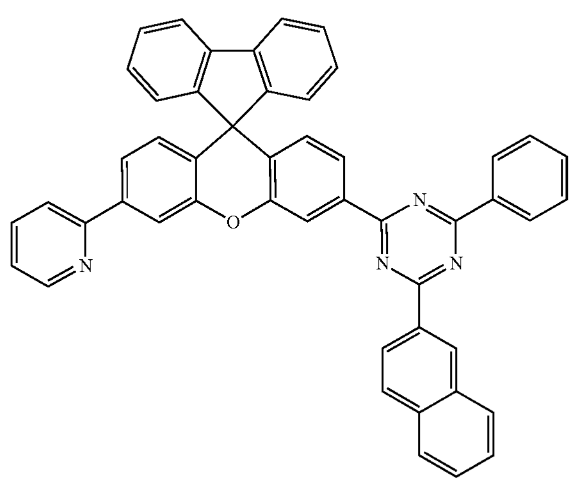

-continued
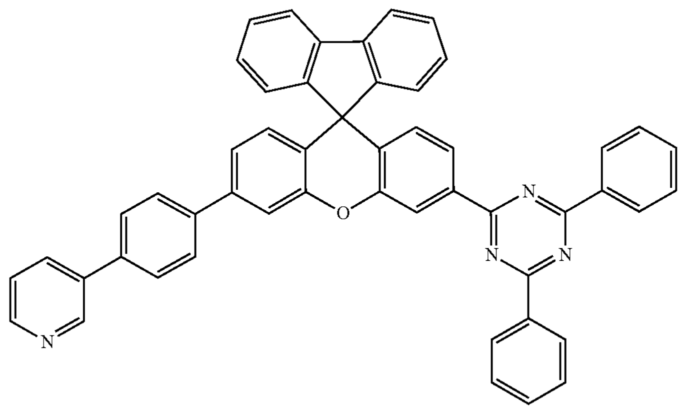
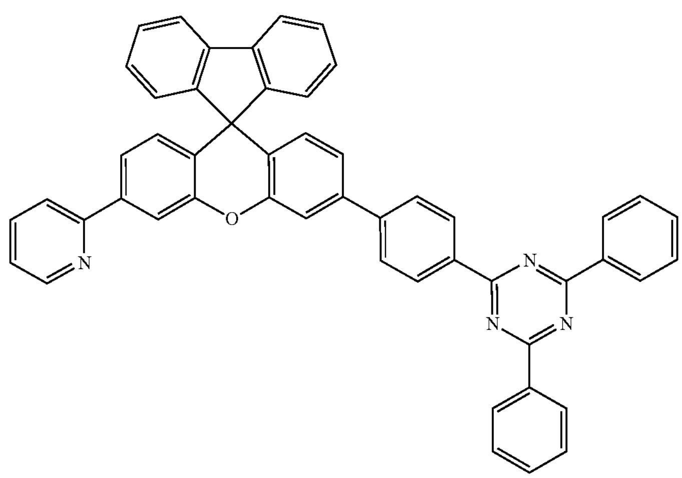
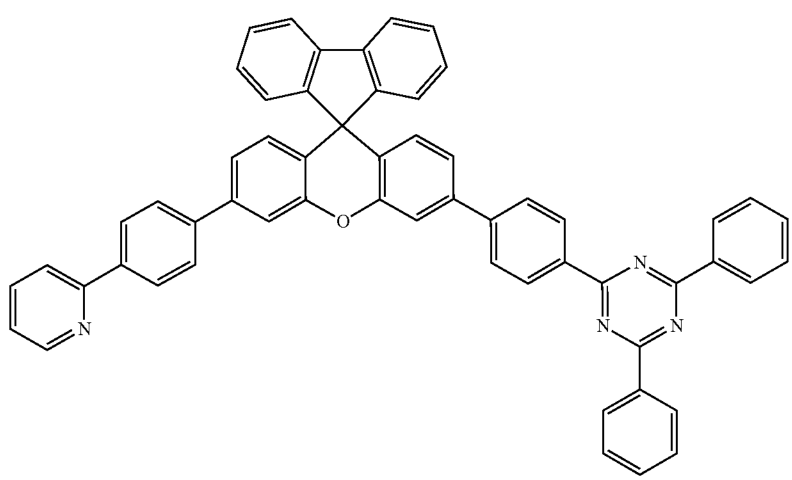

-continued
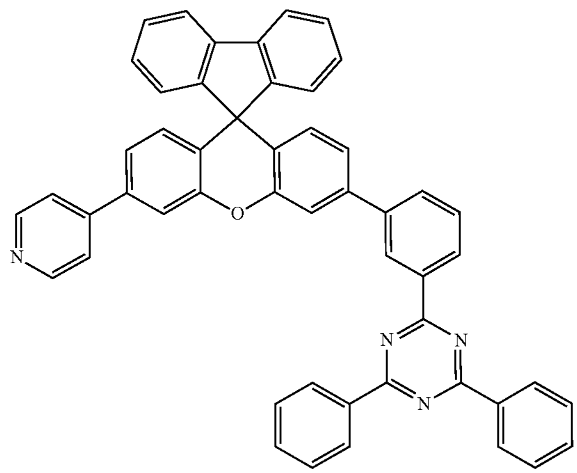
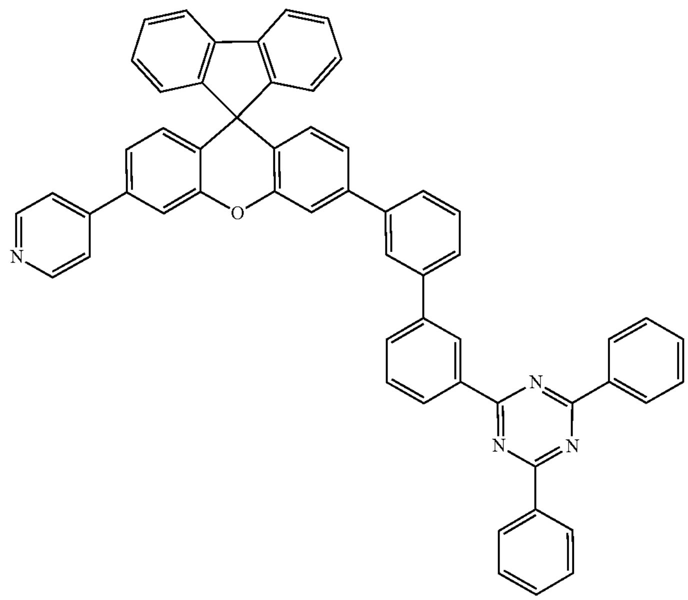
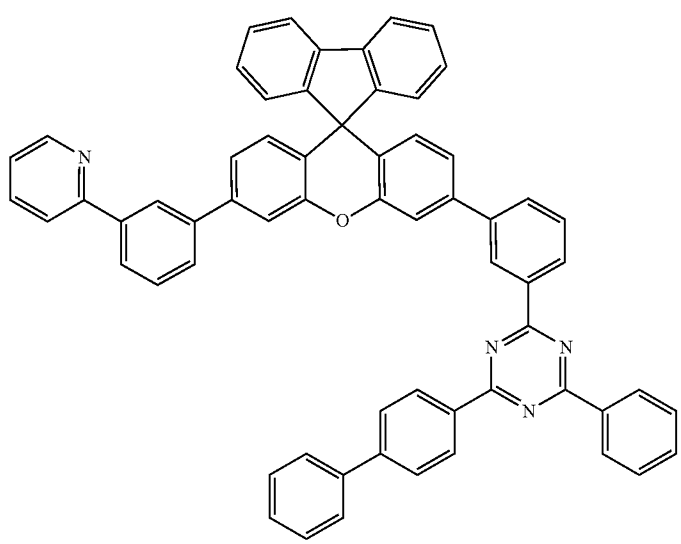

-continued
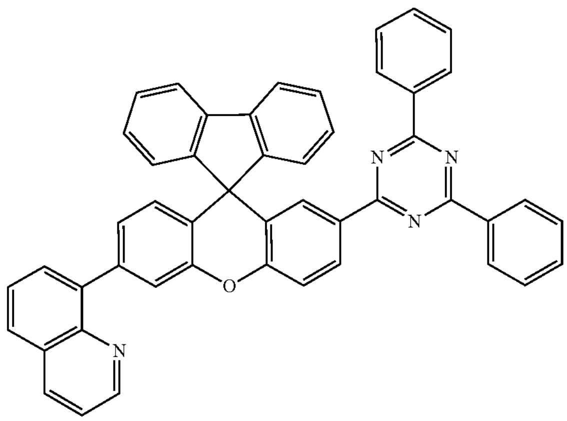
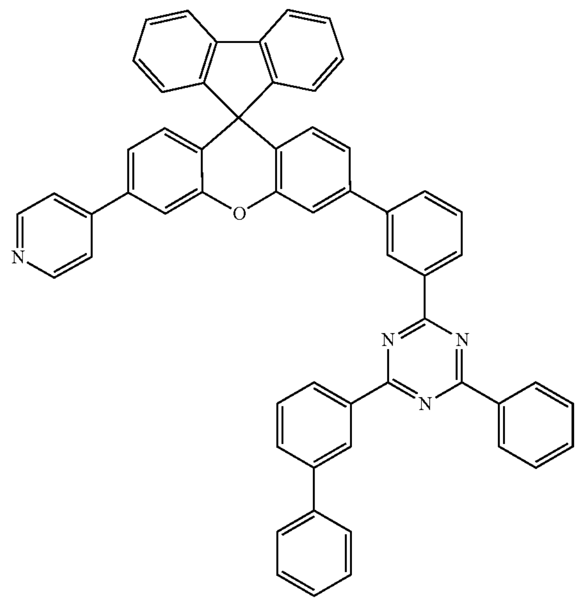
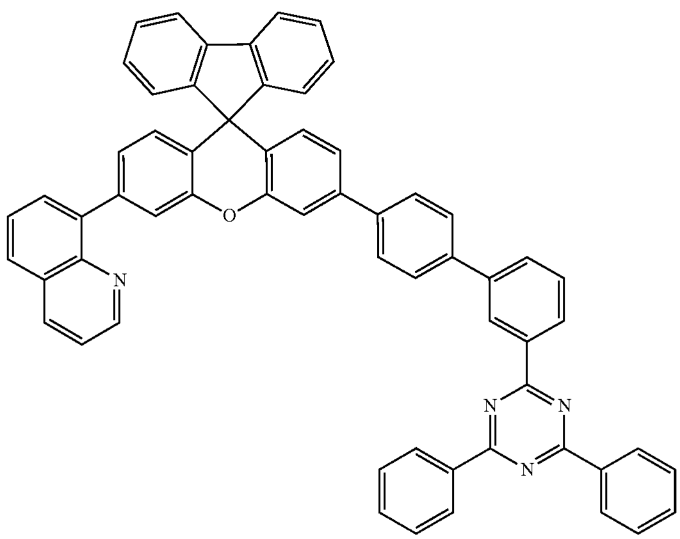
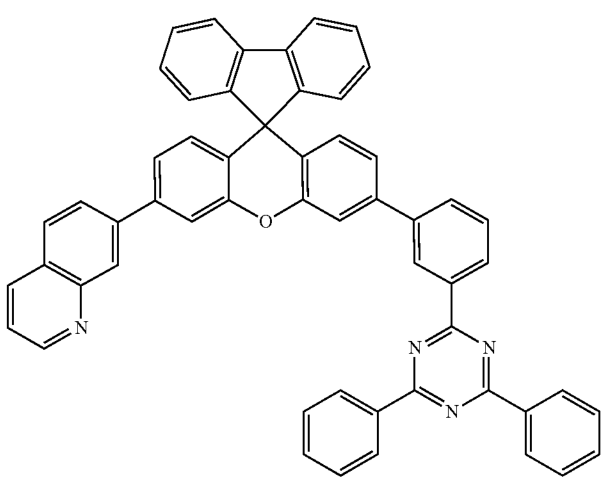
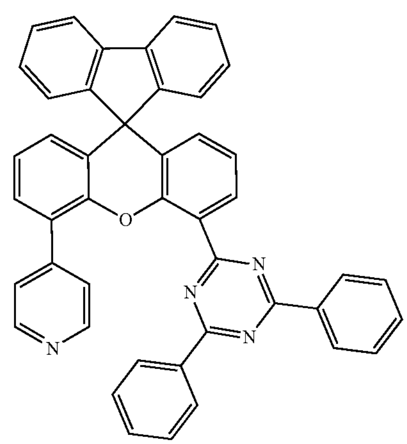

-continued
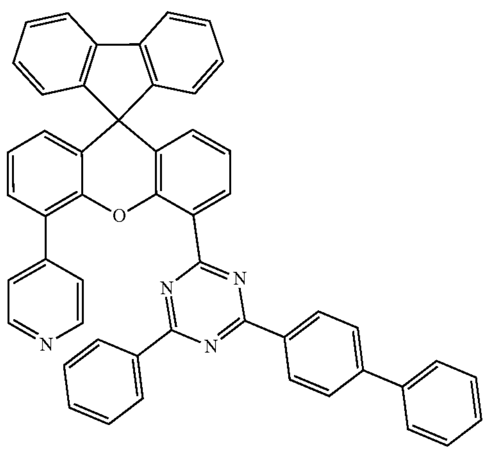
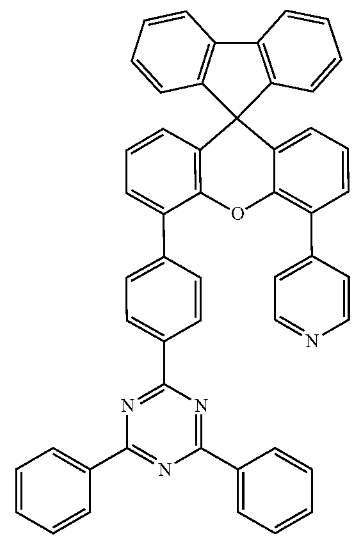
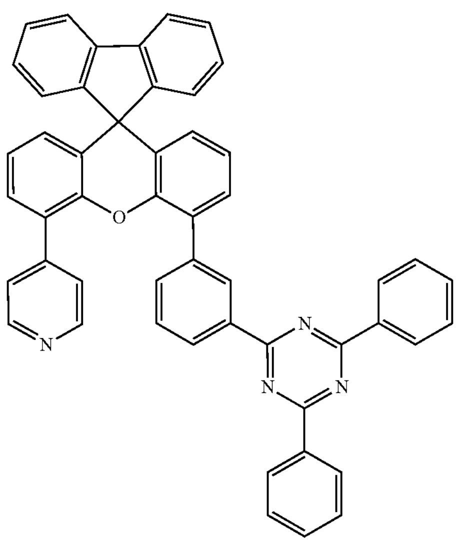
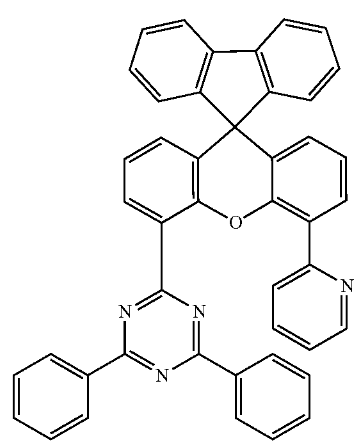
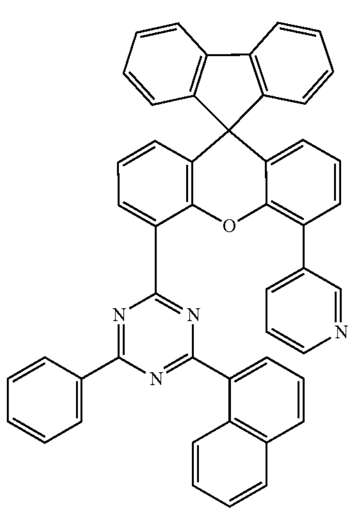
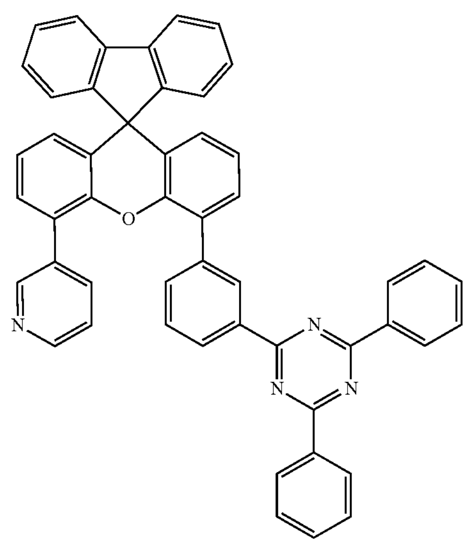

-continued
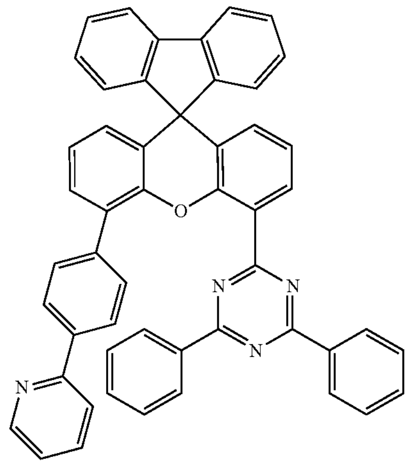
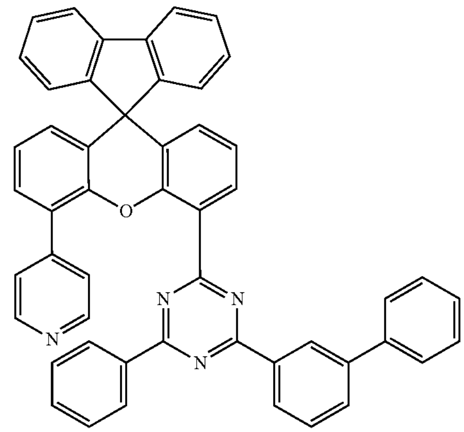
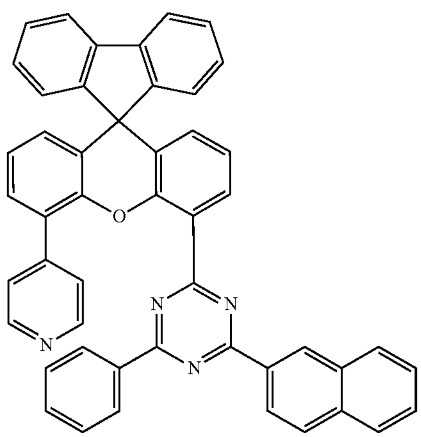
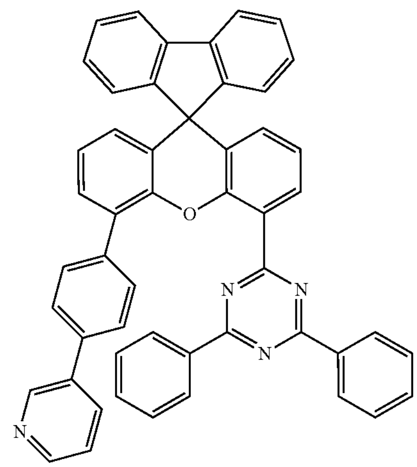
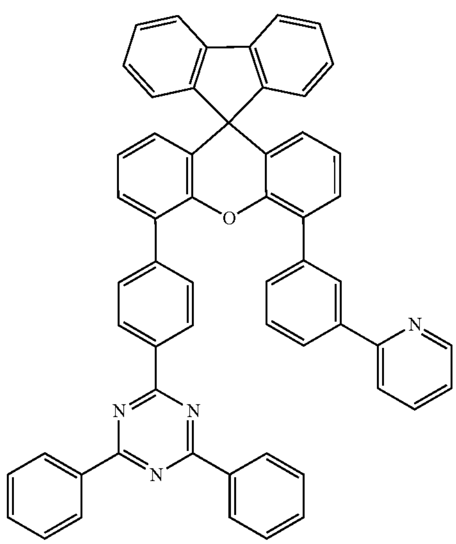
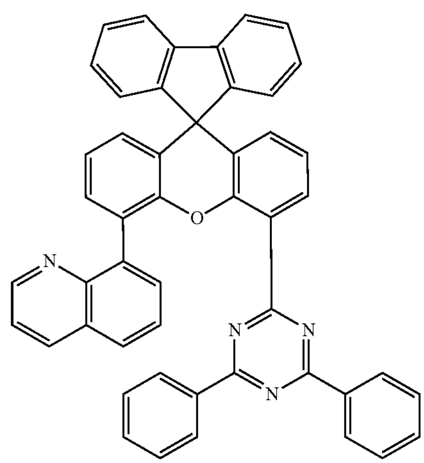

-continued
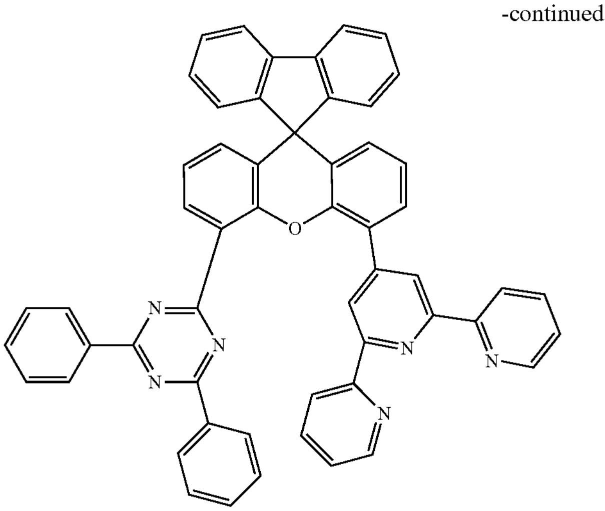
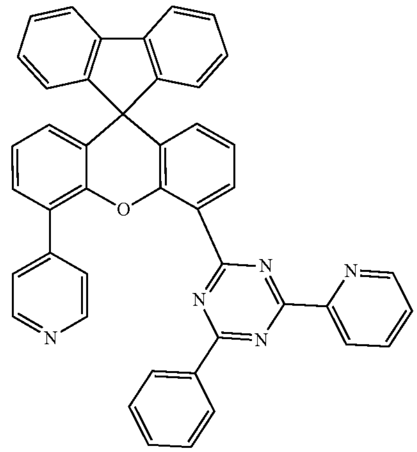
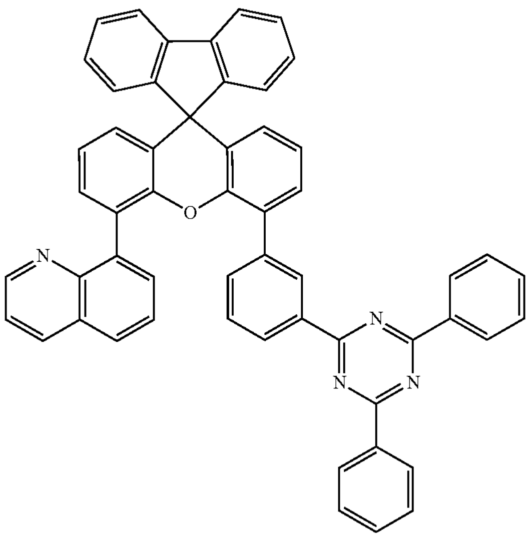
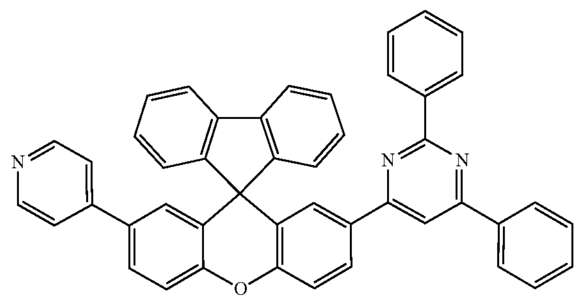
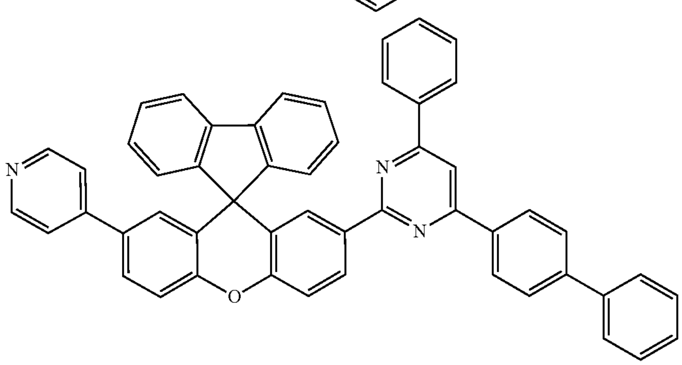
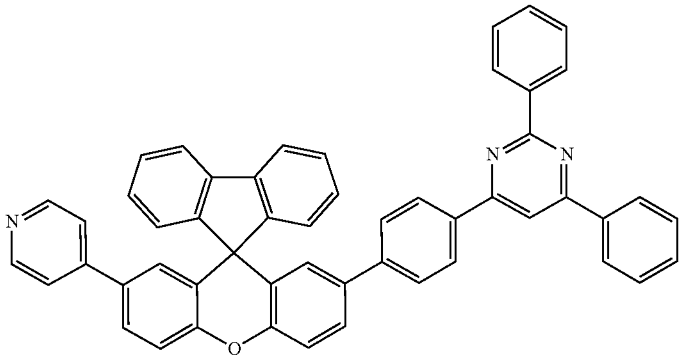

-continued
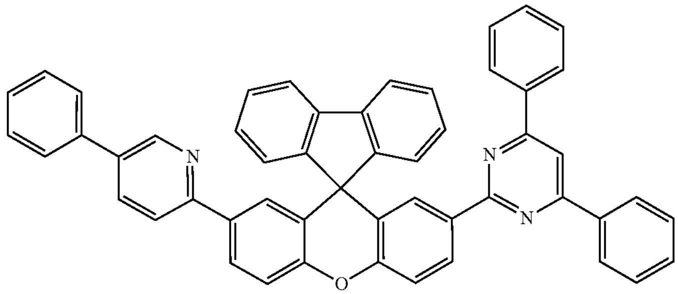
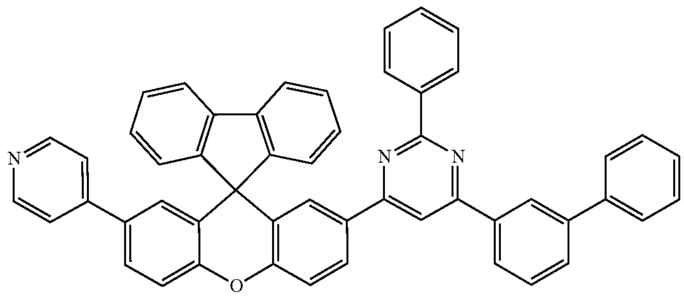
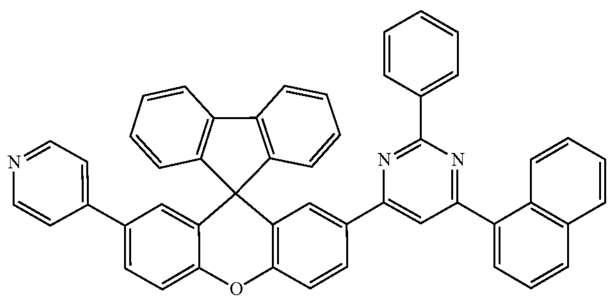
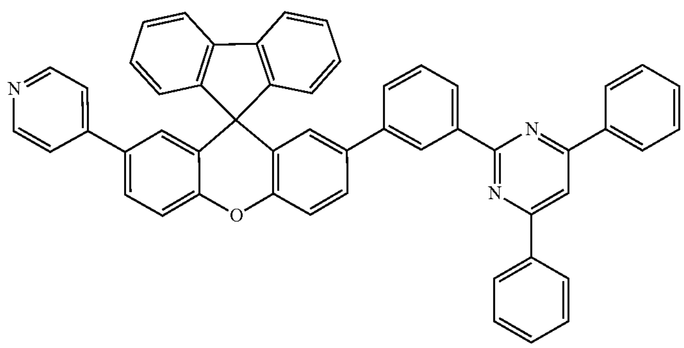
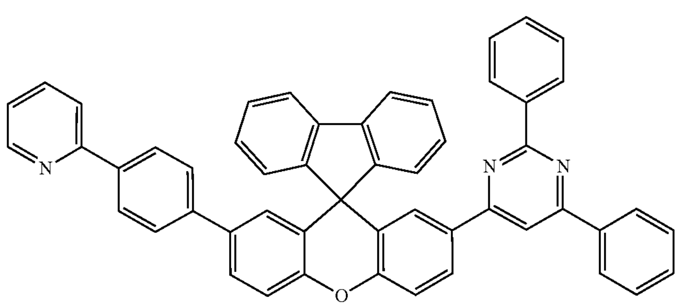

-continued
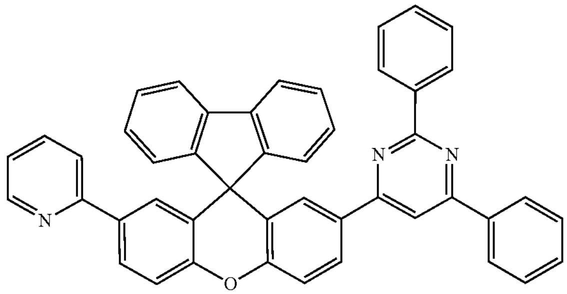
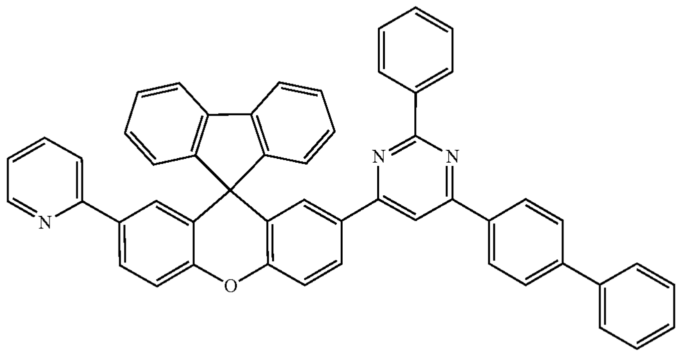
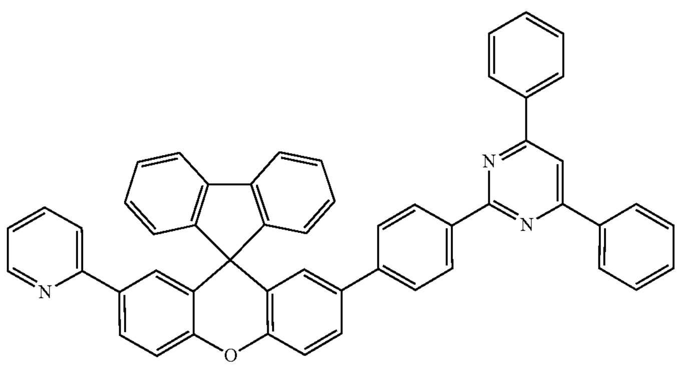
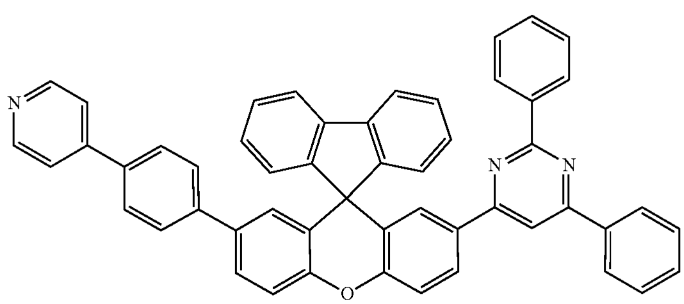
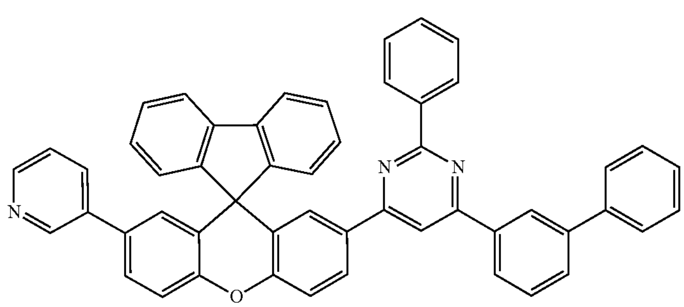

-continued
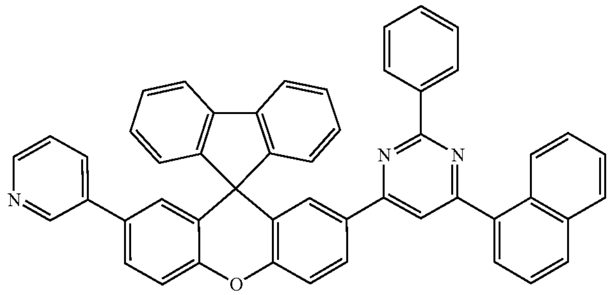
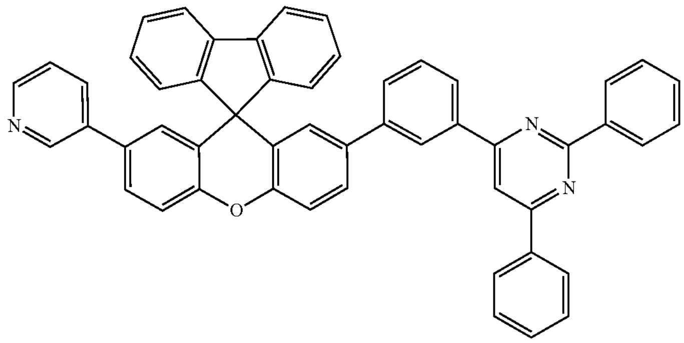
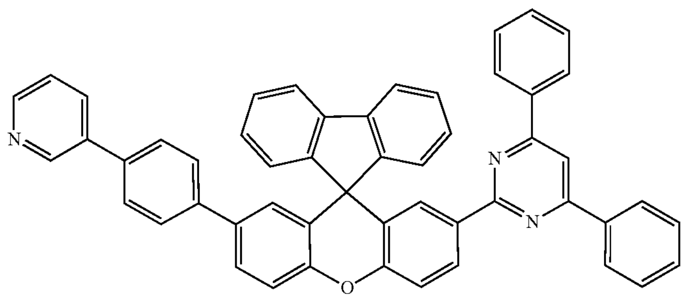
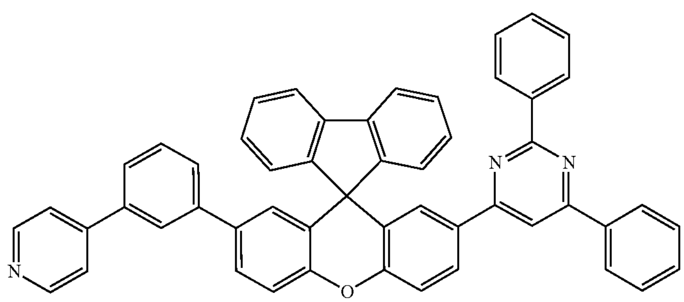
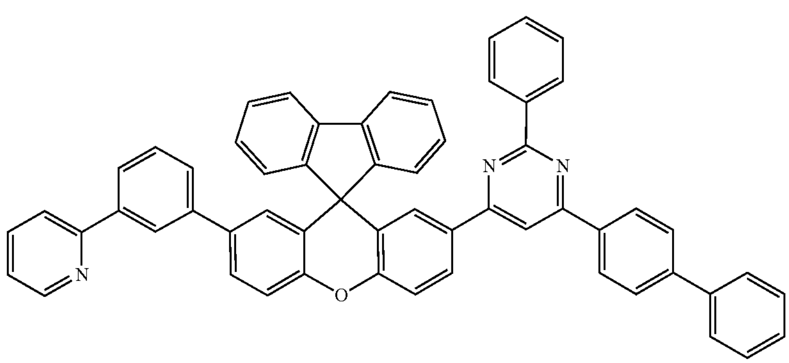

-continued
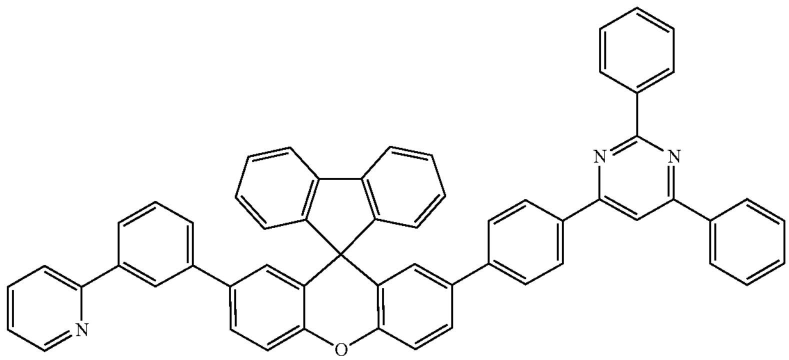
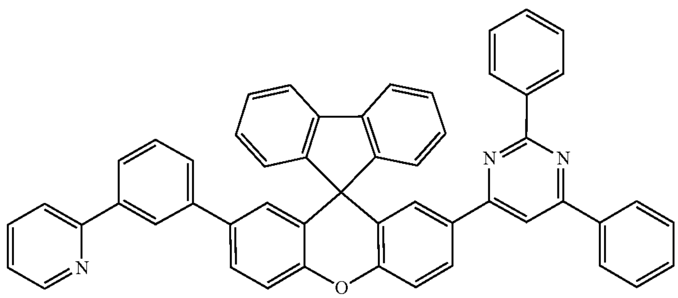
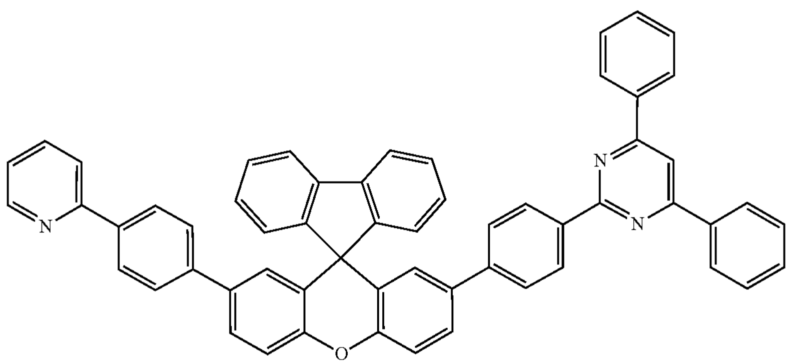
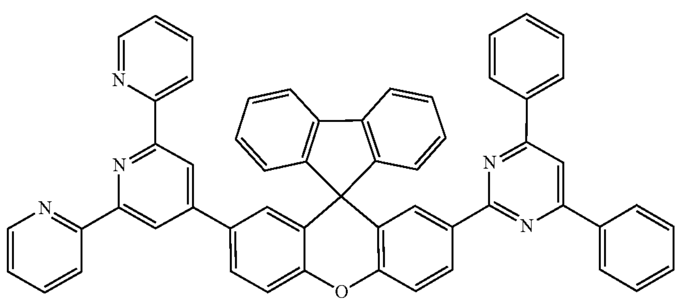
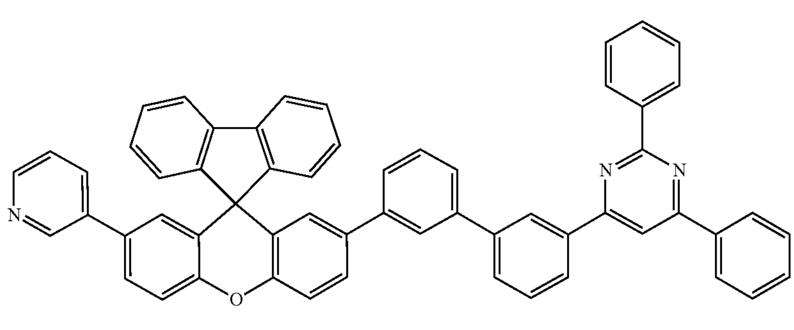

-continued
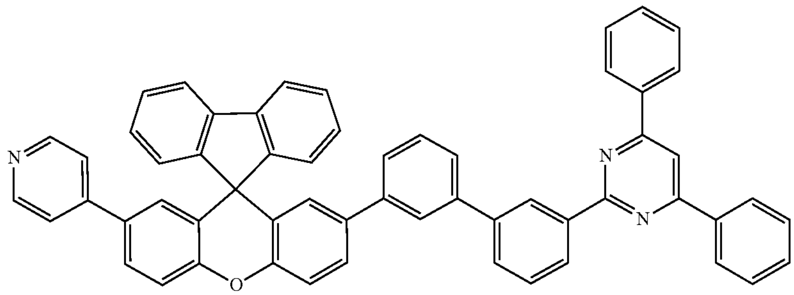
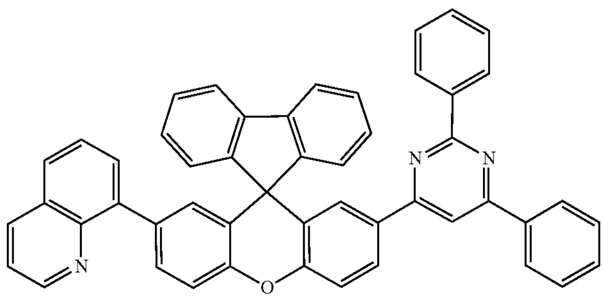
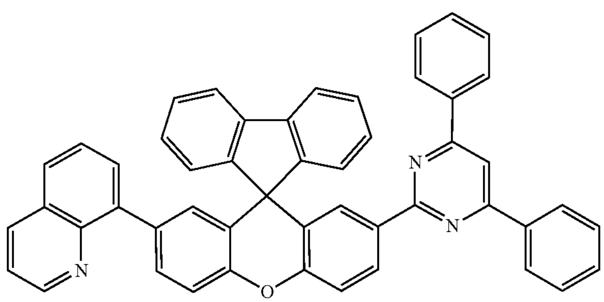
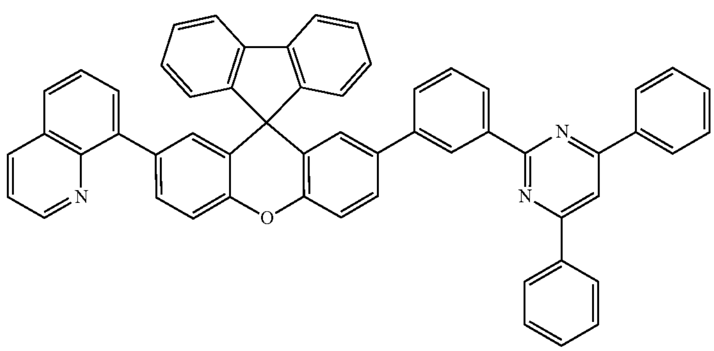
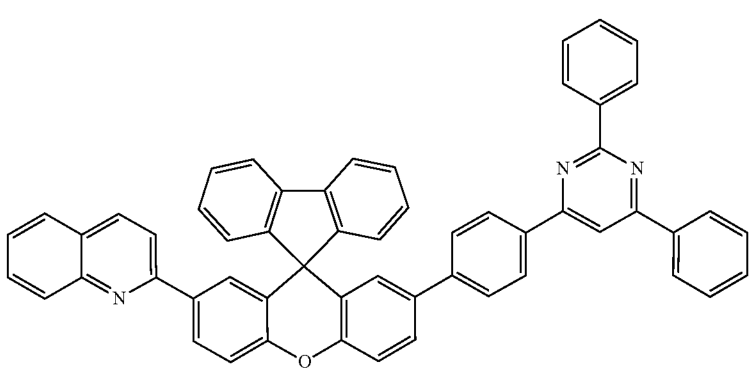

-continued
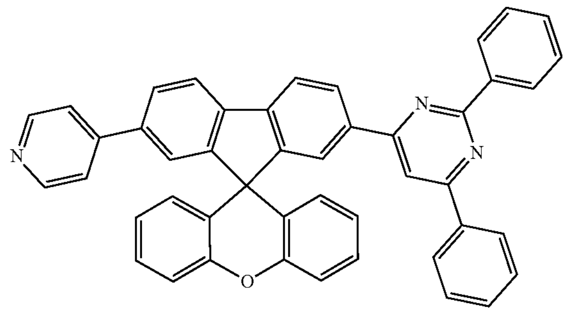
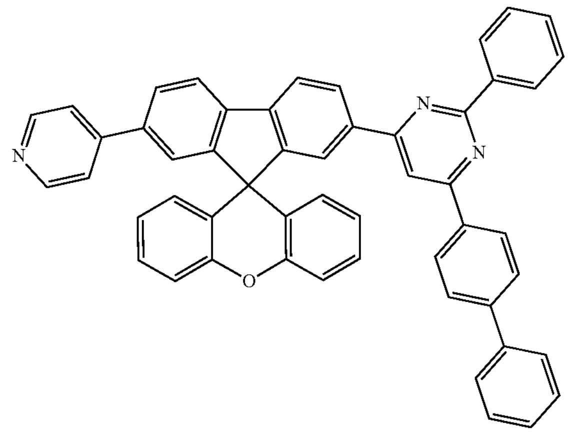
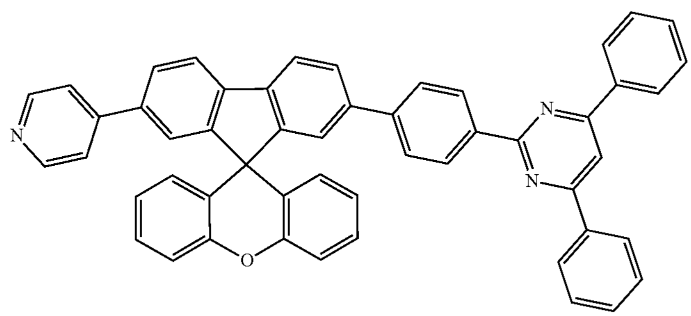
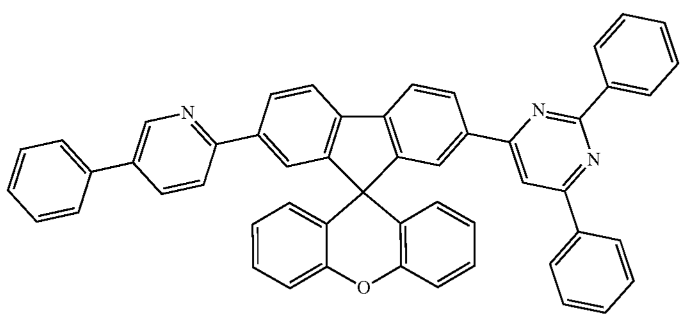
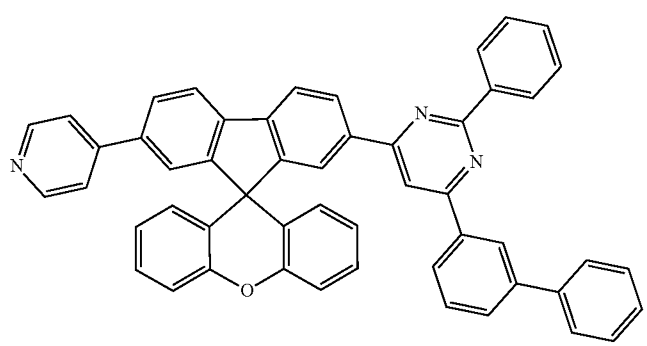
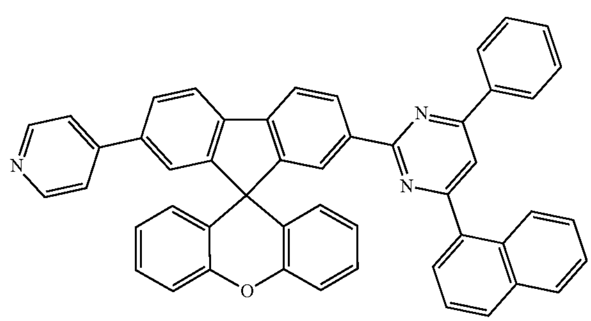

-continued
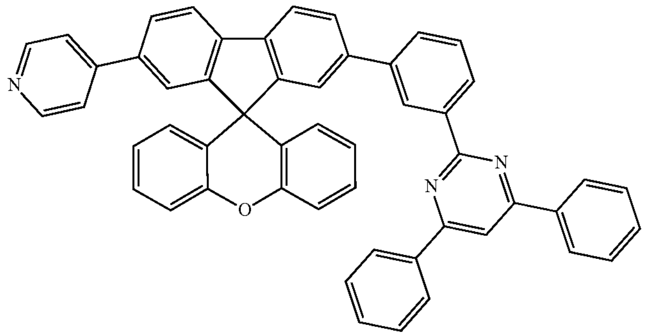
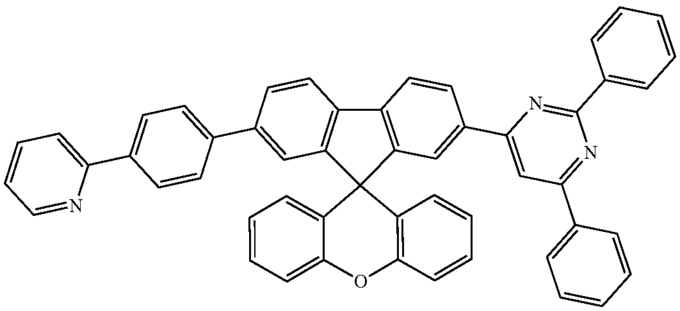
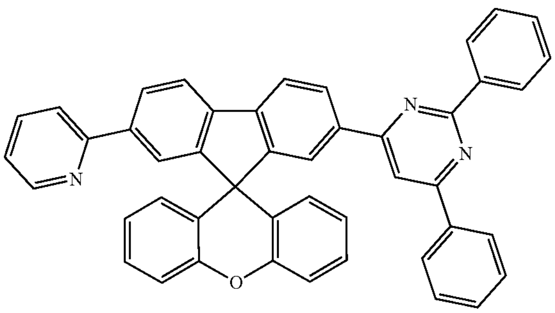
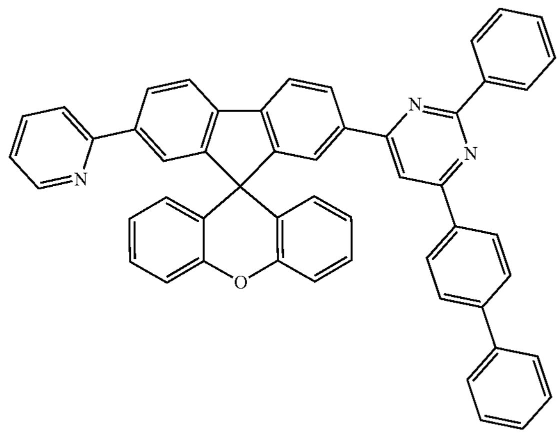
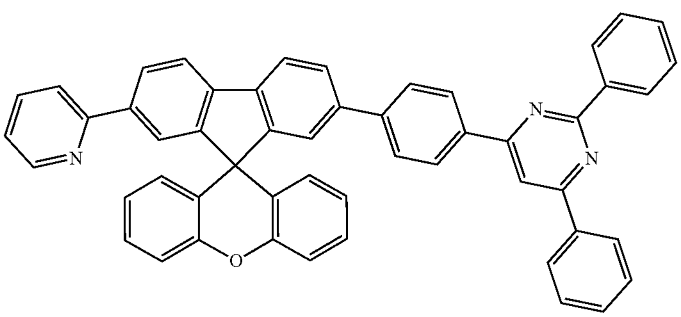
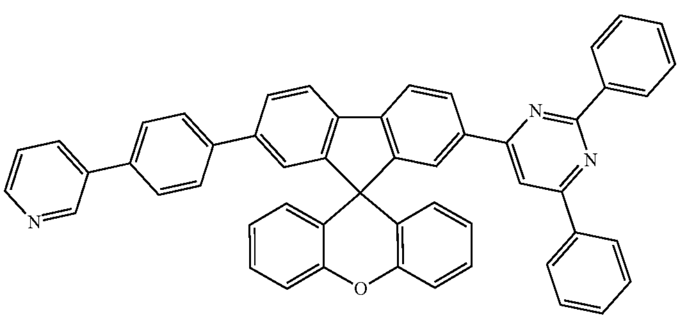

-continued
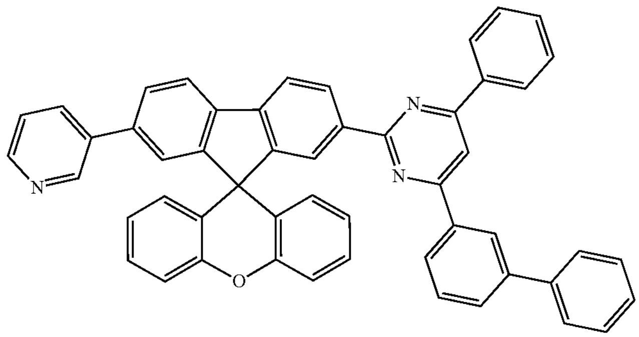
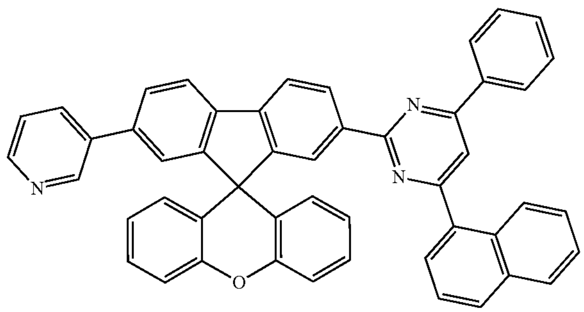
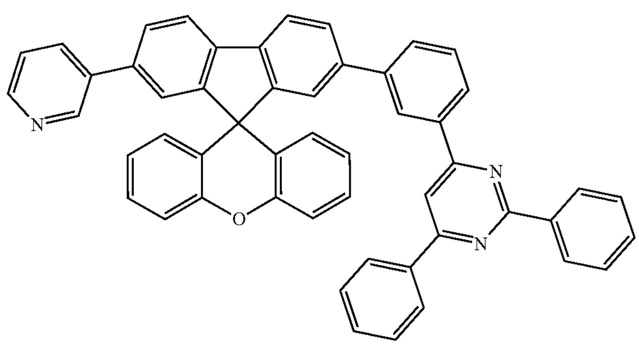
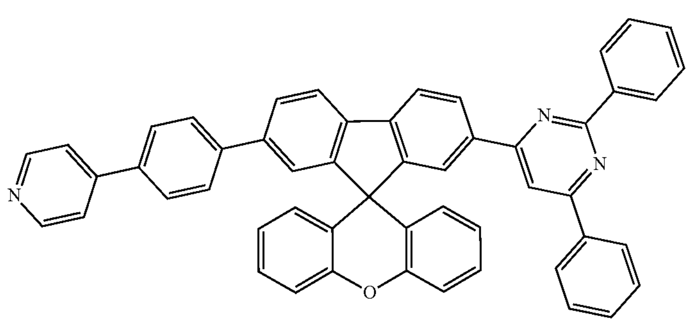

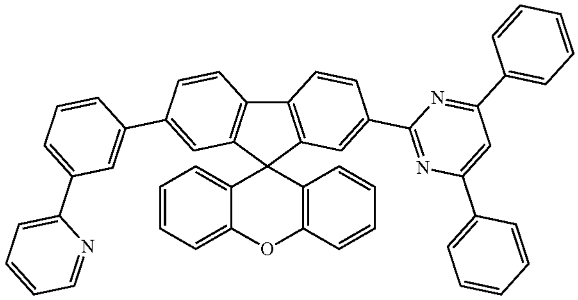
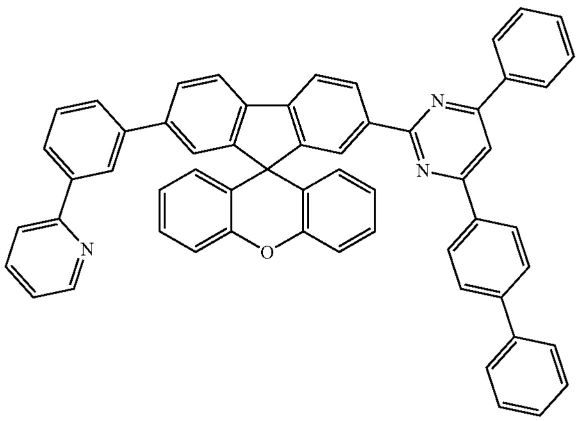
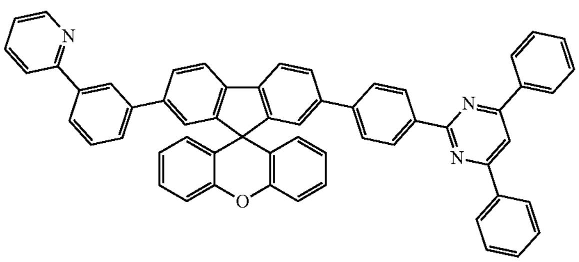
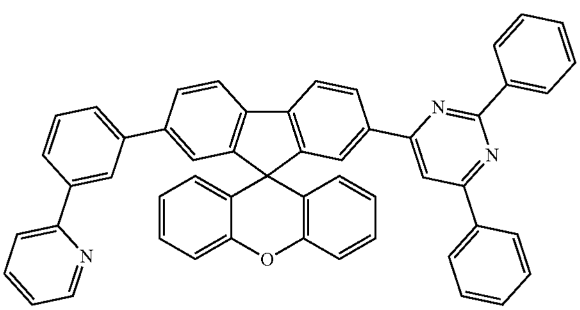
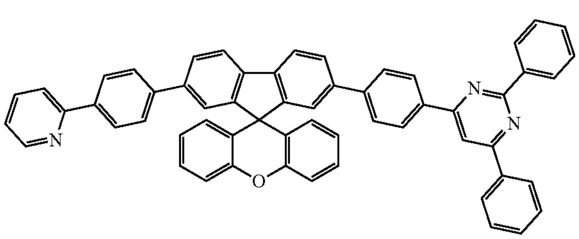
-continued
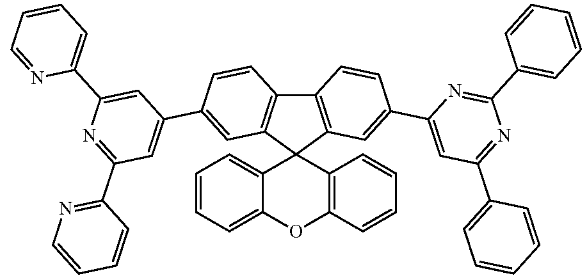
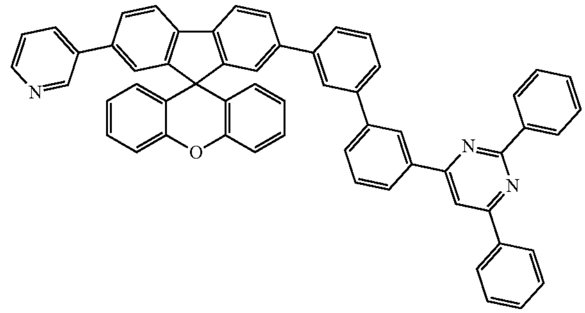
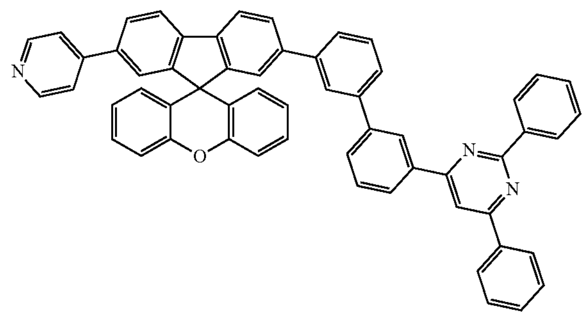
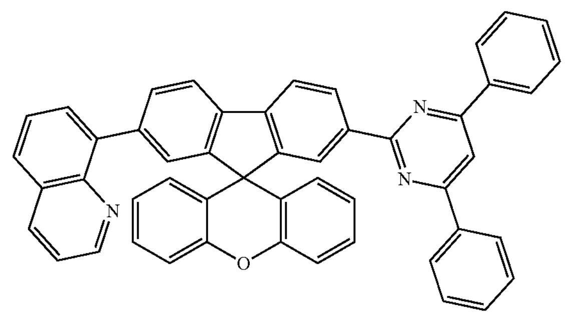
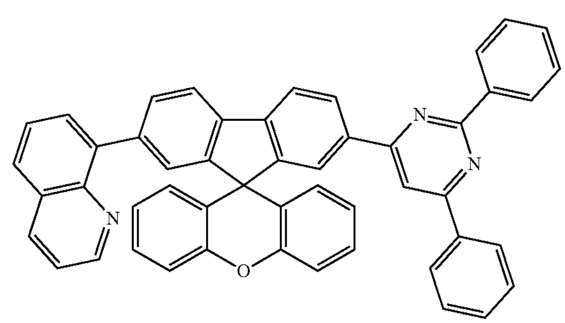

-continued
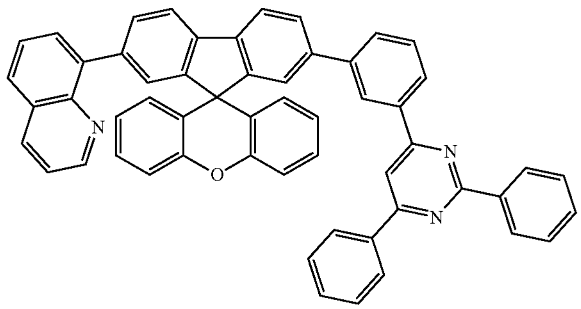
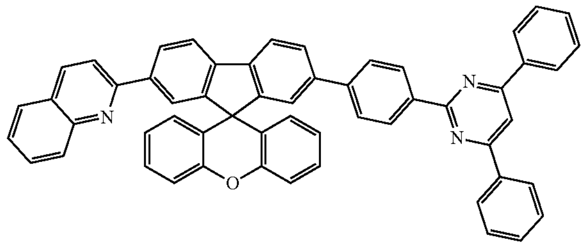
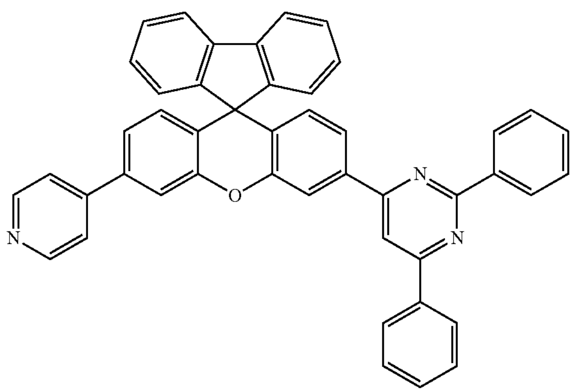
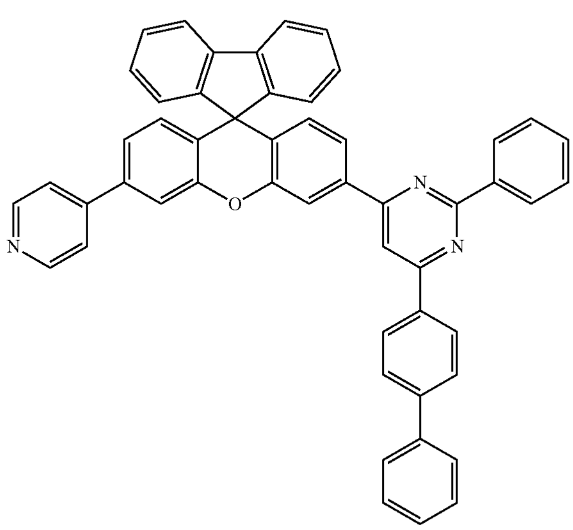
-continued
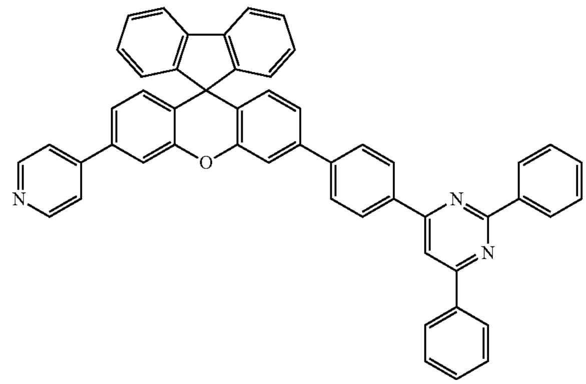
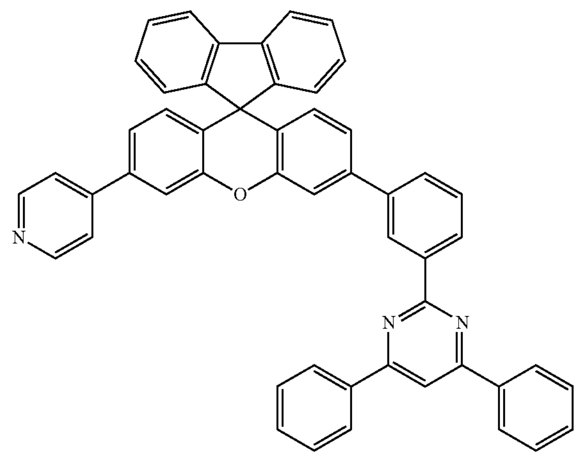
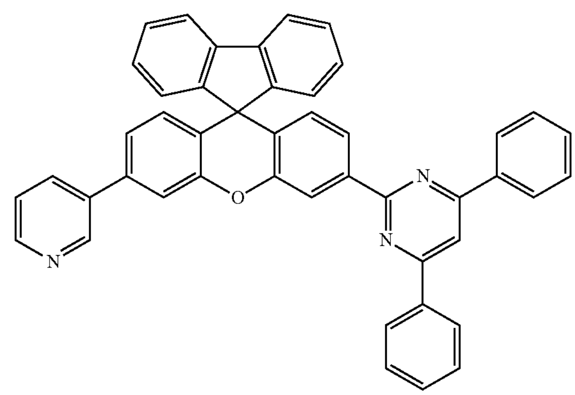
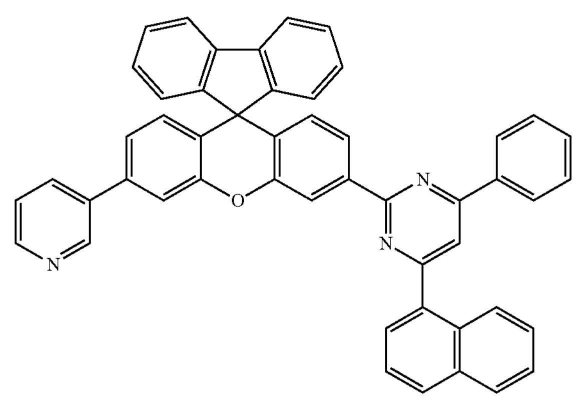

-continued
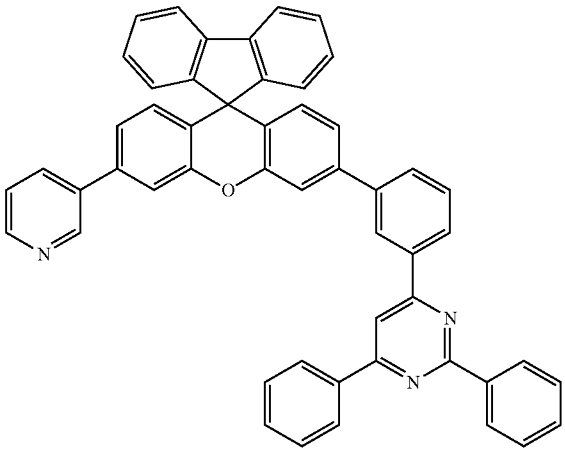
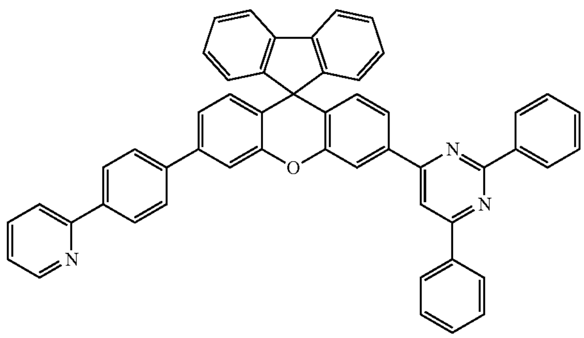
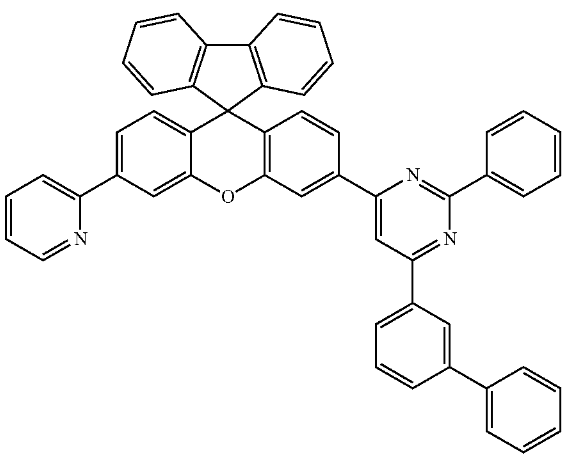
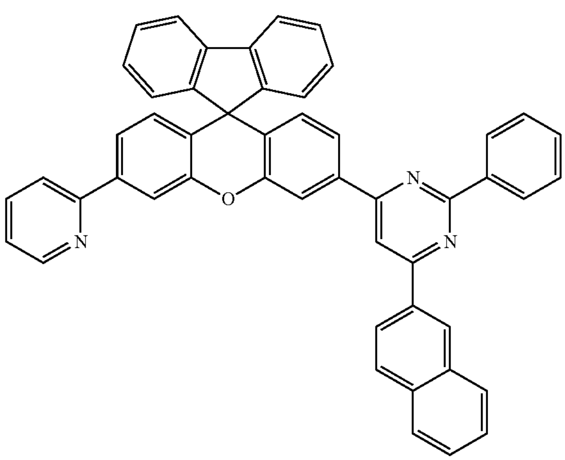
-continued
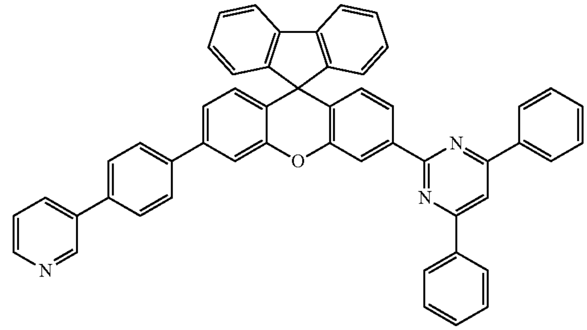
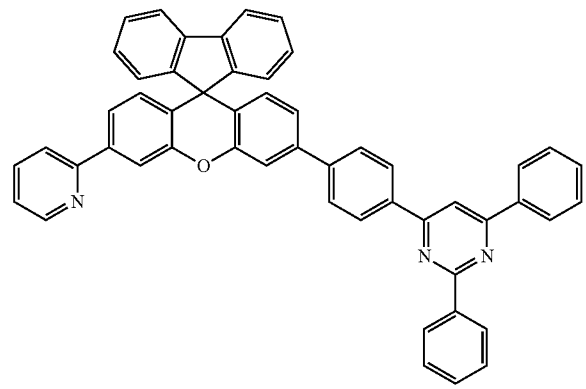
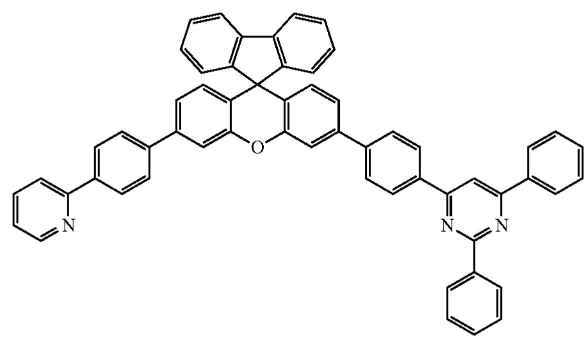
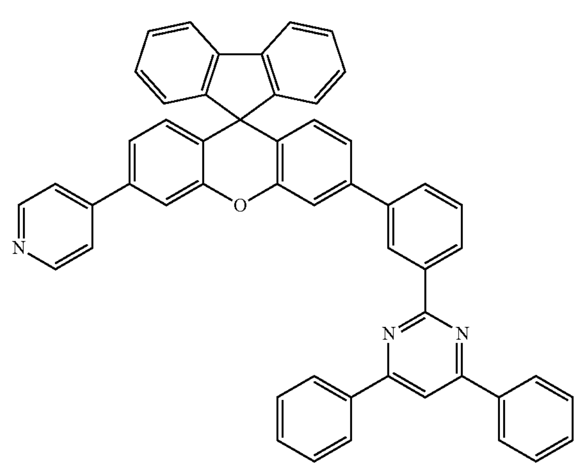

-continued
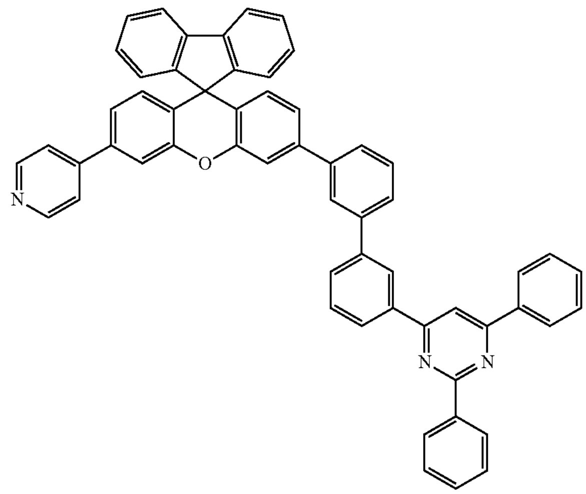
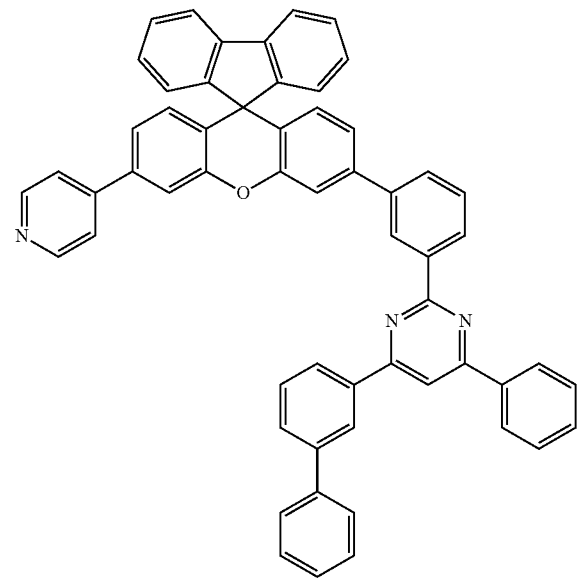
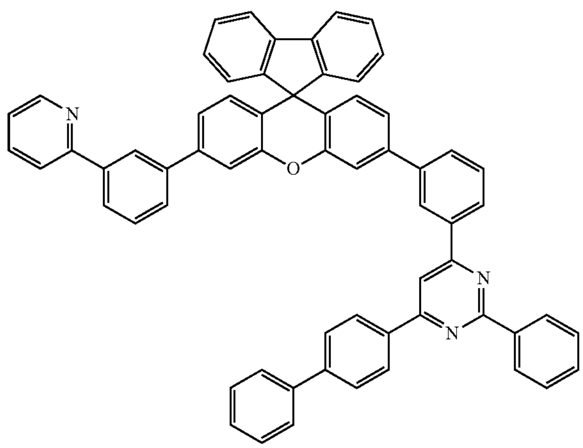
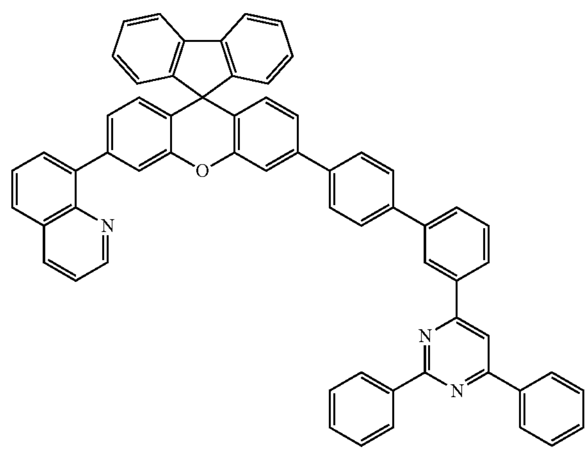
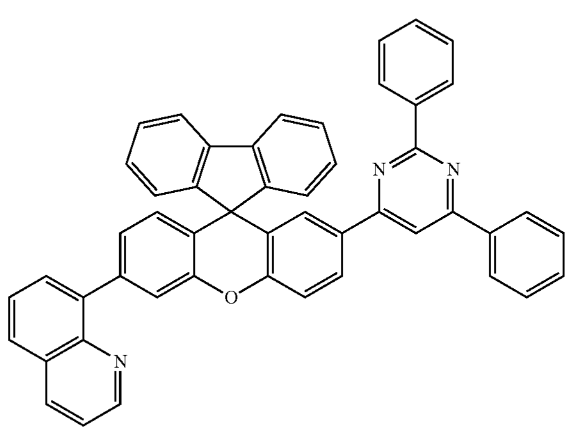
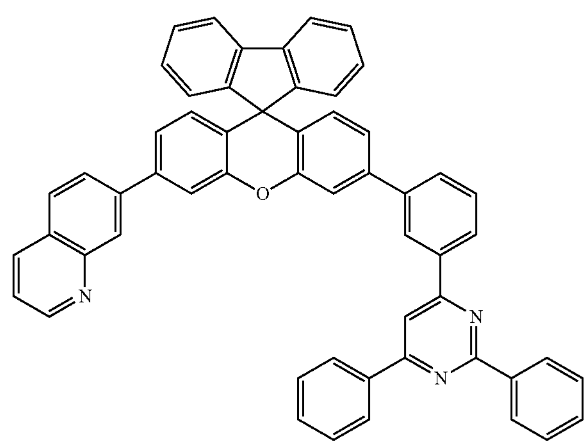

-continued
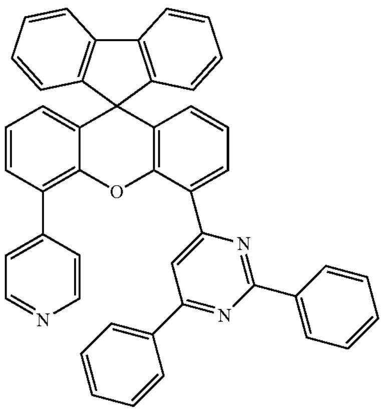
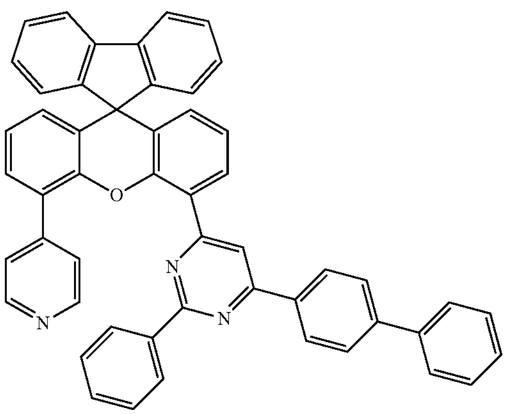
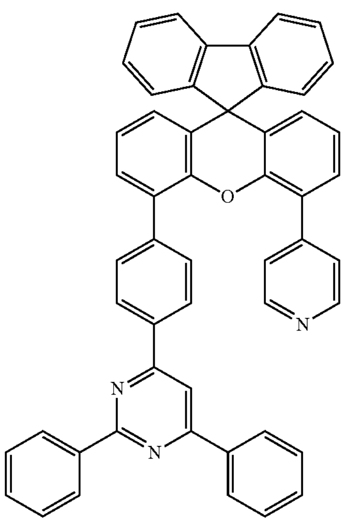
-continued
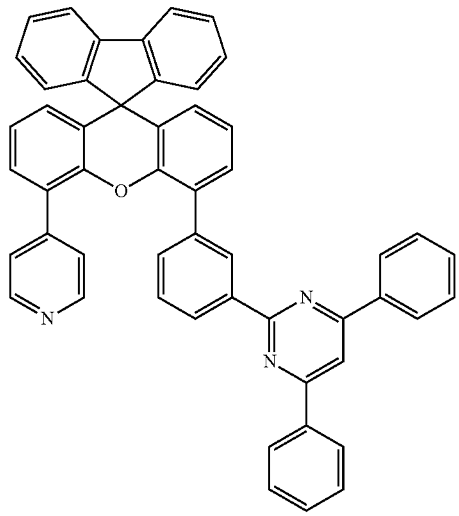
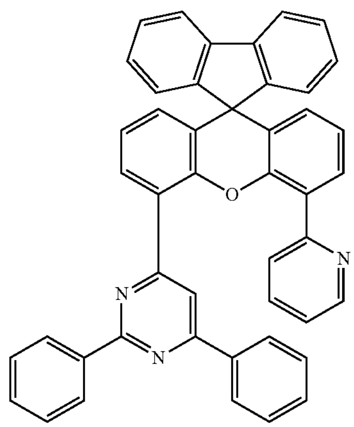
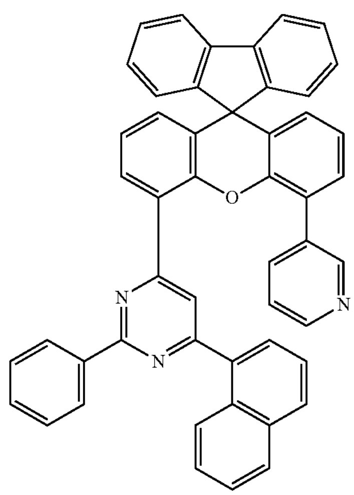

-continued
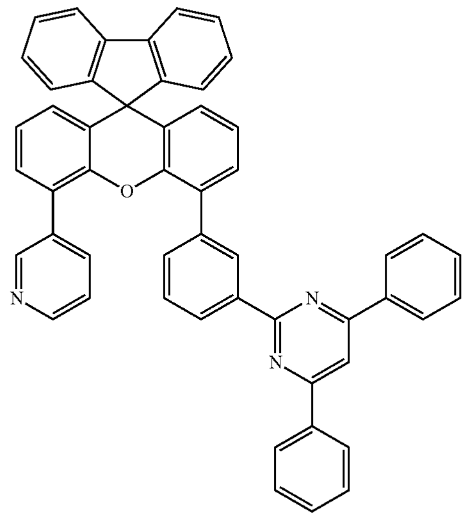
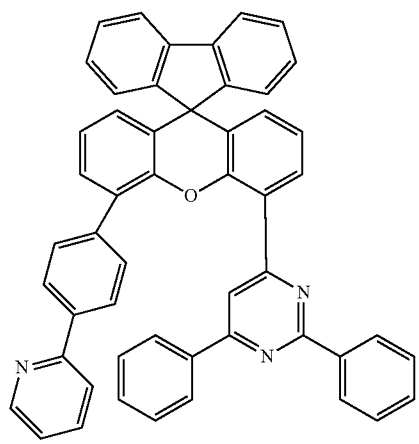
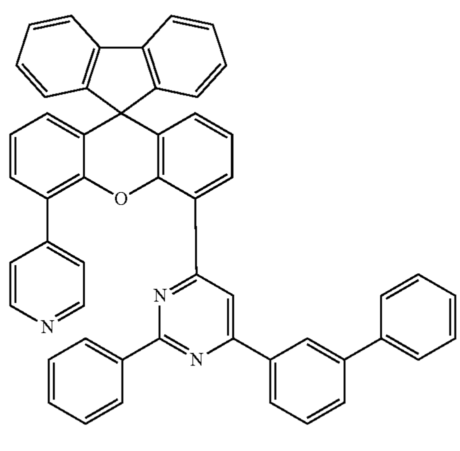
-continued
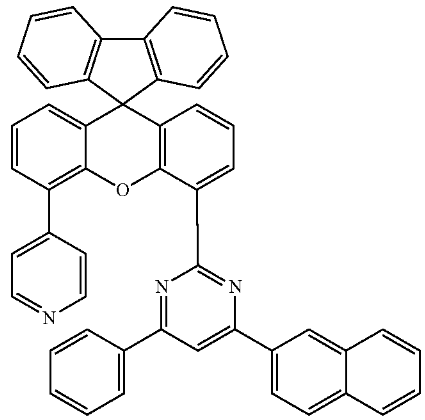
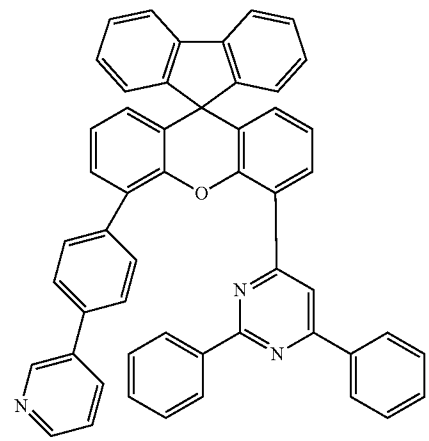
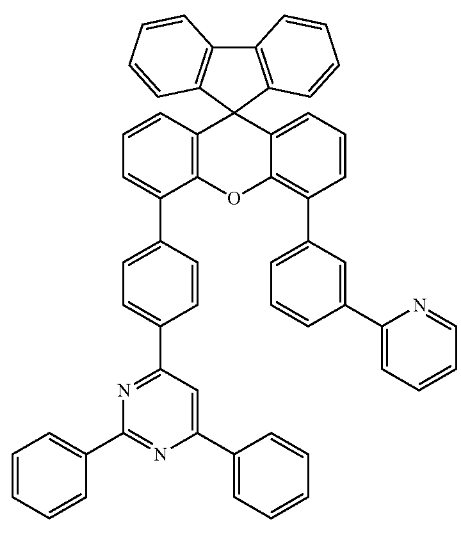

-continued
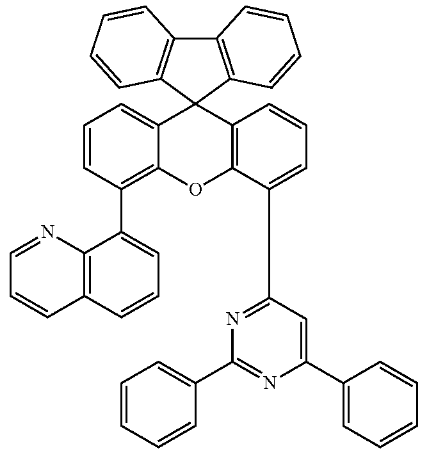
-continued
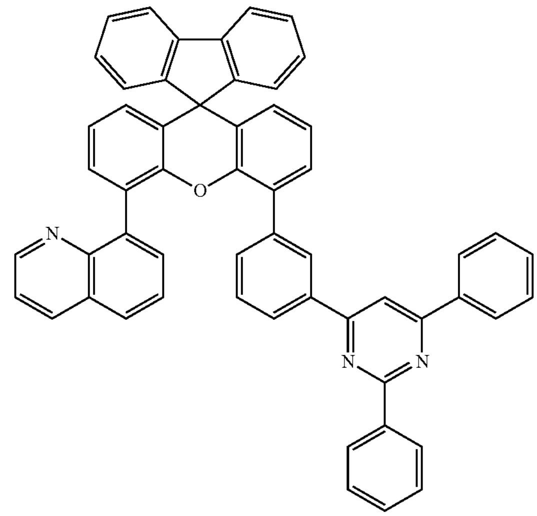
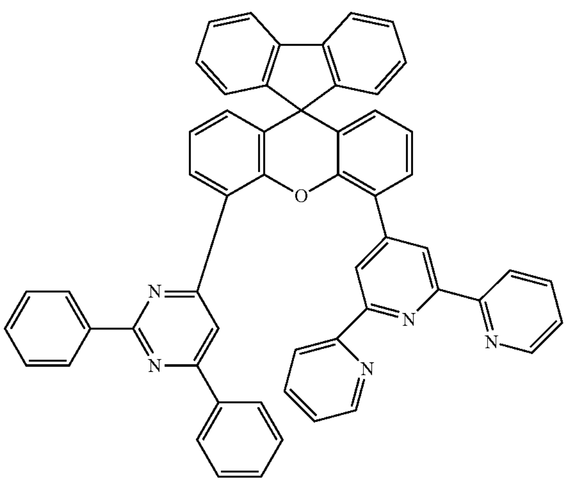
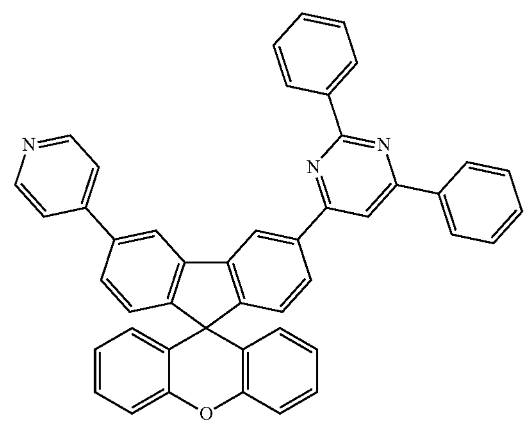
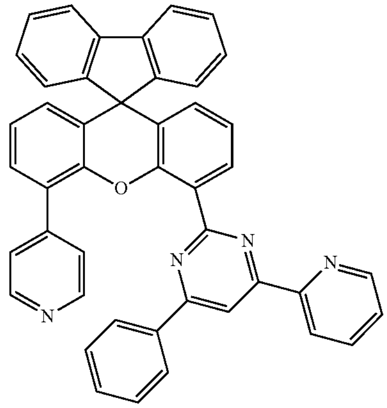
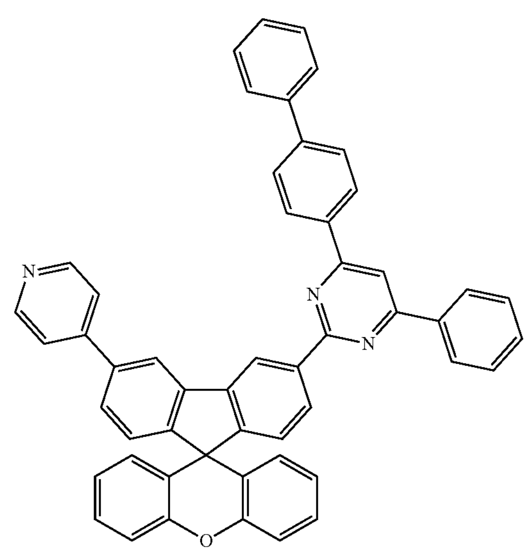

-continued
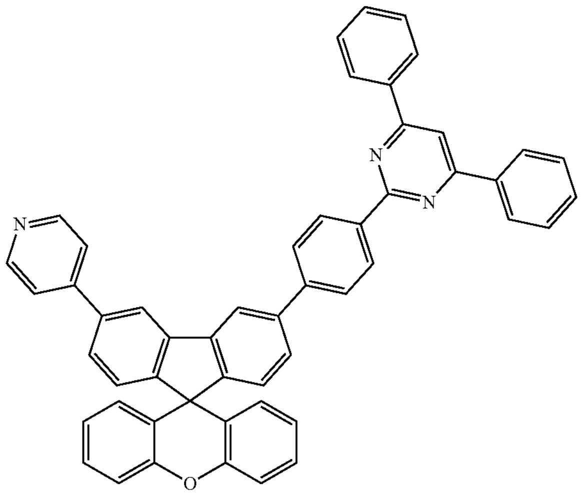
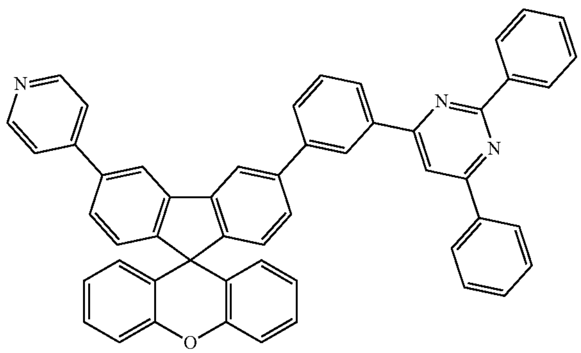
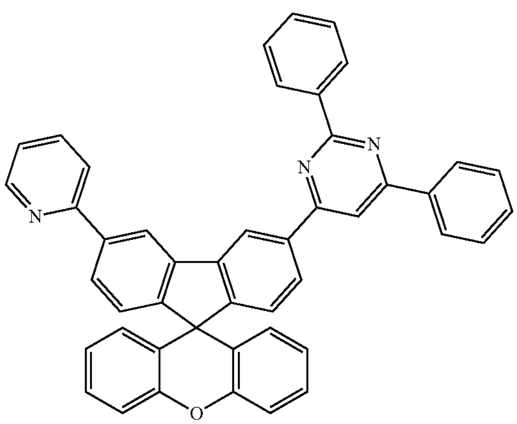
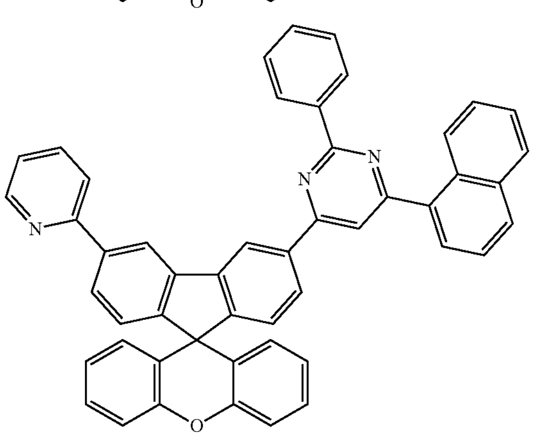
-continued
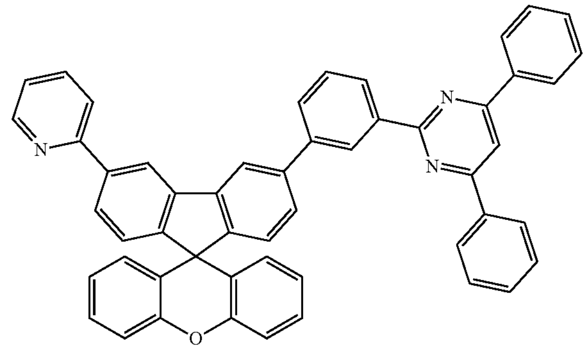
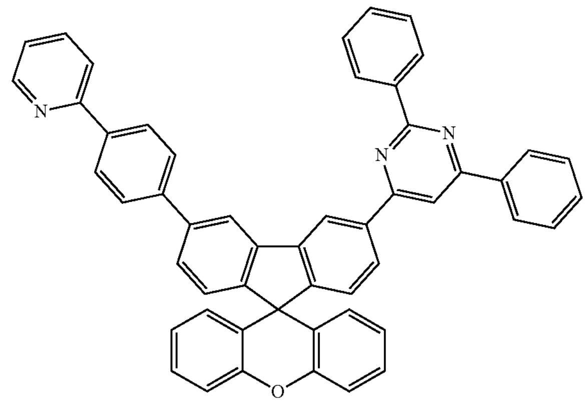 [SMILES: c1ccc(-c2cc(-c3ccc4c(c3)-c3cc(-c5ccc(-c6ccccn6)cc5)ccc3C43c4ccccc4Oc4ccccc43)nc(-c3ccccc3)n2)cc1]
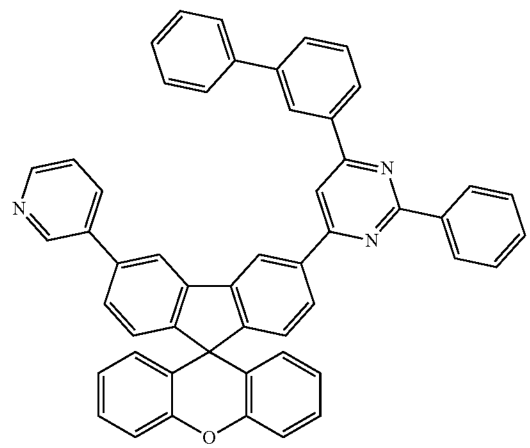
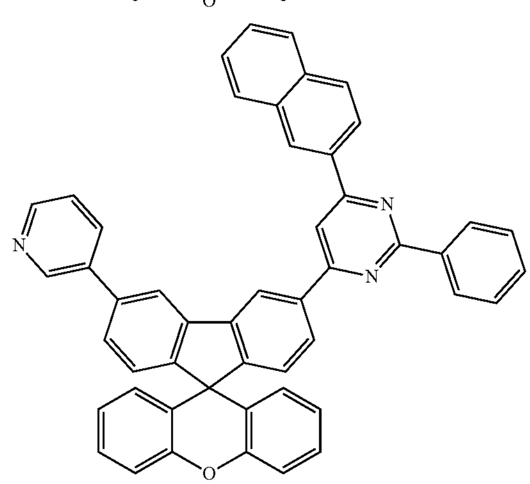

-continued
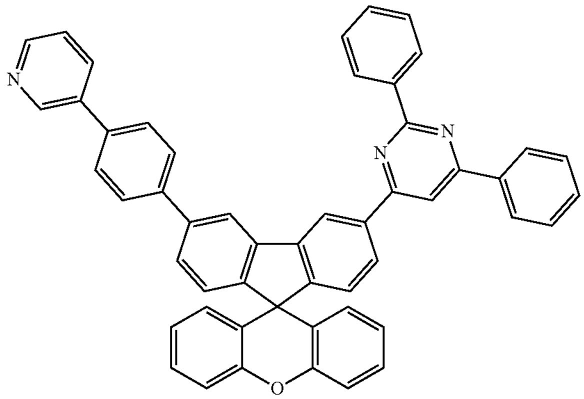
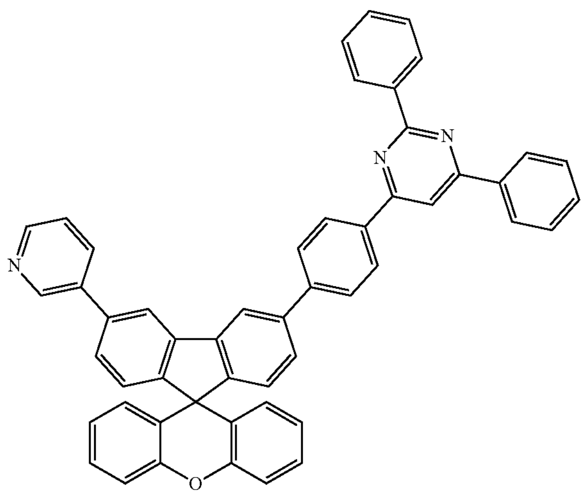
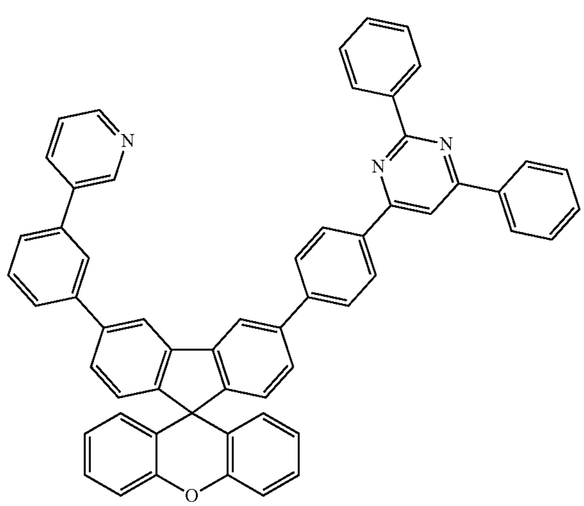
-continued
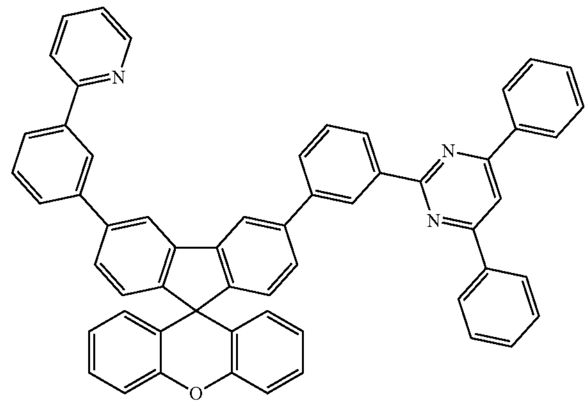
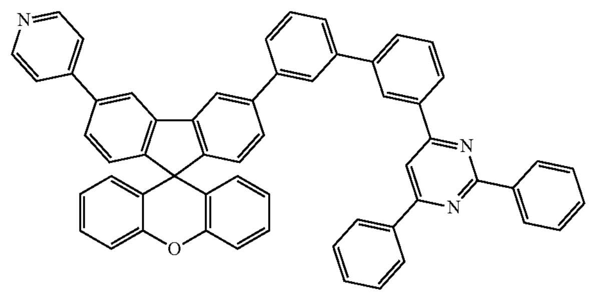
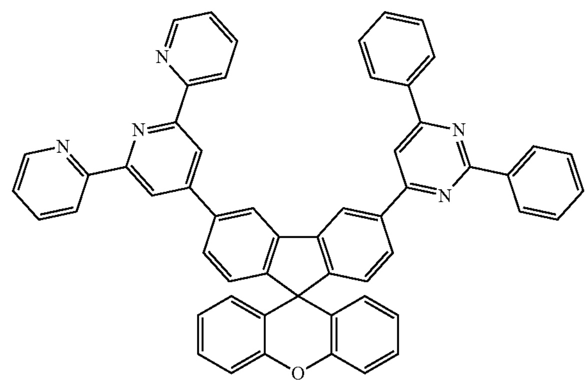
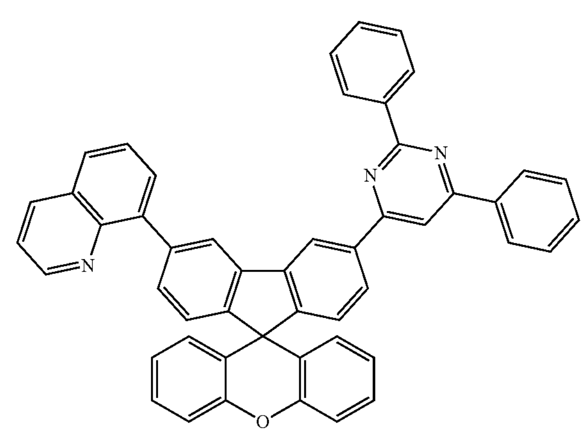

-continued
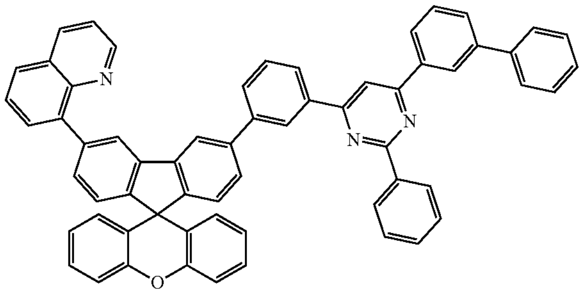
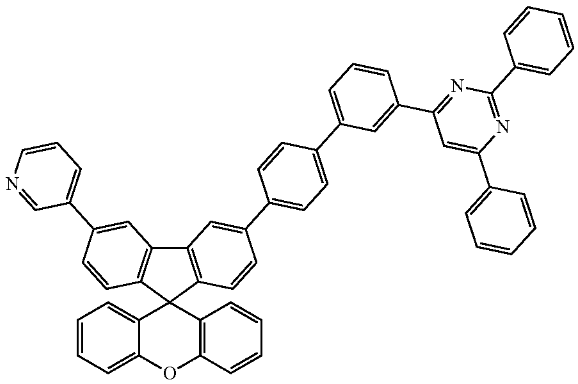
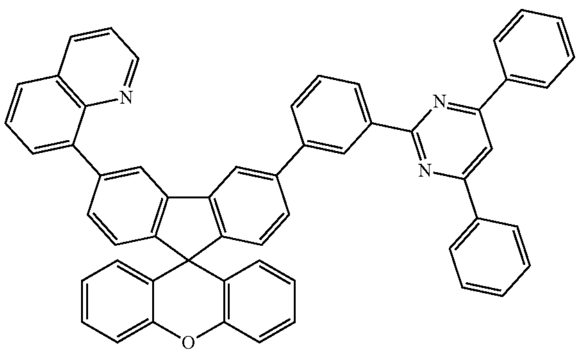
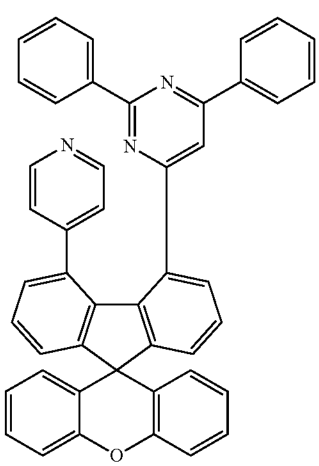
-continued
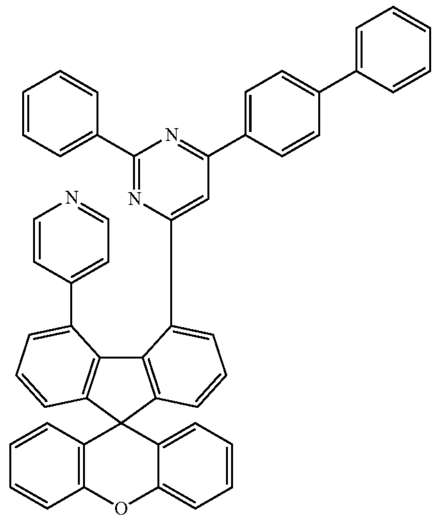
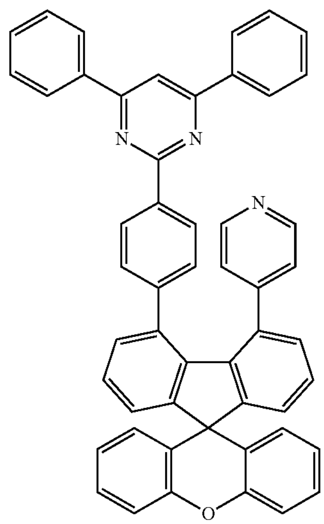
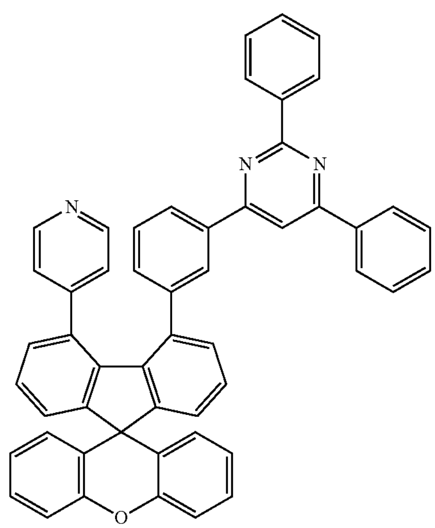

-continued
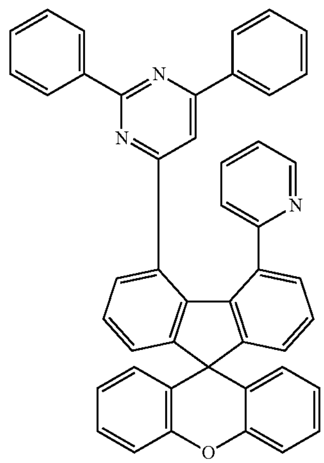
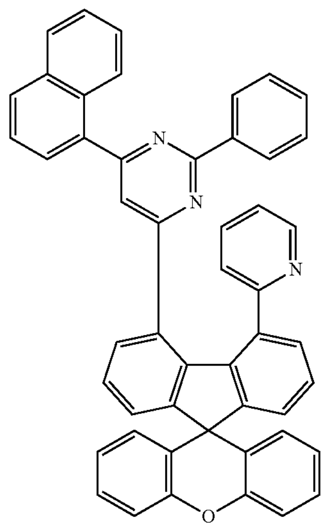
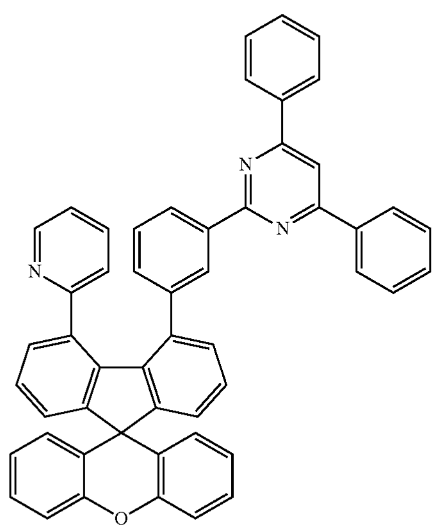
-continued
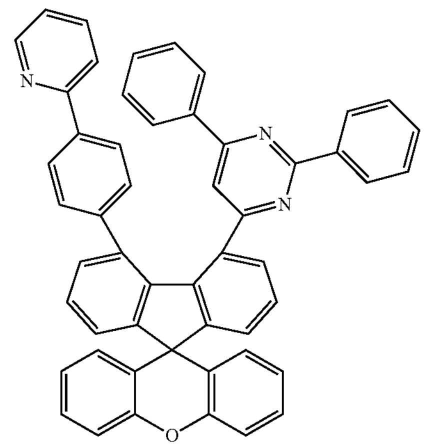
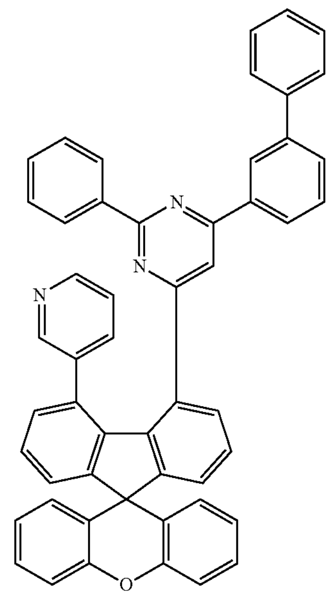
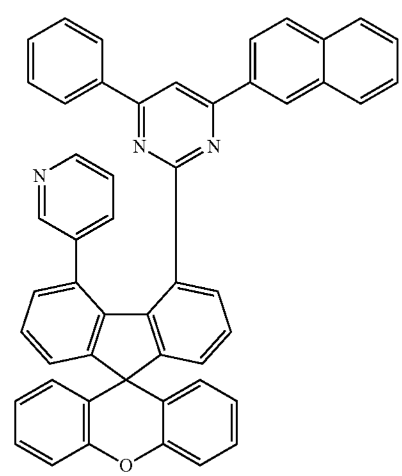

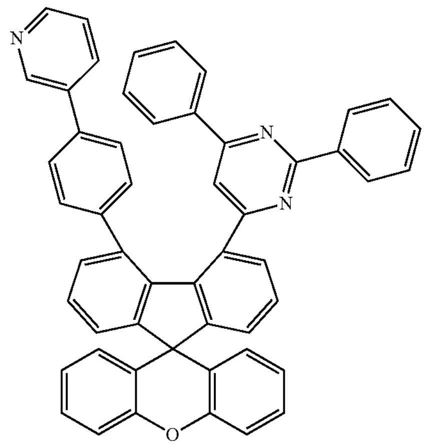
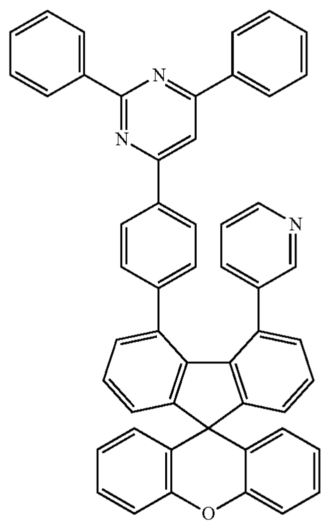
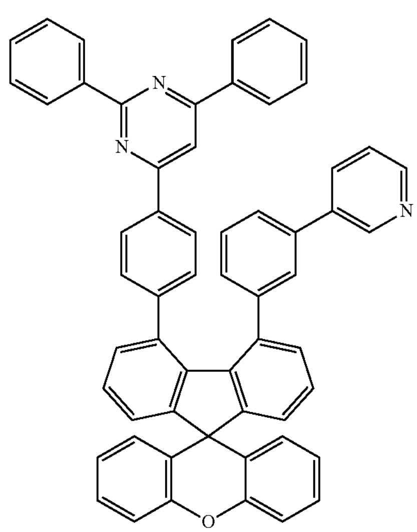
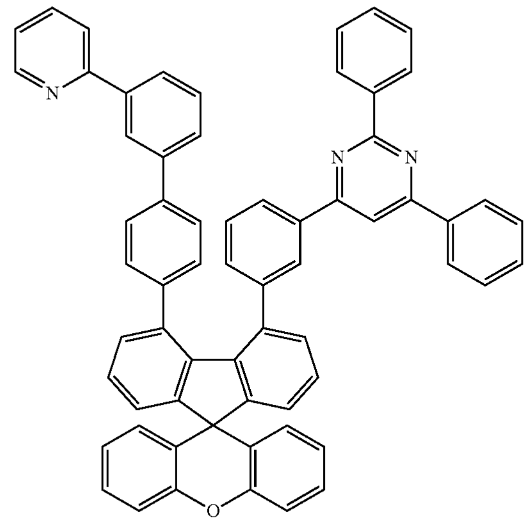
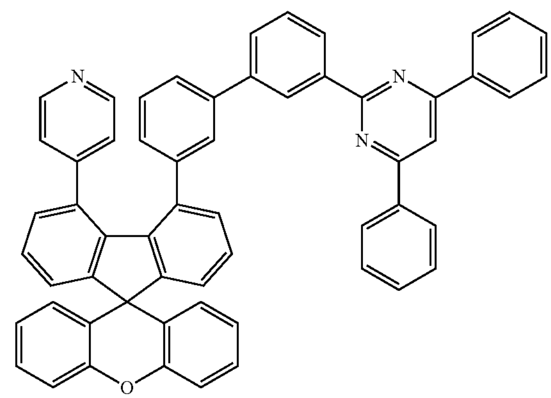
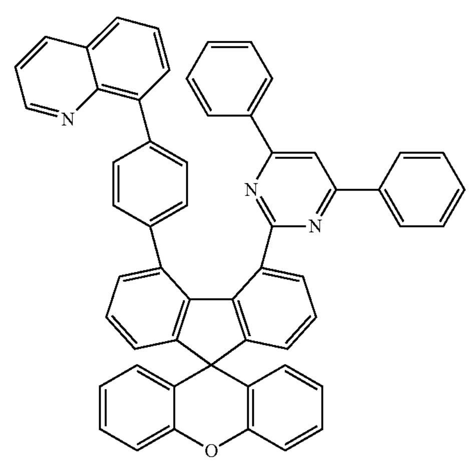

-continued
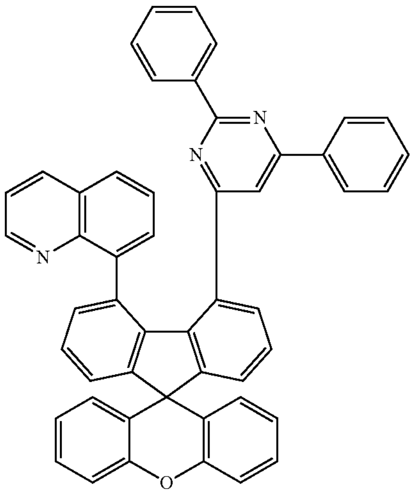
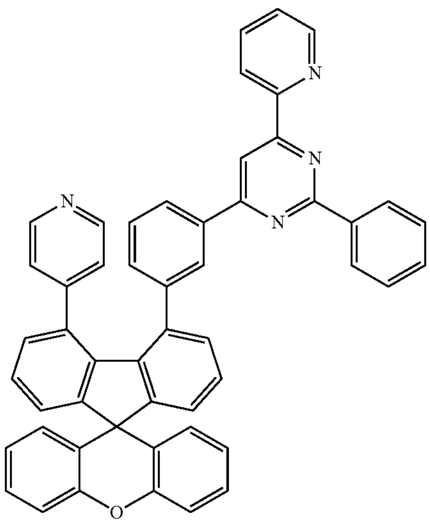
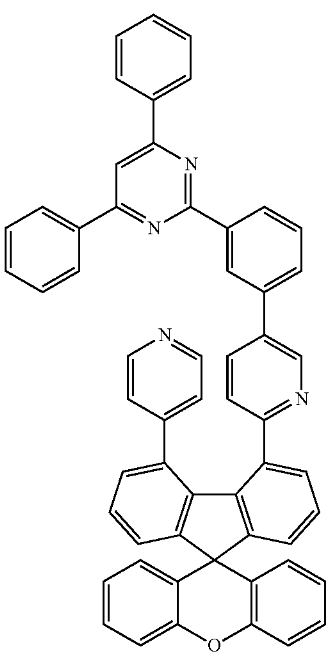
-continued
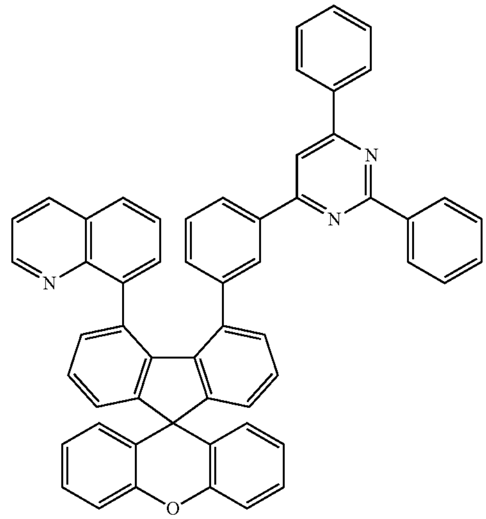
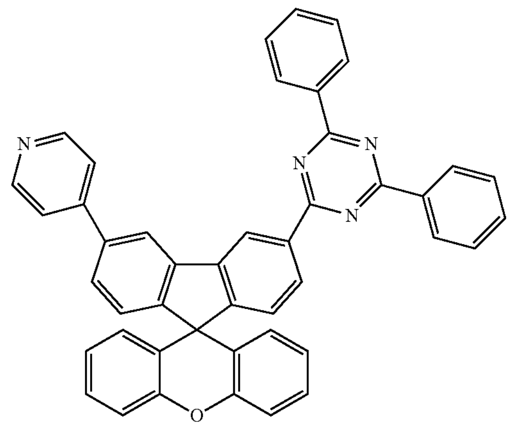
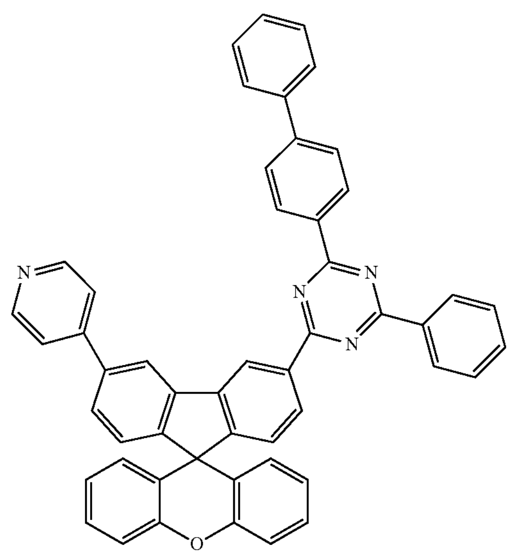

-continued
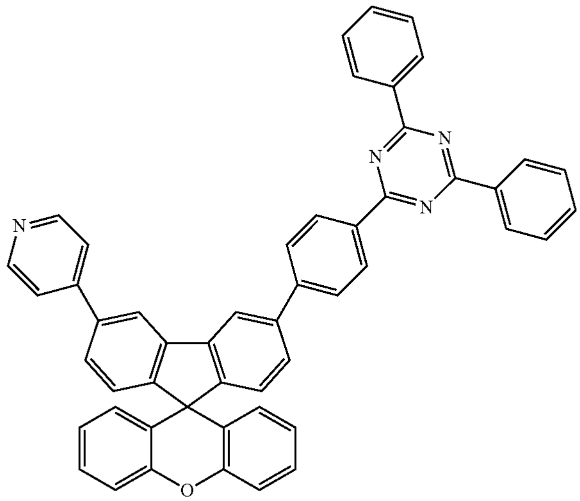
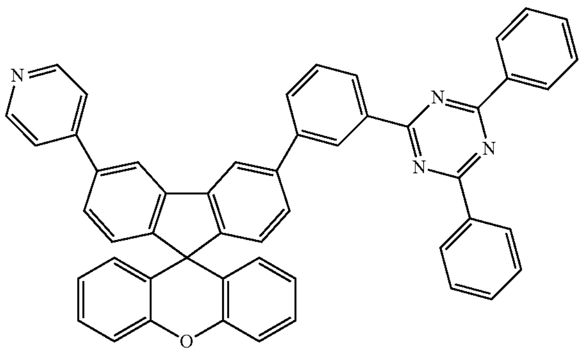
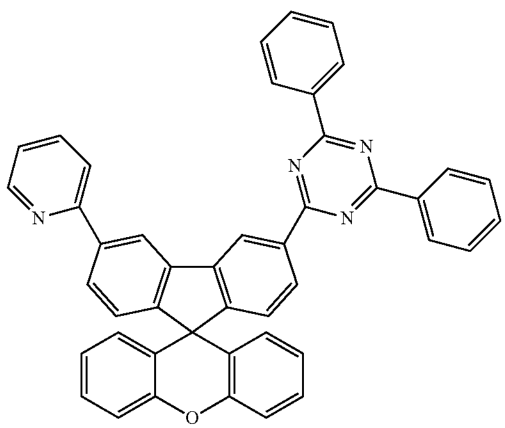
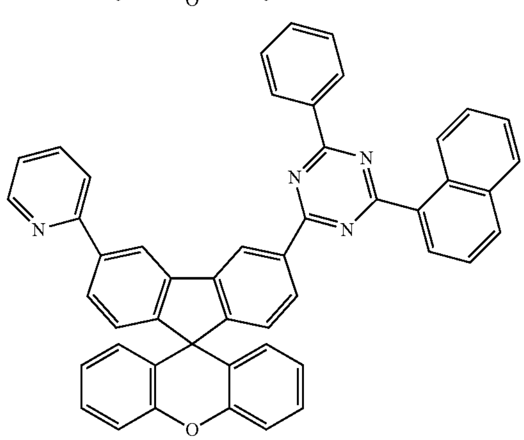
-continued
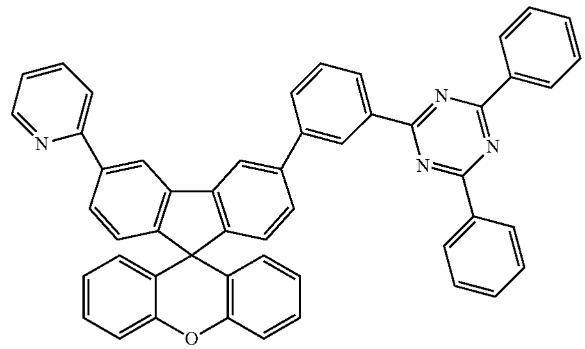
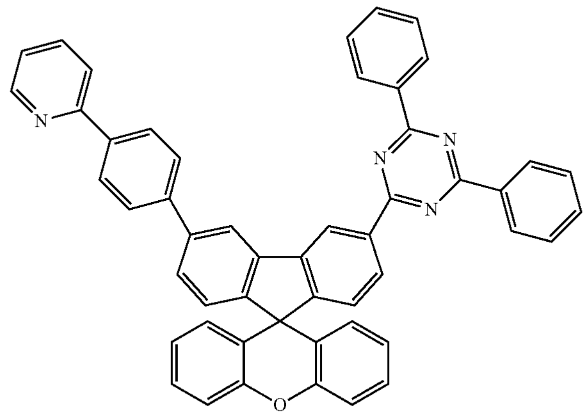
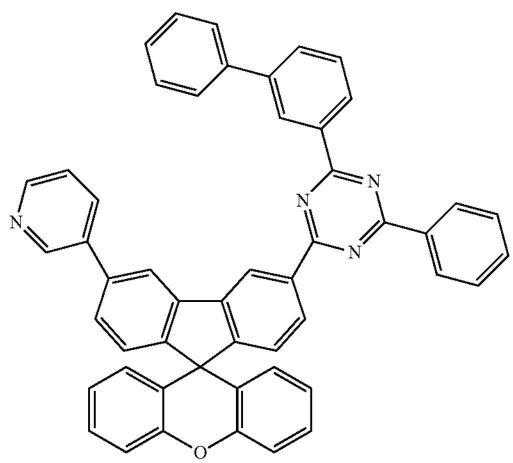
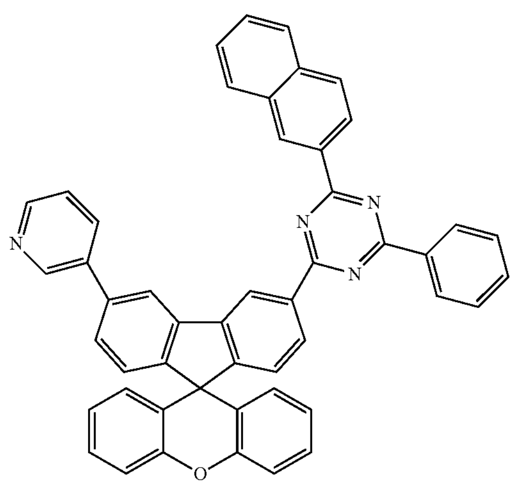

-continued
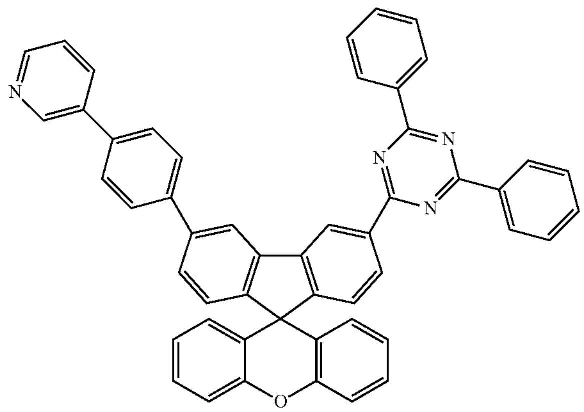
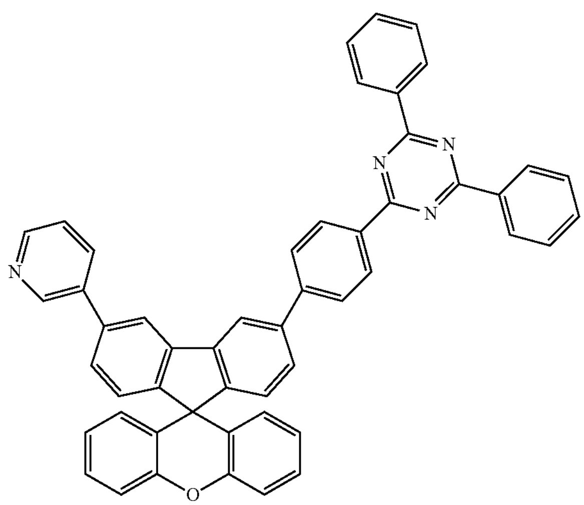
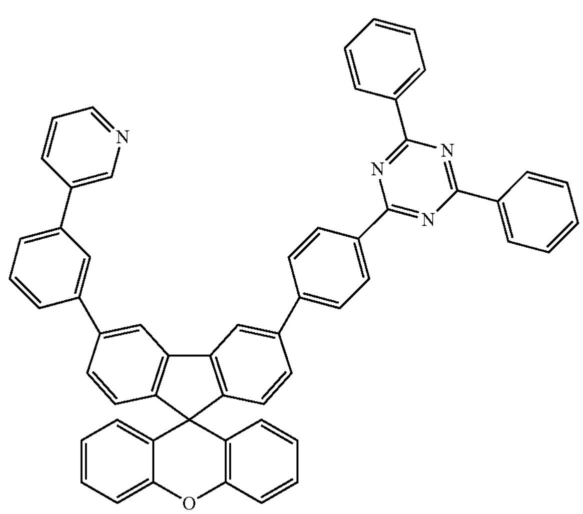
-continued
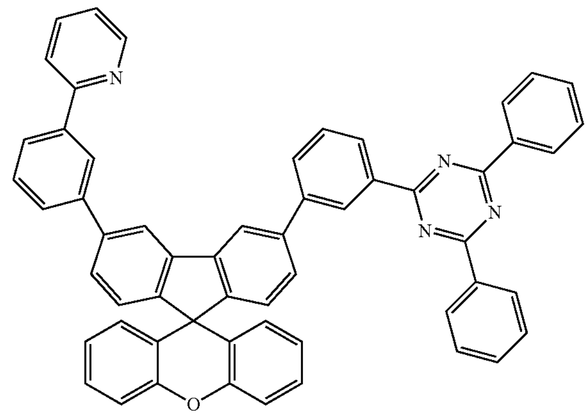
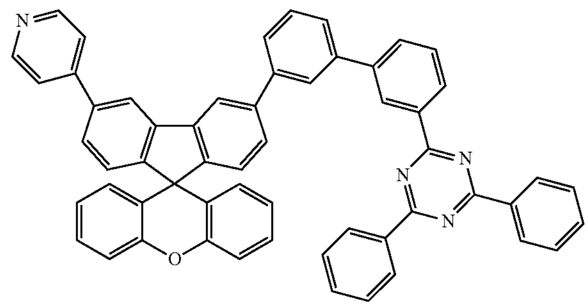
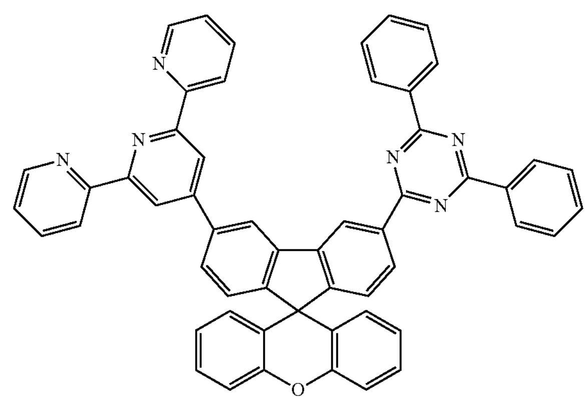
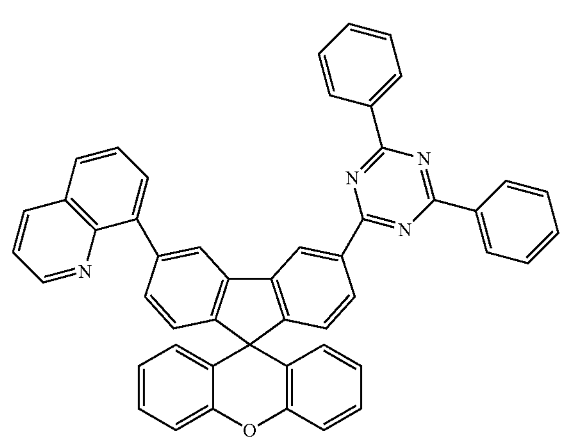

-continued
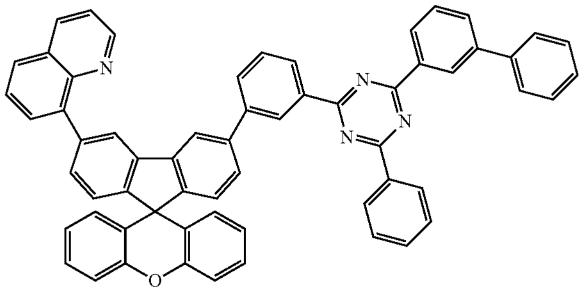
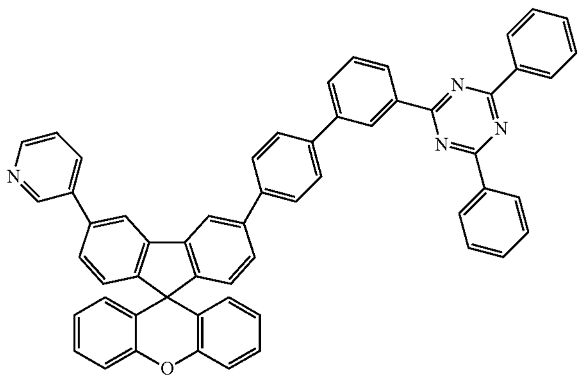
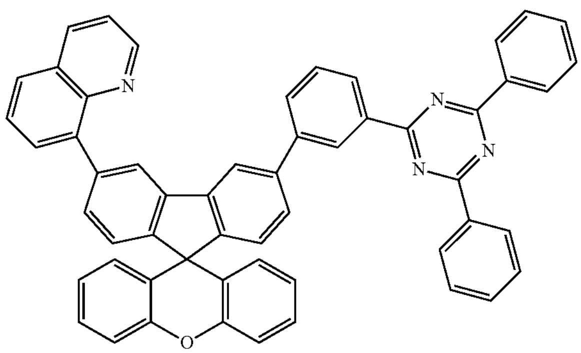
-continued
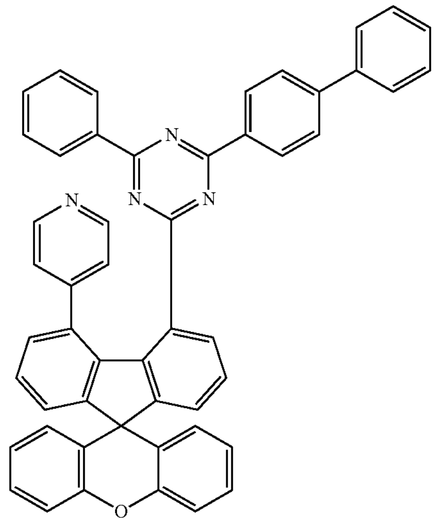
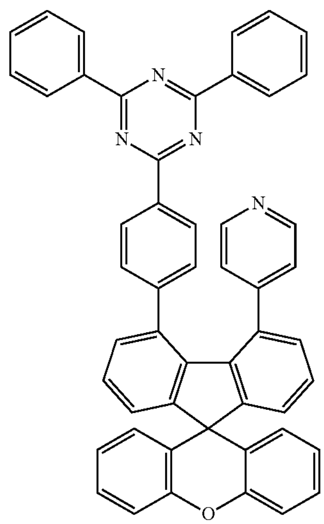
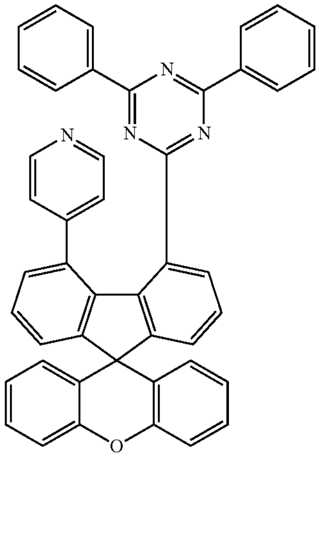
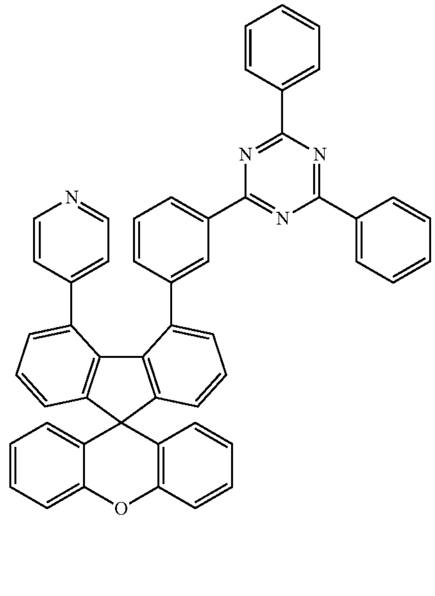

-continued
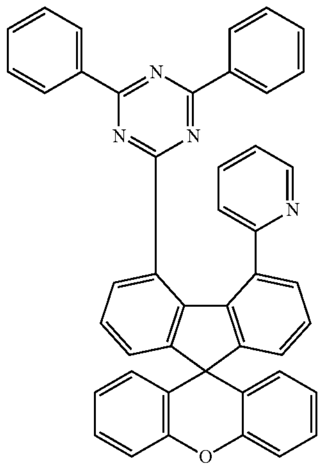
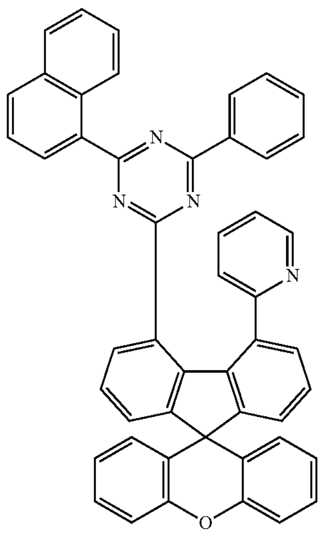
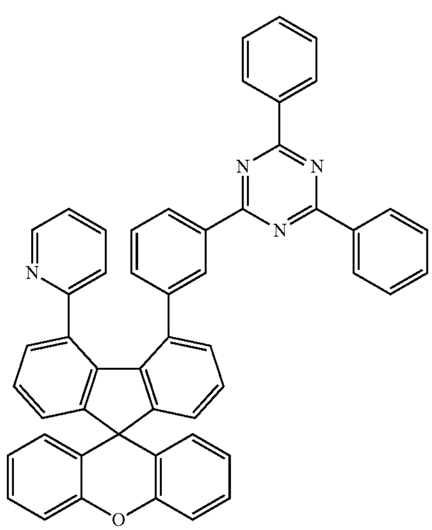
-continued
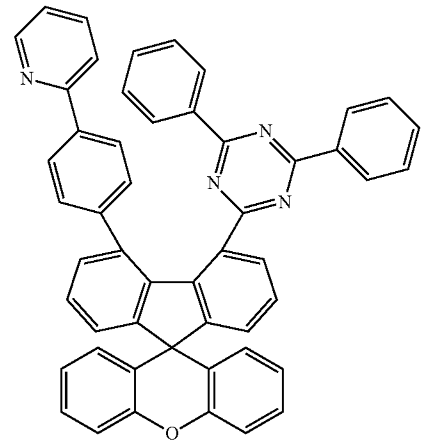
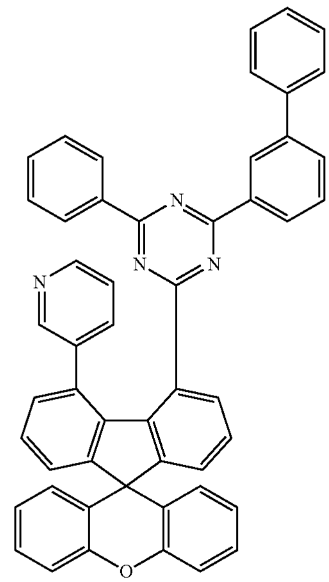
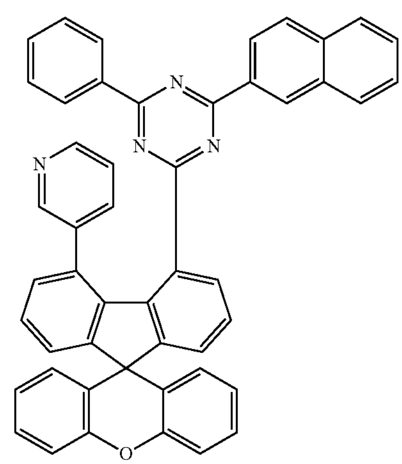

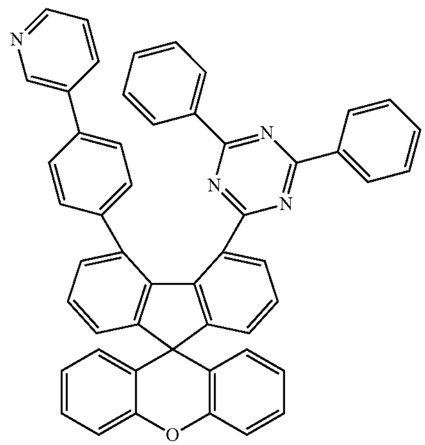
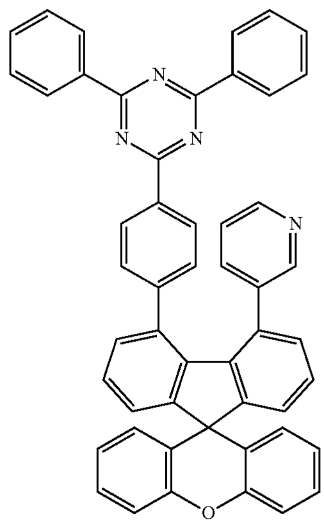
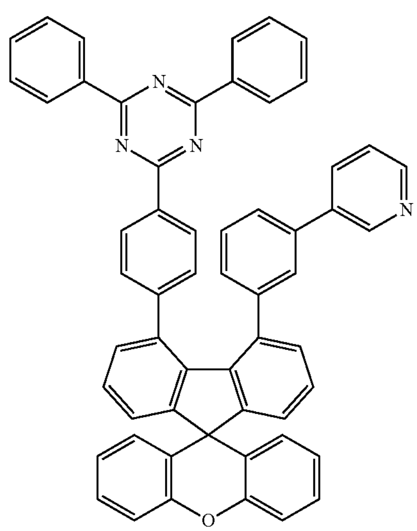
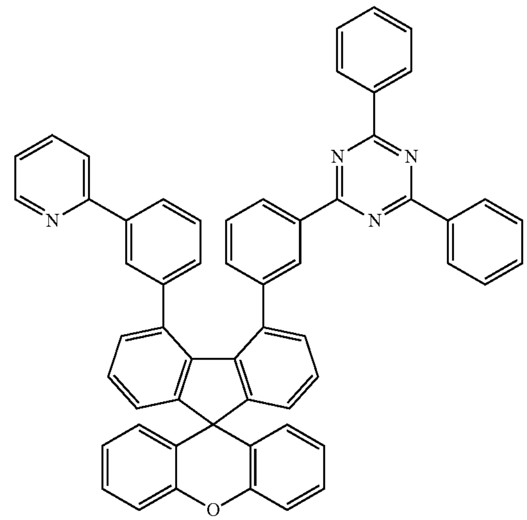
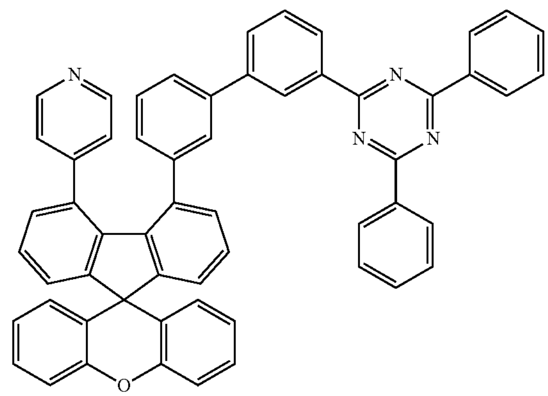
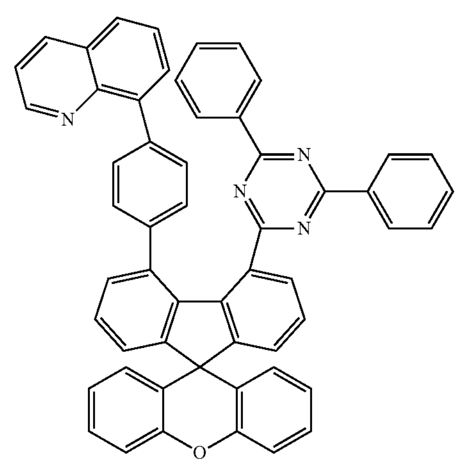

-continued
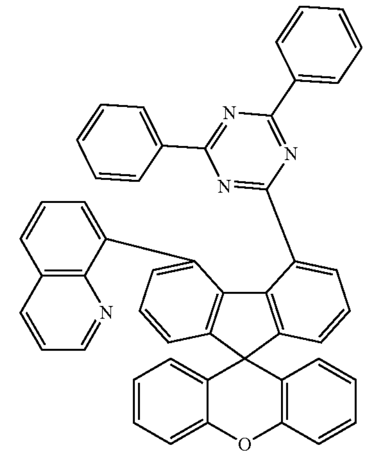
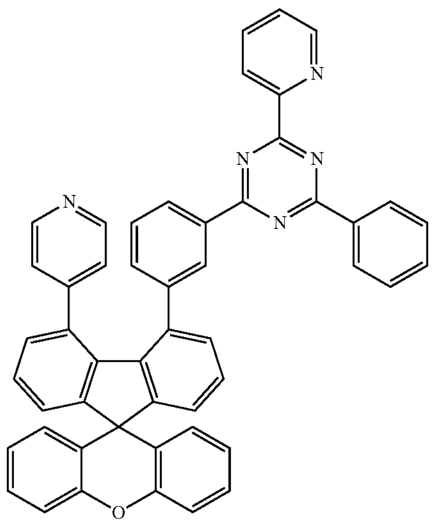
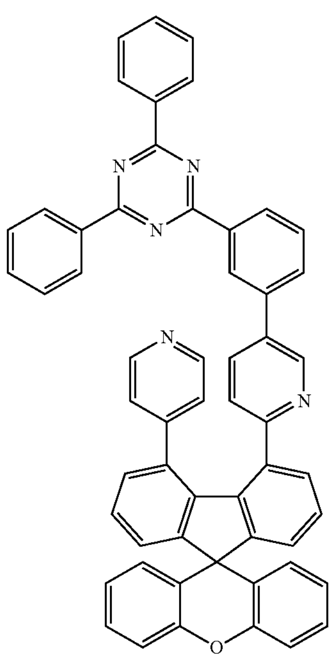
-continued
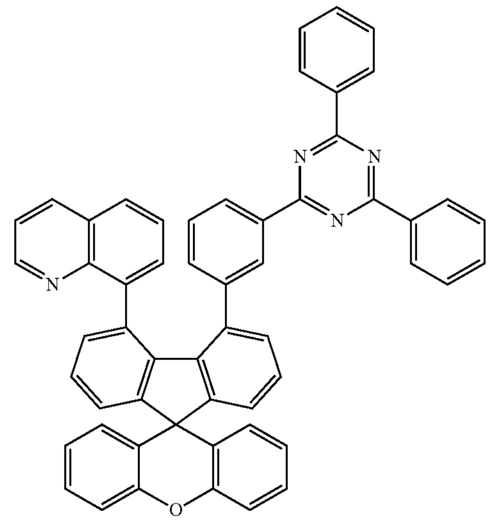
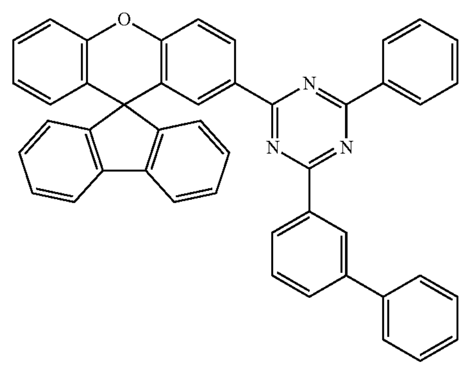
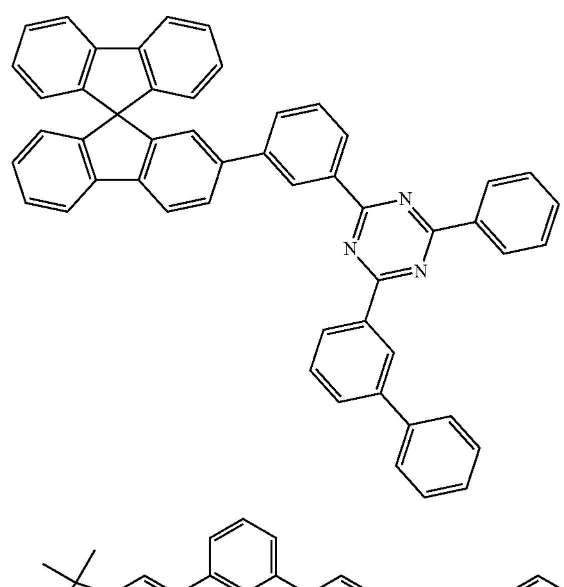
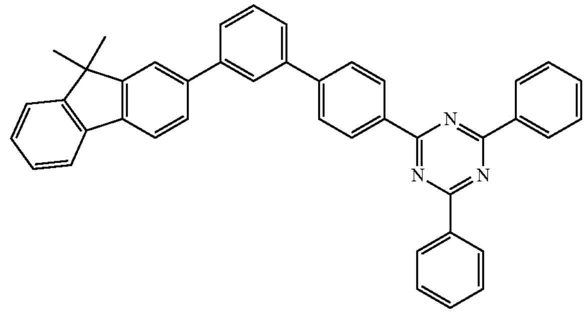

-continued
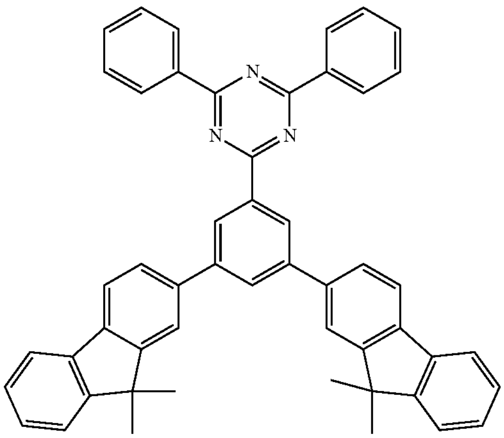
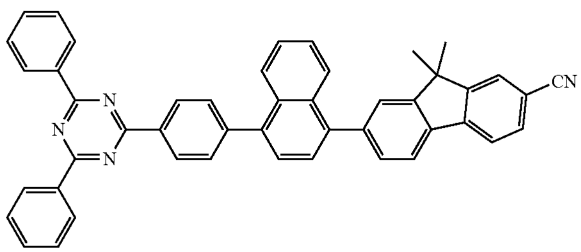
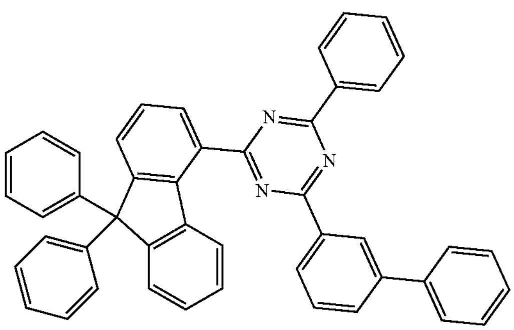
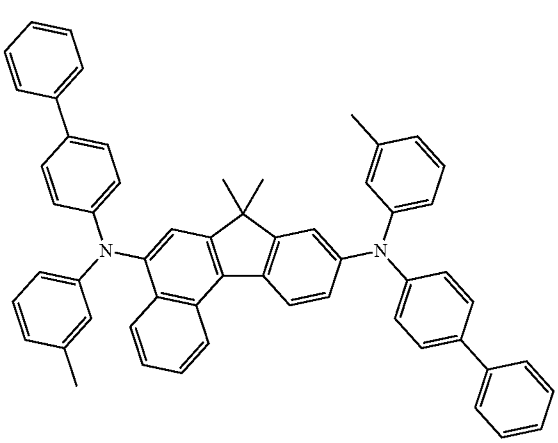
-continued
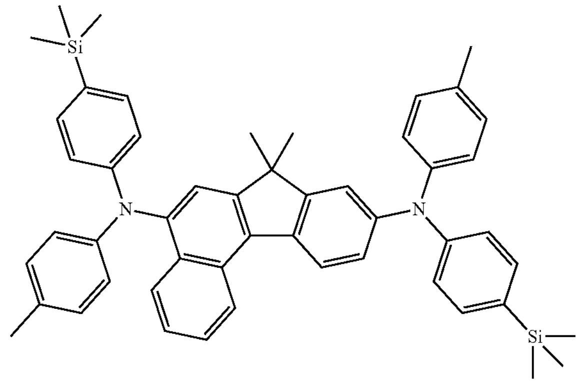
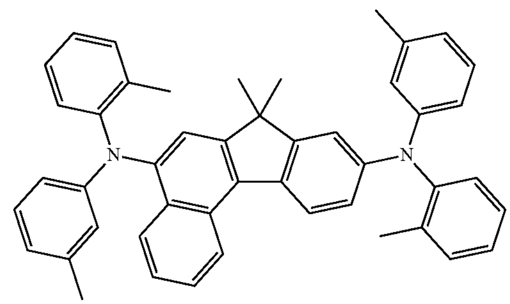
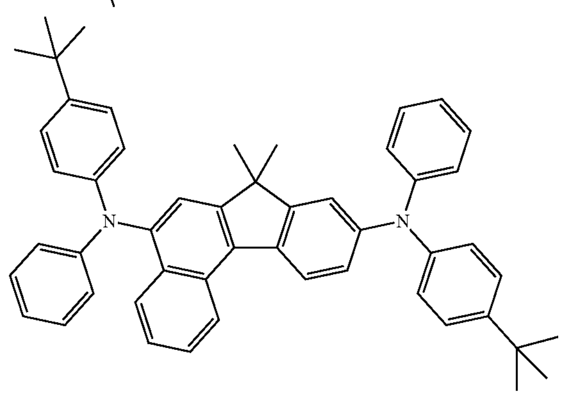
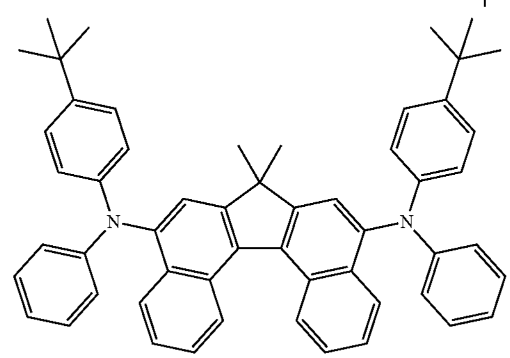
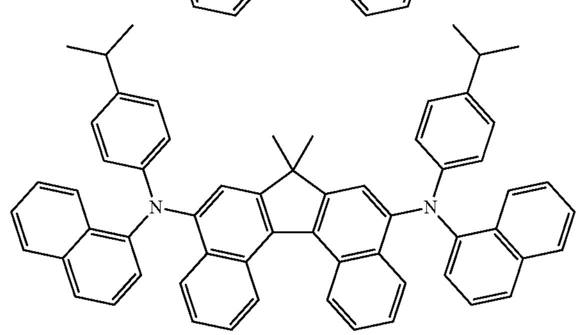

-continued
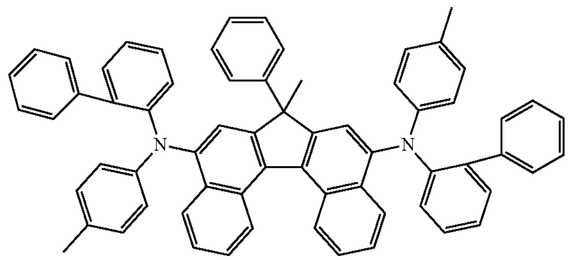
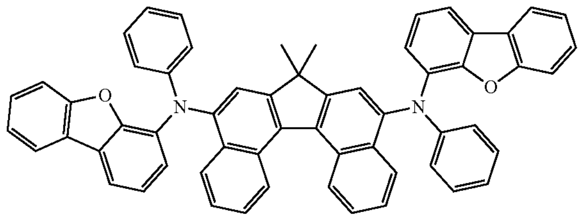
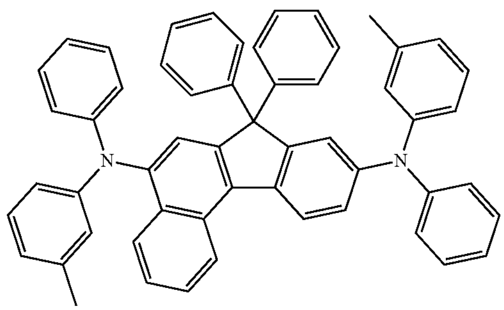
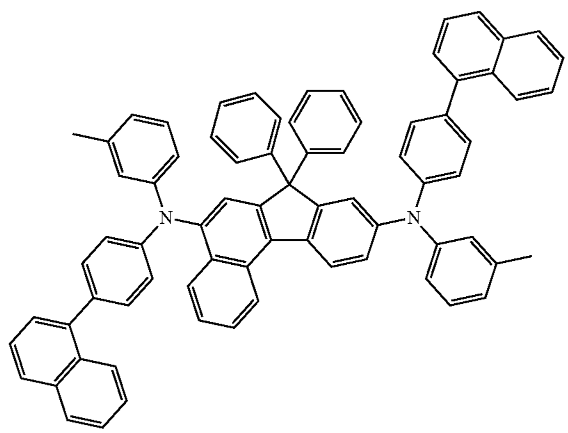
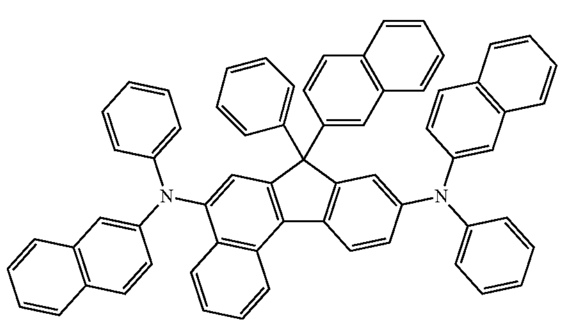
-continued
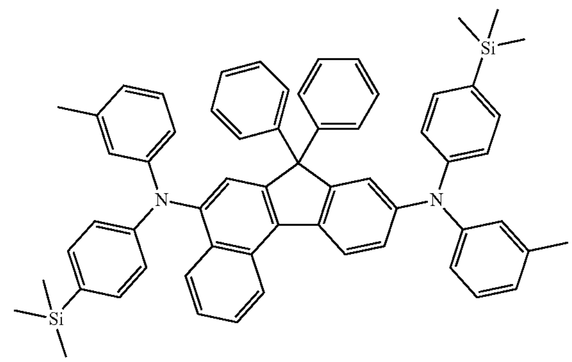
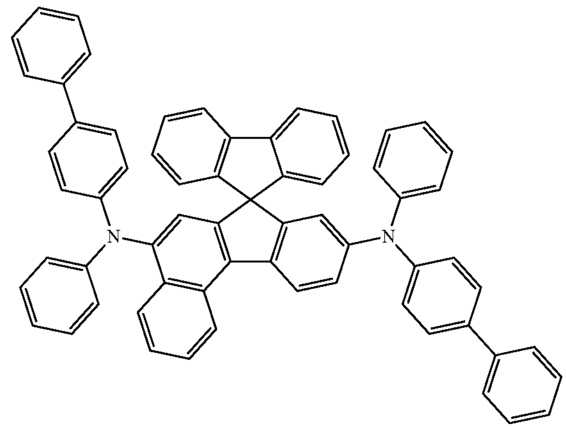
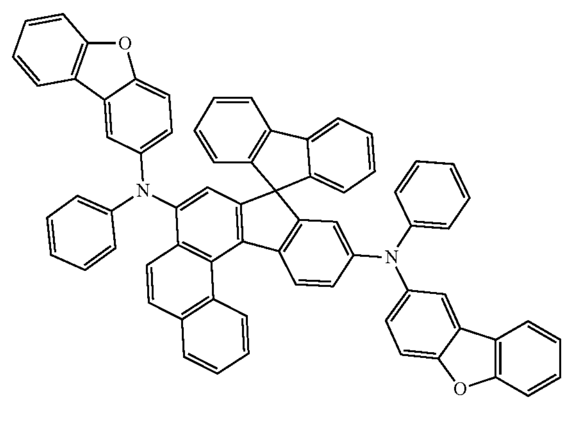
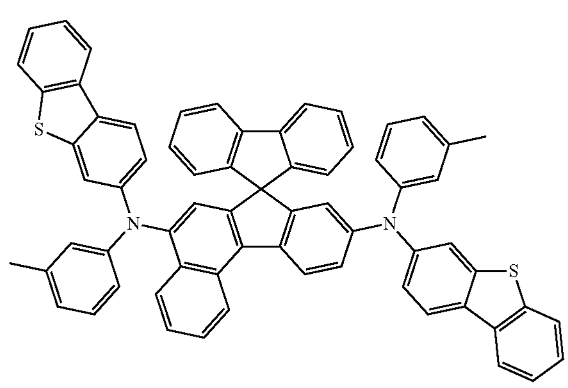

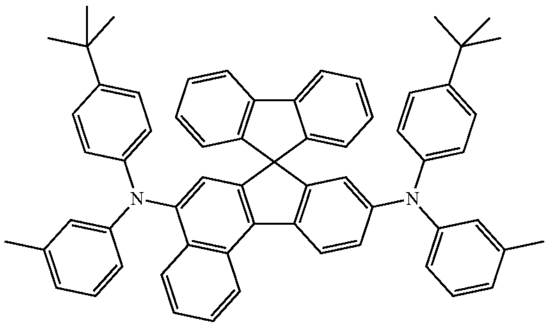
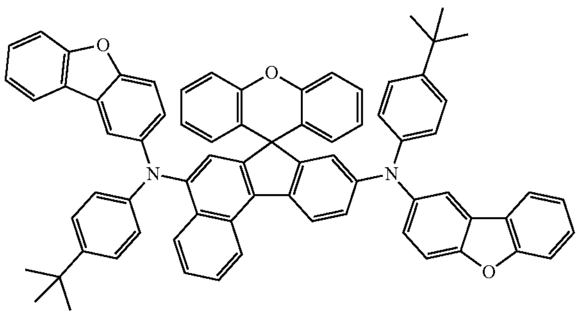
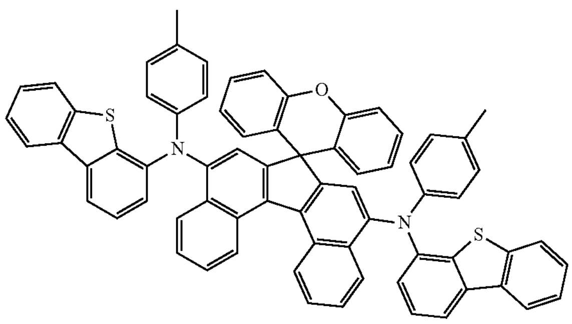
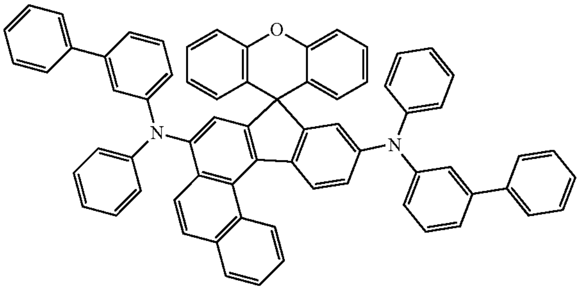
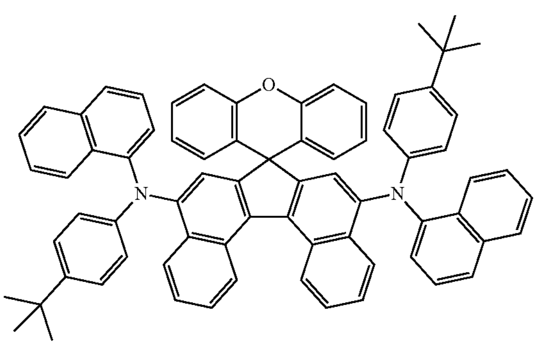
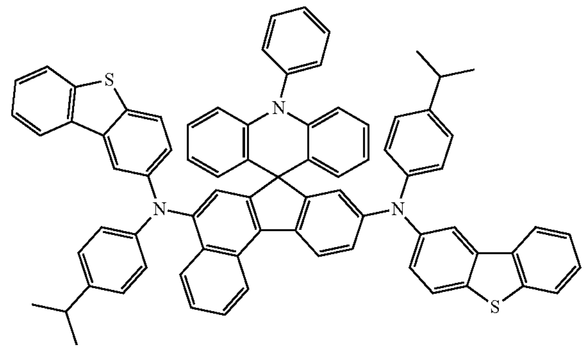
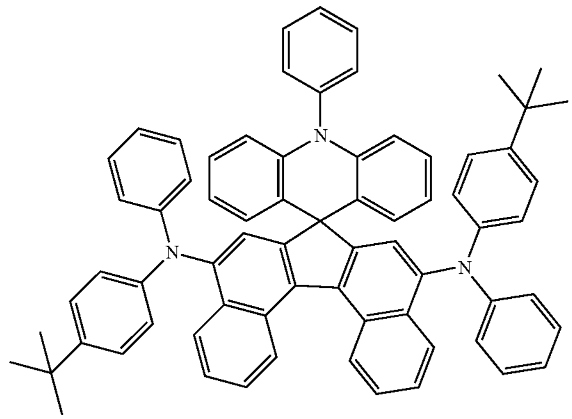
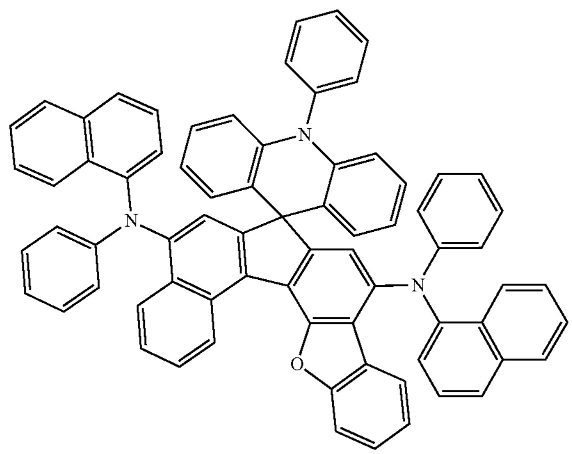
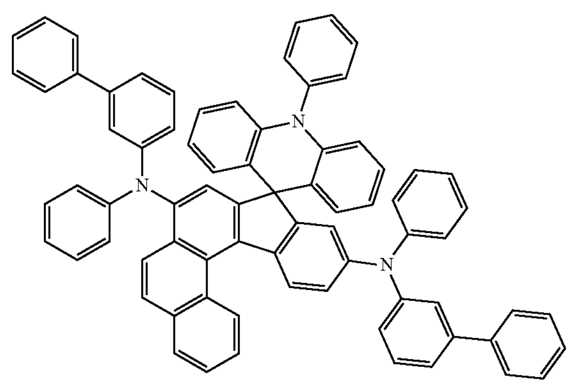

-continued
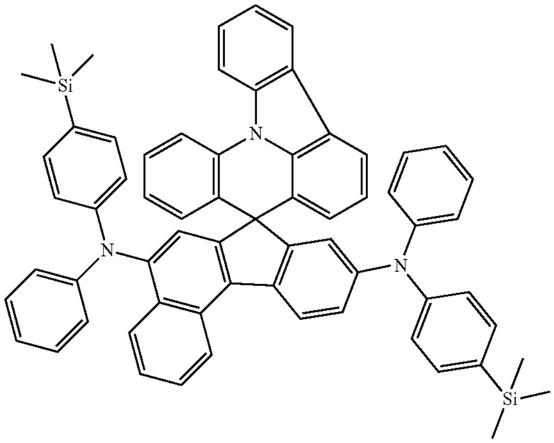
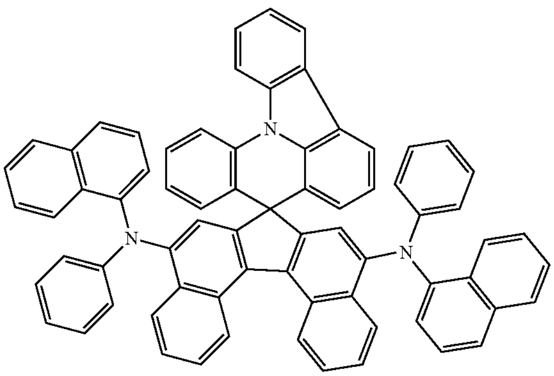
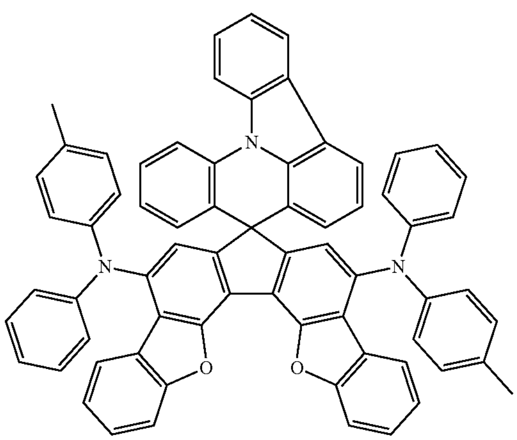
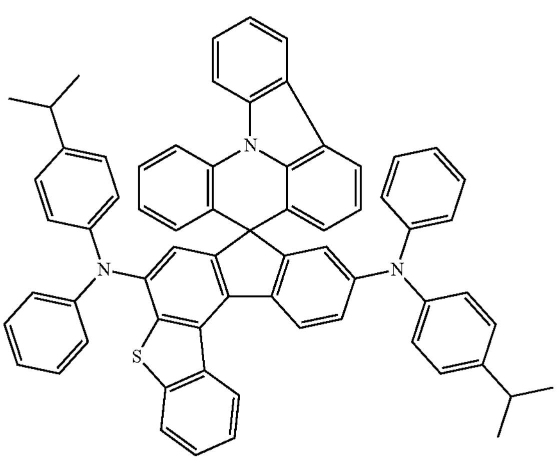
-continued
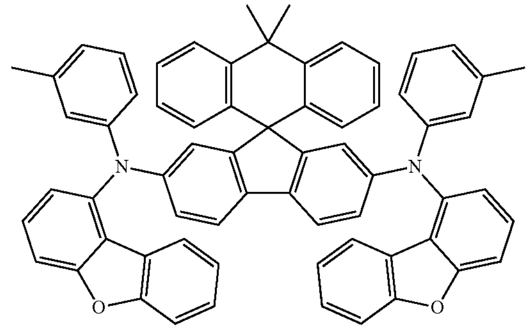
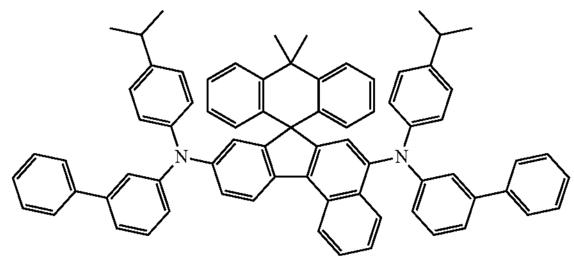
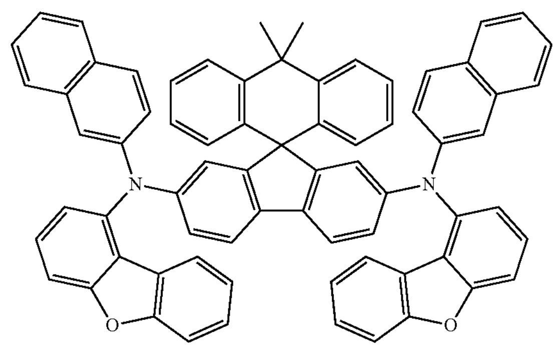
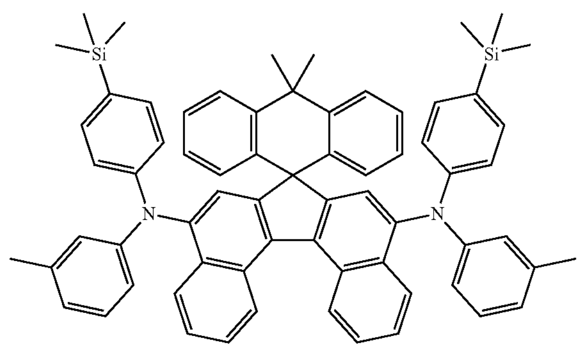
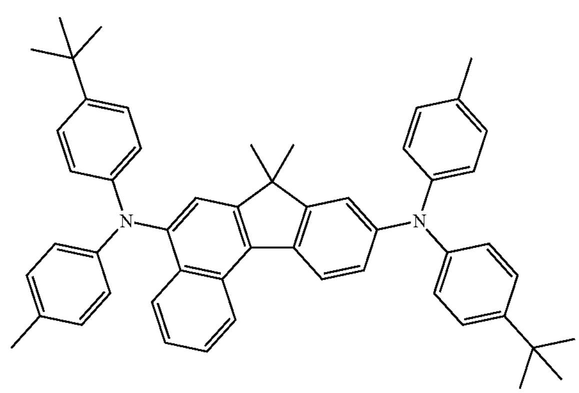

-continued
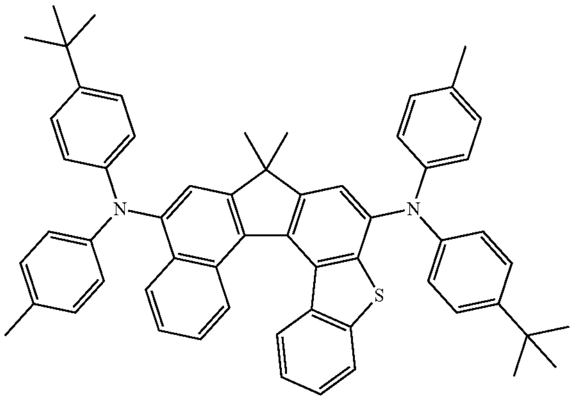
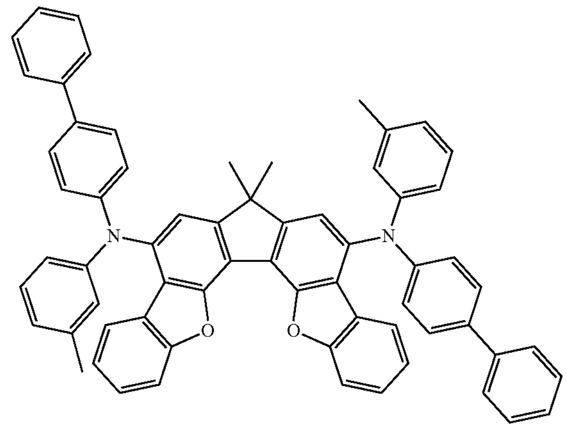
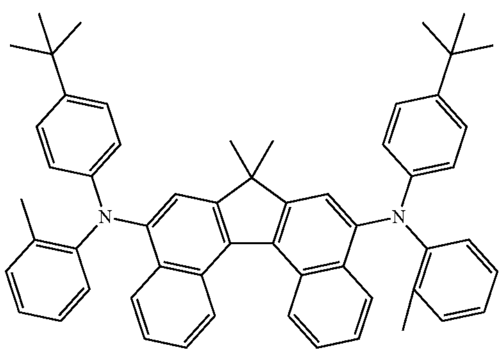
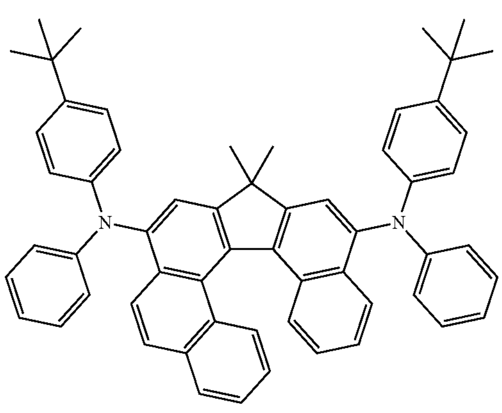
-continued
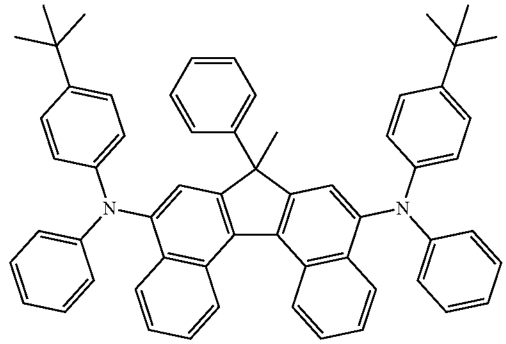
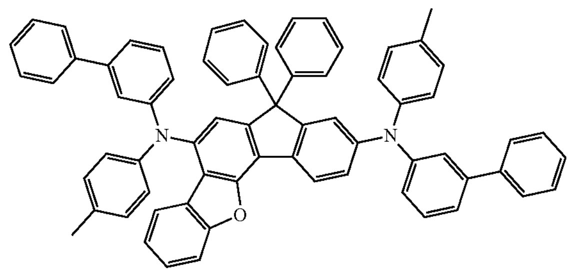
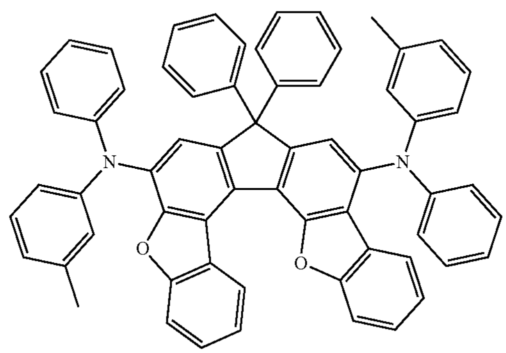
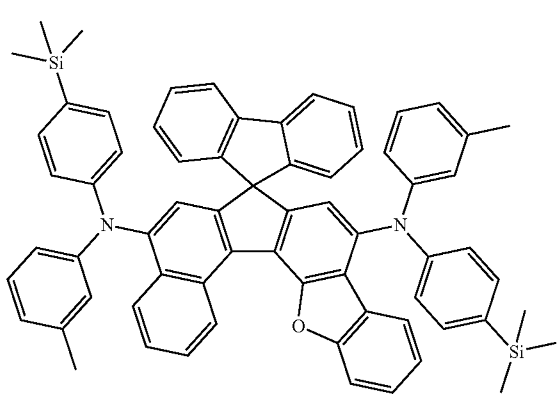

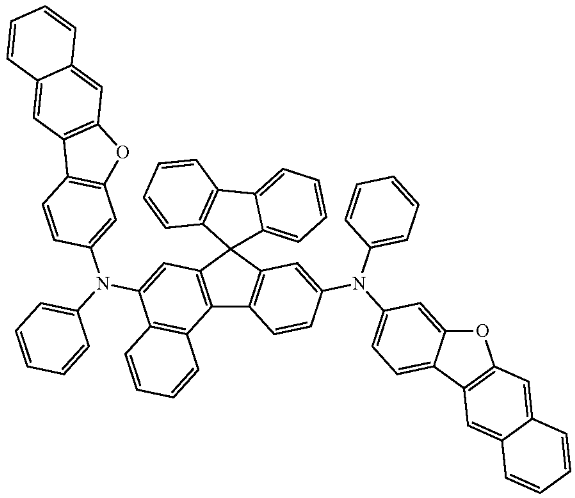
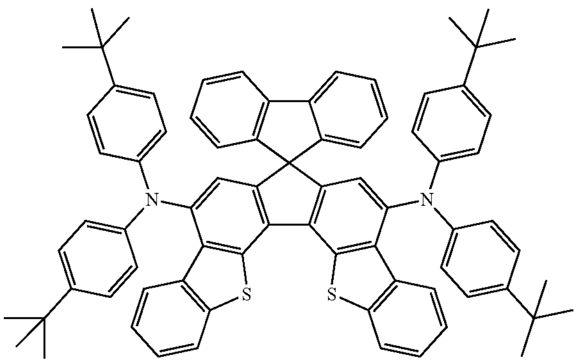
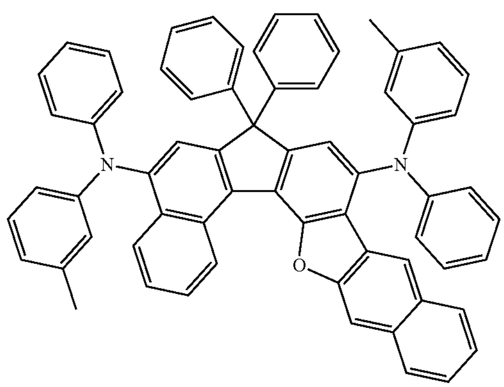
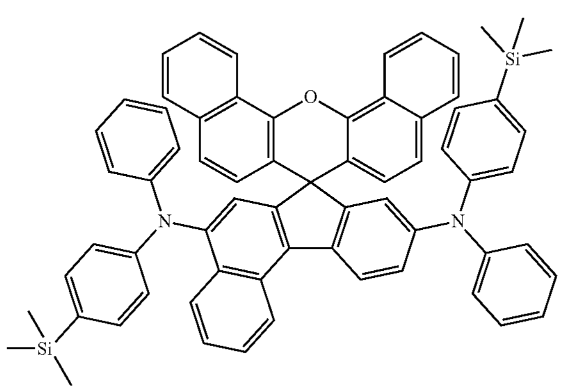
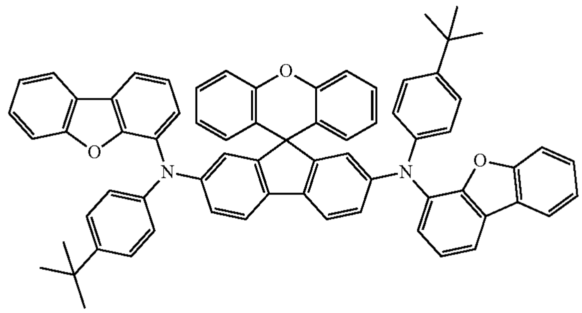
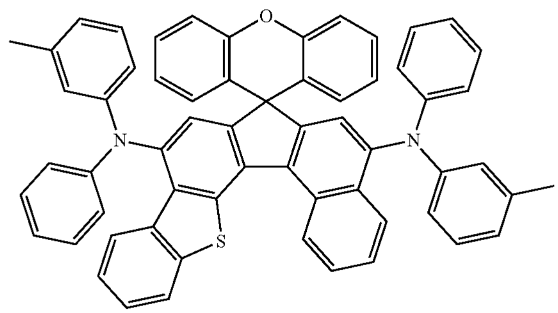
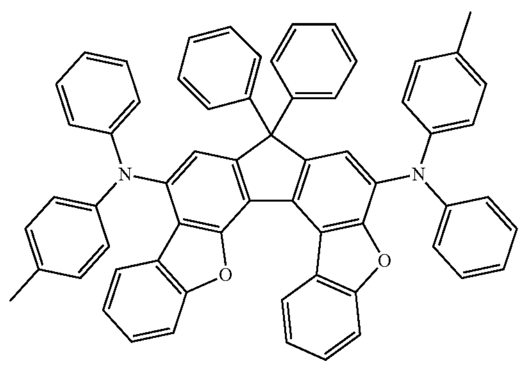
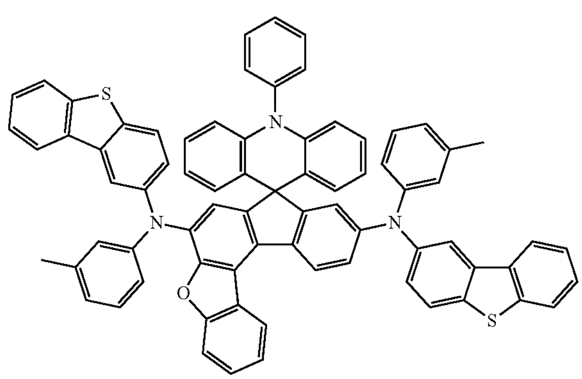

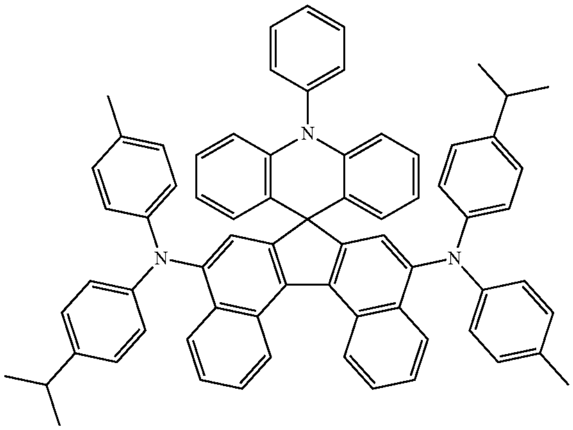
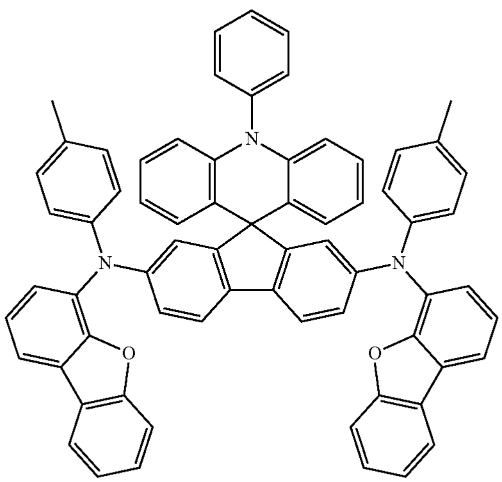
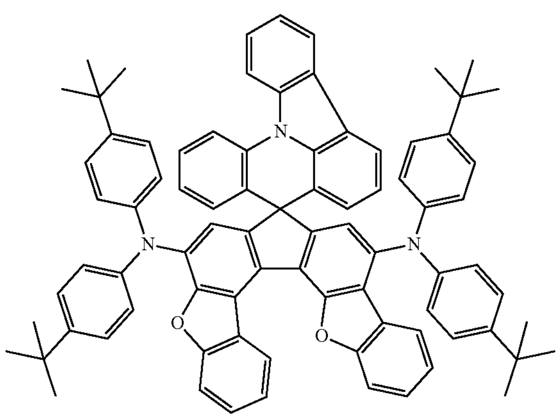
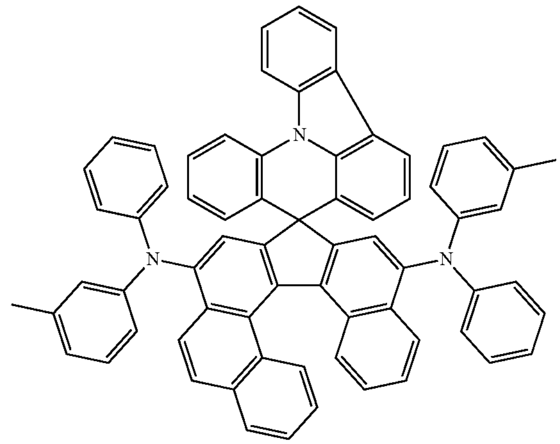
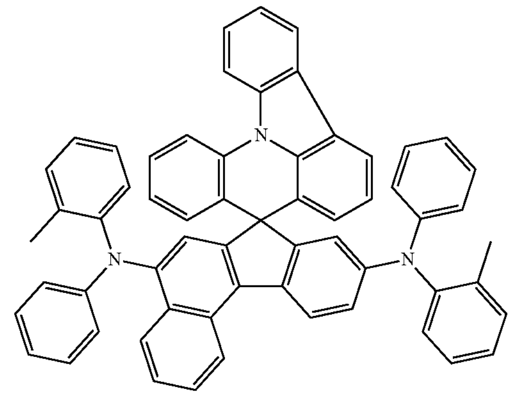
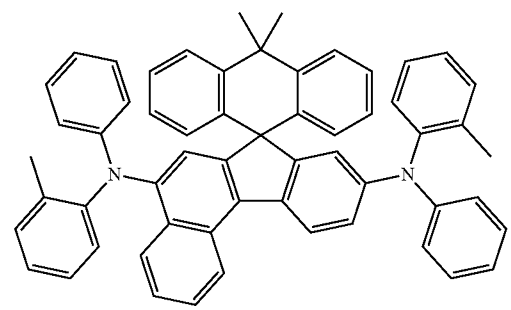
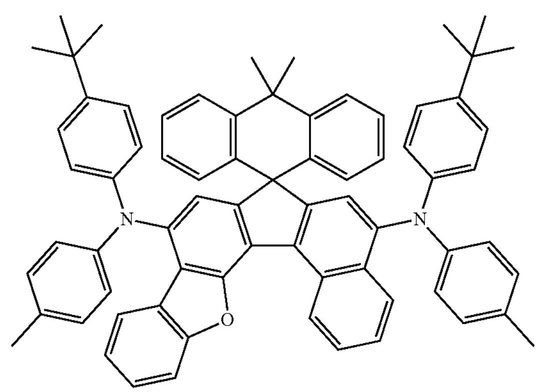

-continued
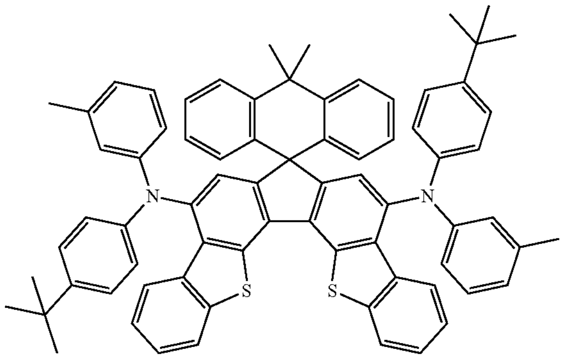 [SMILES: Cc1cccc(N(c2ccc(C(C)(C)C)cc2)c2cc3c(c4sc5ccccc5c24)-c2c(cc(N(c4ccc(C(C)(C)C)cc4)c4cccc(C)c4)c4c2sc2ccccc24)C32c3ccccc3C(C)(C)c3ccccc32)c1]
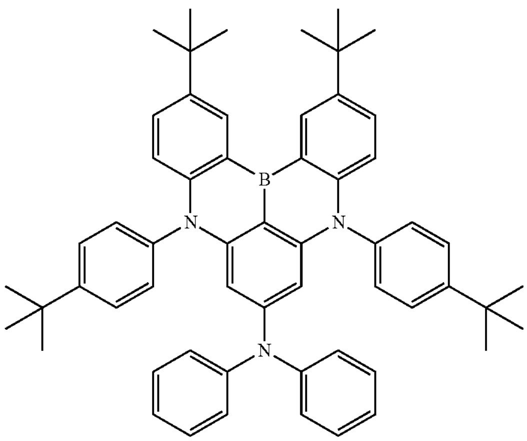
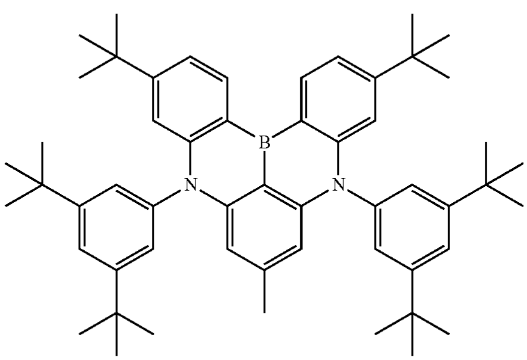
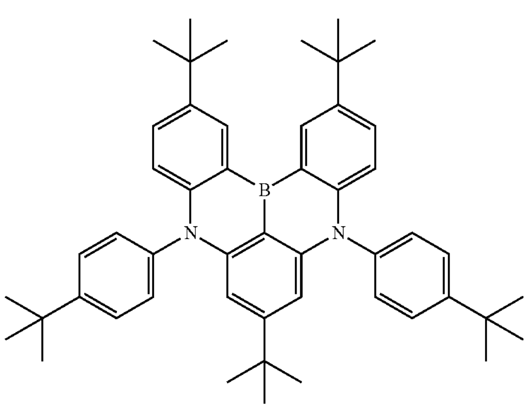
-continued
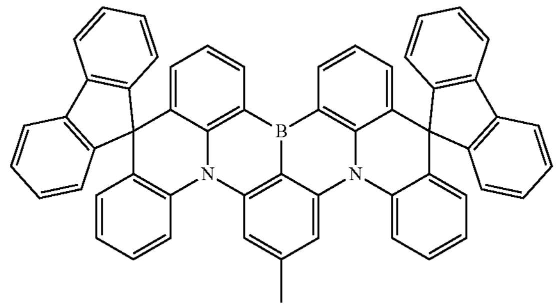
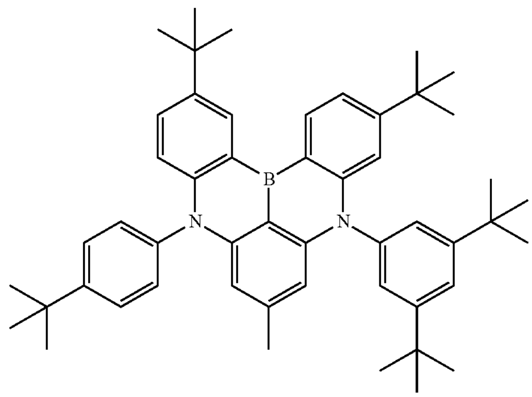
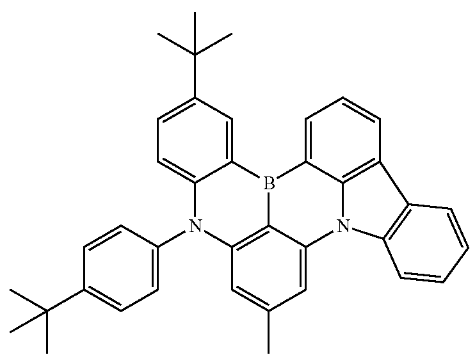
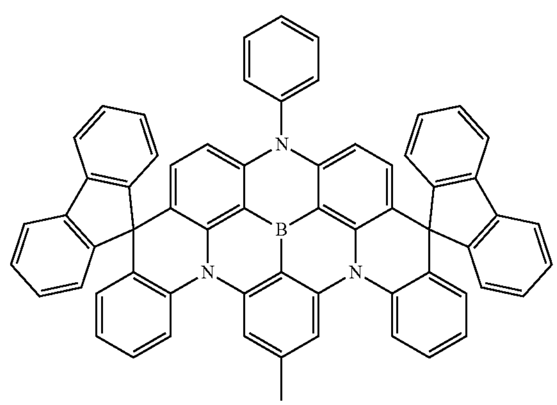

-continued
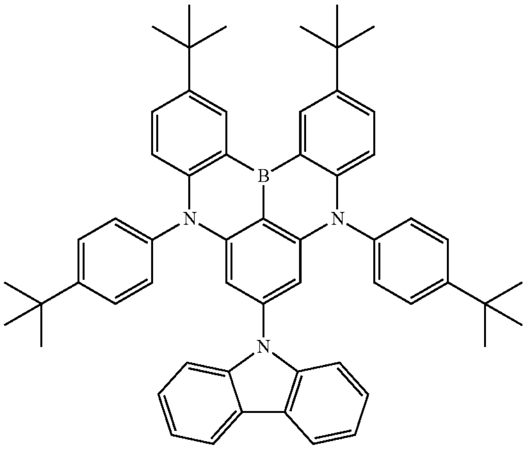
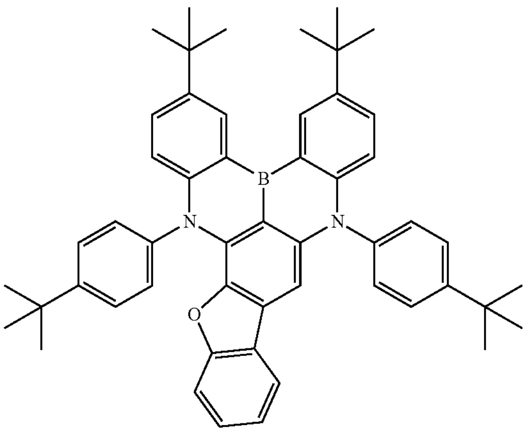
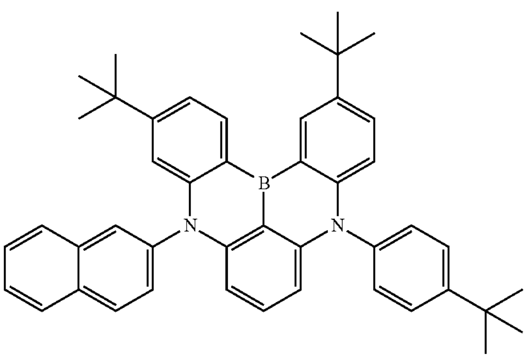
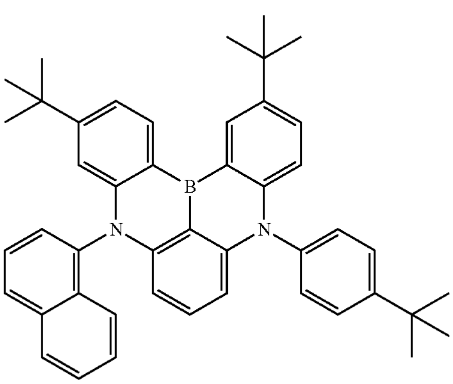
-continued
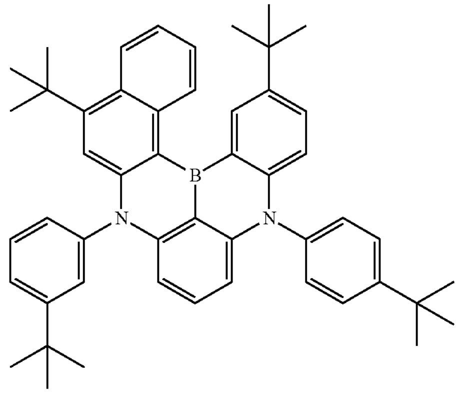
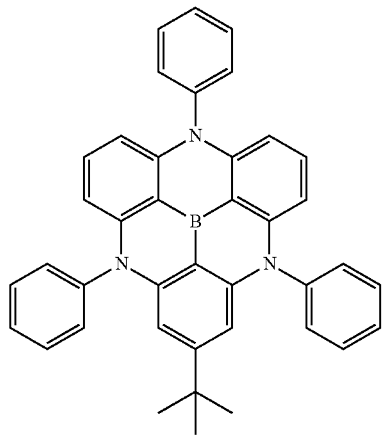
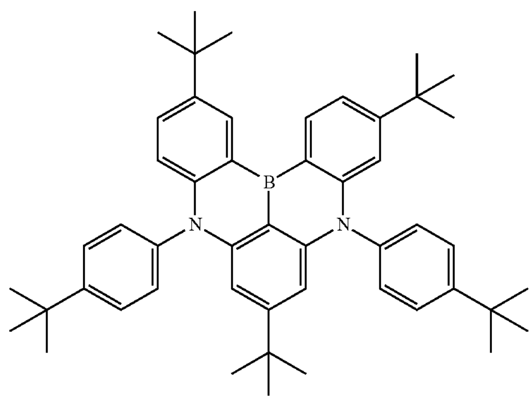
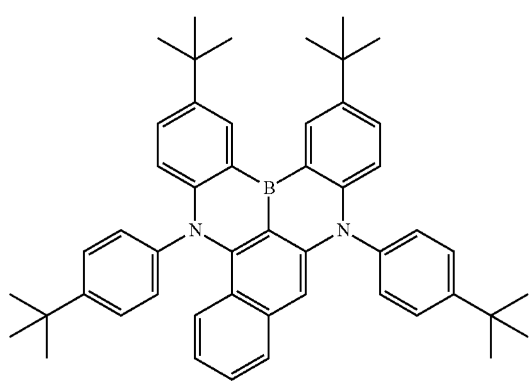

-continued

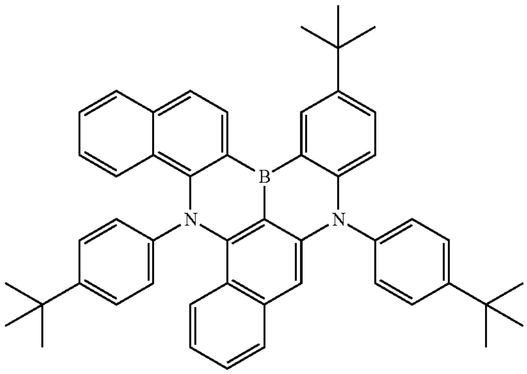

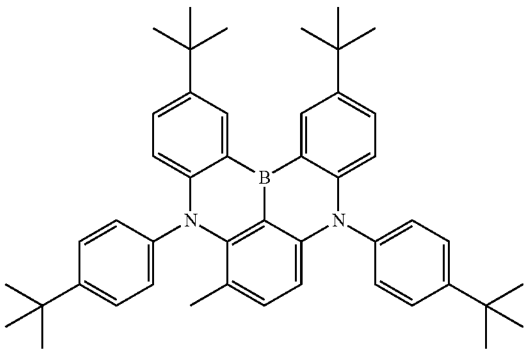

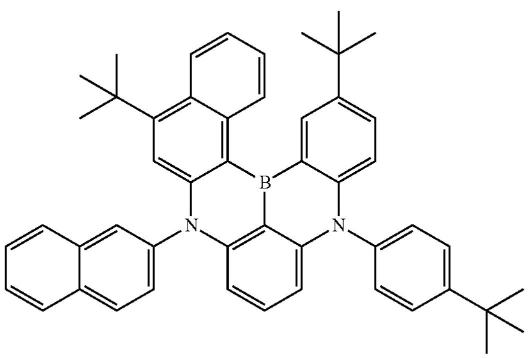

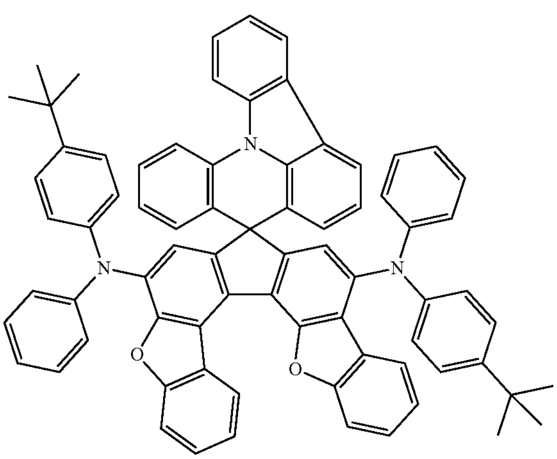

-continued

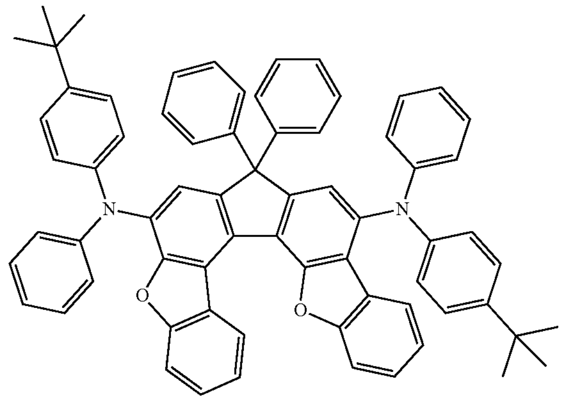

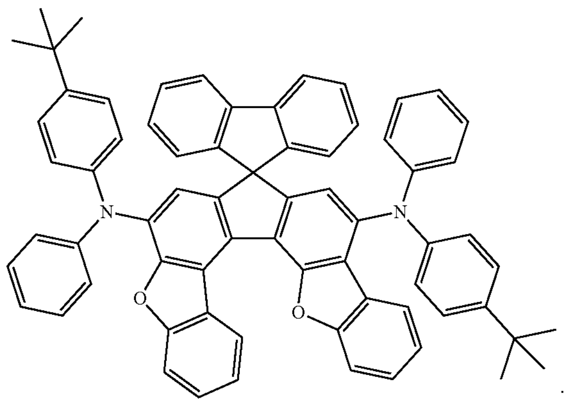 [SMILES: CC(C)(C)c1ccc(N(c2ccccc2)c2cc3c(c4c2oc2ccccc24)-c2c(cc(N(c4ccccc4)c4ccc(C(C)(C)C)cc4)c4c2oc2ccccc24)C32c3ccccc3-c3ccccc32)cc1]

According to an exemplary embodiment of the present invention, the light emitting layer further includes a dopant, and the compound composed of sp3 carbon as a center included in the light emitting layer is a dopant.

According to another exemplary embodiment, when the dopant of the light emitting layer is not a compound composed of sp3 carbon as a center, the dopant can be any one of the following structures:

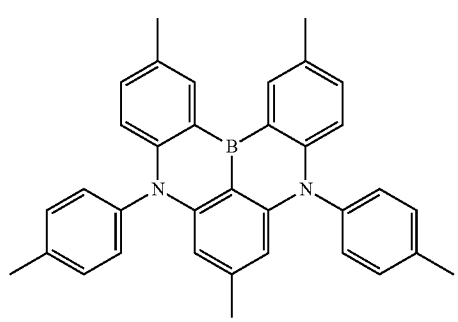

-continued

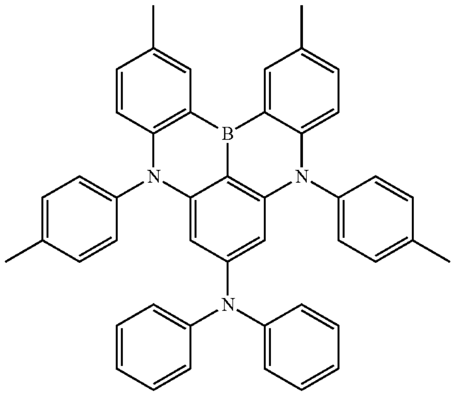

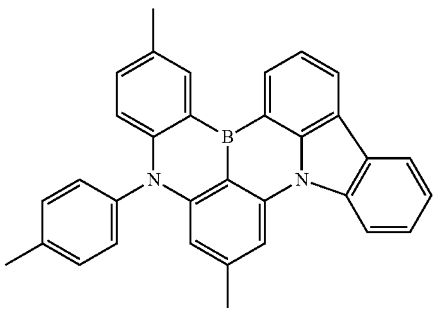

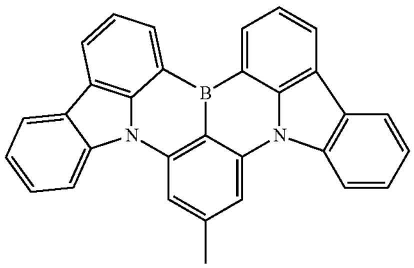

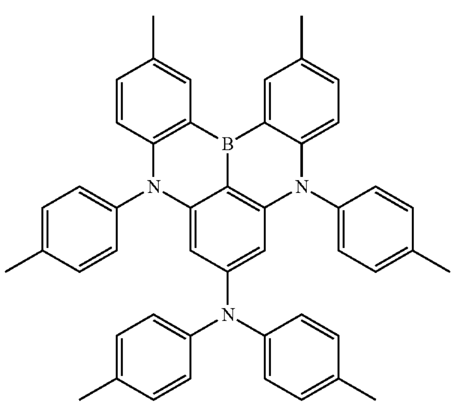

-continued

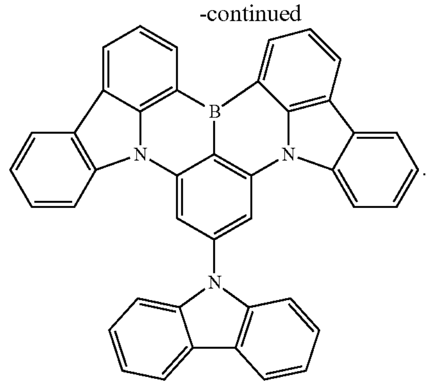

In an exemplary embodiment of the present invention, a host of the light emitting layer includes one or more anthracene-based compounds.

According to an exemplary embodiment of the present invention, the host of the light emitting layer includes one or more anthracene-based compounds, and the anthracene-based compound can be the following Formula 2-1 or 2-2:

[Formula 2-1]

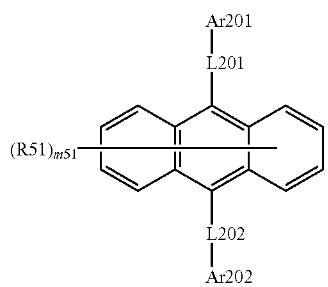

[Formula 2-2]

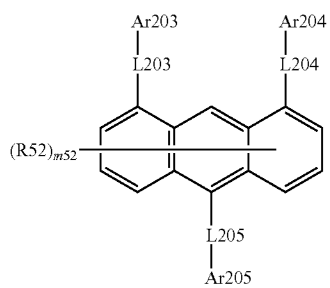

wherein in Formulae 2-1 and 2-2:

L201 to L205 are the same as or different from each other, and are each independently a direct bond, a substituted or unsubstituted arylene group, or a substituted or unsubstituted heteroarylene group;

Ar201 to Ar205 are the same as or different from each other, and are each independently a substituted or unsubstituted aryl group or a substituted or unsubstituted heteroaryl group;

R51 and R52 are the same as or different from each other, and are each independently hydrogen, deuterium, a cyano group, a substituted or unsubstituted alkyl group, a substituted or unsubstituted cycloalkyl group, a substituted or unsubstituted alkoxy group, a substituted or unsubstituted silyl group, a substituted or unsubstituted aryl group, or a substituted or unsubstituted heteroaryl group;

m51 is an integer from 0 to 8, and when m51 is 2 or higher, a plurality of R51s are the same as or different from each other; and m52 is an integer from 0 to 7, and when m52 is 2 or higher, a plurality of R52s are the same as or different from each other.

According to an exemplary embodiment of the present specification, L201 to L205 are the same as or different from each other, and are each independently a direct bond, a substituted or unsubstituted arylene group having 6 to 60 carbon atoms, or a substituted or unsubstituted heteroarylene group having 2 to 60 carbon atoms.

According to another exemplary embodiment, L201 to L205 are the same as or different from each other, and are each independently a direct bond, a substituted or unsubstituted phenylene group, a substituted or unsubstituted biphenylene group, a substituted or unsubstituted naphthylene group, or a substituted or unsubstituted terphenylene group.

In an exemplary embodiment of the present specification, Ar201 to Ar205 are the same as or different from each other, and are each independently a substituted or unsubstituted aryl group having 6 to 60 carbon atoms or a substituted or unsubstituted heteroaryl group having 2 to 60 carbon atoms.

According to another exemplary embodiment, Ar201 to Ar205 are the same as or different from each other, and are each independently an aryl group having 6 to 60 carbon atoms, which is unsubstituted or substituted with deuterium, a cyano group, a trialkylsilyl group having 1 to 20 carbon atoms, an alkyl group having 1 to 20 carbon atoms, or an aryl group having 6 to 30 carbon atoms; or a heteroaryl group having 2 to 60 carbon atoms, which is unsubstituted or substituted with deuterium, a cyano group, a trialkylsilyl group having 1 to 20 carbon atoms, an alkyl group having 1 to 20 carbon atoms, or an aryl group having 6 to 30 carbon atoms.

According to still another exemplary embodiment, Ar201 to Ar205 are the same as or different from each other, and are each independently a phenyl group which is unsubstituted or substituted with deuterium, a cyano group, a trialkylsilyl group having 1 to 20 carbon atoms, an alkyl group having 1 to 20 carbon atoms, or an aryl group having 6 to 30 carbon atoms; a biphenyl group which is unsubstituted or substituted with deuterium, a cyano group, a trialkylsilyl group having 1 to 20 carbon atoms, an alkyl group having 1 to 20 carbon atoms, or an aryl group having 6 to 30 carbon atoms; a naphthyl group which is unsubstituted or substituted with deuterium, a cyano group, a trialkylsilyl group having 1 to 20 carbon atoms, an alkyl group having 1 to 20 carbon atoms, or an aryl group having 6 to 30 carbon atoms; a terphenyl group which is unsubstituted or substituted with deuterium, a cyano group, a trialkylsilyl group having 1 to 20 carbon atoms, an alkyl group having 1 to 20 carbon atoms, or an aryl group having 6 to 30 carbon atoms; a fluorenyl group which is unsubstituted or substituted with deuterium, a cyano group, a trialkylsilyl group having 1 to 20 carbon atoms, an alkyl group having 1 to 20 carbon atoms, or an aryl group having 6 to 30 carbon atoms; a spirofluorenyl group which is unsubstituted or substituted with deuterium, a cyano group, a trialkylsilyl group having 1 to 20 carbon atoms, an alkyl group having 1 to 20 carbon atoms, or an aryl group having 6 to 30 carbon atoms; a thiophene group which is unsubstituted or substituted with deuterium, a cyano group, a trialkylsilyl group having 1 to 20 carbon atoms, an alkyl group having 1 to 20 carbon atoms, or an aryl group having 6 to 30 carbon atoms; an indolocarbazole group which is unsubstituted or substituted with deuterium, a cyano group, a trialkylsilyl group having 1 to 20 carbon atoms, an alkyl group having 1 to 20 carbon atoms, or an aryl group having 6 to 30 carbon atoms; a dibenzofuran group which is unsubstituted or substituted with deuterium, a cyano group, a trialkylsilyl group having 1 to 20 carbon atoms, an alkyl group having 1 to 20 carbon atoms, or an aryl group having 6 to 30 carbon atoms; a dibenzothiophene group which is unsubstituted or substituted with deuterium, a cyano group, a trialkylsilyl group having 1 to 20 carbon atoms, an alkyl group having 1 to 20 carbon atoms, or an aryl group having 6 to 30 carbon atoms; a spirofluorenexanthene group which is unsubstituted or substituted with deuterium, a cyano group, a trialkylsilyl group having 1 to 20 carbon atoms, an alkyl group having 1 to 20 carbon atoms, or an aryl group having 6 to 30 carbon atoms; a spirofluorenethioxanthene group which is unsubstituted or substituted with deuterium, a cyano group, a trialkylsilyl group having 1 to 20 carbon atoms, an alkyl group having 1 to 20 carbon atoms, or an aryl group having 6 to 30 carbon atoms;

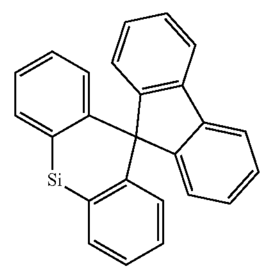

which is unsubstituted or substituted with deuterium, a cyano group, a trialkylsilyl group having 1 to 20 carbon atoms, an alkyl group having 1 to 20 carbon atoms, or an aryl group having 6 to 30 carbon atoms; or

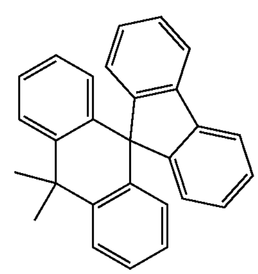 [SMILES: CC1(C)c2ccccc2C2(c3ccccc3-c3ccccc32)c2ccccc21]

which is unsubstituted or substituted with deuterium, a cyano group, a trialkylsilyl group having 1 to 20 carbon atoms, an alkyl group having 1 to 20 carbon atoms, or an aryl group having 6 to 30 carbon atoms.

In an exemplary embodiment of the present invention, the compound of Formula 2-1 or 2-2 can be any one of the following compounds:
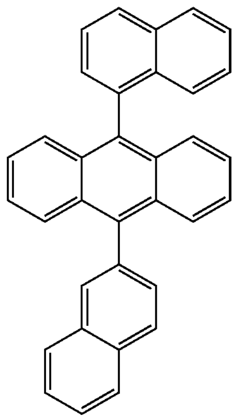
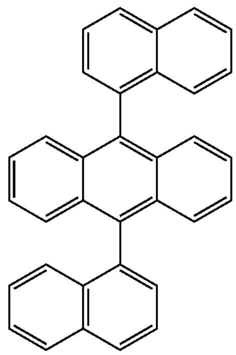
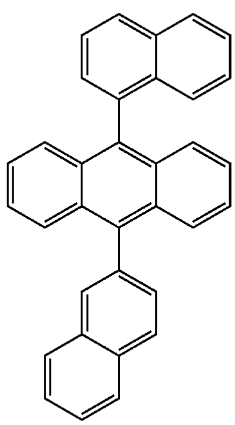
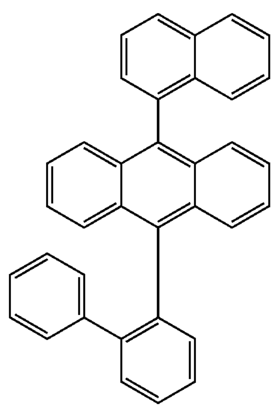
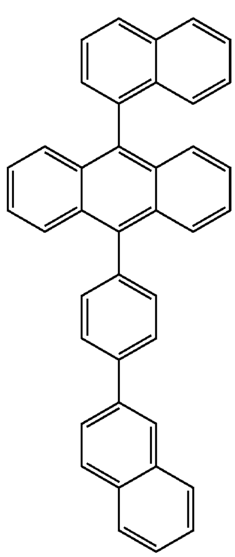
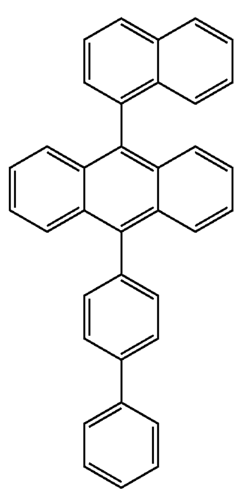
-continued
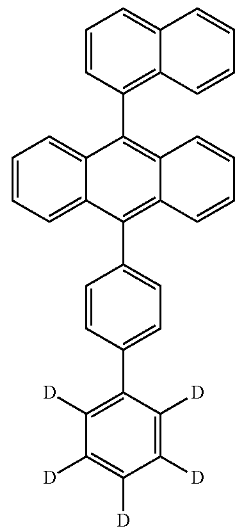
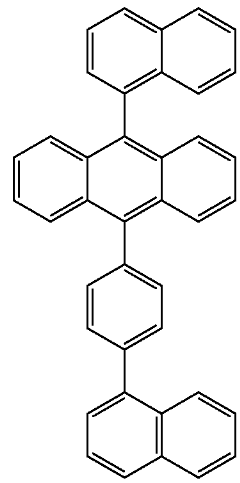
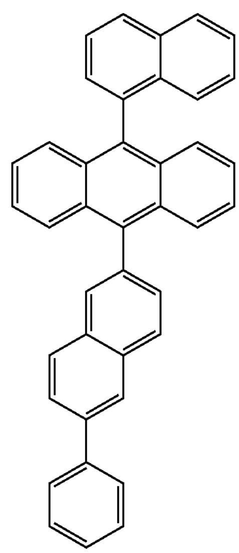
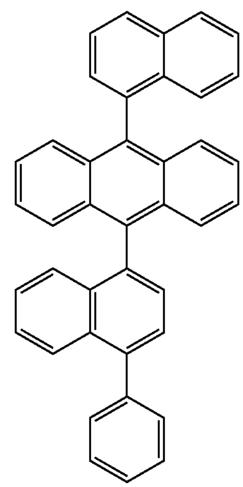
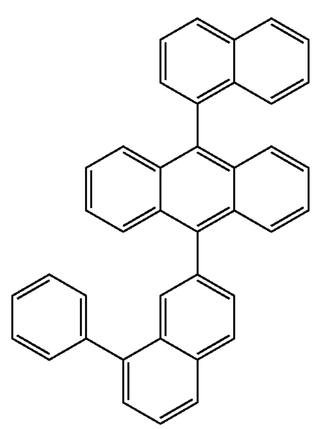

-continued
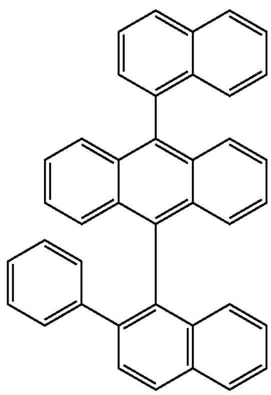
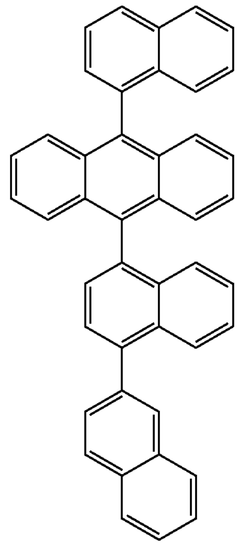
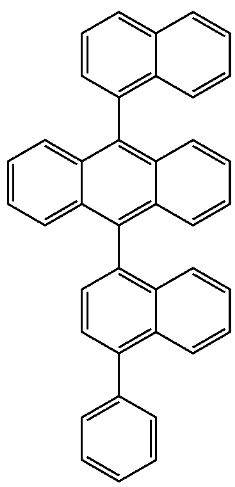
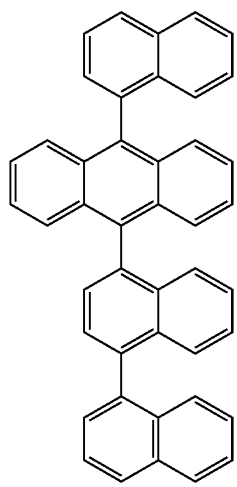
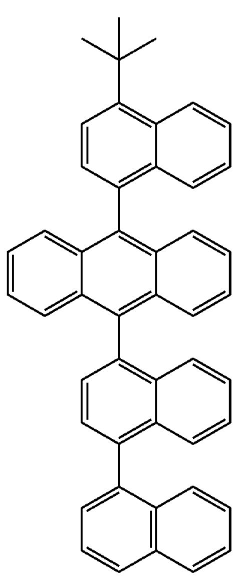
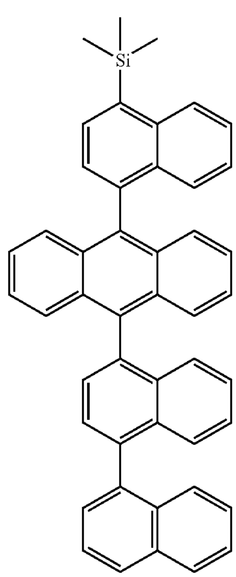
-continued
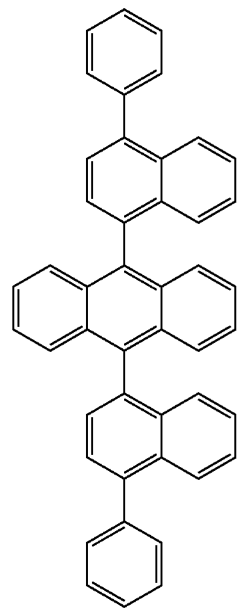
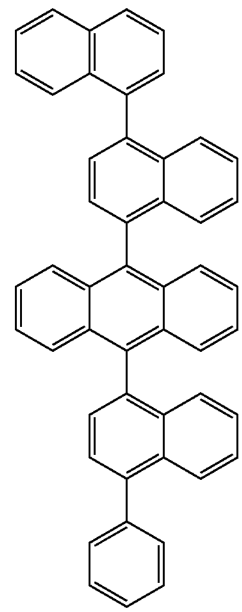
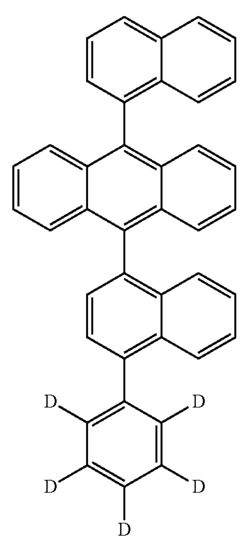
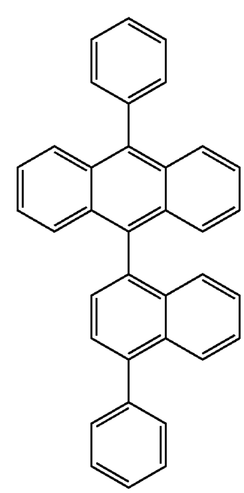

-continued
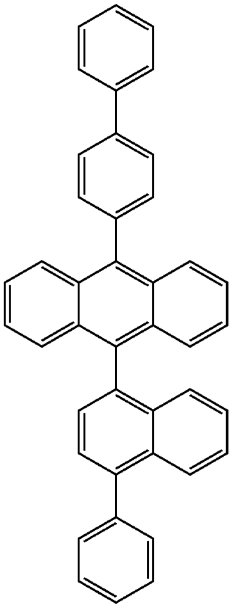
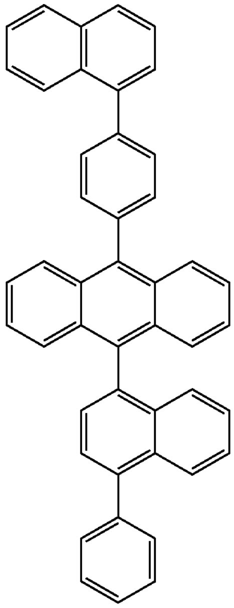
-continued
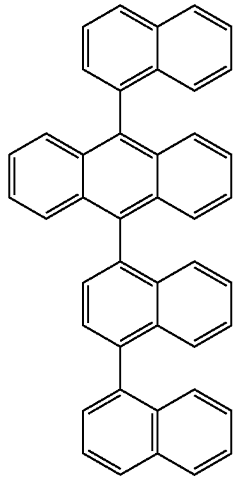
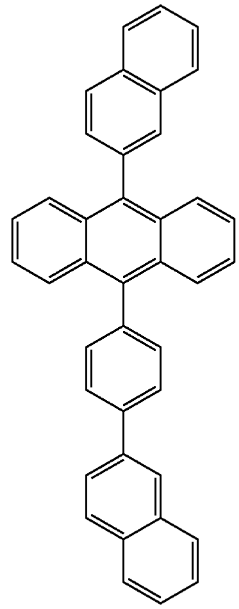
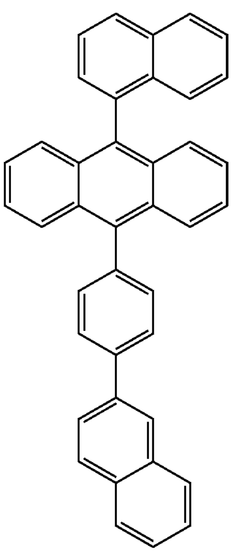
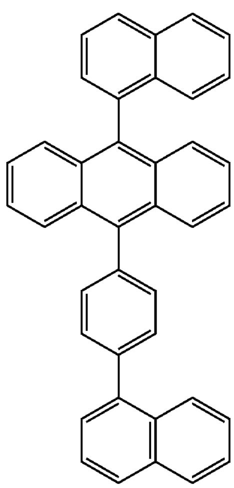
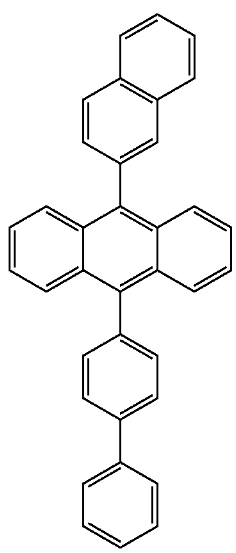
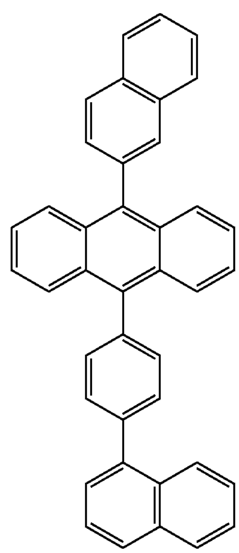

-continued
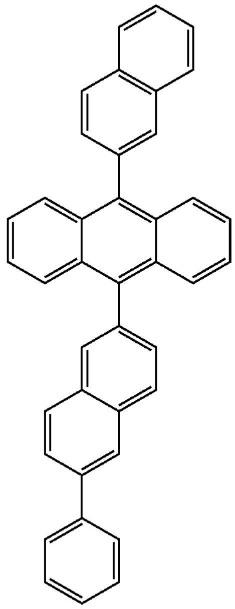
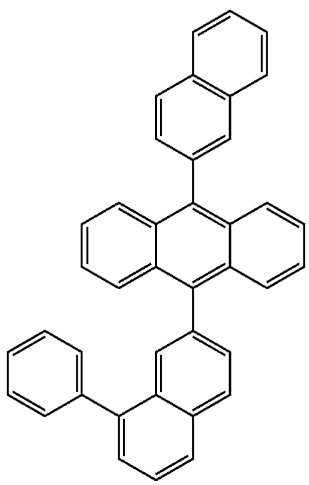
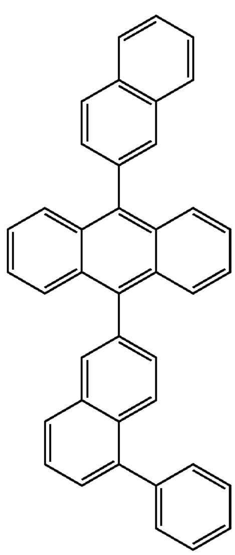
-continued
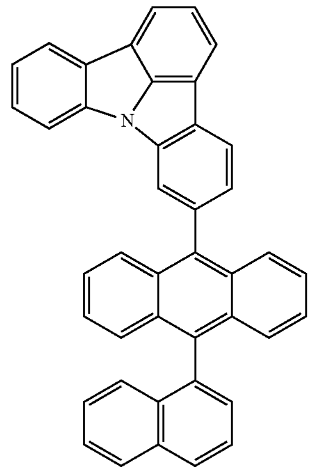
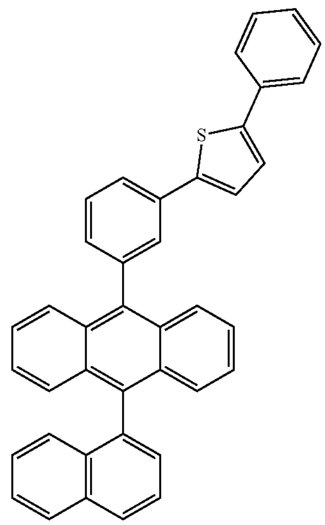
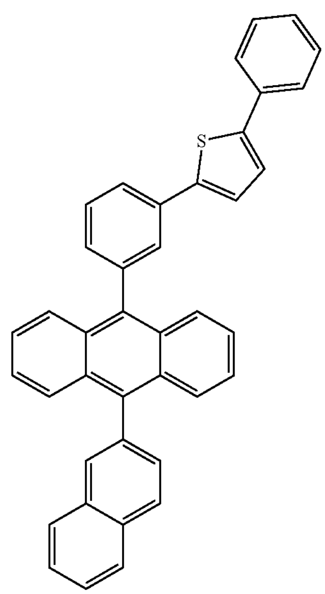

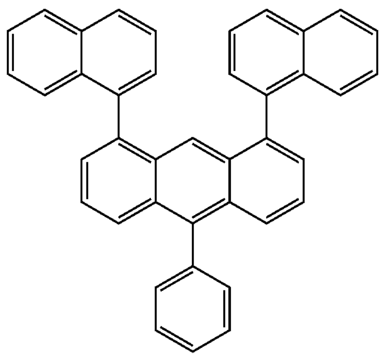
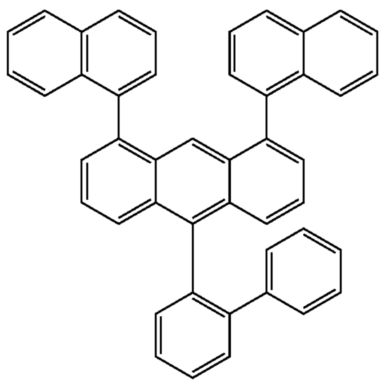
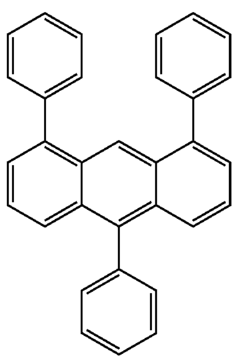
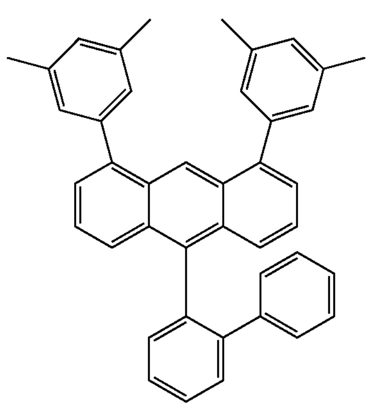
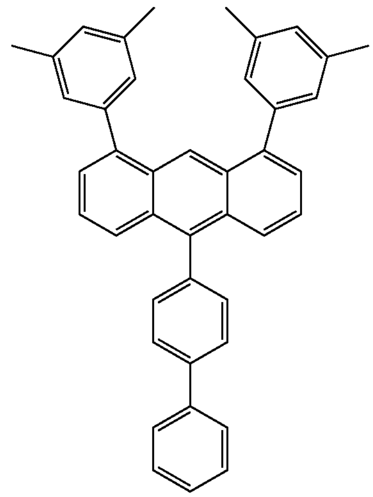
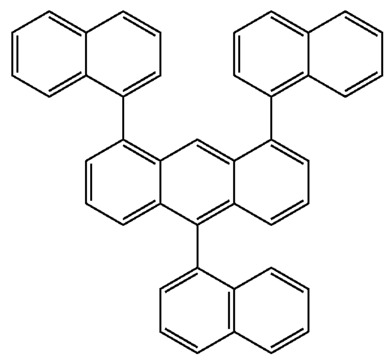
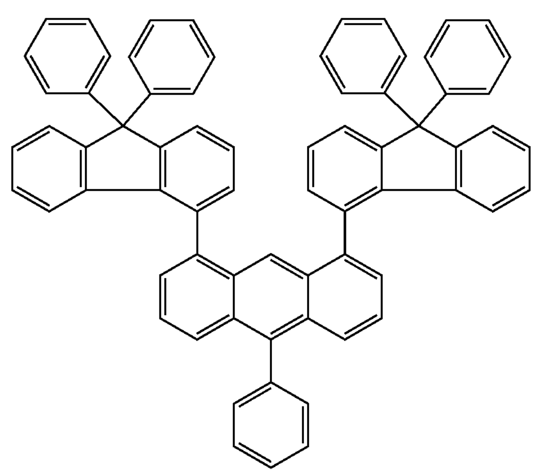

-continued
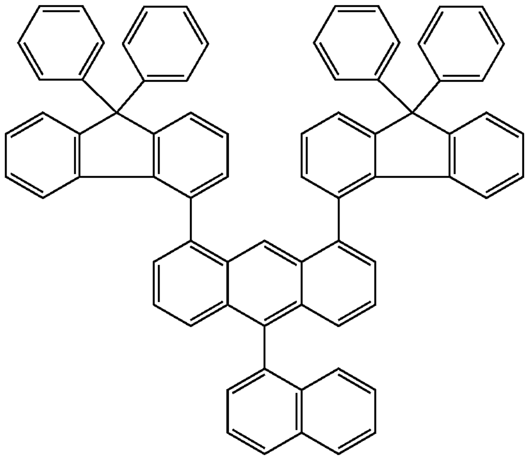
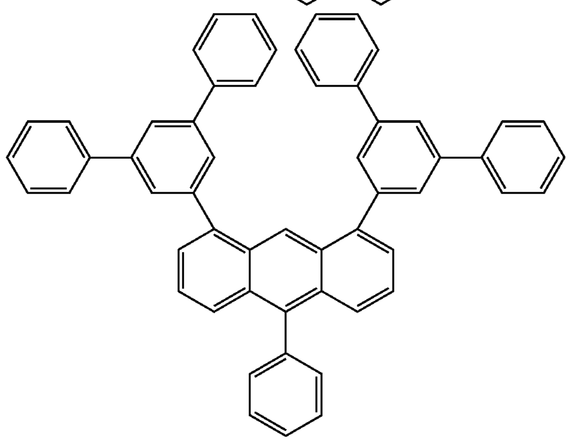
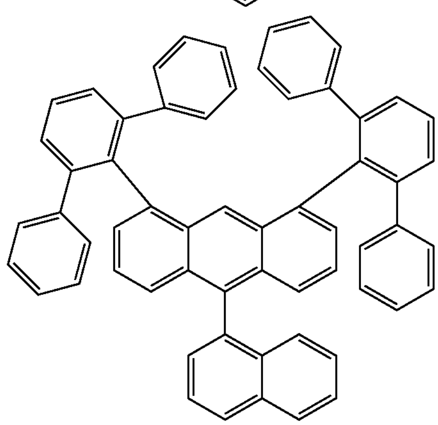
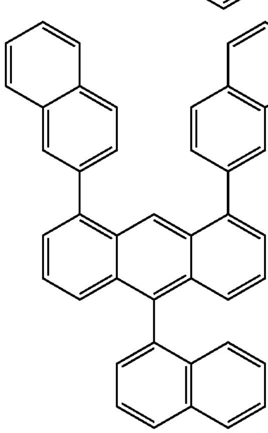
-continued
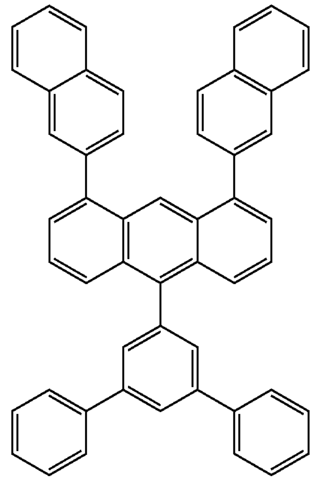
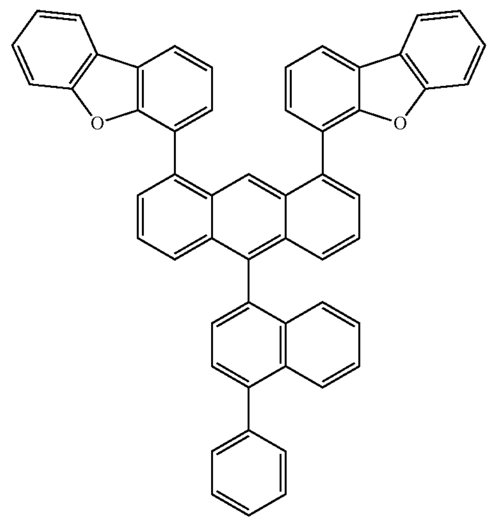
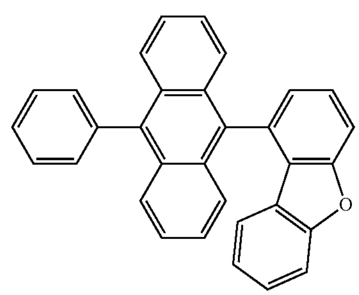
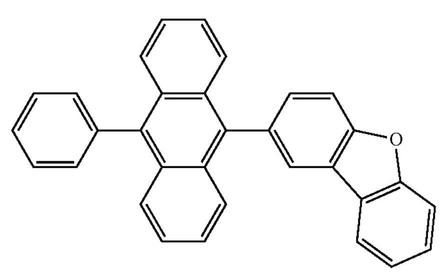

-continued
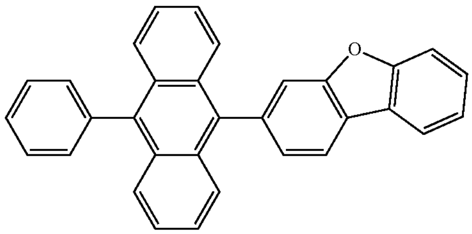
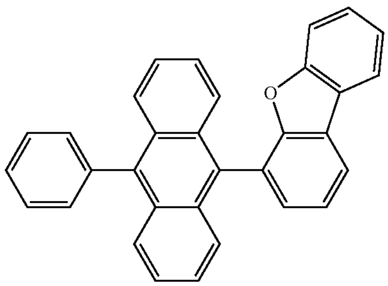
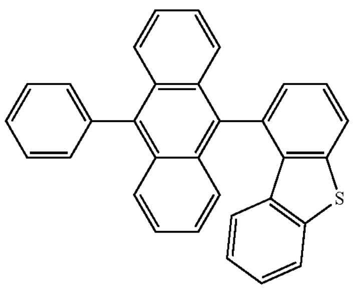
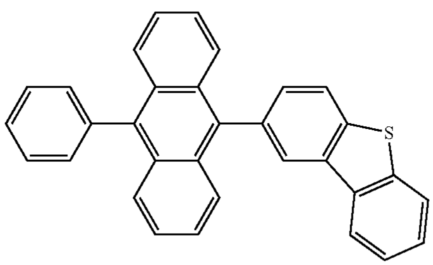
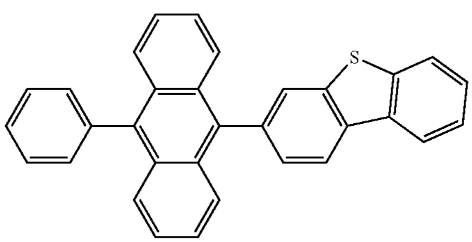
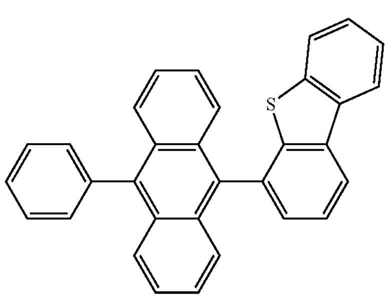
-continued
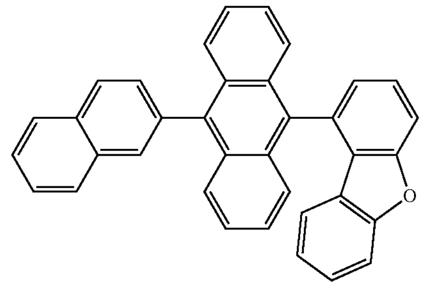
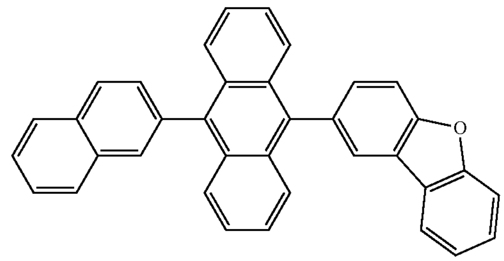
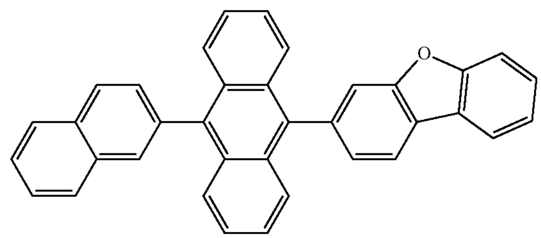
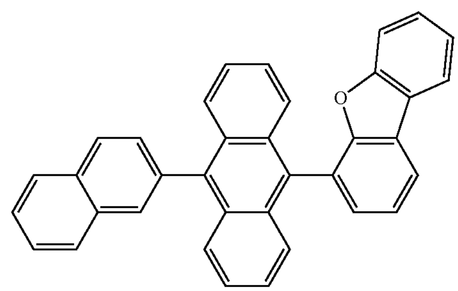
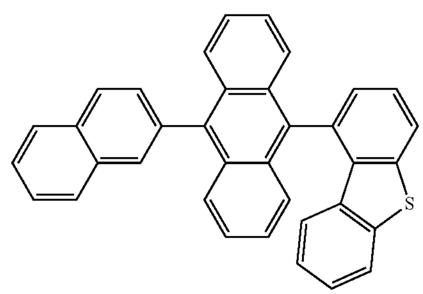
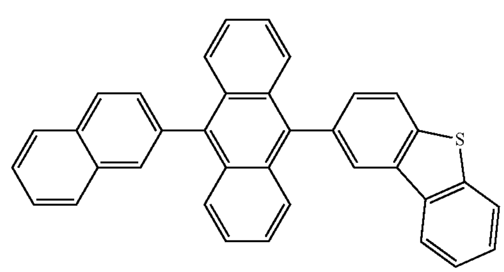

-continued
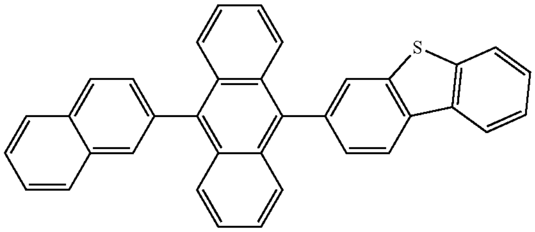
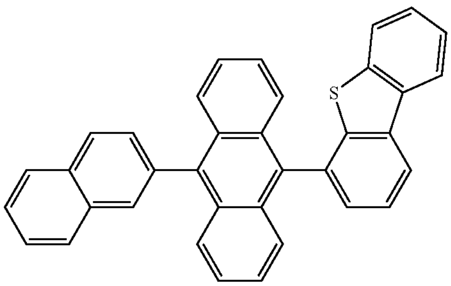
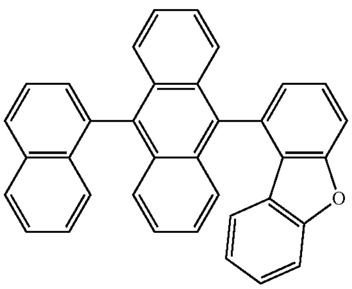
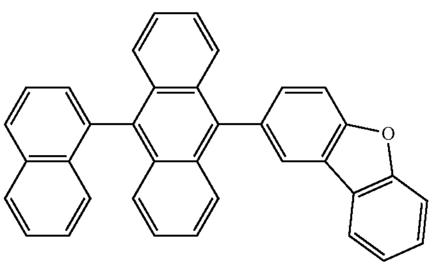
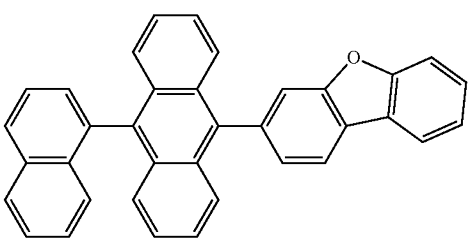
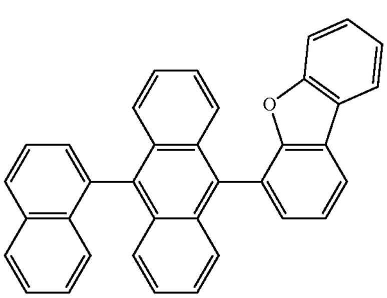
-continued
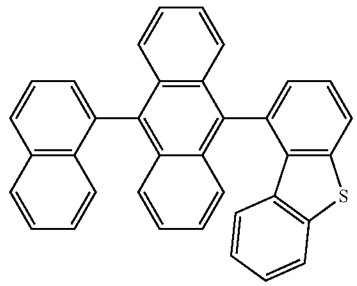
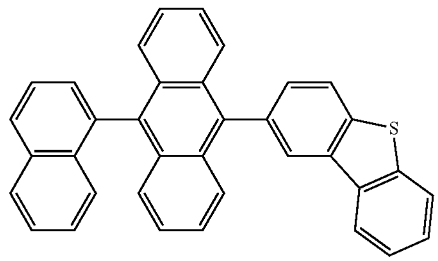
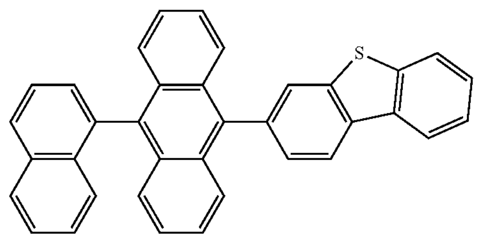
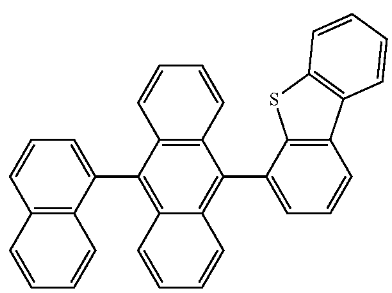
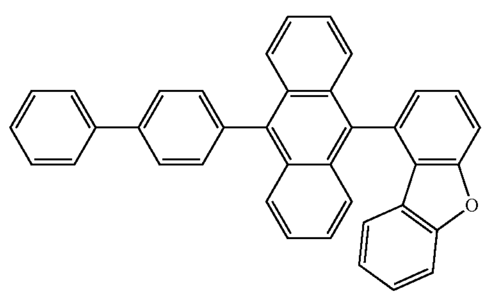
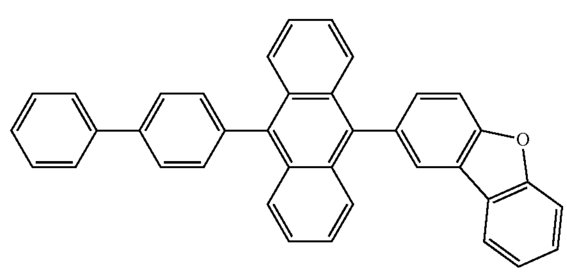

-continued
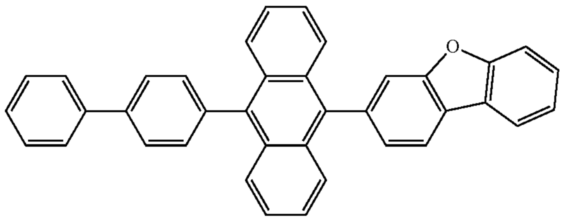
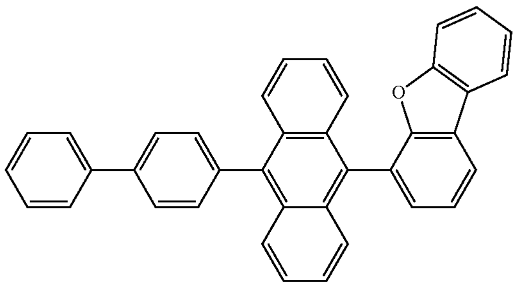
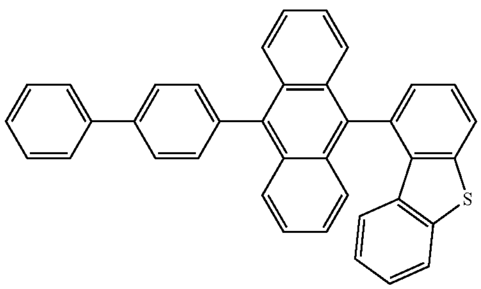
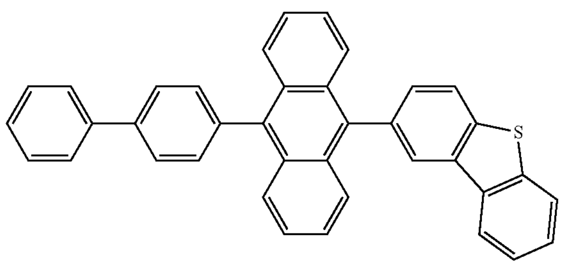
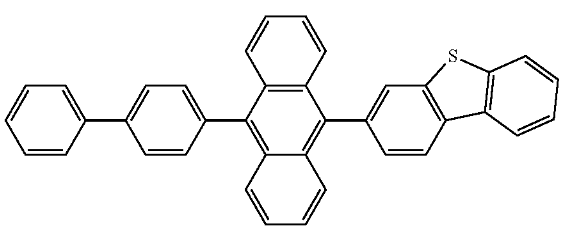
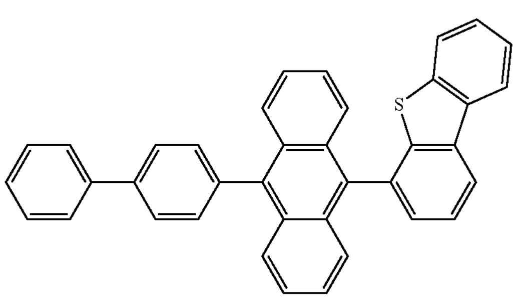
-continued
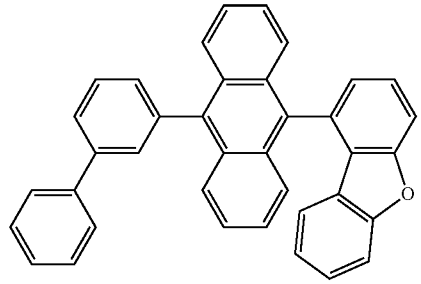
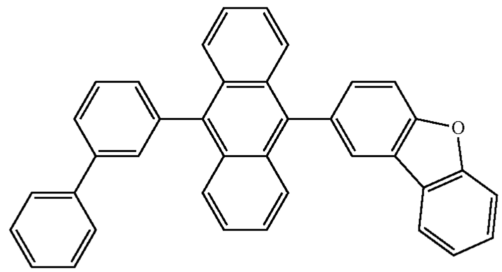
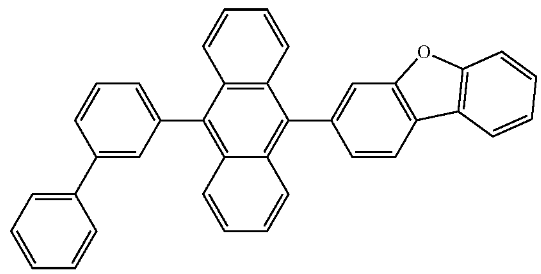
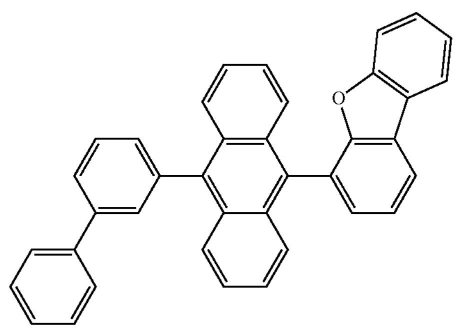
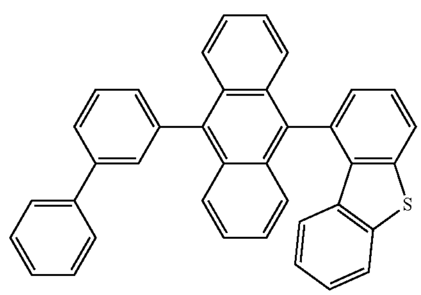
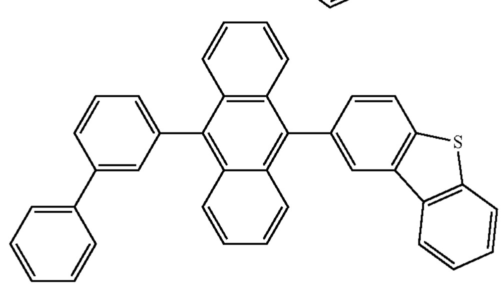

-continued
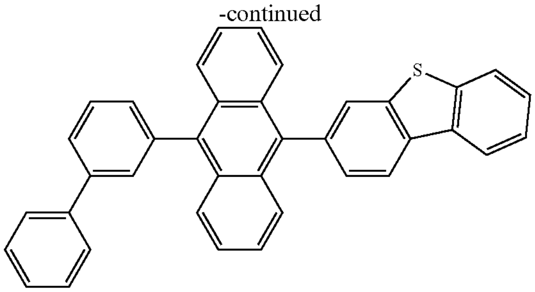
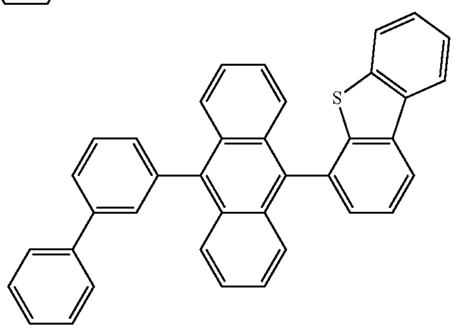
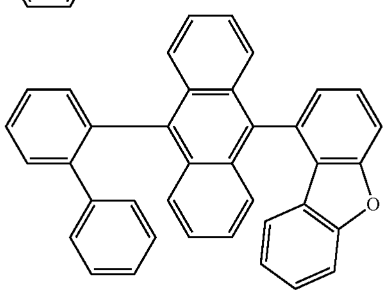
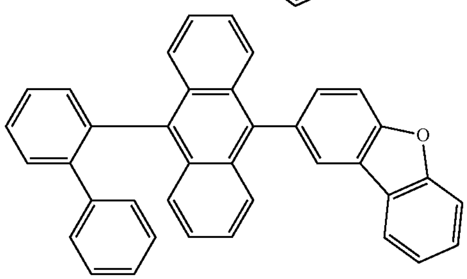
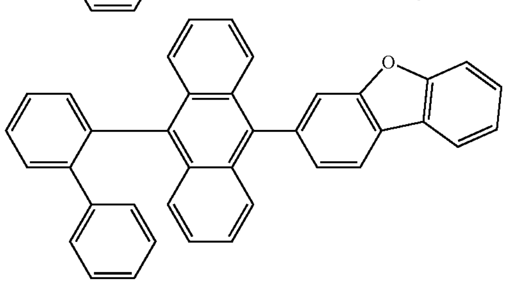
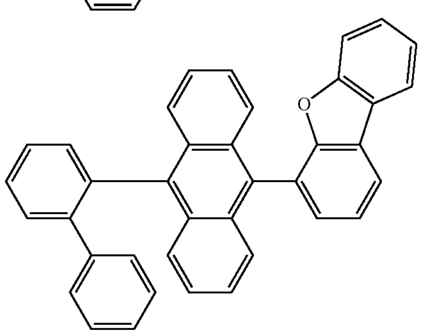
-continued
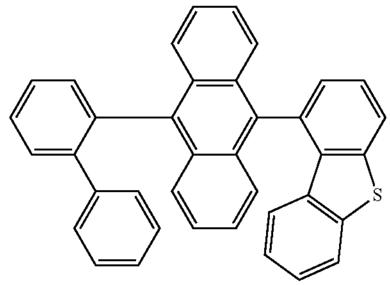
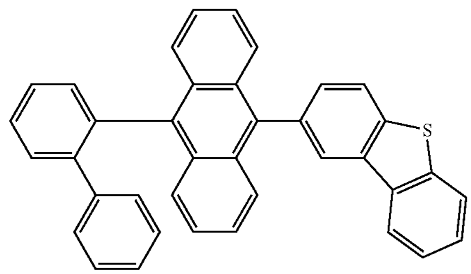
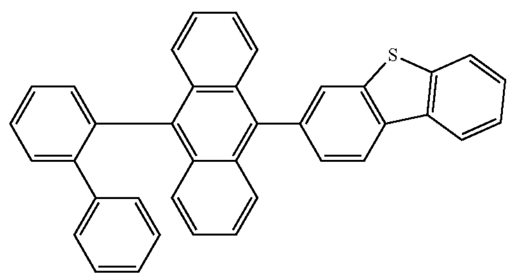
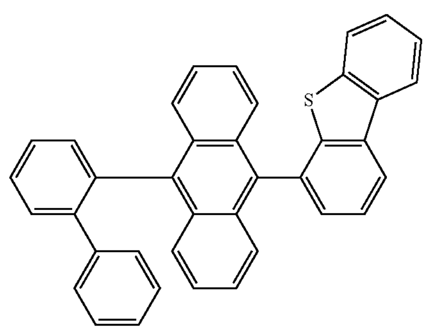
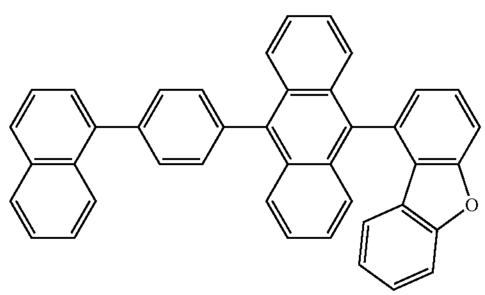
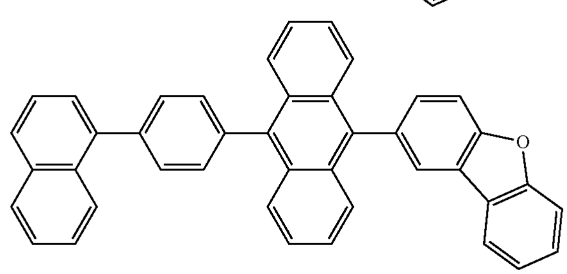

-continued
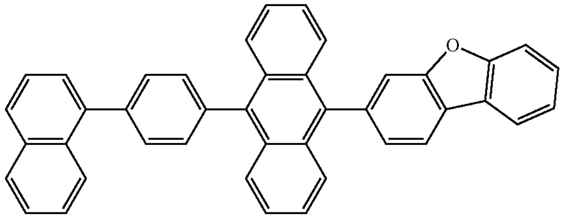
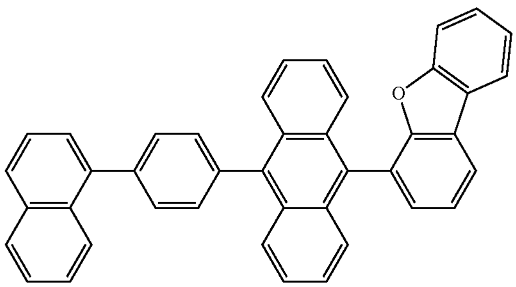
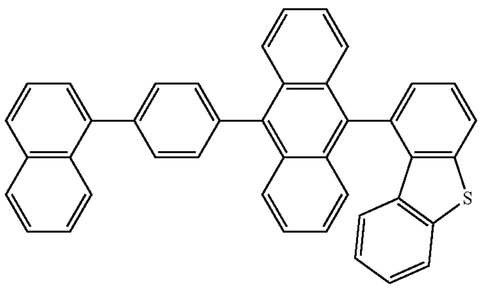
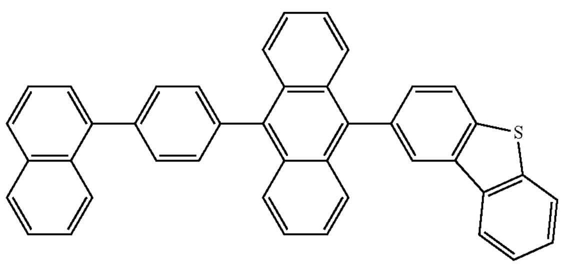
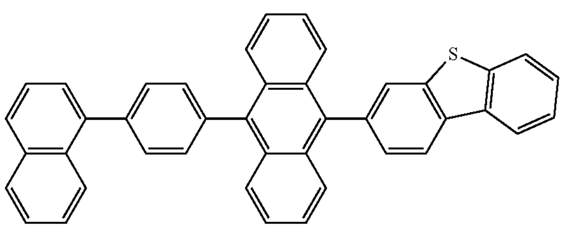
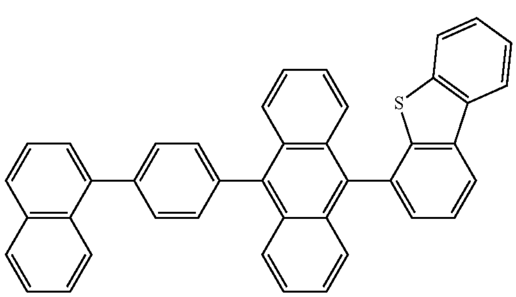
-continued
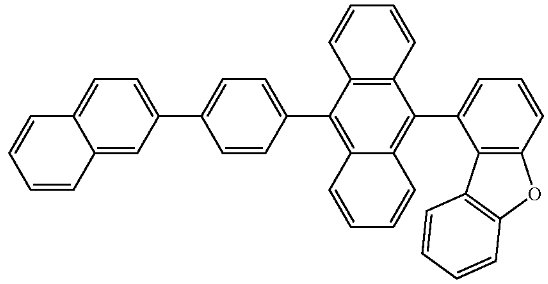
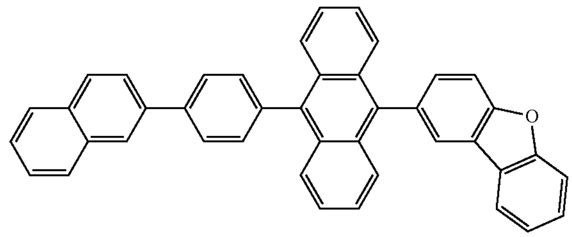
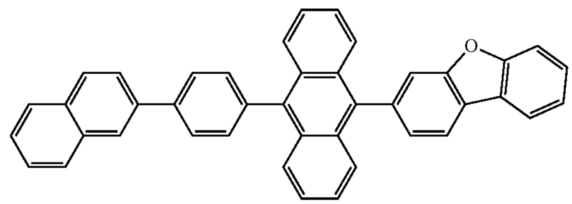
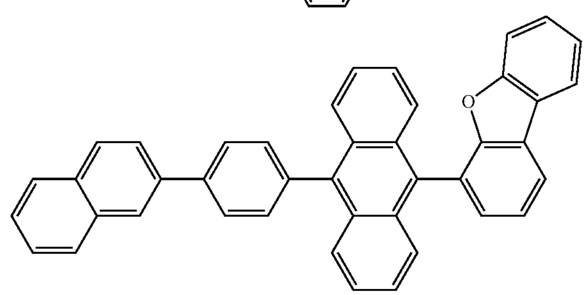
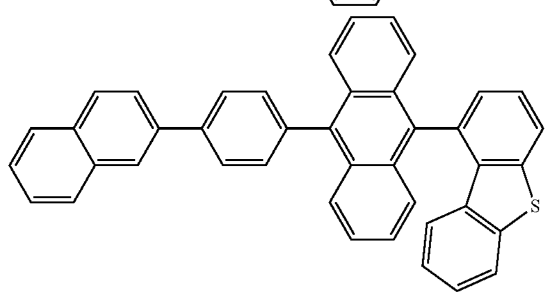
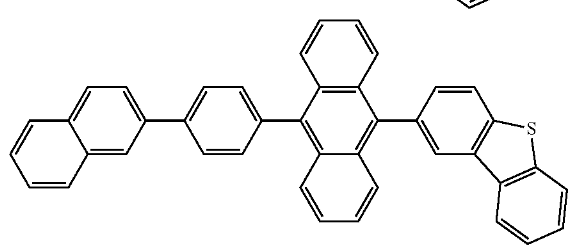
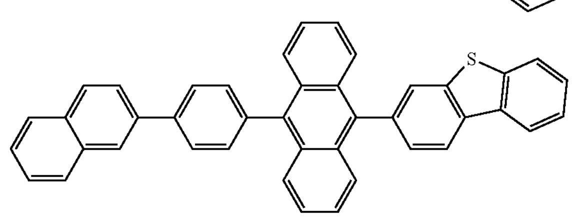

-continued
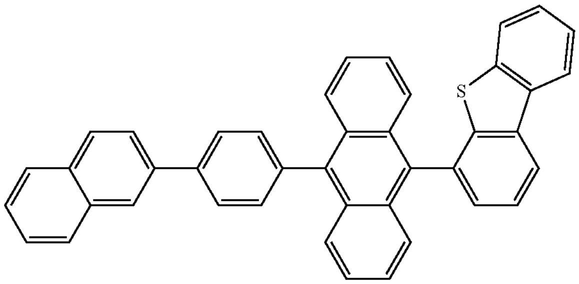
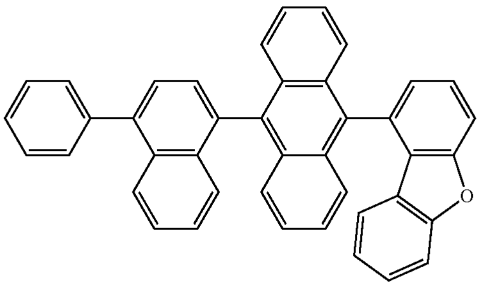
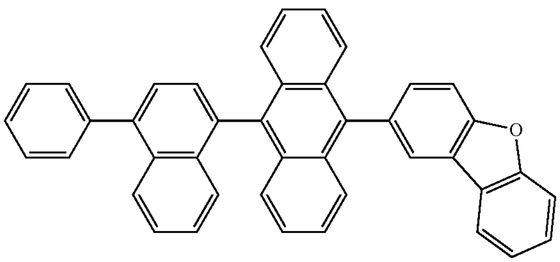
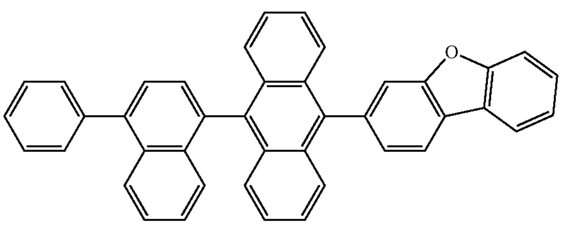
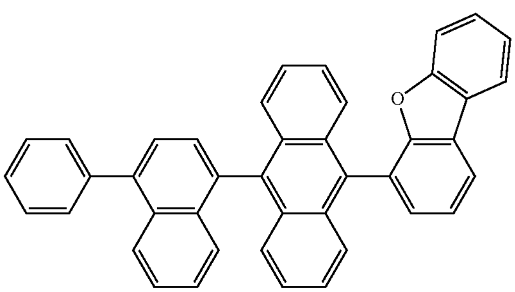
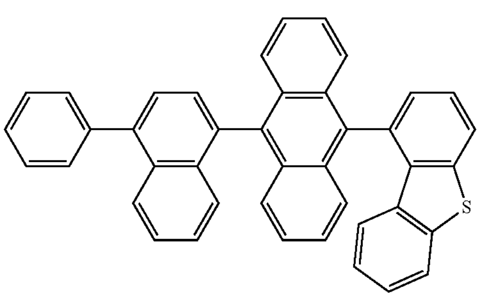
-continued
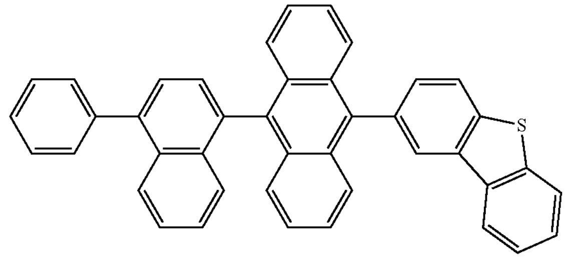
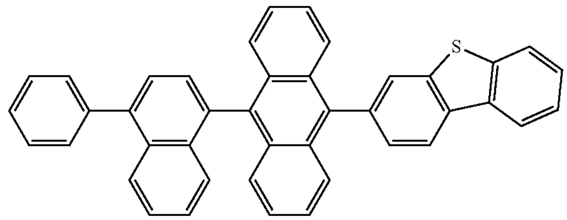
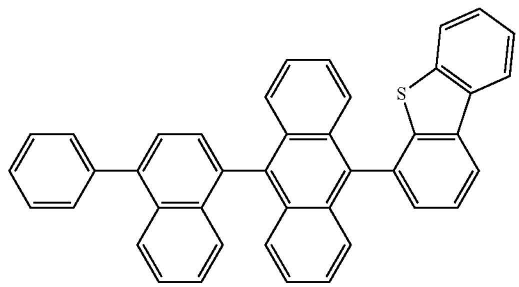
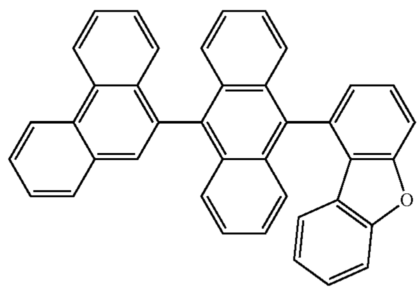
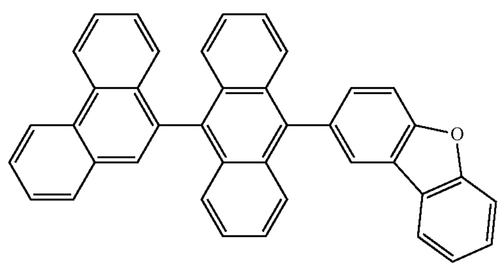
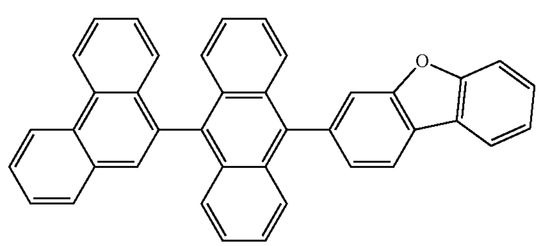

-continued
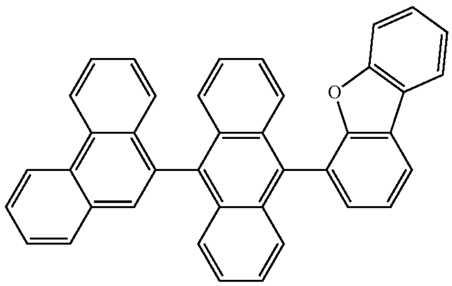
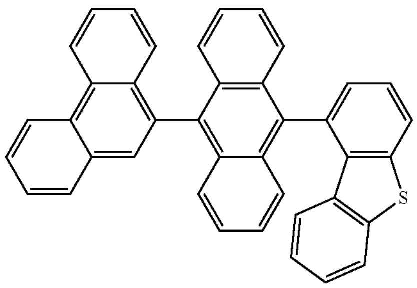
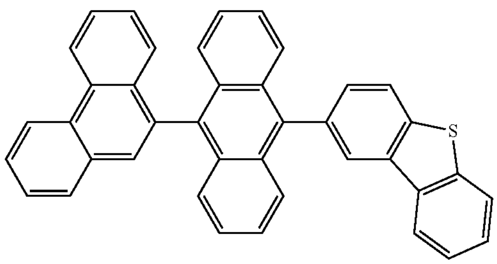
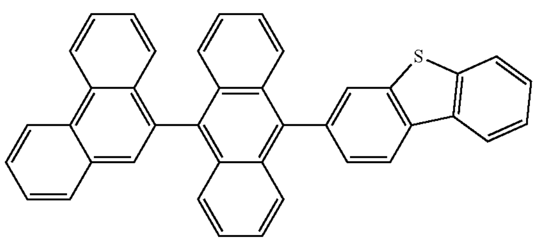
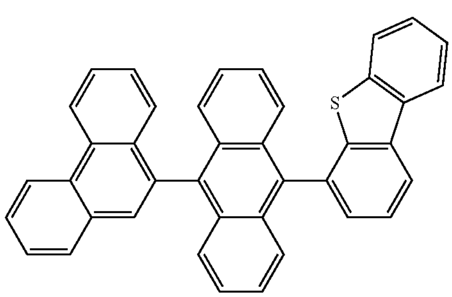
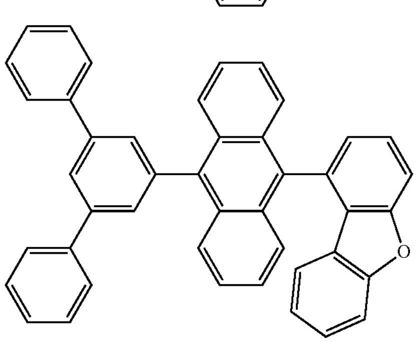
-continued
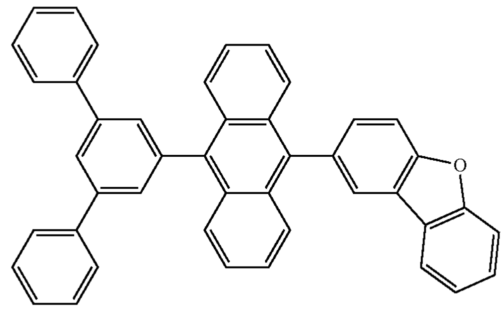
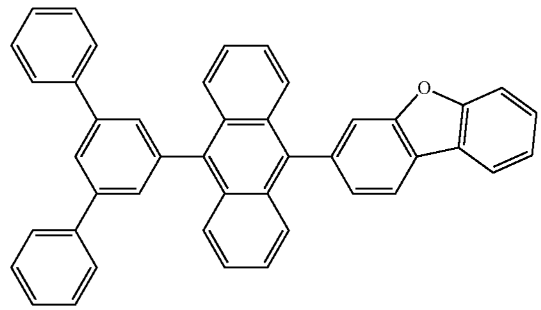
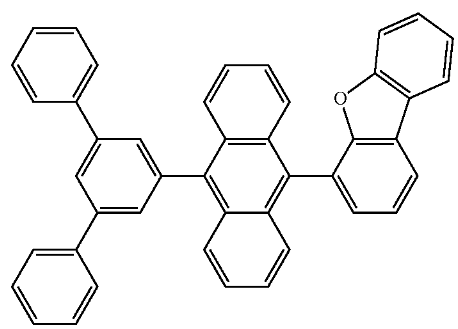
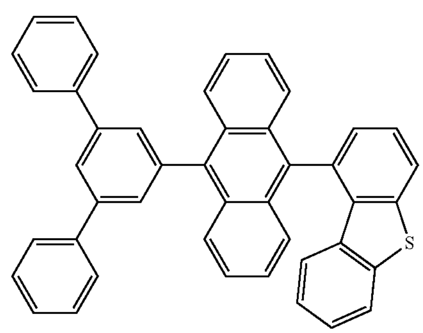
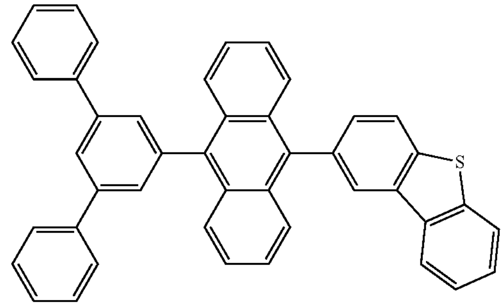

-continued
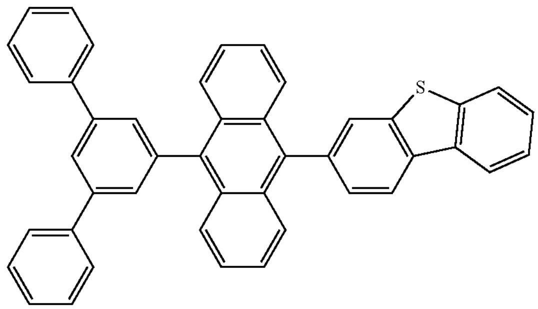
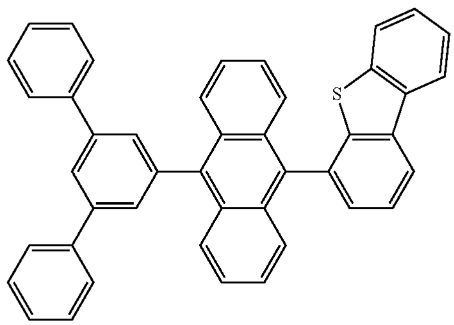
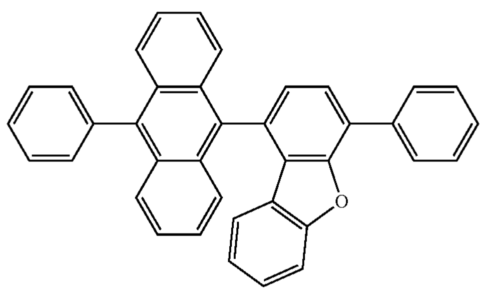
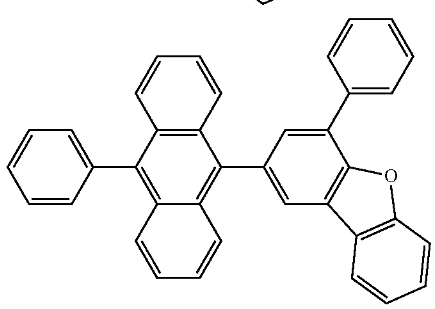
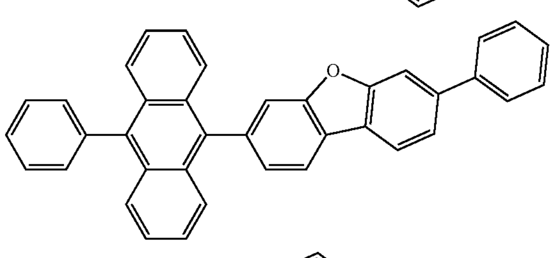
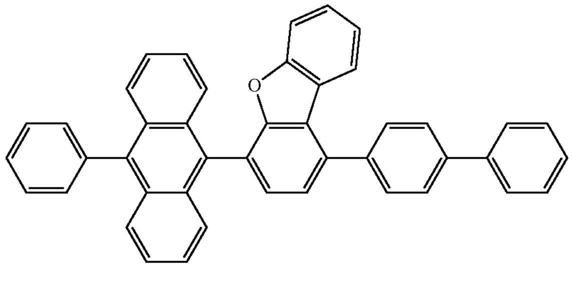
-continued
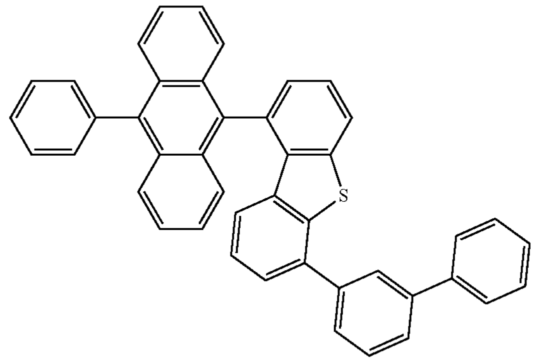
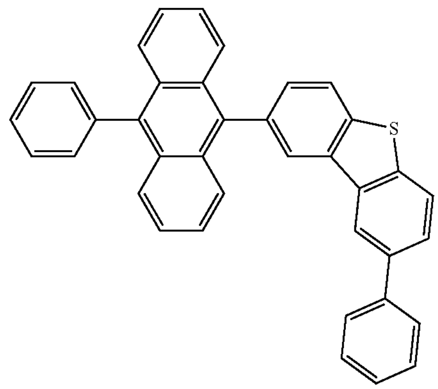
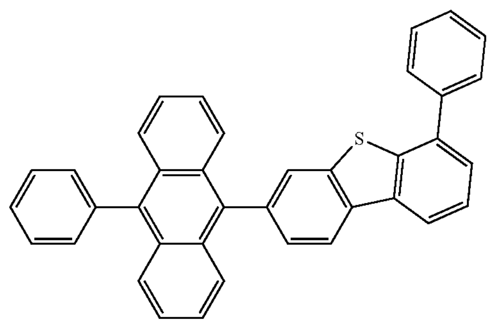
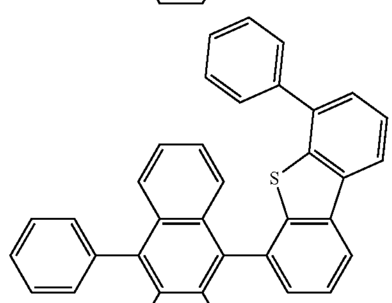
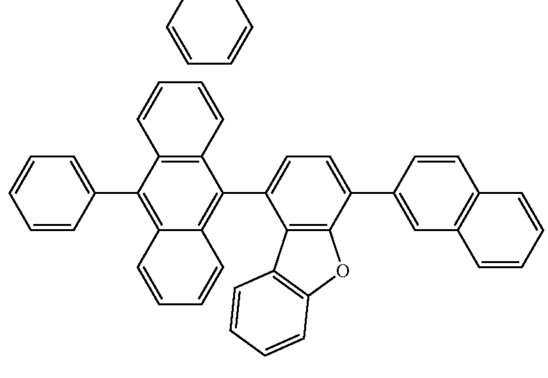

-continued
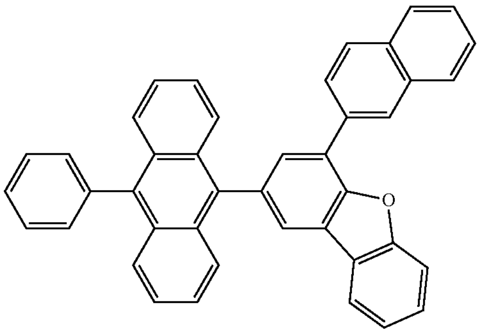
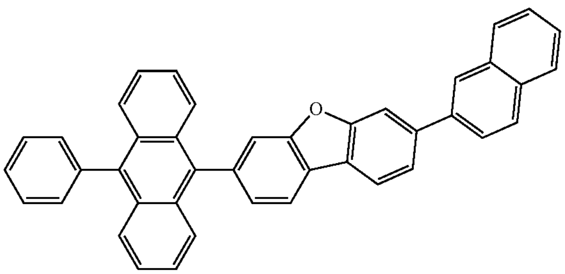
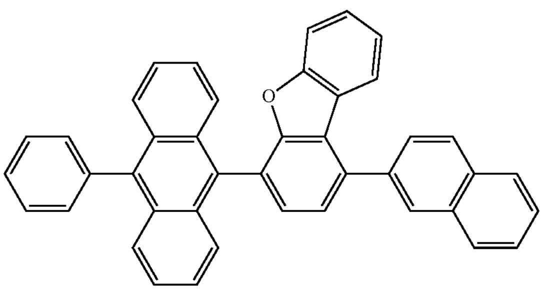
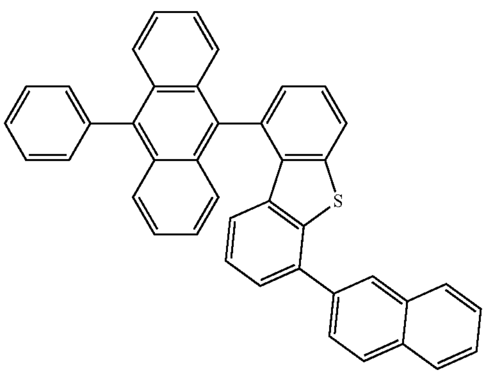
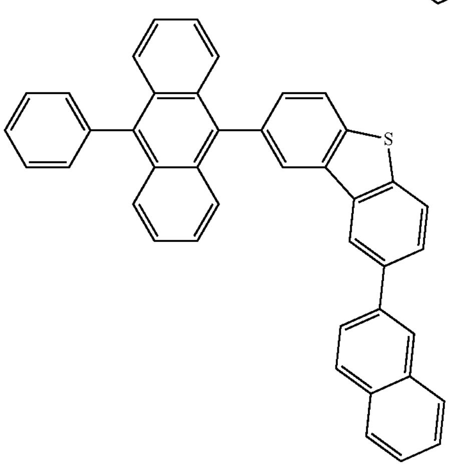
-continued
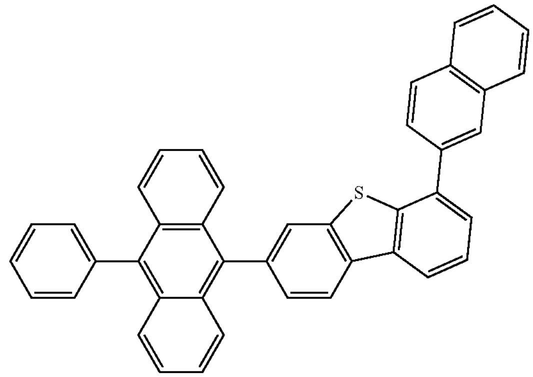
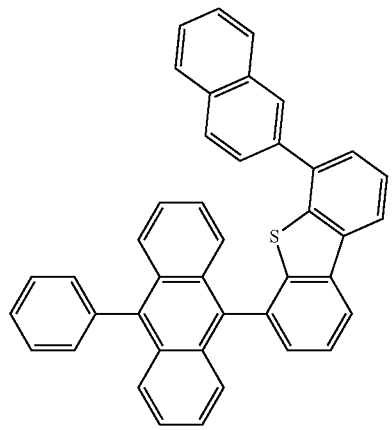
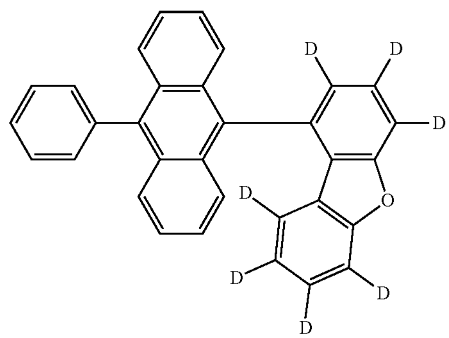
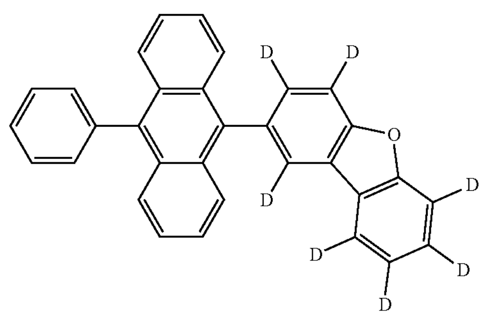
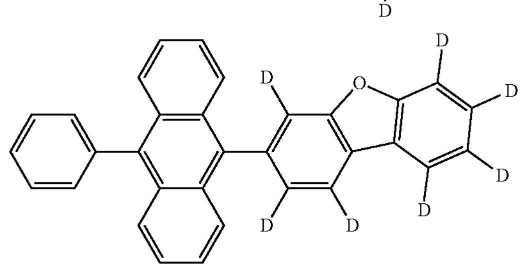

-continued
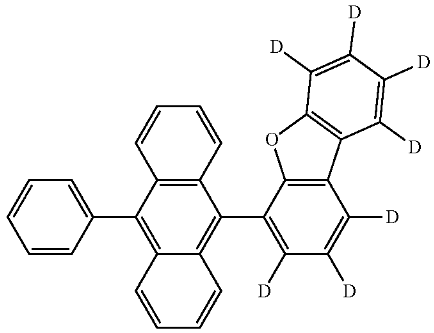
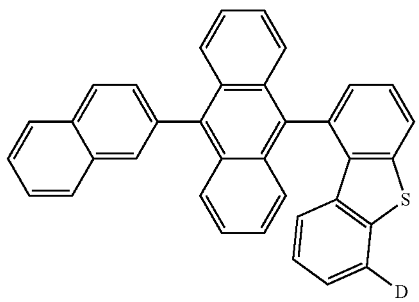
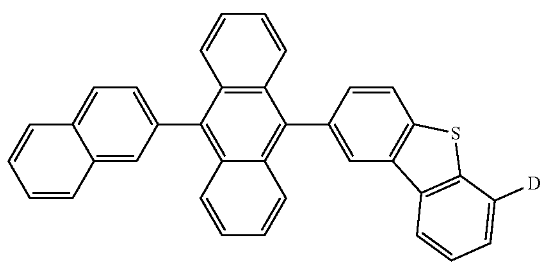
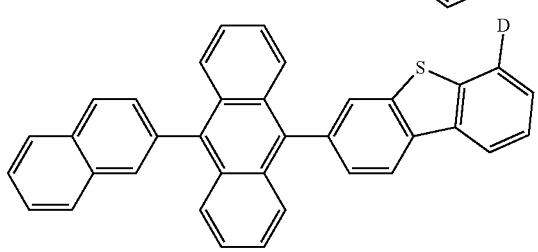
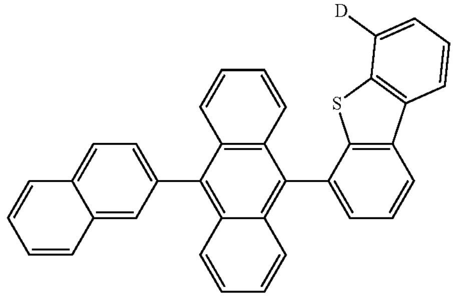
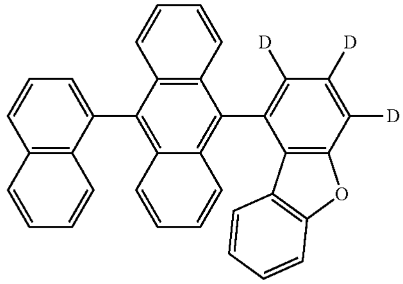
-continued
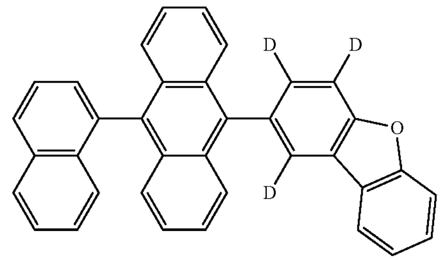
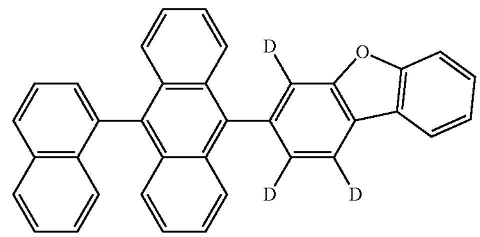
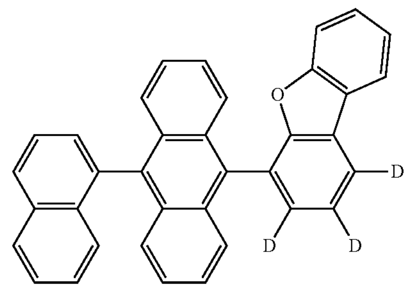
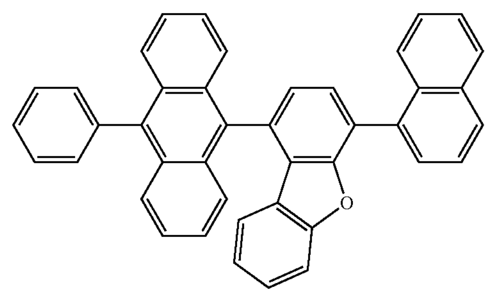
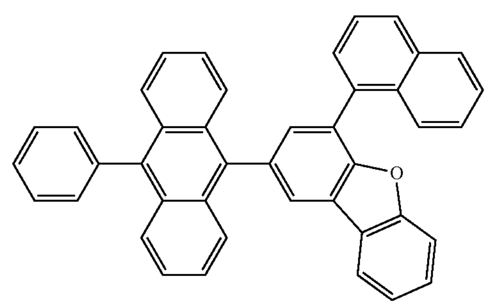
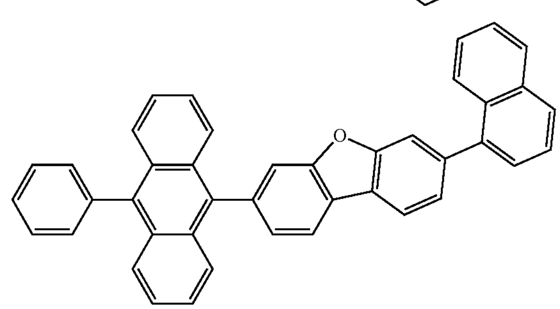

-continued
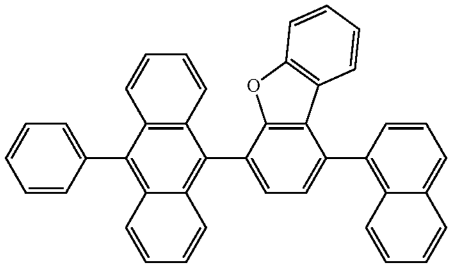
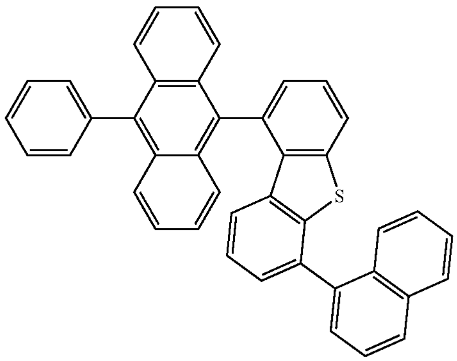
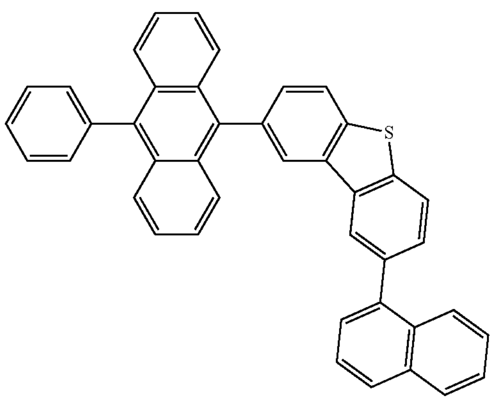
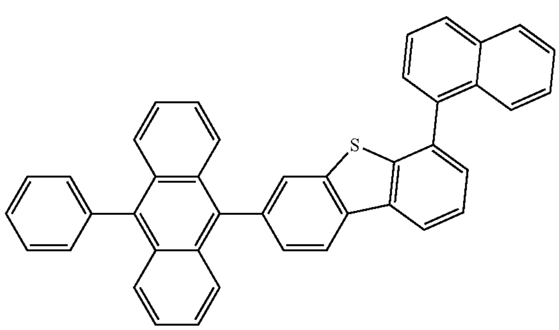
-continued
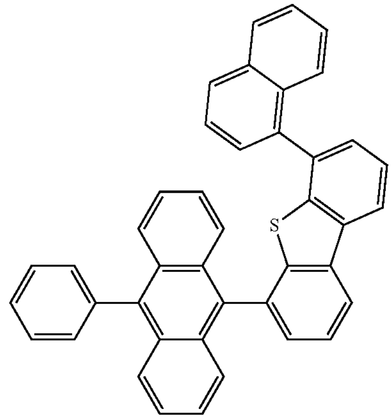
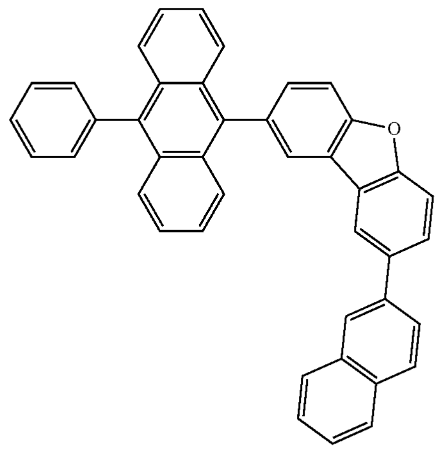
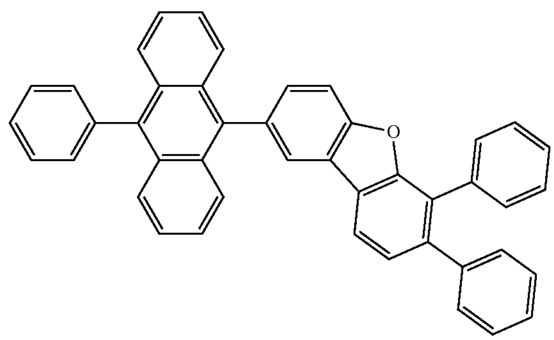
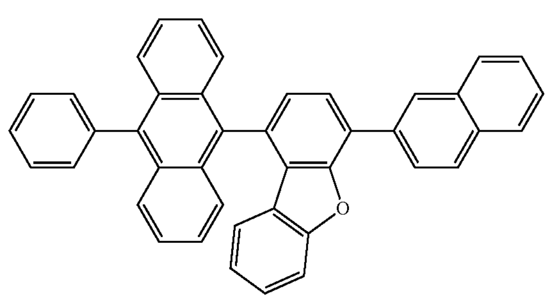

-continued
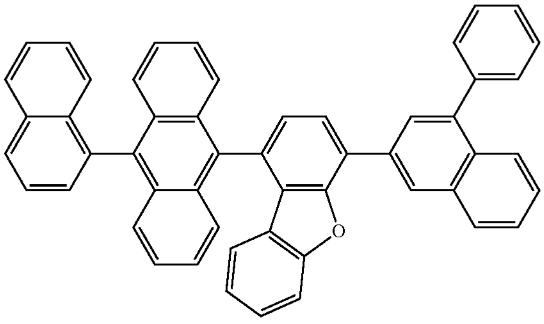
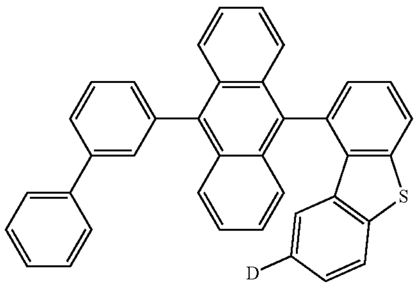
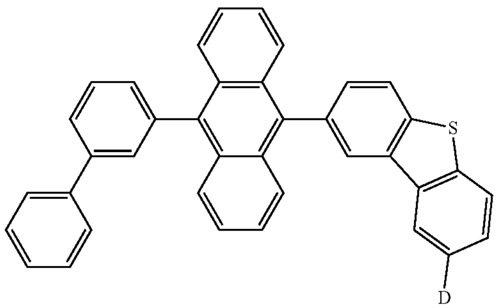
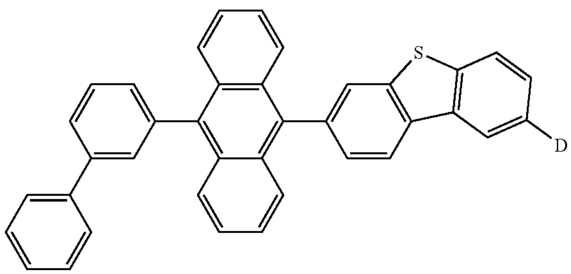
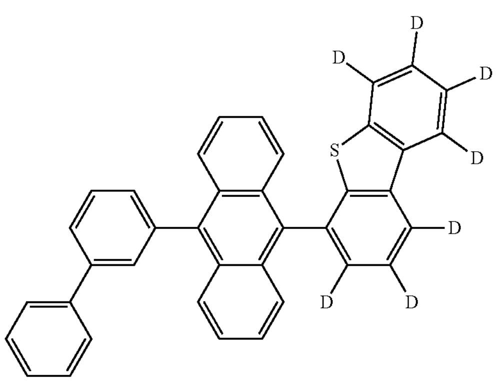
-continued
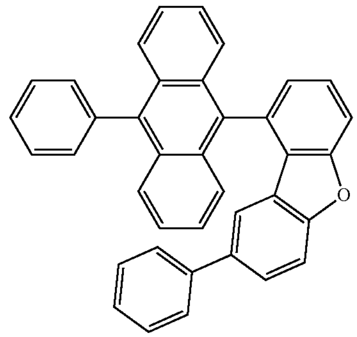
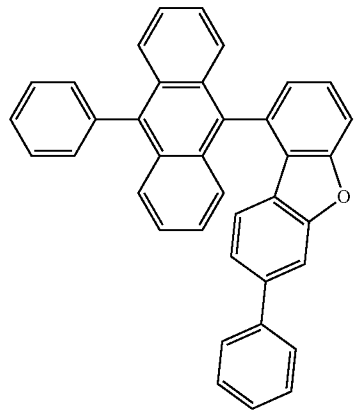
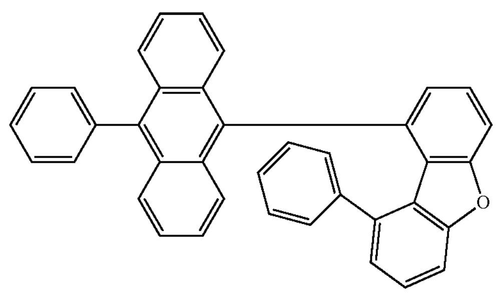
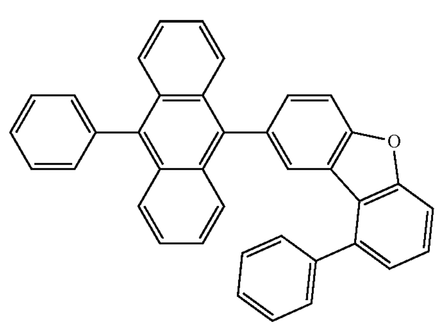

-continued
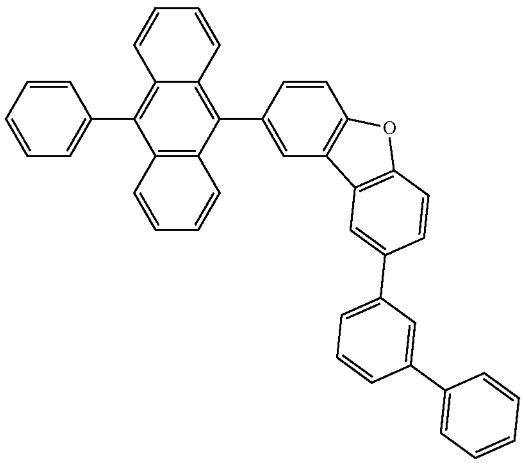
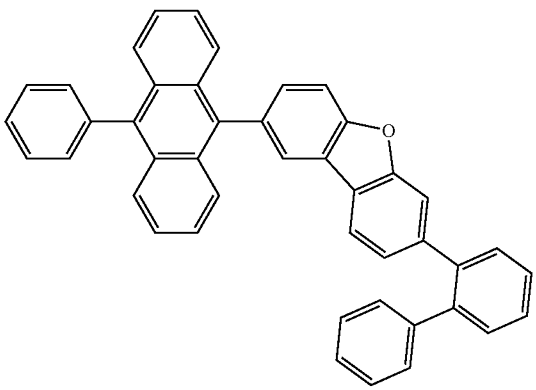
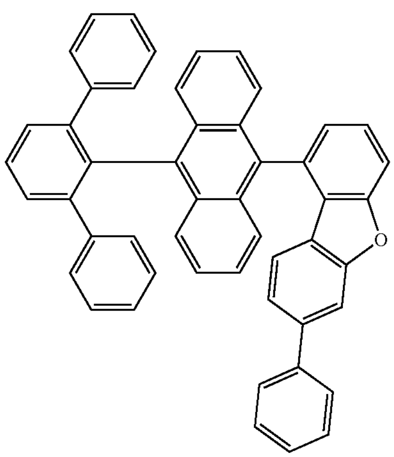
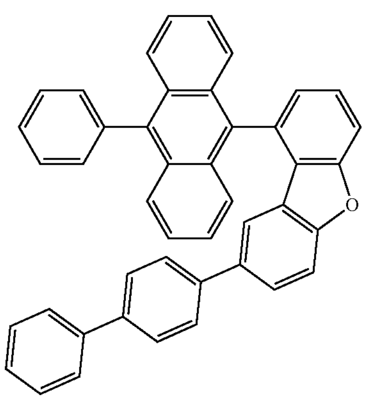
-continued
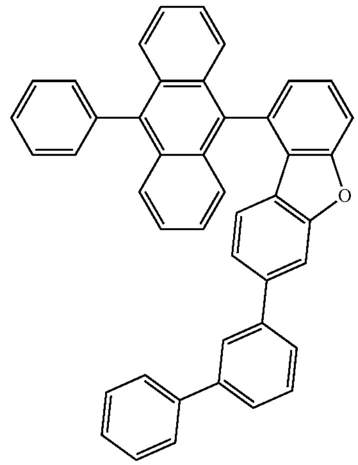
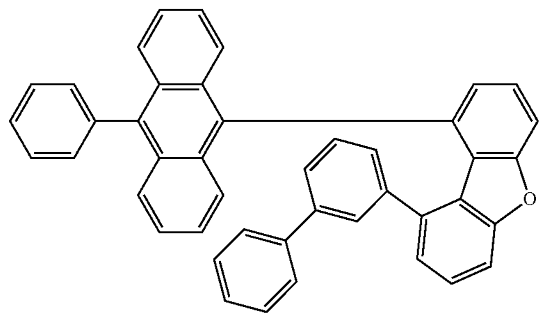
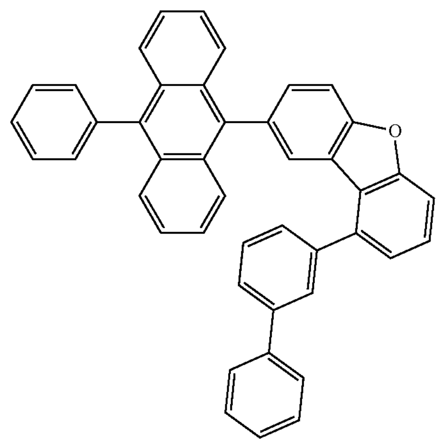
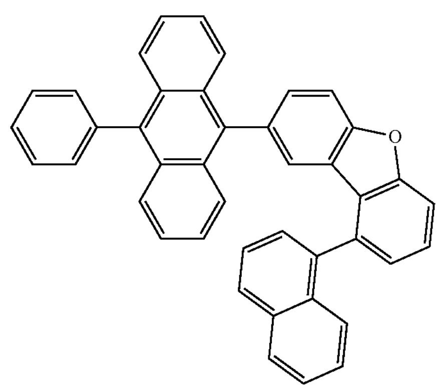

-continued
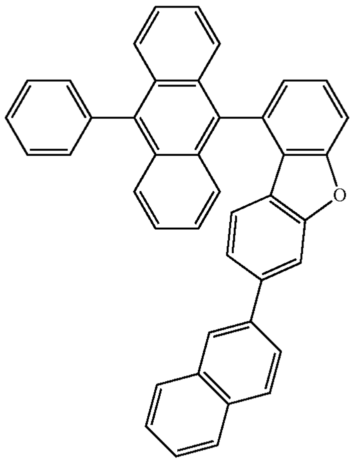
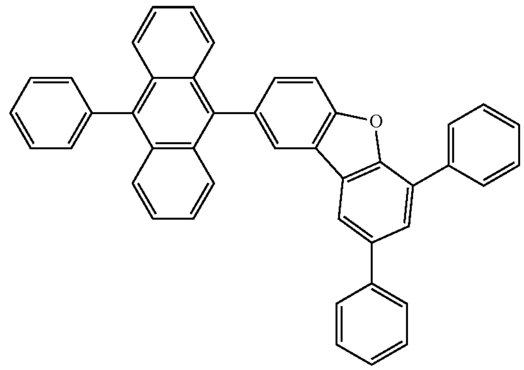
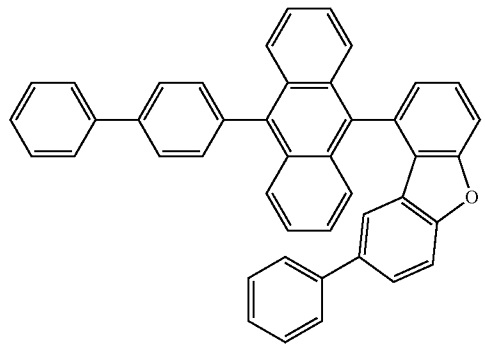
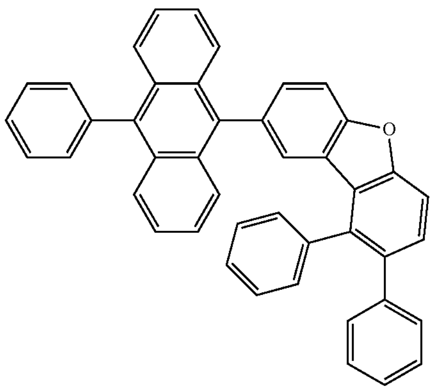
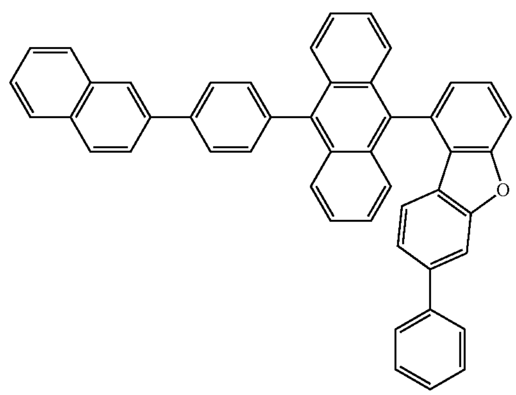
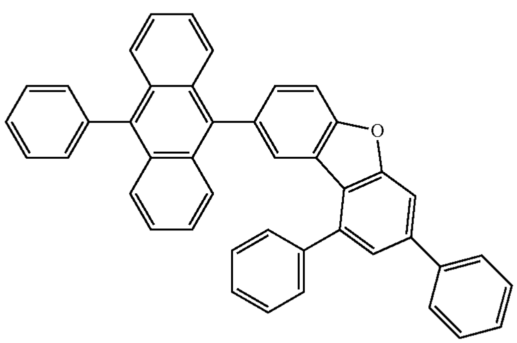
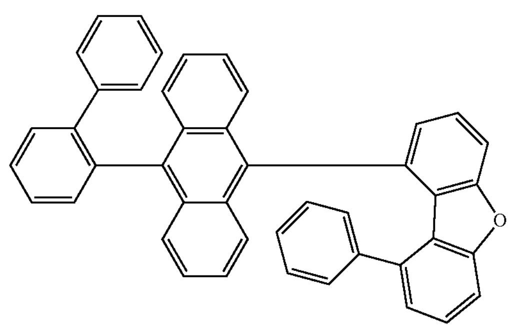
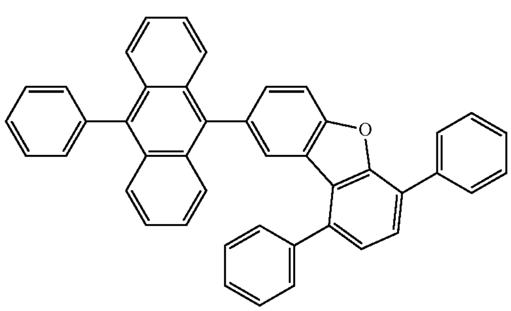
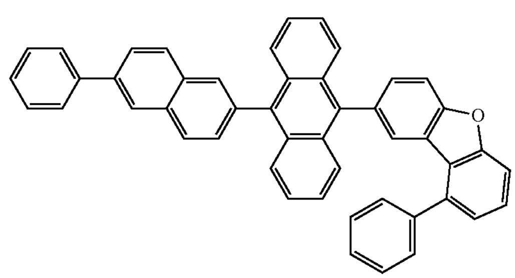

-continued
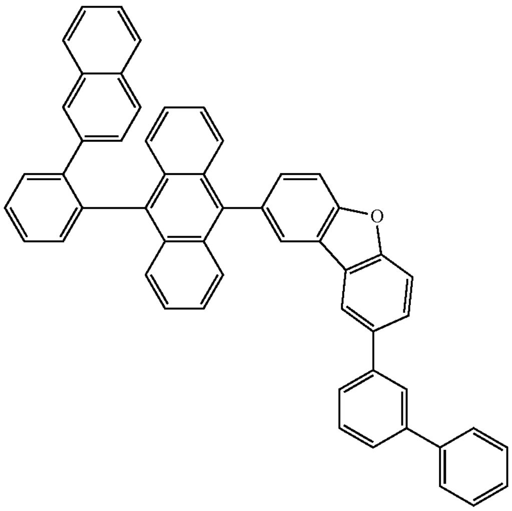
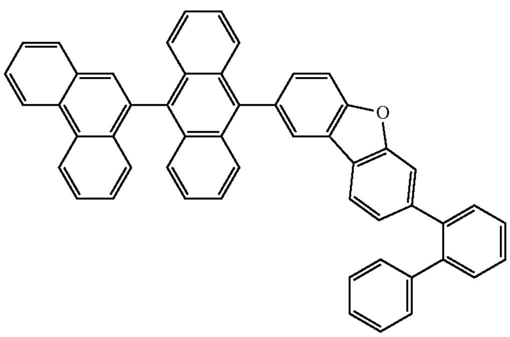
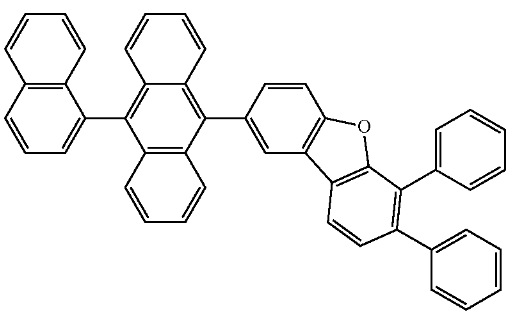
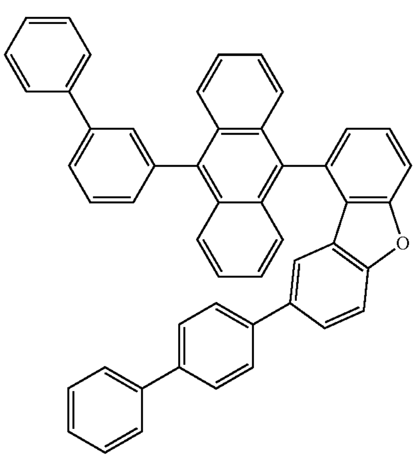
-continued
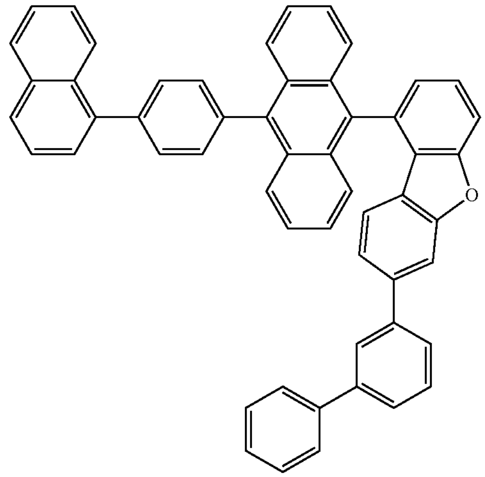
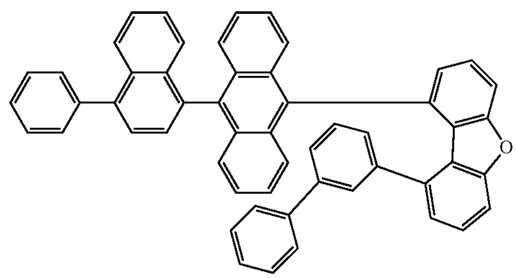
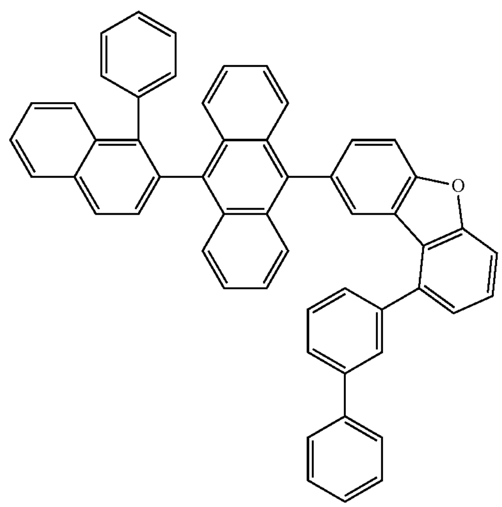
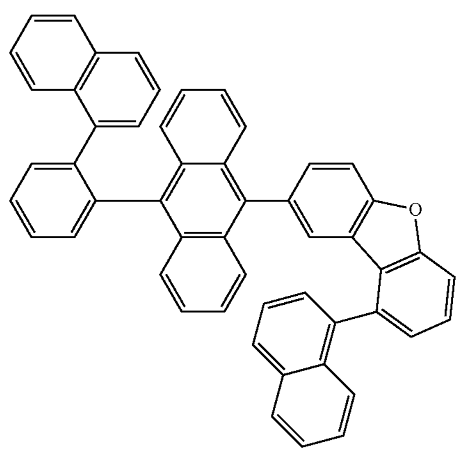

-continued
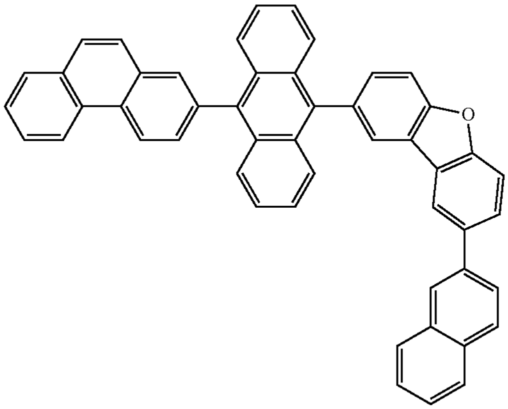
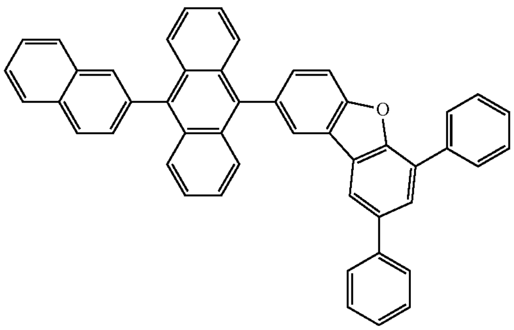
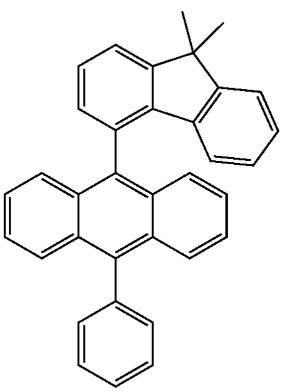
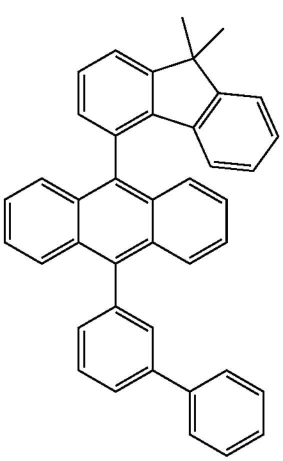
-continued
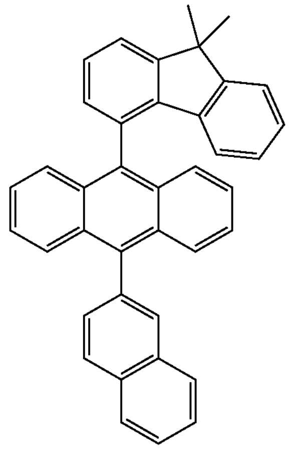
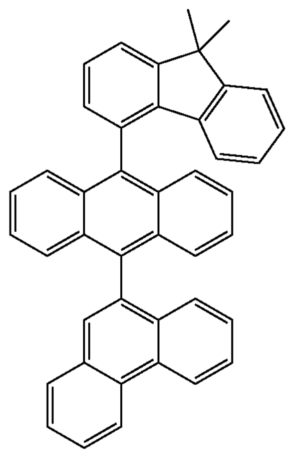
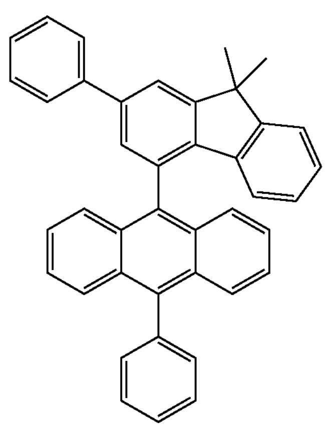

-continued
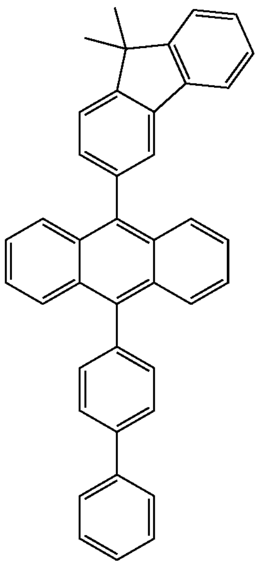
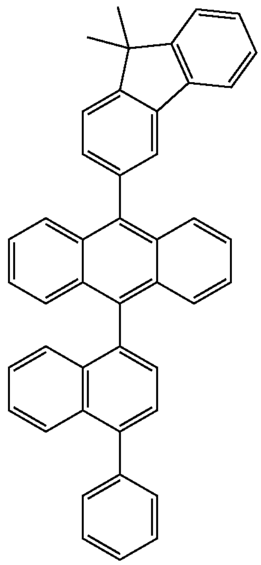
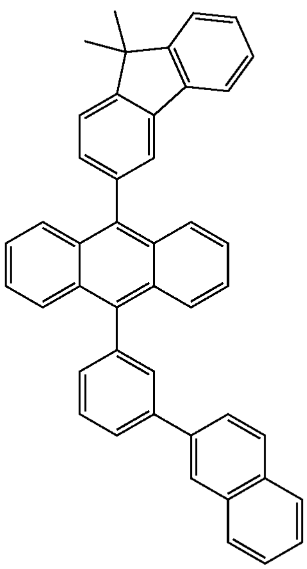
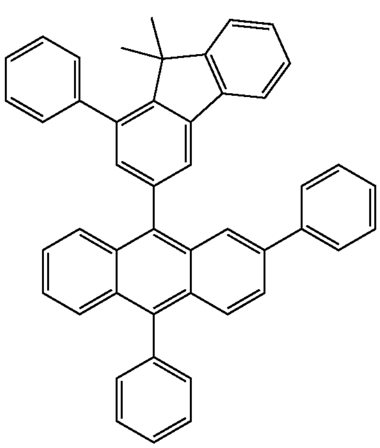
-continued
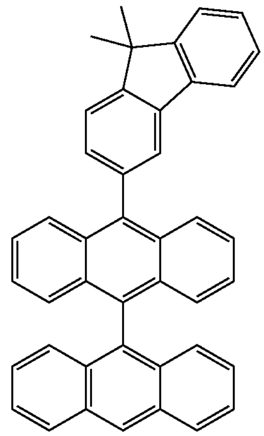
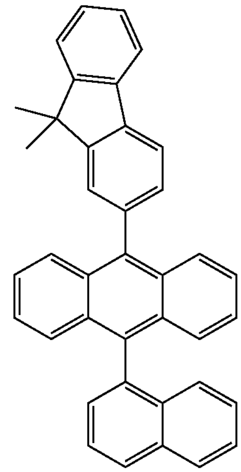
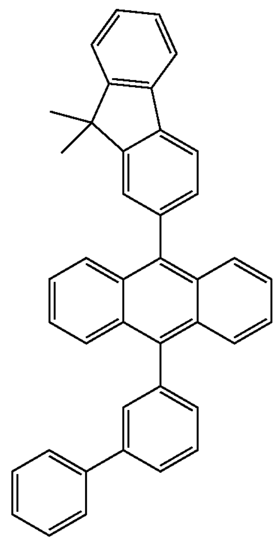
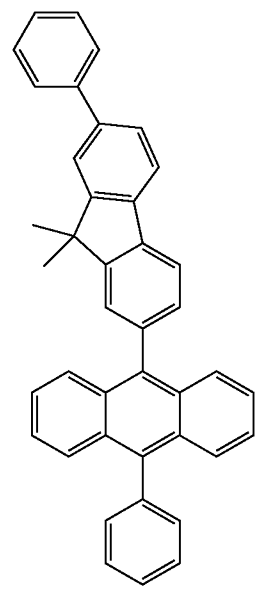
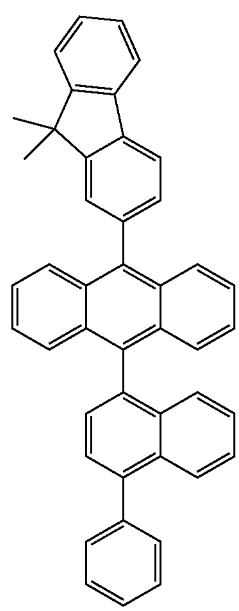
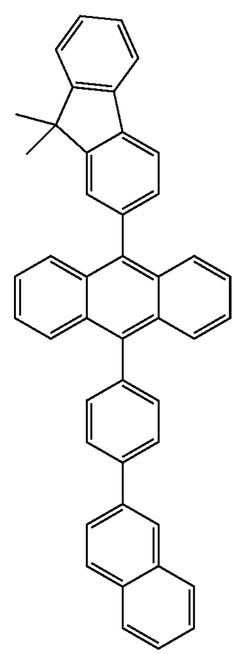

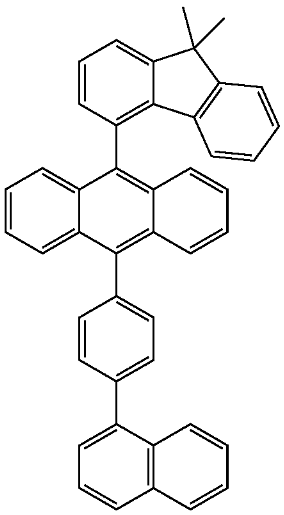
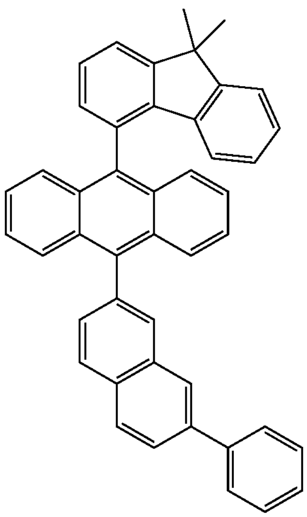
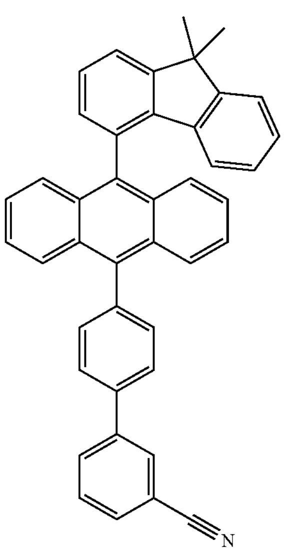
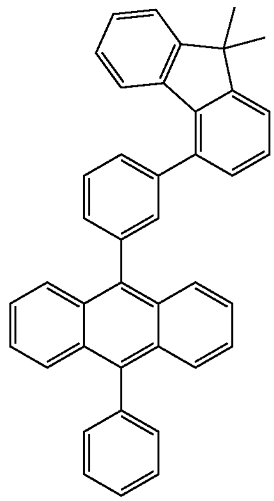
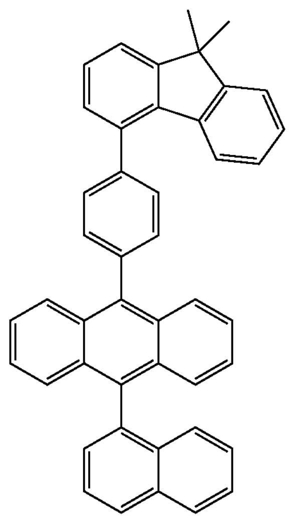
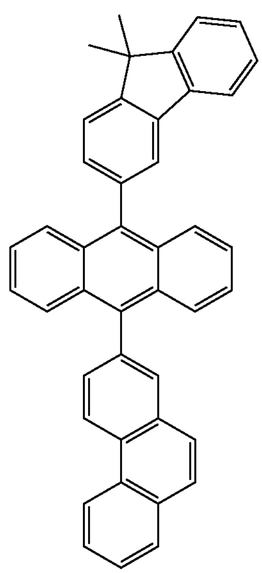
N

-continued
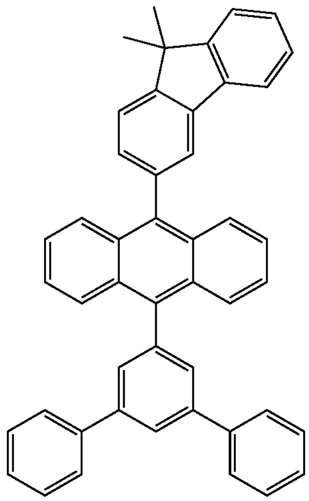
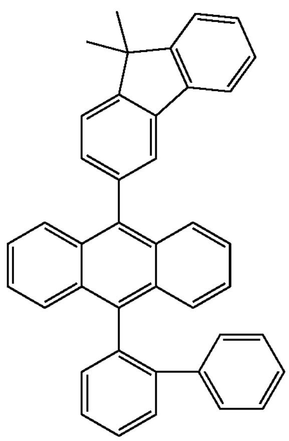
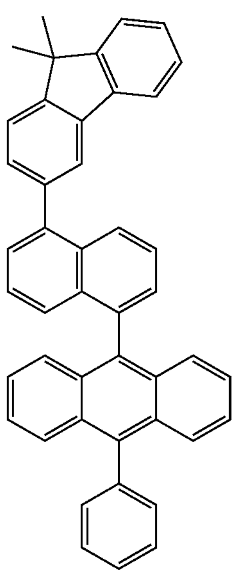
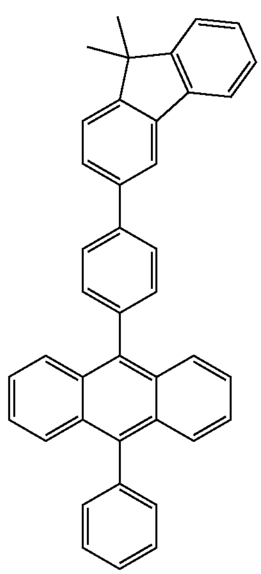
-continued
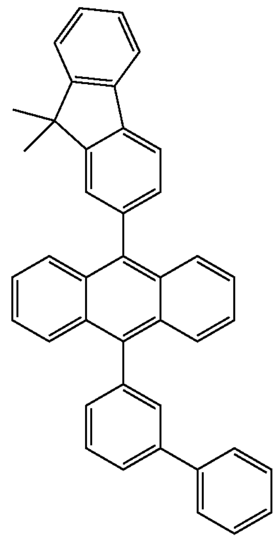
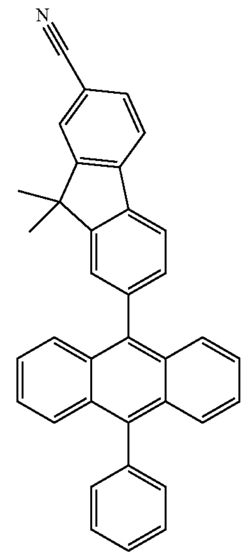
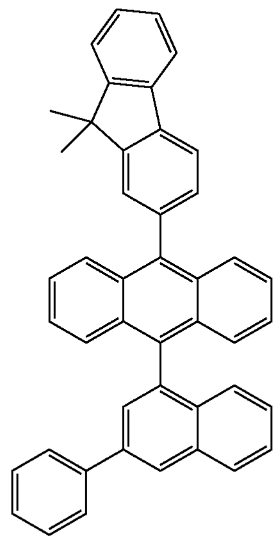
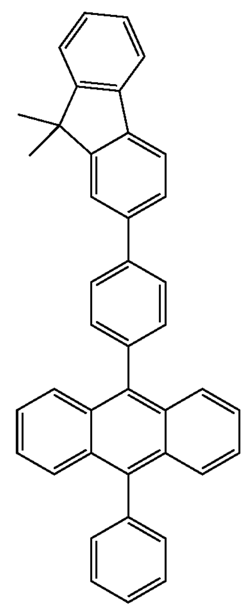
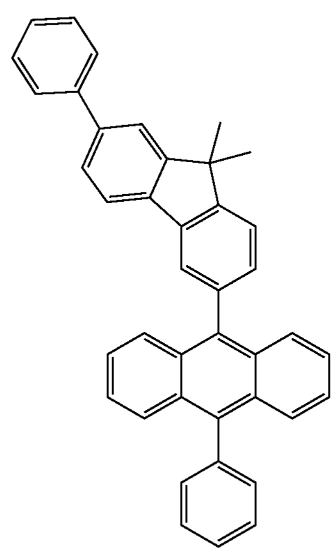

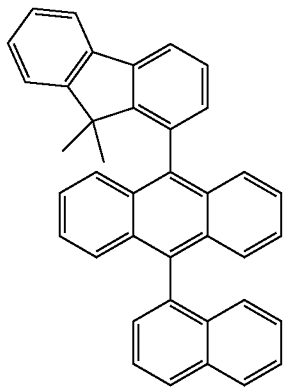
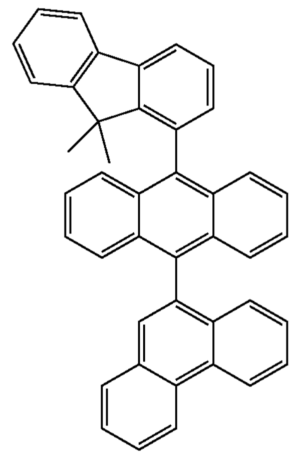
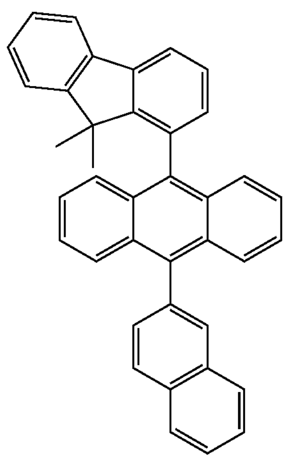
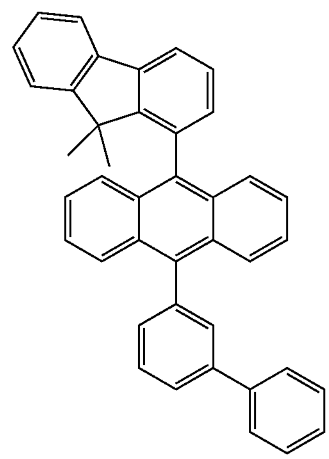
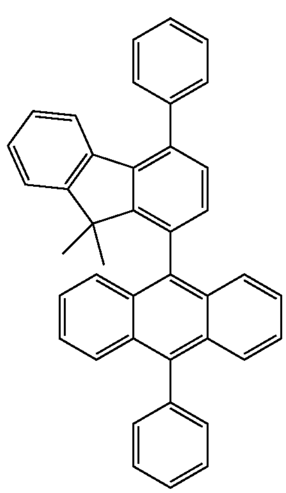
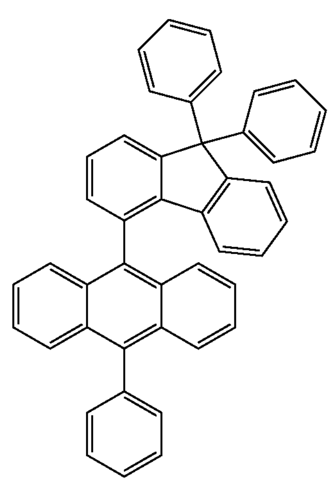

-continued
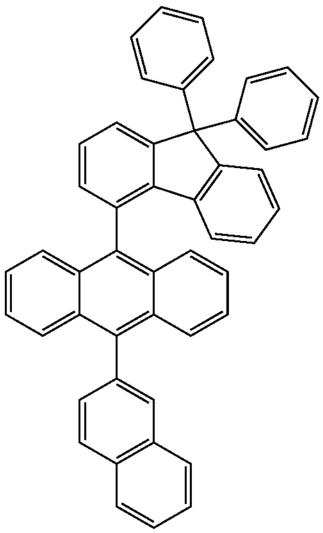
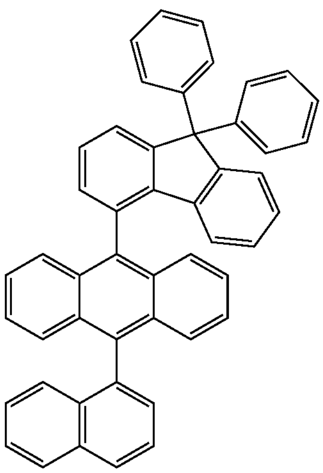
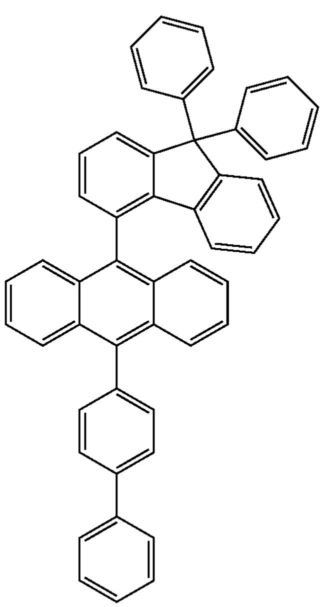
-continued
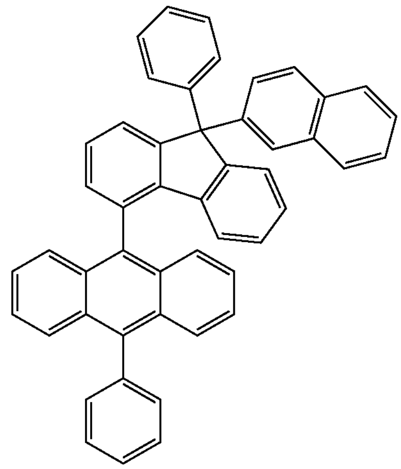
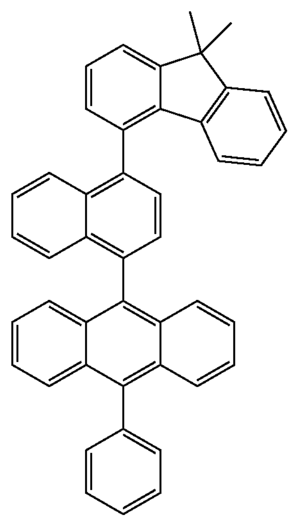
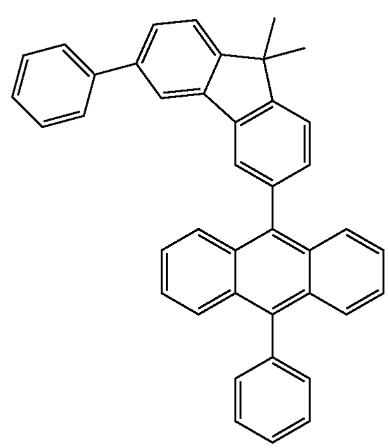

-continued
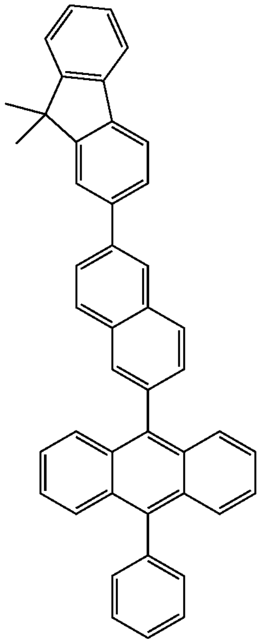
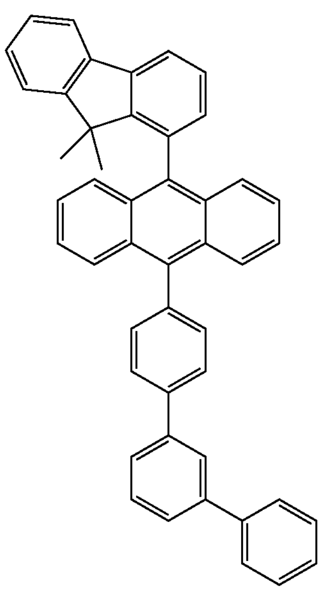
-continued
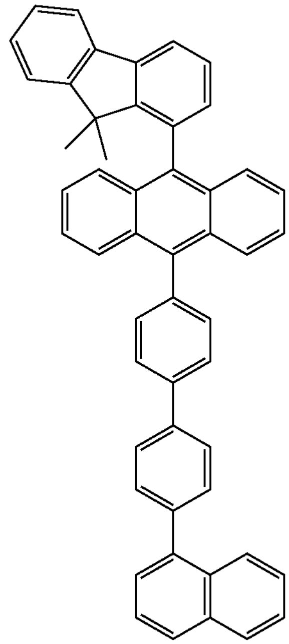
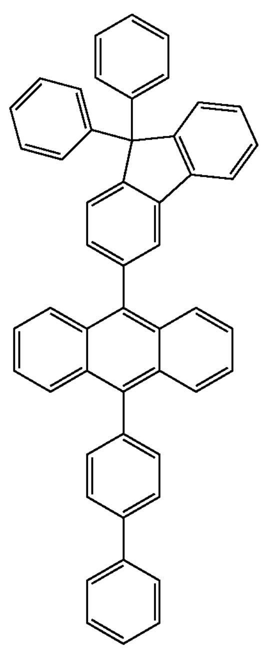

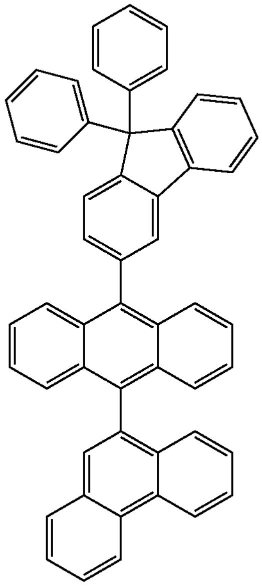
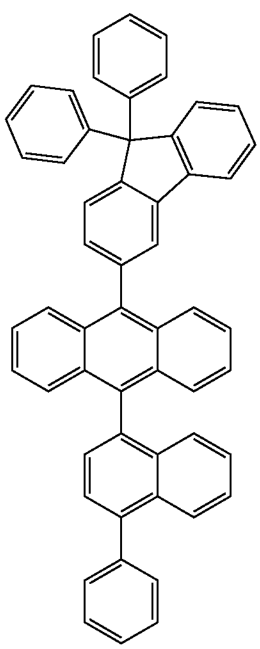
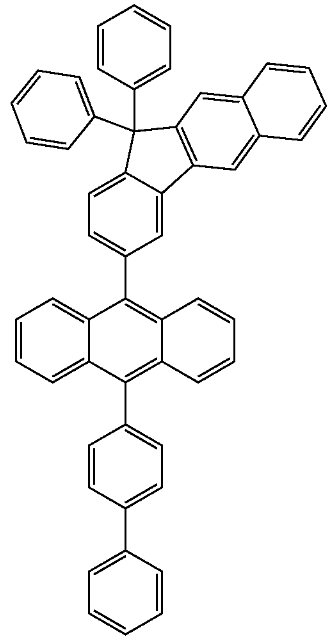
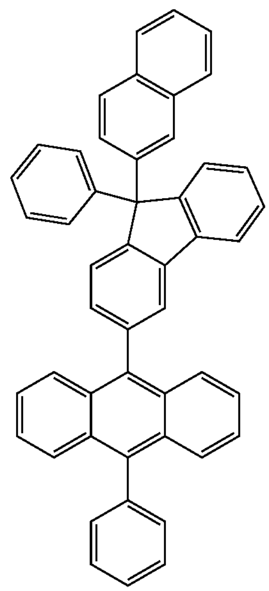
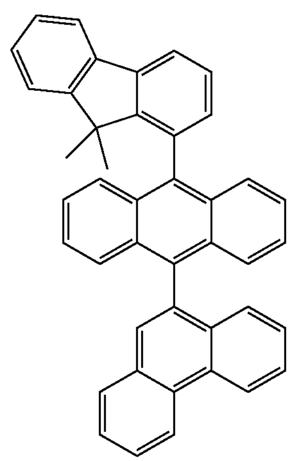

-continued
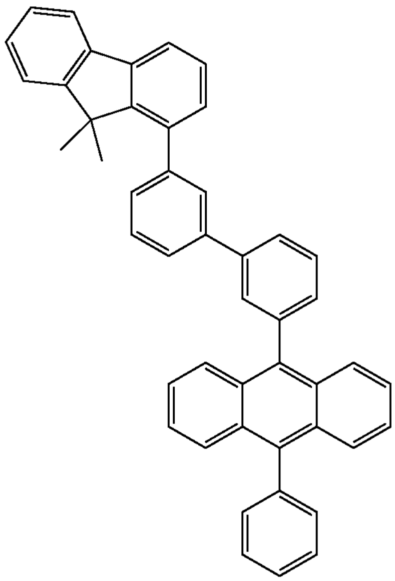
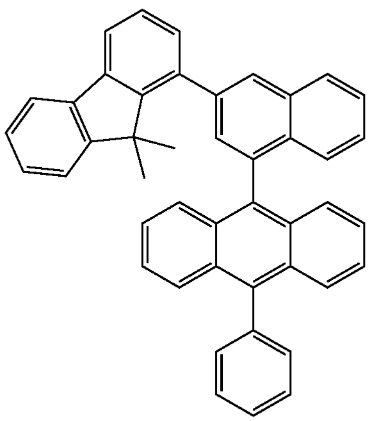
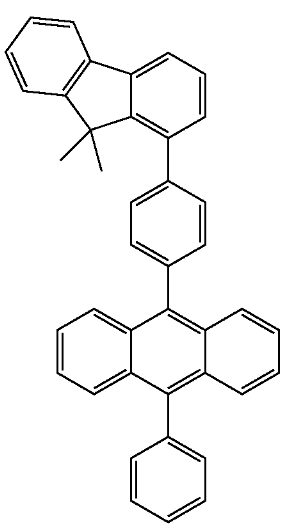
-continued
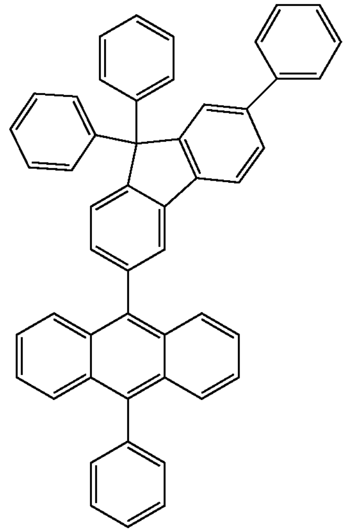
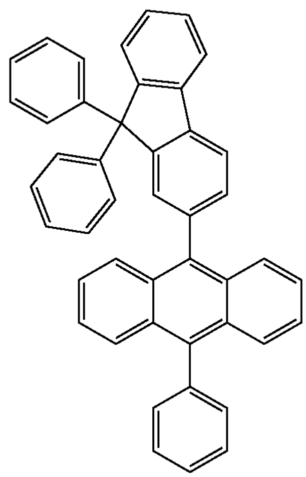
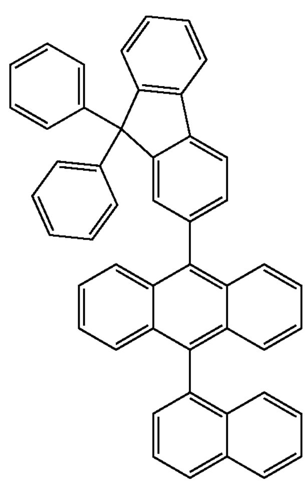

-continued
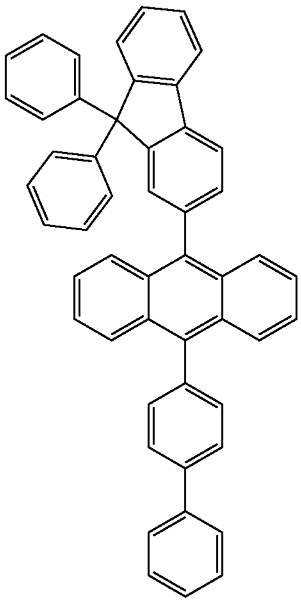
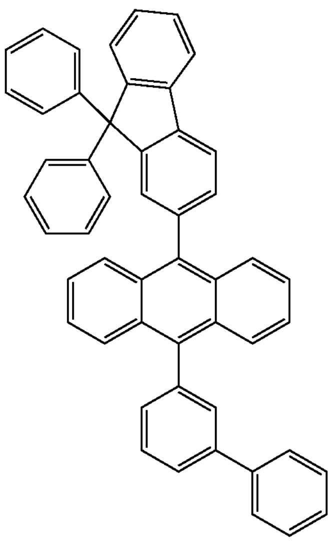
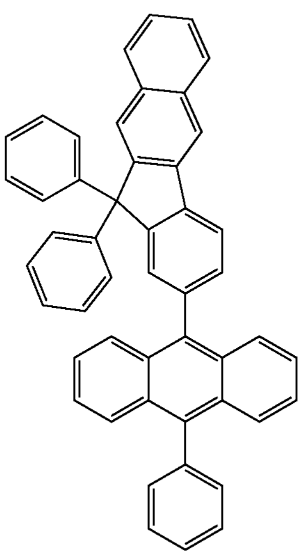
-continued
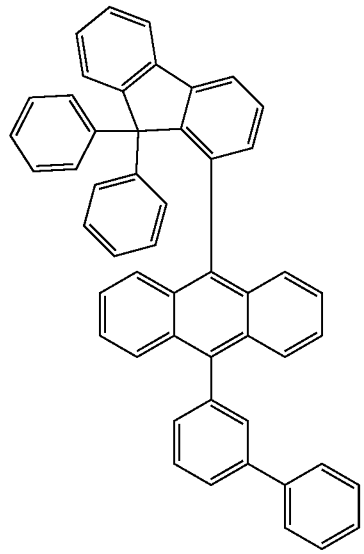
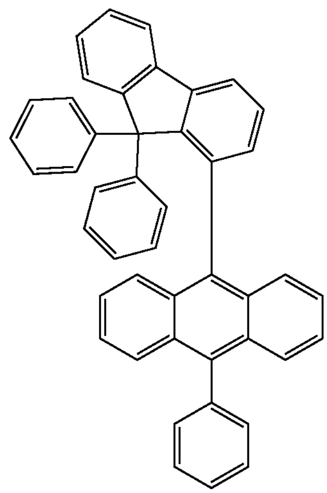
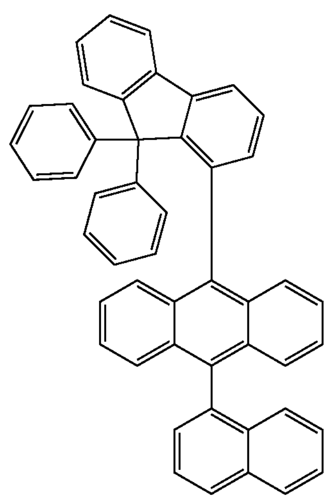

-continued
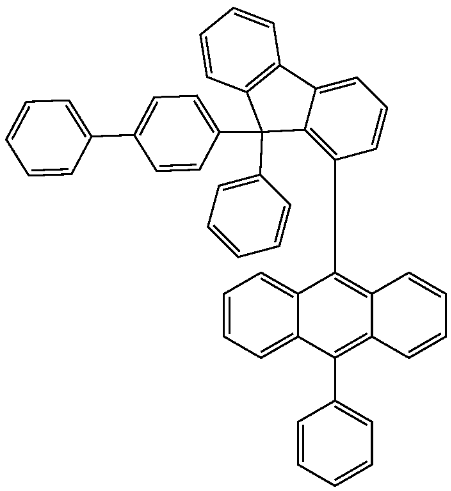
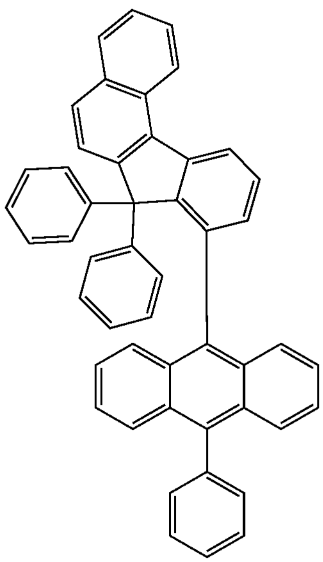
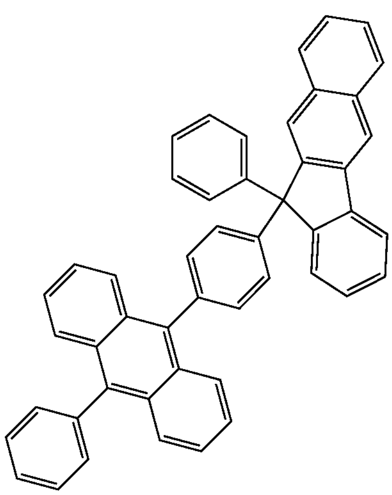
-continued
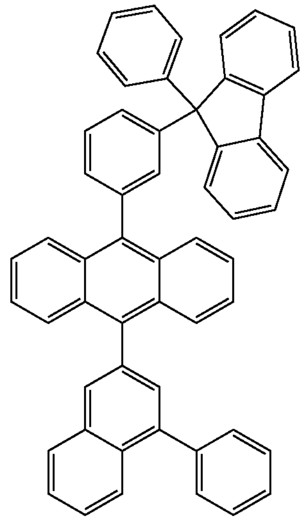
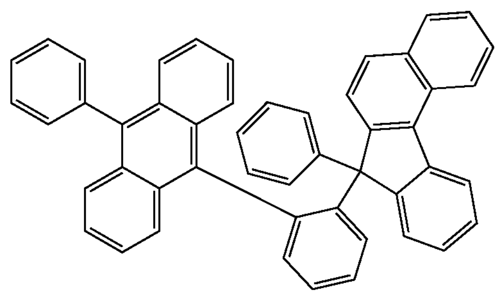
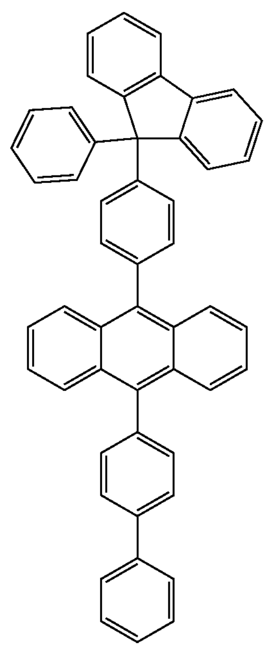

-continued
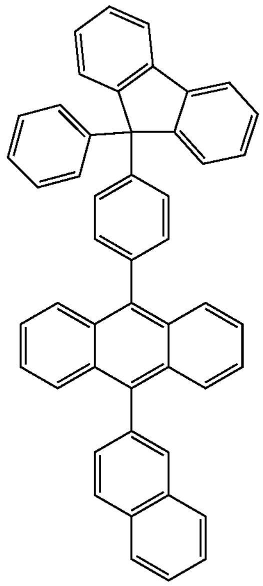
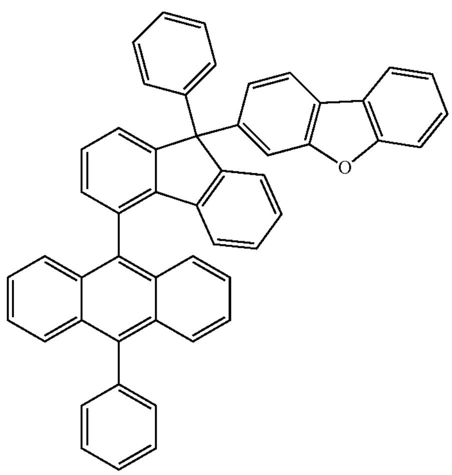
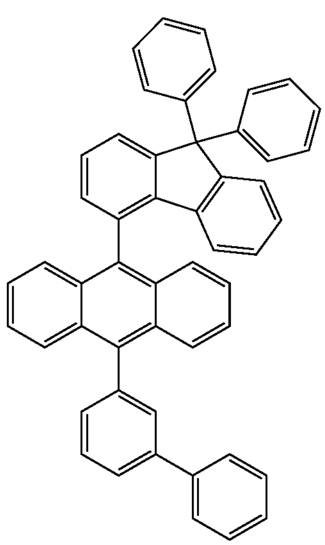
-continued
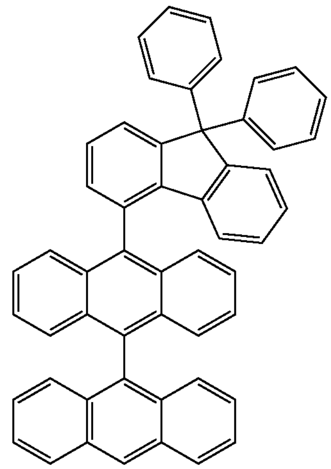
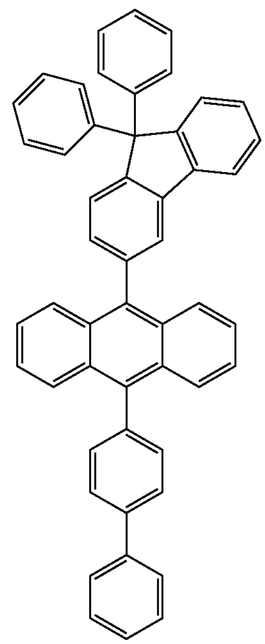
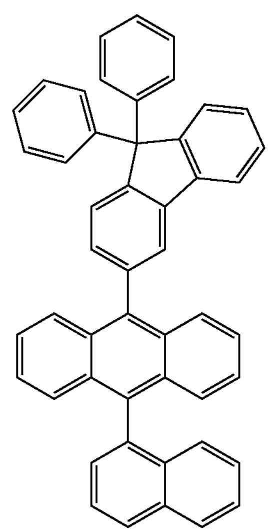

-continued
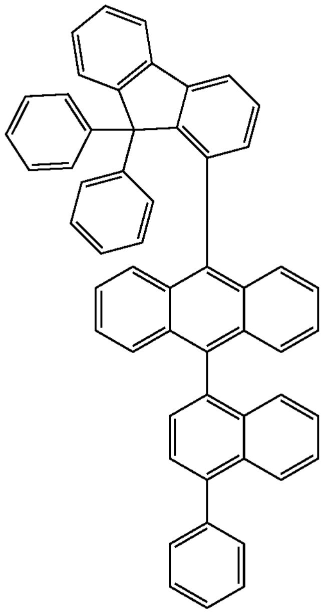
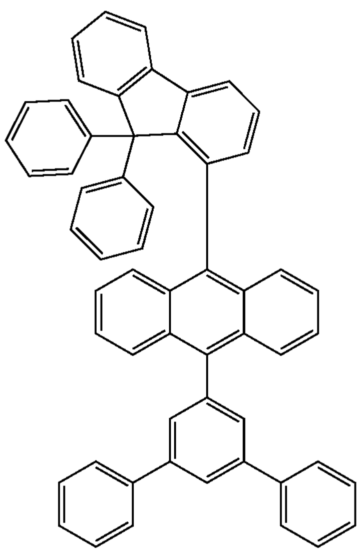
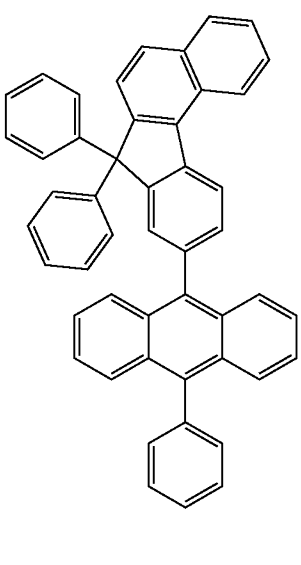
-continued
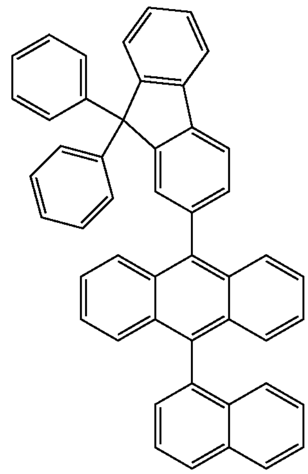
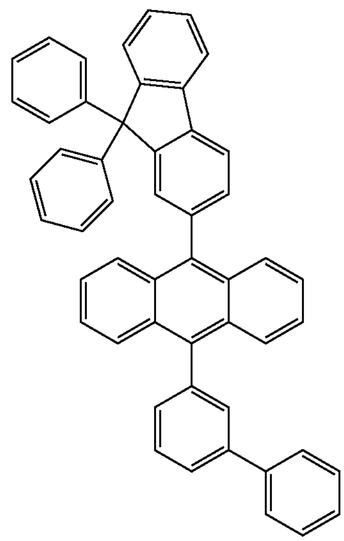
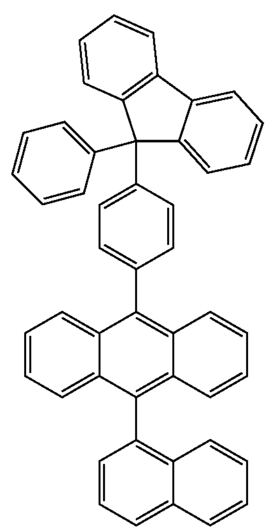

-continued
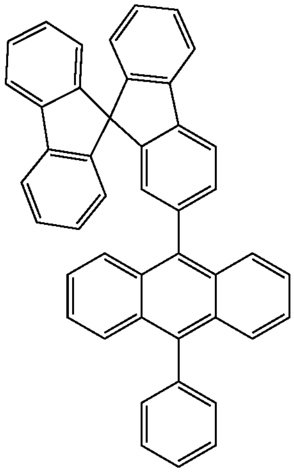
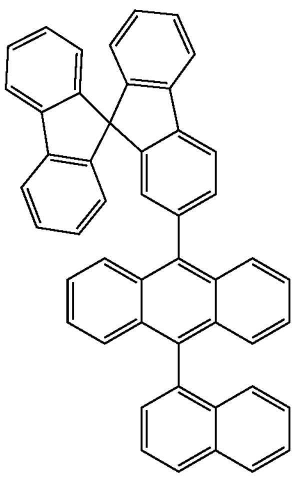
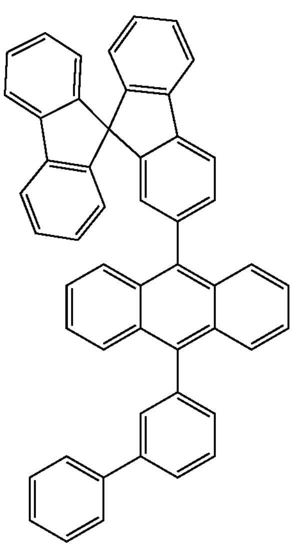
-continued
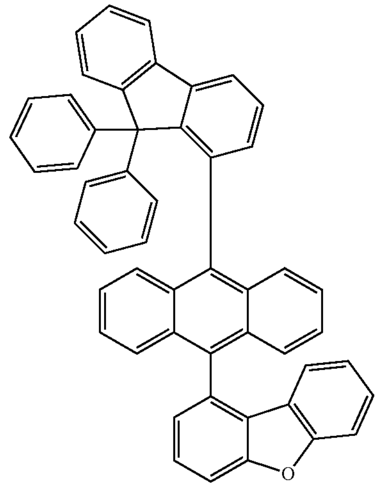
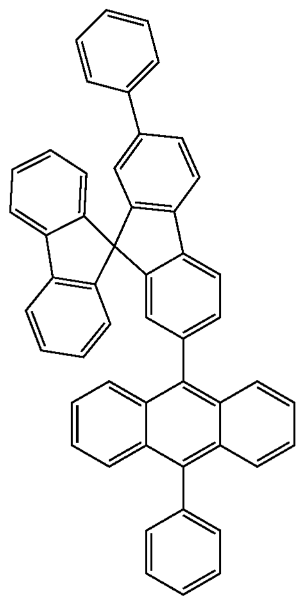
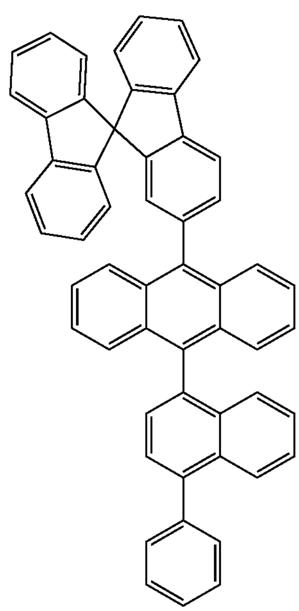

-continued
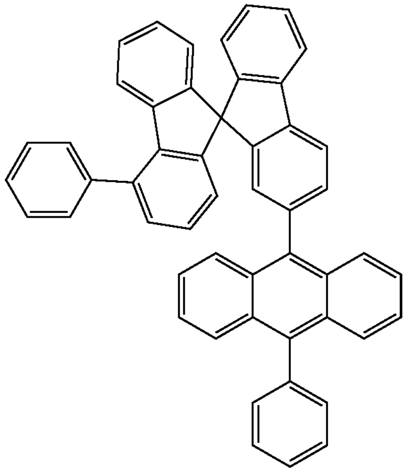
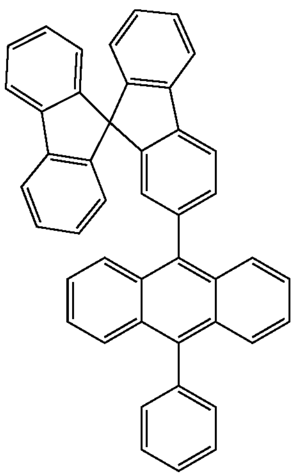
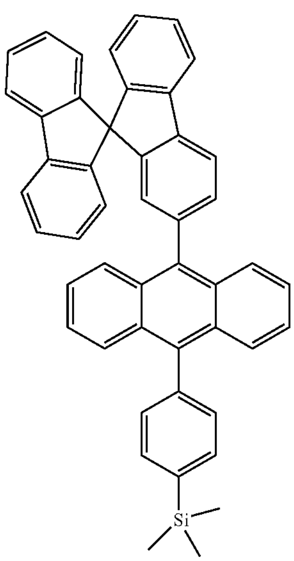
-continued
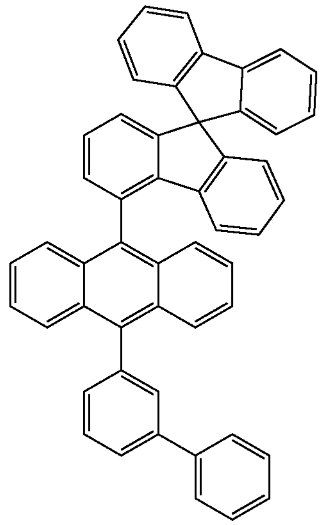
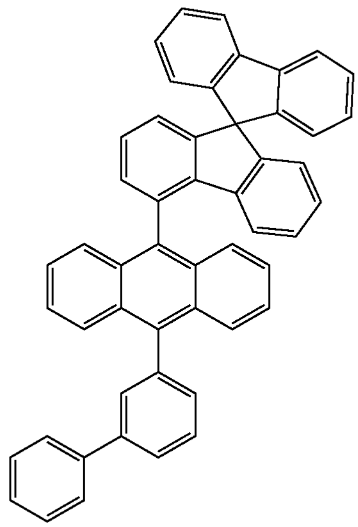
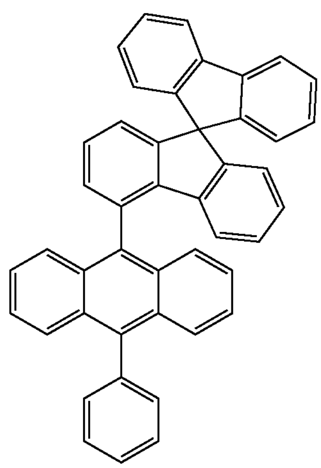

-continued
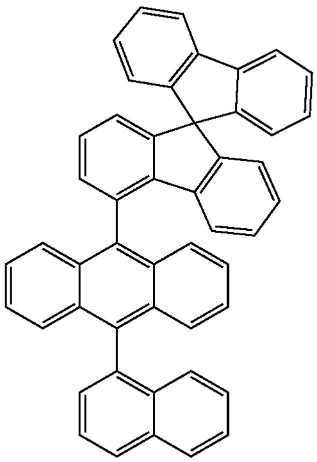
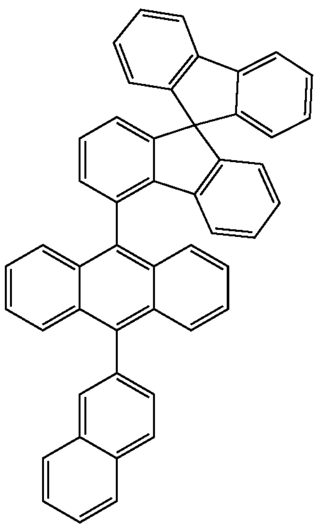
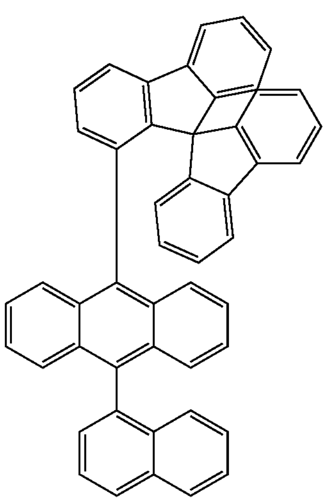
-continued
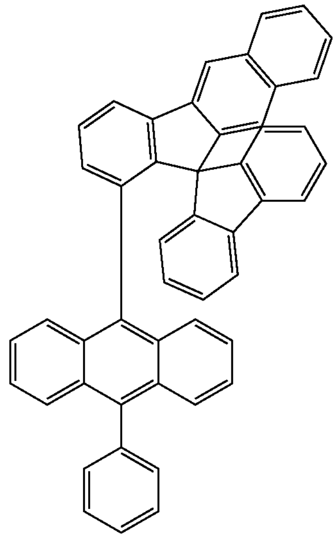
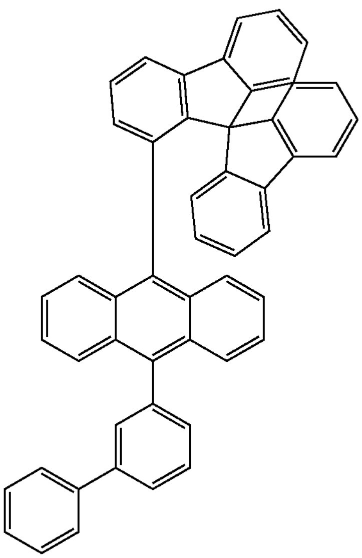
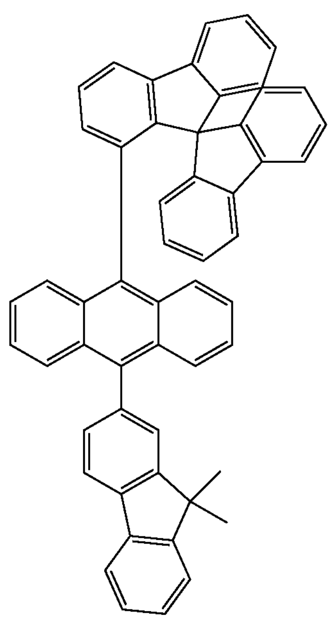

-continued
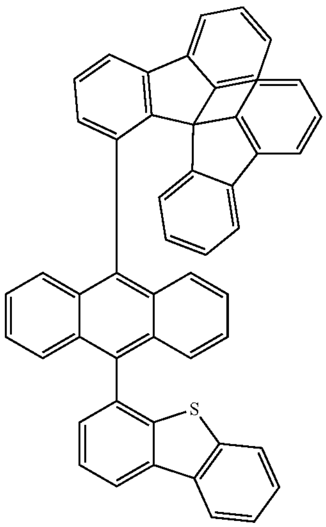
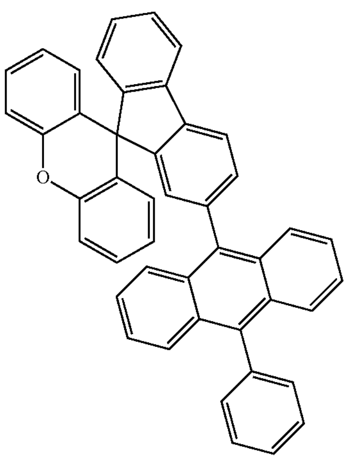
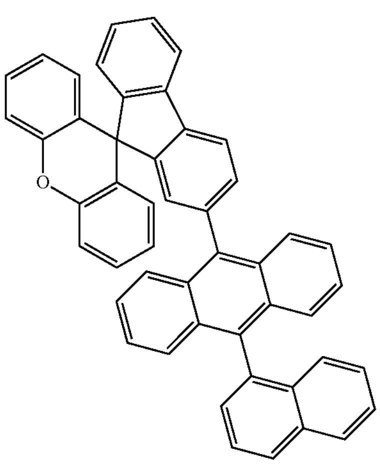
-continued
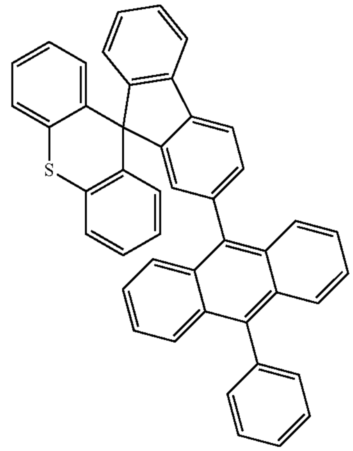
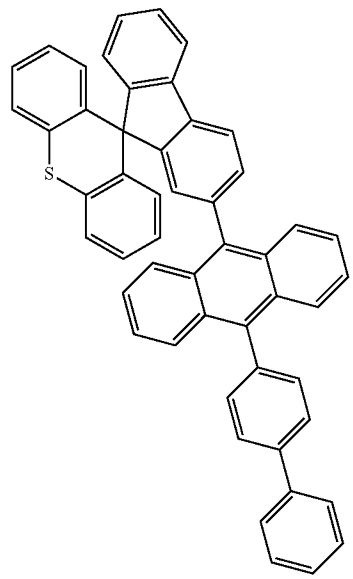
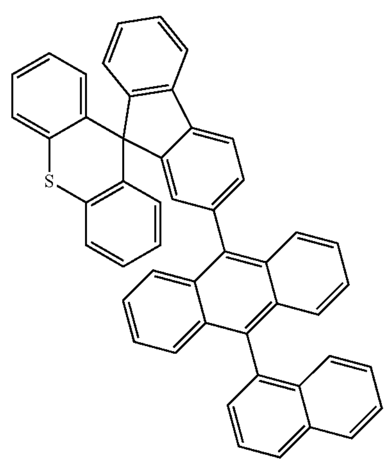

-continued
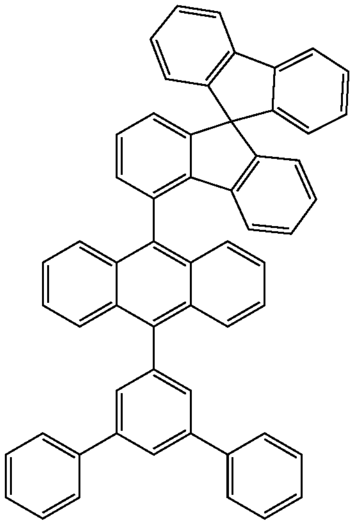
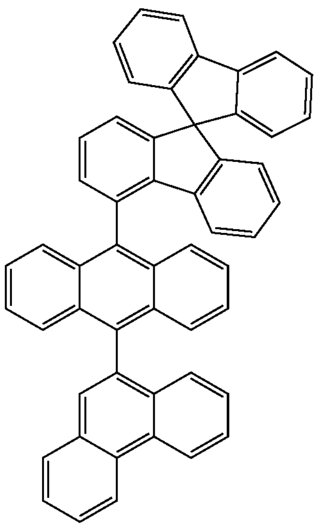
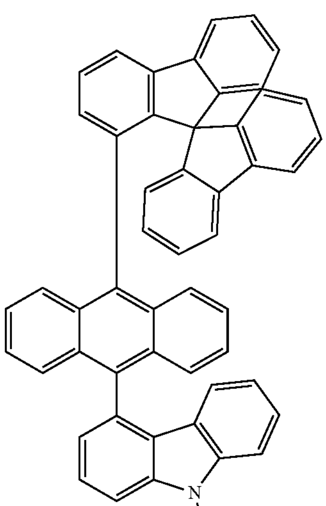
-continued
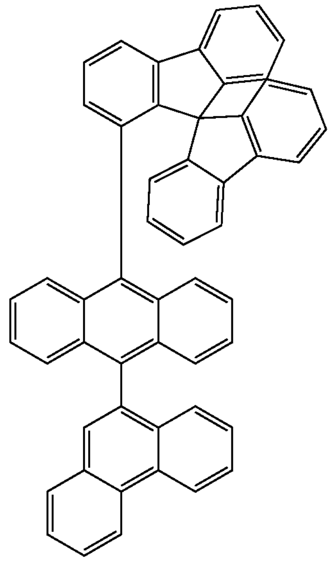
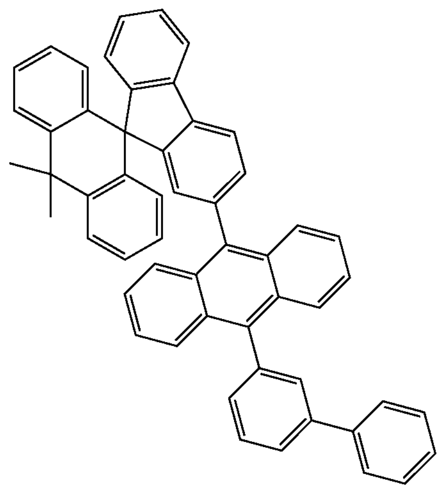
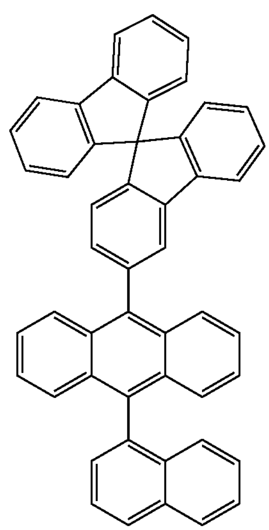

-continued
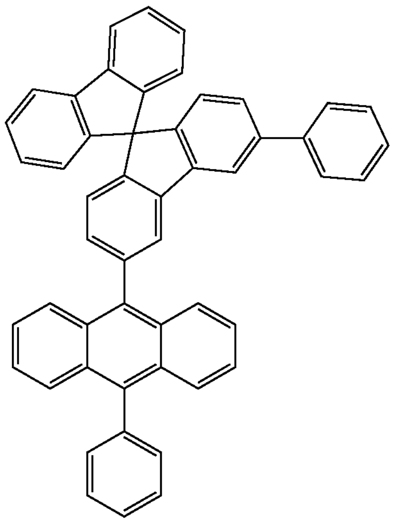
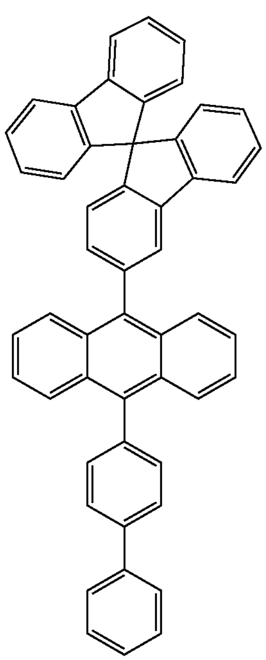
-continued
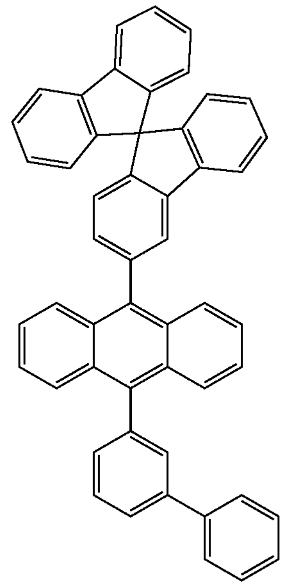
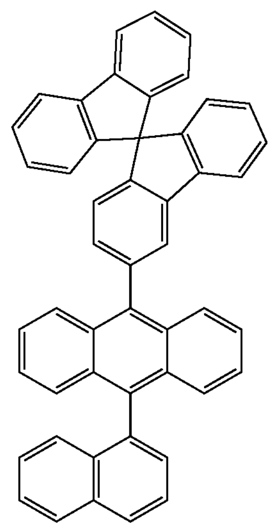
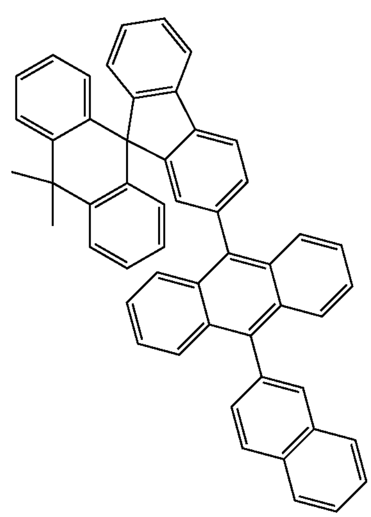

-continued

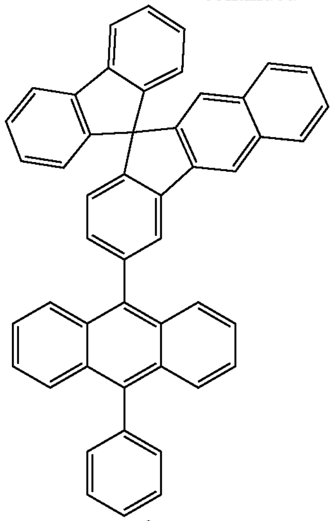

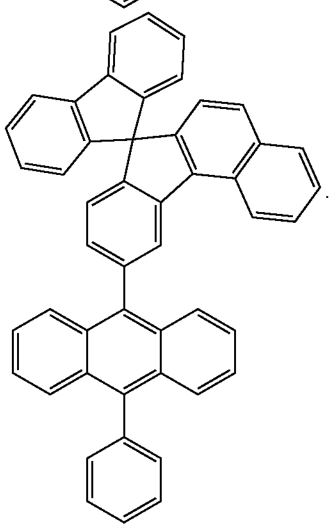

According to an exemplary embodiment of the present invention, a host of the light emitting layer includes two or more compounds.

In an exemplary embodiment of the present invention, the light emitting layer further includes a fluorescent dopant, and the fluorescent dopant includes a non-pyrene-based compound.

According to an exemplary embodiment of the present invention, the non-pyrene-based compound is a compound composed of sp3 carbon as a center, which includes two or more substituted or unsubstituted amine groups.

In an exemplary embodiment of the present invention, the non-pyrene-based compound is a boron-based compound.

In an exemplary embodiment of the present invention, the organic light emitting device has a maximum emission peak at a wavelength of 400 nm to 470 nm.

According to another exemplary embodiment, the organic light emitting device has a maximum emission peak at a wavelength of 400 nm to 470 nm, and includes a non-pyrene-based compound as a dopant of the light emitting layer.

The emission spectrum of the organic light emitting device requires high color purity according to the purpose, and the efficiency based on the same significantly affects the overall performance of the device. Depending on the dopant structure of the light emitting layer and the correlation between the host and the dopant, the color purity of the emission spectrum can vary, and the case where a boron-based compound which is a non-pyrene-based compound is included as a dopant of the light emitting layer has an advantage in that the efficiency is improved through the service life or high color purity of the device as compared to the case where a pyrene-based compound is included as a dopant of the light emitting layer.

When one member of the present invention is disposed "on" another member, this includes not only a case where the one member is brought into contact with another member, but also a case where still another member is present between the two members.

When one part of the present invention "includes" one constituent element, unless otherwise specifically described, this does not mean that another constituent element is excluded, but means that the another constituent element can be further included.

The organic light emitting device can have, for example, the stacking structure described below, but the stacking structure is not limited thereto.

(1) Anode/Hole transport layer/Light emitting layer/Electron transport layer/Cathode (2) Anode/Hole transport layer/Light emitting layer/Electron transport layer/Electron injection layer/Cathode (3) Anode/Hole injection layer/Hole transport layer/Light emitting layer/Electron transport layer/Cathode (4) Anode/Hole injection layer/Hole transport layer/Light emitting layer/Electron transport layer/Electron injection layer/Cathode (5) Anode/Hole transport layer/Electron blocking layer/Light emitting layer/Electron transport layer/Cathode (6) Anode/Hole transport layer/Electron blocking layer/Light emitting layer/Electron transport layer/Electron injection layer/Cathode (7) Anode/Hole injection layer/Hole transport layer/Electron blocking layer/Light emitting layer/Electron transport layer/Cathode (8) Anode/Hole injection layer/Hole transport layer/Electron blocking layer/Light emitting layer/Electron transport layer/Electron injection layer/Cathode (9) Anode/Hole transport layer/Light emitting layer/Hole blocking layer/Electron transport layer/Cathode

(10) Anode/Hole transport layer/Light emitting layer/Hole blocking layer/Electron transport layer/Electron injection layer/Cathode

(11) Anode/Hole injection layer/Hole transport layer/Light emitting layer/Hole blocking layer/Electron transport layer/Cathode

(12) Anode/Hole injection layer/Hole transport layer/Light emitting layer/Hole blocking layer/Electron transport layer/Electron injection layer/Cathode

(13) Anode/Hole injection layer/Hole transport layer/Electron blocking layer/Light emitting layer/Hole blocking layer/Electron transport layer/Electron injection layer/Cathode The structure of the organic light emitting device of the present invention can have a structure illustrated in FIG. 1, but is not limited thereto.

FIG. 1 exemplifies a structure of an organic light emitting device in which an anode 2, a hole injection layer 3, a hole transport layer 4, a light emitting layer 5, a hole blocking layer 6, an electron transport layer 7, an electron injection layer 8, and a cathode 9 are sequentially stacked on a substrate 1.

FIG. 2 exemplifies a structure of an organic light emitting device in which an anode 2, a hole injection layer 3, a hole transport layer 4, an electron blocking layer 10, a light emitting layer 5, a hole blocking layer 6, an electron transport layer 7, an electron injection layer 8, and a cathode 9 are sequentially stacked on a substrate 1.

The organic light emitting device according to the present invention can be manufactured by depositing a metal or a metal oxide having conductivity, or an alloy thereof on a substrate to form an anode, forming an organic material layer having one or more layers selected from the group consisting of a hole injection layer, a hole transport layer, a light emitting layer, an electron blocking layer, a layer which simultaneously injects and transports holes, a hole blocking layer, a layer which simultaneously injects and transports electrons, an electron transport layer, and an electron injection layer, thereon, and then depositing a material, which can be used as a cathode, thereon, by using a physical vapor deposition (PVD) method such as sputtering or e-beam evaporation. In addition to the method described above, an organic light emitting device can be made by sequentially depositing a cathode material, an organic material layer, and an anode material on a substrate.

Further, the compound can be formed as an organic material layer by not only a vacuum deposition method, but also a solution application method when the organic light emitting device according to the present invention is manufactured. Here, the solution application method means spin coating, dip coating, doctor blading, inkjet printing, screen printing, a spray method, roll coating, and the like, but is not limited thereto.

The organic material layer can also have a multi-layered structure including a hole injection layer, a hole transport layer, a hole blocking layer, a layer which simultaneously injects and transports holes, an electron blocking layer, a light emitting layer, an electron transport layer, an electron injection layer, a layer which simultaneously injects and transports electrons, and the like, but is not limited thereto, and can have a single-layered structure.

The anode is an electrode which injects holes, and as an anode material, materials having a high work function are usually preferred so as to facilitate the injection of holes into an organic material layer. Specific examples of the anode material which can be used in the present invention include: a metal, such as vanadium, chromium, copper, zinc, and gold, or an alloy thereof; a metal oxide, such as zinc oxide, indium oxide, indium tin oxide (ITO), and indium zinc oxide (IZO); a combination of a metal and an oxide, such as ZnO:Al or $SnO_2$:Sb; a conductive polymer, such as poly(3-methylthiophene), poly[3,4-(ethylene-1,2-dioxy)thiophene] (PEDOT), polypyrrole, and polyaniline; and the like, but are not limited thereto.

The cathode is an electrode which injects electrons, and as a cathode material, materials having a low work function are usually preferred so as to facilitate the injection of electrons into an organic material layer. Specific examples of the cathode material include: a metal such as magnesium, calcium, sodium, potassium, titanium, indium, yttrium, lithium, gadolinium, aluminum, silver, tin, and lead, or an alloy thereof; a multi-layer structured material, such as LiF/Al or $LiO_2$/Al; and the like, but are not limited thereto. Further, the cathode can be formed as one layer or two layers.

Materials for an organic material layer of an organic light emitting device exemplified below exemplify materials which can be included when each layer does not include the above-described compound composed of sp3 carbon as a center, and are not limited thereto.

The hole injection layer is a layer which serves to facilitate the injection of holes from an anode to a light emitting layer, and a hole injection material is a material which can proficiently accept holes from an anode at a low voltage, and the highest occupied molecular orbital (HOMO) of the hole injection material is preferably a value between the work function of the anode material and the HOMO of the peripheral organic material layer. Specific examples of the hole injection material include metal porphyrin, oligothiophene, arylamine-based organic materials, hexanitrile hexaazatriphenylene-based organic materials, quinacridone-based organic materials, perylene-based organic materials, anthraquinone, polyaniline-based and polythiophene-based conductive polymers, and the like, but are not limited thereto.

The hole transport layer can serve to smoothly transport holes. A hole transport material is suitably a material having high hole mobility which can accept holes from an anode or a hole injection layer and transfer the holes to a light emitting layer. Specific examples thereof include arylamine-based organic materials, conductive polymers, block copolymers having both conjugated portions and non-conjugated portions, and the like, but are not limited thereto.

In the organic light emitting device of the present invention, the organic material layer can include an electron blocking layer, the electron blocking layer is a layer which blocks electrons from reaching an anode, and as a material thereof, materials known in the art can be used.

The light emitting layer can emit a blue color, and a material for the light emitting layer is a material which can accept holes and electrons from a hole transport layer and an electron transport layer, respectively, and combine the holes and the electrons to emit light in a visible ray region, and corresponds to a material having high quantum efficiency for fluorescence or phosphorescence.

The electron transport layer can serve to smoothly transport electrons. An electron transport material is suitably a material having high electron mobility which can proficiently accept electrons from a cathode and transfer the electrons to a light emitting layer.

The electron injection layer can serve to smoothly inject electrons. An electron injection material is preferably a compound which has a capability of transporting electrons, an effect of injecting electrons from a cathode, and an excellent effect of injecting electrons into a light emitting layer or a light emitting material, prevents excitons, produced from a light emitting layer, from moving to a hole injection layer, and is also excellent in the ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, metal complex compounds, nitrogen-containing 5-membered ring derivatives, and the like, but are not limited thereto.

Examples of the metal complex compounds include 8-hydroxyquinolinato lithium, bis(8-hydroxyquinolinato) zinc, bis(8-hydroxyquinolinato) copper, bis(8-hydroxyquinolinato) manganese, tris(8-hydroxyquinolinato) aluminum, tris (2-methyl-8-hydroxyquinolinato) aluminum, tris(8-hydroxyquinolinato) gallium, bis(10-hydroxybenzo[h] quinolinato) beryllium, bis(10-hydroxybenzo[h]-quinolinato) zinc, bis(2-methyl-8-quinolinato) chlorogallium, bis(2-methyl-8-quinolinato) (o-cresolato) gallium, bis(2-methyl-8-quinolinato) (1-naphtholato) aluminum, bis(2-methyl-8-quinolinato) (2-naphtholato) gallium, and the like, but are not limited thereto.

The hole blocking layer is a layer which blocks holes from reaching a cathode, can be provided between an electron transport layer and a light emitting layer, and can be generally formed under the same conditions as those of the hole injection layer. Specific examples thereof include oxadiazole derivatives or triazole derivatives, phenanthroline derivatives, BCP, aluminum complexes, and the like, but are not limited thereto.

The organic light emitting device according to the present invention can be a top emission type, a bottom emission type, or a dual emission type according to the material to be used.

EXAMPLES

Hereinafter, the present specification will be described in detail with reference to Examples for specifically describing the present specification.

However, the Examples according to the present specification can be modified in various forms, and it is not interpreted that the scope of the present application is limited to the Examples described in detail below. The Examples of the present application are provided to more completely explain the present specification to a person with ordinary skill in the art.

Compounds used in the following Experimental Examples are as follows:

PD1

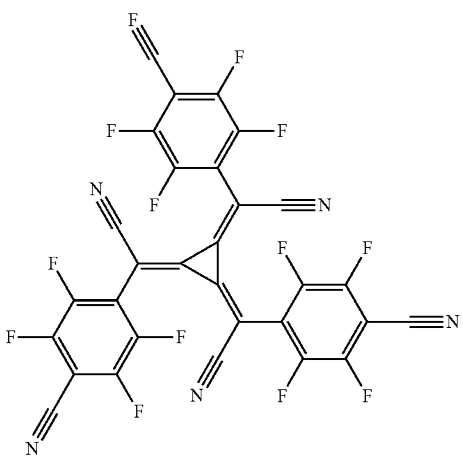

HT1

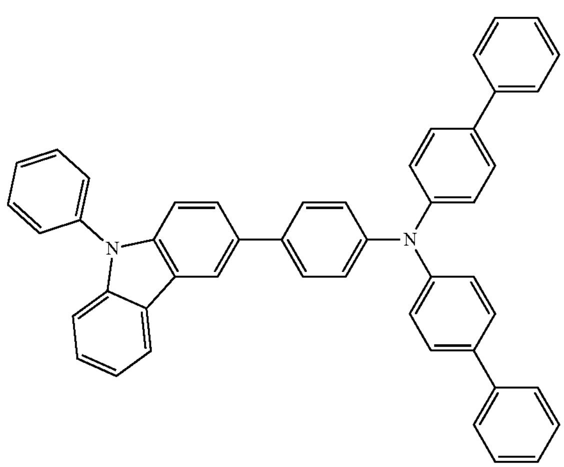

-continued

HT2

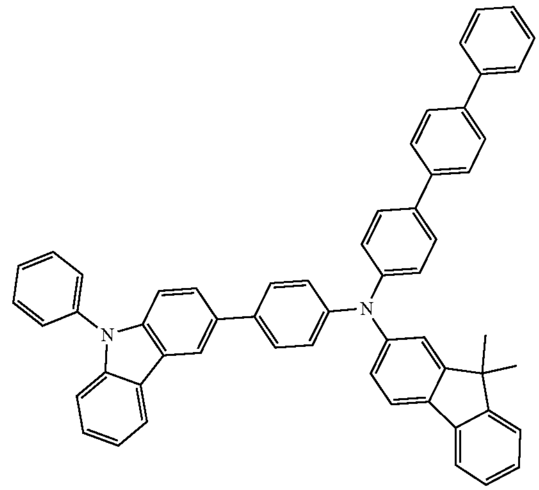

HT3

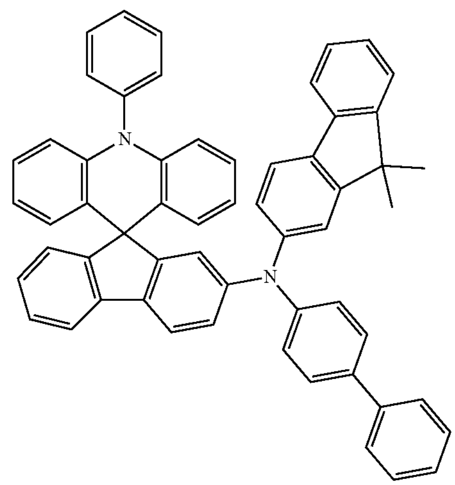

HT4

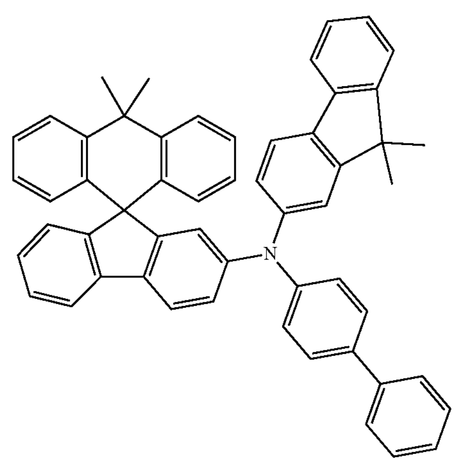

-continued
EB1
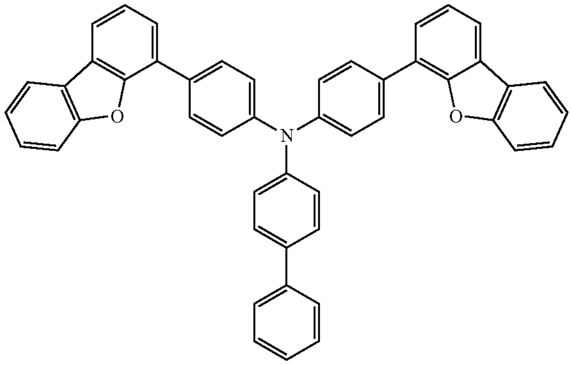
EB2
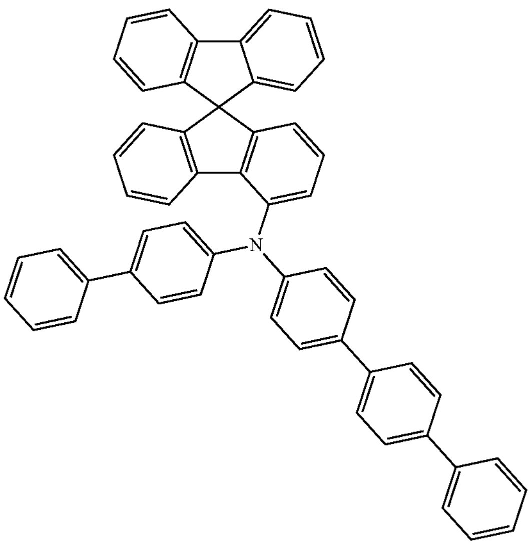
EB3
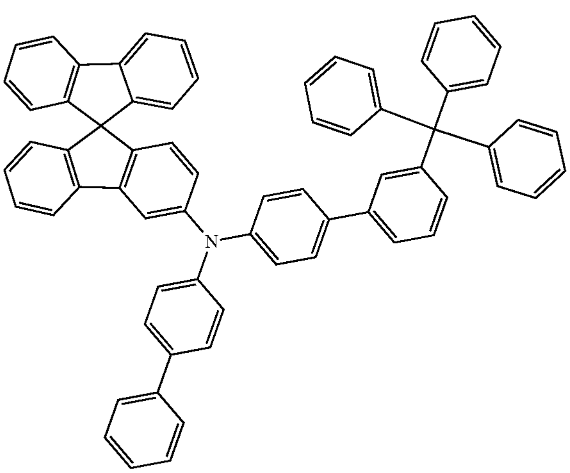
-continued
EB4
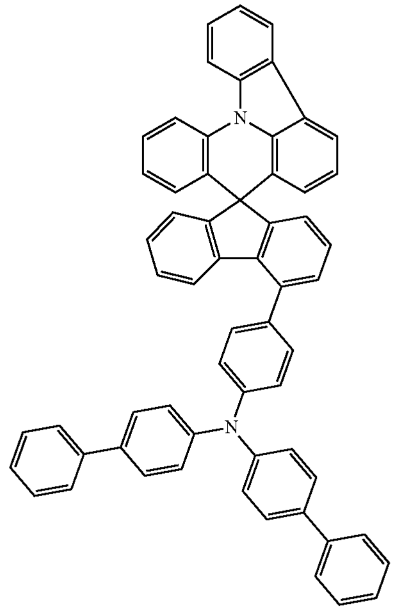
BH1
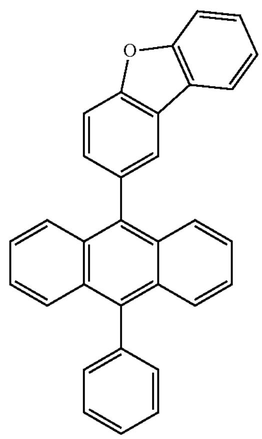
BH2
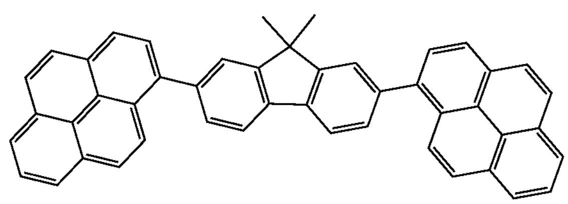
BD1
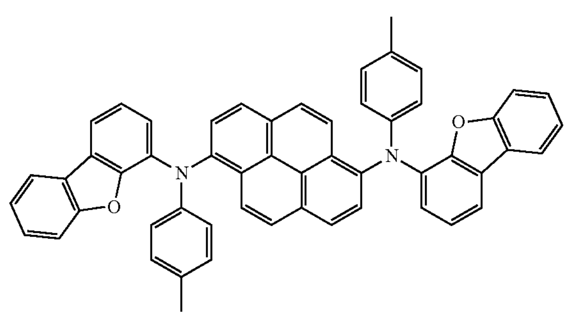

-continued
BD2
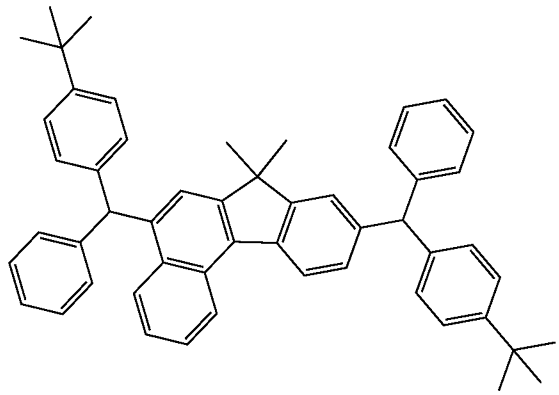
BD3
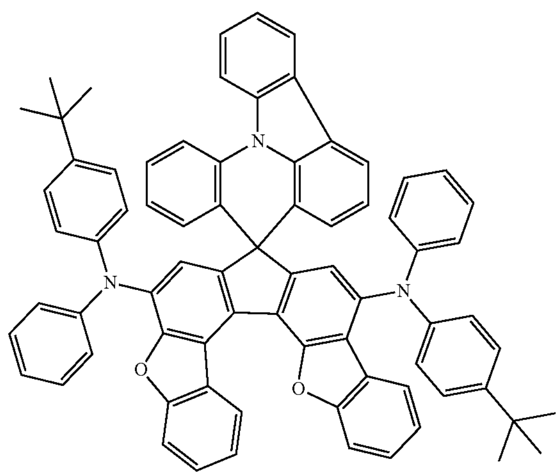
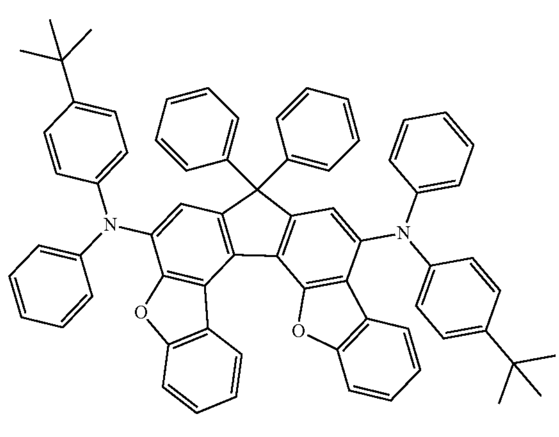
-continued
BD5
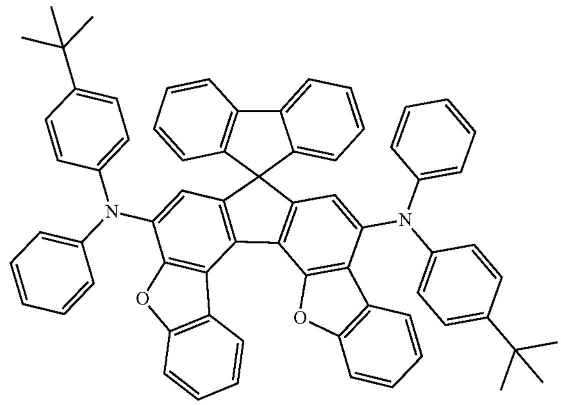
HB1
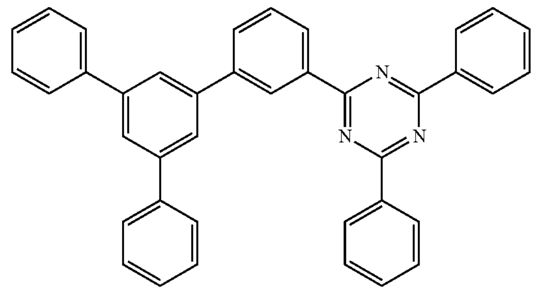
HB2
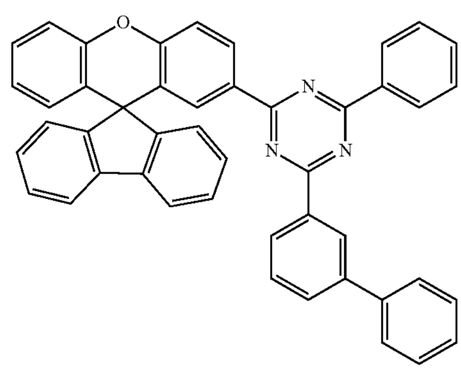
HB3
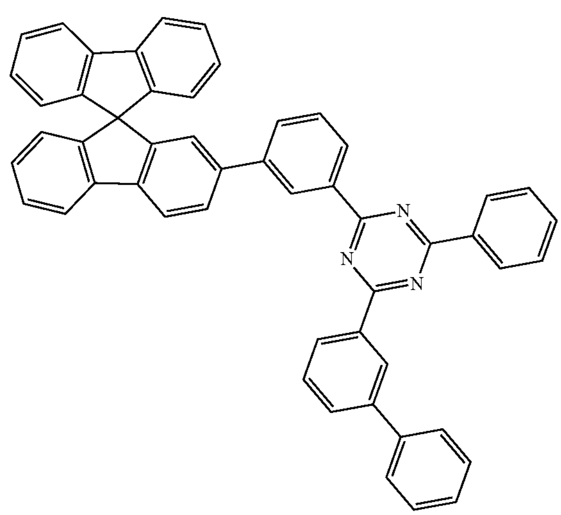

HB4

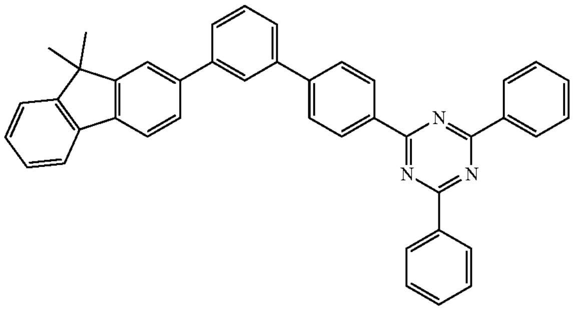

ET1

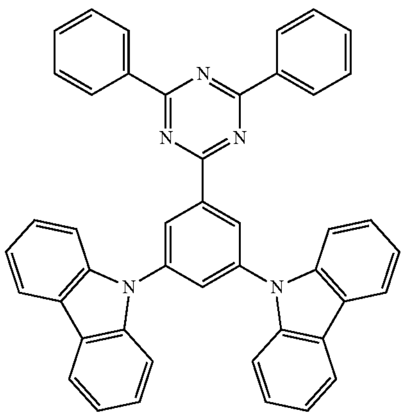

ET2

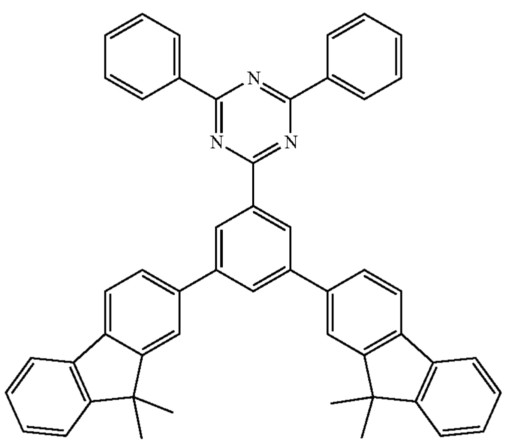

ET3

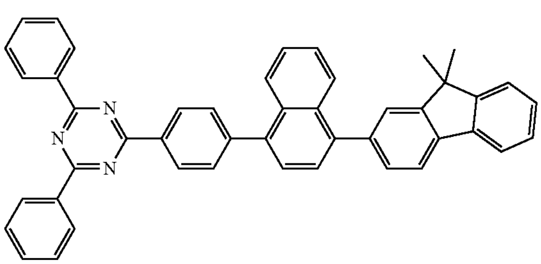

ET4

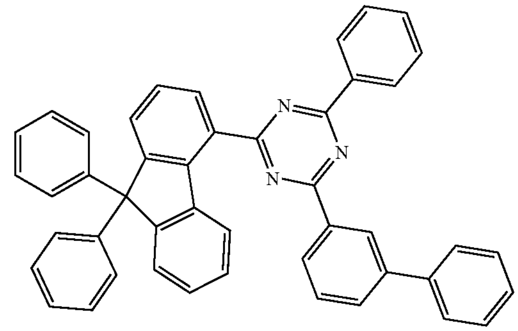

Liq

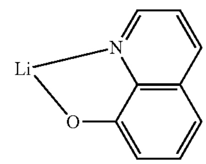

CP1

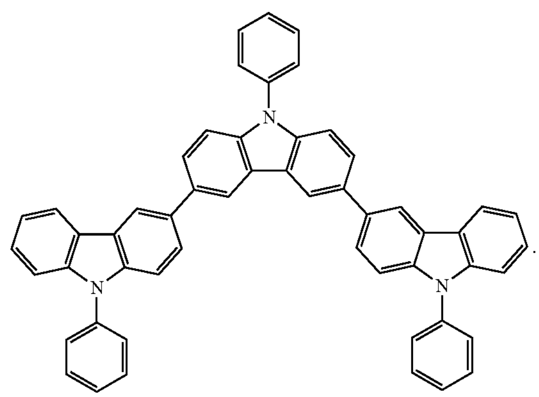

In the compounds, PD1 was synthesized by using a content and a synthesis process described in Korean Patent No. 10-1188391 B1 or partially modifying the synthesis process, HT1 was synthesized by using a content and a synthesis process described in Japanese Patent No. 5133259 B2 or partially modifying the synthesis process, HT2 was synthesized by using a content and a synthesis process described in U.S. Pat. No. 9,917,258 B2 or partially modifying the synthesis process, HT3 was synthesized by using a content and a synthesis process described in Korean Patent No. 10-0645028 B1 or partially modifying the synthesis process, HT4 was synthesized by using a content and a synthesis process described in Chinese Patent Application No. 2015-10845527 or partially modifying the synthesis process, EB1 was synthesized by using a content and a synthesis process described in Japanese Patent No. 5608095 B2 or partially modifying the synthesis process, EB2 was synthesized by using a content and a synthesis process described in Korean Patent No. 10-1605987 B1 or partially modifying the synthesis process, EB3 was synthesized by using a content and a synthesis process described in Korean Patent Application Laid-Open No. 10-2015-0036654 A or partially modifying the synthesis process, EB4 was synthesized by using a content and a synthesis process described in Korean Patent No. 0671862 B1 or 0645052 B1 or partially modifying the synthesis process, BH1 was synthesized by using a content and a synthesis process described in Korean Patent Application Laid-Open No. 10-2016-0089693 A or partially modifying the synthesis process, BH2 was synthesized by using a content and a synthesis process described in Japanese Patent No. 4338367 B2 or partially modifying the synthesis process, BD1 was synthesized by using a content and a synthesis process described in Japanese Patent No. 5202730 B2 or partially modifying the synthesis process, BD2 was synthesized by using a content and a synthesis process described in Japanese Patent No. 5617398 B2 or partially modifying the synthesis process, BD3 was synthesized by using a content and a synthesis process described in Korean Patent Application Laid-Open No. 10-2018-0004032 A or partially modifying the synthesis process, BD4 and BD5 were synthesized by using a content and a synthesis process described in Korean Patent Application Laid-Open No. 10-2015-0130206A or partially modifying the synthesis process, HB1 was synthesized by using a content and a synthesis process described in U.S. Pat. No. 6,821,643 B1 or partially modifying the synthesis process, HB2 was synthesized by using a content and a synthesis process described in Korean Patent No. 10-1755986 B1 or partially modifying the synthesis process, HB3 was synthesized by using a content and a synthesis process described in Korean Patent No. 10-1737199 B1 or partially modifying the synthesis process, HB4 was synthesized by using a content and a synthesis process described in Korean Patent No. 10-1737199B1 or 10-1542714 B1 or partially modifying the synthesis process, ET1 was synthesized by using a content and a synthesis process described in Japanese Patent No. 5194596 or partially modifying the synthesis process, ET2 and ET3 were synthesized by using a content and a synthesis process described in Korean Patent No. 10-1832084 B1 or partially modifying the synthesis process, and ET4 was synthesized by using a content and a synthesis process described in Korean Patent No. 10-1542714 B1 or partially modifying the synthesis process.

EXPERIMENTAL EXAMPLES

Example 1. Manufacture of OLED

As an anode, a substrate on which ITO/Ag/ITO were deposited to have a thickness of 70 Å/1000 Å/70 Å, respectively, was cut into a size of 50 mm×50 mm×0.5 mm, put into distilled water in which a detergent was dissolved, and washed with ultrasonic waves. A product manufactured by Fischer Co. was used as the detergent, and distilled water twice filtered using a filter manufactured by Millipore Co. was used as the distilled water. After the ITO was washed for 30 minutes, ultrasonic washing was conducted twice repeatedly using distilled water for 10 minutes. After the washing using distilled water was completed, ultrasonic washing was conducted using isopropyl alcohol, acetone, and methanol solvents in this order, and drying was then conducted.

Compound HT2 was thermally vacuum-deposited to have a thickness of 50 Å on the anode thus prepared, and compound PD1 (2 wt %) was co-deposited, thereby forming a hole injection layer, and compound HT2 as a material which transports holes was vacuum-deposited to have a thickness of 1,150 Å thereon, thereby forming a hole transport layer, Next, a host compound BH1 and a dopant compound BD2 (2 wt %) were vacuum-deposited to have a thickness of 360 Å, thereby forming a light emitting layer. Thereafter, compound HB2 was deposited to have a thickness of 50 Å, thereby forming a hole blocking layer, and compound ET1 and Liq were mixed at 5:5, thereby forming an electron transport layer having a thickness of 350 Å. Sequentially, magnesium and lithium fluoride (LiF) were deposited to have a thickness of 50 Å to form a film as an electron injection layer <EIL>, magnesium and silver (1:4) were used to form a cathode having a thickness of 200 Å, and then compound CP1 was deposited to have a thickness of 600 Å, thereby completing a device. In the aforementioned procedure, the deposition rates of the organic materials were each maintained at 1 Å/sec.

The configurations of the devices in Examples 2 to 28 and Comparative Examples 1 to 20 and the materials forming the respective layers are shown in the following Table 2, and the organic light emitting devices of Examples 2 to 28 and Comparative Examples 1 to 20 were manufactured by the same method as in Example 1.

The compounds (applied to the Examples) each composed of sp3 carbon as a center, which are used in each of the hole transport region, the electron transport region and the light emitting layer proposed by the present experimental examples are as follows.

Hole transport region
Hole transport layer: HT2 to HT4
Electron blocking layer: EB2 to EB4
Light emitting layer
Dopant: BD2 to BD5
Electron transport region
Hole blocking layer: HB2 to HB4
Electron transport layer: ET2 to ET4

The compounds (applied to the Comparative Examples) not composed of sp3 carbon as a center, which are used in each of the hole transport region, the electron transport region and the light emitting layer proposed by the present experimental examples are as follows.

Hole transport region
Hole transport layer: HT1
Electron Blocking layer: EB1
Light emitting layer
Dopant: BD1
Electron transport region
Hole blocking layer: HB1
Electron transport layer: ET1

The band gap energy ($E_{bg}$) of each of the compounds used in the present experimental example is shown in the following Table 1:

TABLE 1

| Compound | | $E_{bg}$ |
|---|---|---|
| Hole transport layer | HT1 | 3.30 |
| | HT2 | 3.26 |
| | HT3 | 3.33 |
| | HT4 | 3.36 |
| Electron blocking layer | EB1 | 3.11 |
| | EB2 | 3.35 |
| | EB3 | 3.18 |
| | EB4 | 3.36 |
| Light emitting layer/Host | BH1 | 3.13 |
| | BH2 | 3.05 |
| Hole blocking layer | HB1 | 3.55 |
| | HB2 | 3.52 |
| | HB3 | 3.41 |
| | HB4 | 3.42 |
| Electron transport layer | ET1 | 3.01 |
| | ET2 | 3.12 |
| | ET3 | 3.32 |
| | ET4 | 3.43 |

The results in which one or more types (three or more compounds for all the light emitting devices) of the proposed compounds each composed of sp3 carbon as a center were carried out in the hole transport region, the electron transport region, and the light emitting layer are shown in Examples 1 to 28, and the comparisons of the organic light emitting devices composed of the configurations which do not match the aforementioned conditions are shown in Comparative Examples 1 to 20, and thus various configurations and the results of the devices are shown in the following Tables 2 and 3. In the following Table 3, the voltage (V) and the light emitting efficiency (Cd/A) were measured at a current density of 20 mA/cm$^2$, and for the service life (T95), a time taken for the brightness to become 95% as compared to the initial brightness was measured at a current density of 20 mA/cm$^2$.

TABLE 2

| Experimental Examples | Hole injection layer | Hole transport layer | Electron blocking layer | Light emitting layer/ Host | Light emitting layer/ Dopant | Hole blocking layer | Electron transport layer |
|---|---|---|---|---|---|---|---|
| Example 1 | HT2 (PD1, 2 wt %) | HT2 | — | BH1 | BD2 | HB2 | ET1 |
| Example 2 | HT2 (PD1, 2 wt %) | HT2 | EB1 | BH1 | BD2 | HB2 | ET1 |
| Example 3 | HT2 (PD1, 2 wt %) | HT2 | EB1 | BH1 | BD2 | HB1 | ET2 |
| Example 4 | HT1 (PD1, 2 wt %) | HT1 | EB2 | BH1 | BD2 | HB2 | ET1 |
| Example 5 | HT1 (PD1, 2 wt %) | HT1 | EB2 | BH1 | BD2 | HB1 | ET2 |
| Example 6 | HT2 (PD1, 2 wt %) | HT2 | EB1 | BH1 | BD3 | HB2 | ET1 |
| Example 7 | HT2 (PD1, 2 wt %) | HT2 | EB1 | BH1 | BD4 | HB1 | ET2 |
| Example 8 | HT3 (PD1, 2 wt %) | HT3 | EB1 | BH1 | BD5 | HB4 | ET1 |
| Example 9 | HT3 (PD1, 2 wt %) | HT3 | EB1 | BH1 | BD3 | HB1 | ET4 |
| Example 10 | HT4 (PD1, 2 wt %) | HT4 | EB1 | BH1 | BD2 | HB1 | ET3 |
| Example 11 | HT4 (PD1, 2 wt %) | HT4 | EB1 | BH1 | BD3 | HB3 | ET1 |
| Example 12 | HT1 (PD1, 2 wt %) | HT1 | EB3 | BH1 | BD2 | HB1 | ET4 |
| Example 13 | HT1 (PD1, 2 wt %) | HT1 | EB3 | BH1 | BD5 | HB2 | ET1 |
| Example 14 | HT1 (PD1, 2 wt %) | HT1 | EB4 | BH1 | BD2 | HB3 | ET1 |
| Example 15 | HT2 (PD1, 2 wt %) | HT2 | EB4 | BH1 | BD2 | HB2 | ET1 |
| Example 16 | HT2 (PD1, 2 wt %) | HT2 | EB1 | BH1 | BD2 | HB2 | ET2 |
| Example 17 | HT1 (PD1, 2 wt %) | HT1 | EB2 | BH1 | BD2 | HB2 | ET4 |
| Example 18 | HT3 (PD1, 2 wt %) | HT3 | EB2 | BH1 | BD5 | HB4 | ET1 |
| Example 19 | HT3 (PD1, 2 wt %) | HT3 | EB4 | BH1 | BD3 | HB1 | ET4 |
| Example 20 | HT4 (PD1, 2 wt %) | HT4 | EB3 | BH1 | BD2 | HB1 | ET3 |
| Example 21 | HT4 (PD1, 2 wt %) | HT4 | EB1 | BH1 | BD3 | HB3 | ET4 |
| Example 22 | HT2 (PD1, 2 wt %) | HT2 | EB2 | BH1 | BD2 | HB2 | ET2 |
| Example 23 | HT2 (PD1, 2 wt %) | HT2 | EB2 | BH1 | BD2 | HB4 | ET3 |
| Example 24 | HT2 (PD1, 2 wt %) | HT2 | EB3 | BH1 | BD3 | HB2 | ET4 |
| Example 25 | HT3 (PD1, 2 wt %) | HT3 | EB2 | BH1 | BD2 | HB3 | ET2 |
| Example 26 | HT3 (PD1, 2 wt %) | HT3 | EB4 | BH1 | BD4 | HB3 | ET3 |
| Example 27 | HT4 (PD1, 2 wt %) | HT4 | EB2 | BH1 | BD2 | HB3 | ET4 |
| Example 28 | HT4 (PD1, 2 wt %) | HT4 | EB4 | BH1 | BD5 | HB4 | ET4 |
| Comparative Example 1 | HT1 (PD1, 2 wt %) | HT1 | EB1 | BH1 | BD1 | HB1 | ET1 |
| Comparative Example 2 | HT2 (PD1, 2 wt %) | HT2 | EB1 | BH1 | BD1 | HB1 | ET1 |
| Comparative Example 3 | HT1 (PD1, 2 wt %) | HT1 | EB2 | BH1 | BD1 | HB1 | ET1 |
| Comparative Example 4 | HT1 (PD1, 2 wt %) | HT1 | EB1 | BH1 | BD1 | HB3 | ET1 |
| Comparative Example 5 | HT1 (PD1, 2 wt %) | HT1 | EB1 | BH1 | BD2 | HB1 | ET1 |

TABLE 2-continued

| Experimental Examples | Hole injection layer | Hole transport layer | Electron blocking layer | Light emitting layer/ Host | Light emitting layer/ Dopant | Hole blocking layer | Electron transport layer |
|---|---|---|---|---|---|---|---|
| Comparative Example 6 | HT1 (PD1, 2 wt %) | HT1 | EB1 | BH1 | BD1 | HB1 | ET4 |
| Comparative Example 7 | HT3 (PD1, 2 wt %) | HT3 | EB4 | BH1 | BD1 | HB1 | ET1 |
| Comparative Example 8 | HT1 (PD1, 2 wt %) | HT1 | EB1 | BH1 | BD1 | HB2 | ET3 |
| Comparative Example 9 | HT1 (PD1, 2 wt %) | HT1 | EB3 | BH1 | BD1 | HB4 | ET1 |
| Comparative Example 10 | HT4 (PD1, 2 wt %) | HT4 | EB1 | BH1 | BD1 | HB1 | ET2 |
| Comparative Example 11 | HT2 (PD1, 2 wt %) | HT2 | EB1 | BH1 | BD1 | HB3 | ET1 |
| Comparative Example 12 | HT1 (PD1, 2 wt %) | HT1 | EB3 | BH1 | BD1 | HB1 | ET3 |
| Comparative Example 13 | HT2 (PD1, 2 wt %) | HT2 | EB1 | BH1 | BD3 | HB1 | ET1 |
| Comparative Example 14 | HT1 (PD1, 2 wt %) | HT1 | EB4 | BH1 | BD2 | HB1 | ET1 |
| Comparative Example 15 | HT1 (PD1, 2 wt %) | HT1 | EB1 | BH1 | BD4 | HB2 | ET1 |
| Comparative Example 16 | HT1 (PD1, 2 wt %) | HT1 | EB1 | BH1 | BD2 | HB1 | ET4 |
| Comparative Example 17 | HT4 (PD1, 2 wt %) | HT4 | EB1 | BH1 | BD5 | HB1 | ET1 |
| Comparative Example 18 | HT1 (PD1, 2 wt %) | HT1 | EB1 | BH2 | BD1 | HB1 | ET1 |
| Comparative Example 19 | HT1 (PD1, 2 wt %) | HT1 | EB3 | BH2 | BD1 | HB4 | ET1 |
| Comparative Example 20 | HT3 (PD1, 2 wt %) | HT3 | EB1 | BH2 | BD3 | HB1 | ET4 |

TABLE 3

| Experimental Examples 20 mA/cm2 | Voltage (V) (@20 mA/cm$^2$) | Cd/A (@20 mA/cm$^2$) | Color coordinate (x, y) | Service life (T95, h) (@20 mA/cm$^2$) |
|---|---|---|---|---|
| Example 1 | 3.49 | 6.71 | (0.135, 0.138) | 49.0 |
| Example 2 | 3.43 | 6.63 | (0.134, 0.137) | 50.2 |
| Example 3 | 3.41 | 6.81 | (0.135, 0.138) | 53.1 |
| Example 4 | 3.51 | 6.63 | (0.134, 0.138) | 58.5 |
| Example 5 | 3.55 | 6.72 | (0.136, 0.139) | 57.9 |
| Example 6 | 3.38 | 6.61 | (0.135, 0.138) | 59.1 |
| Example 7 | 3.41 | 6.83 | (0.133, 0.139) | 50.2 |
| Example 8 | 3.39 | 6.78 | (0.135, 0.138) | 55.8 |
| Example 9 | 3.40 | 6.81 | (0.134, 0.138) | 50.1 |
| Example 10 | 3.42 | 6.83 | (0.136, 0.139) | 52.4 |
| Example 11 | 3.43 | 6.70 | (0.136, 0.139) | 55.5 |
| Example 12 | 3.51 | 6.73 | (0.135, 0.138) | 50.8 |
| Example 13 | 3.55 | 6.67 | (0.135, 0.138) | 54.1 |
| Example 14 | 3.54 | 6.73 | (0.133, 0.139) | 58.1 |
| Example 15 | 3.42 | 6.88 | (0.134, 0.139) | 58.4 |
| Example 16 | 3.40 | 6.81 | (0.136, 0.139) | 58.5 |
| Example 17 | 3.49 | 6.78 | (0.136, 0.139) | 55.1 |
| Example 18 | 3.43 | 6.79 | (0.134, 0.139) | 53.1 |
| Example 19 | 3.44 | 6.80 | (0.135, 0.122) | 50.8 |
| Example 20 | 3.43 | 6.87 | (0.134, 0.121) | 54.2 |
| Example 21 | 3.42 | 6.90 | (0.136, 0.123) | 55.9 |
| Example 22 | 3.40 | 7.12 | (0.136, 0.120) | 58.6 |
| Example 23 | 3.41 | 7.18 | (0.133, 0.121) | 60.1 |
| Example 24 | 3.38 | 7.11 | (0.134, 0.122) | 57.8 |
| Example 25 | 3.39 | 7.05 | (0.136, 0.139) | 59.1 |
| Example 26 | 3.35 | 7.08 | (0.134, 0.139) | 58.4 |
| Example 27 | 3.37 | 7.11 | (0.135, 0.122) | 58.9 |
| Example 28 | 3.35 | 7.12 | (0.135, 0.122) | 59.8 |
| Comparative Example 1 | 4.35 | 5.05 | (0.136, 0.139) | 20.2 |

TABLE 3-continued

| Experimental Examples 20 mA/cm2 | Voltage (V) (@20 mA/cm$^2$) | Cd/A (@20 mA/cm$^2$) | Color coordinate (x, y) | Service life (T95, h) (@20 mA/cm$^2$) |
|---|---|---|---|---|
| Comparative Example 2 | 4.05 | 5.23 | (0.135, 0.122) | 18.5 |
| Comparative Example 3 | 4.23 | 5.13 | (0.135, 0.122) | 22.1 |
| Comparative Example 4 | 4.33 | 5.08 | (0.135, 0.122) | 23.5 |
| Comparative Example 5 | 4.29 | 5.52 | (0.135, 0.122) | 20.4 |
| Comparative Example 6 | 4.21 | 5.12 | (0.135, 0.122) | 21.5 |
| Comparative Example 7 | 4.08 | 5.23 | (0.135, 0.122) | 24.5 |
| Comparative Example 8 | 4.11 | 5.11 | (0.134, 0.122) | 25.1 |
| Comparative Example 9 | 4.20 | 5.20 | (0.136, 0.139) | 27.2 |
| Comparative Example 10 | 4.01 | 5.55 | (0.134, 0.139) | 20.1 |
| Comparative Example 11 | 4.05 | 5.23 | (0.135, 0.122) | 24.5 |
| Comparative Example 12 | 4.23 | 5.33 | (0.135, 0.122) | 24.3 |
| Comparative Example 13 | 4.03 | 5.57 | (0.136, 0.139) | 21.0 |
| Comparative Example 14 | 4.28 | 5.67 | (0.135, 0.122) | 25.1 |
| Comparative Example 15 | 4.35 | 5.71 | (0.135, 0.122) | 24.2 |
| Comparative Example 16 | 4.23 | 5.68 | (0.135, 0.122) | 23.1 |

TABLE 3-continued

| Experimental Examples 20 mA/cm2 | Voltage (V) (@20 mA/cm$^2$) | Cd/A (@20 mA/cm$^2$) | Color coordinate (x, y) | Service life (T95, h) (@20 mA/cm$^2$) |
|---|---|---|---|---|
| Comparative Example 17 | 4.10 | 5.58 | (0.135, 0.122) | 21.3 |
| Comparative Example 18 | 4.38 | 4.48 | (0.135, 0.122) | 18.3 |
| Comparative Example 19 | 4.32 | 4.42 | (0.135, 0.122) | 24.5 |
| Comparative Example 20 | 4.05 | 4.88 | (0.135, 0.122) | 20.4 |

An organic light emitting device in which one or more compounds (a total of three or more) each composed of sp3 carbon as a center according to the present invention are combined in a hole transport region, an electron transport region, and a light emitting layer exhibits excellent device performances as compared to the Comparative Examples. The introduction of the compound composed of sp3 carbon as a center, into the hole transport region and the electron transport region allows the device to have relatively fast carrier transport and delivery characteristics of holes and electrons, and carriers, injected from the positive electrode and negative electrode sides, to make a balance in the light emitting layer. Further, the injection and movement of carriers into the light emitting layer, energy transfer, and the like exhibit effective light emission through application of the compound composed of sp3 carbon as a center to the light emitting region.

Examples 1 to 14 are examples in which one compound composed of sp3 carbon as a center is introduced into the hole transport region, the electron transport region, and the light emitting layer. The hole transport region is composed of one or more hole transport layers and one or more electron blocking layers, the electron transport region is composed of one or more hole blocking layers and an electron transport layer, and the results of the devices according to the case where the aforementioned compound composed of sp3 carbon as a center was introduced into each layer are exemplified. The results of Examples 1 and 2 exhibit much better results as compared to Comparative Examples 2, 3, and 5 in which the compound composed of sp3 carbon as a center was used in only one region, and the result of Example 3 exhibits excellent efficiency and service life results because the introduction into the hole transport layer and the electron transport layer in each region effectively adjusts the balance of carriers. Further, it can be seen that when Comparative Example 5 is observed as compared to Comparative Example 1, the application of the compound composed of sp3 carbon as a center to the dopant significantly affects the overall efficiency of the device, and it was confirmed that in Examples 1 to 14, the results of applying the compound composed of sp3 carbon as a center to the hole and electron transport regions were excellent as compared to Comparative Example 4 in which the compound composed of sp3 carbon as a center was applied only to the hole blocking layer. Furthermore, the results when one compound composed of sp3 carbon as a center is applied to a blocking layer responsible for regulating carriers in each of the hole and electron transport regions or when one is applied to a transport layer affecting the overall transport of carriers, and when one is applied to a blocking layer, and one is applied to a transport layer can be observed, and the results of the device applied to a layer used as the same role in order to improve the device performance through the overall balance of carriers was better. In particular, the case where one is applied to a blocking layer and the case where one is applied to a transport layer exhibit a difference as a whole in terms of service life and efficiency, respectively.

Examples 15 to 21 are the cases where each one is applied to a hole transport region, an electron transport region, and a light emitting layer and a total of four are applied to an organic electroluminescent device, and Examples 22 to 28 are the cases where five are applied, and thus the compound composed of sp3 carbon as a center is applied to both the hole transport region and the electron transport region. It can be observed that the overall introduction of the compound into the total organic electroluminescent device becomes a result to elicit a light emission optimal point in a light emitting region.

Comparative Examples 18 to 20 are results shown by applying a pyrene derivative instead of an anthracene derivative as a light emitting host of the present blue organic electroluminescent device, and it was confirmed that particularly in terms of efficiency, the application of an anthracene derivative as a host could maximize the improvement in injection and transport of carriers in the hole and electron transport regions.

The invention claimed is:

1. An organic light emitting device comprising:

an anode;

a cathode provided to face the anode; and an organic material layer comprising a light emitting layer provided between the anode and the cathode, wherein the light emitting layer, one or more layers of the organic material layer provided between the anode and the light emitting layer, and one or more layers of the organic material layer provided between the cathode and the light emitting layer each comprise one or more compounds each composed of sp3 carbon as a center, the light emitting layer comprises a host comprising one or more anthracene-based compounds, and among organic materials included in the organic material layer, a band gap energy ($E_{bg}$) of each of the organic materials except for a dopant compound is 3 eV or more.

2. The organic light emitting device of claim 1, wherein the light emitting layer, one or more layers of the organic material layer provided between the anode and the light emitting layer, and one or more layers of the organic material layer provided between the cathode and the light emitting layer each comprises one to three compounds each composed of sp3 carbon as a center.

3. The organic light emitting device of claim 1, wherein one or more layers of the organic material layer provided between the anode and the light emitting layer each comprises one or more compounds each composed of sp3 carbon as a center and comprising a substituted or unsubstituted amine group, and one or more layers of the organic material layer provided between the cathode and the light emitting layer each comprises one or more compounds each composed of sp3 carbon as a center and comprising a substituted or unsubstituted nitrogen-containing aromatic 5-membered ring, a substituted or unsubstituted nitrogen-containing aromatic 6-membered ring, or a substituted or unsubstituted nitrogen-containing aromatic polycyclic ring.

4. The organic light emitting device of claim 1, wherein the organic material layer comprising one or more compounds each composed of sp3 carbon as a center and provided between the anode and the light emitting layer; and the organic material layer comprising one or more compounds each composed of sp3 carbon as a center and provided between the cathode and the light emitting layer are provided so as to be in contact with the light emitting layer.

5. The organic light emitting device of claim 1, wherein the organic light emitting device has a maximum emission peak at a wavelength of 400 nm to 470 nm.

6. The organic light emitting device of claim 1, wherein the compound composed of sp3 carbon as a center is Formula 1:

Formula 1

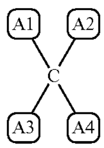

wherein in Formula 1;

C is an sp3 carbon; and

A1 to A4 are the same as or different from each other, and are each independently a substituted or unsubstituted alkyl group, a substituted or unsubstituted cycloalkyl group, a substituted or unsubstituted aryl group, or a substituted or unsubstituted heterocyclic group, or adjacent groups are bonded to each other to form a substituted or unsubstituted ring.

7. The organic light emitting device of claim 6, wherein Formula 1 is any one of the following Formulae 2 to 7:

Formula 2

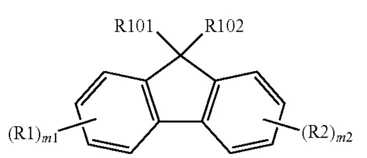

Formula 3

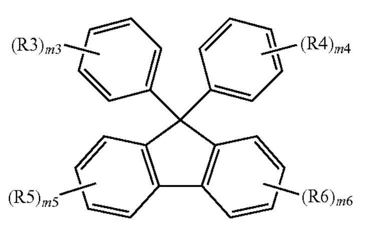

Formula 4

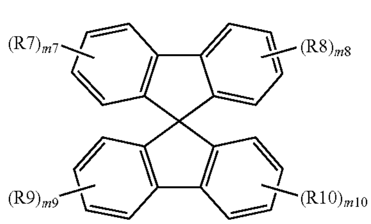

-continued

Formula 5

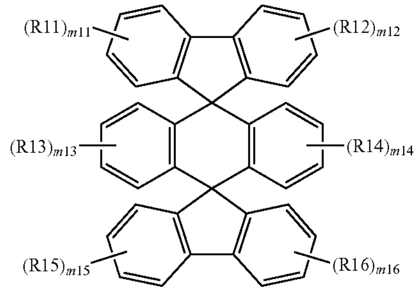

Formula 6

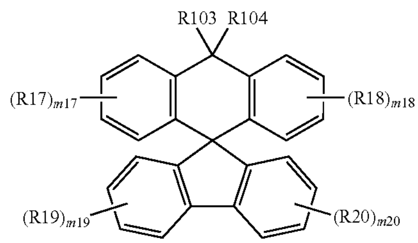

Formula 7

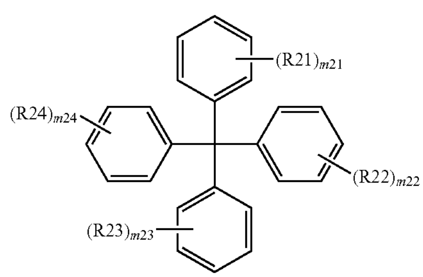

wherein in Formulae 2 to 7:

R101 to R104 are the same as or different from each other, and are each independently hydrogen, a substituted or unsubstituted alkyl group, or a substituted or unsubstituted aryl group, or are bonded to each other to form an aliphatic hydrocarbon ring;

R1 to R24 are the same as or different from each other, and are each independently hydrogen, deuterium, a halogen group, a cyano group, a nitro group, a hydroxyl group, a substituted or unsubstituted silyl group, a substituted or unsubstituted boron group, a substituted or unsubstituted alkyl group, a substituted or unsubstituted alkoxy group, a substituted or unsubstituted aryloxy group, a substituted or unsubstituted phosphine oxide group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted alkynyl group, a substituted or unsubstituted cycloalkyl group, a substituted or unsubstituted amine group, a substituted or unsubstituted aryl group, or a substituted or unsubstituted heterocyclic group, or adjacent groups are bonded to each other to form a substituted or unsubstituted ring;

m1, m2, and m5 to m20 are each an integer from 0 to 4;

m3, m4, and m21 to m24 are each an integer from 0 to 5; and when m1 to m24 are each 2 or higher, two or more substituents in the parenthesis are the same as or different from each other.

8. The organic light emitting device of claim 6, wherein Formula 1 is any one of the following Formulae 8 to 13:

[Formula 8]

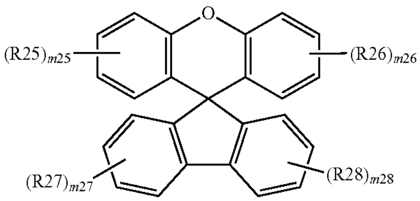

[Formula 9]

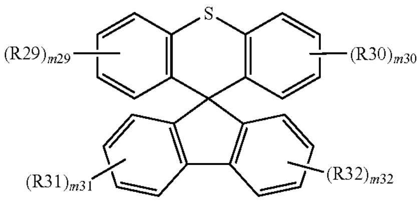

[Formula 10]

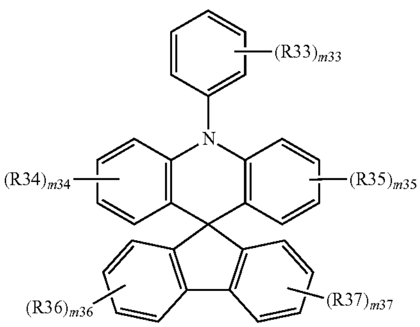

[Formula 11]

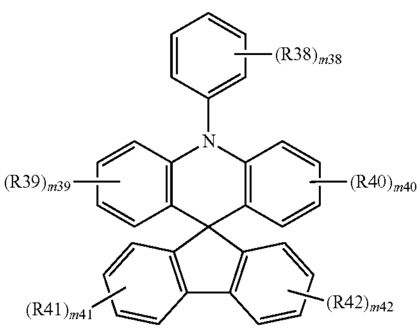

[Formula 12]

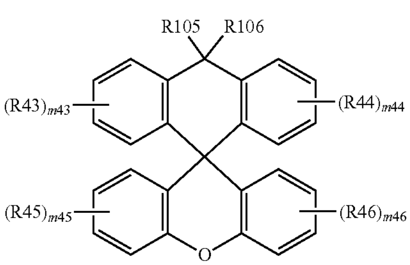

-continued

[Formula 13]

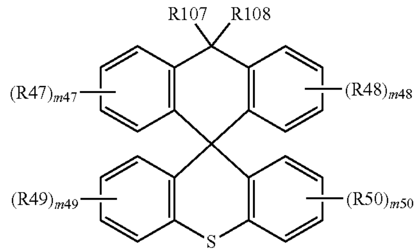

wherein in Formulae 8 to 13:

R105 to R108 are the same as or different from each other, and are each independently hydrogen, a substituted or unsubstituted alkyl group, or a substituted or unsubstituted aryl group;

R25 to R50 are the same as or different from each other, and are each independently hydrogen, deuterium, a halogen group, a cyano group, a nitro group, a hydroxyl group, a substituted or unsubstituted silyl group, a substituted or unsubstituted boron group, a substituted or unsubstituted alkyl group, a substituted or unsubstituted alkoxy group, a substituted or unsubstituted aryloxy group, a substituted or unsubstituted phosphine oxide group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted alkynyl group, a substituted or unsubstituted cycloalkyl group, a substituted or unsubstituted amine group, a substituted or unsubstituted aryl group, or a substituted or unsubstituted heterocyclic group, or adjacent groups are bonded to each other to form a substituted or unsubstituted ring;

m25 to m32, m34 to m39, and m41 to m50 are each an integer from 0 to 4;

m33 is an integer from 0 to 5;

m40 is an integer from 0 to 3; and when m25 to m50 are each an integer of 2 or higher, two or more substituents in the parenthesis are the same as or different from each other.

9. The organic light emitting device of claim 1, wherein the light emitting layer further comprises a dopant, and the compound composed of sp3 carbon as a center included in the light emitting layer is a dopant.

10. The organic light emitting device of claim 1, wherein the host comprises two or more compounds.

11. The organic light emitting device of claim 1, wherein the light emitting layer further comprises a fluorescent dopant, and the fluorescent dopant comprises a non-pyrene-based compound.

12. The organic light emitting device of claim 11, wherein the non-pyrene-based compound is a compound composed of sp3 carbon as a center mainly sp3 carbon, comprising two or more substituted or unsubstituted amine groups.

13. The organic light emitting device of claim 11, wherein the non-pyrene-based compound is a boron-based compound.

* * * * *